US006727544B2

(12) United States Patent

Endoh et al.

(10) Patent No.: US 6,727,544 B2

(45) Date of Patent: Apr. 27, 2004

(54) SEMICONDUCTOR MEMORY INCLUDING CELL(S) WITH BOTH CHARGE STORAGE LAYER(S) AND CONTROL GATE LATERALLY SURROUNDING ISLAND-LIKE SEMICONDUCTOR LAYER

(75) Inventors: Tetsuo Endoh, Natori (JP); Fujio Masuoka, Sendai (JP); Takuji Tanigami, Fukuyama (JP); Takashi Yokoyama, Sendai (JP); Noboru Takeuchi, Sendai (JP)

(73) Assignees: Fujio Masuoka, Miyagi (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/107,380

(22) Filed: Mar. 28, 2002

(65) Prior Publication Data

US 2002/0154556 A1 Oct. 24, 2002

(30) Foreign Application Priority Data

| | | |
|---|---|---|
| Mar. 30, 2001 | (JP) | 2001-142454 |
| Jun. 23, 2001 | (JP) | 2001-264927 |
| Jun. 23, 2001 | (JP) | 2001-264928 |
| Jun. 23, 2001 | (JP) | 2001-266490 |
| Jun. 23, 2001 | (JP) | 2001-266491 |

(51) Int. Cl.[7] .............................................. H01L 29/788

(52) U.S. Cl. ....................... 257/315; 257/296; 257/304; 257/305; 257/320; 257/321

(58) Field of Search ................................ 257/295–324, 257/325, 326; 438/3, 201, 211, 257, 260–266, 594

(56) References Cited

U.S. PATENT DOCUMENTS

| | | | | |
|---|---|---|---|---|
| 5,929,477 | A * | 7/1999 | McAllister Burns et al. | 257/306 |
| 6,107,670 | A | 8/2000 | Masuda | |
| 6,114,767 | A * | 9/2000 | Nagai et al. | 257/758 |
| 6,387,757 | B1 * | 5/2002 | Chu et al. | 438/266 |
| 6,433,382 | B1 * | 8/2002 | Orlowski et al. | 257/315 |
| 6,483,136 | B1 | 11/2002 | Yoshida et al. | |
| 6,501,125 | B2 | 12/2002 | Kobayashi | |
| 6,593,231 | B2 | 7/2003 | Endoh et al. | |
| 2002/0036308 | A1 | 3/2002 | Endoh et al. | |
| 2002/0195668 | A1 | 12/2002 | Endoh et al. | |
| 2002/0197868 | A1 | 12/2002 | Endoh et al. | |

FOREIGN PATENT DOCUMENTS

JP 2877462 B2 1/1999

* cited by examiner

*Primary Examiner*—David Nelms
*Assistant Examiner*—Long Tran
(74) *Attorney, Agent, or Firm*—Nixon & Vanderhye P.C.

(57) ABSTRACT

A semiconductor memory comprises: a substrate; and one or more memory cells constituted of at least one island-like semiconductor layer, a charge storage layer and a control gate, the charge storage layer and the control gate being formed to entirely or partially encircle a sidewall of the island-like semiconductor layer, wherein at least one of said one or more memory cells is electrically insulated from the semiconductor substrate and has an insulating film allowing an electric charge to pass at least in a part of a region between the charge storage layer and the island-like semiconductor layer.

32 Claims, 1632 Drawing Sheets

Fig. 1000
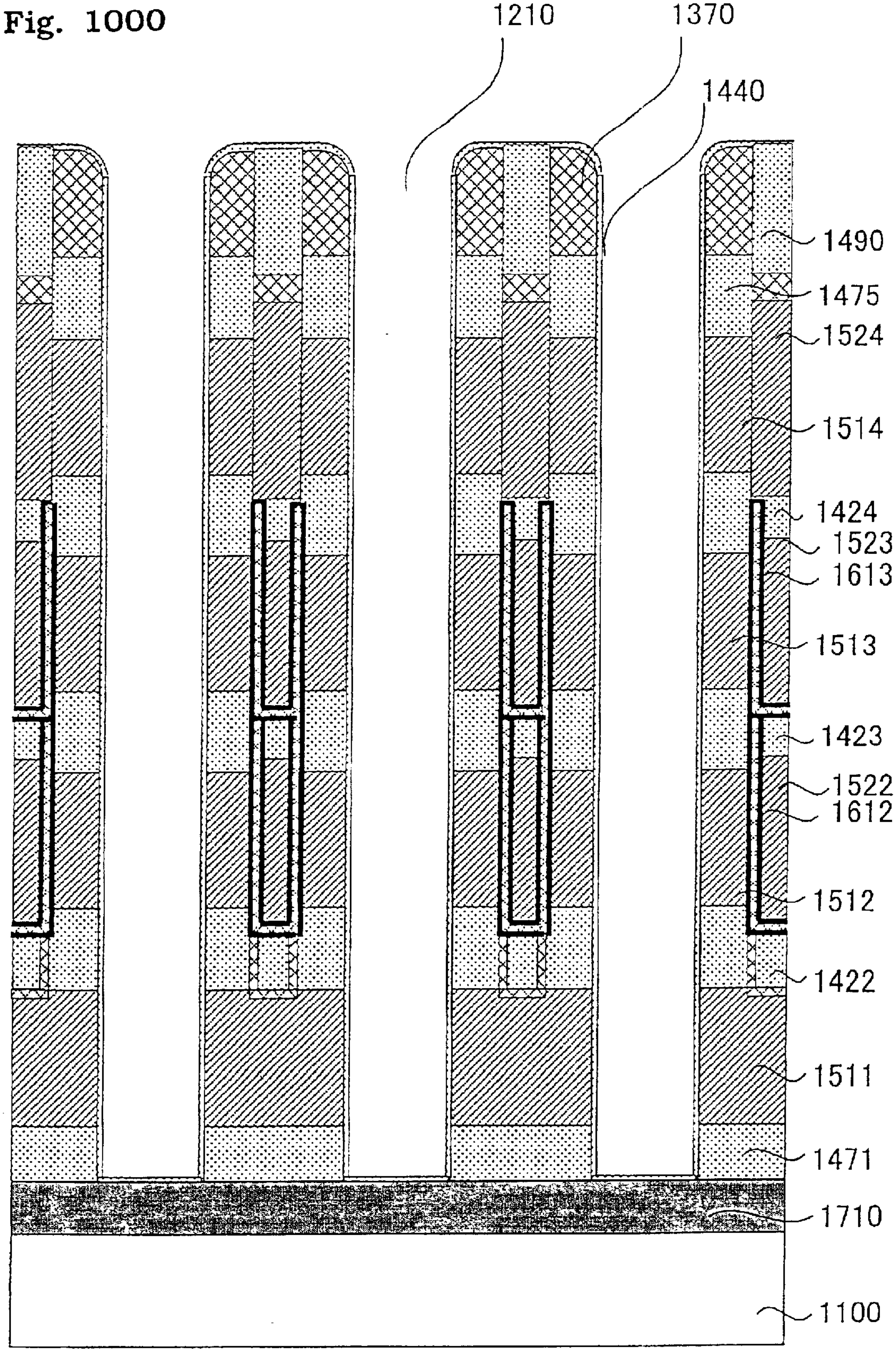

Fig. 1001
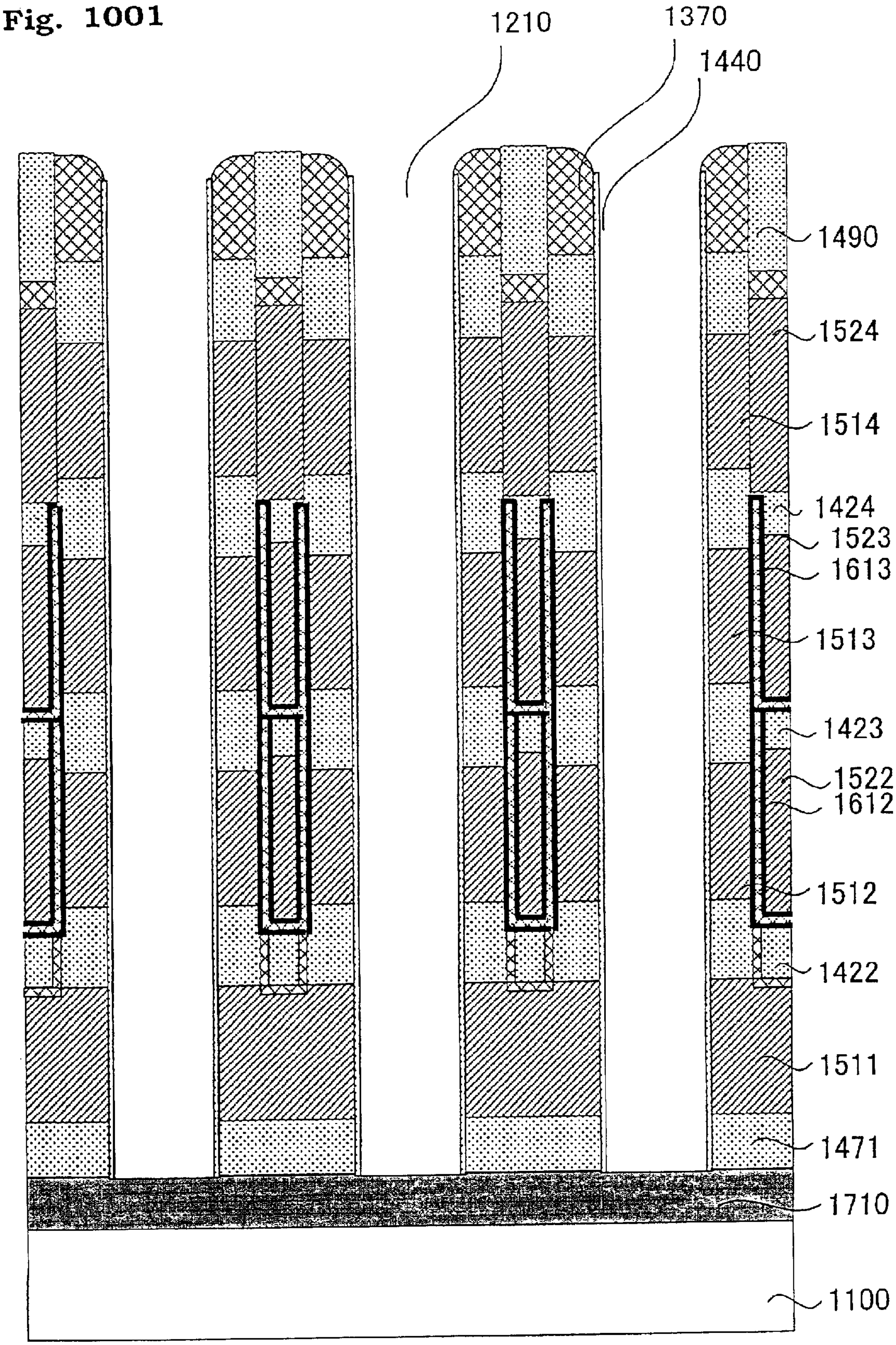

Fig. 1002
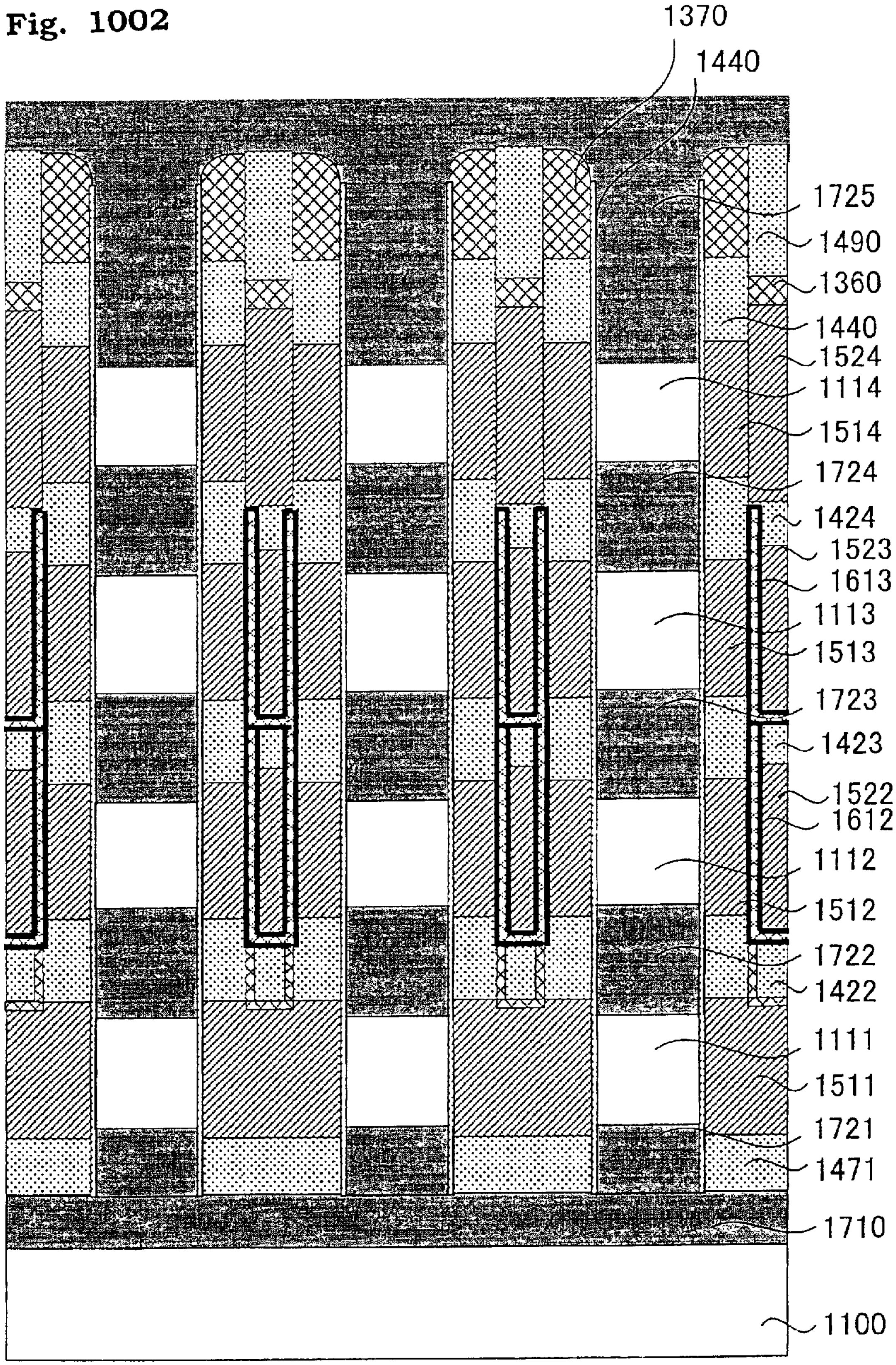

Fig. 1003
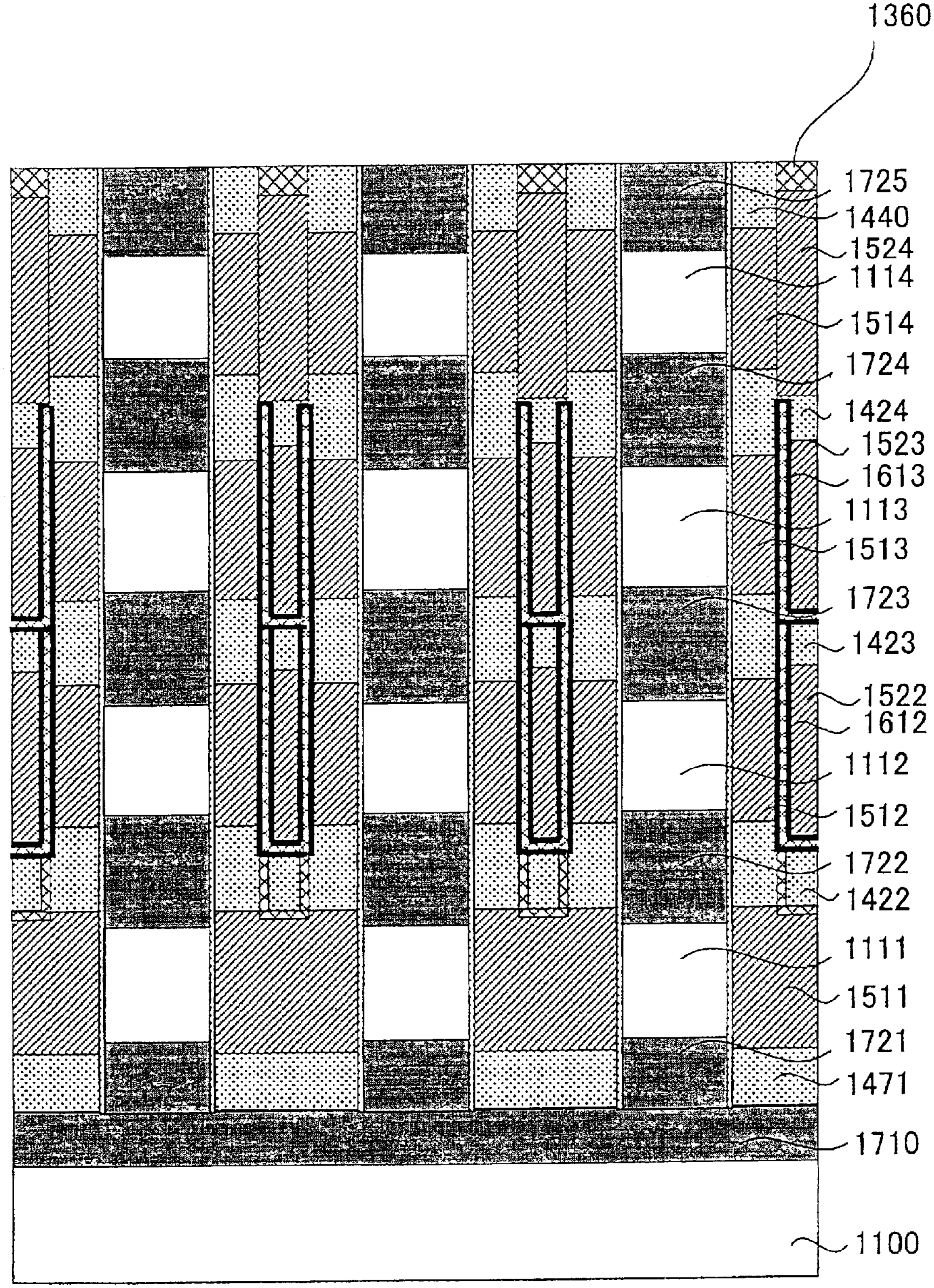

Fig. 1004
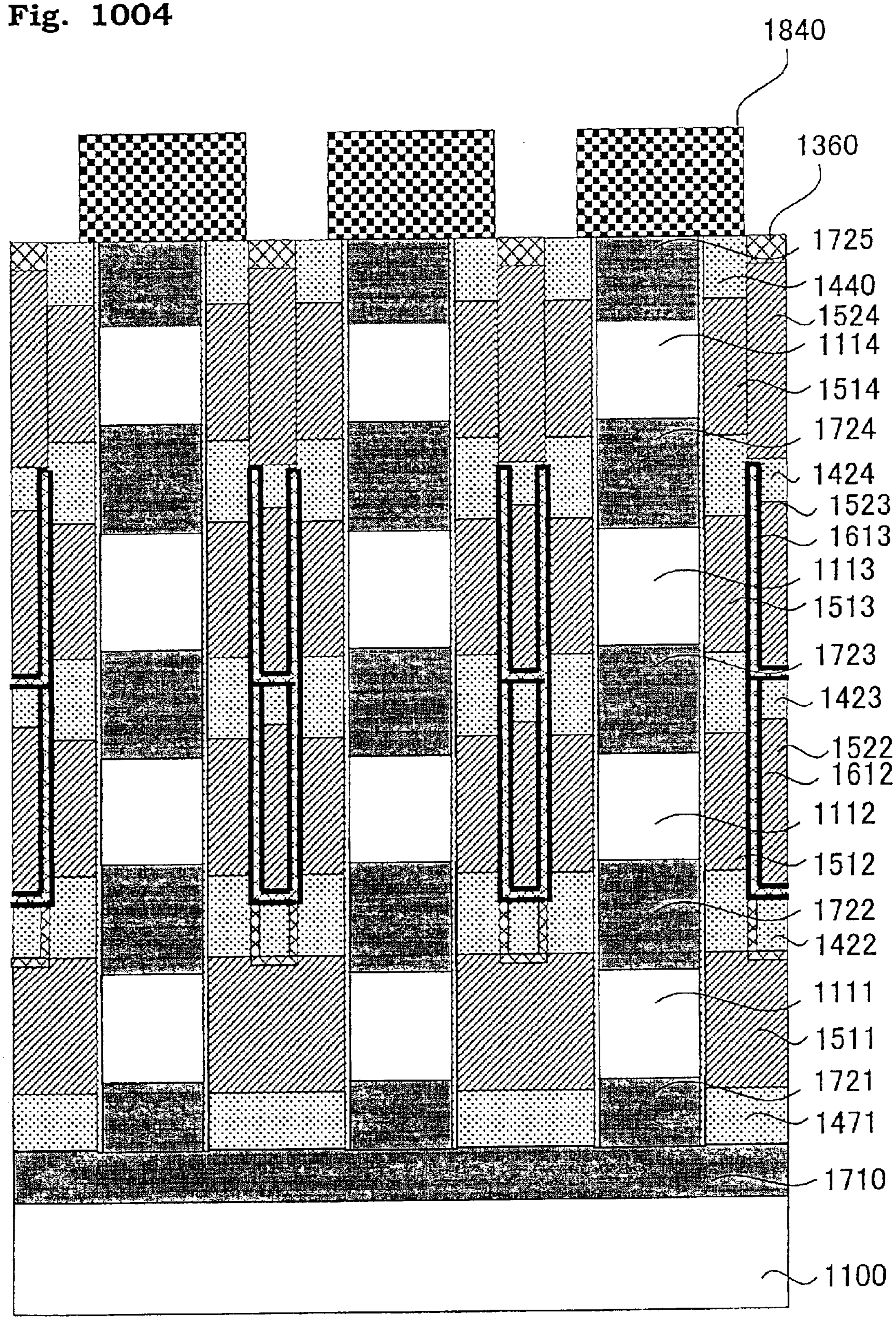

Fig. 1005
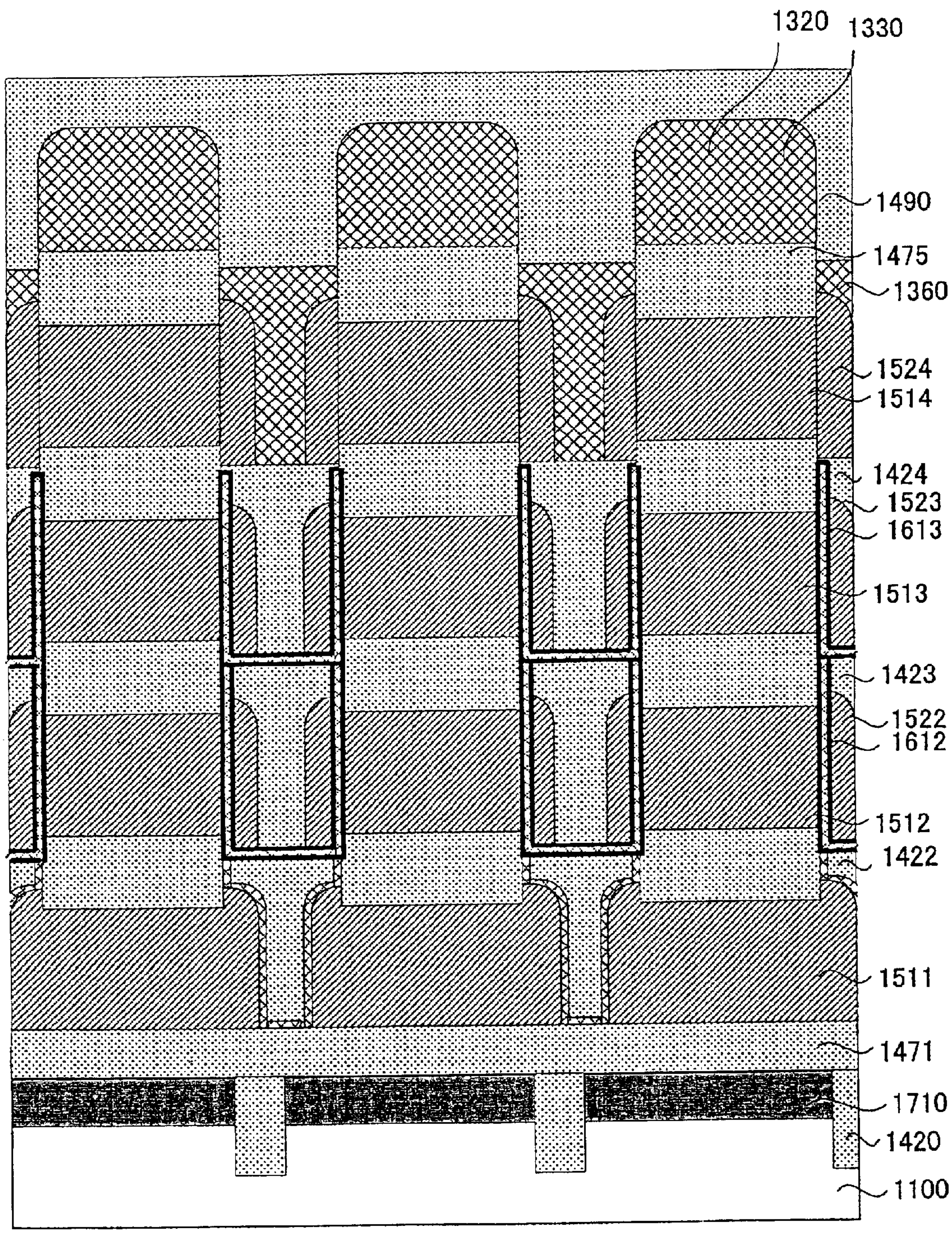

Fig. 1006
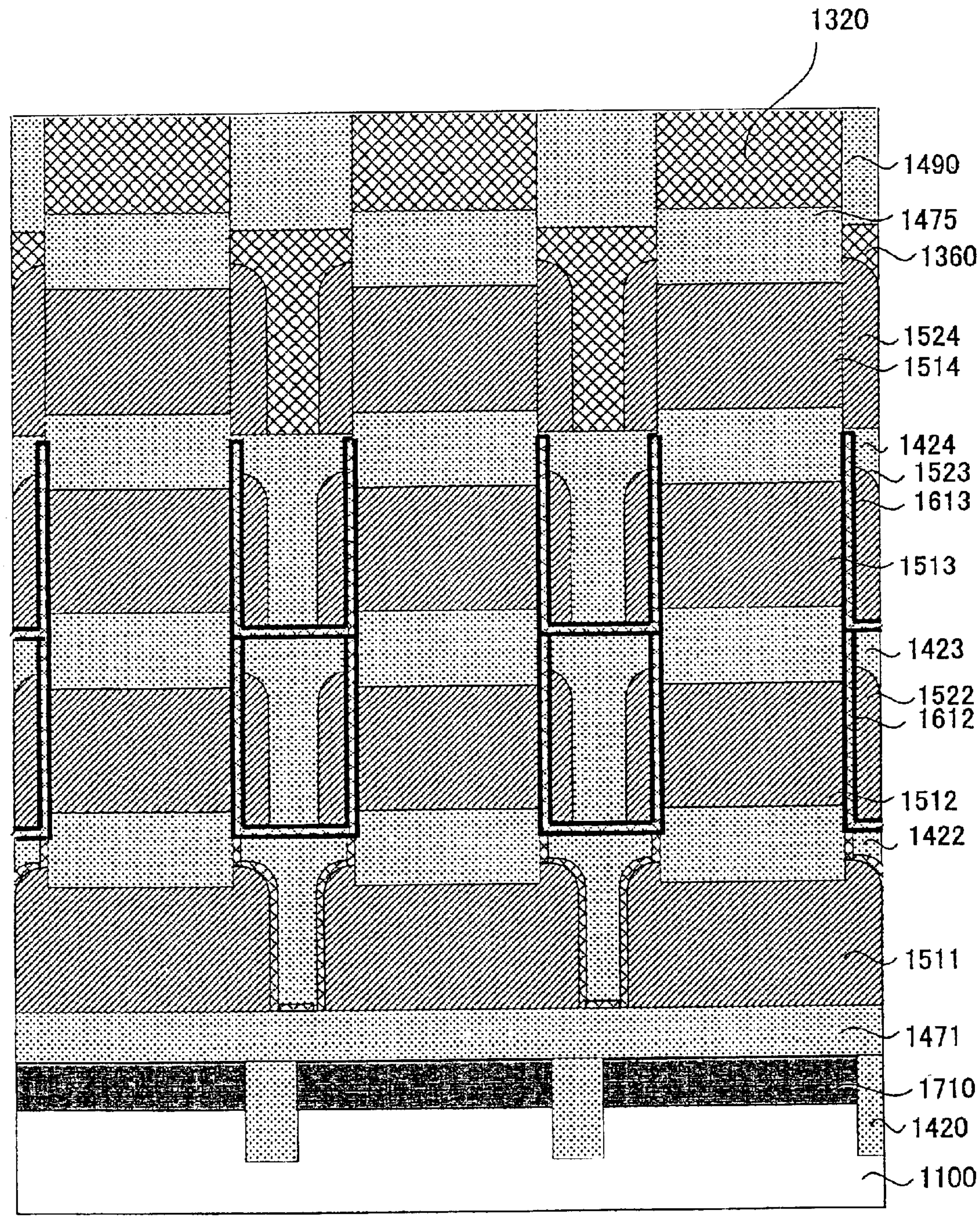

Fig. 1007
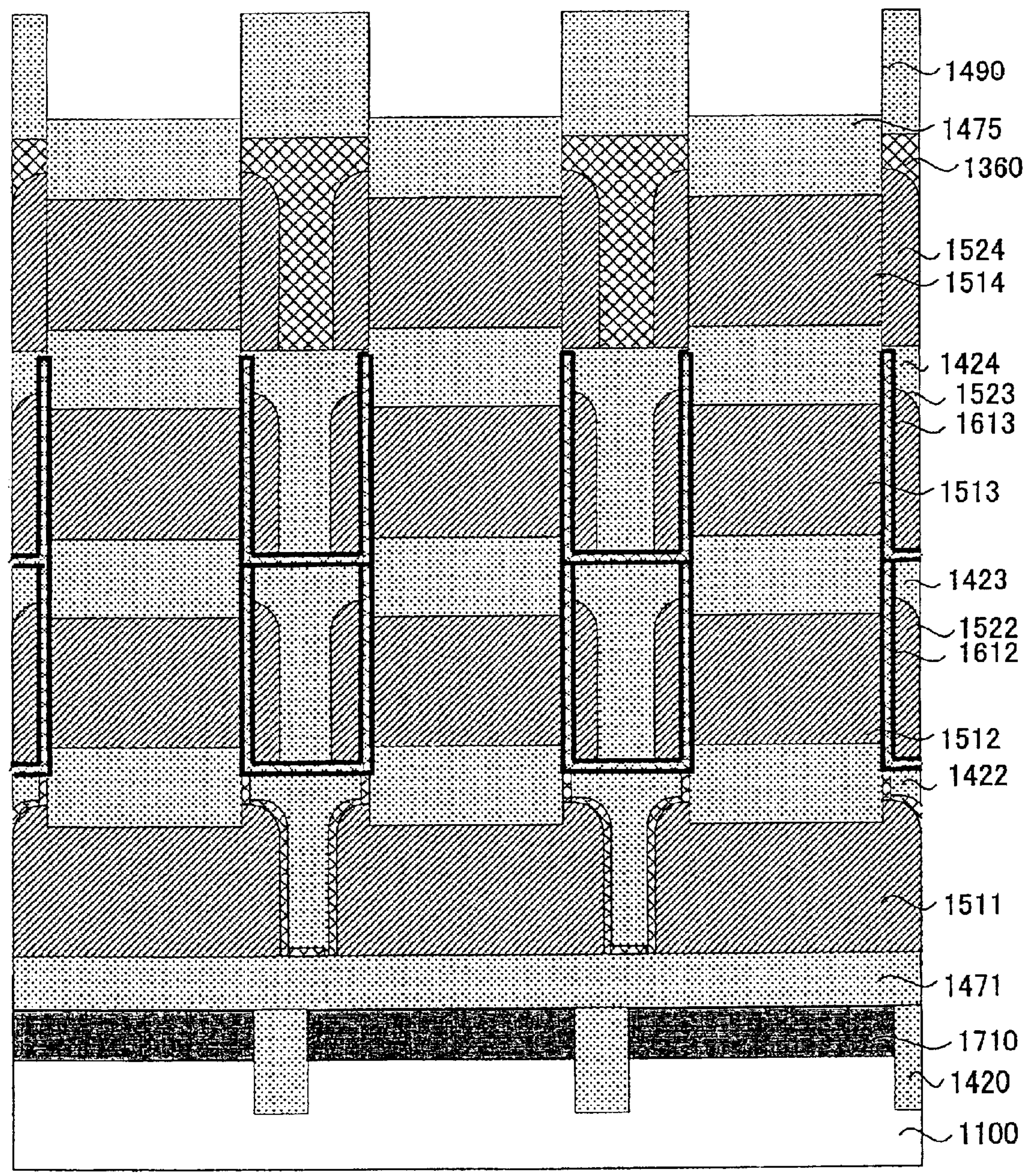

Fig. 1008
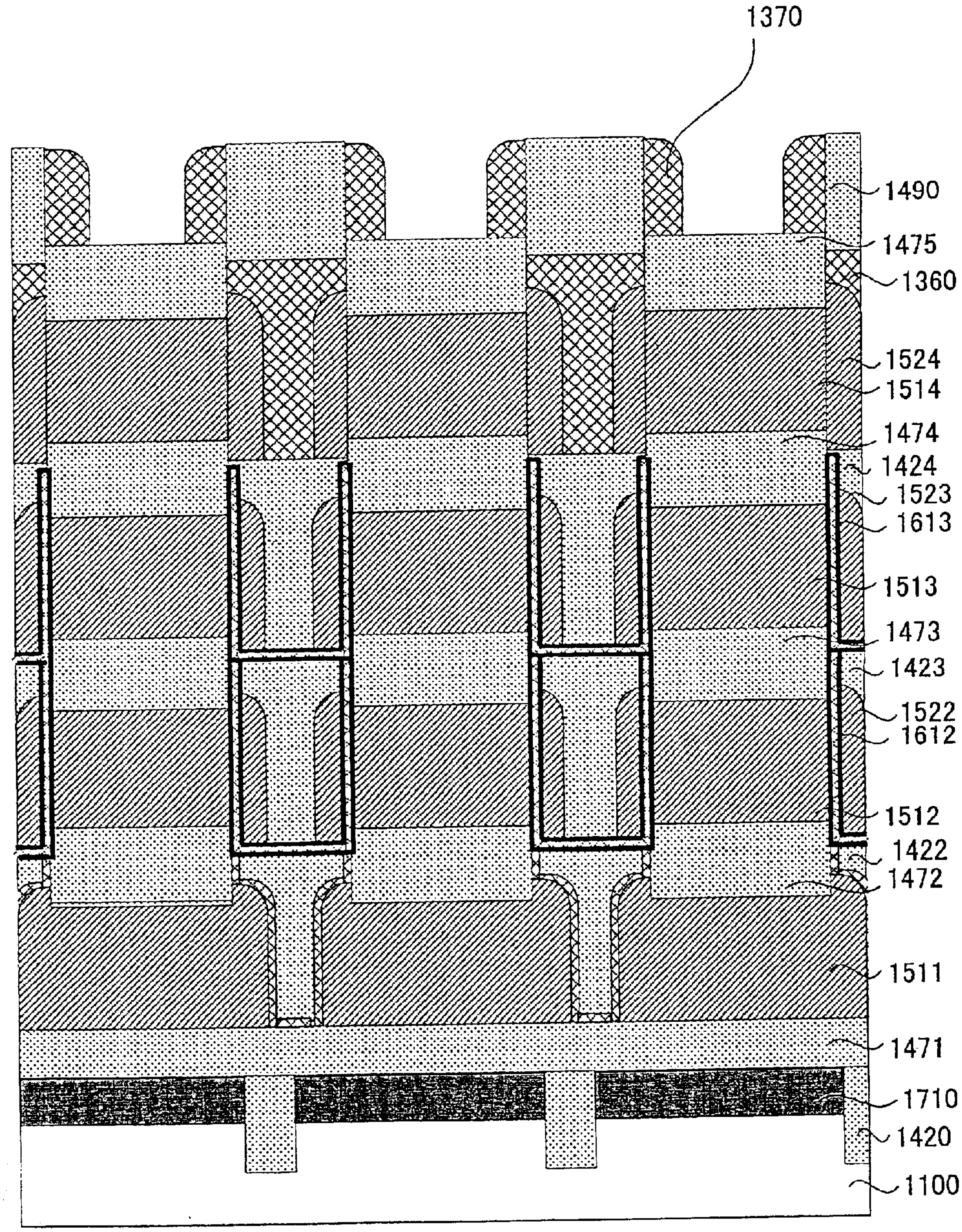

Fig. 1009
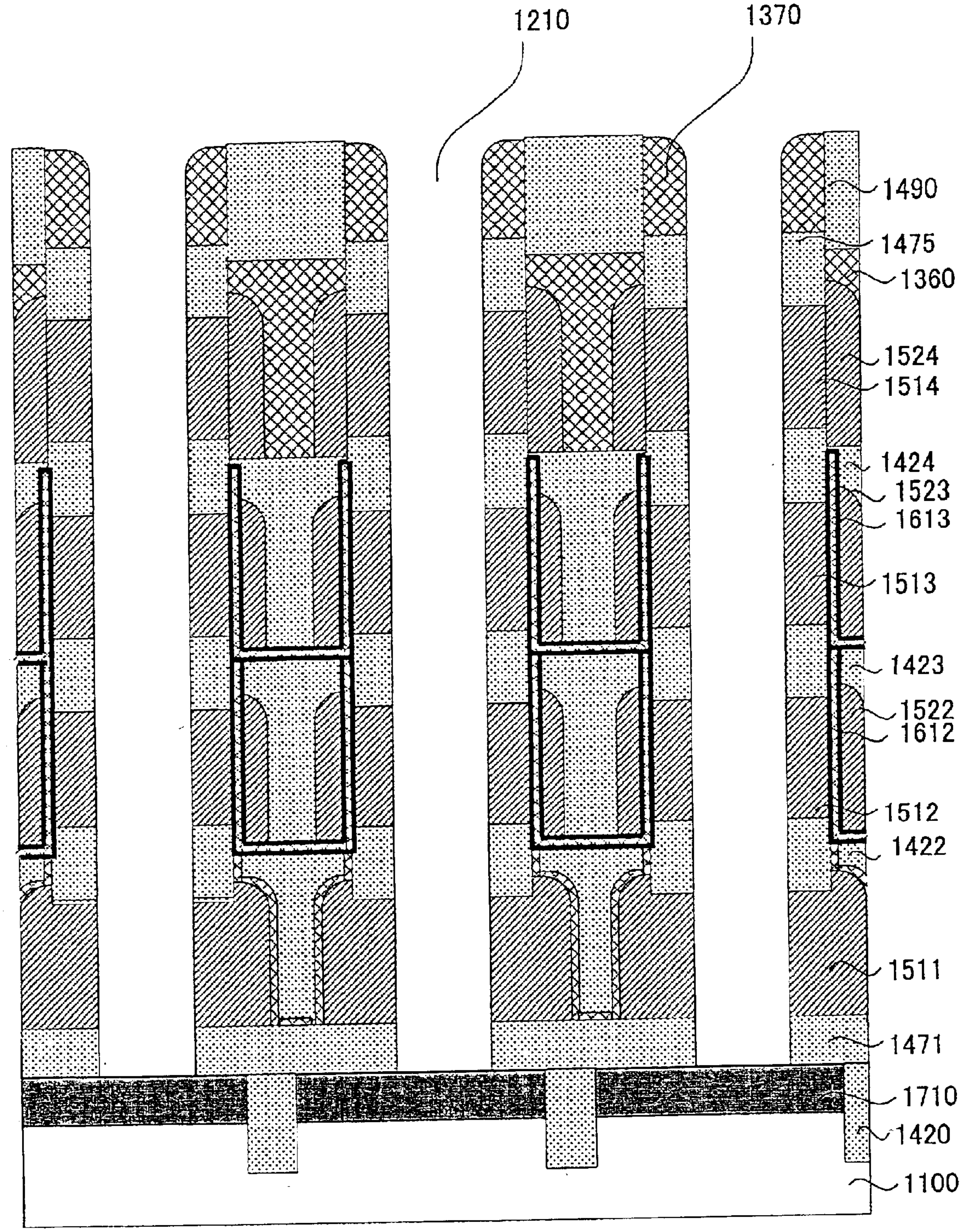

Fig. 1010
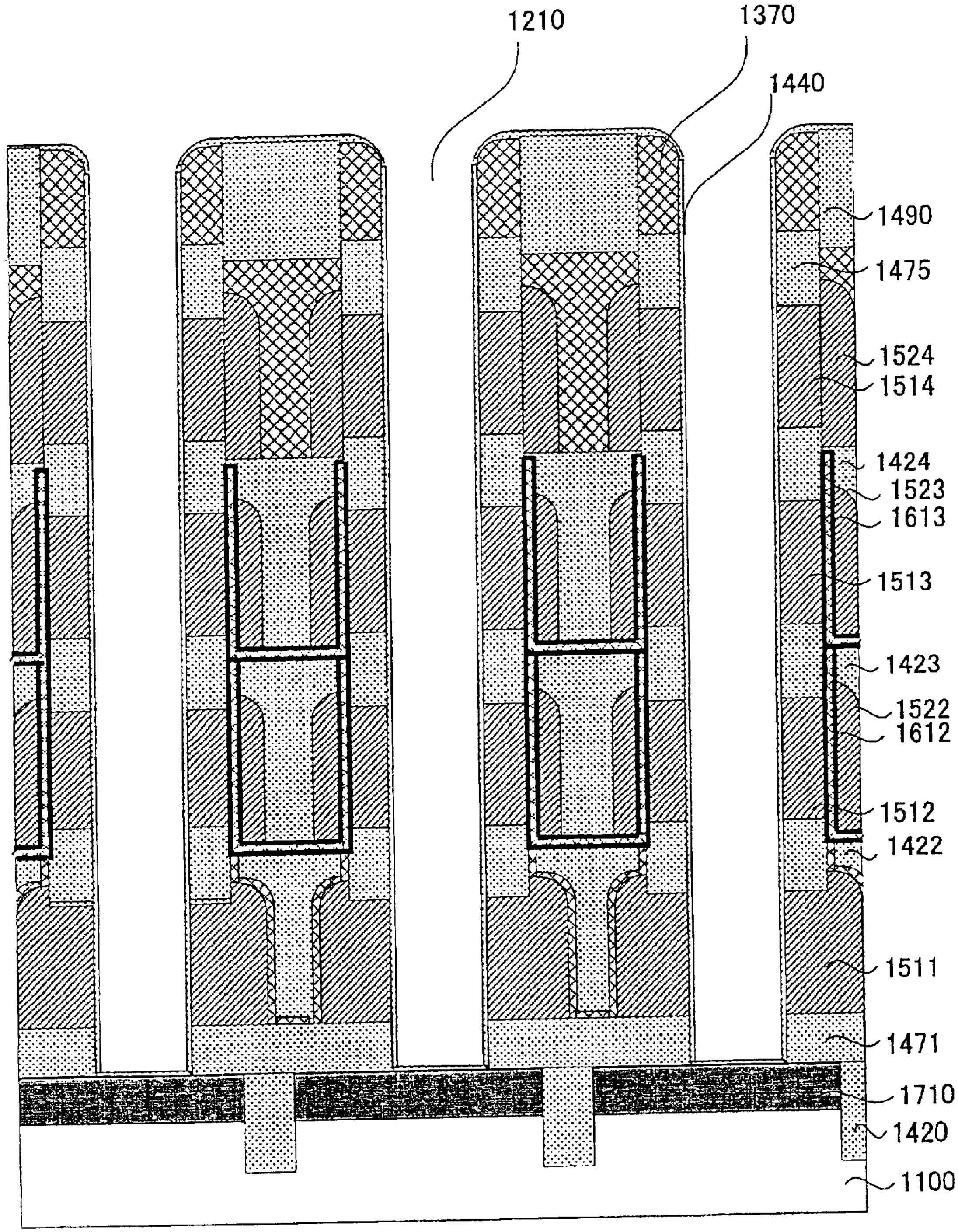

Fig. 1011
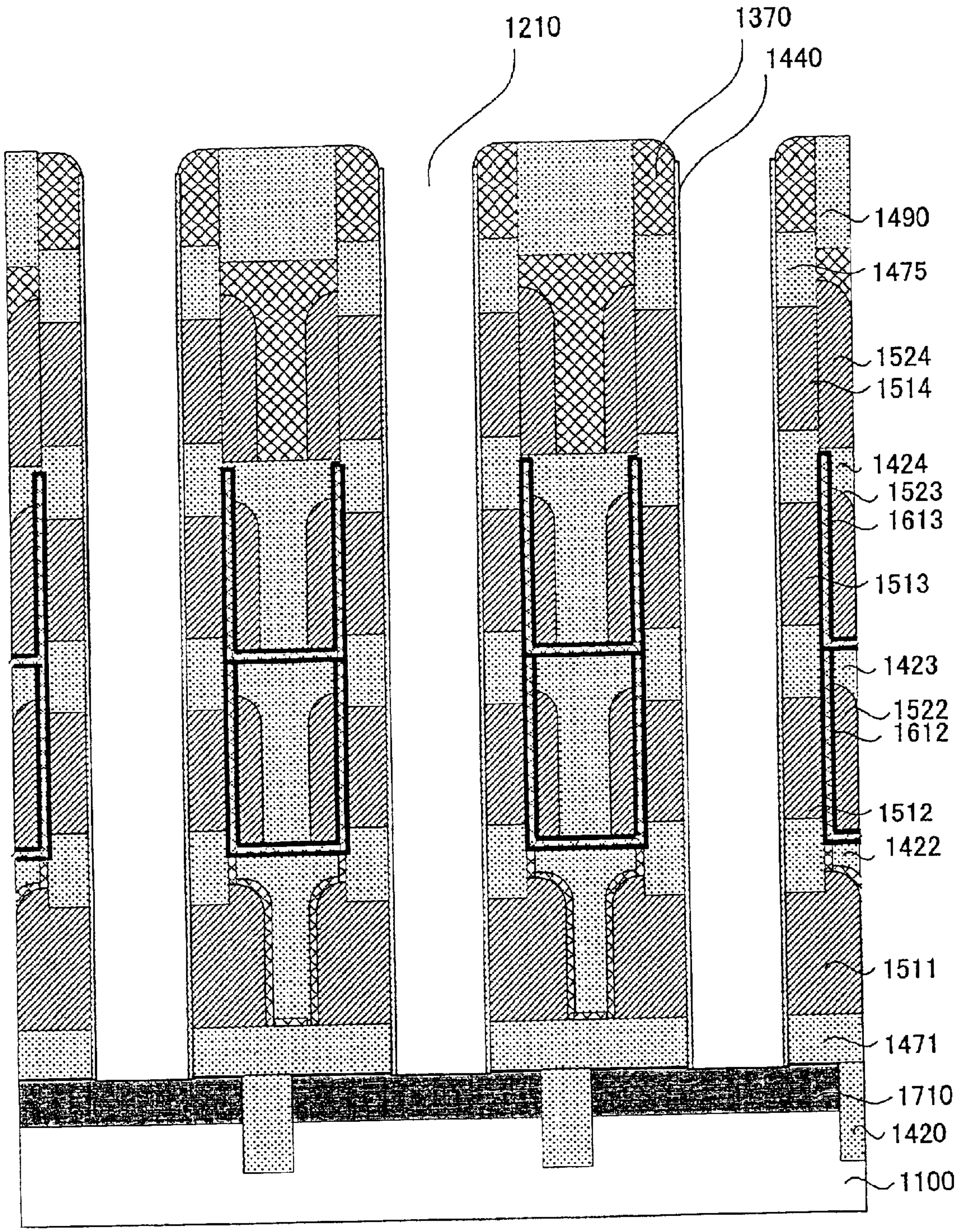

Fig. 1012
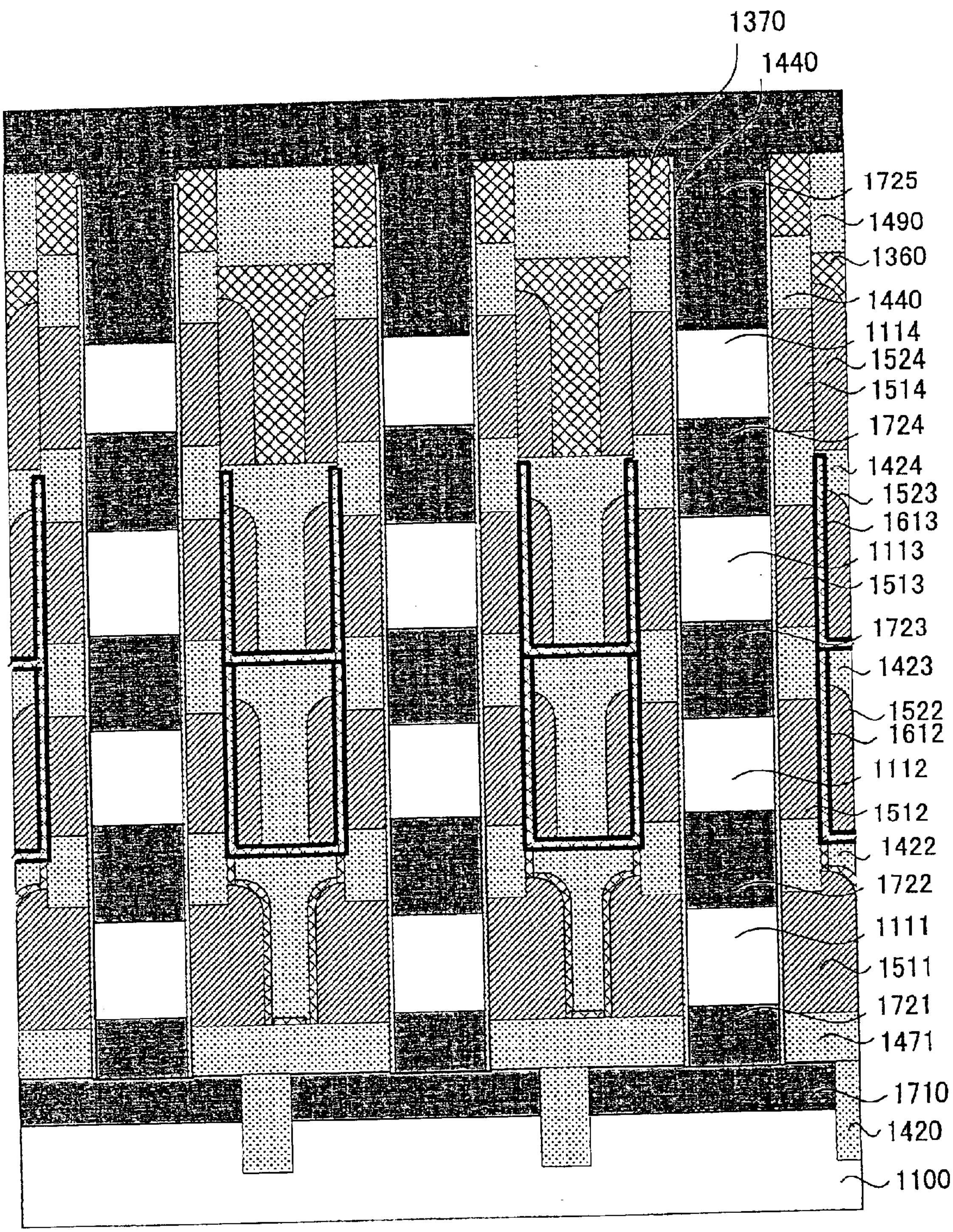

Fig. 1013
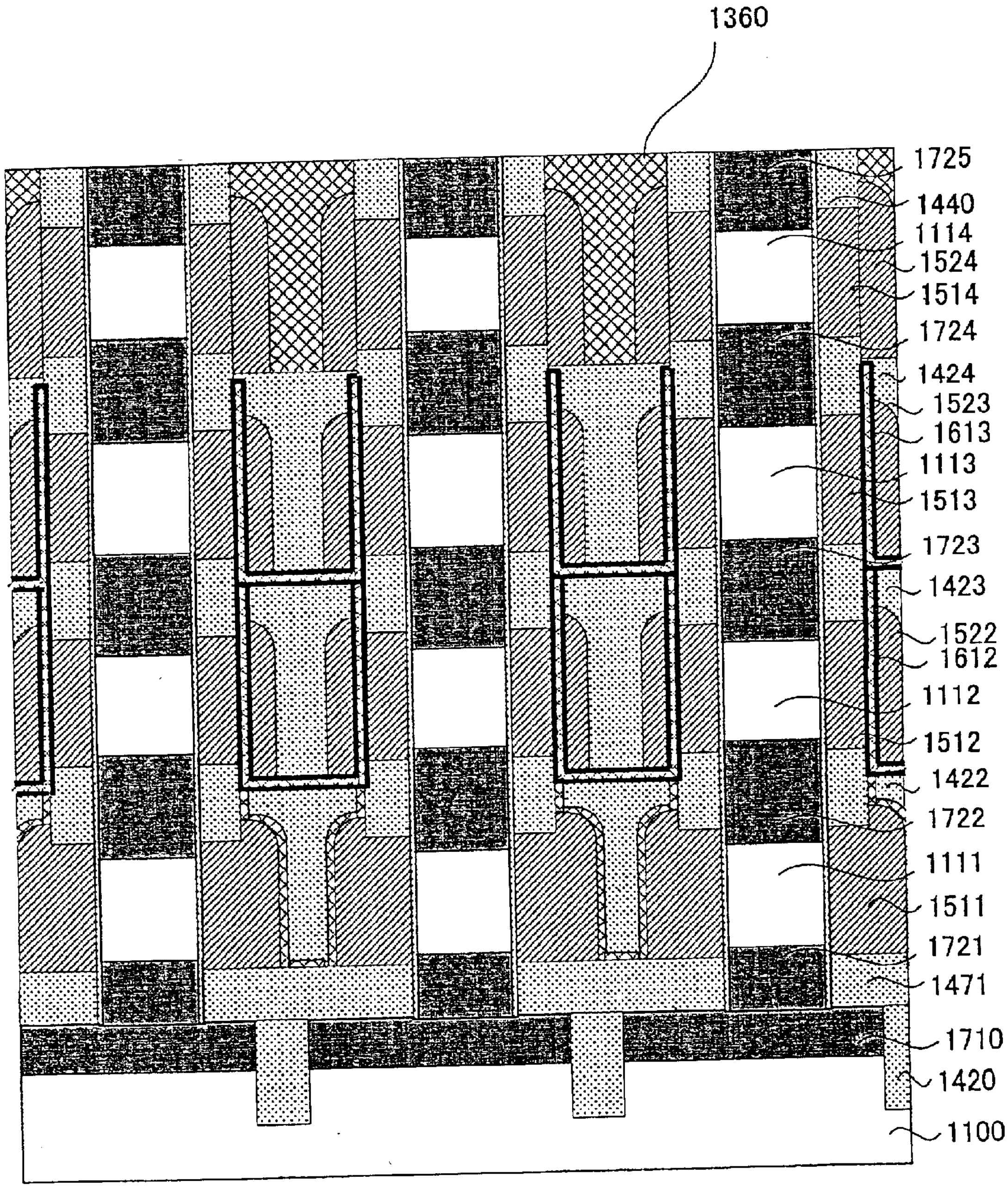

Fig. 1014
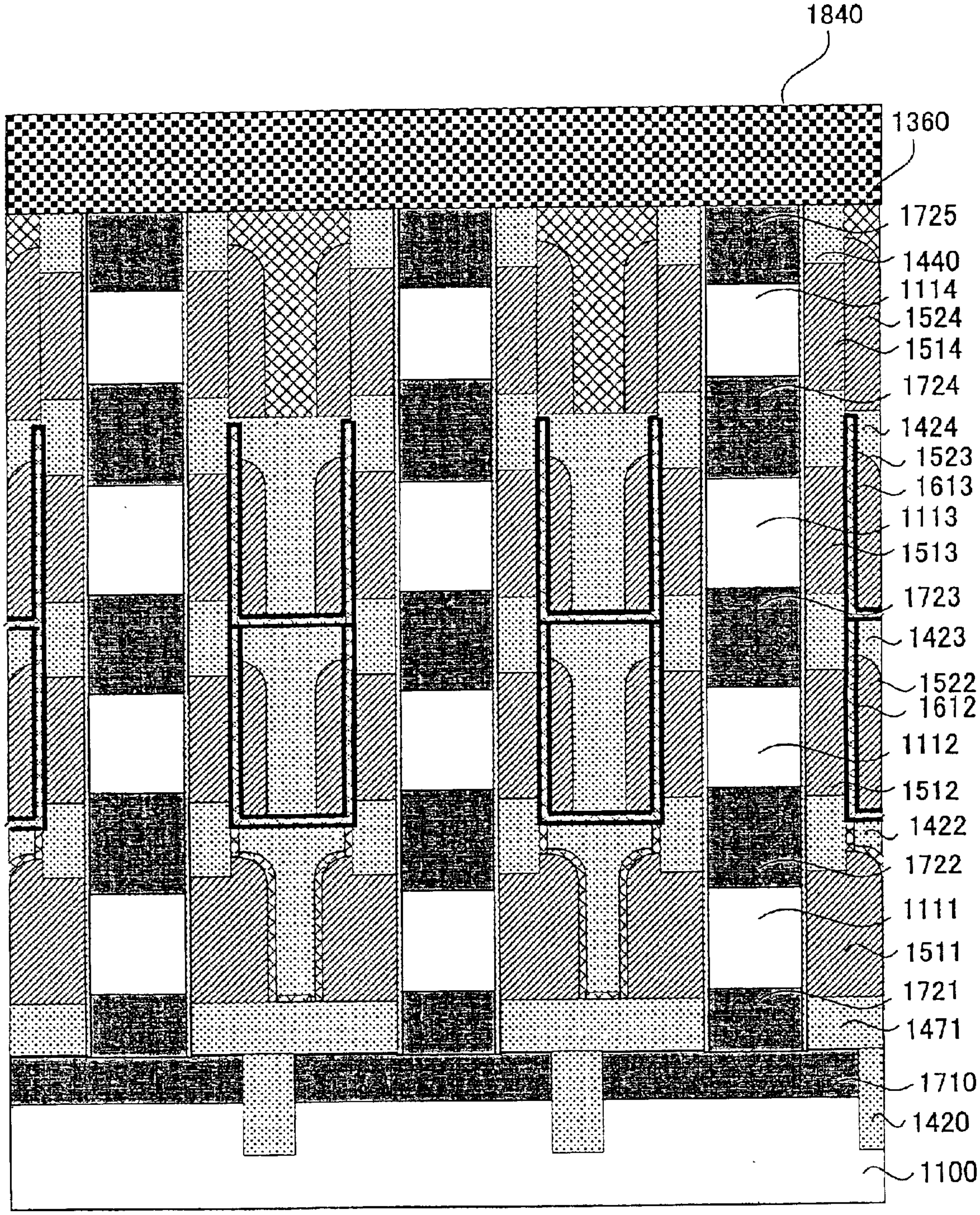

Fig. 1015
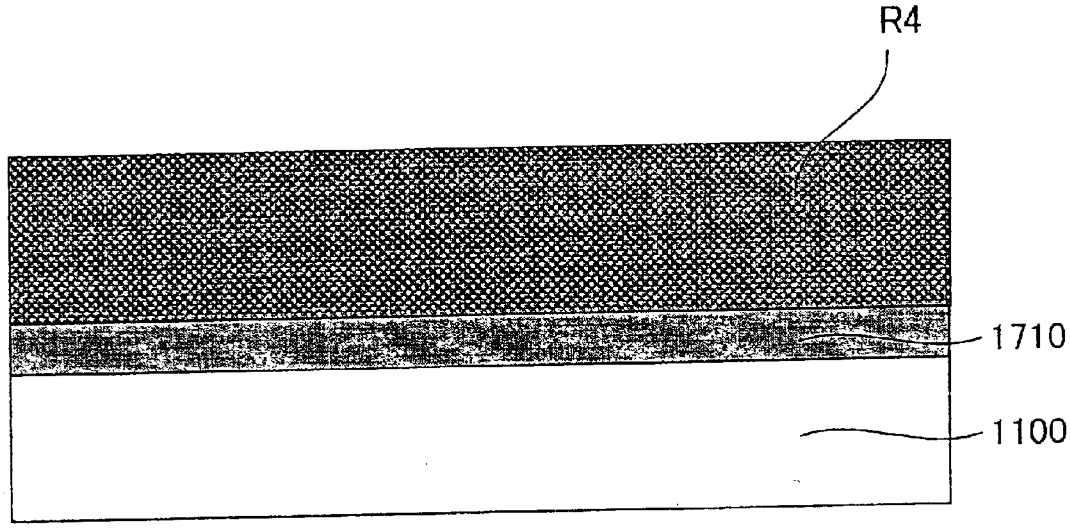
Fig. 1016
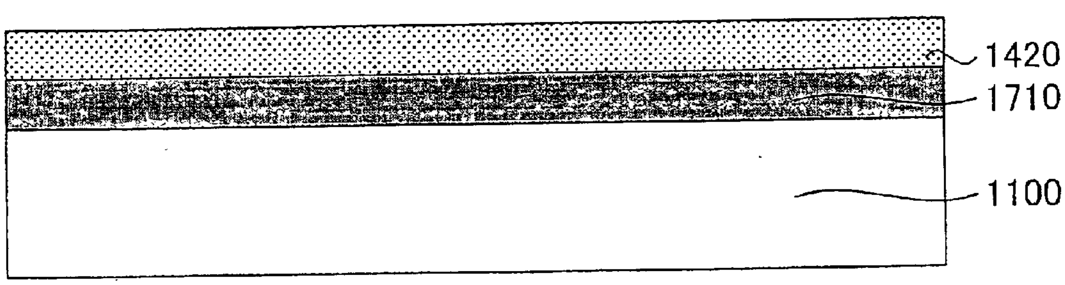

Fig. 1017
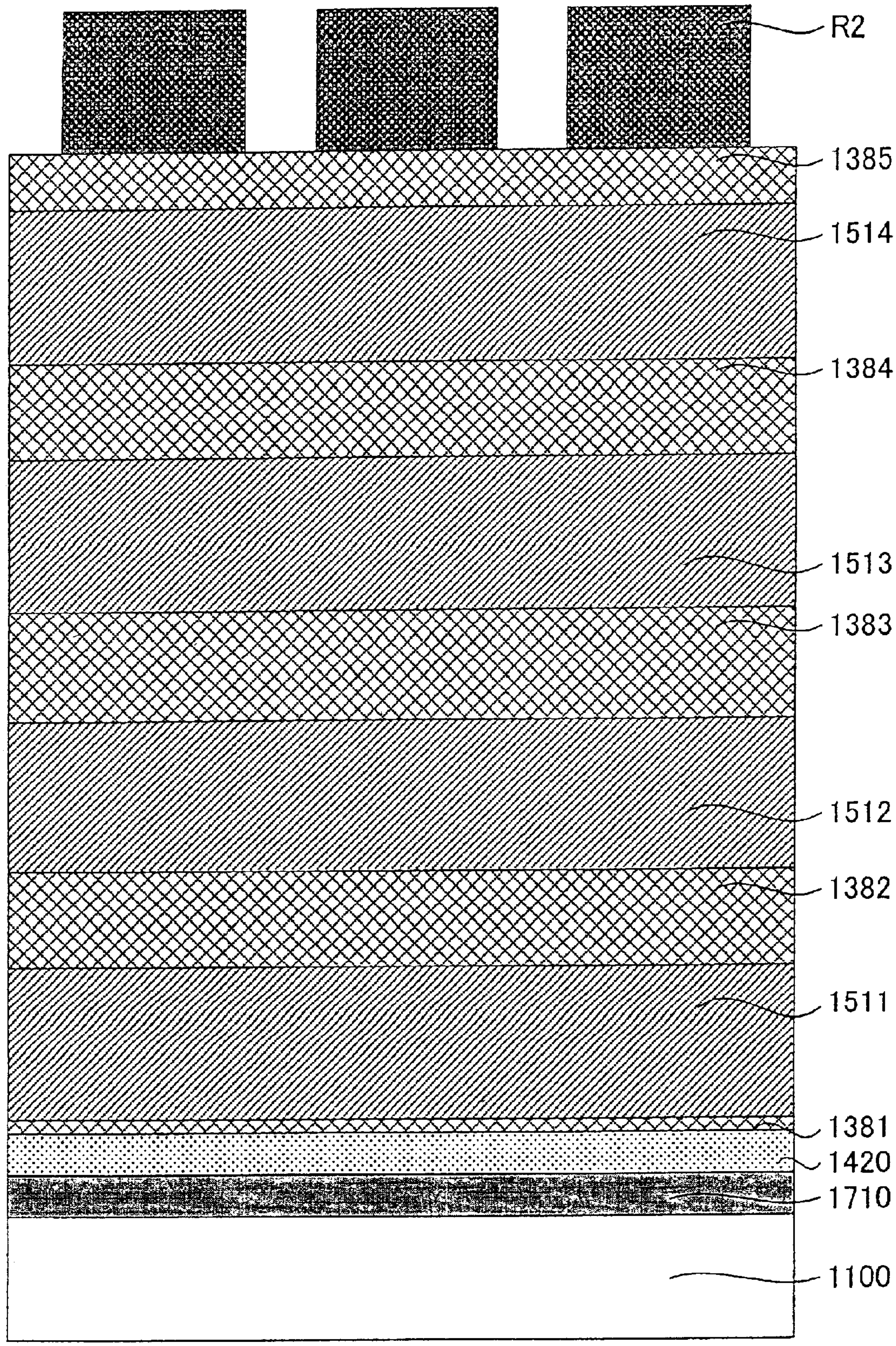

Fig. 1018
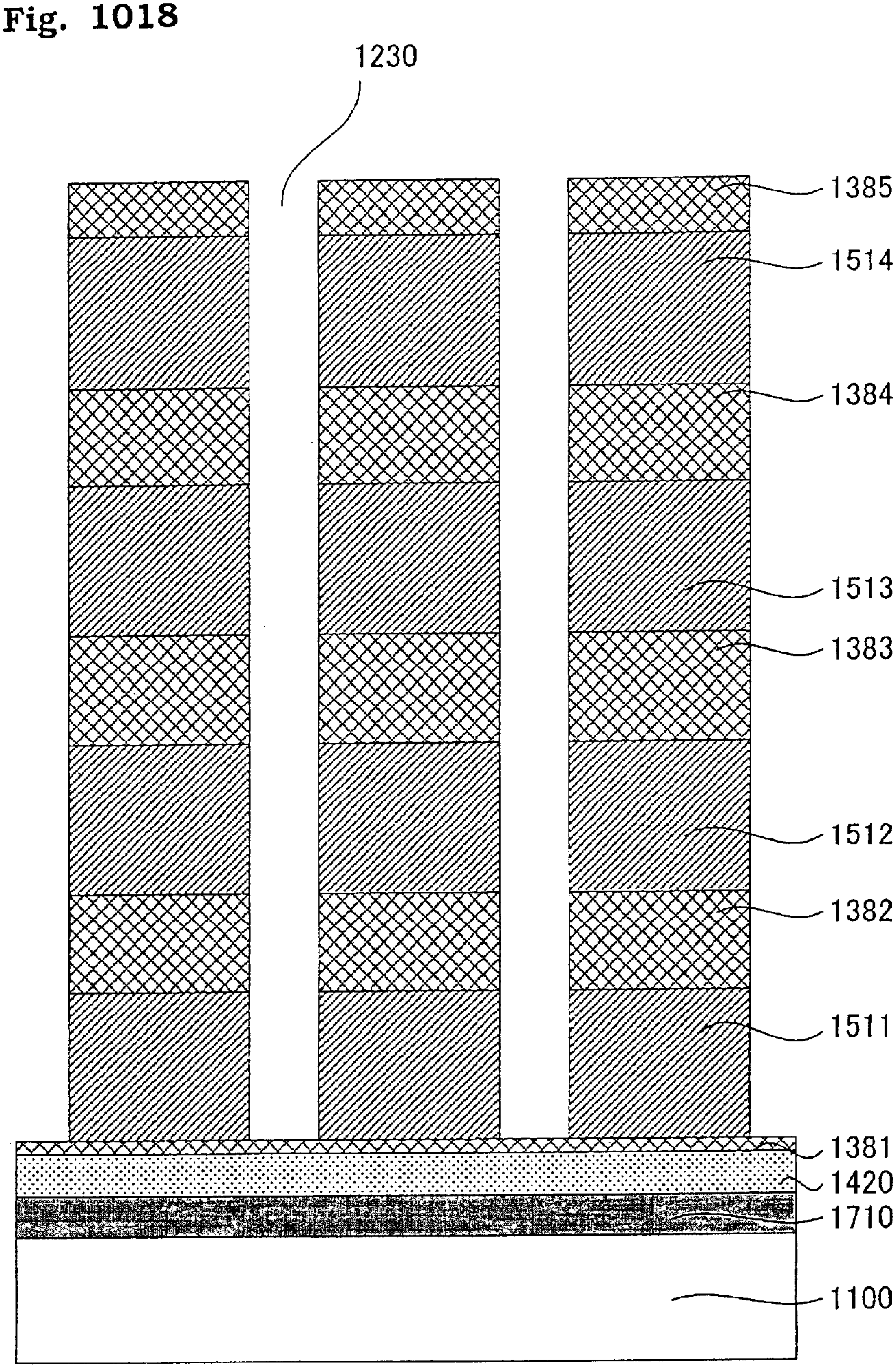

Fig. 1019
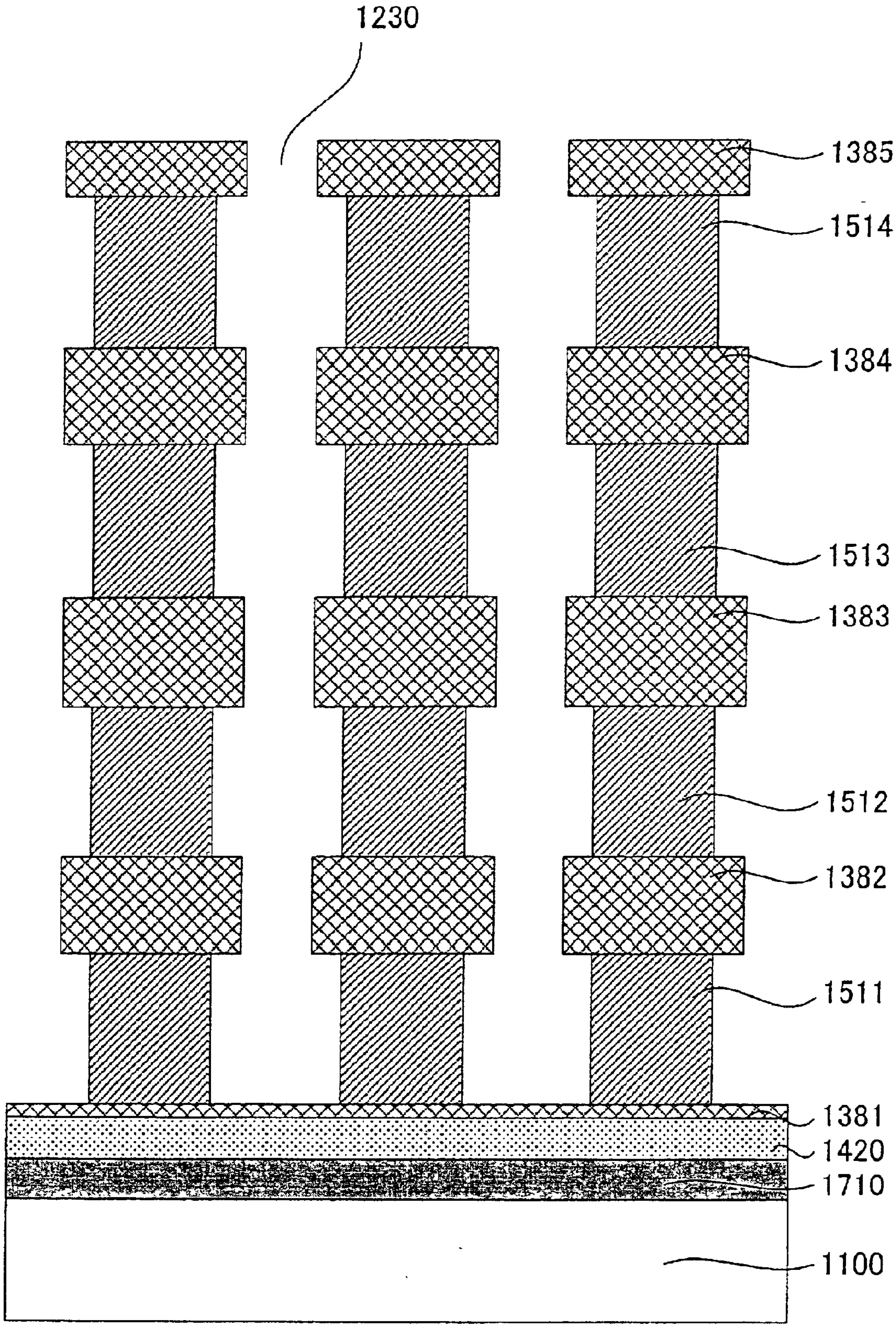

Fig. 1020
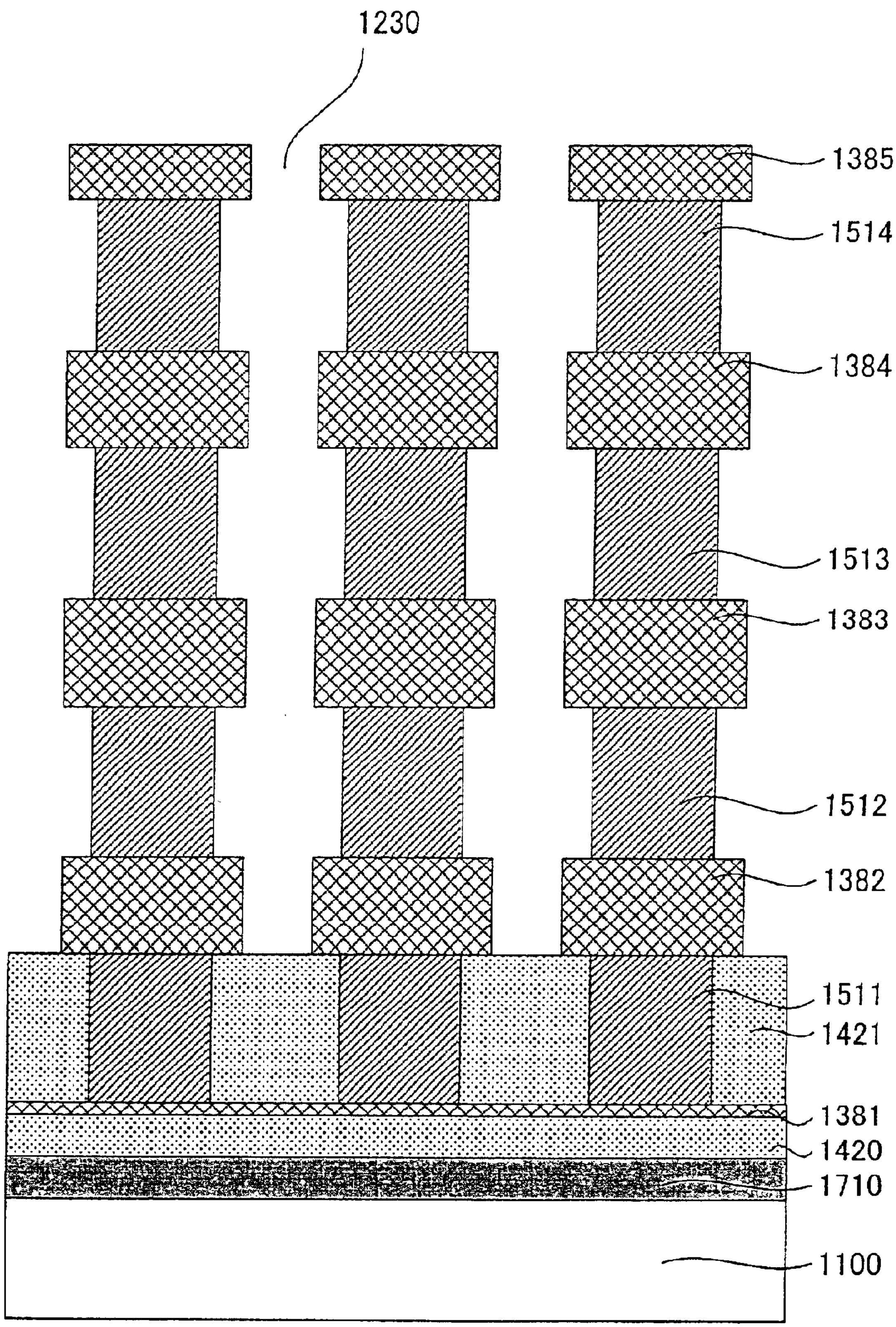

Fig. 1021
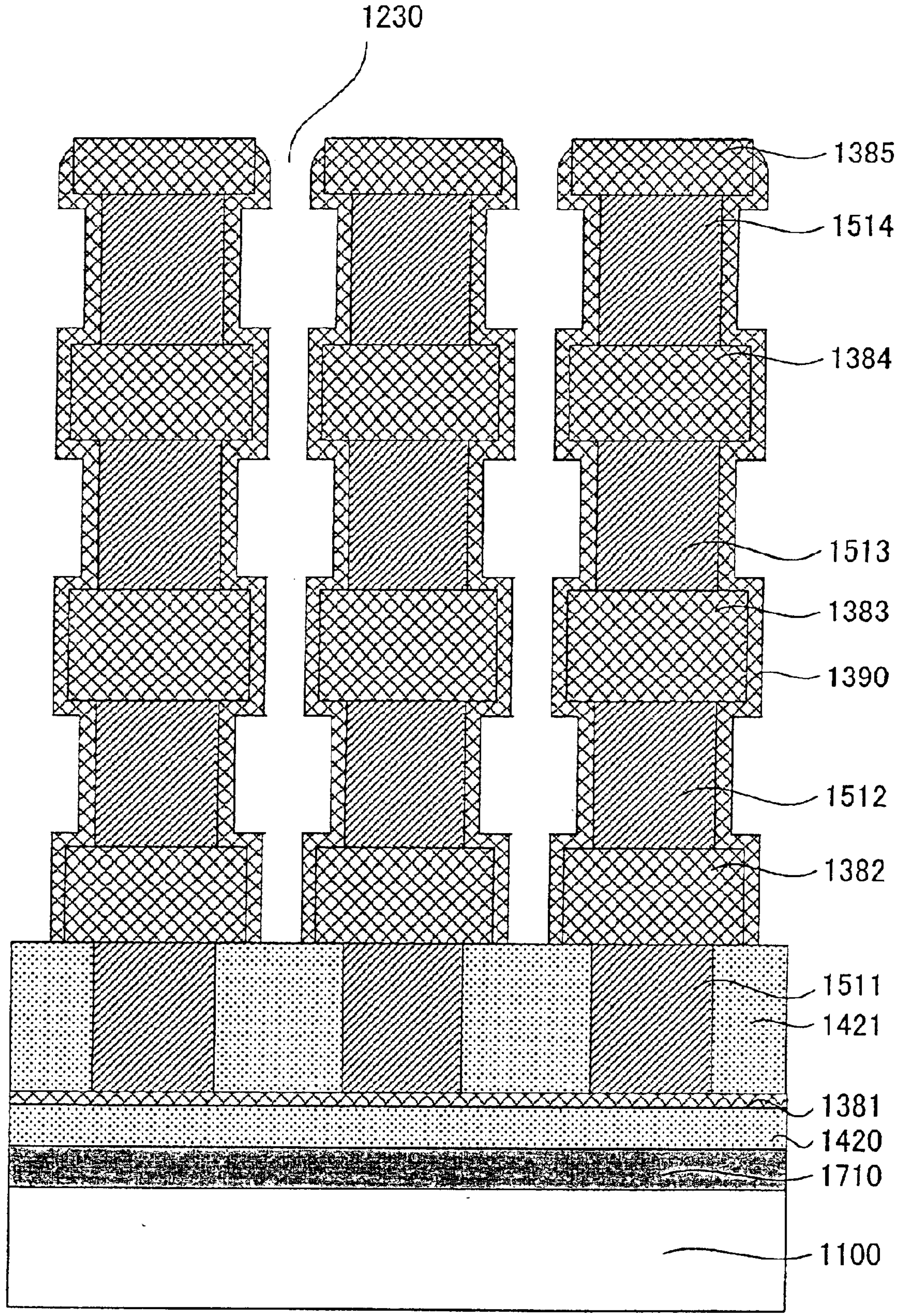

Fig. 1022
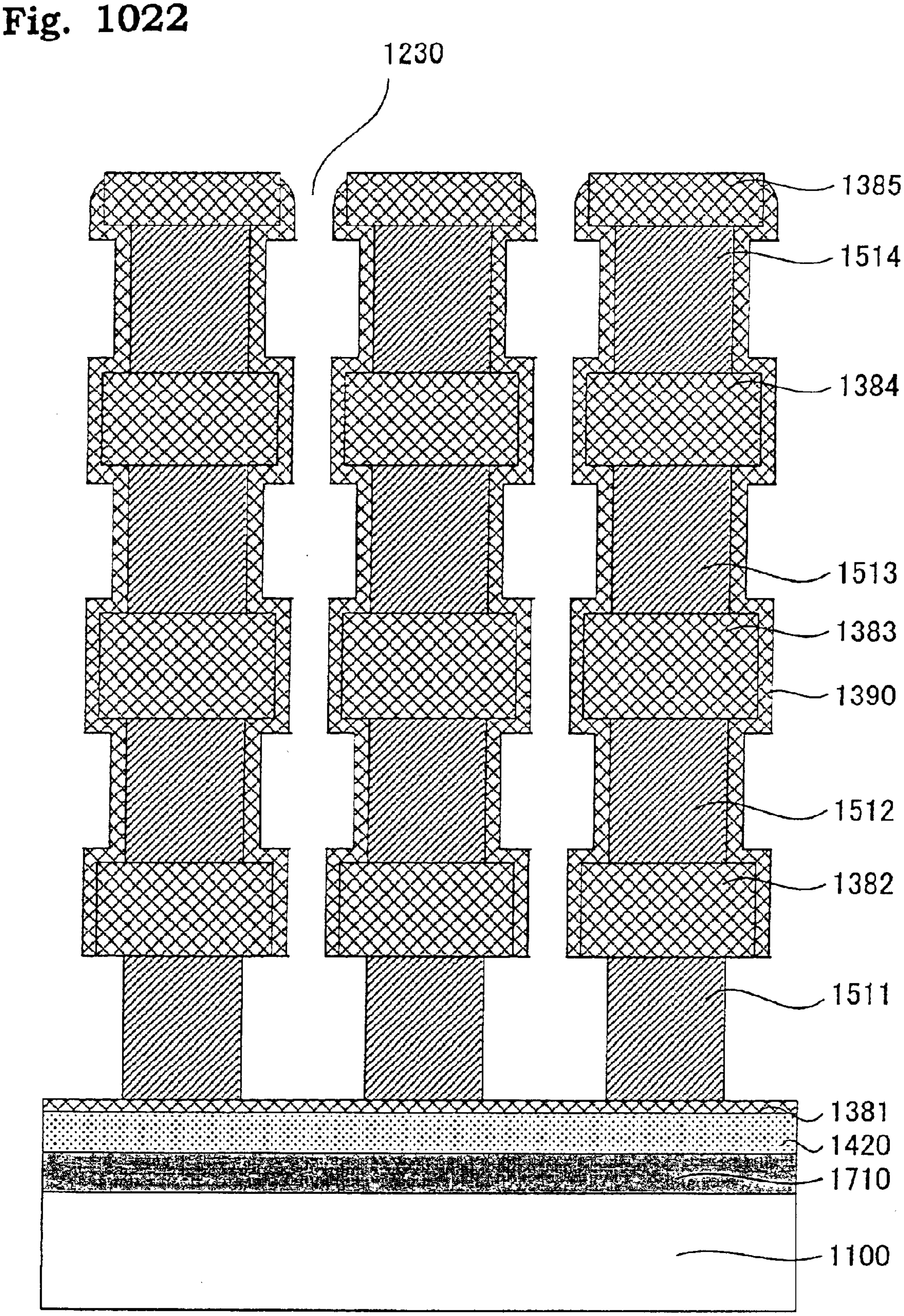

Fig. 1023
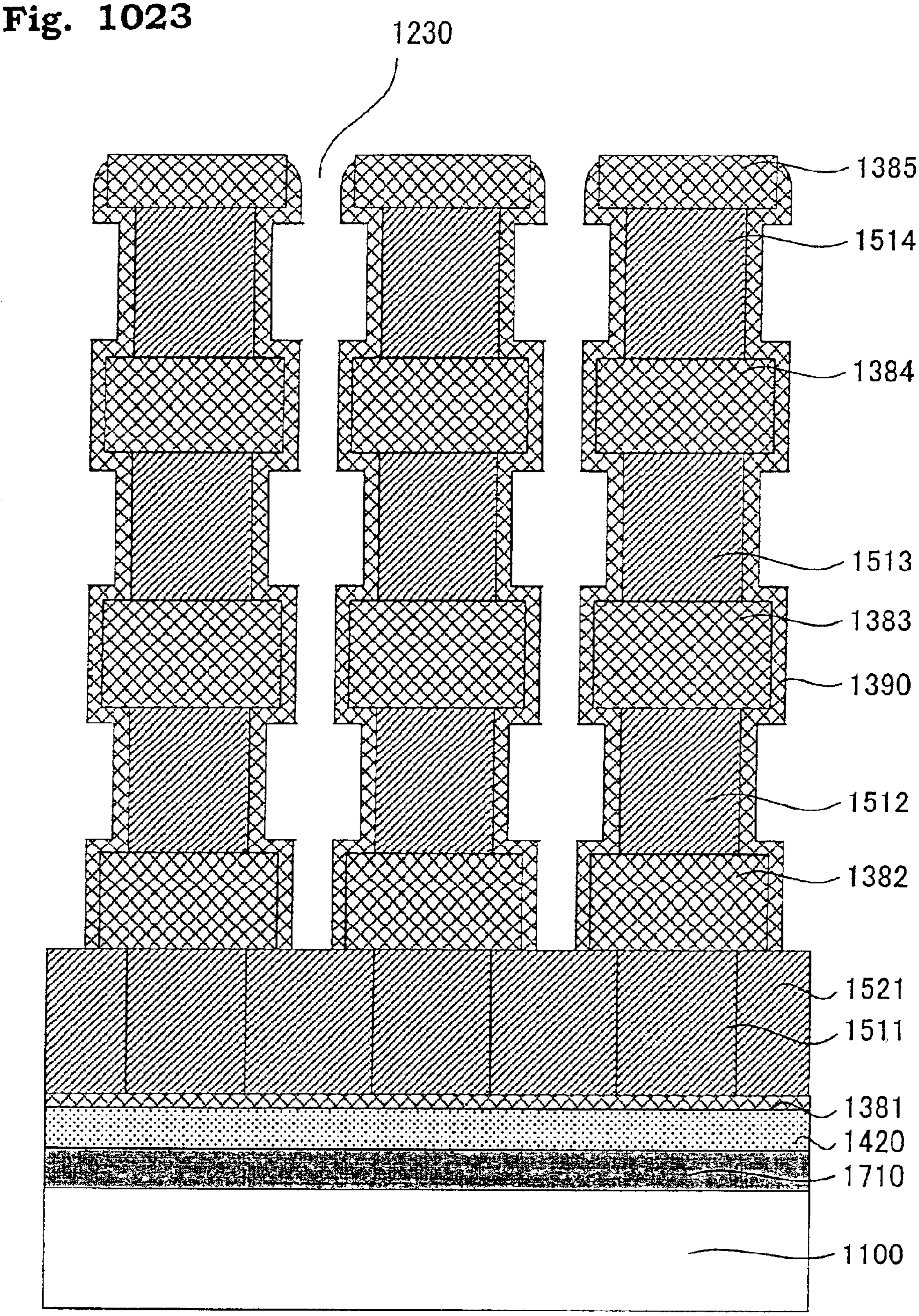

Fig. 1024
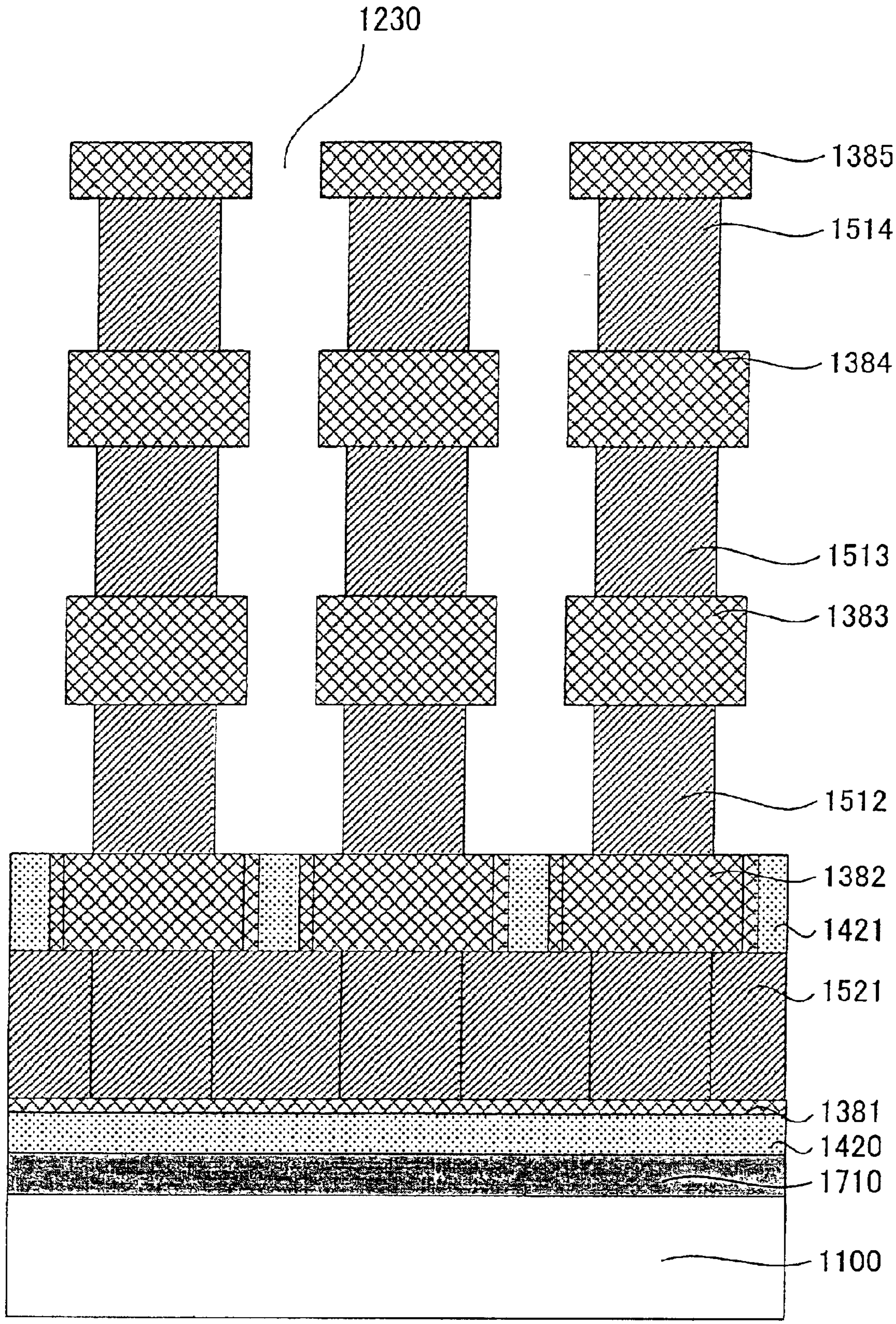

Fig. 1025
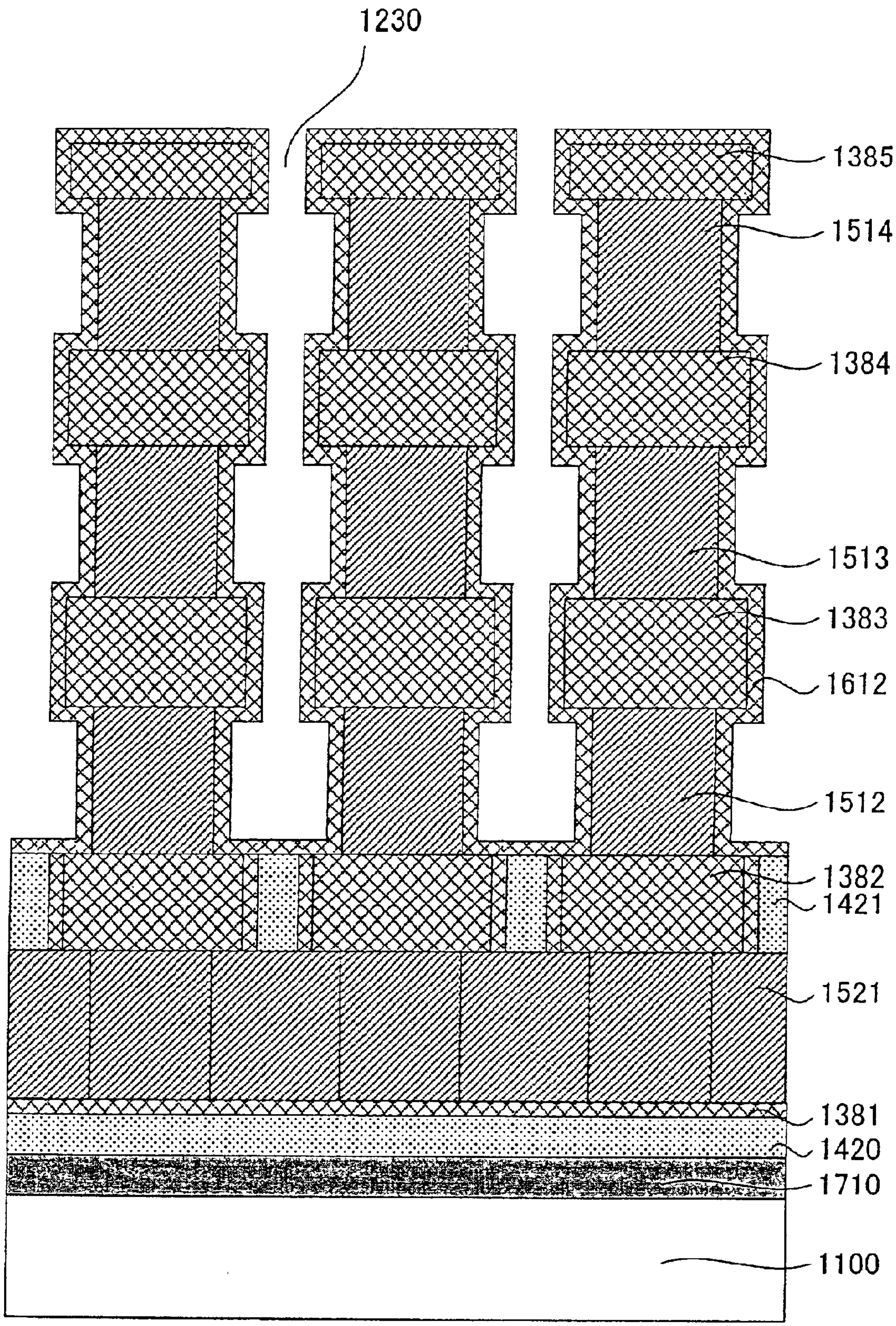

Fig. 1026
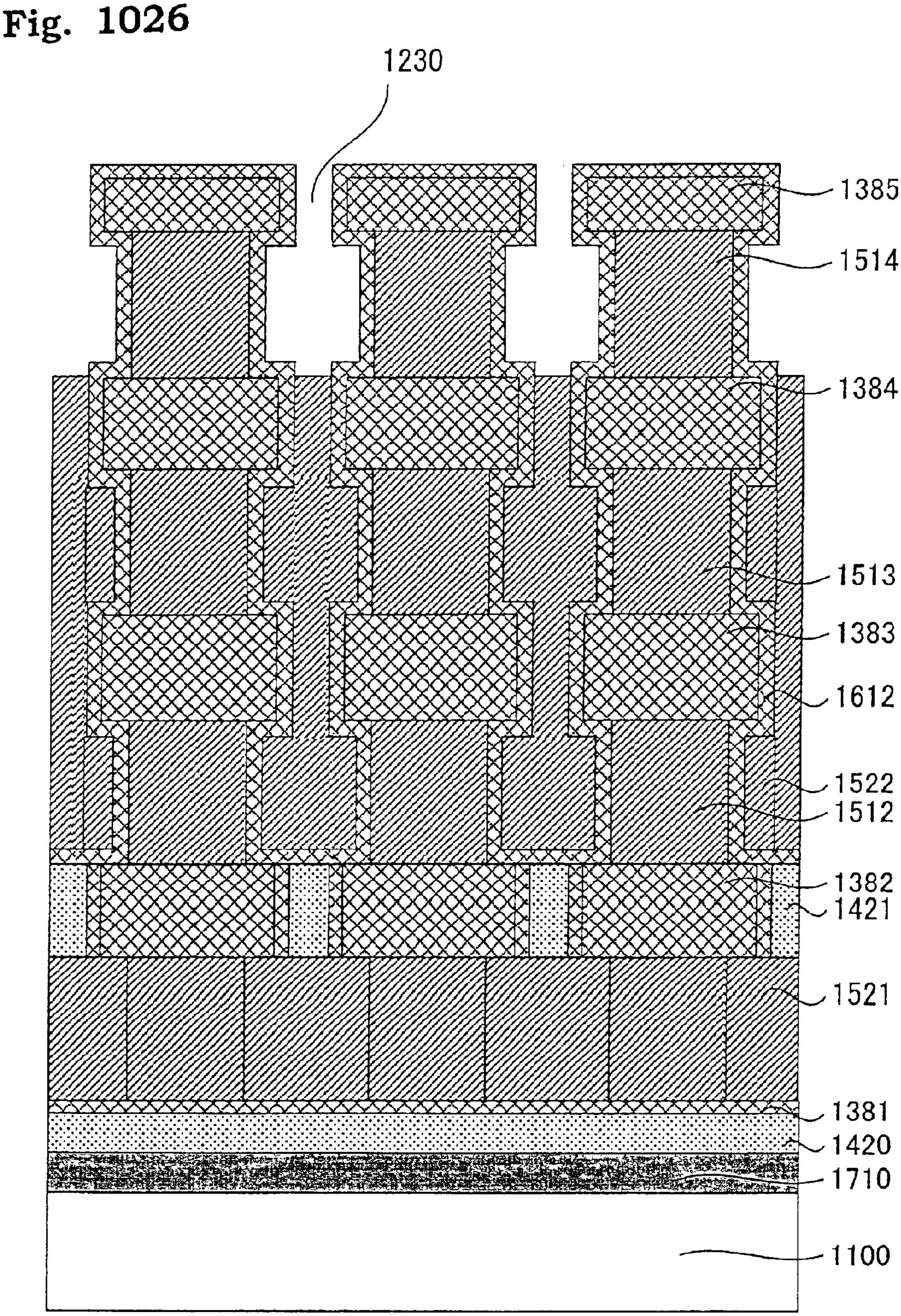

Fig. 1027
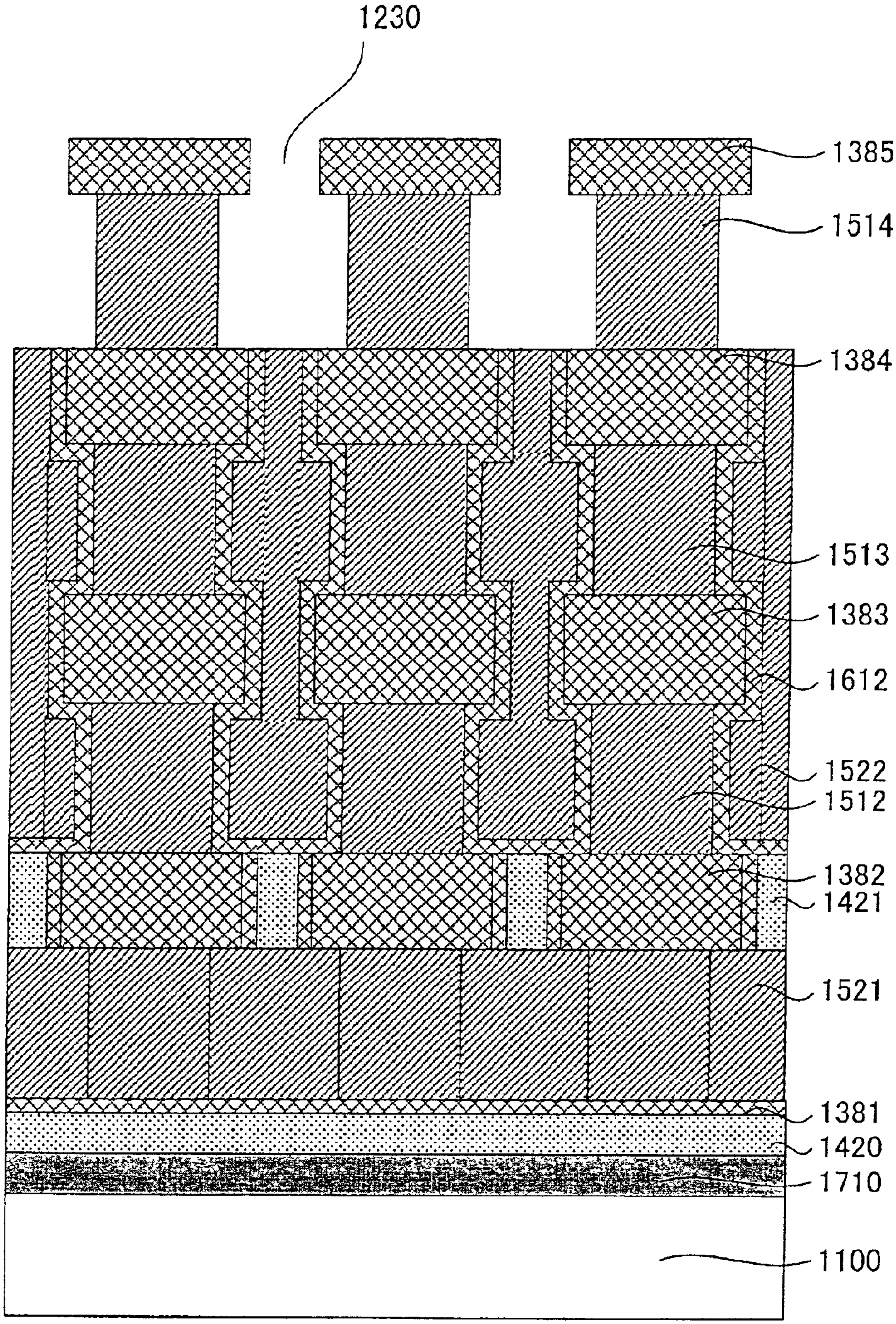

Fig. 1028
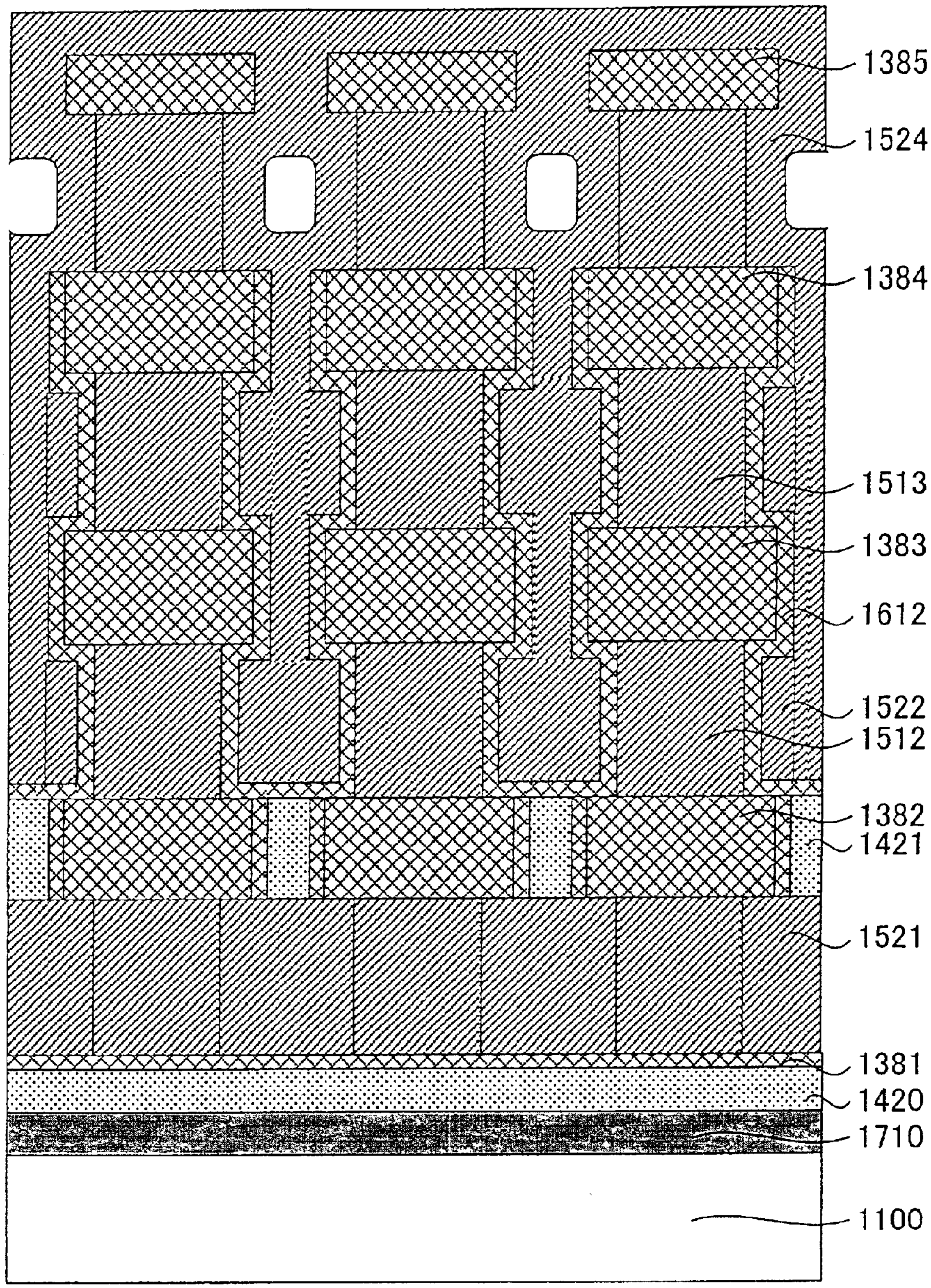

Fig. 1029
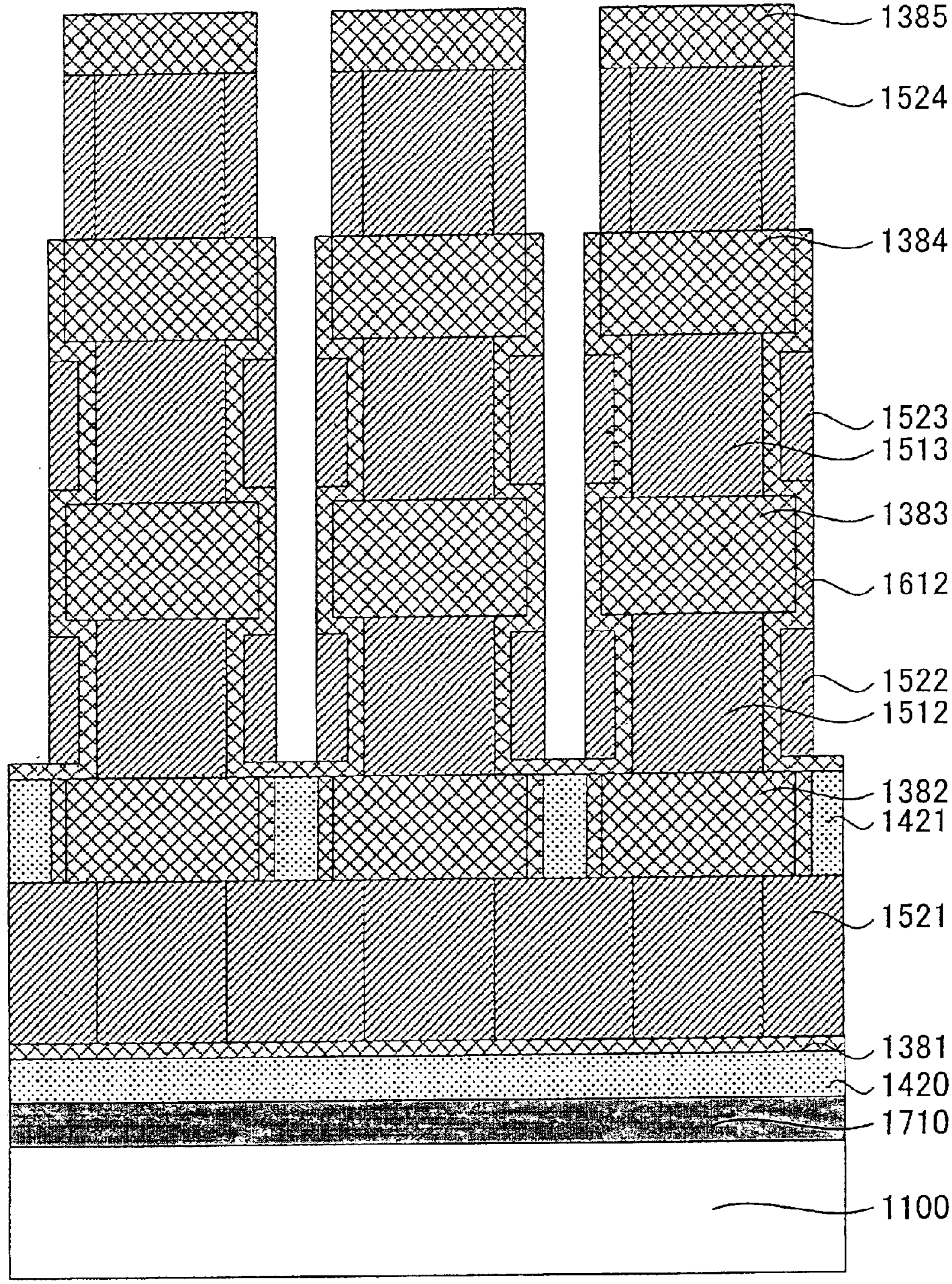

Fig. 1030
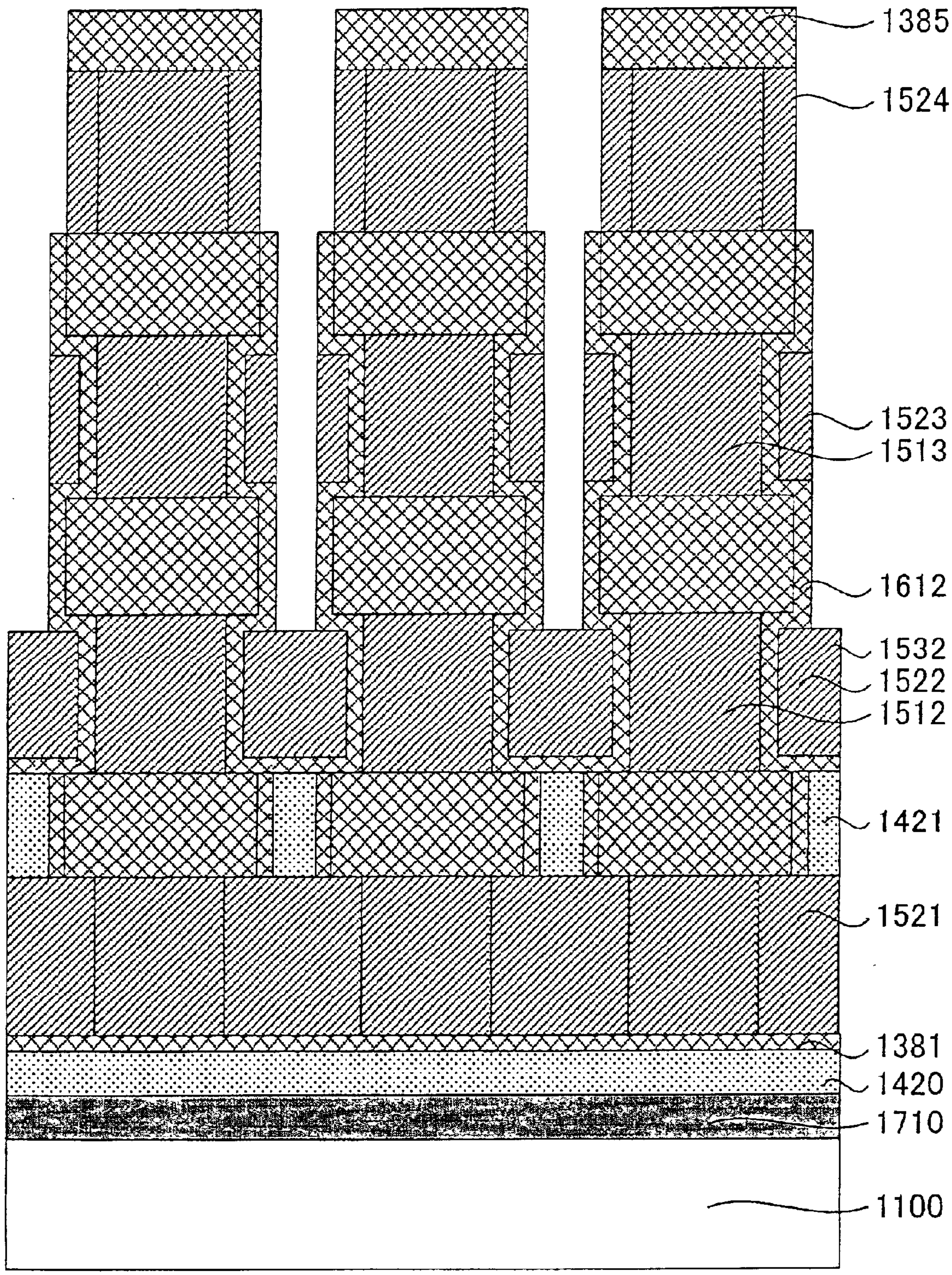

Fig. 1031
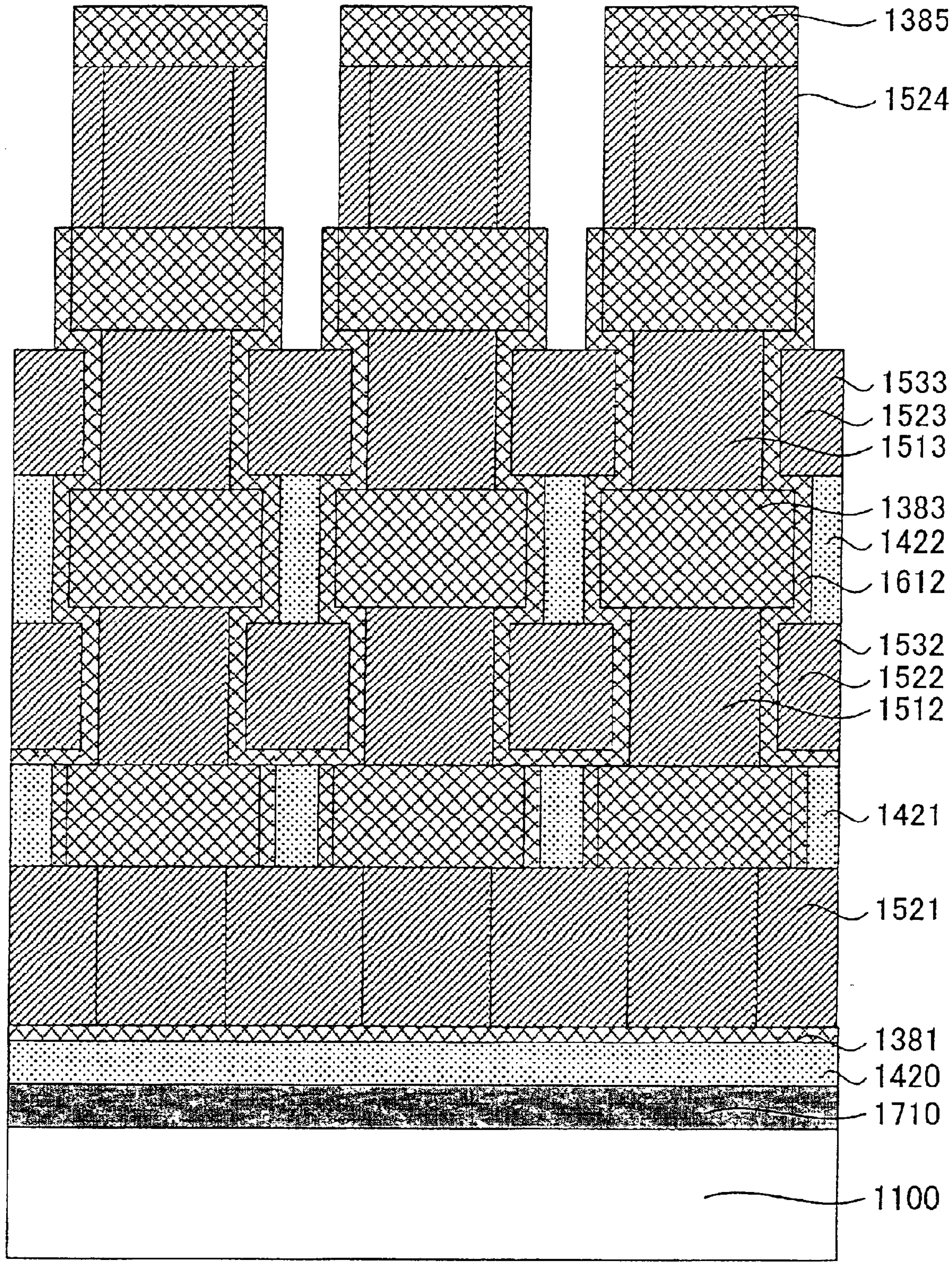

Fig. 1032
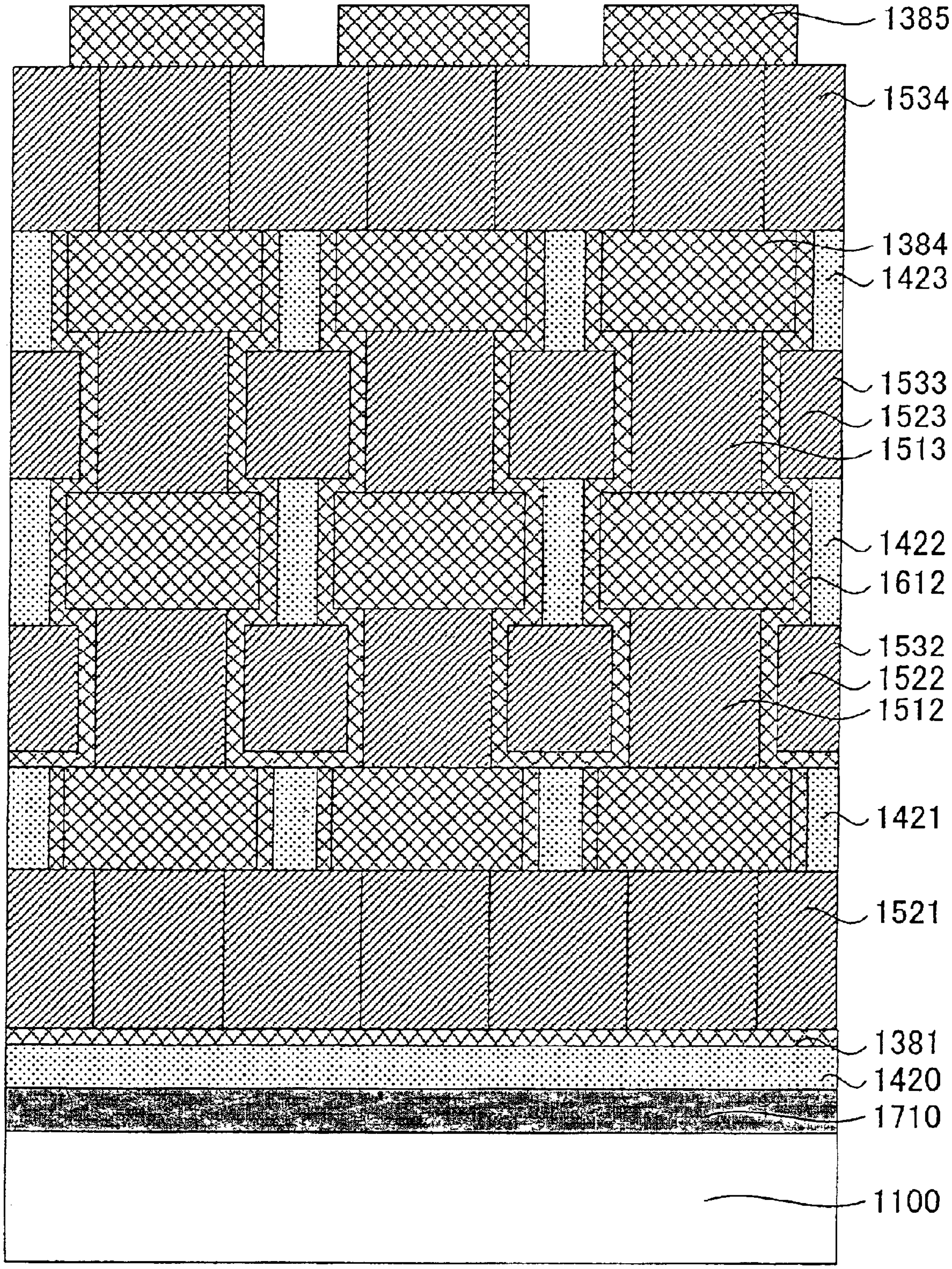

Fig. 1033
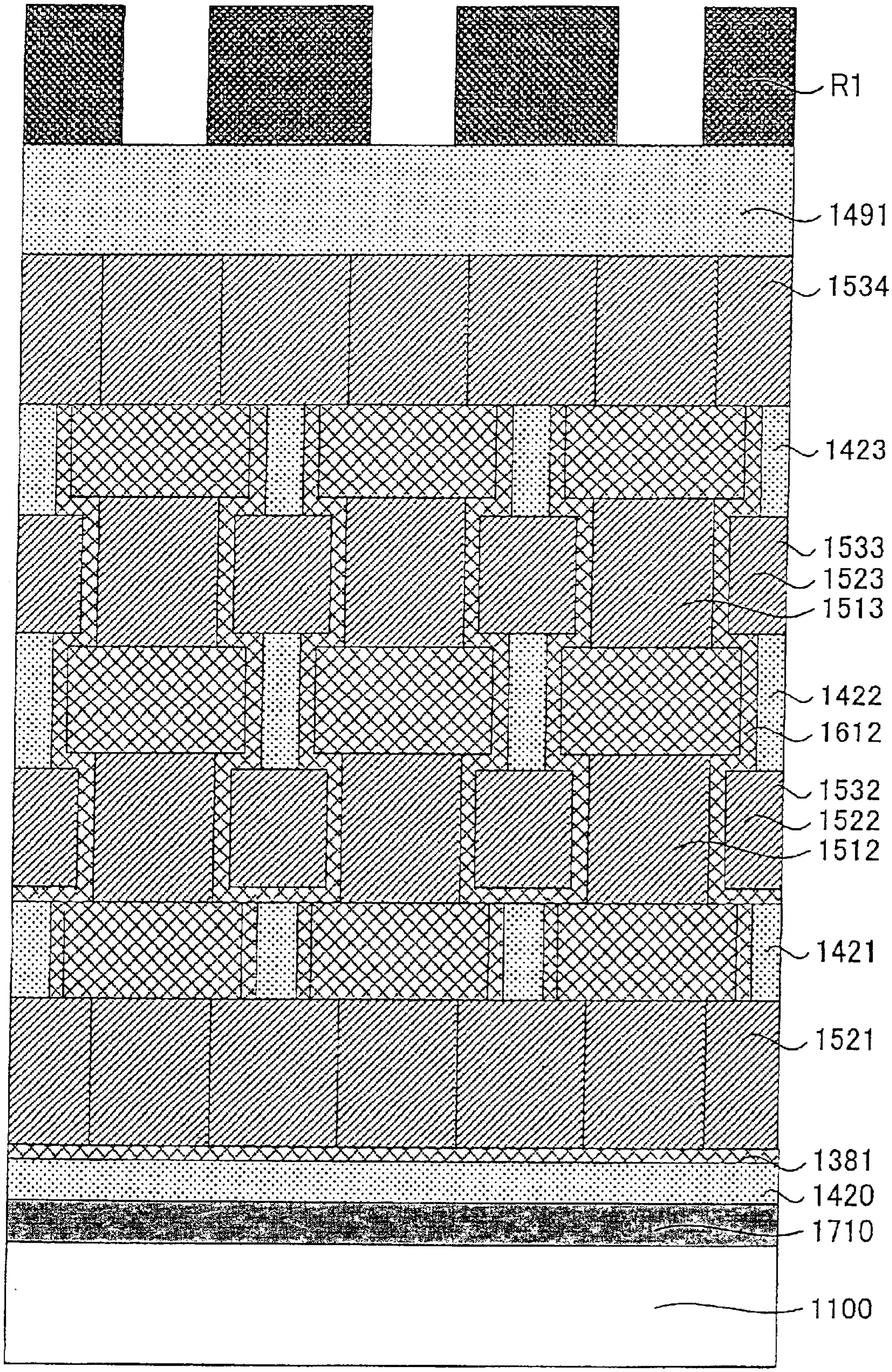

Fig. 1034
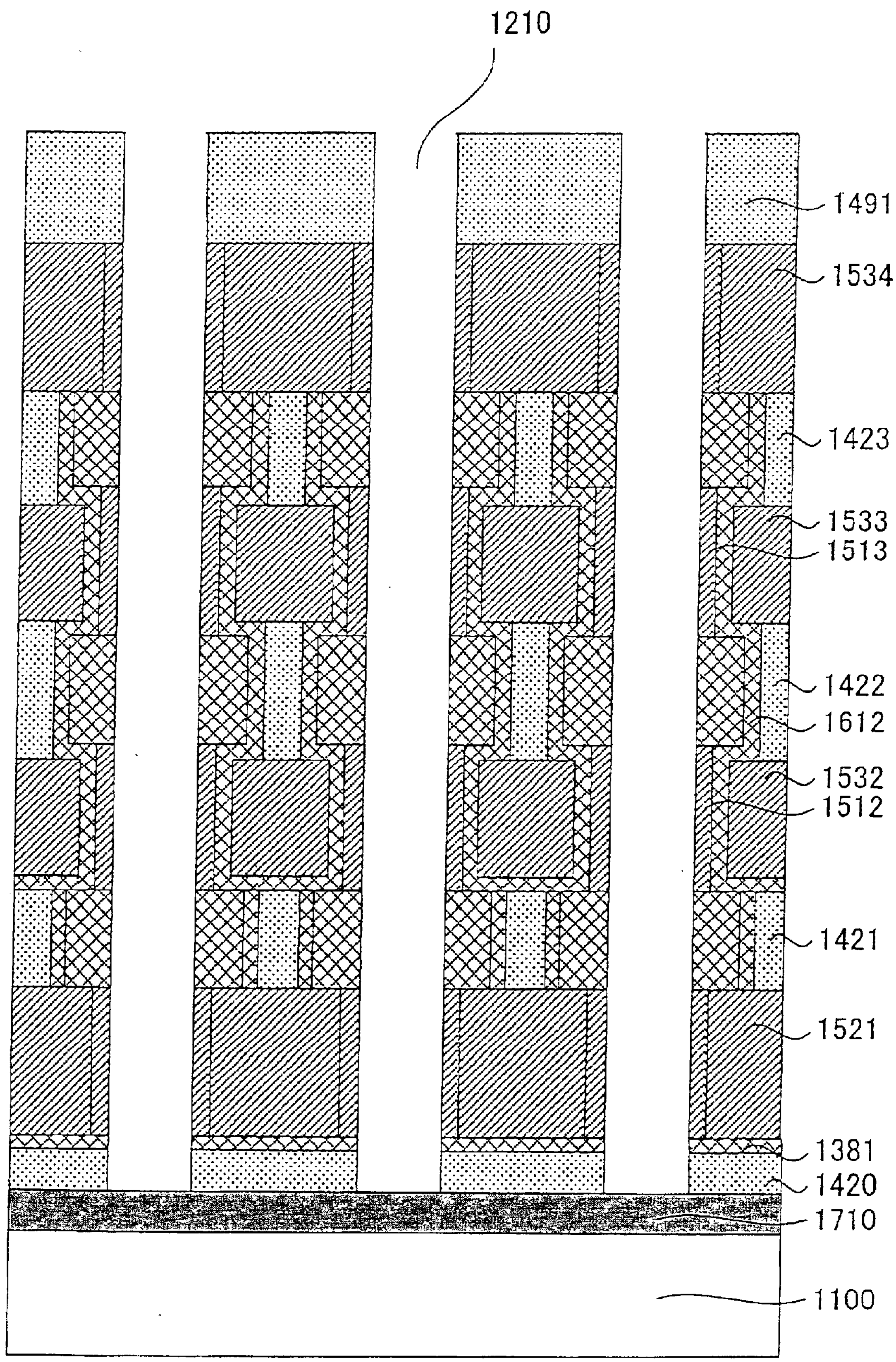

Fig. 1035
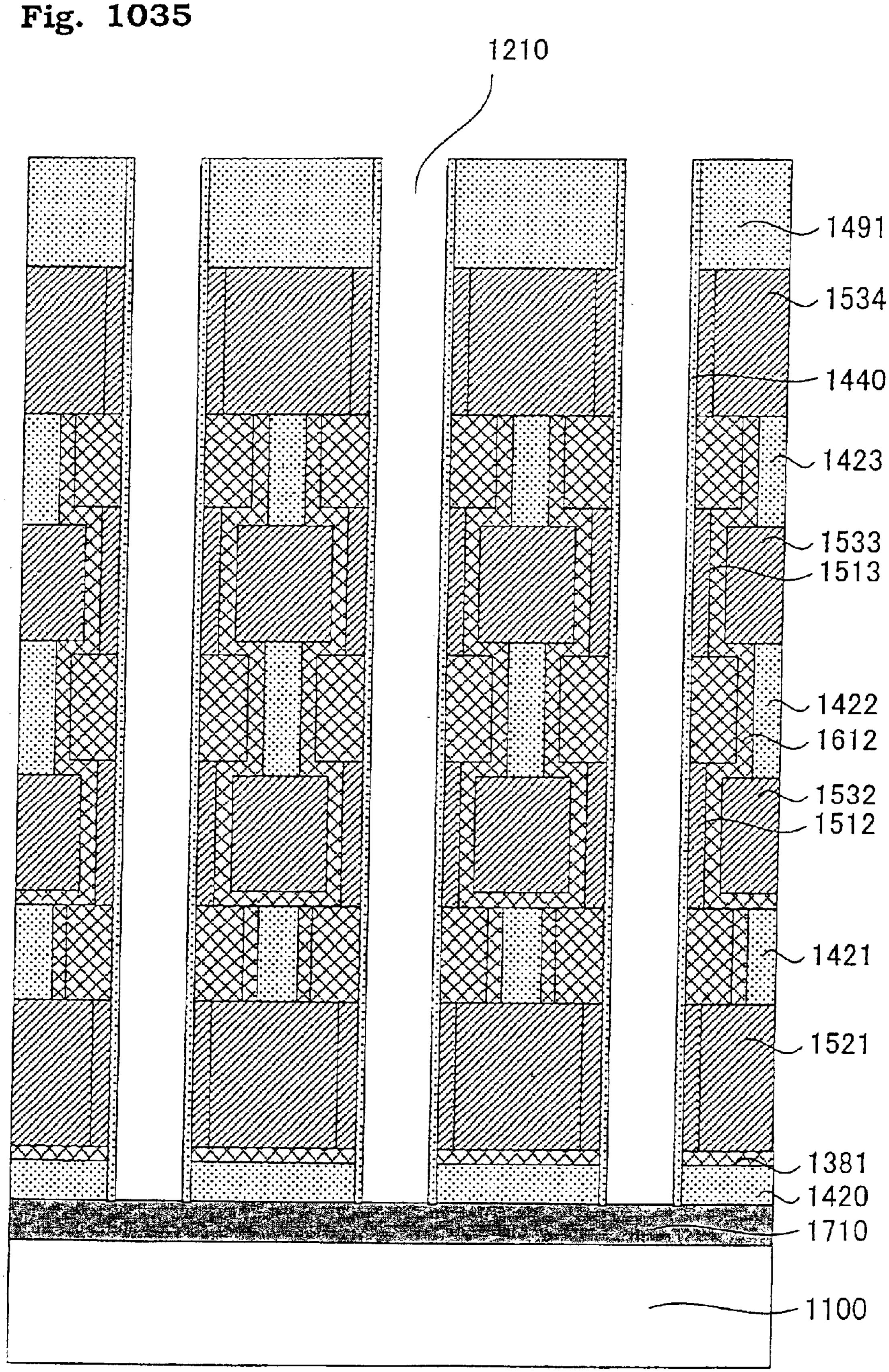

Fig. 1036
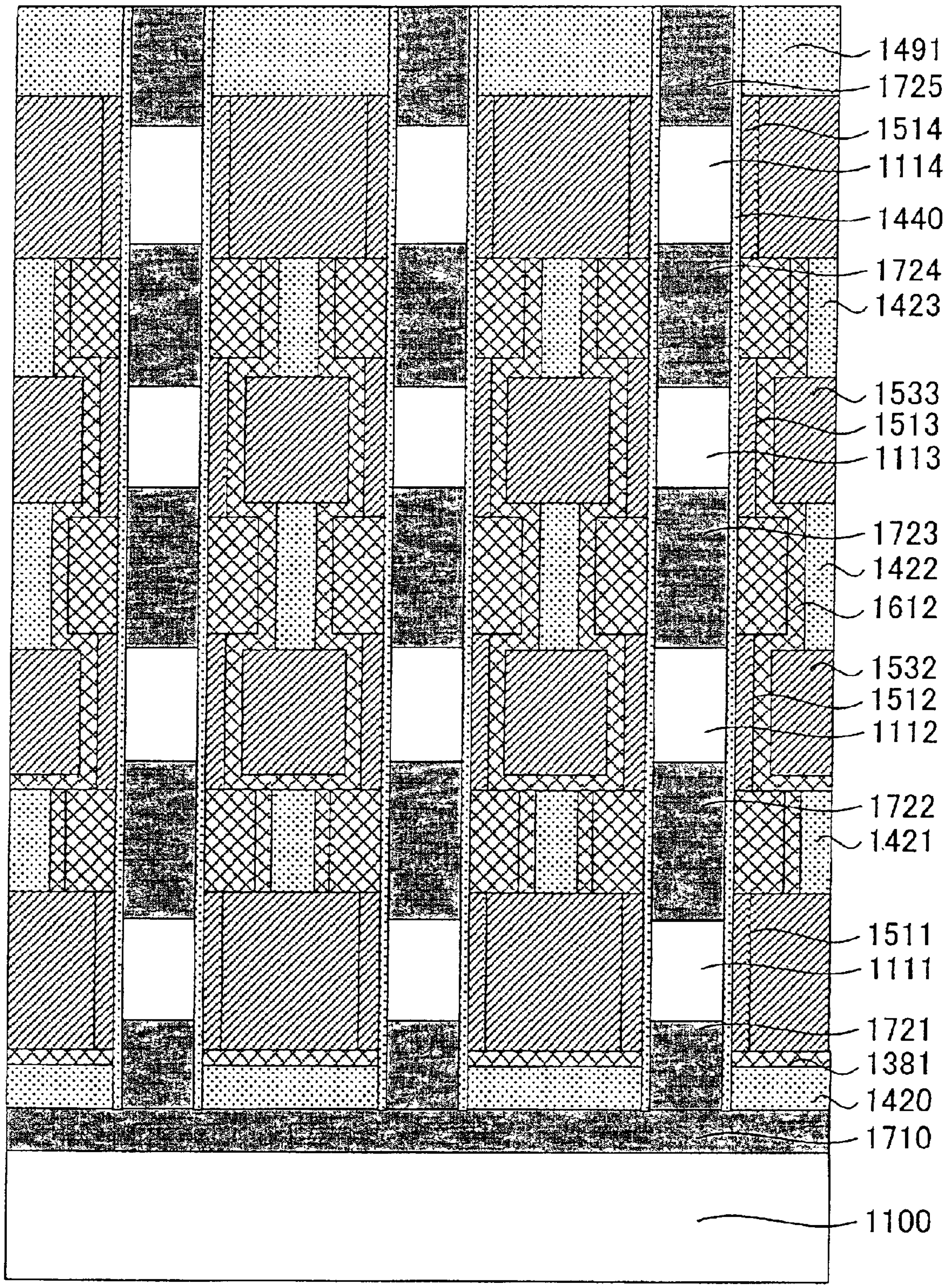

Fig. 1037
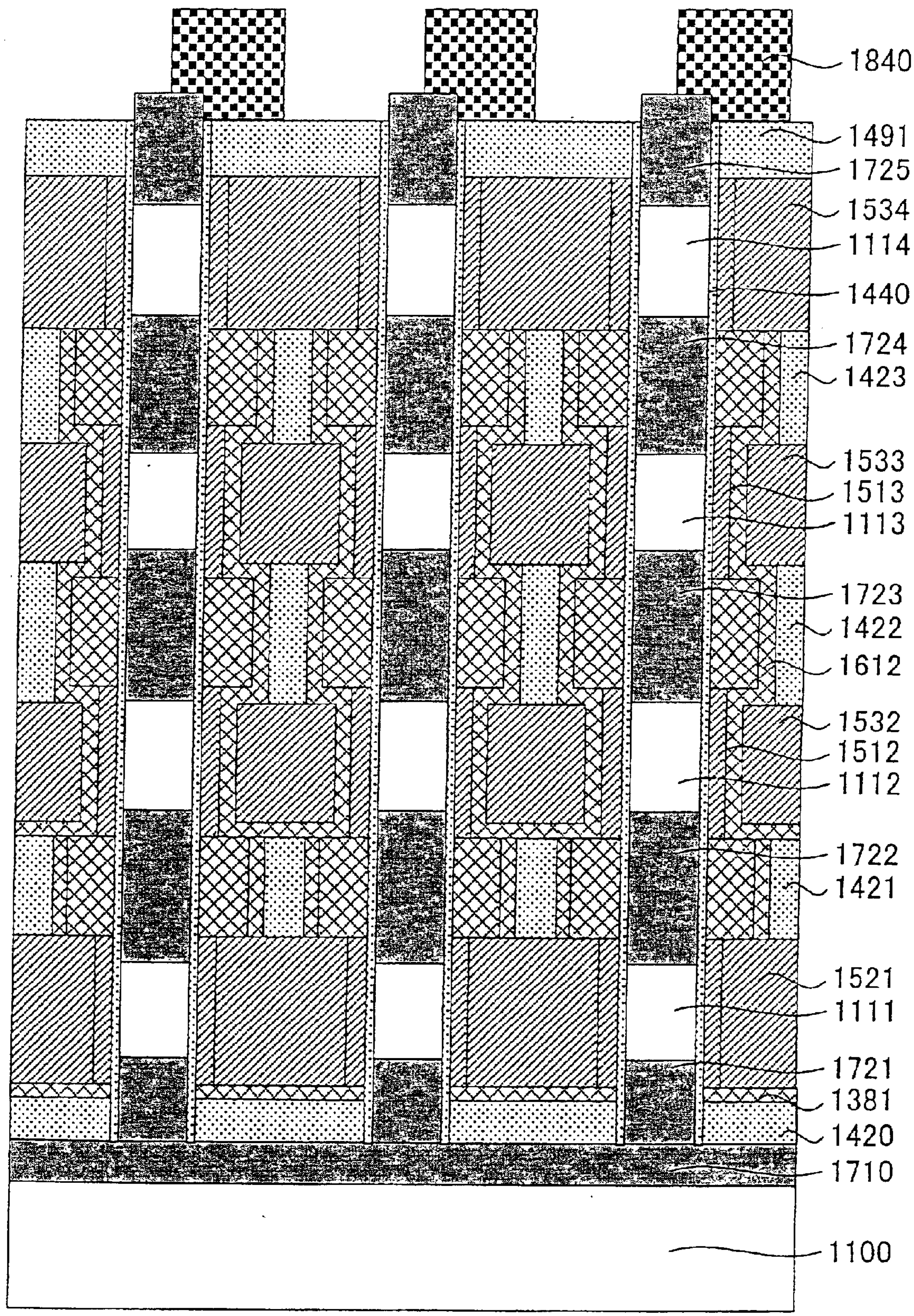

Fig. 1038
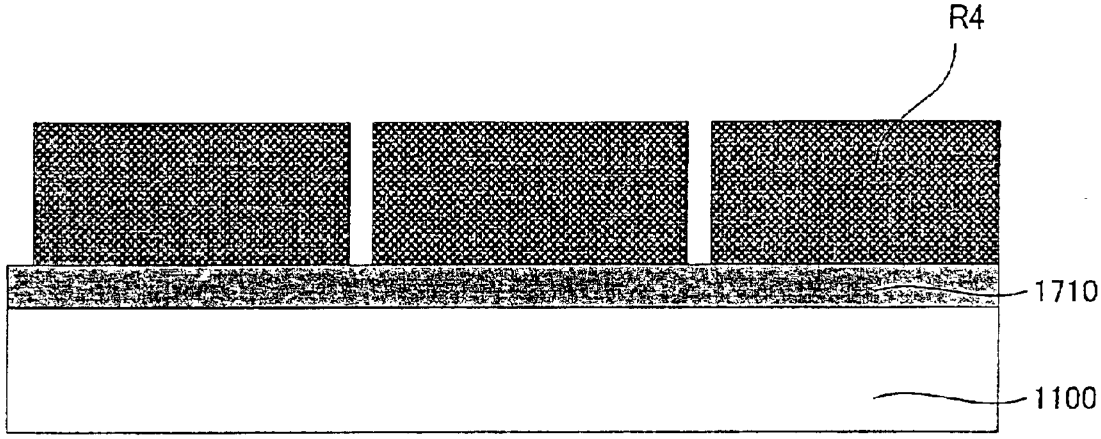
Fig. 1039
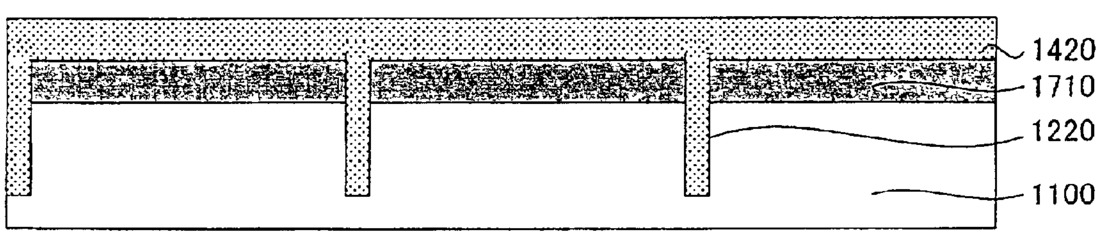

Fig. 1040
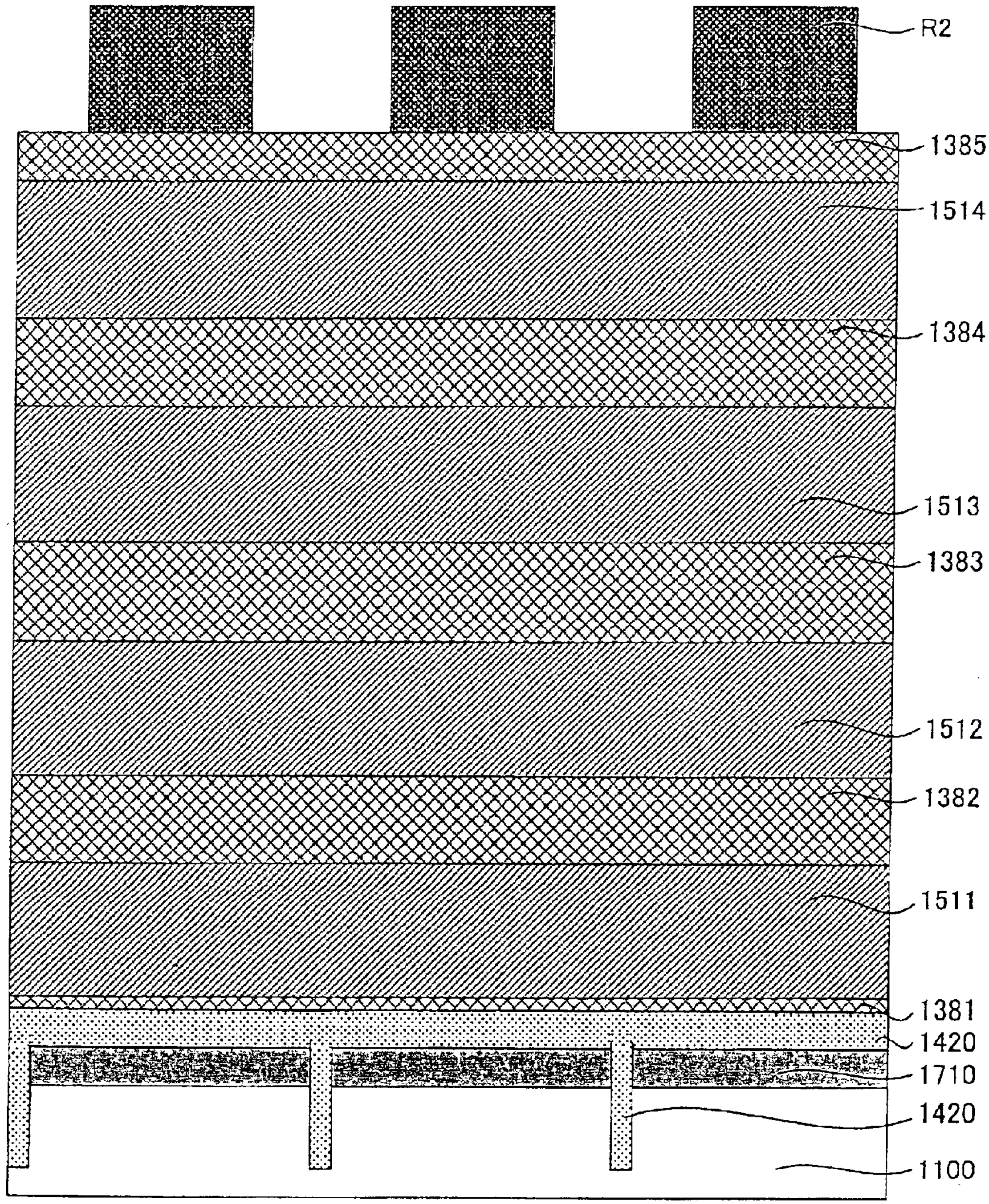

Fig. 1041
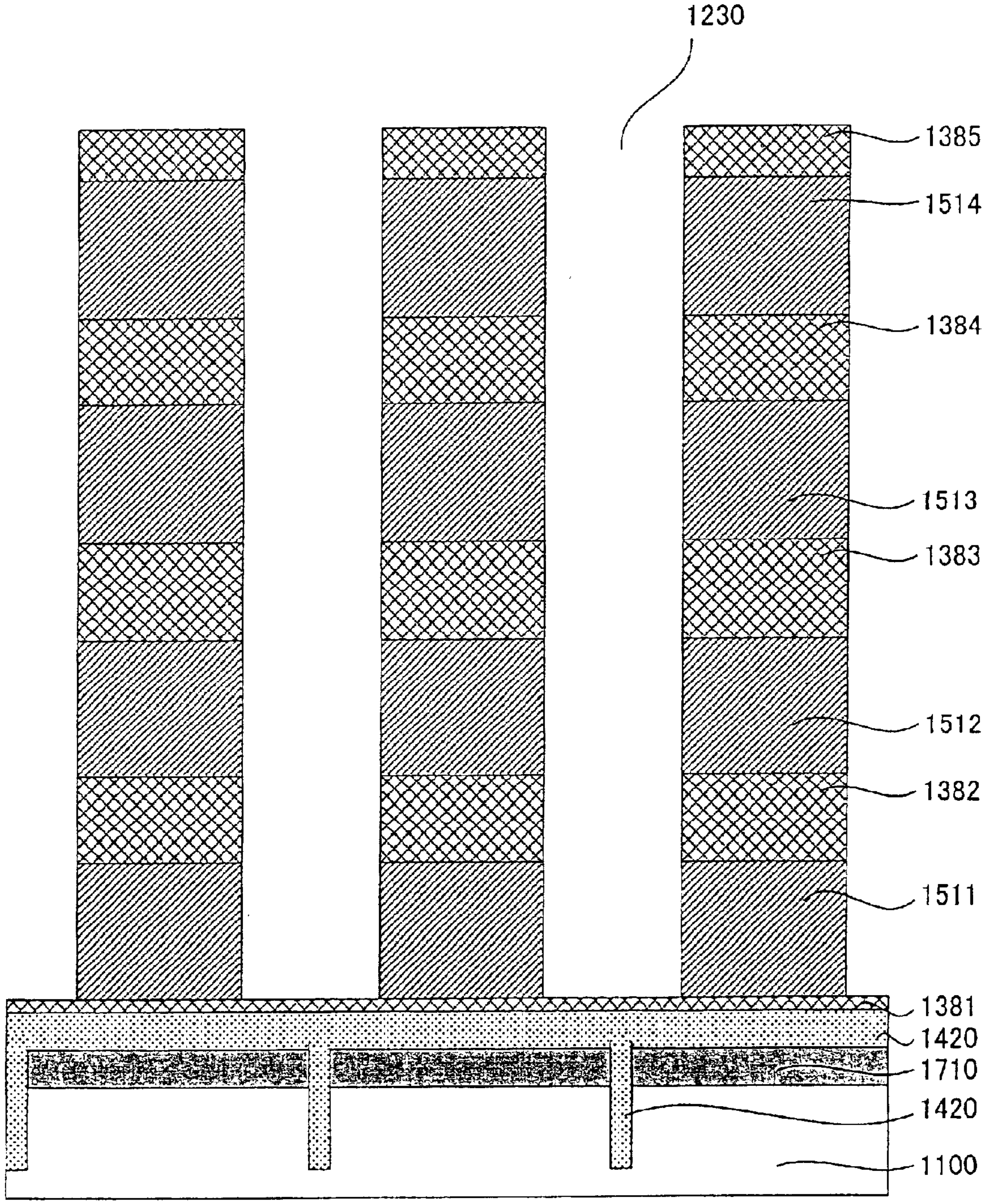

Fig. 1042
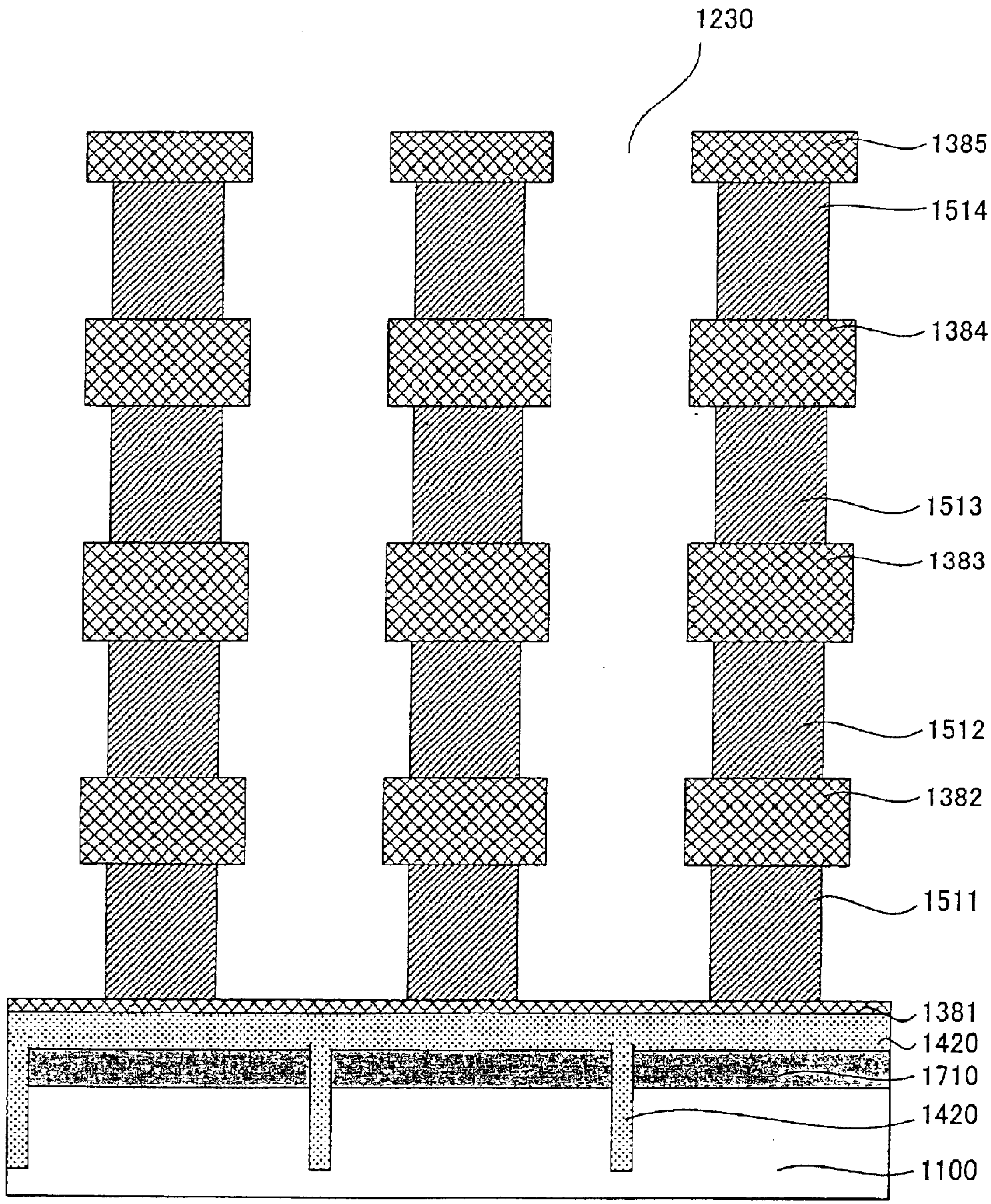

Fig. 1043
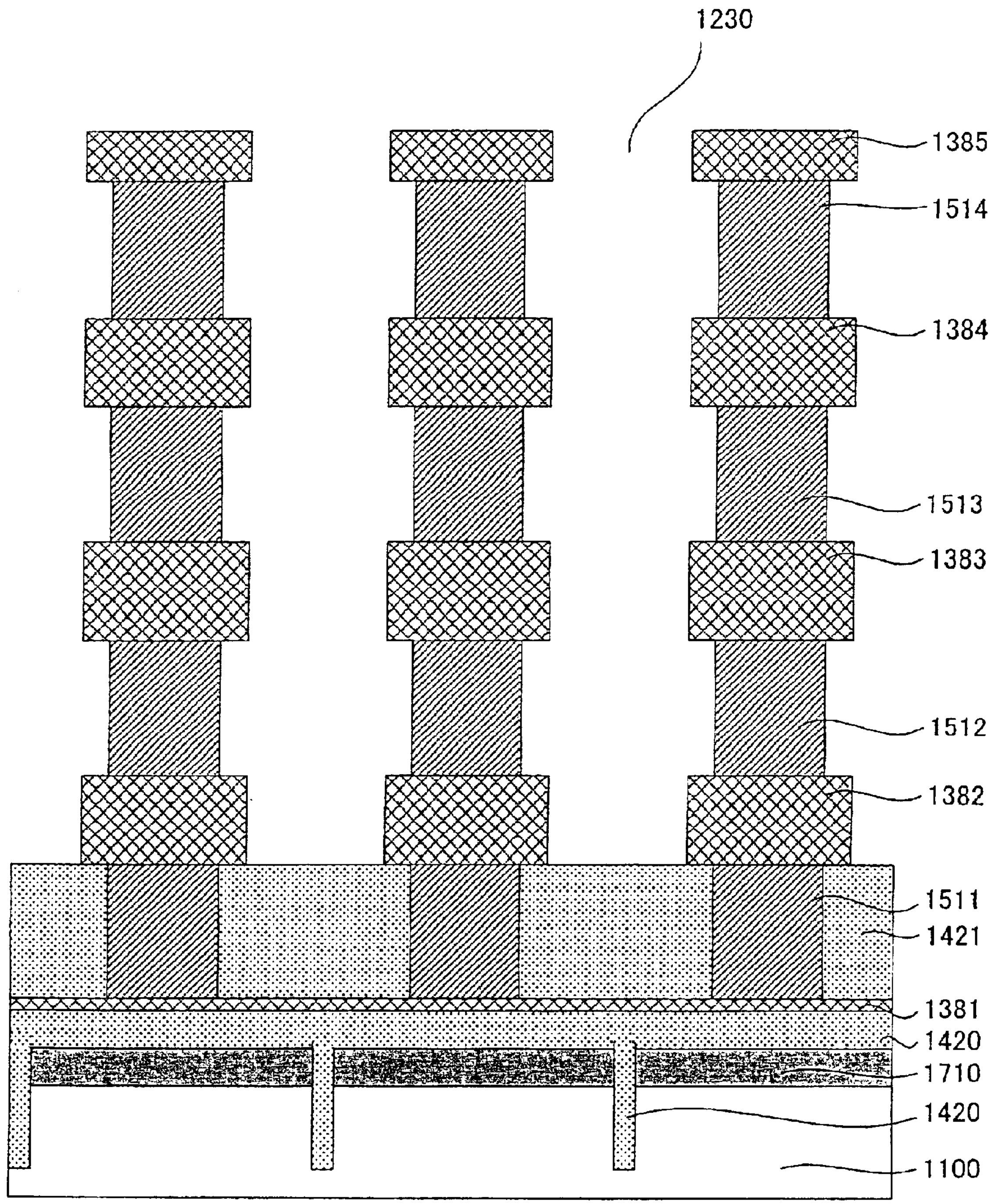

Fig. 1044
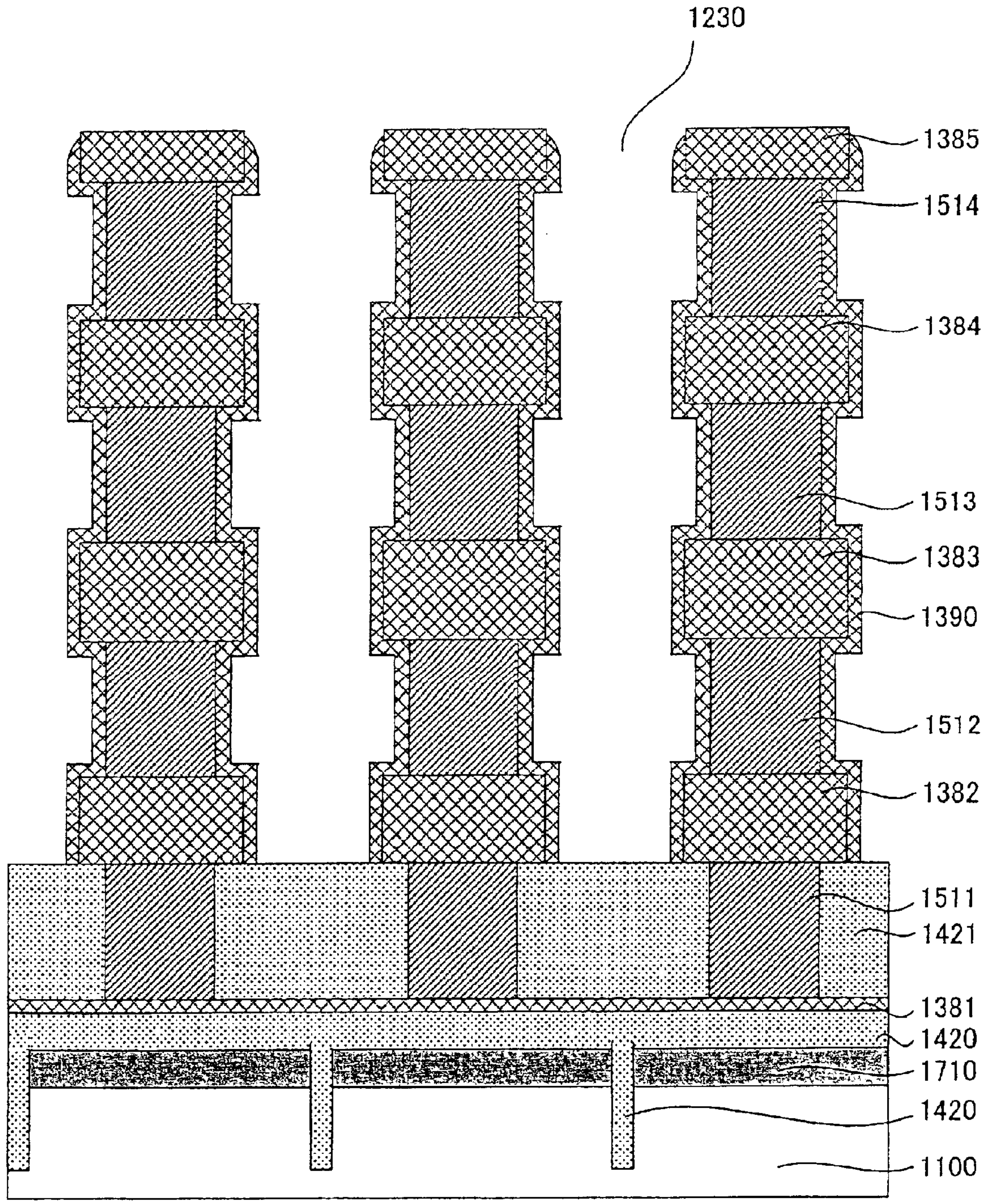

Fig. 1045
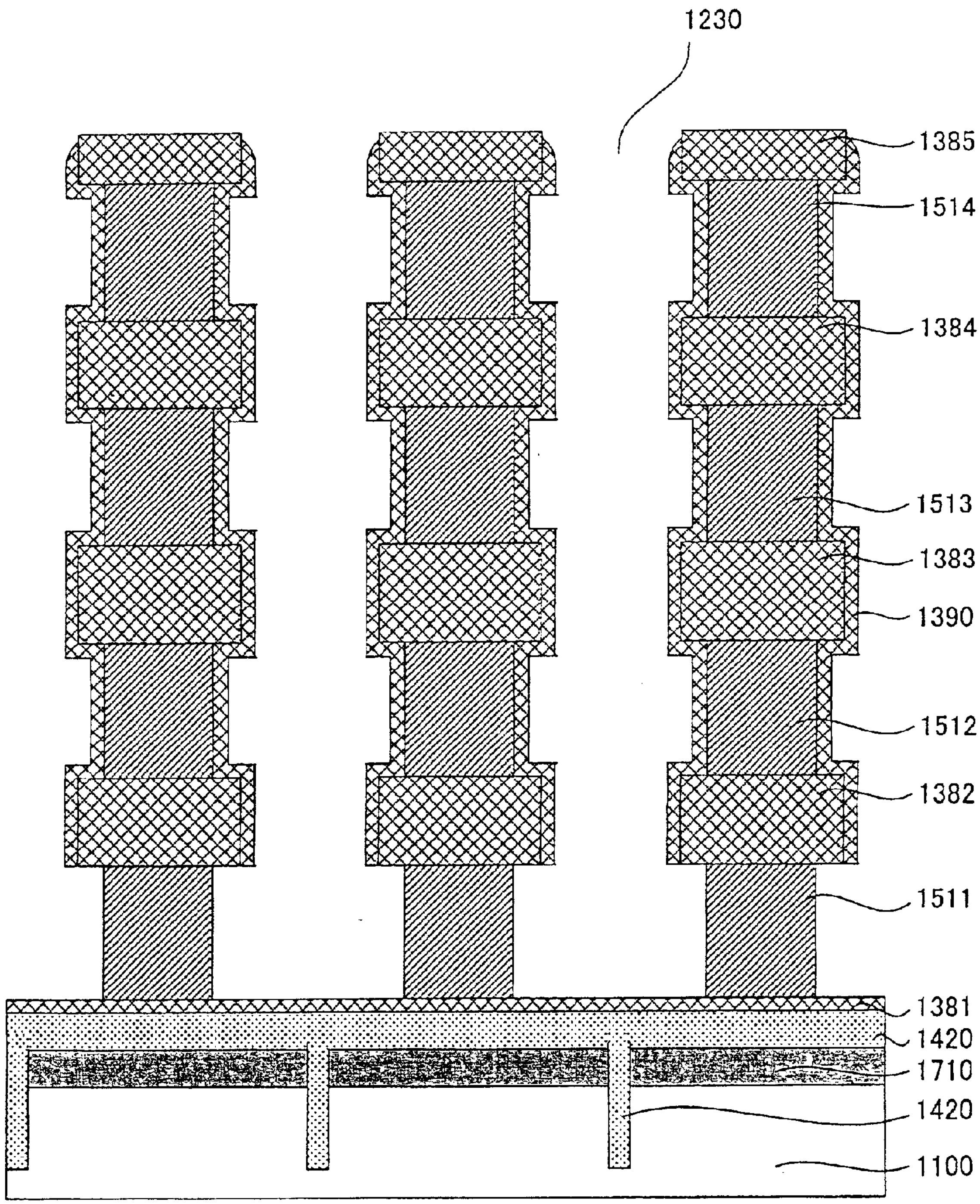

Fig. 1046
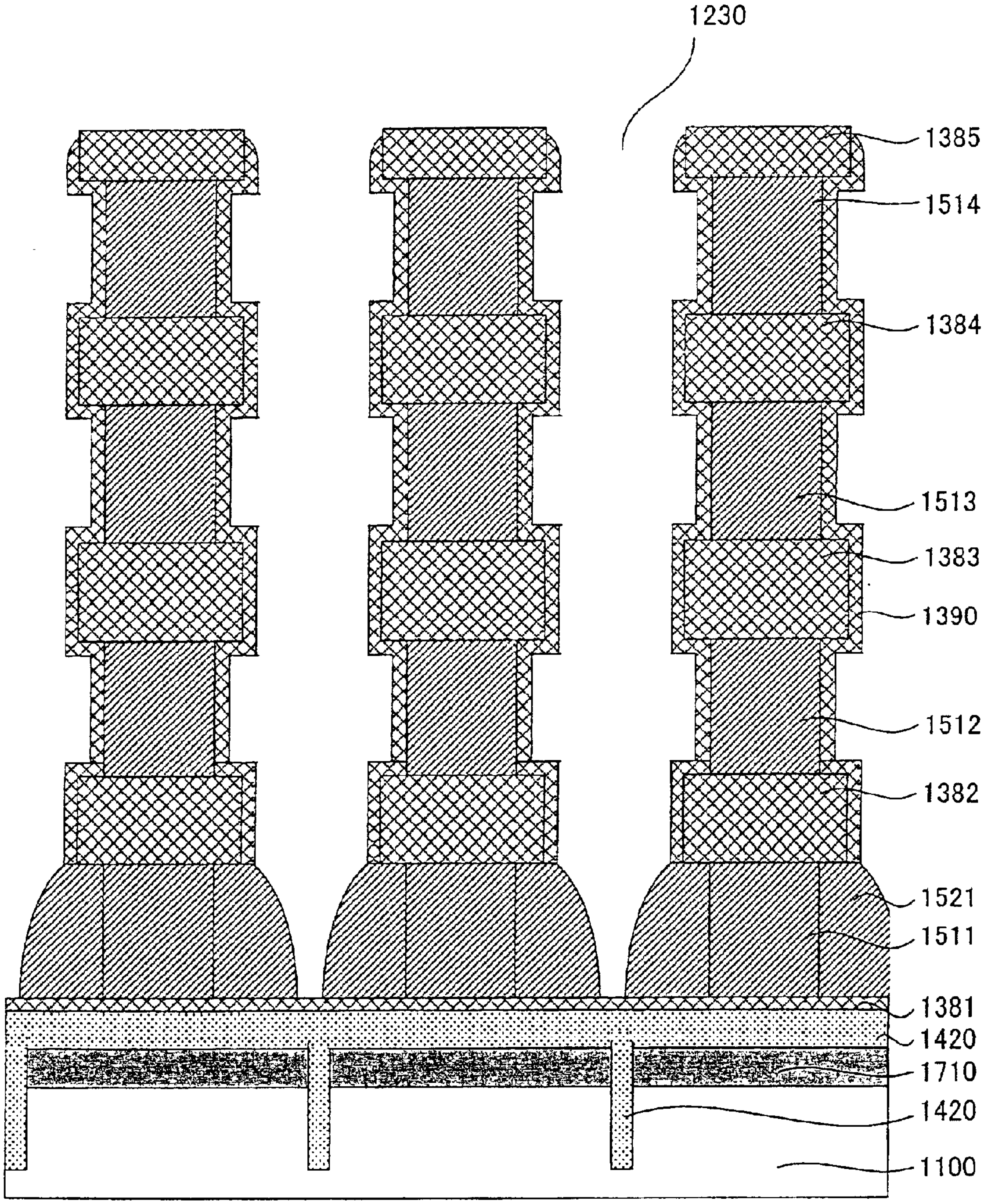

Fig. 1047
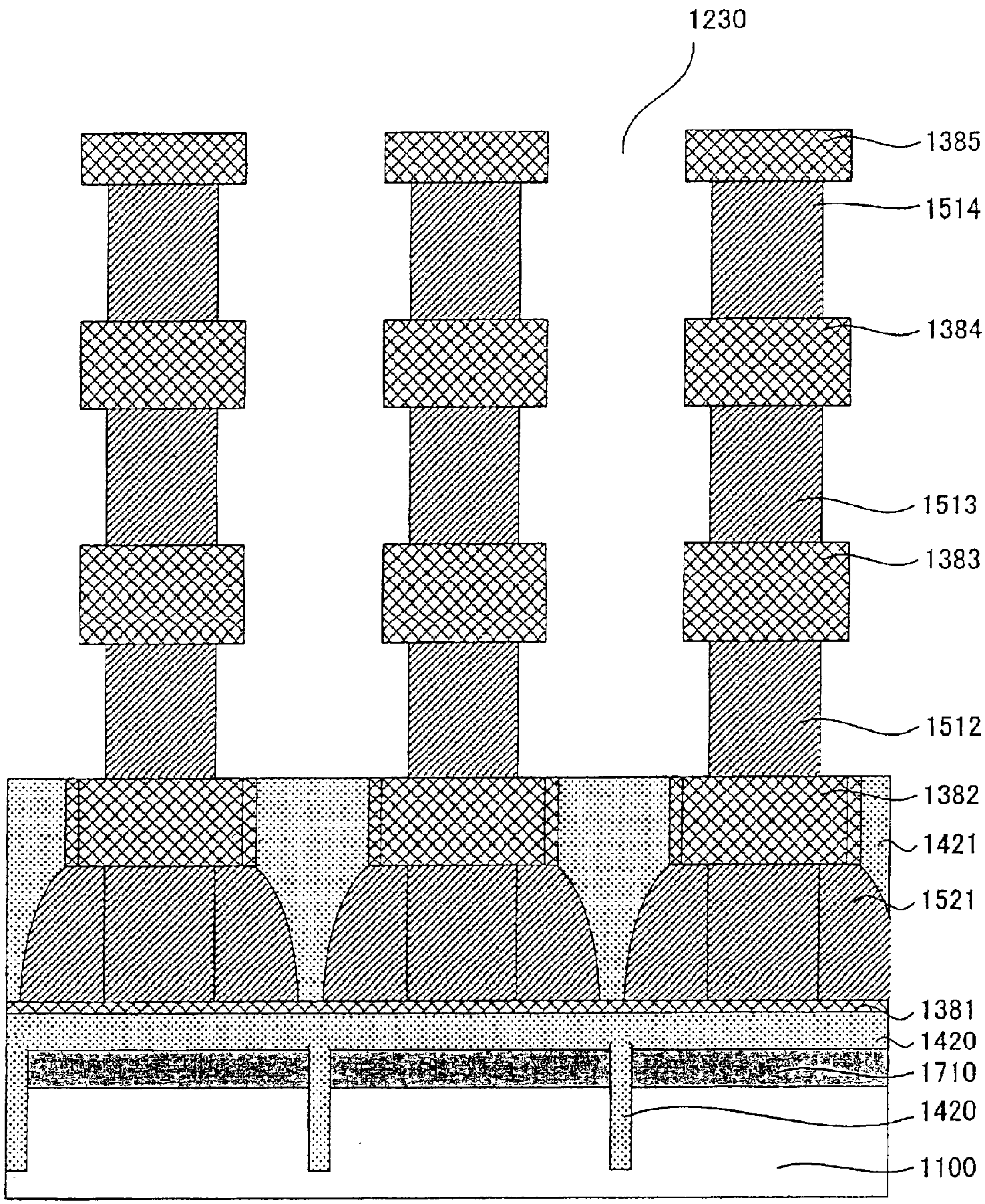

Fig. 1048
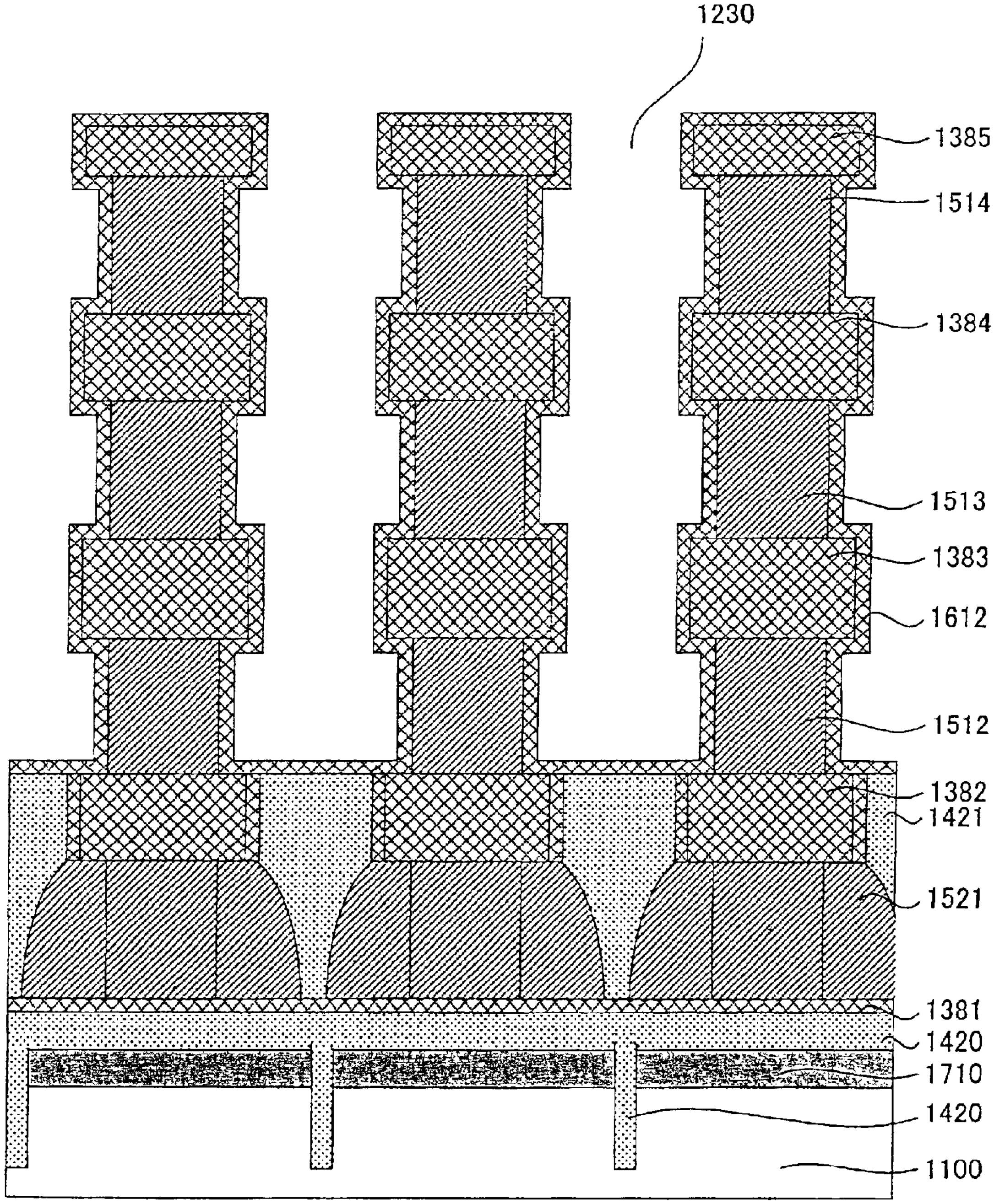

Fig. 1049
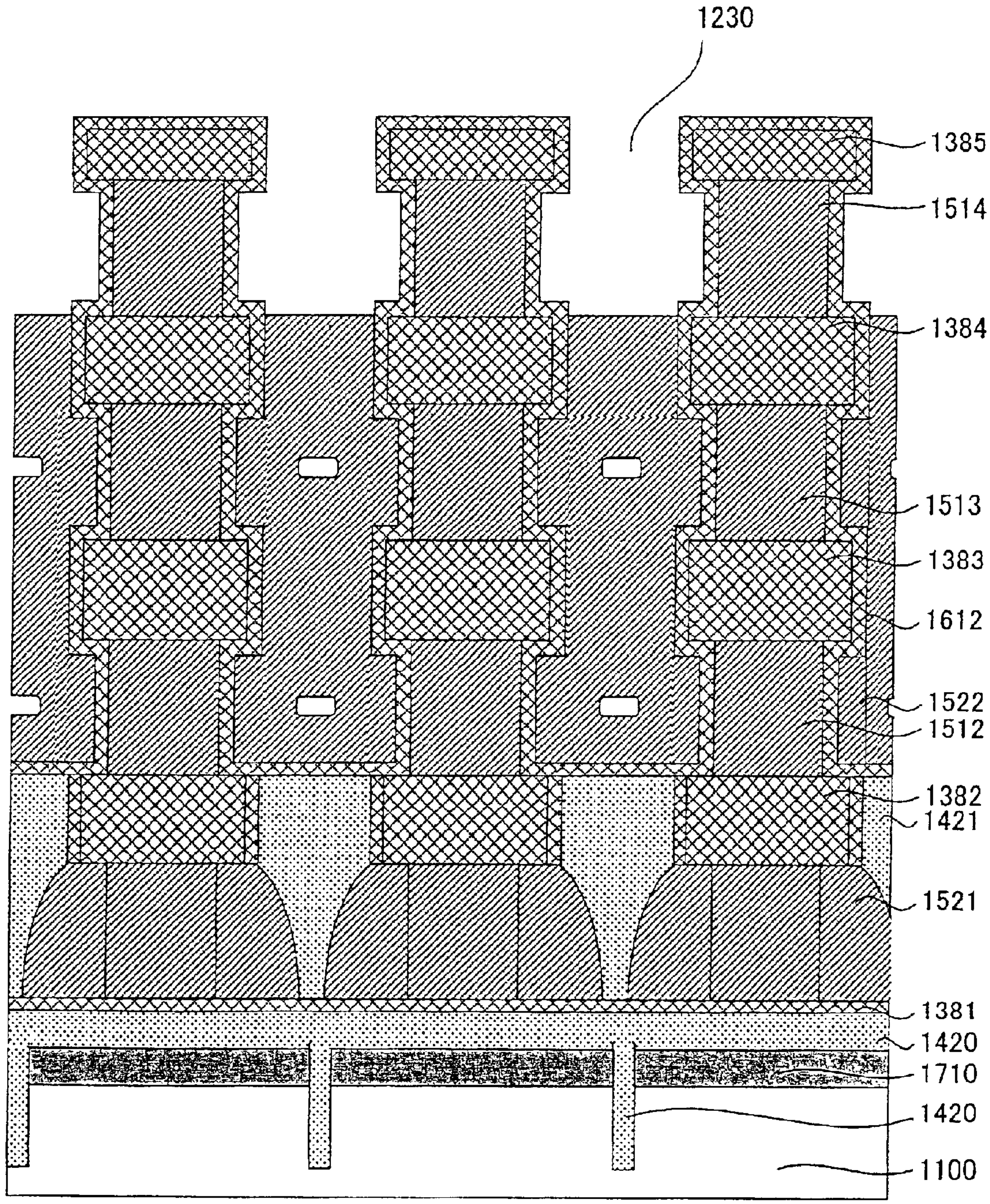

Fig. 1050
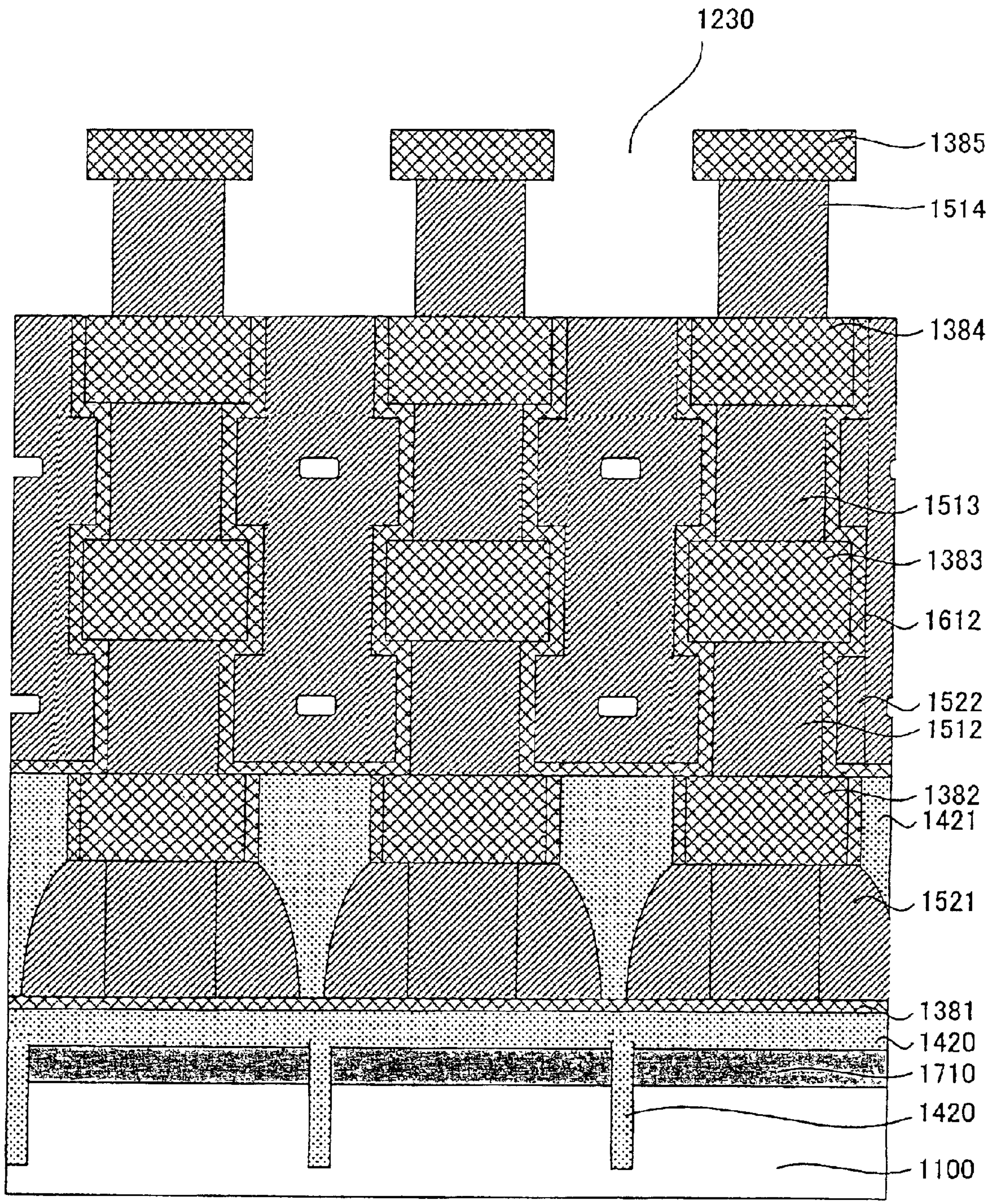

Fig. 1051
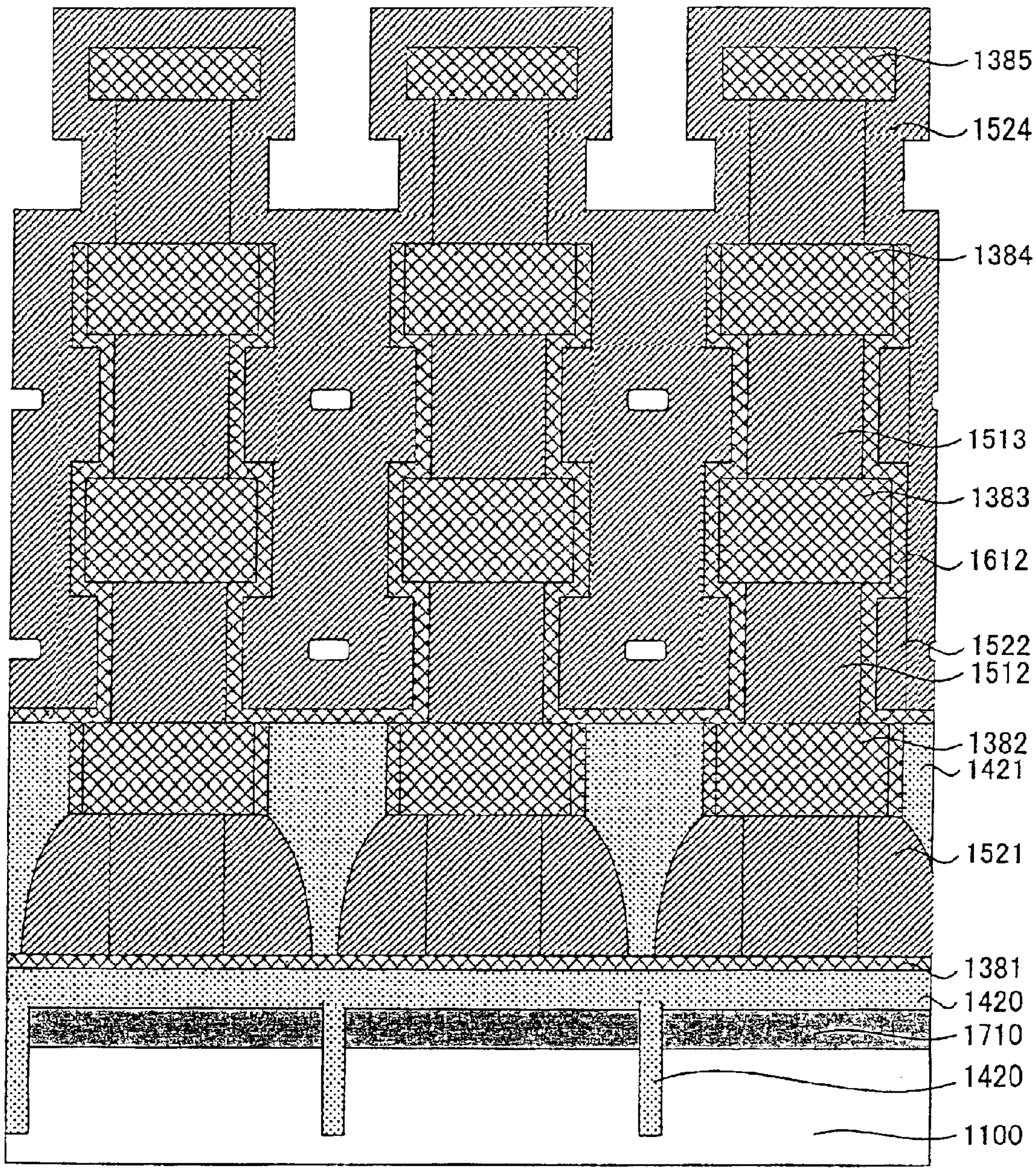

Fig. 1052
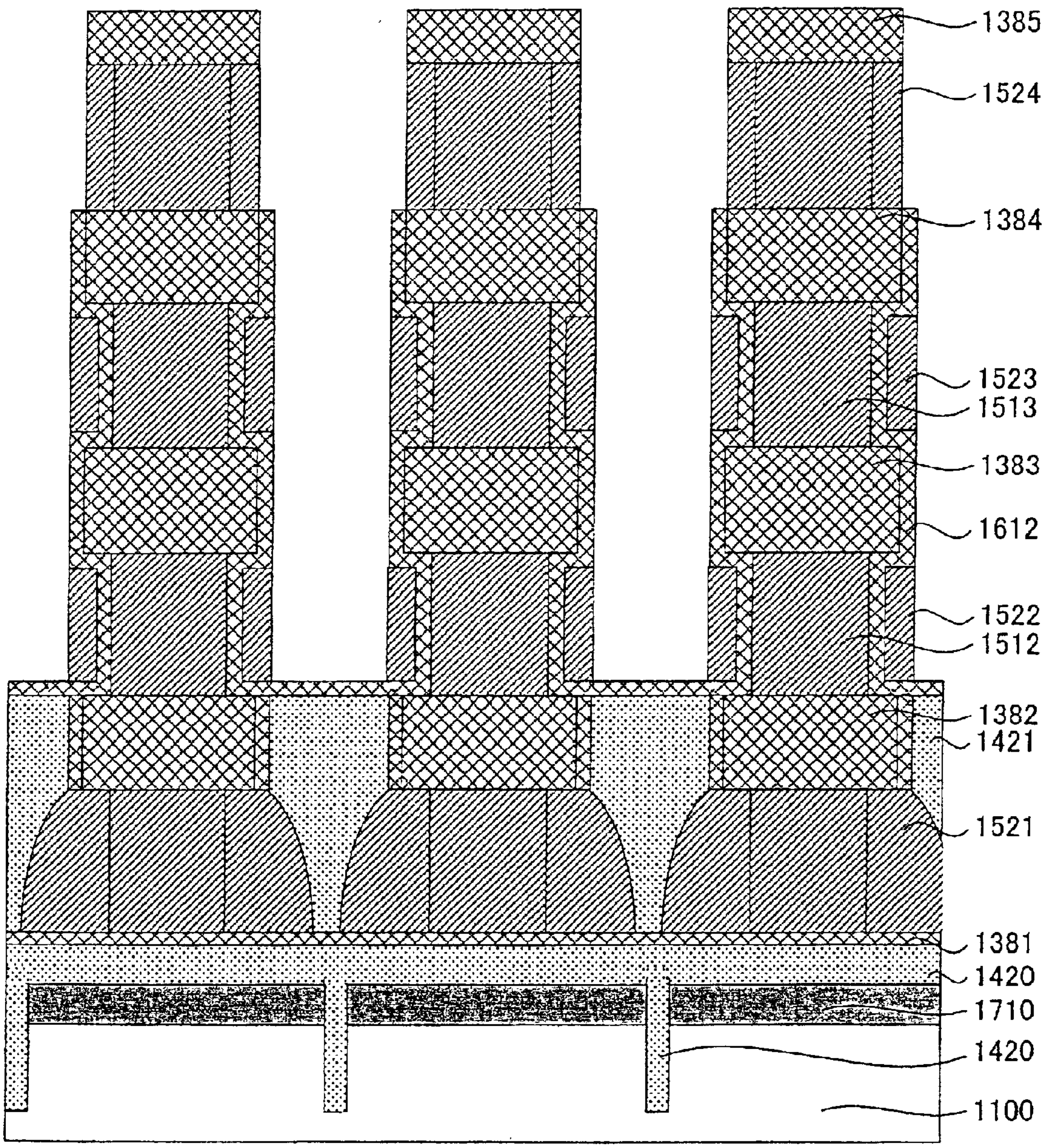

Fig. 1053
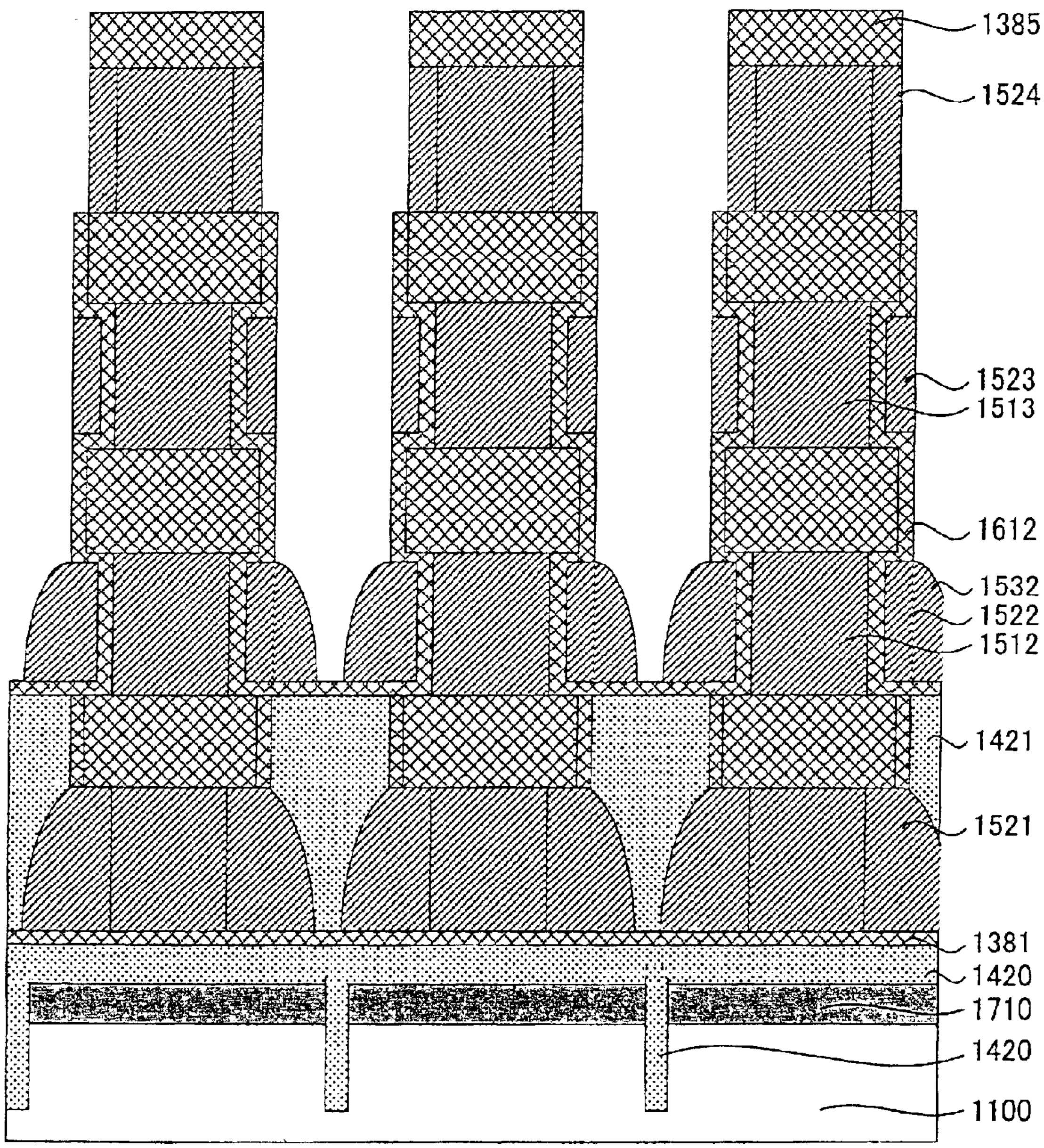

Fig. 1054
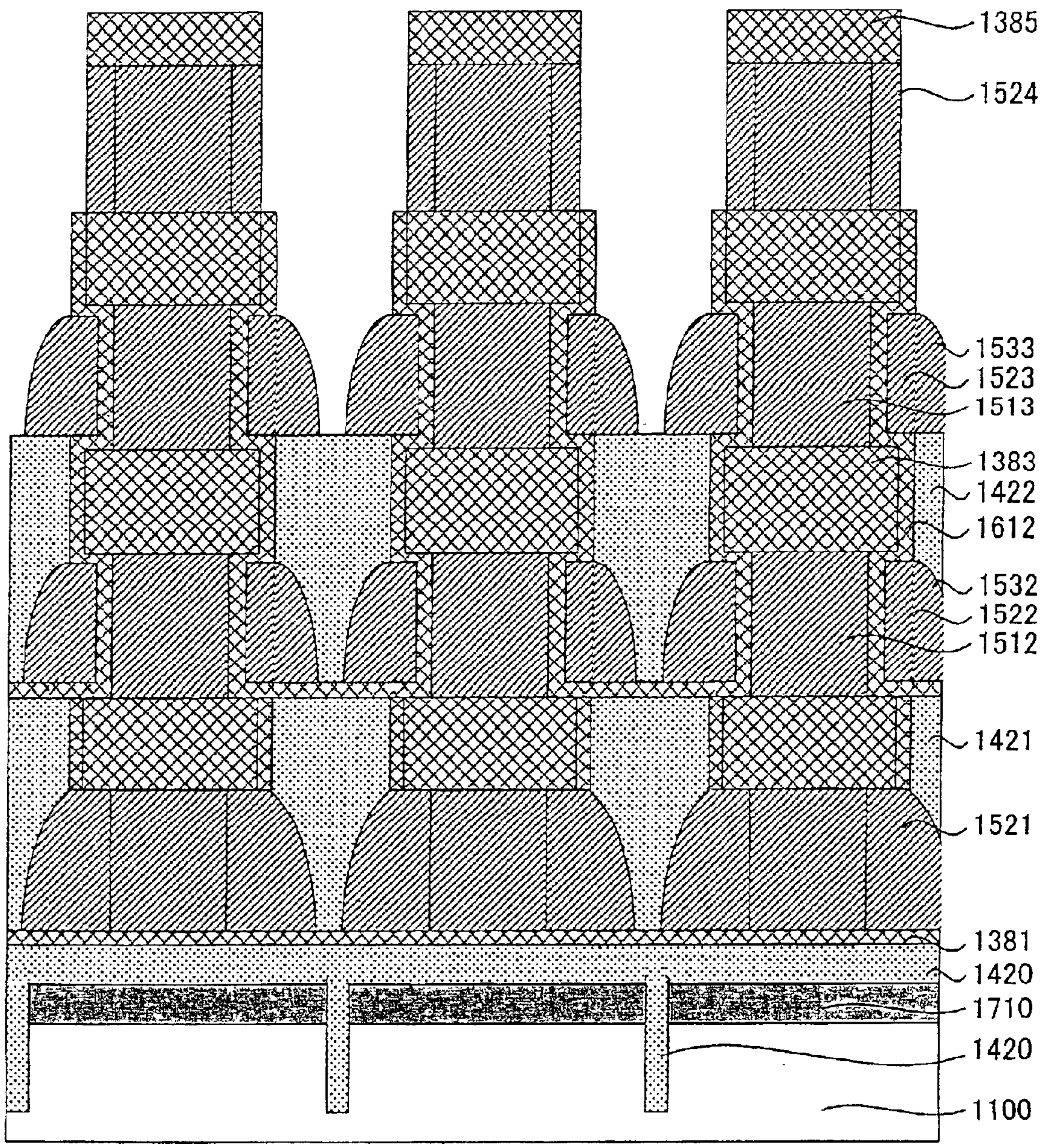

Fig. 1055
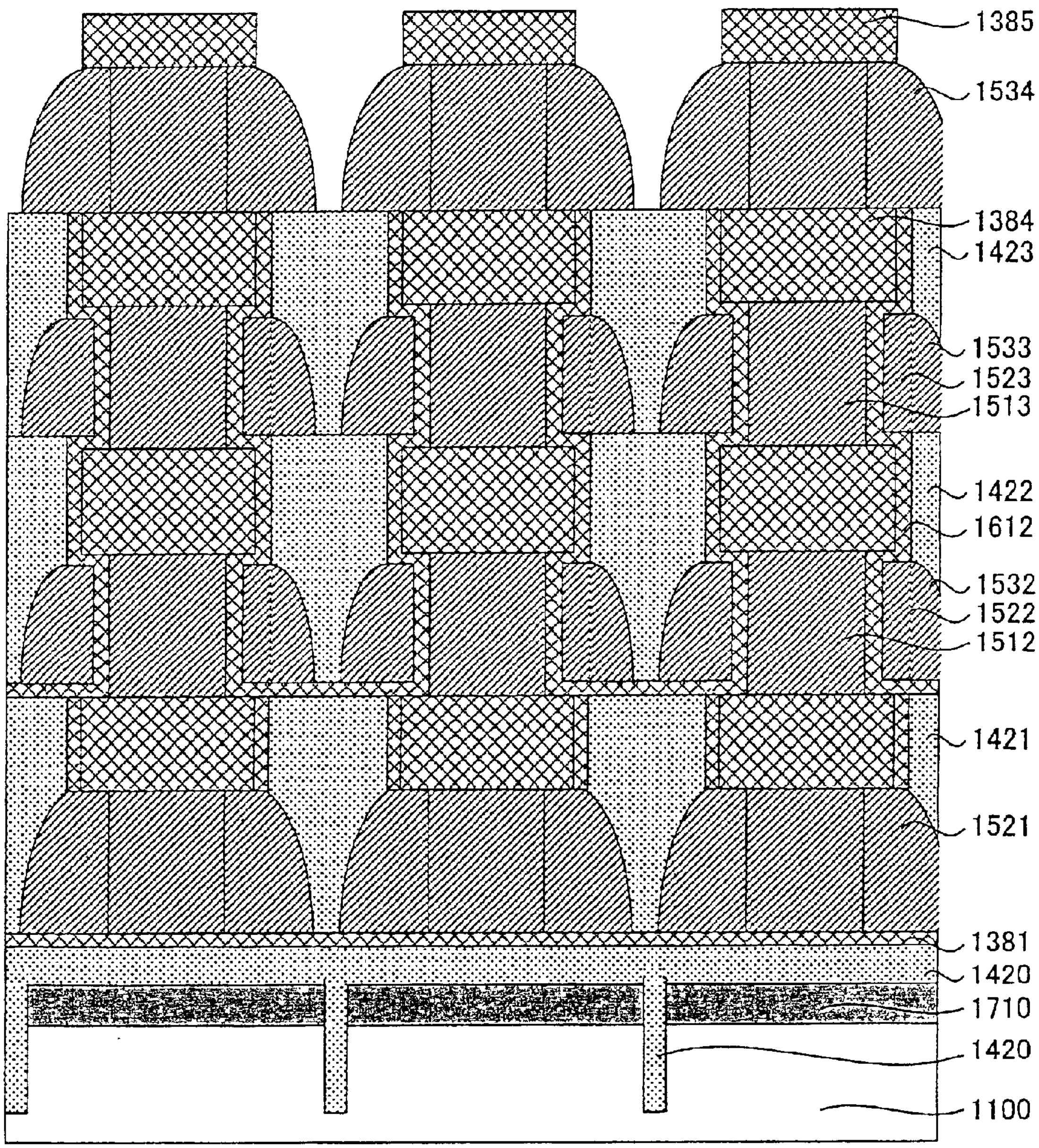

Fig. 1056
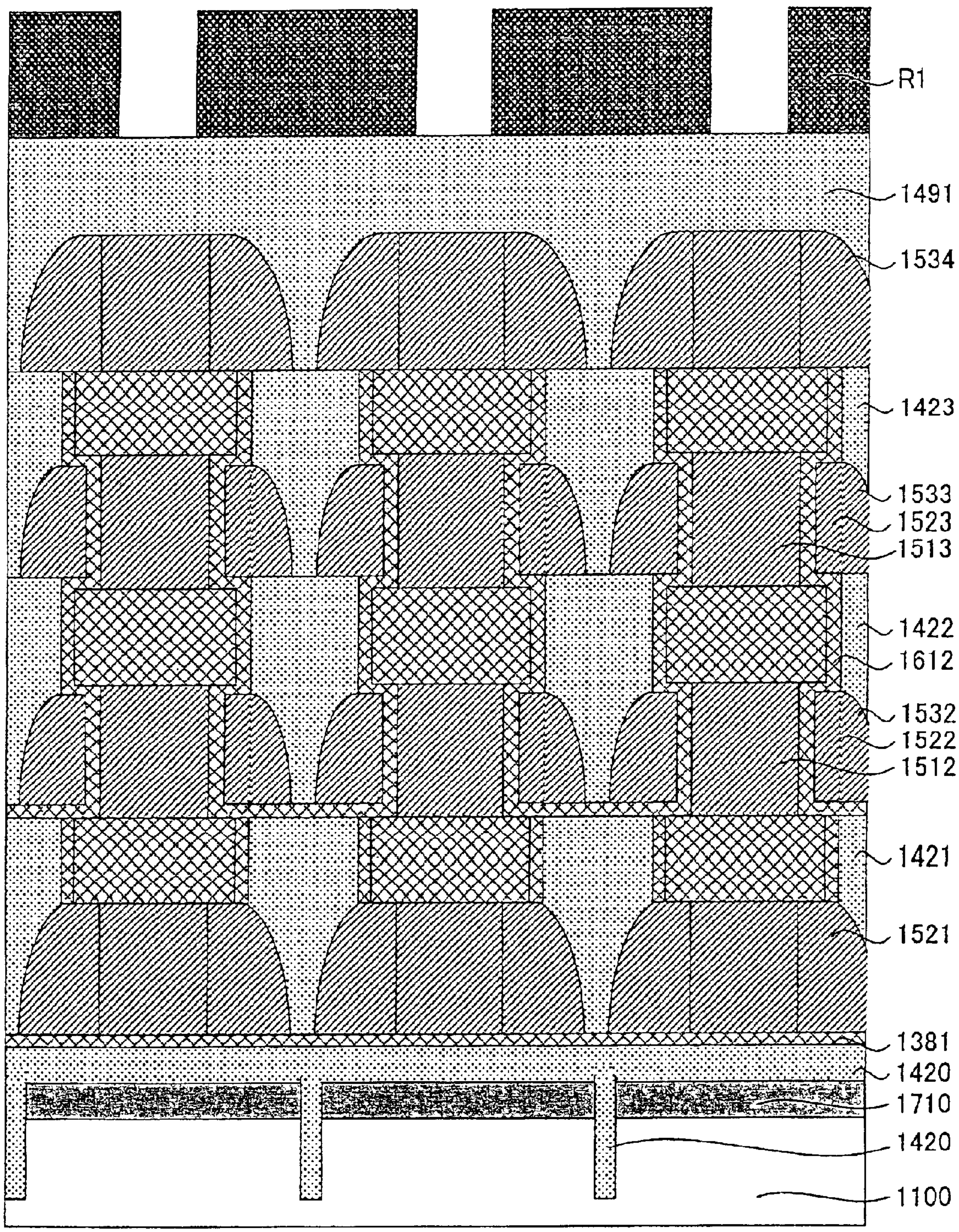

Fig. 1057
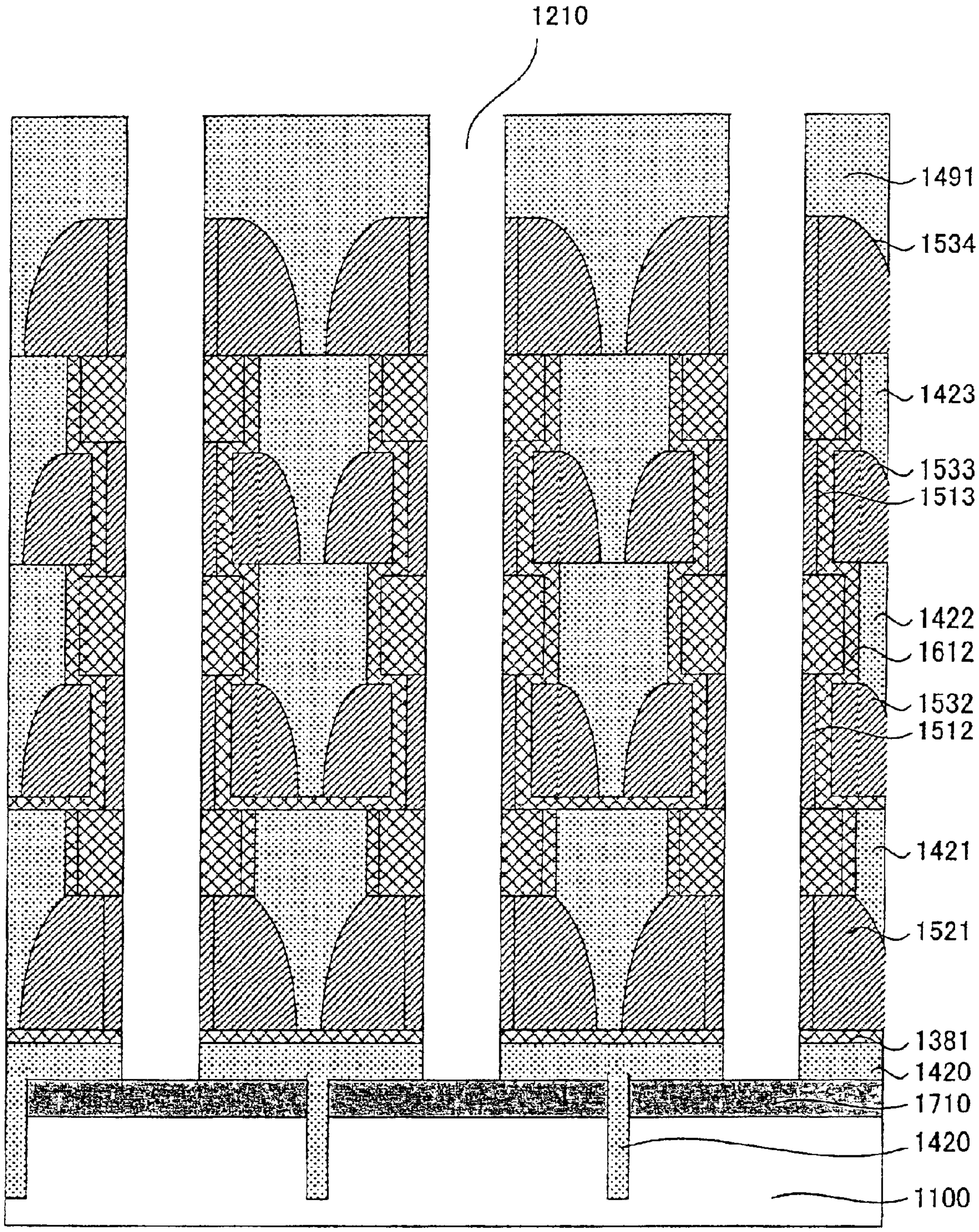

Fig. 1058
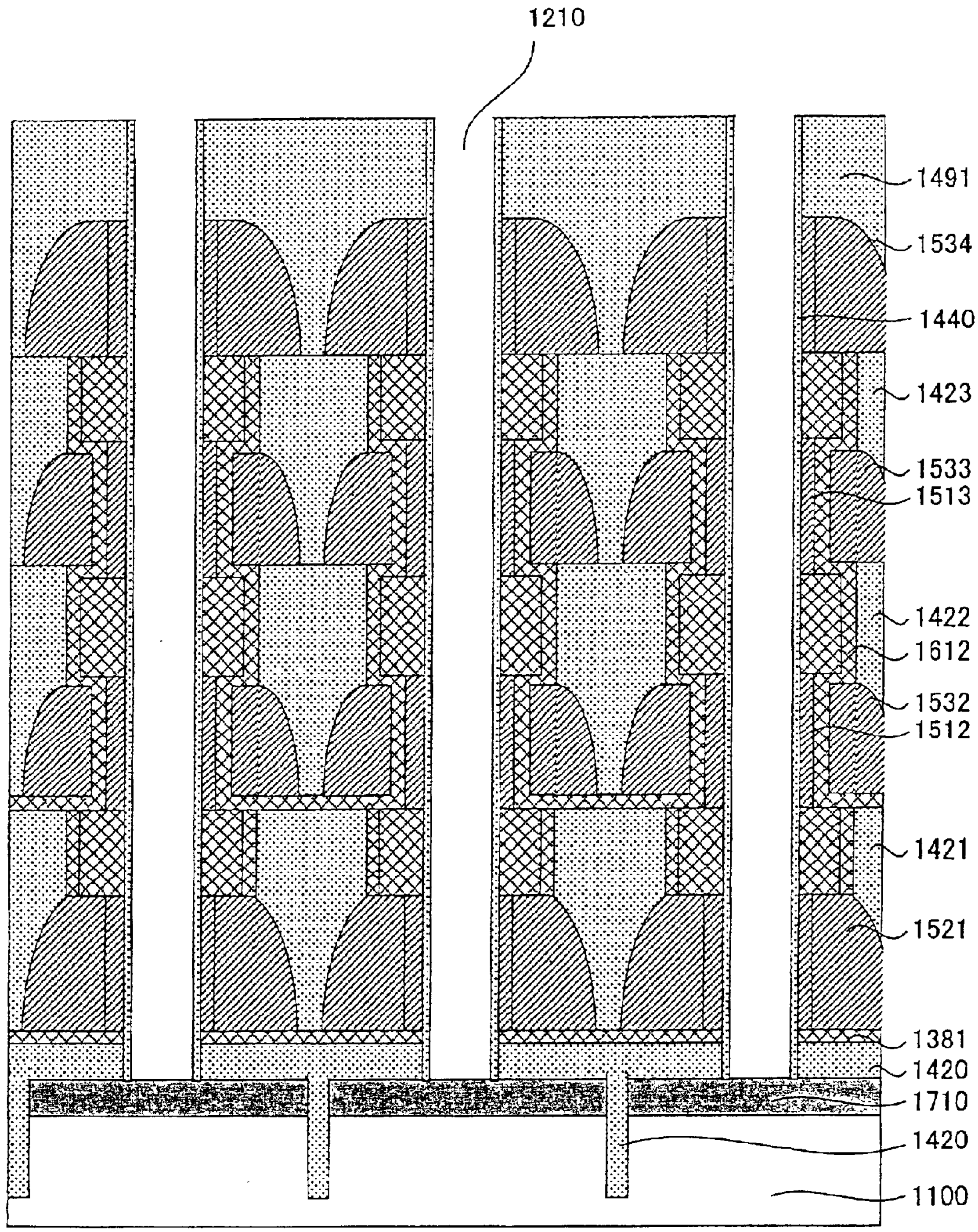

Fig. 1059
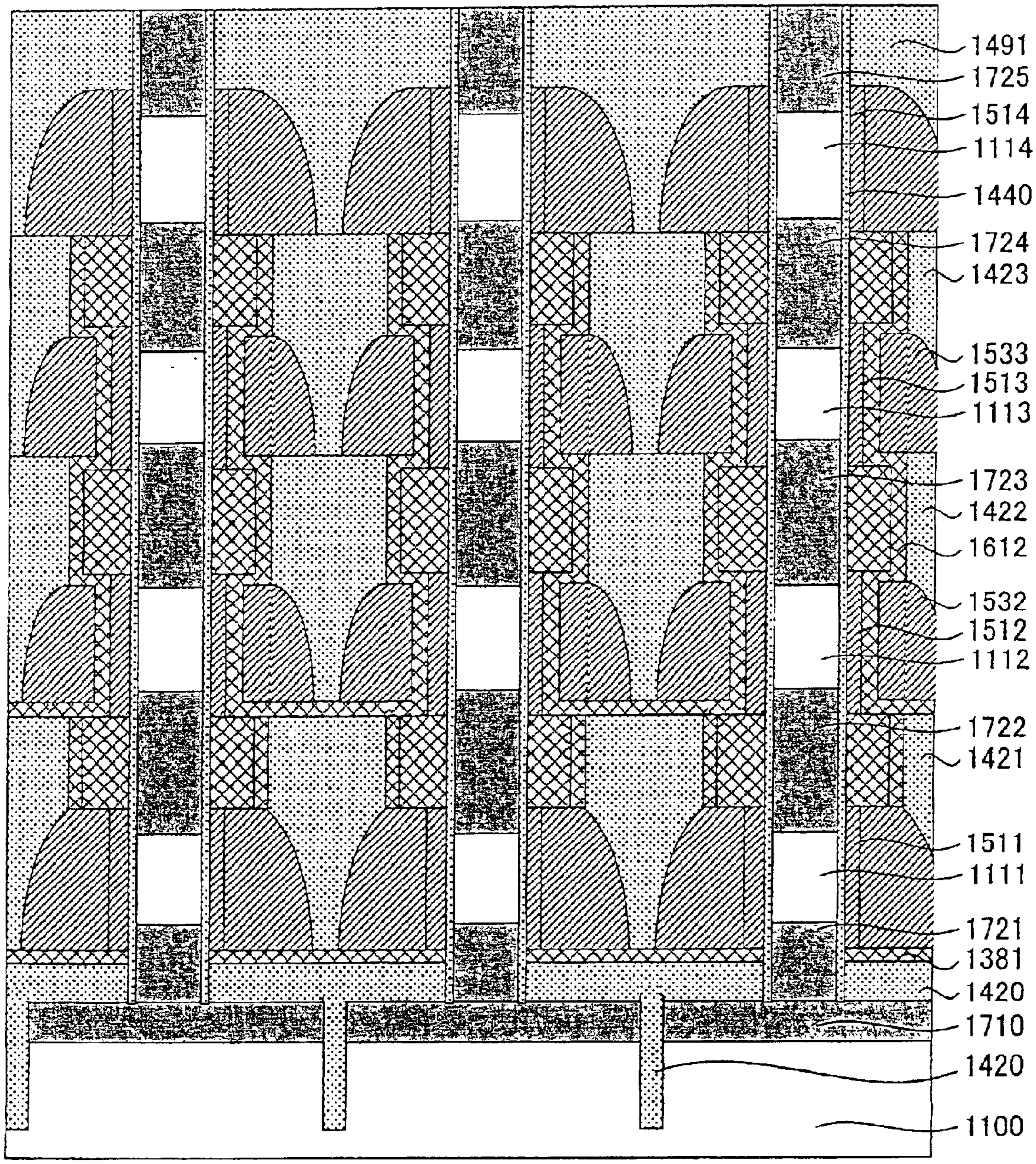

Fig. 1060
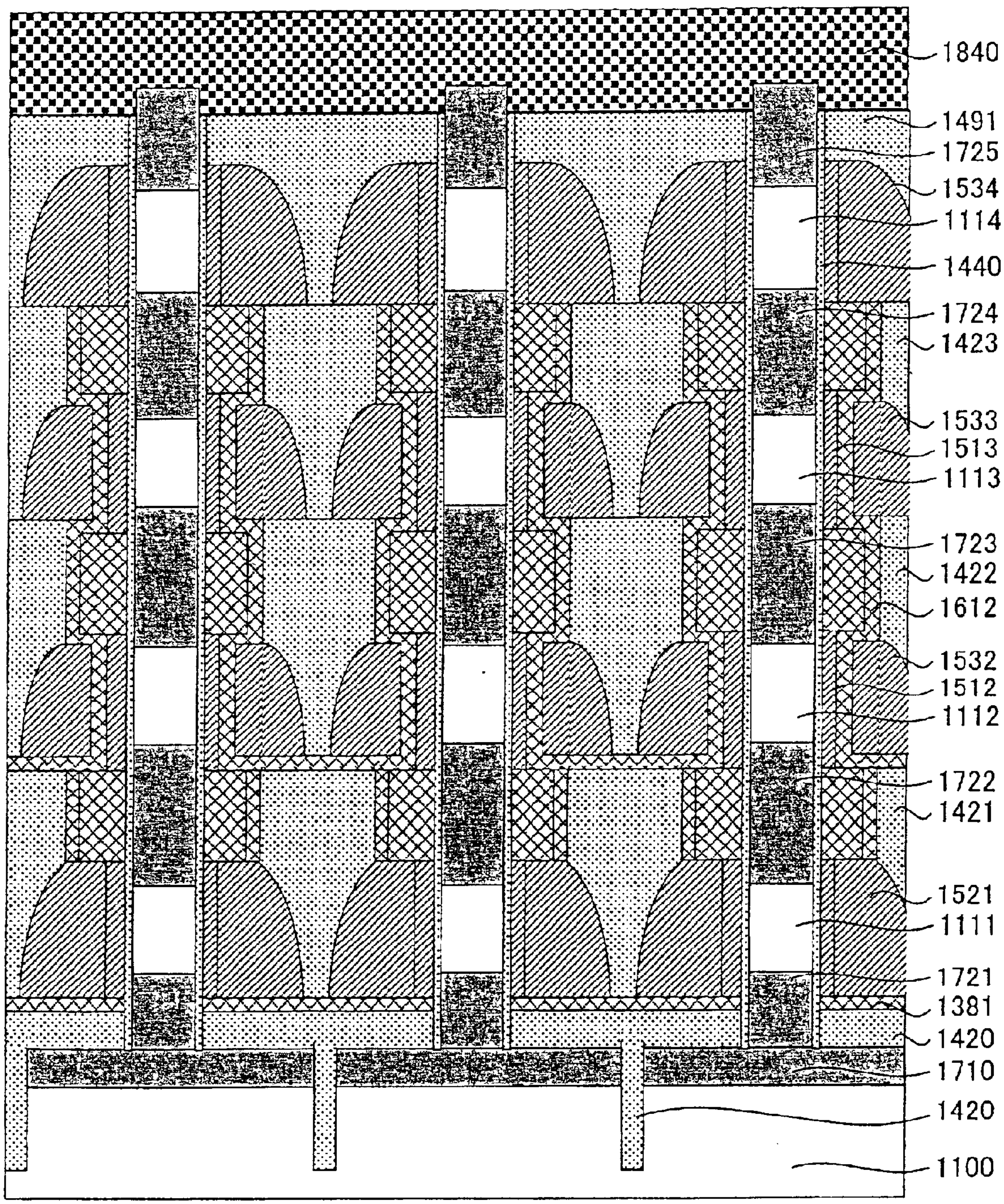

Fig. 1061
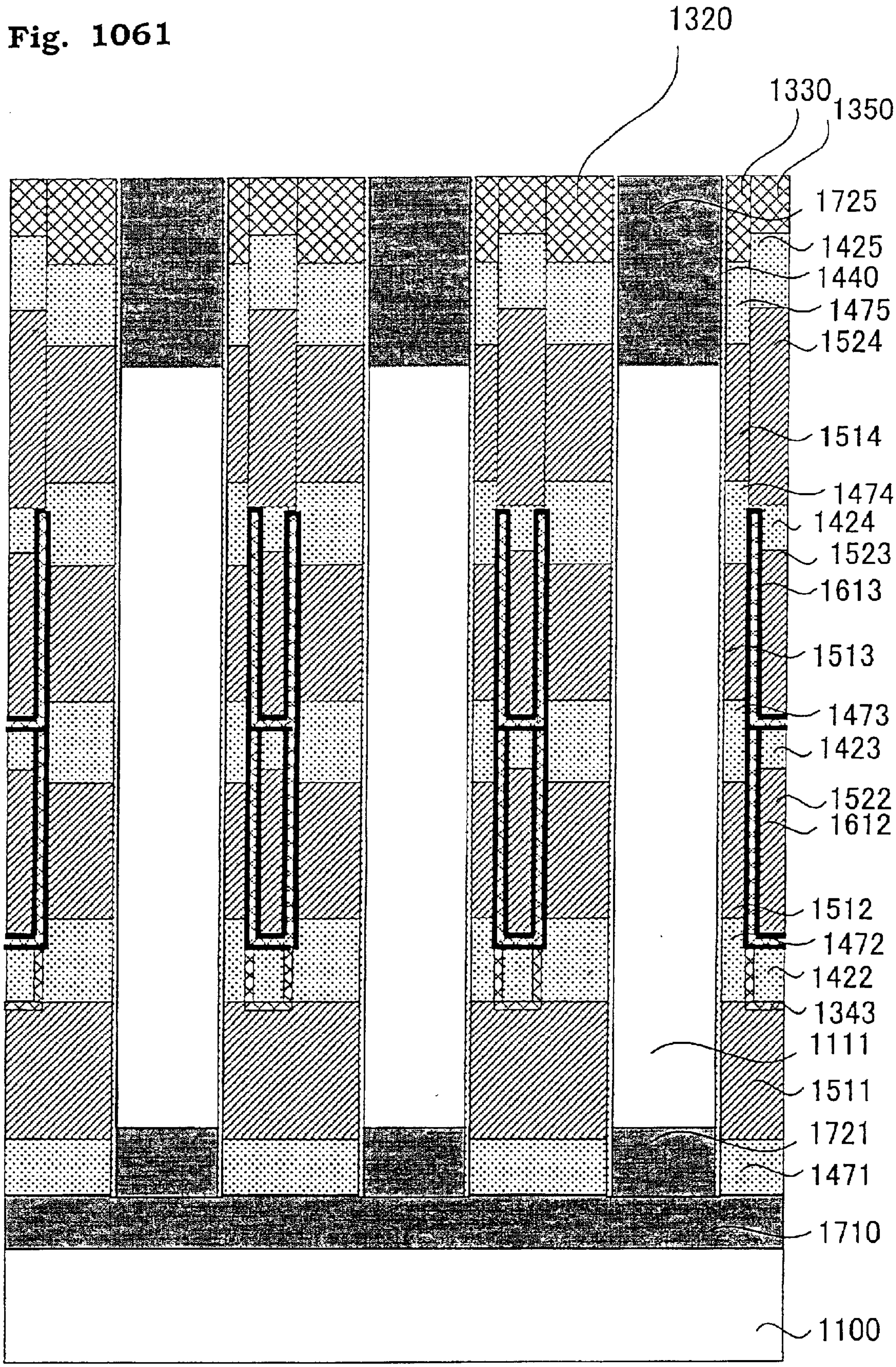

Fig. 1062
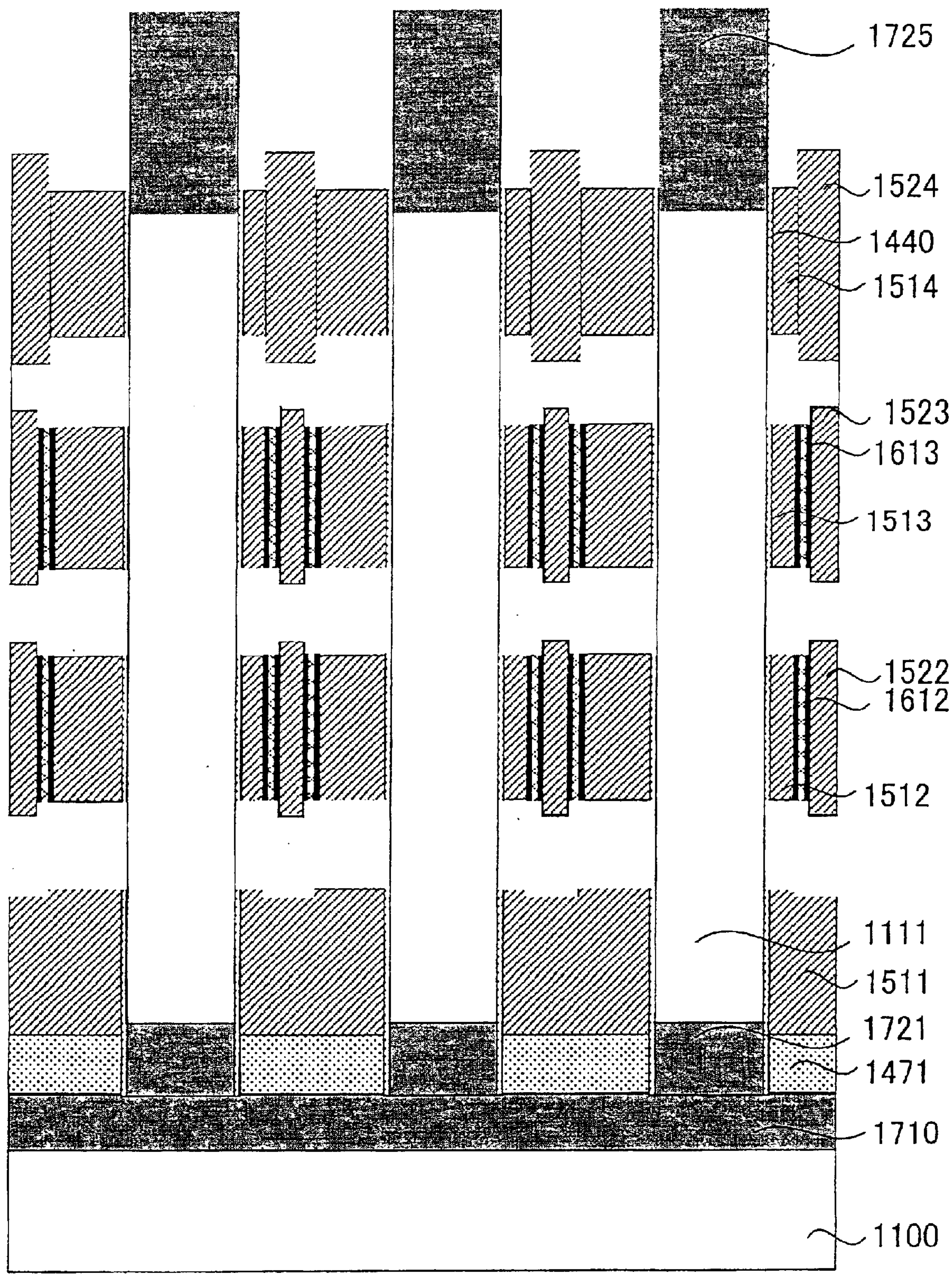

Fig. 1063
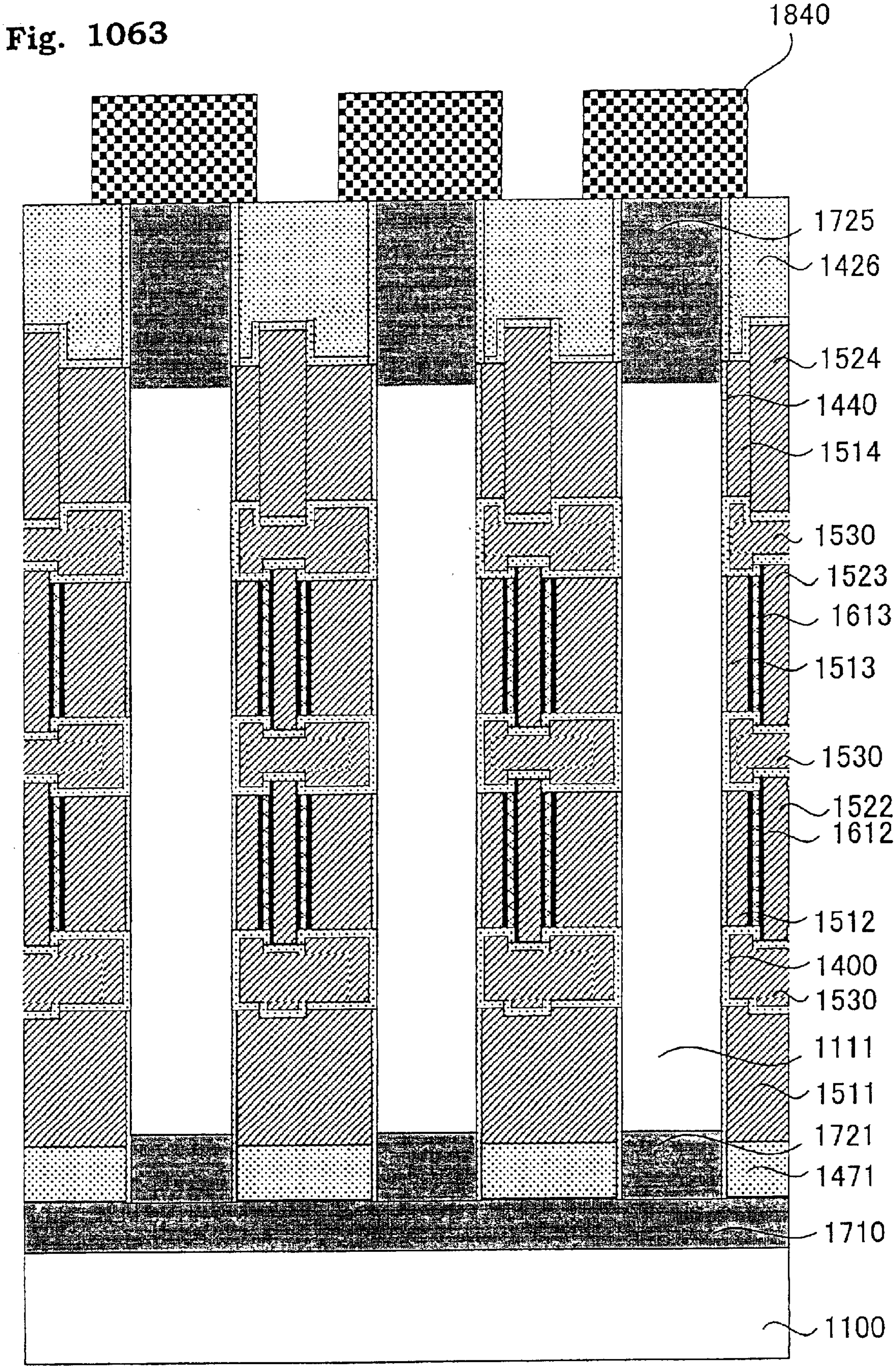

Fig. 1064
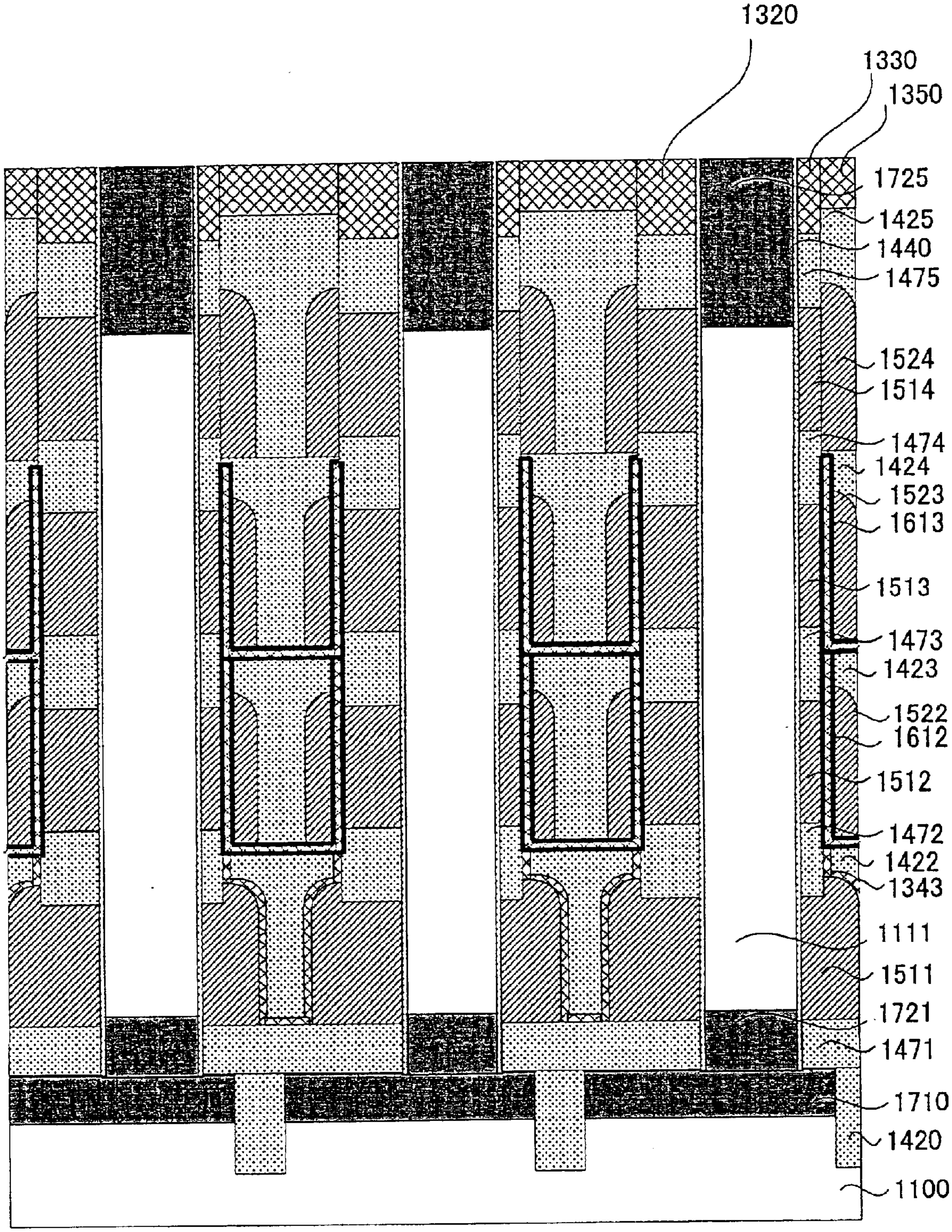

Fig. 1065
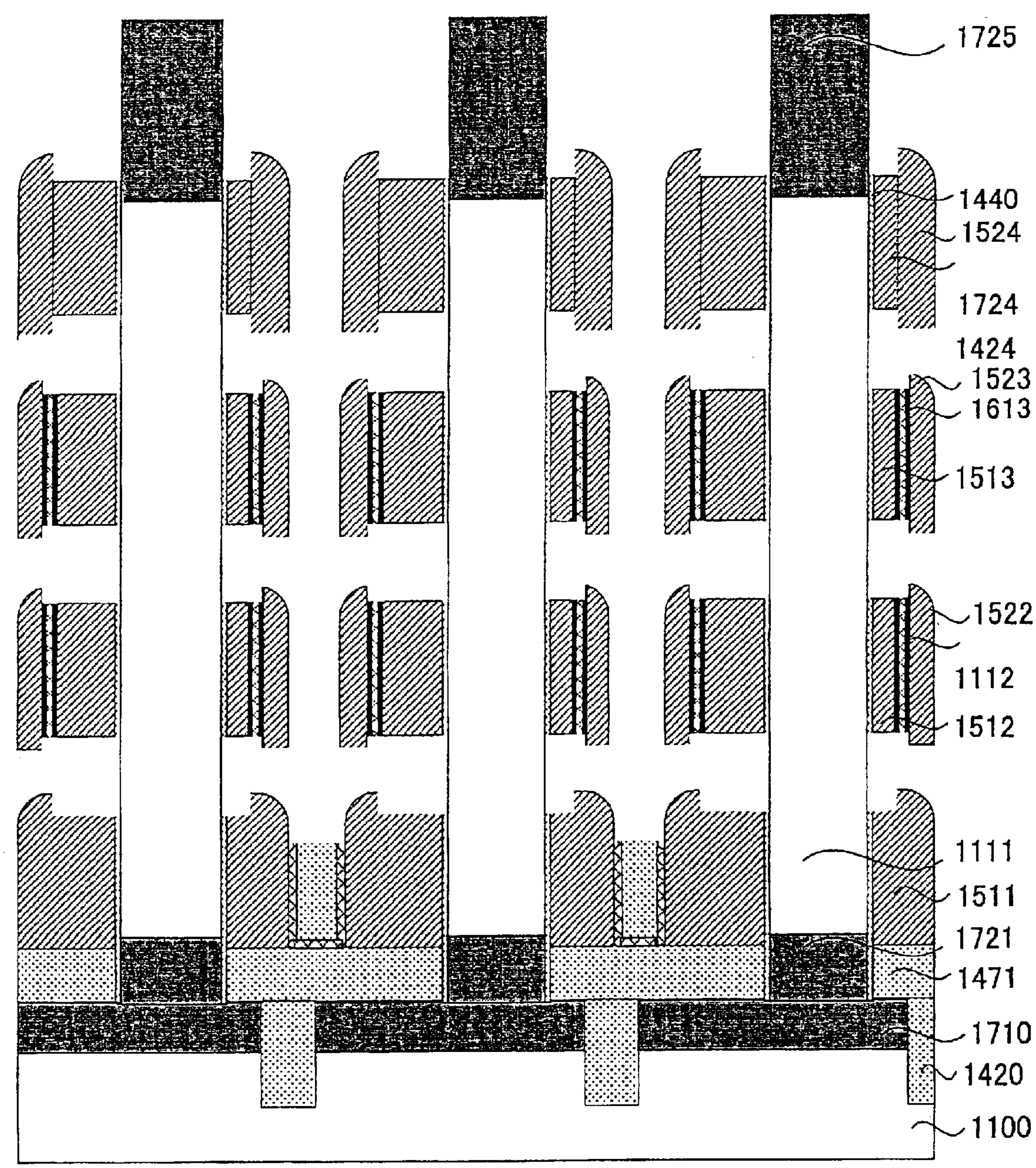

Fig. 1066
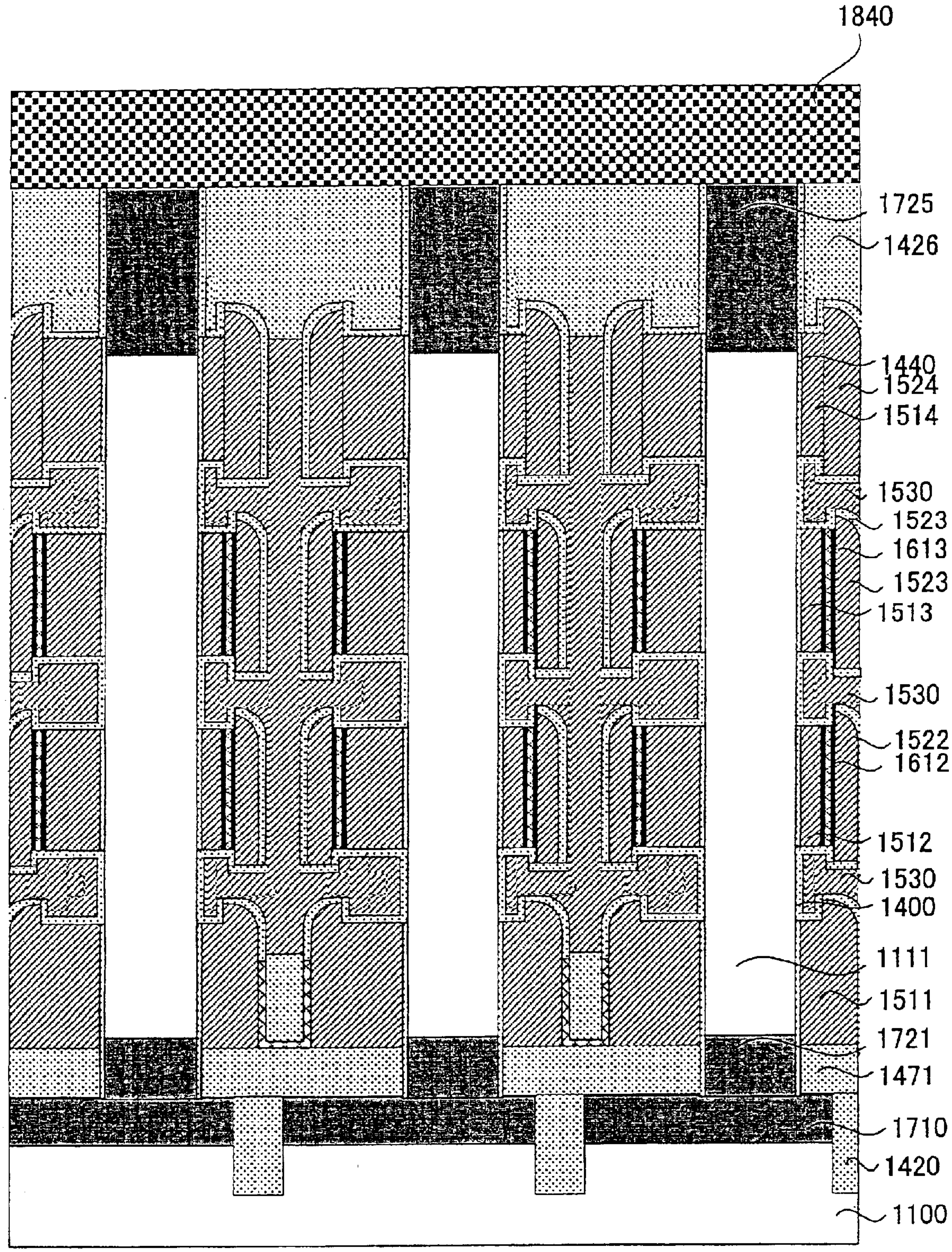

Fig. 1067
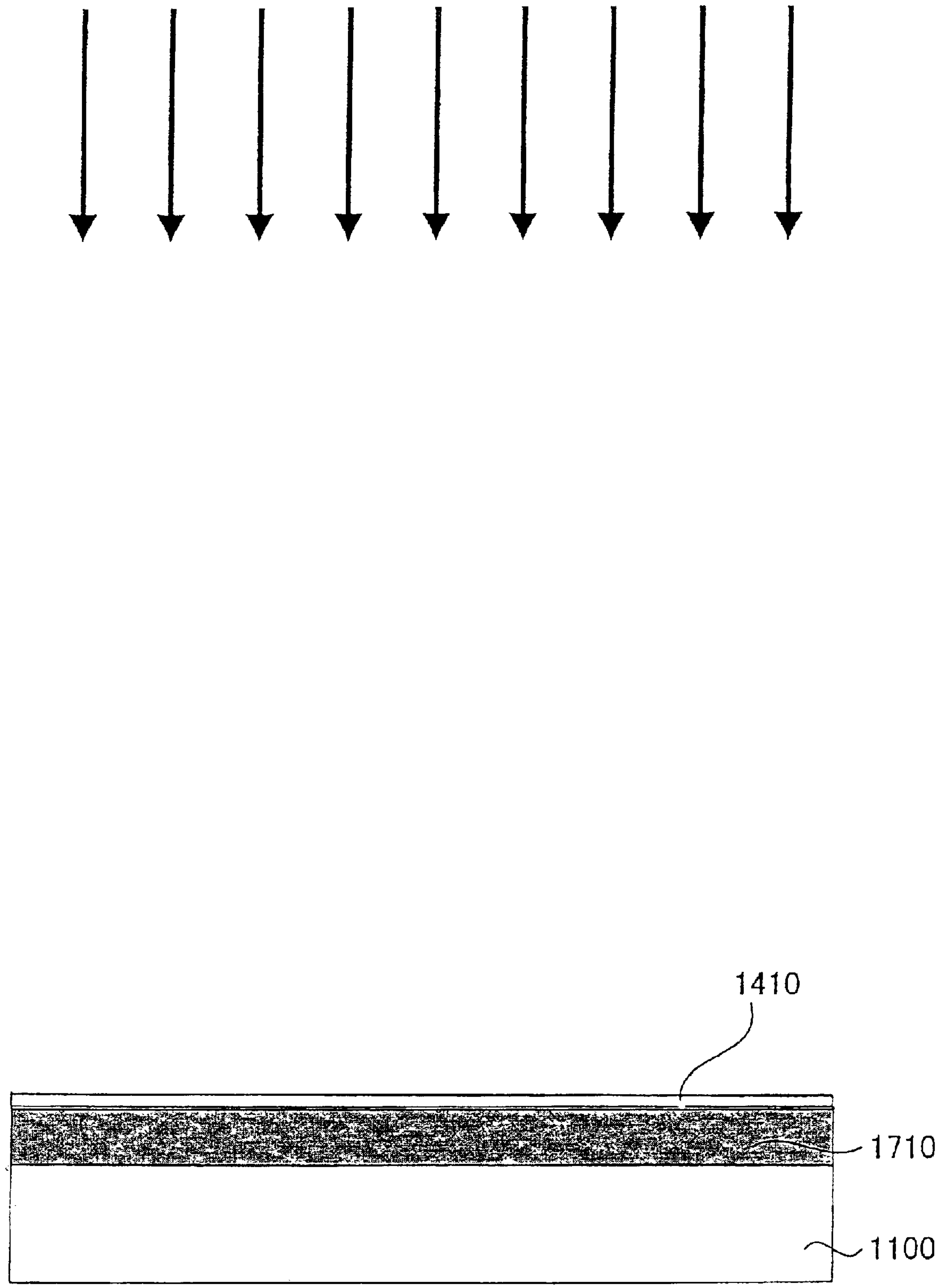

Fig. 1068
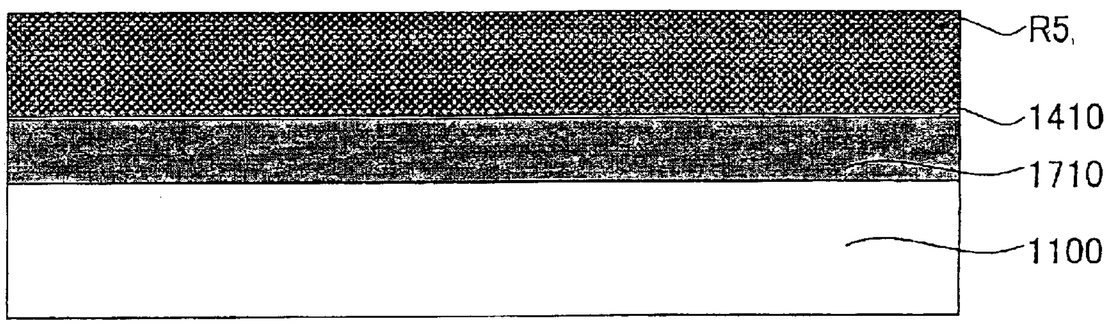
Fig. 1069
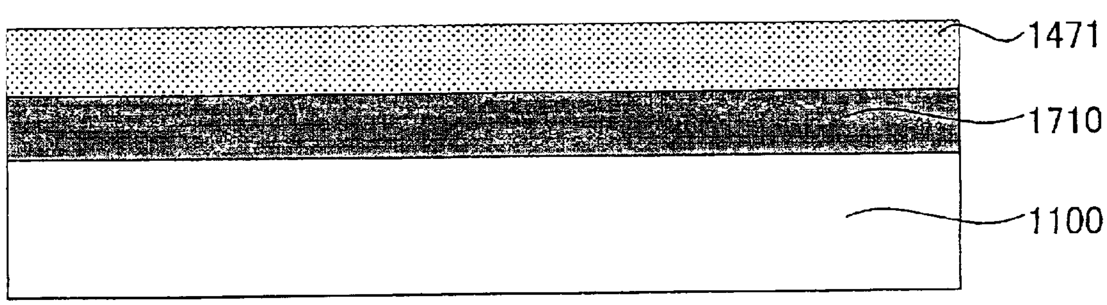

Fig. 1070
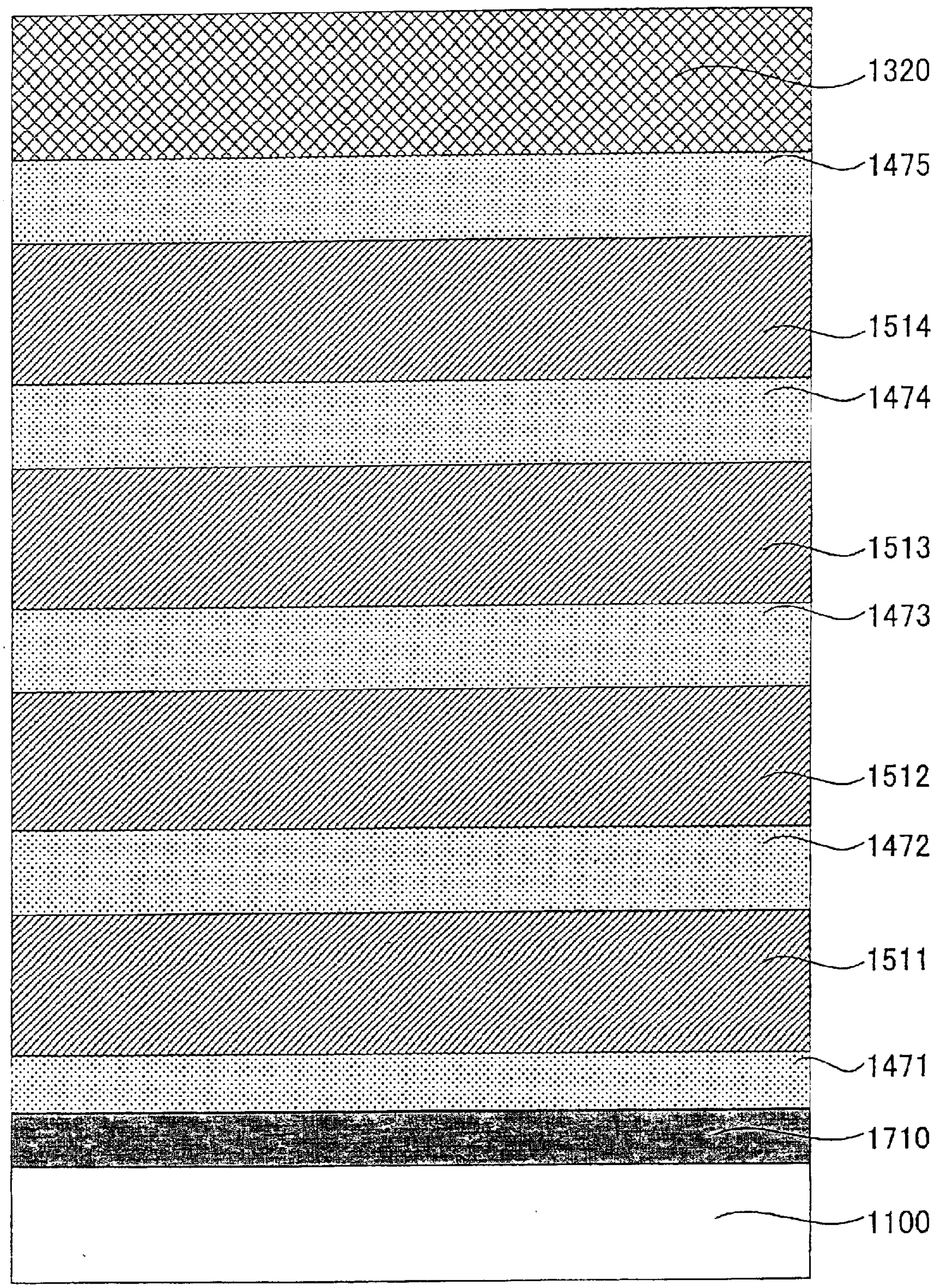

Fig. 1071
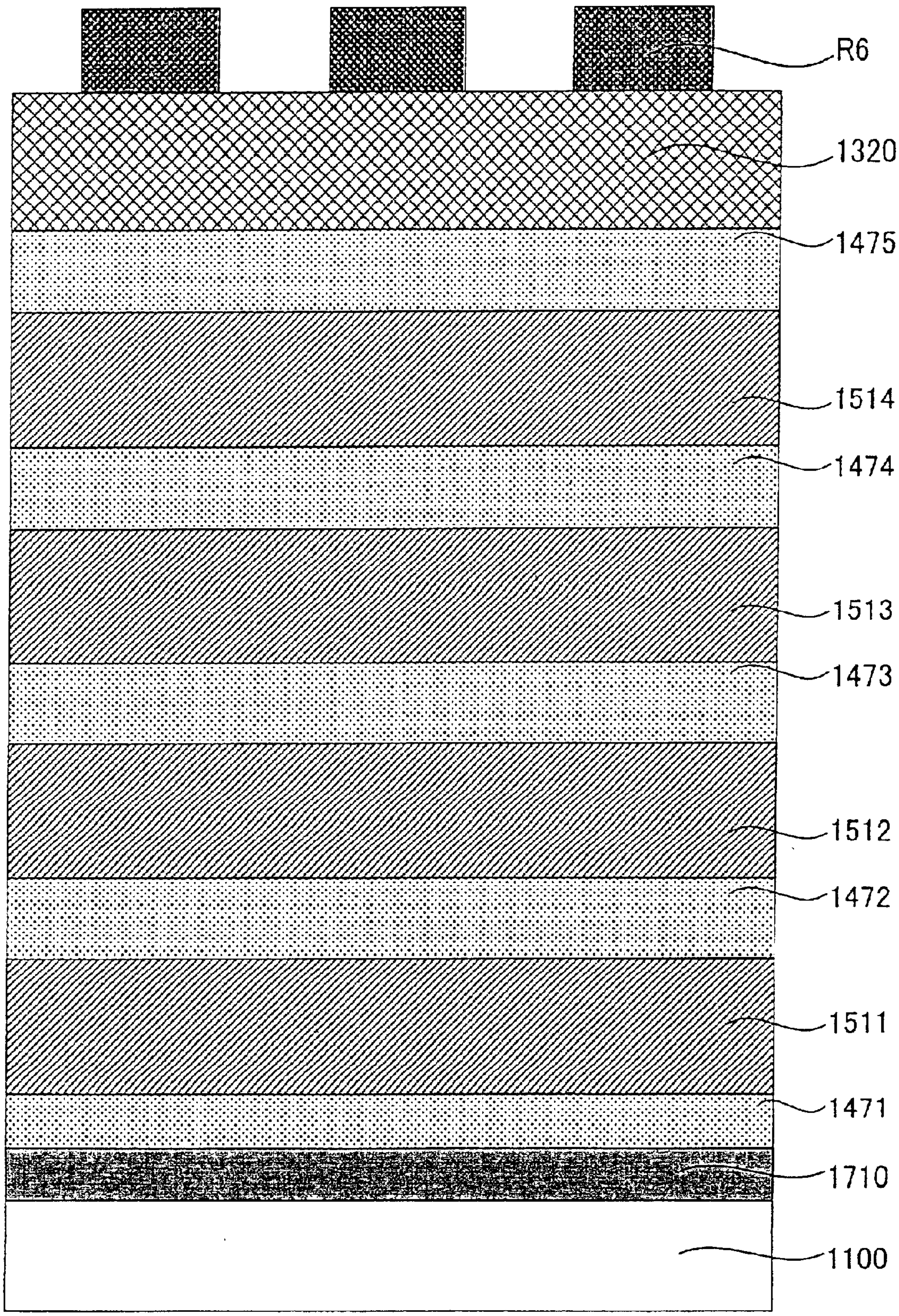

Fig. 1072
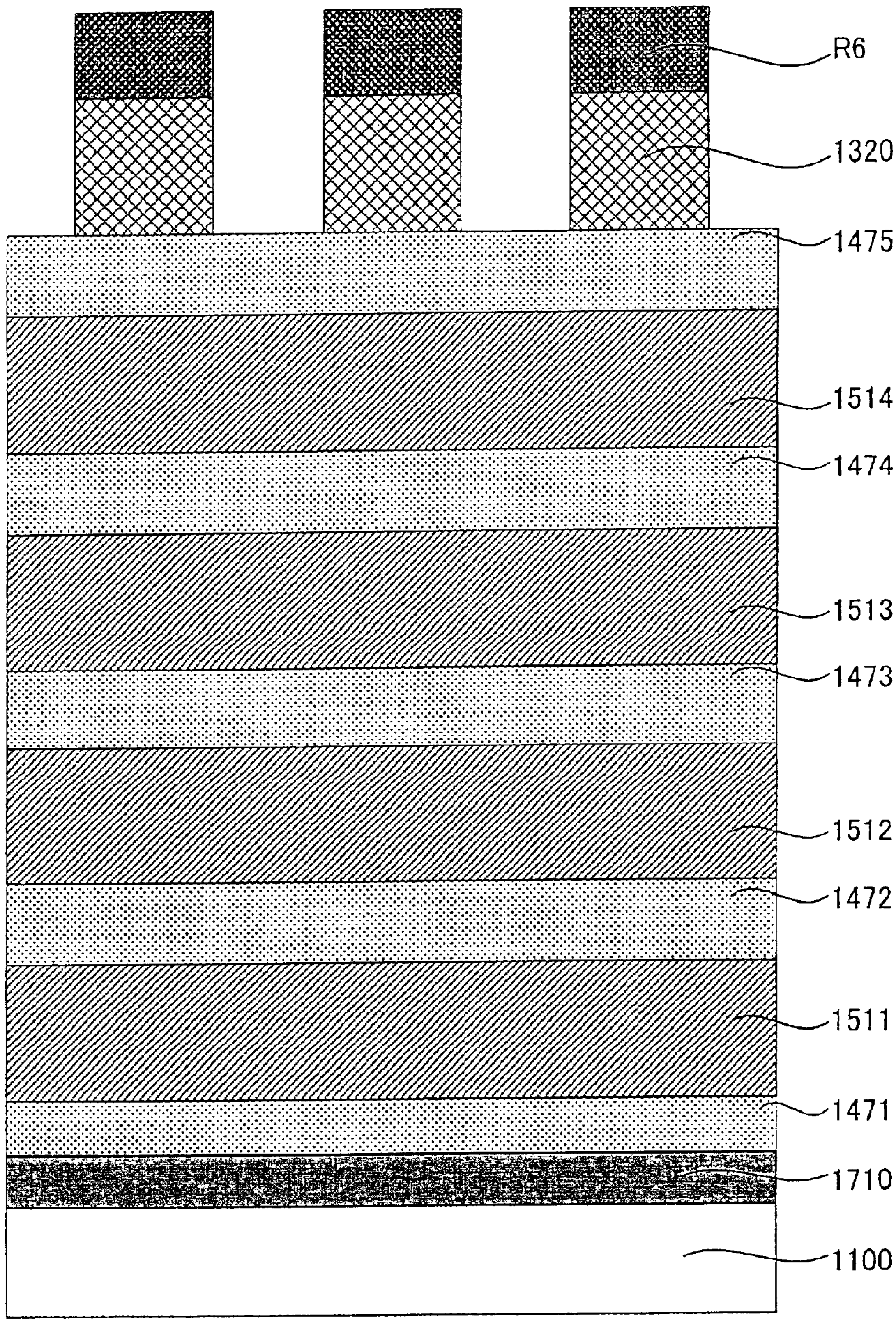

Fig. 1073
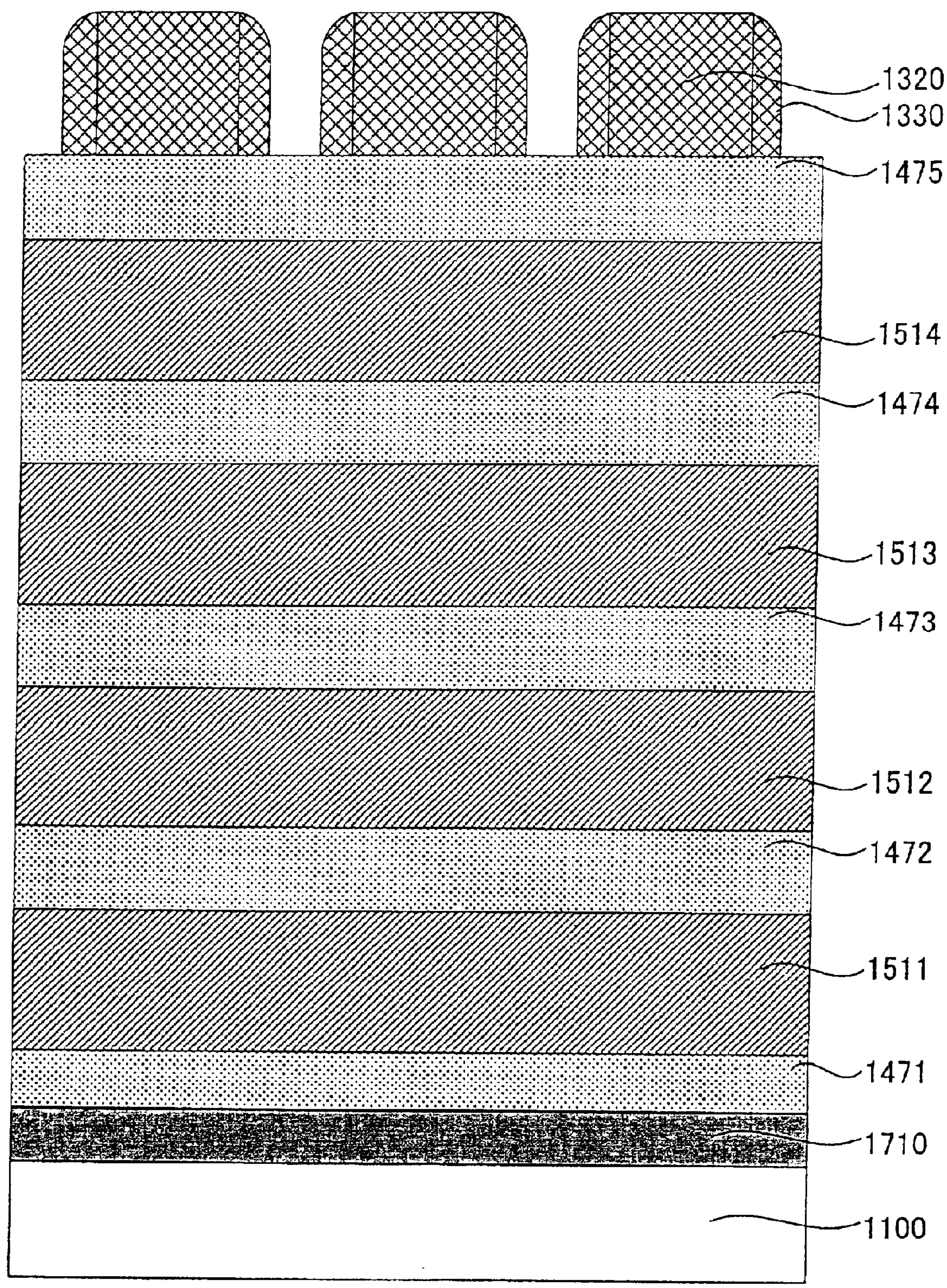

Fig. 1074
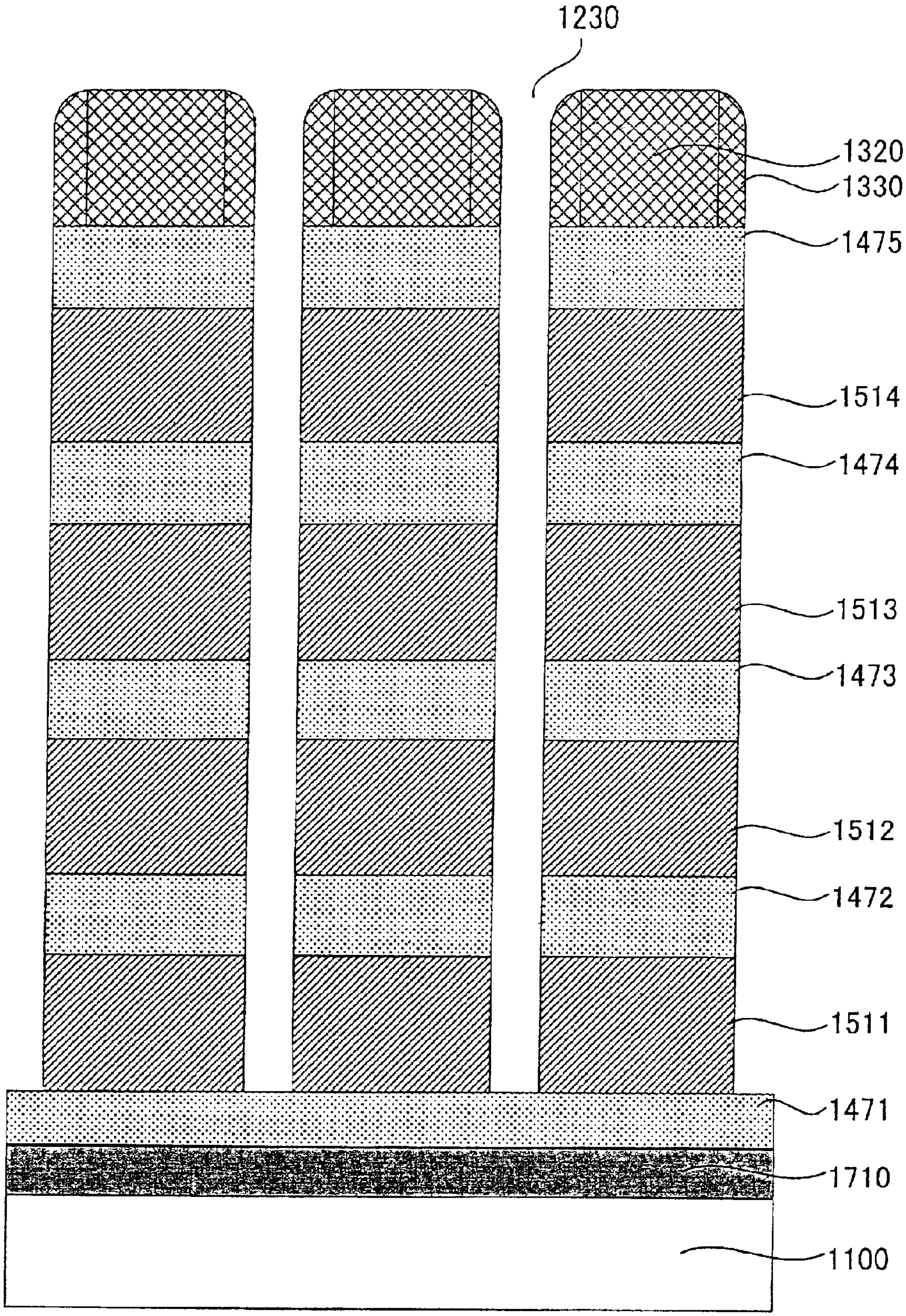

Fig. 1075
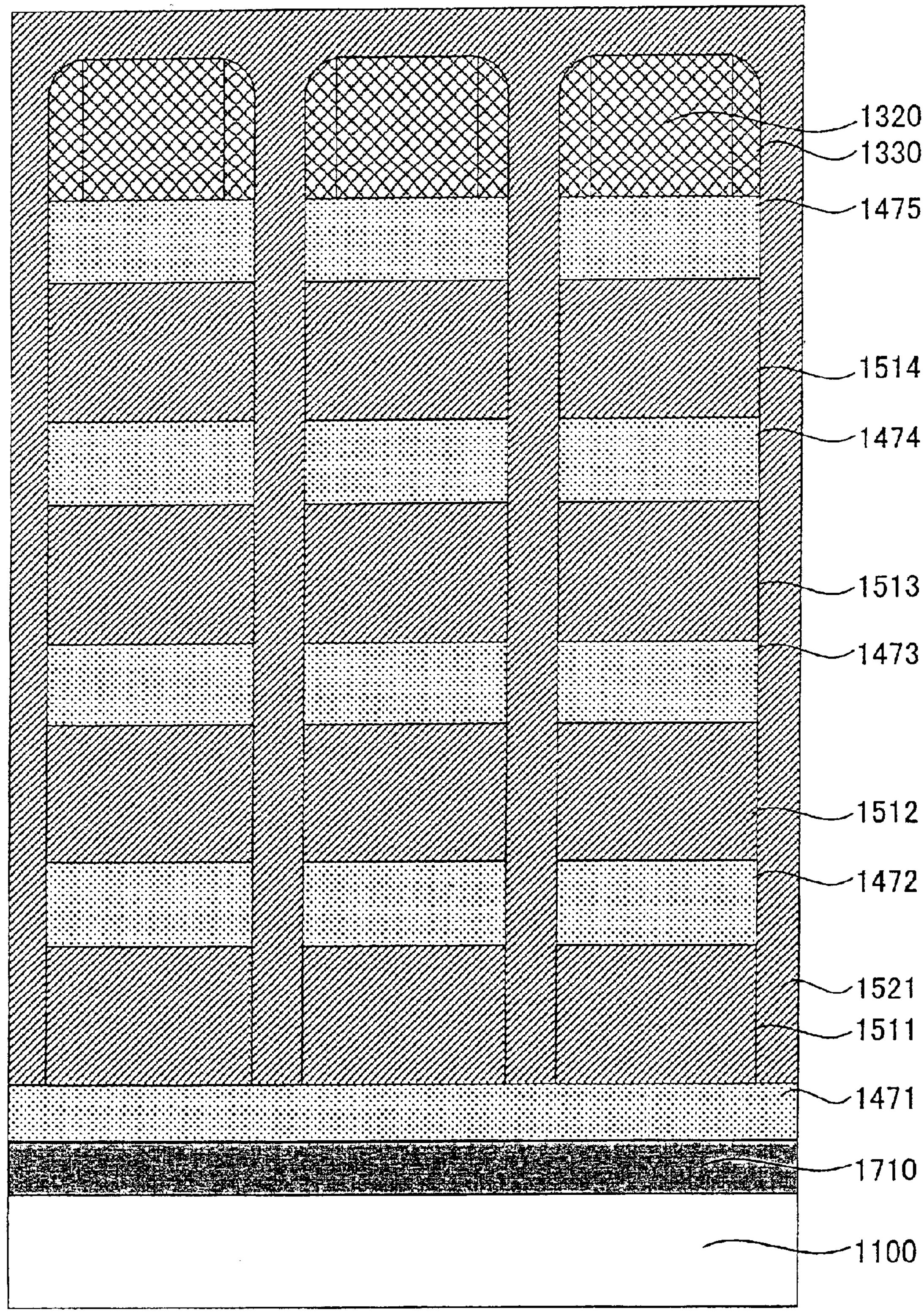

Fig. 1076
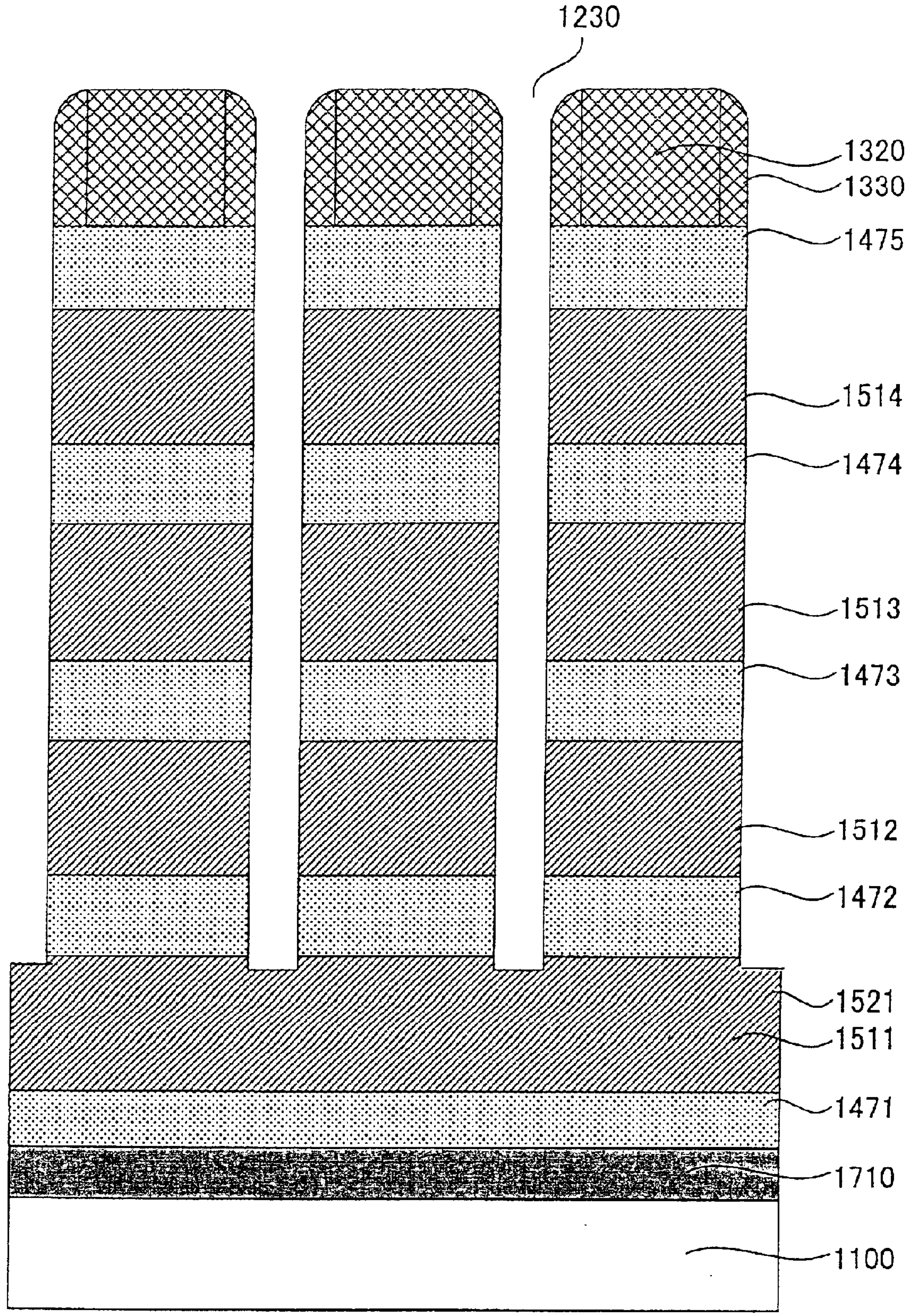

Fig. 1077
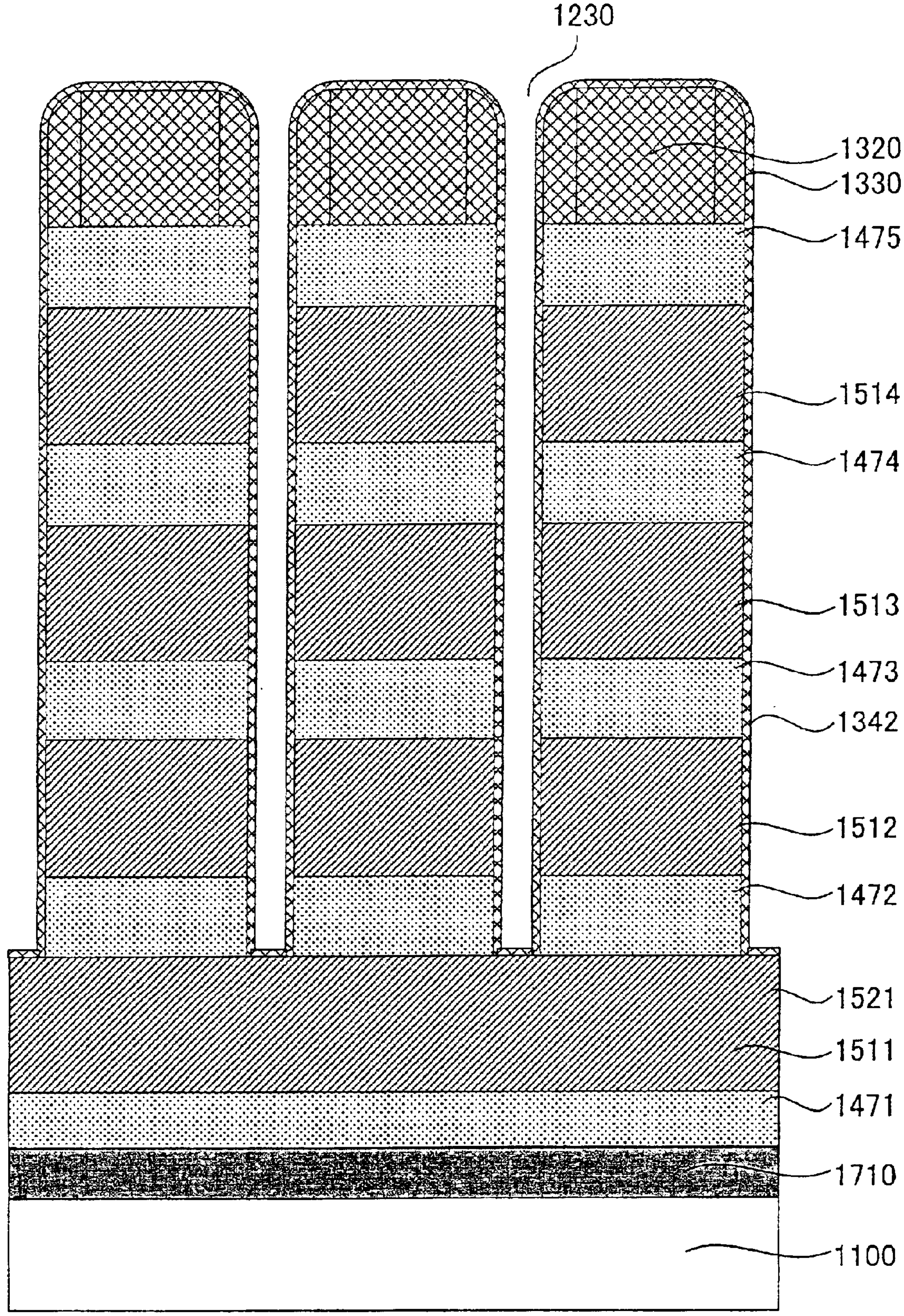

Fig. 1078
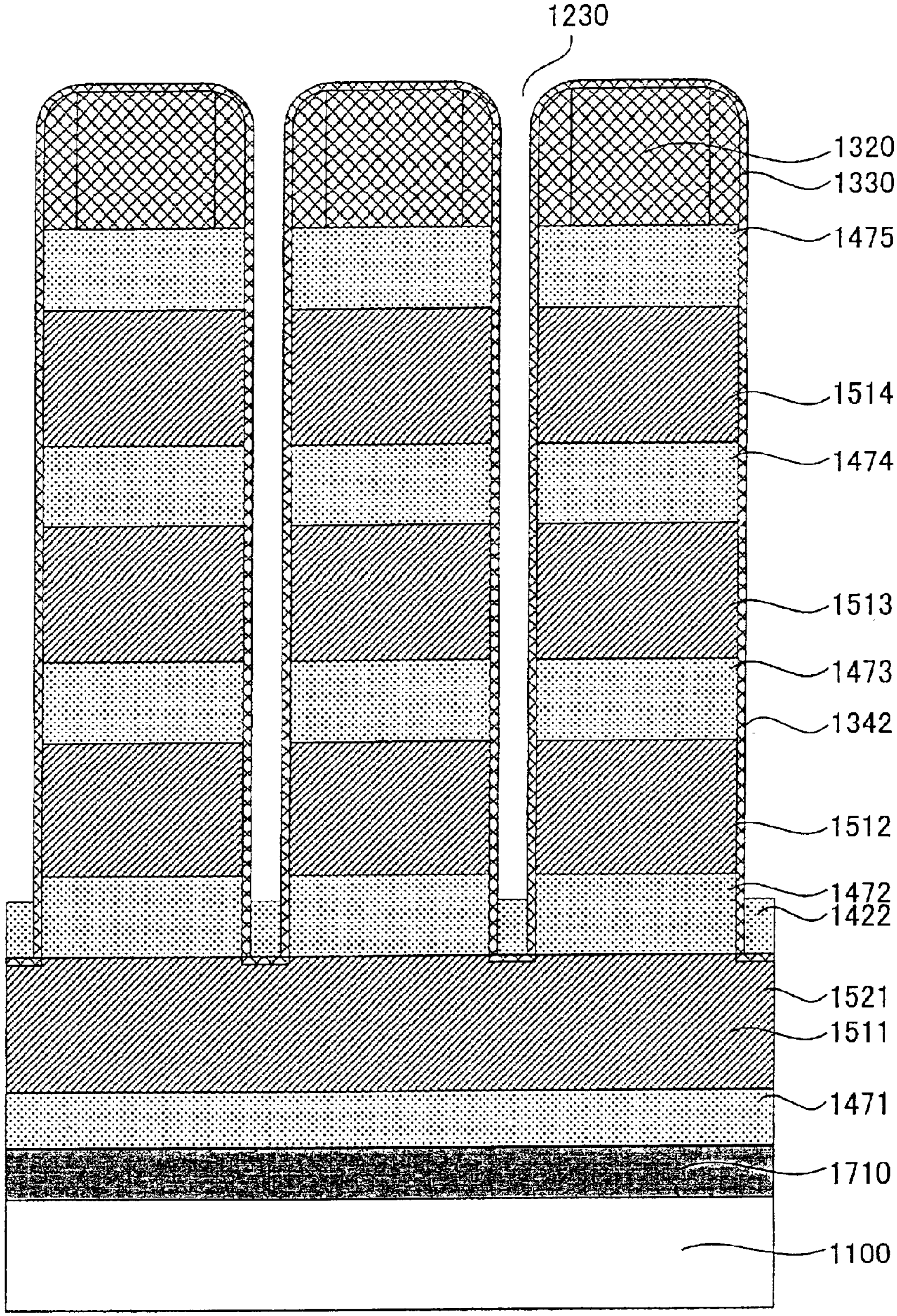

Fig. 1079
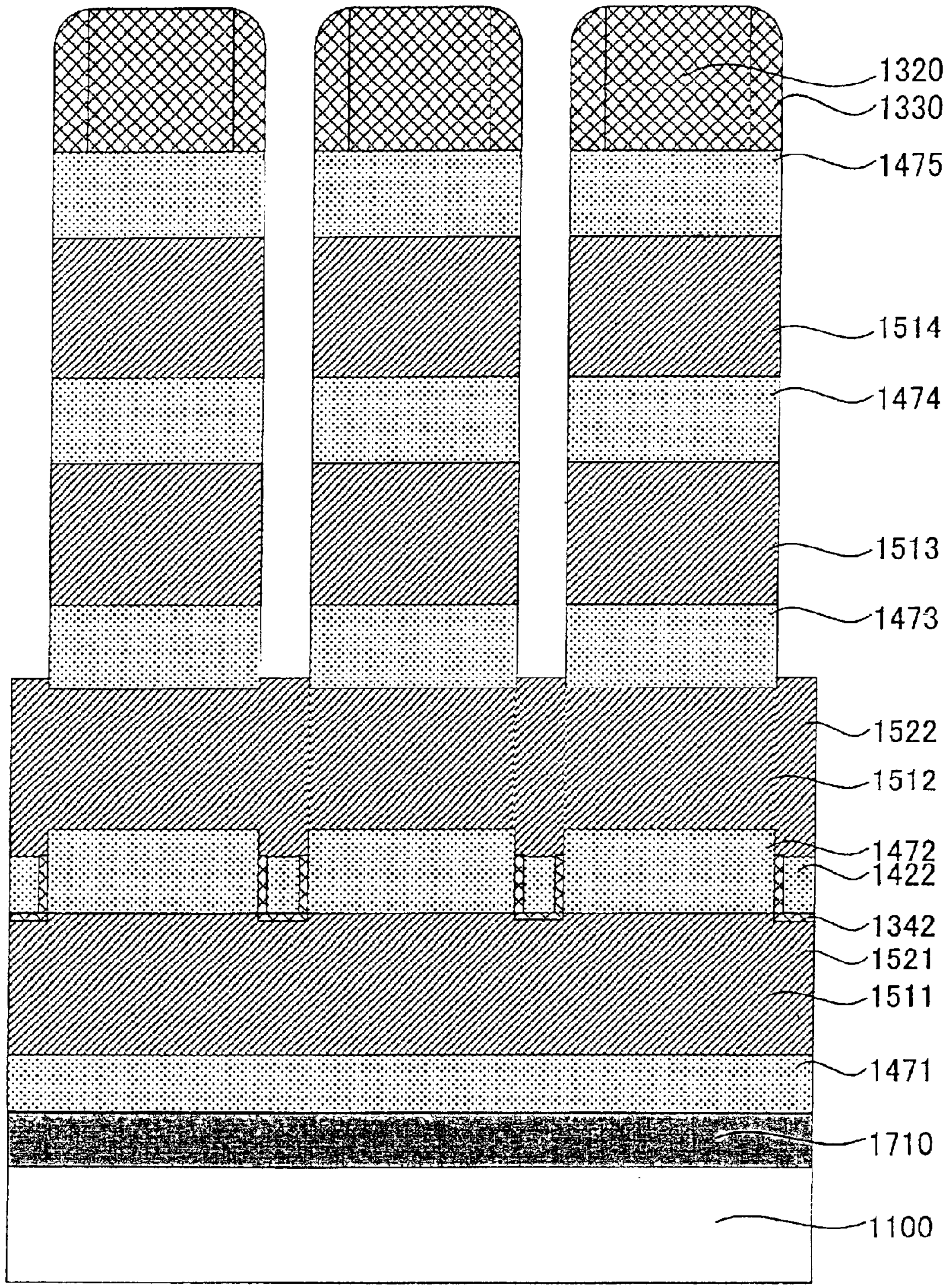

Fig. 1080
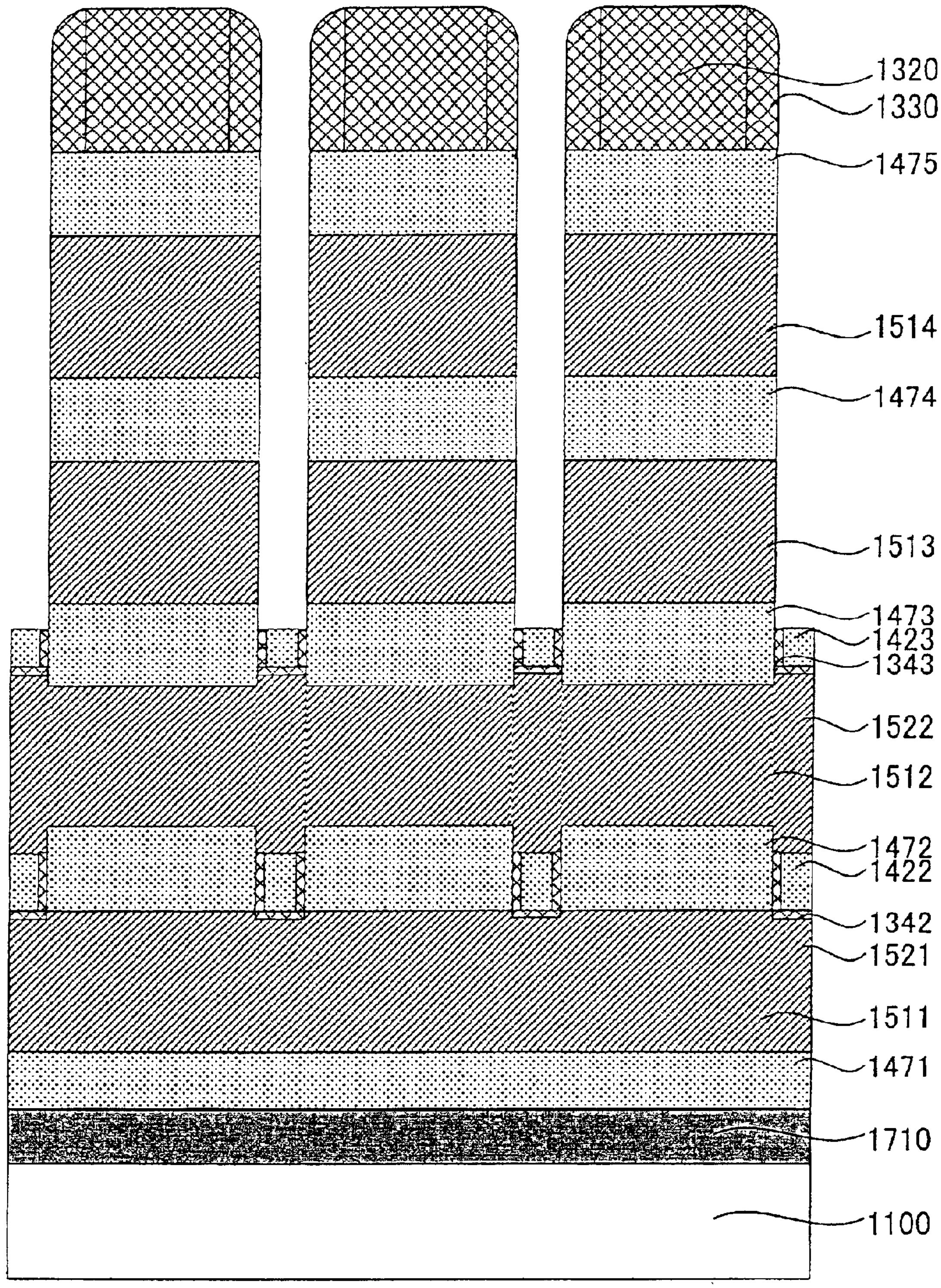

Fig. 1081
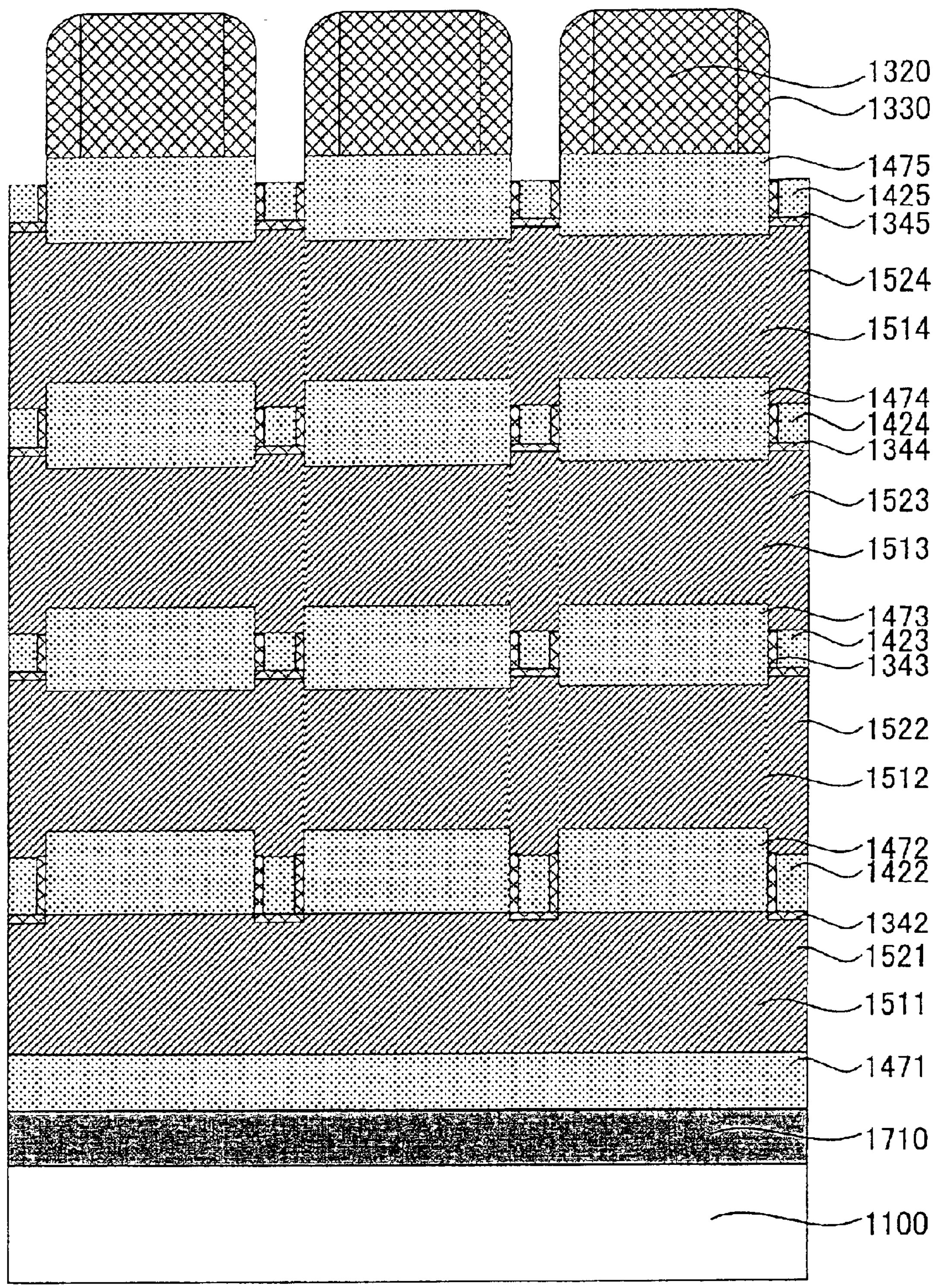

Fig. 1082
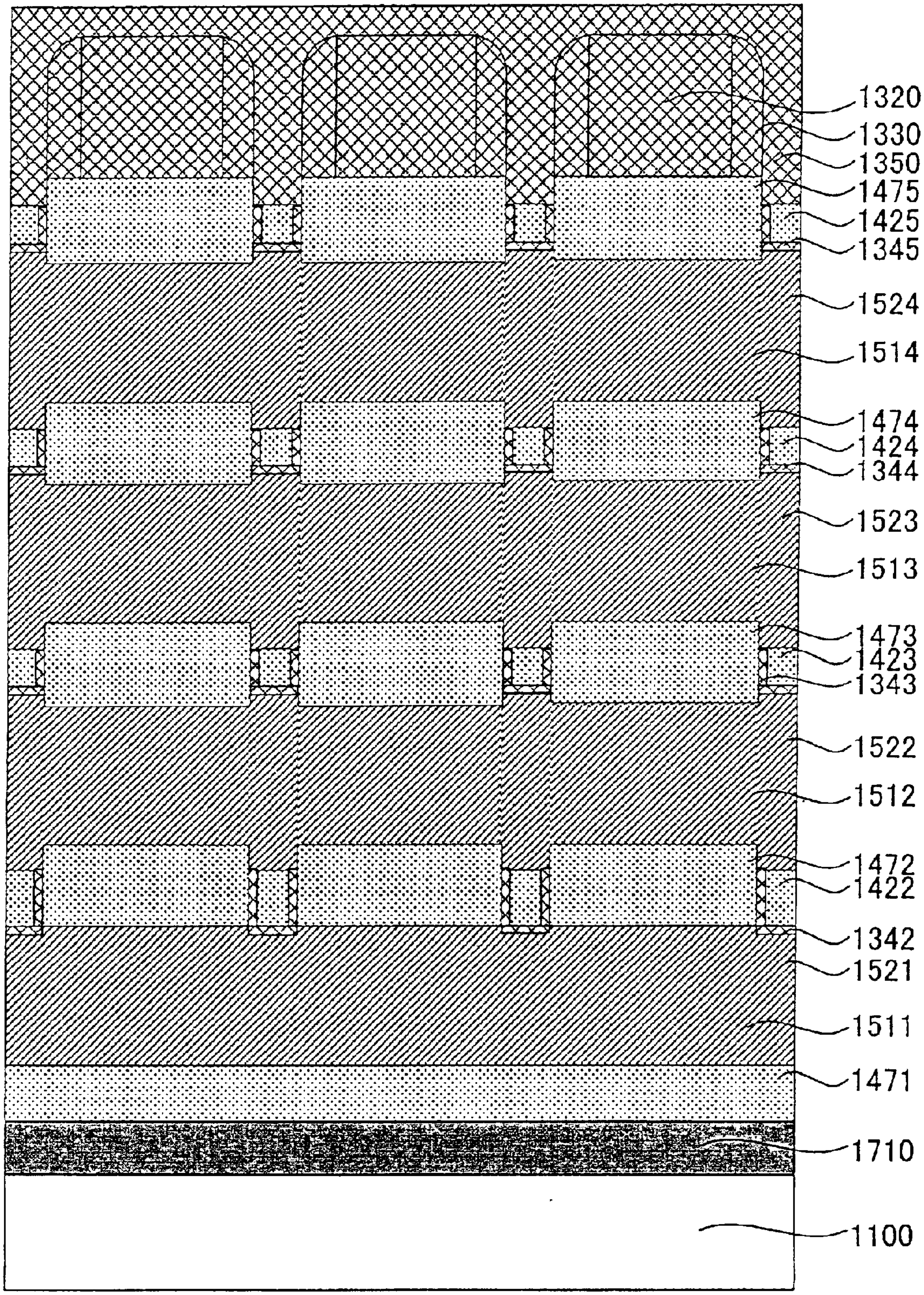

Fig. 1083
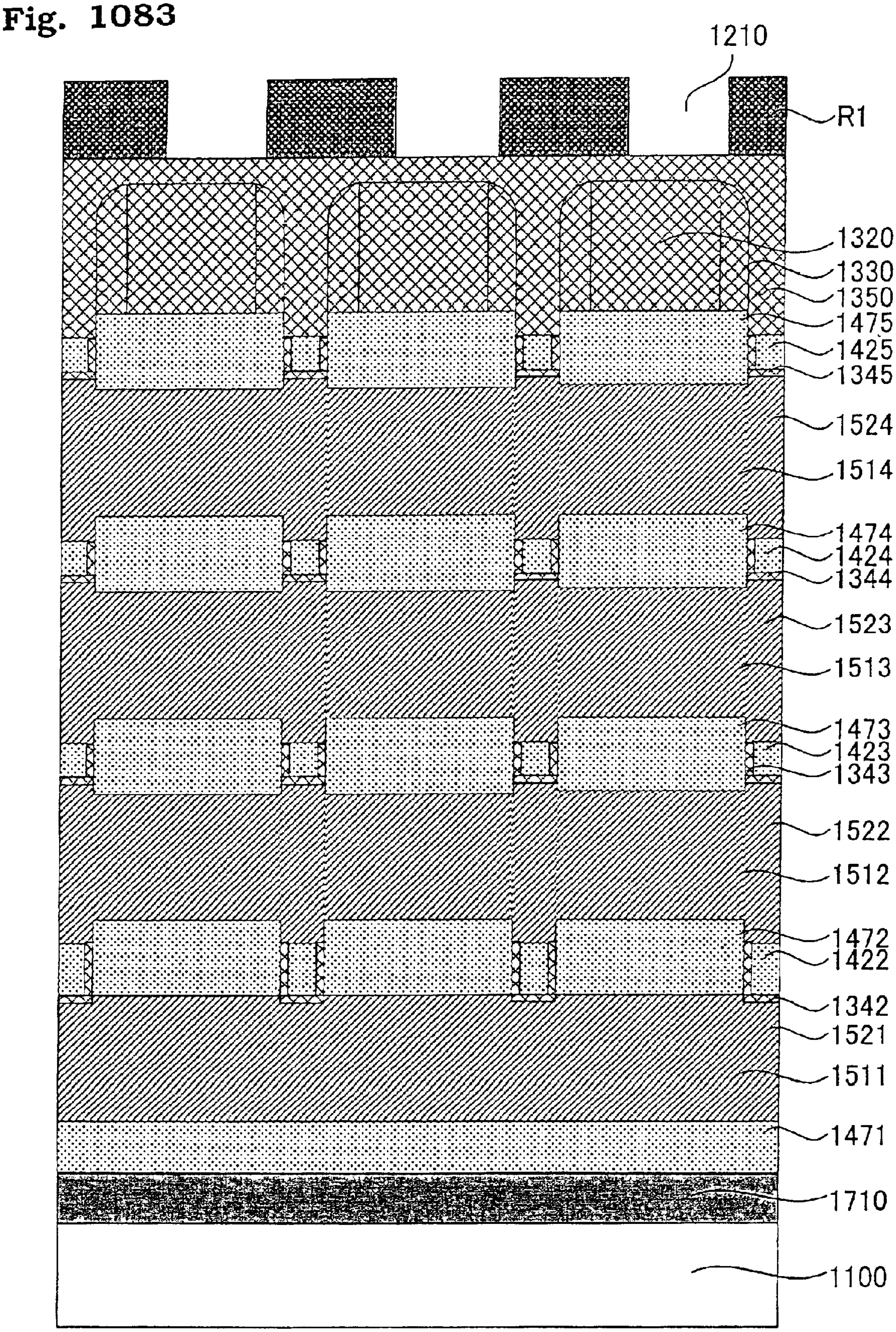

Fig. 1084
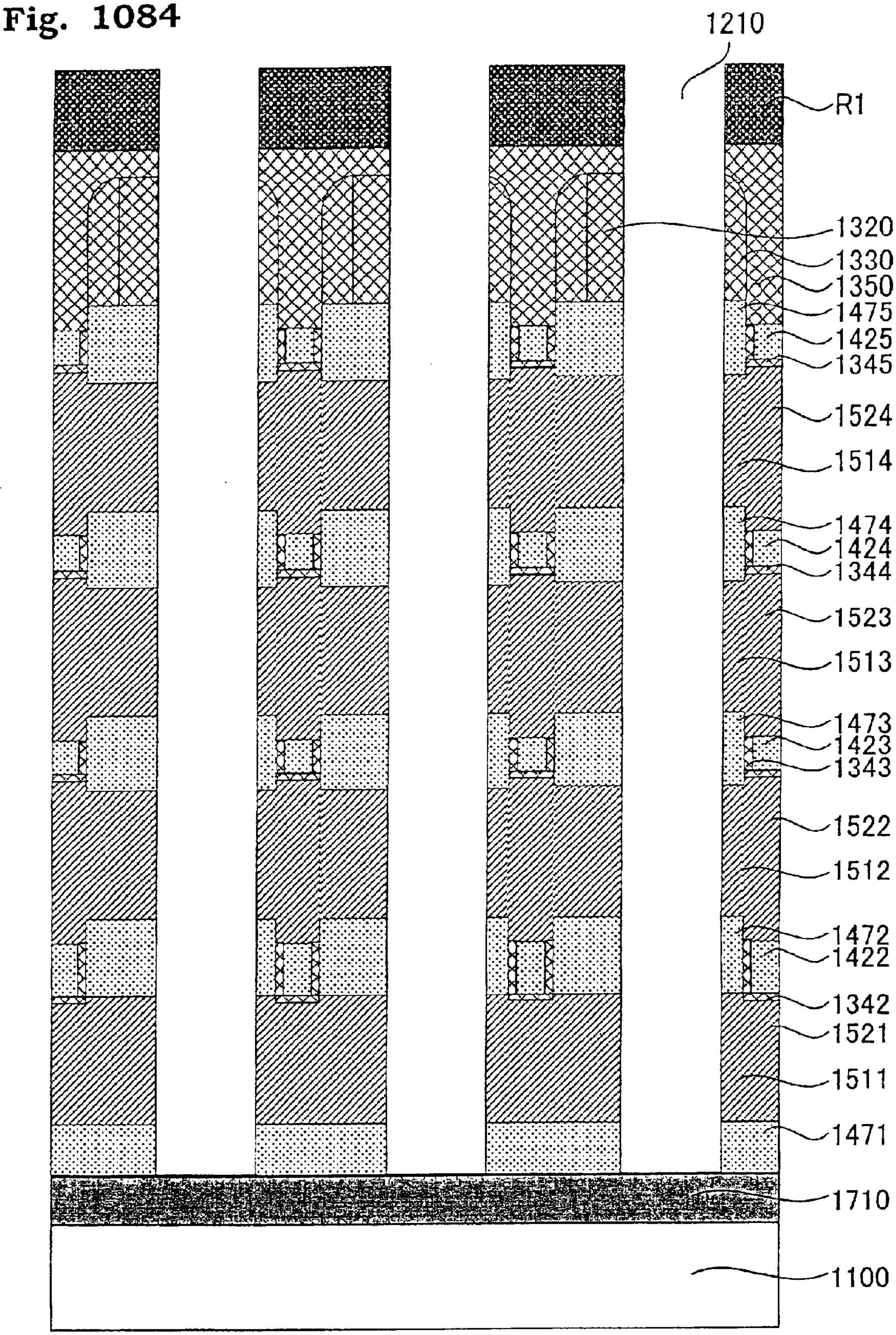

Fig. 1085
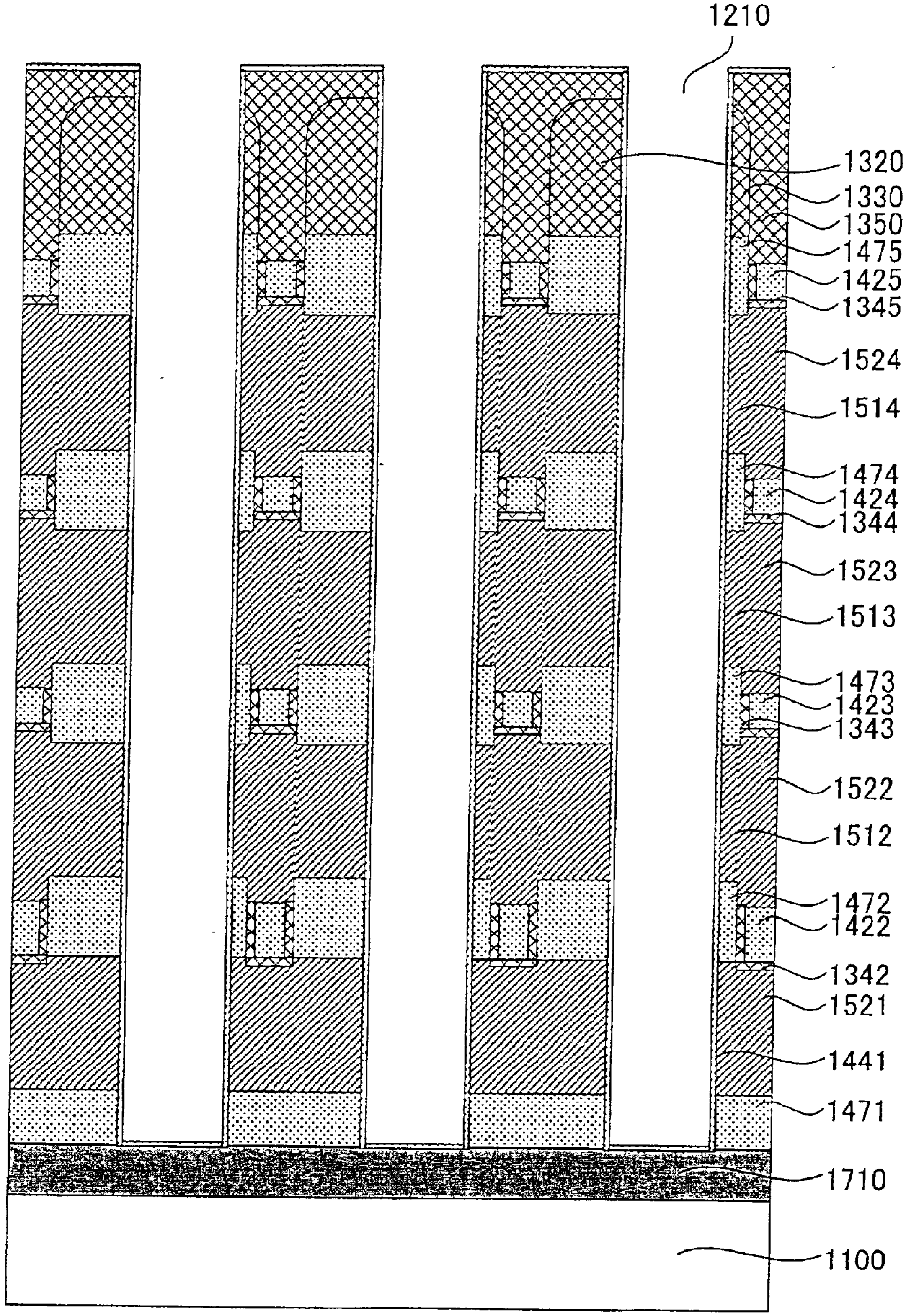

Fig. 1086
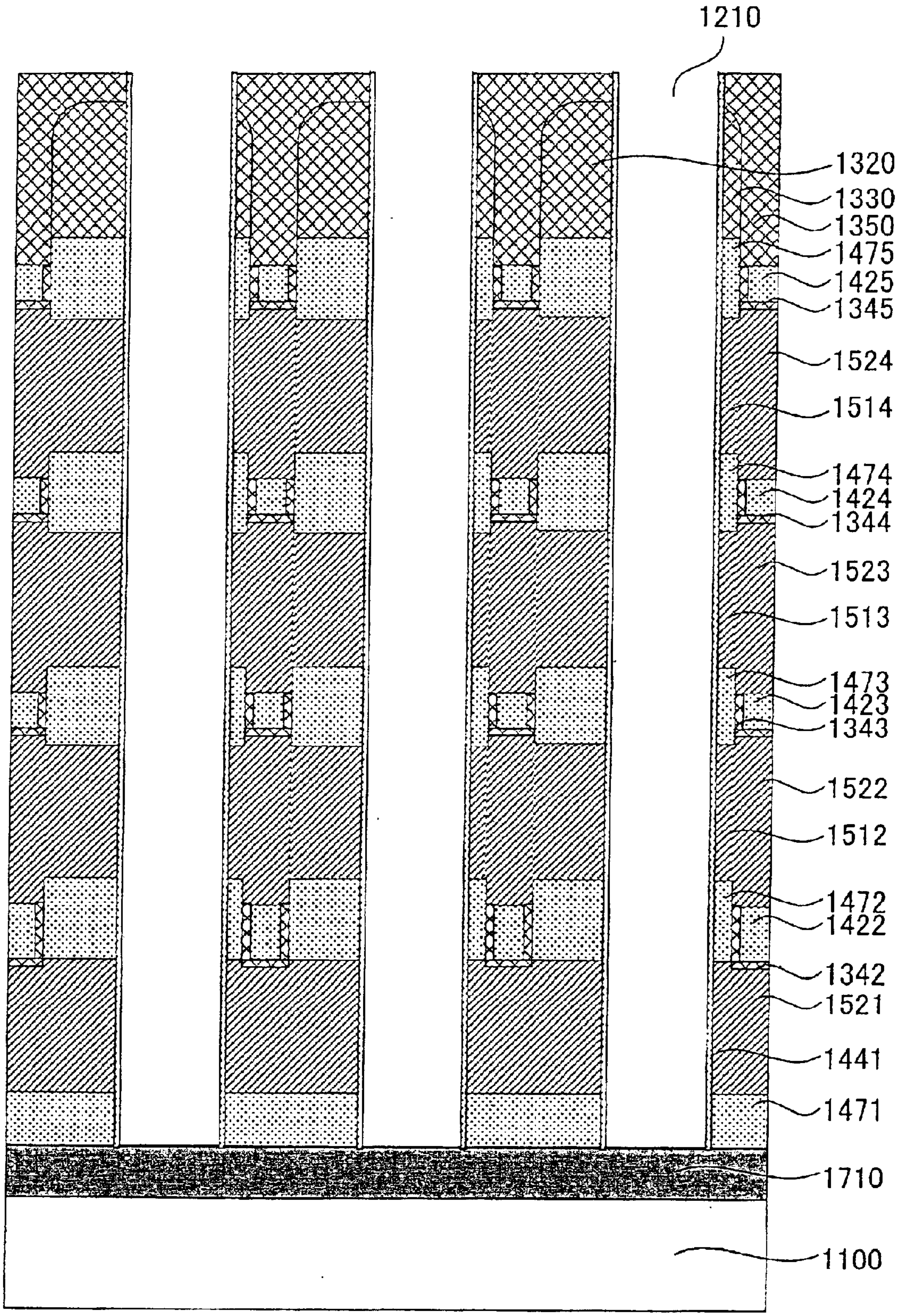

Fig. 1087
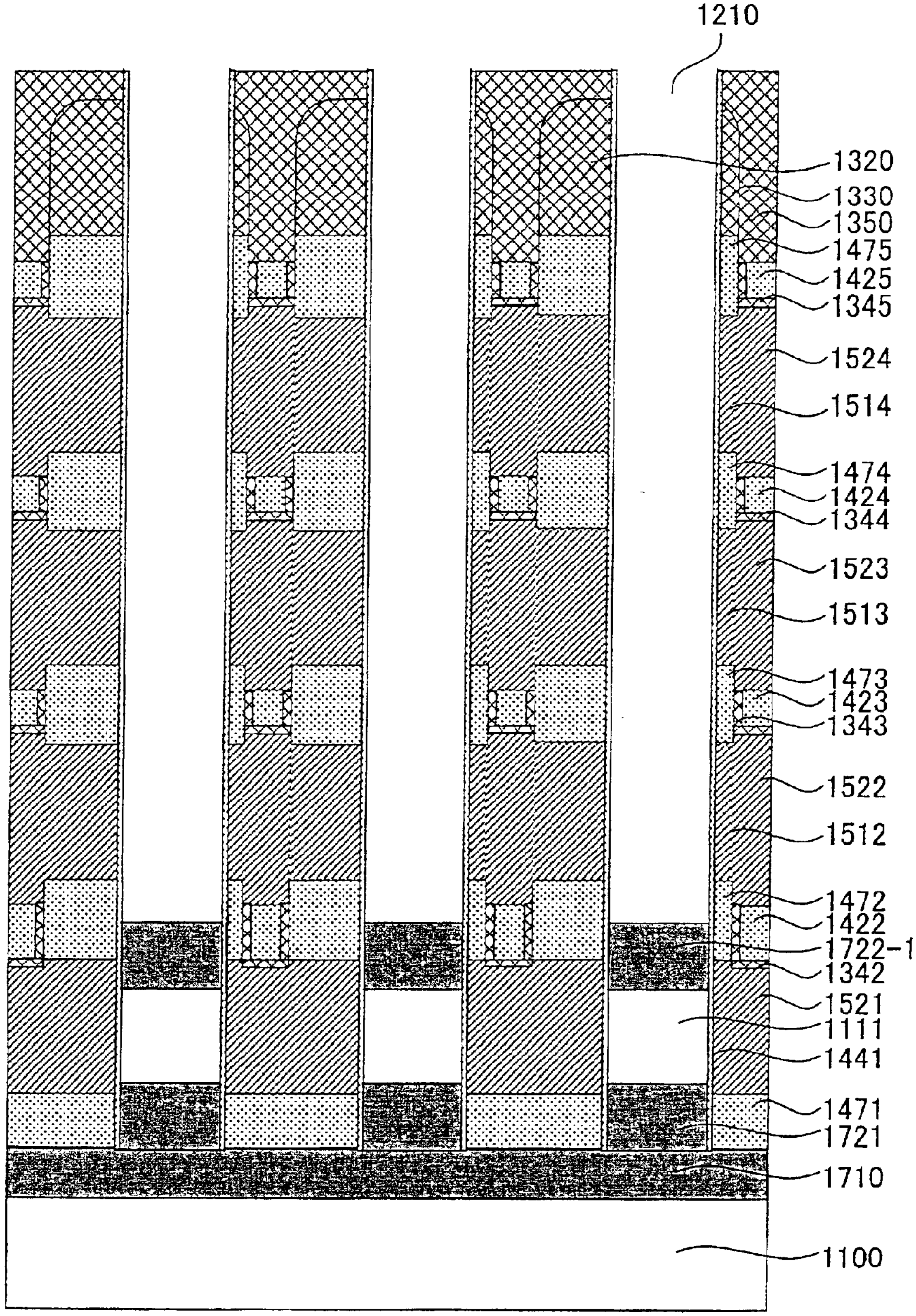

Fig. 1088
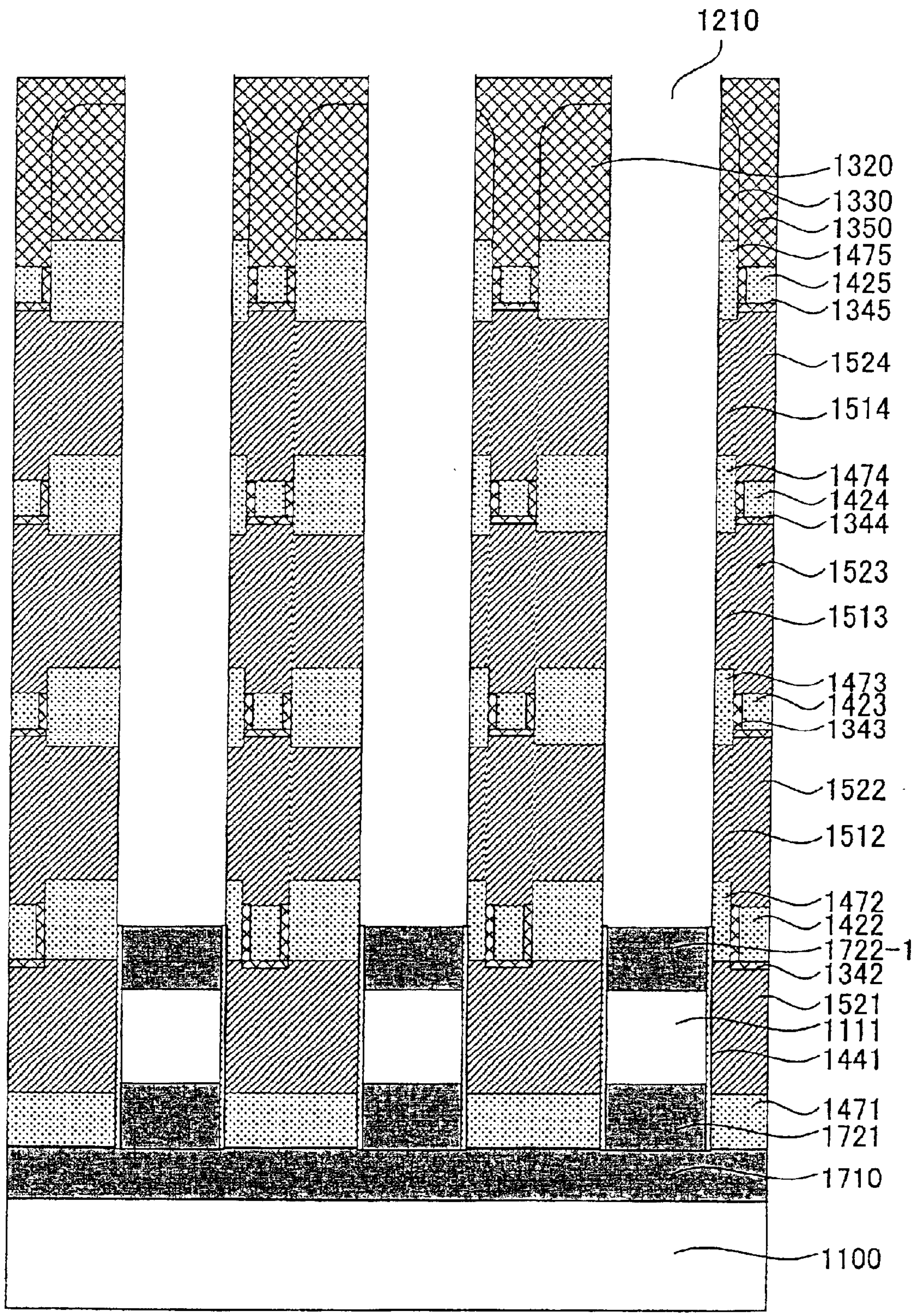

Fig. 1089
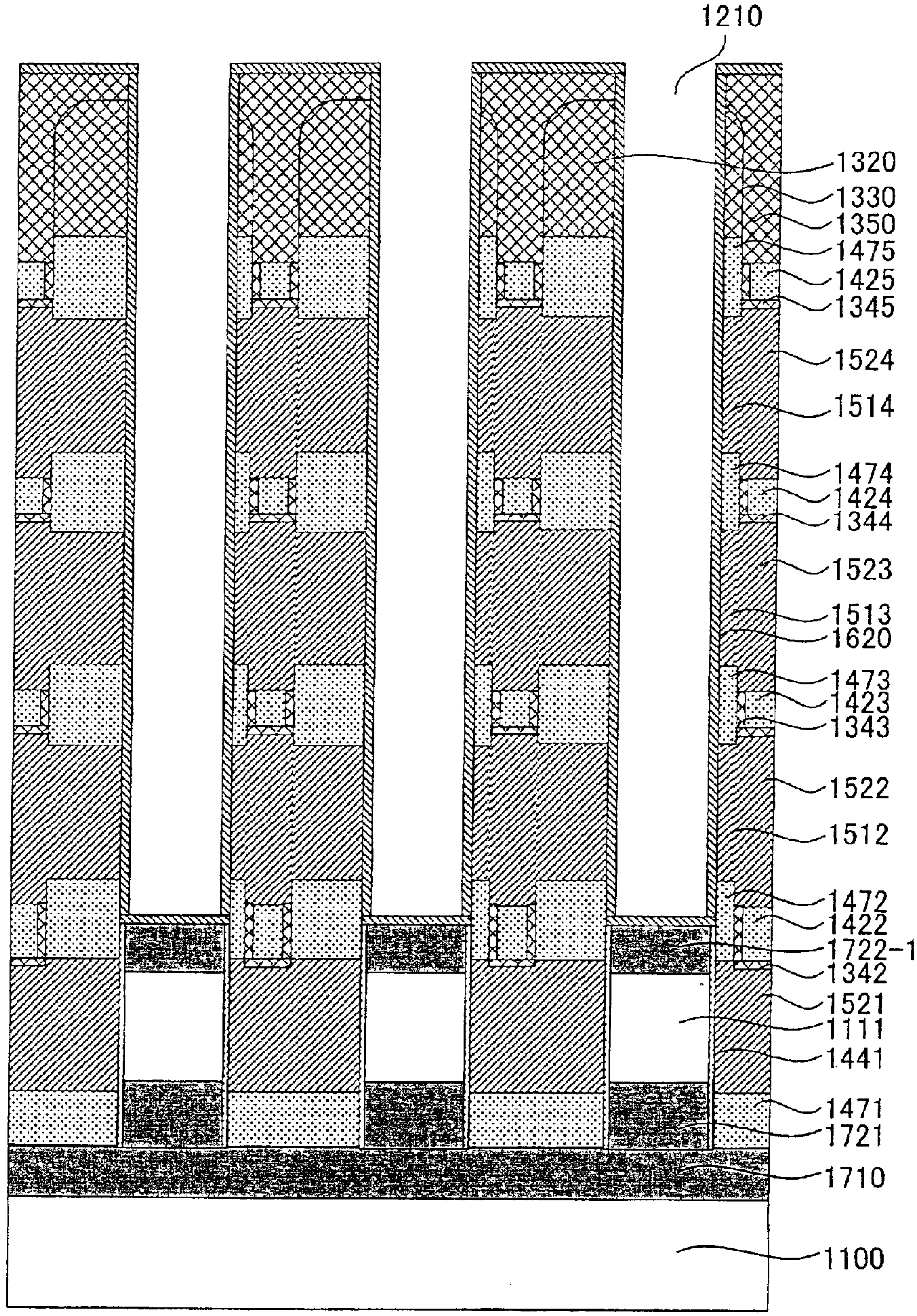

Fig. 1090
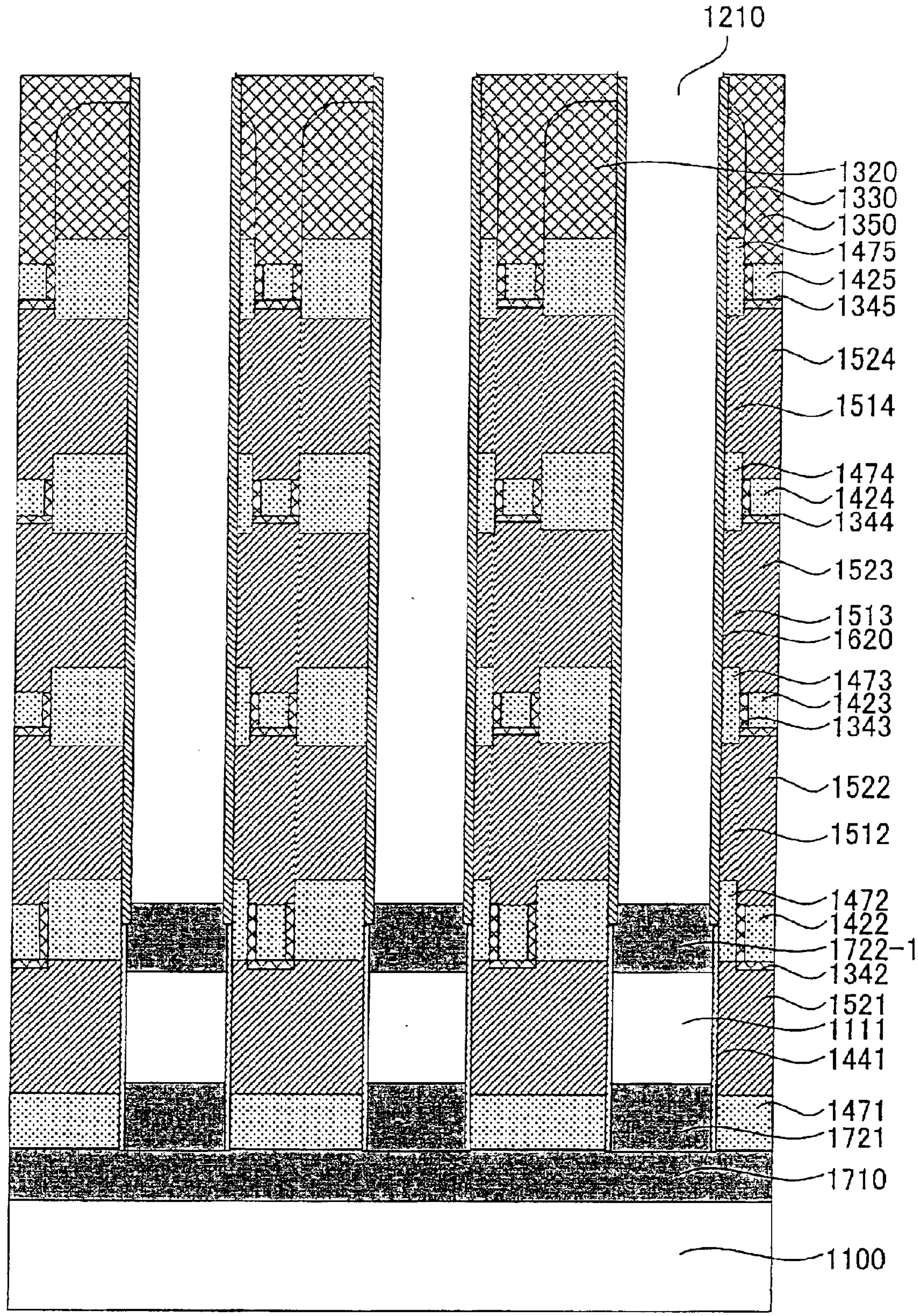

Fig. 1091
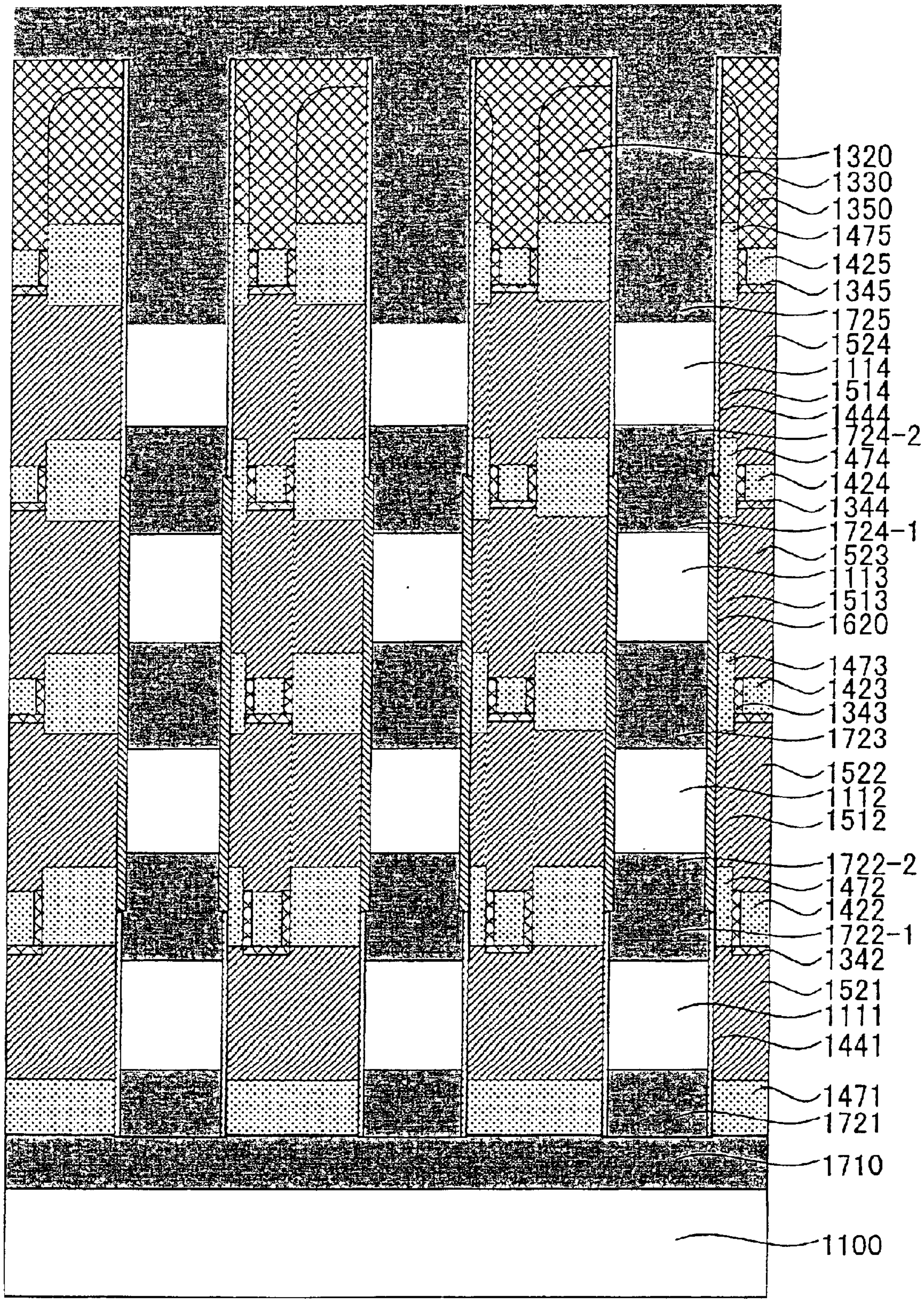

Fig. 1092
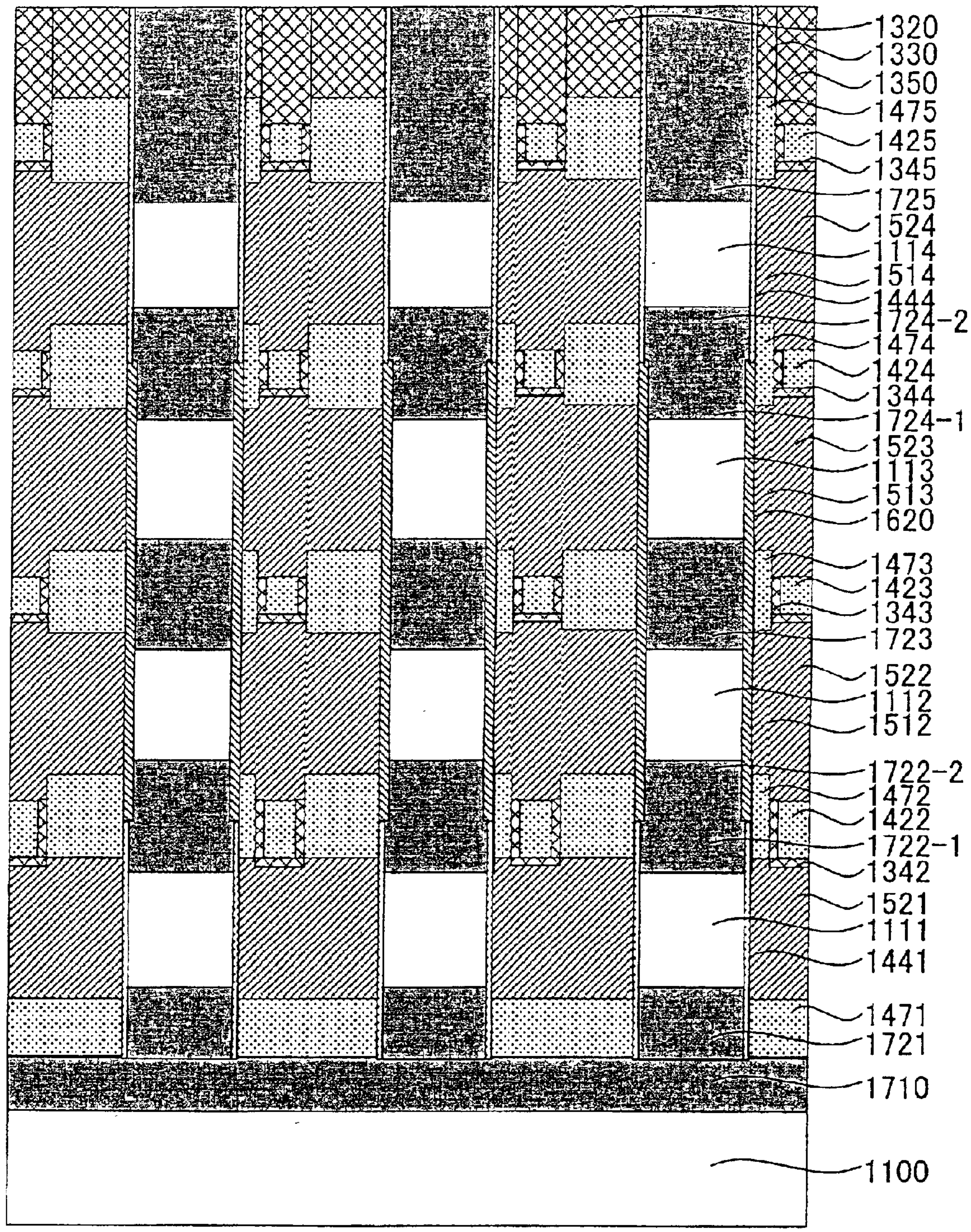

Fig. 1093
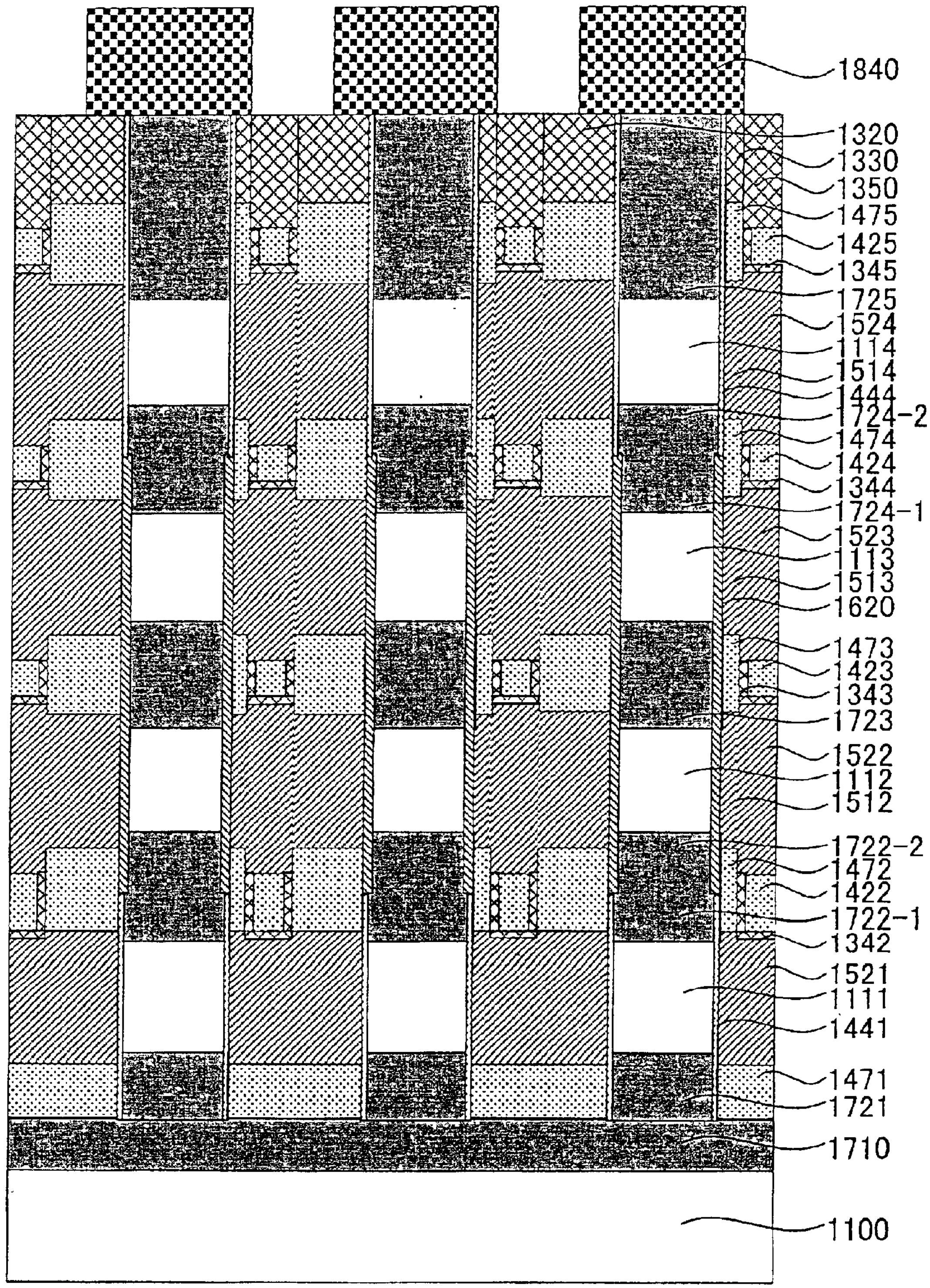

Fig. 1094
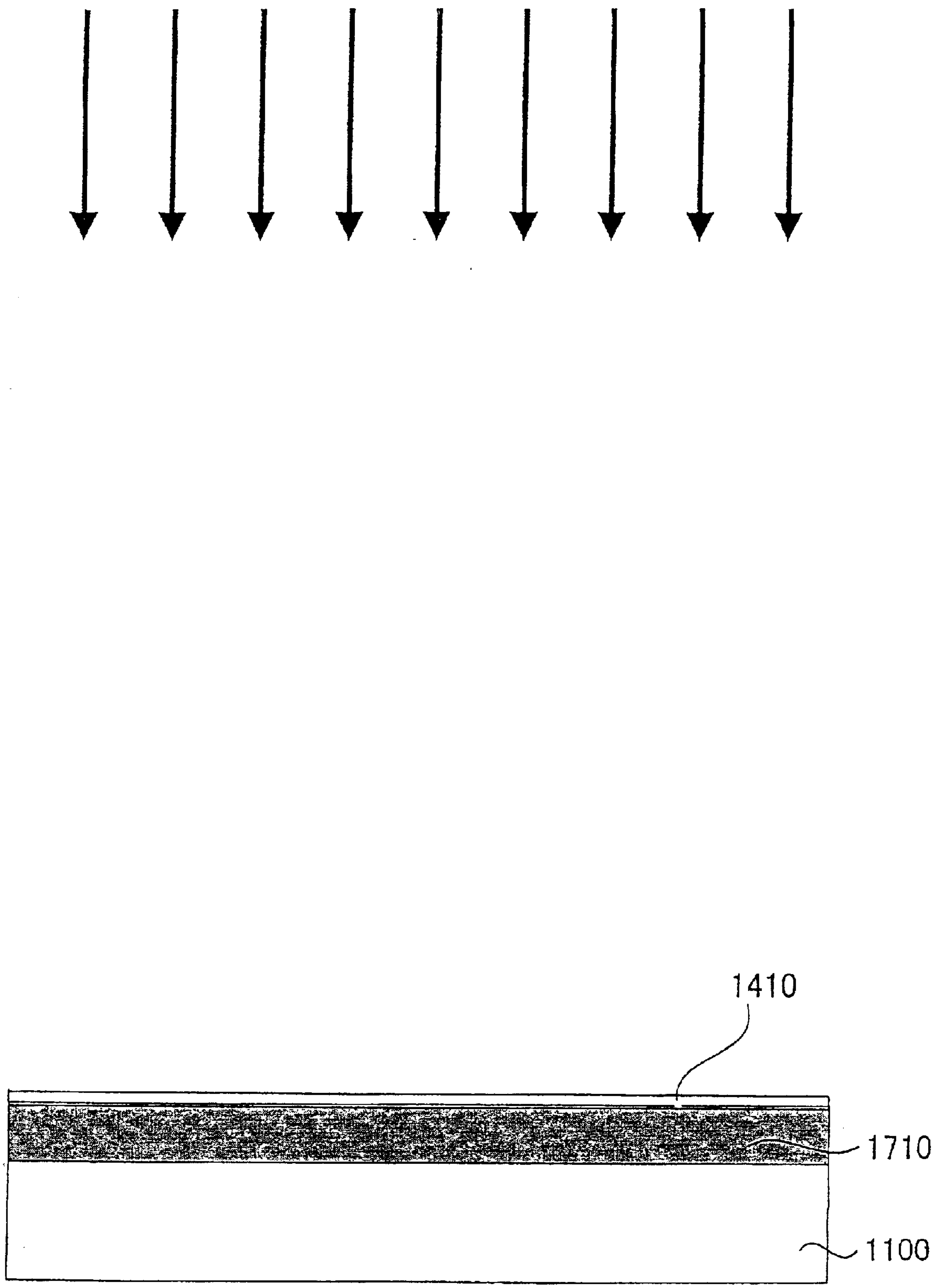

Fig. 1095
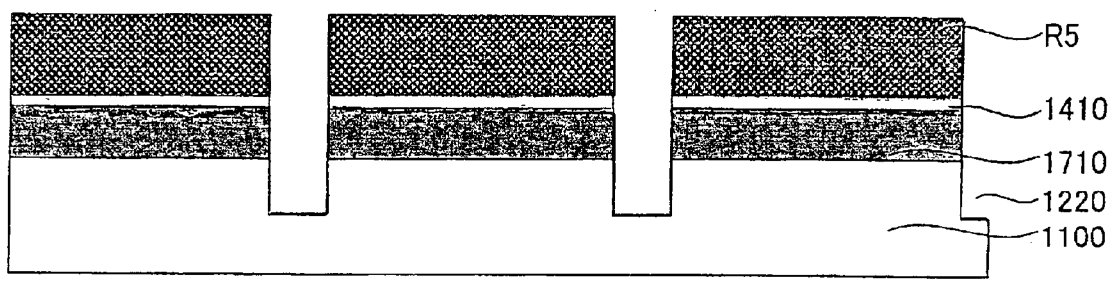
Fig. 1096
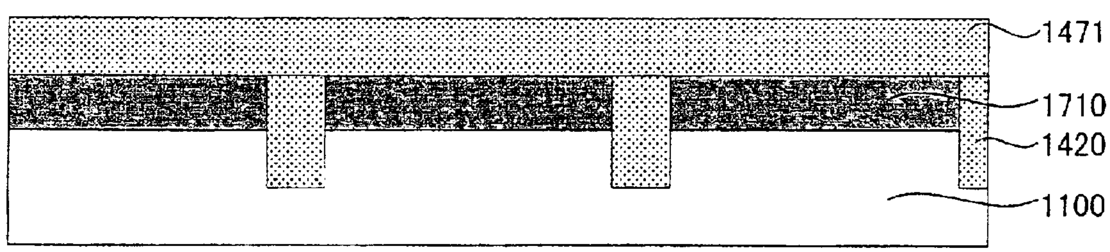

Fig. 1097
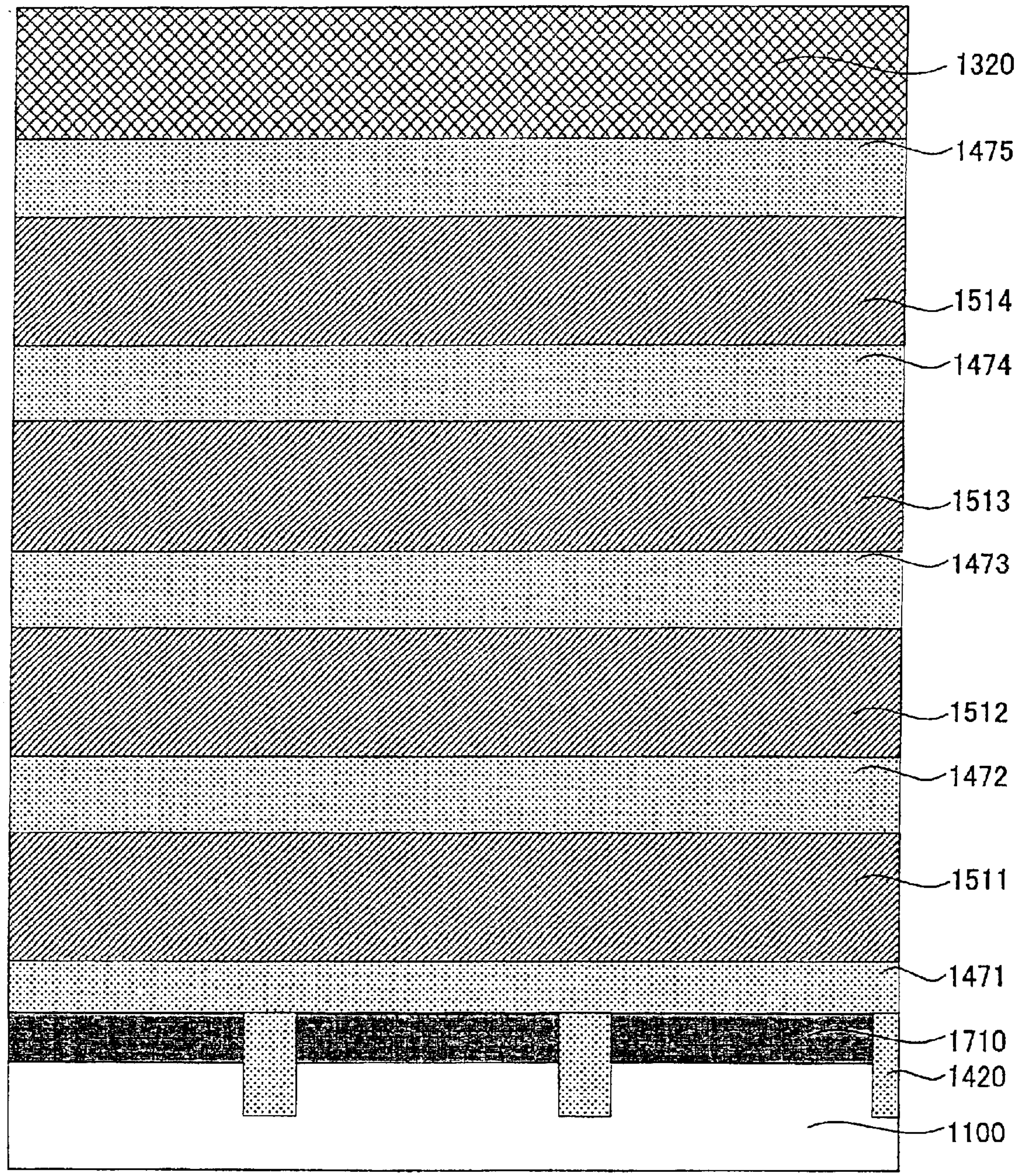

Fig. 1098
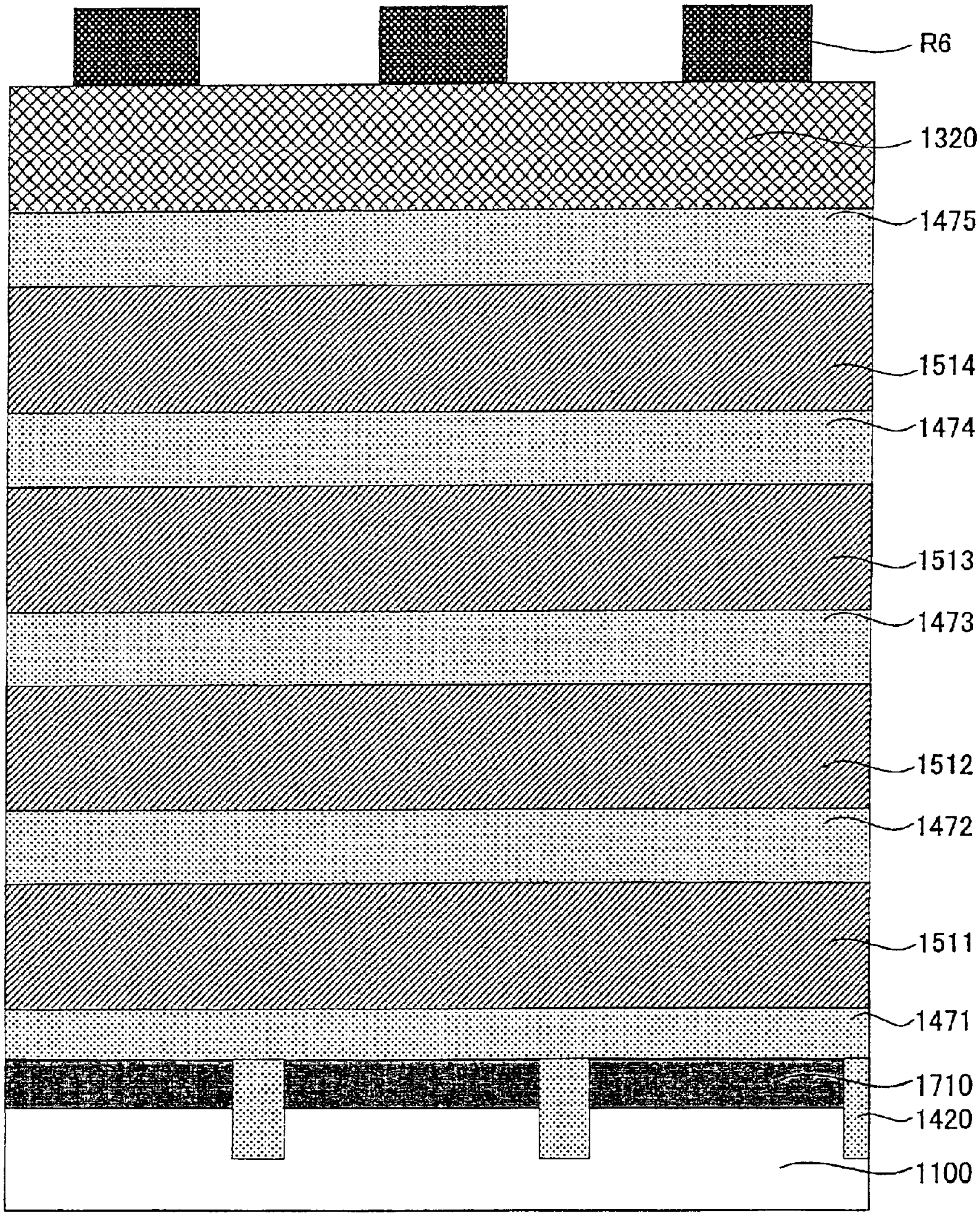

Fig. 1099
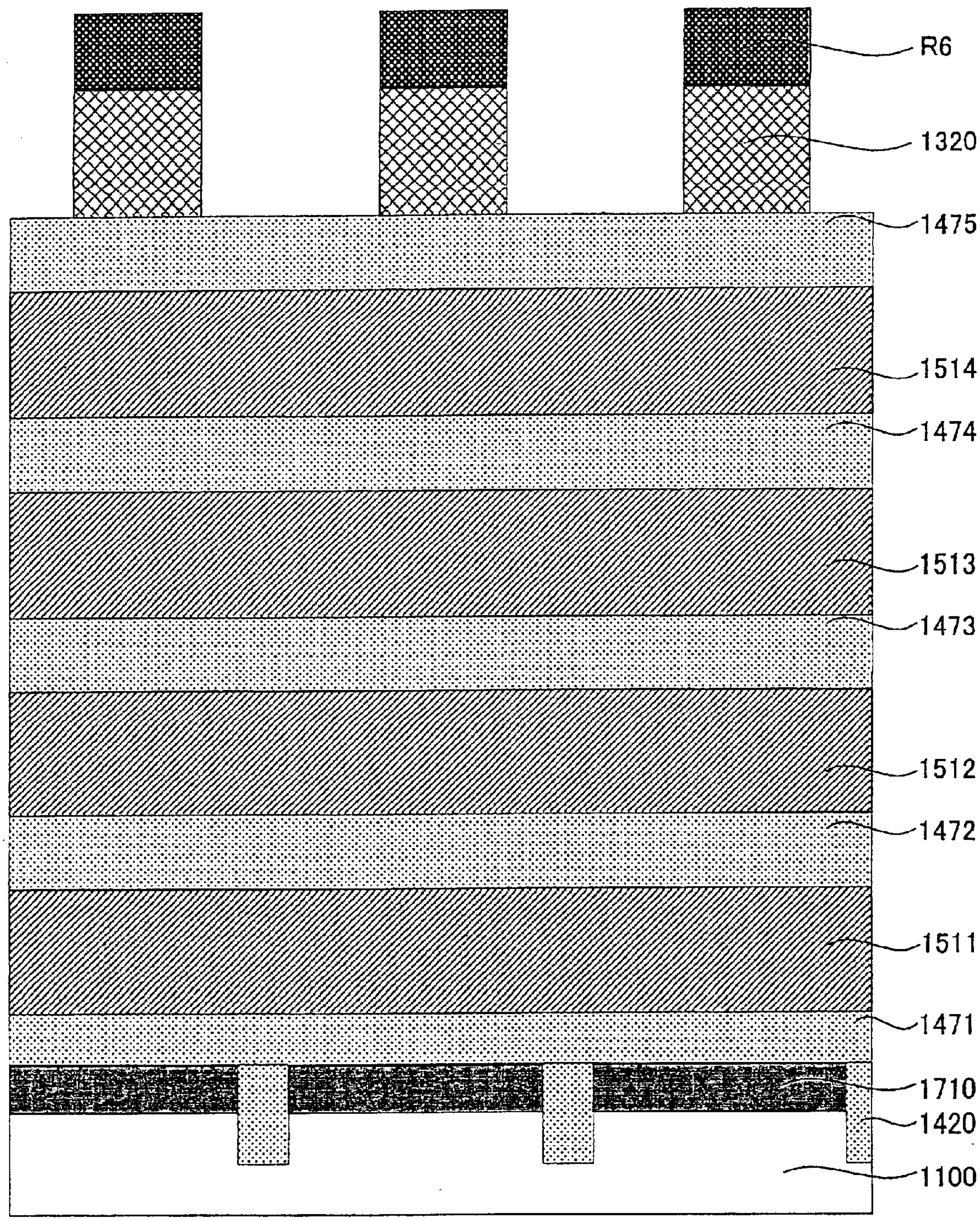

Fig. 1100
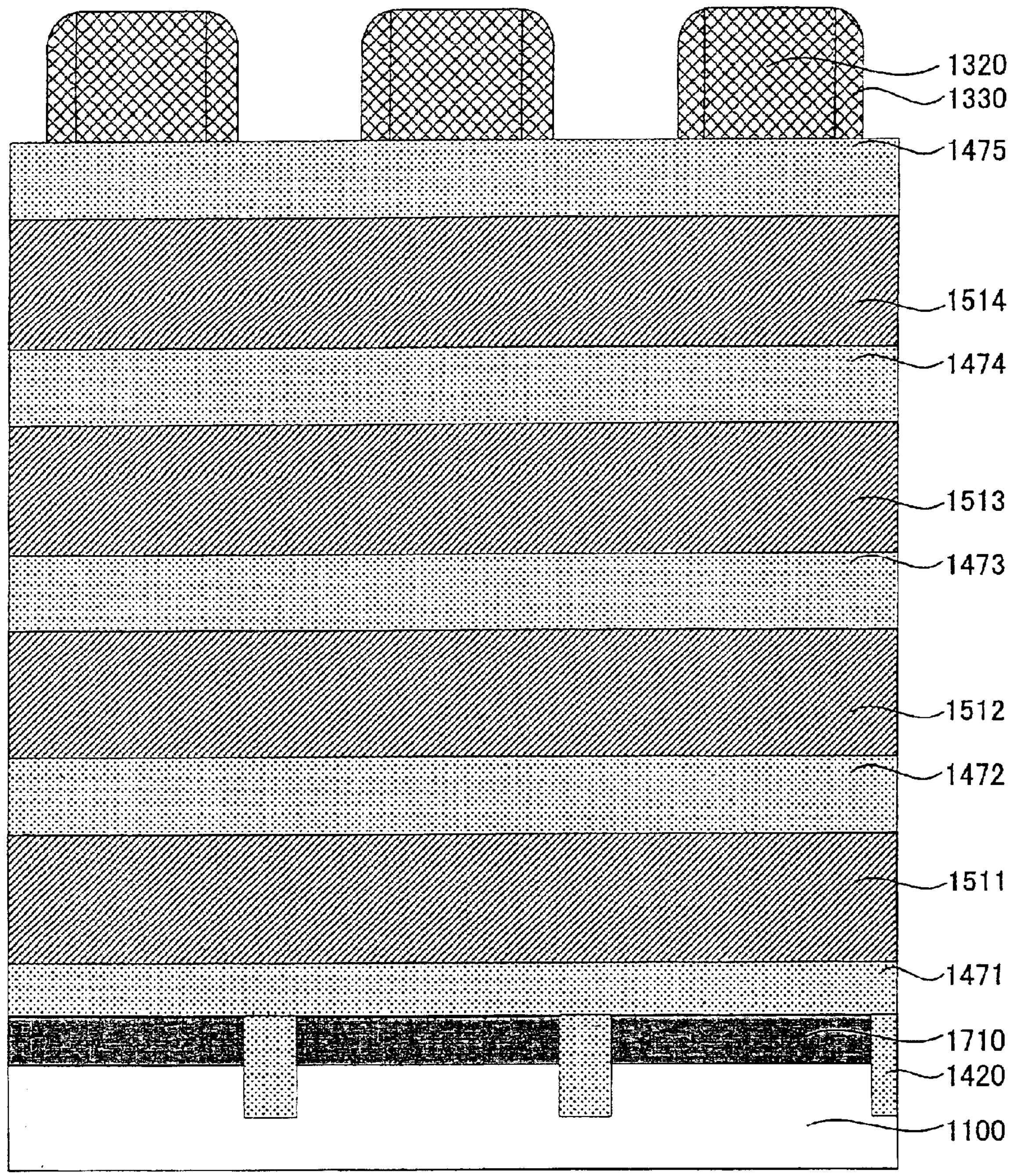

Fig. 1101
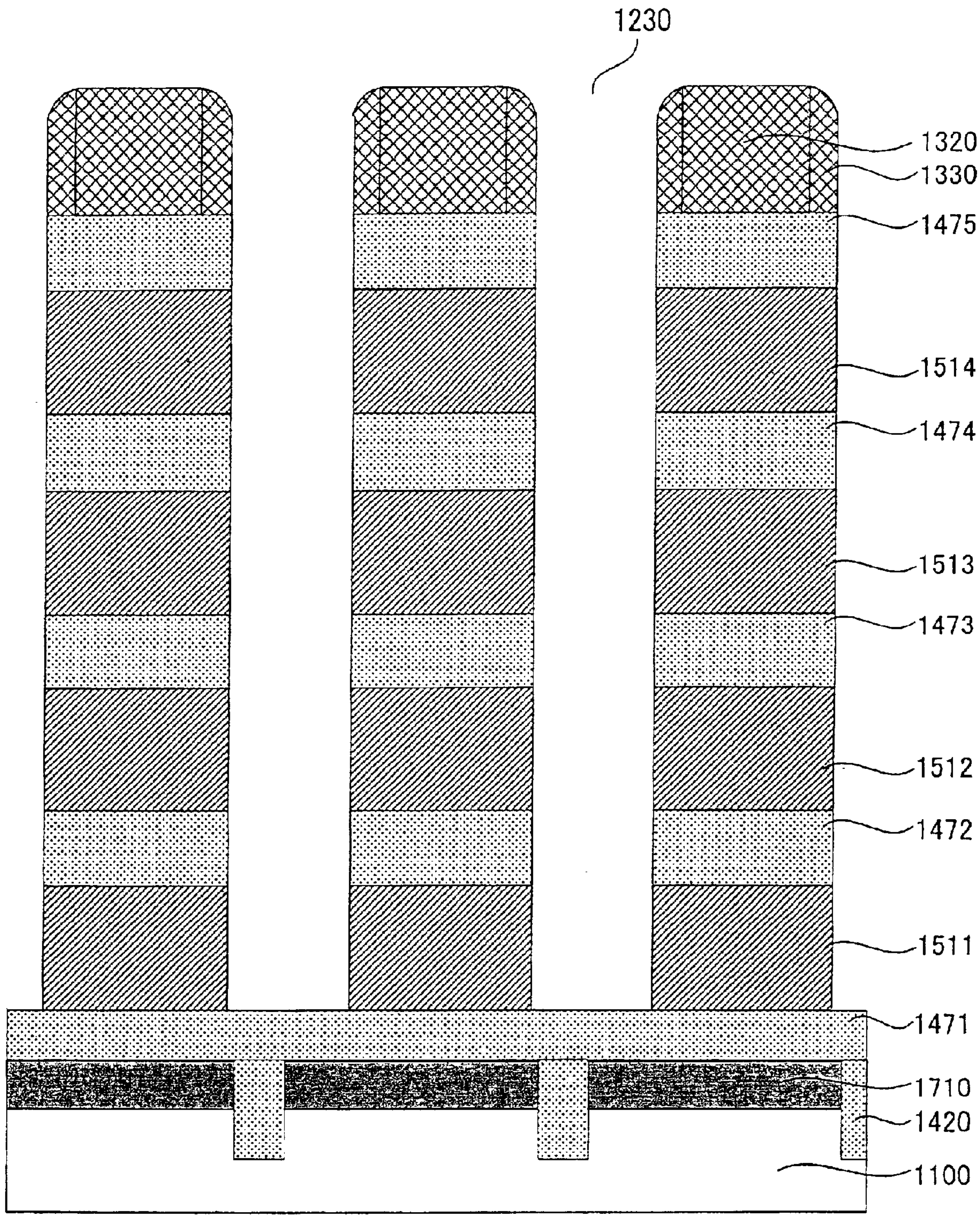

Fig. 1102
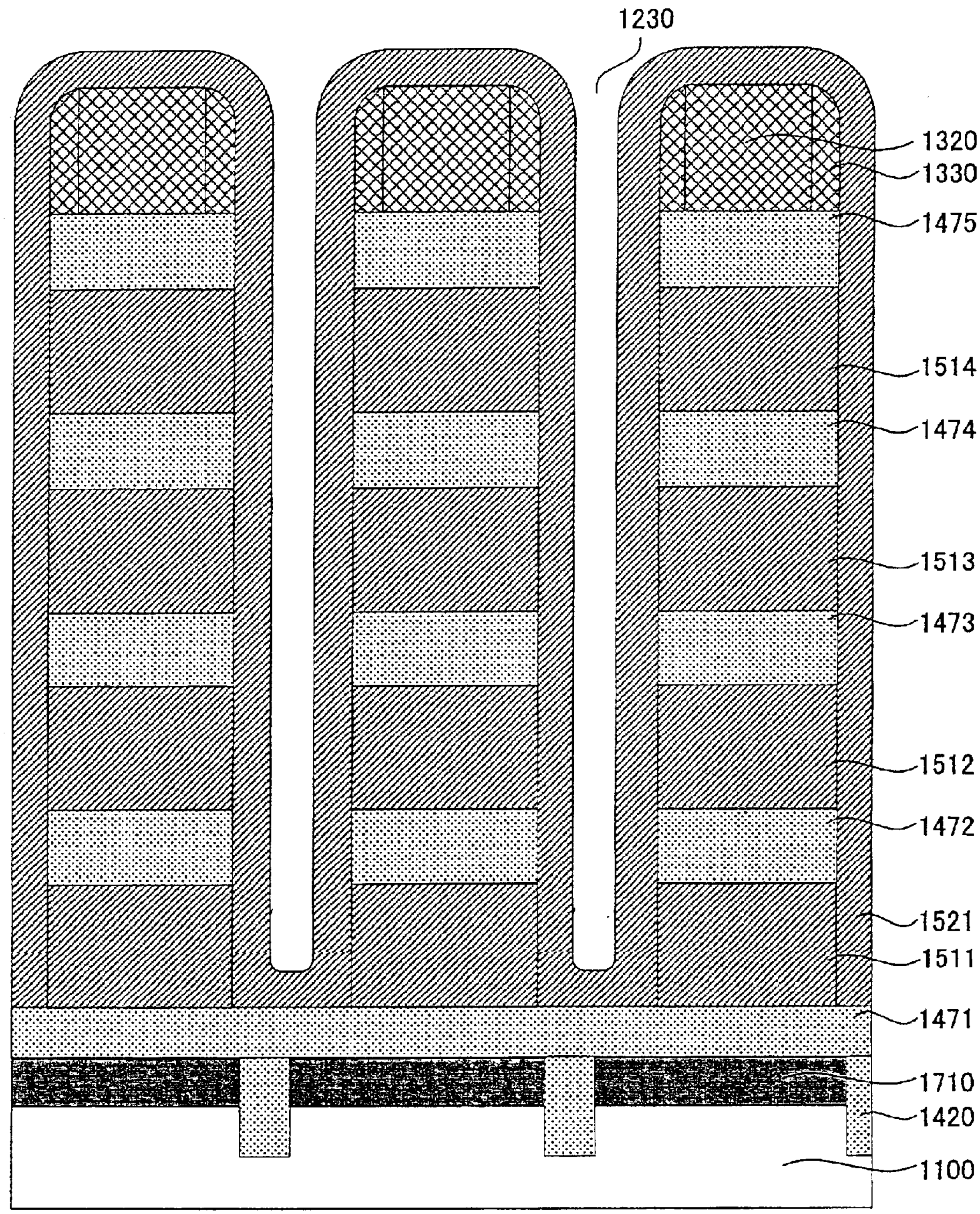

Fig. 1103
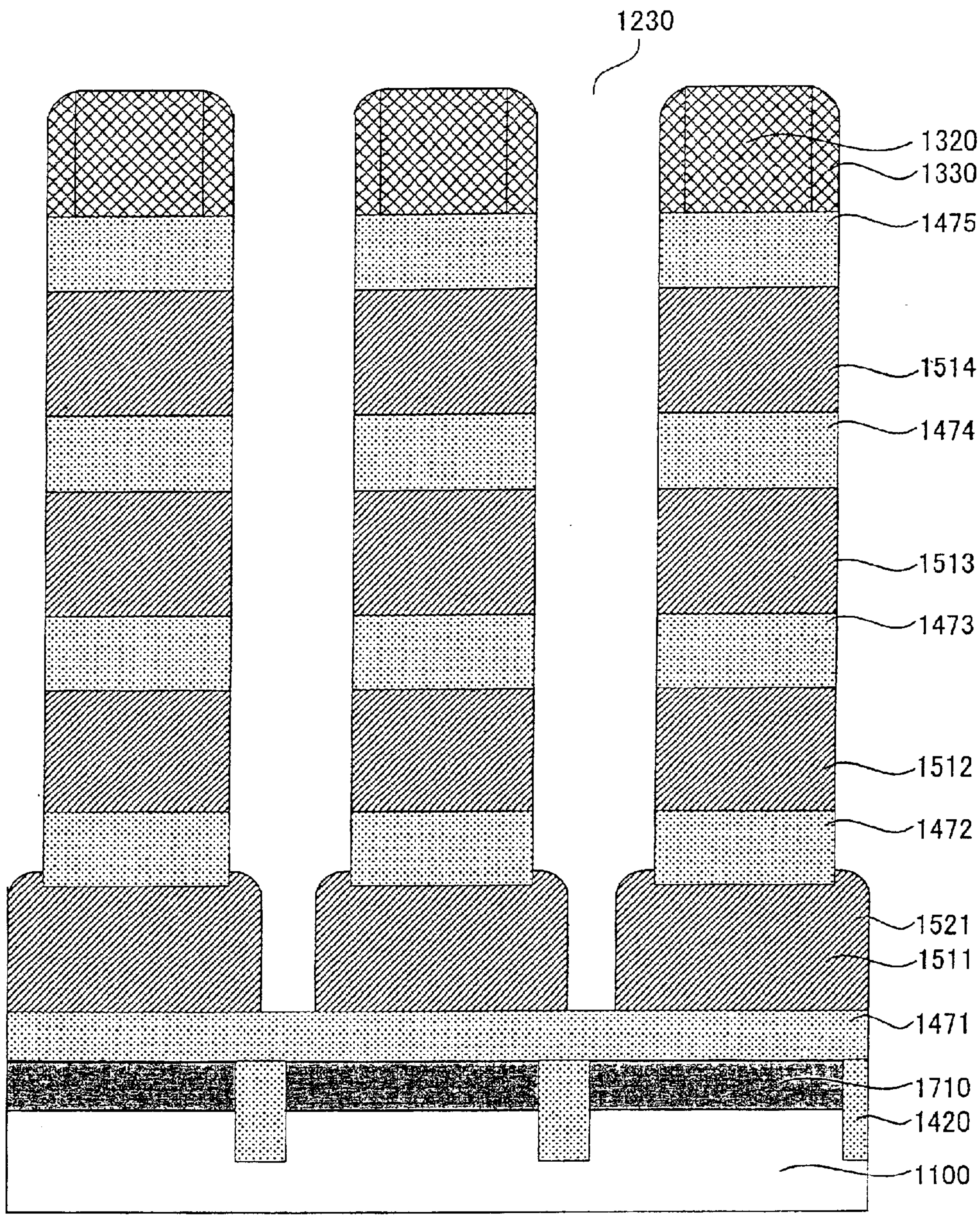

Fig. 1104
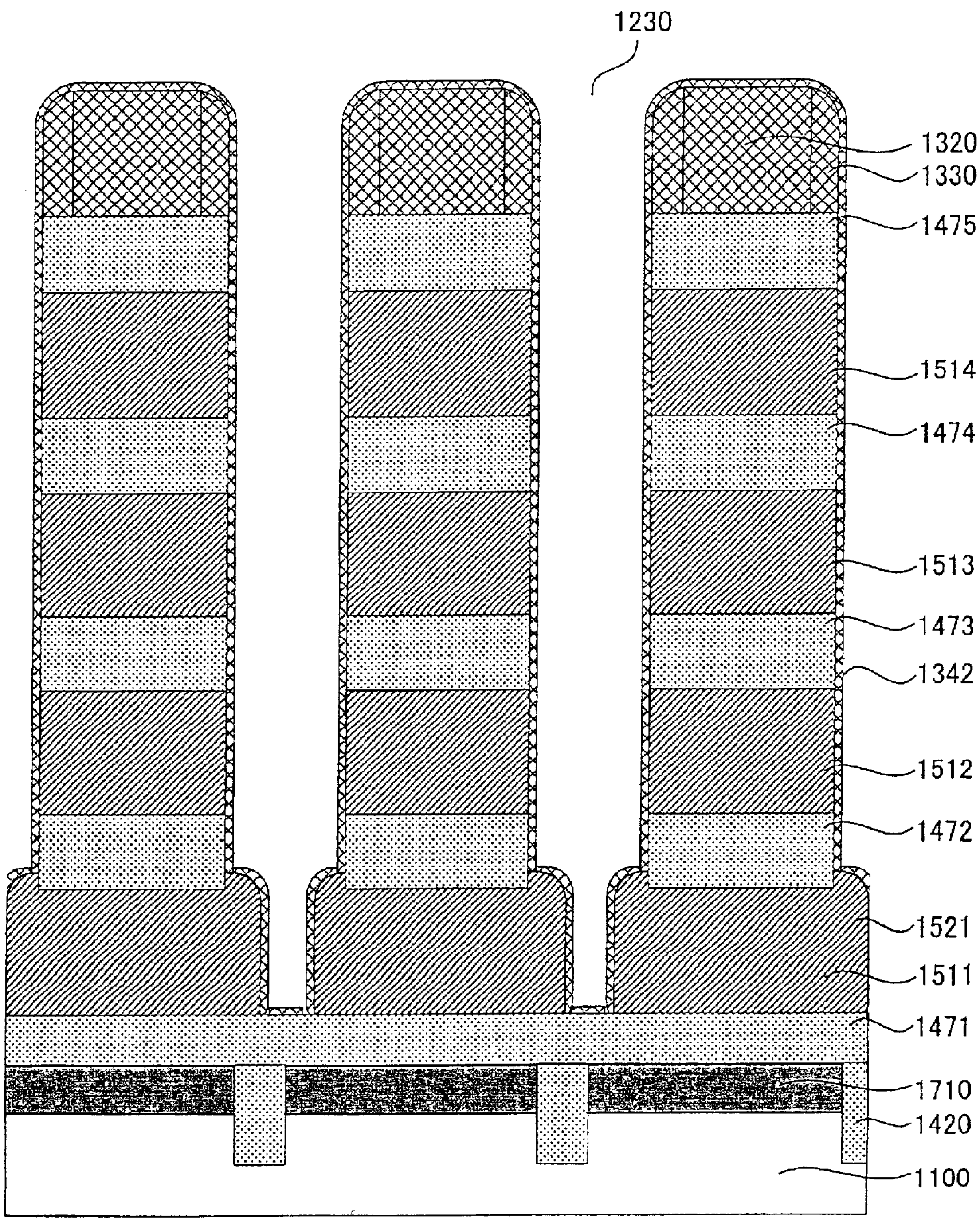

Fig. 1105
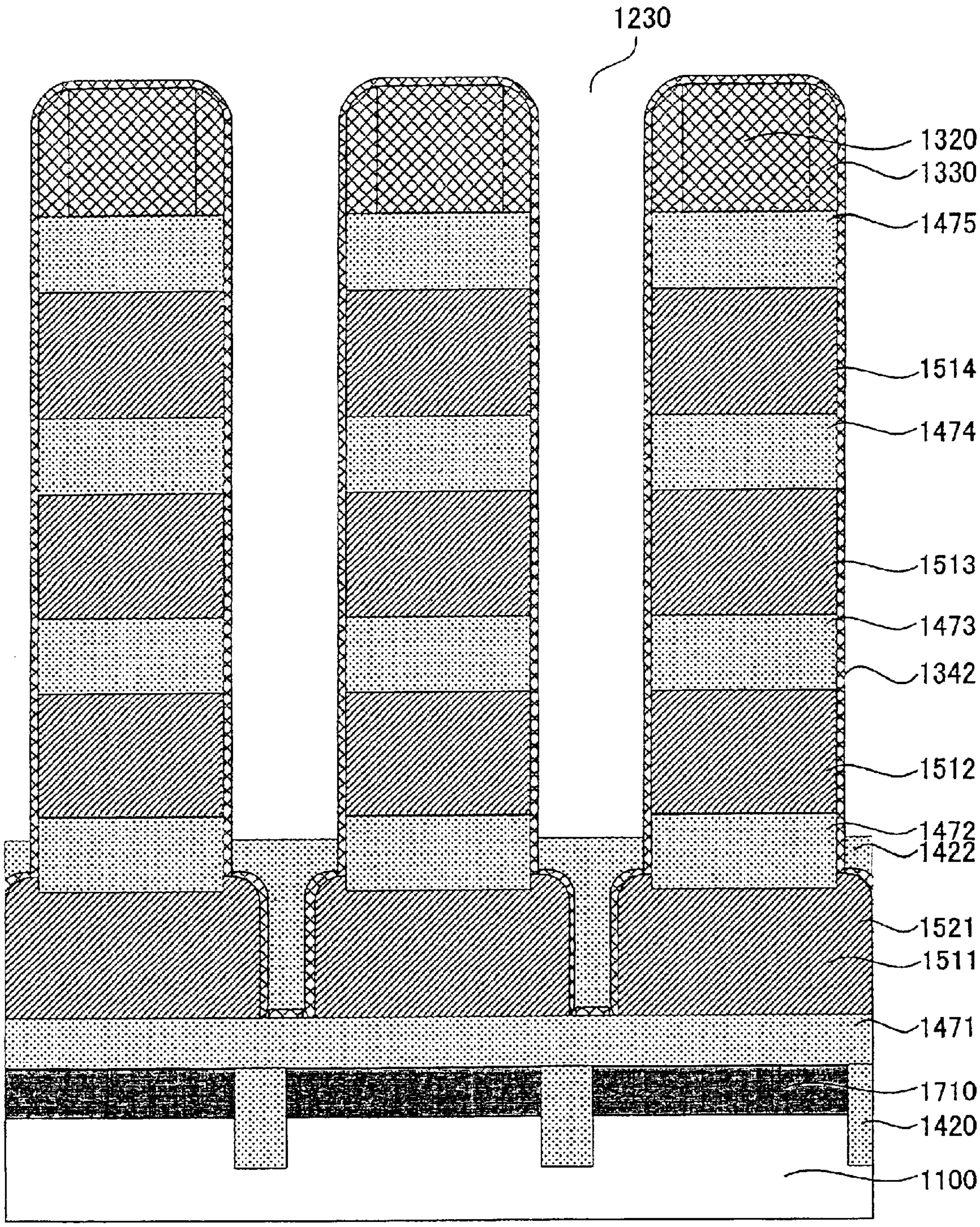

Fig. 1106
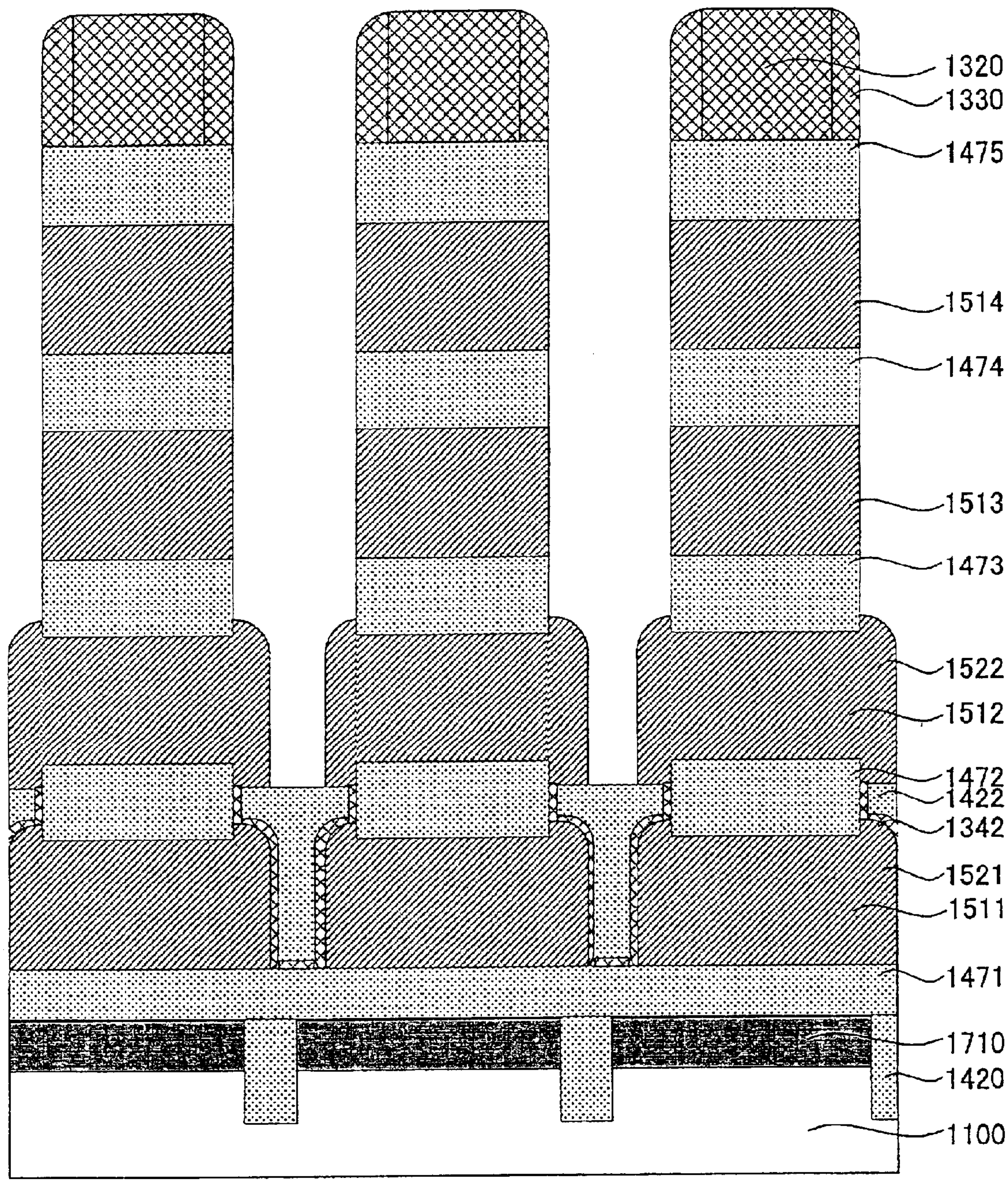

Fig. 1107
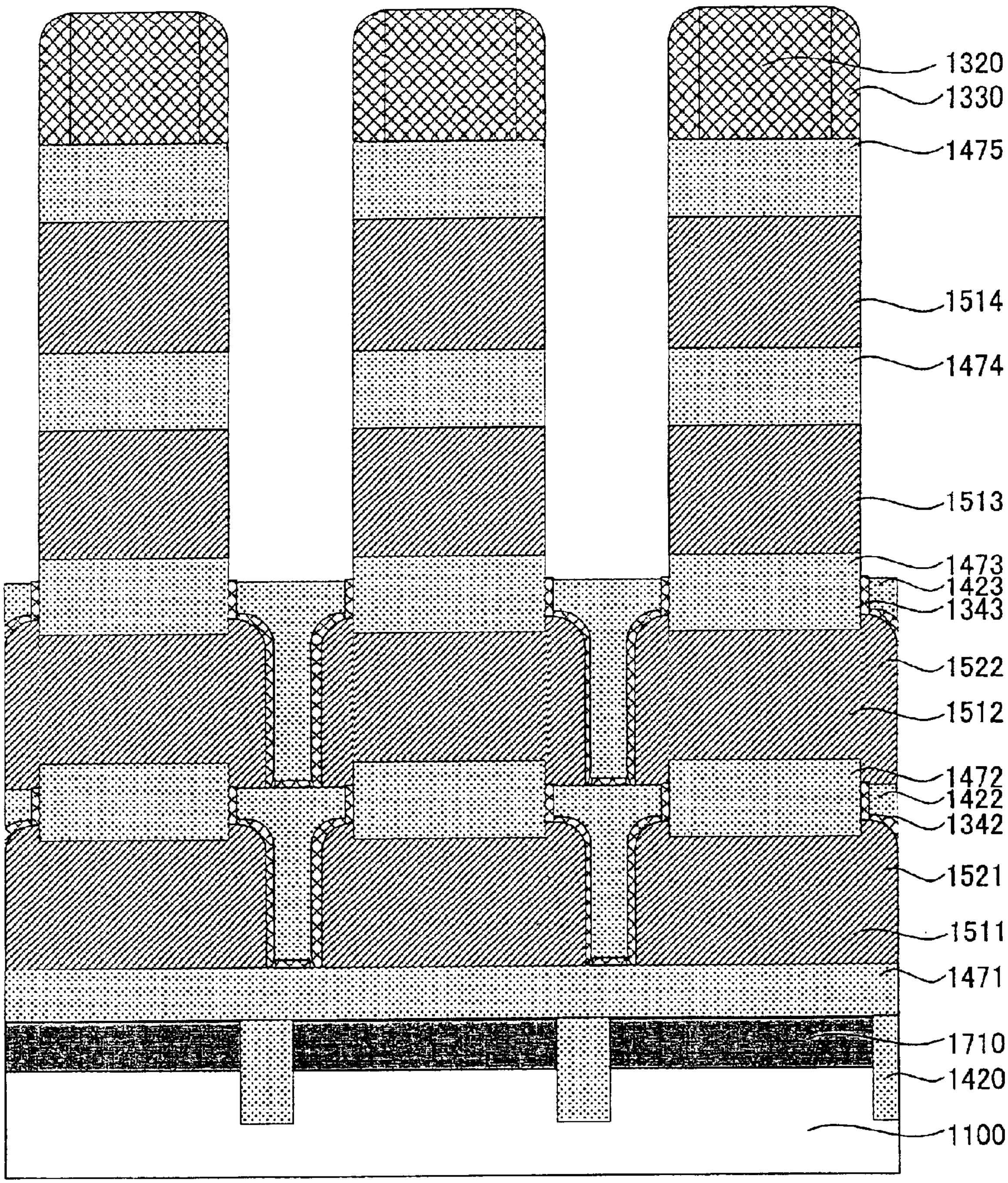

Fig. 1108
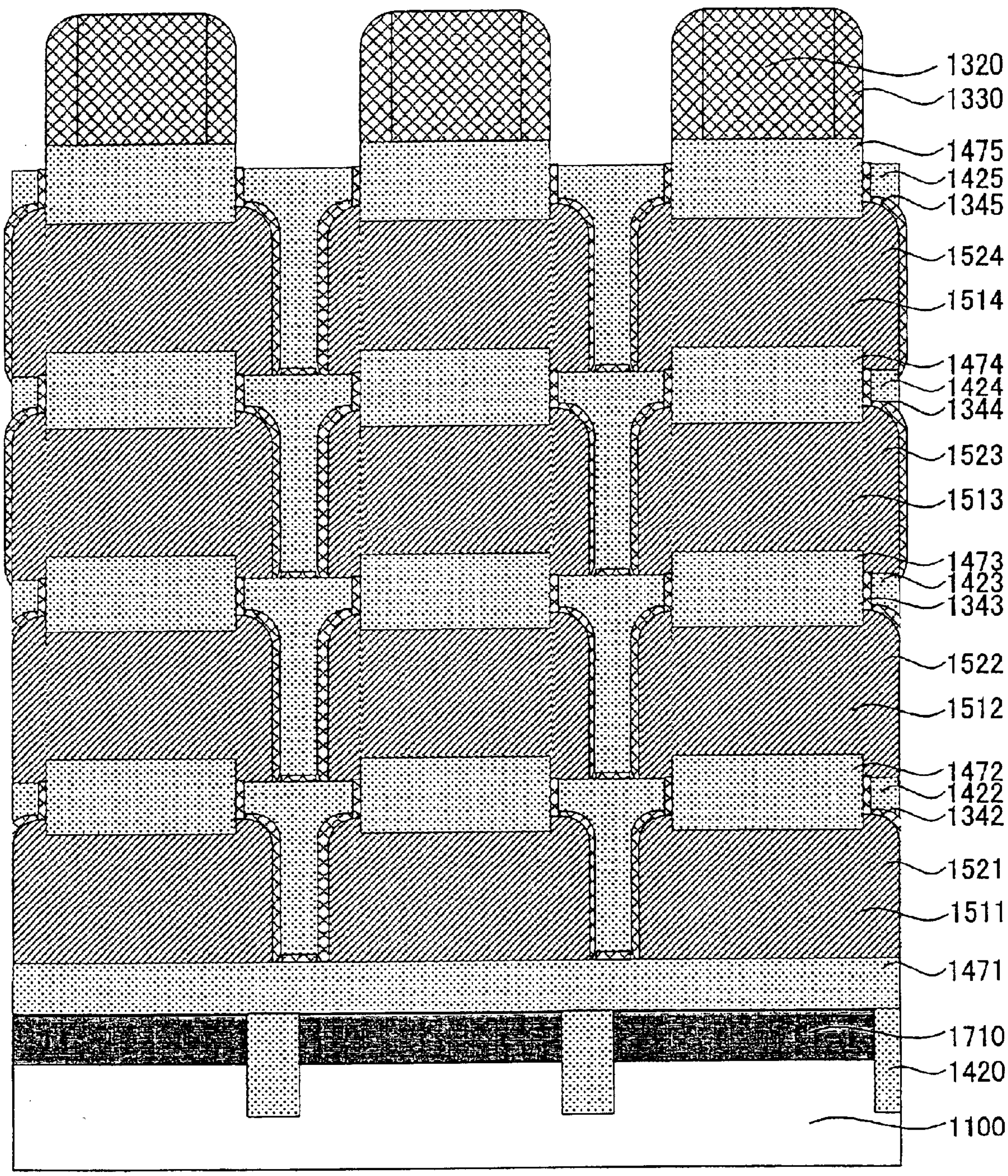

Fig. 1109
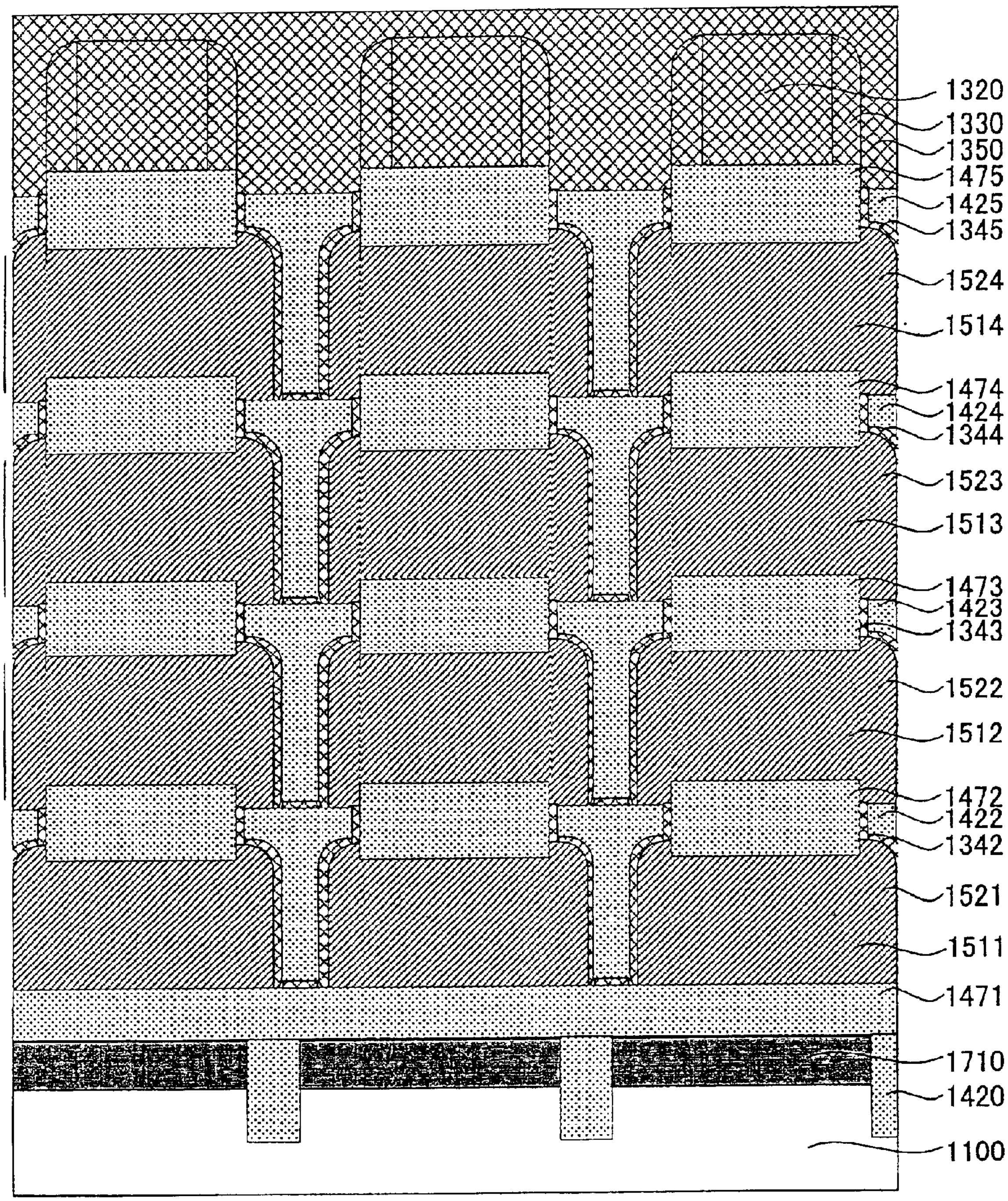

Fig. 1110
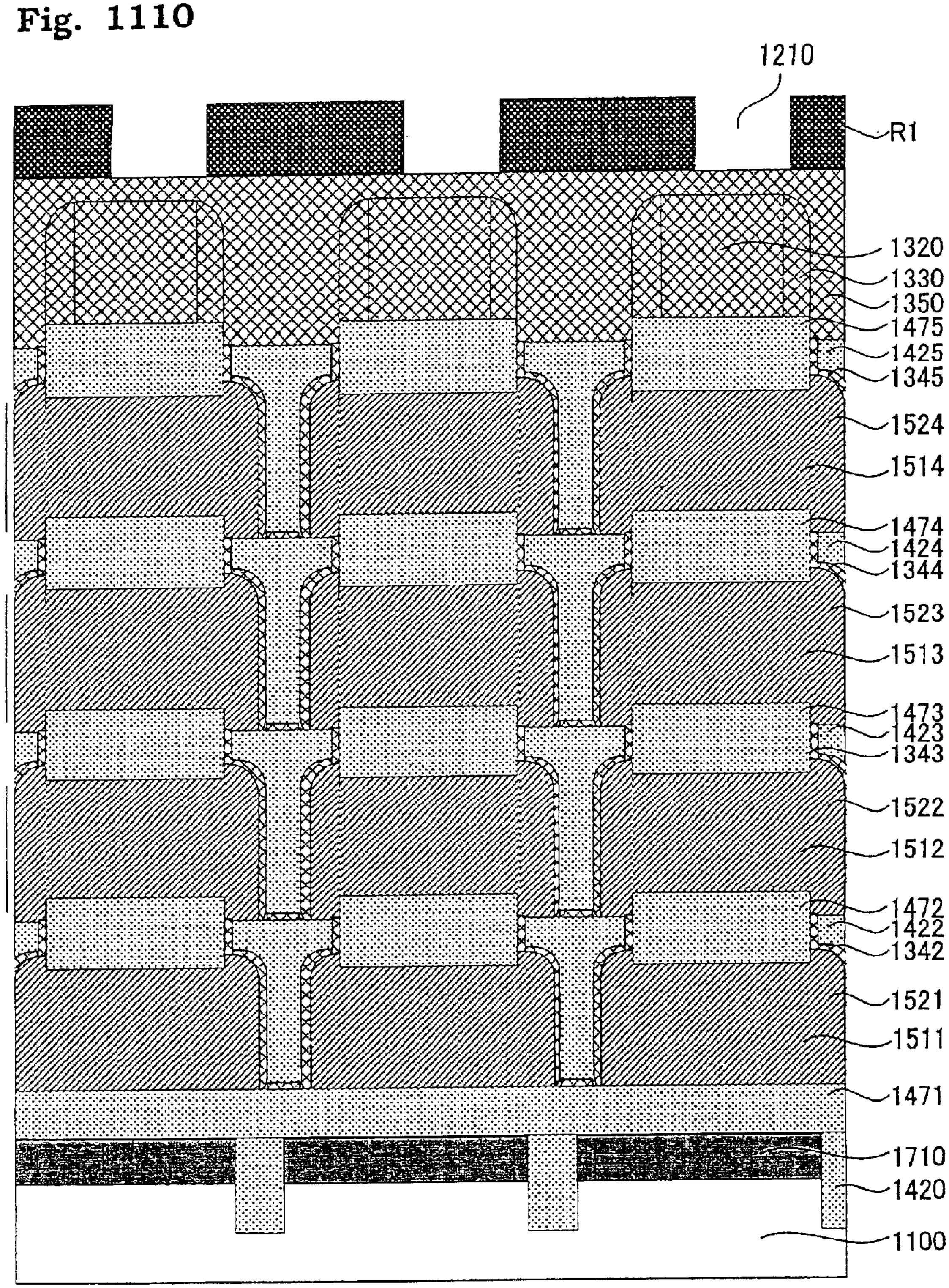

Fig. 1111
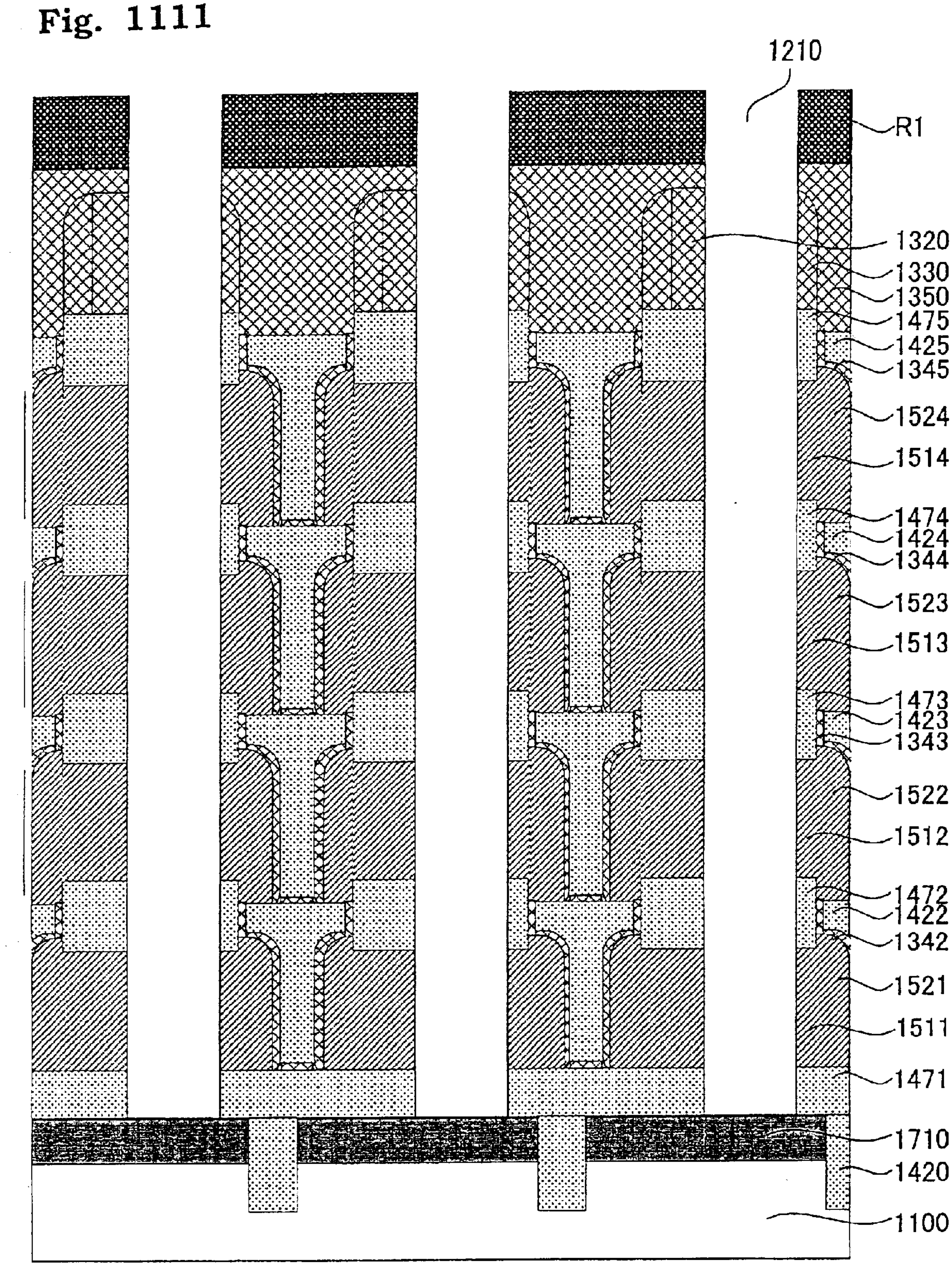

Fig. 1112
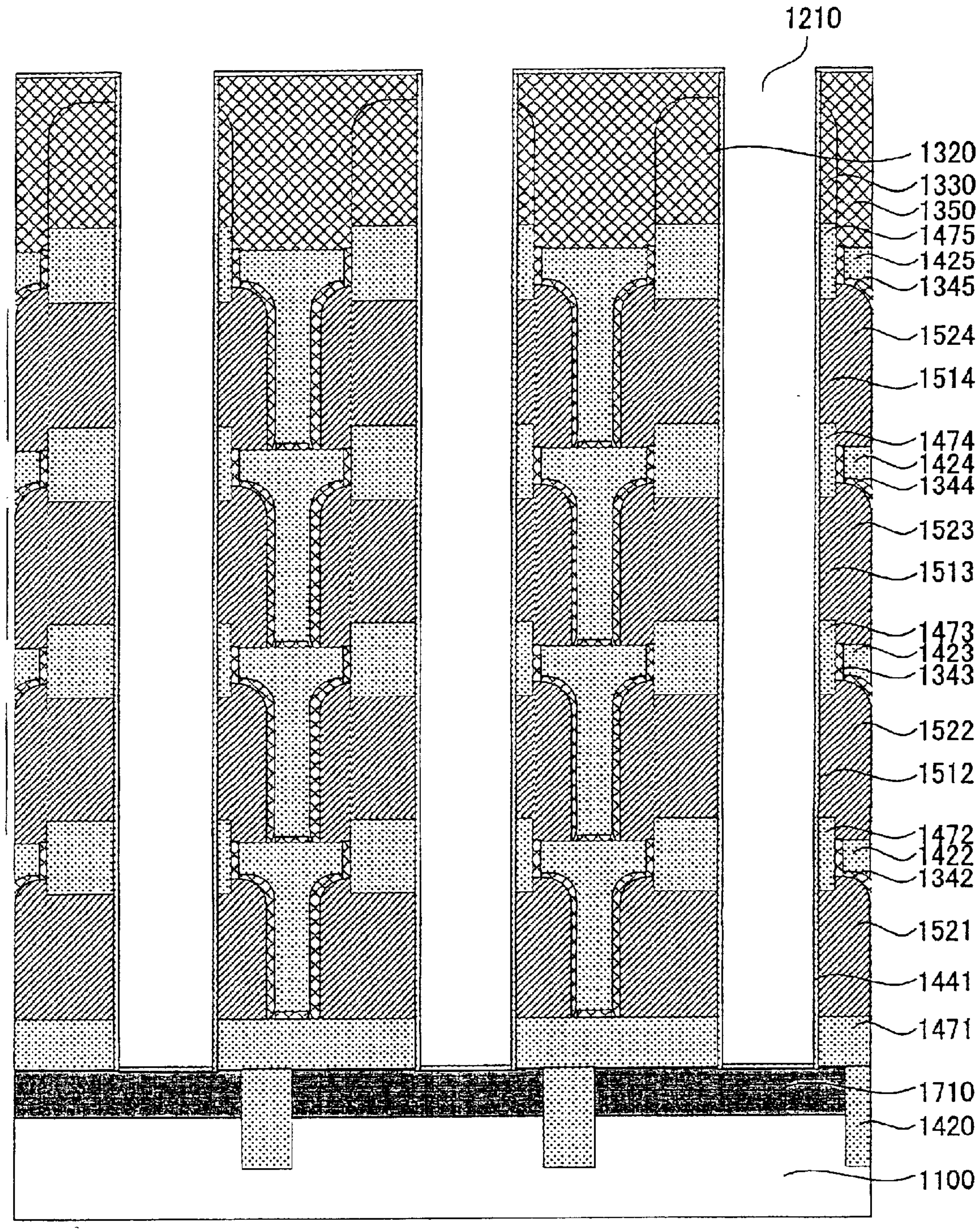

Fig. 1113
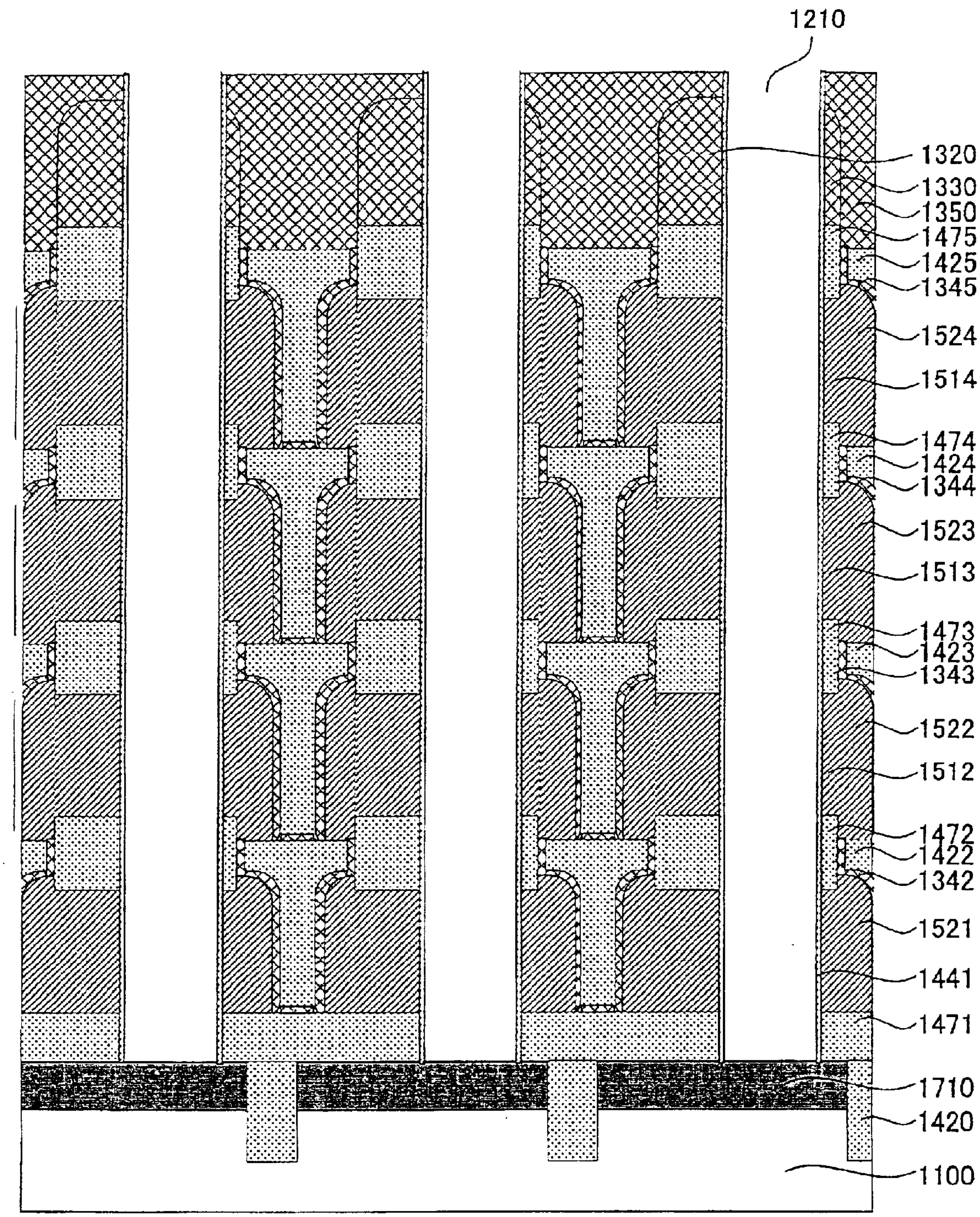

Fig. 1114
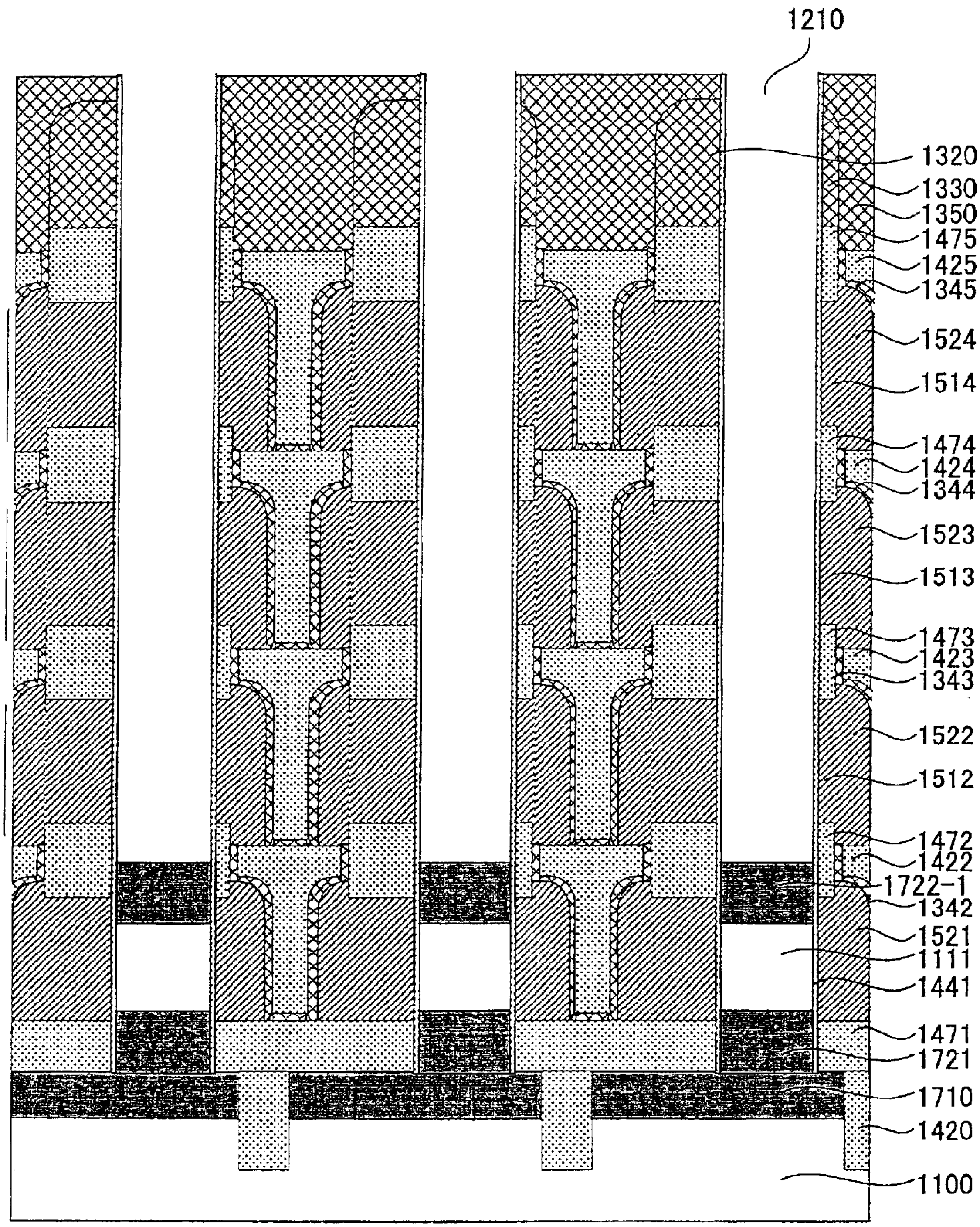

Fig. 1115
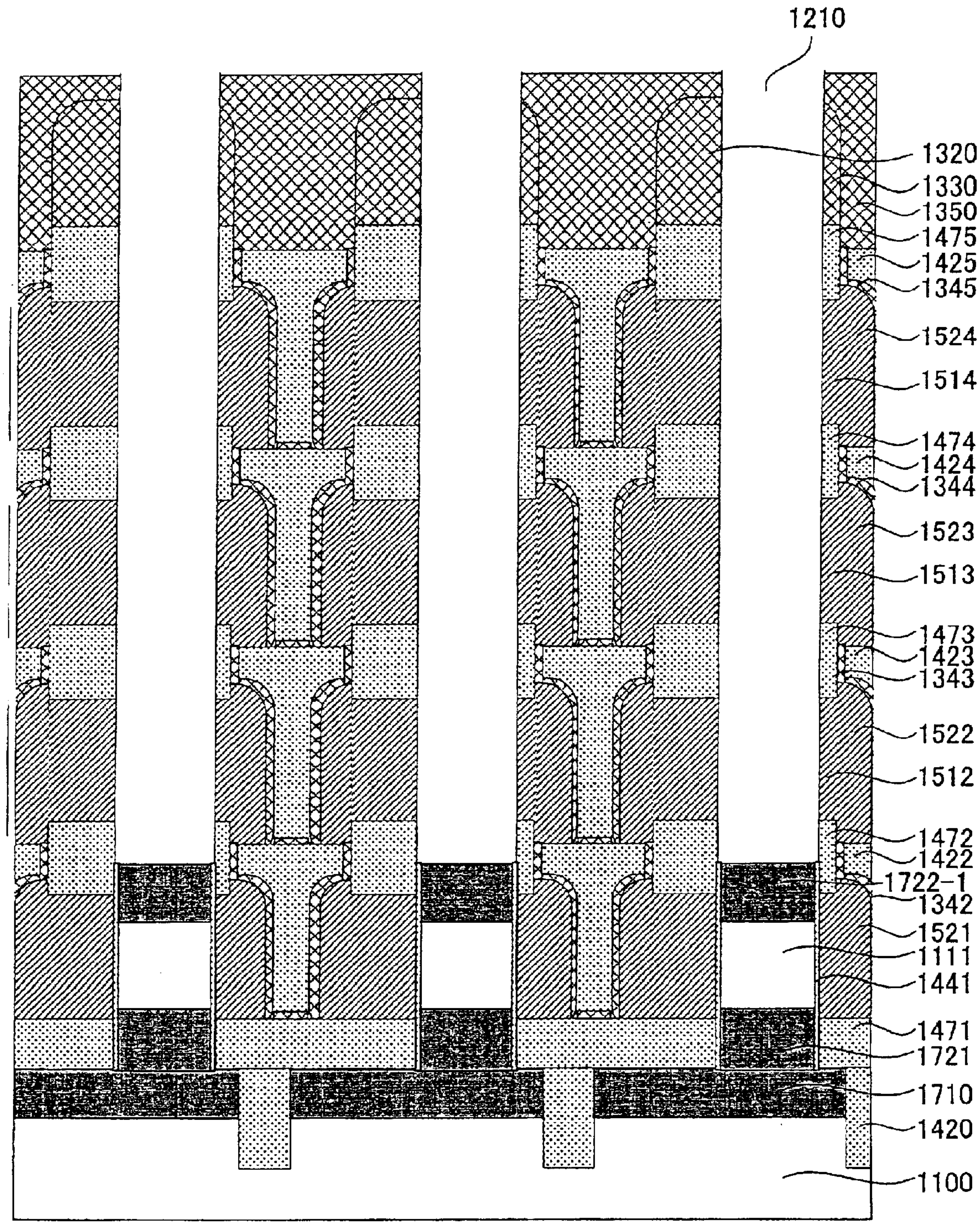

Fig. 1116
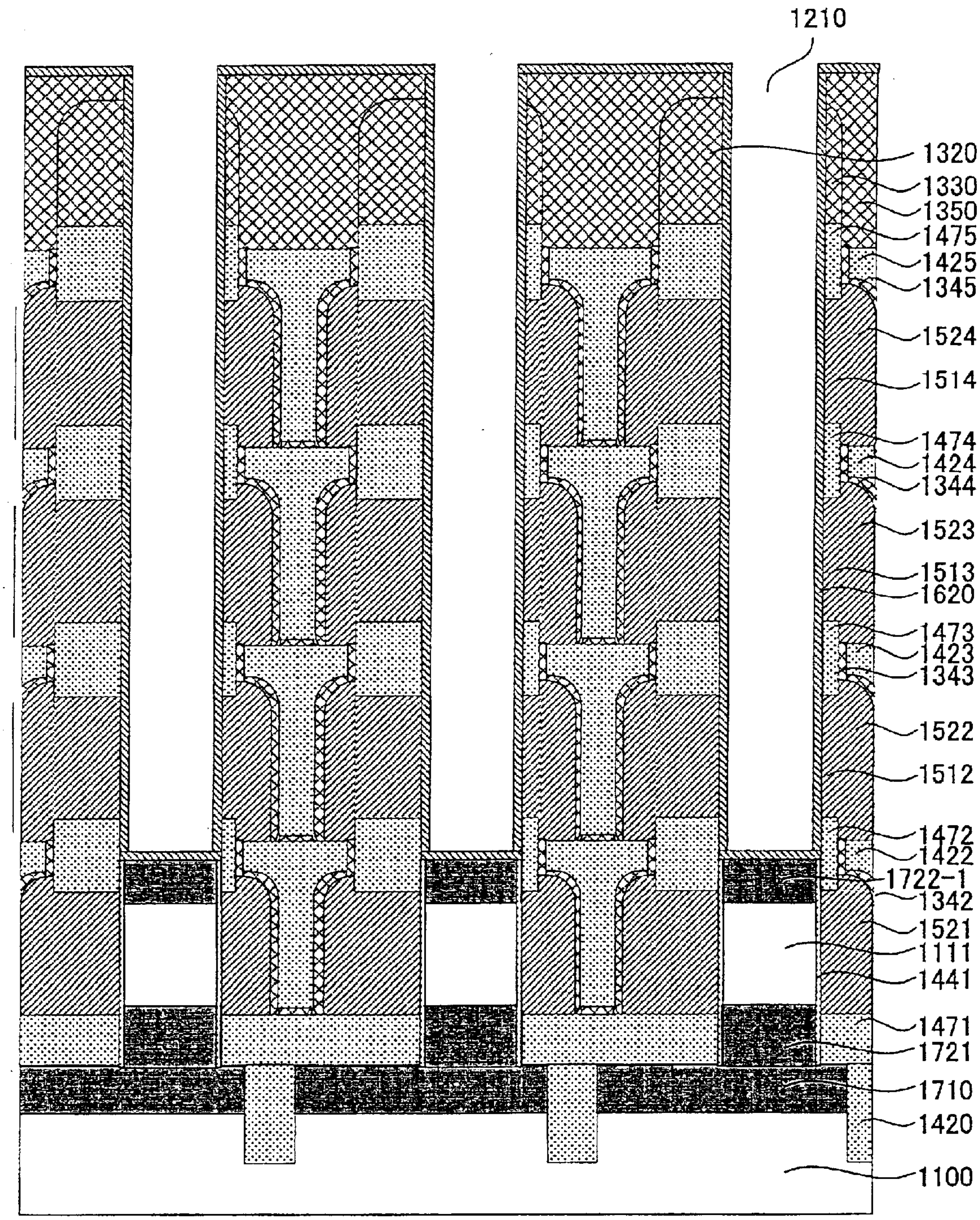

Fig. 1117
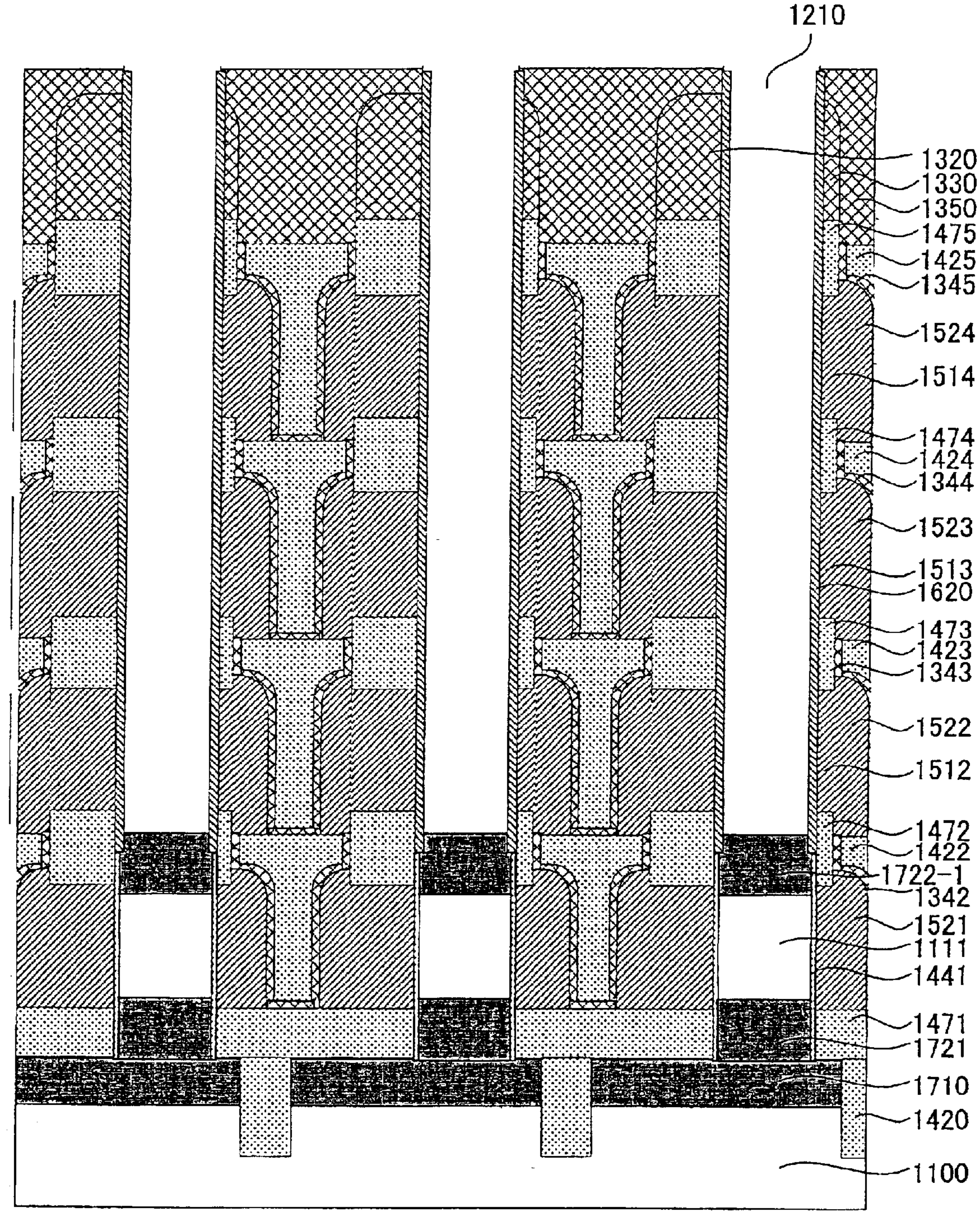

Fig. 1118
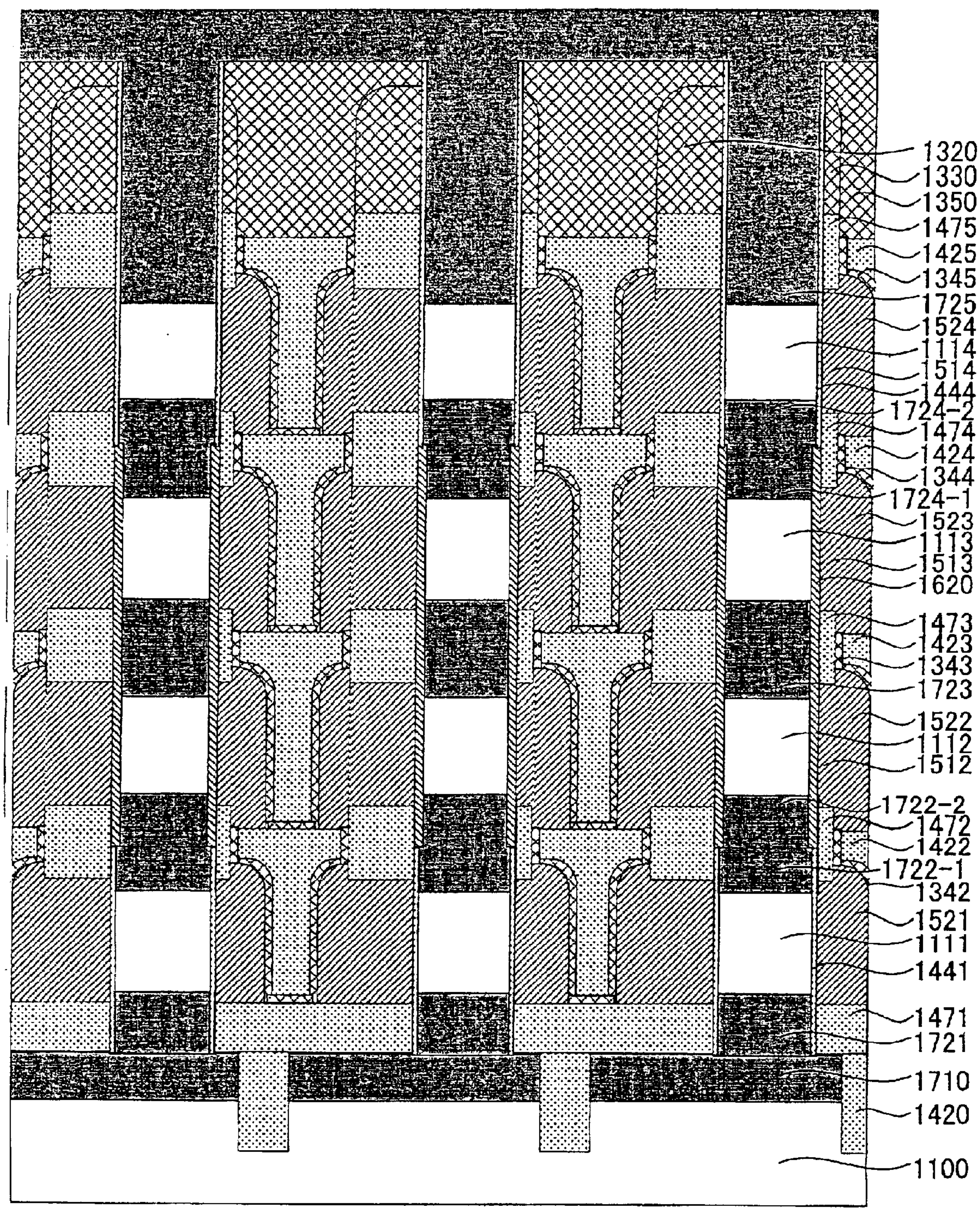

Fig. 1119
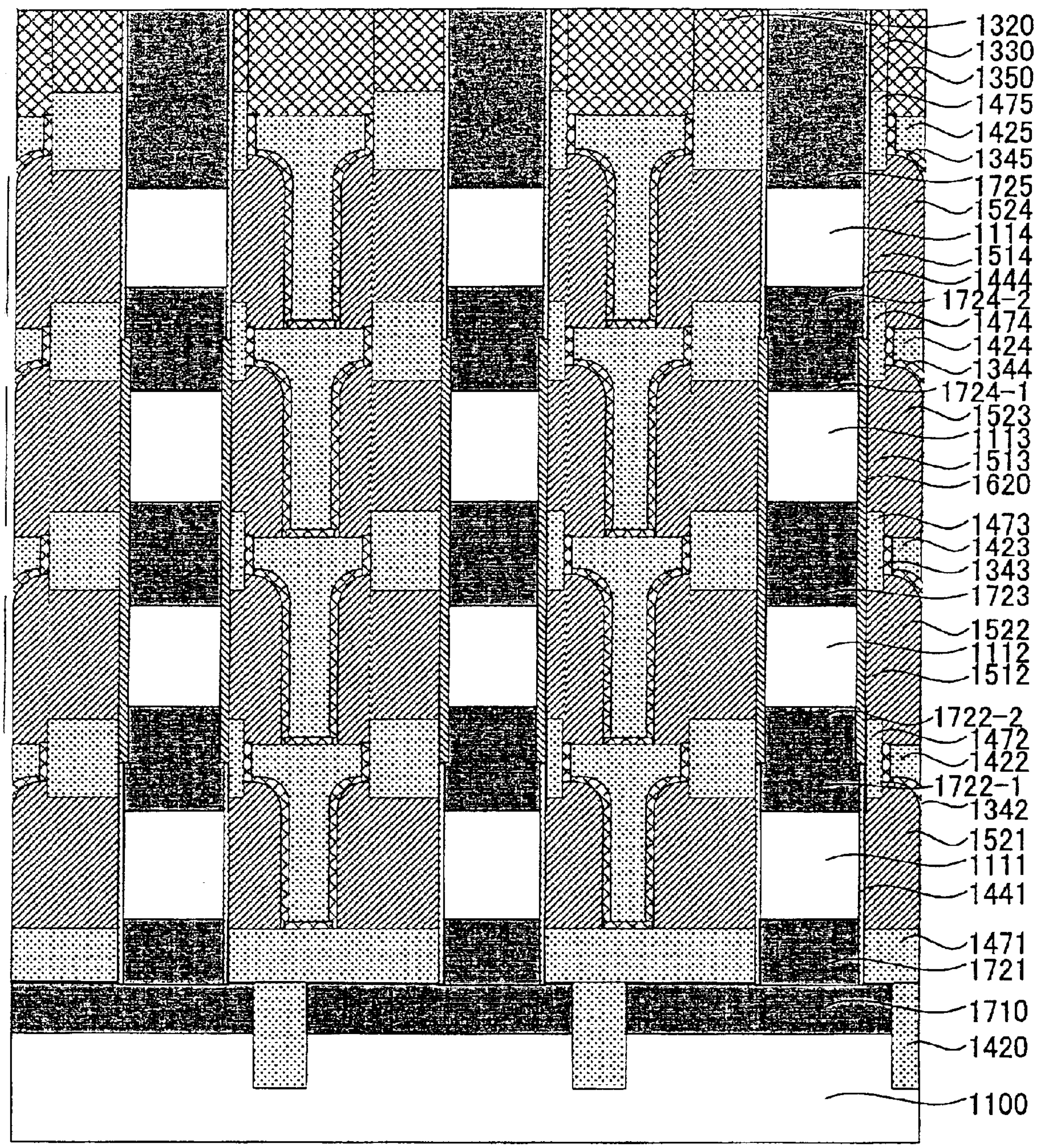

Fig. 1120
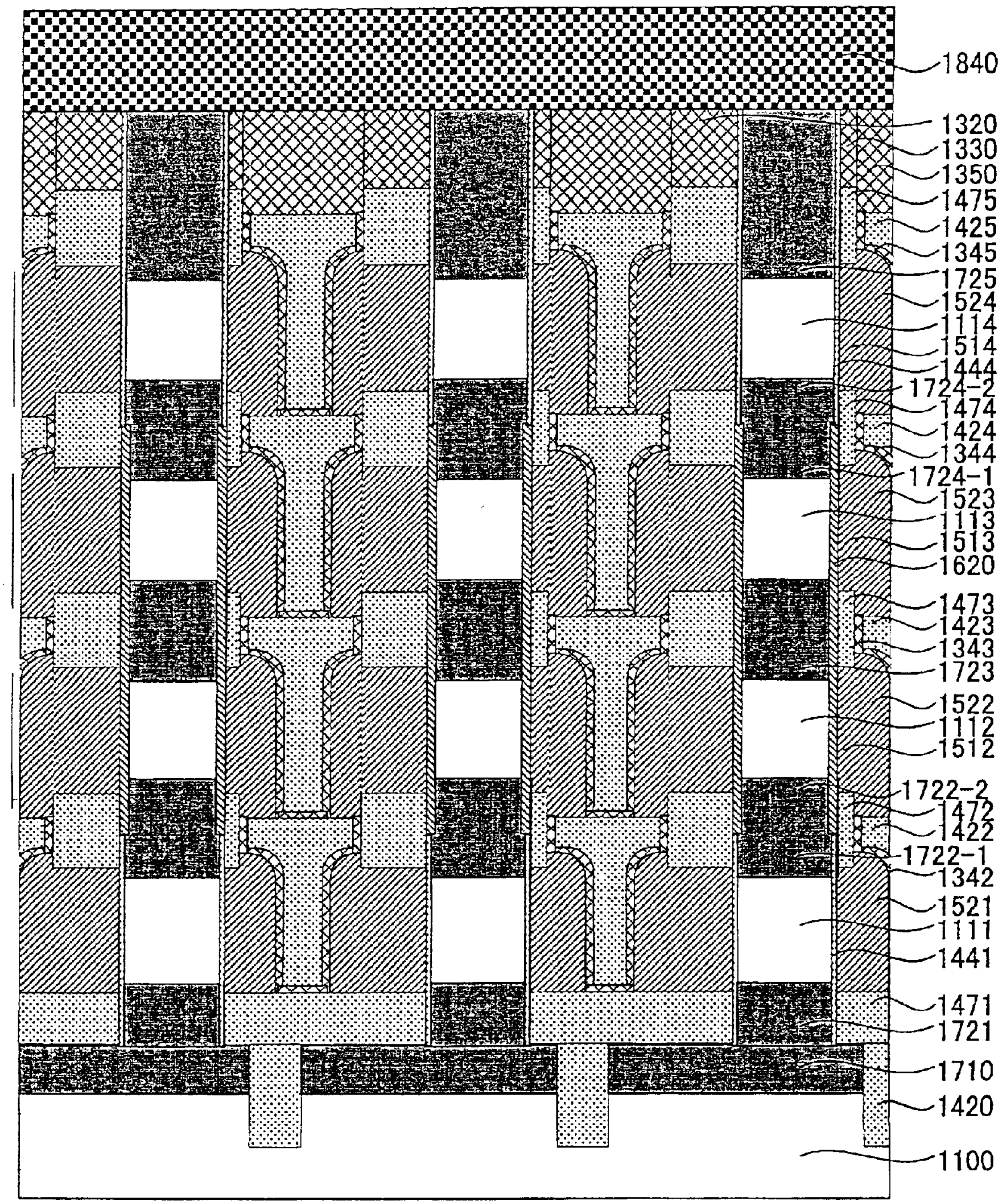

Fig. 1121
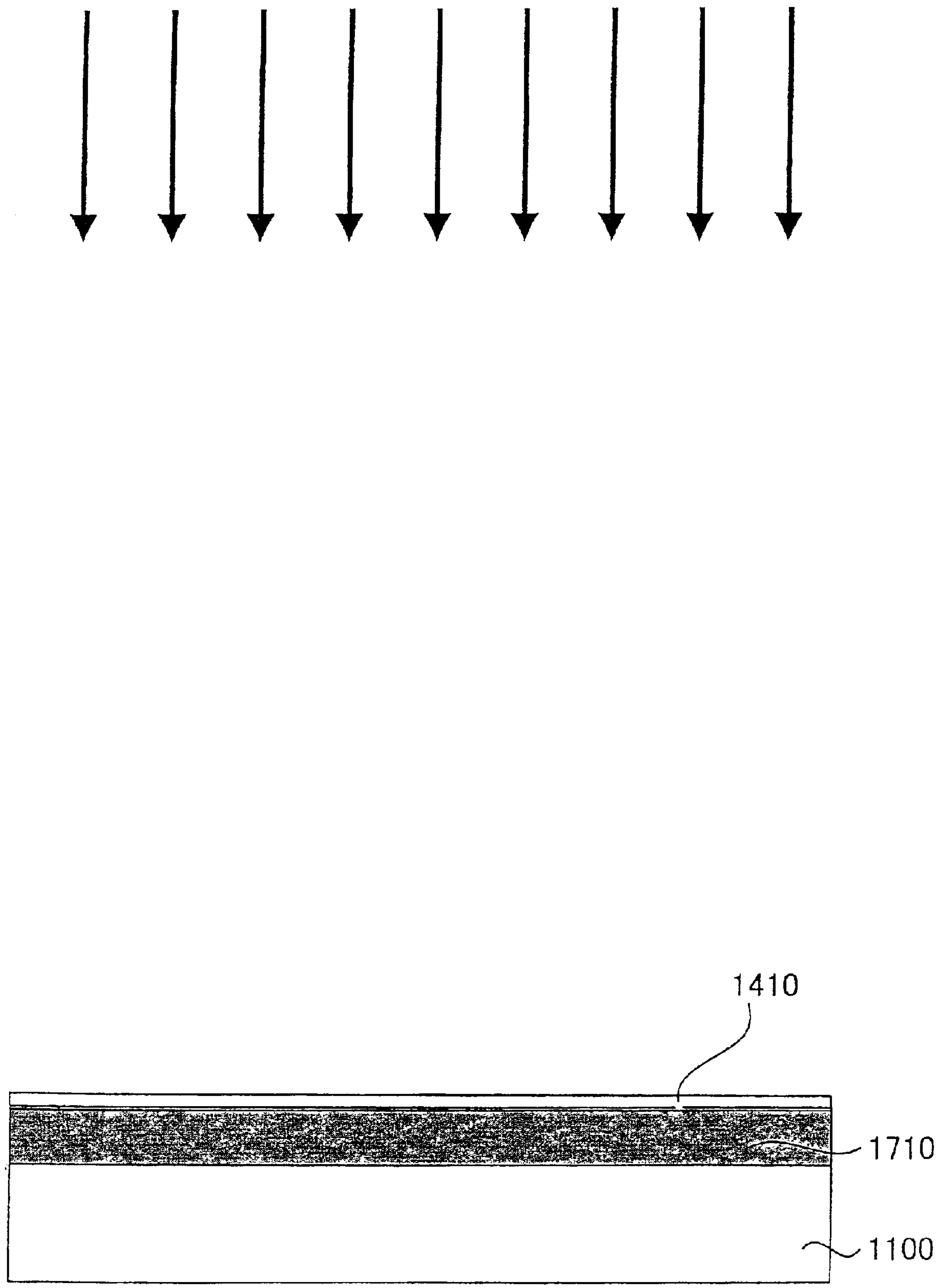

Fig. 1122
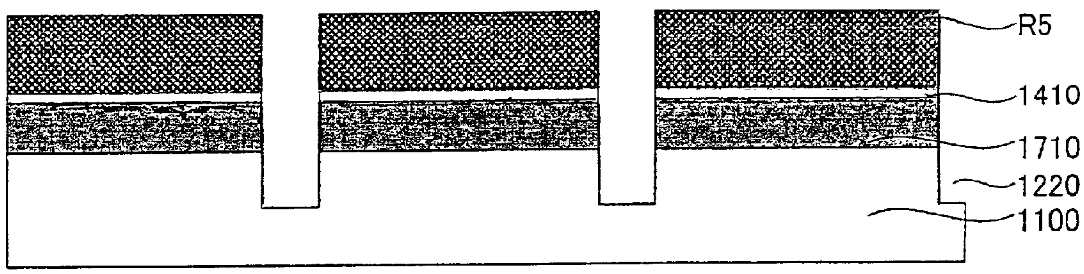
Fig. 1123
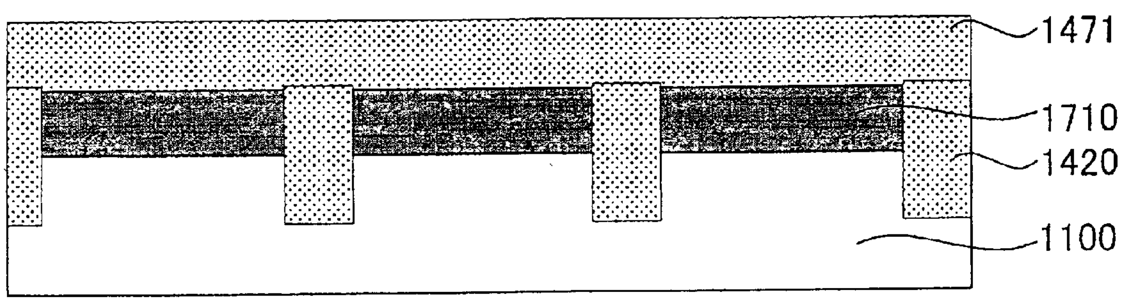

Fig. 1124
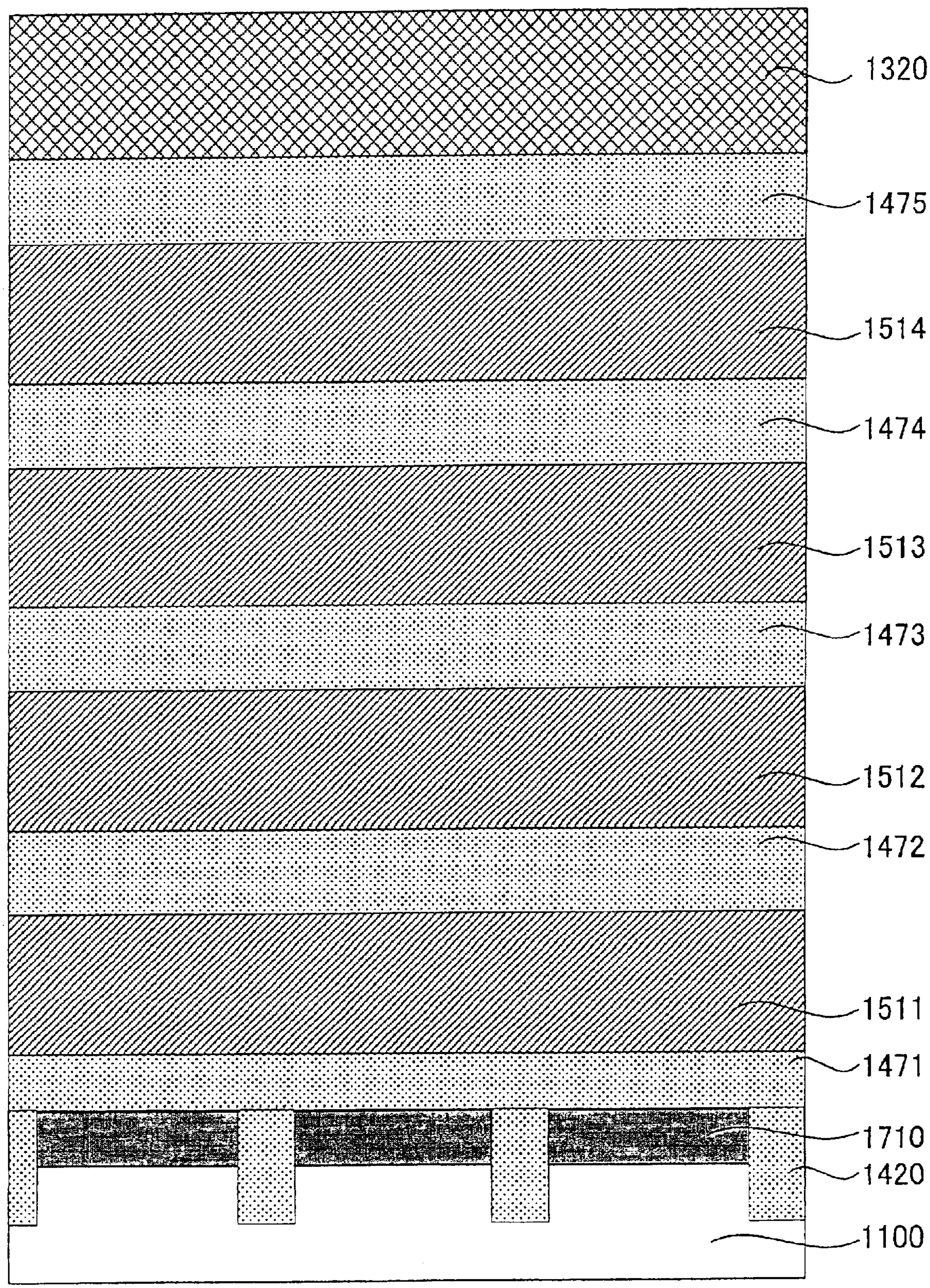

Fig. 1125
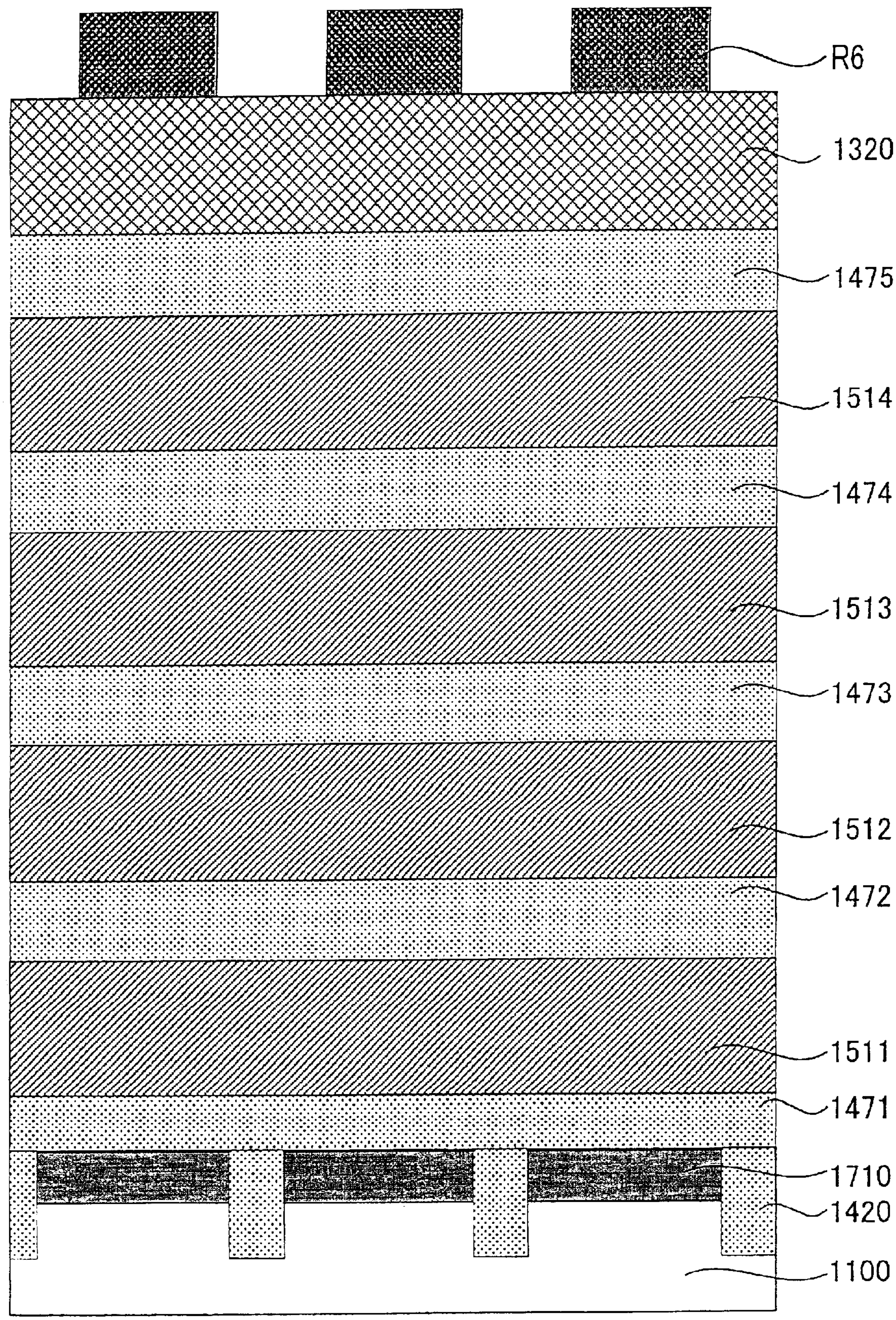

Fig. 1126
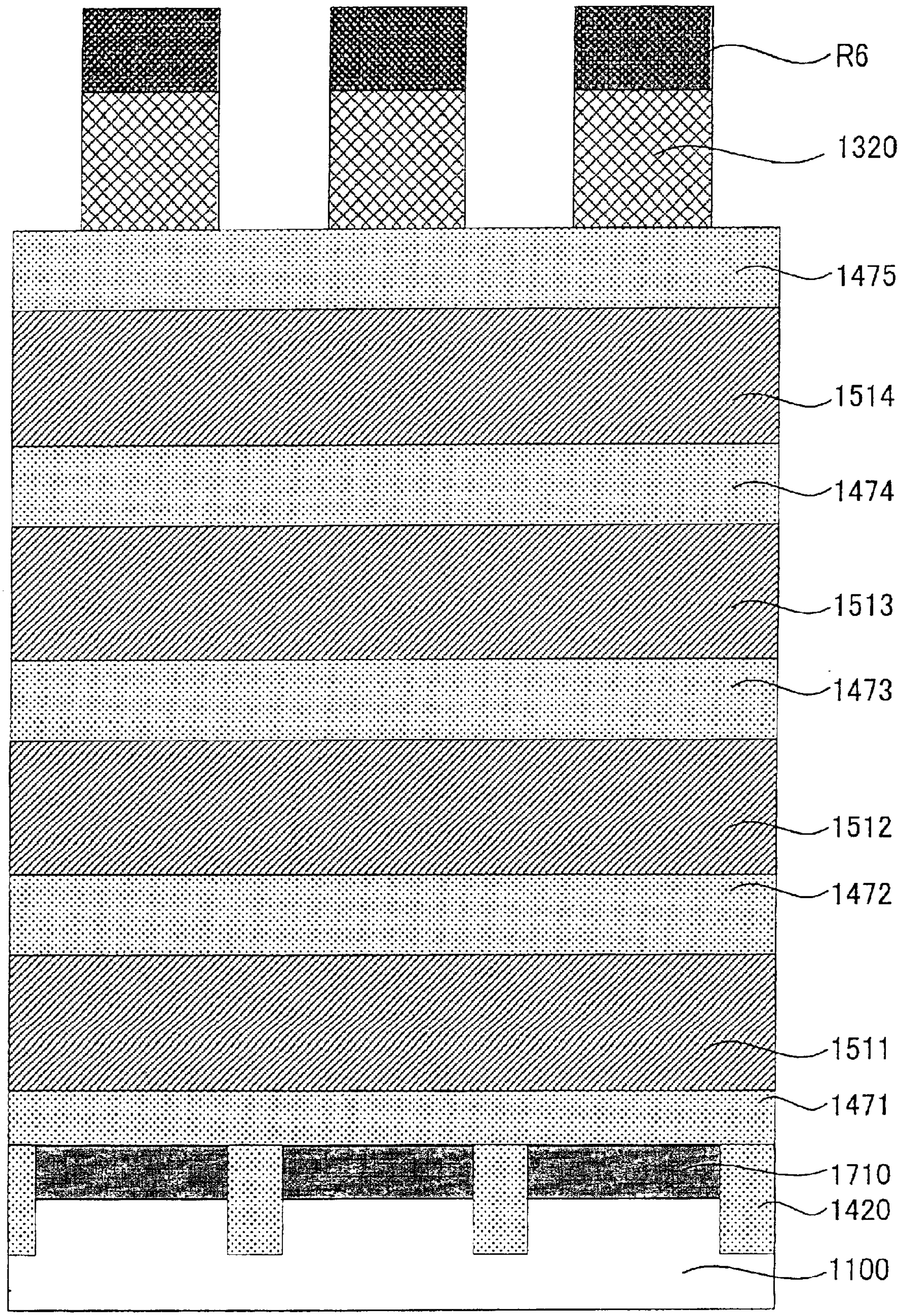

Fig. 1127
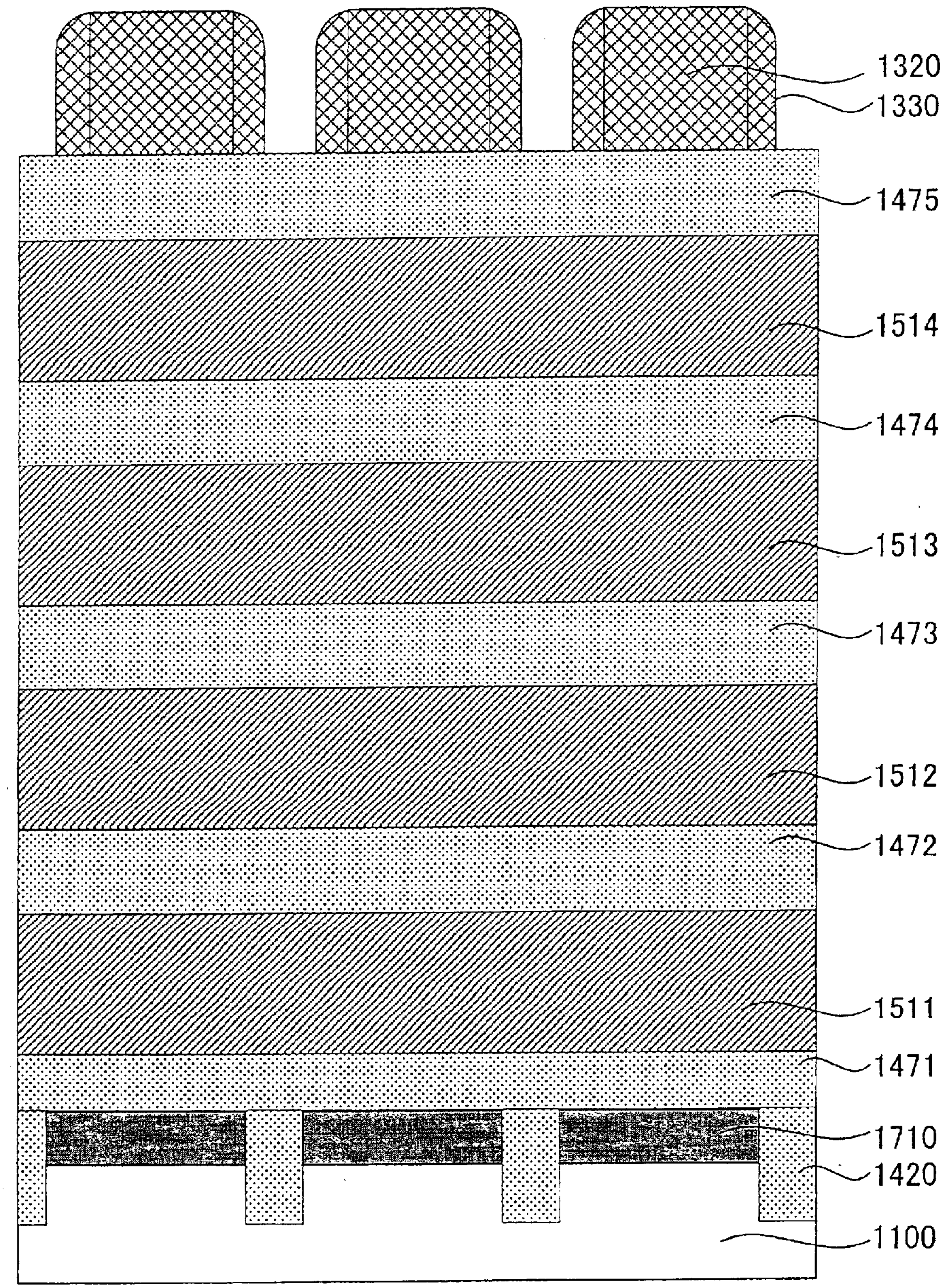

Fig. 1128
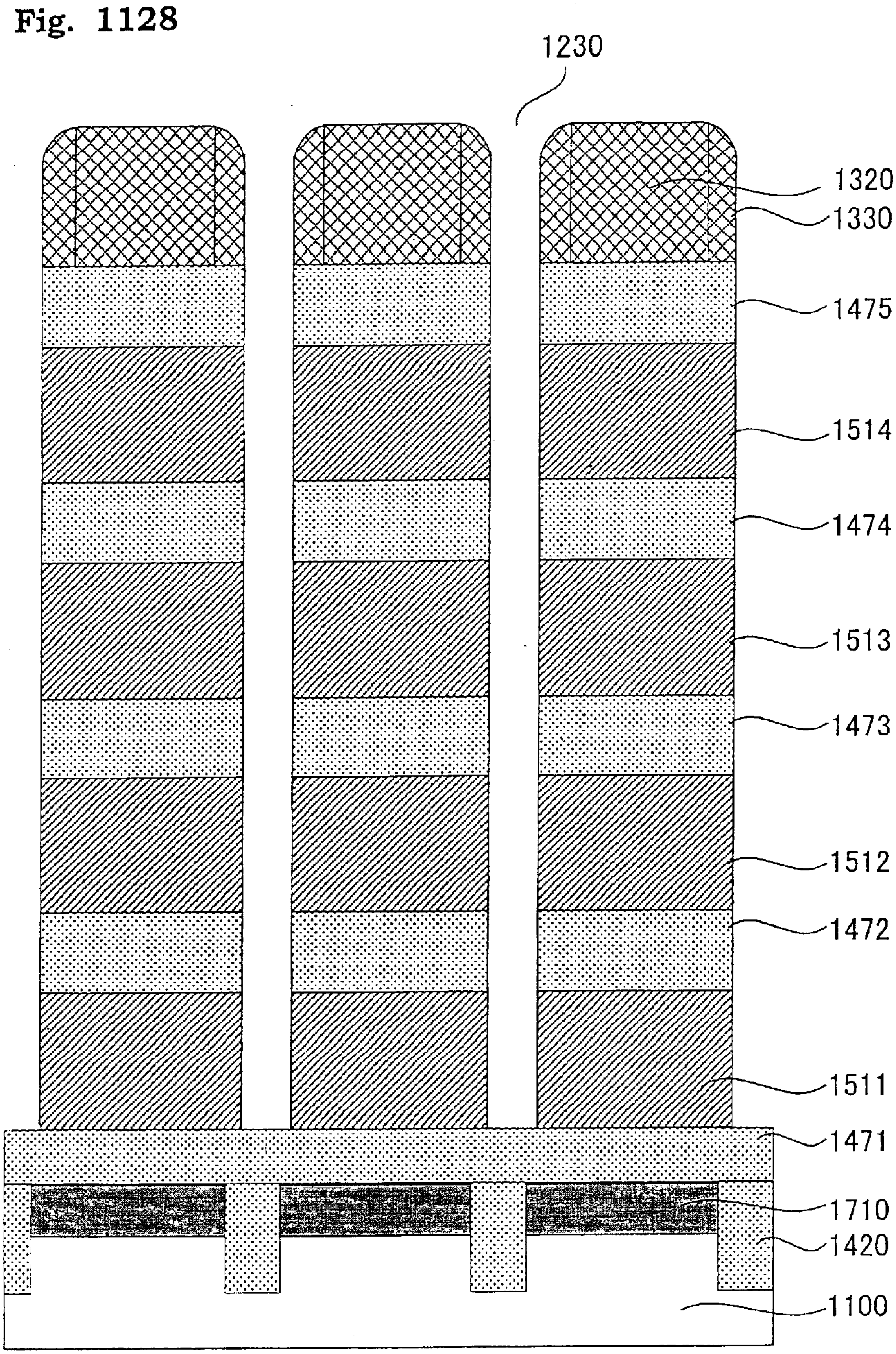

Fig. 1129
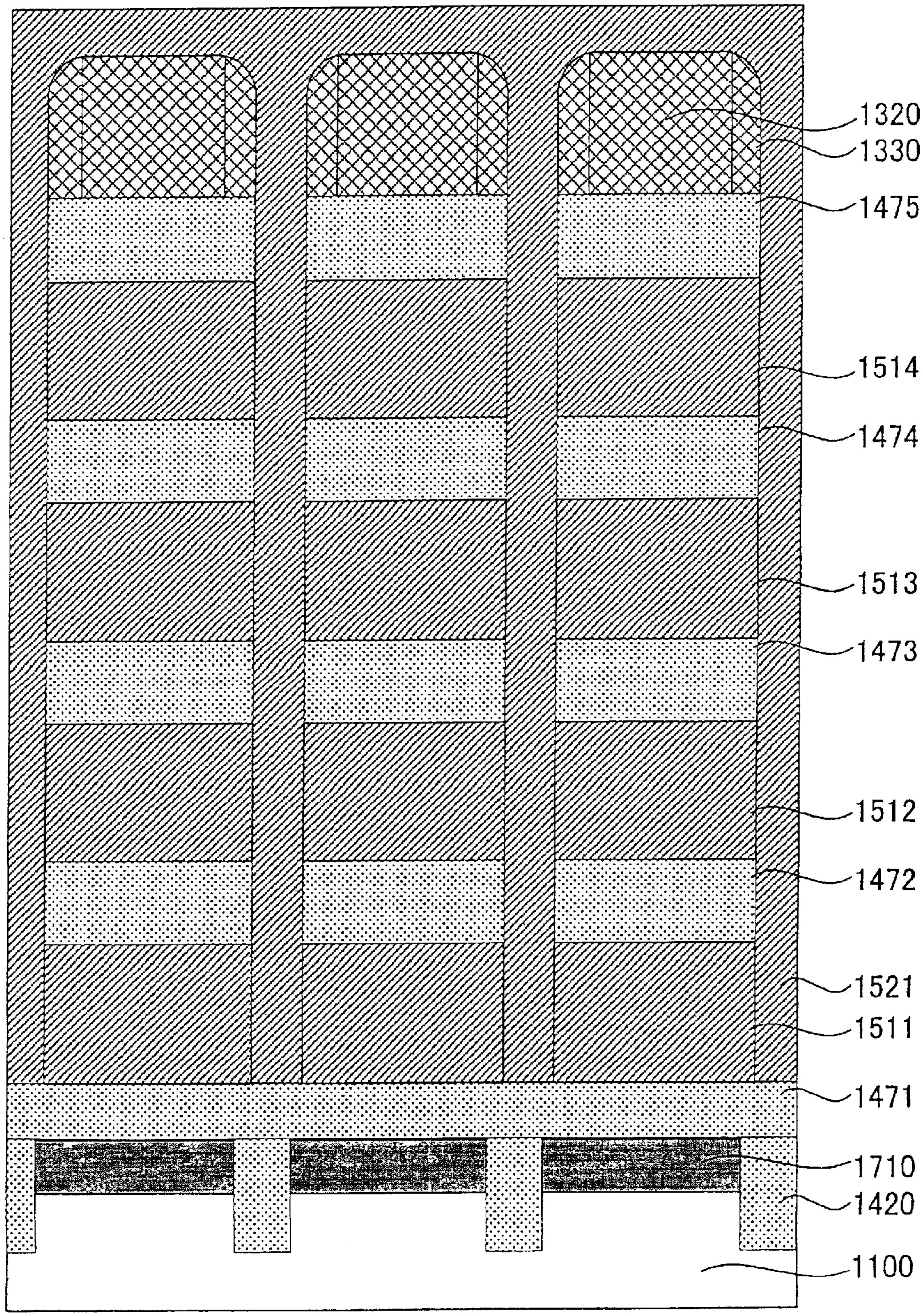

Fig. 1130
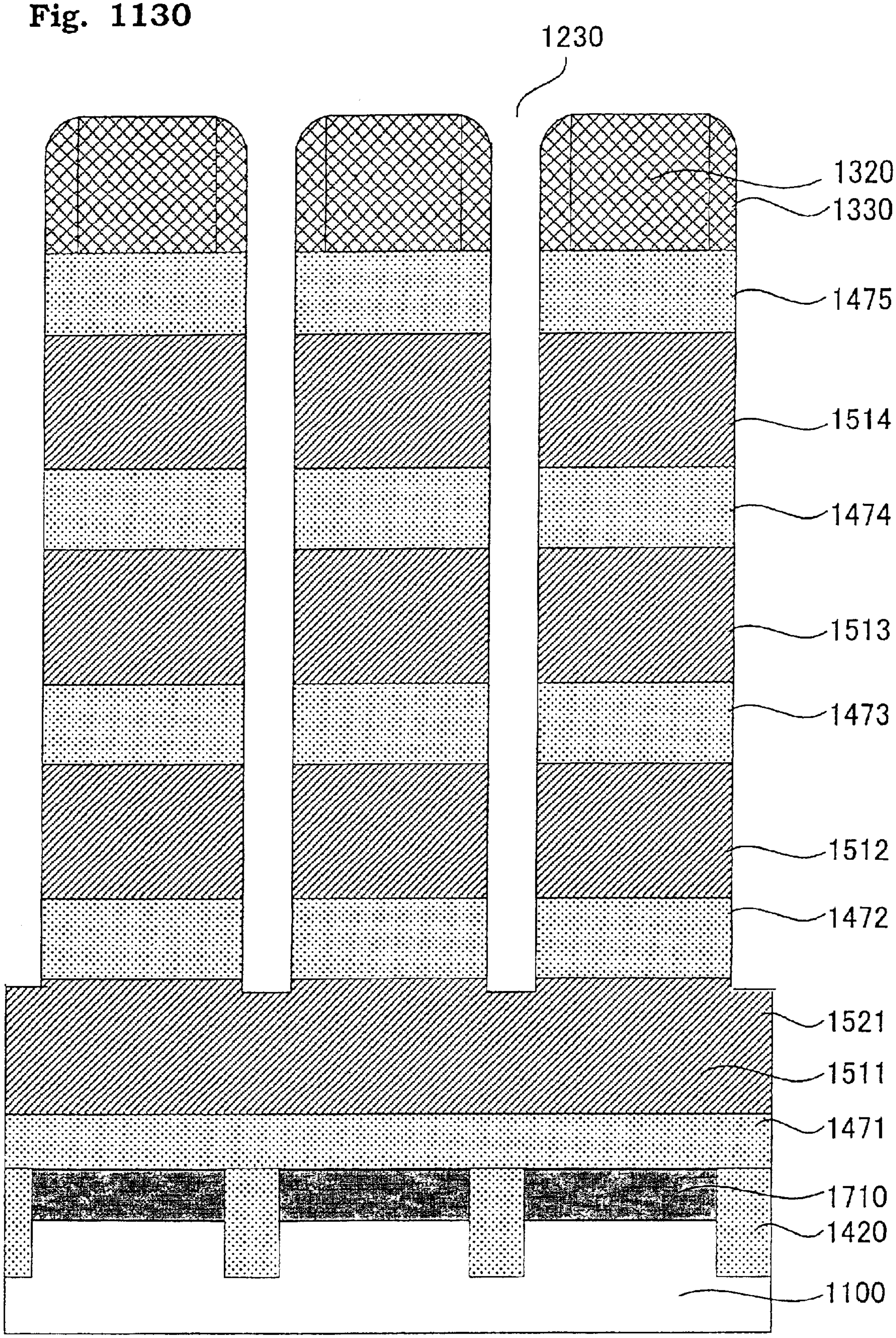

Fig. 1131
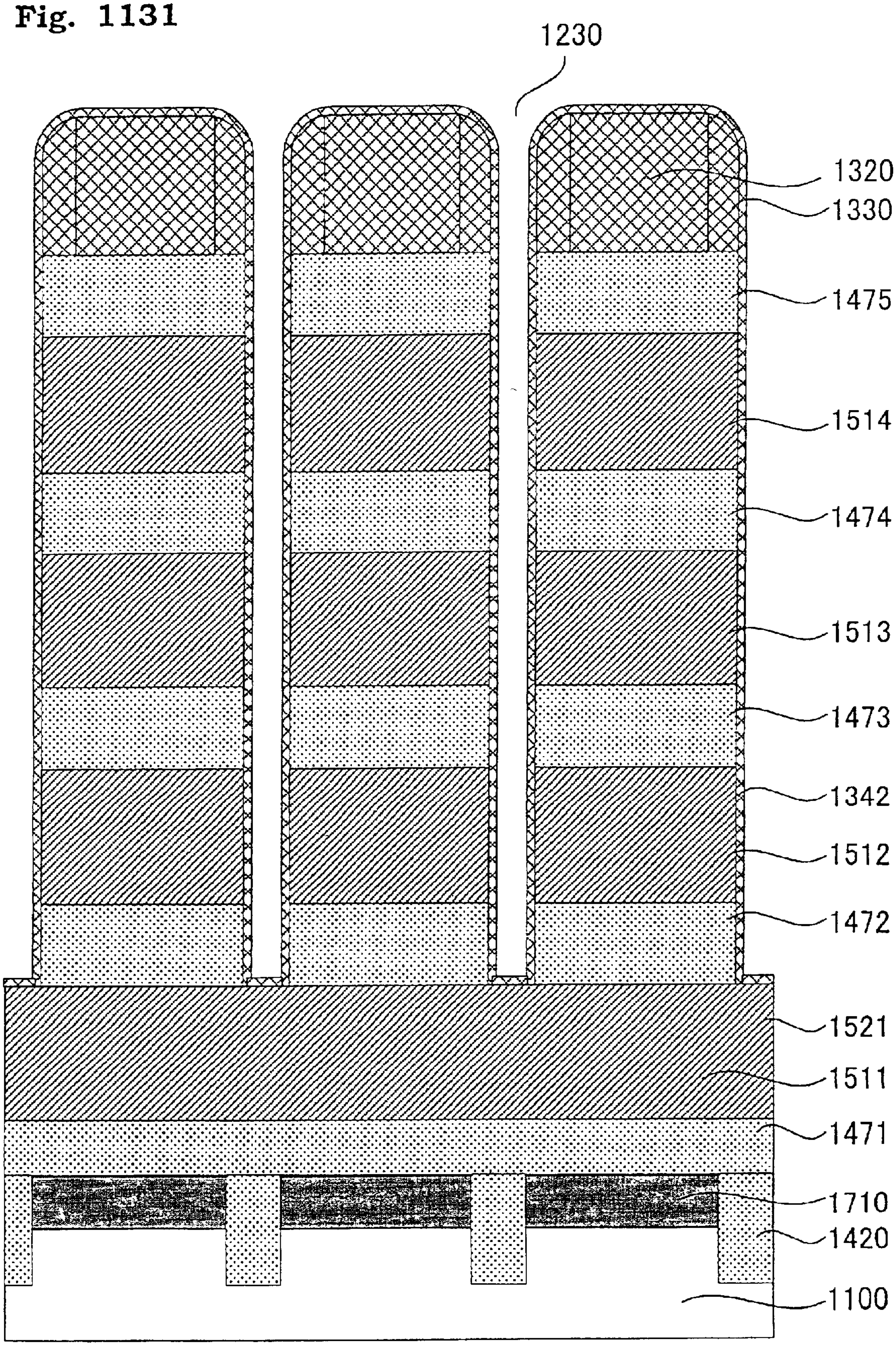

Fig. 1132
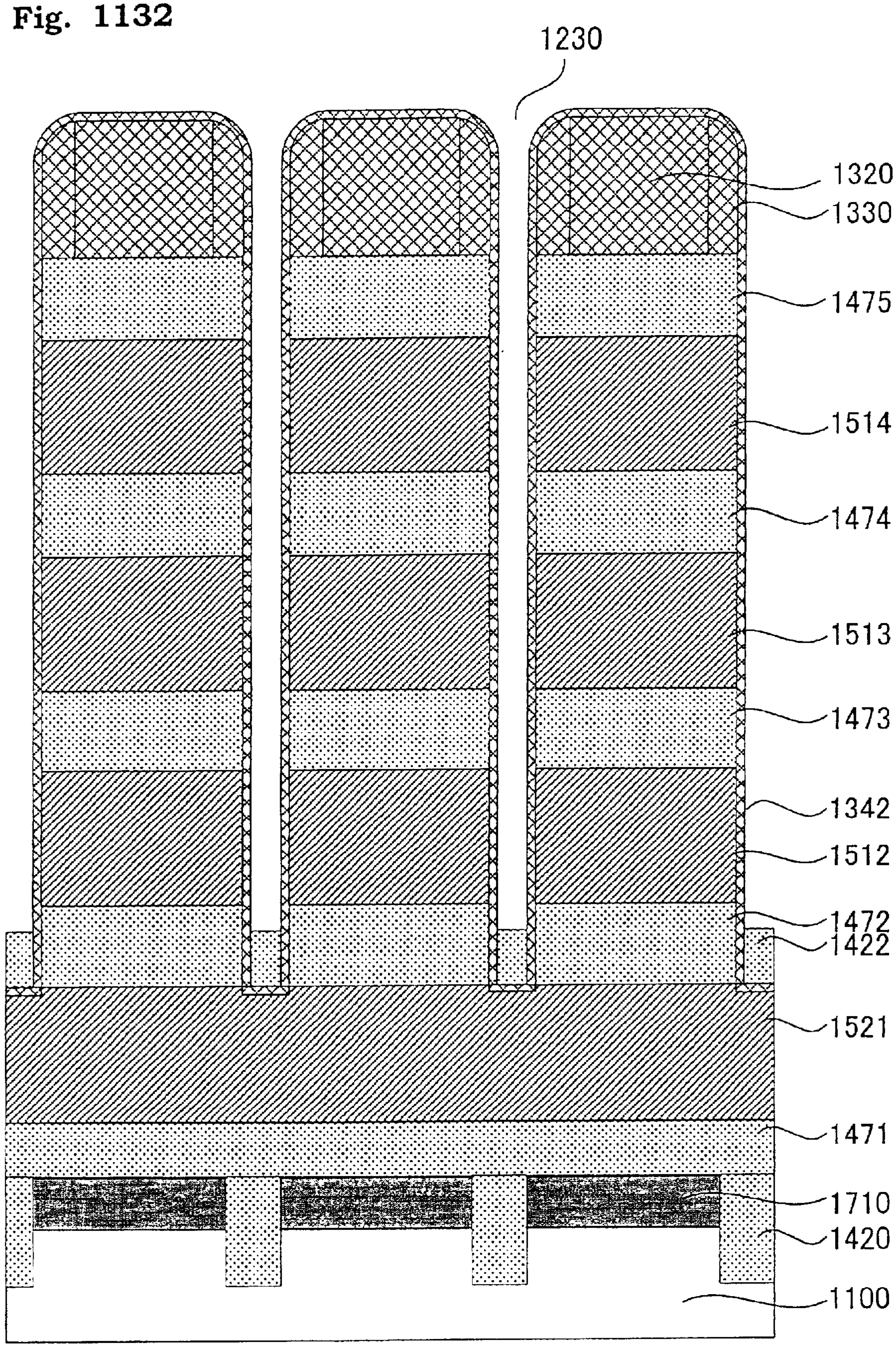

Fig. 1133
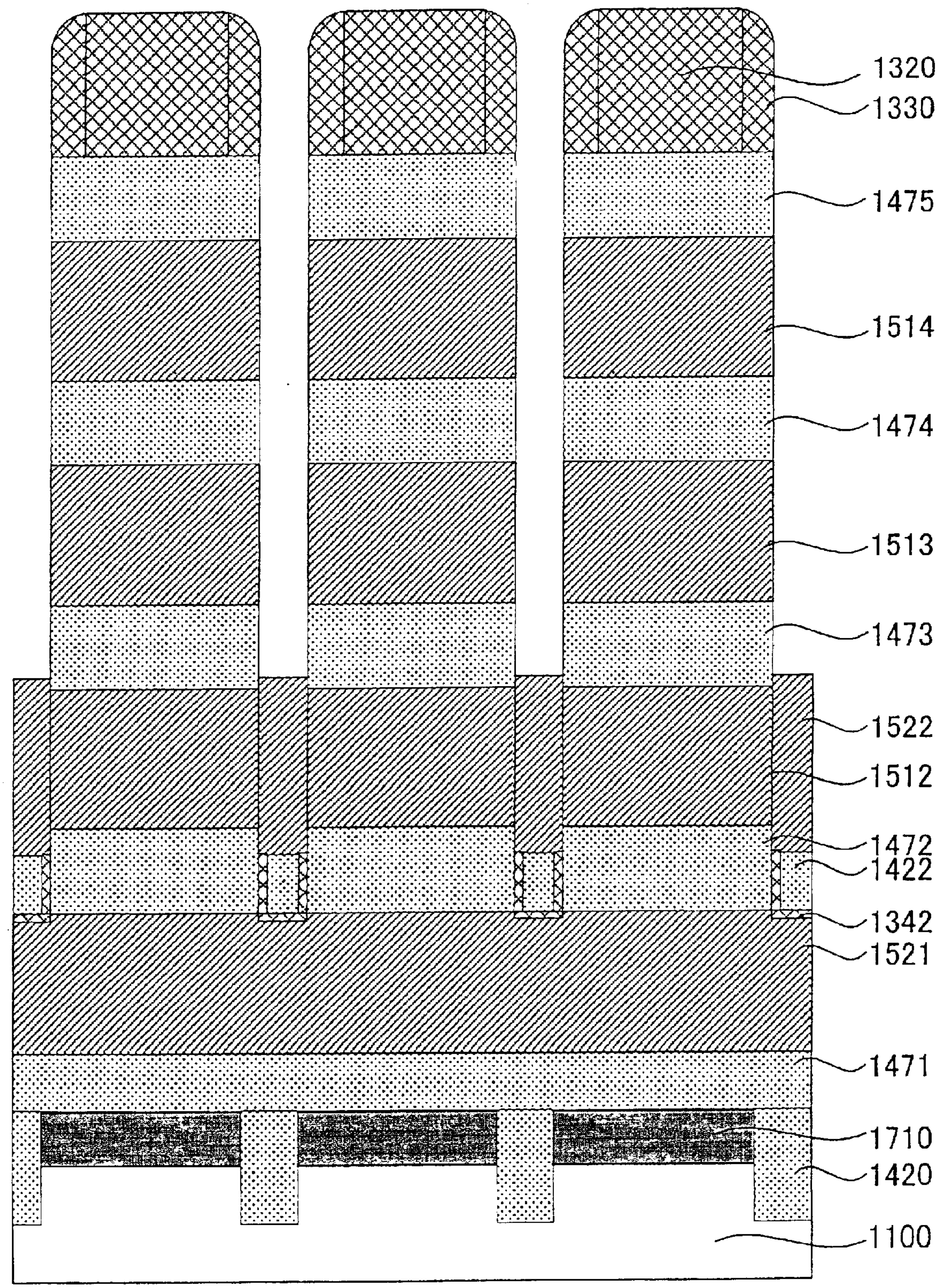

Fig. 1134
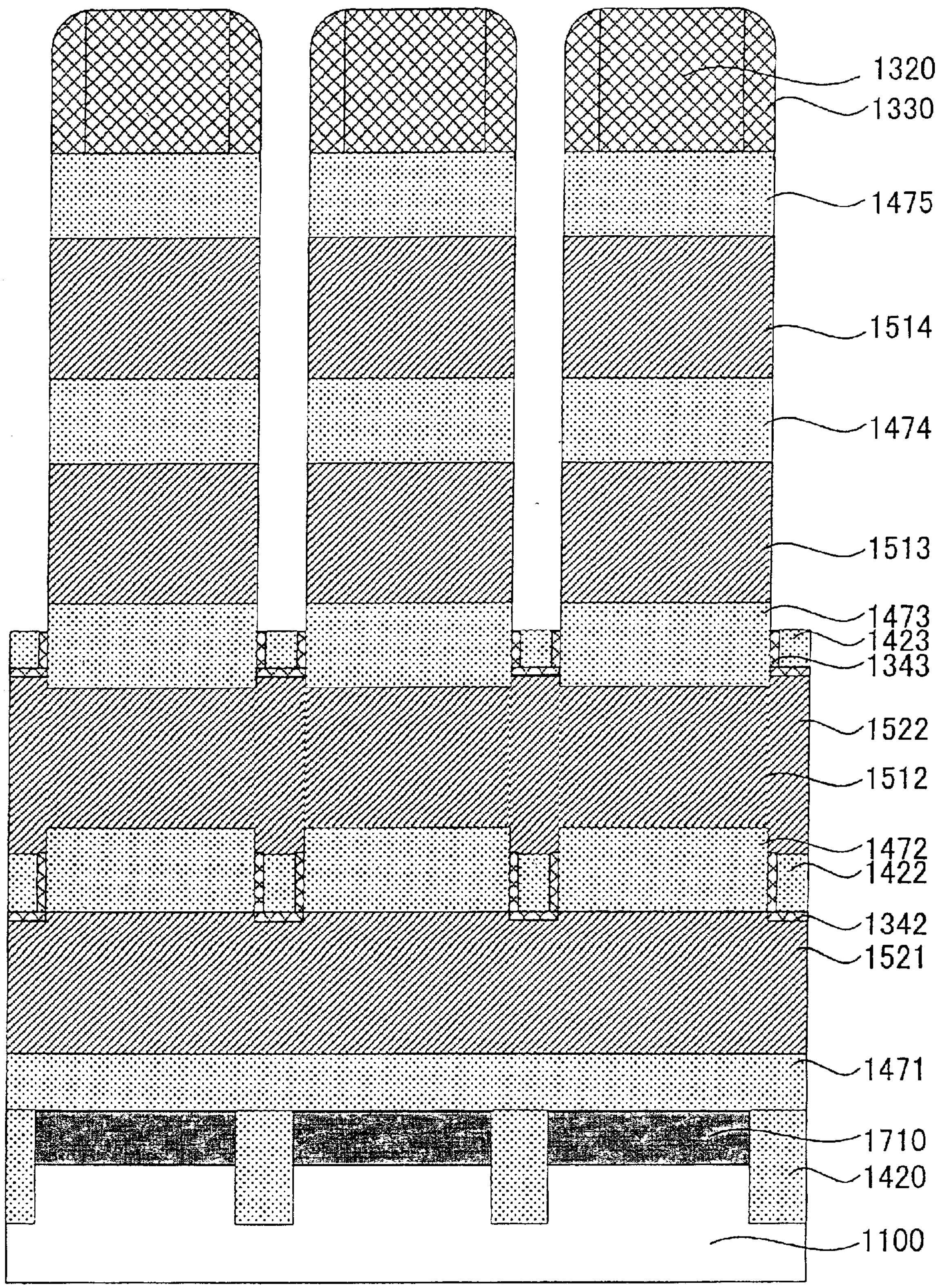

Fig. 1135
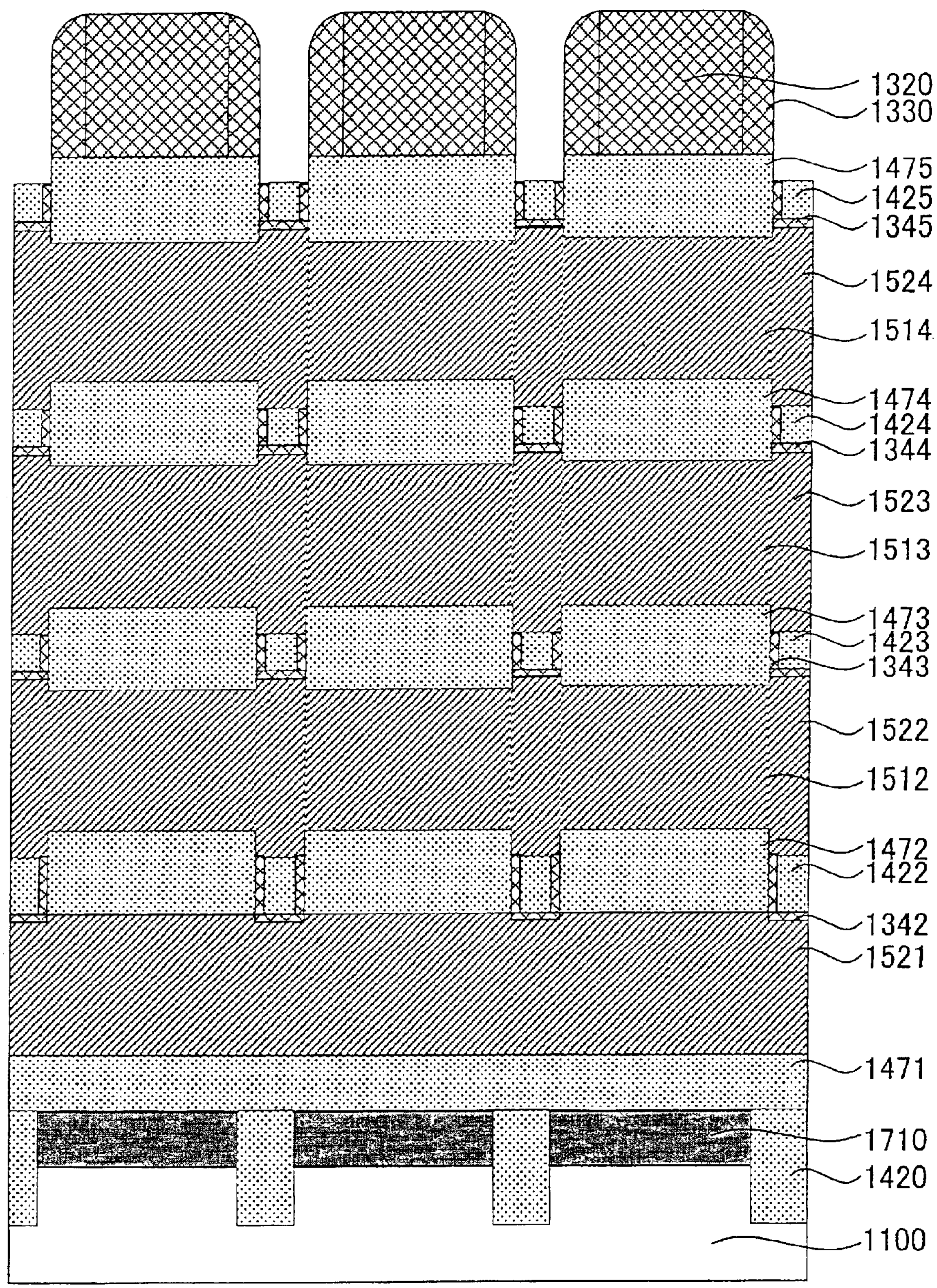

Fig. 1136
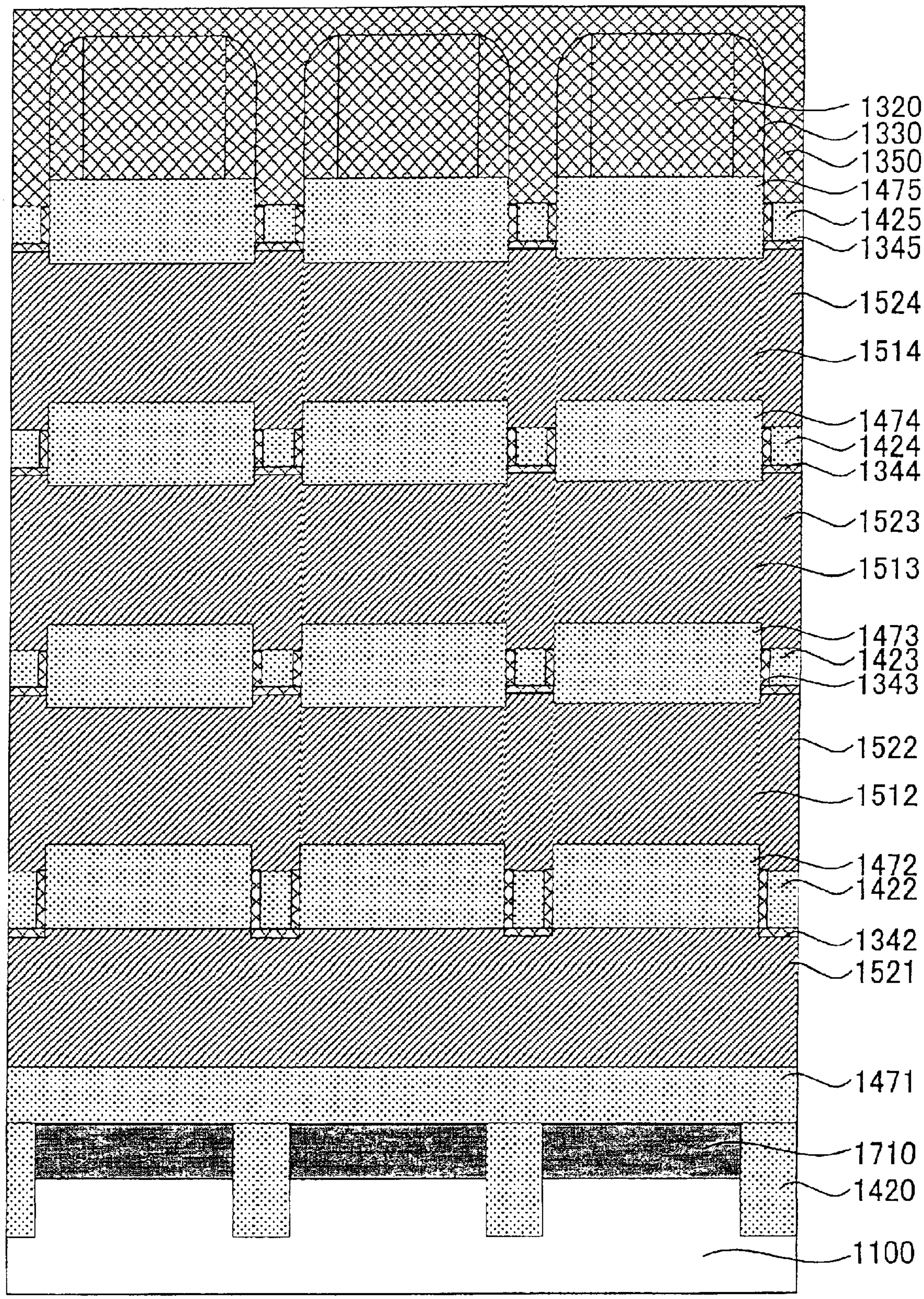

Fig. 1137
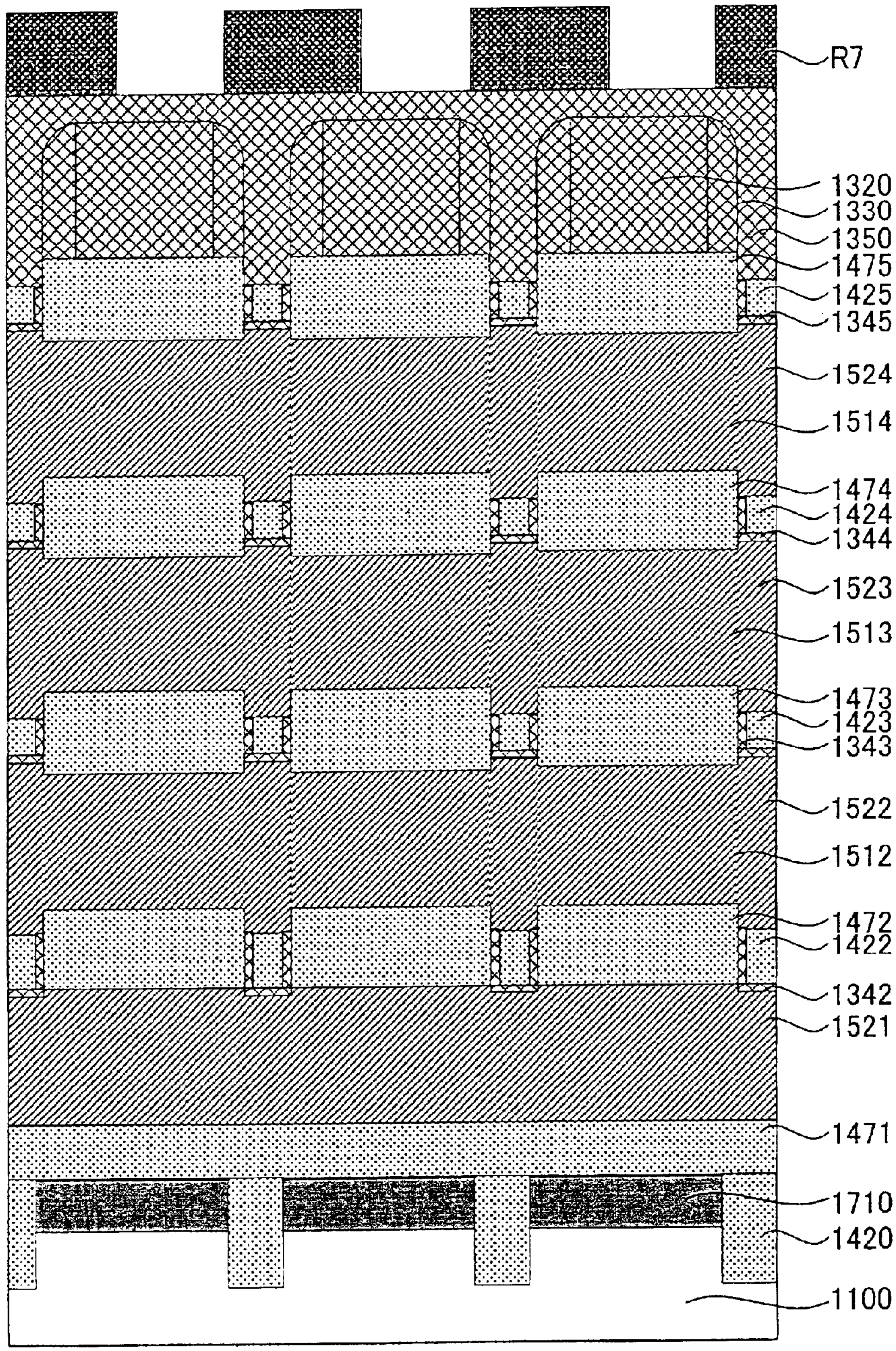

Fig. 1138
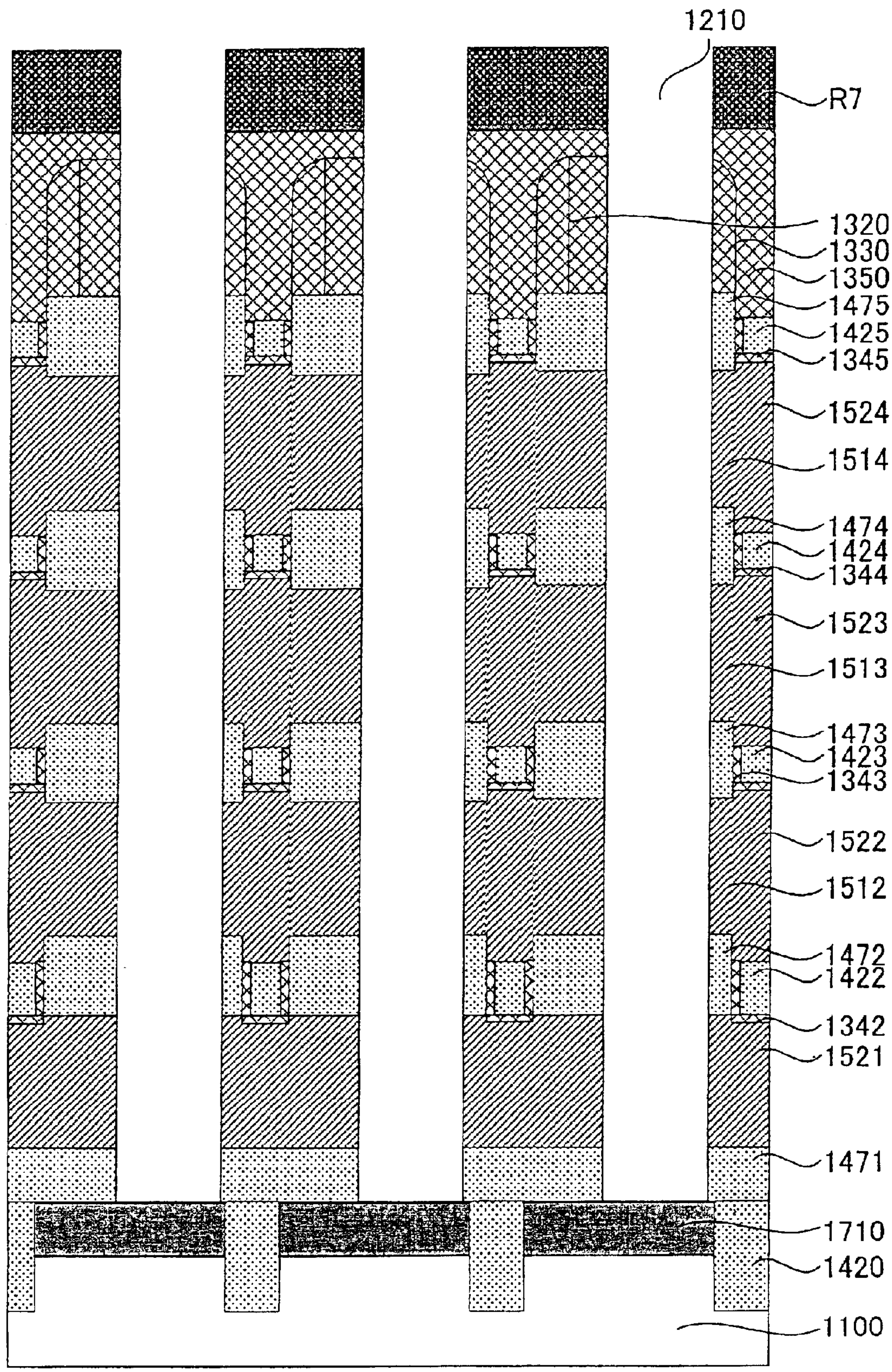

Fig. 1139
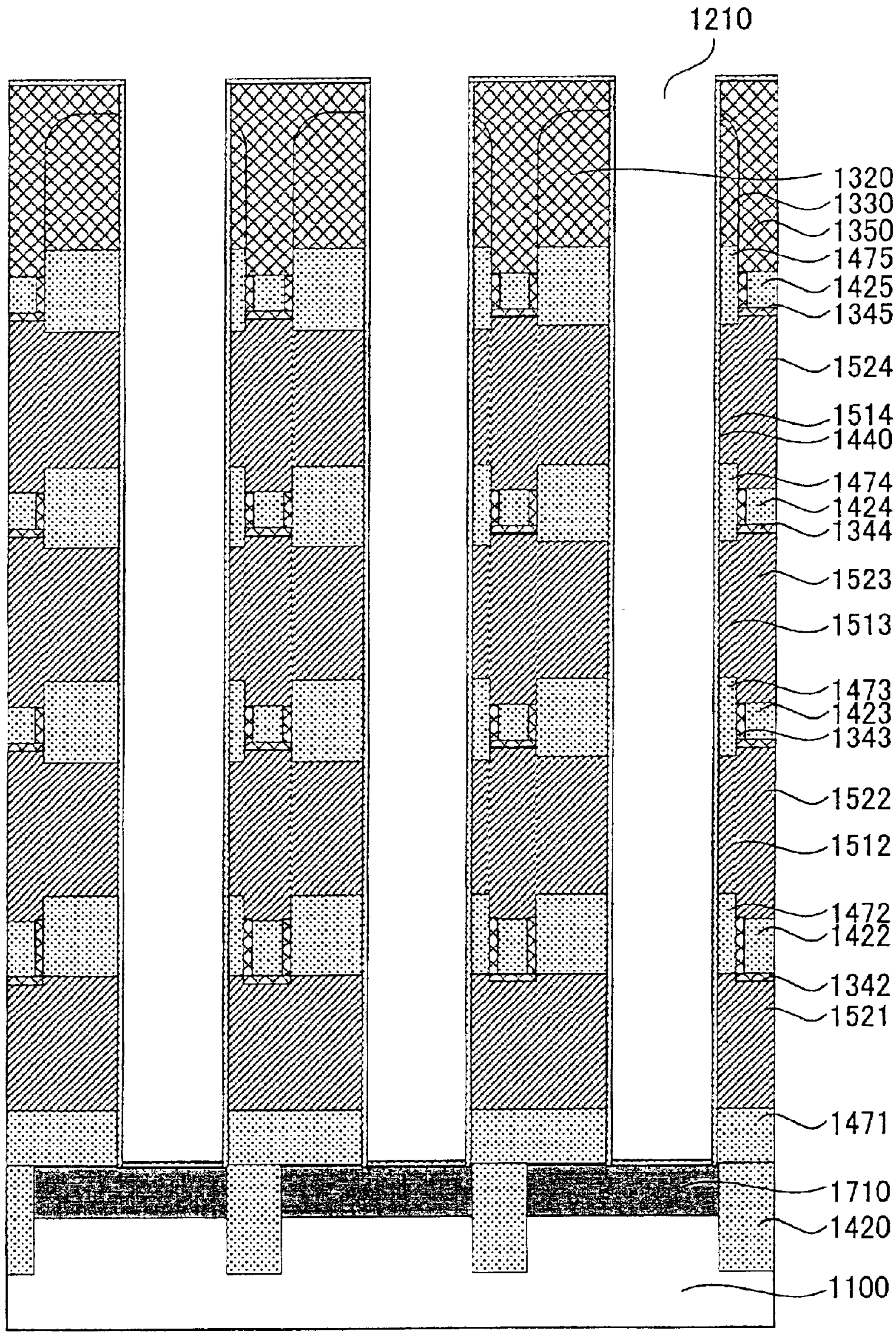

Fig. 1140
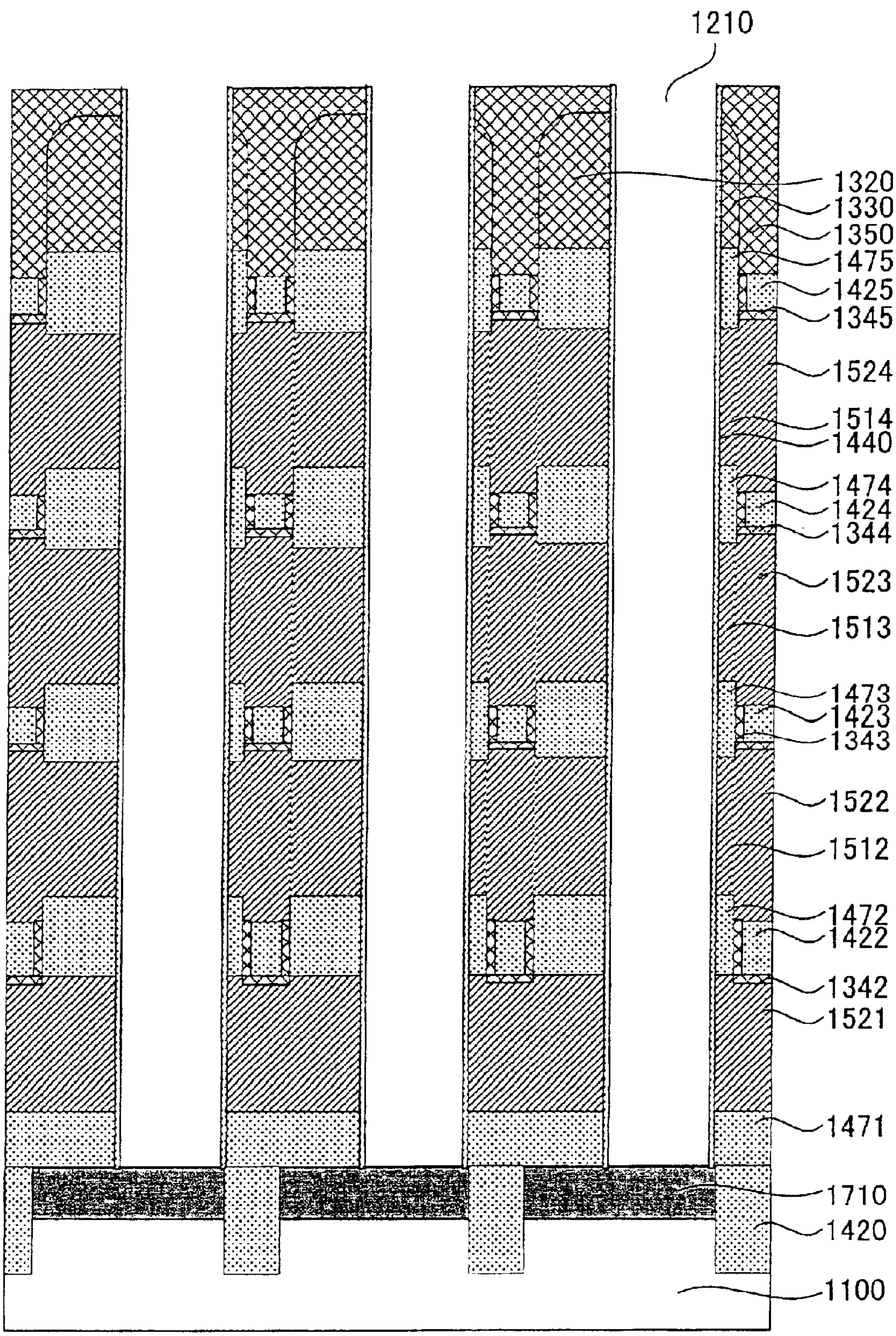

Fig. 1141
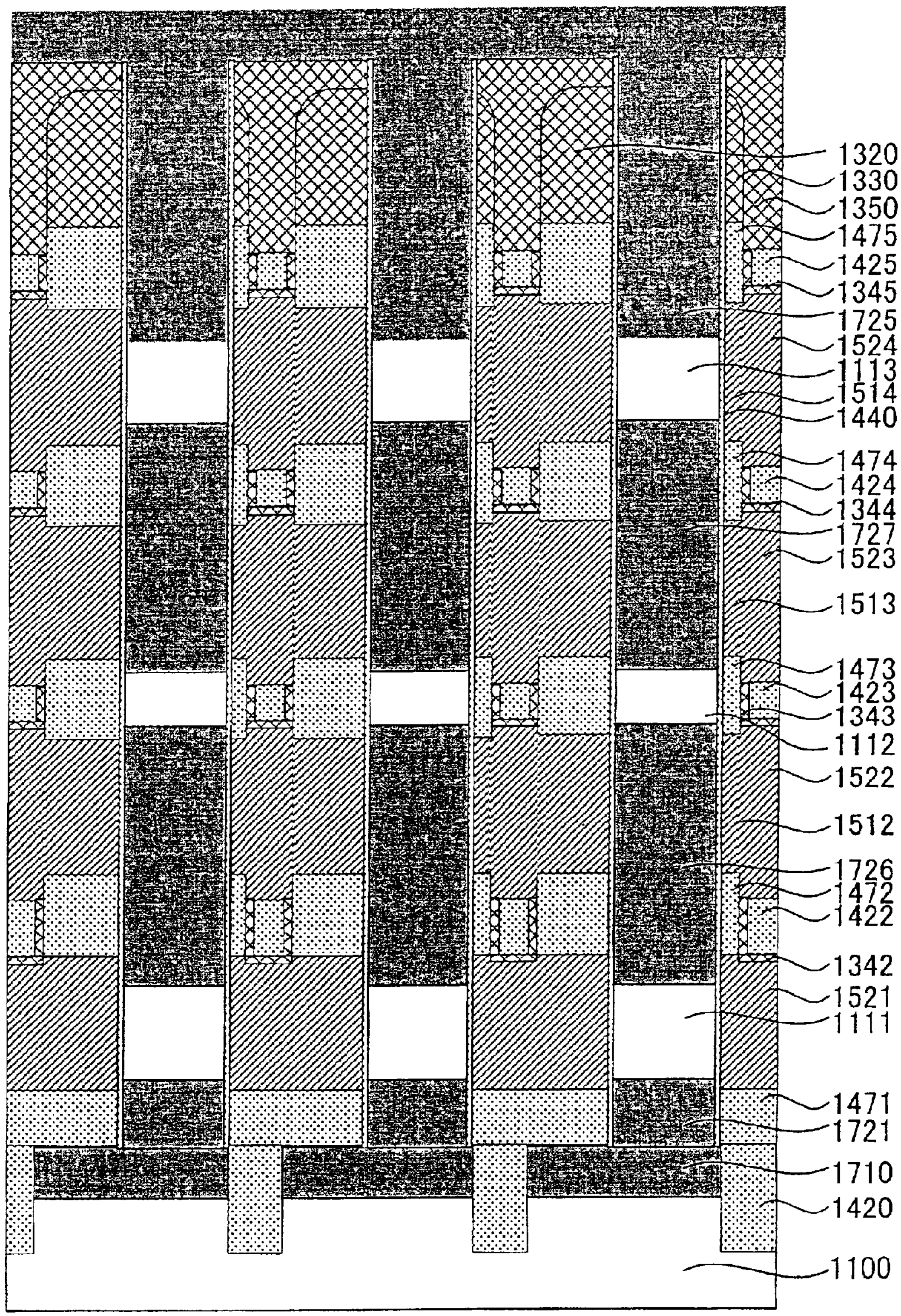

Fig. 1142
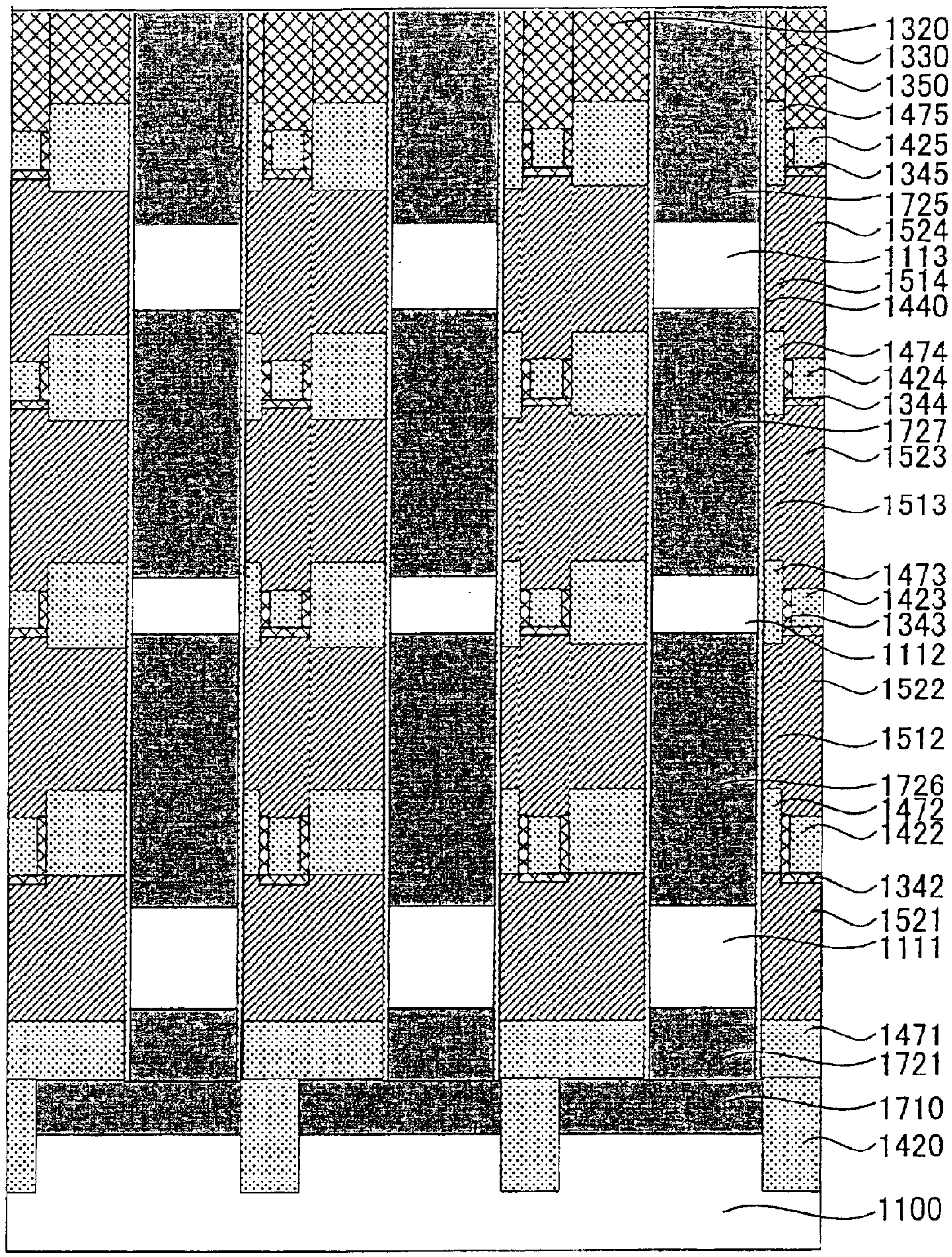

Fig. 1143
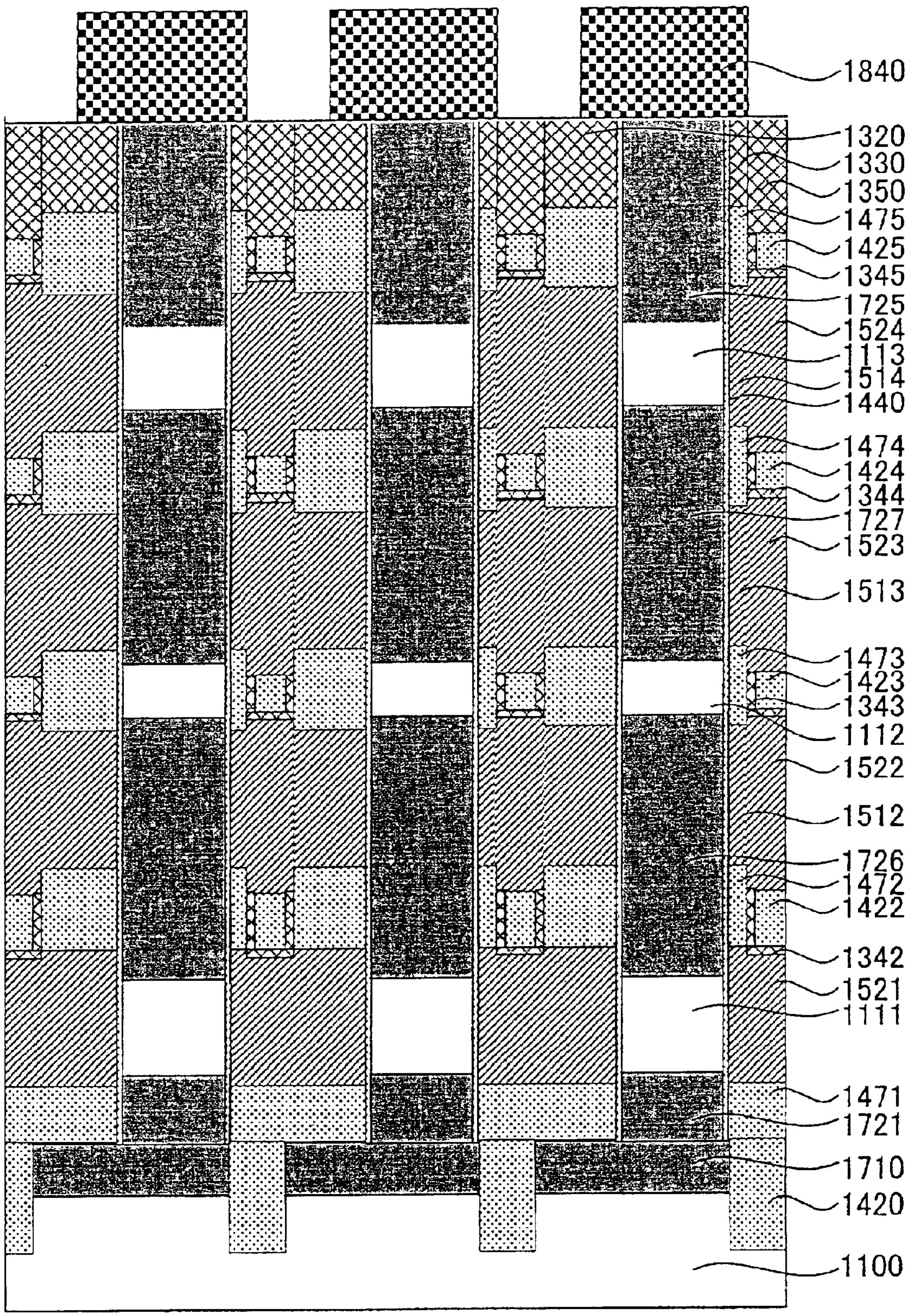

Fig. 1144
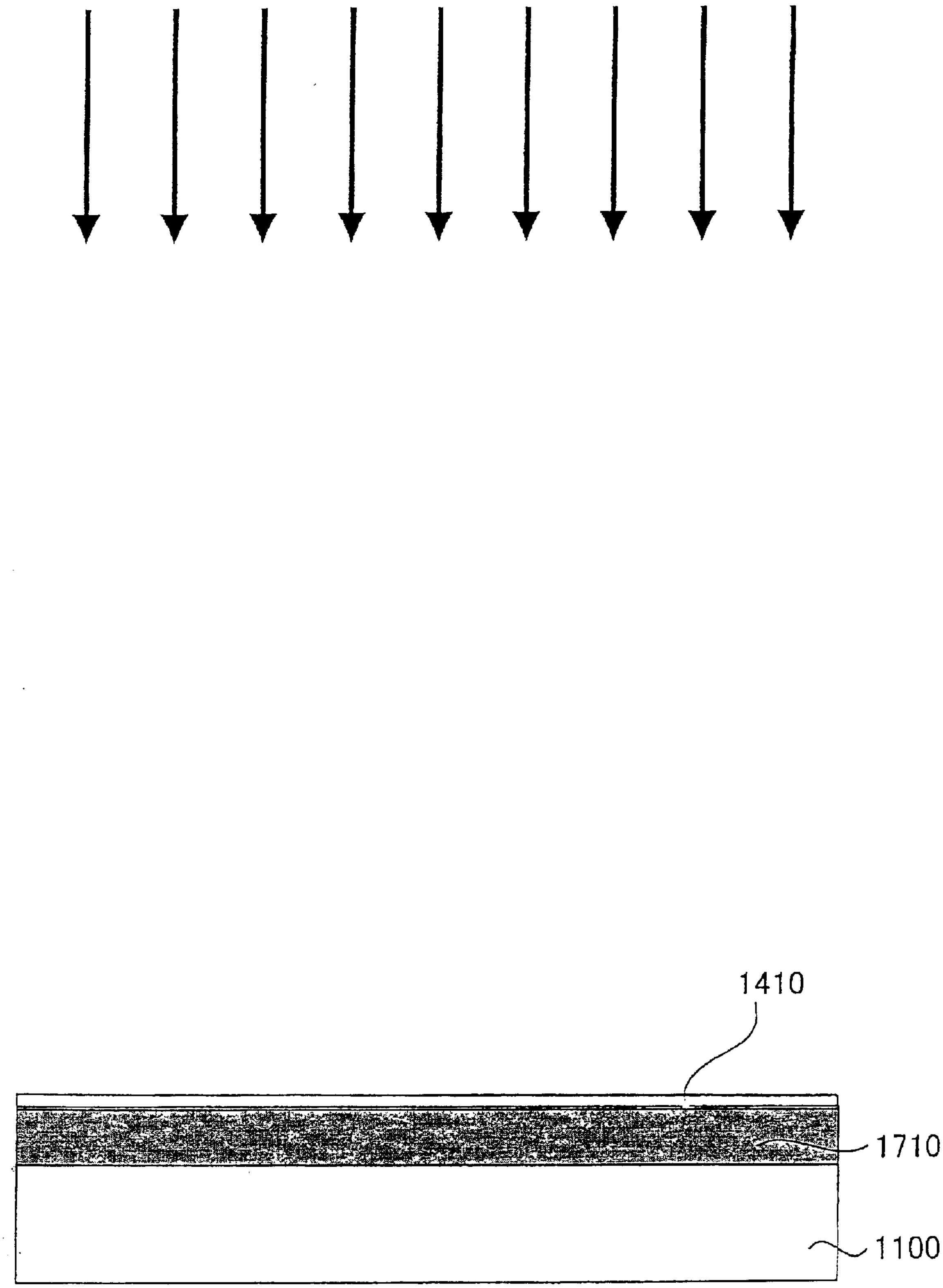

Fig. 1145
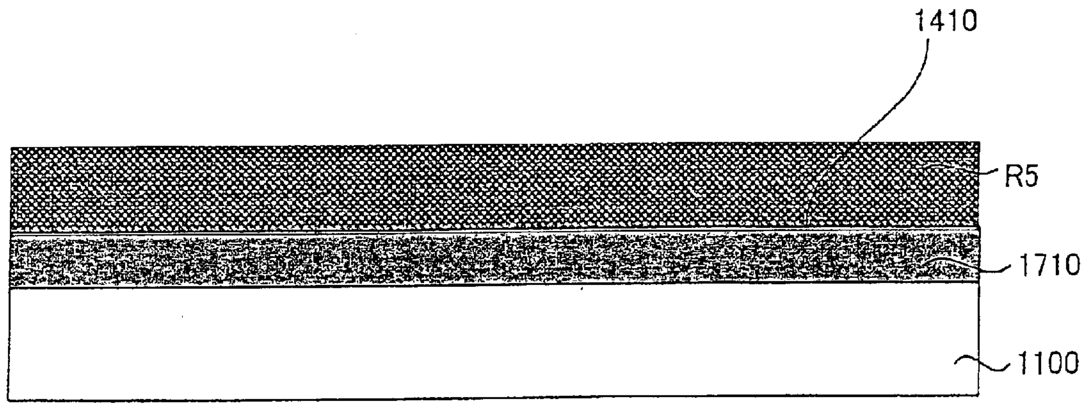
Fig. 1146
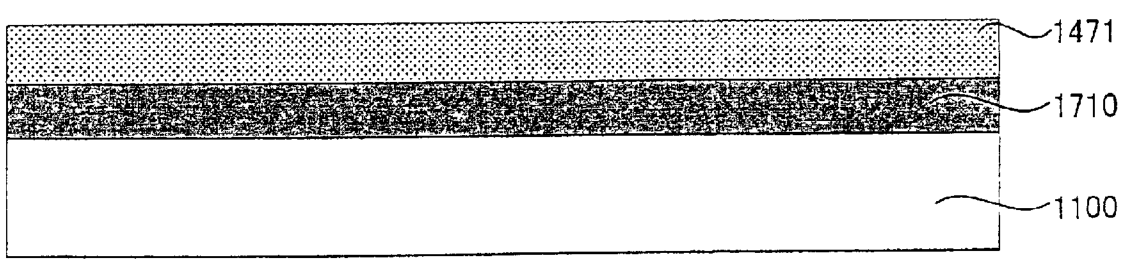

Fig. 1147
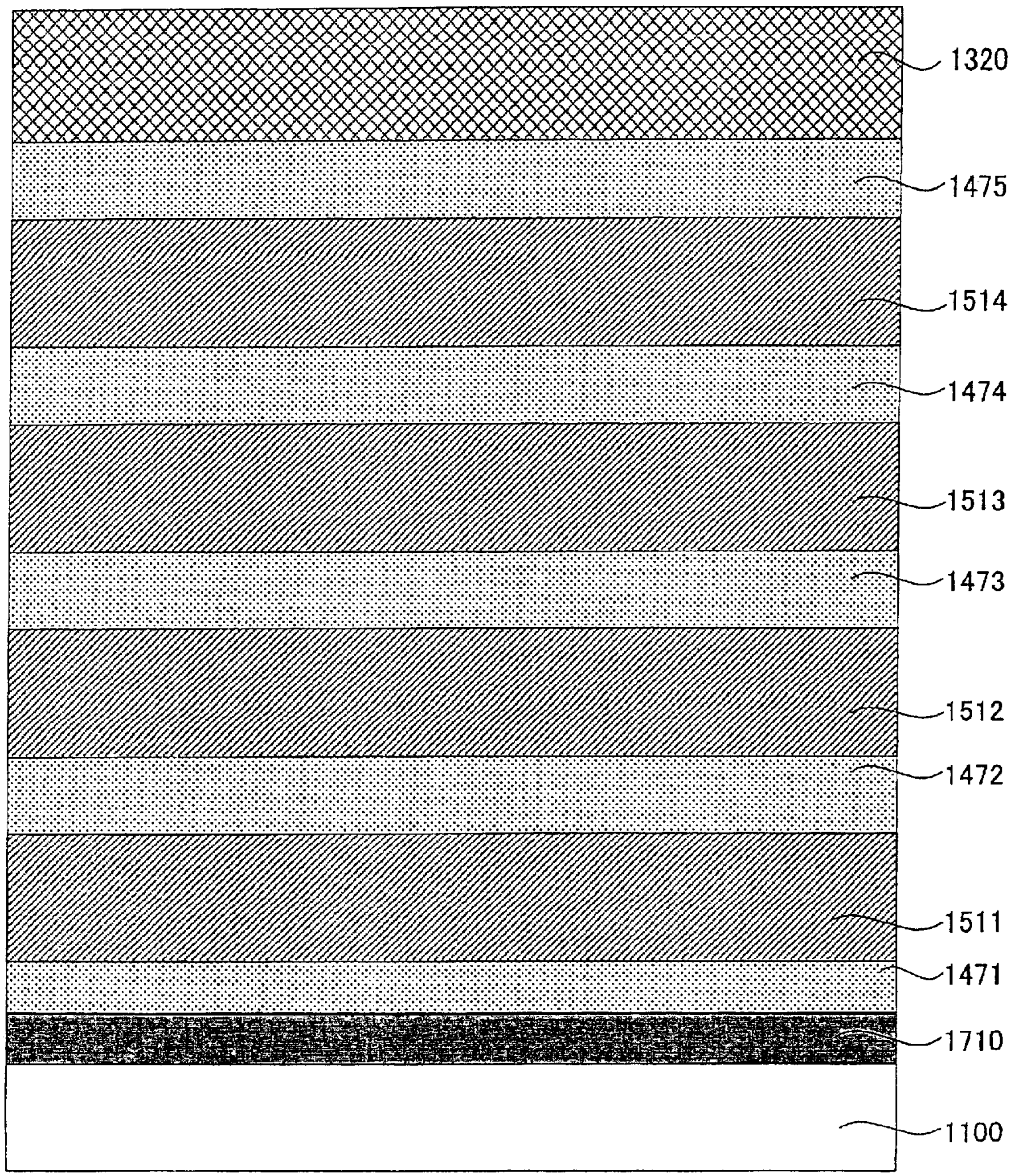

Fig. 1148
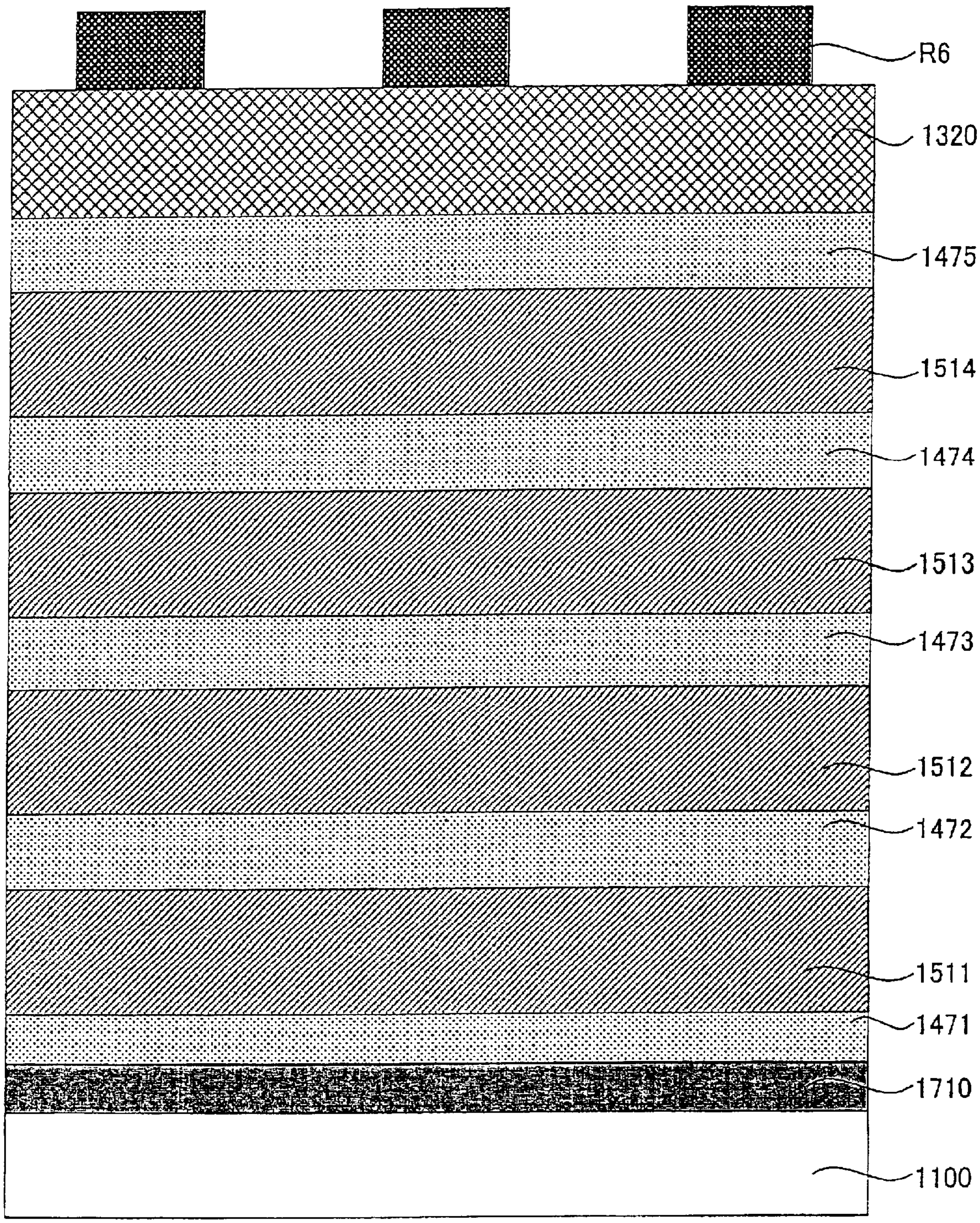

Fig. 1149
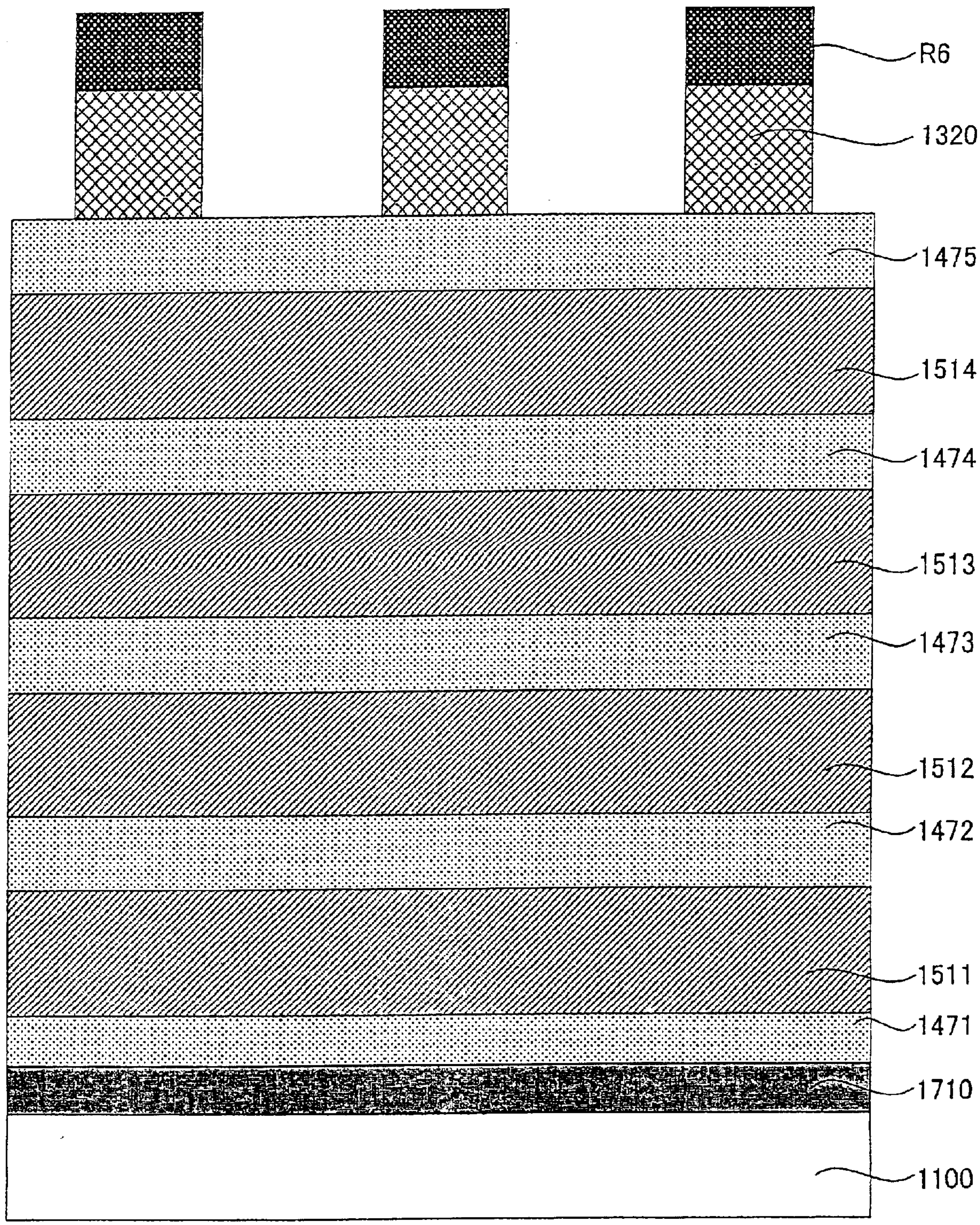

Fig. 1150
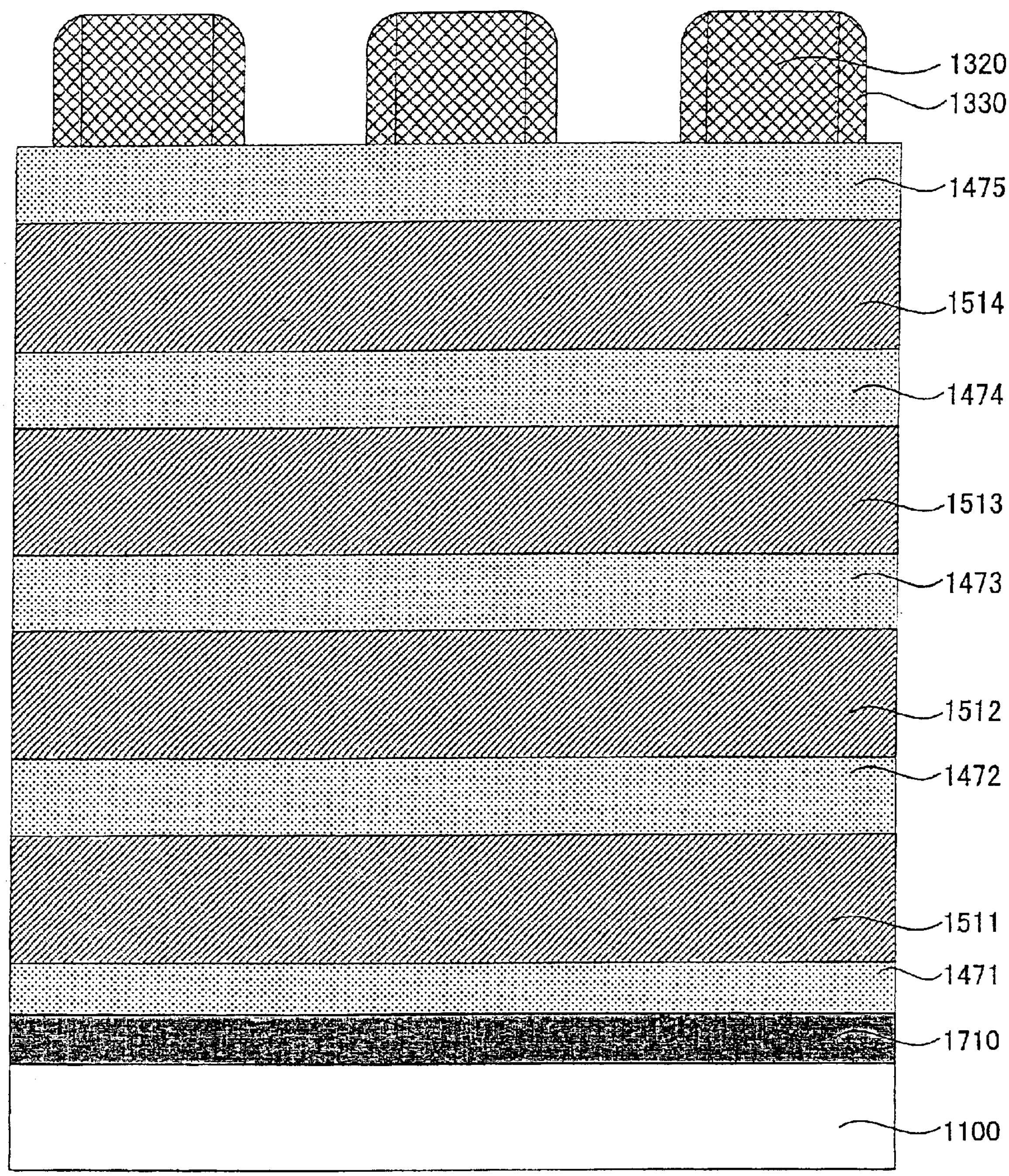

Fig. 1151
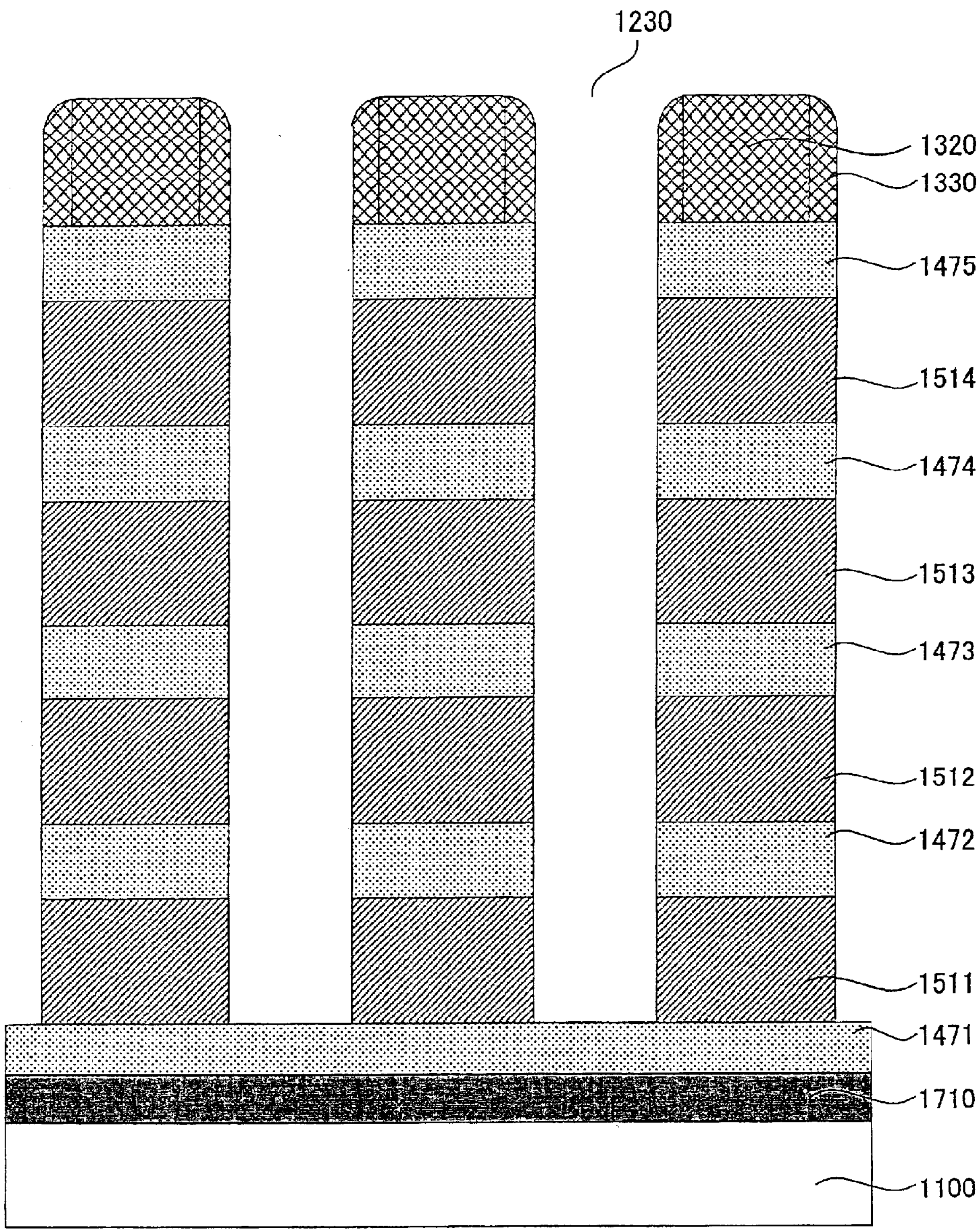

Fig. 1152
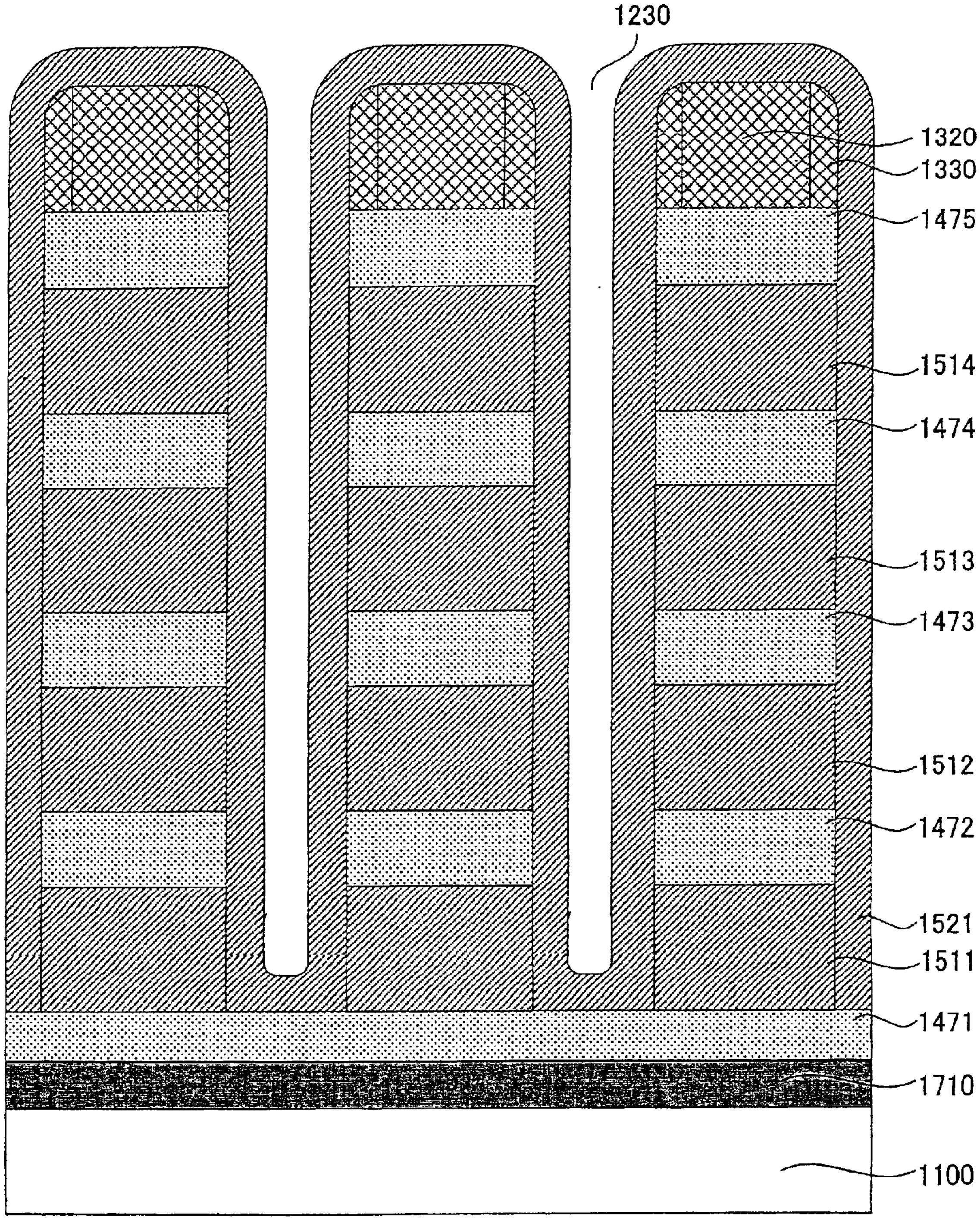

Fig. 1153
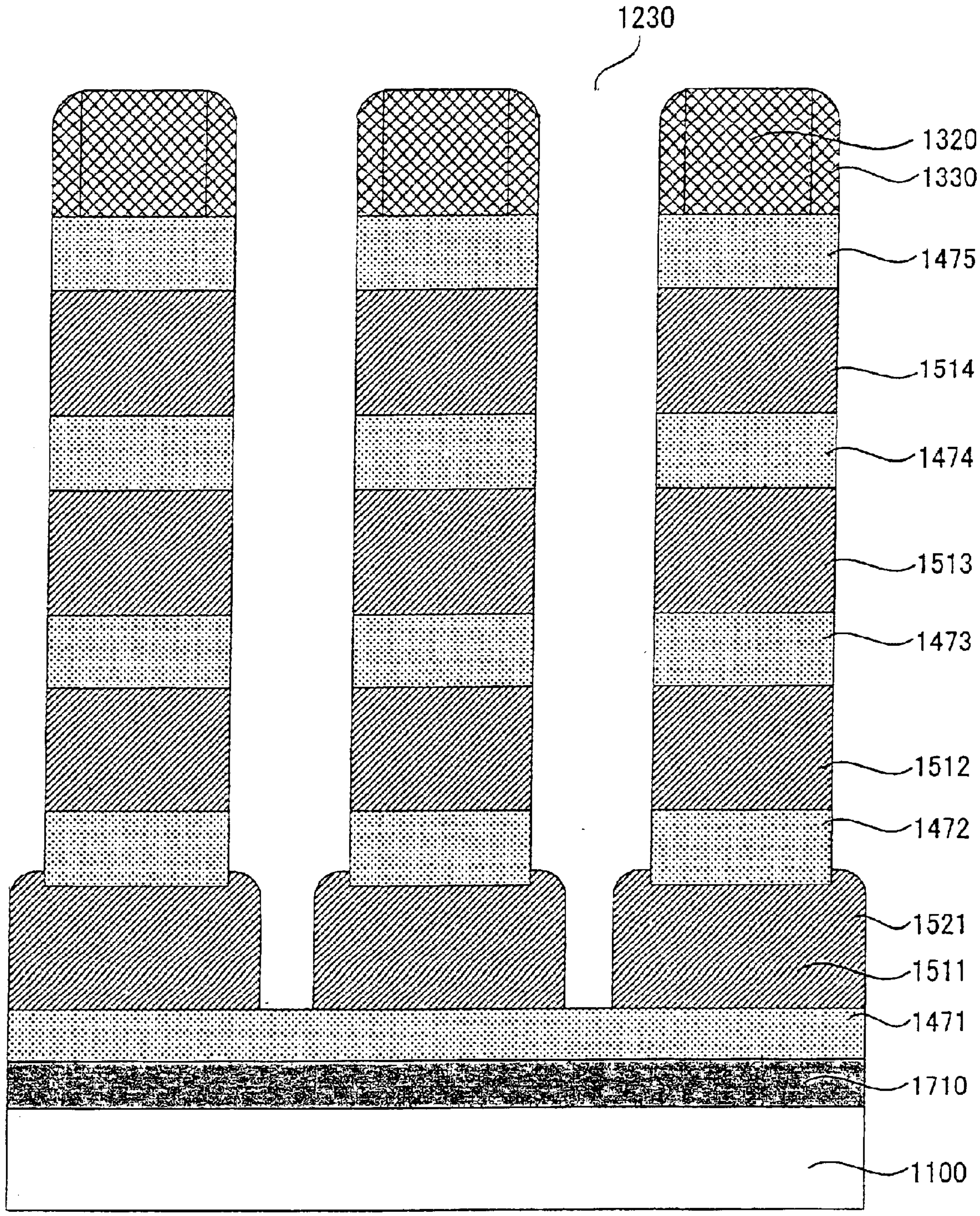

Fig. 1154
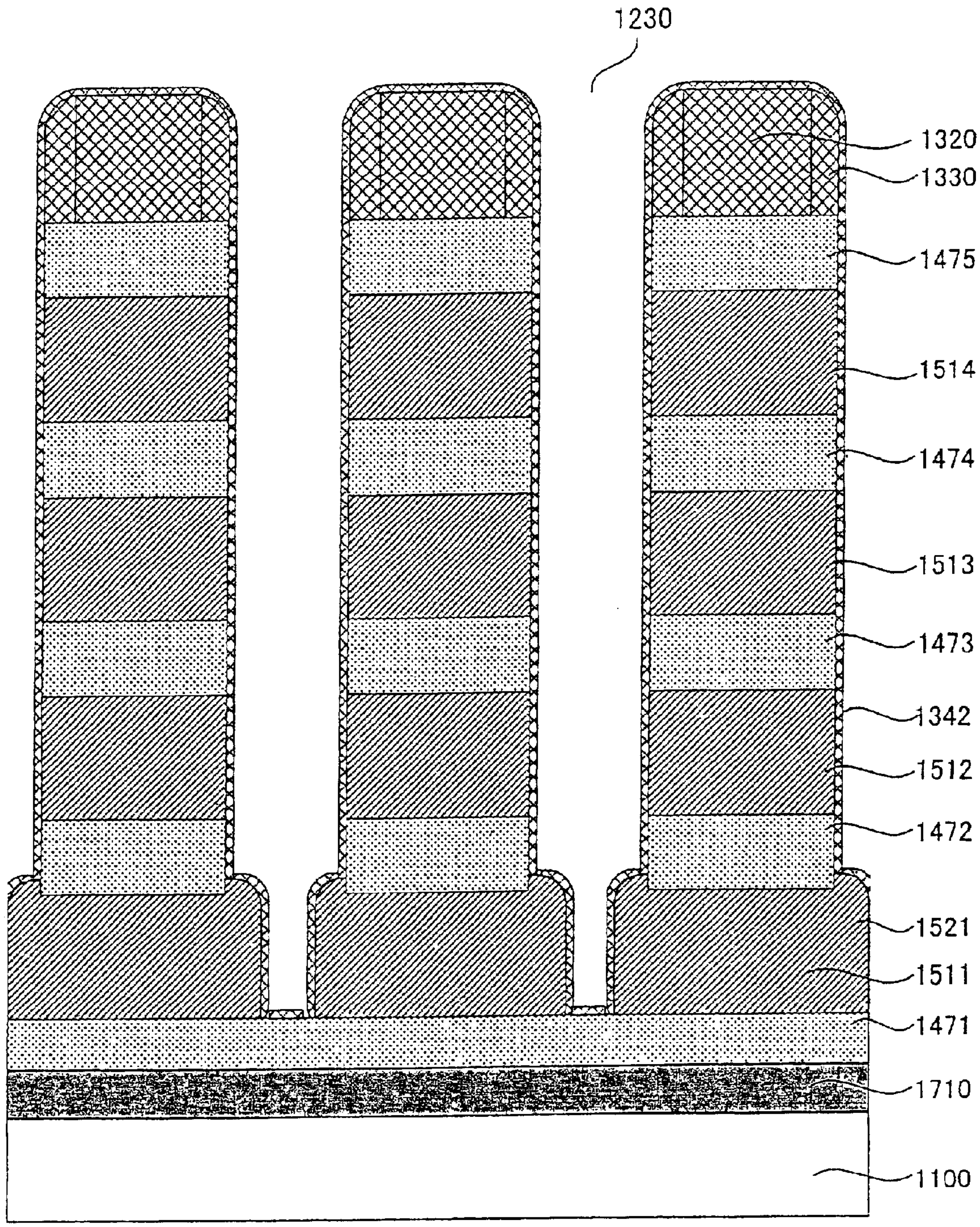

Fig. 1155
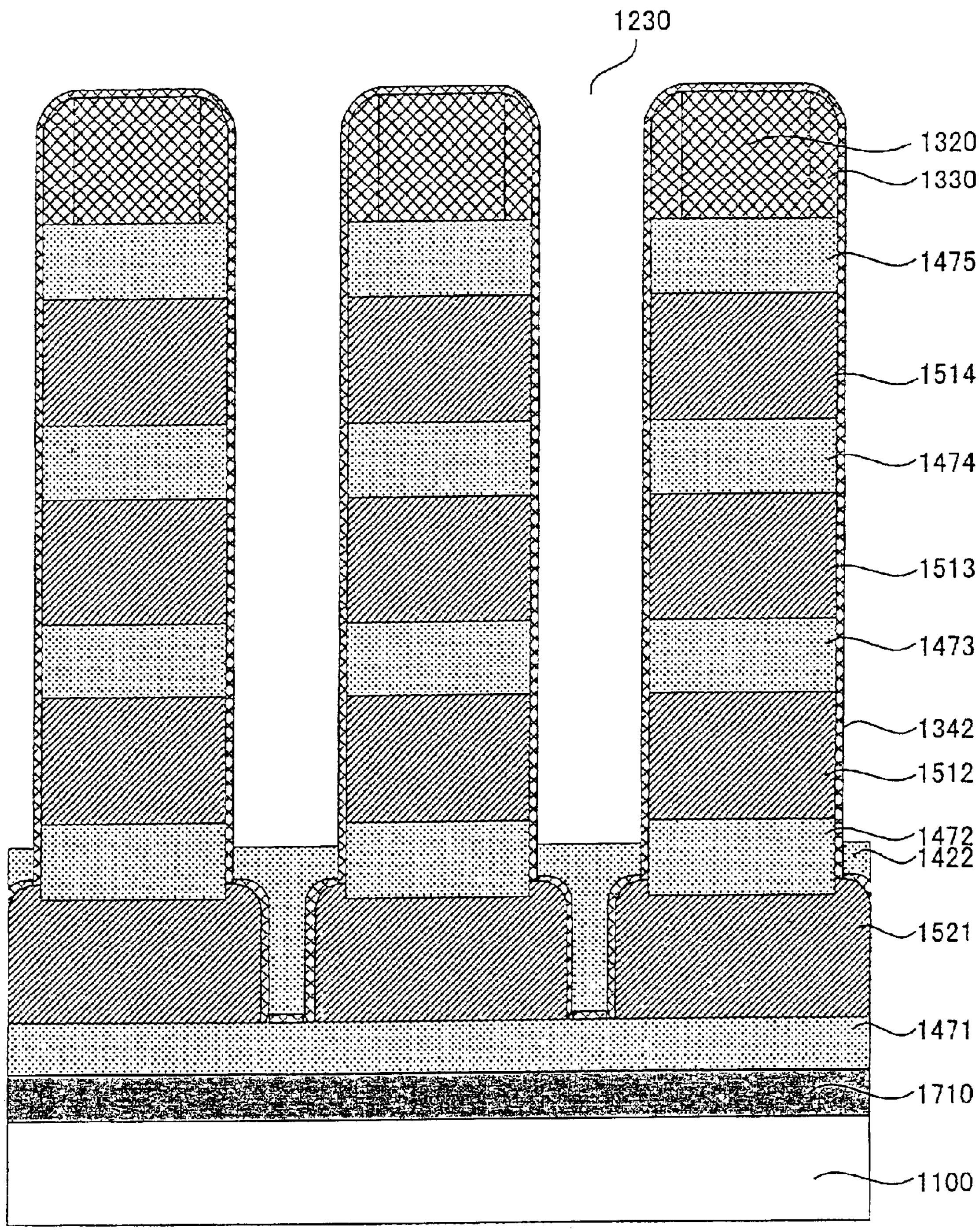

Fig. 1156
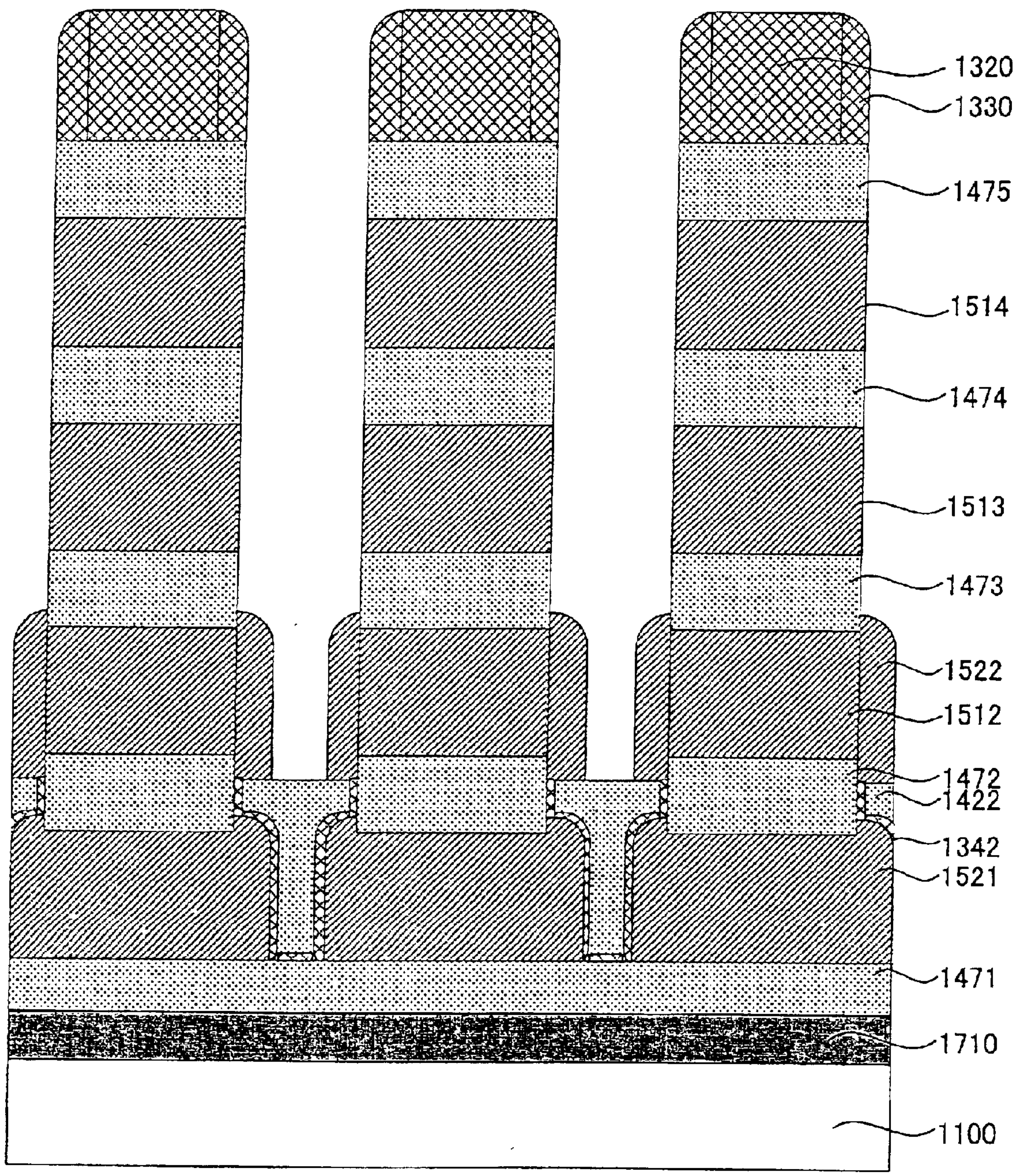

Fig. 1157
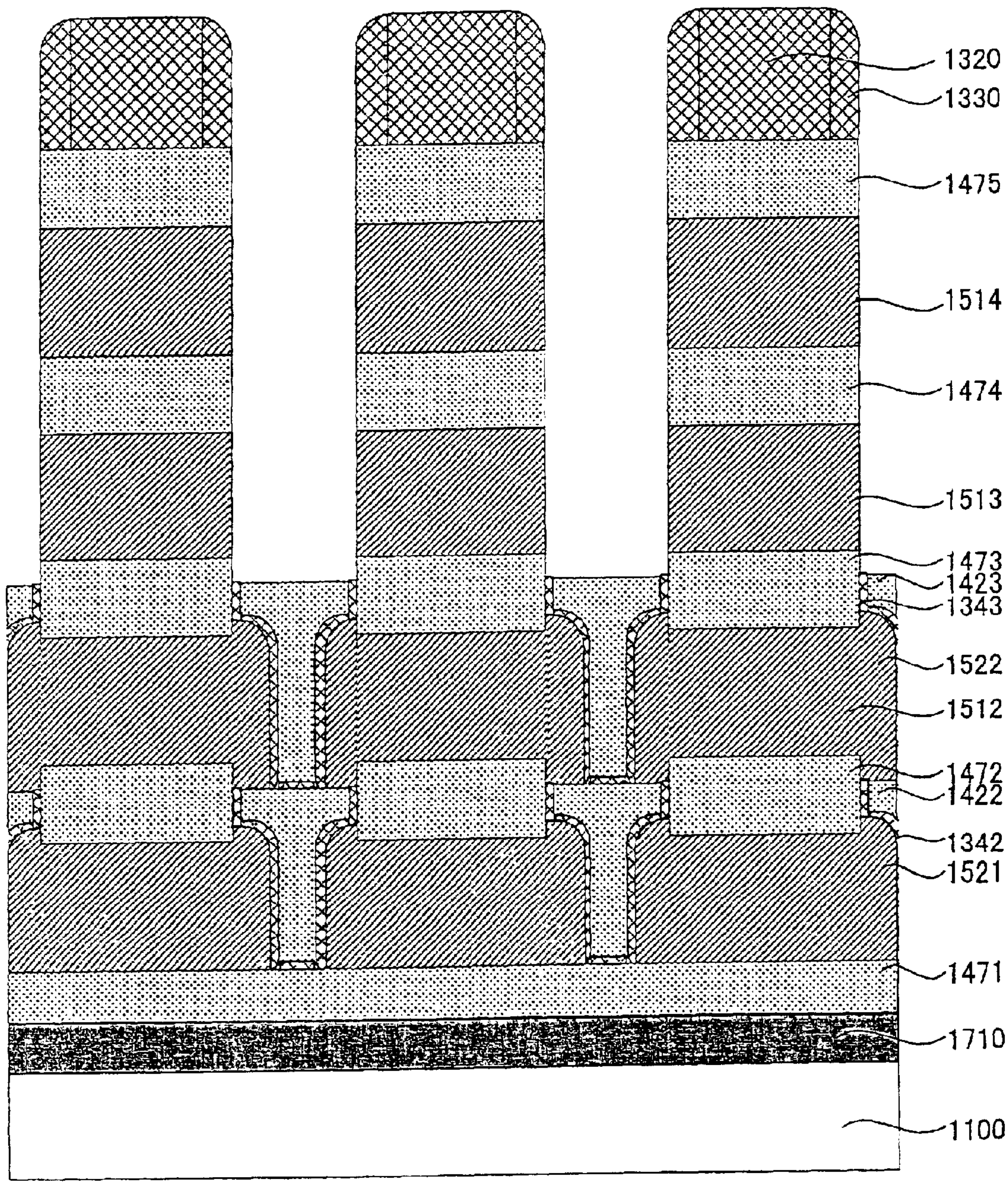

Fig. 1158
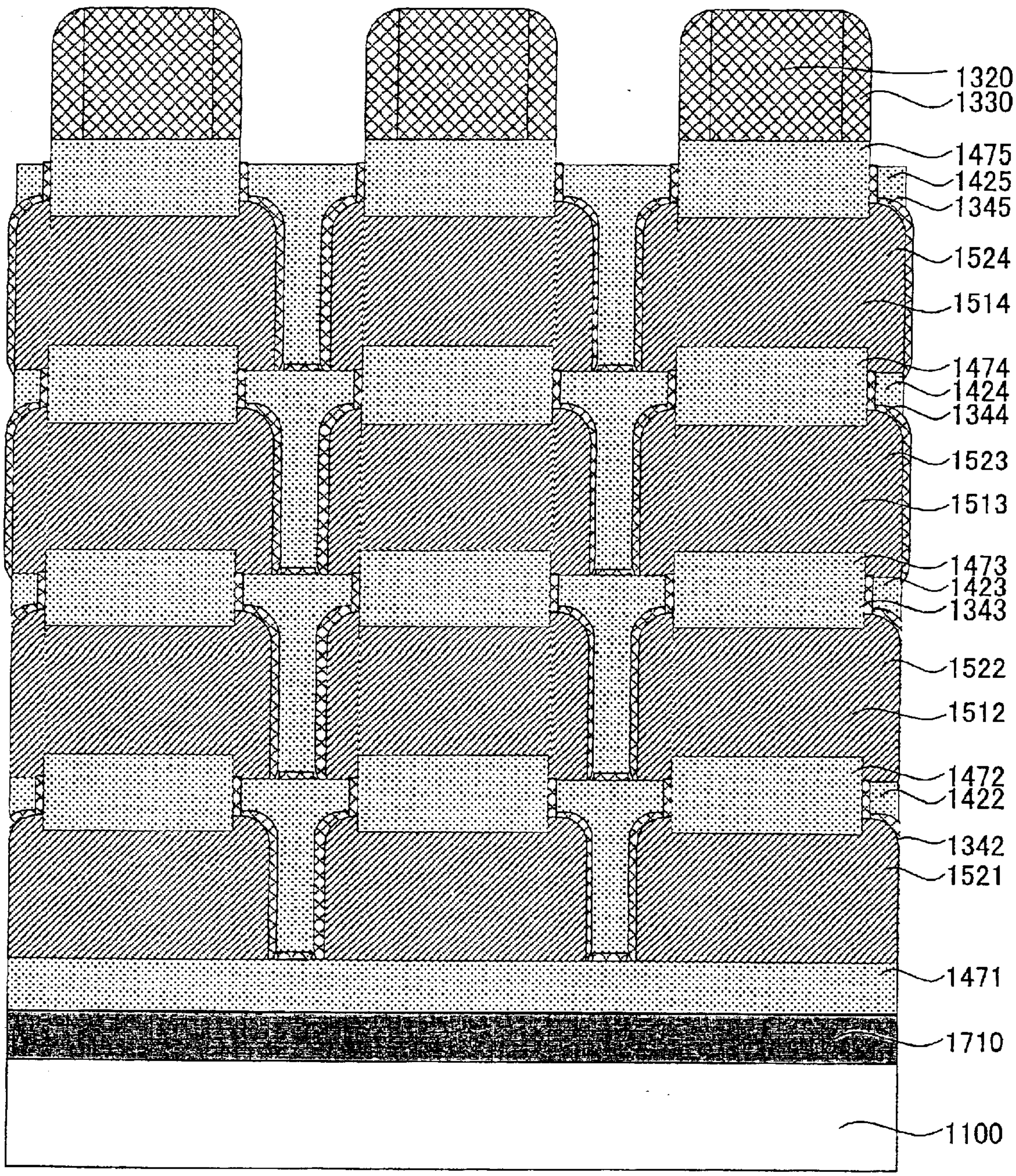

Fig. 1159
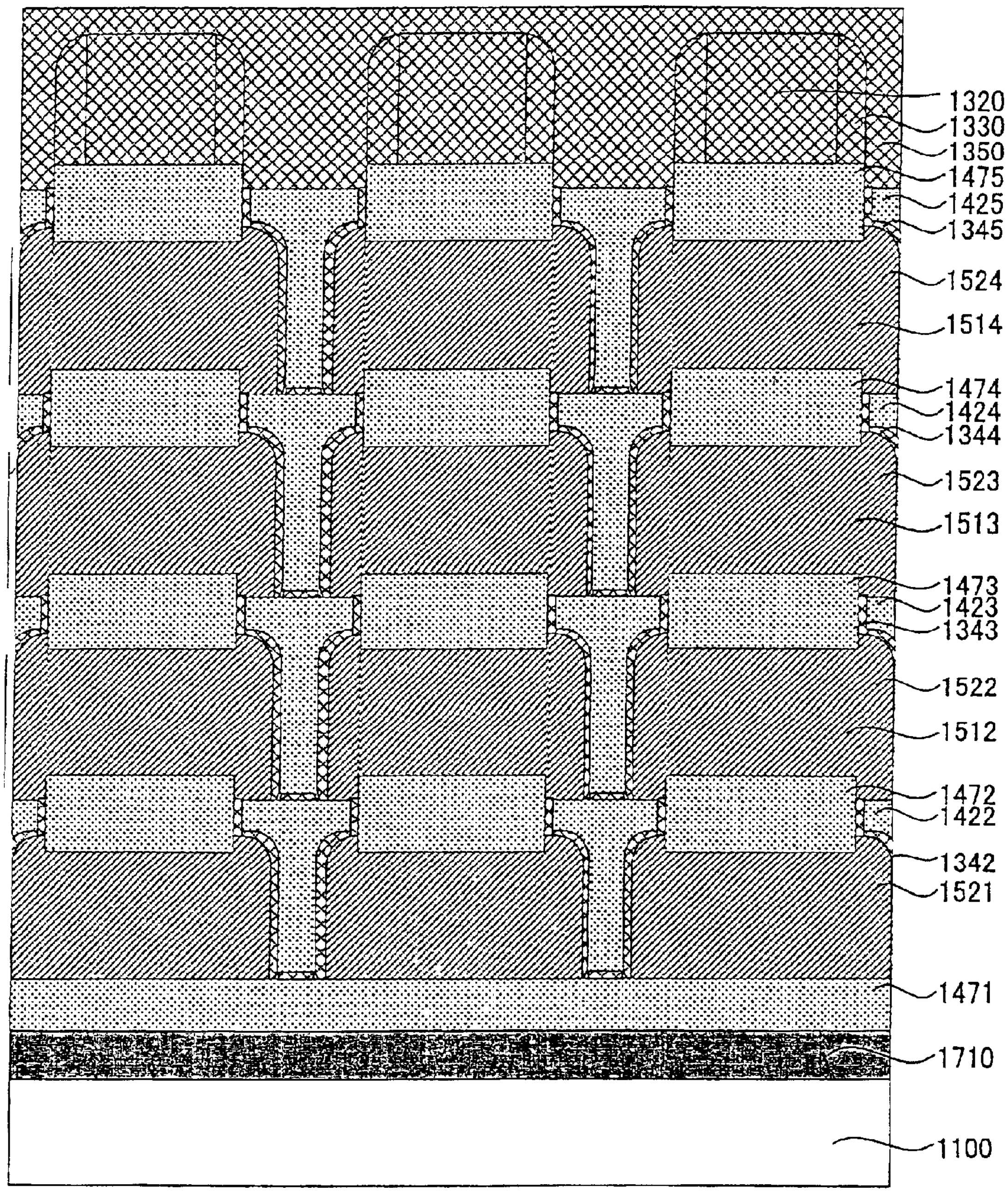

Fig. 1160
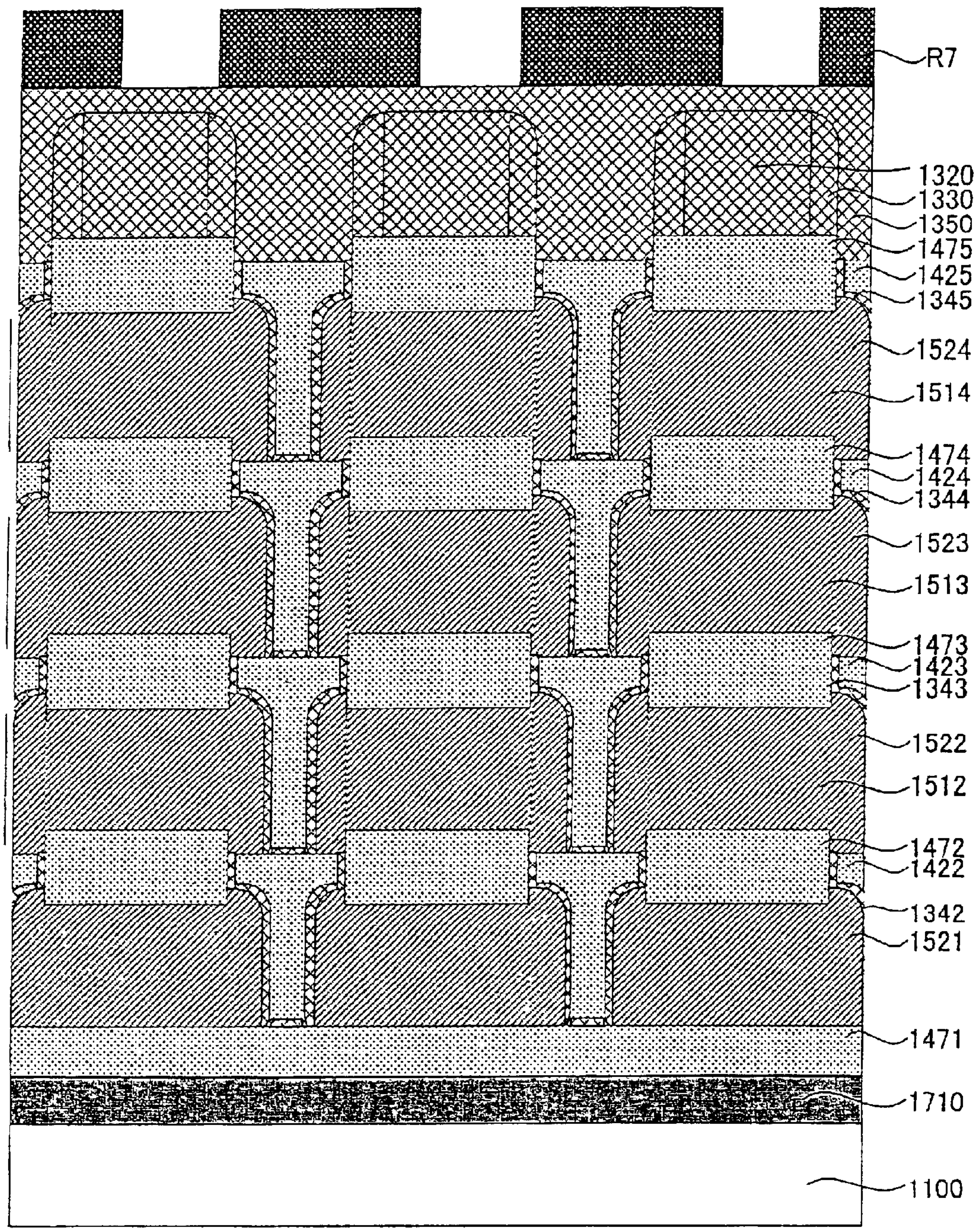

Fig. 1161
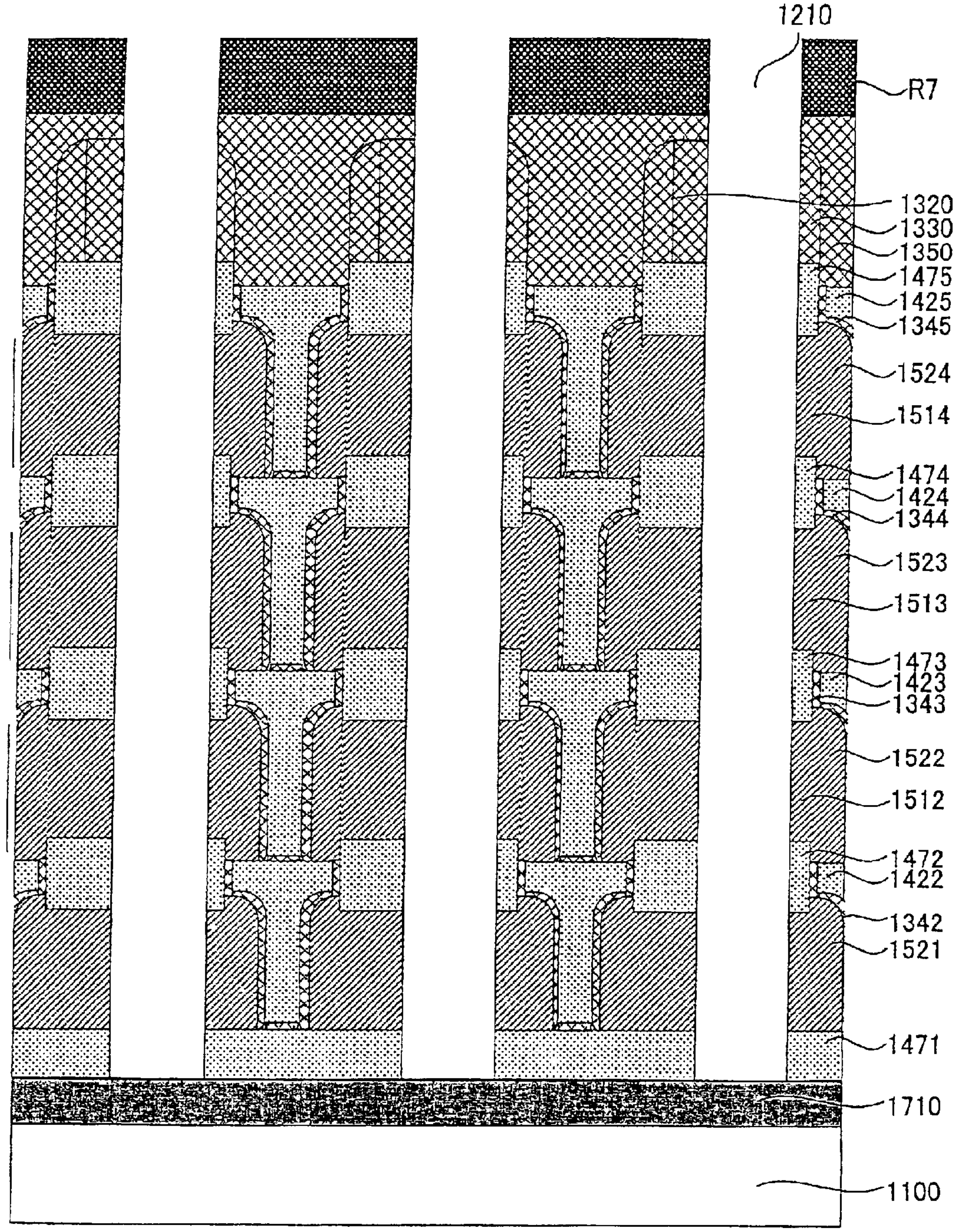

Fig. 1162
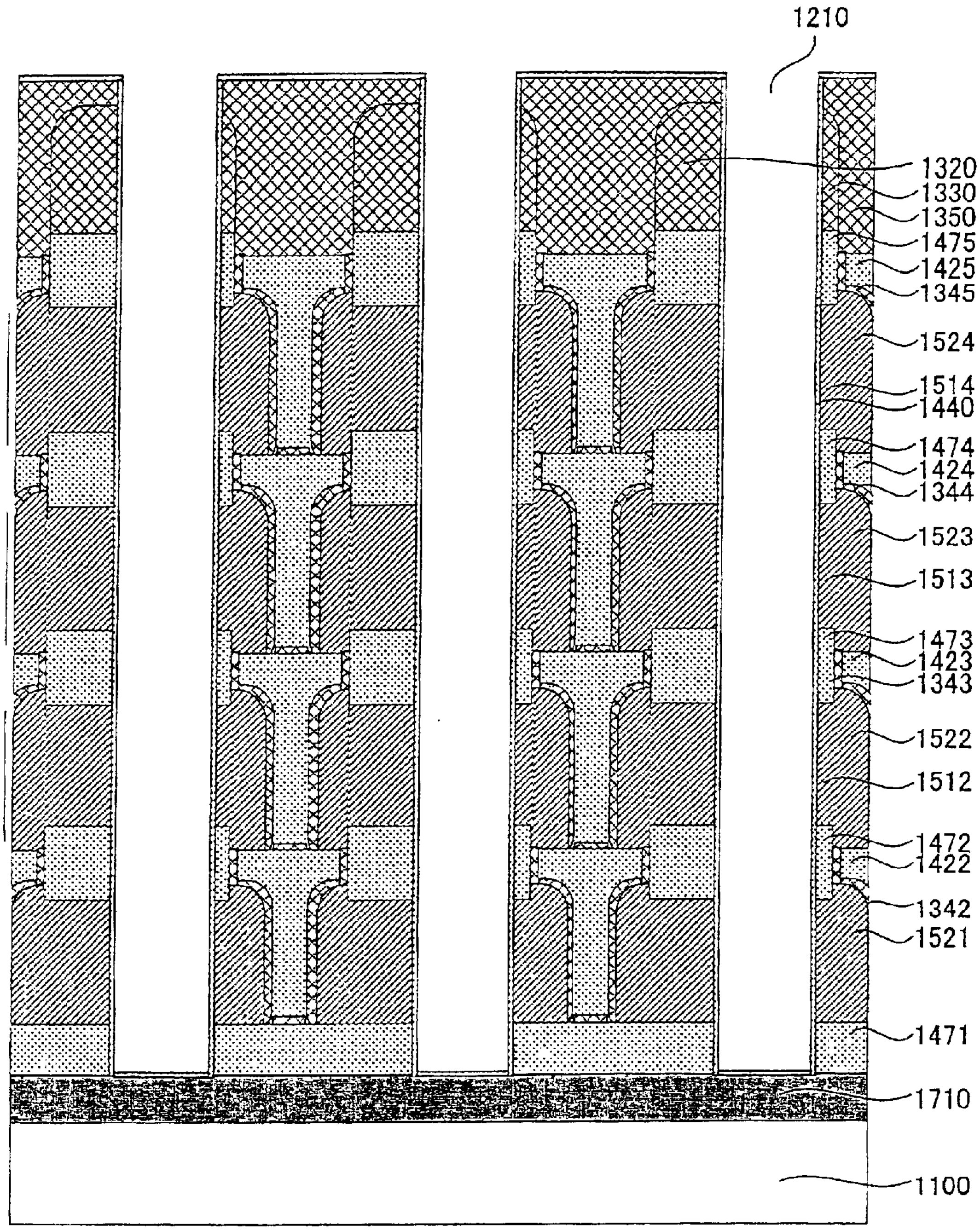

Fig. 1163
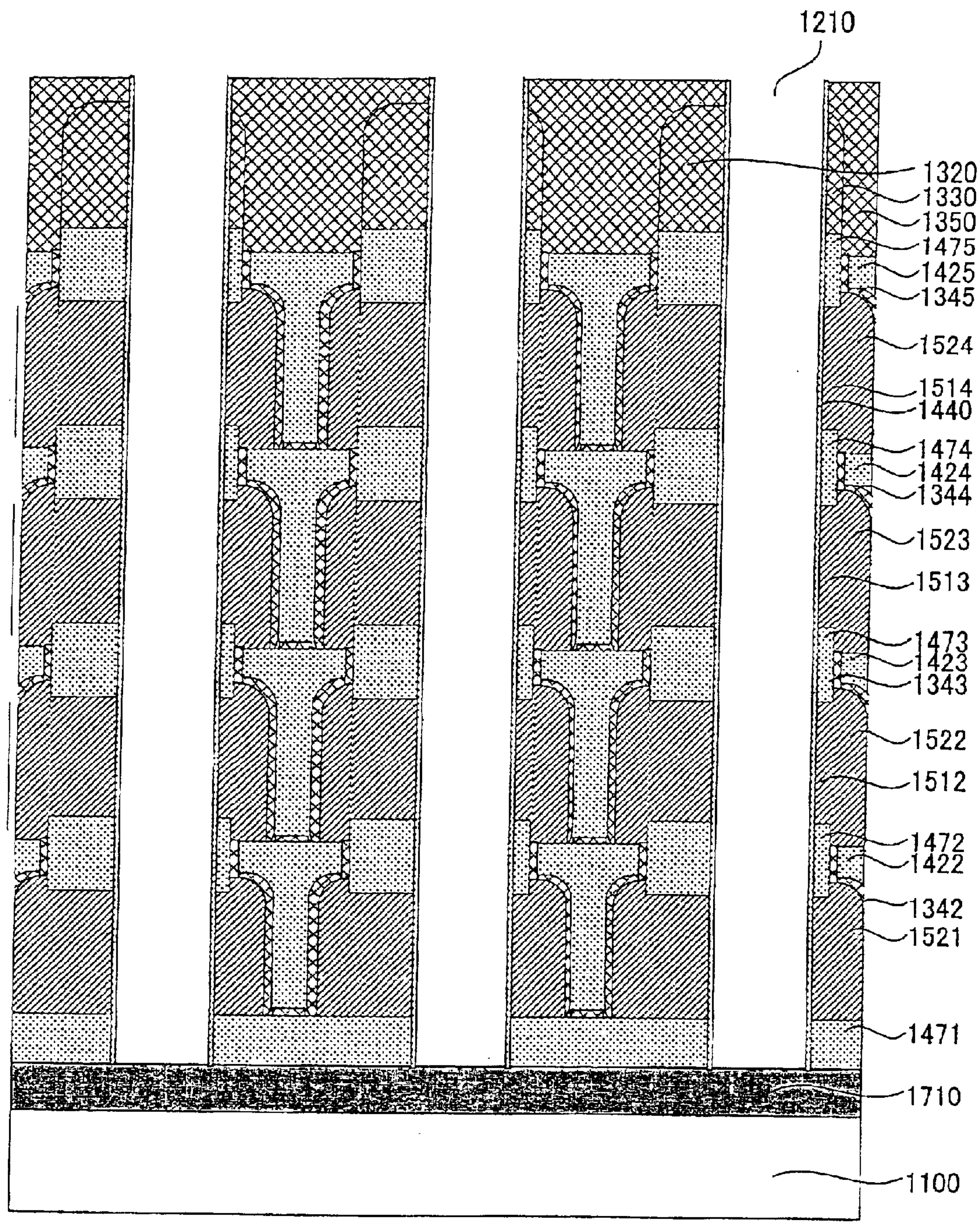

Fig. 1164
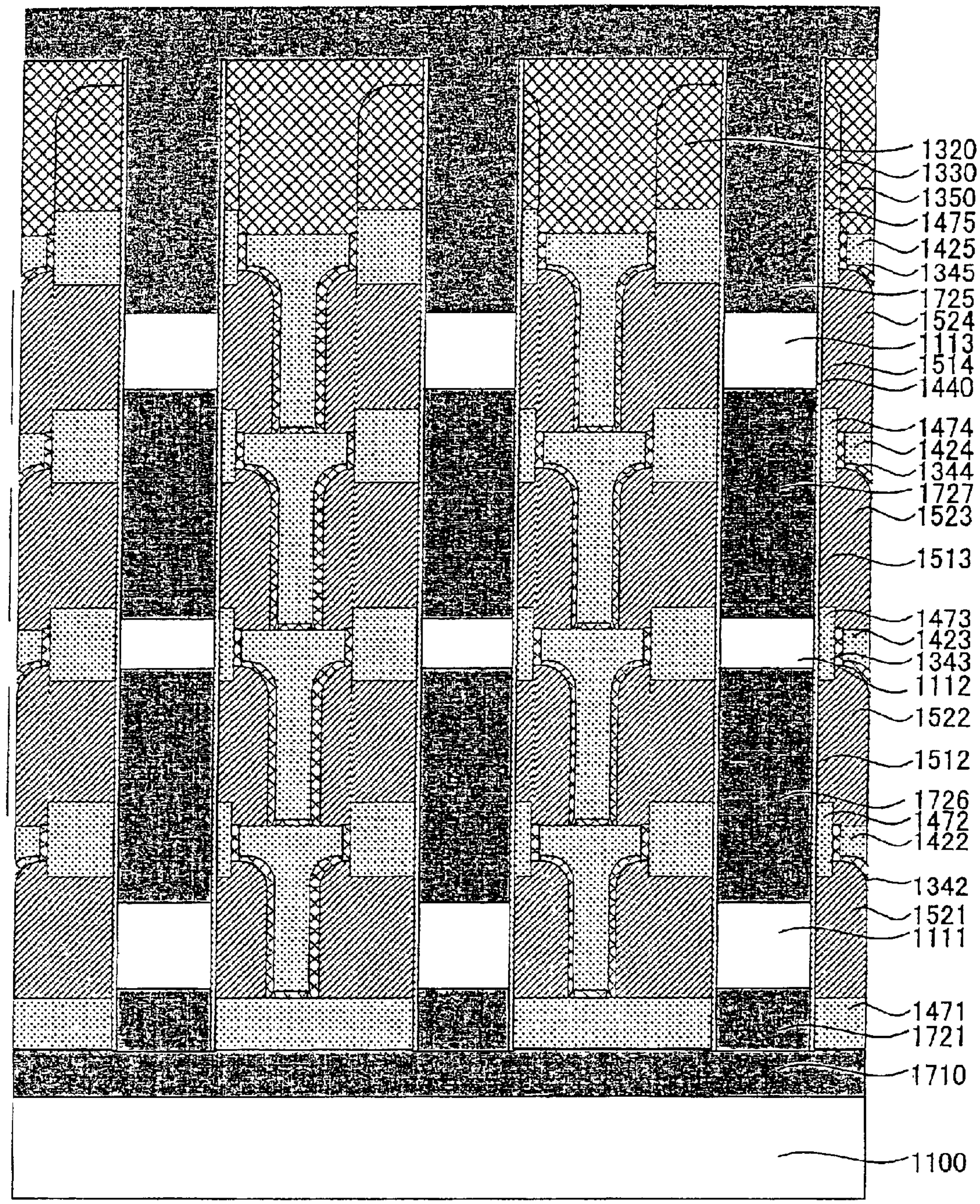

Fig. 1165
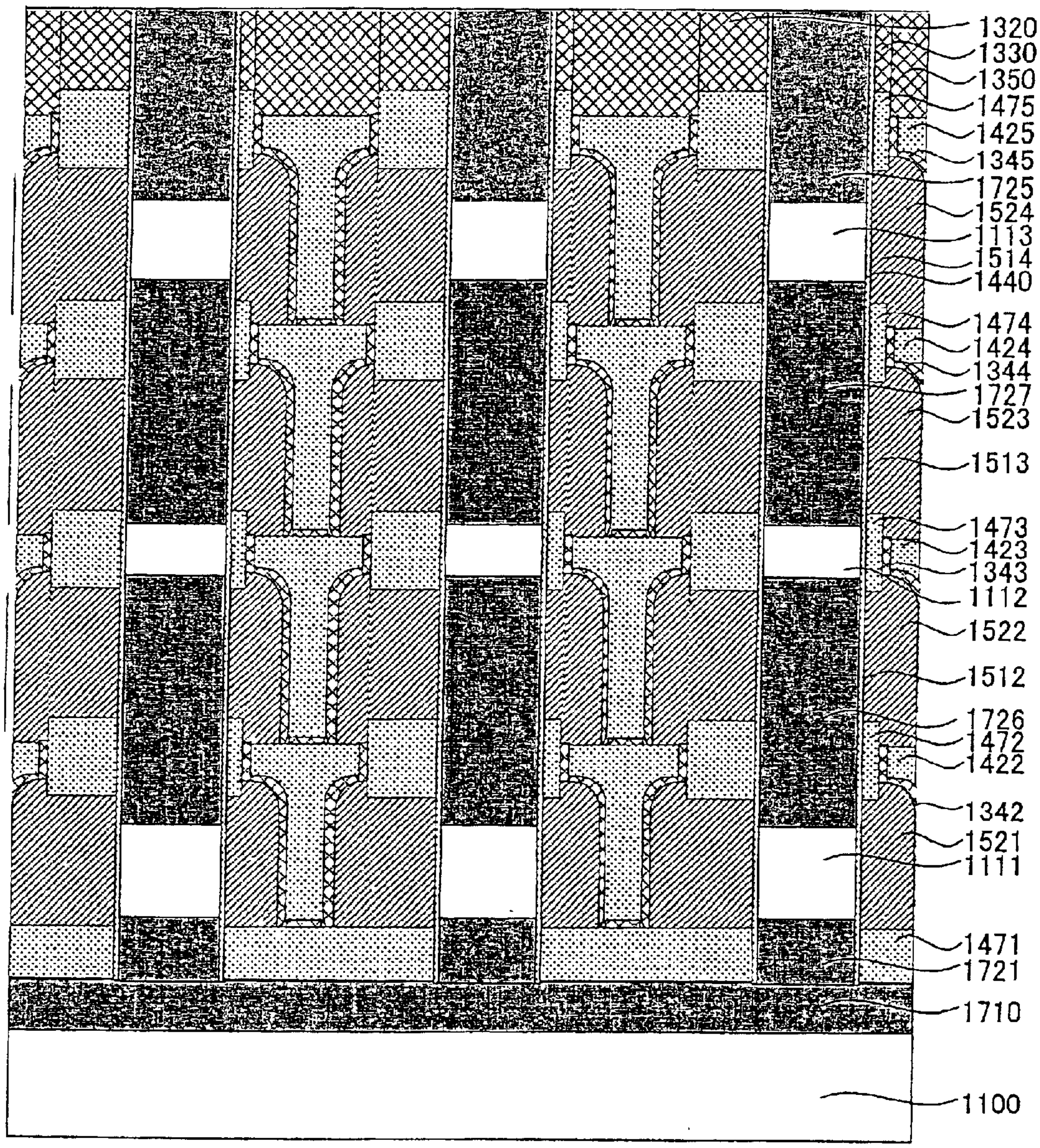

Fig. 1166
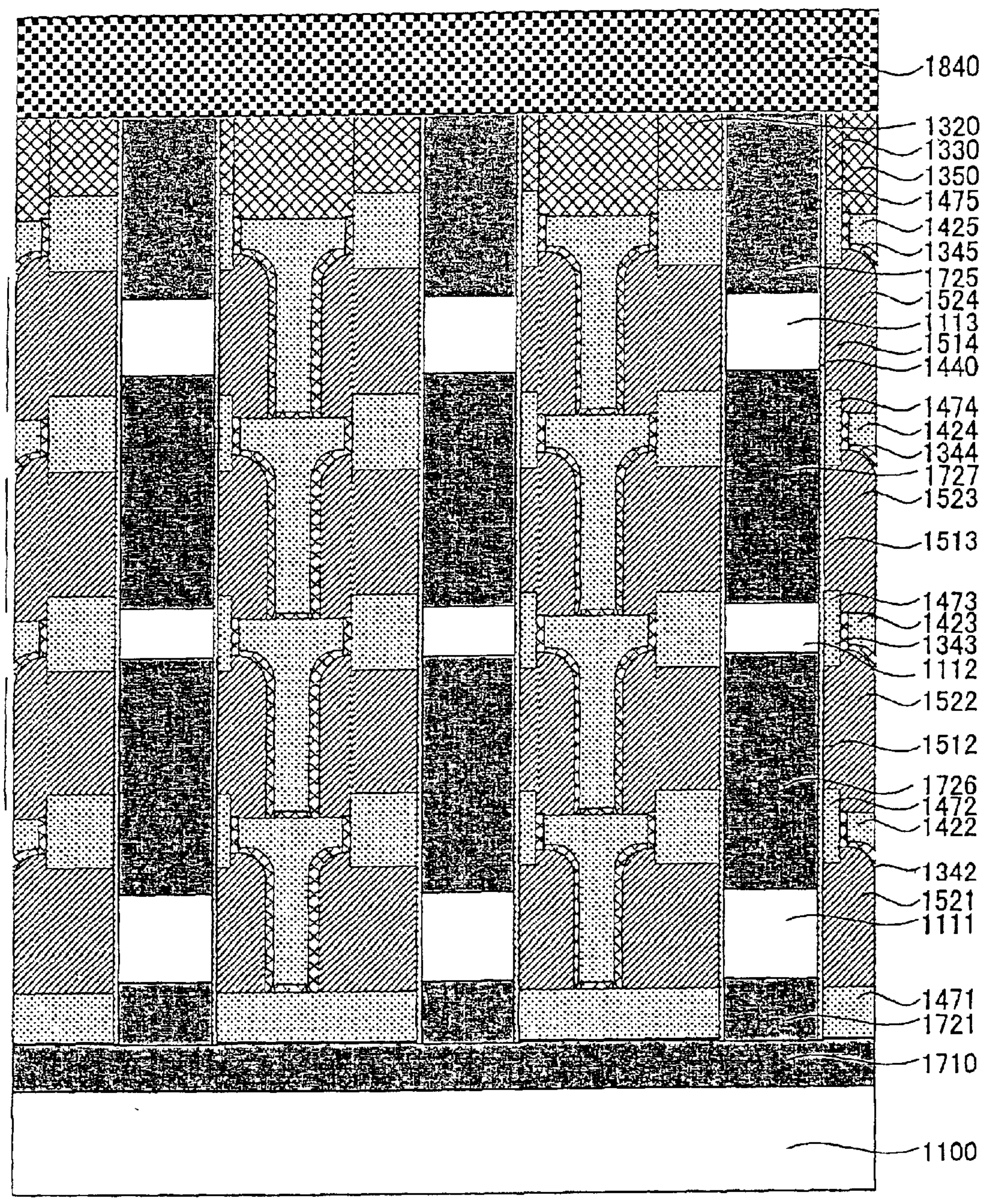

Fig. 1167
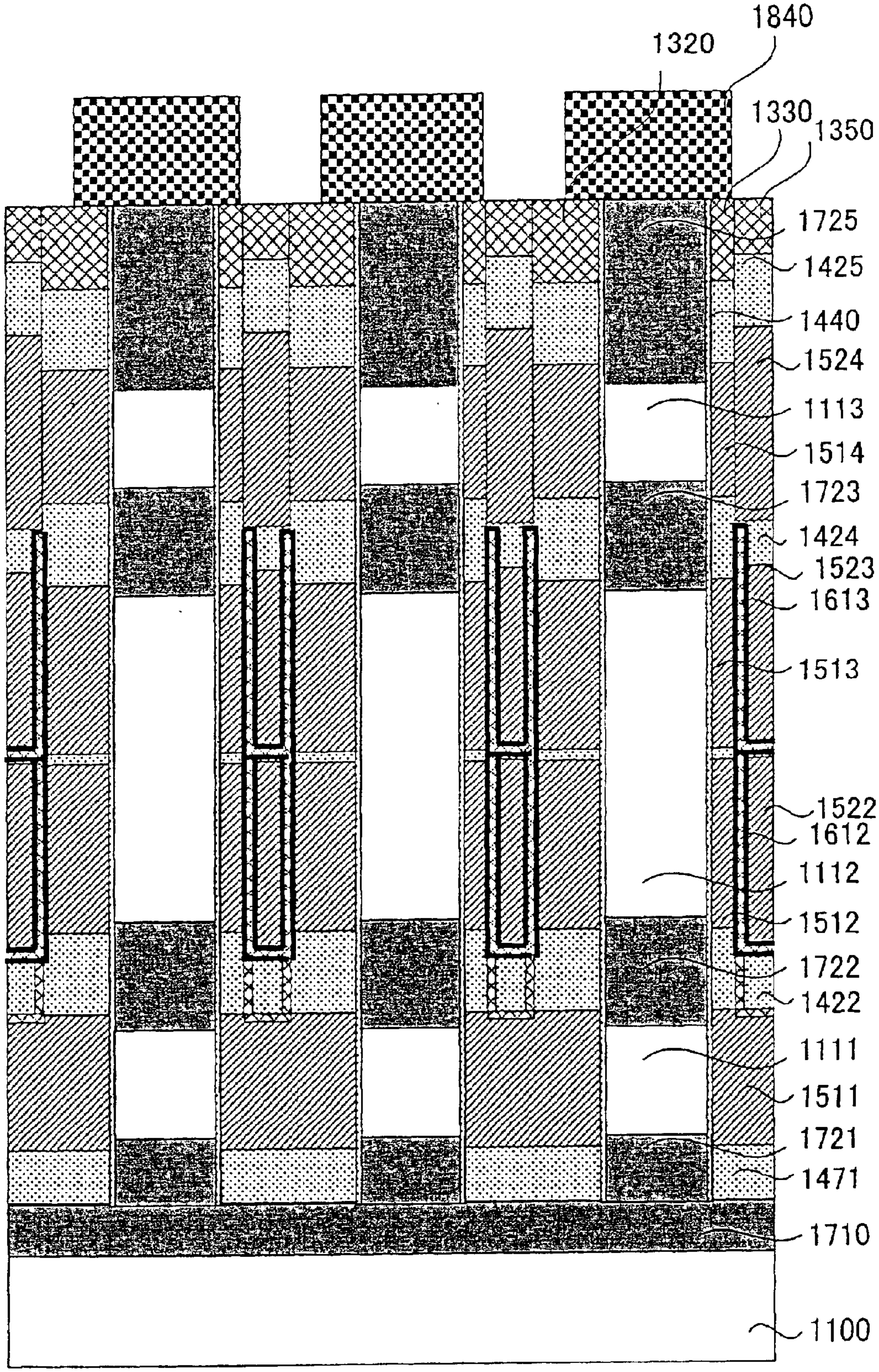

Fig. 1168
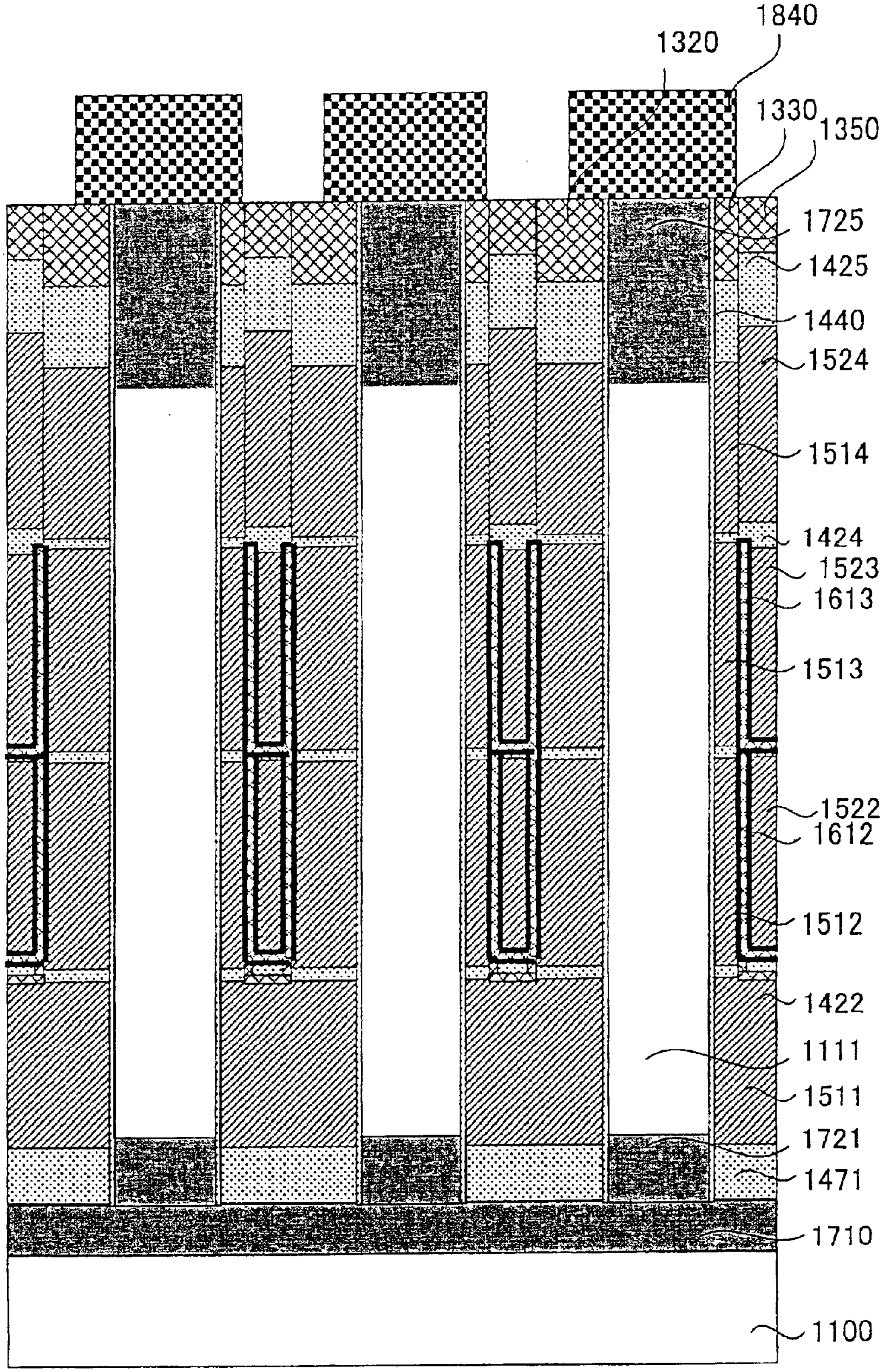

Fig. 1169
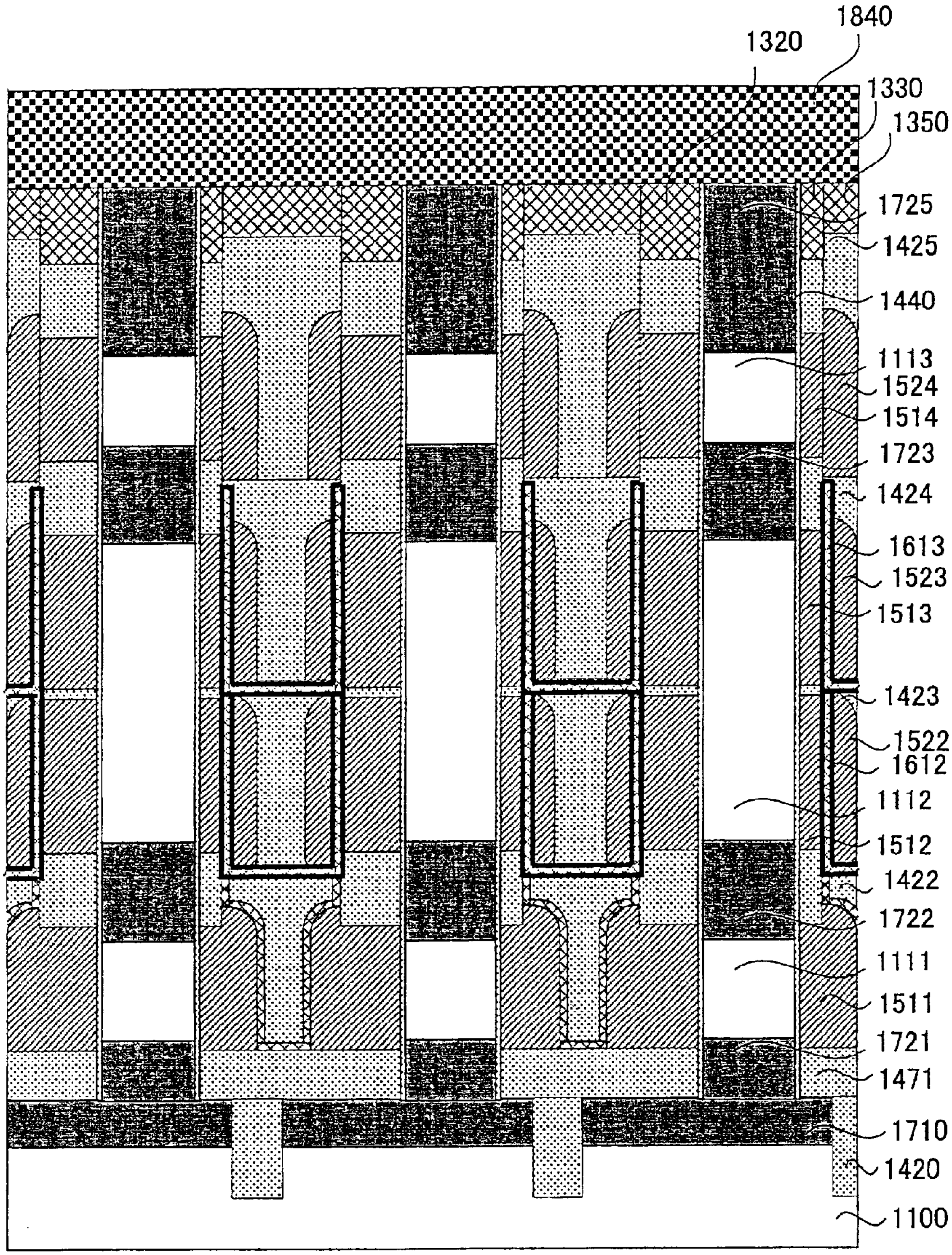

Fig. 1170
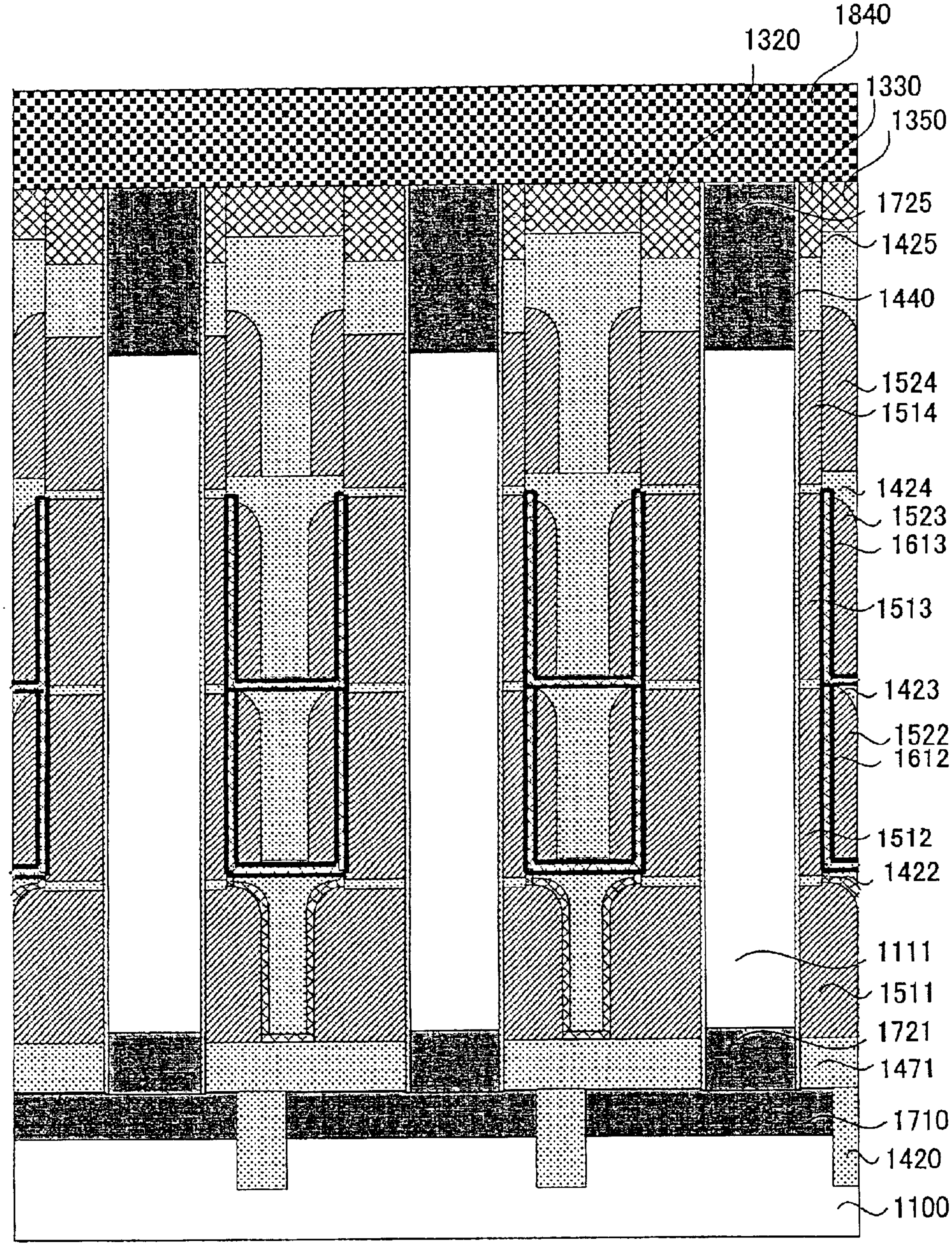

Fig. 1171
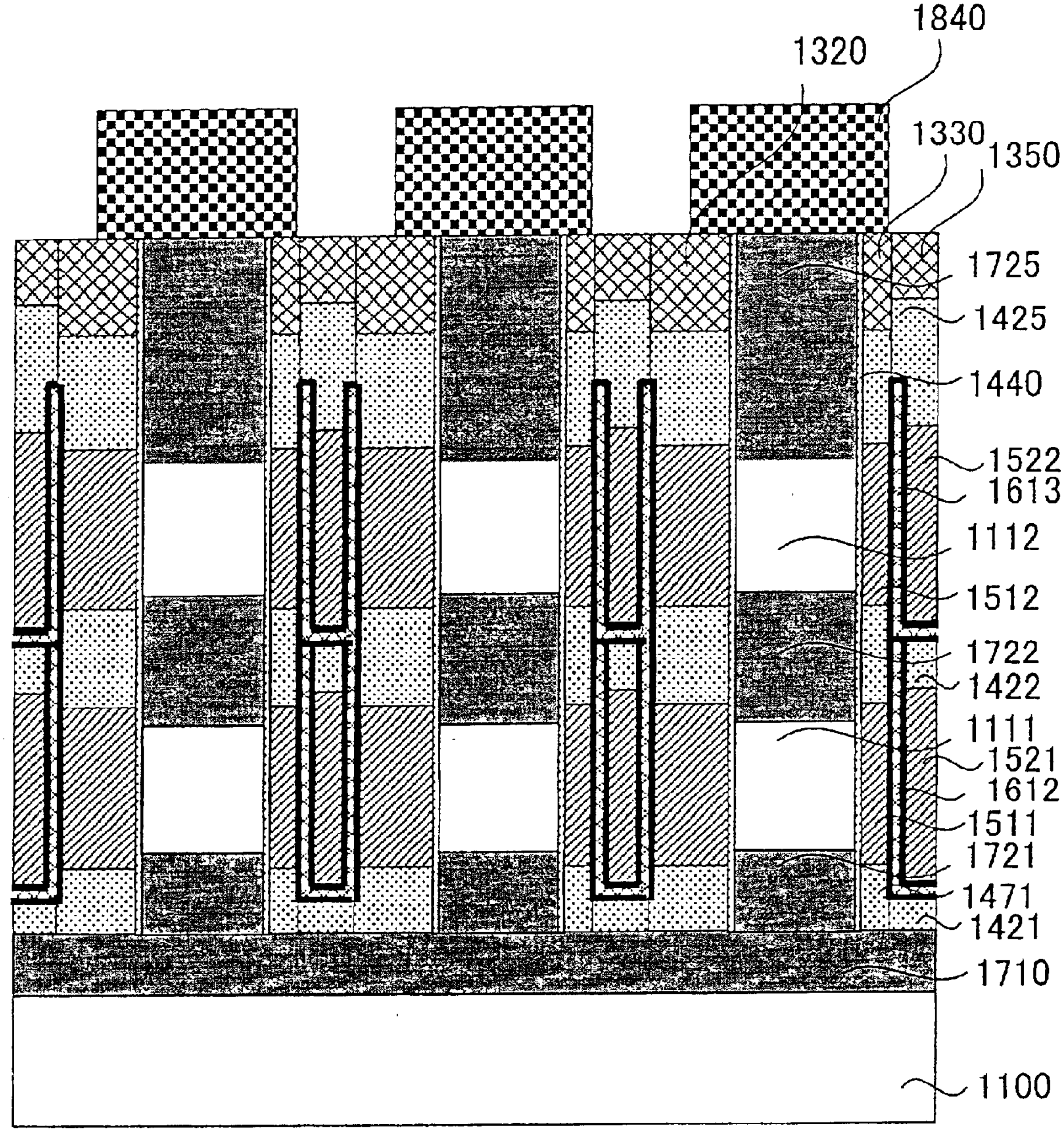

Fig. 1172
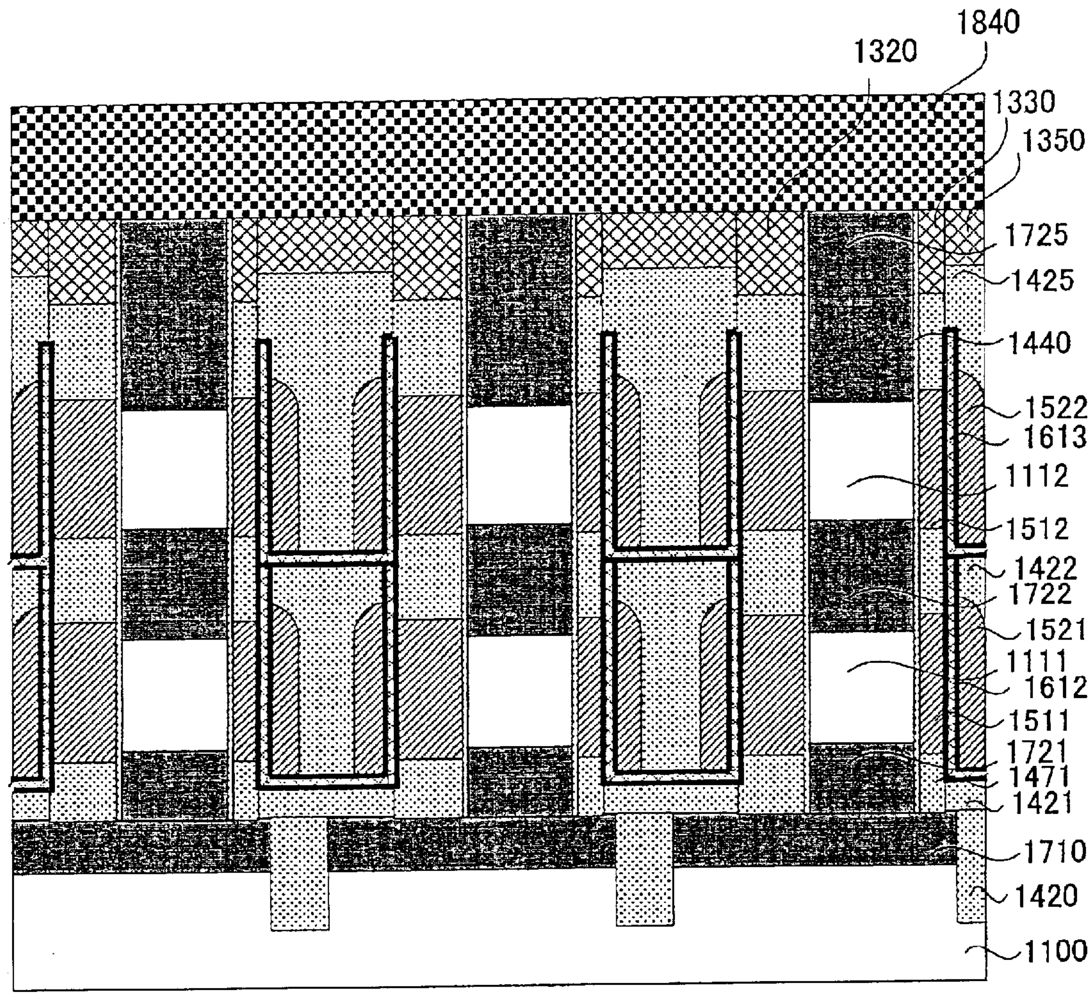

Fig. 1173
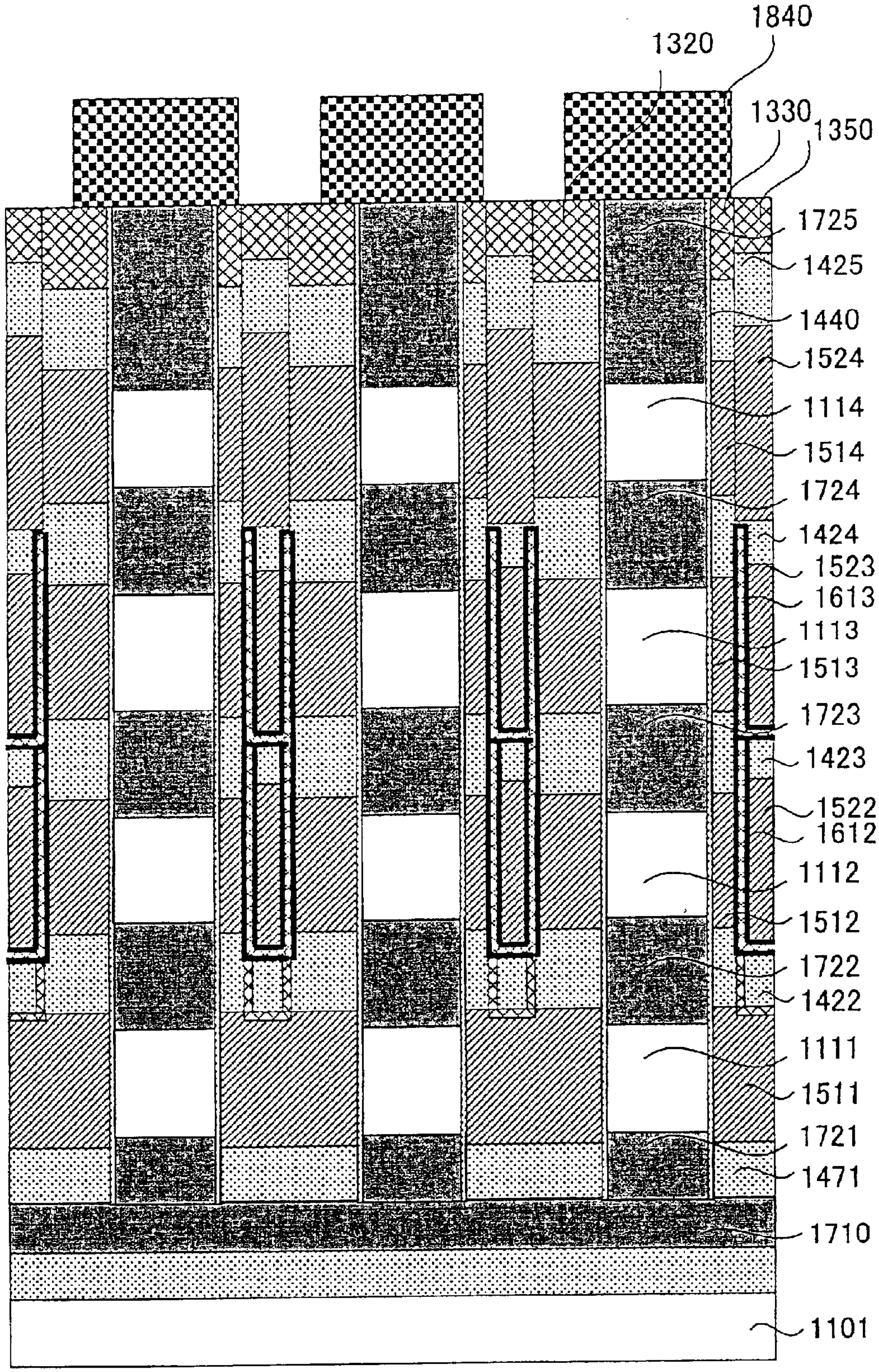

Fig. 1174
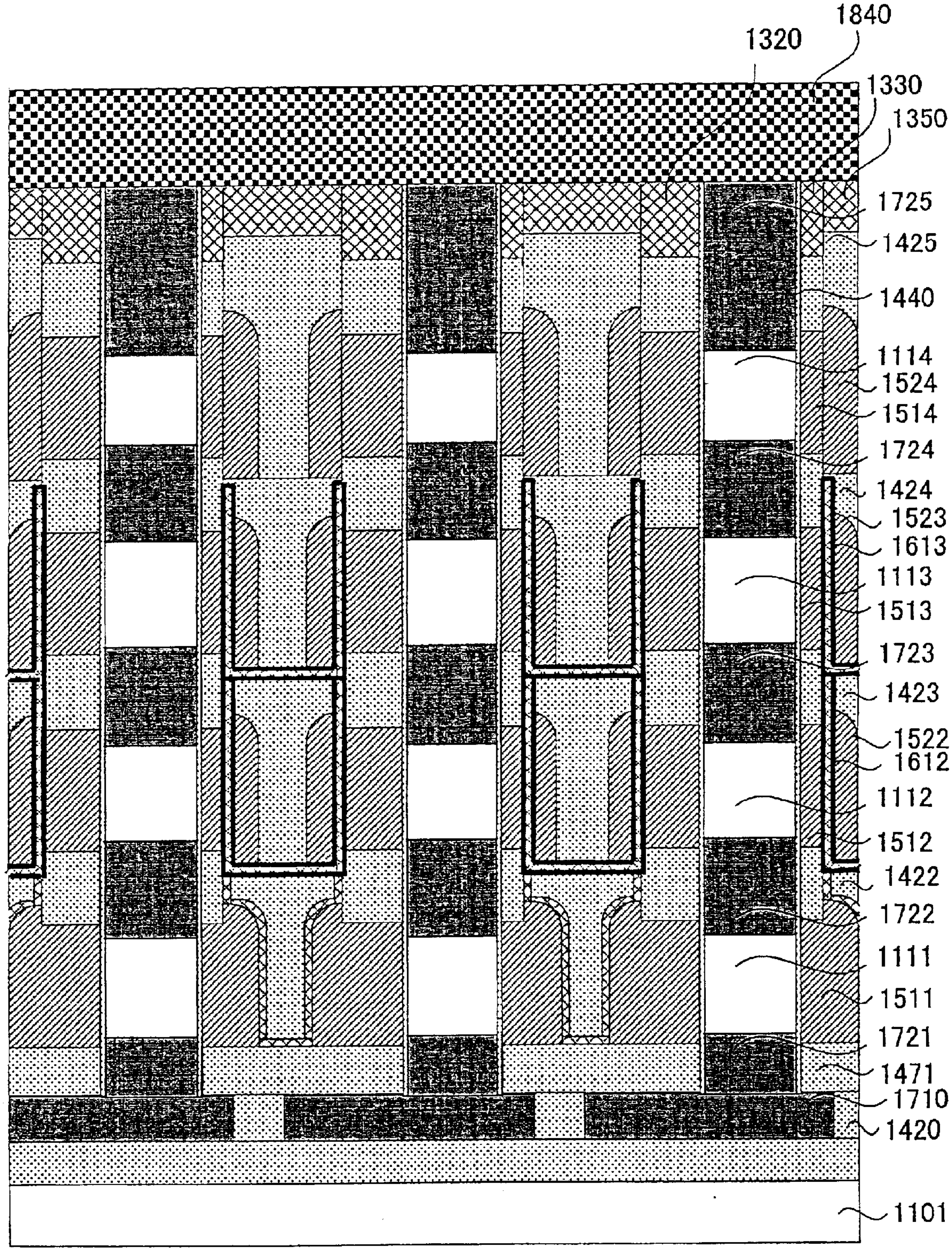

Fig. 1175
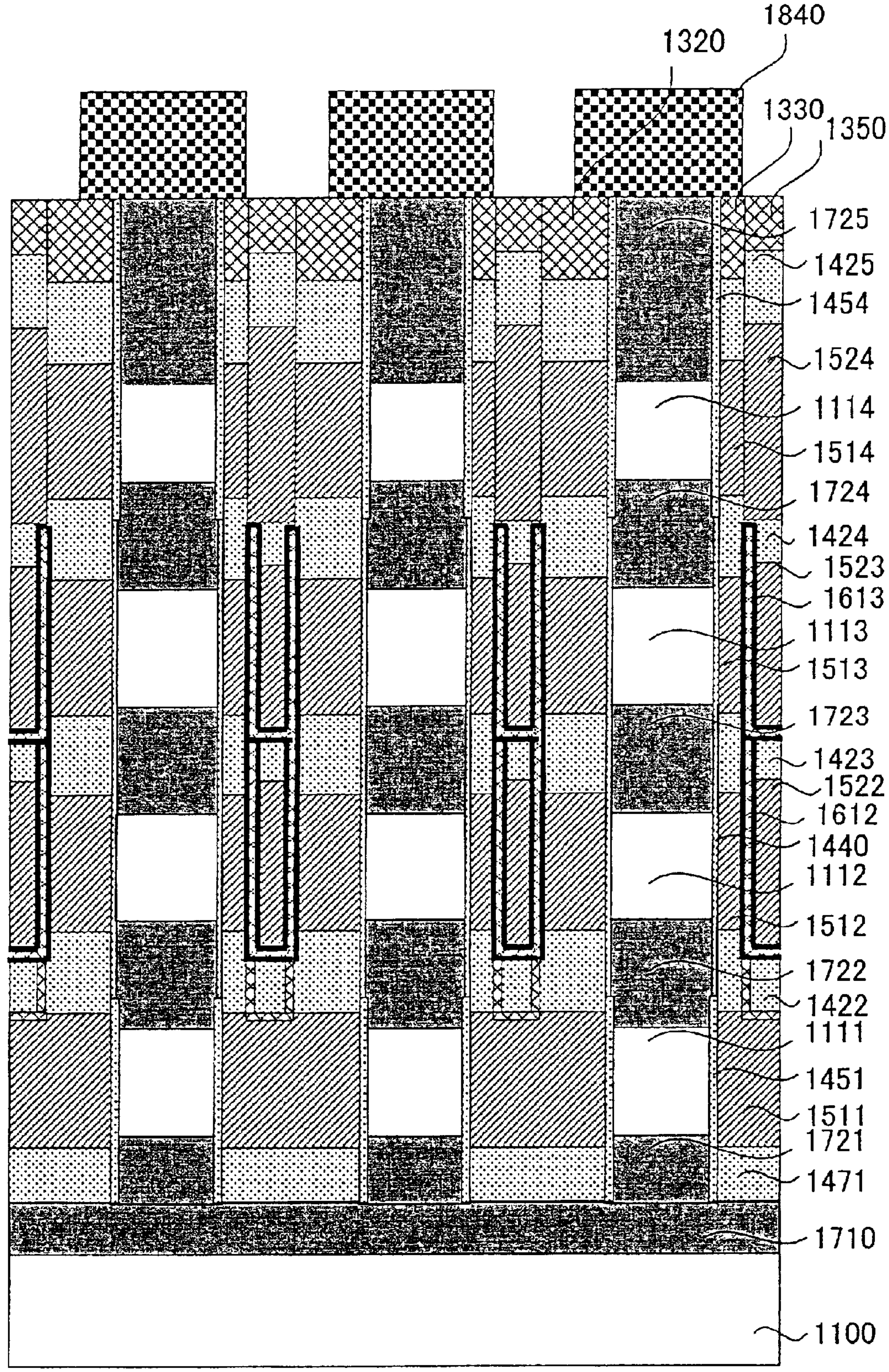

Fig. 1176
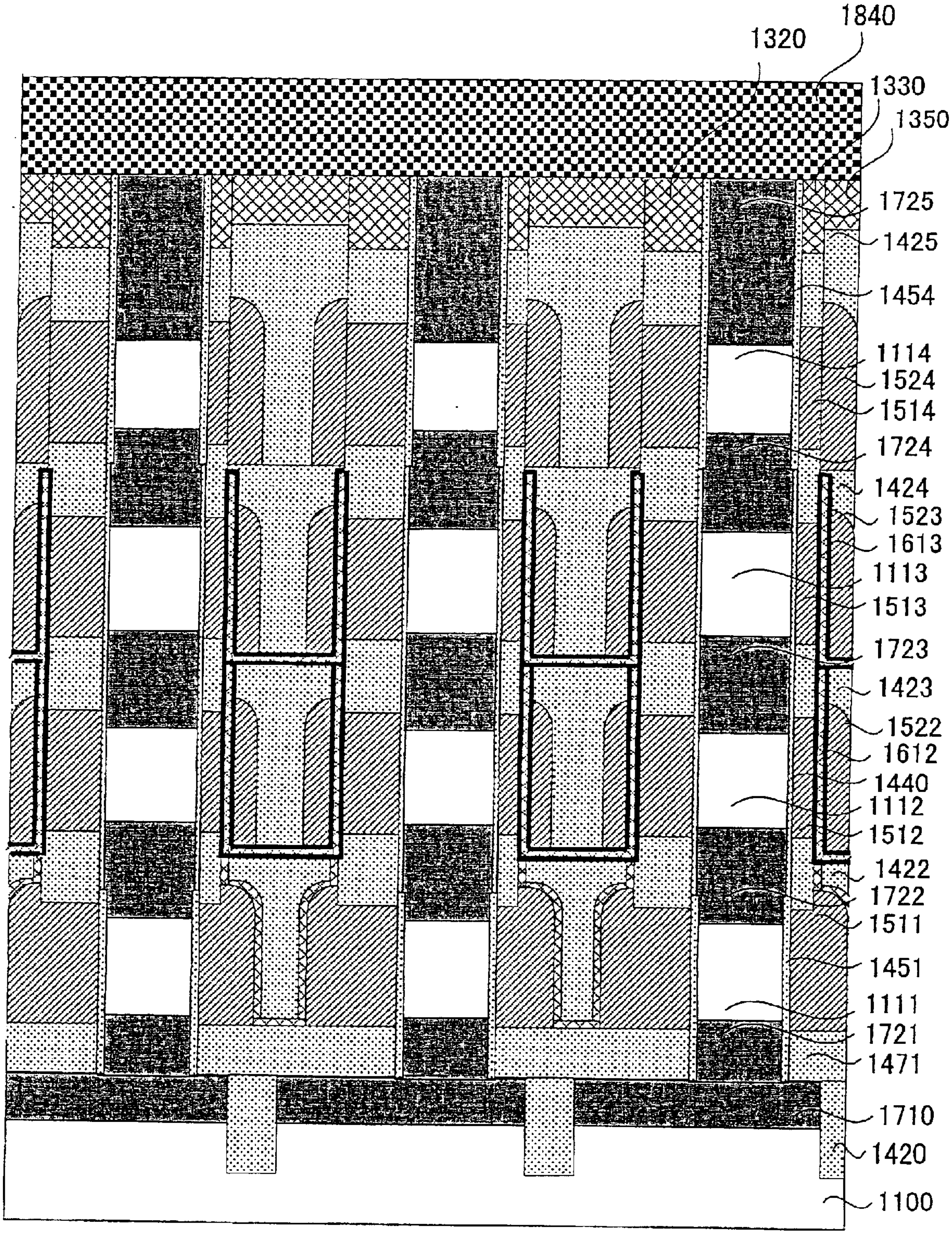

Fig. 1177
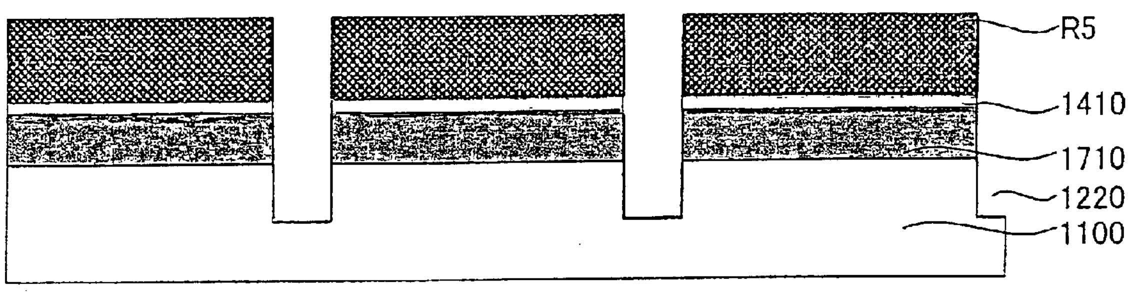
Fig. 1178
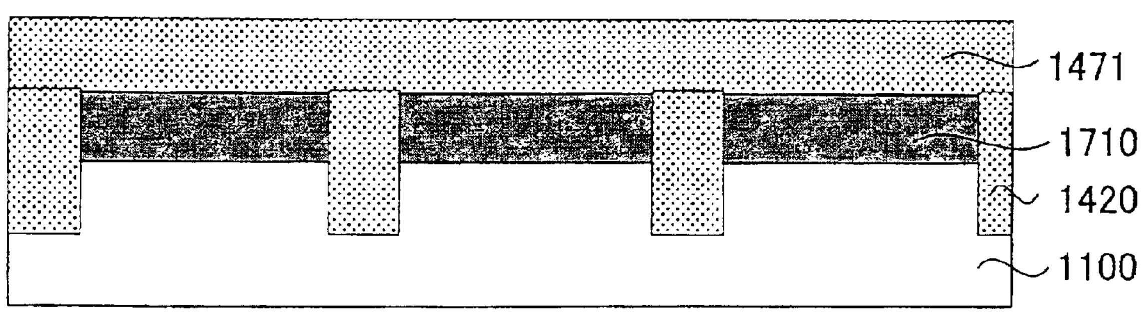

Fig. 1179
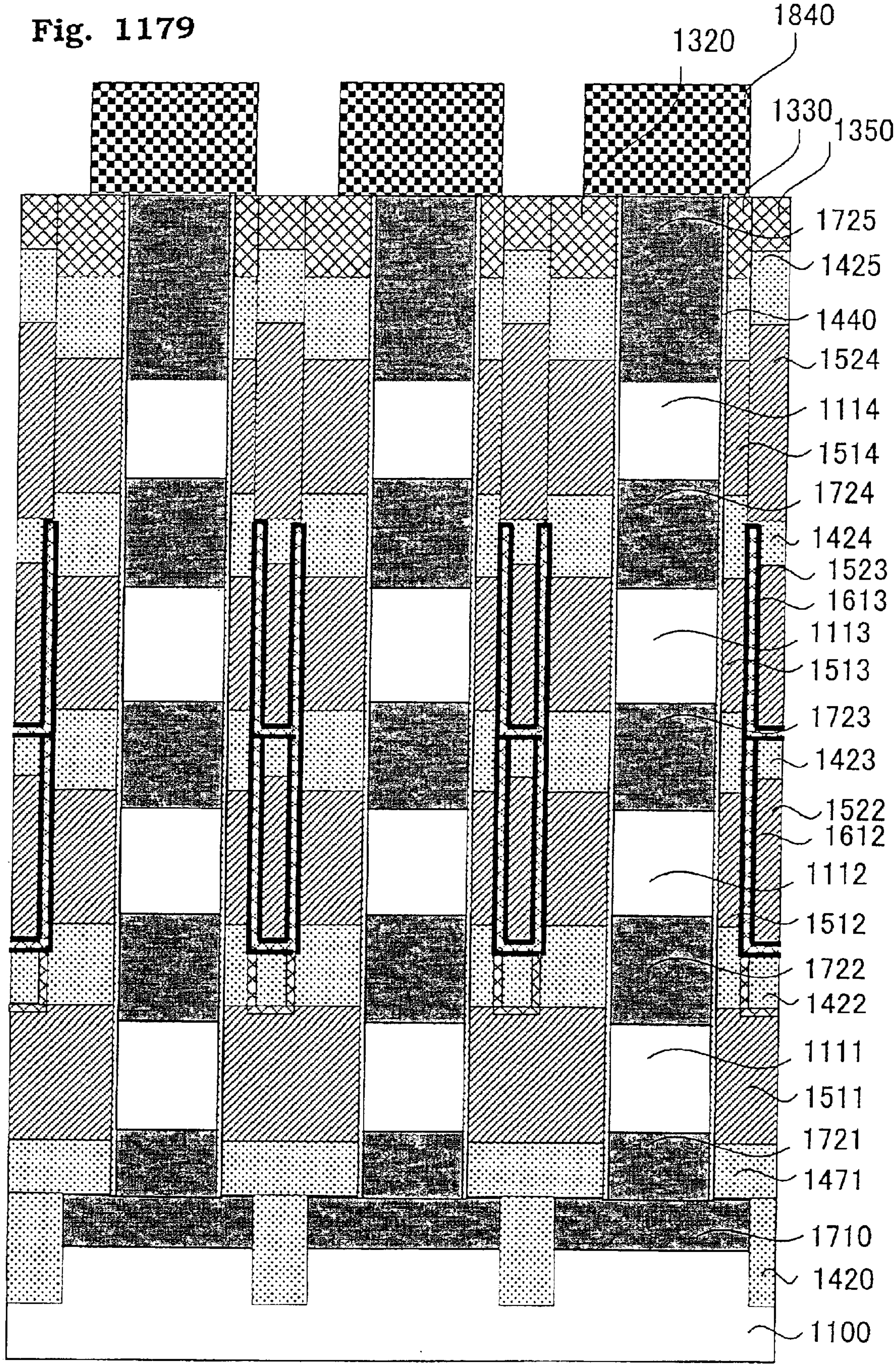

Fig. 1180
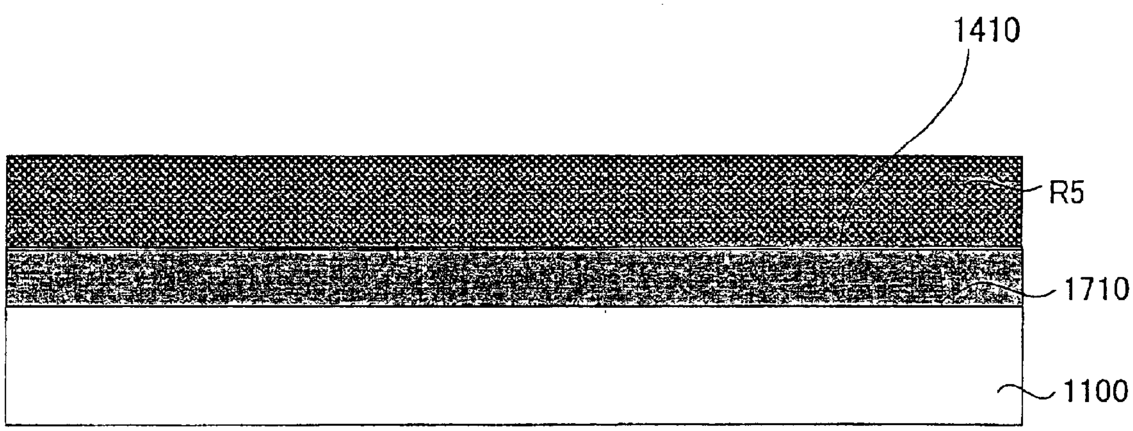
Fig. 1181
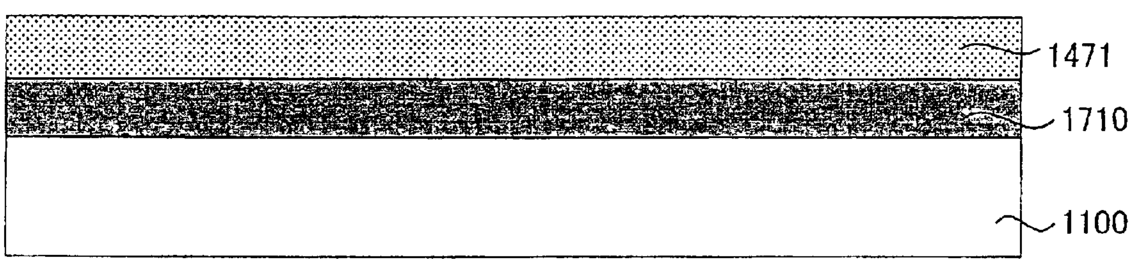

Fig. 1182
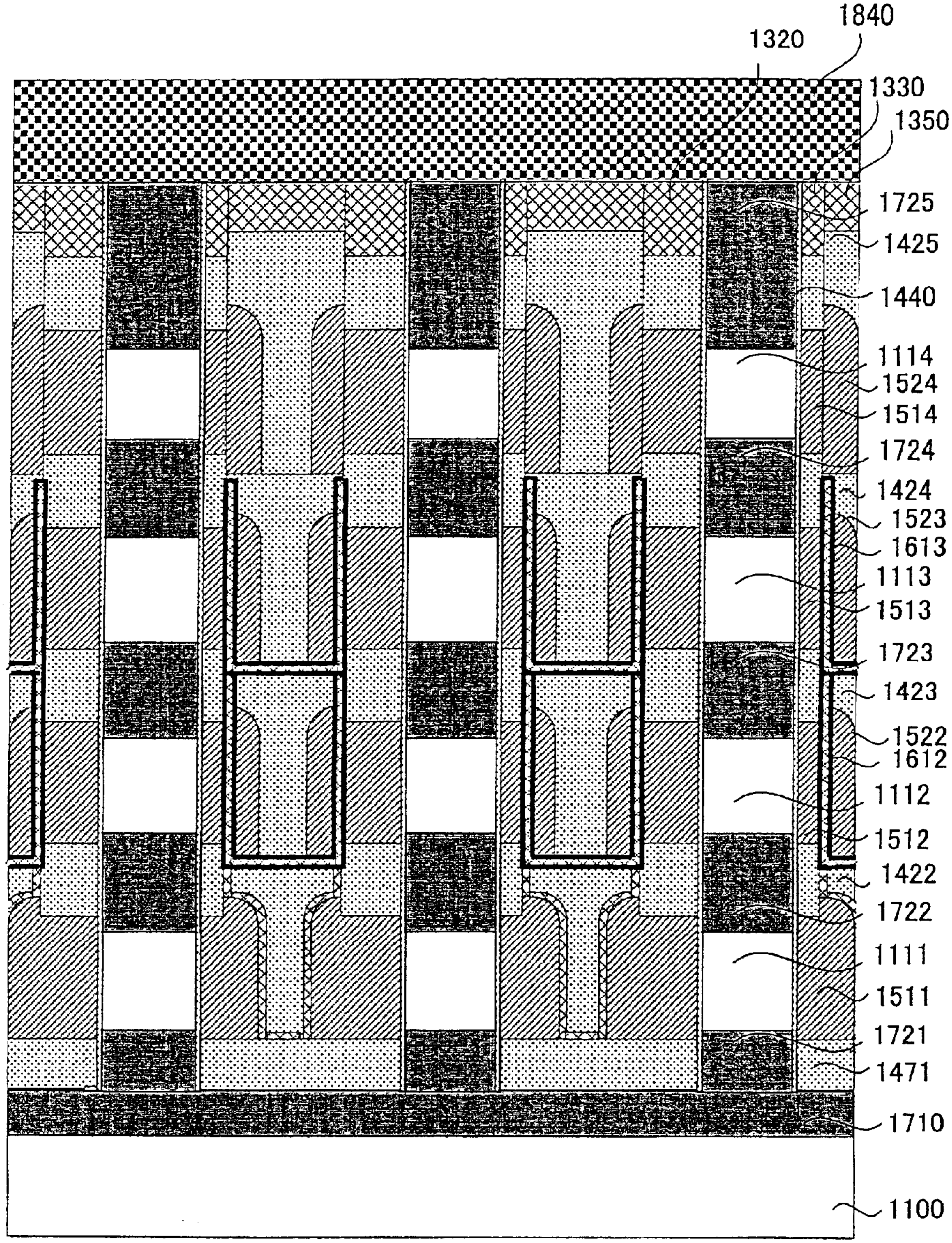

Fig. 1183
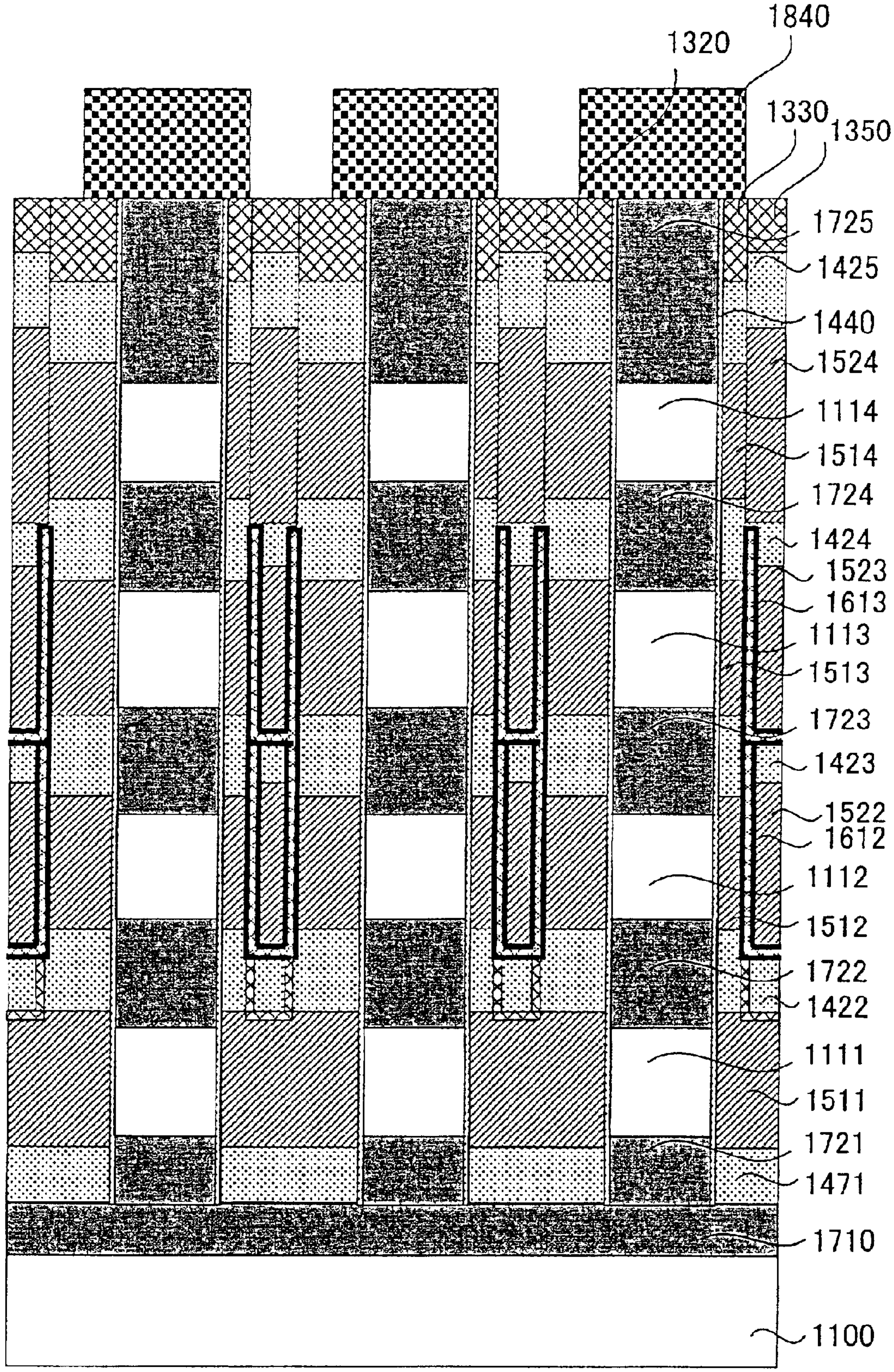

Fig. 1184
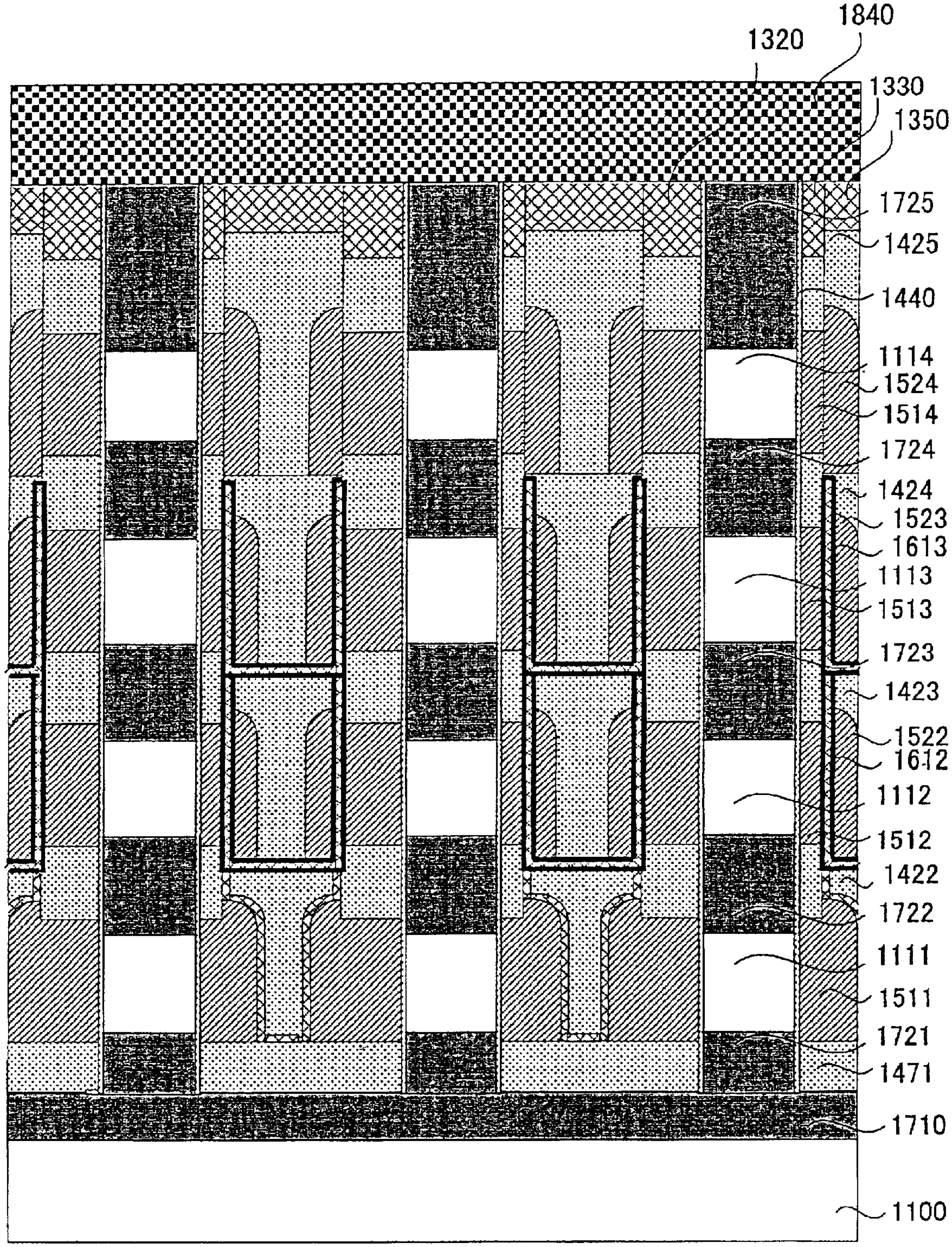

Fig. 1185
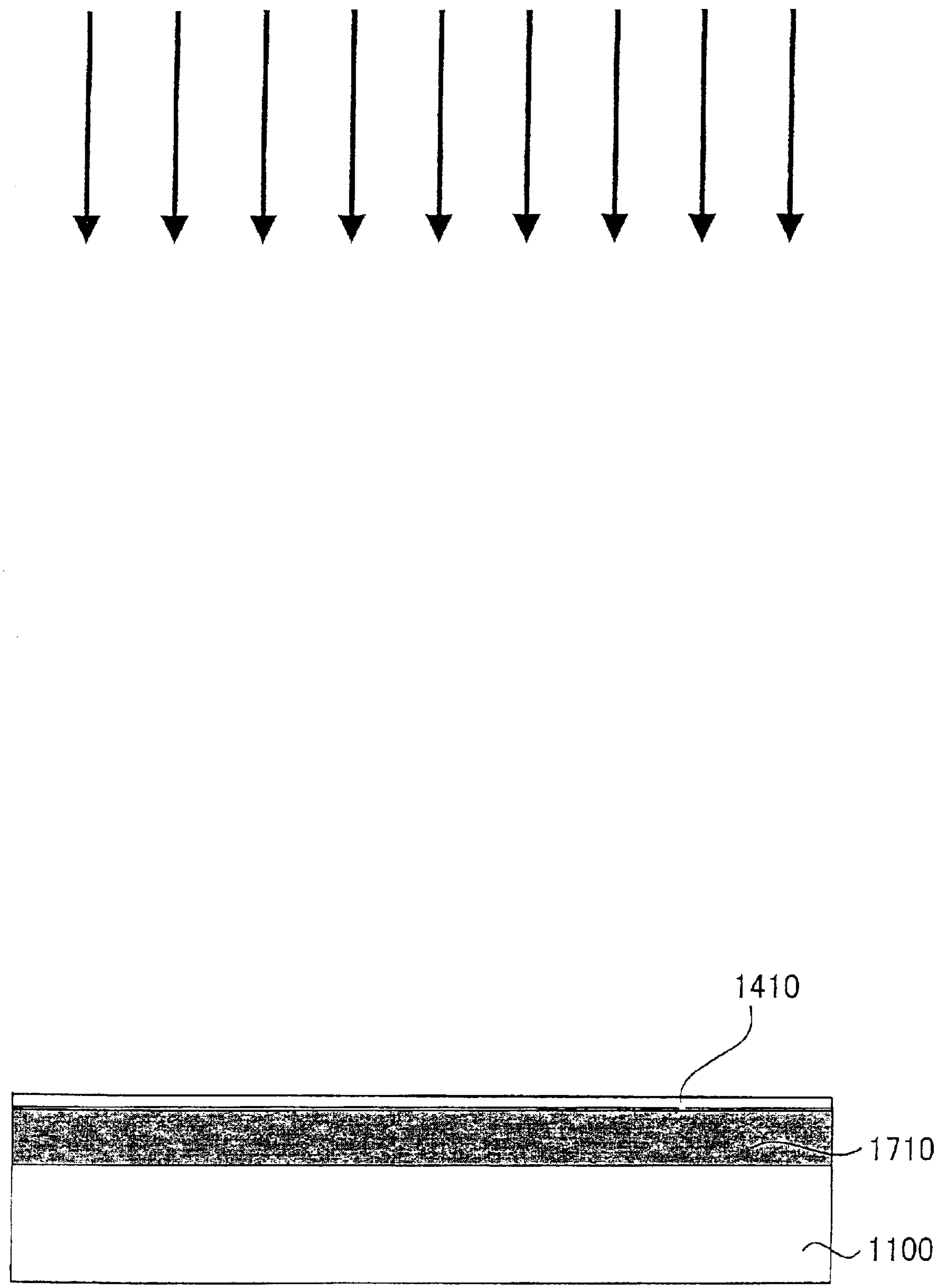

Fig. 1186
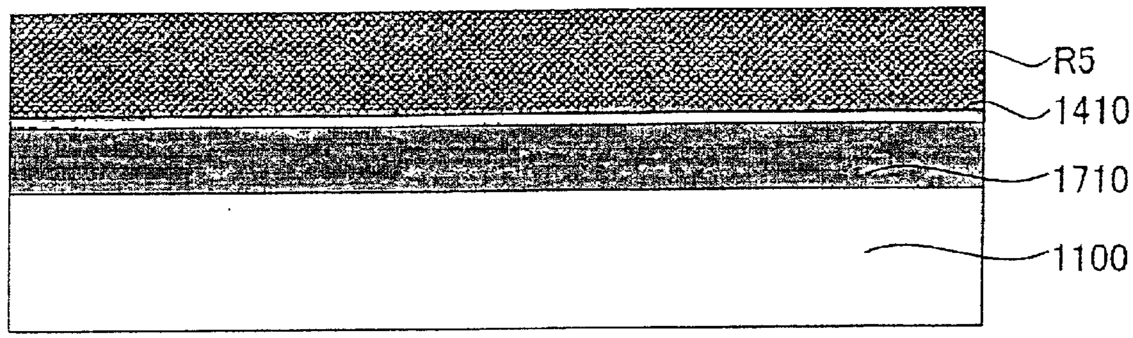
Fig. 1187
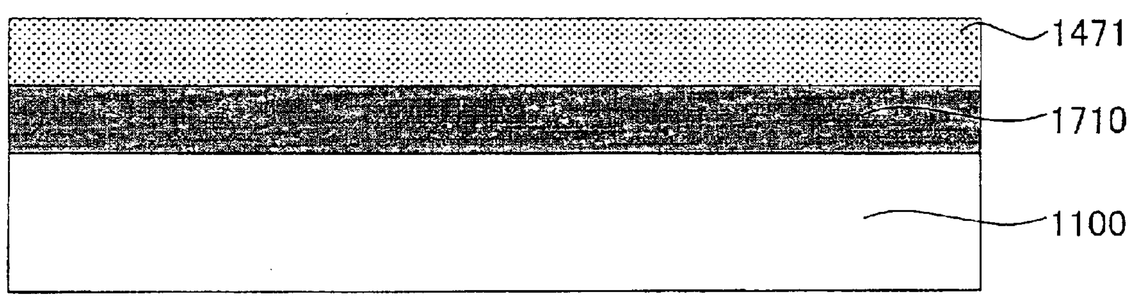

Fig. 1188
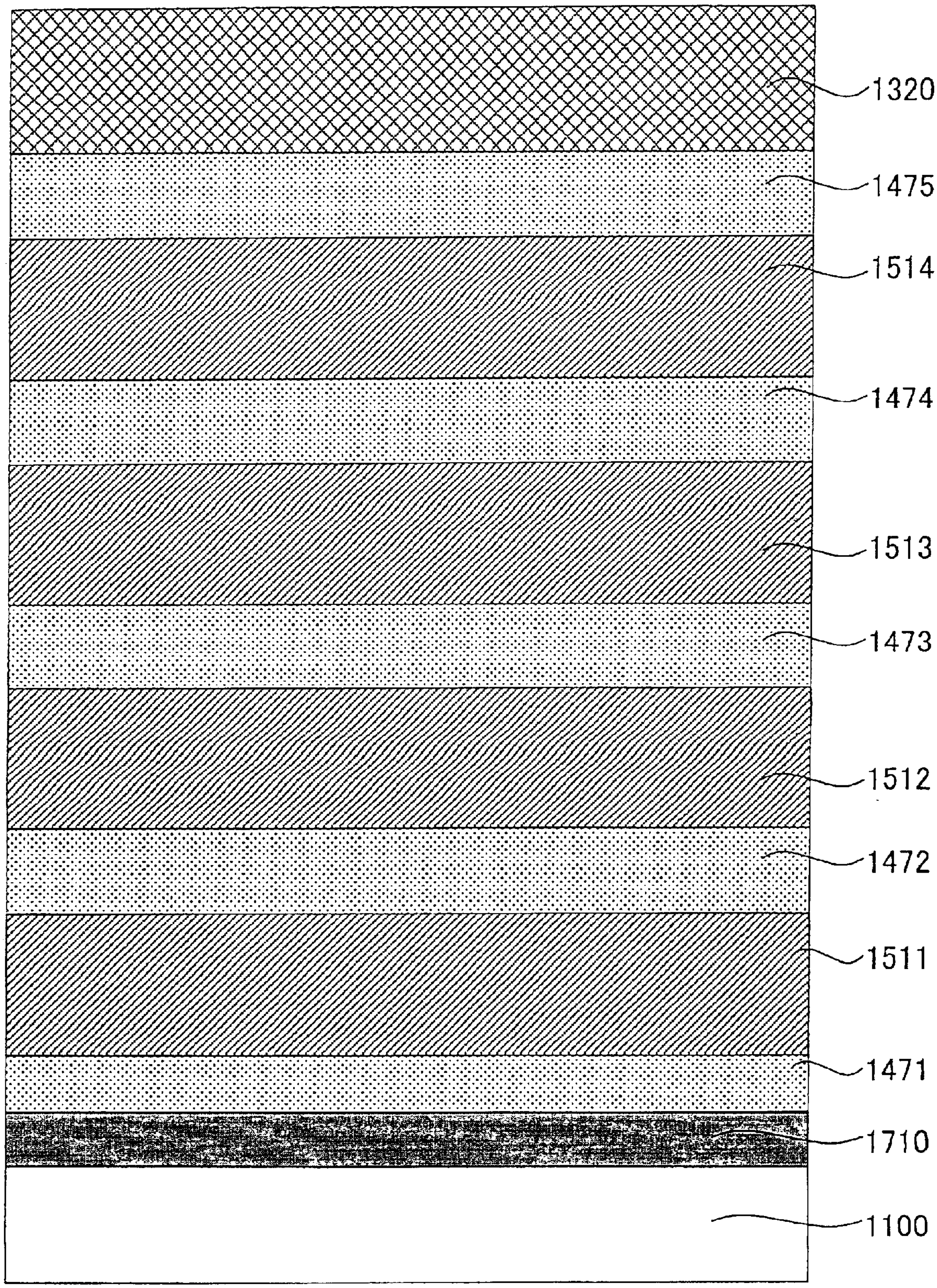

Fig. 1189
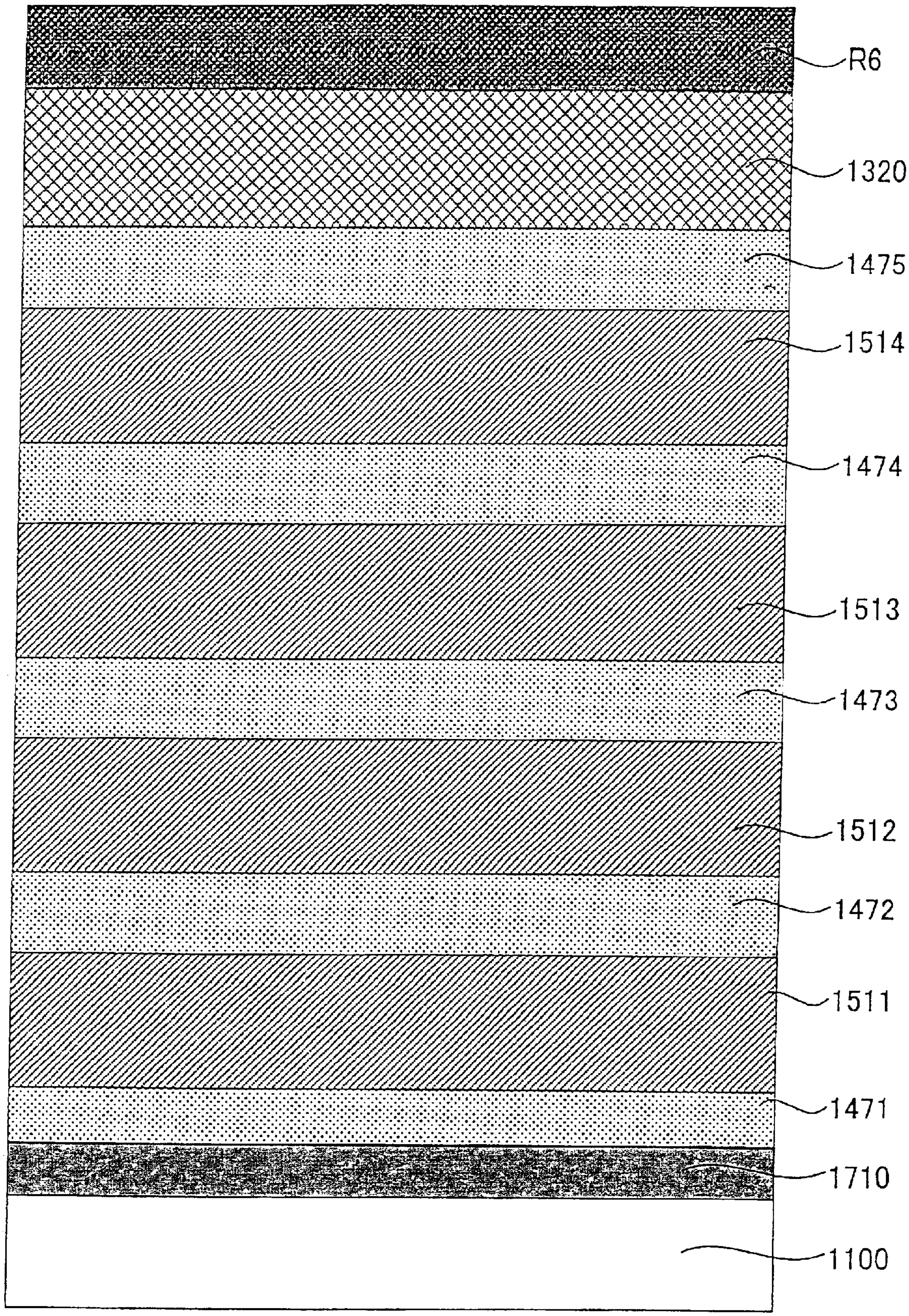

Fig. 1190
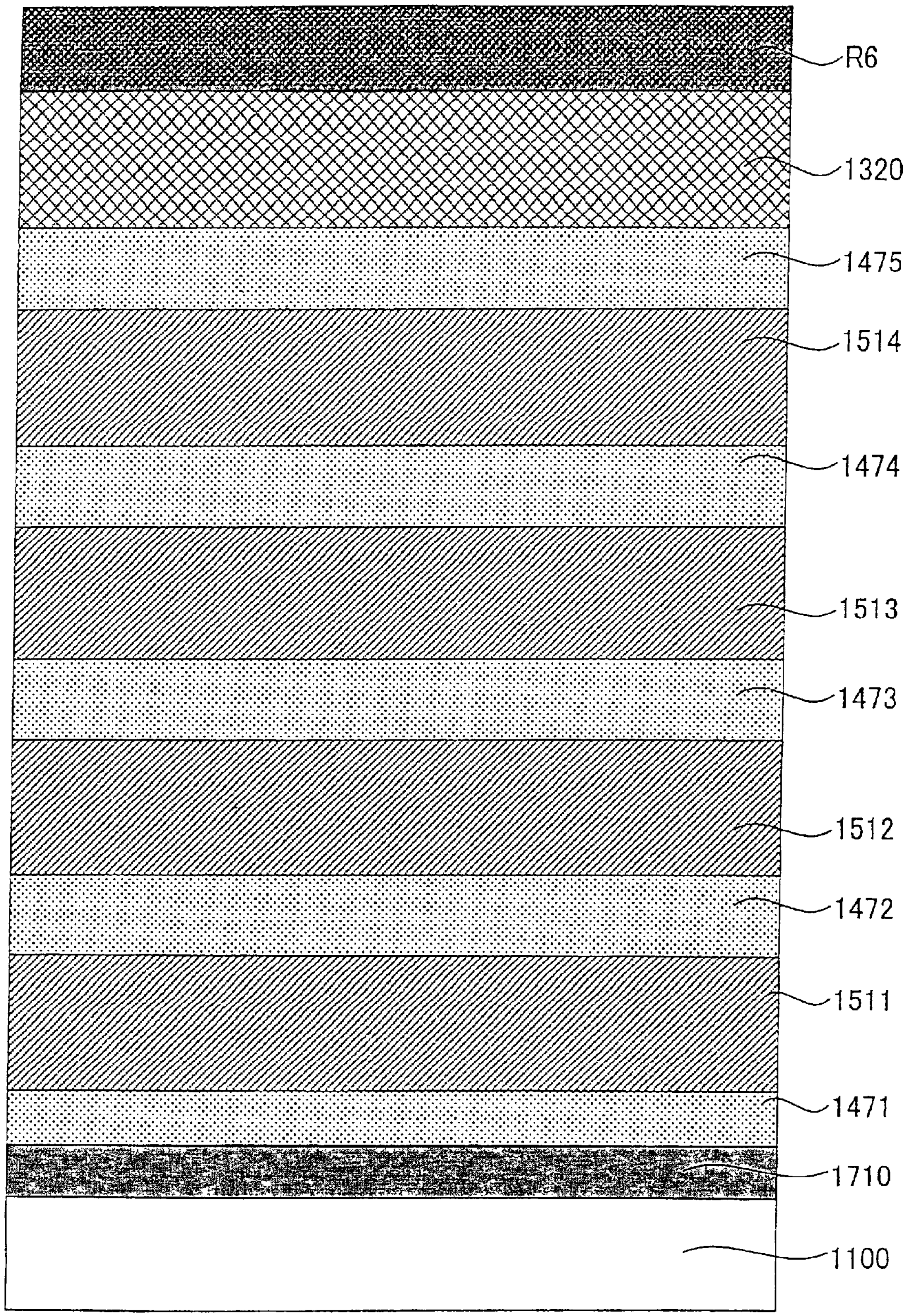

Fig. 1191
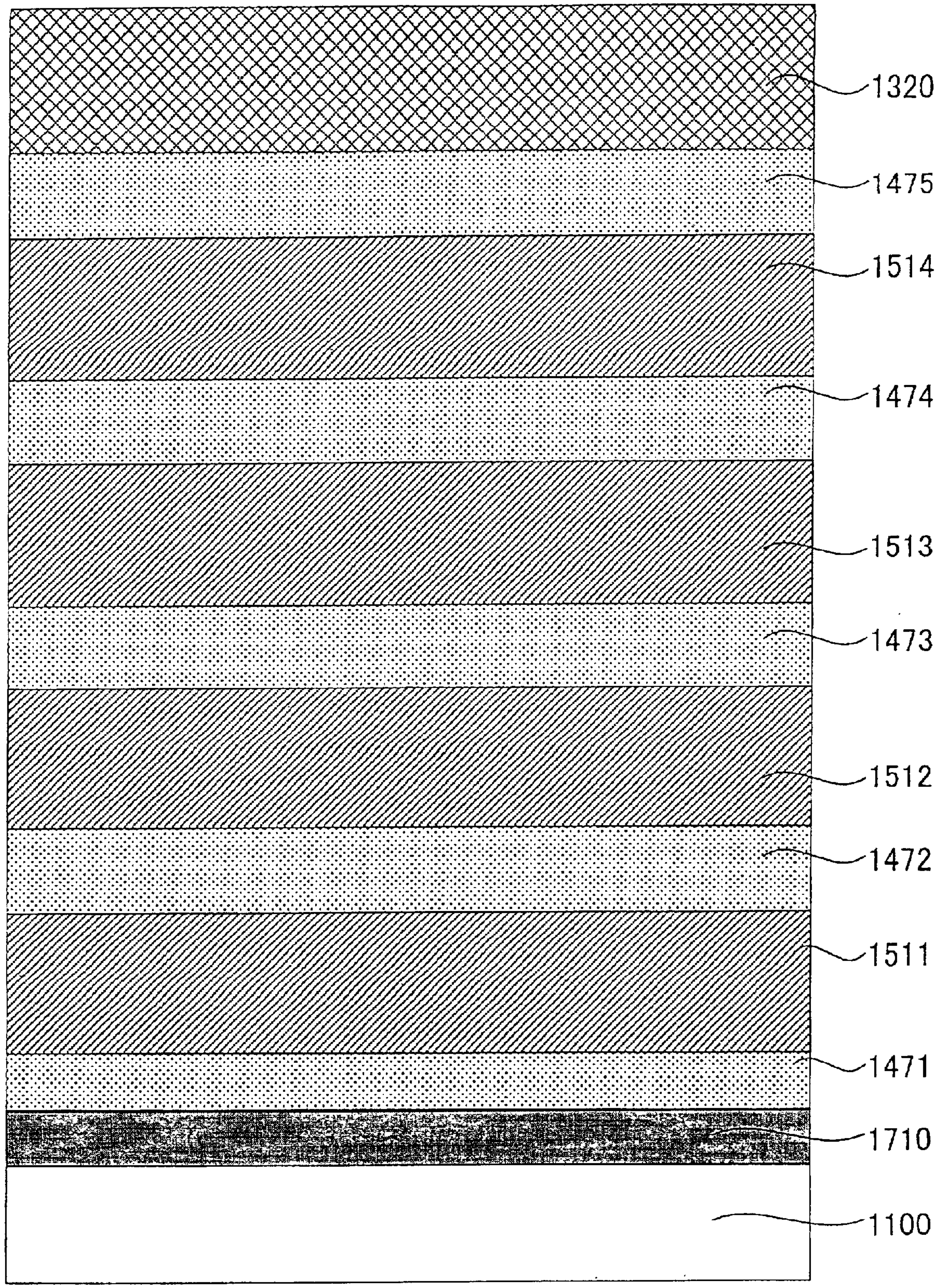

Fig. 1192
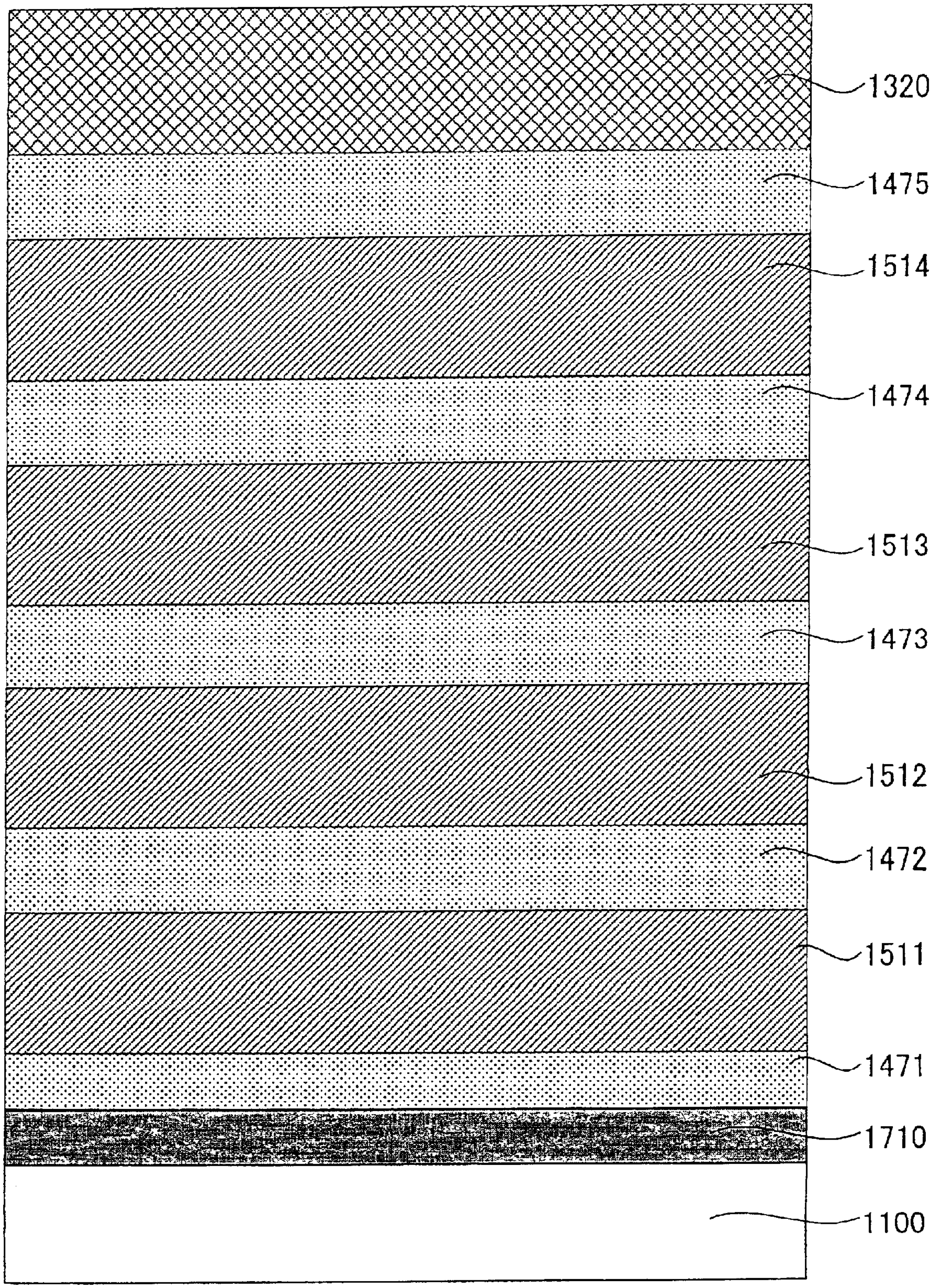

Fig. 1193
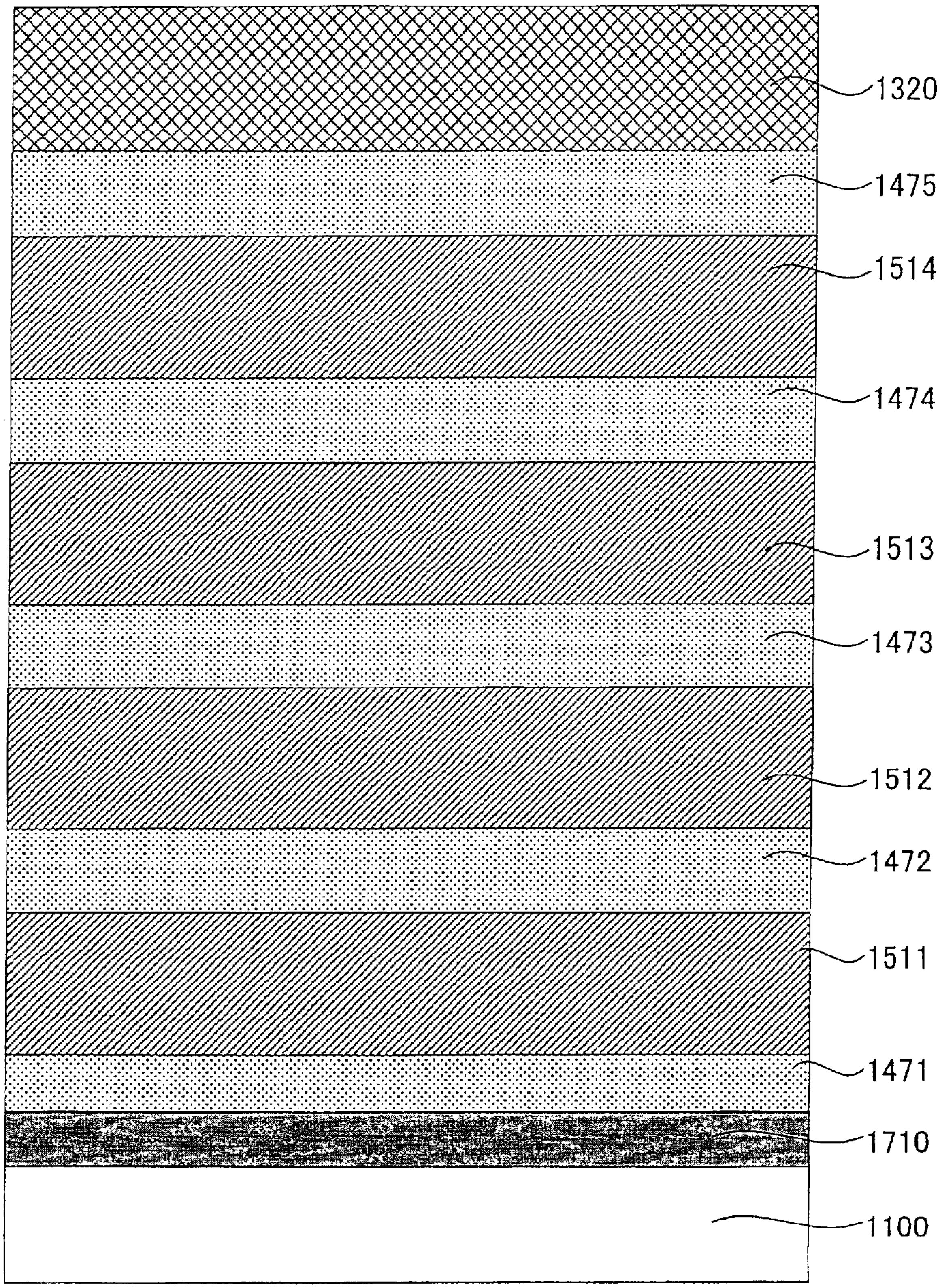

Fig. 1194
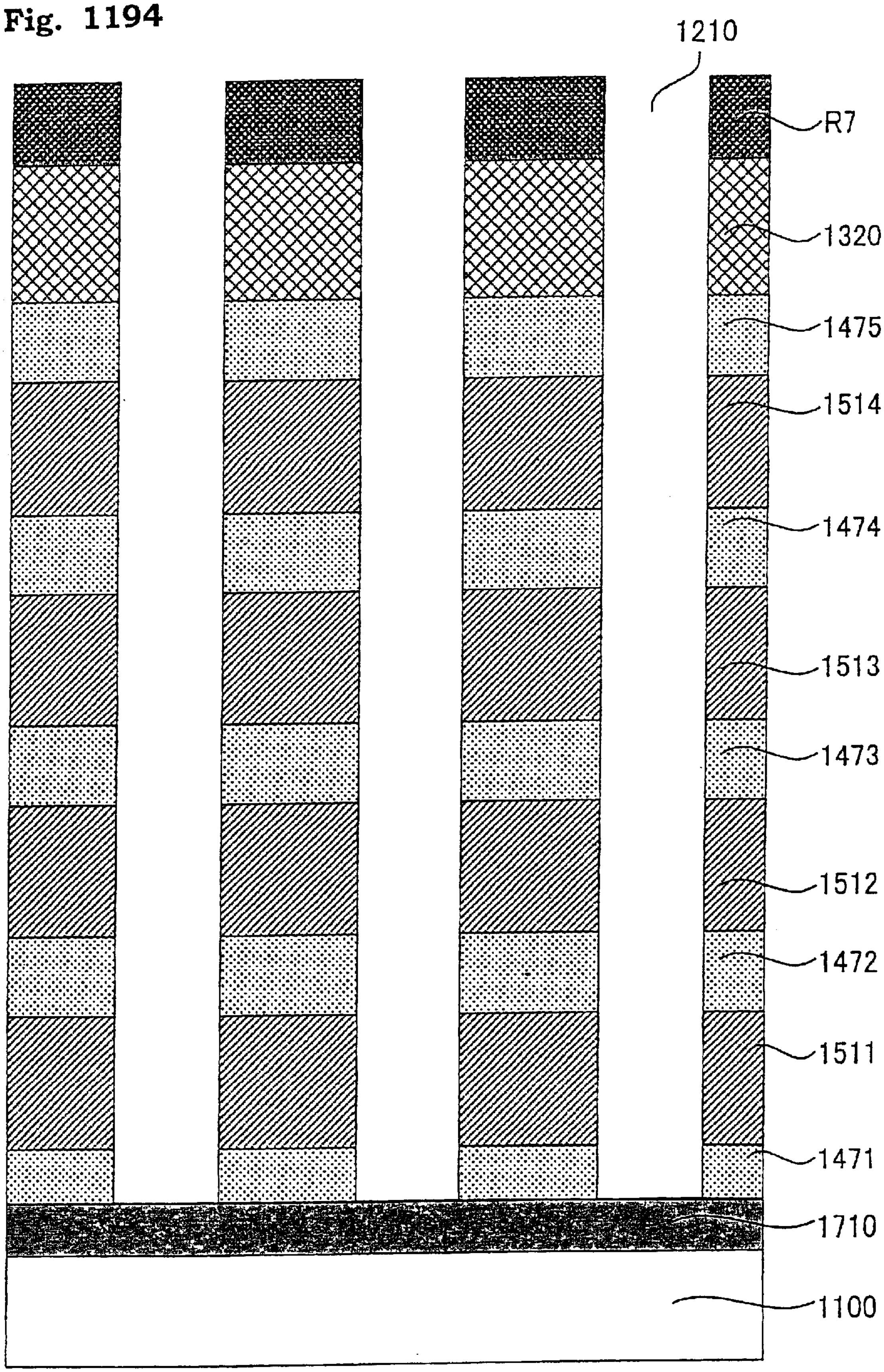

Fig. 1195
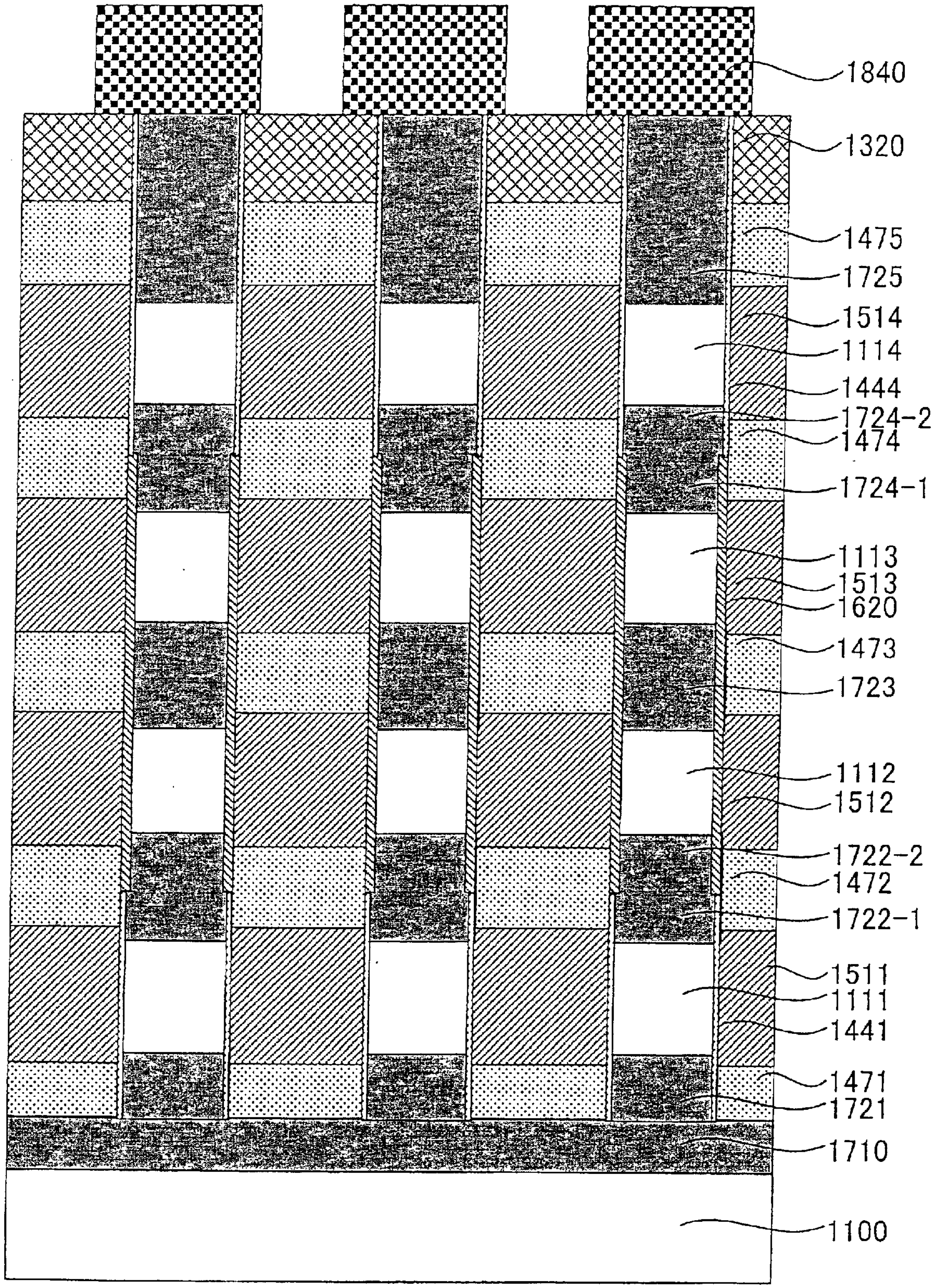

Fig. 1196
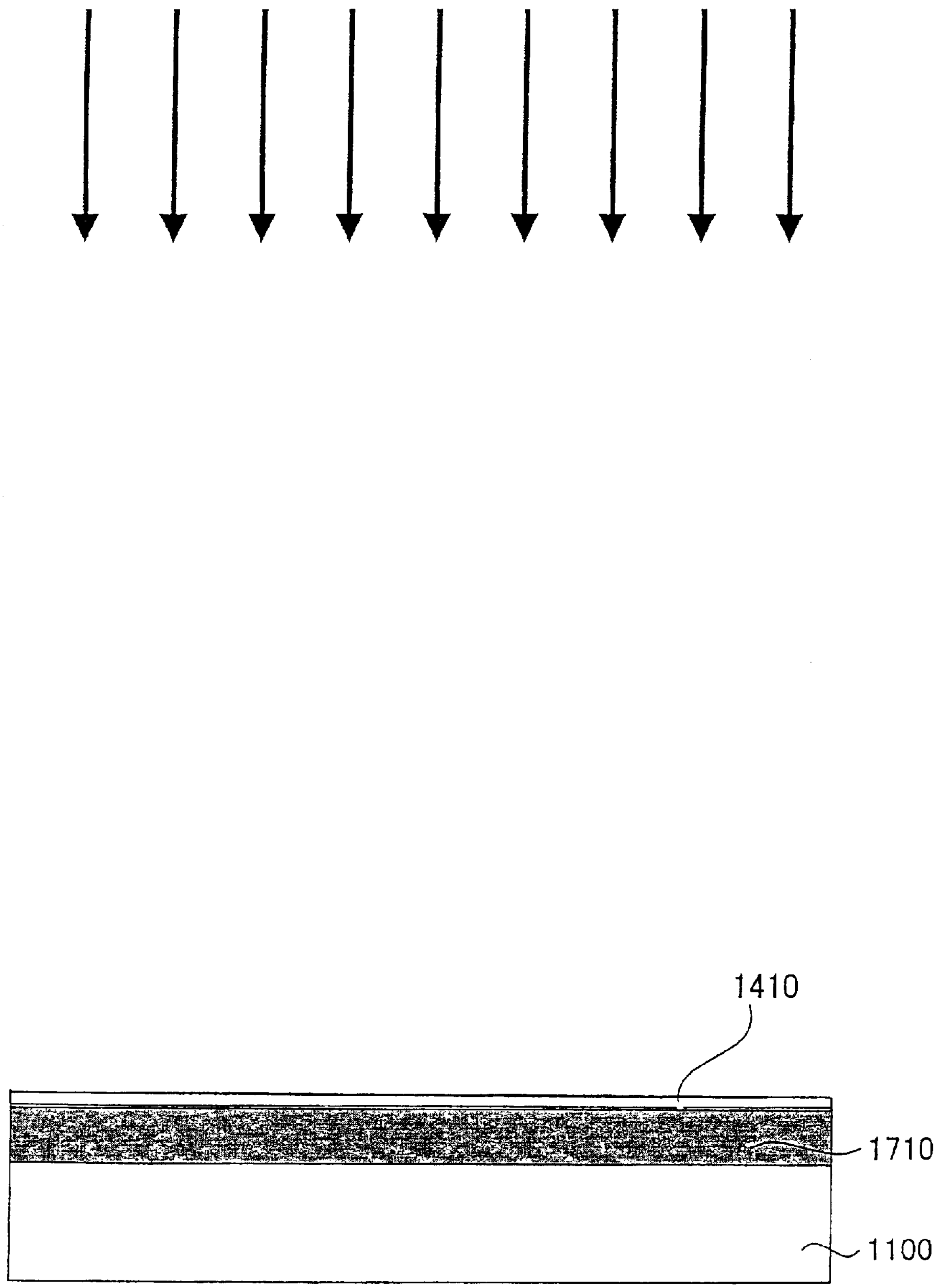

Fig. 1197
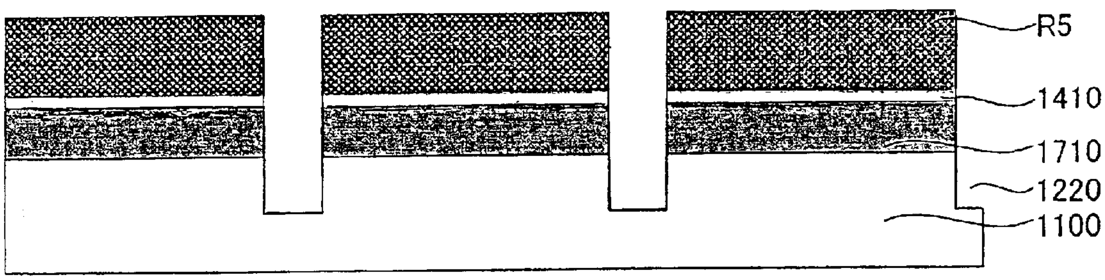
Fig. 1198
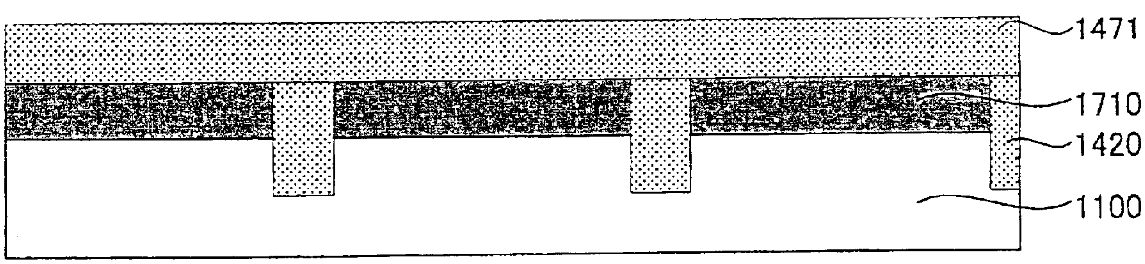

Fig. 1199
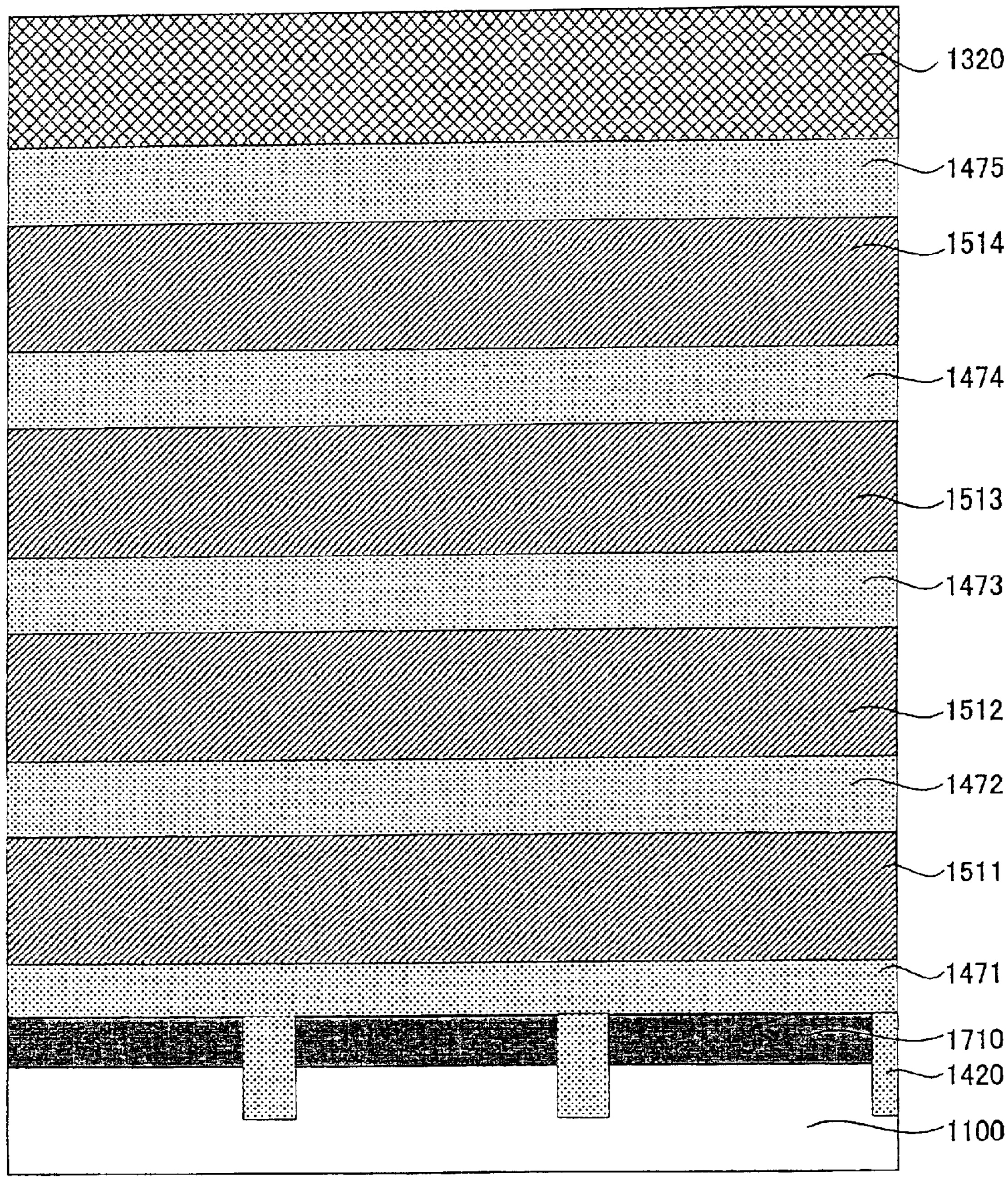

Fig. 1200
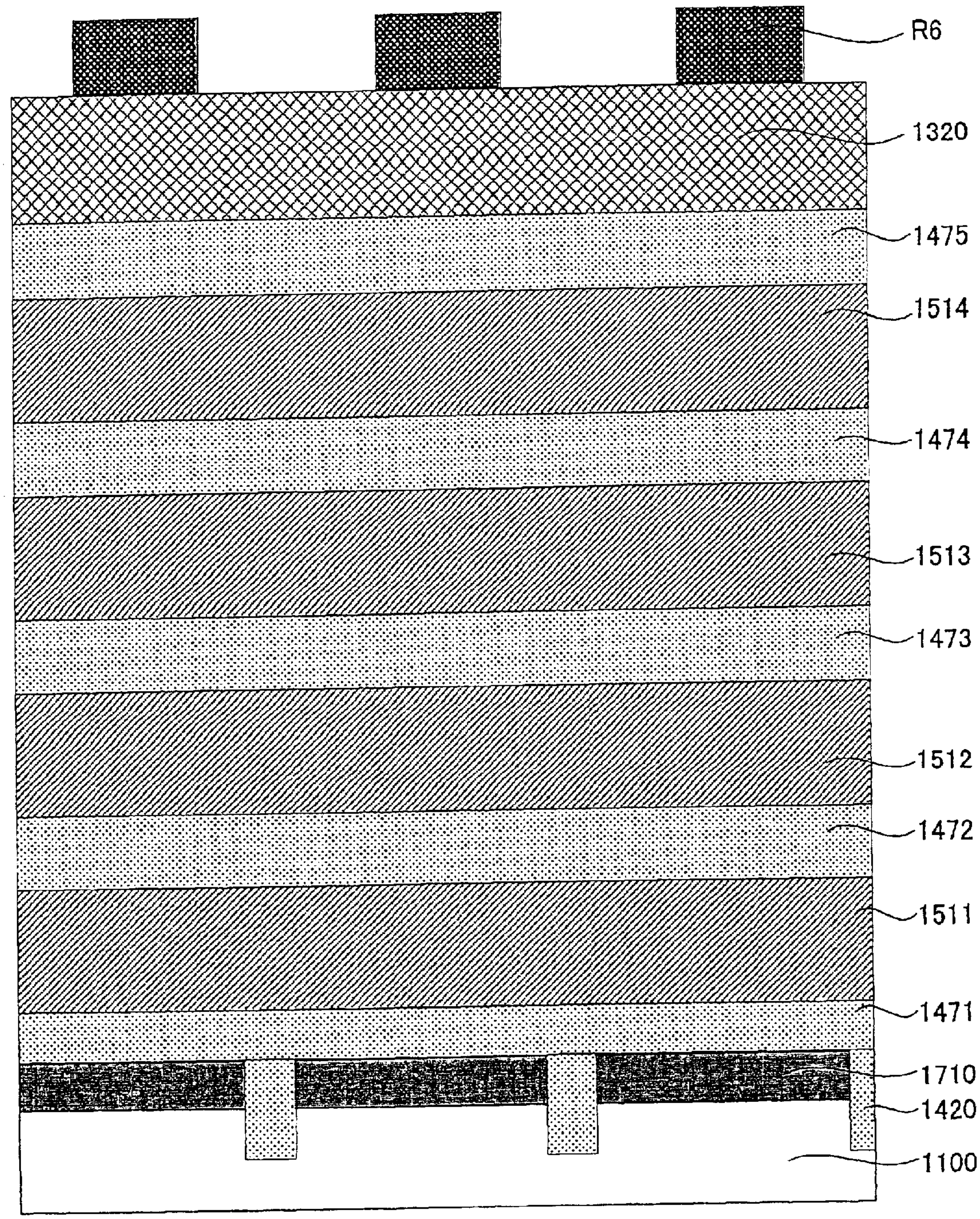

Fig. 1201
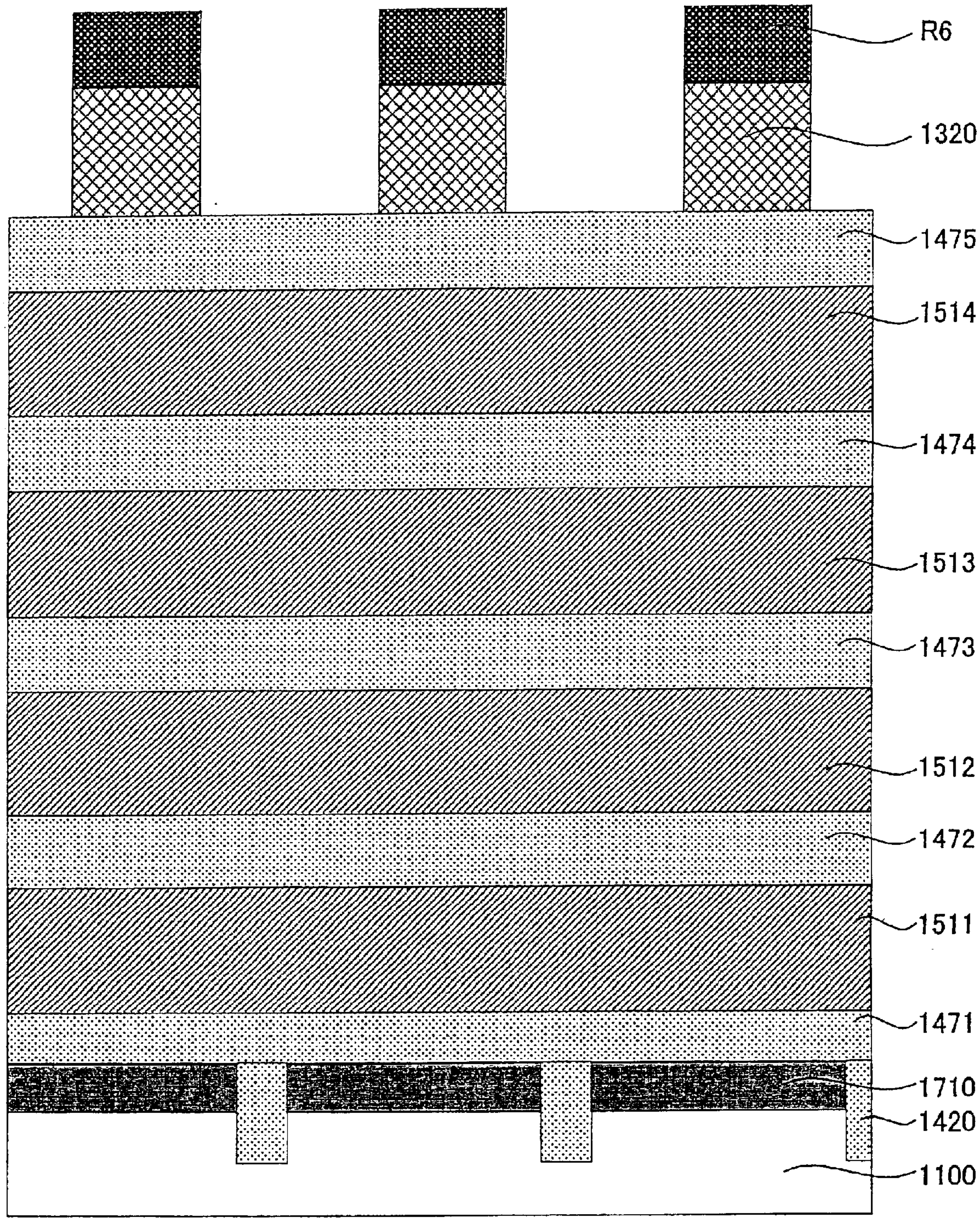

Fig. 1202
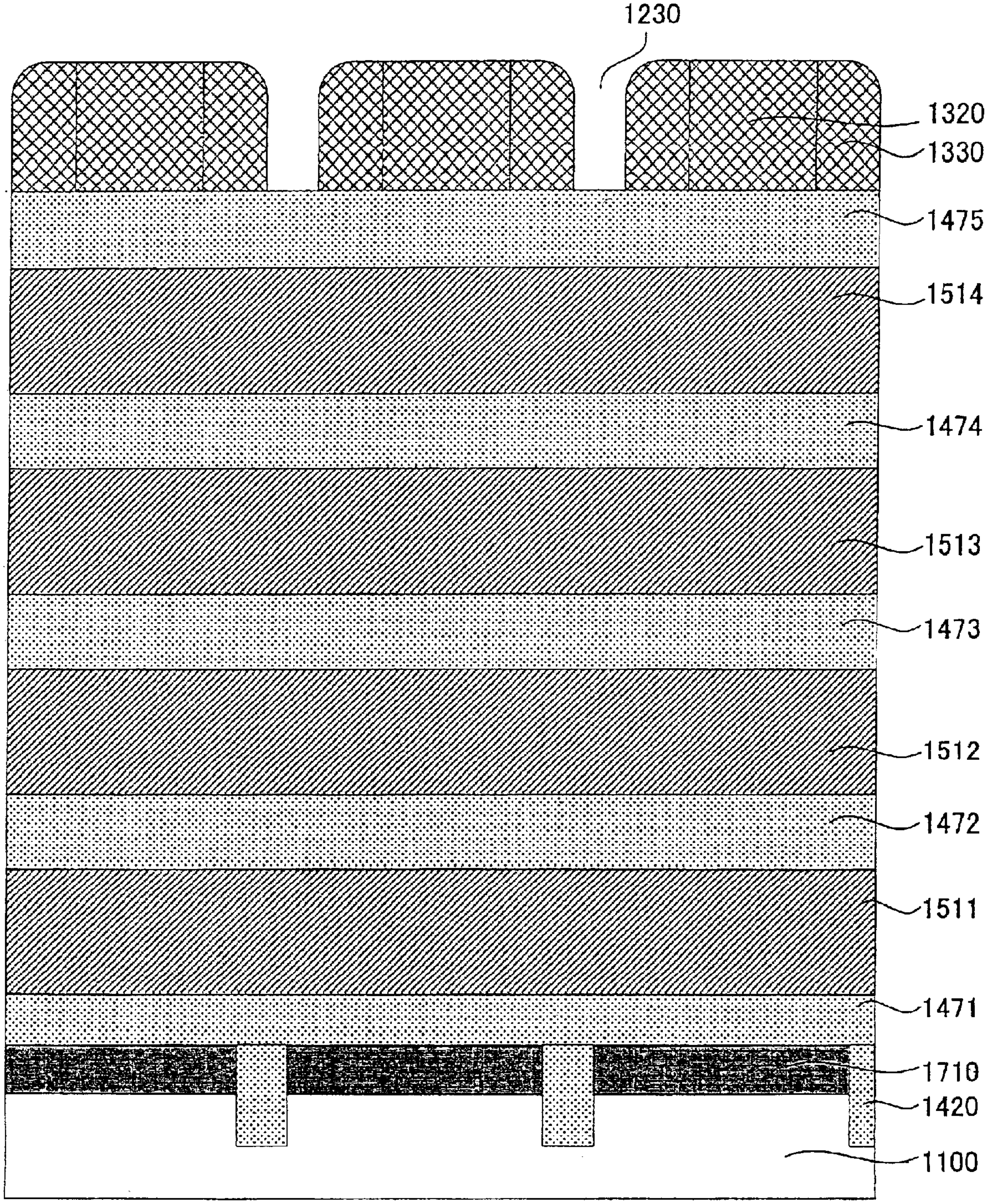

Fig. 1203
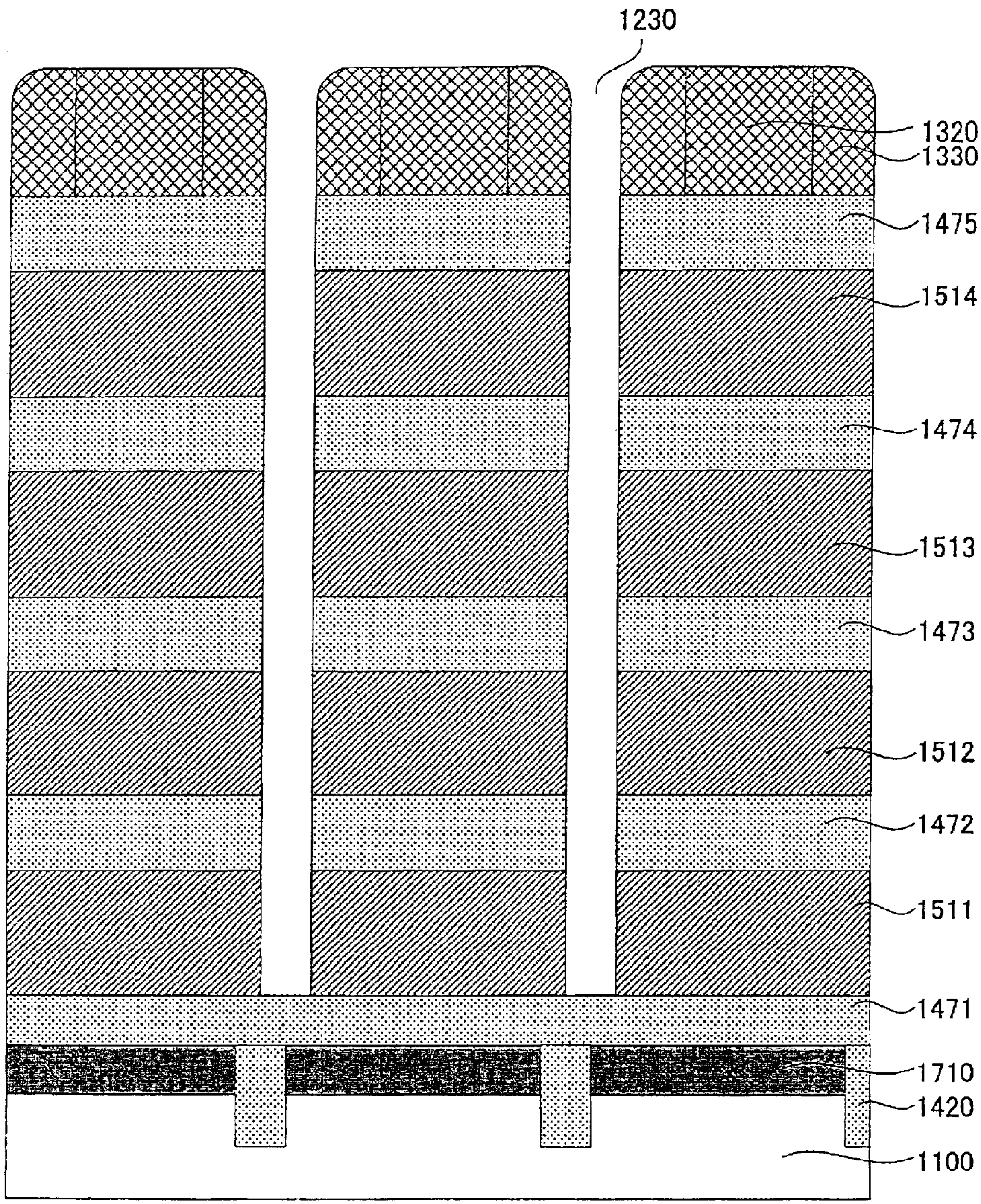

Fig. 1204
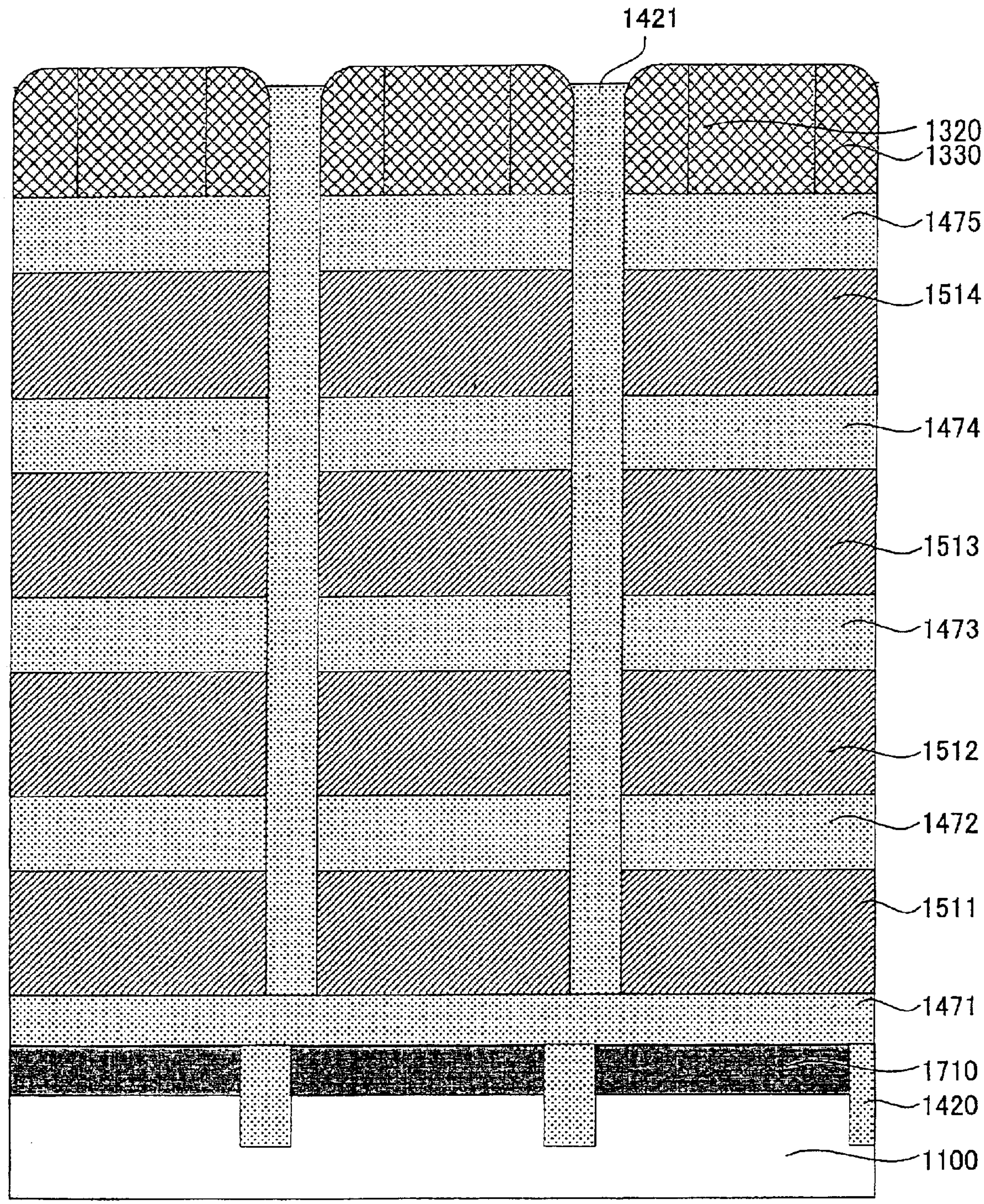

Fig. 1205
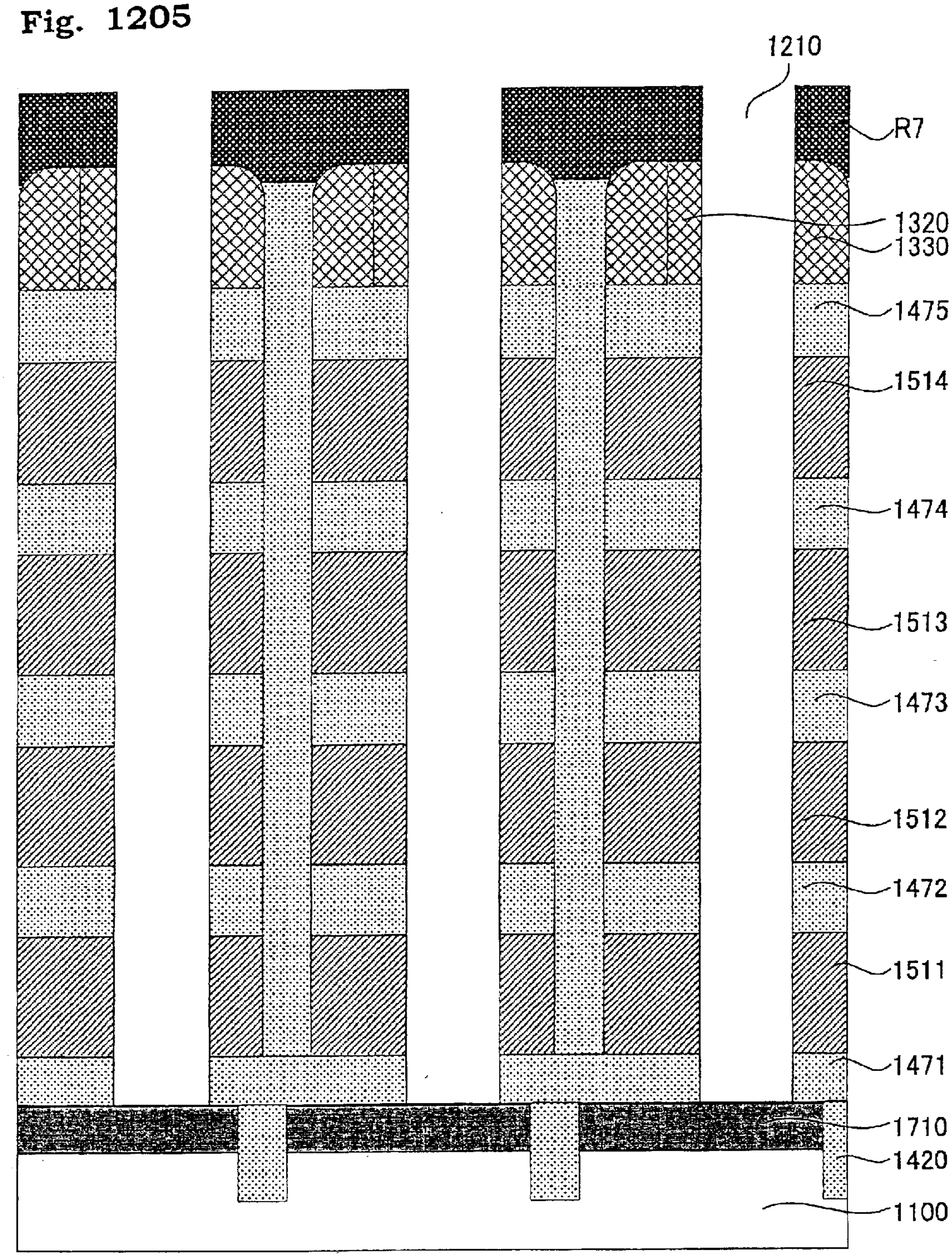

Fig. 1206
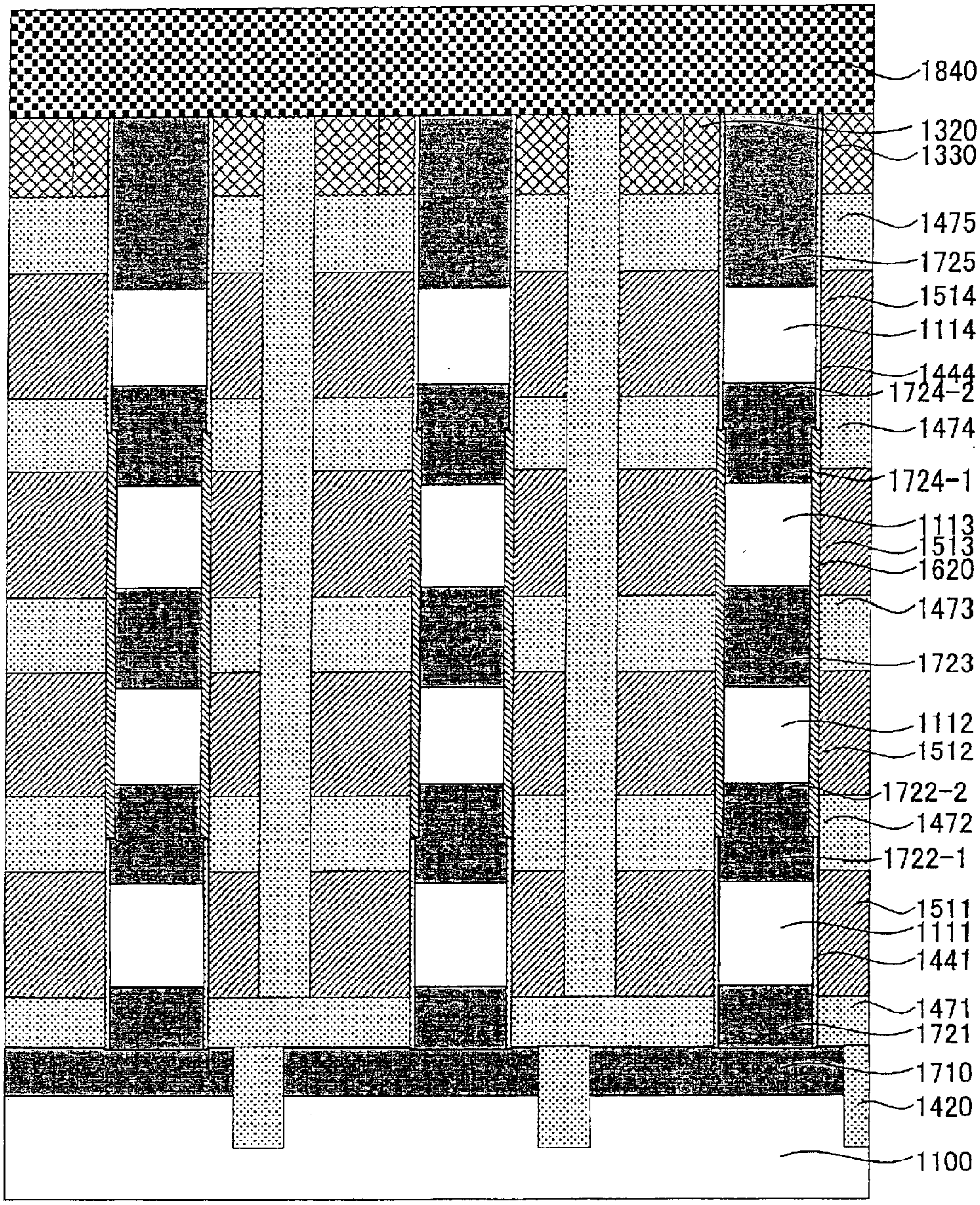

Fig. 1207
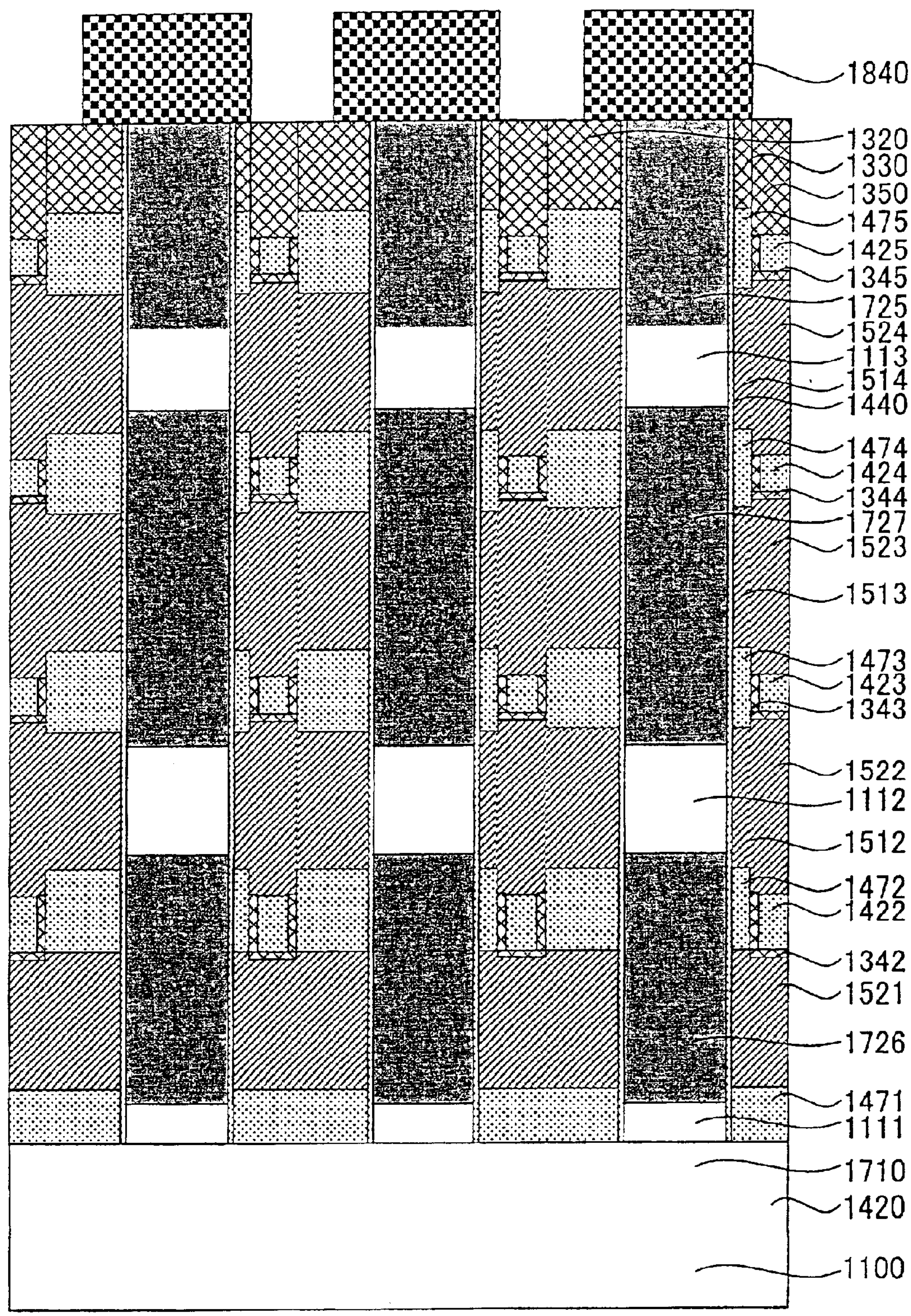

Fig. 1208
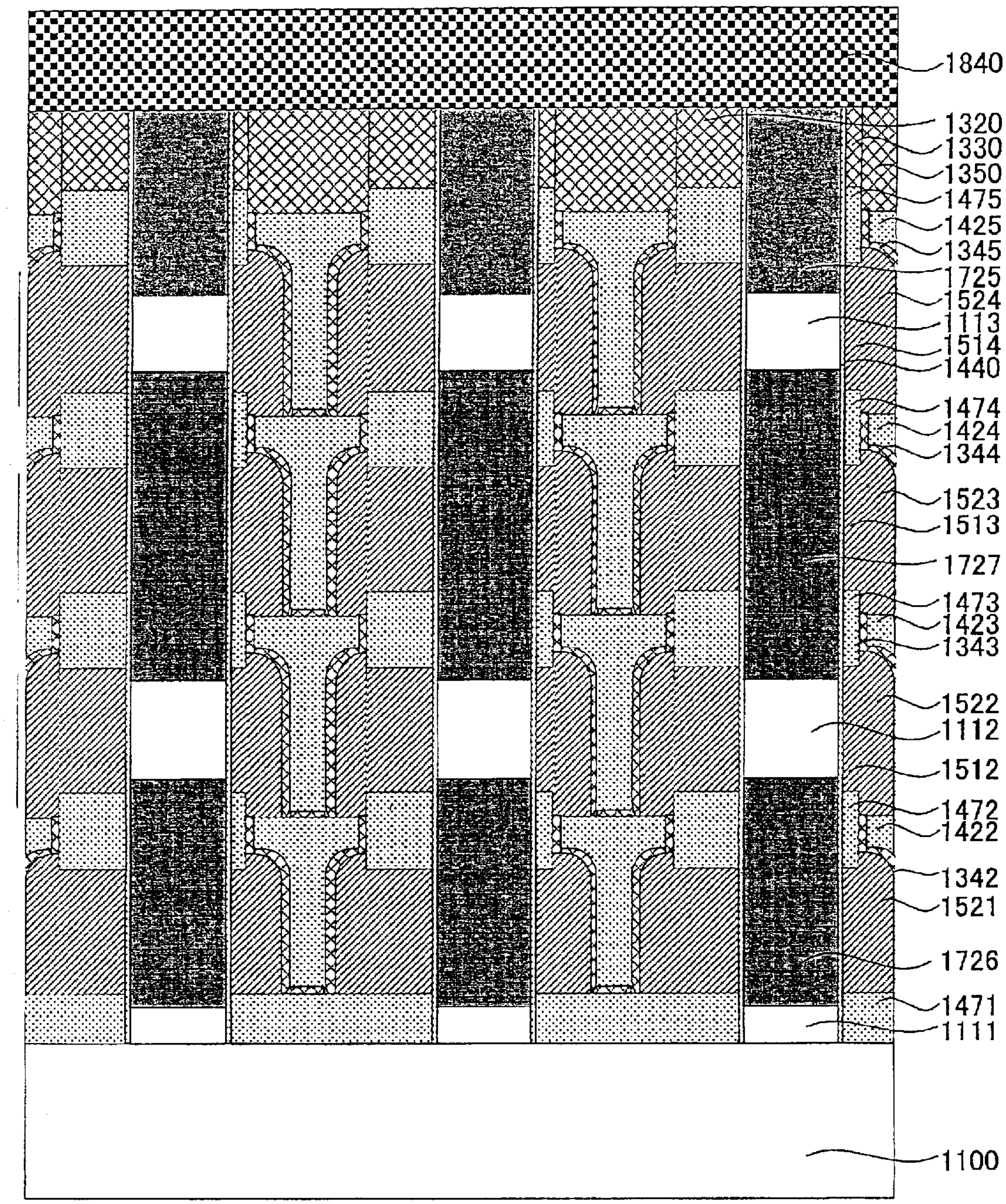

Fig. 1209
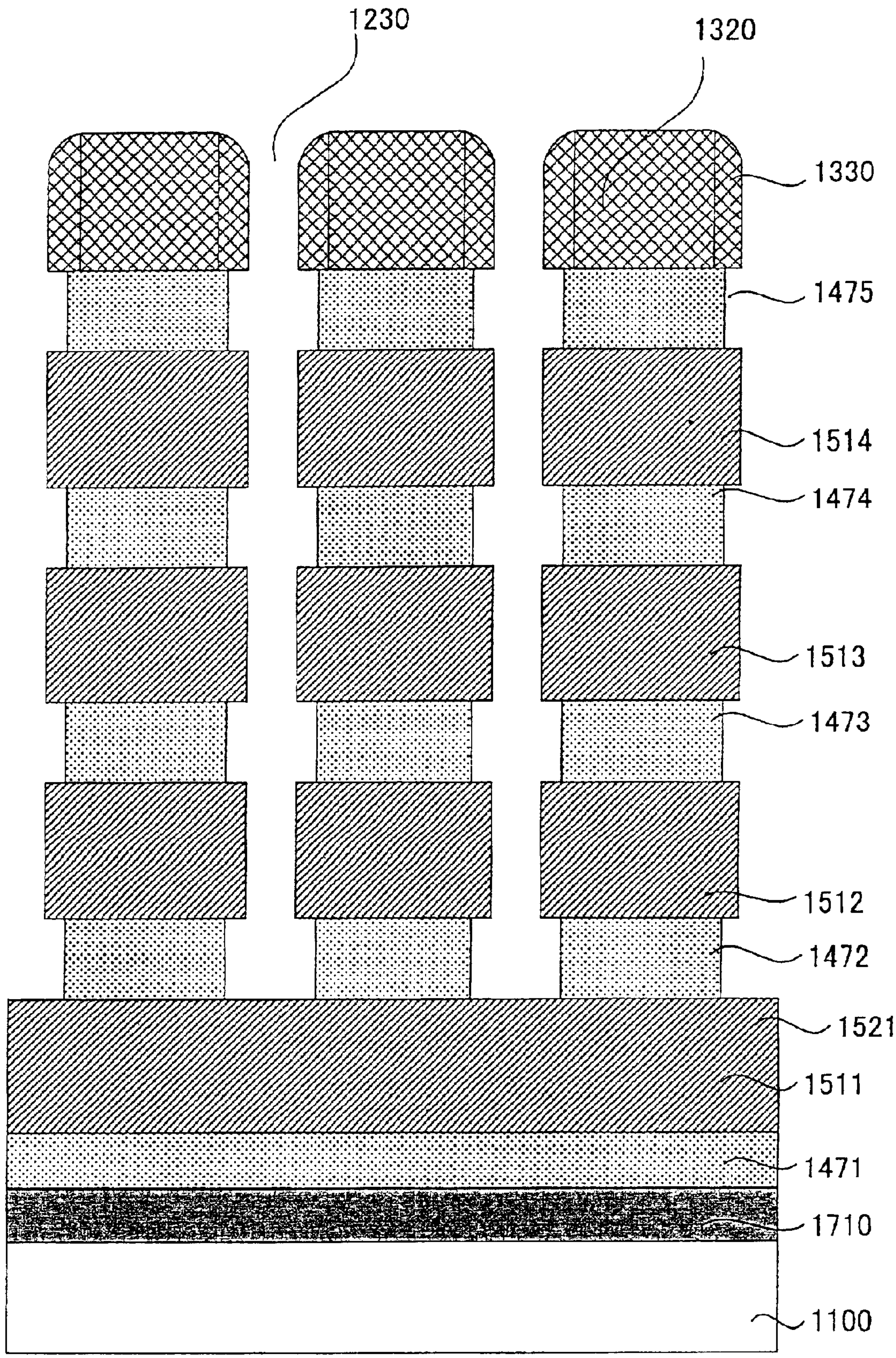

Fig. 1210
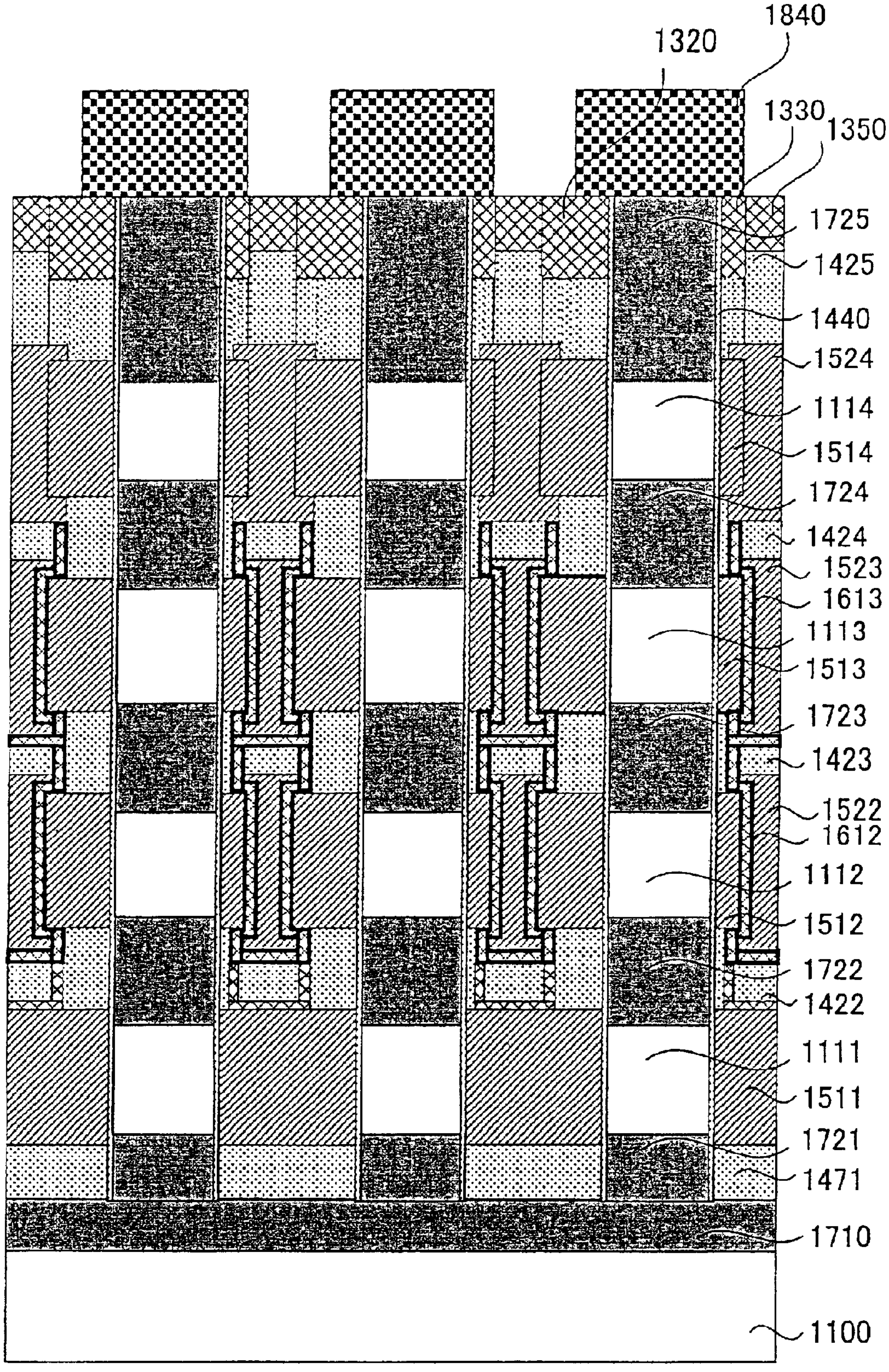

Fig. 1211
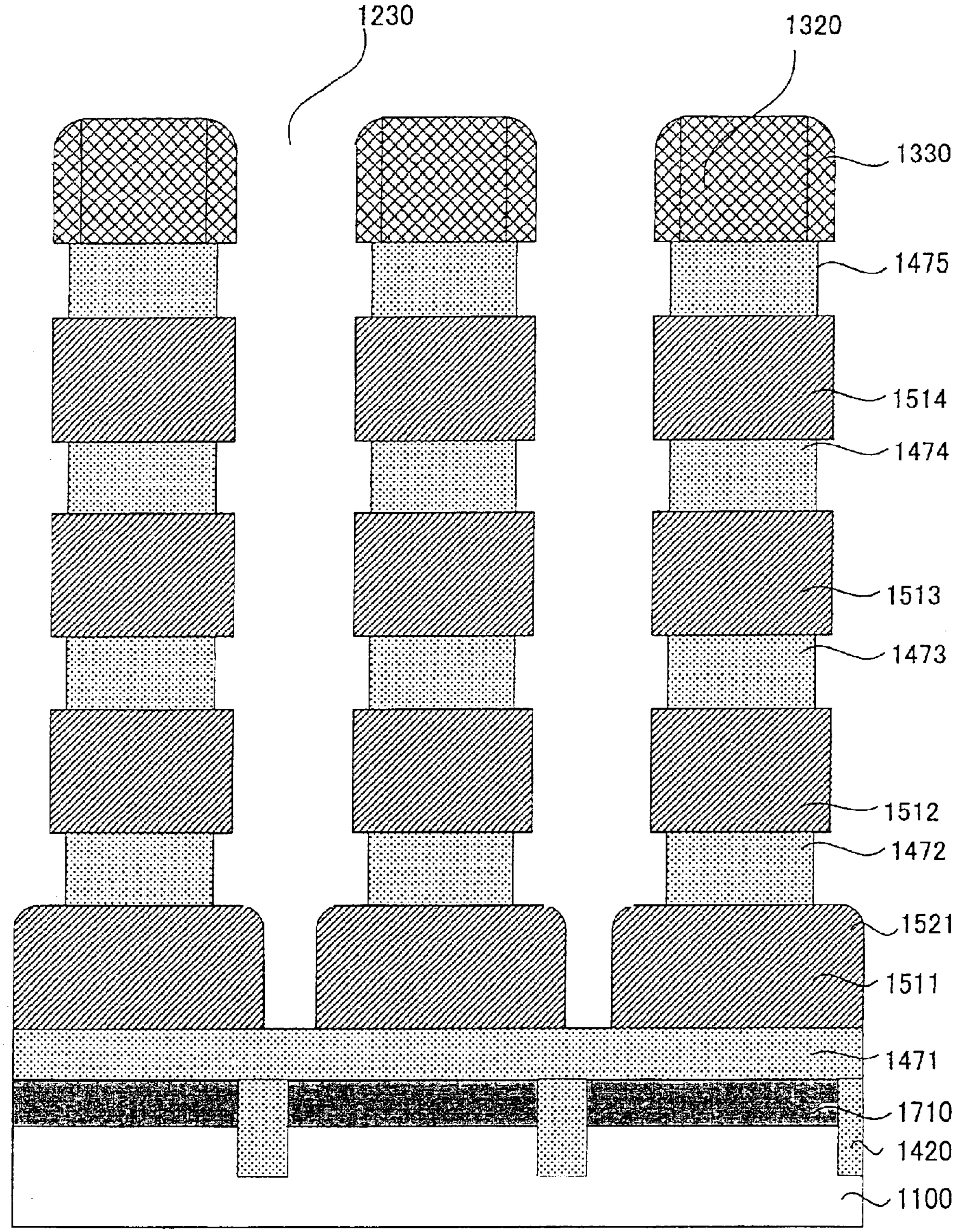

Fig. 1212
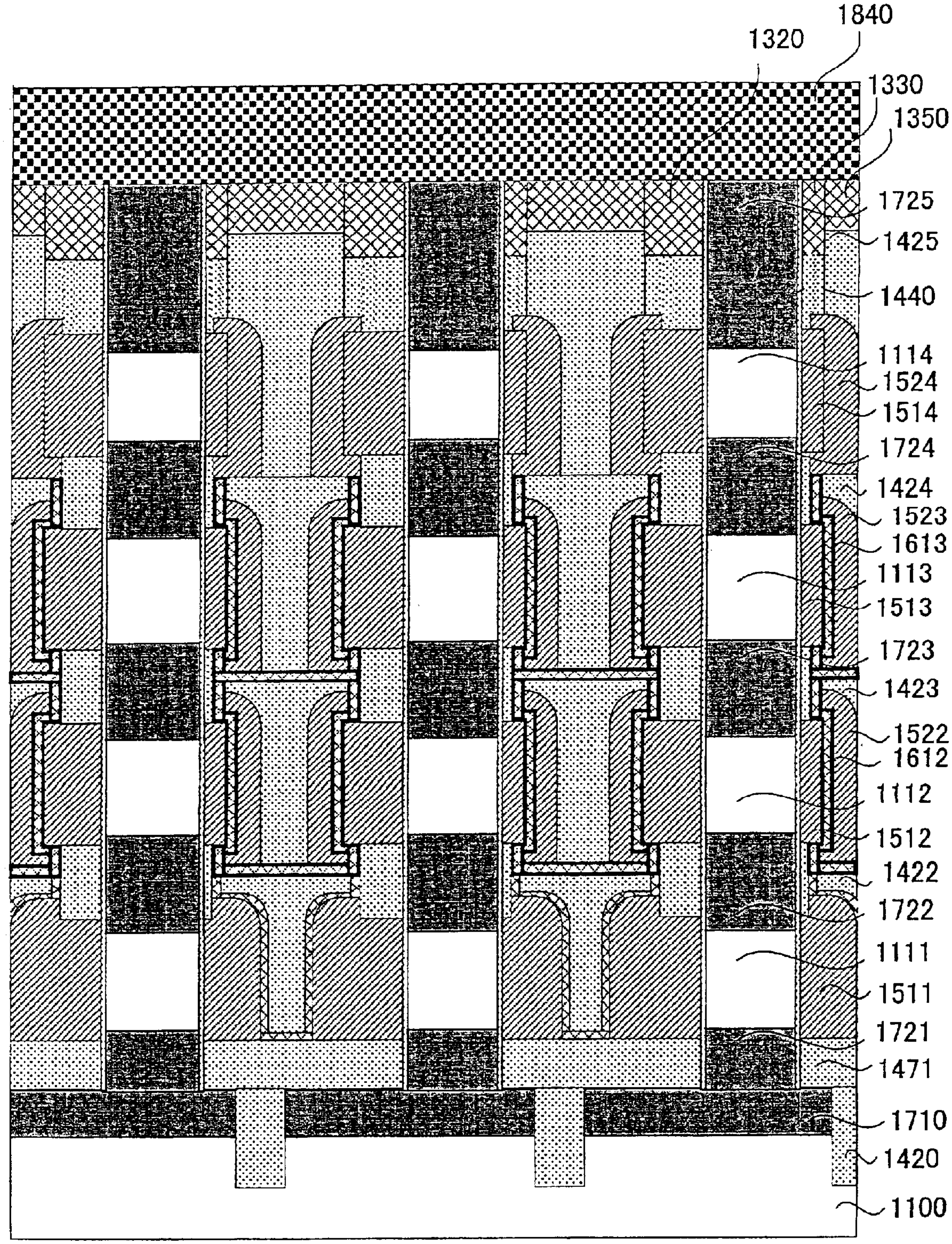

Fig. 1213
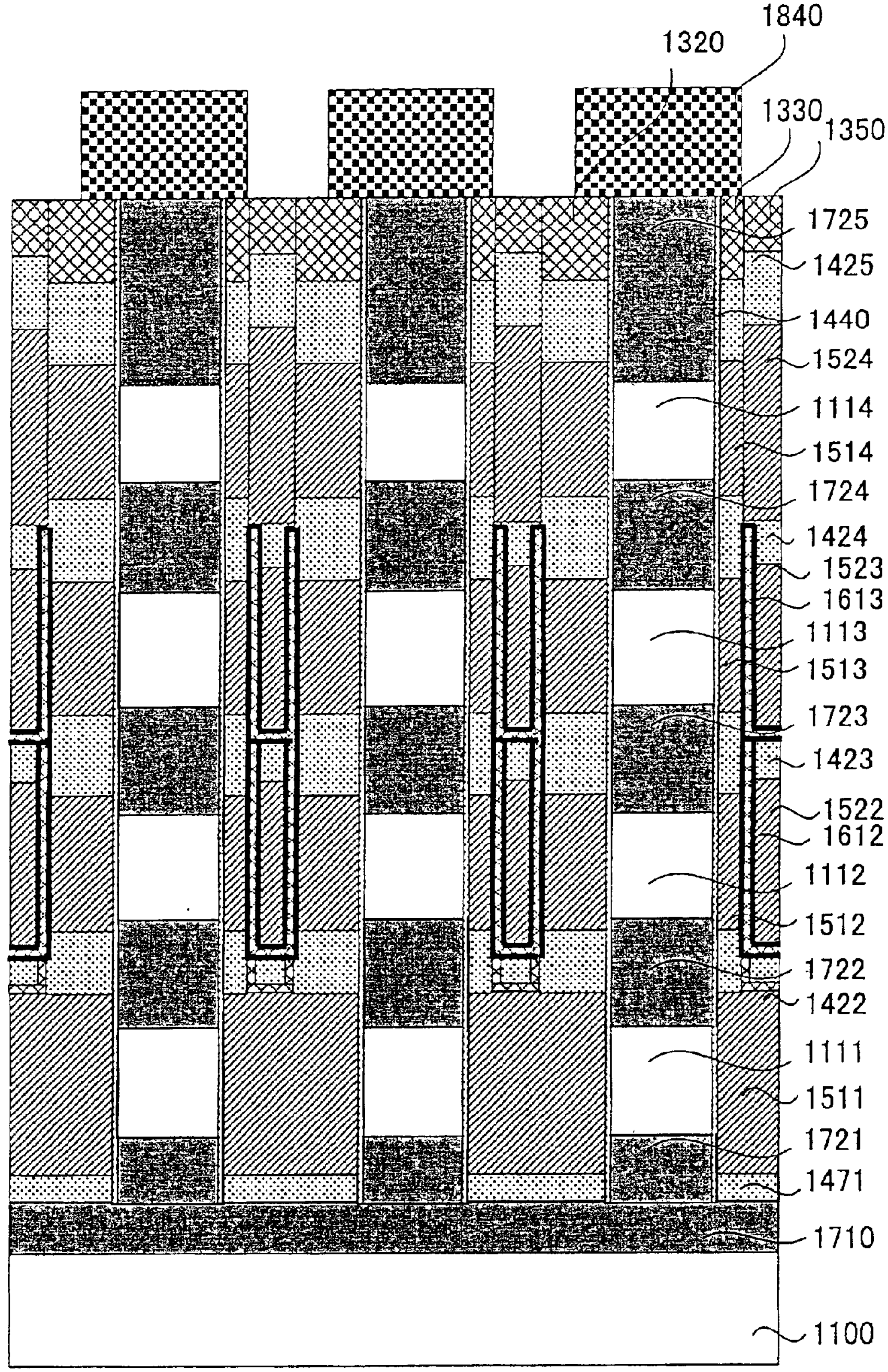

Fig. 1214
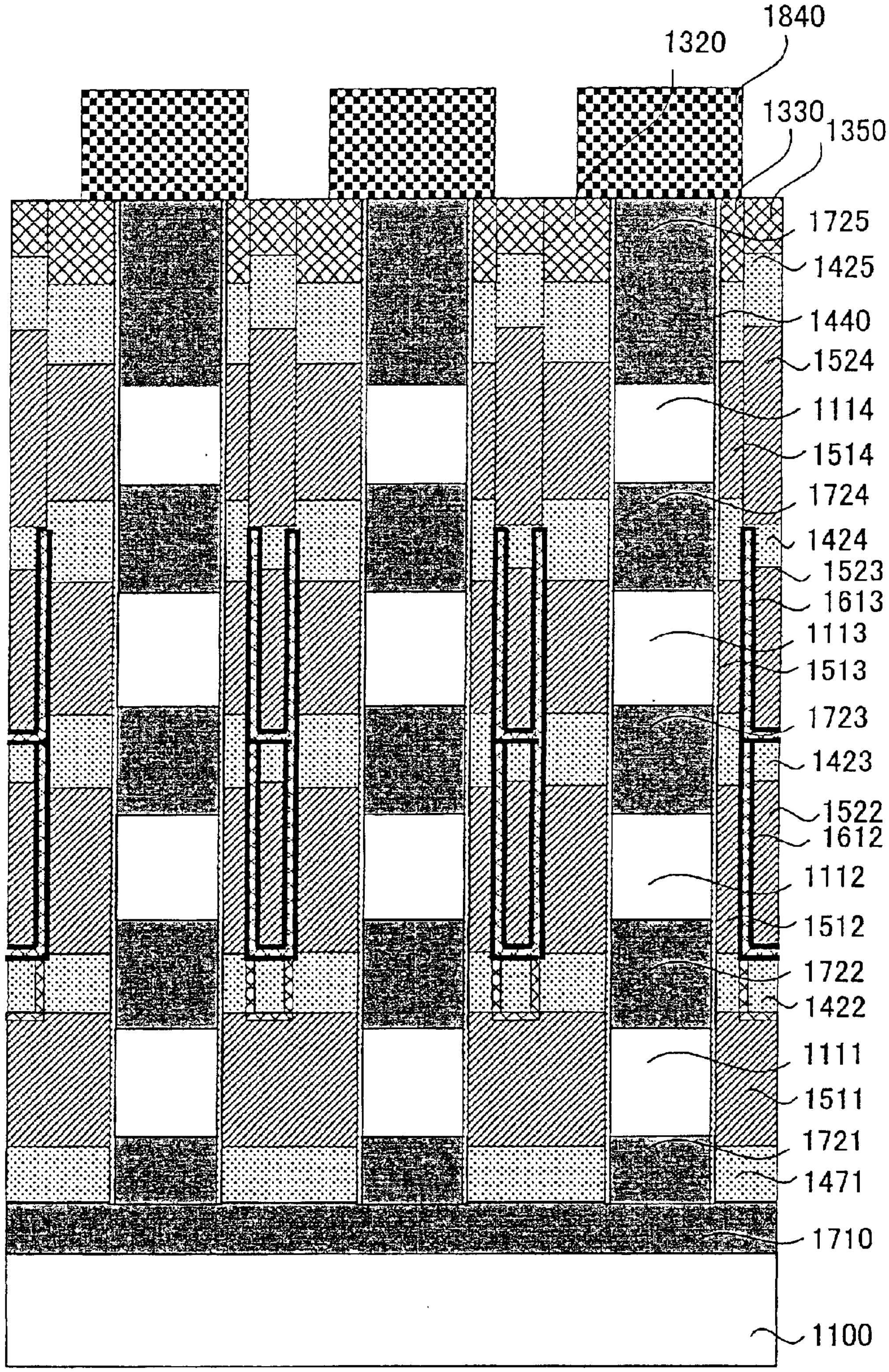

Fig. 1215
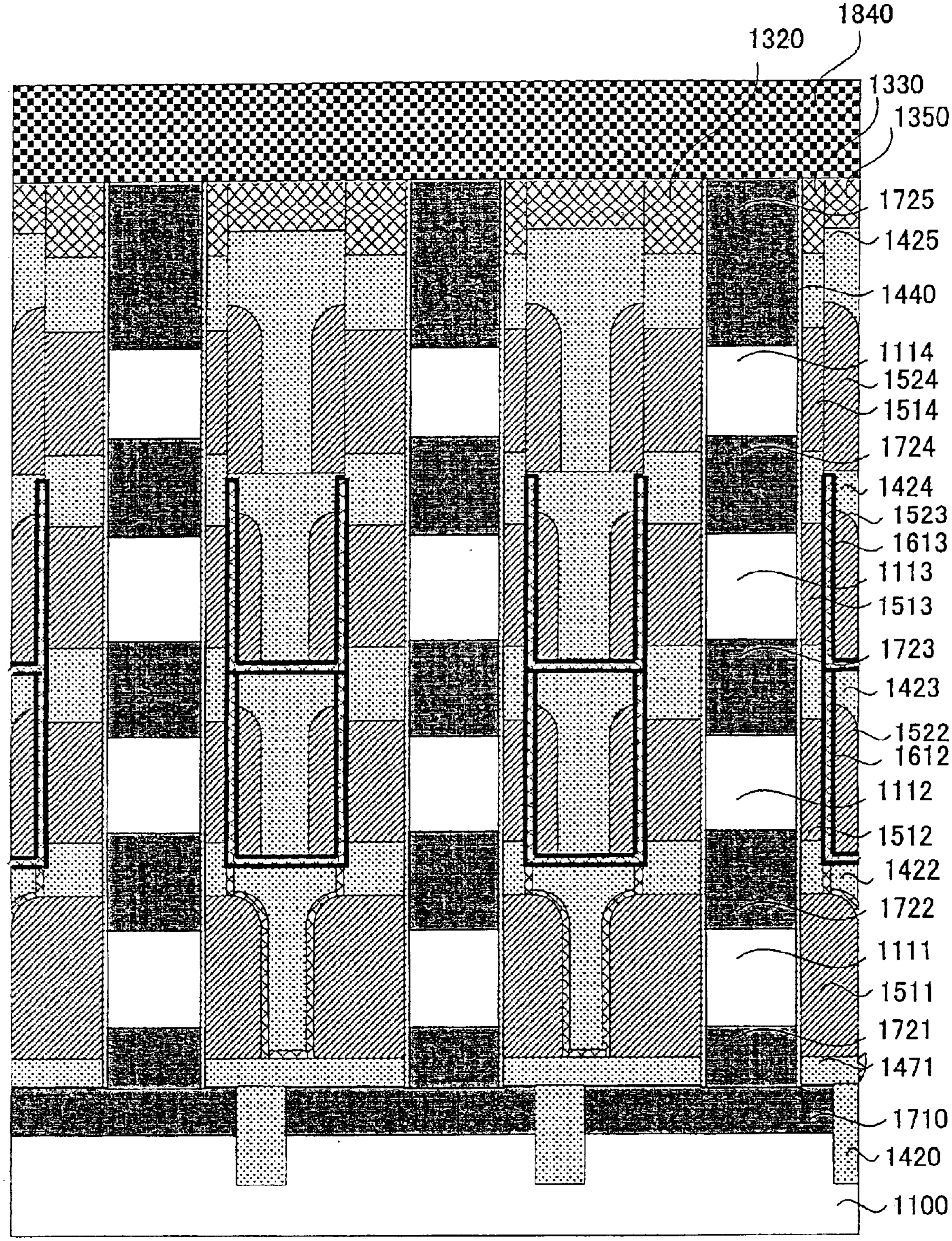

Fig. 1216
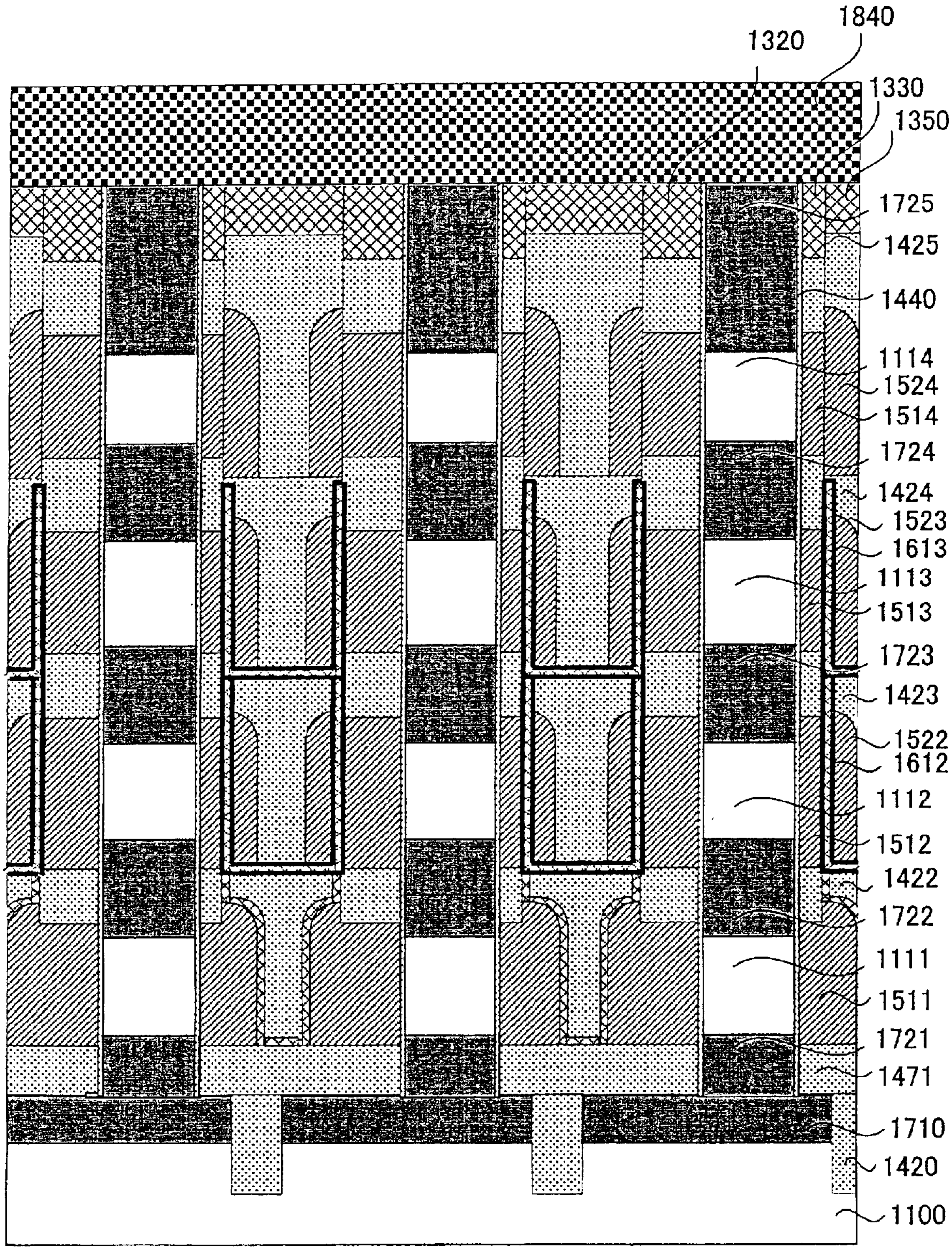

Fig. 1217
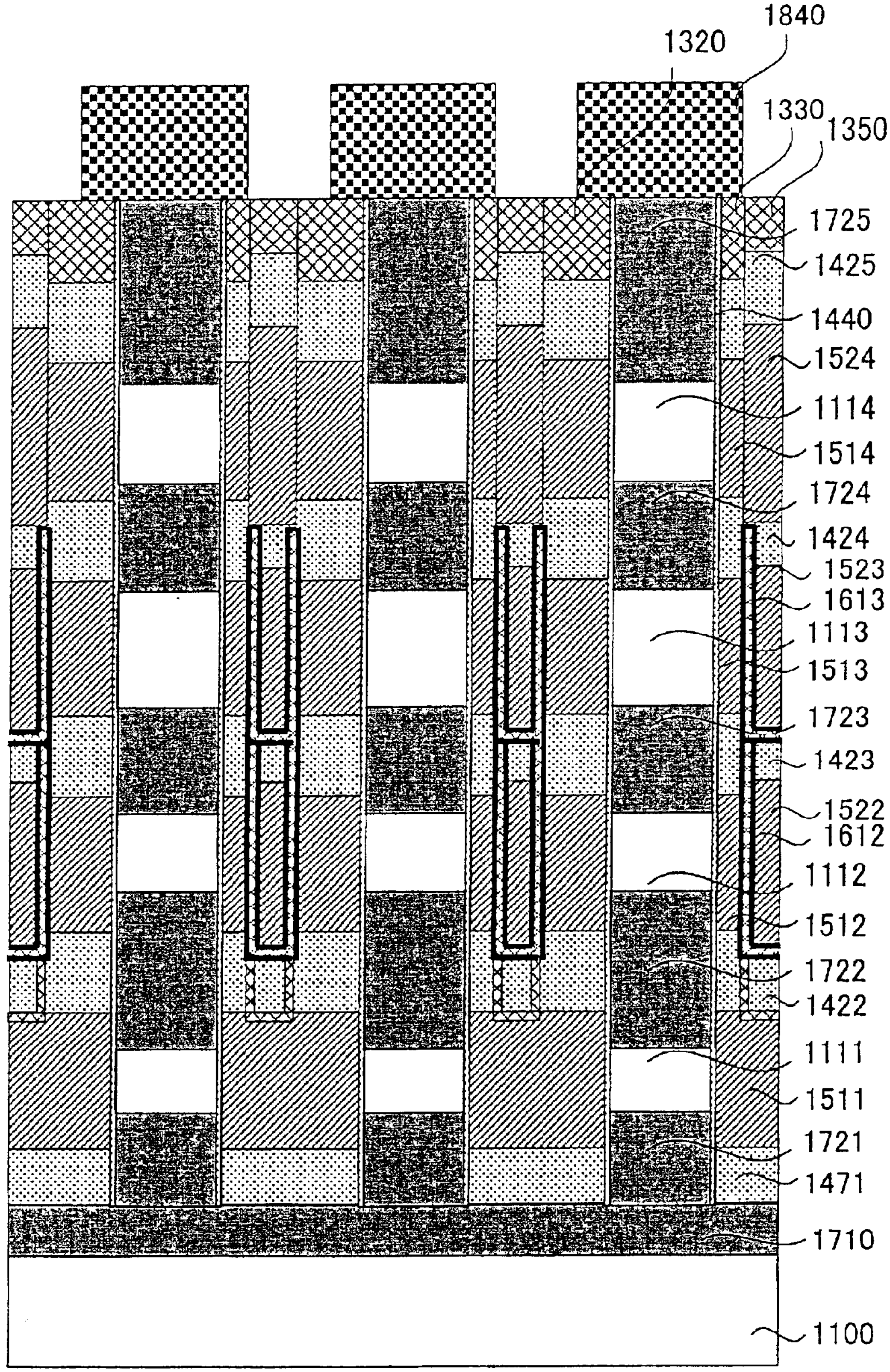

Fig. 1218
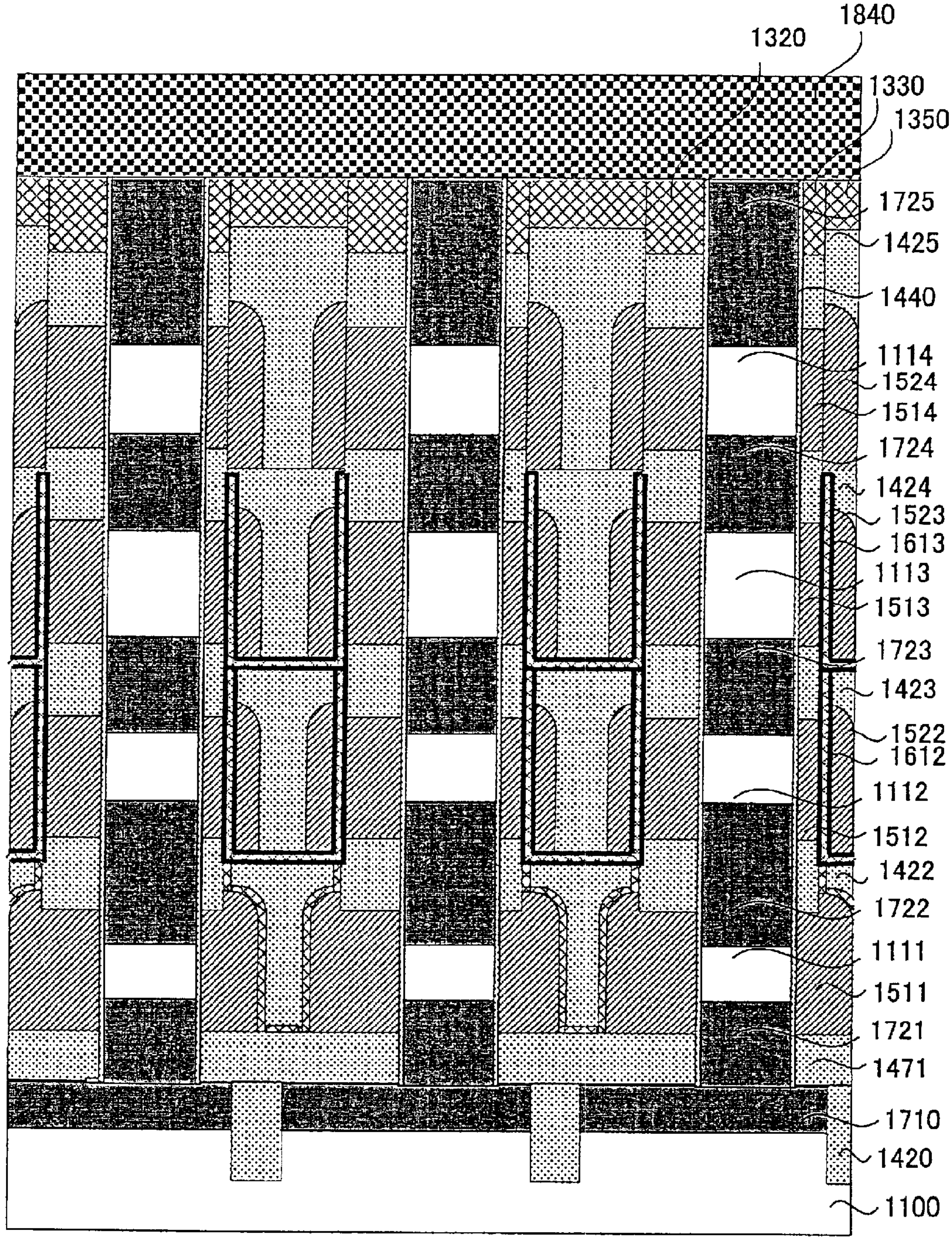

Fig. 1219
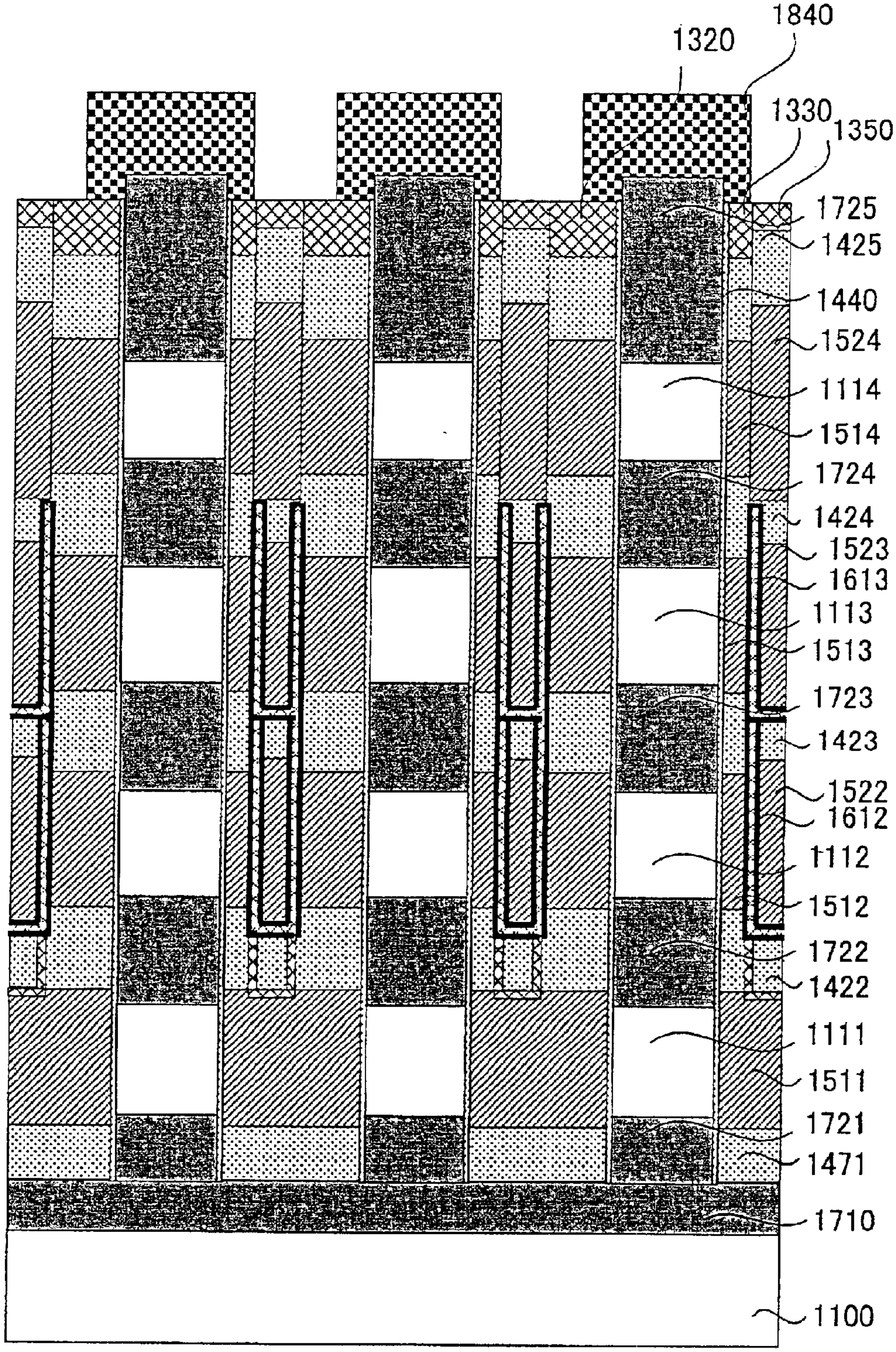

Fig. 1220
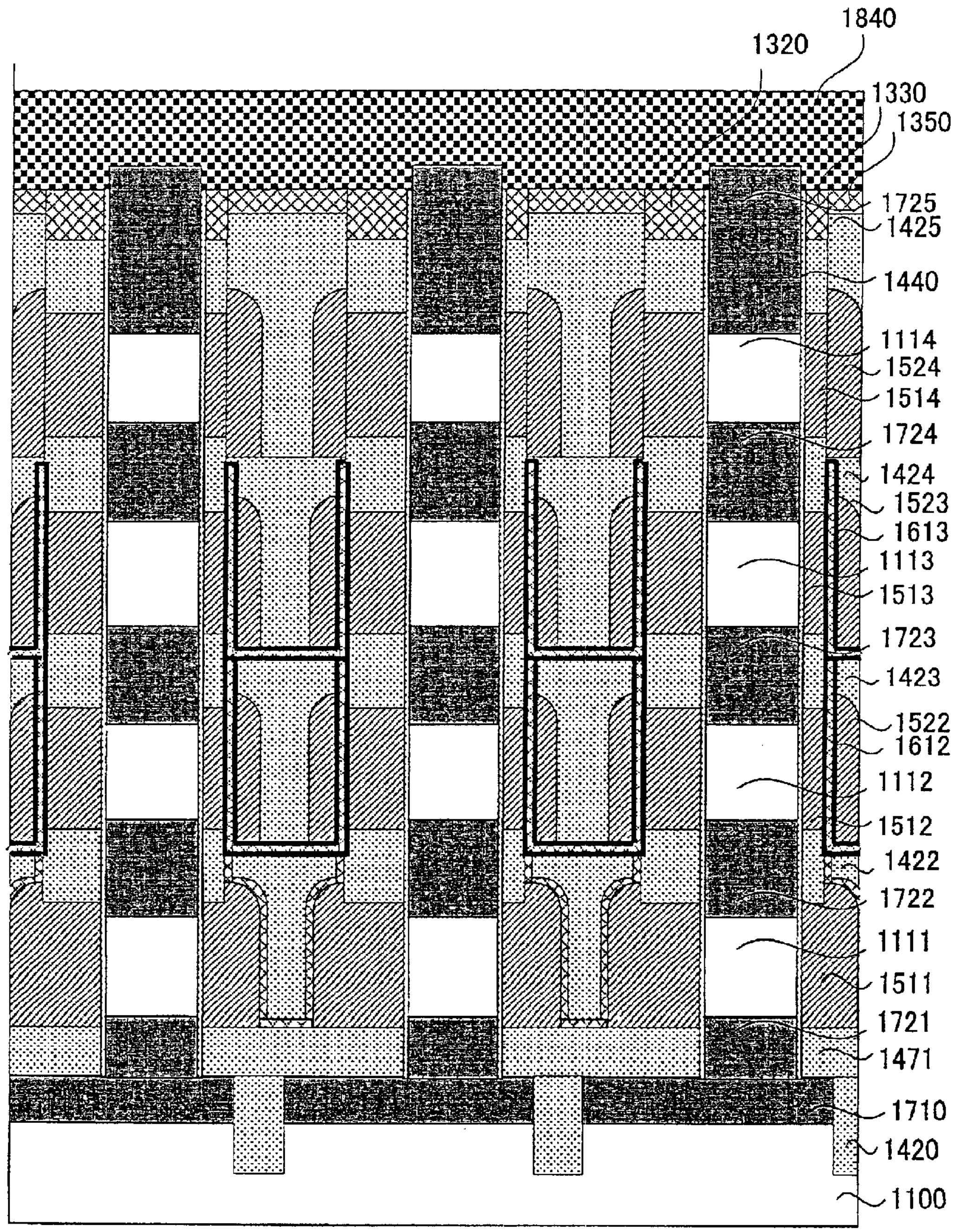

Fig. 1221
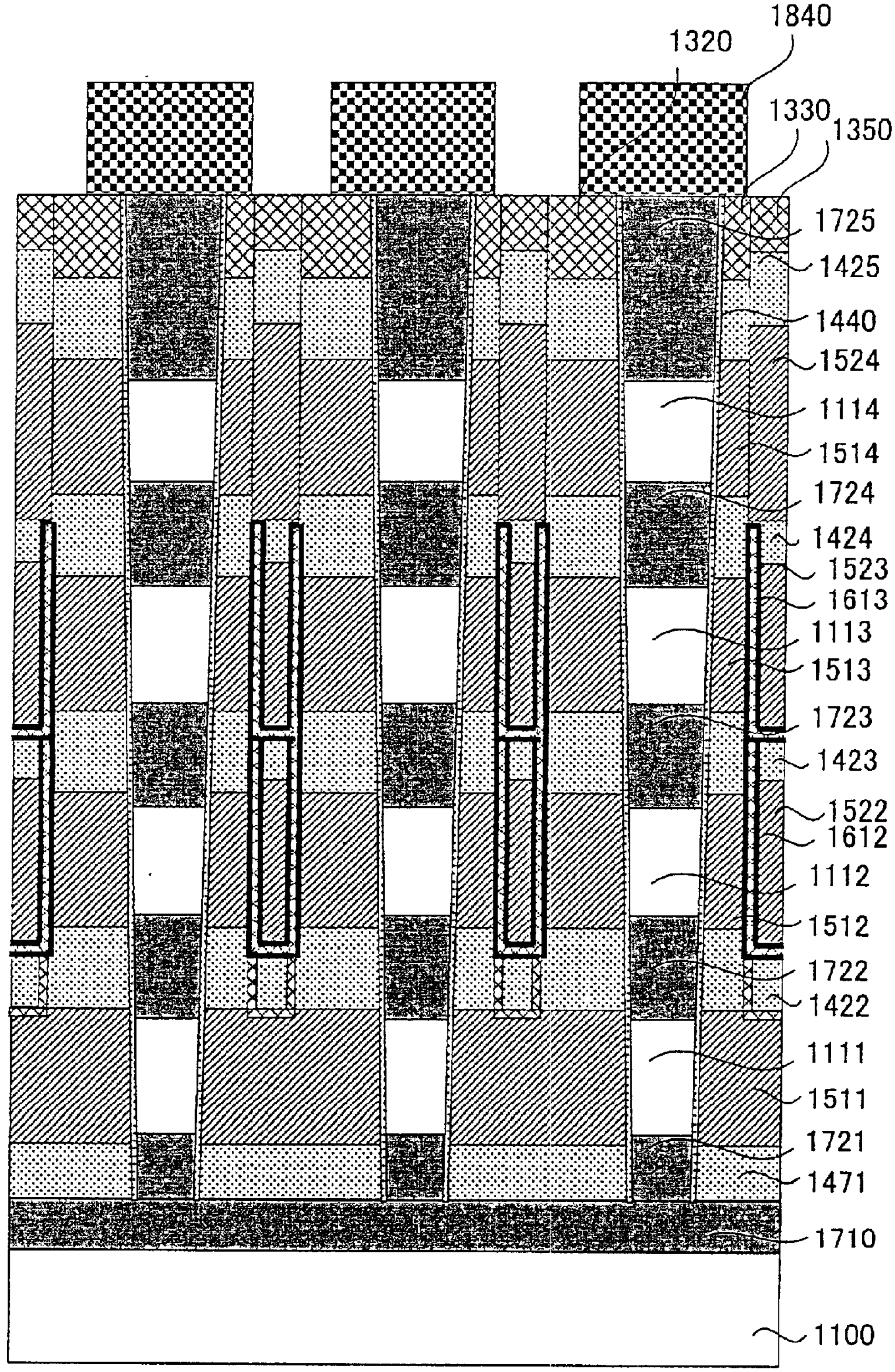

Fig. 1222
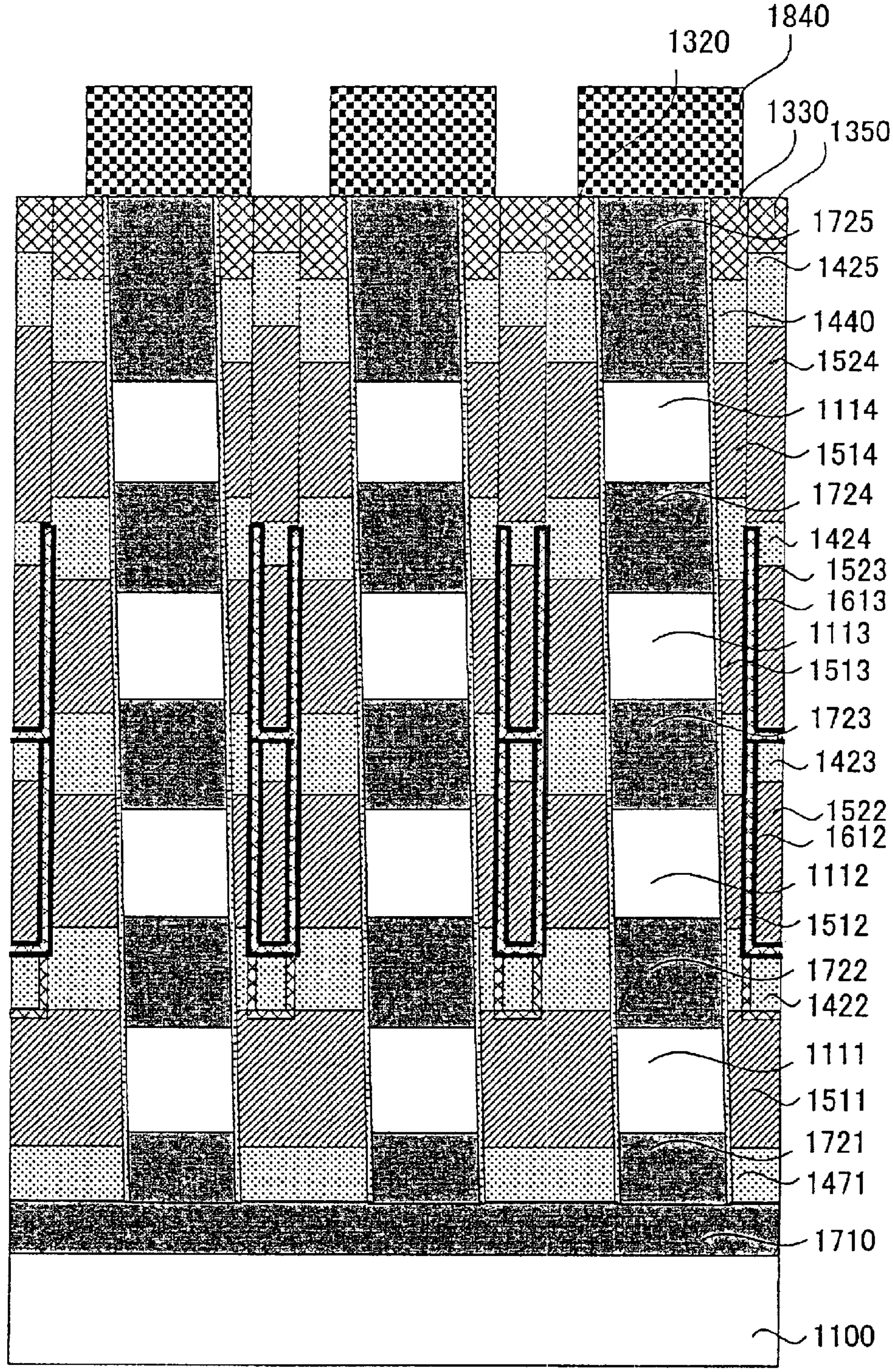

Fig. 1223
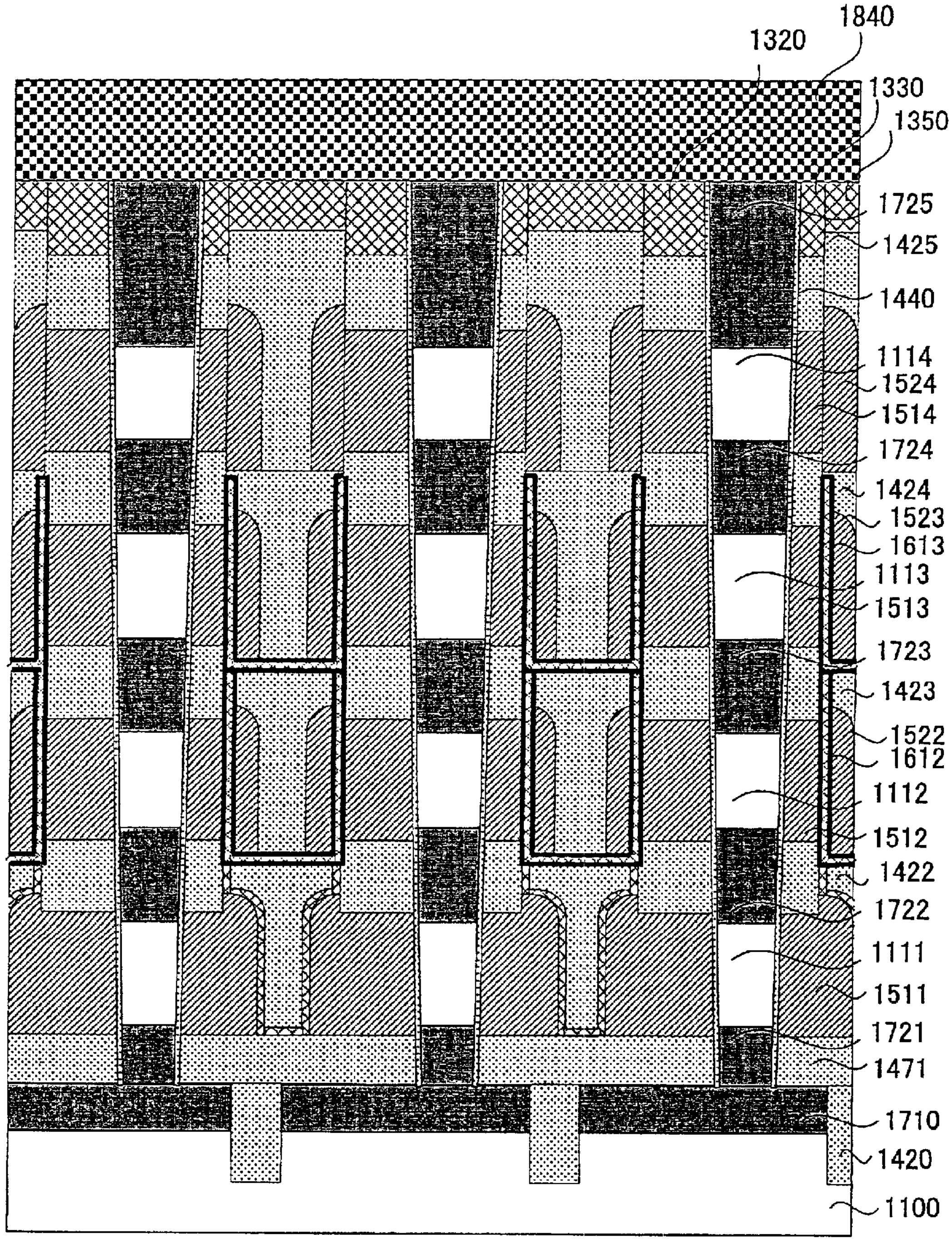

Fig. 1224
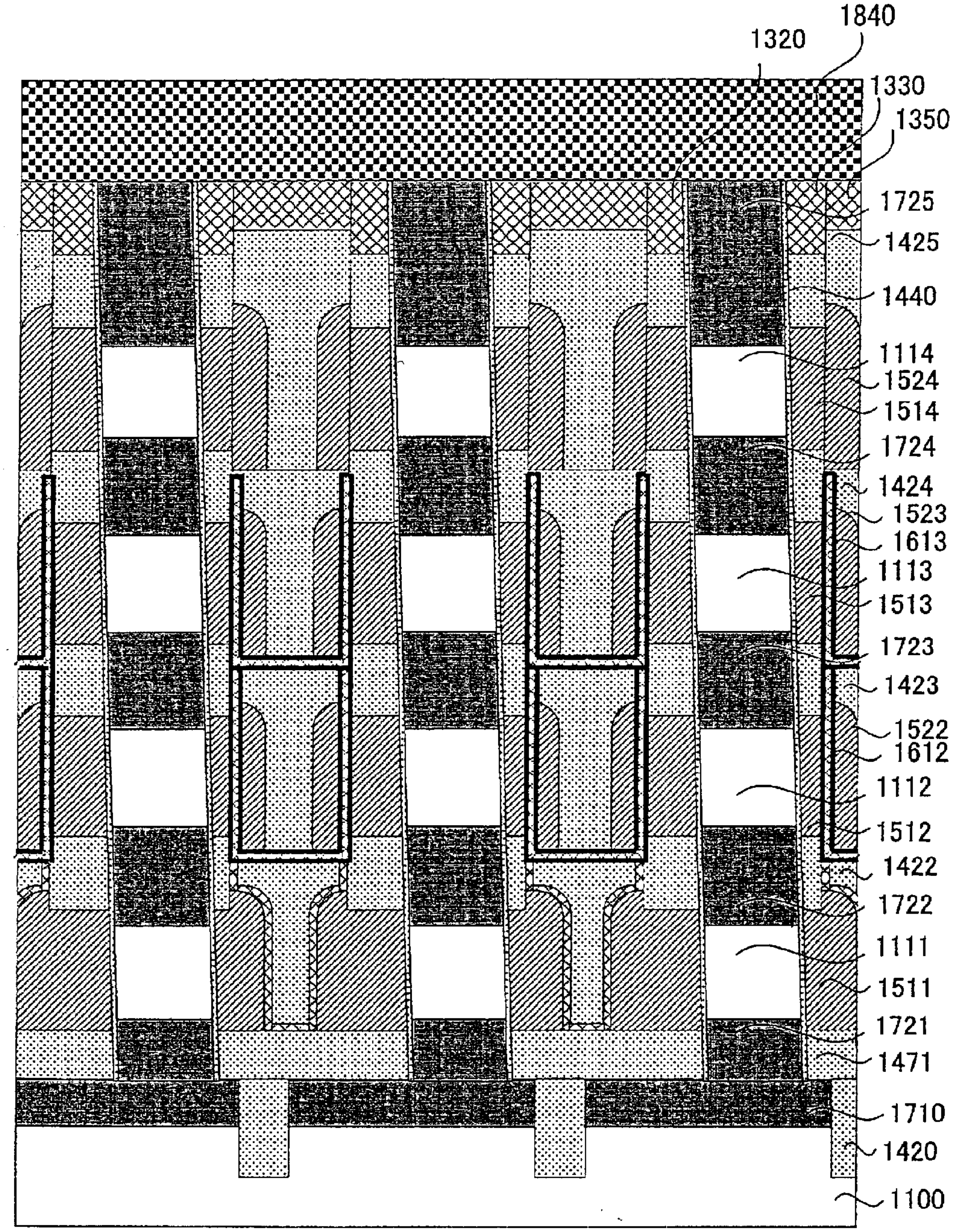

Fig. 1225
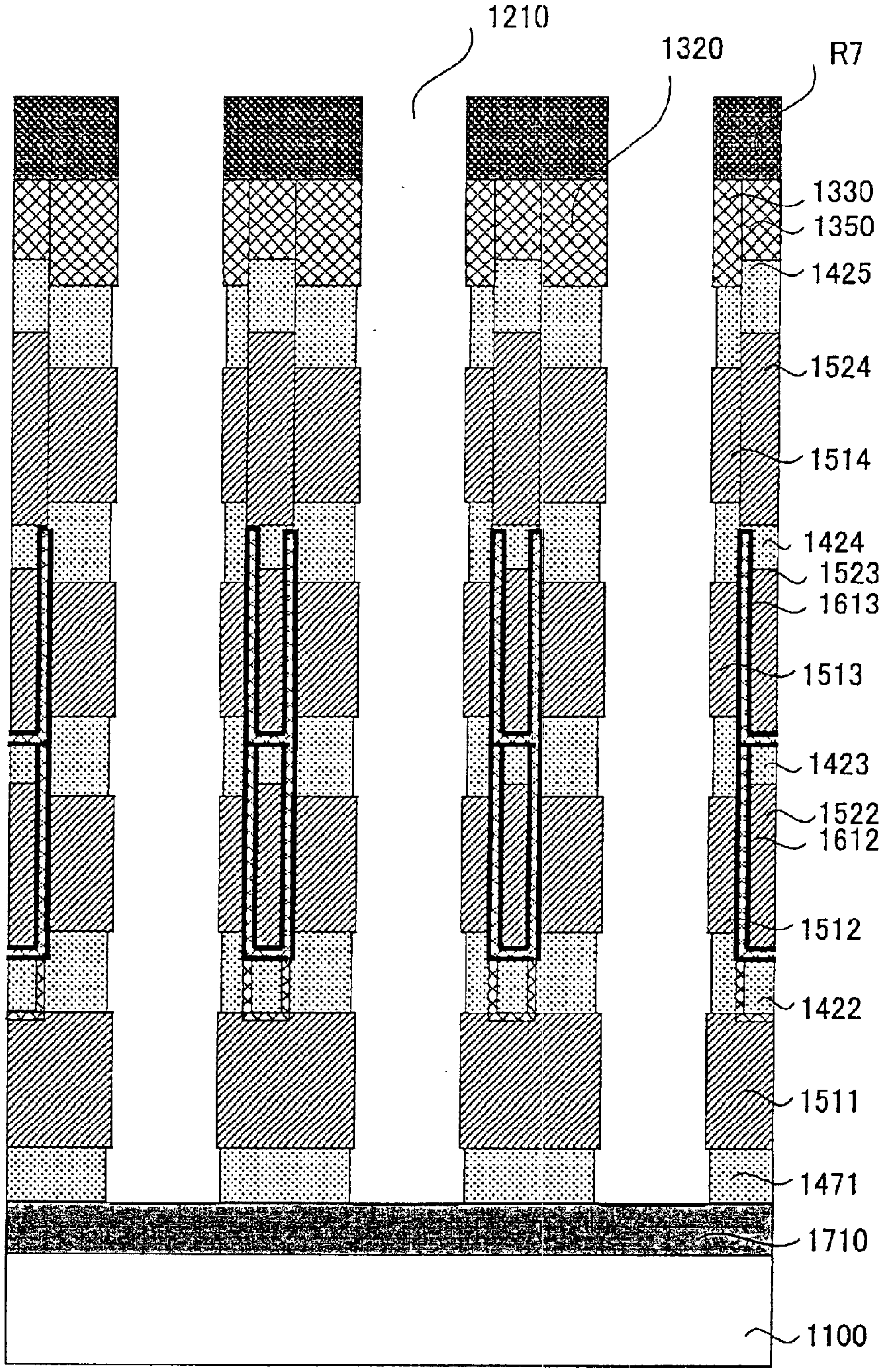

Fig. 1226
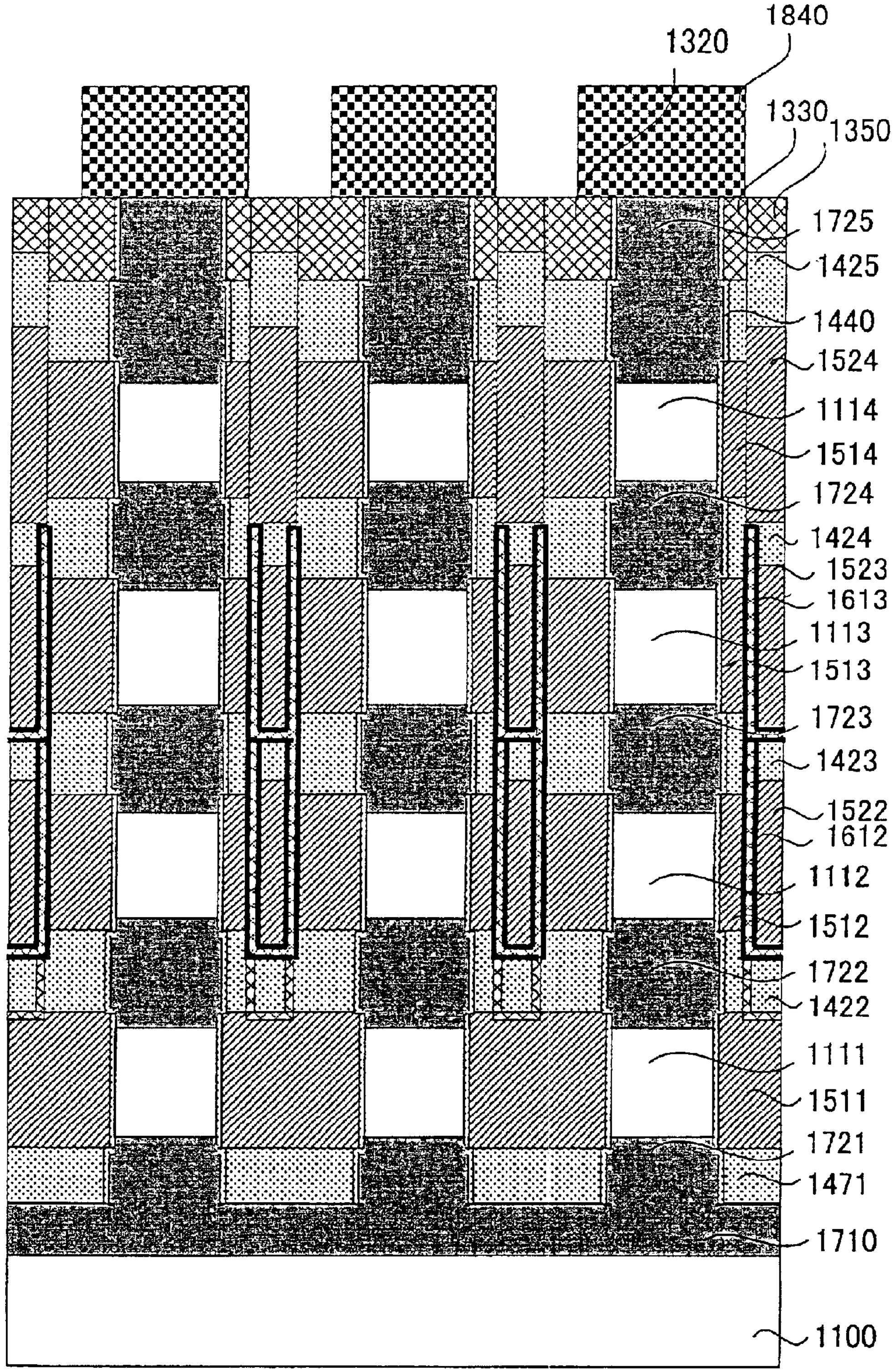

Fig. 1227
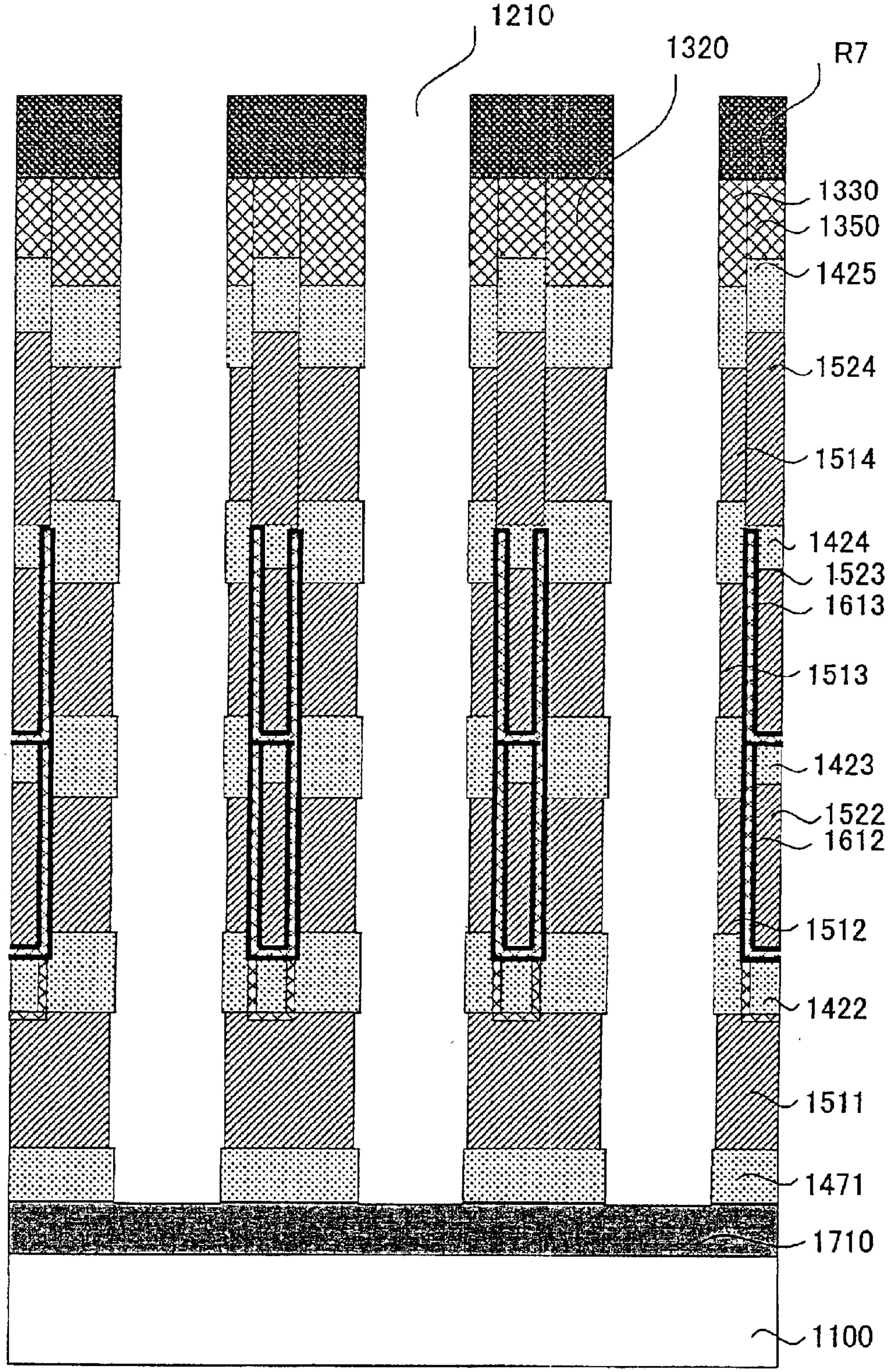

Fig. 1228
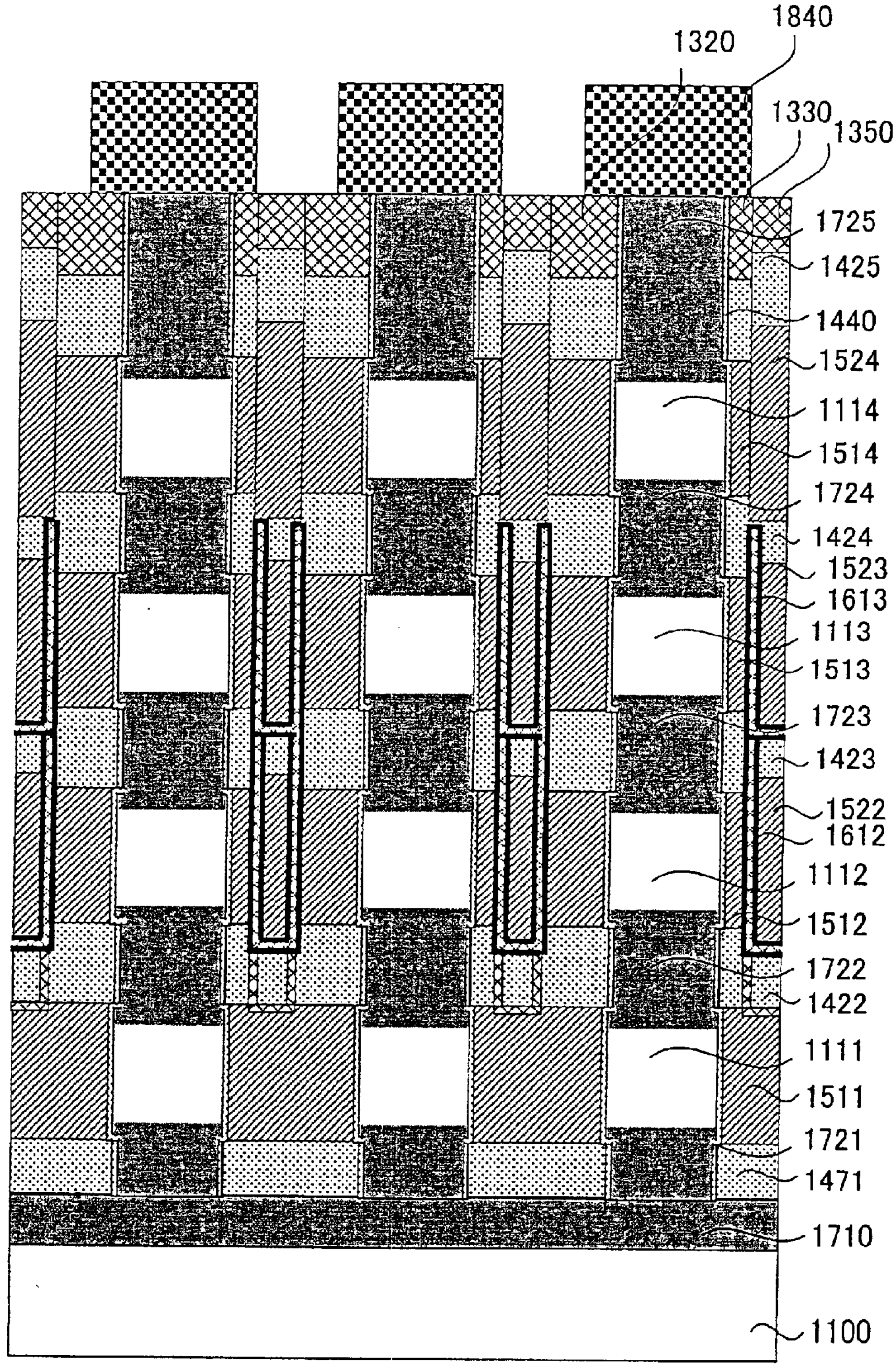

Fig. 1229
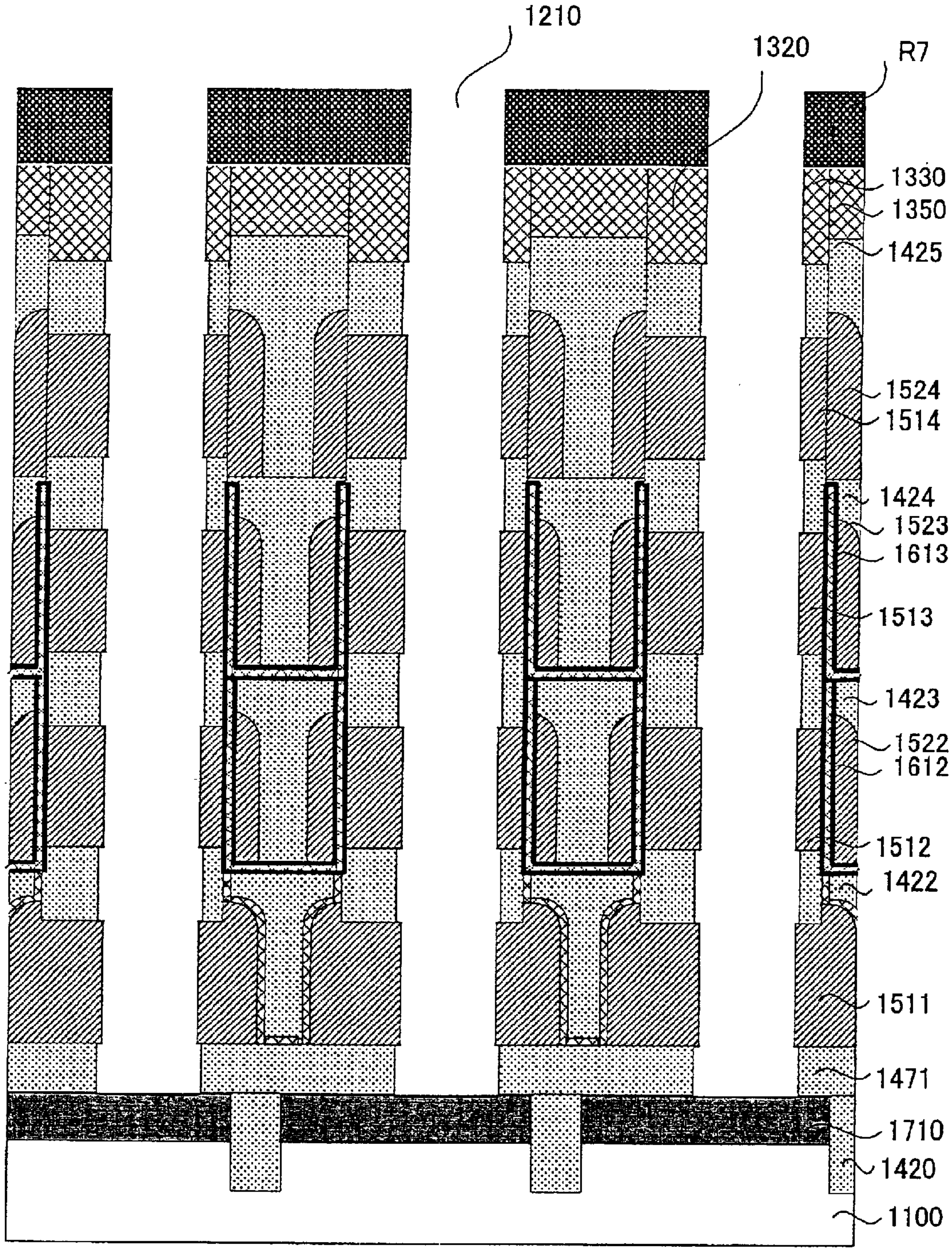

Fig. 1230
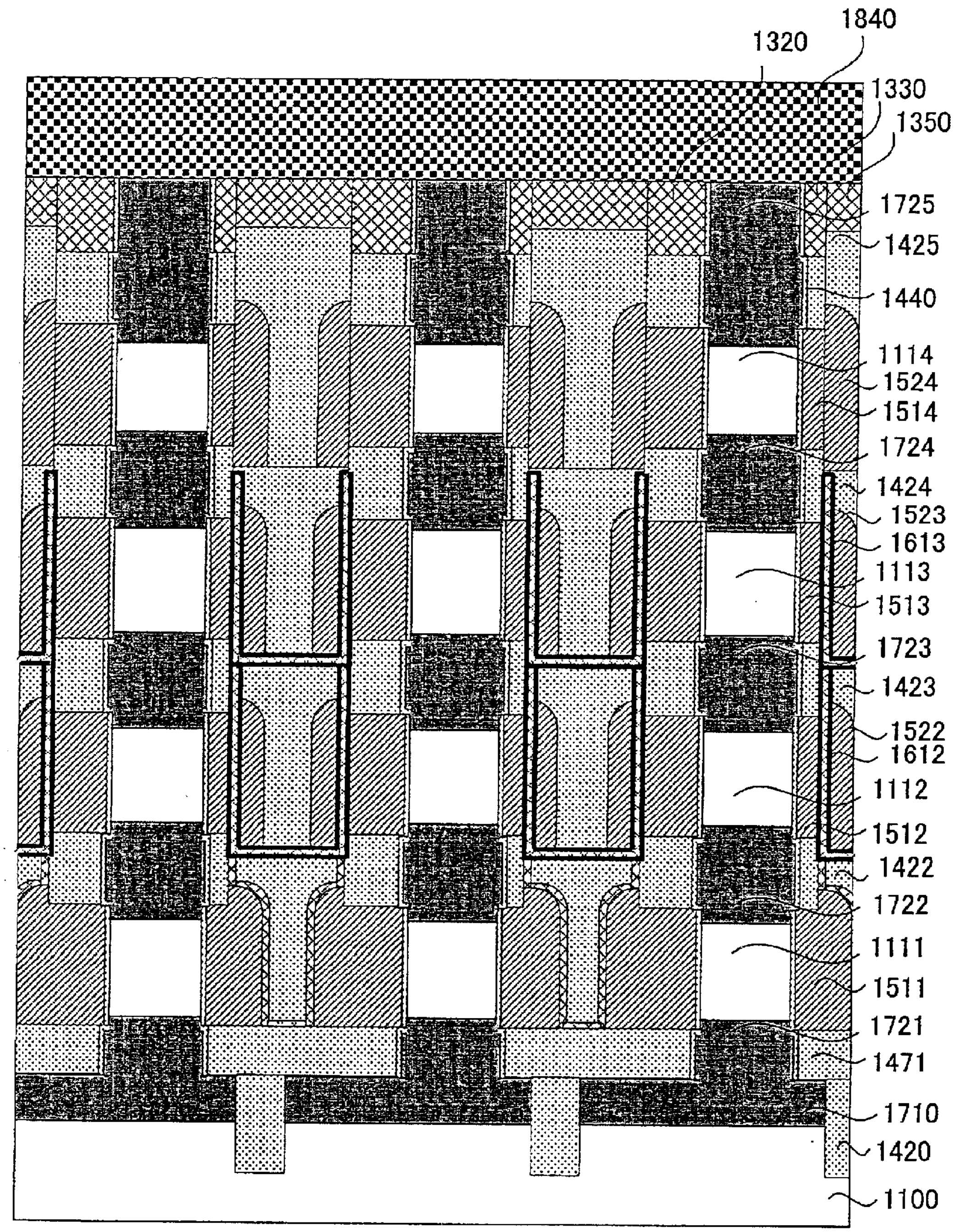

Fig. 1231
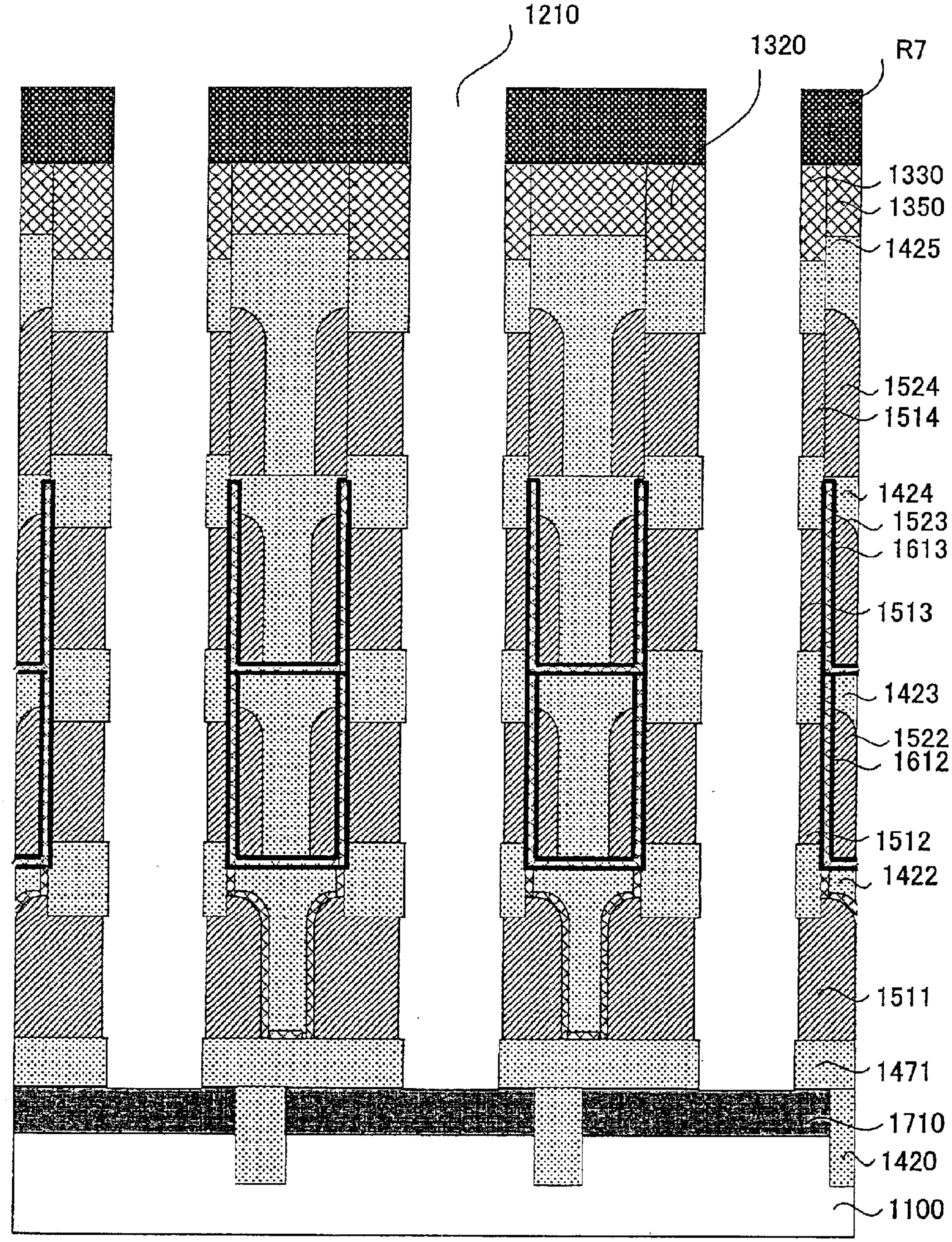

Fig. 1232
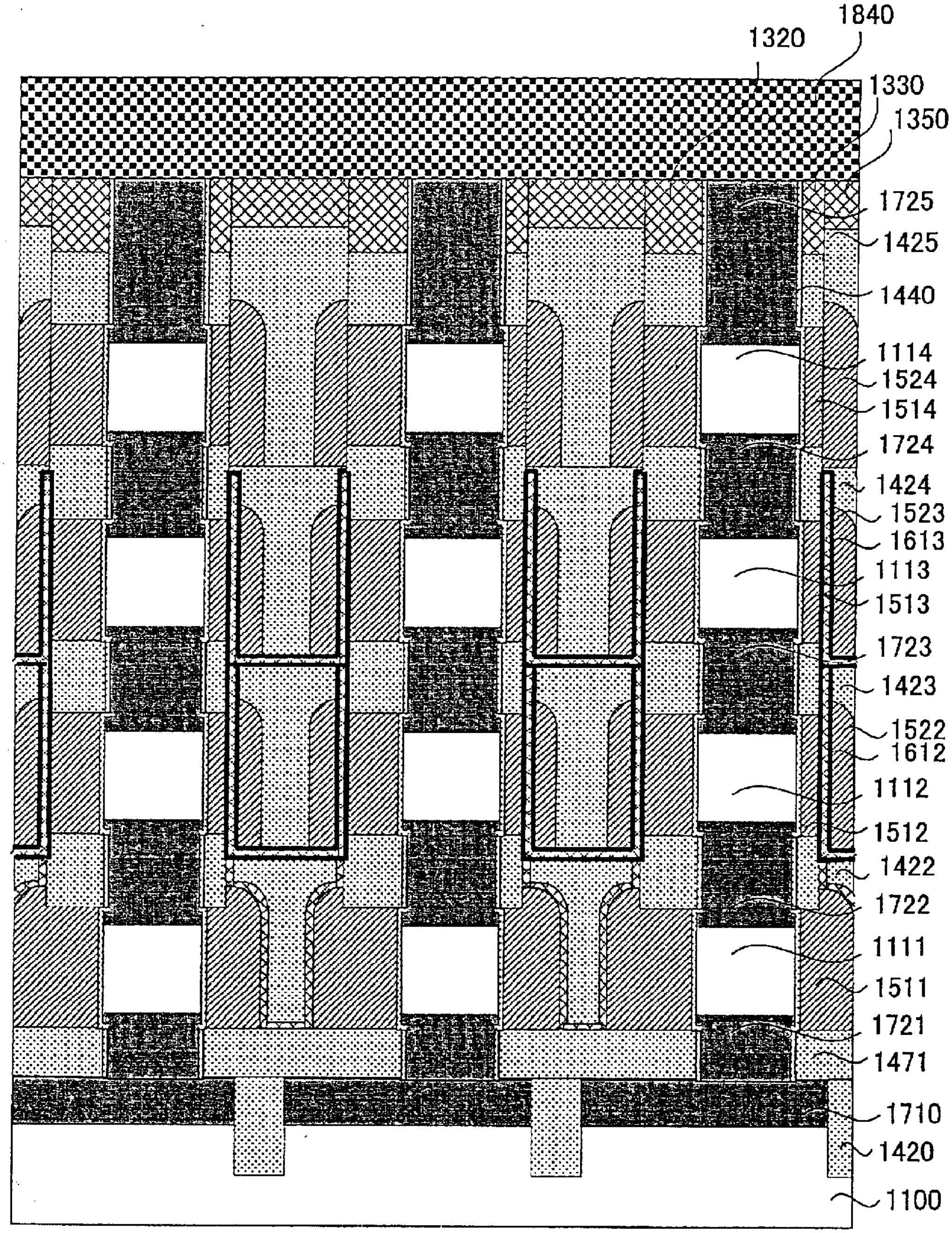

Fig. 1233
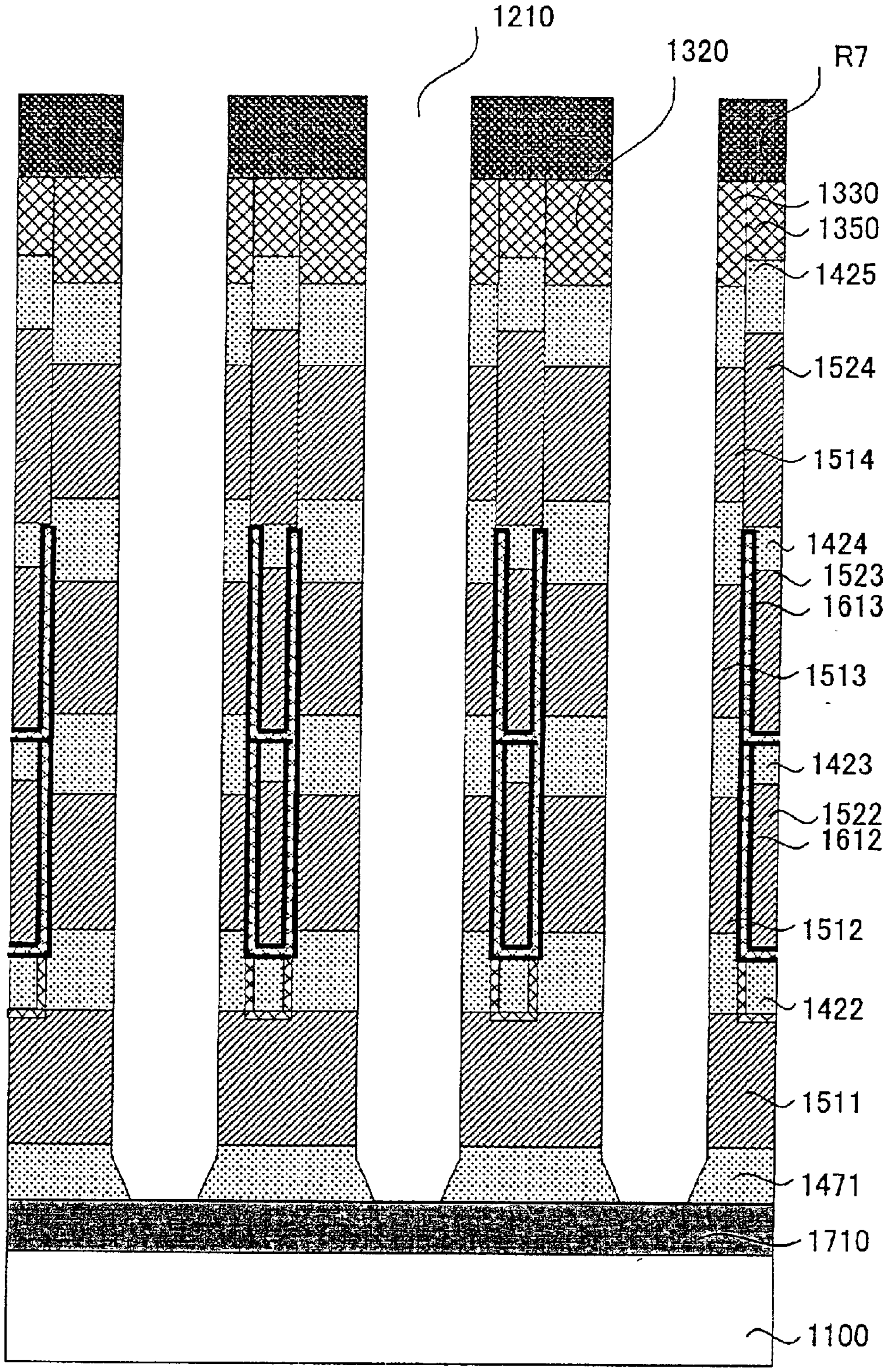

Fig. 1234
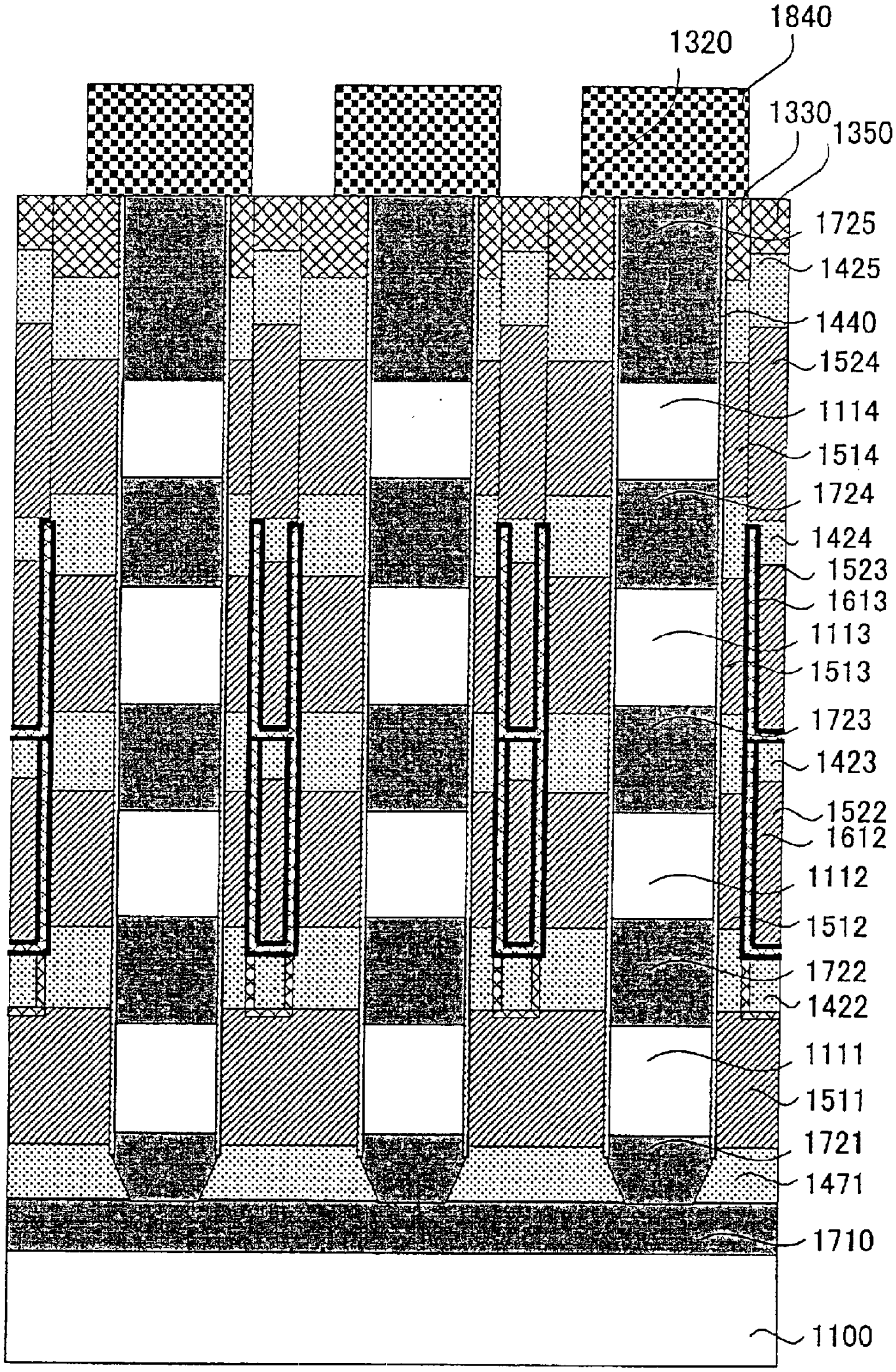

Fig. 1235
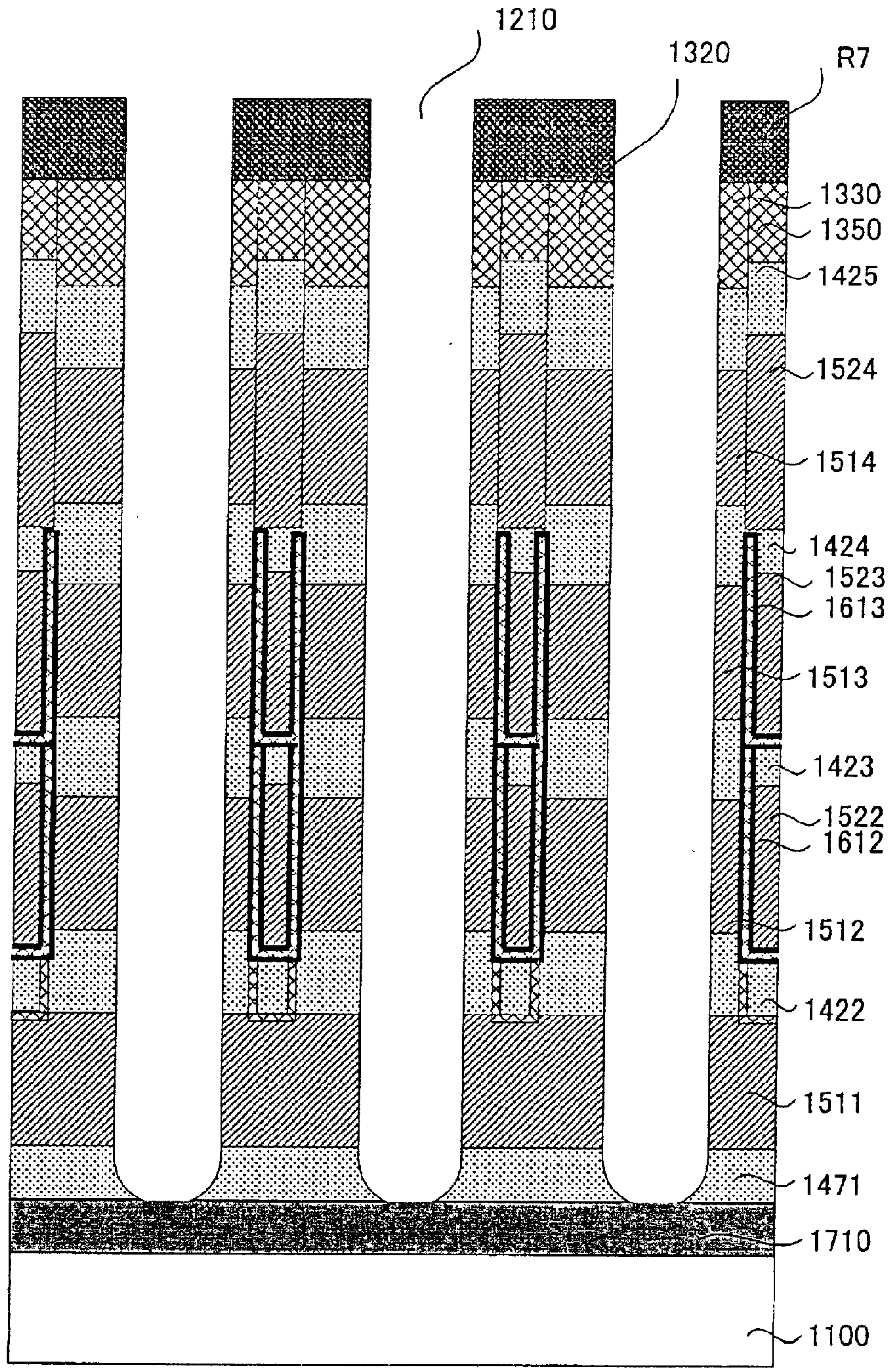

Fig. 1236
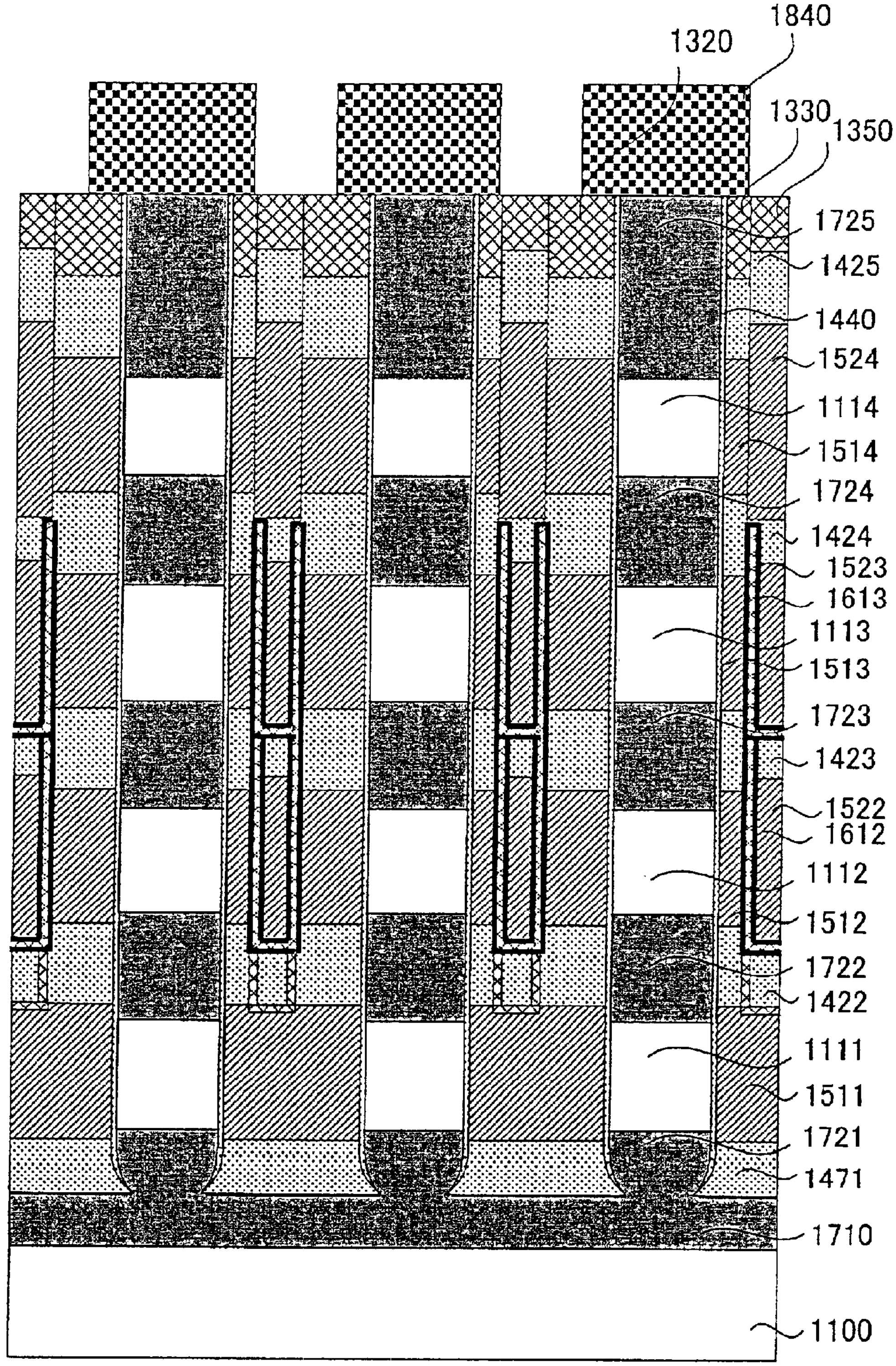

Fig. 1237
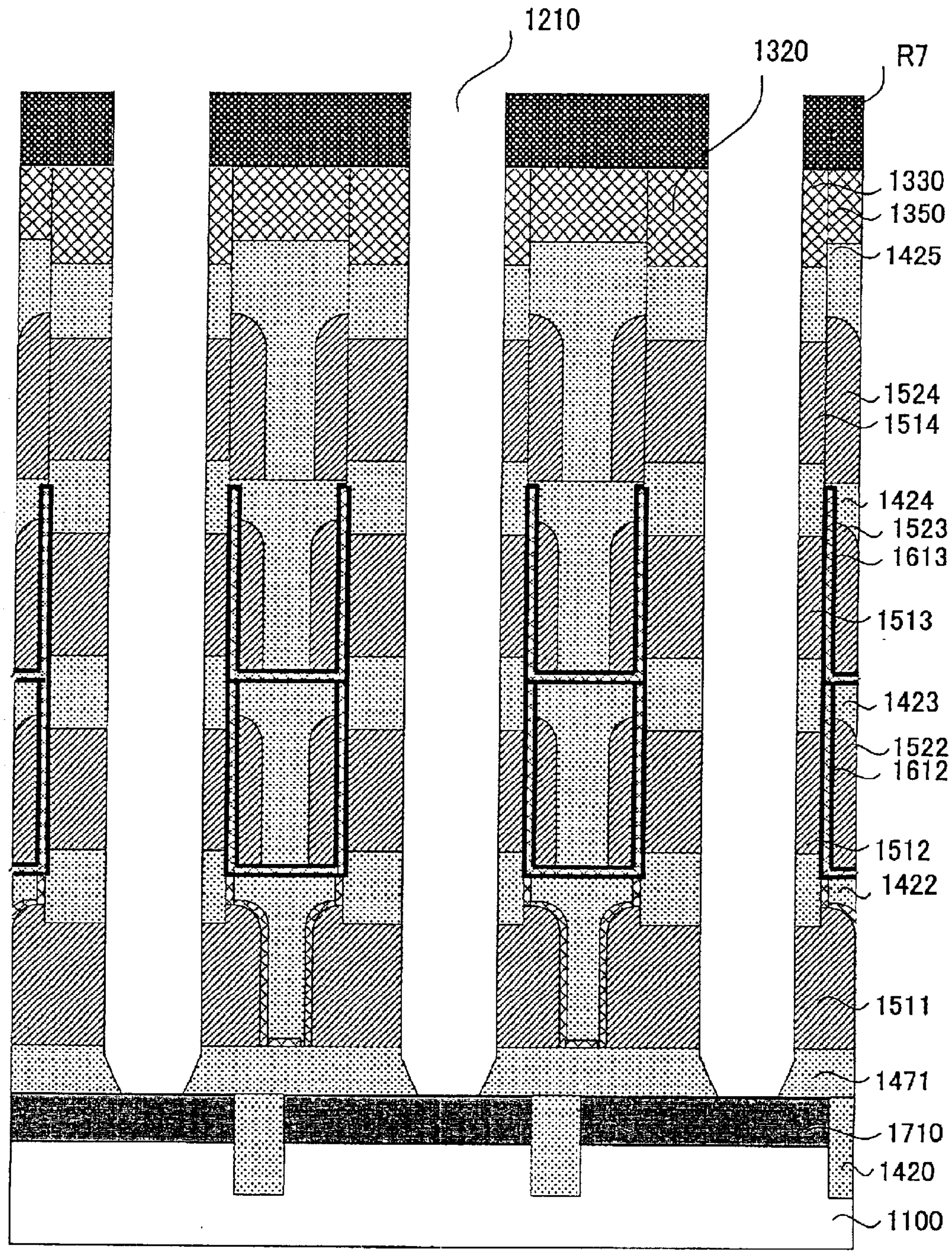

Fig. 1238
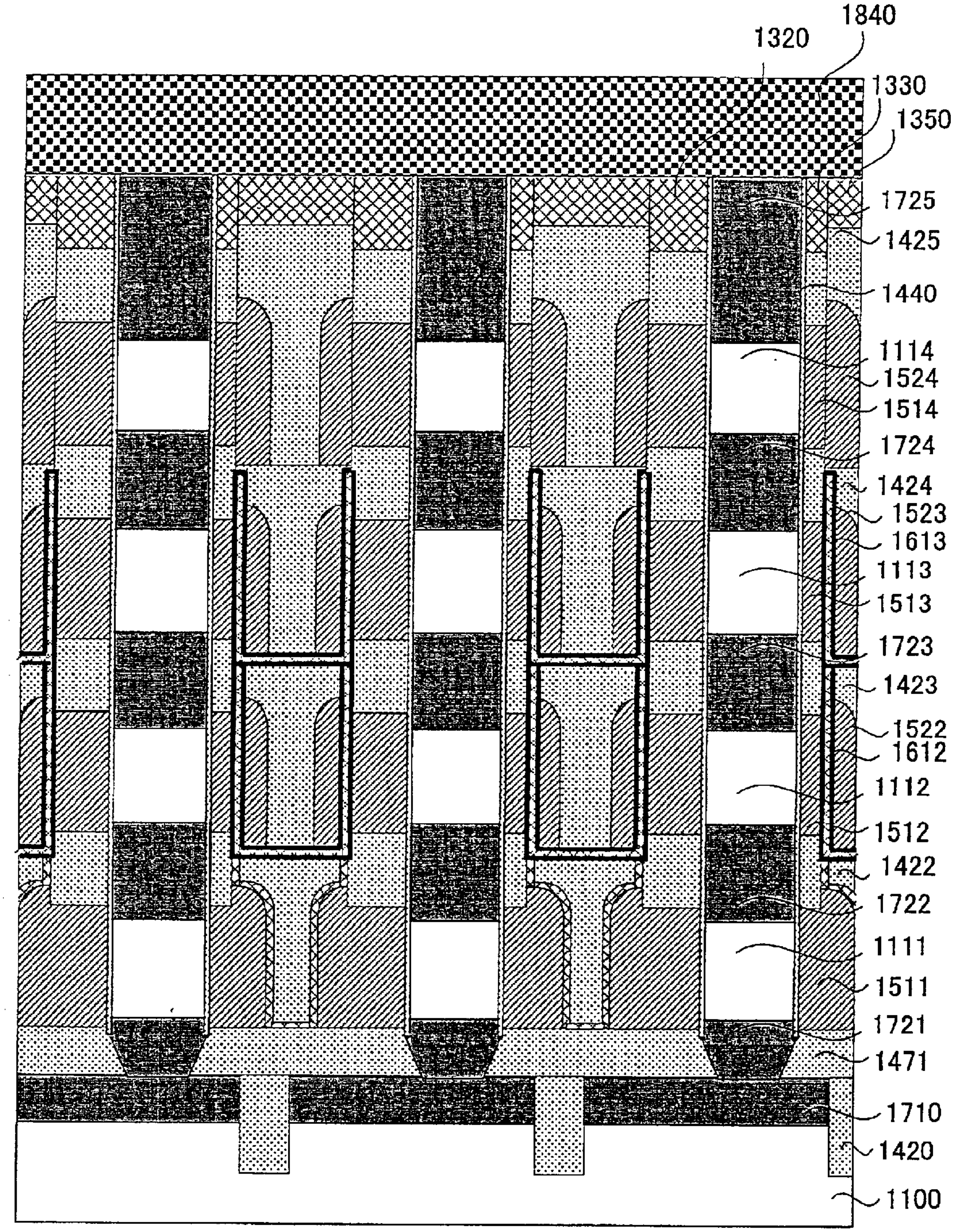

Fig. 1239
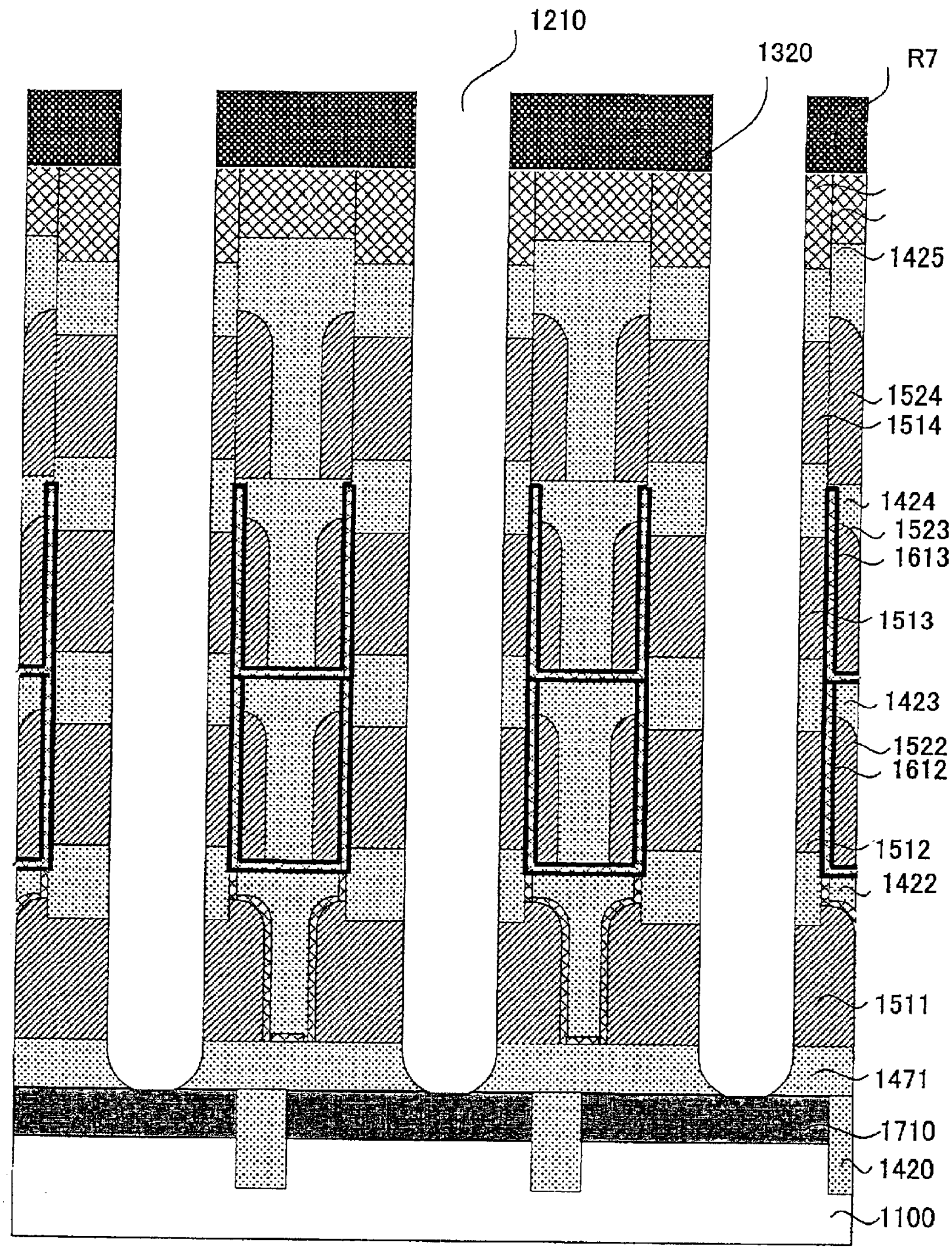

Fig. 1240
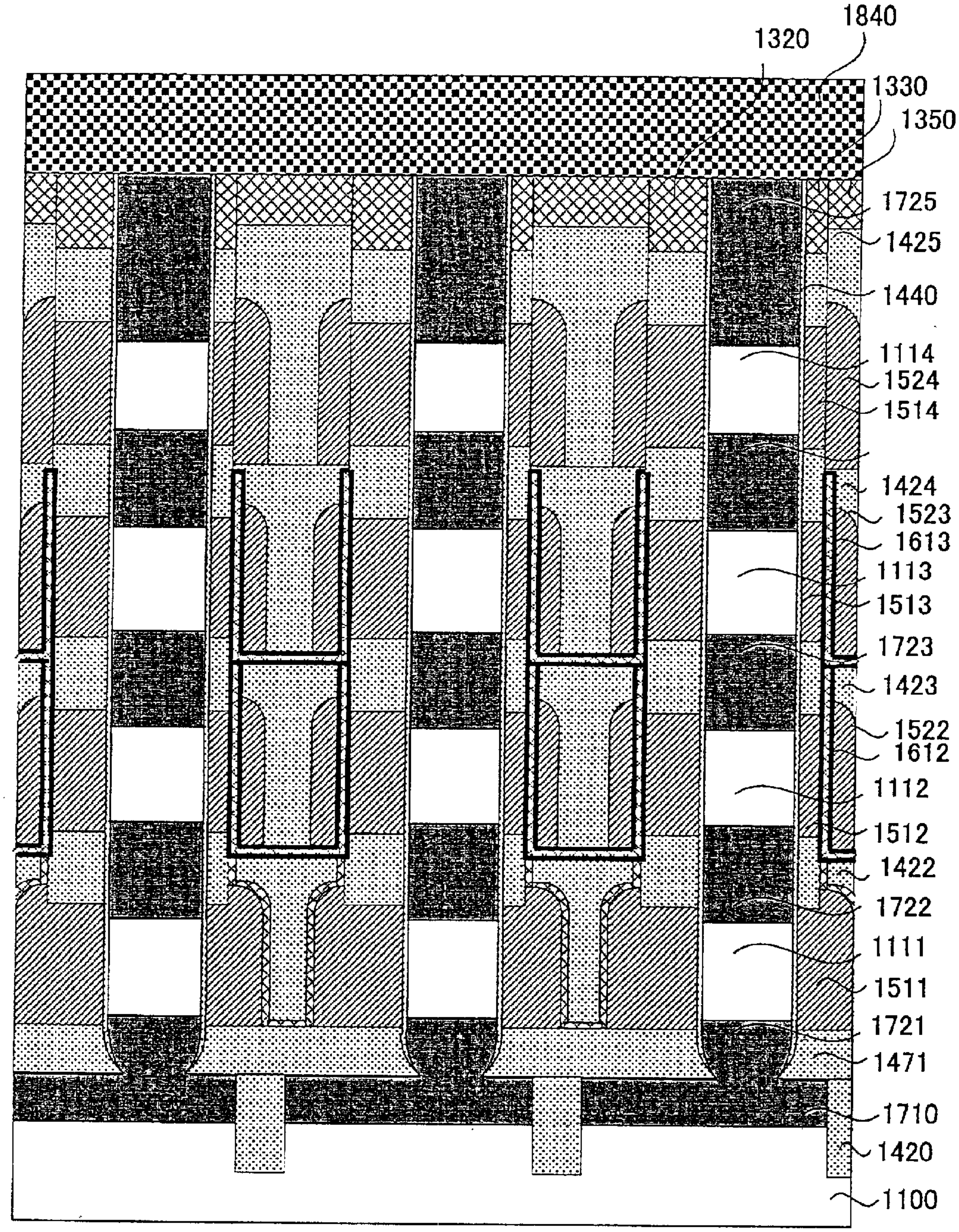

Fig. 1241
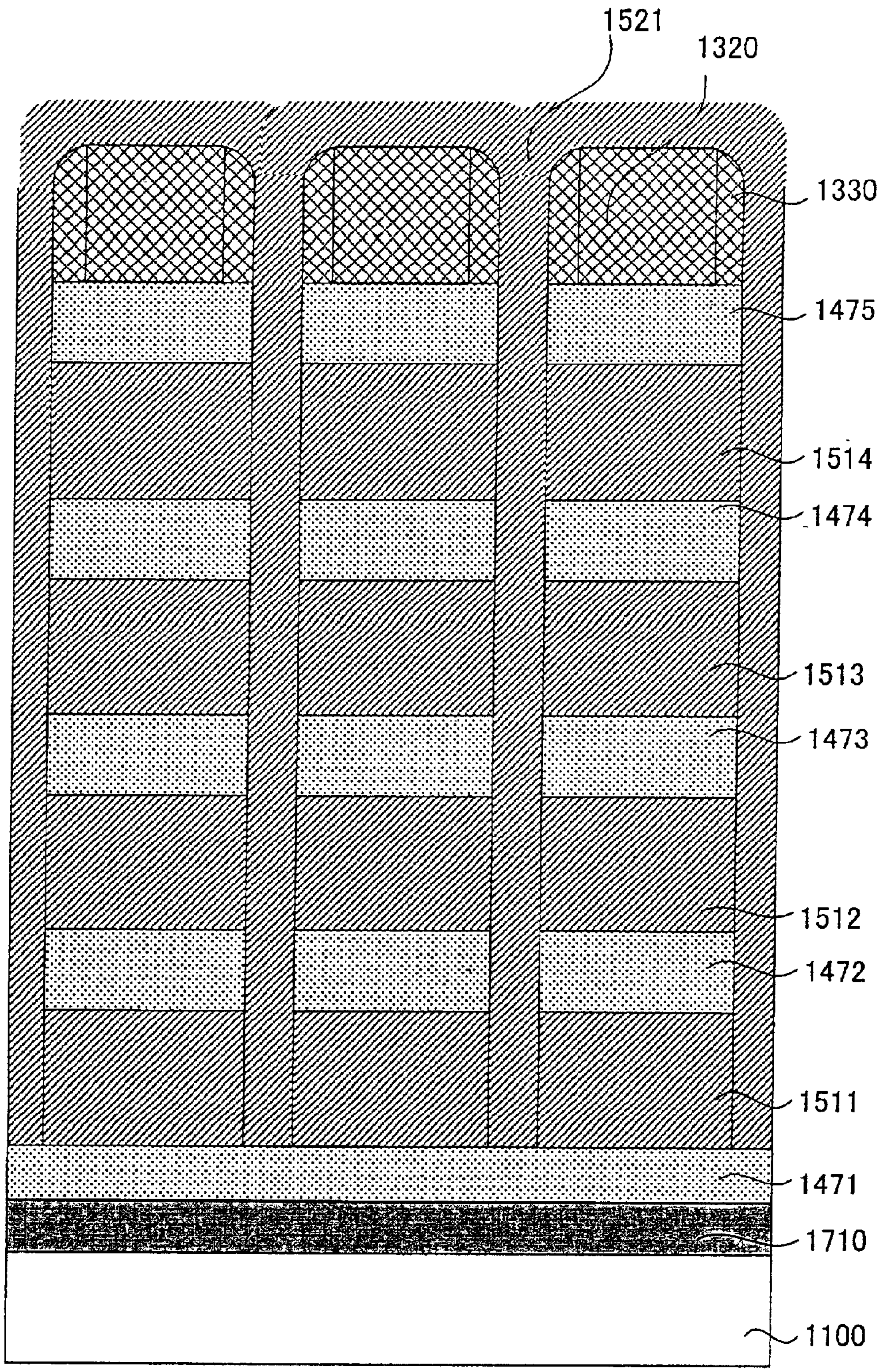

Fig. 1242
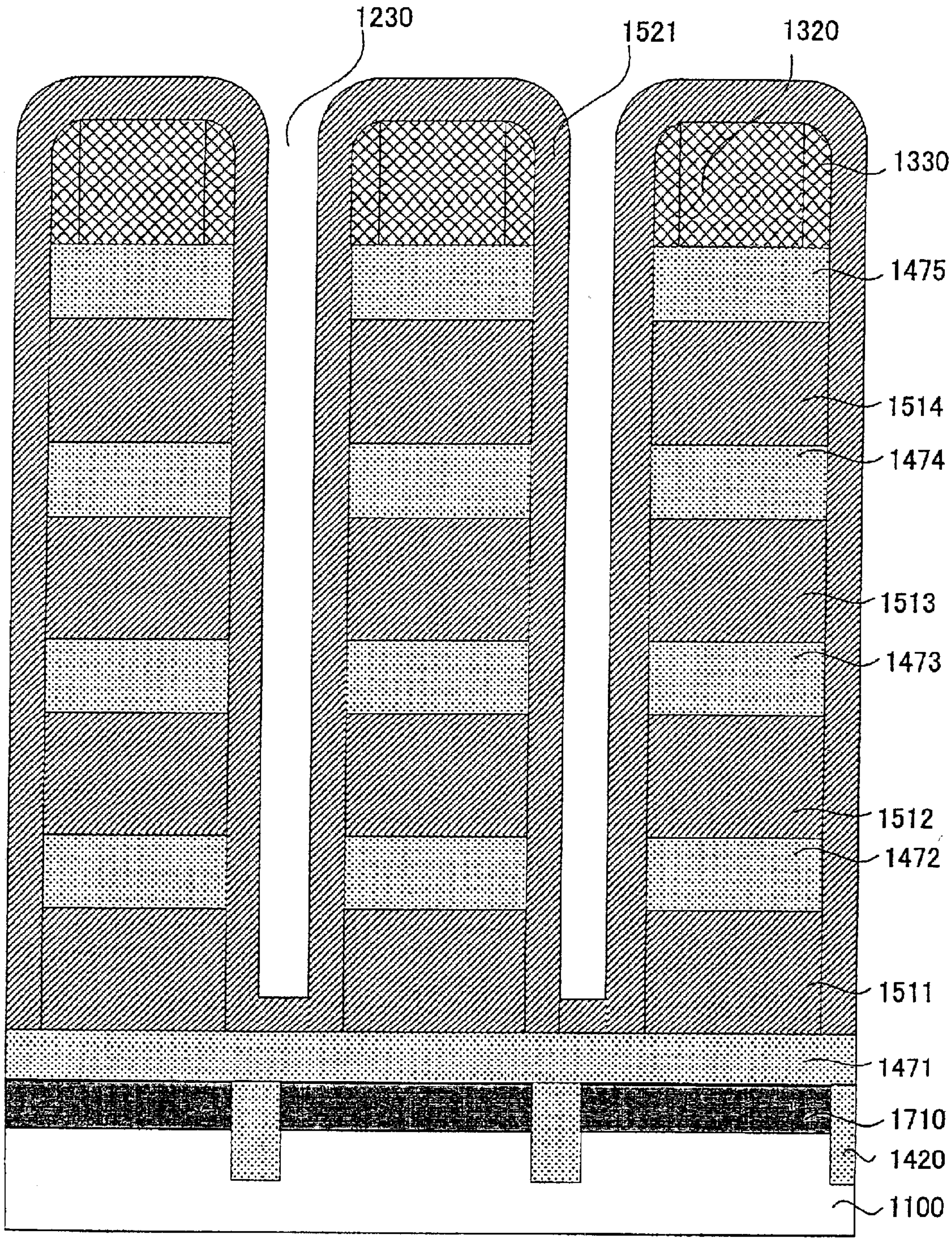

Fig. 1243
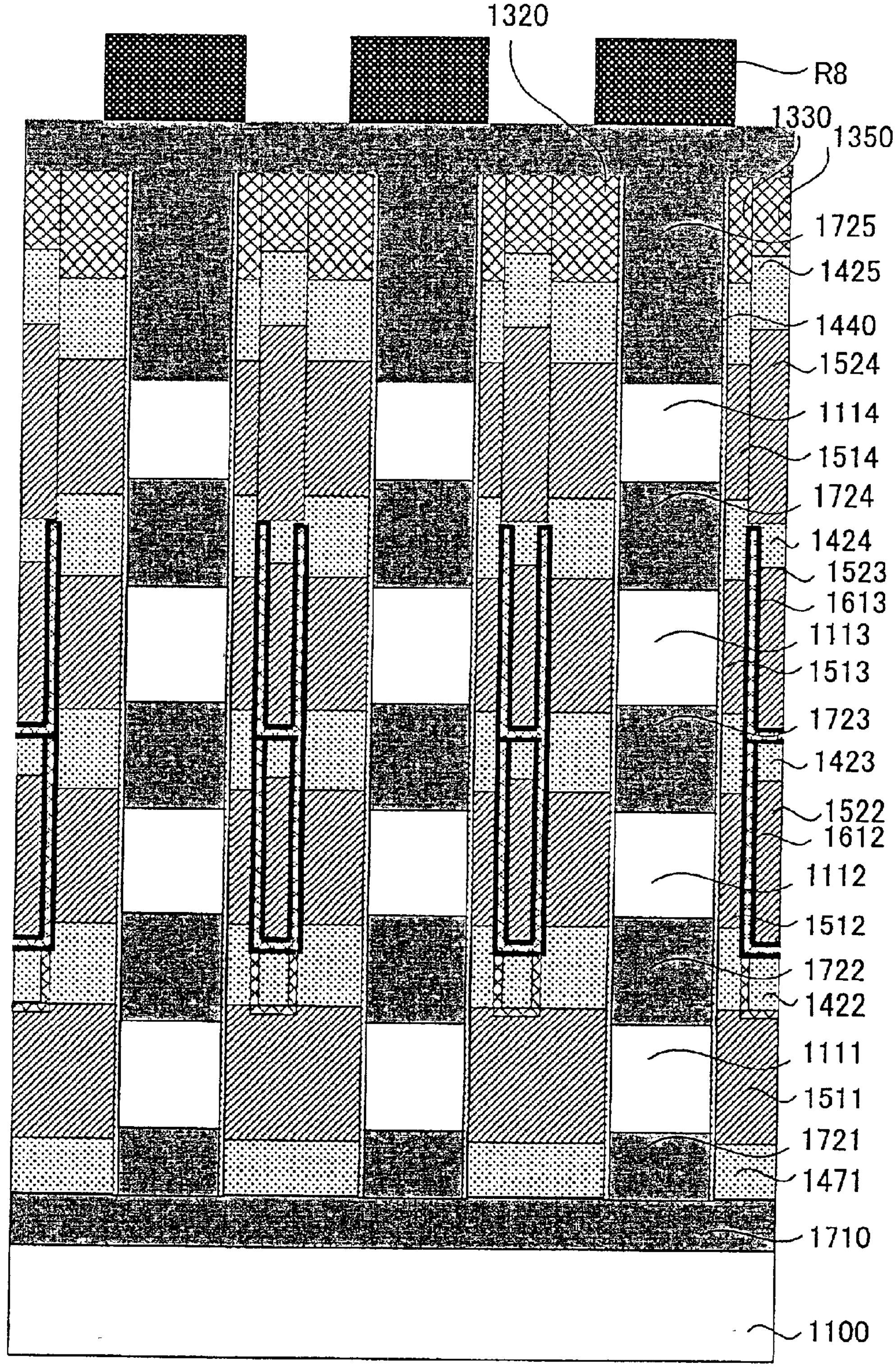

Fig. 1244
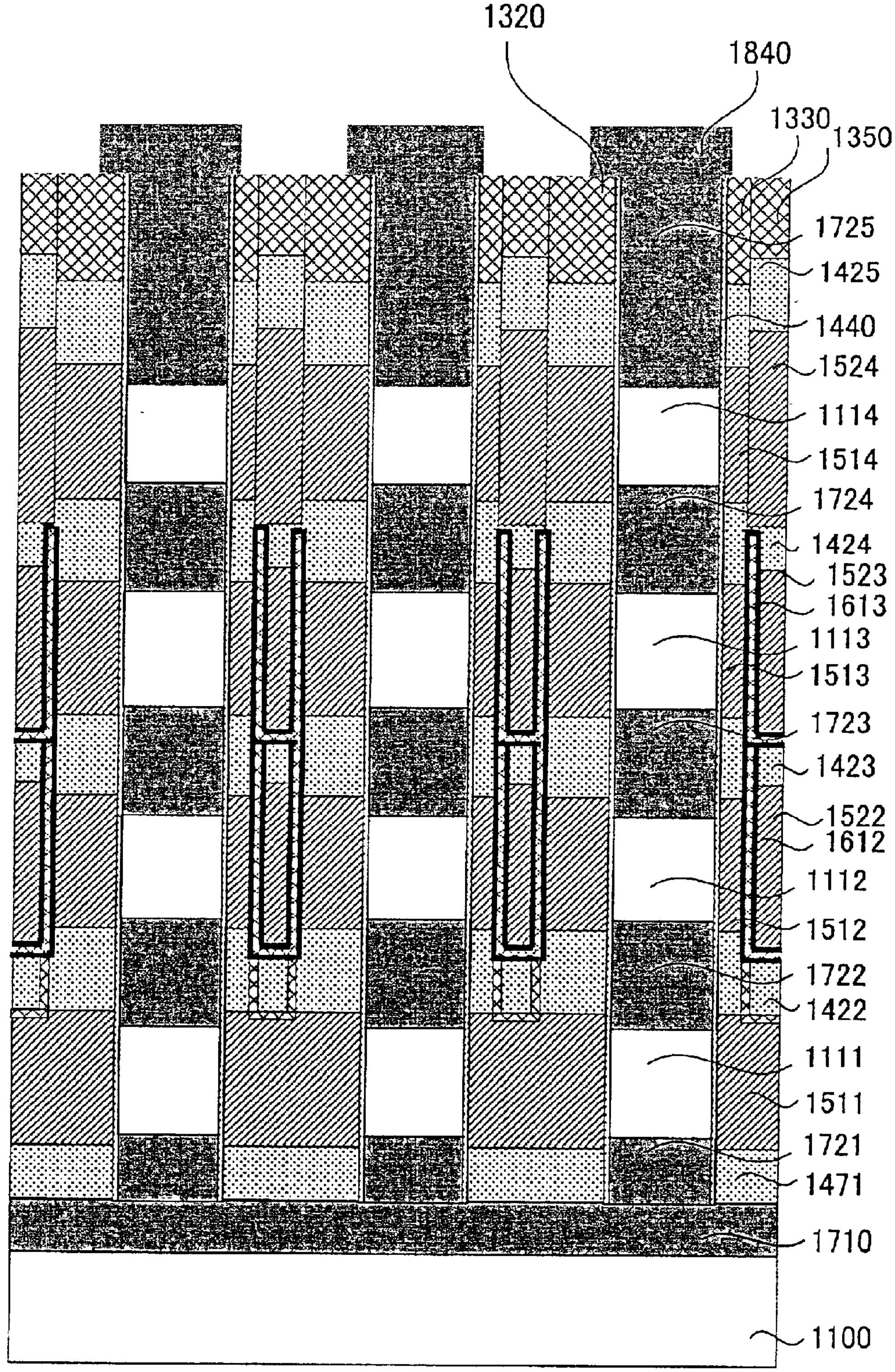

Fig. 1245
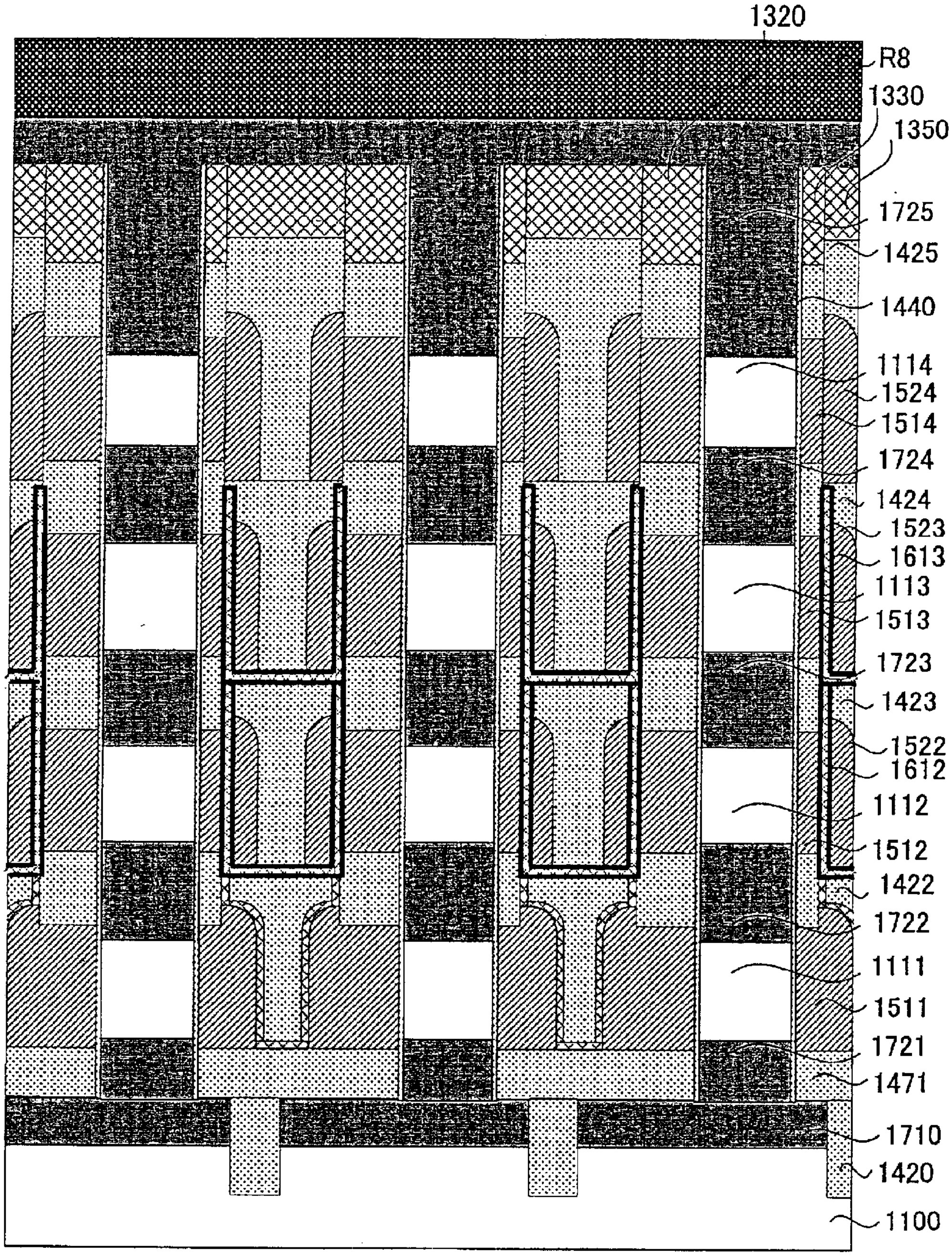

Fig. 1246
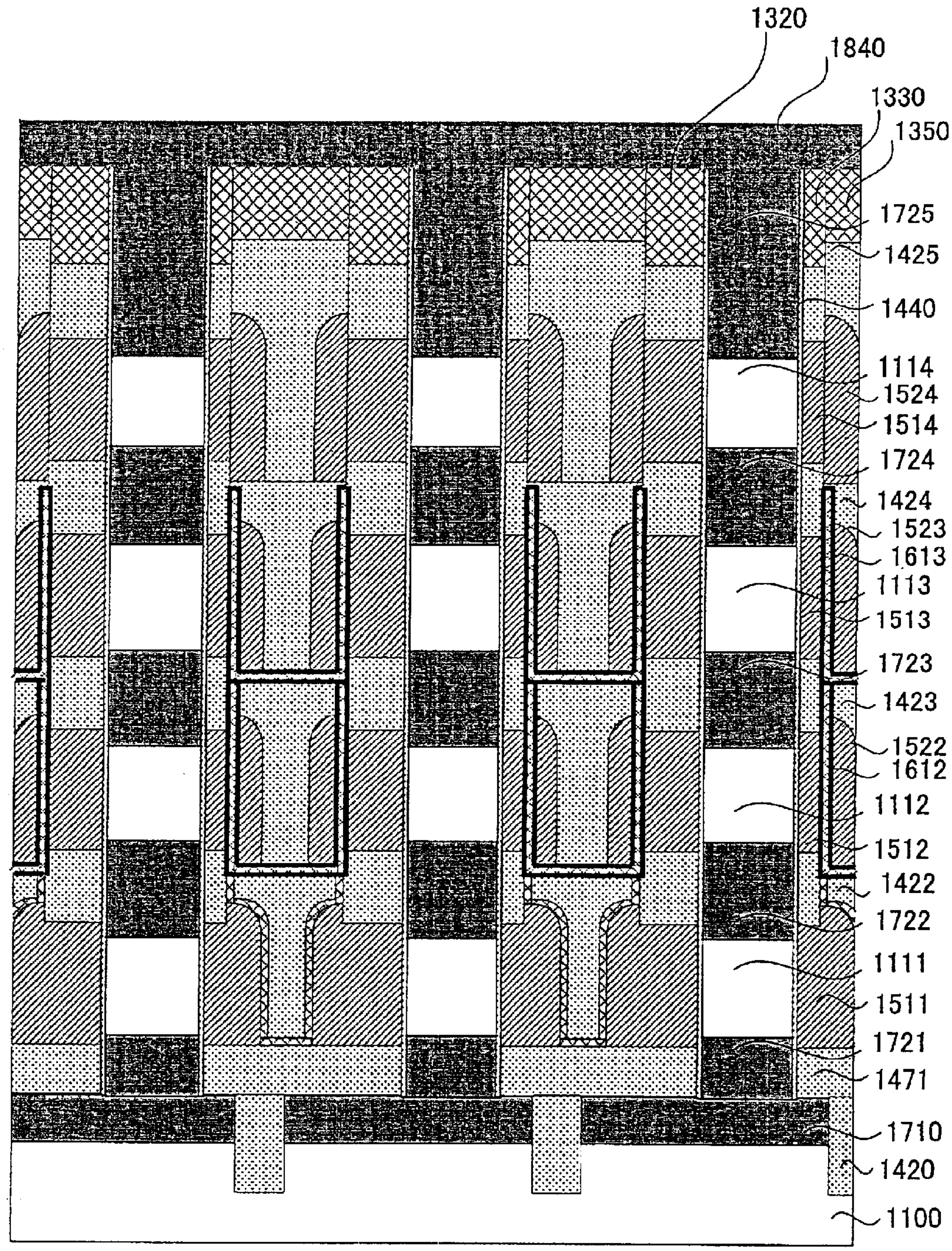

Fig. 1247
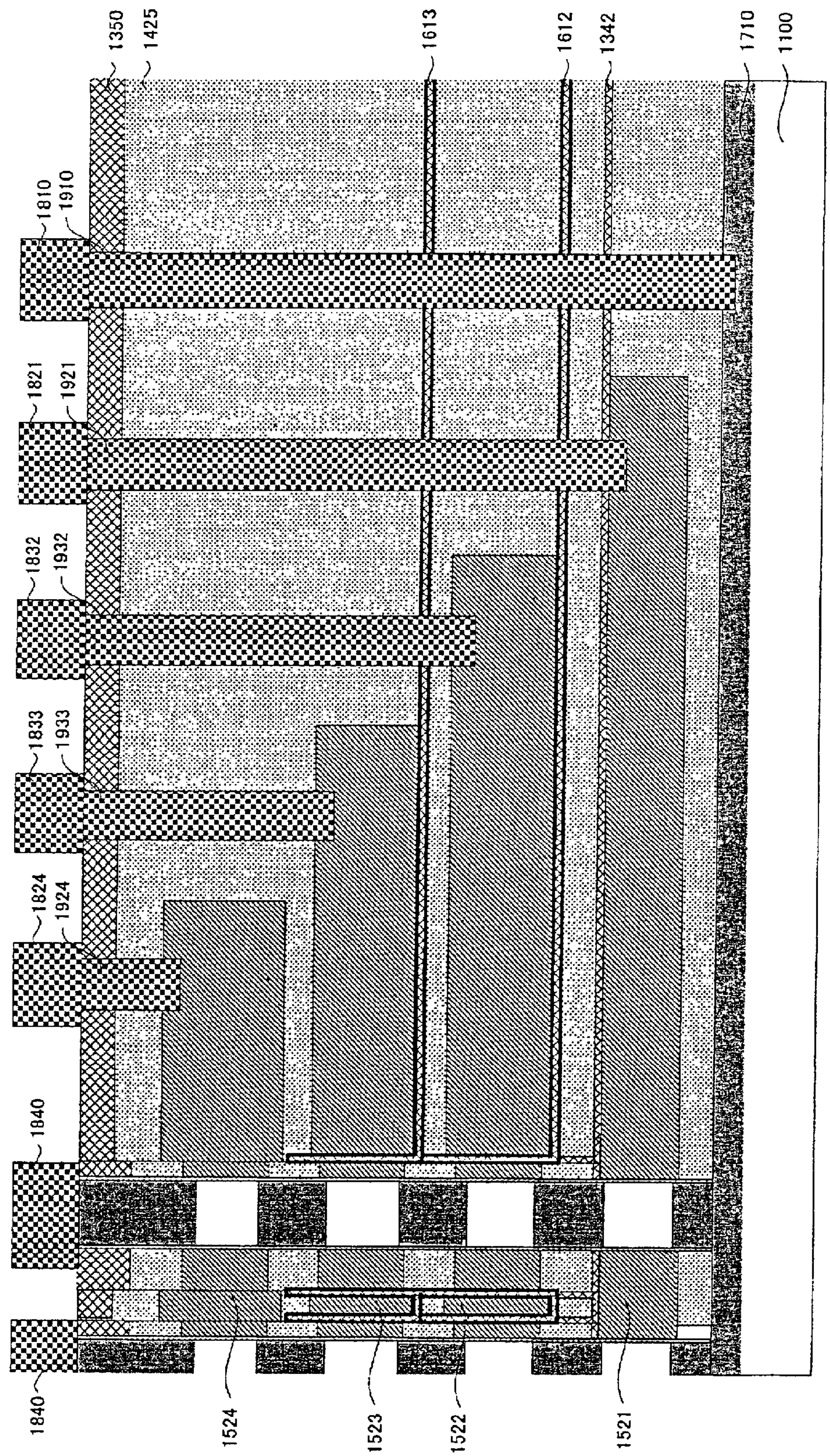

Fig. 1248
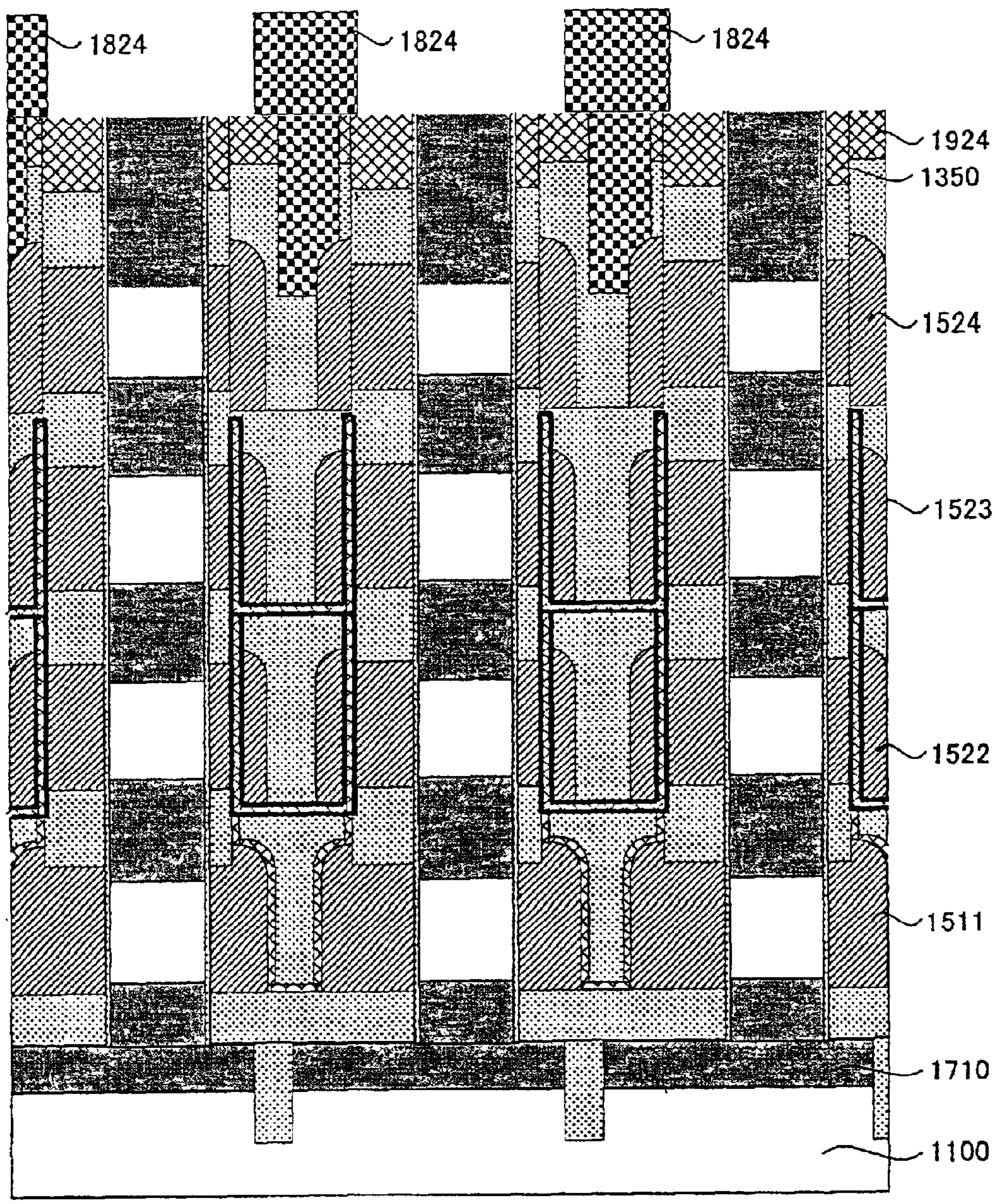

Fig. 1249
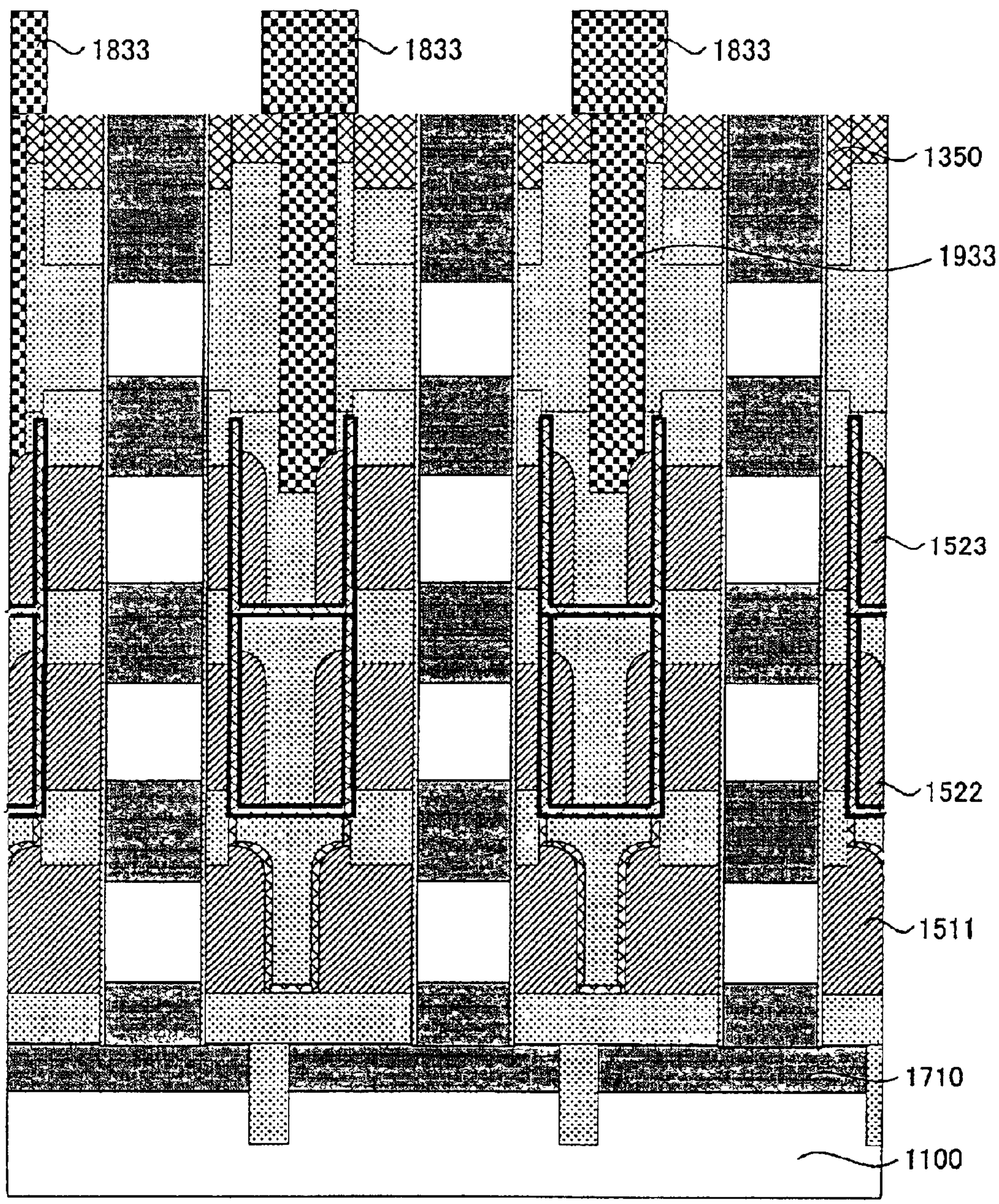

Fig. 1250
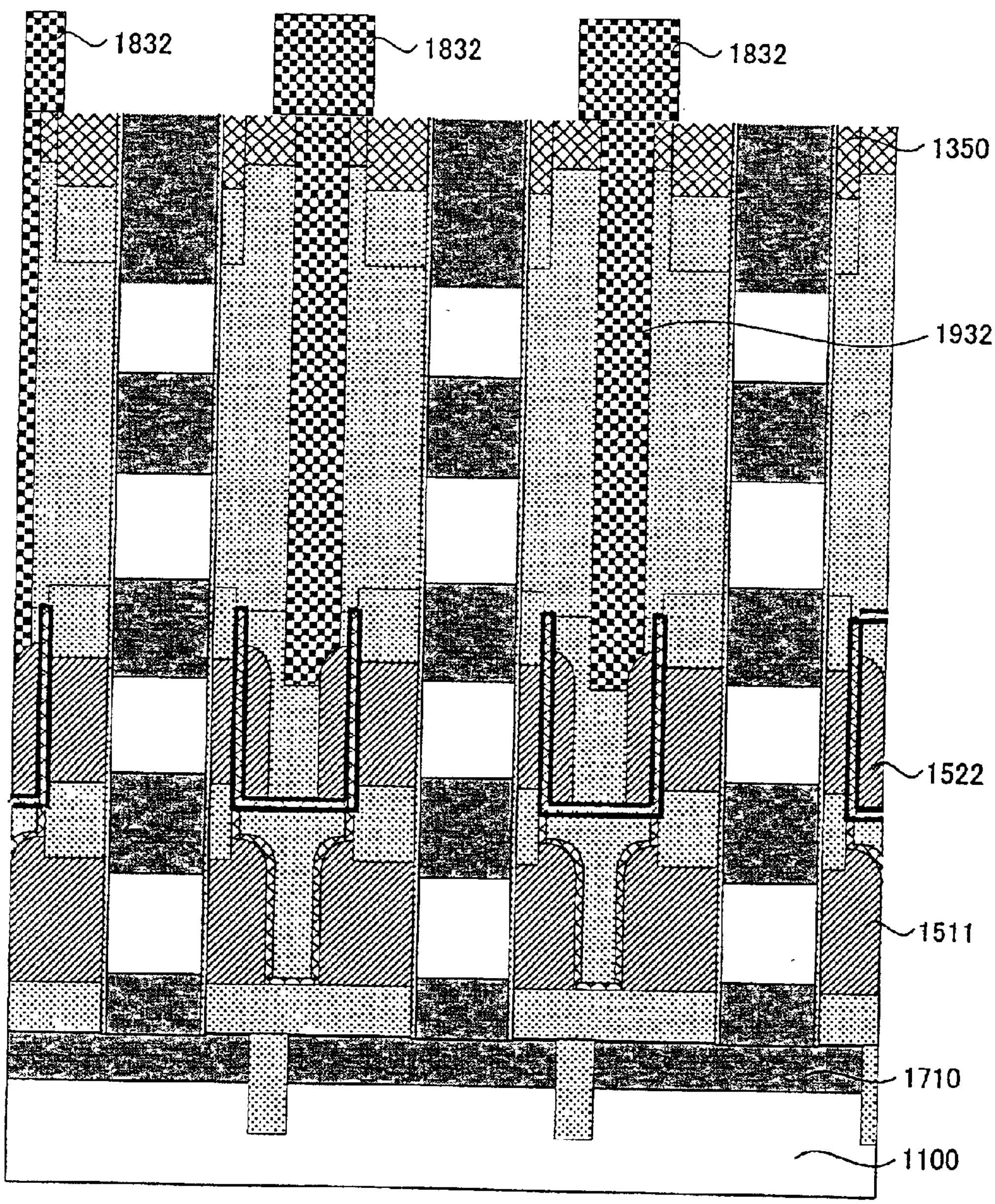

Fig. 1251
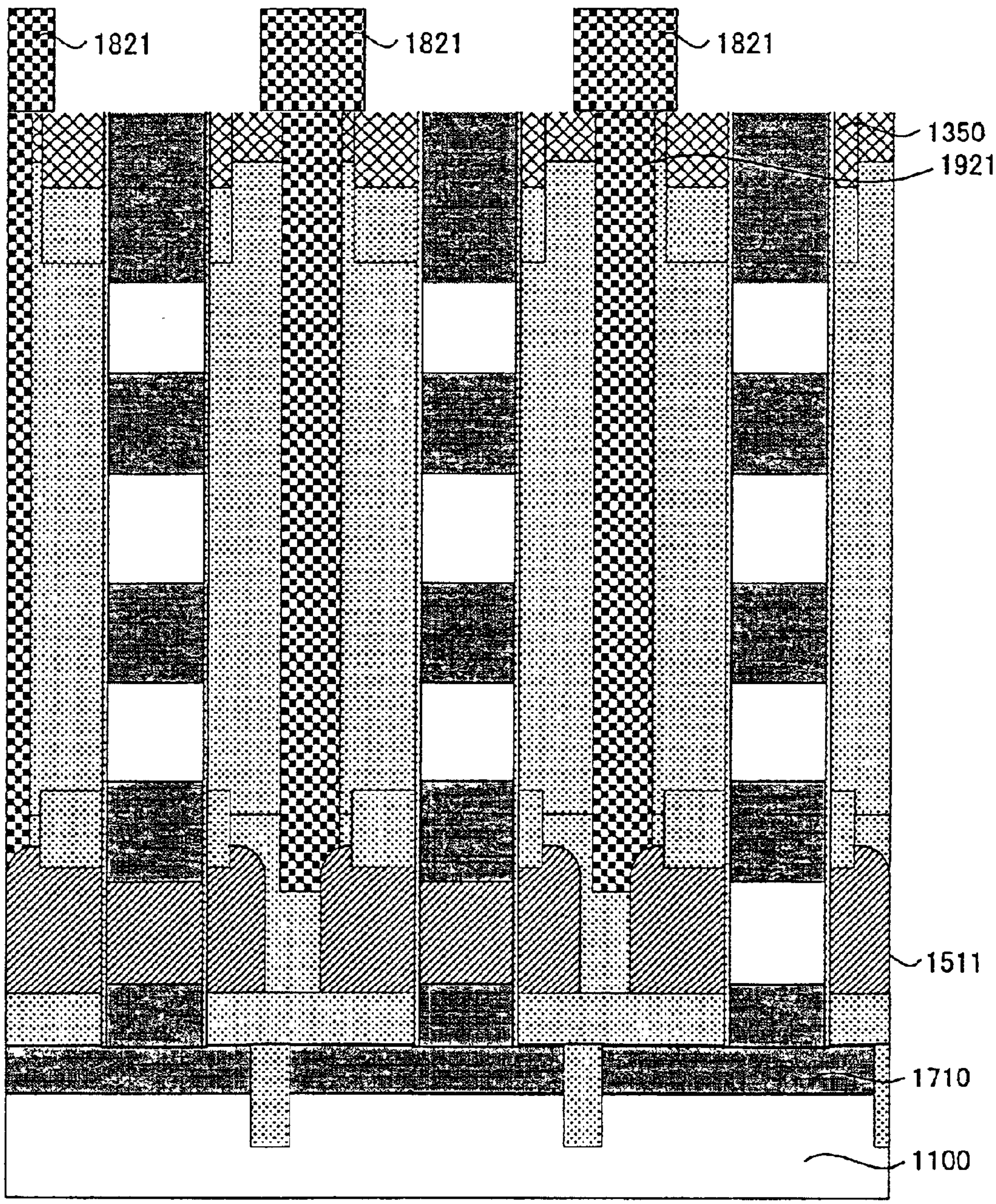

Fig. 1252
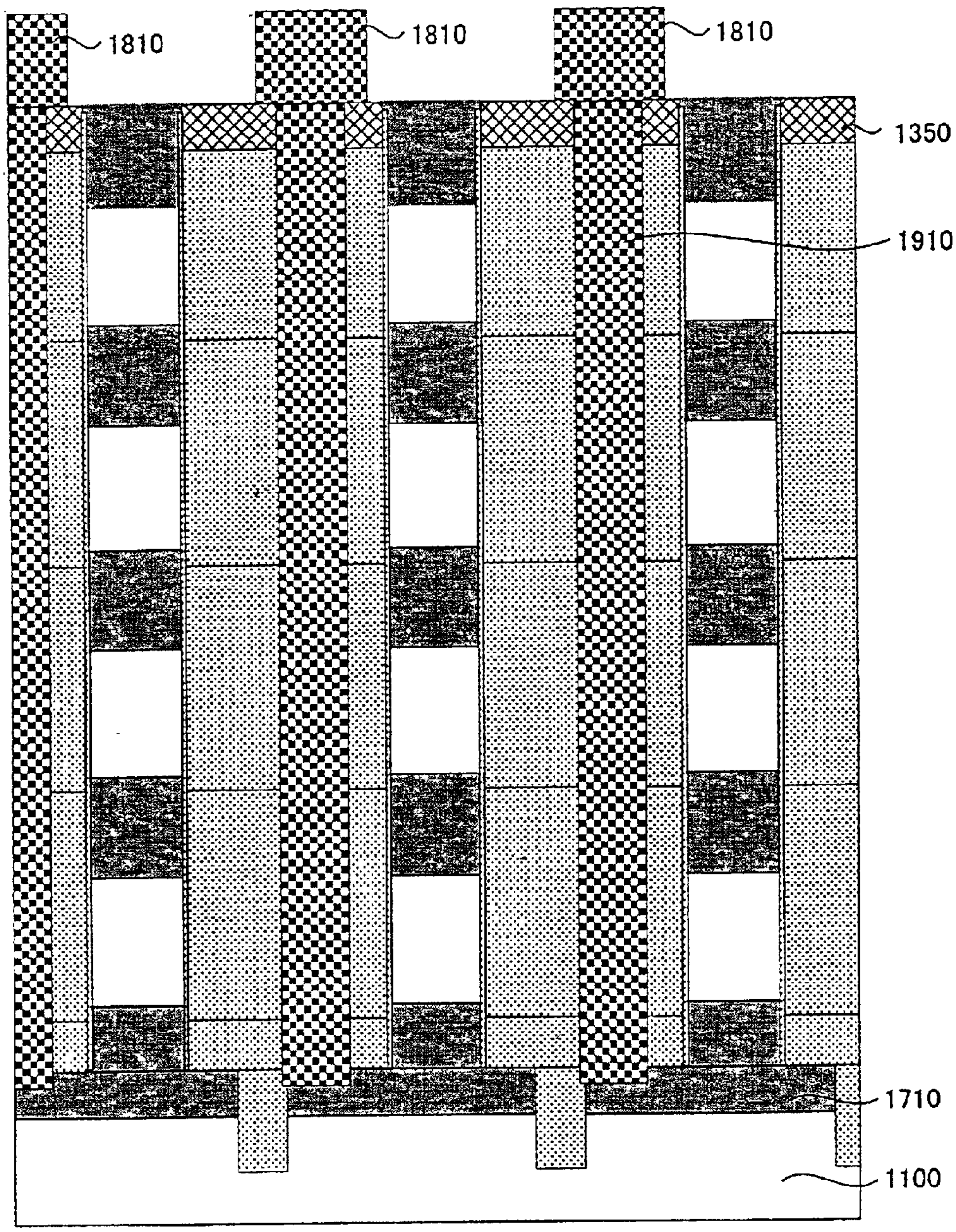

Fig. 1253
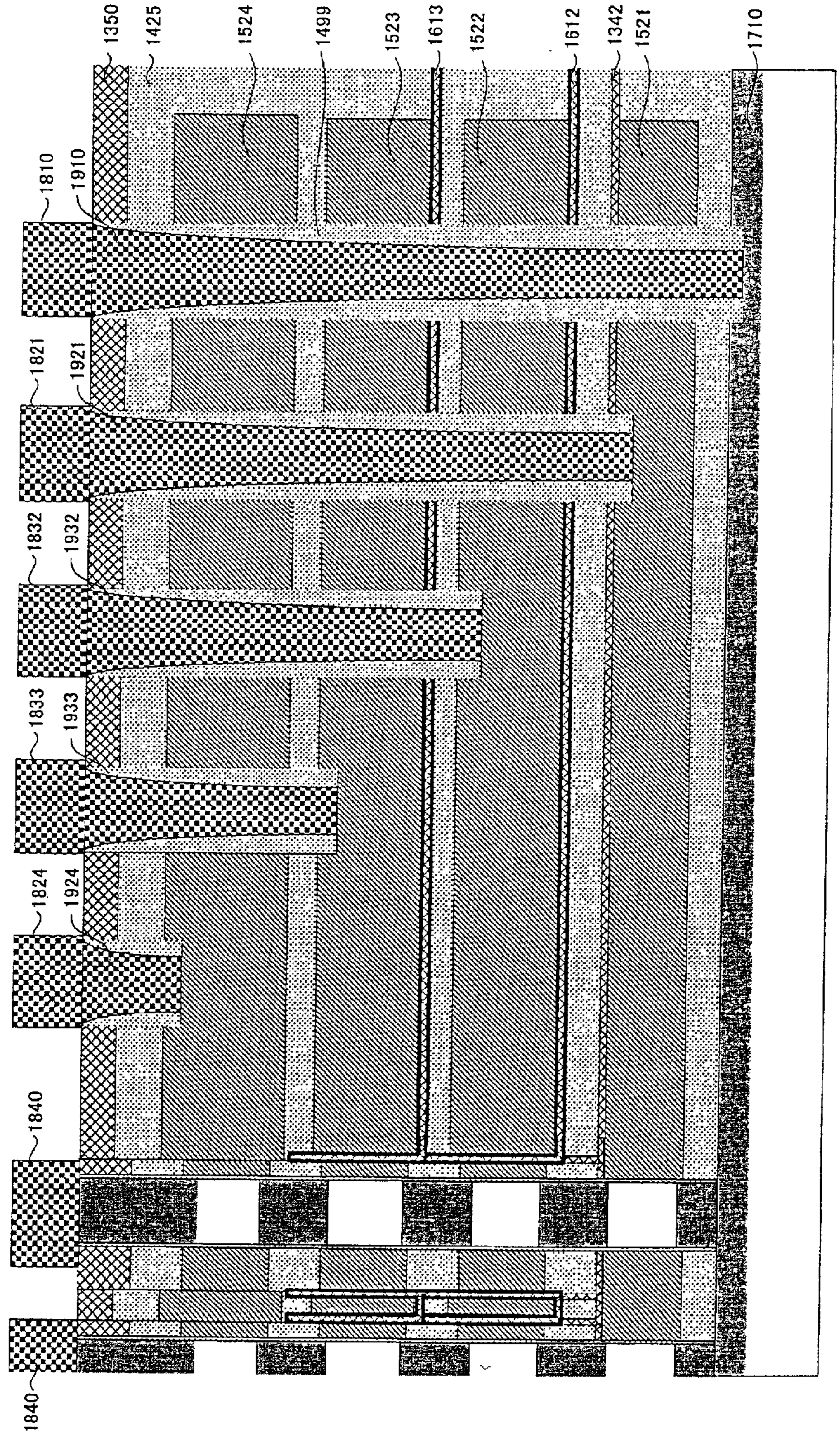

Fig. 1254
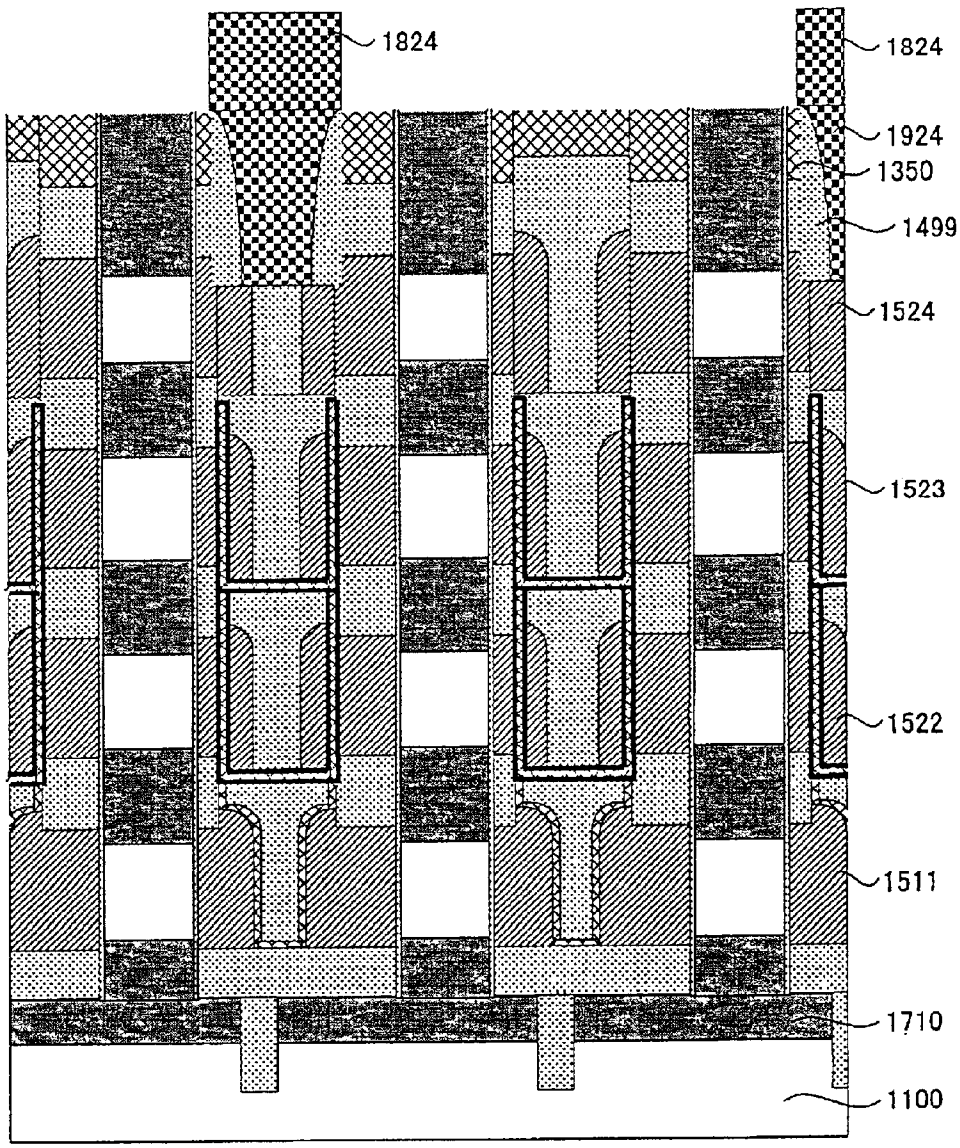

Fig. 1255
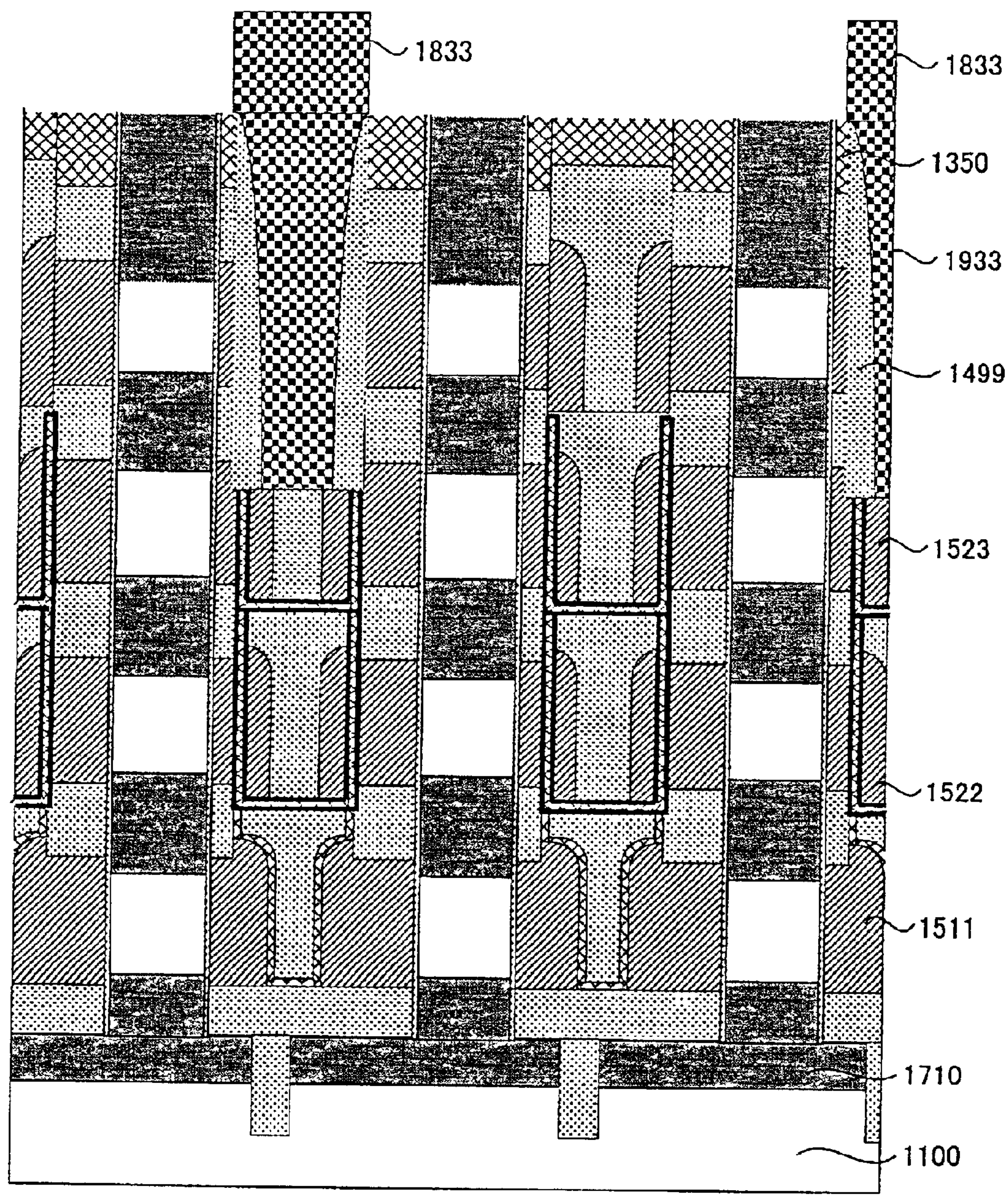

Fig. 1256
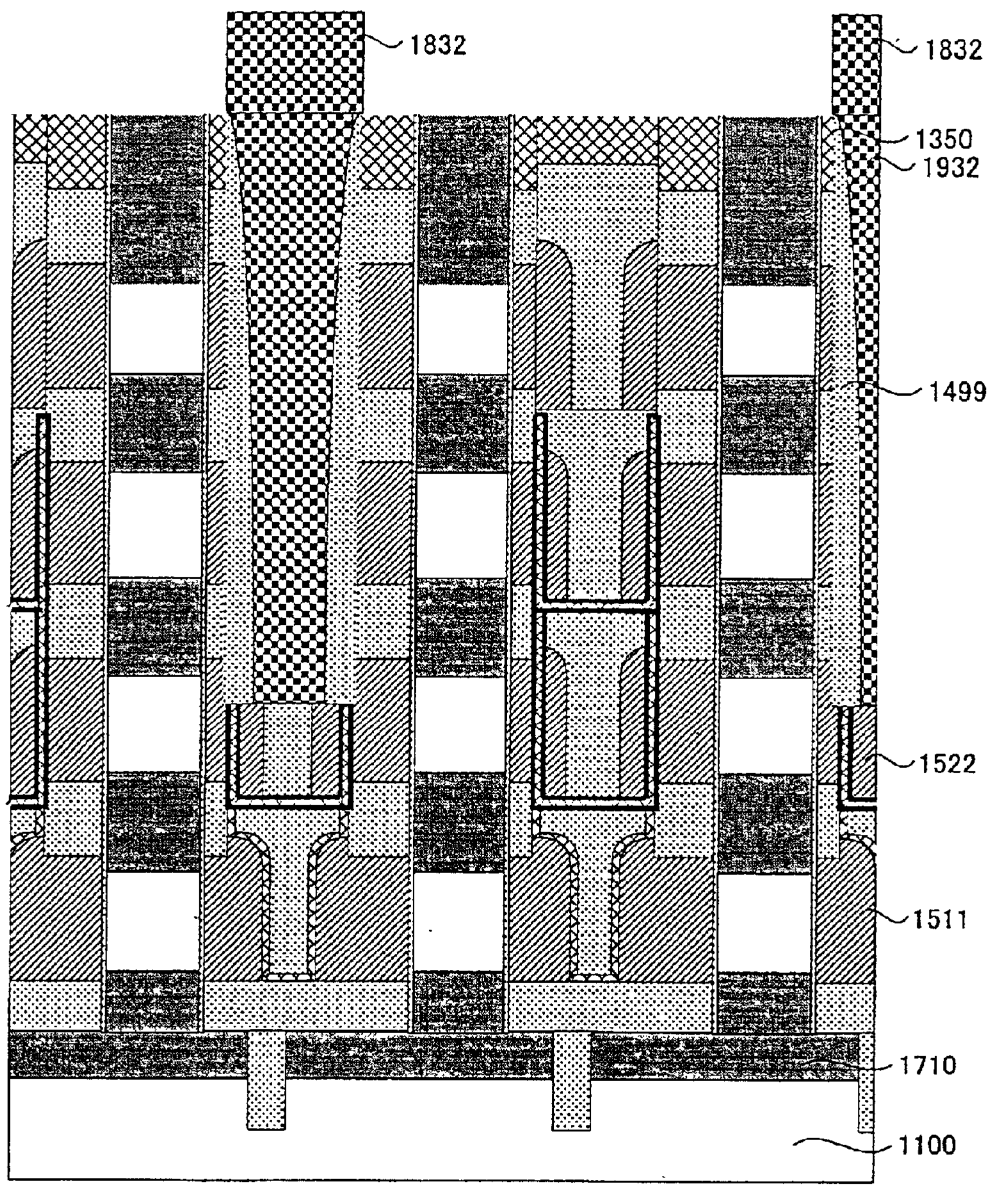

Fig. 1257
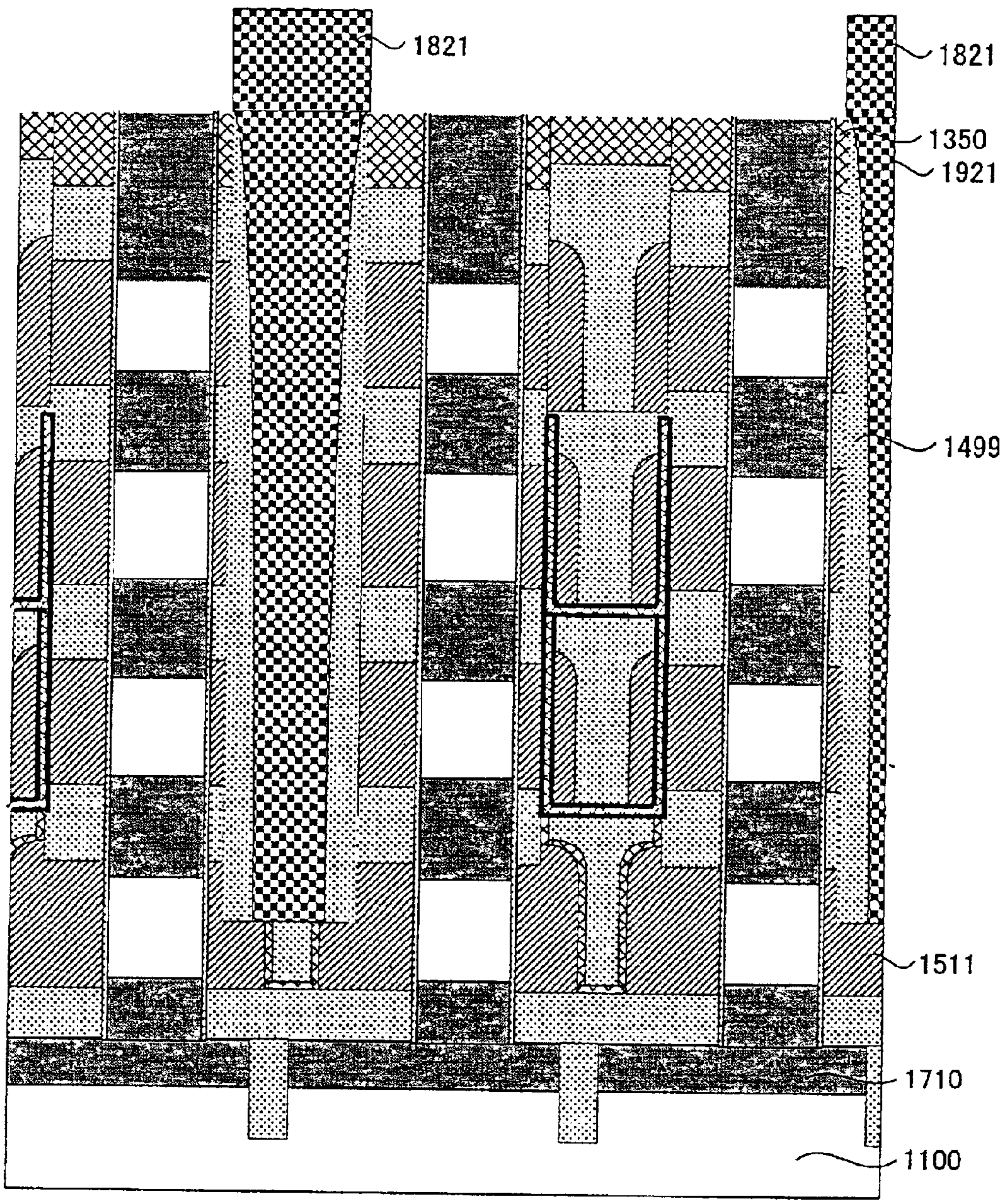

Fig. 1258
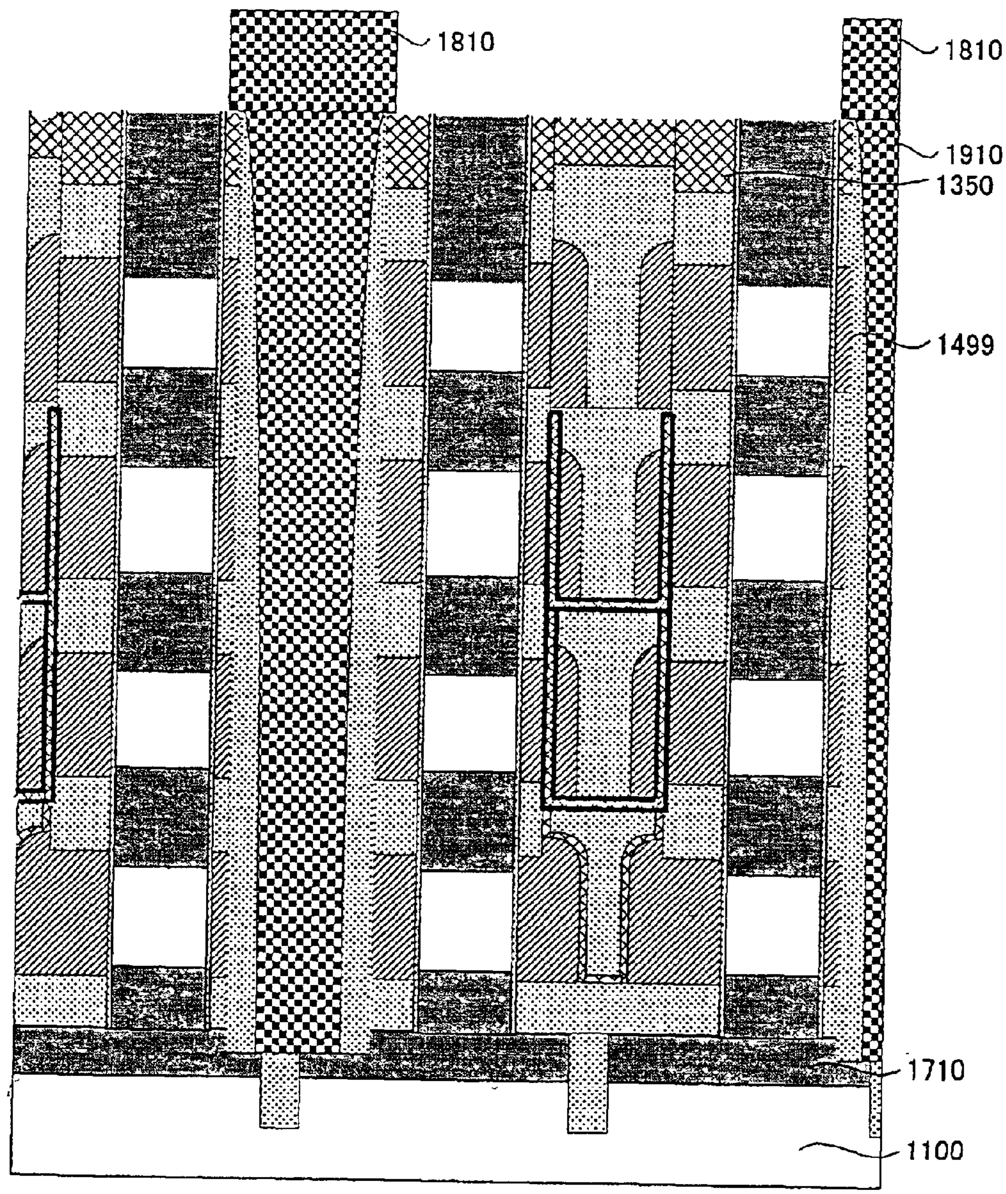

Fig. 1259
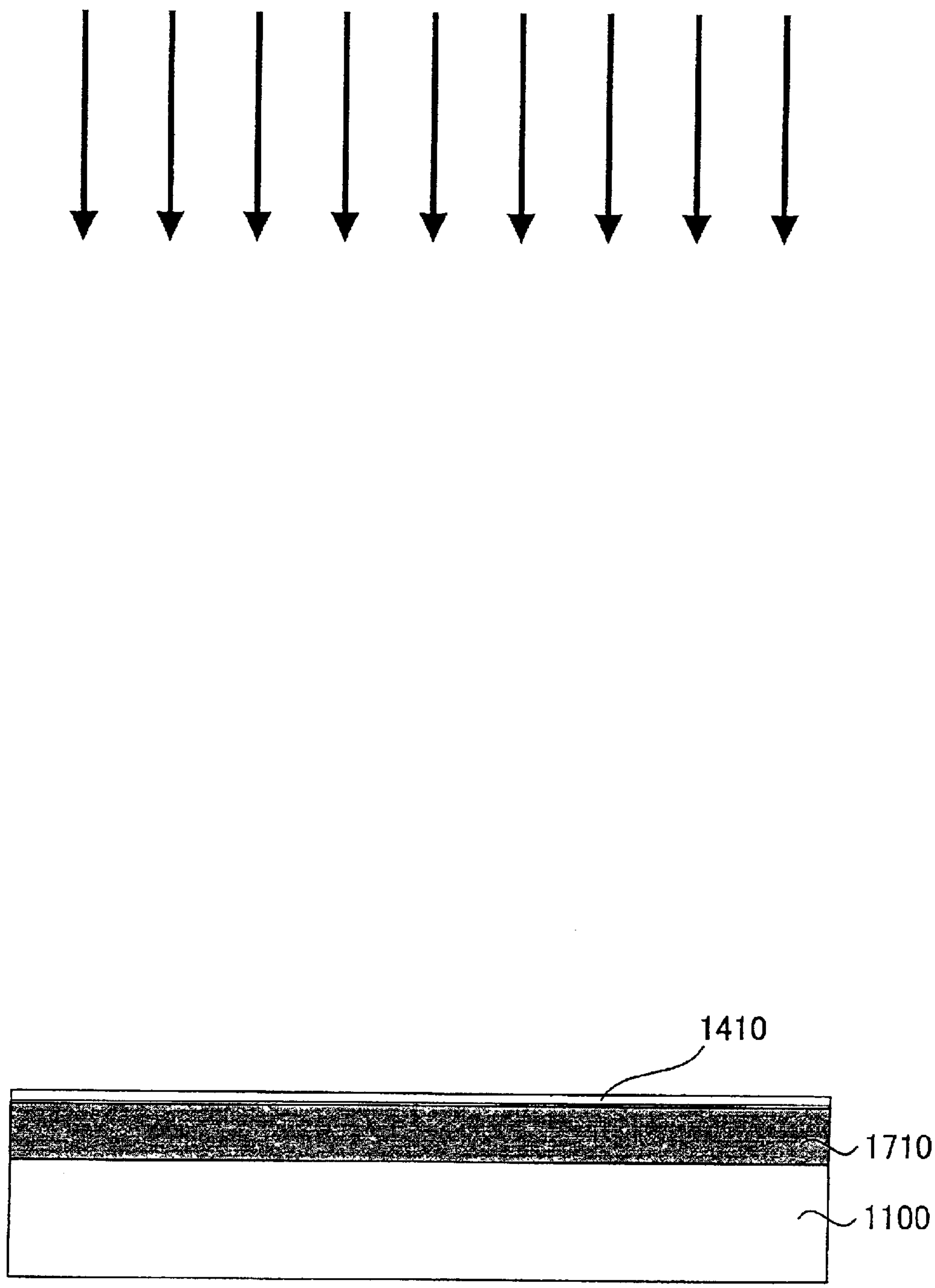

Fig. 1260
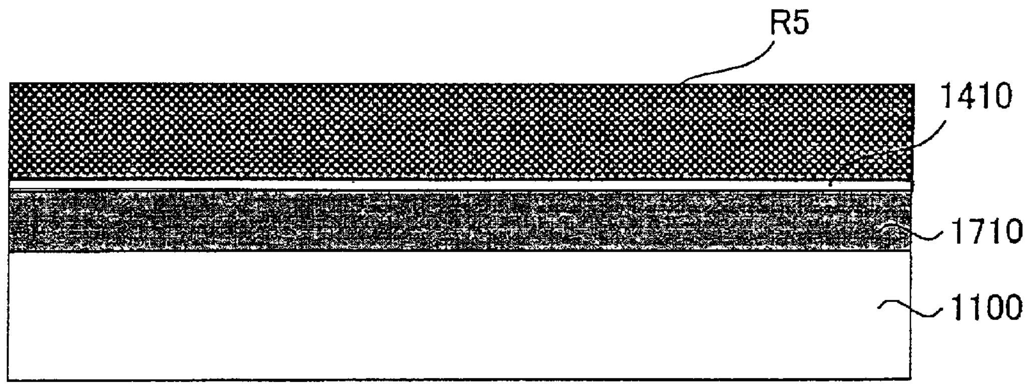
Fig. 1261
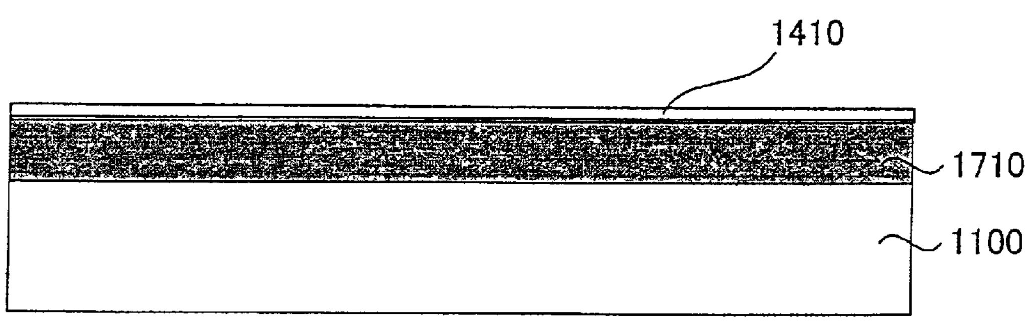

Fig. 1262
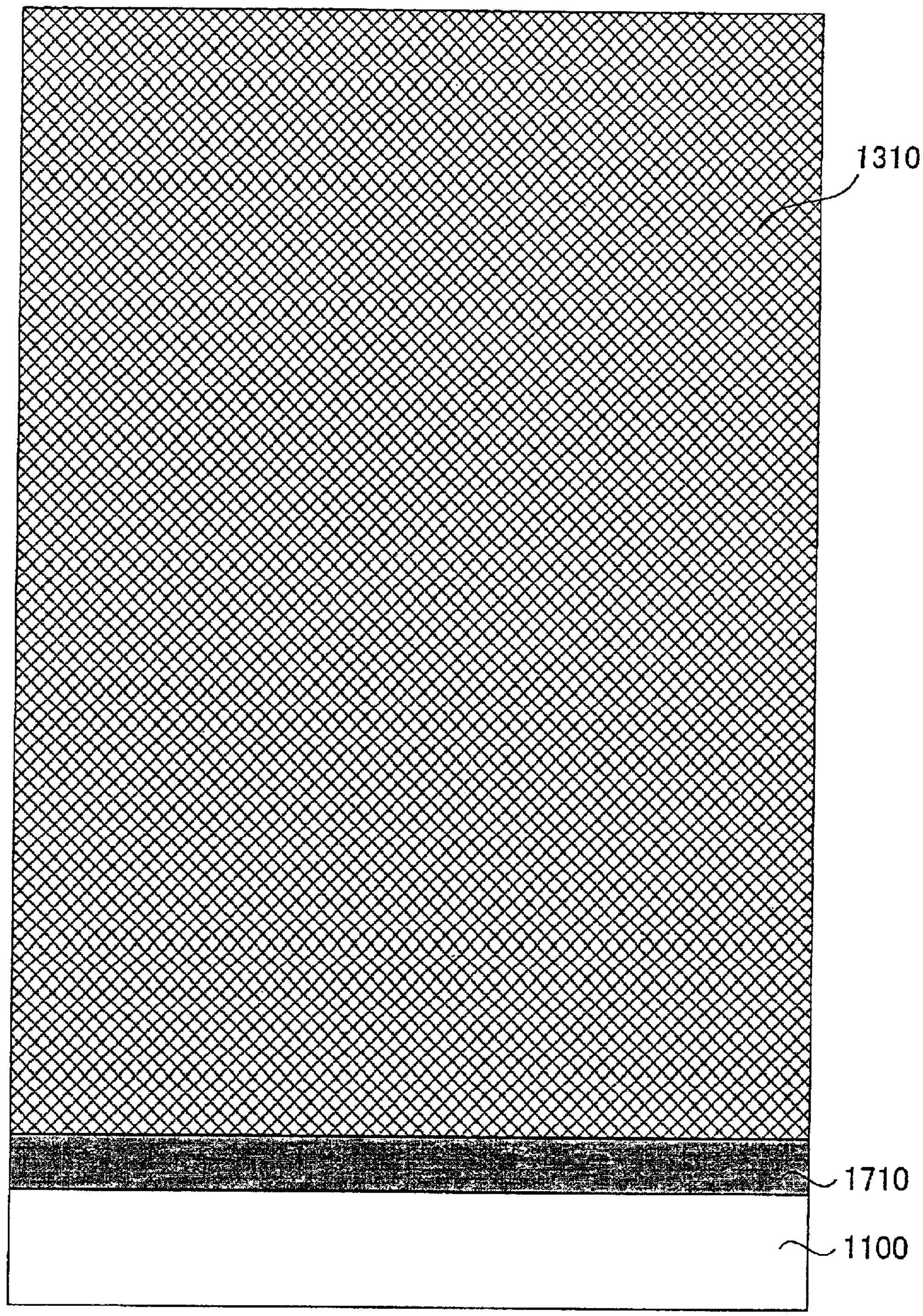

Fig. 1263
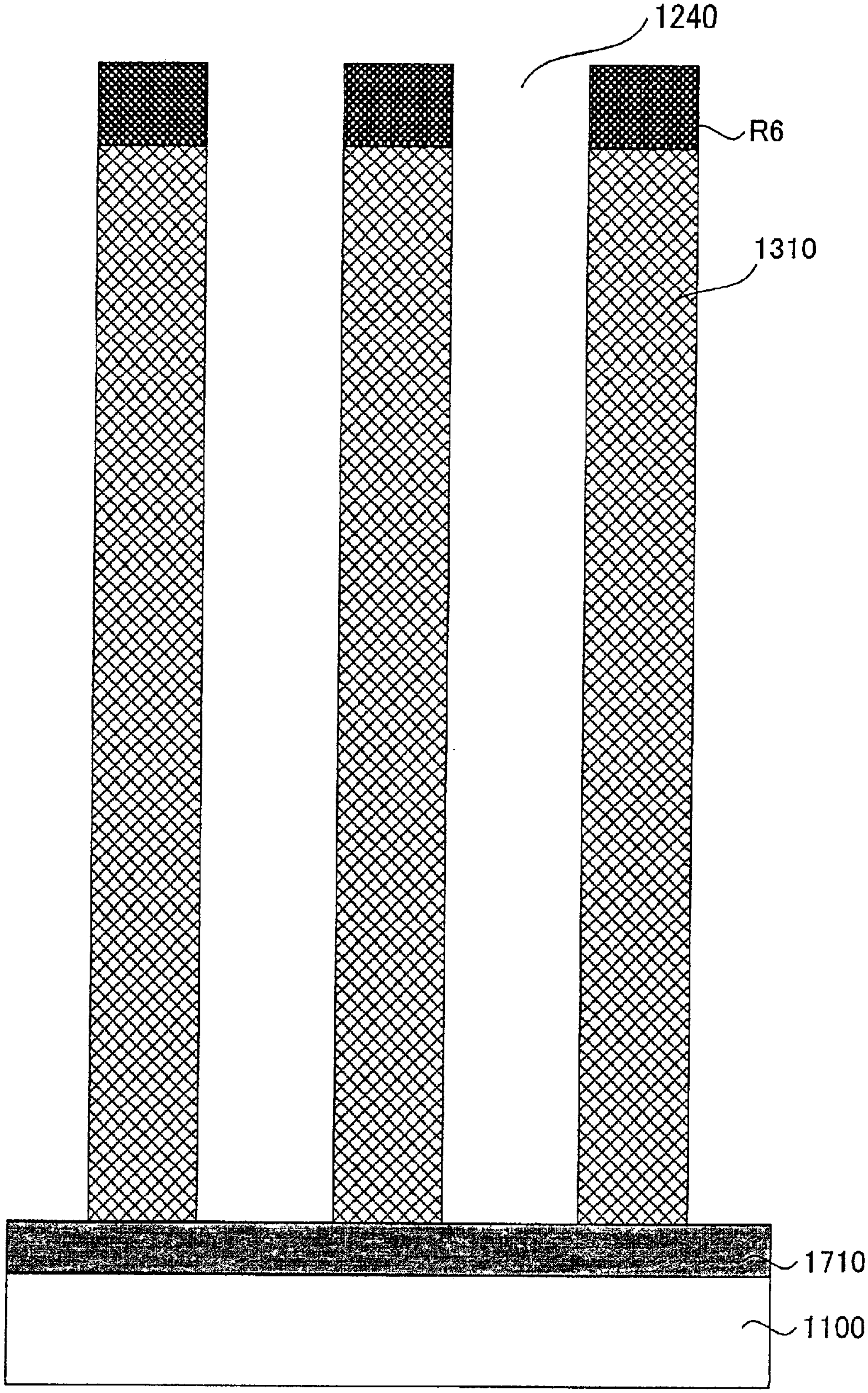

Fig. 1264
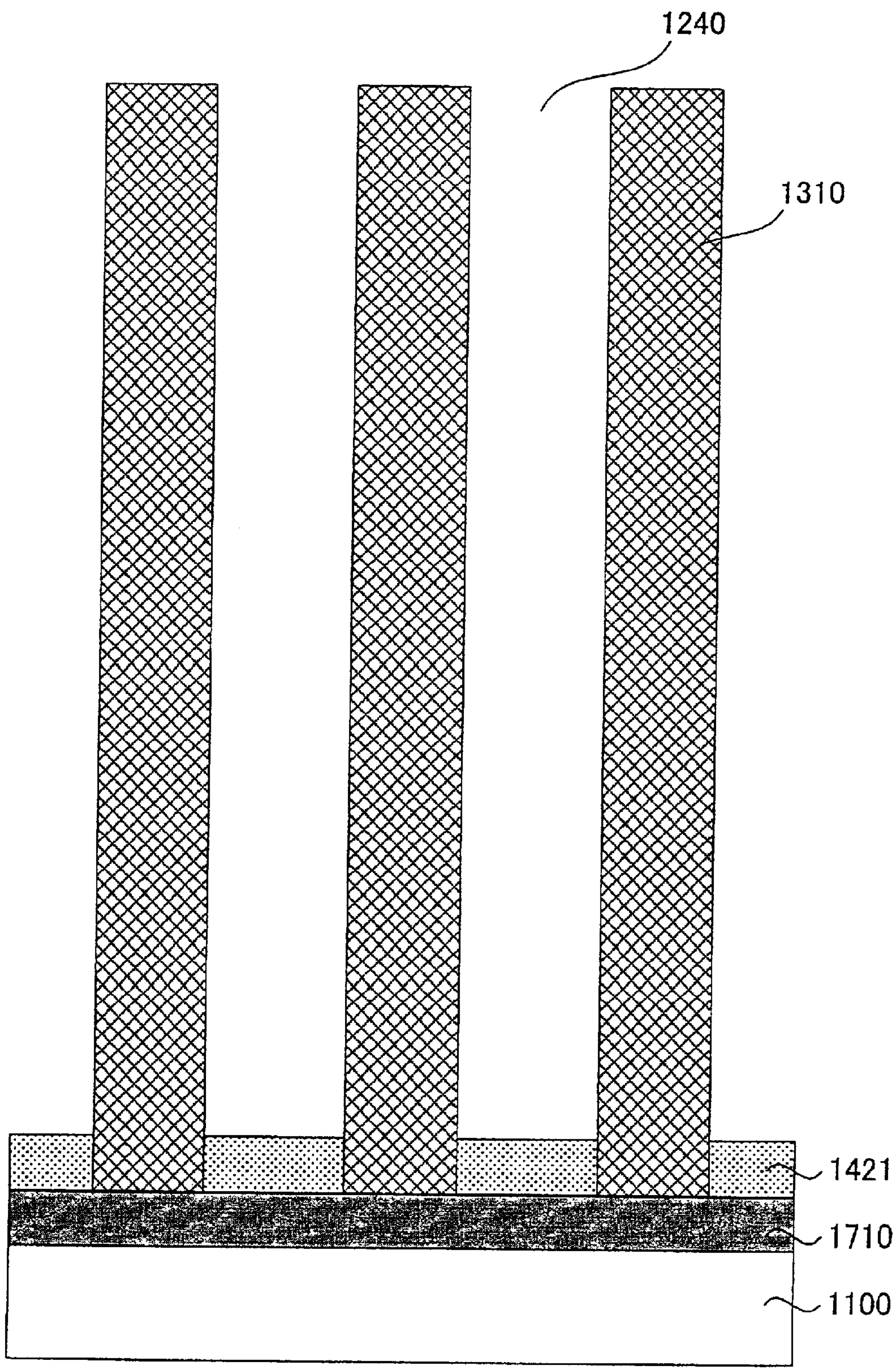

Fig. 1265
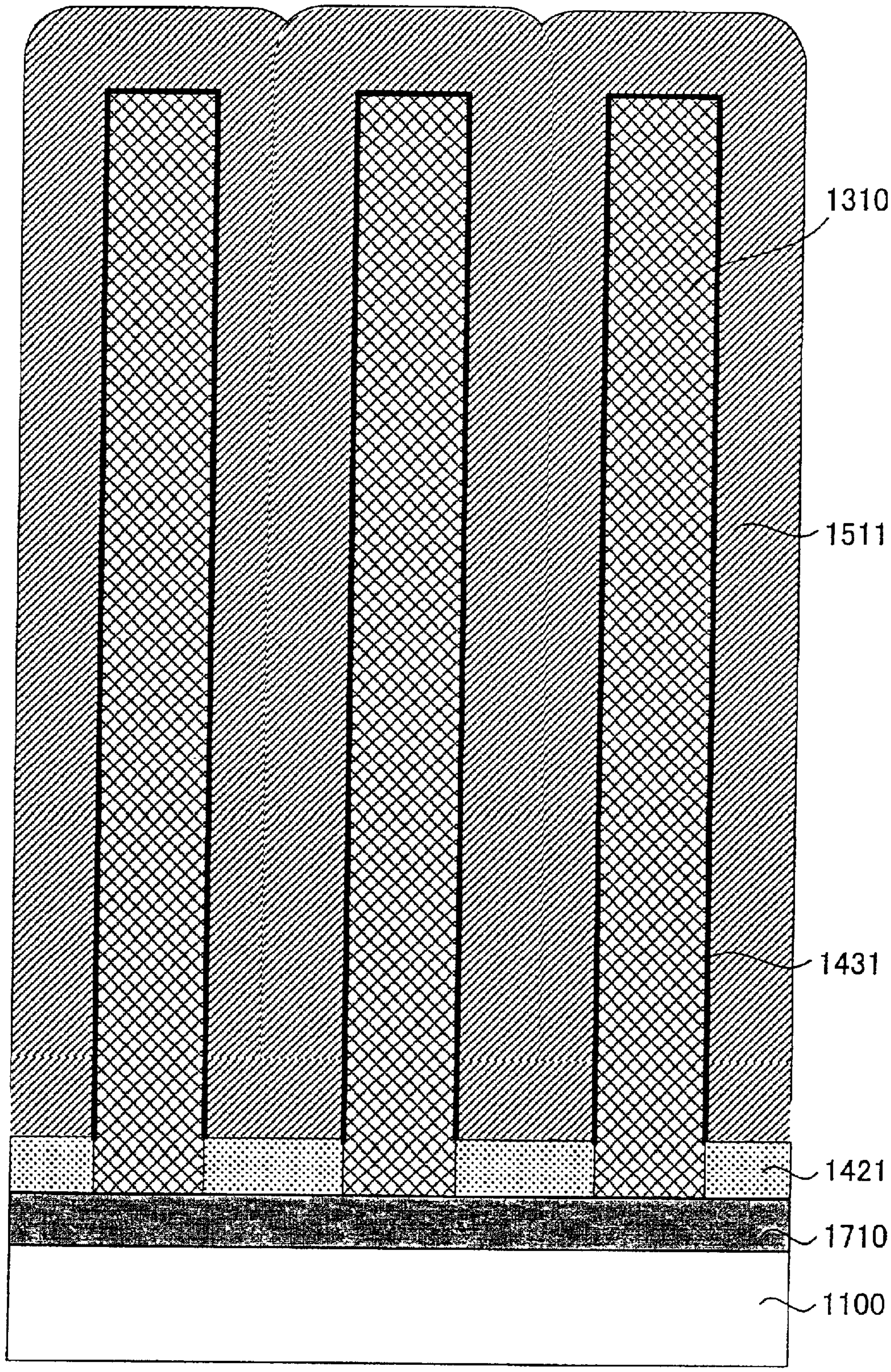

Fig. 1266
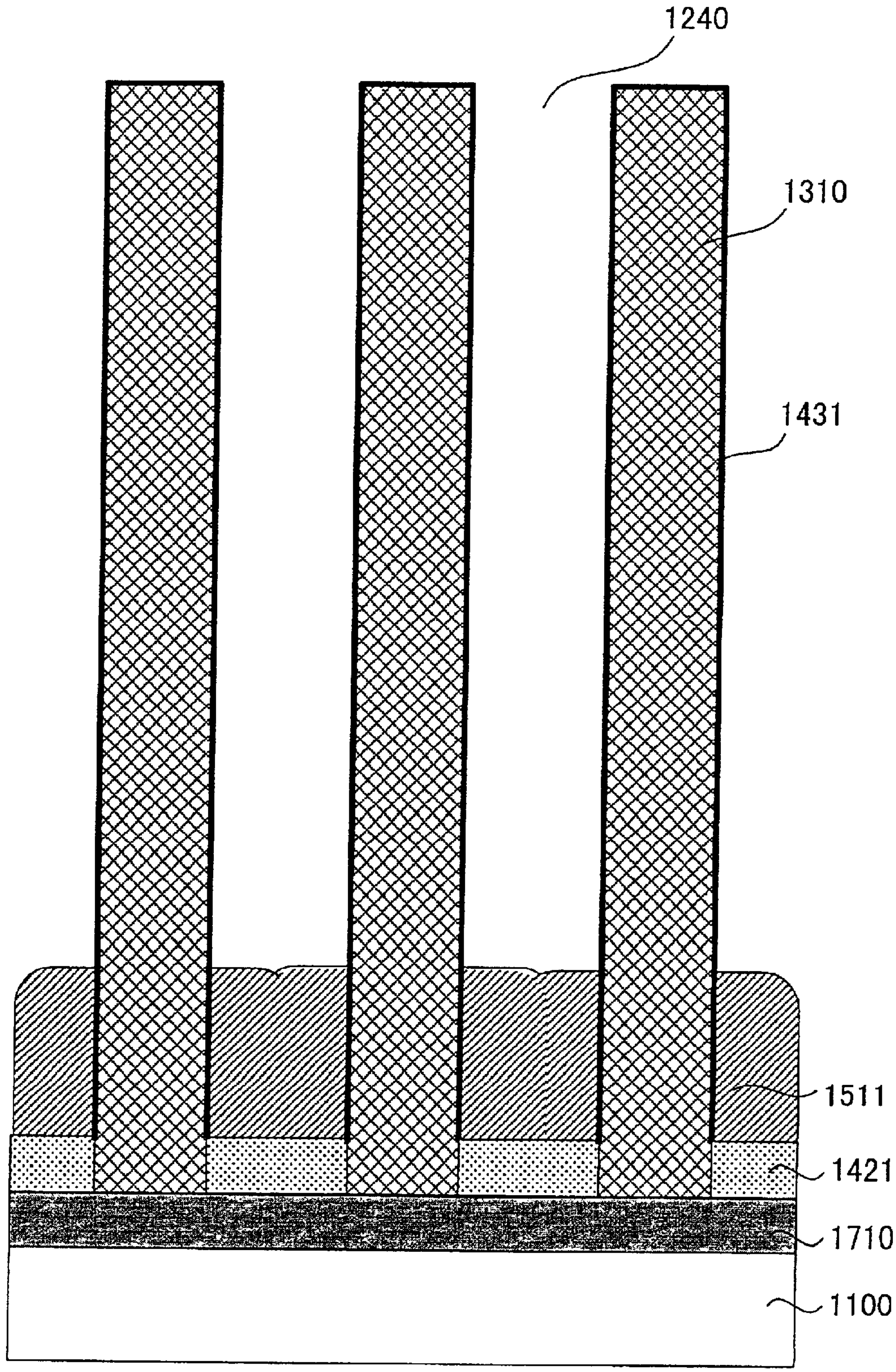

Fig. 1267
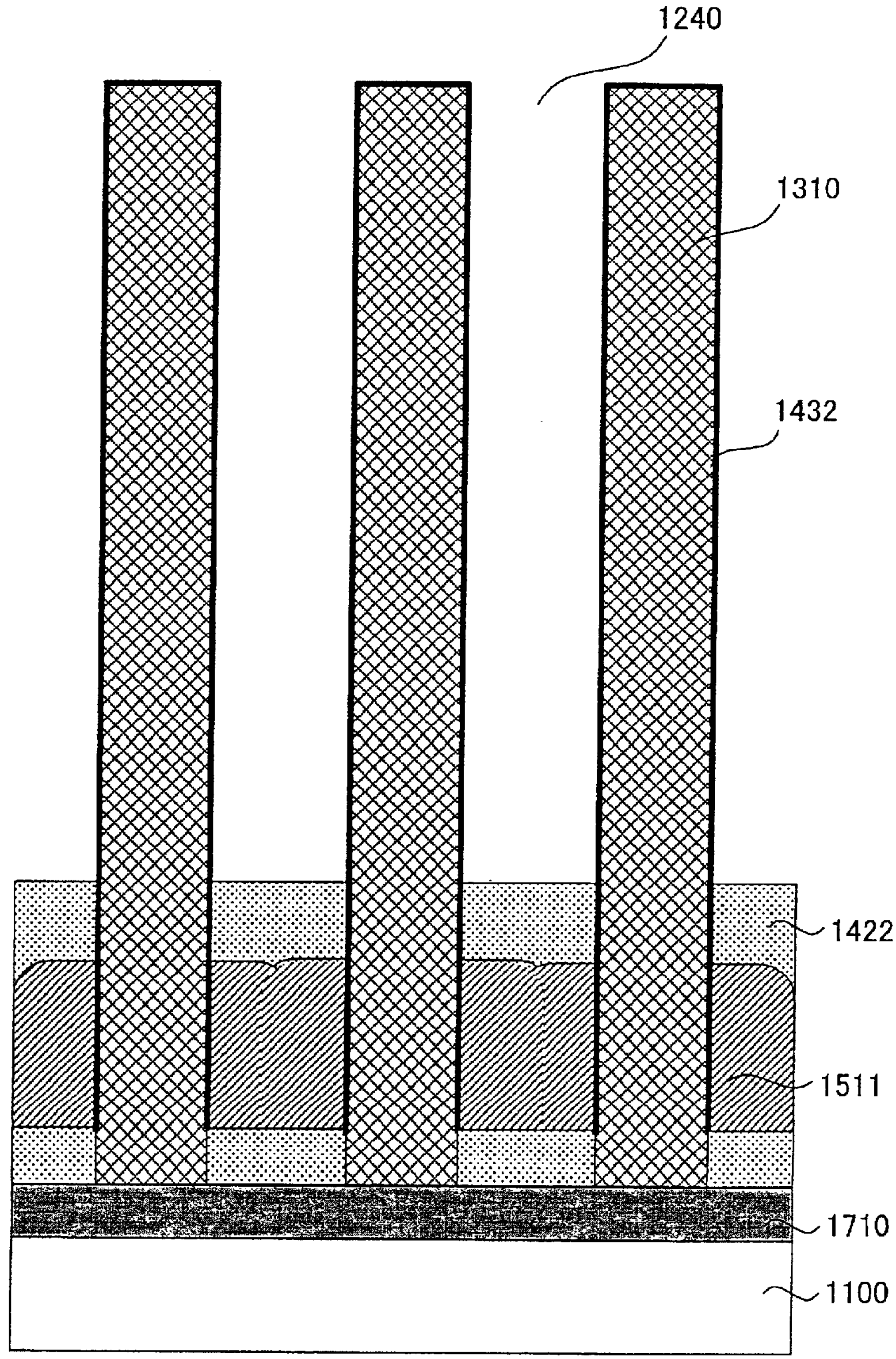

Fig. 1268
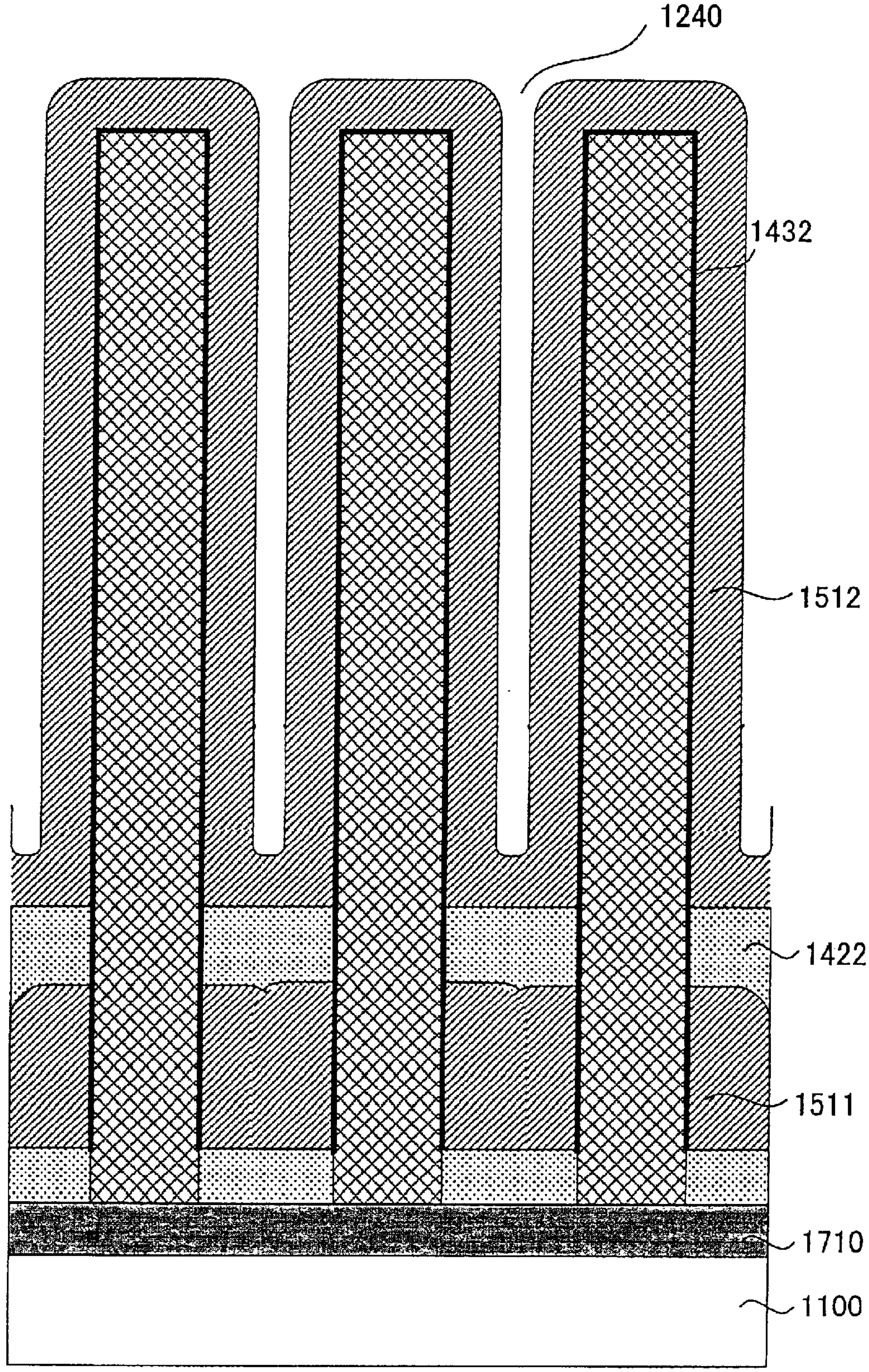

Fig. 1269
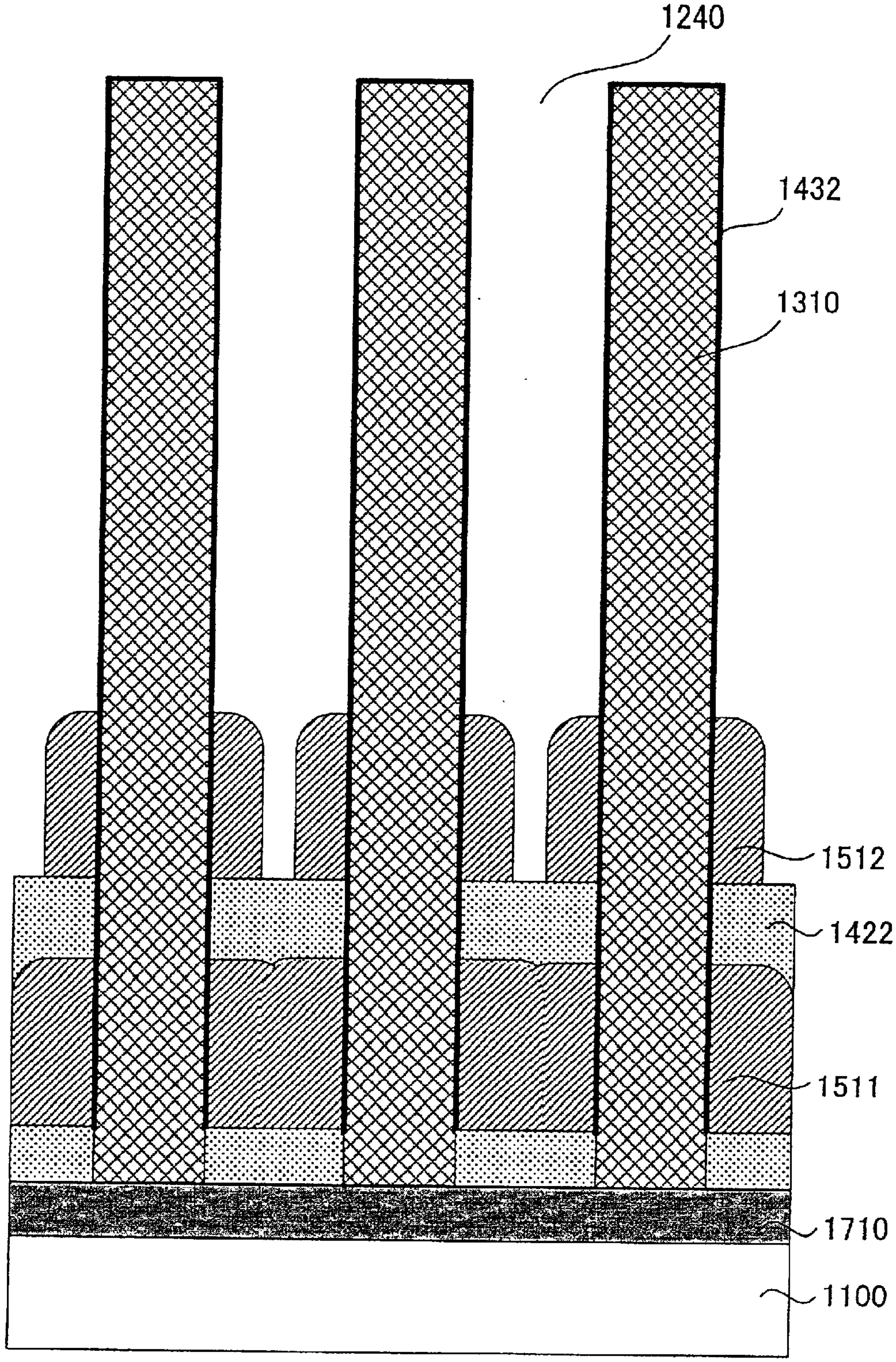

Fig. 1270
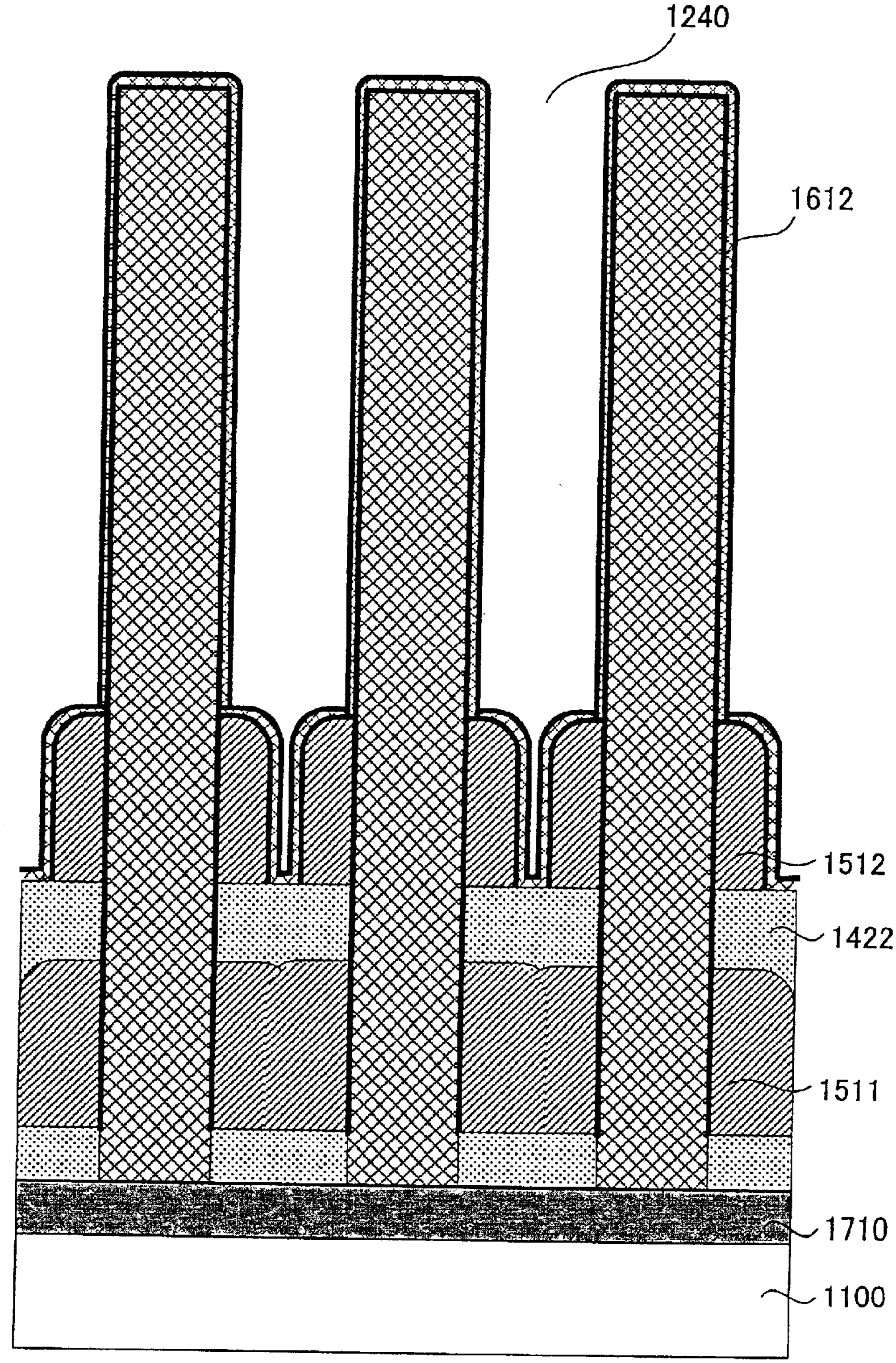

Fig. 1271
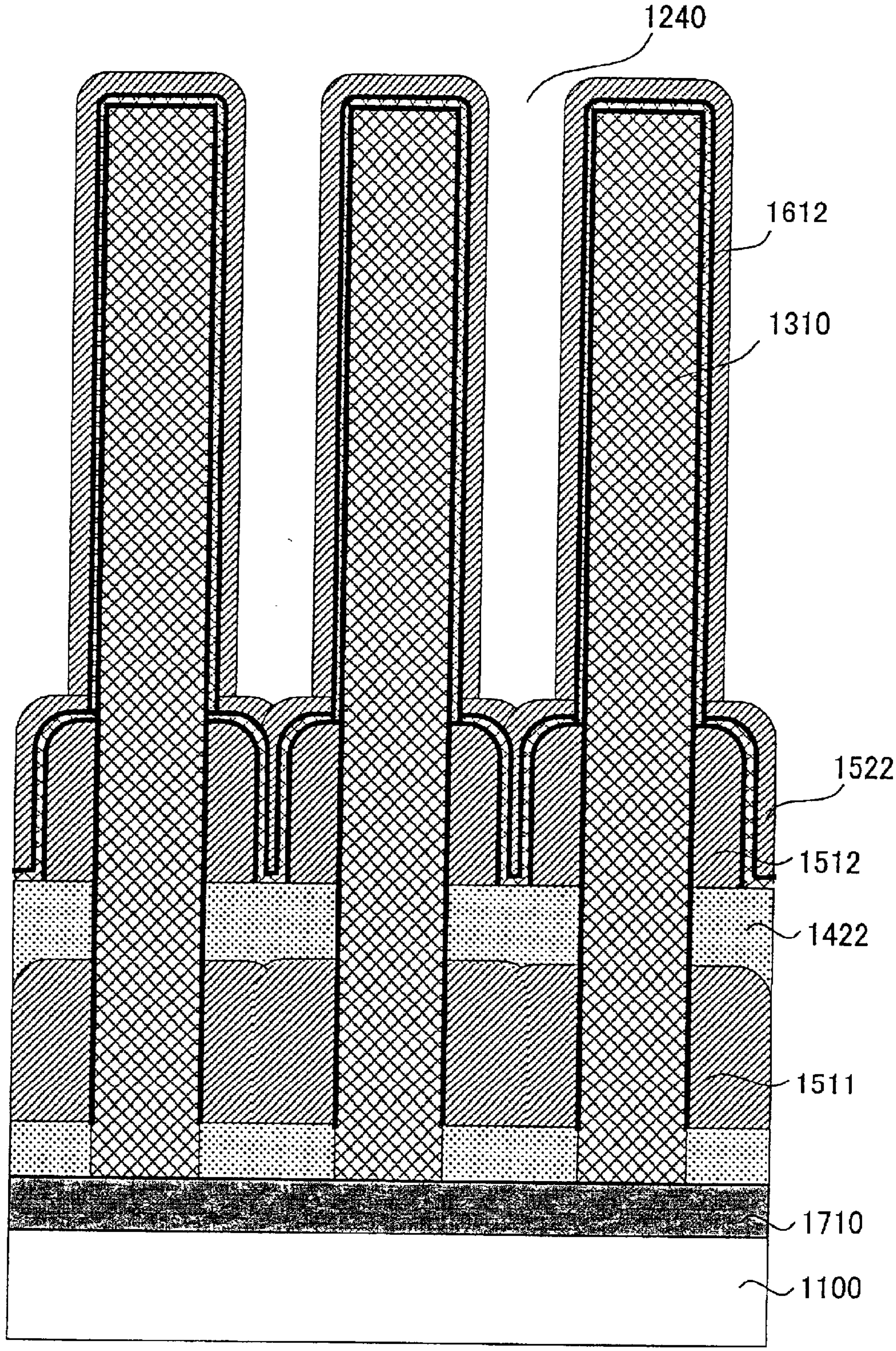

Fig. 1272
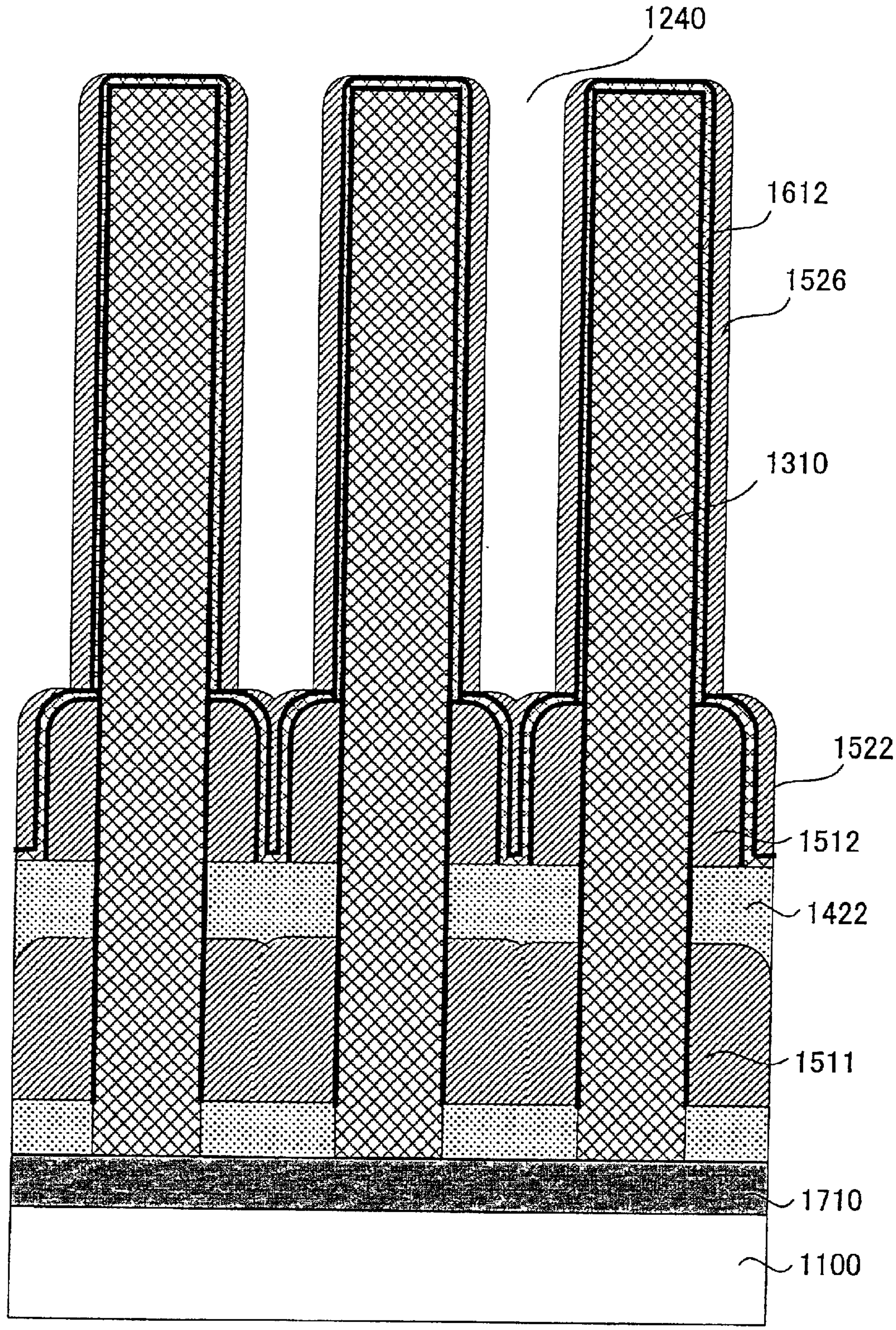

Fig. 1273
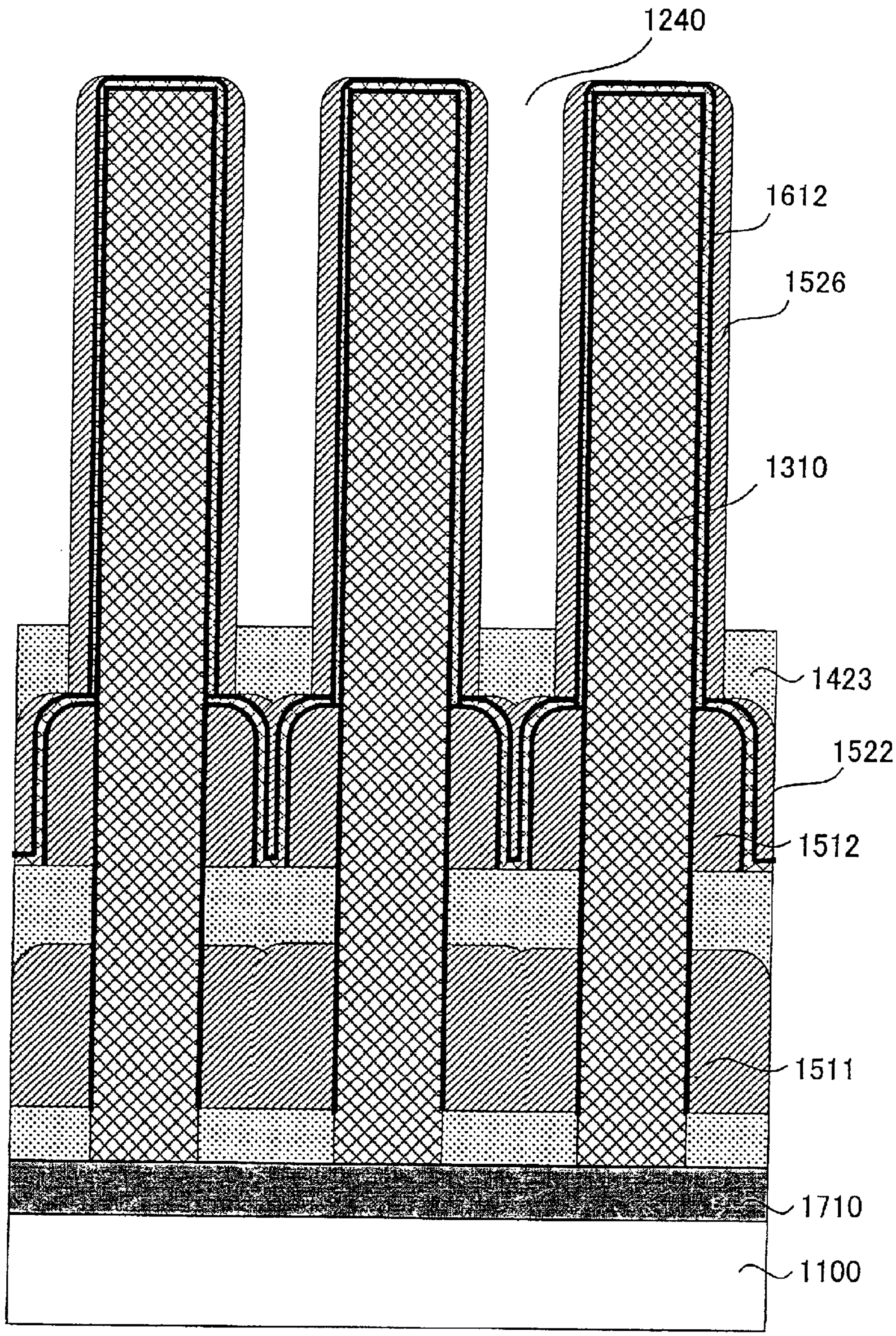

Fig. 1274
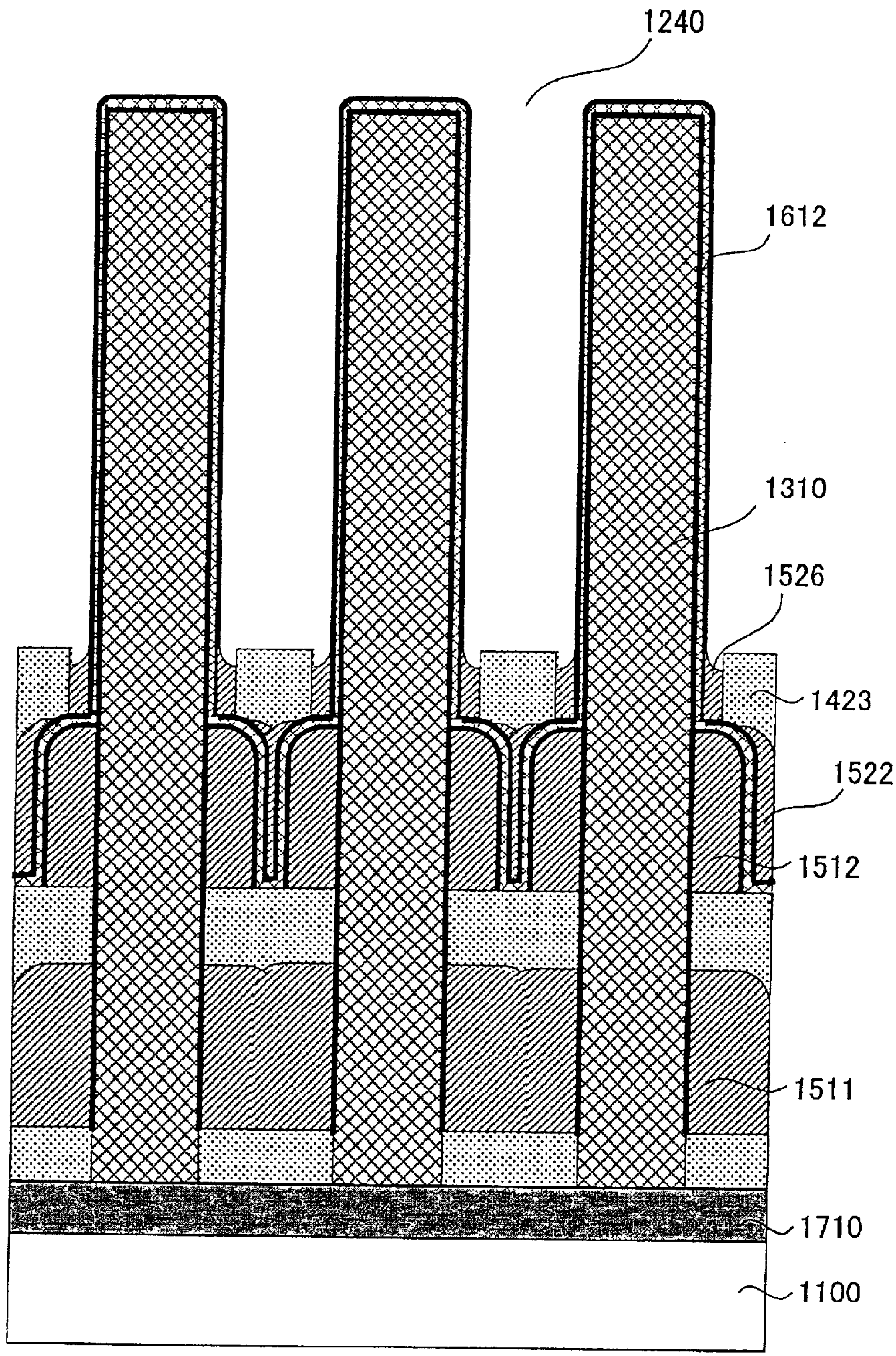

Fig. 1275
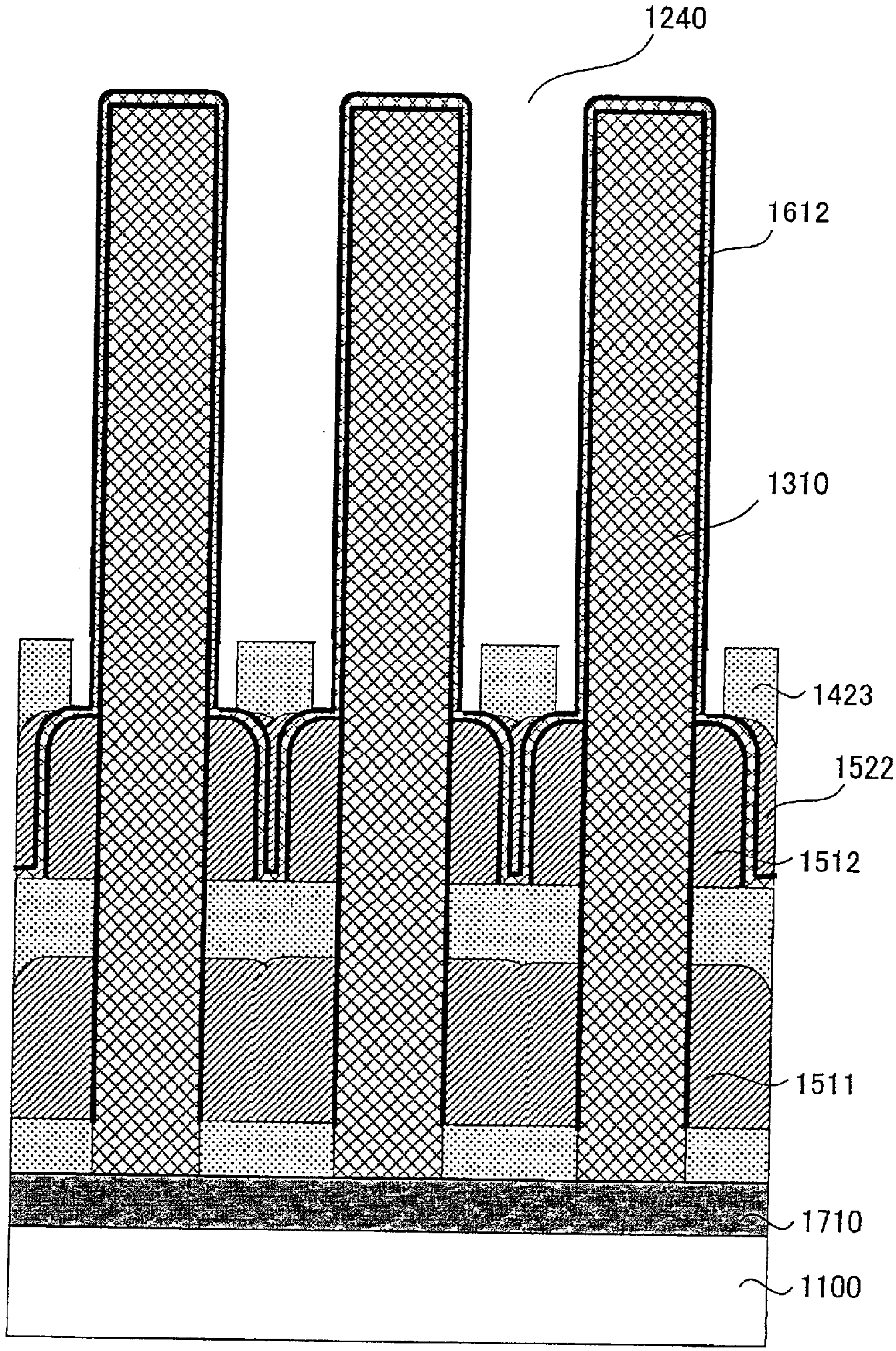

Fig. 1276
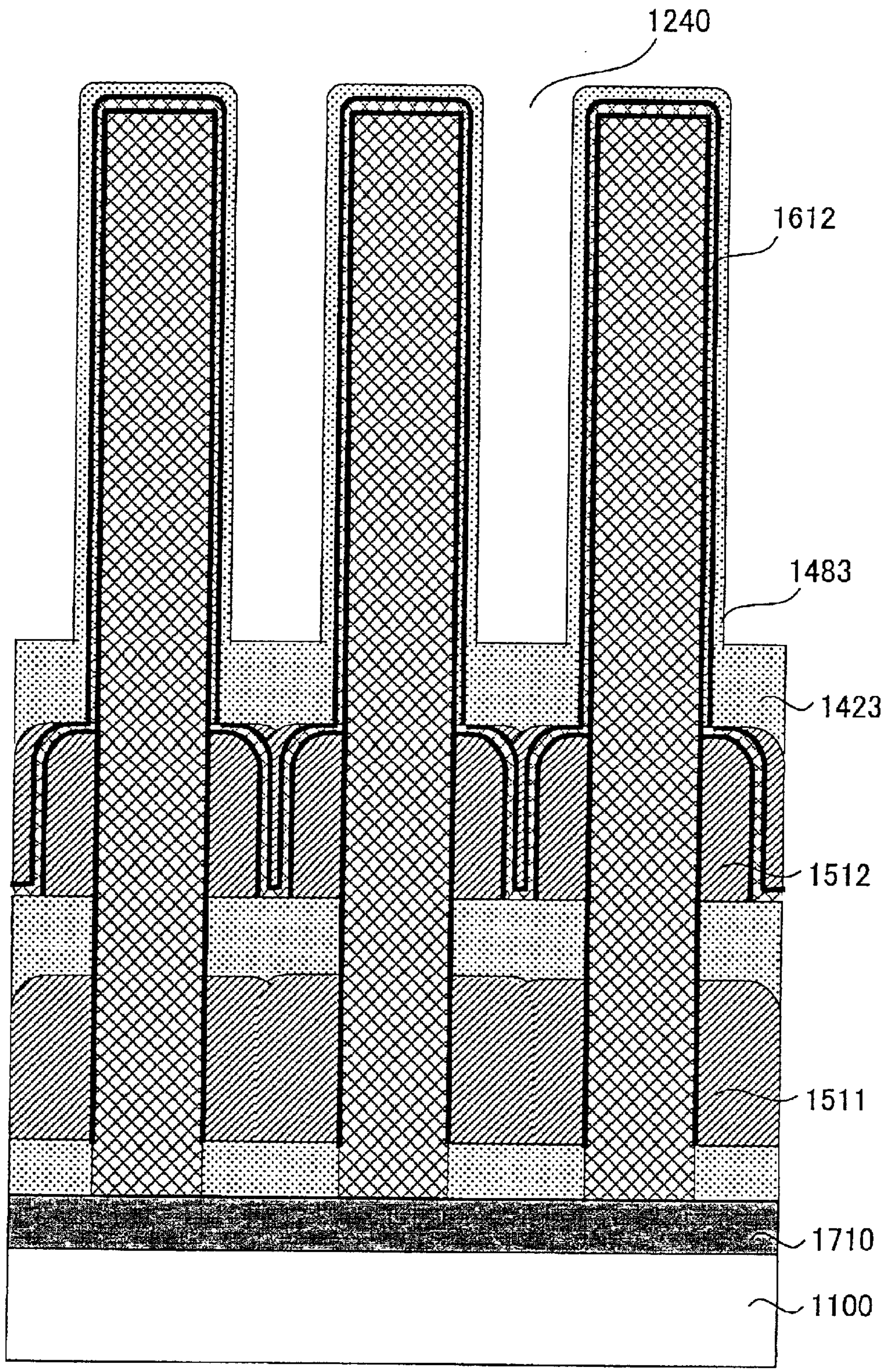

Fig. 1277
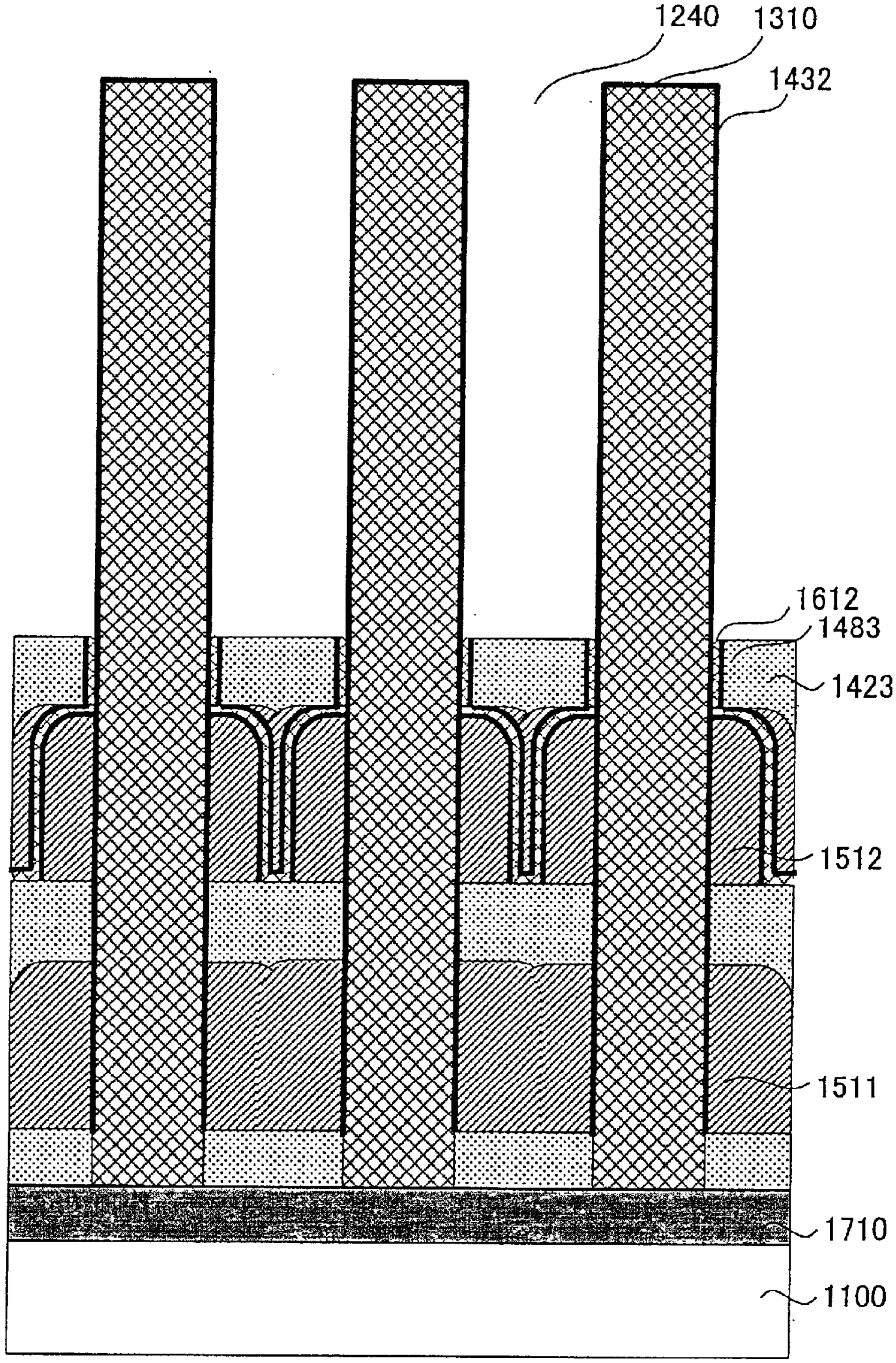

Fig. 1278
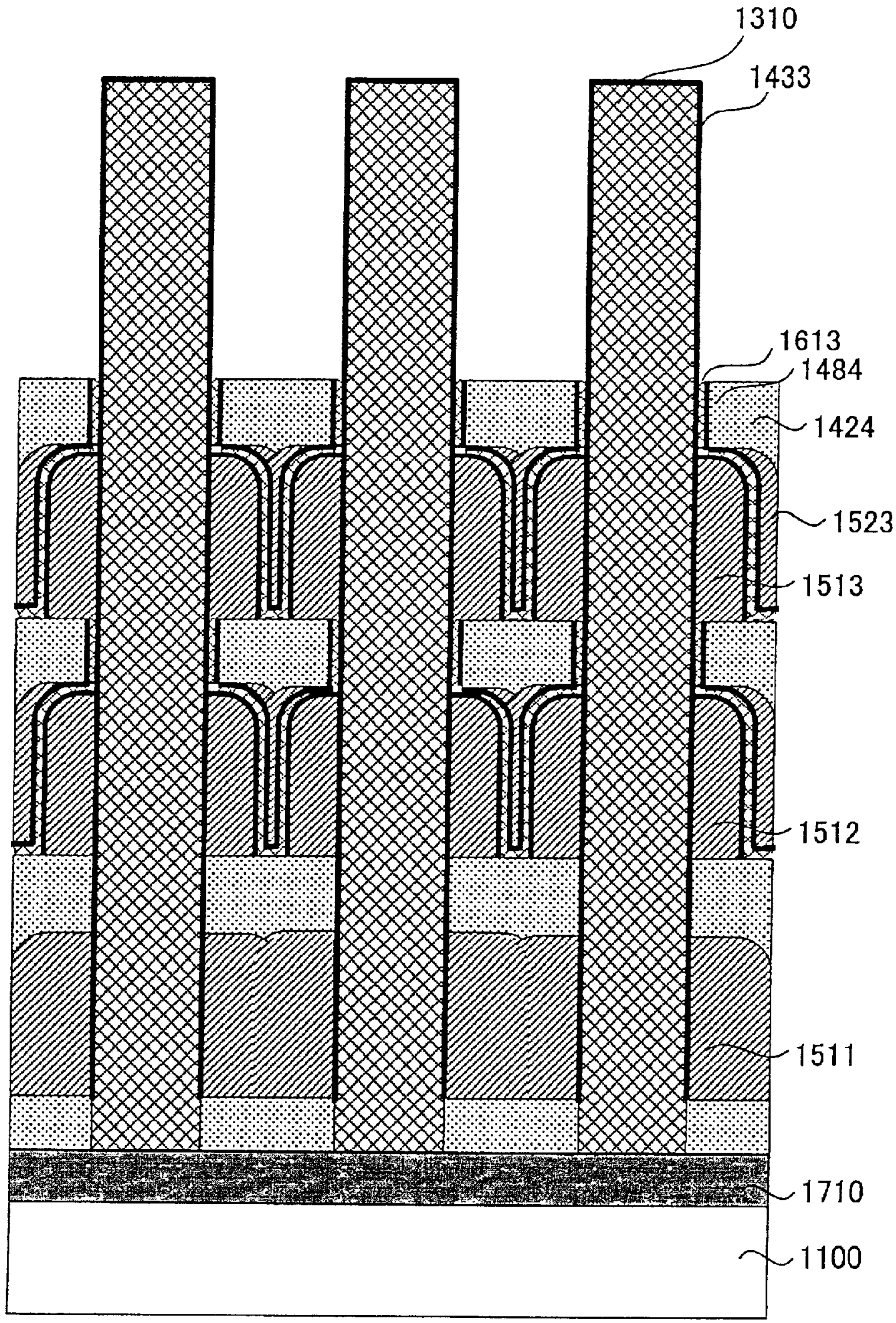

Fig. 1279
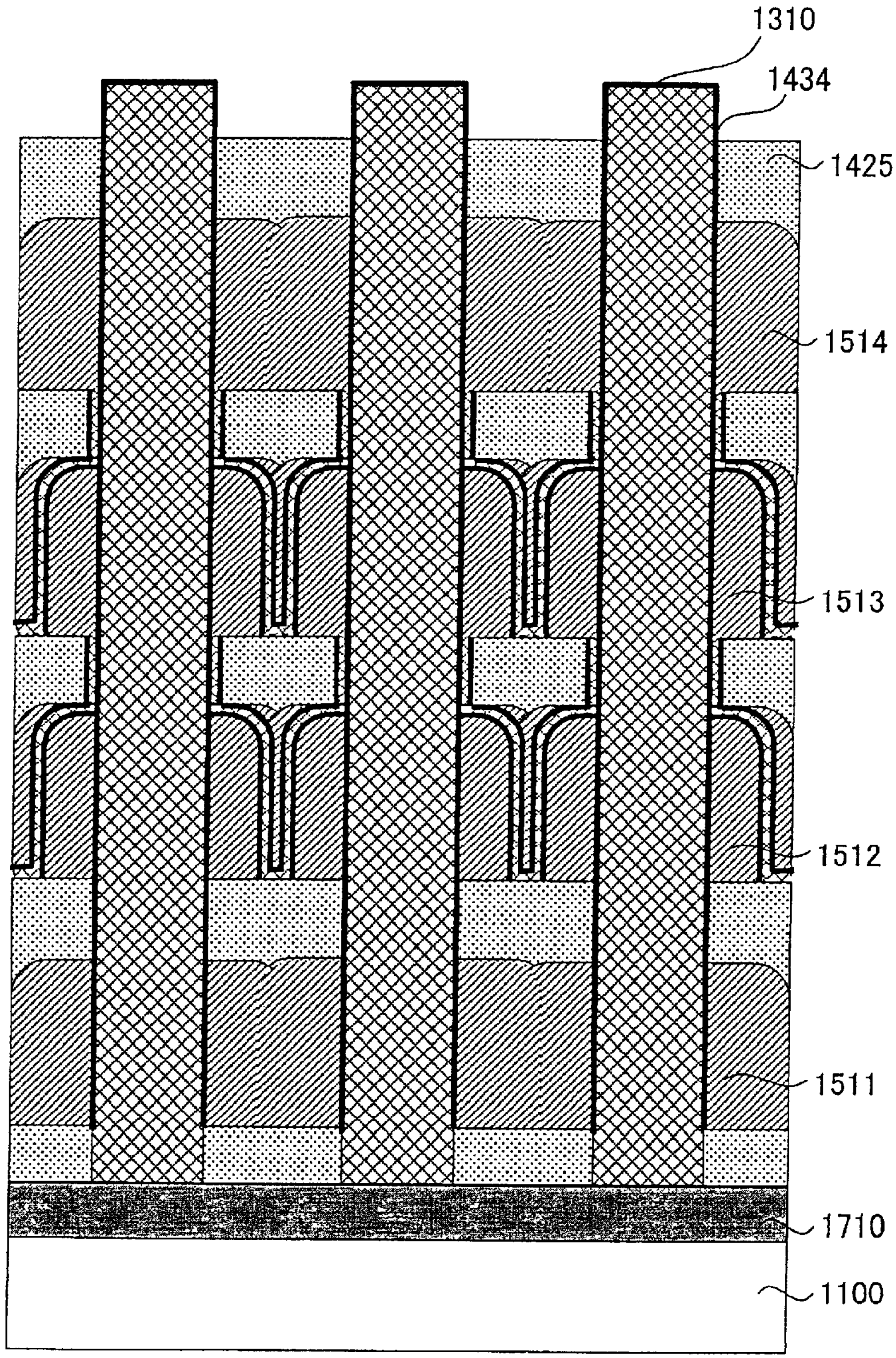

Fig. 1280
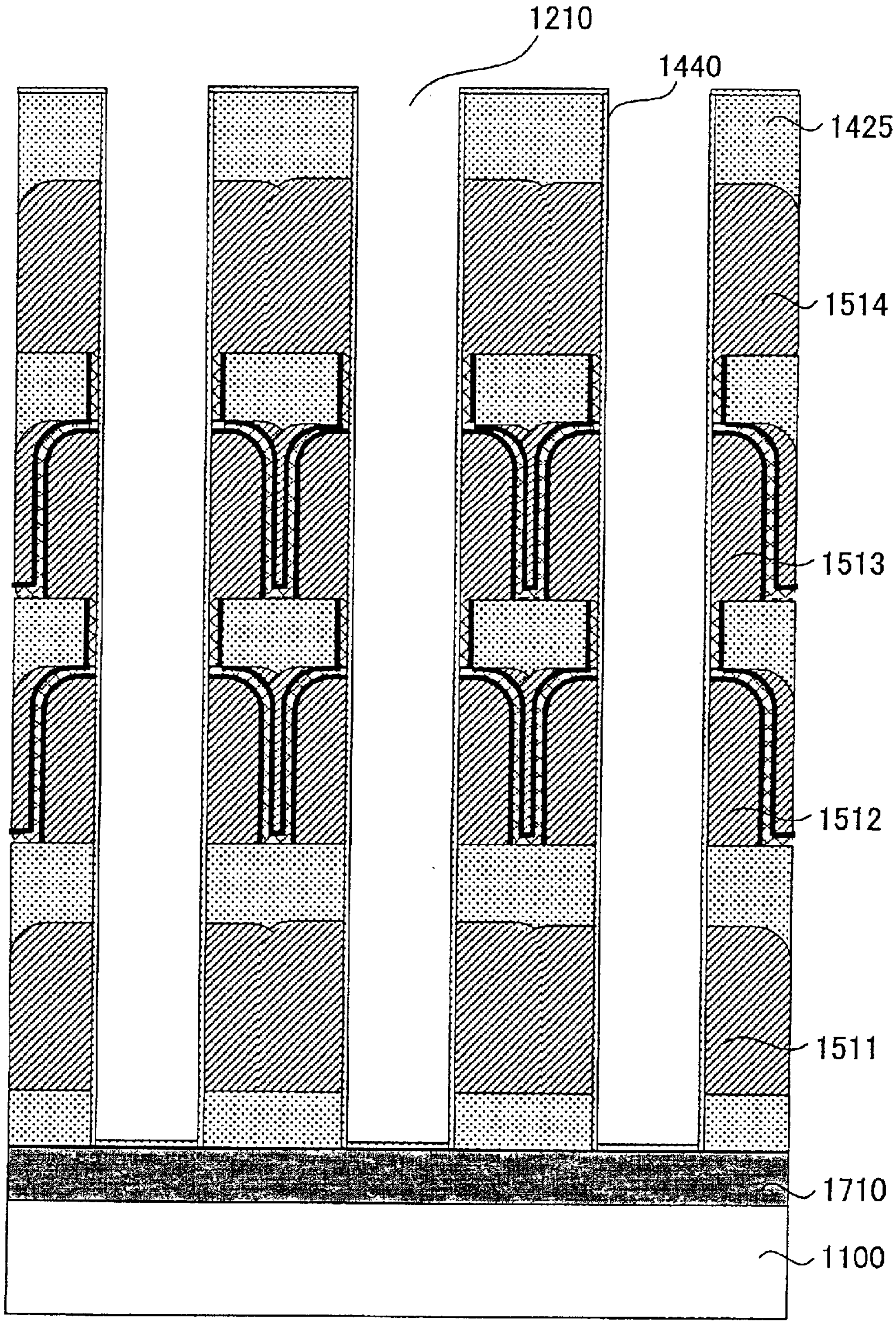

Fig. 1281
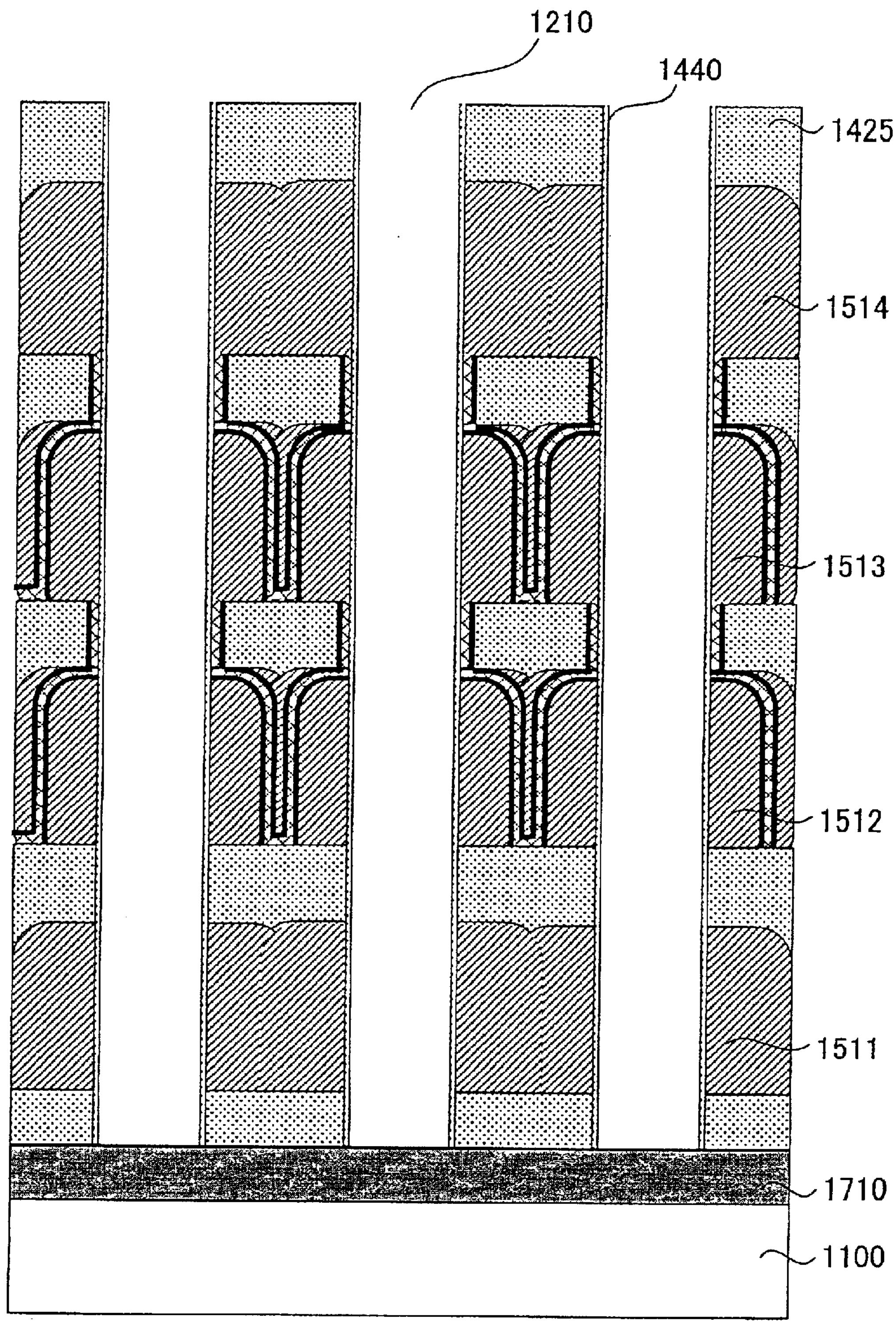

Fig. 1282
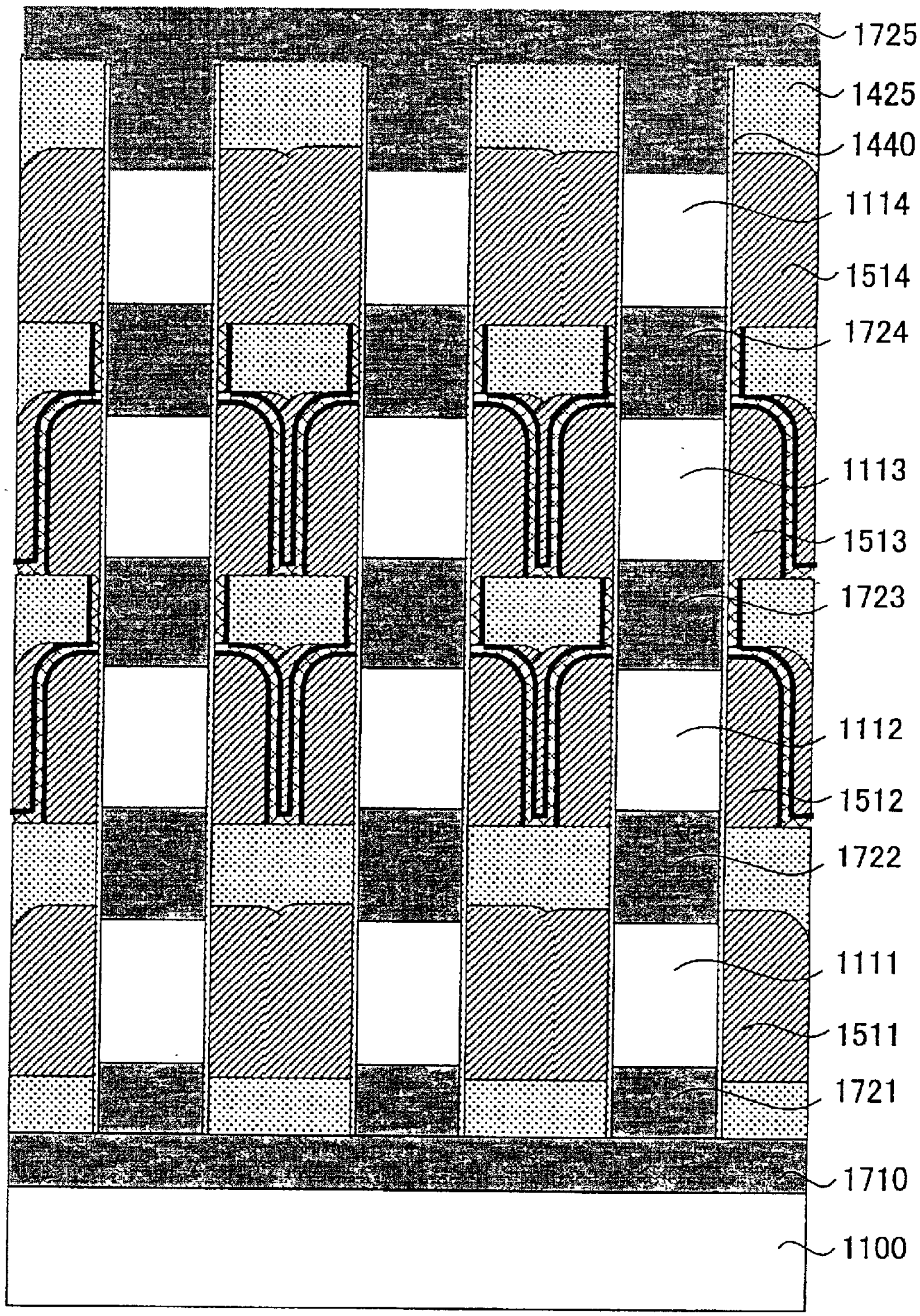

Fig. 1283
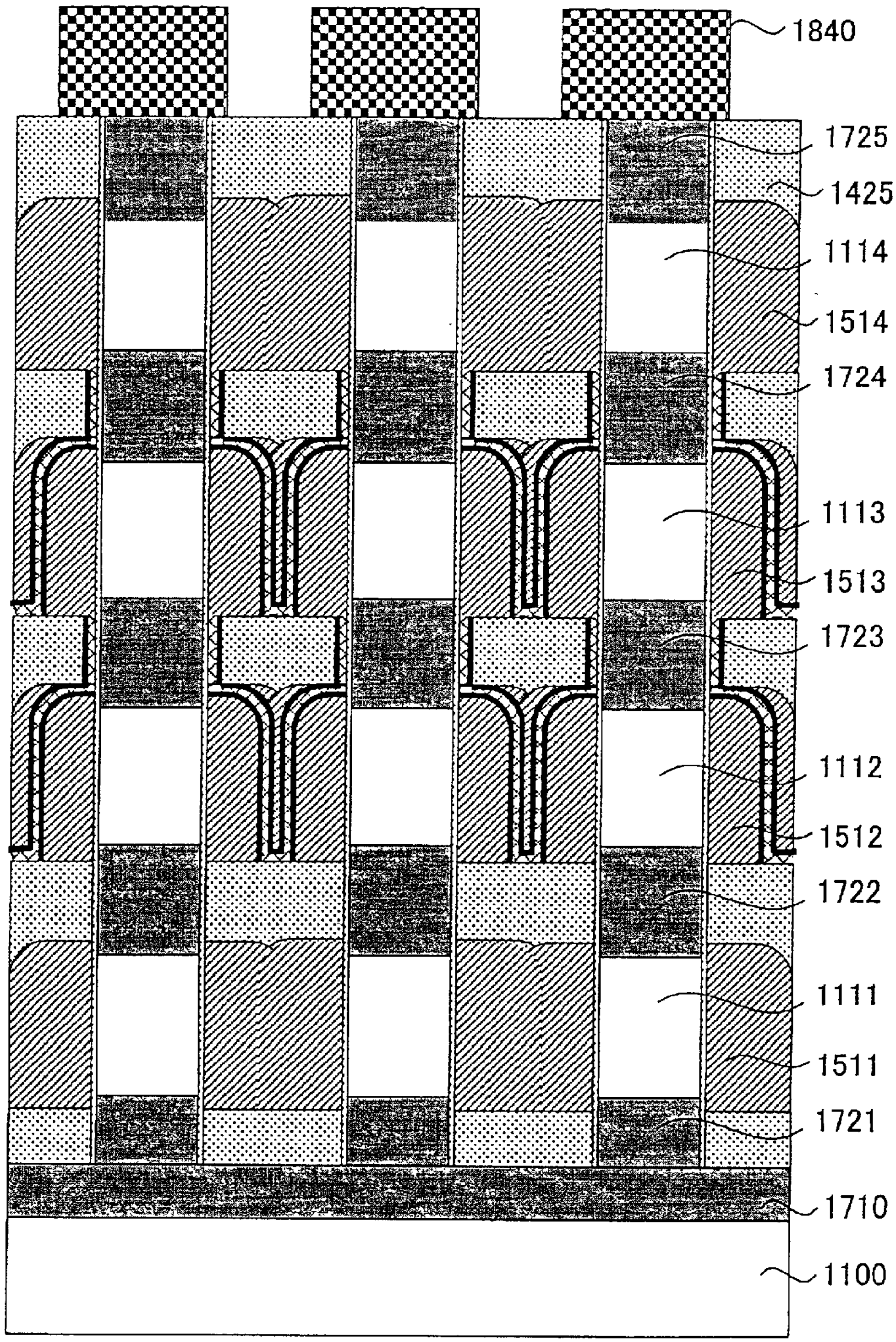

Fig. 1284
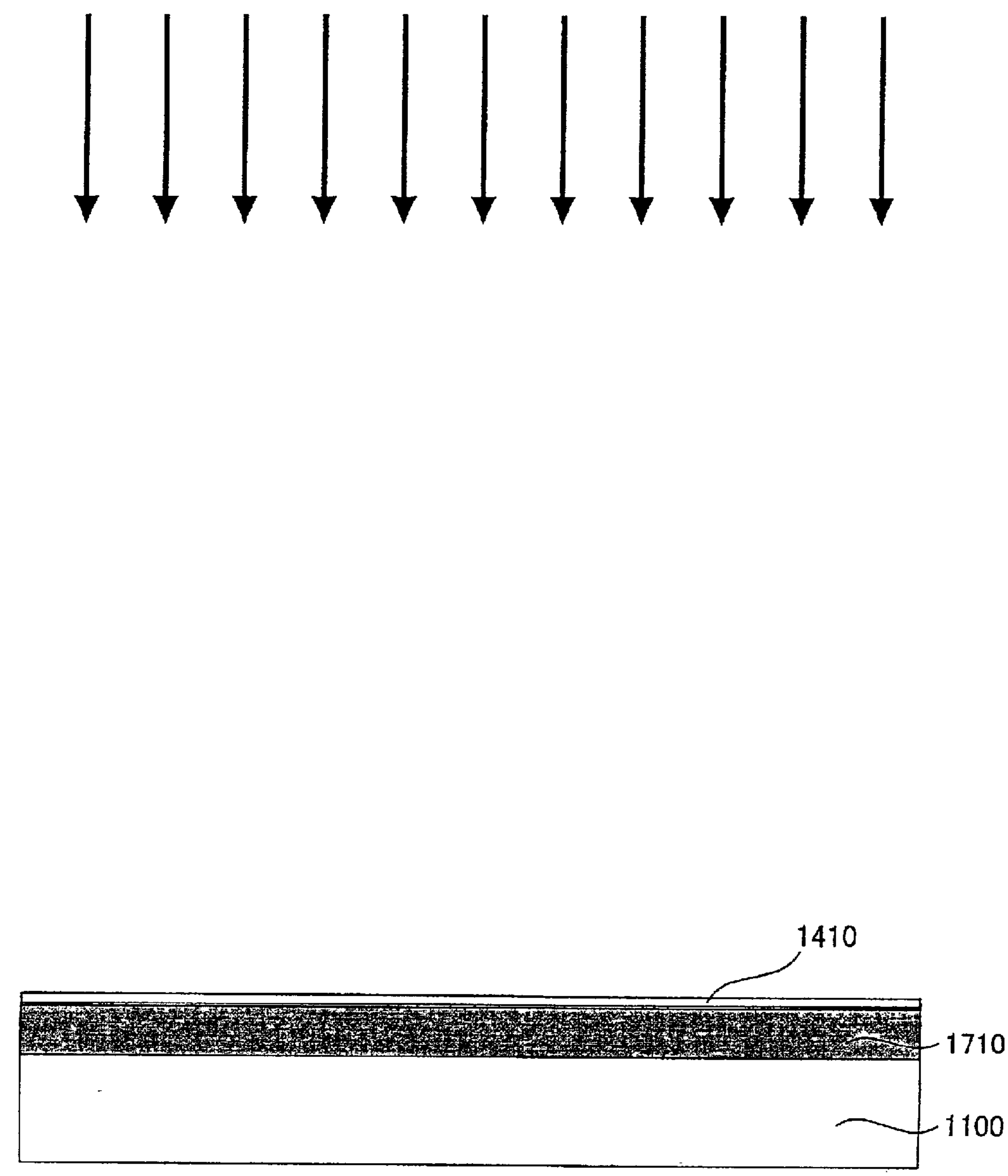

Fig. 1285
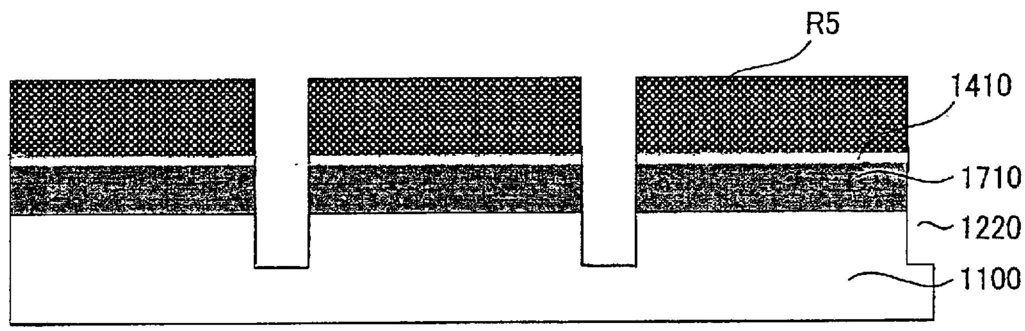
Fig. 1286
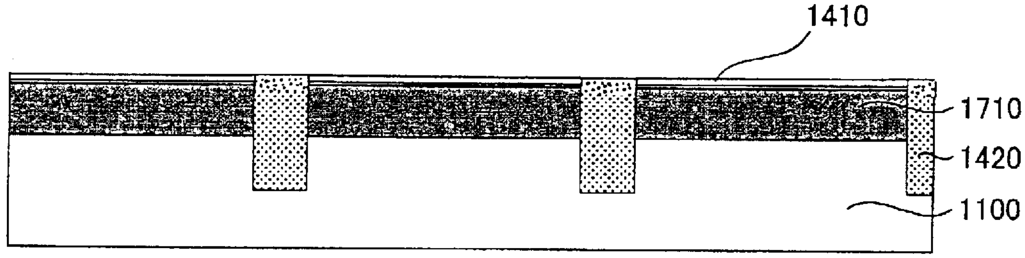

Fig. 1287
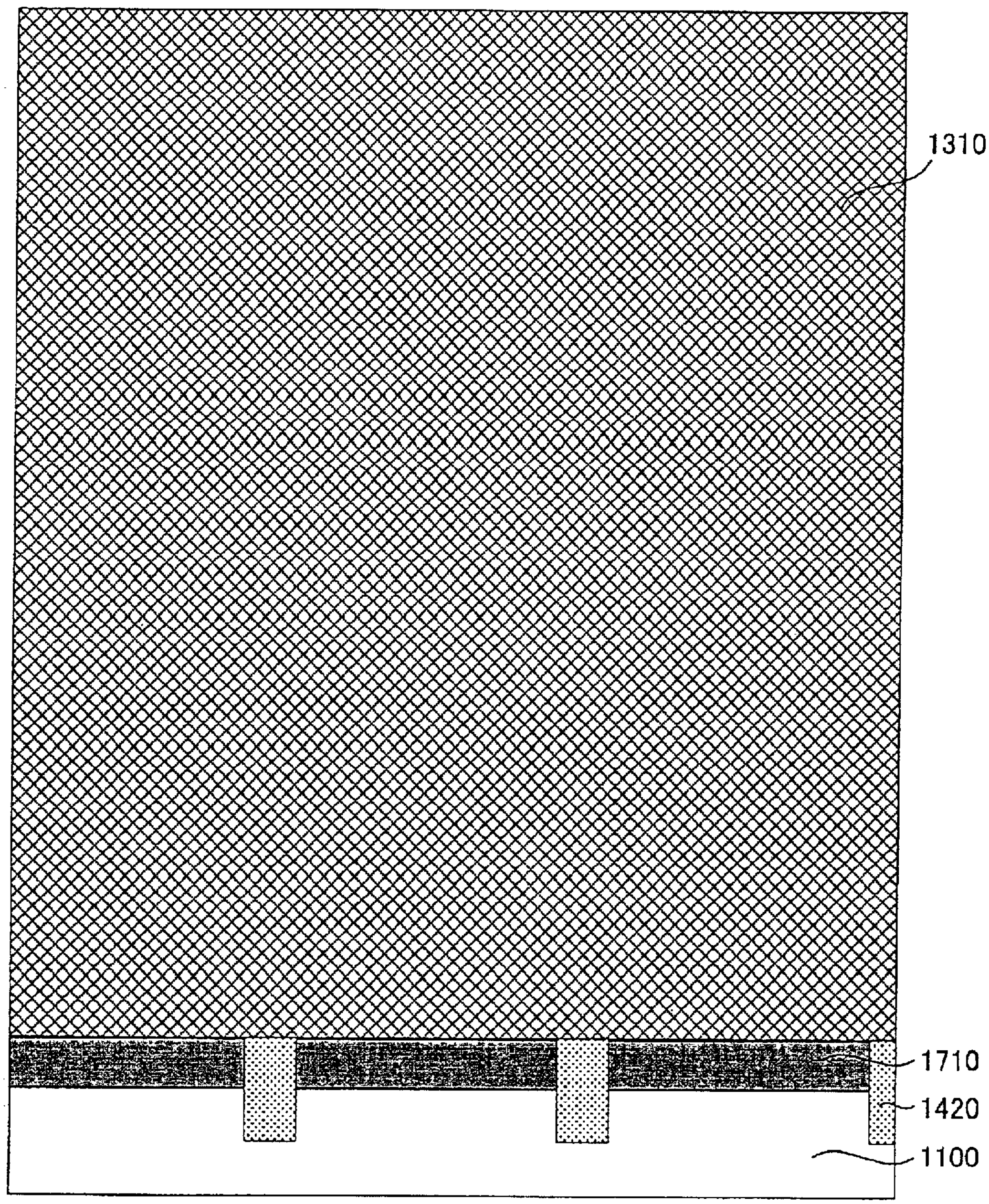

Fig. 1288
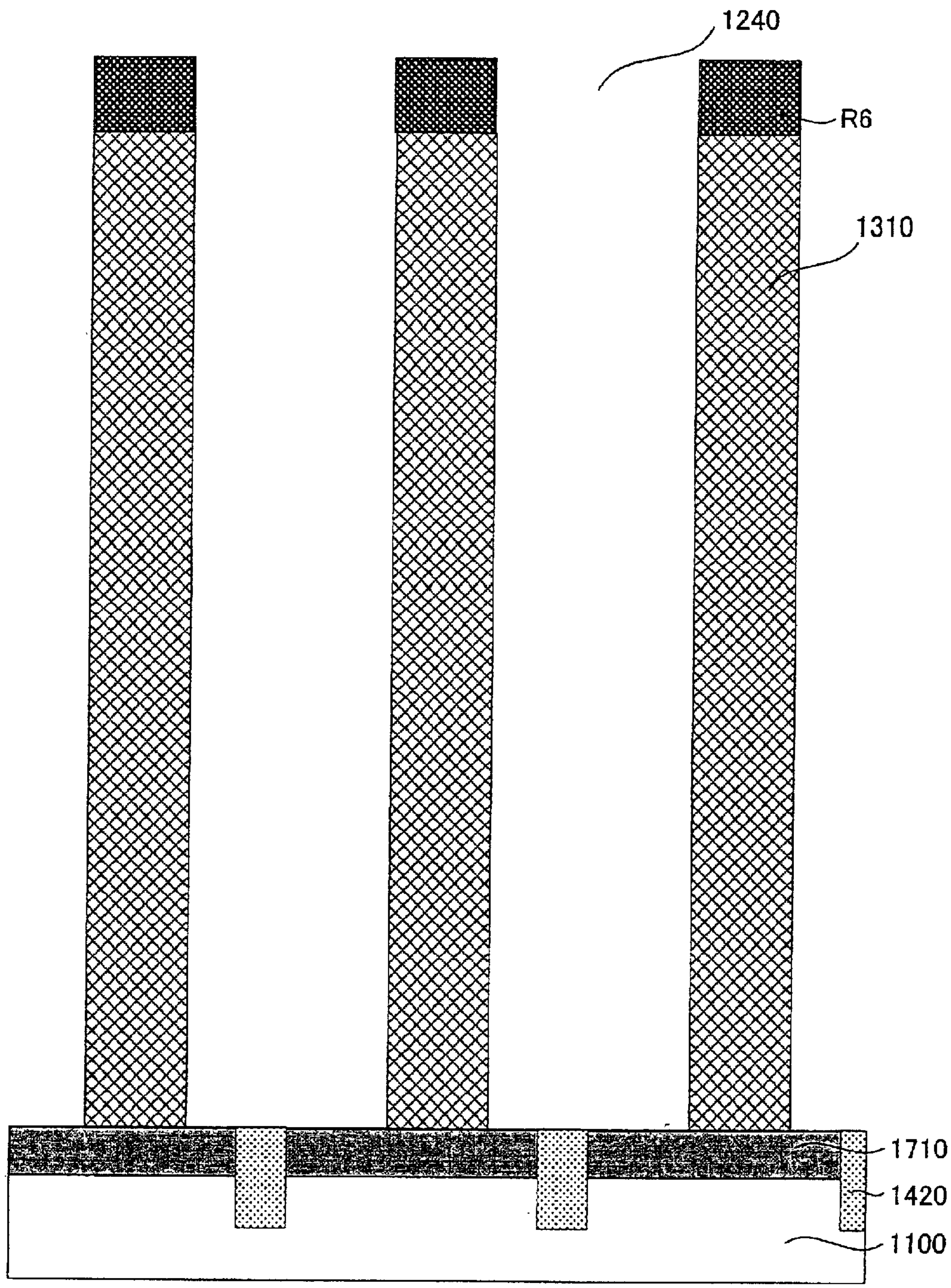

Fig. 1289
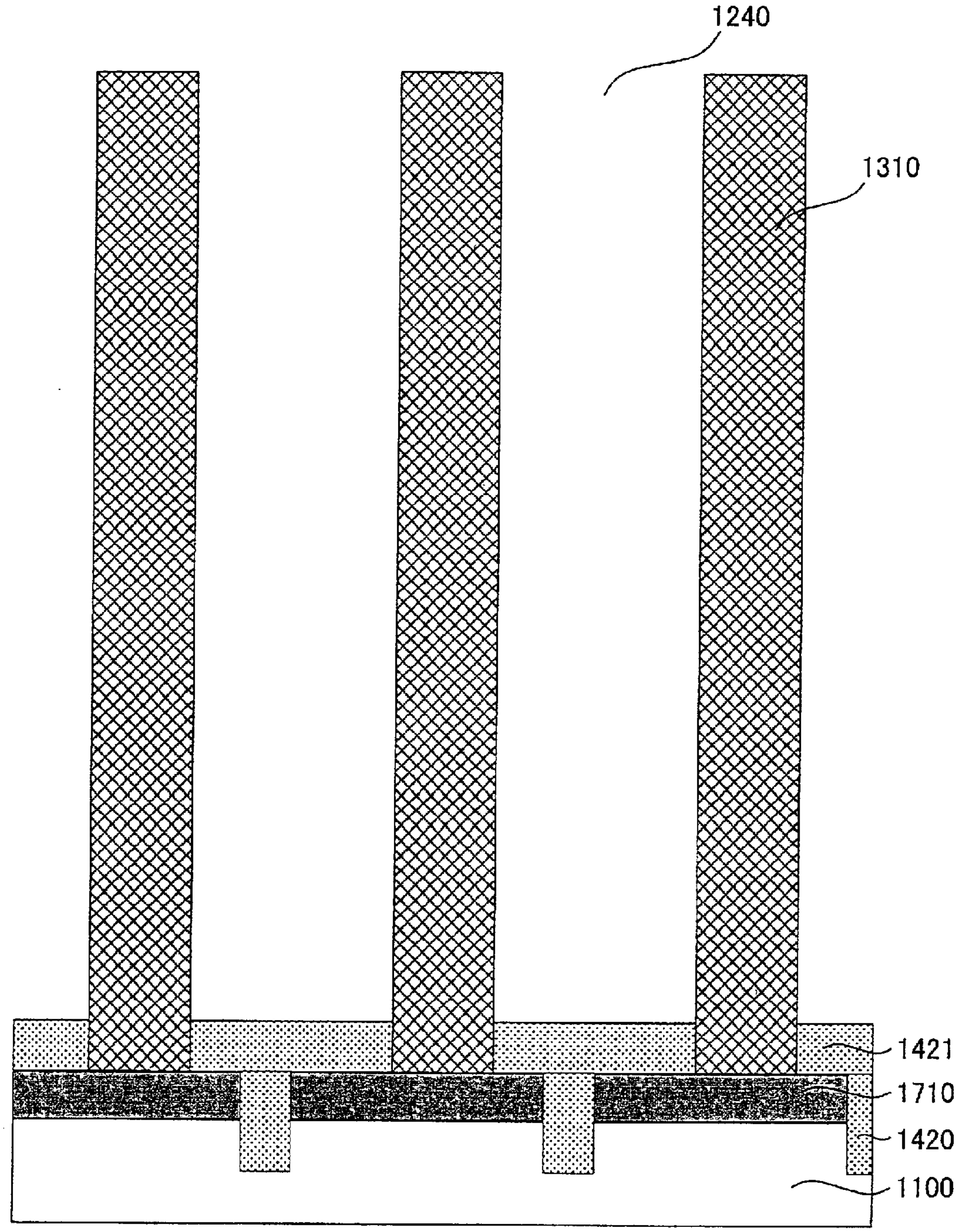

Fig. 1290
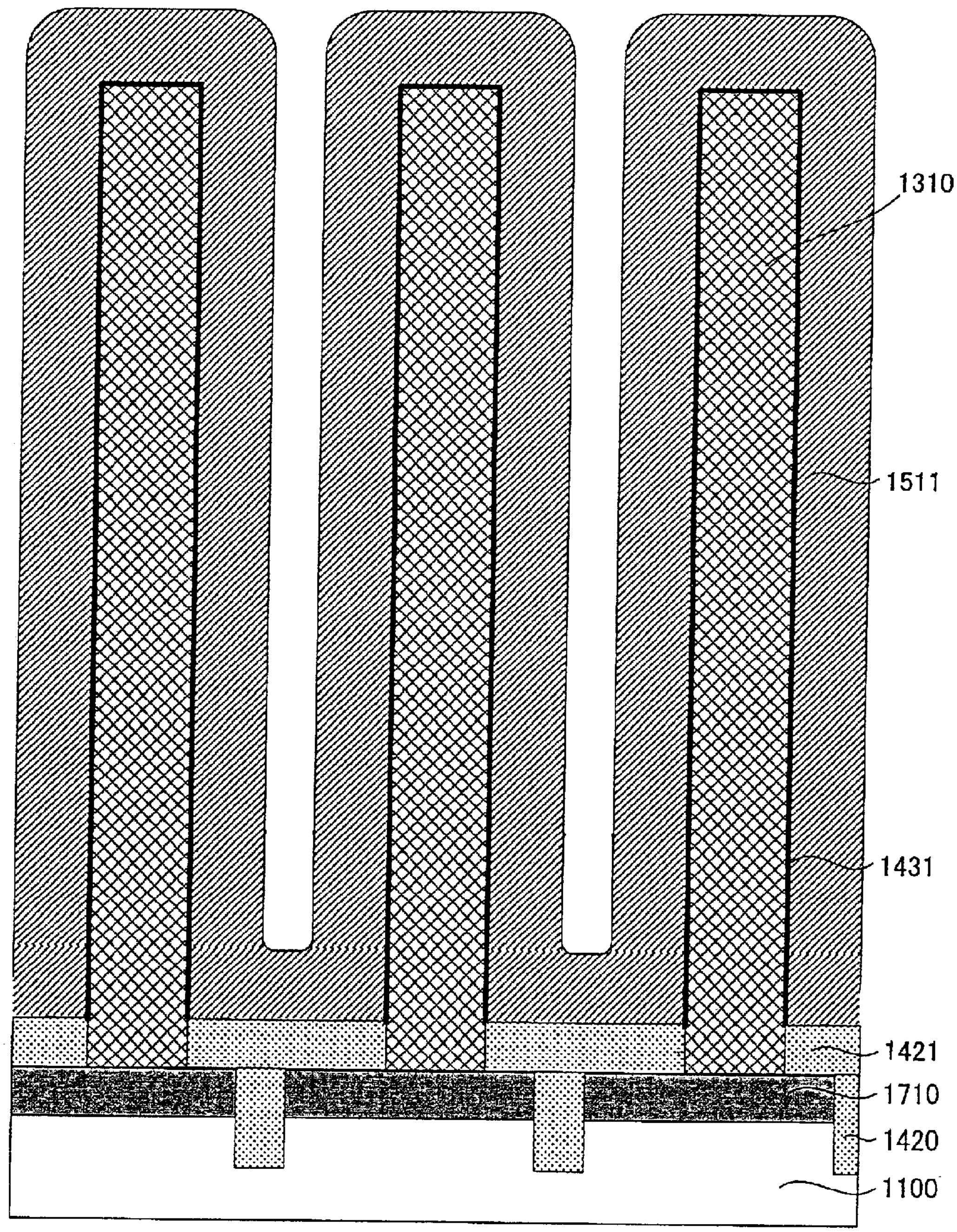

Fig. 1291
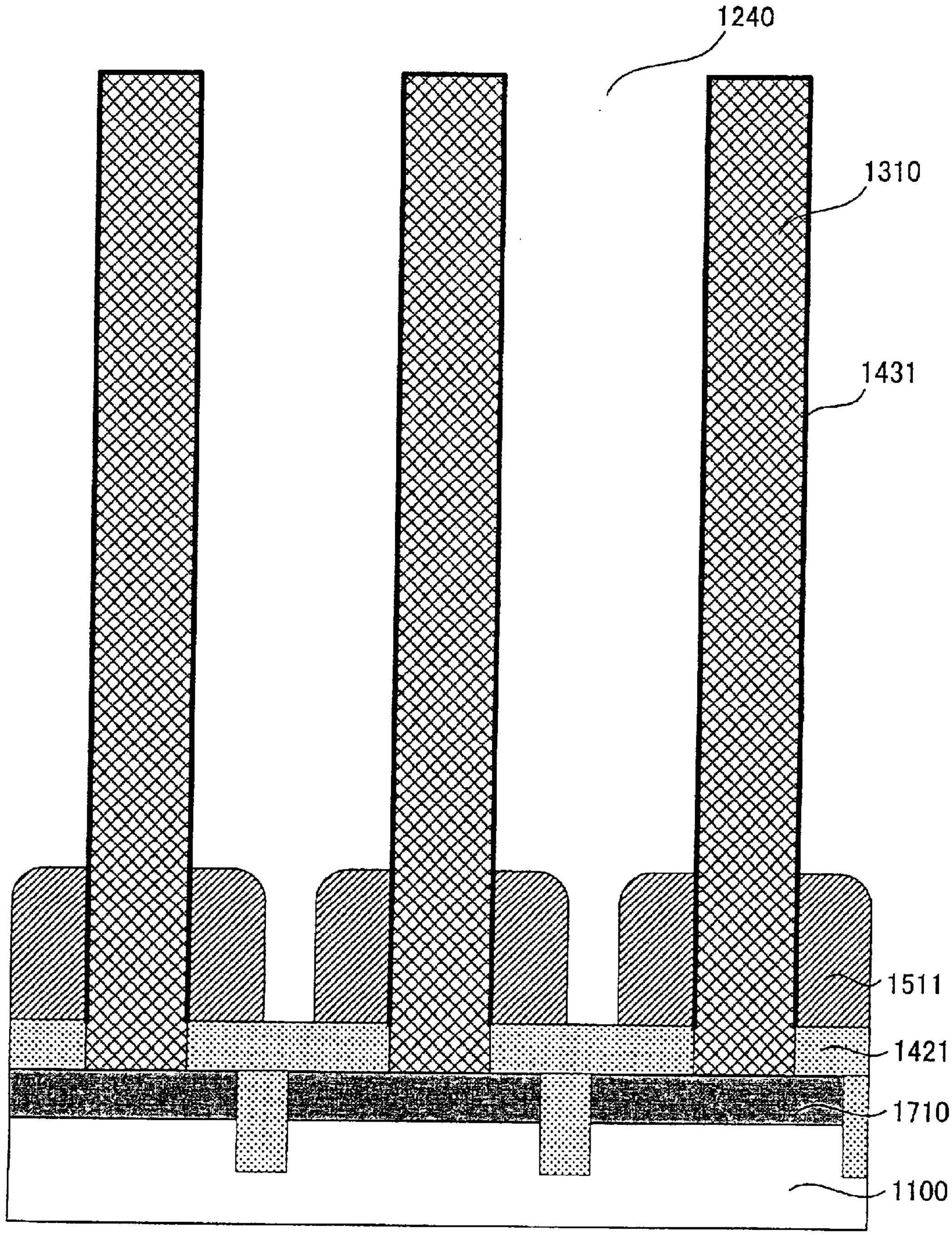

Fig. 1292
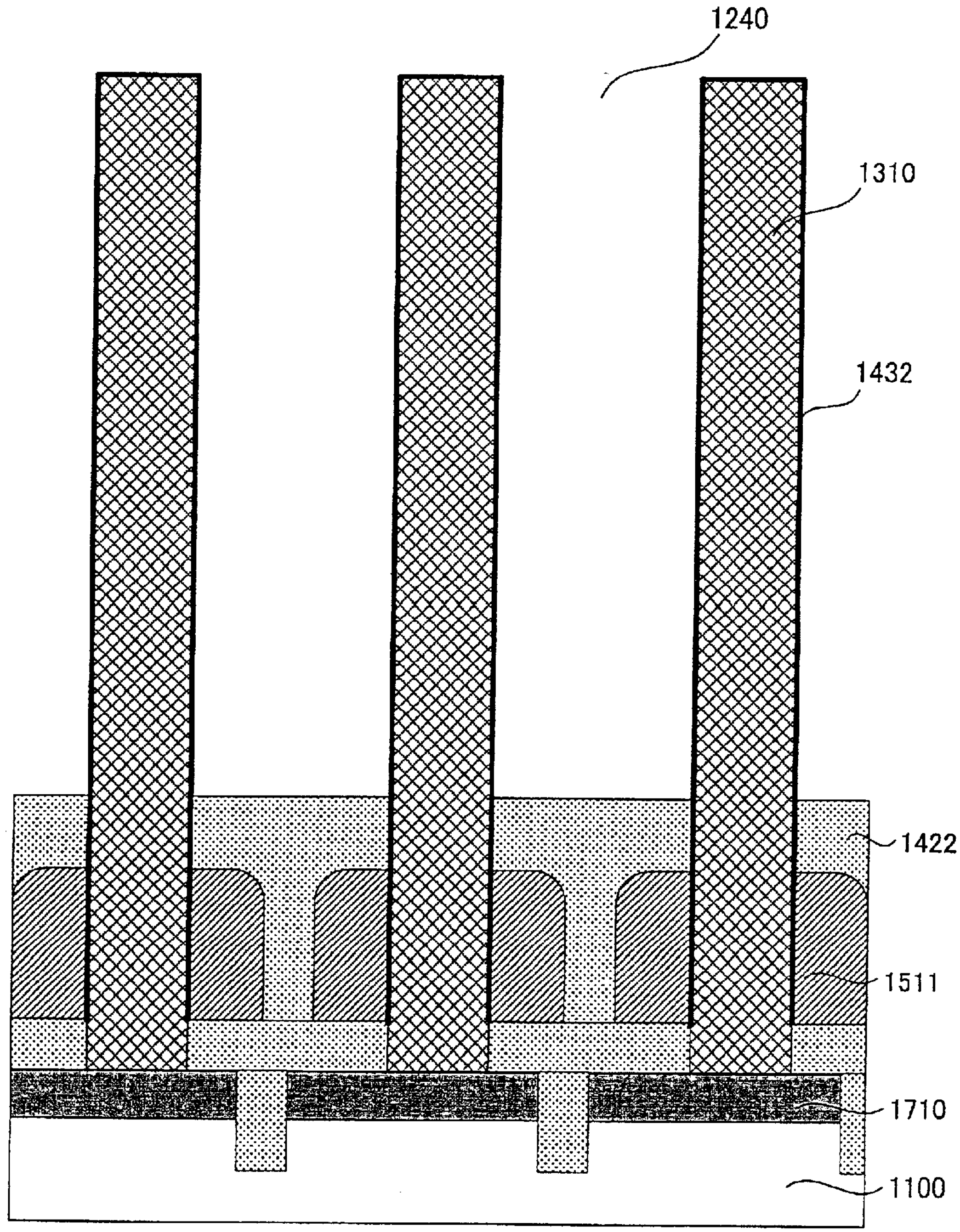

Fig. 1293
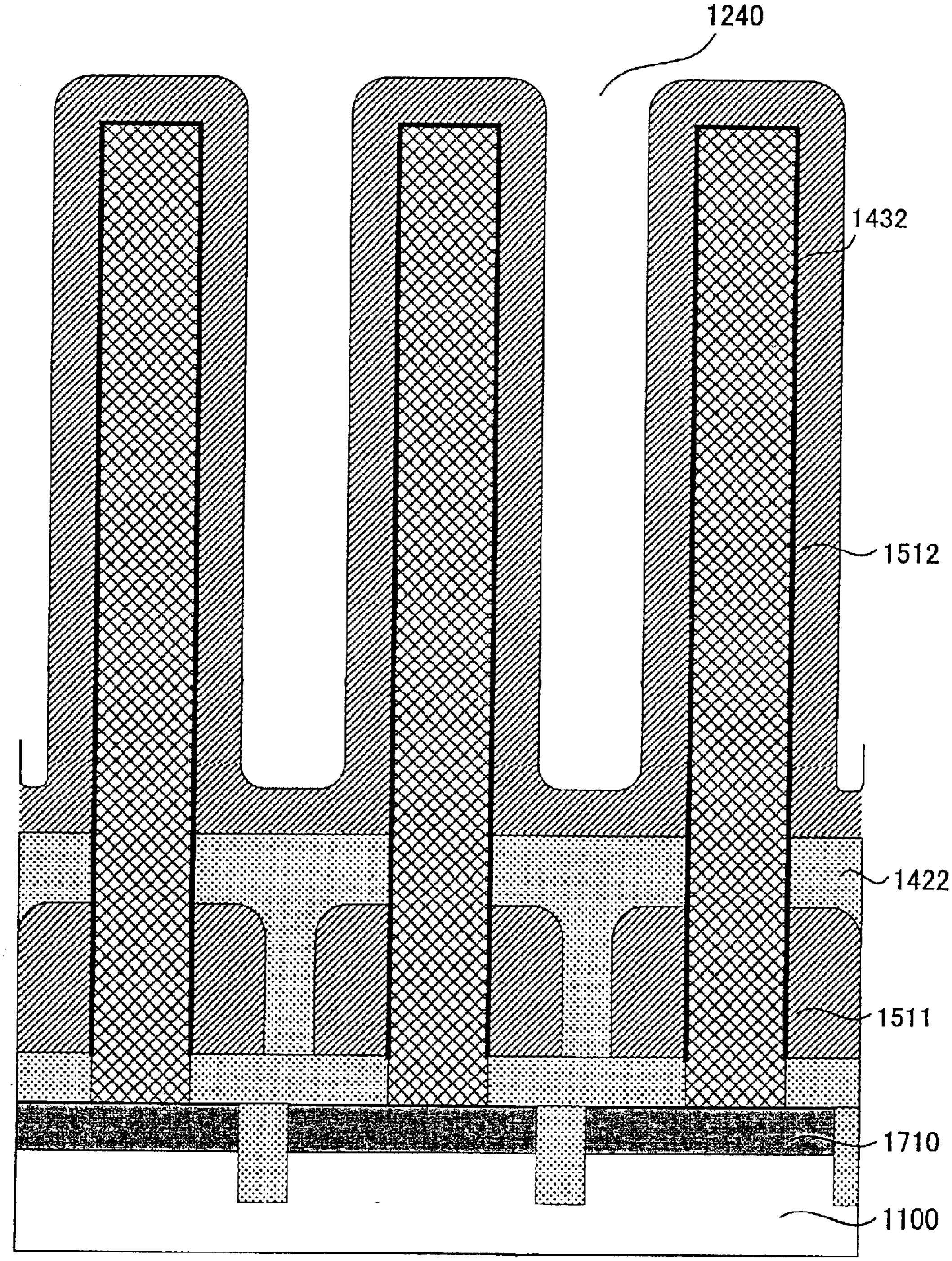

Fig. 1294
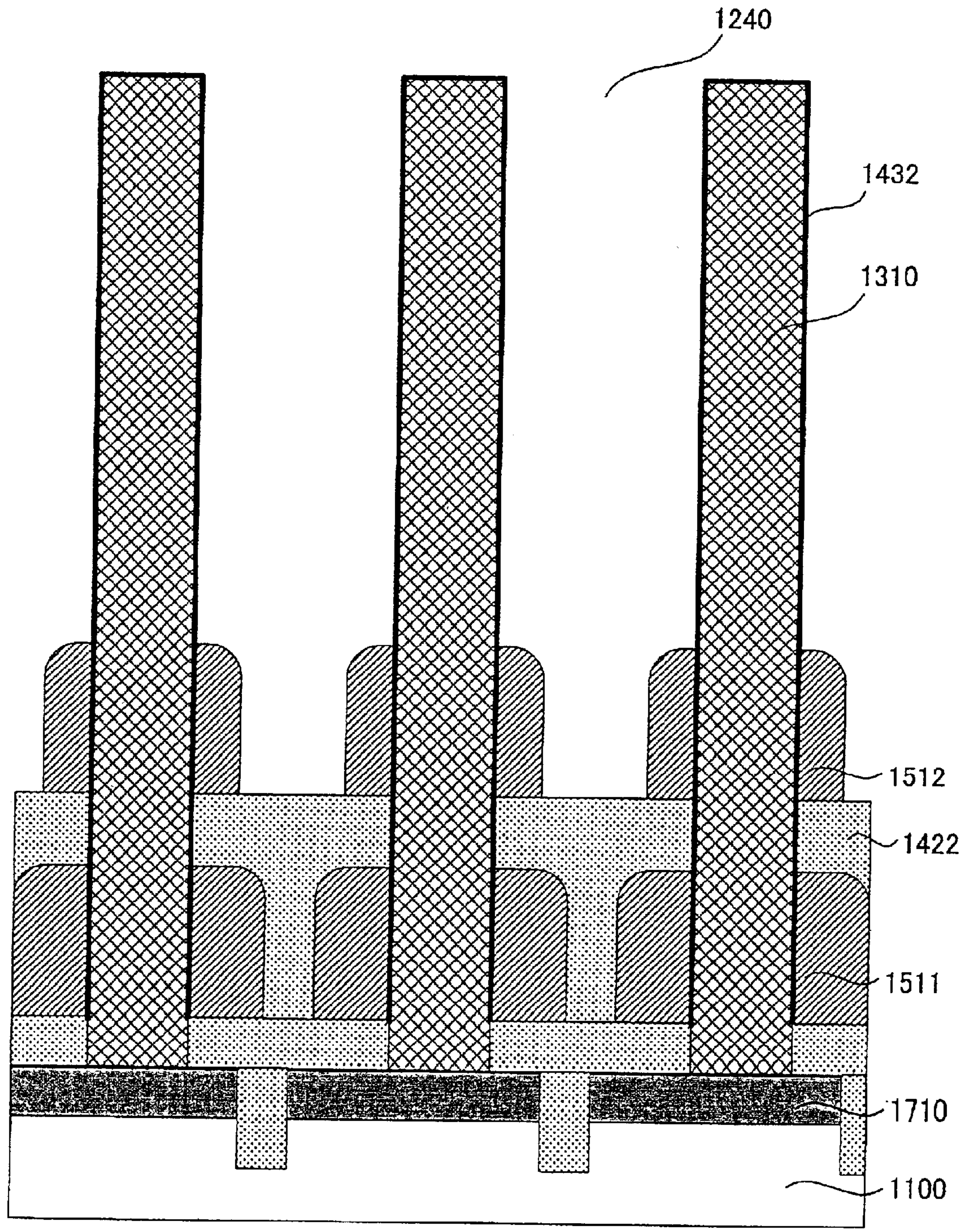

Fig. 1295
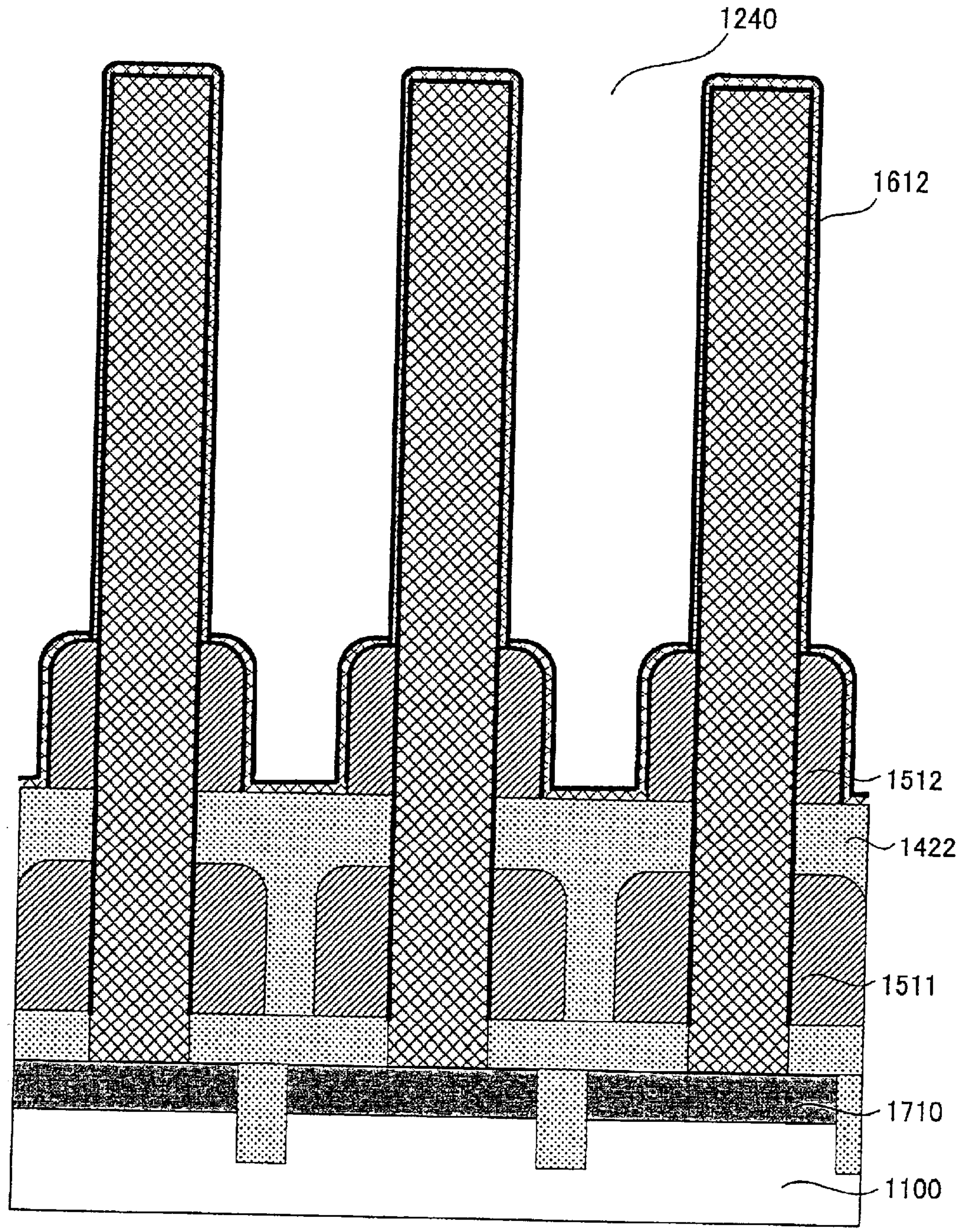

Fig. 1296
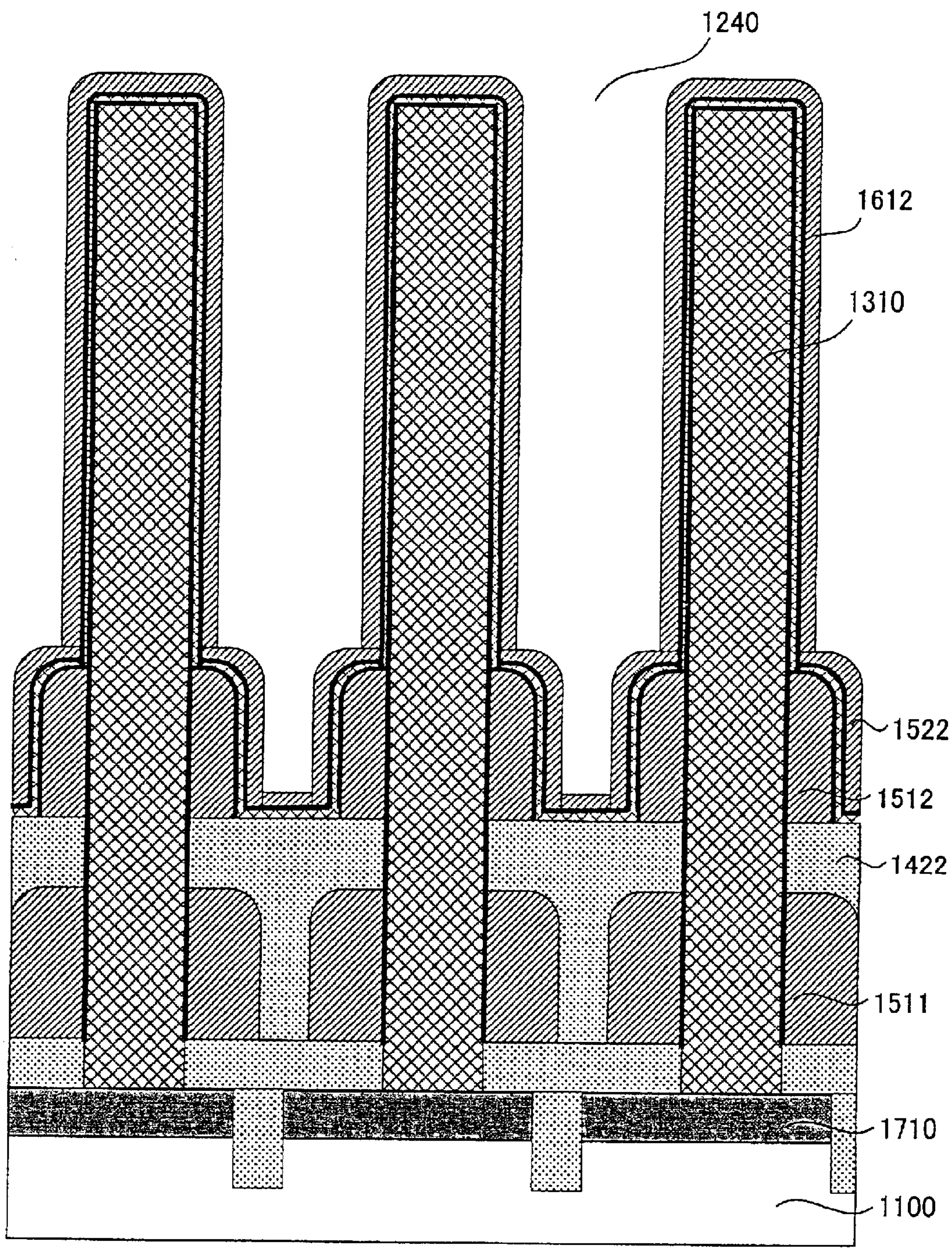

Fig. 1297
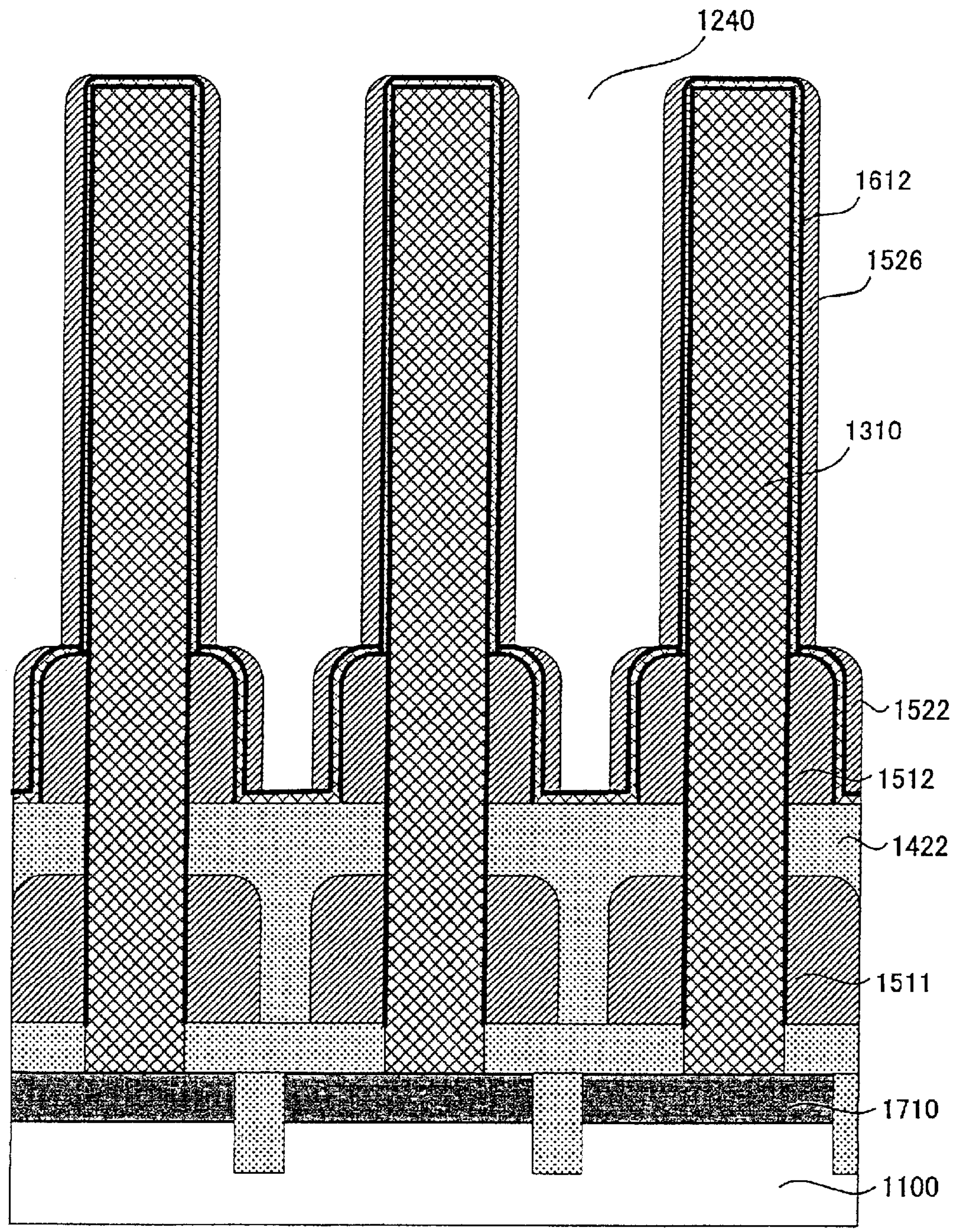

Fig. 1298
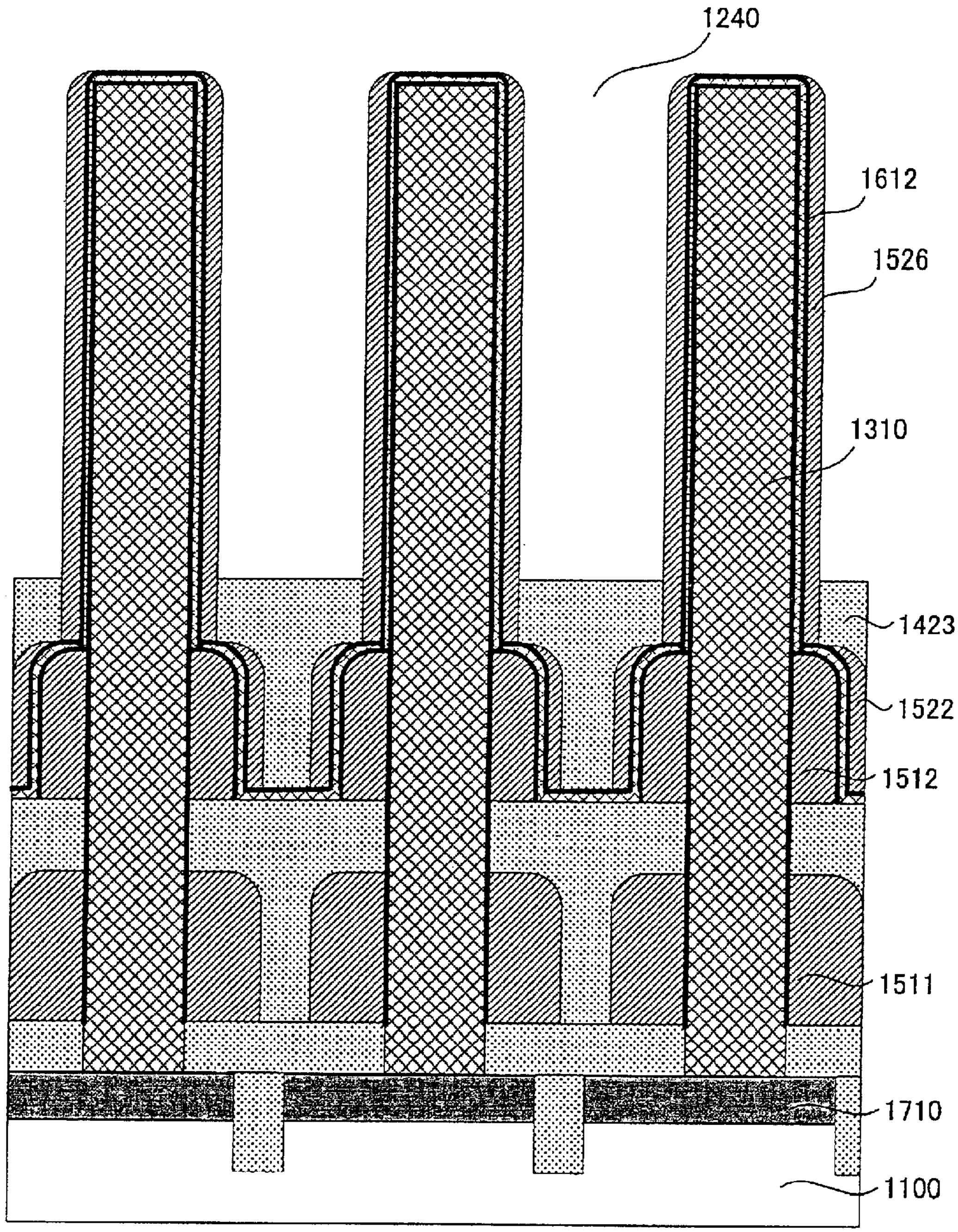

Fig. 1299
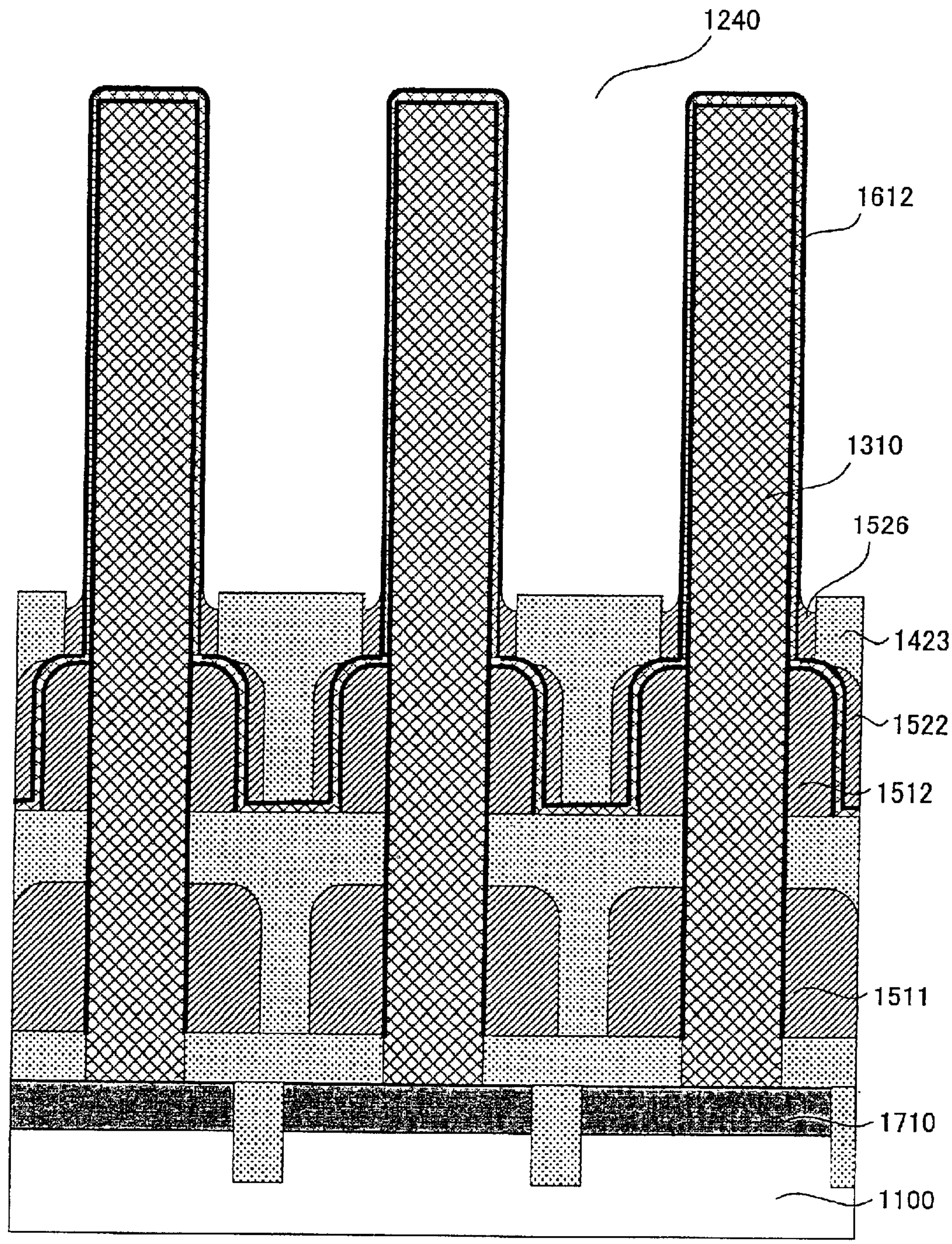

Fig. 1300
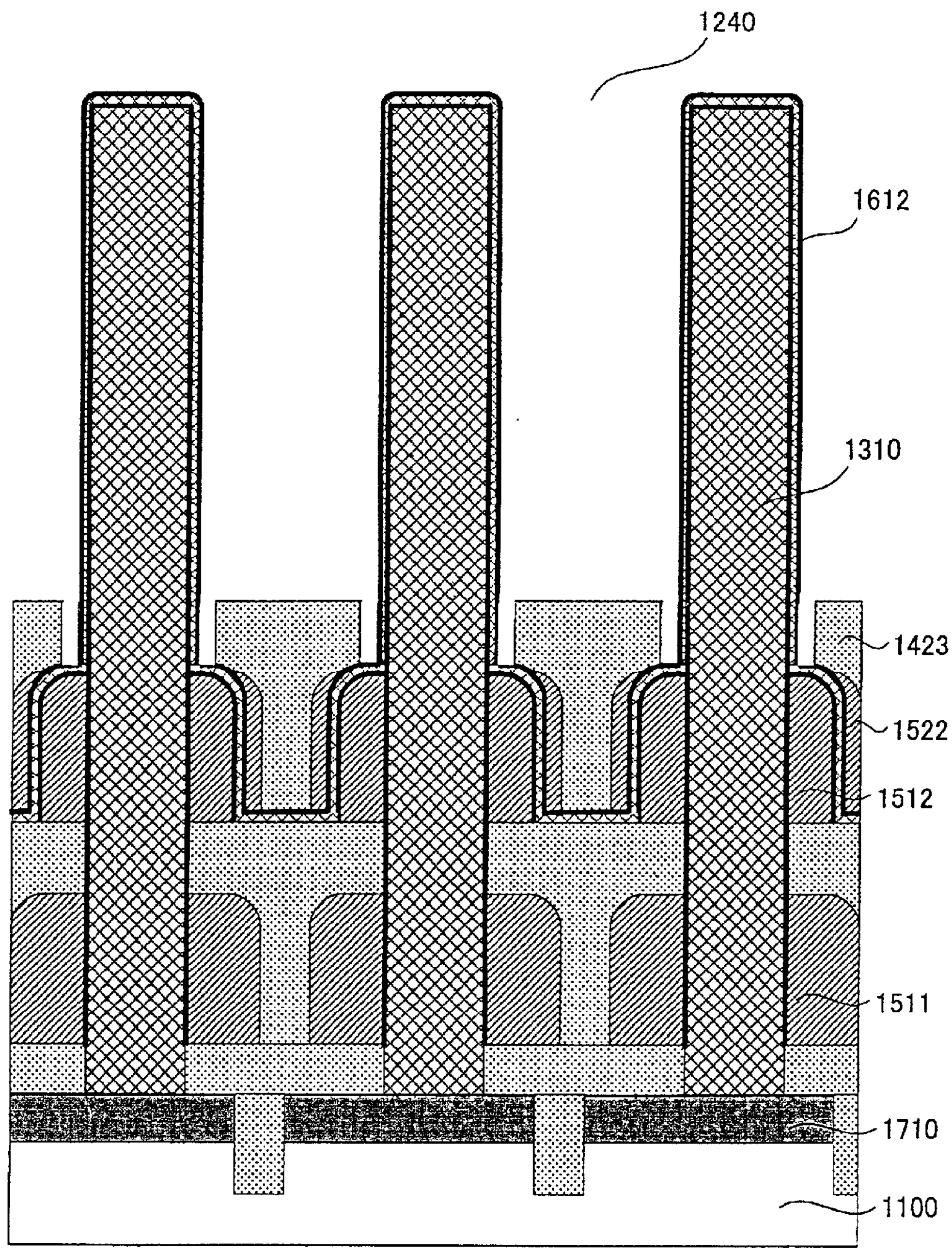

Fig. 1301
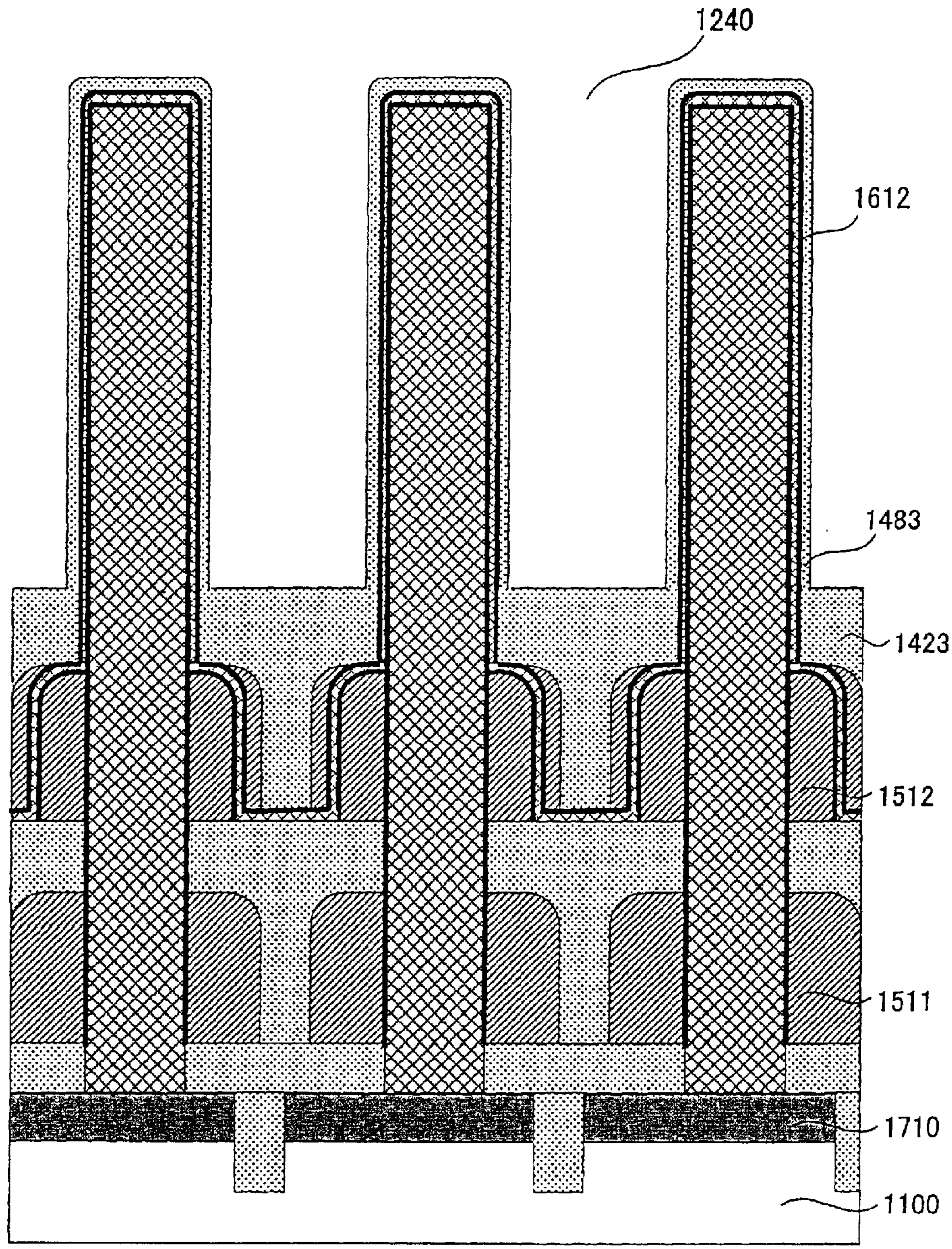

Fig. 1302
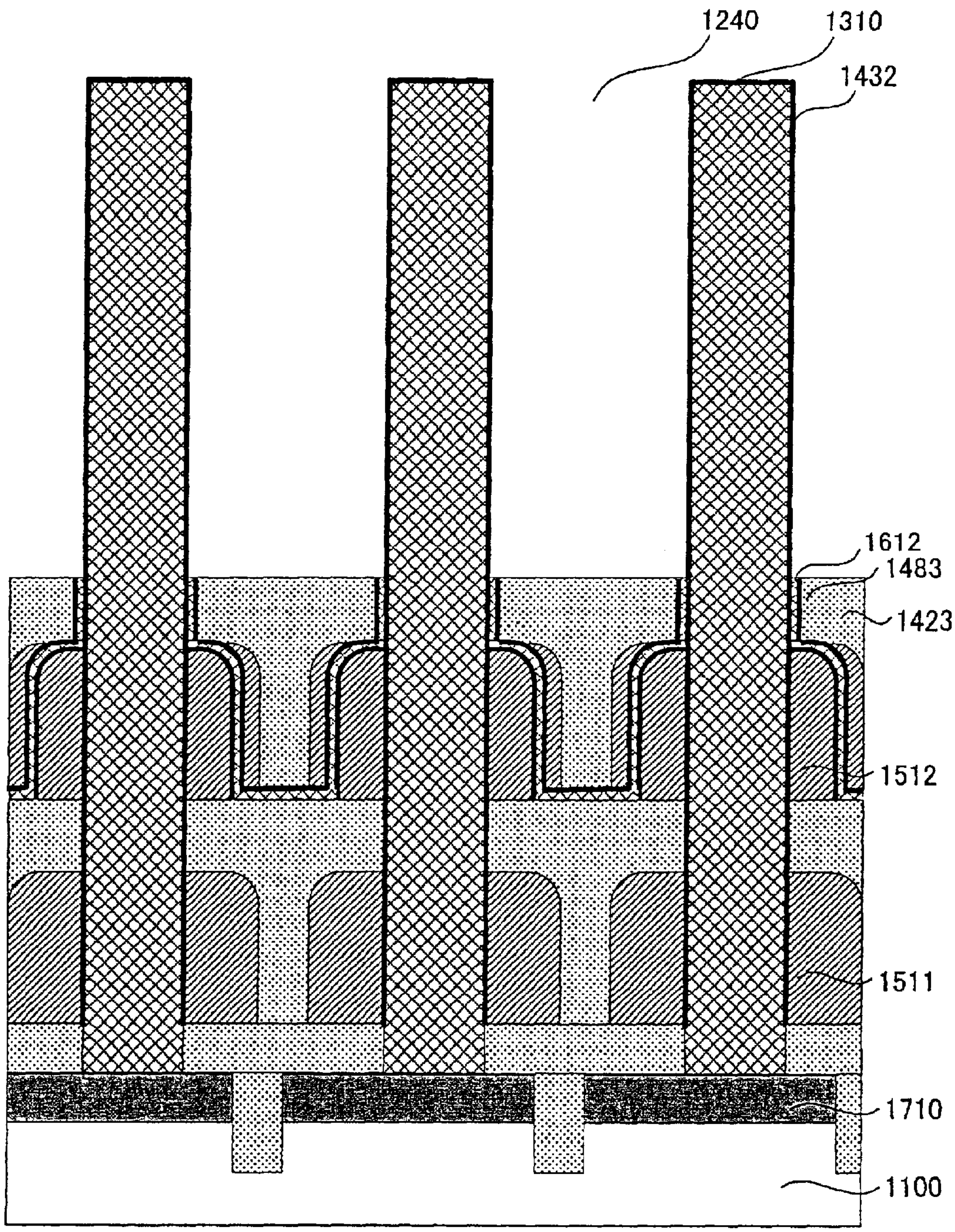

Fig. 1303
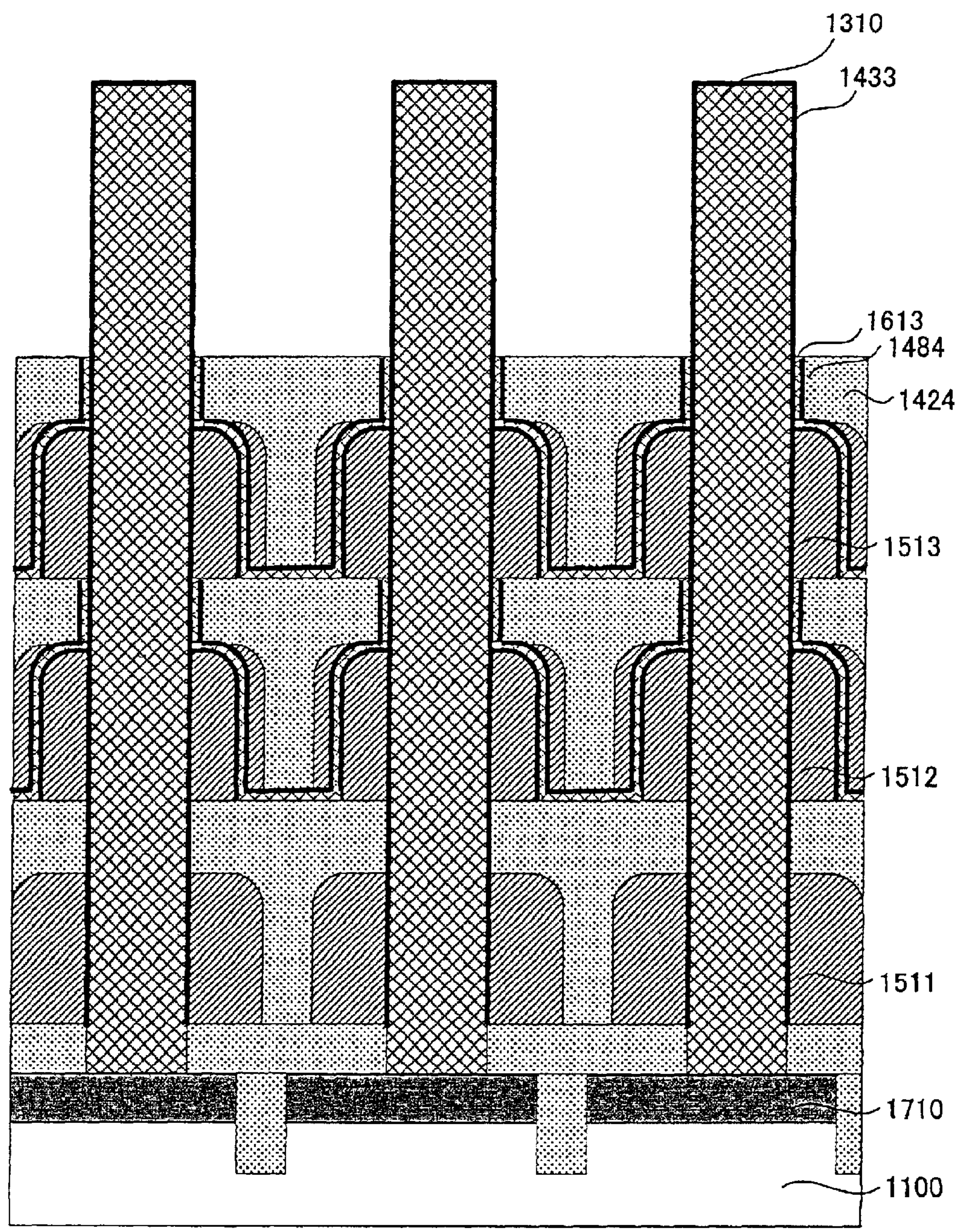

Fig. 1304
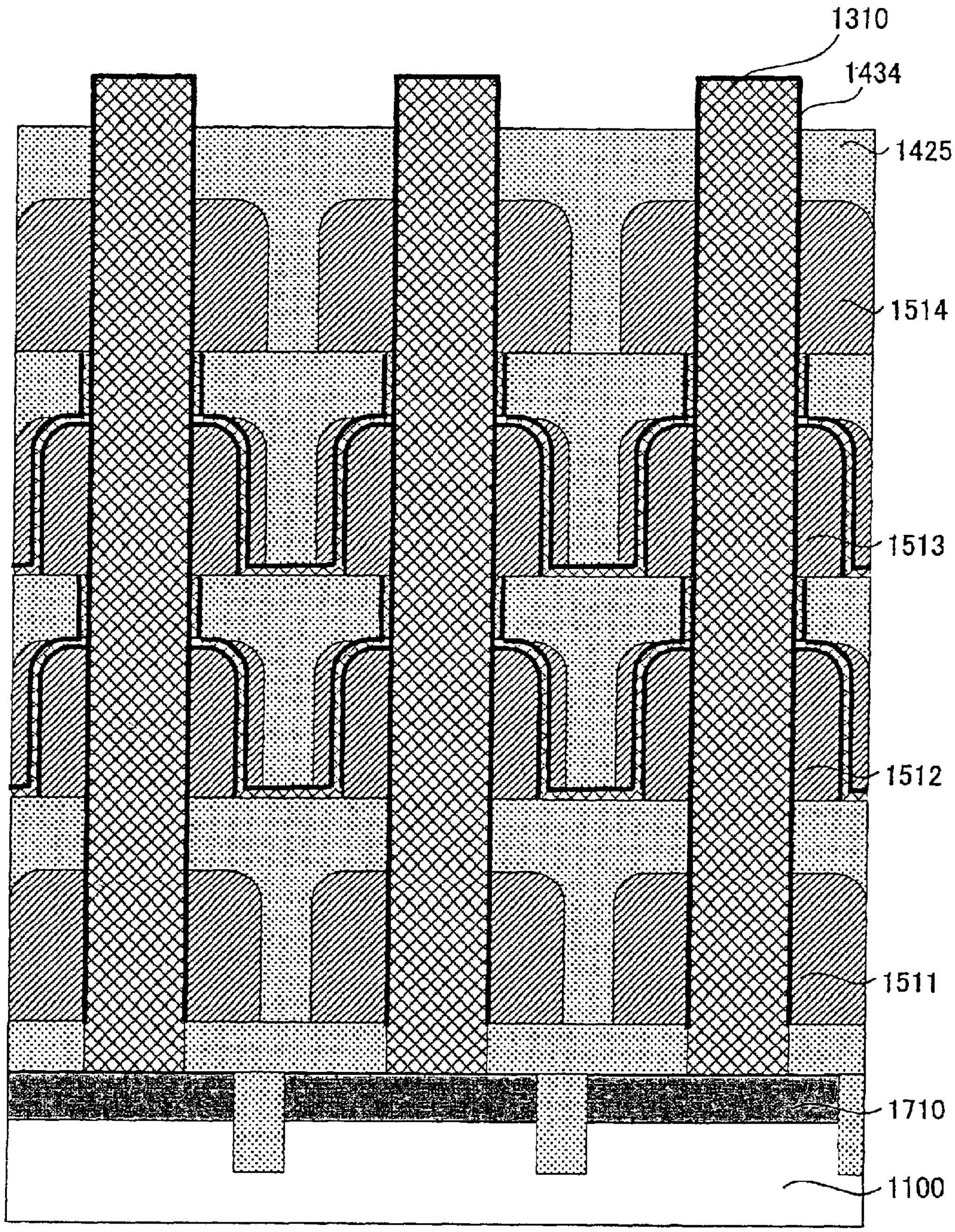

Fig. 1305
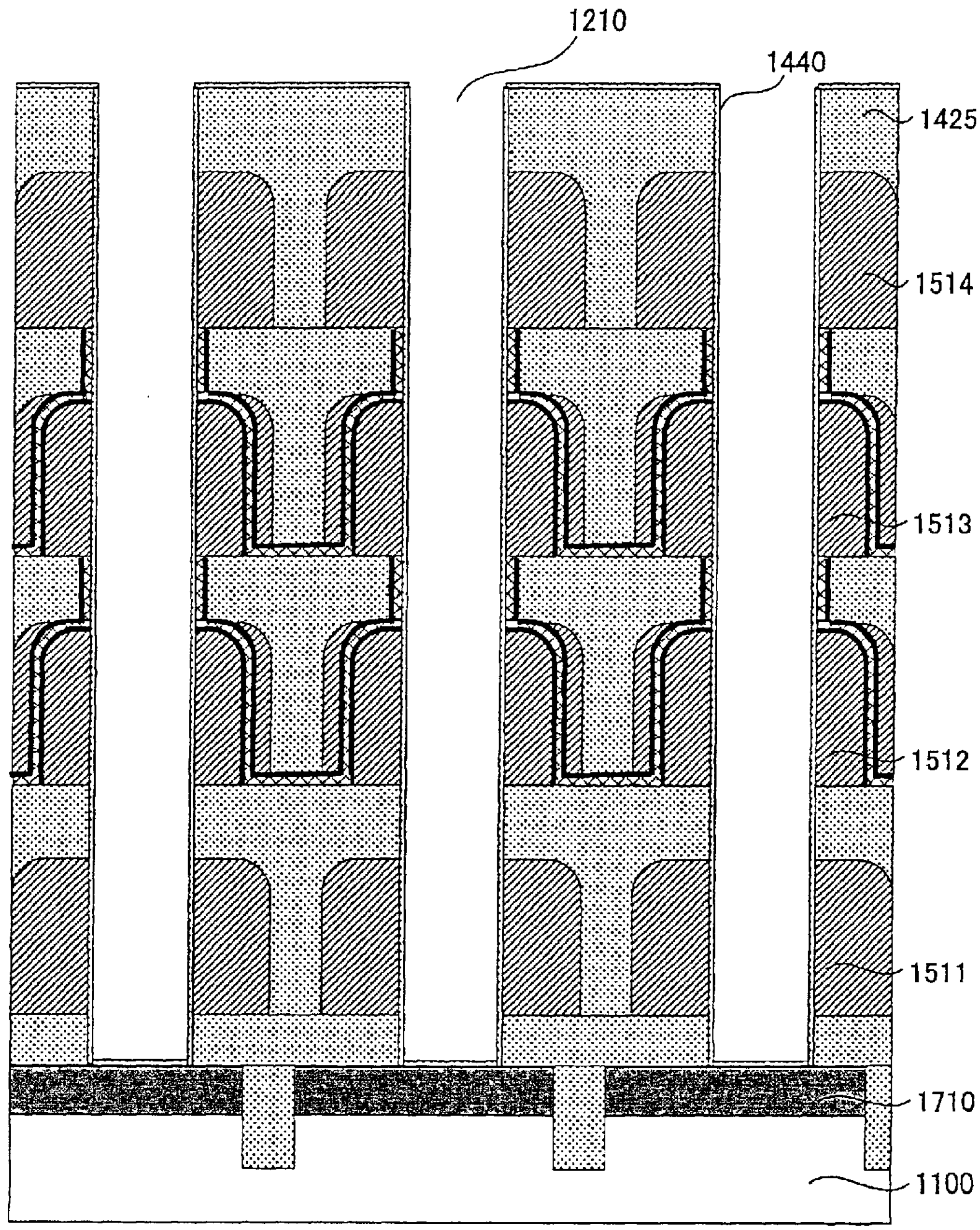

Fig. 1306
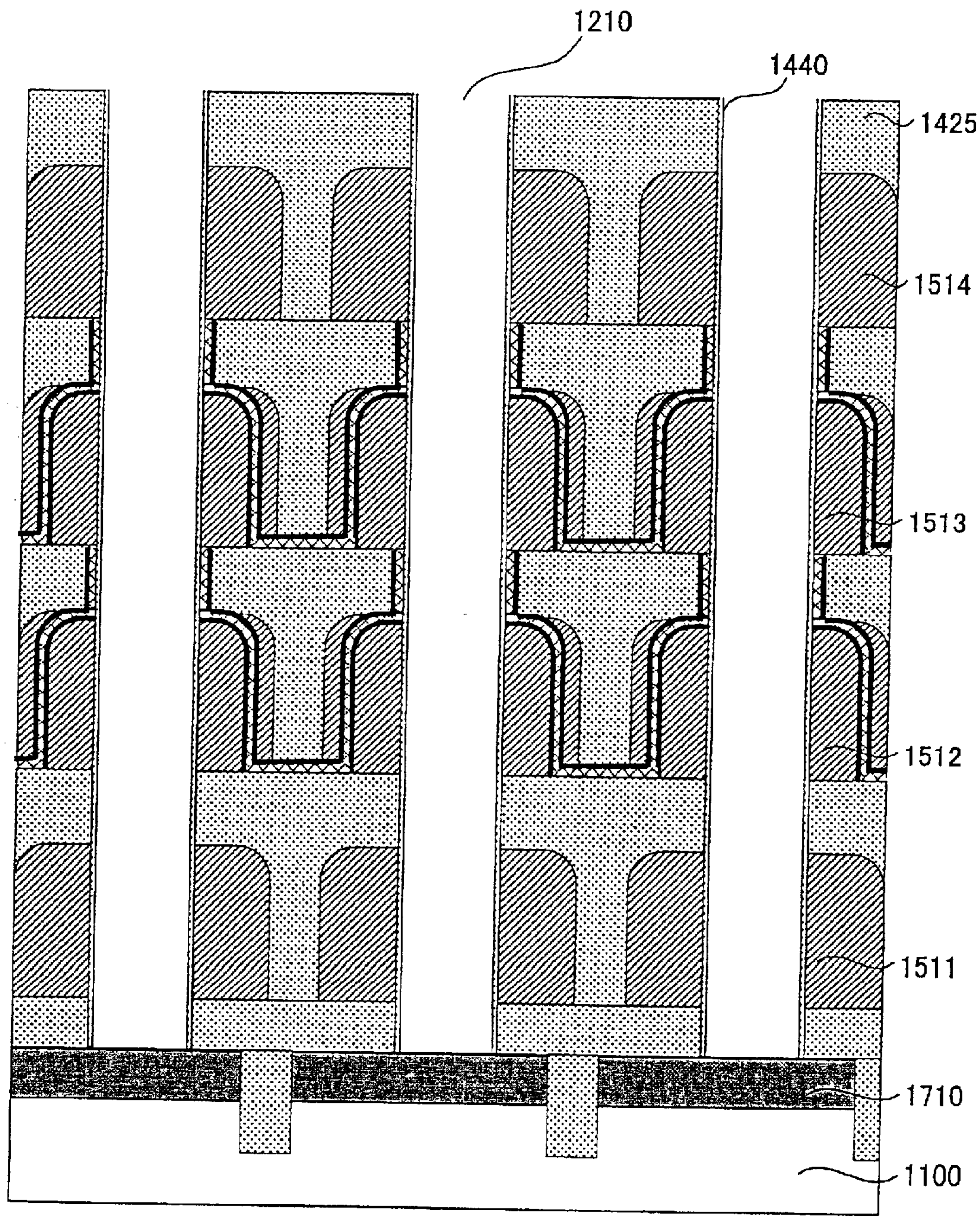

Fig. 1307
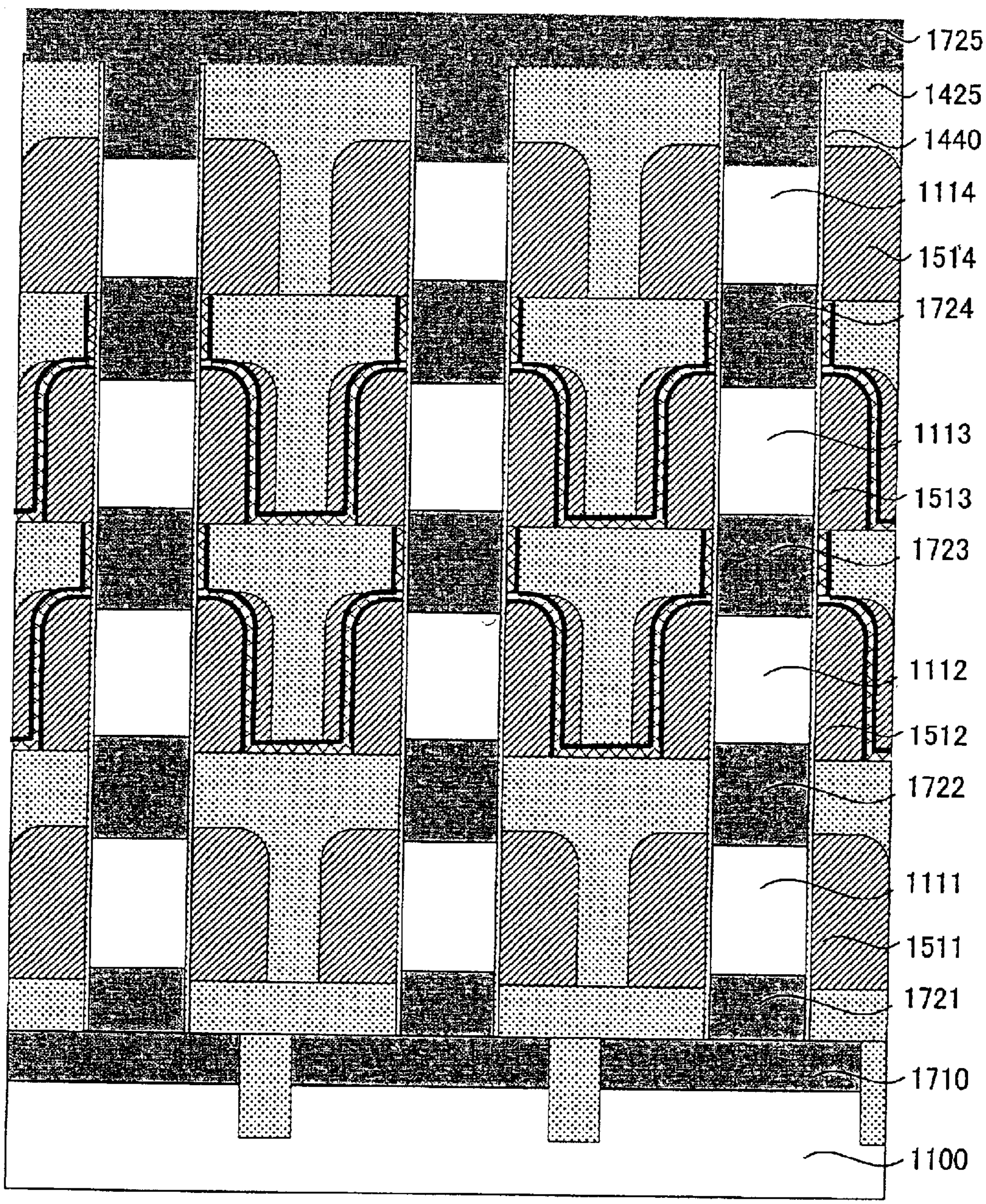

Fig. 1308
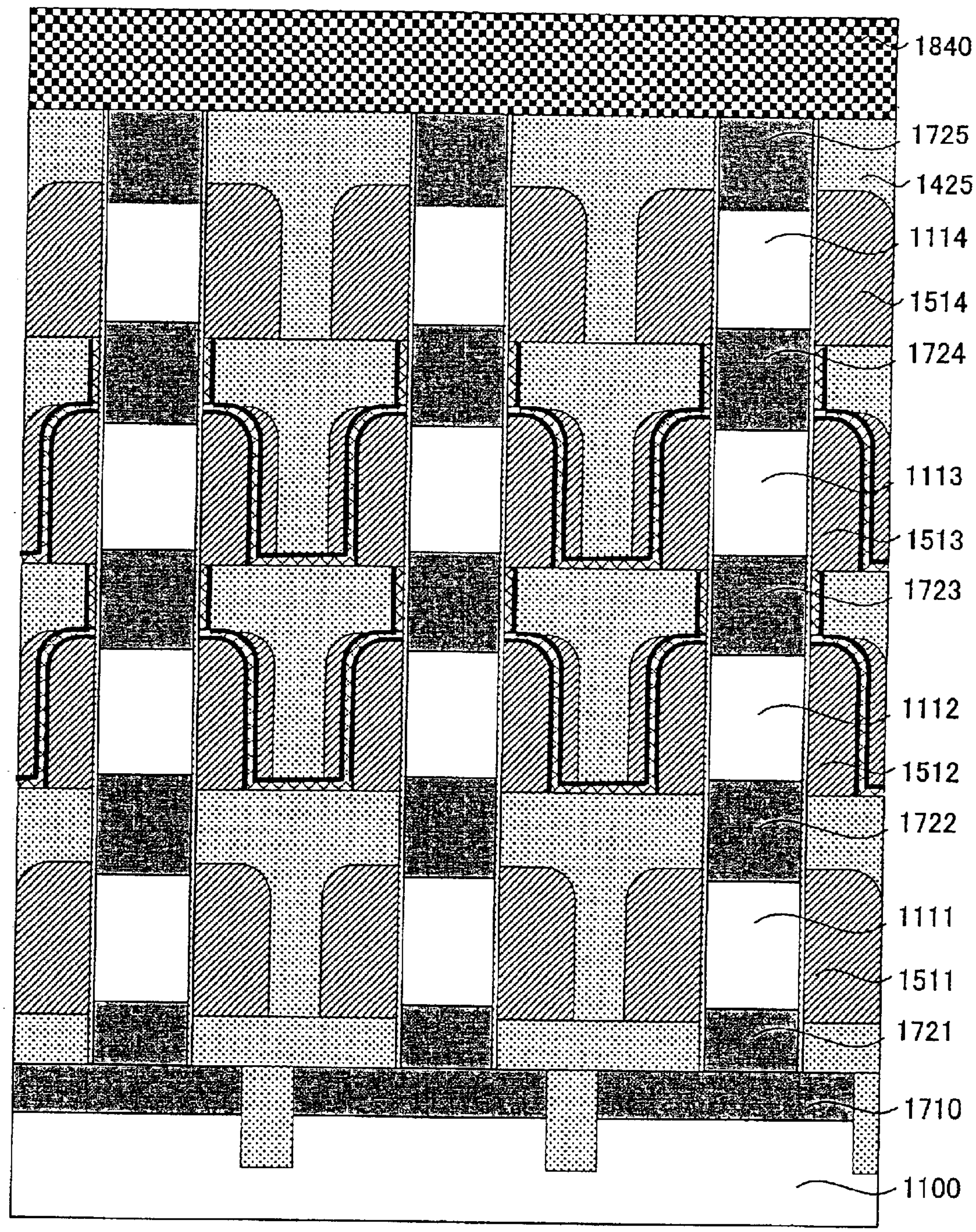

Fig. 1309
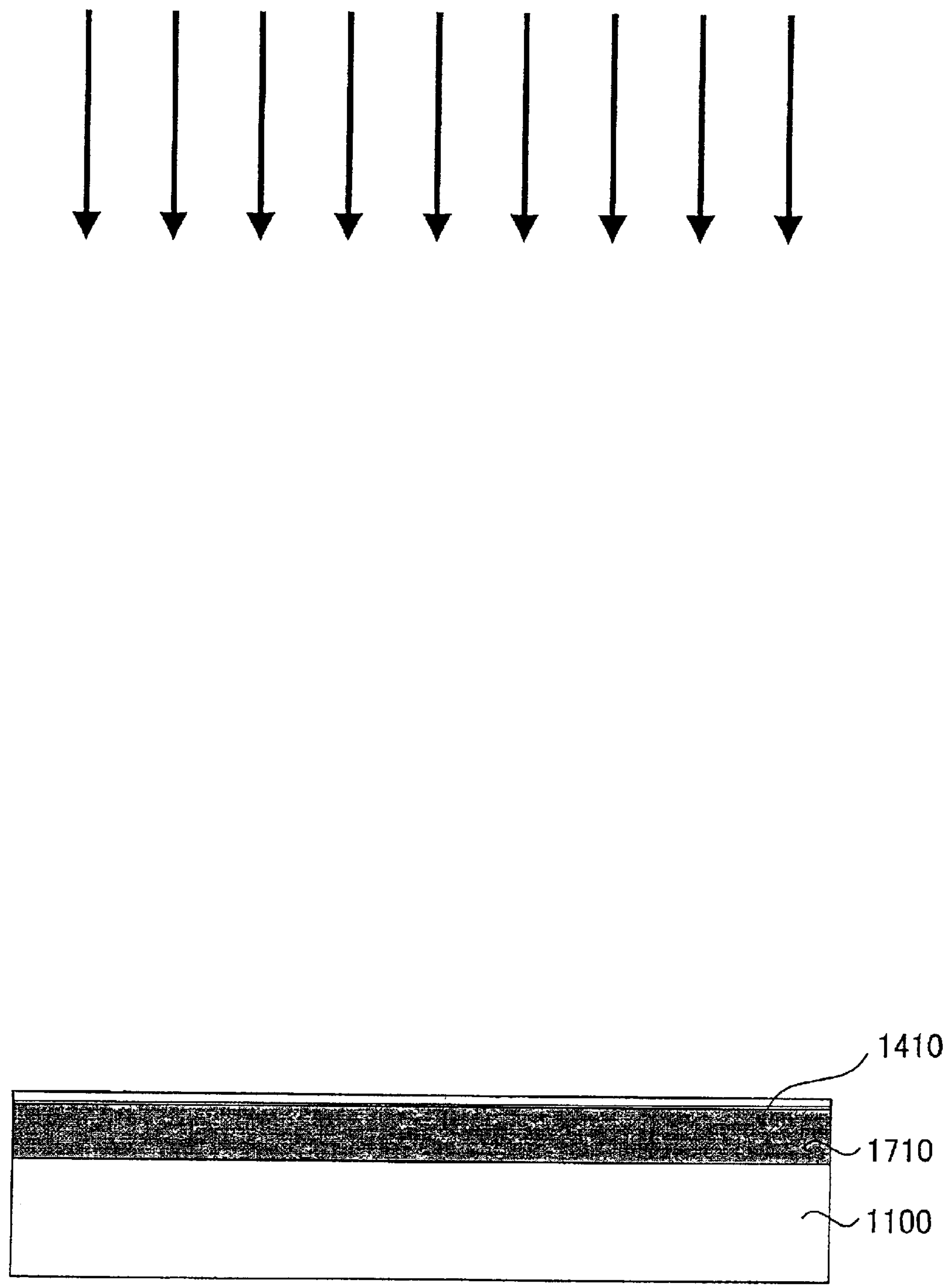

Fig. 1310
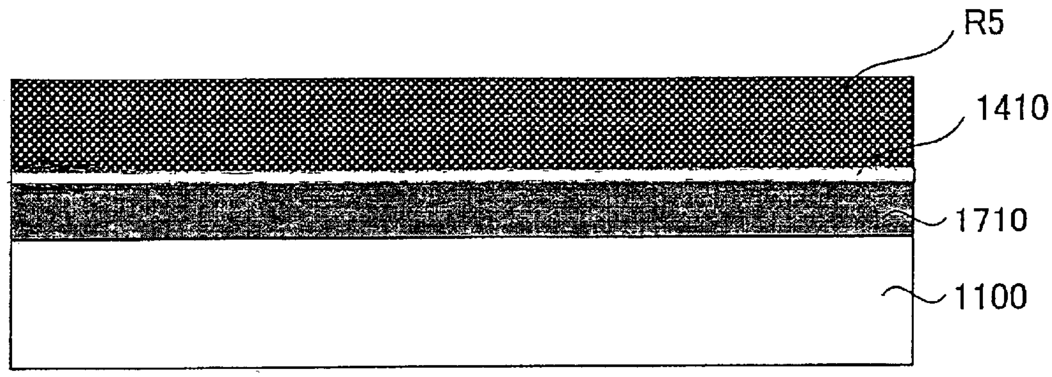
Fig. 1311
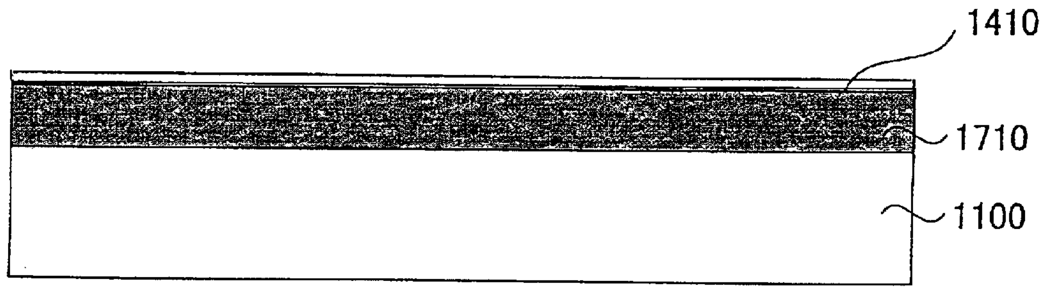

Fig. 1312
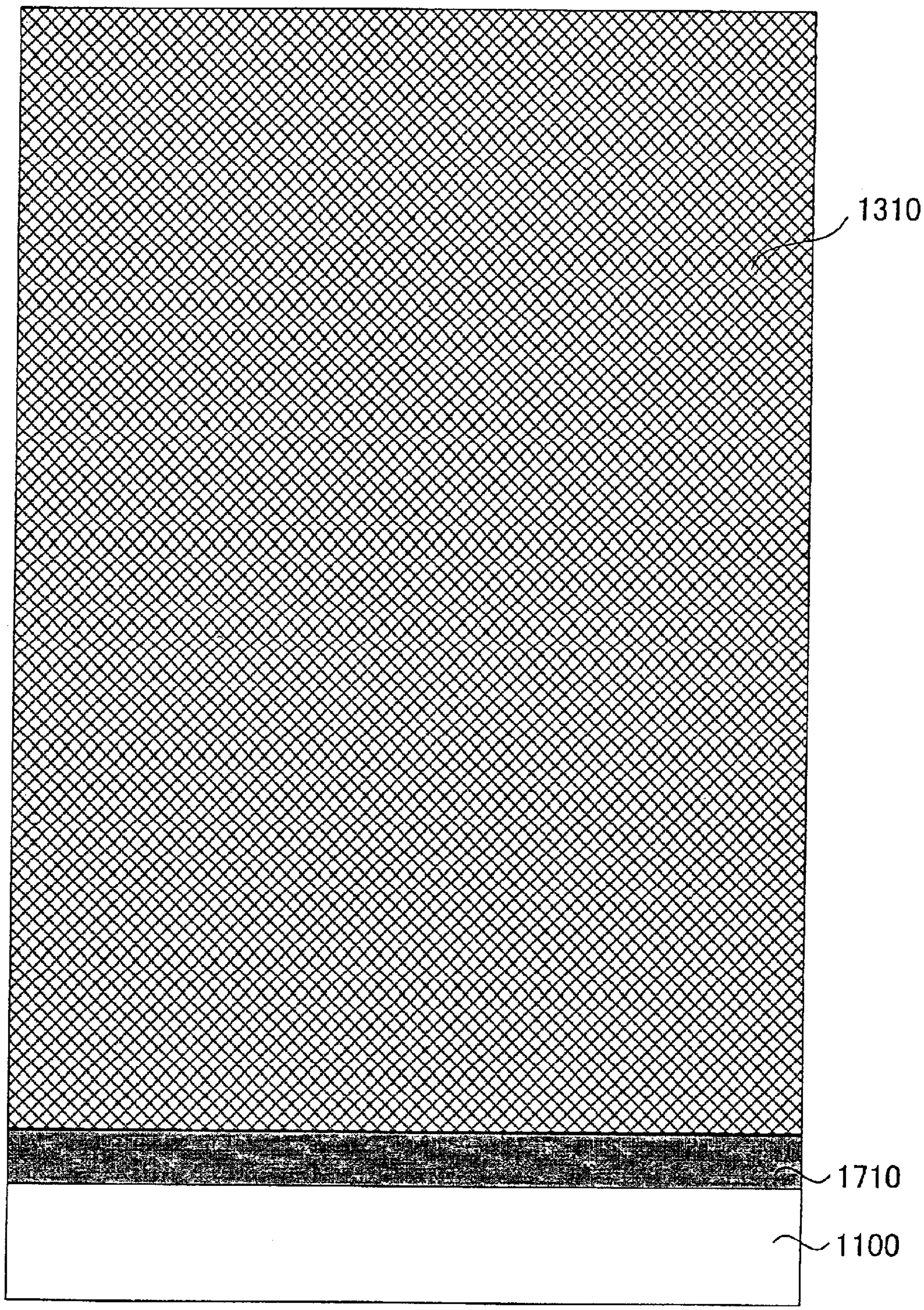

Fig. 1313
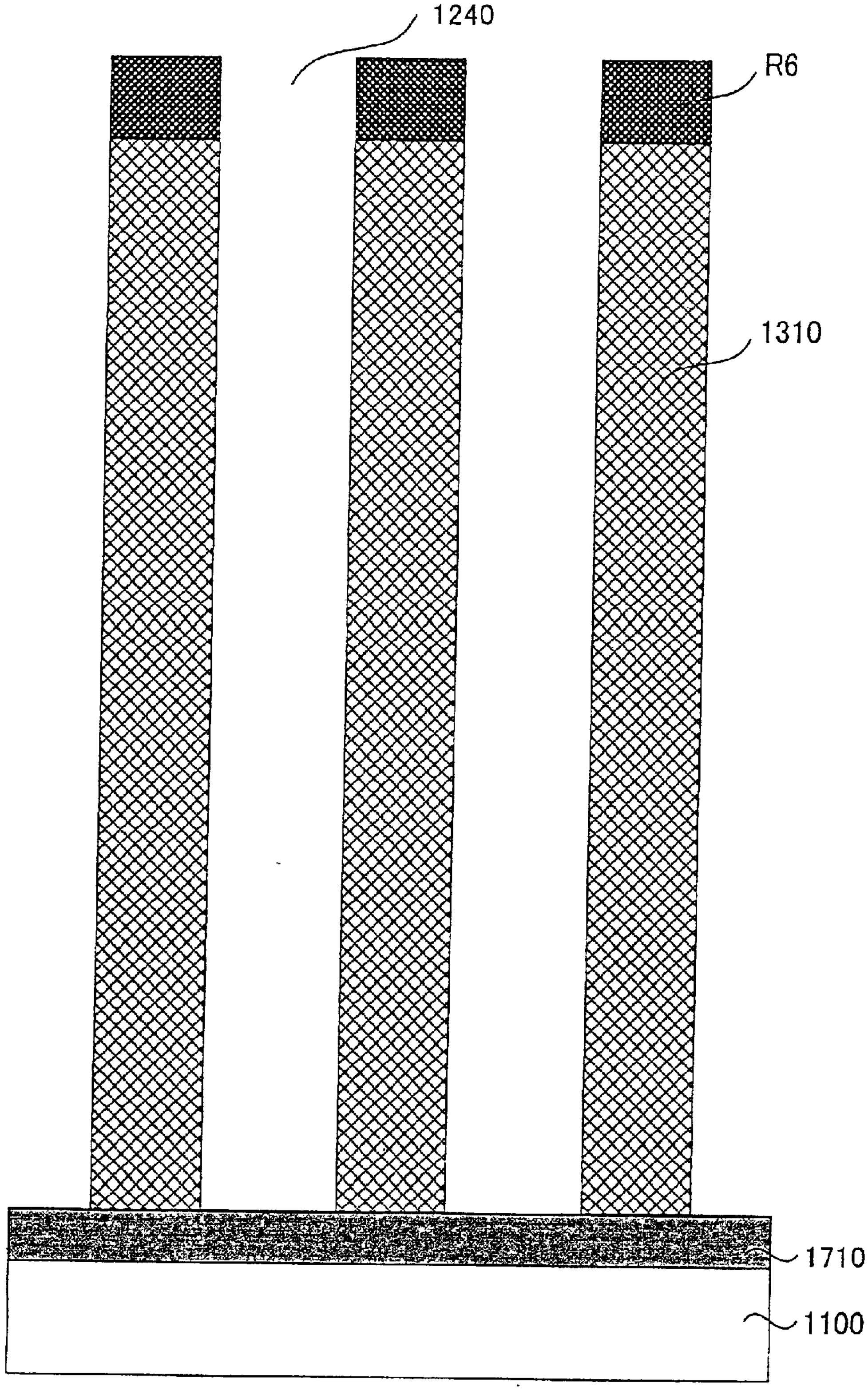

Fig. 1314
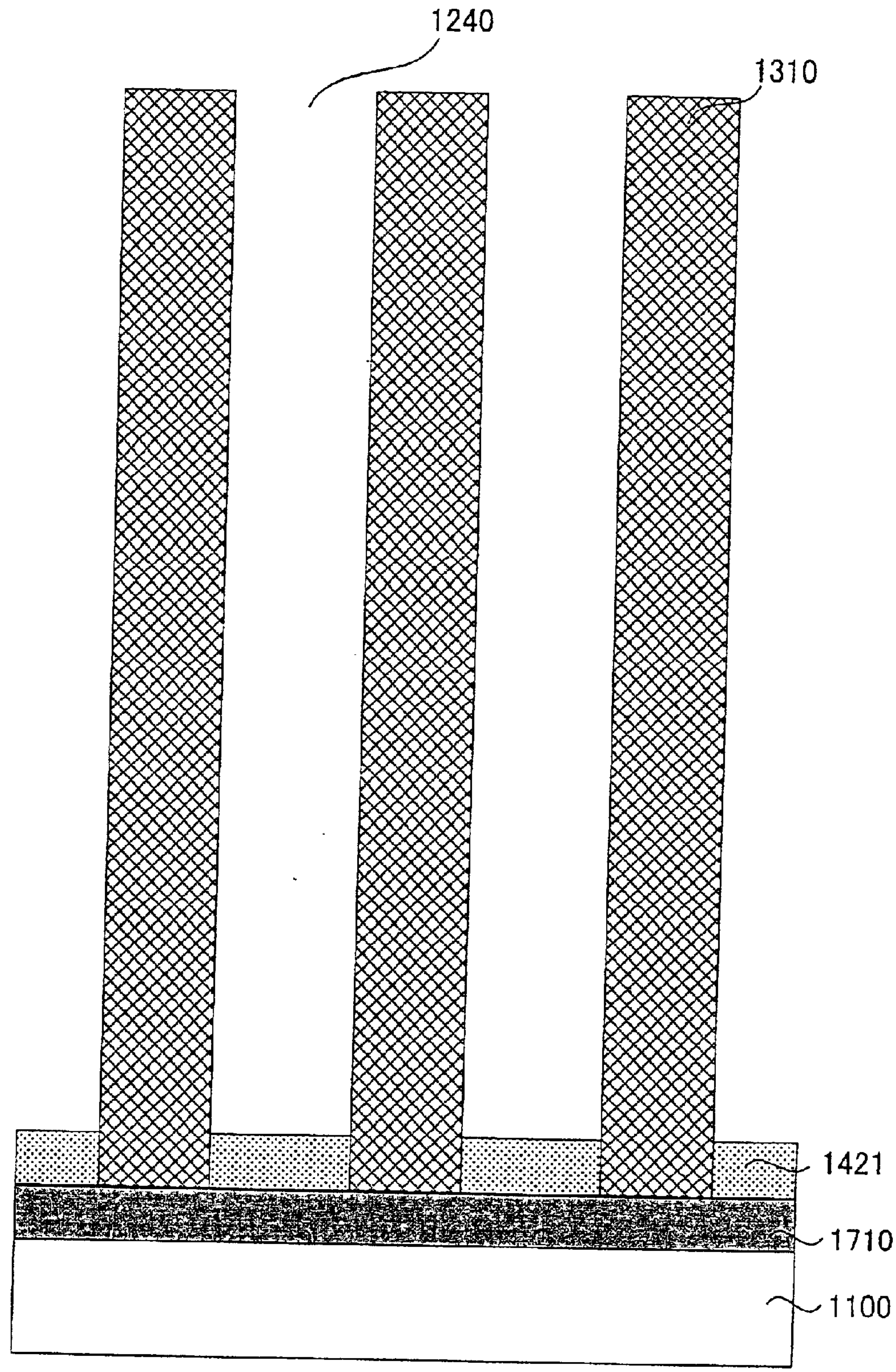

Fig. 1315
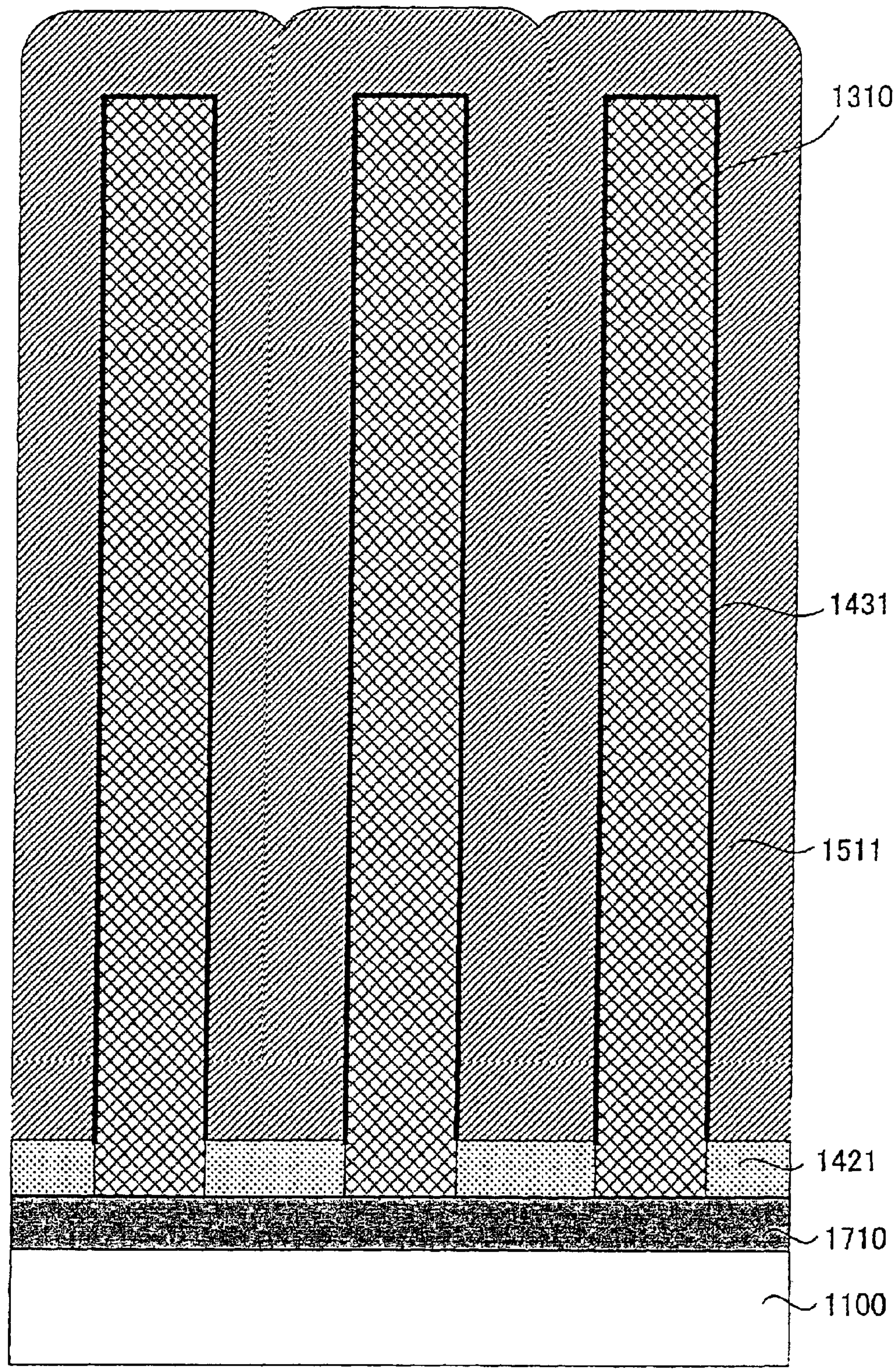

Fig. 1316
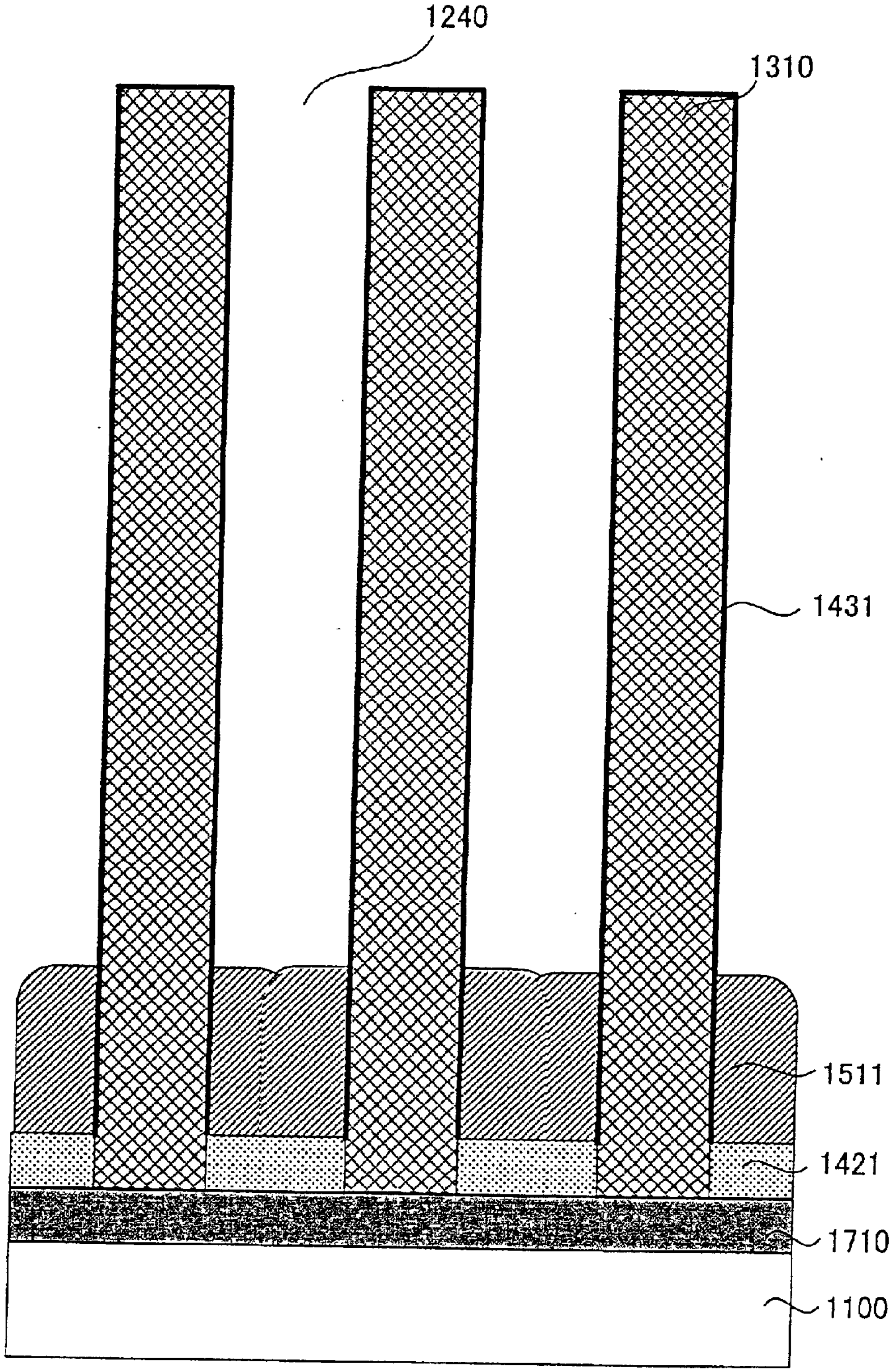

Fig. 1317
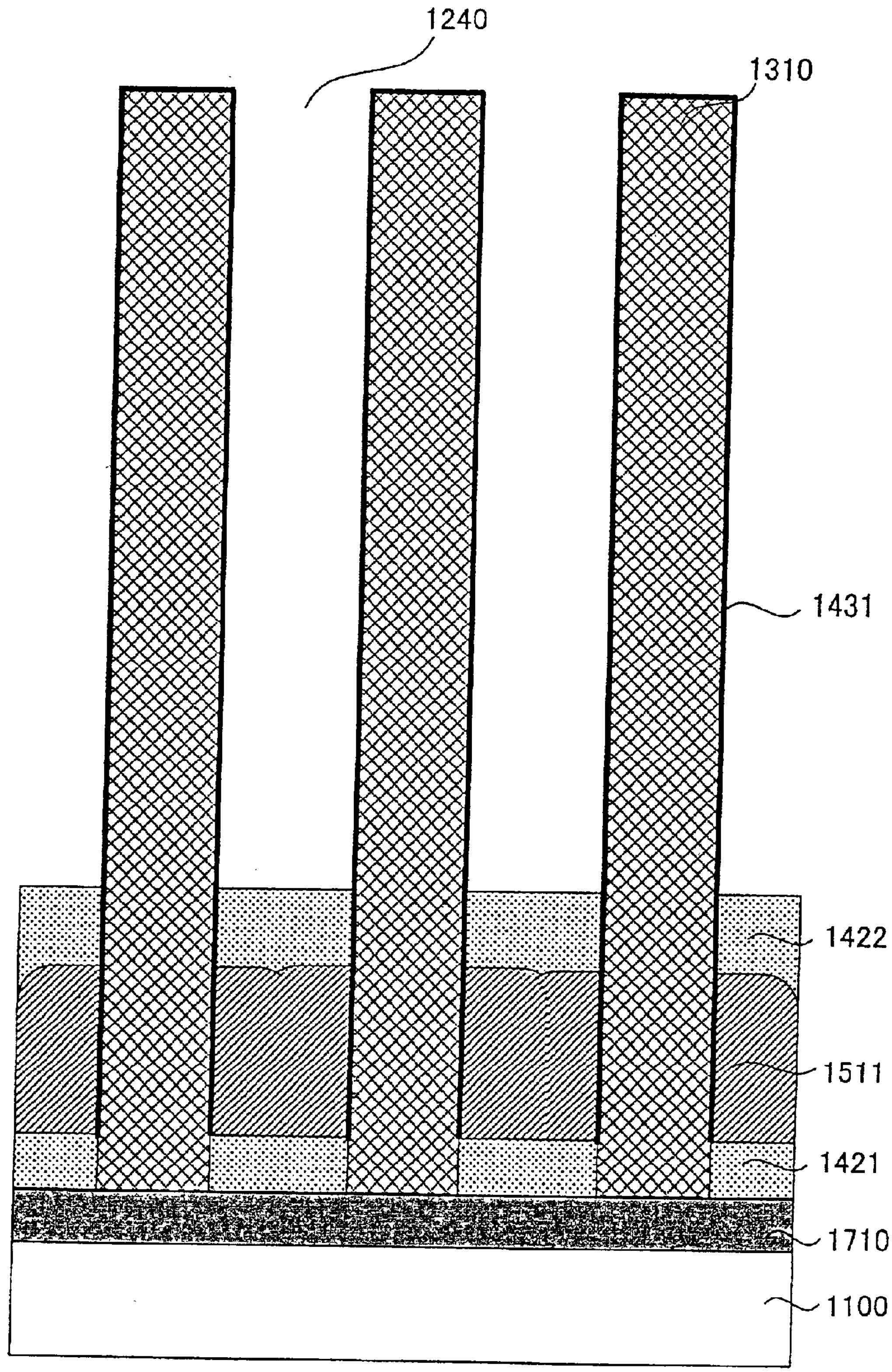

Fig. 1318
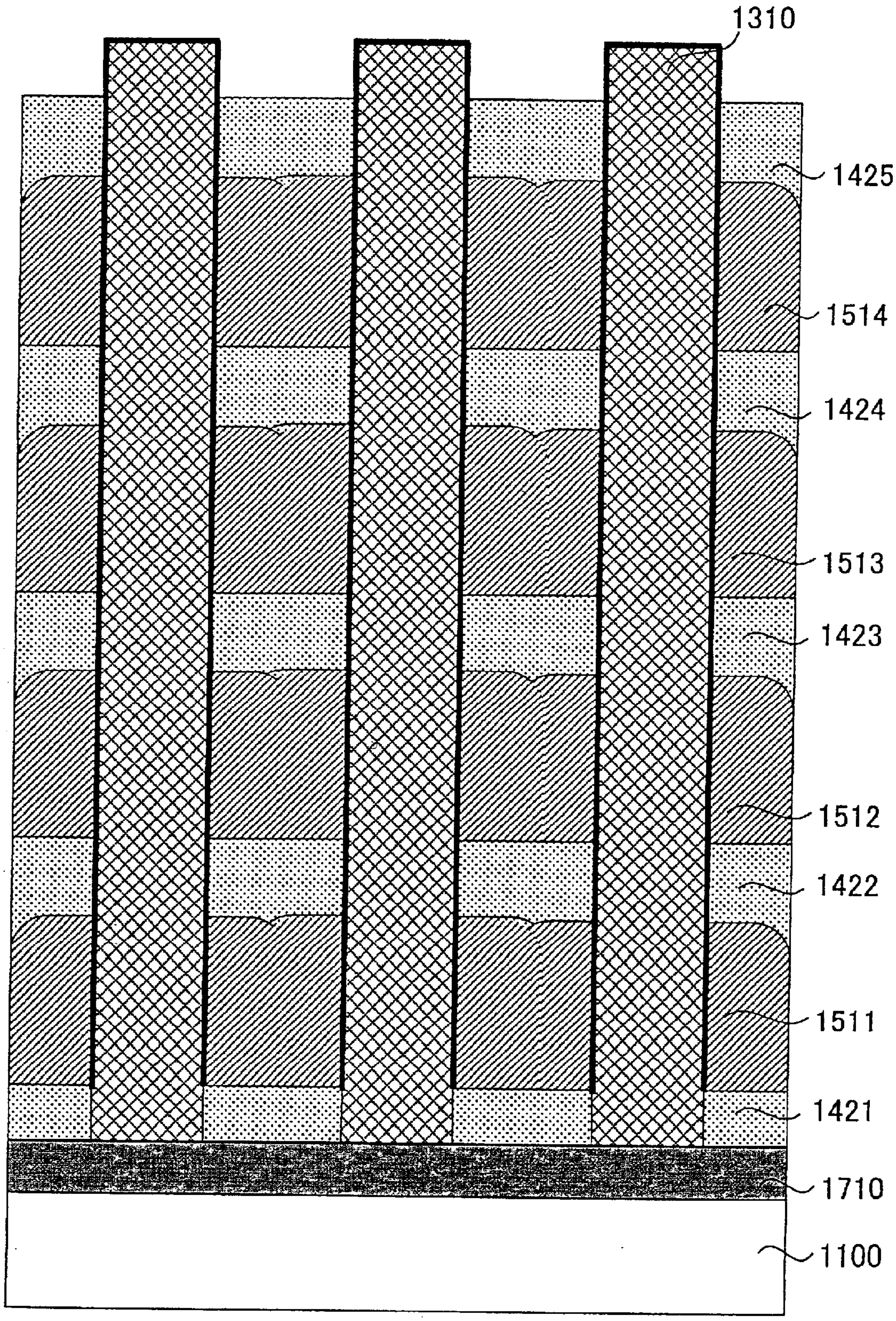

Fig. 1319
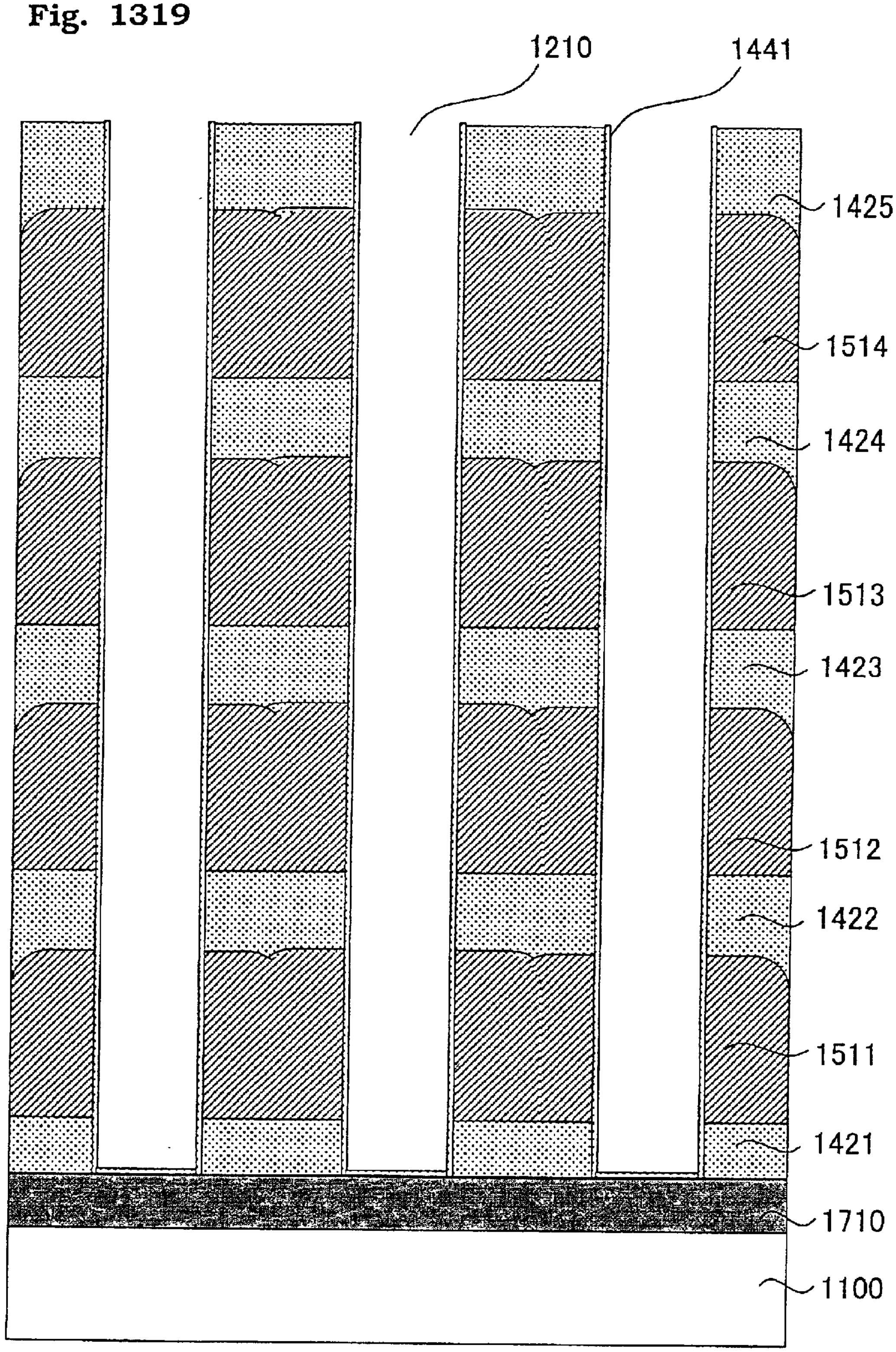

Fig. 1320
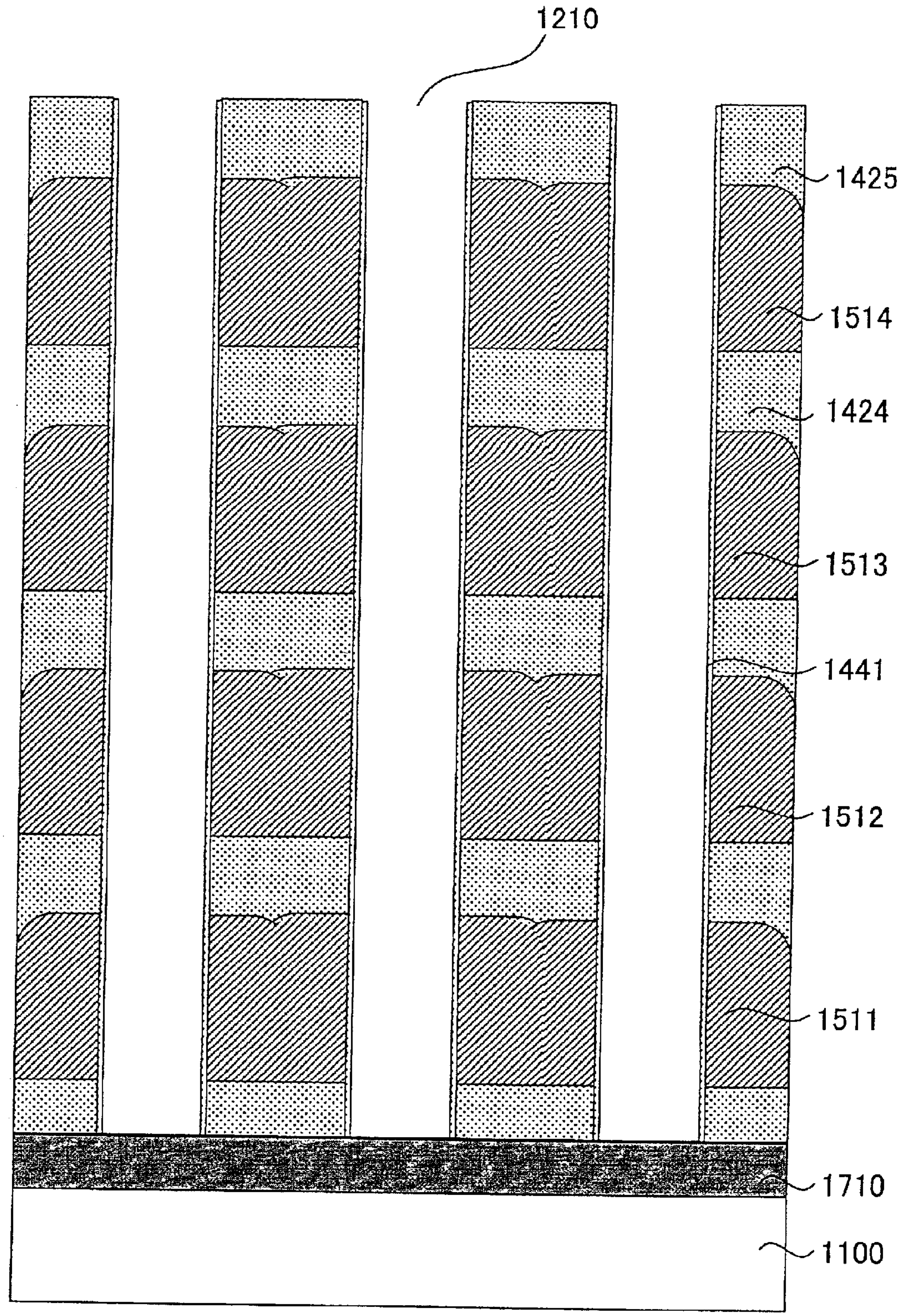

Fig. 1321
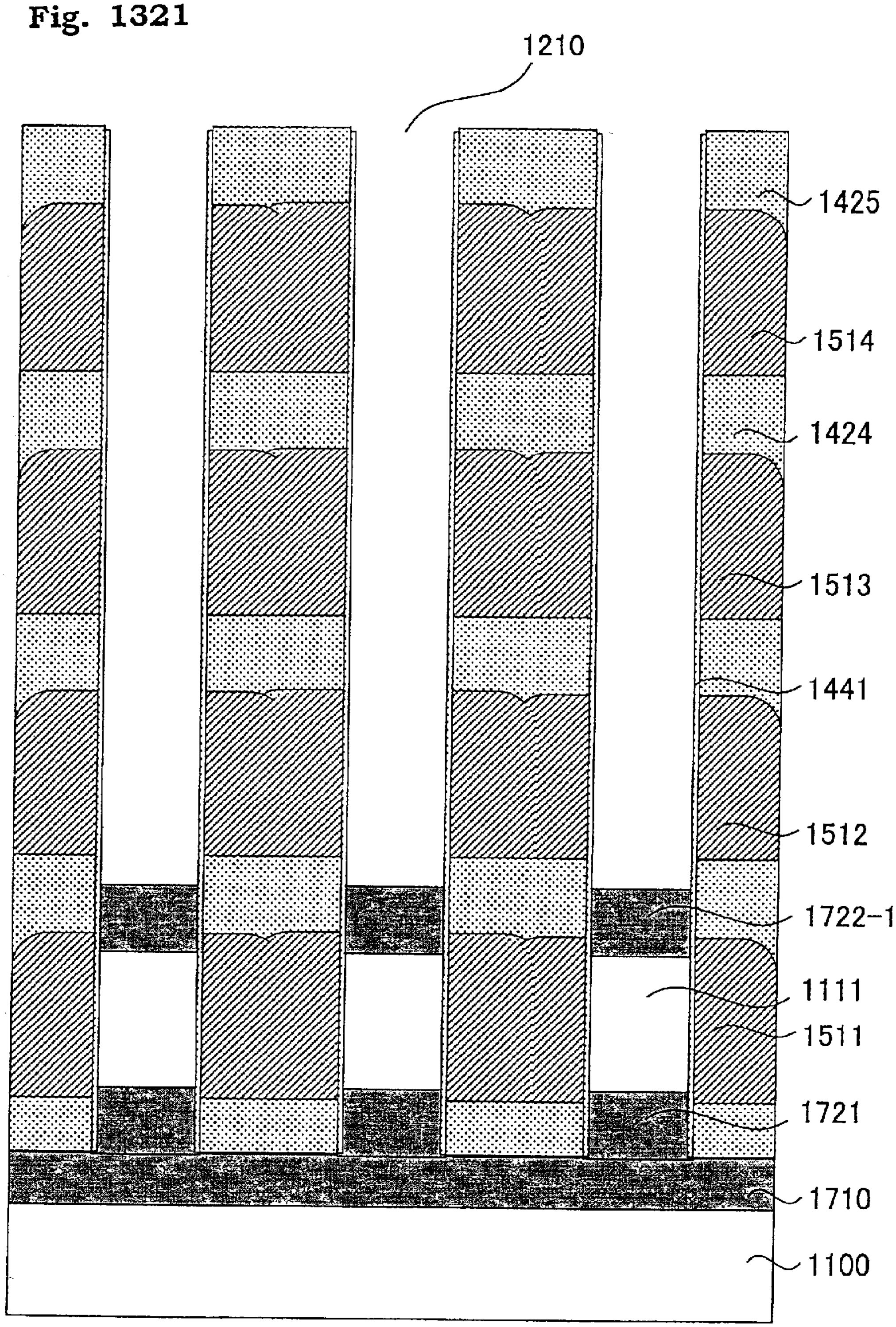

Fig. 1322
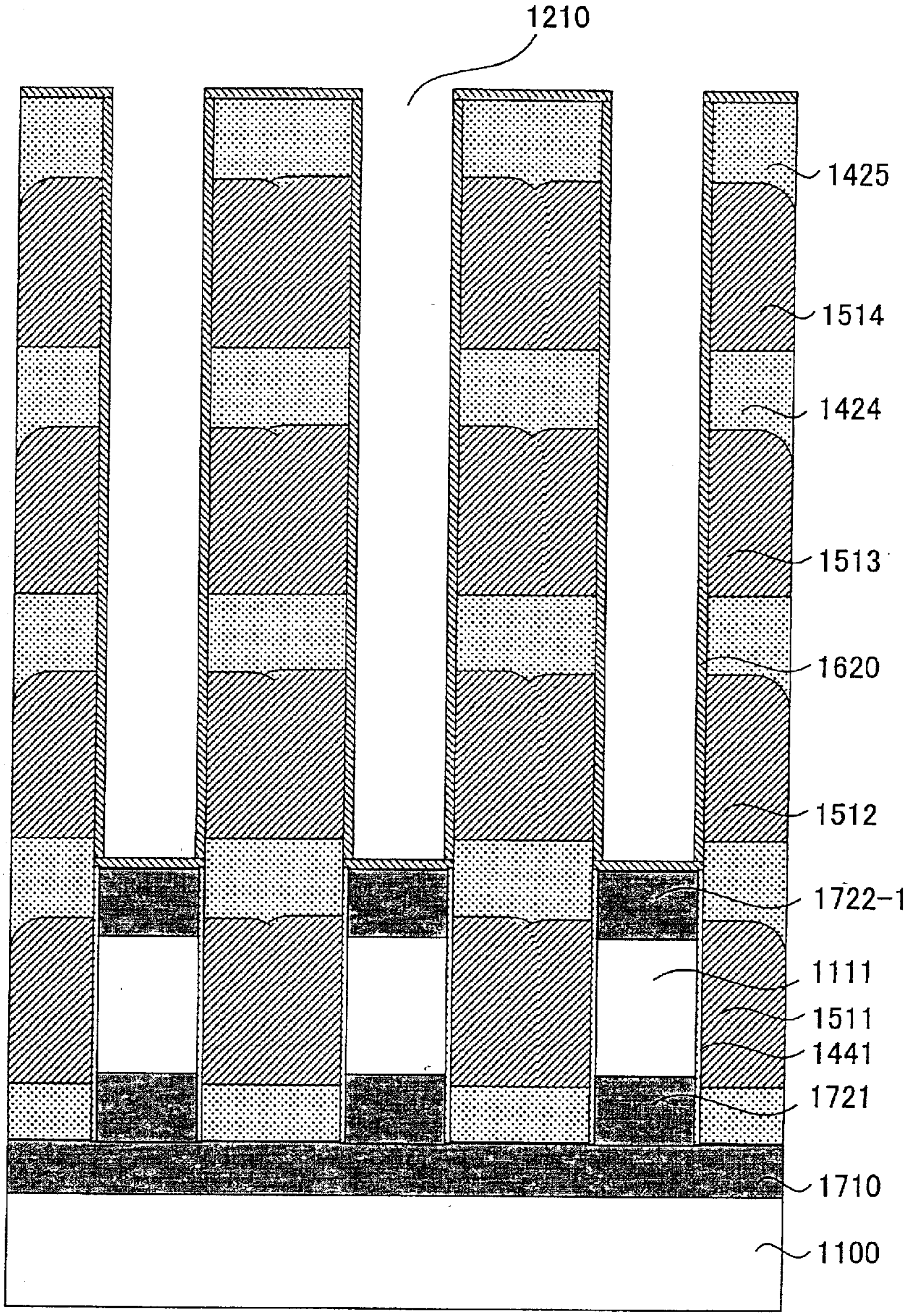

Fig. 1323
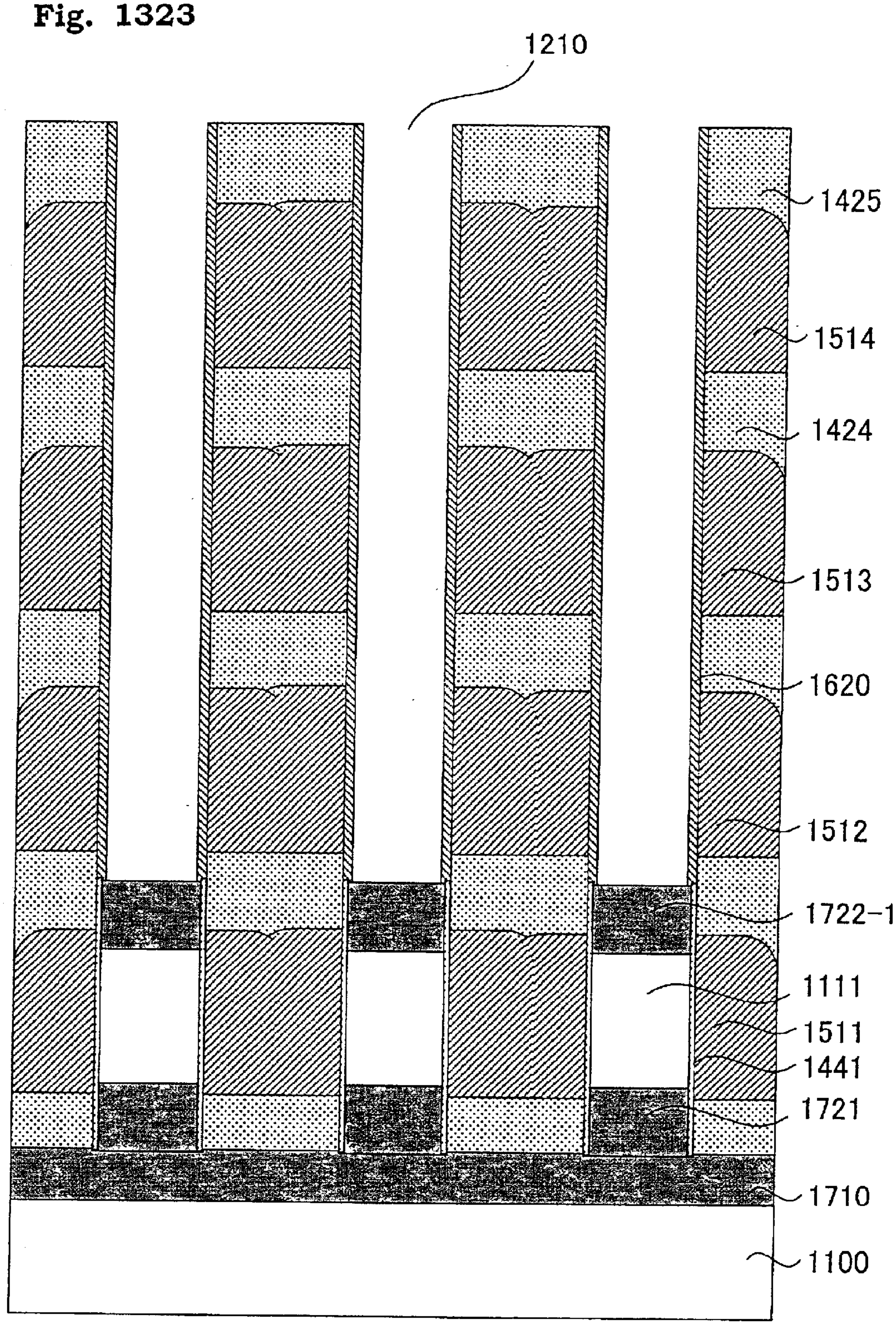

Fig. 1324
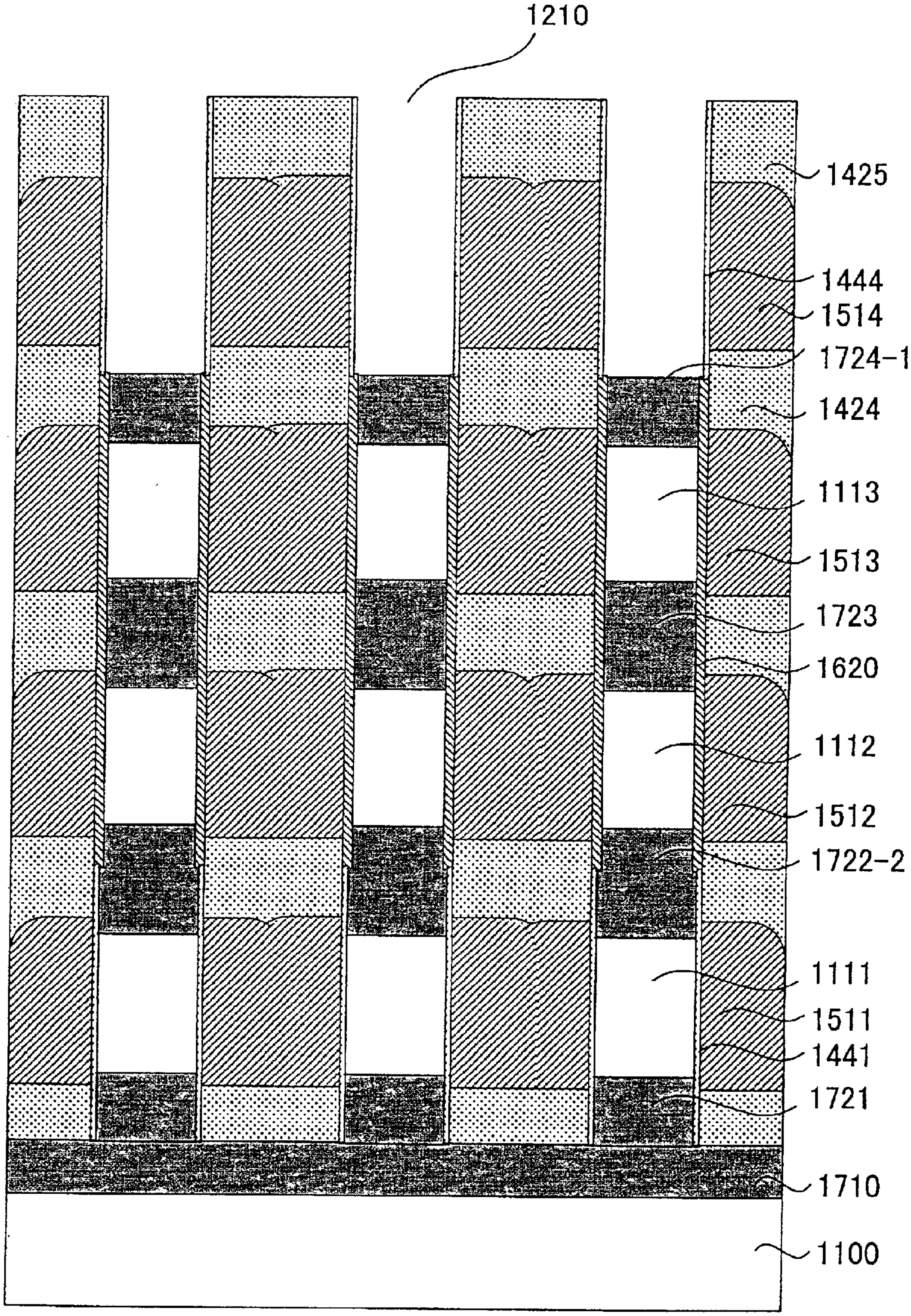

Fig. 1325
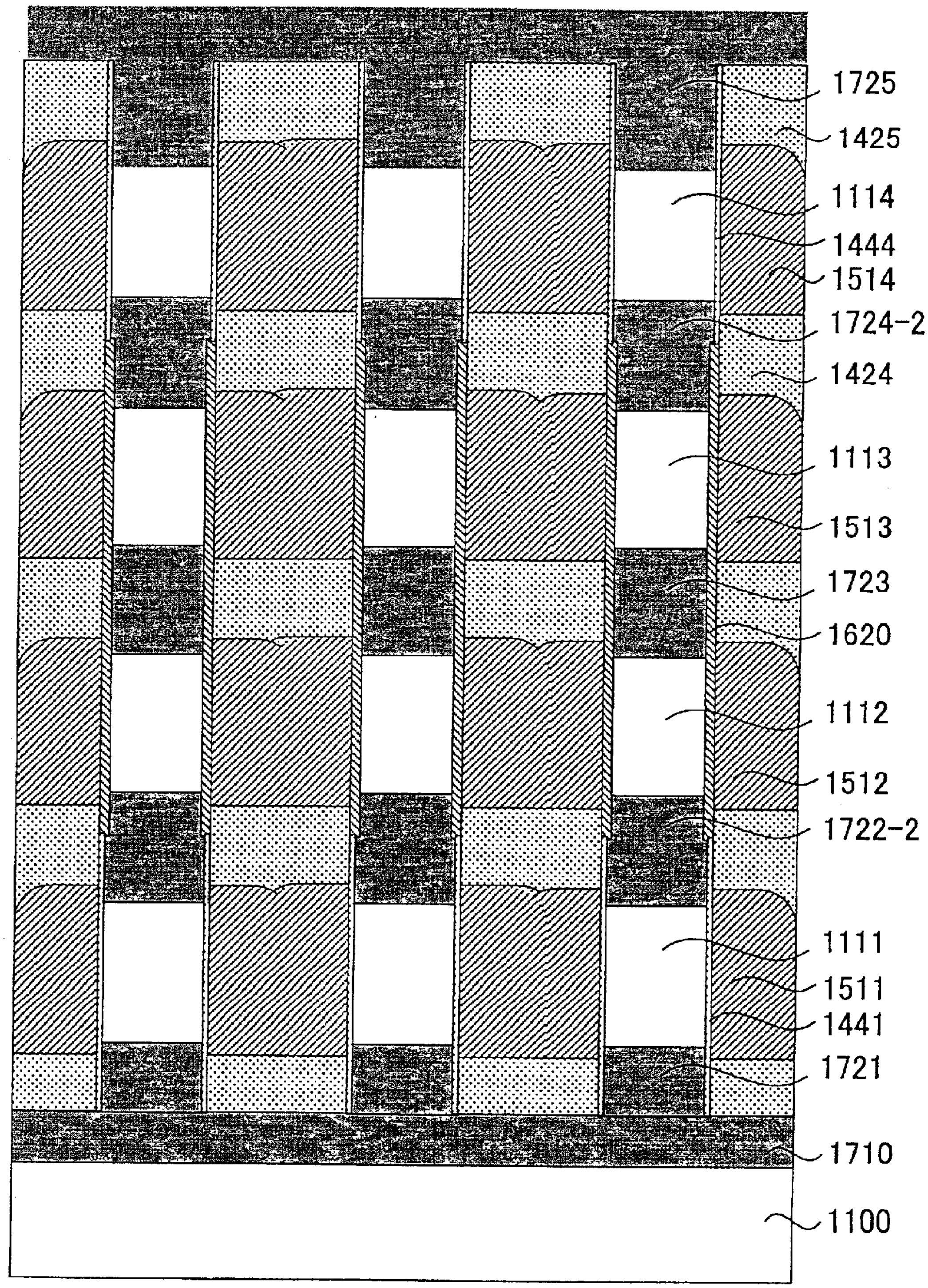

Fig. 1326
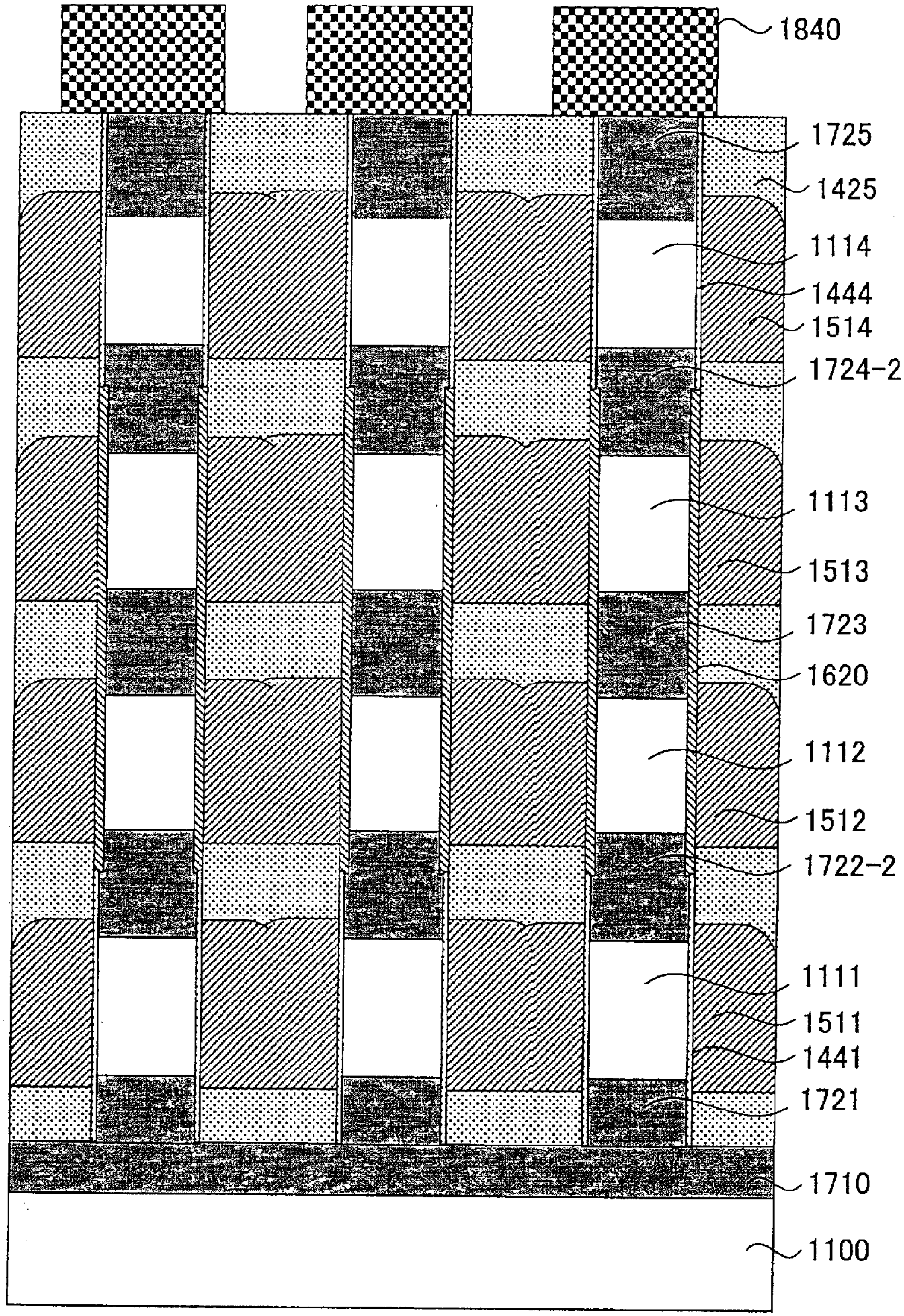

Fig. 1327
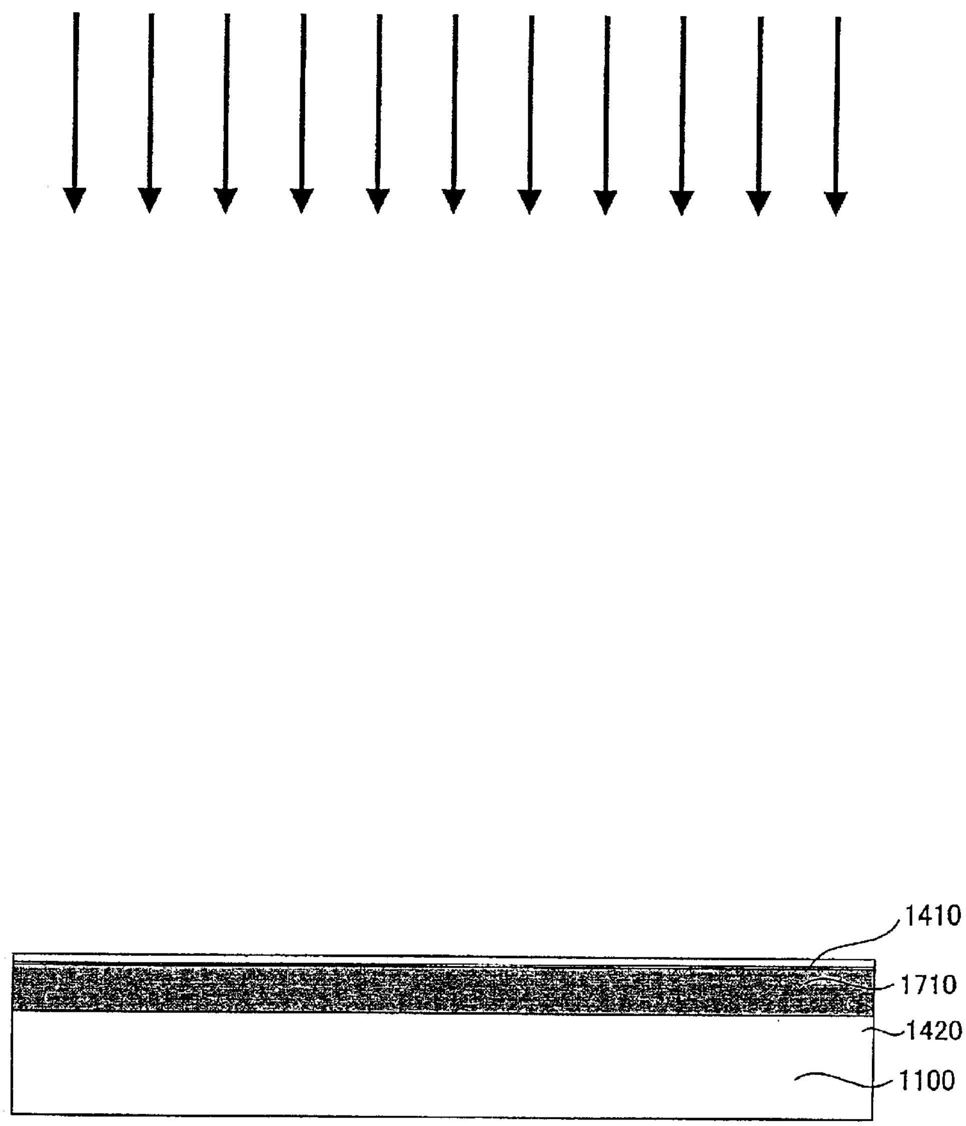

Fig. 1328
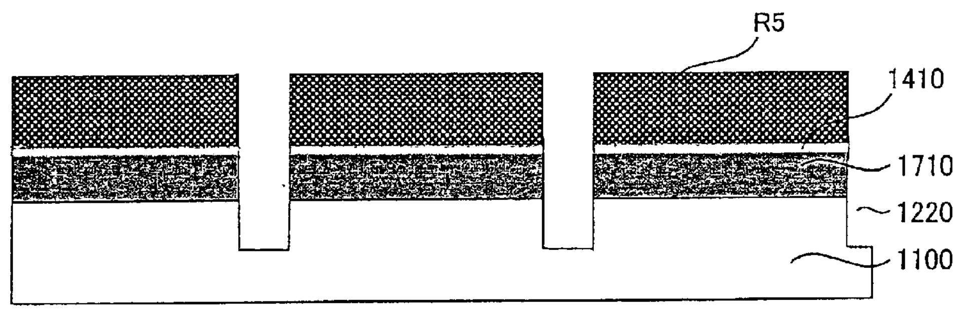
Fig. 1329
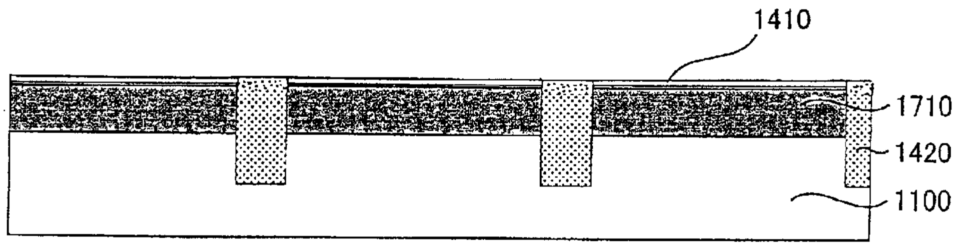

Fig. 1330
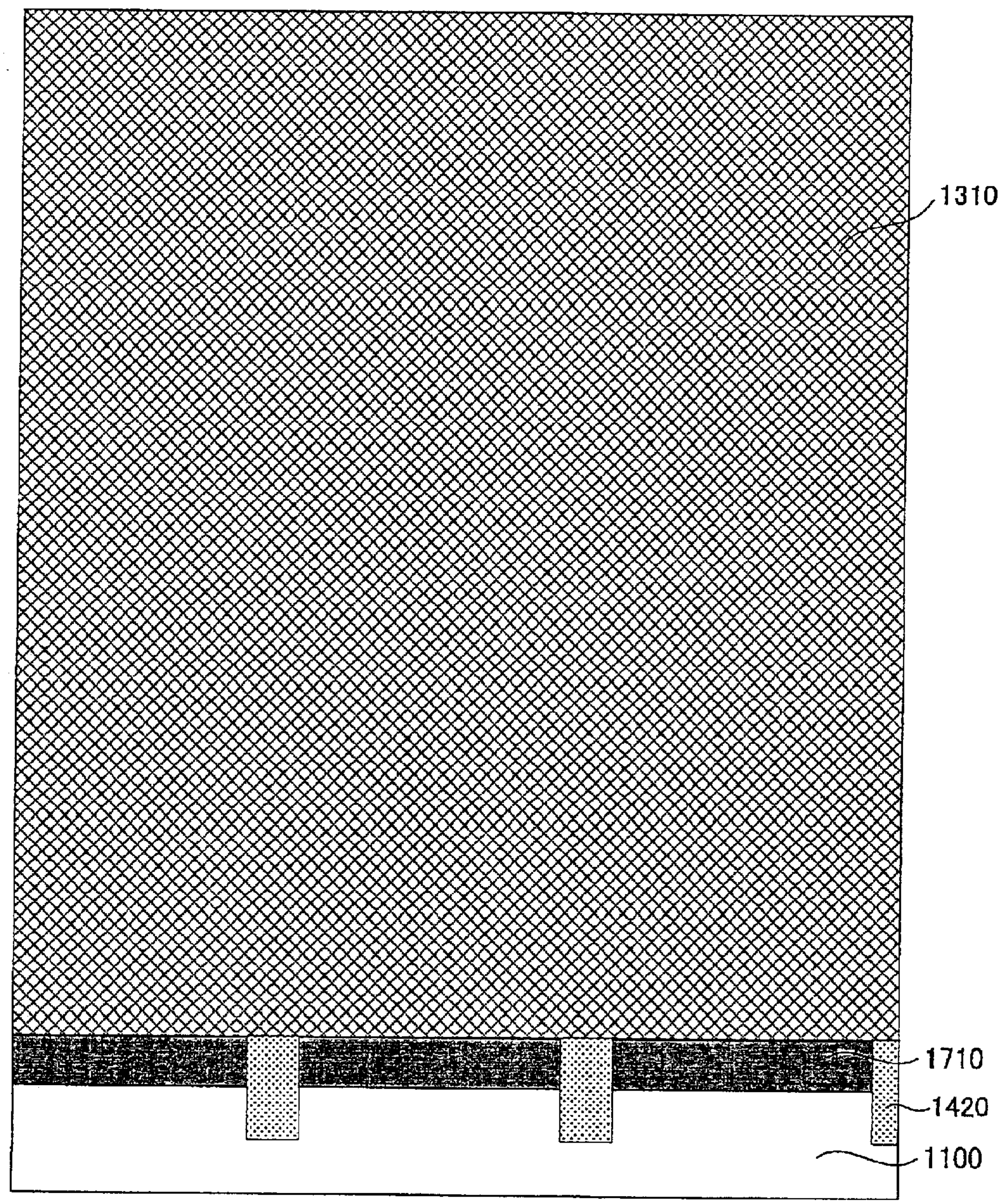

Fig. 1331
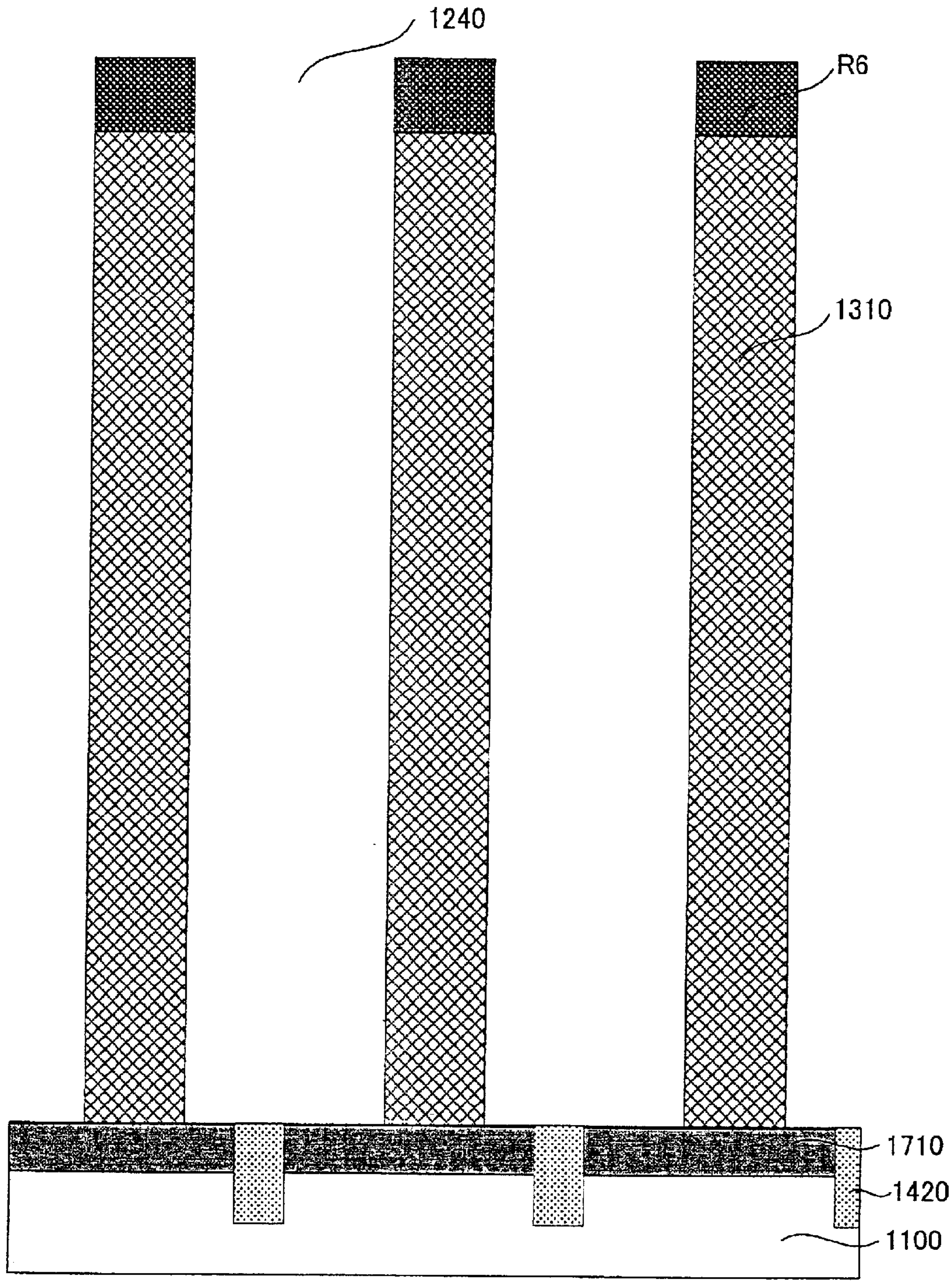

Fig. 1332
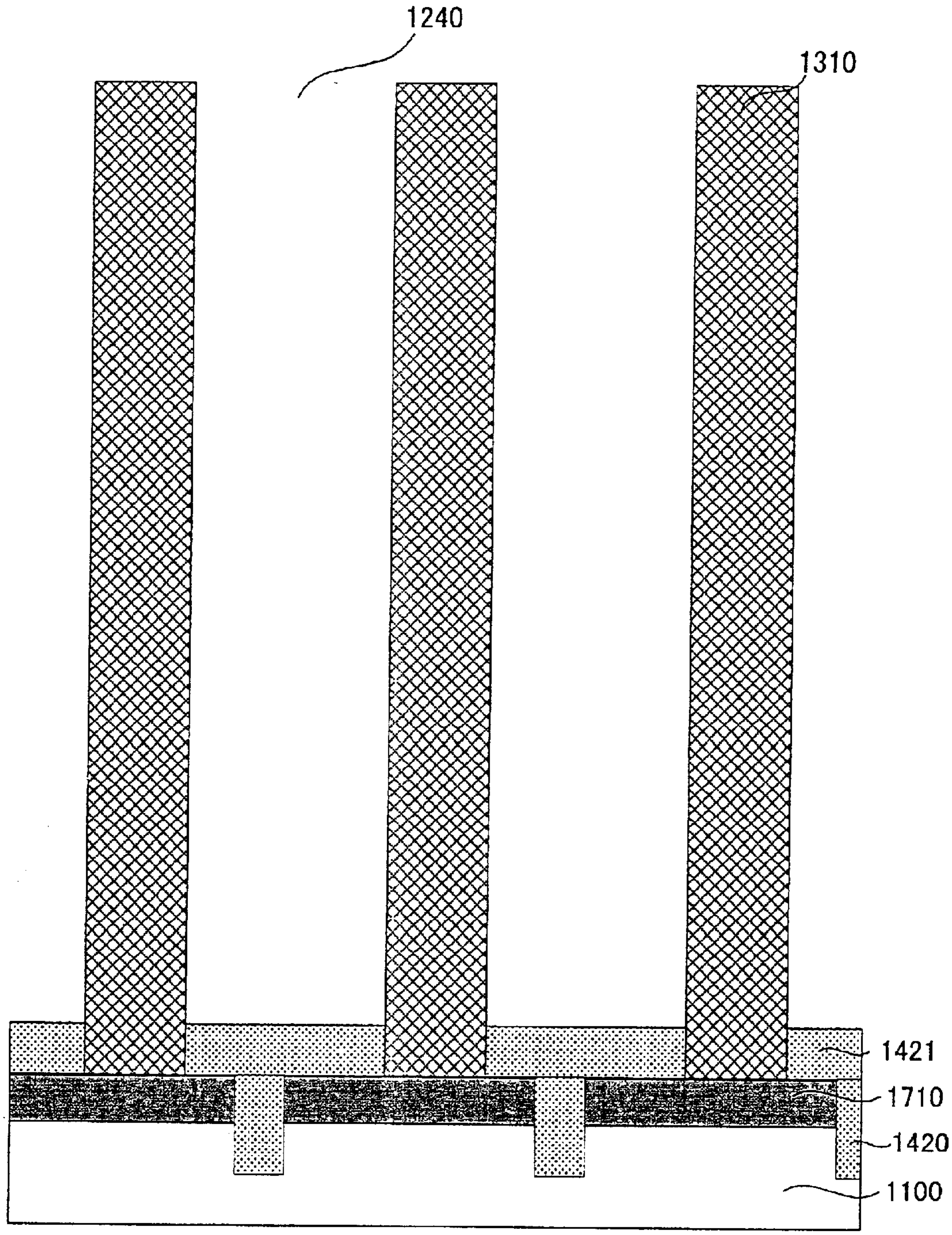

Fig. 1333
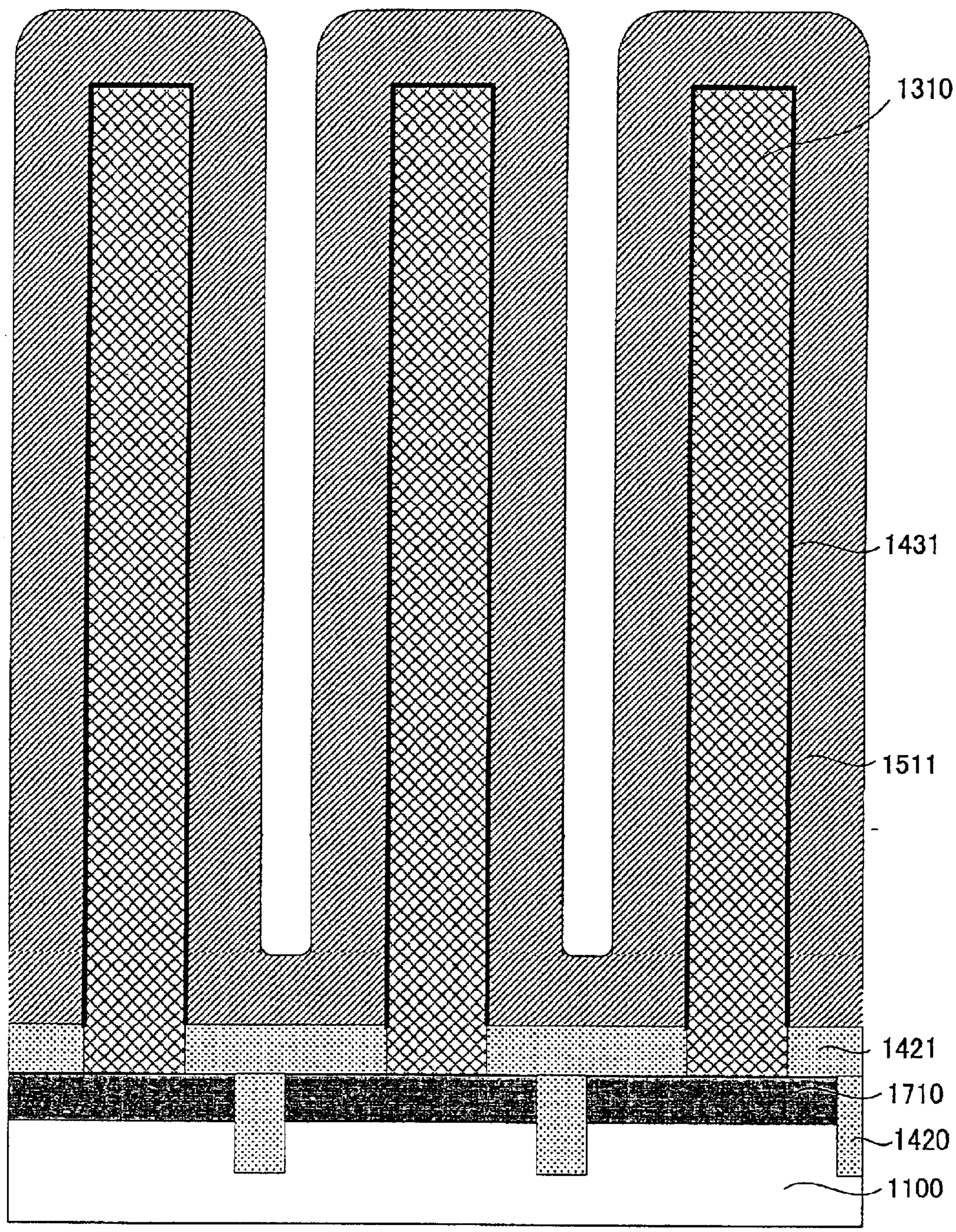

Fig. 1334
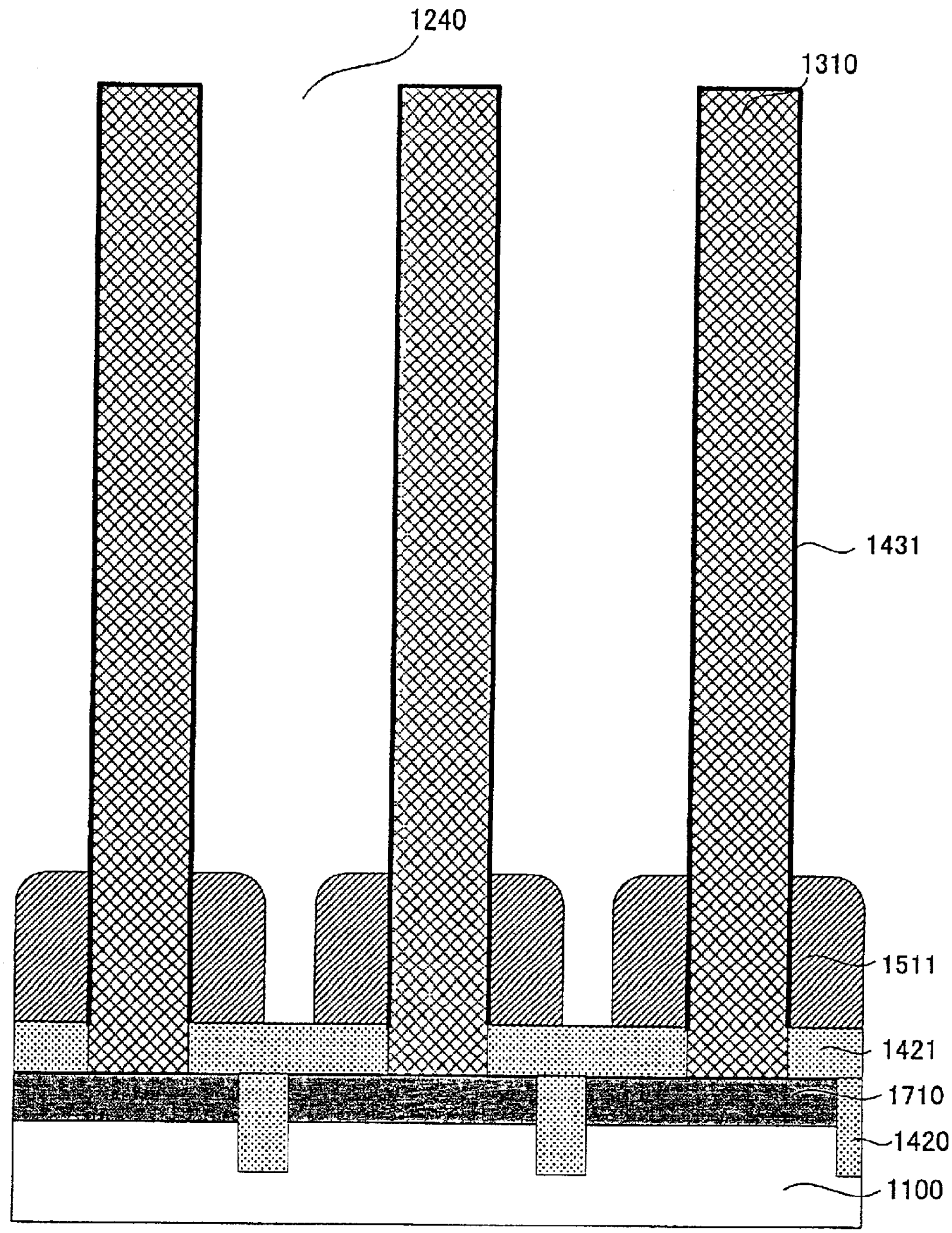

Fig. 1335
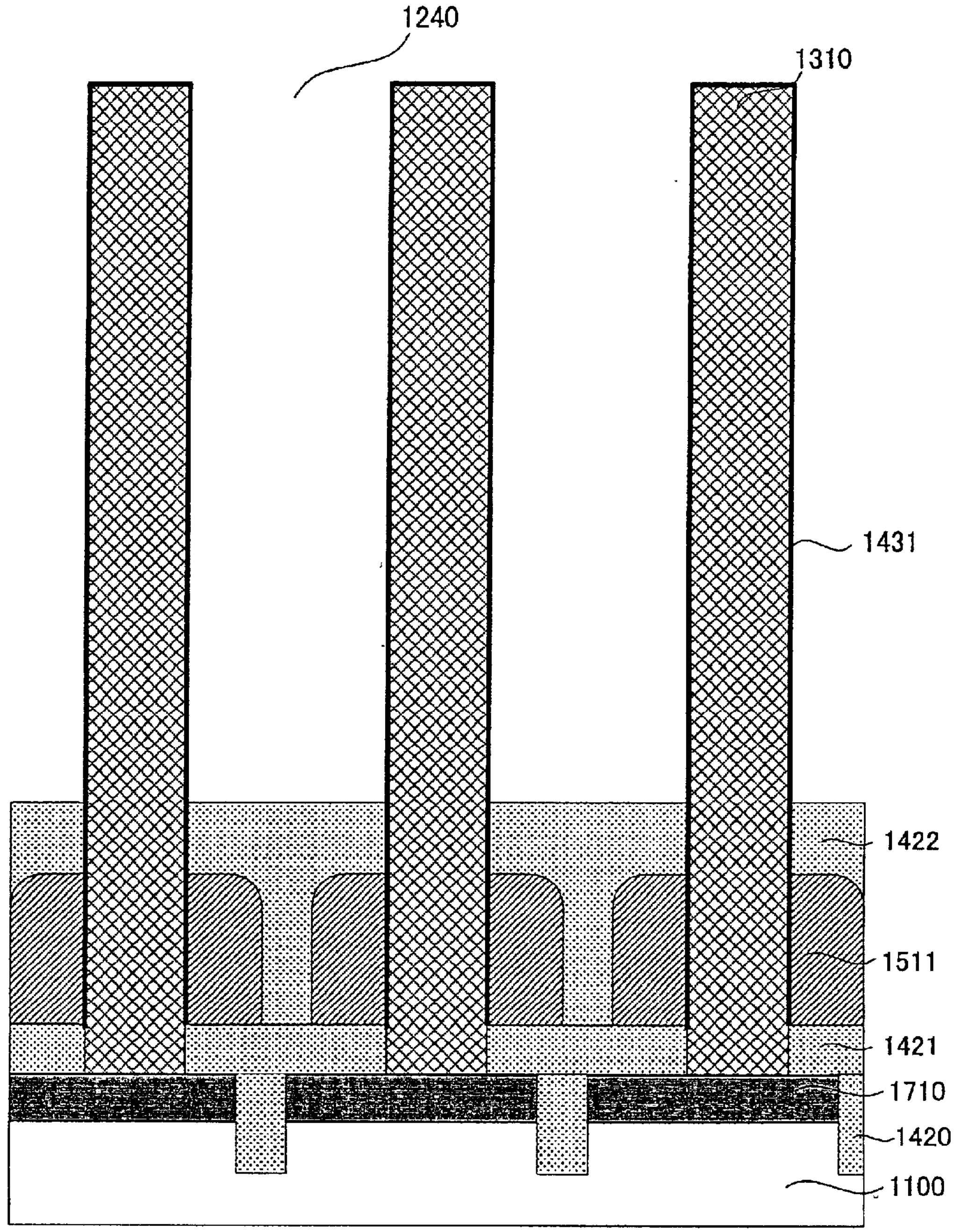

Fig. 1336
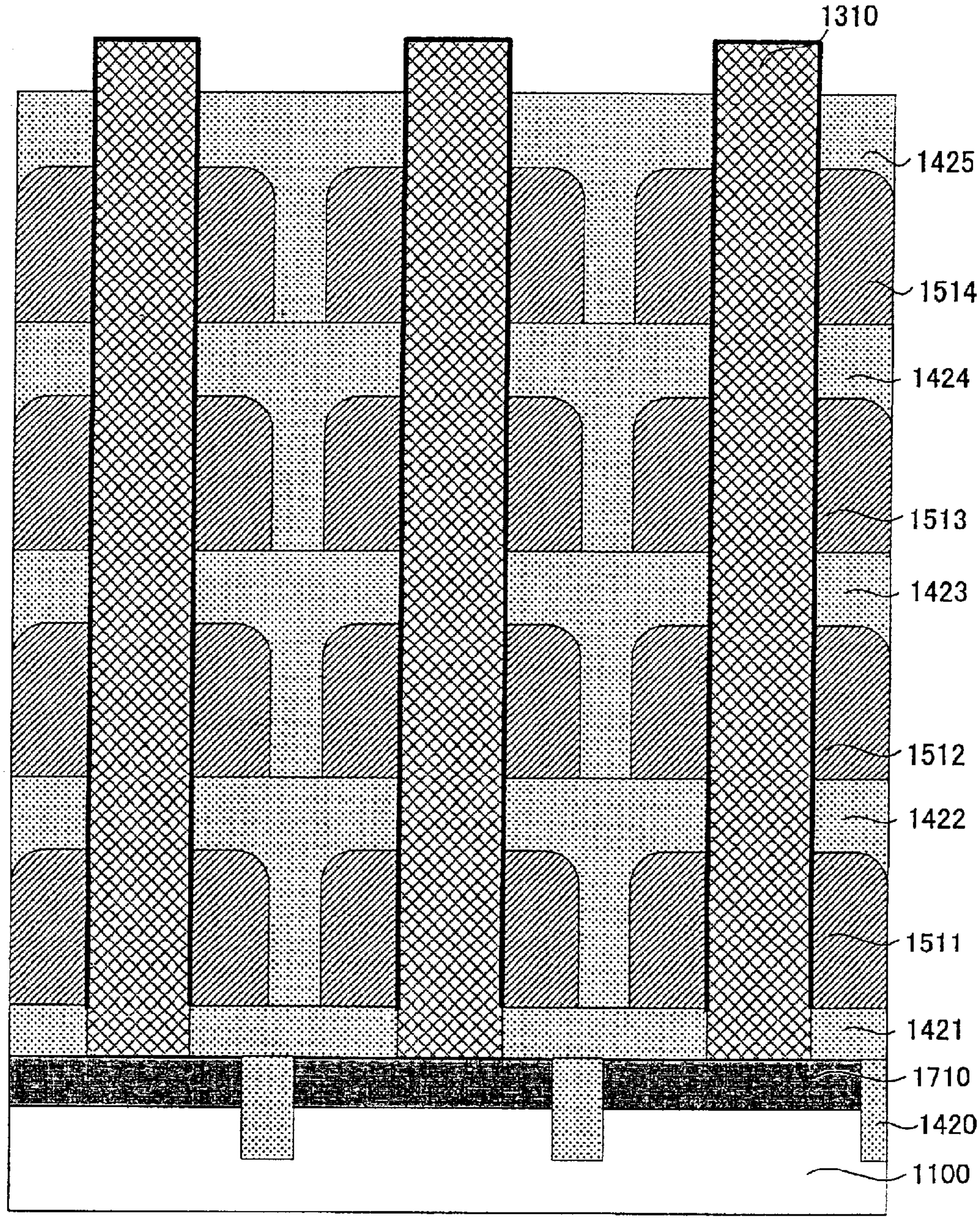

Fig. 1337
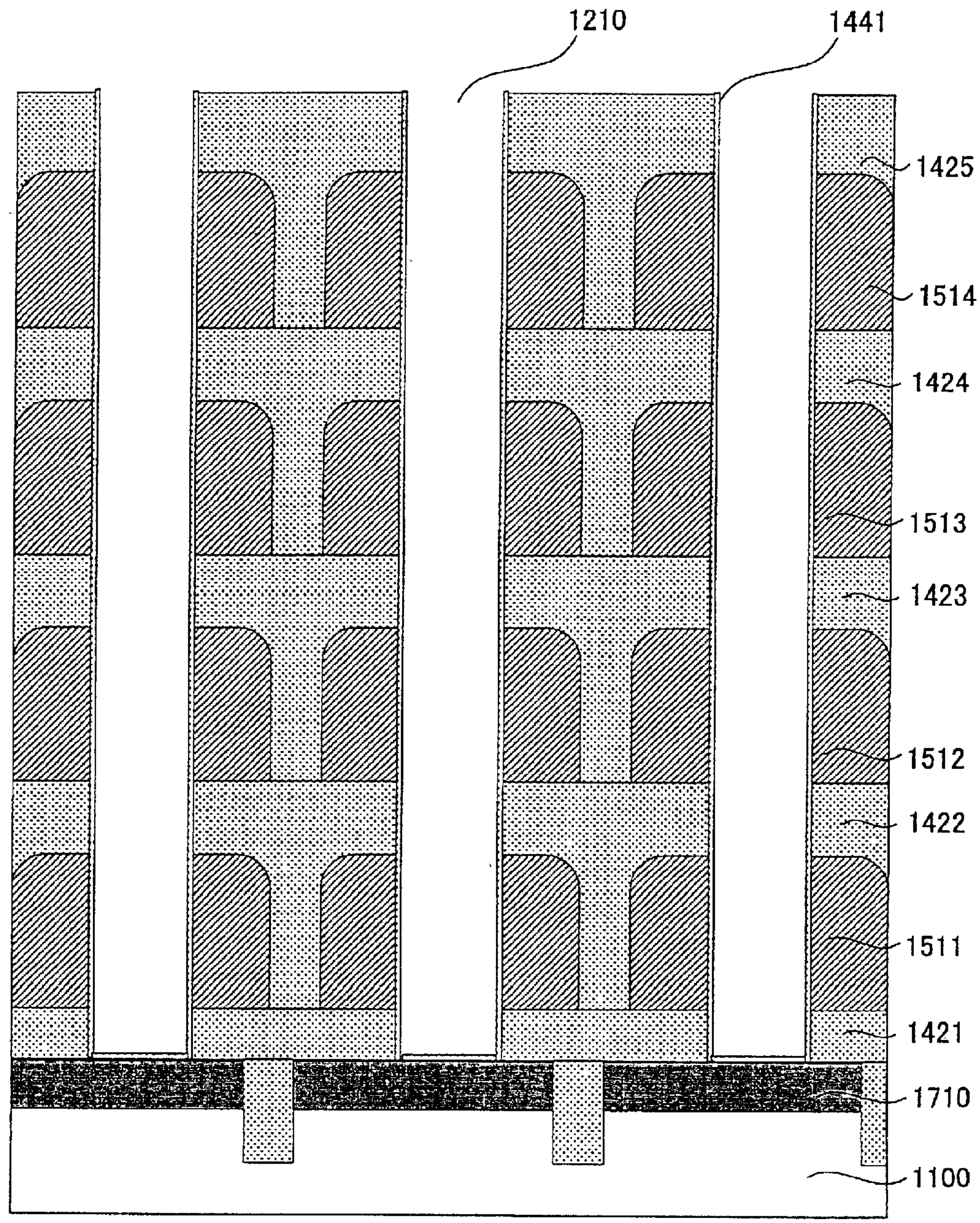

Fig. 1338
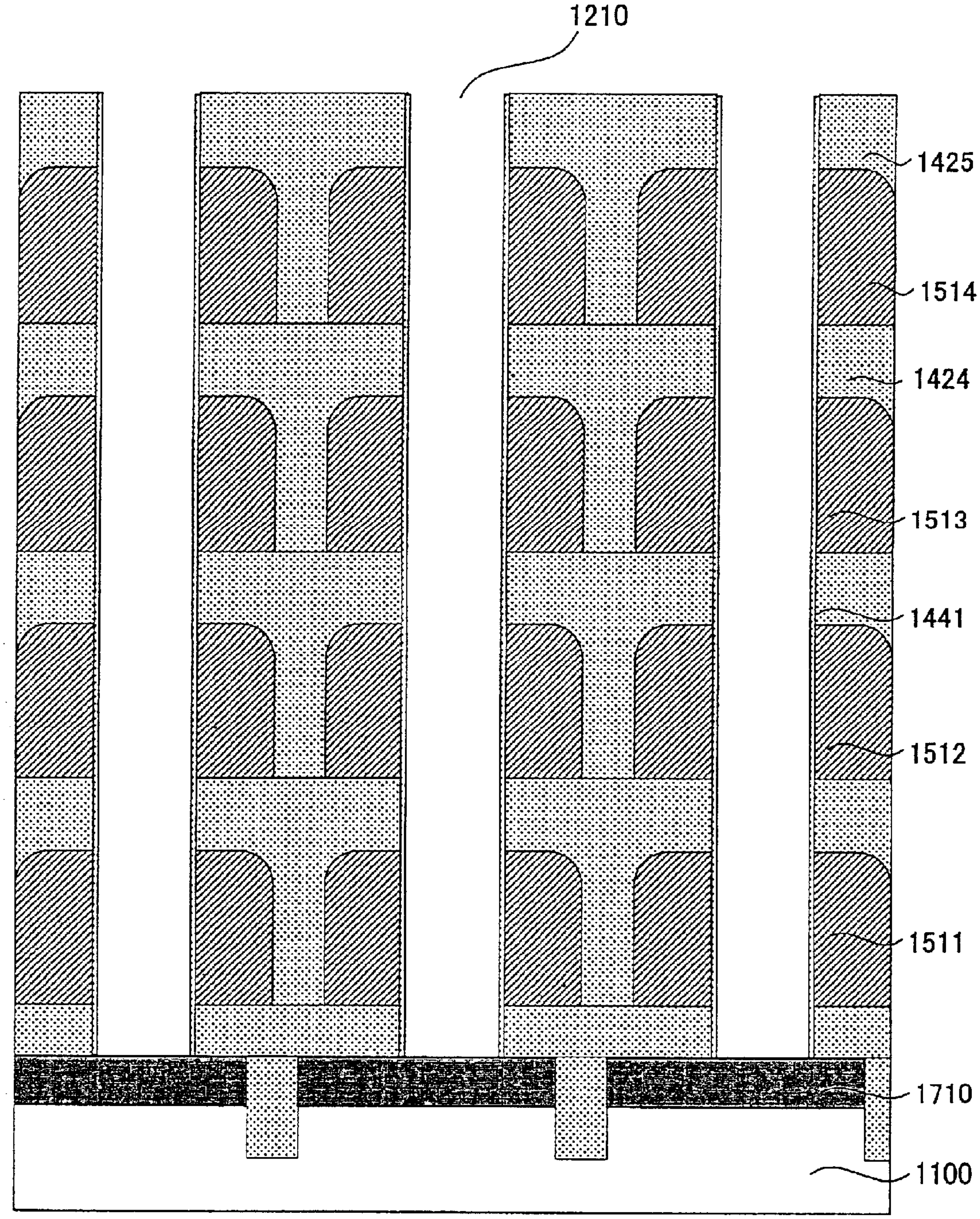

Fig. 1339
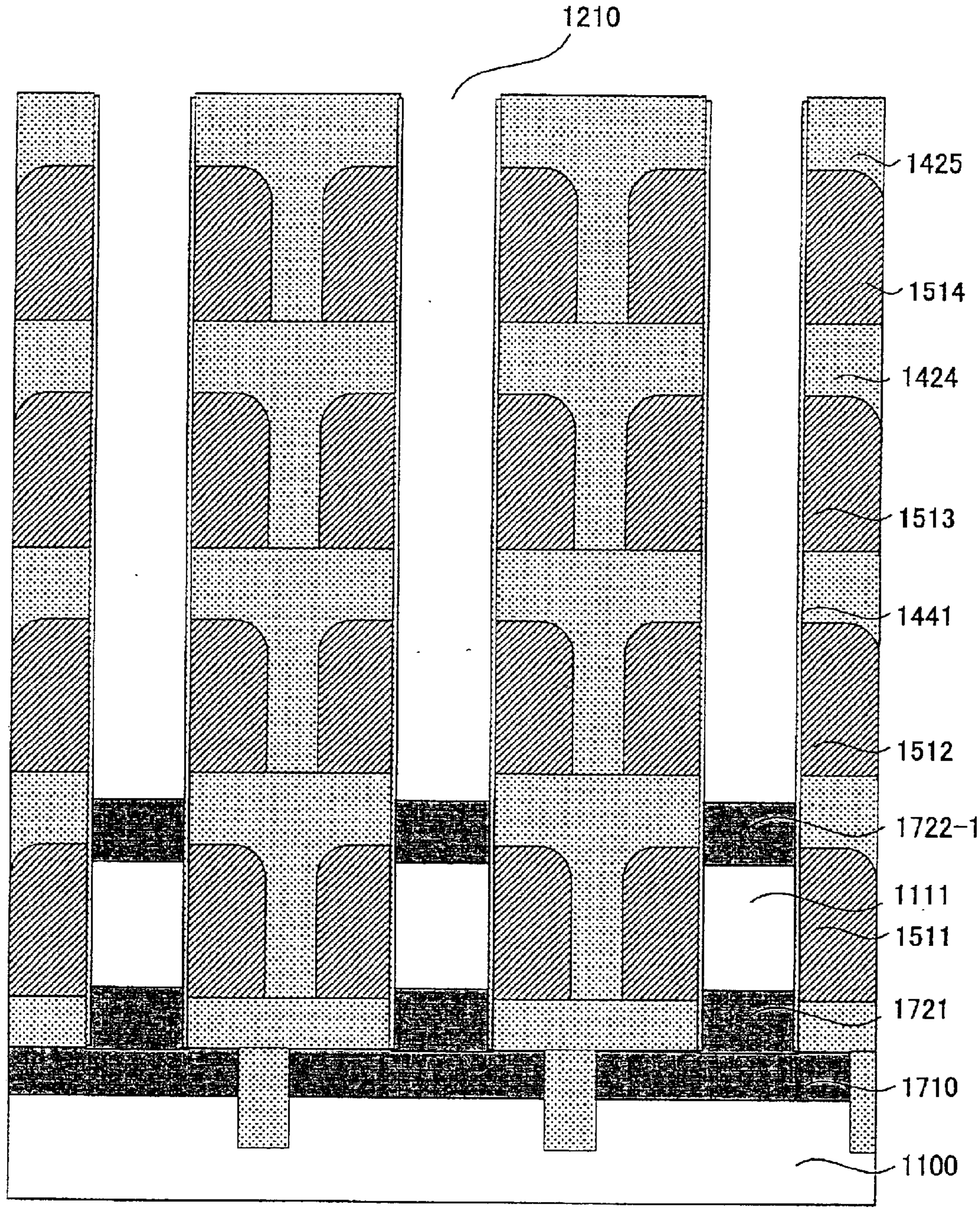

Fig. 1340
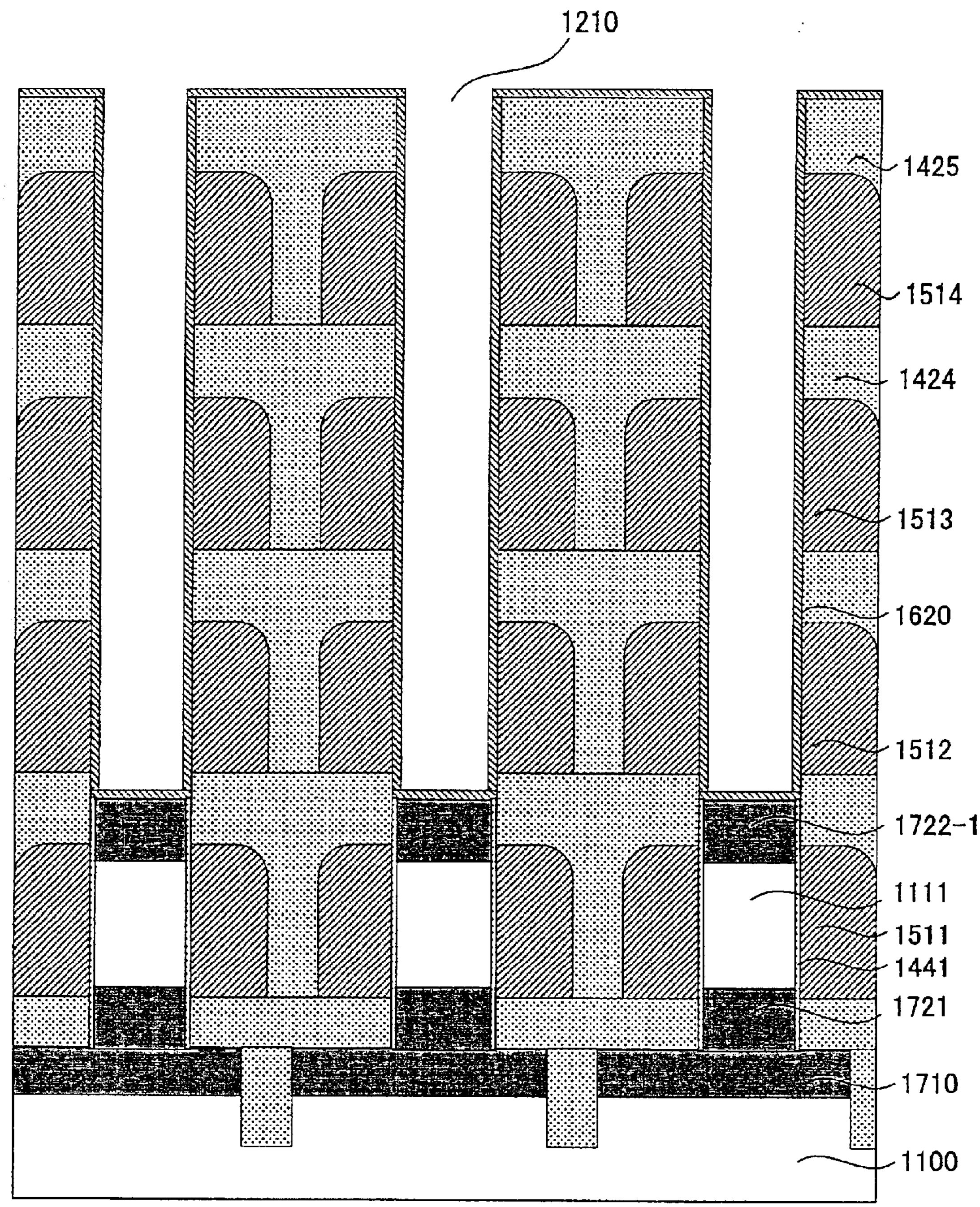

Fig. 1341
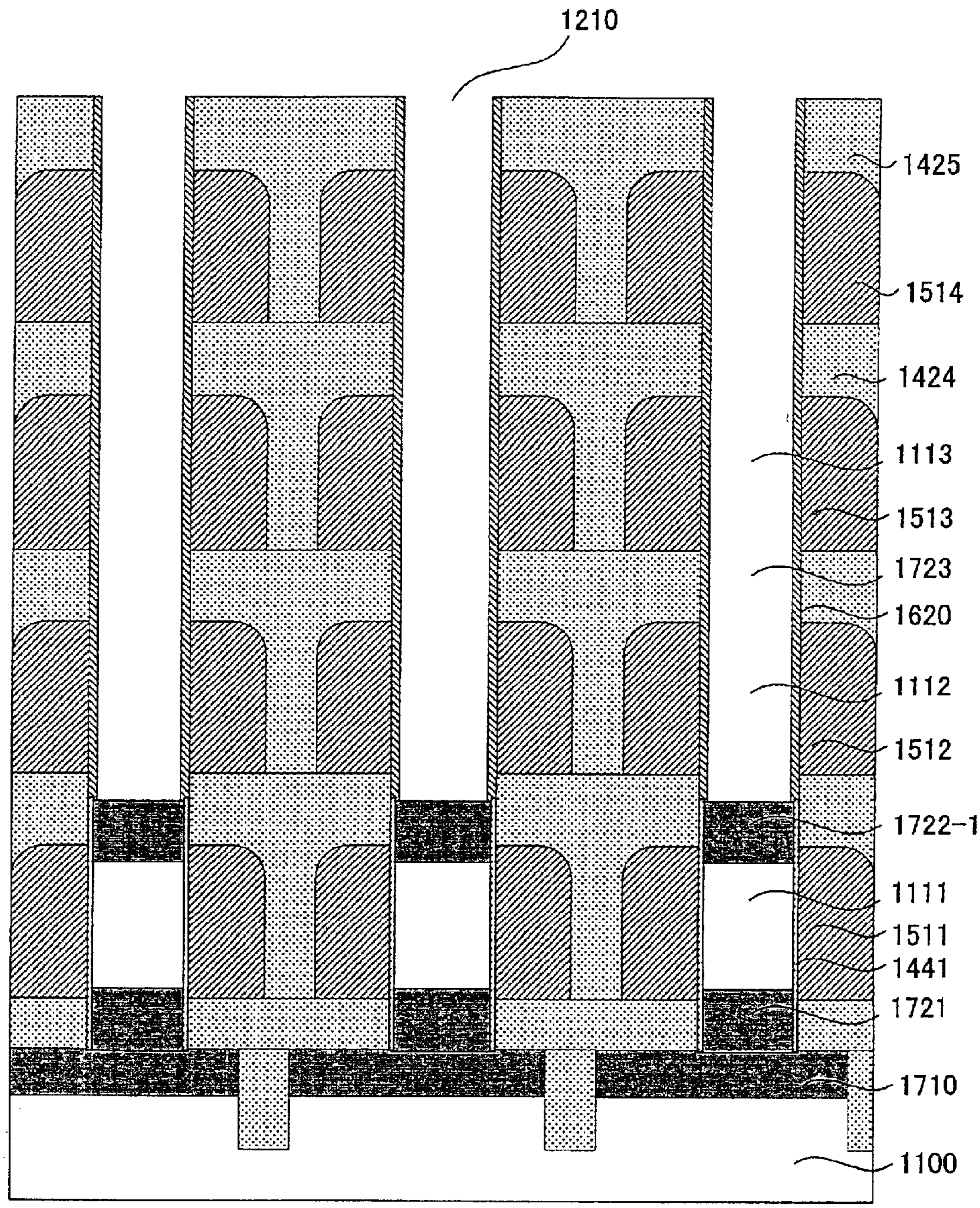

Fig. 1342
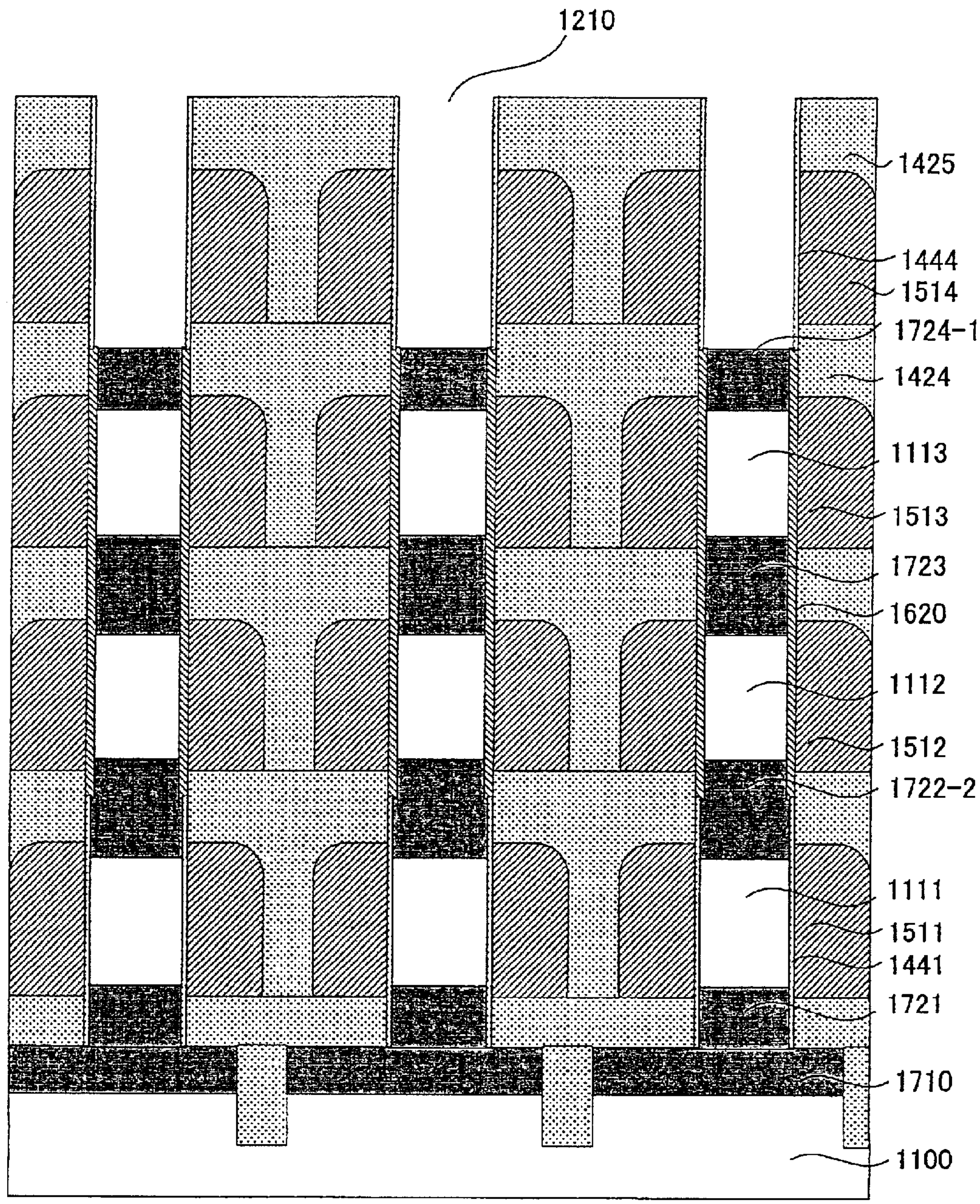

Fig. 1343
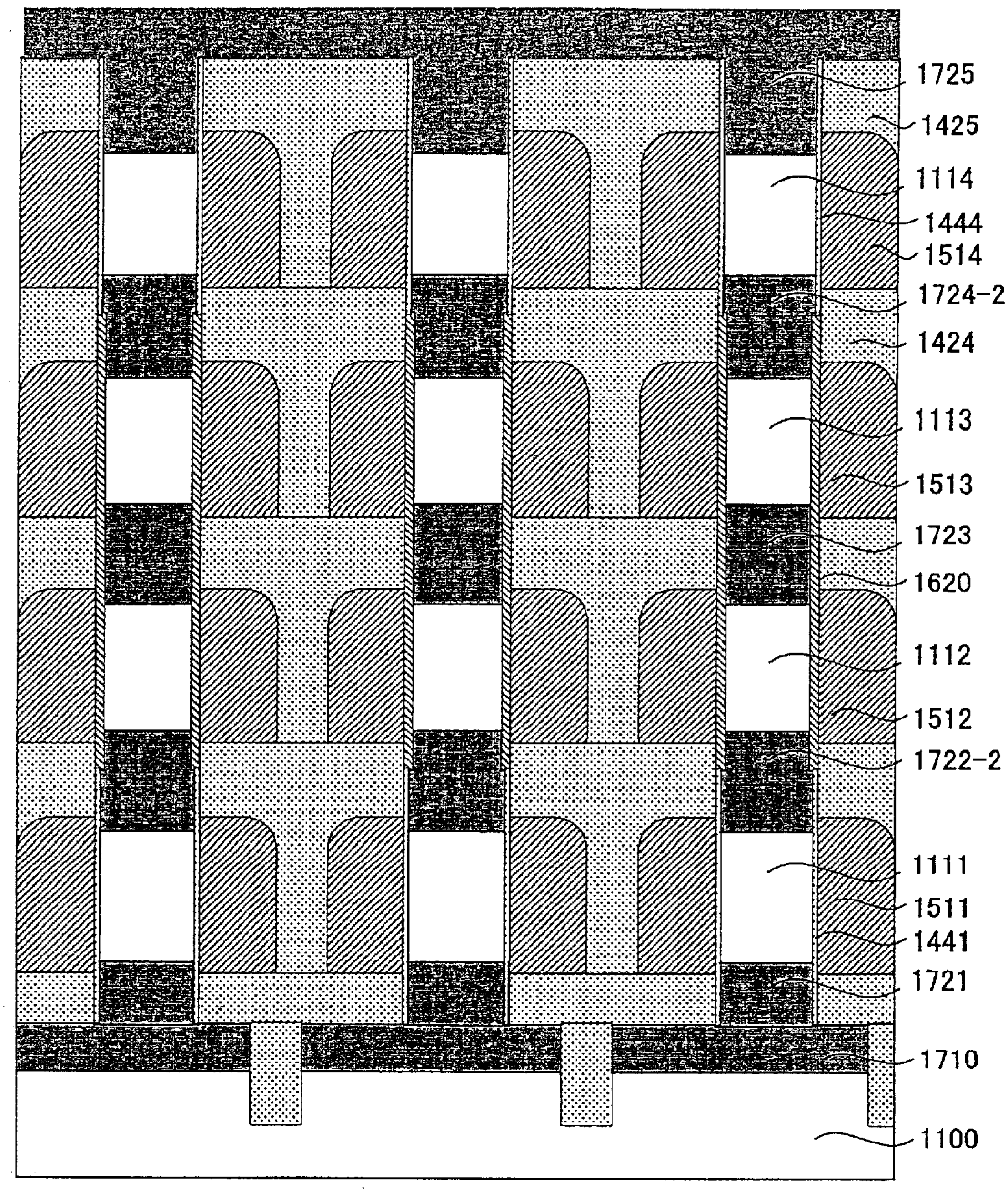

Fig. 1344
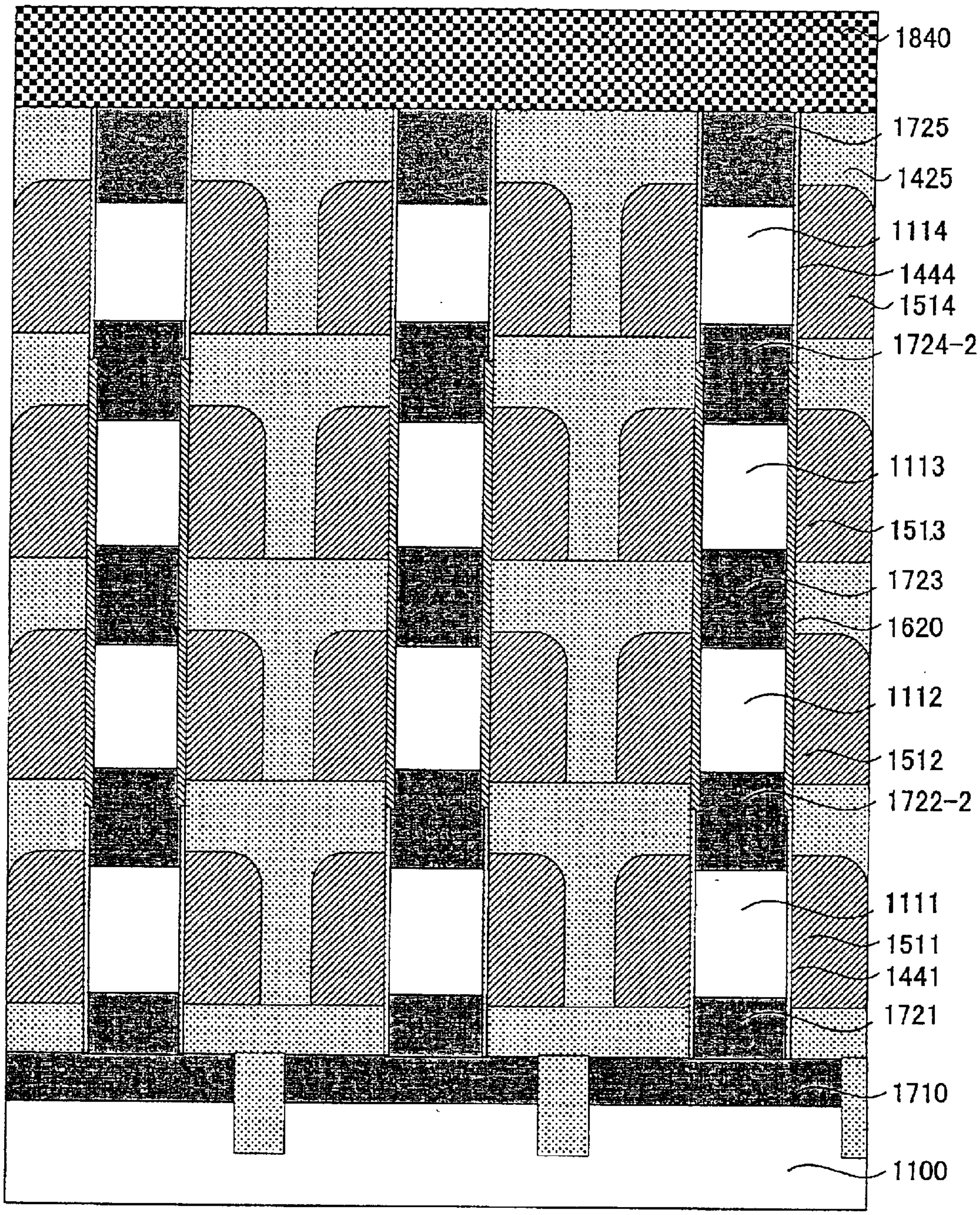

Fig. 1345
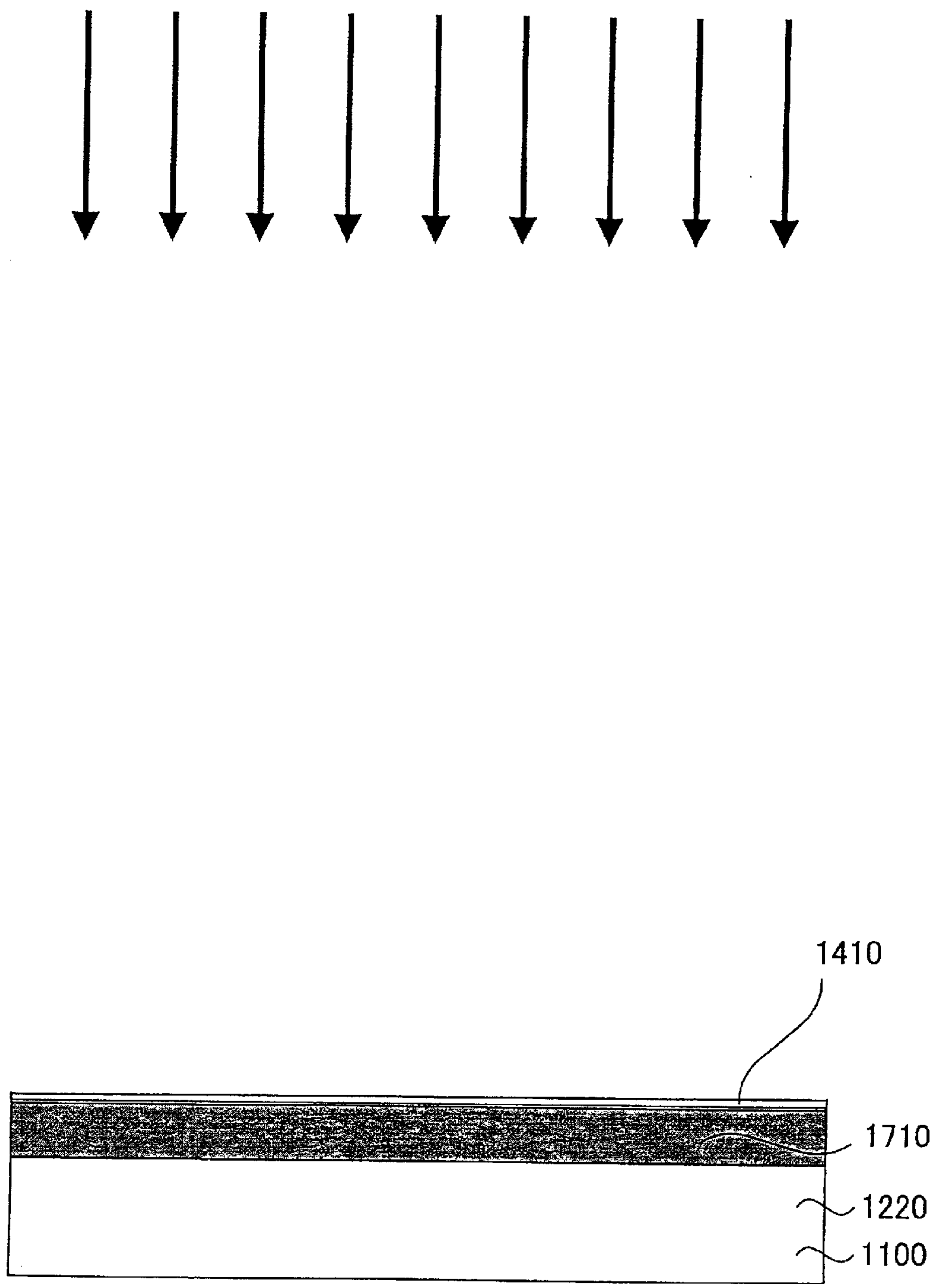

Fig. 1346
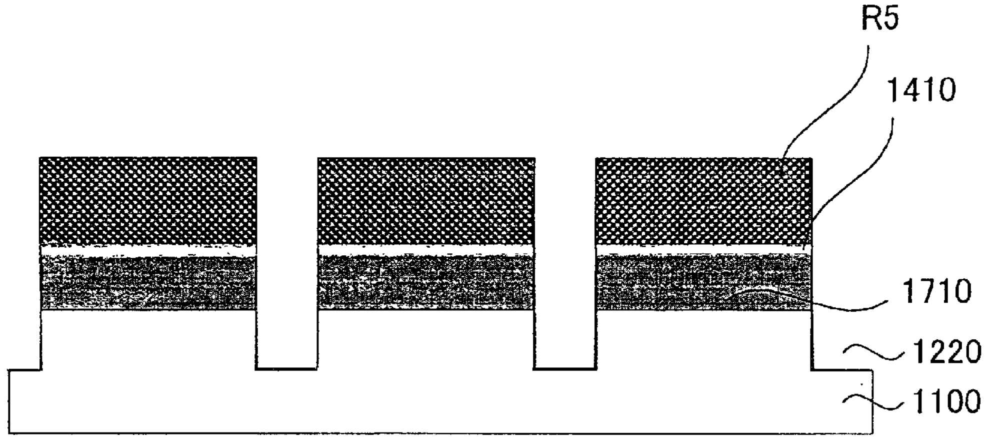
Fig. 1347
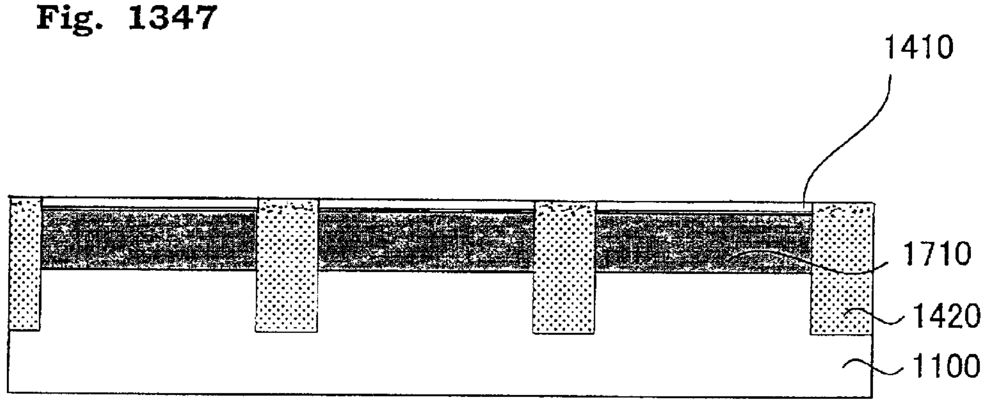

Fig. 1348
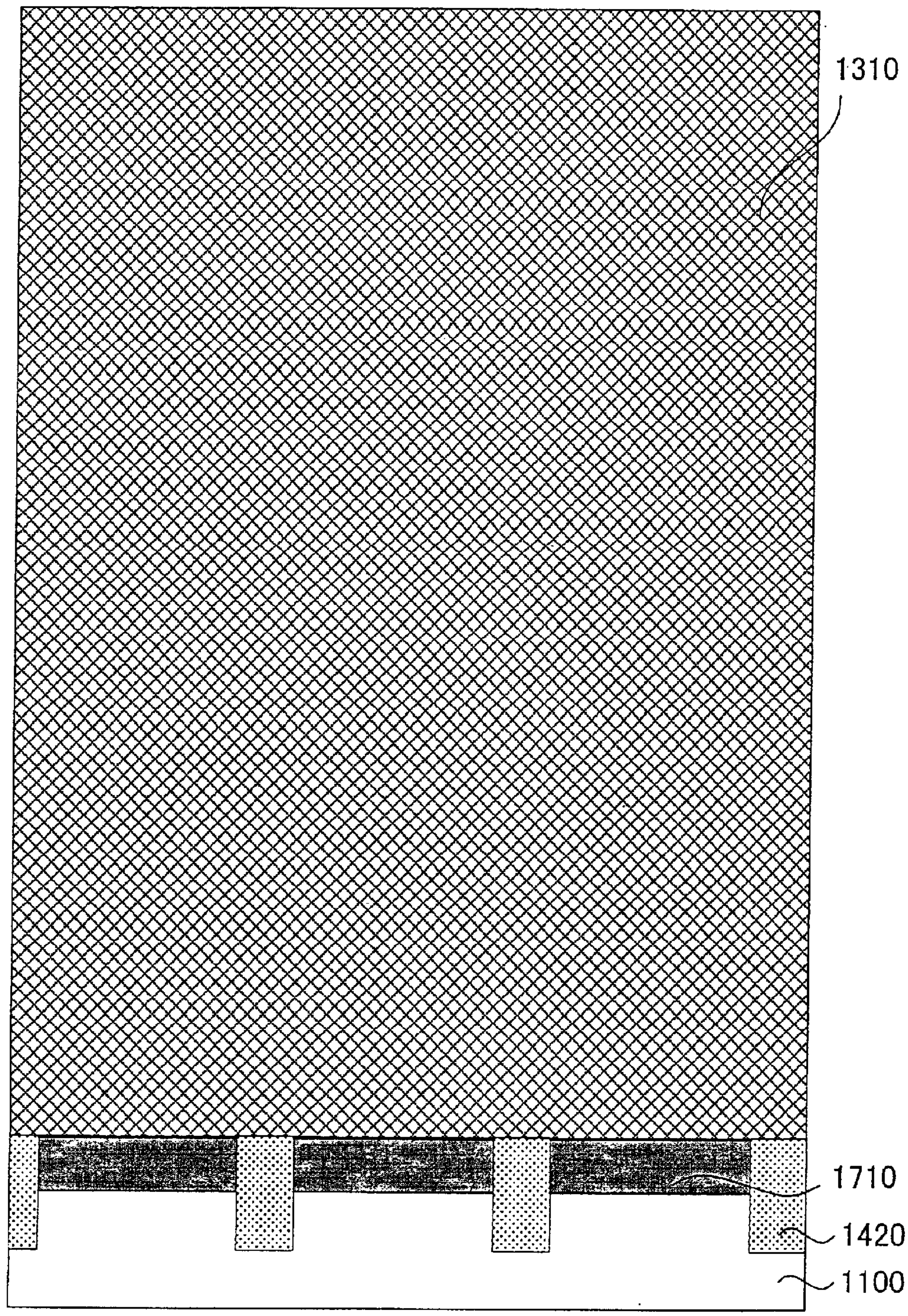

Fig. 1349
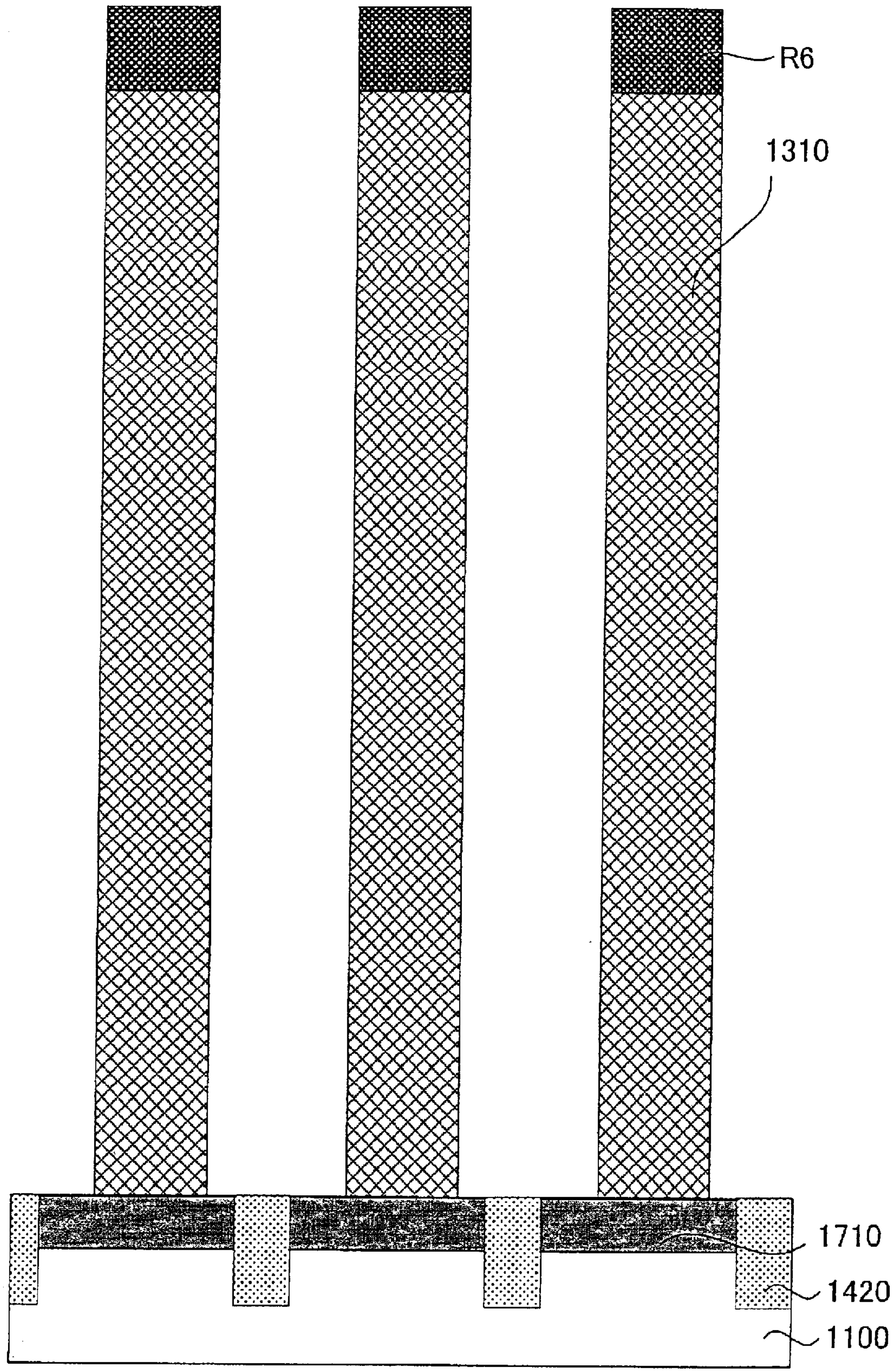

Fig. 1350
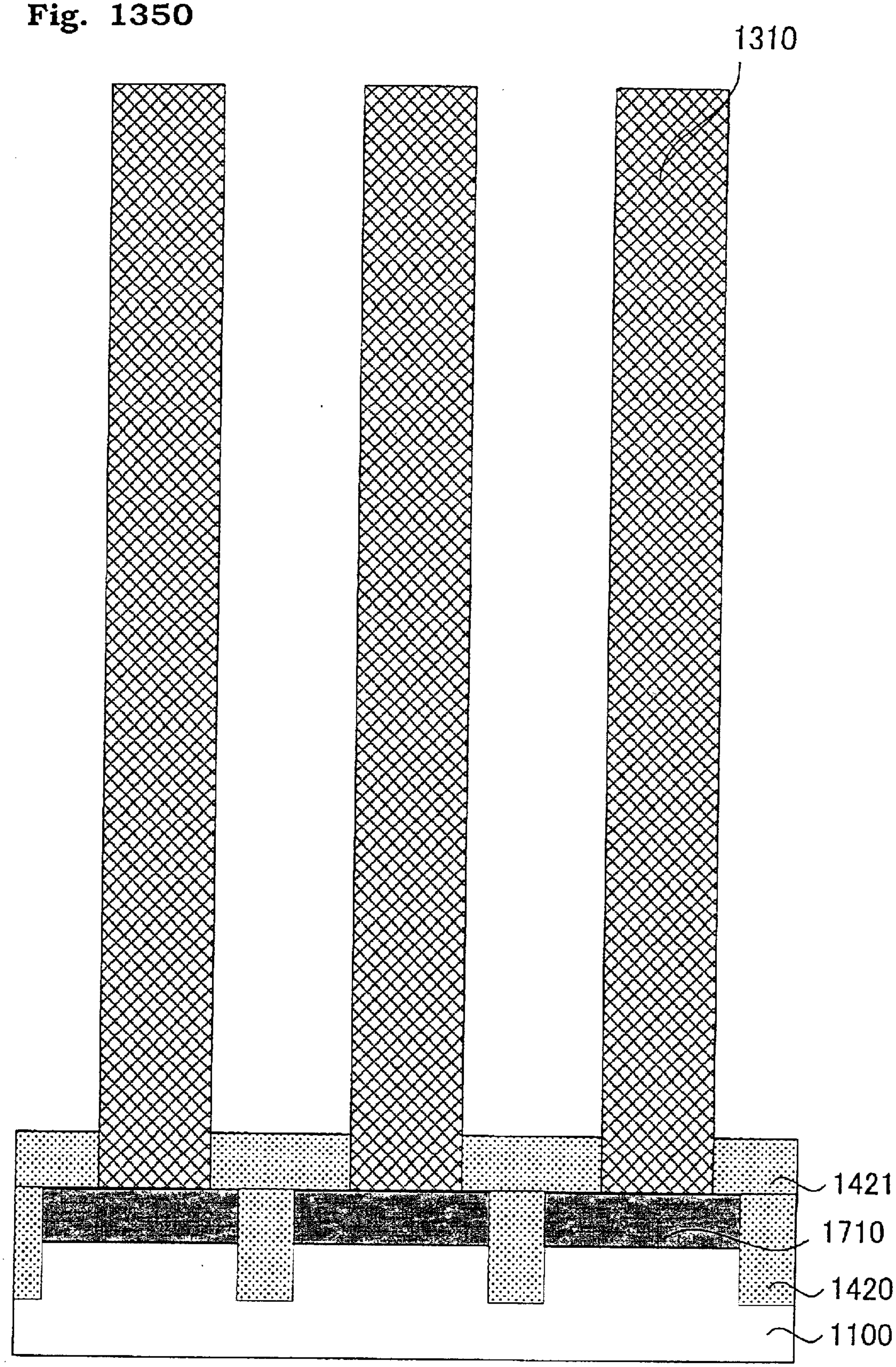

Fig. 1351
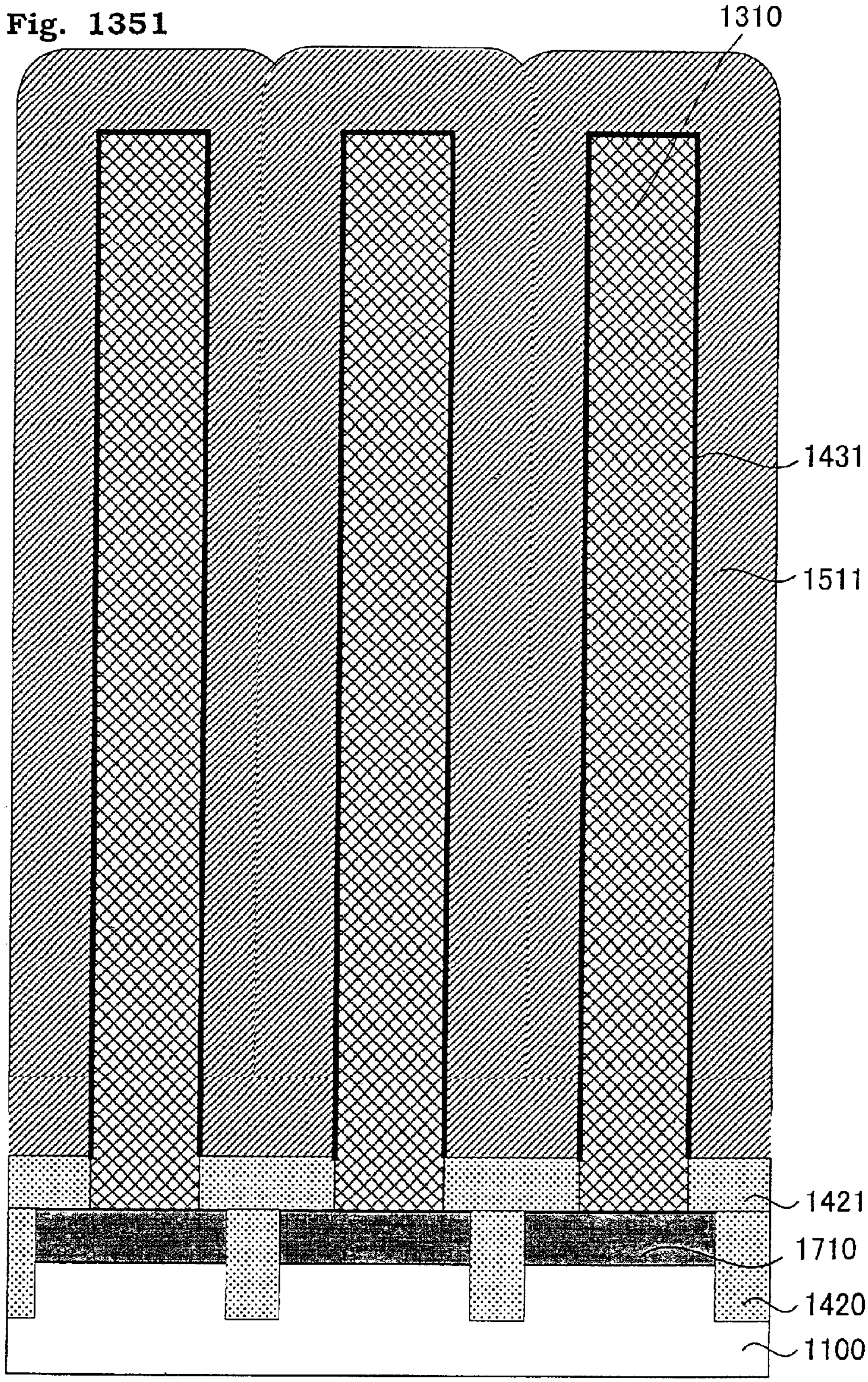

Fig. 1352
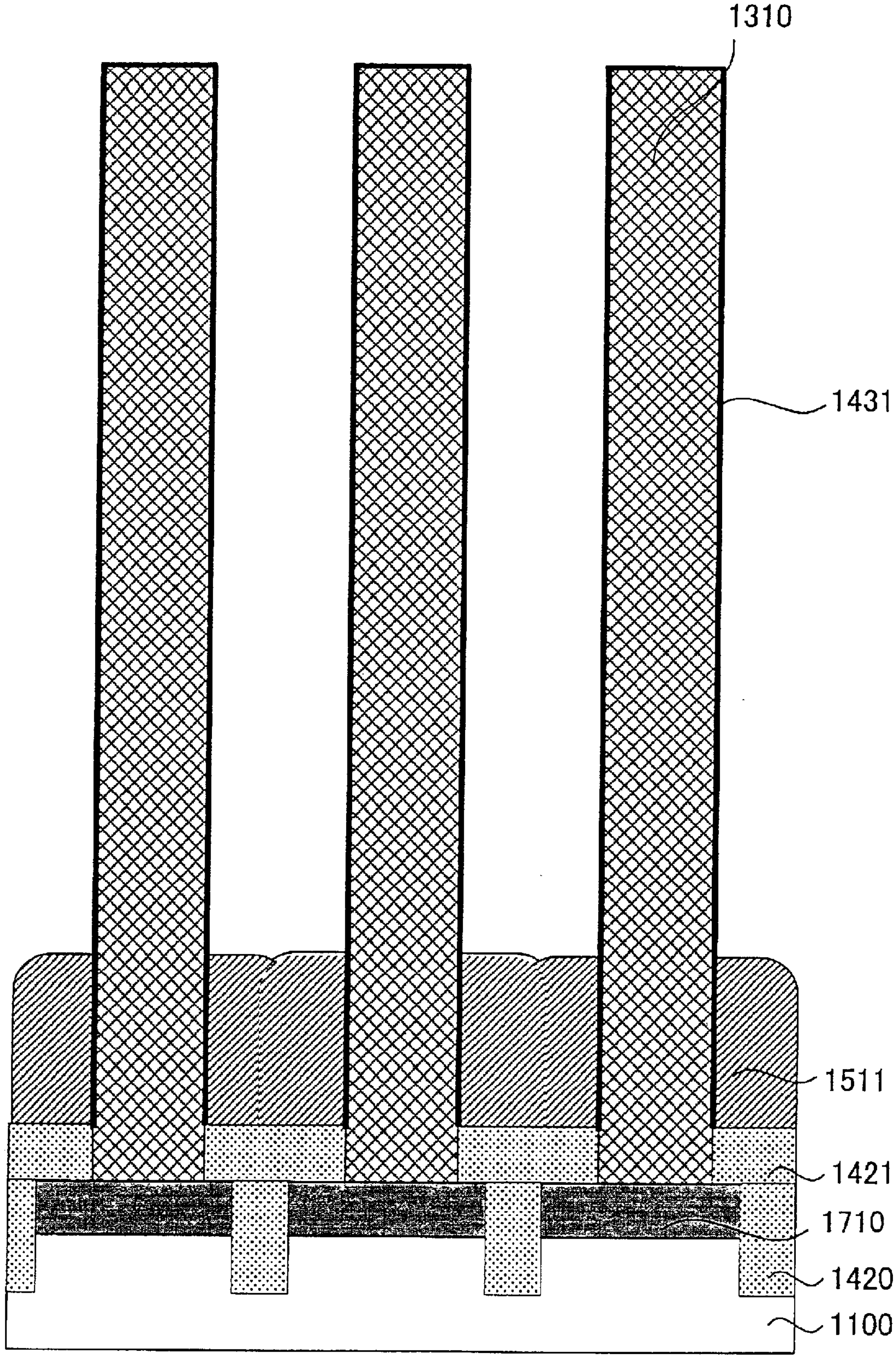

Fig. 1353

Fig. 1354
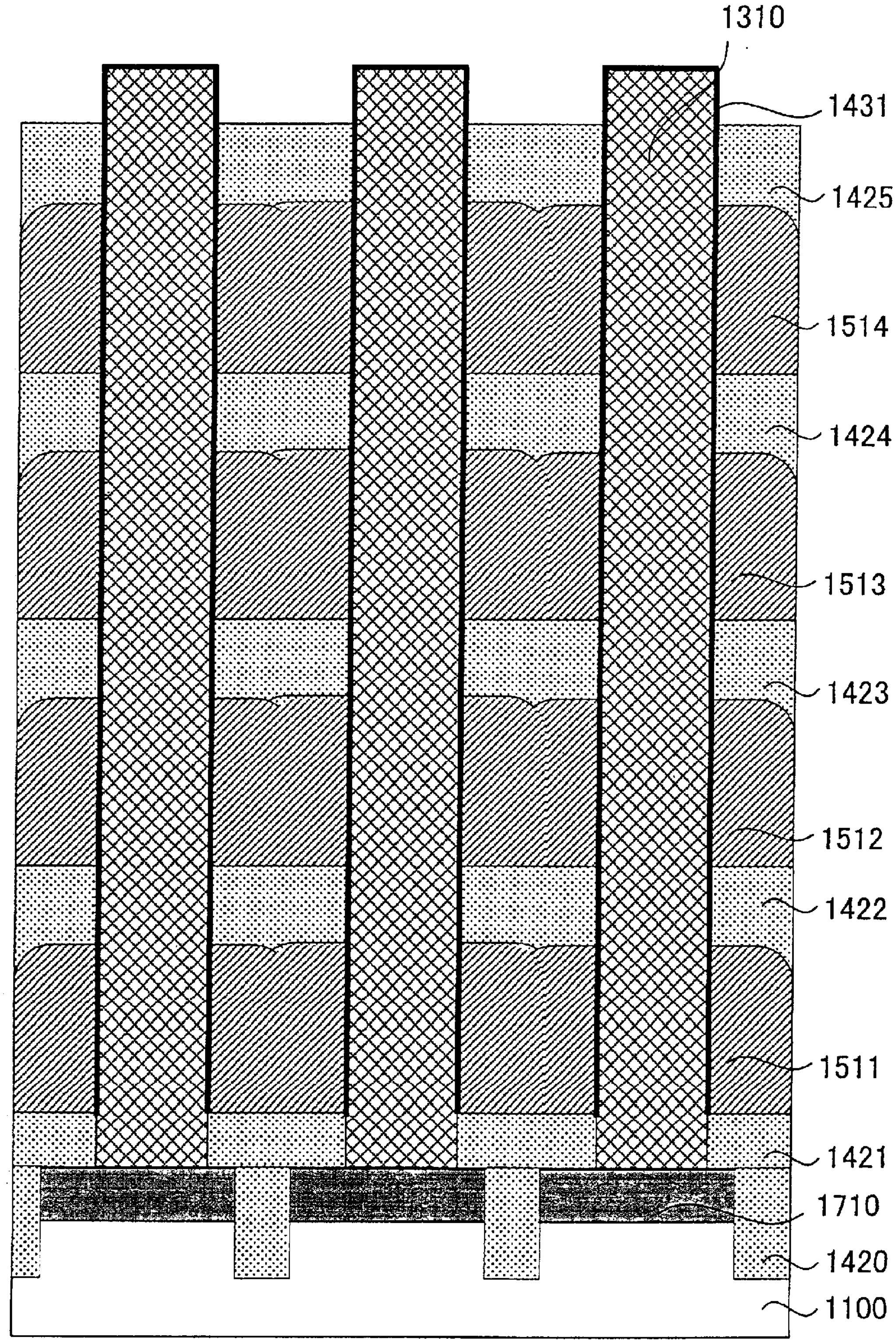

Fig. 1355
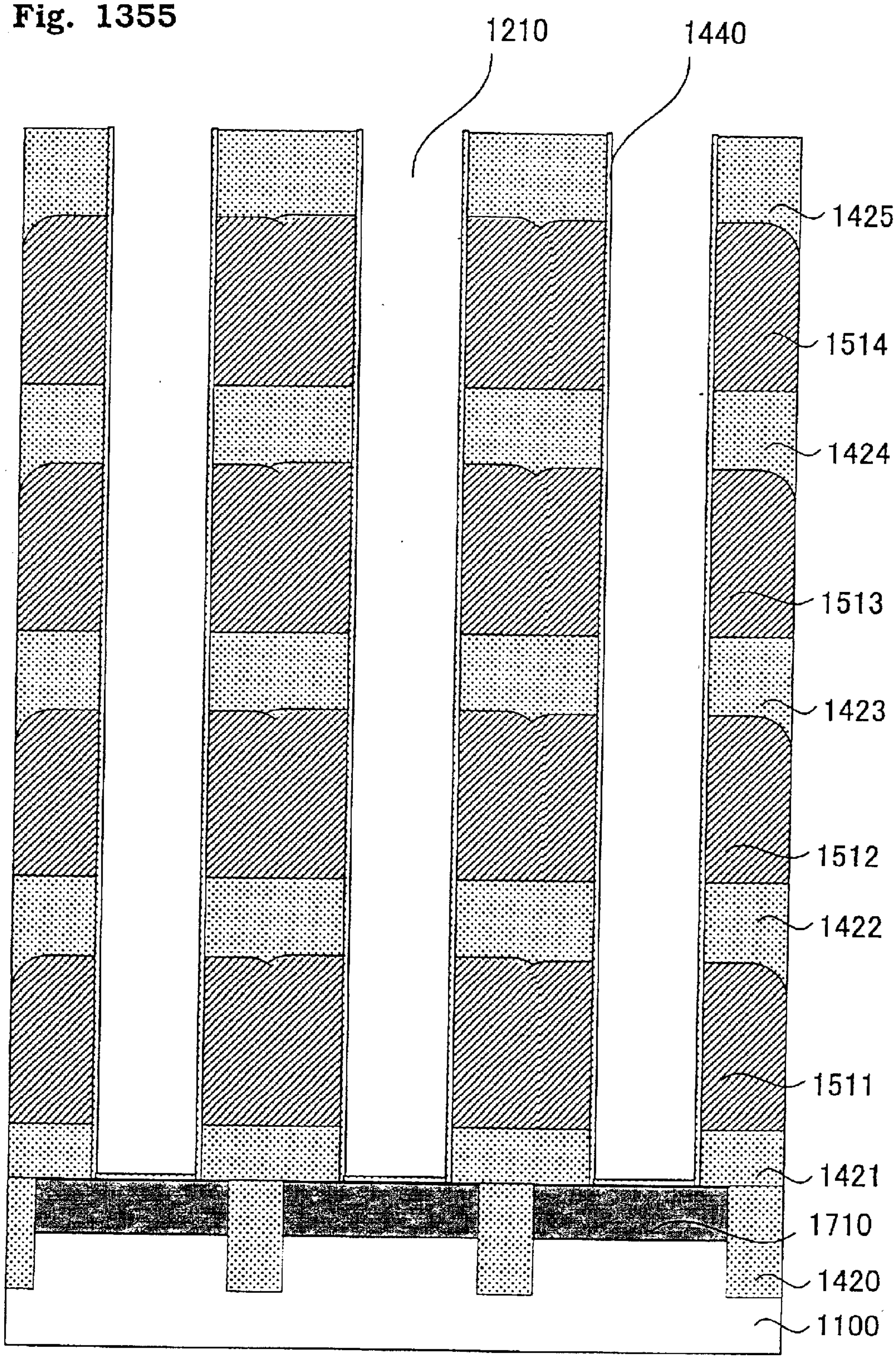

Fig. 1356
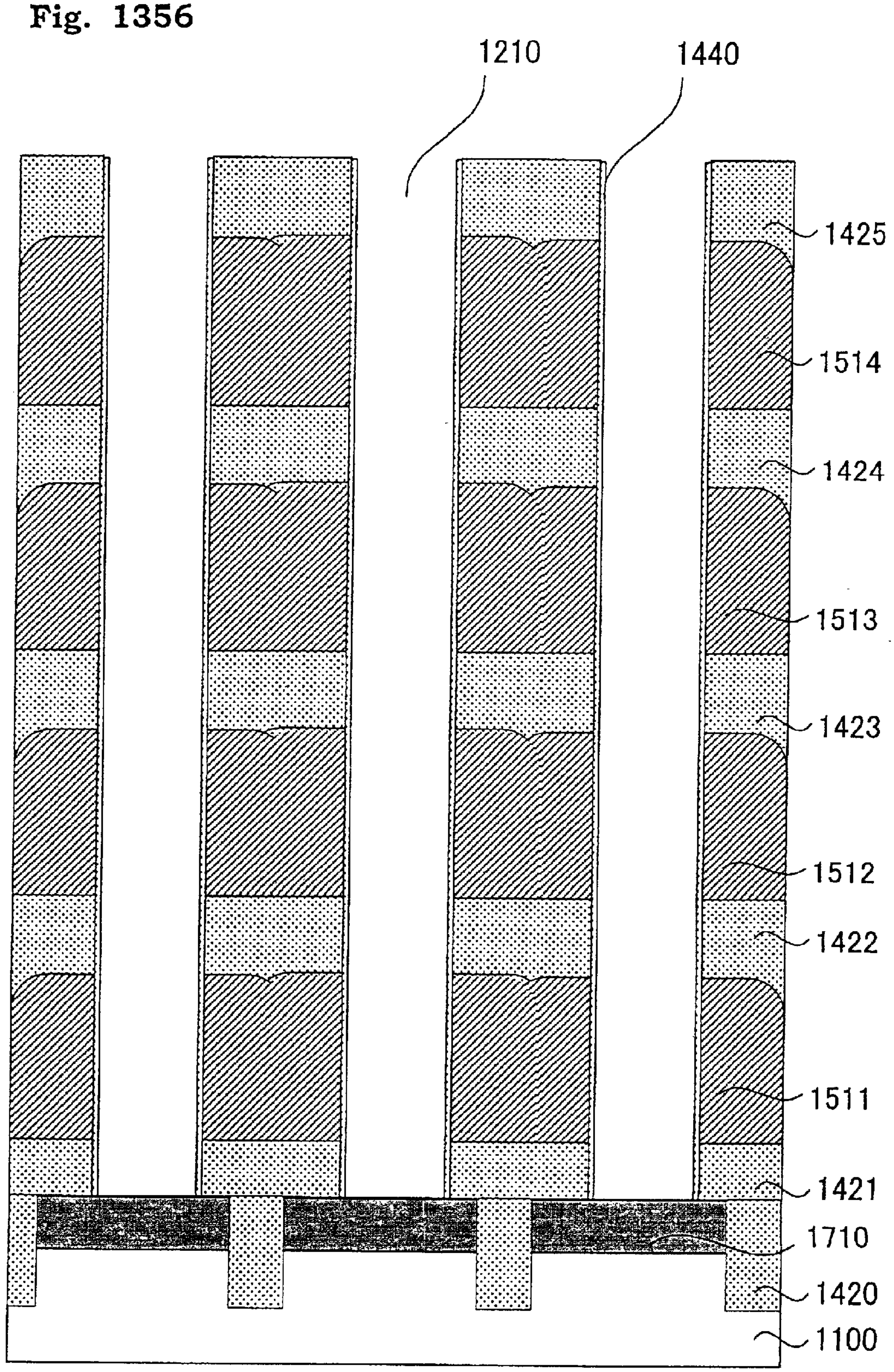

Fig. 1357
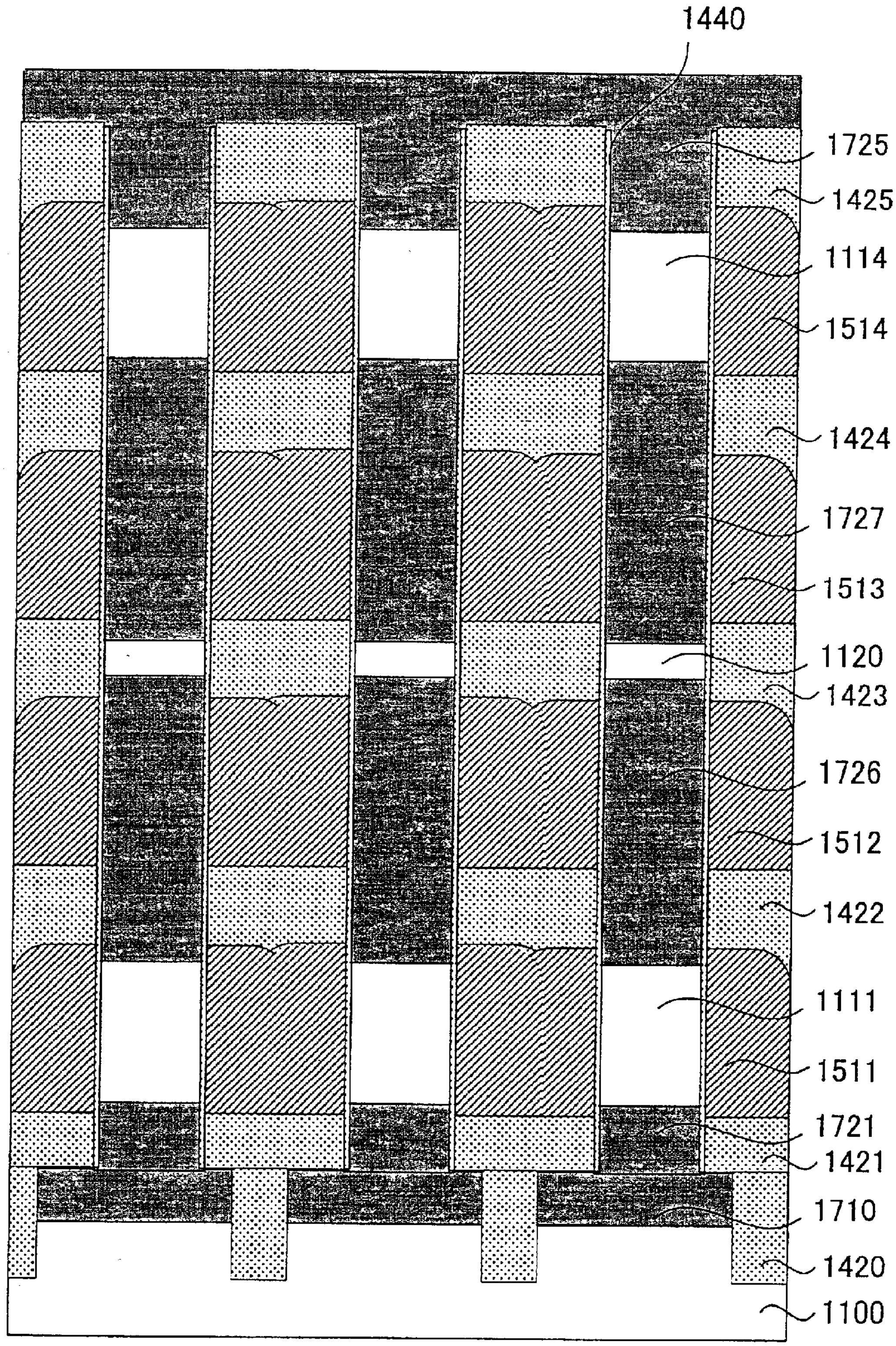

Fig. 1358
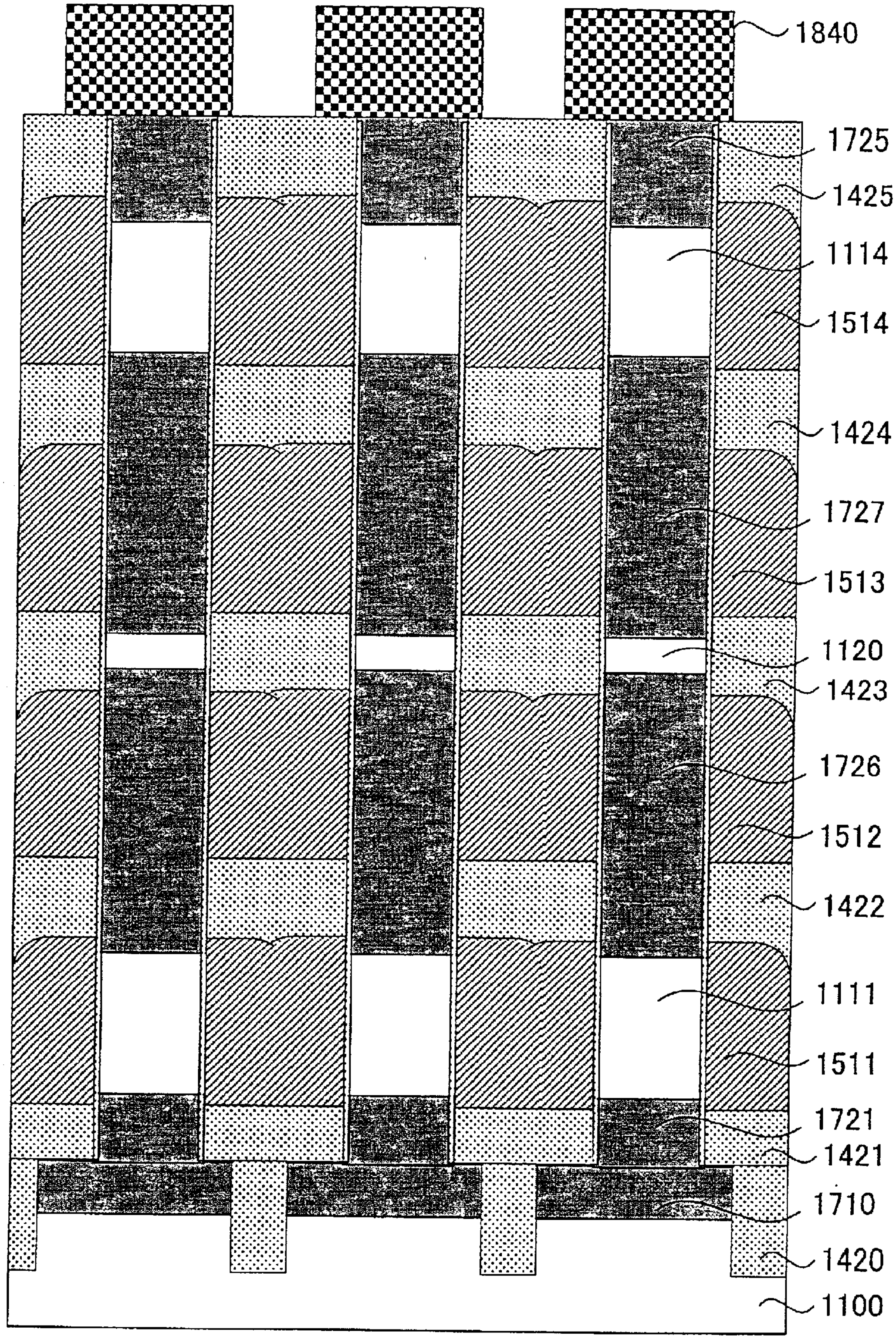

Fig. 1359
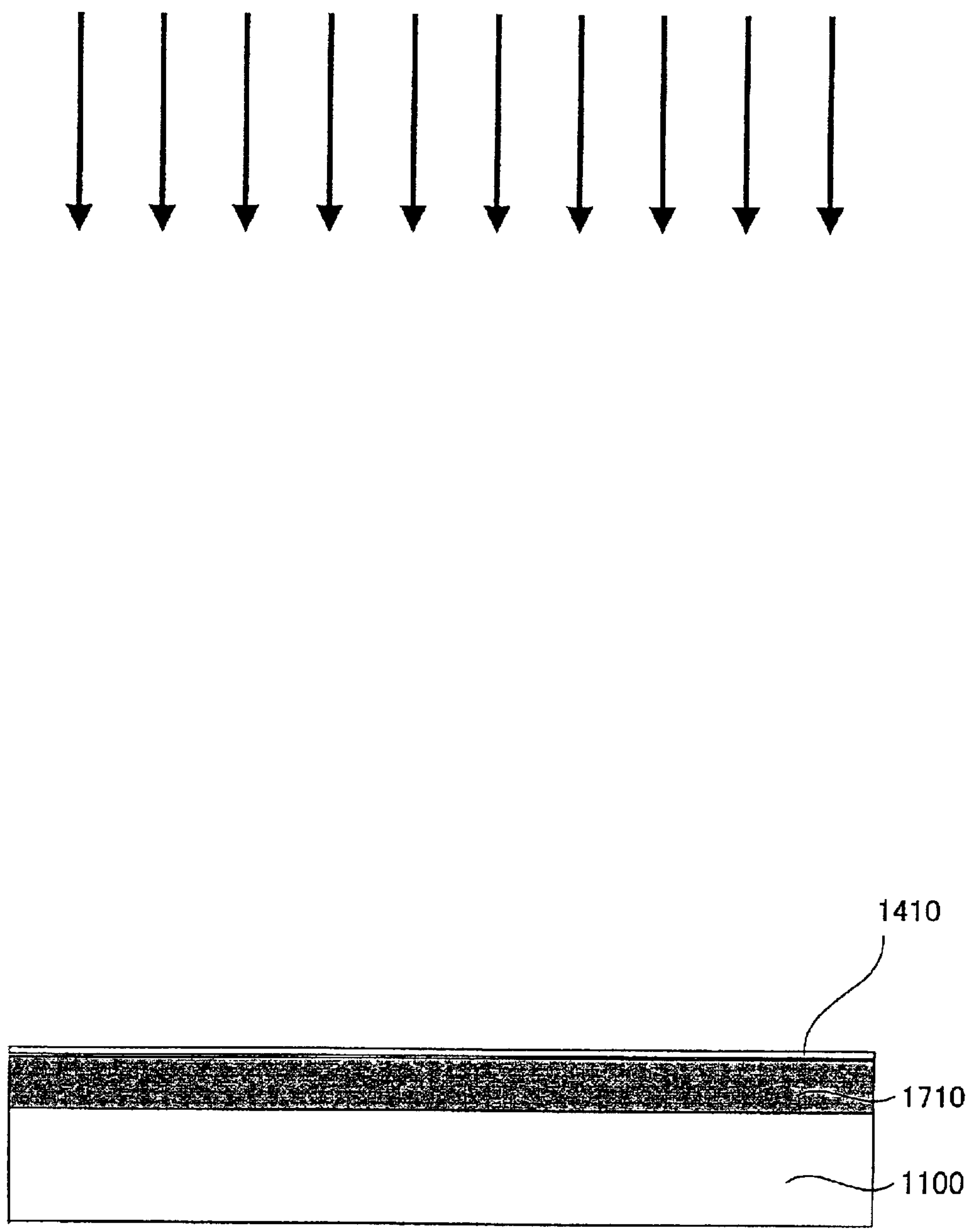

Fig. 1360
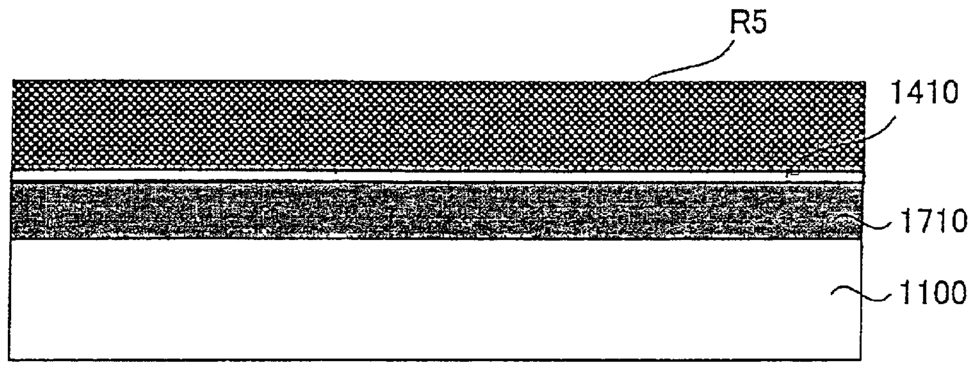
Fig. 1361
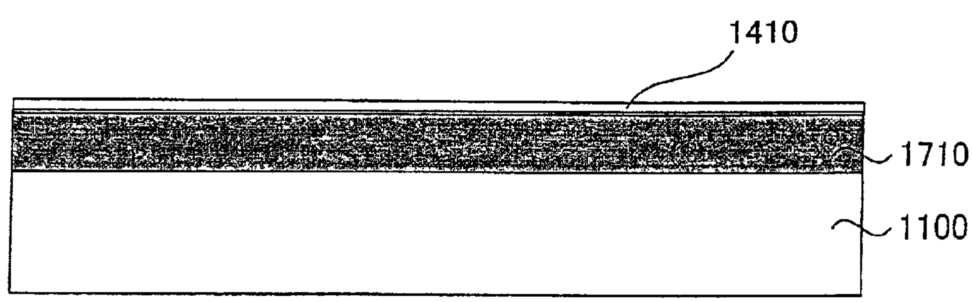

Fig. 1362
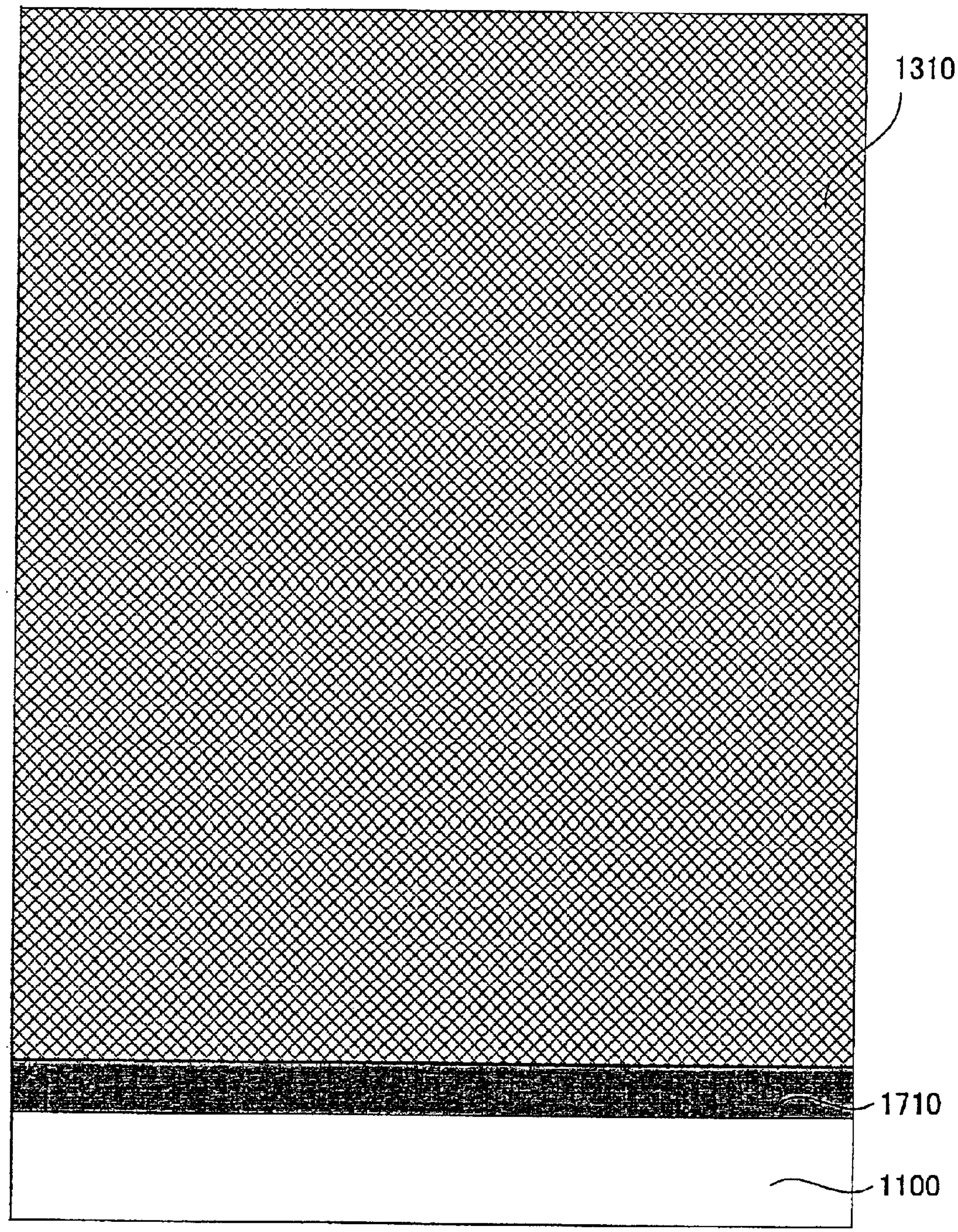

Fig. 1363
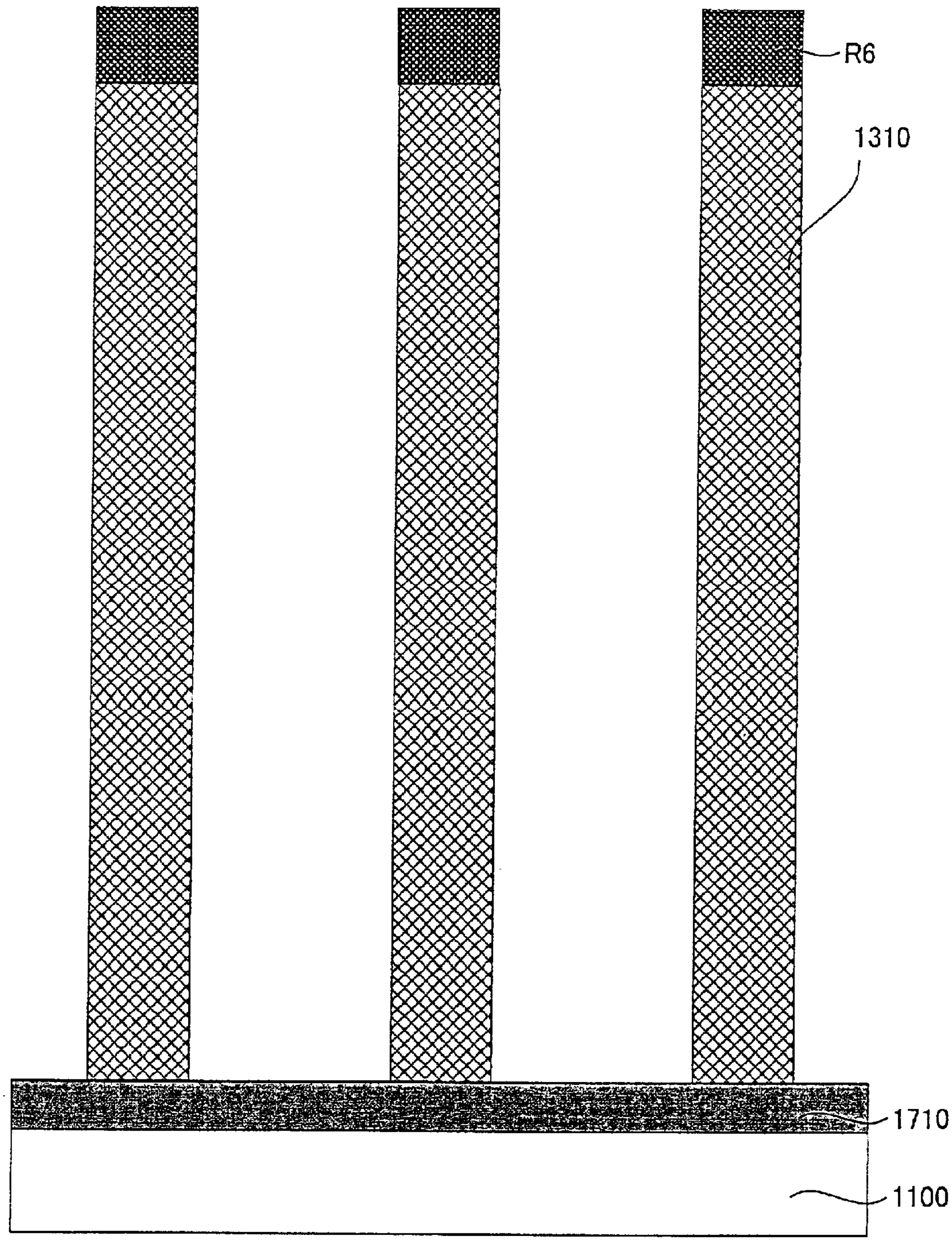

Fig. 1364
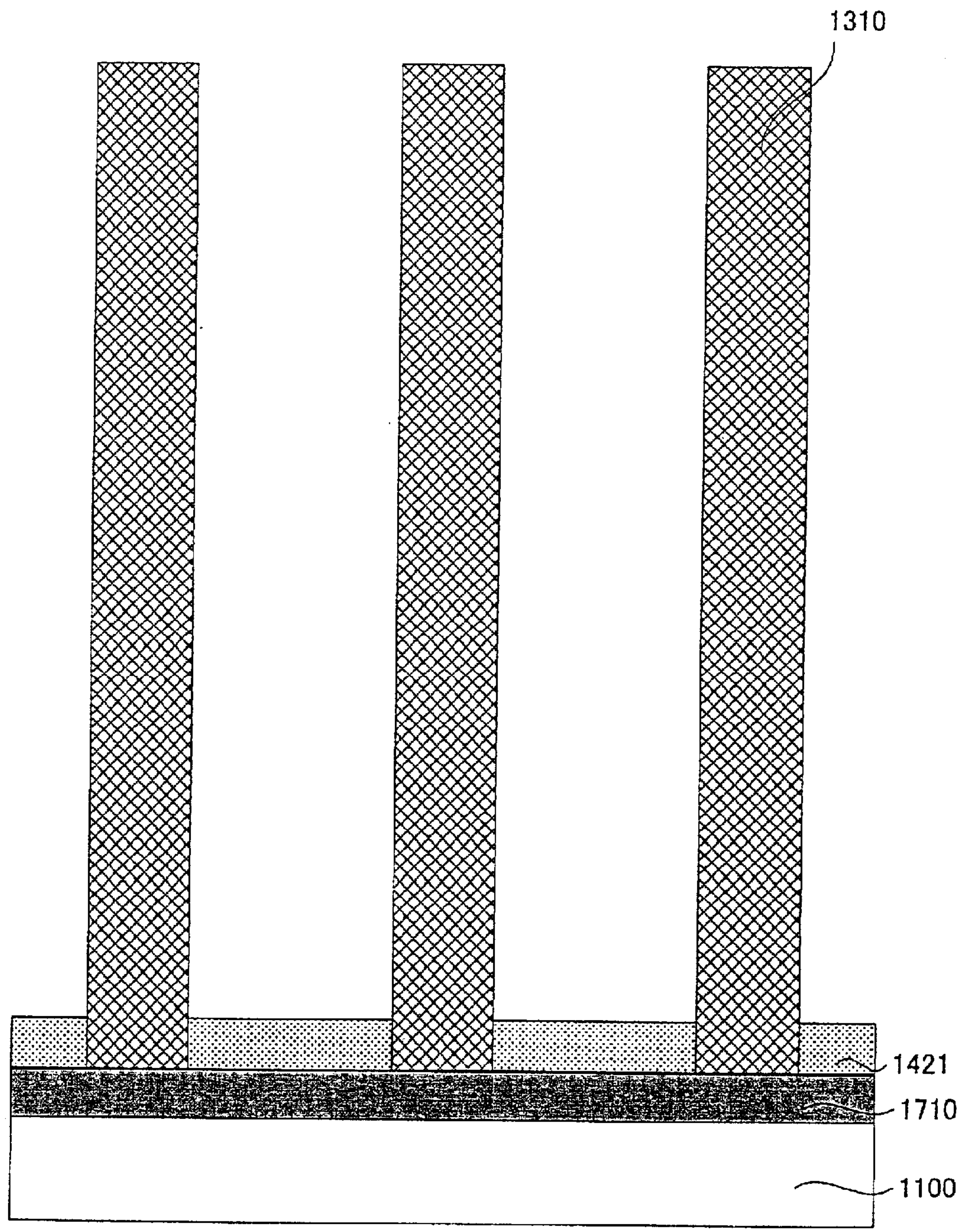

Fig. 1365
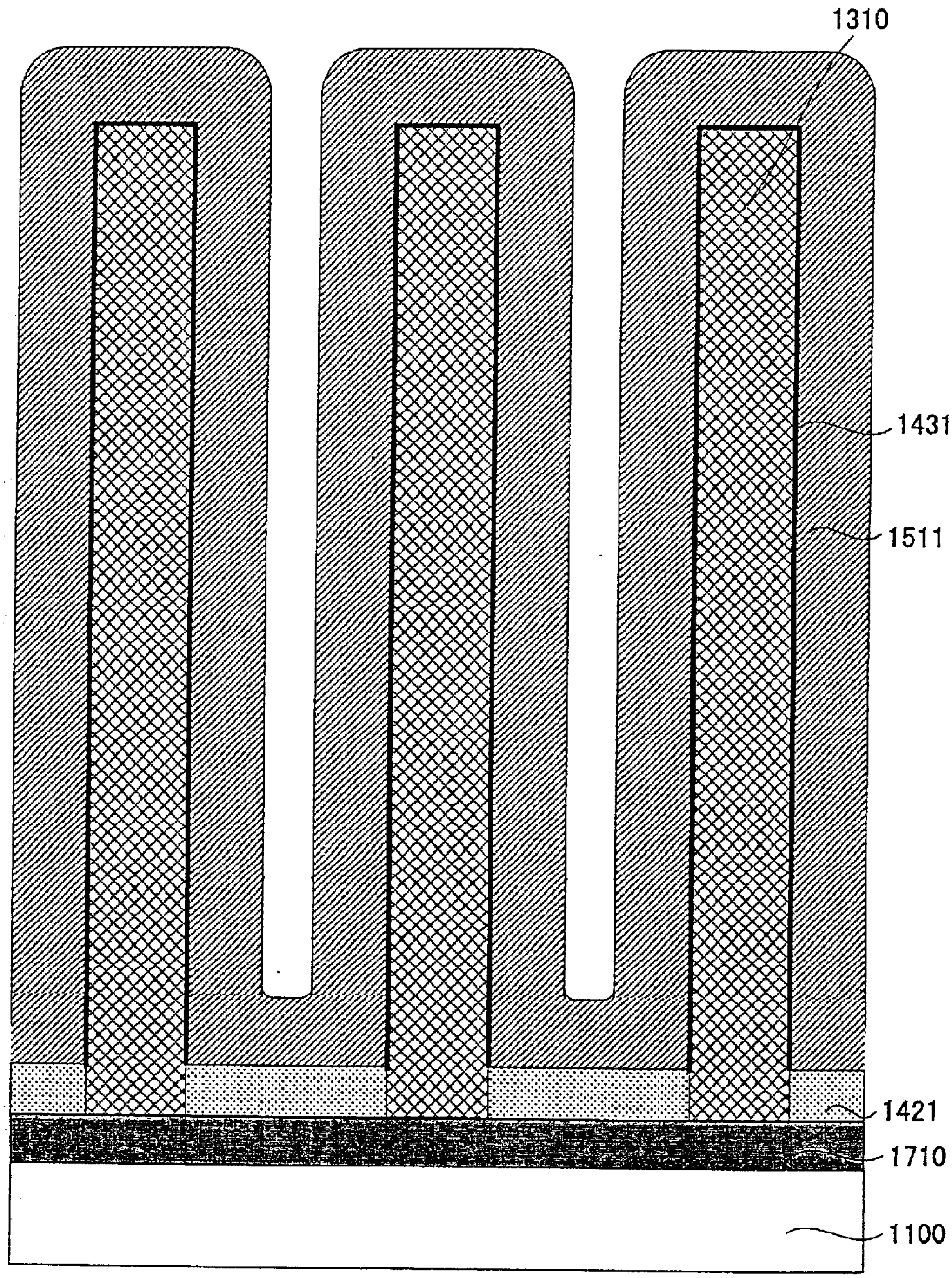

Fig. 1366
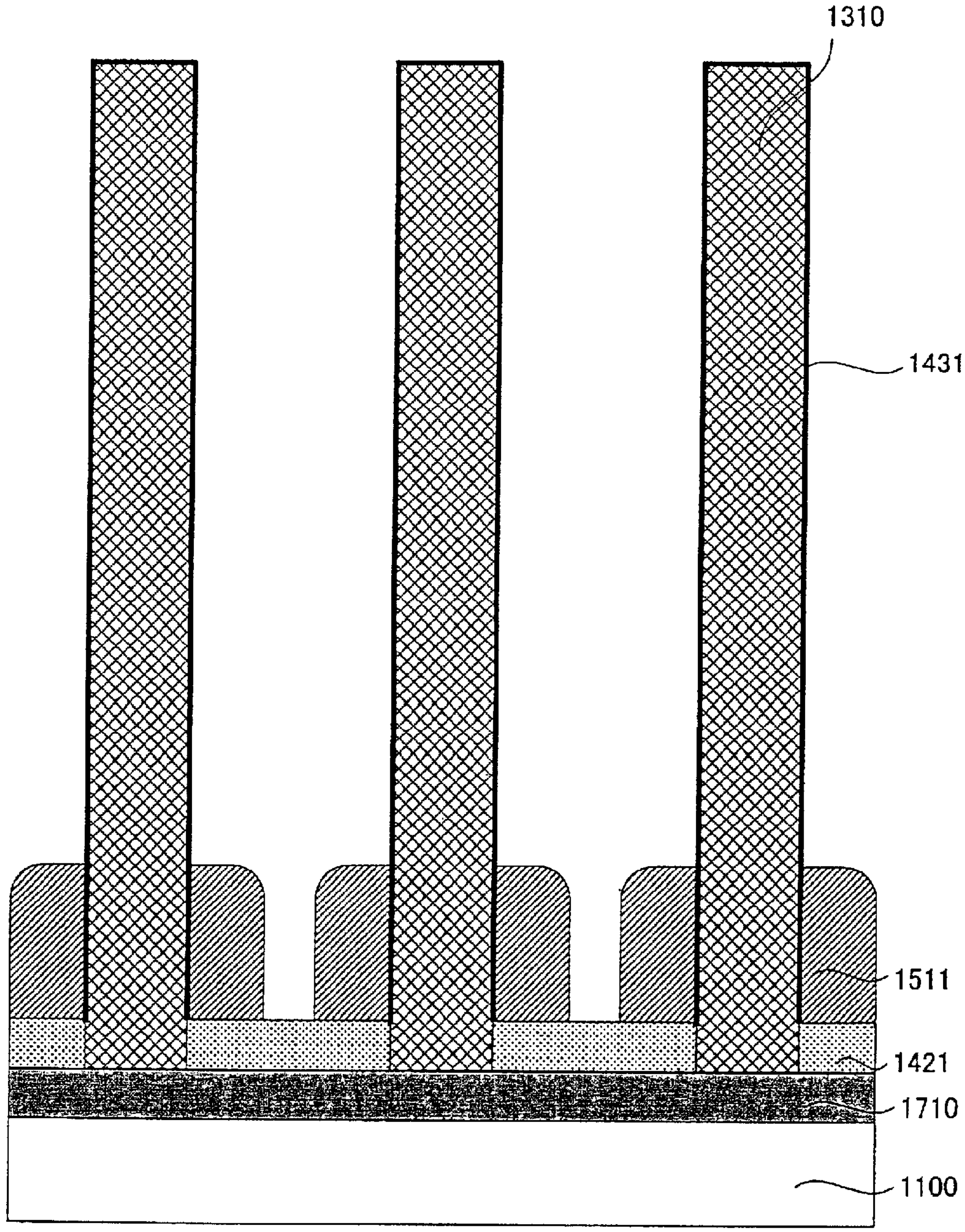

Fig. 1367
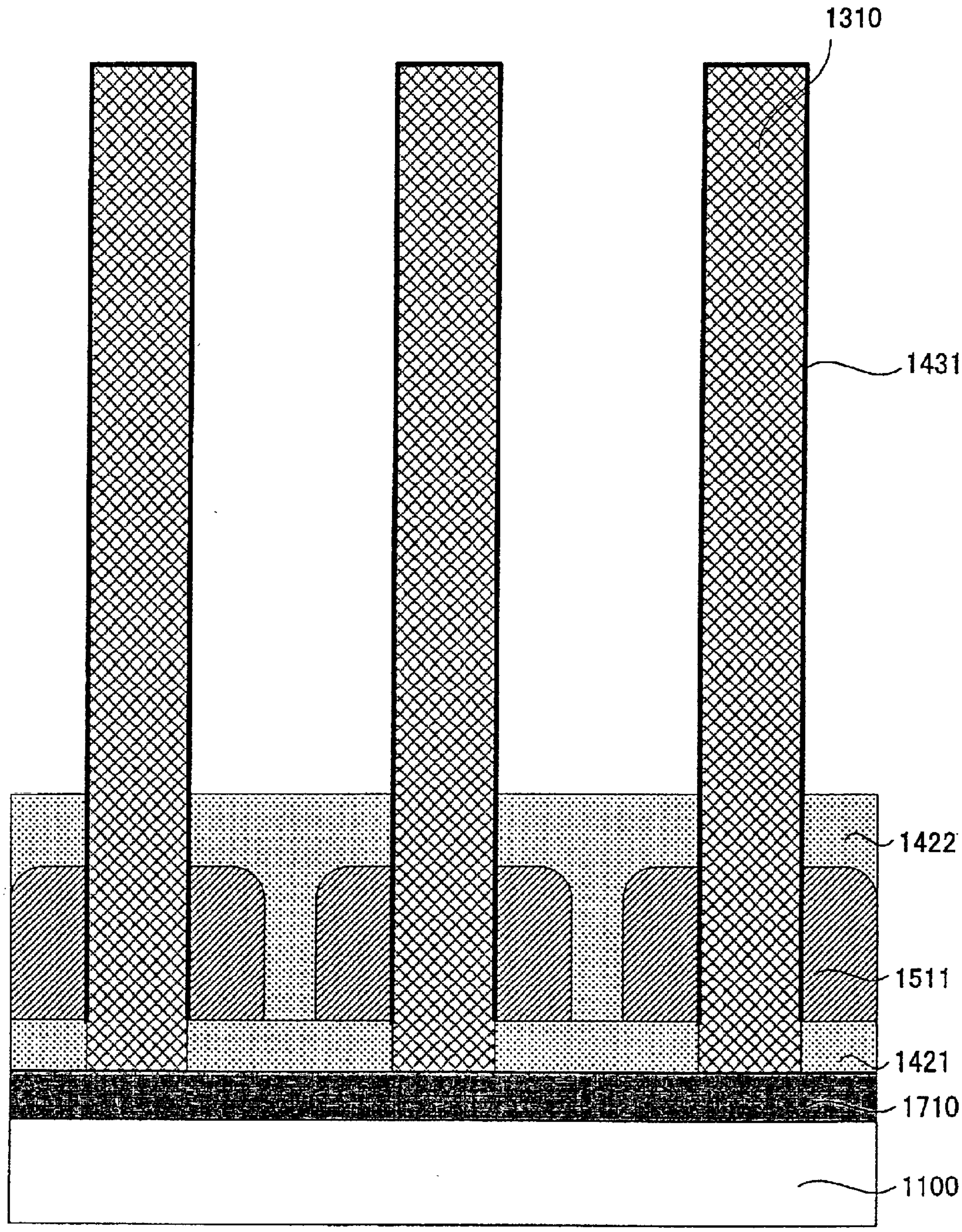

Fig. 1368
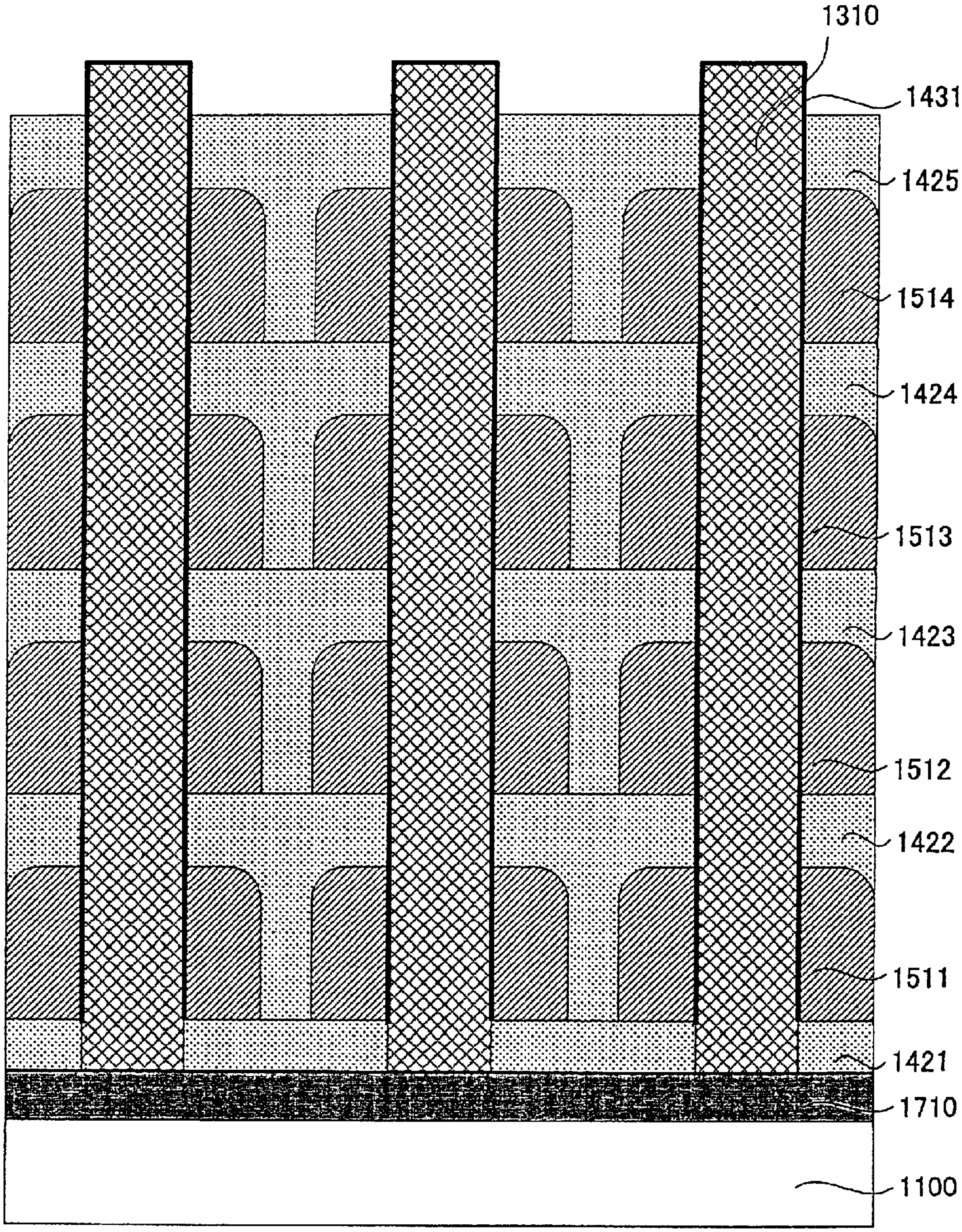

Fig. 1369
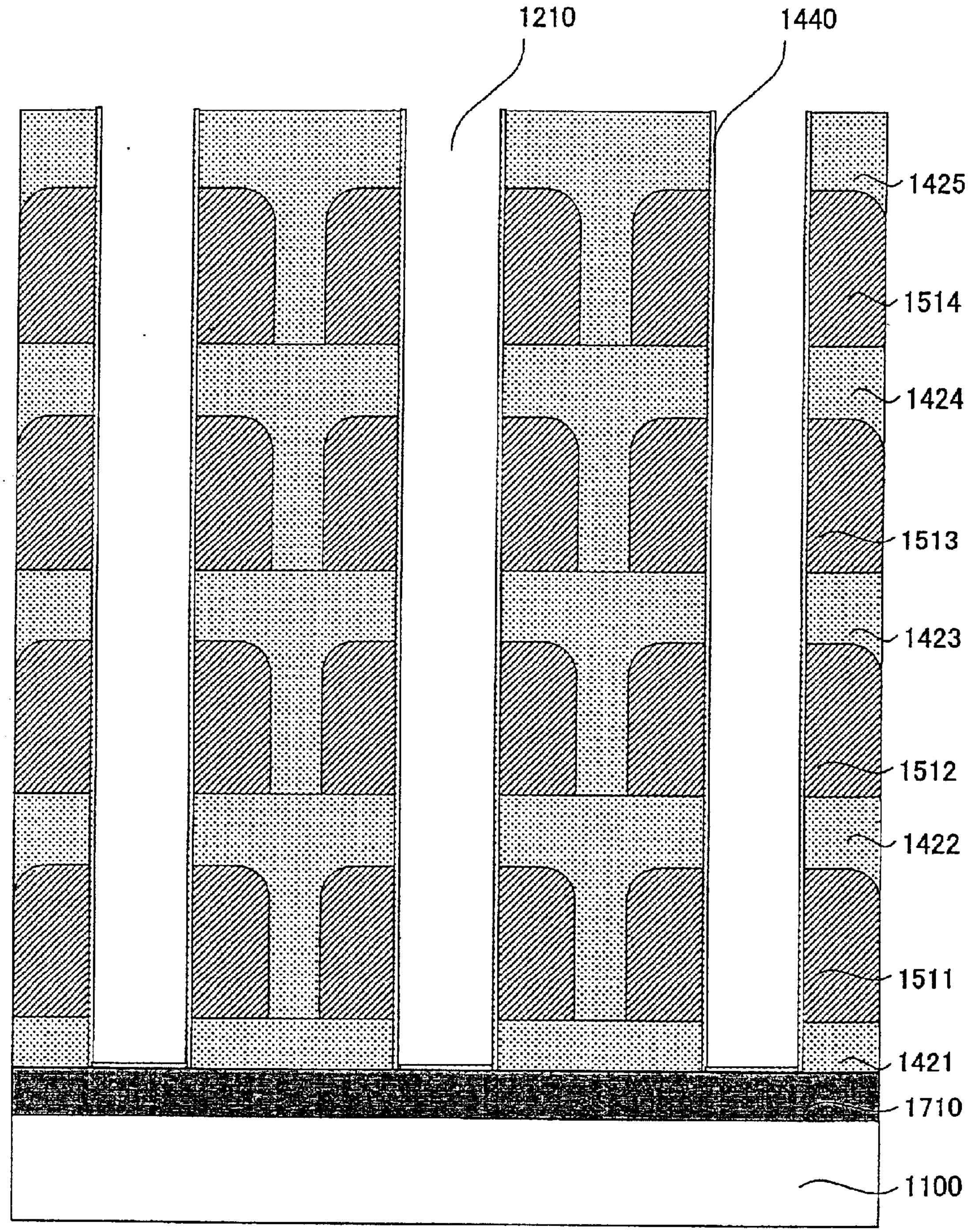

Fig. 1370
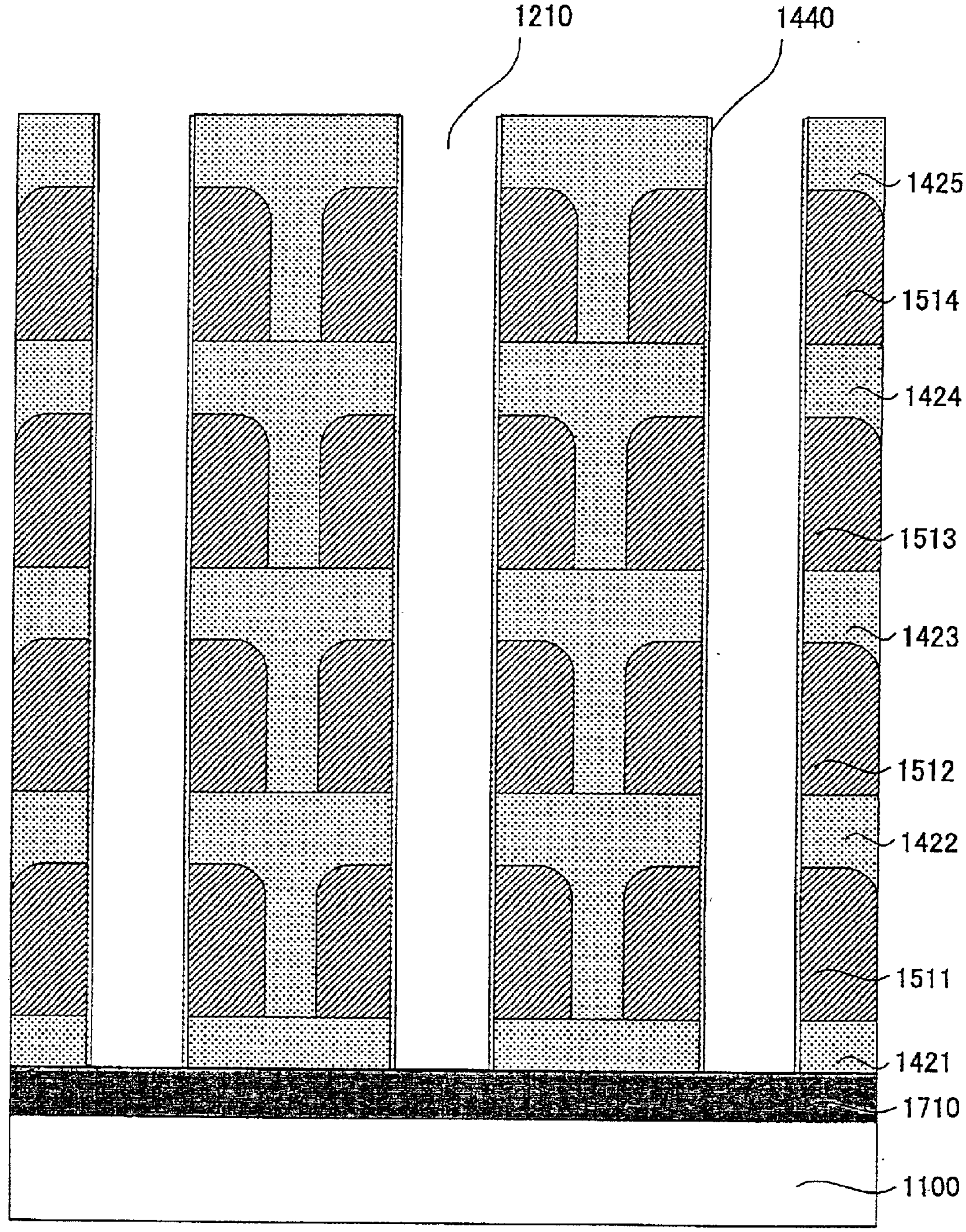

Fig. 1371
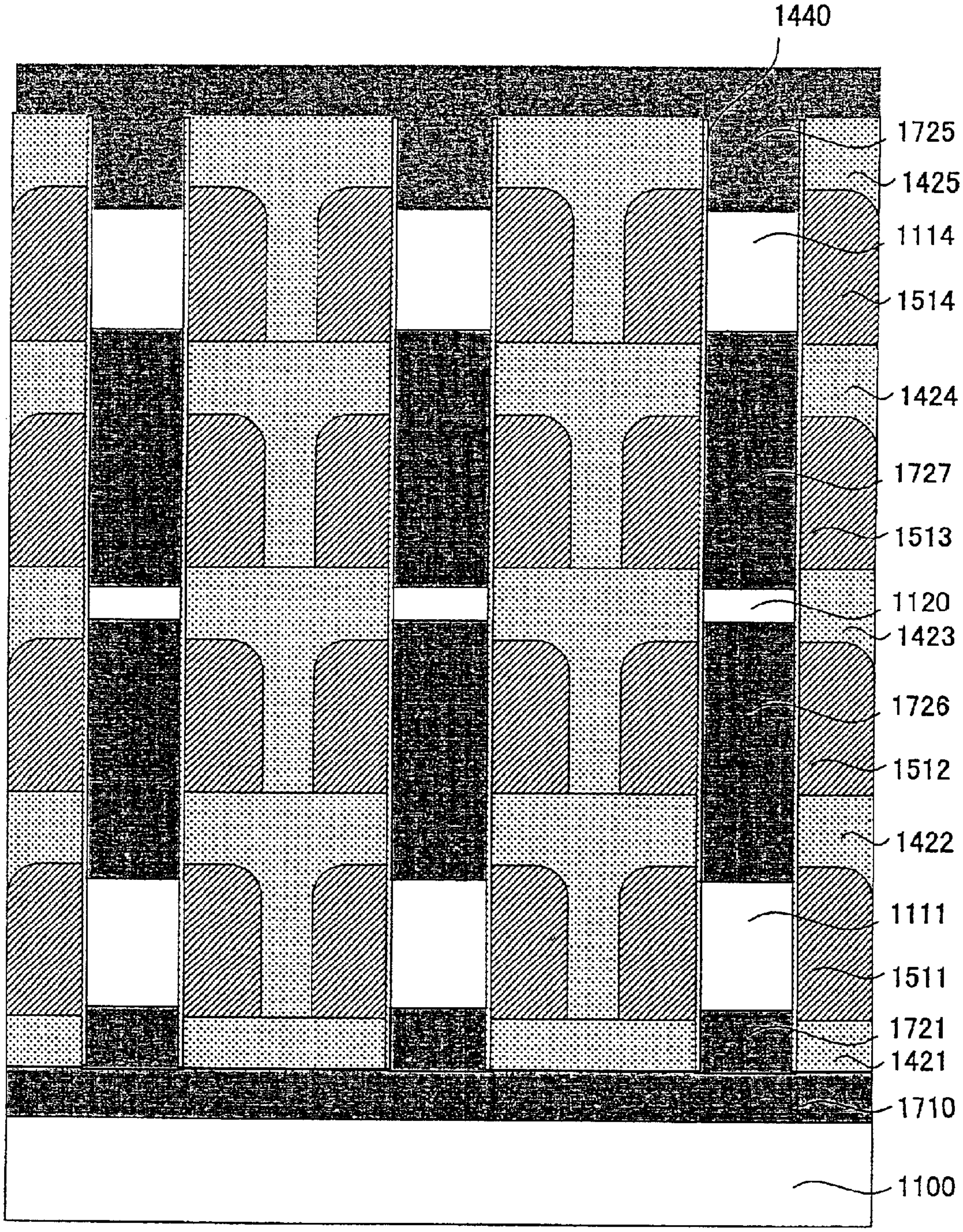

Fig. 1372
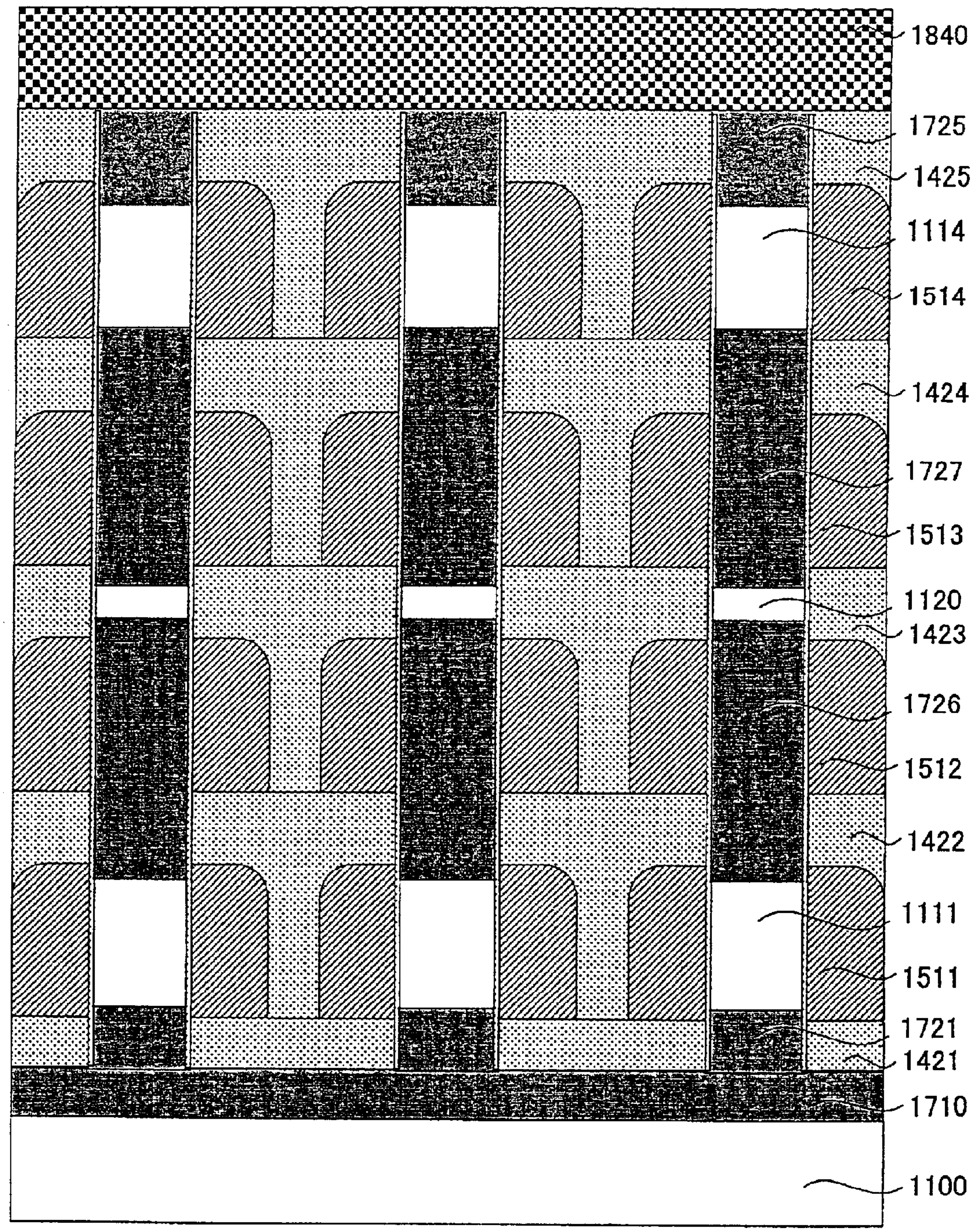

Fig. 1373
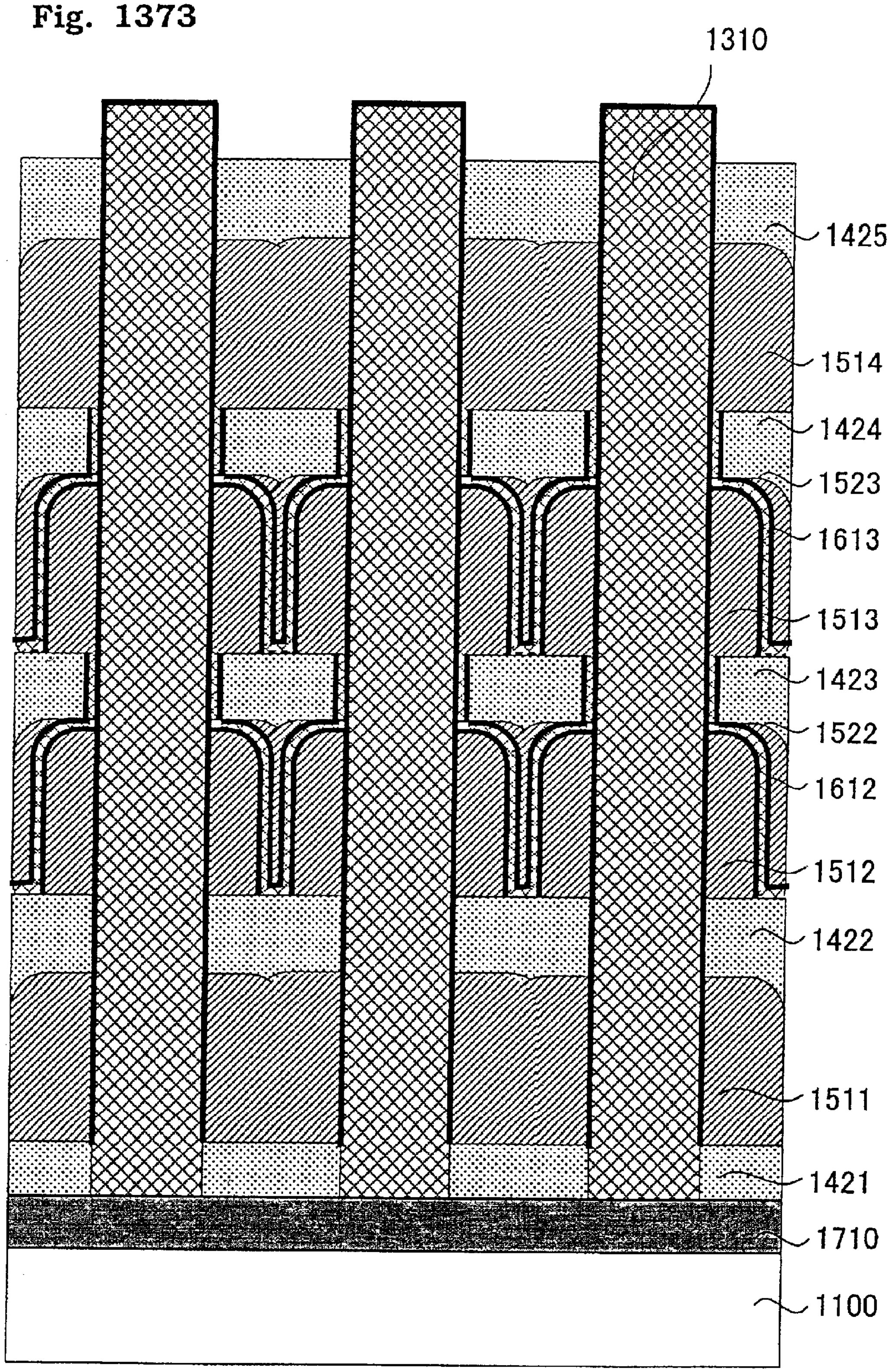

Fig. 1374
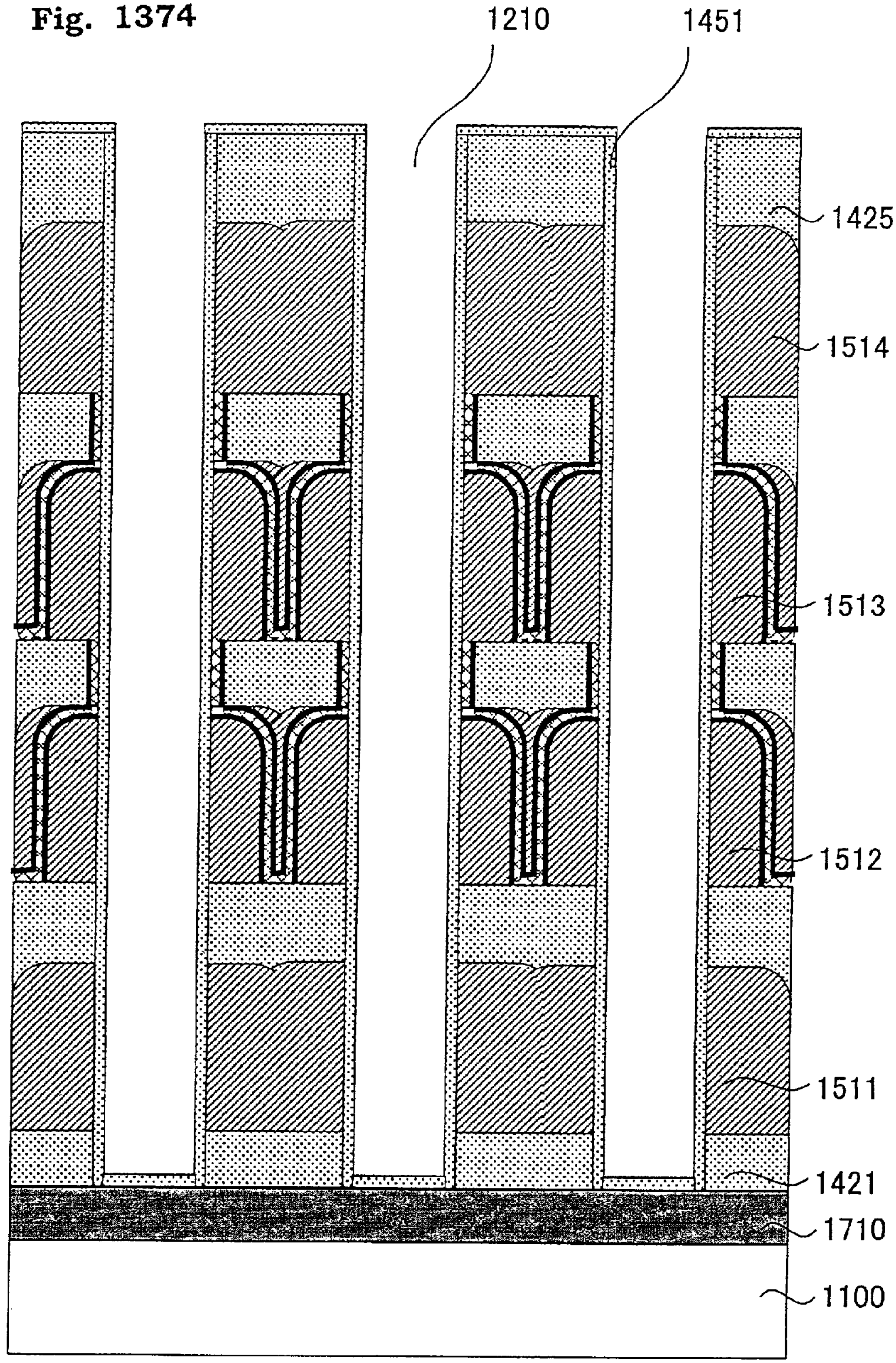

Fig. 1375
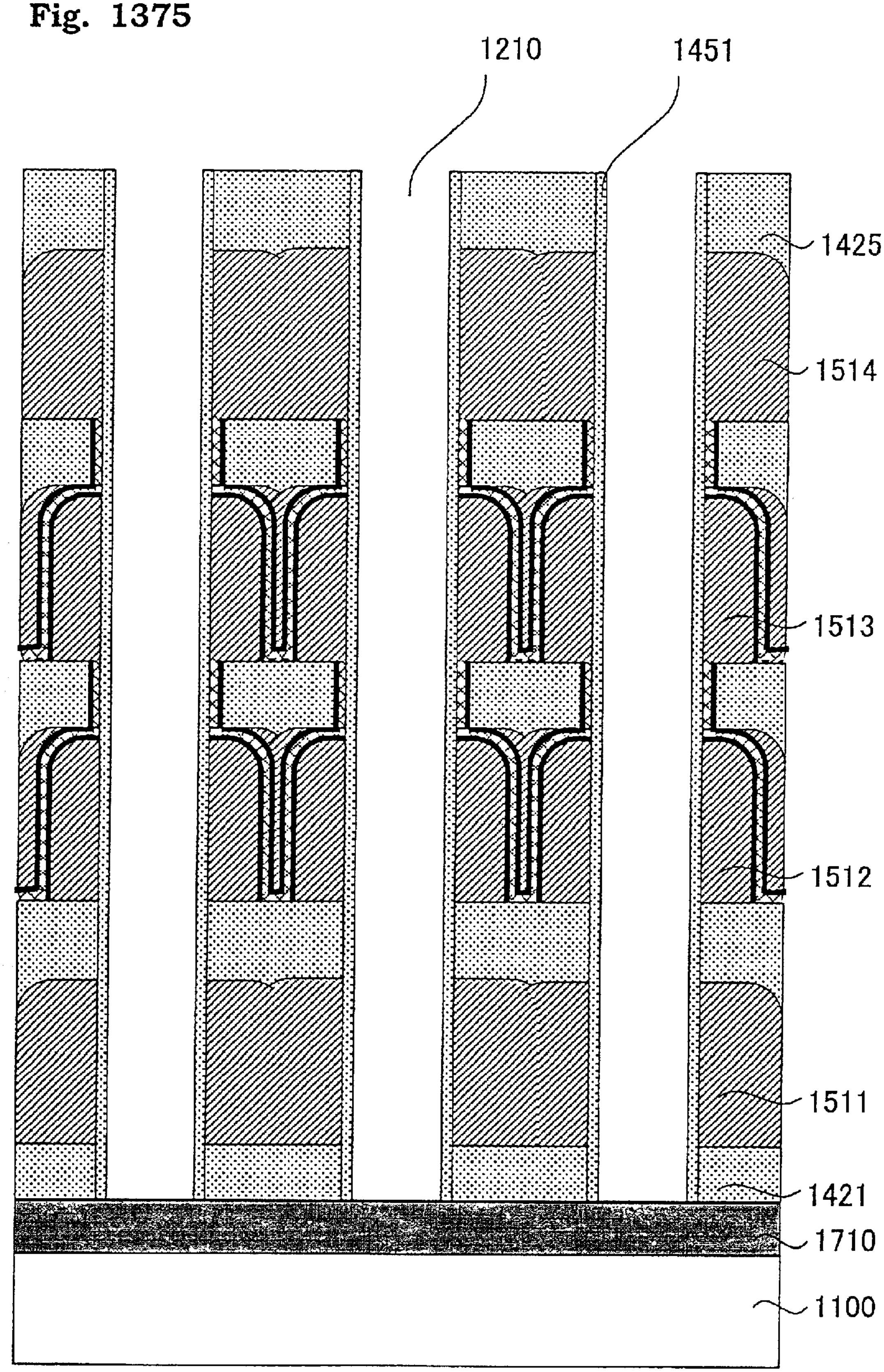

Fig. 1376
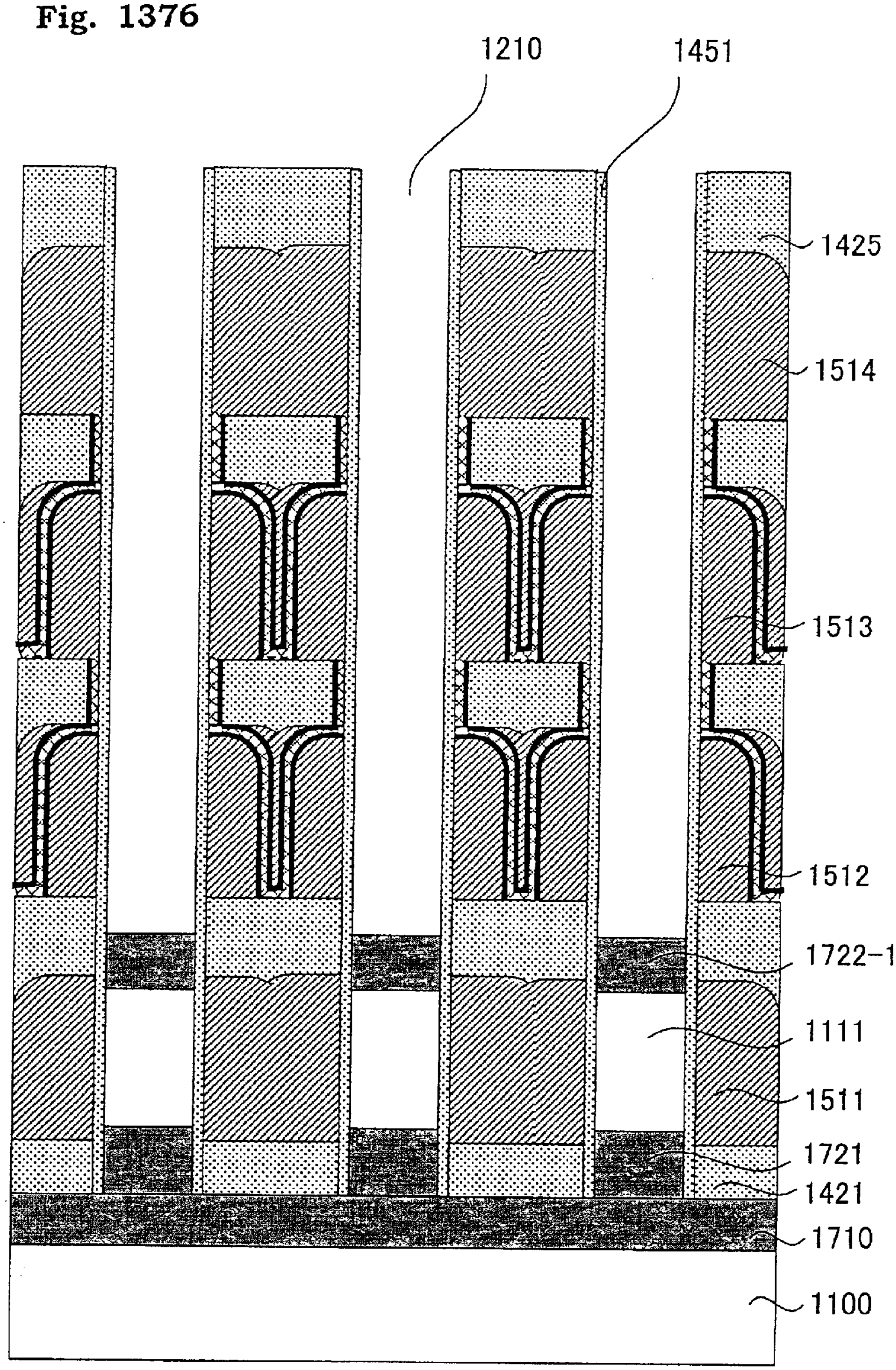

Fig. 1377
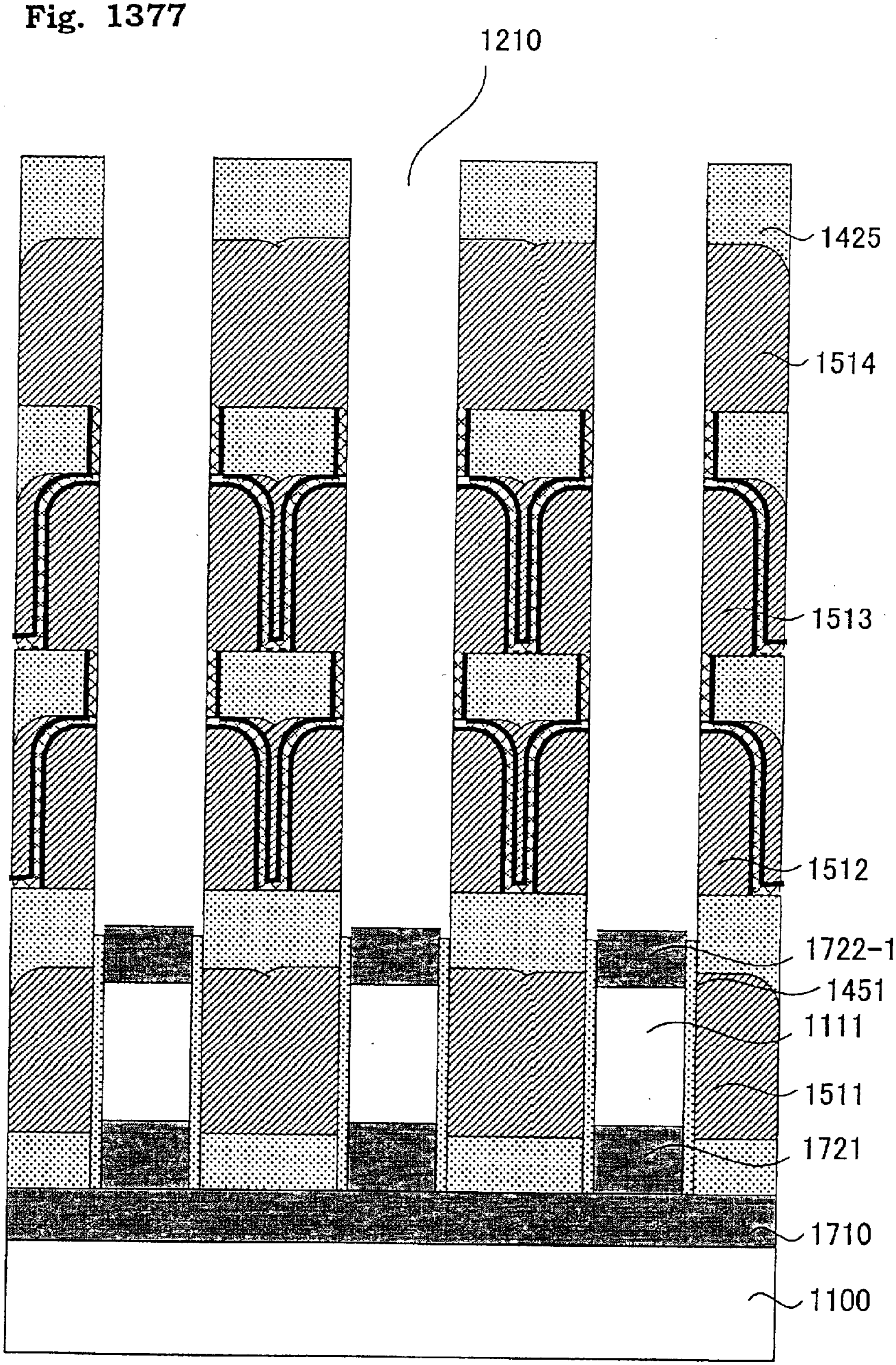

Fig. 1378
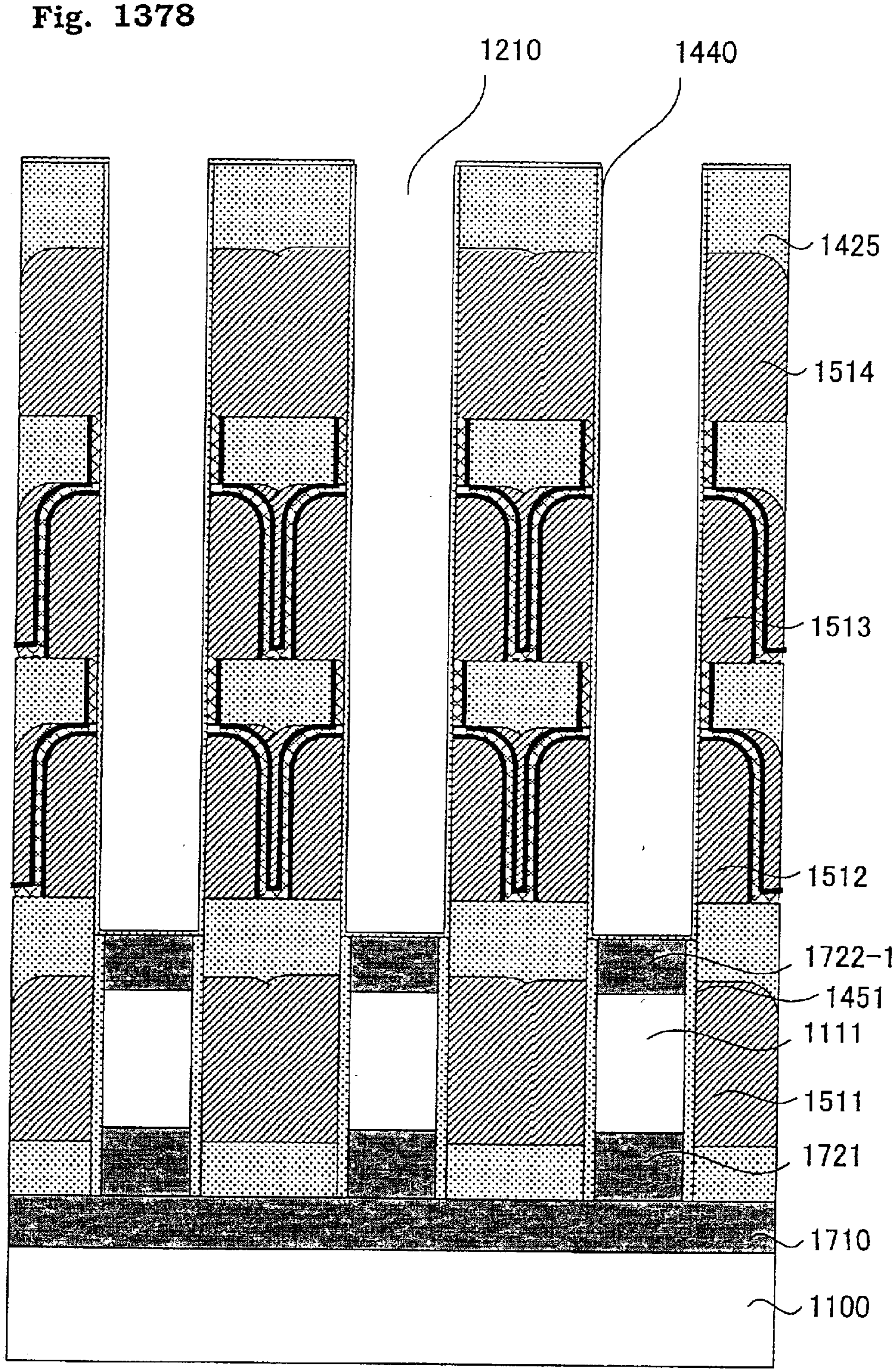

Fig. 1379
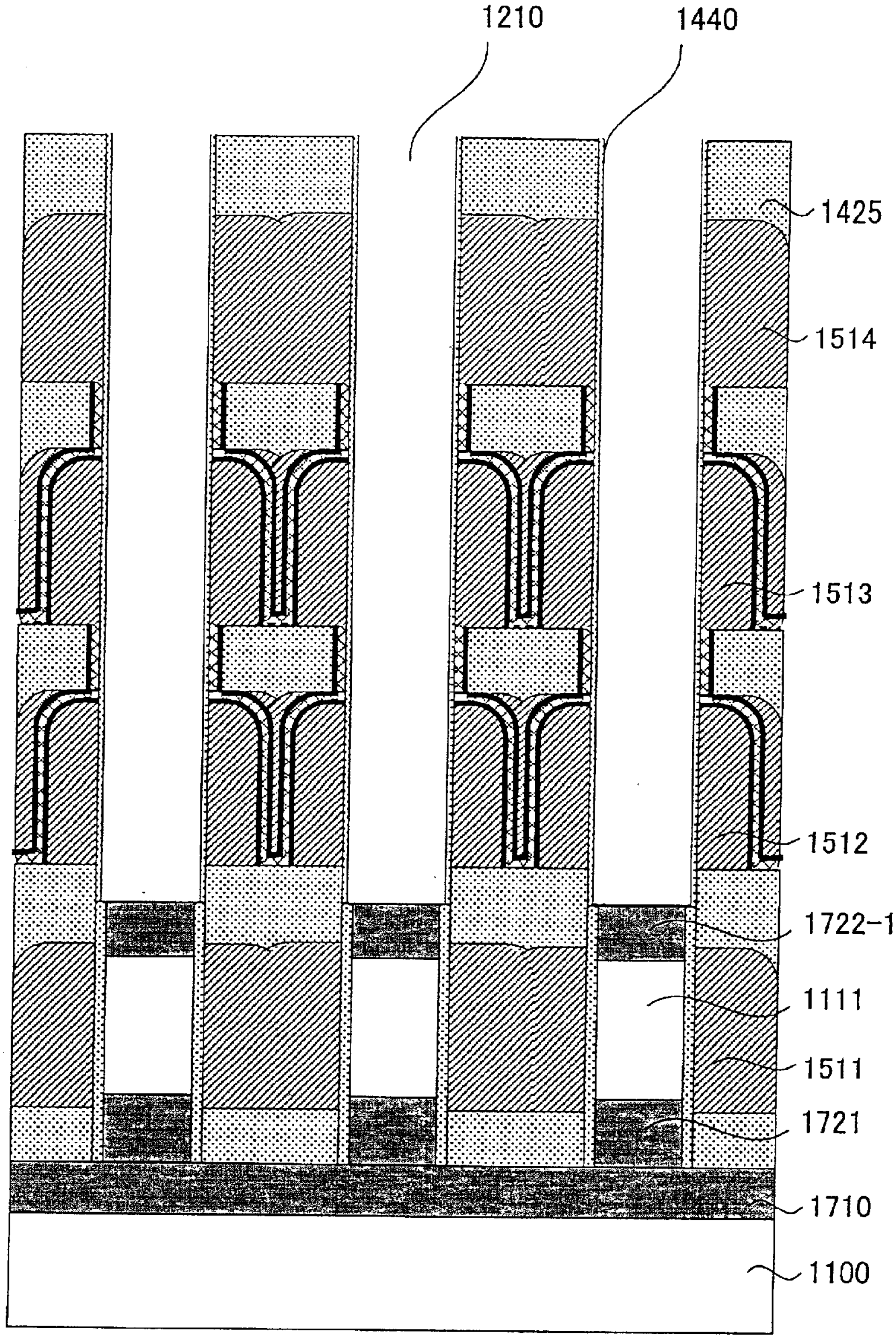

Fig. 1380
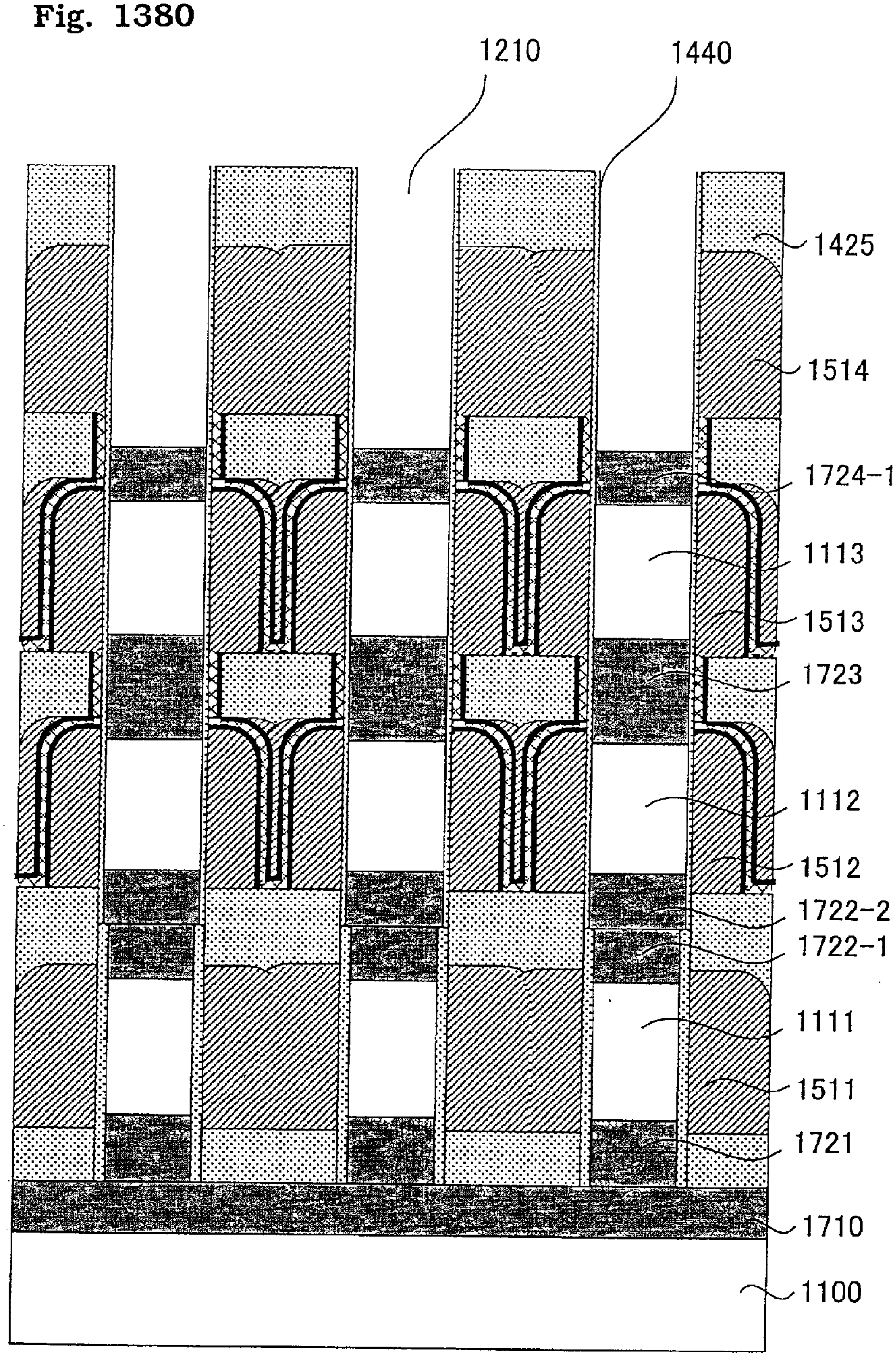

Fig. 1381
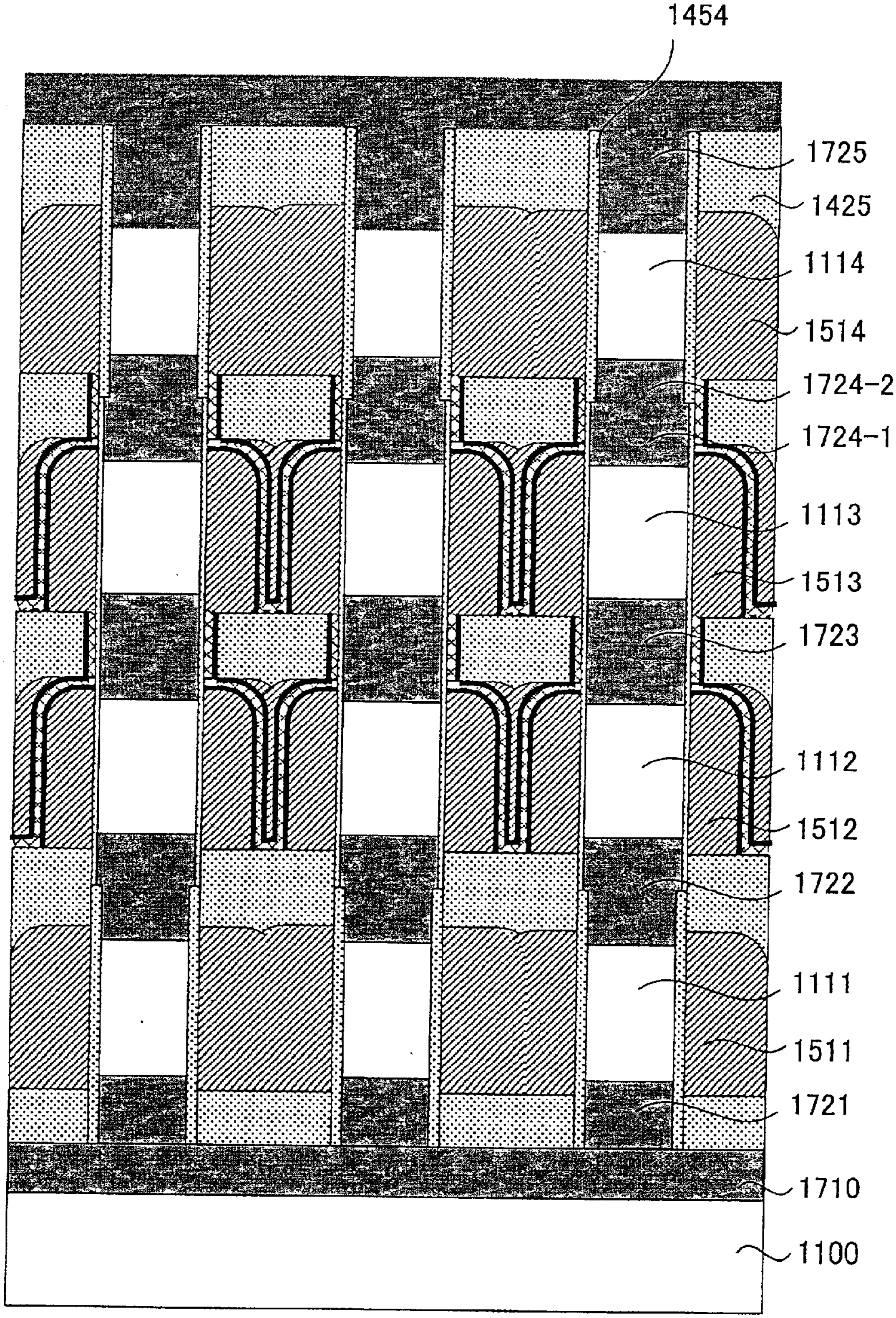

Fig. 1382
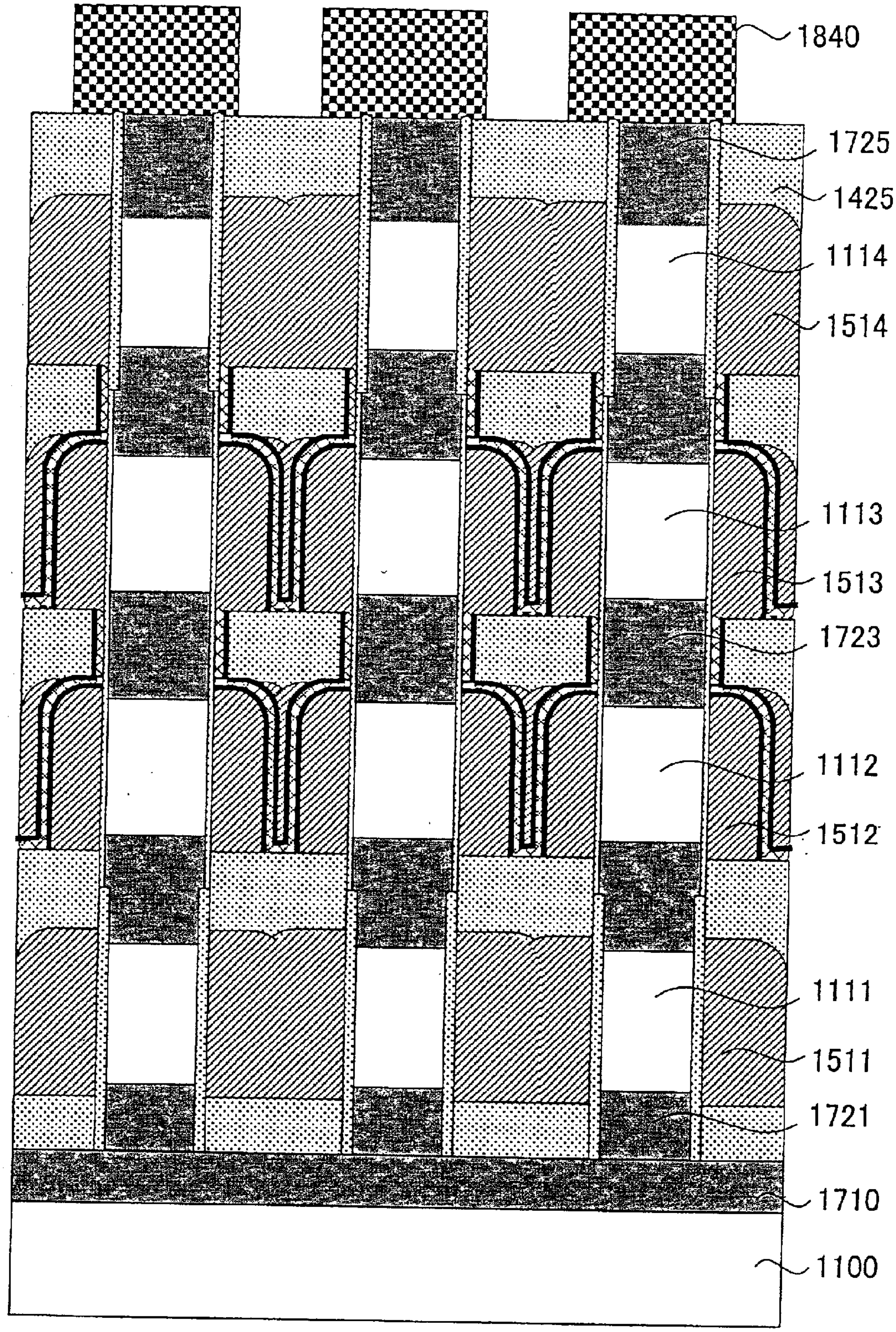

Fig. 1383
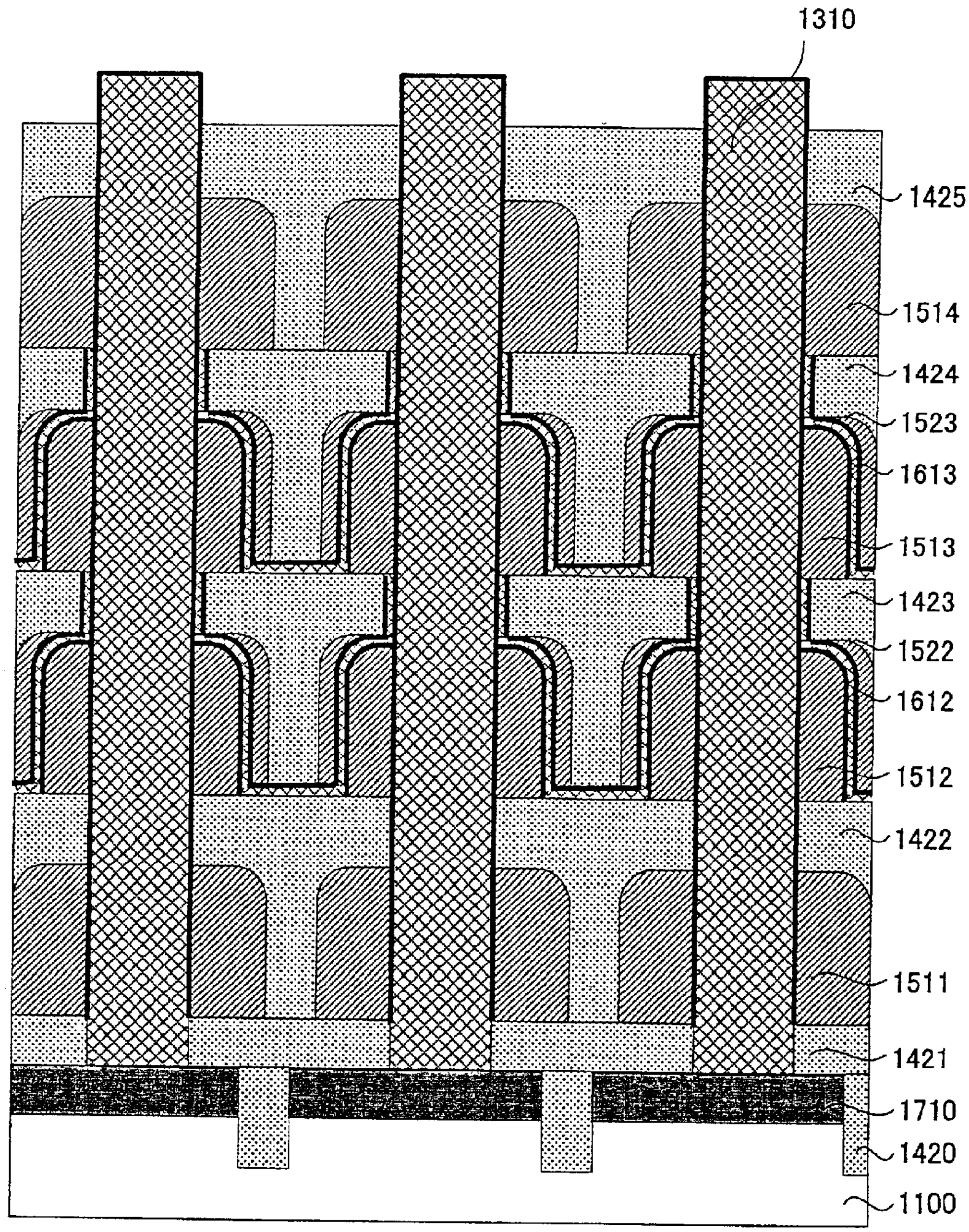

Fig. 1384
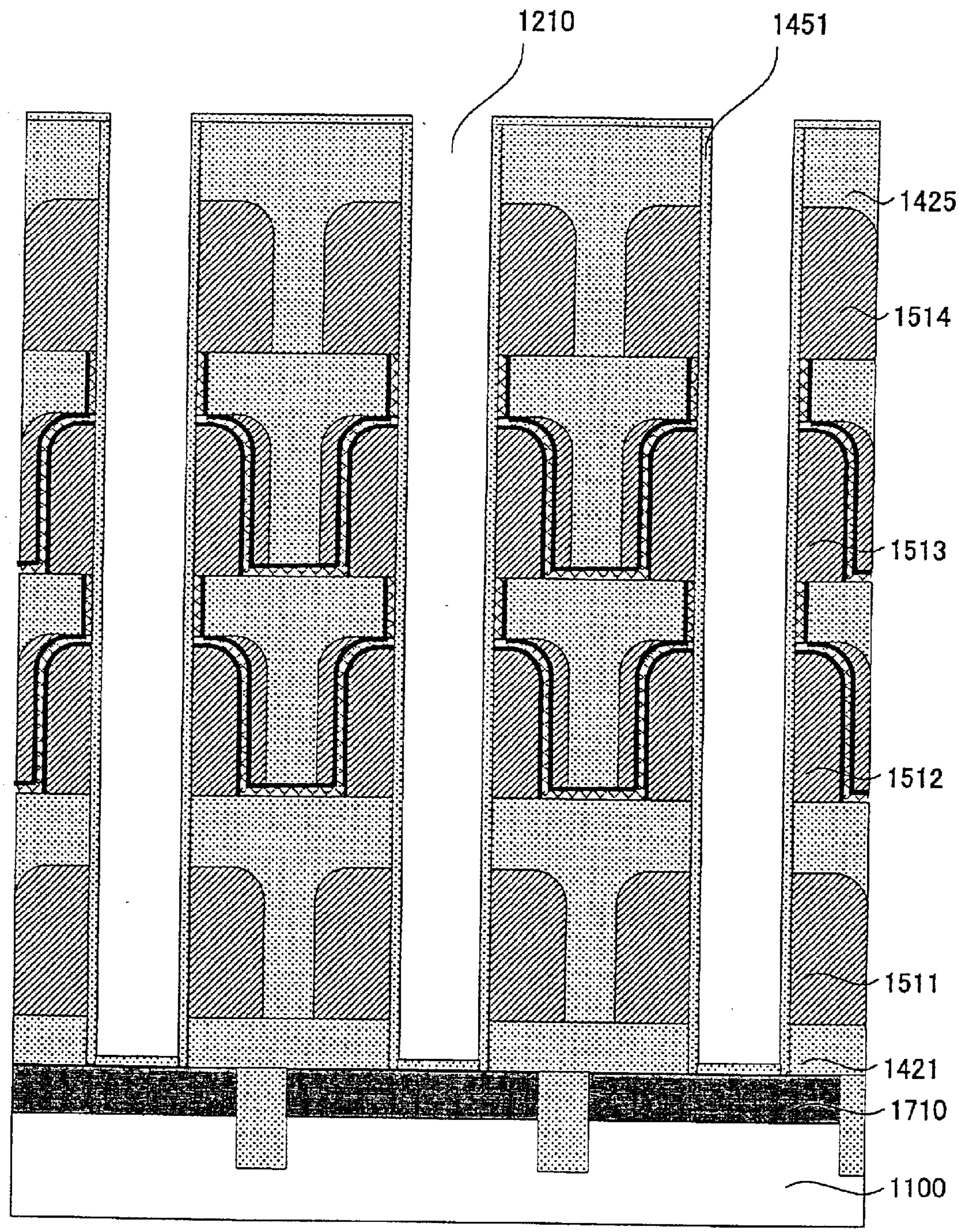

Fig. 1385
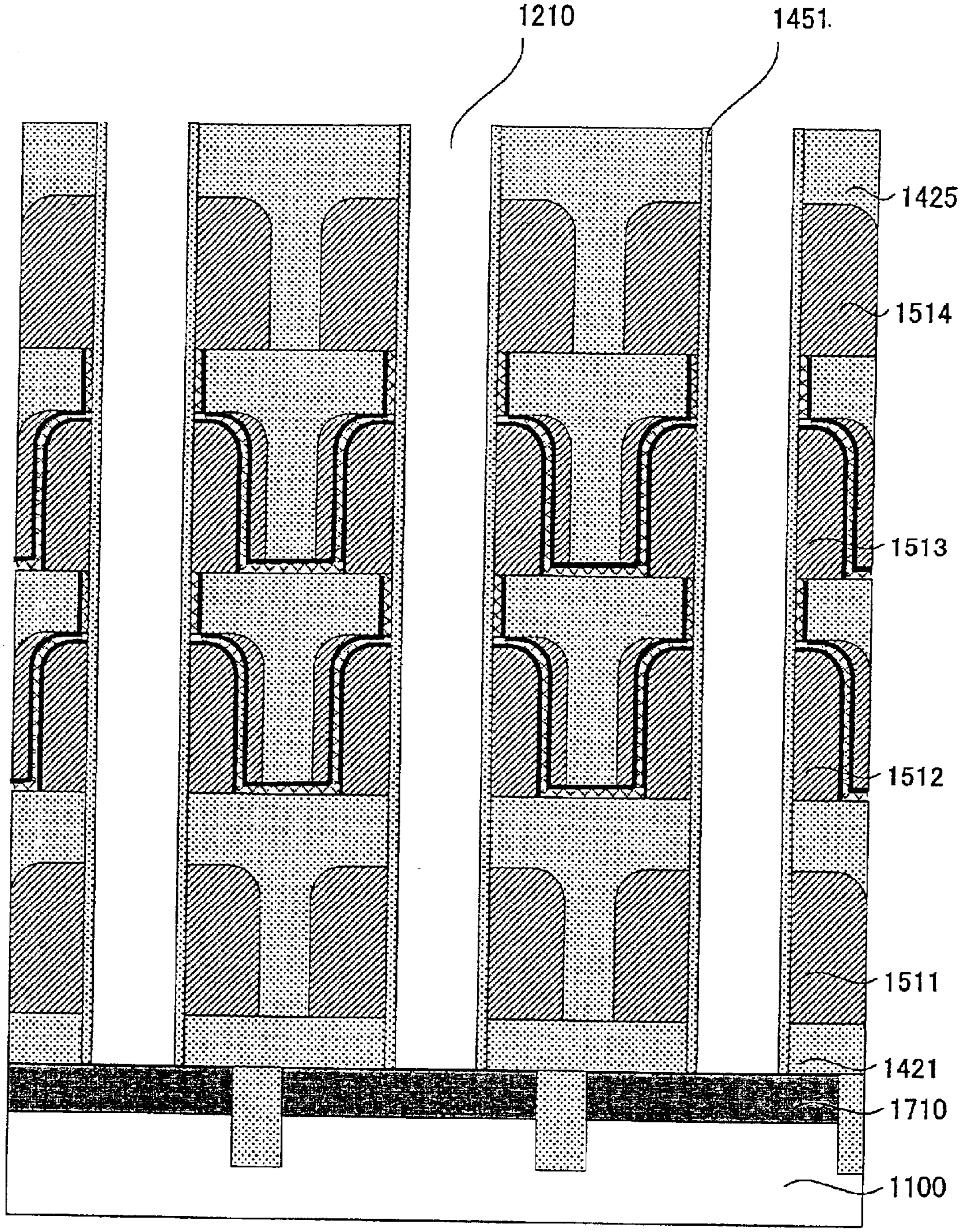

Fig. 1386
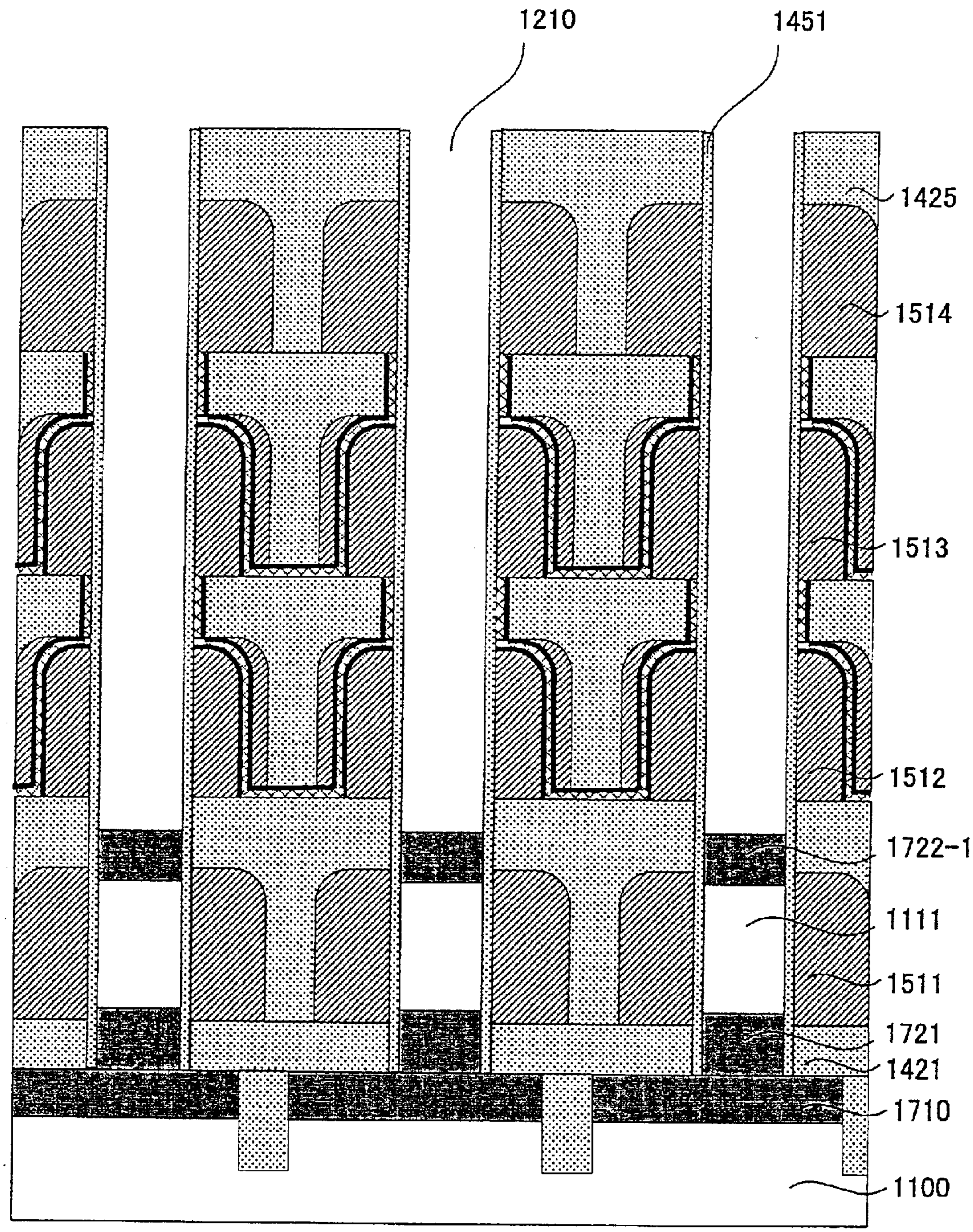

Fig. 1387
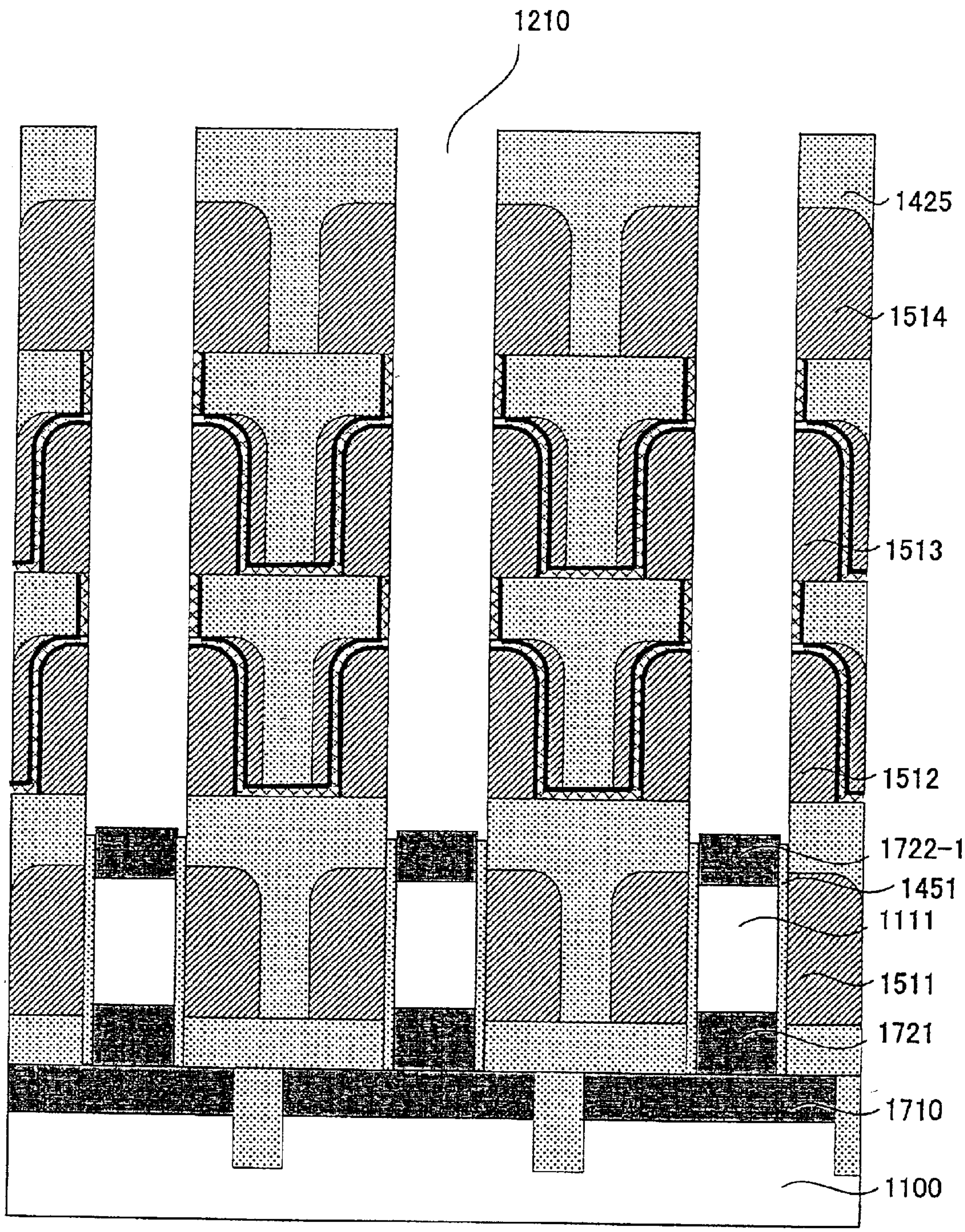

Fig. 1388
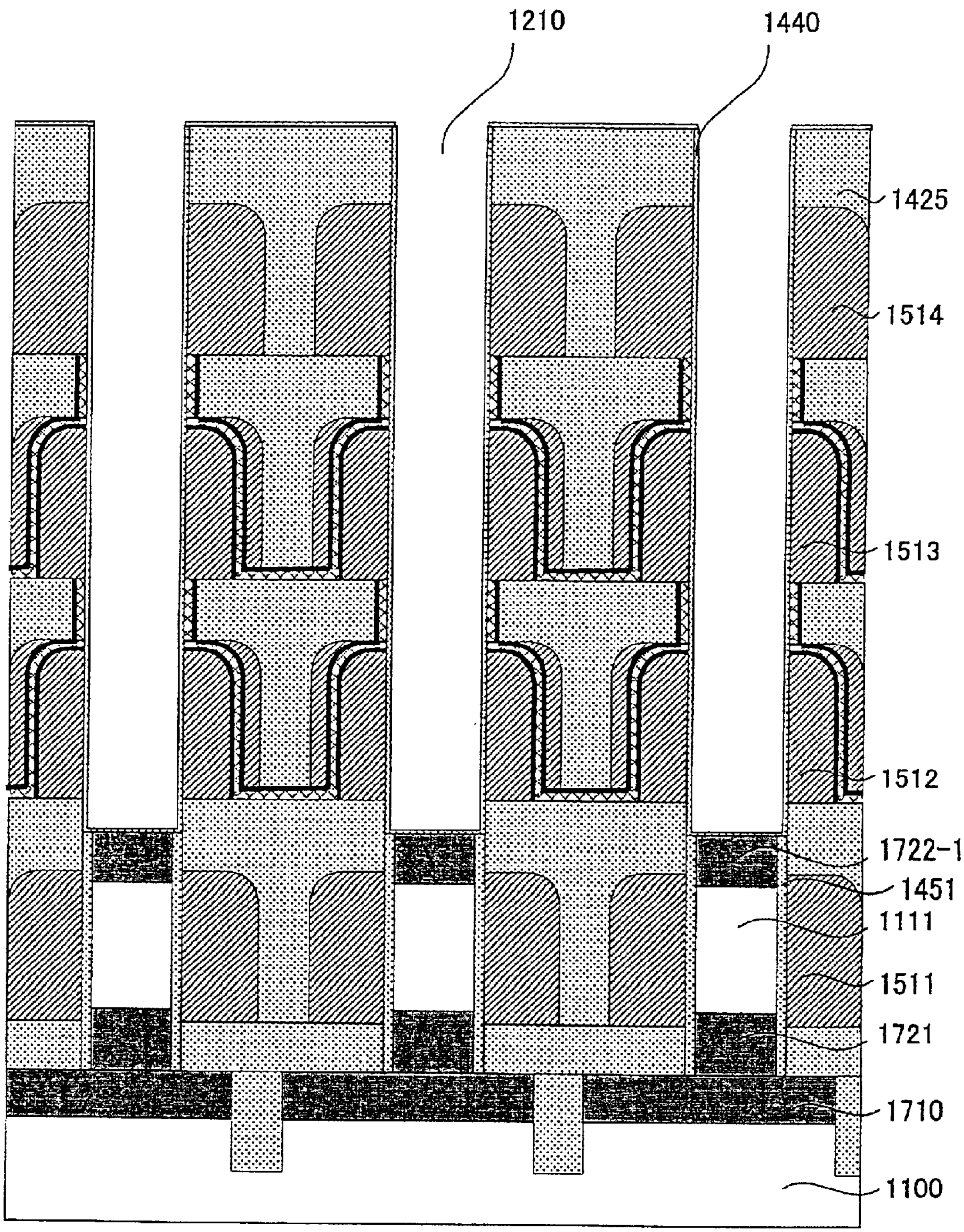

Fig. 1389
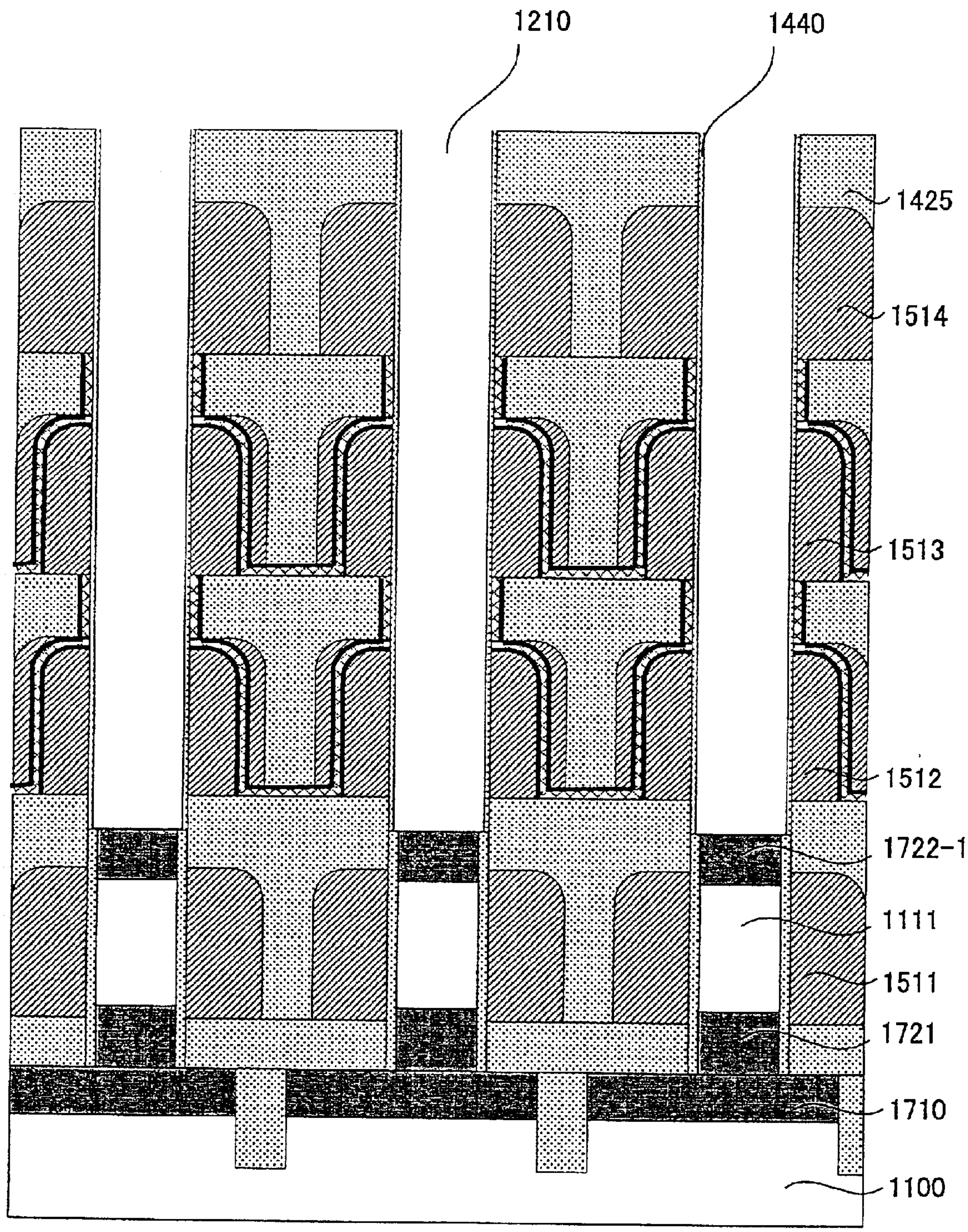

Fig. 1390
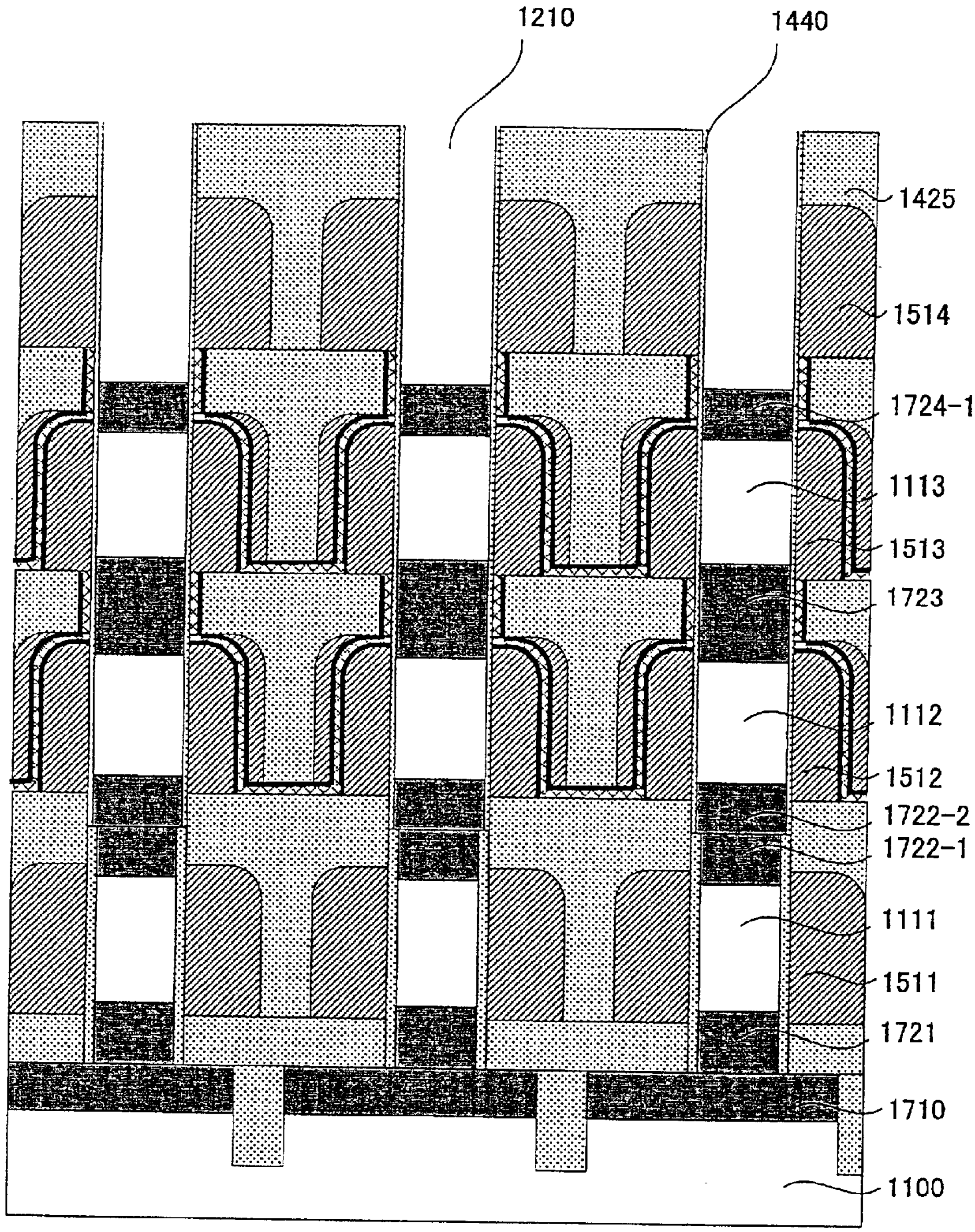

Fig. 1391
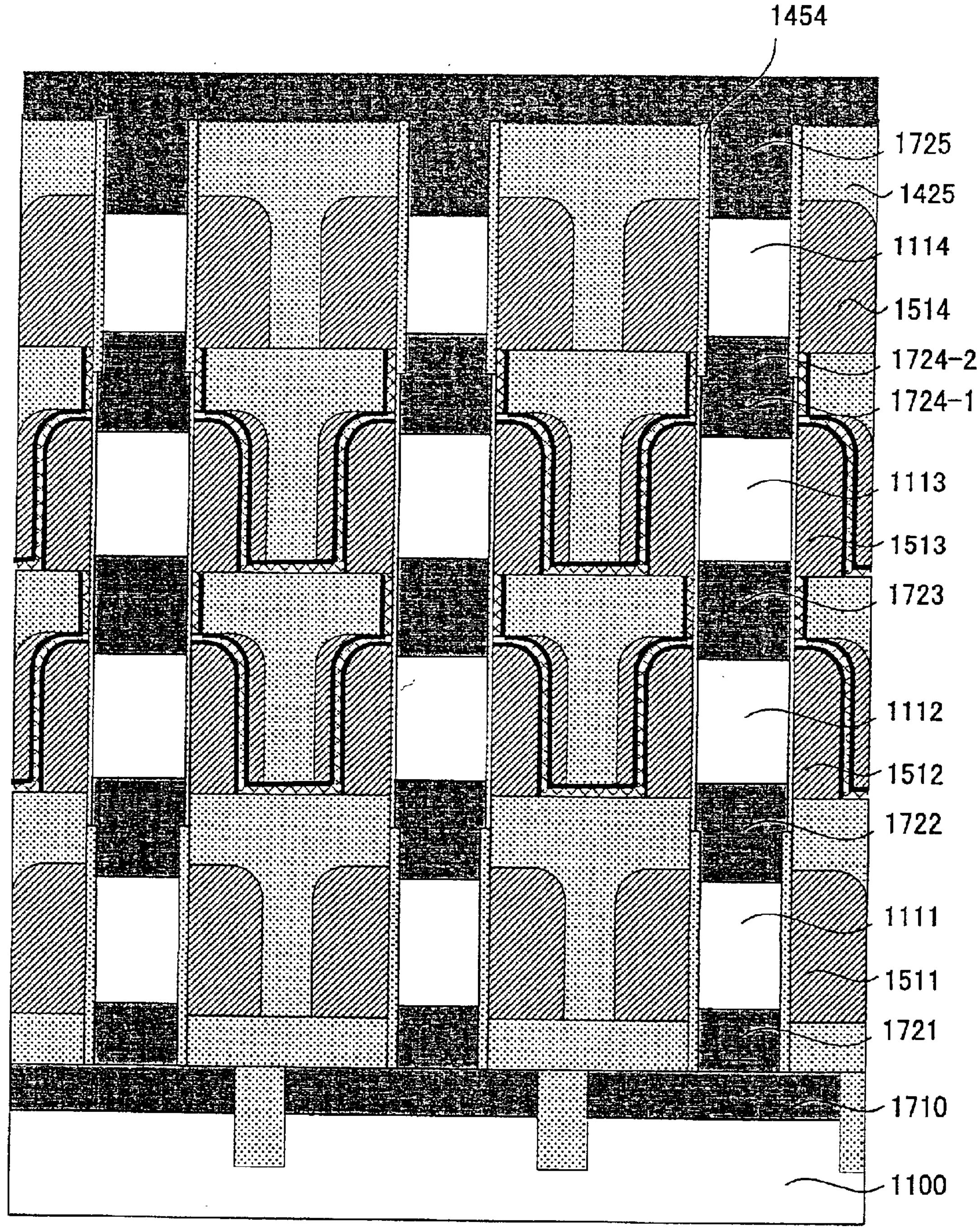

Fig. 1392
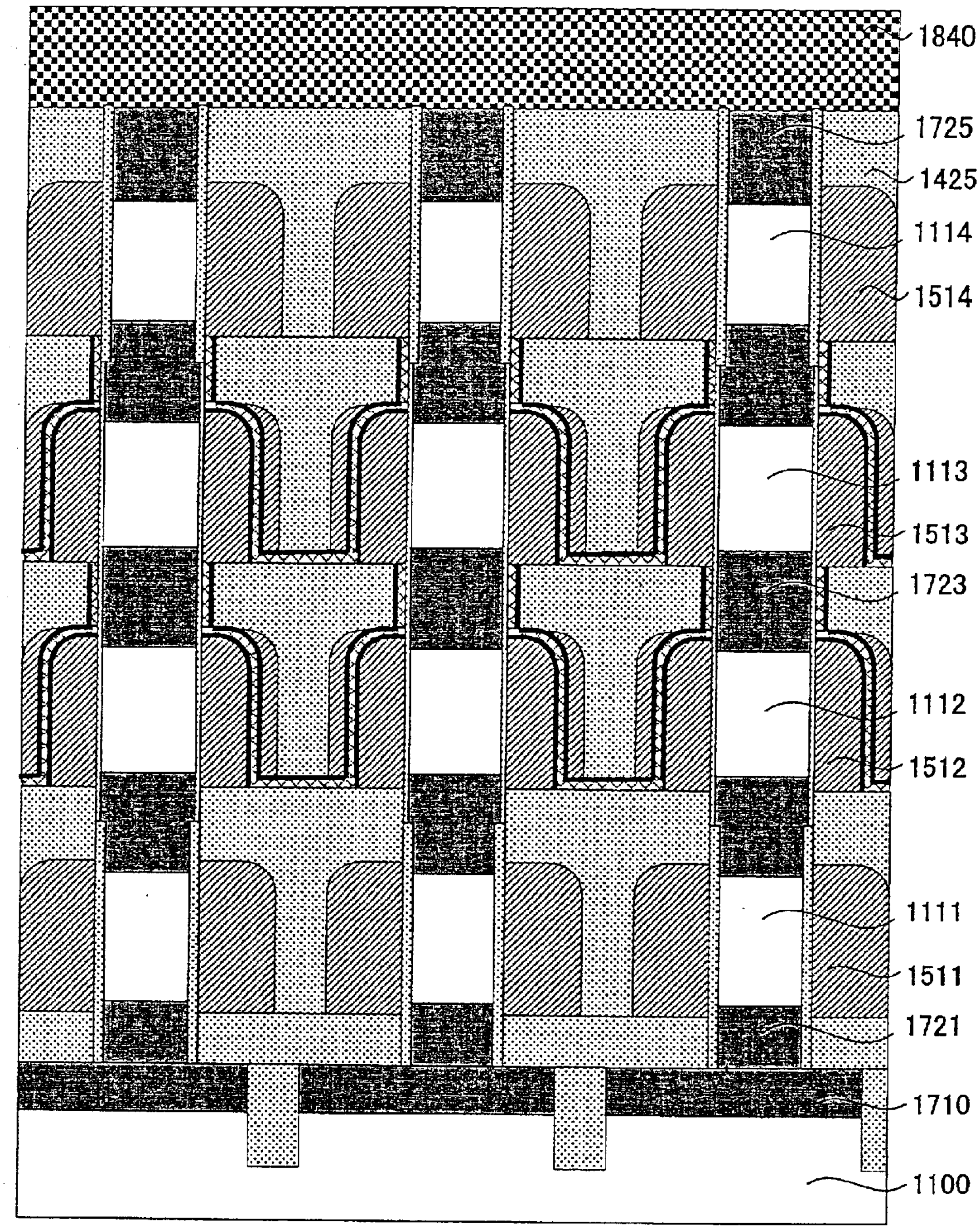

Fig. 1393
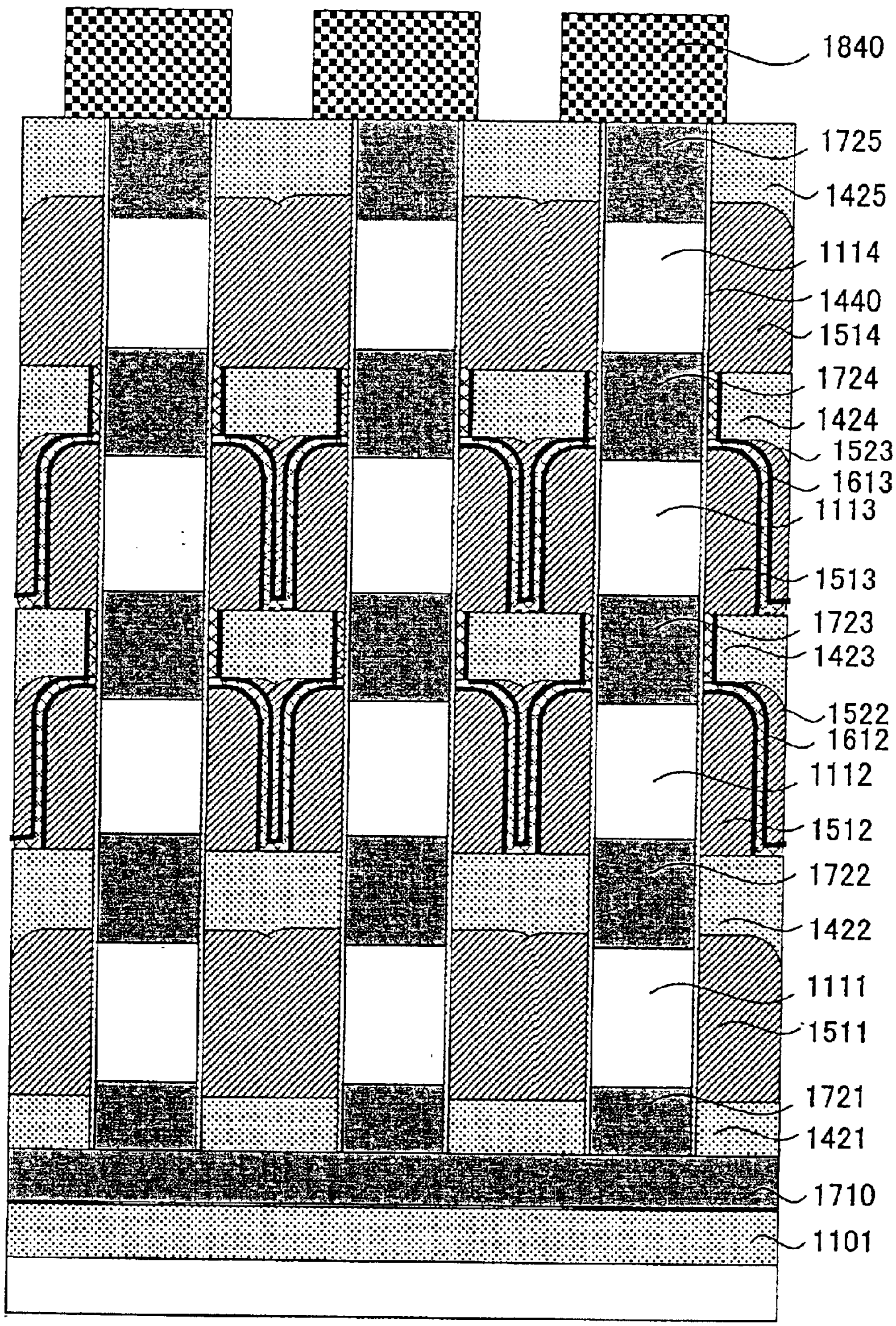

Fig. 1394
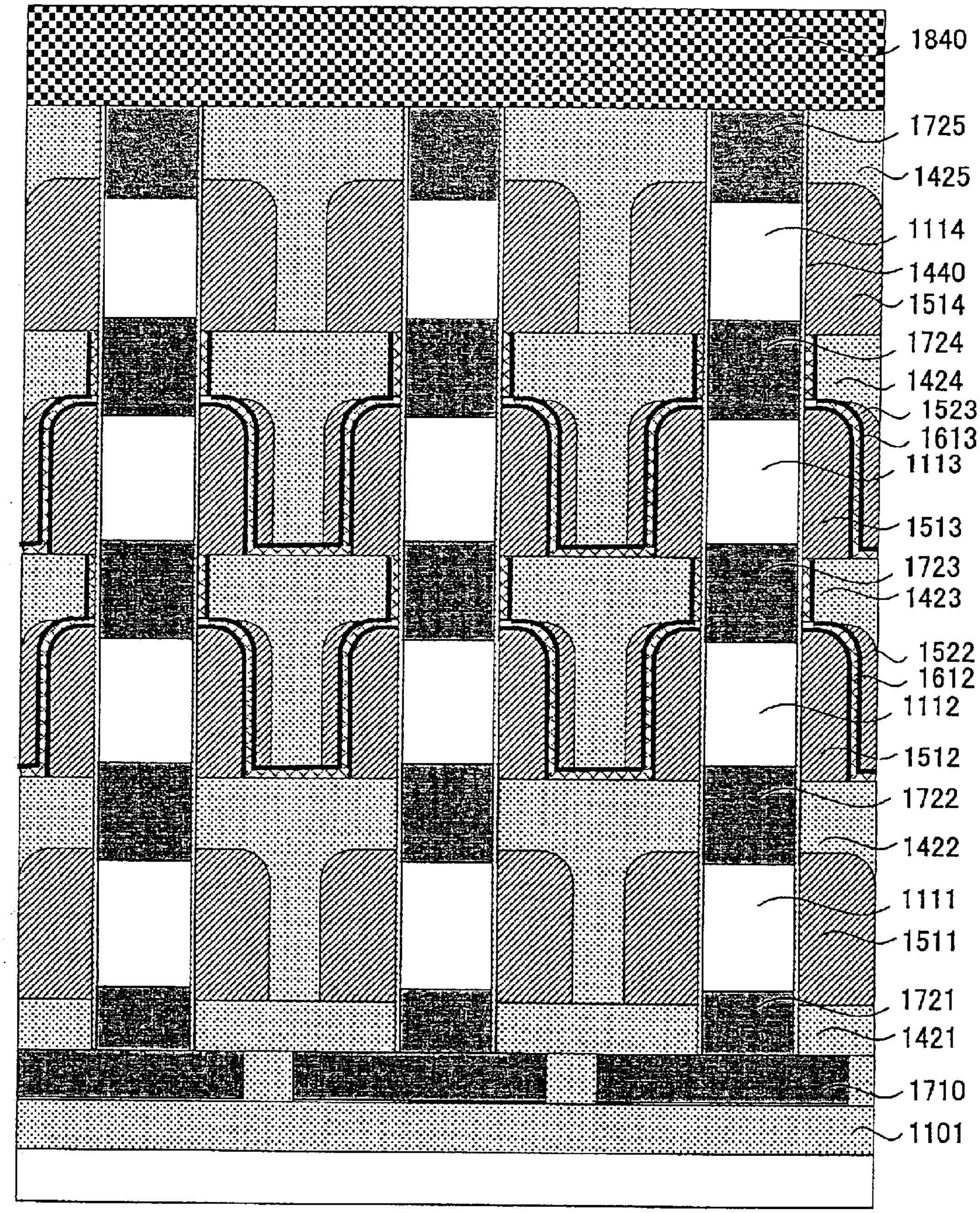

Fig. 1395
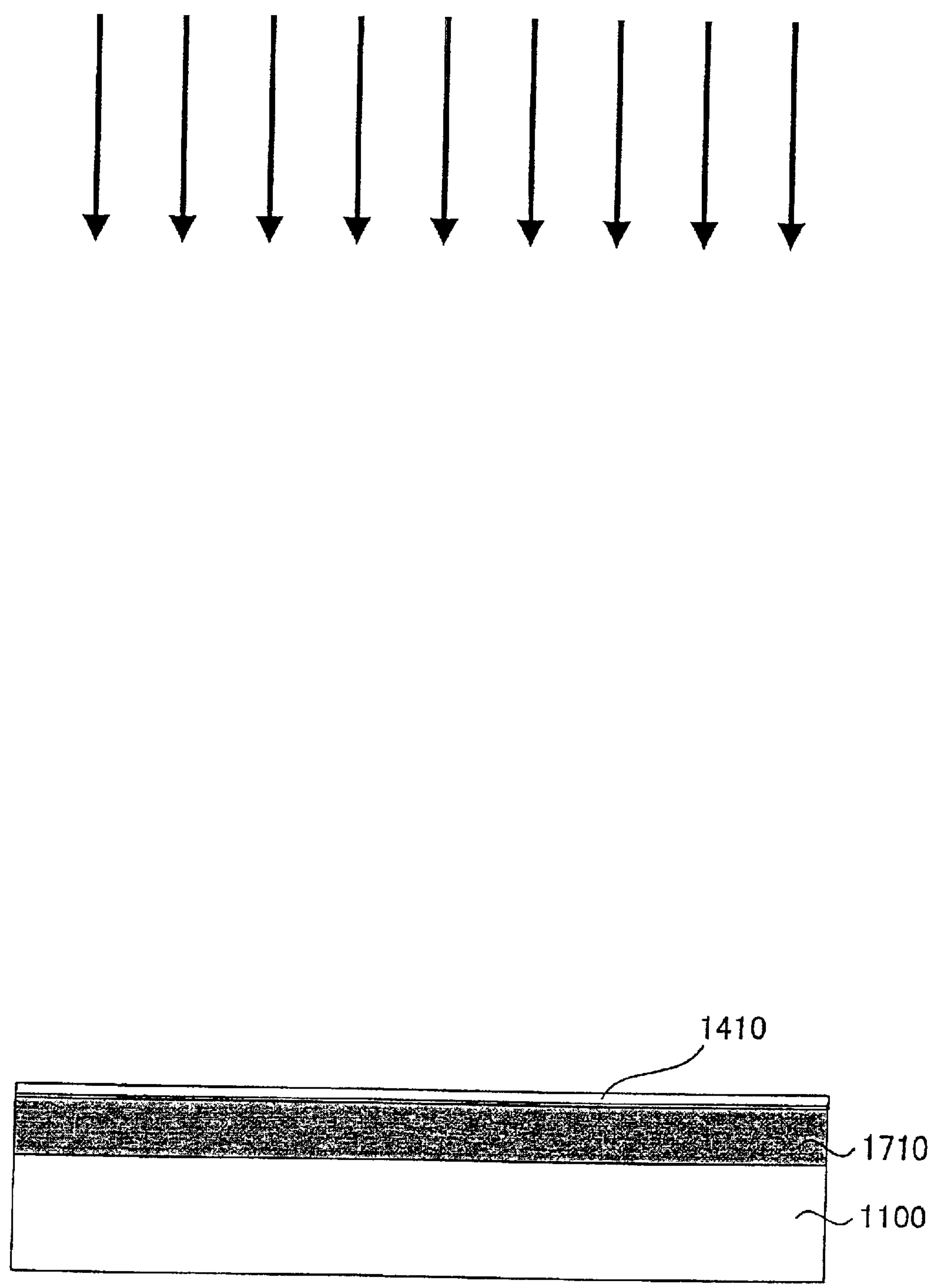

Fig. 1396
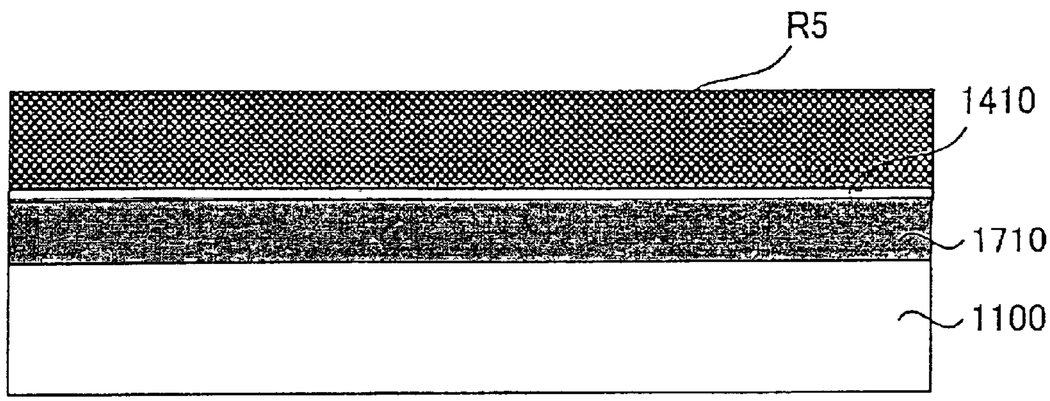
Fig. 1397
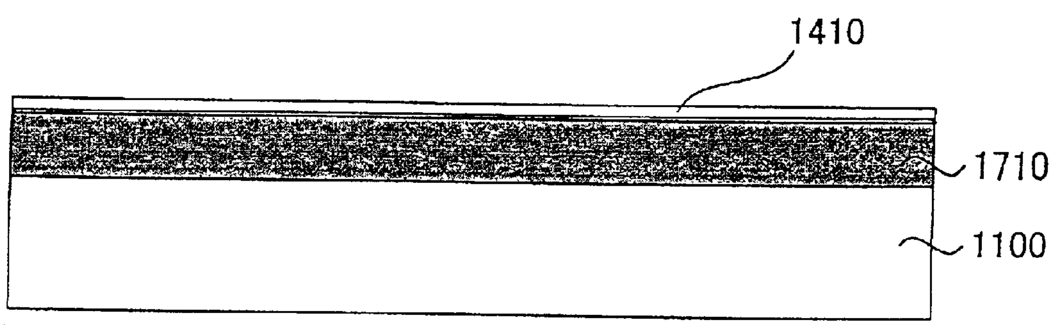

Fig. 1398
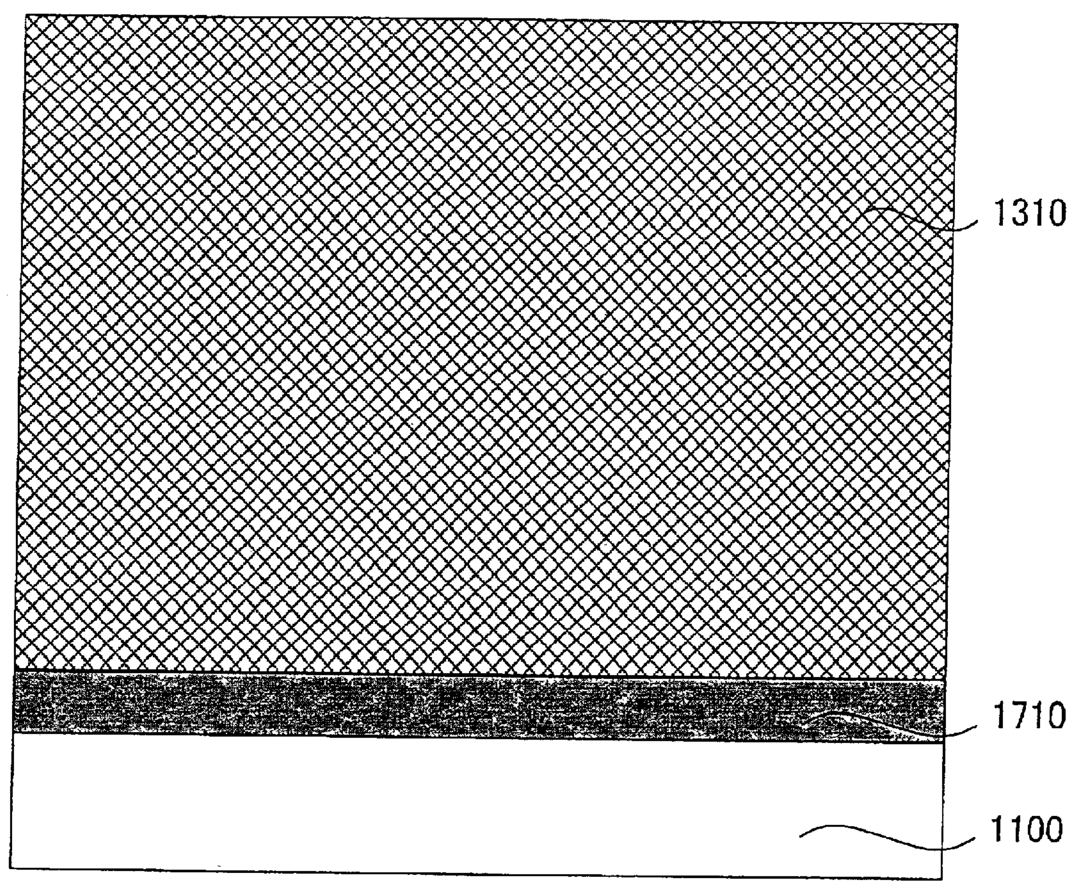

Fig. 1399
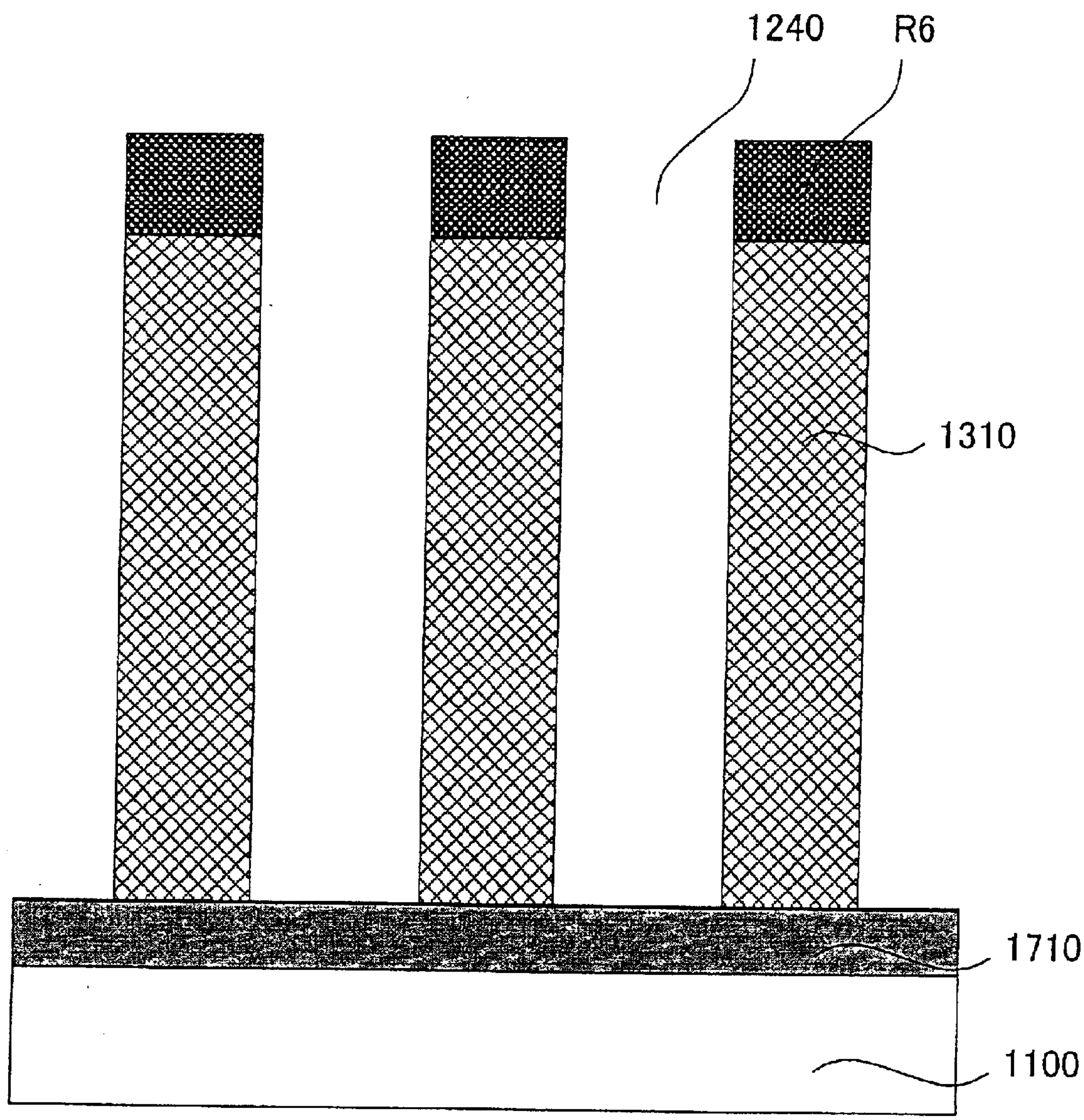

Fig. 1400
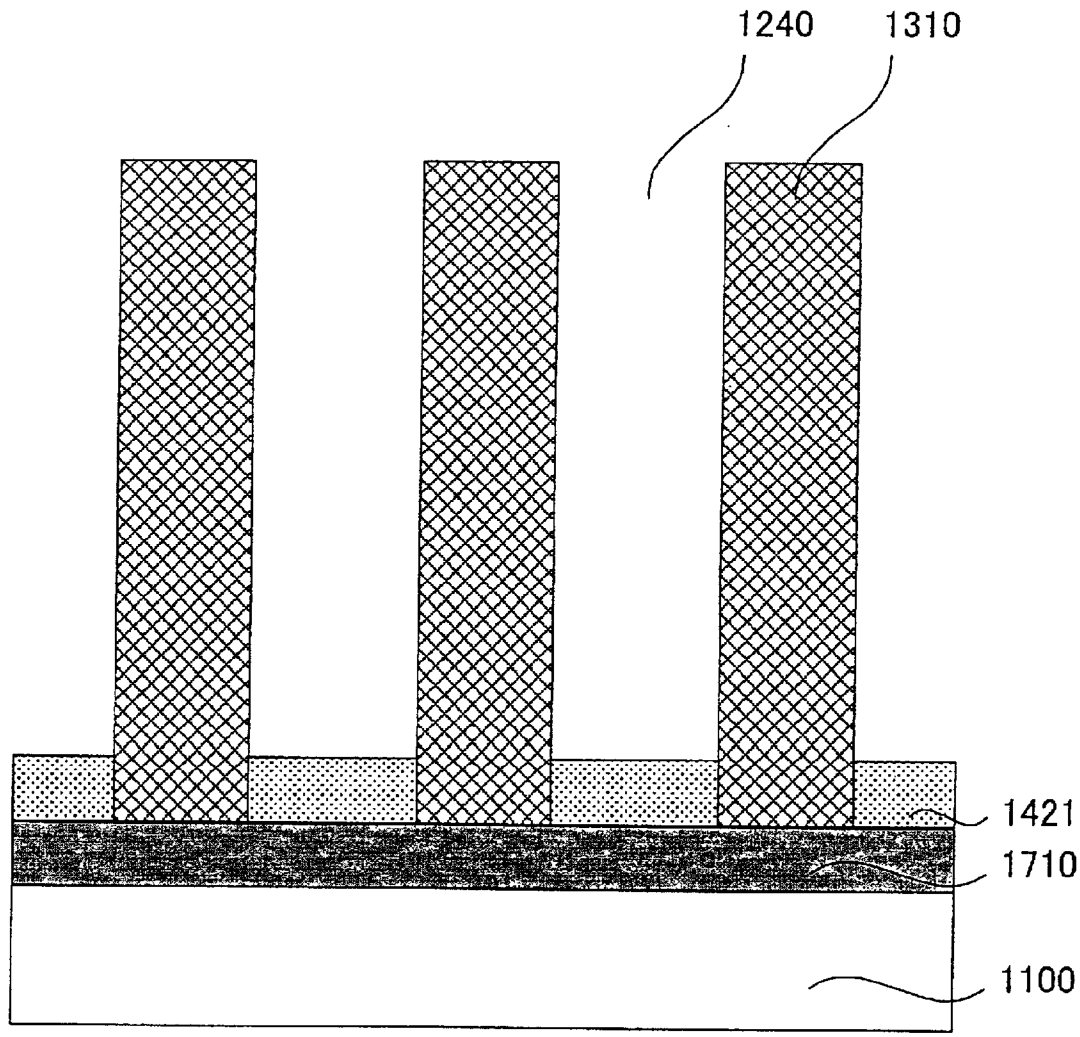

Fig. 1401
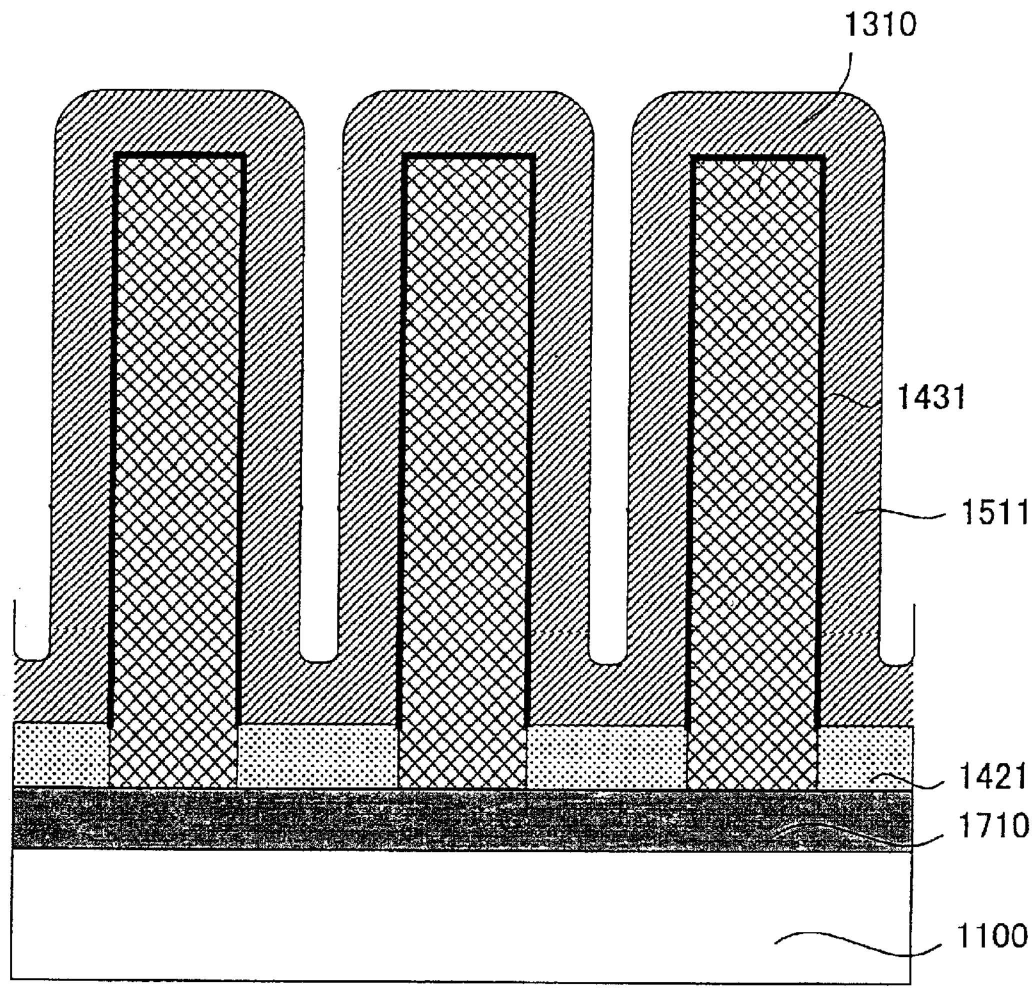

Fig. 1402
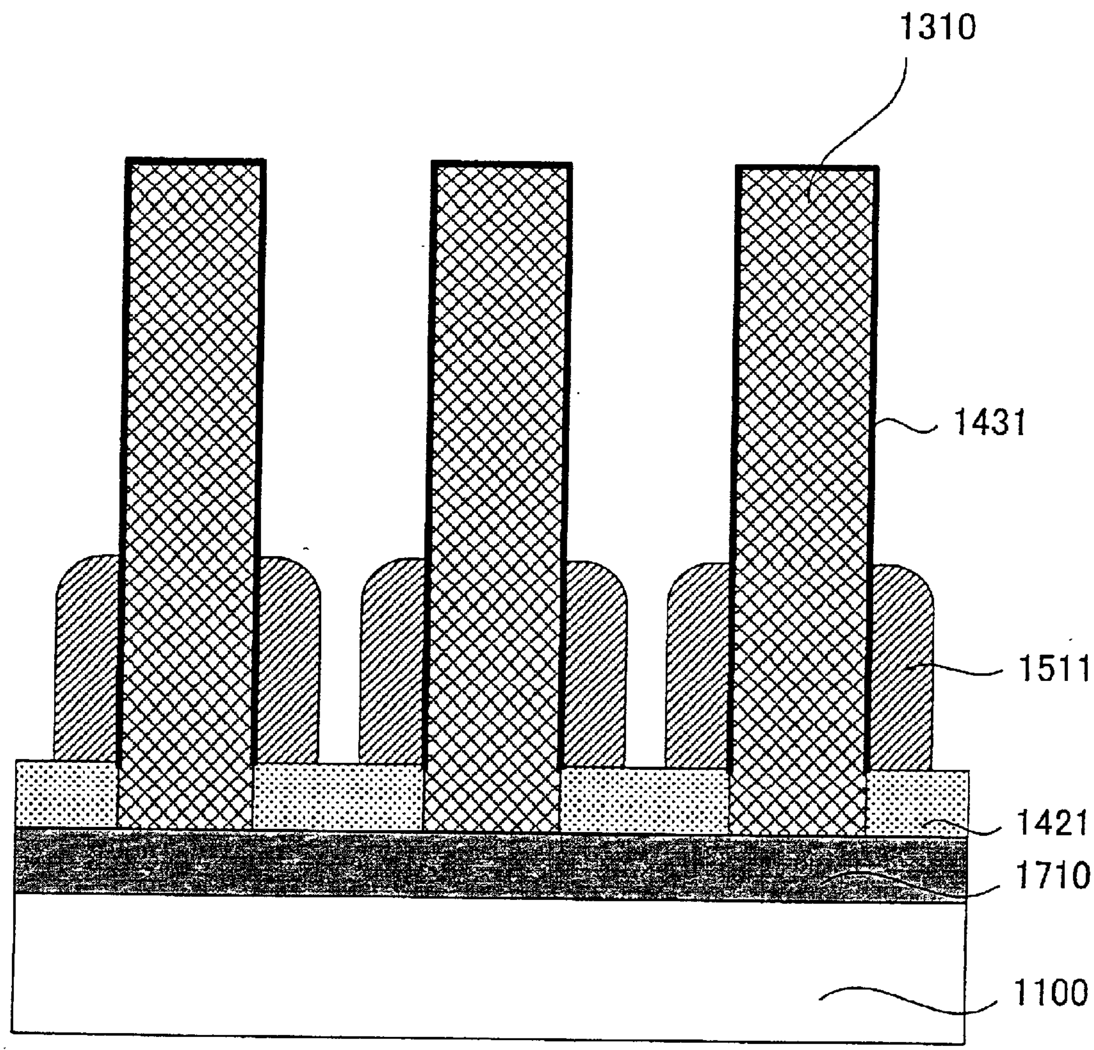

Fig. 1403
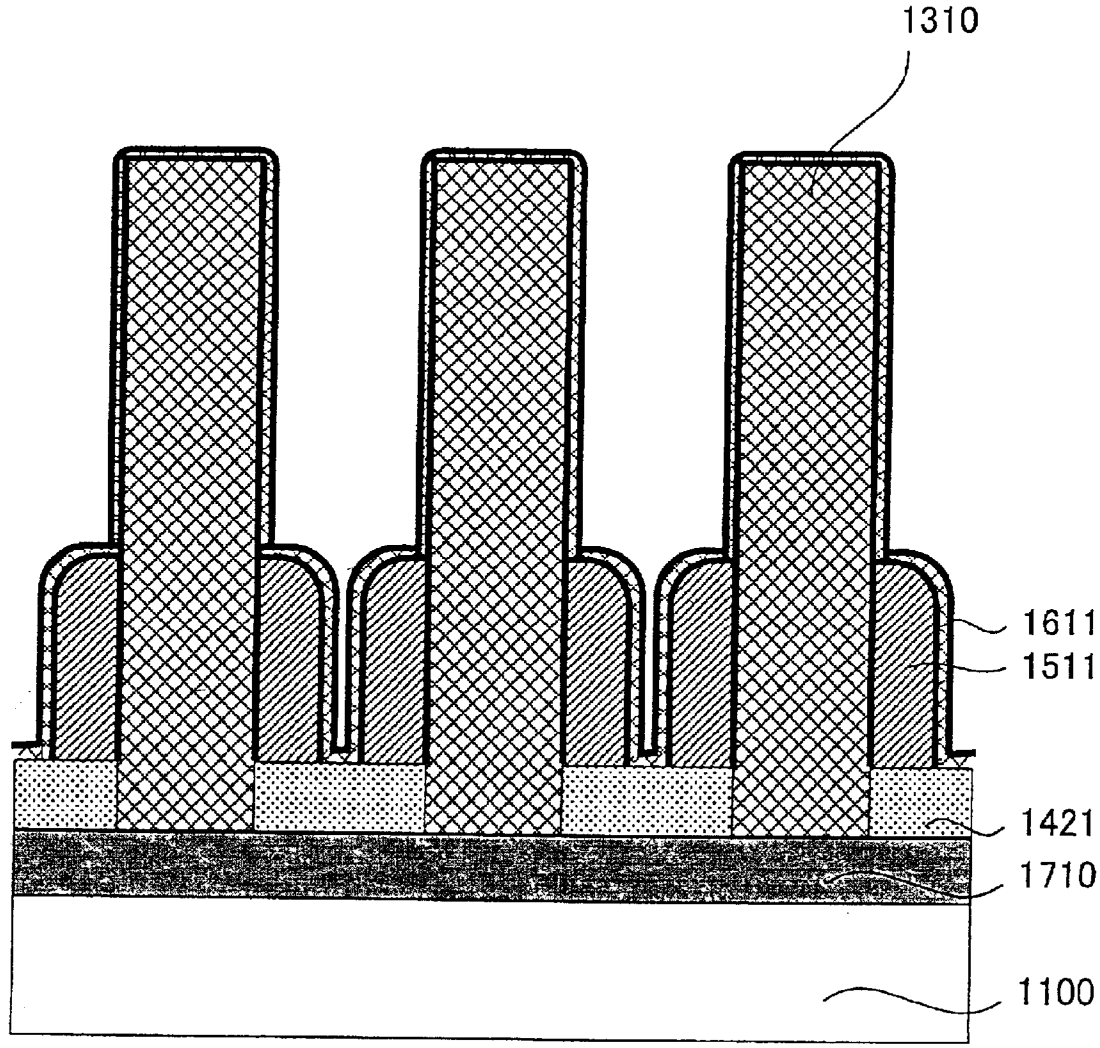

Fig. 1404
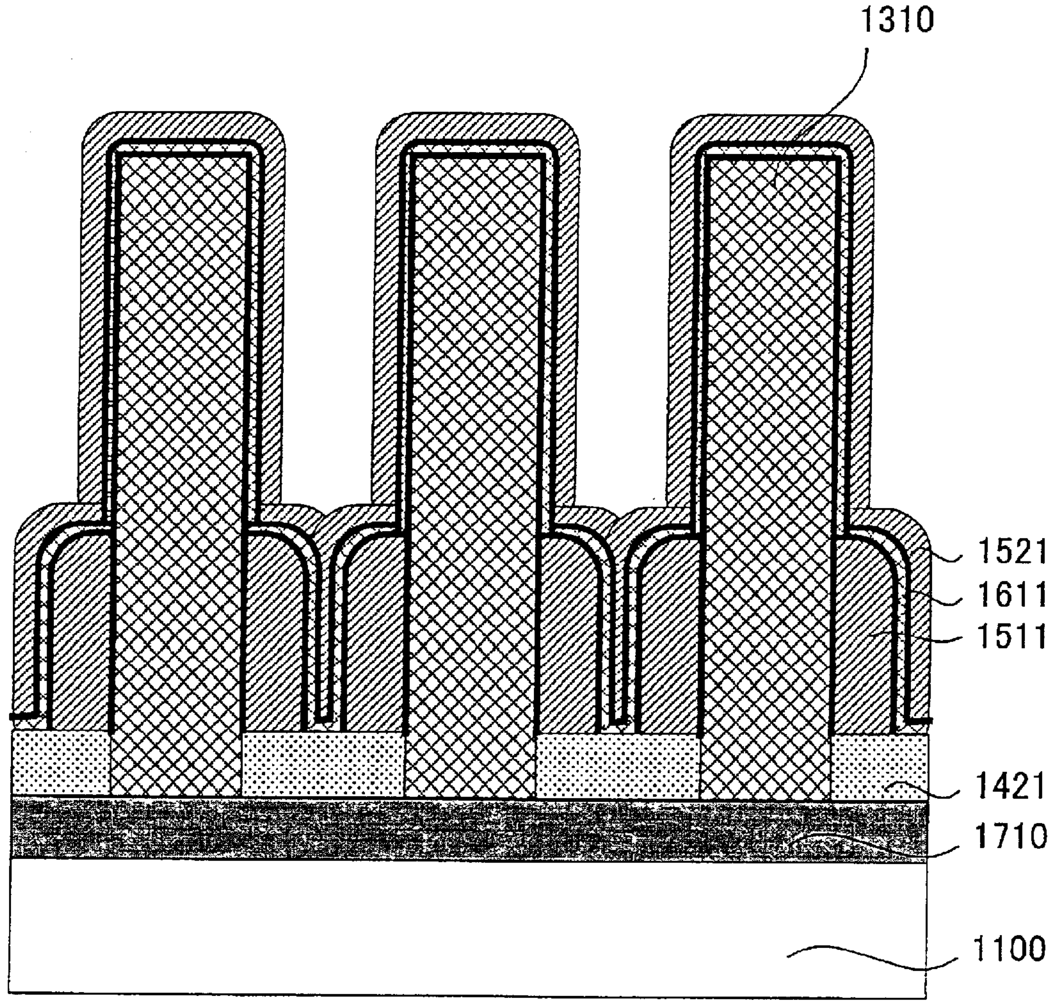

Fig. 1405
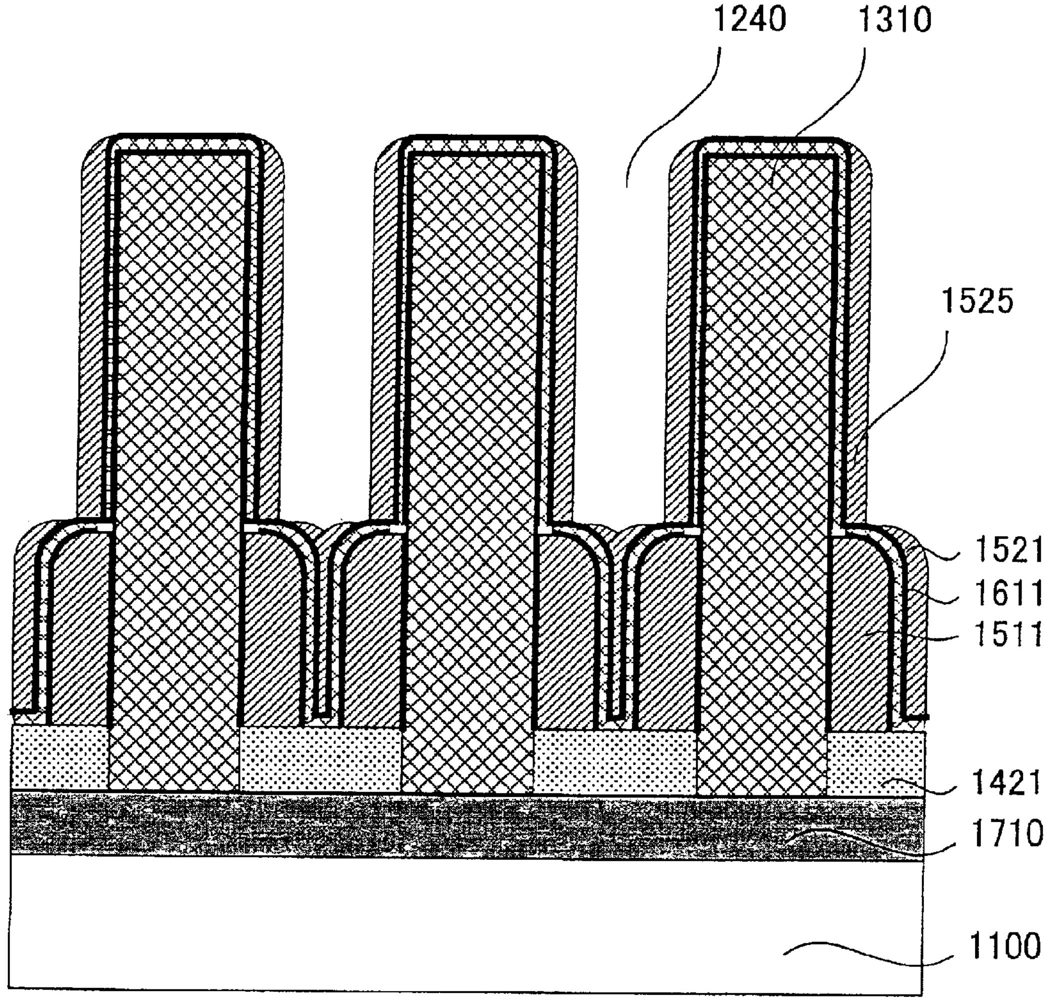

Fig. 1406
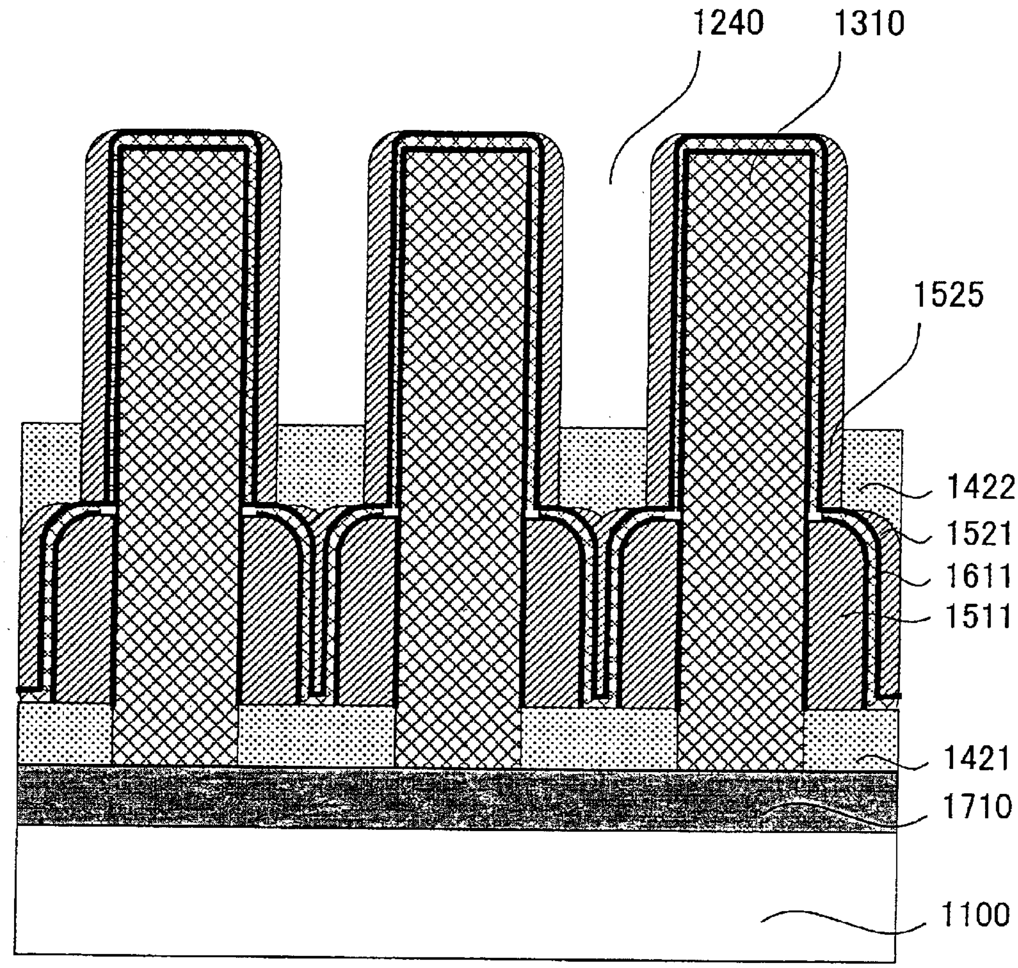

Fig. 1407
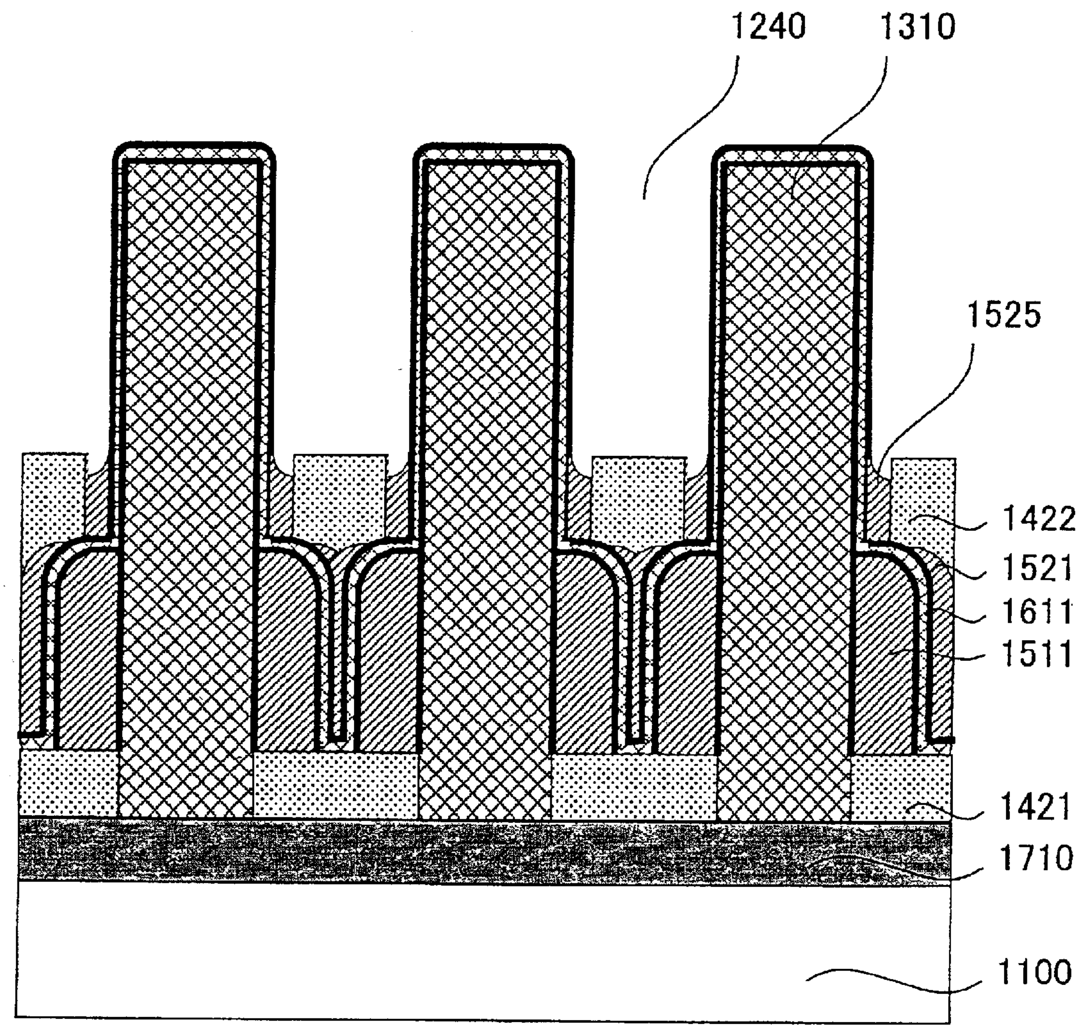

Fig. 1408
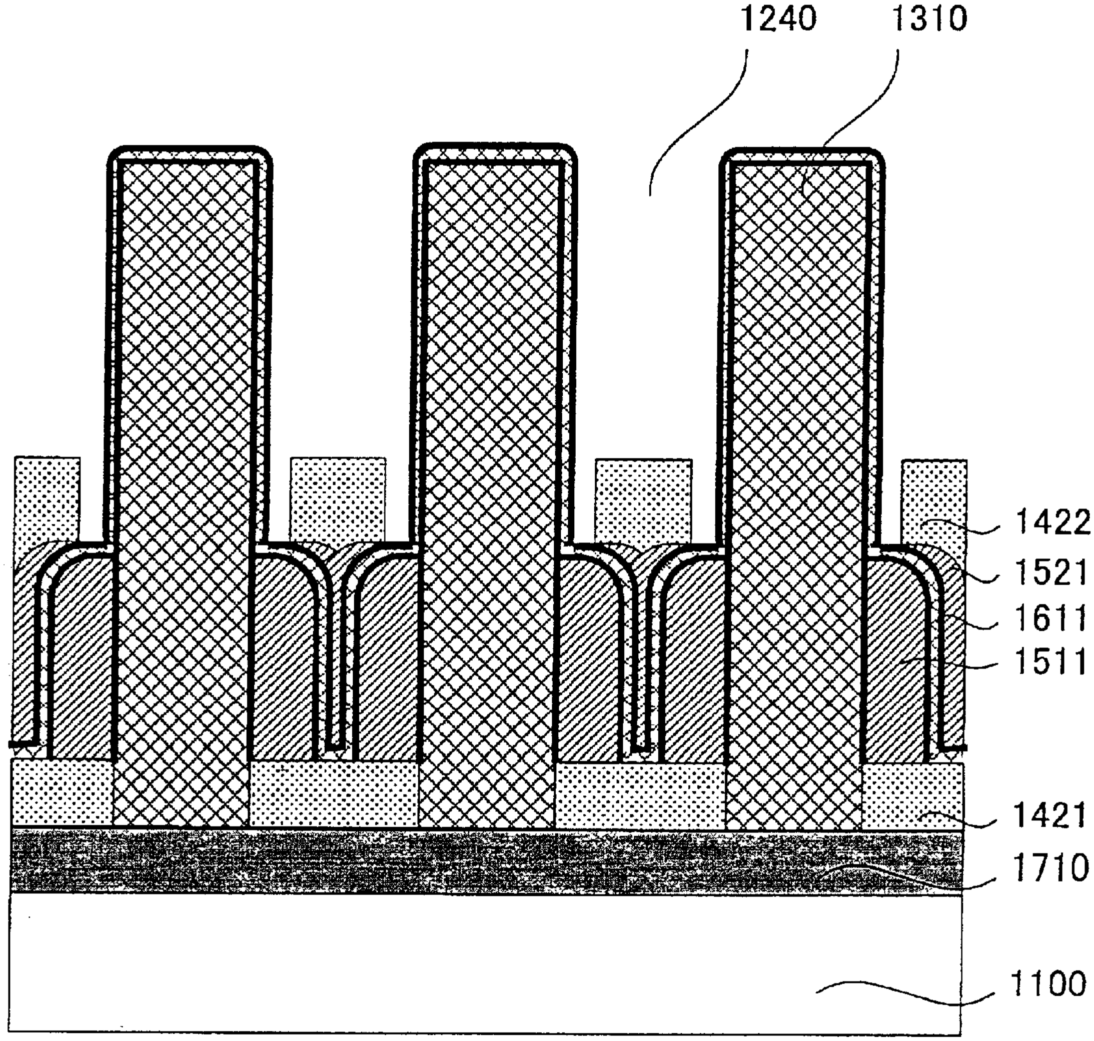

Fig. 1409
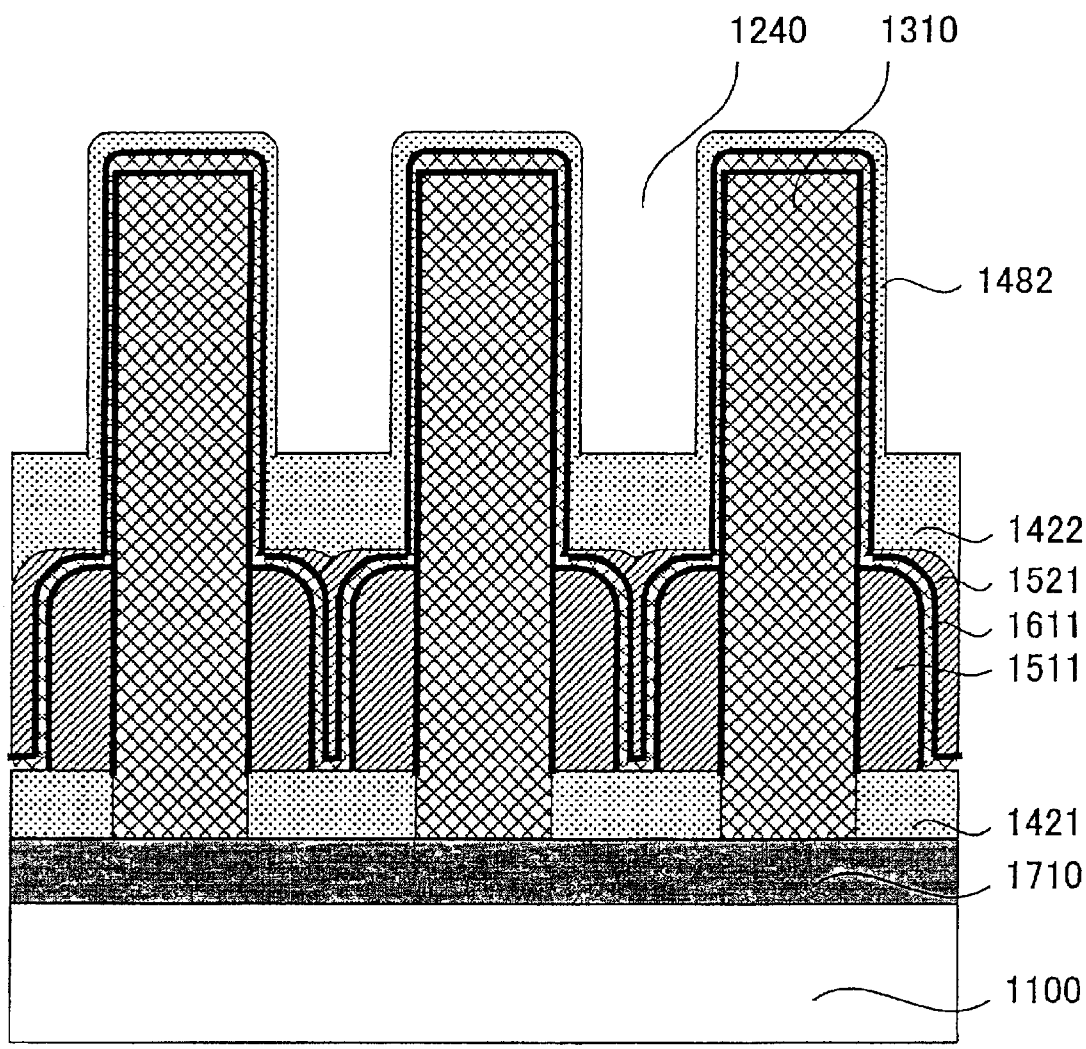

Fig. 1410
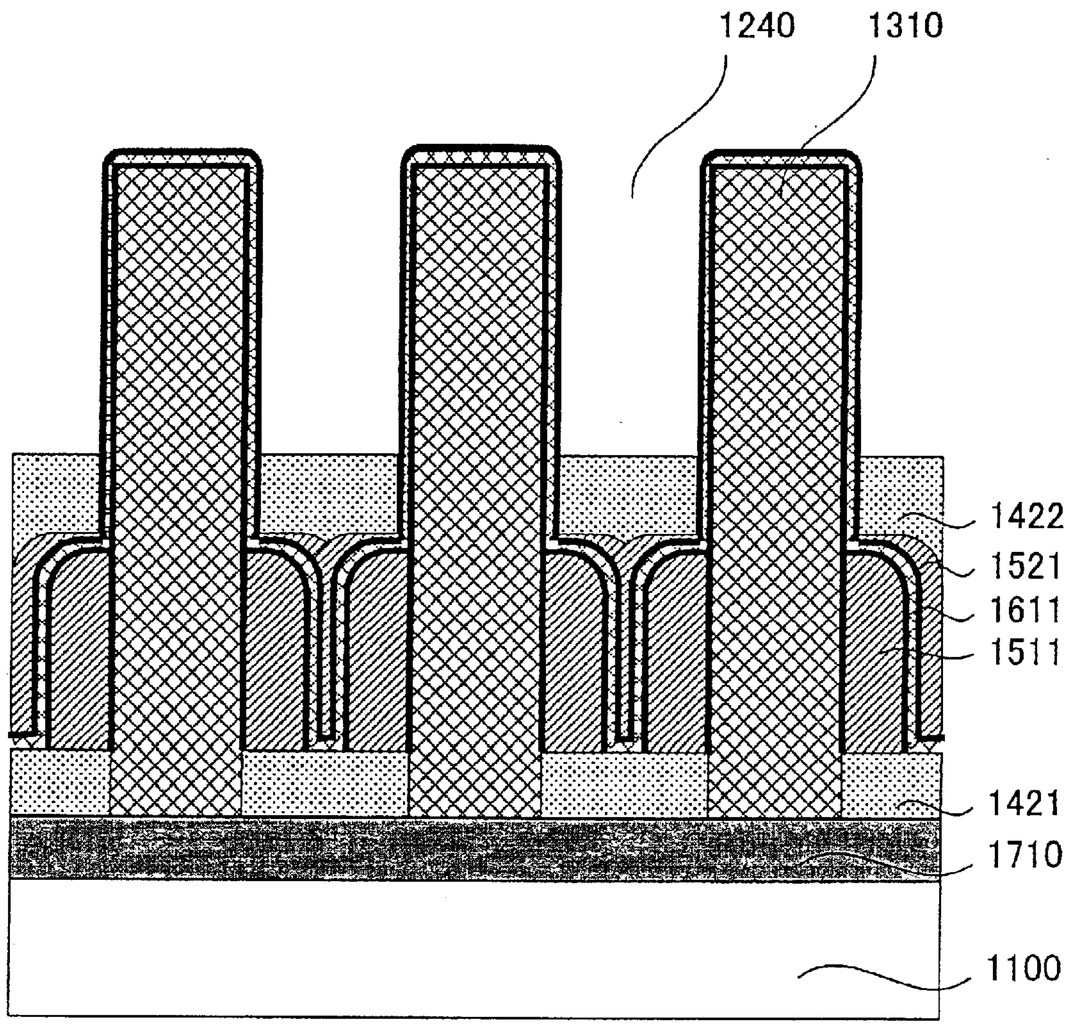

Fig. 1411
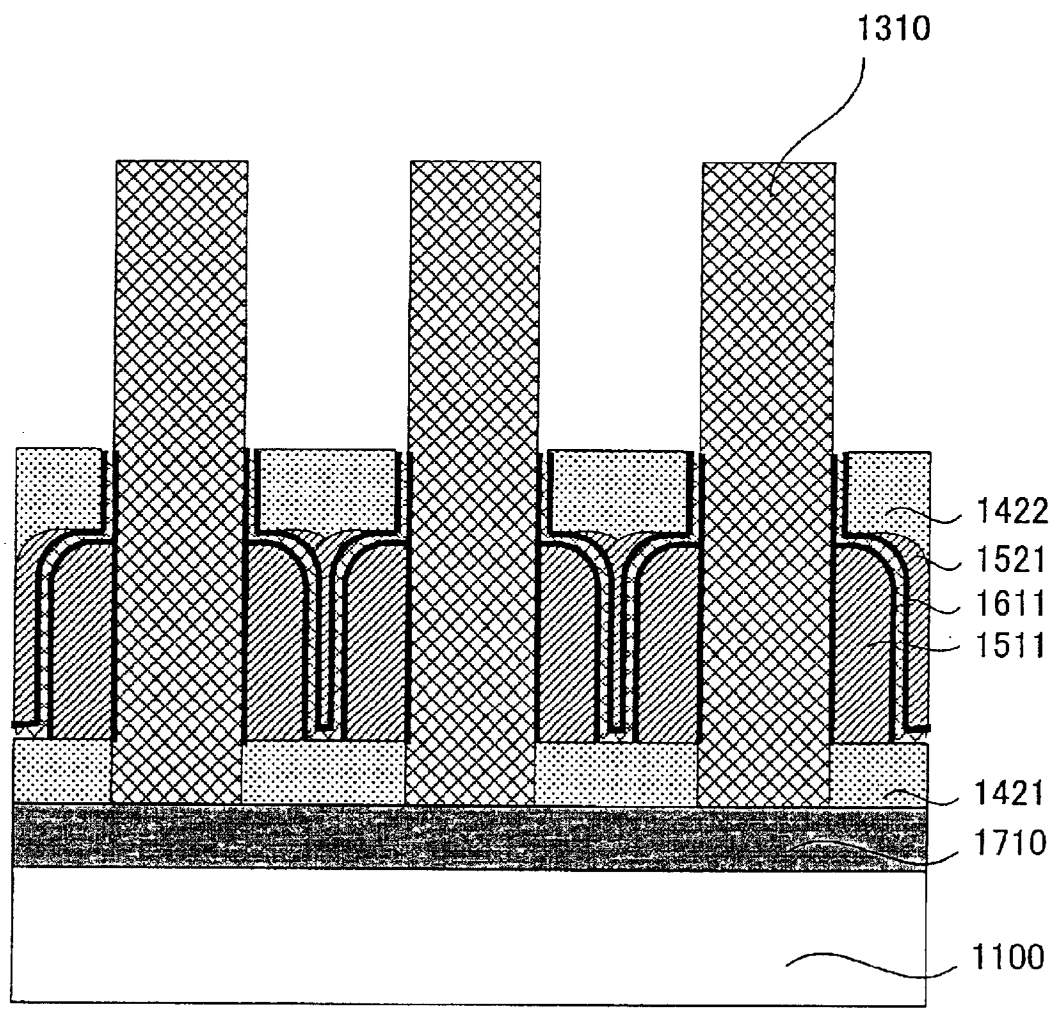

Fig. 1412
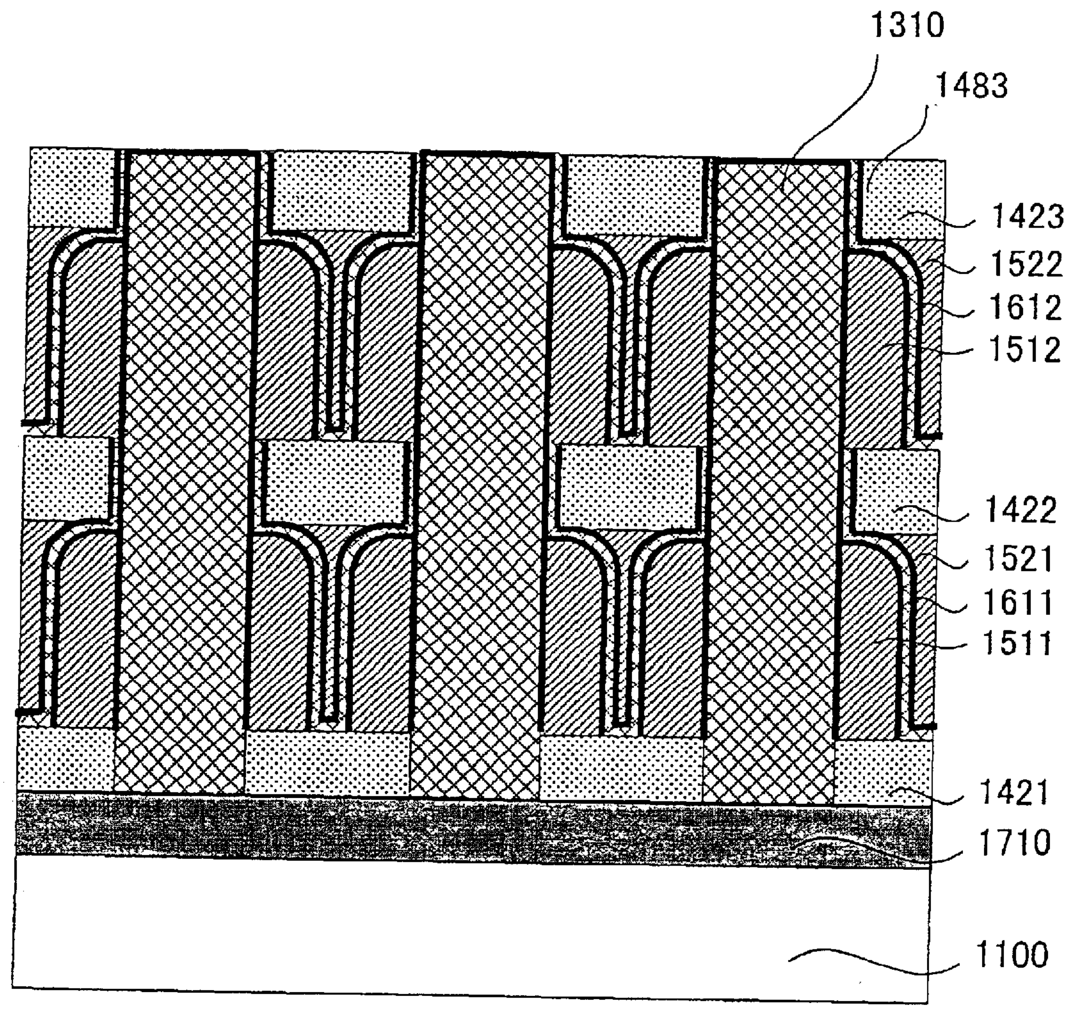

Fig. 1413
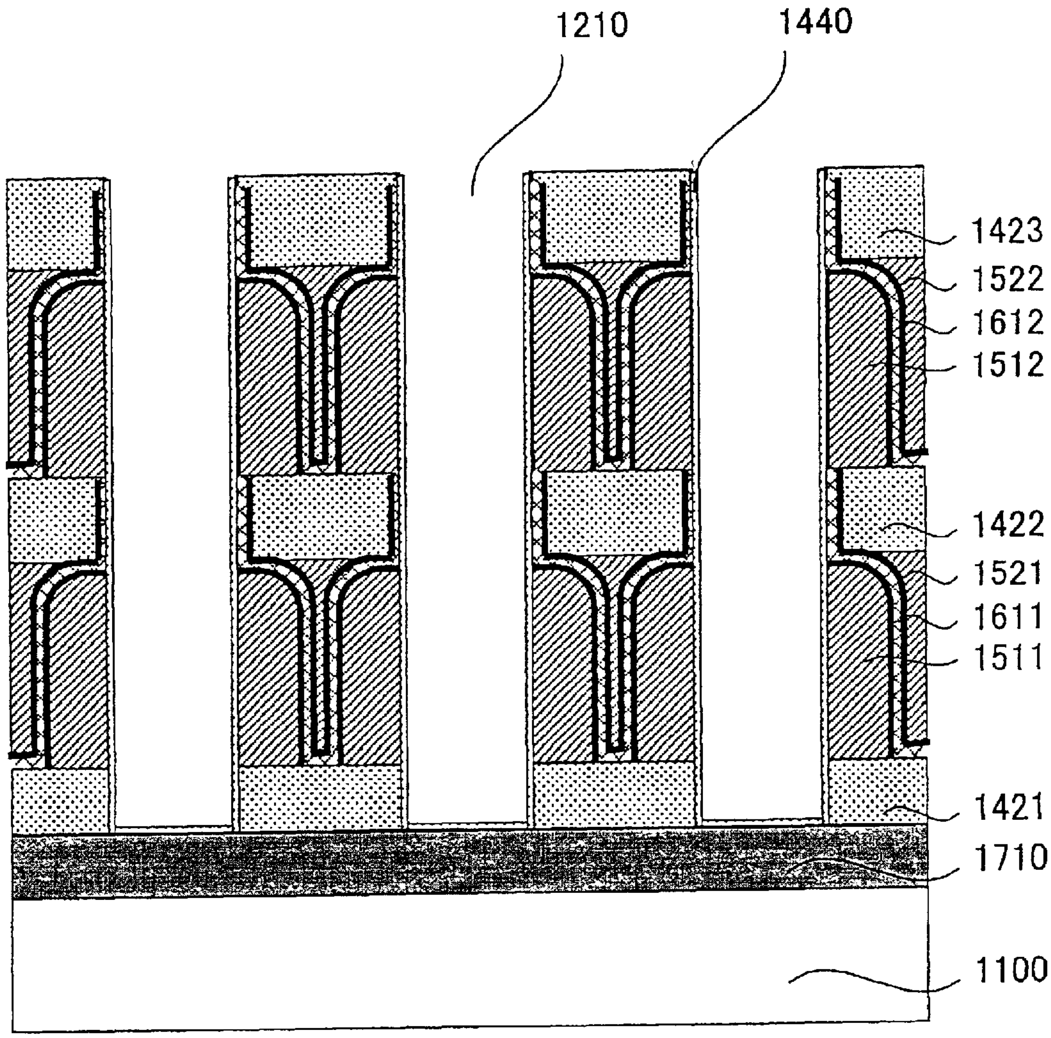

Fig. 1414
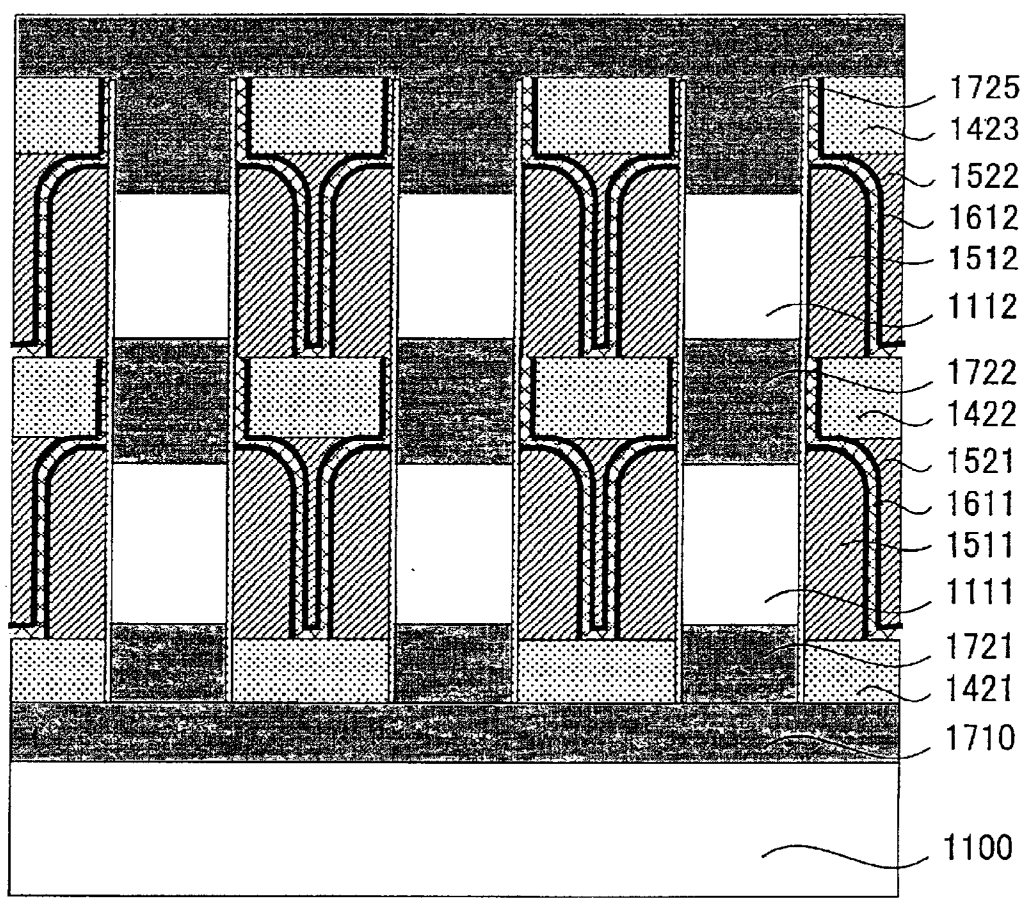

Fig. 1415
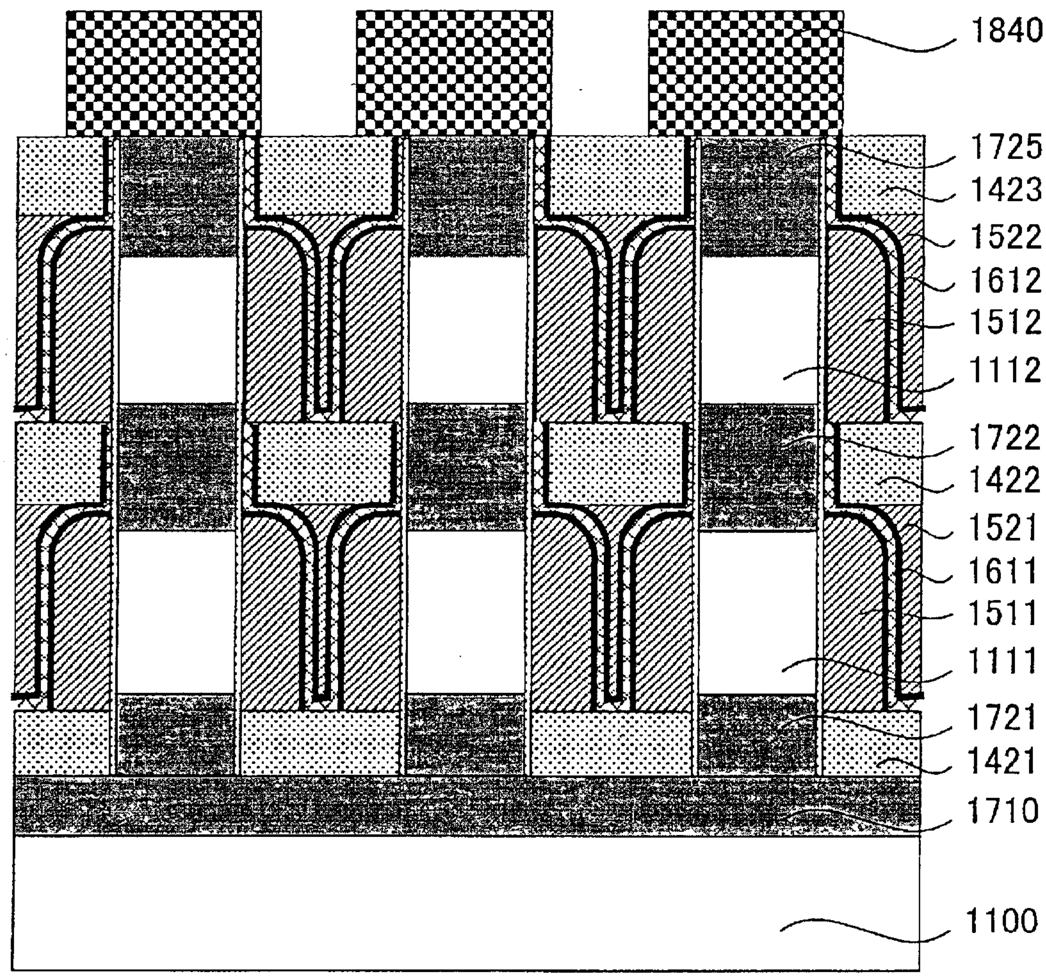

Fig. 1416
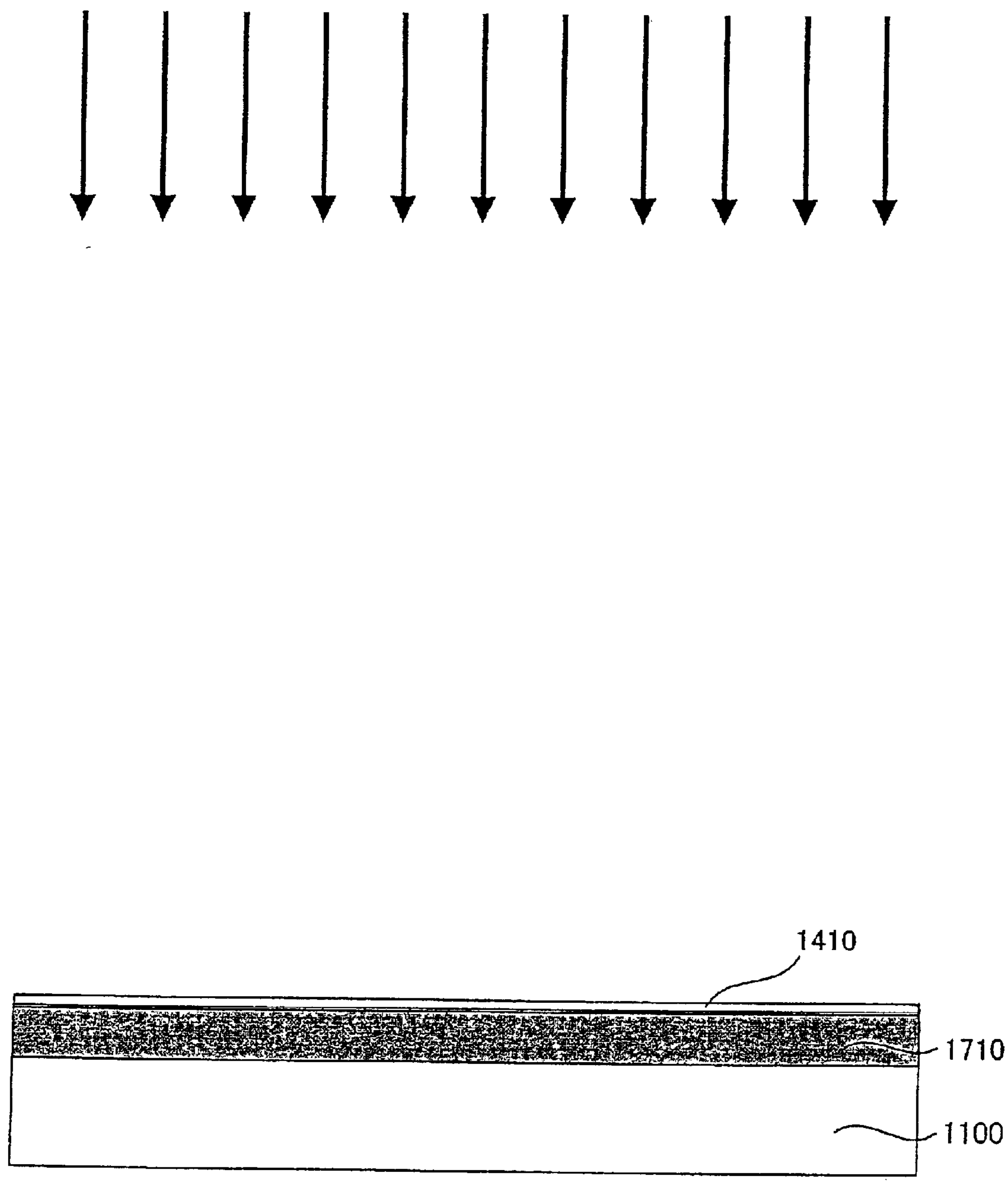

Fig. 1417
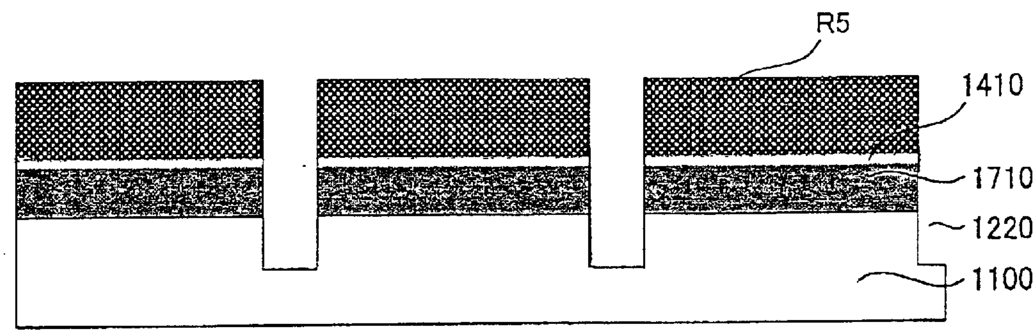
Fig. 1418
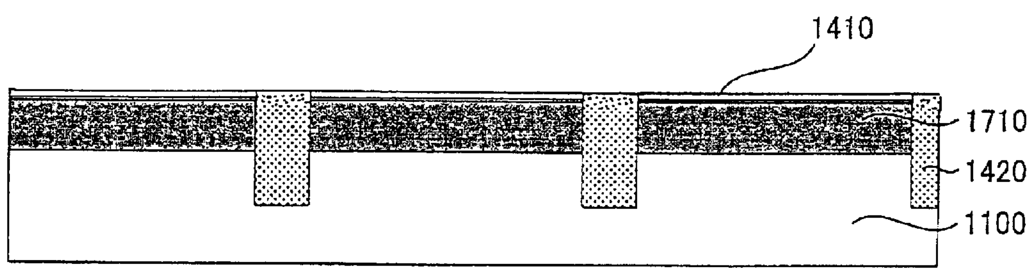

Fig. 1419
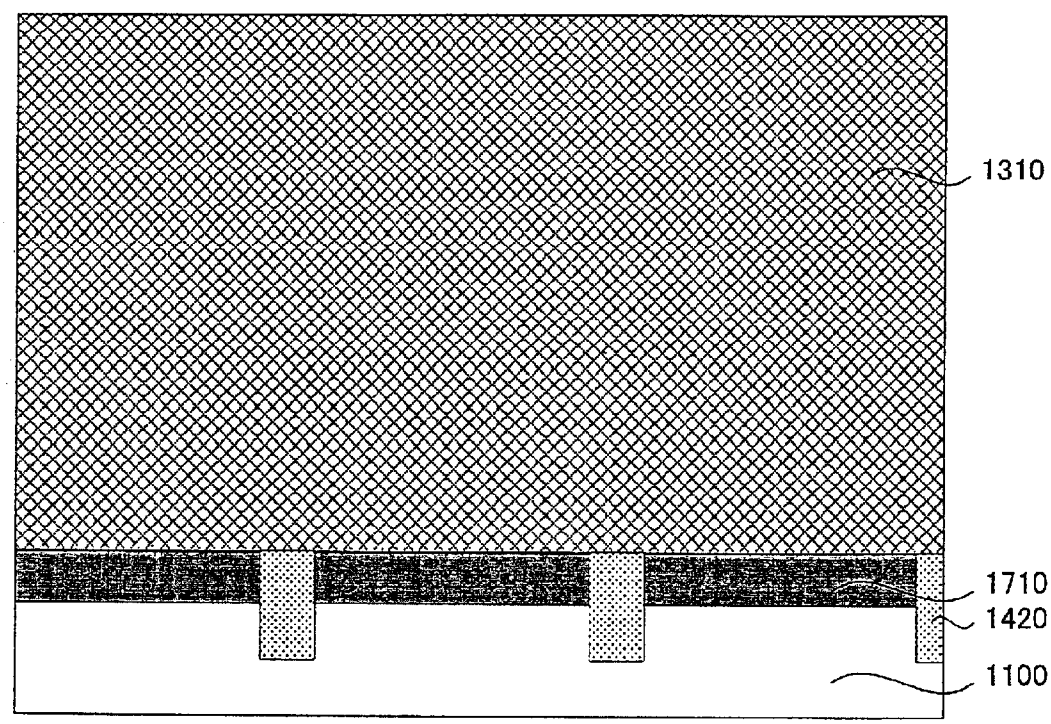

Fig. 1420
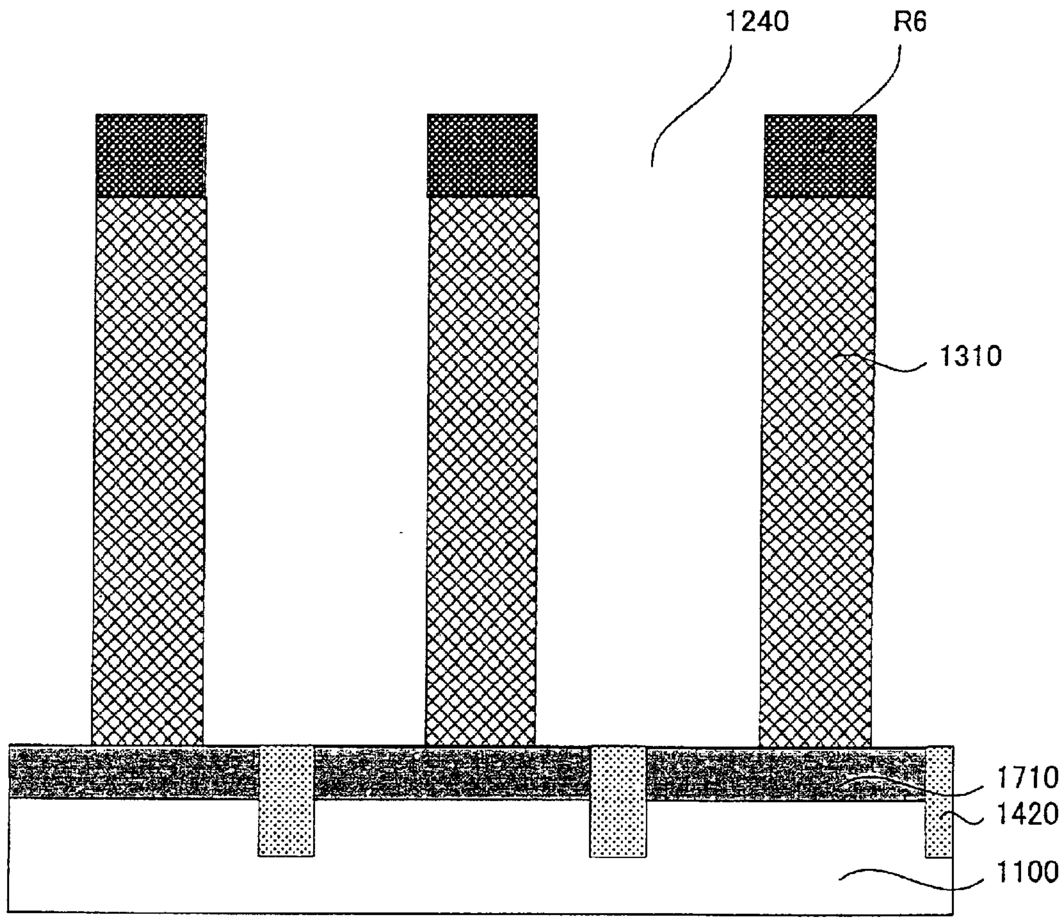

Fig. 1421
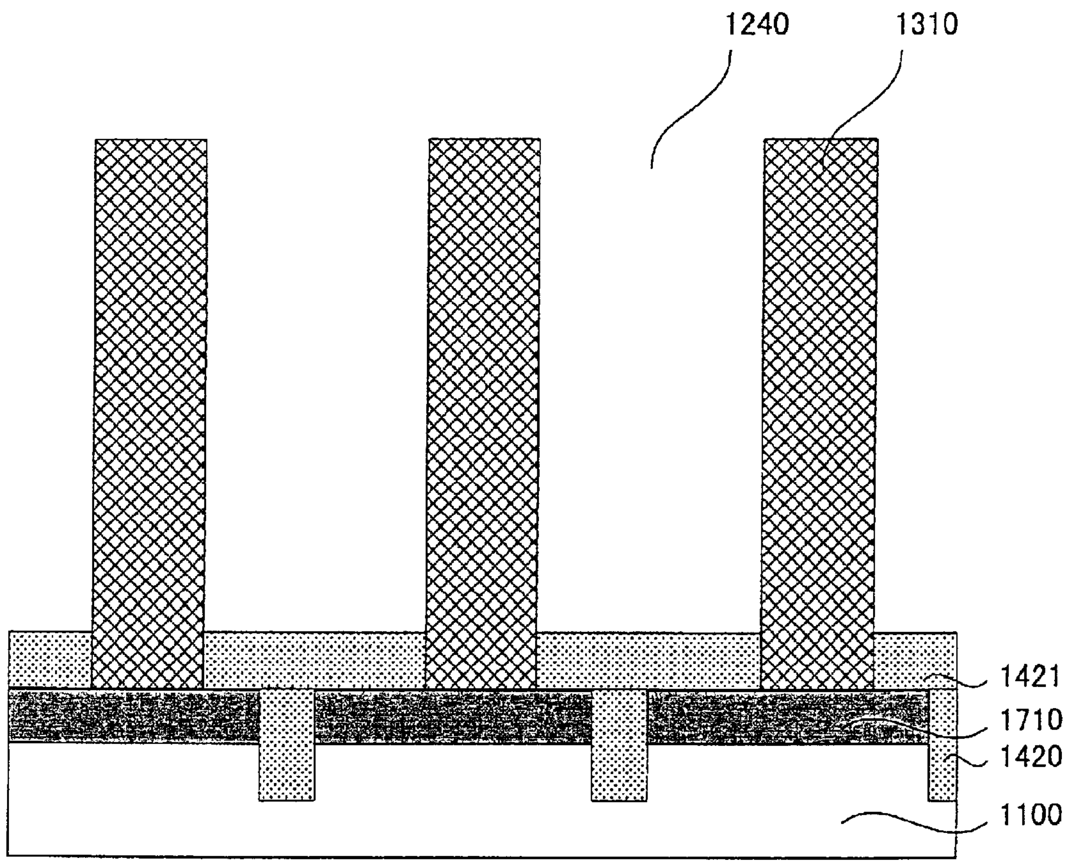

Fig. 1422
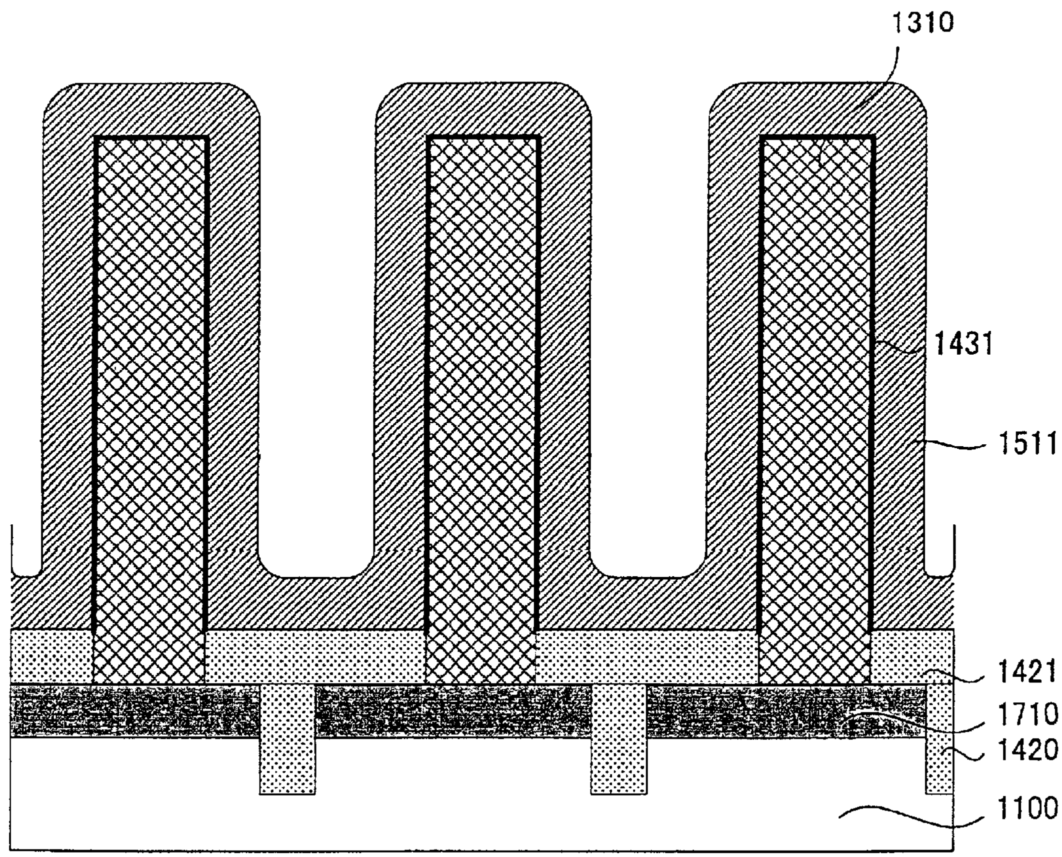

Fig. 1423
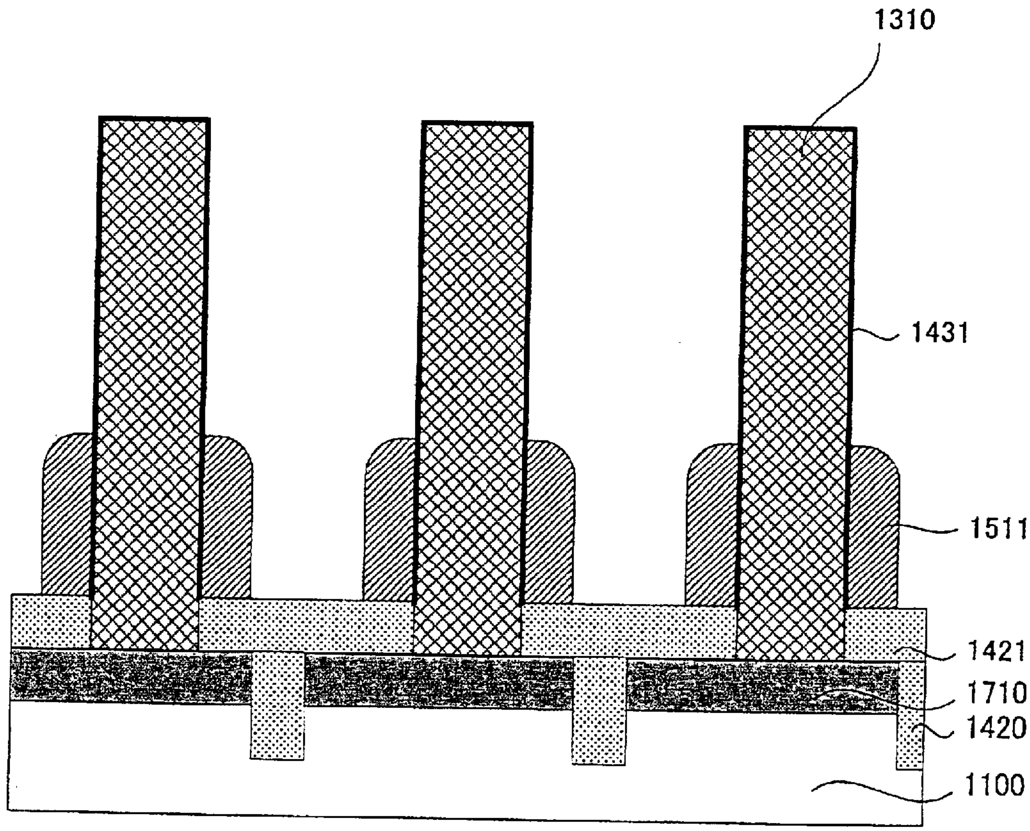

Fig. 1424
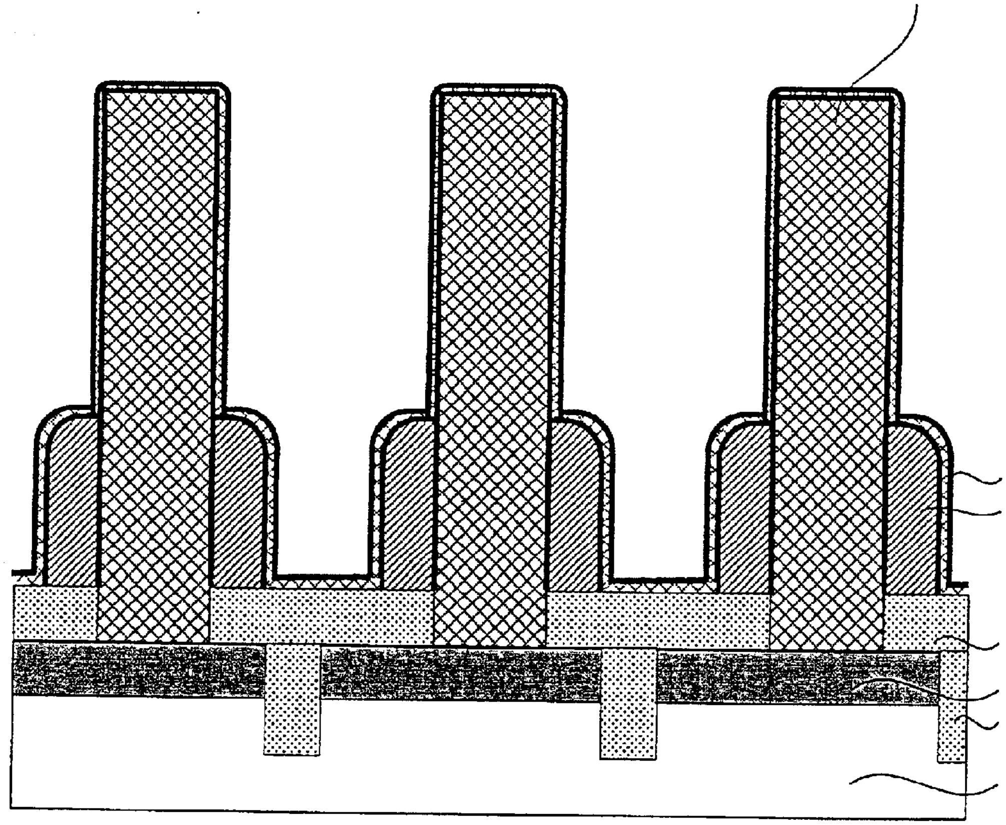

Fig. 1425
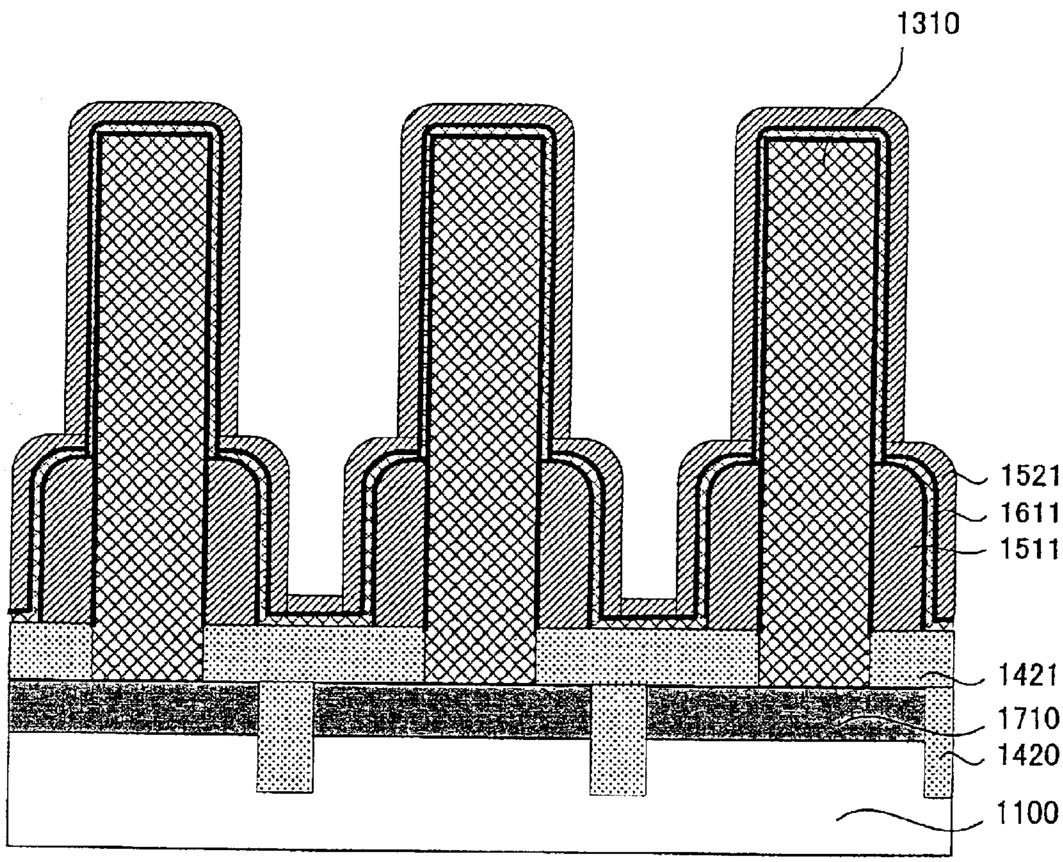

Fig. 1426
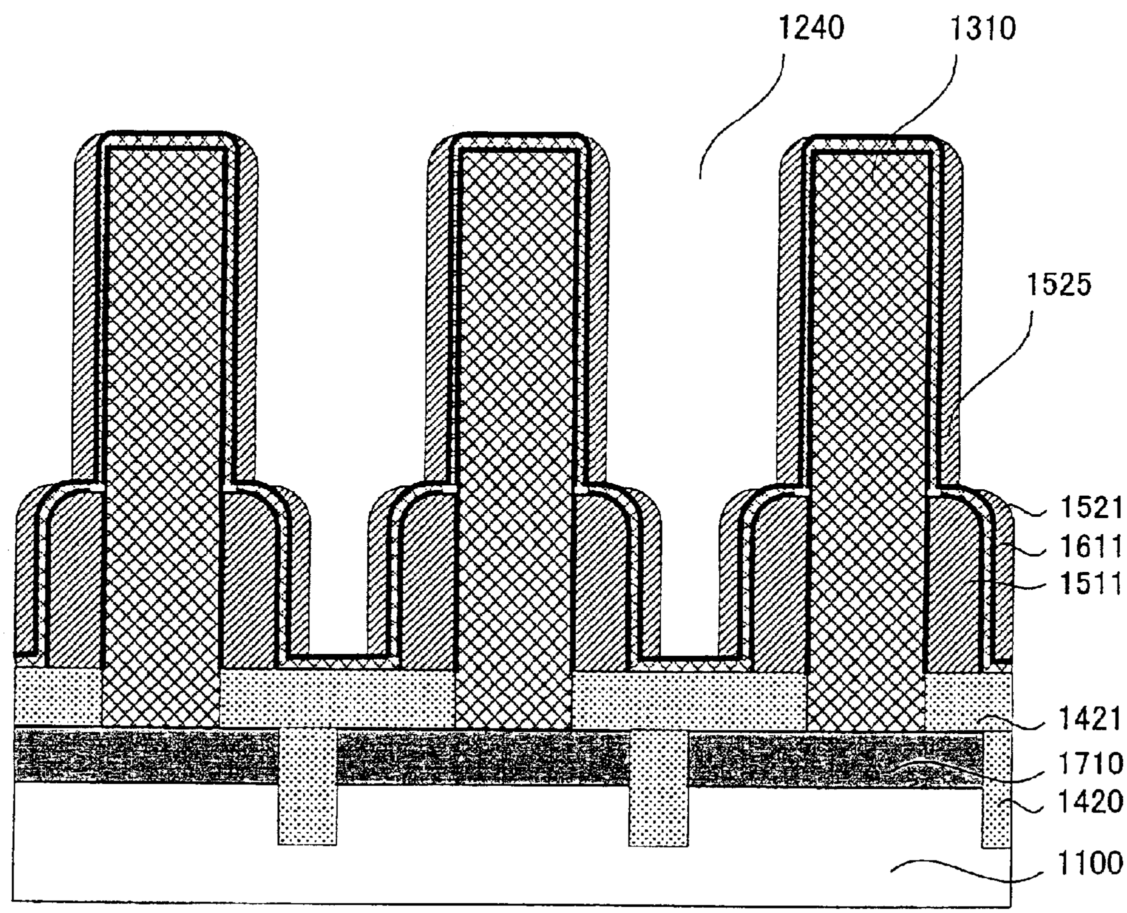

Fig. 1427
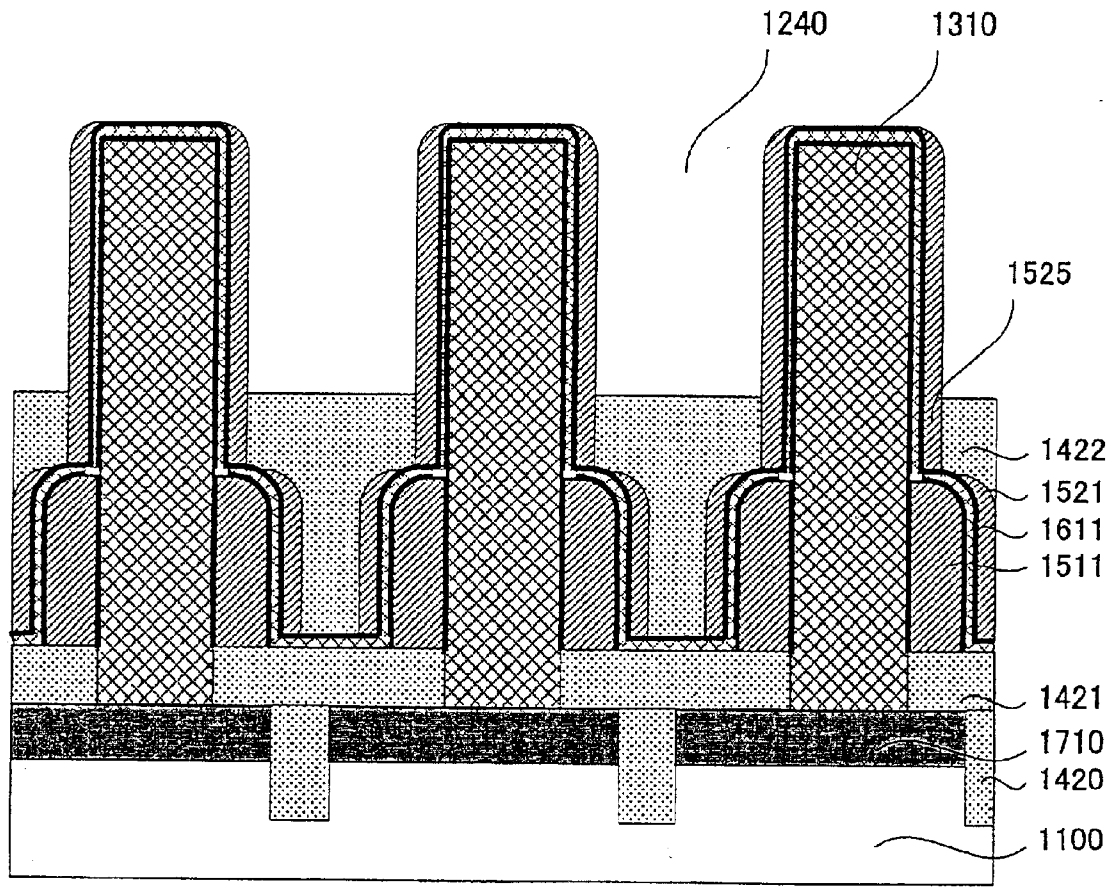

Fig. 1428
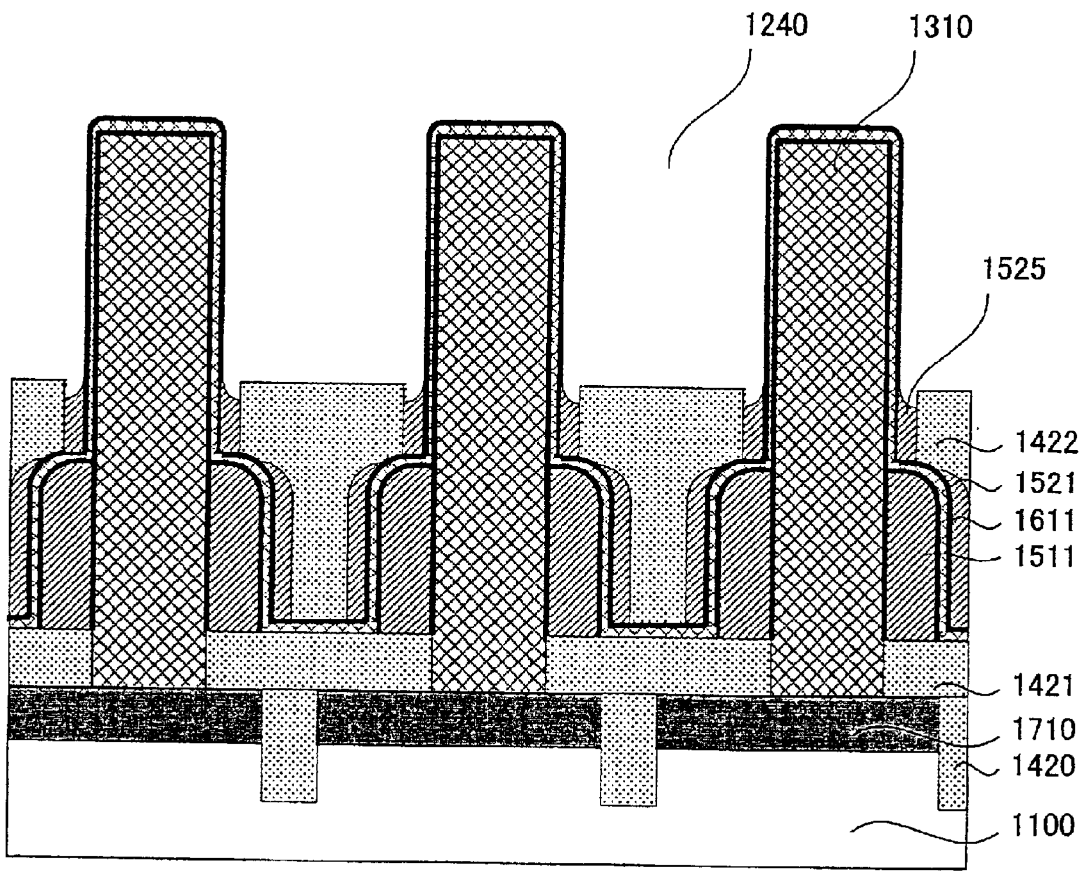

Fig. 1429
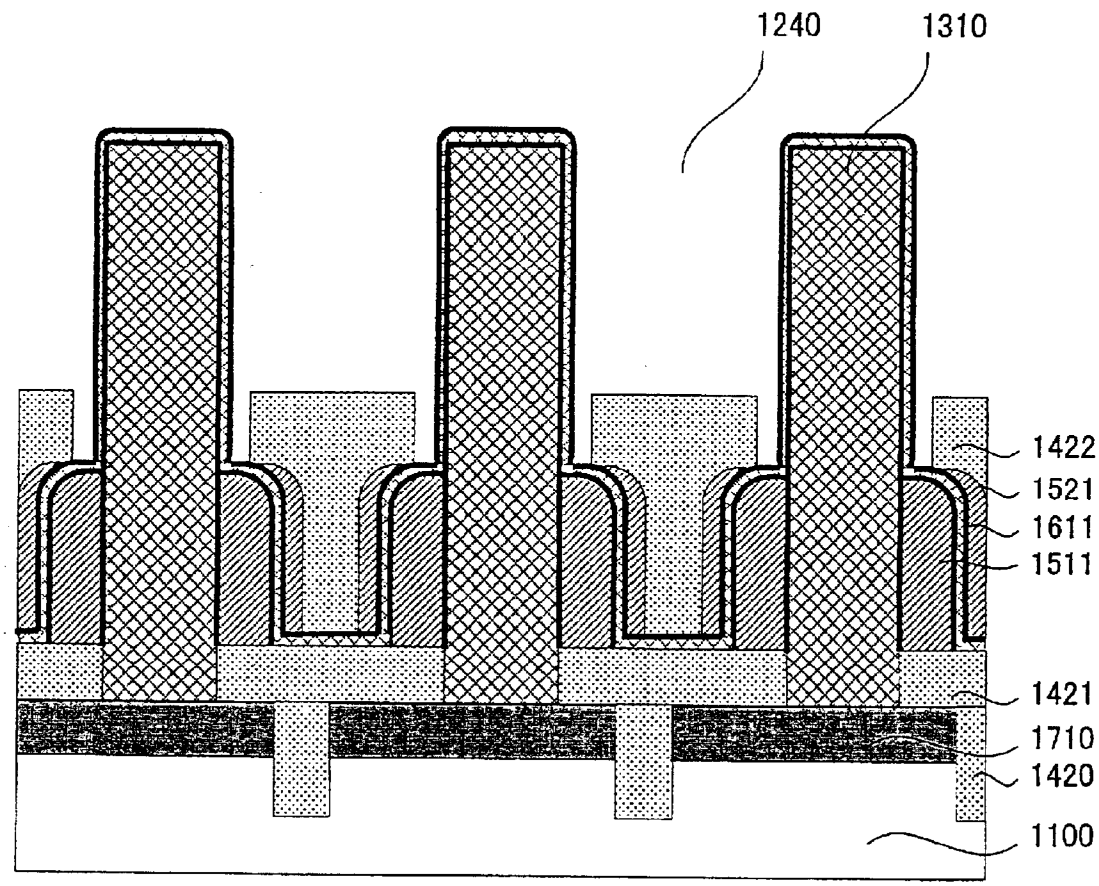

Fig. 1430
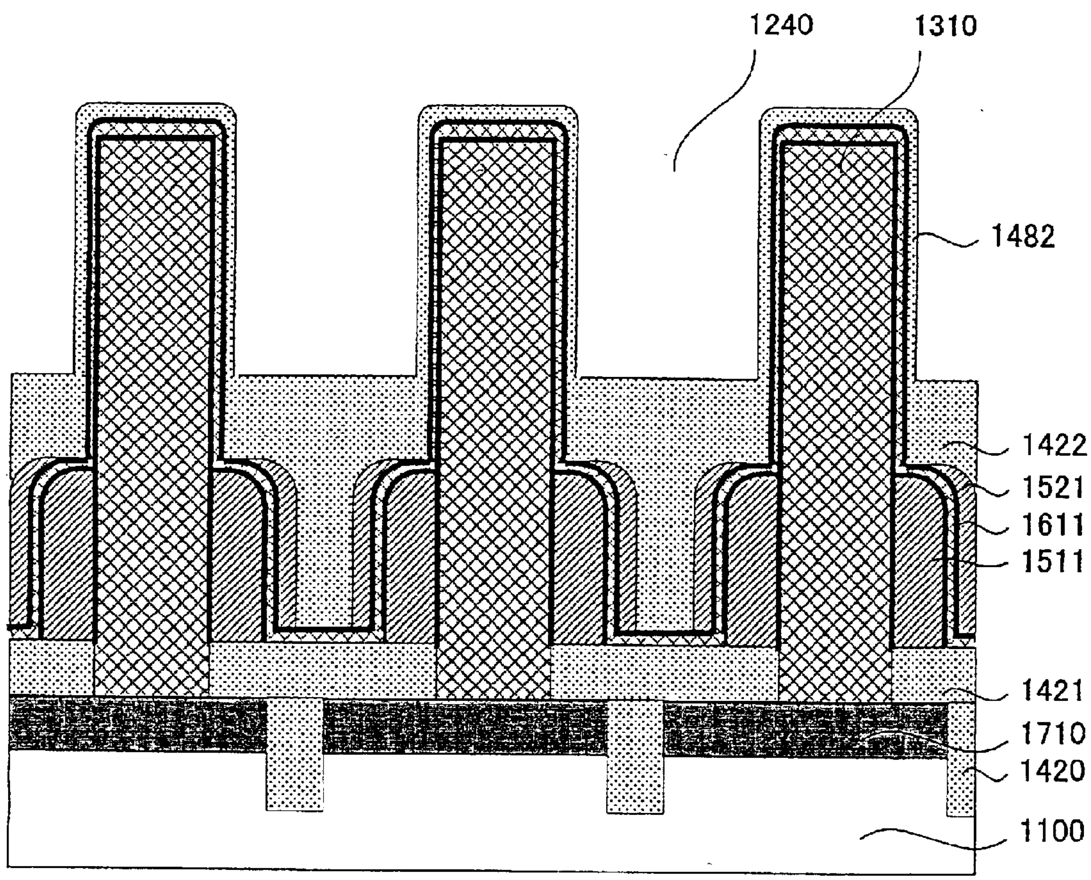

Fig. 1431
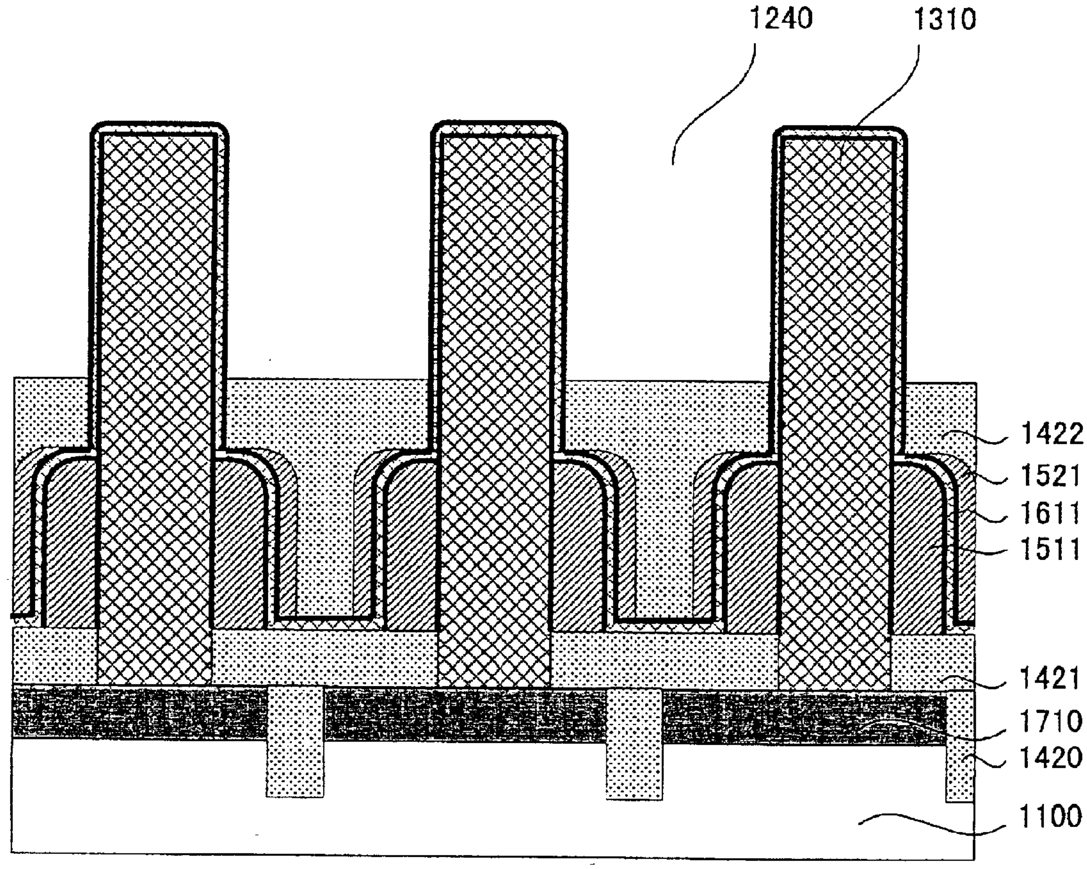

Fig. 1432
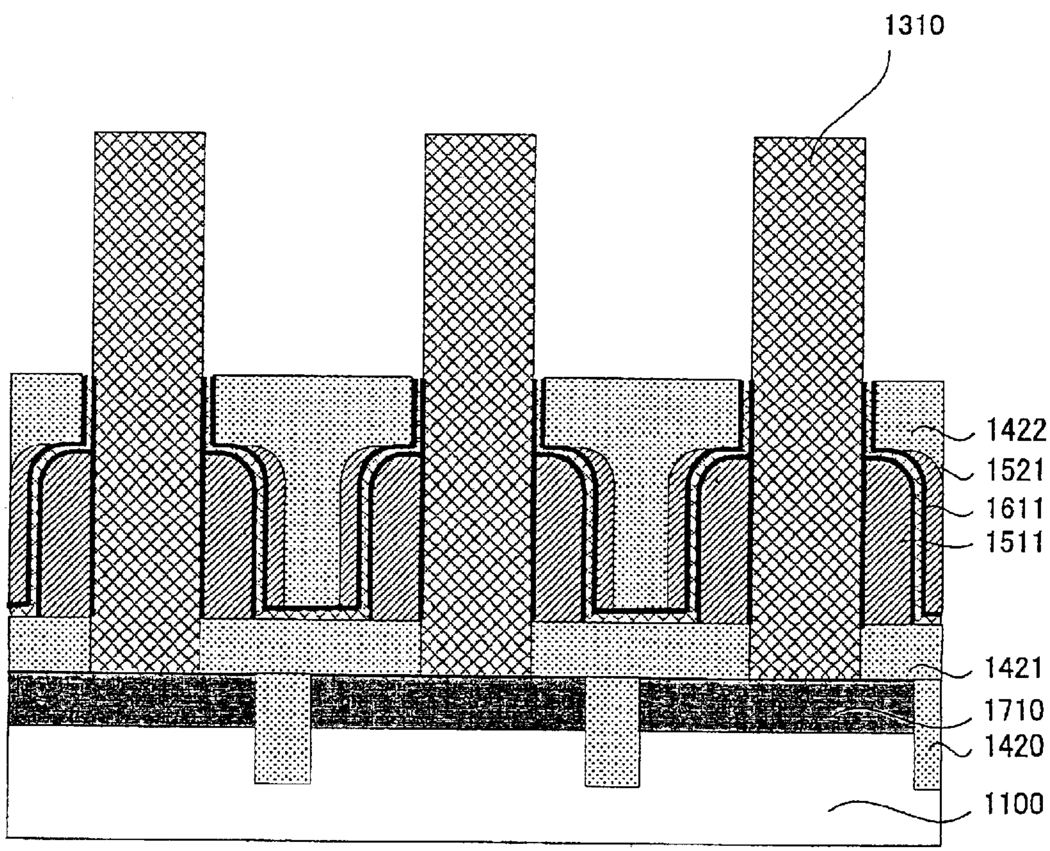

Fig. 1433
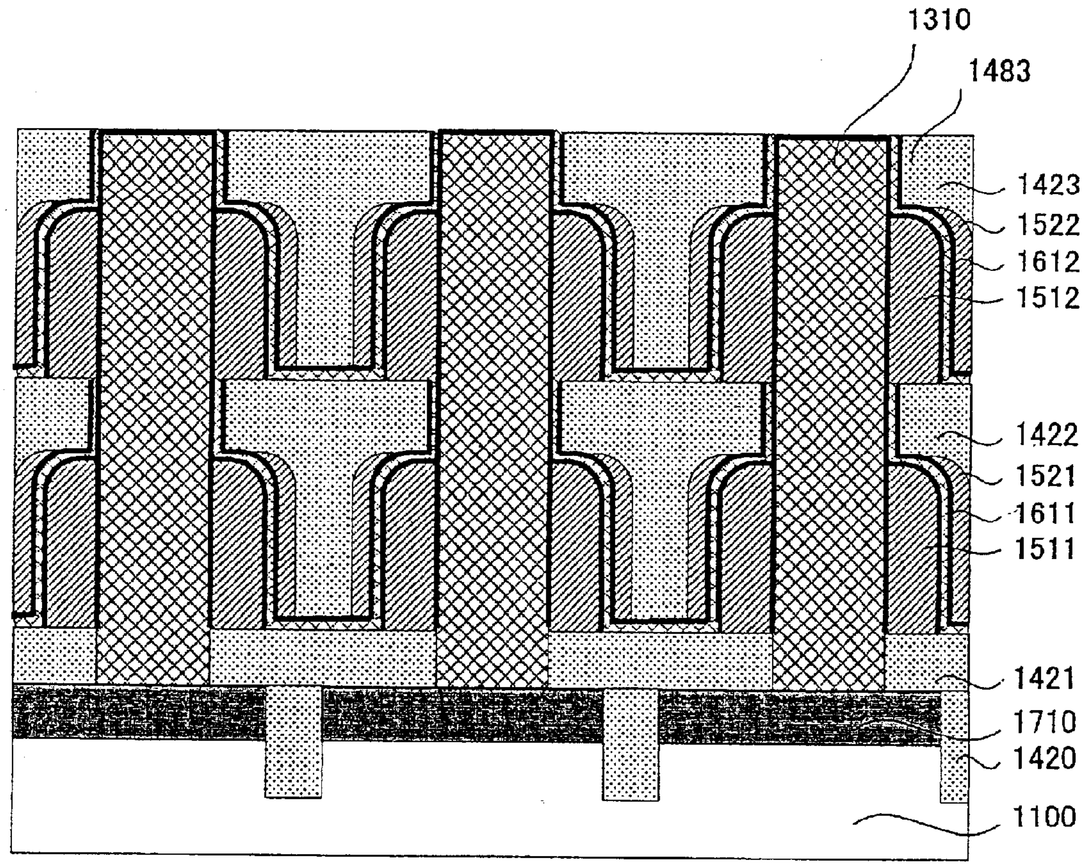

Fig. 1434
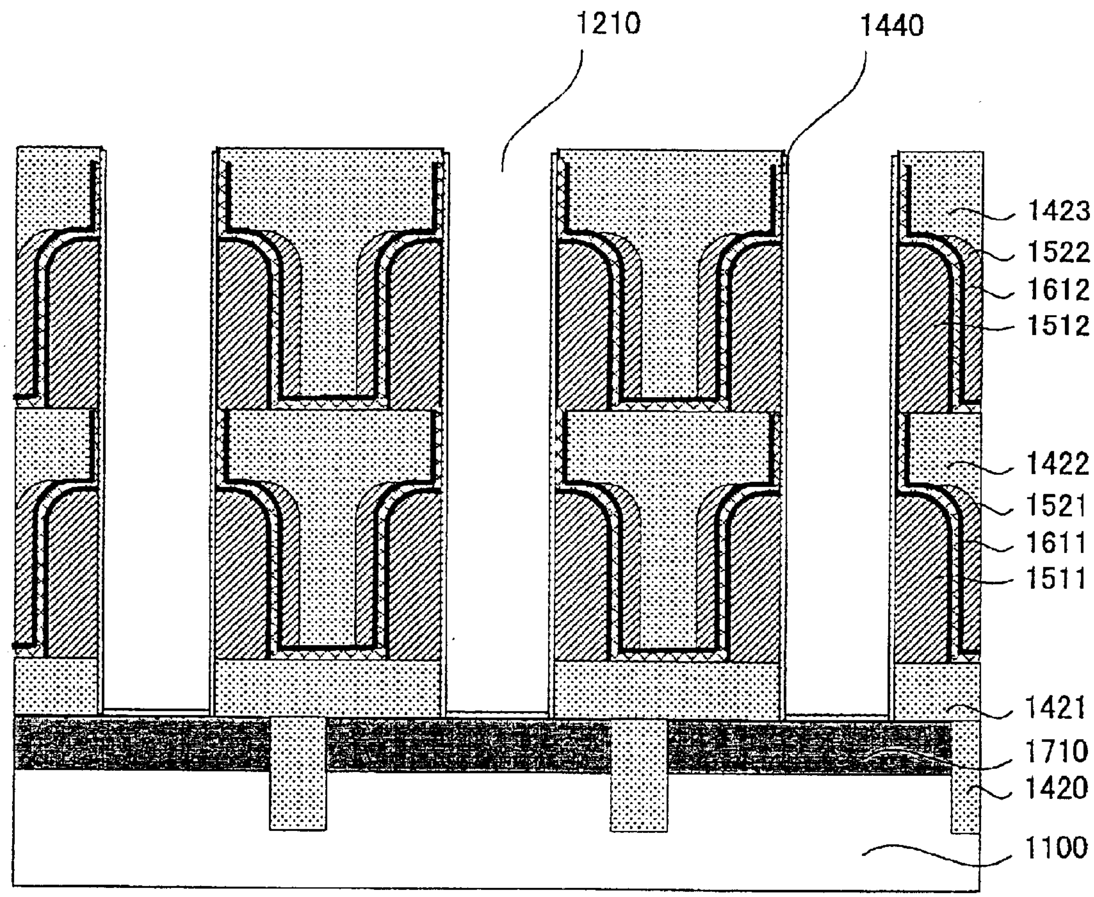

Fig. 1435
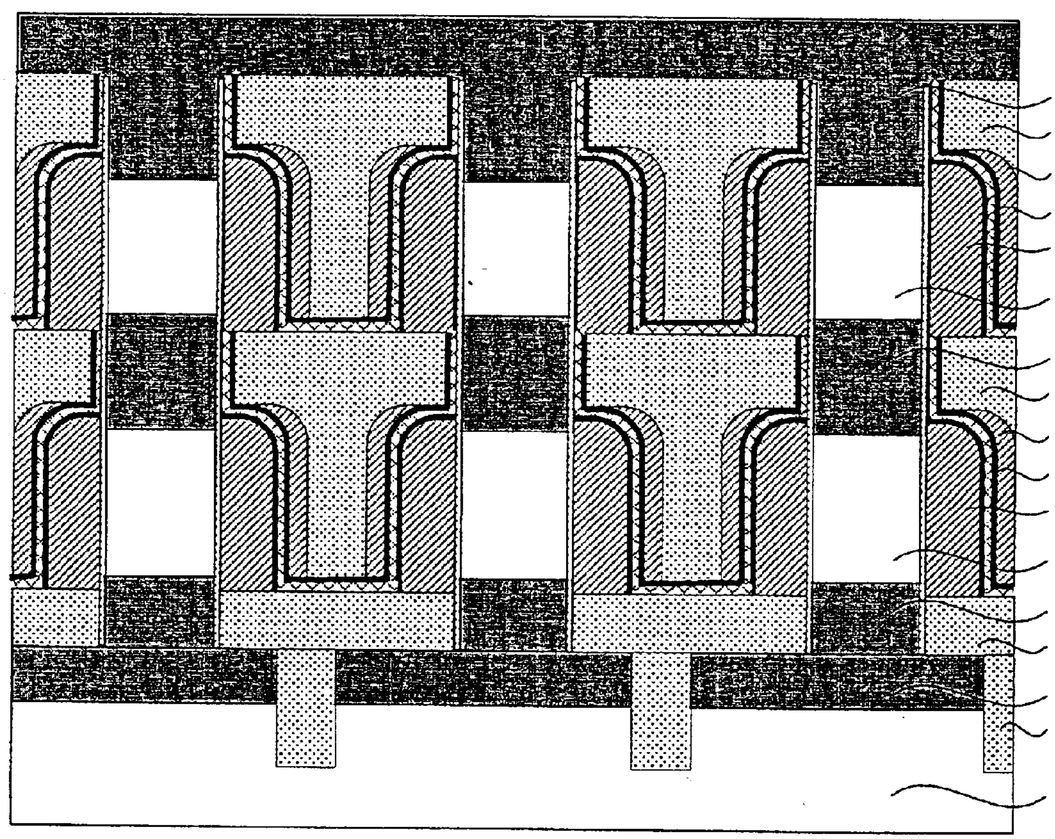

Fig. 1436
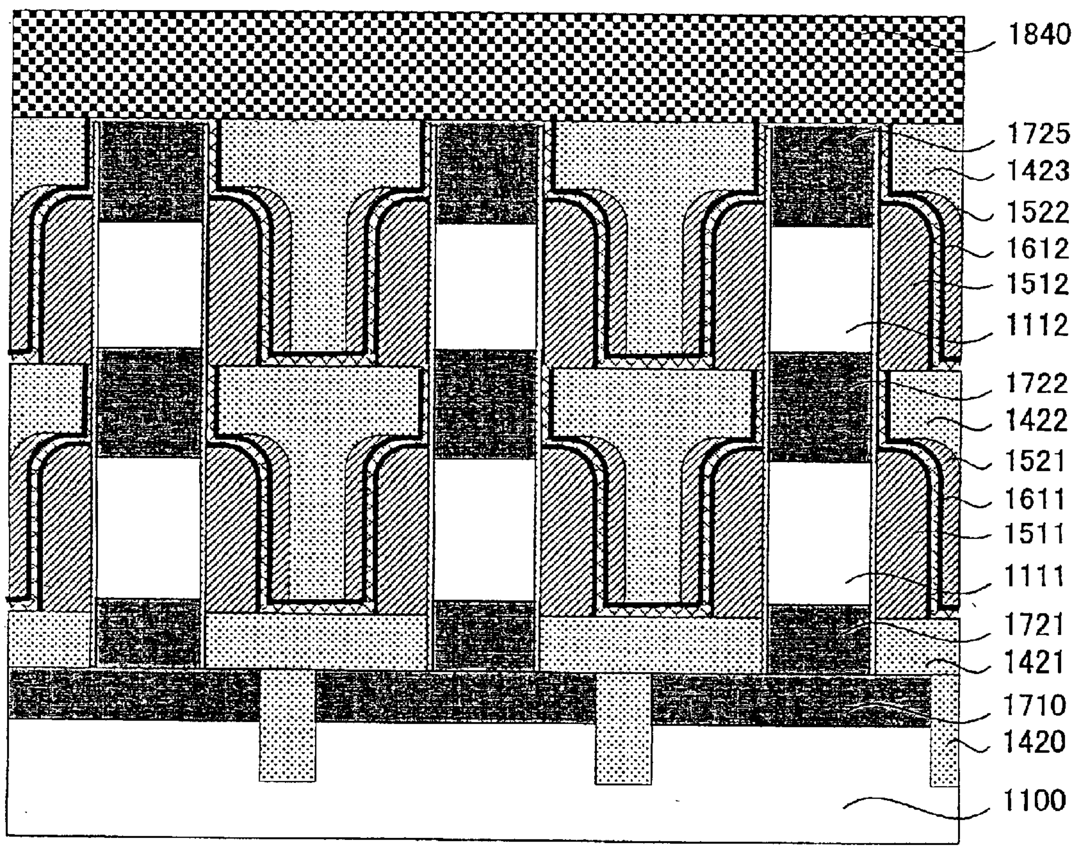

Fig. 1437
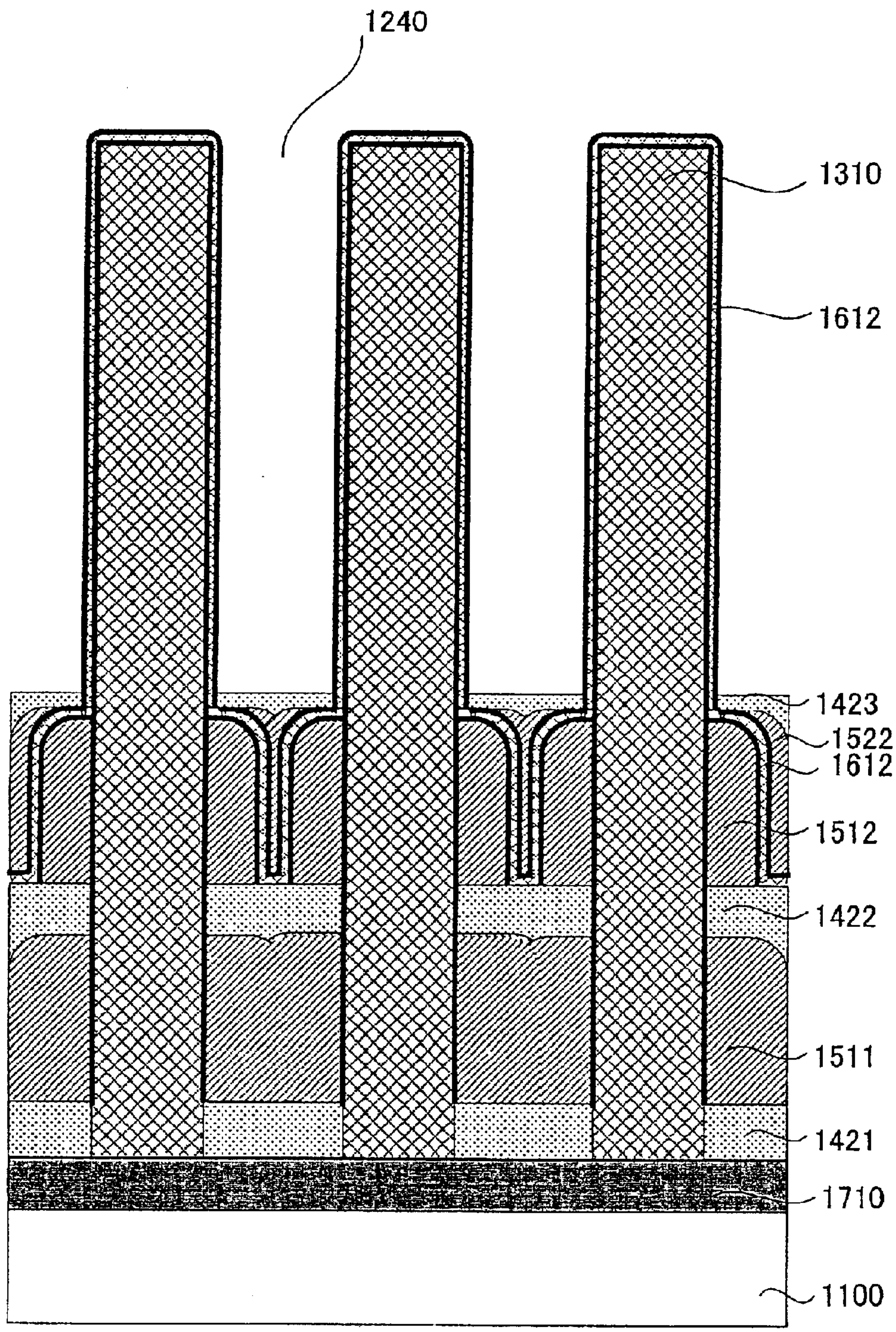

Fig. 1438
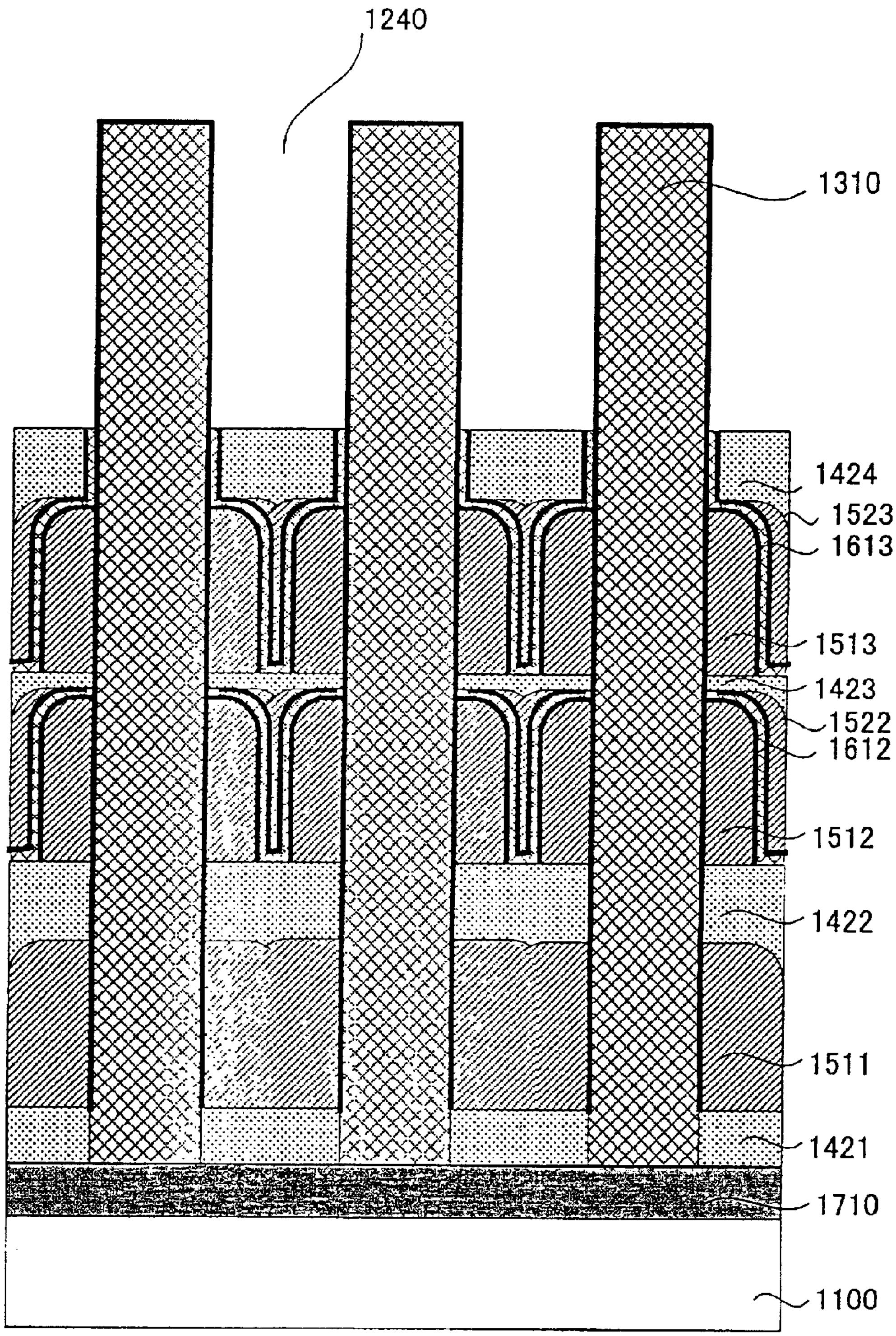

Fig. 1439
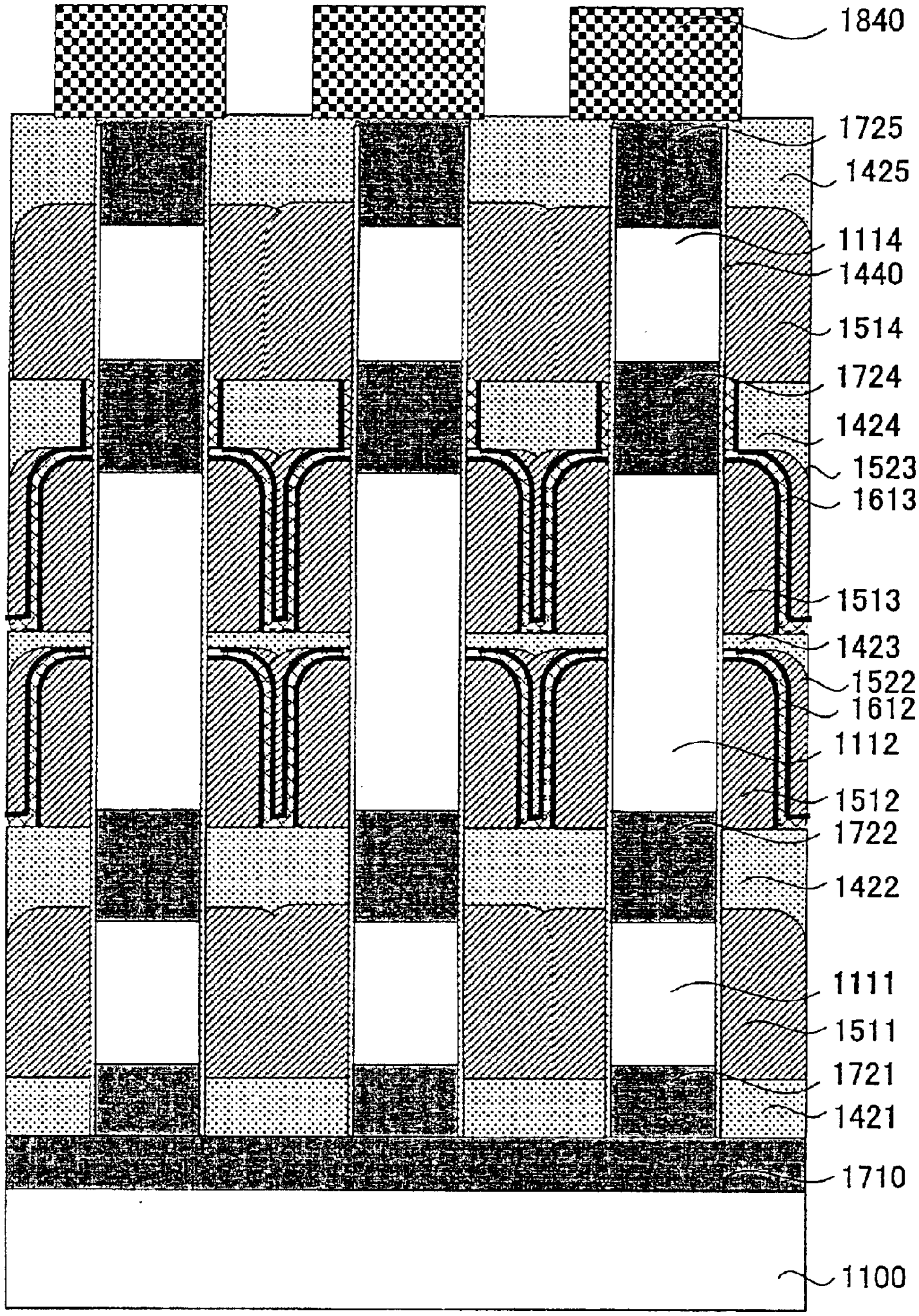

Fig. 1440
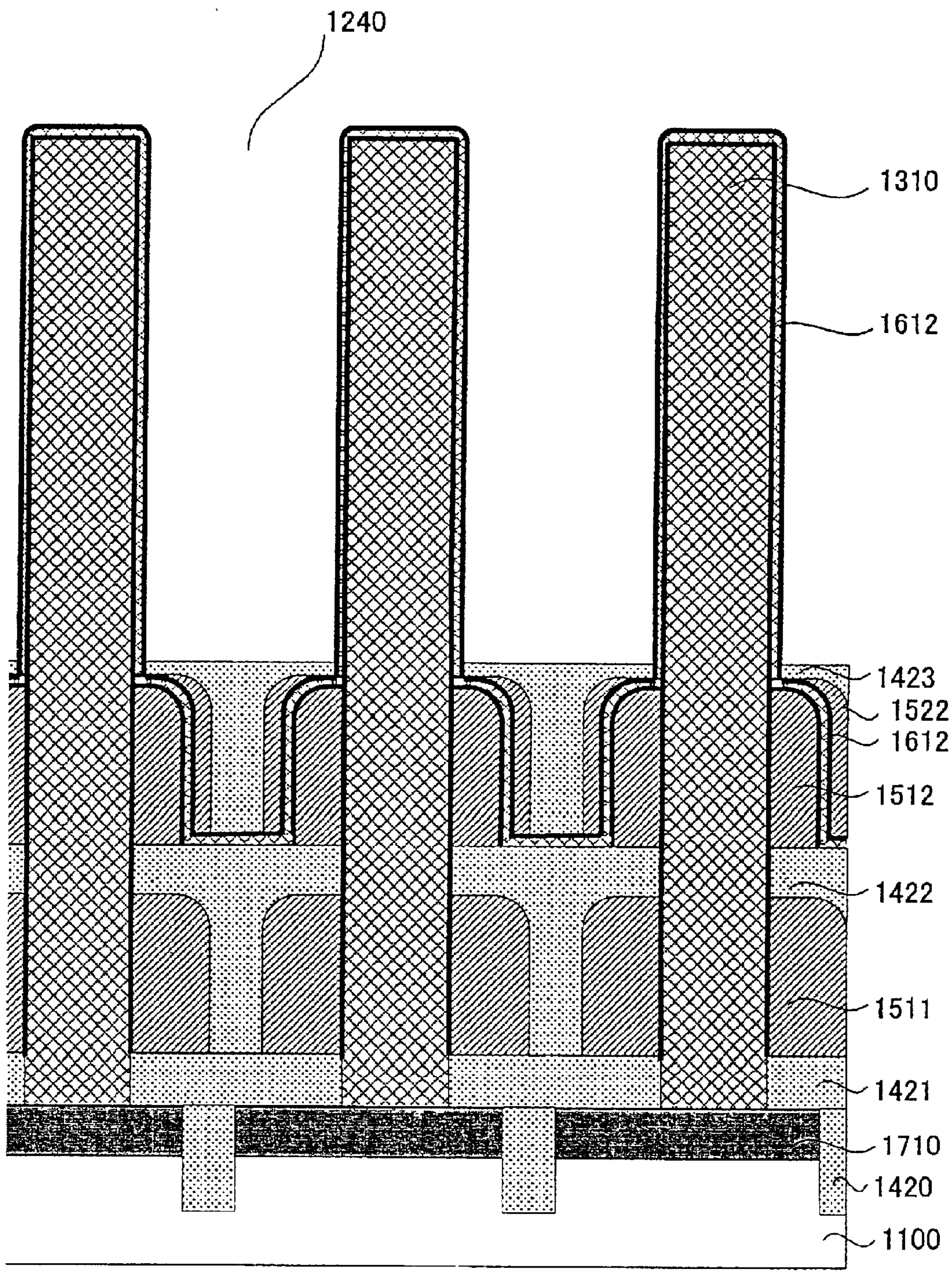

Fig. 1441
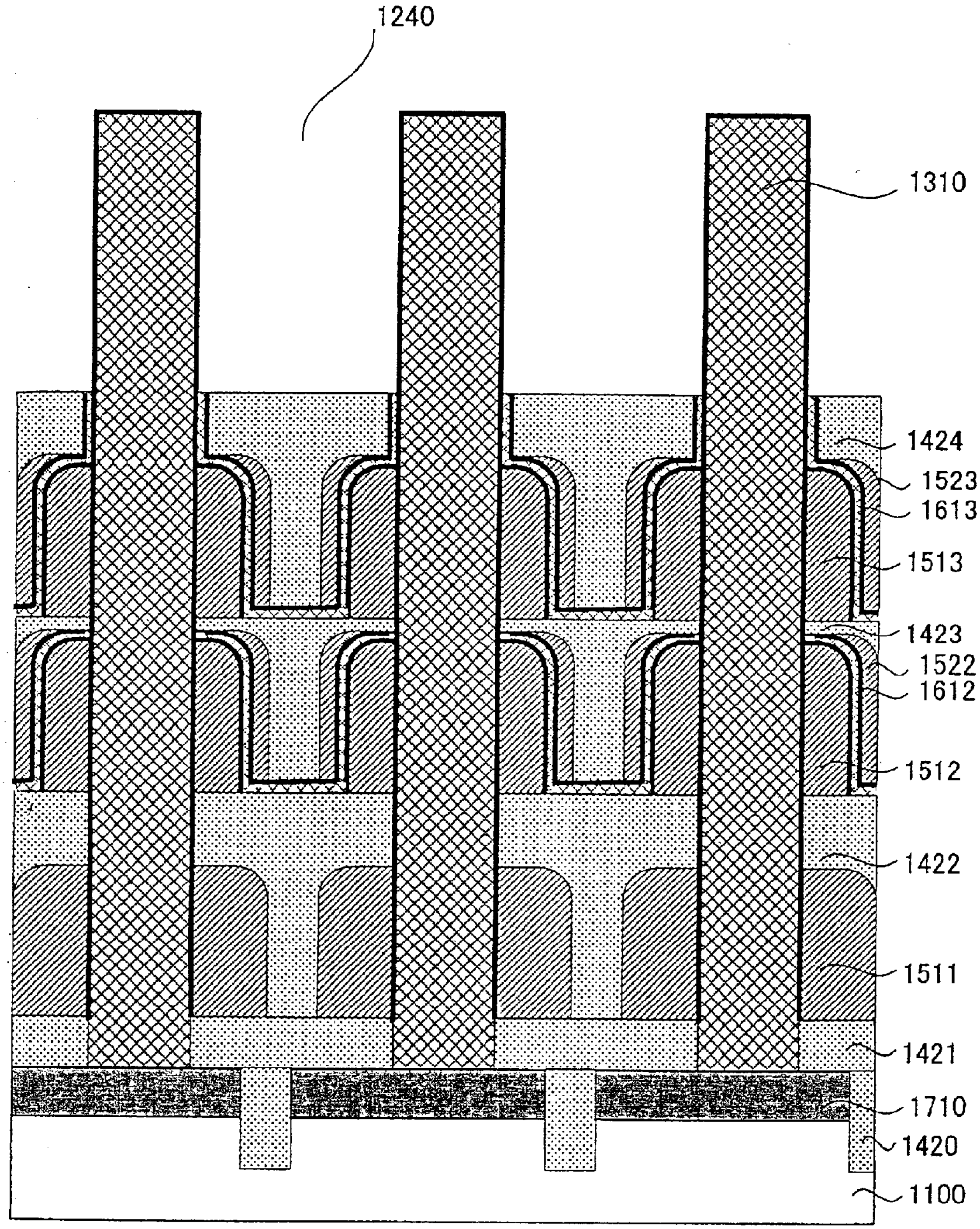

Fig. 1442
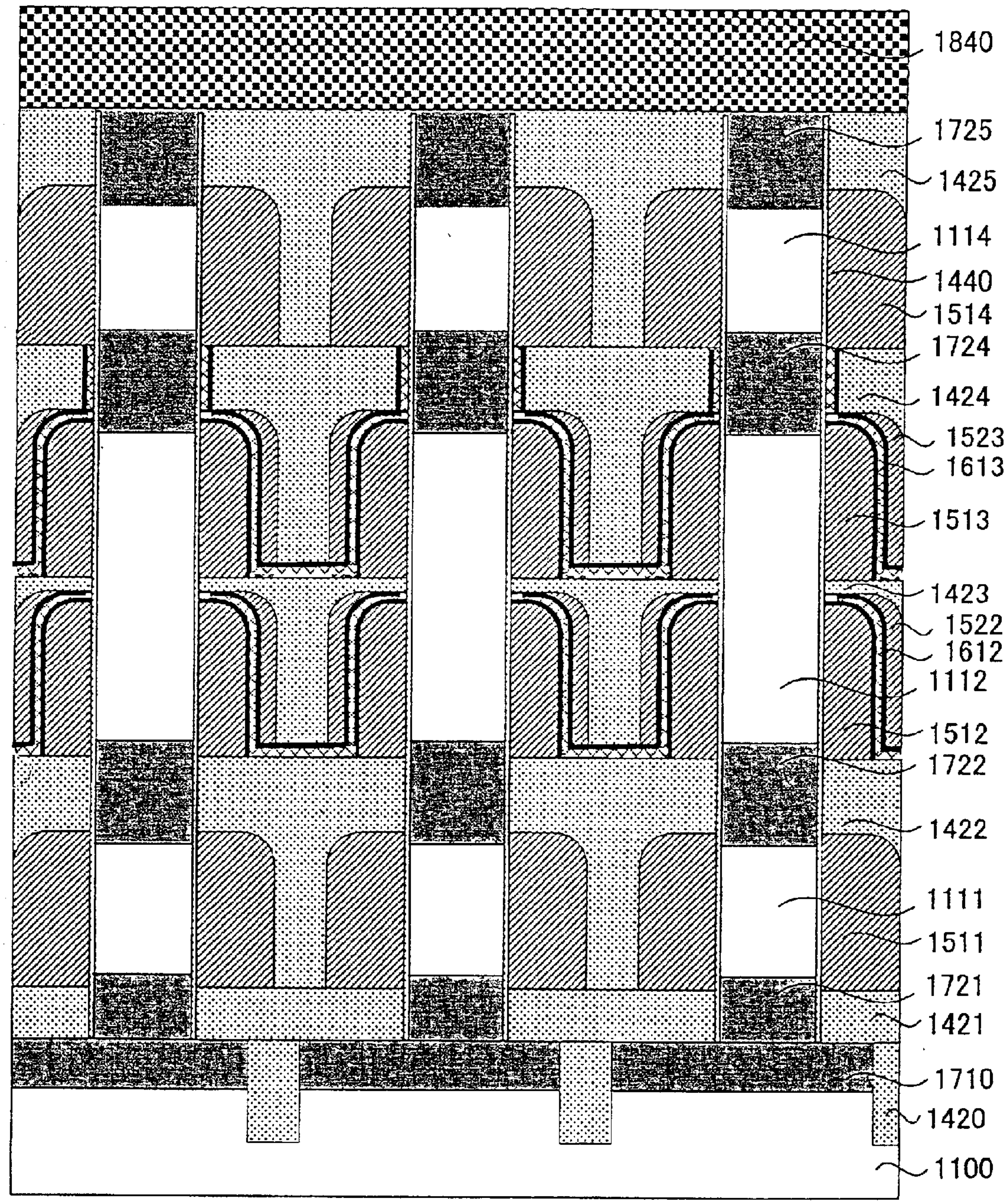

Fig. 1443
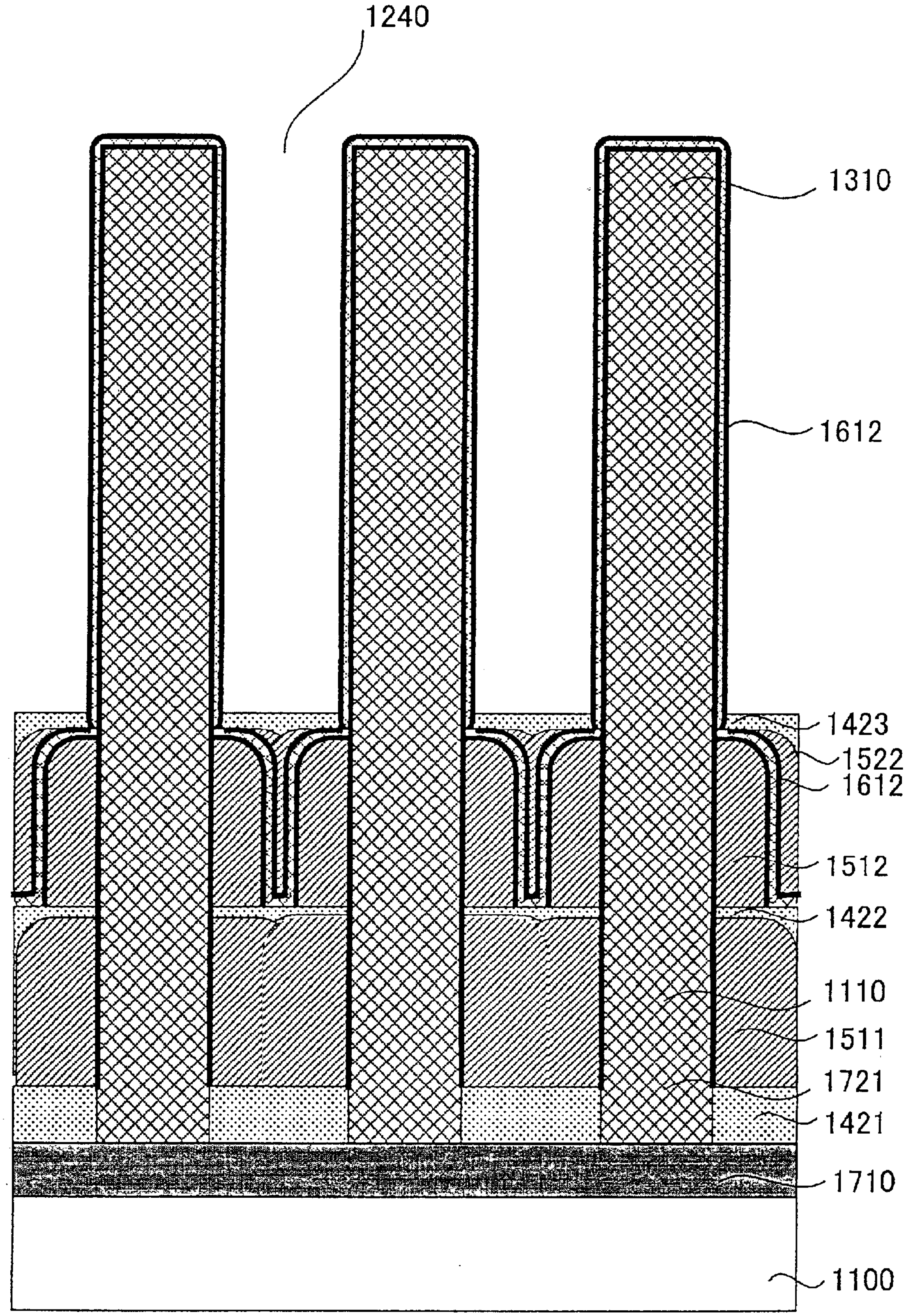

Fig. 1444
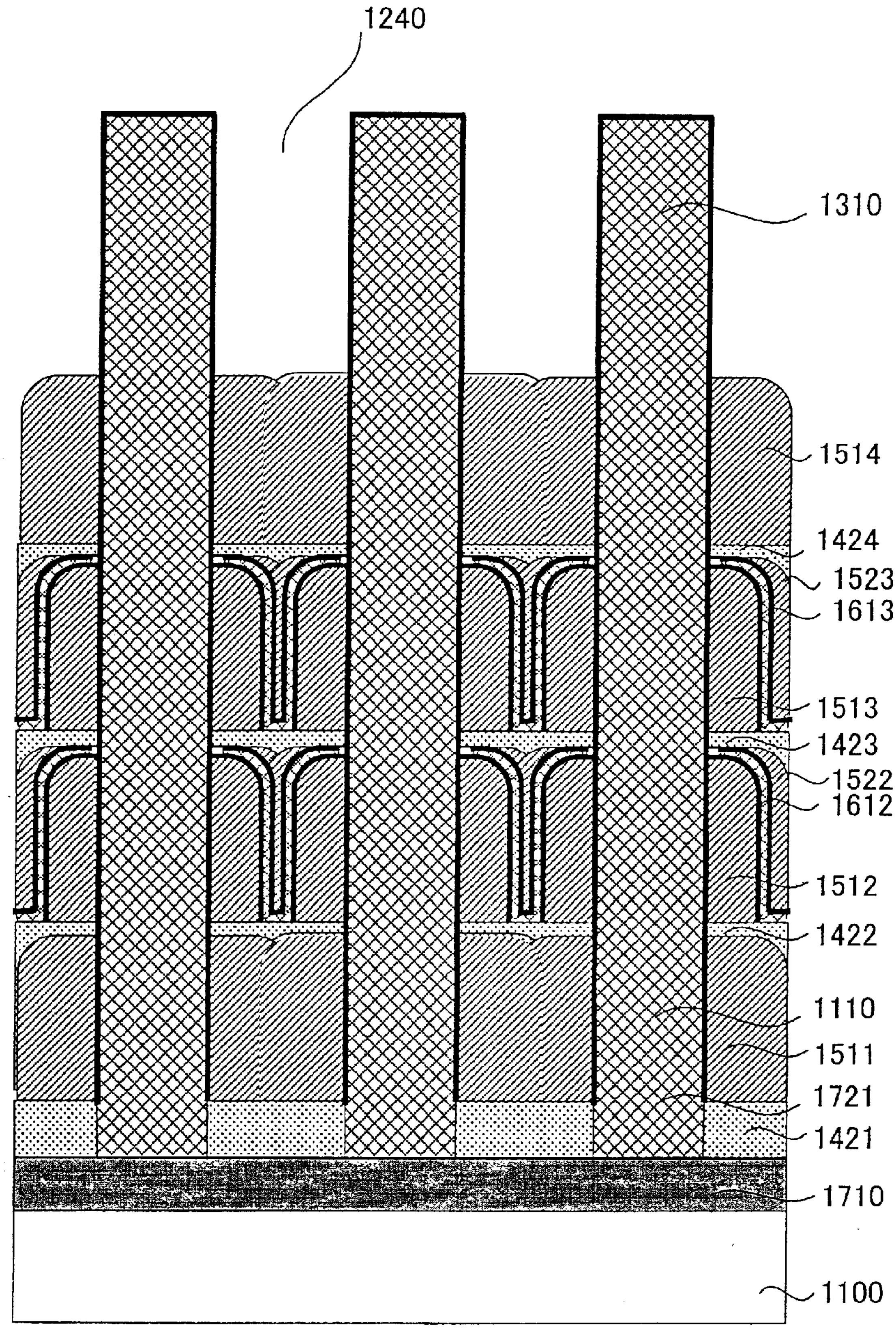

Fig. 1445
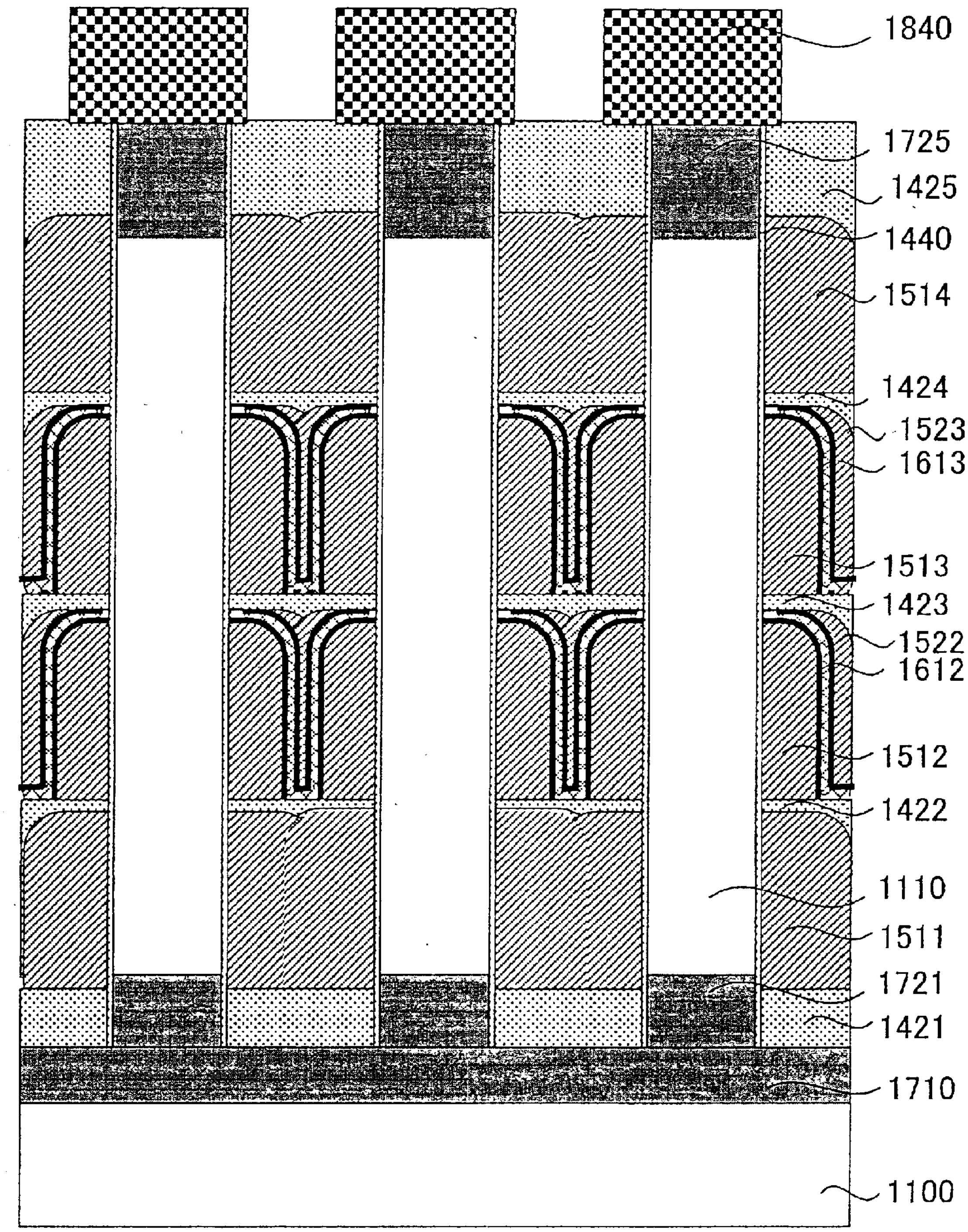

Fig. 1446
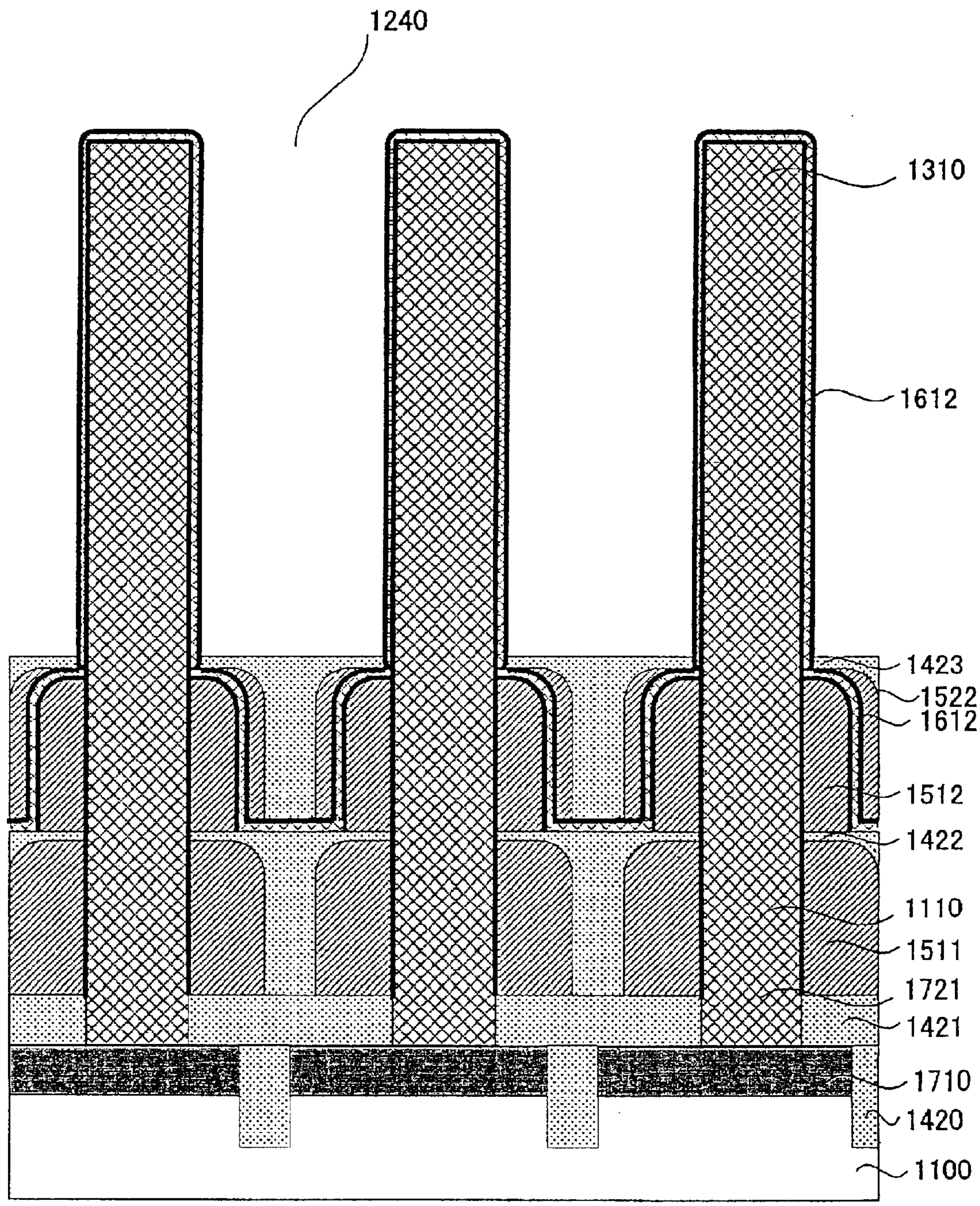

Fig. 1447
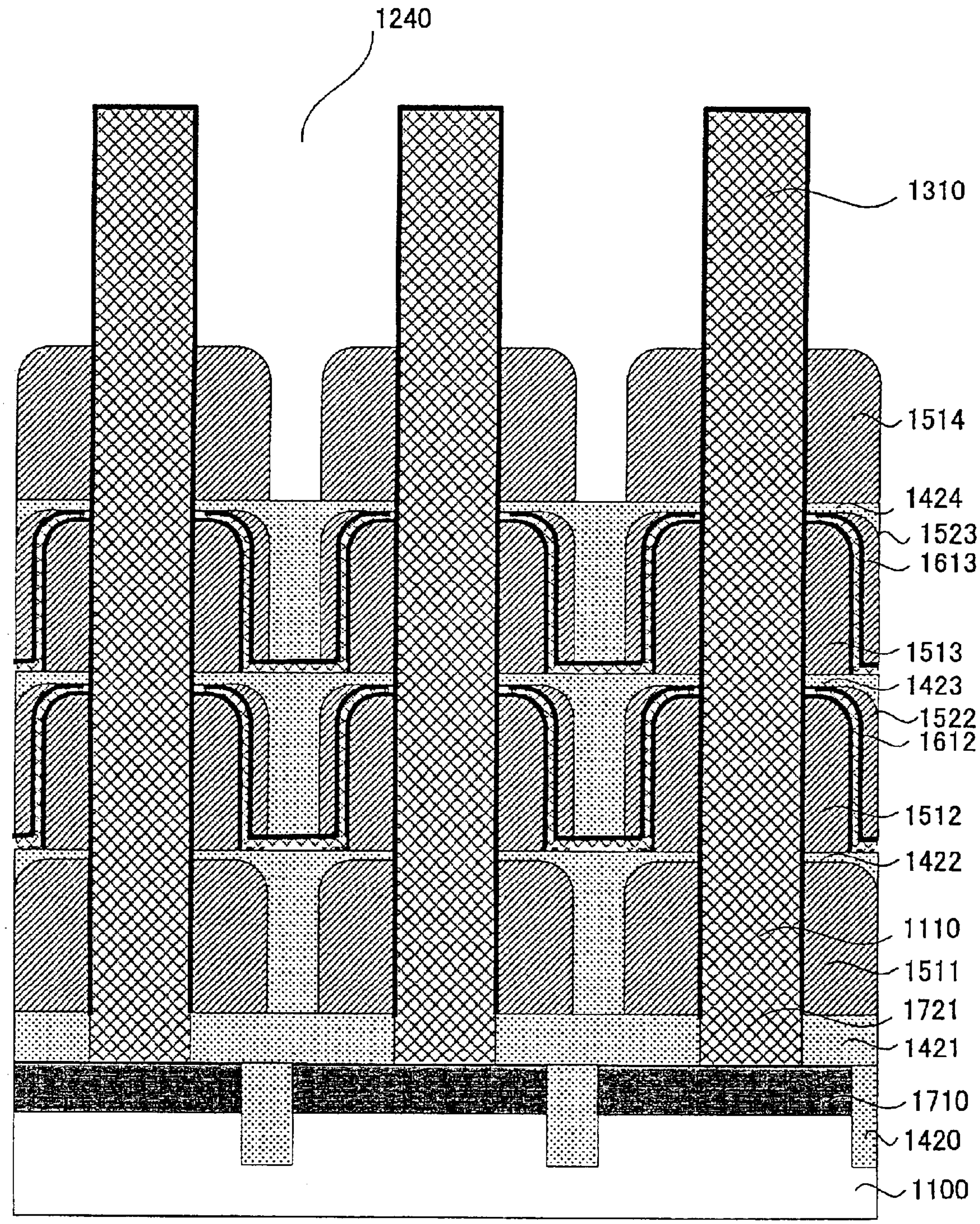

Fig. 1448
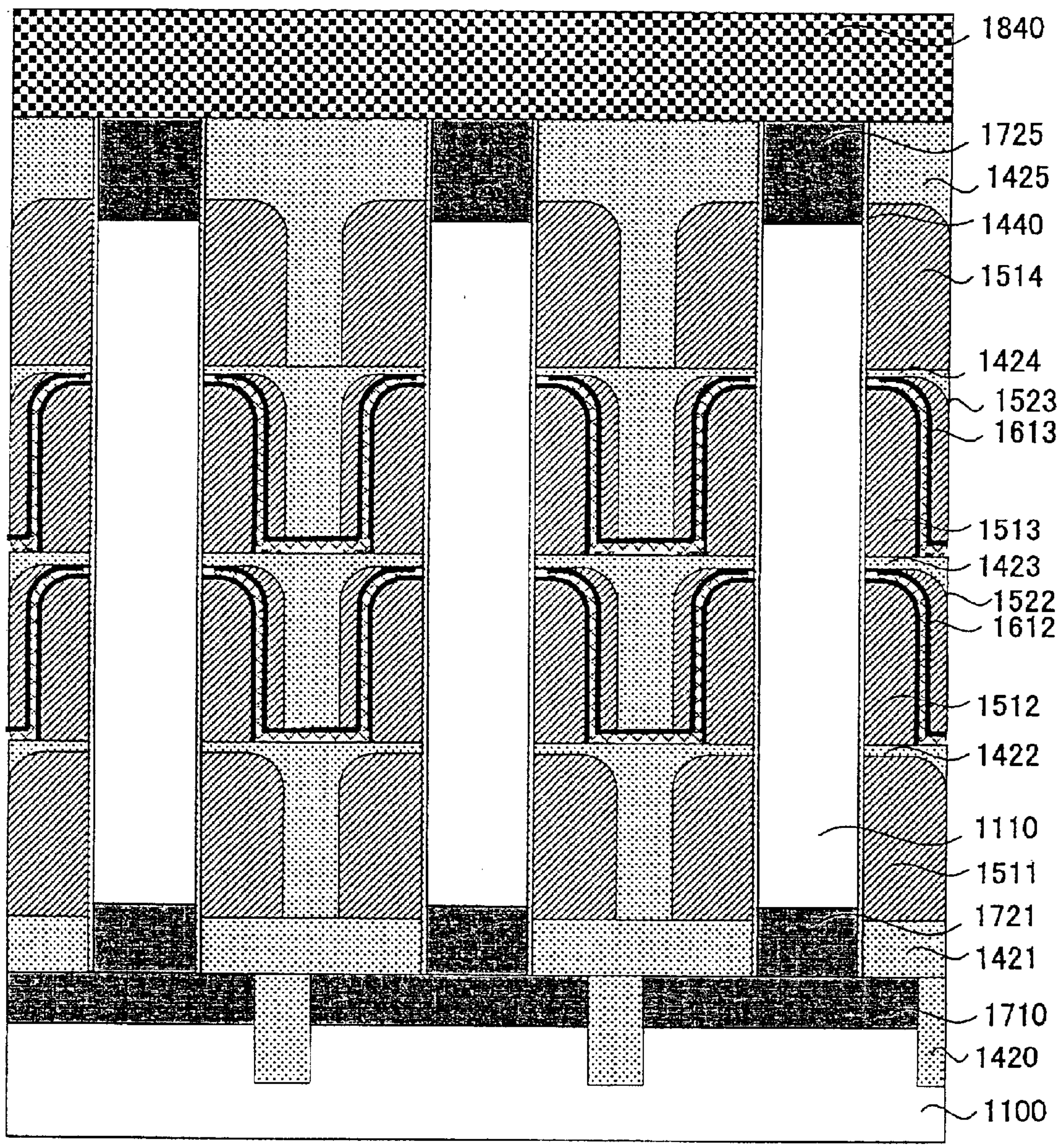

Fig. 1449
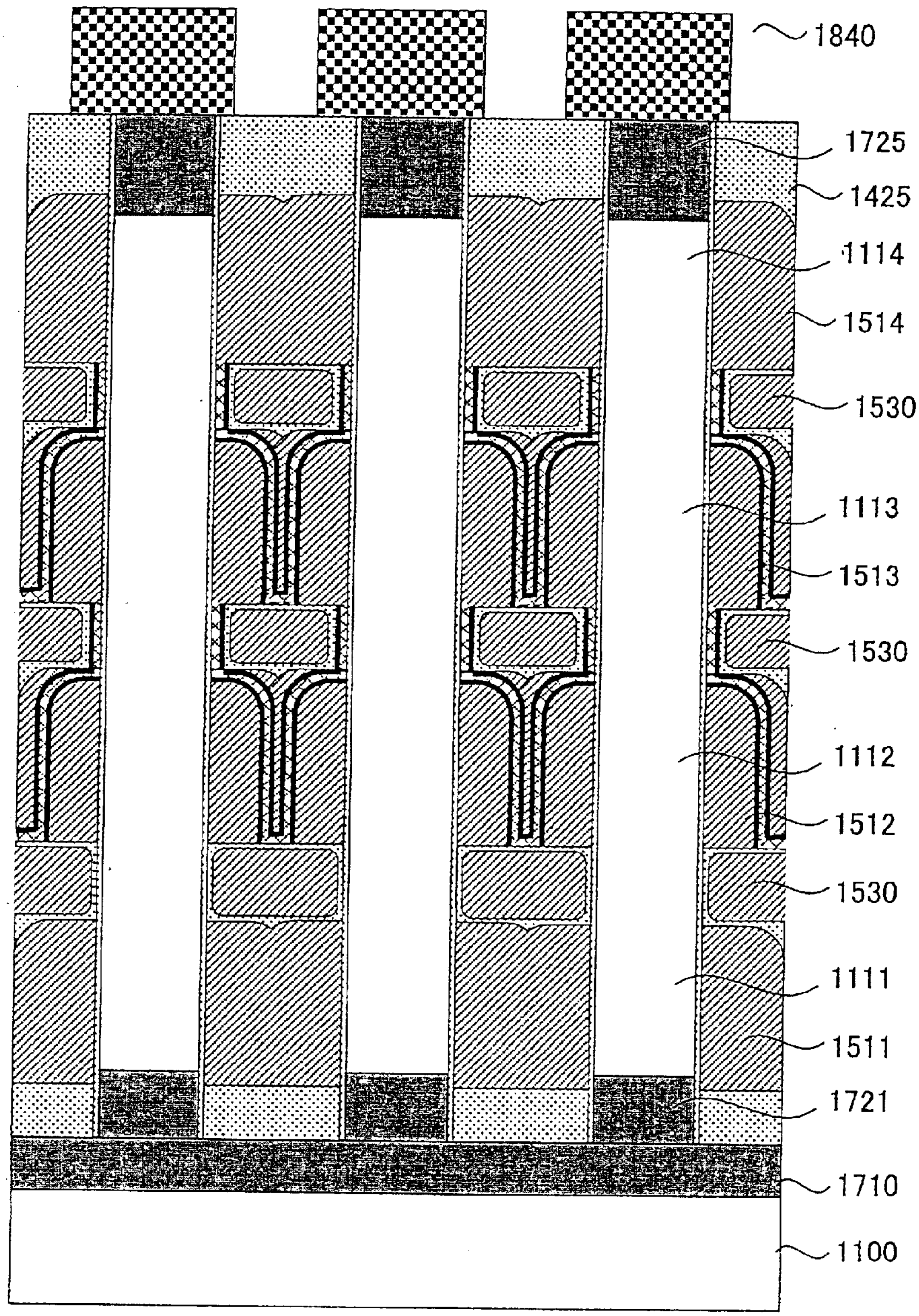

Fig. 1450
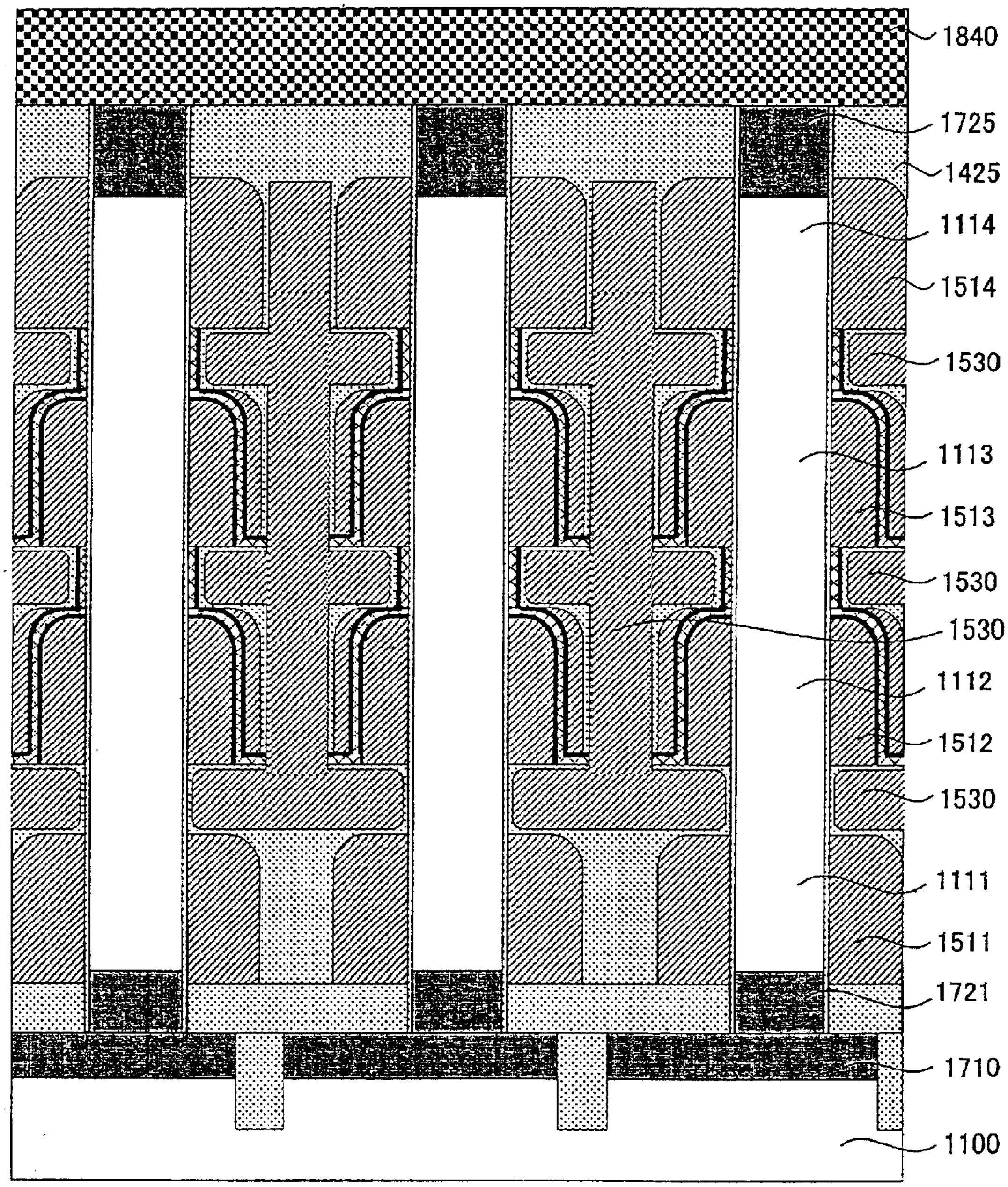

Fig. 1451
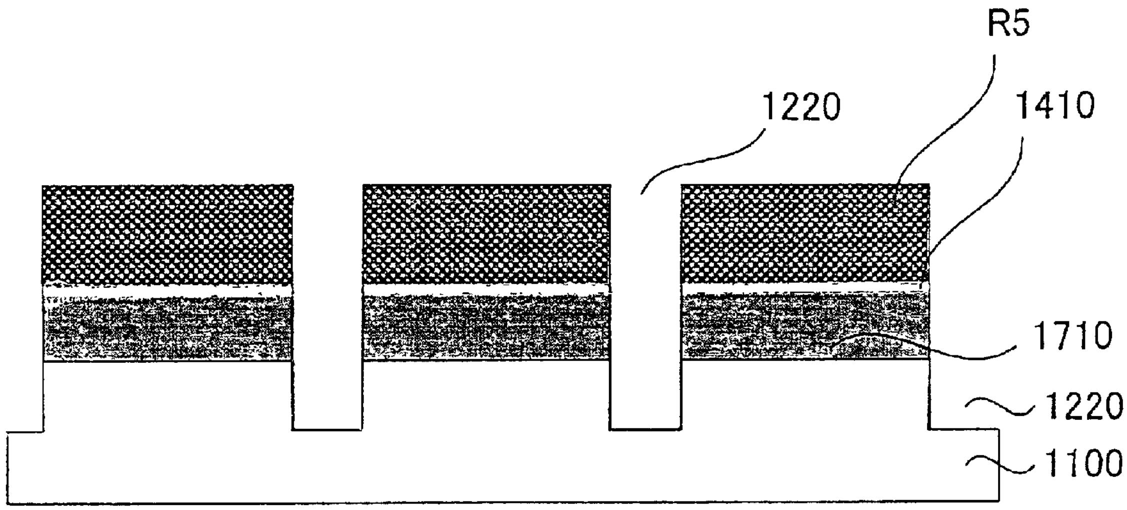
Fig. 1452
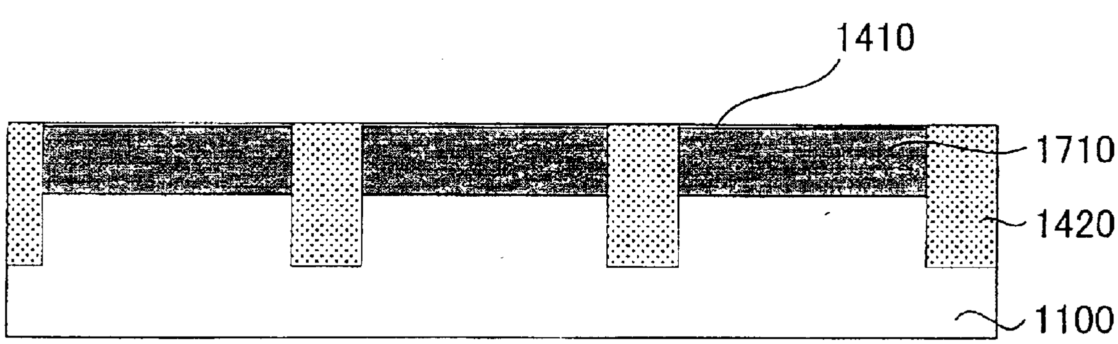

Fig. 1453
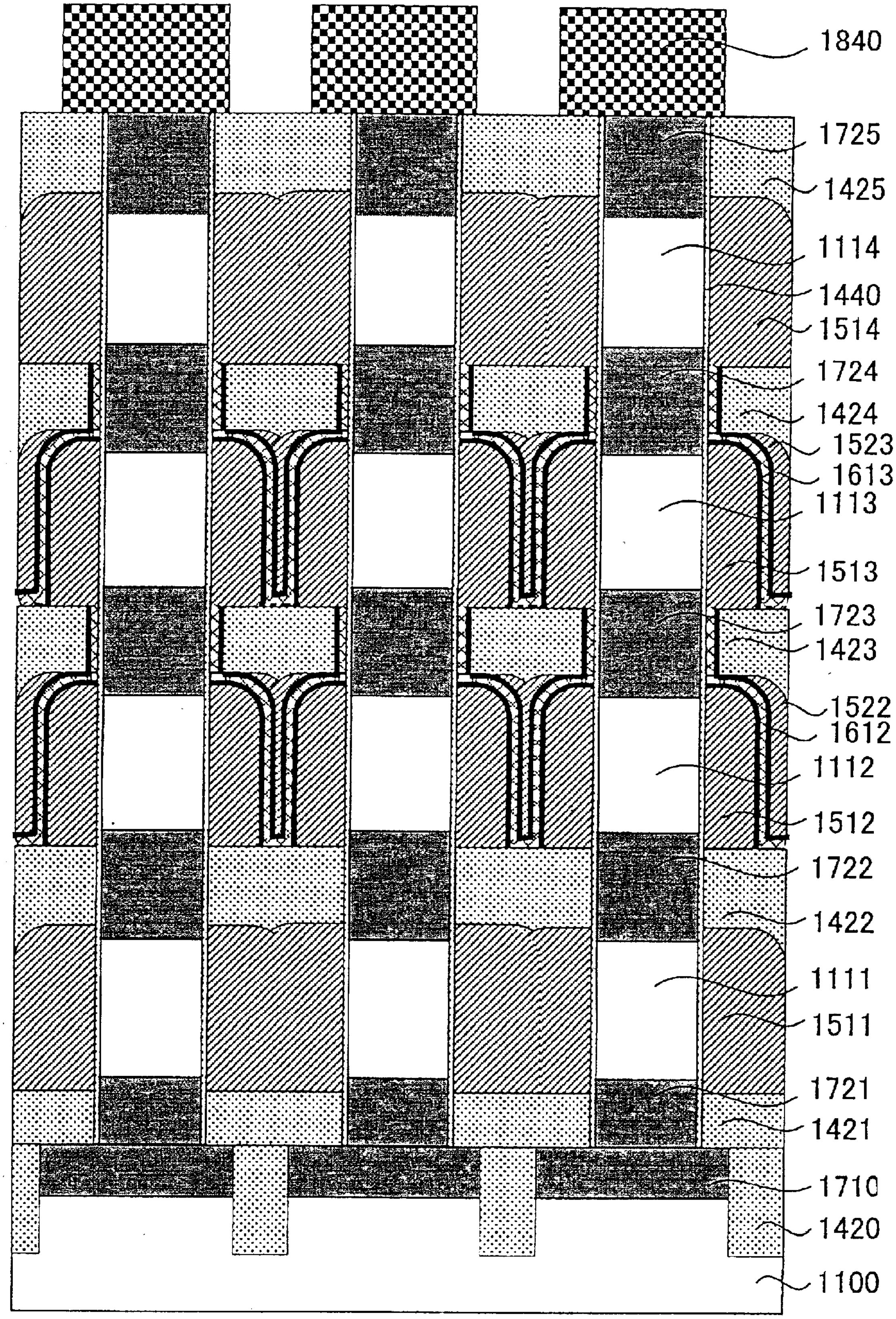

Fig. 1454
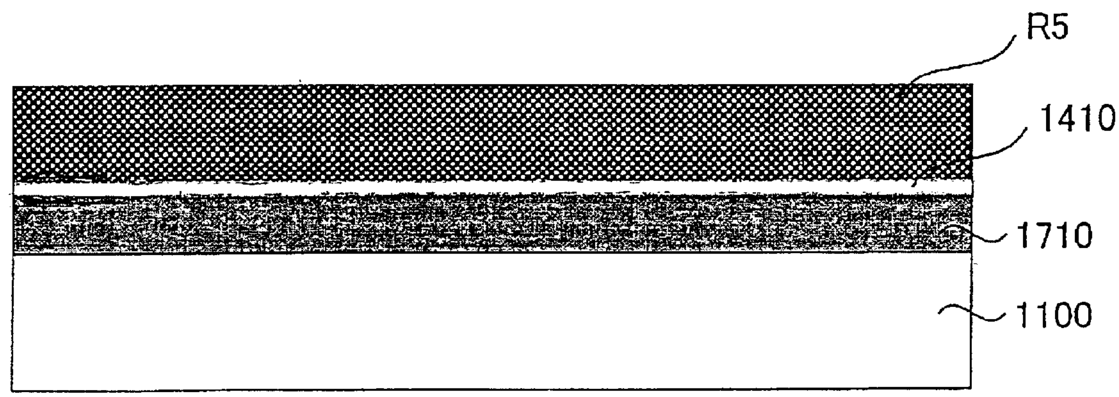
Fig. 1455
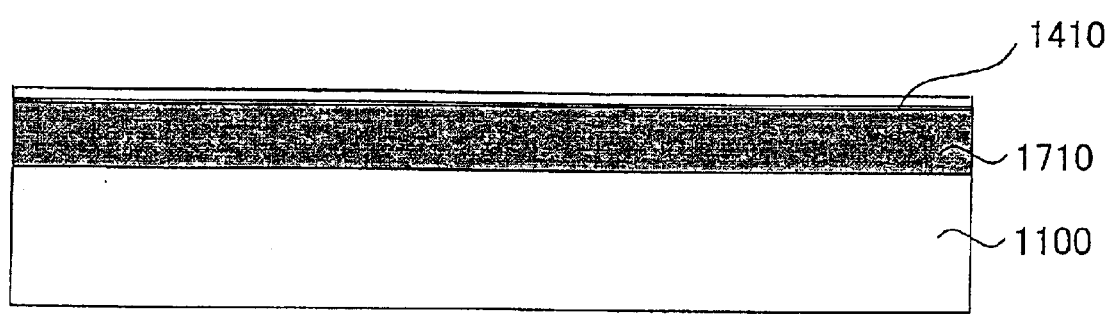

Fig. 1456
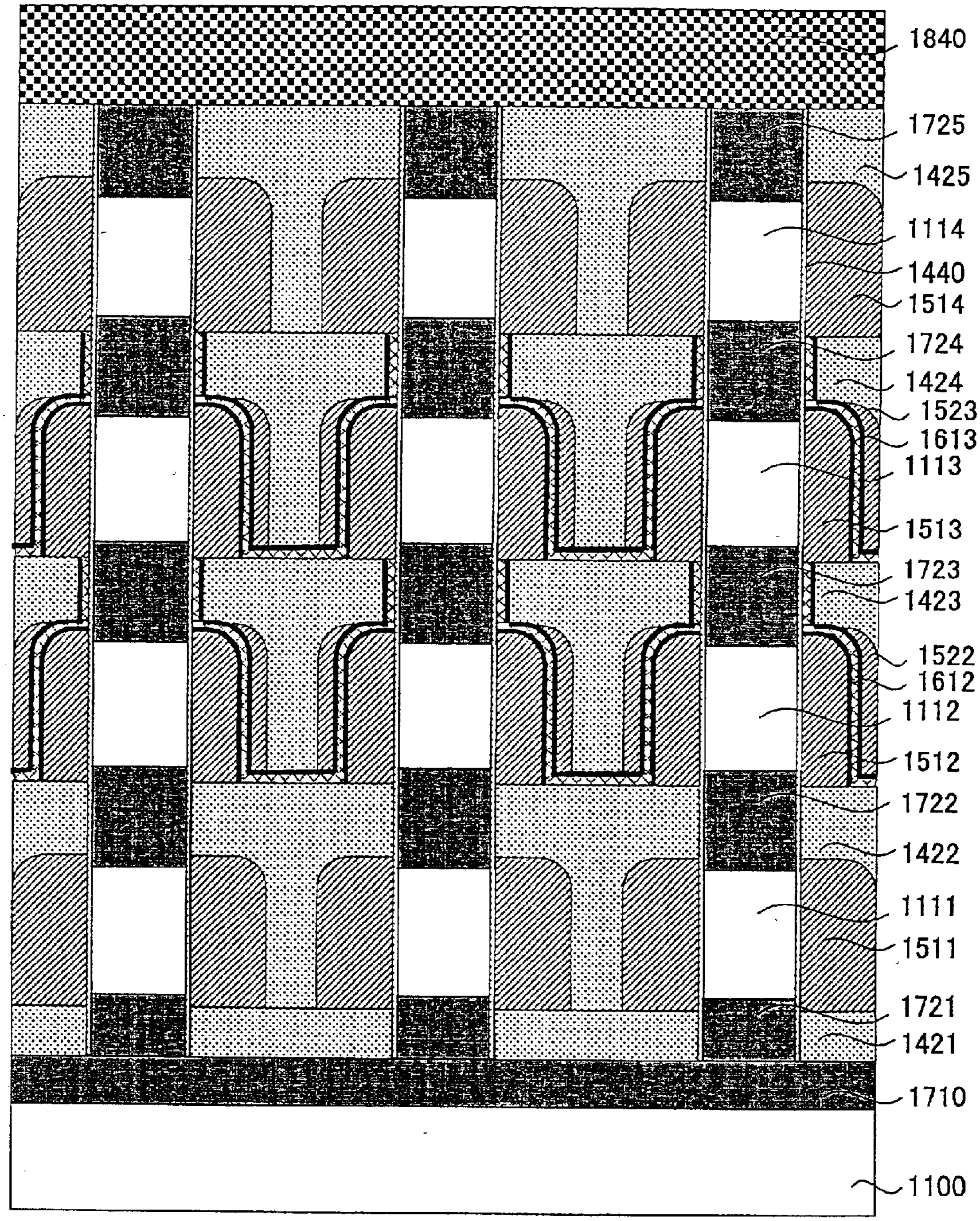

Fig. 1457
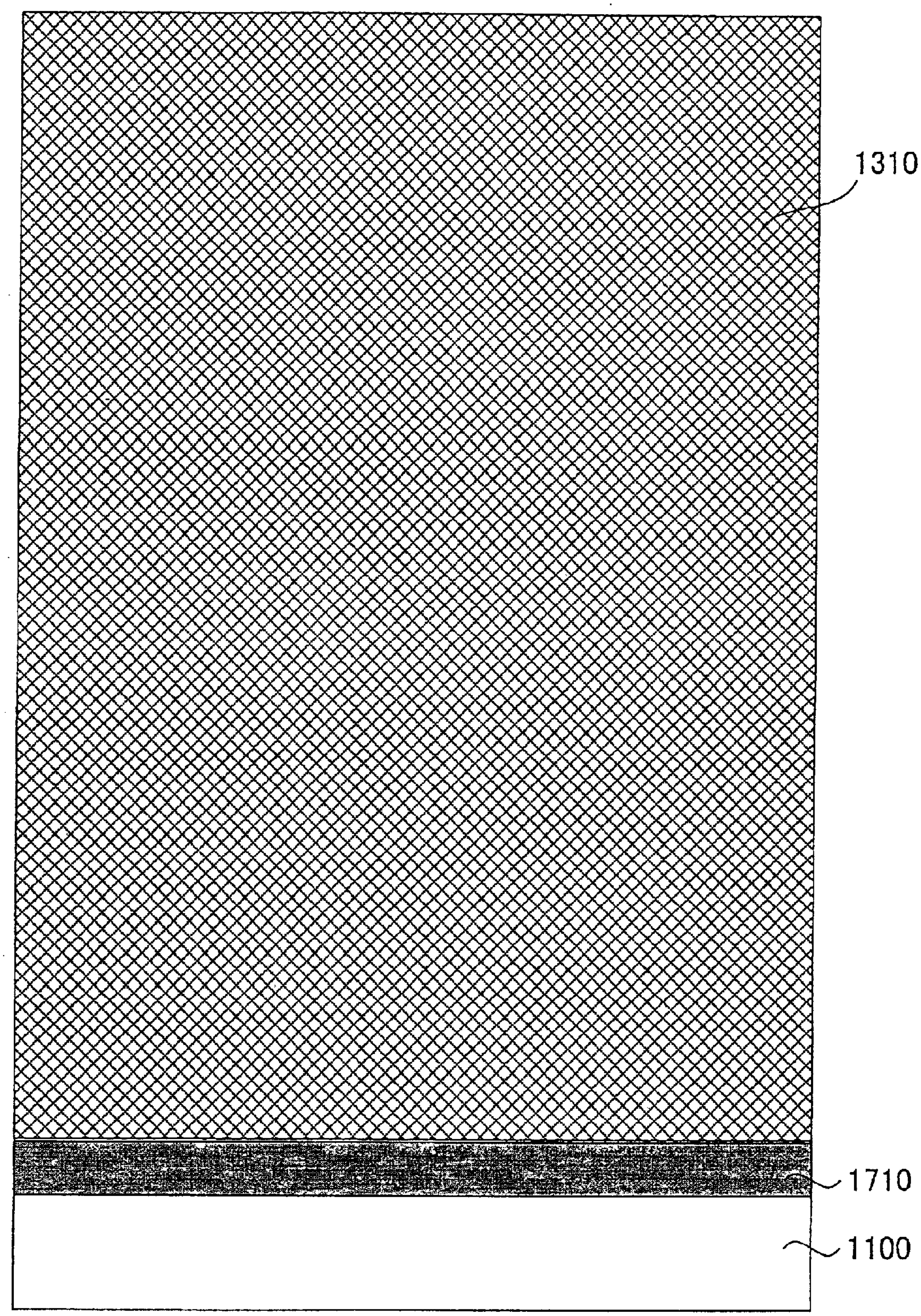

Fig. 1458
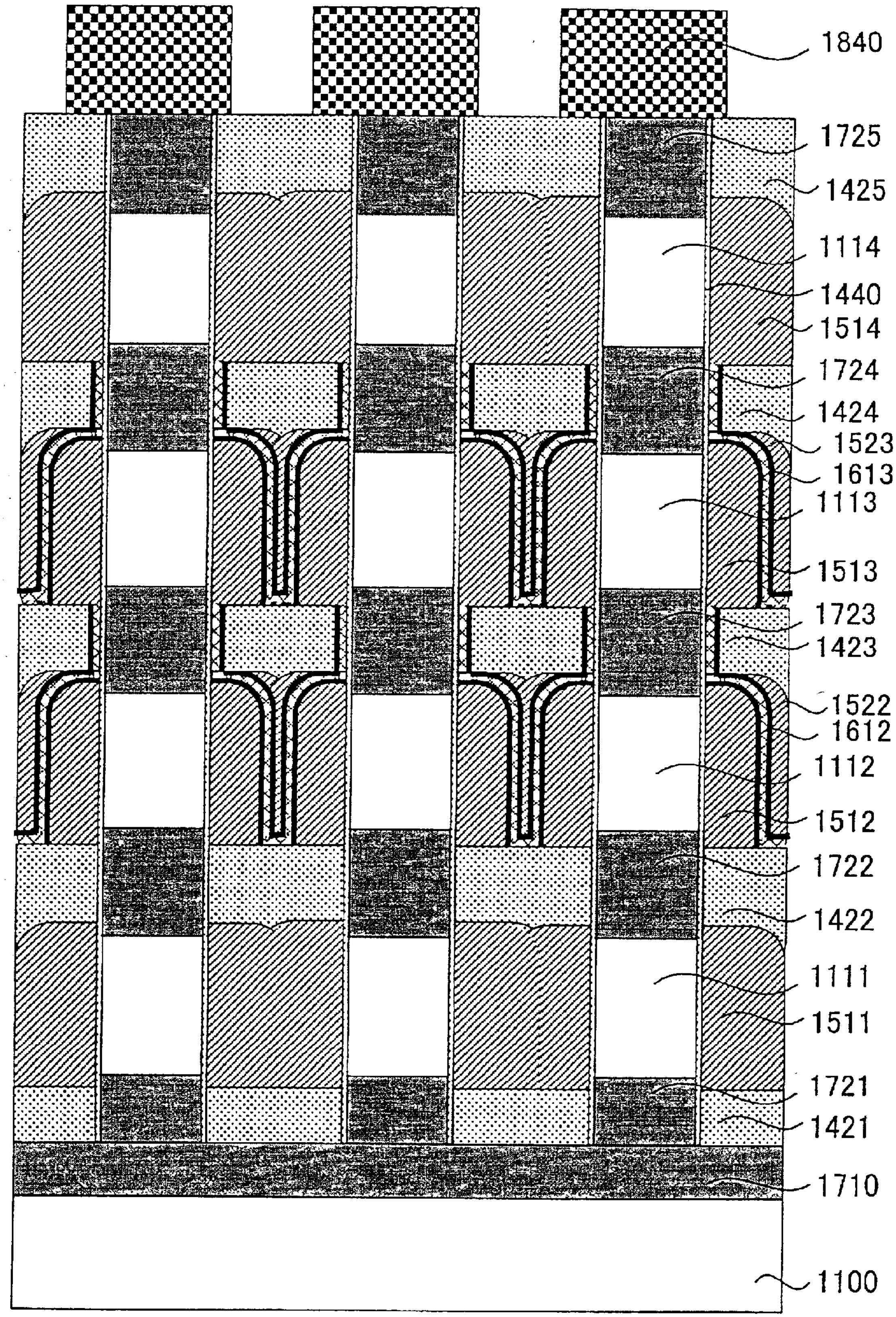

Fig. 1459
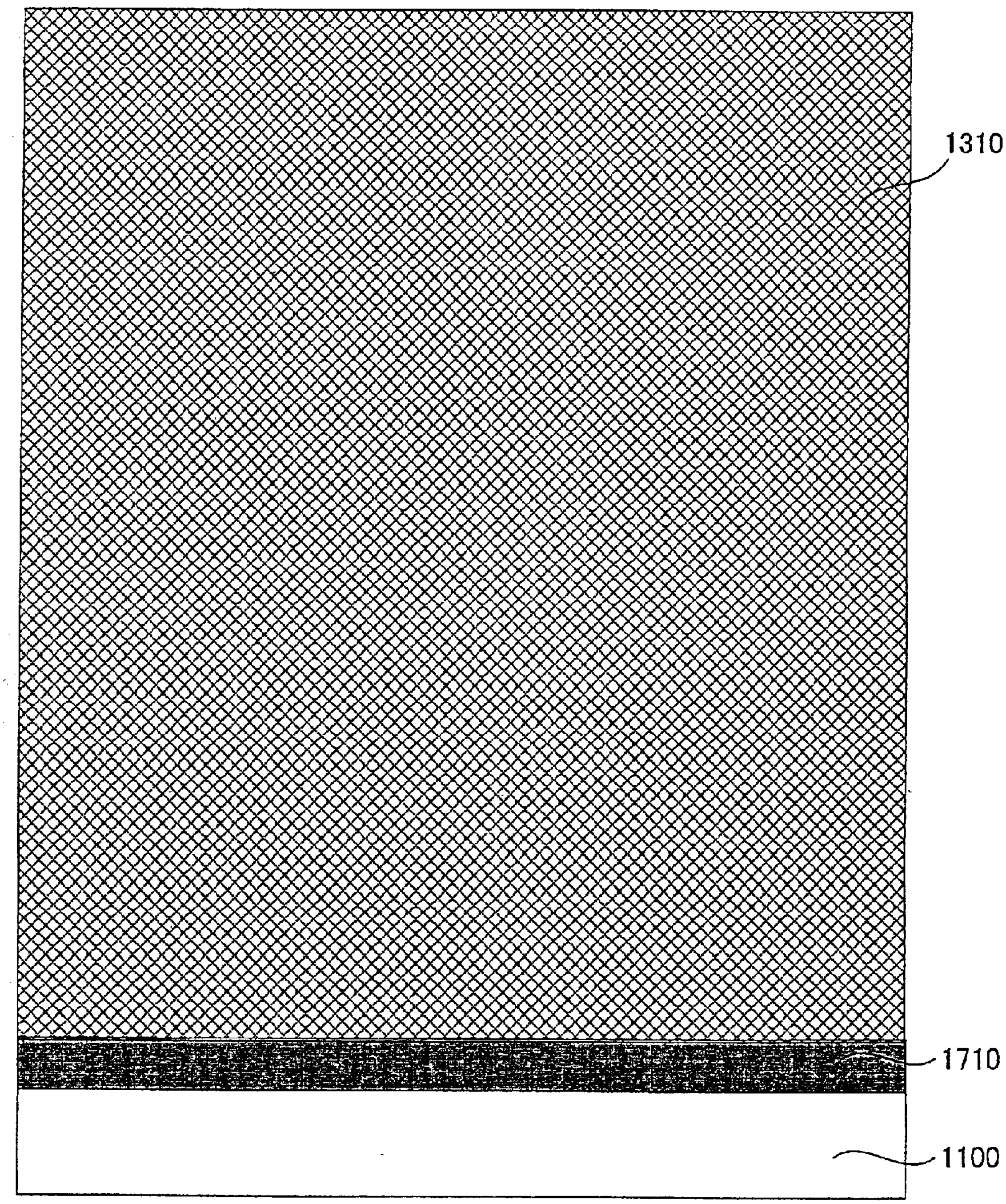

Fig. 1460
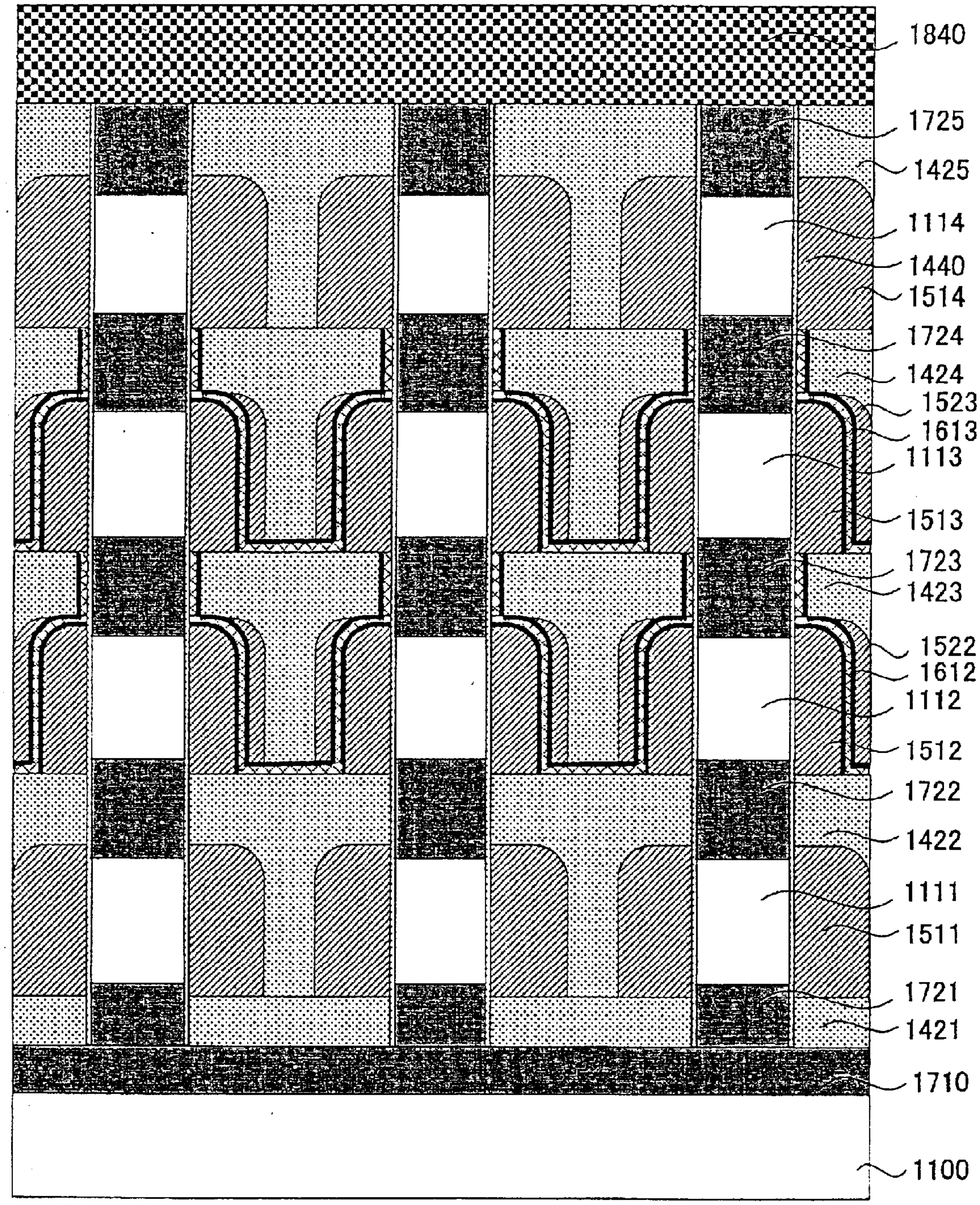

Fig. 1461
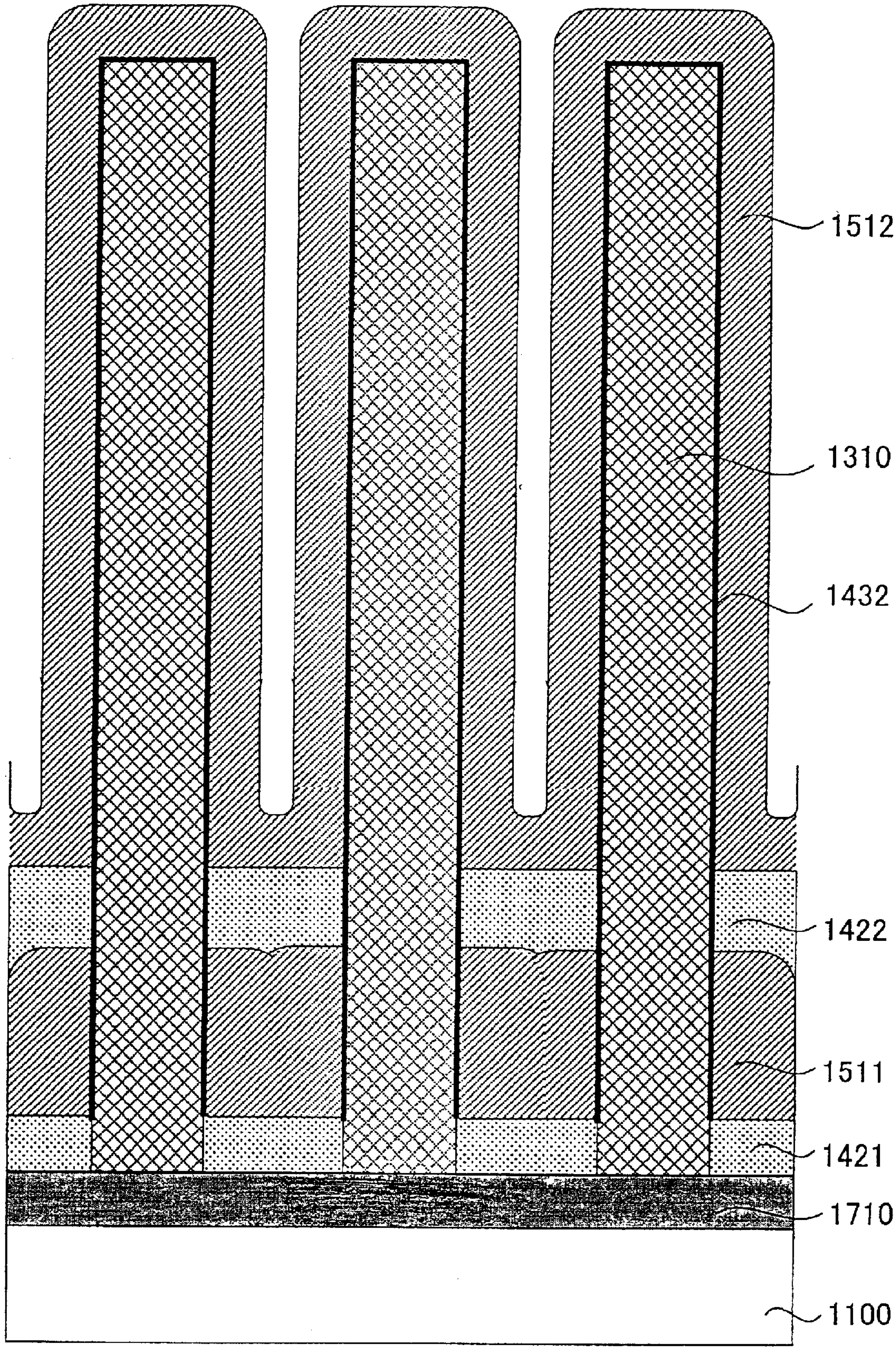

Fig. 1462
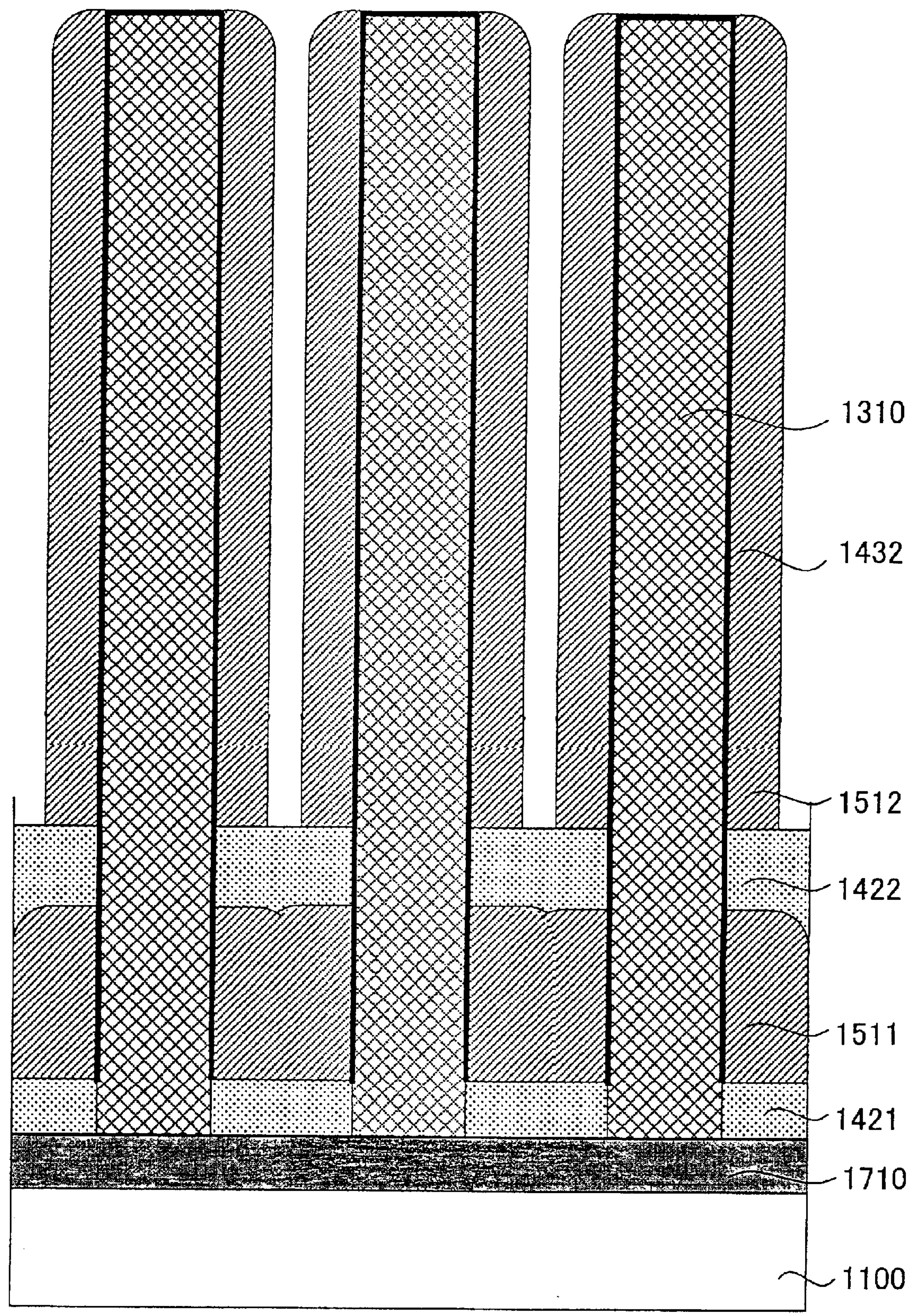

Fig. 1463
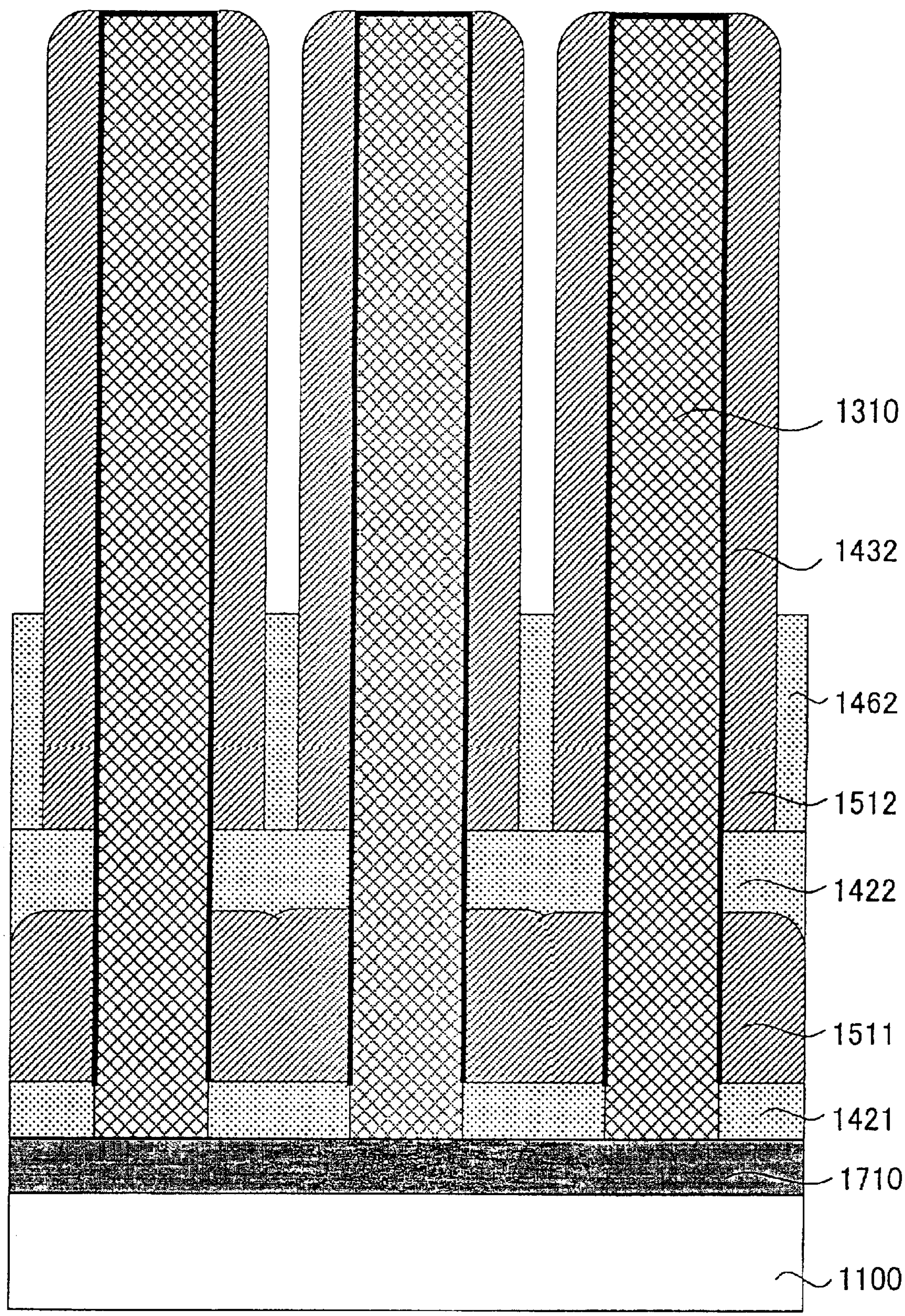

Fig. 1464
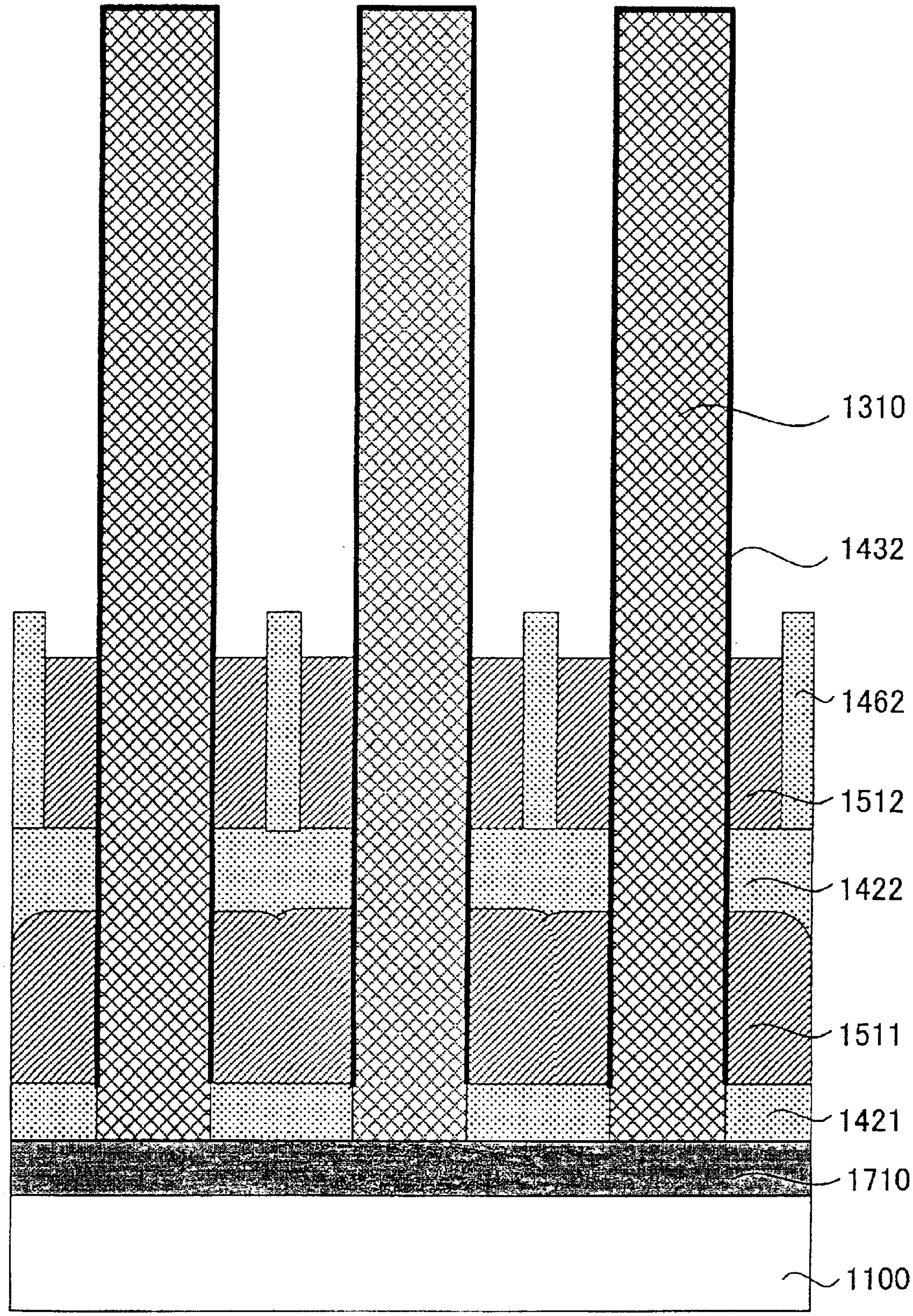

Fig. 1465
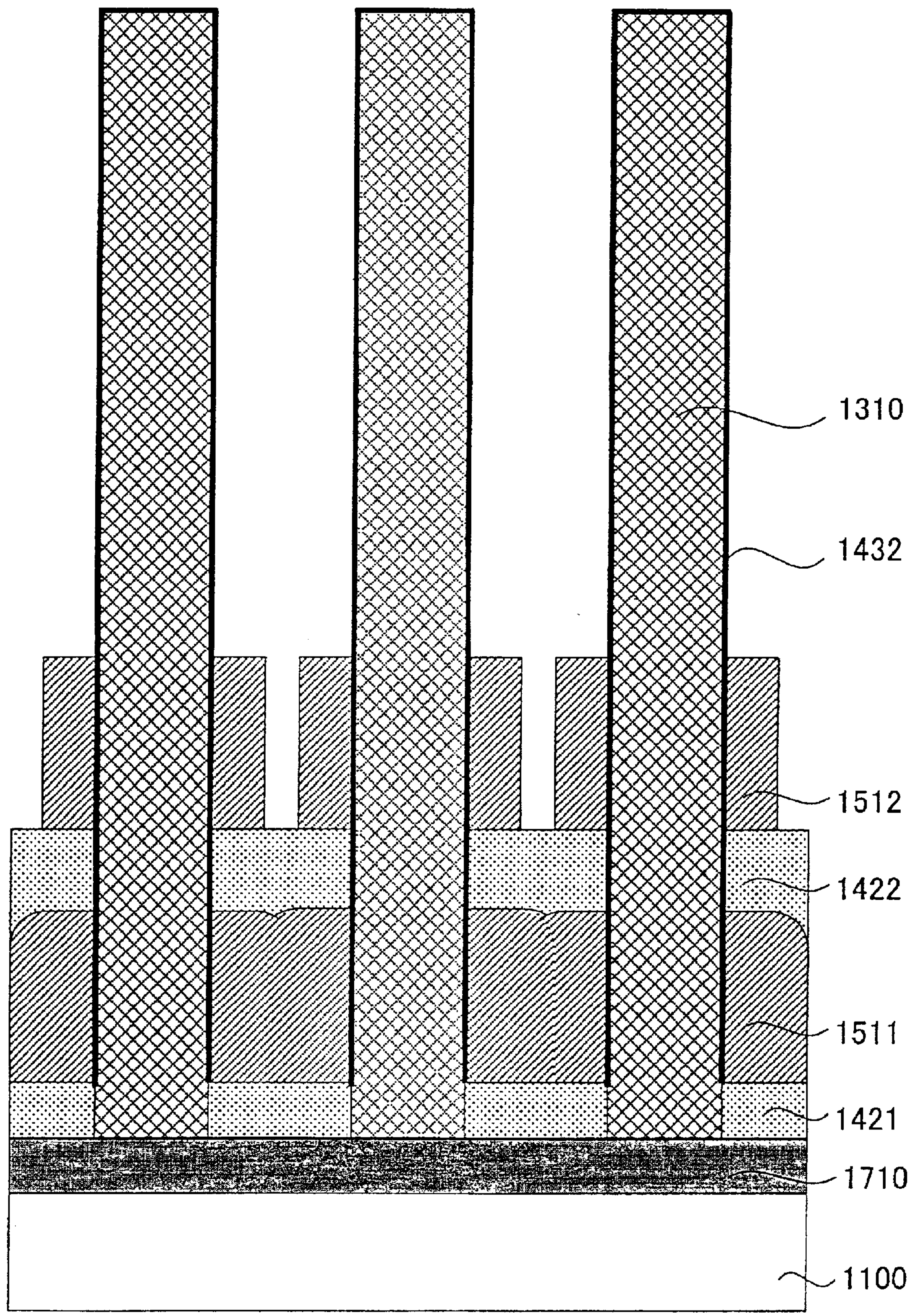

Fig. 1466
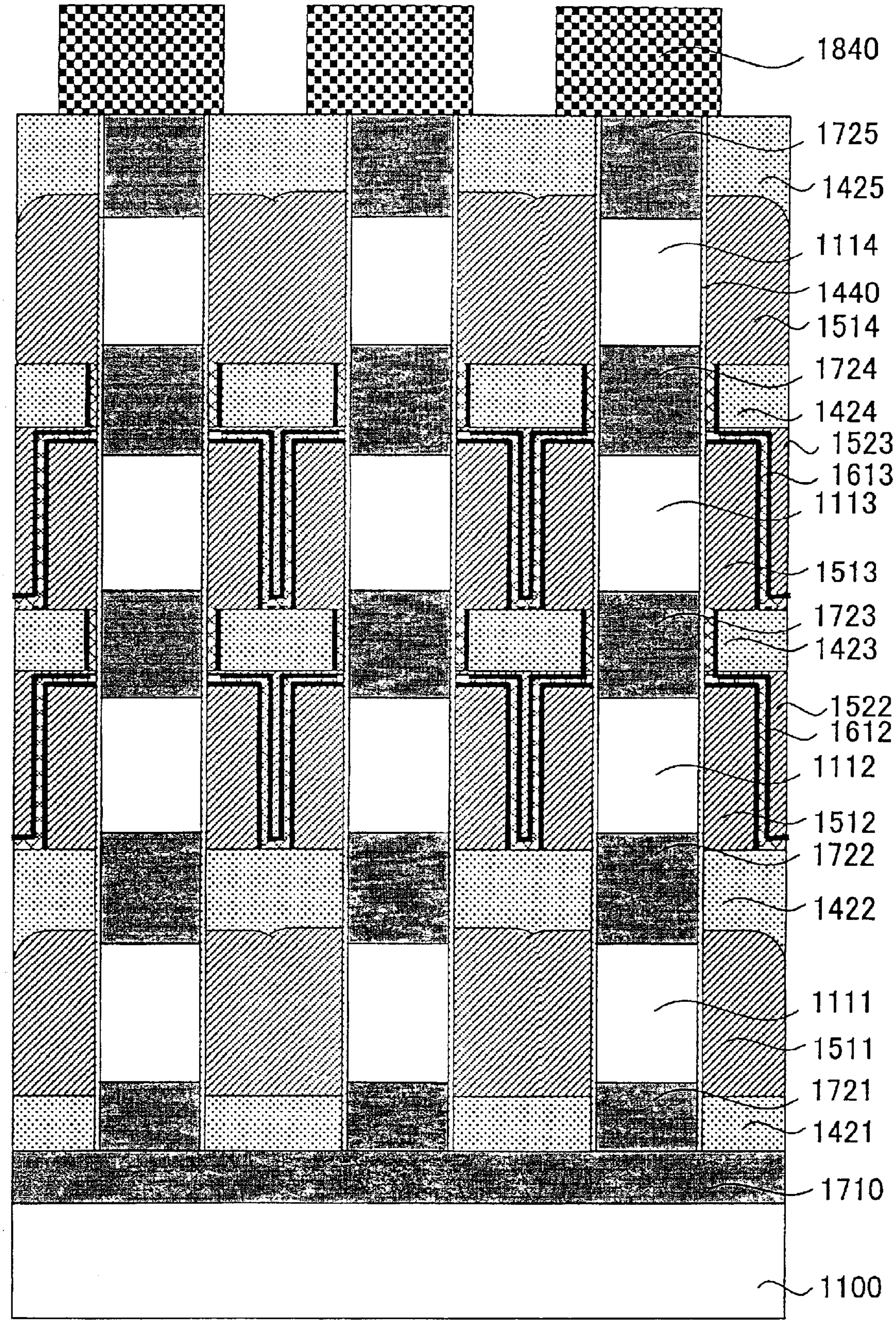

Fig. 1467
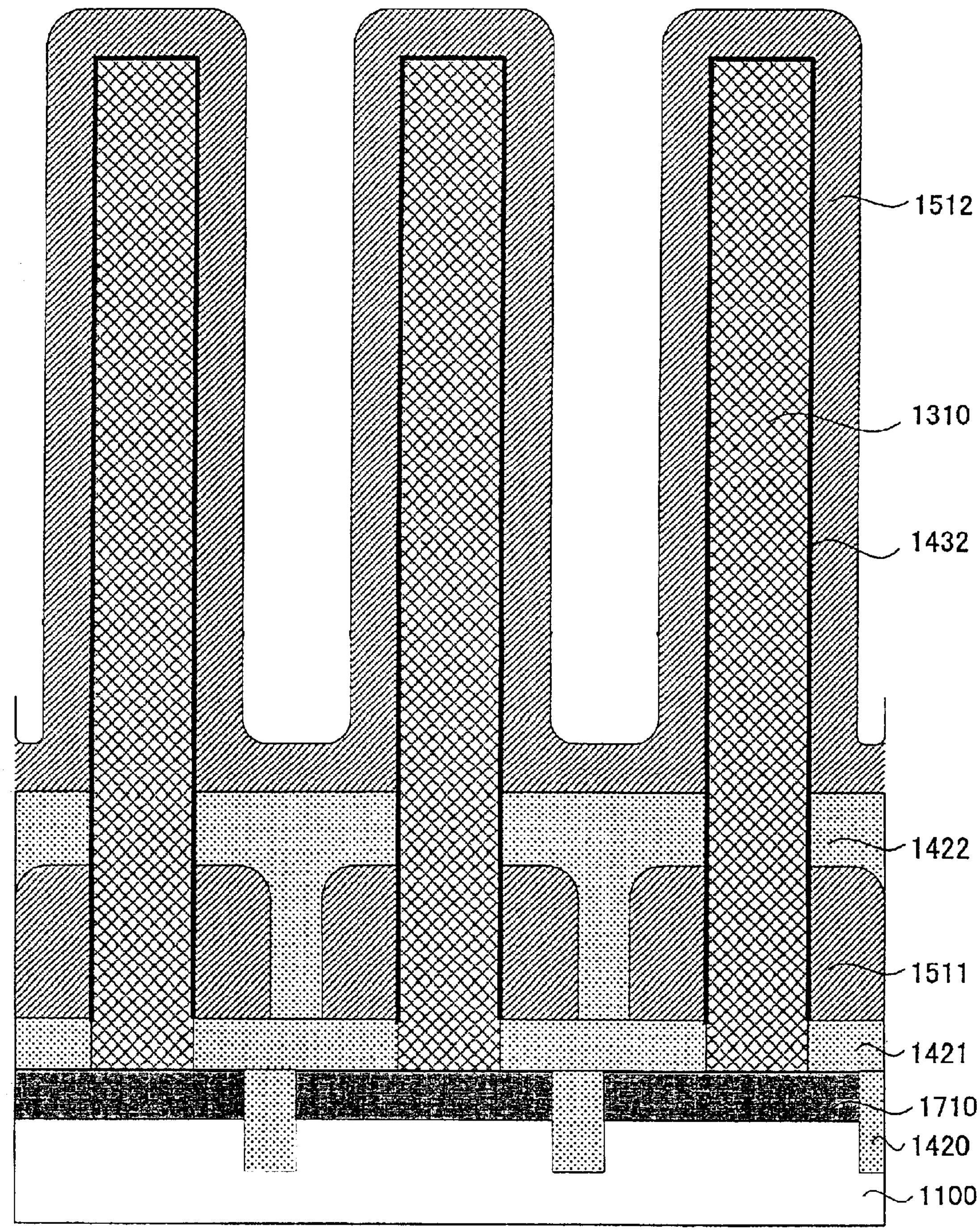

Fig. 1468
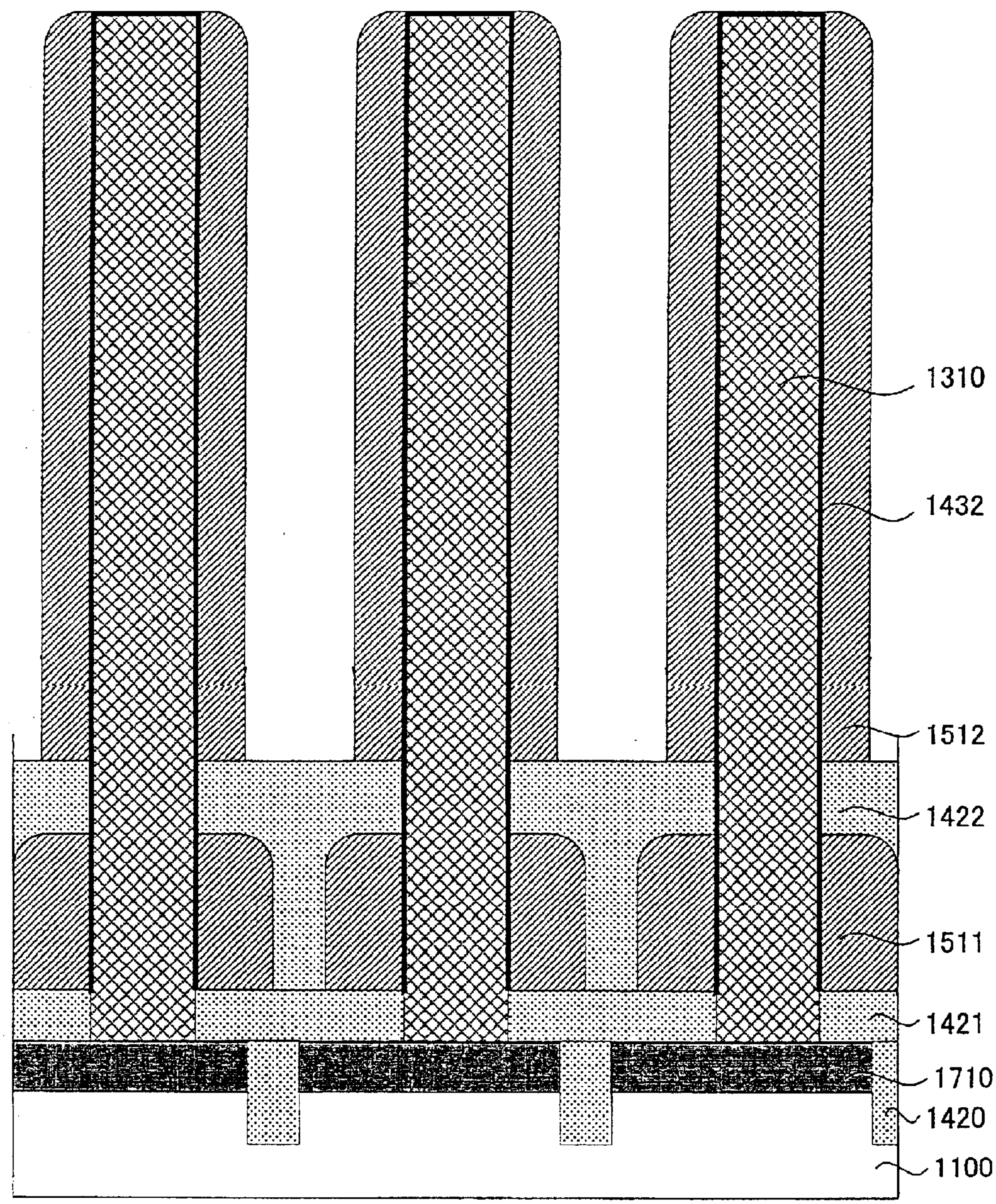

Fig. 1469
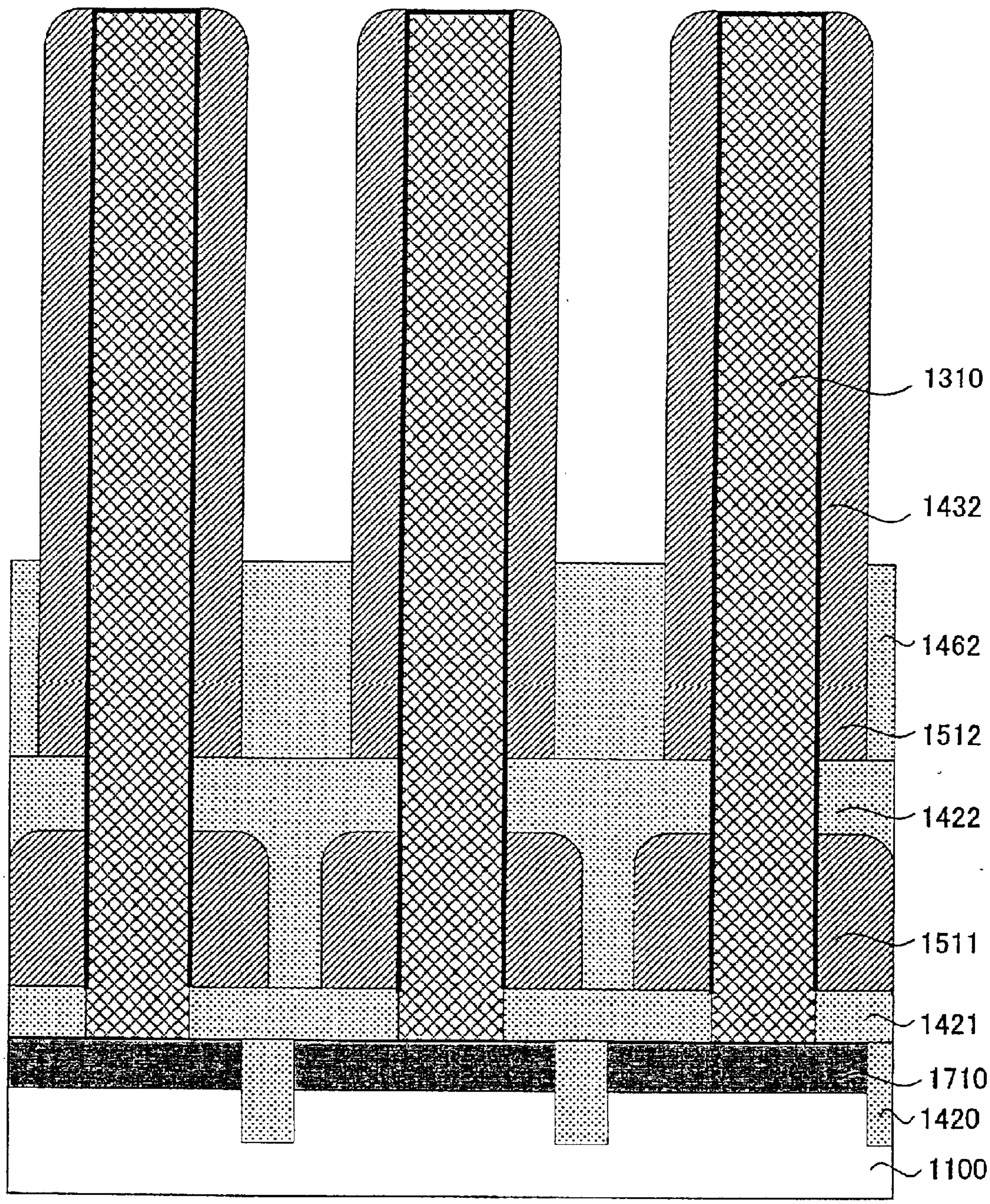

Fig. 1470
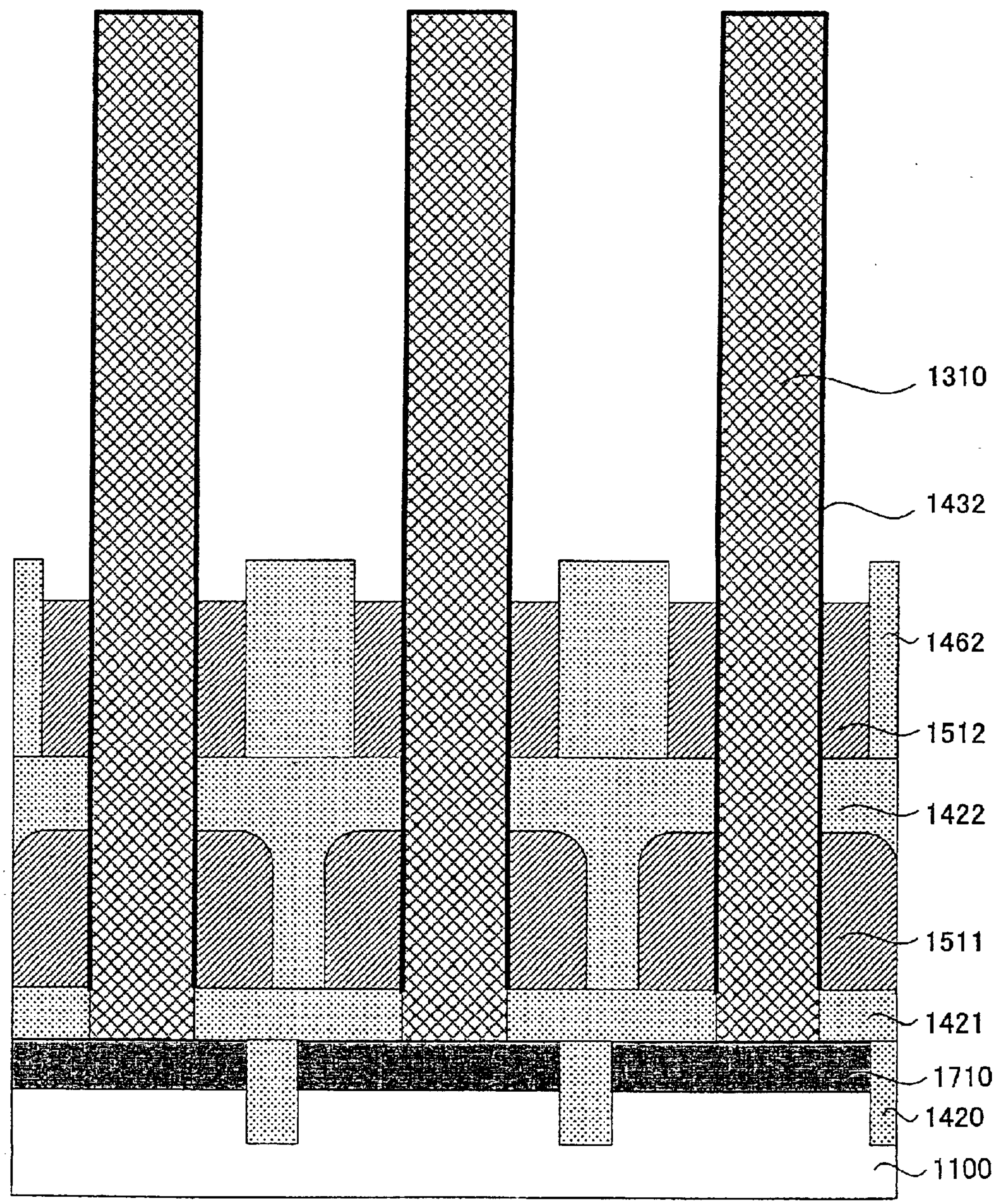

Fig. 1471
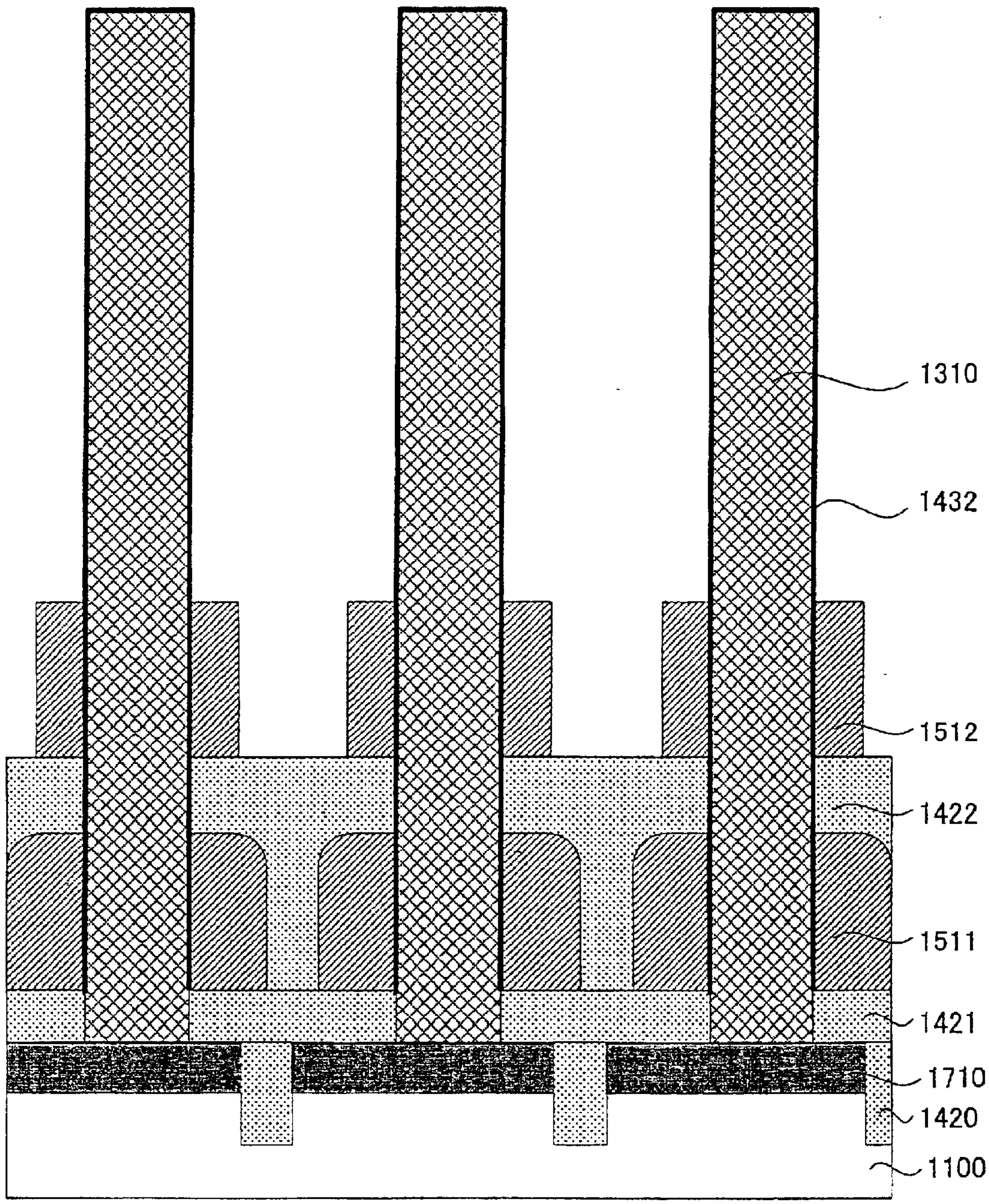

Fig. 1472
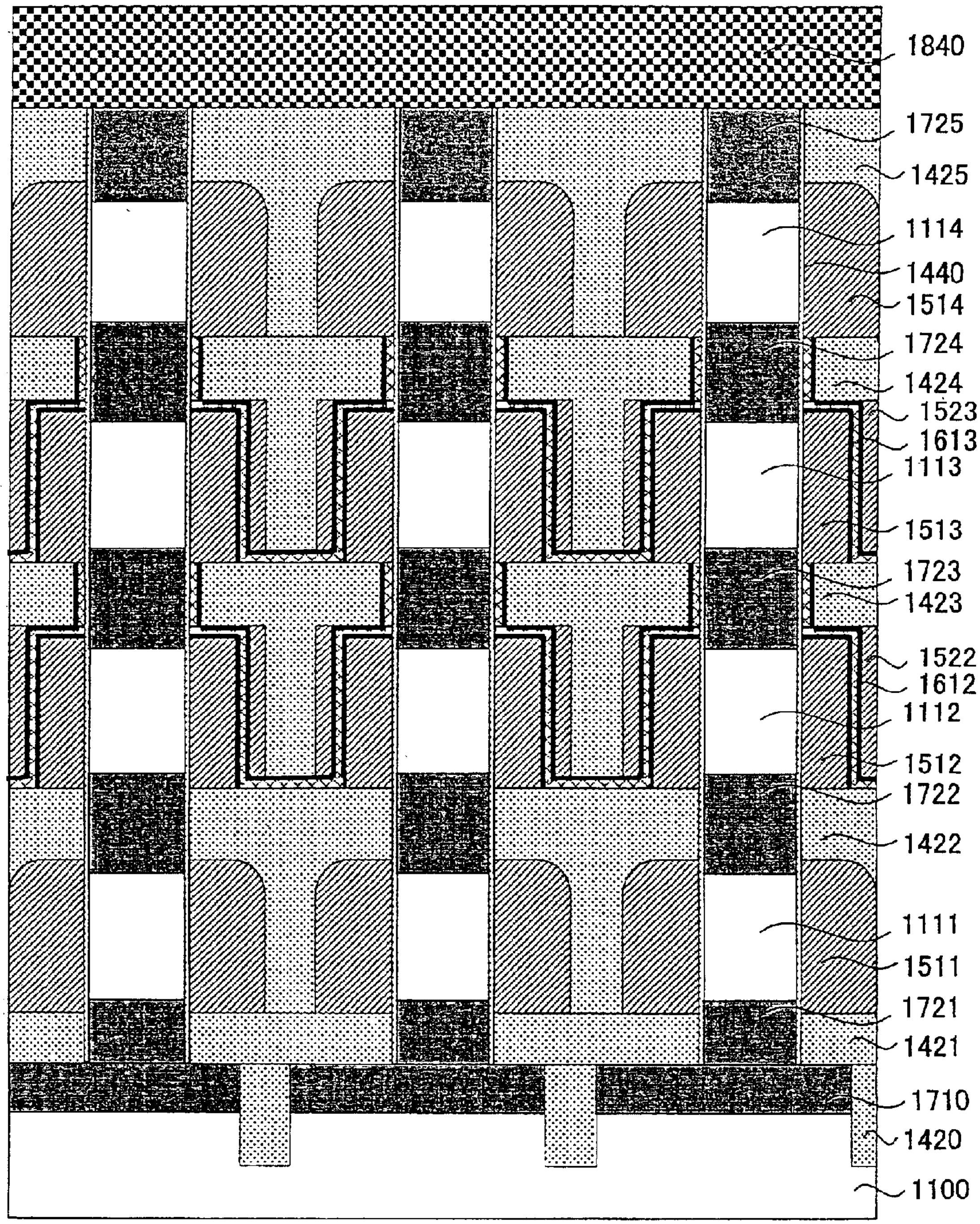

Fig. 1473
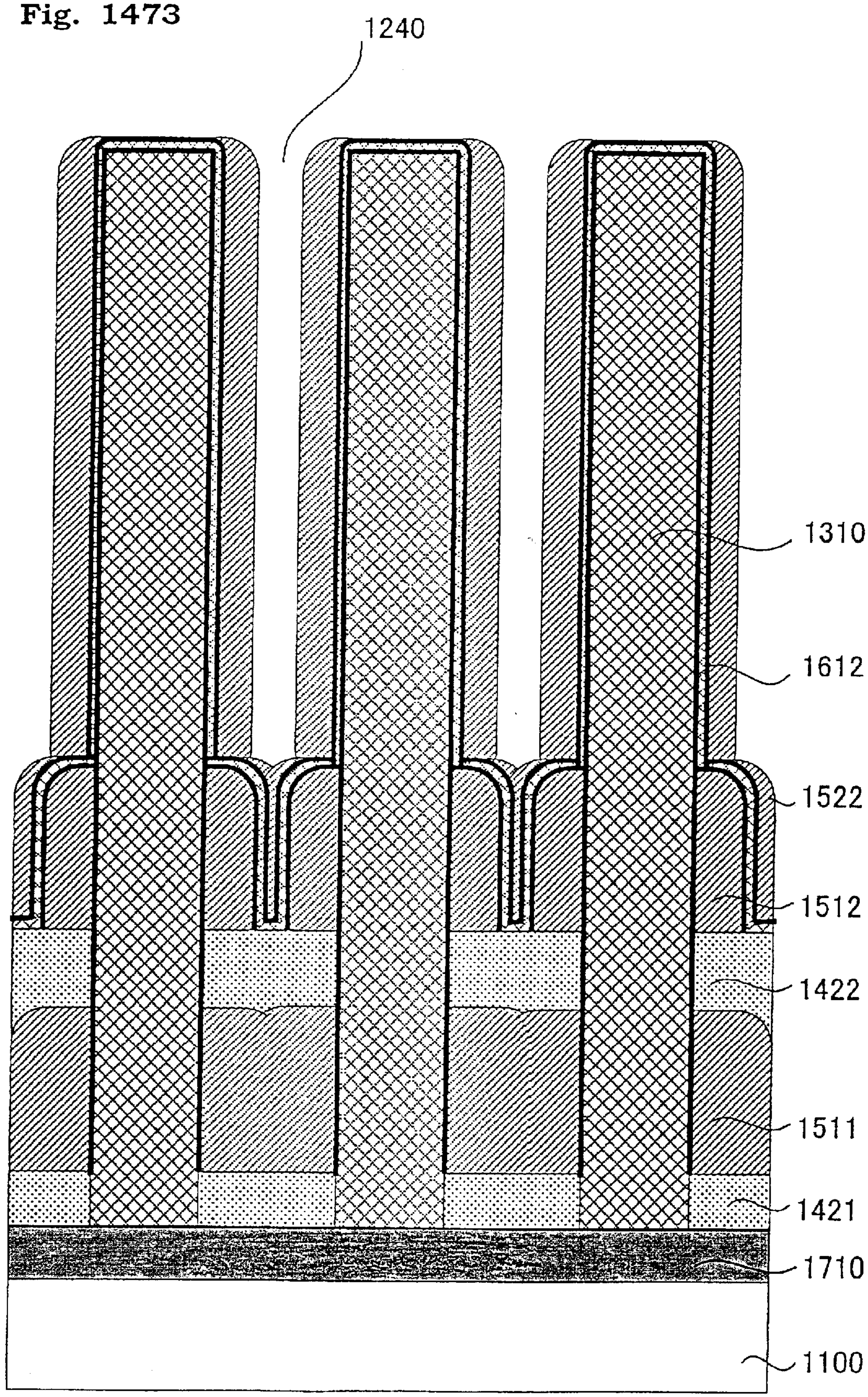

Fig. 1474
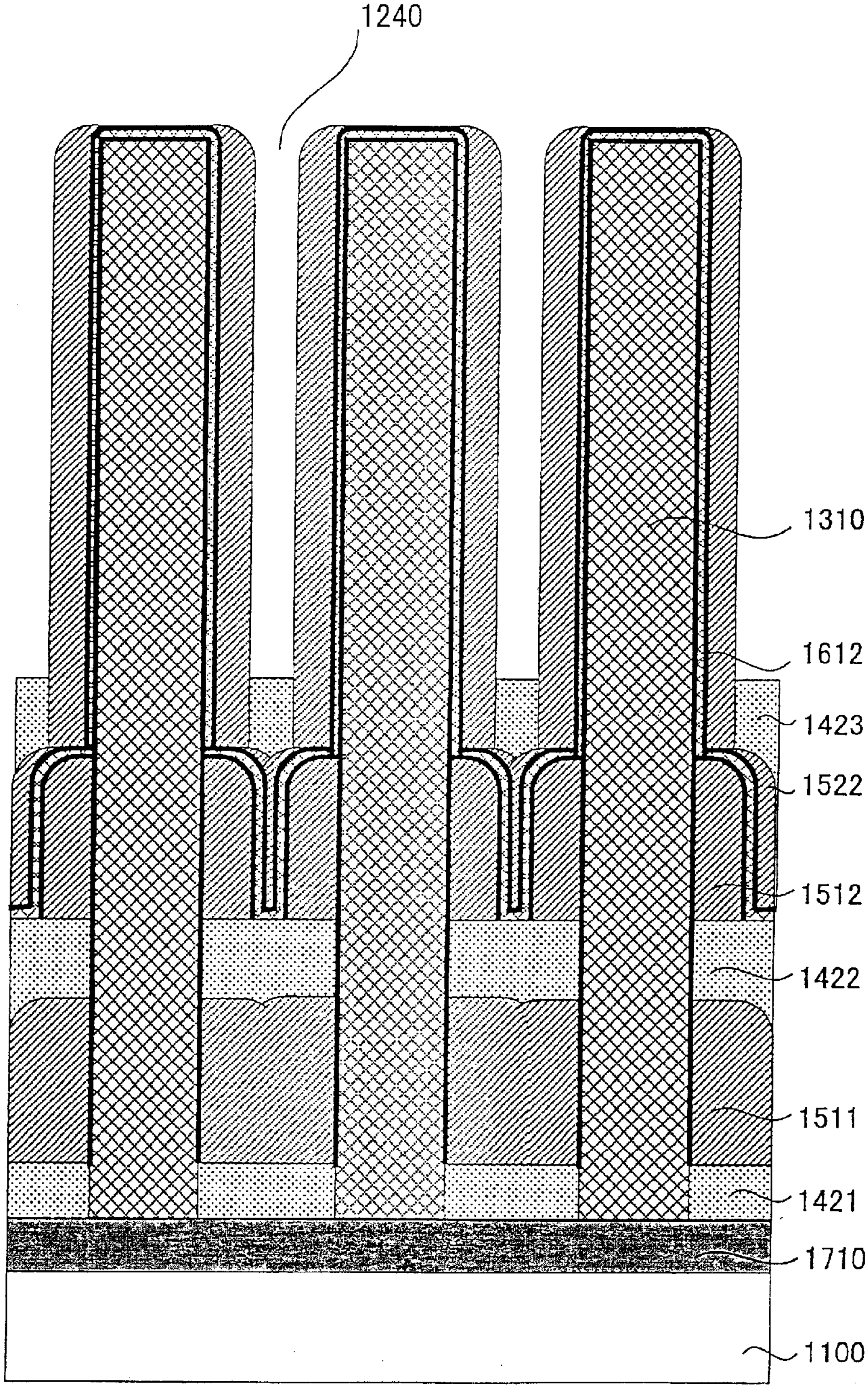

Fig. 1475
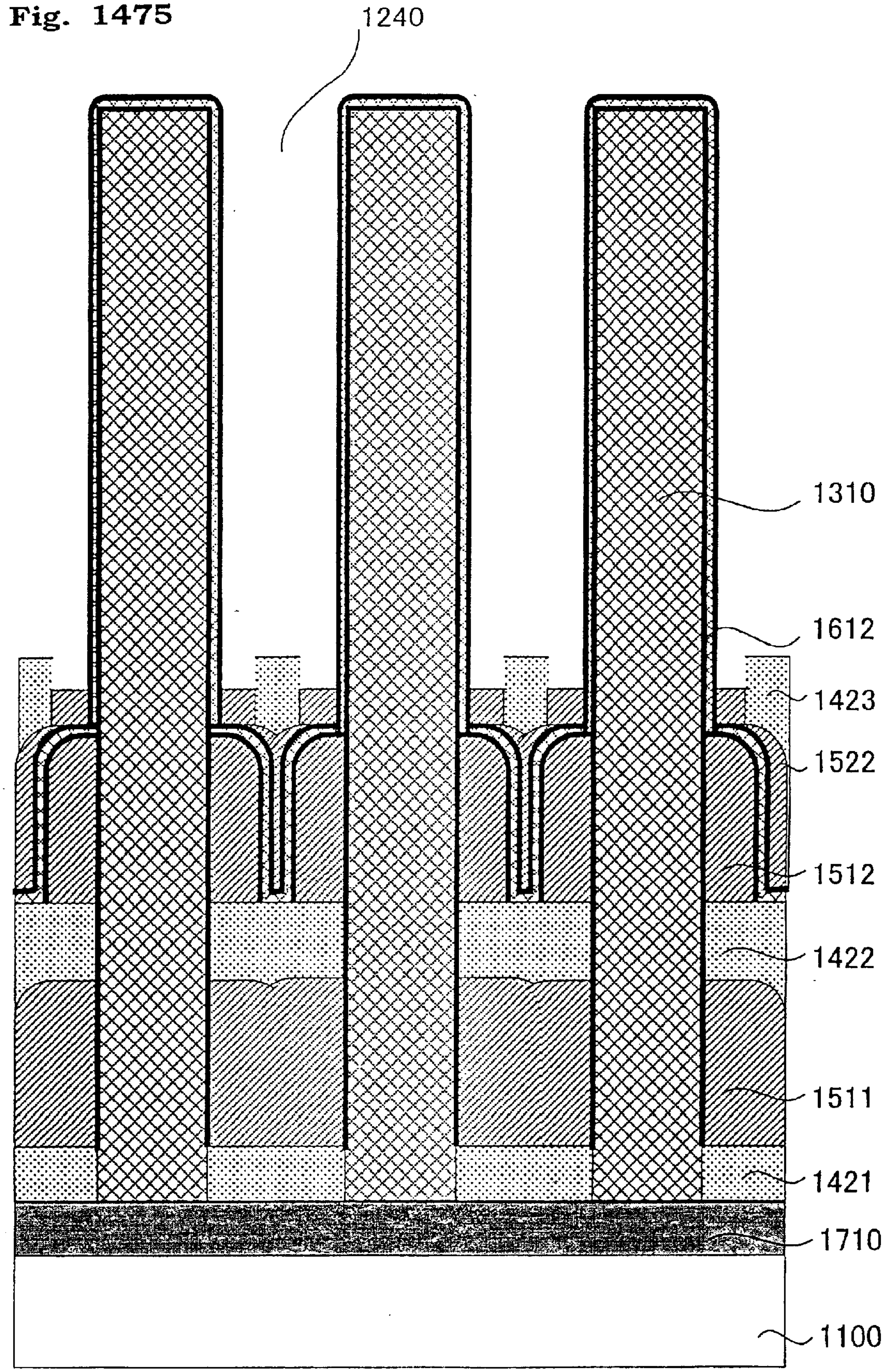

Fig. 1476
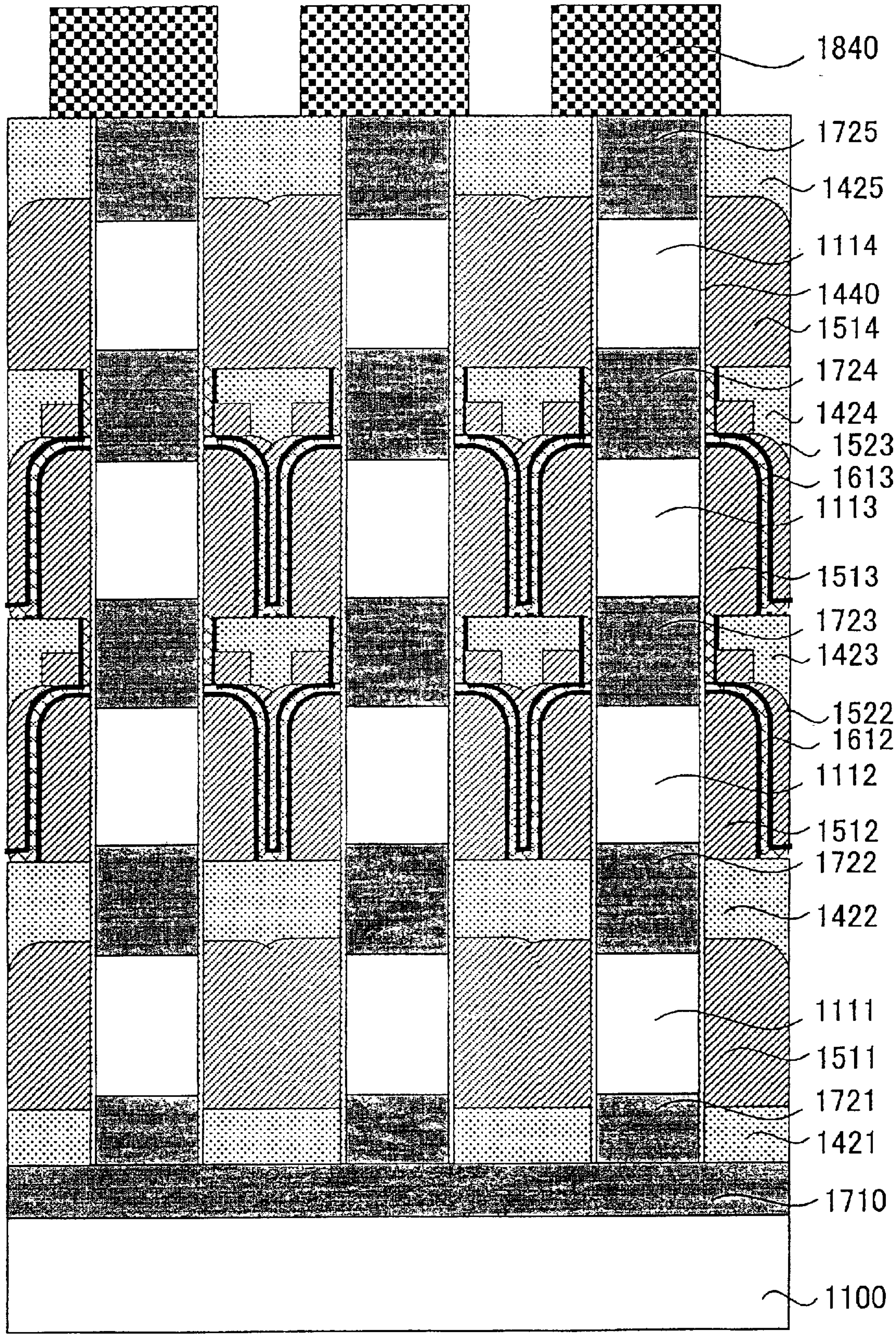

Fig. 1477
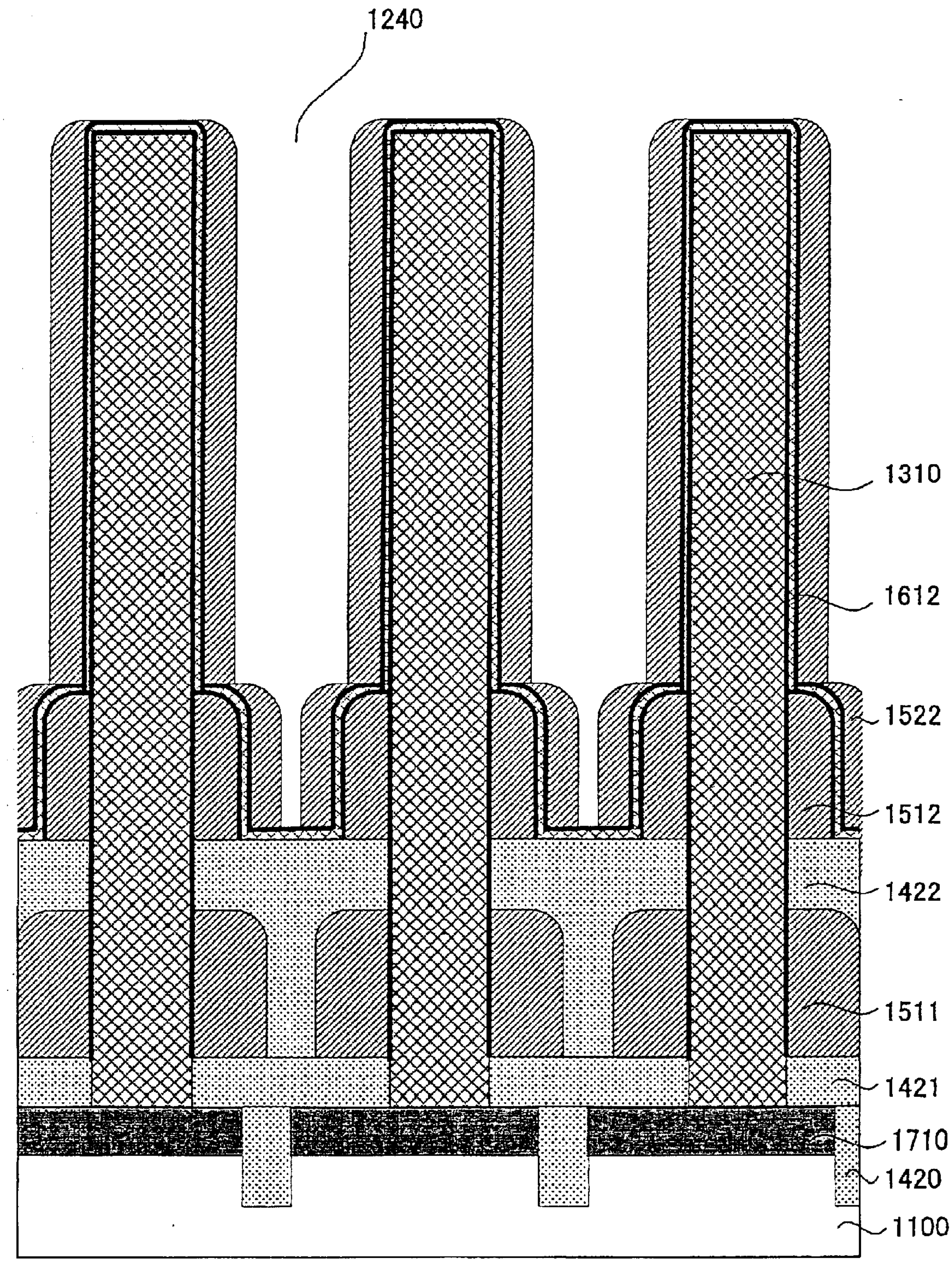

Fig. 1478
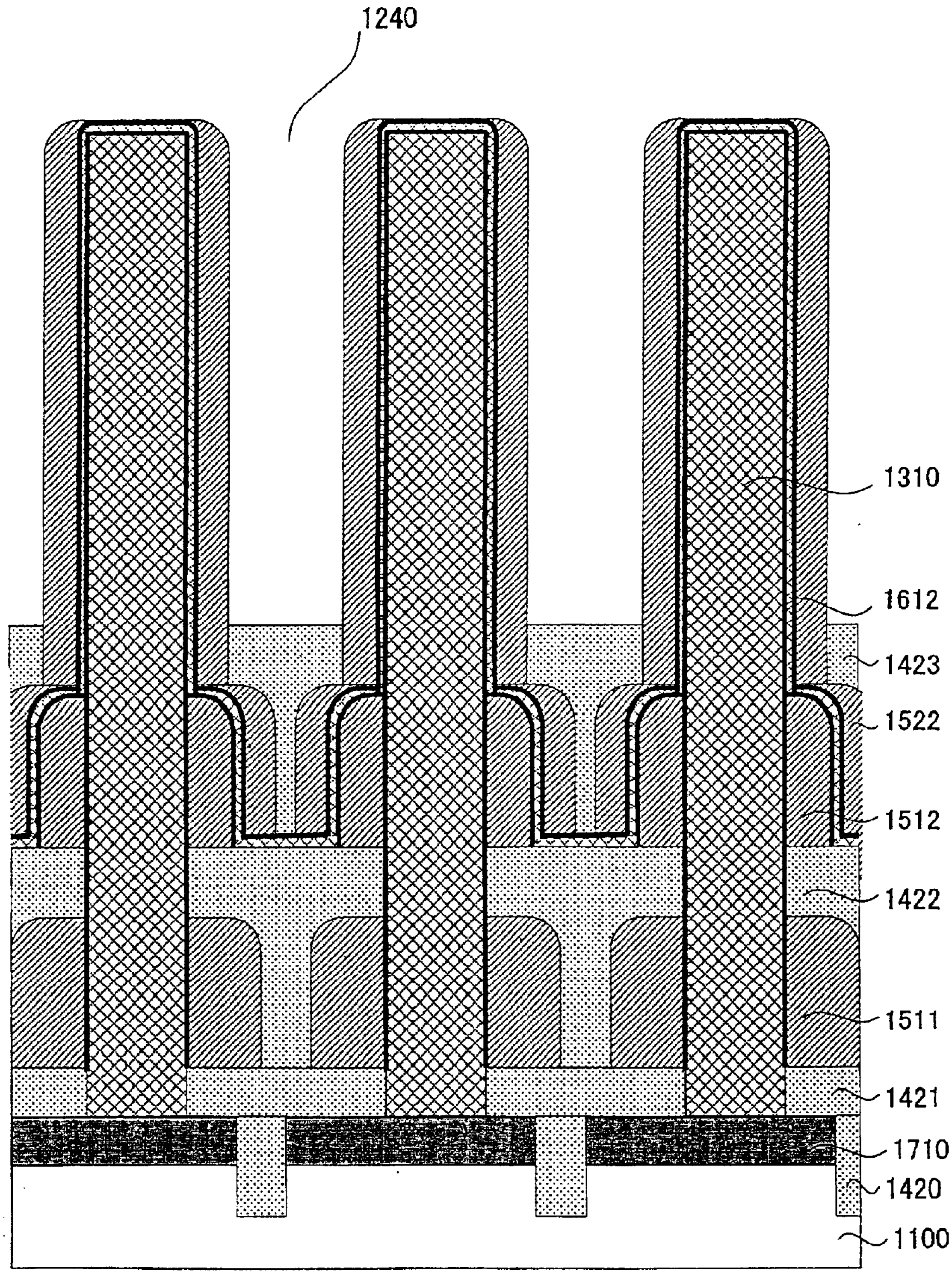

Fig. 1479
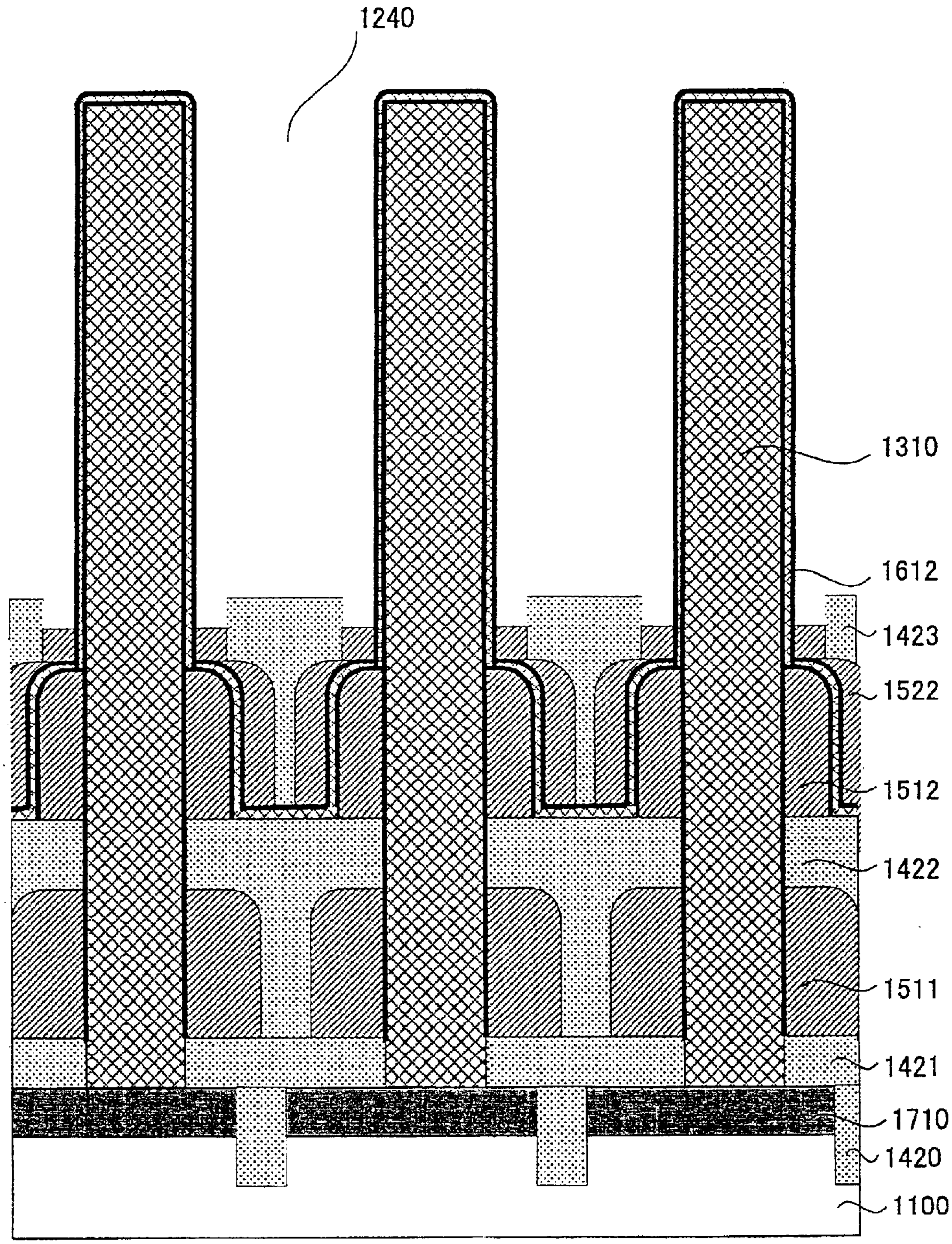

Fig. 1480
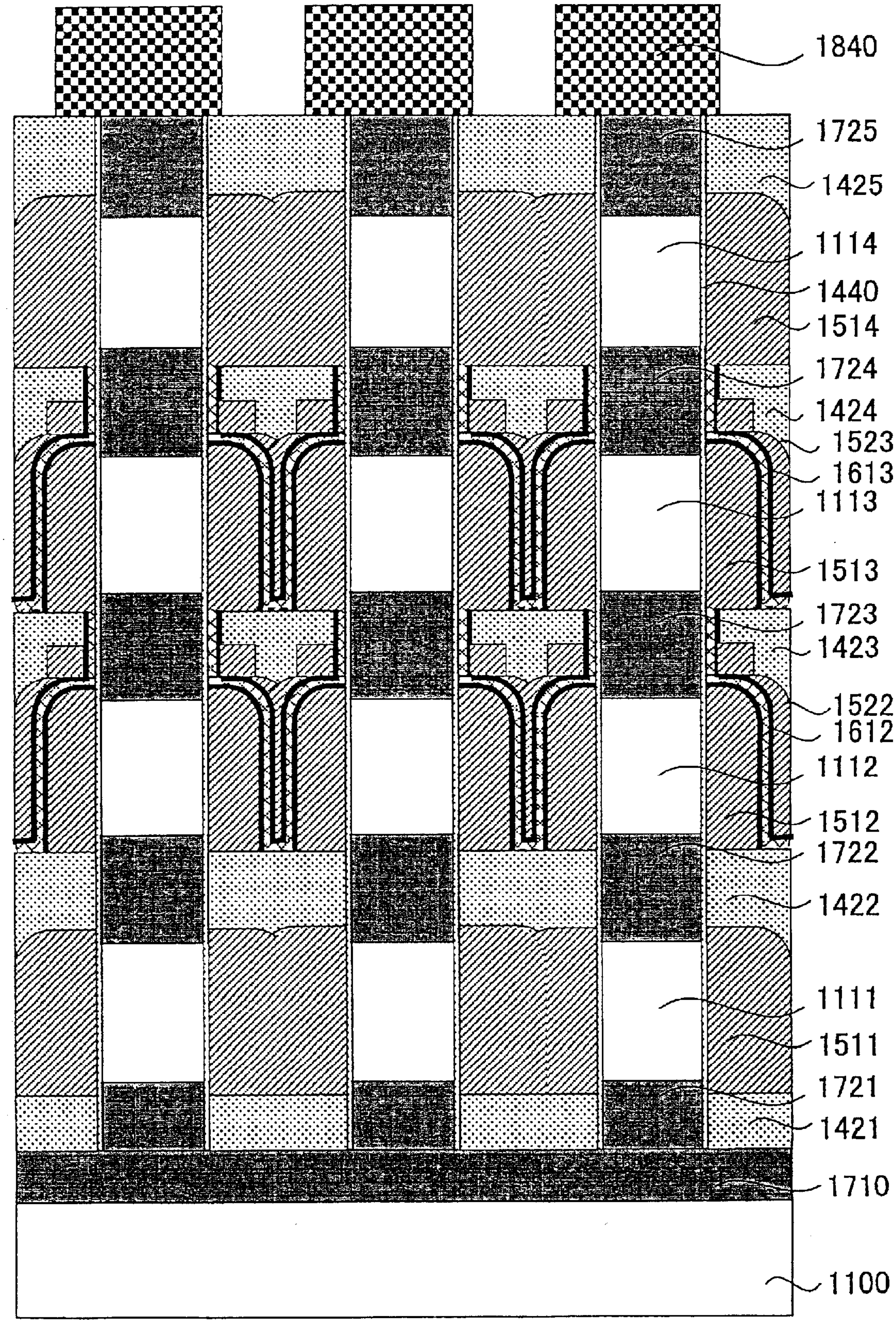

Fig. 1481
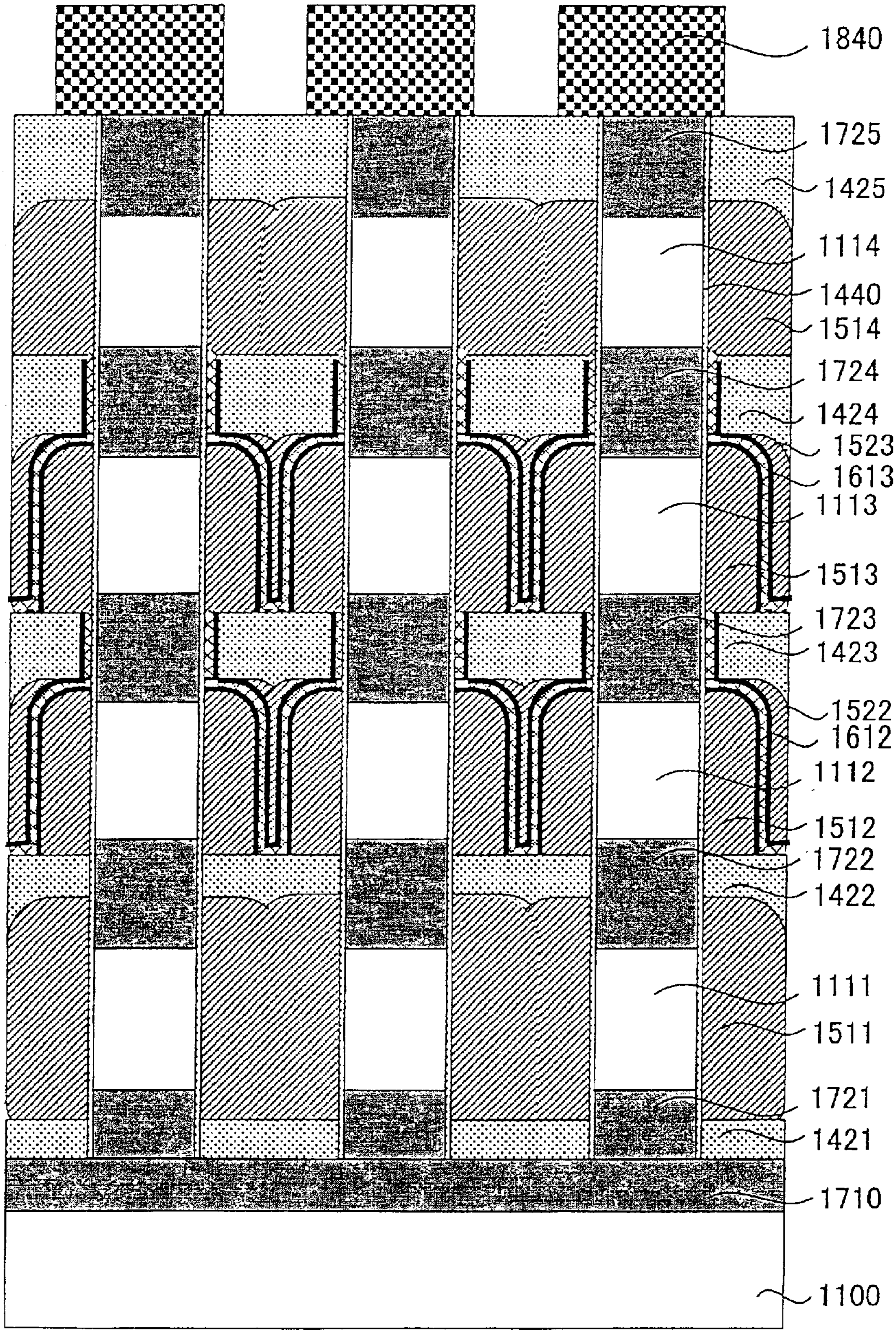

Fig. 1482
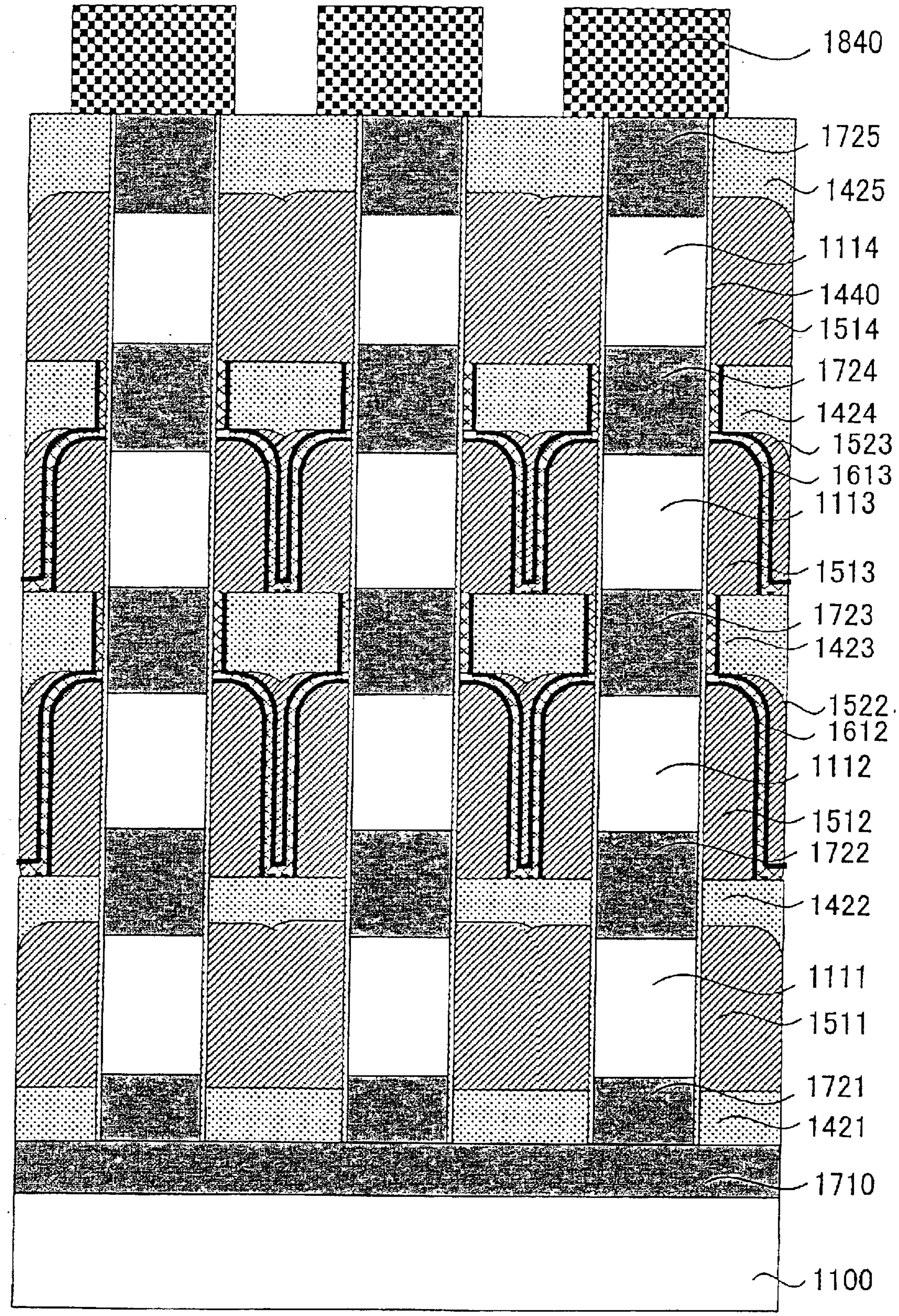

Fig. 1483
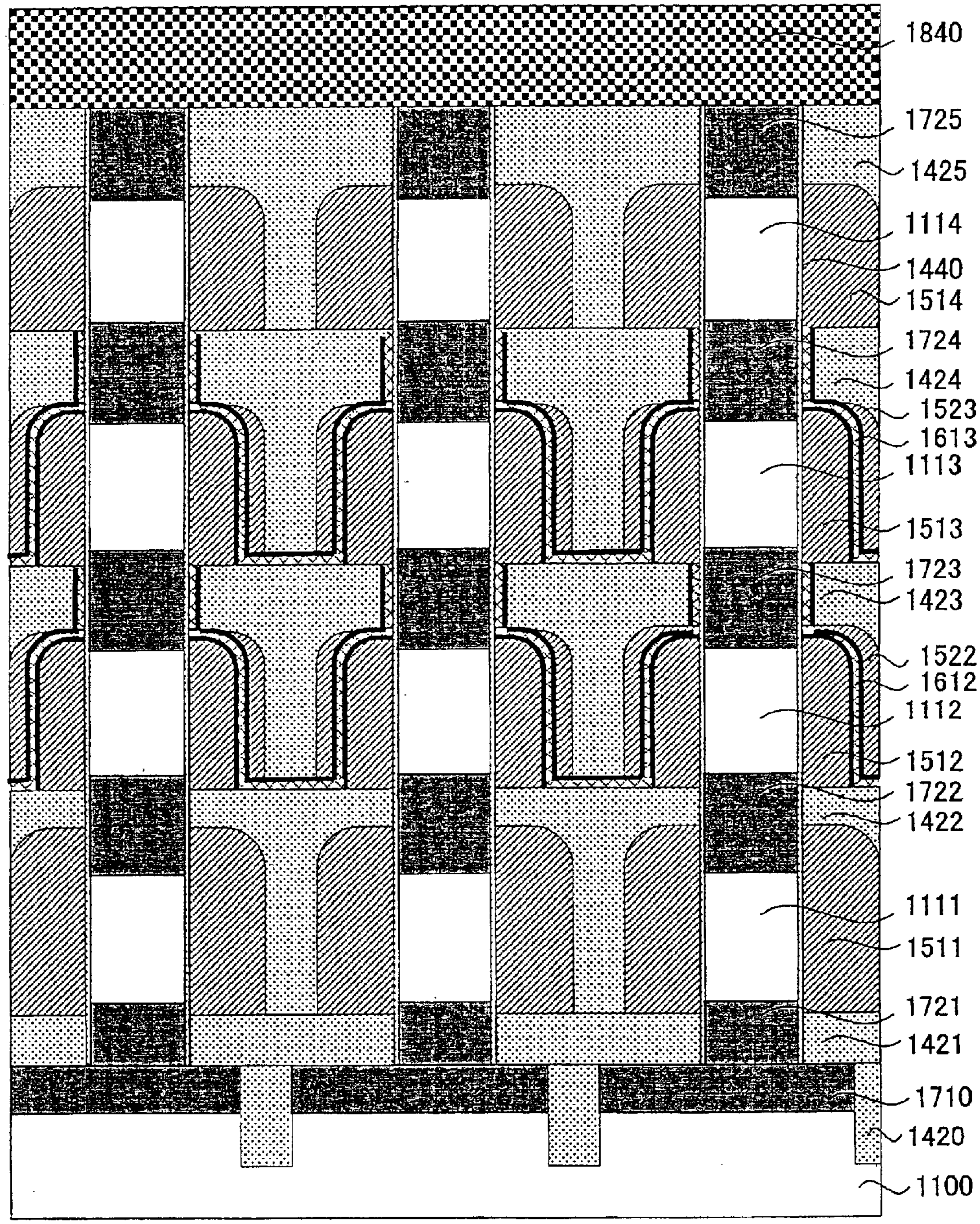

Fig. 1484
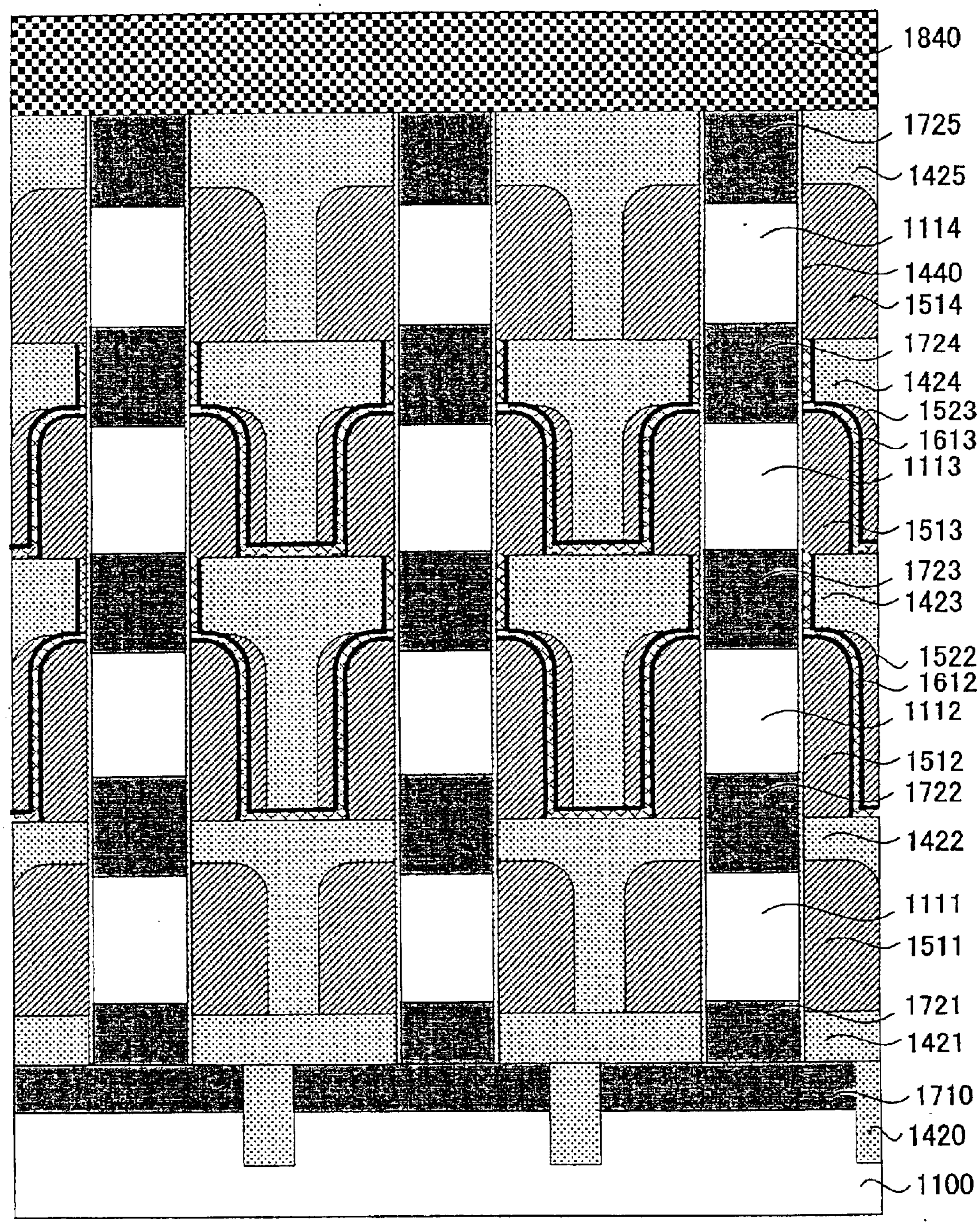

Fig. 1485
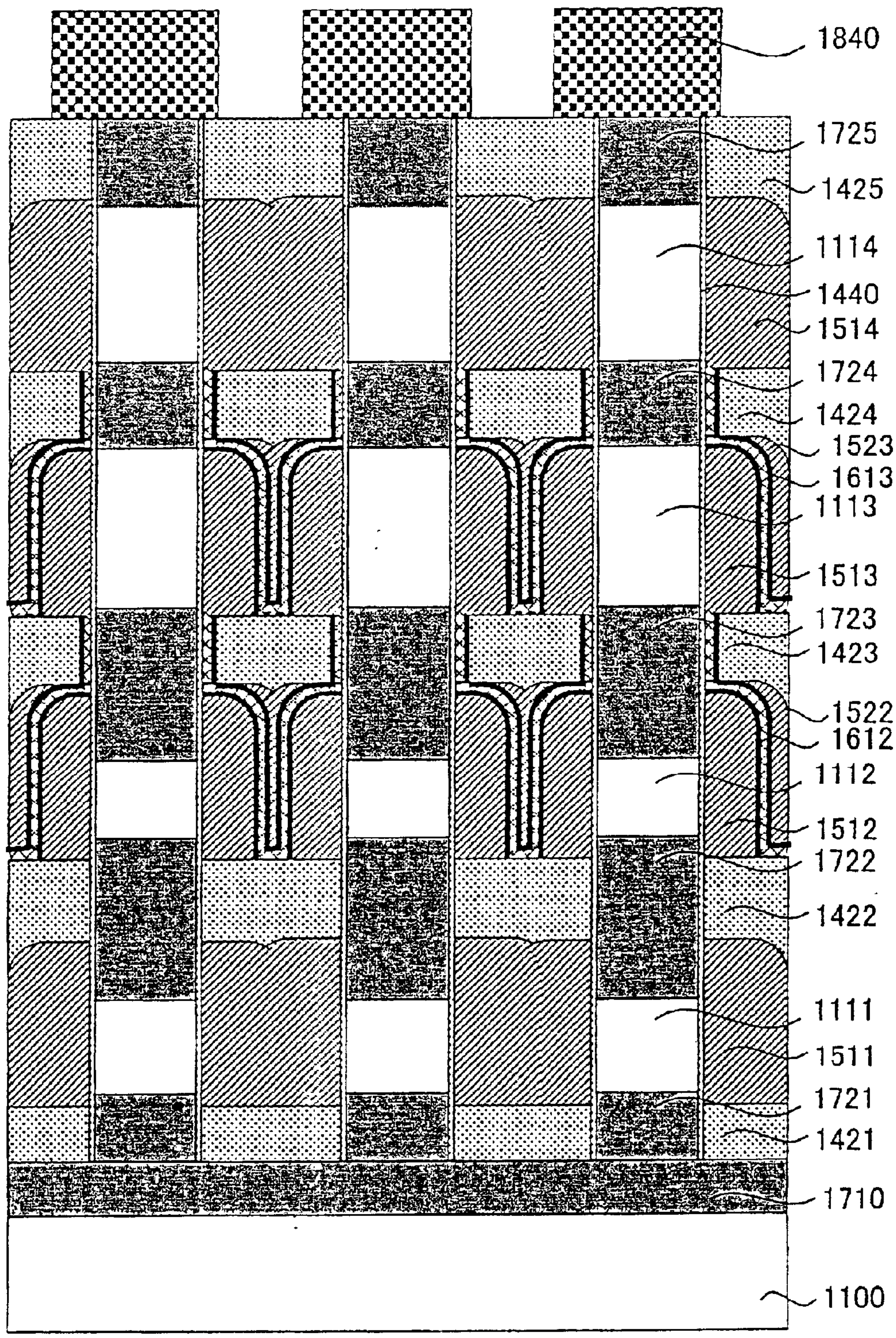

Fig. 1486
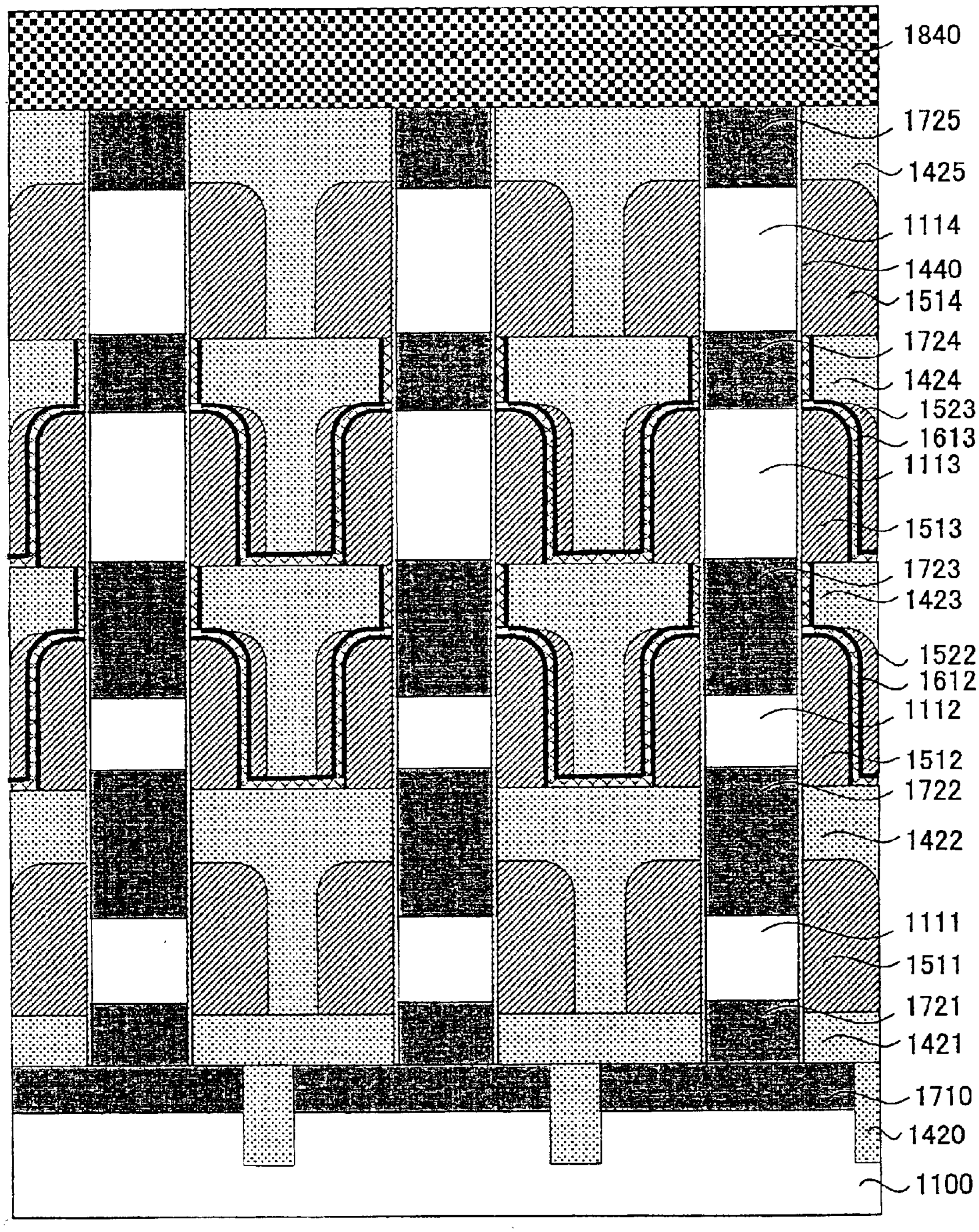

Fig. 1487
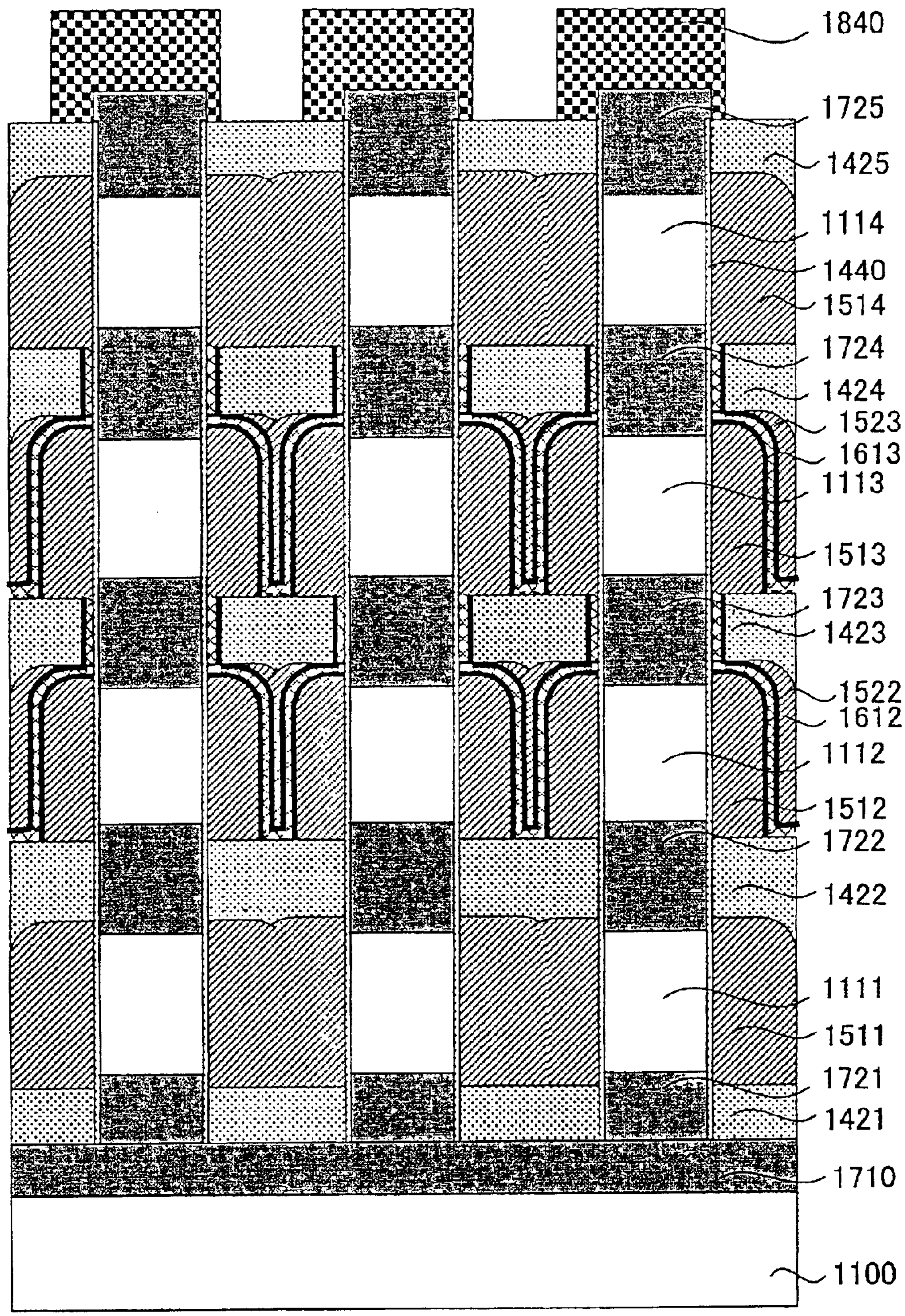

Fig. 1488
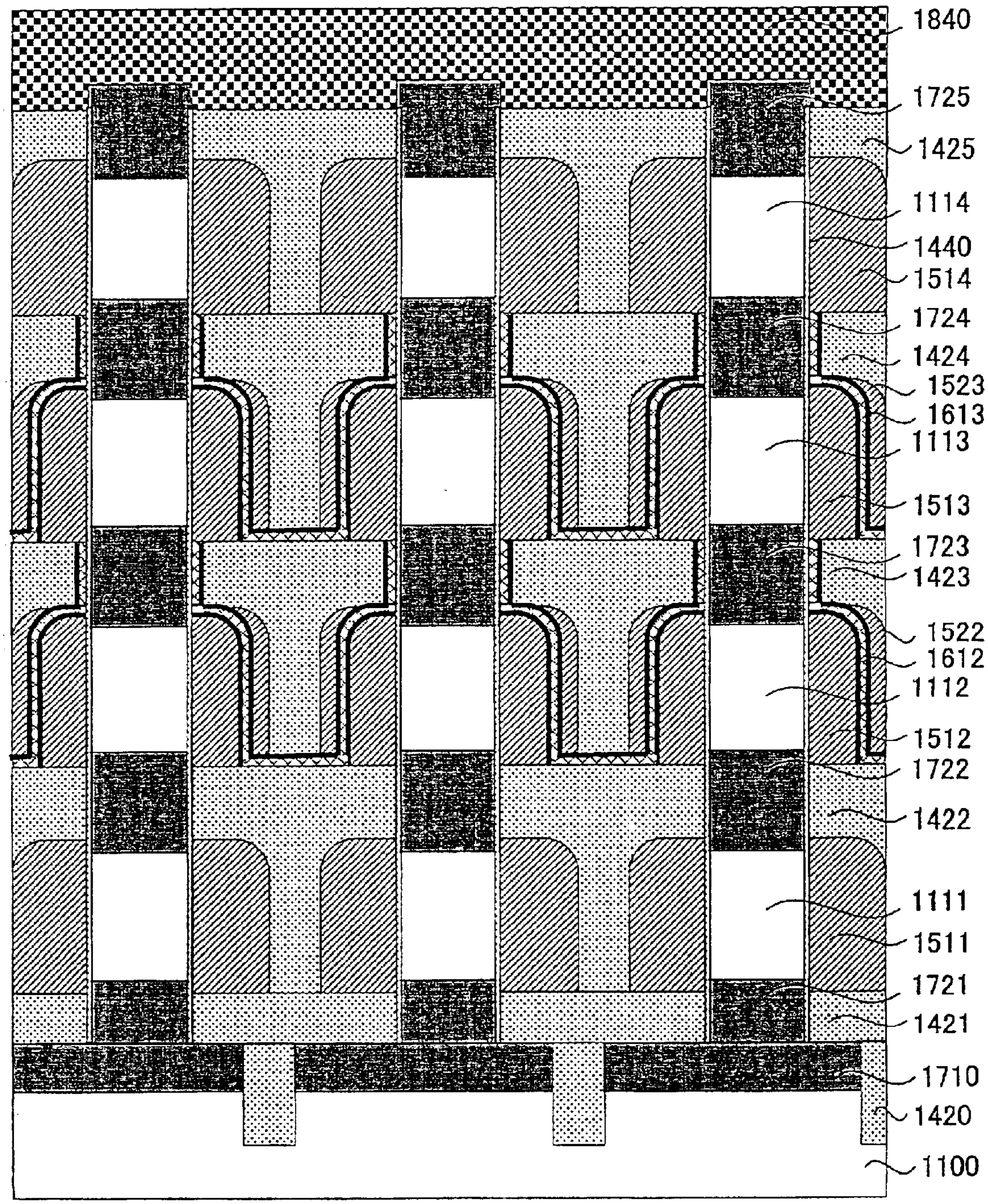

Fig. 1489
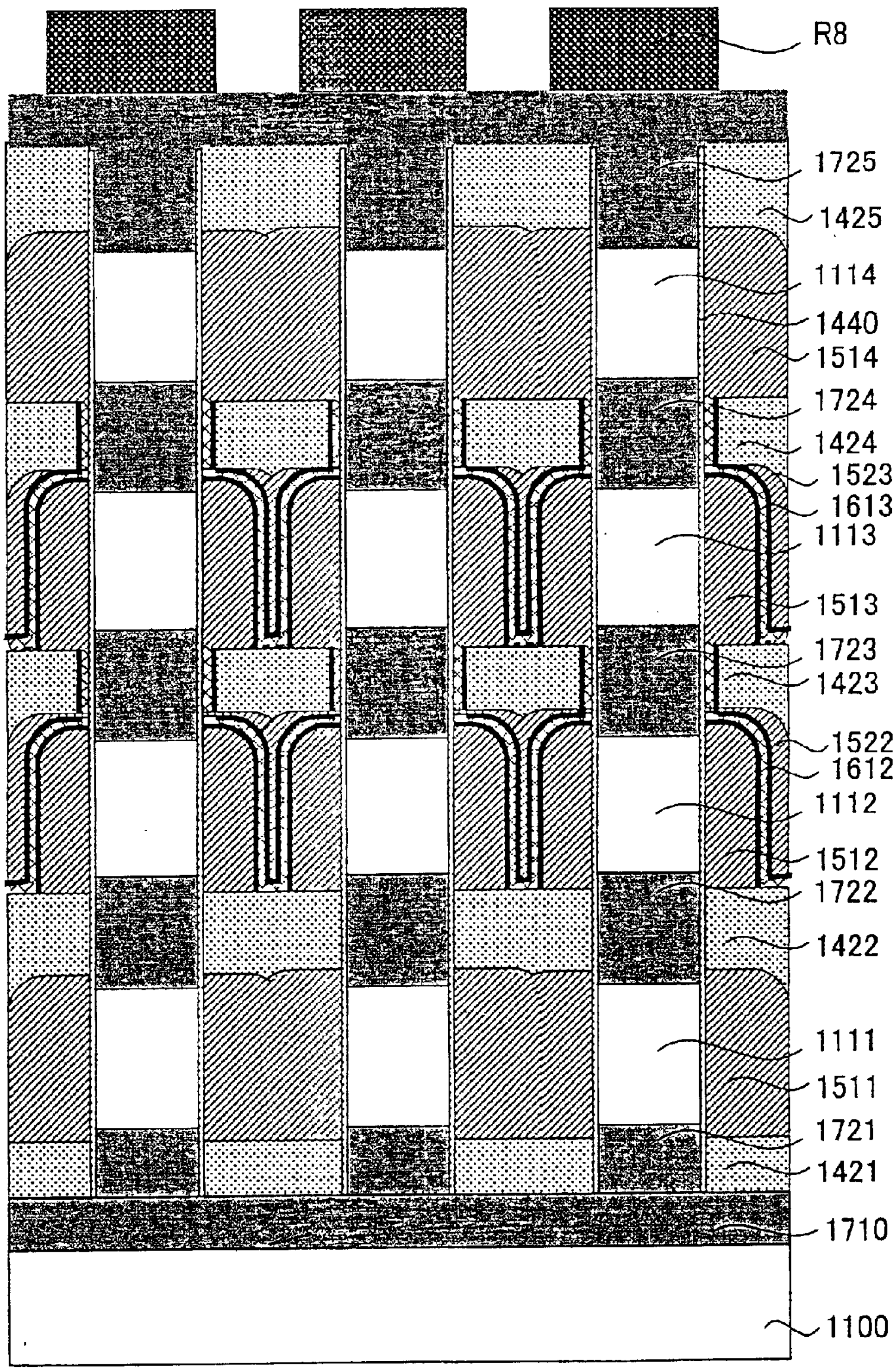

Fig. 1490
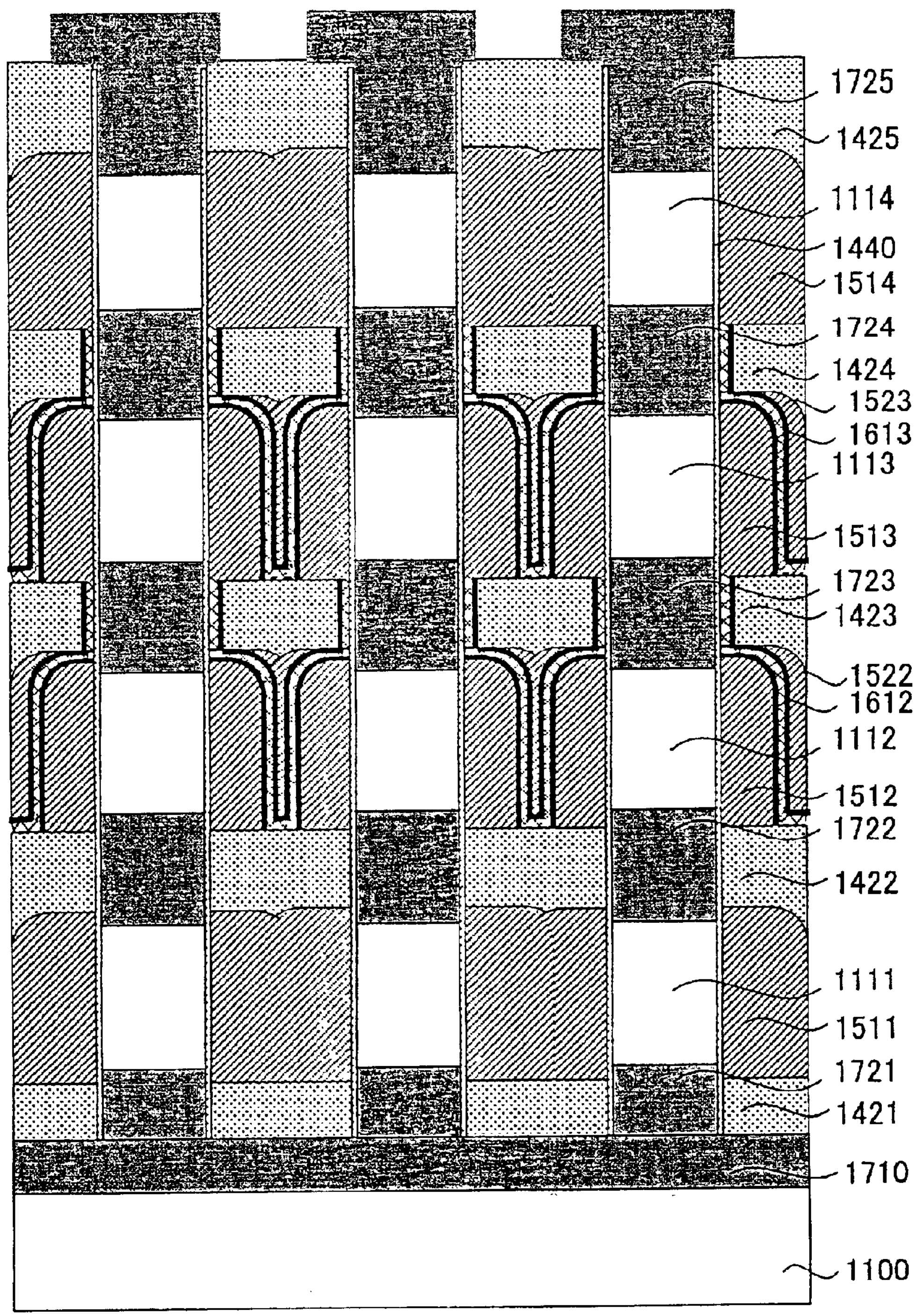

Fig. 1491
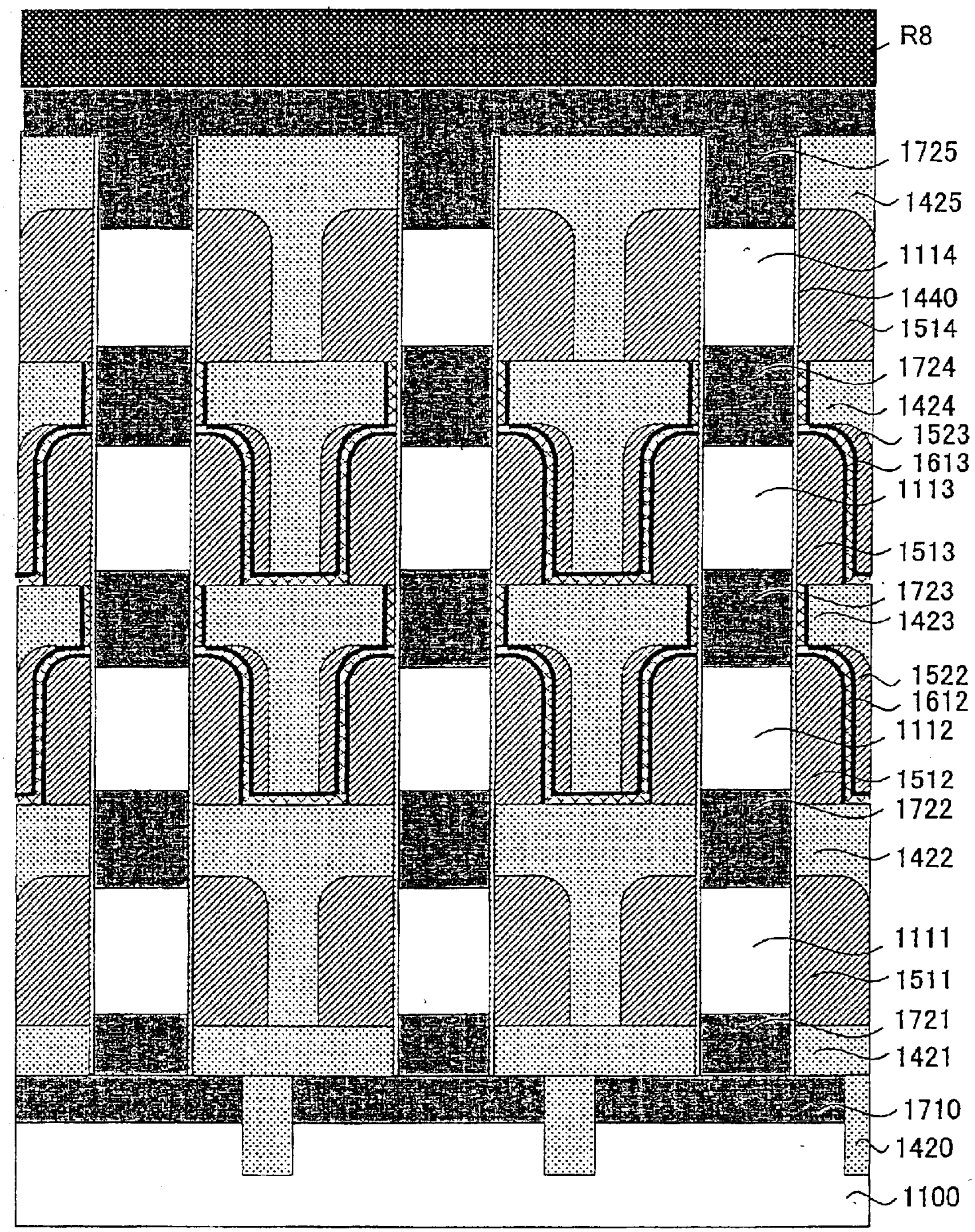

Fig. 1492
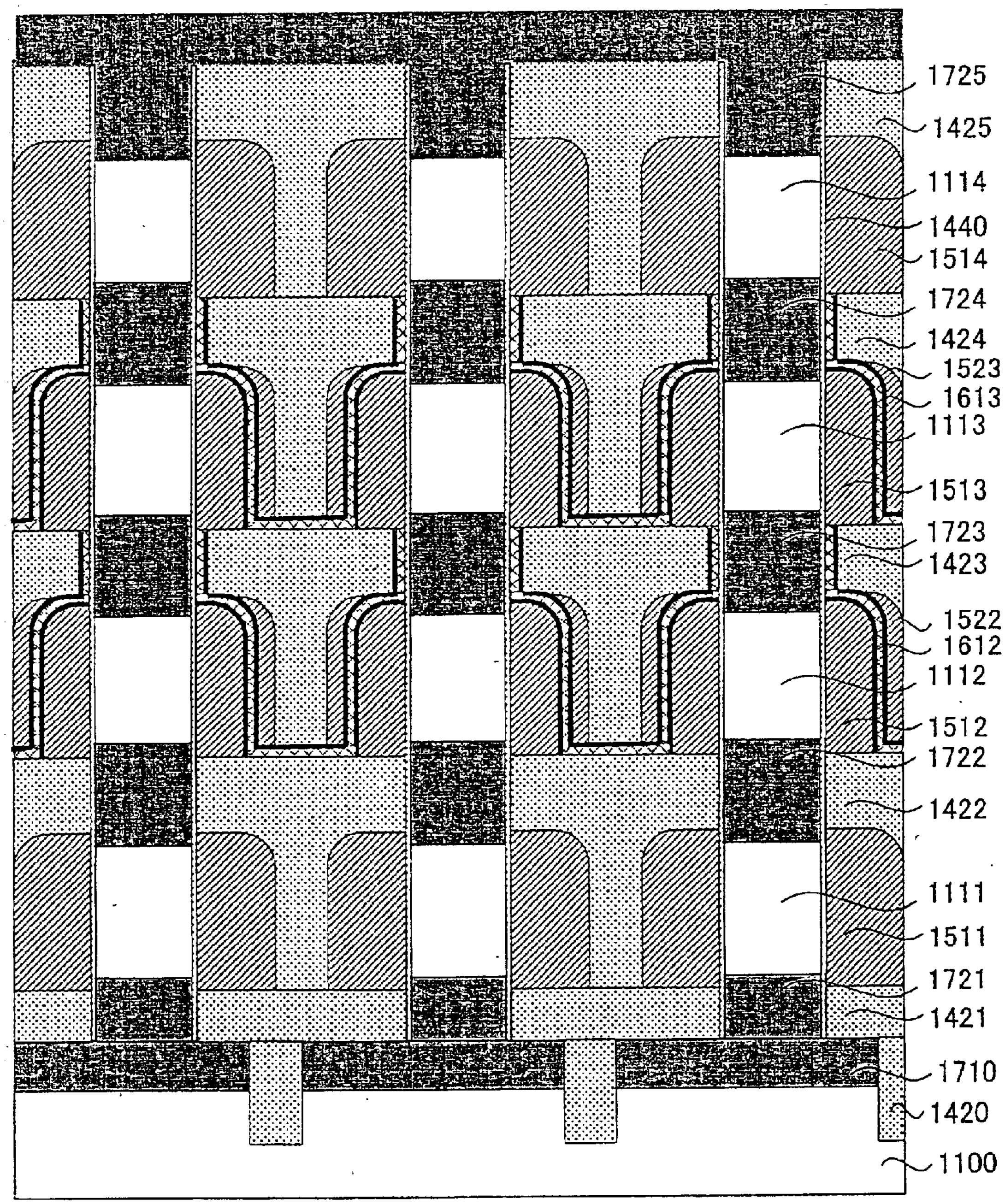

Fig. 1493
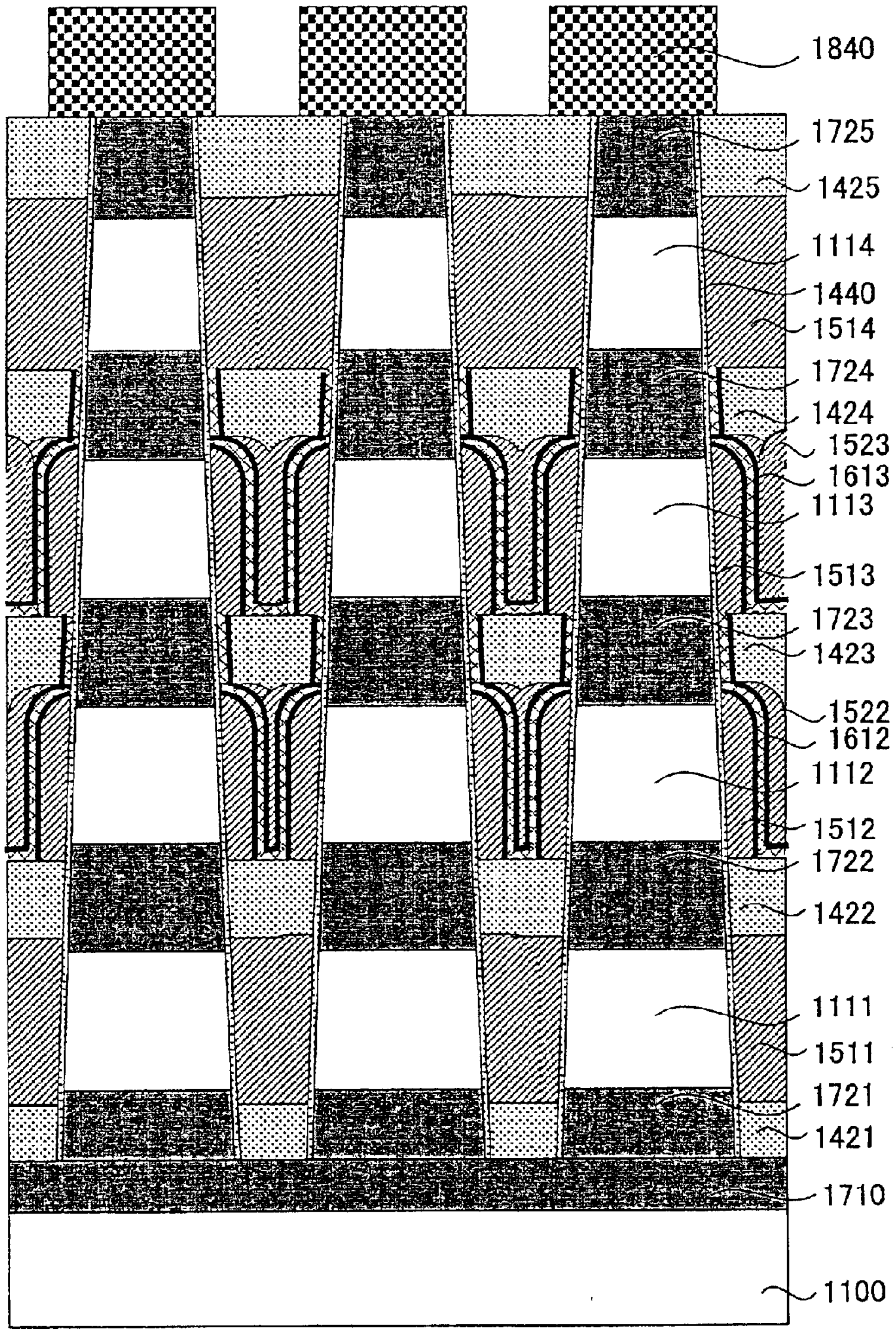

Fig. 1494
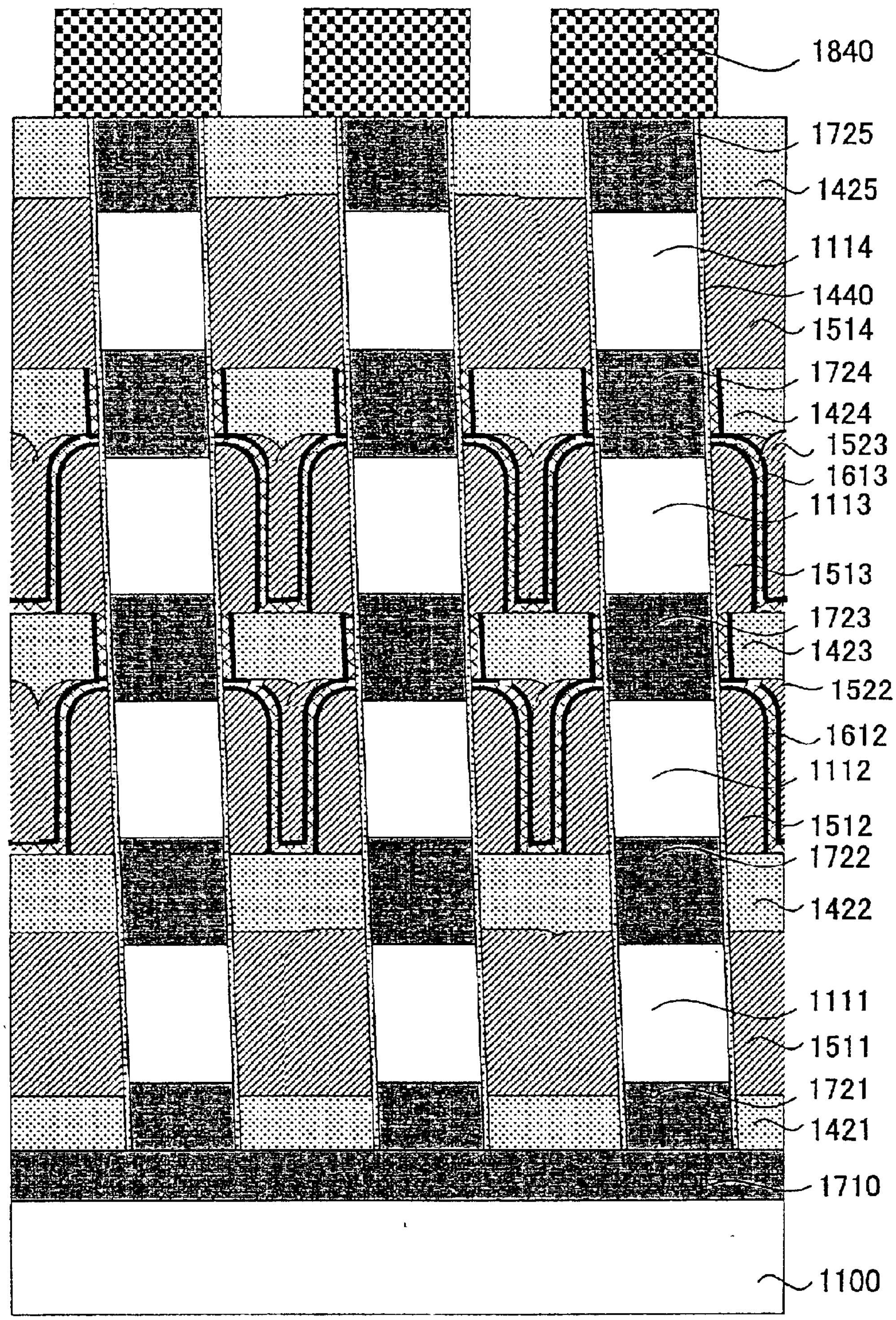

Fig. 1495
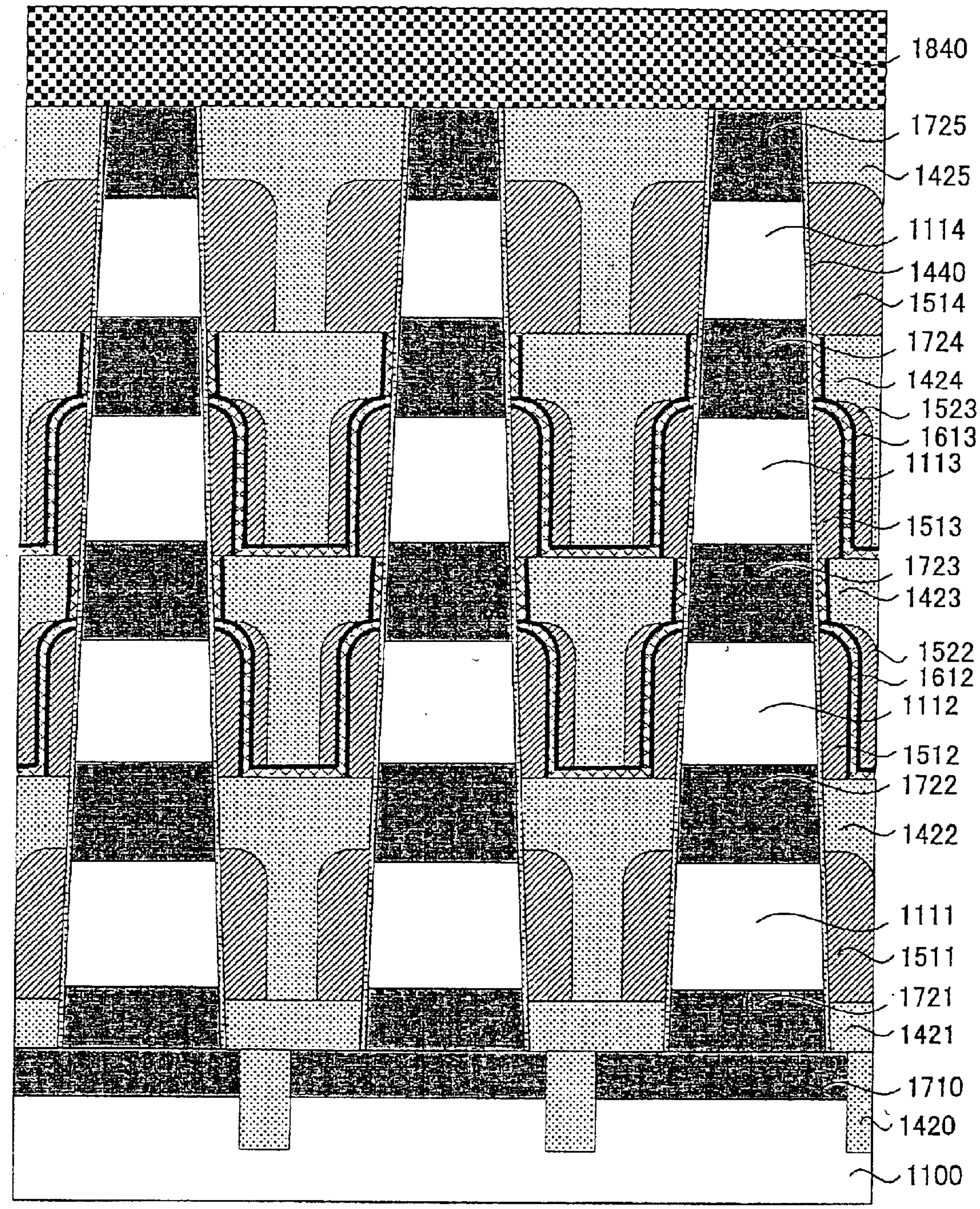

Fig. 1496
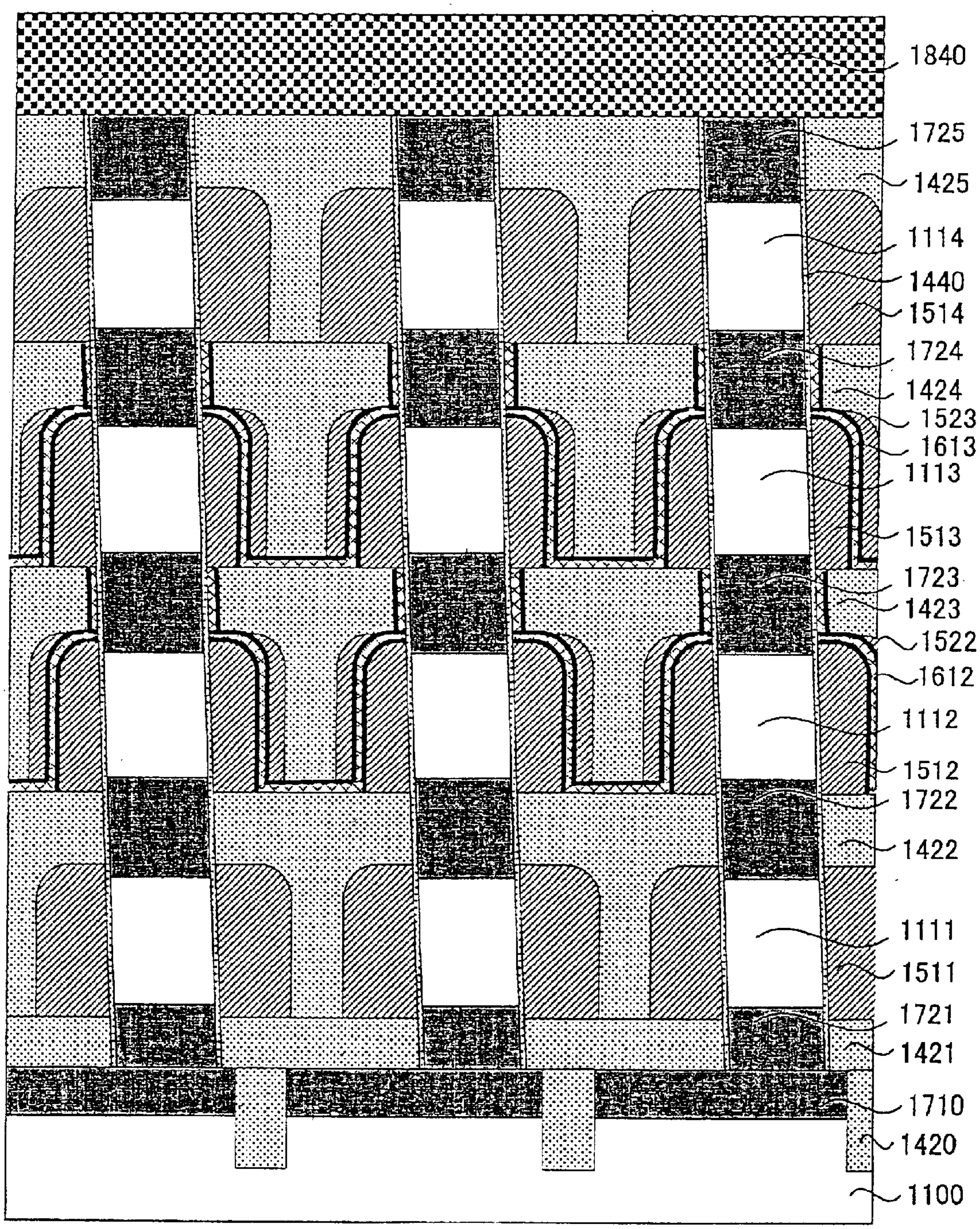

Fig. 1497
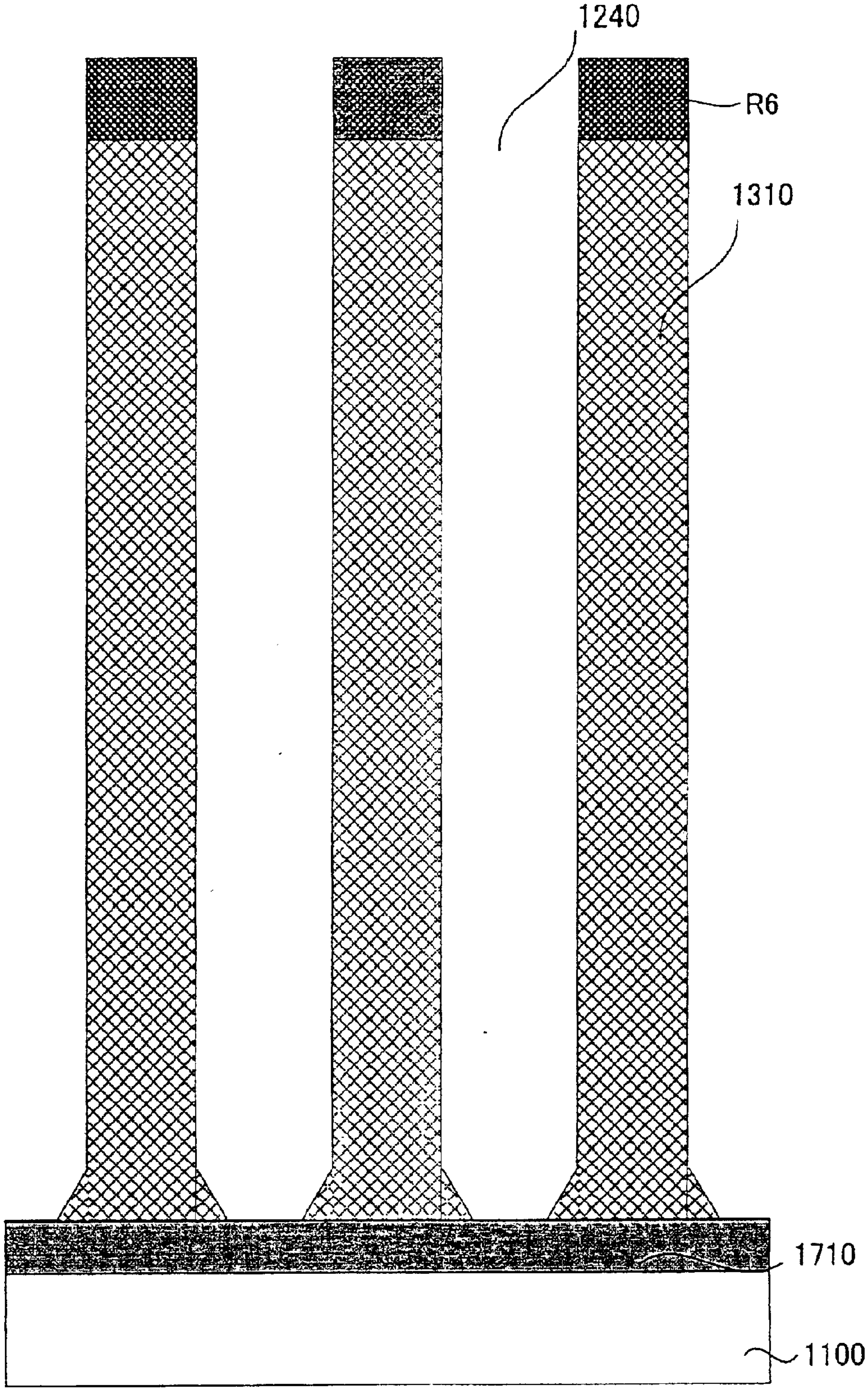

Fig. 1498
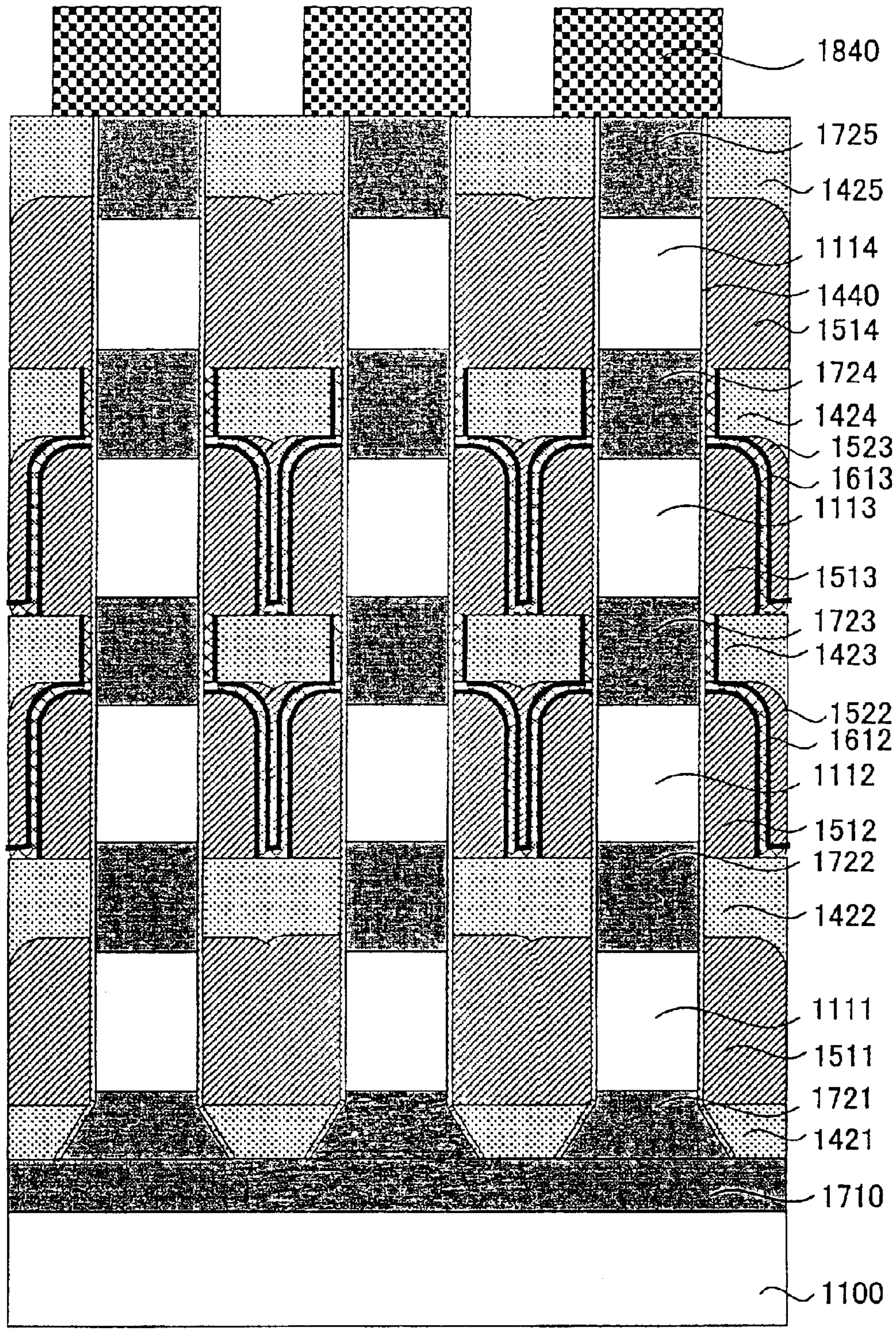

Fig. 1499
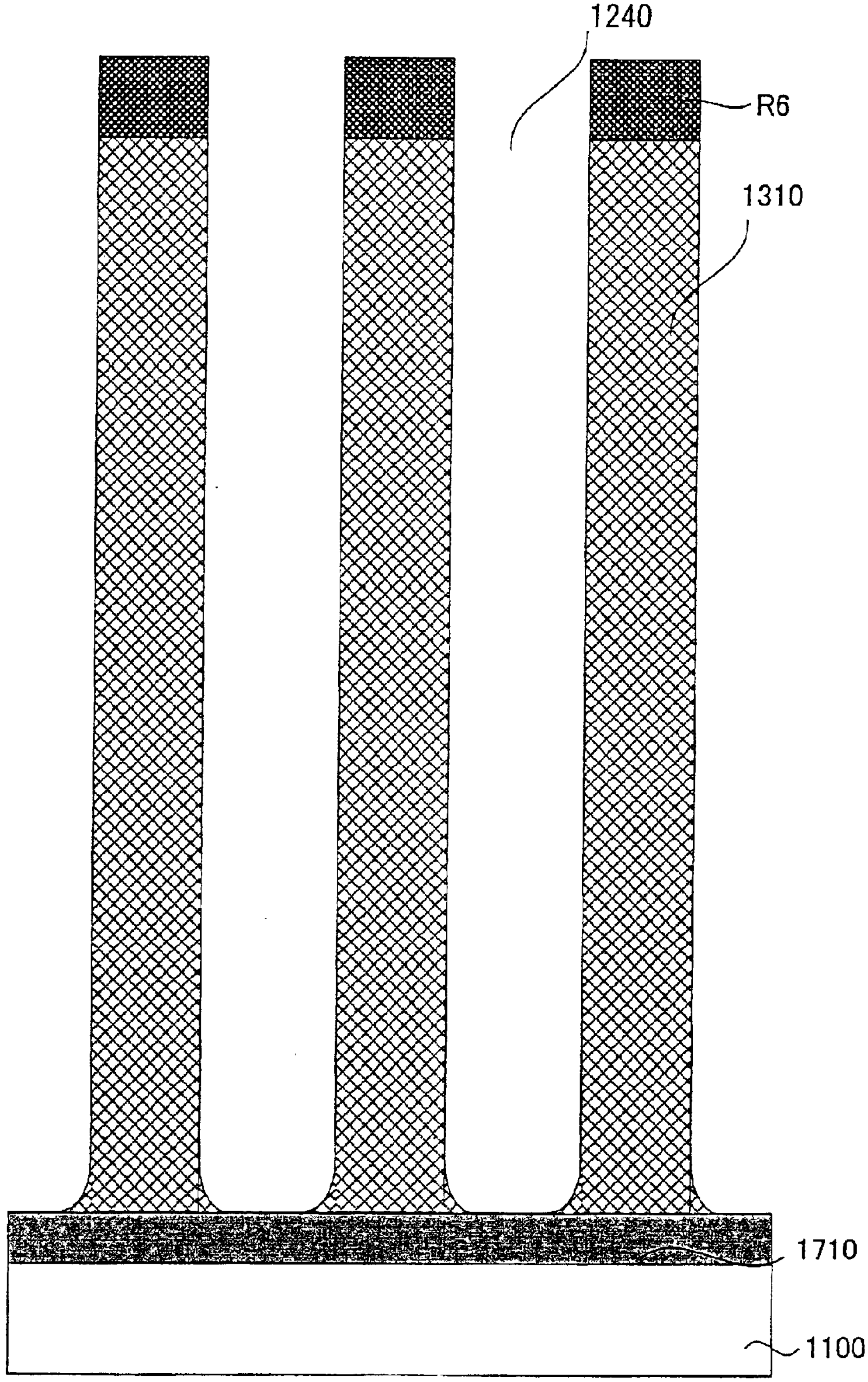

Fig. 1500
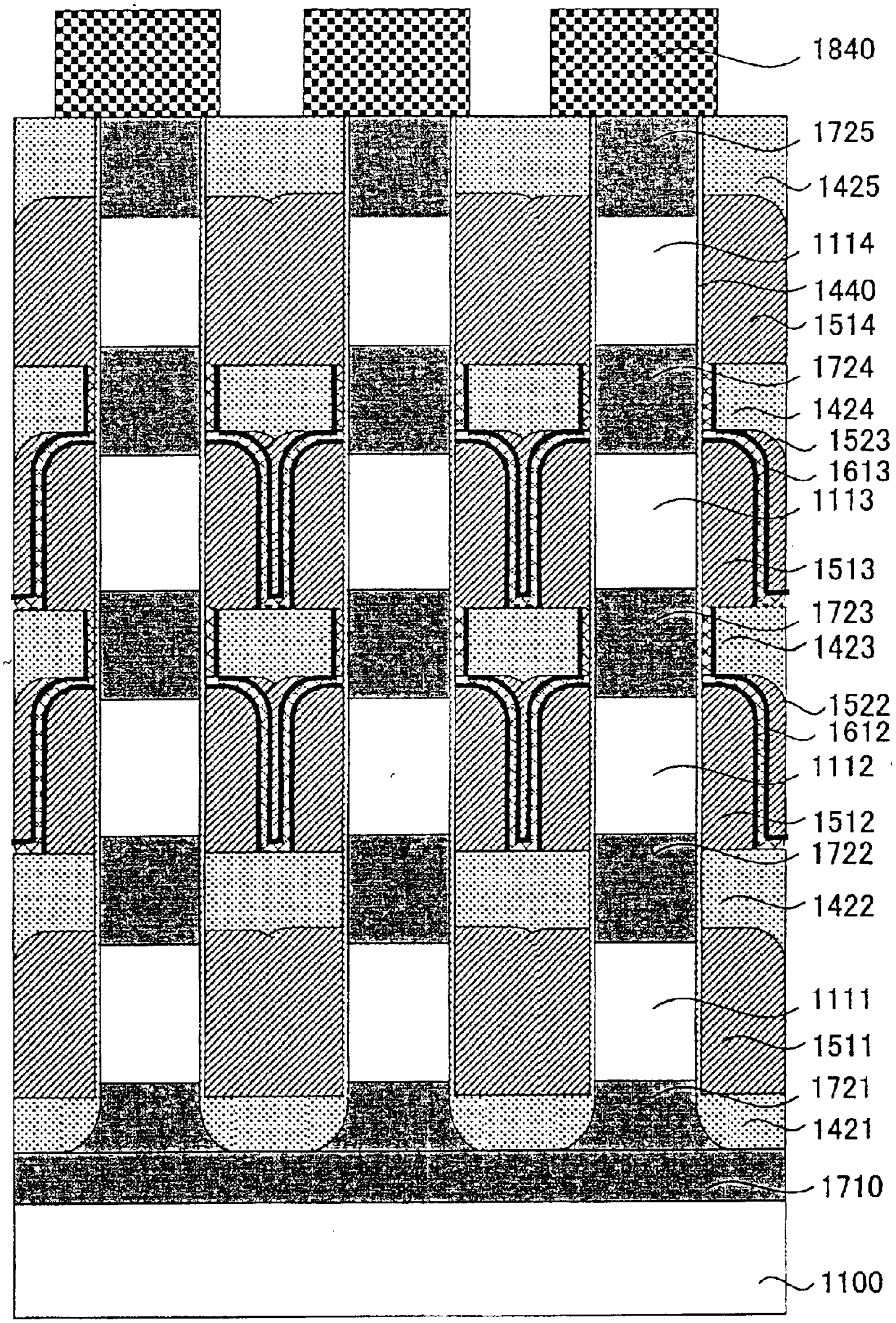

Fig. 1501
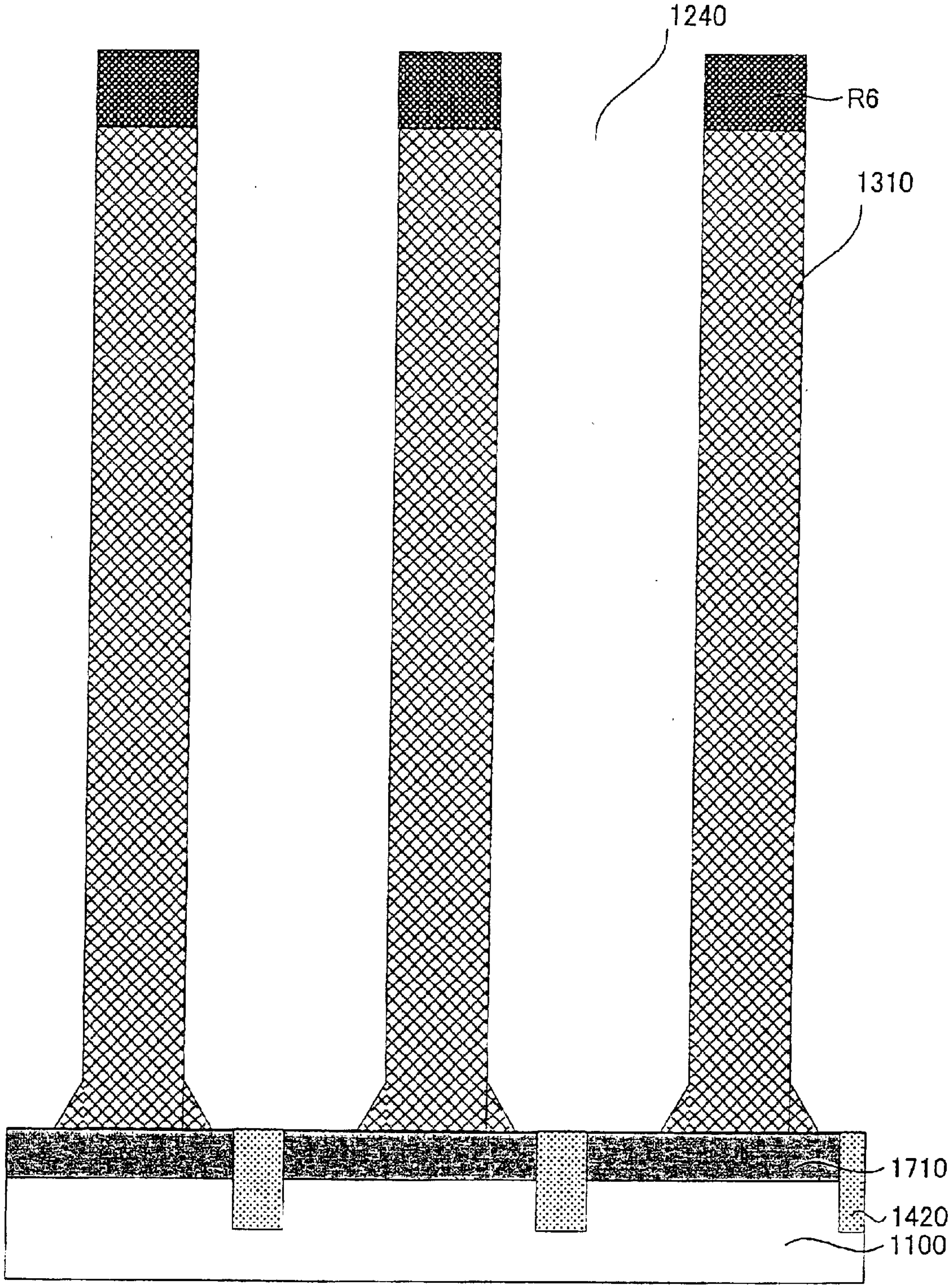

Fig. 1502
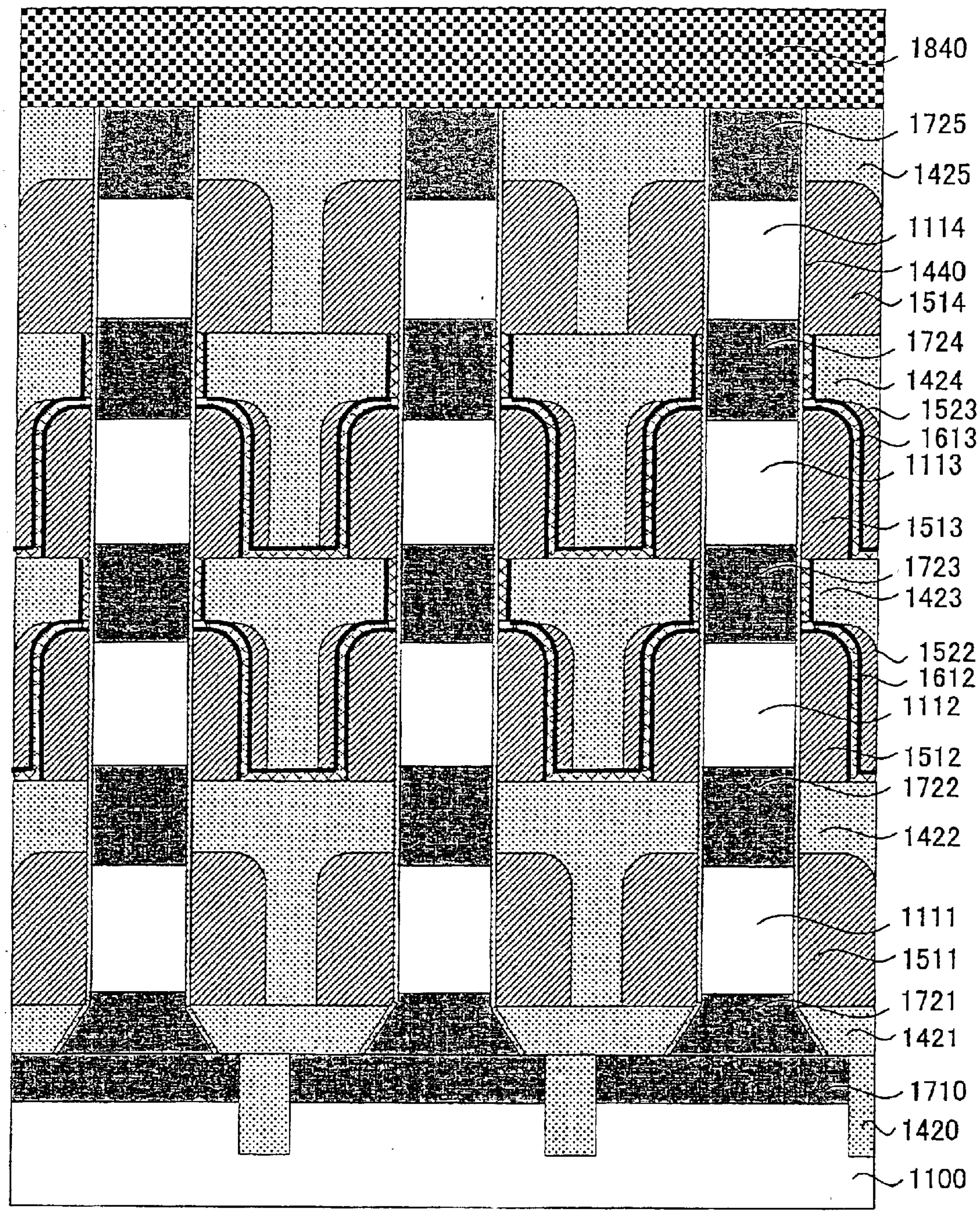

Fig. 1503
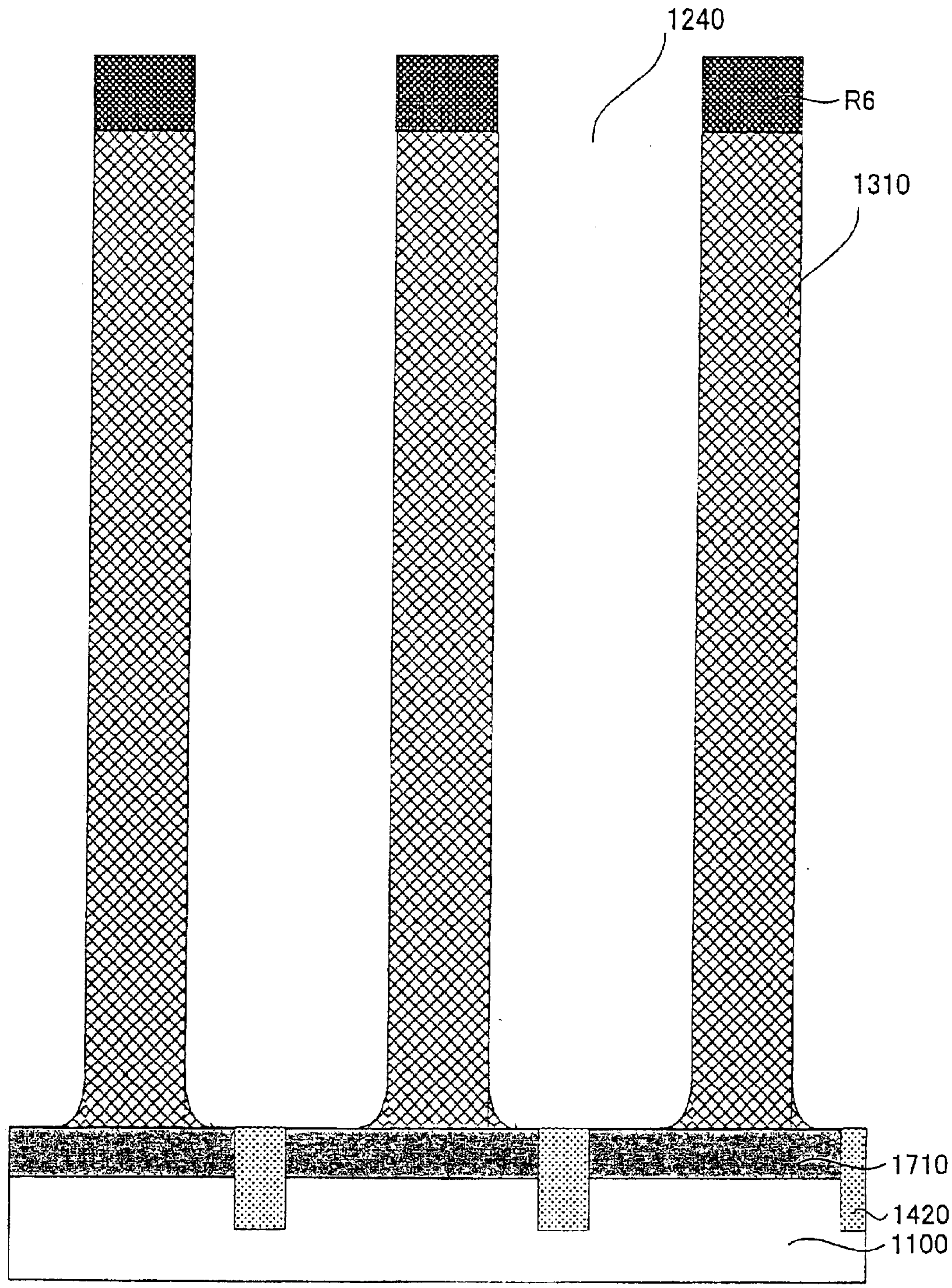

Fig. 1504
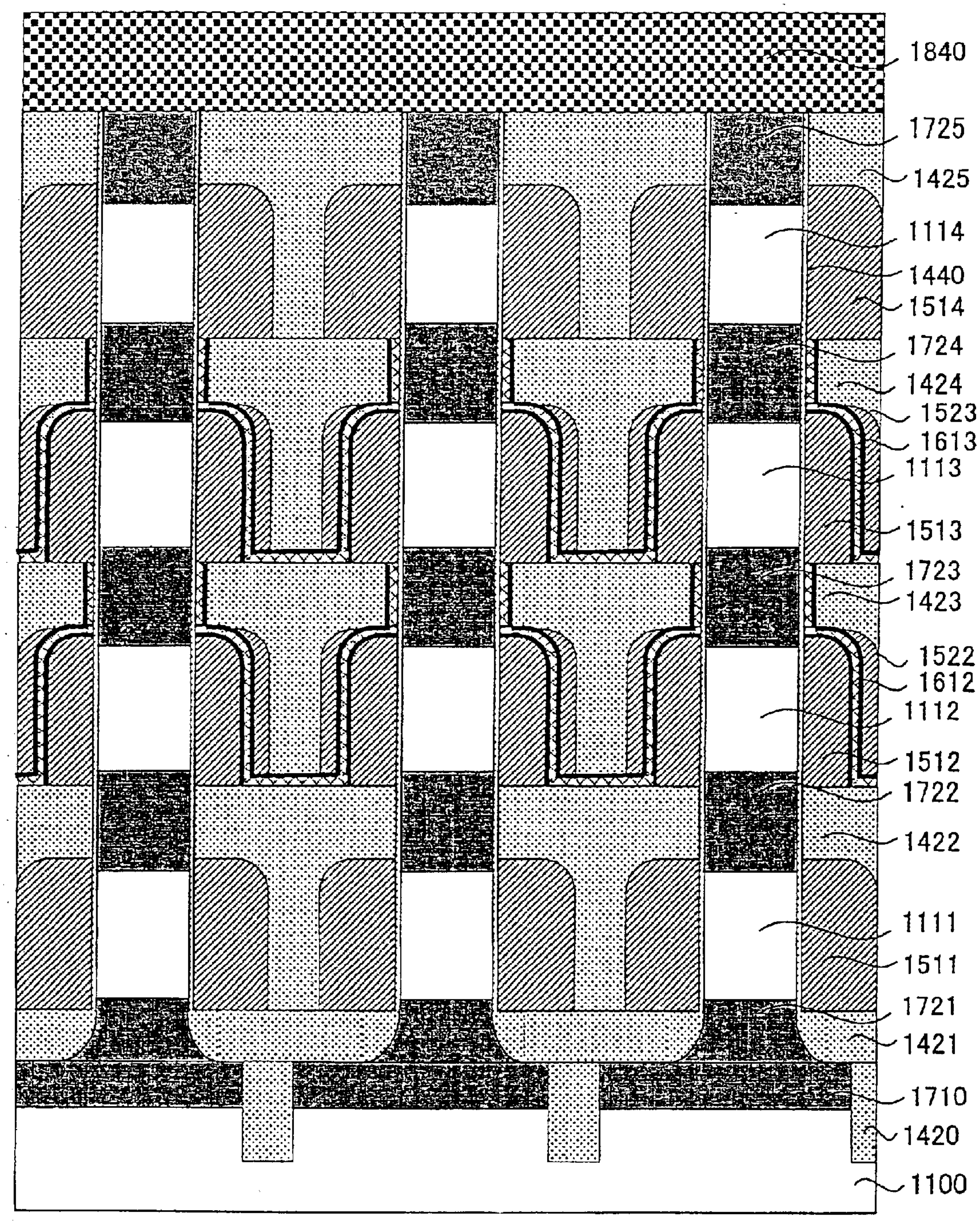

Fig. 1505
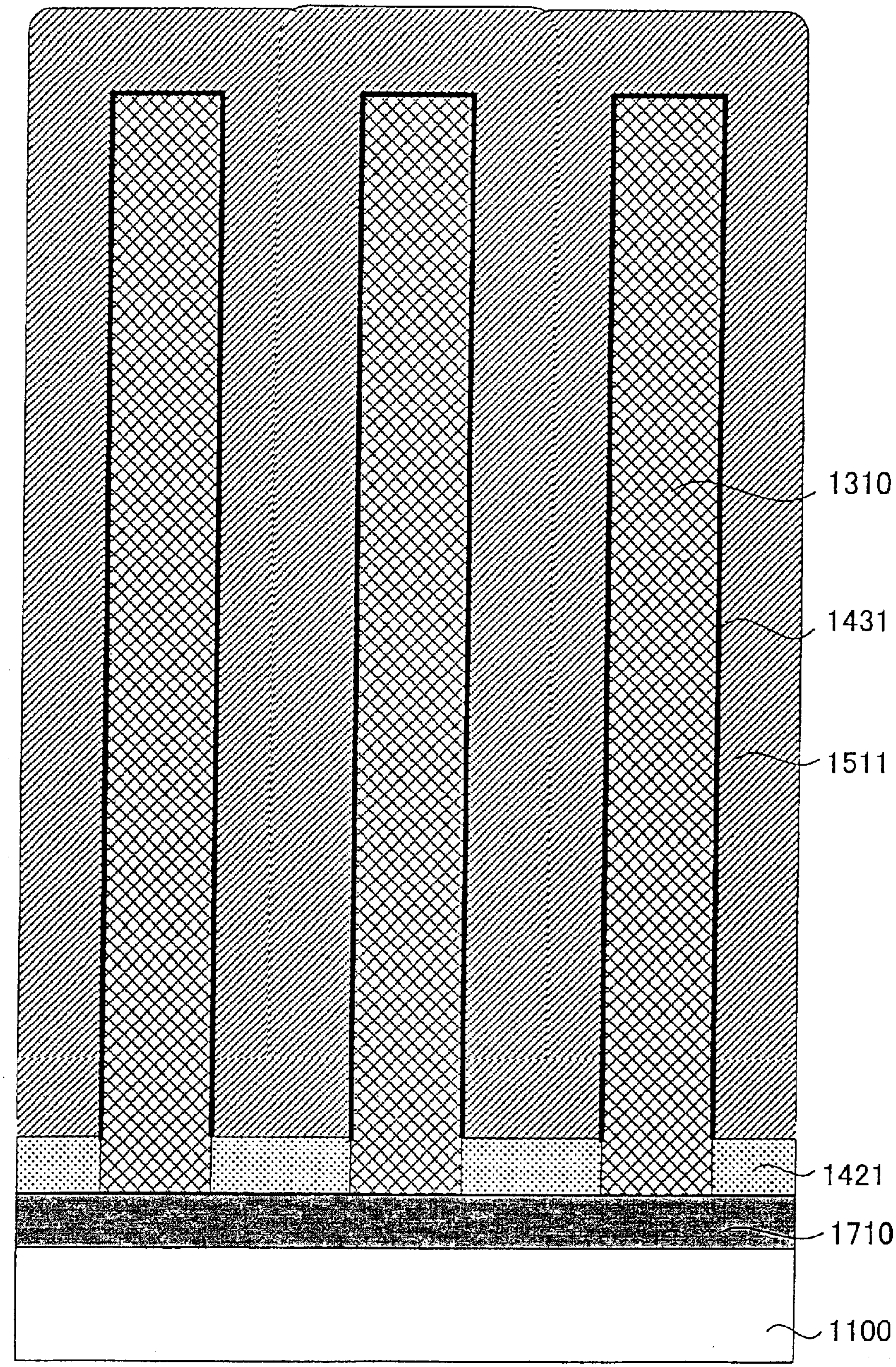

Fig. 1506
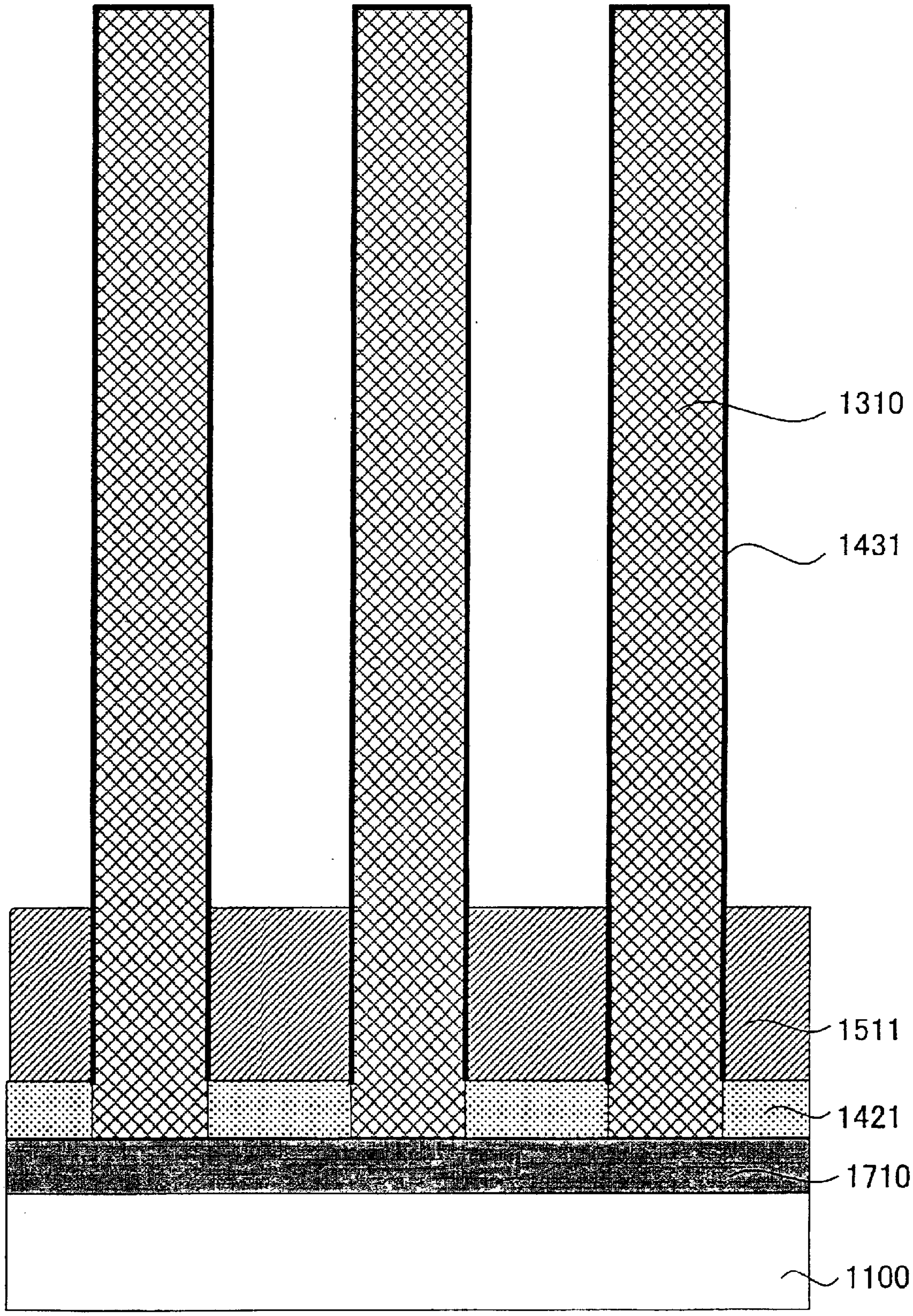

Fig. 1507
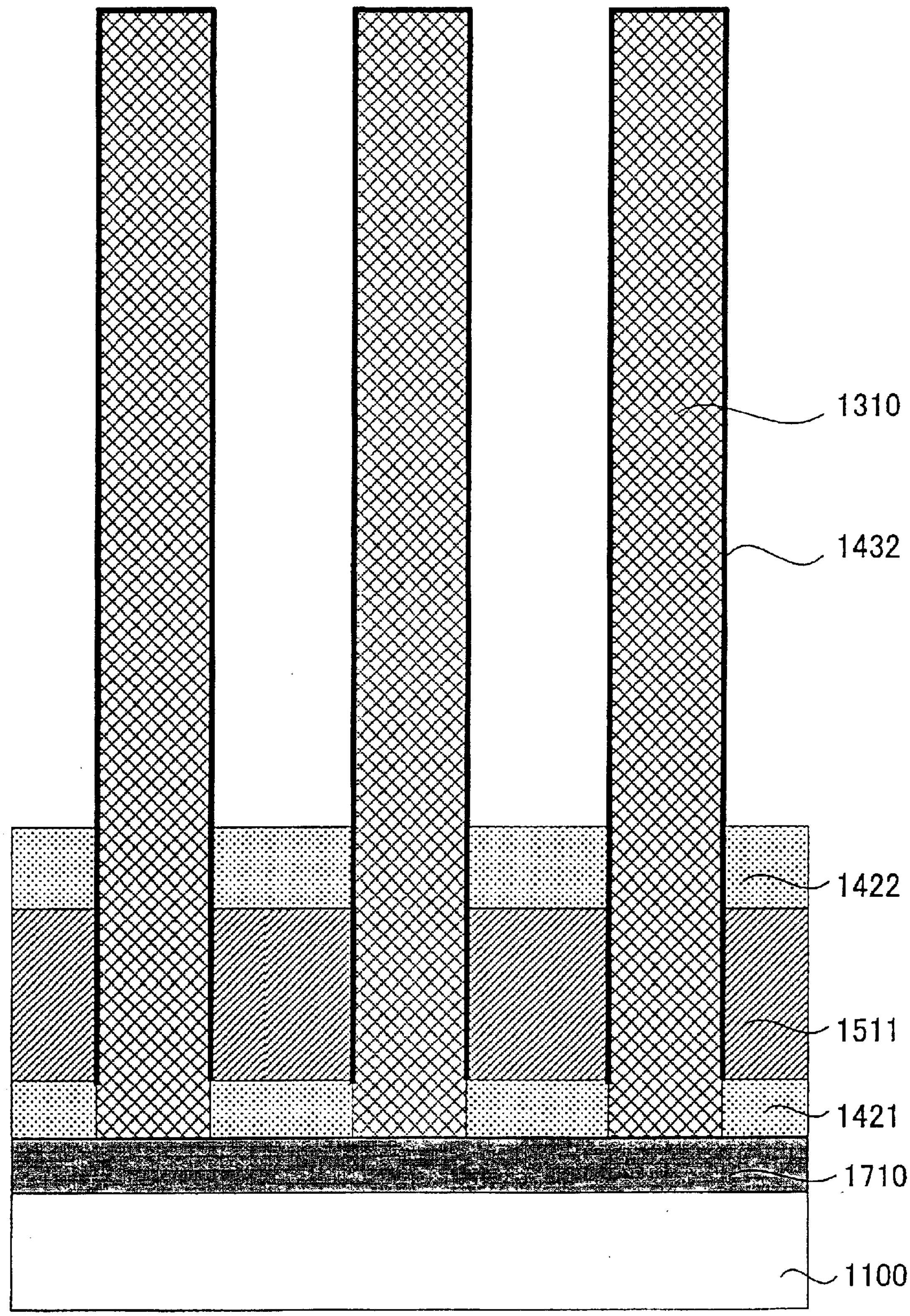

Fig. 1508
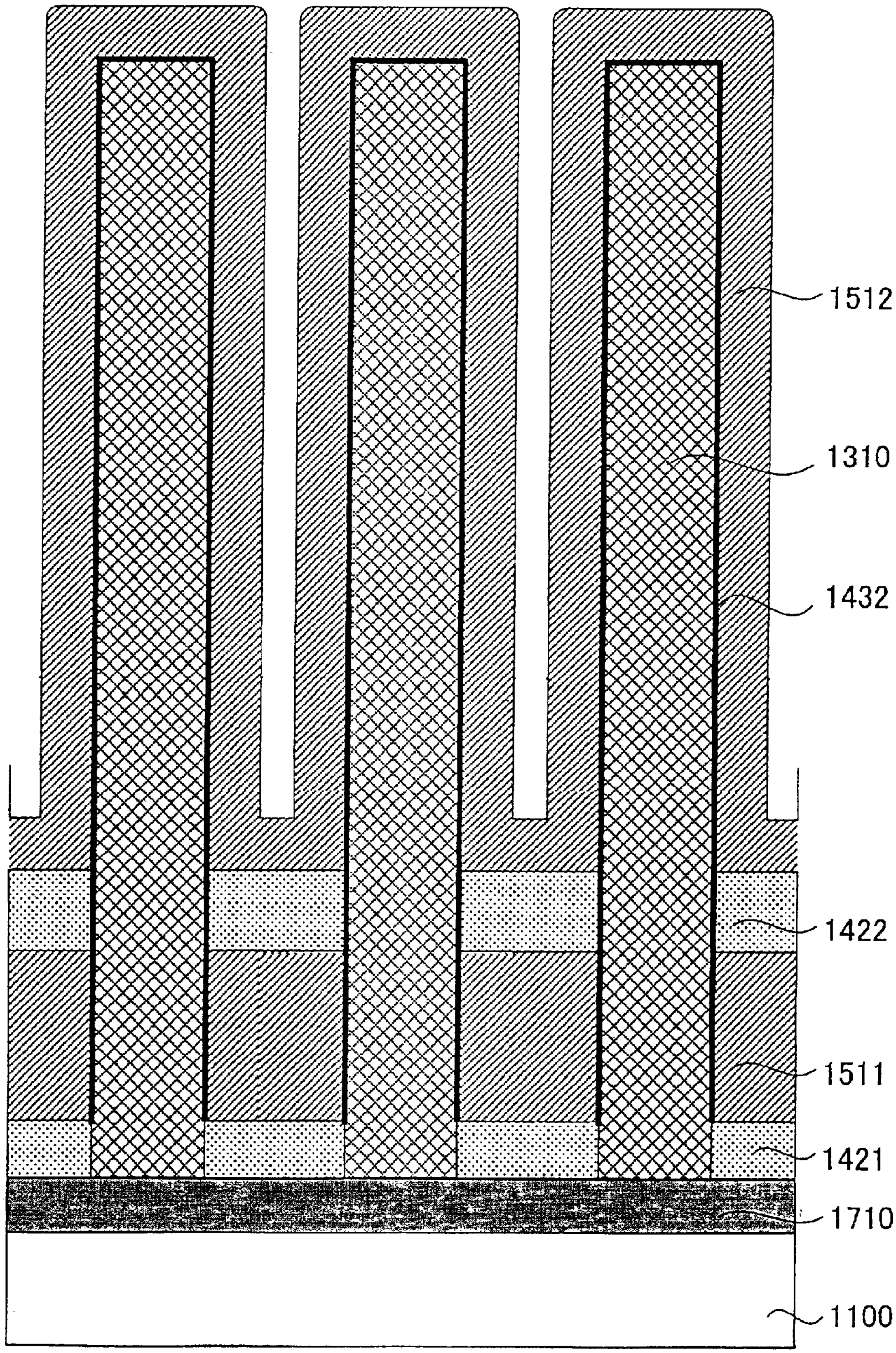

Fig. 1509
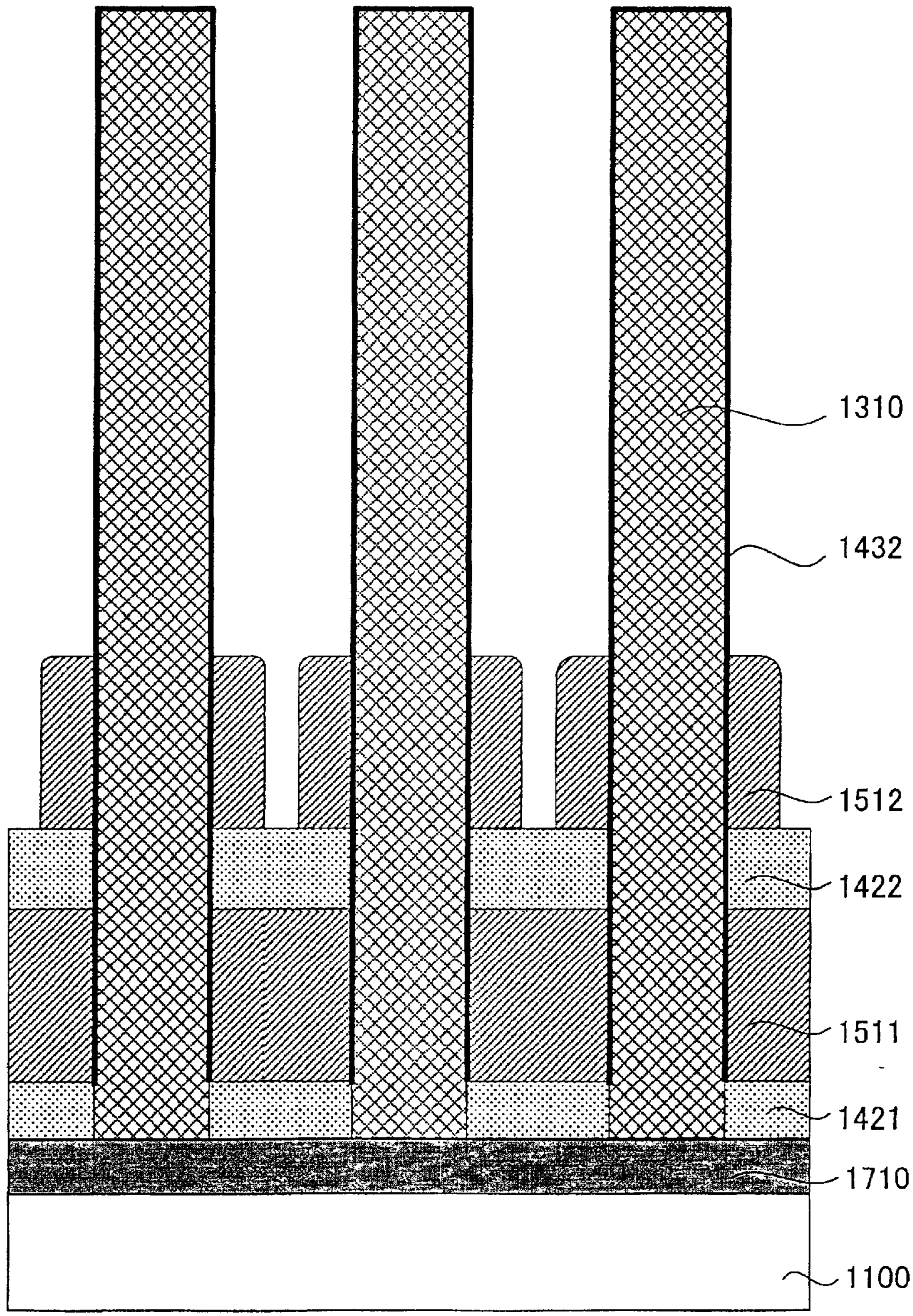

Fig. 1510
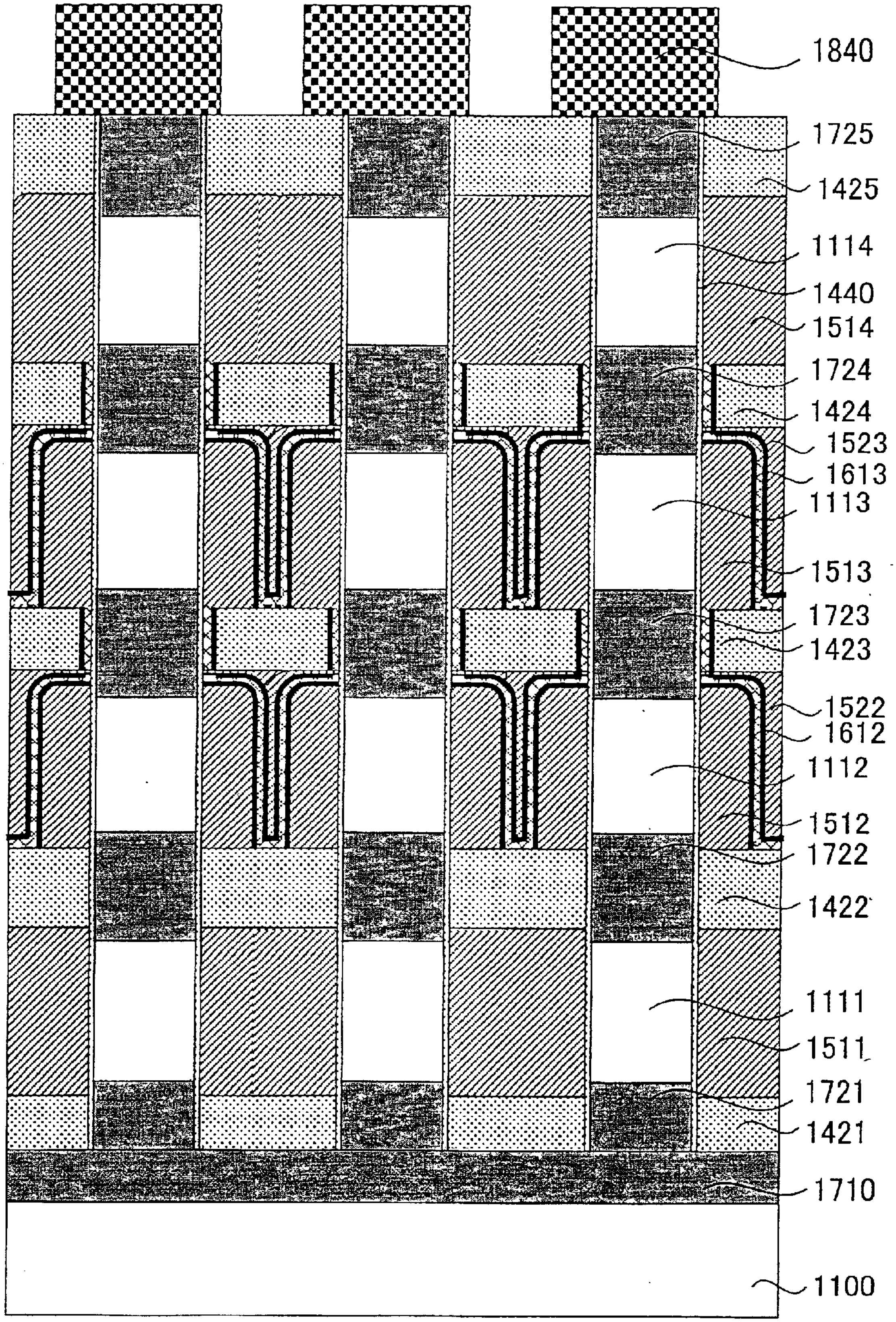

Fig. 1511
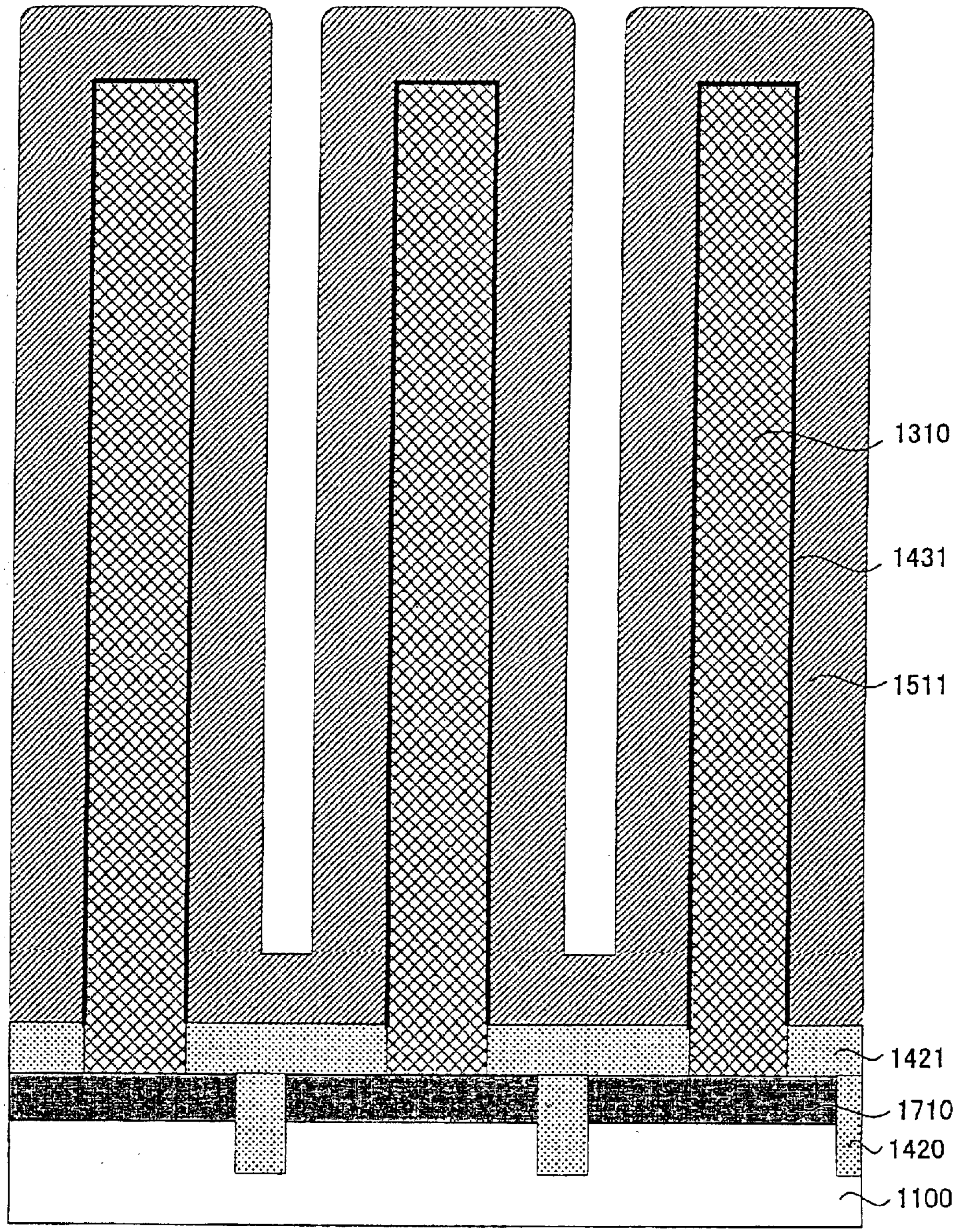

Fig. 1512
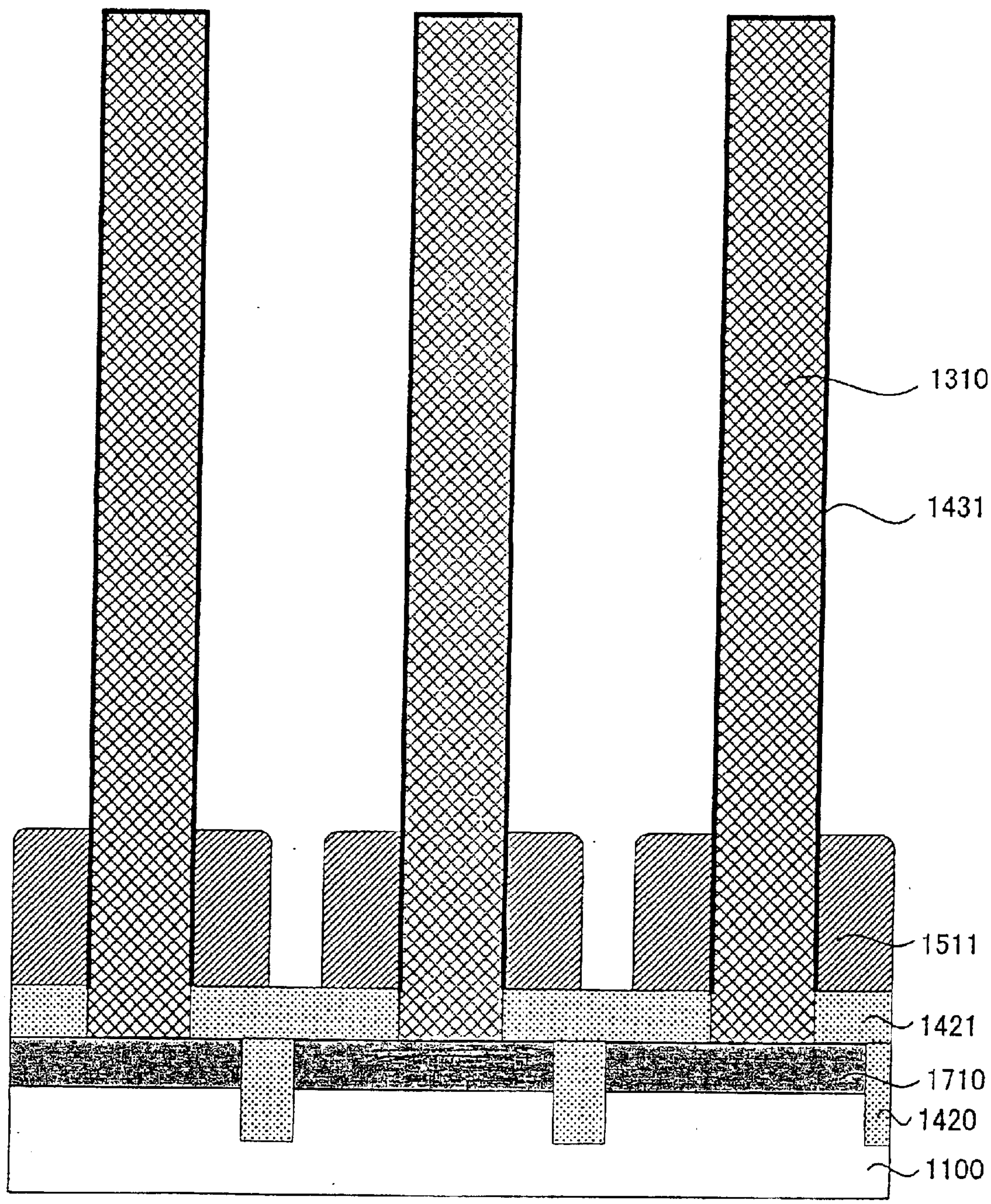

Fig. 1513
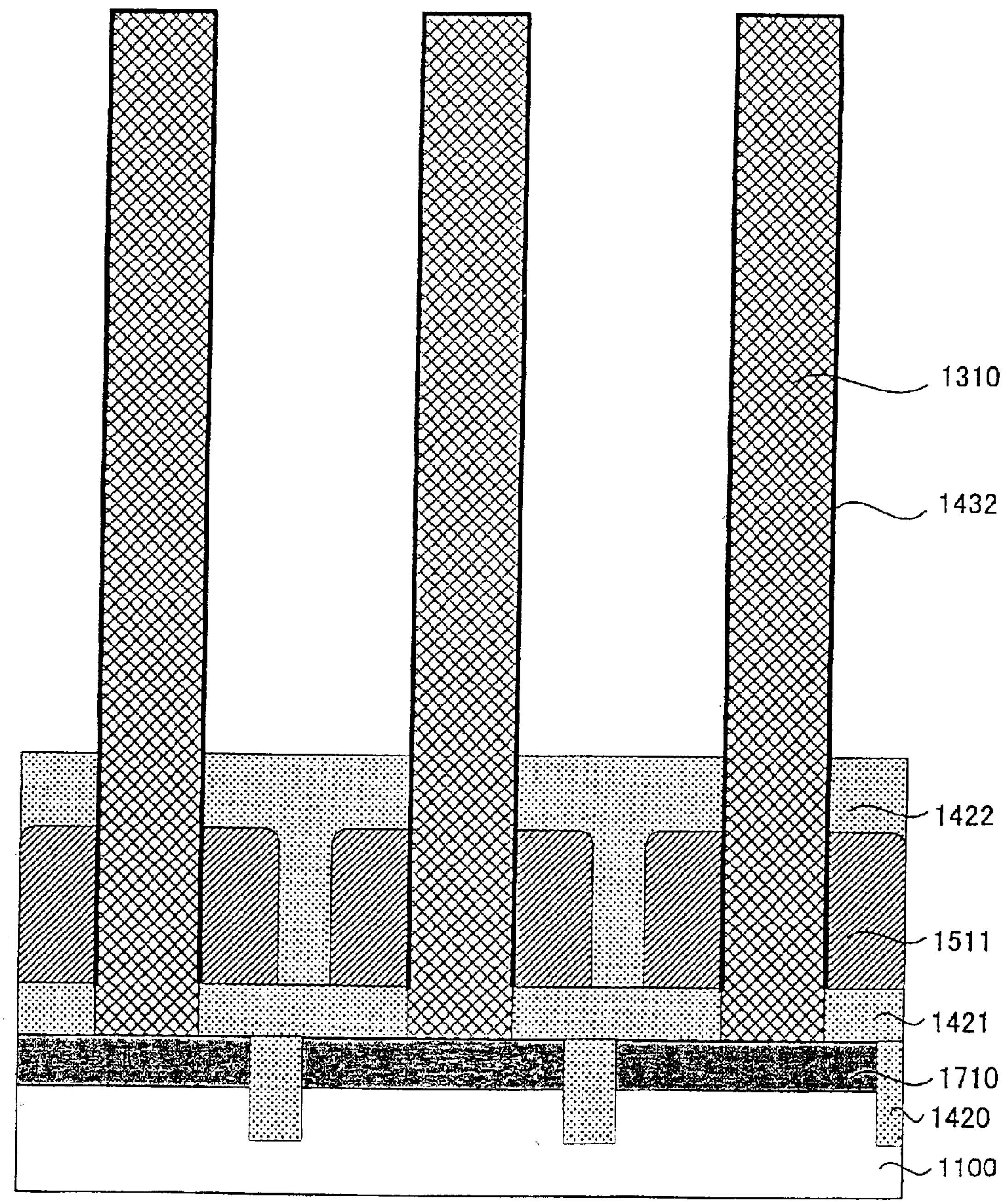

Fig. 1514
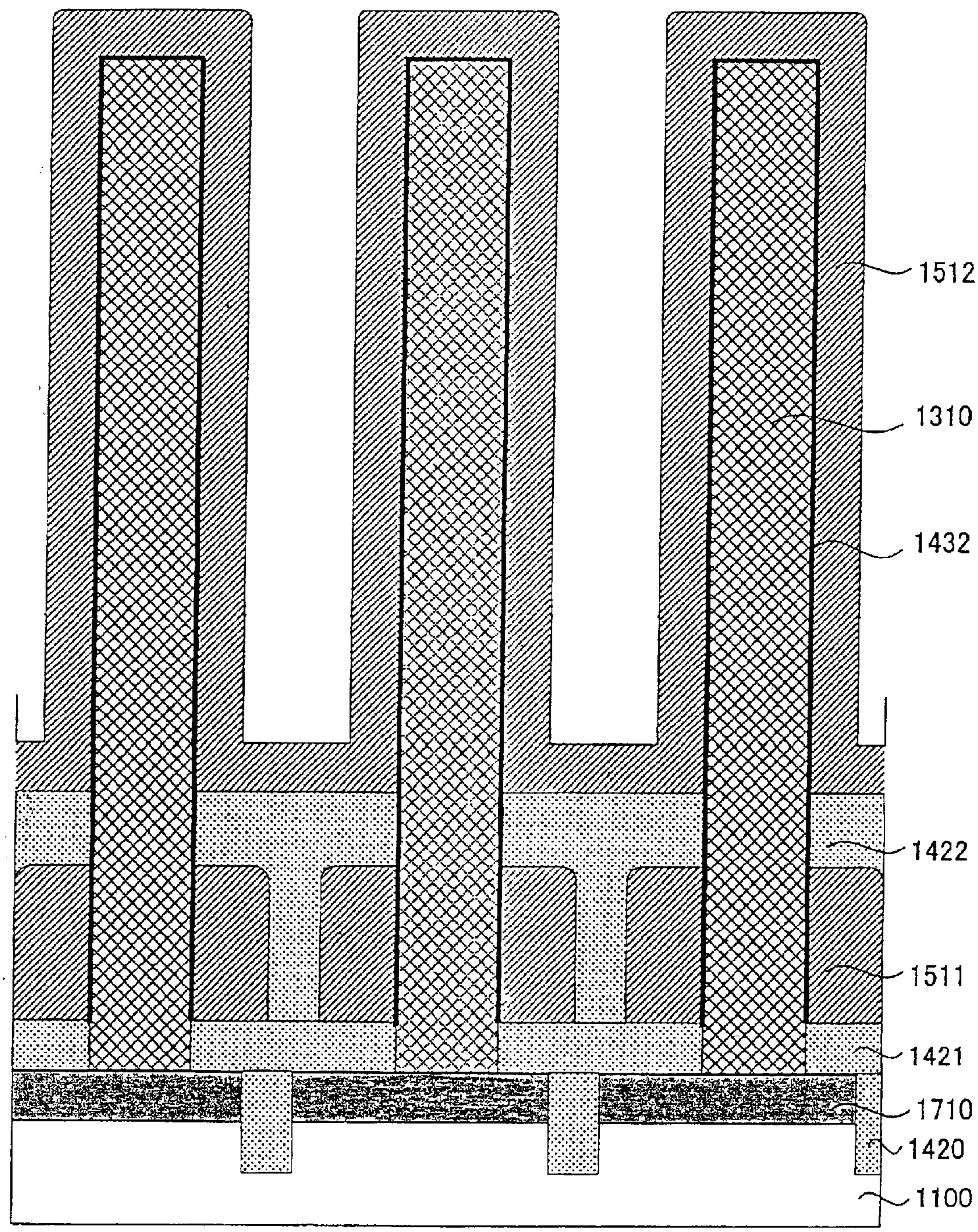

Fig. 1515
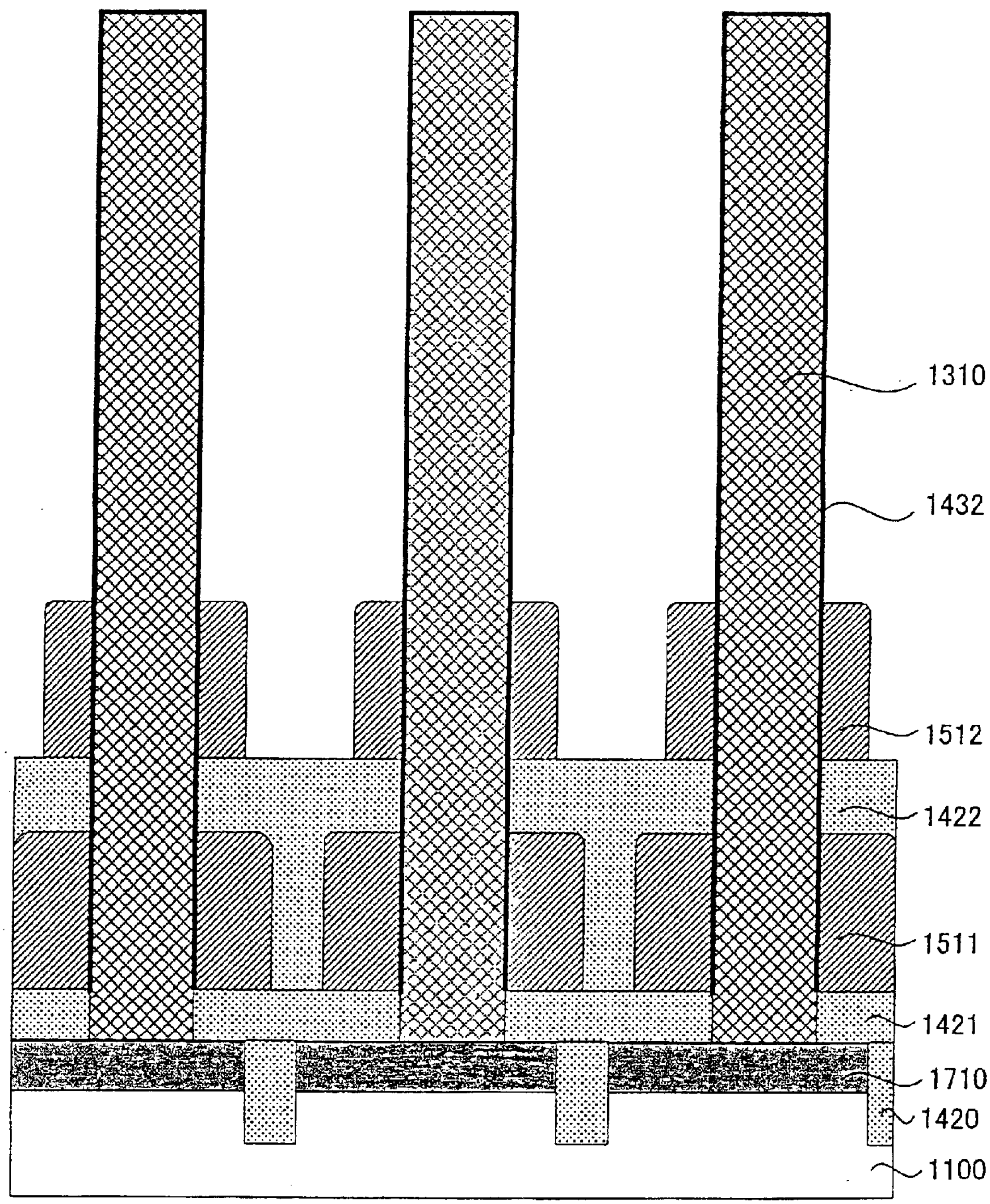

Fig. 1516
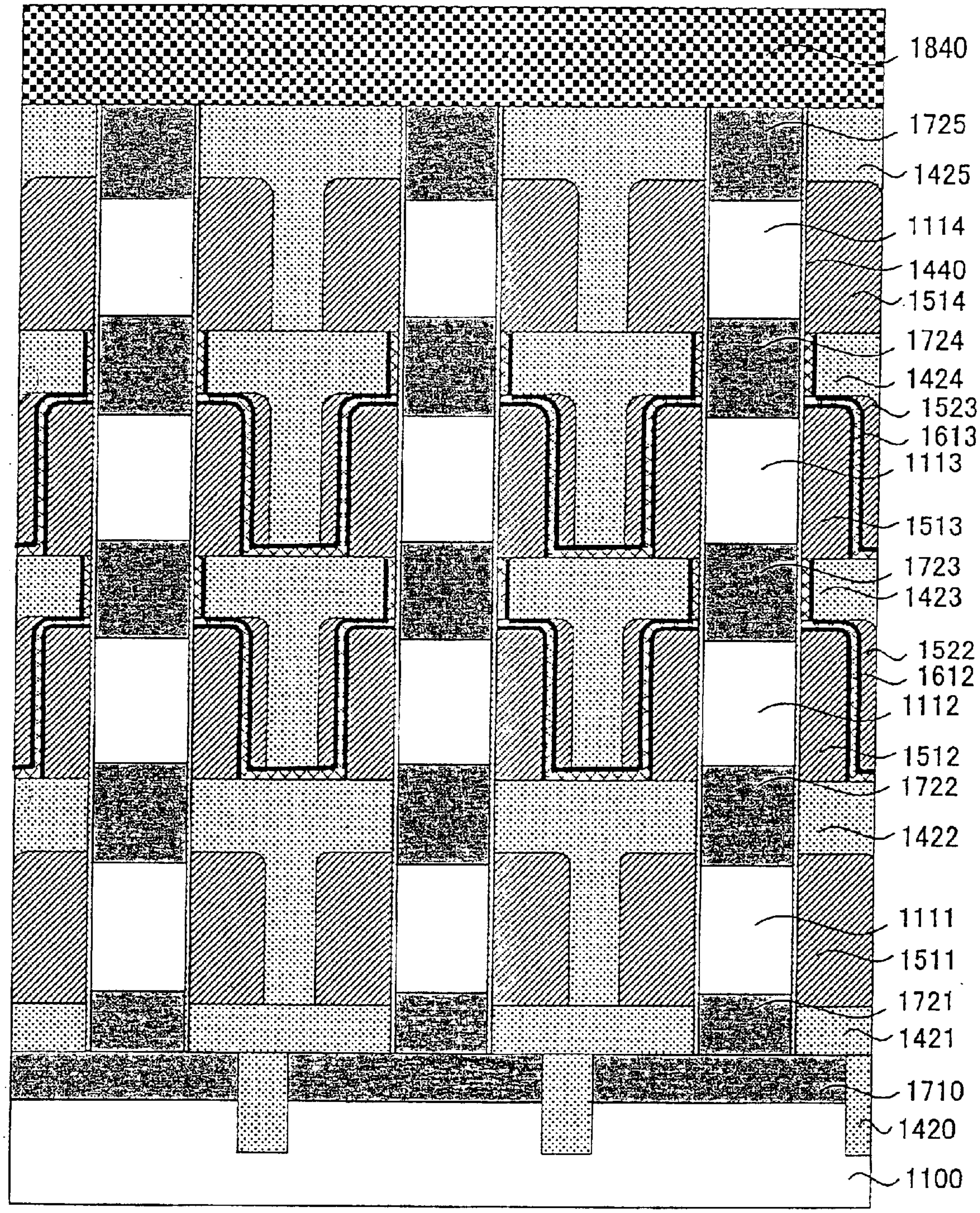

Fig. 1517
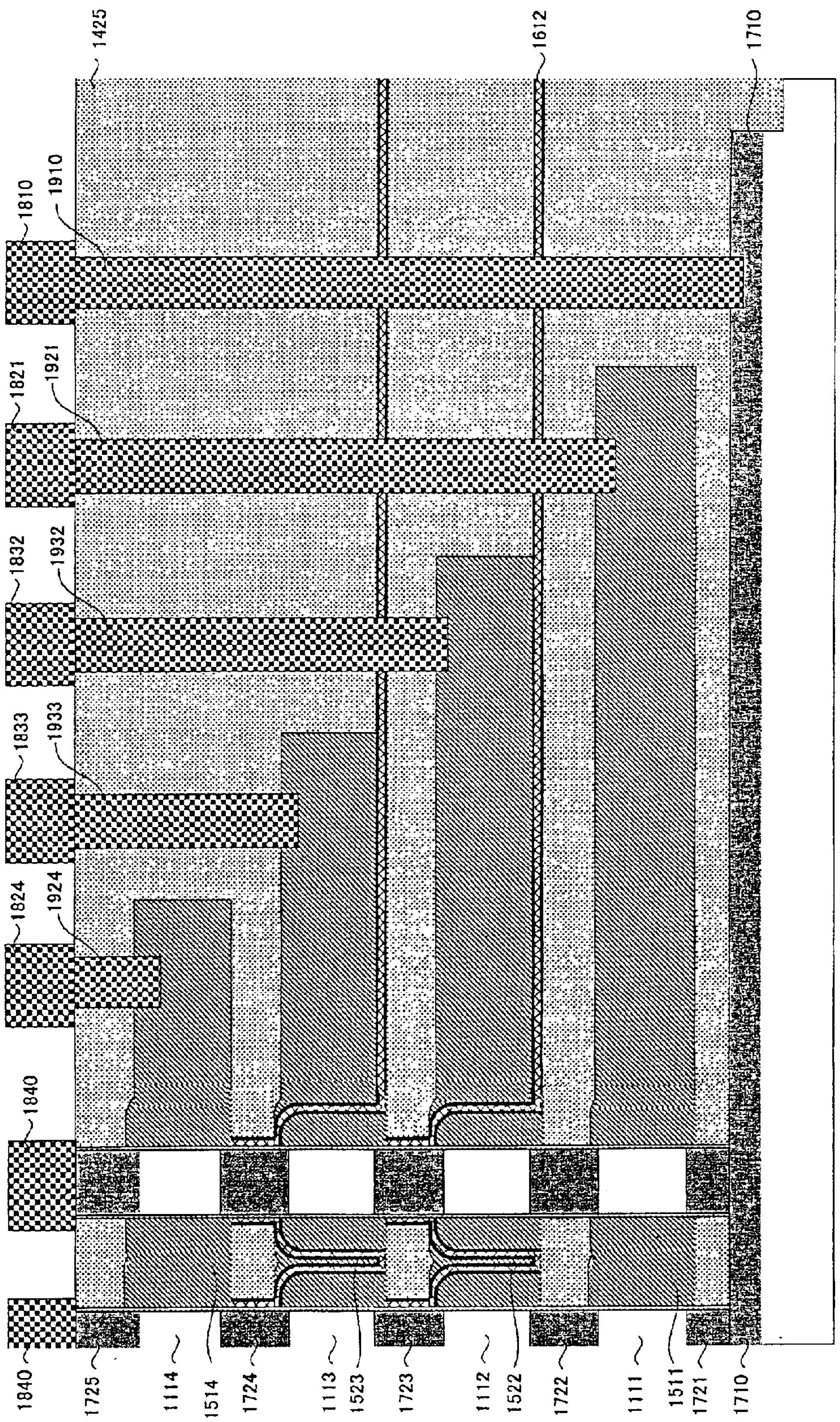

Fig. 1518
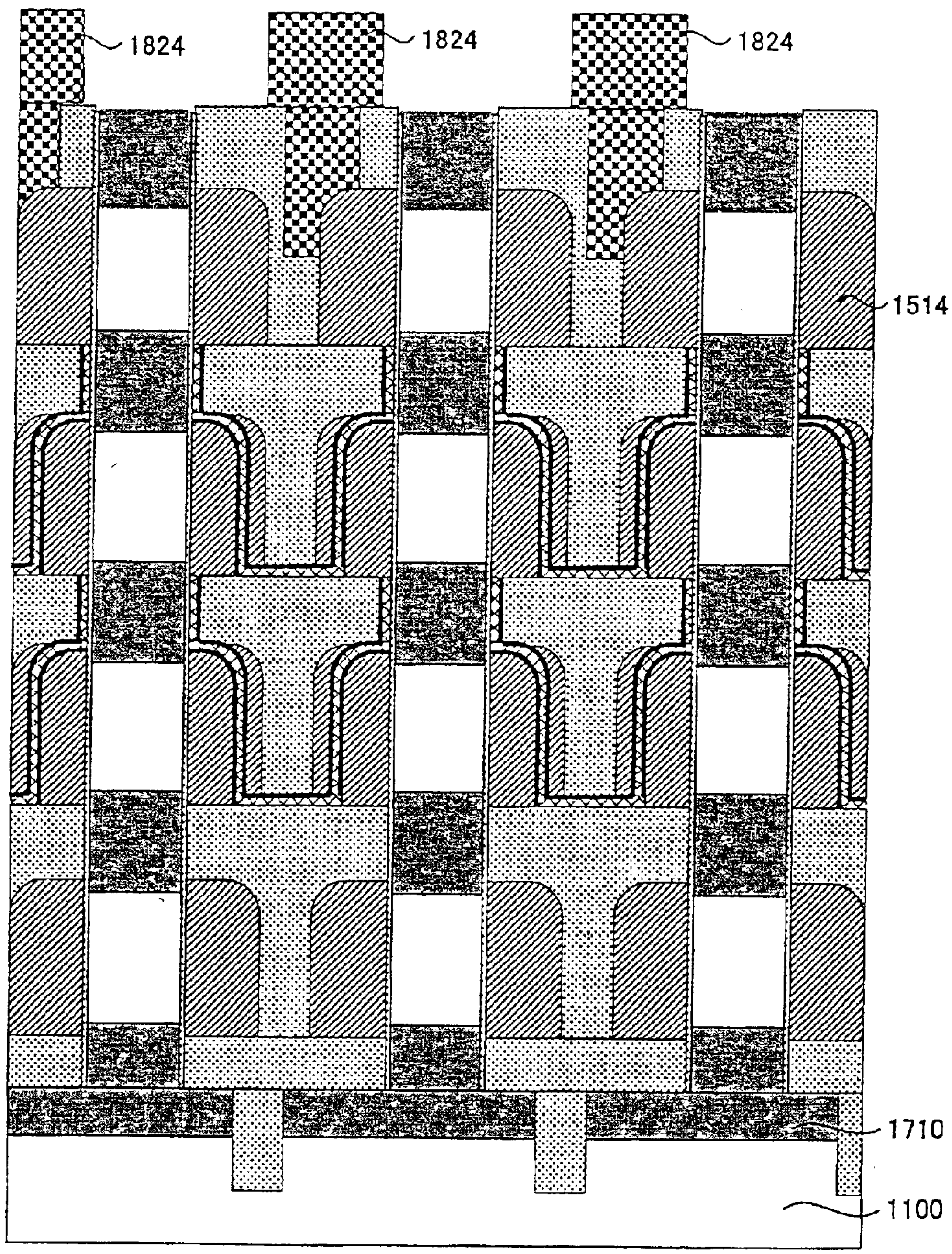

Fig. 1519
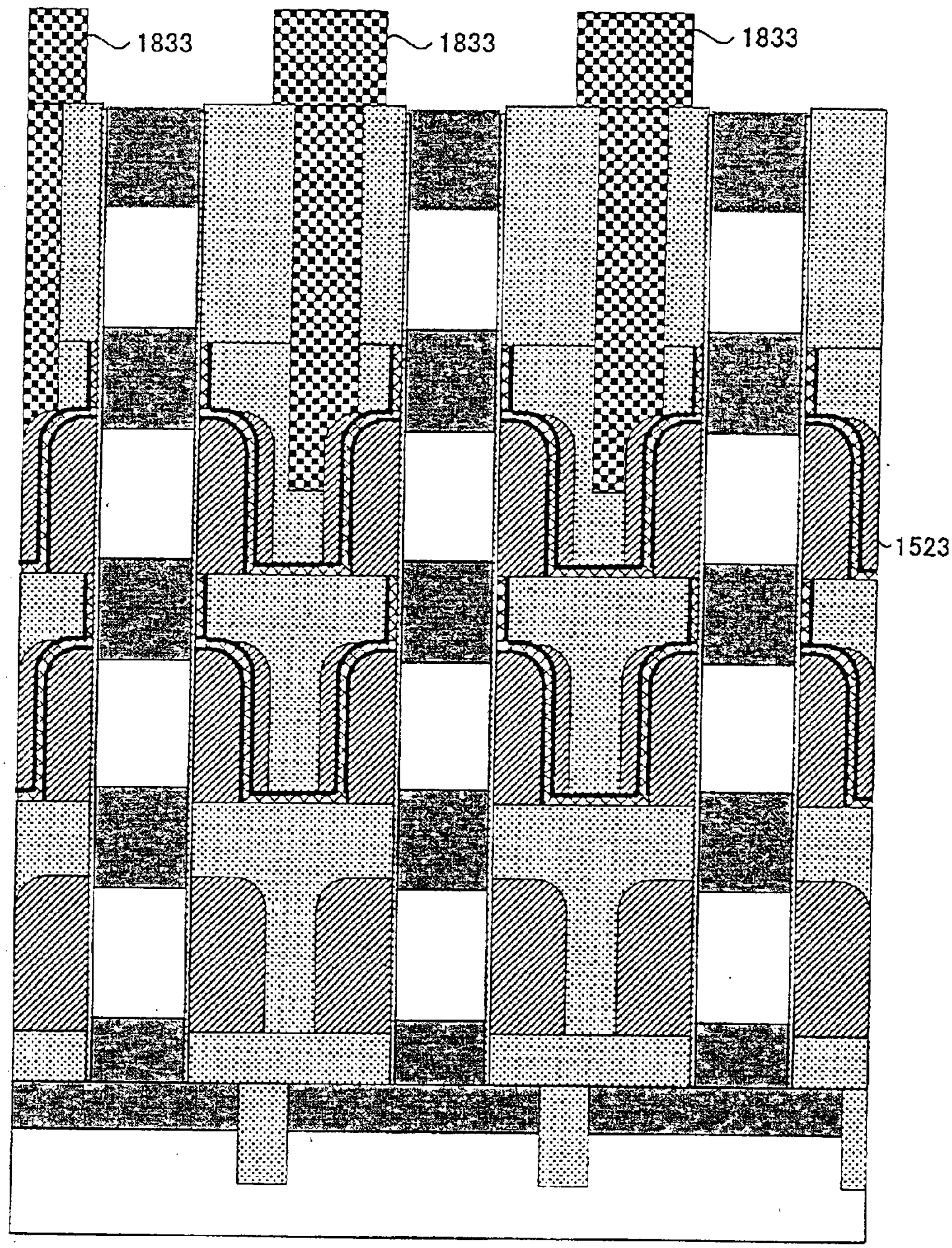

Fig. 1520
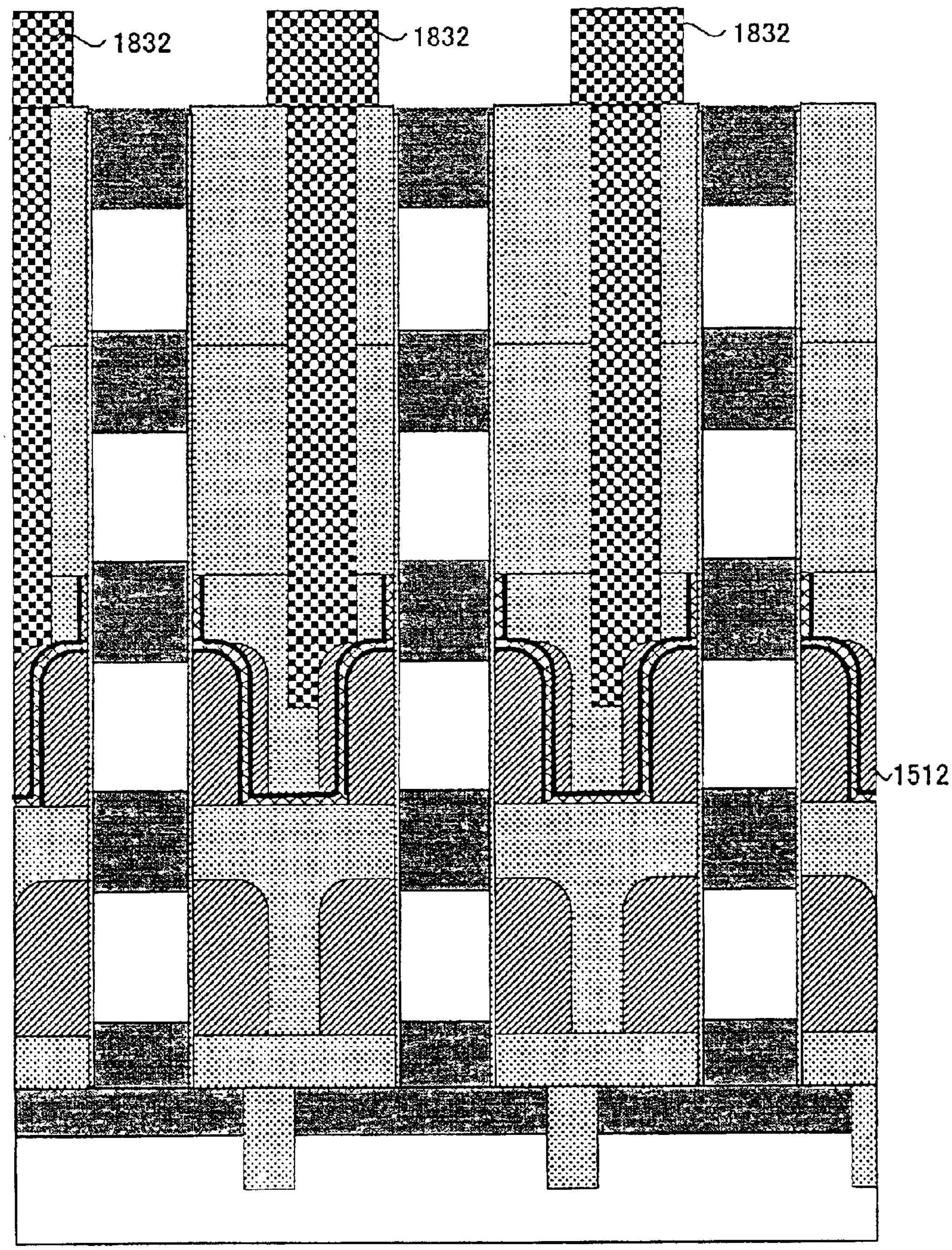

Fig. 1521
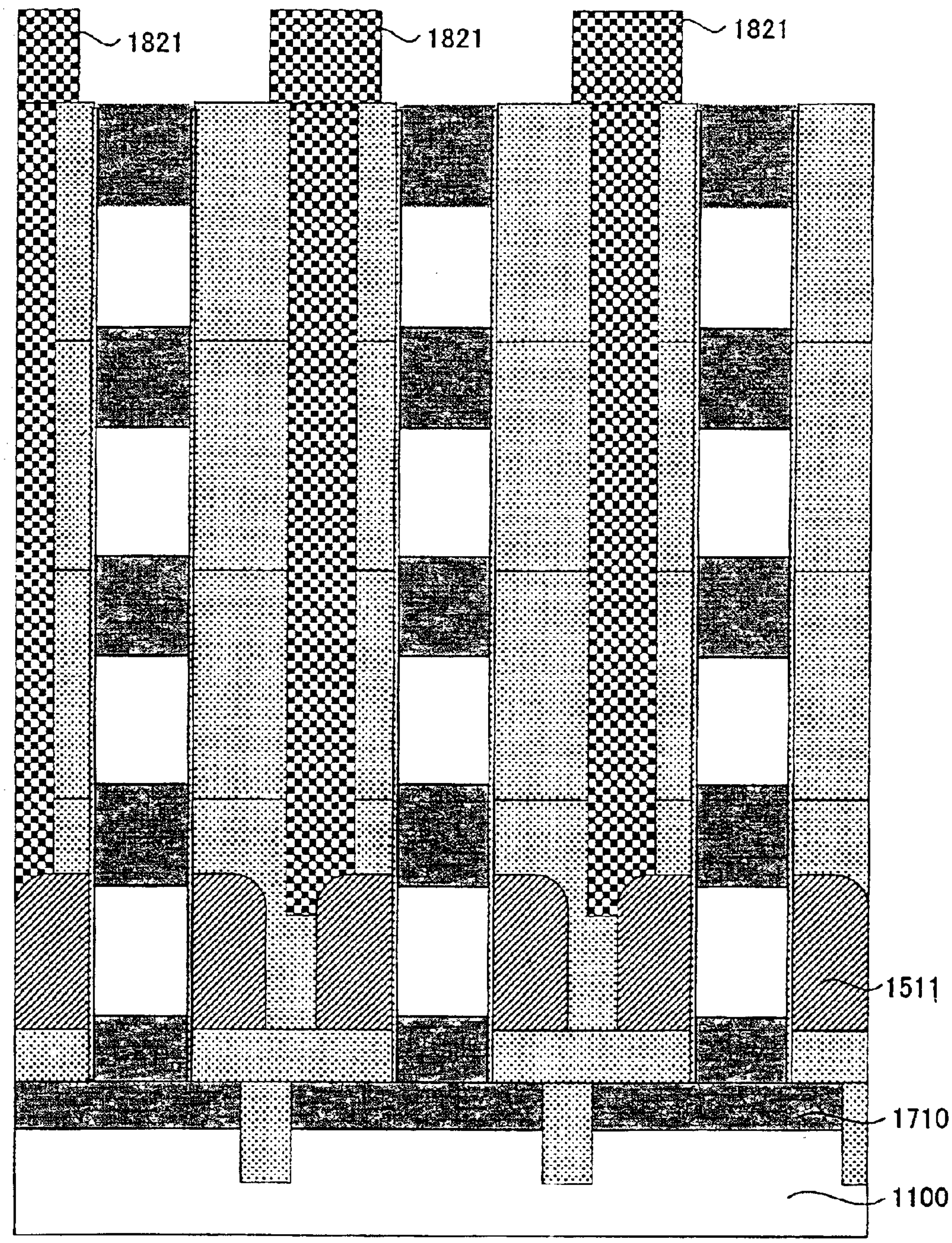

Fig. 1522
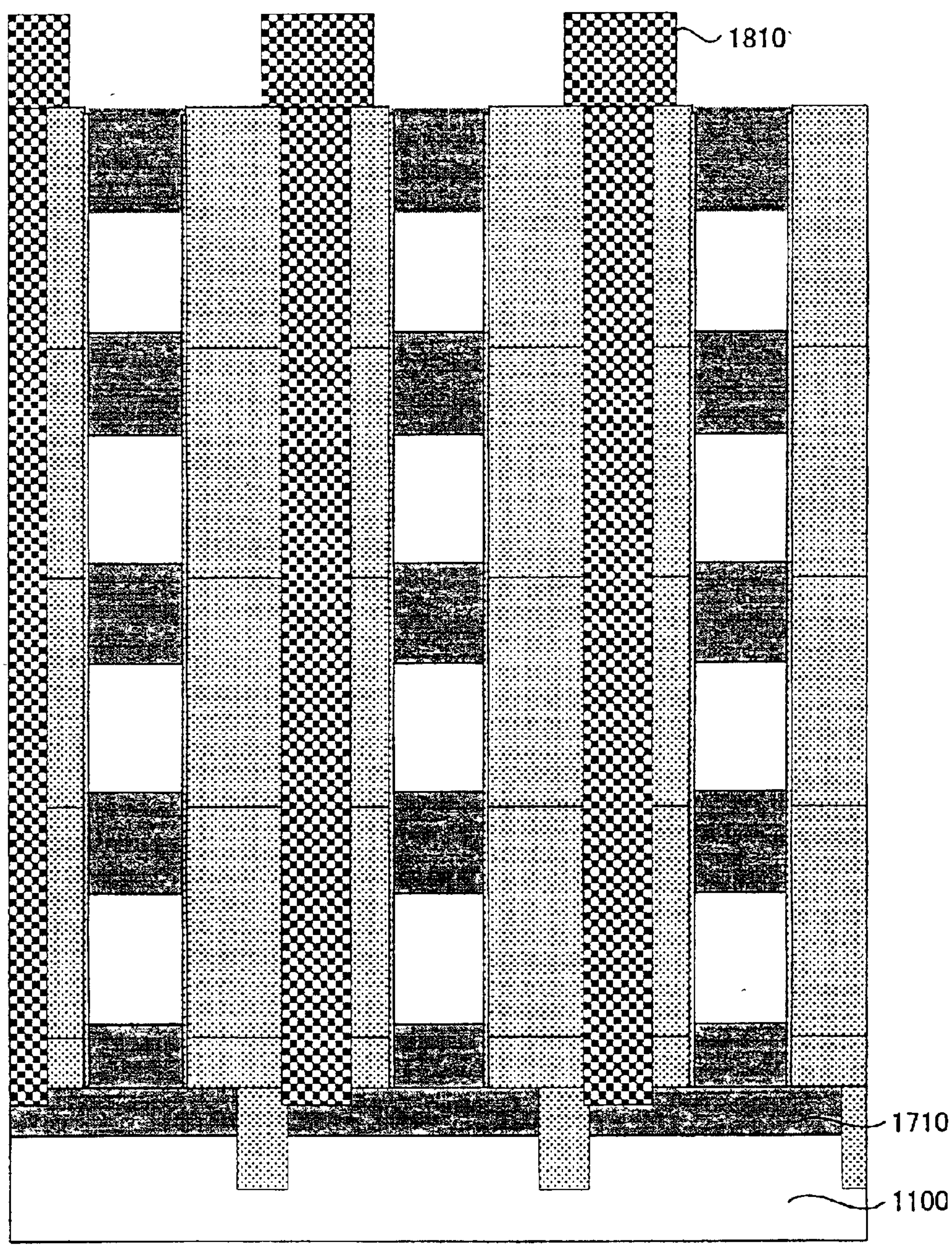

Fig. 1523
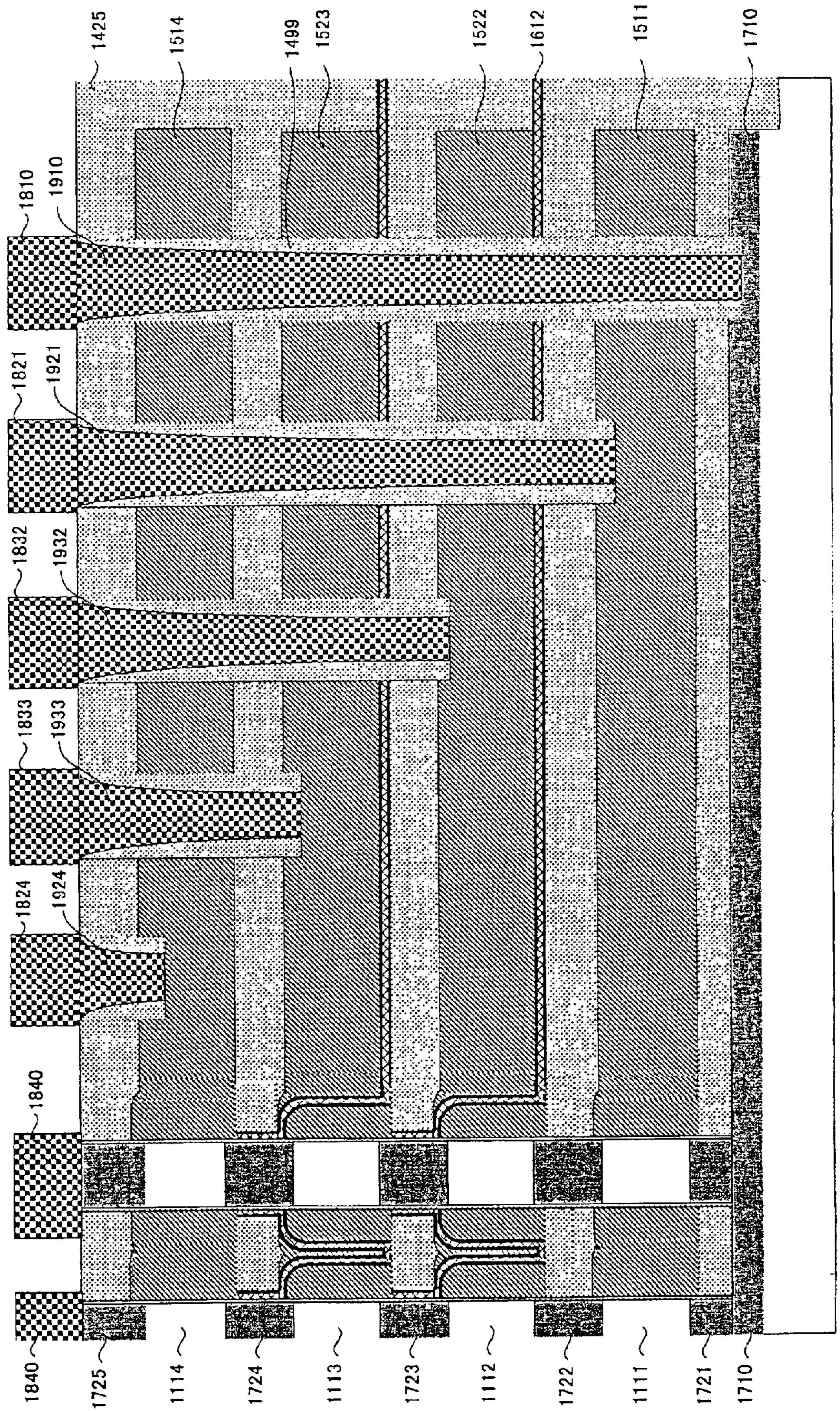

Fig. 1524
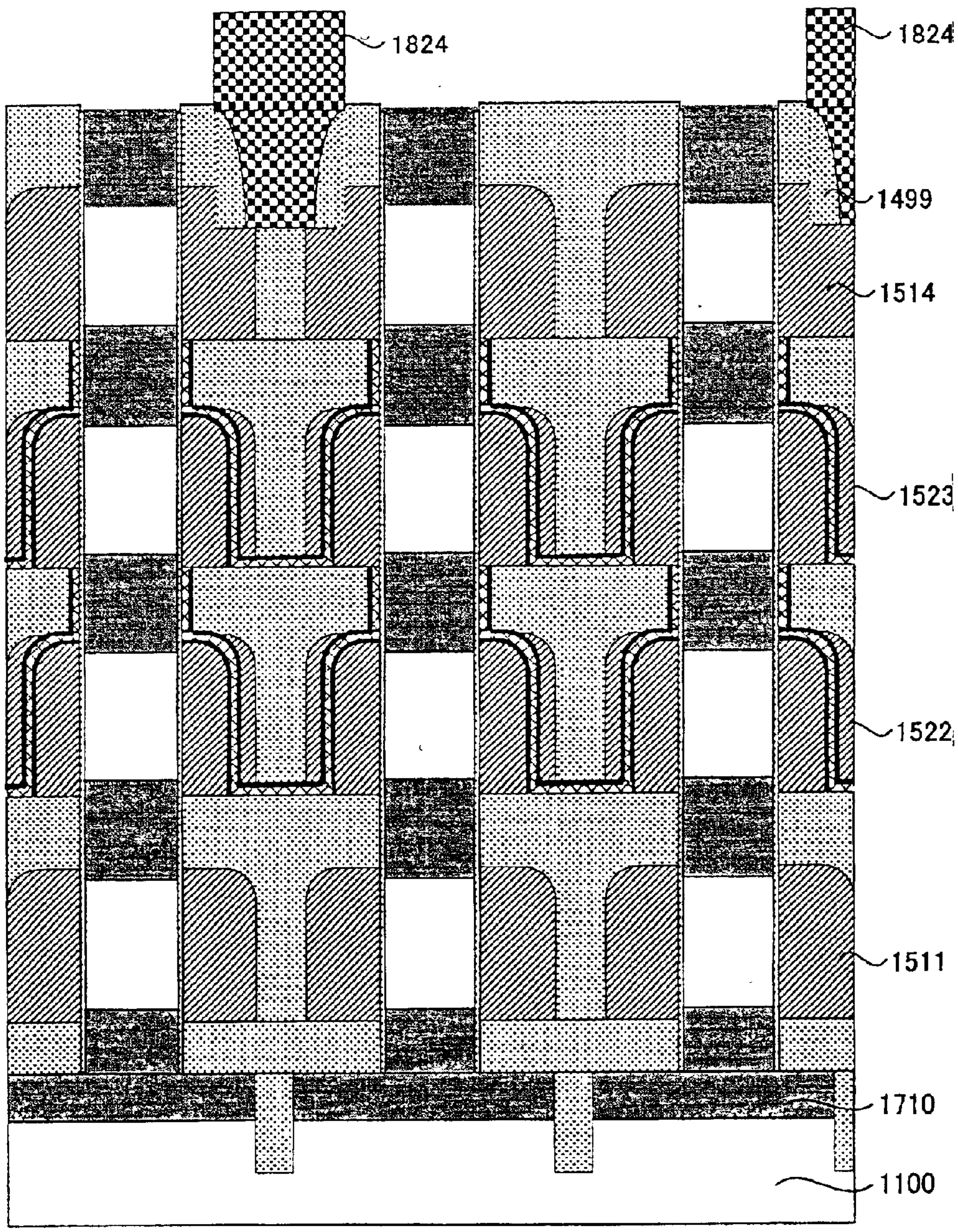

Fig. 1525
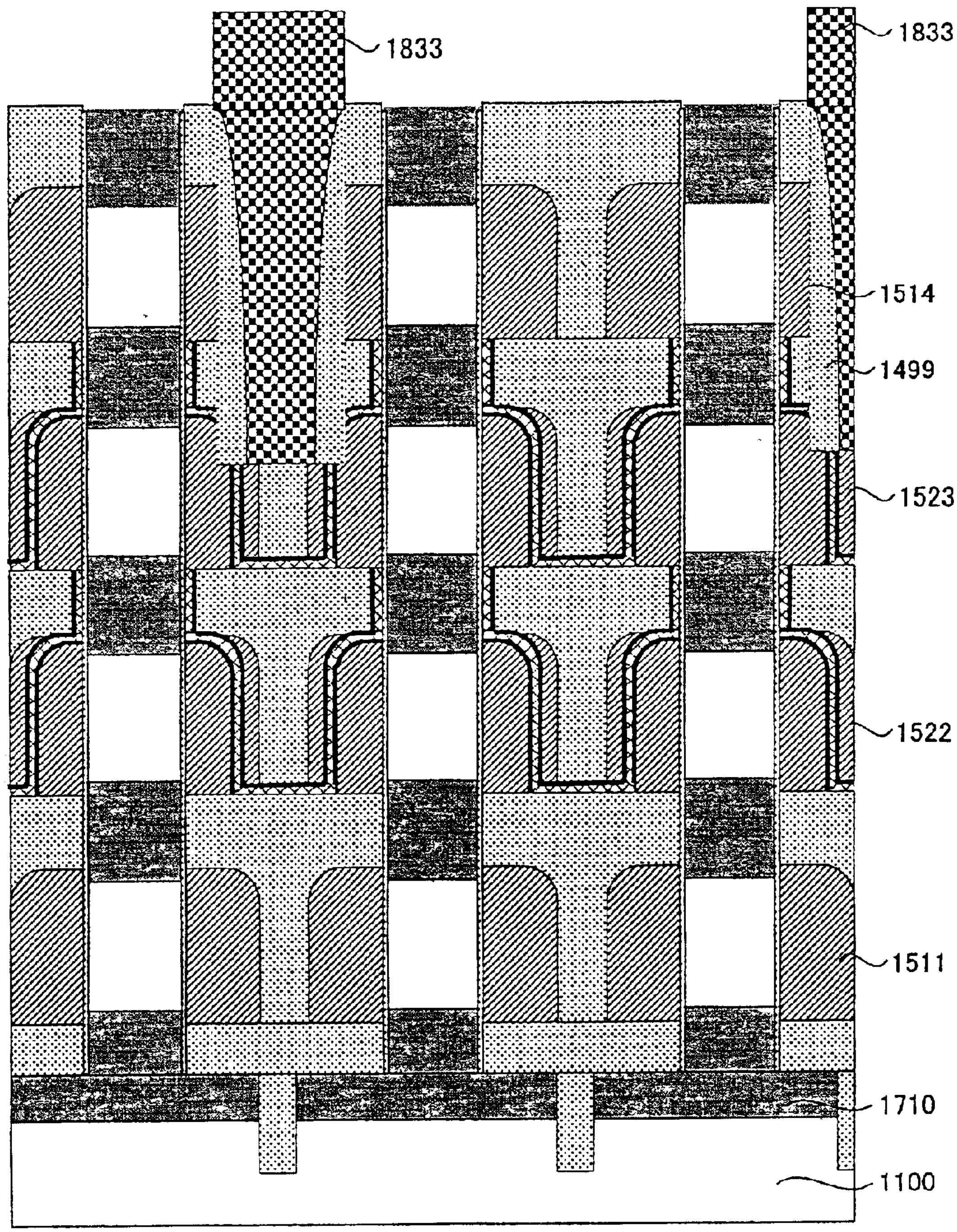

Fig. 1526
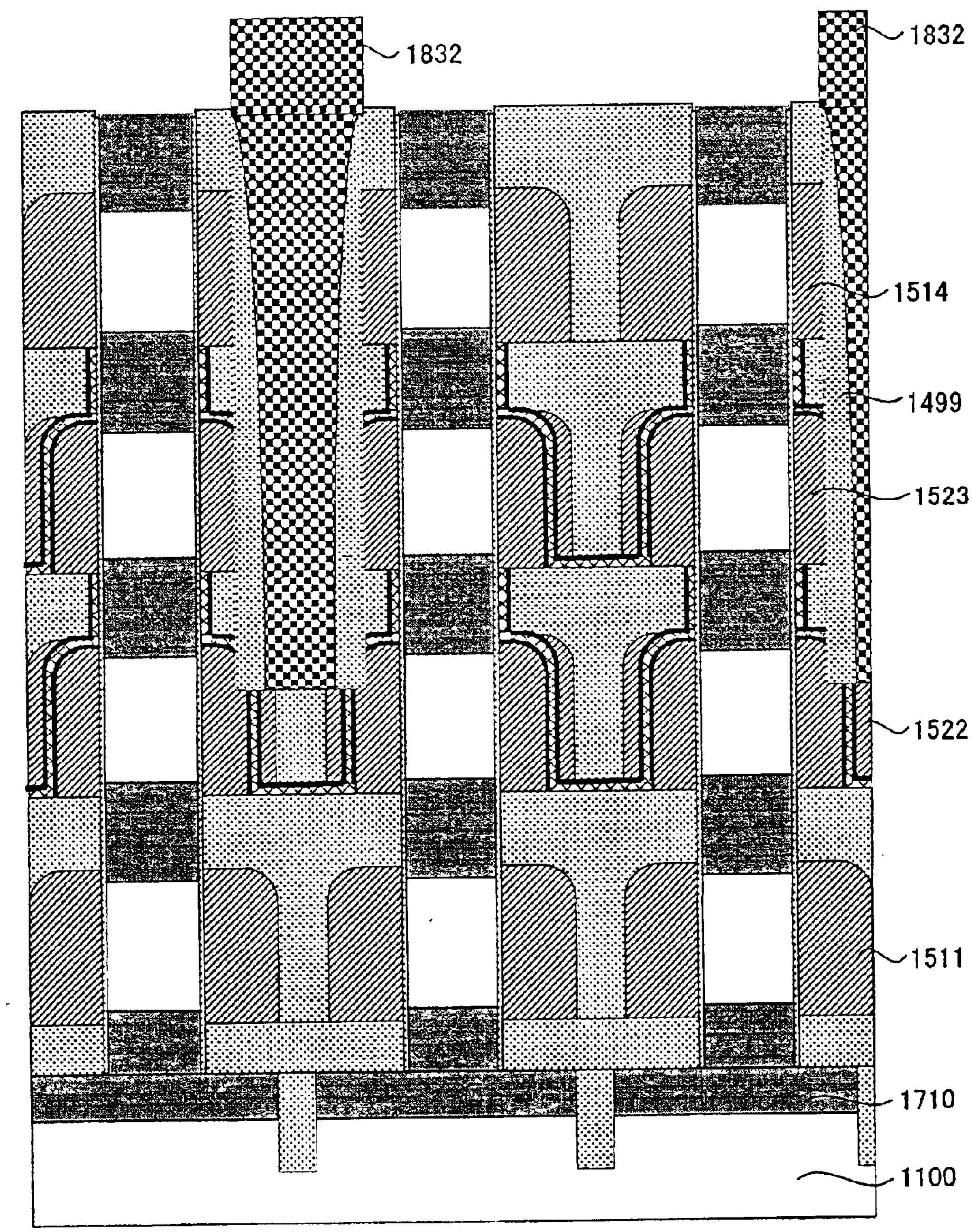

Fig. 1527
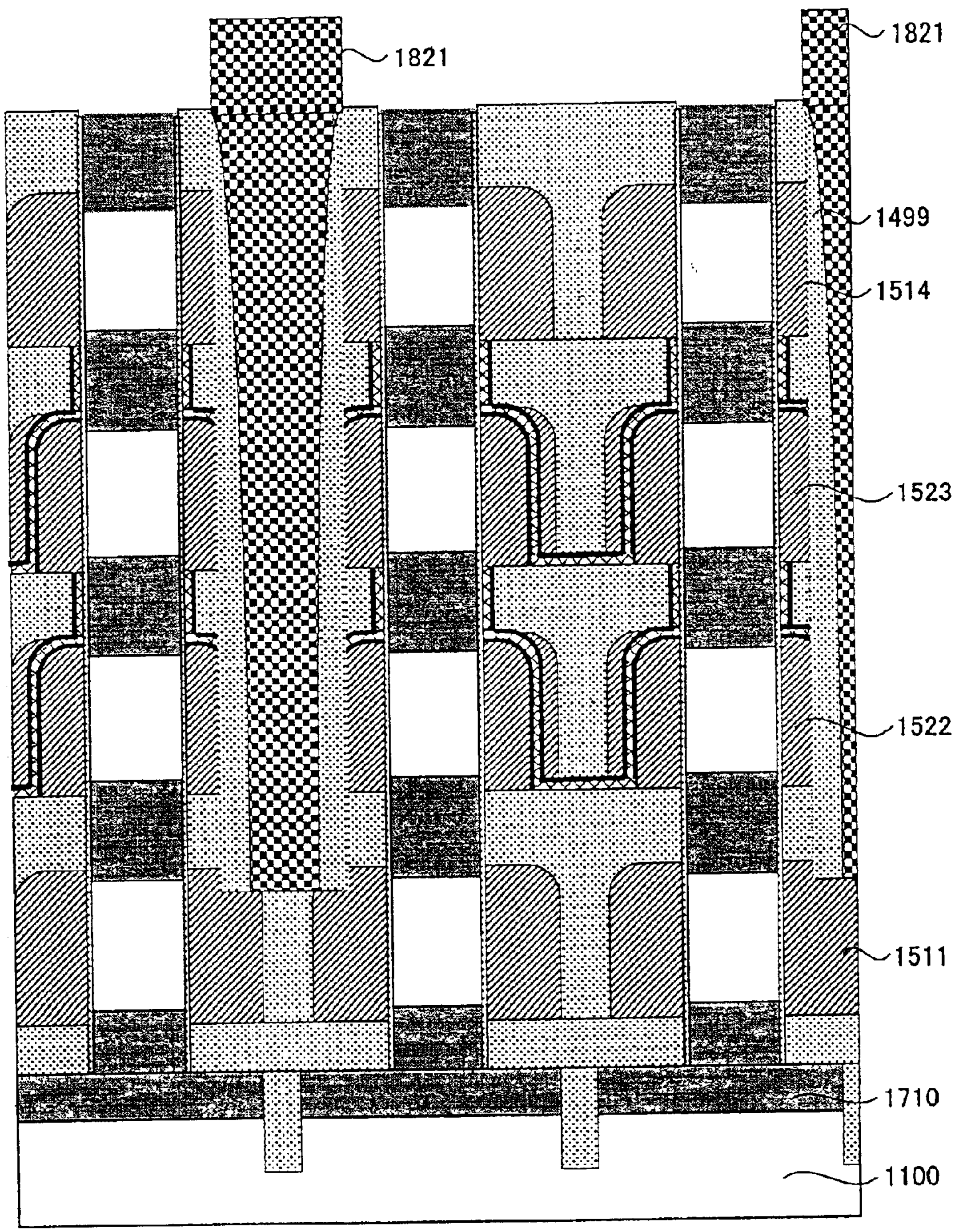

Fig. 1528
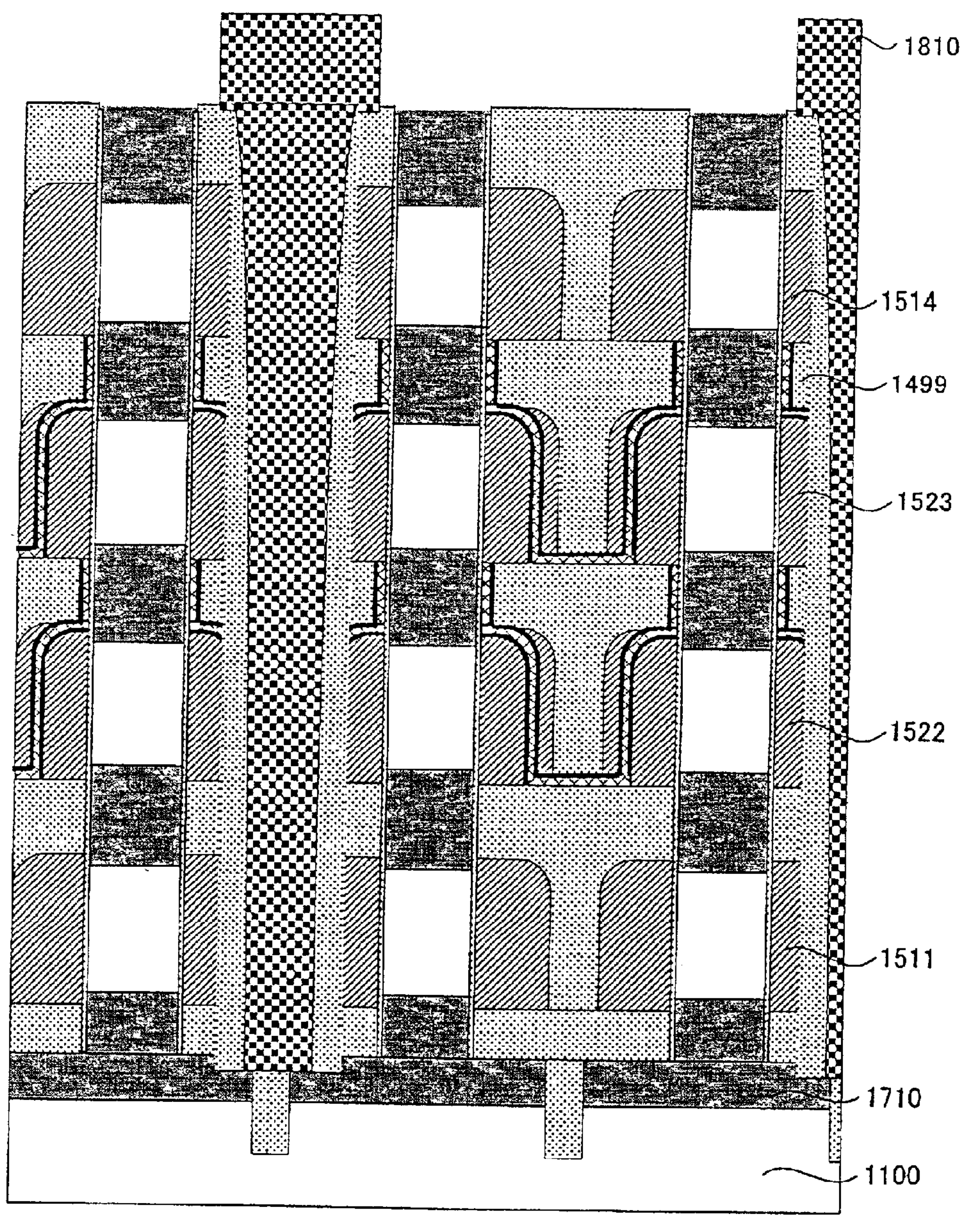

Fig. 1529
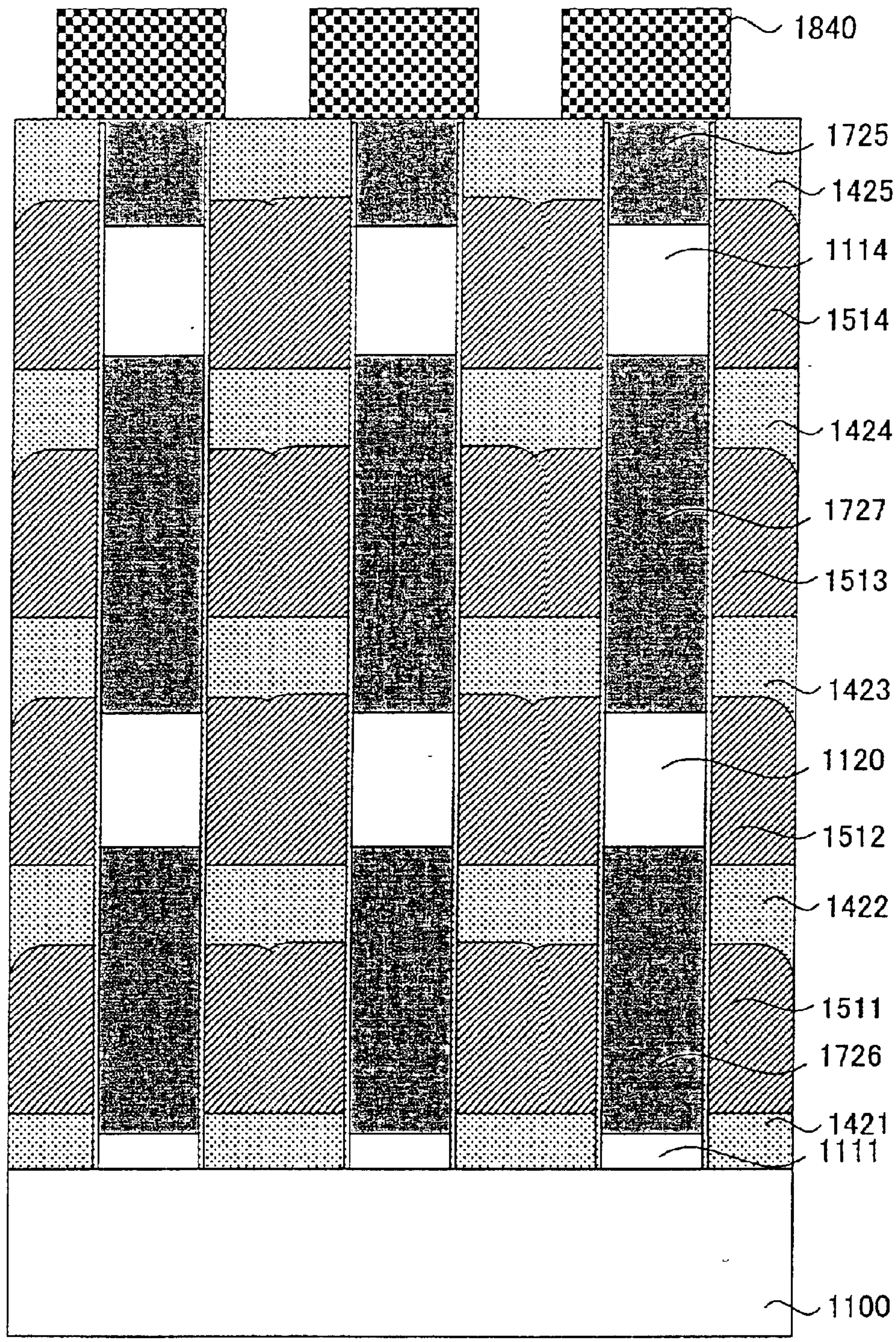

Fig. 1530
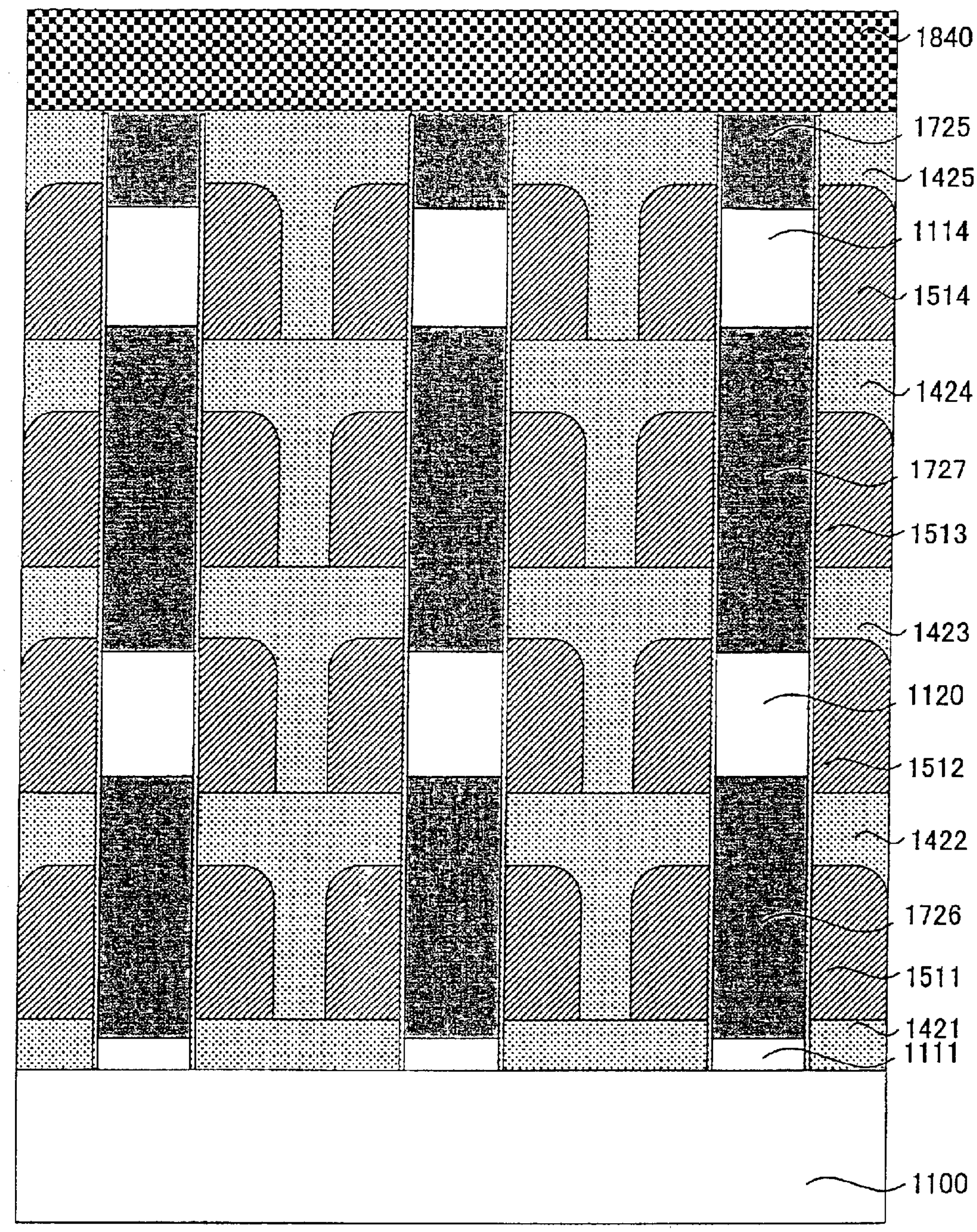

Fig. 1531
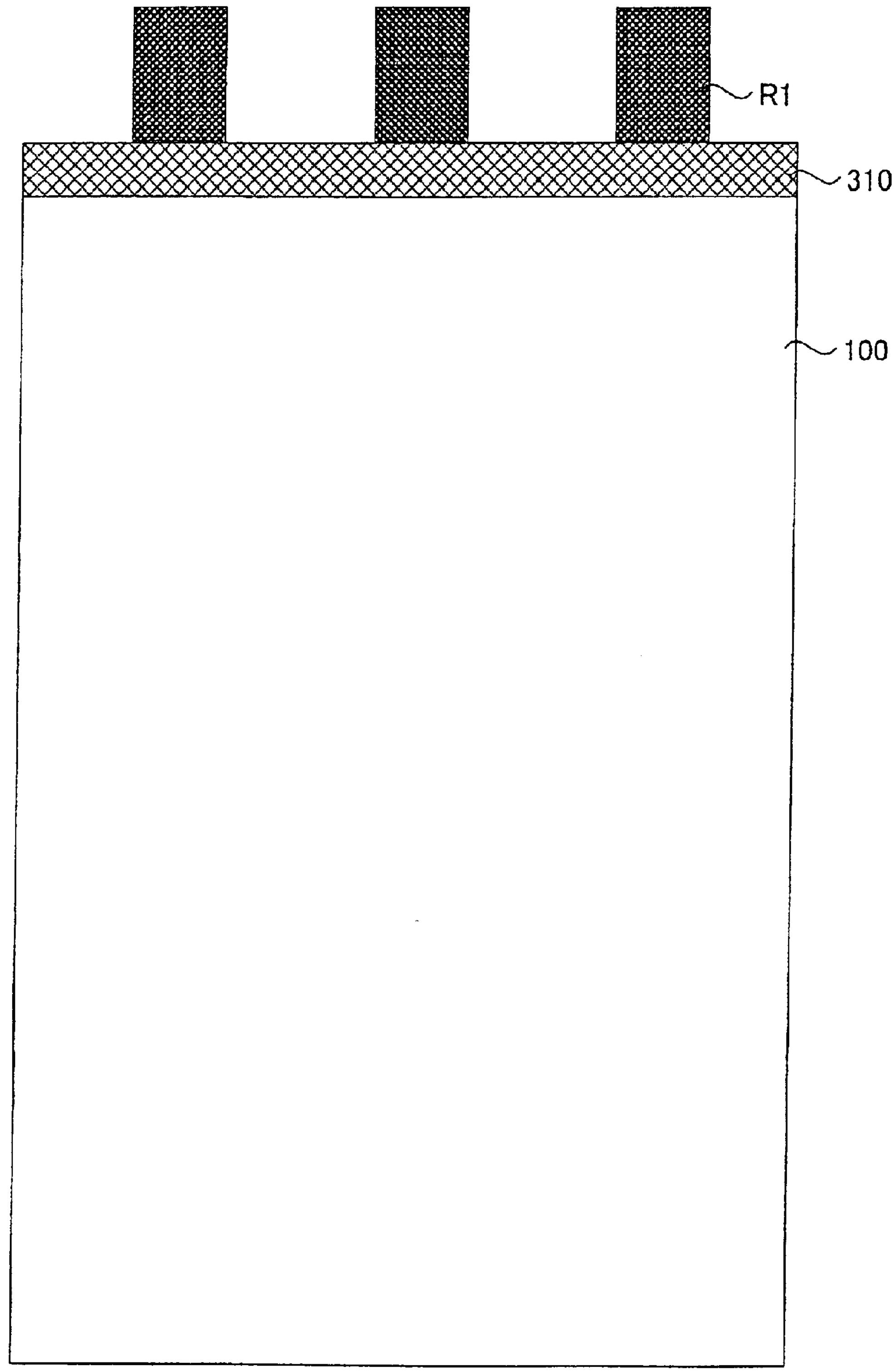

Fig. 1532
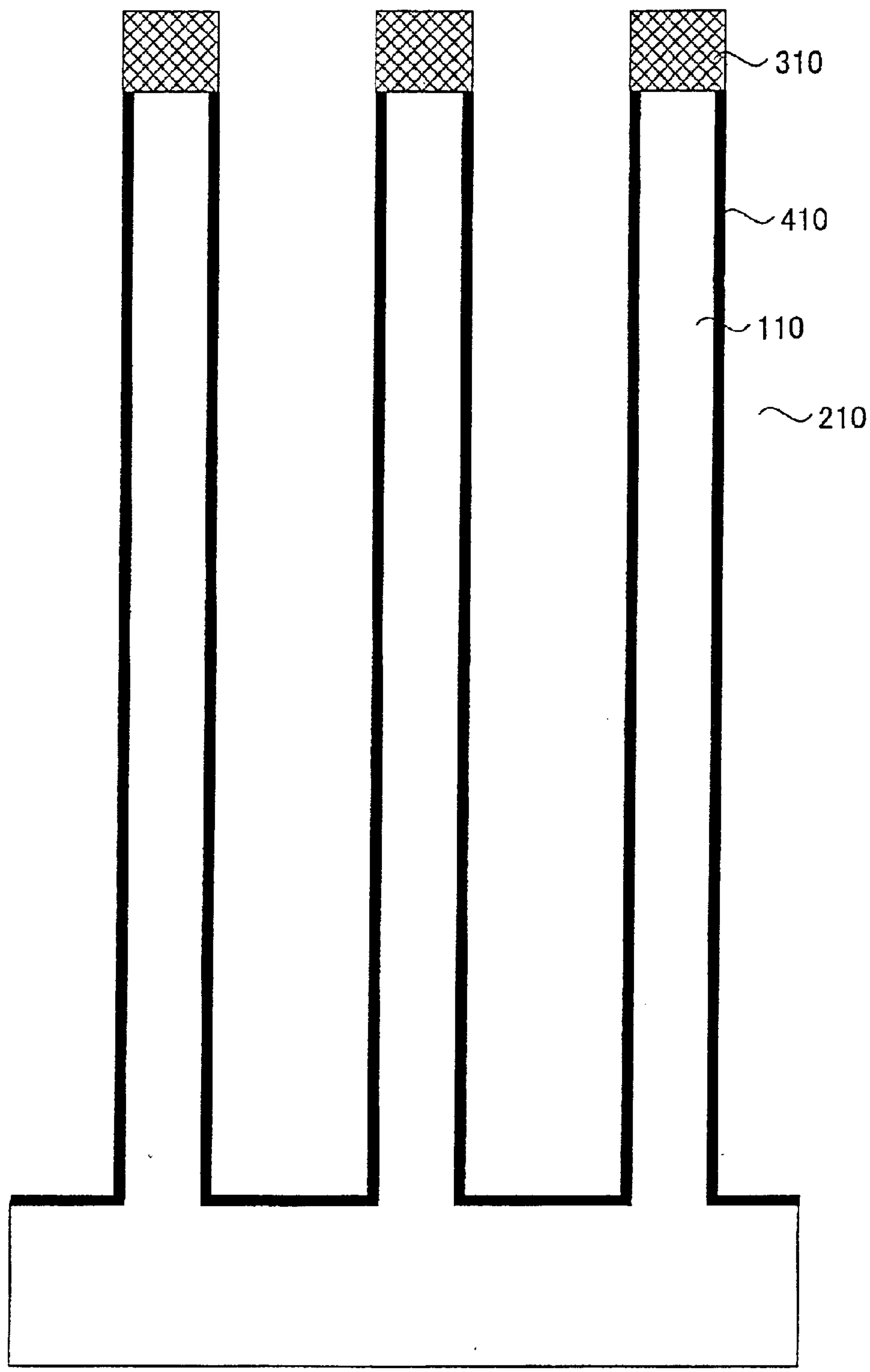

Fig. 1533
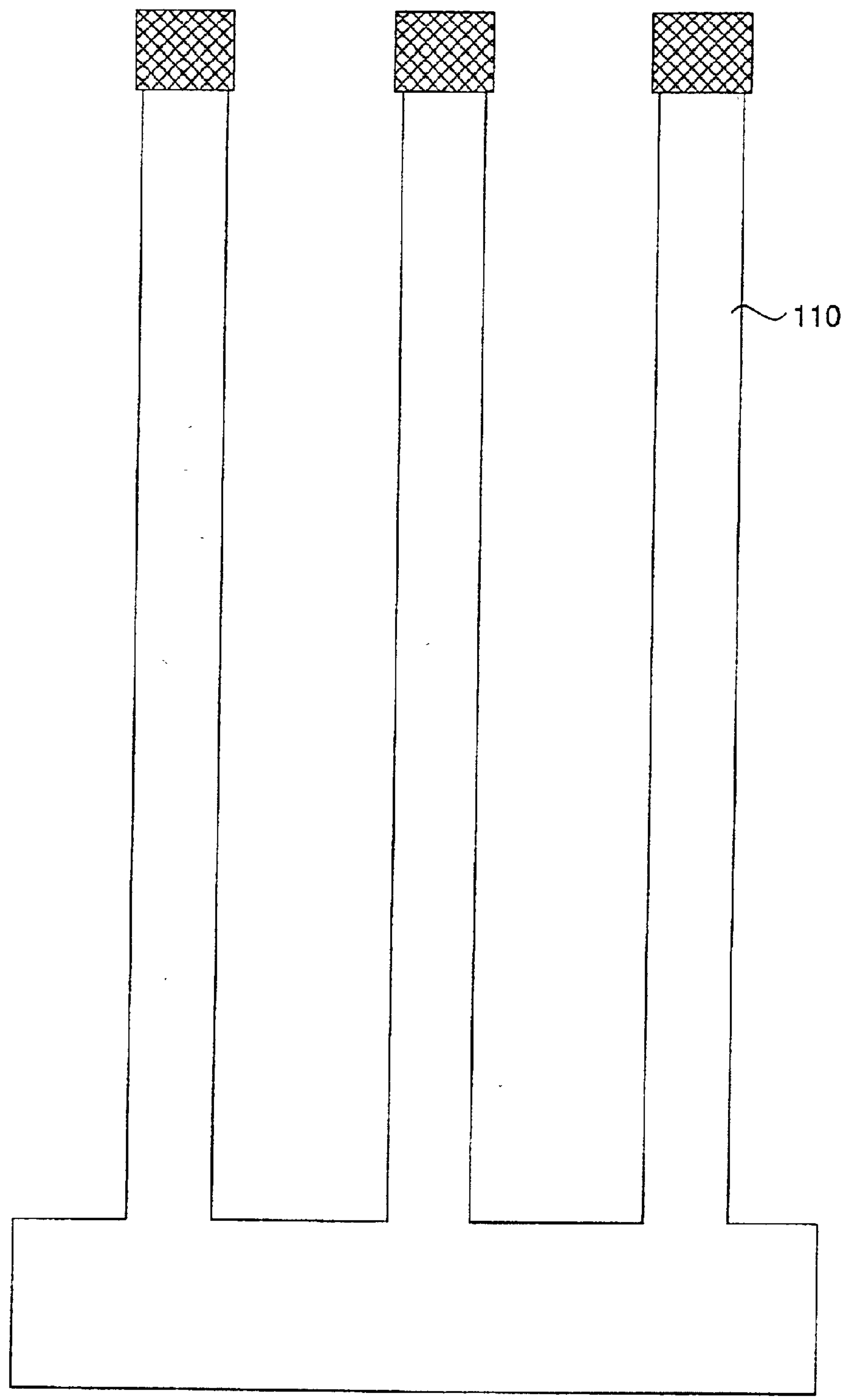

Fig. 1534
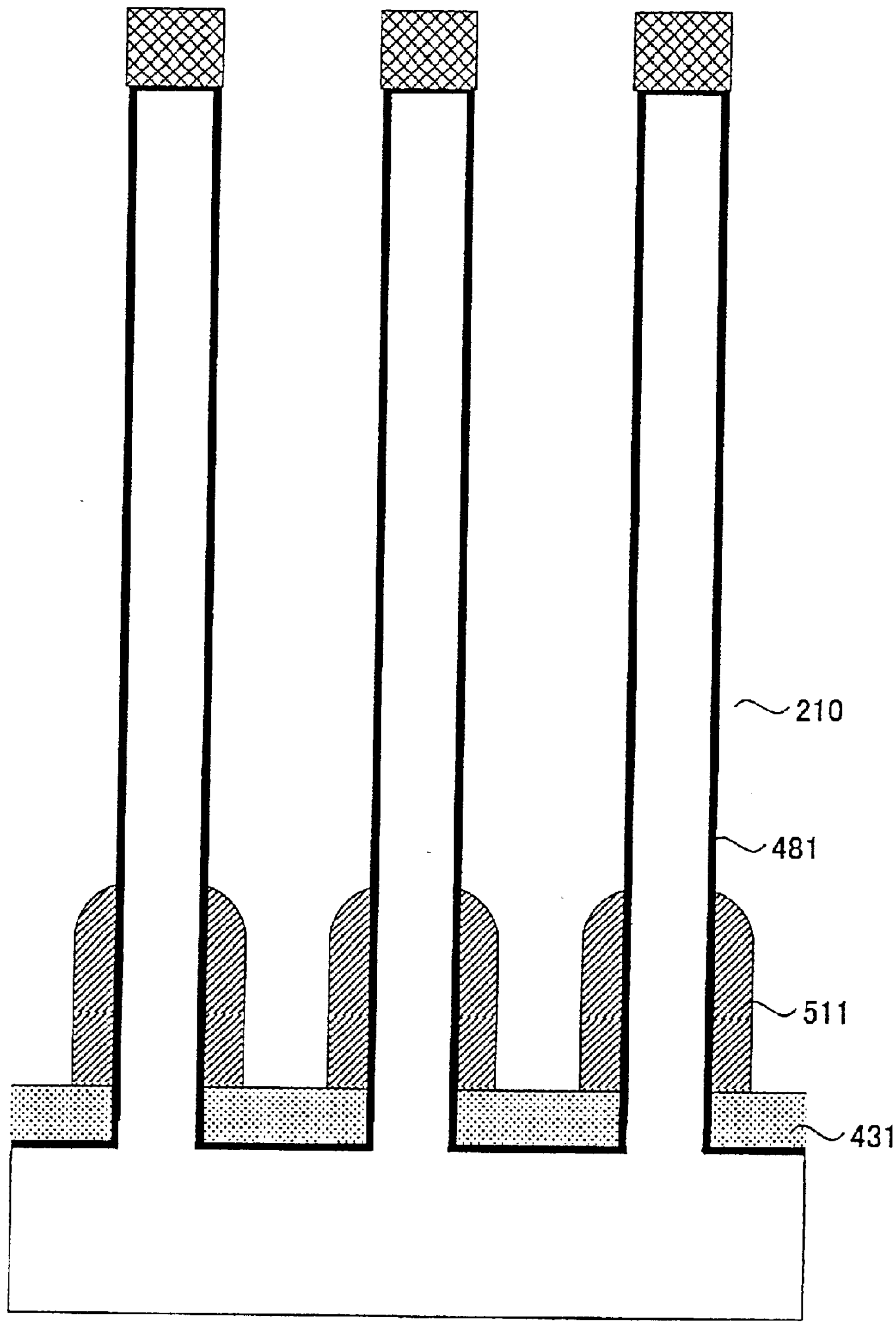

Fig. 1535
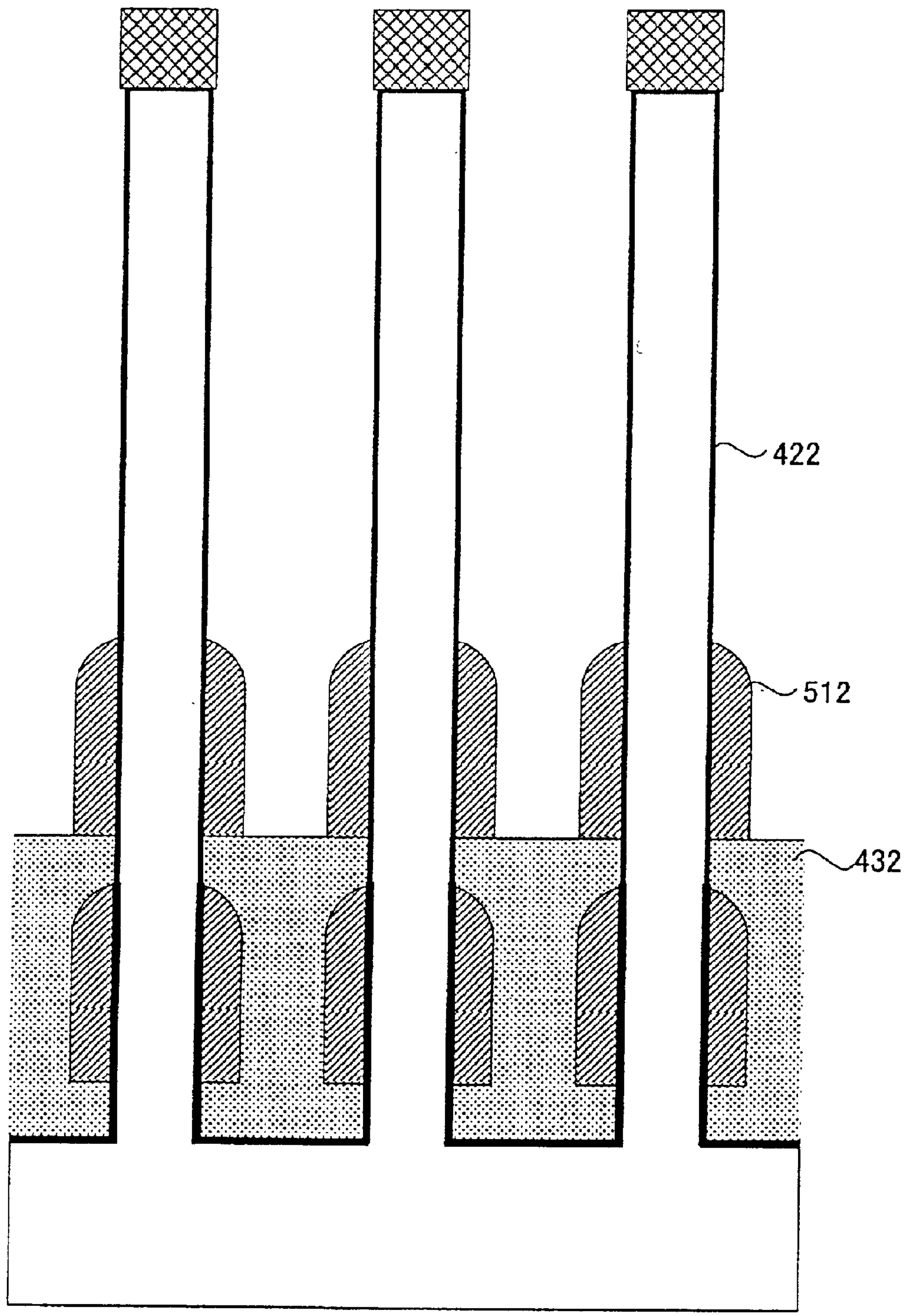

Fig. 1536
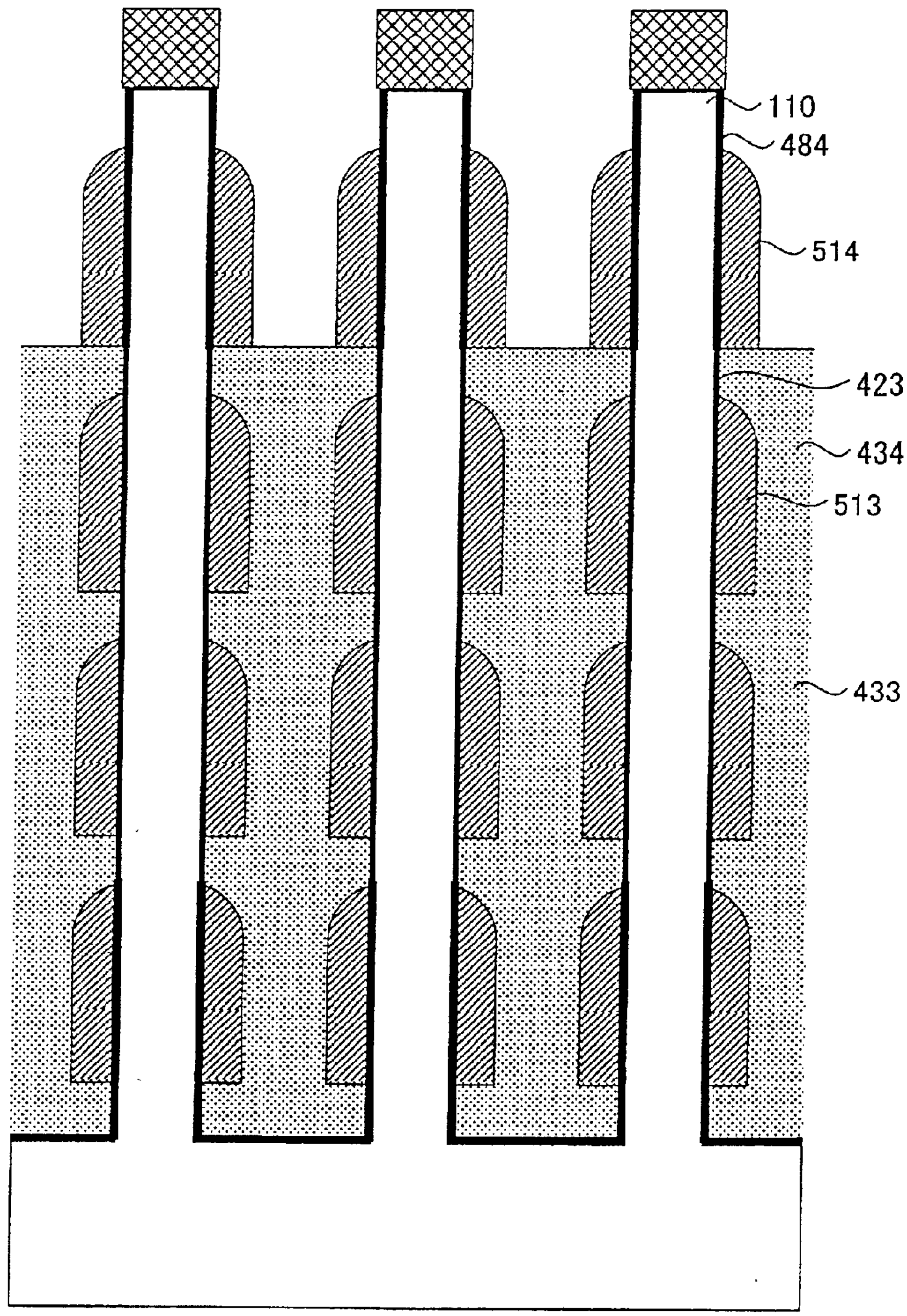

Fig. 1537
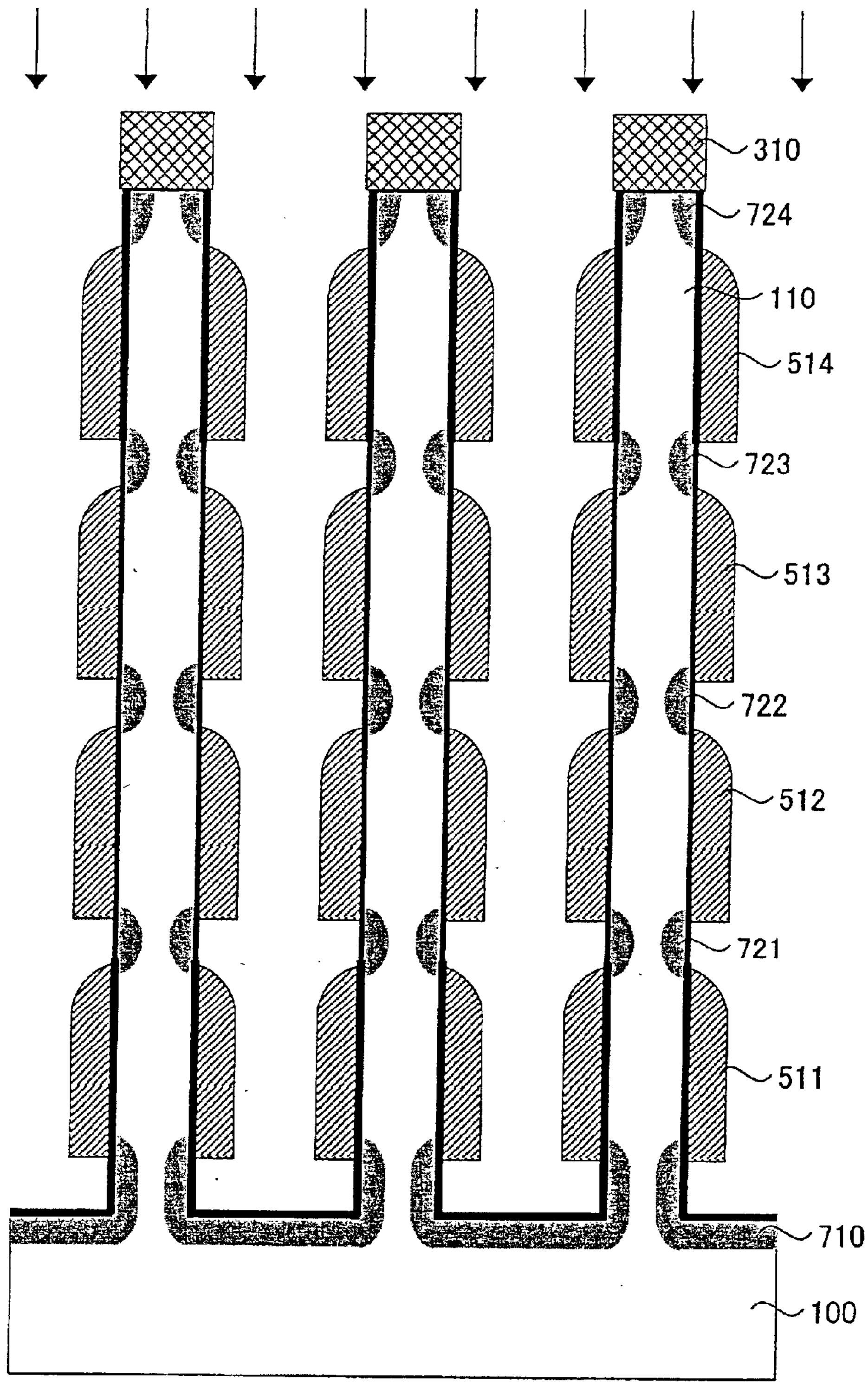

Fig. 1538
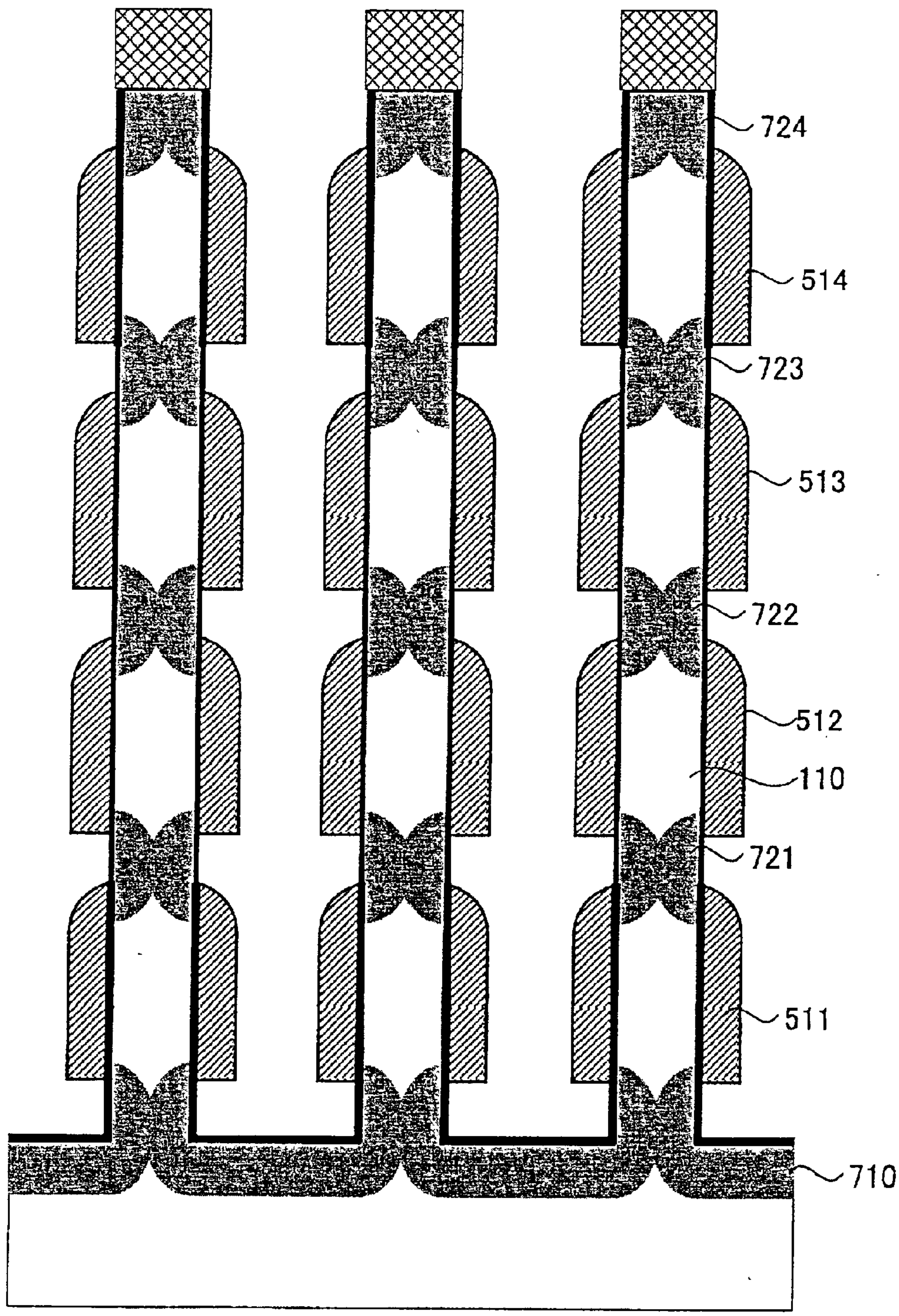

Fig. 1539
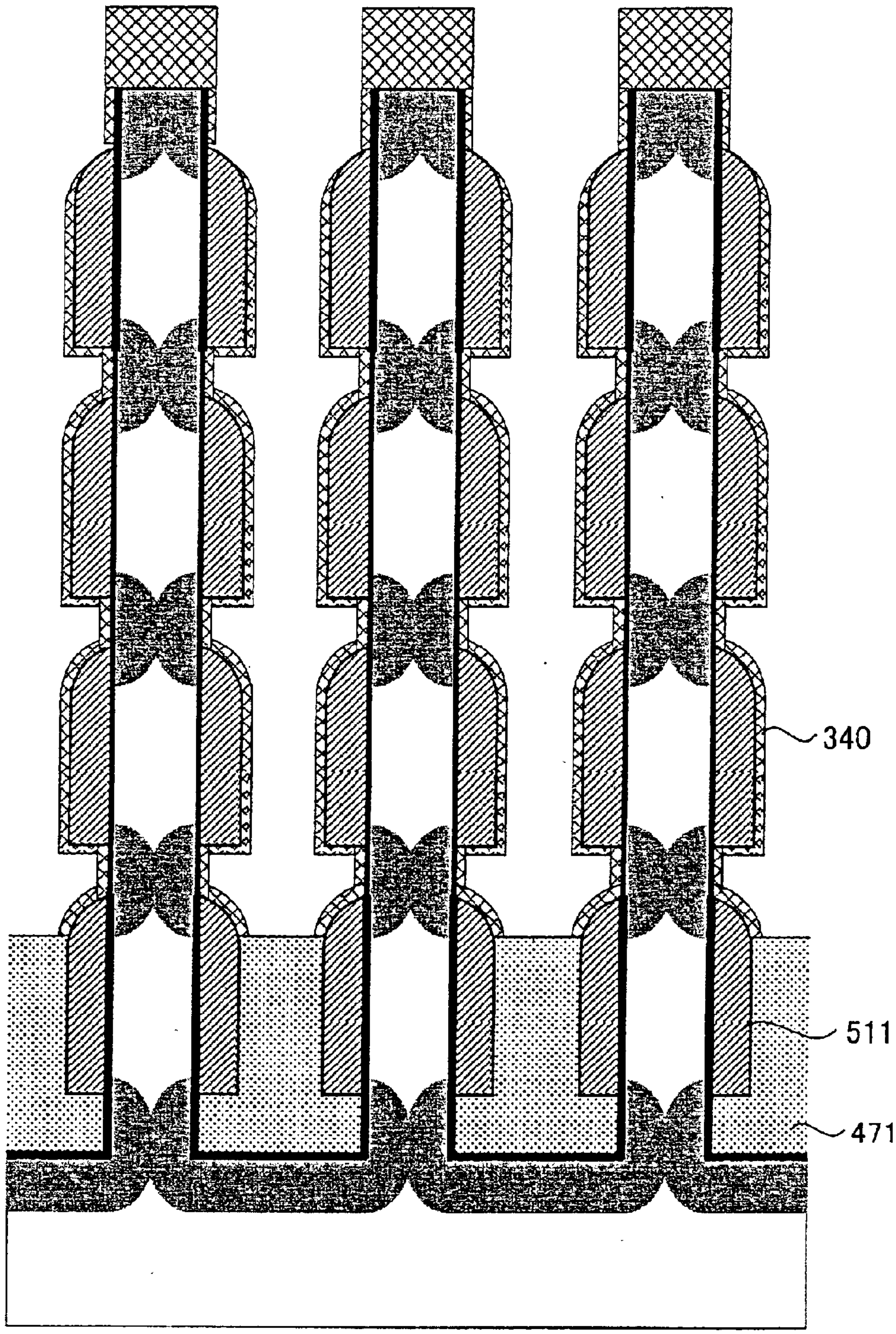

Fig. 1540
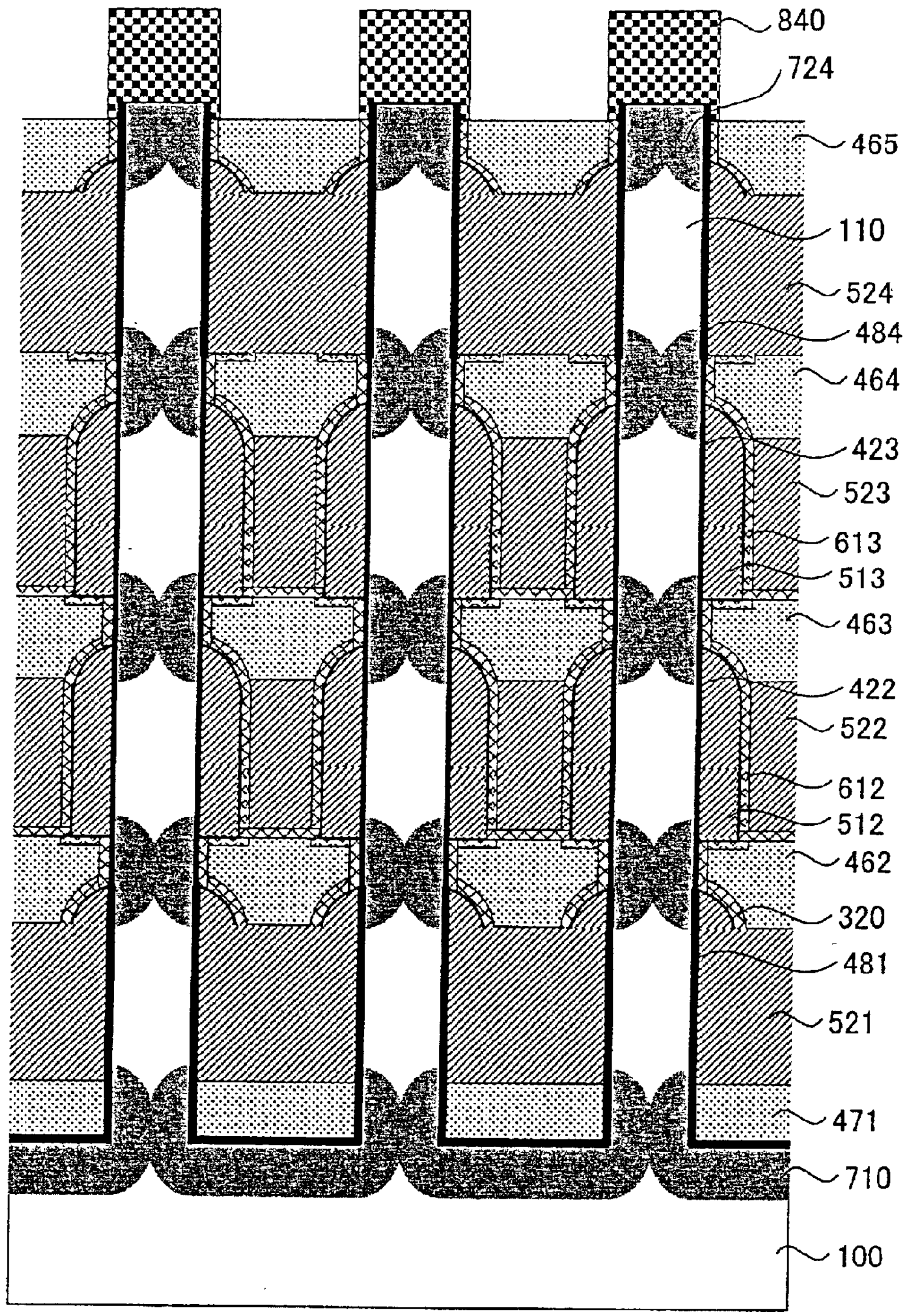

Fig. 1541
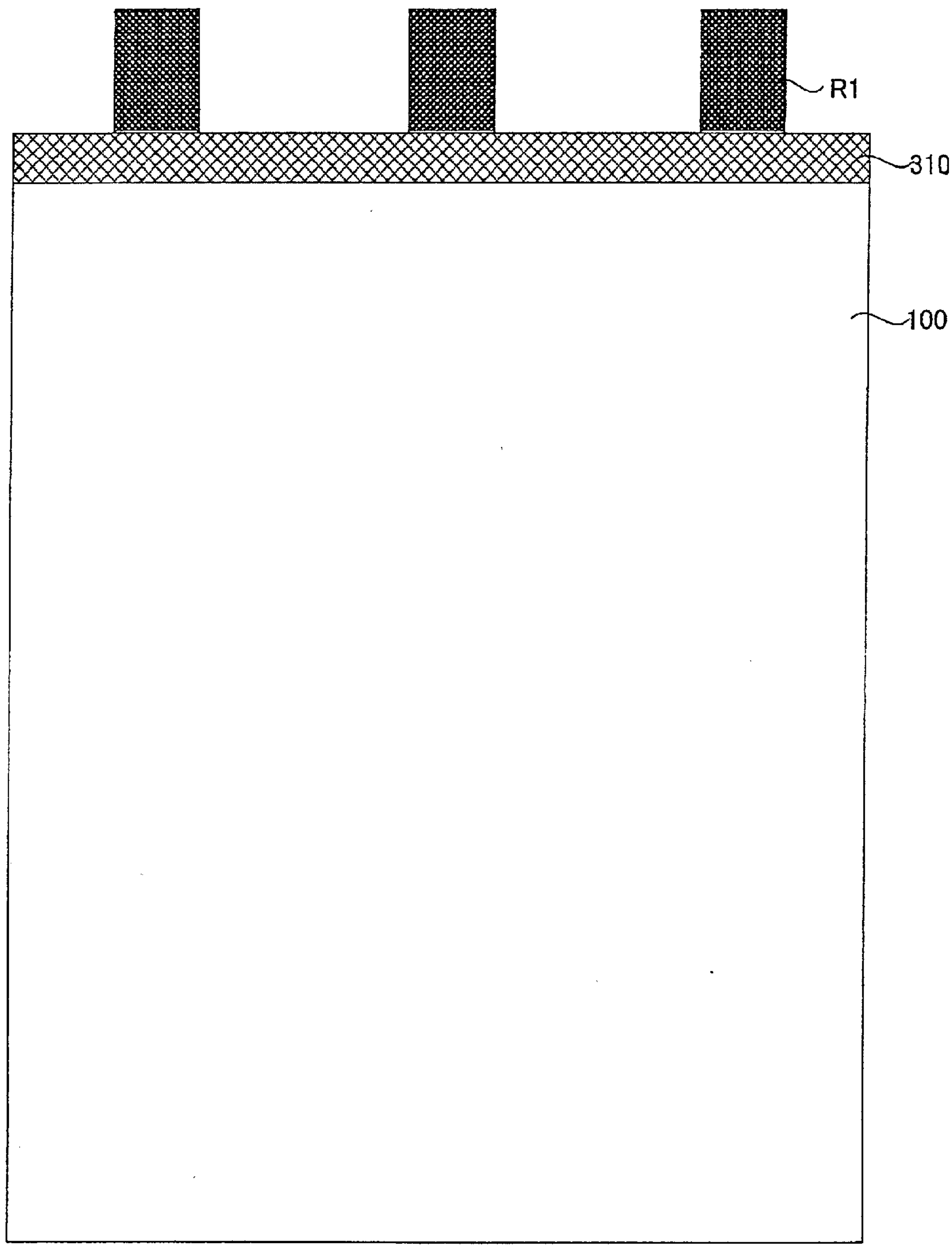

Fig. 1542
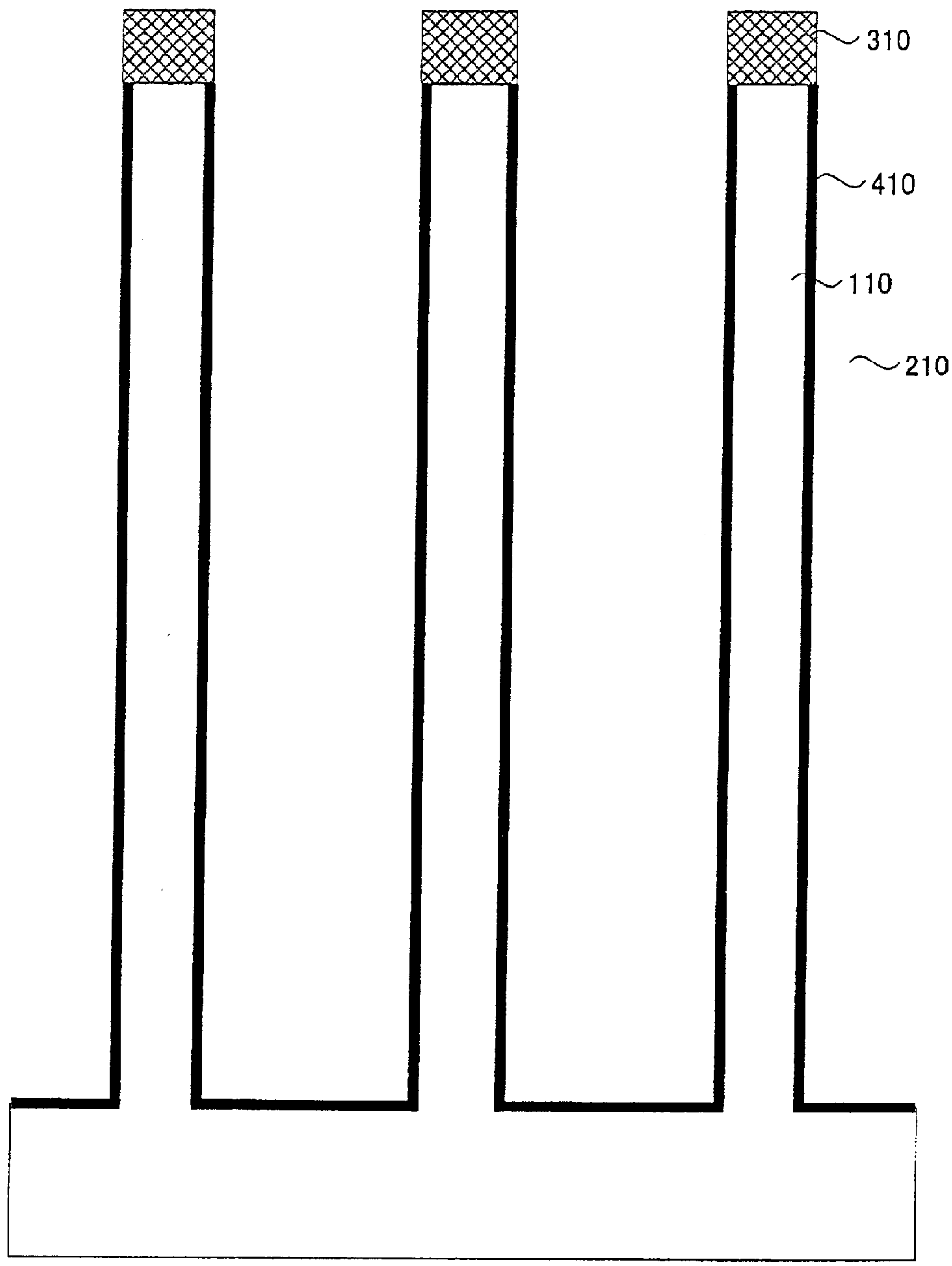

Fig. 1543
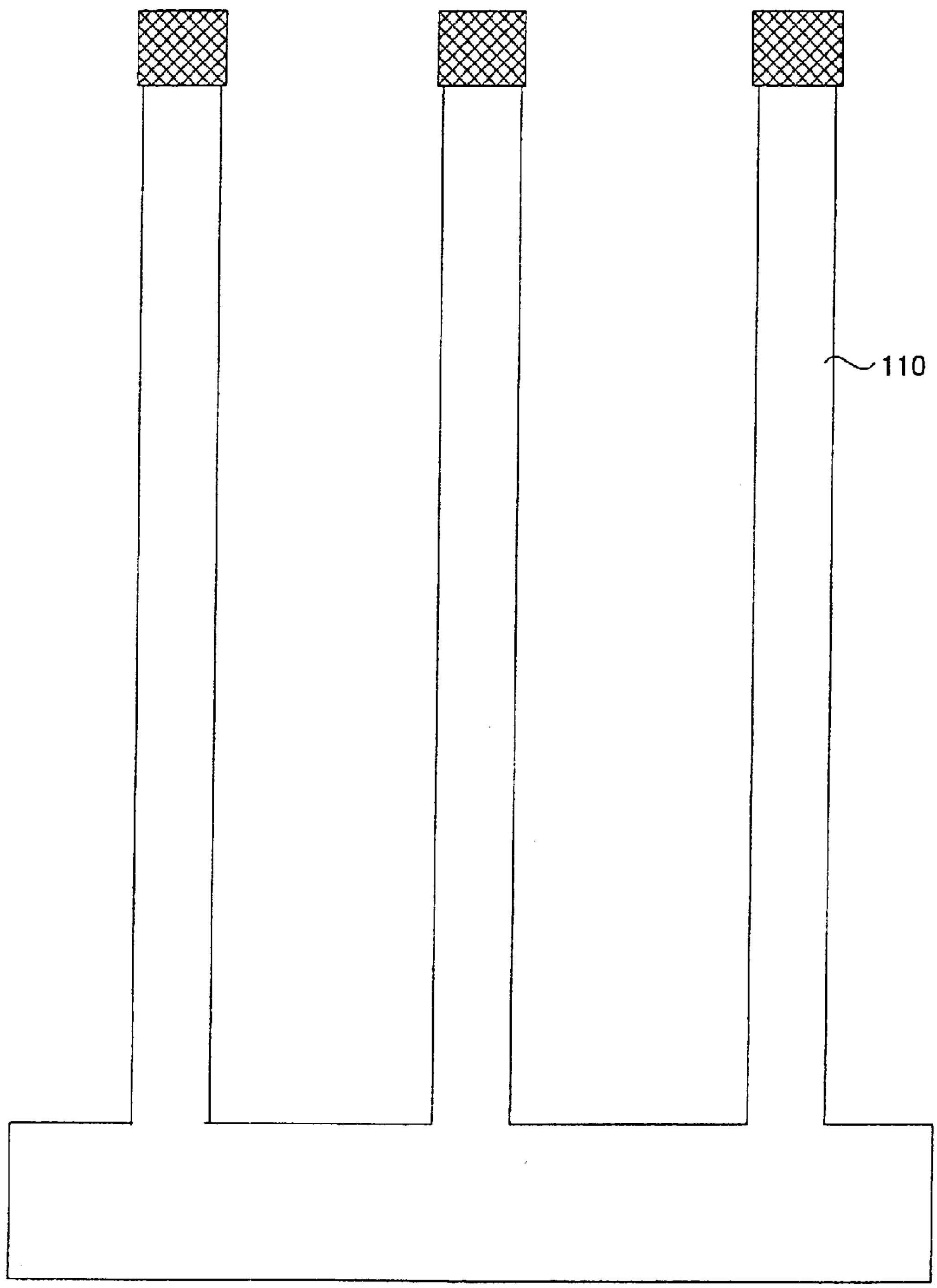

Fig. 1544
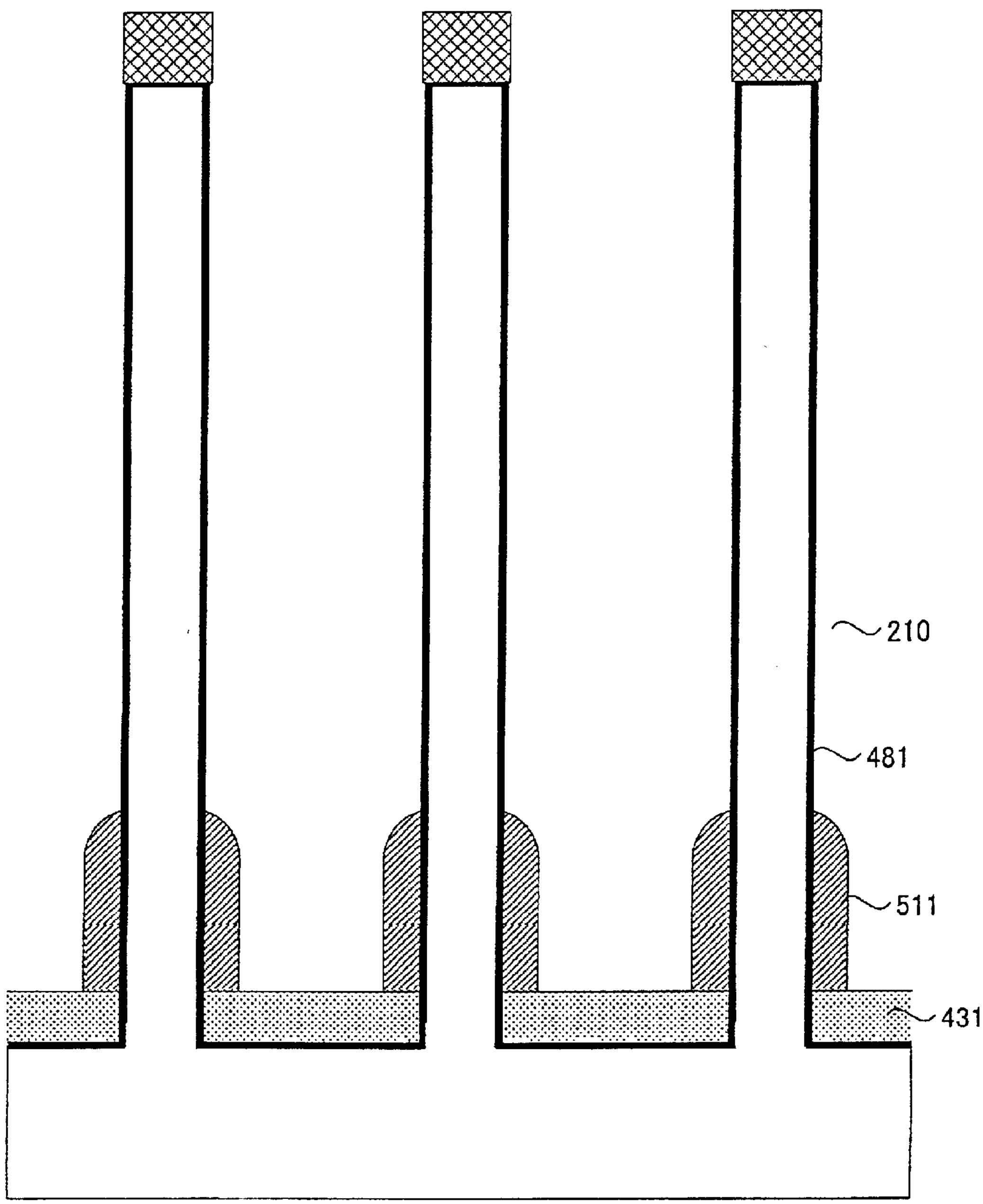

Fig. 1545
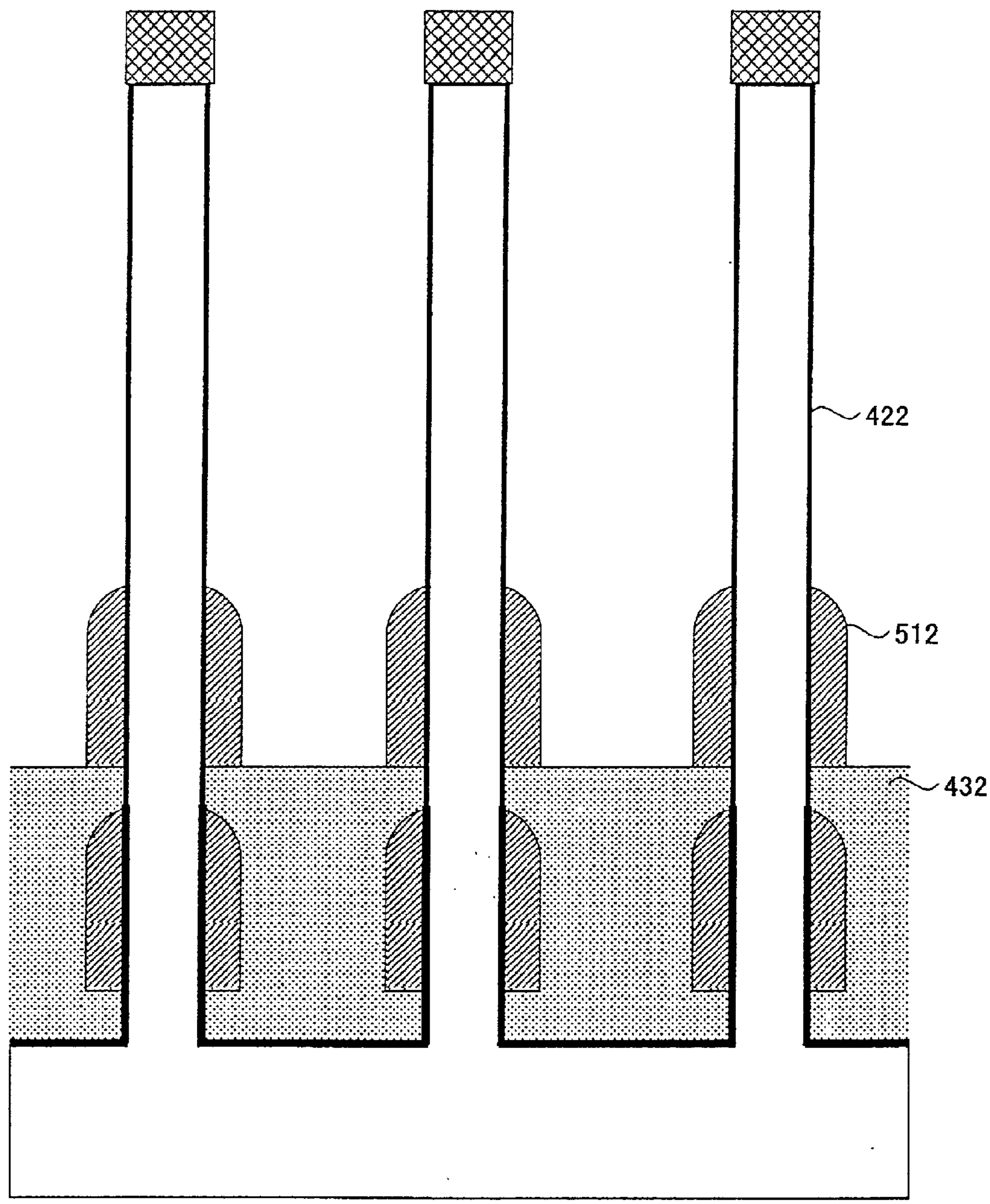

Fig. 1546
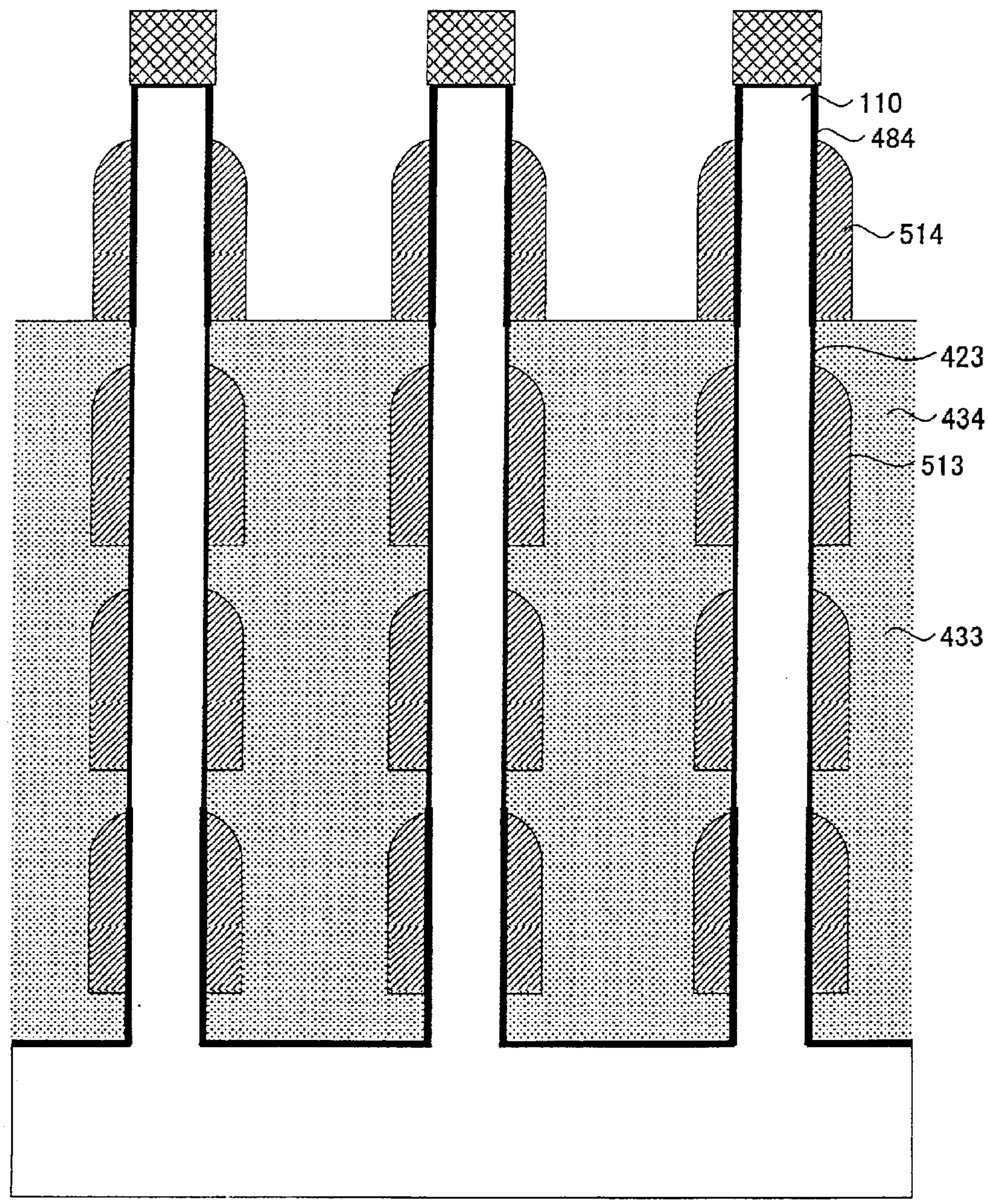

Fig. 1547
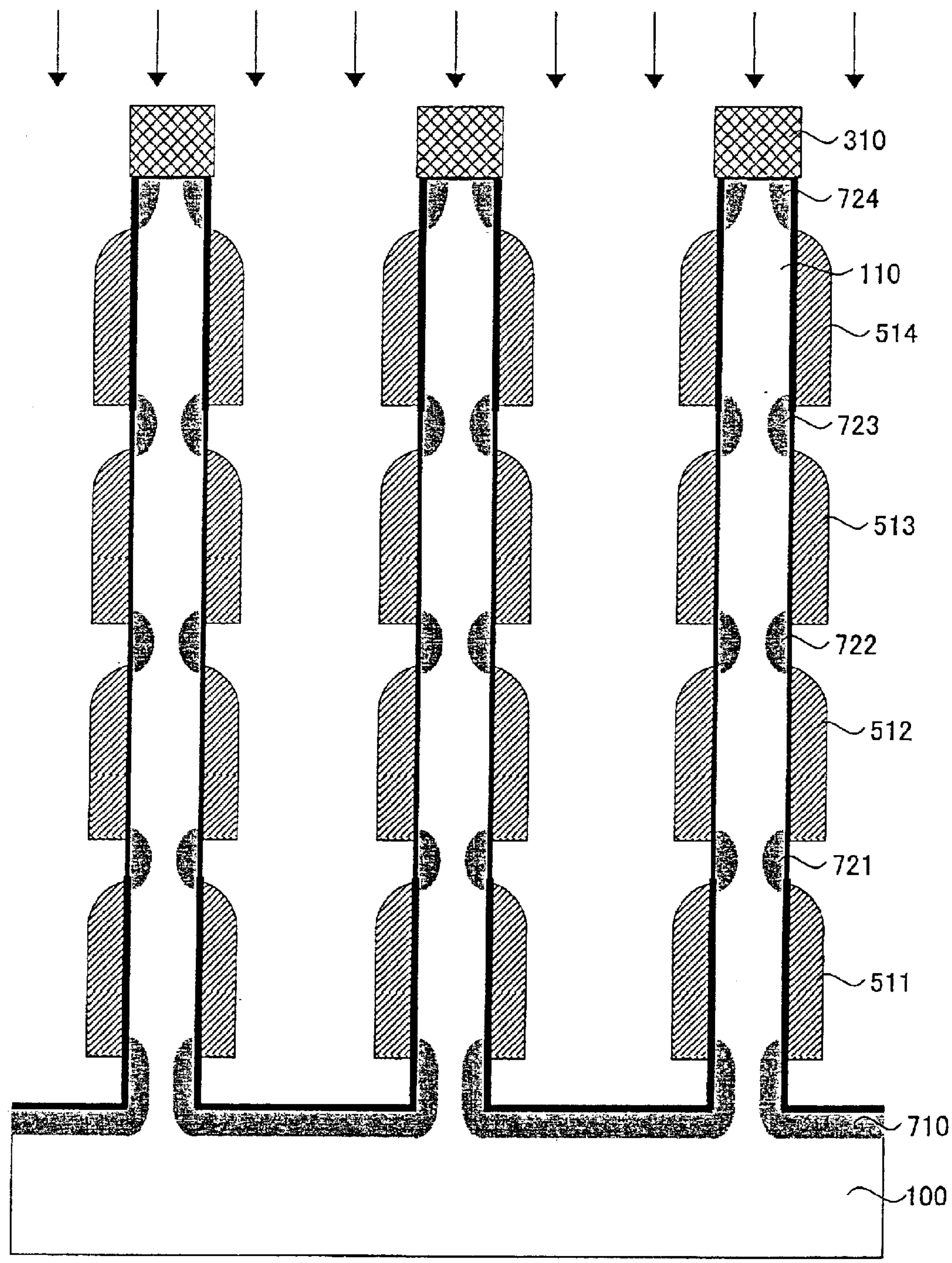

Fig. 1548
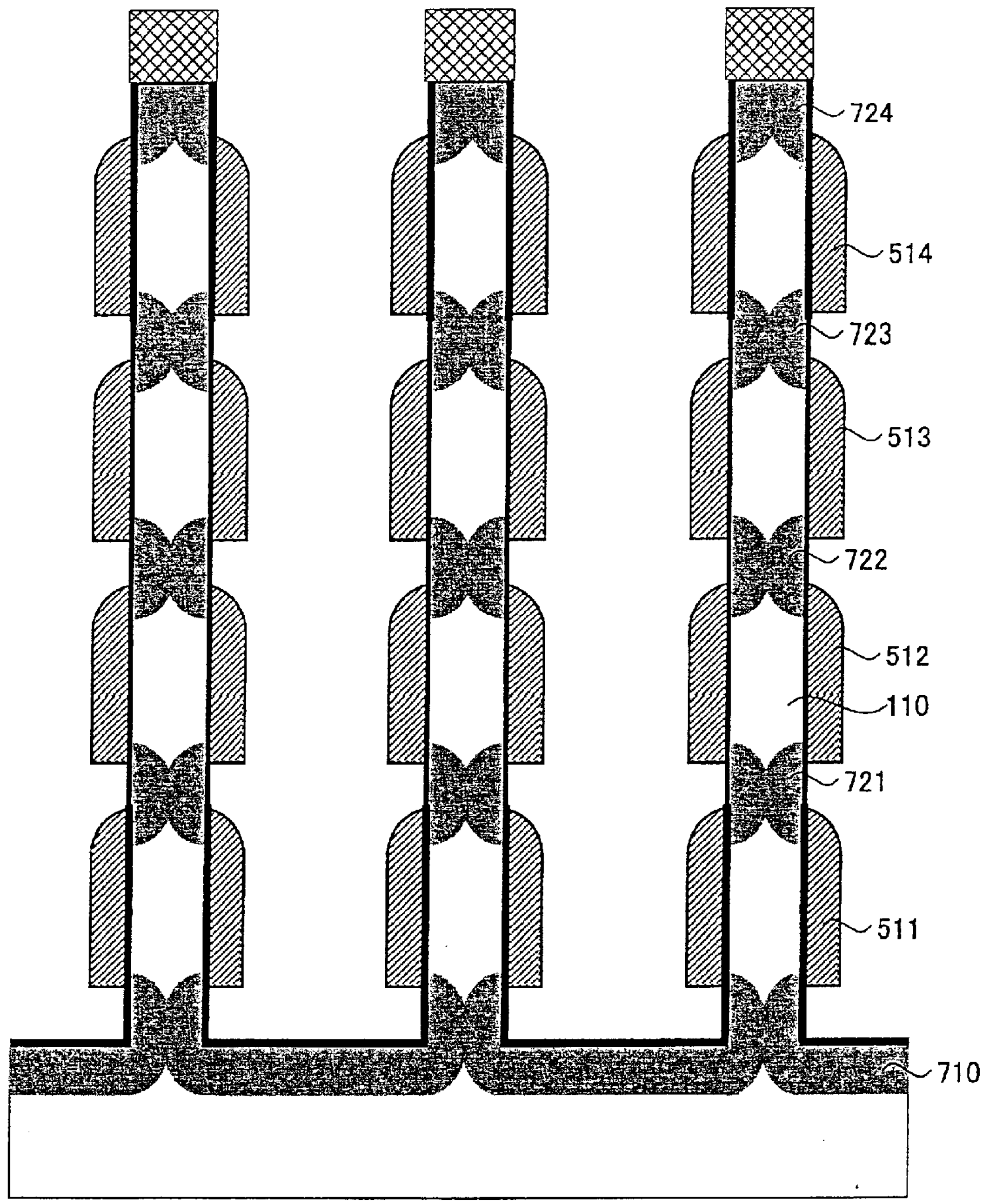

Fig. 1549
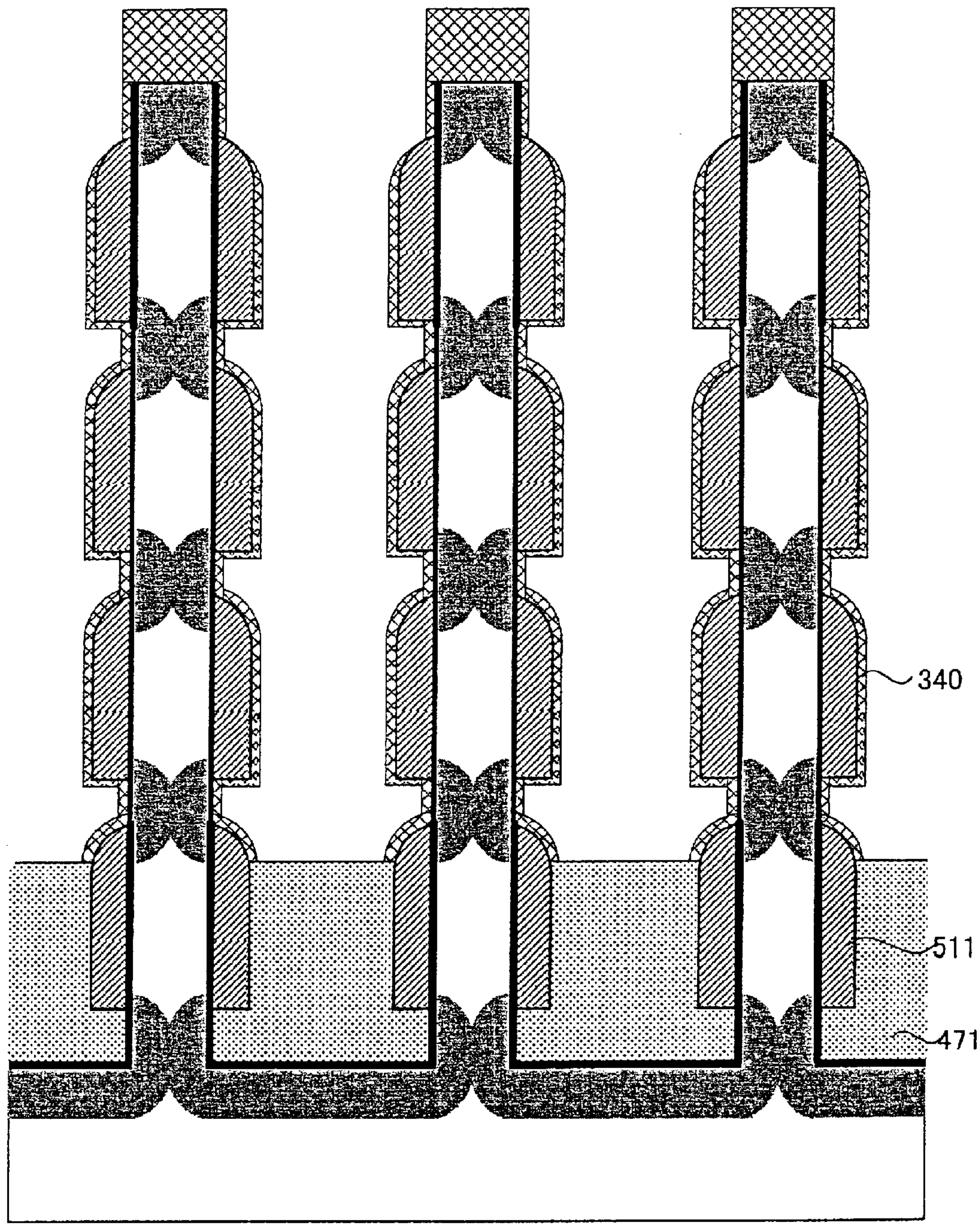

Fig. 1550
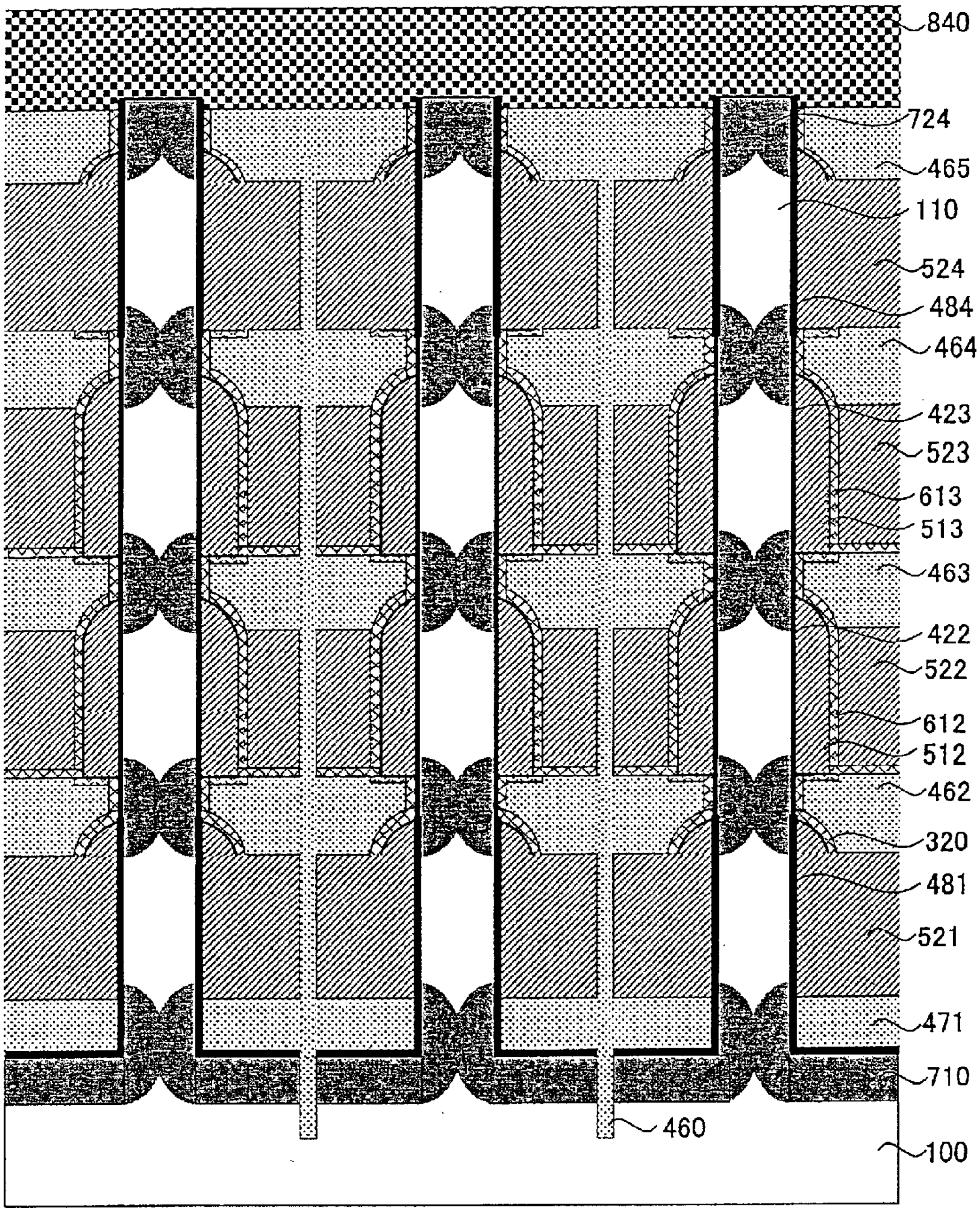

Fig. 1551
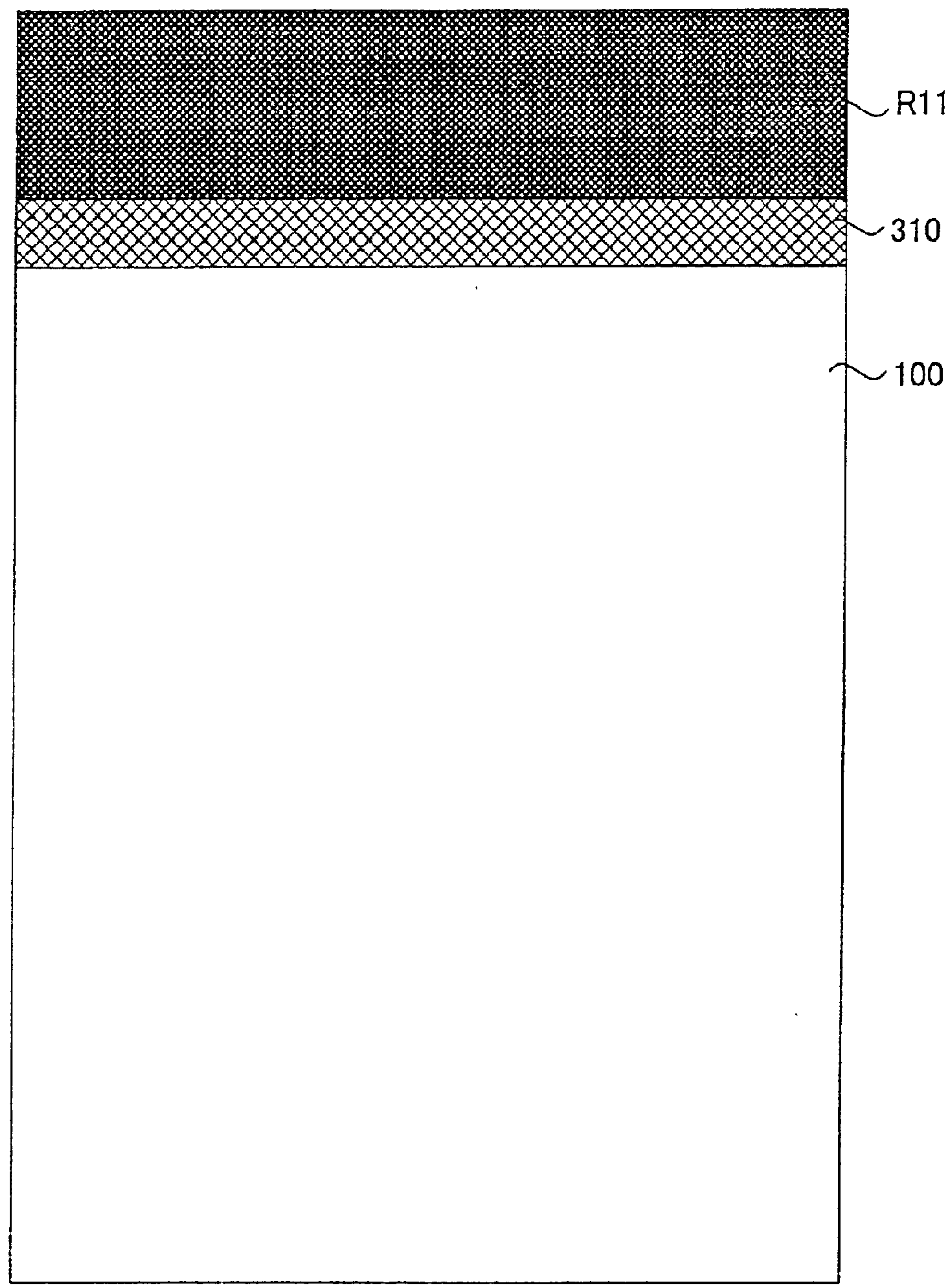

Fig. 1552
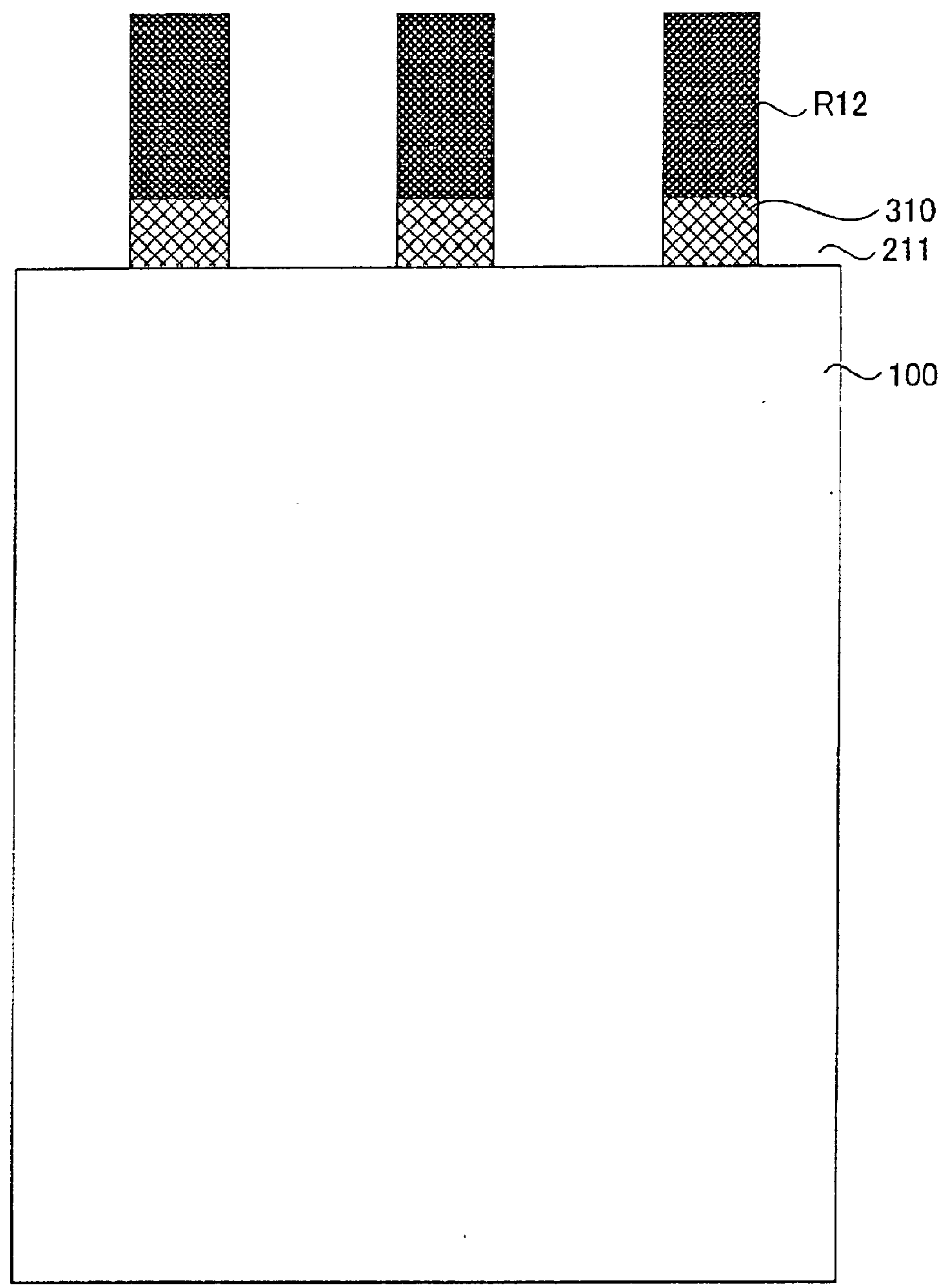

Fig. 1553
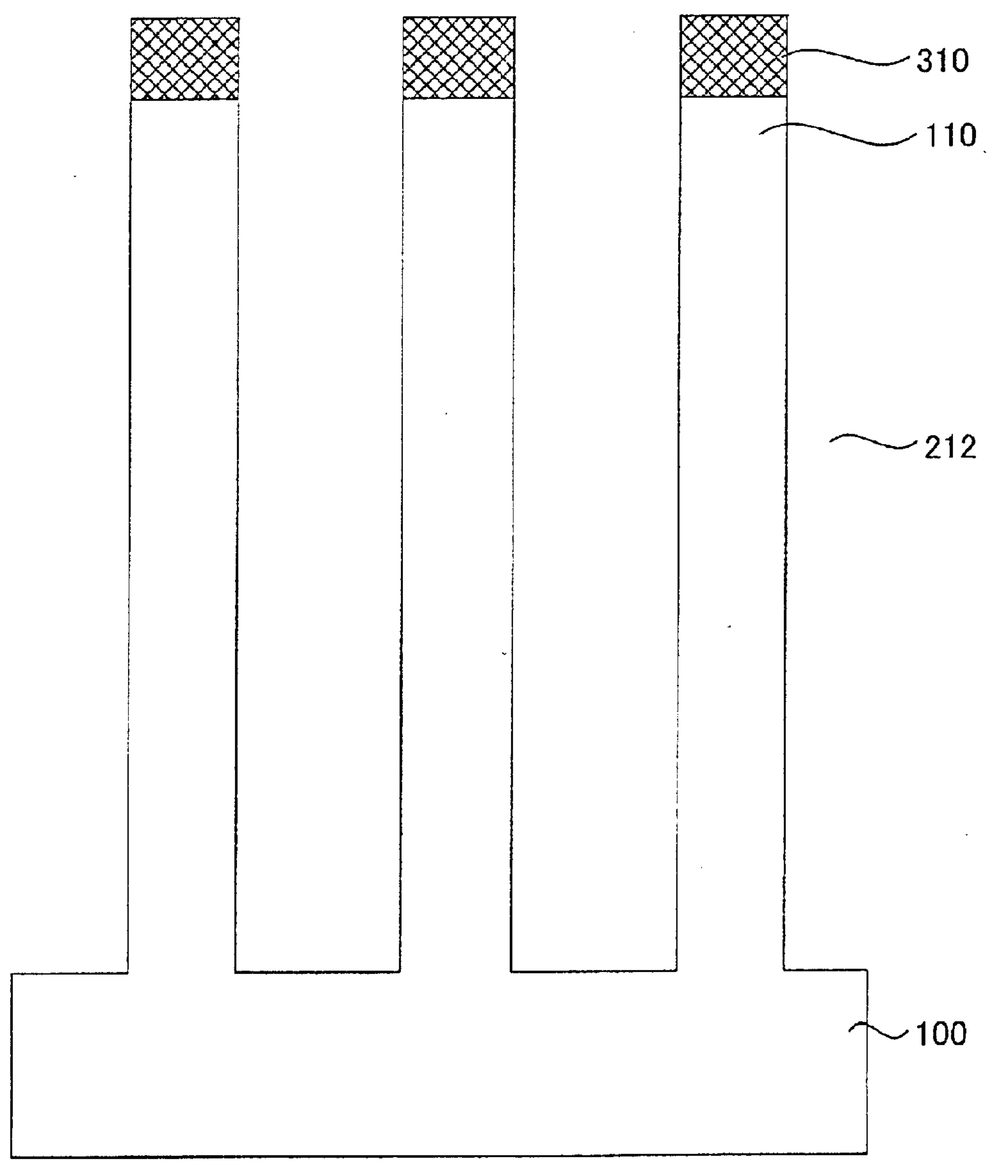

Fig. 1554
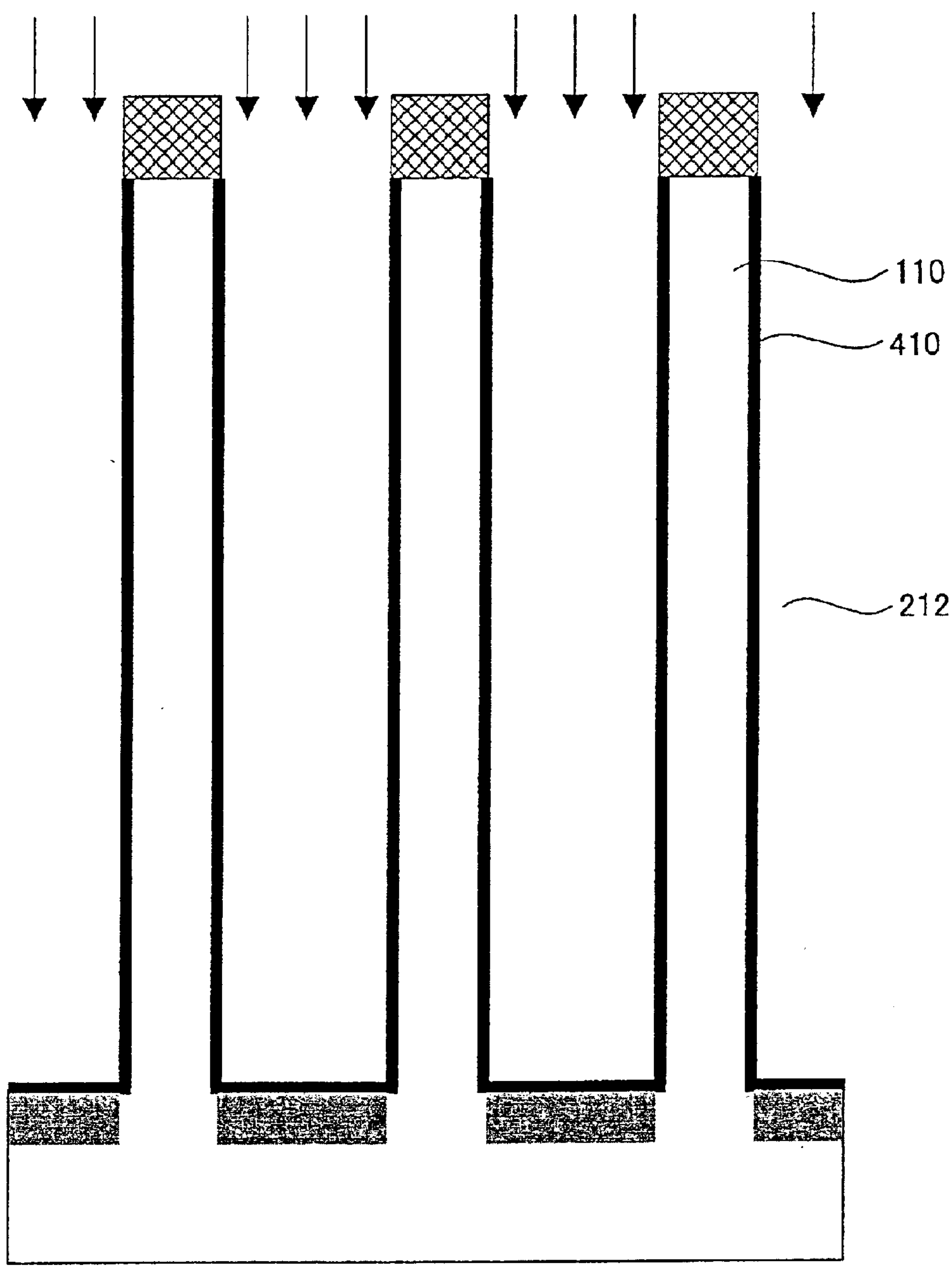

Fig. 1555
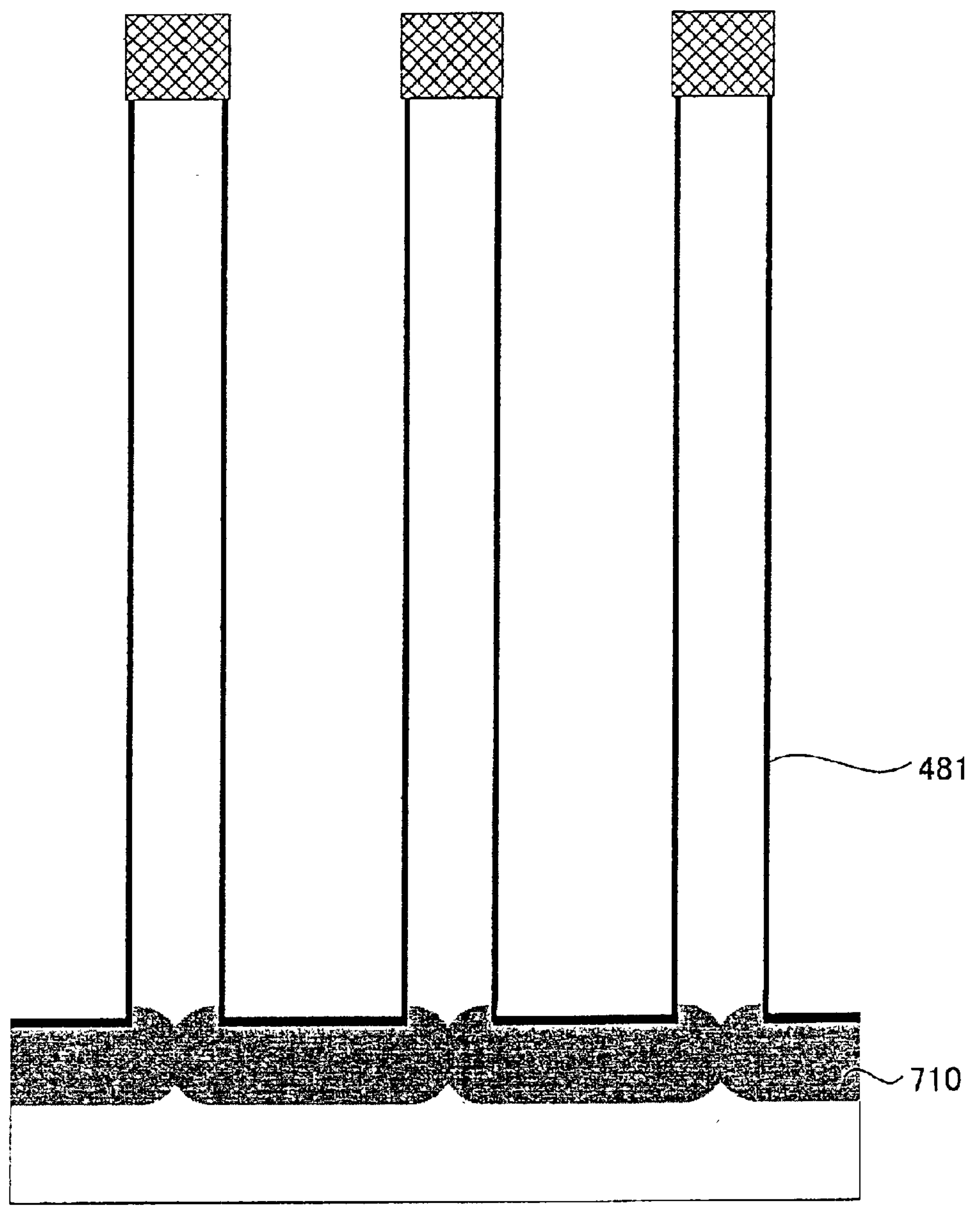

Fig. 1556
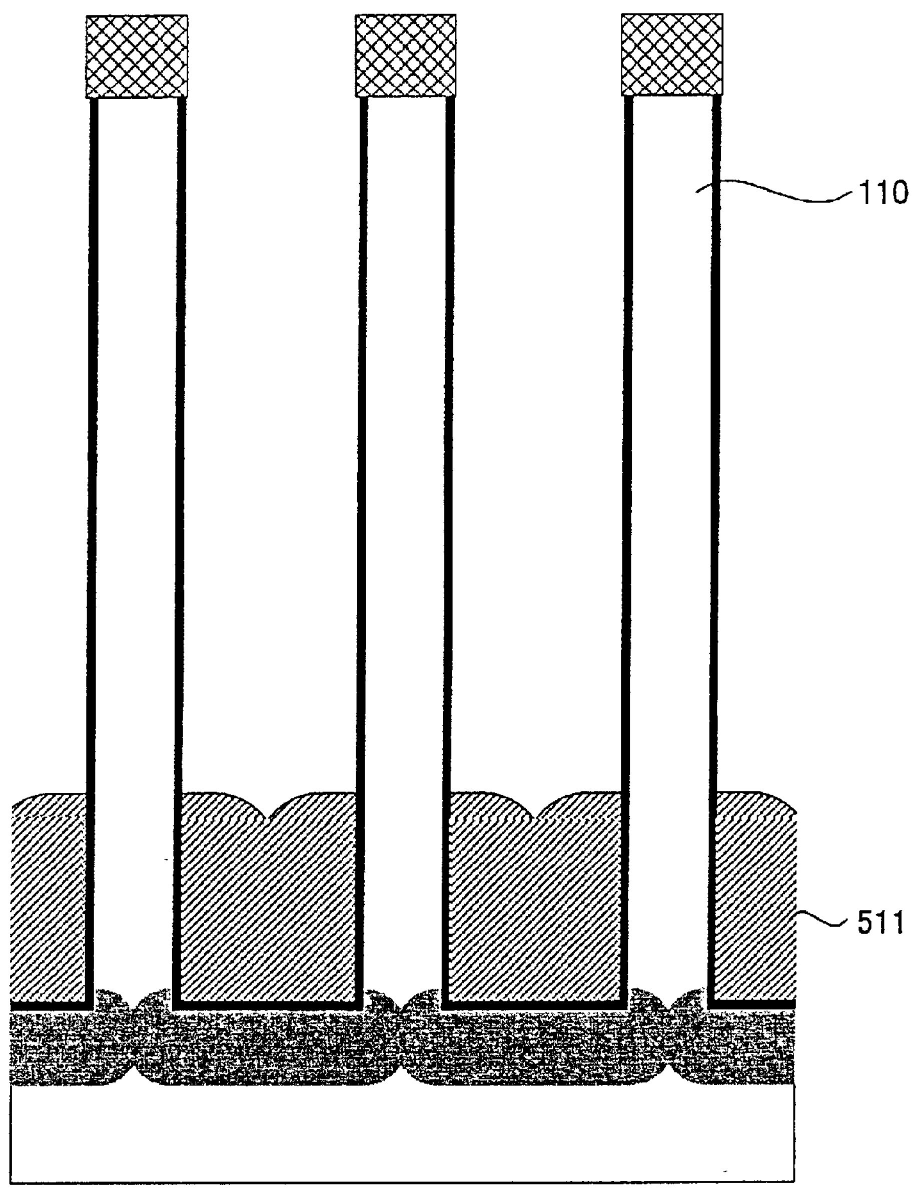

Fig. 1557
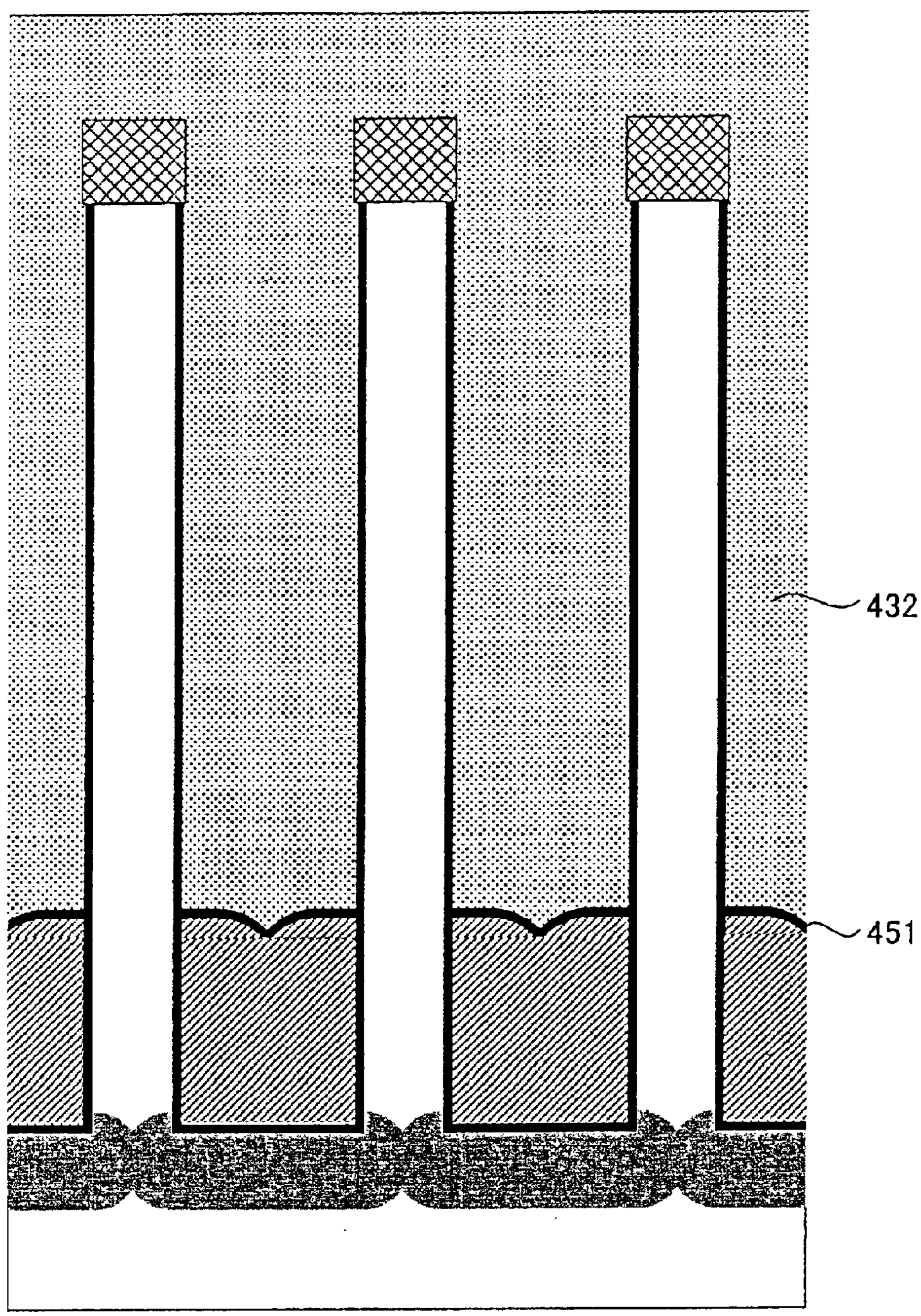

Fig. 1558
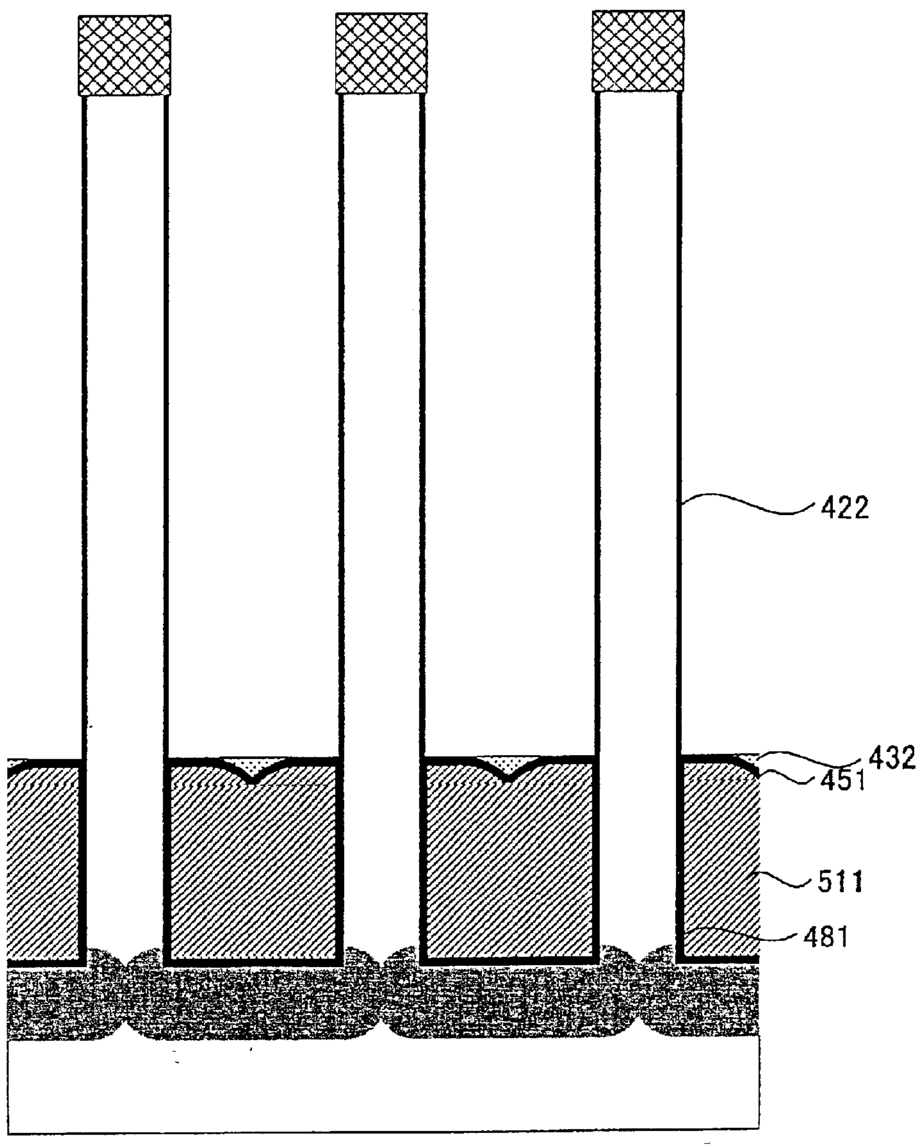

Fig. 1559
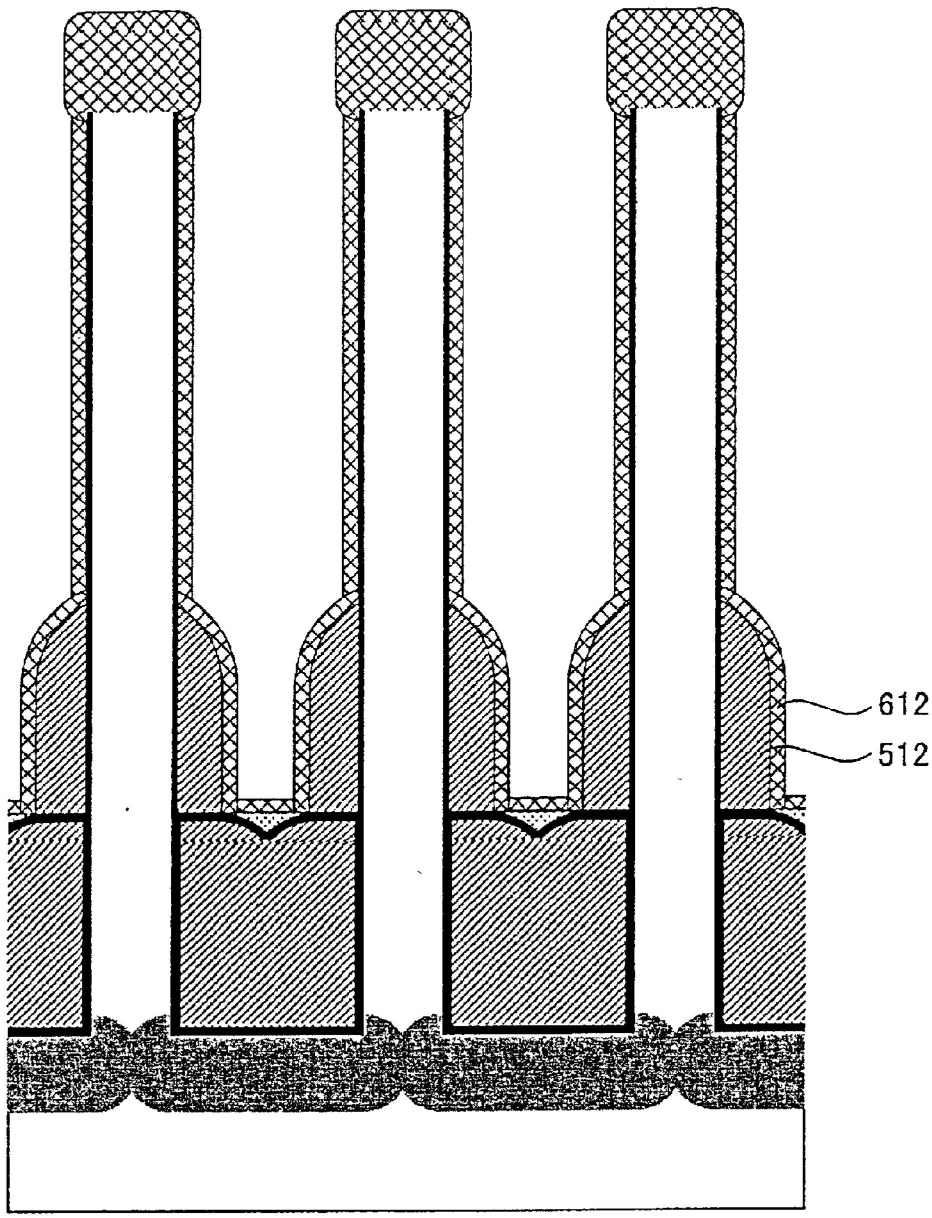

Fig. 1560
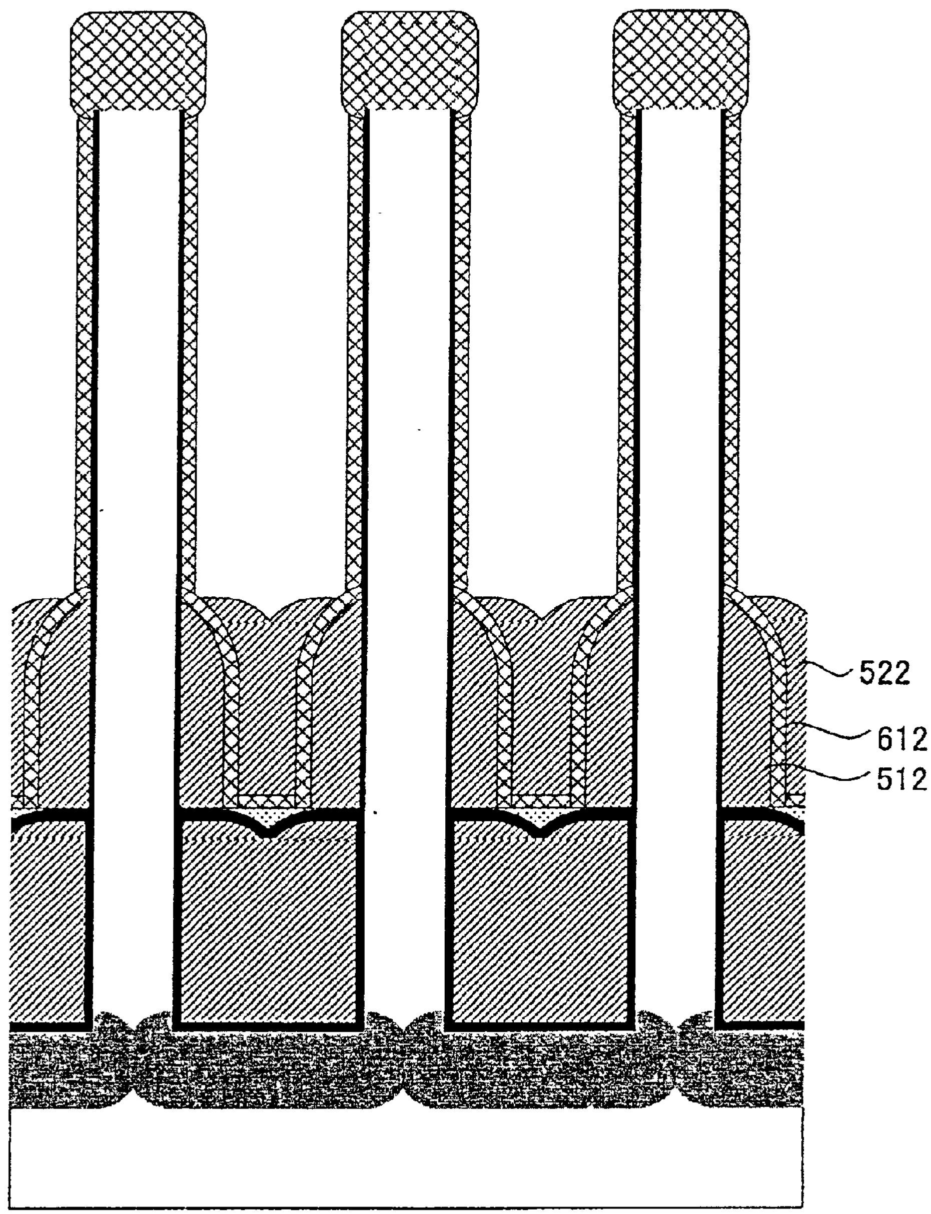

Fig. 1561
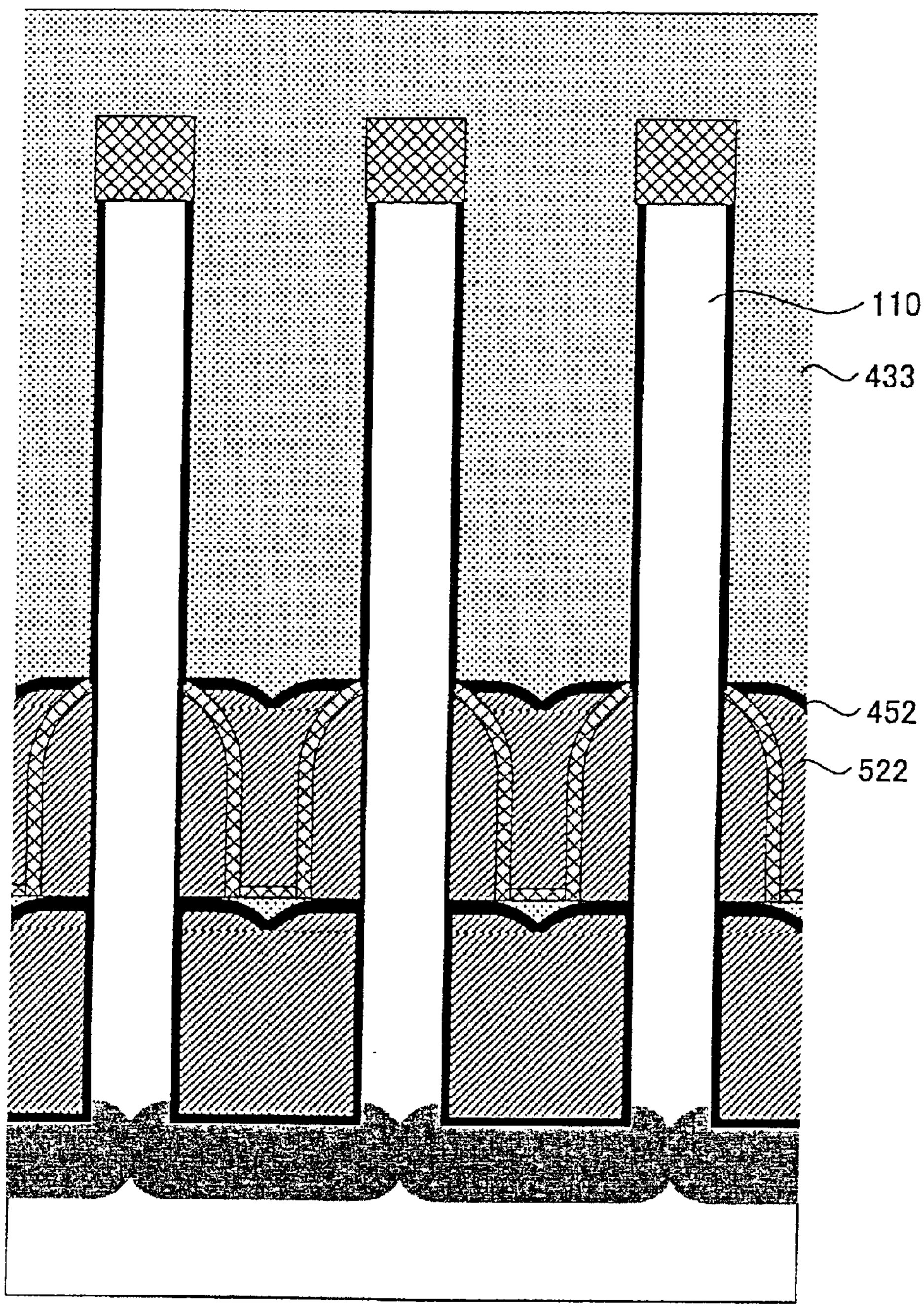

Fig. 1562
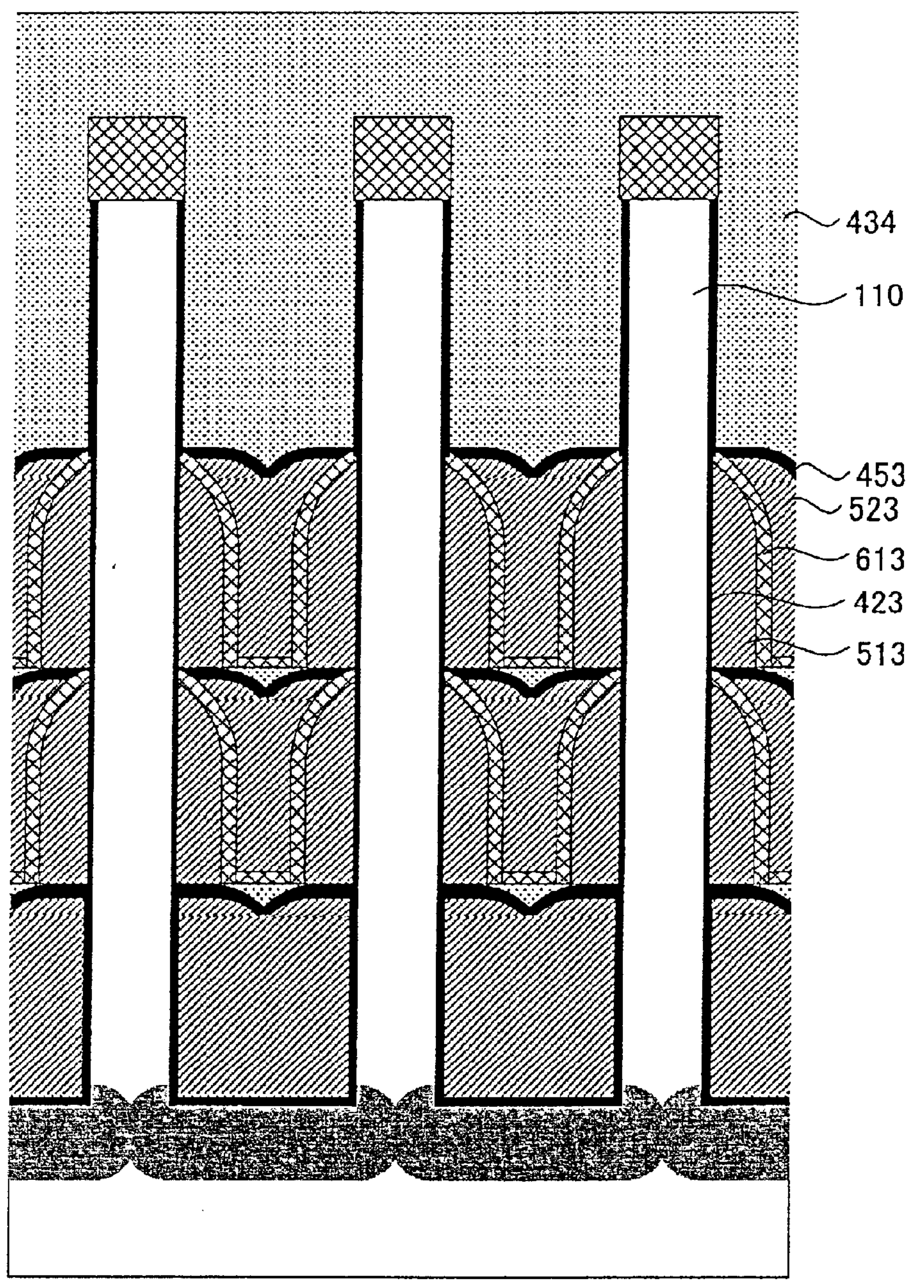

Fig. 1563
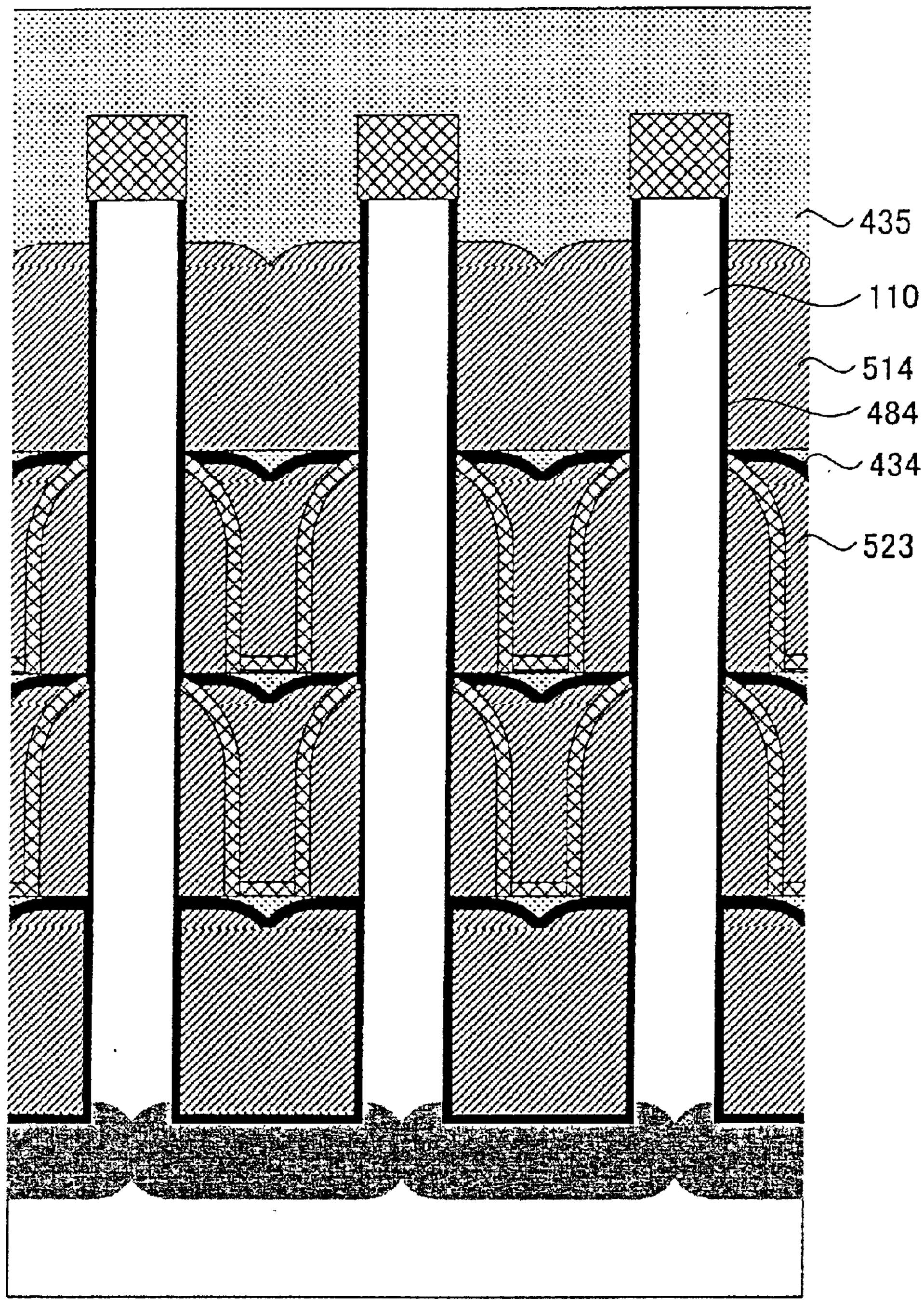

Fig. 1564
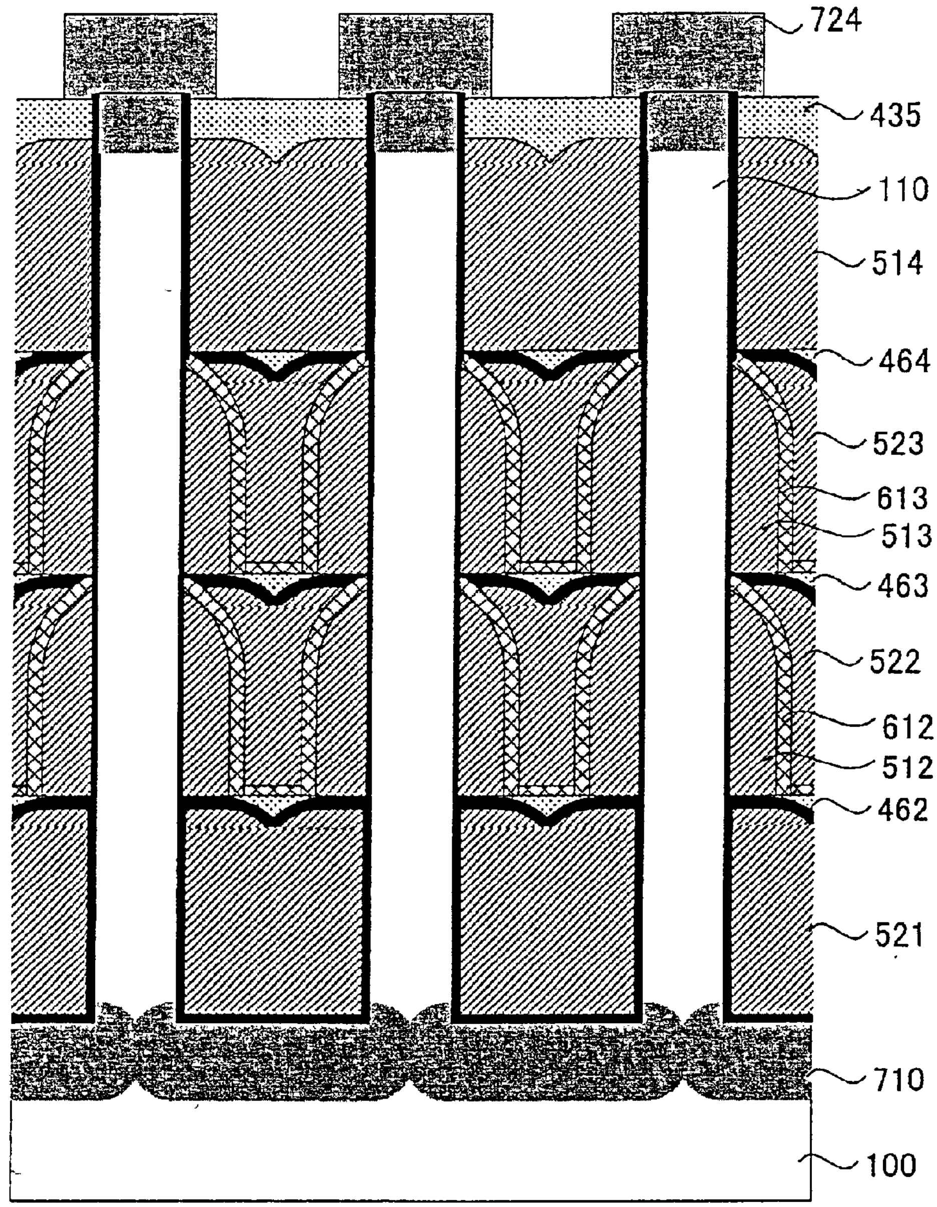

Fig. 1565
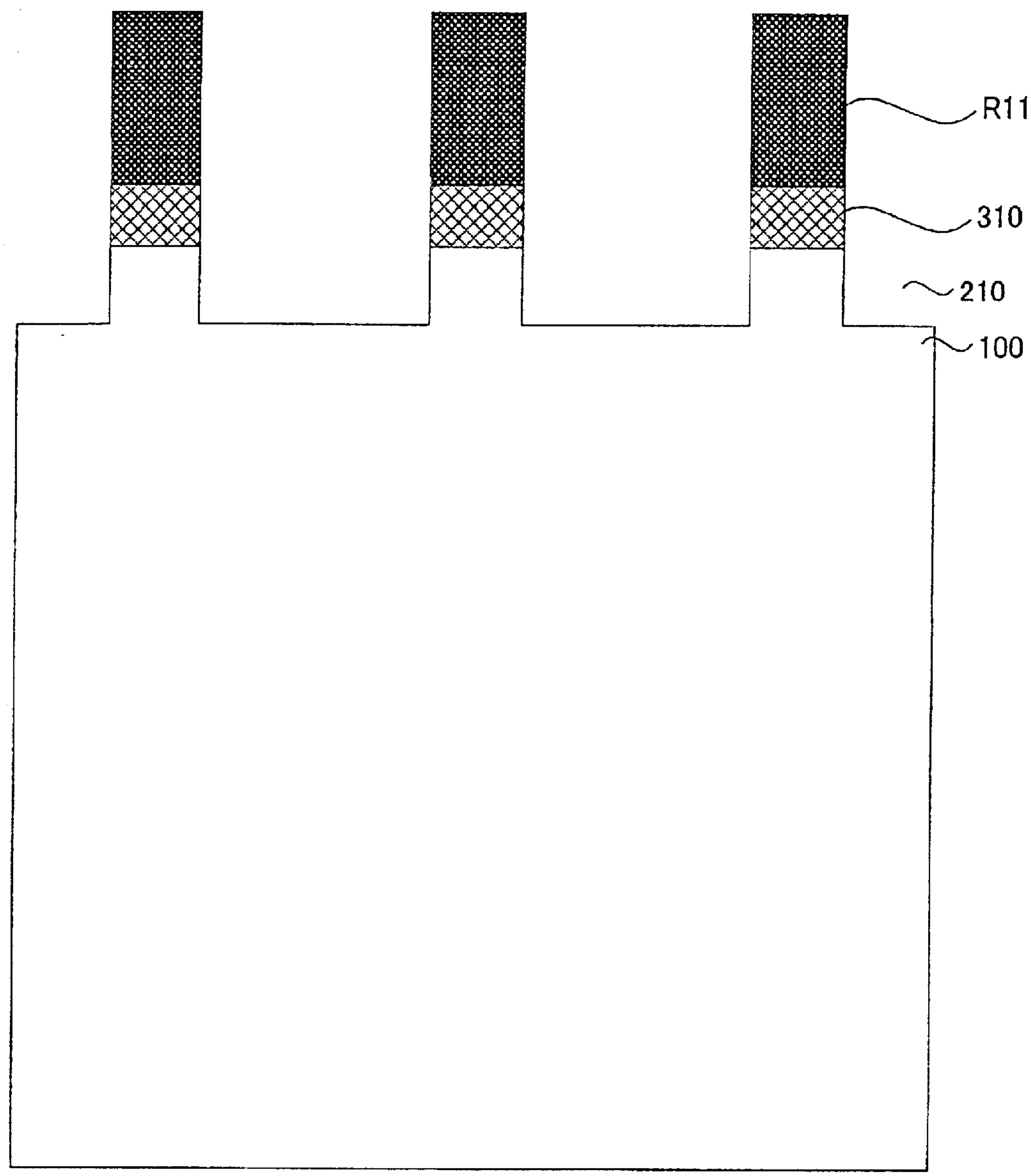

Fig. 1566
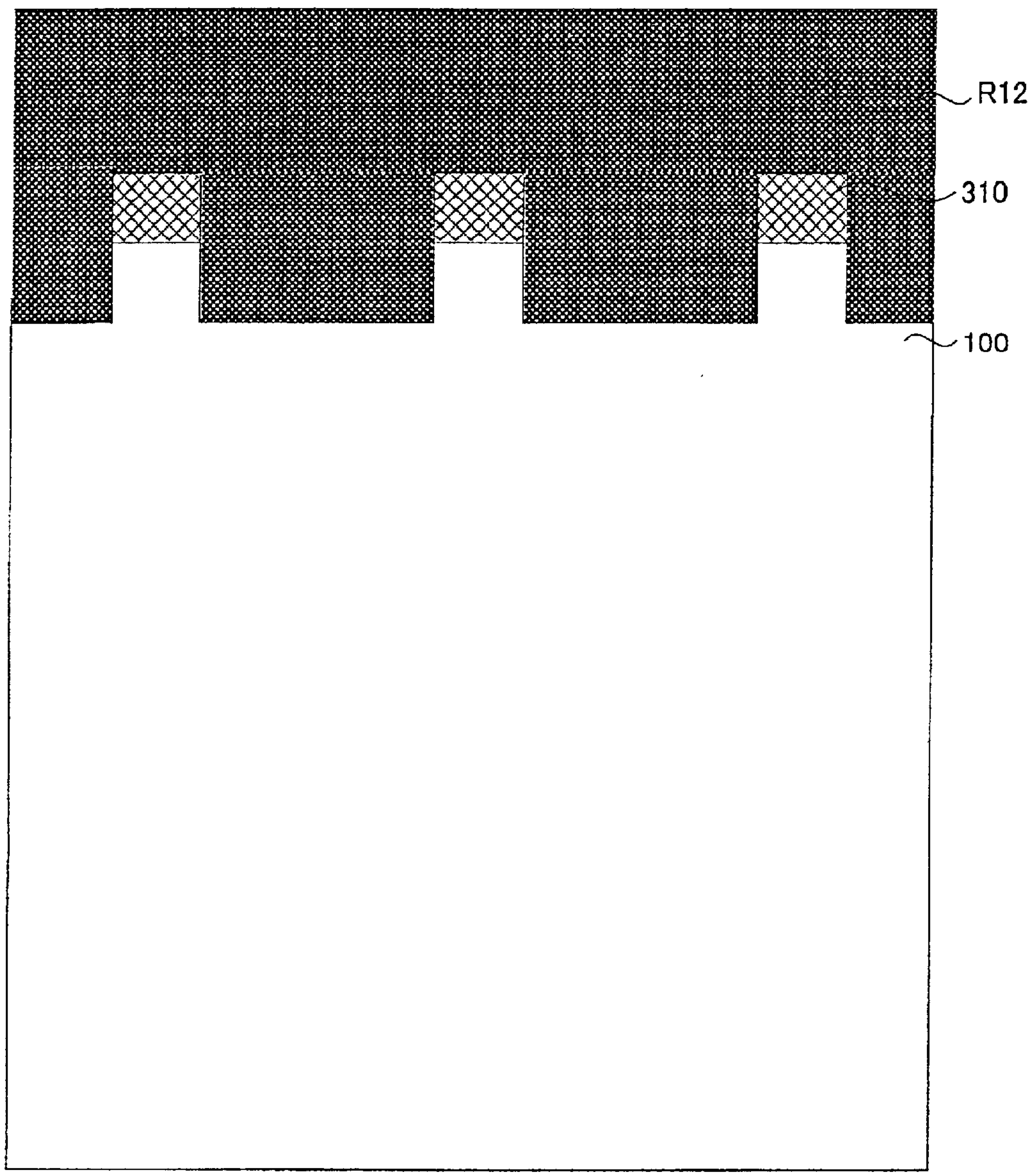

Fig. 1567
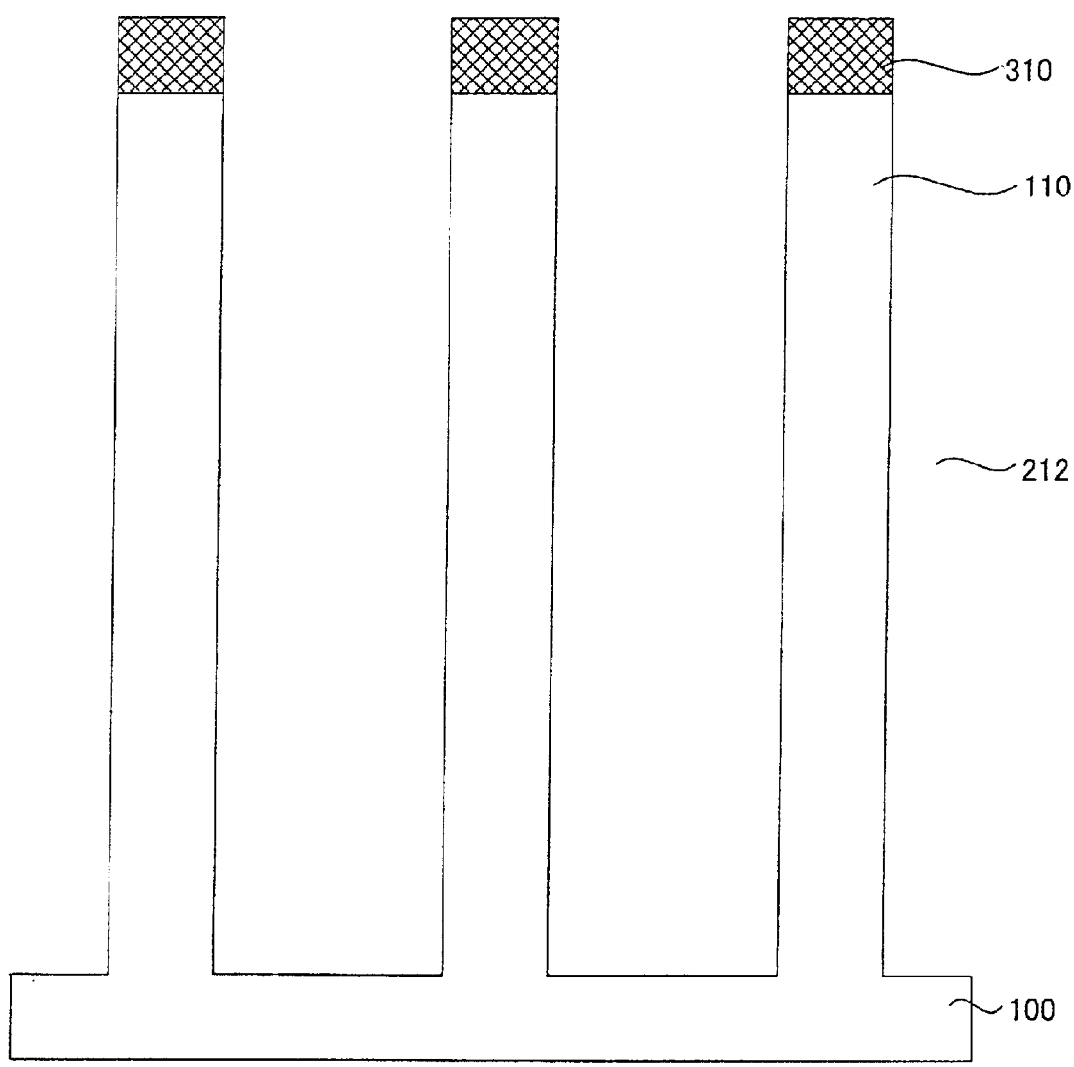

Fig. 1568
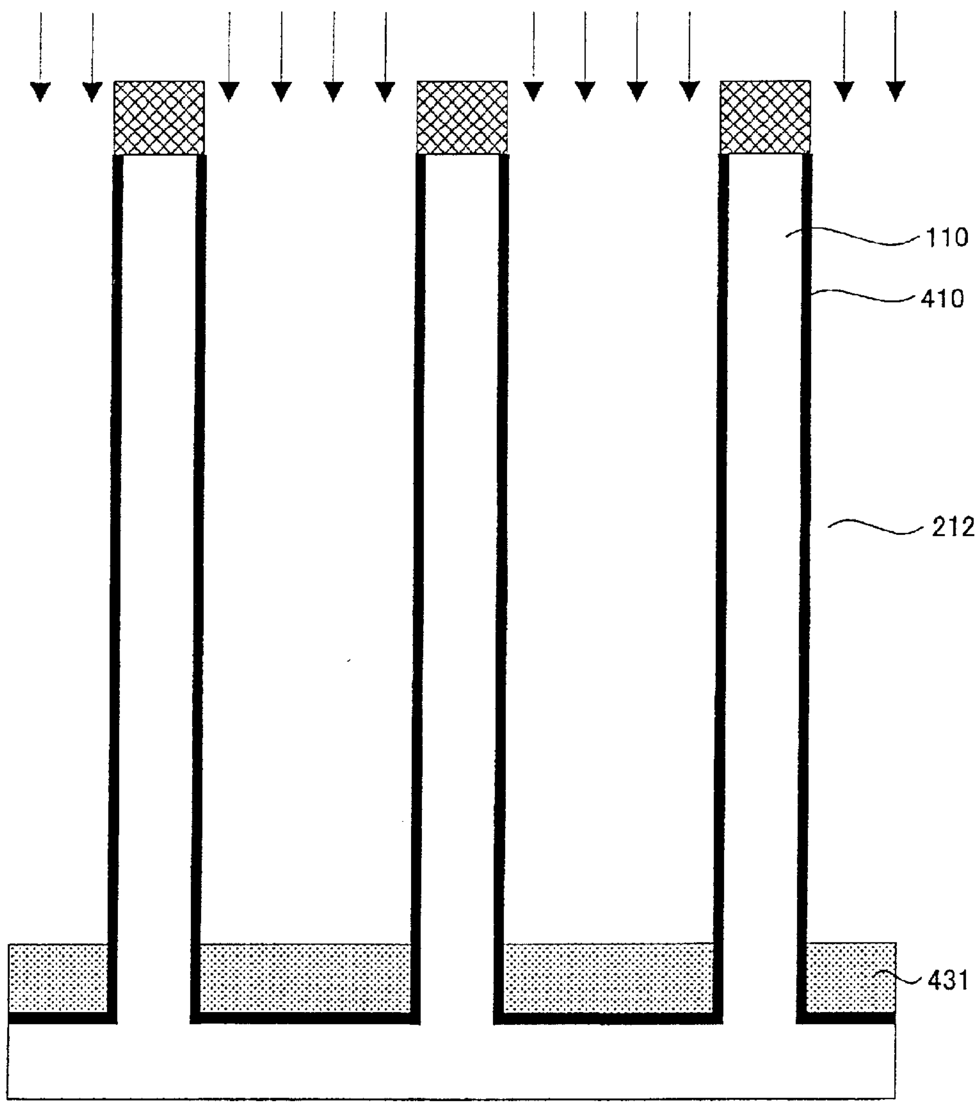

Fig. 1569
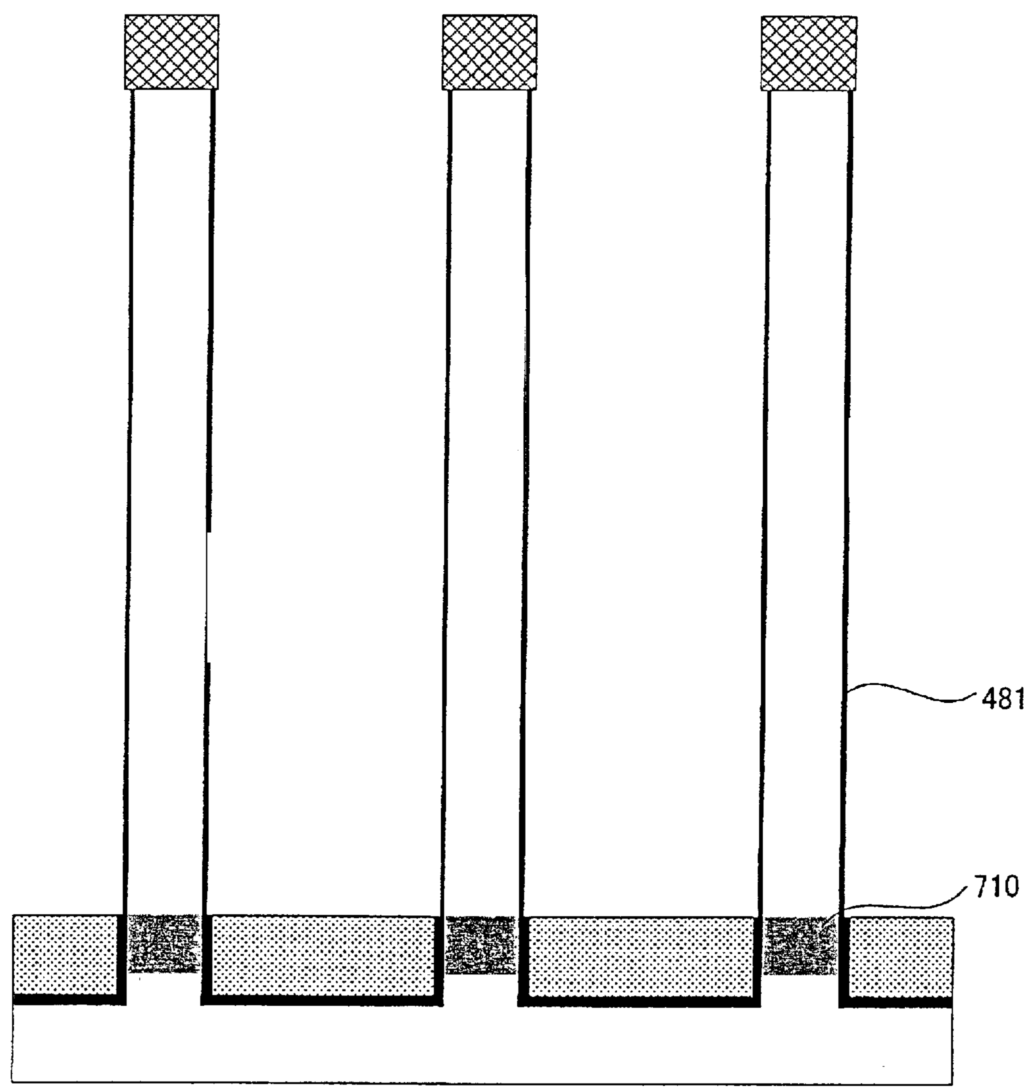

Fig. 1570
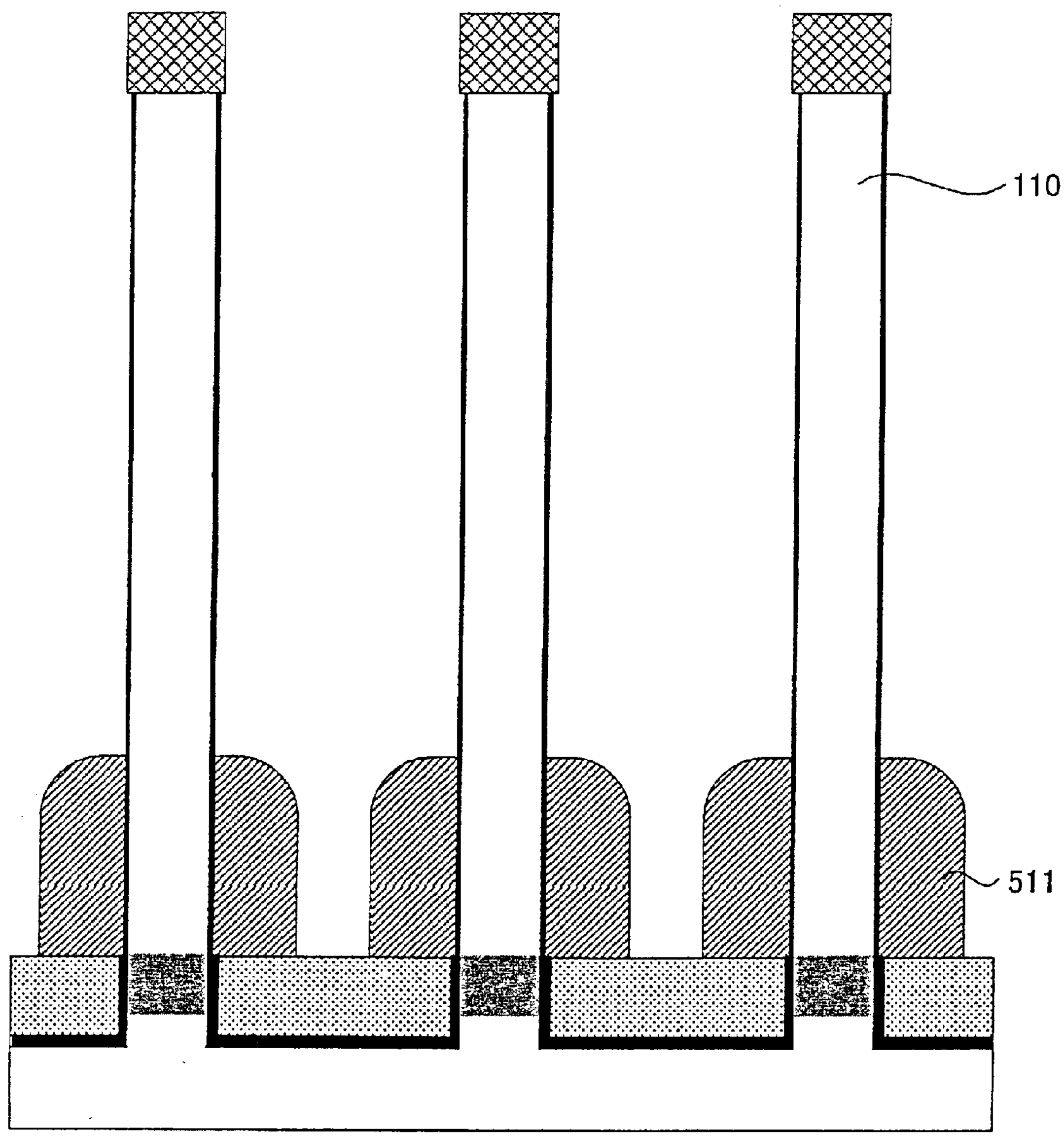

Fig. 1571
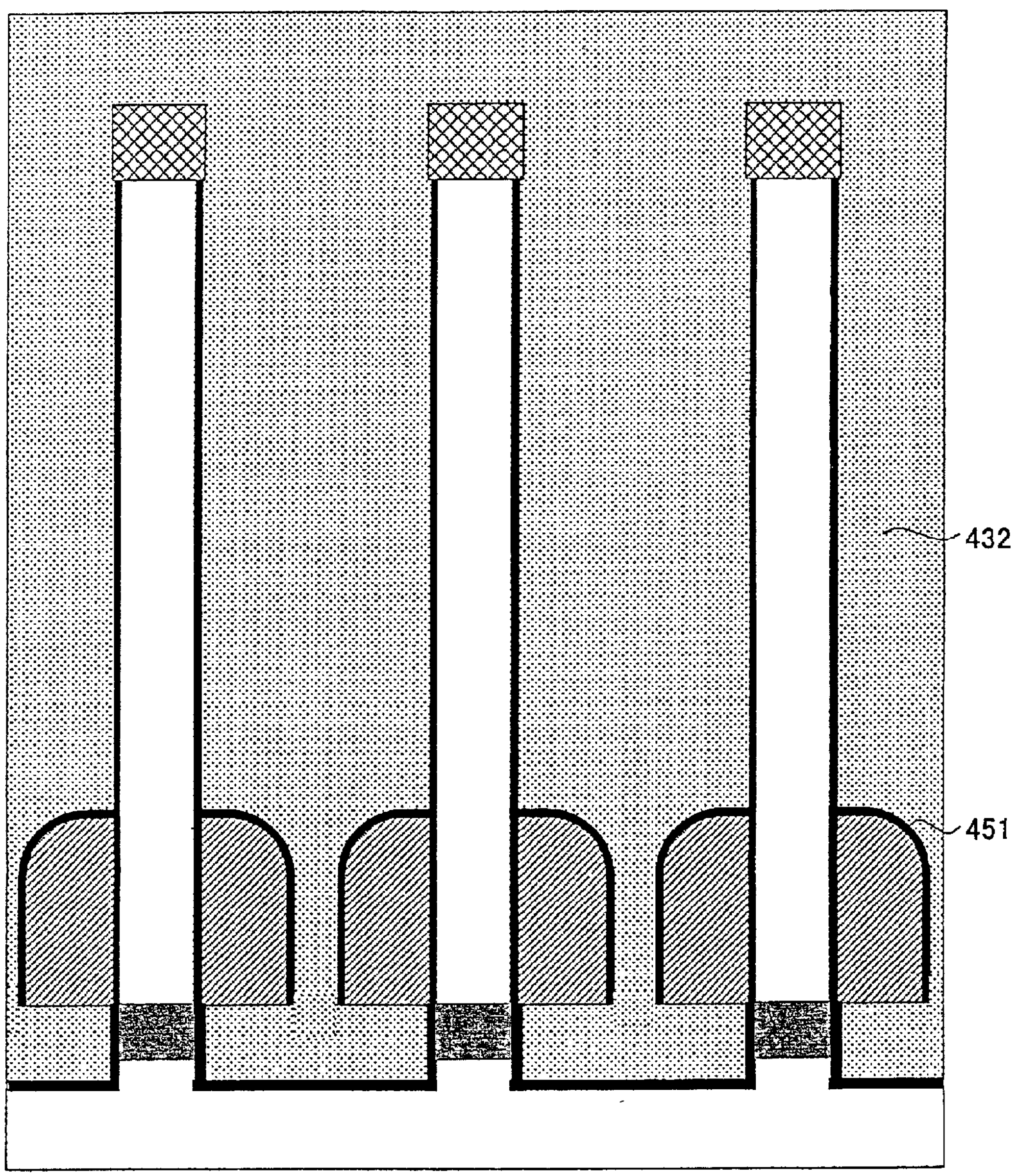

Fig. 1572
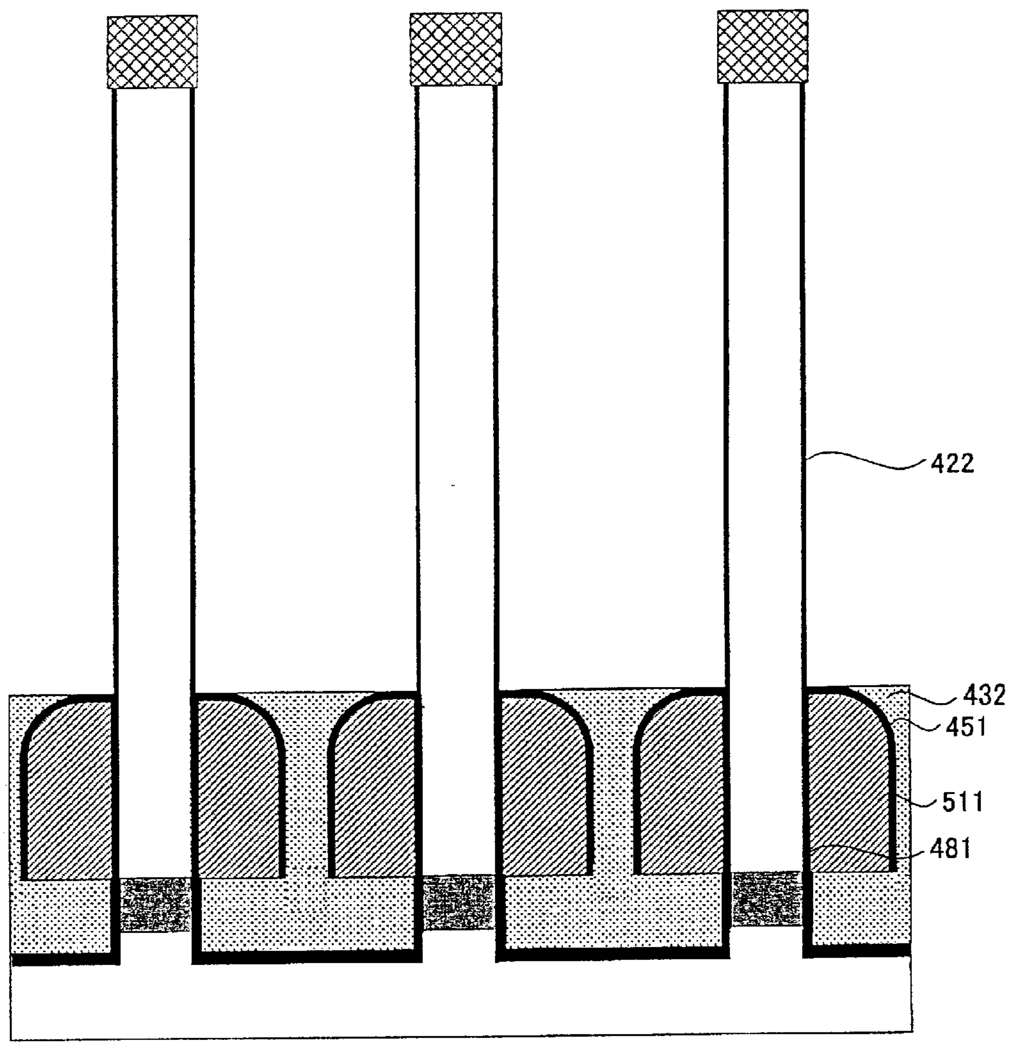

Fig. 1573
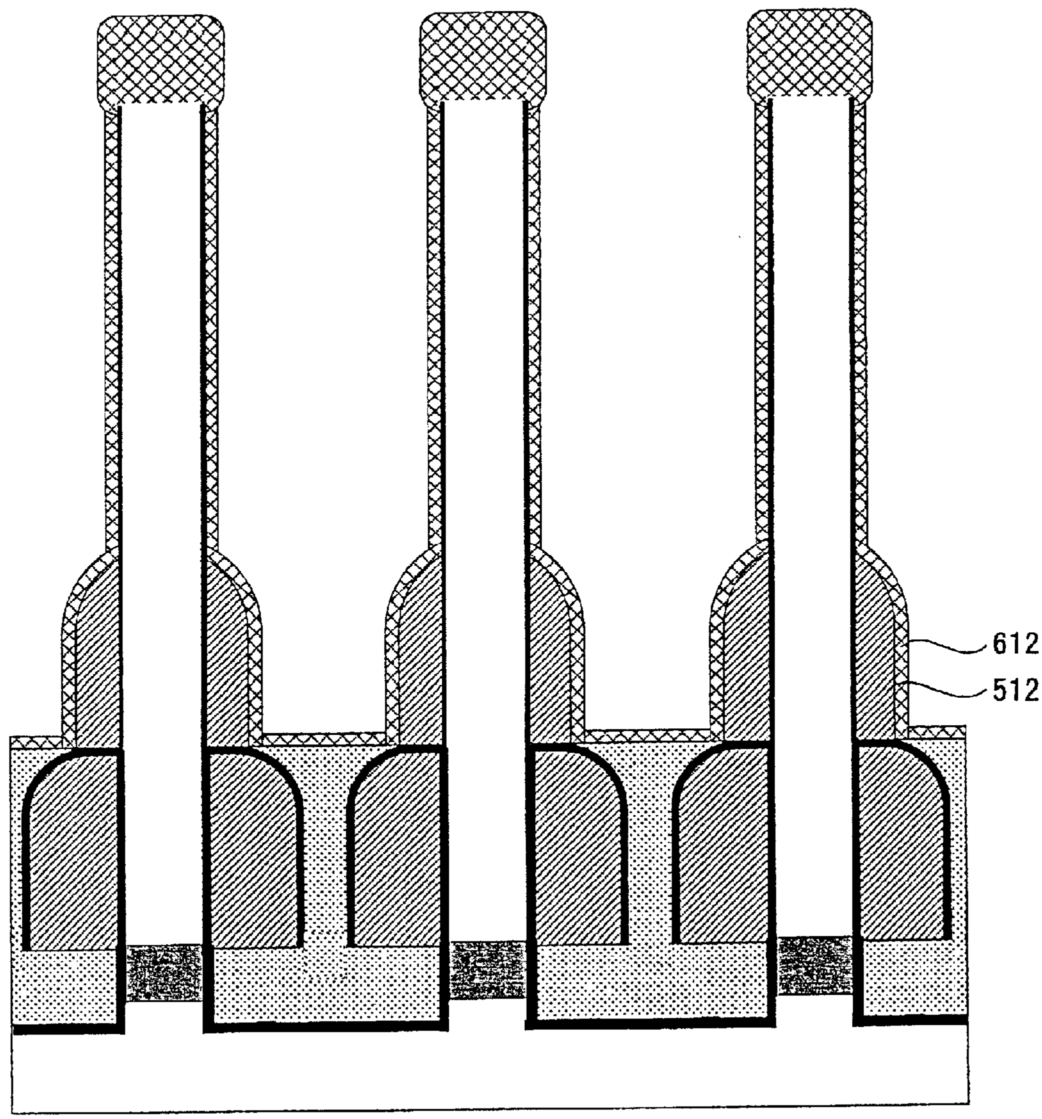

Fig. 1574
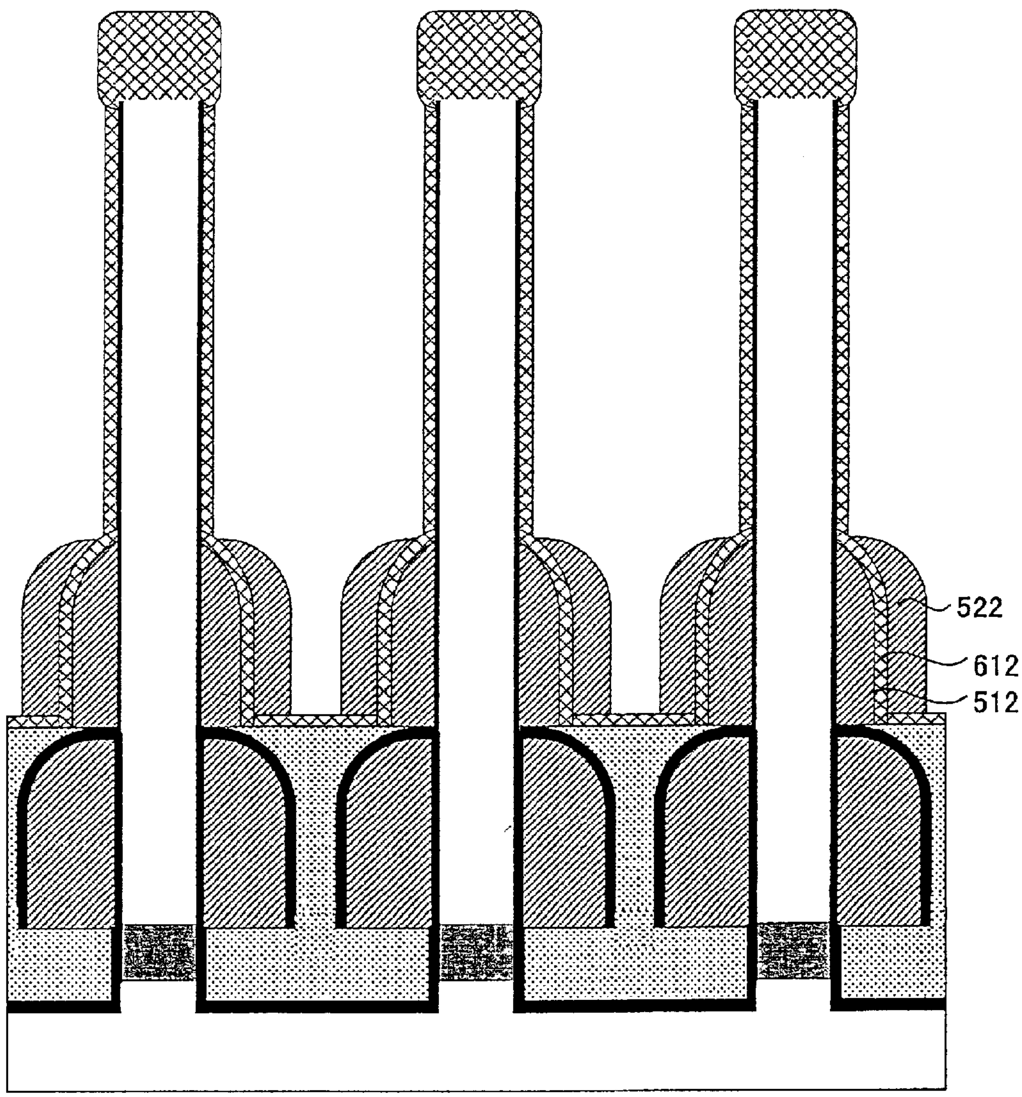

Fig. 1575
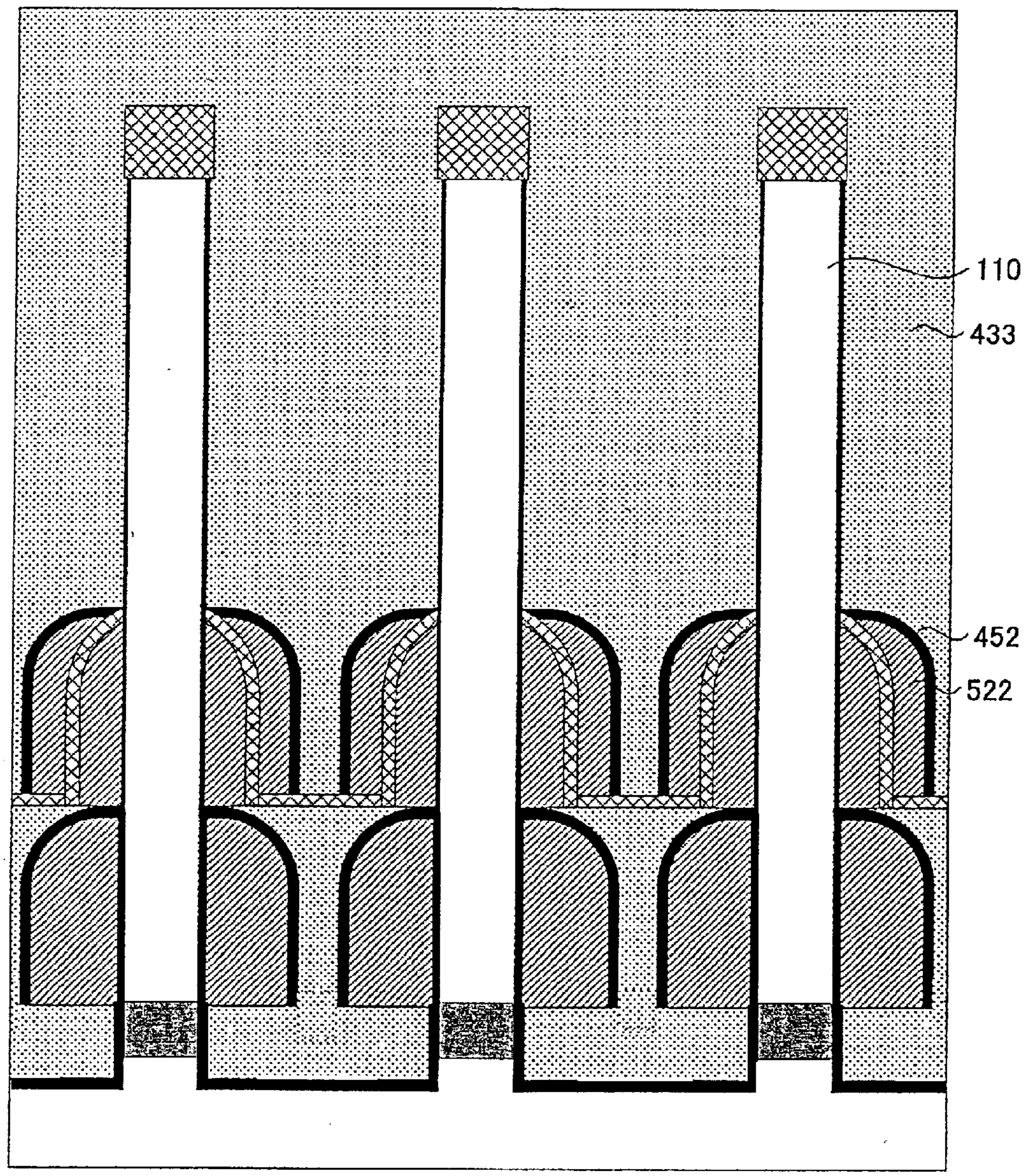

Fig. 1576
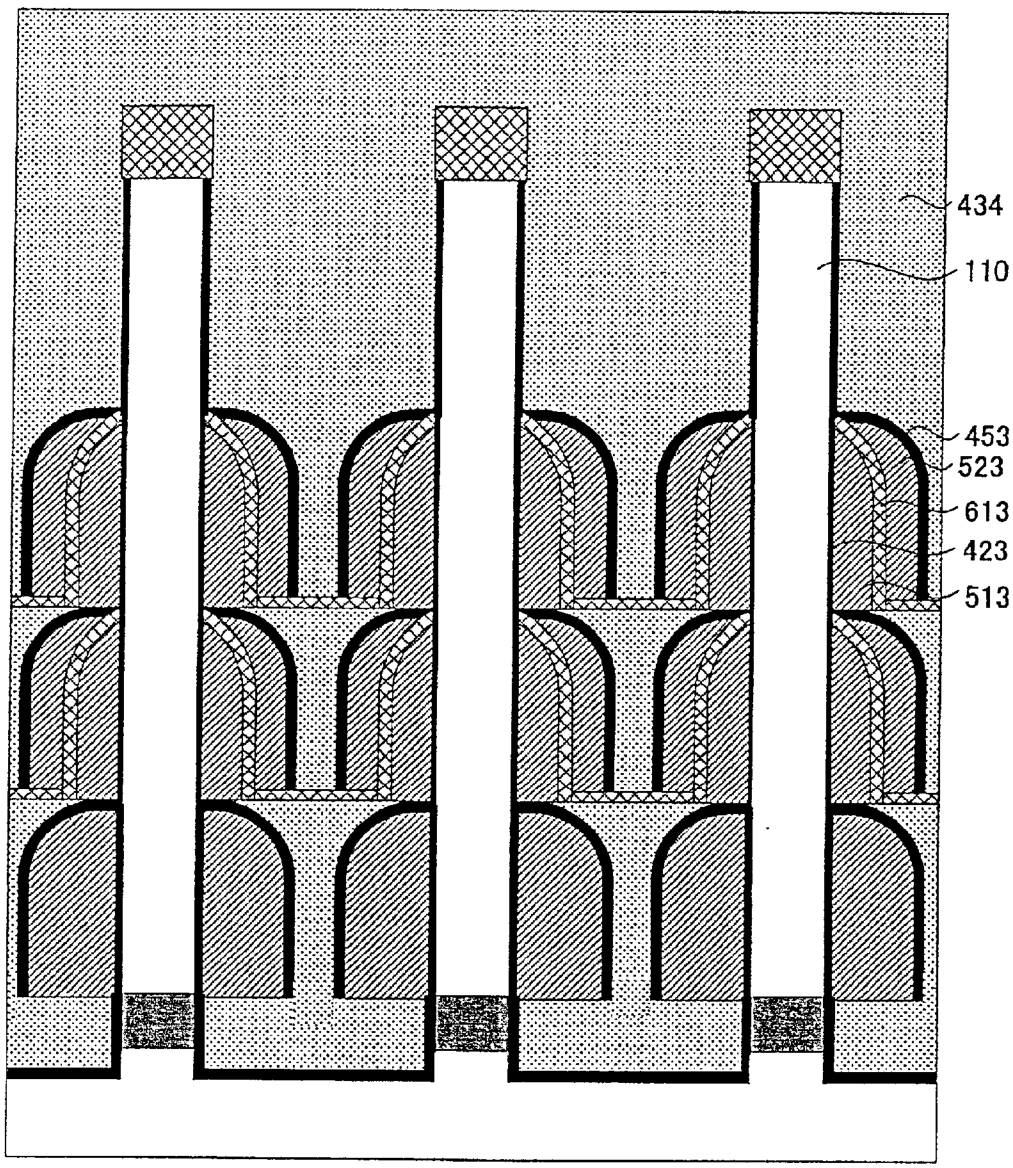

Fig. 1577
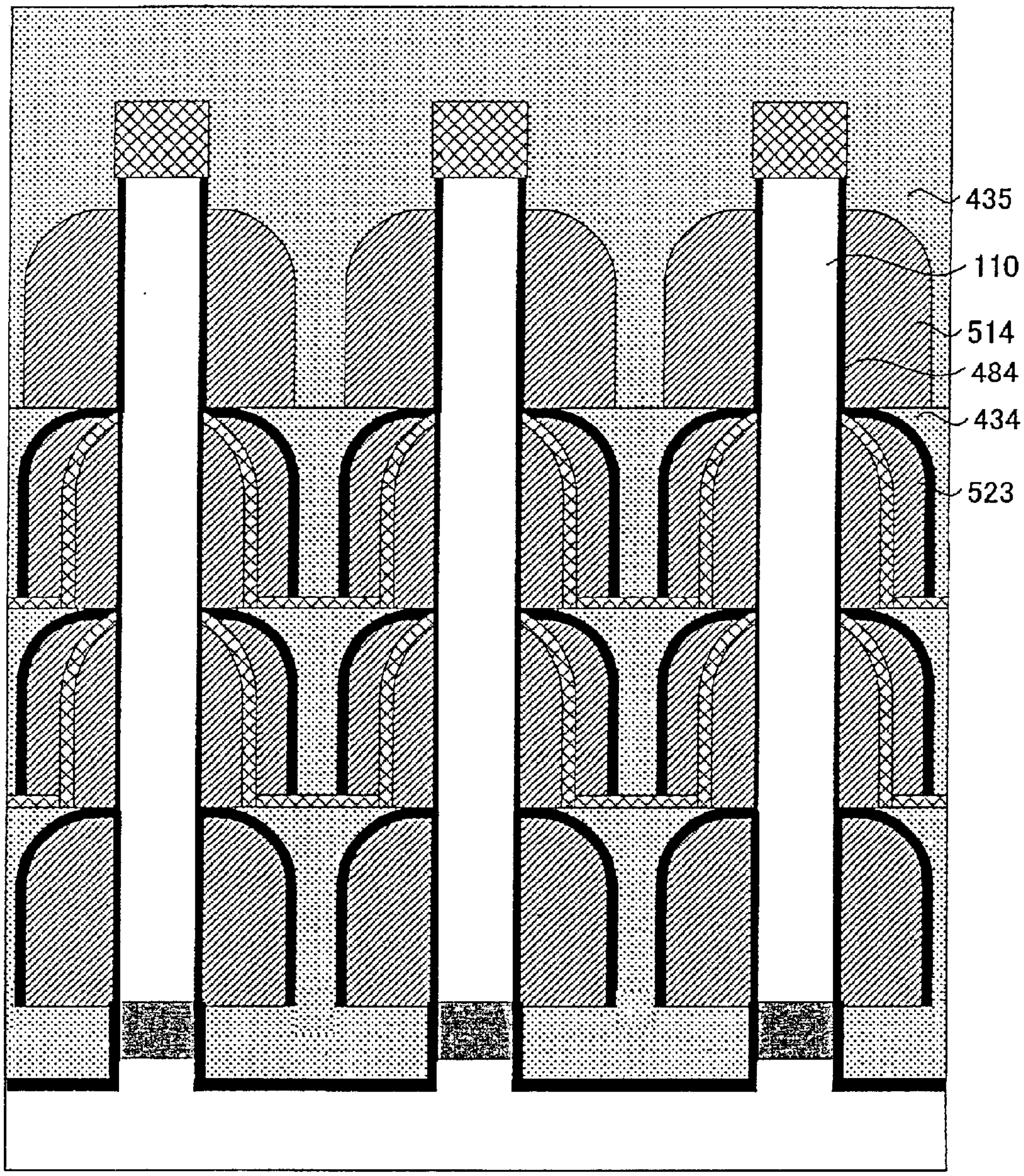

Fig. 1578
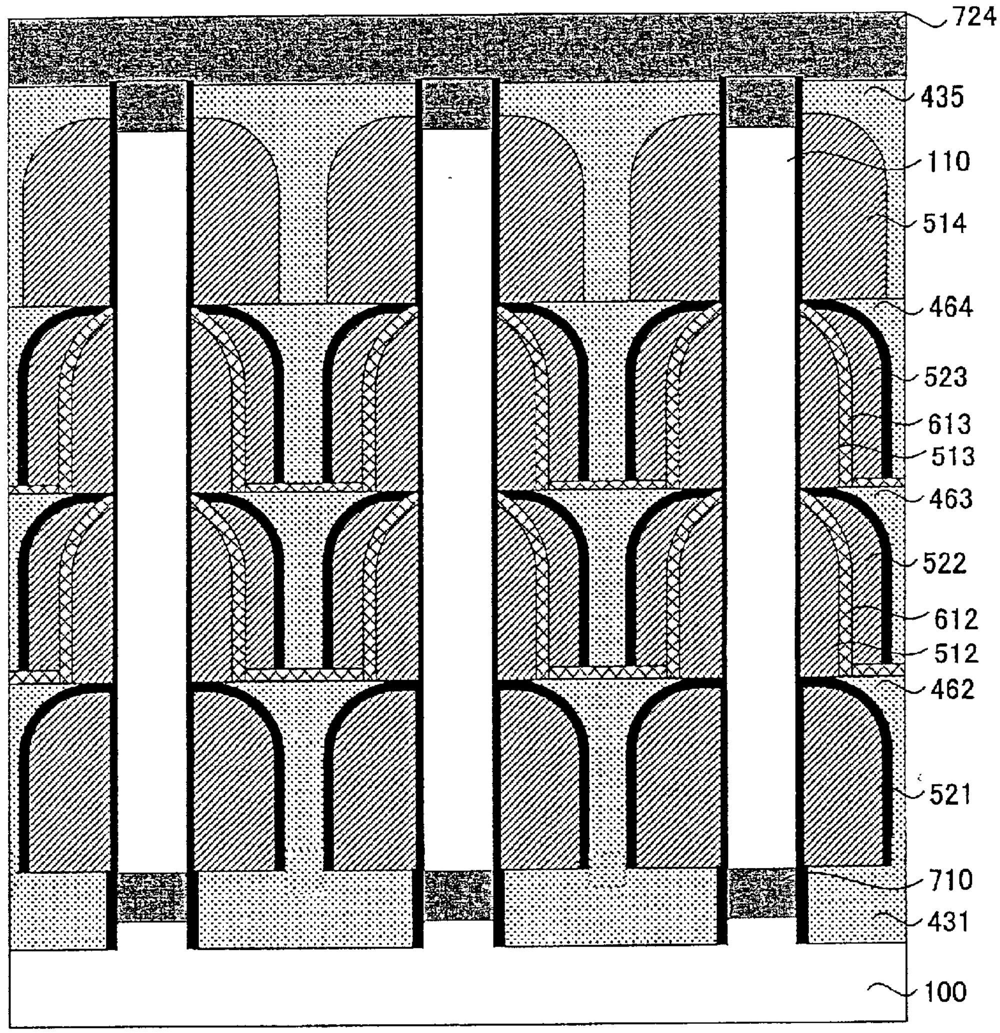

Fig. 1579
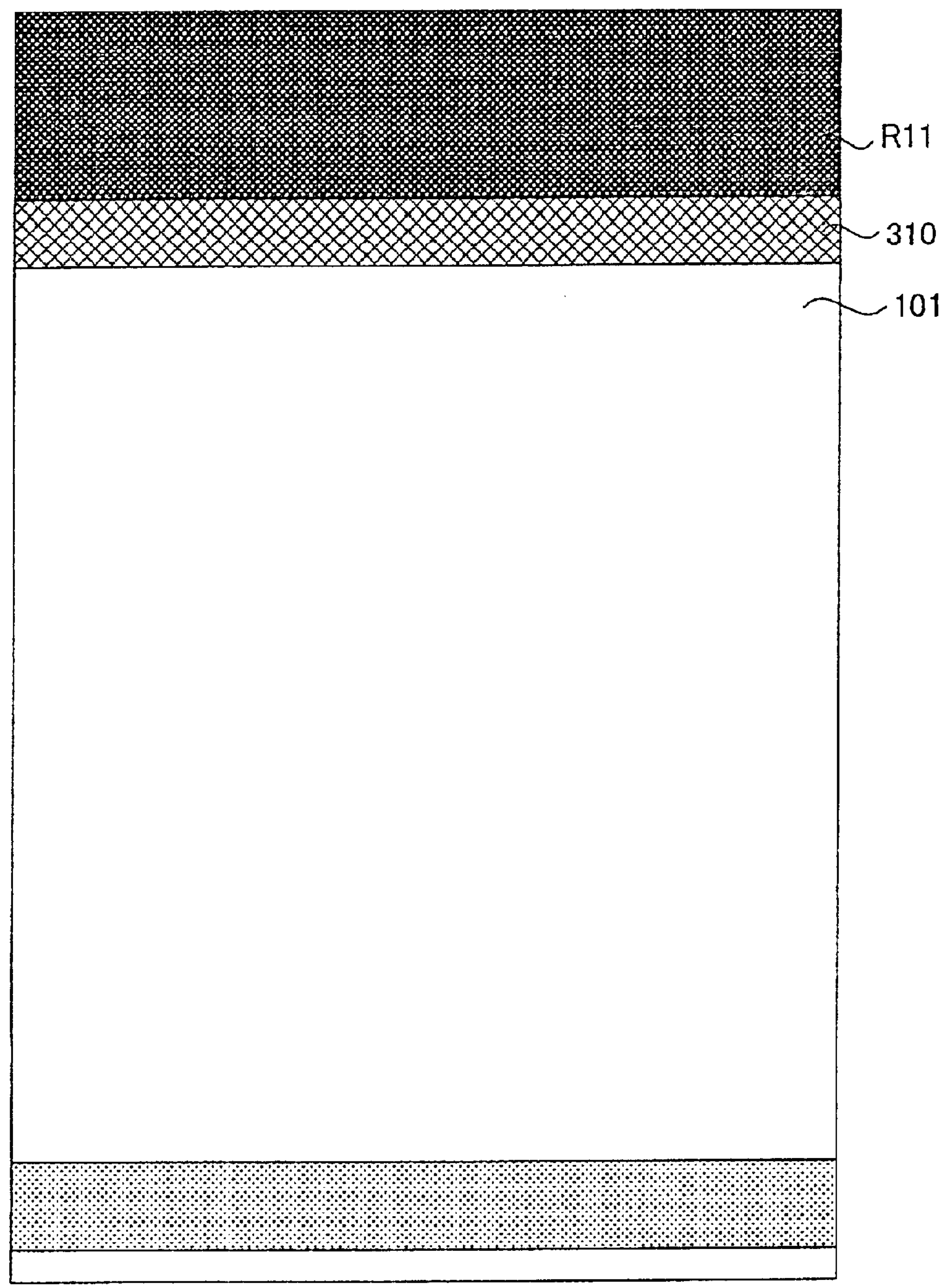

Fig. 1580
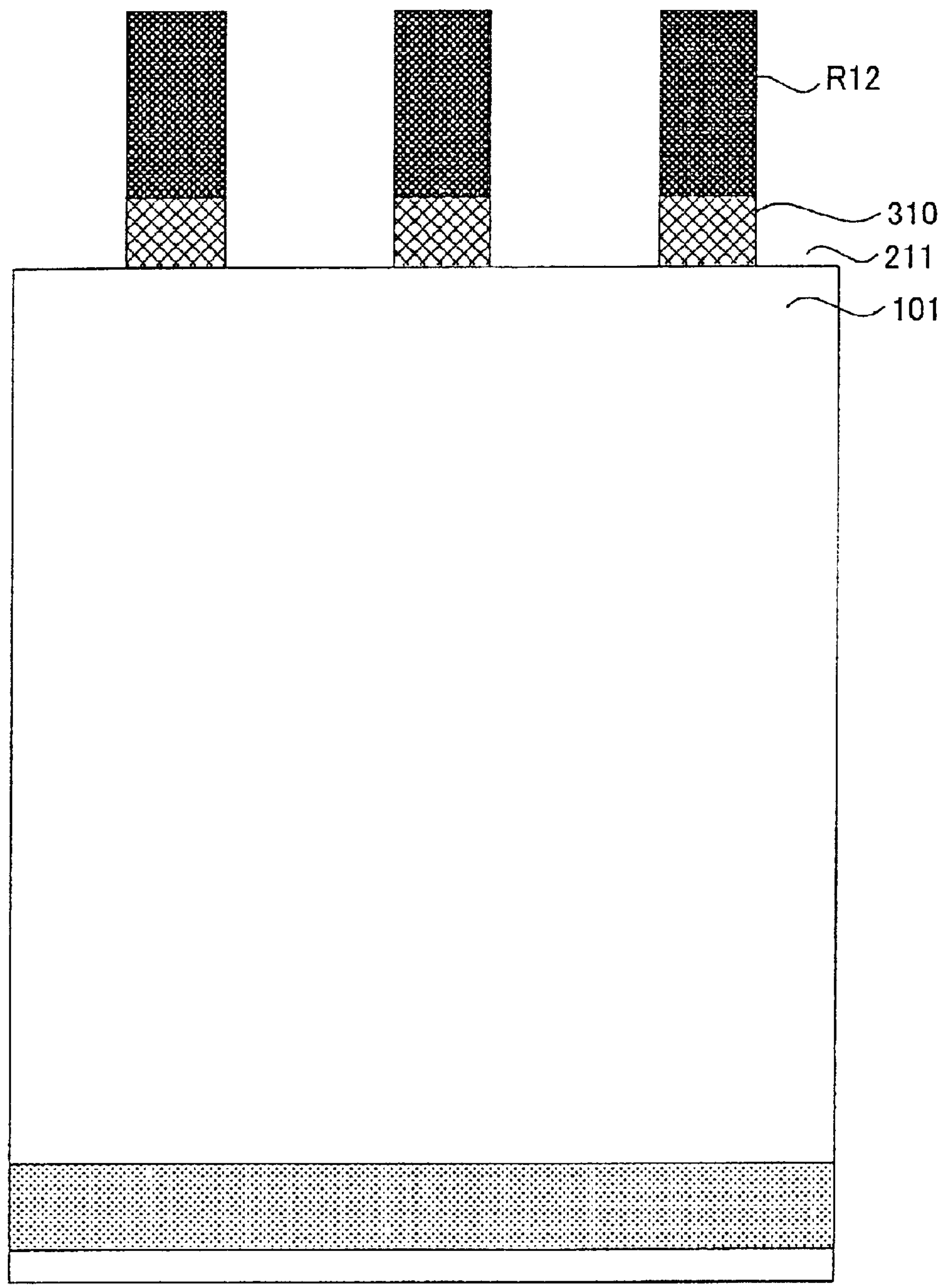

Fig. 1581
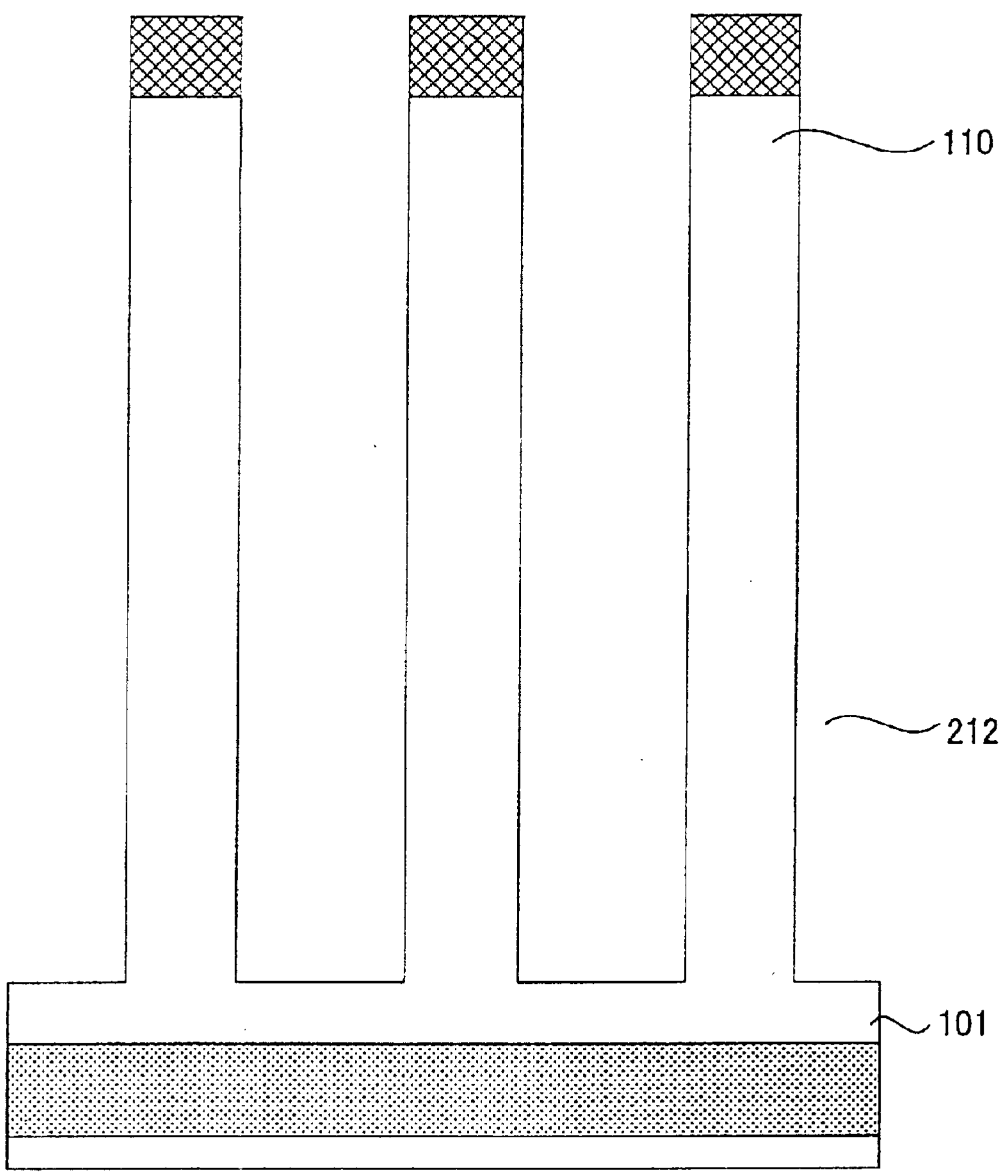

Fig. 1582
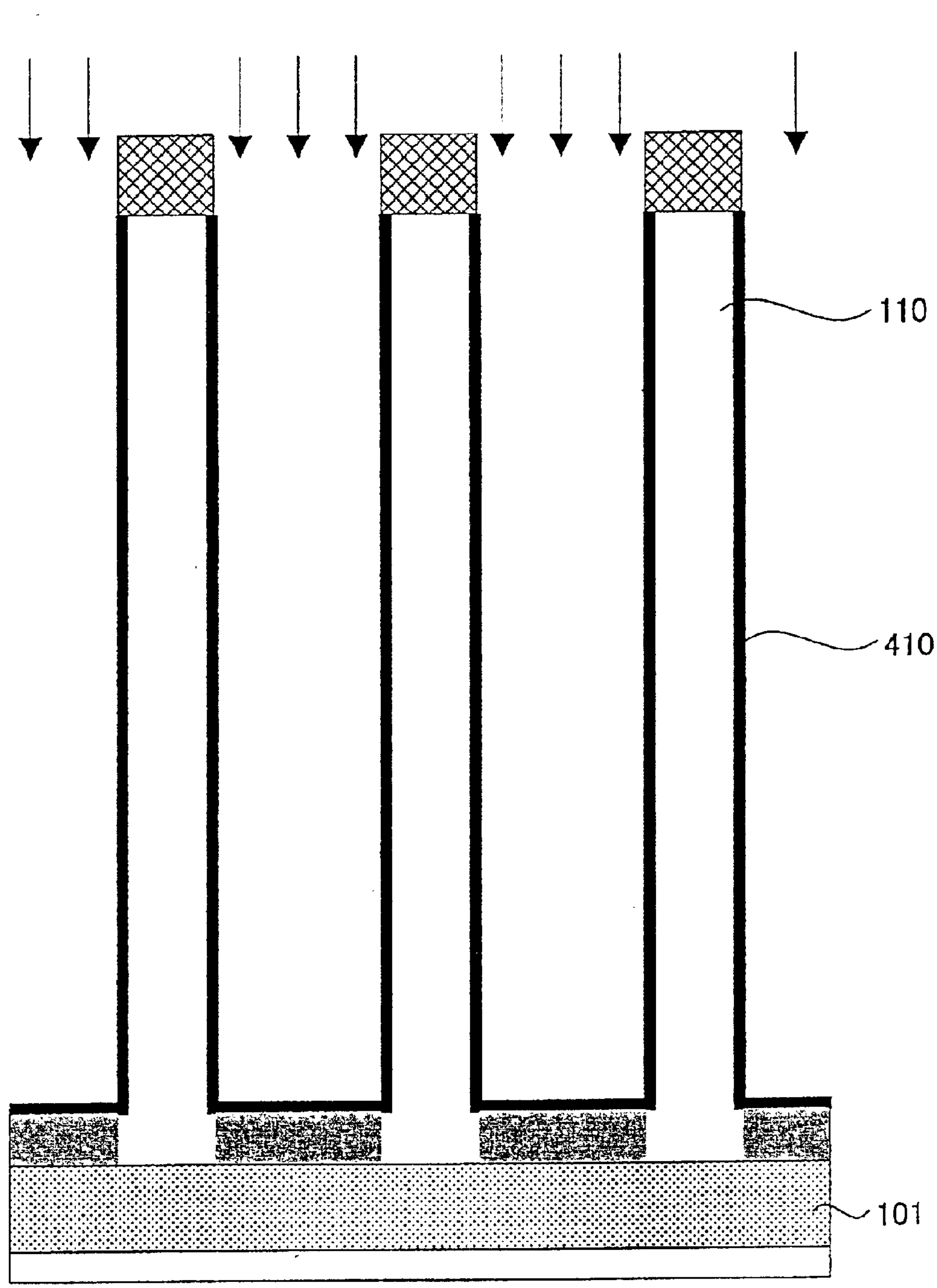

Fig. 1583
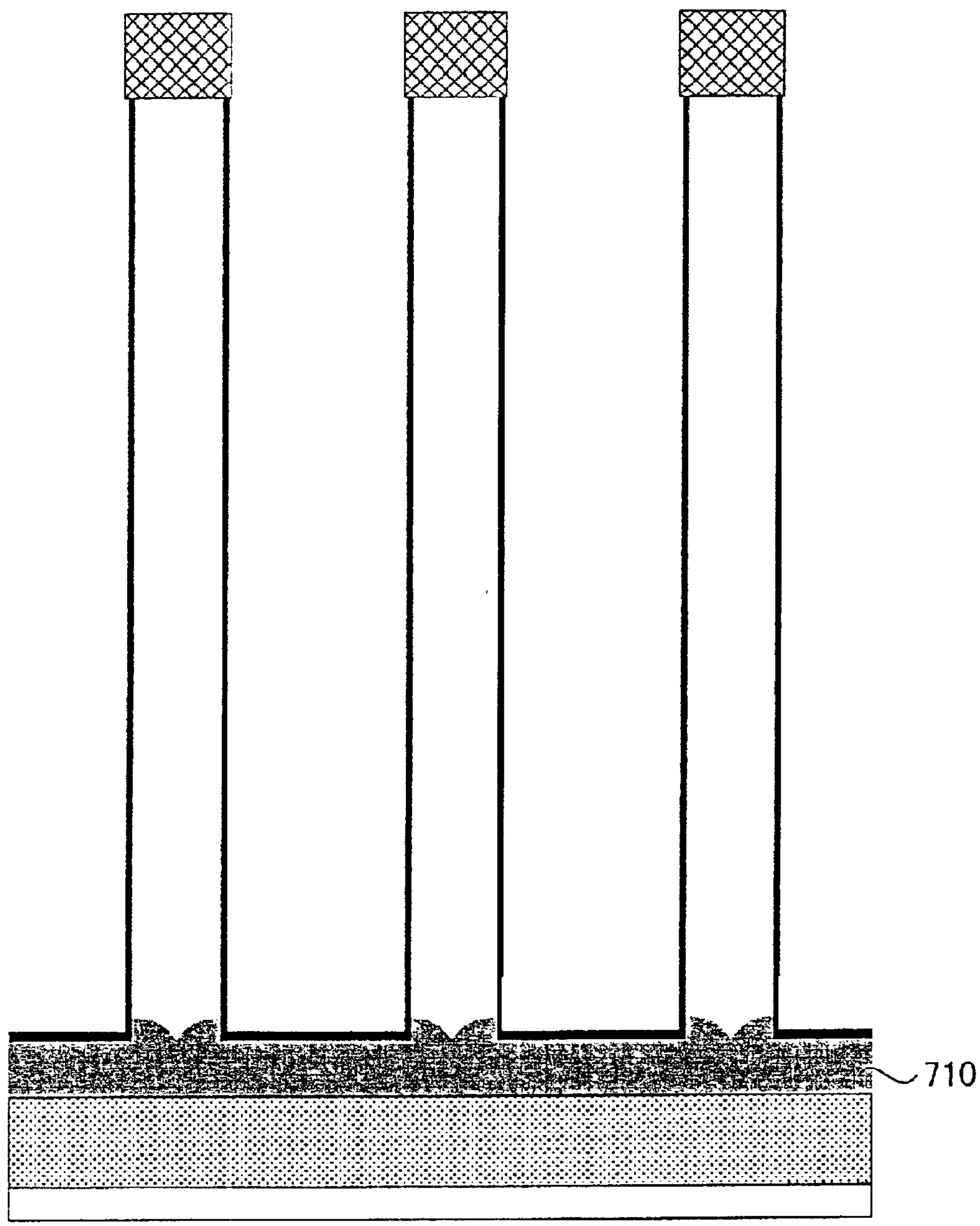

Fig. 1584
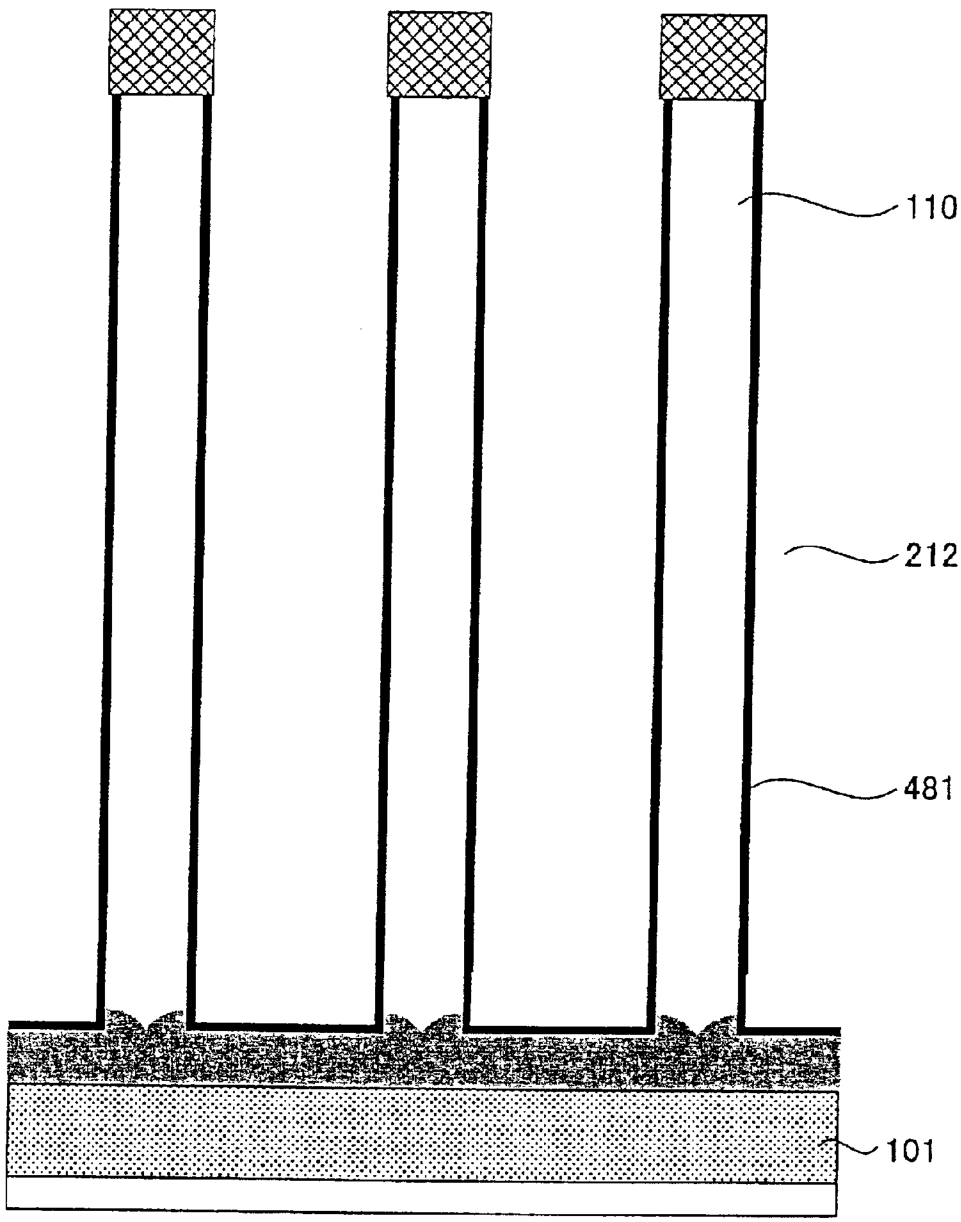

Fig. 1585
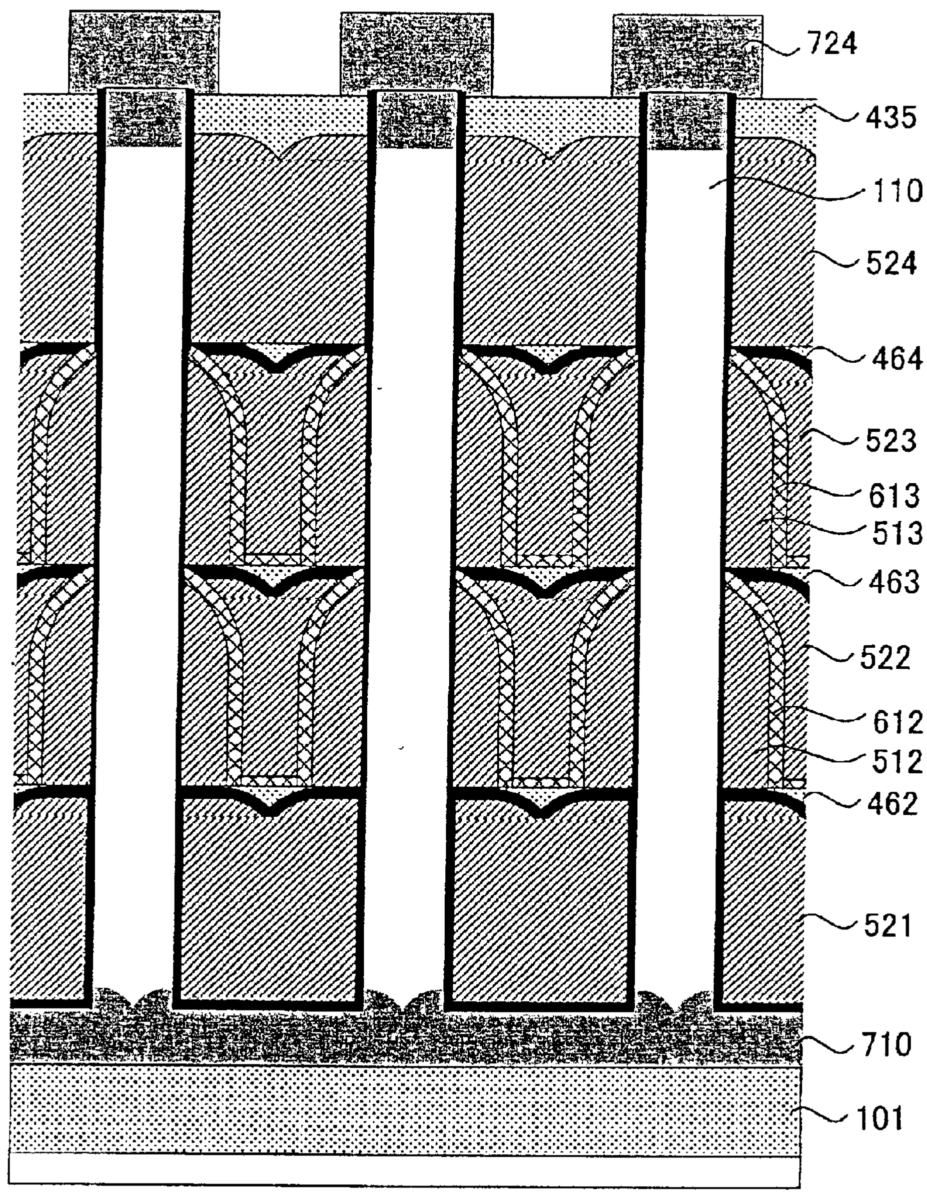

Fig. 1586
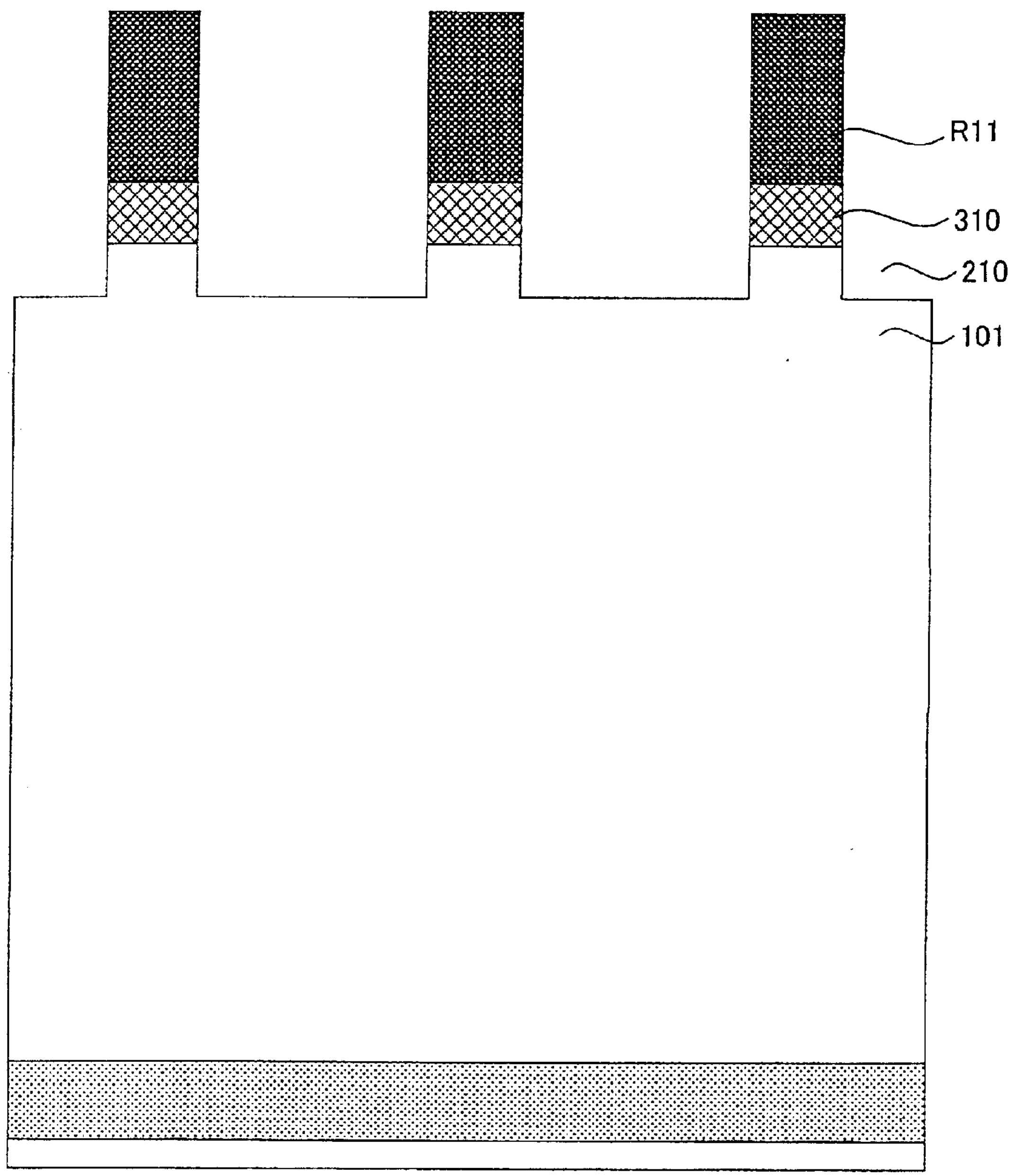

Fig. 1587
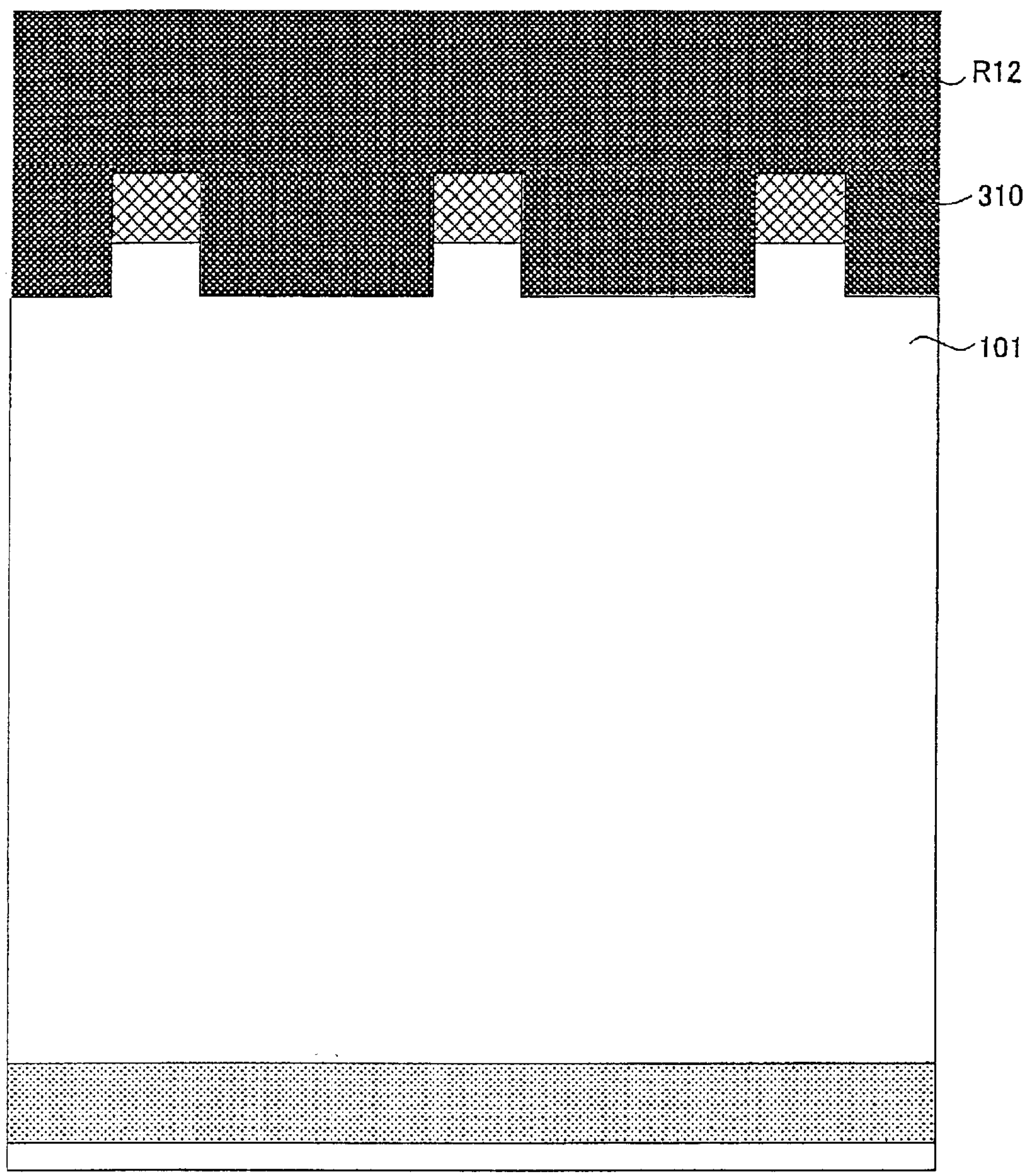

Fig. 1588
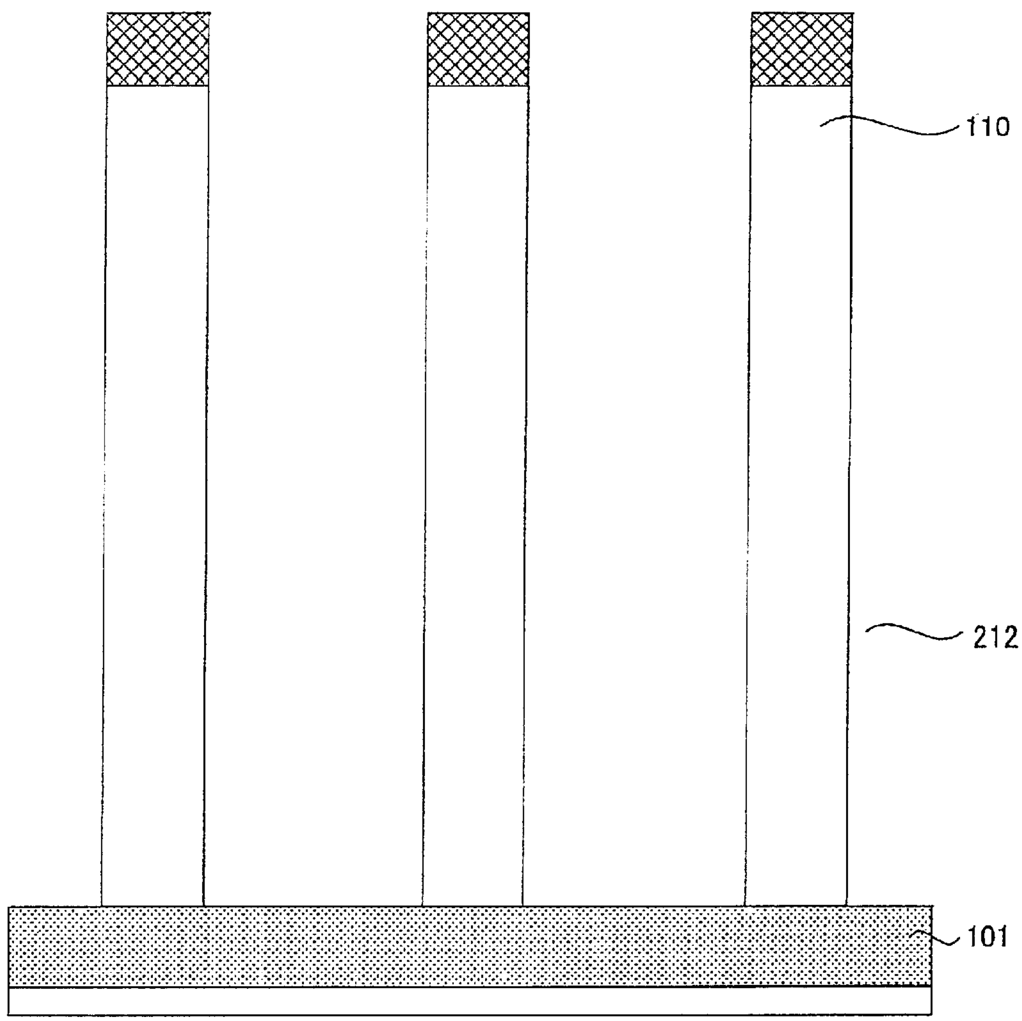

Fig. 1589
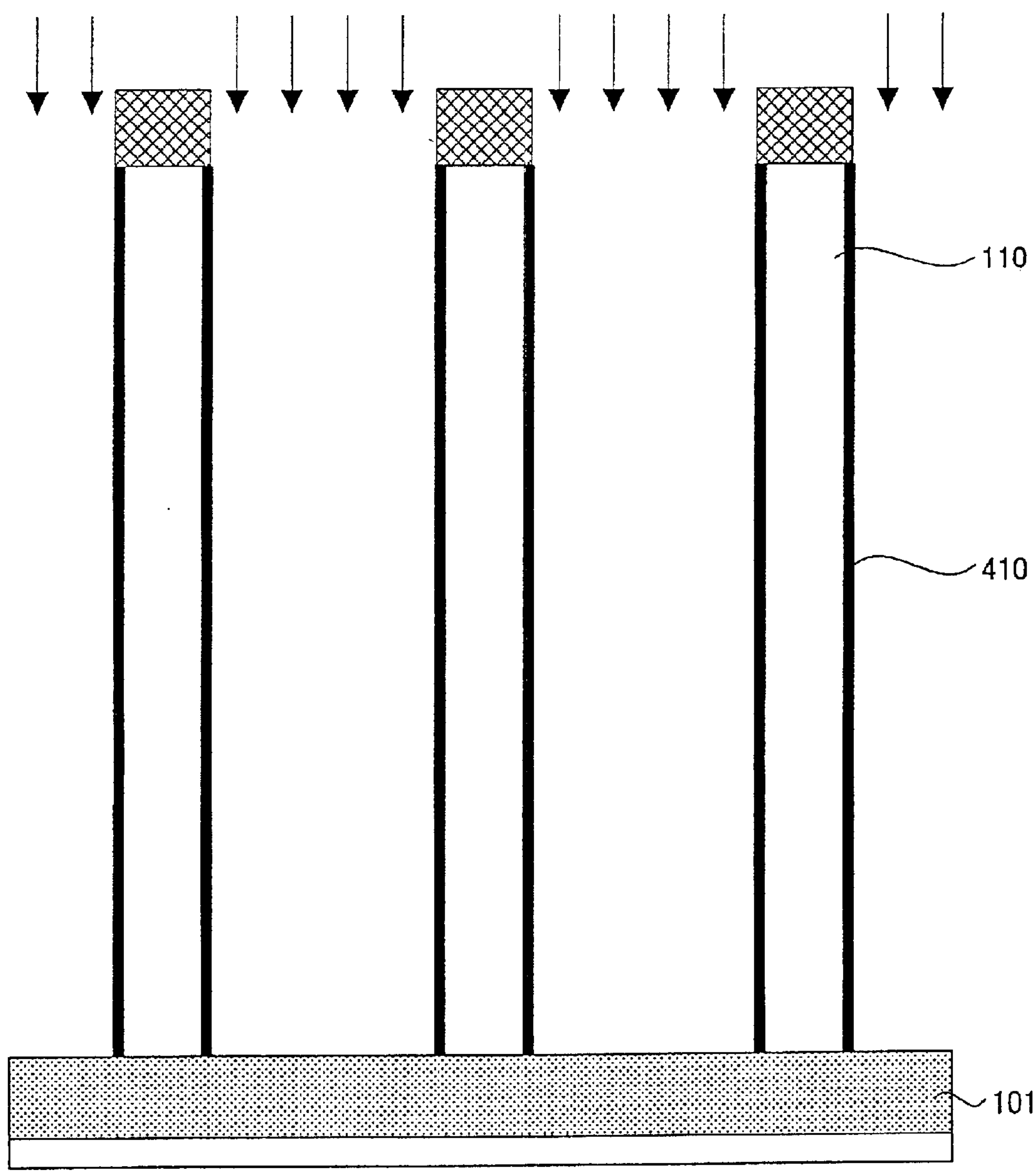

Fig. 1590
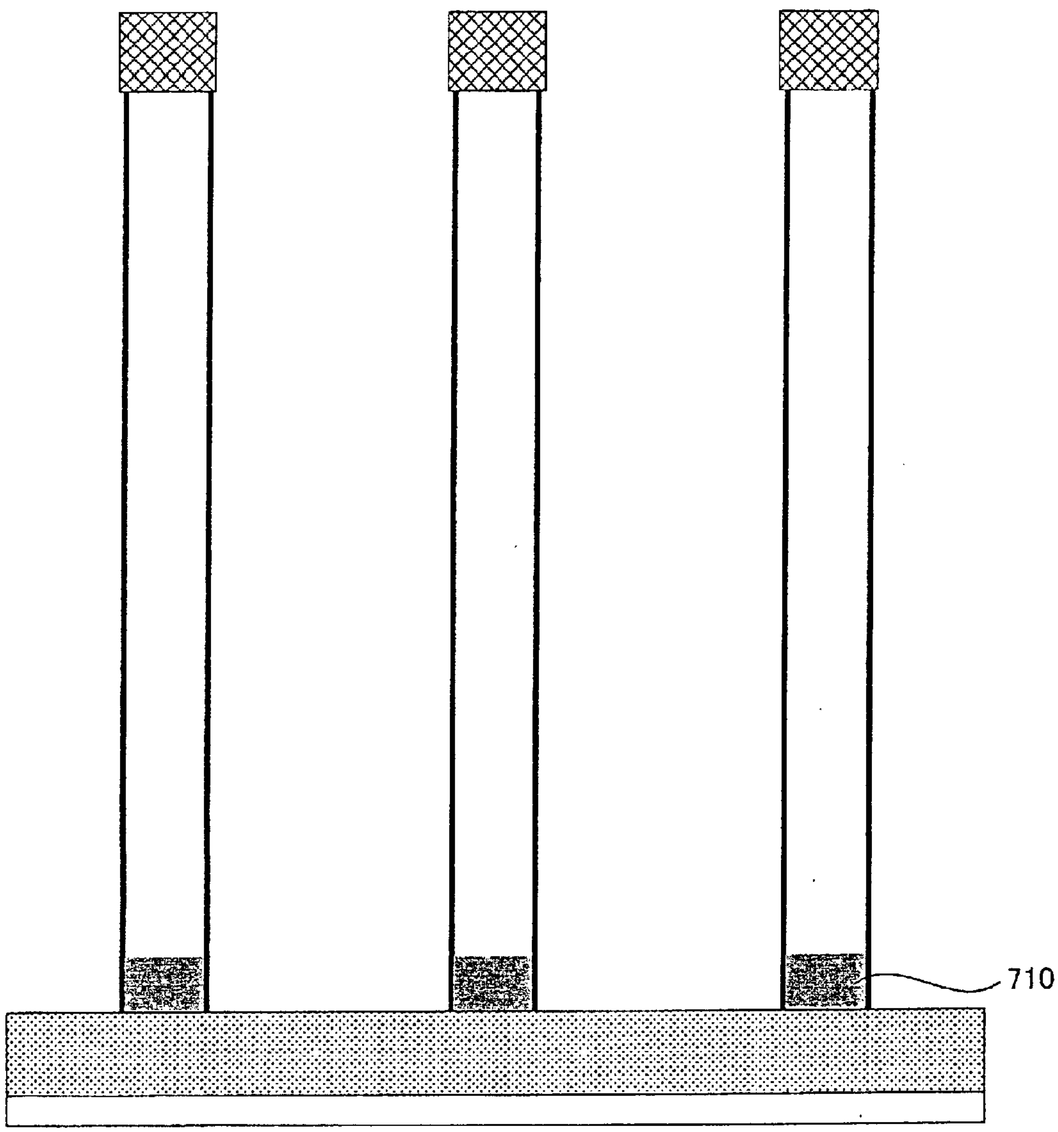

Fig. 1591
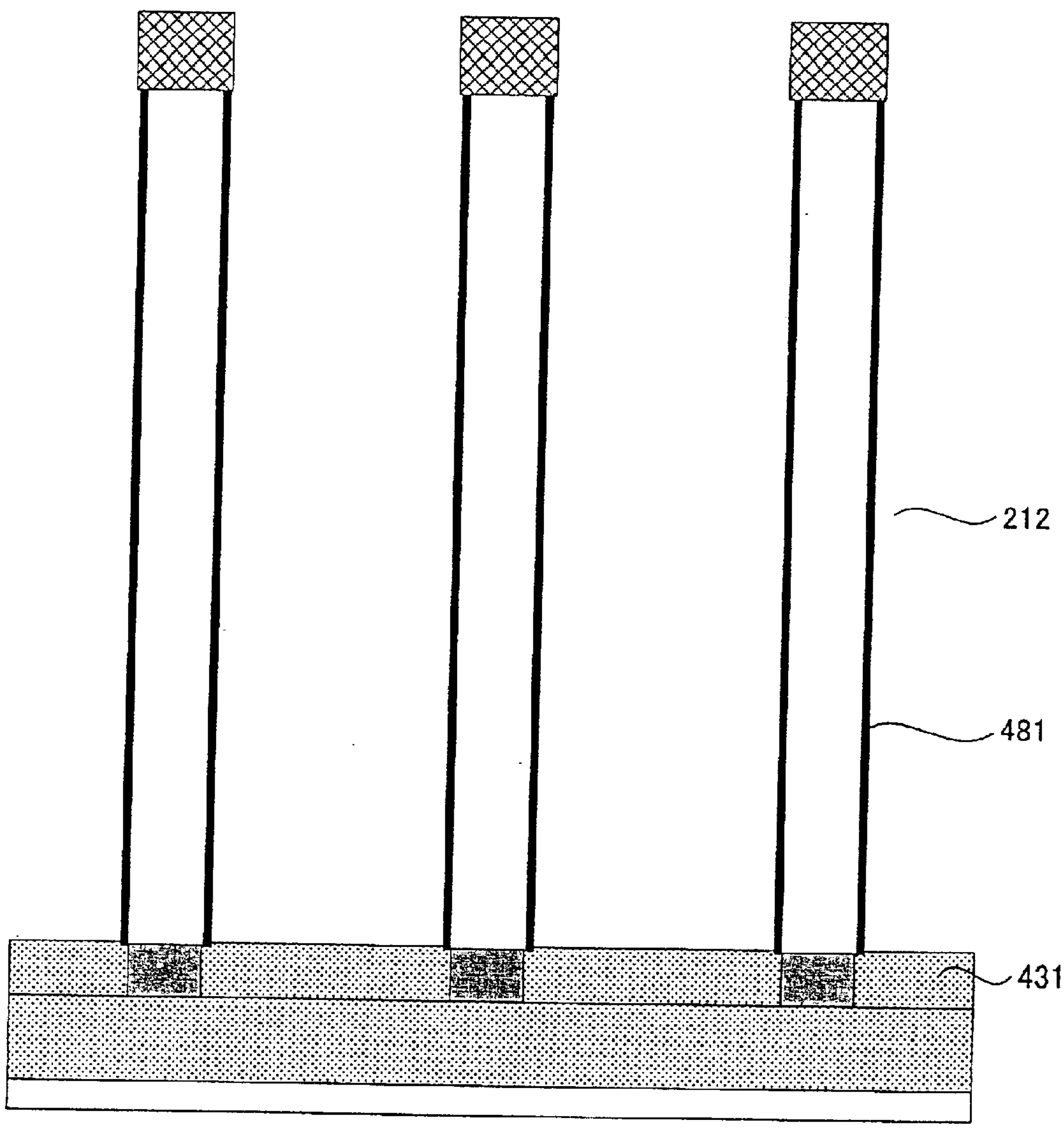

Fig. 1592
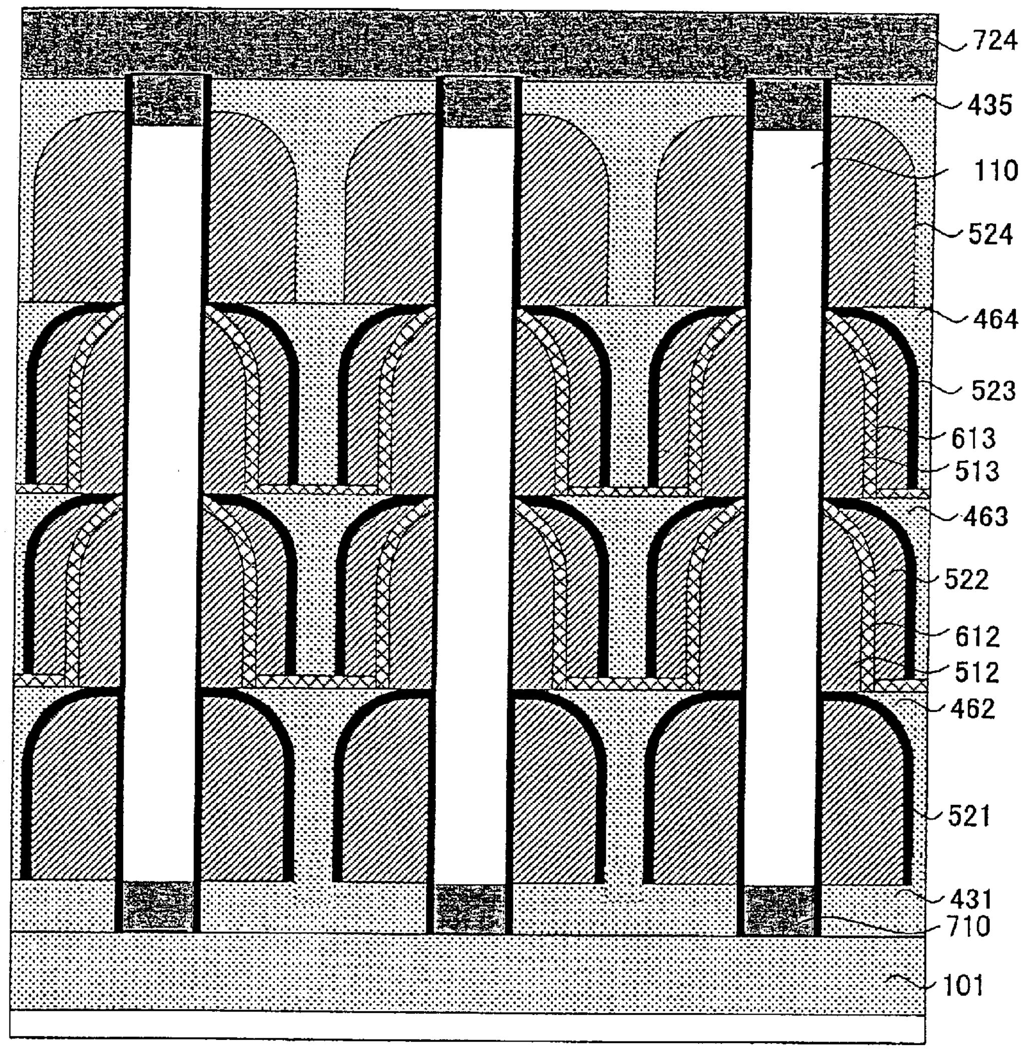

Fig. 1593
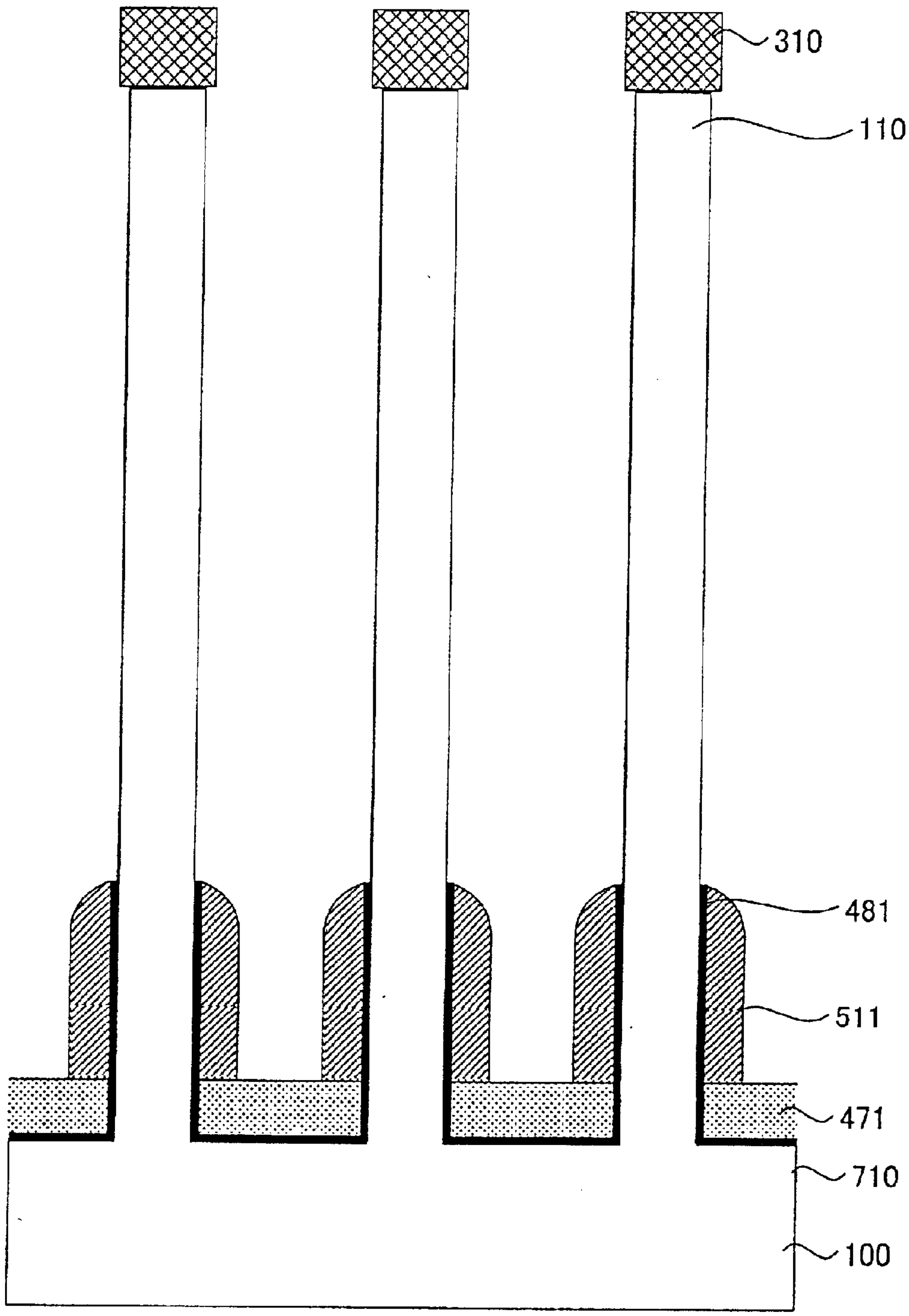

Fig. 1594
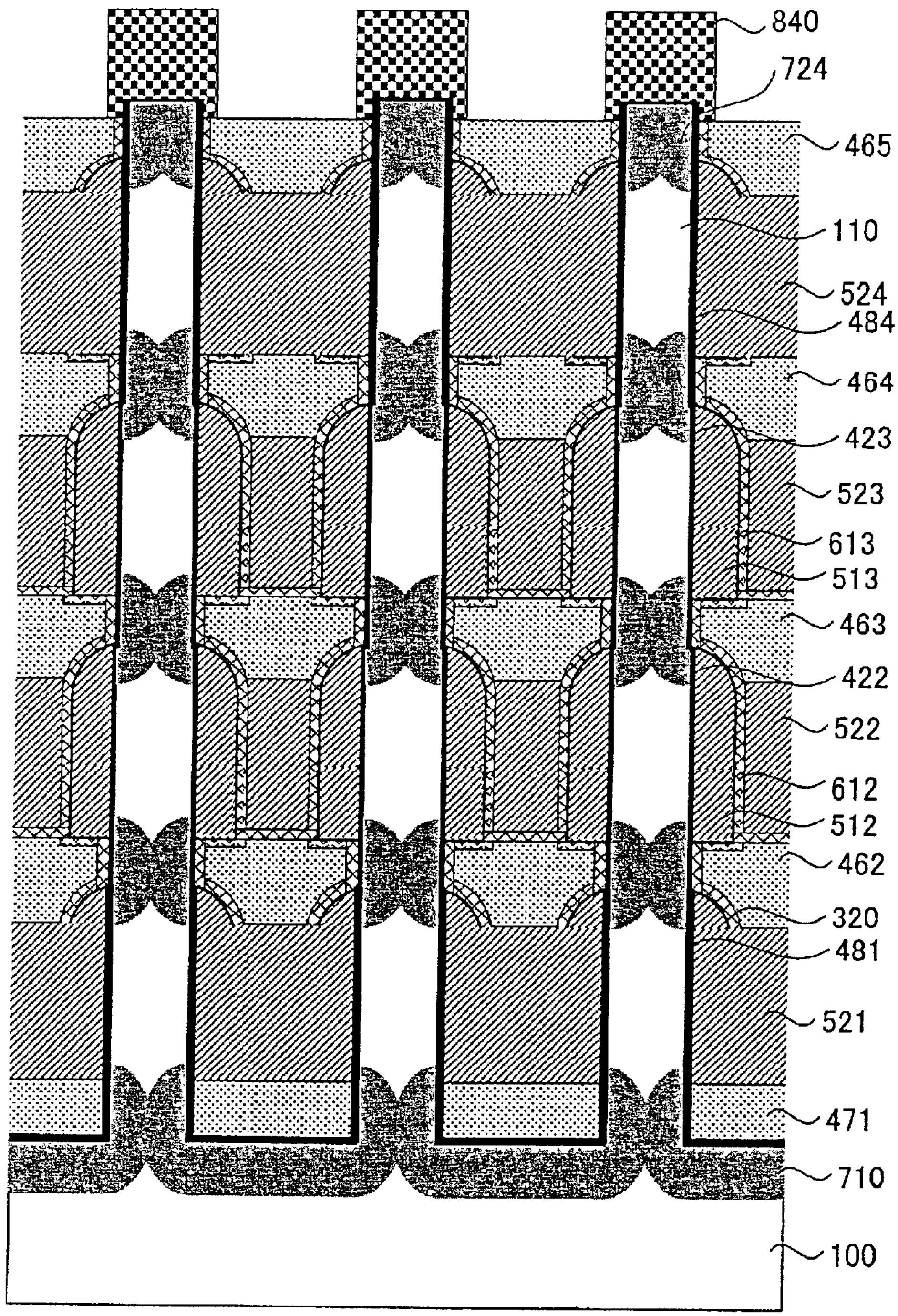

Fig. 1595
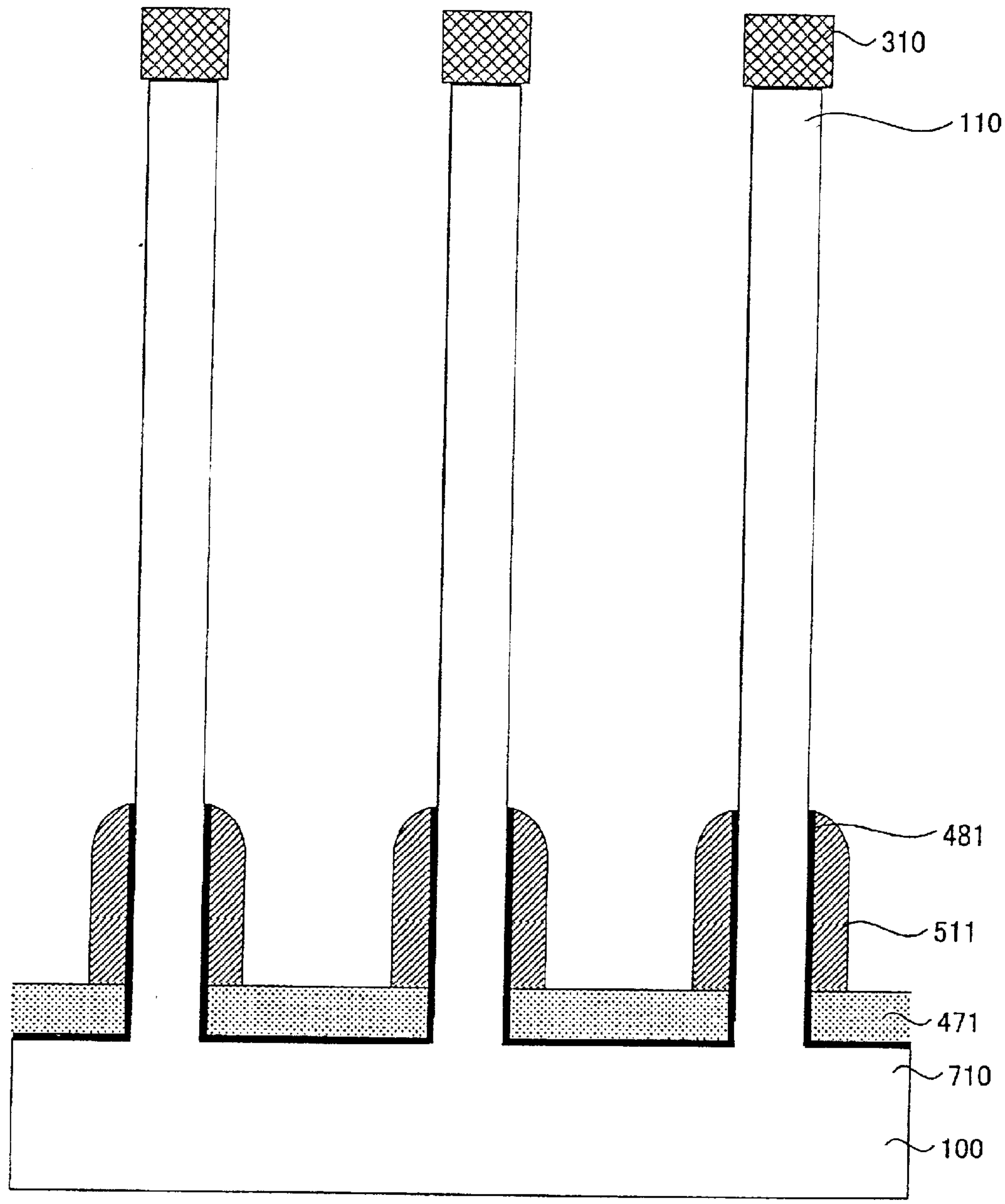

Fig. 1596
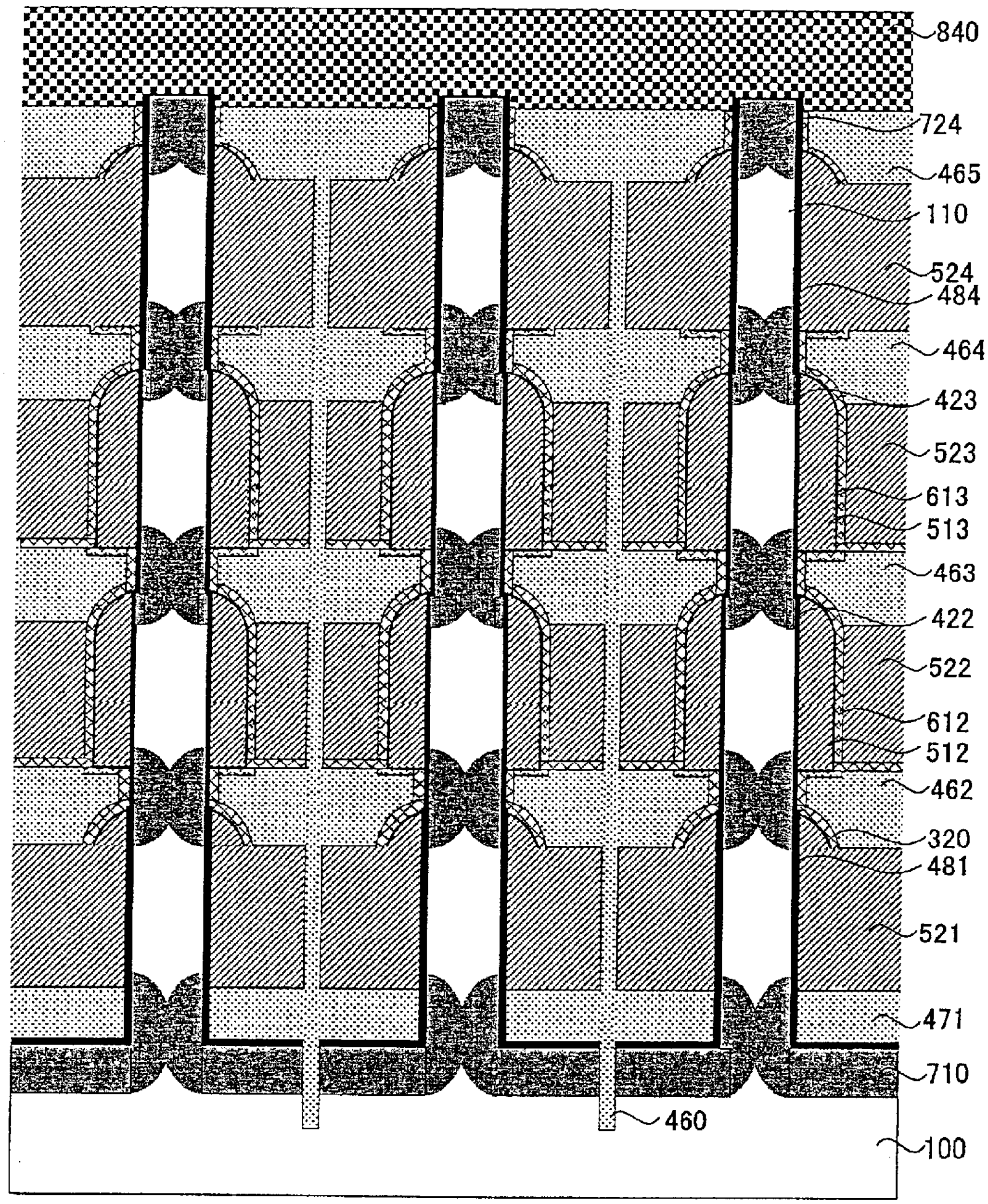

Fig. 1597
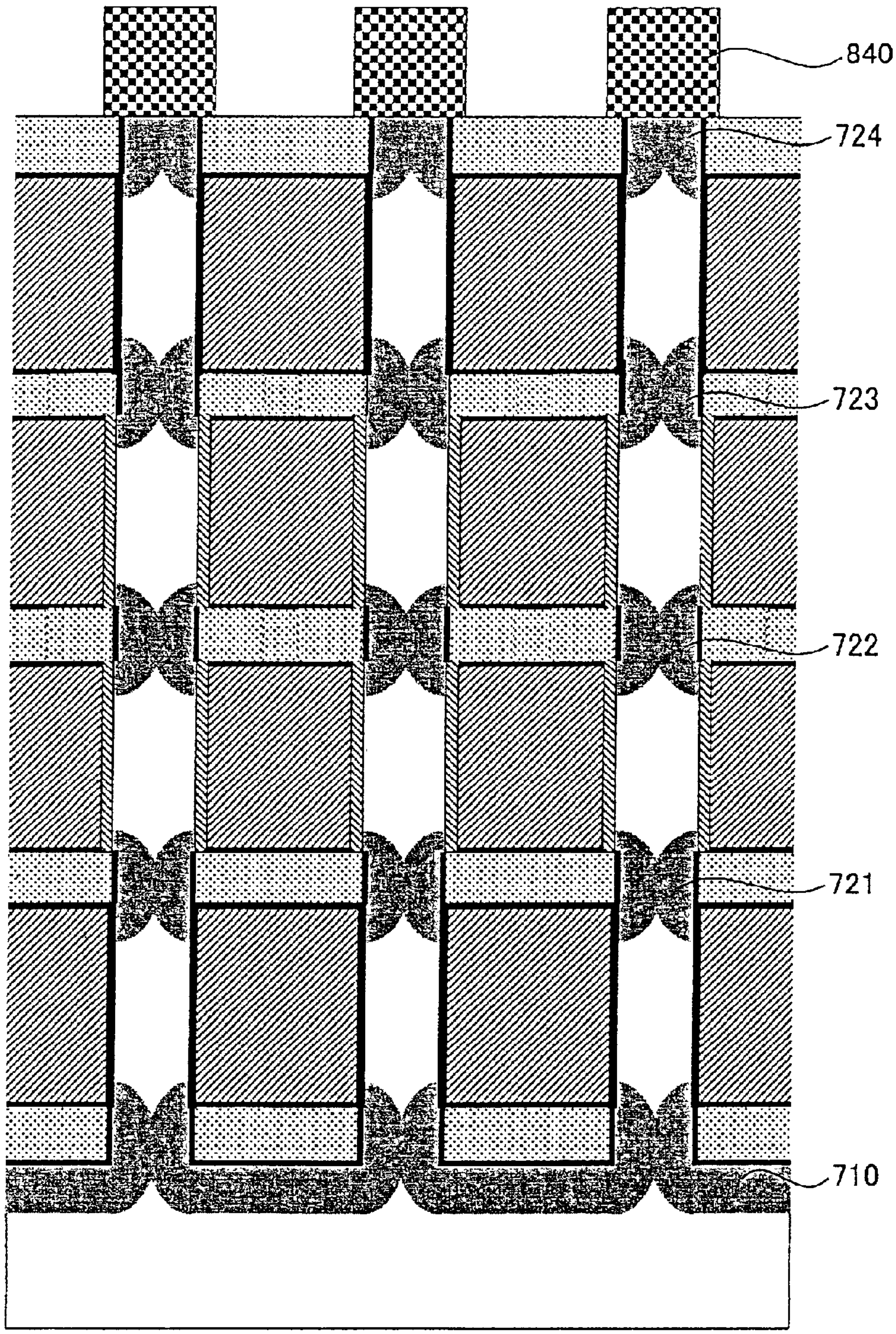

Fig. 1598
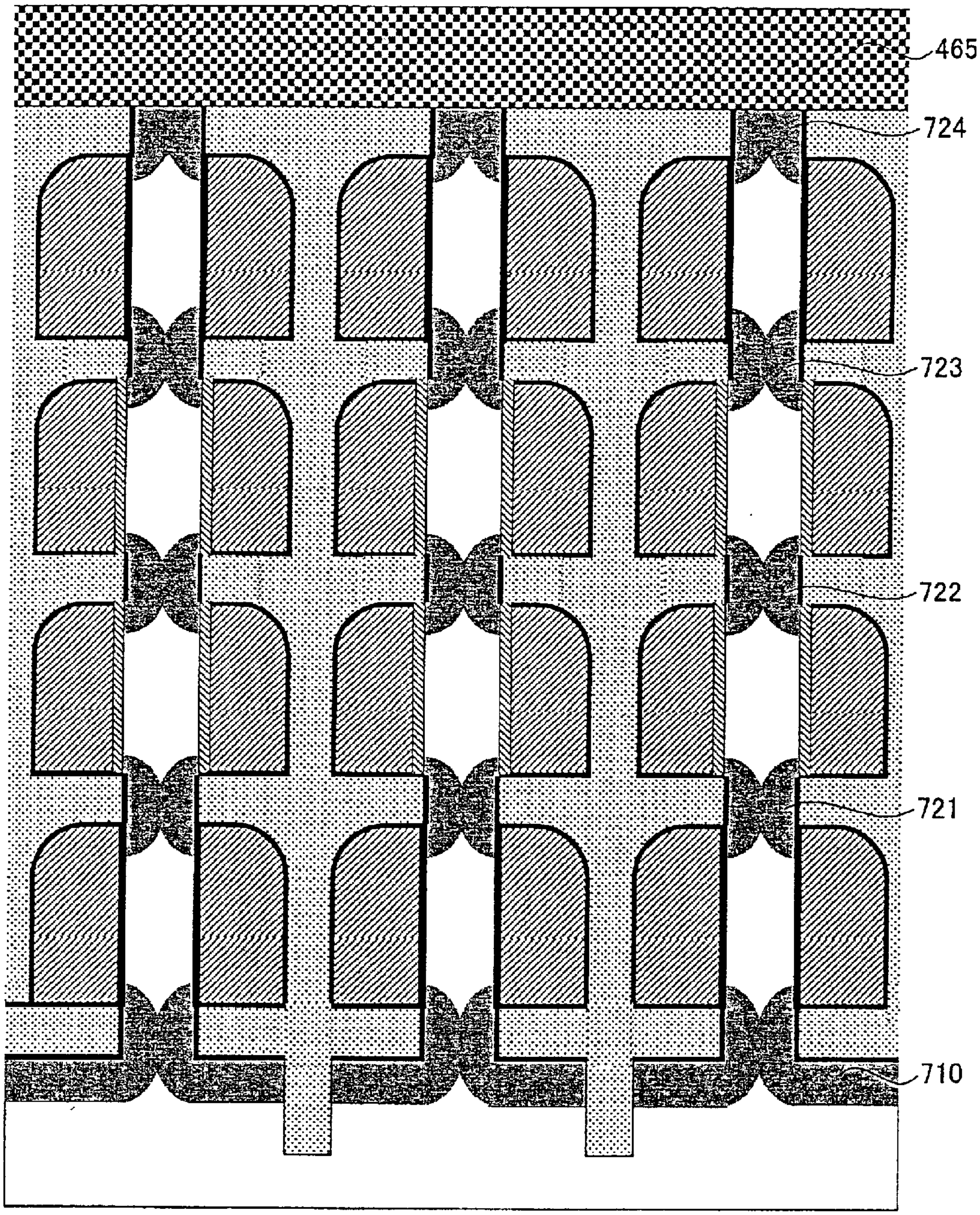

Fig. 1599
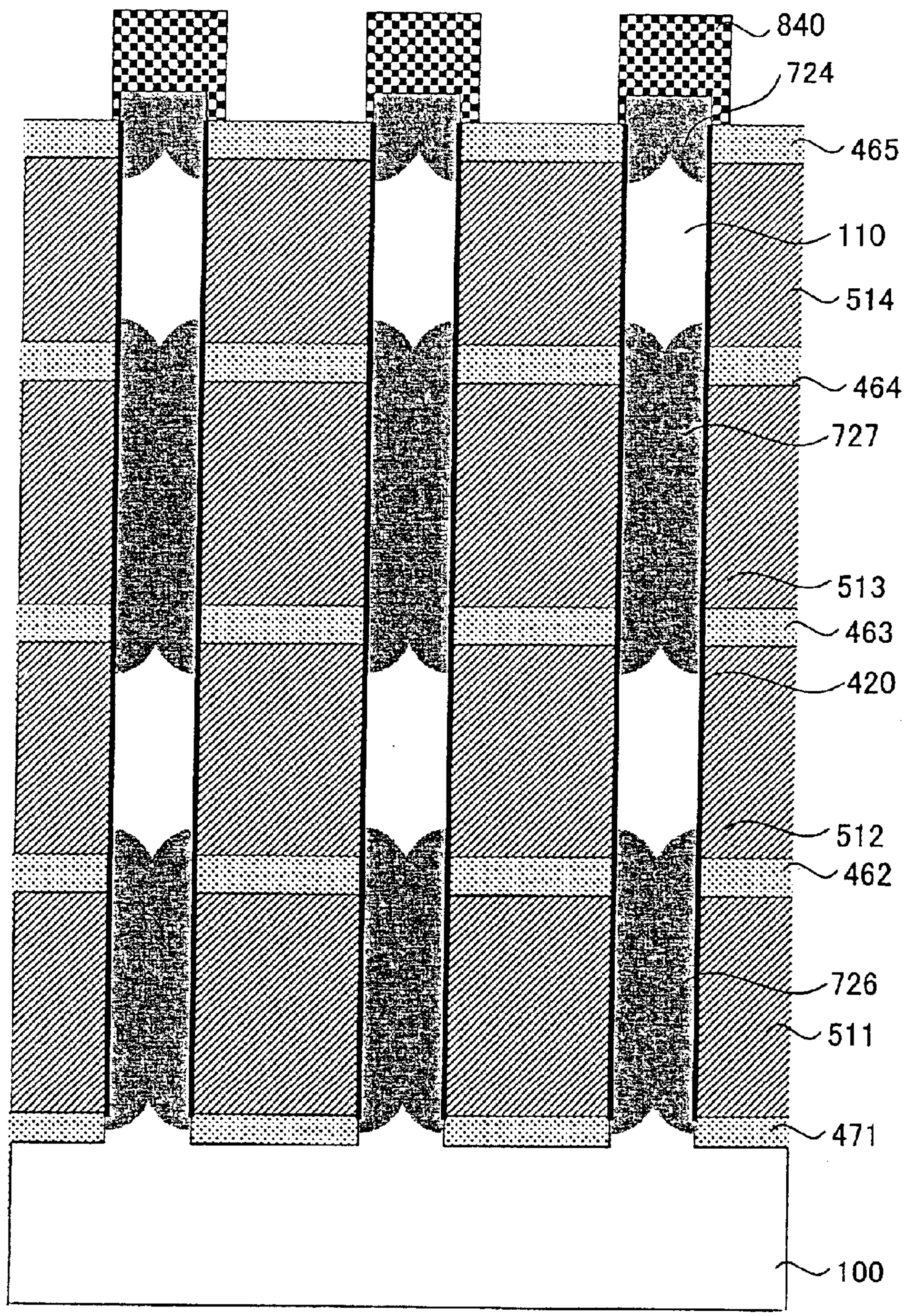

Fig. 1600
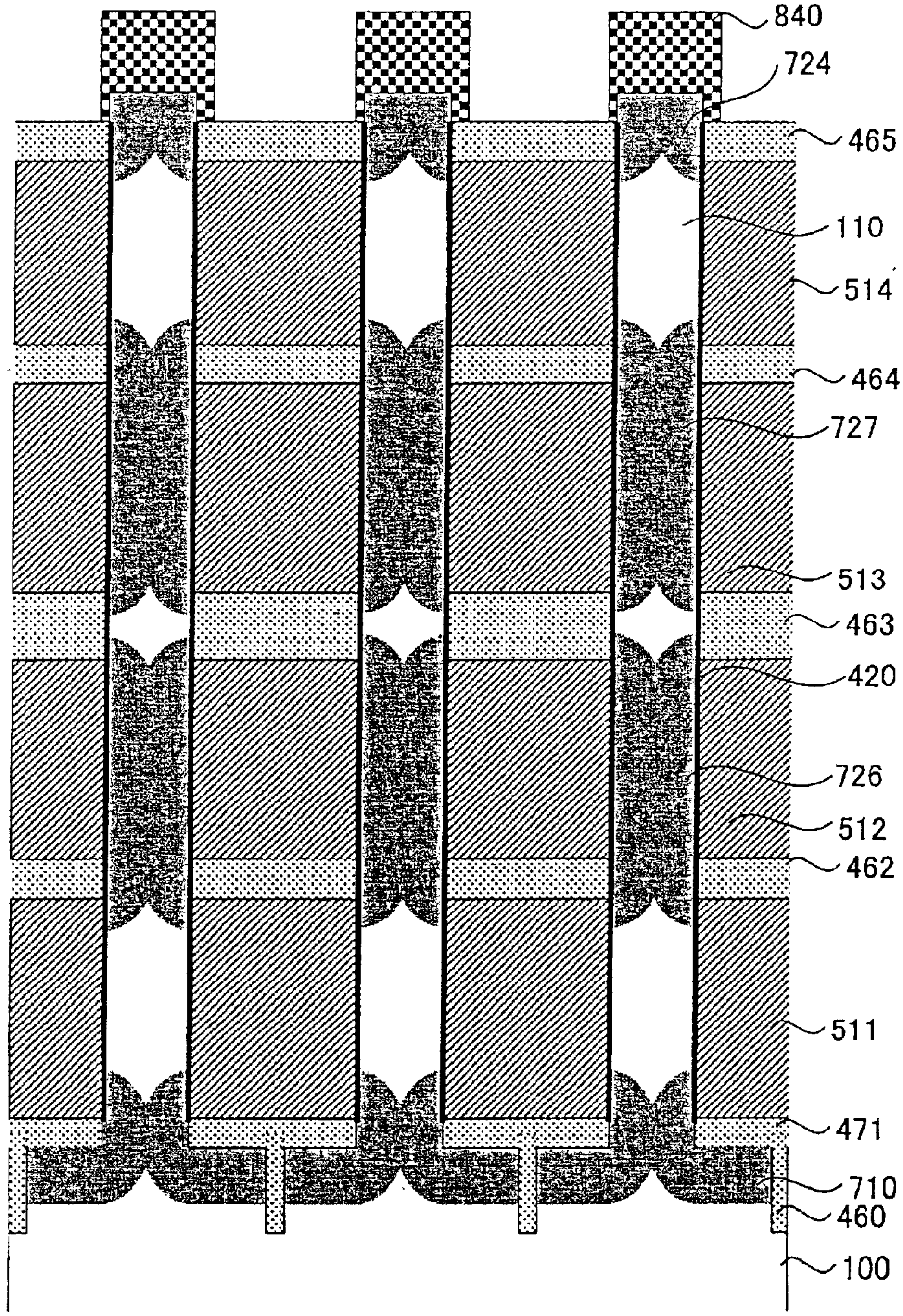

Fig. 1601
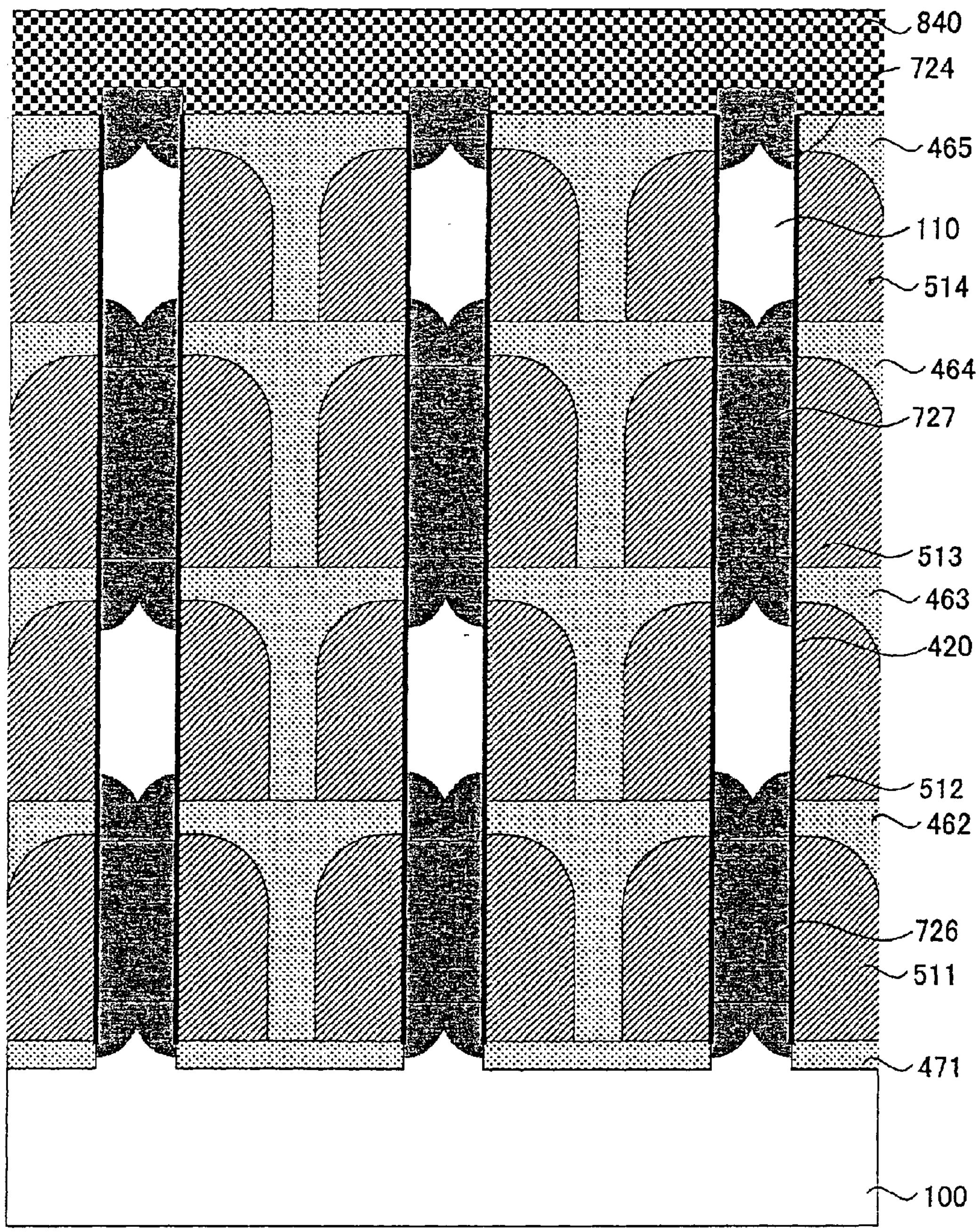

Fig. 1602
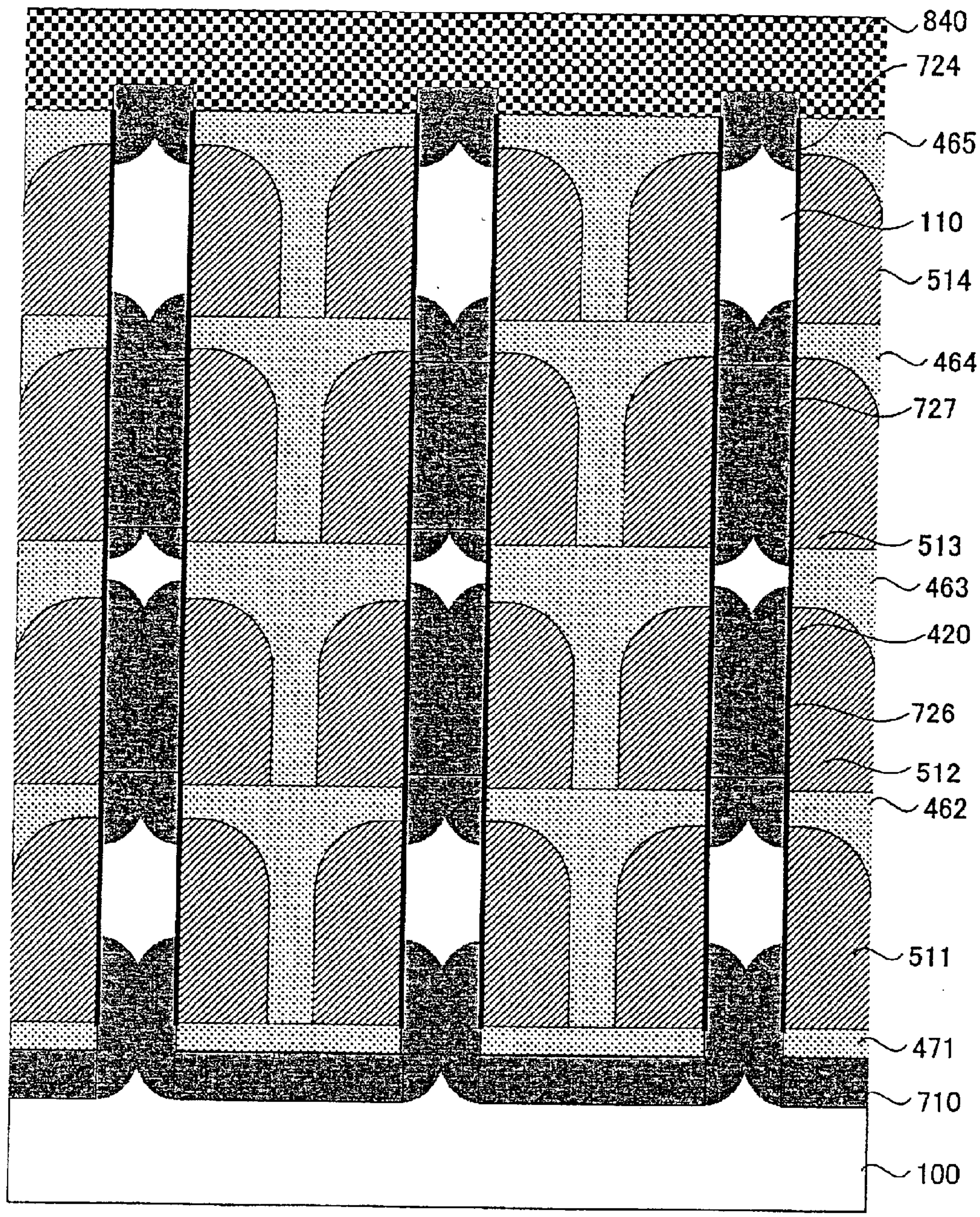

Fig. 1603
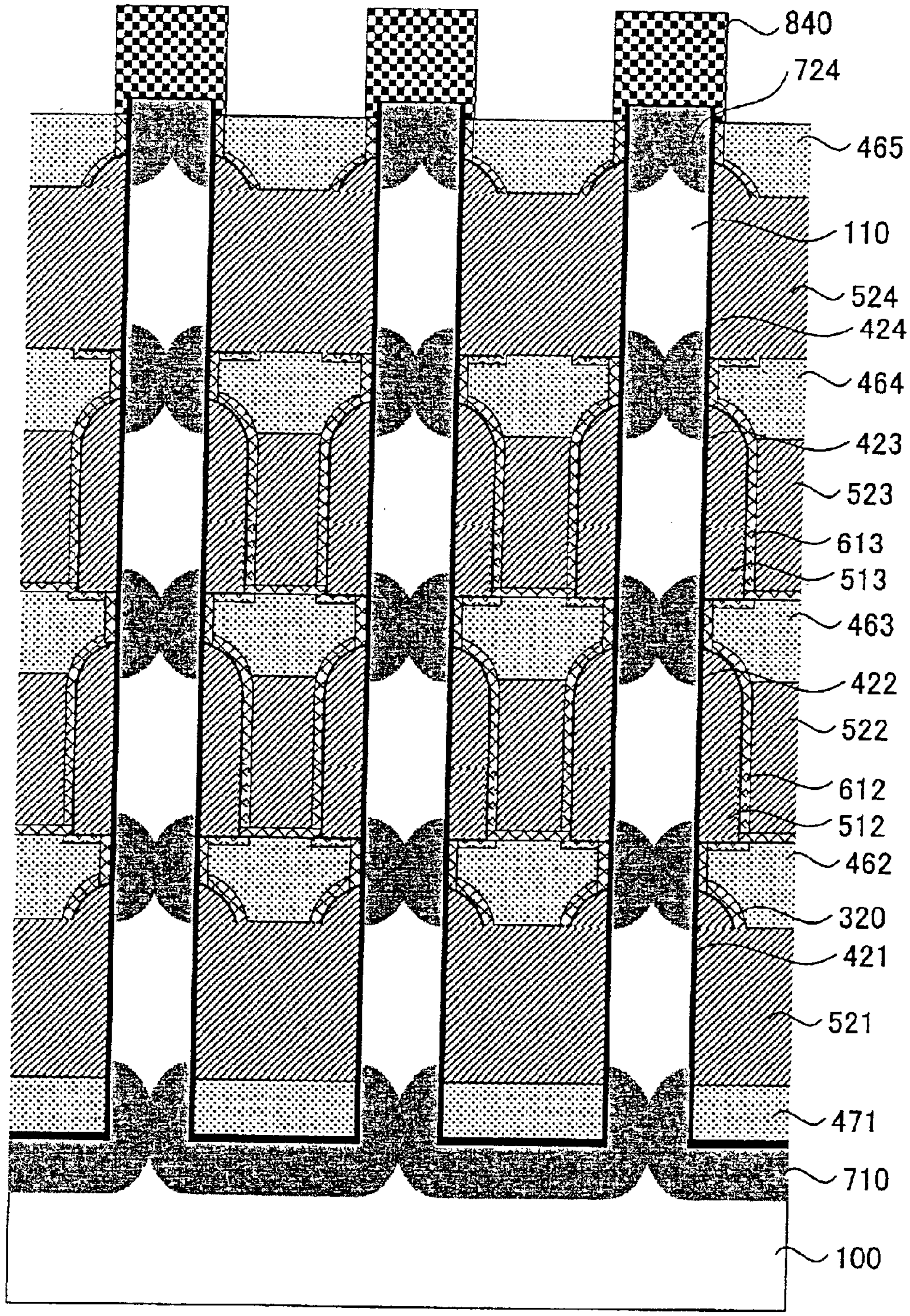

Fig. 1604
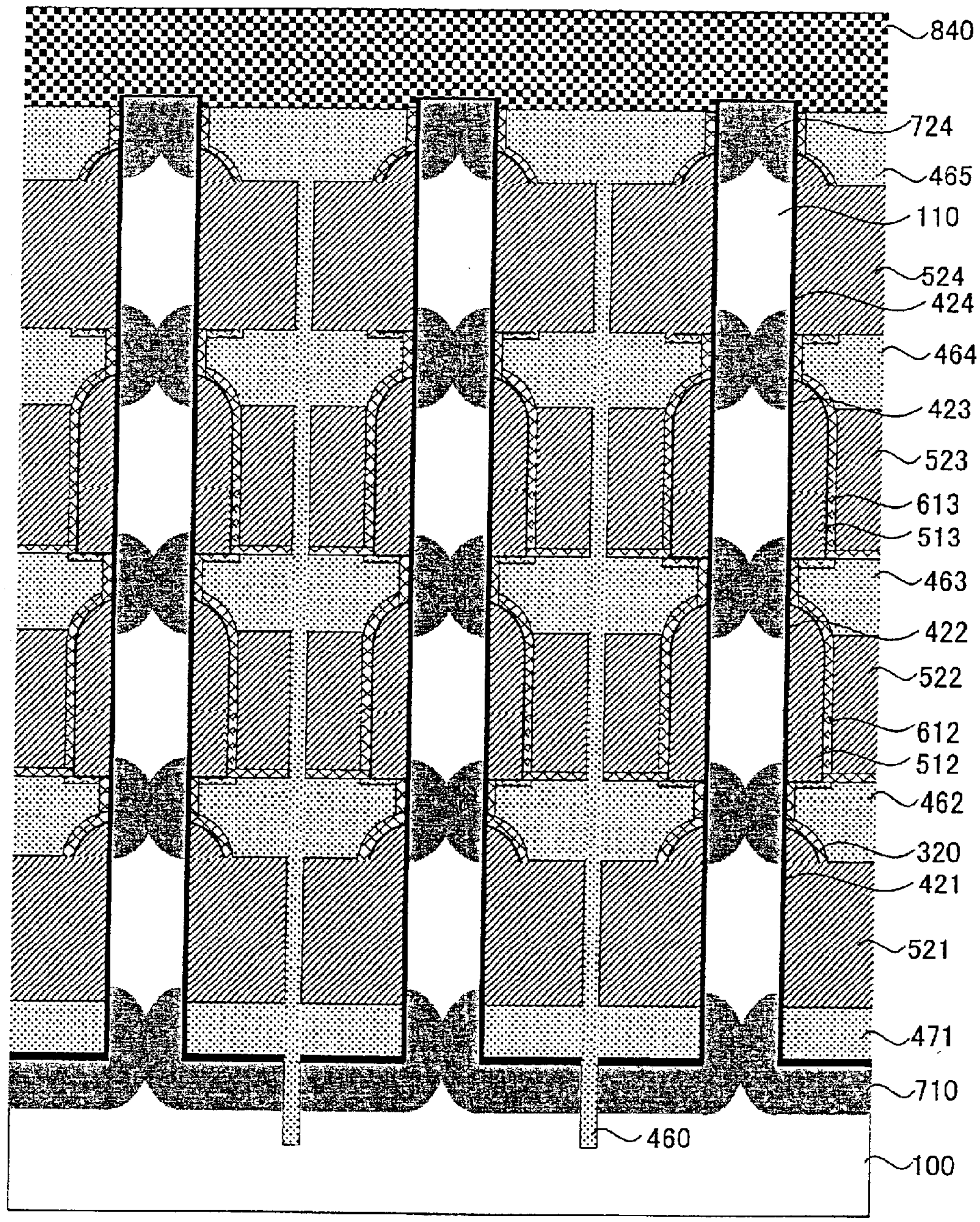

Fig. 1605
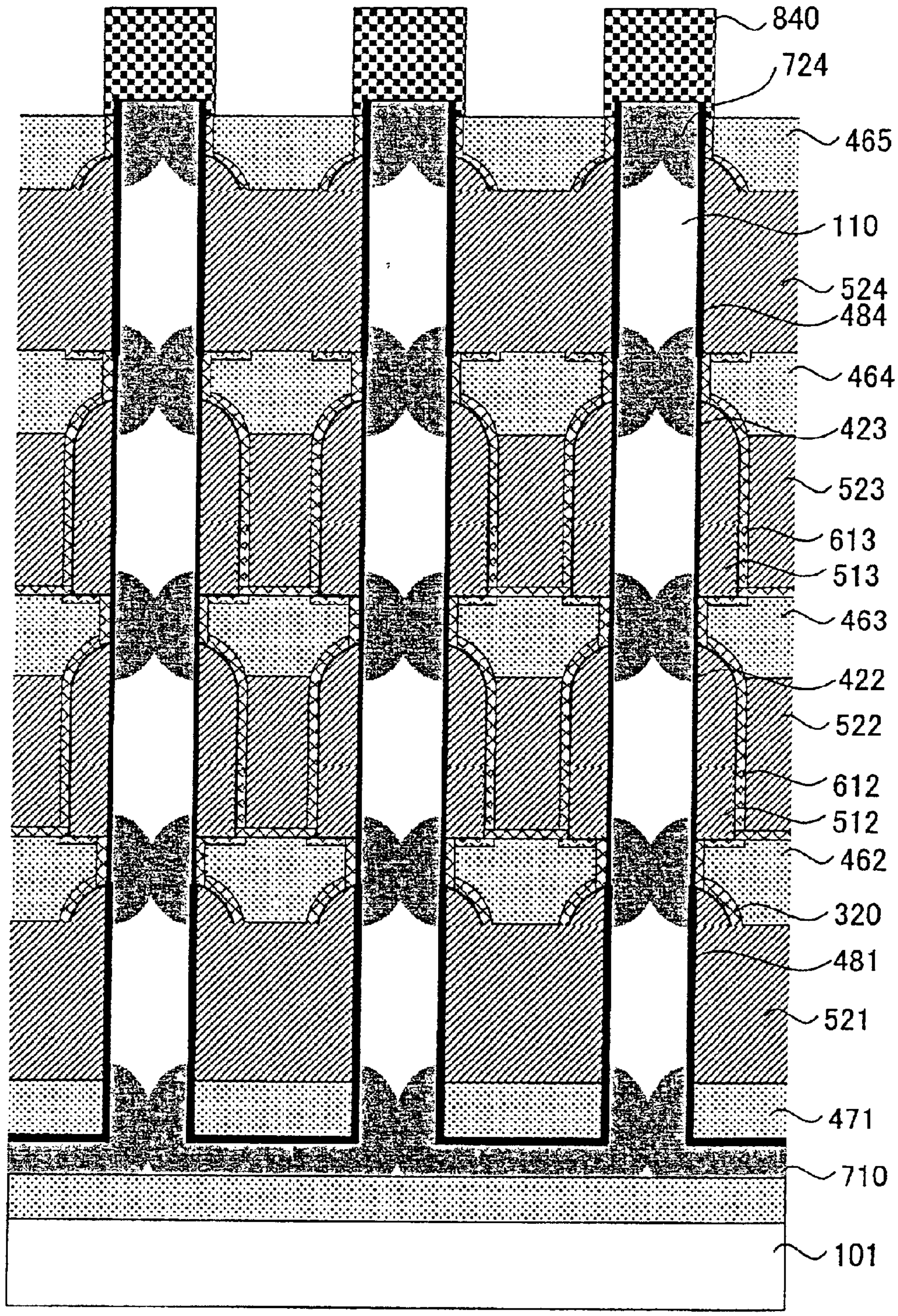

Fig. 1606
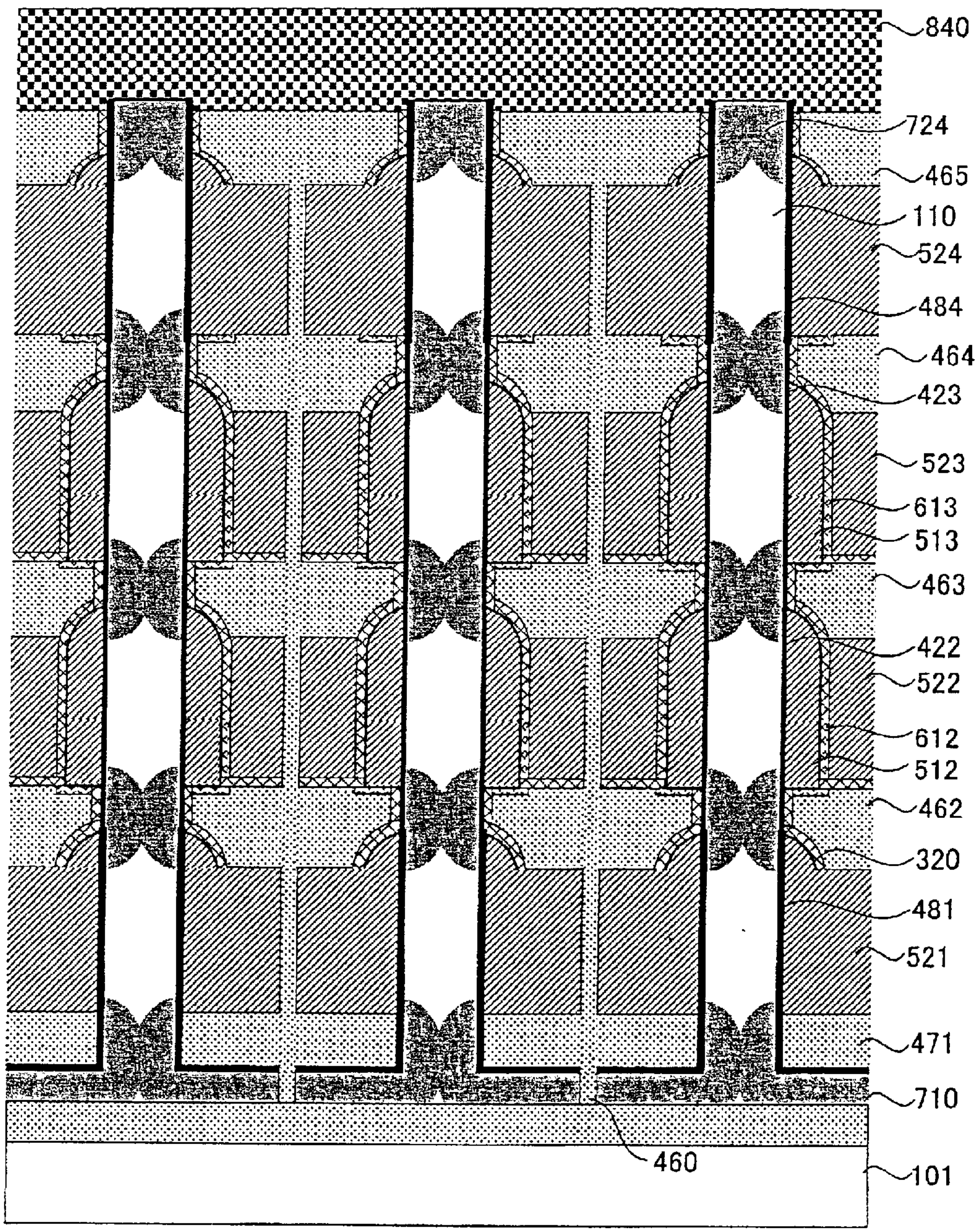

Fig. 1607
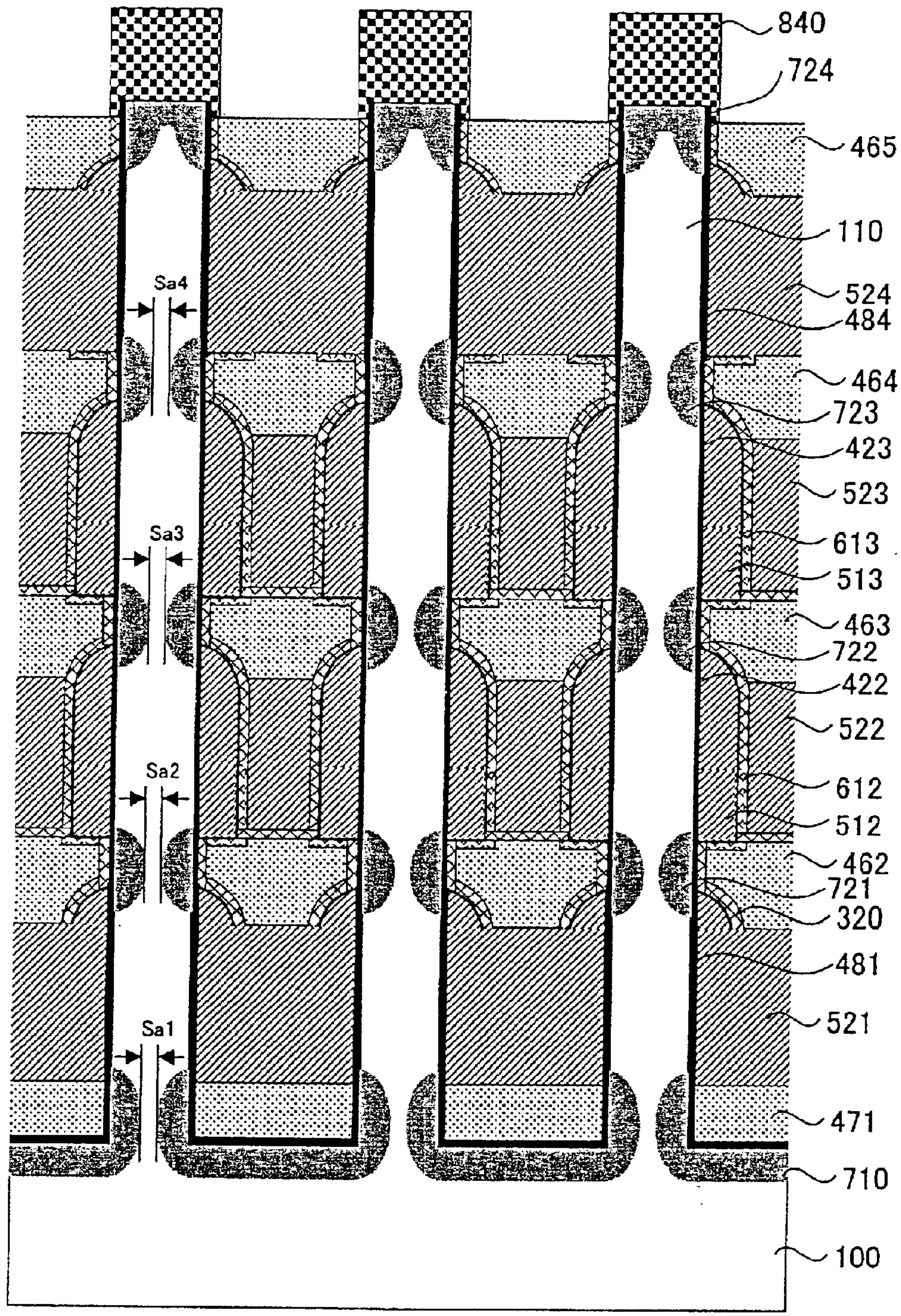

Fig. 1608
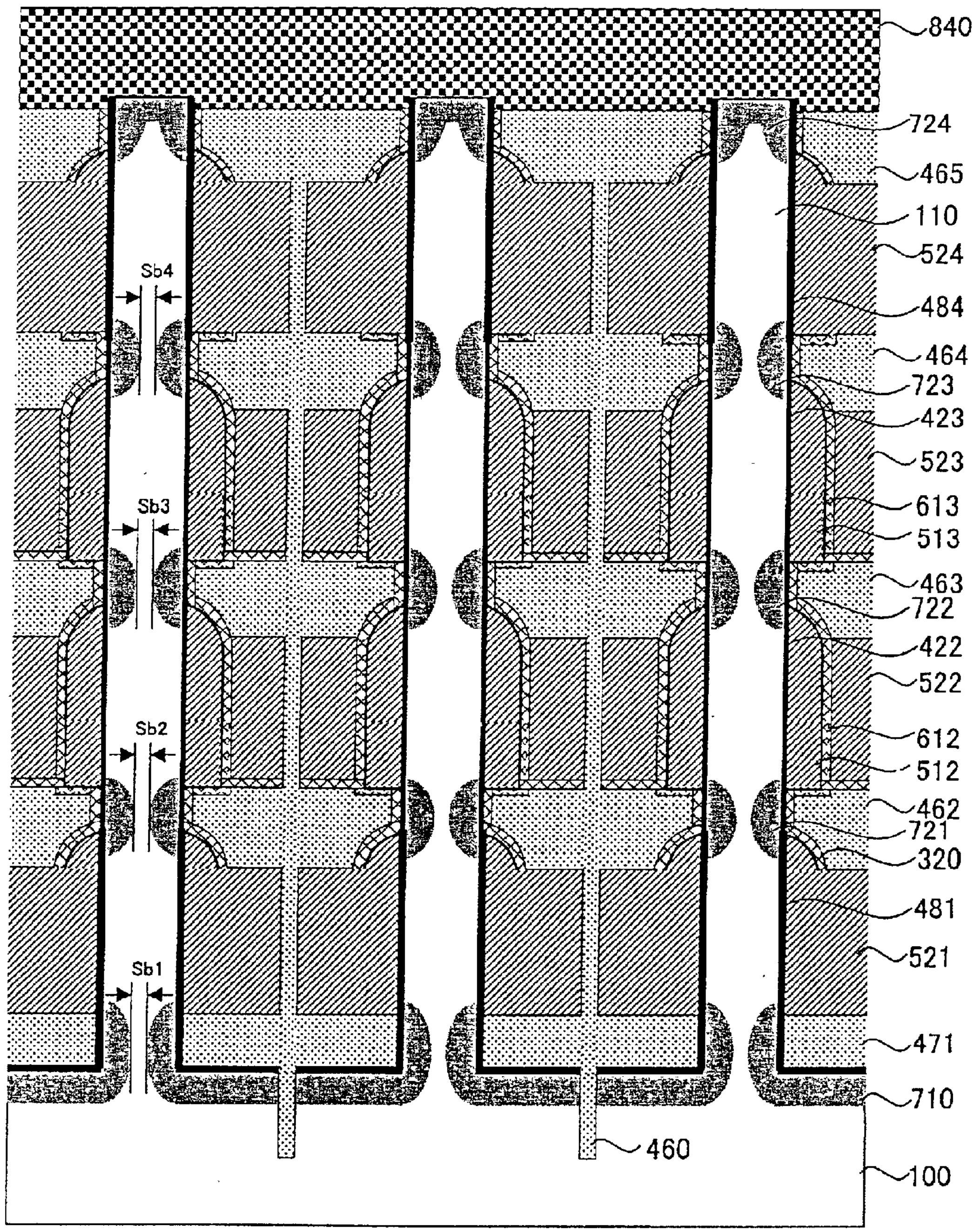

Fig. 1609
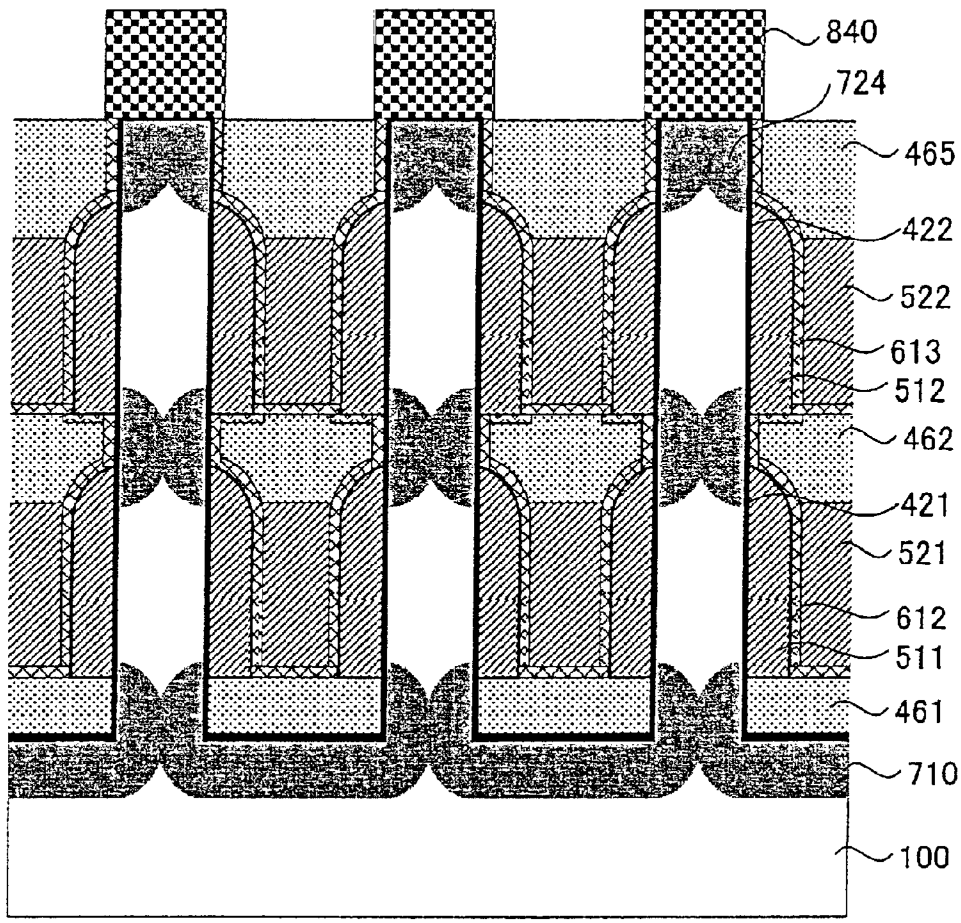

Fig. 1610
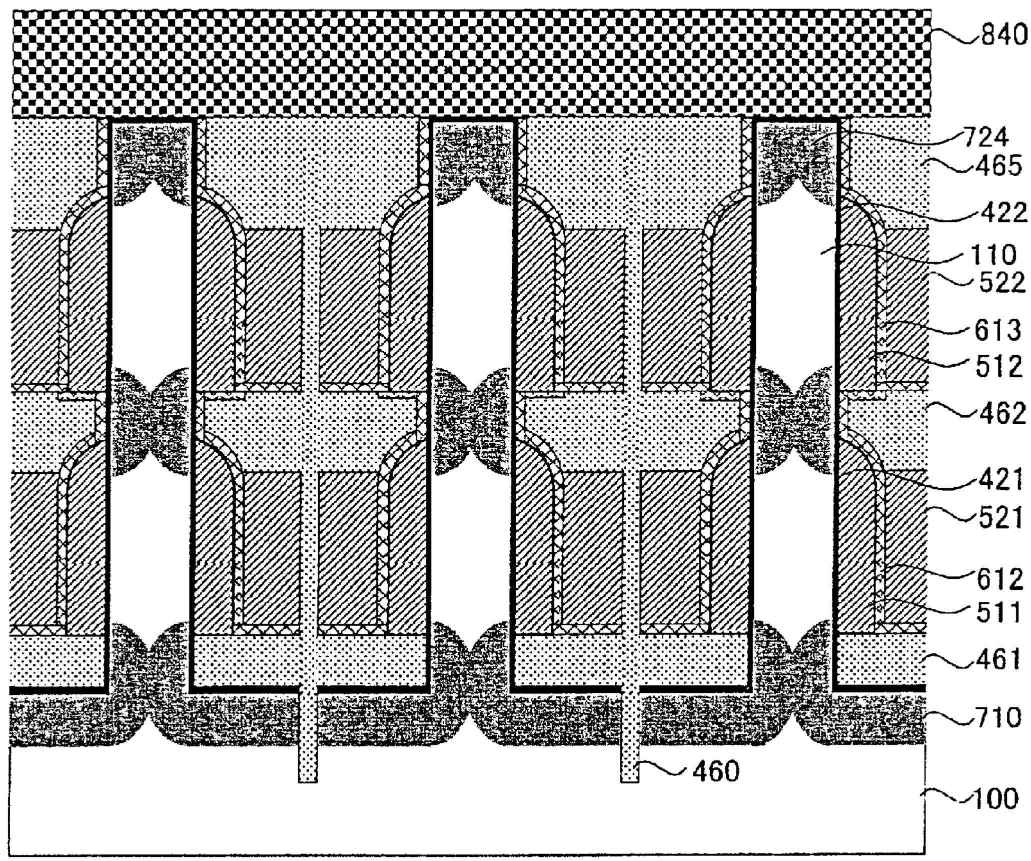

Fig. 1611
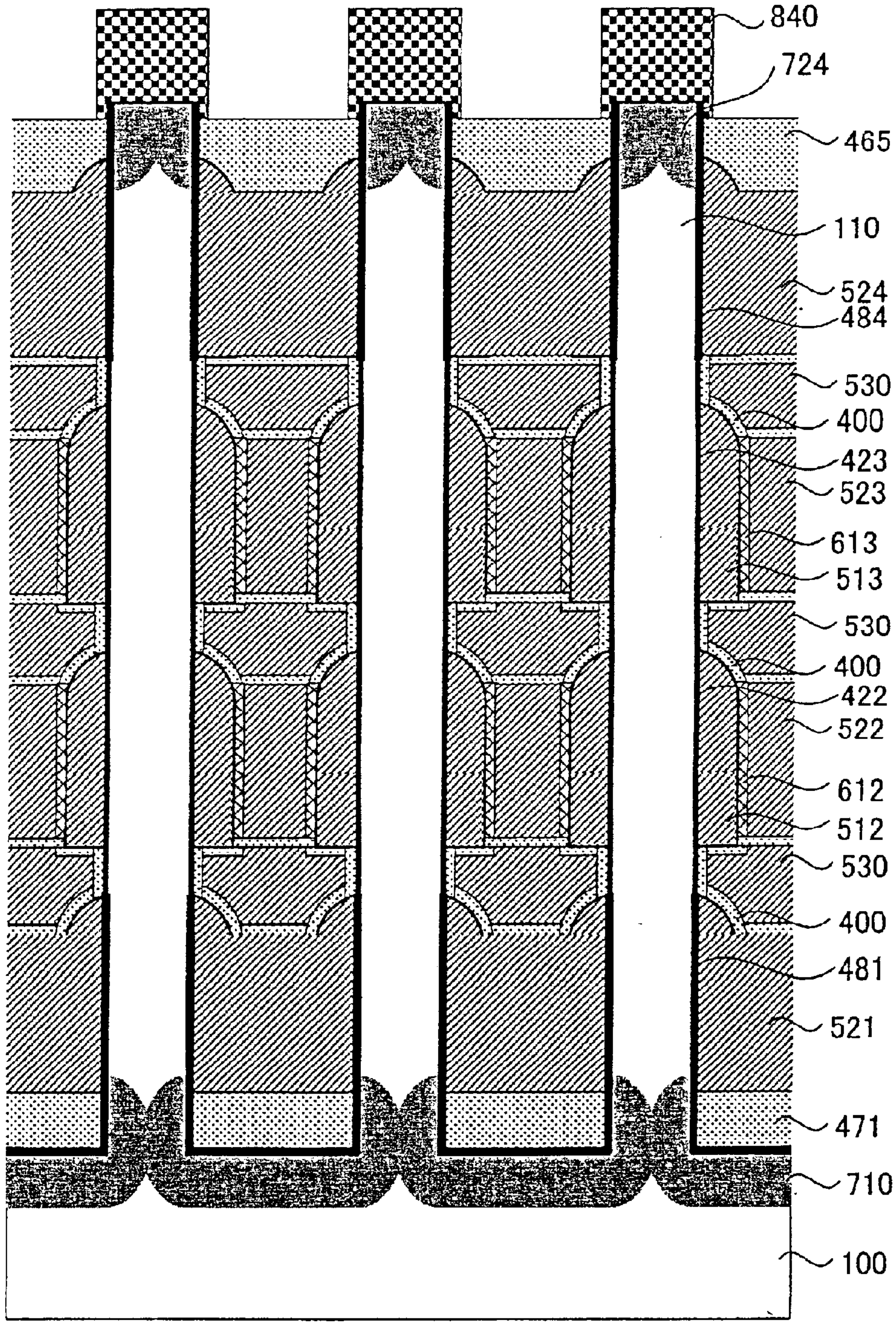

Fig. 1612
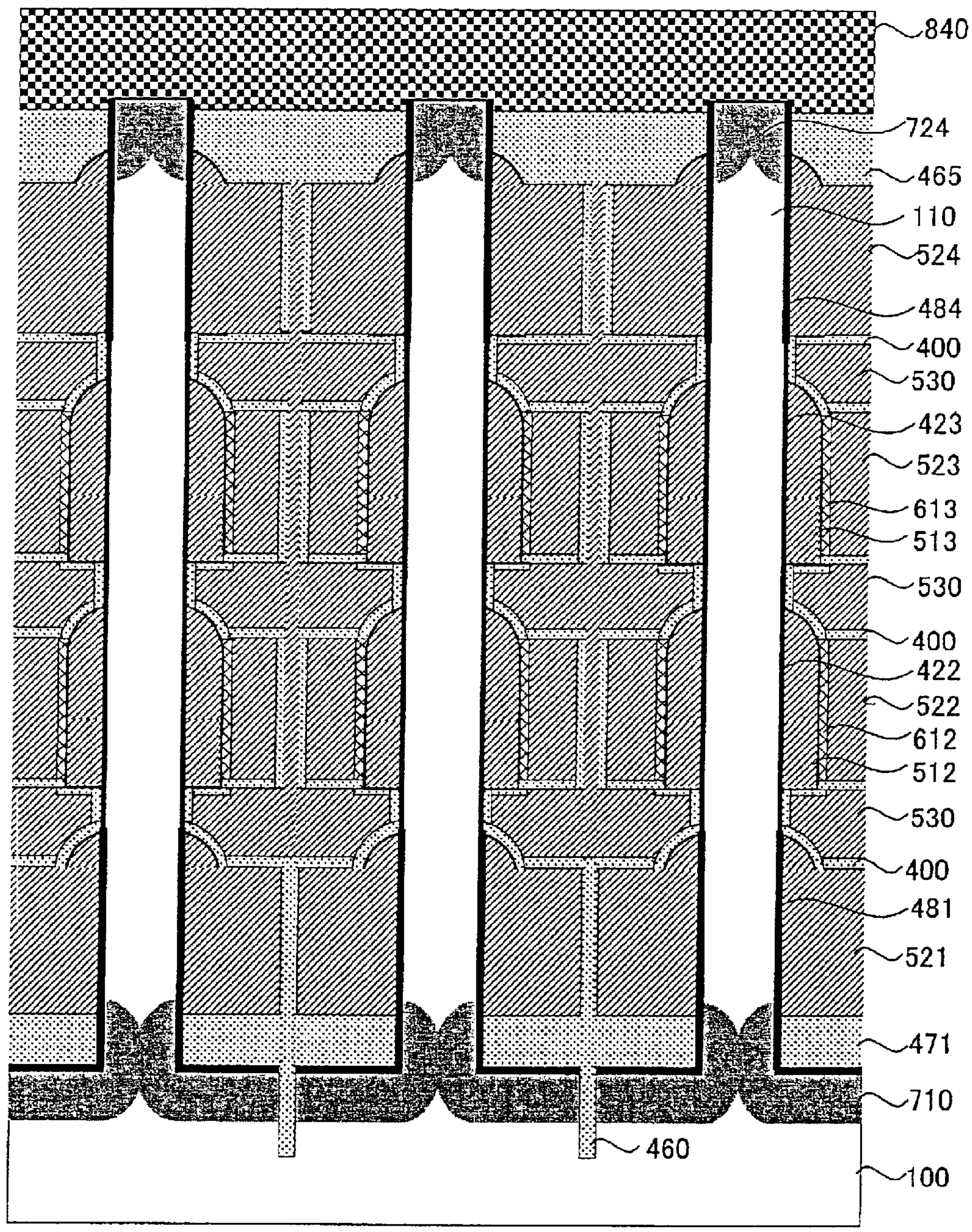

Fig. 1613
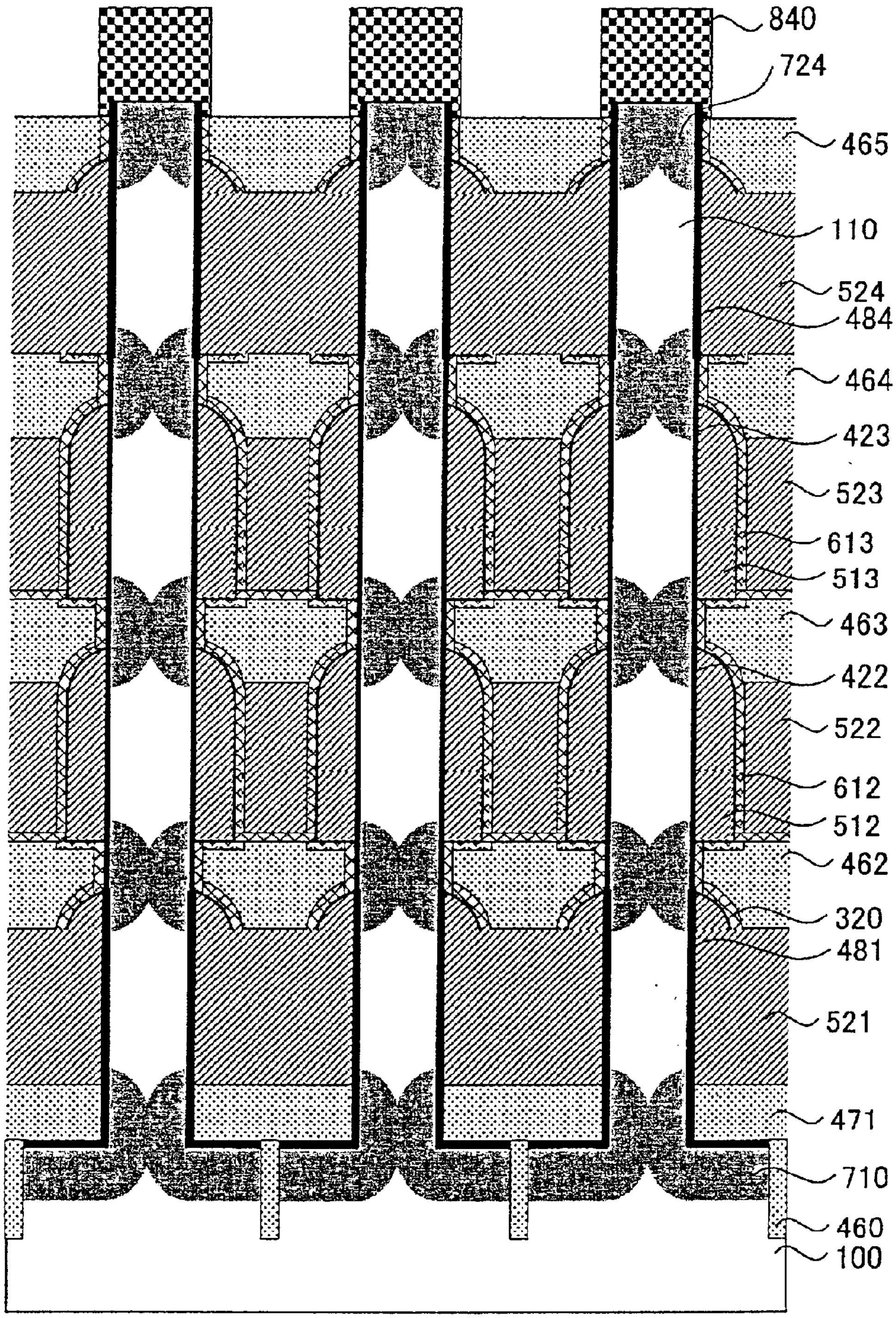

Fig. 1614
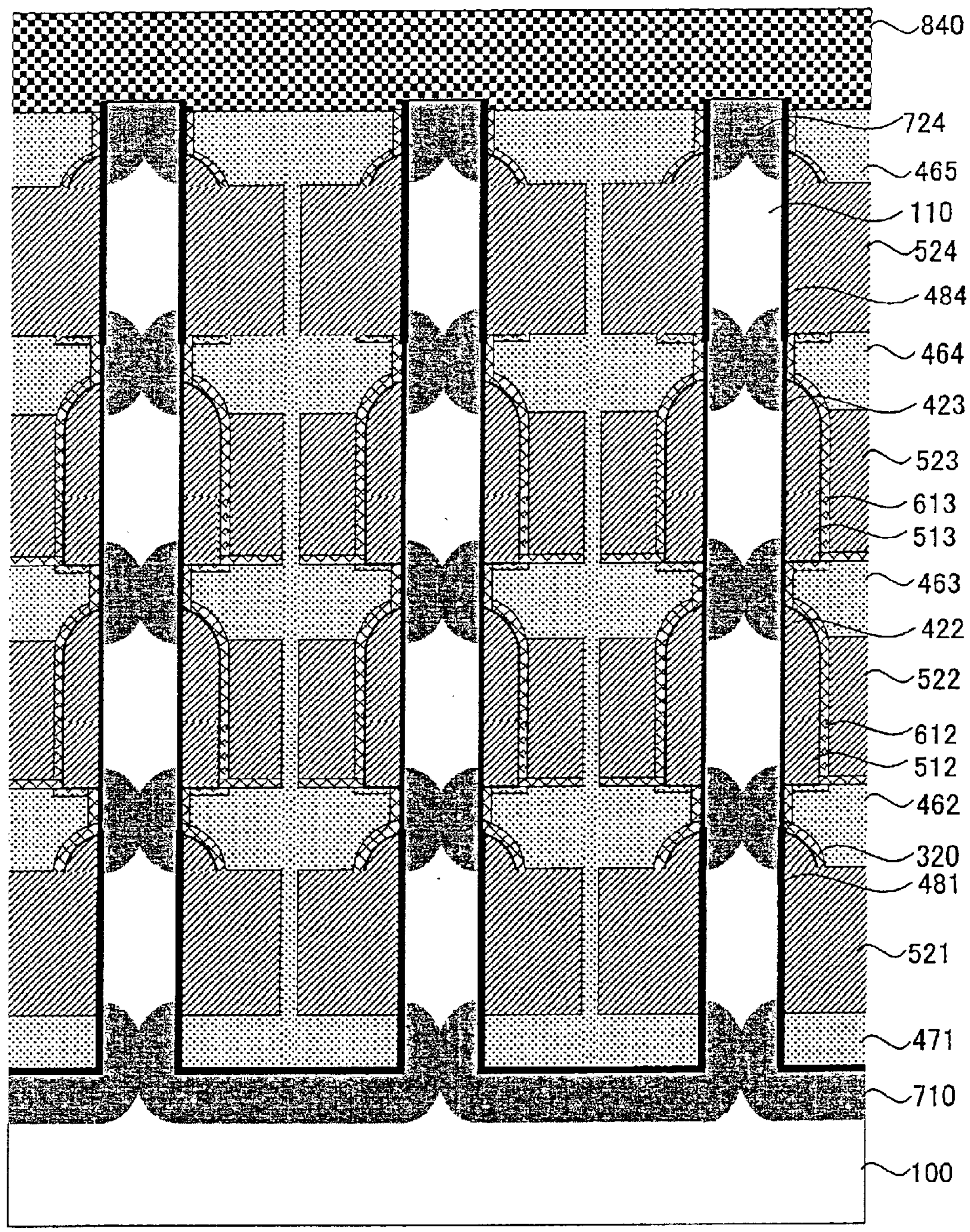

Fig. 1615
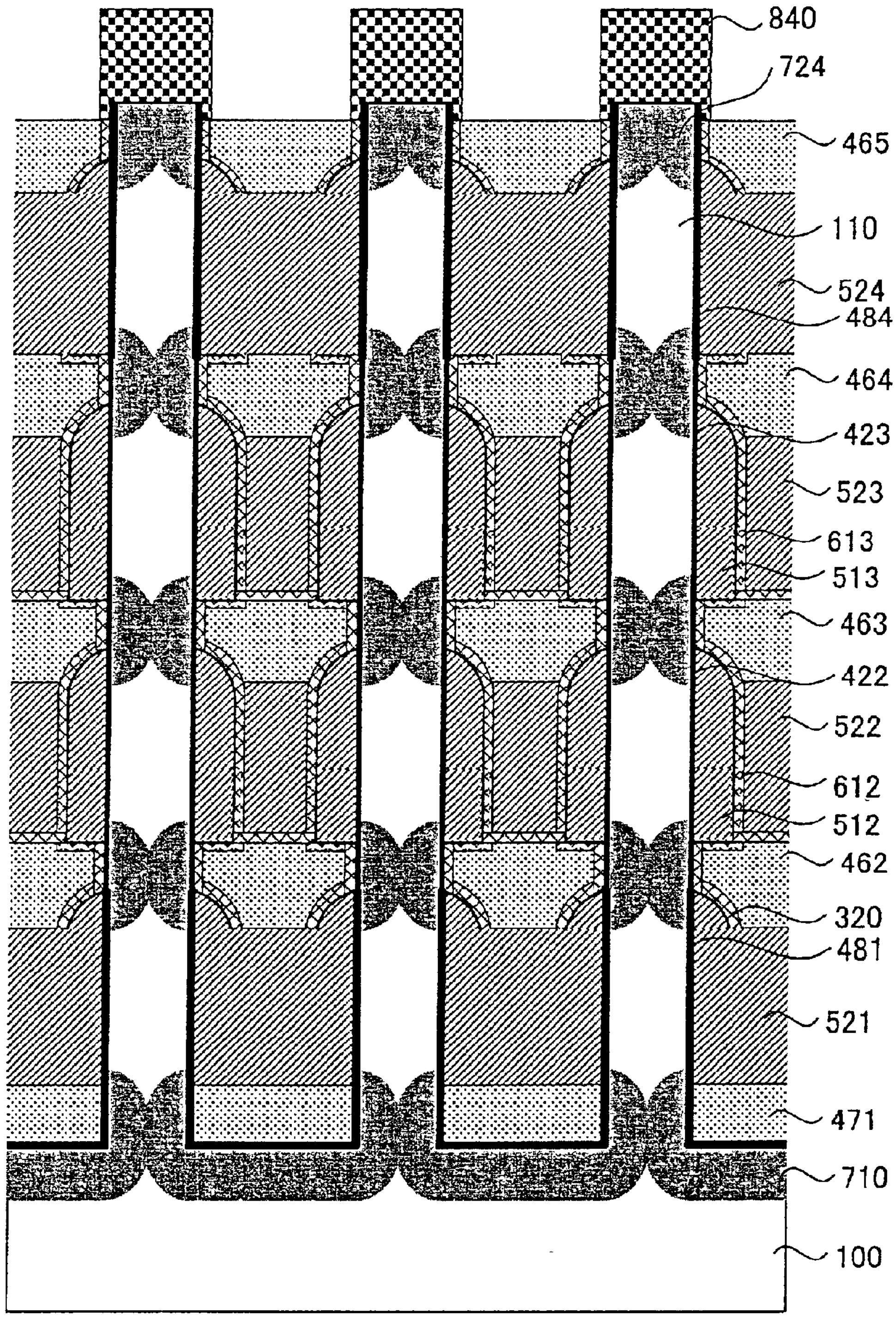

Fig. 1616
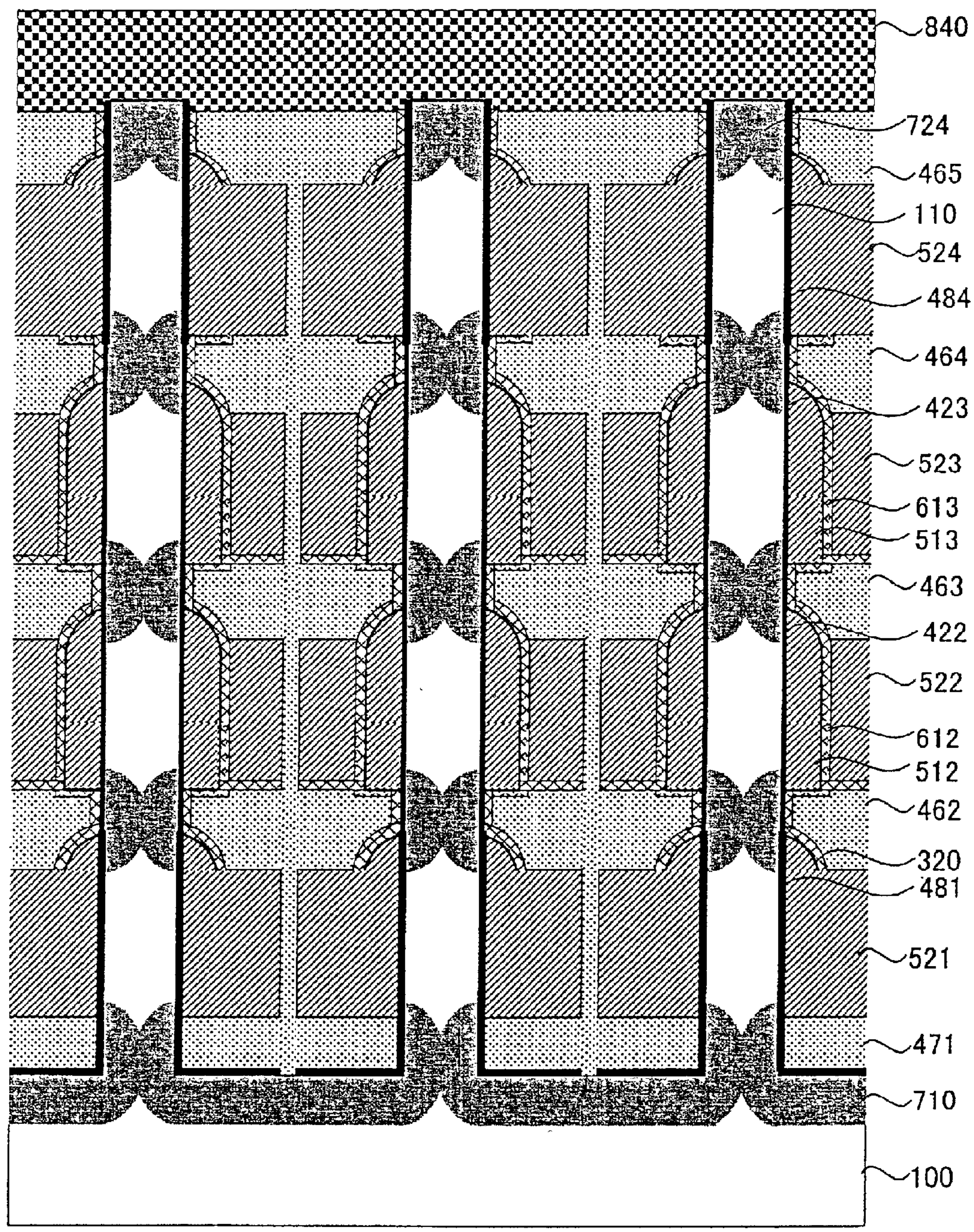

Fig. 1617
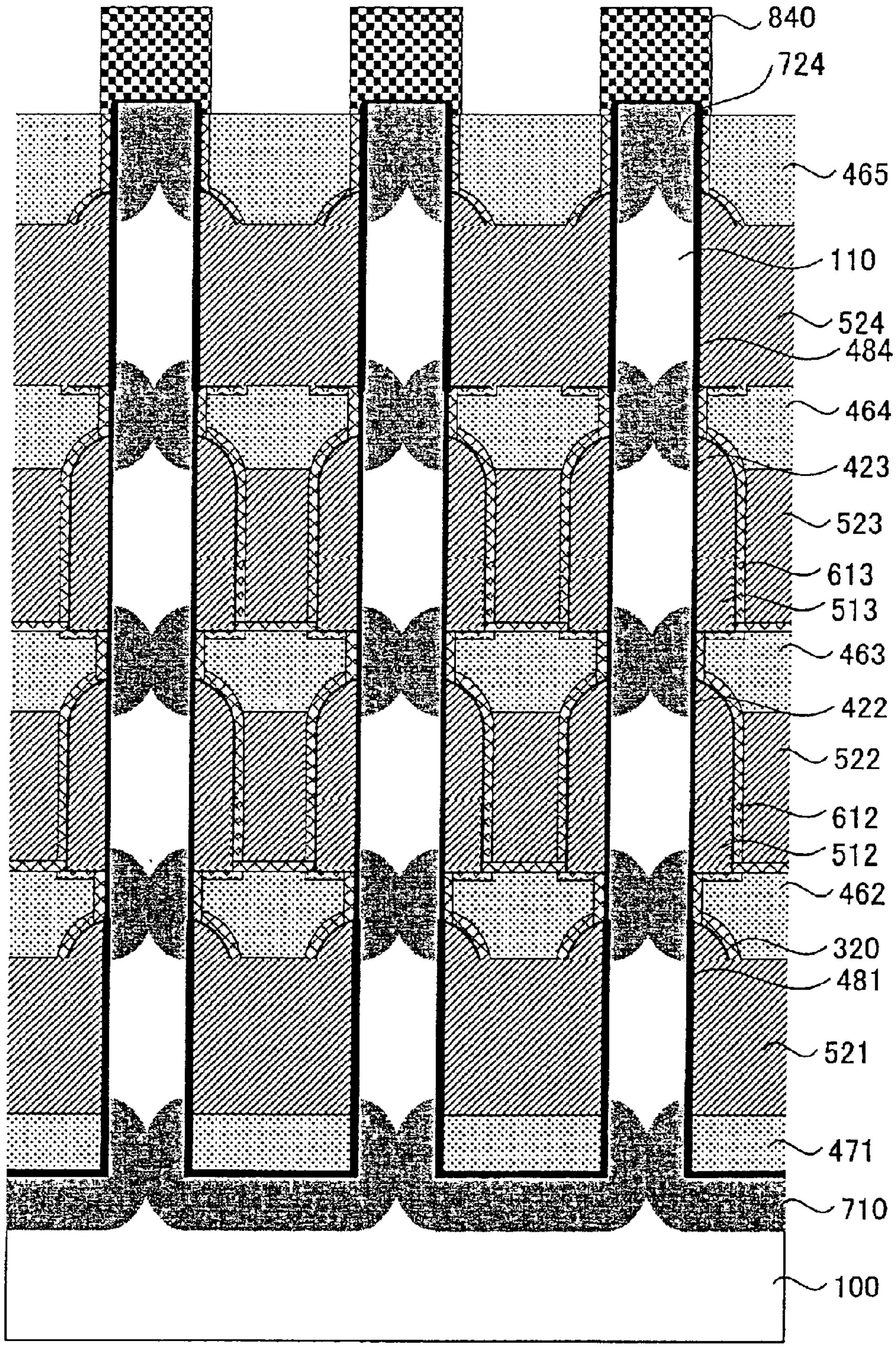

Fig. 1618
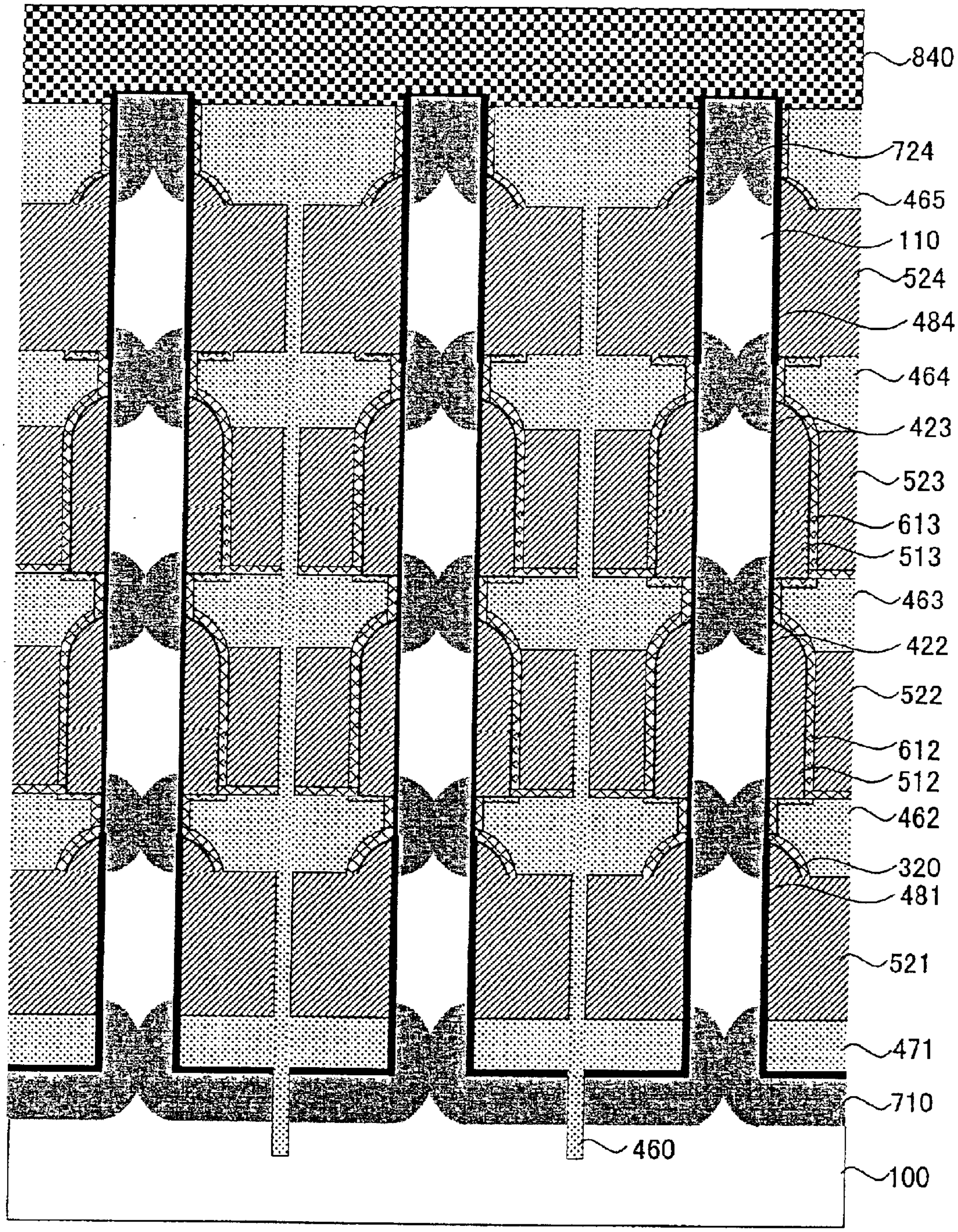

Fig. 1619
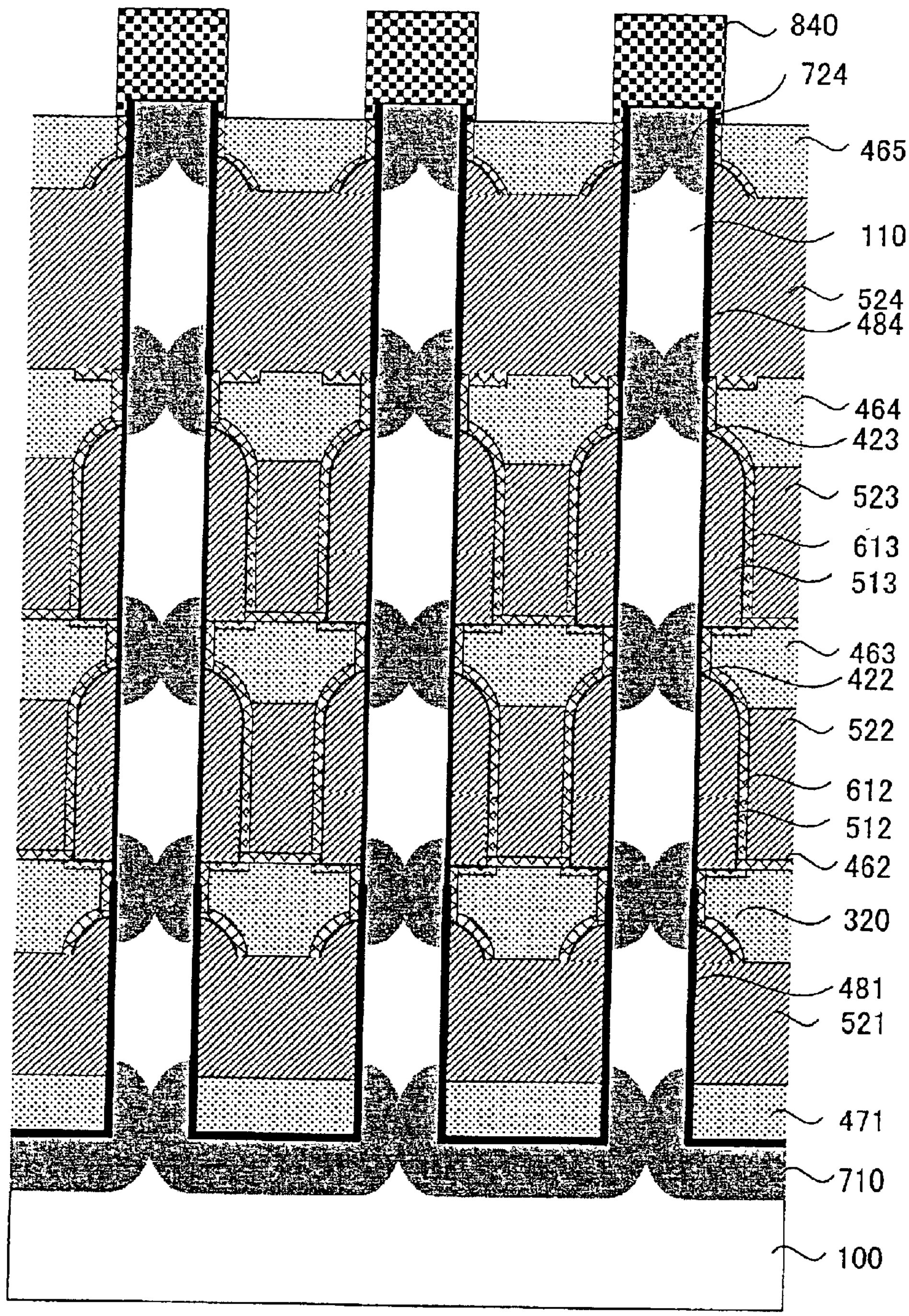

Fig. 1620
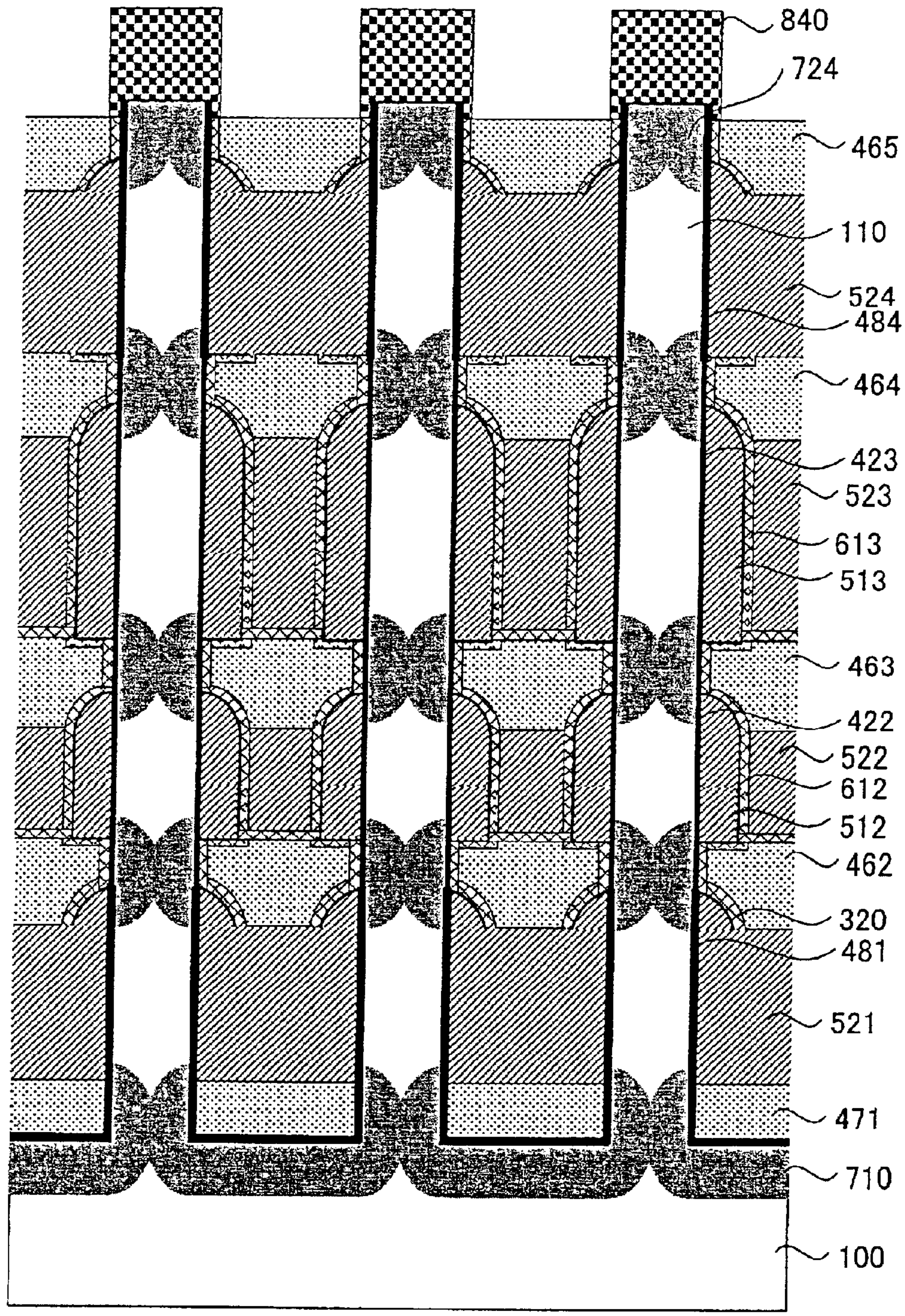

Fig. 1621
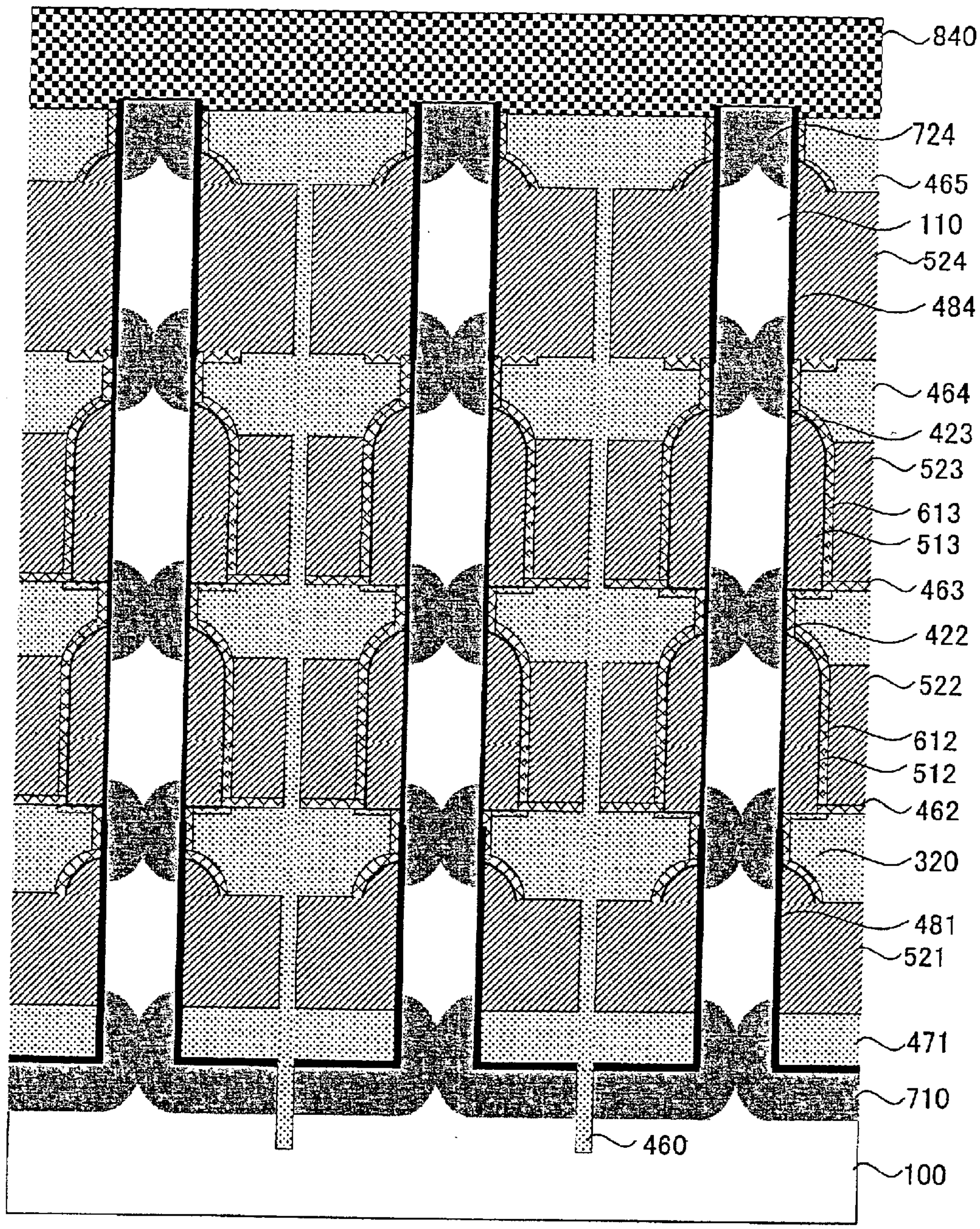

Fig. 1622
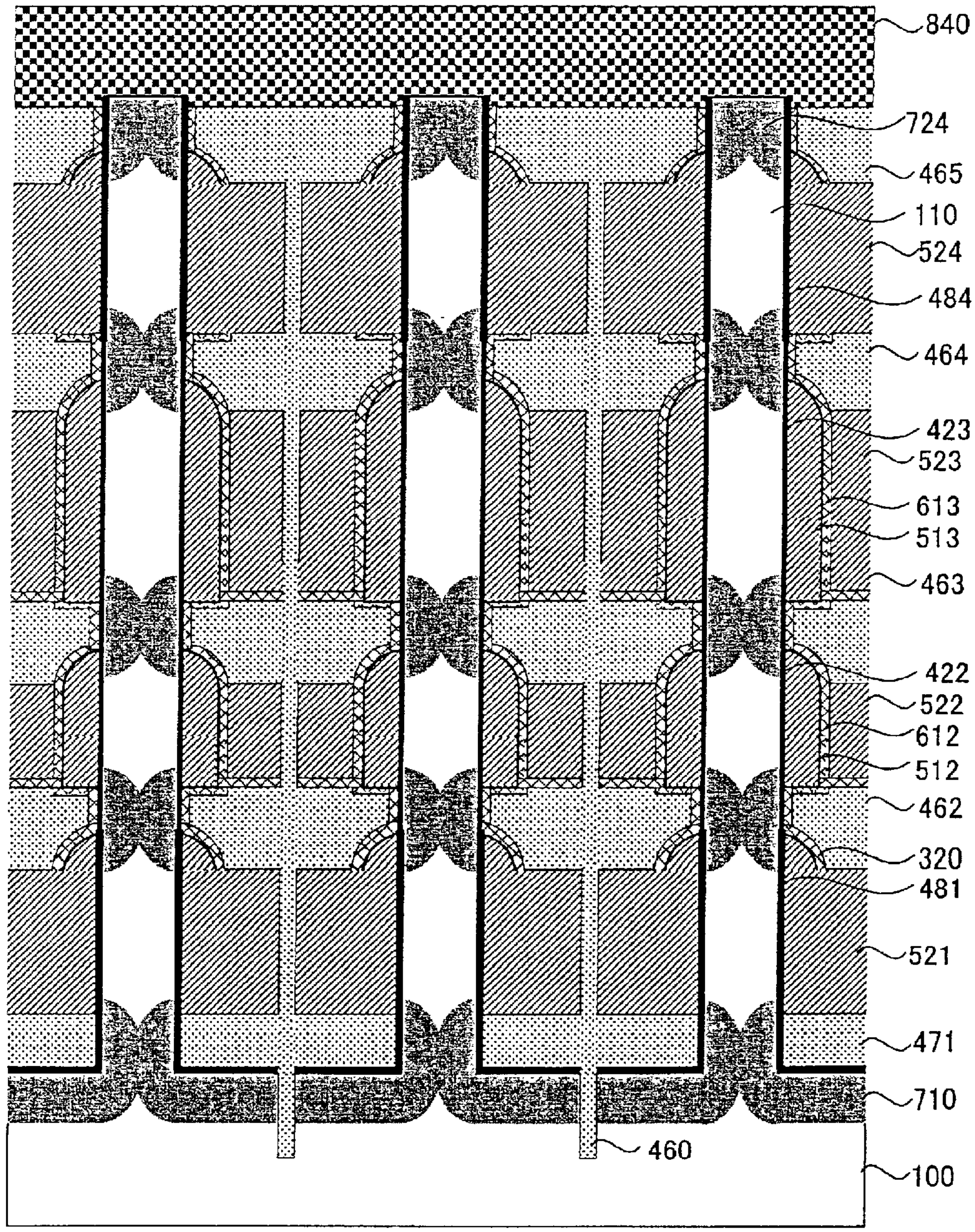

Fig. 1623
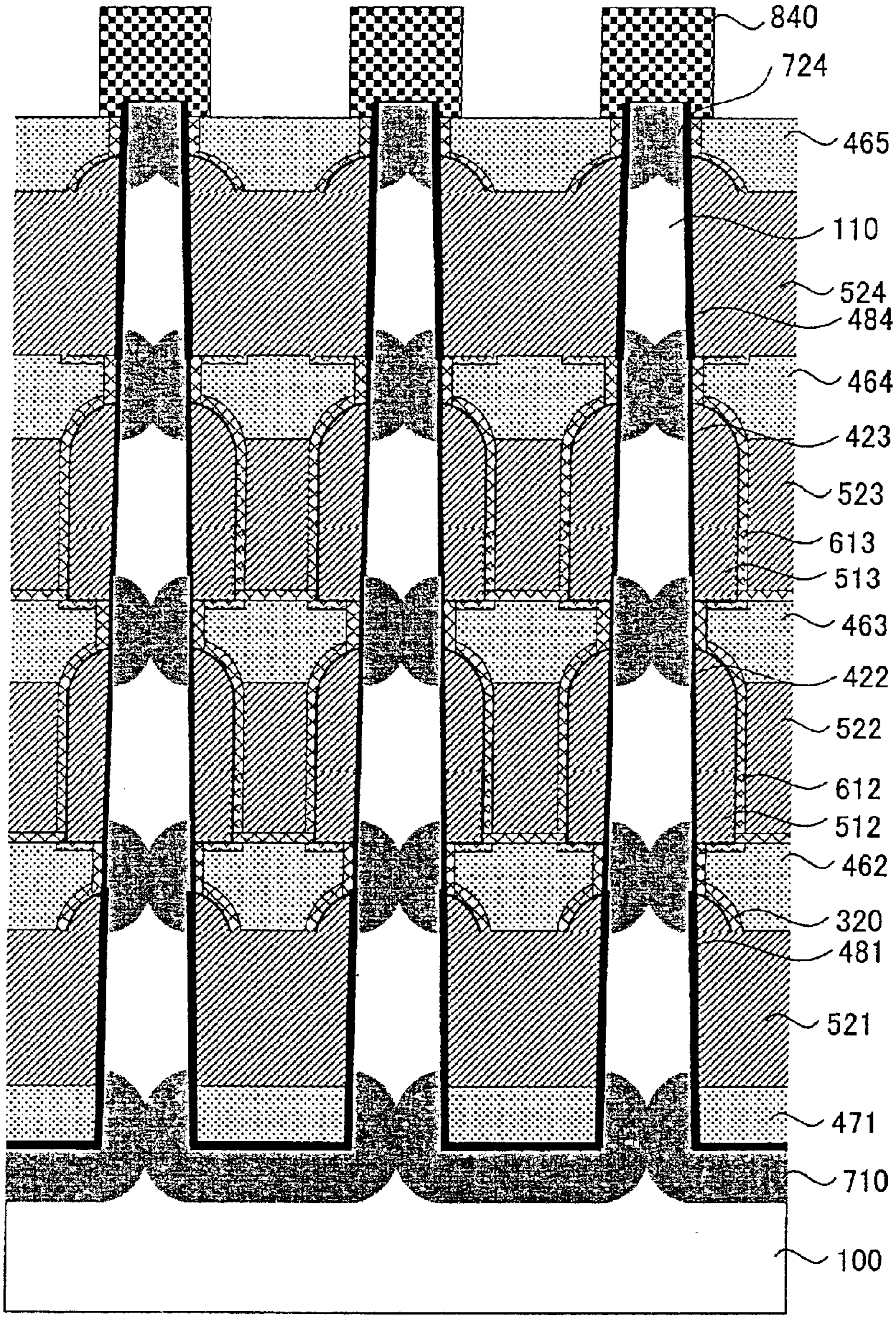

Fig. 1624
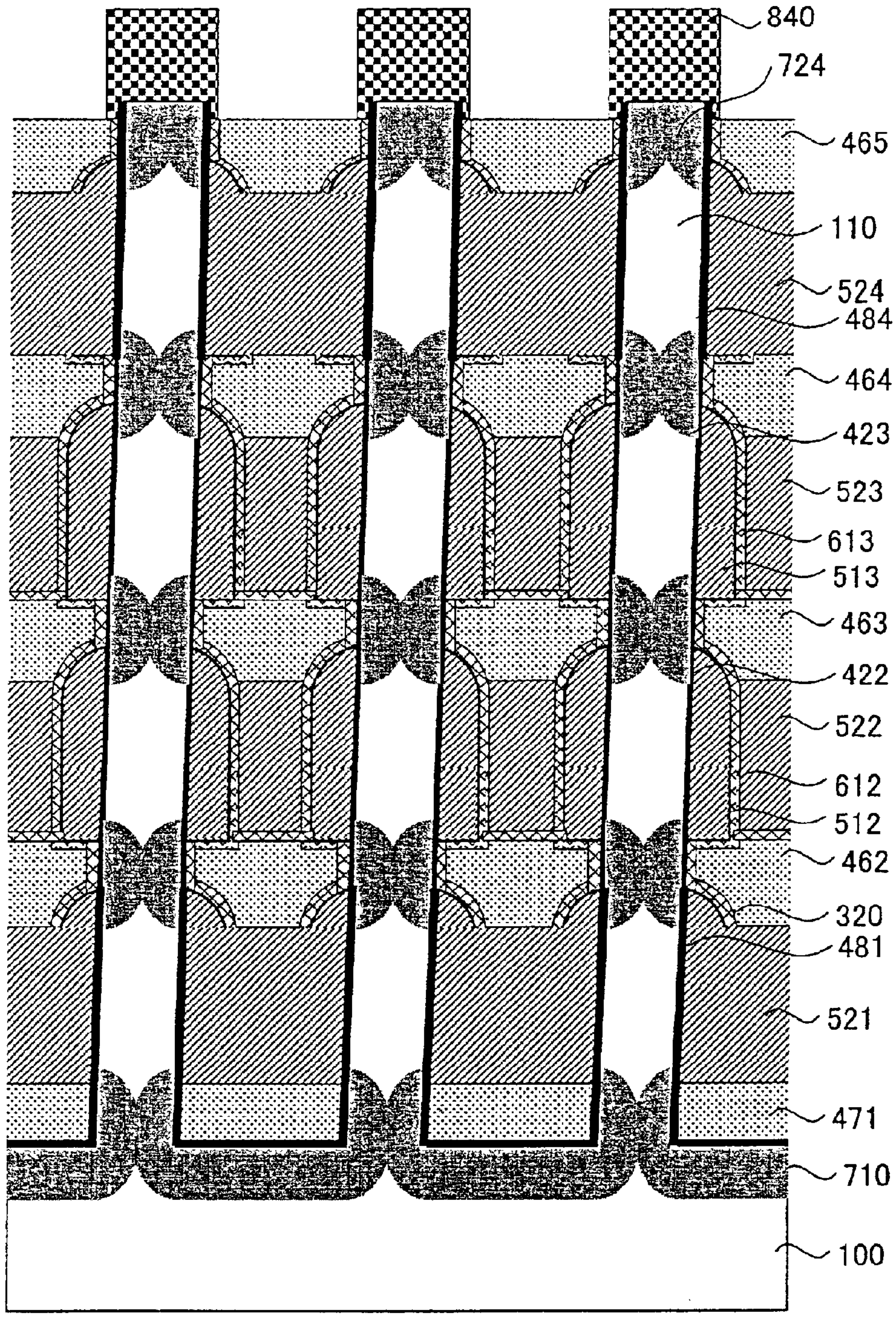

Fig. 1625
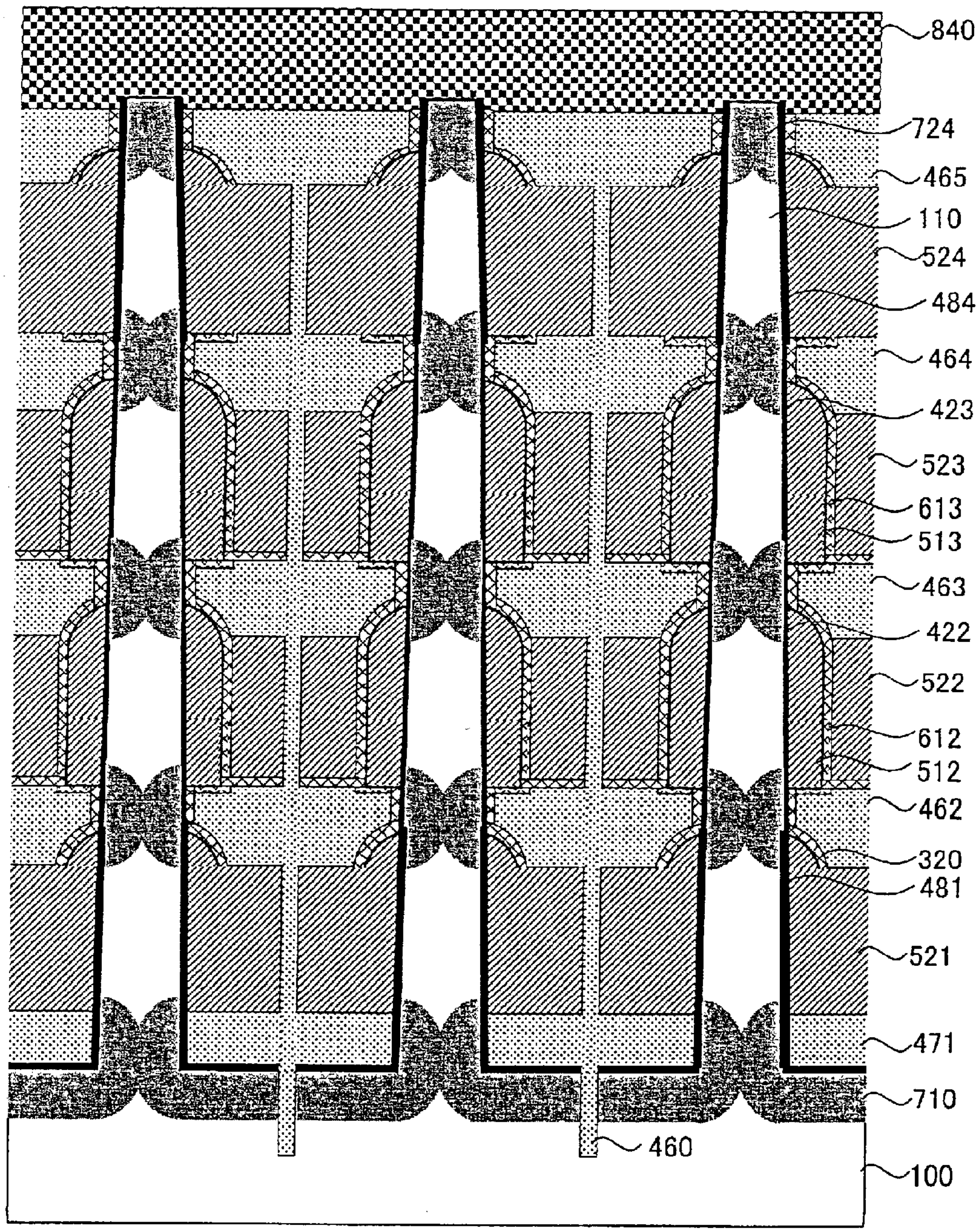

Fig. 1626
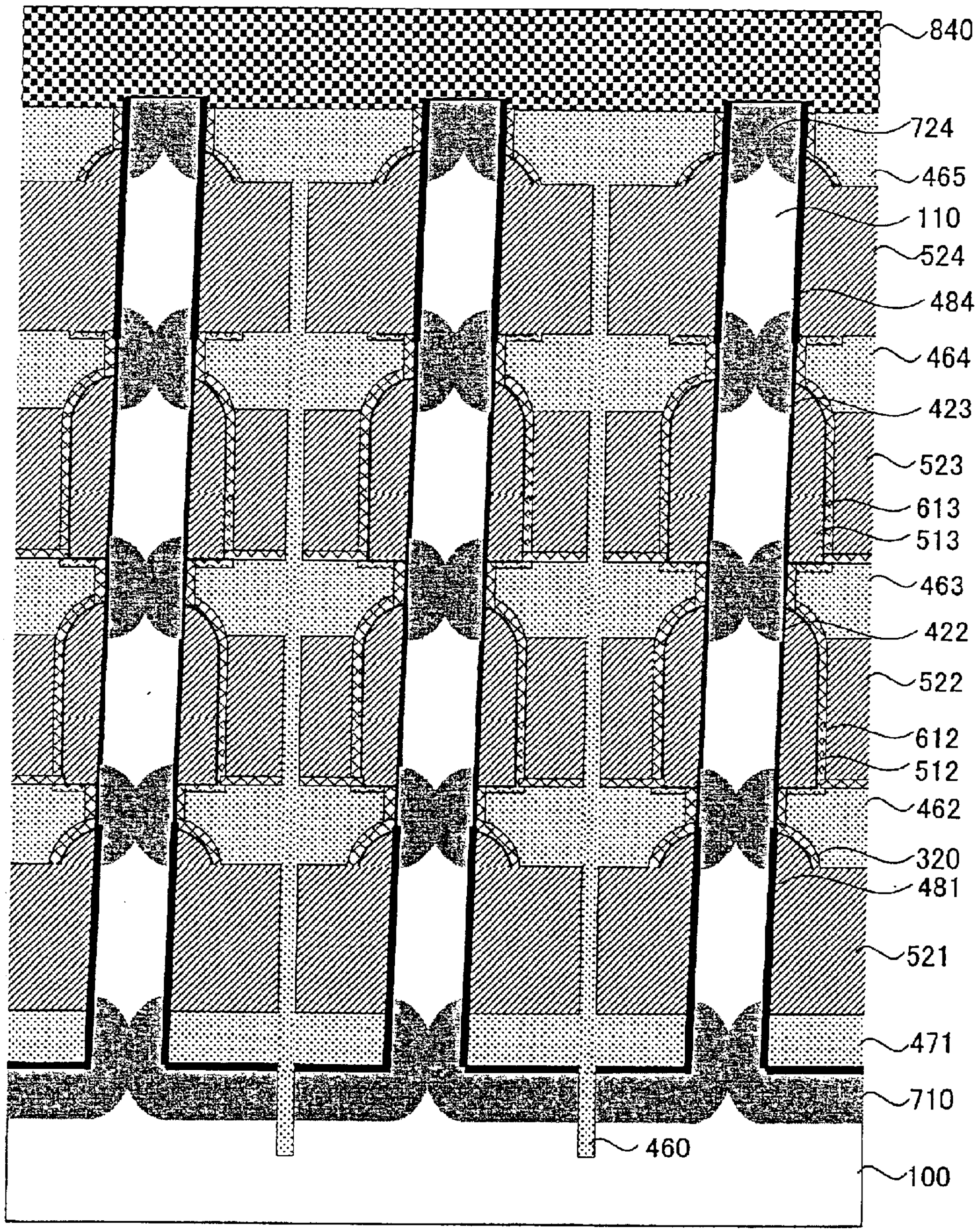

Fig. 1627
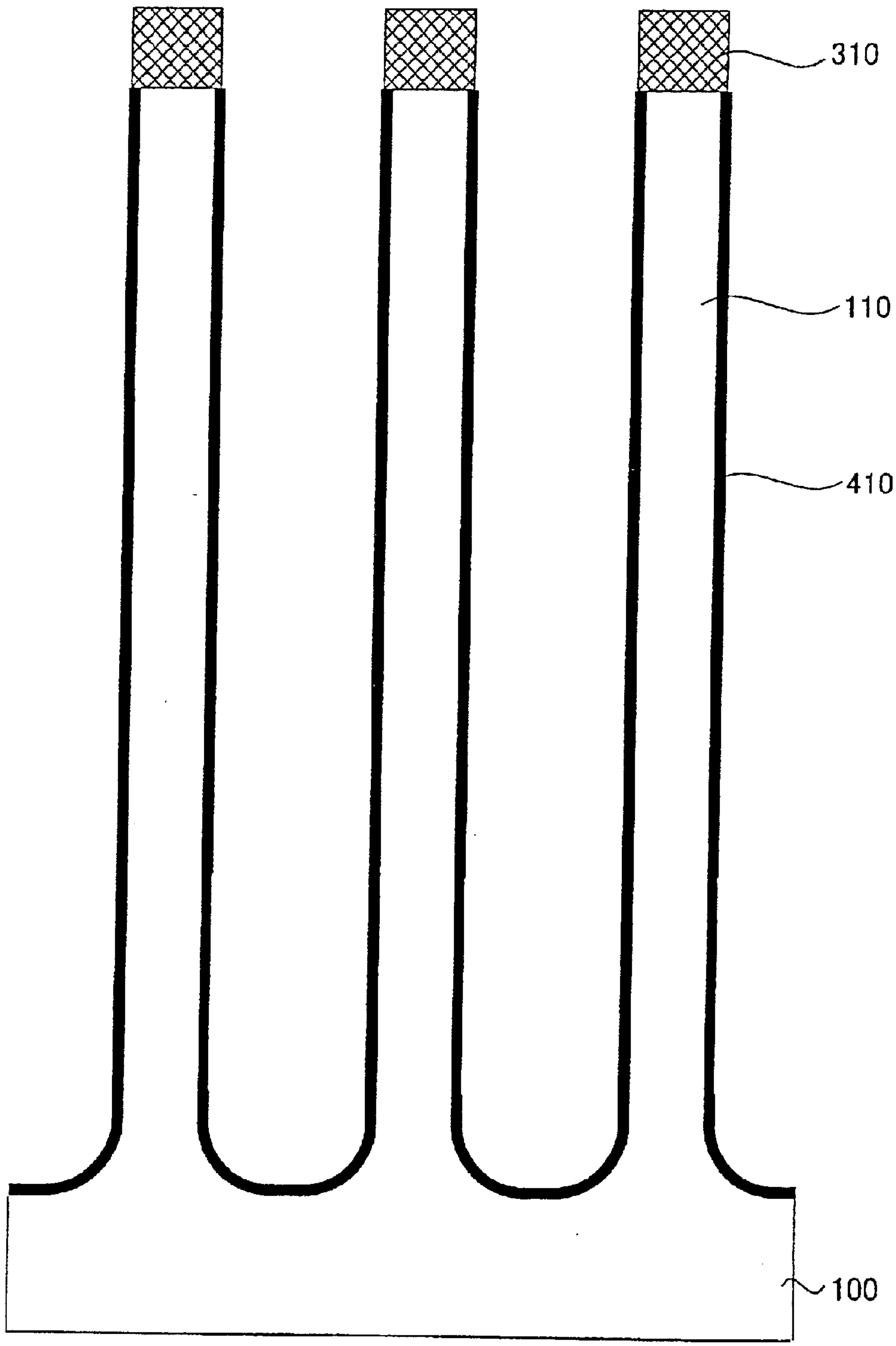

Fig. 1628
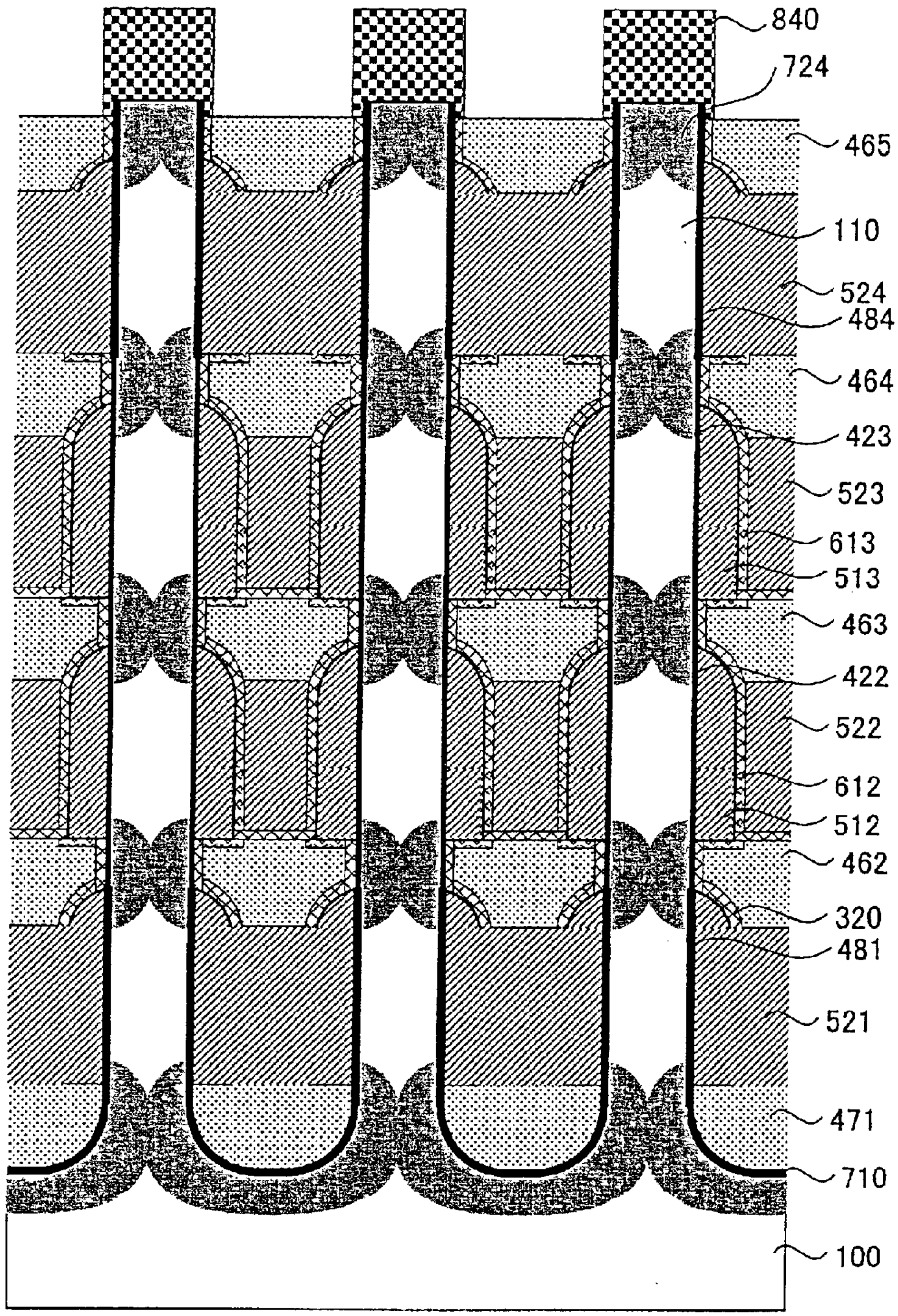

Fig. 1629
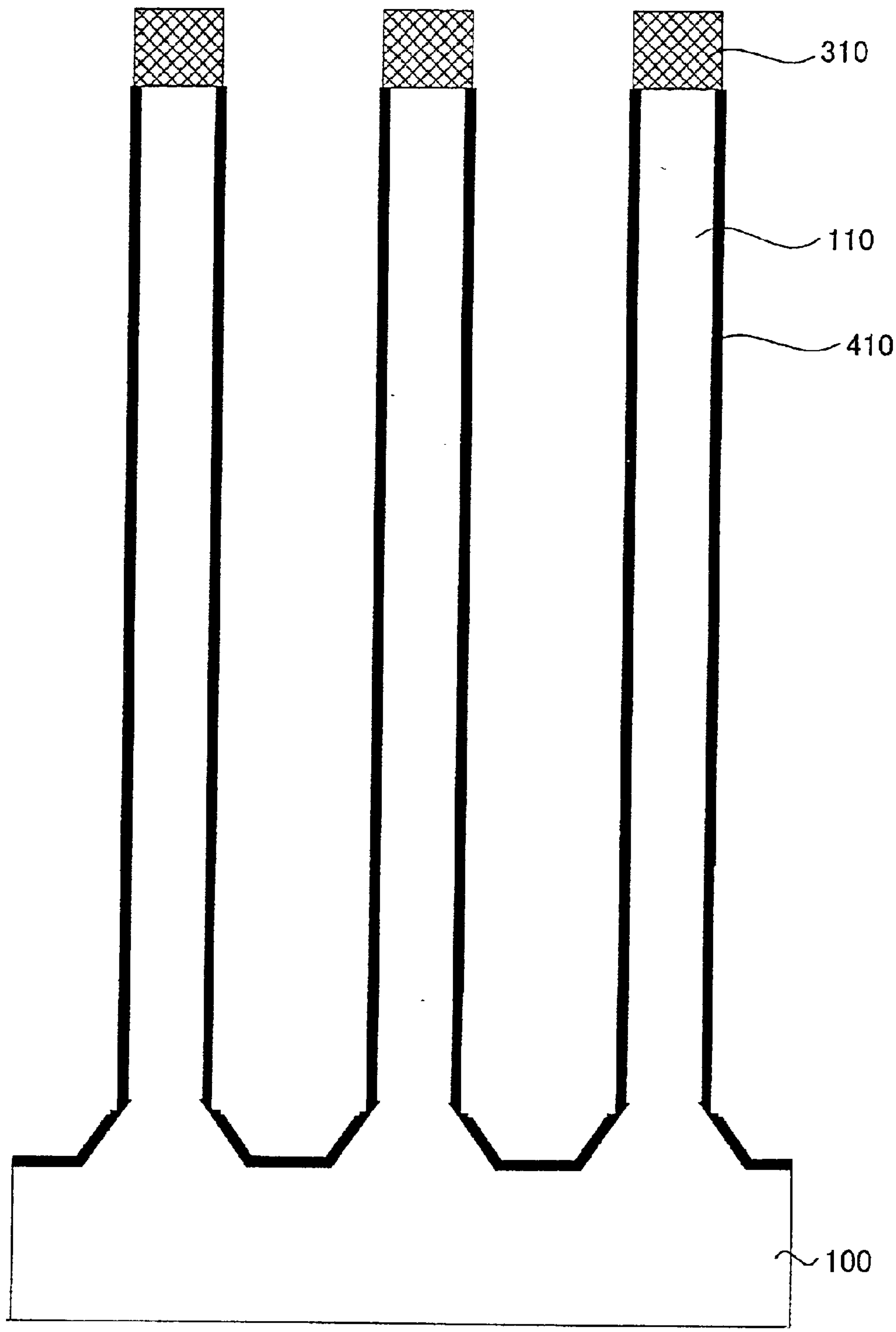

Fig. 1630
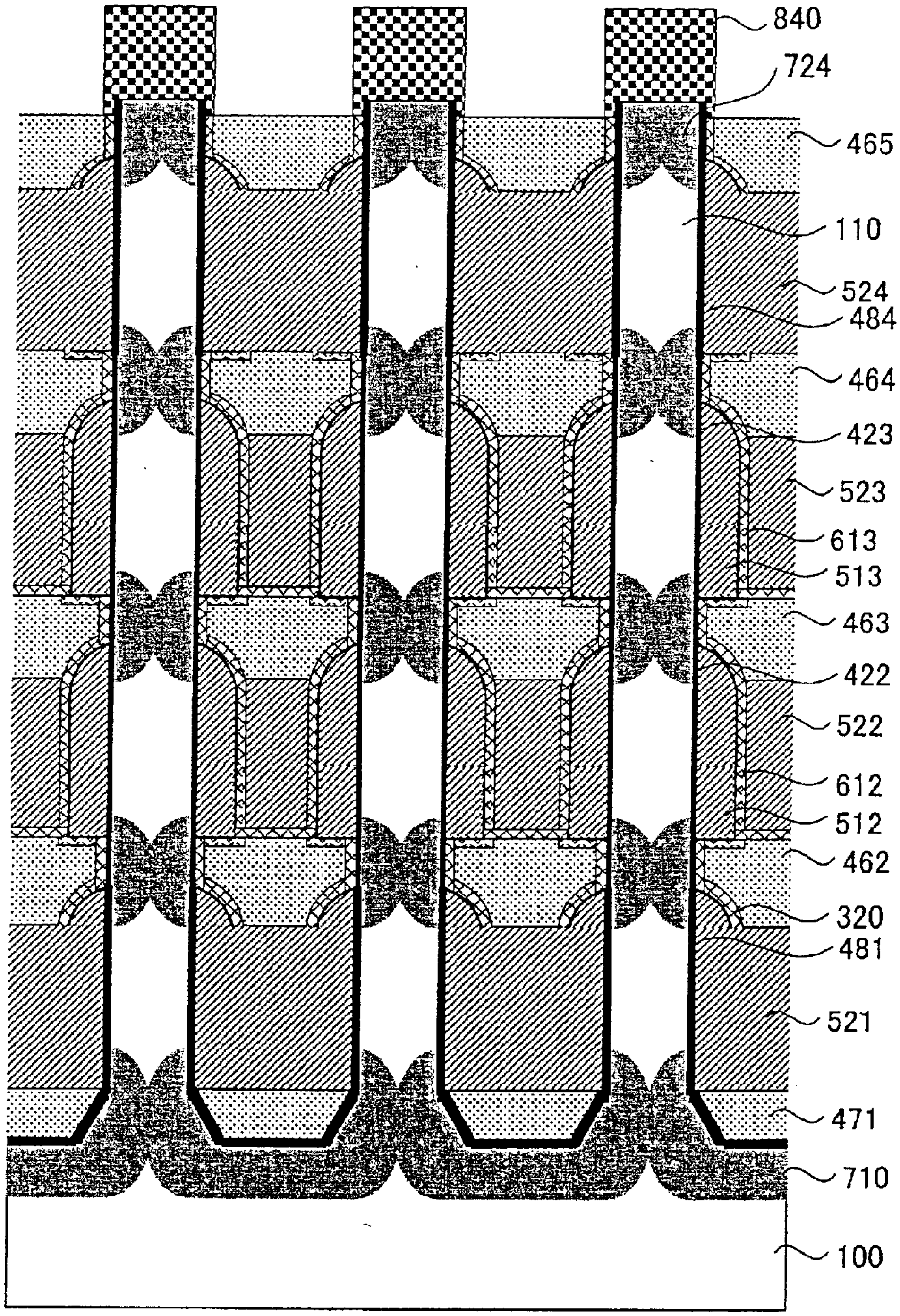

Fig. 1631
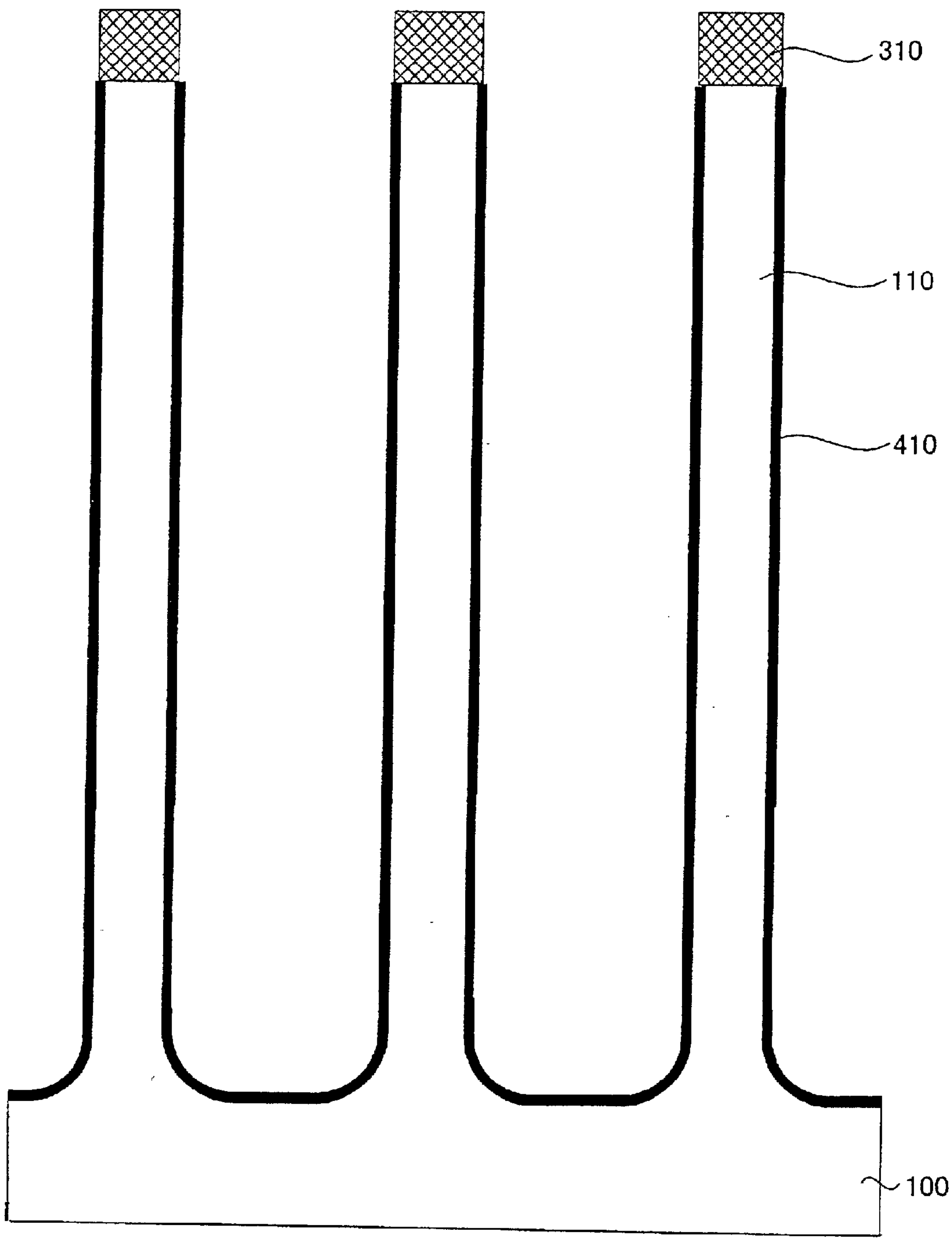

Fig. 1632
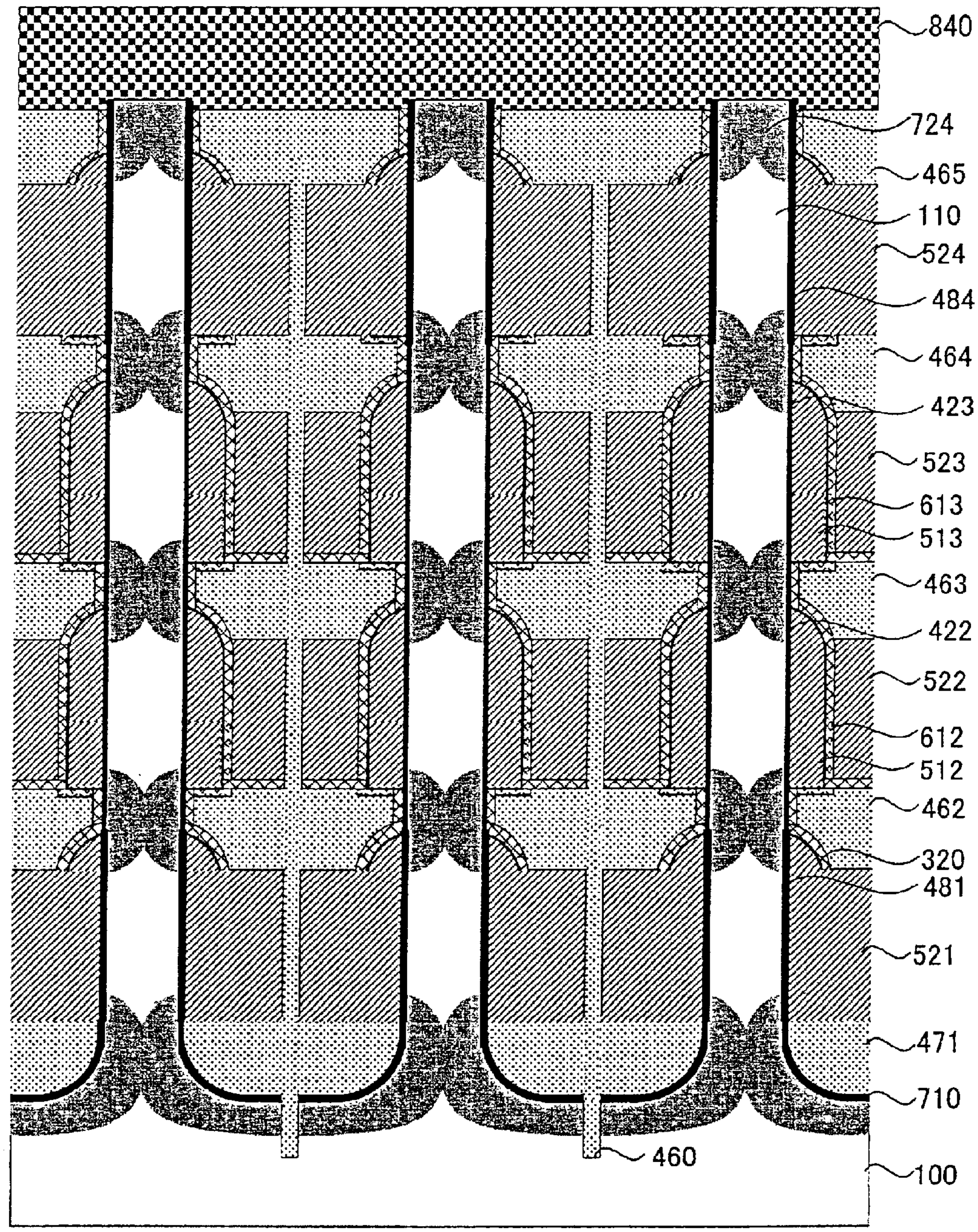

Fig. 1633
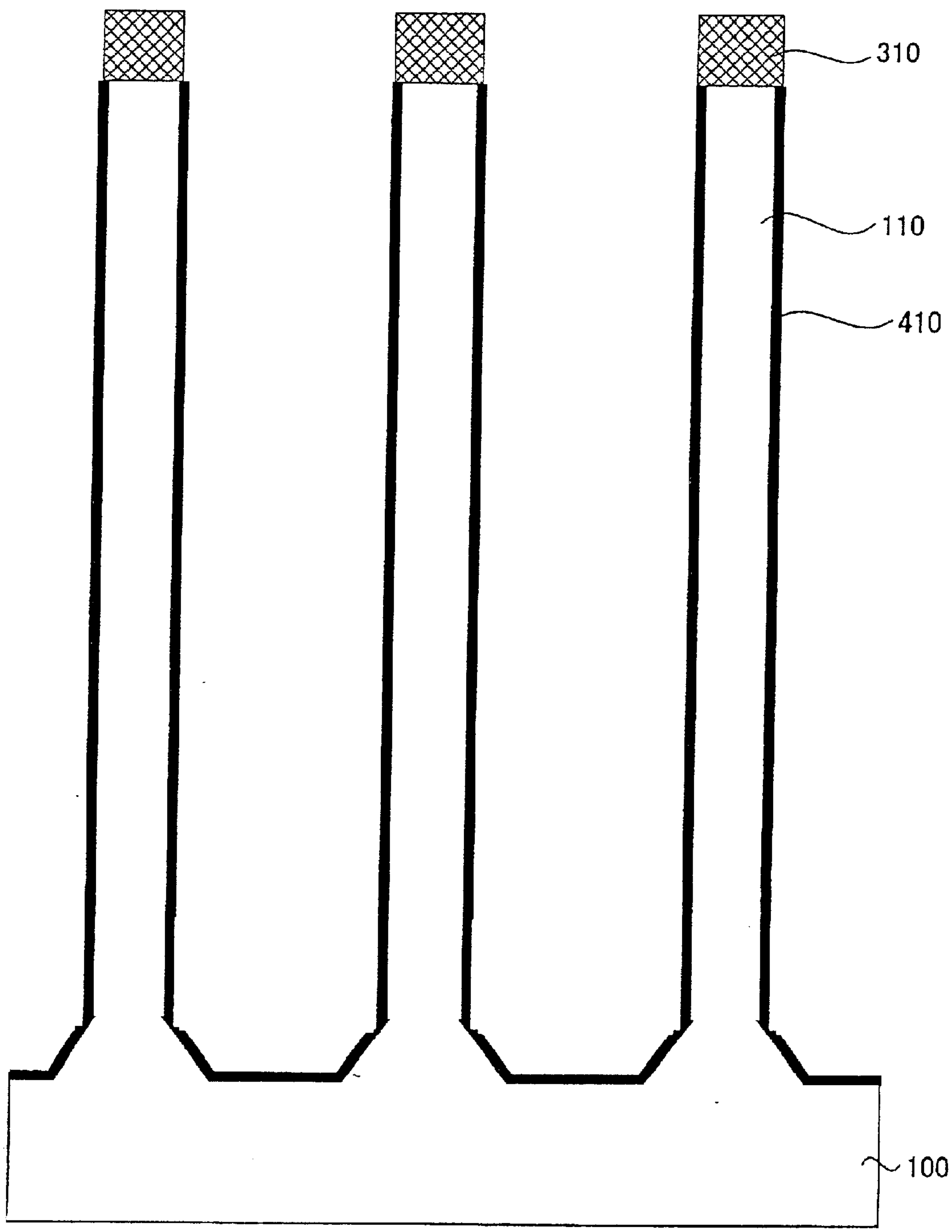

Fig. 1634
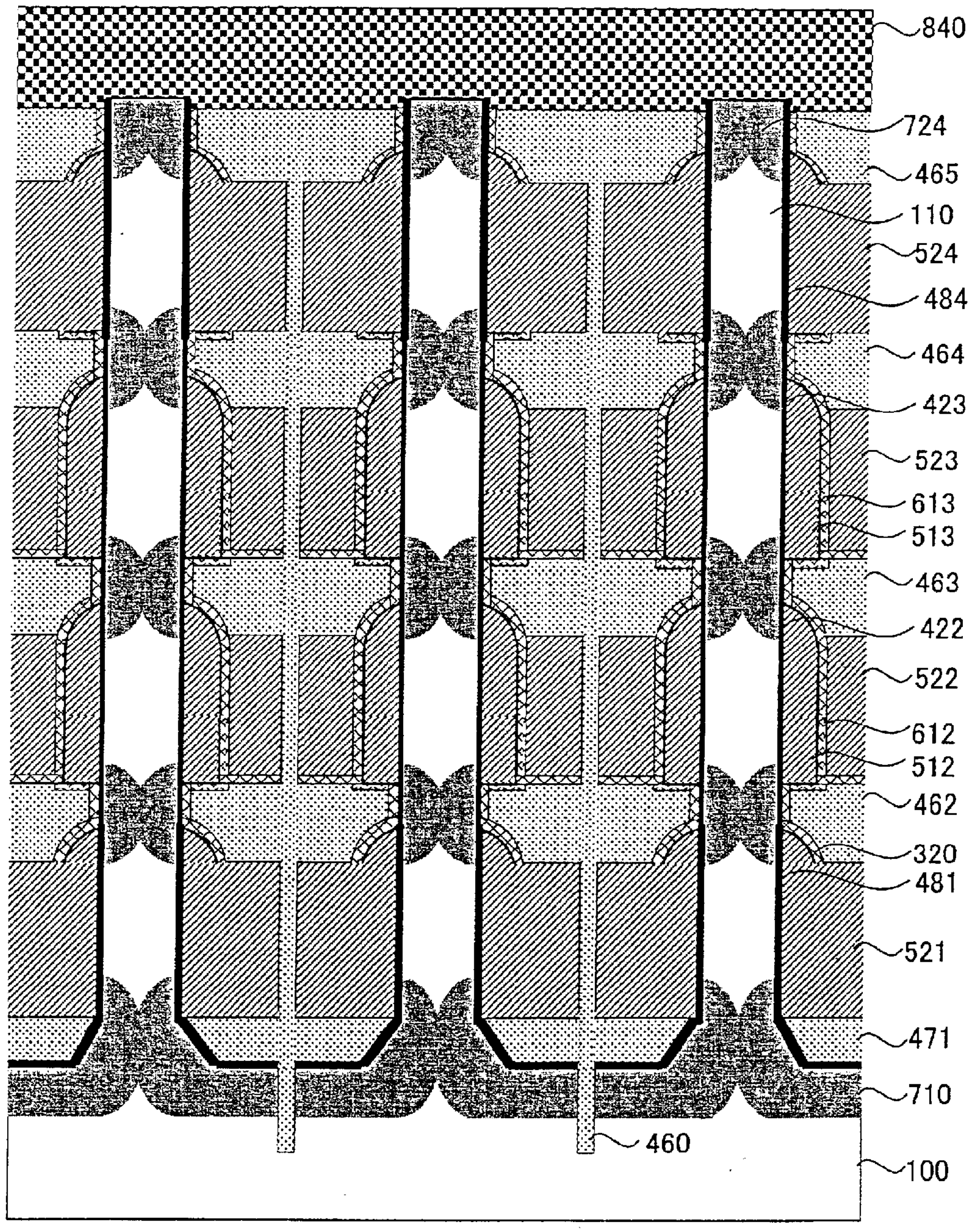

Fig. 1635
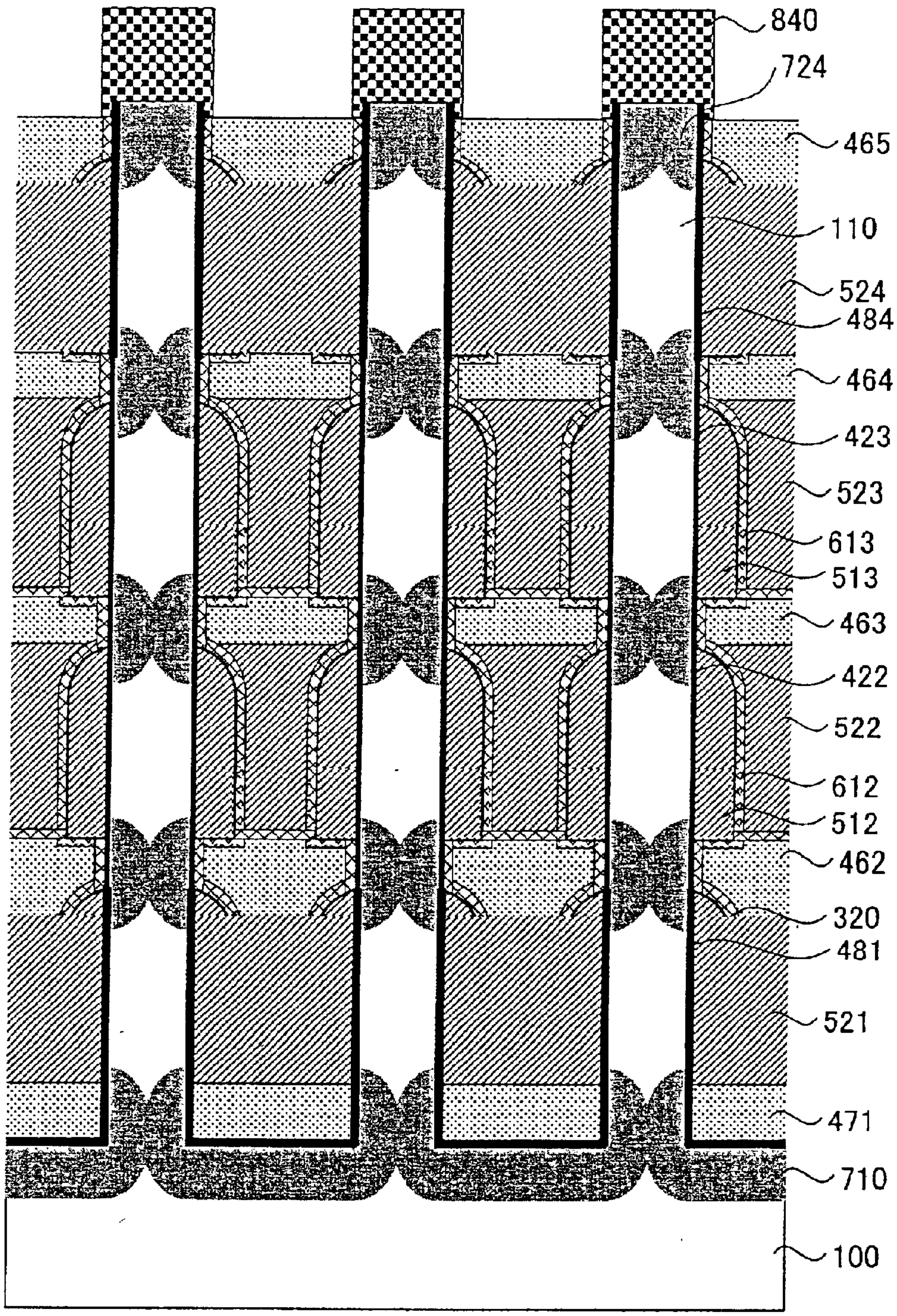

Fig. 1636
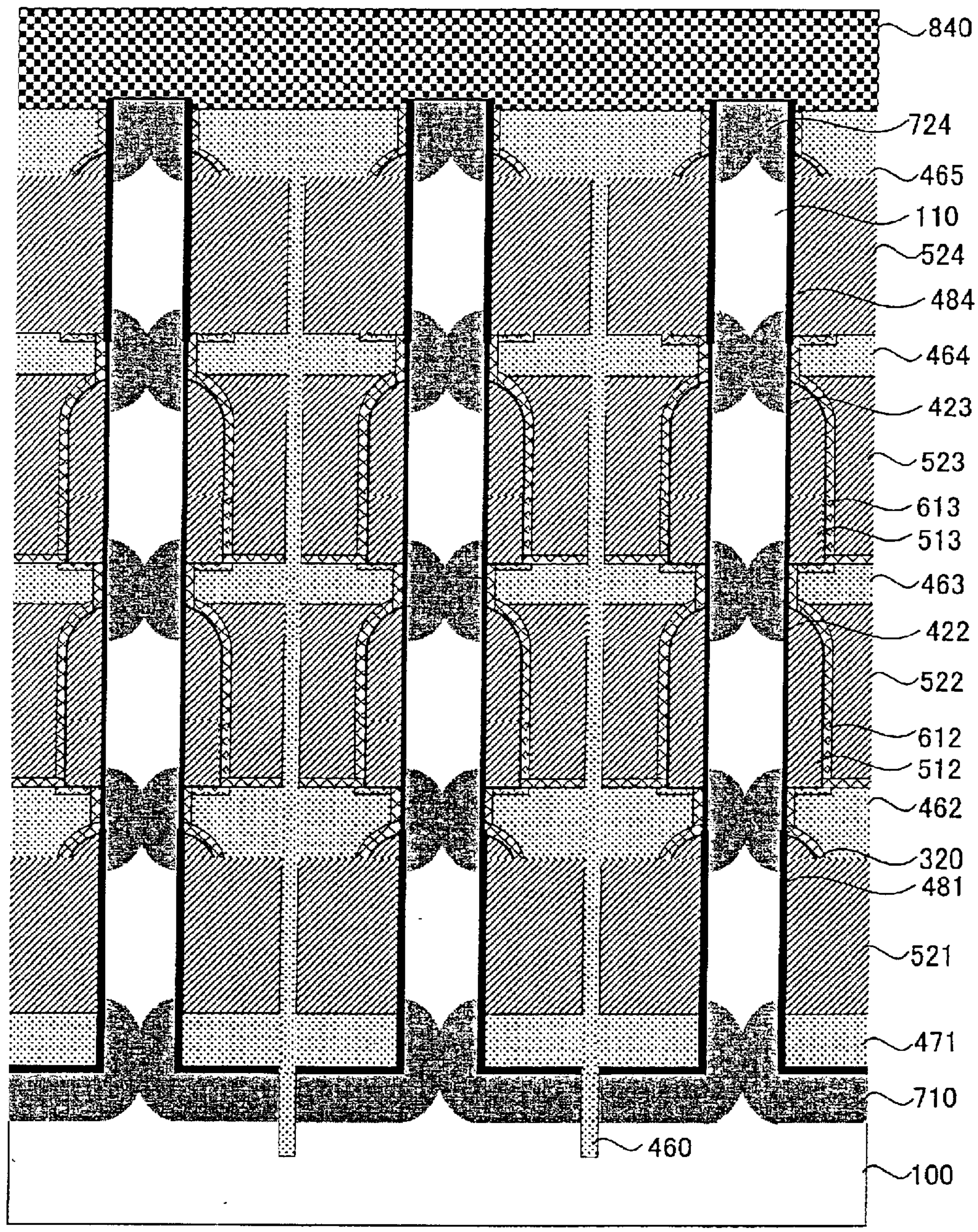

Fig. 1637
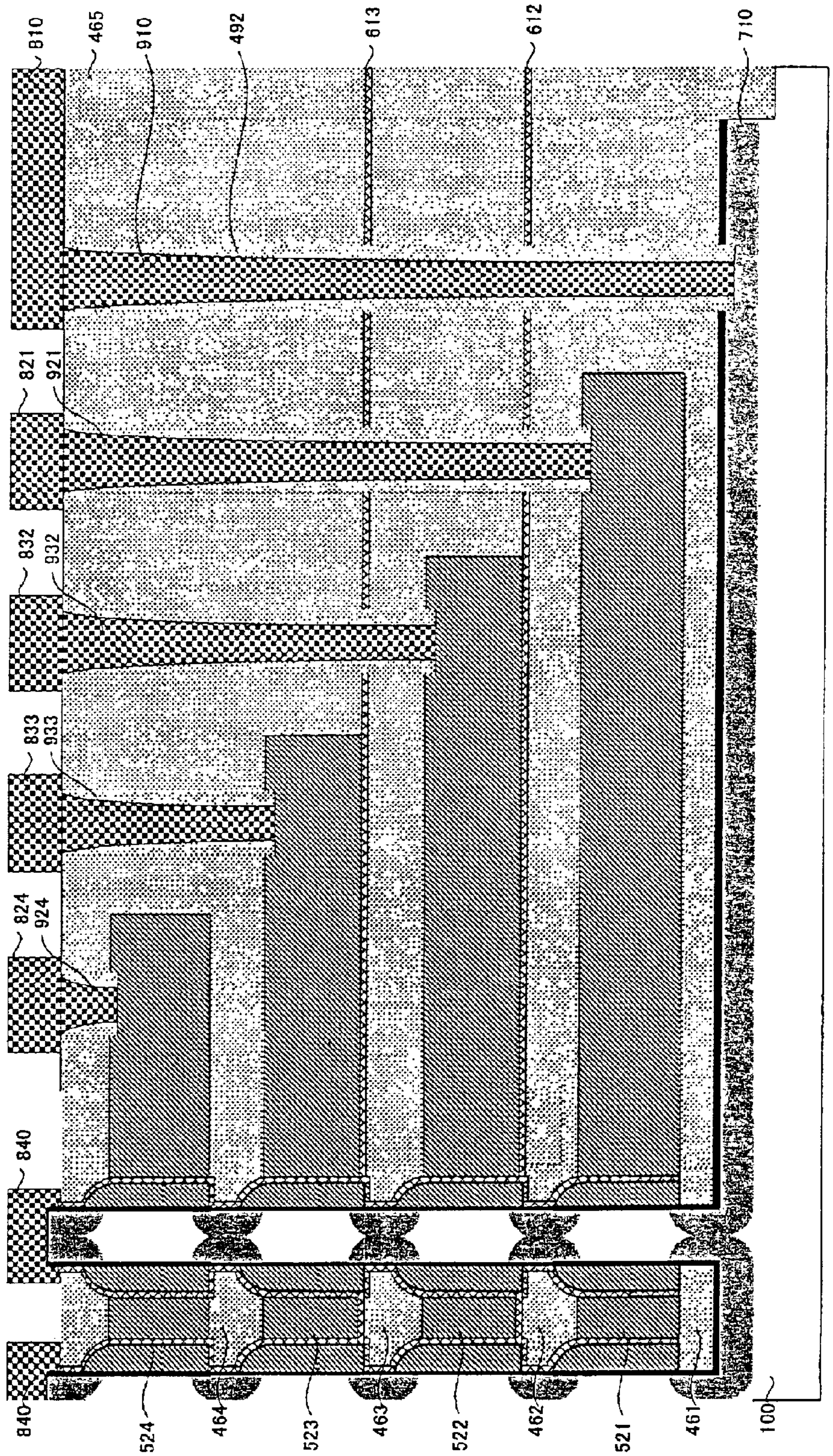

Fig. 1638
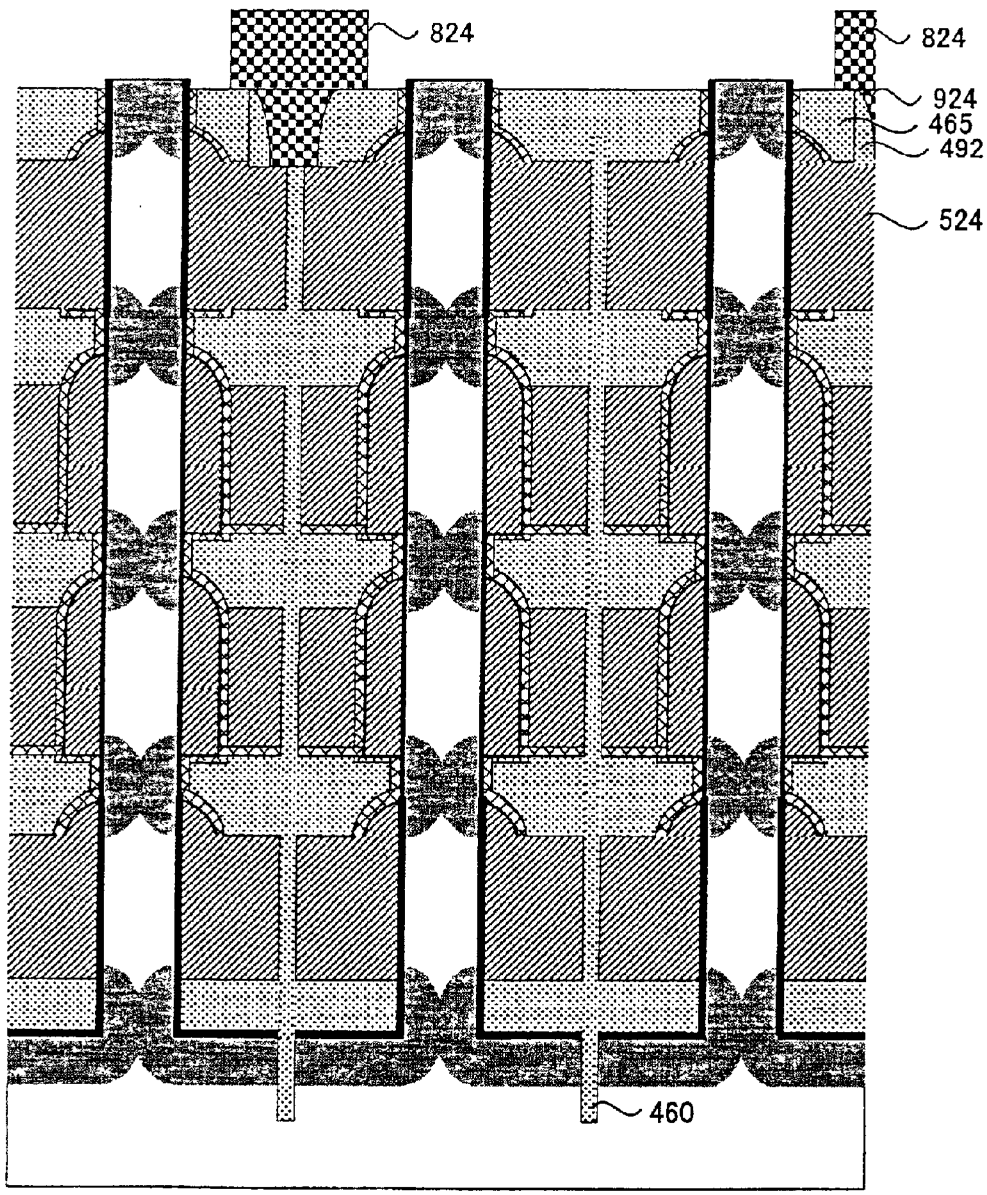

Fig. 1639
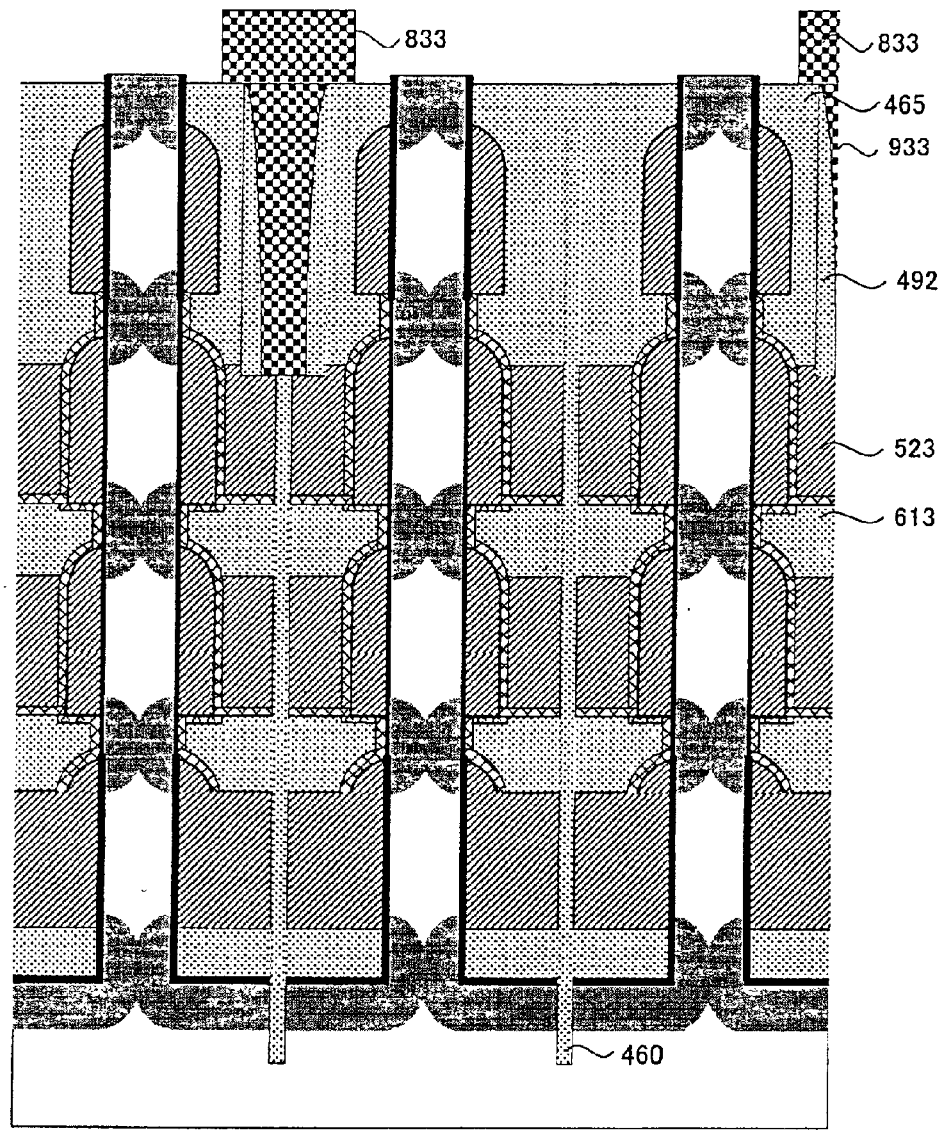

Fig. 1640
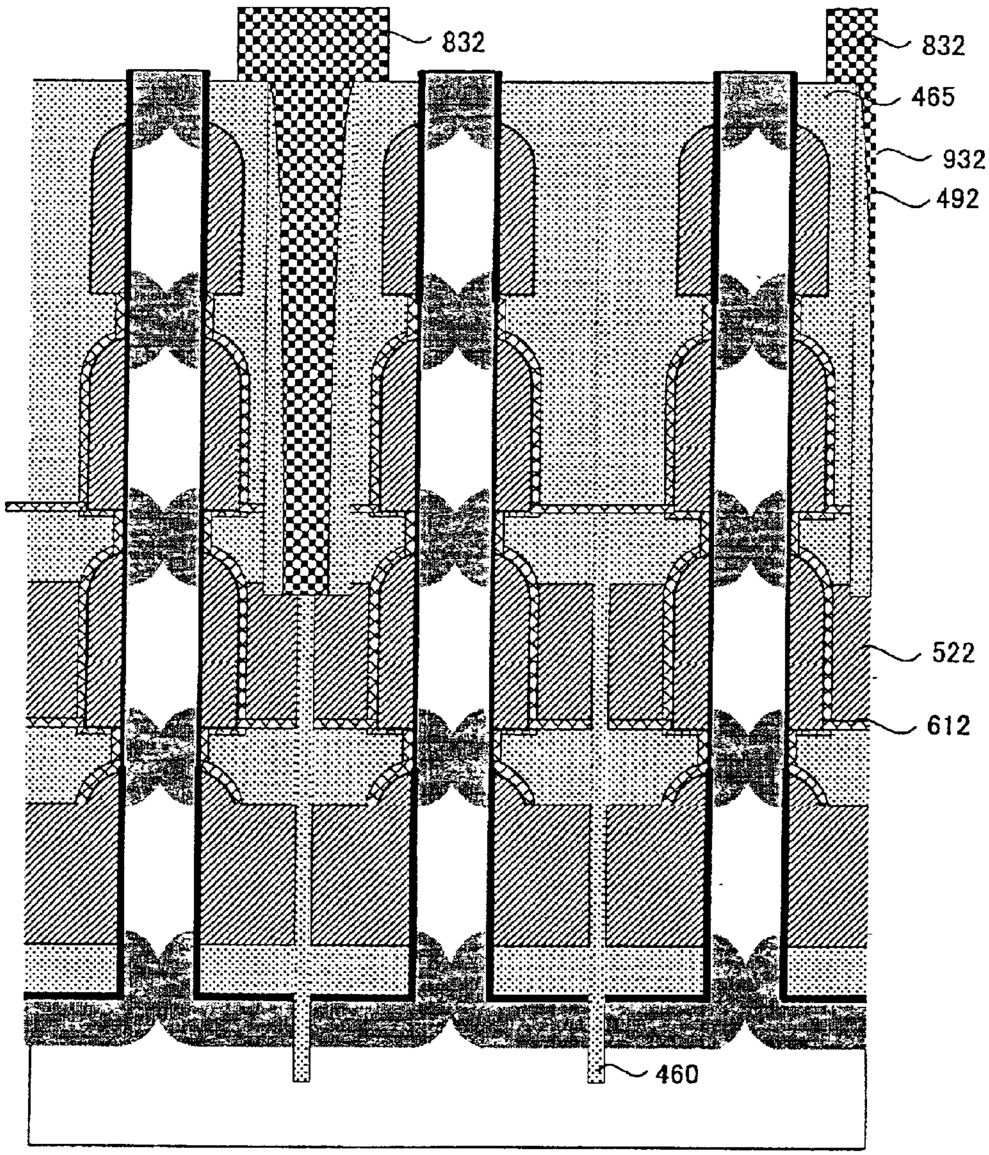

Fig. 1641
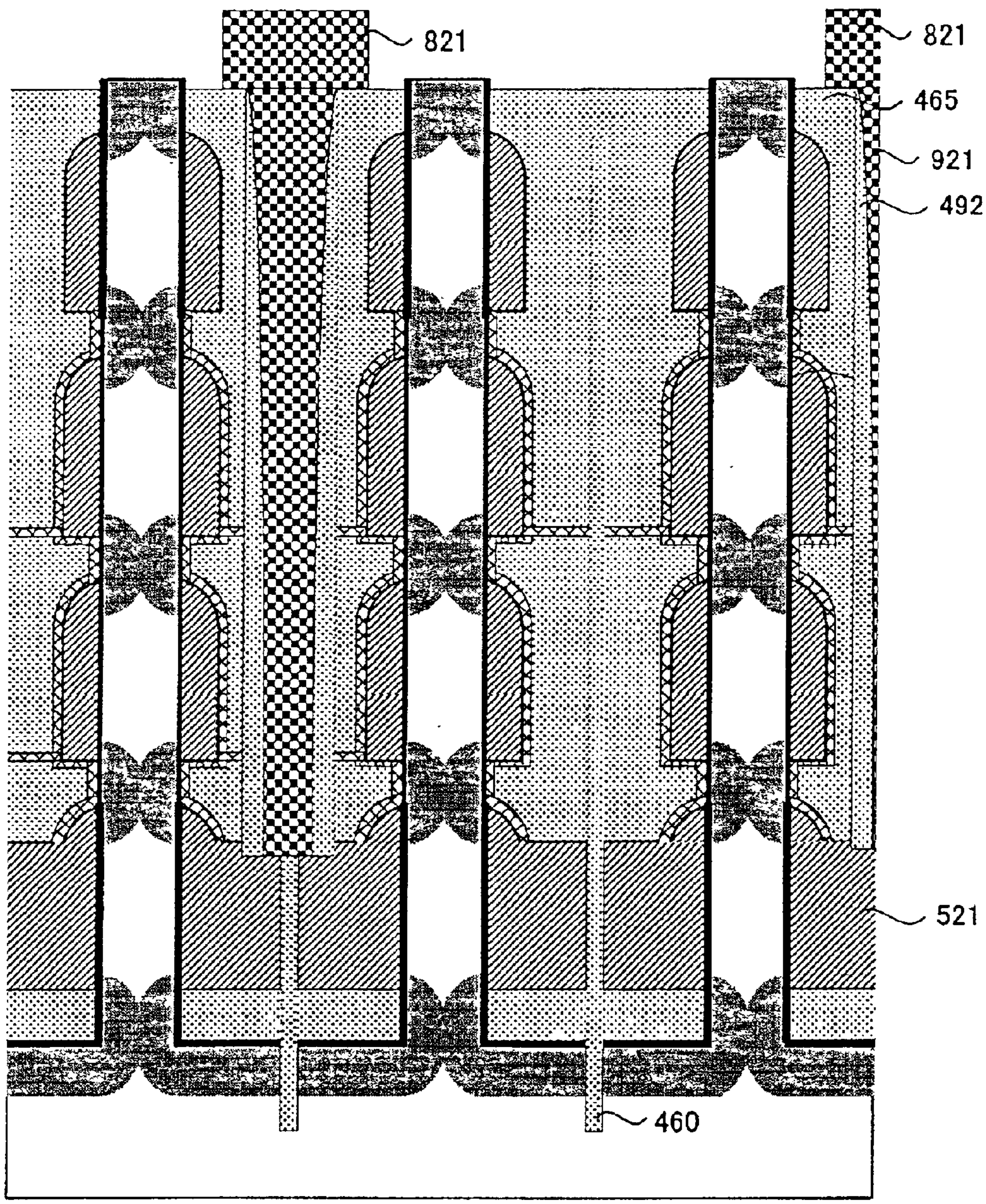

Fig. 1642
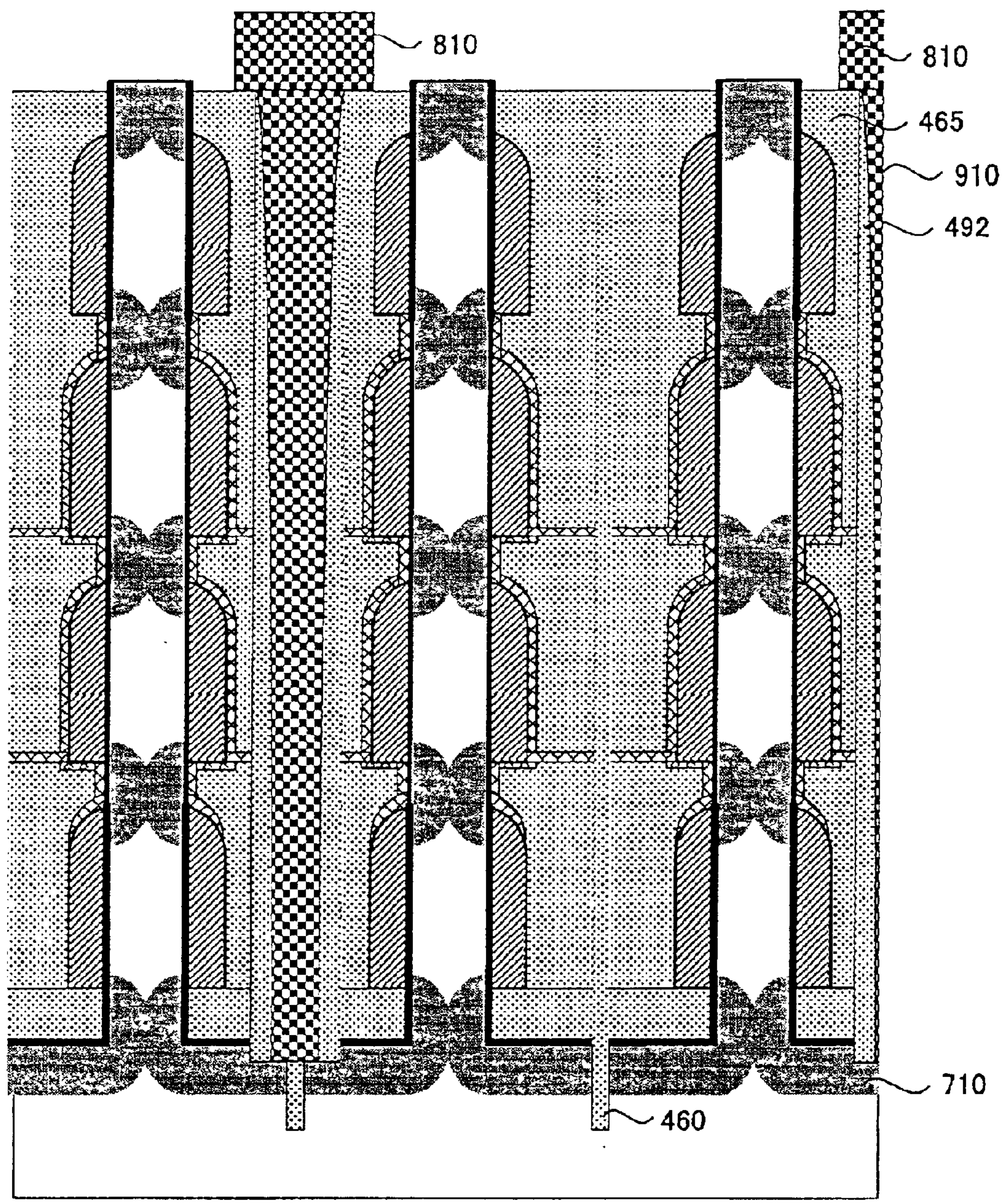

Fig. 1643
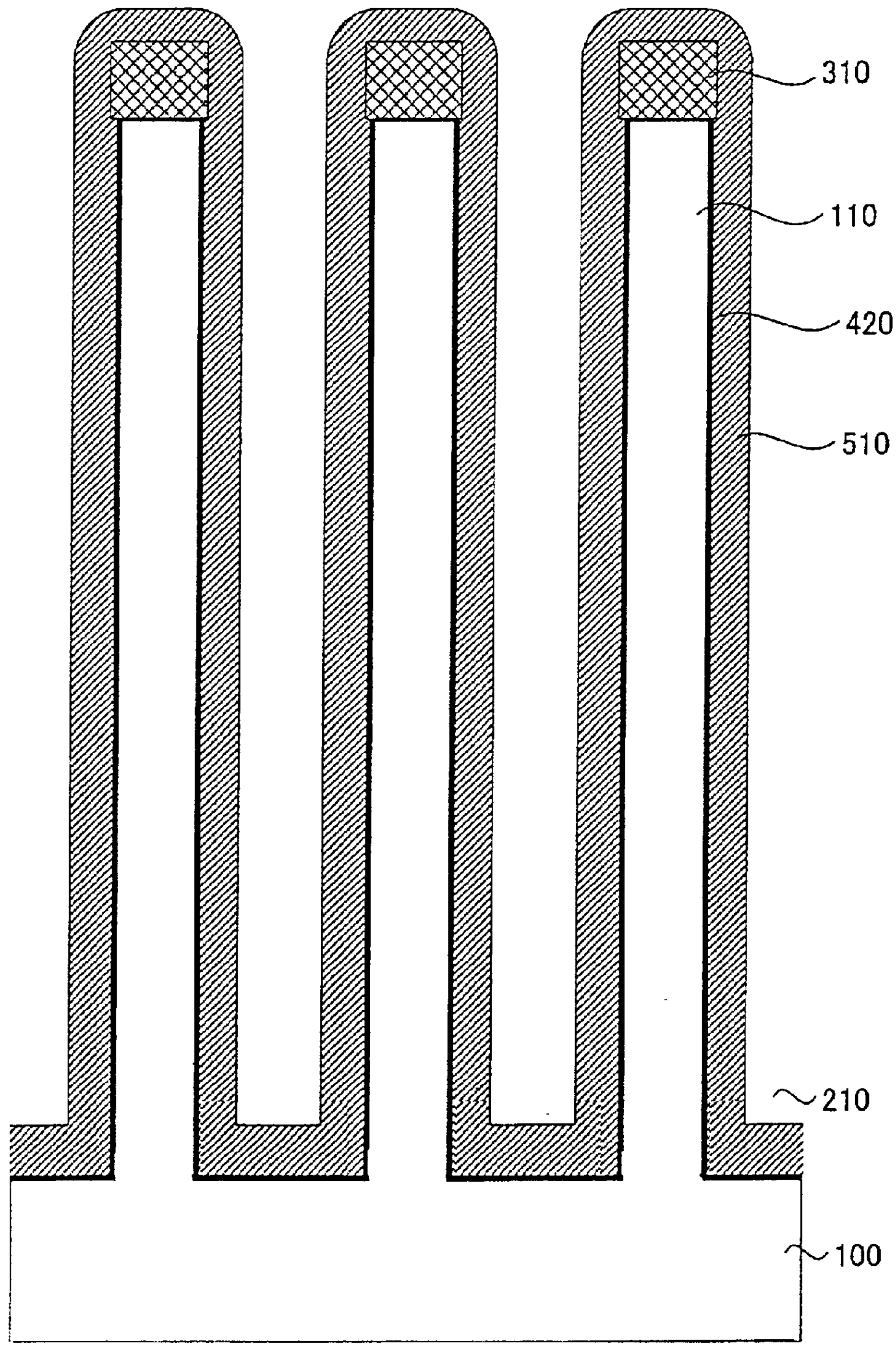

Fig. 1644
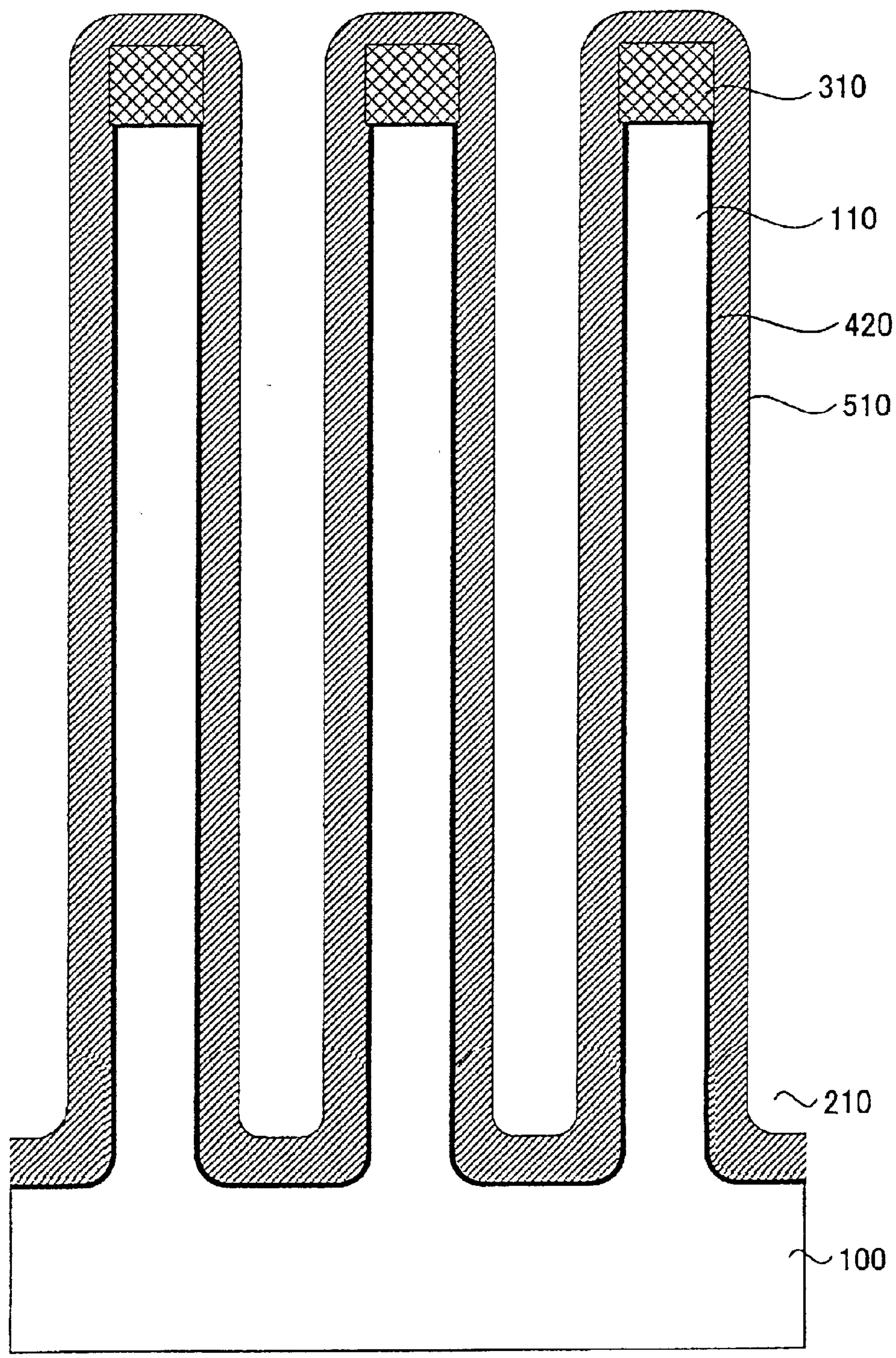

Fig. 1645
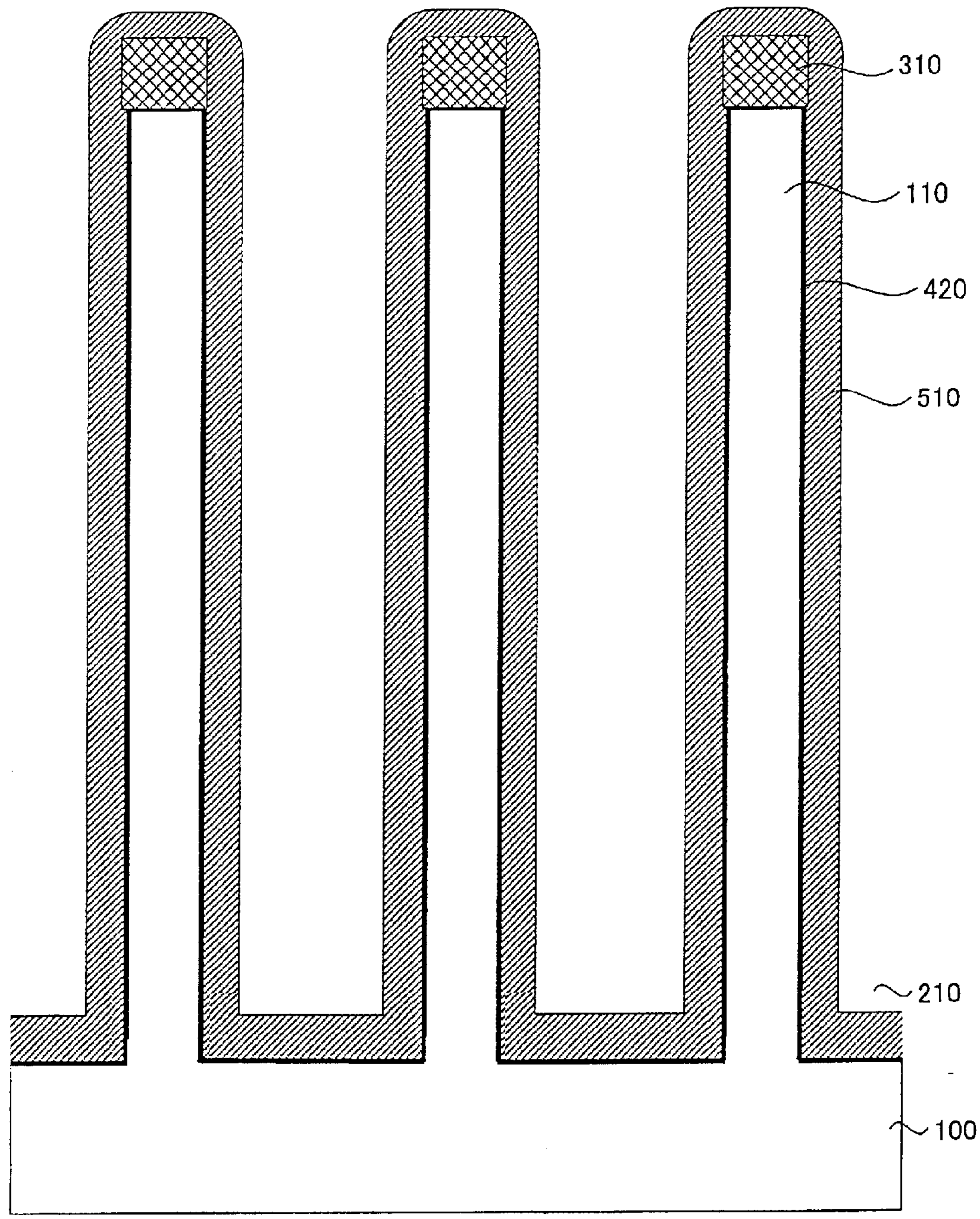

Fig. 1646
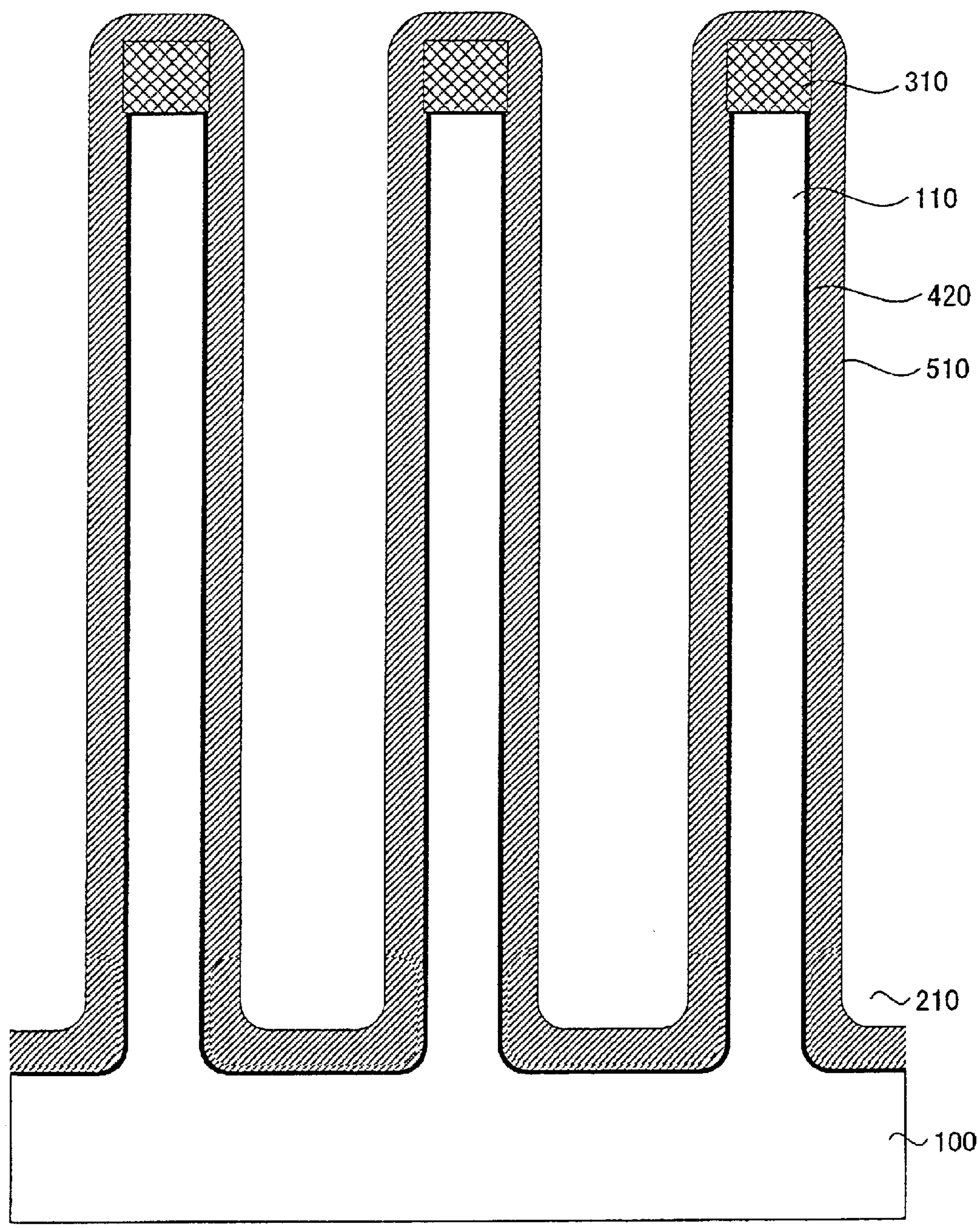

Fig. 1647
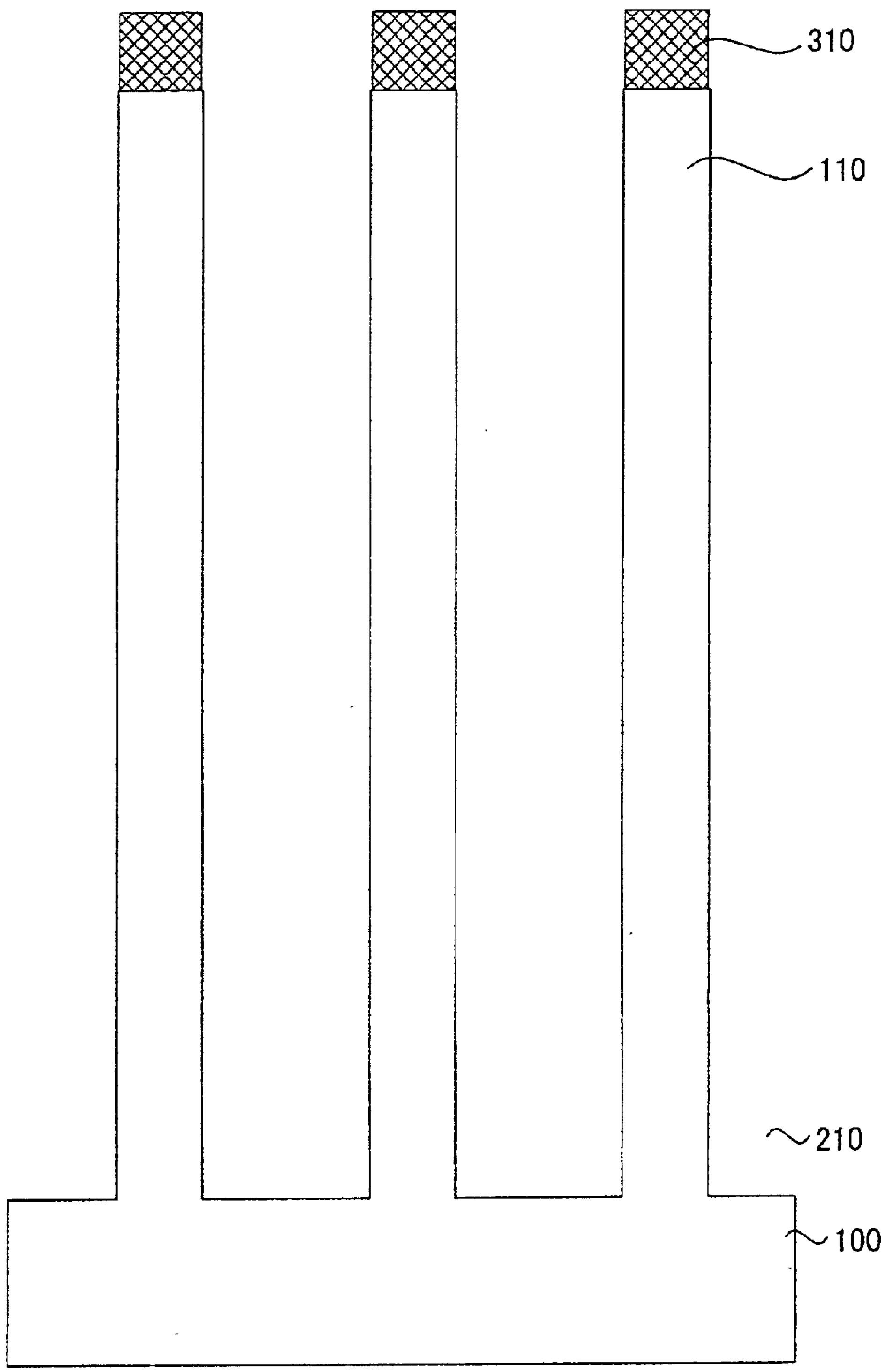

Fig. 1648
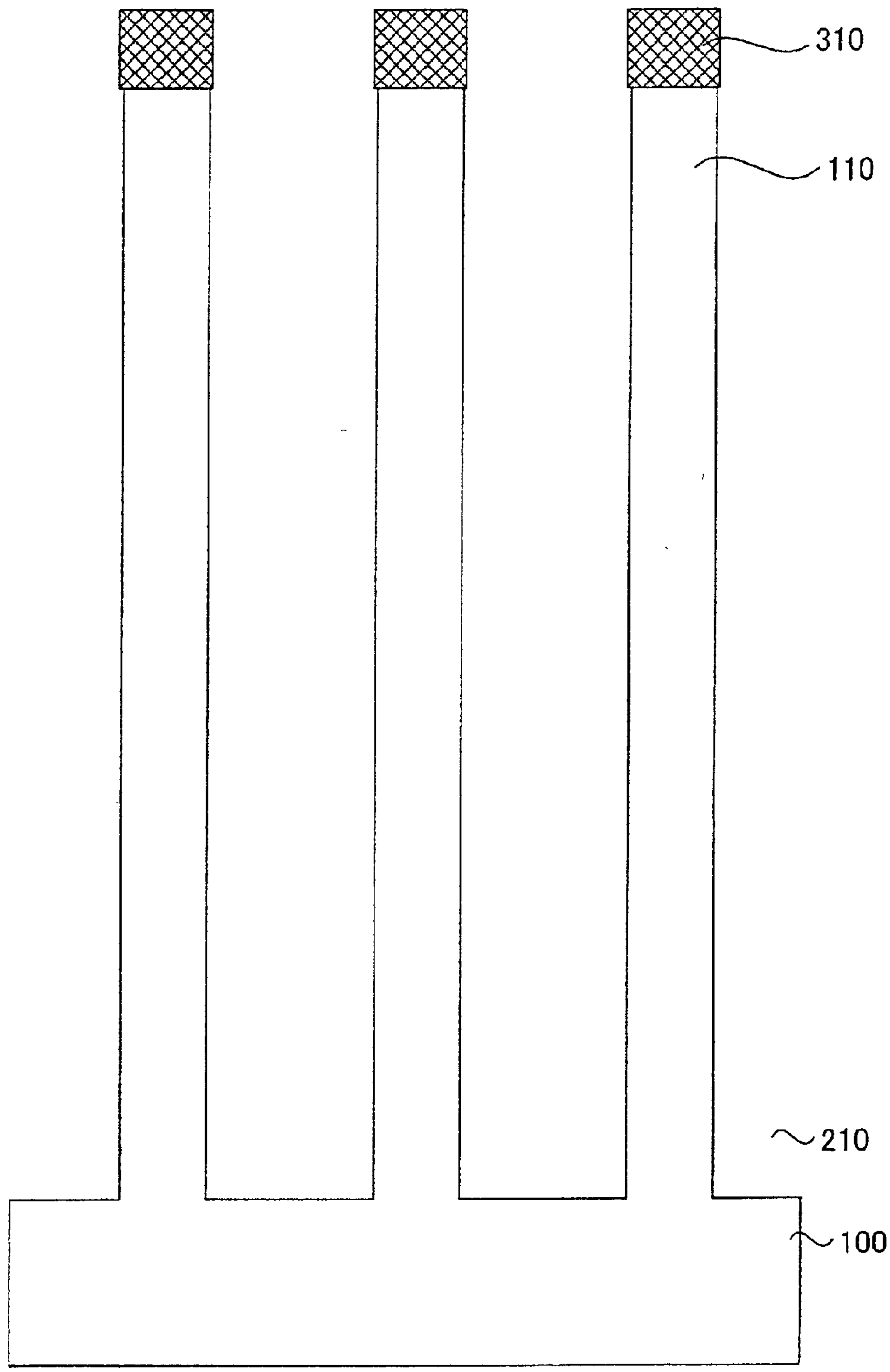

Fig. 1649
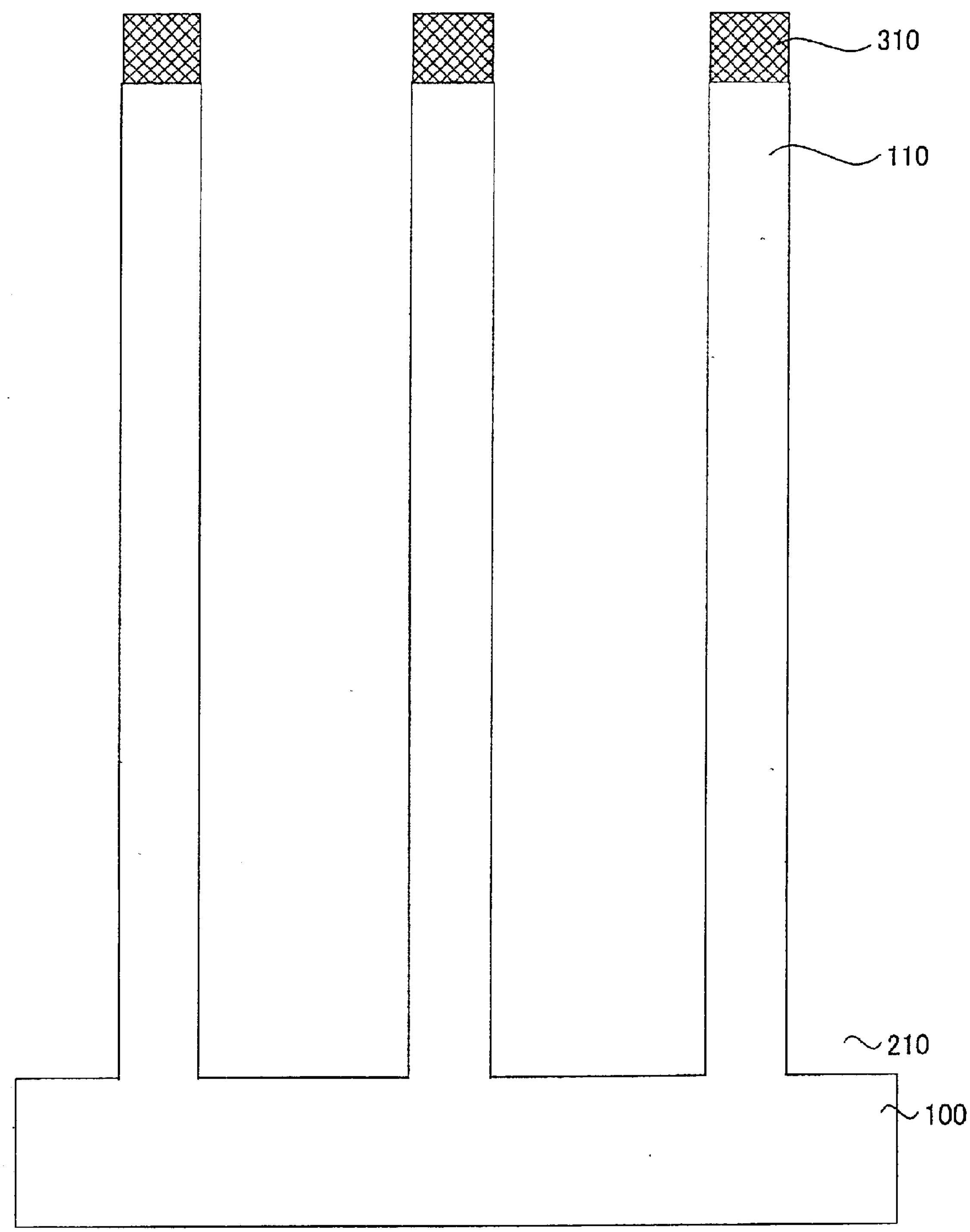

Fig. 1650
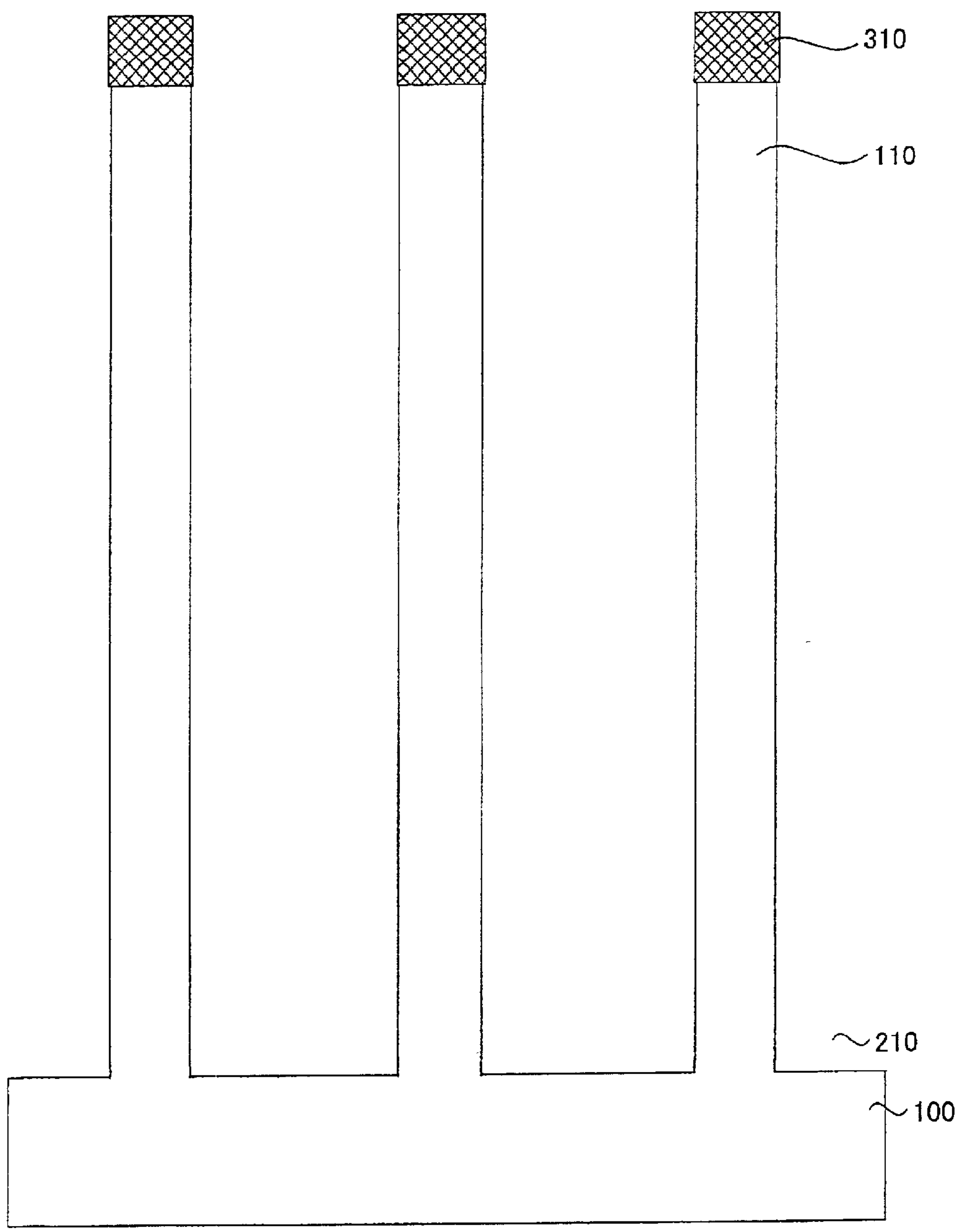

Fig. 1651
Prior Art
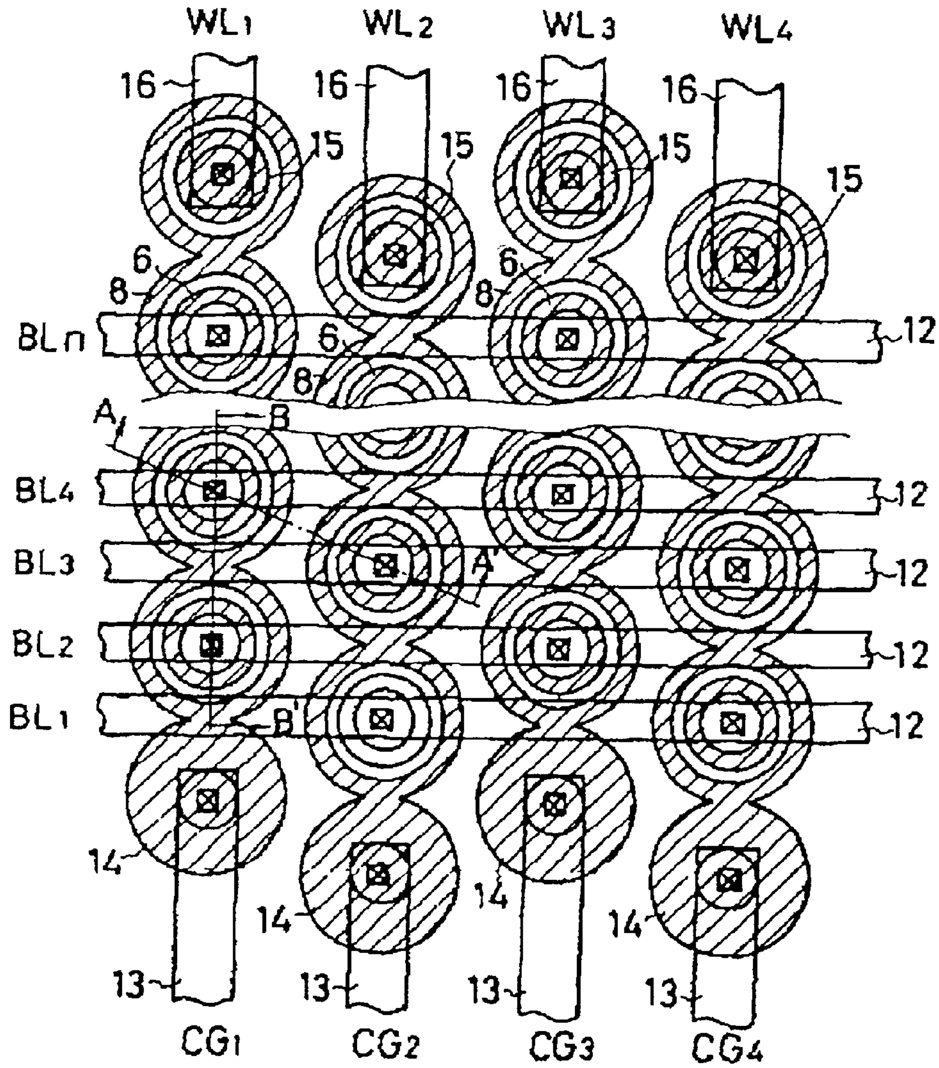

Fig. 1652 (a)
Prior Art
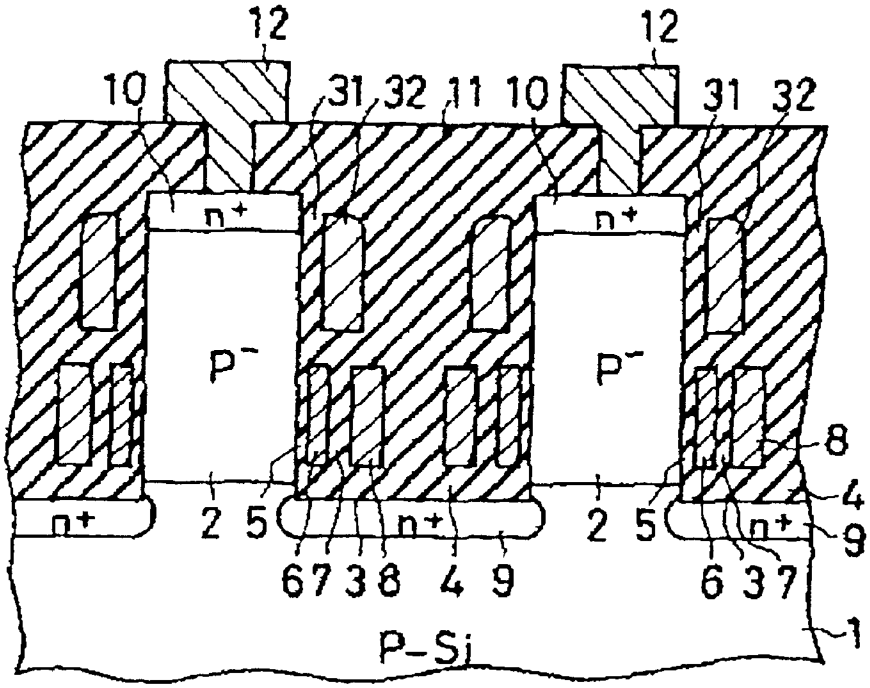
Fig. 1652 (b)
Prior Art
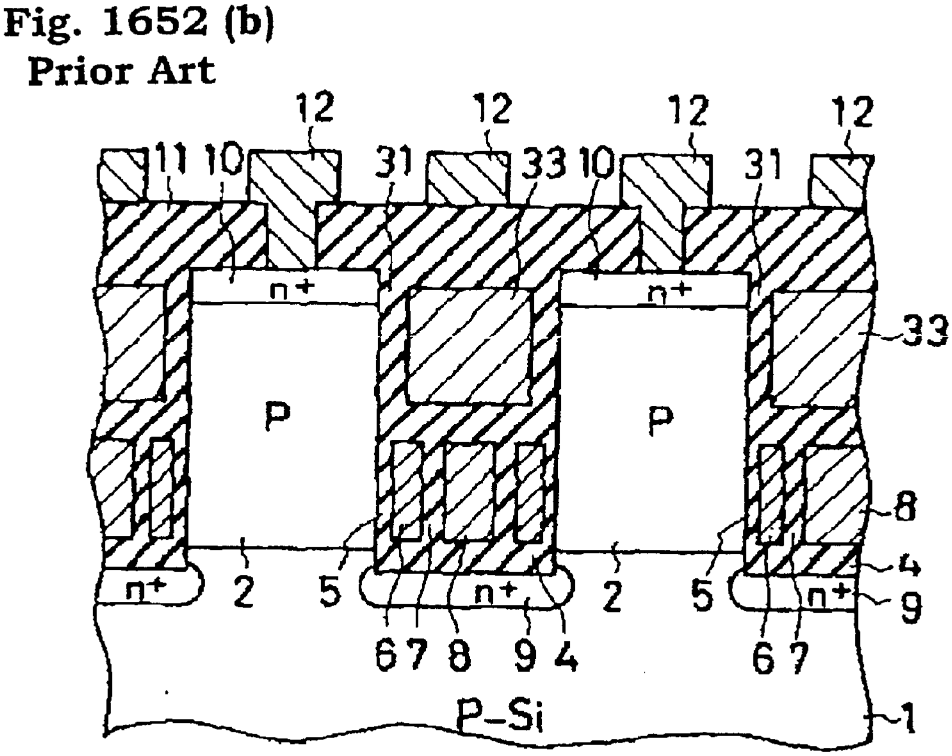

Fig. 1653 (a)
Prior Art
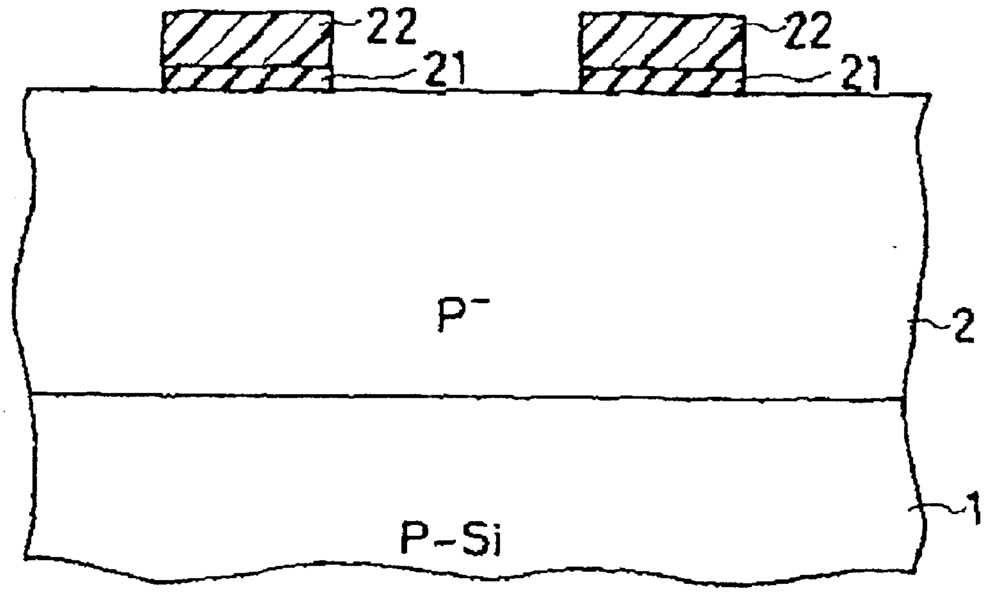
Fig. 1653(b)
Prior Art
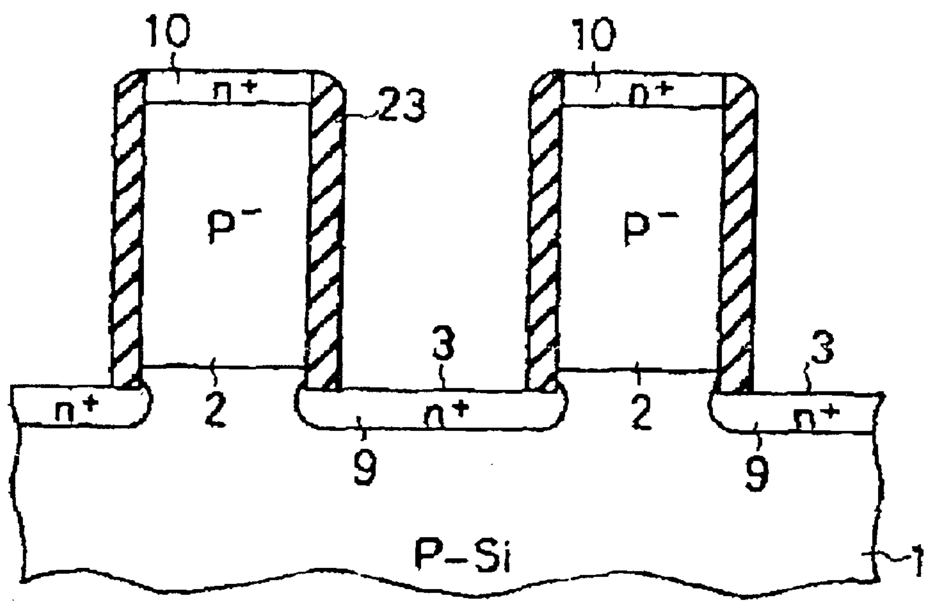

Fig. 1654 (c)
Prior Art
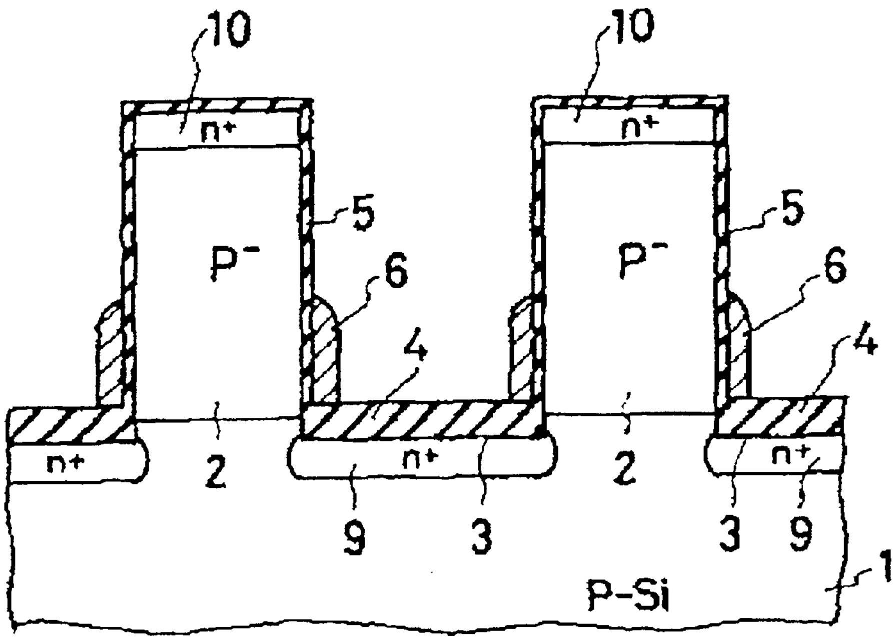
Fig. 1654 (d)
Prior Art
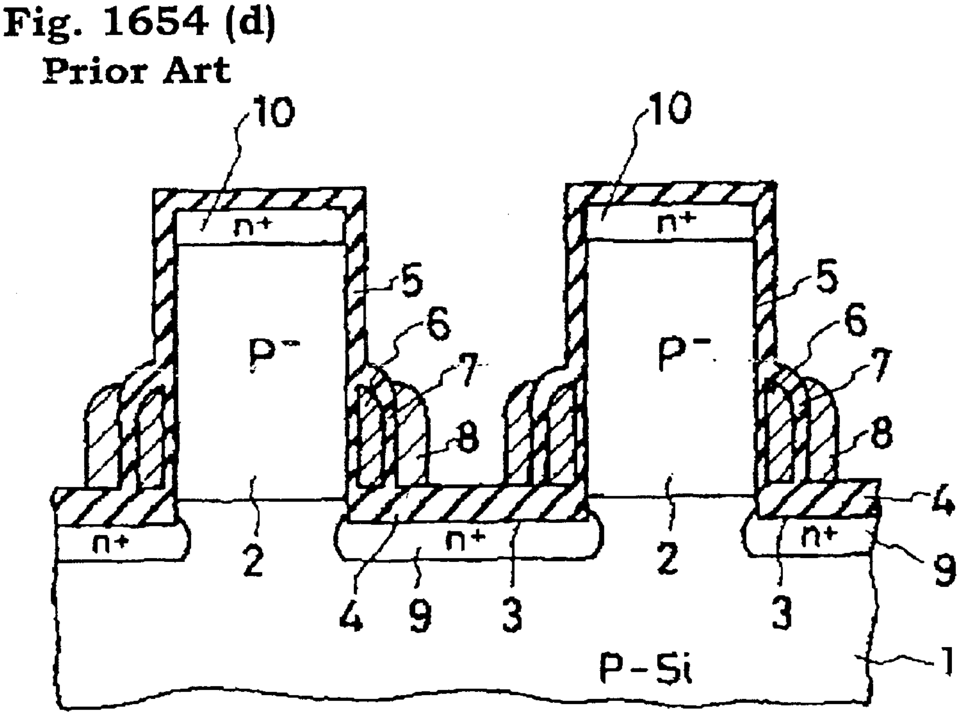

Fig. 1655 (e)
Prior Art
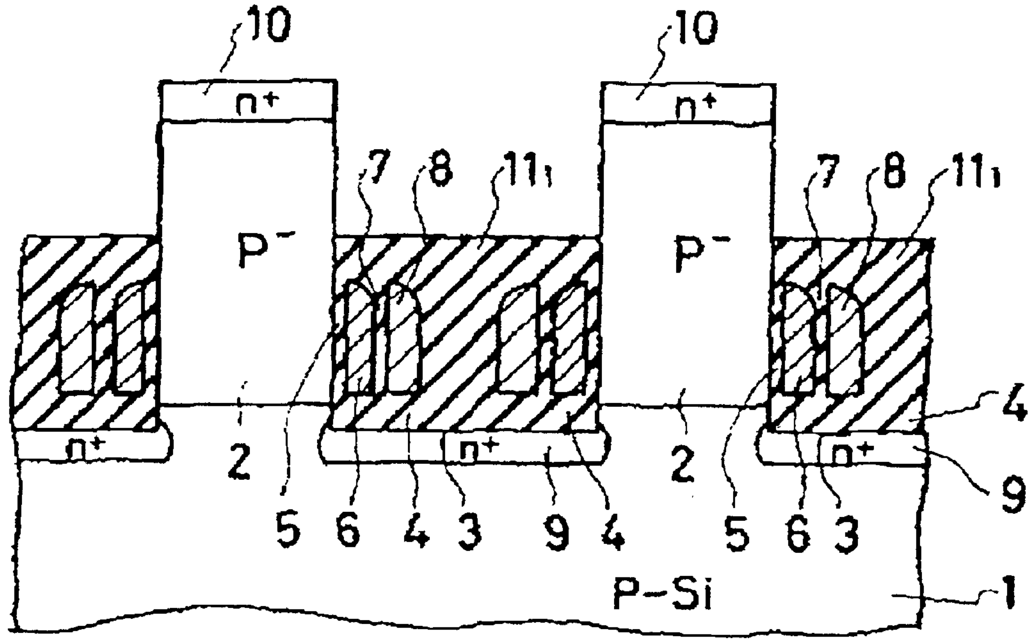
Fig. 1655 (f)
Prior Art
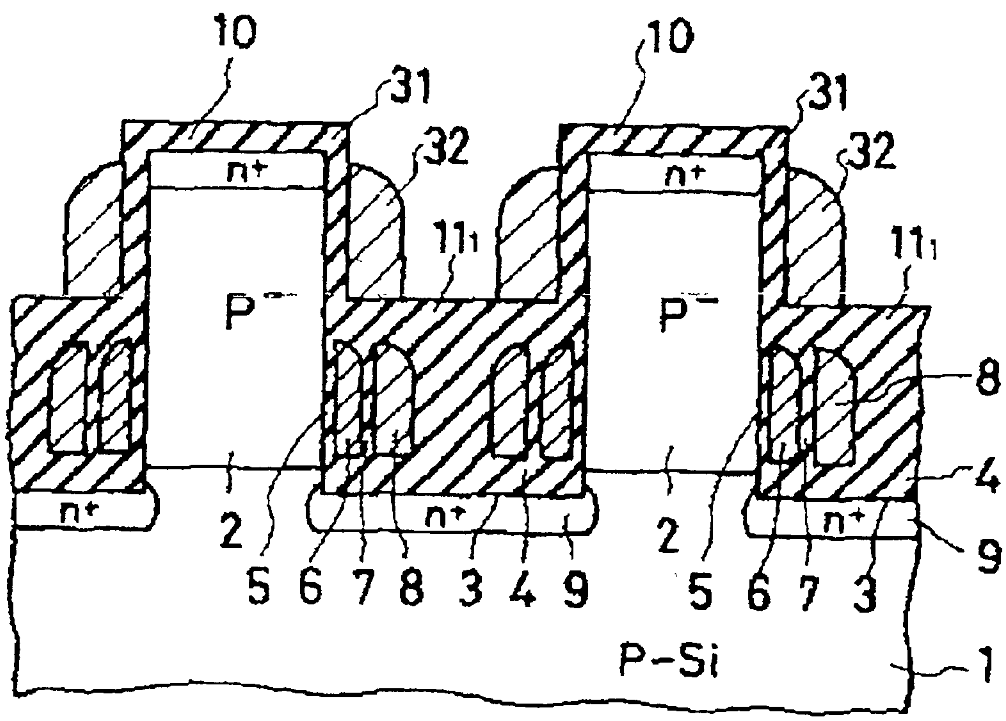

Fig. 1656 (g)
Prior Art
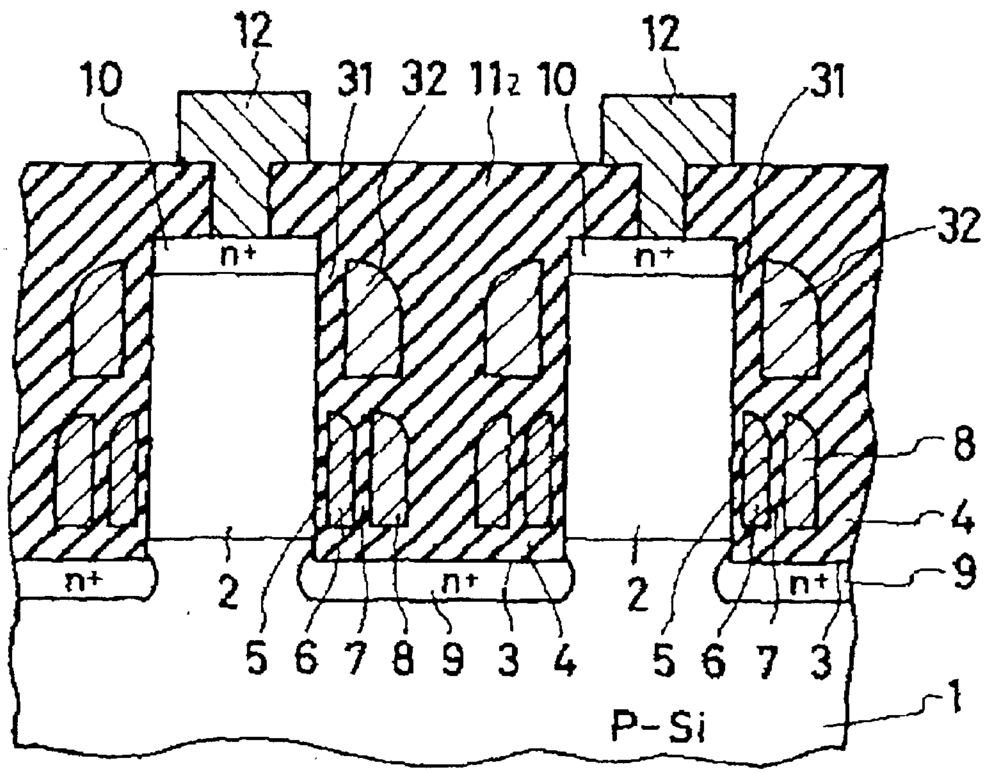

Fig. 1657 (a)
Prior Art
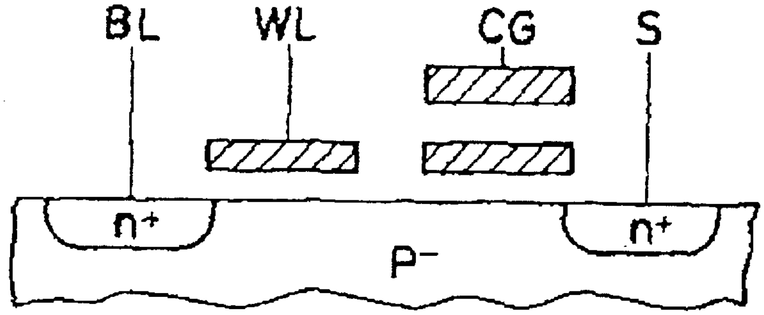
Fig. 1657 (b)
Prior Art
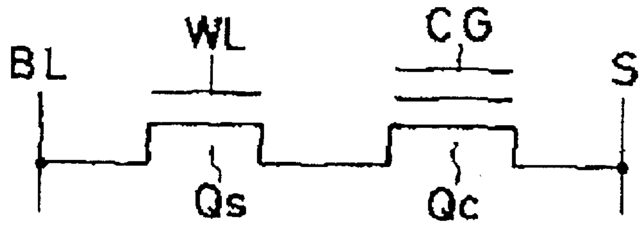
Fig. 1658
Prior Art
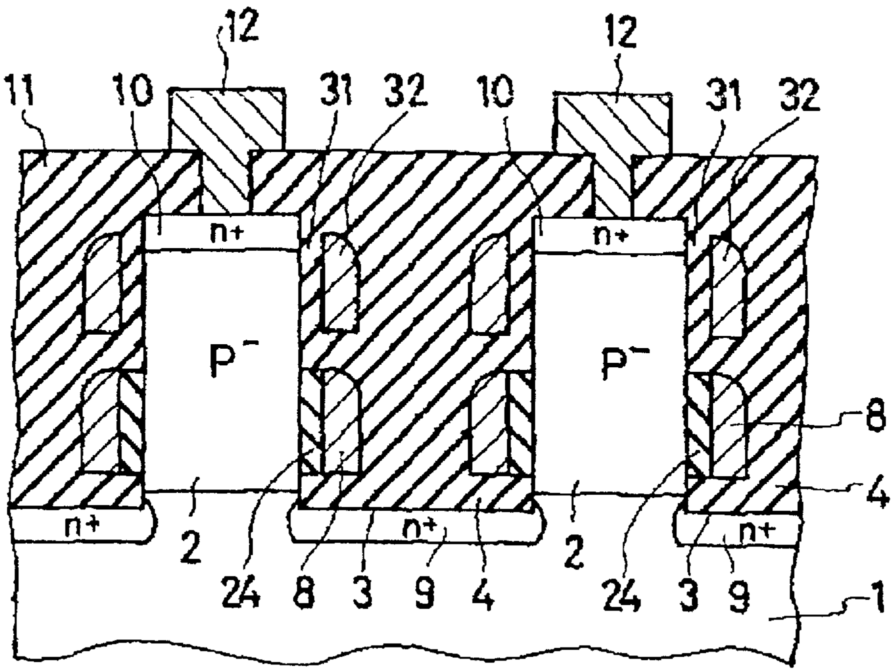

Fig. 1659
Prior Art
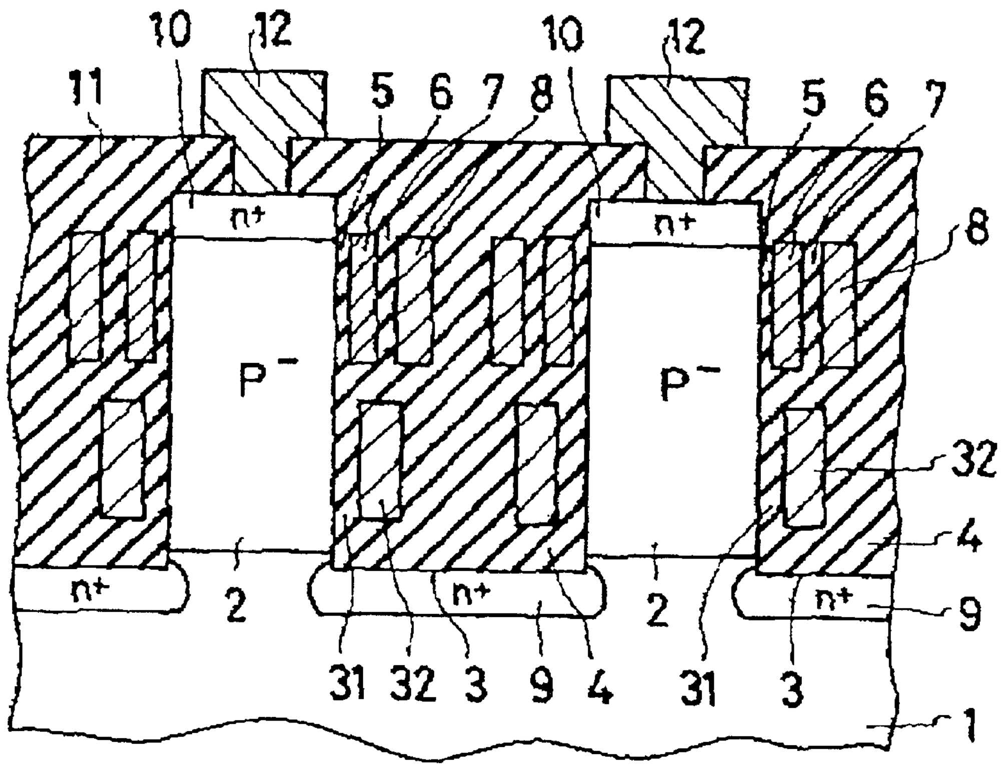

Fig. 1660
Prior Art
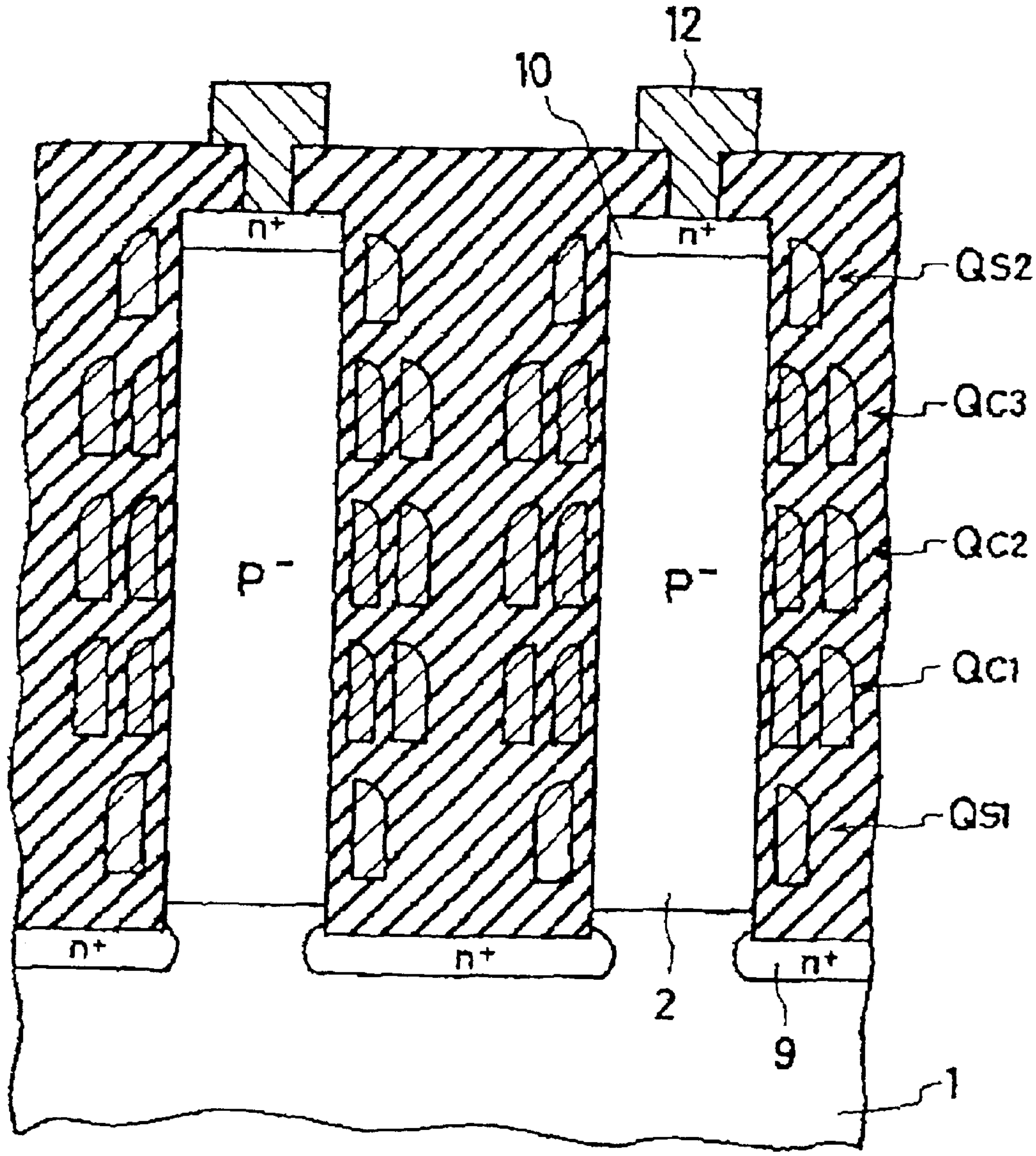

SEMICONDUCTOR MEMORY INCLUDING CELL(S) WITH BOTH CHARGE STORAGE LAYER(S) AND CONTROL GATE LATERALLY SURROUNDING ISLAND-LIKE SEMICONDUCTOR LAYER

CROSS-REFERENCES TO RELATED APPLICATIONS

This application is related to Japanese Patent Application No. 2001-142454 filed on Mar. 30, 2001, No. 2001-264927 filed on Jun. 23, 2001, No. 2001-264928 filed on Jun. 23, 2001, No. 2001-266490 filed on Jun. 23, 2001 and No. 2001-266491 filed on Jun. 23, 2001, whose priority is claimed under 35 USC §119, the disclosure of which is incorporated by reference in its entirety.

BACKGROUND OF THE INVENTION

1. Field of the Invention

The present invention relates to a semiconductor memory and its production process, and more particularly, the invention relates to a semiconductor memory provided with a memory transistor having a charge storage layer and a control gate, and its production process.

2. Description of Related Art

As a memory cell of an EEPROM, is known a device of a MOS transistor structure having a charge storage layer and a control gate in a gate portion, in which an electric charge is injected into and released from the charge storage layer by use of a tunnel current. In this memory cell, data "0" and "1" are stored as changes in a threshold voltage by the state of the charge in the charge storage layer. For example, in the case of an n-channel memory cell using a floating gate as the charge storage layer, when a source/drain diffusion layer and a substrate are grounded and a high positive voltage is applied to the control gate, electrons are injected from the substrate into the floating gate by a tunnel current. This injection of electrons shifts the threshold voltage of the memory cell toward positive. When the control gate is grounded and a high positive voltage is applied to the source/drain diffusion layer or the substrate, electrons are released from the floating gate to the substrate by the tunnel current. This release of electrons shifts the threshold voltage of the memory cell toward negative.

In the above-described operation, a relationship of capacity coupling between the floating gate and the control gate with capacity coupling between the floating gate and the substrate plays an important role in effective injection and release of electrons, i.e., effective writing and erasure. That is, the larger the capacity between the floating gate and the control gate, the more effectively the potential of the control gate can be transmitted to the floating gate and the easier the writing and erasure become.

With recent development in semiconductor technology, especially, in micro-patterning techniques, the size reduction and the capacity increase of memory cells of EEPROM are rapidly progressing. Accordingly, it is important how large capacity can be ensured between the floating gate and the control gate.

For increasing the capacity between the floating gate and the control gate, it is necessary to thin a gate insulating film therebetween, to increase the dielectric constant of the gate insulating film or to enlarge an area where the floating gate opposes the control gate.

However, the thinning of the gate insulating film is limited in view of reliability of memory cells. For increasing the dielectric constant of the gate insulating film, a silicon nitride film is used as the gate insulating film instead of a silicon oxide film. This is also questionable in view of reliability and is not practical.

Therefore, in order to ensure a sufficient capacity between the floating gate and the control gate, it is necessary to set a sufficient overlap area therebetween. This is, however, contradictory to the size reduction of memory cells and the capacity increase of EEPROM.

In an EEPROM disclosed by Japanese Patent No. 2877462, memory transistors are formed by use of sidewalls of a plurality of pillar-form semiconductor layers arranged in matrix on a semiconductor substrate, the pillar-form semiconductor layers being separated by trenches in a lattice form. A memory transistor is composed of a drain diffusion layer formed on the top of each pillar-form semiconductor layer, a common source diffusion layer formed at the bottom of the trenches, and a charge storage layer and a control gate which are around all the periphery of the sidewall of the pillar-form semiconductor layer. The control gate is provided continuously for a plurality of pillar-form semiconductor layers lined in one direction so as to form a control gate line, and a bit line is connected to drain diffusion layers of a plurality of memory transistors lined in a direction crossing the control gate line. The above-described charge storage layer and the control gate are formed in a lower part of the pillar-form semiconductor layer. In a one transistor/one cell structure, if a memory transistor is over-erased, i.e., a reading potential is 0 V and the threshold is negative, a cell current flows in the memory cell even if it is not selected. To surely prevent this inconvenience, a selection gate transistor is provided above the memory transistor. The selection gate transistor has a gate electrode formed to surround at least a part of the periphery of the pillar-form island semiconductor layer in an upper part of the pillar-form semiconductor layer.

The prior-art EEPROM memory cell has the charge storage layer and the control gate which are formed by use of the sidewall of the island-like semiconductor layer to surround the pillar-form semiconductor layer. With this construction, a sufficiently large capacity can be ensured between the charge storage layer and the control gate with a small area occupied. The drain regions of the memory cells connected to the bit lines are formed on the top of the pillar-form semiconductor layers and completely insulated from each other by the trenches. A device isolation region can further be decreased and the memory cells are reduced in size. Accordingly, it is possible to obtain a mass-storage EEPROM with memory cells which provide excellent writing and erasing efficiency.

Hereinafter, explanation is given of a prior-art EEPROM with reference to figures. FIG. 1651 is a plan view of the prior-art EEPROM, and FIGS. 1652(*a*) and 1652(*b*) are sectional views taken on lines A-A' and B-B', respectively, in FIG. 1651.

In FIG. 1651, pillar-form silicon semiconductor layers 2 are columnar, that is, the top thereof is circular. However, the shape of the pillar-form silicon semiconductor layers need not be columnar. In the plan view of FIG. 1651, selection gate lines formed by continuing the gate electrodes of the selection gate transistors are not shown for avoiding complexity of the figure.

In the prior art, is used a P-type silicon substrate 1, on which a plurality of pillar-form P-type silicon layers 2 are arranged in matrix. The pillar-form P-type silicon layers 2 are separated by trenches 3 in a lattice form and functions as memory cell regions. Drain diffusion layers 10 are formed on the top of the silicon layers 2, common source diffusion layers 9 are formed at the bottom of the trenches 3, and oxide films 4 are buried at the bottom of the trenches 3. Floating gates 6 are formed in a lower part of the pillar-form silicon layers 2 with intervention of tunnel oxide films 5 so as to surround the pillar-form silicon layers 2. Outside the floating gates 6, control gates 8 are formed with intervention of interlayer insulating films 7. Thus memory transistors are formed. Here, as shown in FIGS. 1651 and 1652(*b*), the control gates 8 are provided continuously for a plurality of memory cells in one direction so as to form control gate lines (CG1, CG2, . . . ). Gate electrodes 32 are provided around an upper part of the pillar-form silicon layers 2 with intervention of gate oxide films 31 to form the selection gate transistors, like the memory transistors. The gate electrodes 32 of the selection gate transistors, like the control gates 8 of the memory cells, are provided continuously in the same direction as that of the control gates 8 of the memory cells so as to form selection gate lines, i.e., word lines WL (WL1, WL2, . . . ).

Thus, the memory transistors and the selection gate transistors are buried in the trenches in a stacked state. The control gate lines leave end portions as contact portions 14 on thee surface of silicon layers, and the selection gate lines leaves contact portions 15 on silicon layers on an end opposite to the contact portions 14 of the control gates. Al wires 13 and 16 to be control gate lines CG and the word lines WL, respectively, are contacted to the contact portions 14 and 15, respectively.

At the bottom of the trenches 3, common source diffusion layers 9 of the memory cells are formed, and on the top of the pillar-form silicon layers 2, drain diffusion layers 10 are formed for every memory cell. The resulting substrate with the thus formed memory cells is covered with a CVD oxide film 11, where contact holes are opened. Al wires 12 are provided which are to be bit lines BL (BL1, BL2, . . . ) which connects the drain diffusion layers 10 of memory cells lined in a direction crossing the word lines WL. When patterning is carried out for the control gate lines, a mask is formed of PEP on the pillar-form silicon layers at an end of a cell array to leave, on the surface of the silicon layers, the contact portions 14 of a polysilicon film which connect with the control gate lines. To the contact portions 14, the Al wires 13 which are to be control gate lines are contacted by Al films formed simultaneously with the bit lines BL.

A production process for obtaining the structure shown in FIG. 1652(*a*) is explained with reference to FIGS. 1653(*a*) to 1656(*g*).

A P-type silicon layer 2 with a low impurity concentration is epitaxially grown on a P-type silicon substrate 1 with a high impurity concentration to give a wafer. A mask layer 21 is deposited on the wafer and a photoresist pattern 22 is formed by a known PEP process. The mask layer 21 is etched using the photoresist pattern 22 (see FIG. 1653(*a*)).

The silicon layer 2 is etched by a reactive ion etching method using the resulting mask layer 21 to form trenches 3 in a lattice form which reach the substrate 1. Thereby the silicon layer 2 is separated into a plurality of pillar-form islands. A silicon oxide film 23 is deposited by a CVD method and anisotropically etched to remain on the sidewalls of the pillar-form silicon layers 2. By implantation of N-type impurity ions, drain diffusion layers 10 are formed on the top of the pillar-form silicon layers 2 and common source diffusion layers 9 are formed at the bottom of the trenches (see FIG. 1653(*b*)).

The oxide films 23 around the pillar-form silicon layers 2 are etched away by isotropic etching. Channel ion implantation is carried out on the sidewalls of the pillar-form silicon layers 2 by use of a slant ion implantation as required. Instead of the channel ion implantation, an oxide film containing boron may be deposited by a CVD method with a view to utilizing diffusion of boron from the oxide film. A silicon oxide film 4 is deposited by a CVD method and isotropically etched so that the silicon oxide film 4 of a predetermined thickness is buried at the bottom of trenches 3.

Tunnel oxide films 5 are formed to a thickness of about 10 nm around the silicon layers 2 by thermal oxidation. A first-layer polysilicon film is deposited and anisotropically etched to remain on the lower sidewalls of the pillar-form silicon layers 2 to be floating gates 6 around the silicon layers 2 (see FIG. 1654(*c*)).

Interlayer insulating films 7 are formed on the surface of the floating gates 6 formed around the pillar-form silicon layers 2. The interlayer insulating films 7 are formed of an ONO film, for example. The ONO film is formed by oxidizing the surface of the floating gate 6 by a predetermined thickness, depositing a silicon nitride film by a plasma-CVD method and then thermal-oxidizing the surface of the silicon nitride film. A second-layer polysilicon film is deposited and anisotropically etched to form control gates 8 on lower parts of the pillar-form silicon layers 2 (see FIG. 1654(*d*)). At this time, by previously setting the intervals between the pillar-form silicon layers 2 in a longitudinal direction at a predetermined value or less, the control gates 8 are formed as control gate lines continuous in the longitudinal direction in FIG. 1651 without need to perform a masking process. Unnecessary parts of the interlayer insulating films 7 and underlying tunnel oxide films 2 are etched away. A silicon oxide film 111 is deposited by a CVD method and etched halfway down the trenches 3, that is, to such a depth that the floating gates 6 and the control gates 8 of the memory cells are buried and hidden (see FIG. 1655(*e*)).

A gate oxide film 31 is formed to a thickness of about 20 nm on exposed upper parts of the pillar-form silicon layers 2 by thermal oxidation. A third-layer polysilicon film is deposited and anisotropically etched to form gate electrodes 32 of MOS transistors (see FIG. 1655(*f*)). The gate electrodes 32 are patterned to be continuous in the same direction as the control gate lines run, and form selection gate lines. The selection gate lines can also be formed continuously in self-alignment, but this is more difficult than the control gates 8 of the memory cells. This is because, the selection gate transistors are single-layer gates while the memory transistors are two-layered gates, and therefore, the intervals between adjacent selection gates are wider than the intervals between the control gates. Accordingly, in order to ensure that the gate electrodes 32 are continuous, the gate electrodes may be formed in a two-layer polysilicon structure, a first polysilicon film may be patterned to remain only in locations to connect the gate electrodes by use of a masking process, and a second polysilicon film may be left on the sidewalls.

Masks for etching the polysilicon films are so formed that contact portions 14 and 15 of the control gate lines and the selection gate lines are formed on the top of the pillar-form silicon layers at different ends.

A silicon oxide film 112 is deposited by a CVD method and, as required, is flattened. Contact holes are opened. An Al film is deposited and patterned to form Al wires 12 to be bit lines BL, Al wires 13 to be control gate lines CG and Al wires 16 to be word lines WL at the same time (see FIG. 1656(*g*)).

FIG. 1657(*a*) schematically shows a sectional structure of a major part of one memory cell of the prior-art EEPROM, and FIG. 1657(*b*) shows an equivalent circuit of the memory cell.

The operation of the prior-art EEPROM is briefly explained with reference to FIGS. 1657(*a*) and 1657(*b*).

For writing by use of injection of hot carriers, a sufficiently high positive potential is applied to a selected word line WL, and positive potentials are applied to a selected control gate line CG and a selected bit line BL. Thereby, a positive potential is transmitted to the drain of a memory transistor Qc via a selection gate transistor Qs to let a channel current flow in the memory transistor Qc and inject hot carriers. Thereby, the threshold of the memory cell is shifted toward positive.

For erasure, 0 V is applied to a selected control gate line CG and high positive potentials are applied to the word line WL and the bit line BL to release electrons from the floating gate to the drain. For erasing all the memory cells, a high positive potential may be applied to the common sources to release electrons to the sources. Thereby, the thresholds of the memory cells are shifted toward negative.

For reading, the selection gate transistor Qs is rendered ON by the word line WL and a reading potential is applied to the control gate line CG. The judgment of "0" or "1" is made from the presence or absence of a current. In the case where an FN tunneling is utilized for injecting electrons, high positive potentials are applied to a selected control gate line CG and a selected word line WL and 0 V is applied to a selected bit line BL to inject electrons from the substrate to the floating gate.

This prior art provides an EEPROM which does not mis-operate even in an over-erased state thanks to the presence of the selection gate transistors.

The prior-art EEPROM does not have diffusion layers between the selection gate transistors Qs and the memory transistors Qc as shown in FIG. 1657(*a*). This is because, it is hard to form the diffusion layers selectively on the sidewalls of the pillar-form silicon layers. Therefore, in the structure shown in FIGS. 1652(*a*) and 1652(*b*), desirably, separation oxide films between the gates of the memory transistors and the gates of the selection gate transistors are as thin as possible. In the case of utilizing the injection of hot electrons, in particular, the separation oxide films need to be about 30 to 40 nm thick for allowing a sufficient "H" level potential to be transmitted to the drain of a memory transistor.

Such fine intervals cannot be practically made only by burying the oxide films by the CVD method as described in the above production process. Accordingly, desirably, the CVD oxide films are buried in such a manner that the floating gates 6 and the control gates 8 are exposed, and thin oxide films are formed on exposed parts of the floating gates 6 and the control gates 8 simultaneously with the formation of the gate oxide films for the selection gate transistors.

Further, according to the prior art, since the pillar-form silicon layers are arranged with the bottom of the lattice-form trenches forming an isolation region and the memory cells are constructed to have the floating gates formed to surround the pillar-form silicon layers, it is possible to obtain a highly integrated EEPROM in which the area occupied by the memory cells is small. Furthermore, although the memory cells occupy a small area, the capacity between the floating gates and the control gates can be ensured to be sufficiently large.

According to the prior art, the control gates of the memory cells are formed to be continuous in one direction without using a mask. This is possible, however, only when the pillar-form silicon layers are arranged at intervals different between a longitudinal direction and a lateral direction. That is, by setting the intervals between adjacent pillar-form silicon layers in a word line direction to be smaller than the intervals between adjacent pillar-form silicon layers in a bit line direction, it is possible to obtain control gate lines that are separated in the bit line direction and are continuous in the word line direction automatically without using a mask.

In contrast, when the pillar-form silicon layers are arranged at the same intervals both in the longitudinal direction and in the lateral direction, a PEP process is required.

More particularly, the second-layer polysilicon film is deposited thick, and through the PEP process to form a mask, the second-layer polysilicon film is selectively etched to remain in locations to be continuous as control gate lines.

The third-layer polysilicon film is deposited and etched to remain on the sidewalls as described regarding the production process of the prior art. Even in the case where the pillar-form silicon layers are arranged at intervals different between the longitudinal direction and the lateral direction, the continuous control gate lines cannot be automatically formed depending upon the intervals of the pillar-form silicon layers.

In this case, the mask process by the PEP process as described above can be used for forming the control gate lines continuous in one direction.

Although the memory cells of the prior art as described above are of a floating gate structure, the charge storage layers do not necessarily have the floating gate structure and may have a structure such that the storage of a charge is realized by a trap in a laminated insulating film, e.g., a MNOS structure.

FIG. 1658 is a sectional view of a prior-art memory with memory cells of the MNOS structure, corresponding to FIG. 1652(*a*). A laminated insulating film 24 functioning as the charge storage layer is of a laminated structure of a tunnel oxide film and a silicon nitride film, or of a tunnel oxide film, a silicon nitride film and further an oxide film formed on the silicon nitride film.

FIG. 1659 is a sectional view of a prior-art memory in which the memory transistors and the selection gate transistors of the above-described prior art are exchanged, i.e., the selection gate transistors are formed in the lower parts of the pillar-form silicon layers 2 and the memory transistors are formed in the upper parts of the pillar-form silicon layers 2. FIG. 1659 corresponds to FIG. 1652(*a*). This structure in which the selection gate transistors are provided on a common source side can apply to the case where the injection of hot electrons is used for writing.

FIG. 1660 shows a prior-art memory in which a plurality of memory cells are formed on one pillar-form silicon layer. Like numbers denote like components in the above-described prior-art memories and the explanation thereof is omitted. In this memory, a selection gate transistor Qs1 is formed in the lowermost part of a pillar-form silicon layer 2, three memory transistors Qc1, Qc2 and Qc3 are laid above the selection gate transistor Qs1, and another selection gate transistor Qs2 is formed above. This structure can be obtained basically by repeating the aforesaid production process. Regarding the prior art memory shown in FIG. 1659 and FIG. 1660, it is needless to say that the memory transistors of the MNOS structure can be used instead of the memory transistors of the floating gate structure.

As described above, the prior-art techniques can provide highly integrated EEPROMs whose control gates and charge storage layers have a sufficient capacity therebetween and whose memory cells occupy a decreased area, by constructing the memory cells using memory transistors having the charge storage layers and the control gates by use of the sidewalls of the pillar-form semiconductor layers separated by the lattice-form trenches.

However, if a plurality of memory cells are connected in series on one pillar-form semiconductor layer and the thresholds of the memory cells are supposed to be the same, significant changes take place in the thresholds of memory cells at both ends of the memory cells connected in series owing to a back-bias effect of the substrate in a reading operation. In the reading operation, the reading potential is applied to the control gate lines CG and the "0" or "1" is judged from the presence of a current. For this reason, the number of memory cells connected in series is limited in view of the performance of memories. Therefore, the production of mass-storage memories is difficult to realize.

The problem that the thresholds of memory cells are changed owing to a back-bias effect is true not only of the case where a plurality of memory cells are connected in series on one pillar-form semiconductor layer but also of the case where one memory cell is formed on one pillar-form semiconductor layer, depending upon variations in the back-bias effect of the substrate in an inplanar direction.

In the prior-art memories, the charge storage layers and the control gates are formed in self-alignment with the pillar-form semiconductor layers. Taking mass storage of the cell array into consideration, the pillar-form semiconductor layers are preferably formed at the minimum photoetching dimension. In the case where the floating gates are used as the charge storage layers, a relationship of the capacity coupling between the floating gates and the control gates with the capacity coupling between the floating gates and the substrate is determined by the area of the outer periphery of the pillar-form semiconductor layers, the area of the outer periphery of the floating gate, the thickness of the tunnel oxide films insulating the floating gates from the pillar-form semiconductor layers and the thickness of the interlayer insulating films insulating the floating gates from the control gates. In the prior-art memories, the charge storage layers and the control gates are formed to surround the pillar-form semiconductor layers by utilizing the sidewalls of the pillar-form semiconductor layers in order that the capacity between the charge storage layers and the control gates is ensured to be sufficiently large with a small area occupied. However, in the case where the pillar-form semiconductor layers are formed at the minimum photoetching dimension and the thickness of the tunnel oxide films and that of the interlayer insulating films are fixed, the capacity between the charge storage layers and the control gates is determined simply by the area of the outer periphery of the floating gates, that is, the thickness of the floating gates. Therefore, it is difficult to increase the capacity between the charge storage layers and the control gates without increasing the area occupied by the memory cells. In other words, it is difficult to increase the ratio of the capacity between the floating gates and the control gates to the capacity between the floating gates and the pillar-form semiconductor layers without increasing the area occupied by the memory cells.

Further, if transistors are formed in a direction vertical to the substrate stage by stage, there occur variations in characteristics of the memory cells owing to differences in the properties of the tunnel oxide films and differences in the profile of diffusion layers. Such differences are generated by thermal histories different stage by stage.

Furthermore, if gate electrodes of the transistors are formed in a direction vertical to the substrate stage by stage, variations occur in gate lengths due to variations during the production process. For example, to form the gate electrodes in the form of a sidewall spacer, a gate electrode material film is deposited and etched back to a depth corresponding to the height of the island-like semiconductor layers. That is, in order to realize the mass storage cell array, the number of memory gates to be formed on the island-like semiconductor layers increases, and inevitably the height of the island-like semiconductor layers increases. This causes increase in the variations in production process because the etch-back needs to be carried out by a greater amount. Such an influence is significant when the mass storage of the cell array is intended.

SUMMARY OF THE INVENTION

The present invention provides a semiconductor memory comprising:

a substrate; and one or more memory cells constituted of at least one island-like semiconductor layer, a charge storage layer and a control gate, the charge storage layer and the control gate being formed to entirely or partially encircle a sidewall of the island-like semiconductor layer, wherein at least one of said one or more memory cells is electrically insulated from the semiconductor substrate and has an insulating film allowing an electric charge to pass at least in a part of a region between the charge storage layer and the island-like semiconductor layer.

Further, the present invention provides a semiconductor memory comprising:

a substrate; and one or more memory cells constituted of at least one island-like semiconductor layer formed by epitaxial growth, a charge storage layer and a control gate, the charge storage layer and the control gate being formed to entirely or partially encircle a sidewall of the island-like semiconductor layer, wherein at least one of said one or more memory cells is electrically insulated from the semiconductor substrate.

Moreover, the present invention provides a semiconductor memory comprising:

a substrate; and one or more memory cells constituted of at least one island-like semiconductor layer, a charge storage layer and a control gate, the charge storage layer and the control gate being formed to entirely or partially encircle a sidewall of the island-like semiconductor layer, wherein at least one of said one or more memory cells is electrically insulated from the semiconductor substrate and a part of the charge storage layer and a part of the control gate electrode are formed of different materials.

Still further, the present invention provides a process for producing a semiconductor memory a substrate; and one or more memory cells constituted of at least one island-like semiconductor layer, a charge storage layer and a control gate, the charge storage layer and the control gate being formed to entirely or partially encircle a sidewall of the island-like semiconductor layer, wherein at least one of said one or more memory cells is electrically insulated from the semiconductor substrate and has an insulating film allowing an electric charge to pass at least in a part of a region between the charge storage layer and the island-like semiconductor layer, the process comprising at least the steps of:

forming at least one island-like semiconductor layer on a semiconductor substrate;

forming, on the island-like semiconductor layer, an insulating film which covers at least a part of a surface of the island-like semiconductor layer and a first conductive layer which covers a surface of the insulating film;

forming a sidewall spacer of an insulating film on the first conductive layer located on a sidewall of the island-like semiconductor layer, the sidewall spacer being divided in a height direction;

dividing the first conductive film using the sidewall spacer as a mask;

introducing an impurity in self-alignment with the divided first conductive film; and forming an interlayer capacity film and a second conductive film on the first conductive film.

Moreover, the present invention provides a process for producing a semiconductor memory which has a semiconductor substrate and one or more memory cells composed of at least one island-like semiconductor layer formed by epitaxial growth, a charge storage layer and a control gate which are formed to partially or entirely encircle a sidewall of the island-like semiconductor layer, at least one of said one or more memory cells being electrically insulated from the semiconductor substrate, the process comprising the steps of:

forming one or more laminate films each composed of three or more different films including a first insulating film, on a semiconductor substrate;

forming a hole in the laminate film, the hole reaching the semiconductor substrate;

epitaxially growing a semiconductor in the hole to form an island-like semiconductor layer on the semiconductor substrate;

dividing the first insulating film so that the first insulating film is located only around the island-like semiconductor layer and covering the divided first insulating film with another insulating film;

partially exposing a surface of the island-like semiconductor layer so that the first insulating film and said anther insulating film remain;

forming a first conductive film with intervention of the insulating films on an exposed of the island-like semiconductor layer;

forming a second conductive film on the first conductive film with intervention of an interlayer insulating film; and introducing an impurity into the island-like semiconductor layer.

Still further, the present invention provides a process for producing a semiconductor memory which has a semiconductor substrate and one or more memory cells composed of at least one island-like semiconductor layer formed by epitaxial growth, a charge storage layer and a control gate which are formed to partially or entirely encircle a sidewall of the island-like semiconductor layer, at least one of said one or more memory cells being electrically insulated from the semiconductor substrate, the process comprising the steps of:

forming one or more laminate films each composed of three or more different films including a first insulating film, on a semiconductor substrate;

forming a hole in the laminate film, the hole reaching the semiconductor substrate;

epitaxially growing a semiconductor in the hole to form an island-like semiconductor layer on the semiconductor substrate;

dividing the first insulating film so that the first insulating film is located only around the island-like semiconductor layer and covering the divided first insulating film with another insulating film;

partially exposing a surface of the island-like semiconductor layer so that the first insulating film and said anther insulating film remain; and forming a first conductive film on an exposed sidewall of the island-like semiconductor layer with intervention of a charge storage layer of an laminate insulating film; and introducing an impurity into the island-like semiconductor layer.

Moreover, the present invention provides a process for producing a semiconductor memory which has a semiconductor substrate and one or more memory cells composed of at least one island-like semiconductor layer, a charge storage layer and a control gate which are formed to partially or entirely encircle a sidewall of the island-like semiconductor layer, at least one of said one or more memory cells being electrically insulated from the semiconductor substrate, the process comprising the steps of:

forming a laminate film made of first insulating films and first conductive films which are alternately laminated, on a semiconductor substrate;

patterning the laminate film to form island-like laminate films separated from each other;

forming a second conductive film in the form of a sidewall on sidewalls of the first conductive films in the island-like laminate films with intervention of an interlayer capacity film;

patterning the island-like laminate films to expose a part of a surface of the semiconductor substrate and sidewalls of the first conductive films;

forming a tunnel insulating film on the exposed sidewalls of the first conductive film;

forming an island-like semiconductor layer by epitaxial growth so that the island-like semiconductor layer contacts the tunnel insulating film; and introducing an impurity into a region of the island-like semiconductor layer opposed to the first conductive film.

Still further, the present invention provides a process for producing a semiconductor memory which has a semiconductor substrate and one or more memory cells composed of at least one island-like semiconductor layer, a charge storage layer and a control gate which are formed to partially or entirely encircle a sidewall of the island-like semiconductor layer, at least one of said one or more memory cells being electrically insulated from the semiconductor substrate, the process comprising the steps of:

forming a laminate film made of first insulating films and first conductive films which are alternately laminated, on a semiconductor substrate;

patterning the laminate film to form island-like laminate films separated from each other;

patterning the island-like laminate films to expose a part of a surface of the semiconductor substrate and sidewalls of the first conductive films;

forming a charge storage layer of a laminate insulating film on the exposed sidewalls of the first conductive films;

forming an island-like semiconductor layer by epitaxial growth so that the island-like semiconductor layer contacts the charge storage layer; and introducing an impurity into a region of the island-like semiconductor layer opposed to the first conductive film.

Moreover, the present invention provides a process for producing a semiconductor memory which has a semiconductor substrate and one or more memory cells composed of at least one island-like semiconductor layer, a charge storage layer and a control gate which are formed to partially or entirely encircle a sidewall of the island-like semiconductor layer, at least one of said one or more memory cells being electrically insulated from the semiconductor substrate, the process comprising the steps of:

forming a laminate film made of first insulating films and first conductive films which are alternately laminated, on a semiconductor substrate;

patterning the laminate film to form island-like laminate films separated from each other;

patterning the island-like laminate films to expose a part of a surface of the semiconductor substrate and sidewalls of the first conductive films;

forming a gate insulating film on the exposed sidewalls of the first conductive films;

forming an island-like semiconductor layer by epitaxial growth so that the island-like semiconductor layer contacts the gate insulating film; and introducing an impurity into a region of the island-like semiconductor layer opposed to the first conductive film.

Still further, the present invention provides a process for producing a semiconductor memory which has a semiconductor substrate and one or more memory cells composed of at least one island-like semiconductor layer, a charge storage layer and a control gate which are formed to partially or entirely encircle a sidewall of the island-like semiconductor layer, at least one of said one or more memory cells being electrically insulated from the semiconductor substrate, the process comprising the steps of:

forming a first insulating film on a semiconductor substrate;

patterning the first insulating film to form island-like insulating films separated from each other;

forming a charge storage layer of a first conductive film in the form of sidewalls on sidewalls of the island-like insulating films;

forming a control gate of a second conductive film in the form of a sidewall on a sidewall of the charge storage layer with intervention of an interlayer capacity film:

patterning the island-like insulating films to expose a part of a surface of the semiconductor substrate and a sidewall of the first conductive film;

forming a tunnel insulating film on the exposed sidewall of the first conductive film;

forming an island-like semiconductor layer by epitaxial growth so that the semiconductor layer contacts the tunnel insulating film: and introducing an impurity into a region of the island-like semiconductor layer opposed to the first conductive film.

Moreover, the present invention provides a process for producing a semiconductor memory which has a semiconductor substrate and one or more memory cells composed of at least one island-like semiconductor layer, a charge storage layer and a control gate which are formed to partially or entirely encircle a sidewall of the island-like semiconductor layer, at least one of said one or more memory cells being electrically insulated from the semiconductor substrate, the process comprising the steps of:

forming a first insulating film on a semiconductor substrate;

patterning the first insulating film to form island-like insulating films separated from each other;

forming a control gate of a first conductive film in the form of a sidewall on sidewalls of the island-like insulating films;

patterning the island-like insulating films to expose a part of a surface of the semiconductor substrate and a sidewall of the first conductive film;

forming a charge storage layer of a laminate insulating film on the exposed sidewall of the first conductive film;

forming an island-like semiconductor layer by epitaxial growth so that the semiconductor layer contacts the charge storage layer: and introducing an impurity into a region of the island-like semiconductor layer opposed to the first conductive film.

Still further, the present invention provides a process for producing a semiconductor memory which has a semiconductor substrate and one or more memory cells composed of at least one island-like semiconductor layer, a charge storage layer and a control gate which are formed to partially or entirely encircle a sidewall of the island-like semiconductor layer, at least one of said one or more memory cells being electrically insulated from the semiconductor substrate, the process comprising the steps of:

forming a first insulating film on a semiconductor substrate;

patterning the first insulating film to form island-like insulating films separated from each other;

forming a control gate and a capacitor electrode of first conductive films in the form of sidewalls on sidewalls of the island-like insulating films;

patterning the island-like insulating films to expose a part of a surface of the semiconductor substrate and sidewalls of the first conductive films;

forming a gate insulating film on the exposed sidewalls of the first conductive films;

forming an island-like semiconductor layer by epitaxial growth so that the semiconductor layer contacts the gate insulating film: and introducing an impurity into a region of the island-like semiconductor layer opposed to the first conductive film.

Moreover, the present invention provides a process for producing a semiconductor memory which has a semiconductor substrate and one or more memory cells composed of at least one island-like semiconductor layer, a charge storage layer and a control gate which are formed to partially or entirely encircle a sidewall of the island-like semiconductor layer, at least one of said one or more memory cells being electrically insulated from the semiconductor substrate, the process comprising the steps of:

forming at least one island-like semiconductor layer on a semiconductor substrate;

forming a tunnel insulating film on a surface of the island-like semiconductor layer;

forming sidewall spacers of first conductive films on the tunnel insulating film, the first conductive films being separated from each other in a height direction;

forming an impurity diffusion layer by introducing an impurity in self-alignment with the separated first conductive films; and forming interlayer capacity film and a second conductive film on the first conductive films;

Still further, the present invention provides a process for producing a semiconductor memory which has a semiconductor substrate and one or more memory cells composed of at least one island-like semiconductor layer, a charge storage layer and a control gate which are formed to partially or entirely encircle a sidewall of the island-like semiconductor layer, at least one of said one or more memory cells being electrically insulated from the semiconductor substrate, the process comprising the steps of:

forming at least one island-like semiconductor layer on a semiconductor substrate;

forming a tunnel insulating film on a surface of the island-like semiconductor layer;

forming a charge storage layer of a laminate insulating film on the tunnel insulating film;

forming sidewall spacers of first conductive films on the charge storage layer, the first conductive films being separated from each other in a height direction; and forming an impurity diffusion layer by introducing an impurity in self-alignment with the separated first conductive films.

Moreover, the present invention provides a process for producing a semiconductor memory which has a semiconductor substrate and one or more memory cells composed of at least one island-like semiconductor layer, a charge storage layer and a control gate which are formed to partially or entirely encircle a sidewall of the island-like semiconductor layer, at least one of said one or more memory cells being electrically insulated from the semiconductor substrate, the process comprising the steps of:

forming at least one island-like semiconductor layer on a semiconductor substrate;

forming an impurity diffusion layer by introducing an impurity in a part of a surface of the island-like semiconductor layer; and forming sidewall spacers of first conductive films on the surface of the island-like semiconductor layer with intervention of an insulating film, the first conductive films being separated from each other in a height direction.

The present invention has been made in view of the above-mentioned problems. An object of the invention is to provide a semiconductor memory and a production process therefor, in which the degree of integration of the memory is improved by reducing the back-bias effect in a semiconductor memory having charge storage layers and control gates, capacity between the charge storage layers and the control gates is increased without increasing an area occupied by memory cells and variations in the characteristics of the memory cells are suppressed by minimizing the variations in gate lengths of the memory cell transistors and the difference in thermal histories of the memory cell transistors derived from the production process.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 132 to 1650 are sectional views (taken on line A-A' and line B-B' in FIG. 1, FIG. 5, FIG. 10 or FIG. 13) illustrating various production steps for producing semiconductor memory devices in accordance with the present invention;

FIG. 1651 is a plan view illustrating a prior-art EEPROM;

FIG. 1652 is a sectional view taken on line A-A' and B-B' in FIG. 1651;

FIGS. 1653 to 1656 are sectional views illustrating production steps for producing a prior-art EEPROM;

FIG. 1657 is a plan view of a prior-art EEPROM and a corresponding equivalent circuit diagram;

FIGS. 1658 to 1659 are sectional views of various kinds of prior-art memory cells of MNOS structure; and FIG. 1660 is a sectional view of a prior-art semiconductor device with a plurality of memory cells formed on each pillar-form silicon layer.

DESCRIPTION OF THE PREFERRED EMBODIMENTS

Figure 1:
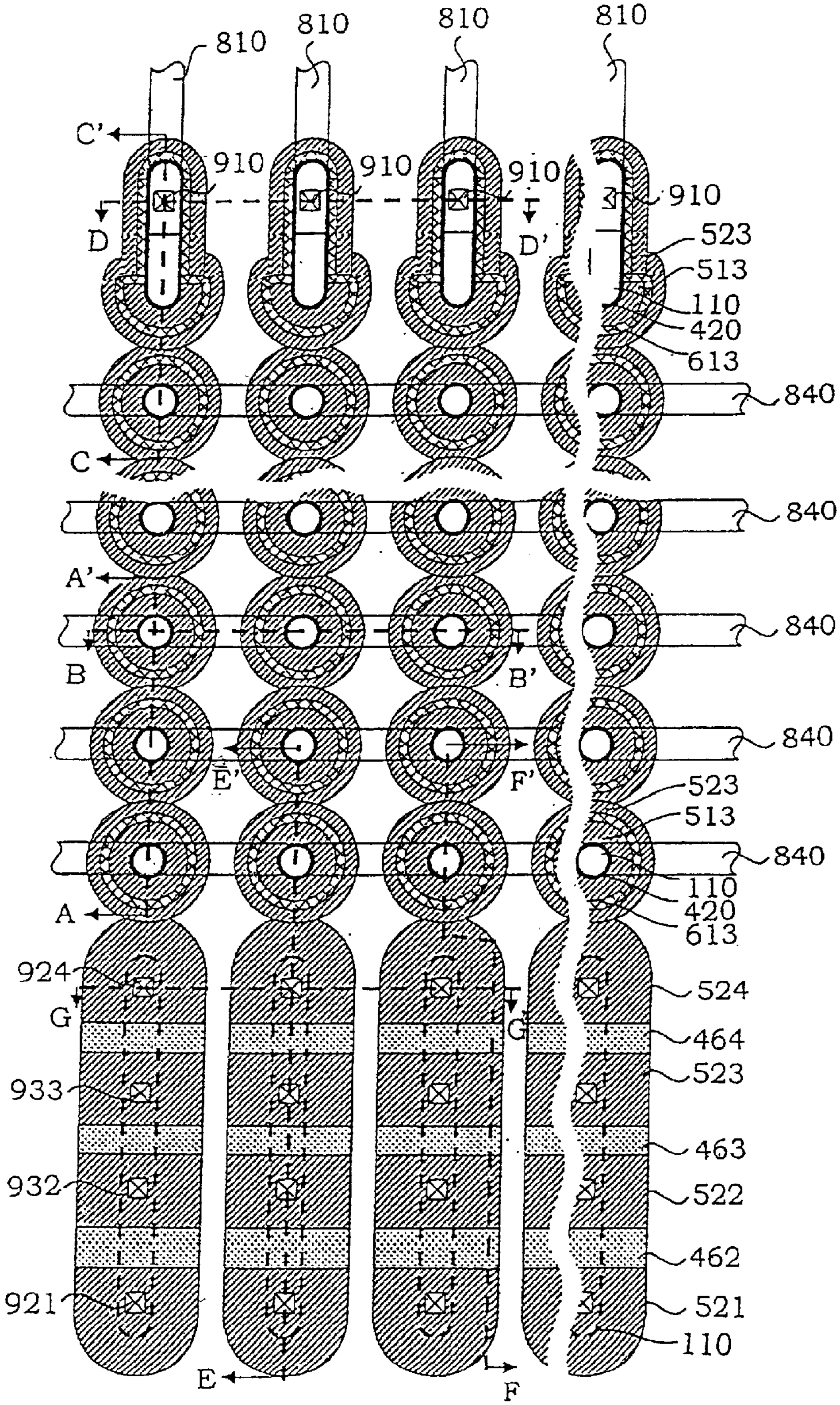
FIGS. 1 to 11 are plan views illustrating various memory cell arrays of EEPROMs having floating gates as charge storage layers in semiconductor memory devices in accordance with the present invention.

The semiconductor memory of the present invention mainly has a first conductivity type semiconductor substrate and one or more memory cells. The memory cell is constituted of at least one island-like semiconductor layer, at least one charge storage layer and at least one control gate (a third electrode). The charge storage layer and the control gate are formed around a sidewall of the island-like semiconductor layer. At least one of said one or more memory cells is electrically insulated from the semiconductor substrate. An insulating film is provided which allows an electric charge to pass through at least a part of a region between the charge storage layer and the island-like semiconductor layer.

Alternatively, the semiconductor memory of the present invention mainly has a first conductivity type semiconductor substrate and one or more memory cells. The memory cell is constituted of at least one island-like semiconductor layer formed by epitaxial growth, at least one charge storage layer and at least one control gate (a third electrode). The charge storage layer and the control gate are formed around a sidewall of the island-like semiconductor layer. At least one of said one or more memory cells is electrically insulated from the semiconductor substrate.

That "at least one of said one or more memory cells is electrically insulated from the semiconductor substrate" means that the island-like semiconductor layer is electrically insulated from the semiconductor substrate. If two or more memory cells are formed in one island-like semiconductor layer, the memory cells are electrically insulated and thereby a memory cell/memory cells above an insulating site is/are electrically insulated from the semiconductor substrate. If a selection gate (a memory gate) is formed below the memory cell(s), a selection transistor composed of the selection gate is electrically insulated from the semiconductor substrate or the selection transistor is electrically insulated from a memory cell and thereby a memory cell/memory cells above an insulating site is/are electrically insulated from the semiconductor substrate. It is preferably in particular that the selection transistor is formed between the semiconductor substrate and the island-like semiconductor layer or below the memory cell(s) and the selection transistor is electrically insulated from the semiconductor substrate. Electric insulation may be made, for example, by forming a second conductivity type impurity diffusion layer over a region to be insulated, by forming the second conductivity type impurity diffusion layer in part of the region to be insulated and utilizing a depletion layer at a junction of the second conductivity type impurity diffusion layer, or by providing a distance not allowing electric conduction and achieving electric insulation as a result. The semiconductor substrate may be electrically insulated from the memory cell(s) or the selection transistor by an insulating film of $SiO_2$ or the like. In the case where a plurality of memory cells are formed in one island-like semiconductor layer and selection transistors are optionally formed above or below the memory cells, the electric insulation may be formed between optional memory cells and/or a selection transistor and a memory cell.

The charge storage layer and the control gate may be formed all around the sidewall of the island-like semiconductor layer or on a part of the sidewall.

Only one memory cell or two or more memory cells may be formed on one island-like semiconductor layer. If three or more memory cells are formed, a selection gate is preferably formed below and/or above the memory cells to form a selection transistor together with the island-like semiconductor layer.

The insulating film provided between the charge storage layer and the island-like semiconductor layer may be, for example, a film usually functions as a tunnel insulating film. Any insulating film may be used as long as it allows an electron charge to pass through at least a certain region. More particularly, the insulating film may be formed as a gate insulating film over the almost entire surface of the island-like semiconductor layer and as a tunnel gate insulating film only in an entire region or a partial region immediately below the charge storage layer. The insulating film may be formed of a silicon oxide film, a silicon nitride film, a laminated film thereof (e.g., an NO film, an ON film, an ONO film and the like). The insulating film may have a uniform thickness or partially reduced thickness as long as it allows the electric charge to pass through. The thickness may suitably be adjusted depending on the voltage to be applied to the semiconductor memory. For example, a thickness of about 7 to 15 nm is preferable for the silicon oxide film.

Hereinafter, are explained constructions in which a plurality of, for example, two memory cells are arranged in series on one island-like semiconductor layer, island-like semiconductor layers are arranged in matrix and selection transistors are disposed below and above the memory cells. A gate electrode of the selection transistor below the memory cells is represented as a second electrode and a gate electrode of the selection transistor above the memory cells is represented as a fifth electrode. A tunnel insulating film is represented as a third insulating film, a sidewall spacer is represented as a fourth insulating film, and a gate insulating film which is a part of the selection transistor is represented as a thirteenth insulating film.

In the above-mentioned semiconductor memory, an impurity diffusion layer for reading the state of a charge stored in the memory cells is formed as a source or drain (first wiring) of the memory cells in the island-like semiconductor layer. This impurity diffusion layer electrically insulates the island-like semiconductor layer from the semiconductor substrate. Control gates formed in a plurality of island-like semiconductor layers are arranged continuously in one direction to form a control gate line (third wiring). Another impurity diffusion layer is formed as a drain or source of the memory cells in the island-like semiconductor layer and a plurality of such impurity diffusion layers in a direction crossing the control gate line are electrically connected to form a bit line (fourth wiring).

Although the control gate line and the bit line orthogonal to the control gate may be in any three-dimensional directions, are explained hereinafter constructions in which the lines are formed in directions horizontal to the semiconductor substrate.

Embodiments of Memory Cell Arrays as Shown in Plan Views

Figure 12:
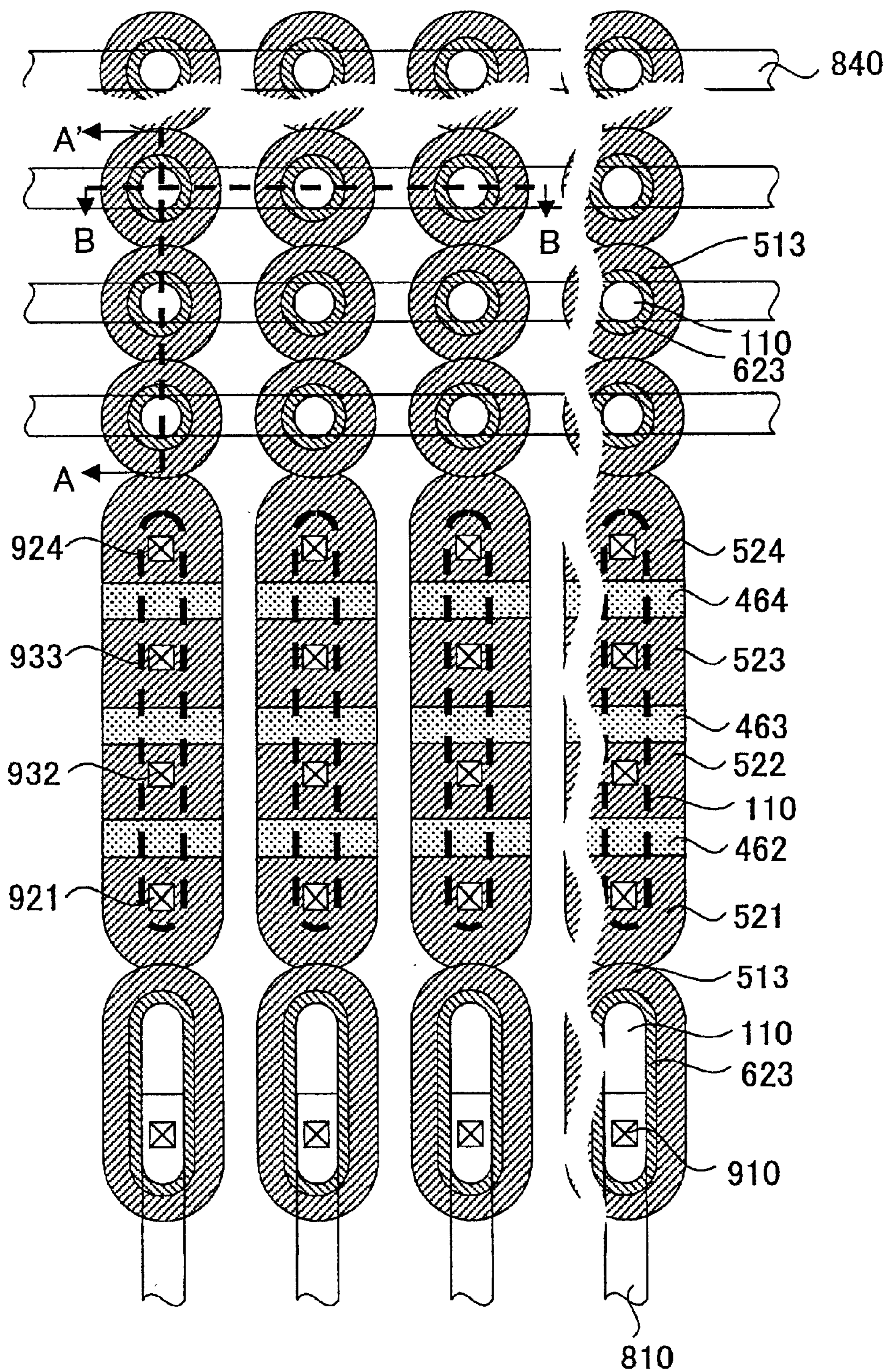
FIG. 12 is a plan view illustrating a memory cell array of MONOS structure having a layered insulating film as a charge storage layer in a semiconductor memory device in accordance with the present invention.
Figure 13:
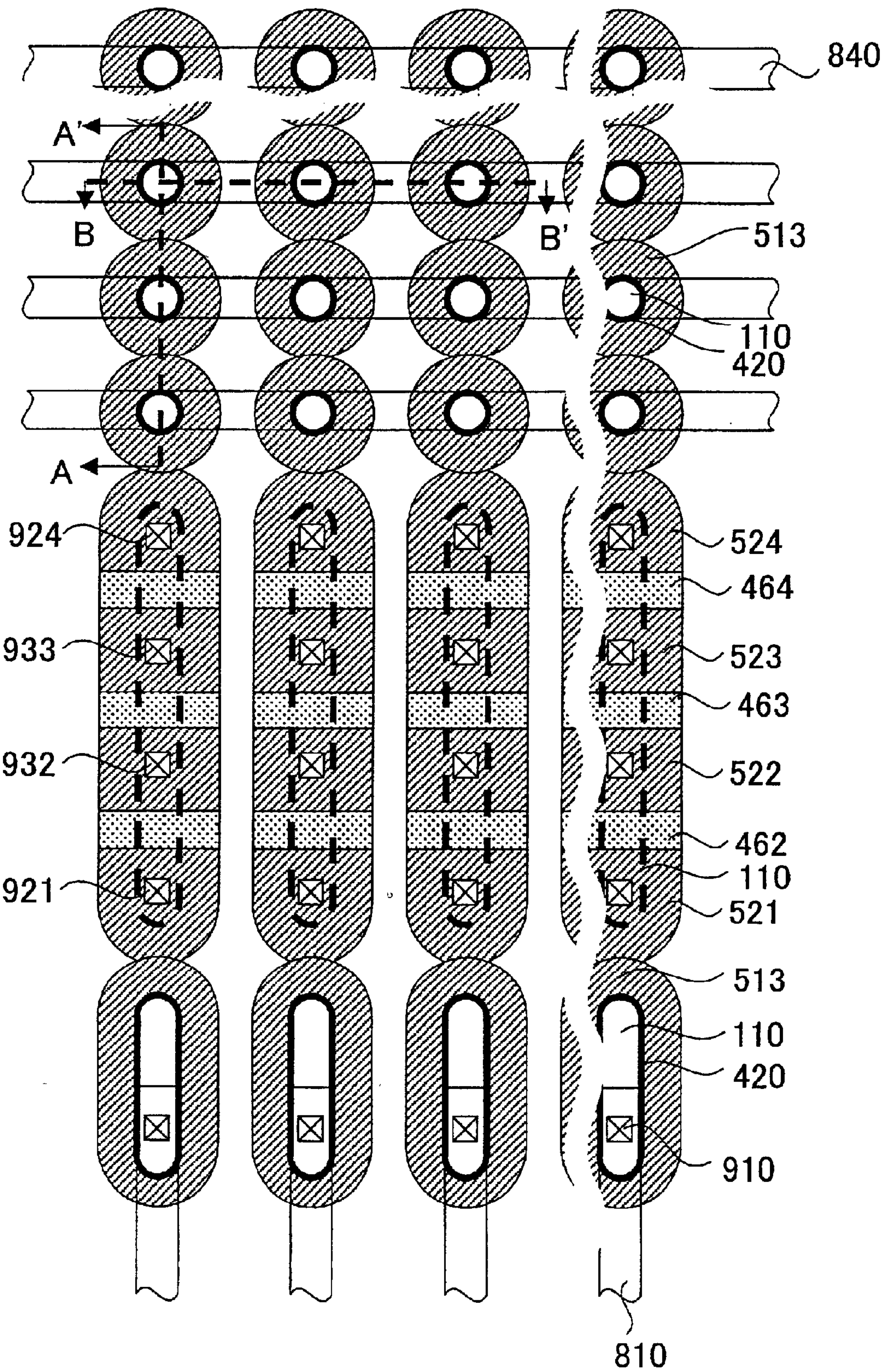
FIG. 13 is a plan view illustrating a memory cell array of DRAM structure having a MIS capacitor as a charge storage layer in a semiconductor memory device in accordance with the present invention.
Figure 14:
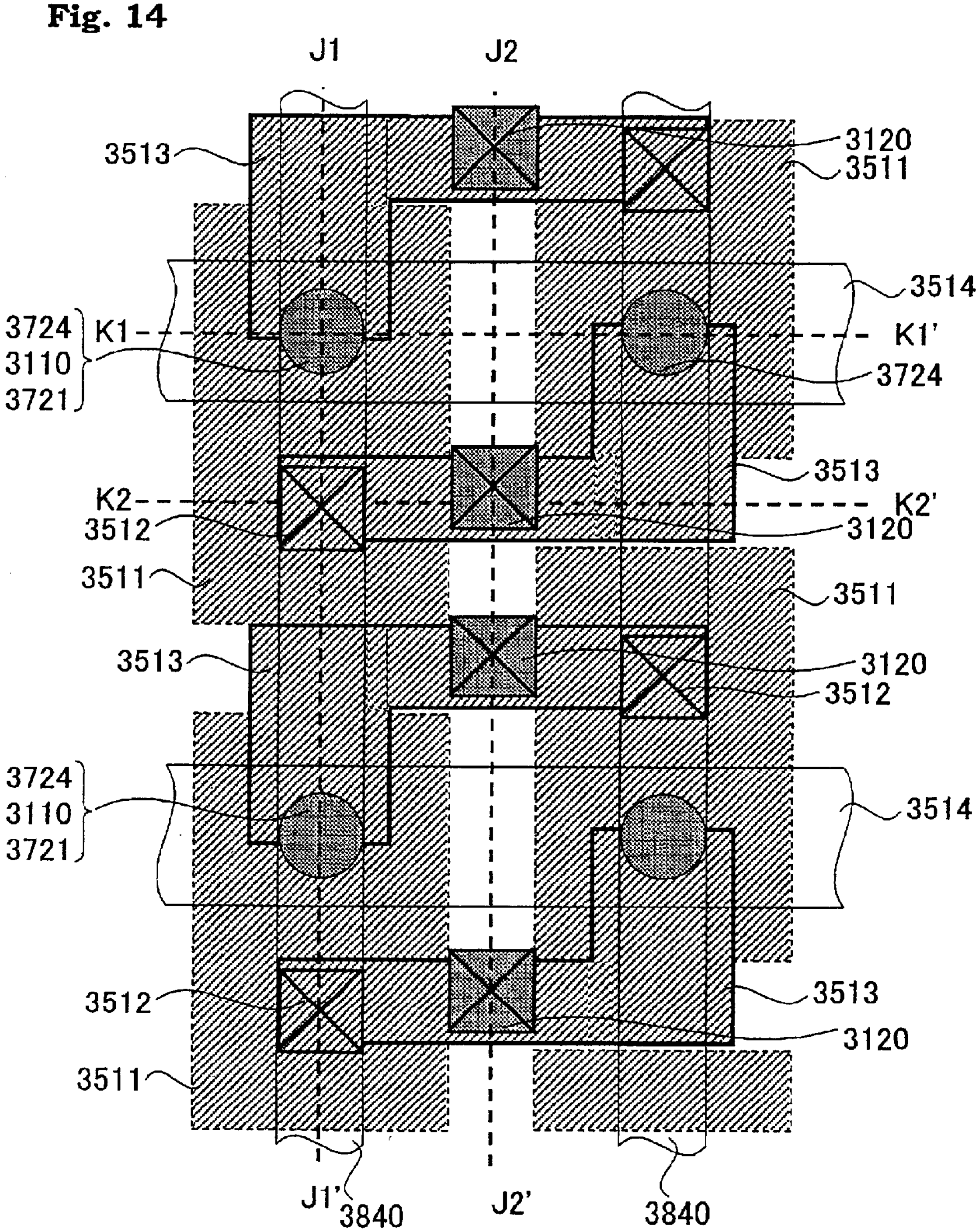
FIG. 14 is a plan view illustrating a memory cell array of SRAM structure having a MIS transistor as a charge storage layer in a semiconductor memory device in accordance with the present invention.

The memory cell array in the semiconductor memory of the present invention is described with reference to plan views shown in FIG. 1 to FIG. 14. FIG. 1 to FIG. 11 are plan views illustrating EEPROM memory cell arrays having floating gates as charge storage layers. FIG. 12 is a plan view illustrating a memory cell array of MONOS structure having laminated insulating films as charge storage layers, FIG. 13 is a plan view illustrating a memory cell array of DRAM structure having MIS capacitors as charge storage layers, and FIG. 14 is a plan view illustrating a memory cell array of SRAM structure having MIS transistors as charge storage layers. Selection gate transistors are not shown in these figures for avoiding complexity. These figures also illustrate layouts of selection gate lines as second or fifth wiring which are gate electrodes for selecting memory cells (referred to as "selection gates" hereinafter), control gates as third wiring, bit lines as fourth wiring and source lines as first wiring.

In FIG. 1, island-like semiconductor layers in a columnar form for constituting memory cells are arranged to be located at intersections where a group of parallel lines and another group of parallel lines cross at right angles. For example, the island-like semiconductor layers are not disposed alternately but aligned in vertical and lateral directions. First, second, third and fourth wiring layers 840 for selecting and controlling the memory cells are disposed in parallel to the surface of the substrate.

By changing intervals between island-like semiconductor layers between an A-A' direction which crosses the fourth wiring layers 840 and a B-B' direction which is parallel to the fourth wiring layers 840, second conductive films which act as the control gates of the memory cells are formed continuously in one direction, in the A-A' direction in FIG. 1, to be the third wiring layers.

Likewise, second conductive films which act as the gates of the selection gate transistors are formed continuously in one direction to be the second wiring layers.

A terminal for electrically connecting with the first wiring layer disposed on a substrate side of island-like semiconductor layers is provided, for example, at an A' side end of a row of memory cells connected in the A-A' direction in FIG. 1, and terminals for electrically connecting with the second and third wiring layers are provided at an A side end of the row of memory cells connected in the A-A' direction in FIG. 1. The fourth wiring layers 840 disposed on a side of the island-like semiconductor layers opposite to the substrate are electrically connected to the island-like semiconductor layers in the columnar form for constituting memory cells. In FIG. 1, the fourth wiring layers 840 are formed in the direction crossing the second and third wiring layers.

The terminals for electrically connecting with the first wiring layers are formed of island-like semiconductor layers, and the terminals for electrically connecting with the second and third wiring layers are formed of second conductive films covering the island-like semiconductor layers, respectively.

The terminals for electrically connecting with the first, second and third wiring layers are connected to first contacts 910, second contacts 921 and 924 and third contacts 932 and 933, respectively.

In FIG. 1, the first wiring layers 810 are lead out onto the top of the semiconductor memory via the first contacts 910.

The arrangement of the island-like semiconductor layers in the columnar form is not particularly limited to that shown in FIG. 1 but may be any arrangement so long as the above-mentioned positional relationship and electric connection between the wiring layers are realized.

For example, the island-like semiconductor layers connected to the first contacts 910 are all located at the A' side ends of the memory cells connected in the A-A' direction in FIG. 1. However, they may be located entirely or partially on the A side ends or may be located at any of the island-like semiconductor layers constituting the memory cells connected in the A-A' direction.

The island-like semiconductor layers covered with the second conductive films connected to the second contacts 921 and 924 and the third contacts 932 and 933 may be located at the ends where the first contacts 910 are not disposed, may be located continuously at the ends where the first contacts 910 are disposed, and may be located at any of the island-like semiconductor layers constituting the memory cells connected in the A-A' direction which crosses the fourth wiring layers 840. The second contacts 921 and 924 and the third contacts 932 may be located at different places.

The width and shape of the first wiring layers 810 and the fourth wiring layers 840 are not particularly limited so long as a desired wiring can be obtained.

In the case where the first wiring layers, which are disposed on the substrate side of the island-like semiconductor layers, are formed in self-alignment with the second and third wiring layers formed of the second conductive films, the island-like semiconductor layers which act as the terminals for electrically connecting with the first wiring layers are electrically insulated from the second and third wiring layers but contact the second and third wiring layers with intervention of insulating films. In FIG. 1, for example, first conductive films are formed partially on the sidewalls of the island-like semiconductor layers connected to the first contacts 910 with intervention of insulating films. The first conductive films are located to face the island-like semiconductor layers for constituting the memory cells. The second conductive films are formed on the sidewalls of the first conductive films with intervention of insulating films. The second conductive films are connected to the second and third wiring layers formed continuously in the A-A' direction. At this time, the shape of the first and the second conductive films is not particularly limited.

The first conductive films on the sidewalls of the island-like semiconductor layers which act as the terminals for electrically connecting with the first wiring layers may be removed by setting the intervals between said island-like semiconductor layers to the first conductive films on the island-like semiconductor layers for constituting the memory cells, for example, to be two or less times larger than the thickness of the second conductive films.

In FIG. 1, the second and third contacts are formed on the second conductive films 521 to 524 which are formed to cover the top of the island-like semiconductor layers. However, the shape of the second and third wiring layers is not particularly limited so long as their connection is realized.

FIG. 1 also shows lines for sectional views to be used for explaining examples of production processes, i.e., line A-A', line B-B', line C-C', line D-D', line E-E' and line F-F'.

Figure 2:
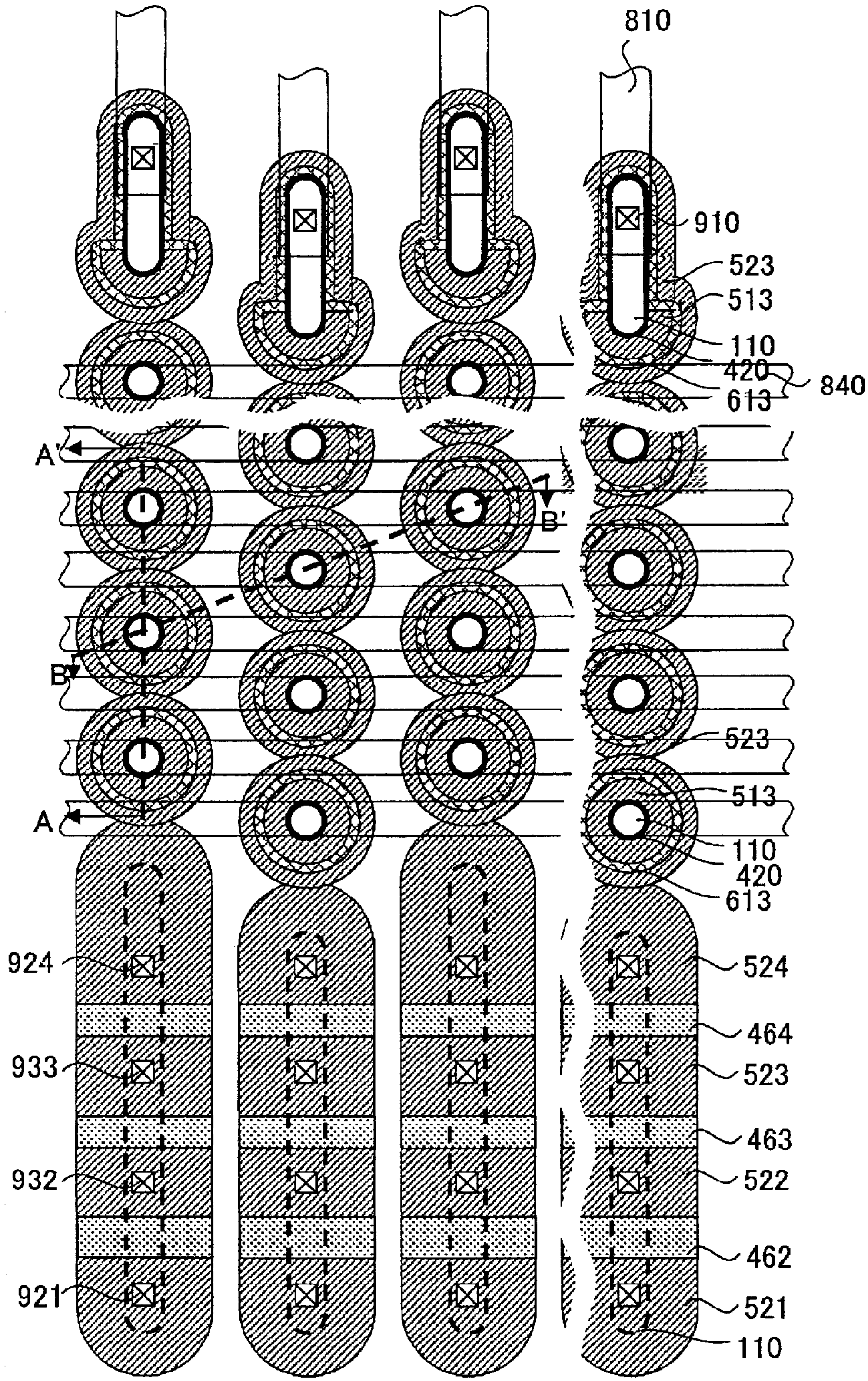

In FIG. 2, island-like semiconductor layers in a columnar form for constituting memory cells are arranged to be located at intersections where a group of parallel lines and another group of parallel lines cross at oblique angles. First, second, third and fourth wiring layers for selecting and controlling the memory cells are disposed in parallel to the surface of the substrate.

By changing intervals between island-like semiconductor layers between an A-A' direction which crosses the fourth wiring layers 840 and a B-B' direction which is parallel to the fourth wiring layers 840, second conductive films which act as the control gates of the memory cells are formed continuously in one direction, in the A-A' direction in FIG. 2, to be the third wiring layers. Likewise, second conductive films which act as the gates of the selection gate transistors are formed continuously in one direction to be the second wiring layers.

A terminal for electrically connecting with the first wiring layer disposed on a substrate side of island-like semiconductor layers is provided, for example, at an A' side end of a row of memory cells connected in the A-A' direction in FIG. 2, and terminals for electrically connecting with the second and third wiring layers are provided at an A side end of the row of memory cells connected in the A-A' direction in FIG. 2. The fourth wiring layers 840 disposed on a side of the island-like semiconductor layers opposite to the substrate are electrically connected to the island-like semiconductor layers in the columnar form for constituting memory cells. In FIG. 2, the fourth wiring layers 840 are formed in the direction crossing the second and third wiring layers.

The terminals for electrically connecting with the first wiring layers are formed of island-like semiconductor layers, and the terminals for electrically connecting with the second and third wiring layers are formed of second conductive films covering the island-like semiconductor layers, respectively.

The terminals for electrically connecting with the first, second and third wiring layers are connected to first contacts 910, second contacts 921 and 924 and third contacts 932 and 933, respectively. In FIG. 2, the first wiring layers 810 are lead out onto the top of the semiconductor memory via the first contacts 910.

The arrangement of the island-like semiconductor layers in the columnar form is not particularly limited to that shown in FIG. 2 but may be any arrangement so long as the above-mentioned positional relationship and electric connection between the wiring layers are realized.

The island-like semiconductor layers connected to the first contacts 910 are all located at the A' side ends of the memory cells connected in the A-A' direction in FIG. 2. However, they may be located entirely or partially on the A side ends or may be located at any of the island-like semiconductor layers constituting the memory cells connected in the A-A' direction. The island-like semiconductor layers covered with the second conductive films connected to the second contacts 921 and 924 and the third contacts 932 and 933 may be located at the ends where the first contacts 910 are not disposed, may be located continuously at the ends where the first contacts 910 are disposed, and may be located at any of the island-like semiconductor layers constituting the memory cells connected in the A-A' direction. The second contacts 921 and 924 and the third contacts 932 may be located at different places.

The width and shape of the first wiring layers 810 and the fourth wiring layers 840 are not particularly limited so long as a desired wiring can be obtained.

In the case where the first wiring layers, which are disposed on the substrate side of the island-like semiconductor layers, are formed in self-alignment with the second and third wiring layers formed of the second conductive films, the island-like semiconductor layers which act as the terminals for electrically connecting with the first wiring layers are electrically insulated from the second and third wiring layers but contact the second and third wiring layers with intervention of insulating films.

In FIG. 2, for example, first conductive films are formed partially on the sidewalls of the island-like semiconductor layers connected to the first contacts 910 with intervention of insulating films. The first conductive films are located to face the island-like semiconductor layers for constituting the memory cells. The second conductive films are formed on the sidewalls of the first conductive films with intervention of insulating films. The second conductive films are connected to the second and third wiring layers formed continuously in the A-A' direction. At this time, the shape of the first and the second conductive films is not particularly limited. The first conductive films on the sidewalls of the island-like semiconductor layers which act as the terminals for electrically connecting with the first wiring layers may be removed by setting the intervals between said island-like semiconductor layers to the first conductive films on the island-like semiconductor layers for constituting the memory cells, for example, to be two or less times larger than the thickness of the second conductive films.

In FIG. 2, the second and third contacts are formed on the second conductive films 2521 to 2524 which are formed to cover the top of the island-like semiconductor layers. However, the shape of the second and third wiring layers is not particularly limited so long as their connection is realized.

FIG. 2 also shows lines for sectional views to be used for explaining examples of production processes, i.e., line A-A' and line B-B'.

Figure 3:
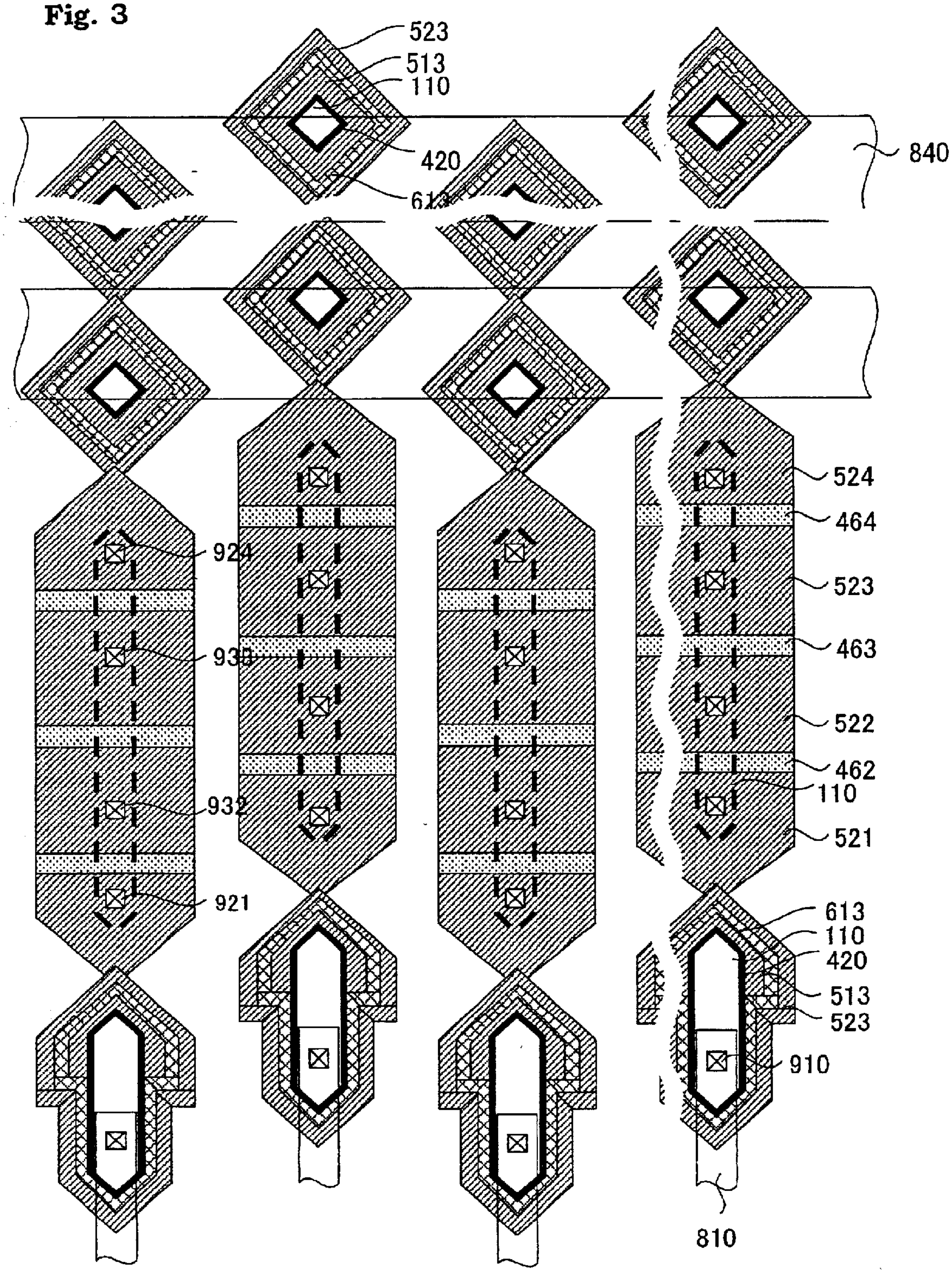
Figure 4:
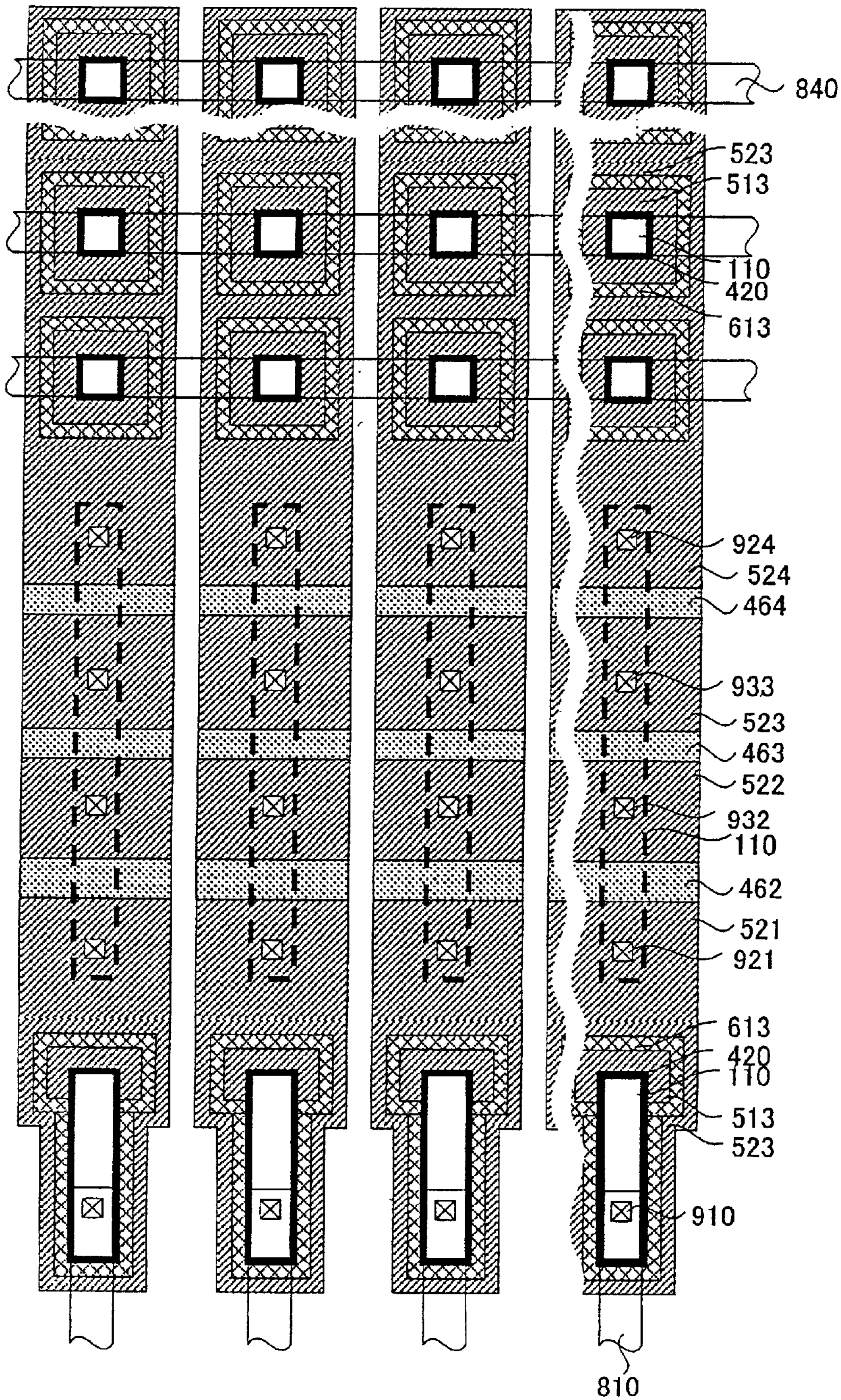

In FIG. 3 and FIG. 4, in contrast to FIG. 1 and FIG. 2, island-like semiconductor layers having a square cross section are differently oriented. The cross section of the island-like semiconductor layers is not particularly limited to circular or square but may be elliptic, hexagonal or octagonal, for example. However, if the island-like semiconductor layers have a dimension close to the minimum photoetching dimension, the island-like semiconductor layers, even if they are designed to have corners like square, hexagon or octagon, may be rounded by photolithography and etching, so that the island-like semiconductor layers may have a cross section near to circle or ellipse.

Figure 5:
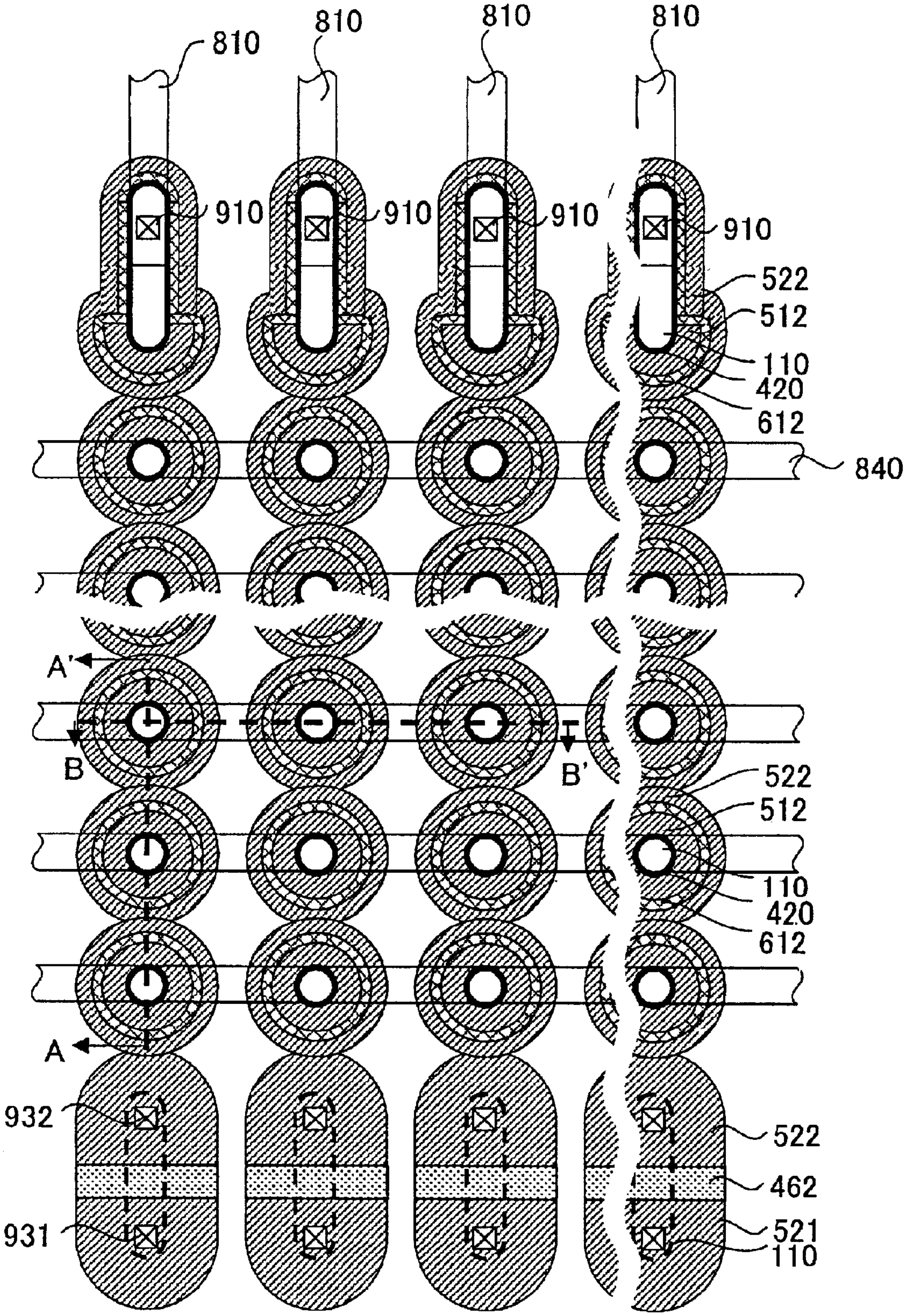

In FIG. 5, in contrast to FIG. 1, two memory cells are formed in series on an island-like semiconductor layer for constituting memory cells and the selection gate transistor is not formed. FIG. 5 also shows lines for sectional views, i.e., line A-A' and line B-B' to be used for explaining examples of production processes.

Figure 6:
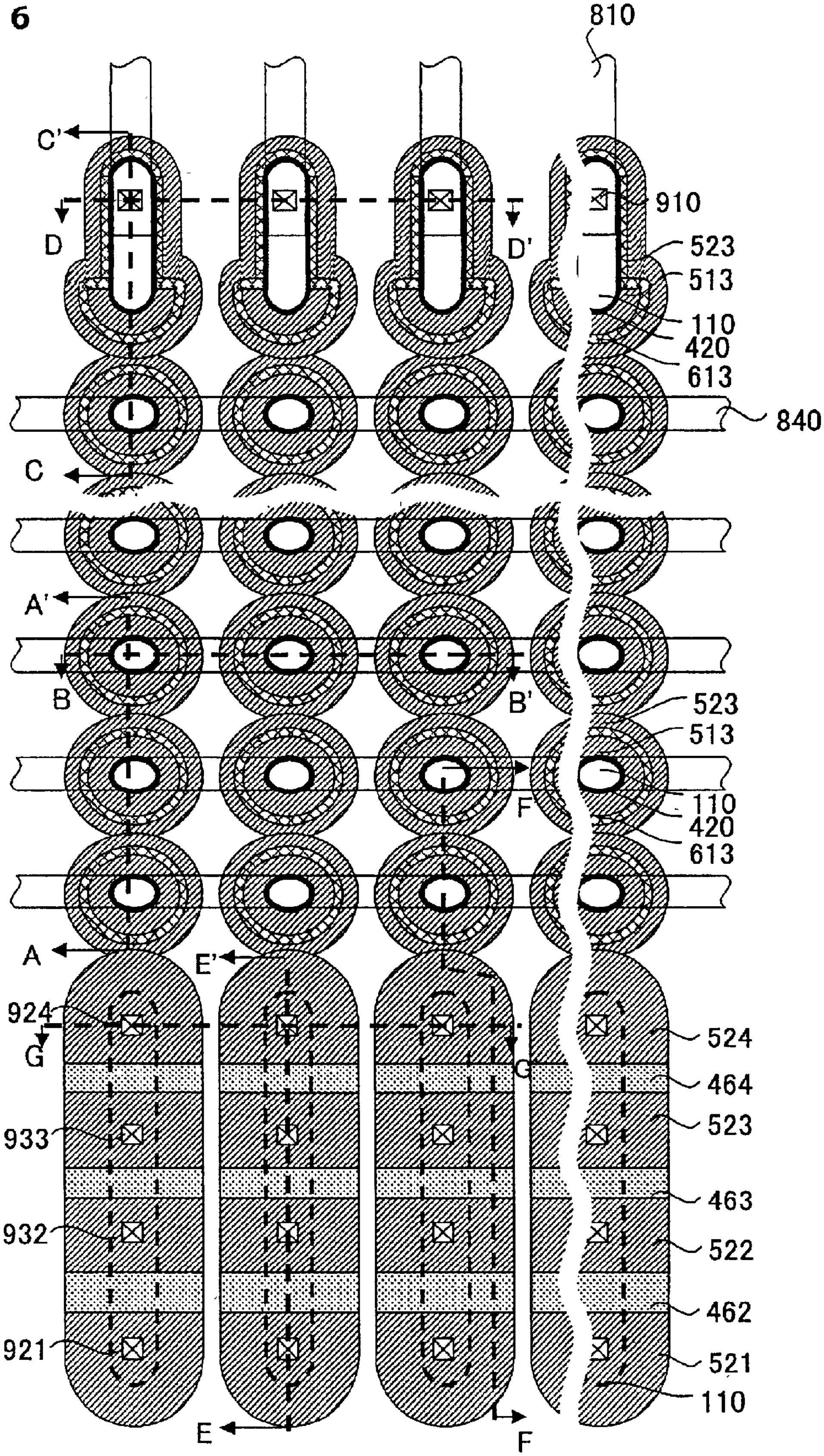
Figure 7:
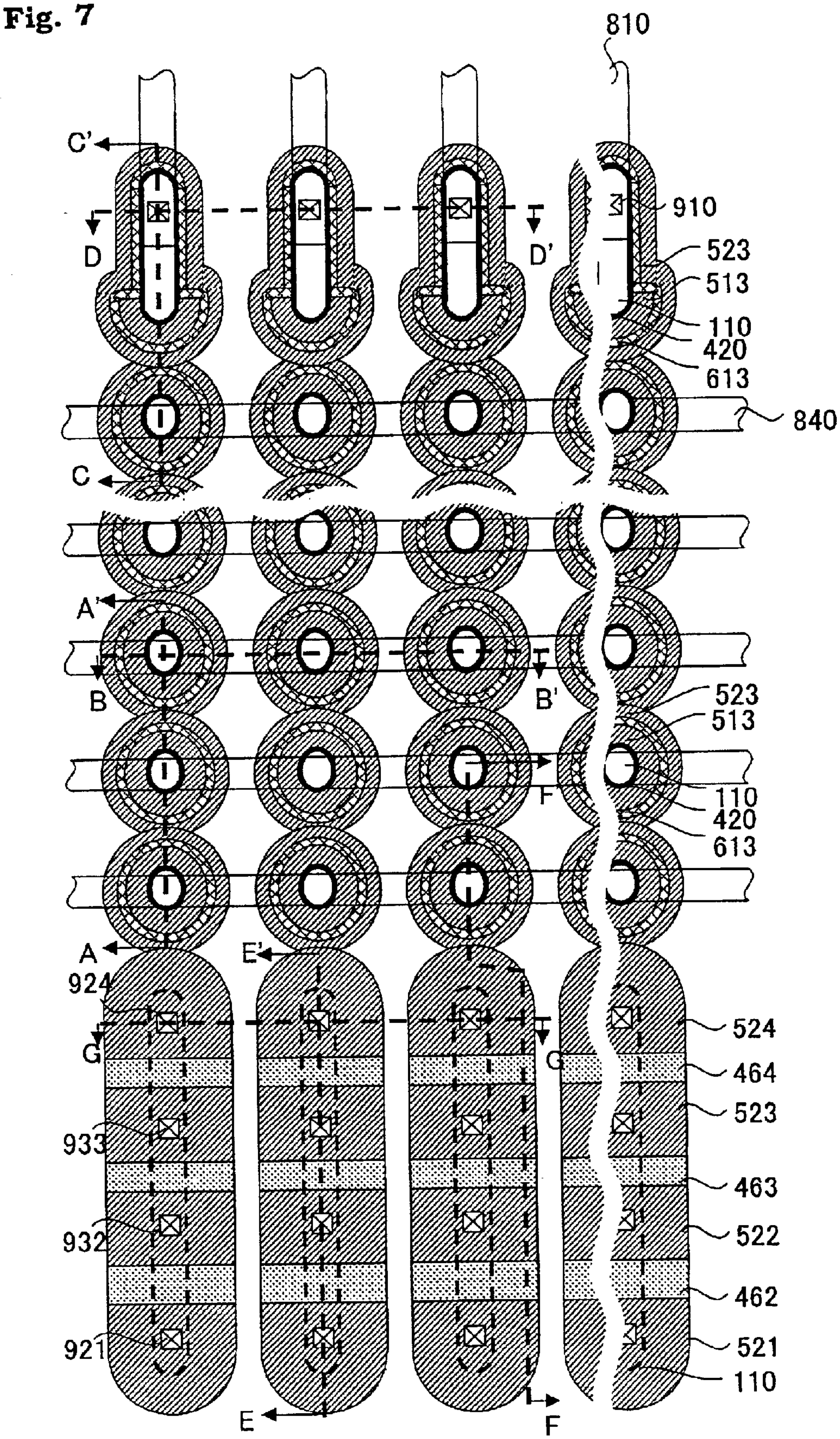

In FIG. 6 and FIG. 7, in contrast to FIG. 1, the island-like semiconductor layers for constituting the memory cells have an elliptic cross section, and the major axis of the ellipse is in the B-B' direction and the A-A' direction, respectively. The major axis may be not only in the A-A' or B-B' direction but in any direction.

Figure 8:
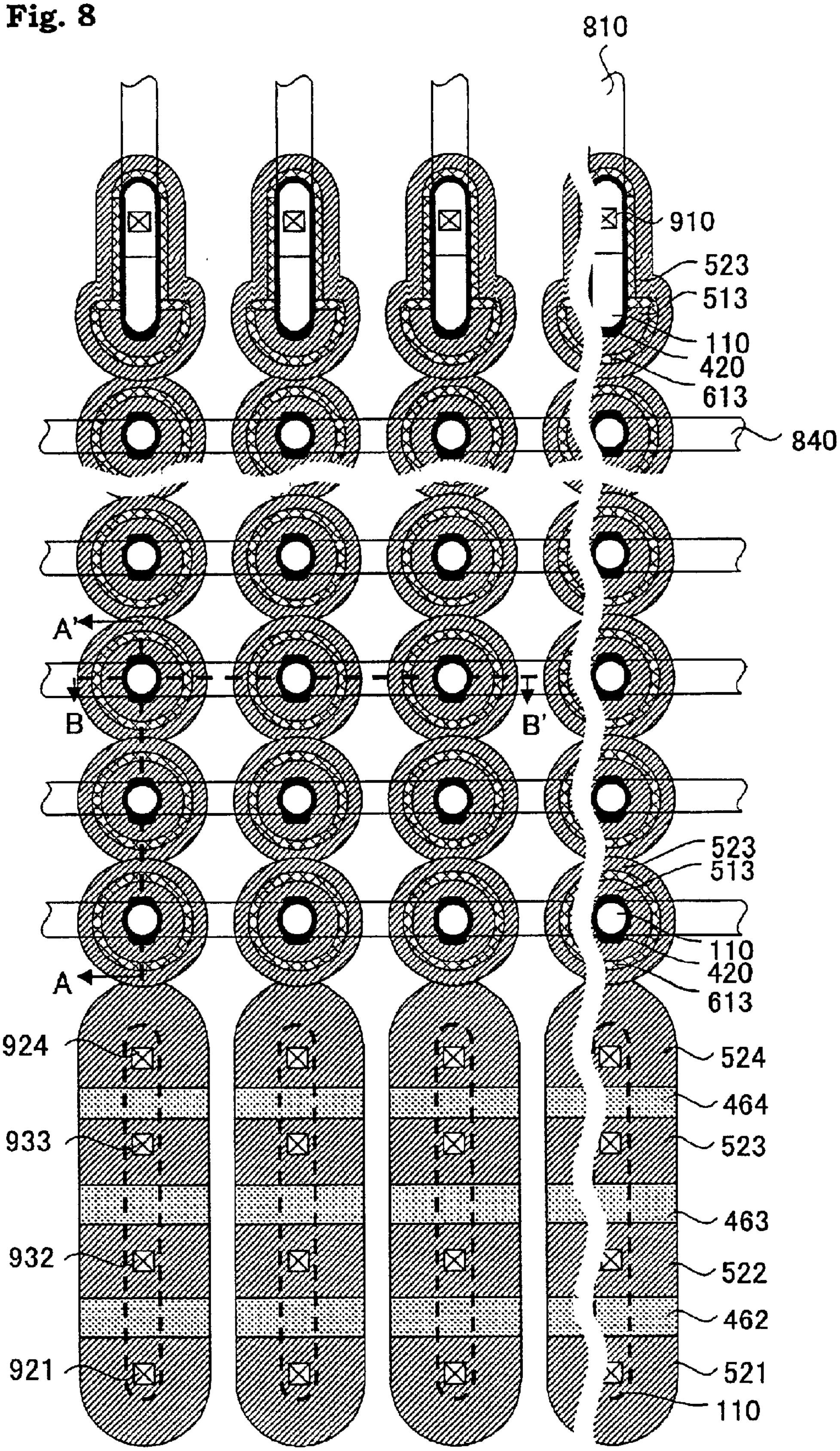

In FIG. 8, in contrast to FIG. 1, a thickness of a silicon oxide film 420, which is a third insulating film formed on the sidewall of the island-like semiconductor layer 110, is not set to be uniform in a direction parallel to the semiconductor substrate, but increased only in a portion at the A-A' side. In this case, a portion at the B-B' side of the silicon oxide film 420 whose thickness is small is effectively used as a tunnel oxide film. Thereby the ratio of the capacity between the floating gates and the control gates increases to the capacity between the floating gates and the island-like semiconductor layers.

Figure 9:
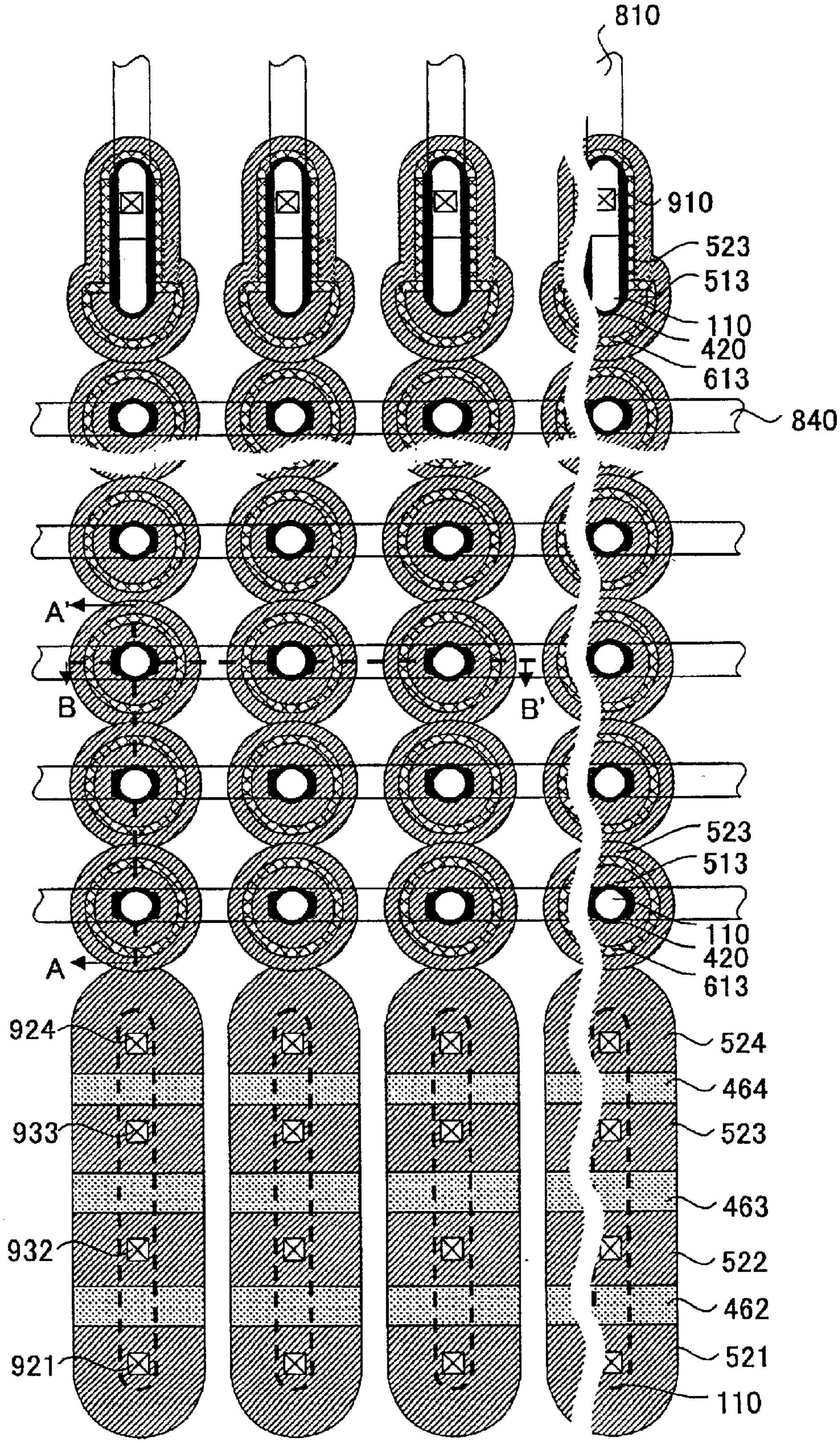

In FIG. 9, in contrast to FIG. 1, a thickness of a silicon oxide film 420, which is a third insulating film formed on the sidewall of the island-like semiconductor layer 110, is not set to be uniform in a direction parallel to the semiconductor substrate, but increased only in a portion at the B-B' side. In this case, a portion at the A-A' side of the silicon oxide film 420 whose thickness is small is effectively used as a tunnel oxide film. Thereby the ratio of the capacity between the floating gates and the control gates increases to the capacity between the floating gates and the island-like semiconductor layers.

Figure 10:
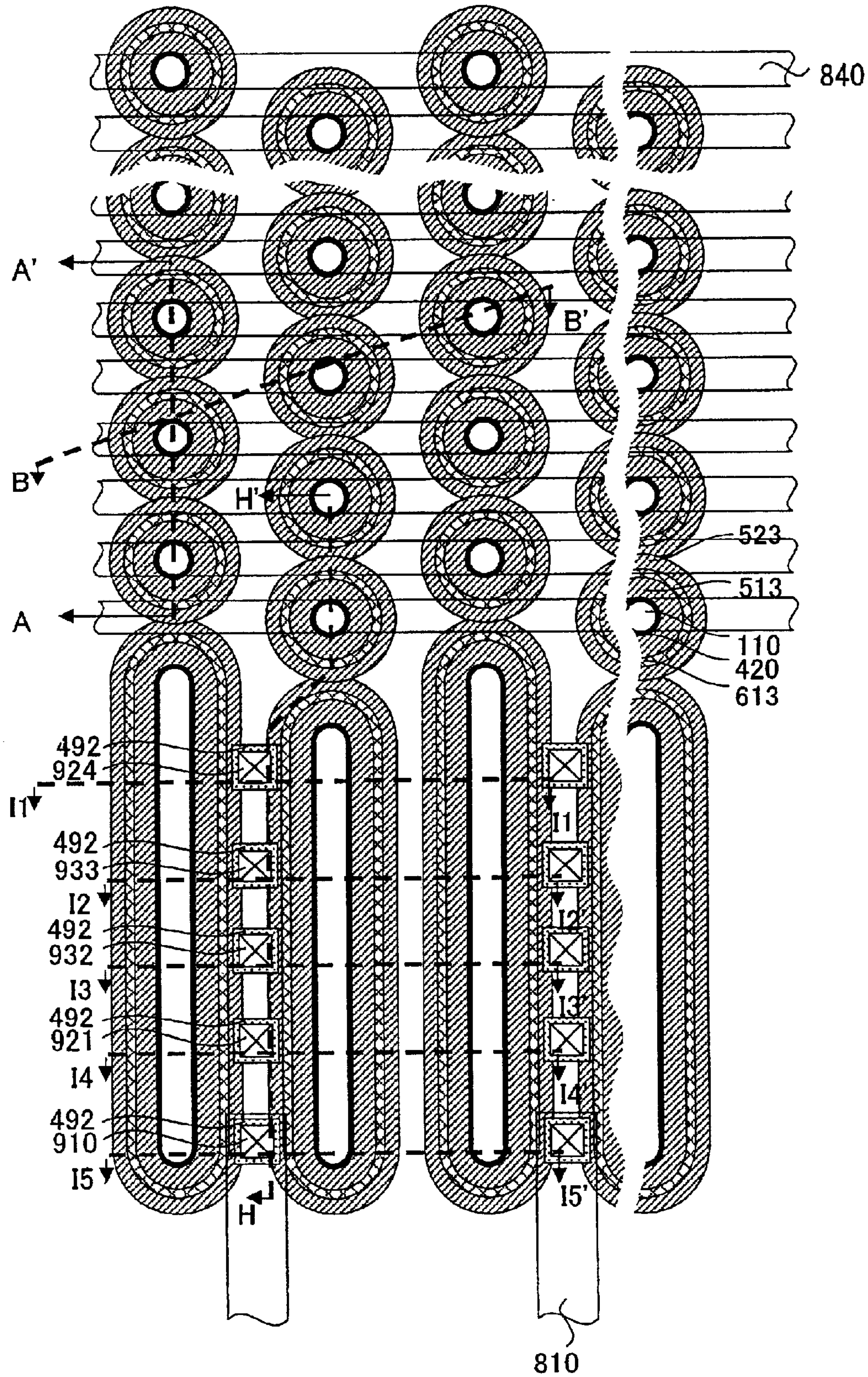

In FIG. 10, in contrast to FIG. 2, (a) wiring layer(s) and (an) insulating film(s) above a desired wiring layer are removed by anisotropic etching and contacts are formed in the desired layer. Common contacts are formed for lead-out portions of adjacent second wiring layers and those of adjacent third wiring layers. For example, in FIG. 10, contacts are formed in a desired wiring layer commonly to the memory cells continuous in a row in the H-H' direction and the memory cells continuous in an adjacent row in the H-H' direction. For operating one of adjacent memory cells, a desired potential is given to every two fourth diffusion layers 2840 to select the memory cell. In contrast to FIG. 10, contacts may be formed in desired wiring layers for the respective memory cells continuous in the H-H' direction instead of providing common contacts in the desired wiring layer to the memory cells in adjacent rows in the H-H' direction. FIG. 10 also shows lines for sectional views, i.e., line H-H', line I1-I1' to line I5-I5', to be used for explaining examples of production processes.

Figure 11:
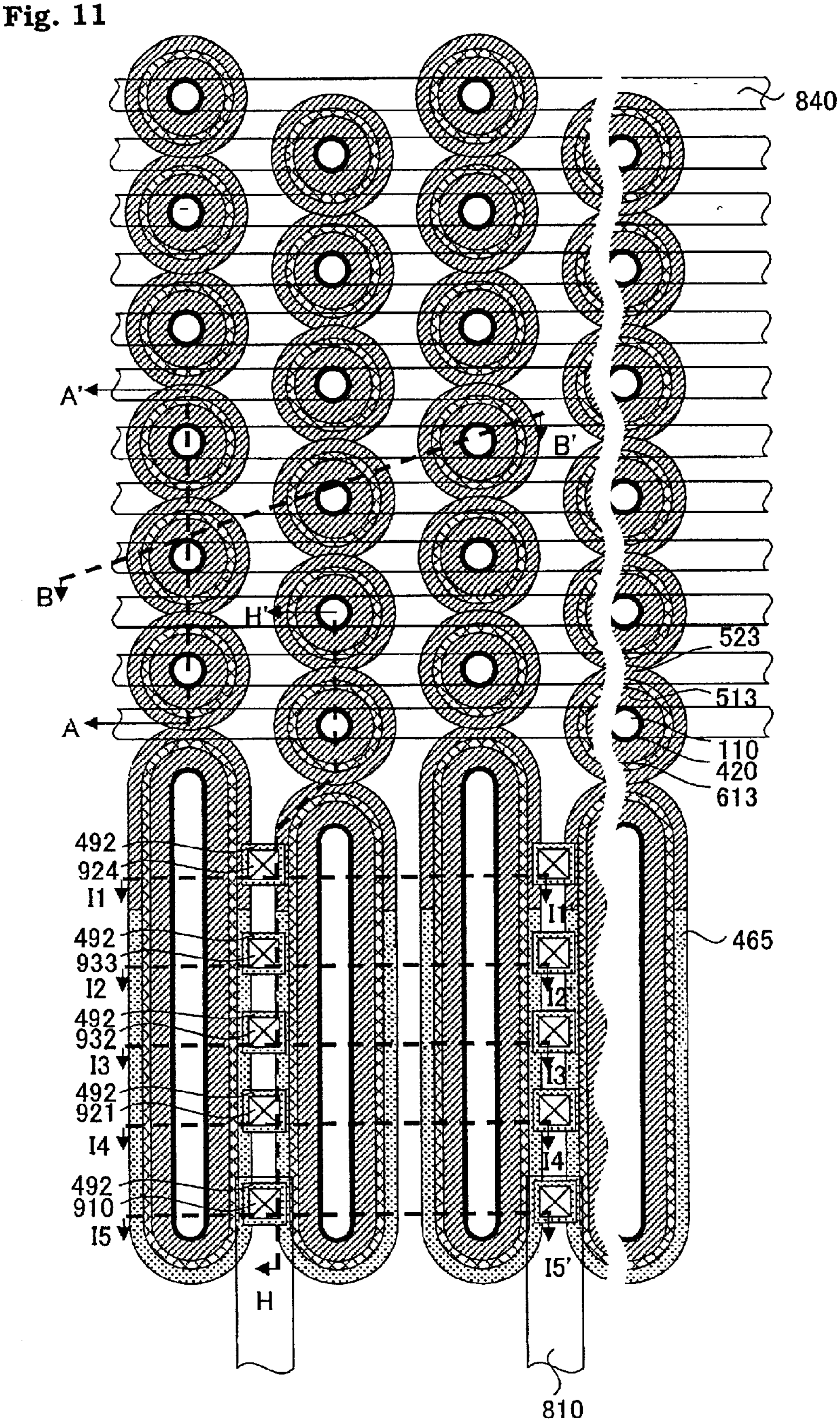

In FIG. 11, in contrast to FIG. 1, the polysilicon films (the second conductive films) 2521 to 2524 are in the form of steps in contact regions where contacts are provided. (An) insulating film(s) and the like above a desired wiring layer is/are removed by anisotropic etching, and the contacts are formed in the desired wiring layer. Common contacts are formed for adjacent second wiring layers and adjacent third wiring layers, or separate contacts may be formed for the respective wiring layers. FIG. 11 also shows lines for sectional views, i.e., line H-H', line I1-I1' to line I5-I5', to be used for explaining examples of production processes.

The above-described arrangements and structures of FIGS. 1 to 11 may be combined in any way.

In FIG. 12, in contrast to FIG. 1, there is shown an example in which laminated insulating films are used as the charge storage layers as in the MONOS structure. The example of FIG. 12 is the same as the example of FIG. 1, except that the charge storage layers are changed from the floating gates to the laminated insulating films. FIG. 12 also shows lines for sectional views, i.e., line A-A' and line B-B', to be used for explaining examples of production processes.

In FIG. 13, in contrast to FIG. 1, there is shown an example in which MIS capacitors are used as the charge storage layers as in the DRAM structure. The example of FIG. 13 is the same as the example of FIG. 1, except that the charge storage layers are changed from the floating gates to the MIS capacitors and the bit lines are in parallel to the source lines. FIG. 13 also shows lines for sectional views, i.e., line A-A' and line B-B', to be used for explaining examples of production processes.

In FIG. 14, there is shown an example in which MIS transistors are used as the charge storage layers as in the SRAM structure. FIG. 14 shows a memory cell array in which island-like semiconductor layers in a columnar form for constituting memory cells are arranged to be located at points of intersection where a group of parallel lines and another group of parallel lines cross at right angles. First wiring layers of impurity diffusion layers 3721 for selecting and controlling the memory cells, third wiring layers of control gates 3514 and fourth wiring layers as bit lines are disposed in parallel to the surface of the substrate. Second wiring layers 3840 of second conductive films 3512 and third conductive films 3513 are arranged in two directions, i.e., in the directions vertical and horizontal to the surface of the substrate. The shape of the second, third and fourth wiring layers is not particularly limited so long as they are connected respectively. FIG. 14 also shows lines for sectional views, i.e., line J1-J1', line J2-J2', line K1-K1' and line K2-K2', to be used for explaining examples of production processes. In FIG. 14, are not shown first wiring layers 3710, first wiring layers 3850 and terminals for connecting with these wiring layers for avoiding complexity. For easy distinction of the island-like semiconductor layers 3110 from the wiring layers, the island-like semiconductor layers are shown in a circular form, but this is not limitative.

Embodiments of Memory Cell Arrays as Shown in Sectional Views

FIG. 15 to FIG. 42 show sectional views of memory cell arrays of EEPROMs which are semiconductor memories having floating gates as charge storage layers. Of FIG. 15 to FIG. 42, odd-numbered figures show sectional views taken on line A-A' in FIG. 1 and even-numbered figures show sectional views taken on line B-B' in FIG. 1.

In these semiconductor memories, a plurality of island-like pillar-form semiconductor layers 110 are formed in matrix on a P-type silicon substrate 100. Transistors having a second or fifth electrode as a selection gate are disposed in an upper part and in a lower part of each island-like semiconductor layer 110. Between these selection gate transistors, a plurality of memory transistors, e.g., two memory transistors, are disposed. The transistors are connected in series along each island-like semiconductor layer. More particularly, a silicon oxide film 460 having a predetermined thickness is formed as an eighth insulating film at the bottom of trenches between the island-like semiconductor layers. A selection gate 500 is formed on a sidewall of the island-like semiconductor layer with intervention of a gate insulating film, so as to surround the island-like semiconductor layer. Thus a selection gate transistor is formed.

A floating gate 510 is disposed on the sidewall of the island-like semiconductor layer above the selection gate transistor with intervention of a silicon oxide film 420 which is a third insulating film to be a tunnel oxide film, so as to surround the island-like semiconductor layer 110. Outside the floating gate 510, a control gate 520 is formed with intervention of an interlayer insulating film 610 of a multi-layered film. Thus a memory transistor is formed.

A plurality of memory transistors are formed in the same manner, and above them, is formed a selection transistor having the fifth electrode 500 as the selection gate in the same manner as described above.

Figure 16:
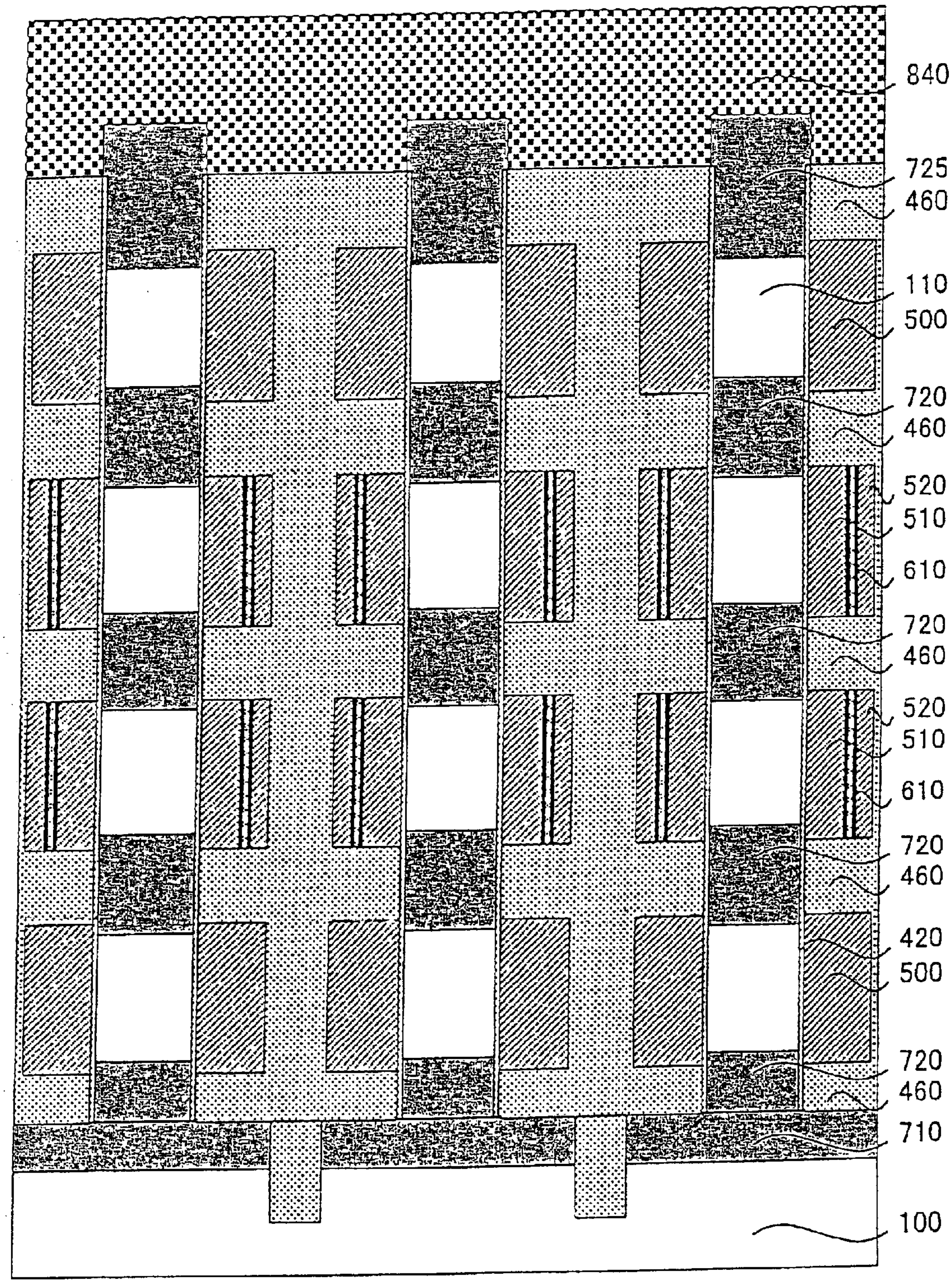

As shown in FIG. 1 and FIG. 16, the selection gate 500 and the control gate 520 are provided continuously along a plurality of transistors in one direction to form a selection gate line which is a second or fifth wiring and a control gate line which is a third wiring.

A source diffusion layer 710 is formed on the surface of the semiconductor substrate so that the active regions of memory cells are in a floating state with respect to the semiconductor substrate. Further, diffusion layers 720 are formed so that the active region of each memory cell is in the floating state. Drain diffusion layers 725 for the memory cells are formed on the tops of the respective island-like semiconductor layers 110.

Oxide films 460 are formed as eighth insulating films between the thus arranged memory cells in such a manner that the tops of the drain diffusion layers 725 are exposed. Al wirings 840 are provided as bit lines to connect drain diffusion layers 725 for memory cells in a direction crossing the control gate lines. Preferably Al wirings 840 are arranged without mis-alignment.

Preferably, the diffusion layers 720 have an impurity concentration distribution such that the impurity concentration gradually decreases from the surface of the island-like semiconductor layers 110 to the inside thereof rather than a uniform impurity concentration distribution. Such an impurity concentration distribution may be obtained, for example, by a thermal diffusion process after an impurity is introduced into the island-like semiconductor layers 110. Thereby, the junction breakdown voltage between the diffusion layers 720 and the island-like semiconductor layers 110 improves and the parasitic capacity decreases. It is also preferably that the source diffusion layer 710 have an impurity concentration distribution such that the impurity concentration gradually decreases from the surface of the semiconductor substrate 100 to the inside thereof. Thereby, the junction breakdown voltage between the source diffusion layer 710 and the semiconductor substrate 100 improves and the parasitic capacity decreases in the first wiring layer.

Figure 15:
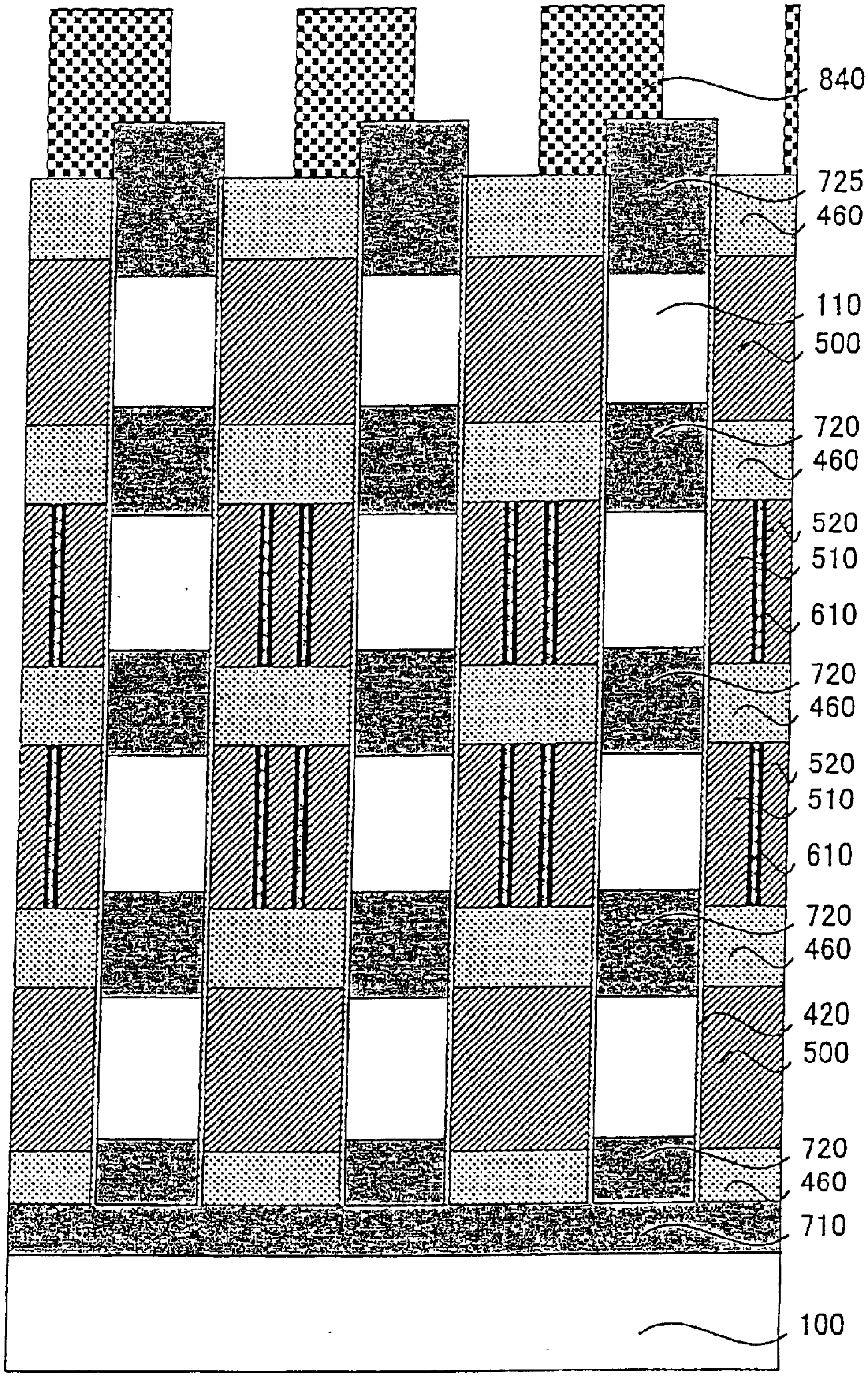
FIGS. 15 to 42 are sectional views of various semiconductor memory devices having floating gates as charge storage layers in accordance with the present invention, the sectional views corresponding to those taken on line A-A' and line B-B' in FIG. 1.

FIG. 15 and FIG. 16 show an example in which the thickness of the gate insulating film of the selection gate transistors is equal to that of the gate insulating film of the memory transistors.

Figure 17:
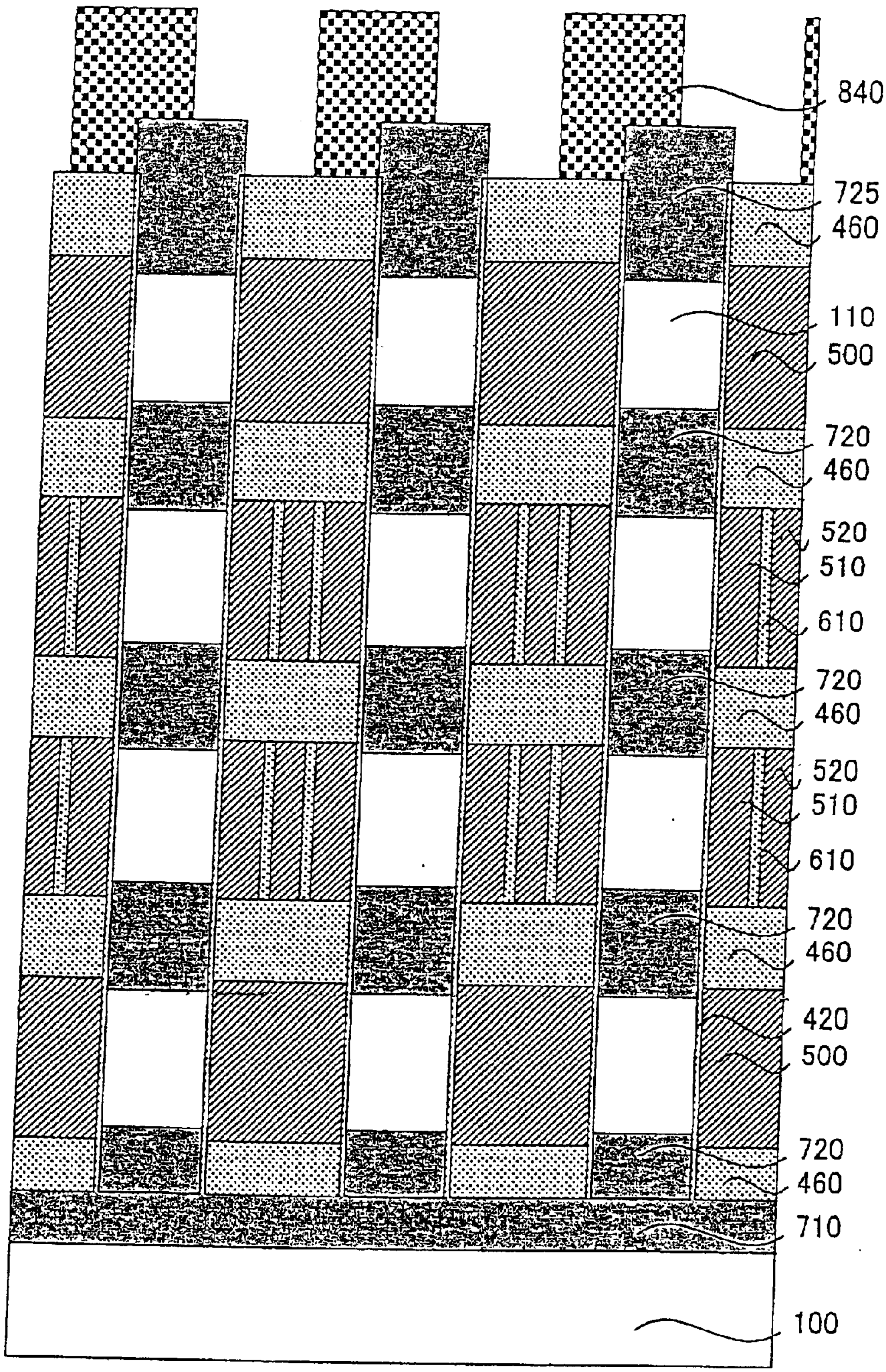
Figure 18:
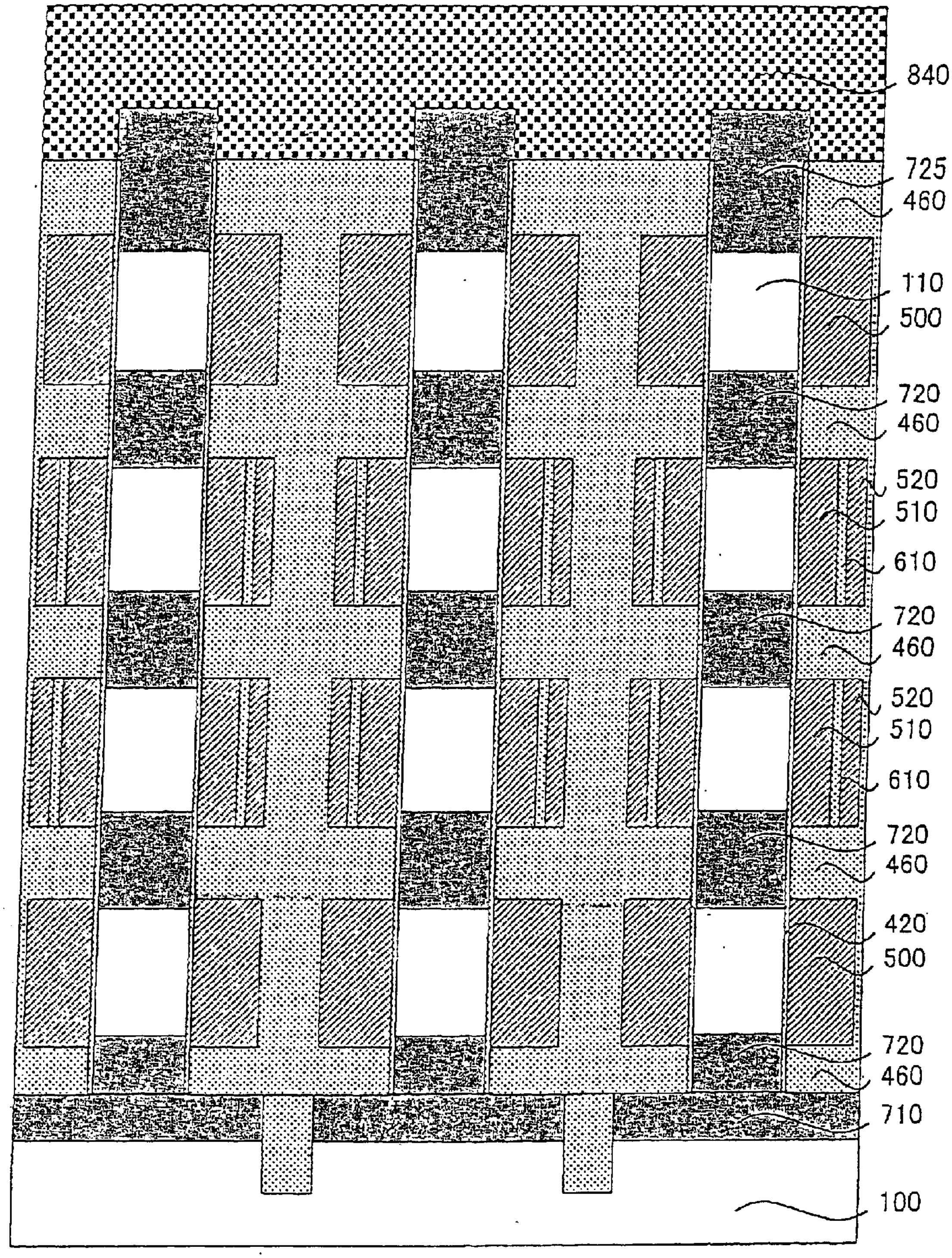

In an example shown in FIG. 17 and FIG. 18, in contrast to FIG. 15 and FIG. 16, the interlayer insulating film 610 is formed of a single layer film.

Figure 19:
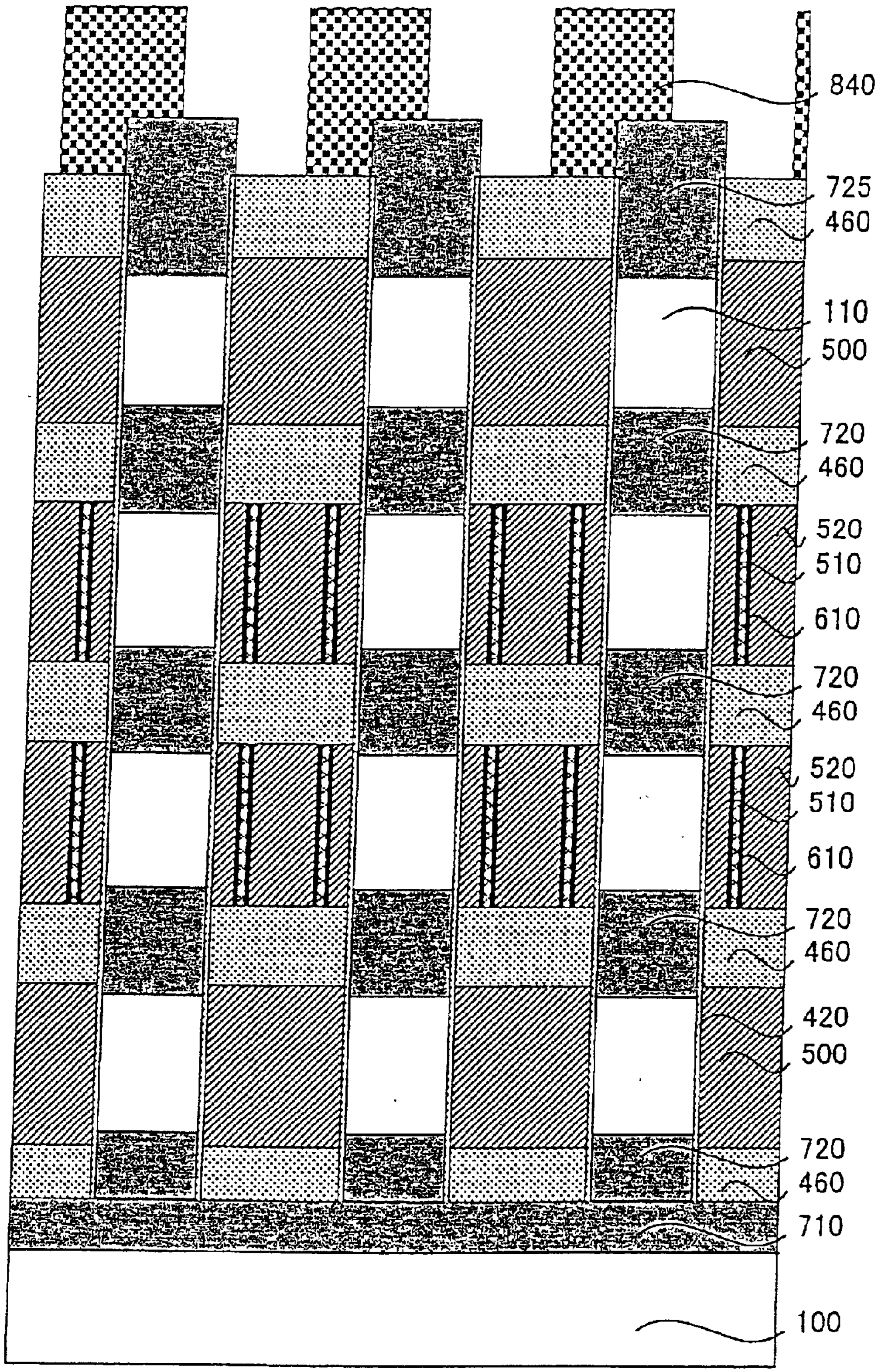
Figure 20:
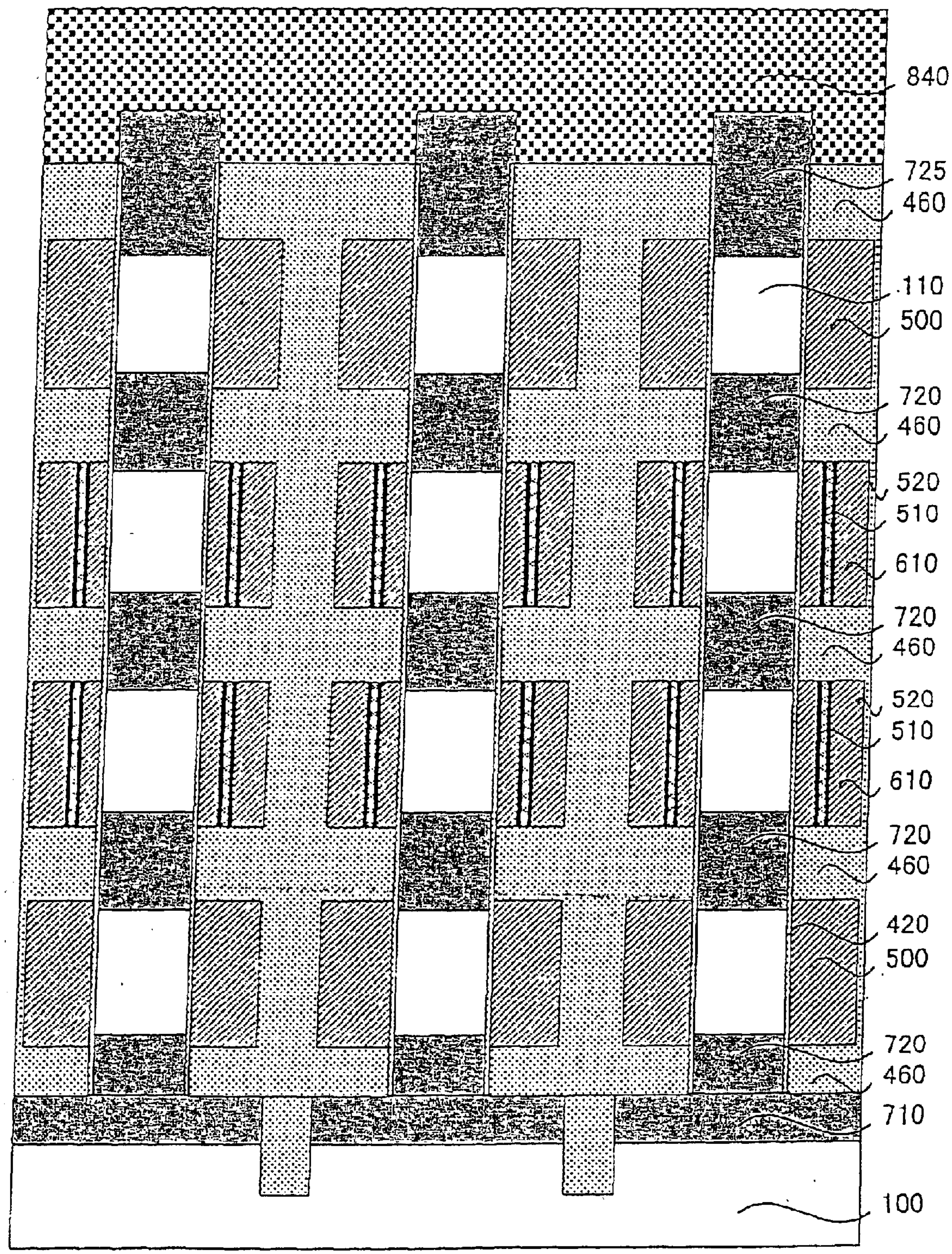

In an example shown in FIG. 19 and FIG. 20, in contrast to FIG. 15 and FIG. 16, in the memory cell, the thickness of the control gate 520 is larger than the thickness of the floating gate 510 so that the resistance of the third wiring layer can be easily reduced.

Figure 21:
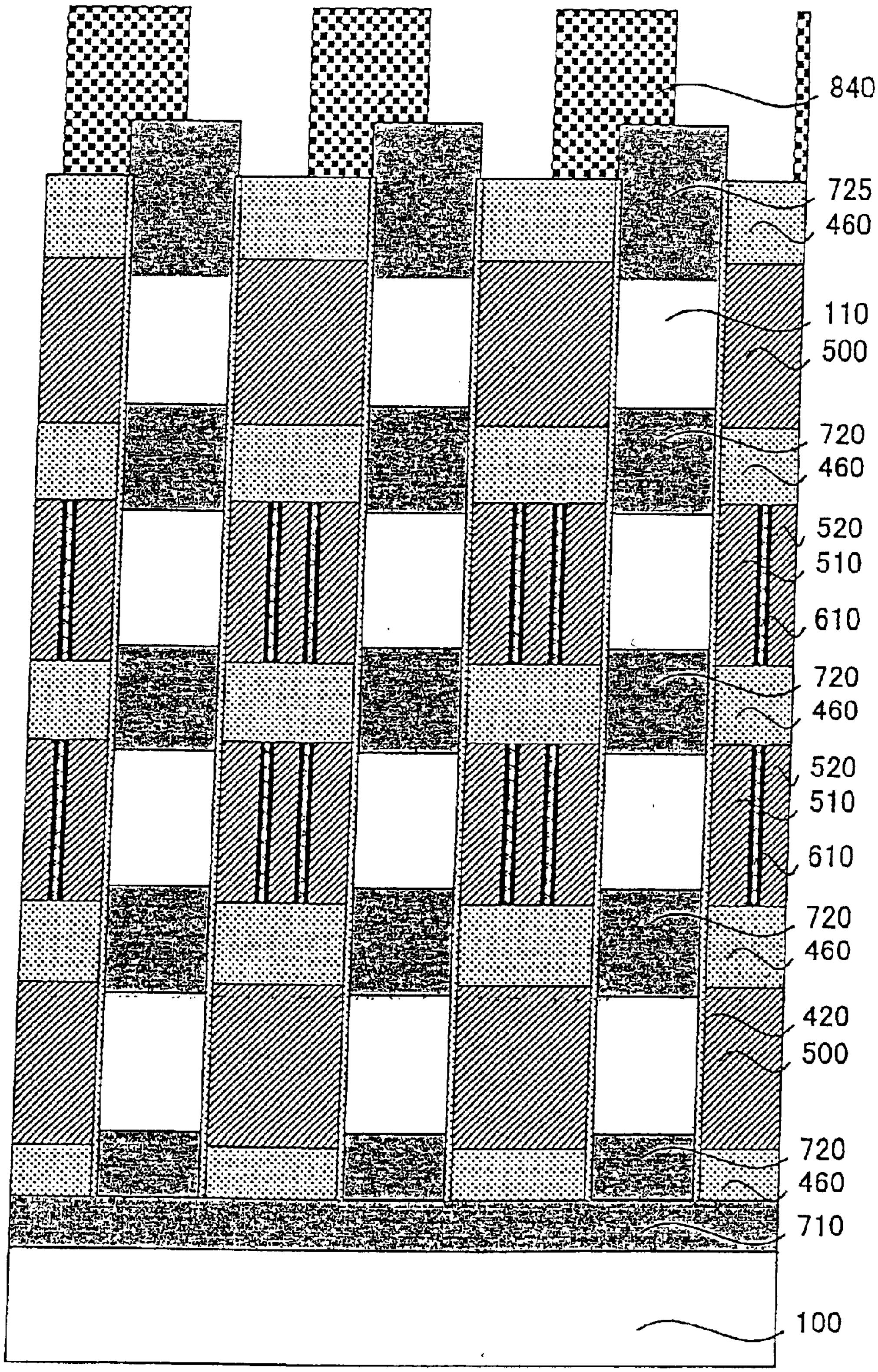
Figure 22:
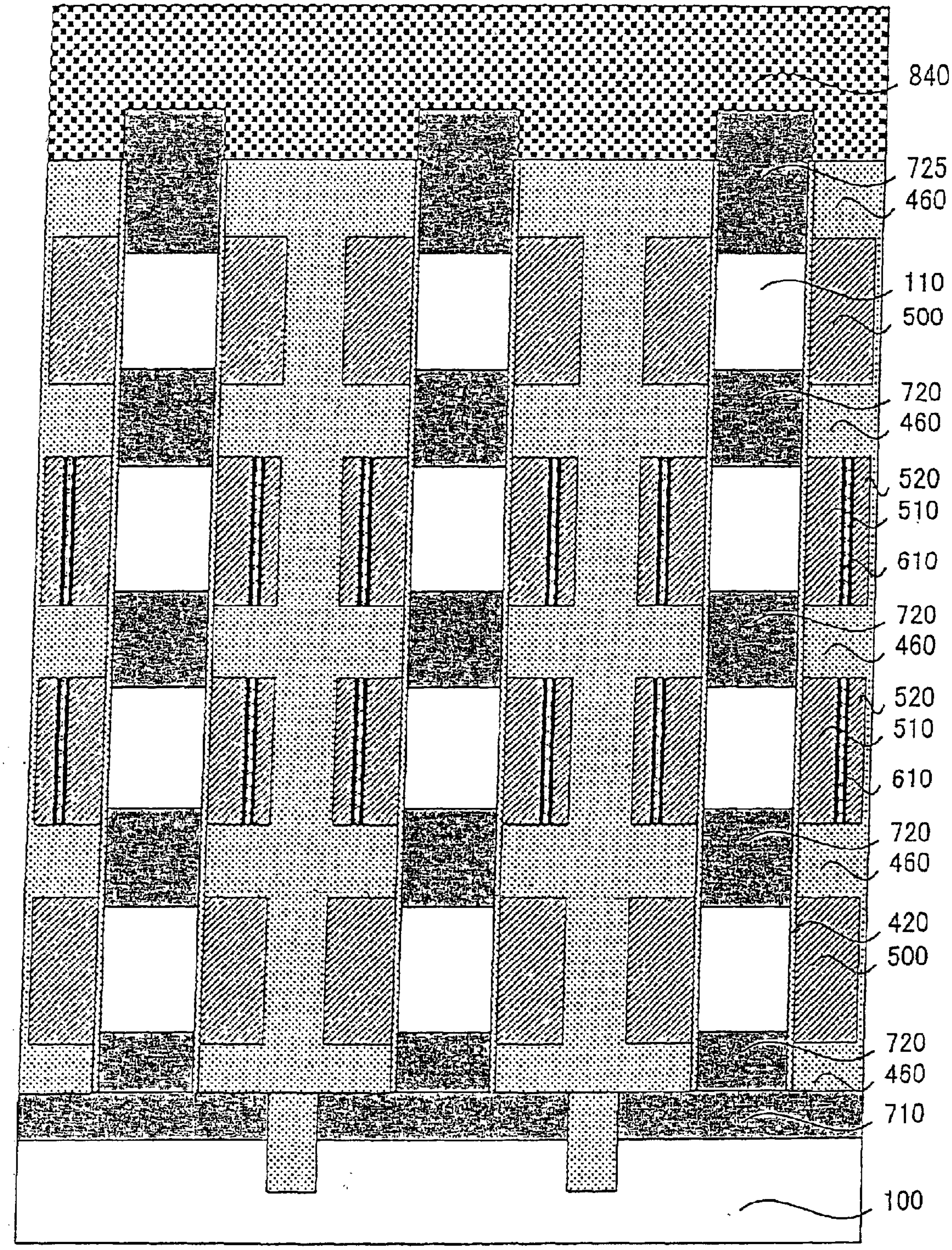

In an example shown in FIG. 21 and FIG. 22, in contrast to FIG. 15 and FIG. 16, the surface of the silicon oxide film (the third insulating film) 420 is positioned outside the periphery of the island-like semiconductor layer 110.

Figure 23:
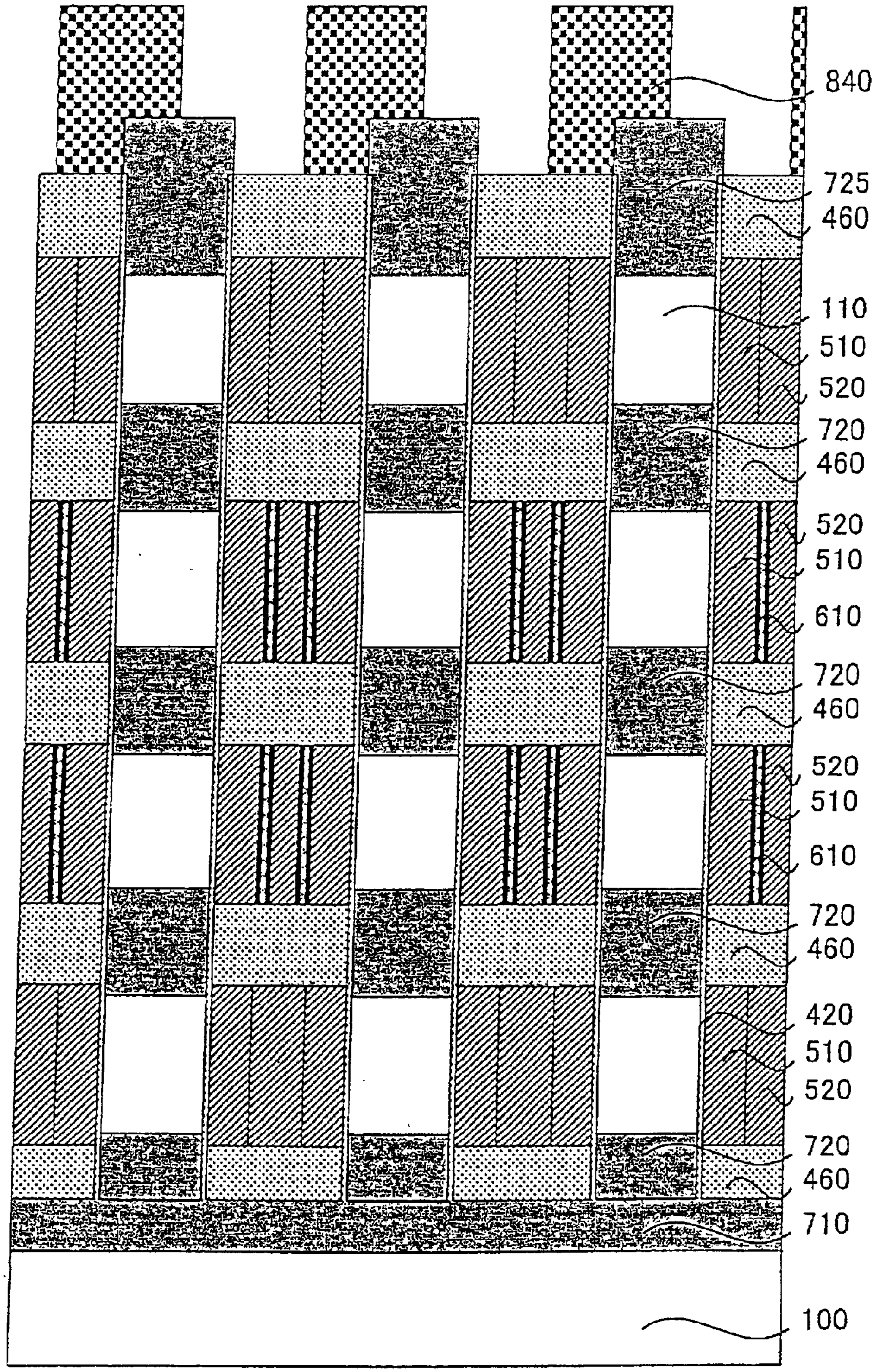
Figure 24:
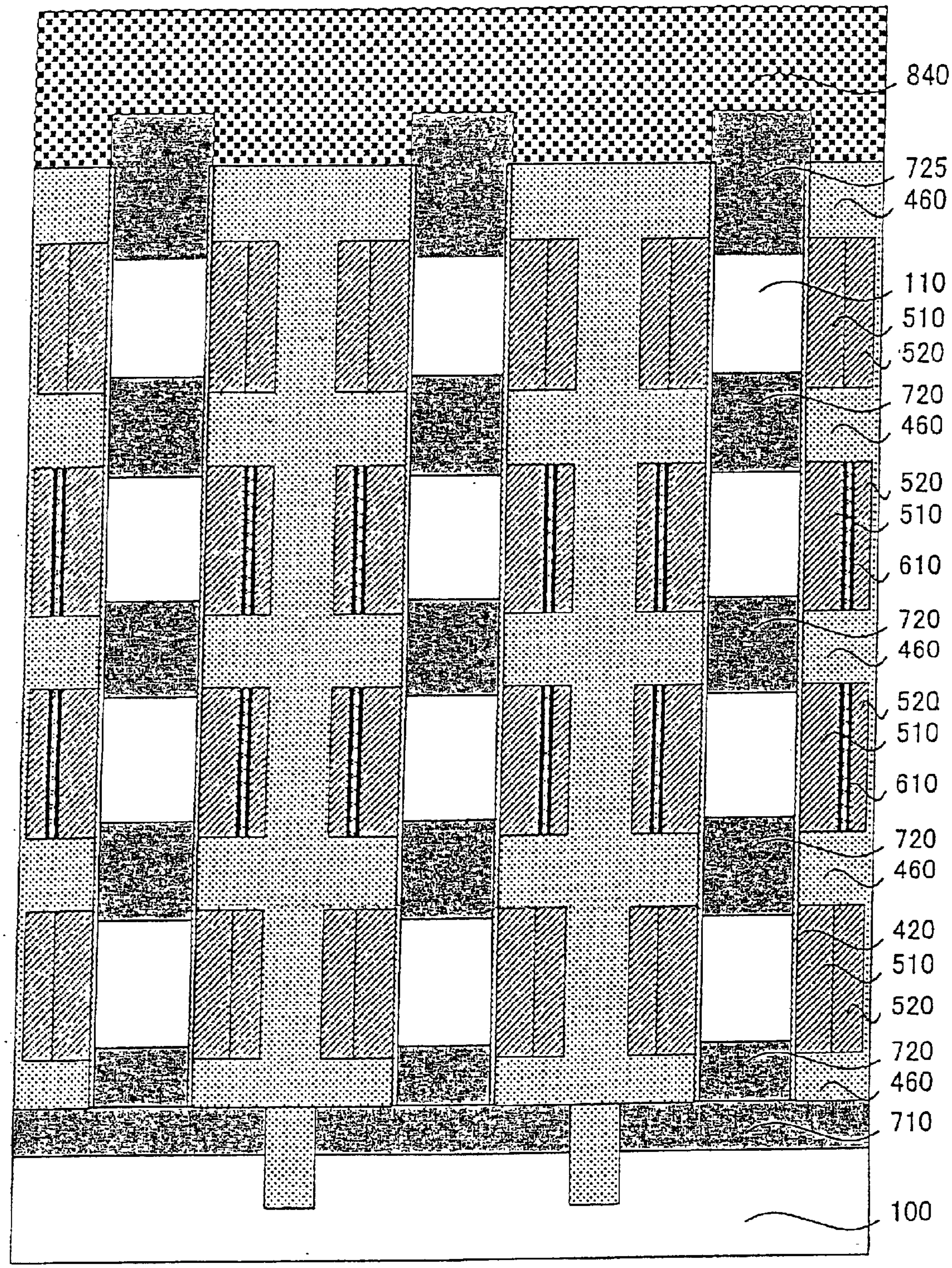

In an example shown in FIG. 23 and FIG. 24, in contrast to FIG. 15 and FIG. 16, the gate of the selection gate transistor is formed not by a single deposition of a conductive film but by a plurality of, i.e., two, depositions of the conductive film.

Figure 25:
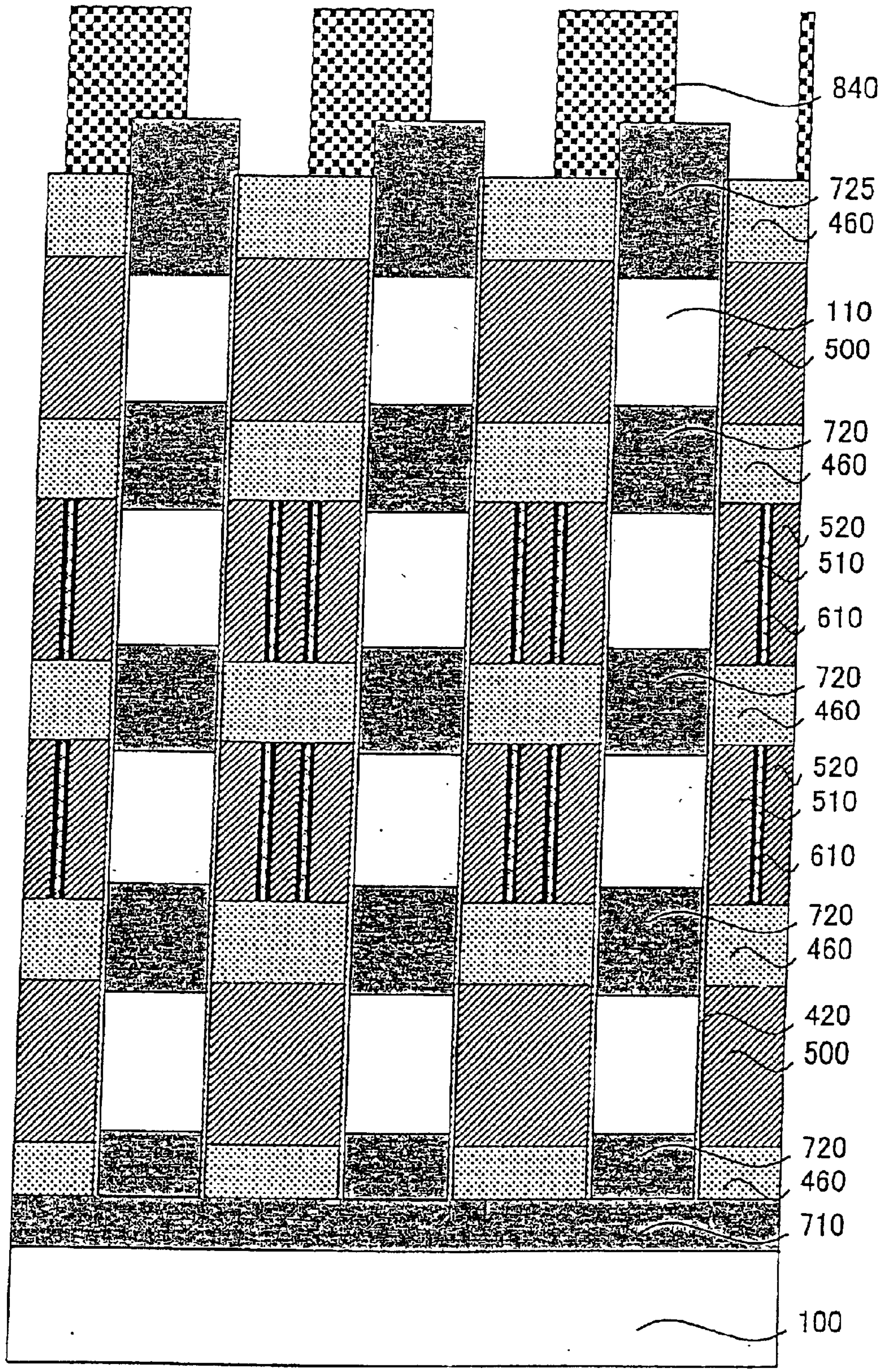
Figure 26:
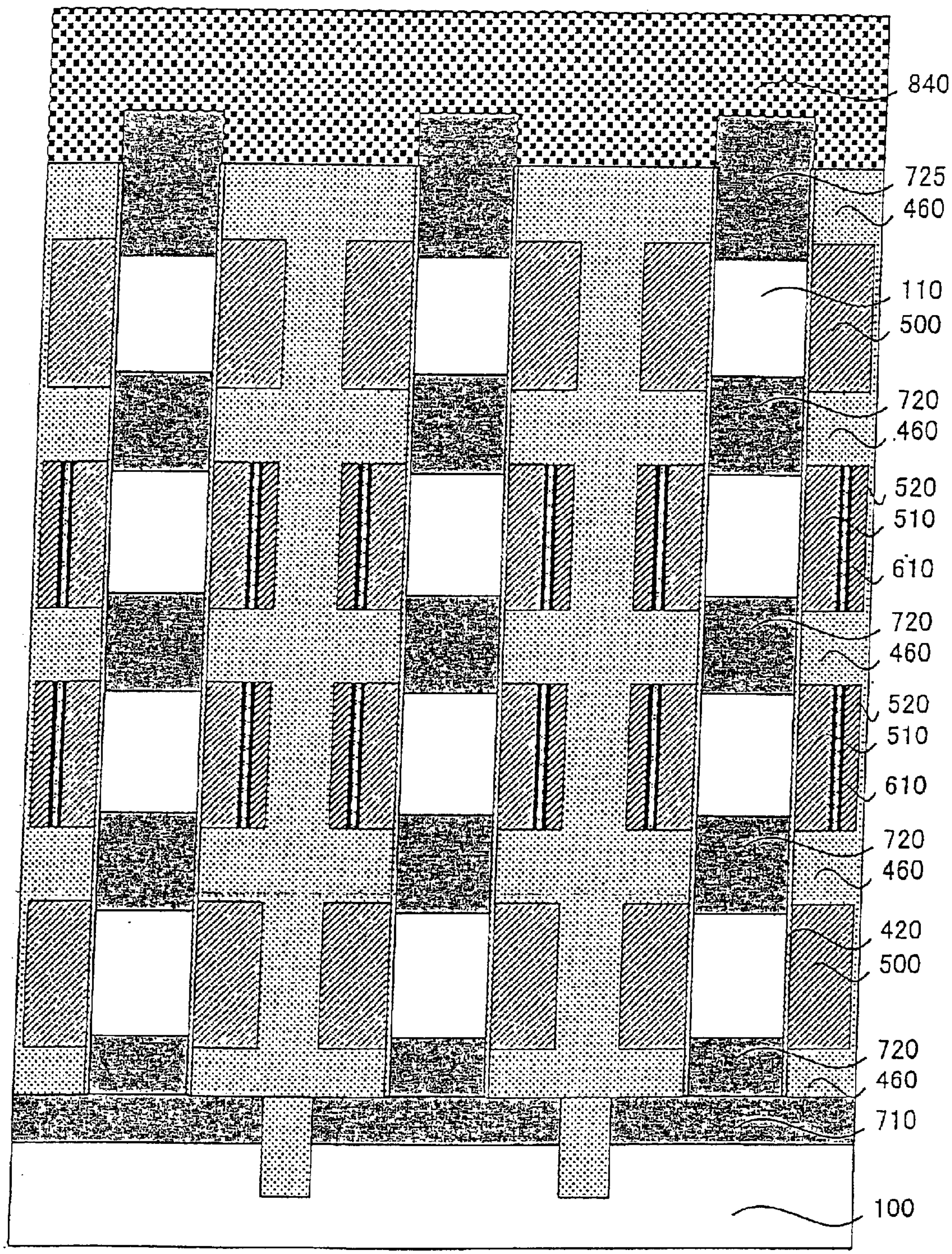

In an example shown in FIG. 25 and FIG. 26, in contrast to FIG. 15 and FIG. 16, the control gate 520 and the floating gate 510 of the memory cell are formed of different materials.

Figure 27:
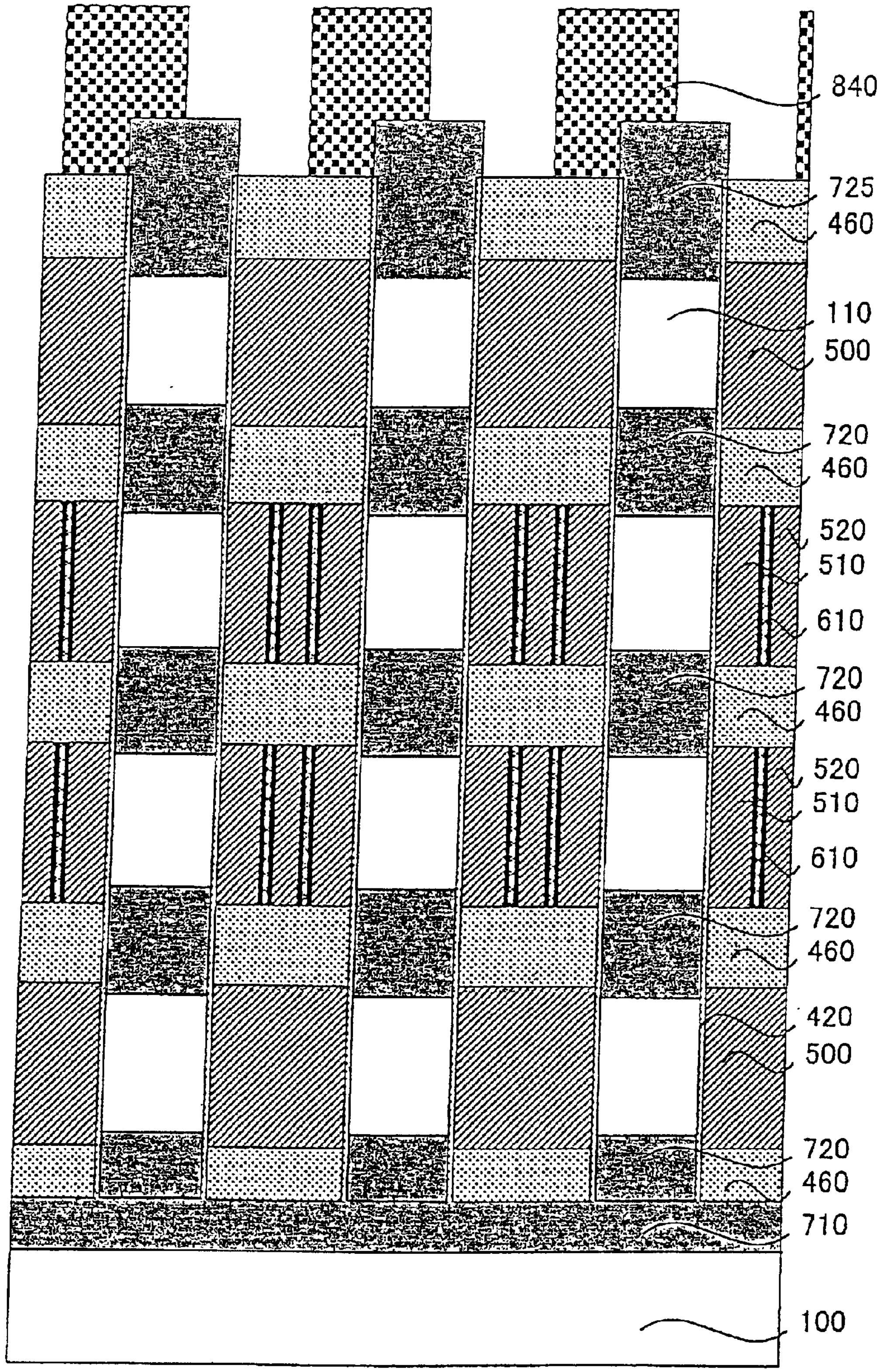
Figure 28:
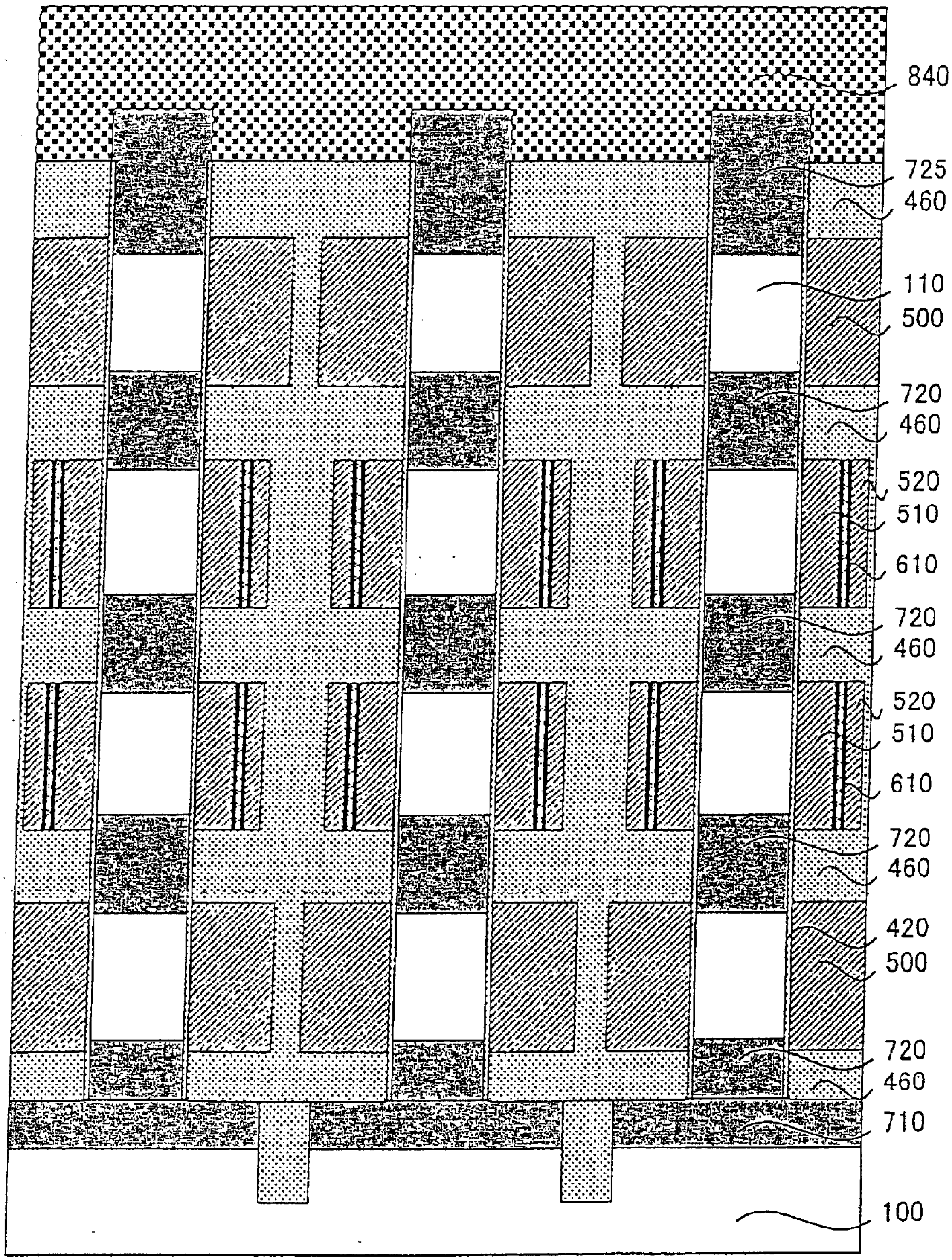

In an example shown in FIG. 27 and FIG. 28, in contrast to FIG. 15 and FIG. 16, the control gate 520 of the memory cell and the gate 500 of the selection gate transistor have different outer circumferences.

Figure 29:
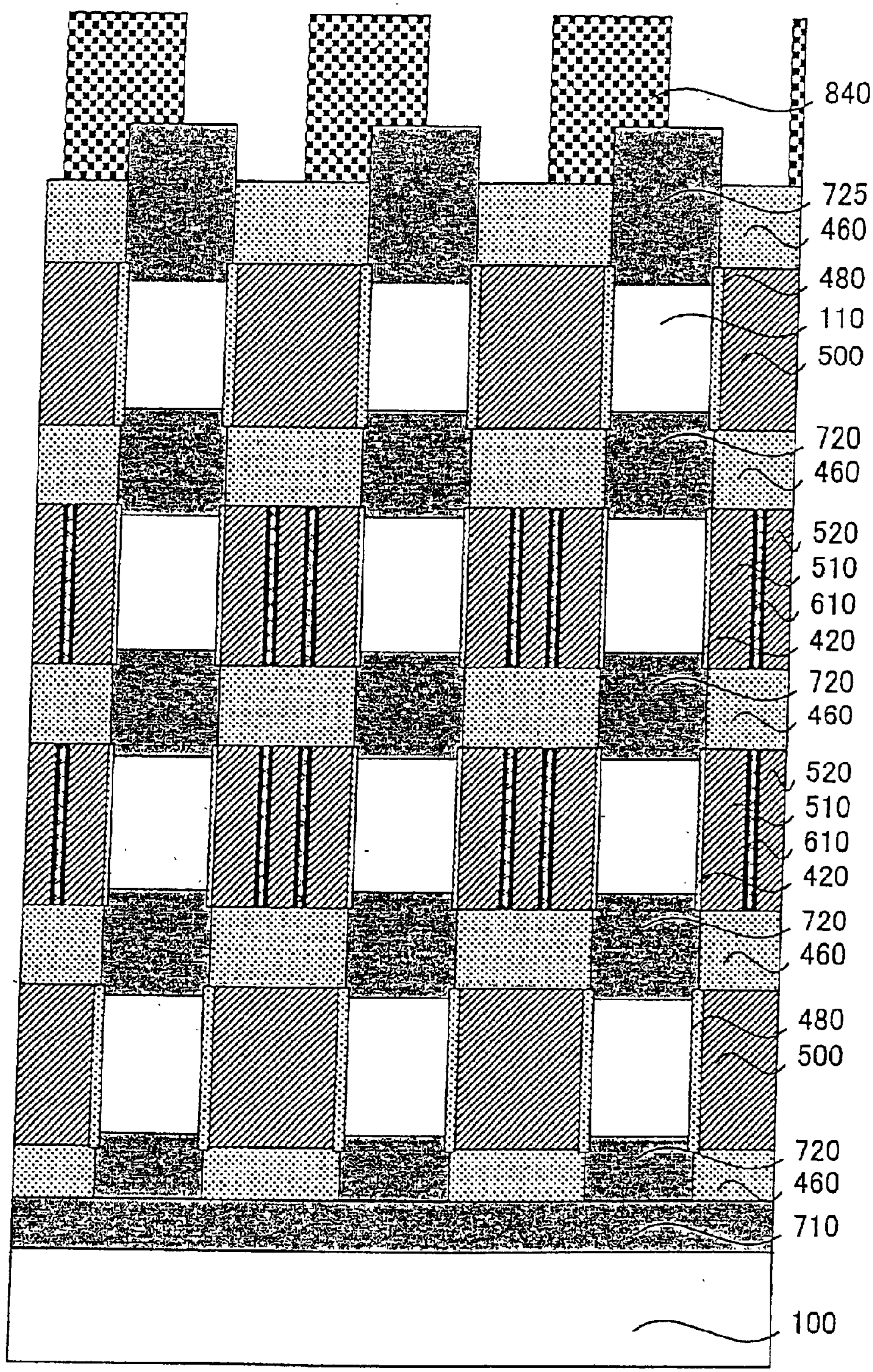
Figure 30:
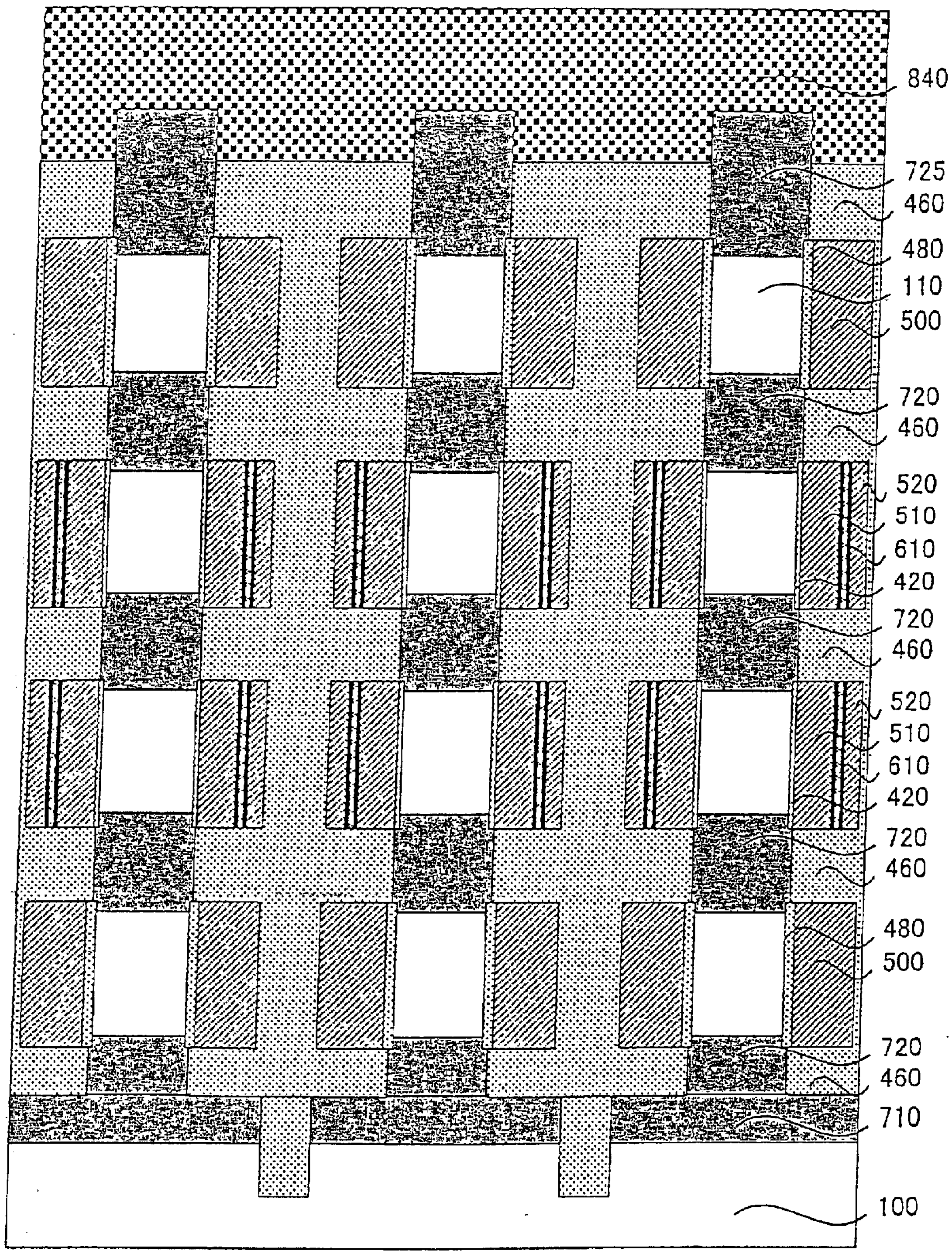

In the example of FIG. 29 and FIG. 30, the thickness of the gate insulating film of the selection gate transistor is larger than that of the gate insulating film of the memory transistor.

Figure 31:
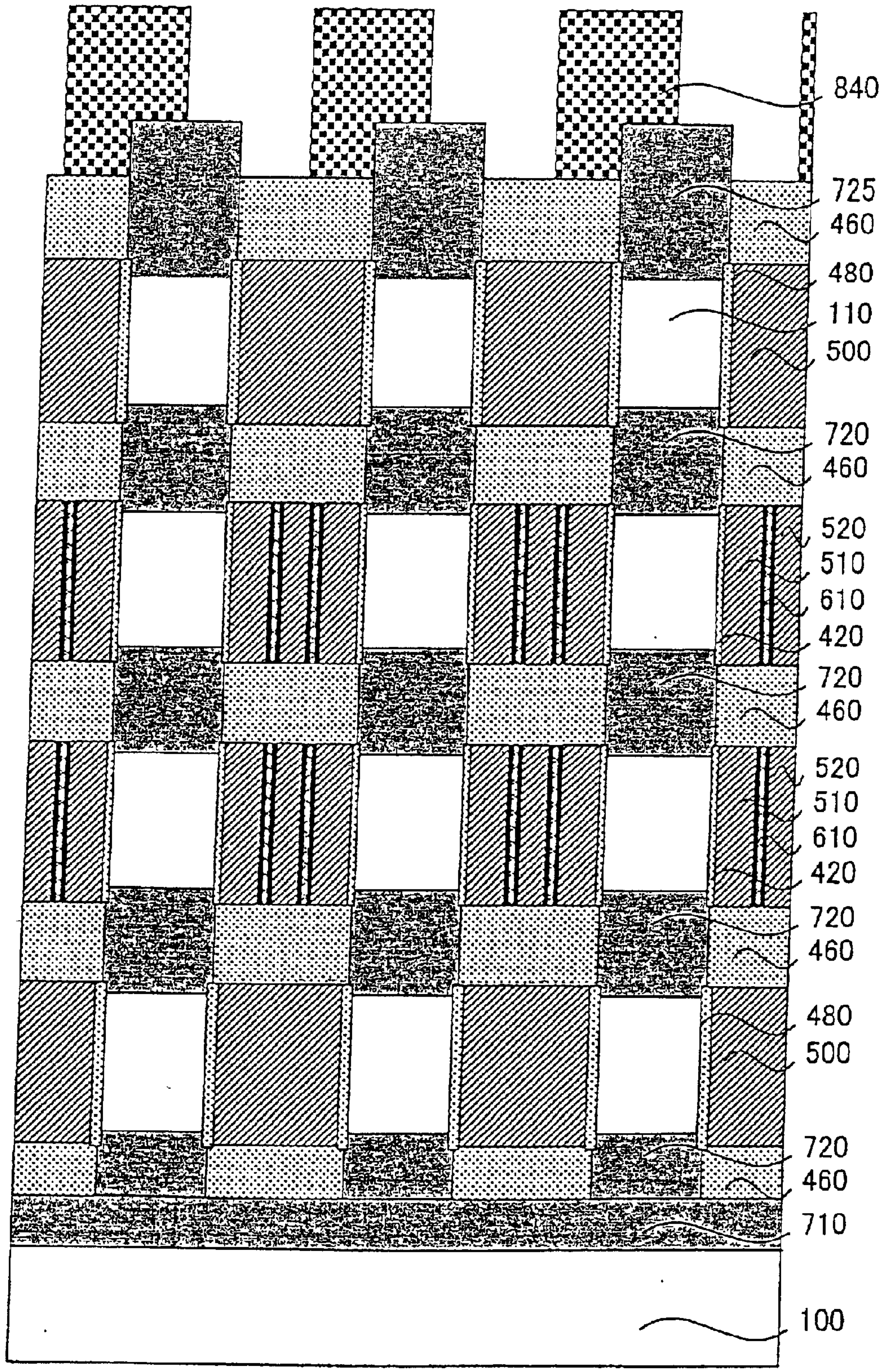
Figure 32:
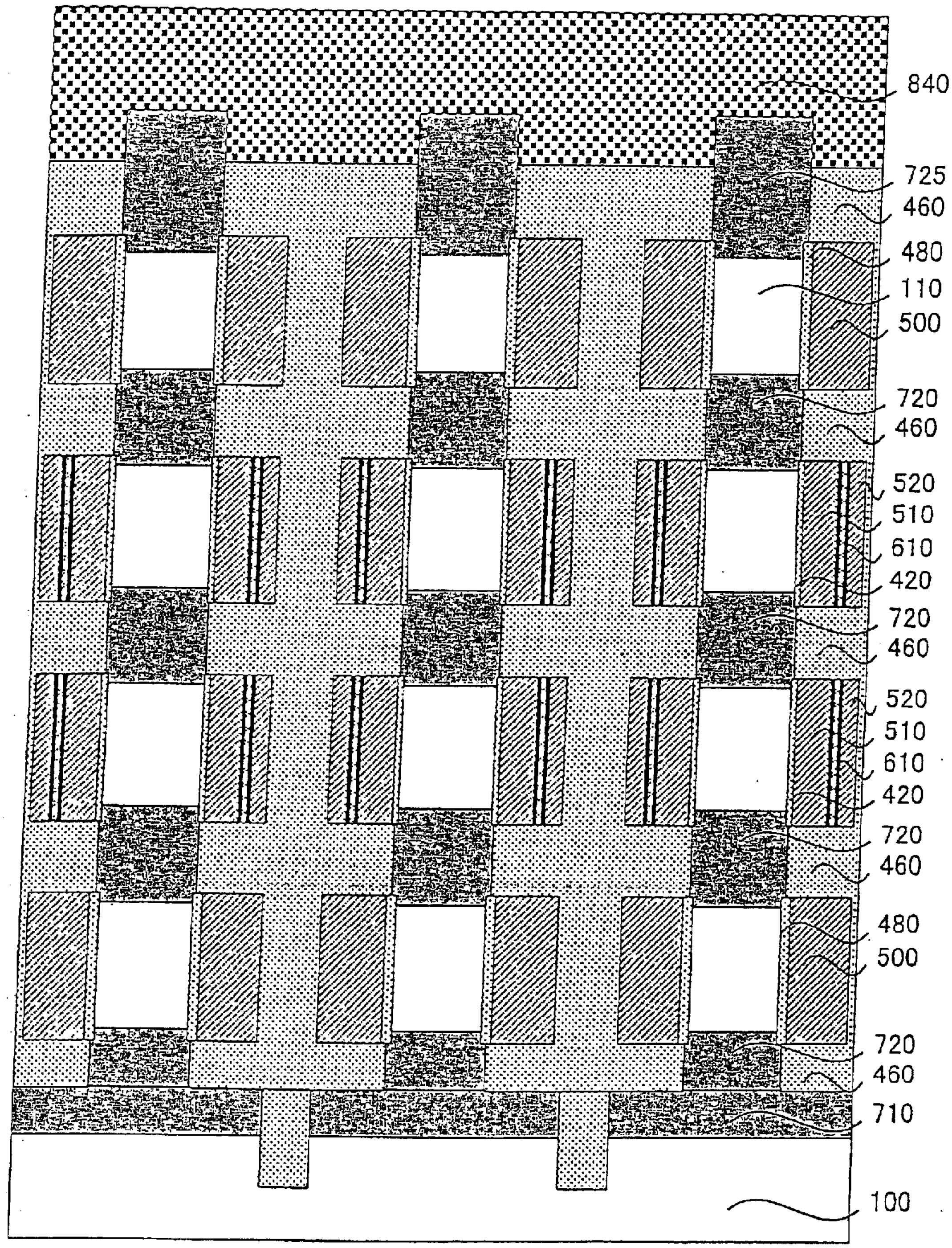

In the example of FIG. 31 and FIG. 32, in contrast to FIG. 29 and FIG. 30, the surfaces of the silicon oxide films 420 and 480 are positioned outside the periphery of the island-like semiconductor layer 110.

Figure 33:
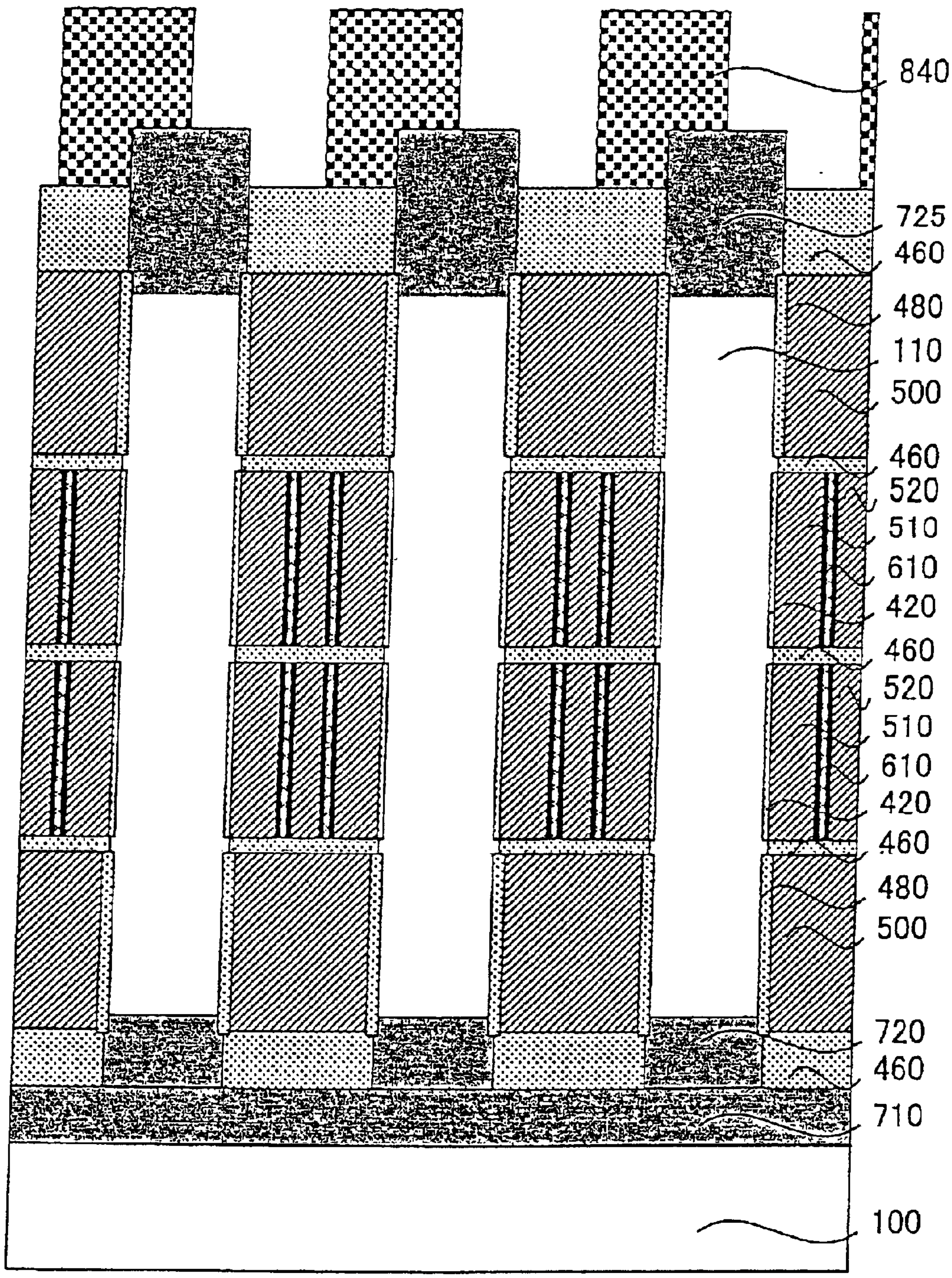
Figure 34:
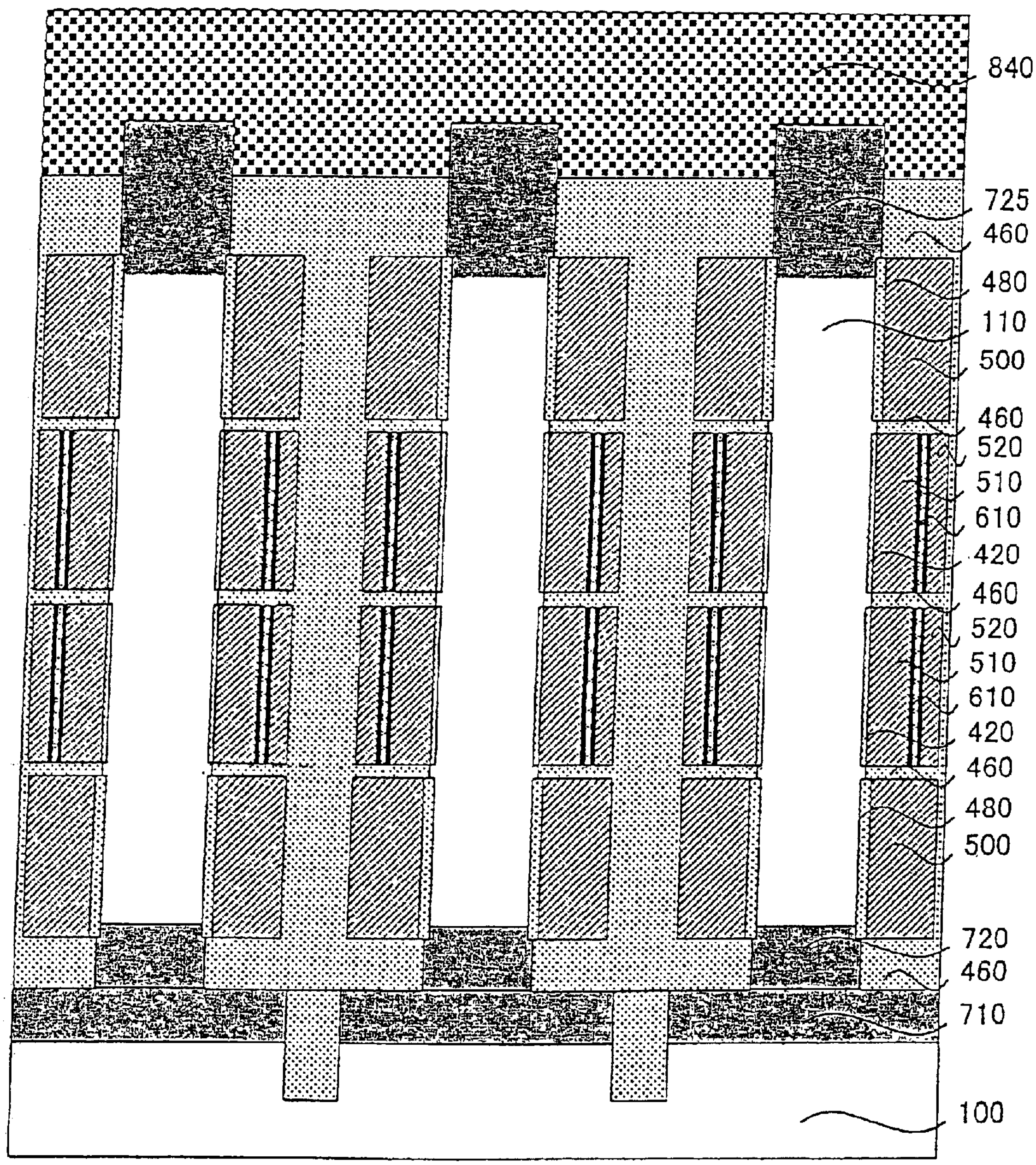

In the example of FIG. 33 and FIG. 34, the diffusion layers 720 are not provided between the transistors.

Figure 35:
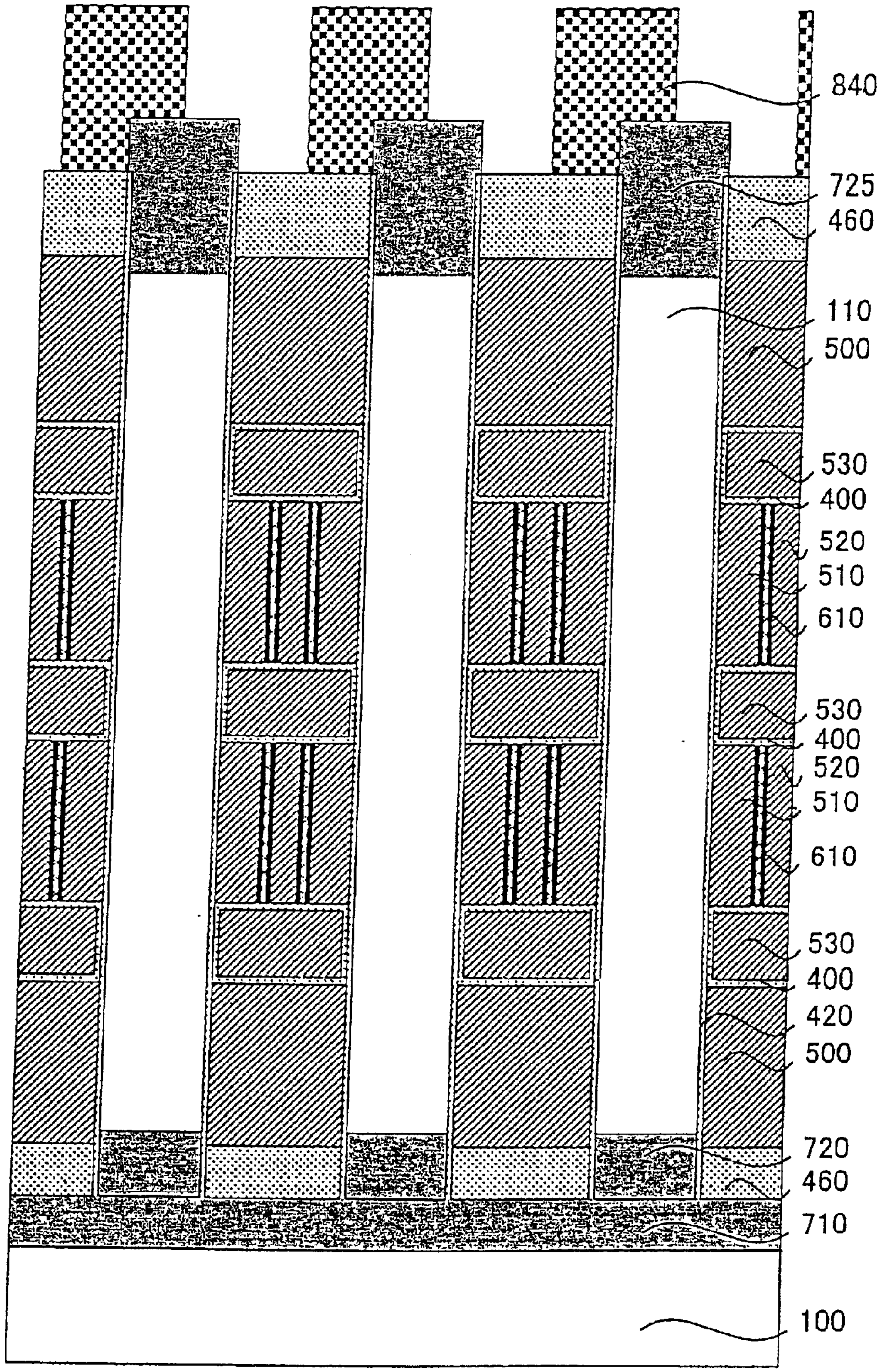
Figure 36:
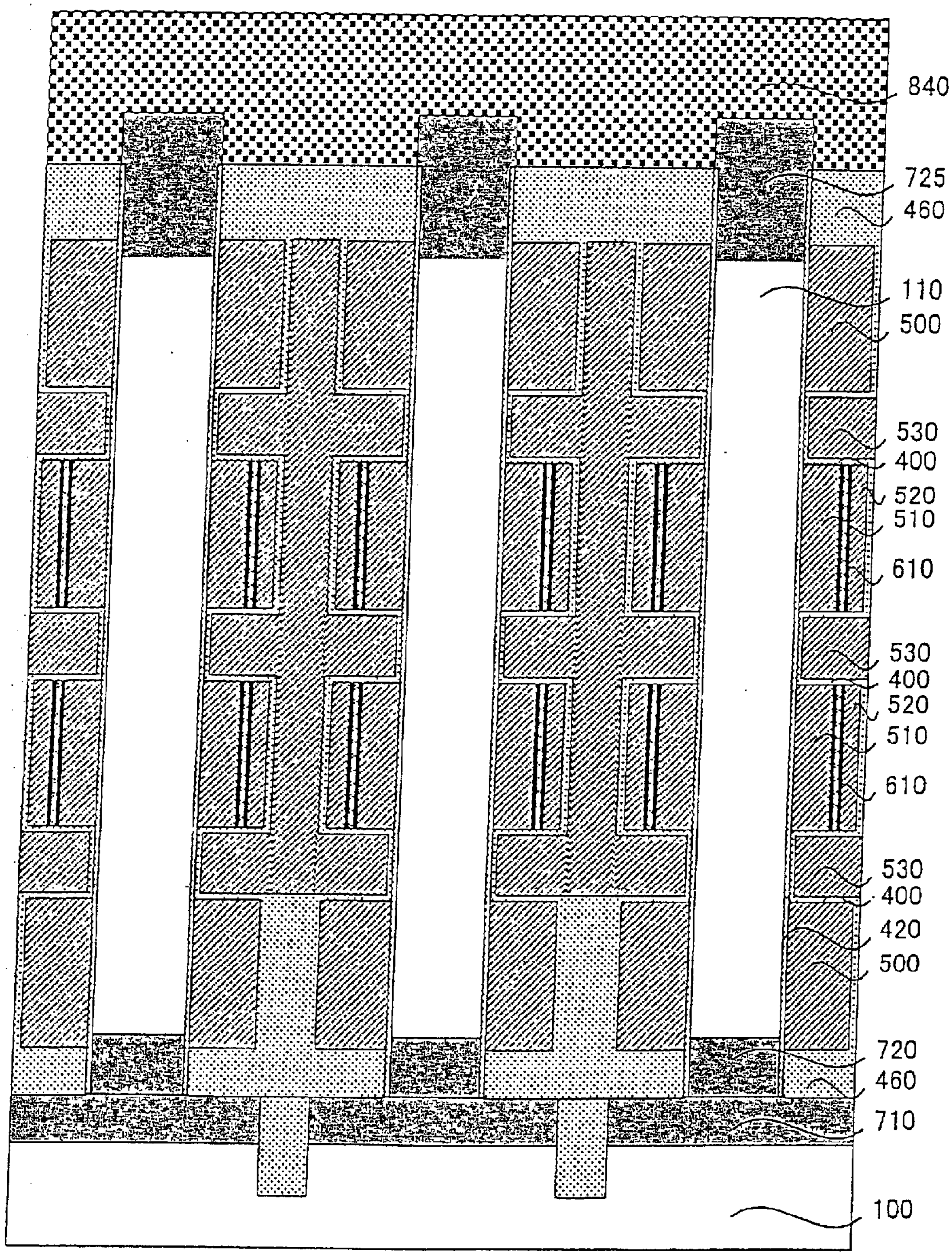

In the example of FIG. 35 and FIG. 36, the diffusion layers 720 are not provided between the transistors and polysilicon films 530 are formed as third electrodes between the gate electrodes 500, 510 and 520 of the memory transistors and the selection gate transistors.

Figure 37:
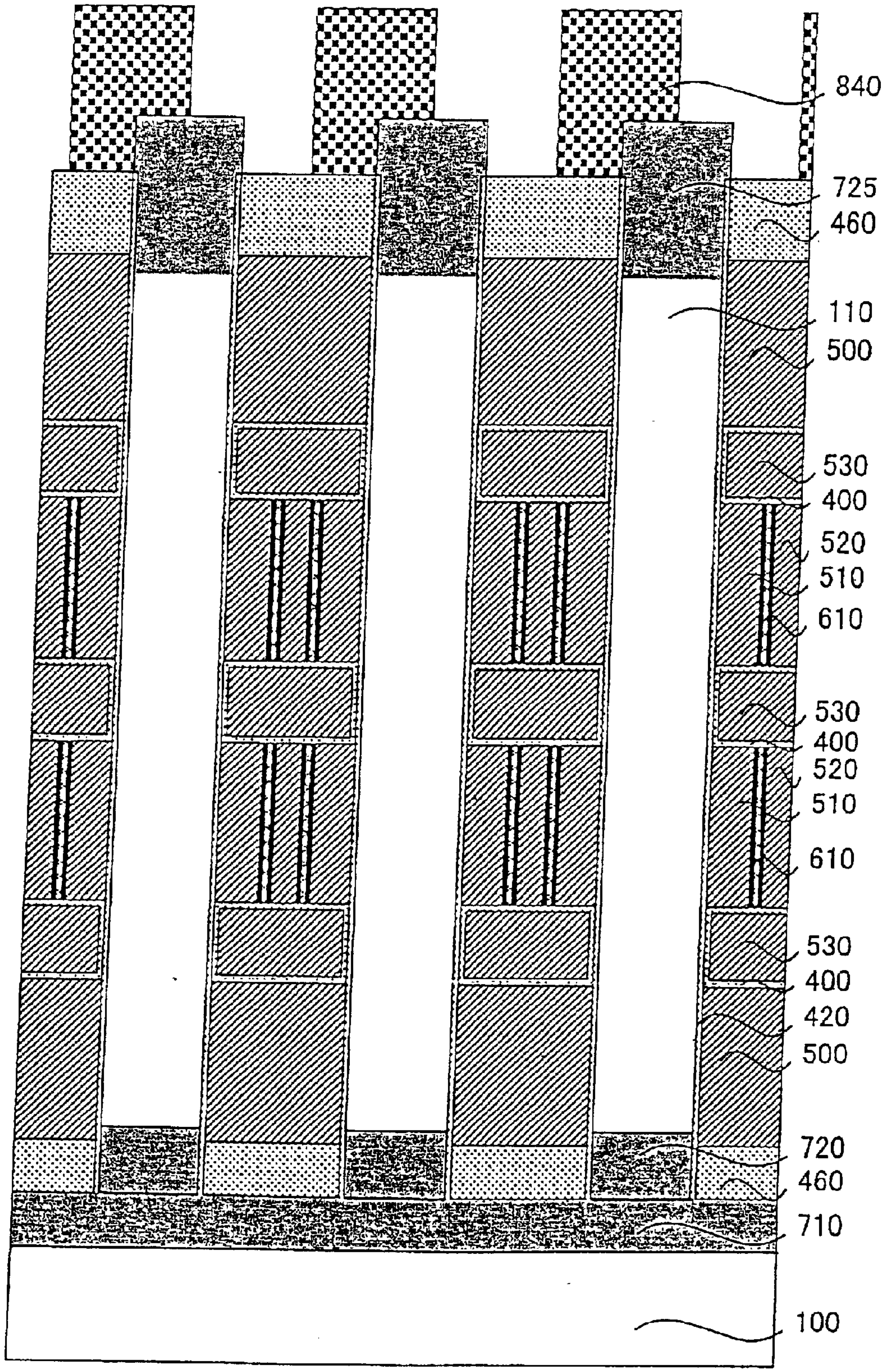
Figure 38:
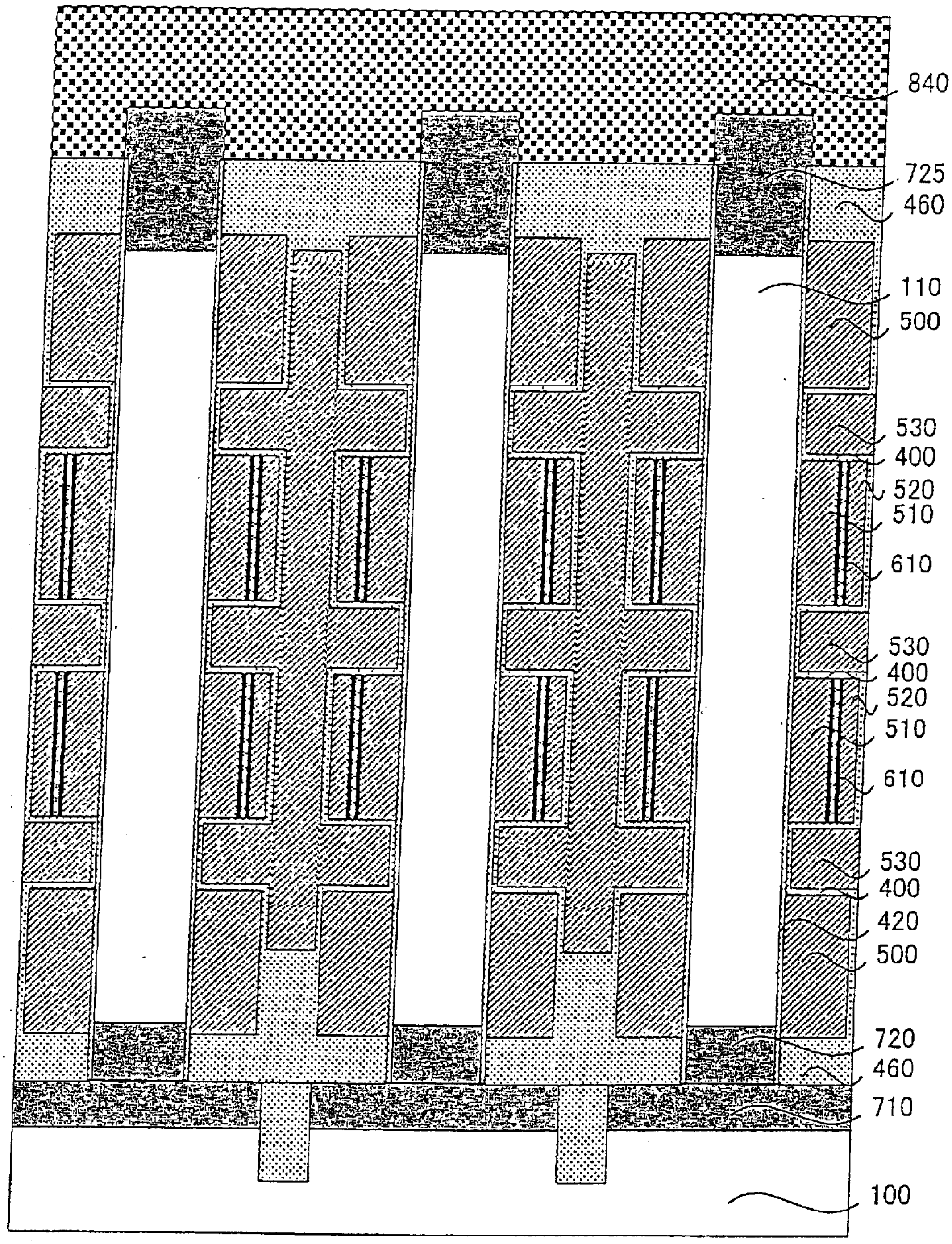

In the example of FIG. 37 and FIG. 38, in contrast to FIG. 35 and FIG. 36, the position of the bottom and upper ends of the polysilicon films 530 as the third electrodes is different from the position of the upper ends of the gates 500 of the selection gate transistors. The polysilicon films 530 as the third electrodes are not shown in FIG. 1 for avoiding complexity.

Figure 39:
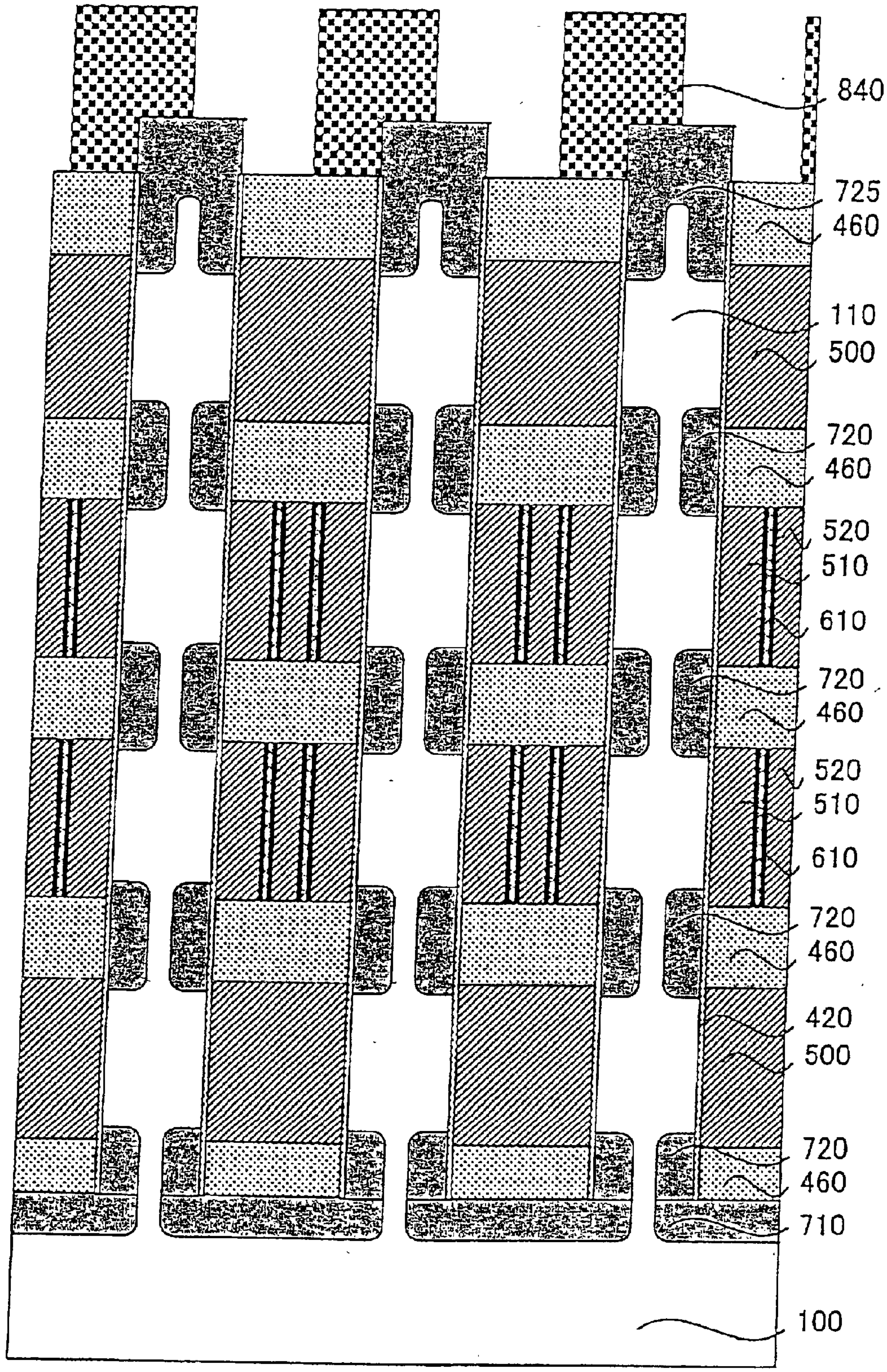
Figure 40:
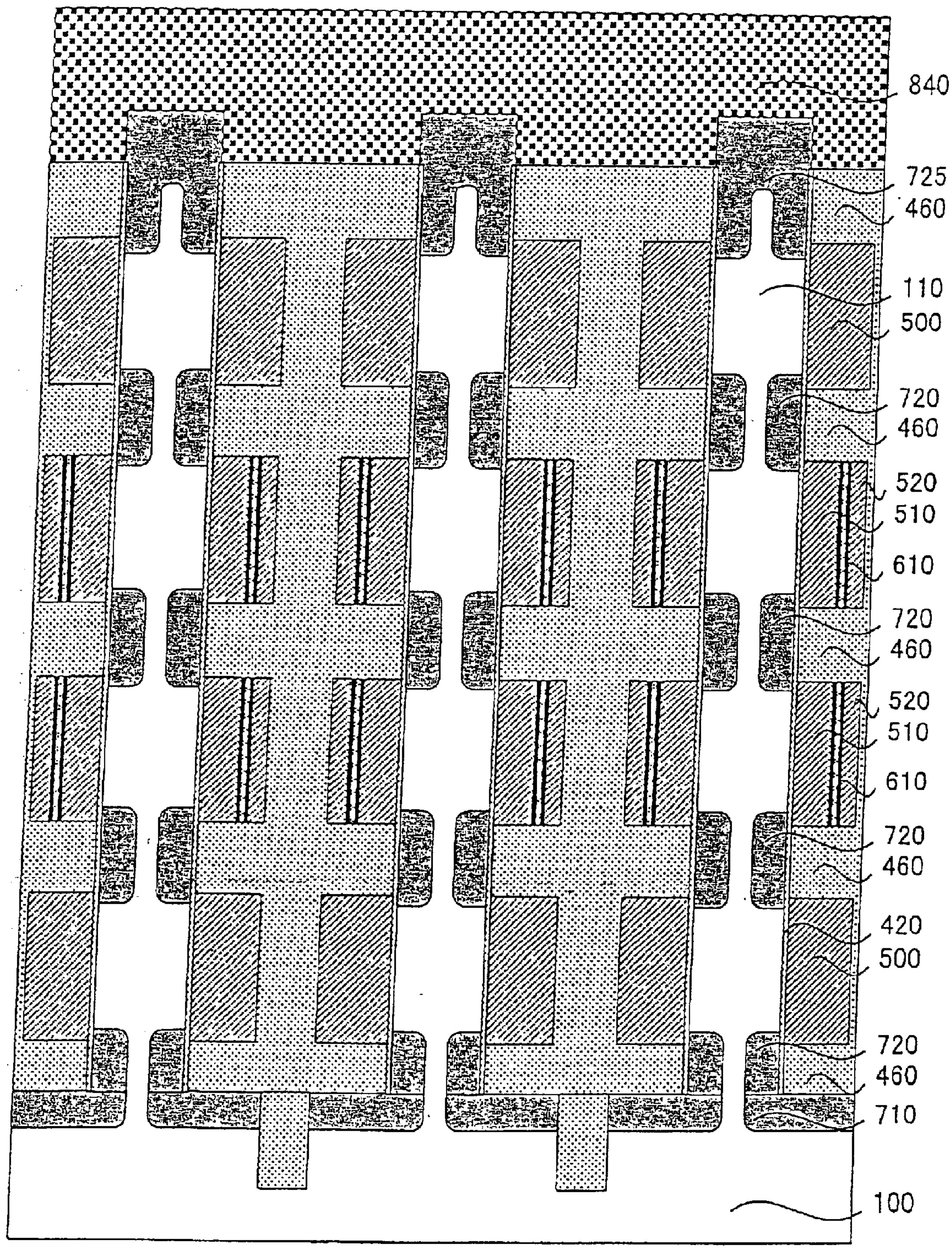

In the example of FIG. 39 and FIG. 40, the source diffusion layer 710 is disposed so that the semiconductor substrate 100 is connected to the island-like semiconductor layer 110, and the diffusion layer 720 is disposed so that the active regions of adjacent transistors are connected to each other in the island-like semiconductor layer 110. The island-like semiconductor layer 110 and the semiconductor substrate 110 becomes in an electrically floating state owing to a depletion layer formed on a semiconductor substrate 100 side or an island-like semiconductor layer 110 side of a PN junction formed between the source diffusion layer 710 and the semiconductor substrate 100 or the island-like semiconductor layer 110 by a difference between a potential given to the source diffusion layer 710 and a potential given to the semiconductor substrate 100 at reading or at erasing. The active regions of the adjacent transistors are electrically insulated from each other owing to a depletion layer formed in the island-like semiconductor 110 side of the PN junction formed between the diffusion layer 720 and the island-like semiconductor layer 110 by a difference between a potential given to the diffusion layer 720 and a potential given to the island-like semiconductor layer 110.

Figure 41:
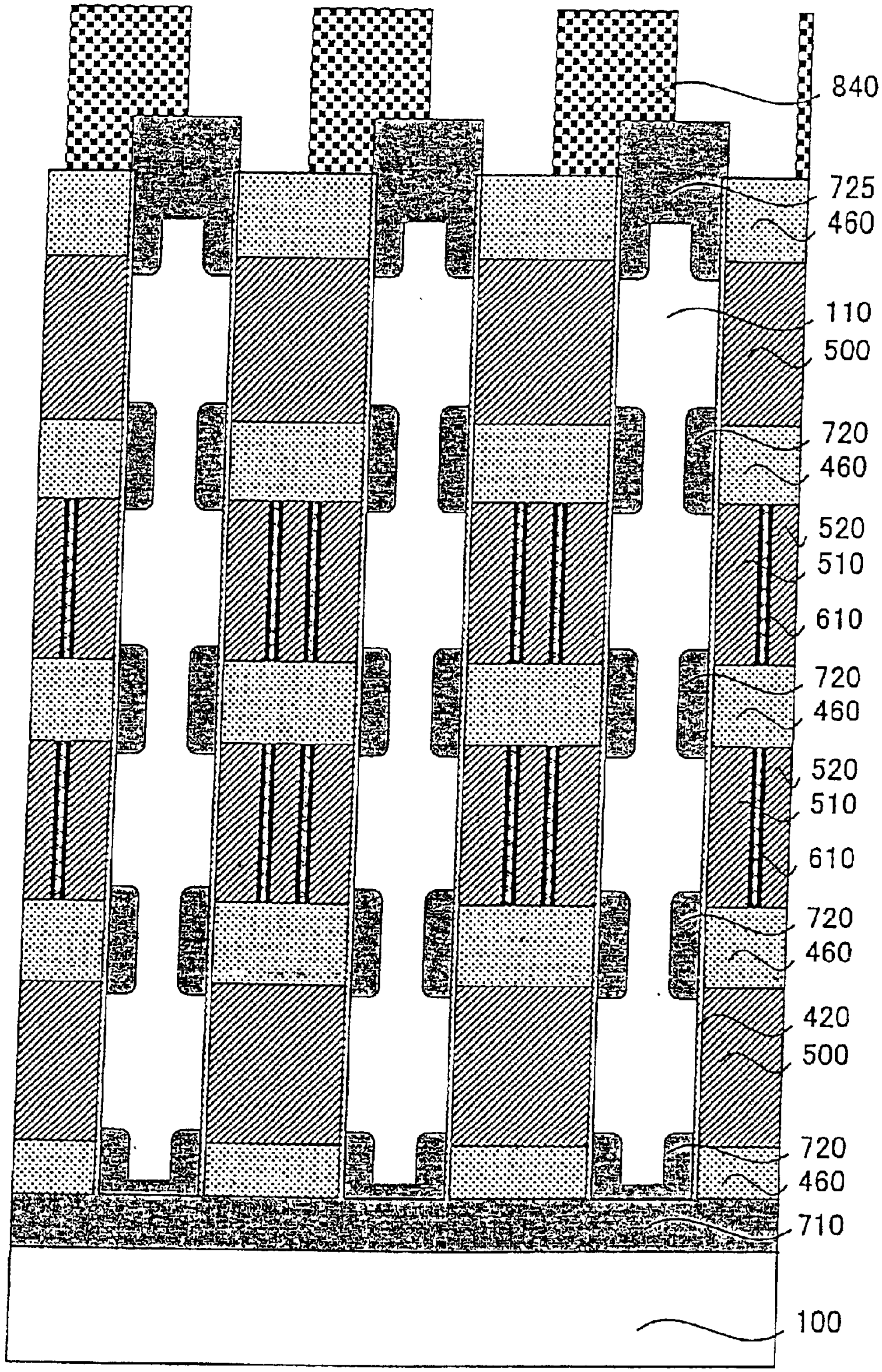
Figure 42:
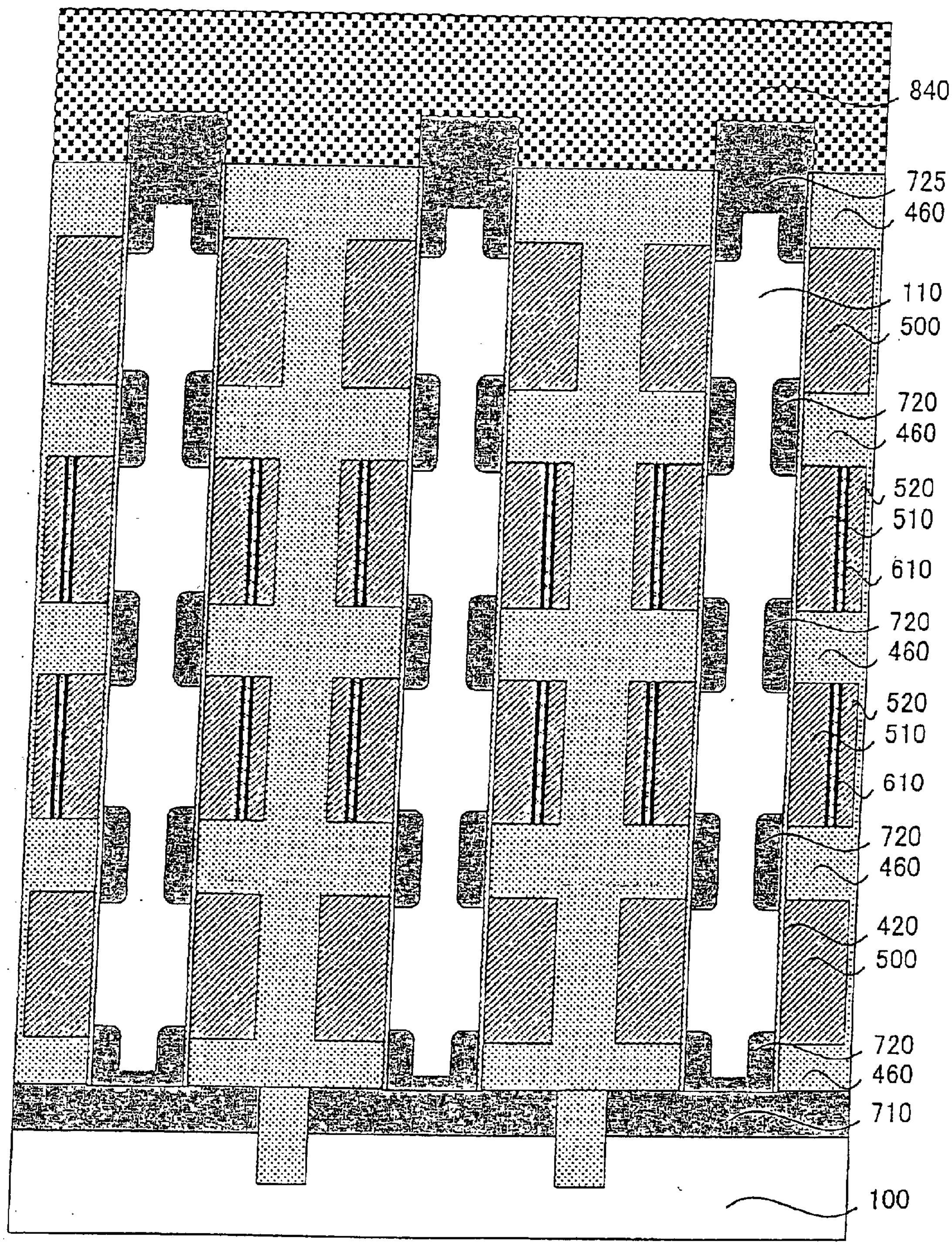

In the example of FIG. 41 and FIG. 42, the island-like semiconductor layer 110 becomes in the floating state owing to the source diffusion layer 710, but the active regions of the memory-cells are not electrically insulated by the diffusion layer 720.

FIG. 43 to FIG. 64 show sectional views of semiconductor memories having laminated insulating films as charge storage layers. Of FIG. 43 to FIG. 64, odd-numbered figures show sectional views taken on line A-A' in FIG. 12 which is a plan view illustrating memory cell array of the MONOS structure and even-numbered figures show sectional views taken on line B-B' in FIG. 12. These examples are the same as those shown in FIG. 15 to FIG. 42 except that the charge storage layers are changed from the floating gates to the laminated insulating films.

Figure 43:
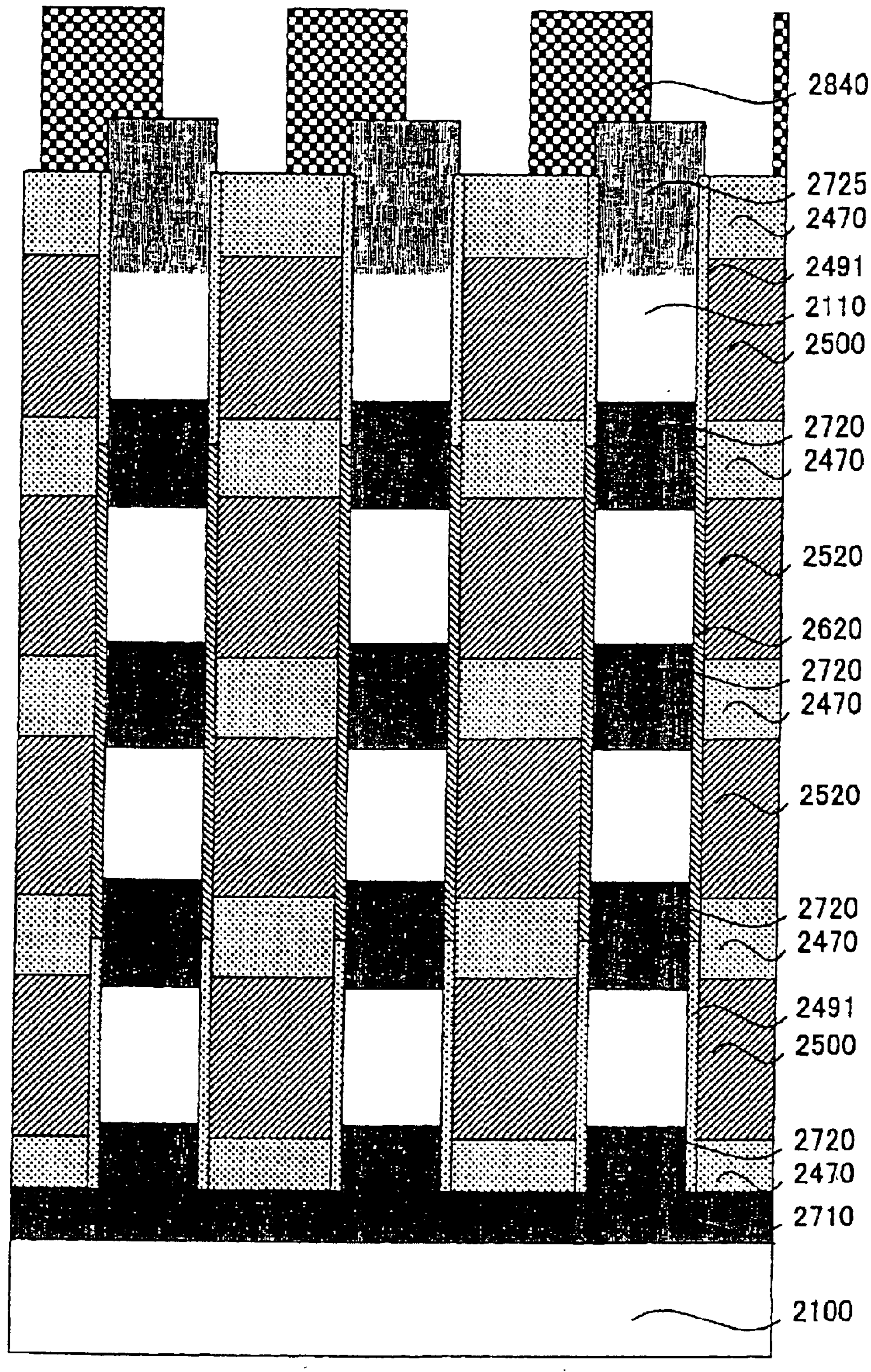
FIGS. 43 to 54 are sectional views of various semiconductor memory devices having layered insulating films as charge storage layers in accordance with the present invention, the sectional views corresponding to those taken on line A-A' and line B-B' in FIG. 12.
Figure 44:
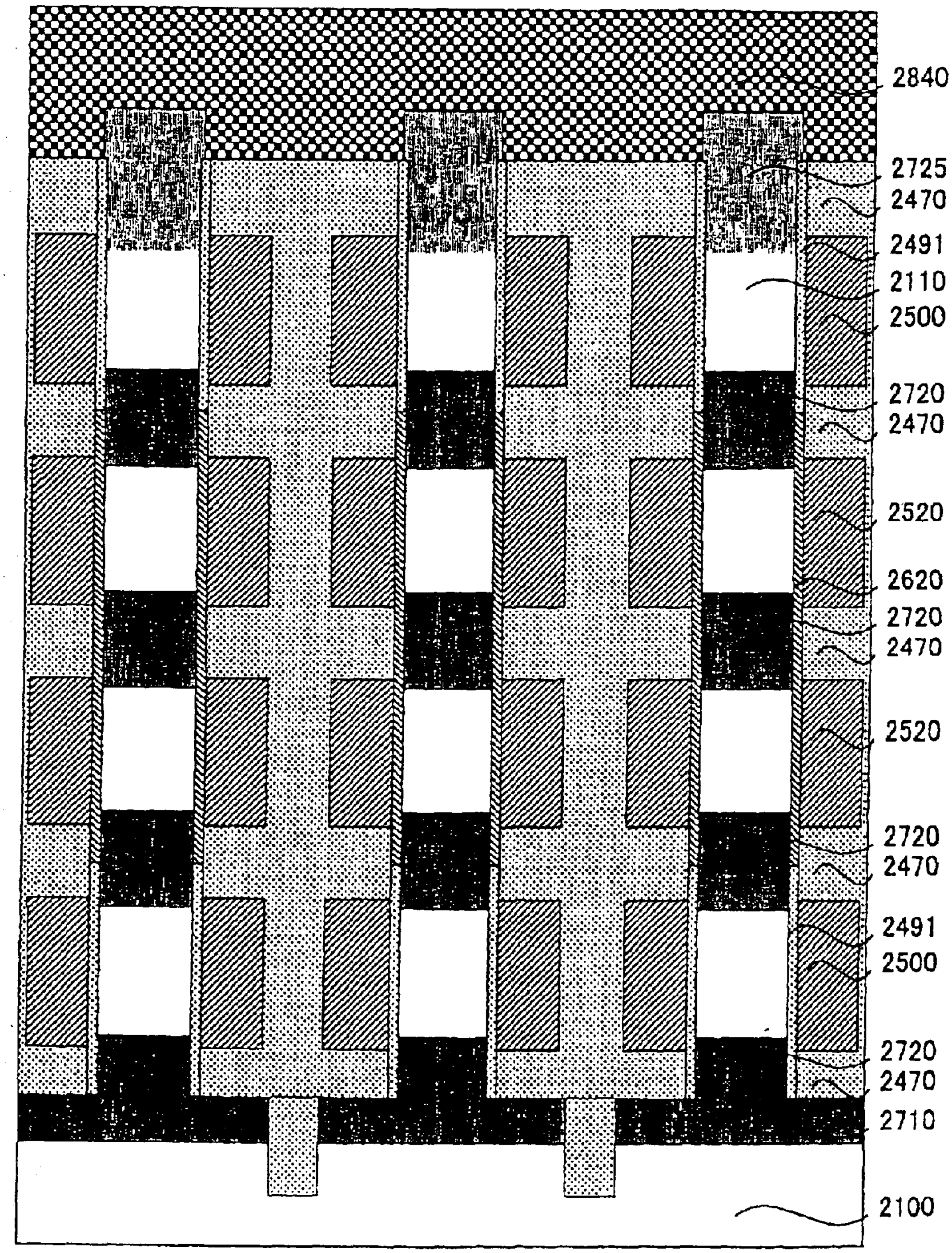
Figure 45:
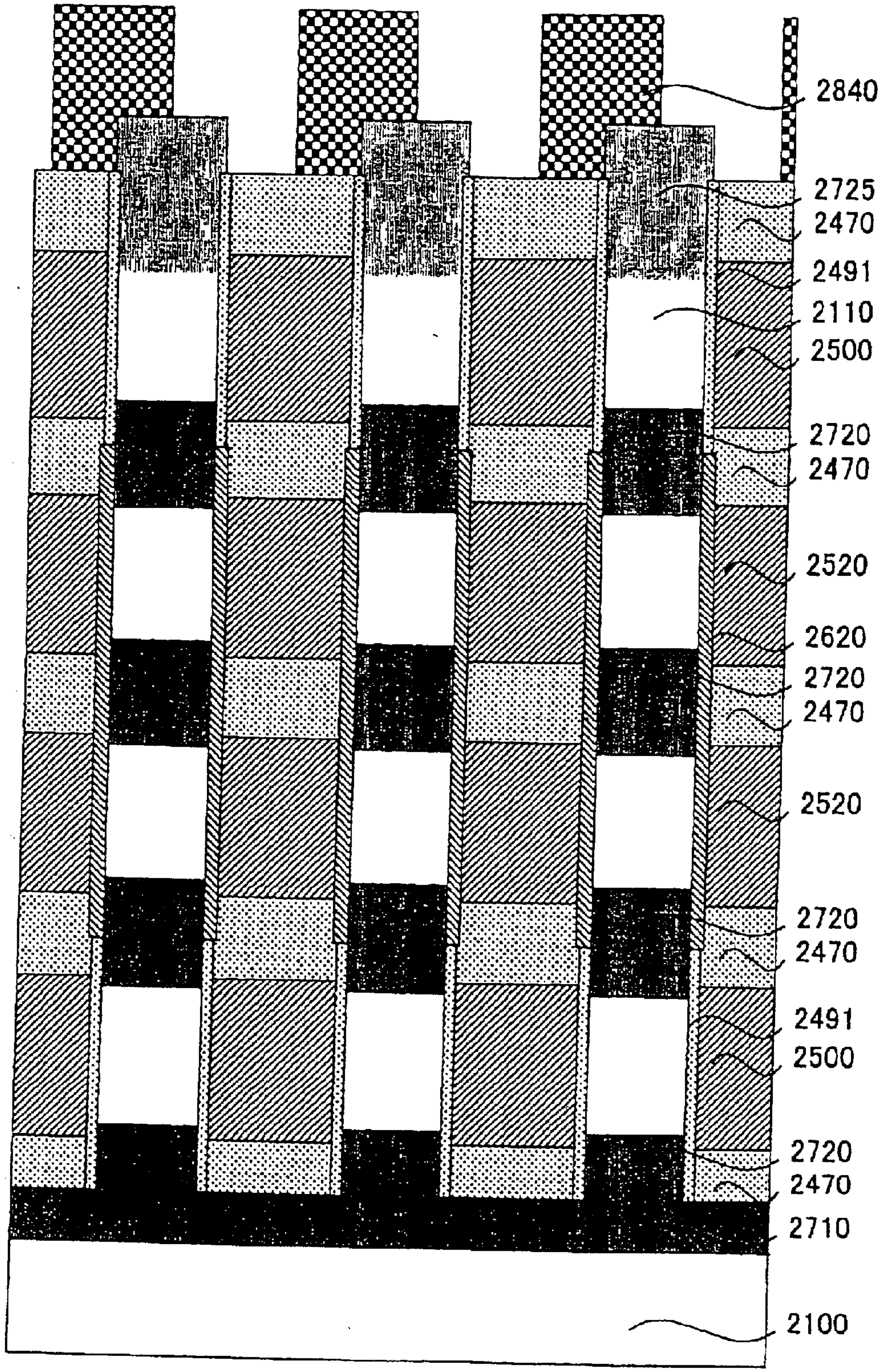
Figure 46:
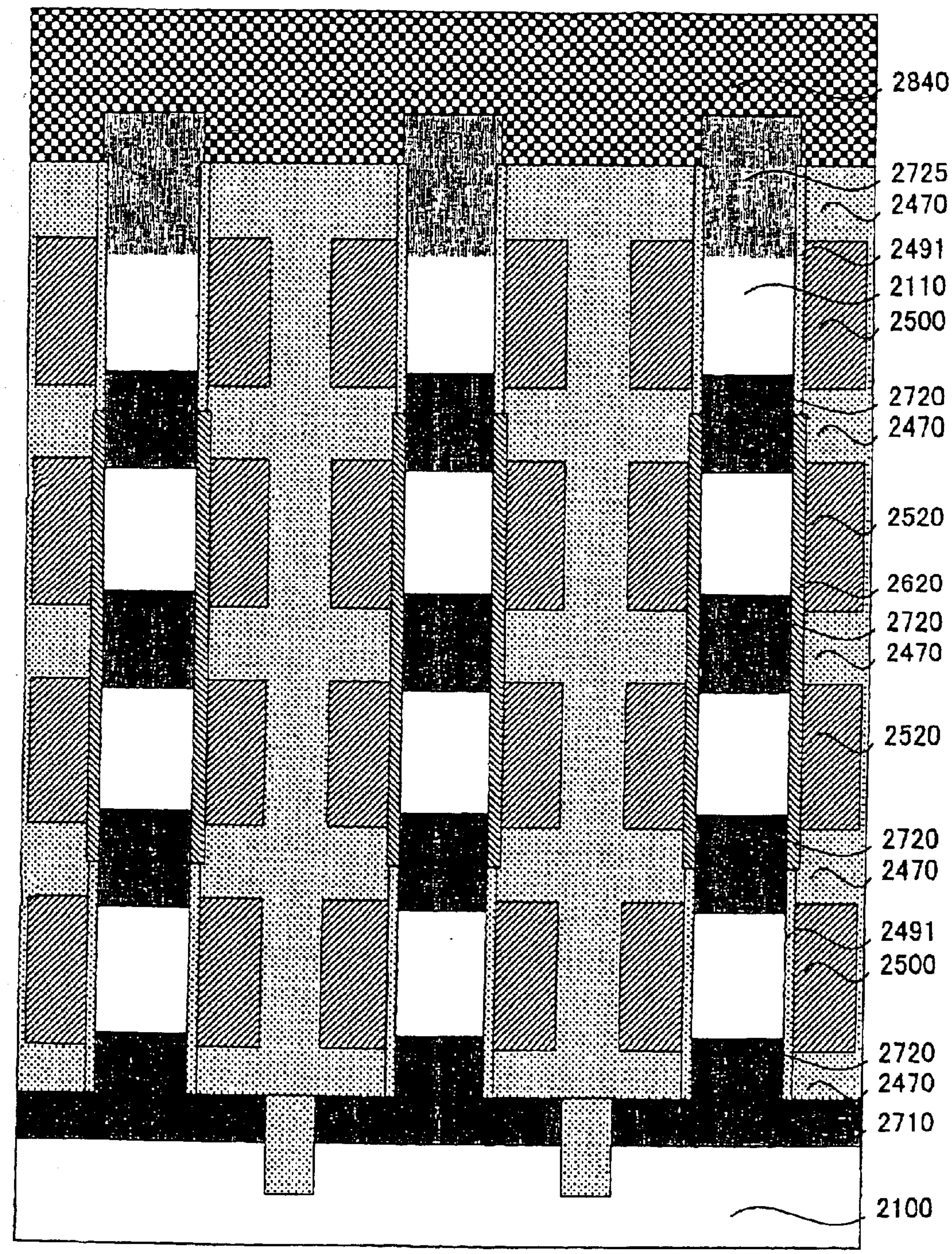

In the example of FIG. 45 and FIG. 46, in contrast to FIG. 43 and FIG. 44, the thickness of the laminated insulating films is larger than the thickness of the gates of the selection gate transistors.

Figure 47:
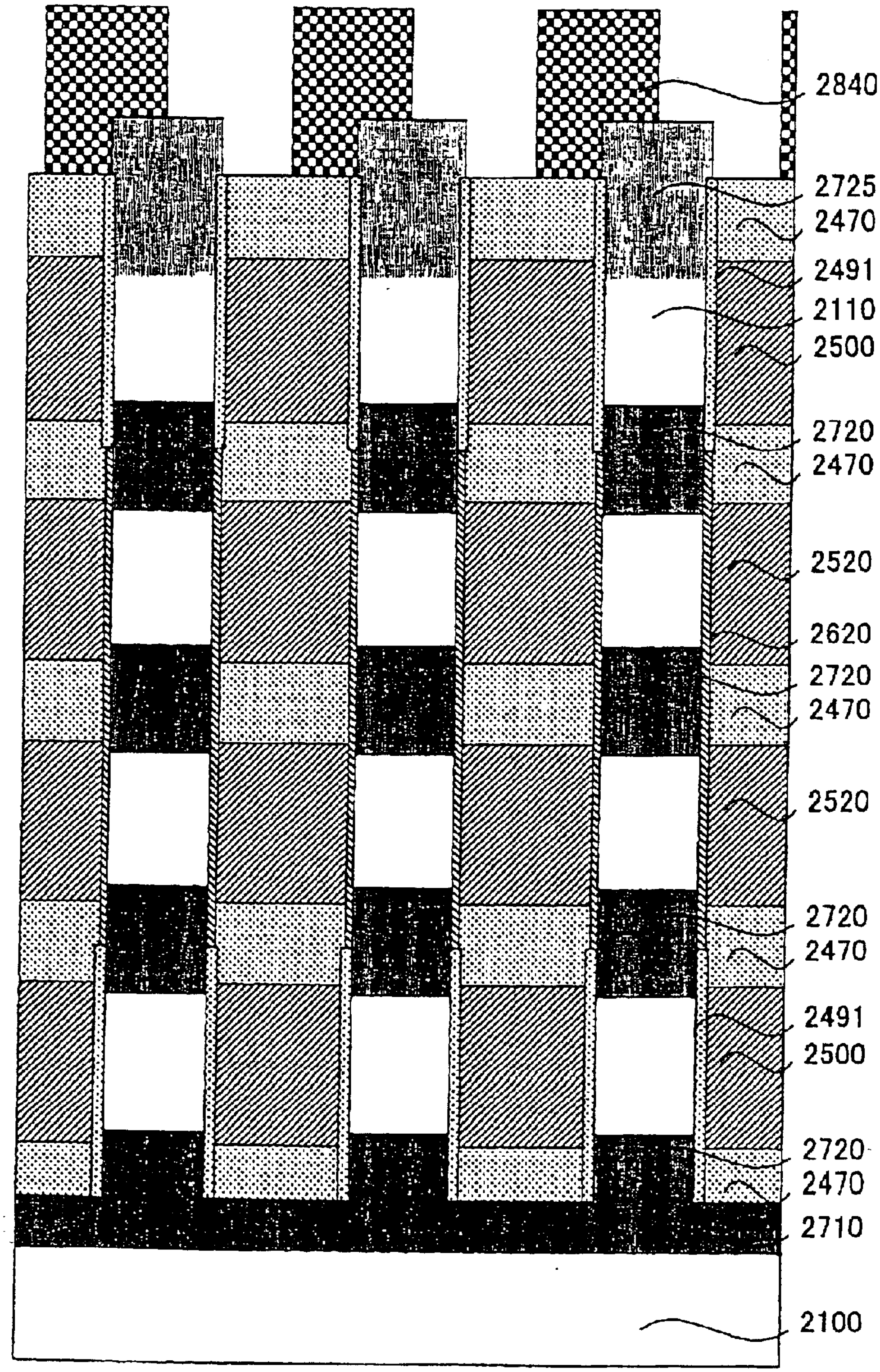
Figure 48:
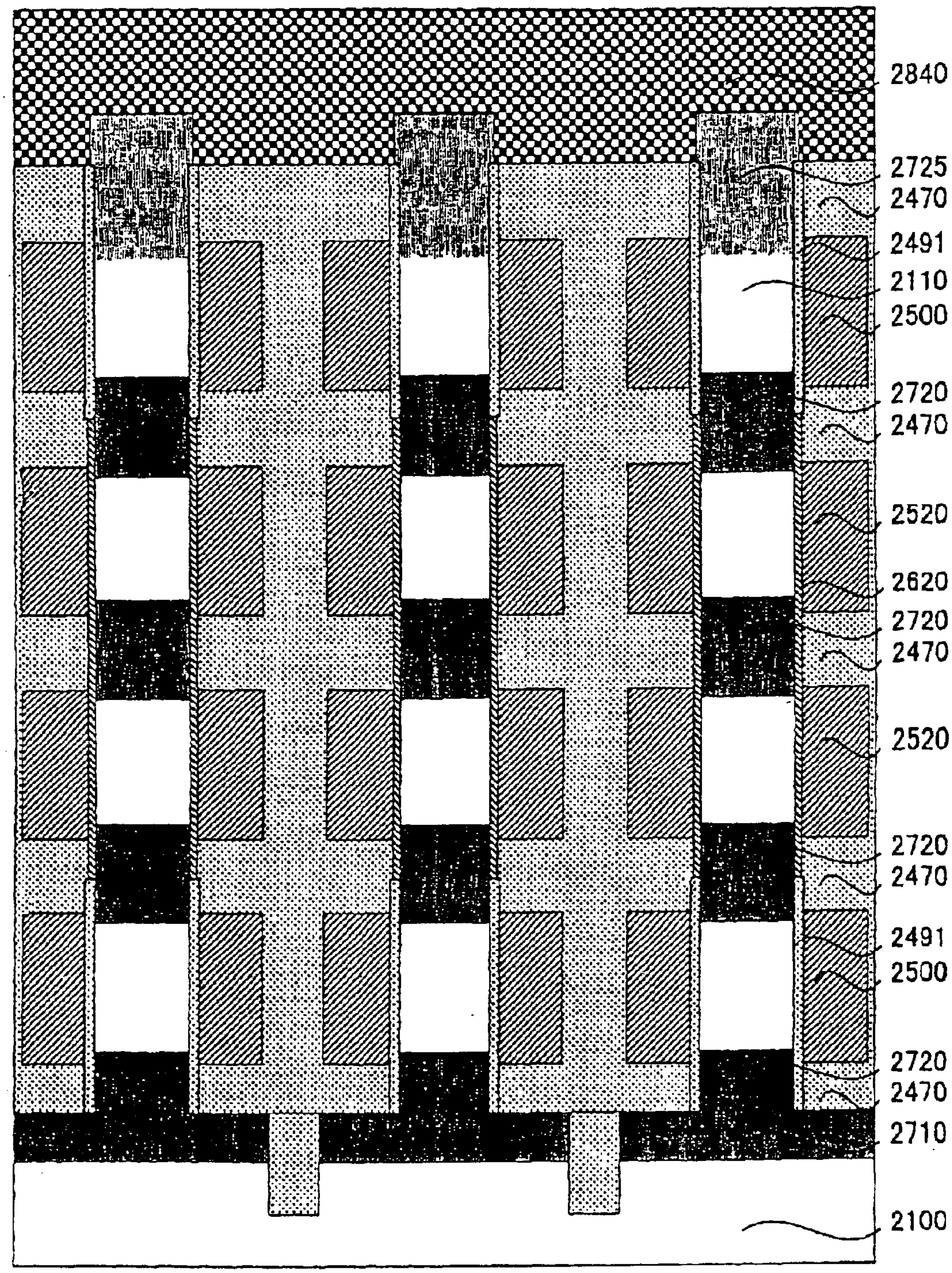
Figure 49:
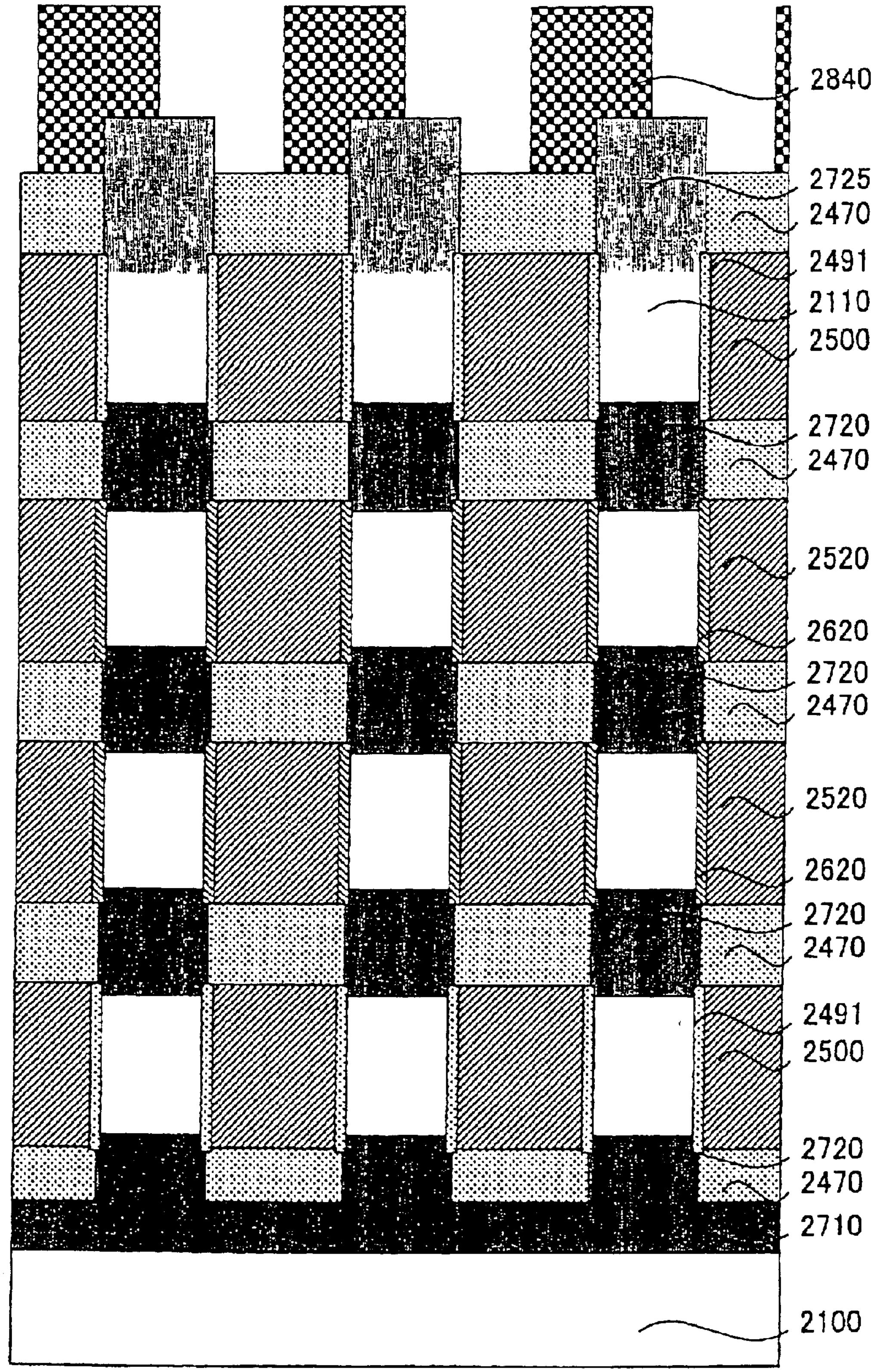
Figure 50:
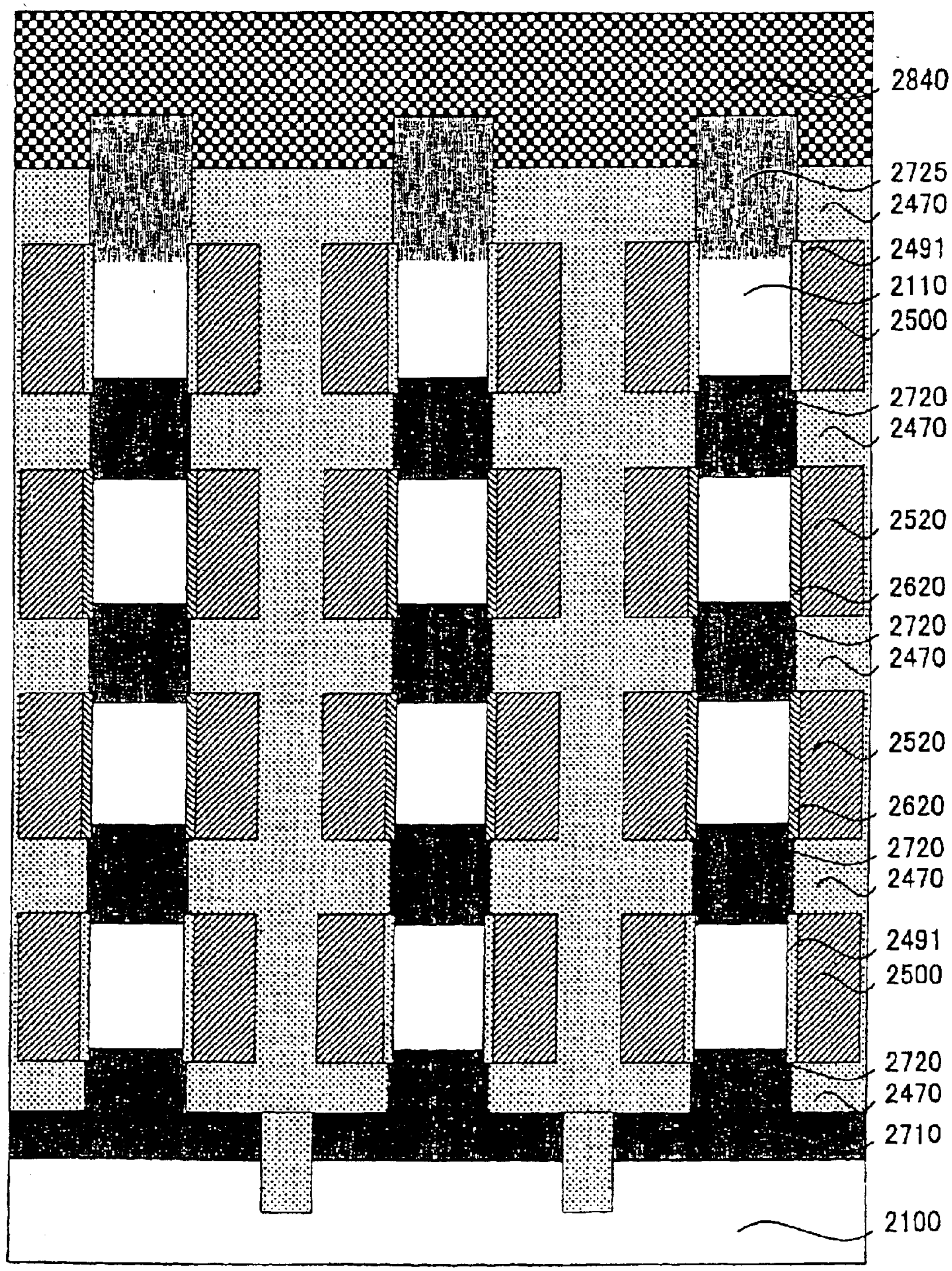
Figure 51:
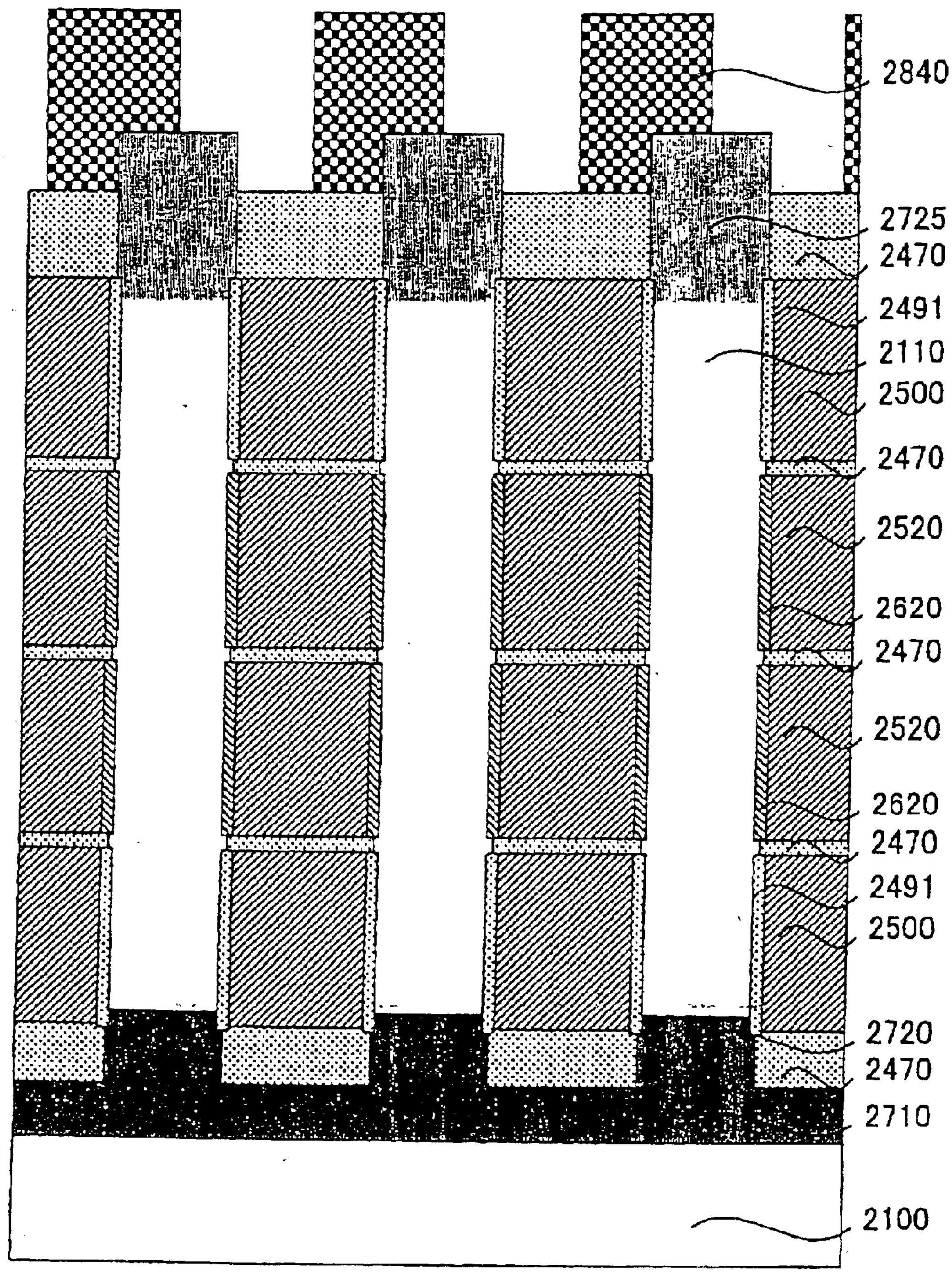
Figure 52:
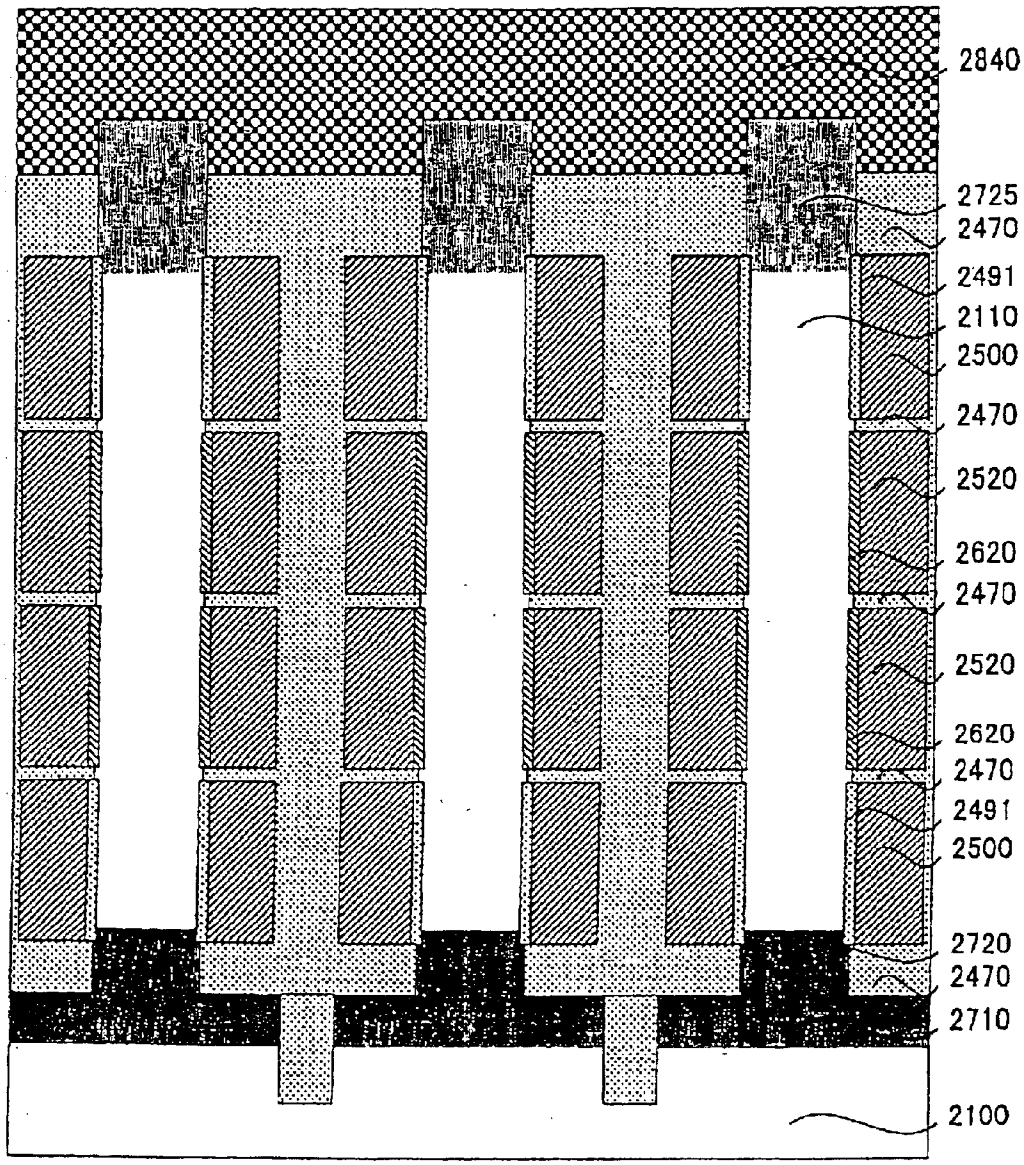
Figure 53:
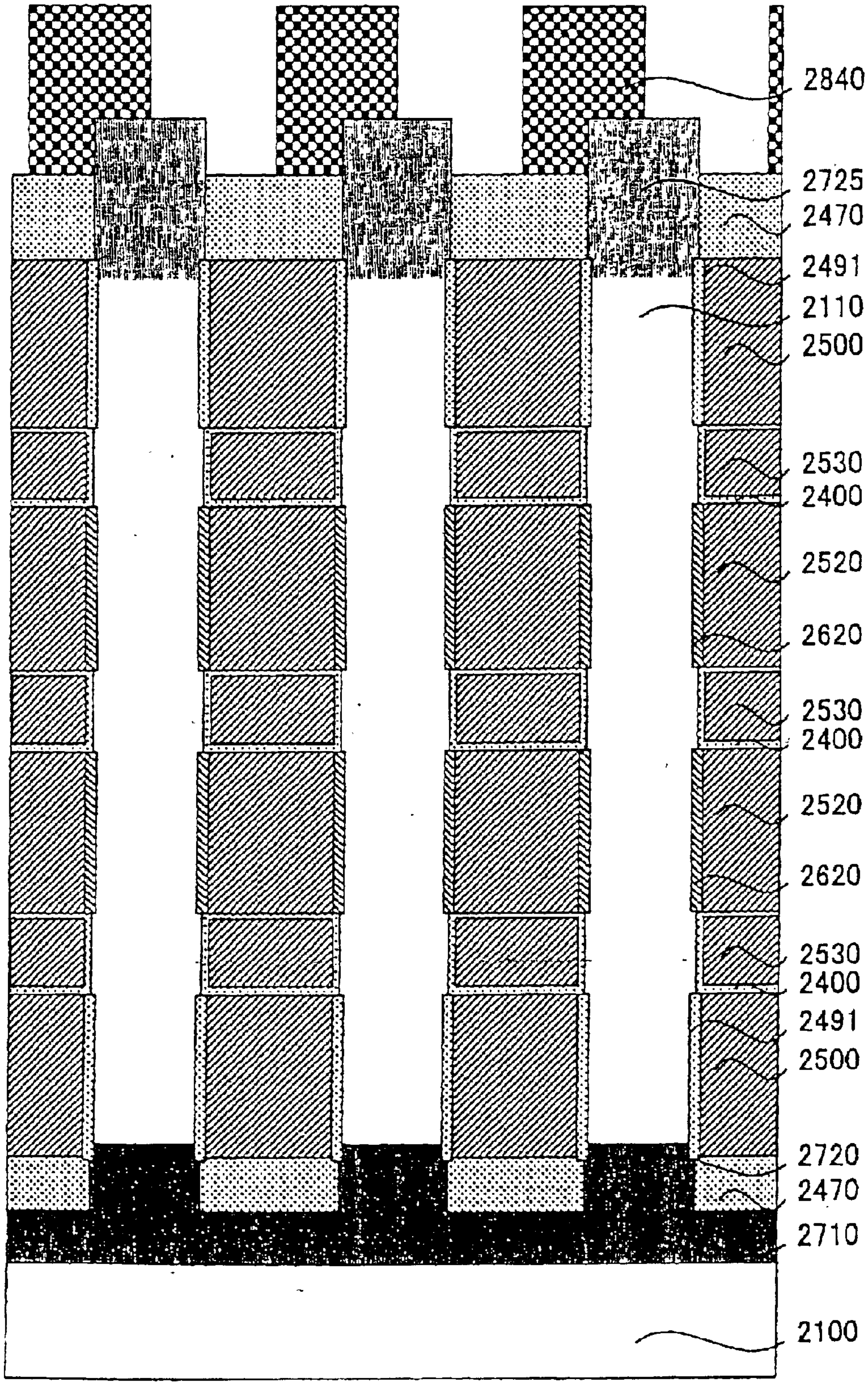
Figure 54:
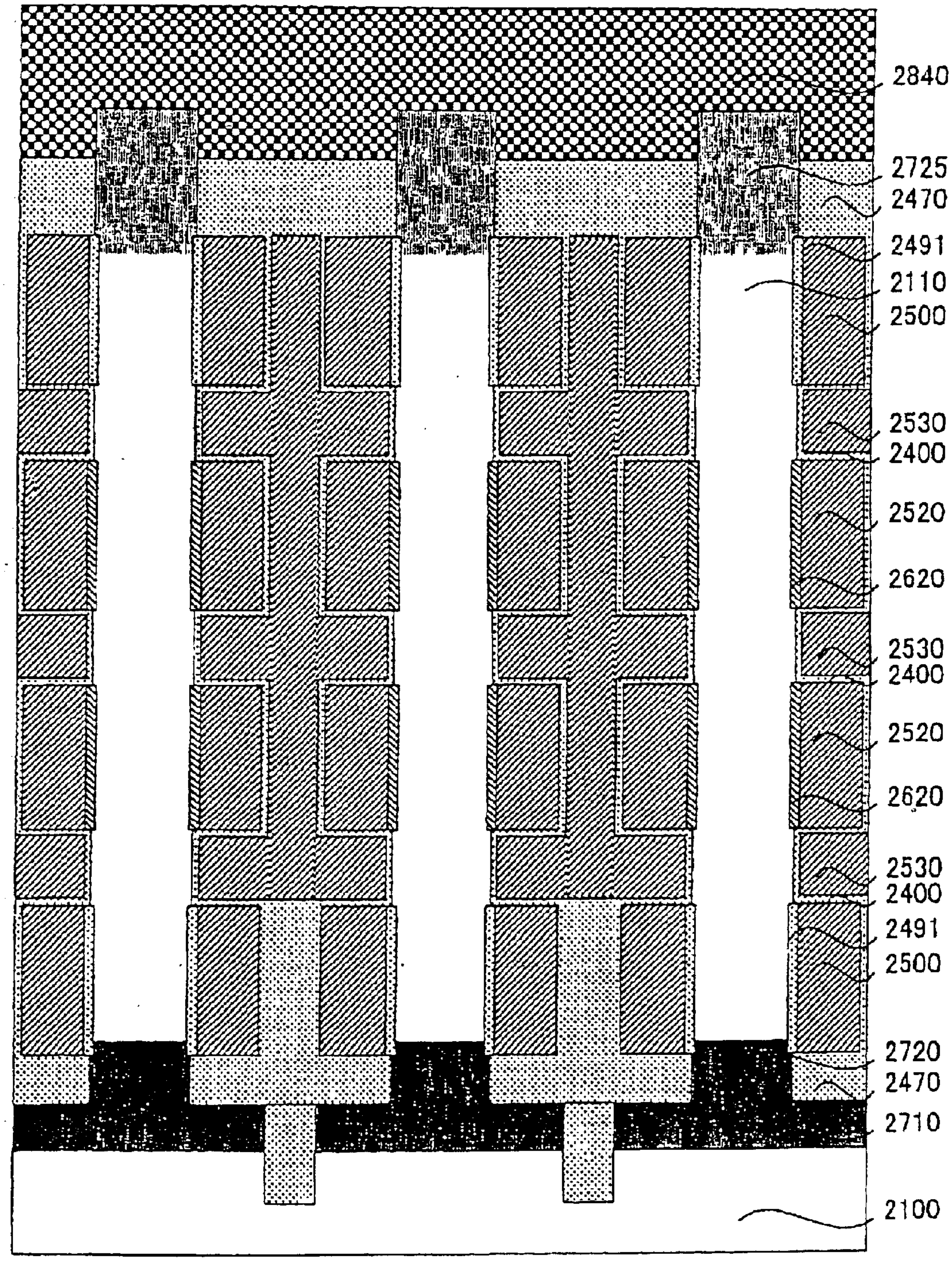
Figure 55:
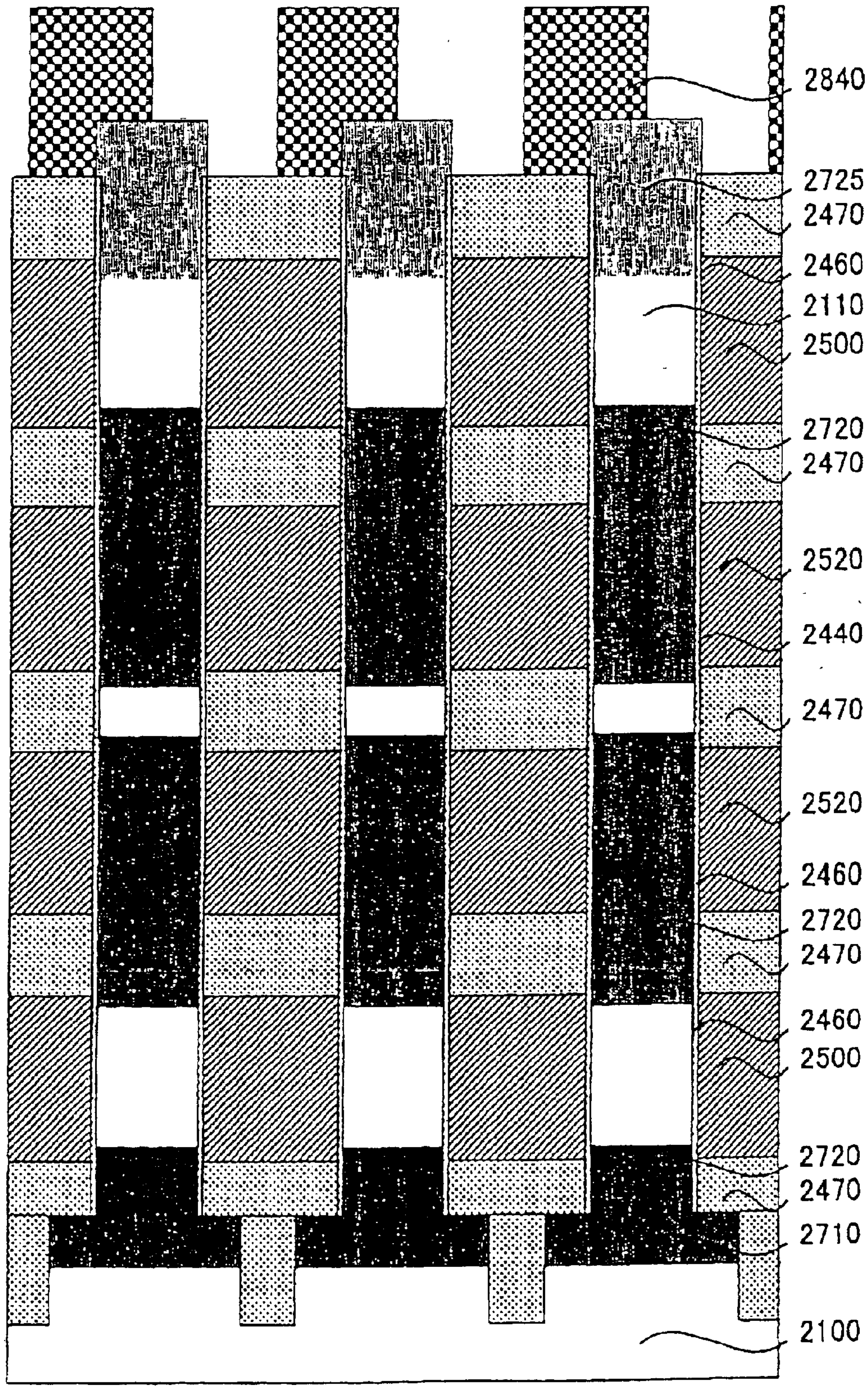
FIGS. 55 to 60 are sectional views of various semiconductor memory devices having MIS capacitors as charge storage layers in accordance with the present invention, the sectional views corresponding to those taken on line A-A' and line B-B' in FIG. 13.
Figure 56:
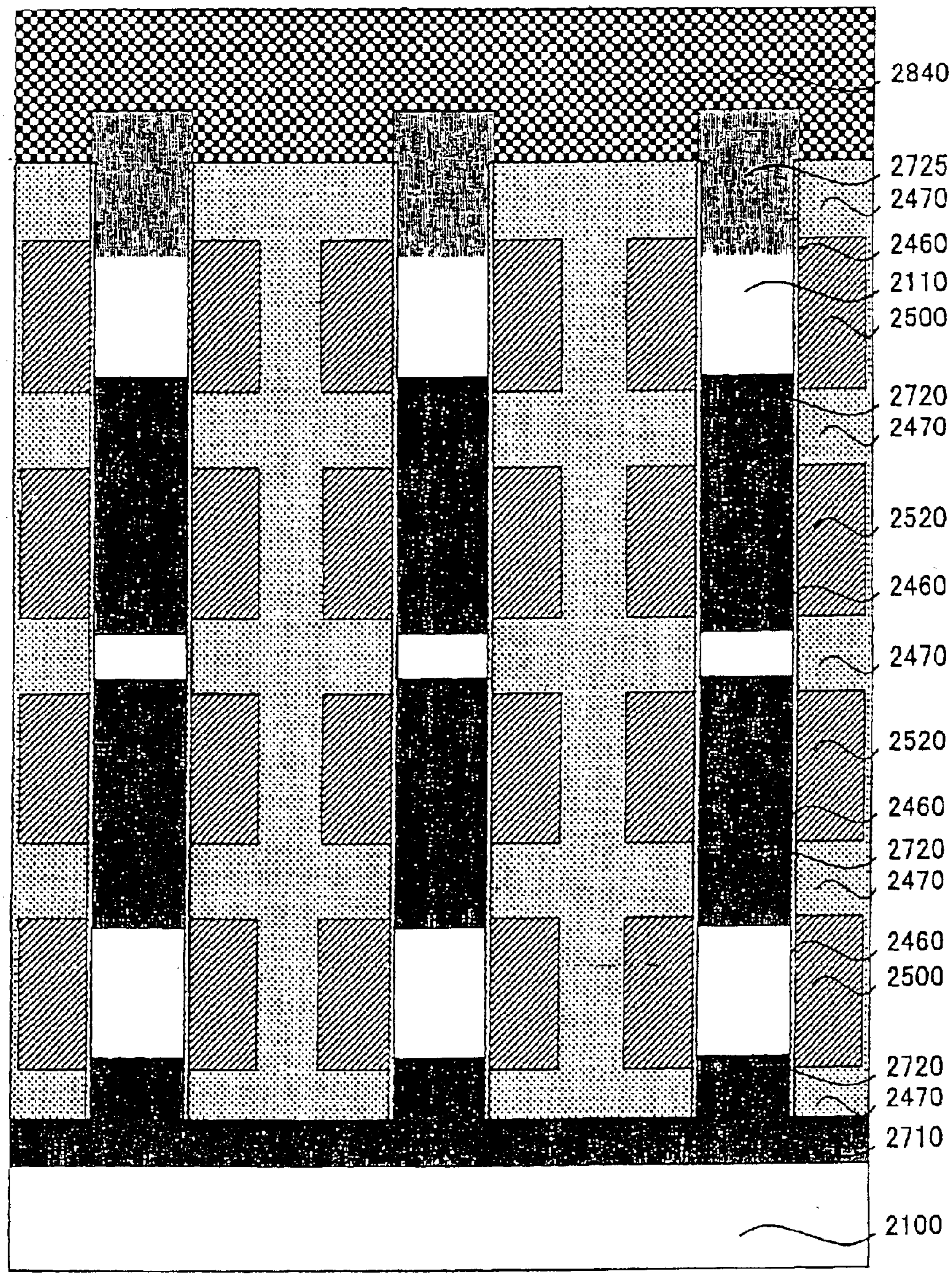
Figure 57:
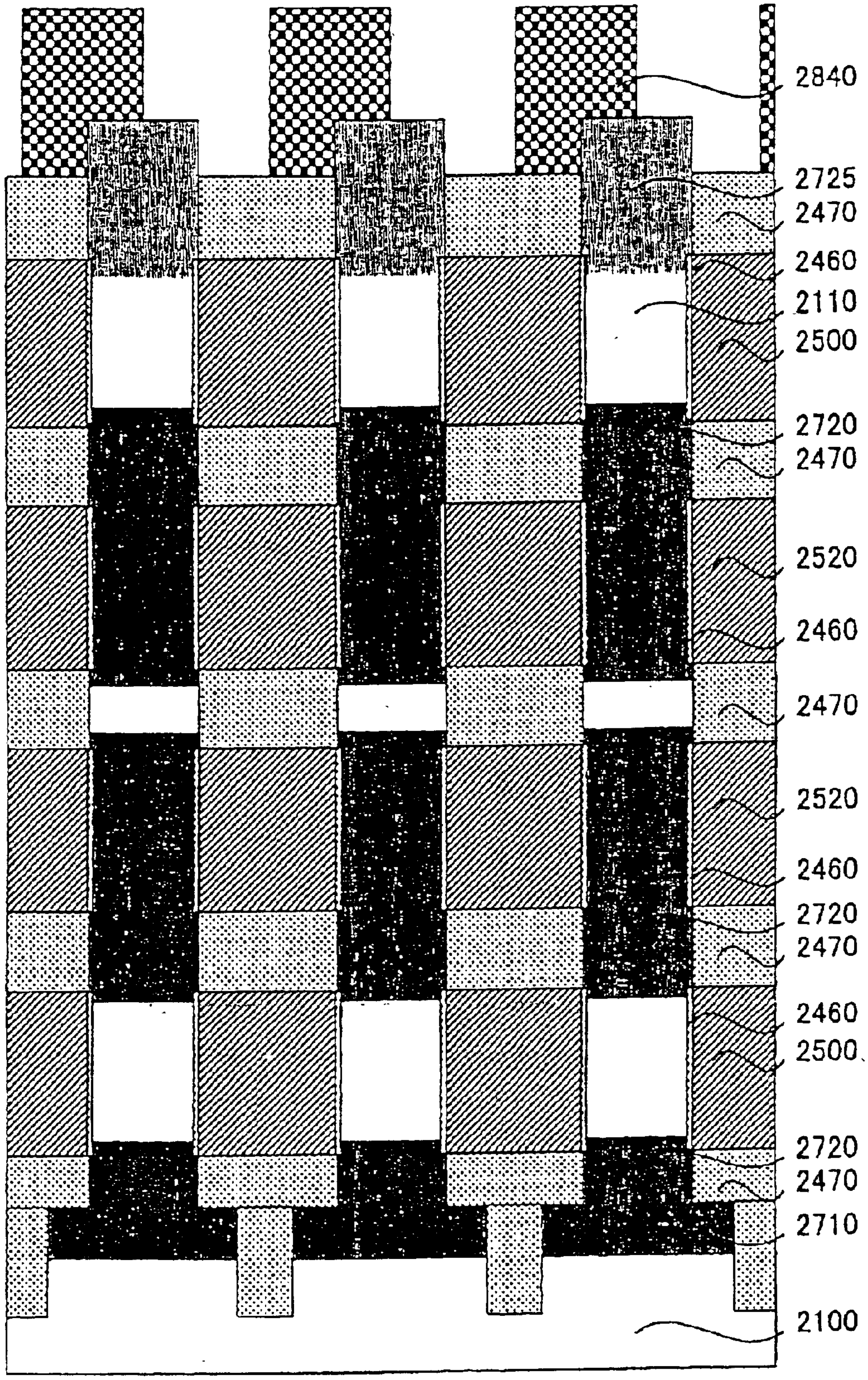
Figure 58:
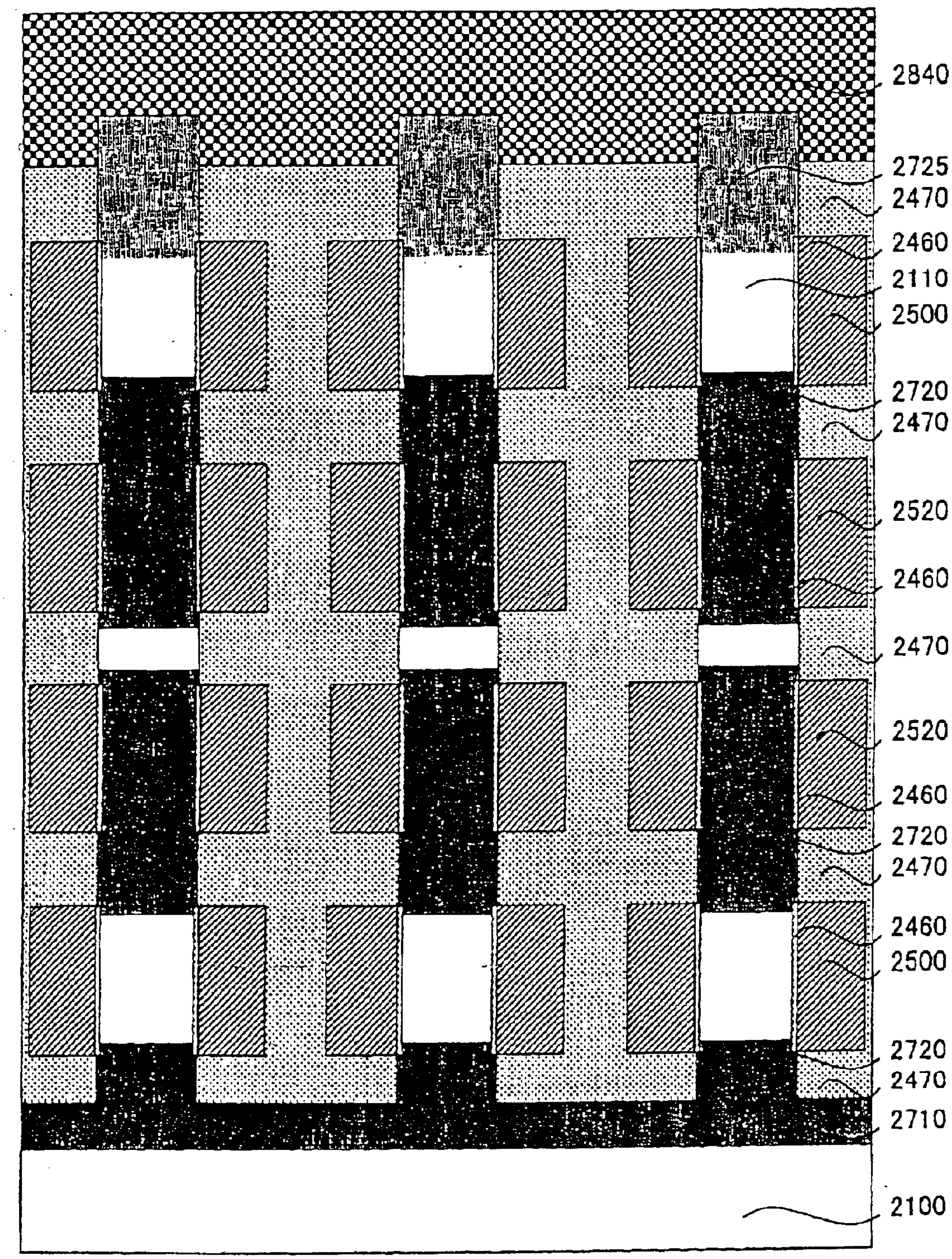

In the example of FIG. 47 and FIG. 48, in contrast to FIG. 43 and FIG. 44, the thickness of the laminated insulating films is smaller than the thickness of the gates of the selection gate transistors.

FIG. 55 to FIG. 60 show sectional views of semiconductor memories having MIS capacitors as charge storage layers. Of FIG. 55 to FIG. 60, odd-numbered figures show sectional views taken on line A-A' in FIG. 13 which is a plan view illustrating DRAM memory cell array and even-numbered figures show sectional views taken on line B-B' in FIG. 13. These examples are the same as those shown in FIG. 15 to FIG. 42 except that the charge storage layers are changed from the floating gates to the MIS capacitors, the diffusion layers are positioned on the side of memory capacitors and the bit lines (the fourth wiring) are in parallel to the source lines (the first wiring).

FIG. 61 to FIG. 64 show sectional views of semiconductor memories having MIS transistors as charge storage layers. FIG. 61 to FIG. 64 show sectional views taken on line J1-J1', J2-J2', K1-K1' and K2-K2', respectively, in FIG. 14 which is a plan view illustrating SRAM memory cell array.

Figure 61:
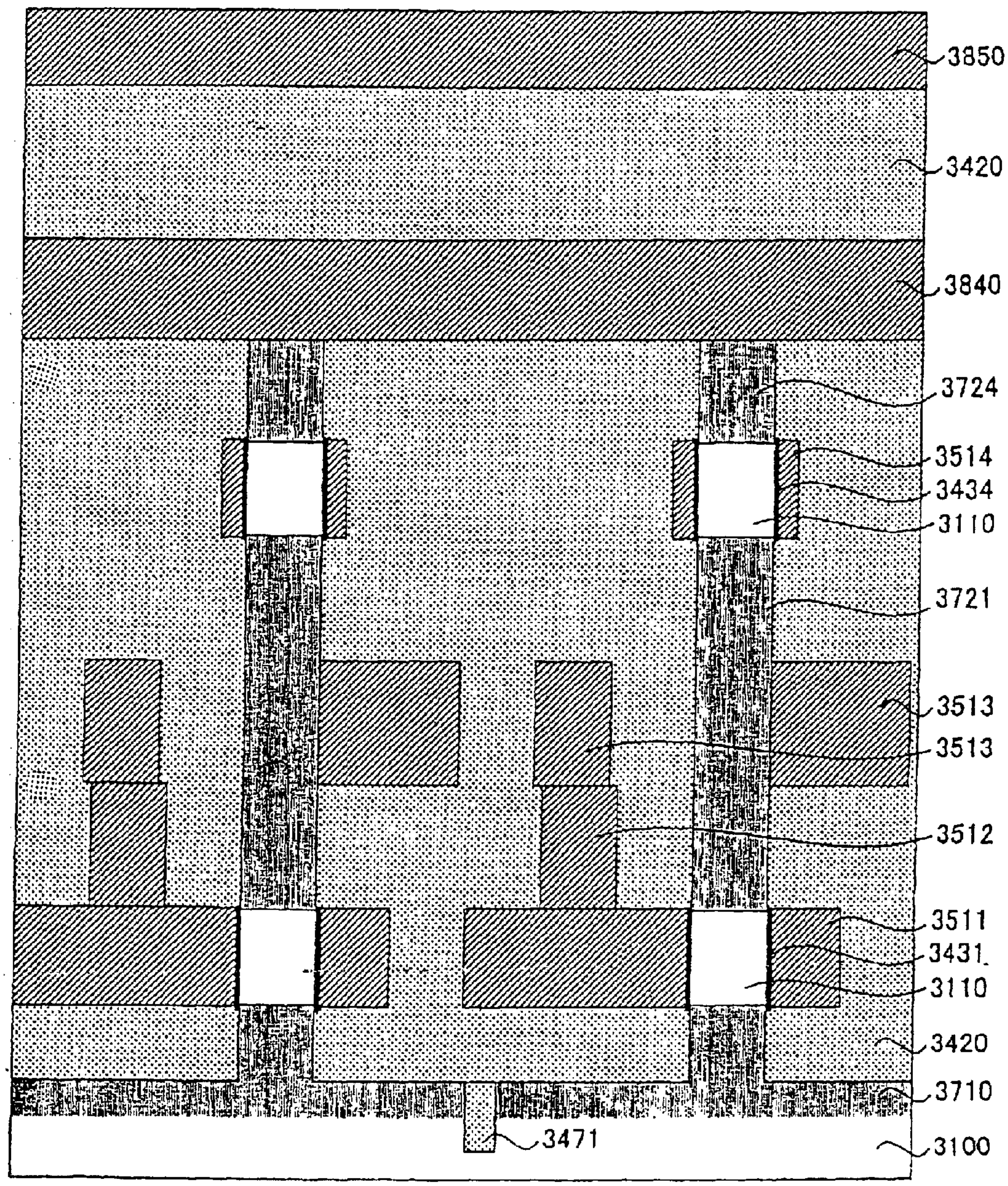
FIGS. 61 to 64 are sectional views of semiconductor memory devices having MIS transistors as charge storage layers in accordance with the present invention, the sectional views corresponding to those taken on line J1-J1', line J2-J2', line K1-K1' and line K2-K2' in FIG. 12.
Figure 63:
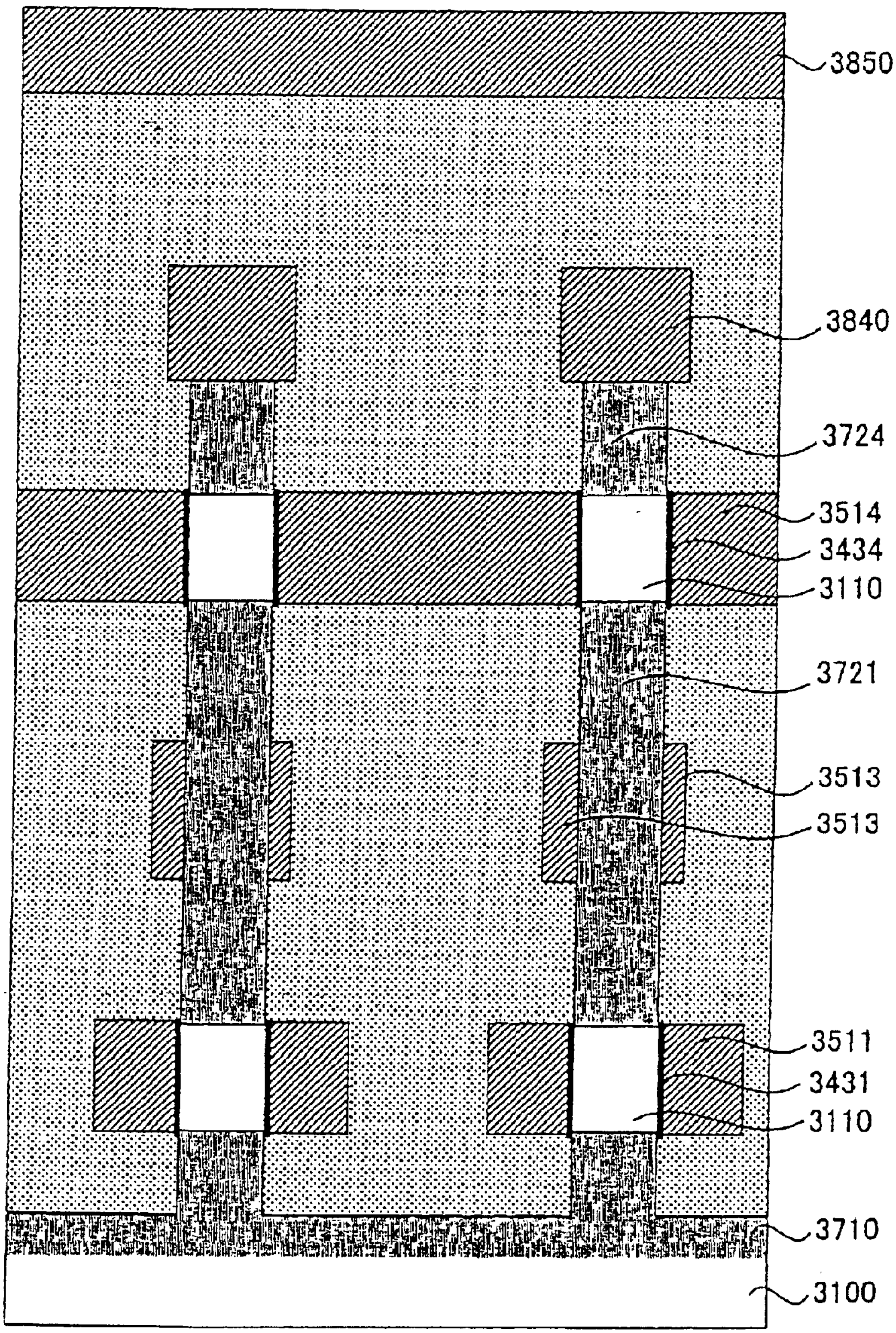

In these examples, a plurality of island-like semiconductor layers 3110 in a columnar form are formed in matrix on a P-type silicon substrate 3100. As shown in FIG. 61 and FIG. 63, two MIS transistors are disposed in an upper part and in a lower part of each island-like semiconductor layer 3110. The transistors are connected in series along each island-like semiconductor layer. More particularly, memory gates 3511 are disposed on the sidewall of each island-like semiconductor layer 3110 with intervention of a gate insulating film 3431 so as to surround the periphery of the island-like semiconductor layer 3110. A third electrode 3514 functioning as a control gate is disposed on the sidewall of the island-like semiconductor layer 3110 with intervention of a gate insulating film 3434 above the memory gate transistor. As shown in FIG. 63, the control gate 3514 is provided continuously with regard to a plurality of transistors in one direction to form a control gate line (the third wiring).

Further, as shown in FIG. 61 and FIG. 63, a first impurity diffusion layer 3710 is formed in the semiconductor substrate electrically in common to transistors disposed at the bottom so that the active regions of memory cells are in a floating state with respect to the semiconductor substrate. Further, impurity diffusion layers 3721 are formed in the island-like semiconductor layers 3110 so that the active region of each transistor is in the floating state. Impurity diffusion layers 3724 for the memory cells are formed on the tops of the respective island-like semiconductor layers 3110. Thereby the transistors are connected in series along the island-like semiconductor layers 3110.

As shown in FIG. 61 and FIG. 63, fourth wiring layers 3840 are provided as bit lines to connect second impurity diffusion layers 3724 of memory cells in a direction crossing the control gate lines.

In this example, a memory cell is constituted of four transistors and two high-resistance elements formed of a pair of island-like semiconductor layers. As shown in FIG. 61 and FIG. 63, a first conductive film 3511 which is a memory gate is connected to a second impurity diffusion layer 3721 located in an opposing island-like semiconductor layer via a second conductive film 3512 and a third conductive film 3513.

Figure 62:
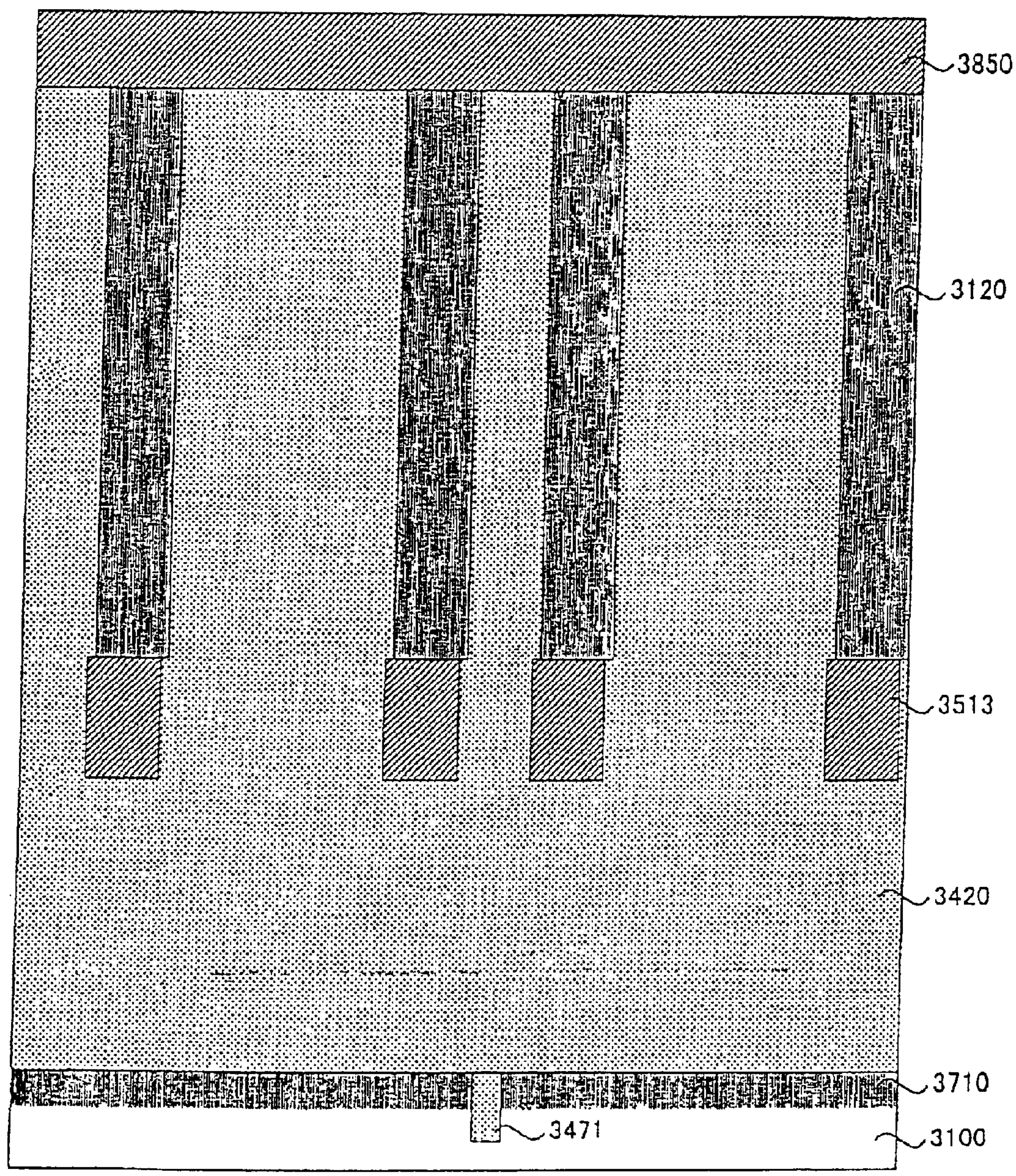
Figure 64:
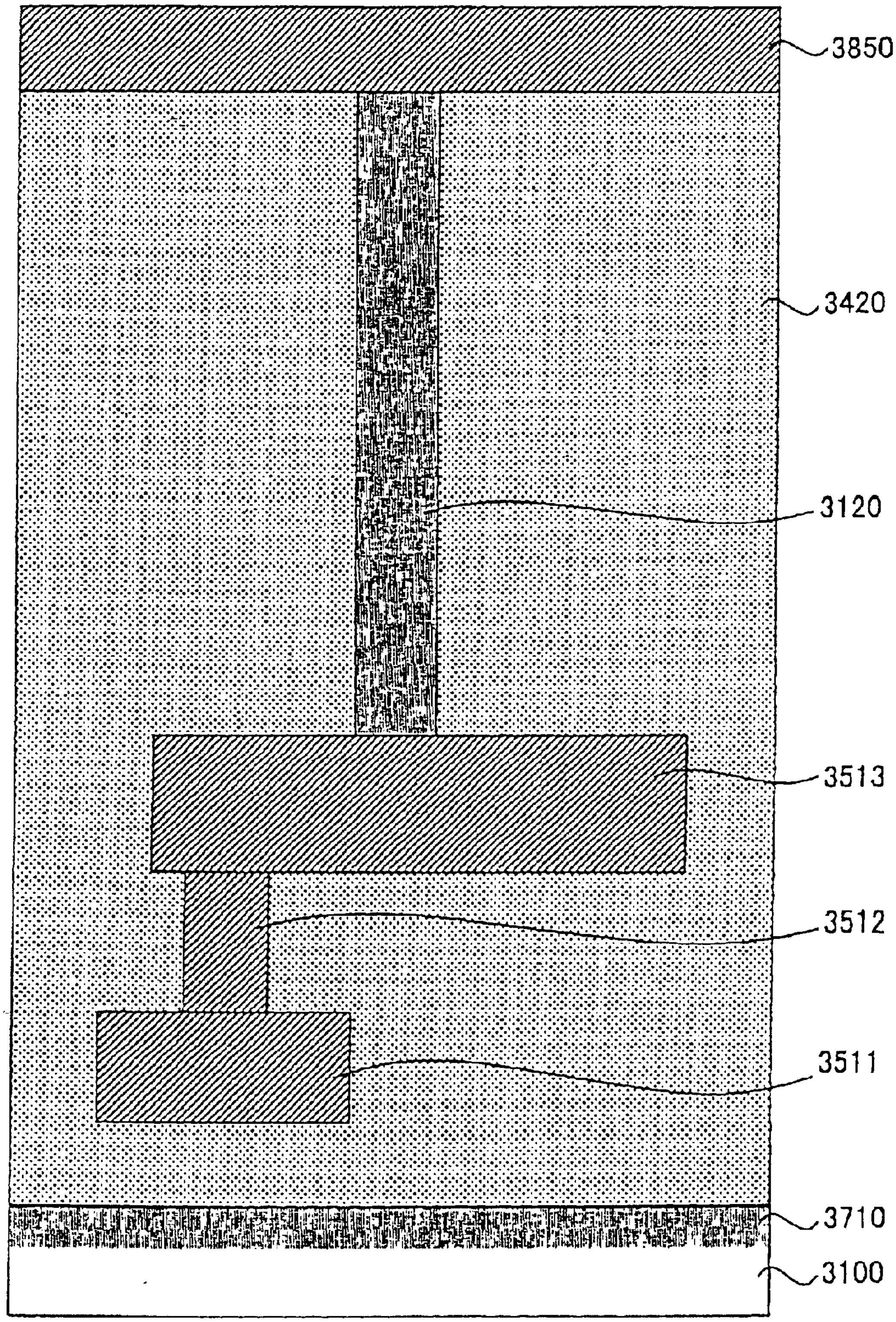

Further, as shown in FIG. 62 and FIG. 64, the third conductive film 3513 connected to the second impurity diffusion layer 3721 located in each of the island-like semiconductor layers 3110 is connected to a second wiring layer 3120 formed of an impurity diffusion layer which functions as a high-resistance element. The second wiring layers 3120 are connected to fifth wiring layers which form electrically common electrodes. A first impurity diffusion layer 3710 electrically common to memory cells adjacent in the direction of the fourth wiring layers 3840 is electrically insulated by an insulating separation film, e.g., a silicon oxide film 3471 which is an eleventh insulating film.

The memory cells and wiring layers thus arranged are insulated from each other by placing an oxide film 3420 which is a third insulating film. In this example, the memory cell is constituted of four transistors formed on sidewalls of P-type island-like semiconductor layers and two high-resistance elements. However, transistors formed on an N-type semiconductor may be used instead of the high-resistance elements. The constitution of the memory cell is not particularly limited so long as a desired function can be obtained. In FIG. 14, a fifth wiring layer 3850 is omitted for avoiding complexity.

Embodiments of Operating Principles of Memory Cell Arrays

The above-described semiconductor memories have the memory function according to the state of a charge stored in the charge storage layer. The operating principles for reading, writing and erasing data will be explained with a memory cell having a floating gate as the charge storage layer, for example.

Reading, writing and erasing processes are now explained with a semiconductor memory according to the present invention which is constructed to include a plurality of (e.g., M×N, wherein M and N are positive integers) island-like semiconductor layers each having, as selection gate transistors, a transistor provided with the second electrode as a gate electrode and a transistor provide with the fifth electrode as a gate electrode and a plurality of (e.g., L, wherein L is a positive integer) memory cells connected in series, the memory cells each provided with the charge storage layer between the selection gate transistors and the third electrode as a control gate electrode. In this memory cell array, a plurality of (e.g., M) fourth wires arranged in parallel with the semiconductor substrate are connected to end portions of the island-like semiconductor layers, and first wires are connected to opposite end portions of the island-like semiconductor layers. A plurality of (e.g., N×L) third wires are arranged in parallel with the semiconductor substrate and in a direction crossing the fourth wires and are connected to the third electrodes of the memory cells. The first wires are in parallel to the third wires.

Figure 65:
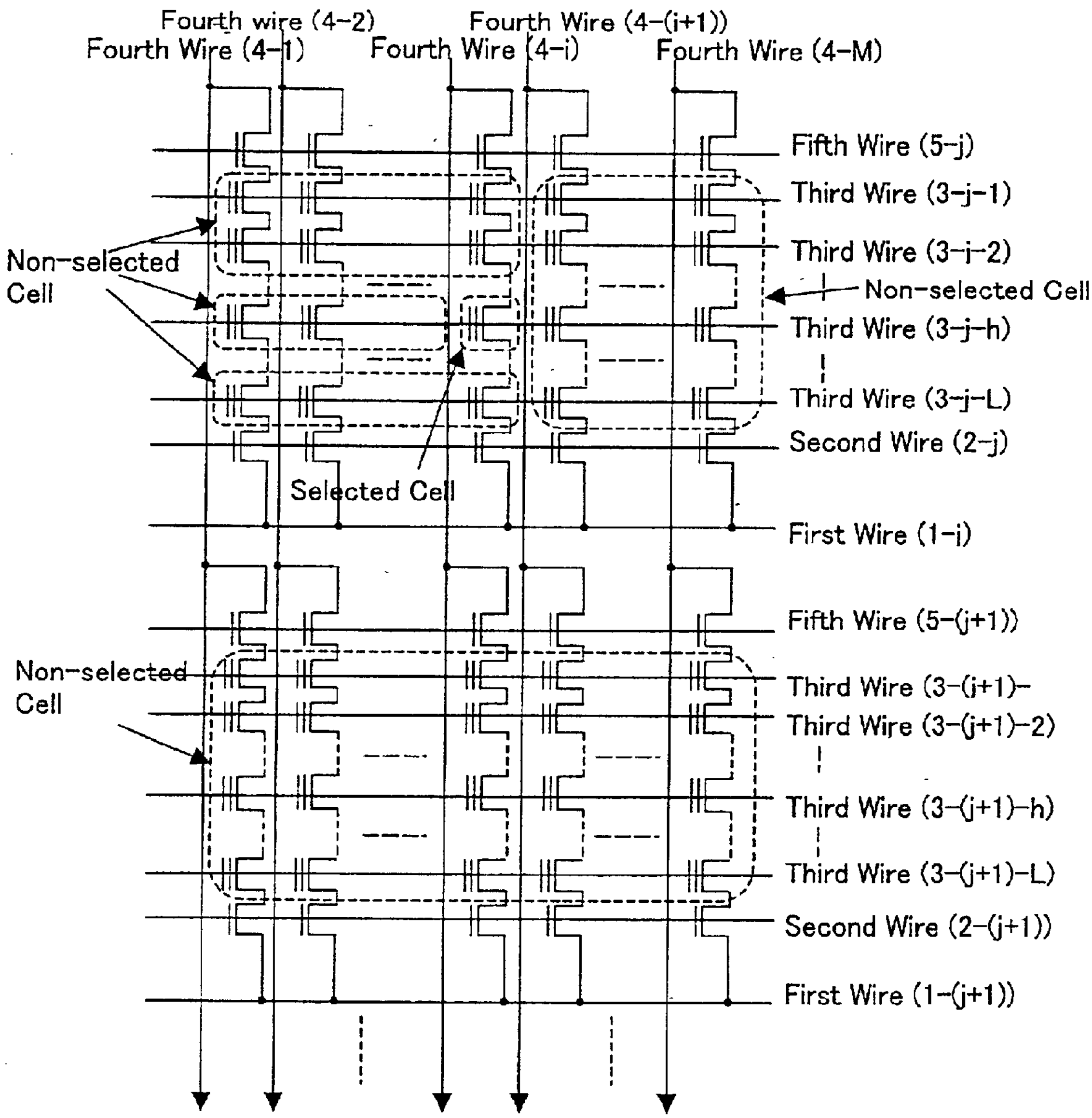
FIGS. 65 to 77 are equivalent circuit diagrams of semiconductor memory devices in accordance with the present invention.

FIG. 65 shows the equivalent circuit diagram of the above-described memory cell array. In this example, the memory cell has a threshold of 0.5 V or higher when it is in the written state and has a threshold of −0.5 V or lower when it is in the erased state.

Figure 78:
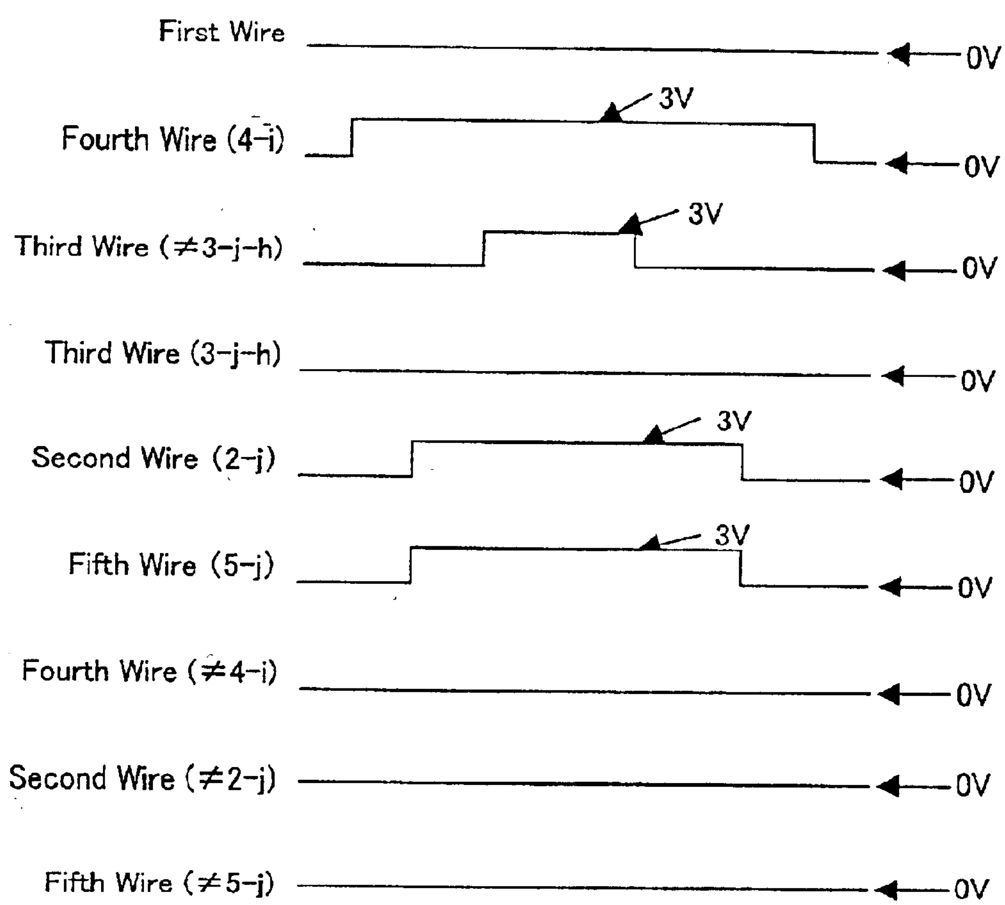
FIGS. 78 to 84 are examples of timing charts at reading, writing and erasing of a semiconductor memory device in accordance with the present invention.

Now an example of the reading process is described. FIG. 78 shows an example of timing of applying a potential to each electrode for reading data.

First, 0 V is applied to the first wires (1-1 to 1-N), the second wires (2-1 to 2-N), the third wires (3-1-1 to 3-N-L), the fourth wires (4-1 to 4-M) and the fifth wires (5-1 to 5-N), respectively. In this state, 3V is applied to the fourth wire (4-i), 3 V is applied to the second wire (2-j), 3V is applied to the fifth wire (5-j), and 3V is applied to the third wires (not 3-j-h) other than the third wire (3-j-h). Thereby a "0" or "1" is judged from a current flowing through the fourth wire (4-i) or the first wire (1-j).

The third wires (not 3-j-h) other than the third wire (3-j-h) are returned to 0 V, and the second wires (not 2-j) and the fifth wires (not 5-j) are returned to 0 V. Then the fourth wire (4-i) is returned to 0 V. The potentials may be applied to the respective wires in another order or simultaneously. In the above example, the reading process has been described with the case where the selected cell is a memory cell having the third wire (3-j-h) as the gate electrode. However, the reading process is the same with the case where the selected cell is a memory cell having a third wire other than the third wire (3-j-h) as the gate electrode.

The reading may be carried out in sequence from the third wire (3-j-L) to the third wire (3-j-1), in a reverse order or in a random order. Data may be read out simultaneously from a plurality of or all memory cells connected with the third wire (3-j-h).

Have been described above the example of the principle of reading in the case where M×N island-like semiconductor layers having a plurality of (e.g., L) memory cells arranged in series and selection transistors formed to sandwich the memory cells are formed and the first wires and the third wires are arranged in parallel to each other. By providing the selection gates in the top and the bottom of a set of memory cells, it is possible to prevent the phenomenon that a cell current flows even through a non-selected cell in the case where a memory cell transistor is over-erased, i.e., a threshold is negative and a reading gate voltage is 0 V.

Figure 79:
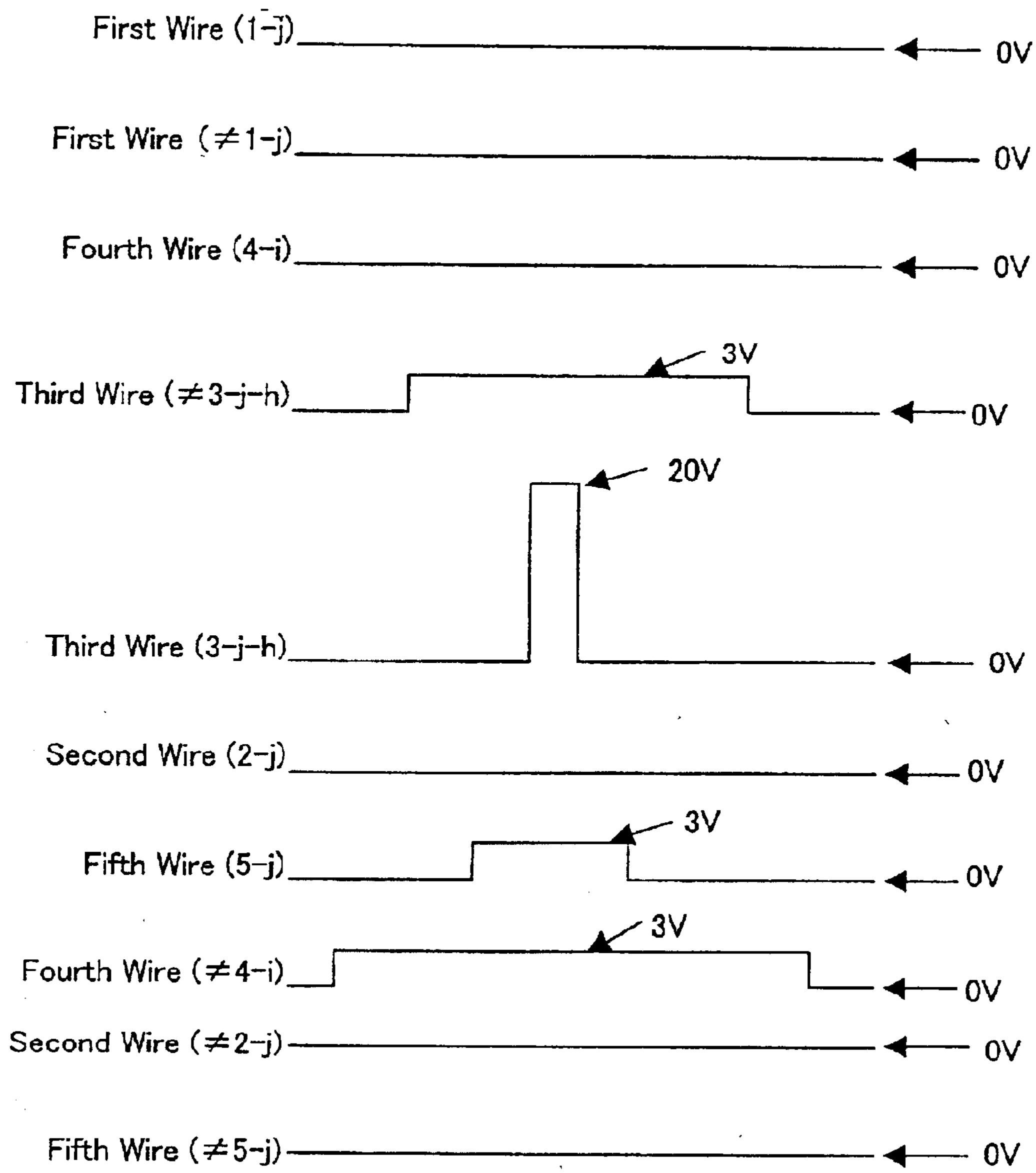

Now an example of the writing process is described. FIG. 79 shows an example of timing of applying a potential to each electrode for writing data.

First, 0 V is applied to the first wires (1-1 to 1-N), the second wires (2-1 to 2-N), the third wires (3-1-1 to 3-N-L), the fourth wires (4-1 to 4-M) and the fifth wires (5-1 to 5-N), respectively. In this state, 3 V is applied to the fourth wires (not 4-i) other than the fourth wire (4-i), 1 V is applied to the fifth wire (5-j), 3 V is applied to the third wires (not 3-j-h) other than the third wire (3-j-h), and then 20 V is applied to the third wire (3-j-h). This state is maintained for a desired period of time to generate a state in which a high potential is applied only to a region between the channel and the control gate of the selected cell. Electrons are injected from the channel to the charge storage layer by F-N tunneling phenomenon. By applying 3 V to the fourth wires (not 4-i) other than the fourth wire (4-i), is cut off the selection gate transistor having the fifth electrode in the island-like semiconductor layer which does not include the selected cell, thereby data writing is not performed.

Thereafter, the third wire (3-j-h) is returned to 0 V, the second wire (2-i) and the fifth wire (5-j) are returned to 0 V, and then the third wires (not 3-j-h) other than the third wire (3-j-h) are returned to 0 V. Then, the fourth wire (4-i) is returned to 0 V.

The timing of applying the potentials to the respective electrodes may be in another order or simultaneous. The potentials applied may be any combination of potentials so long as they satisfy conditions for storing negative electric charges of not less than a certain amount in the charge storage layer of a desired cell. In the above example, the writing process has been described with the case where the selected cell is a memory cell having the third wire (3-j-h) as the gate electrode. However, the writing process is the same with the case where the selected cell is a memory cell having a third wire other than the third wire (3-j-h) as the gate electrode. The writing may be carried out in sequence from the third wire (3-j-L) to the third wire (3-j-1), in a reverse order or in a random order. Data may be written simultaneously in a plurality of or all memory cells connected with the third wire (3-j-h).

Figure 84:
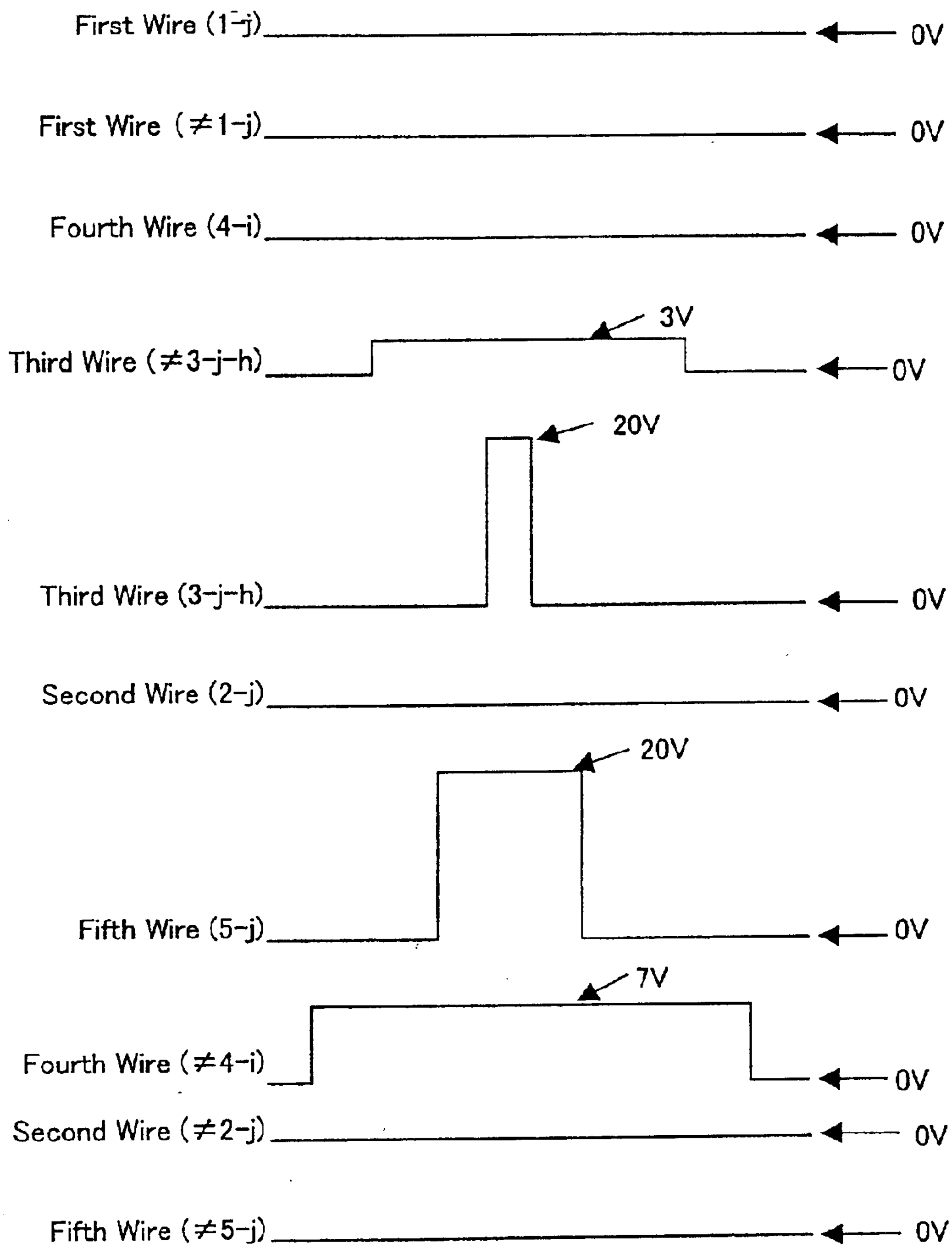
Figure 85:
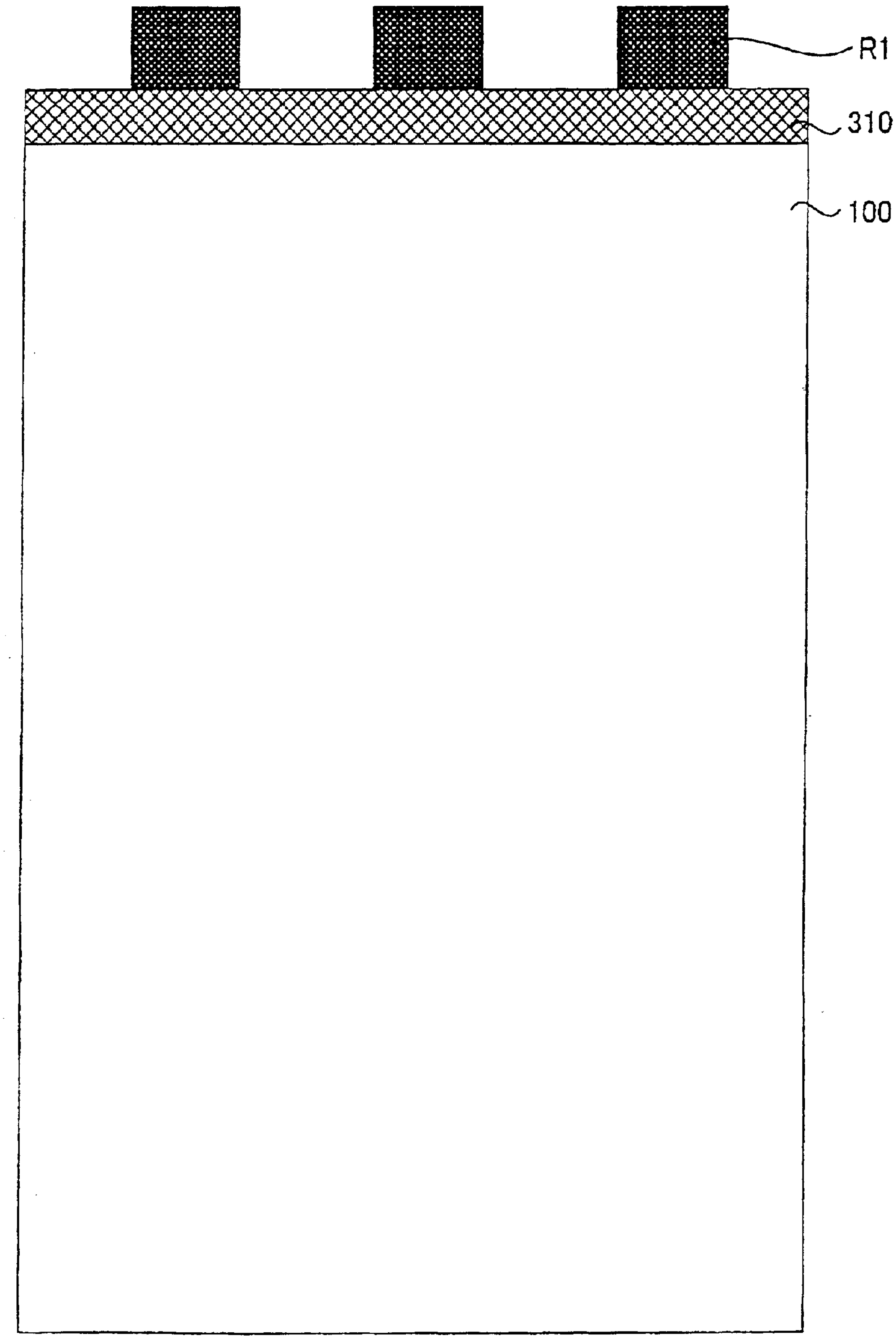
FIGS. 85 to 125 are sectional views (taken on line A-A' and line B-B' in FIG. 1) illustrating production steps for producing a semiconductor memory device in accordance with the present invention.

Further, described is an example of data writing wherein the selection gate transistor having the fifth electrode in the island-like semiconductor layer which does not include the selected cell is not cut off. FIG. 84 shows an example of timing of applying a potential to each electrode for writing data.

First, for example, 0 V is applied to the first wires (1-1 to 1-N), the second wires (2-1 to 2-N), the third wires (3-1-1 to 3-N-L), the fourth wires (4-1 to 4-M) and the fifth wires (5-1 to 5-N), respectively. In this state, 7 V is applied to the fourth wires (not 4-i) other than the fourth wire (4-i), 20 V is applied to the fifth wire (5-j), 3 V is applied to the third wires (not 3-j-h) other than the third wire (3-j-h), and then 20 V is applied to the third wire (3-j-h). This state is maintained for a desired period of time to generate potential difference of about 20 V between the channel and the control gate of the selected cell. Electrons are injected from the channel to the charge storage layer by F-N tunneling phenomenon for writing data.

At this time, there is generated a potential difference of about 13 V between the channel and the control gate of a non-selected cell connected to the third wire (3-j-h). However, in a period for data writing to the selected cell, electrons are not injected to the non-selected cell in an amount enough to vary the threshold of the non-selected cell, thereby data is not written in the non-selected cell.

Thereafter, the third wire (3-j-h) is returned to 0 V, the fifth wire (5-j) is returned to 0 V, and then the third wires (not 3-j-h) other than the third wire (3-j-h) are returned to 0 V. Then, the fourth wires (not 4-i) are returned to 0 V.

The timing of applying the potentials to the respective electrodes may be in another order or simultaneous. The potentials applied may be any combination of potentials so long as they satisfy conditions for storing negative electric charges of not less than a certain amount in the charge storage layer of a desired cell. In the above example, the writing process has been described with the case where the selected cell is a memory cell having the third wire (3-j-h) as the gate electrode. However, the writing process is the same with the case where the selected cell is a memory cell having a third wire other than the third wire (3-j-h) as the gate electrode. The writing may be carried out in sequence from the third wire (3-j-L) to the third wire (3-j-1), in a reverse order or in a random order. Data may be written simultaneously in a plurality of or all memory cells connected with the third wire (3-j-h).

Figure 67:
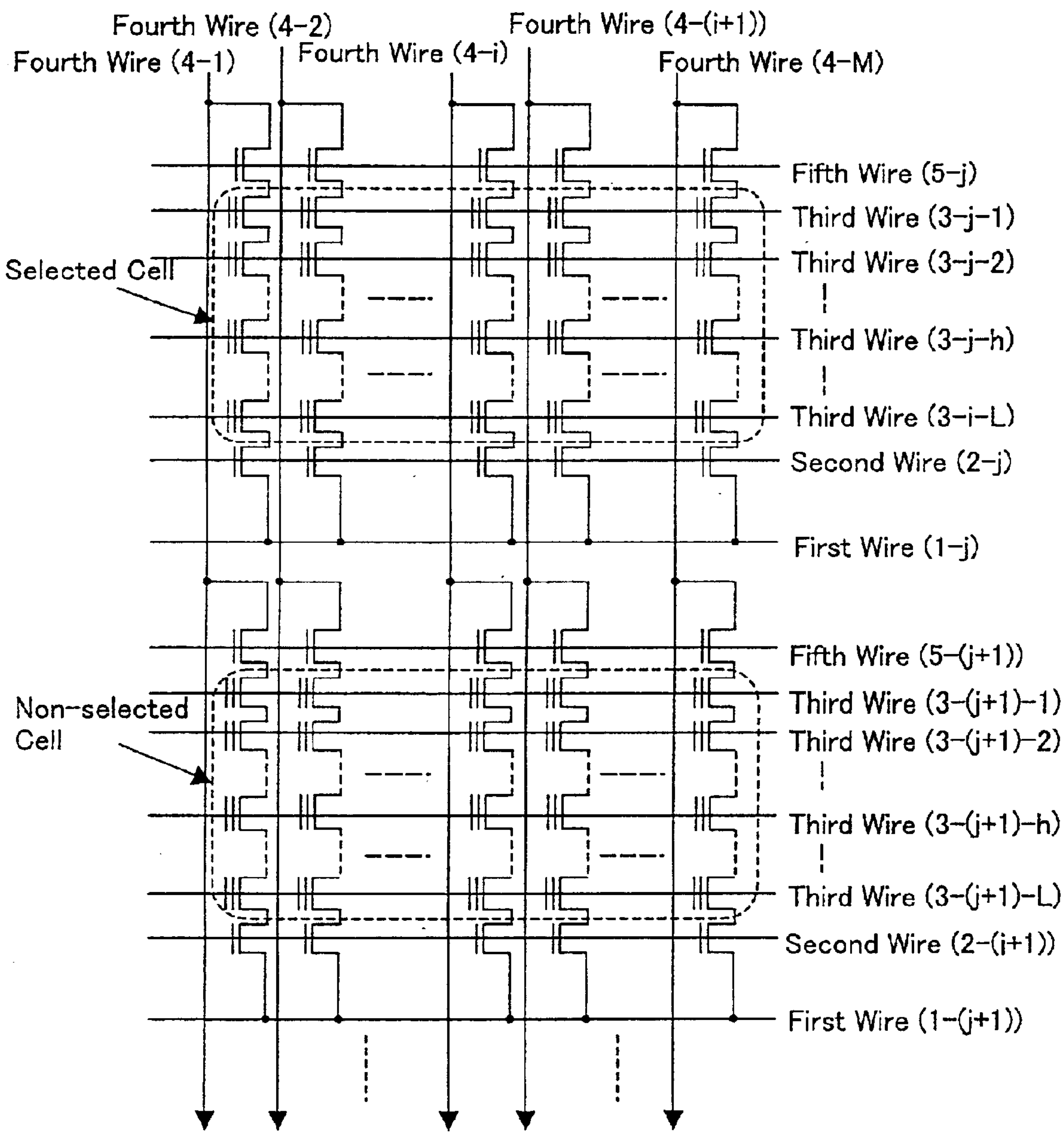
Figure 80:
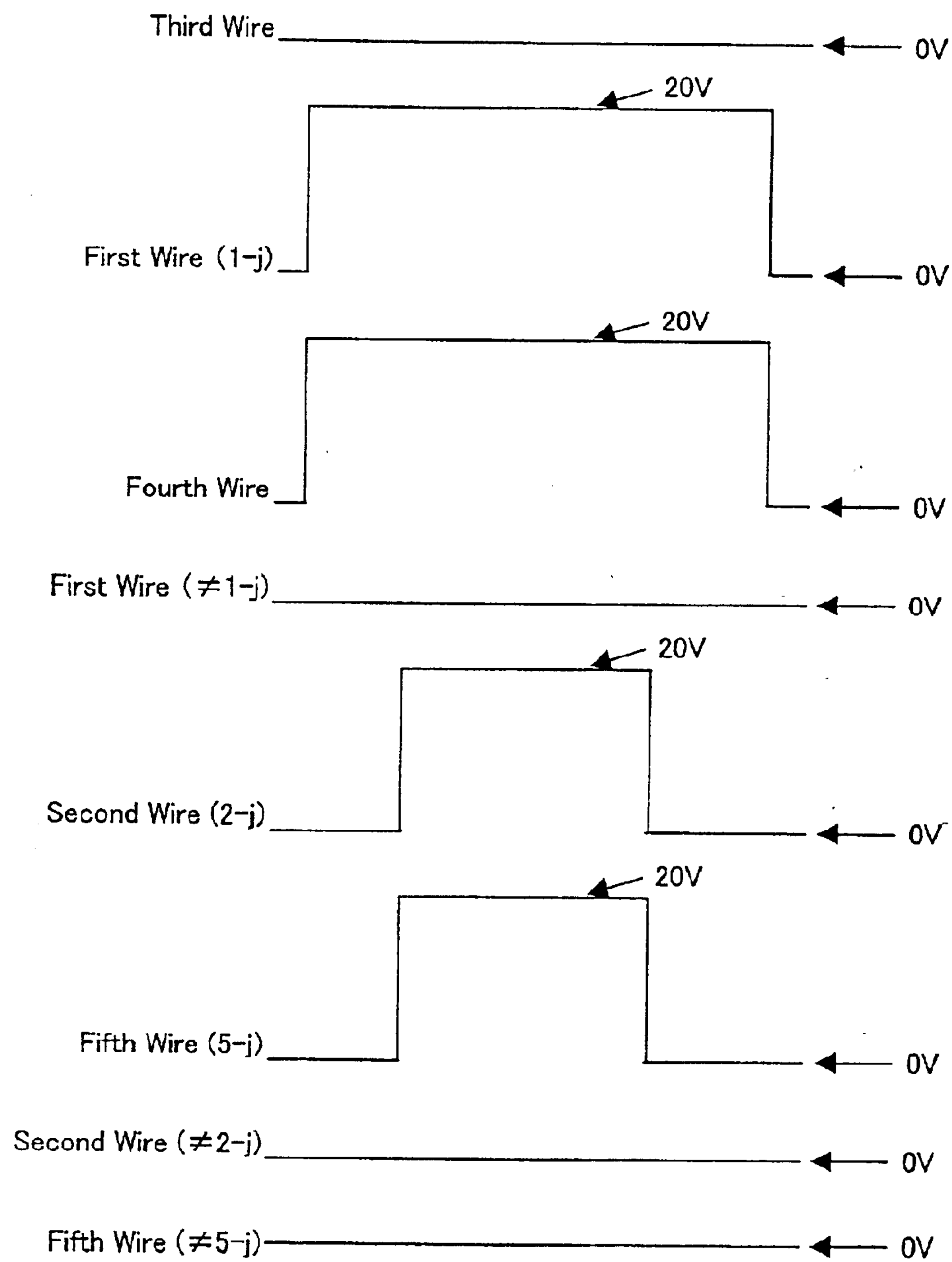

Now an example of the erasing process is described. FIG. 80 shows an example of timing of applying each potential for erasing data. The data erasing is performed for every block or for chips at once as shown in FIG. 67 illustrating a selected area.

First, for example, 0 V is applied to the first wires (1-1 to 1-N), the second wire (2-j), the third wires (3-1-1 to 3-N-L), the fourth wires (4-1 to 4-M) and the fifth wire (5-j), respectively. In this state, 20 V is applied to the fourth wires (4-1 to 4-M), 20 V is applied to the first wire (1-j), 20 V is applied to the second wire (2-j), and then 20 V is applied to the fifth wire (5-j). This state is maintained for a desired period of time to withdraw the electrons from the charge storage layer of the selected cell by F-N tunneling phenomenon for erasing data.

Thereafter, the second wire (2-j) and the fifth wire (5-j) are returned to 0 V, and then the fourth wires (4-1 to 4-M) are returned to 0 V. Then, the first wire (1-i) is returned to 0 V.

The timing of applying the potentials to the respective electrodes may be in another order or simultaneous. The potentials applied may be any combination of potentials so long as they satisfy conditions for decreasing the threshold of a desired cell. In the above example, the erasing process has been described with the case where the selected cell is a memory cell having the third wires (3-j-1 to 3-j-L) as the gate electrodes. However, the erasing process is the same with the case where the selected cell is a memory cell having a third wire other than the third wire (3-j-1 to 3-j-L) as the gate electrode.

The erasing may be carried out simultaneously with respect to all memory cells connected to the third wires (3-j-1 to 3-j-L), or with respect to a plurality of or all memory cells connected with the third wires (3-1-1 to 3-N-L).

Reading, writing and erasing processes are now explained with a semiconductor memory according to the present invention which is constructed to include a plurality of (e.g., M×N, wherein M and N are positive integers) island-like semiconductor layers each having, two memory cells connected in series, the memory cells each provided with the charge storage layer and the third electrode as a control gate electrode. In this memory cell array, a plurality of (e.g., M)

fourth wires arranged in parallel with the semiconductor substrate are connected to end portions of the island-like semiconductor layers, and first wires are connected to opposite end portions of the island-like semiconductor layers. A plurality of (e.g., N×2) third wires are arranged in parallel with the semiconductor substrate and in a direction crossing the fourth wires and are connected to the third electrodes of the memory cells. The first wires are arranged in parallel with the third wires.

Figure 66:
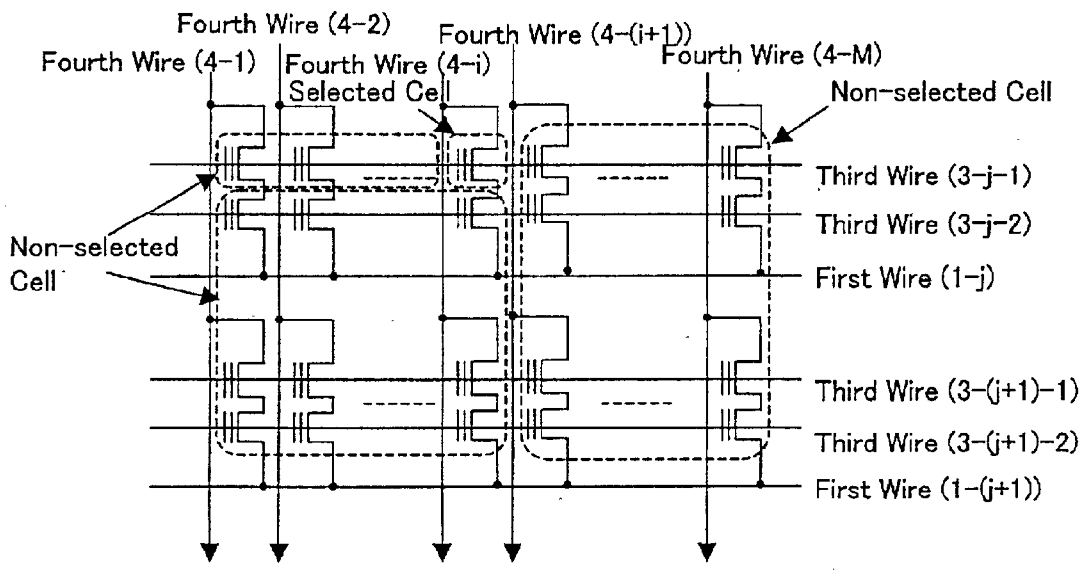

FIG. 66 shows an equivalent circuit diagram of the above-described memory cell array. In this example, the memory cell has a threshold of 4 V or higher when it is in the written state and has a threshold of 0.5 V or higher to 3 V or lower when it is in the erased state.

Figure 81:
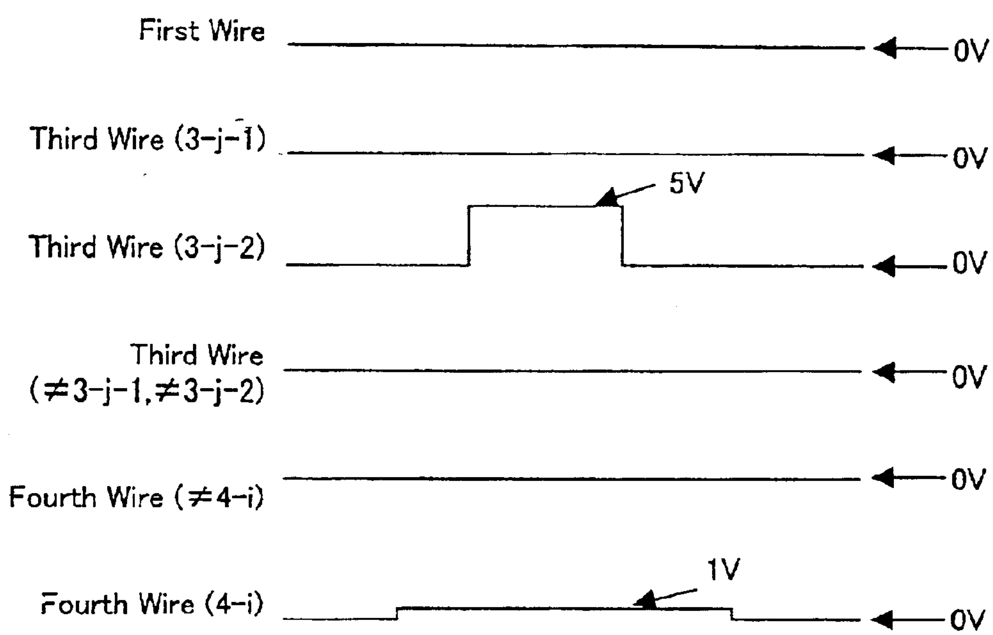

Now an example of the reading process is described. FIG. 81 shows an example of timing of applying a potential to each electrode for reading data.

First, 0 V is applied to the first wires (1-1 to 1-N), the third wires (3-j-1 and 3-j-2), the third wires (not 3-j-1, not 3-j-2) and the fourth wires (4-1 to 4-M); respectively. In this state, 1 V is applied to the fourth wire (4-i), and then 5 V is applied to the third wire (3-j-2). Thereby a "0" or "1" is judged from a current flowing through the fourth wire (4-i) or the first wire (1-j, wherein j is a positive integer, 1≦j≦N). Then, the third wire (3-j-2) is returned to 0 V, and then the fourth wire (4-i) is returned to 0 V. The potentials may be applied to the respective wires in another order or simultaneously. In the above example, the reading process has been described with the case where the selected cell is a memory cell having the third wire (3-j-1) as the gate electrode. However, the reading process is the same with the case where the selected cell is a memory cell having a third wire other than the third wire (3-j-1) as the gate electrode. The reading may be carried out in sequence from the third wire (3-j-2) to the third wire (3-j-1), in a reverse order or in a random order. Data may be read out simultaneously from a plurality of or all memory cells connected with the third wire (3-j-1).

Figure 82:
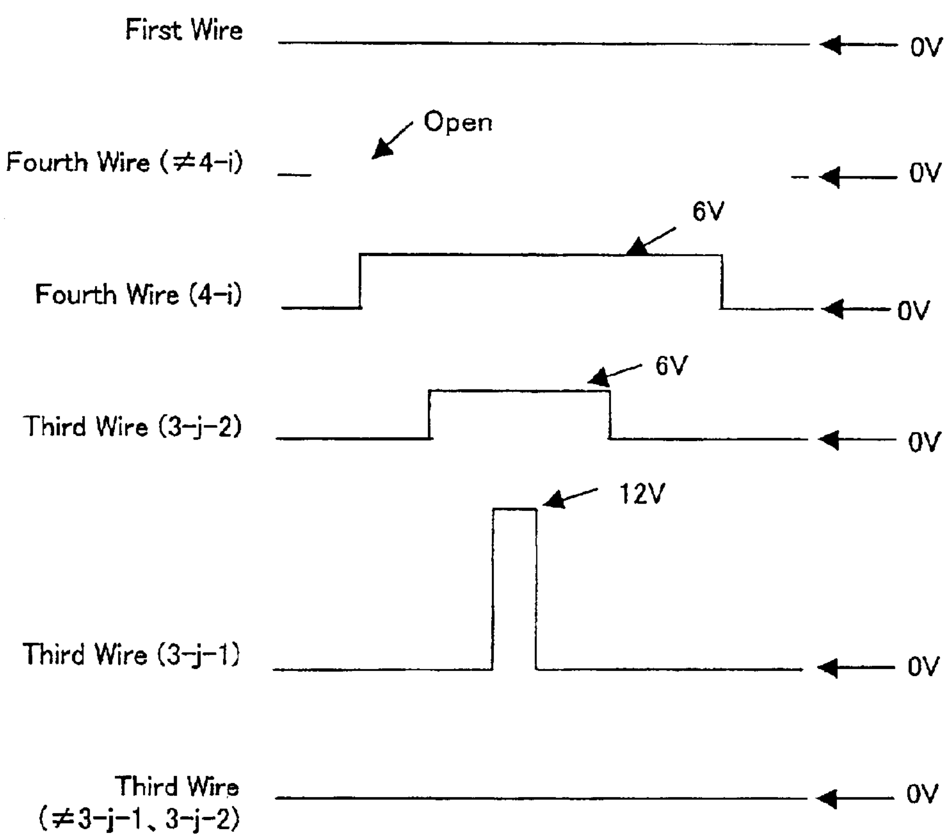

Now an example of the writing process is described. FIG. 82 shows an example of timing of applying a potential to each electrode for writing data. First, 0 V is applied to the first wires (1-1 to 1-N), the third wires (3-1-1 to 3-N-2) and the fourth wires (4-1 to 4-M), respectively. In this state, the fourth wires (not 4-i) other than the fourth wire (4-i) are opened. Then, 6 V is applied to the fourth wire (4-i), 6 V is applied to the third wire (3-j-2), and then 12 V is applied to the third wire (3-j-1). This state is maintained for a desired period of time to generate channel hot electrons in the neighborhood of the diffusion layer at a high potential side of the selected cell. The generated electrons are injected to the charge storage layer of the selected cell by use of a high potential applied to the third wire (3-j-1) for writing data.

Thereafter, the third wire (3-j-1) is returned to 0 V, the third wire (3-j-2) is returned to 0 V, the fourth wire (4-i) is returned to 0 V, and then the fourth wires (not 4-i) are returned to 0 V. The timing of applying the potentials to the respective electrodes may be in another order or simultaneous. The potentials applied may be any combination of potentials so long as they satisfy conditions for storing negative electric charges of not less than a certain amount in the charge storage layer of a desired cell. In the above example, the writing process has been described with the case where the selected cell is a memory cell having the third wire (3-j-1) as the gate electrode. However, the writing process is the same with the case where the selected cell is a memory cell having a third wire other than the third wire (3-j-1) as the gate electrode. The writing may be carried out to the third wire (3-j-2) and the third wire (3-j-1) in this order or in a reverse order. Data may be written simultaneously in a plurality of or all memory cells connected with the third wire (3-j-1).

Figure 83:
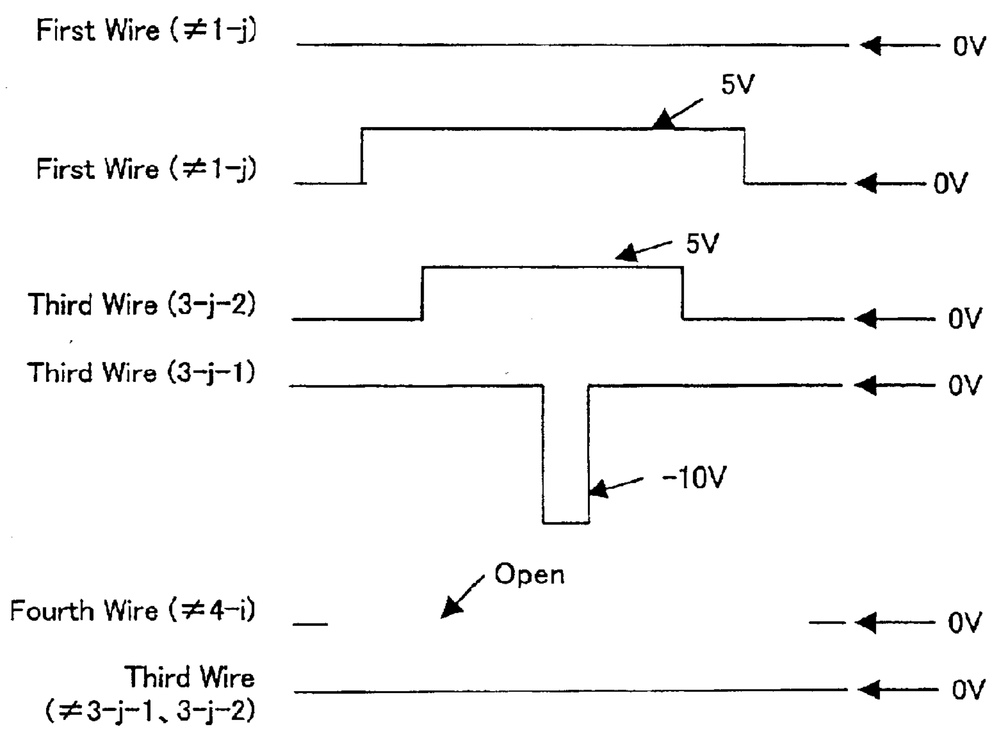

Now an example of the erasing process is described. FIG. 83 shows an example of timing of applying each potential for erasing data. The data erasing is performed block by block, or only in an upper row or a lower row in a word line or a block.

First, for example, 0 V is applied to the first wires (1-1 to 1-N), the third wires (3-1-1 to 3-N-2) and the fourth wires (4-1 to 4-M), respectively. In this state, the fourth wires (4-1 to 4-M) are opened. Then, 5 V is applied to the first wire (1-j), 5 V is applied to the third wire (3-j-2), and then 10 V is applied to the third wire (3-j-1). This state is maintained for a desired period of time to withdraw the electrons from the charge storage layer of the selected cell by F-N tunneling phenomenon for erasing data. Thereafter, the third wire (3-j-1) is returned to 0 V, the third wire (3-j-2) is returned to 0 V, the first wire (1-j) is returned to 0 V, and then the fourth wires (4-1 to 4-M) are returned to 0 V. The timing of applying the potentials to the respective electrodes may be in another order or simultaneous. The potentials applied may be any combination of potentials so long as they satisfy conditions for decreasing the threshold of a desired cell. In the above example, the erasing process has been described with the case where the selected cell is a memory cell having the third wire (3-j-1) as the gate electrode. However, the erasing process is the same with the case where the selected cell is a memory cell having a third wire other than the third wire (3-j-1) as the gate electrode. Data may be erased simultaneously from a plurality of or all memory cells connected with the third wires (3-j-1 to 3-j-2), or from a plurality of or all memory cells connected with the third wires (3-1-1 to 3-N-2).

Have been described examples of the operation principles of reading, writing and erasing data in the case where there are arranged M×N (M and N are positive integers) island-like semiconductor layers having a plurality of memory cells which are formed of the P-type semiconductor and arranged in series and selection transistors formed to sandwich the memory cells therebetween and the first wires and the third wires are arranged in parallel, and in the case where there are arranged M×N (M and N are positive integers) island-like semiconductor layers having two memory cells which are formed of the P-type semiconductor and arranged in series and the first wires and the third wires are arranged in parallel. The polarity of all the electrodes may be reversed as in the case of island-like semiconductor layers formed of an N-type semiconductor. At this time, the potentials have a relationship in magnitude reverse to that mentioned above. The above examples of reading, writing and erasing operations have been given of the case where the first wires and the third wires are arranged in parallel. However, the operation principles are also true of the case where the first wires and the fourth wires are arranged in parallel and the case where the first wires are formed in common throughout the array, by applying the potentials corresponding to the respective wires. If the first wires and the fourth wires are arranged in parallel, the erasing can be performed on a block basis or a bit line basis.

Now explanation is given of memory cells other than the above-described memory cells having floating gates as the charge storage layers.

Figure 68:
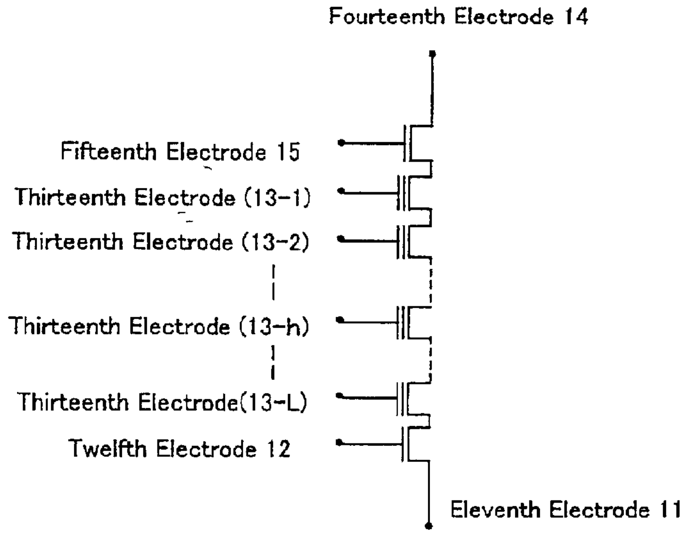
Figure 69:
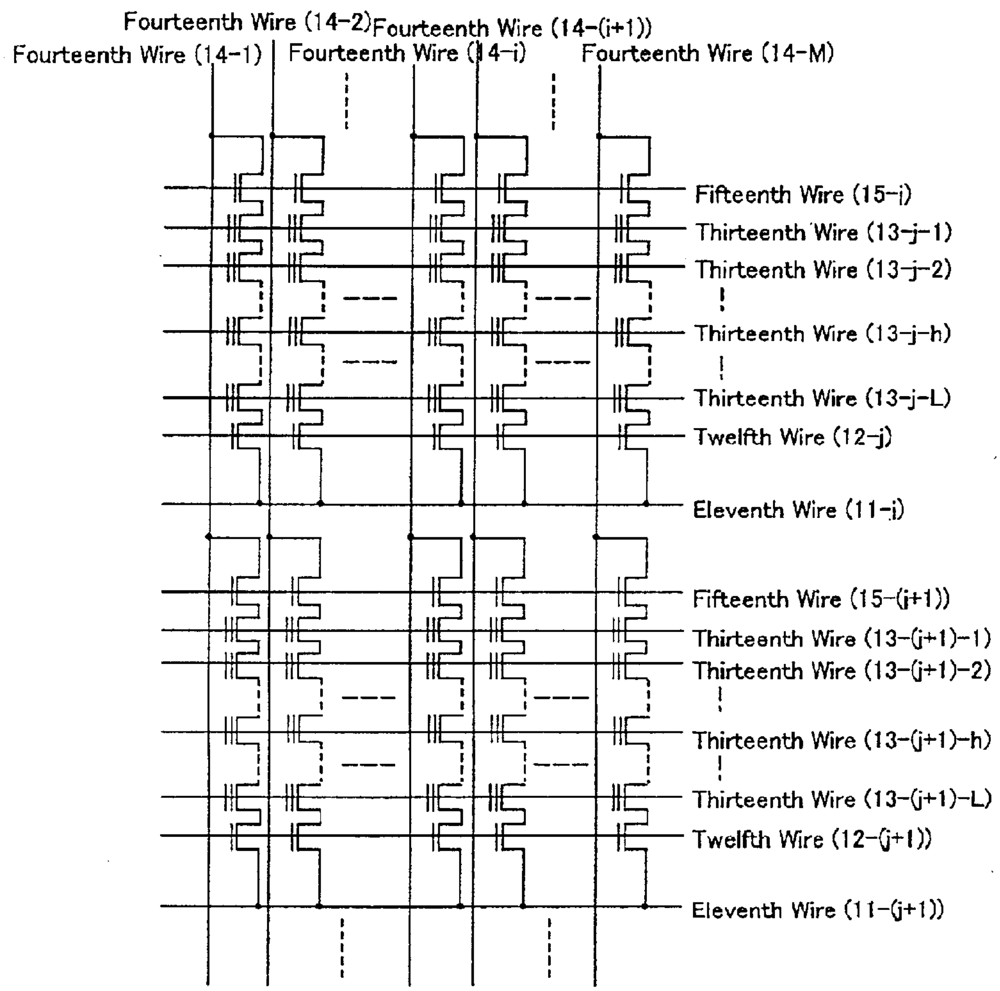

FIG. 68 and FIG. 69 are equivalent circuit diagrams of part of a memory cell array of the MONOS structure shown as an example in FIG. 12 and FIG. 43 to FIG. 52.

FIG. 68 is an equivalent circuit diagram of memory cells of the MONOS structure arranged in one island-like semiconductor layer 2110, and FIG. 69 is an equivalent circuit diagram in the case where a plurality of island-like semiconductor layers 2110 are arranged.

Now explanation is given of the equivalent circuit diagram of FIG. 68.

The island-like semiconductor layer 2110 has, as the selection gate transistors, a transistor provided with a twelfth electrode 12 as the gate electrode and a transistor provided with a fifth electrode 15 as the gate electrode, and a plurality of (e.g., L, L is a positive integer) memory cells arranged in series. The memory cell has a laminated insulating film as the charge storage layer between the selection gate transistors and has a thirteenth electrode (13-h, h is a positive integer, $1 \leqq h \leqq L$) as a control gate electrode. A fourteenth electrode 14 is connected to an end of the island-like semiconductor layer 2110 and an eleventh electrode 11 is connected to another end thereof.

Next explanation is given of the equivalent circuit diagram of FIG. 69. Now there is shown a connection relationship between each circuit element arranged in each island-like semiconductor layer 2110 shown in FIG. 68 and each wire in a memory cell array where a plurality of island-like semiconductor layers 2110 are arranged.

Are provided a plurality of (e.g., M×N, M and N are positive integers; i is a positive integer, $1 \leqq i \leqq M$; j is a positive integer, $1 \leqq j \leqq N$) island-like semiconductor layers 2110. In the memory cell array, a plurality of (e.g., M) fourteenth wires arranged in parallel with the semiconductor substrate are connected with the above-mentioned fourteenth electrodes 14 provided in the island-like semiconductor layers 2110. A plurality of (e.g., N×L) thirteenth wires arranged in parallel with the semiconductor substrate and in a direction crossing the fourteenth wires 14 are connected with the above-mentioned thirteenth electrodes (13-h, h is a positive integer, $1 \leqq h \leqq L$) of the memory cells. A plurality of (e.g., N) eleventh wires arranged in a direction crossing the fourteenth wires 14 are connected with the above-mentioned eleventh electrodes 11 provided in the island-like semiconductor layers 2110. The eleventh wires are arranged in parallel with the thirteenth wires. A plurality of (e.g., N) twelfth wires arranged in parallel with the semiconductor substrate and in a direction crossing the fourteenth wires 14 are connected with the above-mentioned twelfth electrodes 12 of the memory cells, and a plurality of (e.g., N) fifteenth wires arranged in parallel with the semiconductor substrate and in a direction crossing the fourteenth wires 14 are connected with the above-mentioned fifteenth electrodes 15 of the memory cells.

Figure 59:
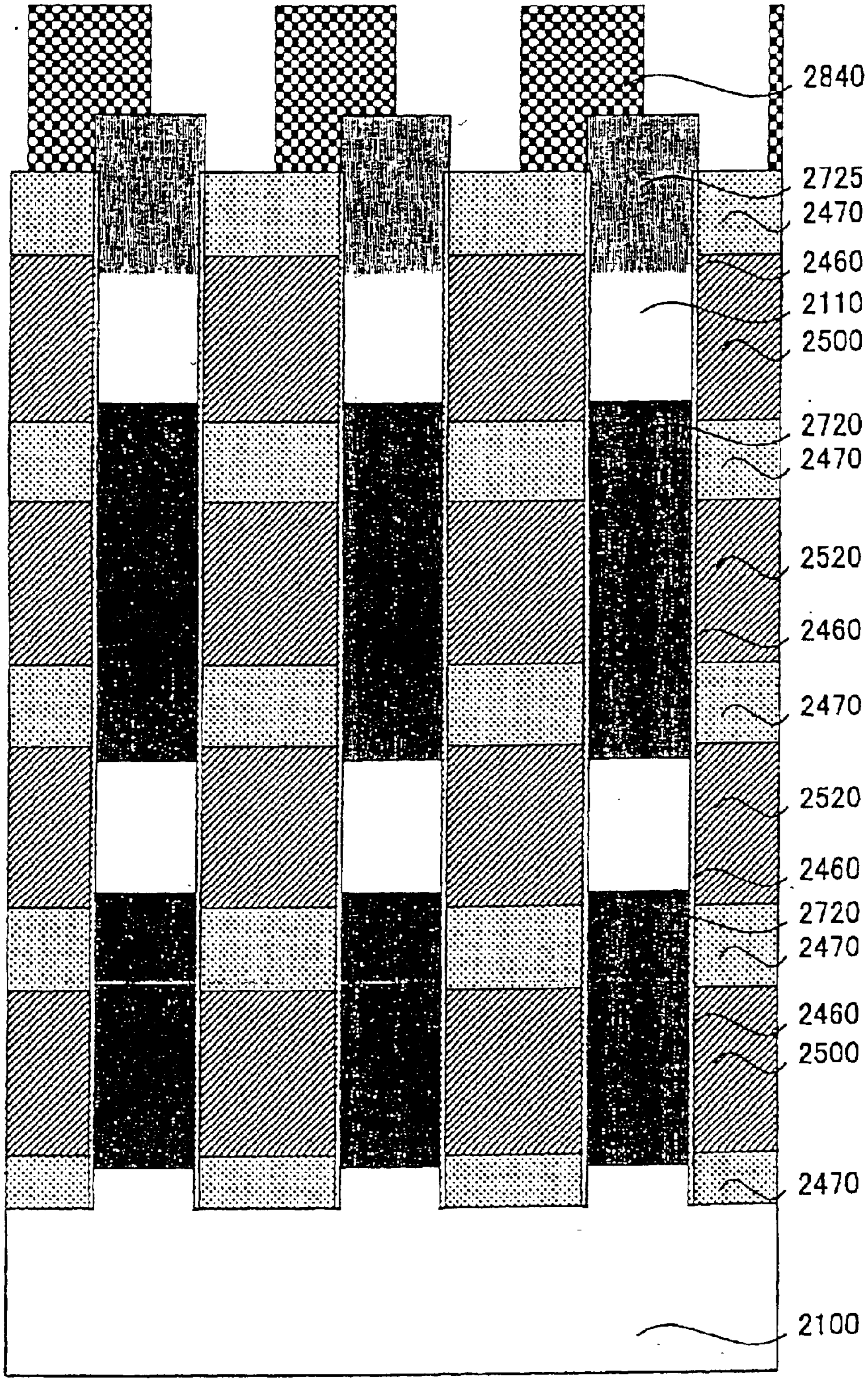
Figure 60:
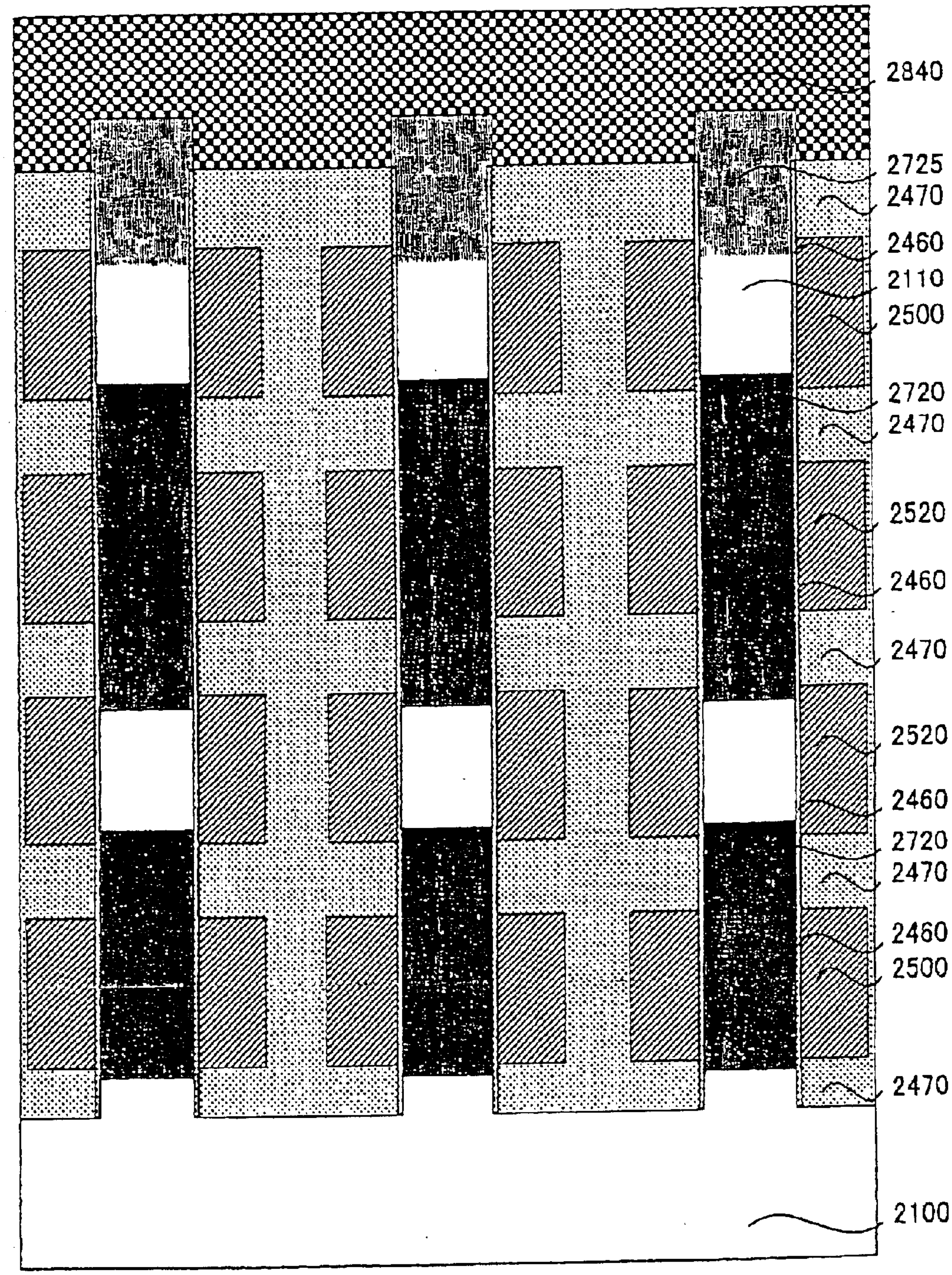
Figure 70:
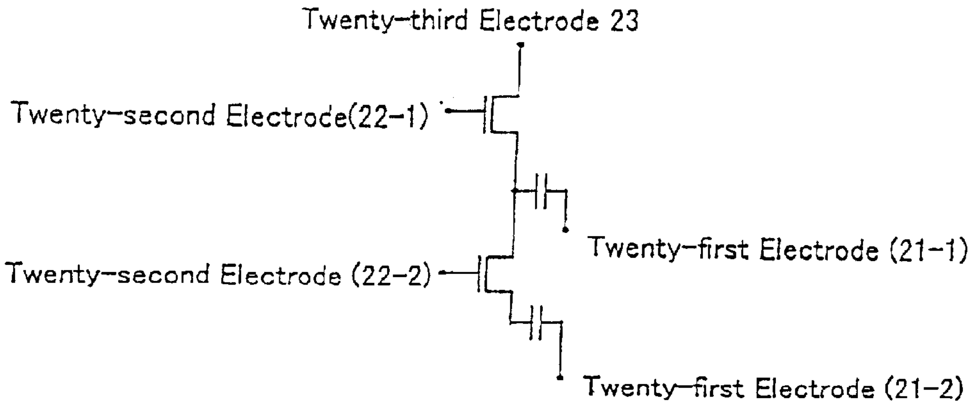
Figure 71:
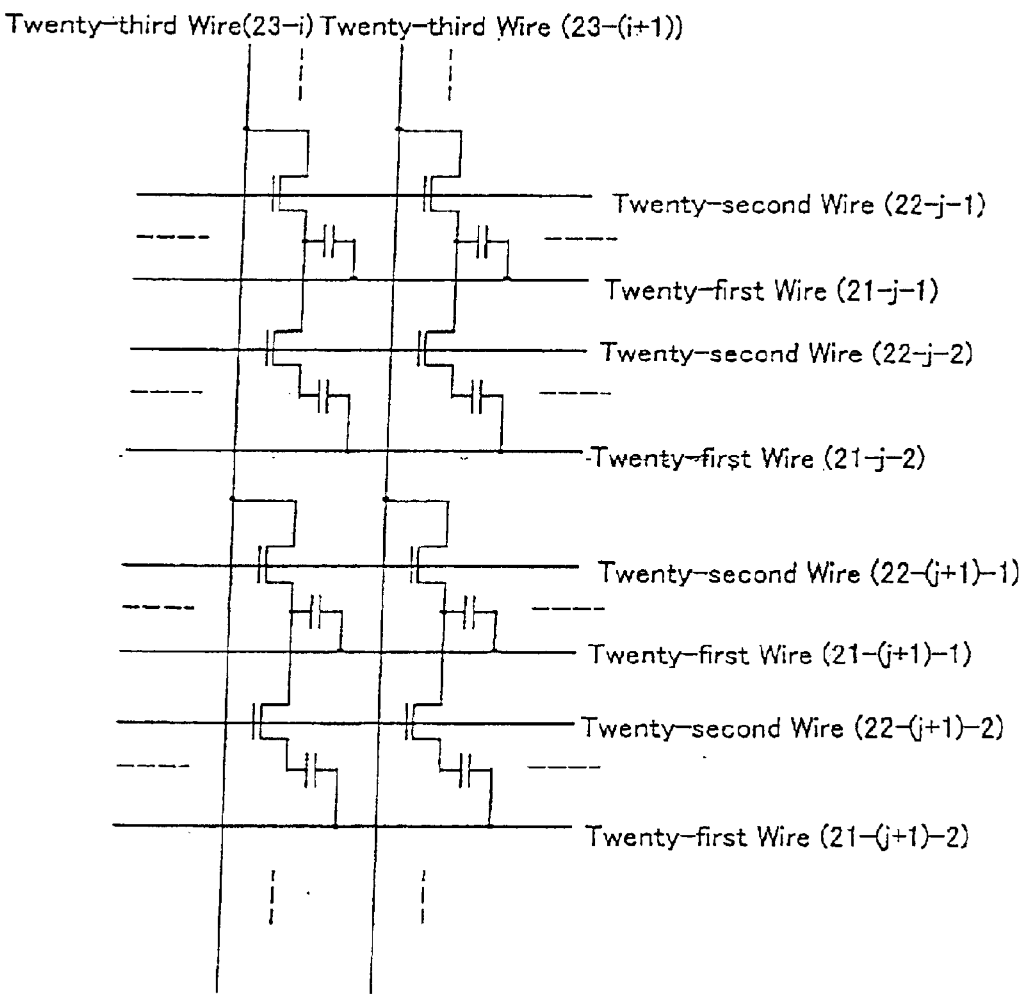

FIG. 70 and FIG. 71 are equivalent circuit diagrams of part of a memory cell array of the DRAM structure shown as an example in FIG. 13, FIG. 59 and FIG. 60. FIG. 70 is an equivalent circuit diagram of memory cells of the DRAM structure arranged in one island-like semiconductor layer 2110, and FIG. 71 is an equivalent circuit diagram in the case where a plurality of island-like semiconductor layers 2110 are arranged.

Now explanation is given of the equivalent circuit diagram of FIG. 70.

One memory cell is constituted of one transistor and one MIS capacitor connected in series. A twenty-third electrode 23 is connected to one end of the memory cell and a twenty-first electrode 21 is connected to another end of the memory cell. The memory cell is provided with a twenty-second electrode 22 as the gate electrode. For example, two memory cells are connected as shown in FIG. 70. Two twenty-first electrodes (21-1) and (21-2) and two twenty-second electrodes (22-1) and (22-2) are provided in one island-like semiconductor 2110 and the twenty-third electrode 23 is provided at an end of the island-like semiconductor layer 2110.

Explanation is given of the equivalent circuit diagram of FIG. 71. Now there is shown a connection relationship between each circuit element arranged in each island-like semiconductor layer 2110 shown in FIG. 70 and each wire in a memory cell array where a plurality of island-like semiconductor layers 2110 are arranged.

Are provided a plurality of (e.g., M×N, M and N are positive integers; i is a positive integer, $1 \leqq i \leqq M$; j is a positive integer, $1 \leqq j \leqq N$) island-like semiconductor layers 2110. In the memory cell array, a plurality of (e.g., M) twenty-third wires arranged in parallel with the semiconductor substrate are connected with the above-mentioned twenty-third electrodes 23 provided in the island-like semiconductor layers 2110. A plurality of (e.g., 2×N) twenty-second wires arranged in parallel with the semiconductor substrate and in a direction crossing the twenty-third wires 23 are connected with the above-mentioned twenty-second electrodes (22-1) and (22-2) of the memory cells. A plurality of (e.g., 2×N) twenty-first wires arranged in a direction crossing the twenty-third wires 23 are connected with the above-mentioned twenty-first electrodes (21-1) and (21-2) of the memory cells.

FIG. 70 and FIG. 71 show an example in which two memory cells are arranged in one island-like semiconductor layer 2110. However, three or more memory cells or one memory cell may be arranged in one island-like semiconductor layer 2110.

In the equivalent circuit diagram shown in FIG. 70 and FIG. 71, an MIS capacitor, a transistor, an MIS capacitor and a transistor are disposed from the bottom of the island-like semiconductor layer 2110. Alternatively, explanation is given of an example in which a transistor, an MIS capacitor, an MIS capacitor and a transistor are disposed from the bottom of the island-like semiconductor layer 2110.

Figure 72:
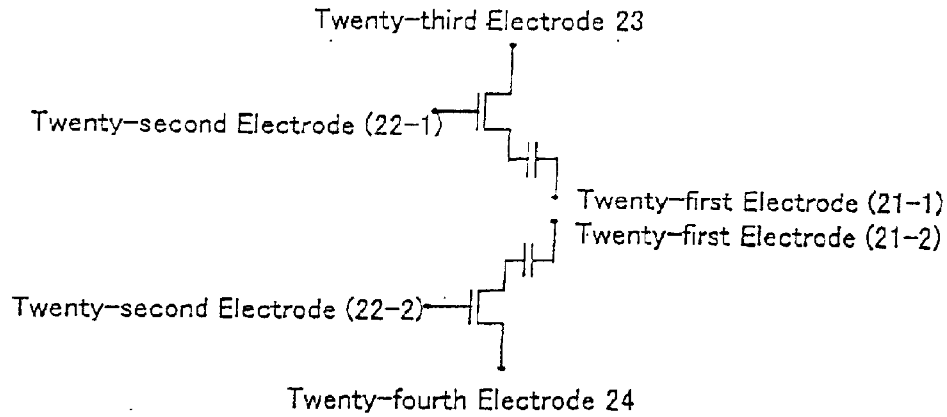
Figure 73:
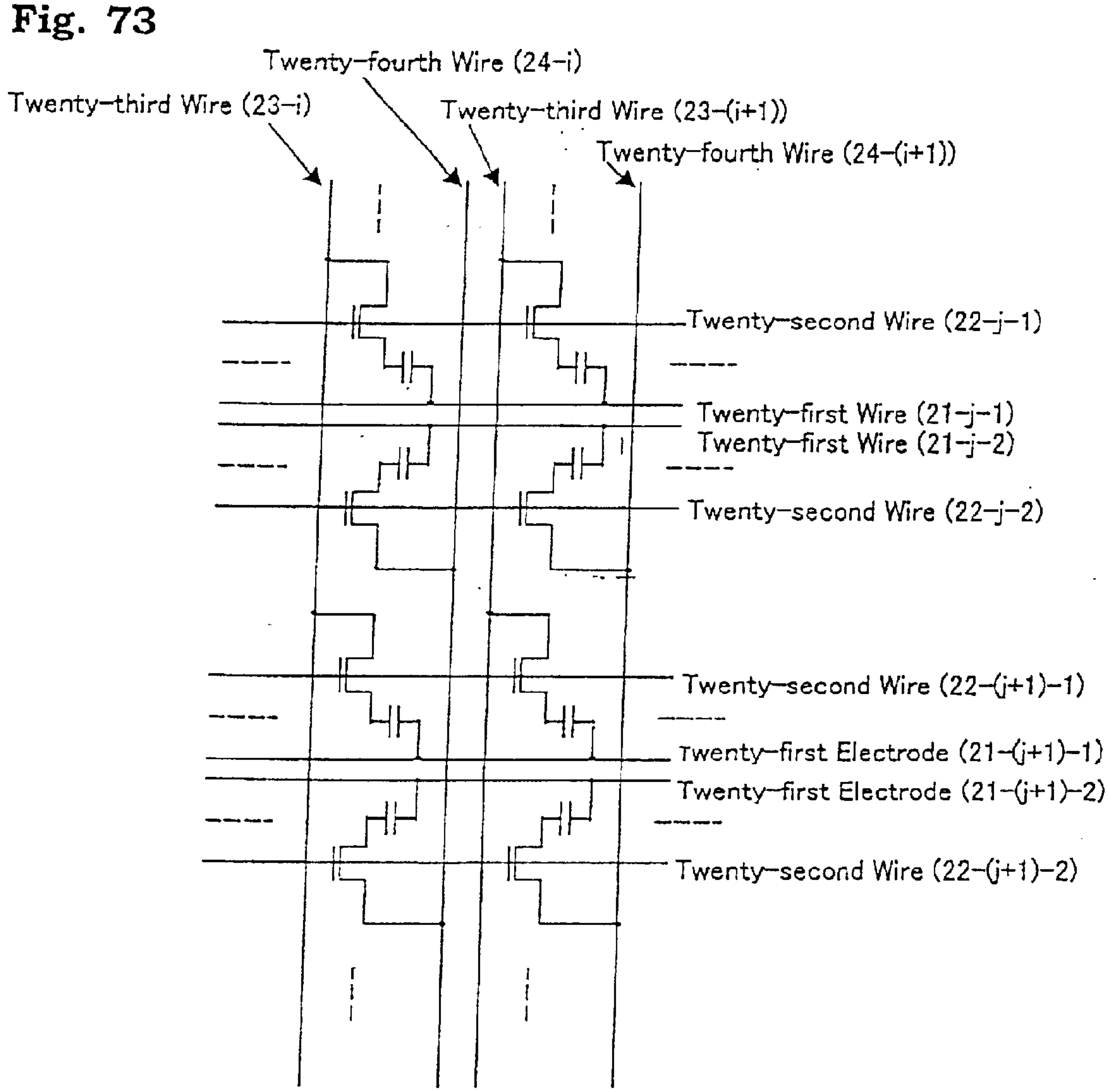

FIG. 72 and FIG. 73 are equivalent circuit diagrams of part of a memory cell array of the DRAM structure shown as an example in FIG. 13 and FIG. 55 to FIG. 58. FIG. 72 is an equivalent circuit diagram of memory cells of the DRAM structure arranged in one island-like semiconductor layer 2110, and FIG. 73 is an equivalent circuit diagram in the case where a plurality of island-like semiconductor layers 2110 are arranged.

Now explanation is given of the equivalent circuit diagram of FIG. 72.

As in the previous example, the memory cell is constituted of one transistor and one MIS capacitor connected in series. A twenty-third electrode 23 is connected to one end of the memory cell and a twenty-first electrode 21 is connected to another end of the memory cell. A twenty-second electrode 22 is connected as the gate electrode. For example, two memory cells are connected as shown in FIG. 72. Two twenty-first electrodes (21-1) and (21-2) and two twenty-second electrodes (22-1) and (22-2) are provided in one island-like semiconductor 2110. The twenty-third electrode 23 is provided at an end of the island-like semiconductor layer 2110, and the twenty-fourth electrode 24 is provided at another end of the island-like semiconductor layer 2110.

Next explanation is given of the equivalent circuit diagram of FIG. 73. Now there is shown a connection relationship between each circuit element arranged in each island-like semiconductor layer 2110 shown in FIG. 72 and each wire in a memory cell array where a plurality of island-like semiconductor layers 2110 are arranged.

Figure 74:
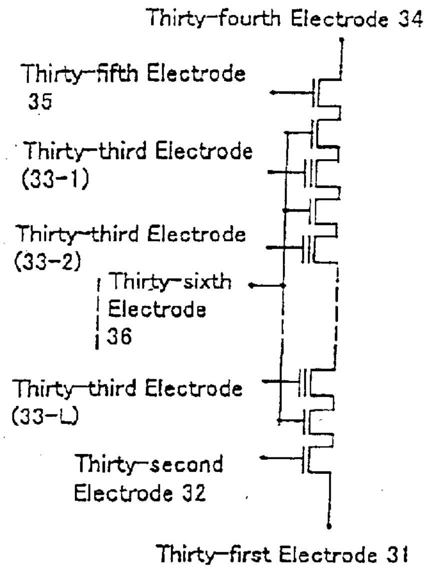
Figure 75:
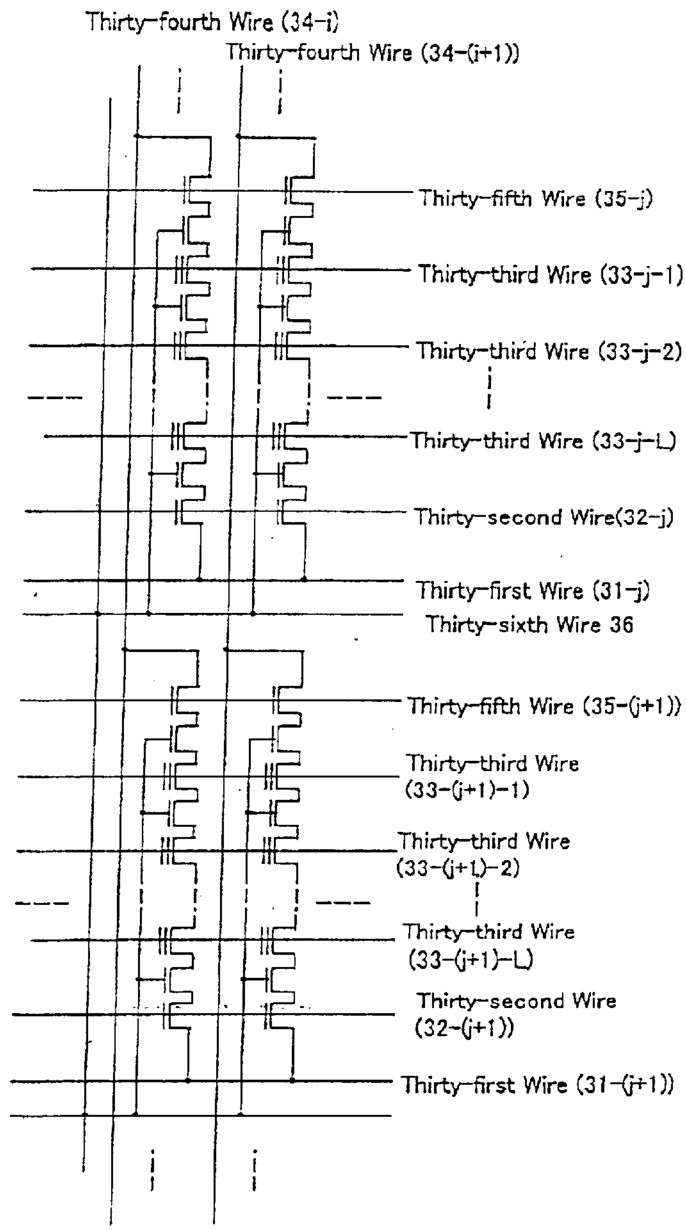

Are provided a plurality of (e.g., M×N, M and N are positive integers; i is a positive integer, 1≦i≦M; j is a positive integer, 1≦j≦N) island-like semiconductor layers 2110. In the memory cell array, a plurality of (e.g., M) twenty-third wires arranged in parallel with the semiconductor substrate are connected to the above-mentioned twenty-third electrodes 23 provided in the island-like semiconductor layers 2110. A plurality of (e.g., M) twenty-fourth wires arranged in parallel with the semiconductor substrate are connected to the above-mentioned twenty-fourth electrodes 24 provided in the island-like semiconductor layers 2110. A plurality of (e.g., 2×N) twenty-second wires arranged in parallel with the semiconductor substrate and in a direction crossing the twenty-third wires 23 and the twenty-fourth wires 24 are connected with the above-mentioned twenty-second electrodes (22-1) and (22-2) of the memory cells. A plurality of (e.g., 2×N) twenty-first wires arranged in a direction crossing the twenty-third wires 23 and the twenty-fourth wires 24 are connected to the above-mentioned twenty-first electrodes (21-1) and (21-2) of the memory cells:

FIG. 74 and FIG. 75 are equivalent circuit diagrams of part of a memory cell array shown as an example in FIG. 35 to FIG. 38, FIG. 53 and FIG. 54 in which diffusion layers 2720 are not disposed between the transistors and polysilicon films 2530 are formed as third conductive films between the gate electrodes 2500, 2510 and 2520 of the memory transistors and the selection gate transistors.

FIG. 74 shows an equivalent circuit diagram of memory cells arranged in one island-like semiconductor layer 2110 in which the polysilicon films 2530 are formed as third conductive films between the gate electrodes of the memory transistors and the selection gate transistors, and FIG. 75 shows an equivalent circuit diagram in the case where a plurality of island-like semiconductor layers 2110 are arranged.

Now explanation is given of the equivalent circuit diagram of FIG. 74.

The island-like semiconductor layer 2110 has, as the selection gate transistors, a transistor provided with a thirty-second electrode 32 as the gate electrode and a transistor provided with a thirty-fifth electrode 35 as the gate electrode and a plurality of (e.g., L, L is a positive integer) memory cells arranged in series. The memory cell has a charge storage layer between the selection gate transistors and has a thirty-third electrode (33-h, h is a positive integer, 1≦h≦L) as the control gate electrode. The island-like semiconductor layer 2110 also has thirty-sixth electrodes as the gate electrodes between the transistors. A thirty-fourth electrode 34 is connected to an end of the island-like semiconductor layer 2110 and a thirty-first electrode 31 is connected to another end thereof. A plurality of thirsty-sixth electrodes are connected as a whole and provided in the island-like semiconductor layers 2110.

Next explanation is given of the equivalent circuit diagram of FIG. 75. Now there is shown a connection relationship between each circuit element arranged in each island-like semiconductor layer 2110 shown in FIG. 74 and each wire in a memory cell array where a plurality of island-like semiconductor layers 2110 are arranged.

Are provided a plurality of (e.g., M×N, M and N are positive integers; i is a positive integer, 1≦i≦M; j is a positive integer, 1≦j≦N) island-like semiconductor layers 2110. In the memory cell array, a plurality of (e.g., M) thirty-fourth wires arranged in parallel with the semiconductor substrate are connected to the above-mentioned thirty-fourth electrodes 34 provided in the island-like semiconductor layers 2110. A plurality of (e.g., N×L) thirty-third wires arranged in parallel with the semiconductor substrate and in a direction crossing the thirty-fourth wires 34 are connected with the above-mentioned thirty-third electrodes (33-h) of the memory cells. A plurality of (e.g., N) thirty-first wires arranged in a direction crossing the thirty-fourth wires are connected to the above-mentioned thirty-first electrodes 31 provided in the island-like semiconductor layers 2110. The thirty-first wires are arranged in parallel with the thirty-third wires. A plurality of (e.g., N) thirty-second wires arranged in parallel with the semiconductor substrate and in a direction crossing the thirty-fourth wires 34 are connected to the above-mentioned thirty-second electrodes 32 of the memory cells. A plurality of (e.g., N) thirty-fifth wires arranged in parallel with the semiconductor substrate and in a direction crossing the thirty-fourth wires 34 are connected to the above-mentioned thirty-fifth electrodes 35 of the memory cells. All the above-mentioned thirty-sixth electrodes 36 provided in the island-like semiconductor layers 2110 are connected in unity by thirty-sixth wires.

All the above-mentioned thirty-sixth electrodes 36 provided in the island-like semiconductor layers 2110 need not be connected in unity by thirty-sixth wires, but may be connected in two or more groups by dividing the memory cell array with the thirty-sixth wires. That is, the memory cell array may be so constructed that the thirty-sixth electrodes 36 are connected block by block.

Figure 76:
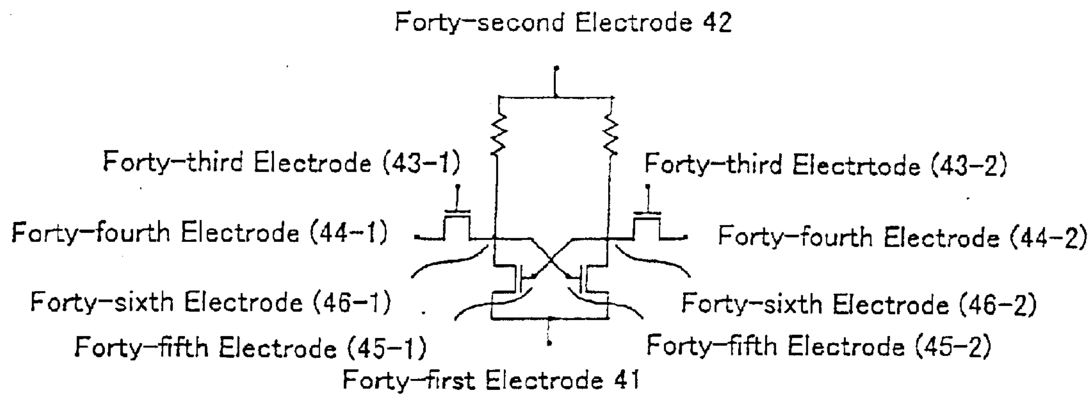
Figure 77:
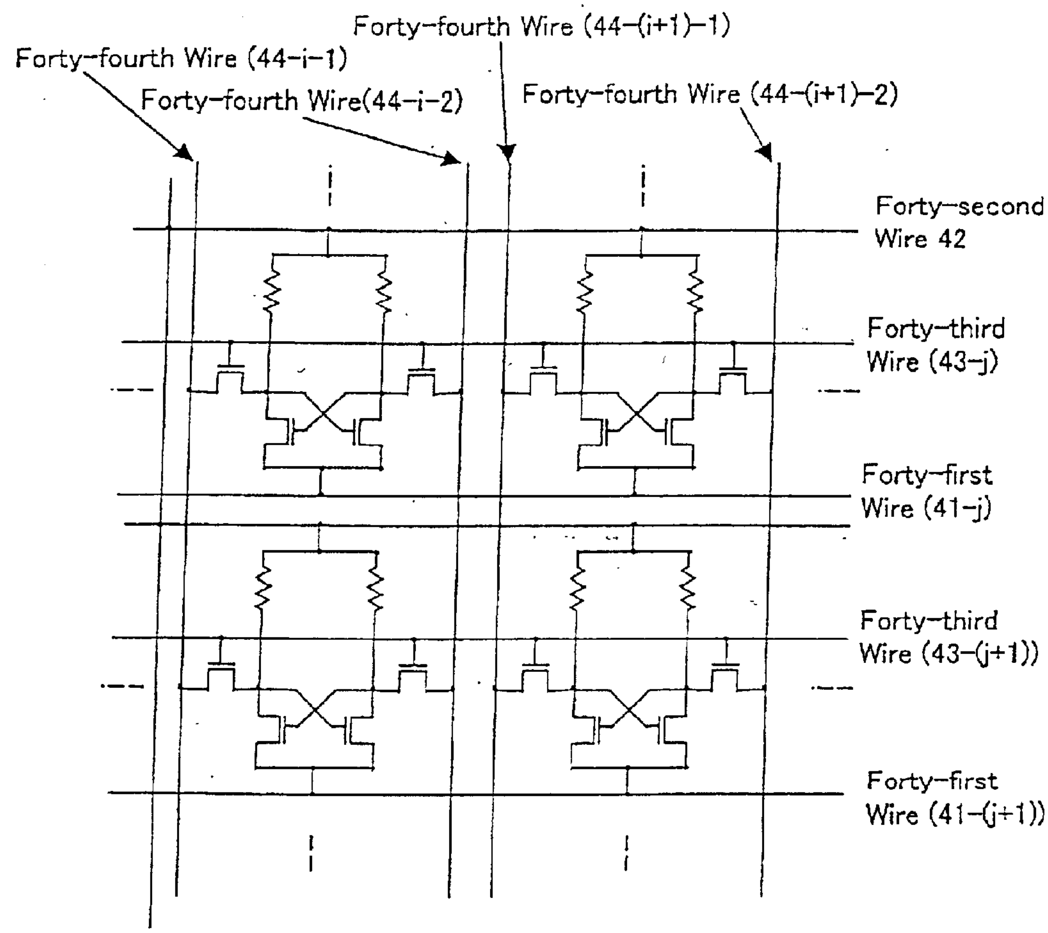

FIG. 76 and FIG. 77 are equivalent circuit diagrams of part of a memory cell array of the SRAM structure shown as an example in FIG. 14, FIG. 61 and FIG. 64. Transistors constituting the memory cells are of NMOS only.

FIG. 76 is an equivalent circuit diagram of a memory cell of the SRAM structure arranged in two island-like semiconductor layers 2110, and FIG. 77 is an equivalent circuit diagram in the case where a plurality of memory cells are arranged.

Now explanation is given of the equivalent circuit diagram of FIG. 76.

Two island-like semiconductor layers 2110 are disposed adjacently. The island-like semiconductor layer 2110 has a transistor provided with, as the gate electrodes, a forty-third electrode and a forty-fifth electrode connected in series. These four transistors are connected to each other as shown in FIG. 74. More particularly, a forty-sixth electrode (46-2) of a transistor having a forty-third electrode (43-2) as the gate electrode is connected to a forty-fifth electrode (45-1), and a forty-sixth electrode (46-1) of a transistor having a forty-third electrode (43-1) as the gate electrode is connected to a forty-fifth electrode (45-2). In these two adjacent island-like semiconductor layers 2110, a forty-forth electrode (44-1) is connected to one end of one of the island-like semiconductor layers 2110 and a forty-forth electrode (44-2) is connected to one end of the other island-like semiconductor layers 2110. A forty-first electrode 41 is connected as a common electrode to other ends of the island-like semiconductor layers 2110 to which the forty-forth electrodes (44-1) and (44-2) are not connected. Two high-resistance elements are connected to these four transistors as shown in FIG. 76. A forty-second electrode 42 is connected as a common electrode at an end at which the transistors are not connected.

Next explanation is given of the equivalent circuit diagram of FIG. 77. Now there is shown a connection relationship between each circuit element arranged on the basis of the two island-like semiconductor layers 2110 shown in FIG. 76 and each wire in a memory cell array where a plurality of island-like semiconductor layers 2110 are arranged.

Are provided a plurality of (e.g., 2×M×N, M and N are positive integers; i is a positive integer, 1≦i≦M; j is a positive integer, 1≦j≦N) island-like semiconductor layers 2110. In the memory cell array, a plurality of (e.g., 2×M) forty-fourth wires arranged in parallel with the semiconductor substrate are connected to the above-mentioned forty-fourth electrodes (44-1) and (44-2) provided in the island-like semiconductor layers 2110. A plurality of (e.g., N) forty-third wires arranged in parallel with the semiconductor substrate and in a direction crossing the forty-fourth wires 44 are connected with the above-mentioned forty-third electrodes (43-1) and (43-2). A plurality of (e.g., N) forty-first wires arranged in a direction crossing the forty-fourth wires 44 are connected to the above-mentioned forty-first electrodes 41 provided in the island-like semiconductor layers 2110. The forty-first wires may be connected in common to all forty-first electrodes provided in the island-like semiconductor layers 2110. The above-mentioned forty-second electrodes 42 of high-resistance elements may be connected in unity by forty-second wires.

The transistor constituting the memory cell may be constituted only of PMOS and the above-mentioned high resistance elements may be replaced with a transistor of an opposite type to the transistor having the forty-third or forty-fifth electrode as the gate electrode.

Now is described the operation principle of the case where the selection gate transistor is not connected to a memory cell adjacent to the selection gate transistor via an impurity diffusion layer, and the memory cells are not connected to each other via an impurity diffusion layer, and instead of that, the interval between the selection gate transistor and the memory cell and that between the memory cells are as close as about 30 nm or less as compared with the case where the selection gate transistor and the memory cell as well as the memory cells are connected via an impurity diffusion layer.

Where adjacent elements are sufficiently close to each other, a channel formed by a potential higher than the threshold applied to the gate of a selection gate transistor and the control gate of a memory cell connects to a channel of an adjacent element, and if a potential higher than the threshold is applied to the gates of all elements, the channels of all elements are connected. This state is equivalent to a state in which the selection transistor and the memory cell as well as the memory cells are connected via the impurity diffusion layer. Therefore, the operation principle is the same as that in the case where the selection transistor and the memory cell as well as the memory cells are connected via the impurity diffusion layer.

Now is described the operation principle of the case where the selection gate transistor is not connected to a memory cell adjacent to the selection gate transistor via an impurity diffusion layer, the memory cells are not connected to each other via an impurity diffusion layer, and instead of that, third conductive films between the selection transistor and the memory cell and between the gate electrodes of the memory cells.

The third conductive films are located between elements and are connected to the island-like semiconductor layers with intervention of insulating films, e.g., silicon oxide films. That is, the third conductive film, the insulating film and the island-like semiconductor layer form an MIS capacitor. A channel is formed by applying to the third conductive film a potential such that a reverse layer is formed at an interface between the island-like semiconductor layer and the insulating film. The thus formed channel acts to adjacent elements in the same manner as an impurity diffusion layer connecting the elements. Therefore, if a potential allowing a channel to be formed is applied to the third conductive film, is produced the same action as in the case where the selection gate transistor and the memory cell are connected via the impurity diffusion layer. Even if the potential allowing a channel to be formed is not applied to the third conductive film, is produced the same action as in the case where the selection gate transistor and the memory cell are connected via the impurity diffusion layer, when electrons are drawn from the charge storage layer if the island-like semiconductor layer is formed of a P-type semiconductor.

Embodiments of Processes of Producing Memory Cell Arrays

Are described examples in which, unlike the conventional memory device, an impurity diffusion layer is so formed that an active region of each memory cell formed on a semiconductor substrate or semiconductor layer which is patterned in the form of a pillar is in a floating state with respect to the semiconductor substrate and further the semiconductor or semiconductor layer is formed to have a dimension not larger than the minimum photoetching dimension.

PRODUCTION EXAMPLE 1

In a semiconductor memory device to be produced in this example, a semiconductor substrate is patterned in the form of pillars to form island-like semiconductor layers. Sides of the island-like semiconductor layers make active regions. A plurality of tunnel oxide films having anisotropy and floating gates as charge storage layers are formed on the active regions. The island-like semiconductor layers are each in an electrically floating state with respect to the semiconductor substrate, and the active region of each memory cell is in the electrically floating state. In this memory device, selection gate transistors are placed at the top and the bottom of the island-like semiconductor layers. A plurality of memory transistors, for example, two memory transistors, are placed between the selection gate transistors and are connected in series along the island-like semiconductor layer. The thickness of gate insulating films of the selection gate transistors is equal to the thickness of gate insulating films of the memory transistors. In this production example, the selection gates and the floating gates of the transistors are formed at the same time.

FIGS. 85 to 105 and FIGS. 106 to 125 are sectional views taken on line A-A' and line B-B', respectively, in FIG. 1 which illustrates a memory cell array of an EEPROM. FIGS. 126 to 131 are plan views of island-like semiconductor layers in each production step, of which FIG. 126 and FIGS. 128 to 130 are enlarged plan views only of island-like semiconductor layers.

Figure 86:
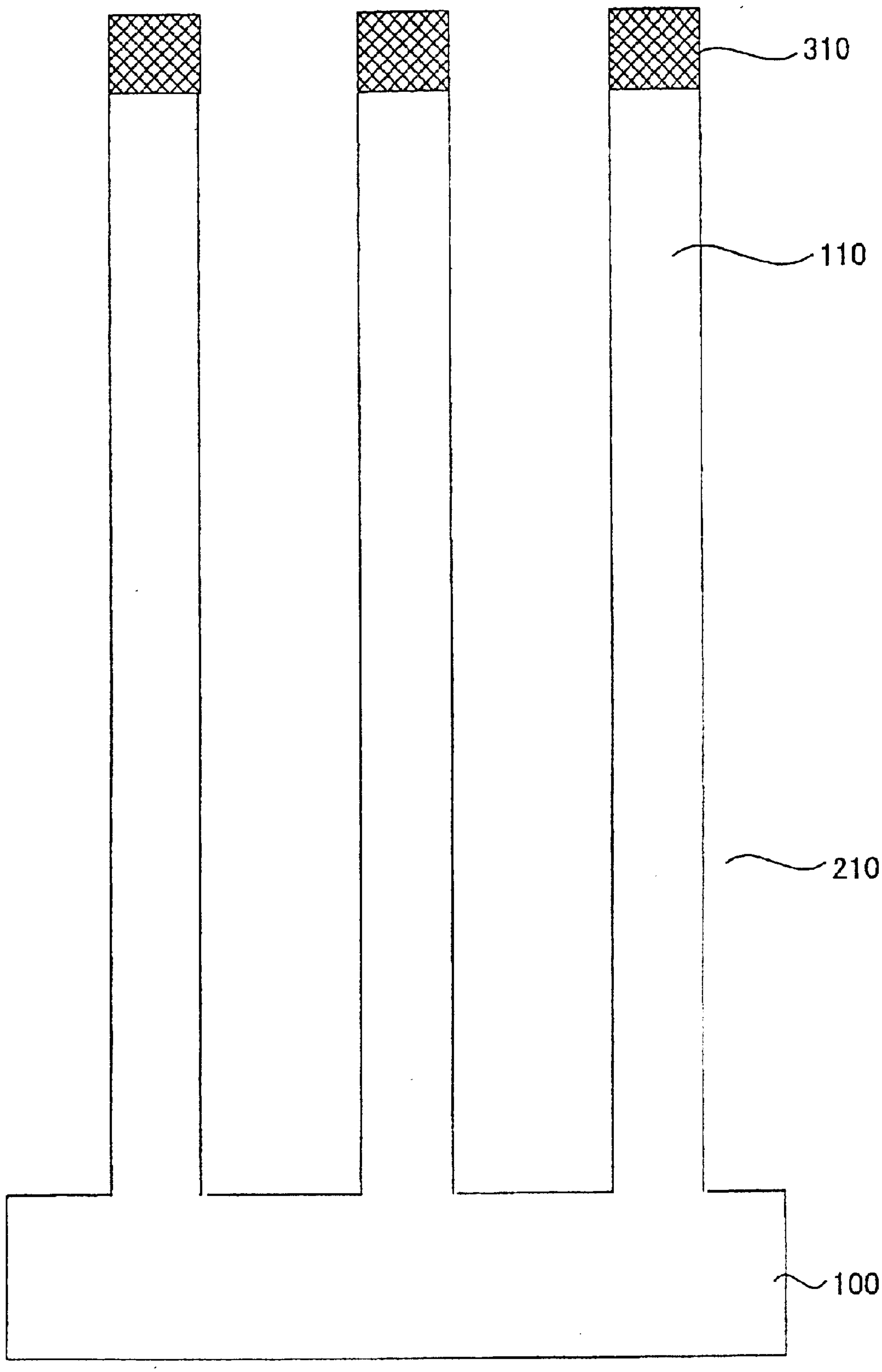
Figure 107:
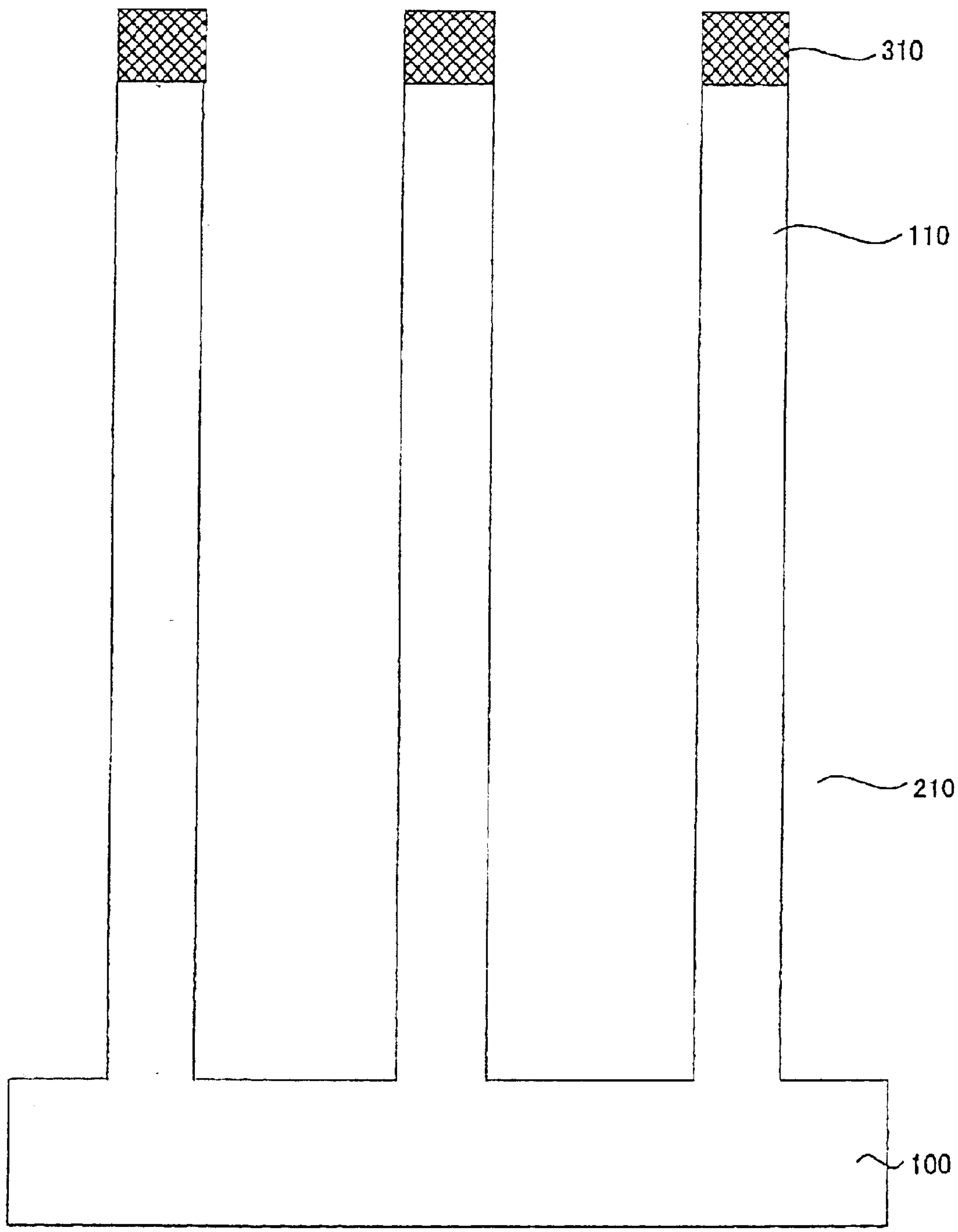

First, a silicon nitride film 310, for example, is deposited to 200 to 2,000 nm as a first insulating film to be a mask layer on a surface of a P-type silicon substrate 100, for example, as a semiconductor substrate. Using as a mask layer a resist film R1 patterned by a known photolithographic technique (FIG. 85 and FIG. 106), the silicon nitride film 310 is etched by reactive ion etching (RIE). Using this silicon nitride film 310 as a mask, the p-type silicon substrate 100 is etched 2000 to 20000 nm by RIE to form first trench 210 in the form of a lattice (FIG. 86 and FIG. 107). Thereby the p-type silicon substrate 100 is formed into a plurality of island-like semiconductor layers 110 in the pillar form which are insulated from each other. Here, consideration is given to the case where the resulting island-like semiconductor layers 110 are substantially columnar. As the semiconductor substrate, usable are elementary semiconductor substrates such as a germanium substrate, compound semiconductor substrates such as a GaAs substrate and a ZnSe substrate, mixed crystal semiconductor substrates such as a silicon germanium semiconductor and the like in addition to a silicon substrate. Not only a bulk substrate but also an SOI substrate, a multi-layered SOI substrate and the like may be used. Among these substrates, a silicon substrate is preferred.

Figure 87:
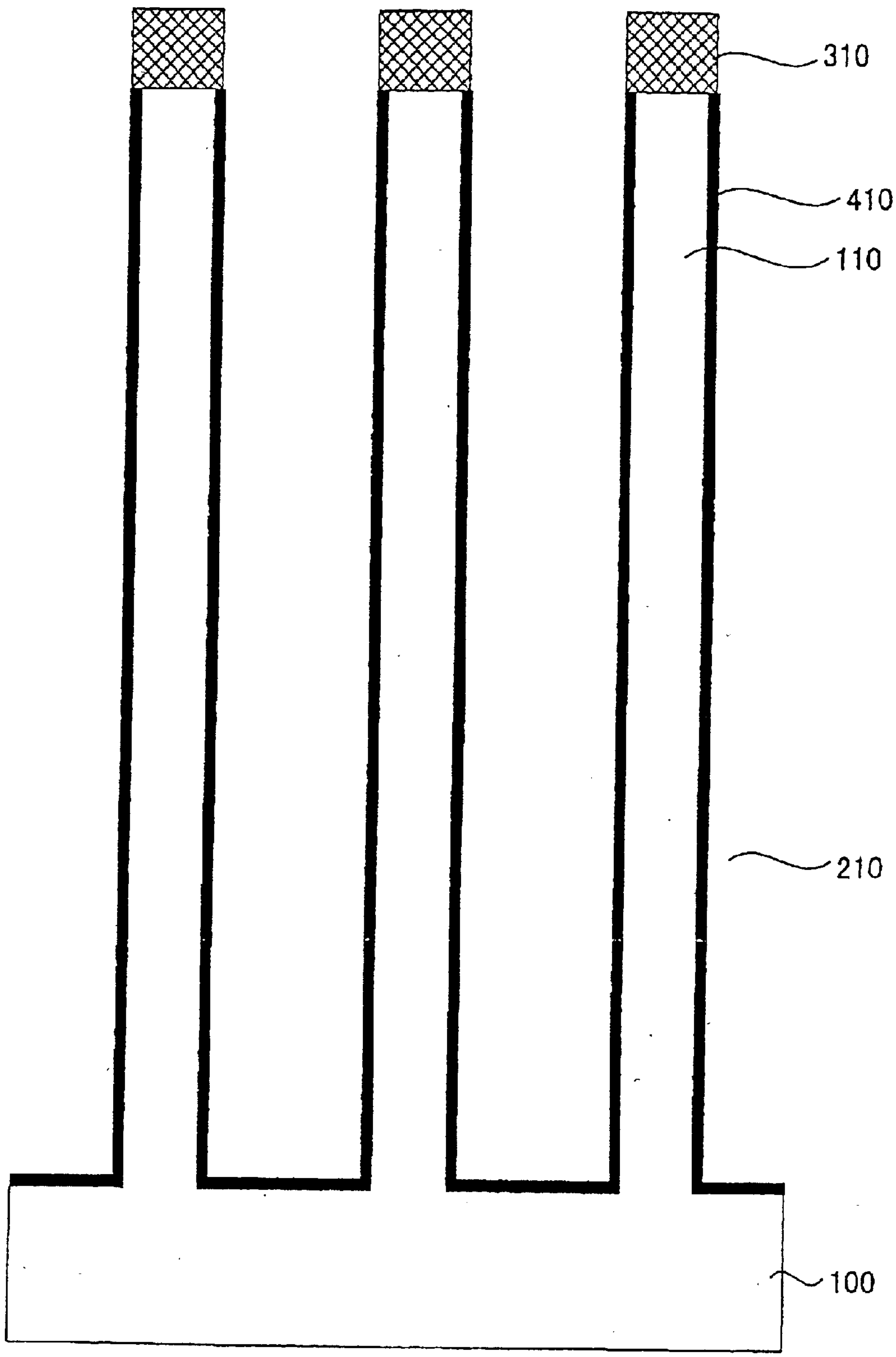
Figure 108:
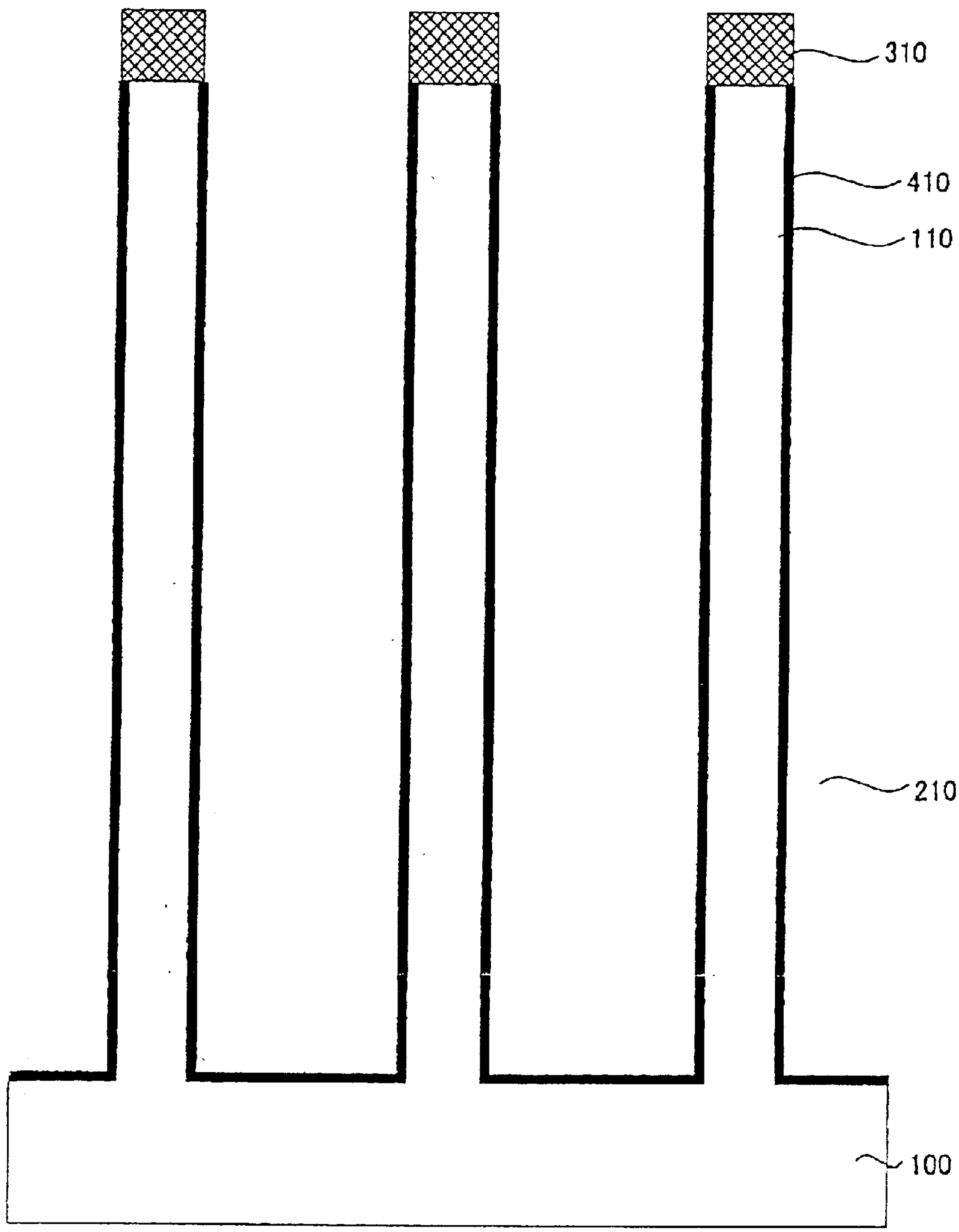
Figure 126:
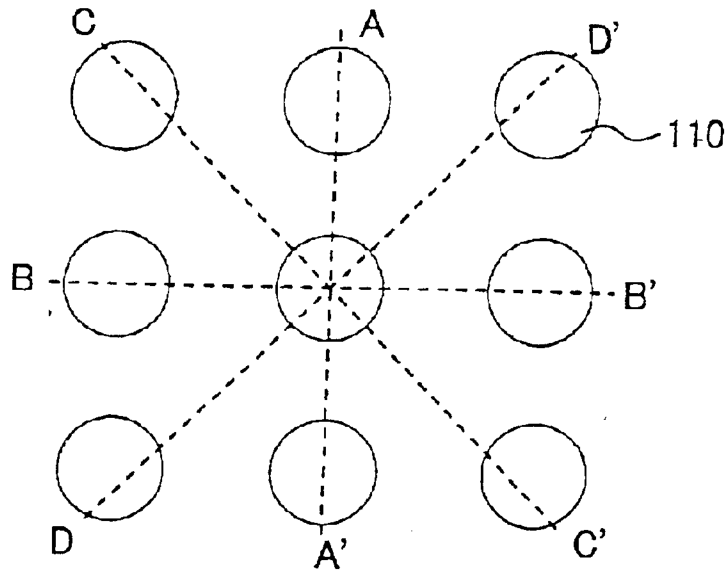
FIGS. 126 to 131 are enlarged plan views or plan views of an island-like semiconductor layer in each production step for producing a semiconductor memory device in accordance with the present invention.
Figure 126:
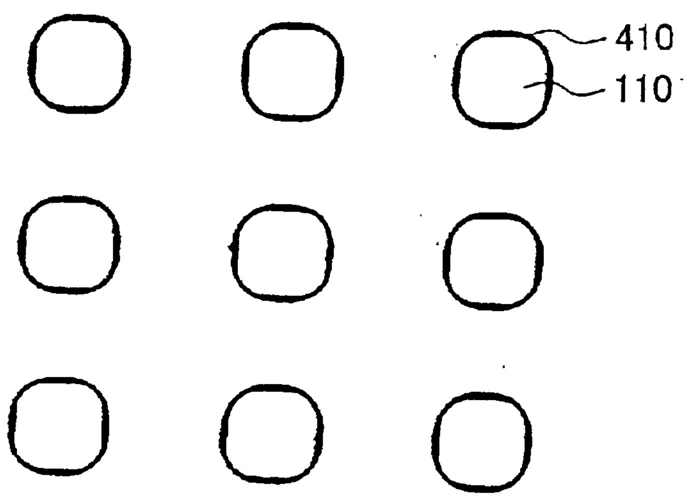
Figure 126:
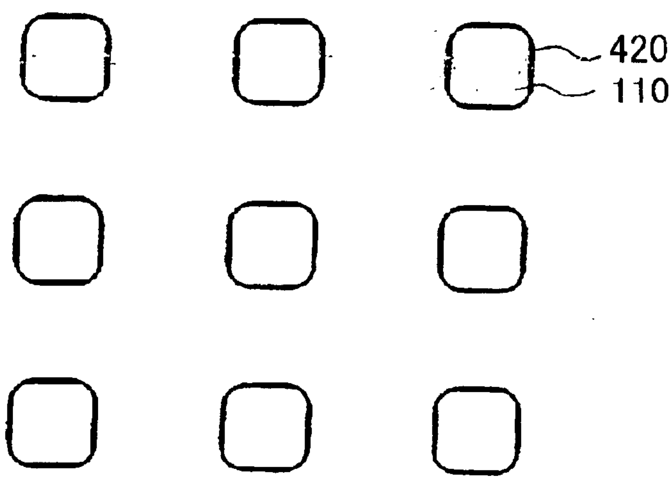
Figure 127:
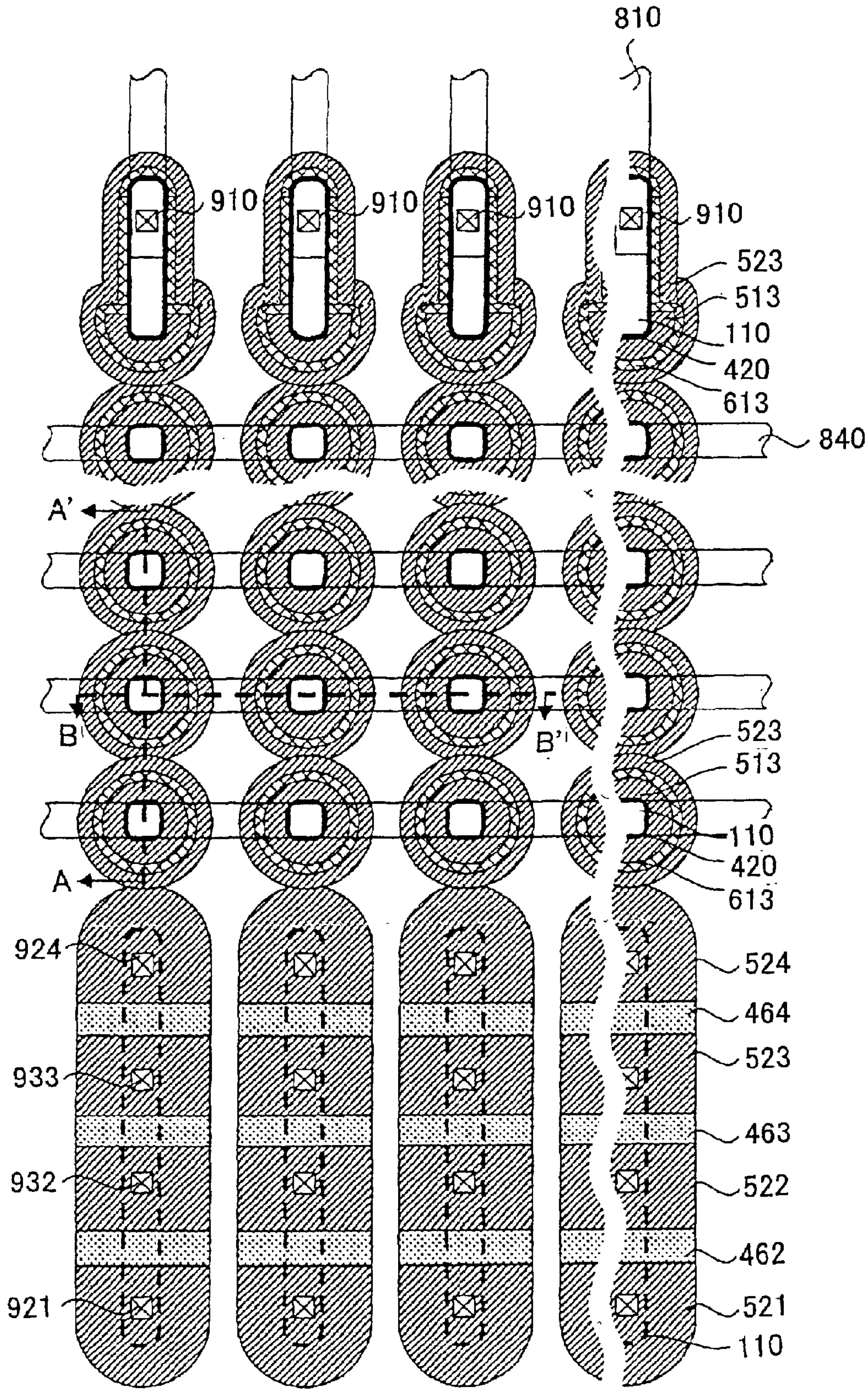
Figure 128:
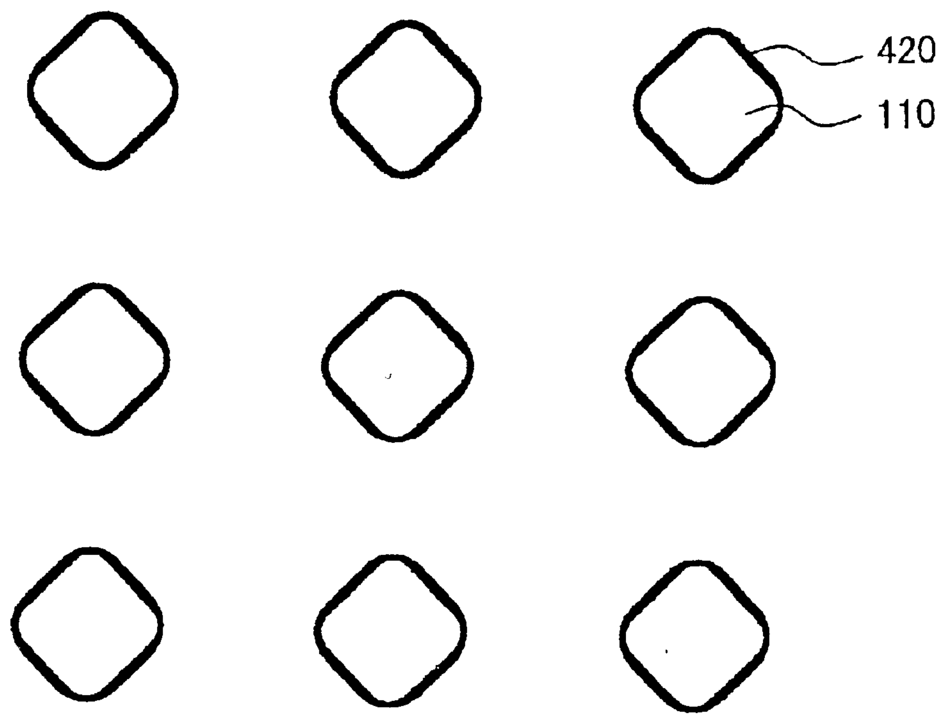
Figure 129:
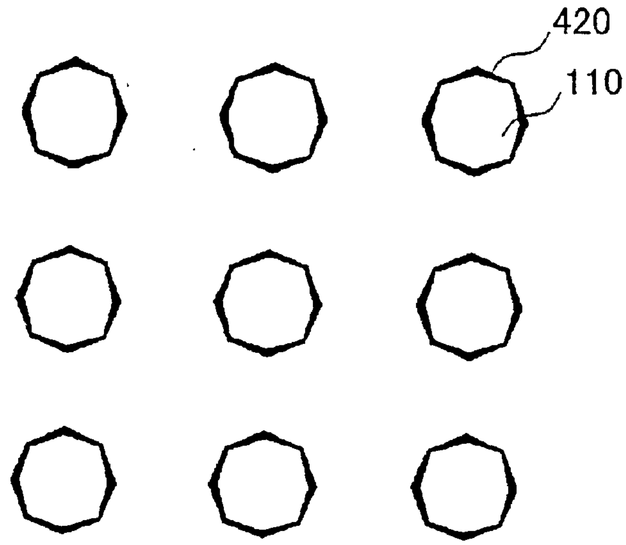
Figure 129:
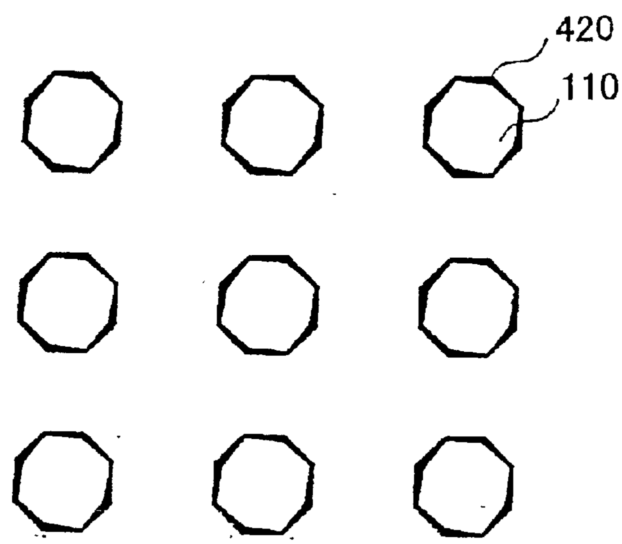
Figure 129:
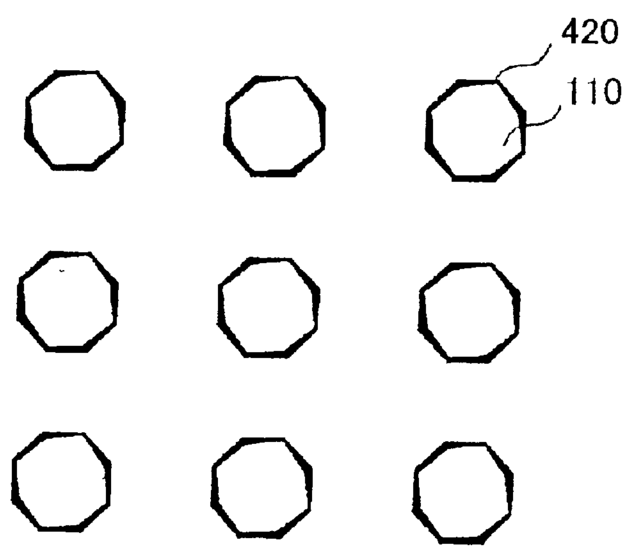
Figure 130:
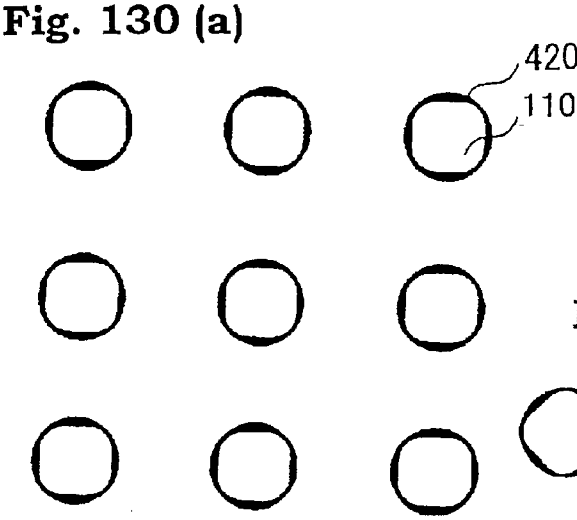
Figure 130:
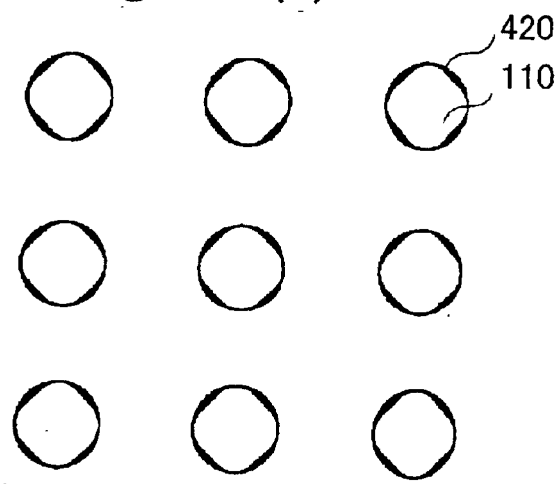
Figure 130:
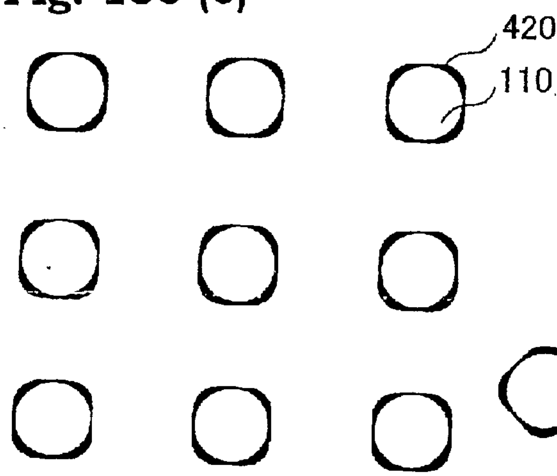
Figure 130:
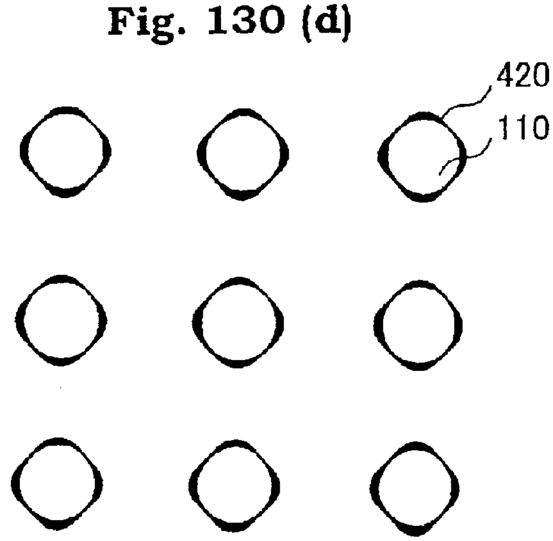
Figure 131:
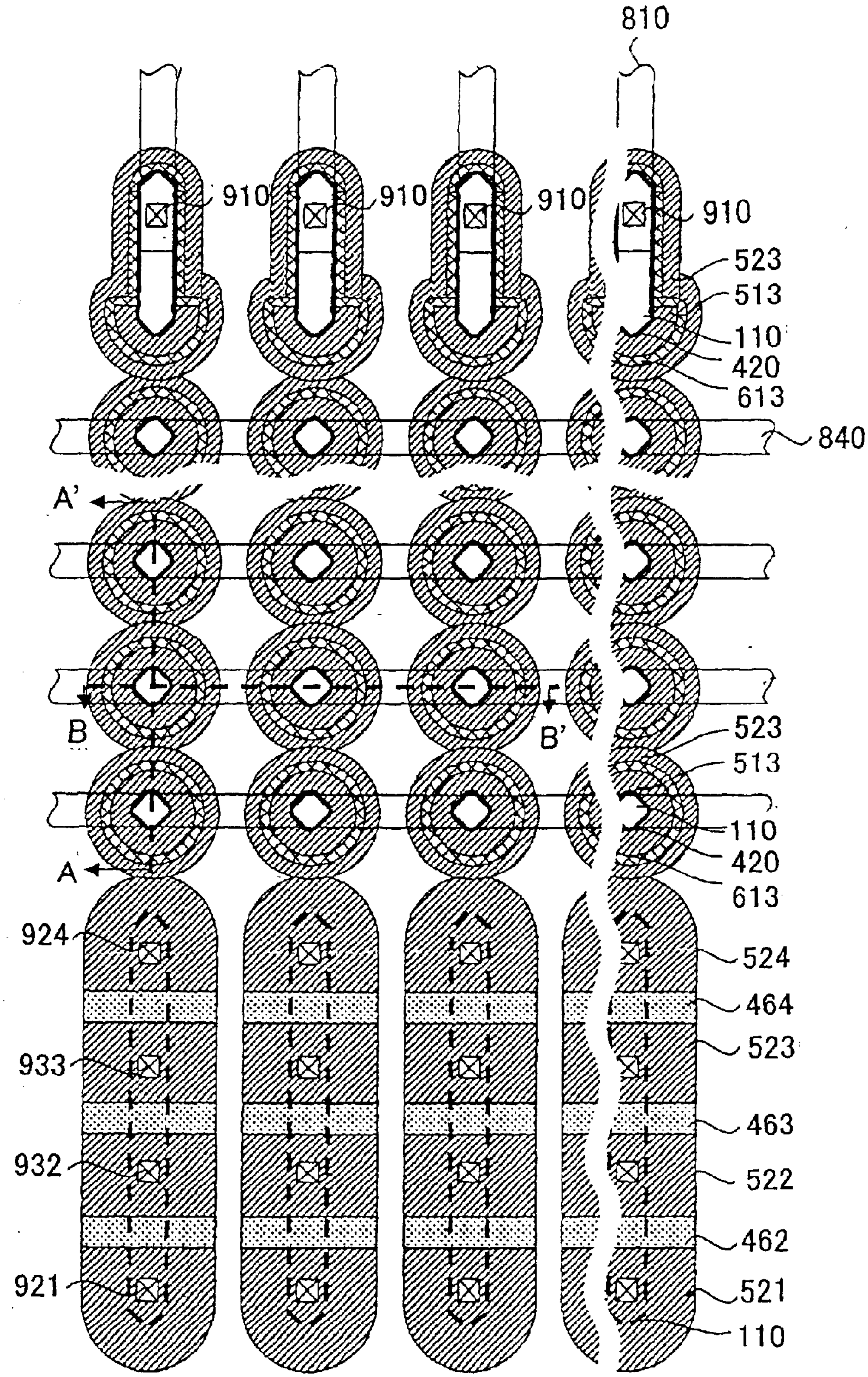
Figure 132:
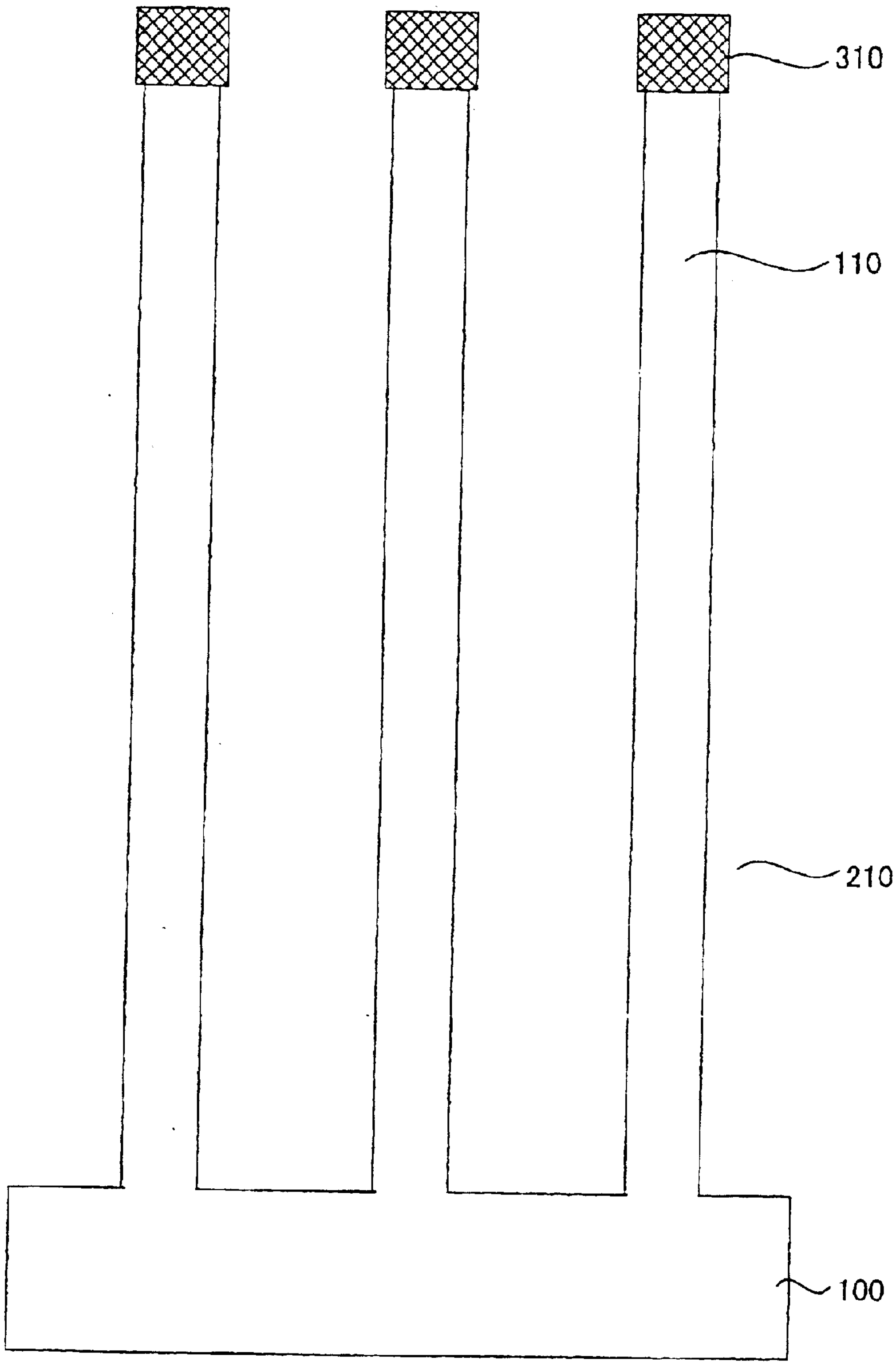

Next, a thermally oxidized film 410 is formed as a second insulating film. At this time, the growing rate of the thermally oxidized film may possibly be anisotropic in directions parallel to the semiconductor substrate 100 on the sides of the island-like semiconductor layers 110 due to crystal orientation. For example, suppose that the island-form semiconductor layers 110 are formed of silicon and that, as shown in FIG. 126(*a*), direction A-A' and direction B-B' are <110> orientation of silicon crystal and direction C-C' and direction D-D' are <100> orientation of silicon crystal. In this case, since the silicon crystal is oxidized faster in the <110> direction than in the <100> direction, the thickness of the oxide film is anisotropic in directions parallel to the semiconductor substrate 100. As a result, as shown in FIG. 126(*b*), FIG. 126(*c*) and FIG. 127, the island-like semiconductor layers 110 are in a form of somewhat quadratic prism rather than a columnar form (FIG. 87 and FIG. 108). For another example in which the thermally oxidized film 410 has anisotropy, as shown in FIG. 129(*a*) to FIG. 129(*c*), the island-like semiconductor layers 110 formed by RIE may be in an octagonal shape or may possibly be shifted +22.5° (FIG. 129(*b*)) or −22.5° (FIG. 129(*c*)) with respect to FIG. 129(*a*). For still another examples, the thermally oxidized film 410 may have a circular outer circumference as shown in FIG. 130(*a*), the outer circumference may shift, for example, +45° as shown in FIG. 130(*b*), the interface between the island-like semiconductor layers 110 and the thermally oxidized film 410 may be in a circular shape, as shown in FIG. 130(*c*), and the outer circumference may shift, for example, +45° as shown in FIG. 130(*d*).

For example, reaction limited oxidation is conducted under an oxygen atmosphere at a temperature of about 800 to 900° C. for about 10 to 100 minutes. The thermal oxidization of the present invention is not limited to the above-mentioned technique, but any technique that allows at least two thicknesses to form on the sides of the island-like semiconductor layers 110 may be used.

At this time, where the island-like semiconductor layers 110 are formed in the minimum photoetching dimension, the dimension of the island-like semiconductor layers 110 is reduced by the formation of the thermally oxidized film 410. In other words, the island-like semiconductor layers 110 are formed in a dimension smaller than the minimum photoetching dimension.

Next, the thermally oxidized film (the second insulating film) 410 is etched away from the periphery of each island-like semiconductor layer 110, for example, by isotropic etching. Then, as required, channel ion implantation is carried out into the sidewall of each island semiconductor layer 110 using slant ion implantation. For example, the ion implantation may be performed at an implantation energy of 5 to 100 keV at a boron dose of about $1\times10^{11}$ to $1\times10^{13}/cm^2$ at an angle of 5 to 45° with respect to the normal line of the surface of the substrate. Preferably the channel ion implantation is performed from various directions to the island-like semiconductor layers 110 because a surface impurity concentration becomes more uniform. Alternatively, instead of the channel ion implantation, an oxide film containing boron may be deposited by CVD with a view to utilizing diffusion of boron from this oxide film. The impurity implantation from the surface of the island-like semiconductor layers 110 may be carried out before the island-like semiconductor layers are covered with the thermally oxidized film 410, or the impurity implantation may be finished before the island-like semiconductor layers 110 are formed. A means for the implantation is not particularly limited so long as an equal impurity concentration distribution in the island-like semiconductor layers 110 is obtained.

Figure 88:
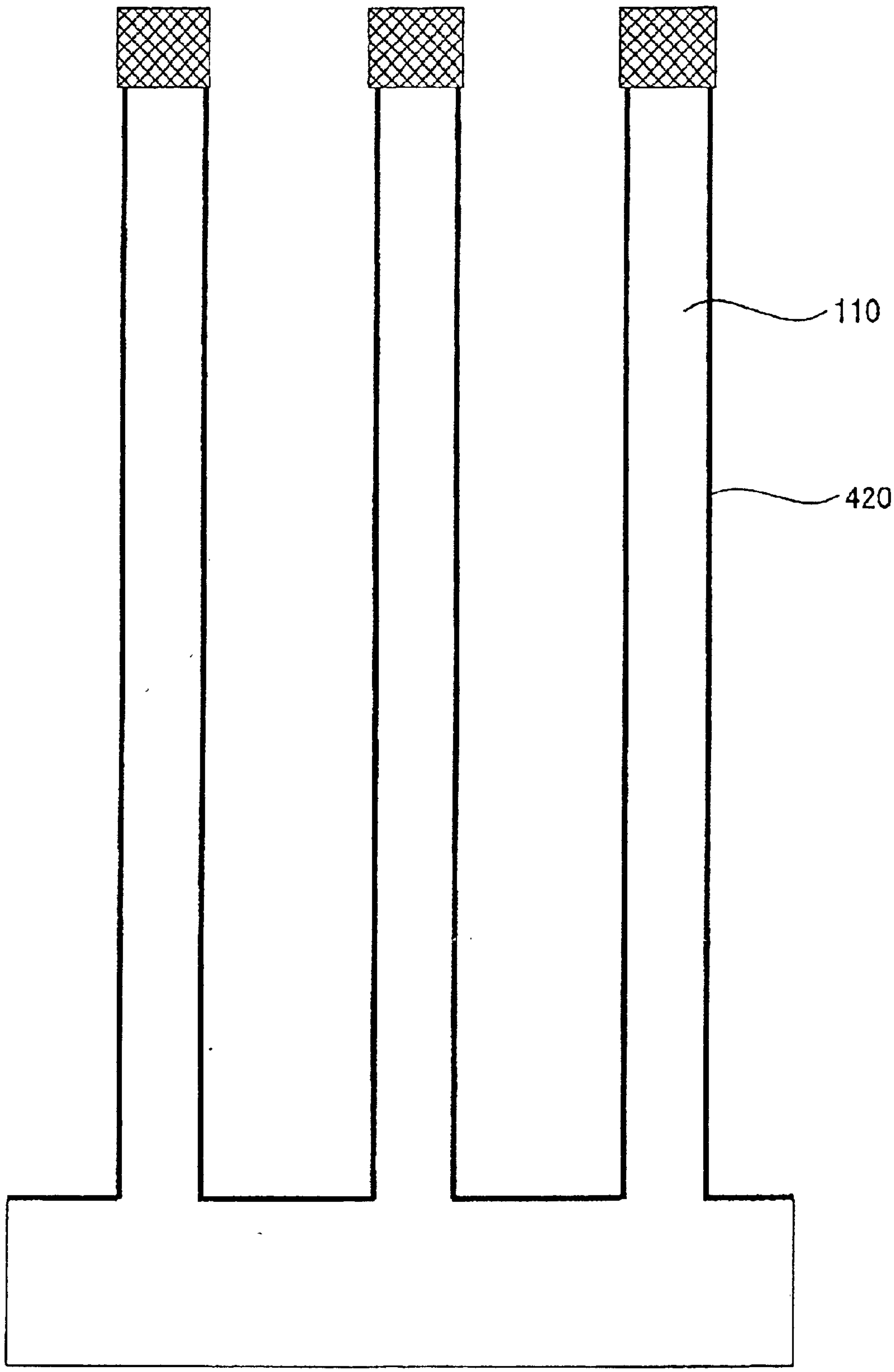
Figure 109:
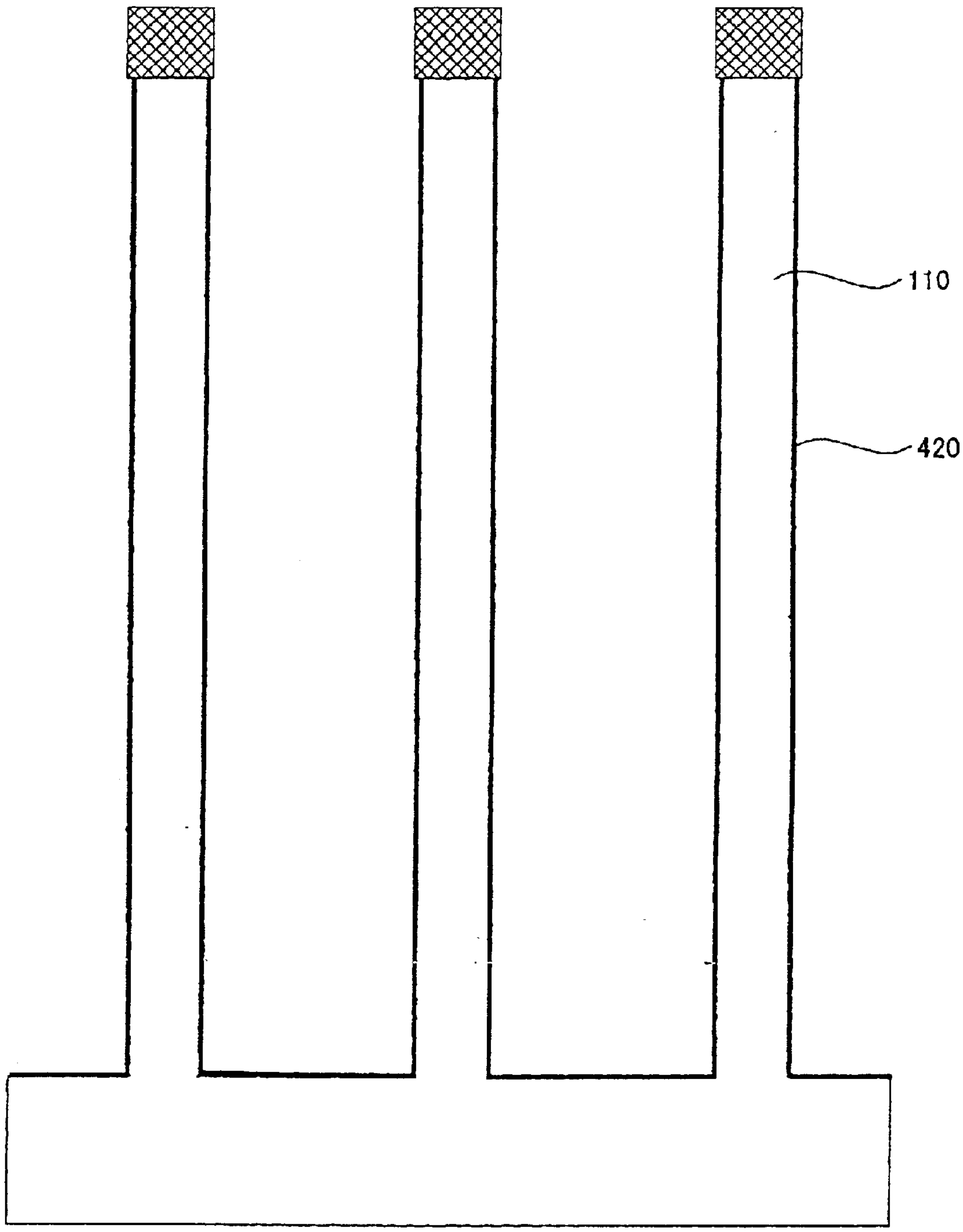

Subsequently, the thermally oxidized film 410 is removed. Then, a silicon oxide film 420 is formed as a third insulating film to be a tunnel oxide film by thermal oxidization (FIG. 88 and FIG. 109). At this time, the thickness of the thermally oxidized film also becomes anisotropic owing to the anisotropy of the speed of thermal oxidization, which further renders the island-like semiconductor layers 110 closer to the shape of a quadratic prism. In this case, since the thermally oxidized film grows thinner in the C-C' direction and the D-D' direction which are the <100> orientation of silicon crystal, the thermally oxidized film growing in the C-C' direction and the D-D' direction is an effective tunnel oxide film. This practically reduces the area of the tunnel oxide film and improves the ratio of the capacitance of the floating gate and the control gate to the capacitance of the floating gate and the island-like semiconductor layer.

In the case where the A-A' direction and the B-B' direction are the <100> orientation of silicon crystal and the C-C' direction and the D-D' direction are the <110> orientation of silicon crystal (FIG. 130 and FIG. 131), if the thermal oxidization is conducted in the same manner as in the case where the A-A' direction and the B-B' direction are the <110> orientation of silicon crystal and the C-C' direction and the D-D' direction are the <100> orientation of silicon crystal, the island-like semiconductor layers are obtained in a shape of a substantial rhombohedral prism after the silicon oxide film 420 is formed as the tunnel oxide film (FIG. 130). Since this case also has an effect in substantially reducing the area of the tunnel oxide film, the ratio of the capacitance of the floating gate and the control gate to the capacitance of the floating gate and the island-like semiconductor layer is improved.

In the case where the island-like semiconductor layers 110 are formed as described above, the island-like semiconductor layers 110 need not necessarily be substantially columnar, but may be in various shapes, for example, having a polygonal, elliptic or other cross section. When the third insulating film is formed, the island-like semiconductor layers 110 may be in the shape of a quadratic prism. It is sufficient that at least two thicknesses are formed on the sides of the island-like semiconductor layers 110. At this time, the tunnel oxide film is not limited to a thermally oxidized film, but may be a nitrogen oxide film.

Figure 89:
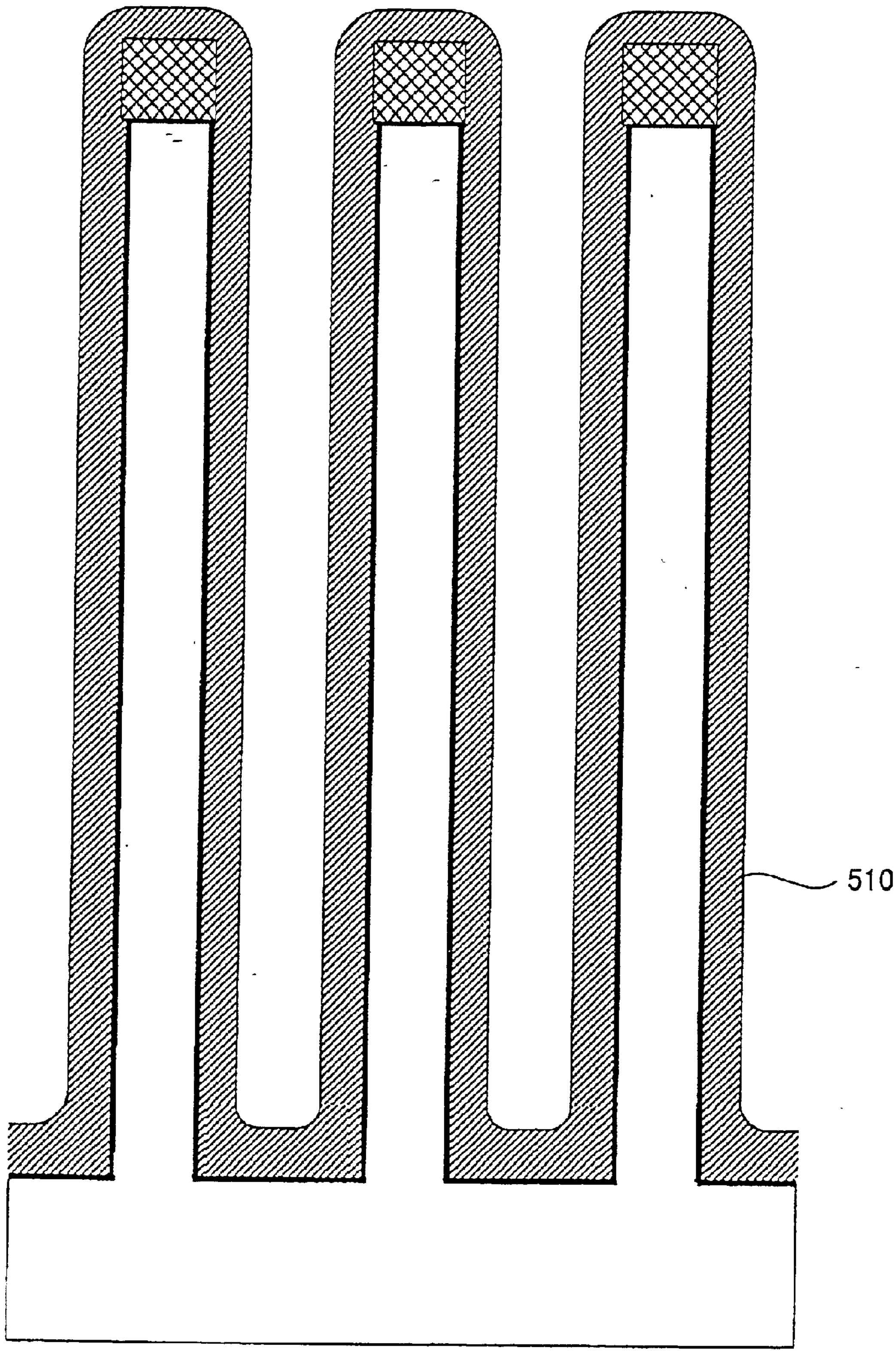
Figure 110:
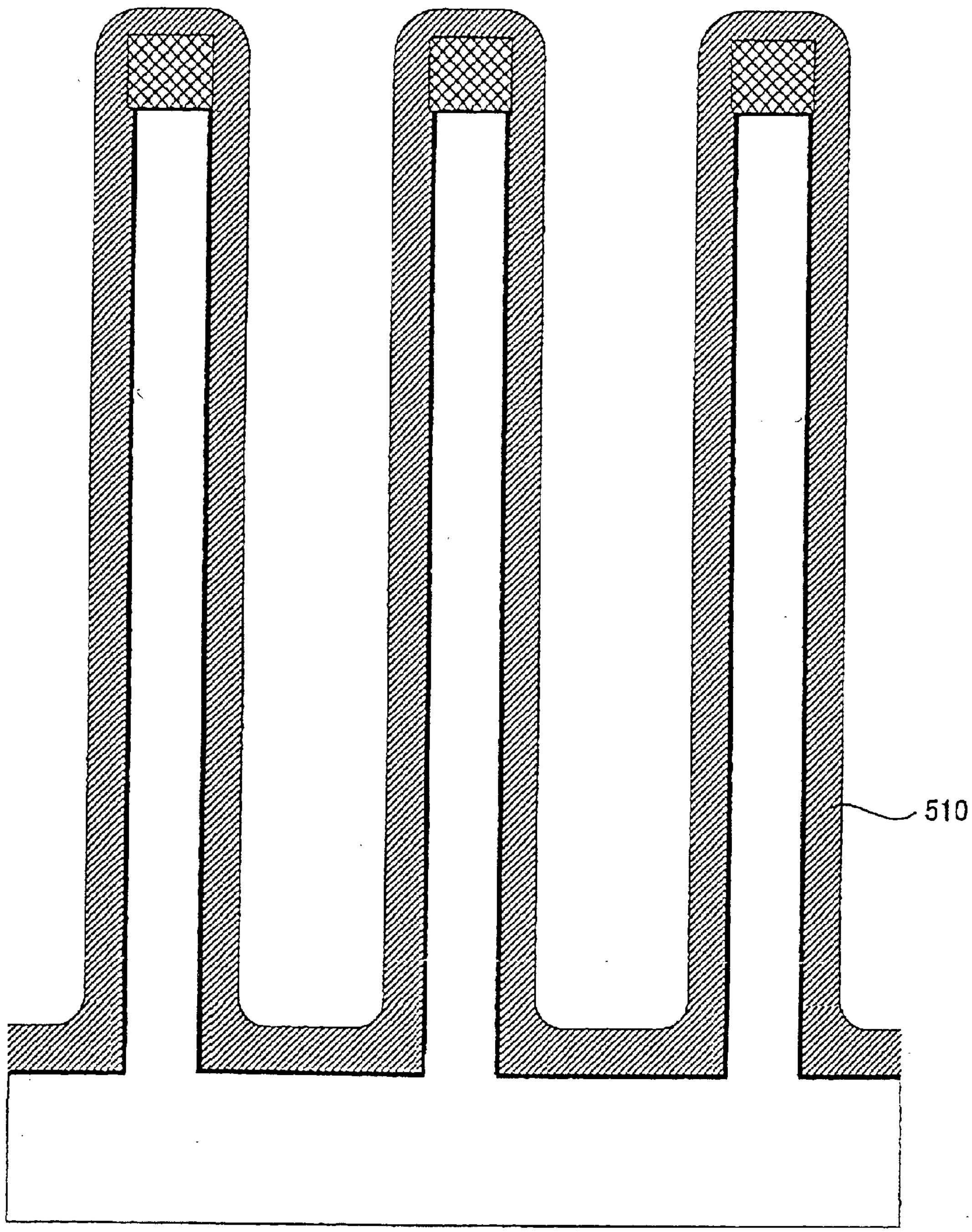

Subsequently, a polysilicon film 510, for example, is deposited to about 50 to 200 nm as a first conductive film (FIG. 89 and FIG. 110). Then, a silicon nitride film 321, for example, is deposited to 5 to 50 nm as a fourth insulating film by CVD.

Figure 90:
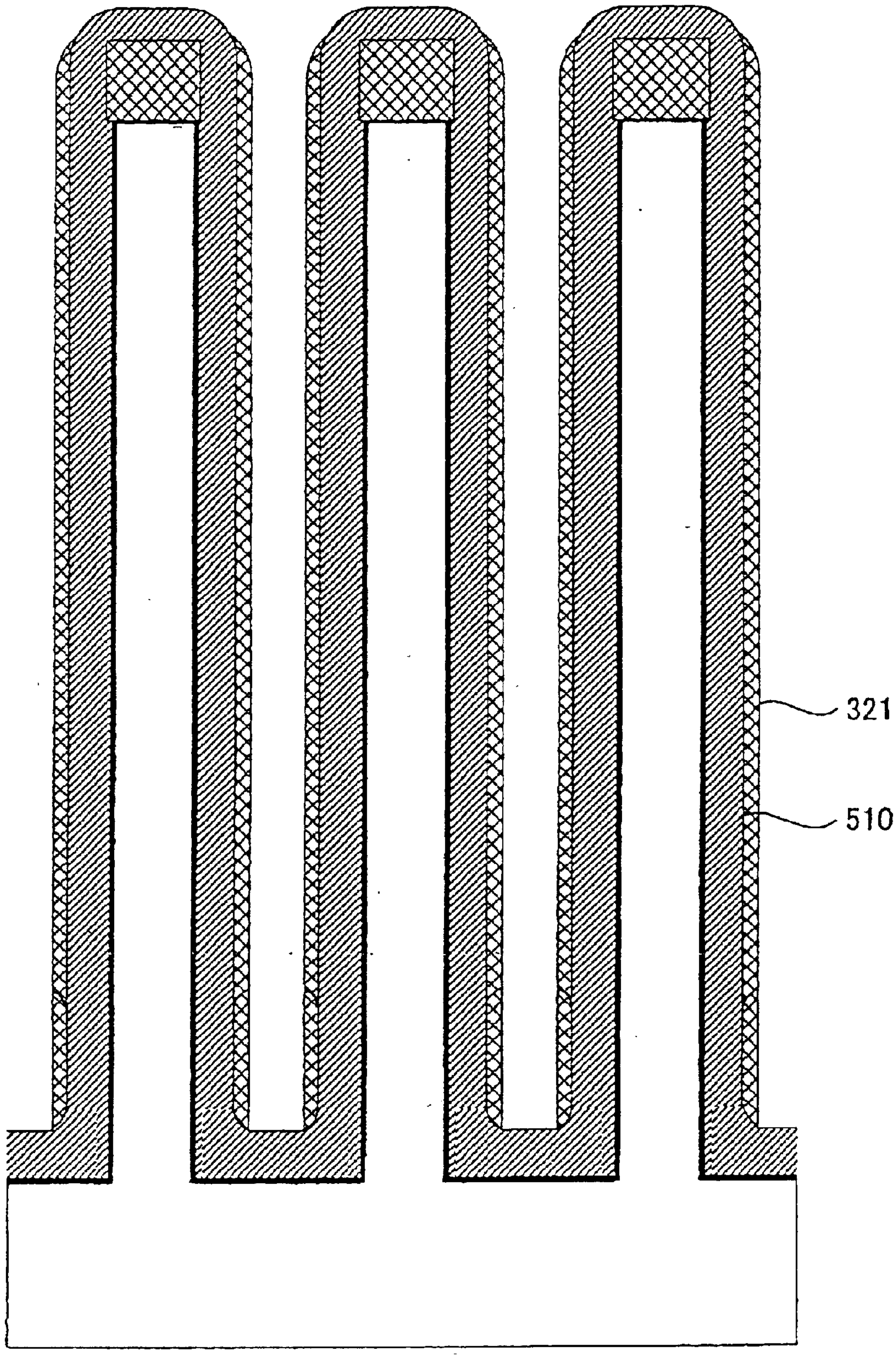
Figure 91:
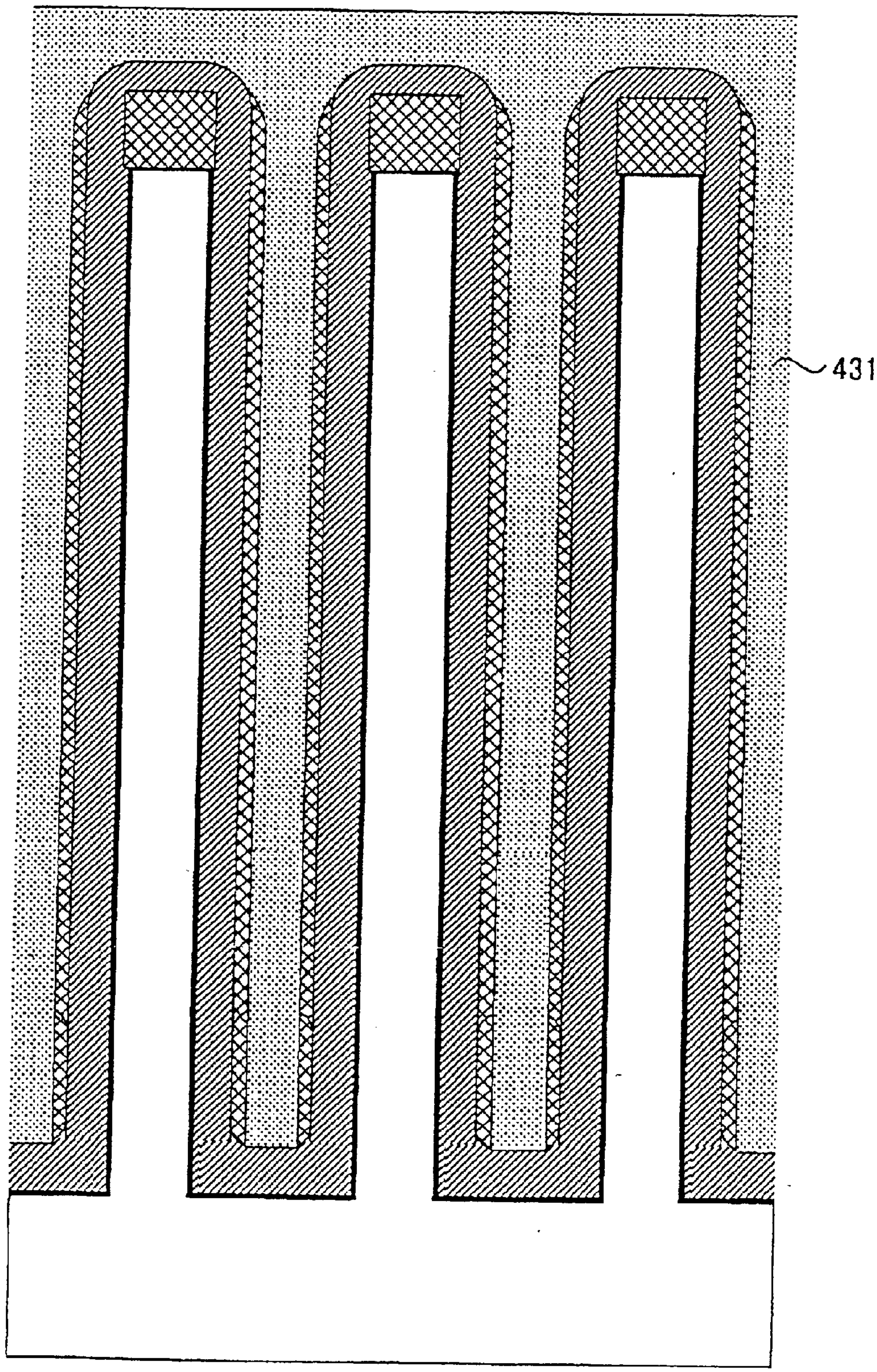
Figure 111:
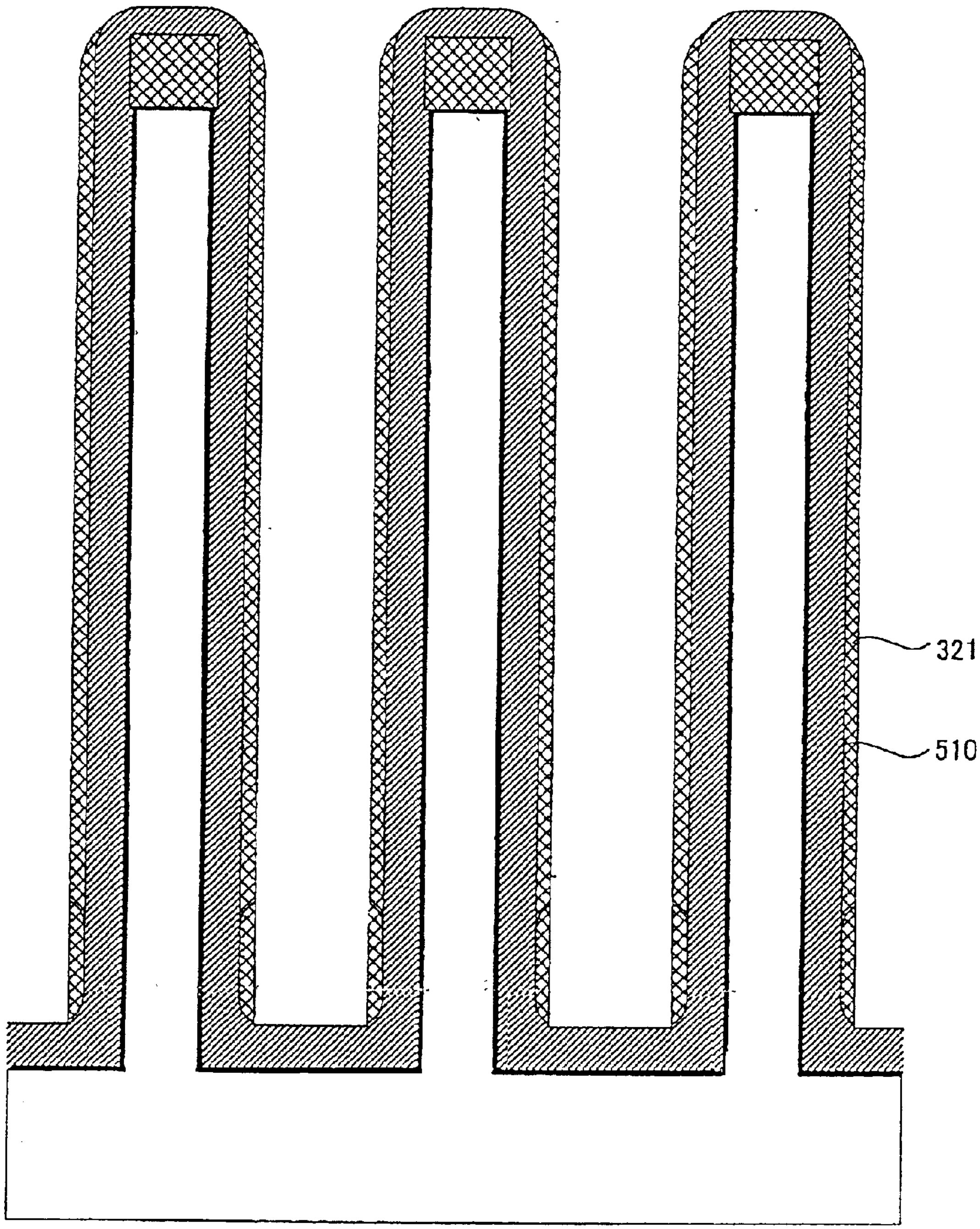
Figure 112:
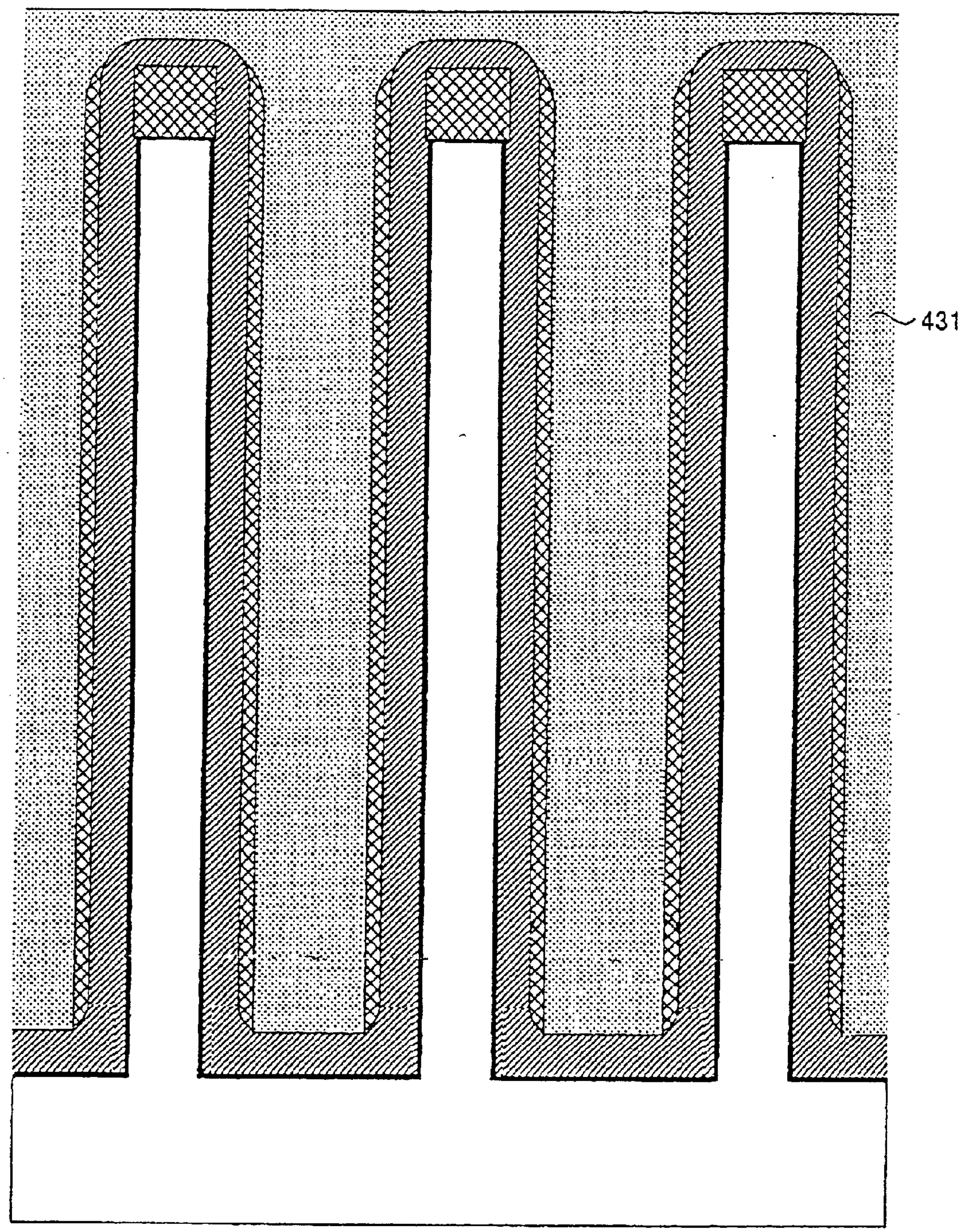

Subsequently, the silicon nitride film 321 is etched to remain in the form of sidewalls on the sidewalls of the polysilicon film 510 (FIG. 90 and FIG. 111). A silicon oxide film 431, for example, is deposited to 50 to 500 nm as a fifth insulating film in the first lattice-form trench 210 by CVD (FIG. 91 and FIG. 112).

Figure 92:
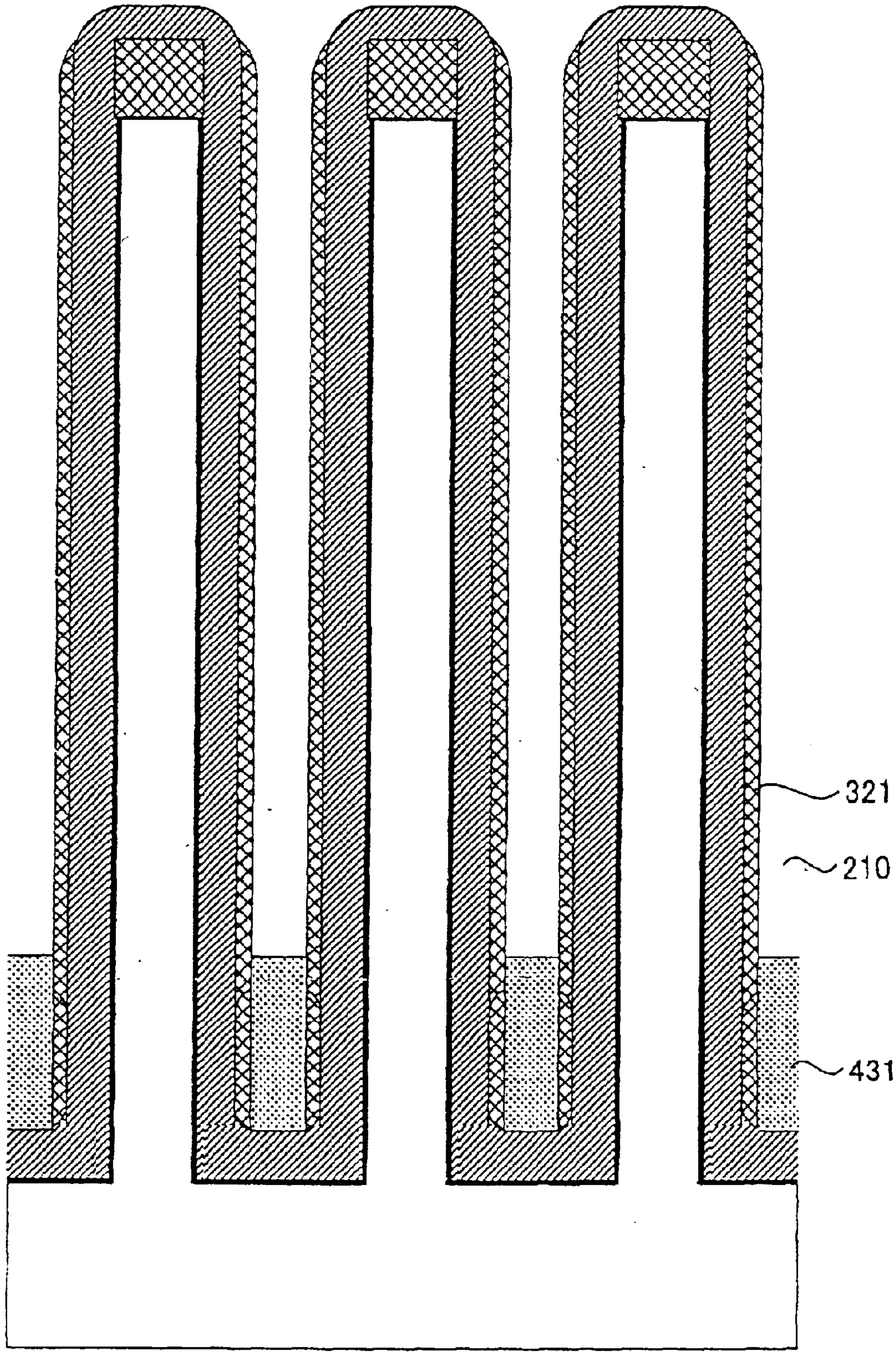
Figure 113:
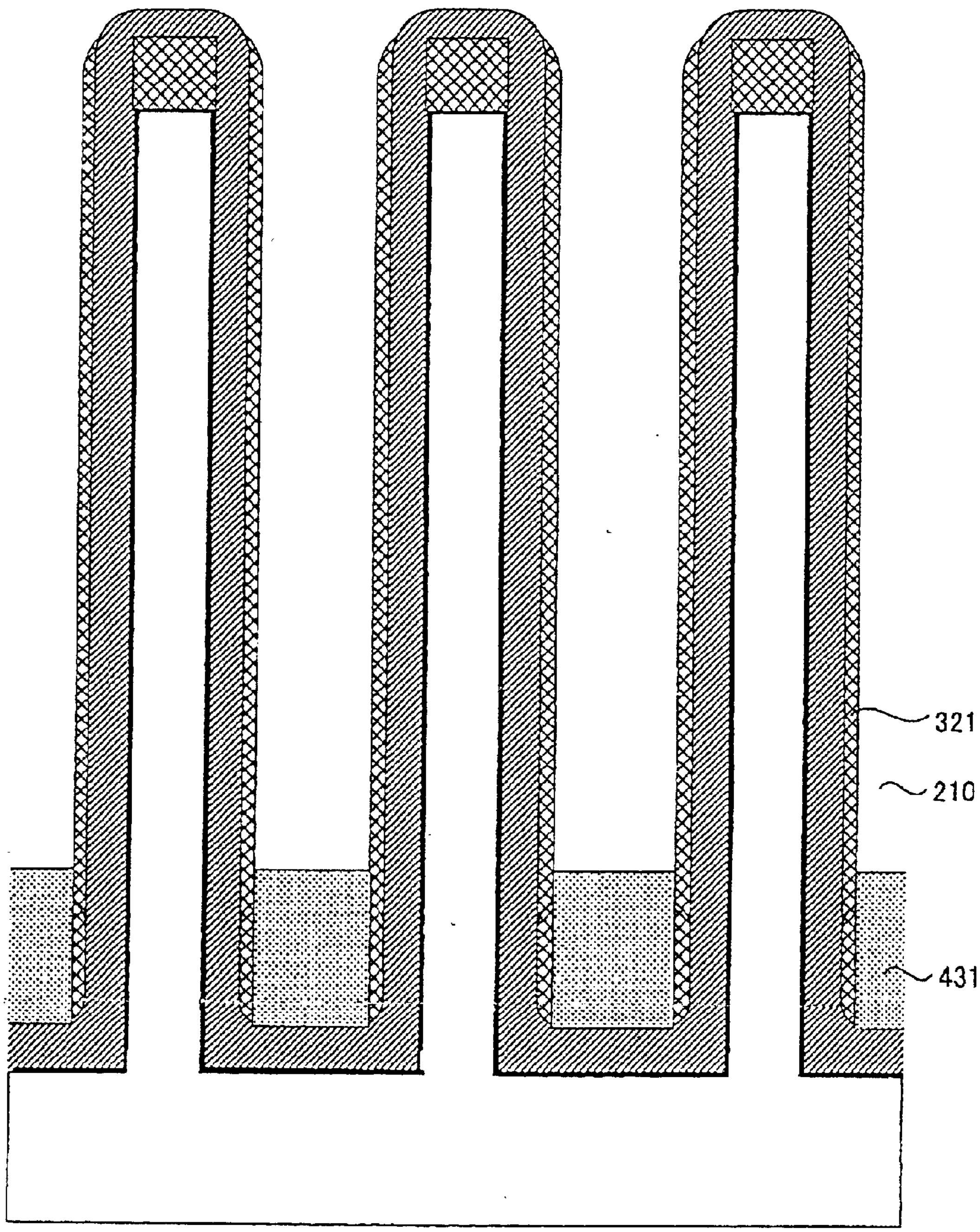

The silicon oxide film 431 is removed to a desired depth to form buried layers in the first lattice-form trench 210 (FIG. 92 and FIG. 113).

Figure 93:
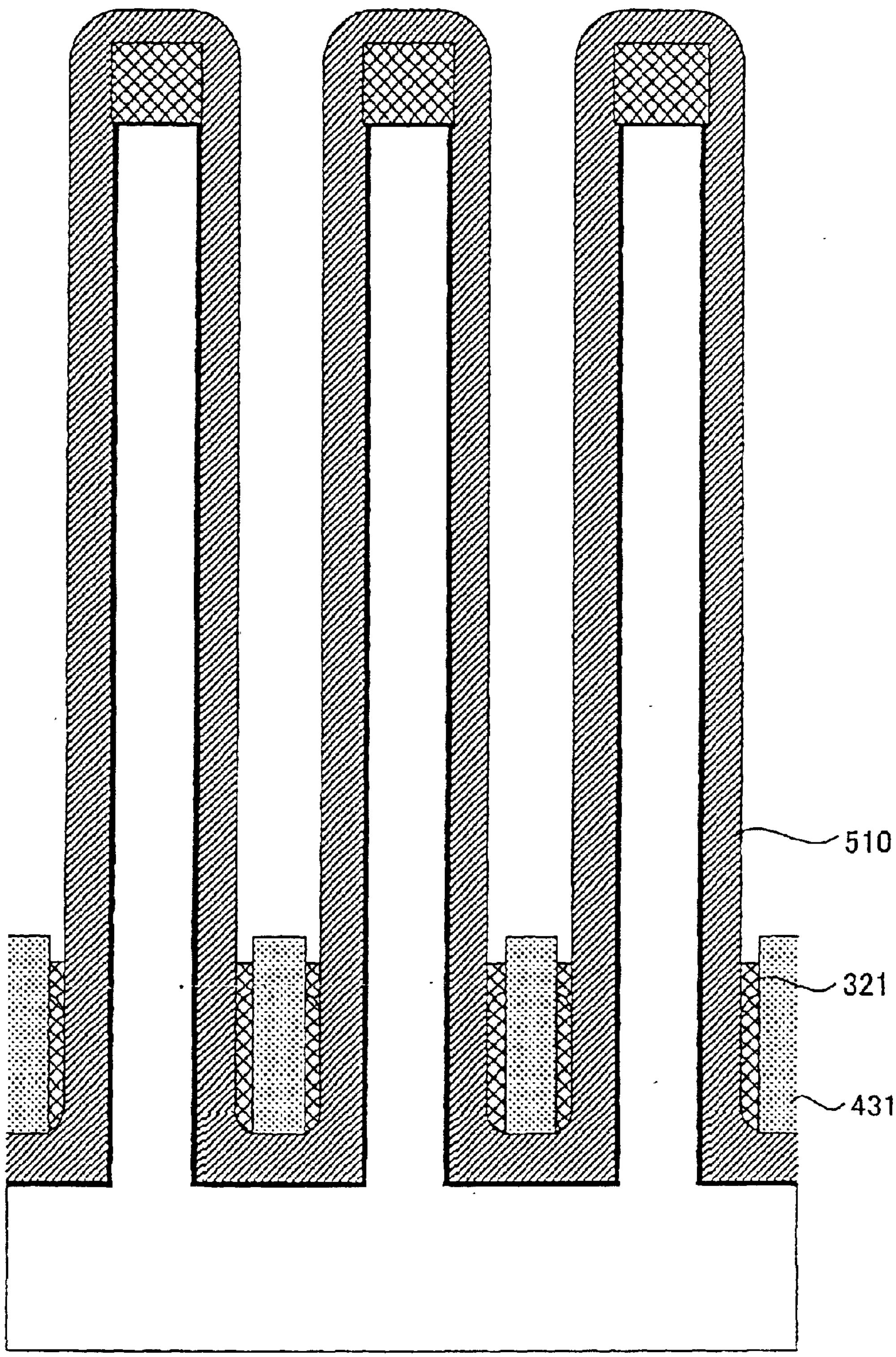
Figure 114:
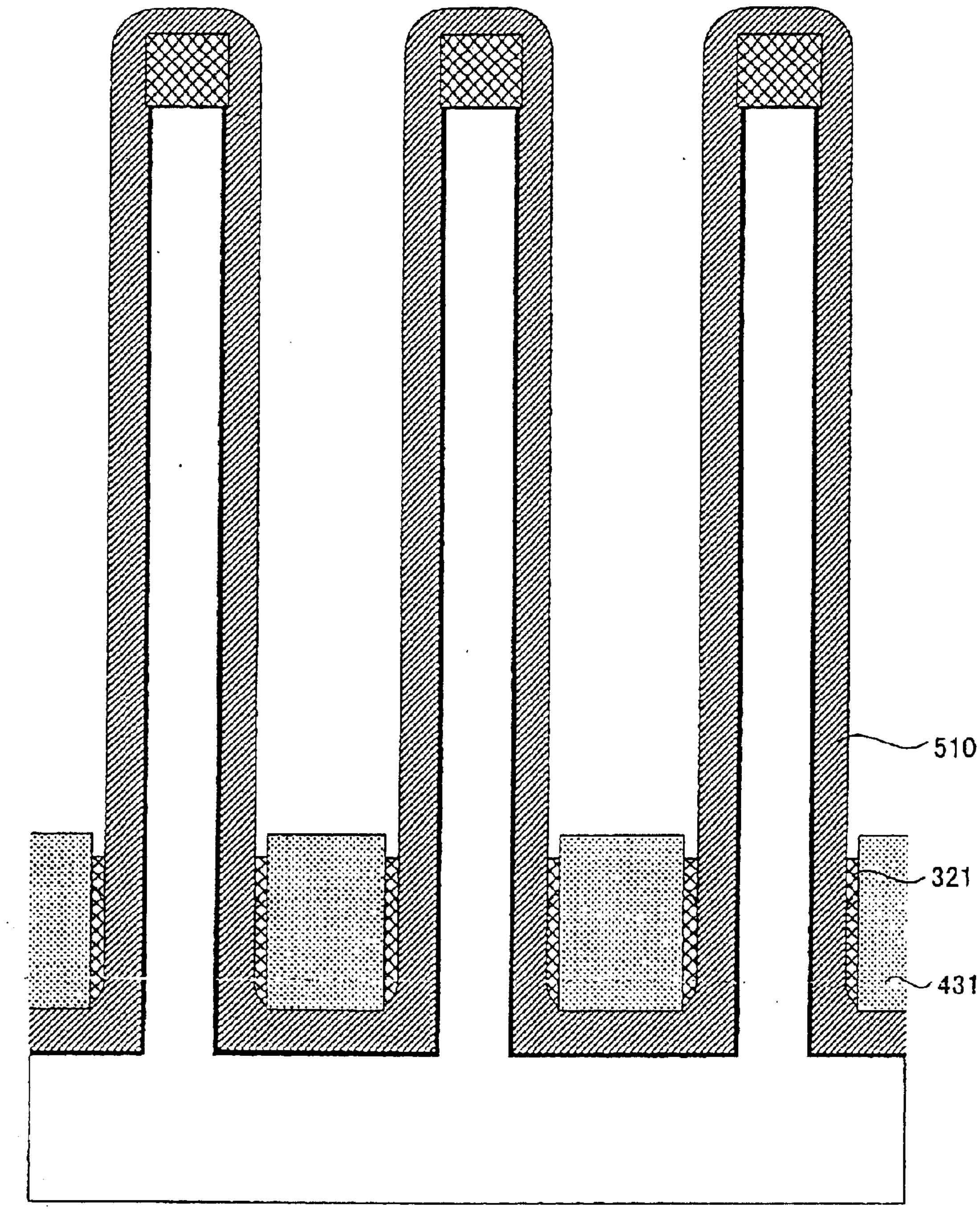

Using the silicon oxide film 431 as a mask, the silicon nitride film 321 is isotropically etched to remain only between the silicon oxide film 431 and the polysilicon film 510 (FIG. 93 and FIG. 114). At this time, the silicon nitride film 321 is lower than the top surface of the silicon oxide film 431 to form a recess.

In this recess, a silicon oxide film 441 is deposited as a sixth insulating film to about 3 to 30 nm. At this time, the above recess is filled if the thickness of the silicon oxide film 441 is about half or more of the thickness of the silicon nitride film 321. Since the oxide film 441 also deposits on the sidewall of the polysilicon film 510, the oxide film 441 is removed from the sidewall of the polysilicon film 510, for example, by isotropic etching. Thereby the silicon oxide film 441 remains in the recess, and the silicon nitride film 321 is buried with the silicon oxide film 431 and the silicon oxide film 441.

Figure 94:
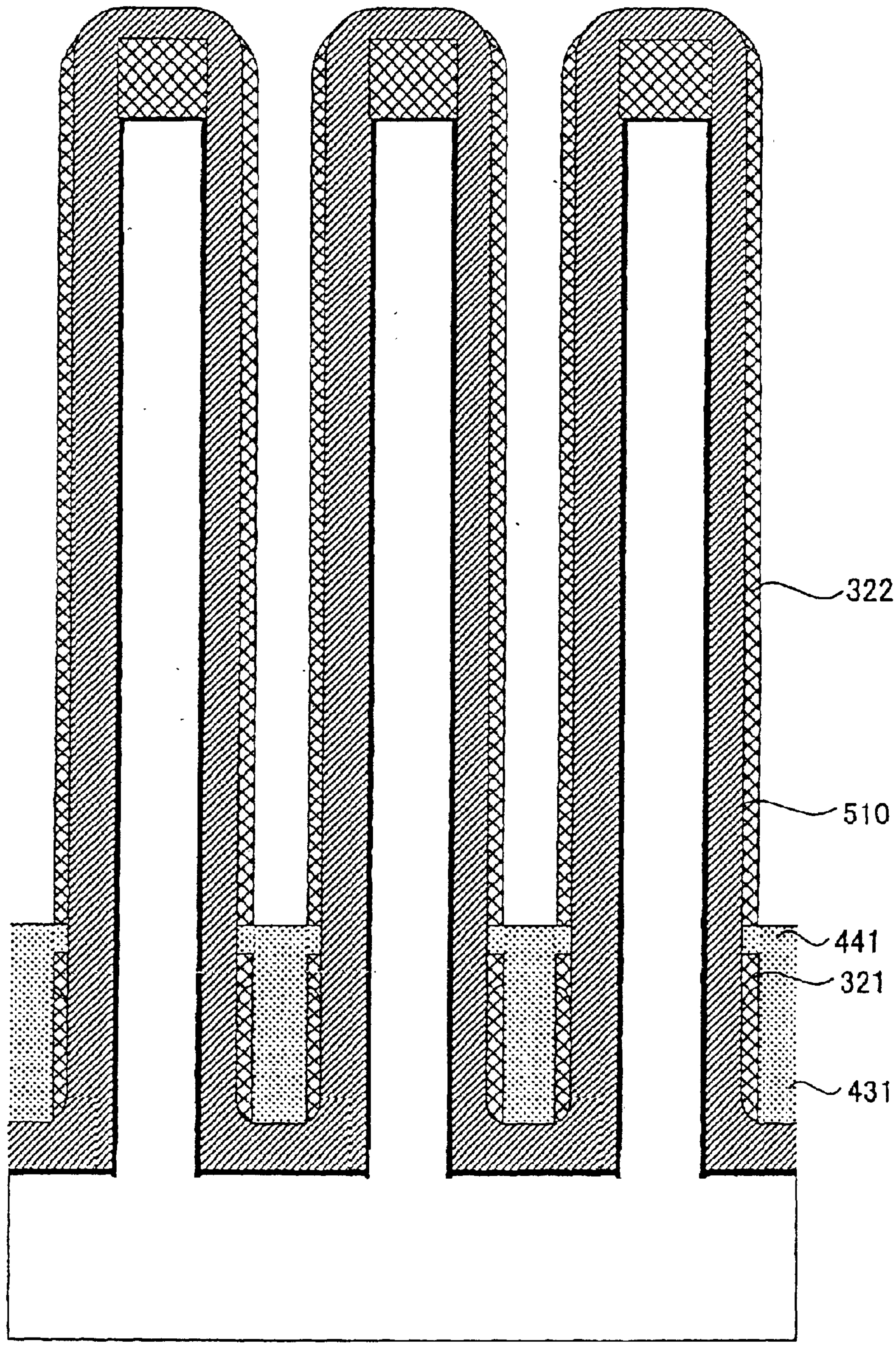
Figure 95:
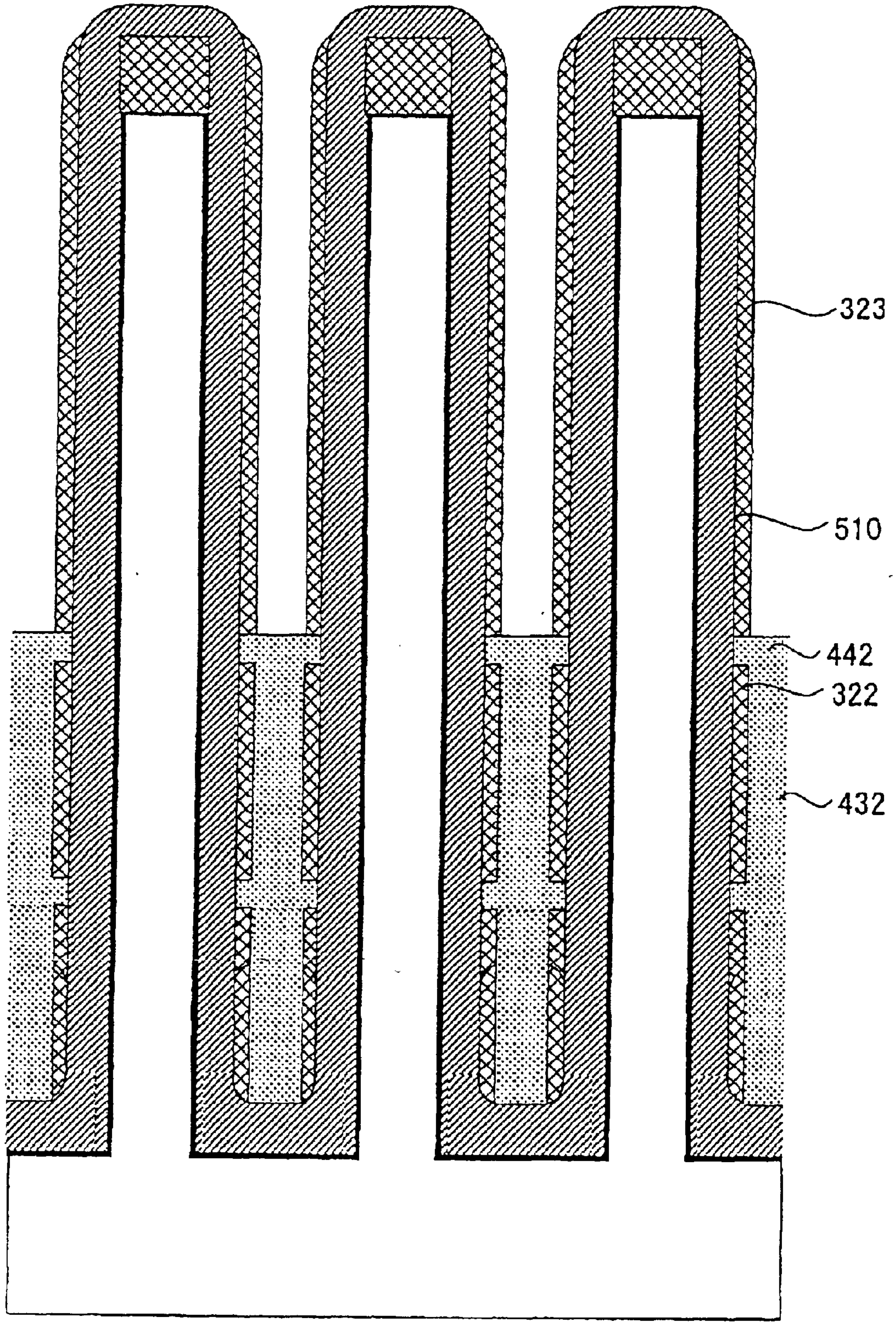
Figure 115:
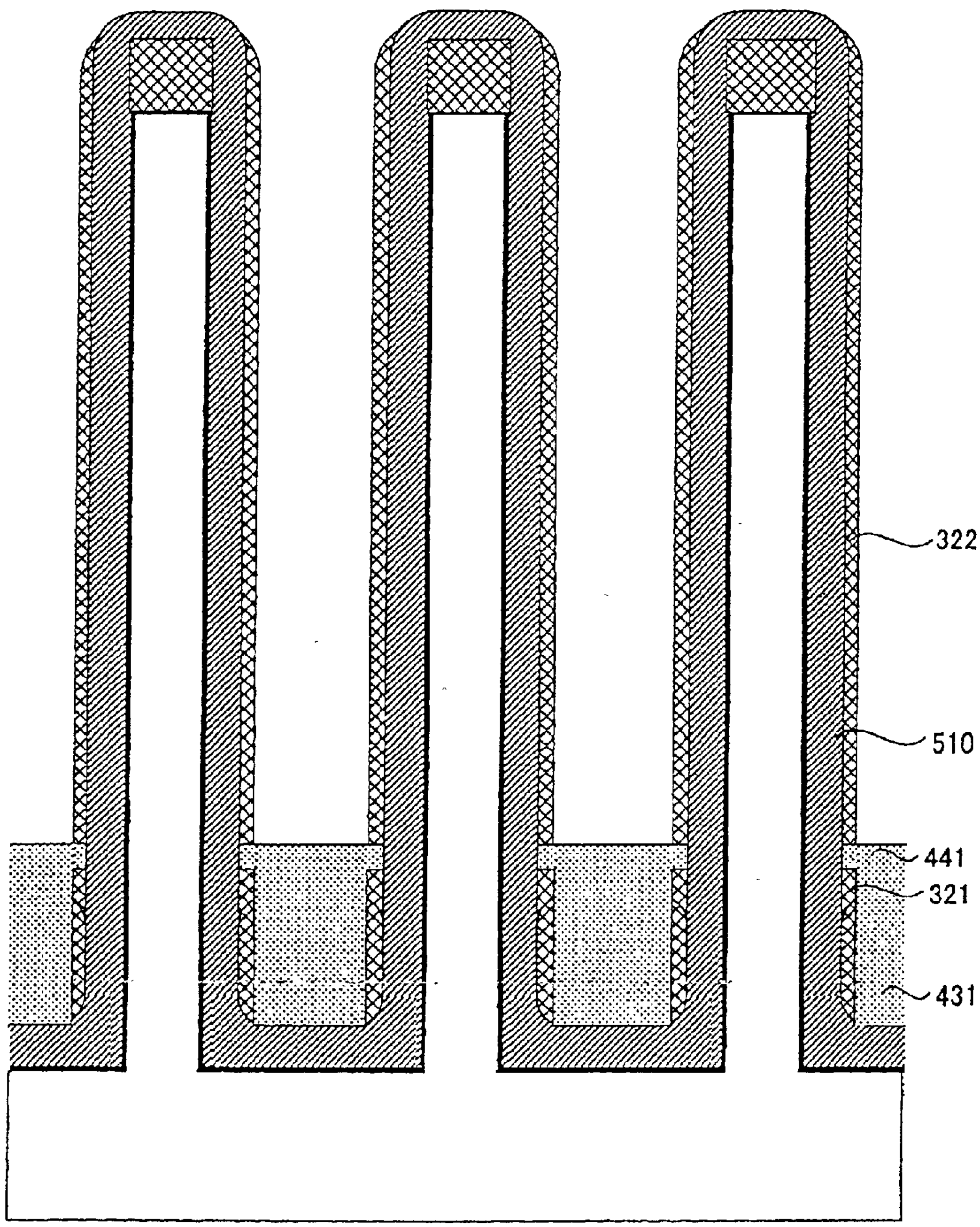
Figure 116:
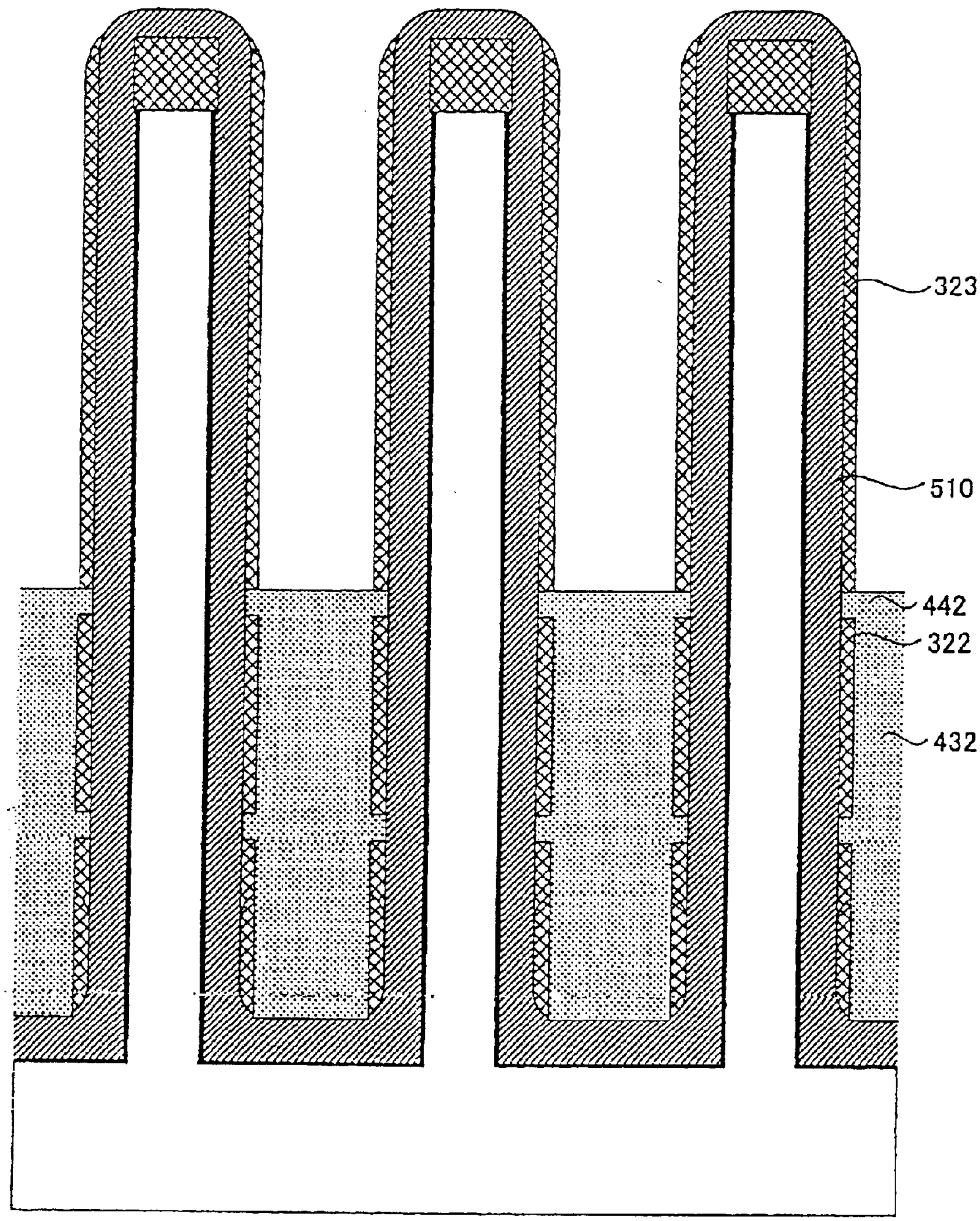

Subsequently, in the same manner, a silicon nitride film 322 is deposited to about 5 to 50 nm as a fourth insulating film by CVD. The silicon nitride film 322 is etched by RIE to remain in the form of a sidewall on the sidewall of the polysilicon film 510 (FIG. 94 and FIG. 115).

Thereafter, in the same manner, a silicon oxide film 432 is buried as a fifth insulating film, and a silicon oxide film 442 is disposed as a sixth insulating film on the top of the silicon nitride film 322 in the sidewall form in the same manner as the silicon oxide film 441 is formed as the fourth insulating film. Thereafter, a silicon nitride film is formed a sidewall 323 on the sidewall of the polysilicon film 510 in the same manner as described above (FIG. 95 and FIG. 116).

Figure 96:
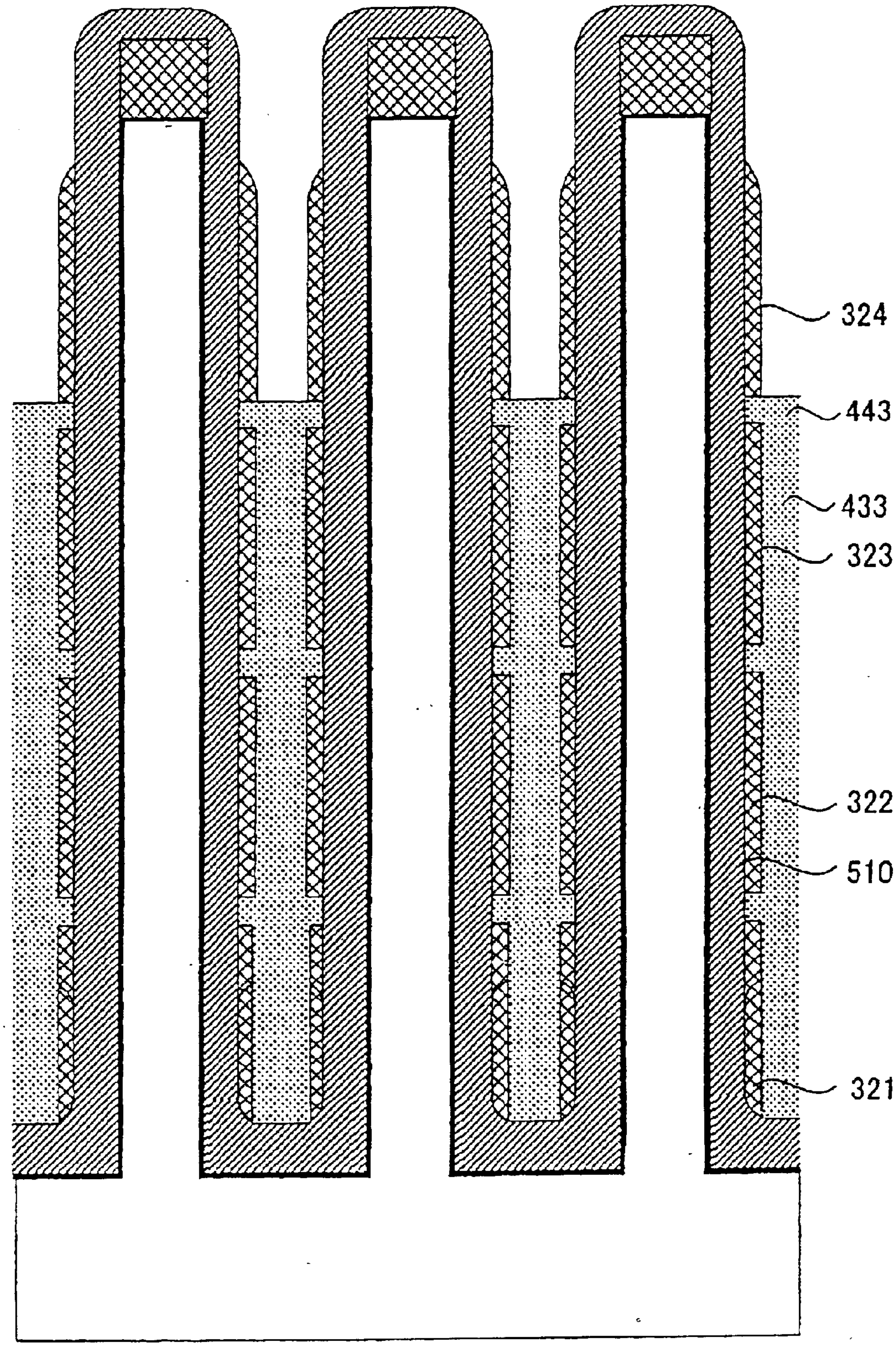
Figure 117:
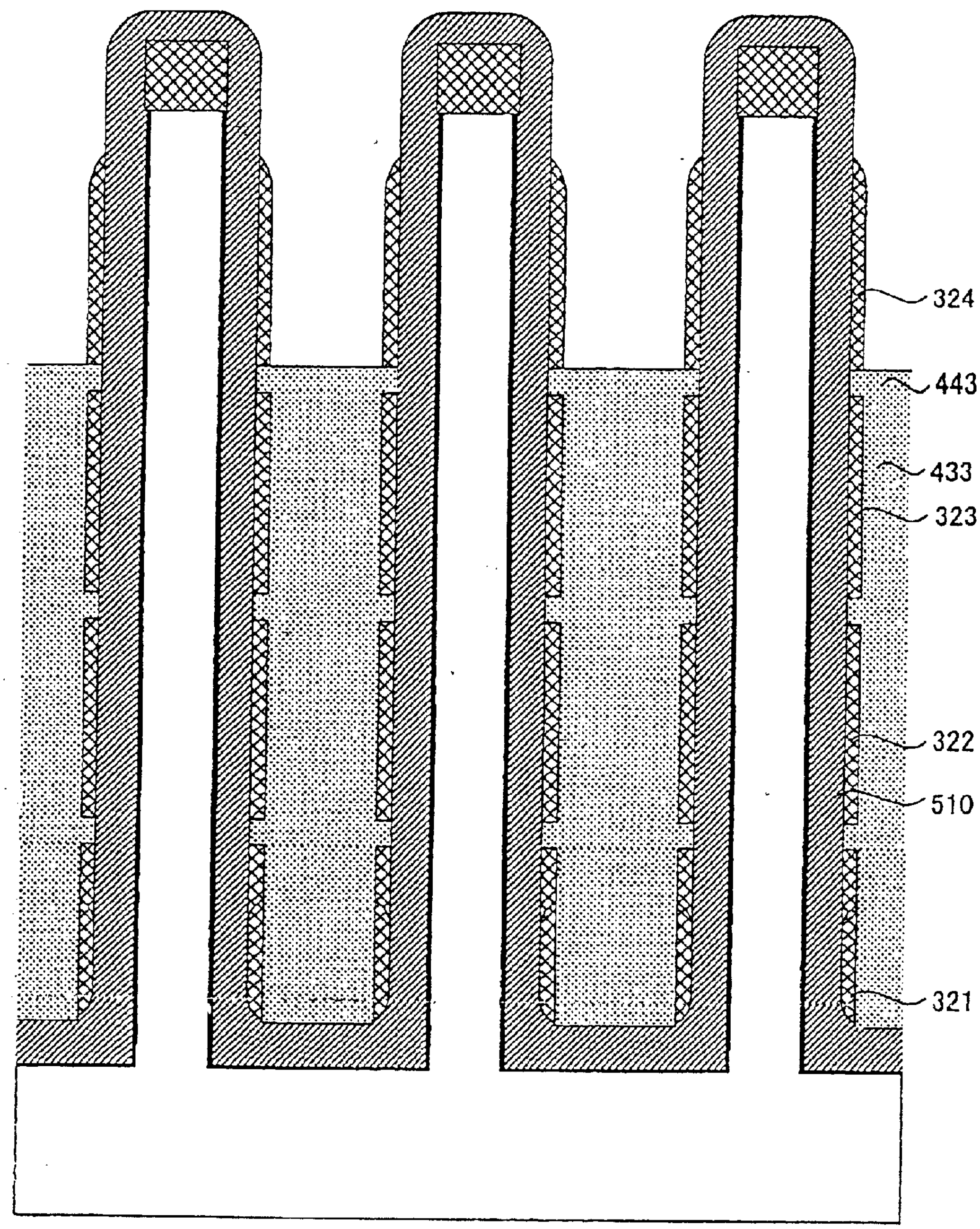

By repeating these steps, a plurality of sidewalls are formed of the silicon nitride film as the fourth insulating film on the sidewall of the polysilicon film 510 (FIG. 96 and FIG. 117).

The polysilicon film 510 is divided by isotropic etching.

The polysilicon film 510 is divided into polysilicon films 511 to 514 which are first conductive films. This division may be conducted by thermal oxidization using as a mask the silicon nitride films 321 to 324 as fourth insulating films or by combination of etching and thermal oxidization.

Figure 97:
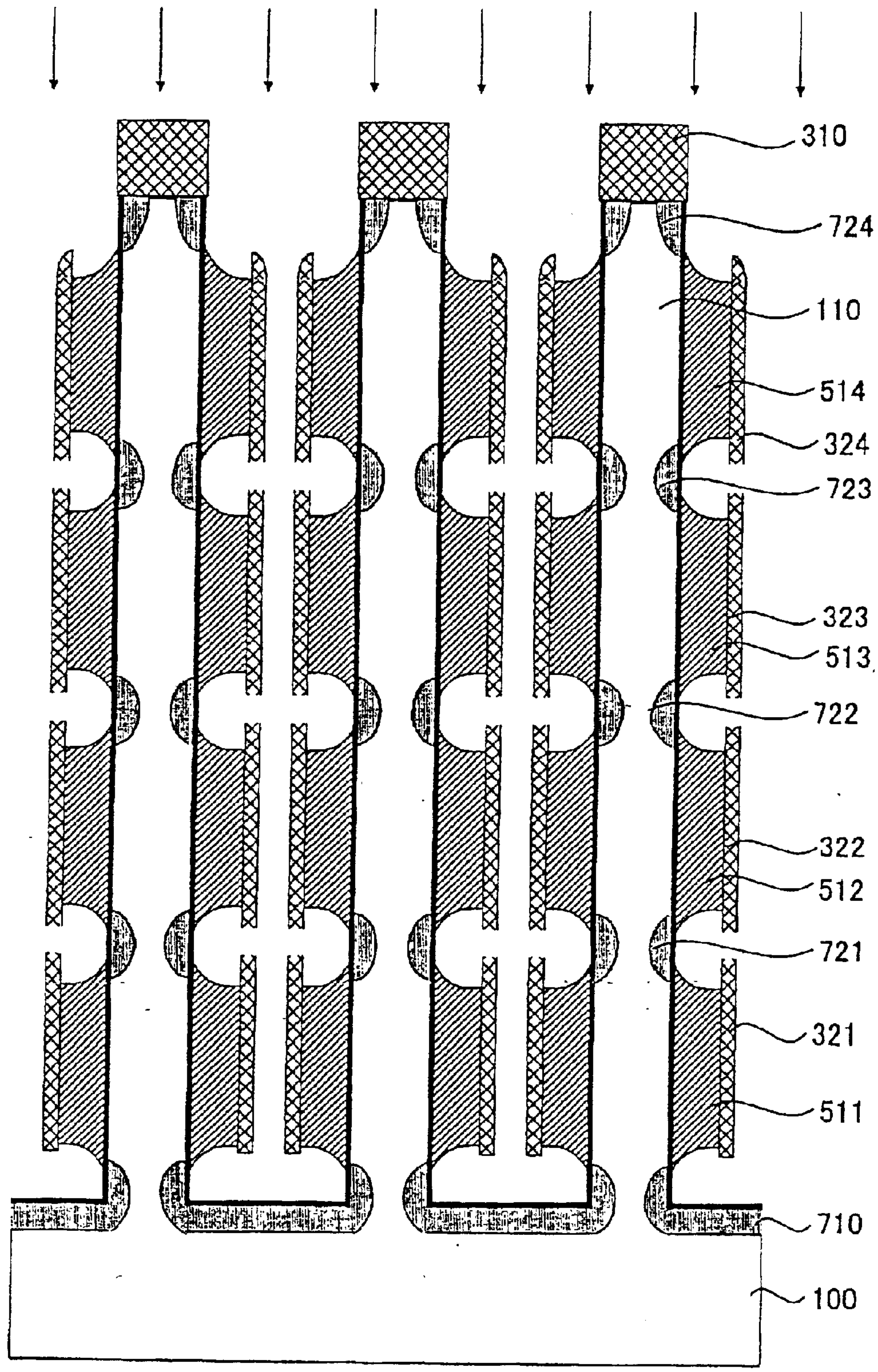
Figure 118:
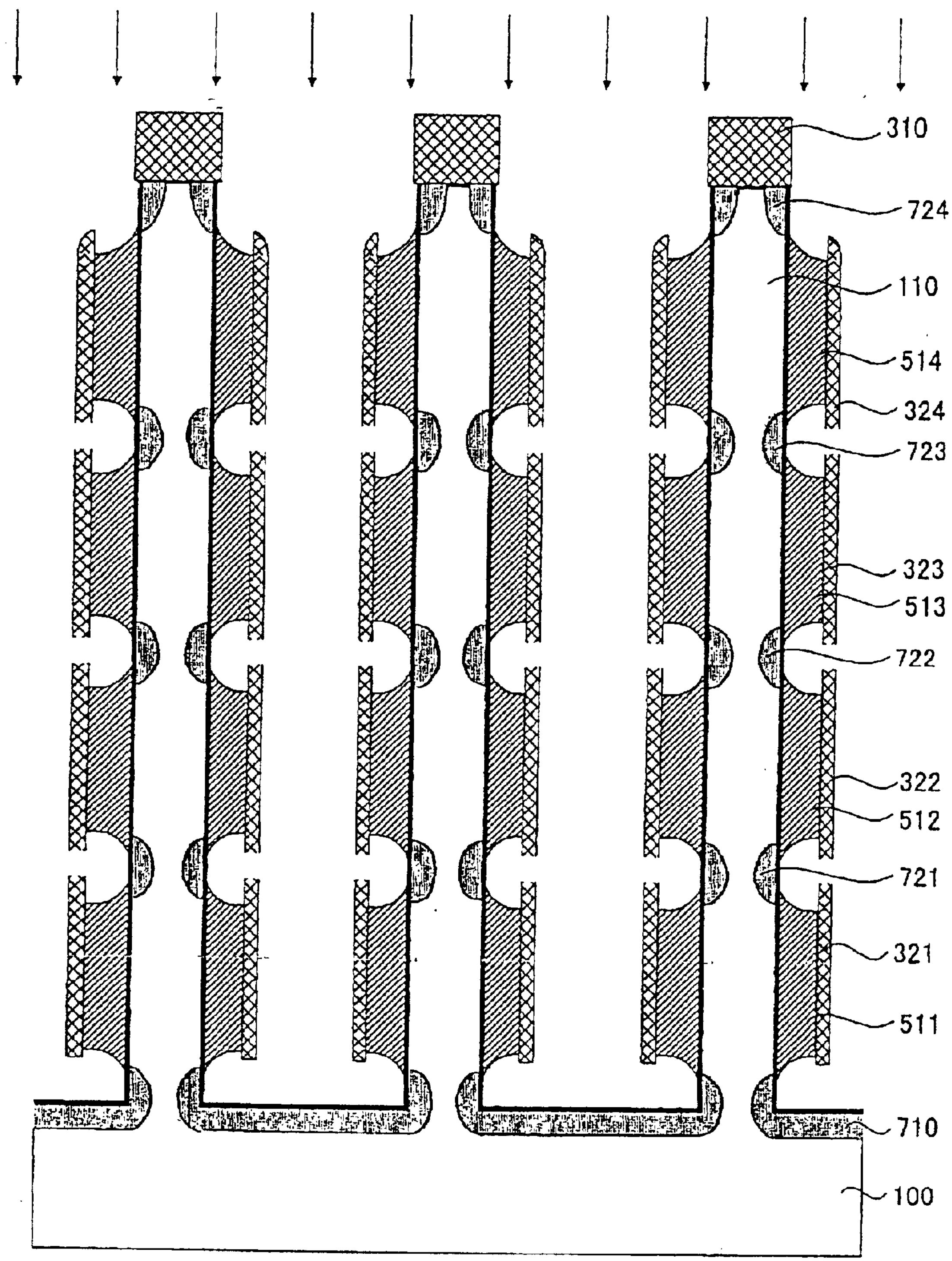

Impurity introduction is carried out into the island-like semiconductor layers 110 and the semiconductor substrate 100 in self-alignment with the divided polysilicon films 511 to 514 and the silicon nitride film 310. For example, N-type impurity diffusion layers 710 to 724 are formed in an arsenic concentration of about $1\times10^{18}$ to $1\times10^{21}/cm^3$ using a diffusion process (e.g., solid, solid-vapor or vapor phase diffusion process, etc.). At this time, the impurity diffusion layer 710 to be a first wiring layer may be adjusted about its impurity concentration by ion implantation or the like (FIG. 97 and FIG. 118). For example, the ion implantation may be performed at an implantation energy of 5 to 100 keV in a phosphorus dose of about $1\times10^{13}$ to $1\times10^{15}/cm^2$ in a direction inclined by about 0 to 7°.

The timing of forming the impurity diffusion layer 710 is not necessarily the same as the timing of forming the N-type semiconductor layers 721 to 724. For example, the impurity diffusion layer 710 may be formed by ion implantation after the formation of the thermally oxidized film 410 or after the formation of the silicon oxide film 420. Alternatively, the impurity diffusion layer 710 may be formed by combining two or more of these timings.

Figure 98:
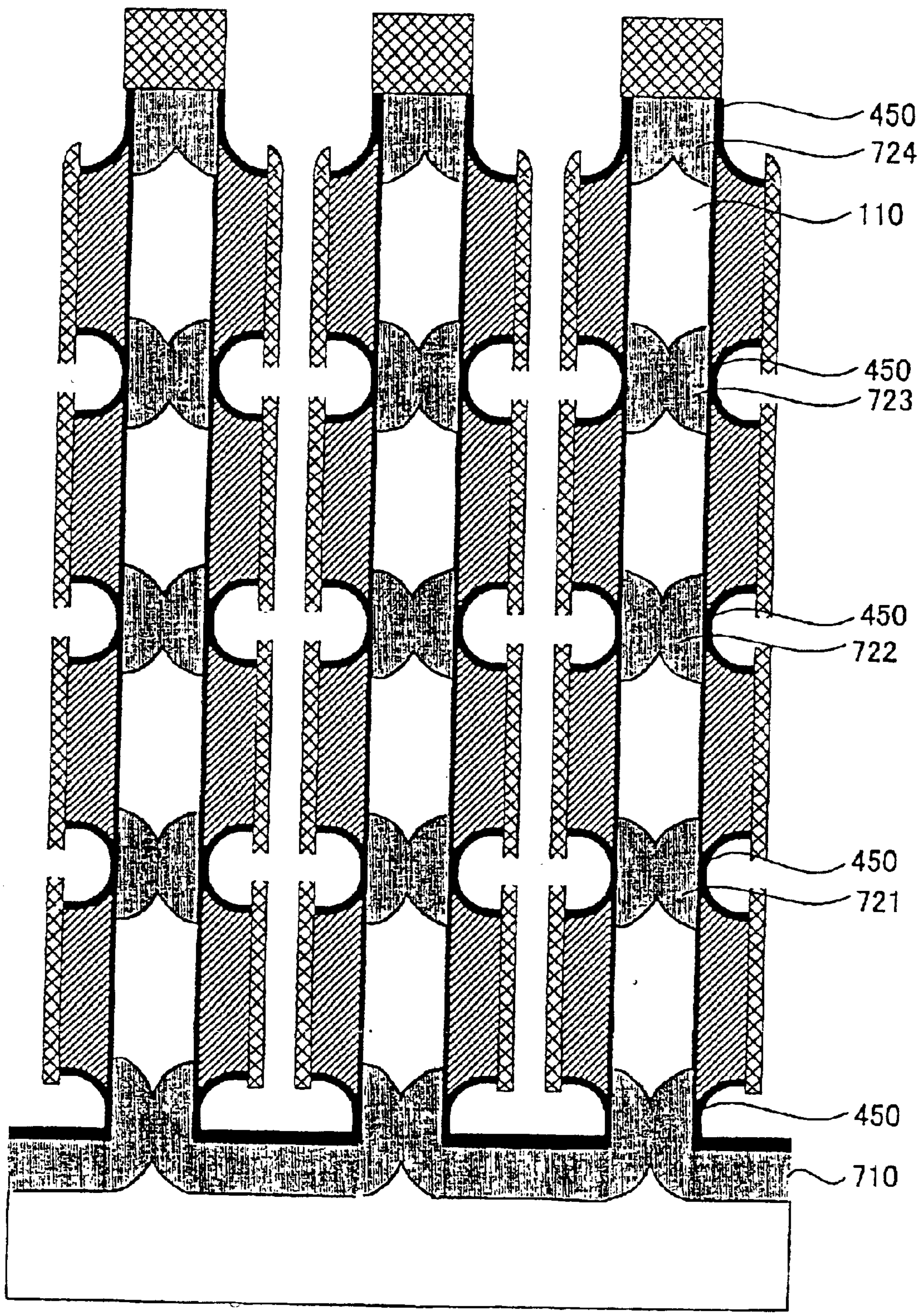
Figure 119:
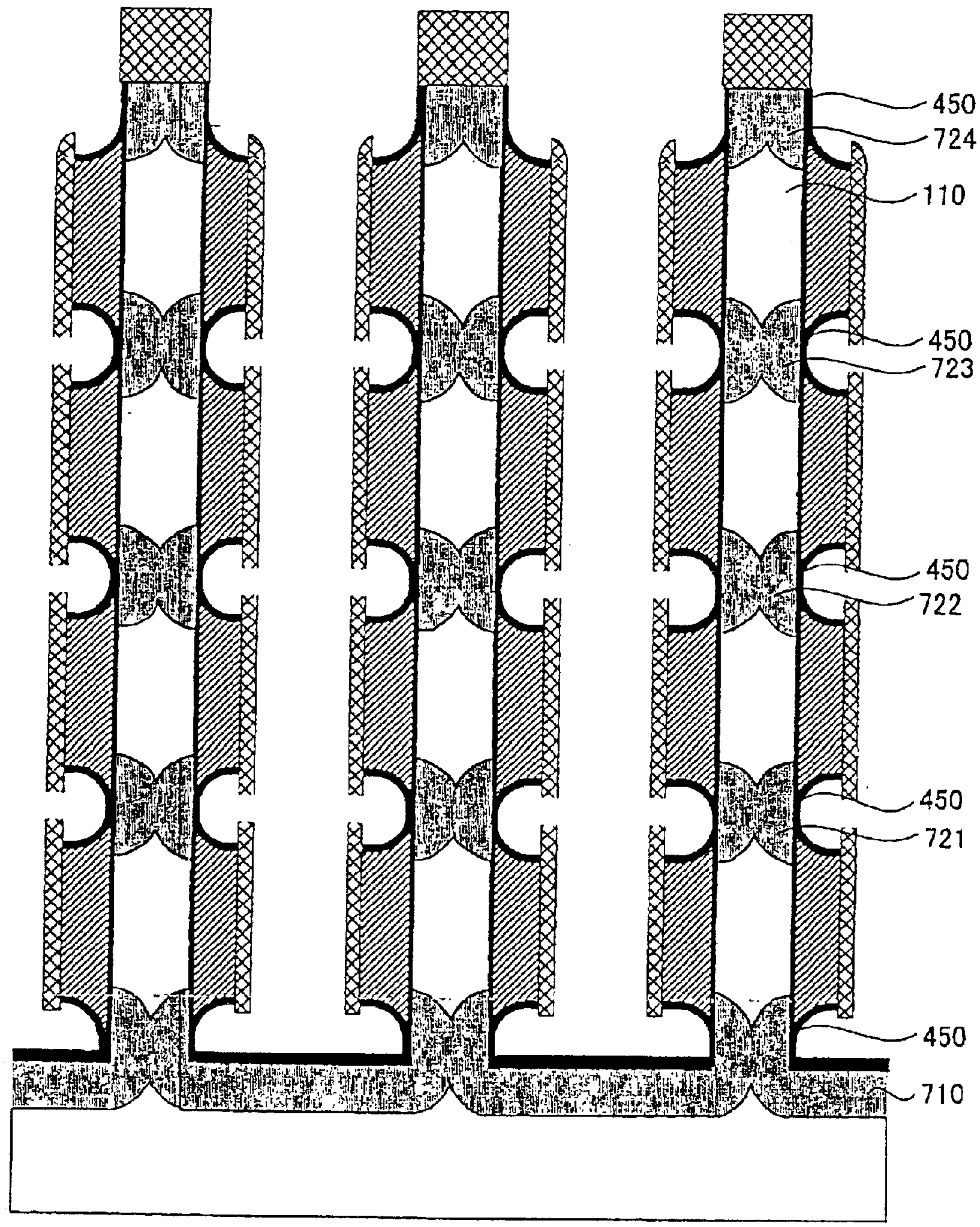

Thereafter, exposed portions of the polysilicon films 511 to 514 are thermally oxidized selectively to form silicon oxide films 450 of 5 to 50 nm thickness which are seventh insulating films. At this time, the impurity is diffused from the impurity diffusion layers 710 to 724 by thermal treatment to electrically float P-type regions of the island-like semiconductor layer 110 (FIG. 98 and FIG. 119). The timing of the impurity introduction to the polysilicon films 511 to 514 is not particularly limited so long as these films become conductive films. For example, the impurity introduction may be performed during the formation of the polysilicon film 510 or during the impurity introduction into the island-like semiconductor layers 110.

Thereafter, the sidewalls 321 to 324 of the silicon nitride film are removed, for example, by isotropic etching. Then, a silicon oxide film 461 is deposited to 50 to 500 nm as an eighth insulating film and isotropically or anisotropically etched so that the silicon oxide film 461 is embedded to bury the side of the polysilicon 511.

Figure 99:
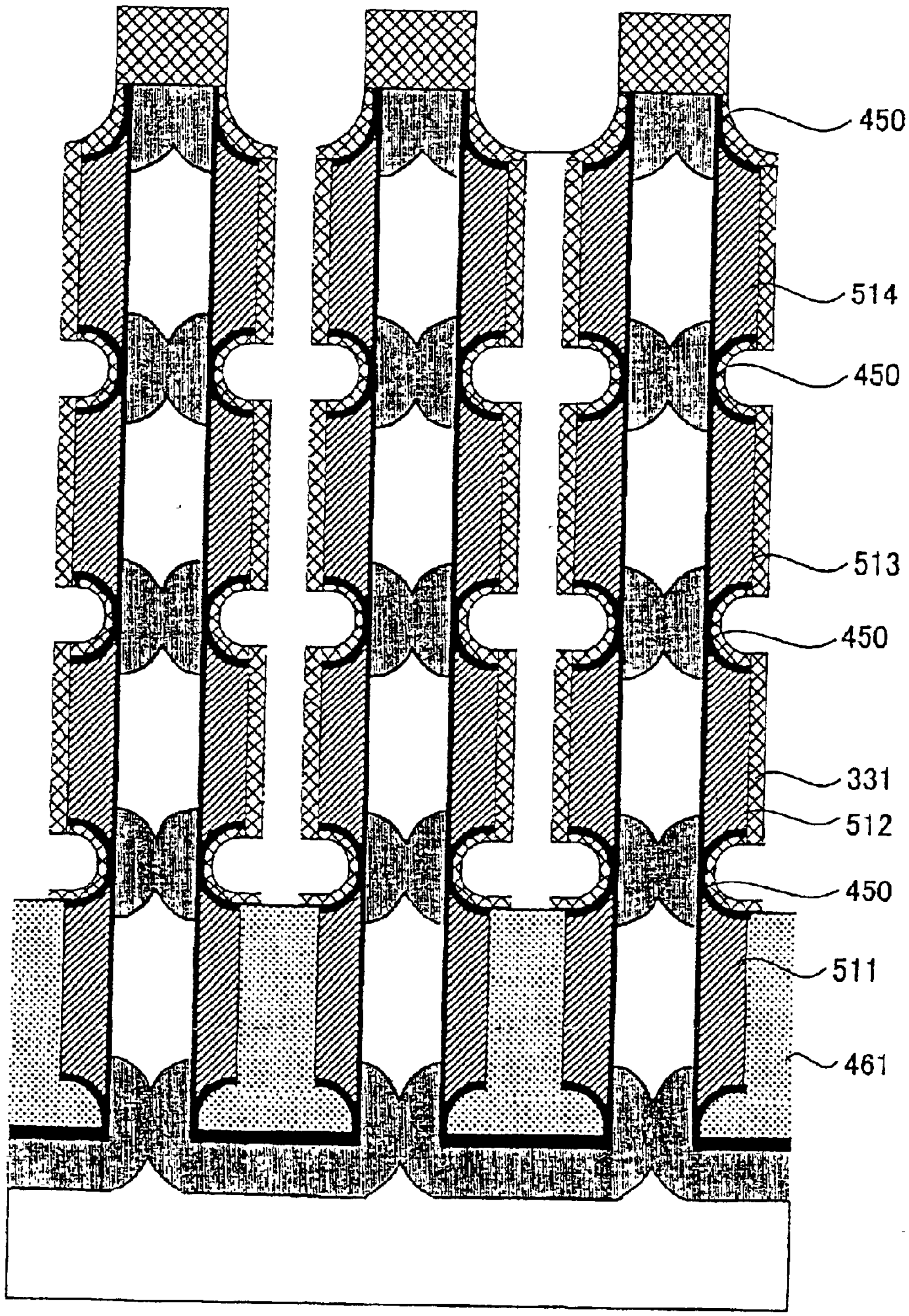
Figure 120:
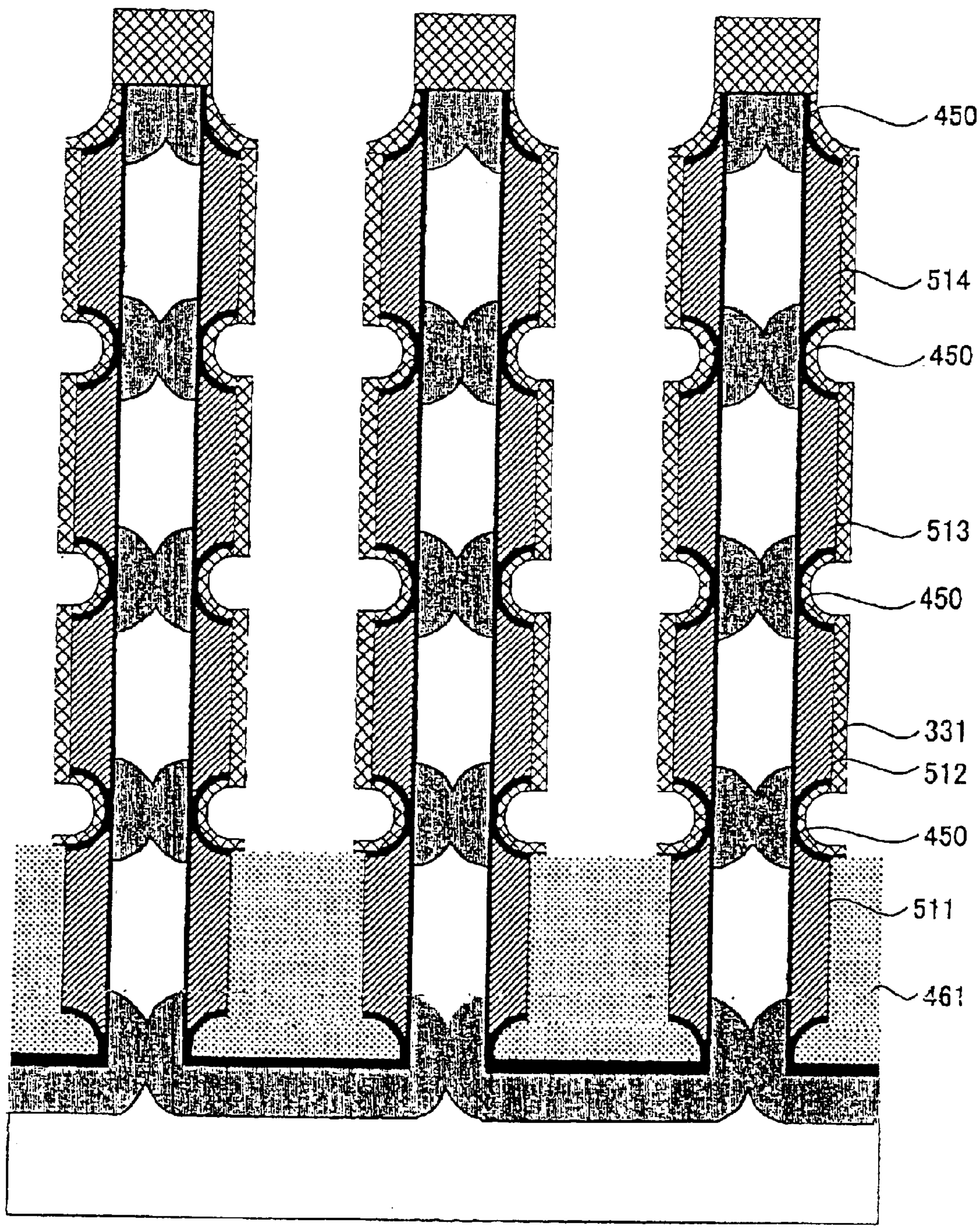

A silicon nitride film 331, for example, is deposited to 5 to 50 nm as a ninth insulating film on the polysilicon films 512 to 514 and the silicon oxide film 450 to form sidewalls (FIG. 99 and FIG. 120).

Figure 100:
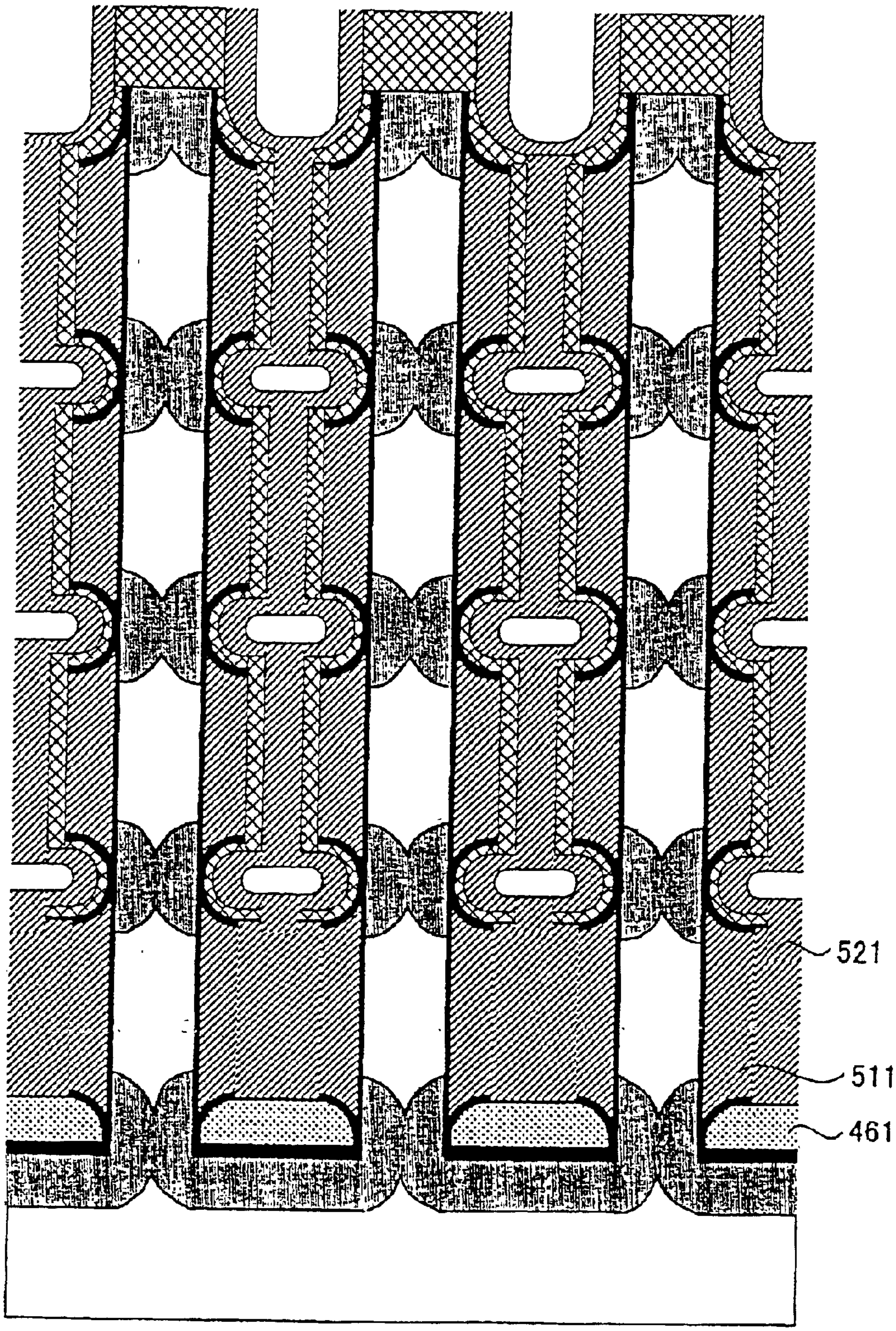
Figure 121:
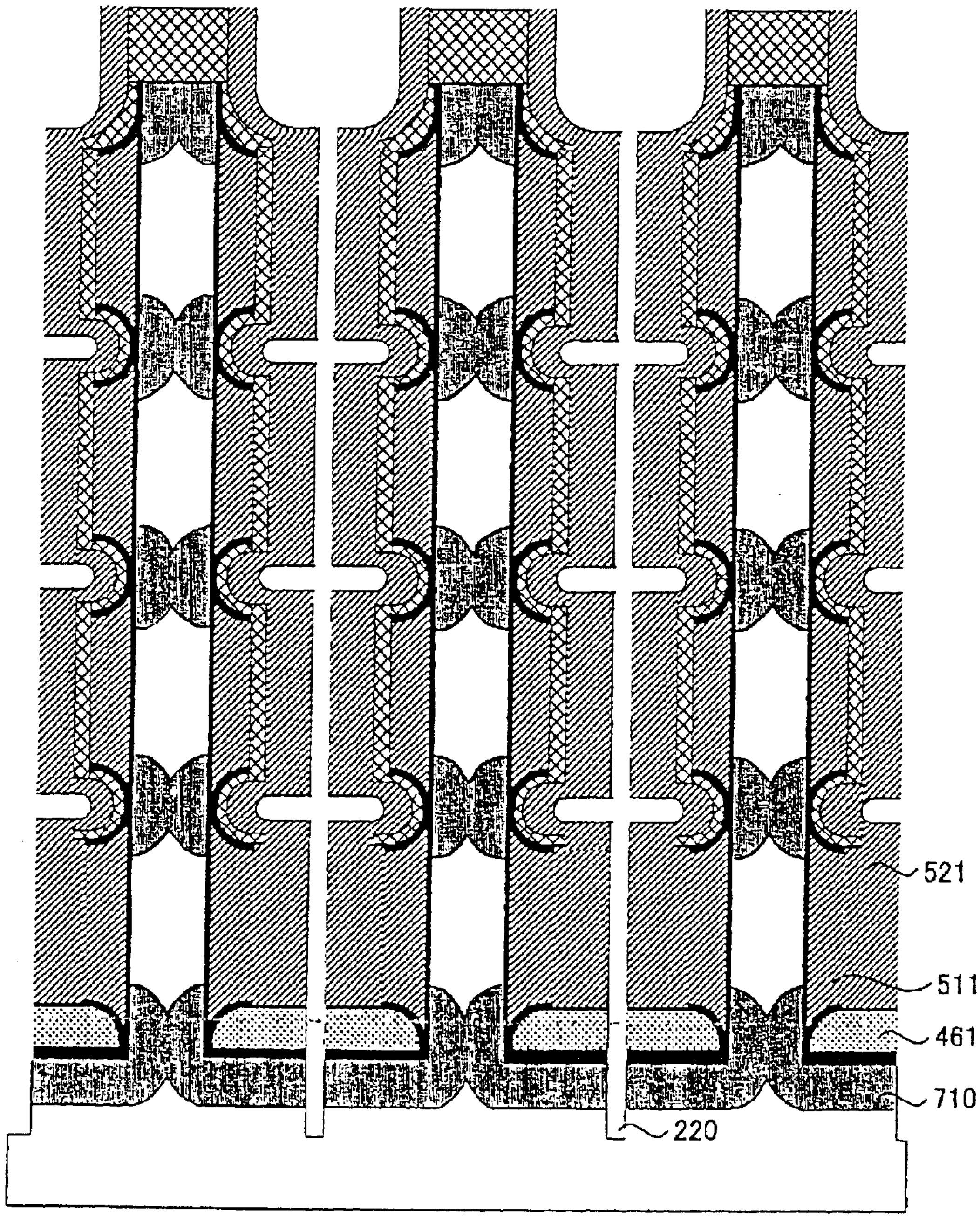

Subsequently, the silicon oxide film 461 as an eighth insulating film is etched back to a degree that the side of the polysilicon film 511 is exposed, and a polysilicon film 521, for example, is deposited to 15 nm to 150 nm as a second conductive film (FIG. 100 and FIG. 121). Thereafter, as shown in FIG. 121, a second trench 220 is formed in the p-type silicon substrate 100 in self-alignment with the polysilicon film 521 to separate the impurity diffusion layer 710. That is, a separation portion of the first wiring layer is formed in self-alignment with a separation portion of the second conductive film.

Subsequently, the polysilicon film 521 is etched back to a degree such that the polysilicon film 521 can contact the polysilicon film 511 to form a selection gate. At this time, by setting the intervals between the island-like semiconductor layers 110 in a direction of A-A' in FIG. 1 to a predetermined value or-smaller, the polysilicon film 521 is formed into a second wiring layer to be a selection gate line continuous in the direction without need to use a masking process. Thereafter, a silicon oxide film 462 is deposited to 50 to 500 nm as an eighth insulating film and is anisotropically or isotropically etched so that the silicon oxide film 461 is embedded to bury the side and top of the polysilicon film 521.

Figure 101:
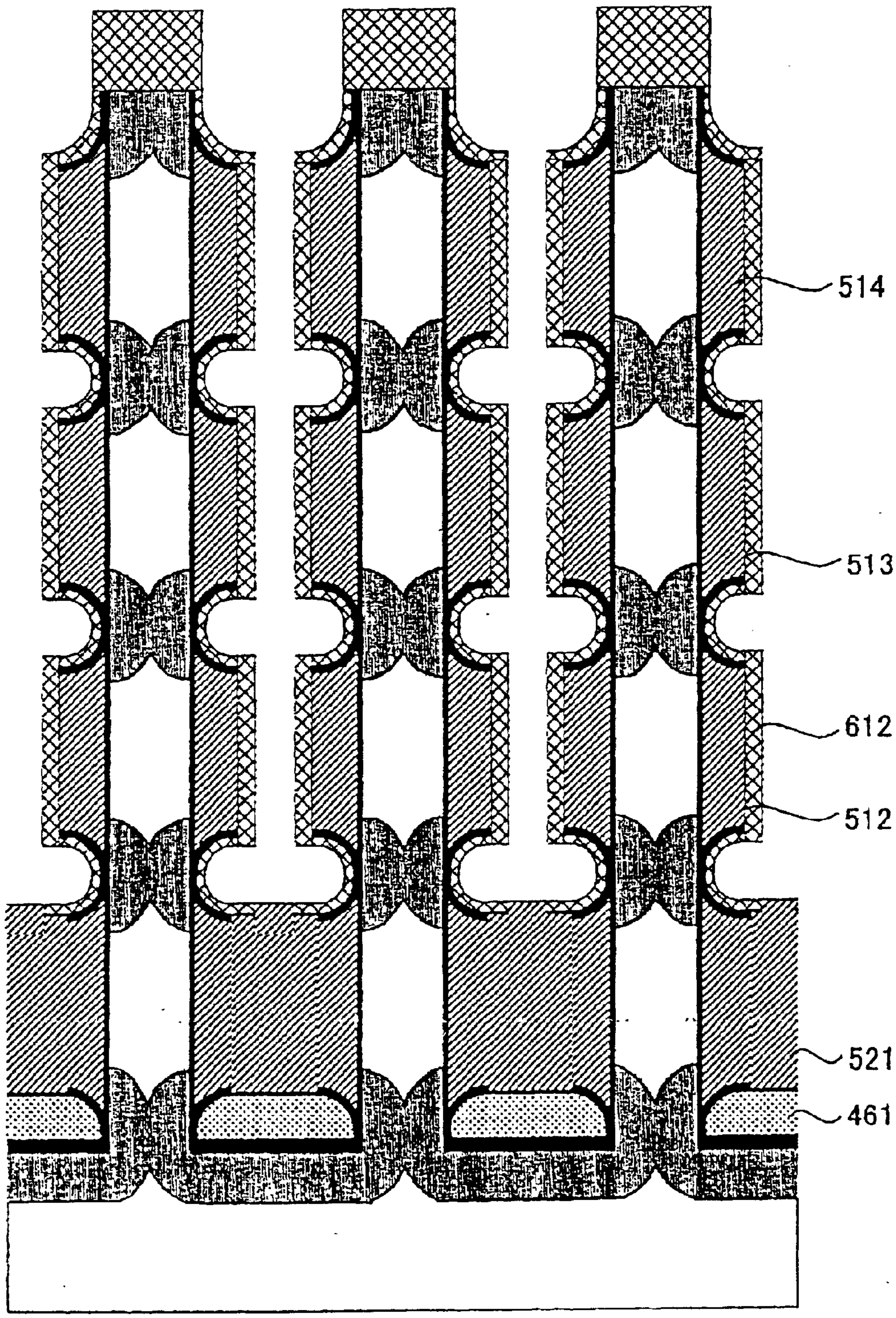
Figure 122:
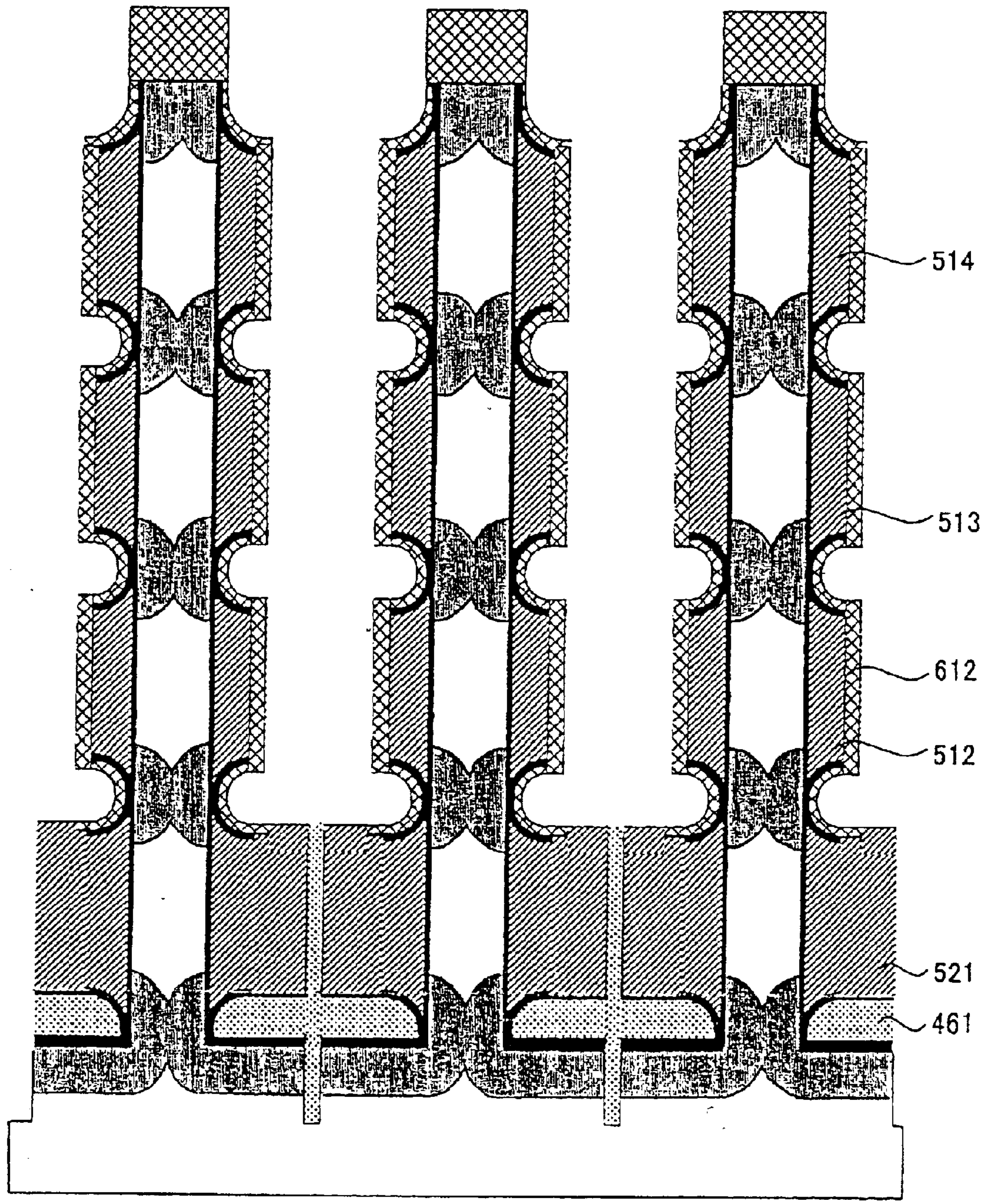

Next the sidewall of the silicon nitride film 331 as the ninth insulating film is removed by isotropic etching and an interlayer insulating film 612 is formed on exposed surfaces of the polysilicon films 512 to 514 (FIG. 101 and FIG. 122). This interlayer insulating film 612 may be formed of an ONO film, for example. More particularly, a silicon oxide film of 5 to 10 nm thickness is formed on the surface of the polysilicon film by thermal oxidization, and then, a silicon nitride film of 5 to 10 nm thickness and a silicon oxide film of 5 to 10 nm thickness are formed sequentially by CVD.

Figure 102:
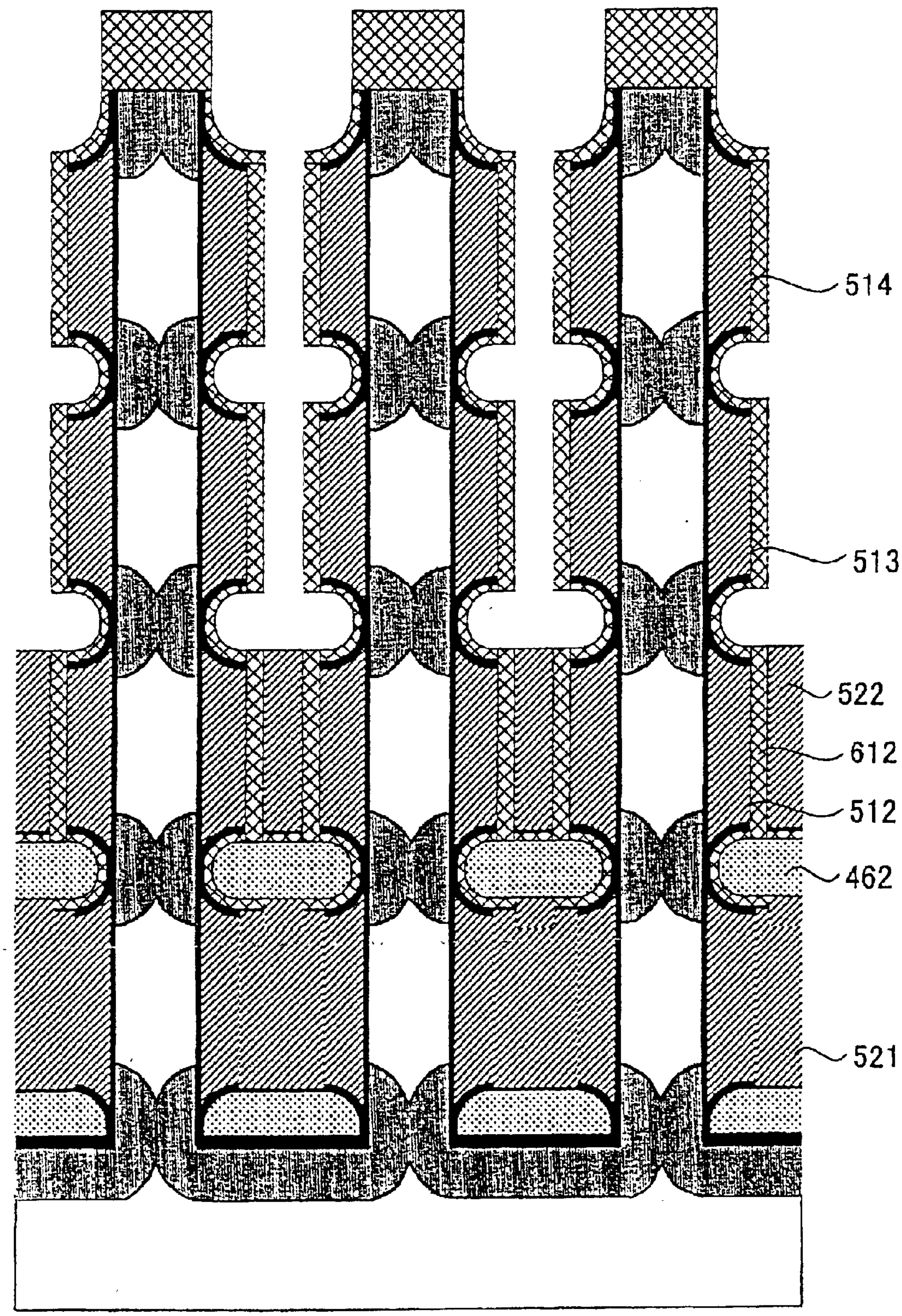
Figure 103:
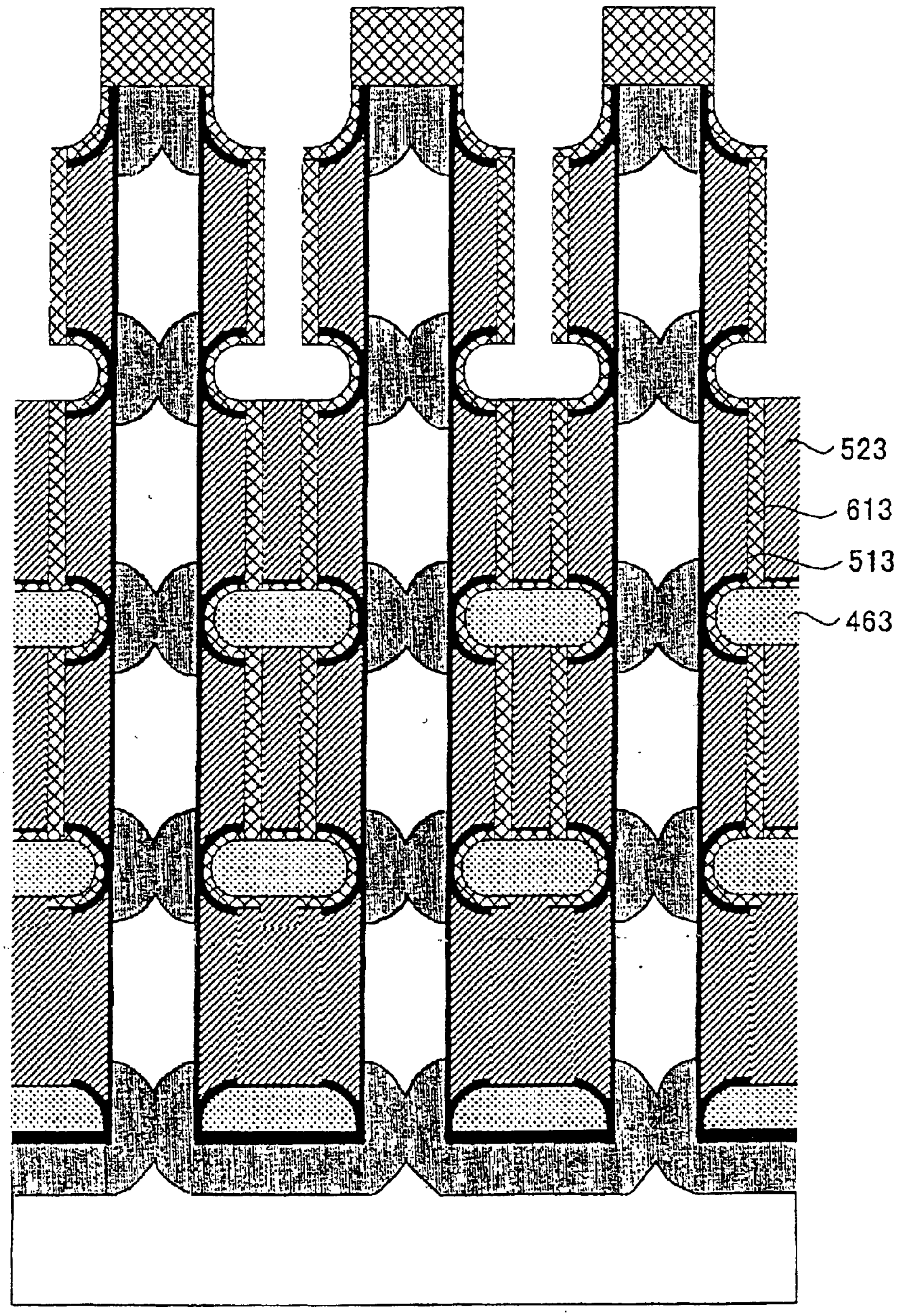
Figure 123:
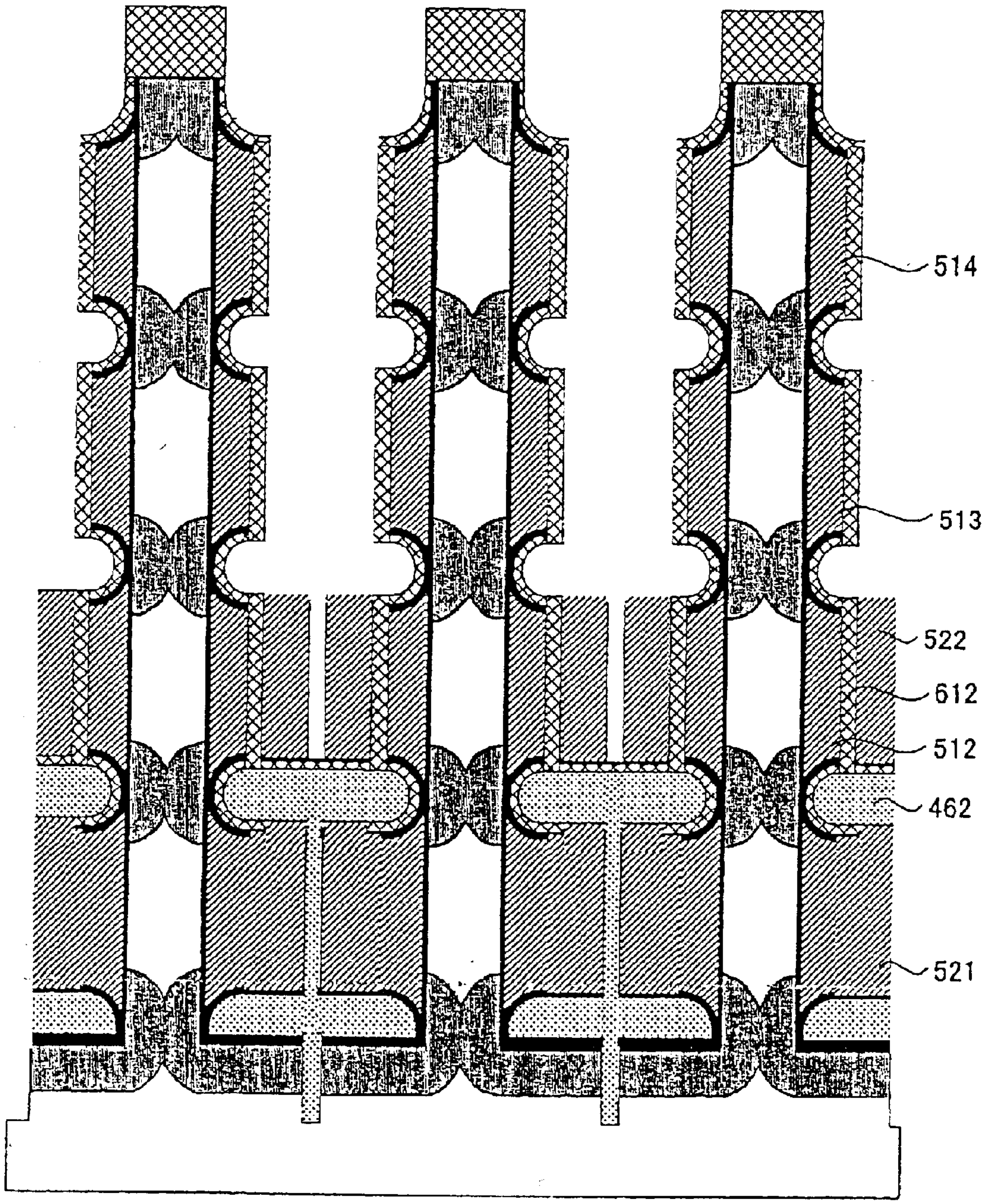
Figure 124:
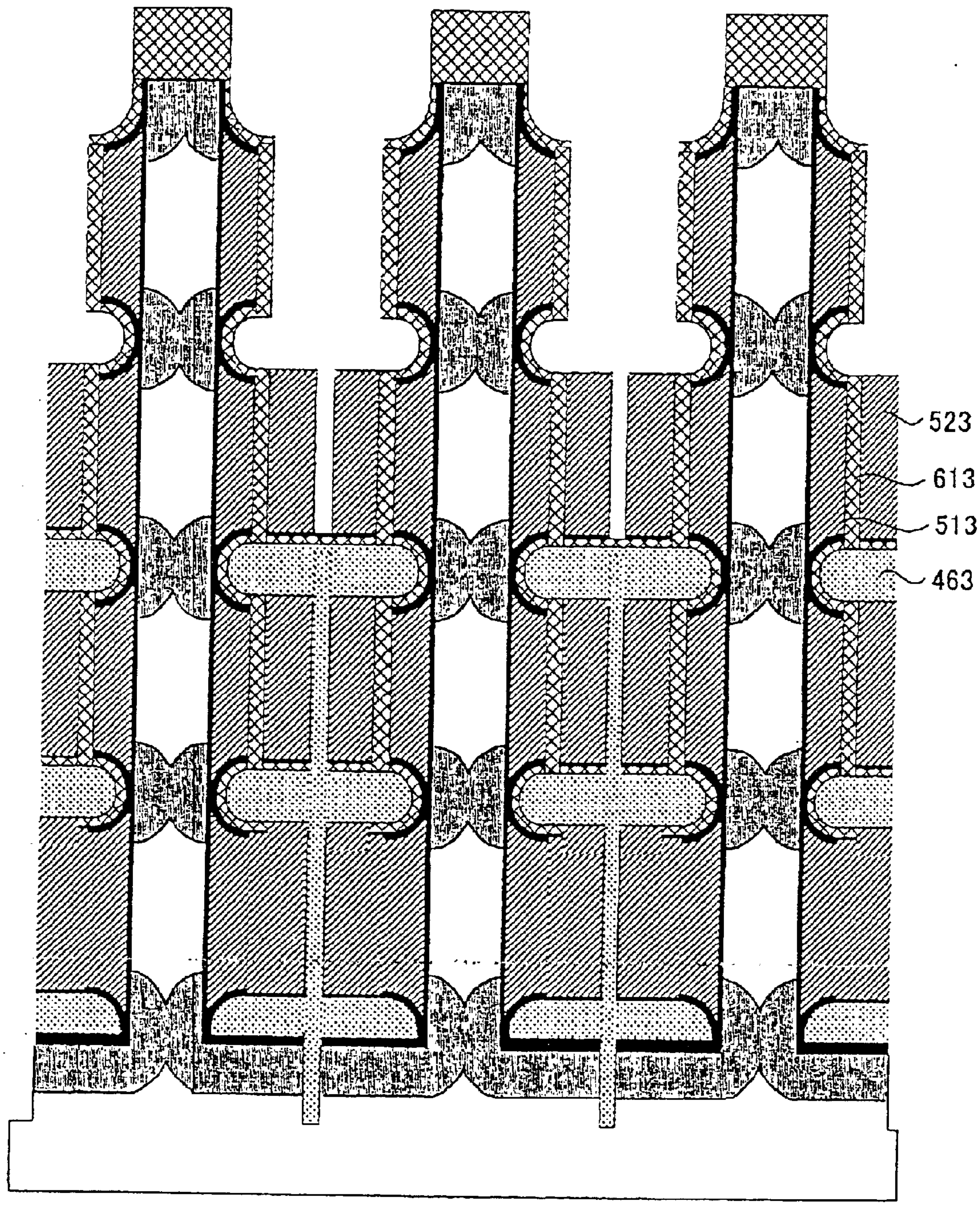

Subsequently, in the same manner, a polysilicon film 522 to be a second conductive film is deposited to 15 to 150 nm and etched back so that the polysilicon film 522 is disposed on the side of the polysilicon film 512 with intervention of the interlayer insulating film 612 (FIG. 102 and FIG. 123). At this time, by setting the intervals between the island-like semiconductor layers 110 in the direction of A-A' in FIG. 1 to a predetermined value or smaller, the polysilicon film 522 is formed into a third wiring layer to be a control gate line continuous in the direction of A-A' without need to use a masking process.

Thereafter, a silicon oxide film 463 is deposited to 50 to 500 nm as an eighth insulating film and is anisotropically or isotropically etched so that the silicon oxide film 463 is embedded to bury the side and top of the polysilicon film 522.

By repeating likewise, a polysilicon film 523 is disposed as a second conductive film on the side of the polysilicon film 513 with intervention of an interlayer insulating film 613 (FIG. 103 and FIG. 124), and the oxide film 463 is embedded to bury the side and top of the polysilicon film 522.

With regard to the polysilicon film 514 which is the topmost first conductive film, a polysilicon film 524 as a second conductive film is etched back to a degree such that the polysilicon film 524 can contact the polysilicon film 514 as the first conductive film, in the same manner as the polysilicon film 511 which is the bottommost first conductive film. A silicon oxide film 465, for example, is deposited to 100 to 500 nm as a tenth insulating film on the top of the polysilicon film 524. The top portion of the island-like semiconductor layer 110 provided with the impurity diffusion layer 724 is exposed by etch-back or by CMP. A fourth wiring layer is formed so that its direction crosses the direction of the second or third wiring layer and is connected to the top of the island-like semiconductor layer 110.

Figure 104:
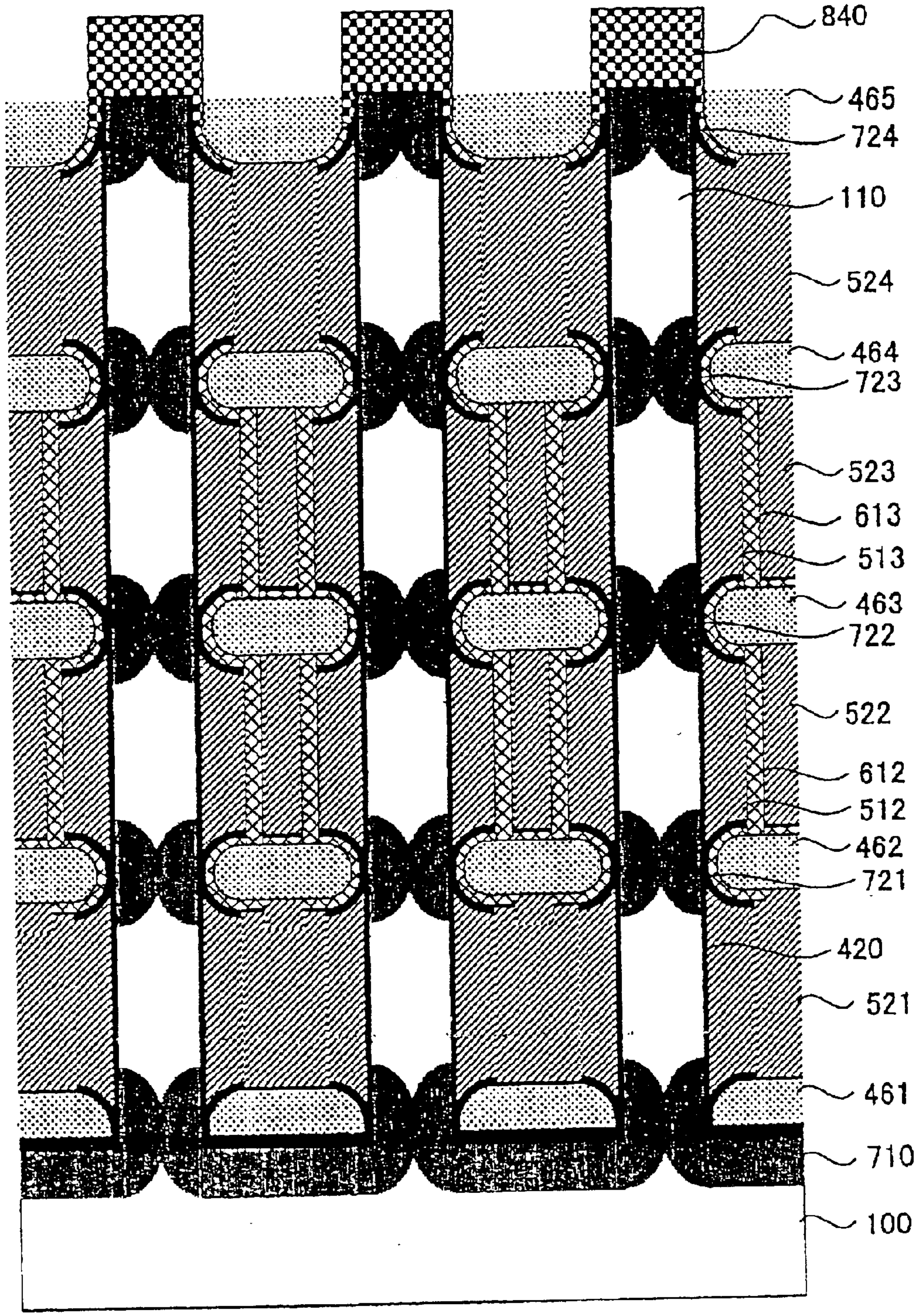
Figure 105:
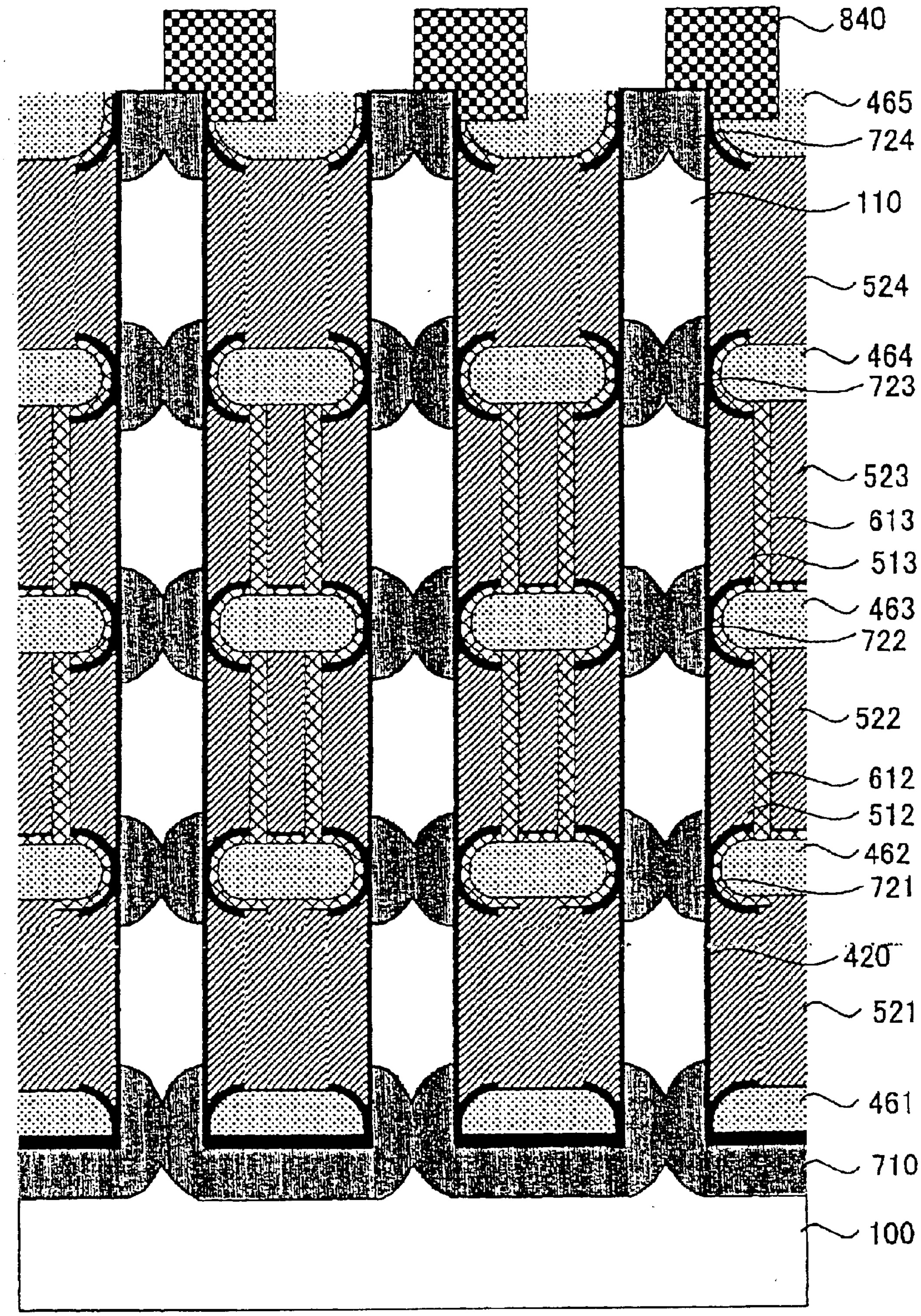
Figure 106:
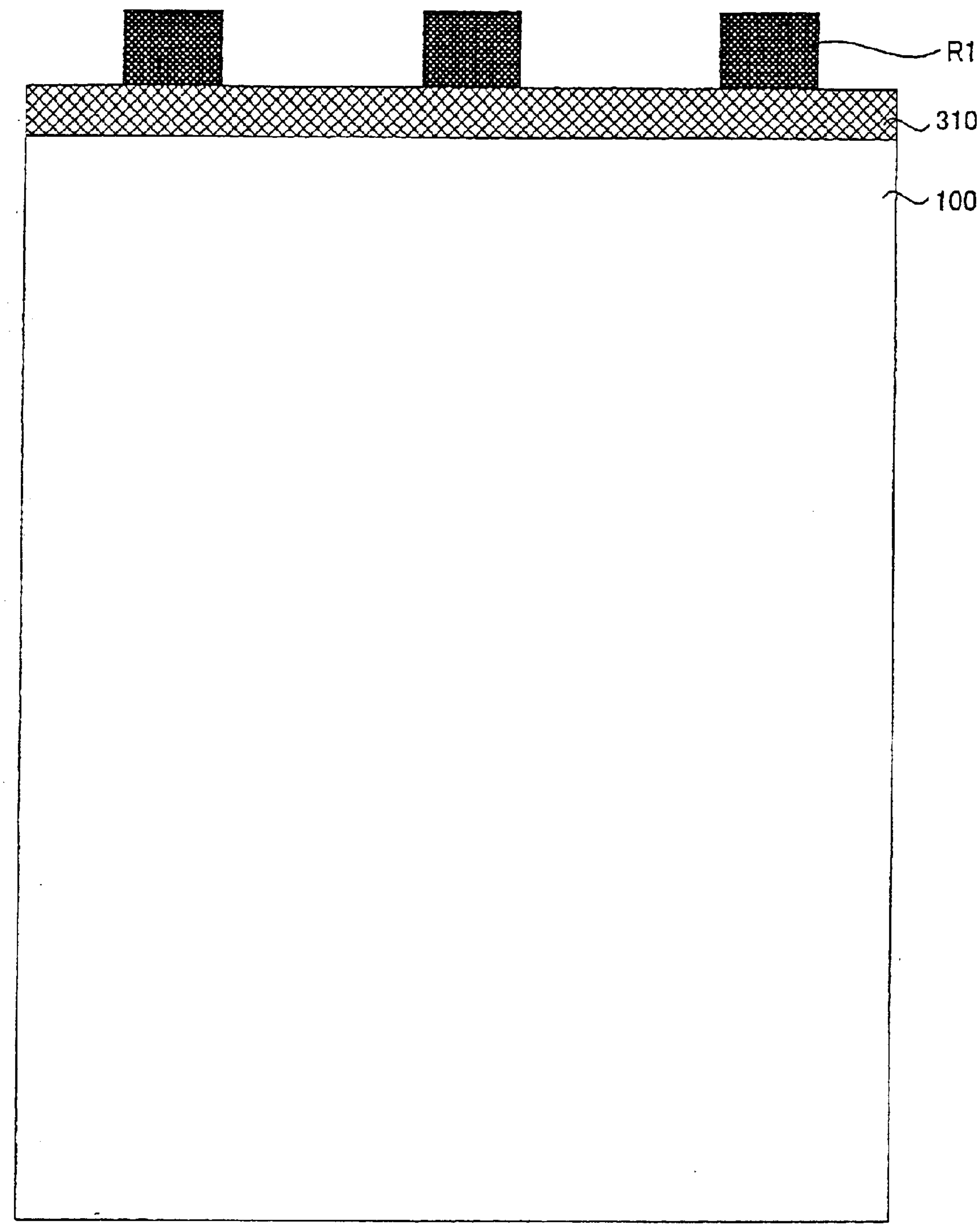
Figure 125:
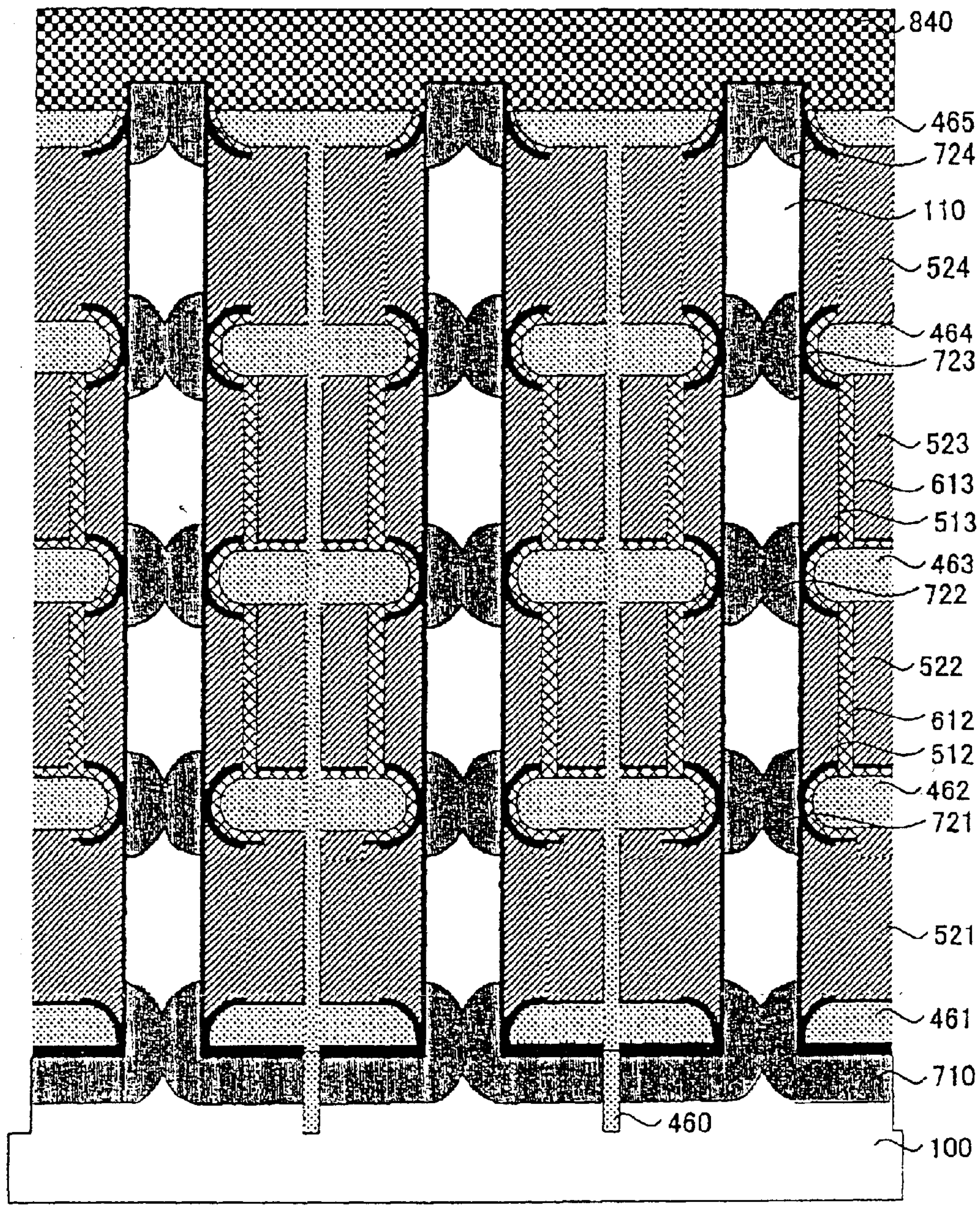

Thereafter, by known techniques, an interlayer insulating film is formed, and a contact hole and metal wiring are formed (FIG. 104 and FIG. 125). FIG. 104 shows that the metal wiring is placed on the impurity diffusion layer 724 without mis-alignment. However, even if mis-alignment occurs, the metal wiring can be connected to the impurity diffusion layer 724 as shown in FIG. 105 (This is true of the following production examples). Thereby, a semiconductor memory device is realized which has a memory function according to the state of a charge in the charge storage layer which is the floating gate made of the polysilicon film as the first conductive film.

So long as the anisotropy of the thermally oxidized film is obtained, crystal orientation is not necessarily a combination of <110> and <100>, the semiconductor substrate may be formed of a material other than silicon, and the island-like semiconductor layers may not be in a quadratic prism shape but in a shape close to a hexagonal prism.

In this example, films formed on the surface of the semiconductor substrate or the polysilicon film such as the silicon nitride film 310, the silicon nitride films 321, 322, 323 and 324 and the silicon nitride film 331 may be formed of a layered film of a silicon oxide film/a silicon nitride film from a silicon surface side.

For forming the buried silicon oxide film, the silicon oxide film may be formed not only by CVD but also by rotational coating.

In the example, the control gates of the memory cells are formed continuously in one direction without using a mask. That is possible only in the case where the island-like semiconductor layers are not disposed symmetrically to a diagonal. More particularly, by setting smaller the intervals between adjacent island-like semiconductor layers in the direction of the second and third wiring layers than those in the direction of the fourth wiring layer, it is possible to obtain the wiring layers which are discontinuous in the direction of the fourth wiring layer and are continuous in the direction of the second and third wiring layers without using a mask. In contrast, if the island-like semiconductor layers are disposed symmetrically to a diagonal, for example, the wiring layers may be separated through patterning with use of resist films by photolithography.

By providing the selection gates in the top and the bottom of a set of memory cells, it is possible to prevent the phenomenon that a memory cell transistor is over-erased, i.e., a reading voltage is 0 V and a threshold is negative and thereby the cell current flows even through a non-selected cell.

In this production example, the first lattice-form trench 210 is formed on the P-type semiconductor substrate. However, the first lattice-form trench 210 may be formed in an impurity diffusion layer of the same conductivity type as that of the semiconductor substrate, the impurity diffusion layer being formed in a P-type impurity diffusion layer formed in an N-type semiconductor substrate or in an N-type impurity diffusion layer formed in a P-type semiconductor substrate. In addition, the impurity diffusion layer of the same conductivity type as that of the semiconductor substrate may be formed in an impurity diffusion layer which is of the conductivity type opposite to that of the semiconductor substrate and is formed in the island-like semiconductor layer. There are true of the following all production examples.

This production example is applicable to the following various production examples.

PRODUCTION EXAMPLE 2

With regard to Production Example 1, this example is particularly shown for forming the tunnel oxide film partially on the periphery of the island-like semiconductor layer 110 in a pillar form.

FIGS. 132 to 139 and FIGS. 140 to 147 are sectional views taken on line A-A' and line B-B', respectively, in FIG. 1 illustrating a memory cell array of EEPROM.

Figure 137:
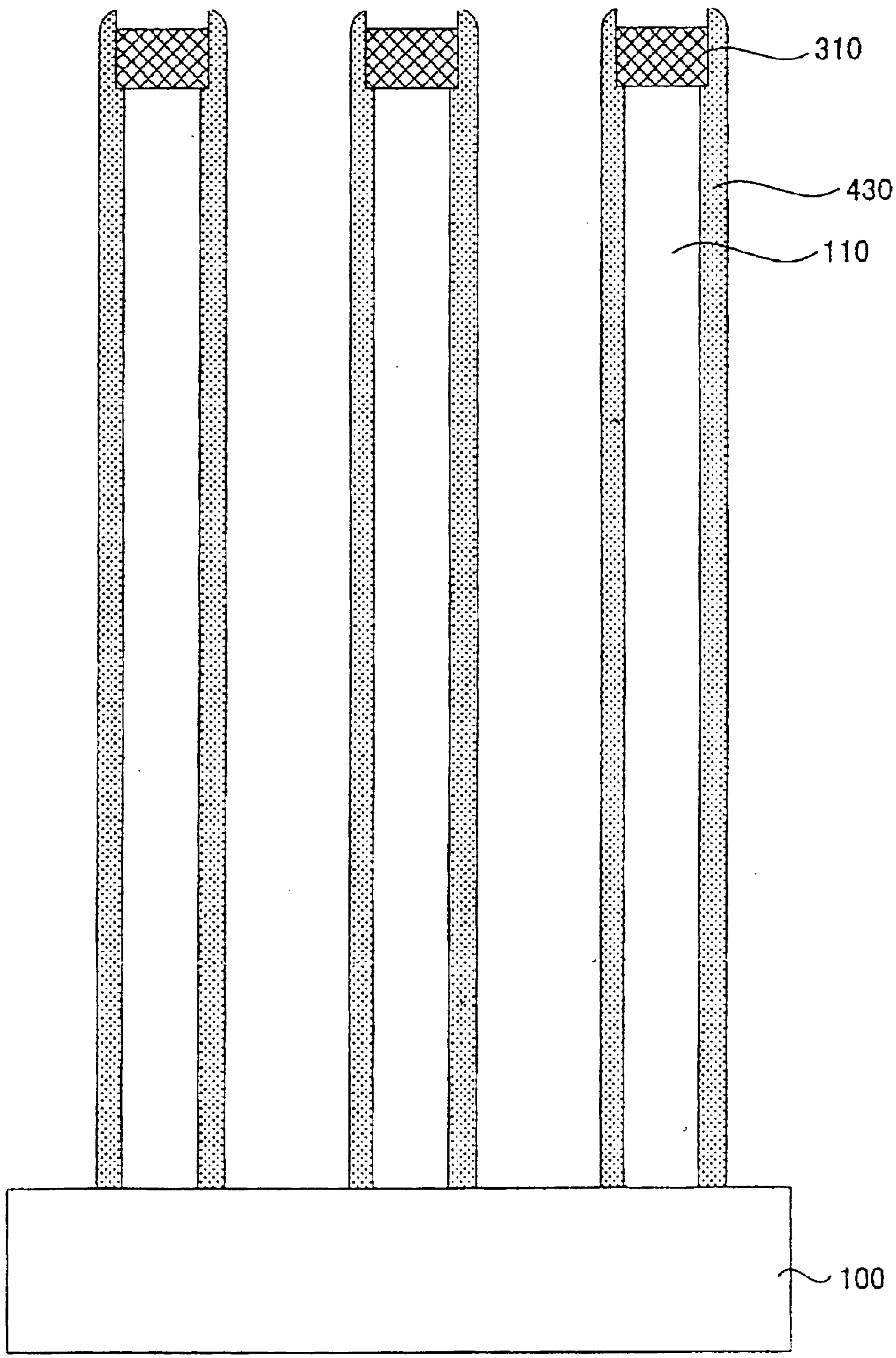
Figure 138:
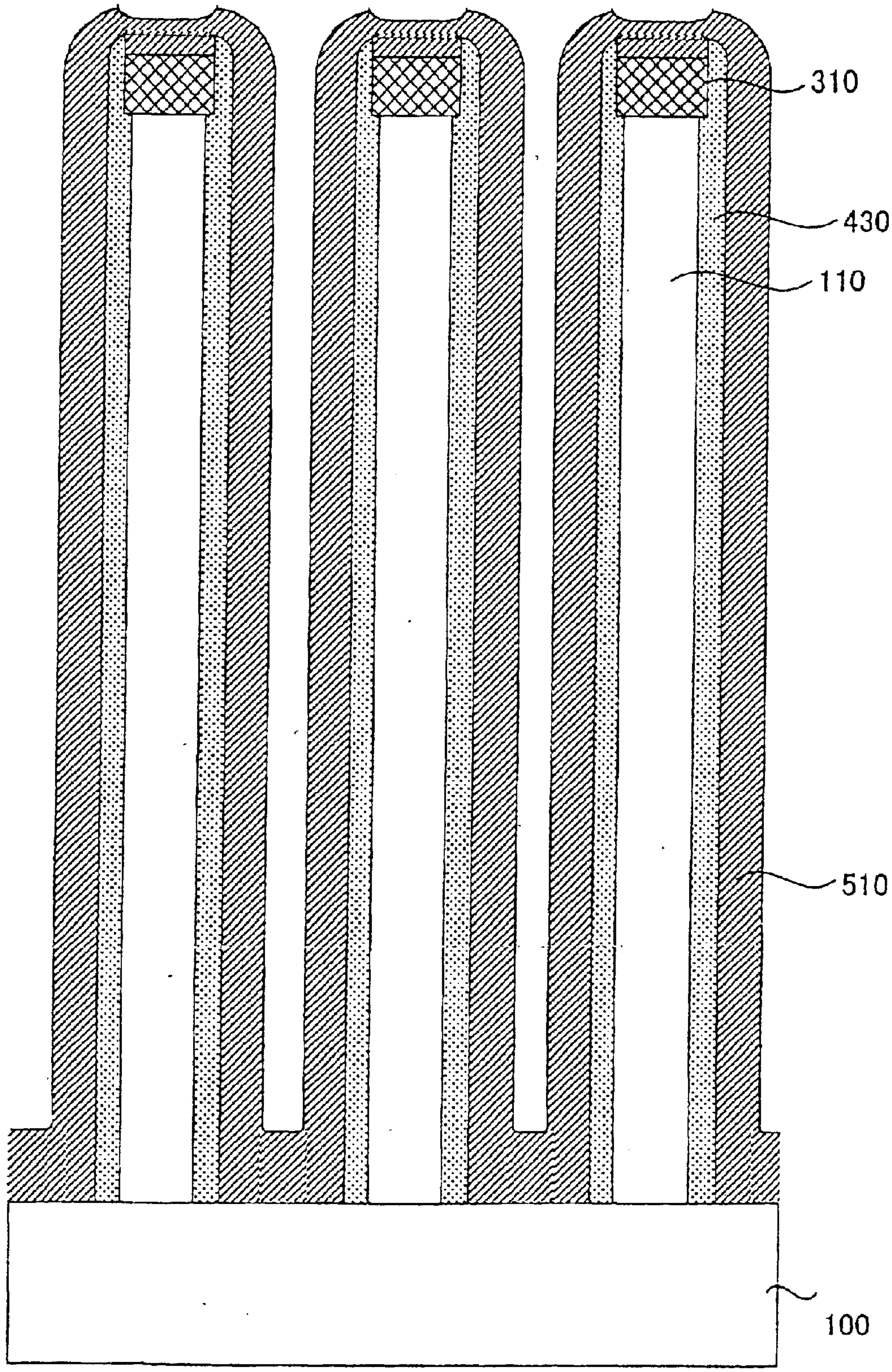
Figure 139:
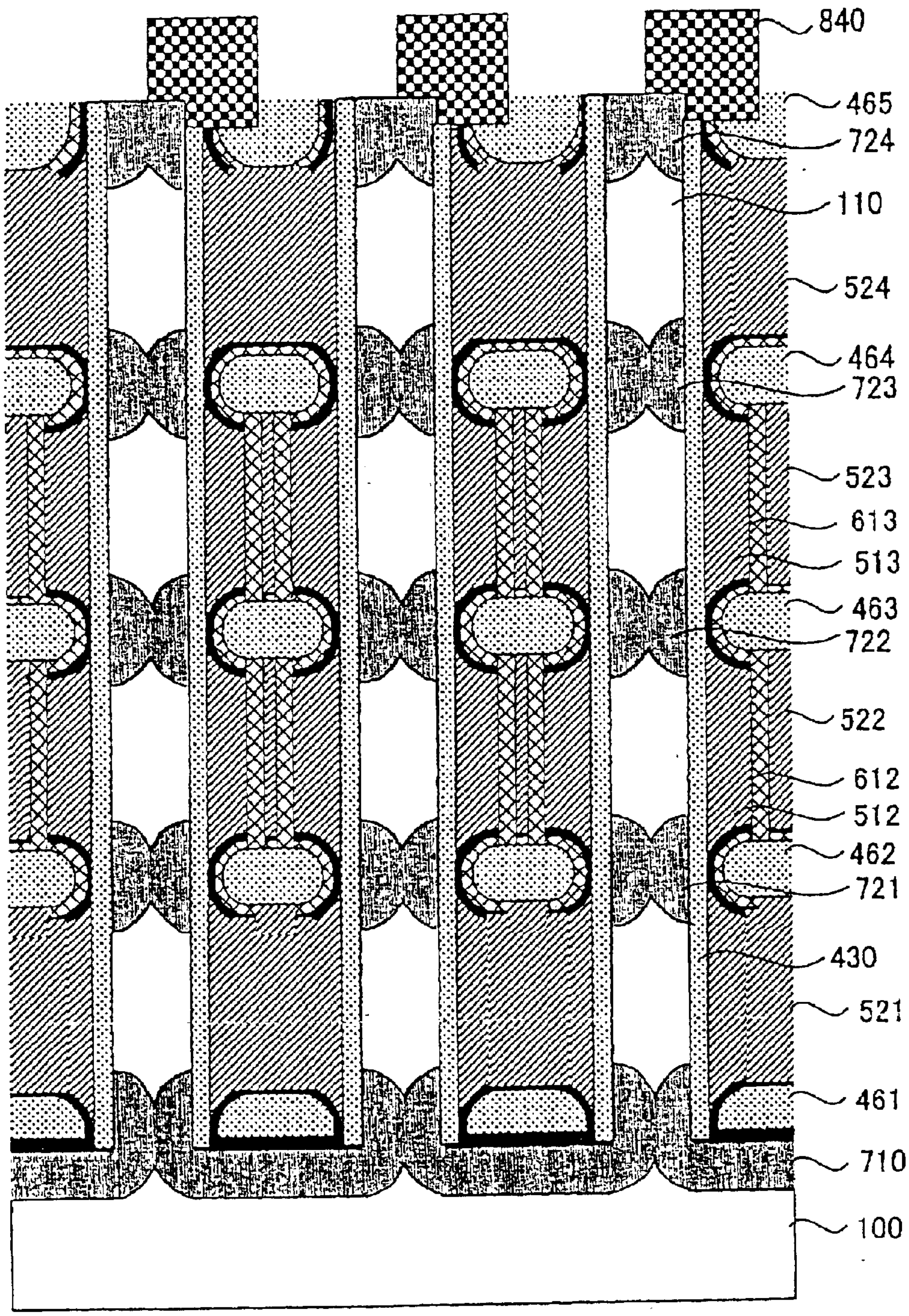
Figure 140:
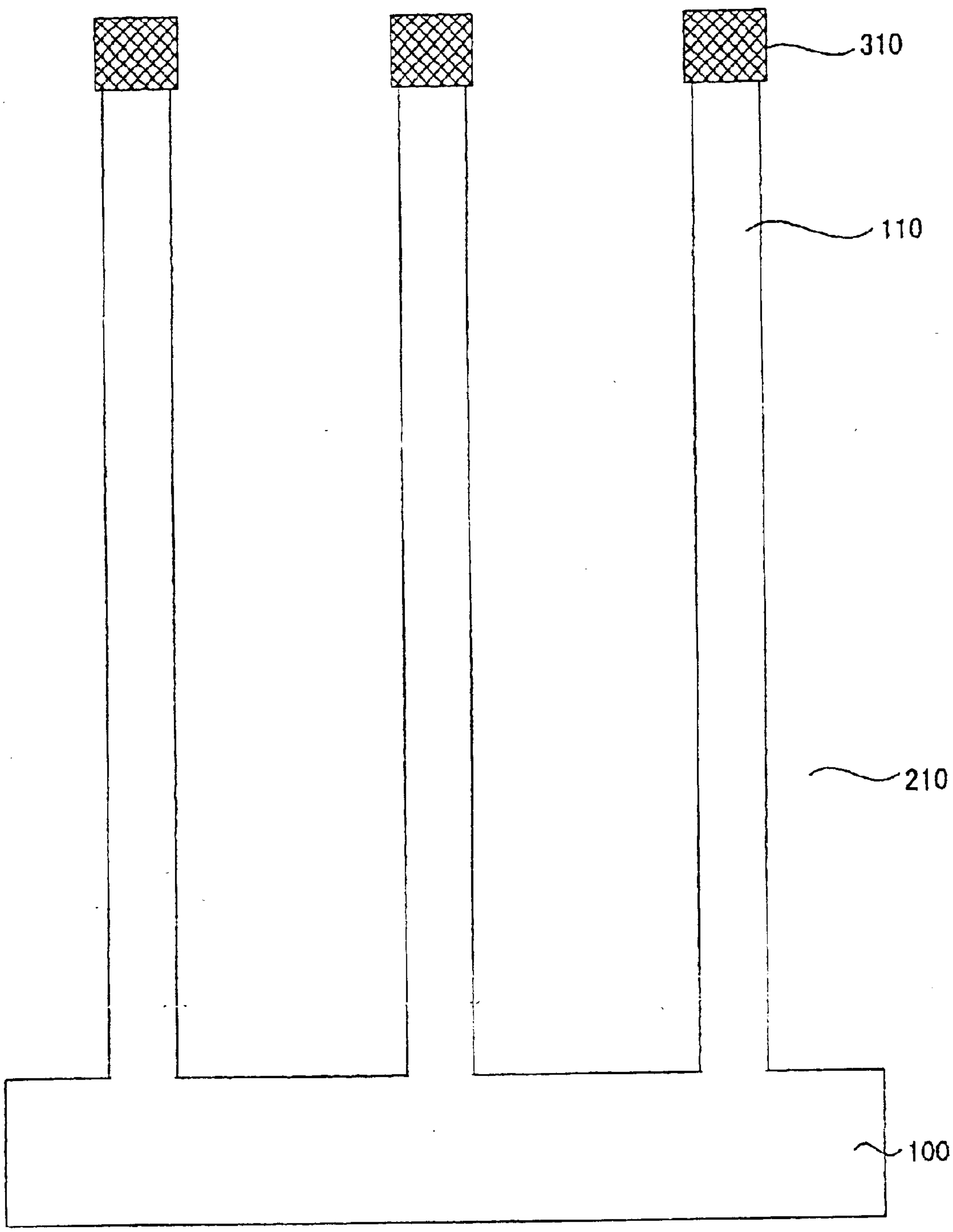

In this example, production steps are the same as those in Production Example 1 until the thermally oxidized film 410 is etched away and, as required, ions are implanted for the channel region on the sidewall of each island-like semiconductor layer 110 by utilizing the slant ion implantation (FIG. 137 and FIG. 140).

Figure 133:
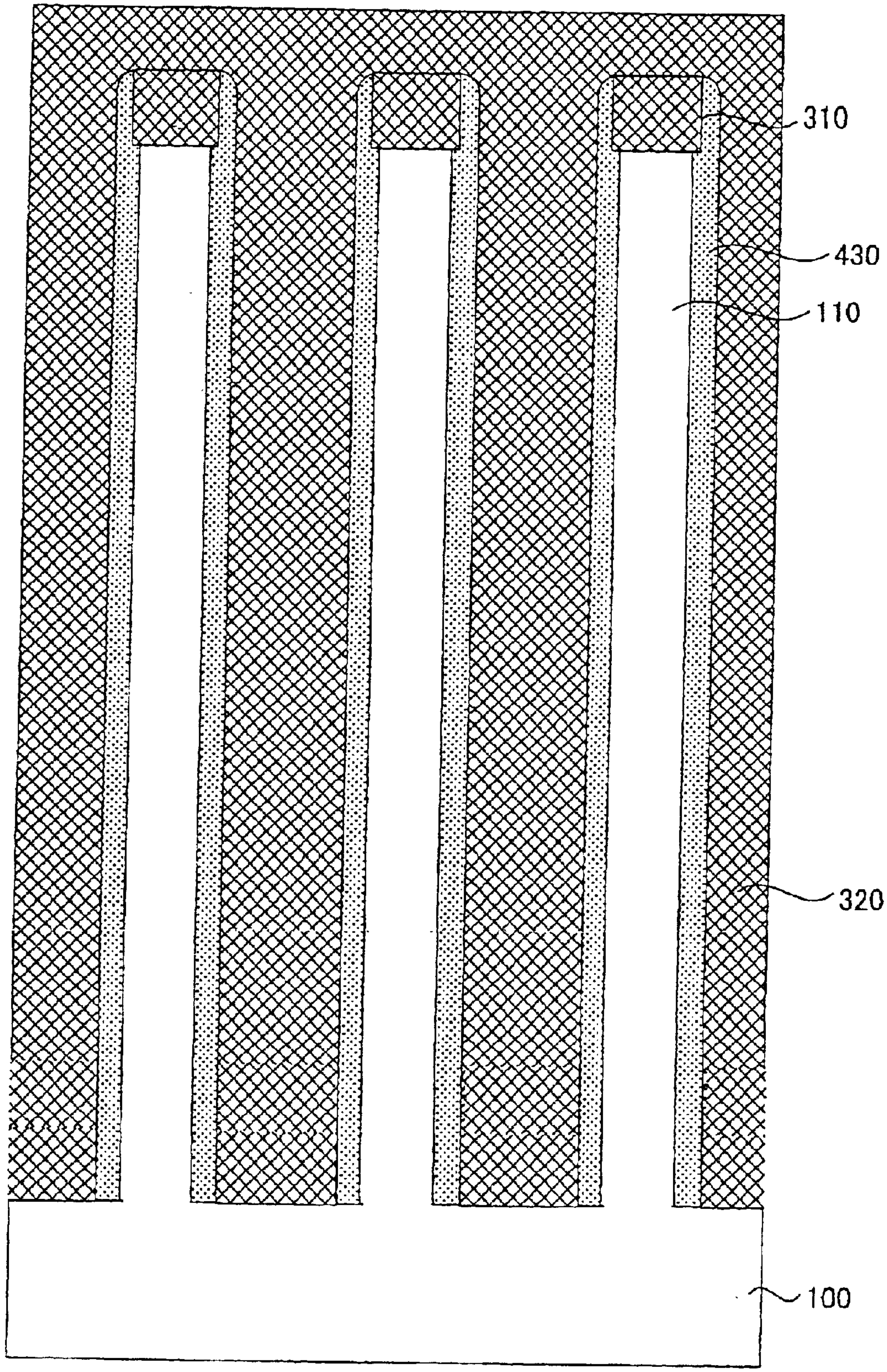
Figure 141:
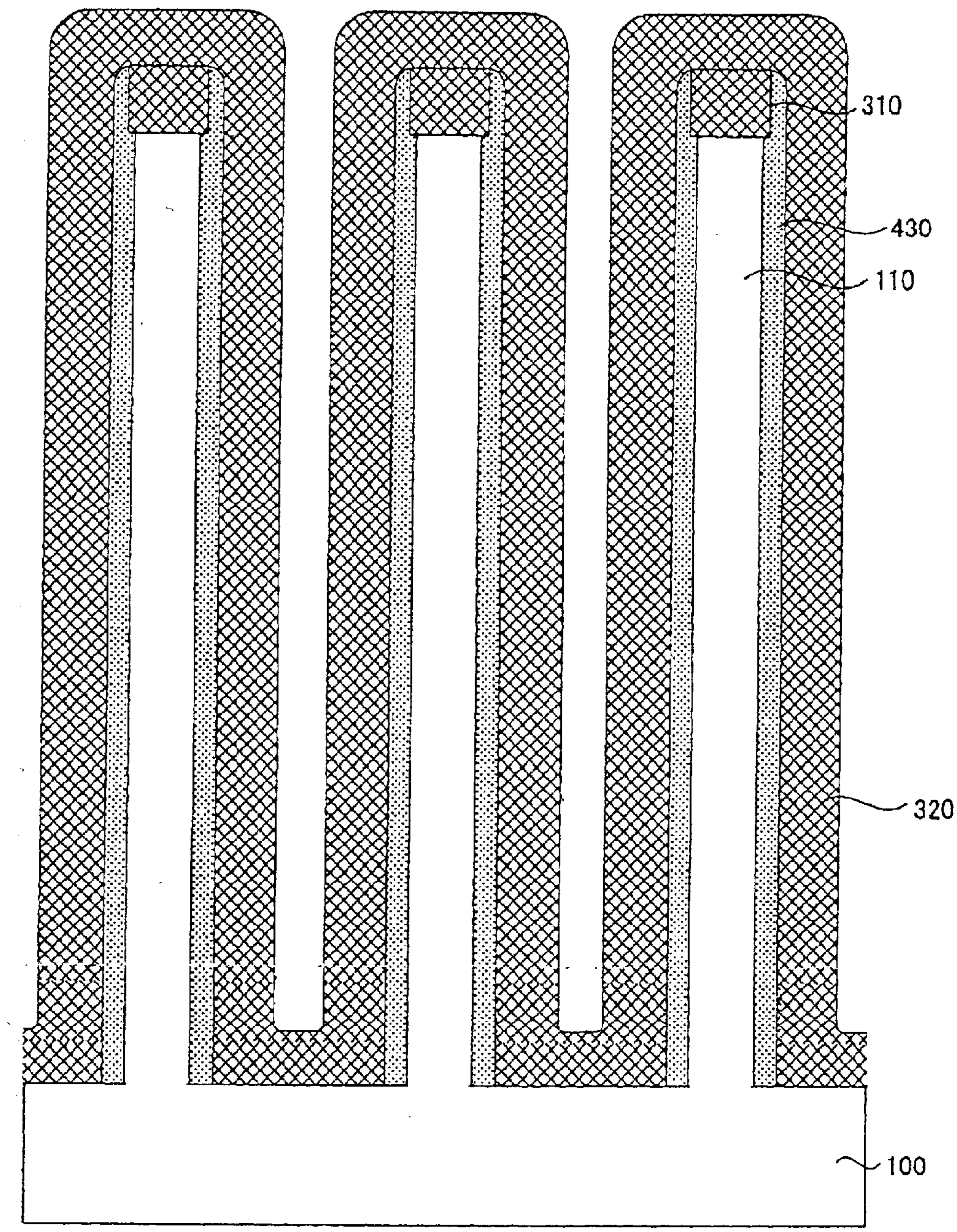

Thereafter, a silicon oxide film 430, for example, is deposited to 50 to 200 nm as a fifth insulating film and is etched by RIE to remain in the form of a sidewall on the sidewall of each island-like semiconductor layer 110. A silicon nitride film 320, for example, is deposited as a fourth insulating film so that the island-like semiconductor layers 110 are continuous in the A-A' direction in FIG. 1 with intervention of the silicon nitride film 320 and discontinuous in the B-B' direction (FIG. 133 and FIG. 141). Alternatively, the silicon nitride film 320 may be so deposited that the island-like semiconductor layers 110 are continuous both in the A-A' direction and in the B-B' direction, and later the silicon nitride film 320 may be separated in the B-B' direction using a resist film patterned by a known photolithographic technology.

Figure 134:
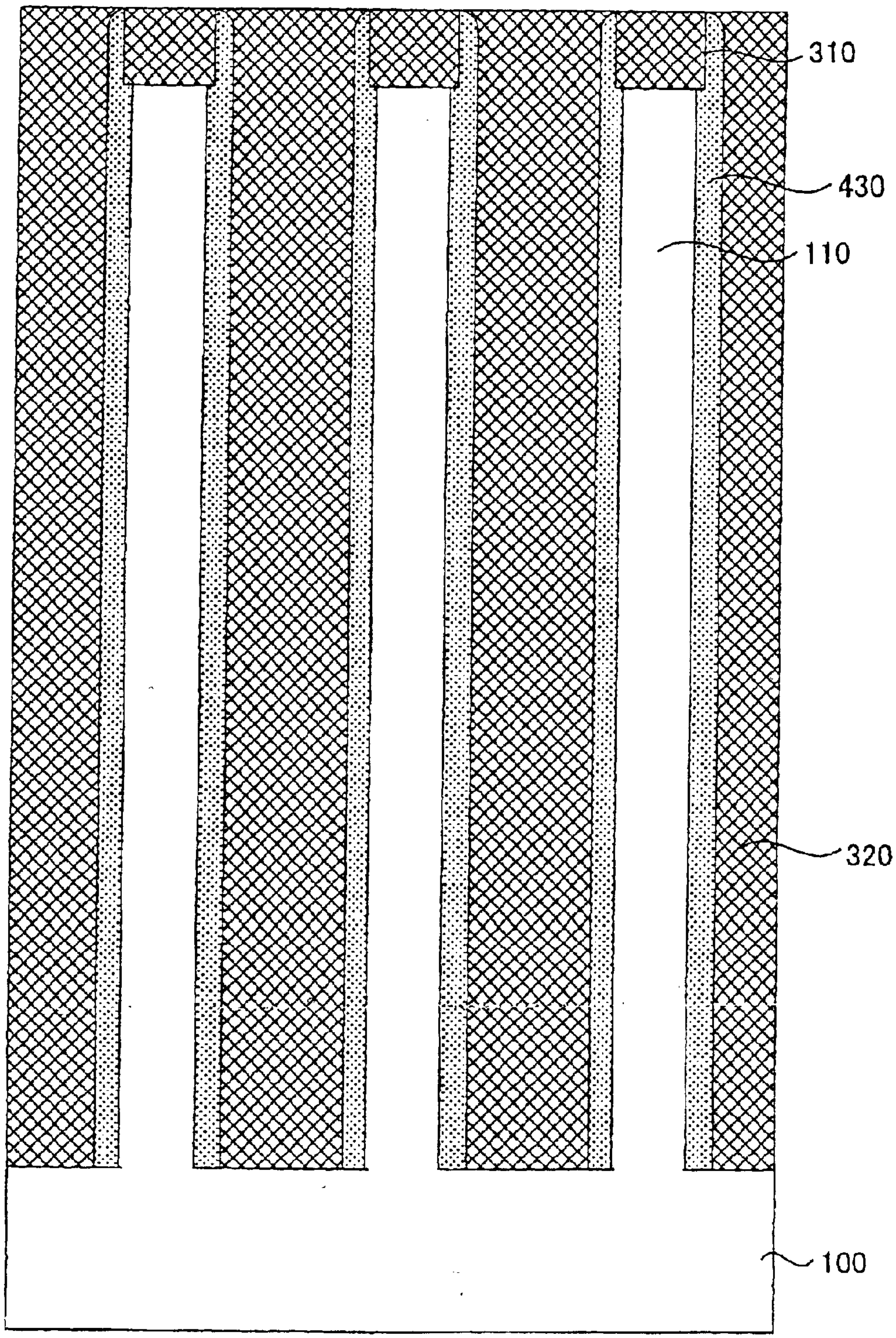
Figure 142:
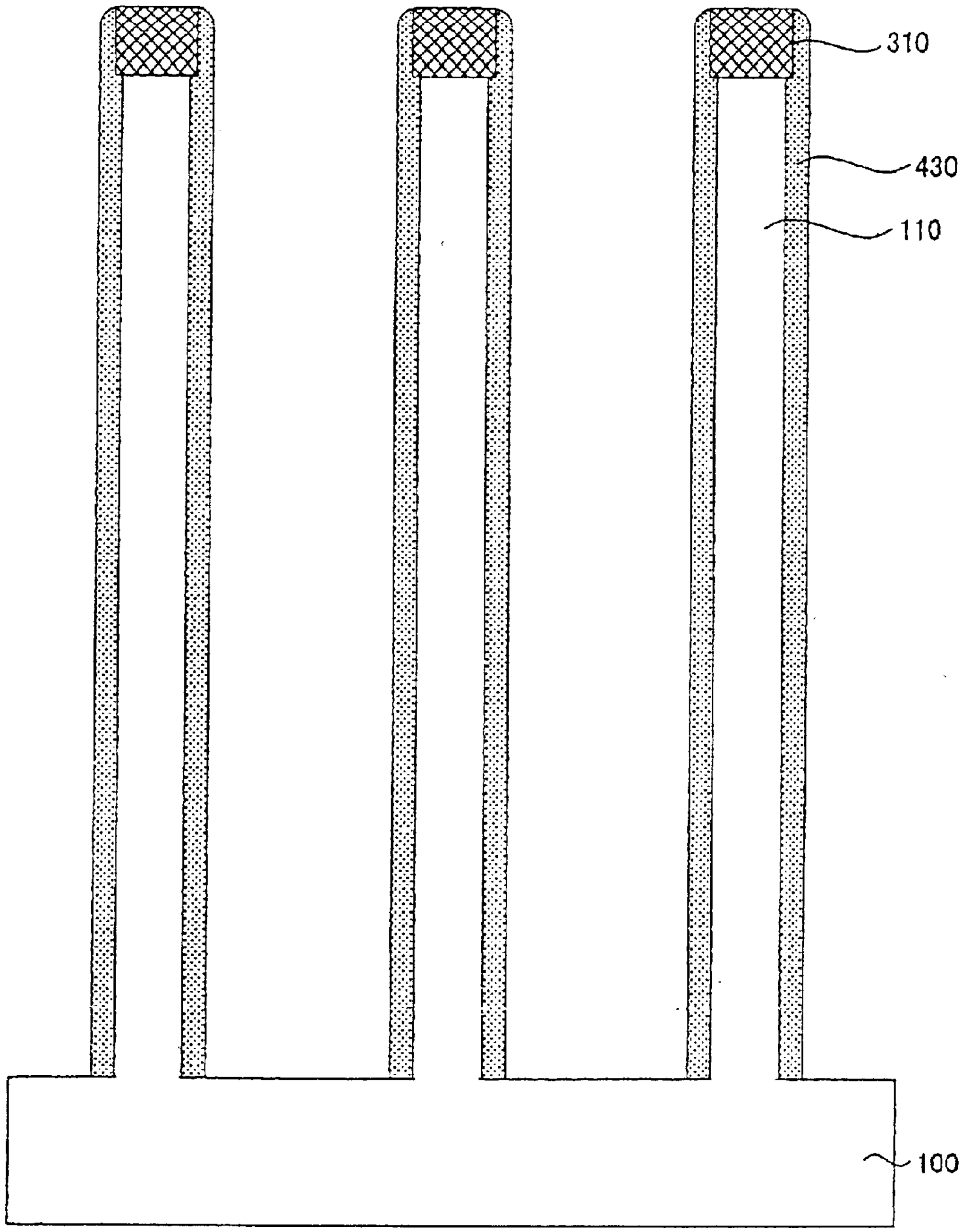

Next, the silicon nitride film 320 is isotropically etched so that the silicon oxide film 430 is exposed in the B-B' direction and the island-like semiconductor layers 110 are still continuous in the A-A' direction with intervention of the silicon nitride film 320 (FIG. 134 and FIG. 142). That is, the silicon nitride film 320 remains on a part of the periphery of the silicon oxide film 430.

Figure 135:
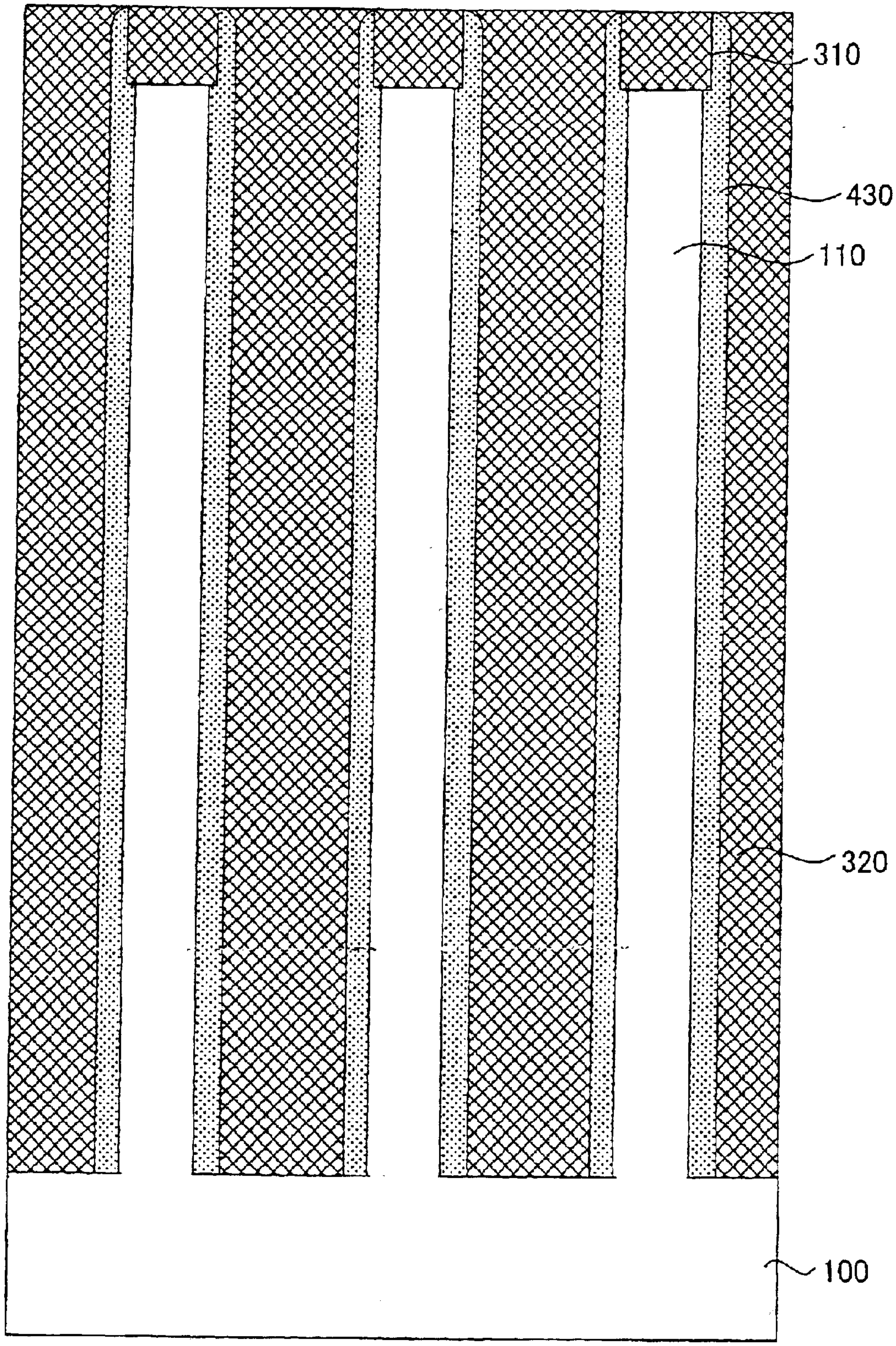
Figure 143:
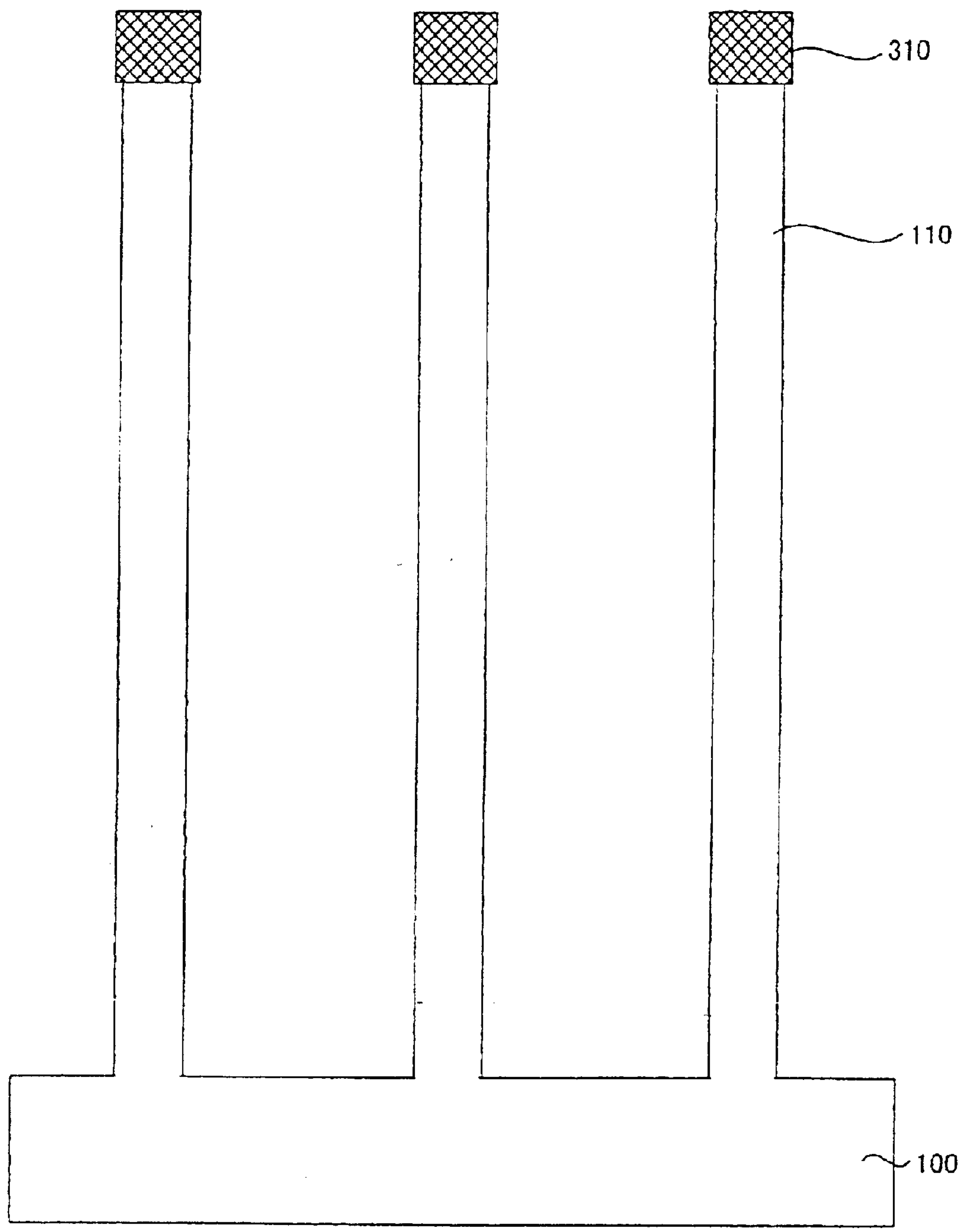

Subsequently, the exposed part of the silicon oxide film 430 is removed by isotropic etching so that the silicon oxide film 430 remains in a region sandwiched by the silicon nitride film 320 and the island-like semiconductor layer 320 (FIG. 135 and FIG. 143).

Figure 136:
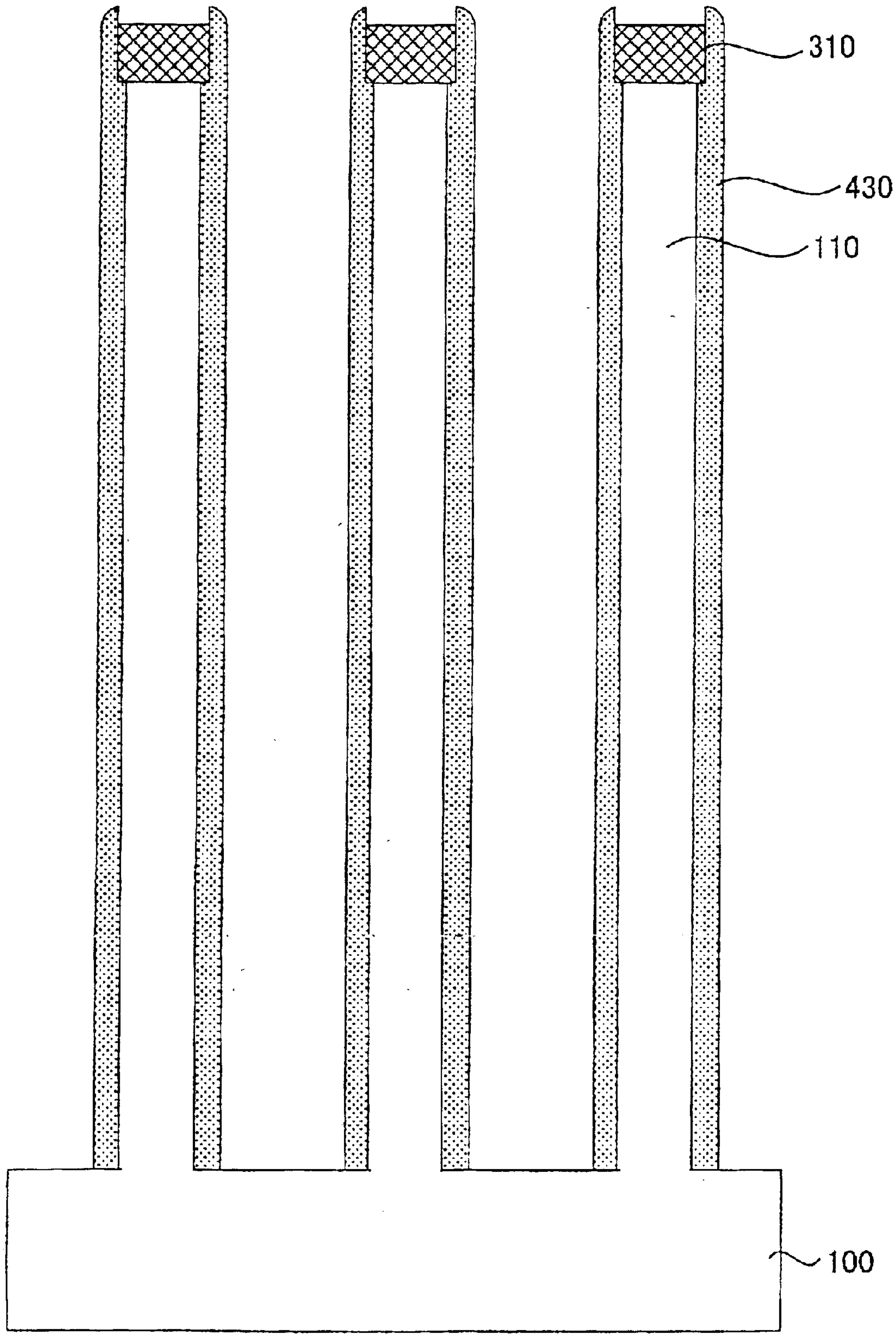
Figure 144:
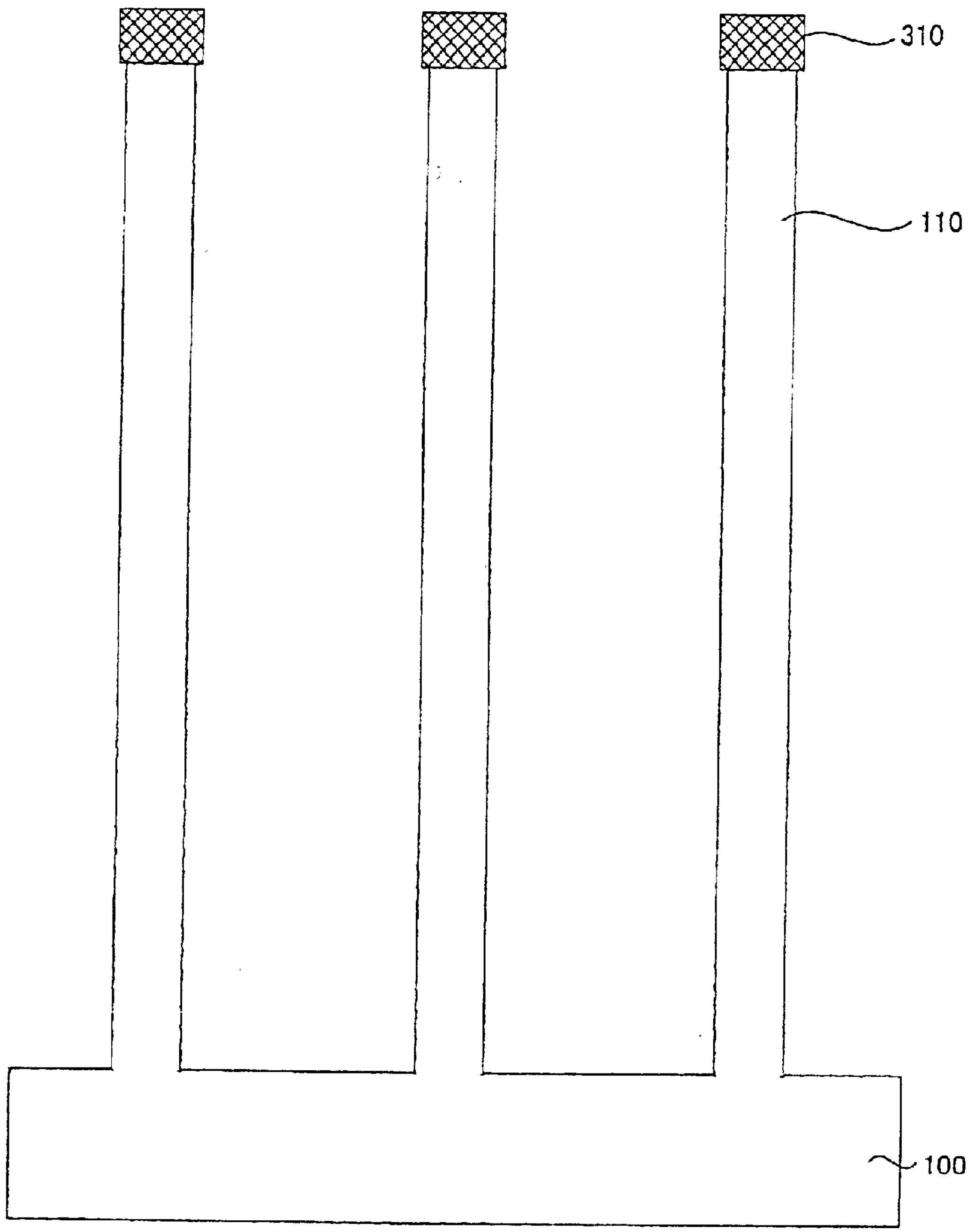

Thereafter, the silicon nitride film 320 is removed by isotropic etching (FIG. 136 and FIG. 144). At this time, the etch amount is so adjusted that the silicon nitride film 310 is not completely removed.

Figure 145:
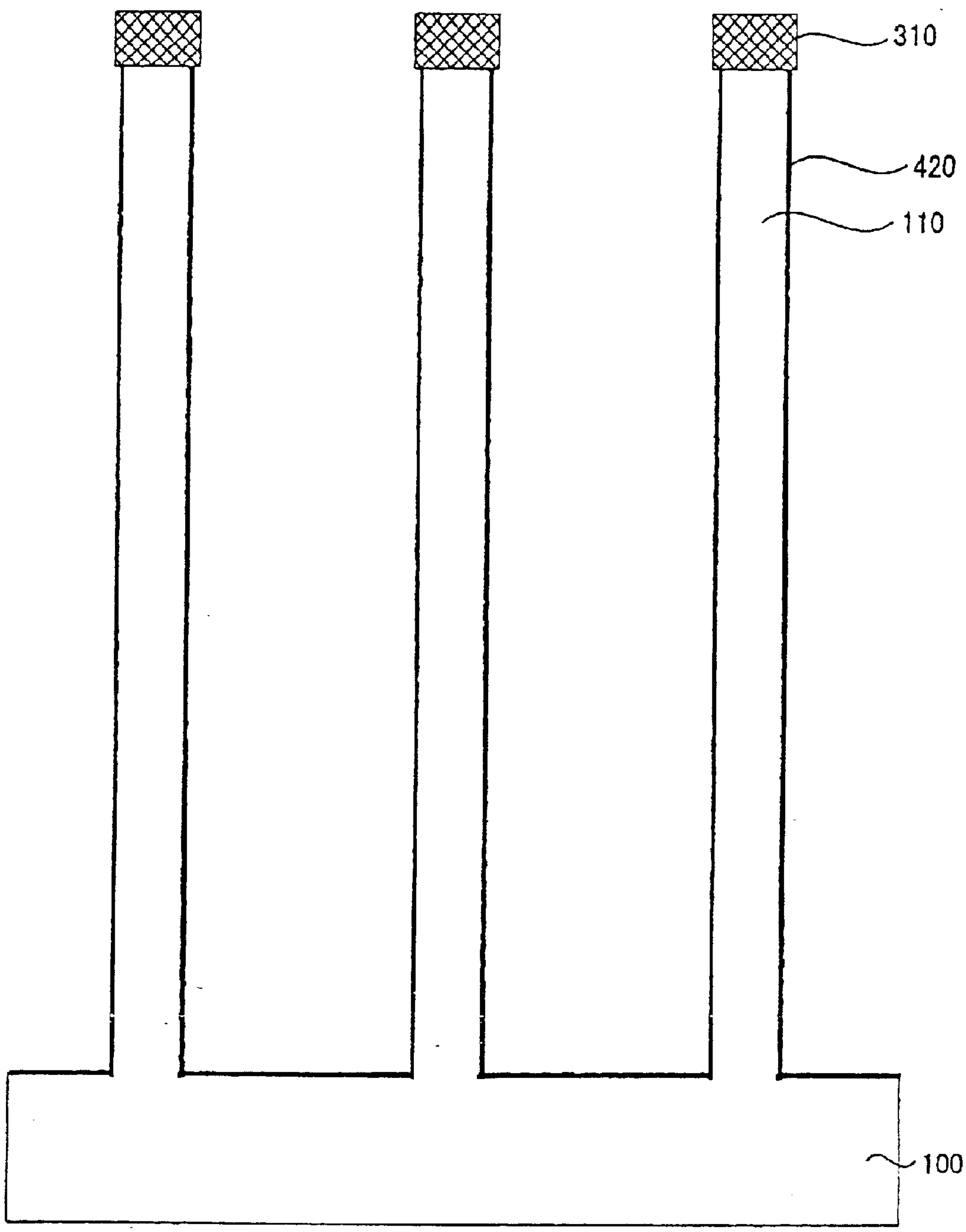
Figure 146:
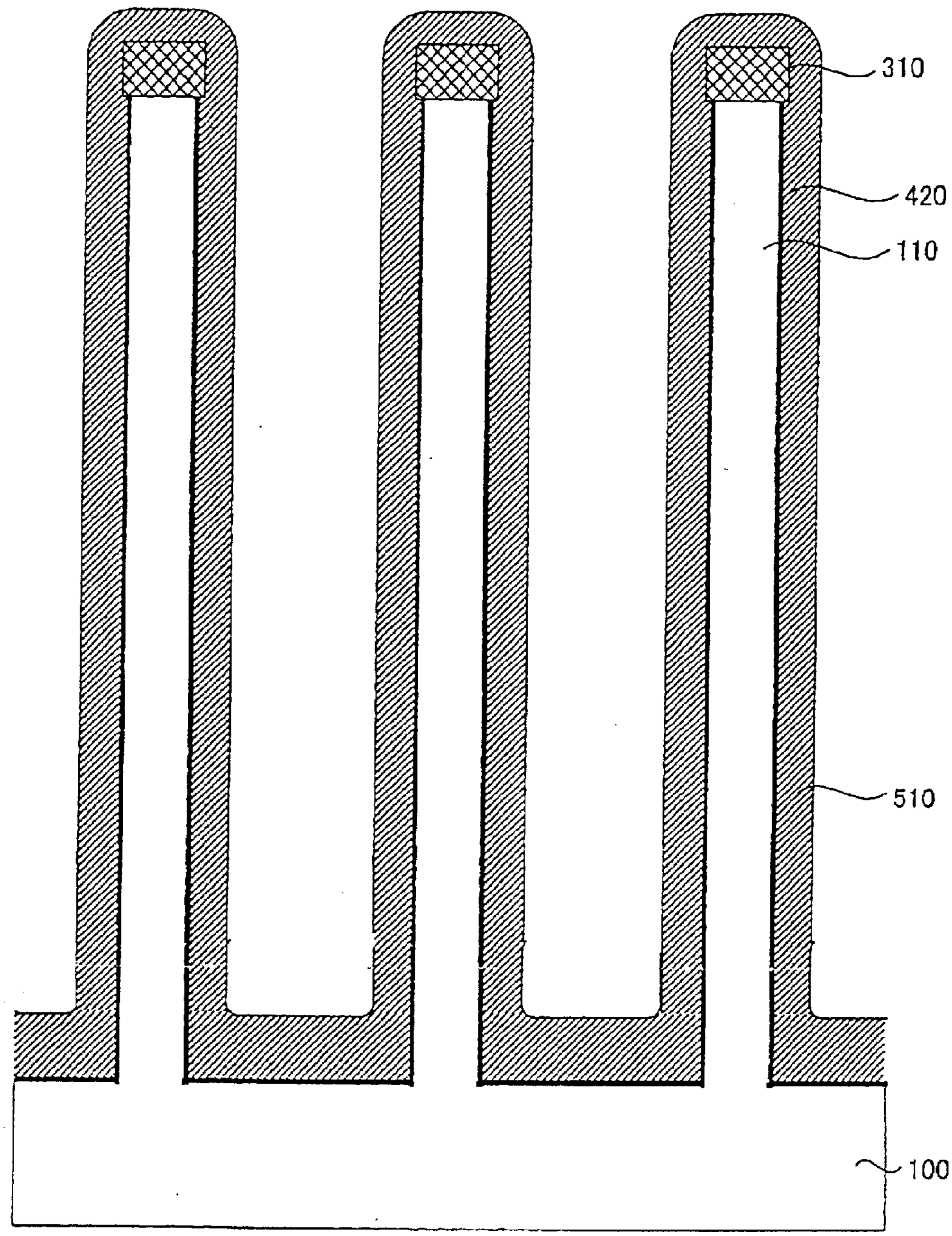
Figure 147:
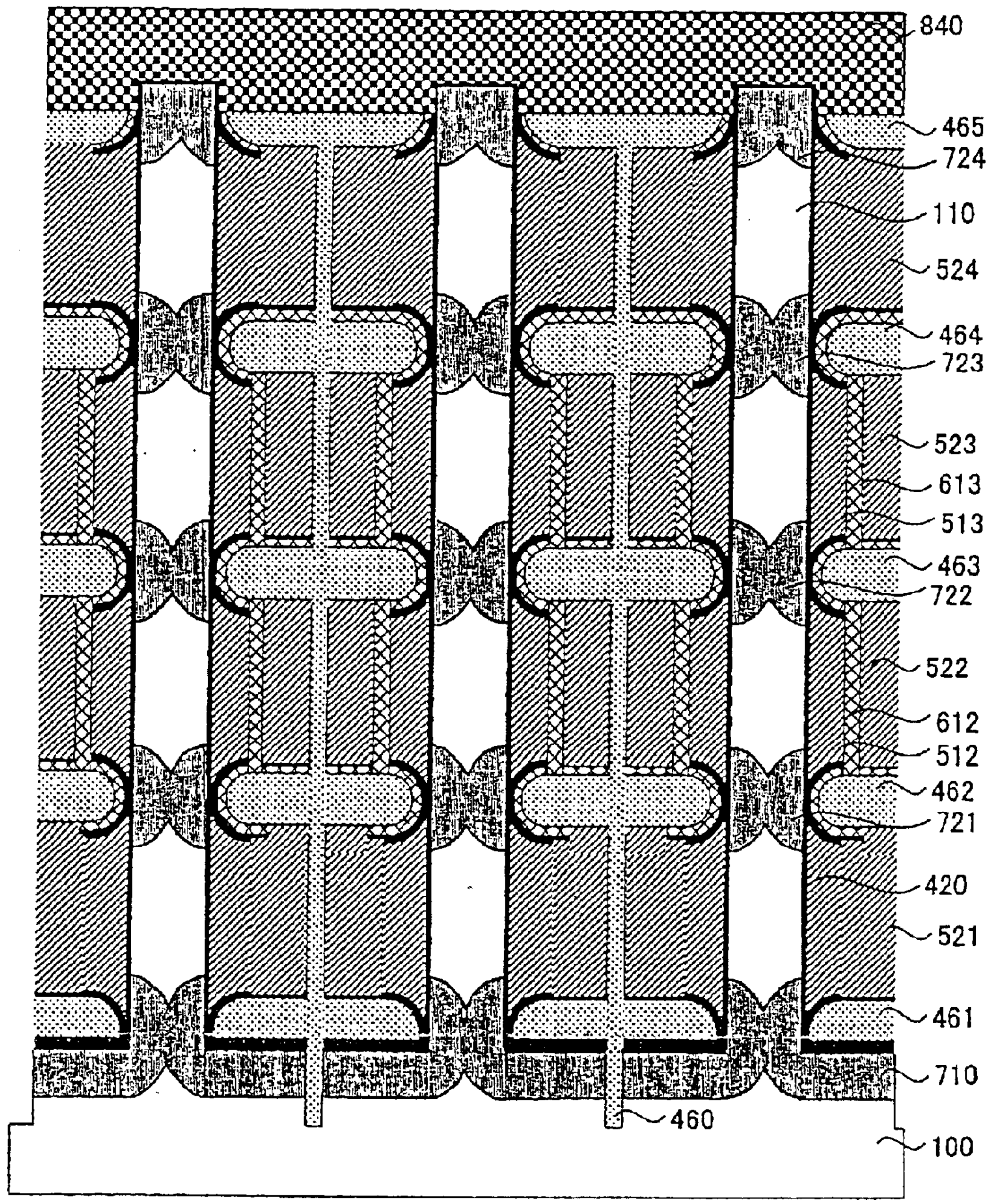

Subsequently, a silicon oxide film 420, for example, is formed as a third insulating film to be a tunnel oxide film of a thickness of about 10 nm on the periphery of each exposed island-like semiconductor layer 110 using thermal oxidation (FIG. 137 and FIG. 145). The tunnel oxide film is not limited to a thermally oxidized film but may be a CVD oxide film or a nitrogen oxide film.

Thereafter, production steps are in accordance with those of Production Example 1 after a polysilicon film 510, for example, is deposited to about 50 nm to 200 nm as a first conductive film (FIGS. 138 to 139 and FIGS. 146 to 147). Thereby the silicon oxide film 430 remains in regions where the island-like semiconductor layers 110 face each in the A-A' direction, and therefore, the tunnel oxide film is not formed in the regions. Accordingly, this example has an advantage in that the area of the tunnel oxide film decreases with respect to regions where the floating gate faces the control gate in each memory cell, which leads to improvement in the coupling ratio.

PRODUCTION EXAMPLE 3

With regard to Production Example 1, this example is particularly shown for forming the tunnel oxide film in opposing regions in the A-A' direction as shown in FIG. 1 as an example of forming the tunnel oxide film partially on the periphery of the island-like semiconductor layer 110 in the pillar form.

FIGS. 148 to 157 and FIGS. 158 to 167 are sectional views taken on line A-A' and line B-B', respectively, in FIG. 1 illustrating a memory cell array of EEPROM.

Figure 148:
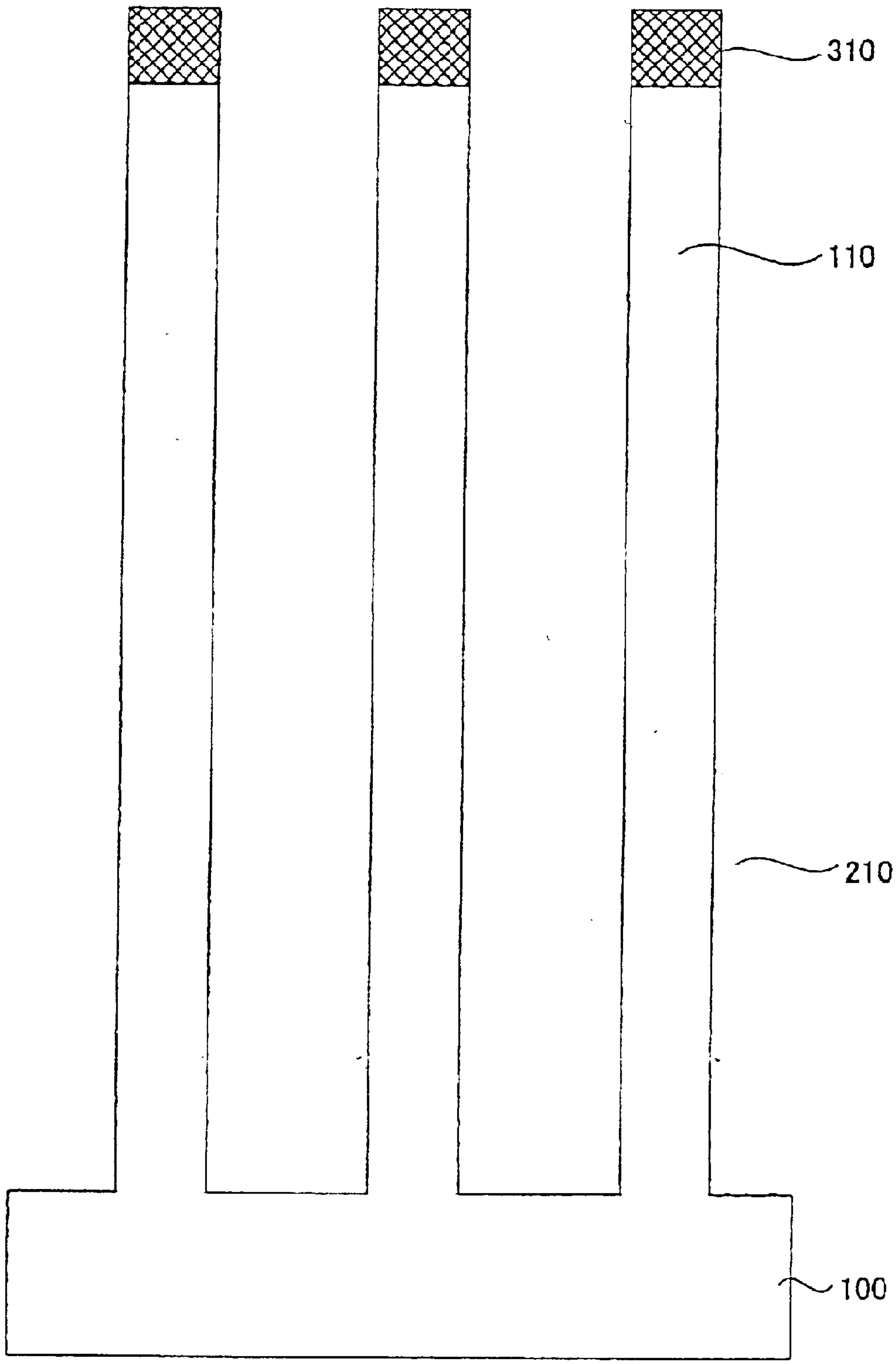
Figure 158:
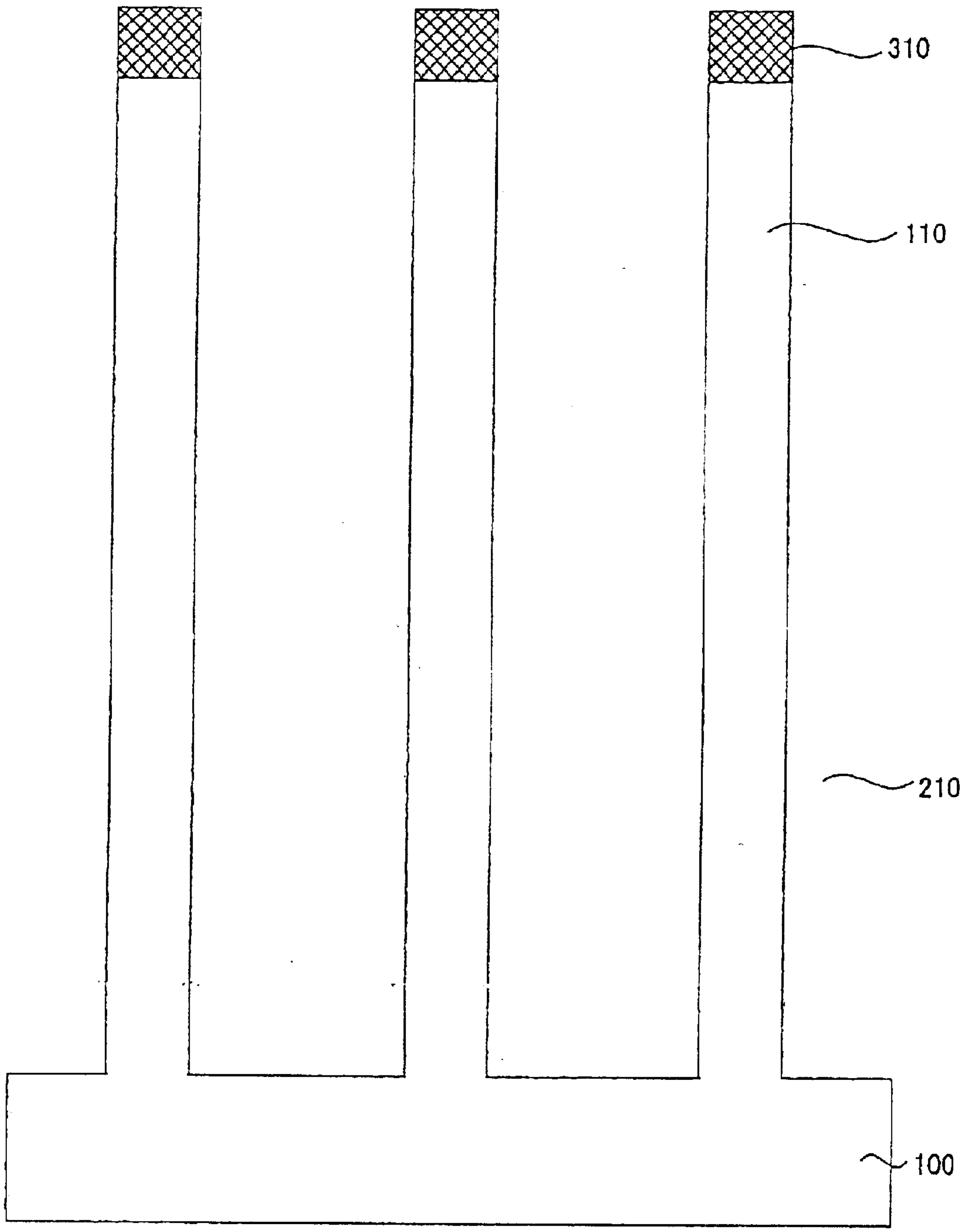

In this example, production steps are the same as those in Production Example 1 until the p-type silicon substrate 100 as the semiconductor substrate is etched 2,000 to 20,000 nm by RIE using as a mask the silicon nitride film 310 as the first insulating film to form the lattice-form trench 210 (FIG. 148 and FIG. 158).

Figure 149:
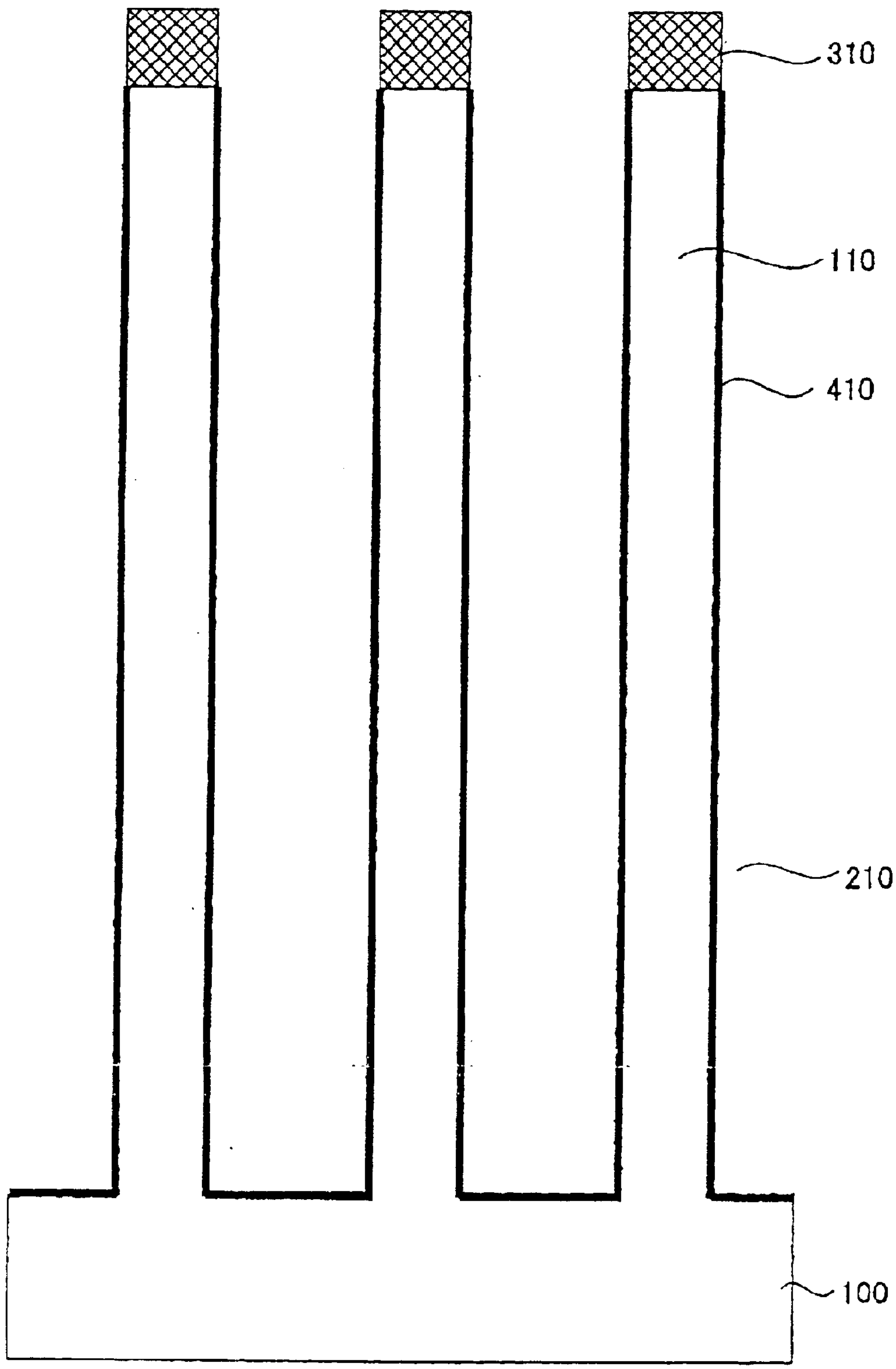
Figure 159:
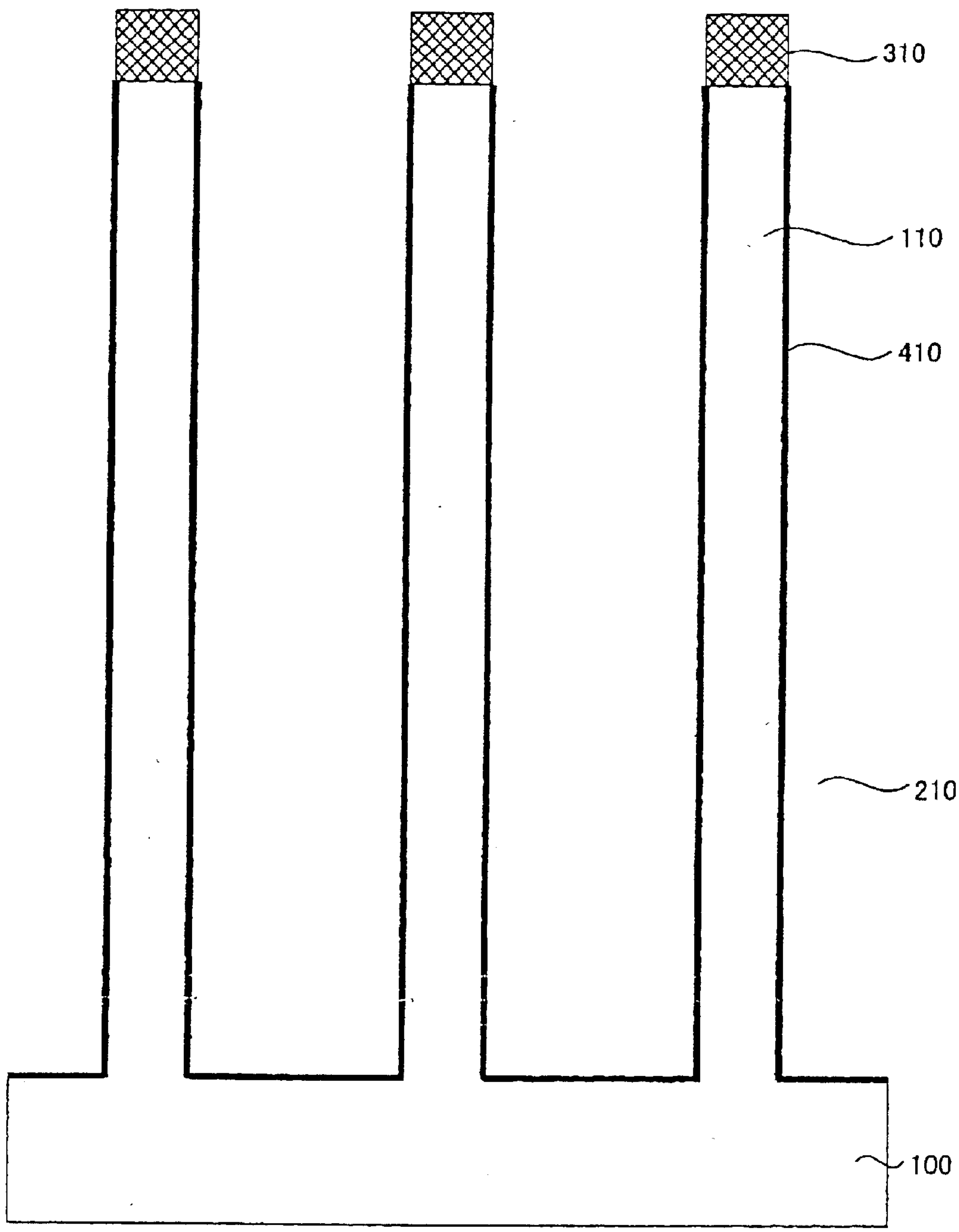

Thereafter, the surface of each island-like semiconductor layer 110 is oxidized to form a thermally oxidized film 410 to be a second insulating film of about 10 nm to 100 nm thickness (FIG. 149 and FIG. 159).

Figure 150:
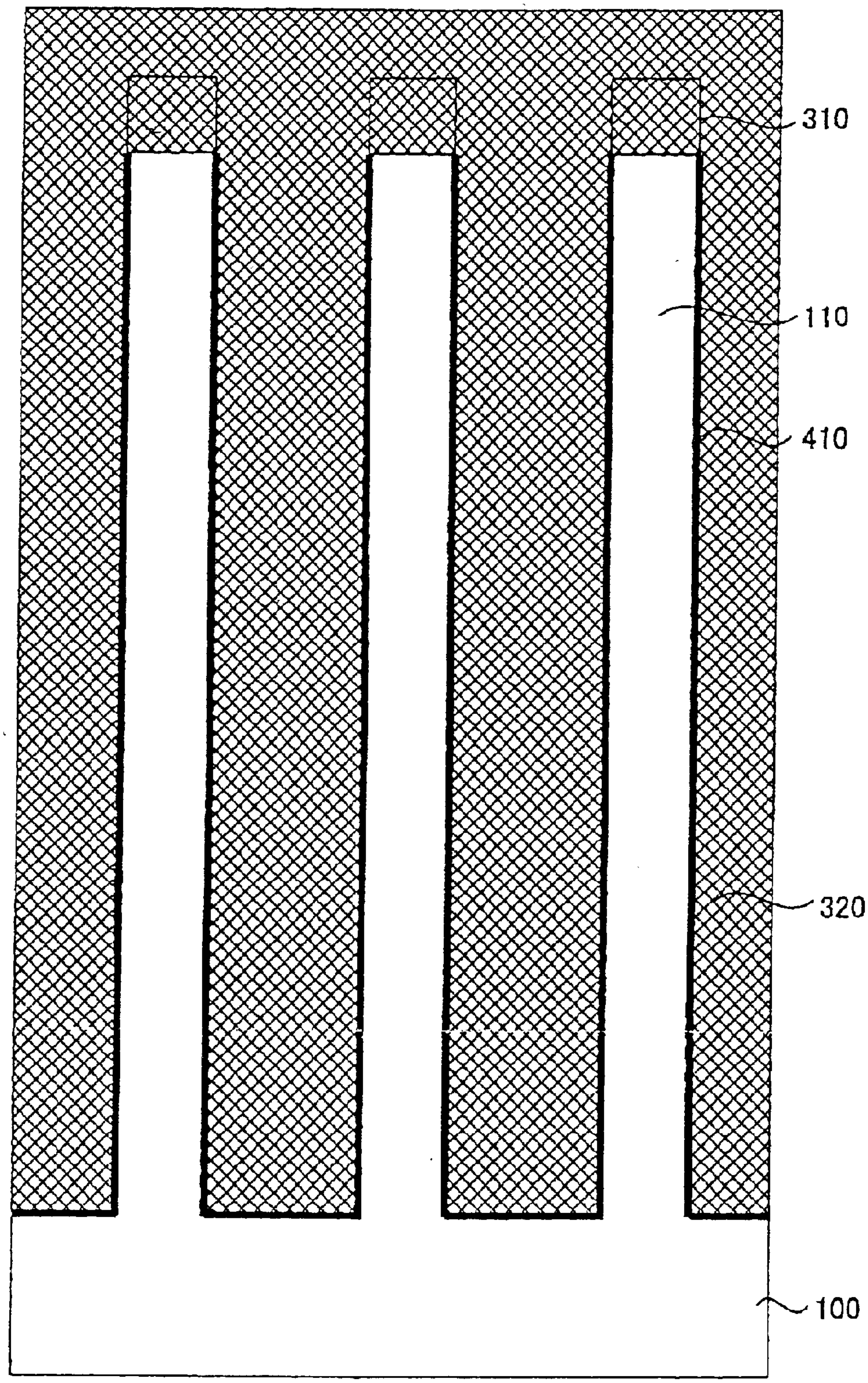
Figure 160:
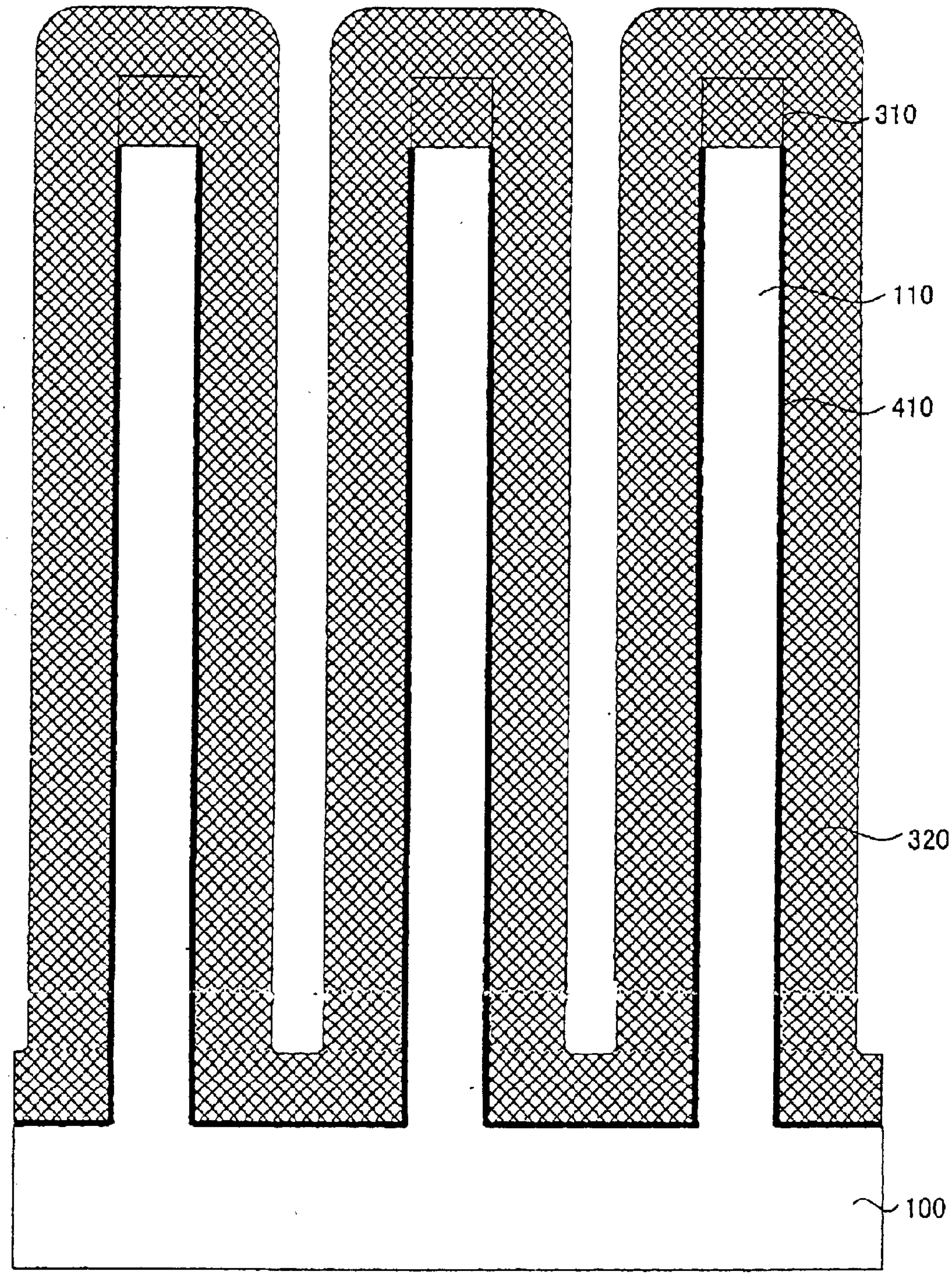

Subsequently, a silicon nitride film 320, for example, is deposited to about 50 nm to 500 nm as a fourth insulating film so that the island-like semiconductor layers 110 are continuous in an A-A' direction in FIG. 9 with intervention of the thermally oxidized film 410 as the second insulating film and are discontinuous in a B-B' direction of FIG. 9 (FIG. 150 and FIG. 160).

Figure 151:
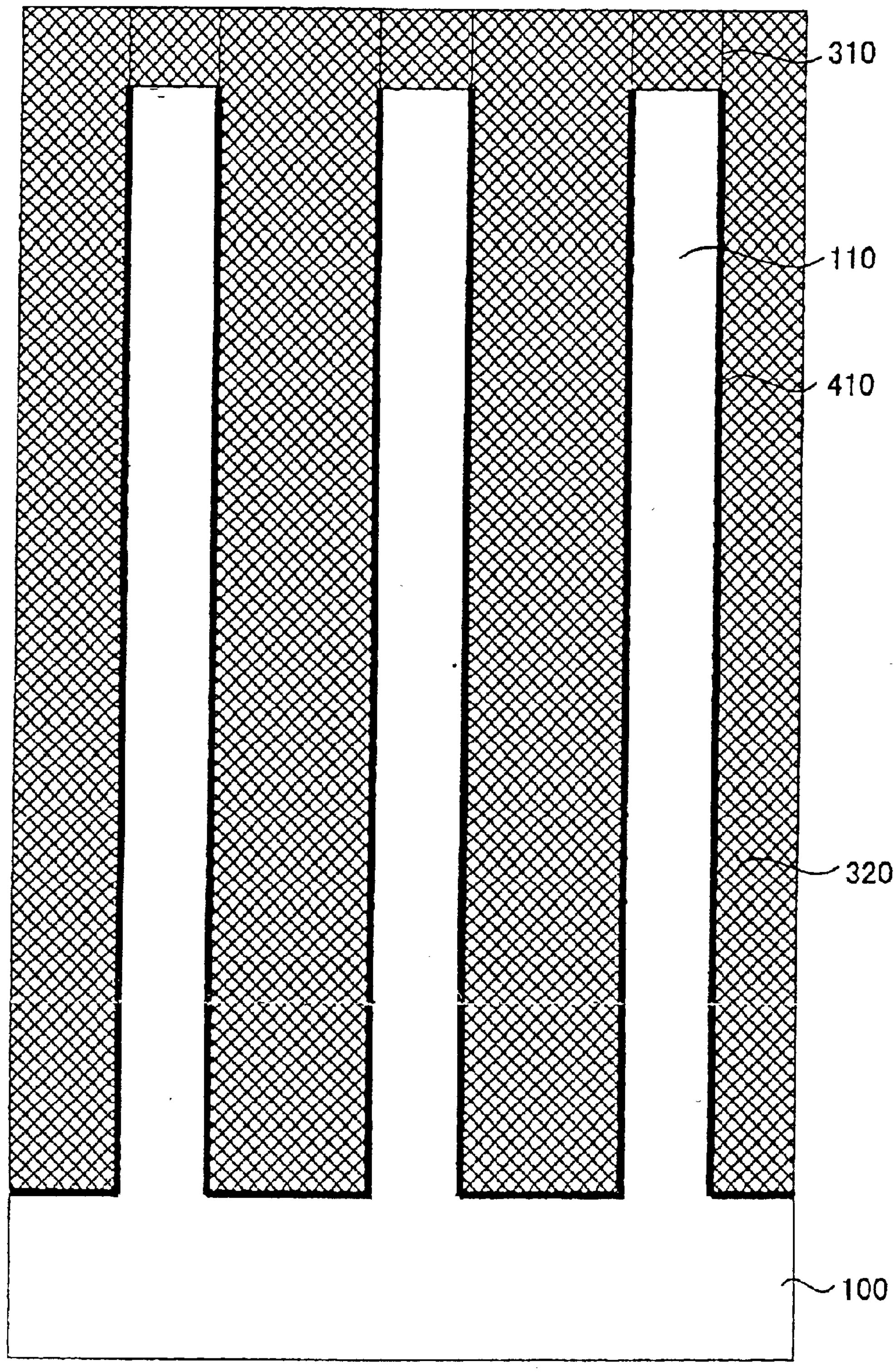
Figure 161:
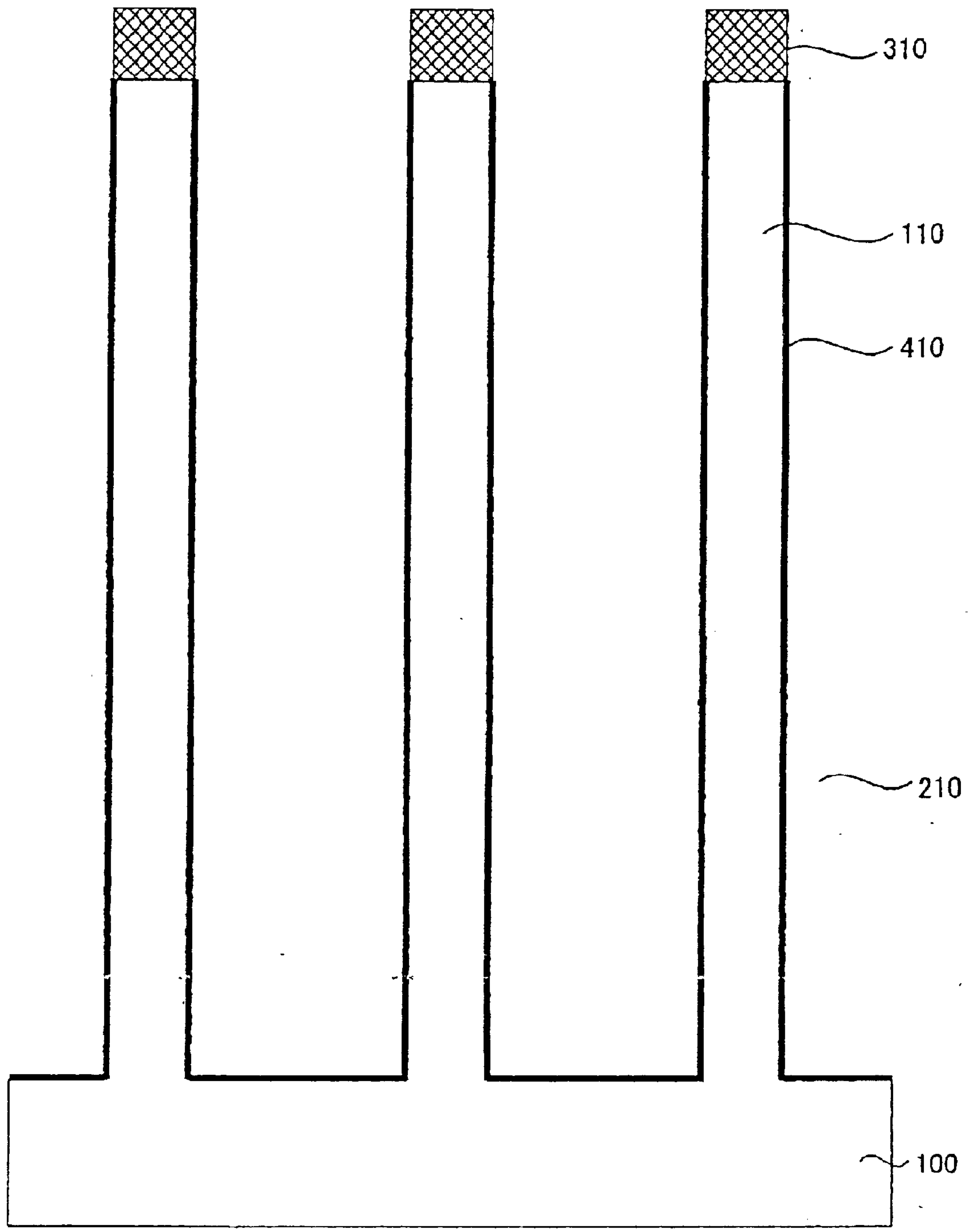

Thereafter, the silicon nitride film 320 is isotropically etched so that the silicon nitride film 320 remains only to face the island-like semiconductor layers 110 in the A-A' direction (see FIG. 151 and FIG. 161). That is, the thermally oxidized film 410 is exposed in the B-B' direction. Alternatively, the island-like semiconductor layers 110 may be formed continuously both in the A-A' direction and in the B-B' direction with intervention of the thermally oxidized film 410 and the silicon nitride film 320, and later, the silicon nitride film 320 is separated in the B-B' direction using a resist film patterned by a known photolithography technique.

Figure 152:
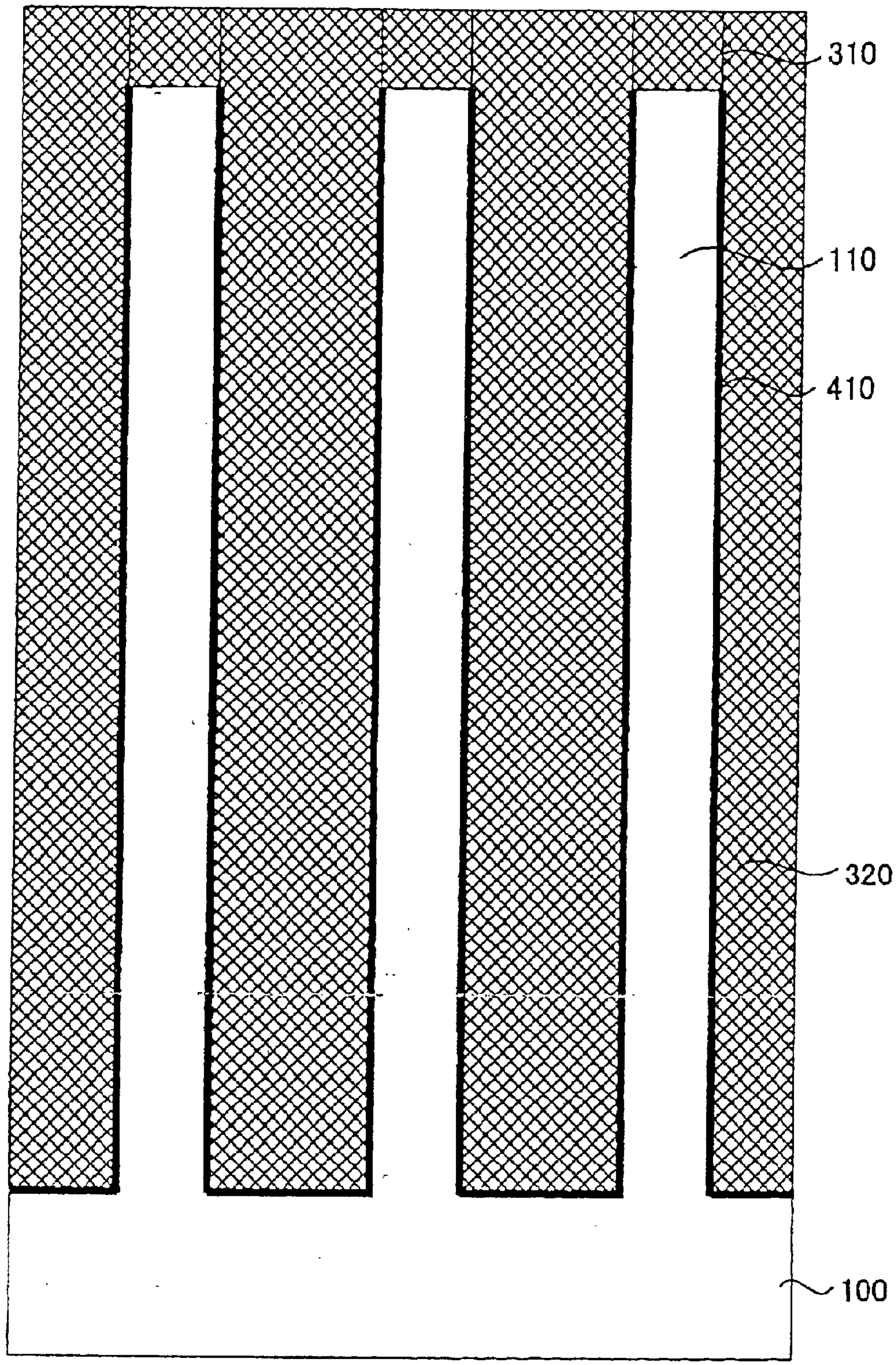
Figure 162:
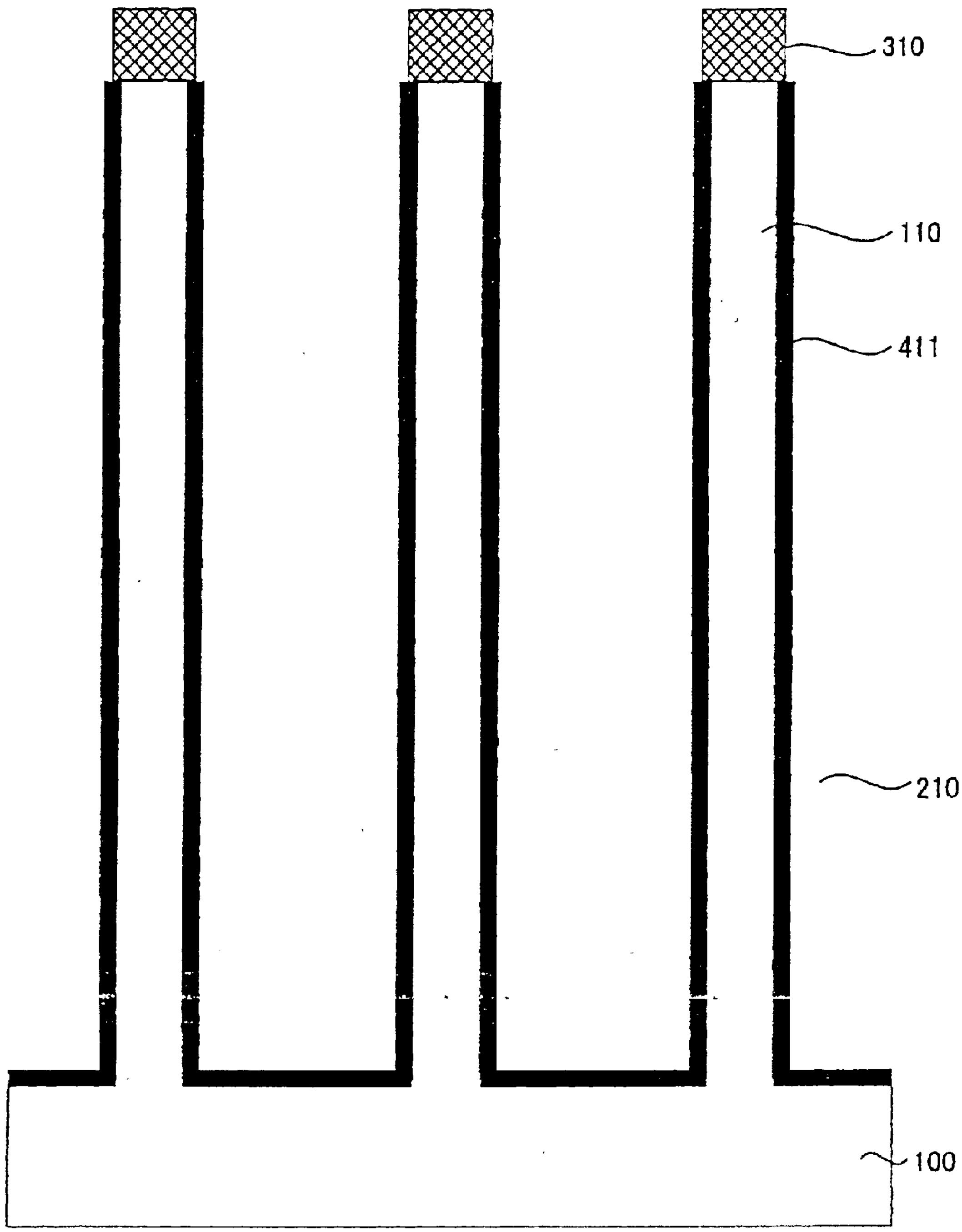

Thereafter, the exposed thermally oxidized film 410 is further oxidized to form a thermally oxidized film 411 as a second insulating film (FIG. 152 and FIG. 162).

Figure 153:
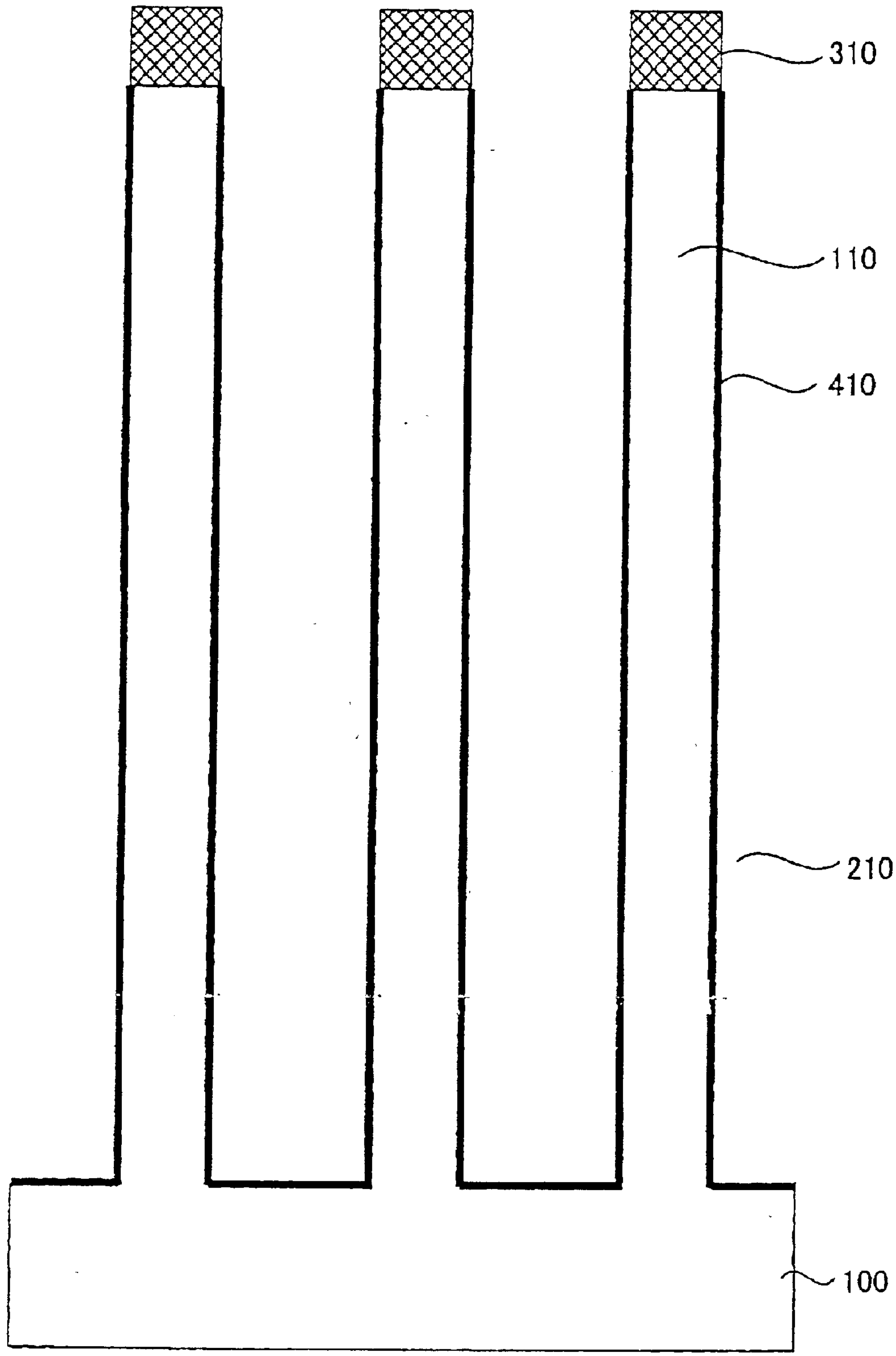
Figure 163:
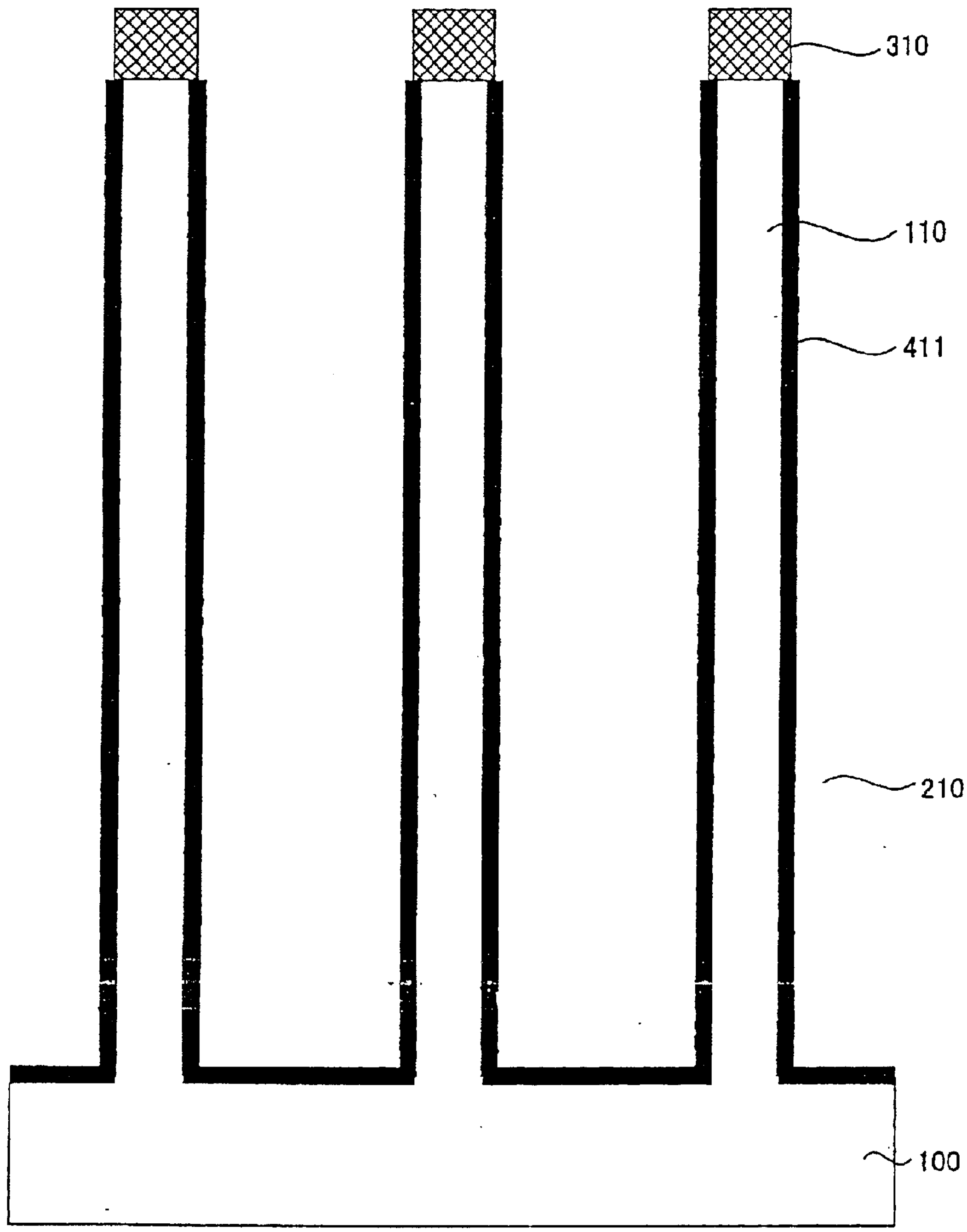

The silicon nitride film 320 is removed by isotropic etching (FIG. 153 and FIG. 163). At this time, the etch amount is adjusted so that the silicon nitride film (the first insulating film) 310 is not completely etched away.

Figure 154:
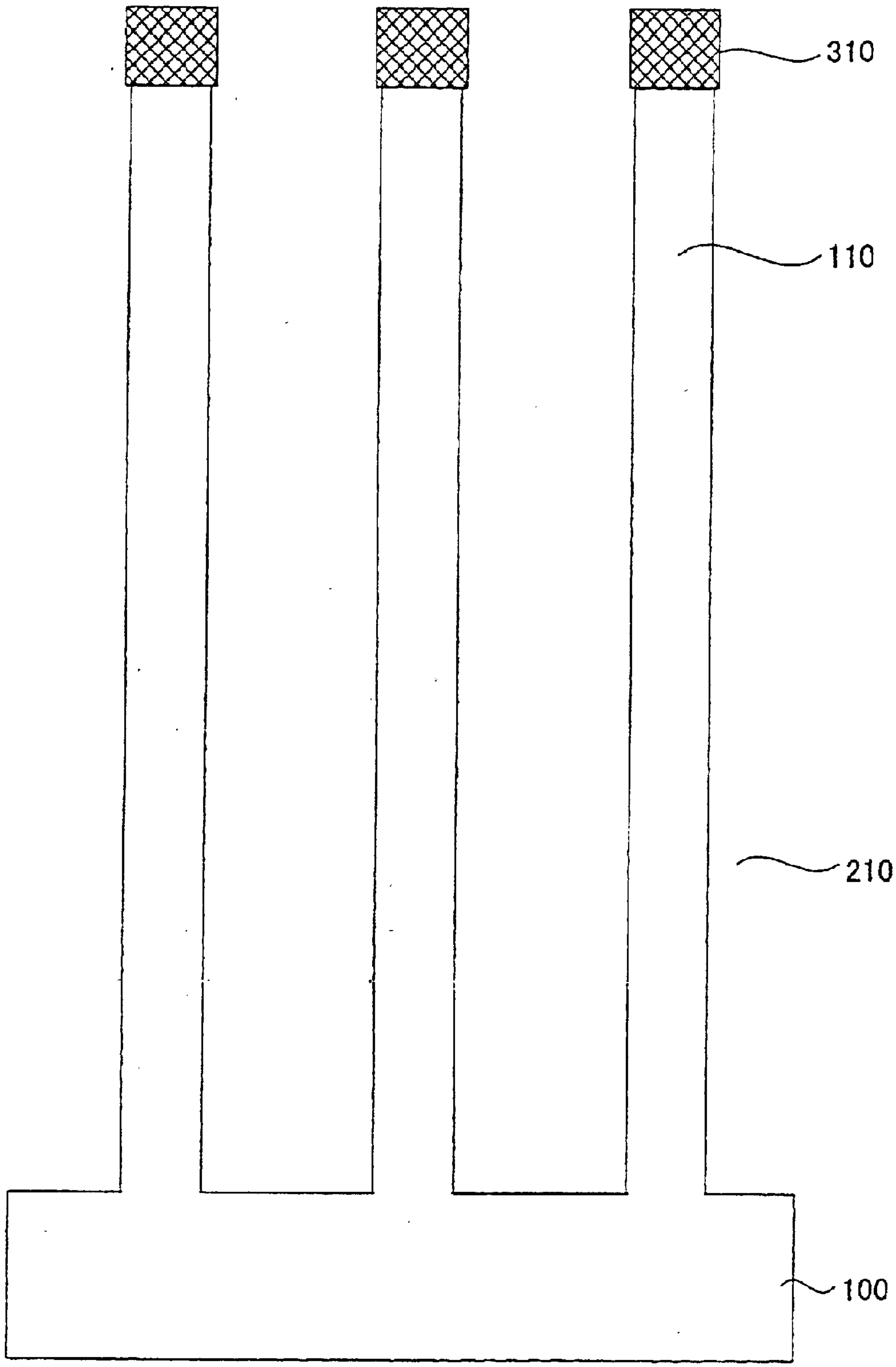
Figure 164:
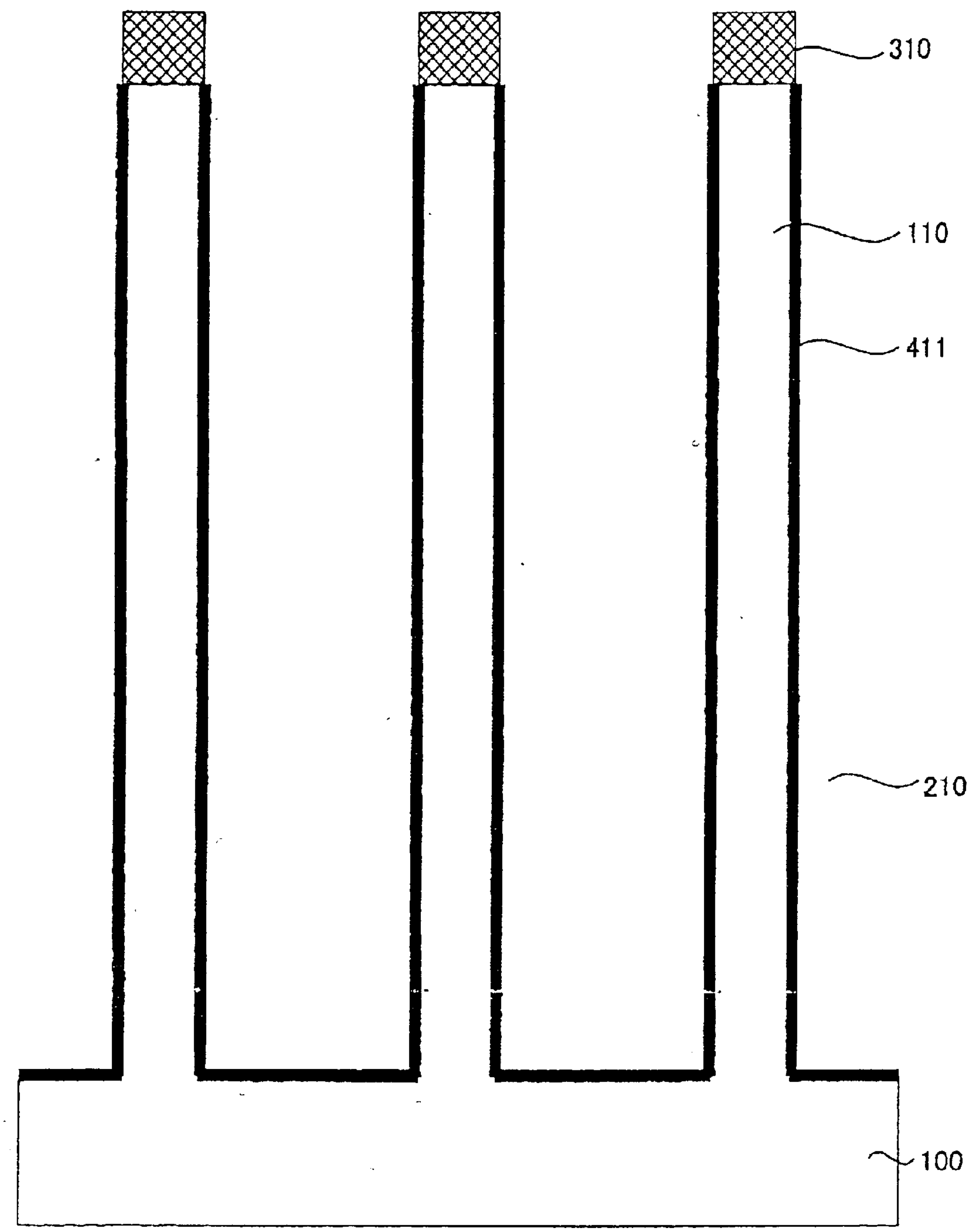

Subsequently, the island-like semiconductor films 110 are exposed in a region where the island-like semiconductor layers 110 face each other, by isotropically etching away the silicon oxide film by a thickness about the same as the thickness of the thermally oxidized film 410 (FIG. 154 and FIG. 164).

Figure 155:
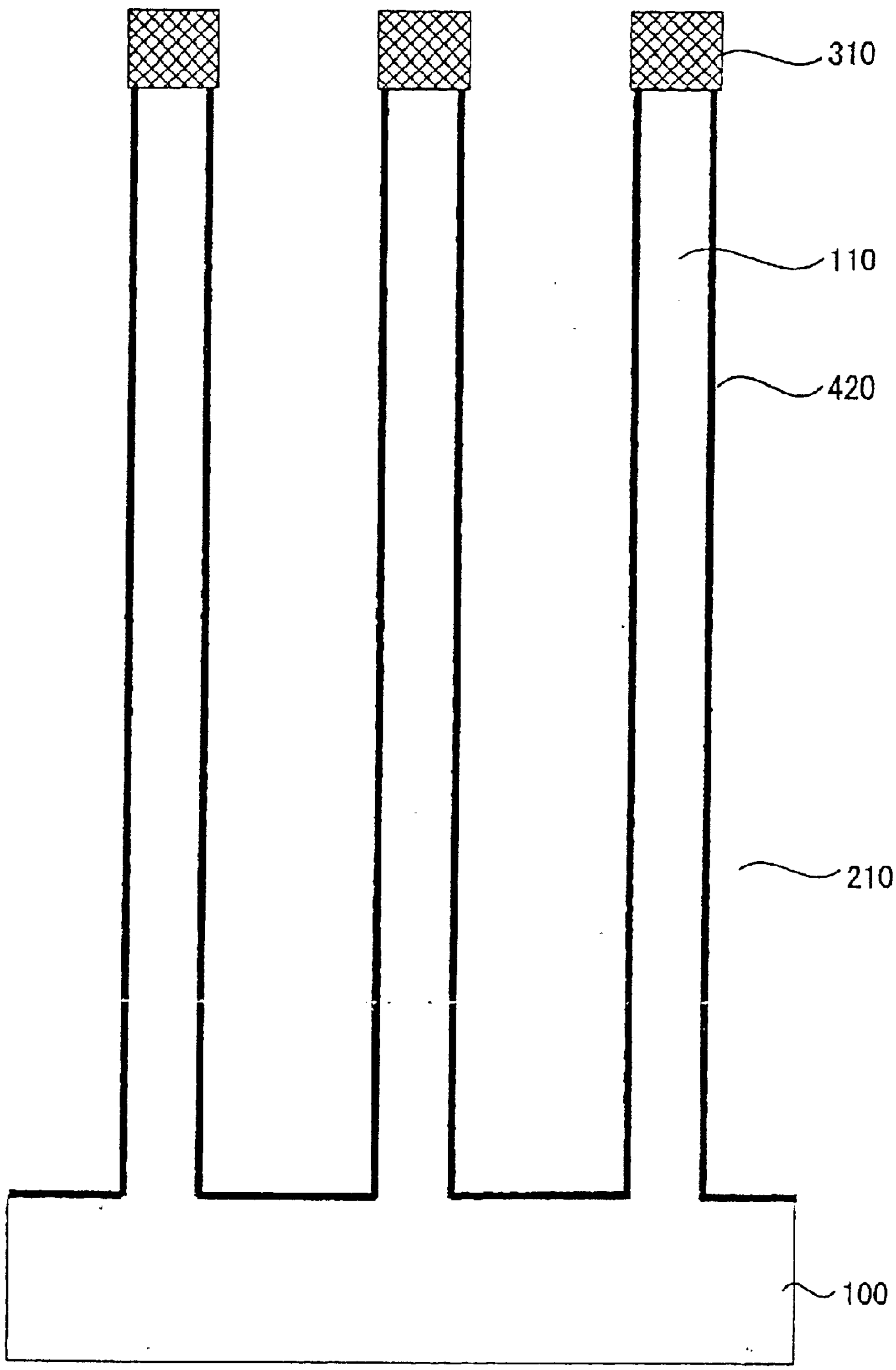
Figure 156:
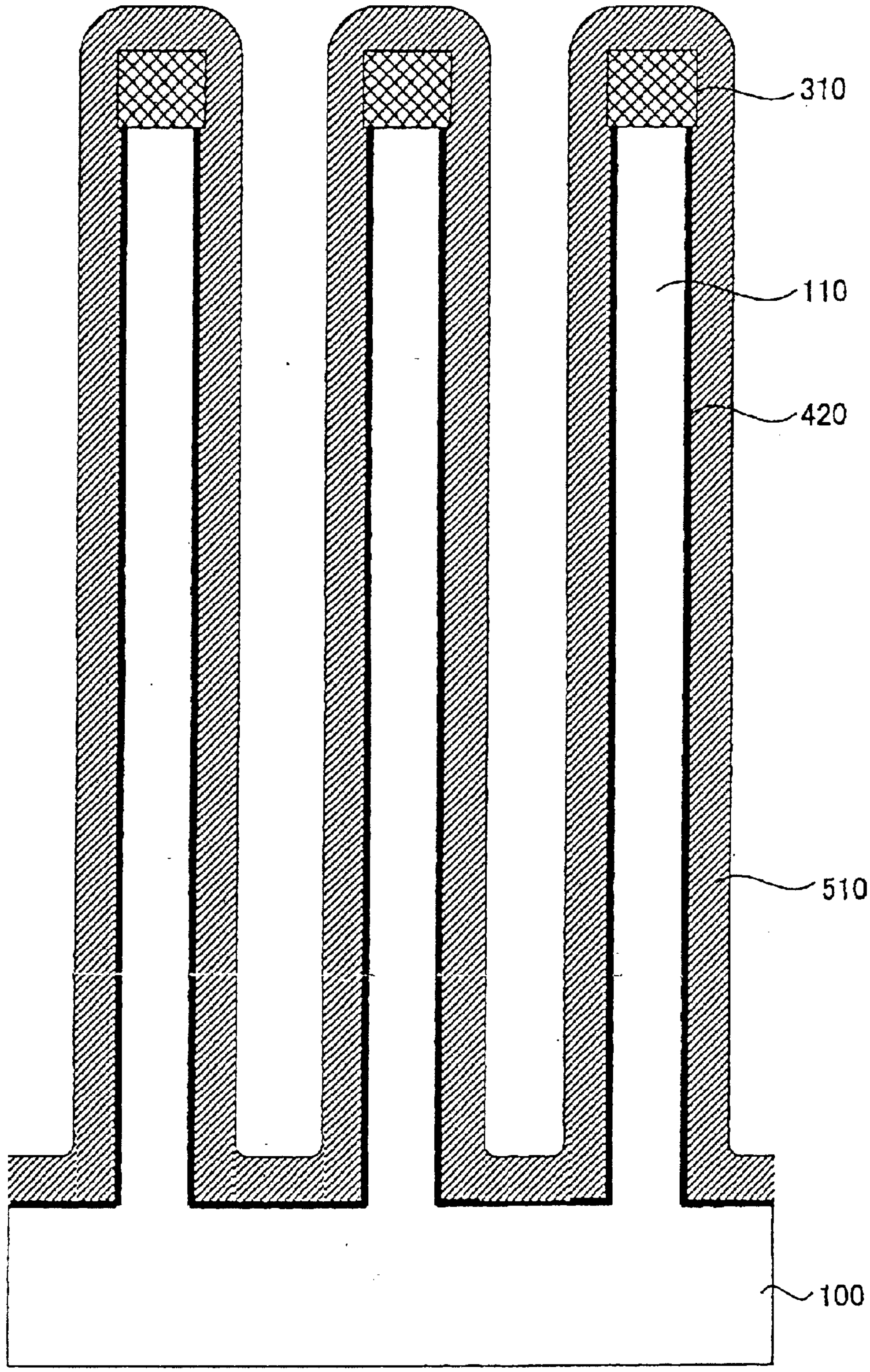
Figure 157:
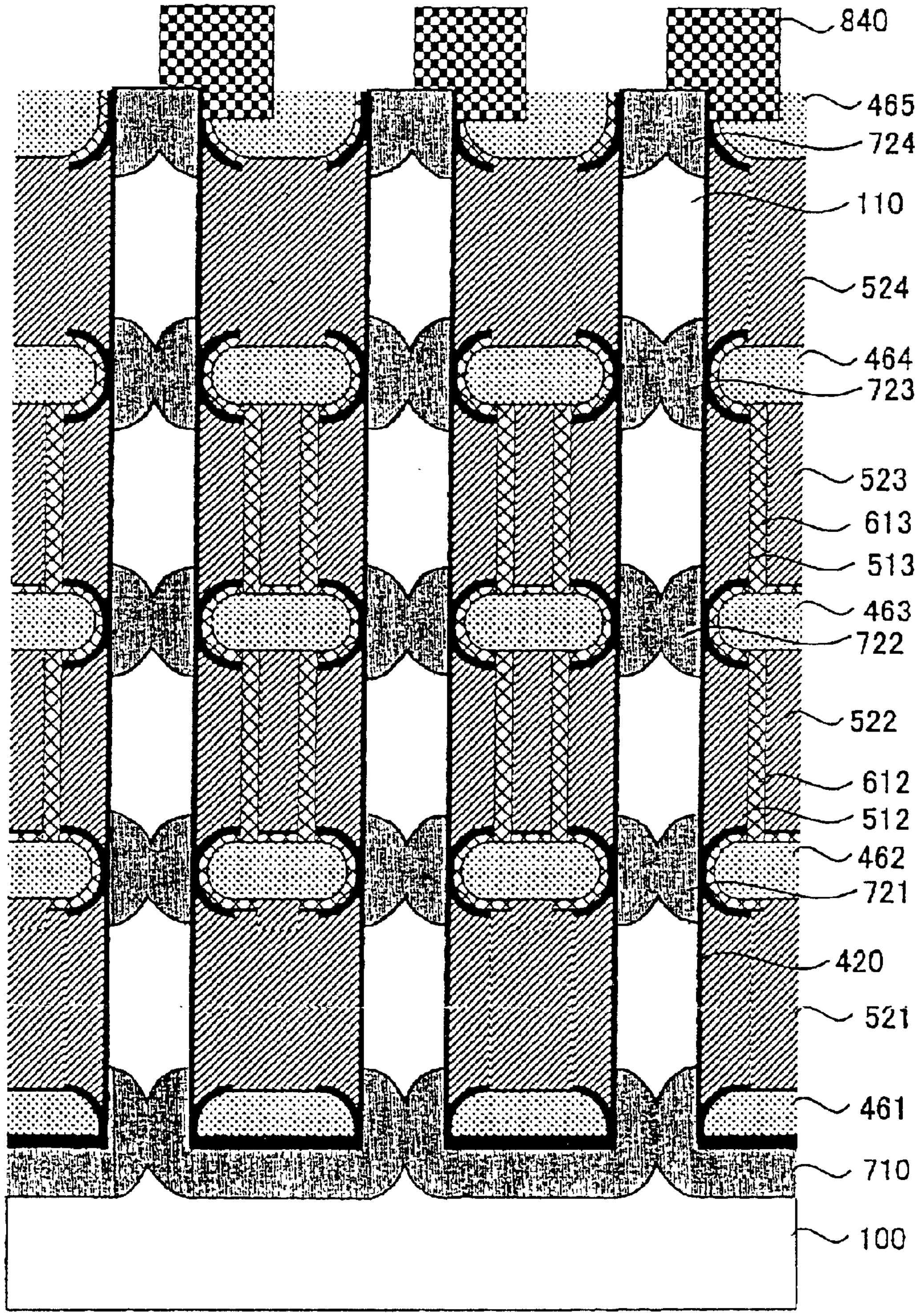
Figure 165:
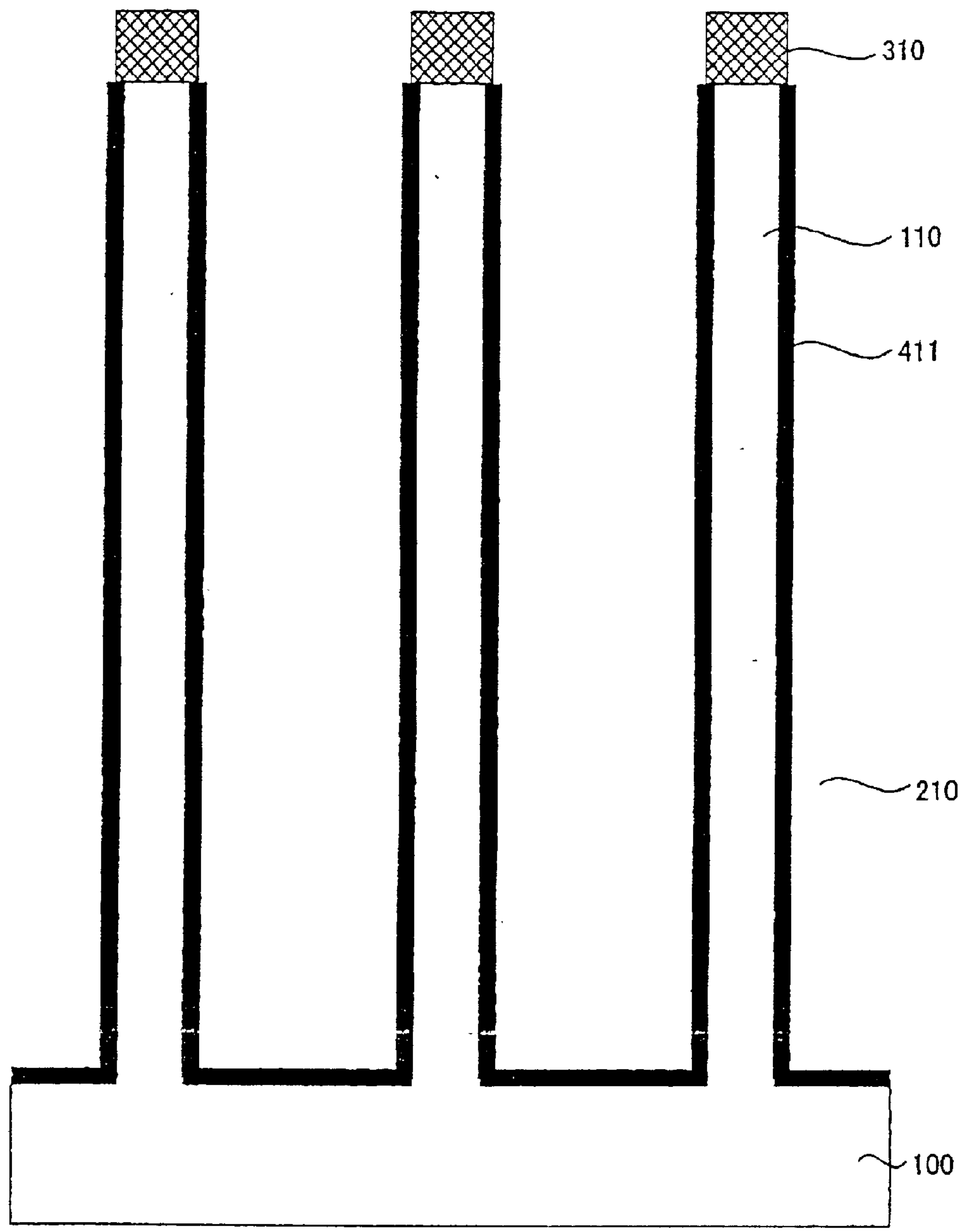
Figure 166:
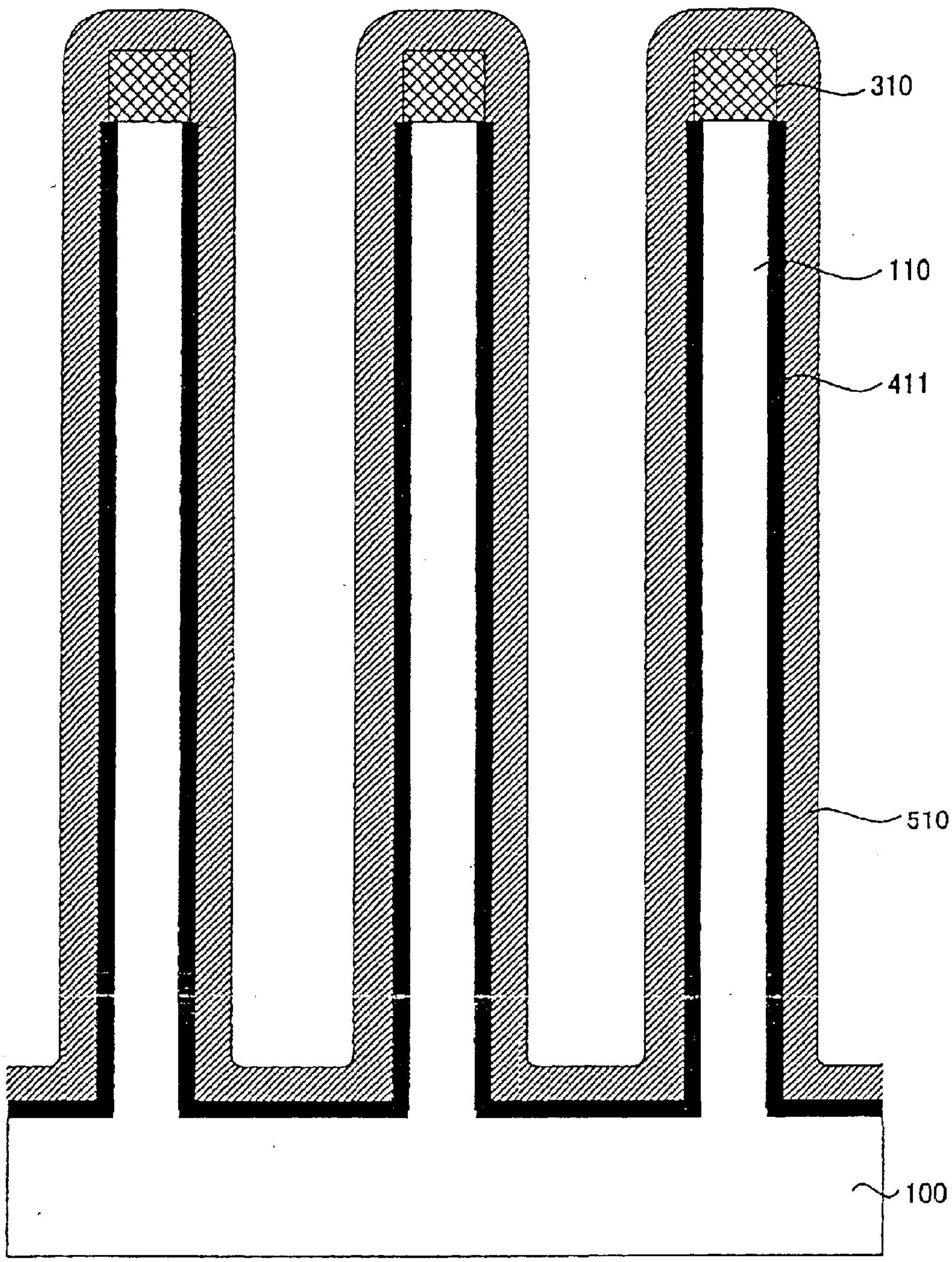
Figure 167:
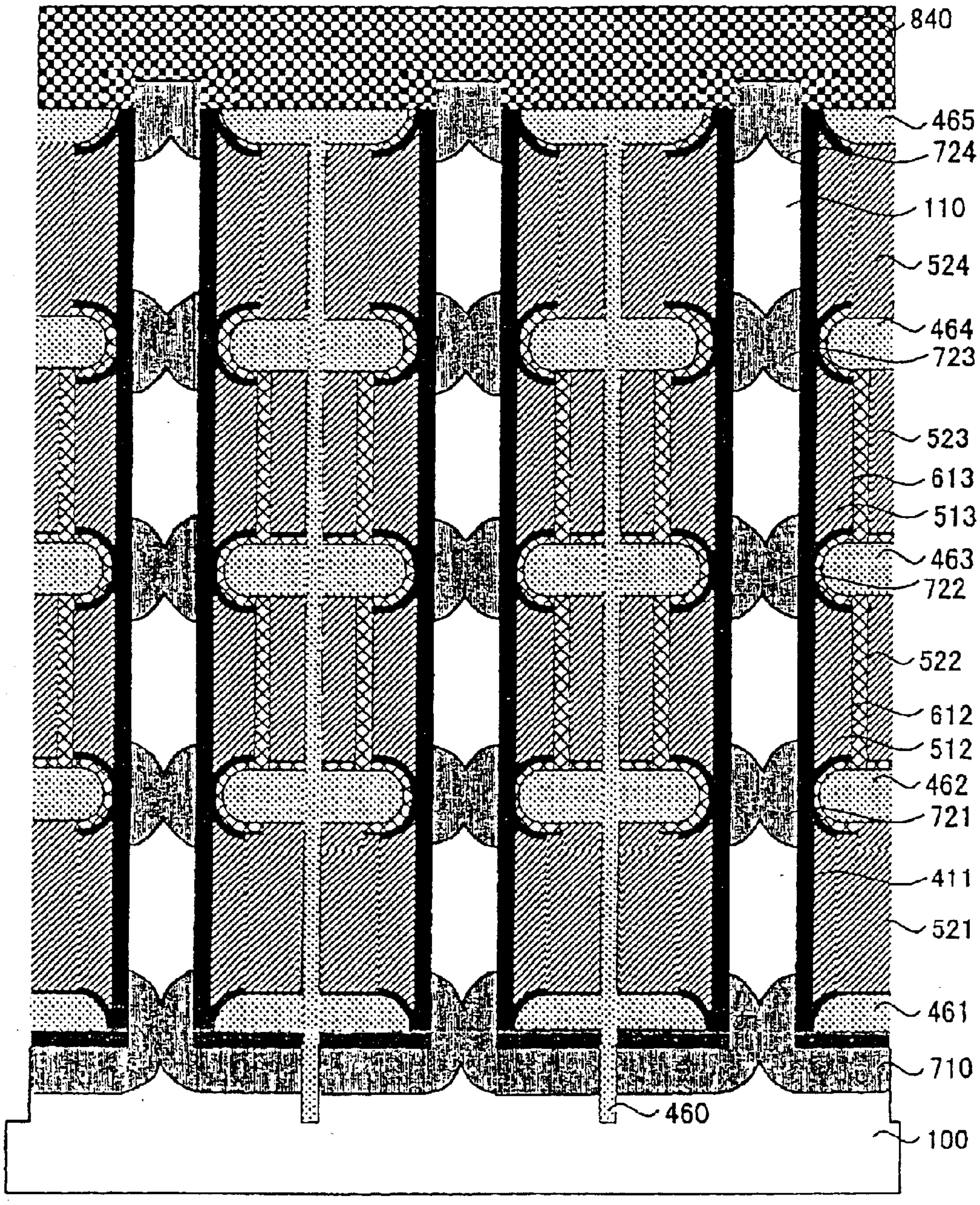
Figure 168:
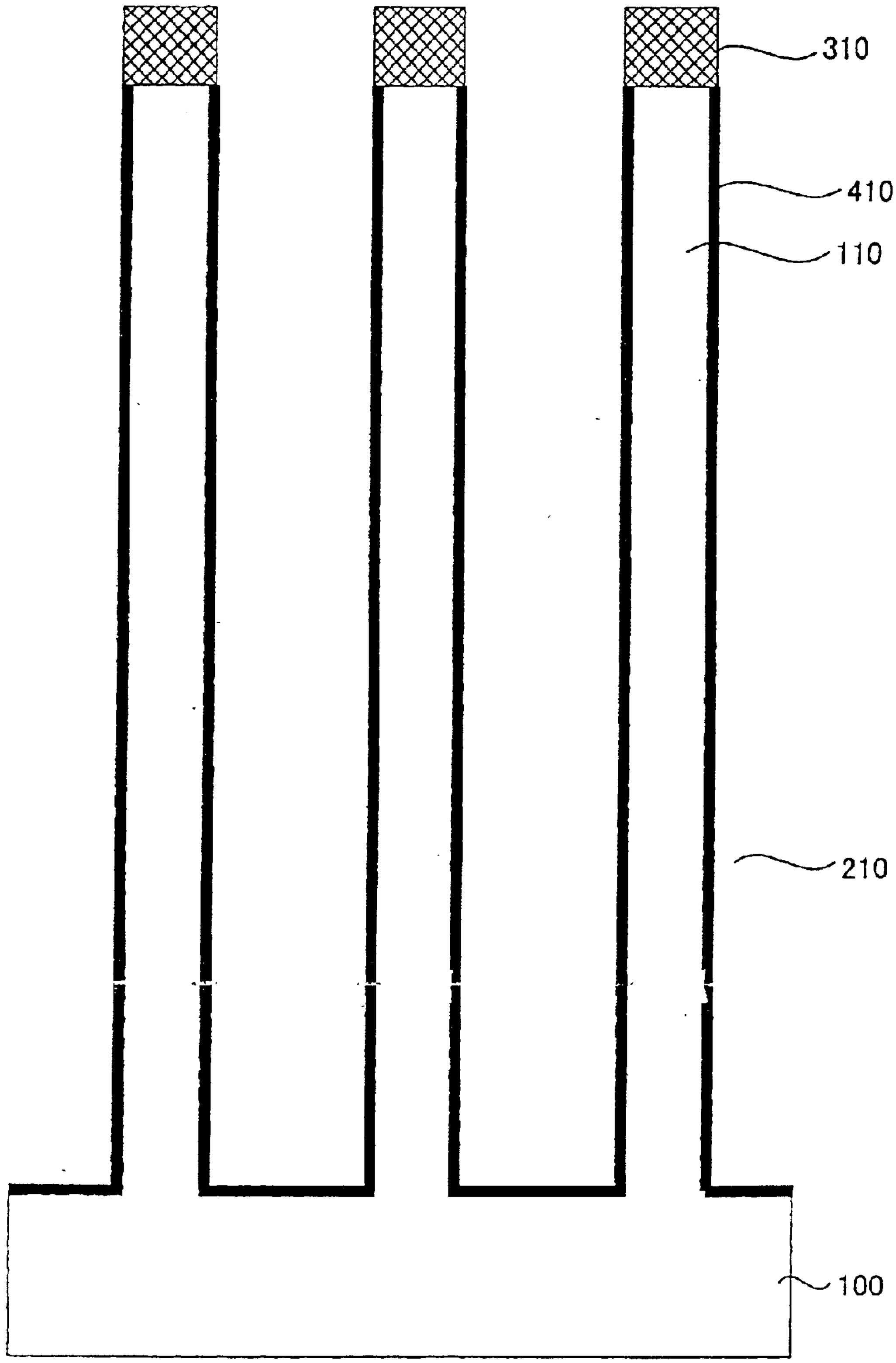

Next, a silicon oxide film 420, for example, is formed as a third insulating film to be a tunnel oxide film of about 10 nm on the surface of each of the exposed island-like semiconductor layers 110, for example, using thermal oxidation (FIG. 155 and FIG. 165). The tunnel oxide film is not limited to the thermally oxidized film but may be a CVD oxide film or a nitrogen oxide film. When the silicon oxide film 420 is formed, the thickness and etch amount of thermally oxidized film 410 are pre-set so that the charged stage of the charge storage layer is not affected by tunnel current.

Thereafter, production steps are in accordance with those of Production Example 1 after a polysilicon film 510, for example, is deposited to about 50 nm to 200 nm as a first conductive film (FIGS. 156 to 159 and FIGS. 166 to 167). Thereby the thermally oxidized film 411 remains in regions where the island-like semiconductor layers 110 face each other in the B-B' direction, and the tunnel oxide film is not formed. Accordingly, this example has an advantage in that the area of the tunnel oxide film decreases with respect to regions where the floating gates face the control gates in memory cells, which leads to improvement in the coupling ratio.

PRODUCTION EXAMPLE 4

With regard to Production Example 1, this example is particularly shown for forming the tunnel oxide film partially on the periphery of the pillar-form island-like semiconductor layer 110.

FIGS. 168 to 178 and FIGS. 179 to 181 are sectional views taken on line A-A' and line B-B', respectively, in FIG. 1 illustrating a memory cell array of EEPROM.

In this example, production steps are the same as those in Production Example 1 until the thermally oxidized film 410 is formed as the second insulating film (FIG. 168 and FIG. 179), the thermally oxidized film 410 is etched away and, as required, the channel ion implantation is carried out on the sidewall of each island-like semiconductor layer 110, for example, using slant ion implantation.

Thereafter, a silicon oxide film 452, for example, is deposited to about 5 to 50 nm as a twenty-eighth insulating film and anisotropically etched to remain in the form of a sidewall on the sidewall of each island-like semiconductor layer 110. At this time, the silicon oxide film 452 may be formed by thermal oxidation, or the thermally oxidized film 421 as the second insulating film may be used without being removed. The silicon oxide film 452 may be used as it is deposited without being formed in the sidewall form.

Subsequently, a silicon nitride film 362, for example, is deposited to about 5 nm to 50 nm as a twenty-seventh insulating film, and thereafter, is anisotropically etched in the form of a sidewall on the sidewall of each island-like semiconductor layers 110 with intervention of the silicon oxide film 452.

Figure 169:
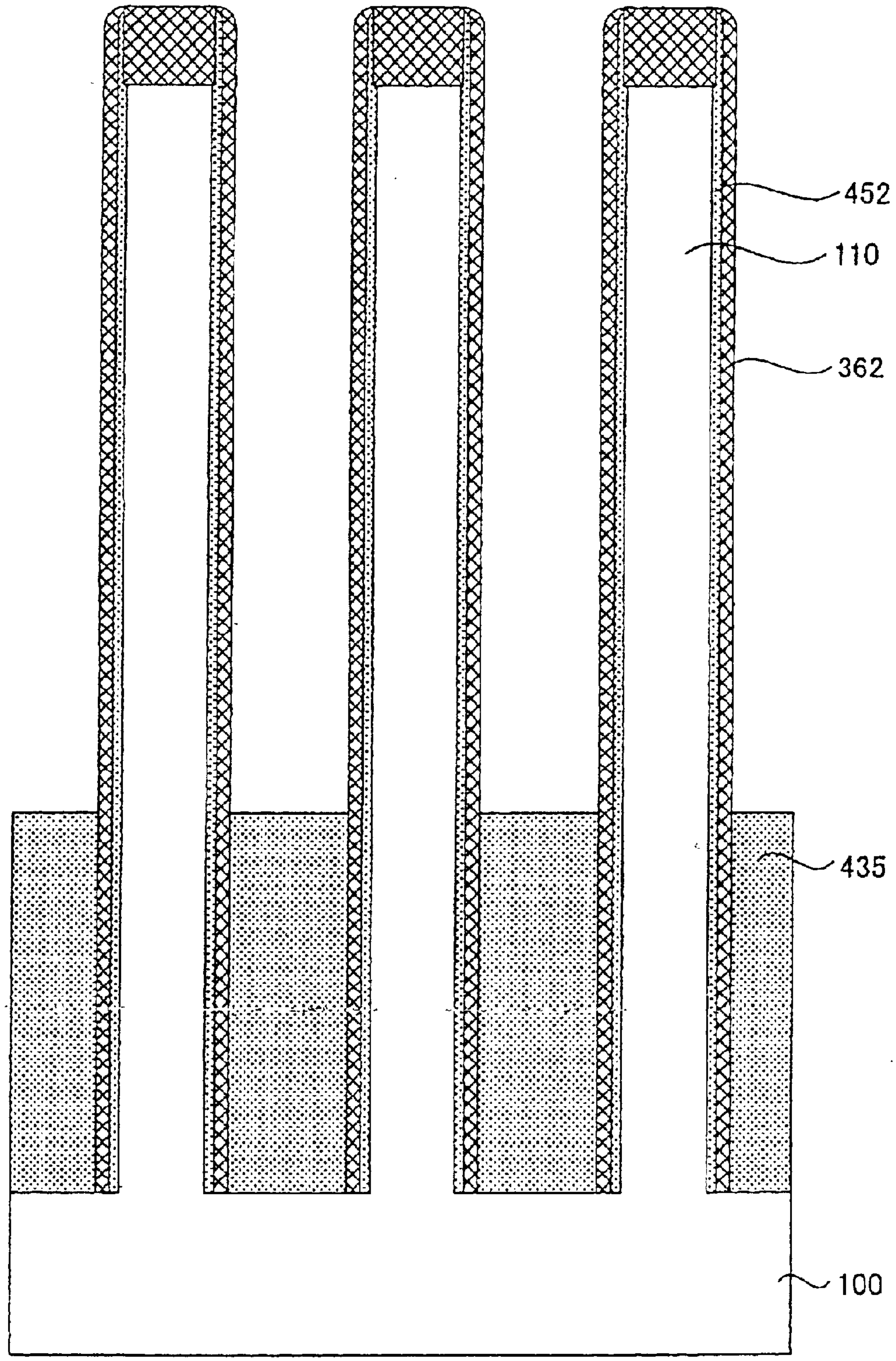
Figure 180:
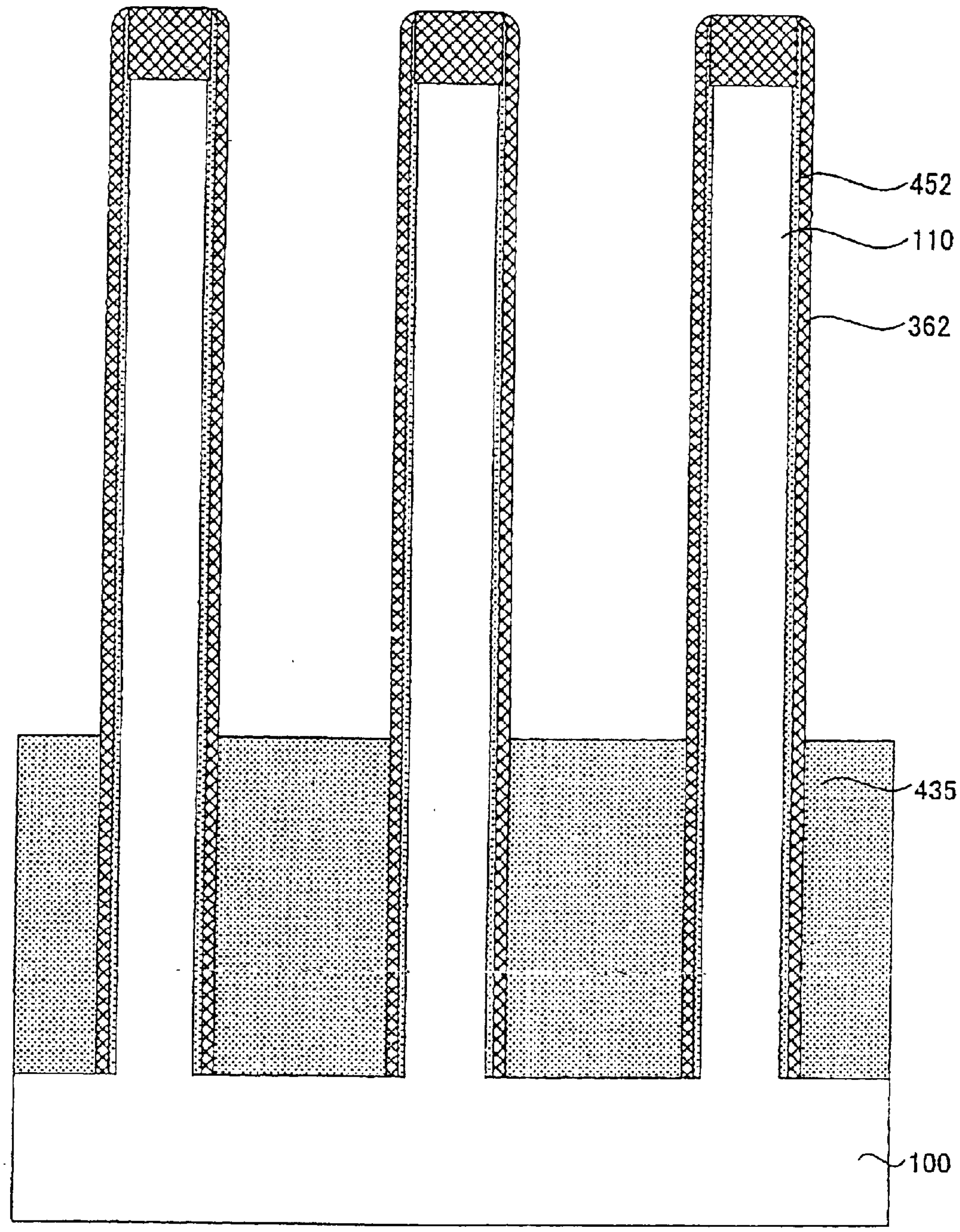

Next, a silicon oxide film 435, for example, is deposited to 50 to 500 nm as a twenty-fifth insulating film, and thereafter, is buried by isotropic etching to a degree such that the silicon oxide film 435 reaches at least the top end of a first conductive film 512 which is to be formed by a later step (FIG. 169 and FIG. 180).

Figure 170:
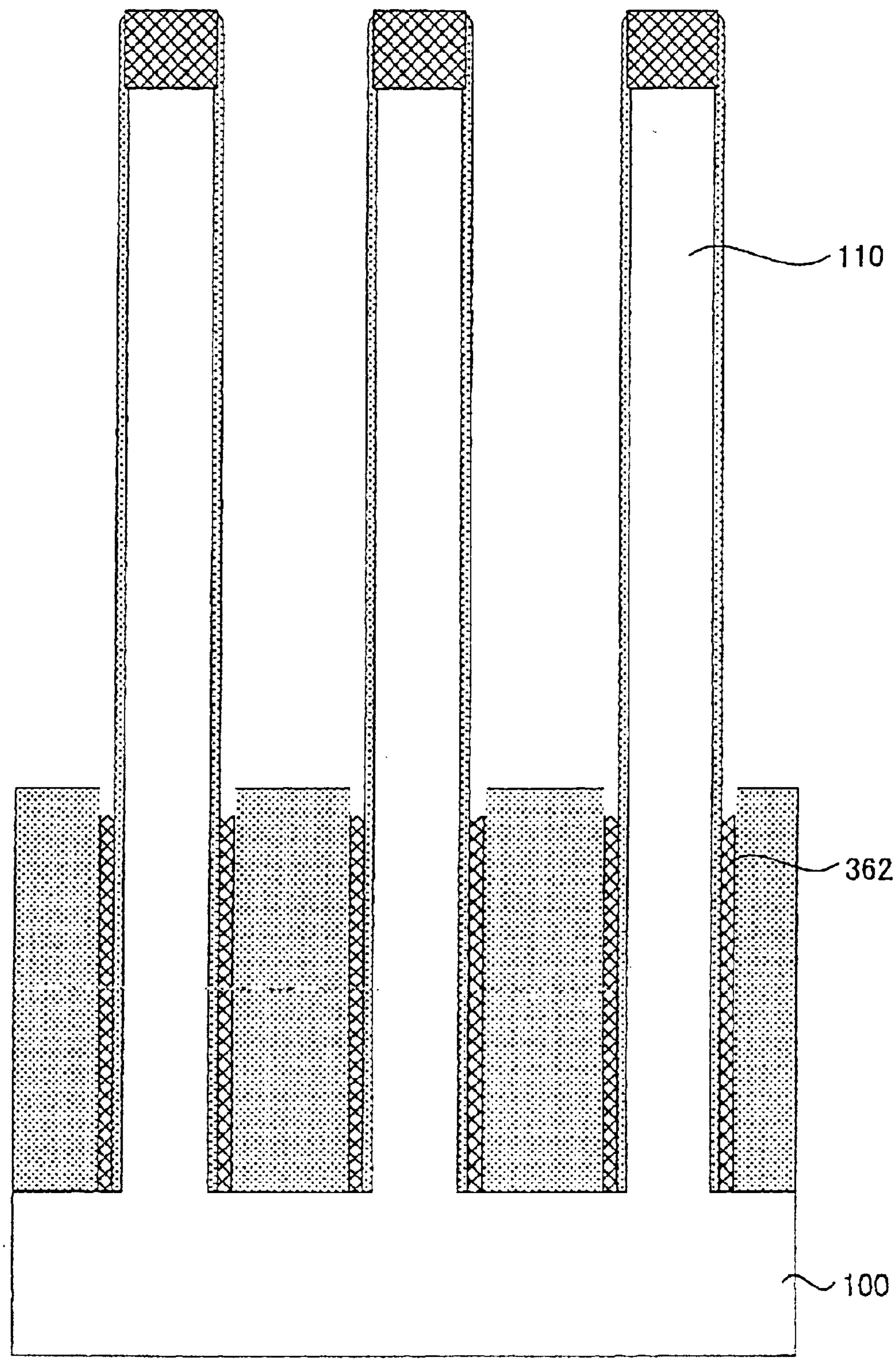
Figure 181:
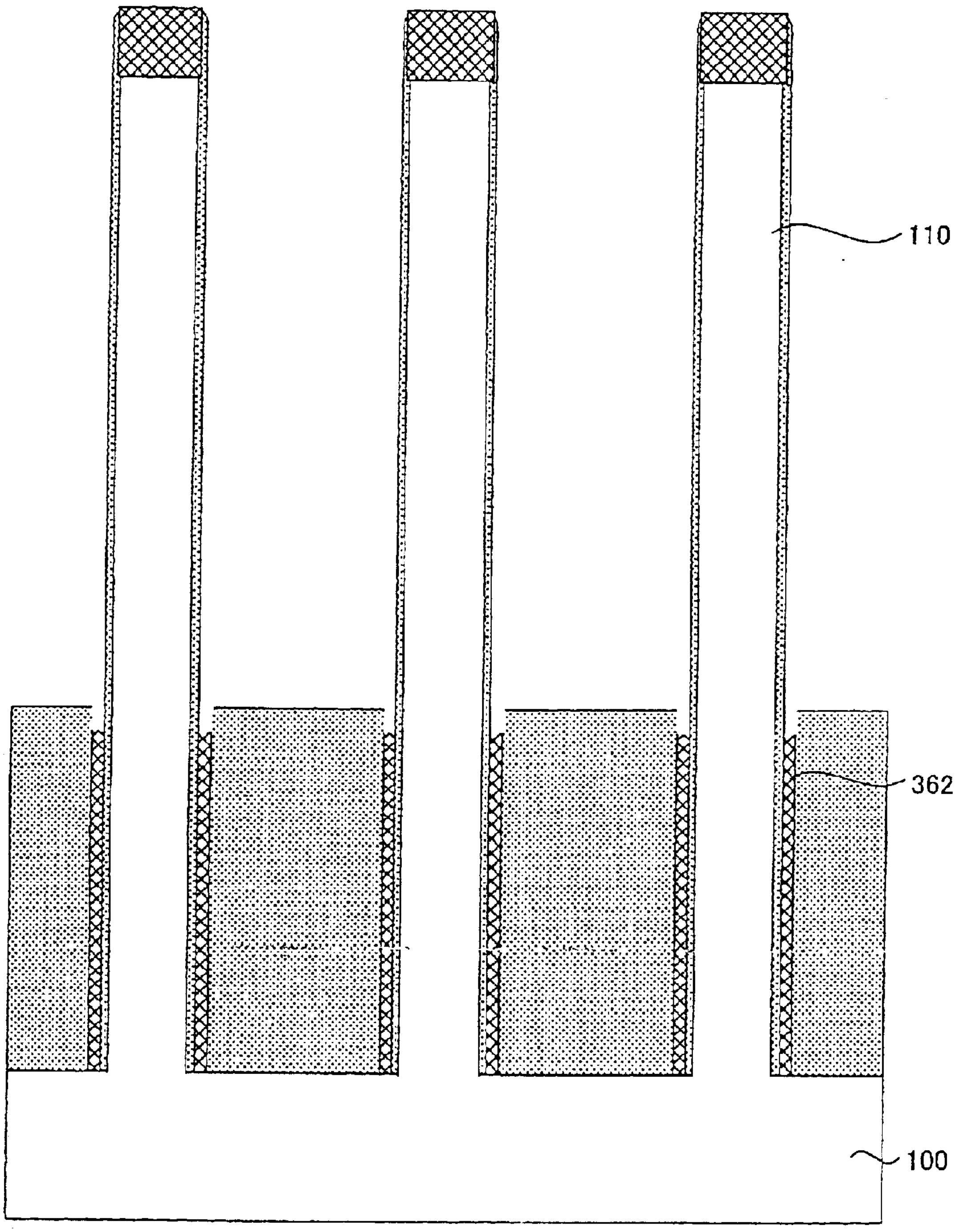

Using the silicon oxide film 435 as a mask, the silicon nitride film 362 is etched to remain only between the silicon oxide film 452 and the silicon oxide film 435 (FIG. 170 and FIG. 181). At this time, the silicon nitride film 362 forms a recess with respect to the top surface of the silicon oxide film 435.

Figure 171:
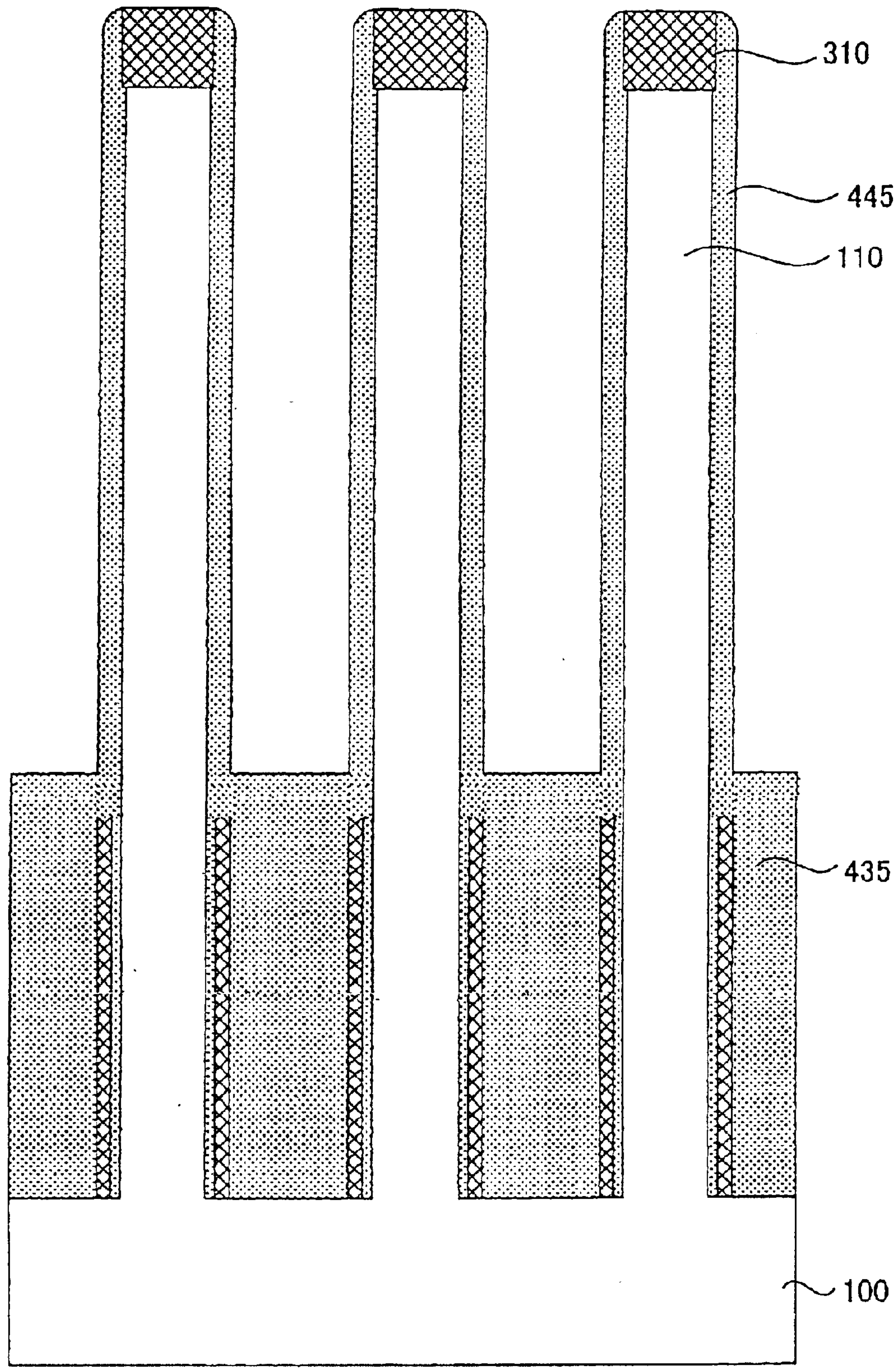
Figure 172:
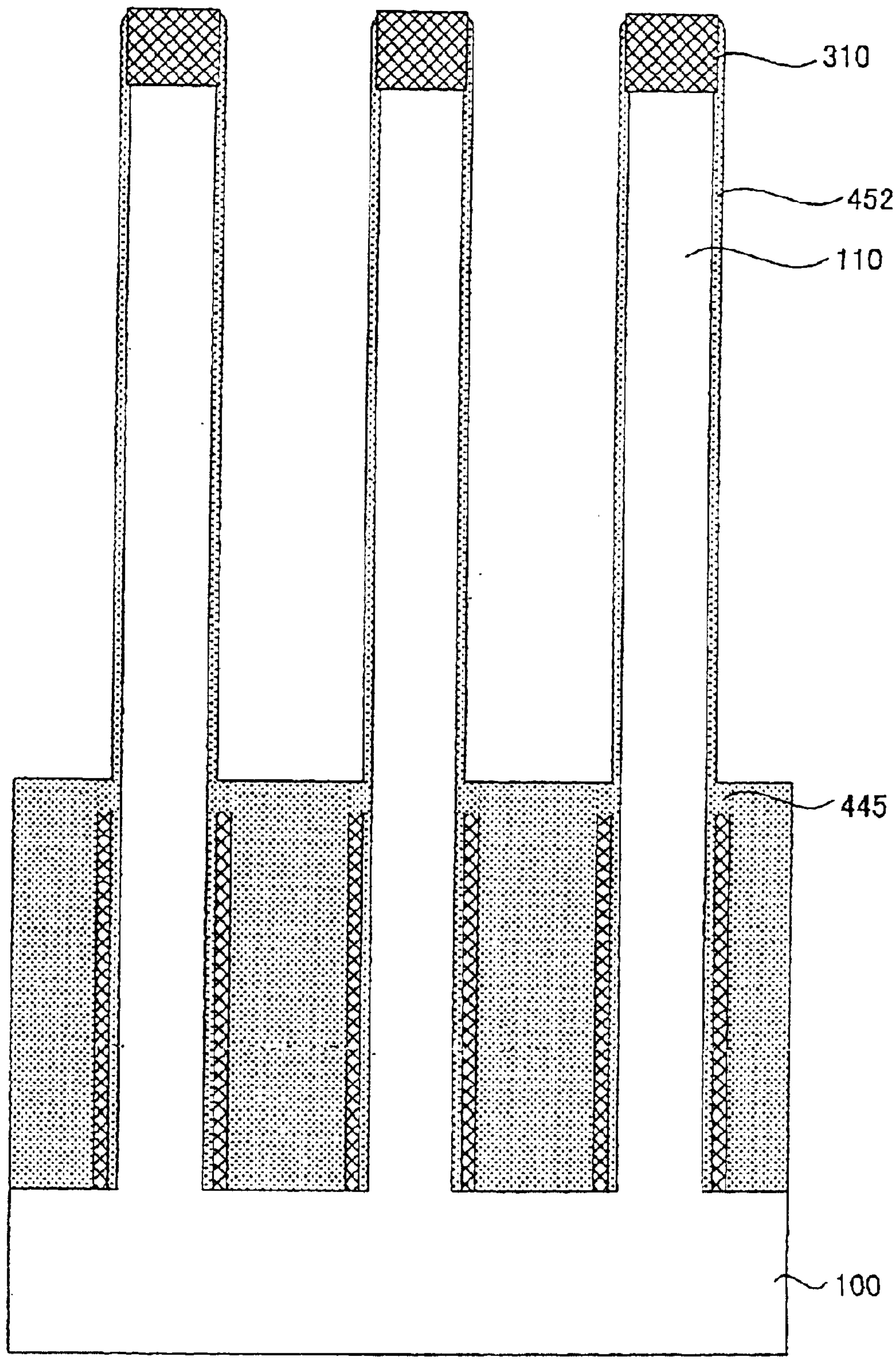
Figure 182:
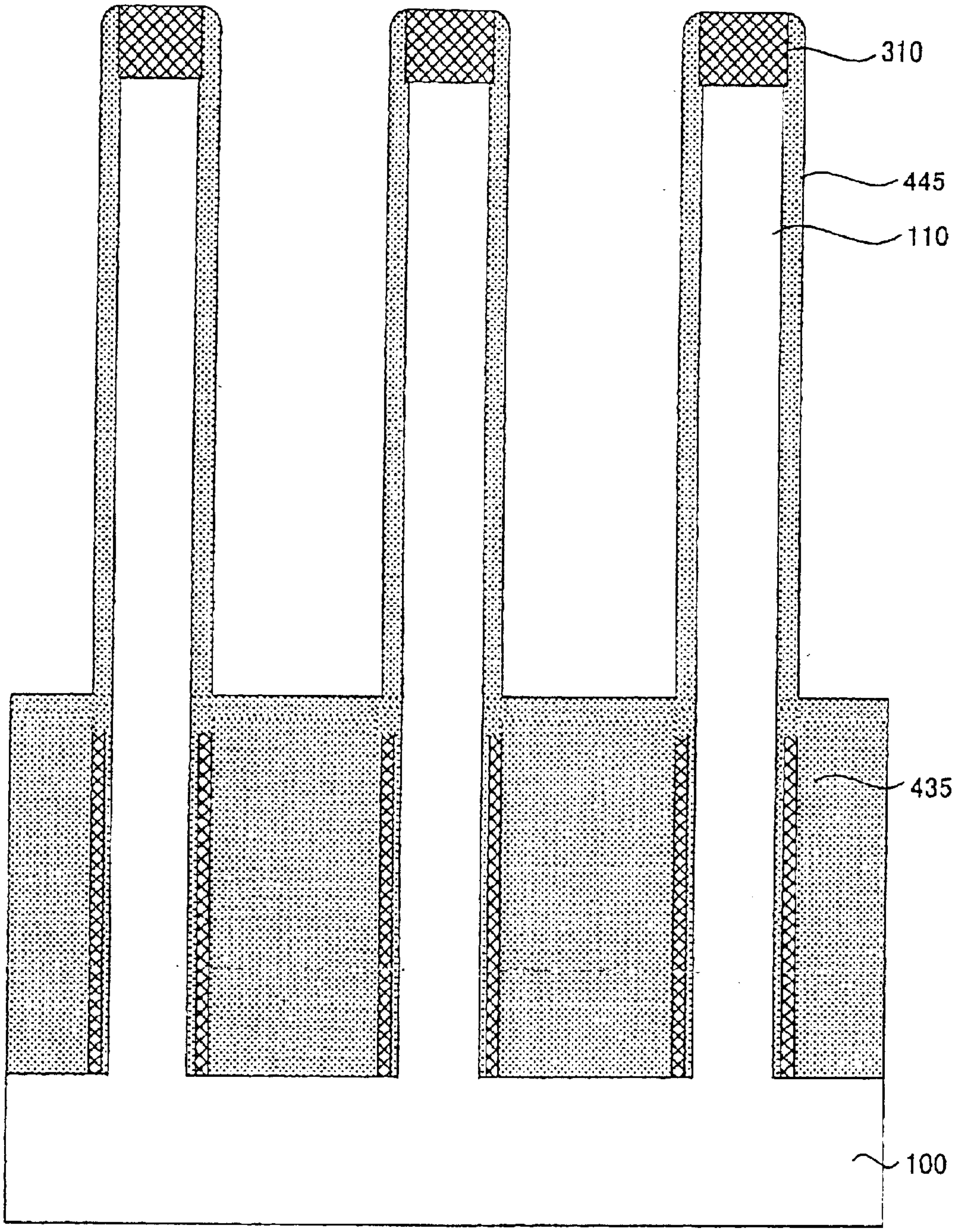
Figure 183:
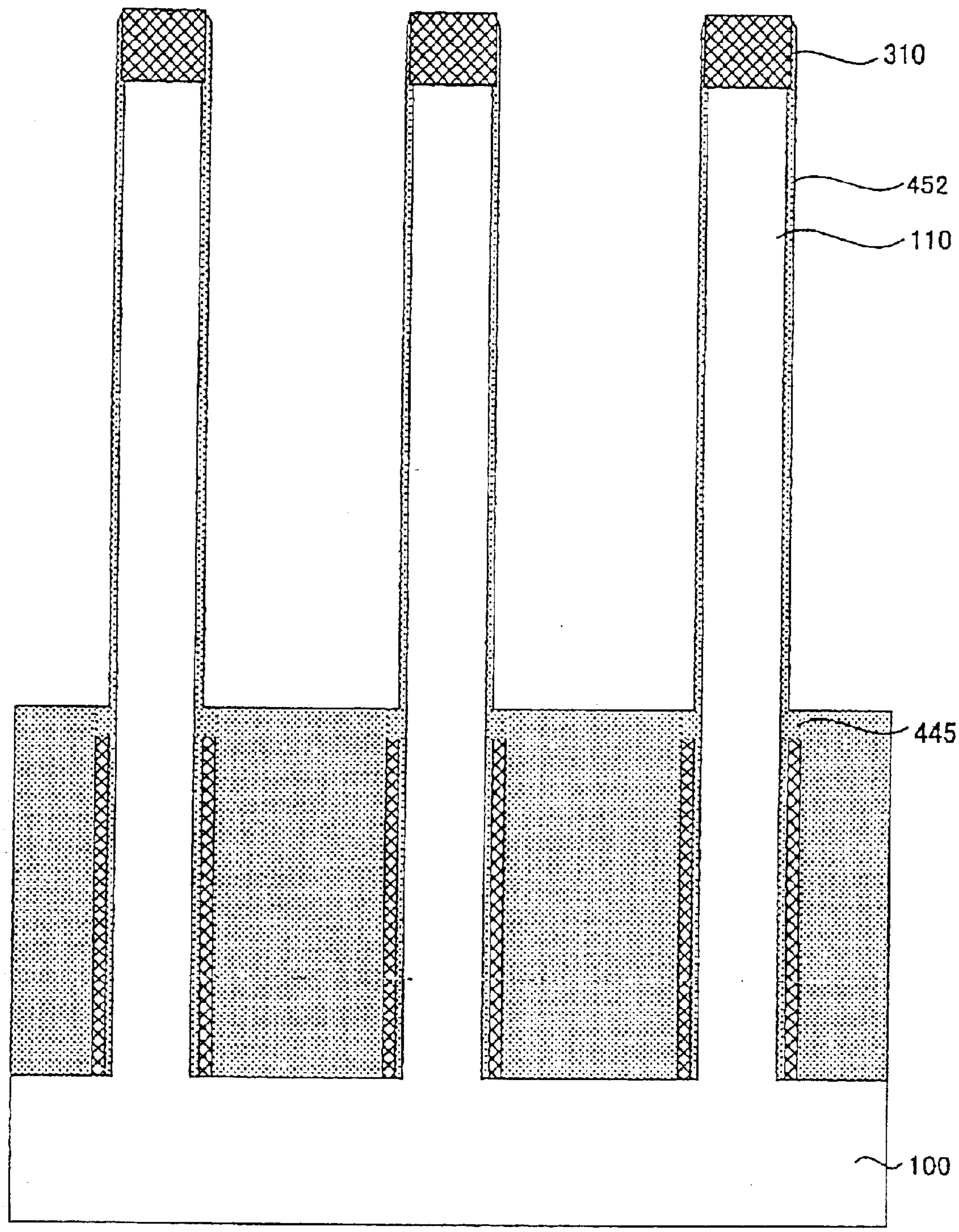

A silicon oxide film 445, for example, is deposited to 3 to 30 nm as a twenty-sixth insulating film in the recess (FIG. 171 and FIG. 182). At this time, the recess can be buried if the silicon oxide film 445 has about half the thickness of the silicon nitride film 362. Since the silicon oxide film 445 also deposits on the sidewall of the silicon oxide film 452, the silicon oxide film 445 is removed from the sidewall of the silicon oxide film 452, for example, by isotropic etching. The silicon oxide film 452 may be removed from the top surface of the silicon oxide film 435, and a film of about the same thickness may be formed. Thereby, the silicon oxide film 445 remains in the recess, and the silicon nitride film 362 is buried by the silicon oxide film 435 and the silicon oxide film 445 (FIG. 172 and FIG. 183).

Figure 173:
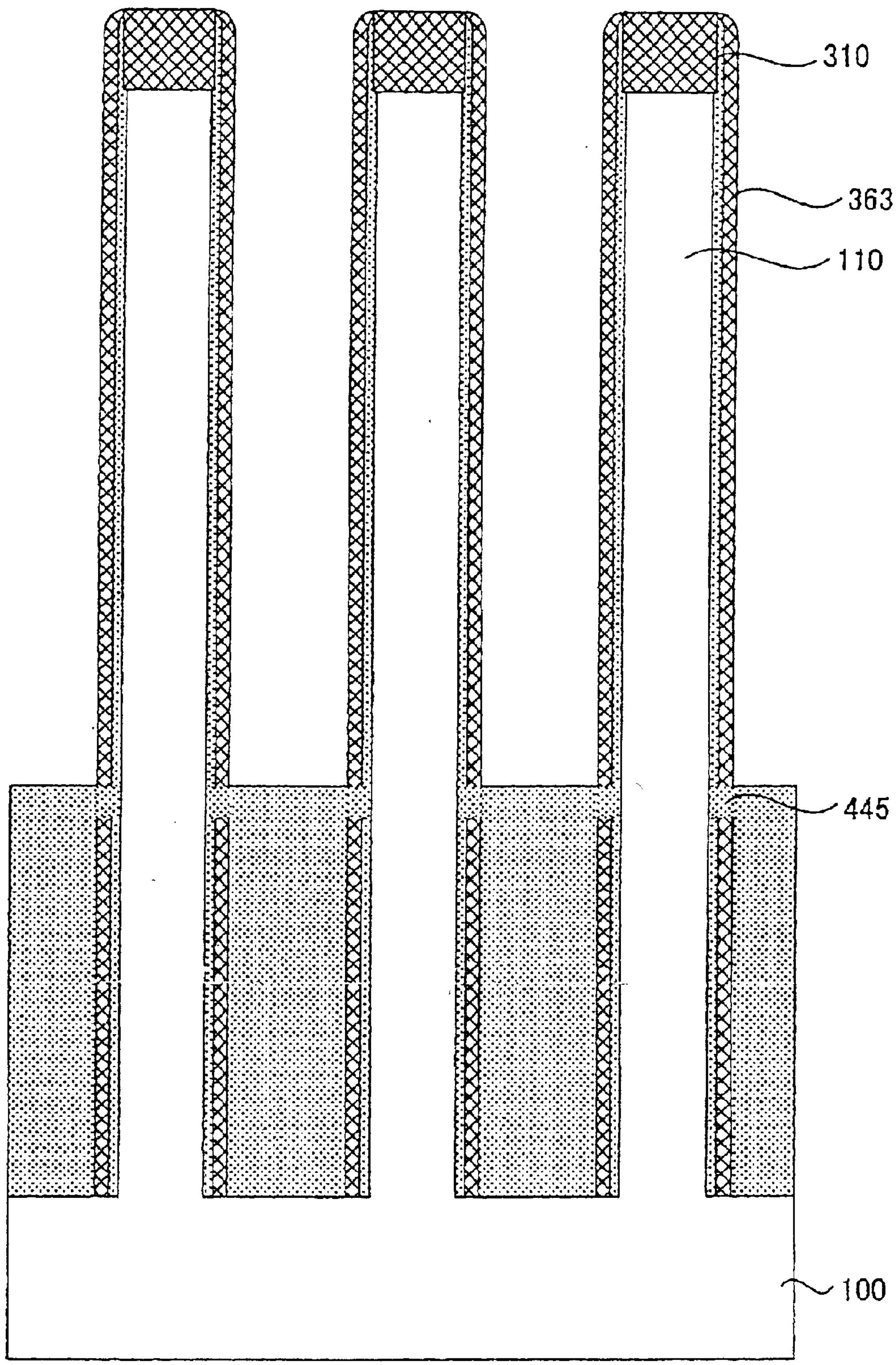
Figure 184:
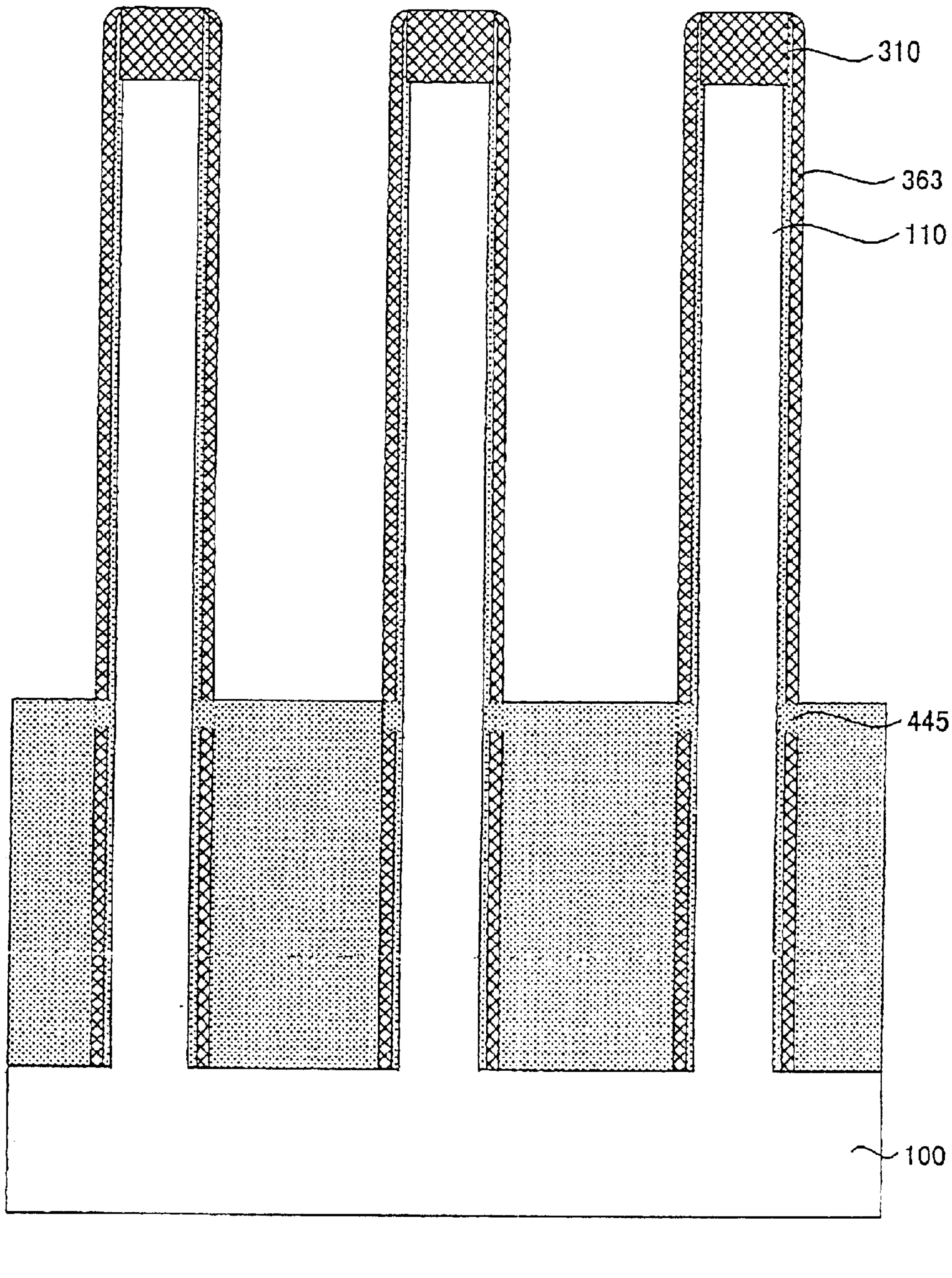

Subsequently, a silicon nitride film 363, for example, is deposited to about 5 to 50 nm as a twenty-seventh insulating film, and thereafter, is anisotropically etched to remain in the form of a sidewall on the sidewall of each island-like semiconductor layer 110 with intervention of the silicon oxide film 452 (FIG. 173 and FIG. 184).

Thereafter, a silicon oxide film 436 which is a twenty-fifth insulating film is buried in the same manner, and a silicon oxide film 446 which is a twenty-sixth insulating film is disposed on the top of the silicon nitride film 363 in the form of a sidewall spacer, in the same manner as the silicon oxide film 445 is formed.

Figure 174:
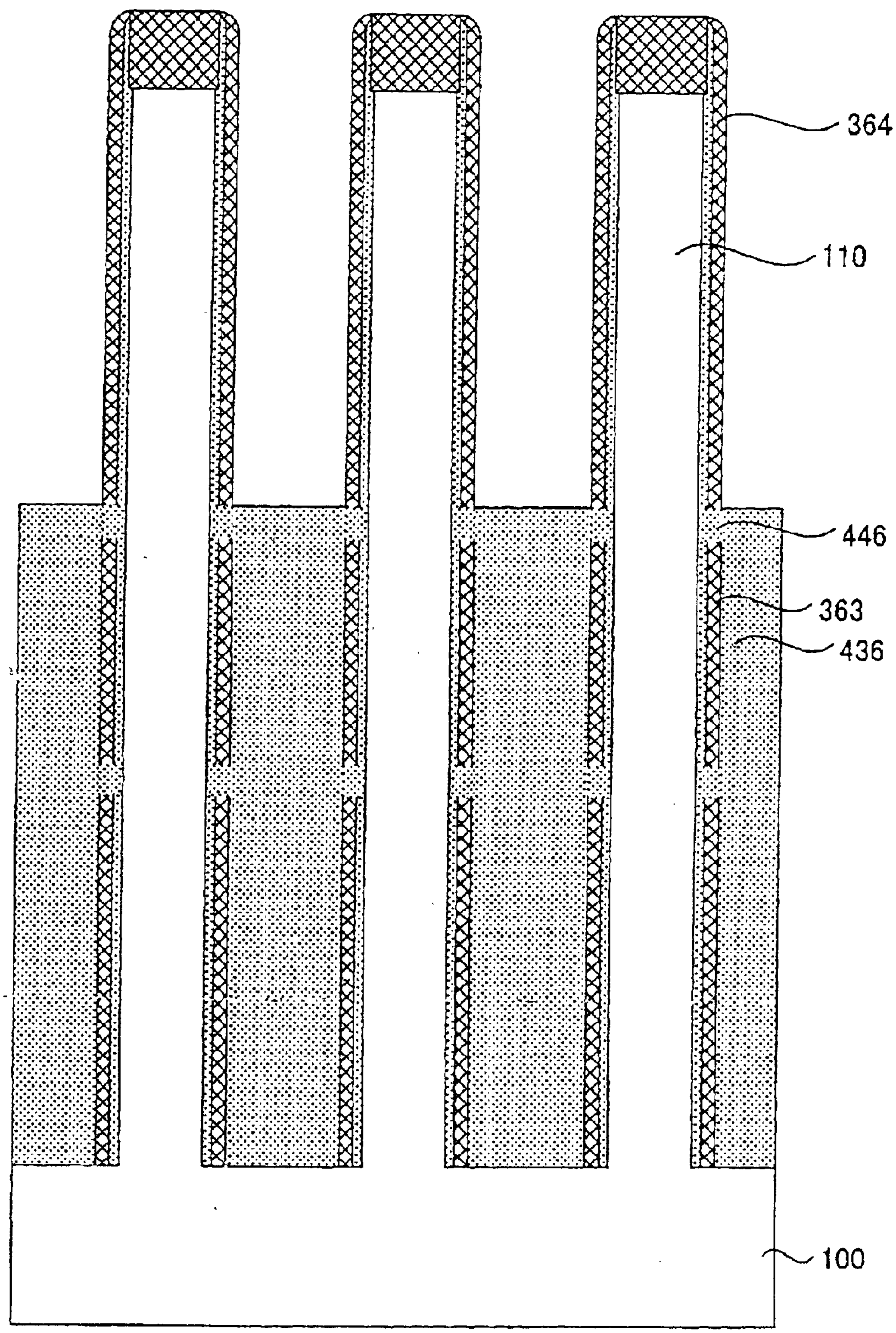
Figure 185:
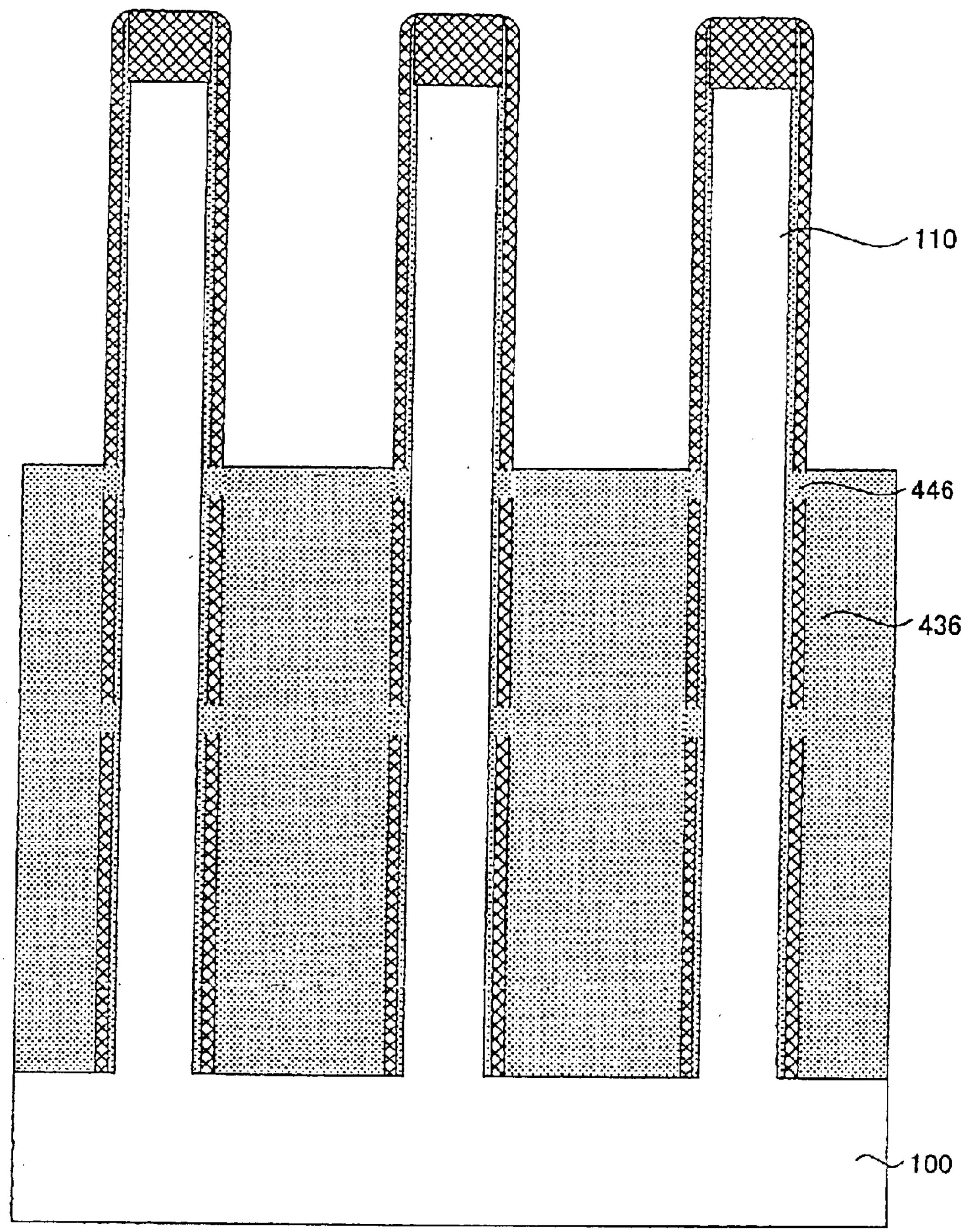

Next, a silicon nitride film 364 which is a twenty-seventh insulating film is formed in the form of a sidewall on the sidewall of the island-like semiconductor layer 110 with intervention of a silicon oxide film 452 (FIG. 174 and FIG. 185).

Figure 175:
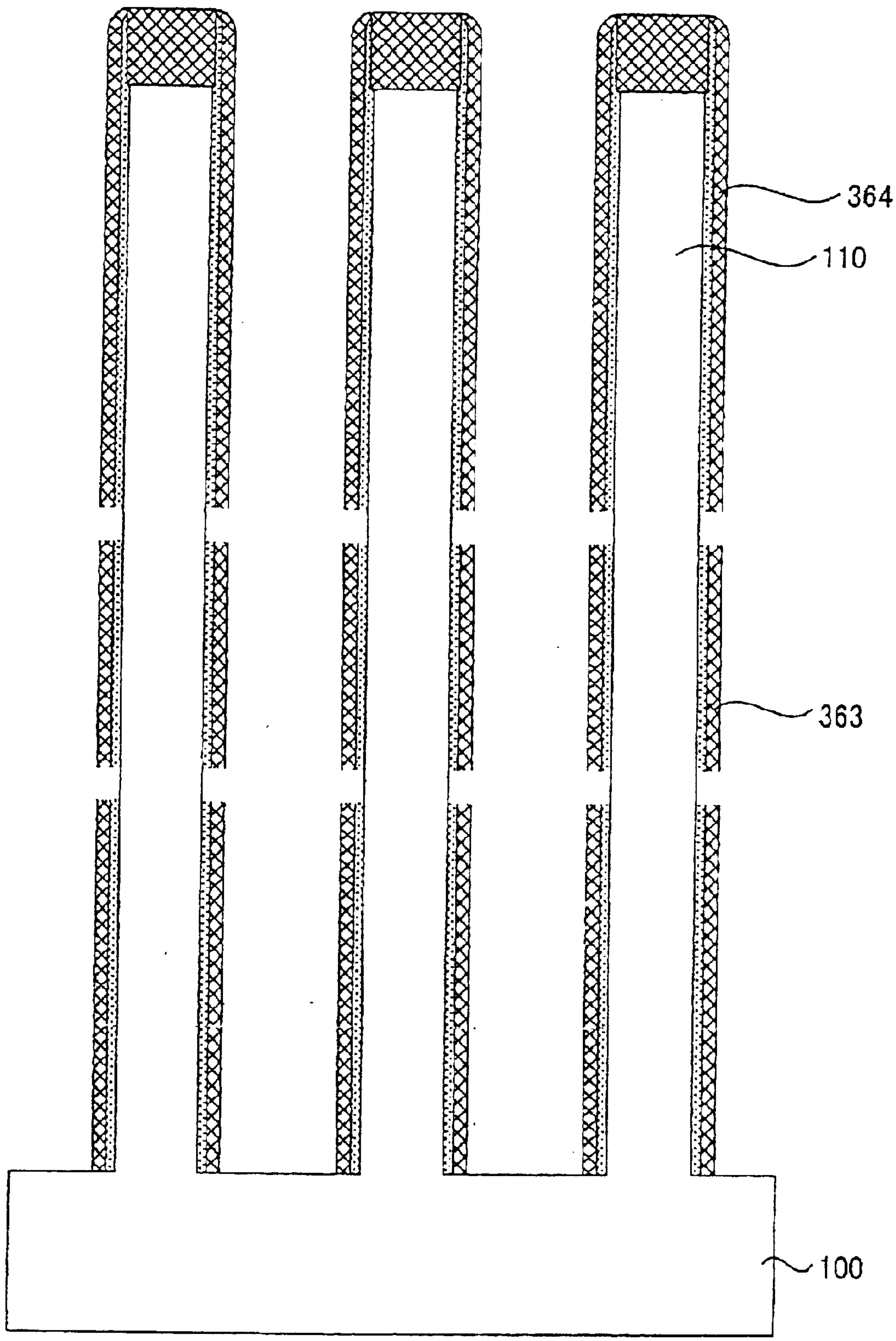
Figure 186:
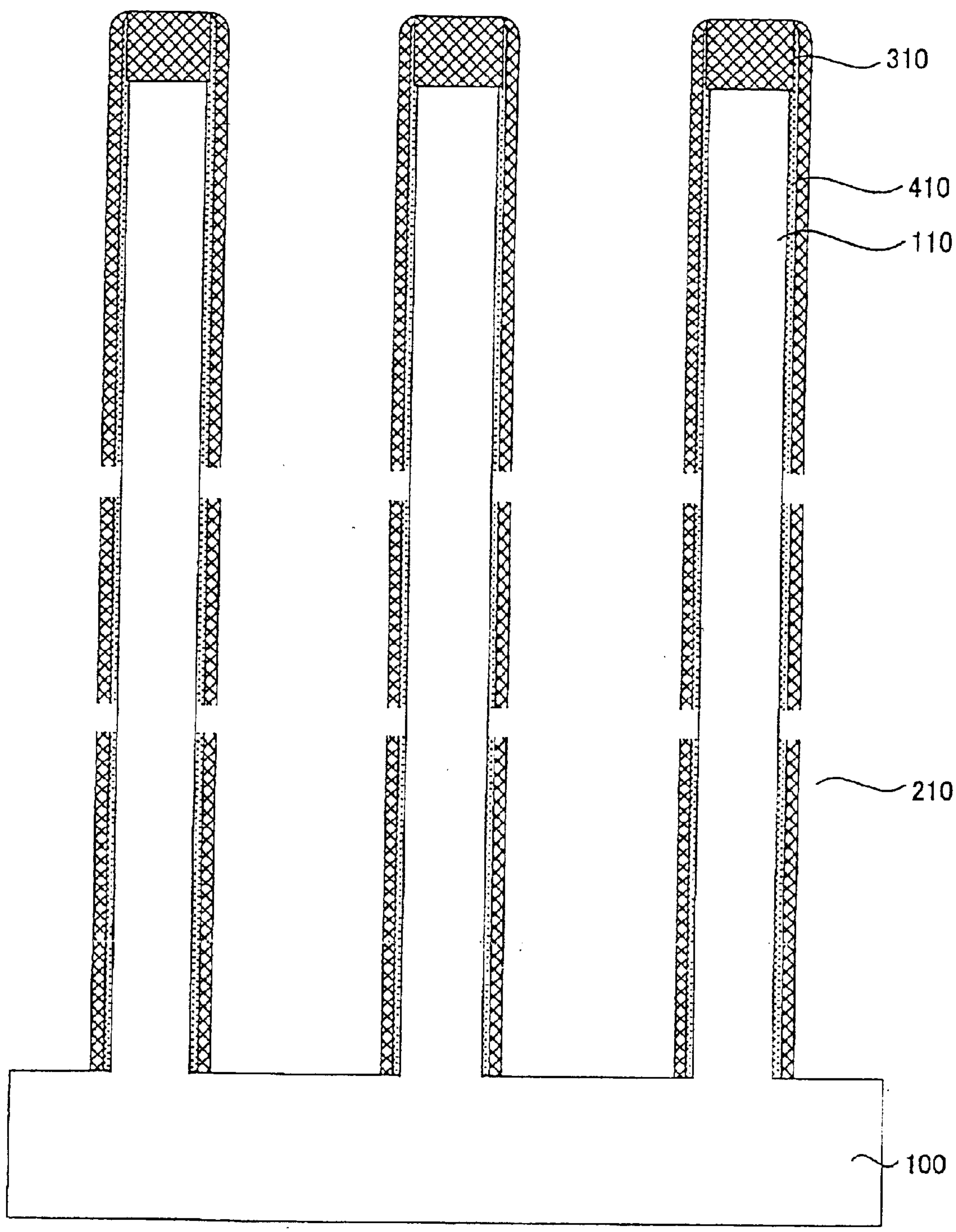

Thereafter, using the silicon oxide films 362, 363 and 364 which are twenty-seventh insulating films as a mask, the silicon oxide films 435 and 436, the silicon oxide films 445 and 446 and the silicon oxide film 452 are removed by isotropic etching (FIG. 175 and FIG. 186).

Figure 176:
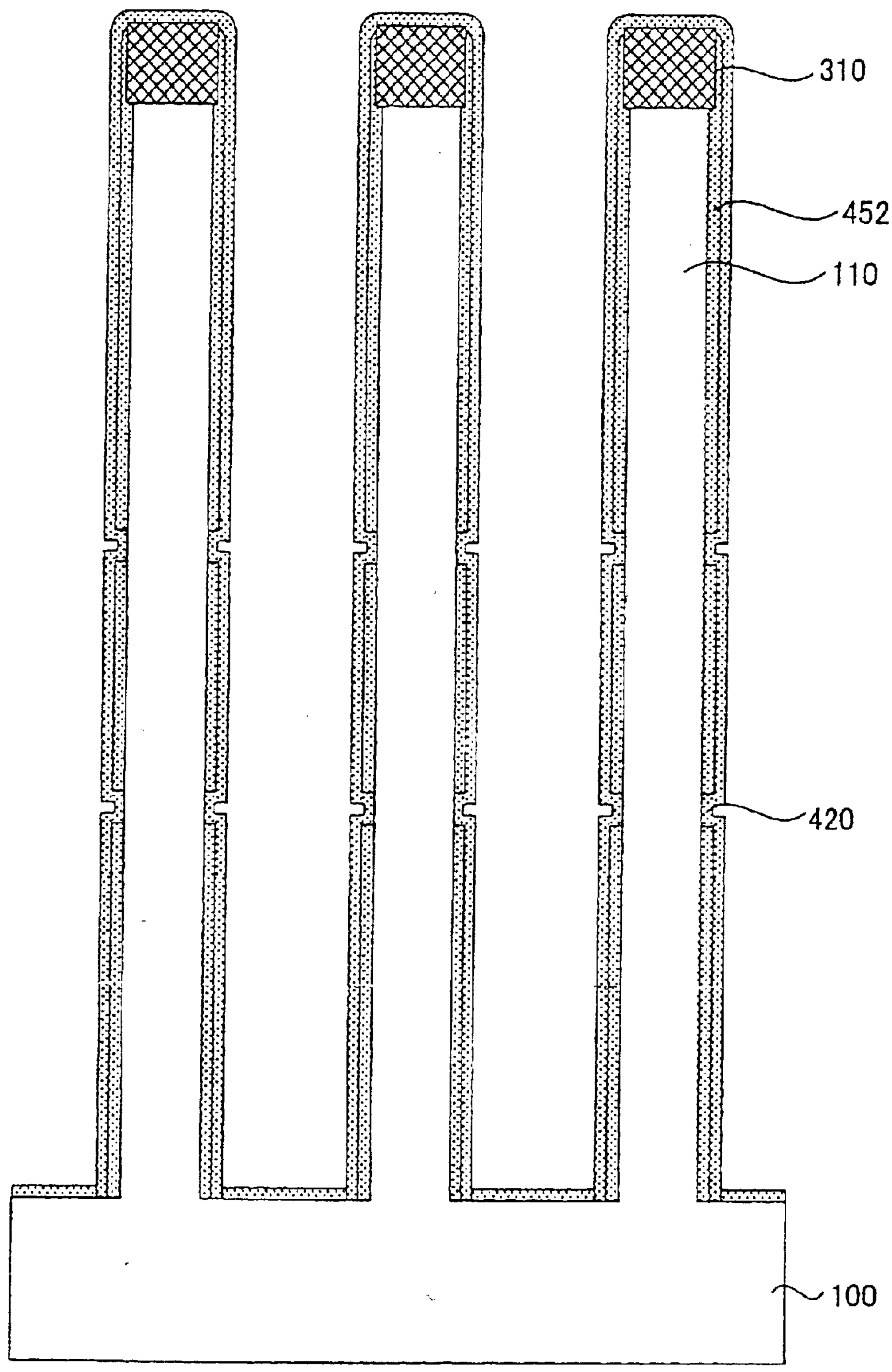
Figure 187:
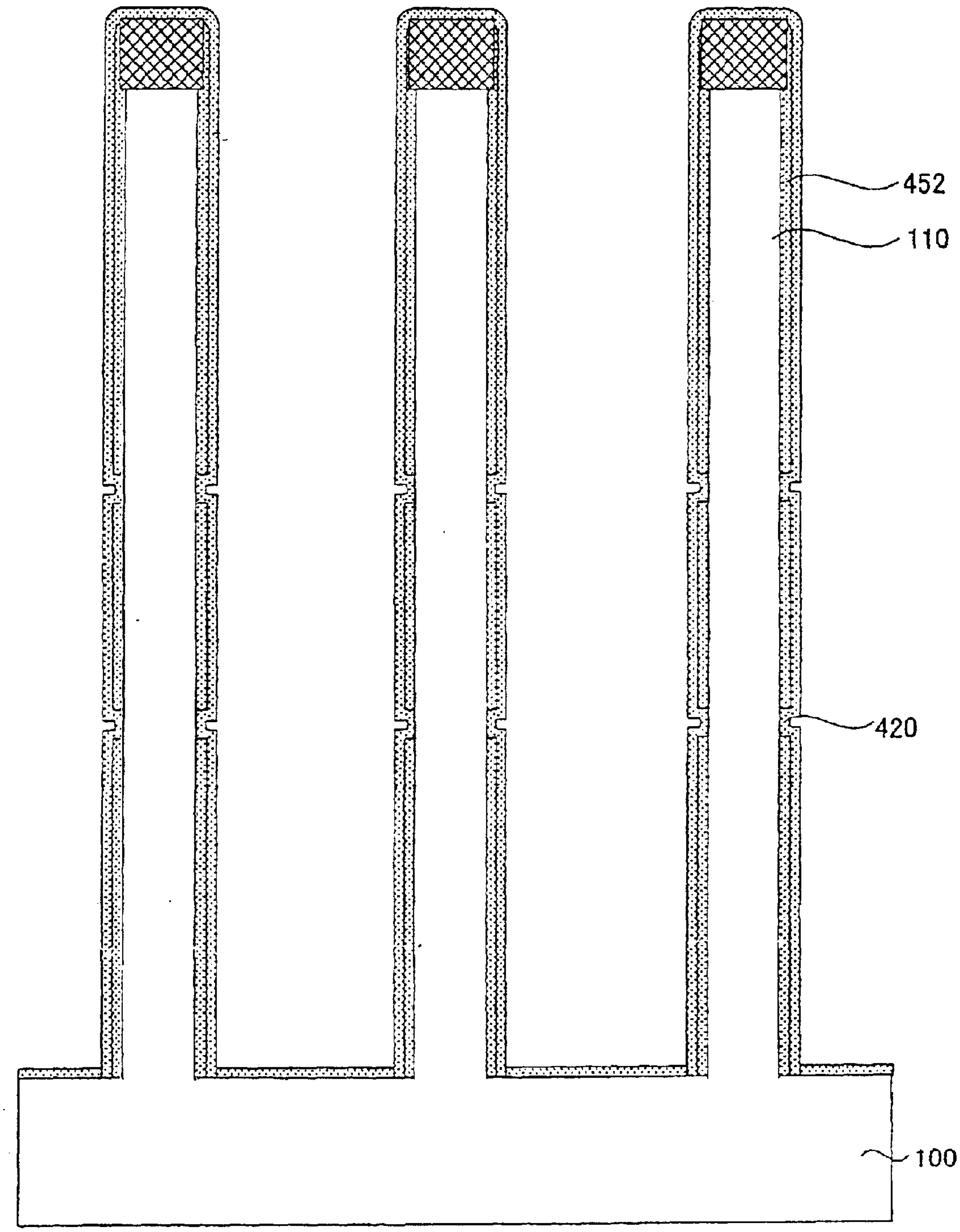

Subsequently, the silicon nitride films 362, 363 and 364 are removed by isotropic etching. A silicon oxide film 420, for example, is formed as a third insulating film to be a tunnel oxide film of about 10 nm thickness on the periphery of each island-like semiconductor layer 110, for example, using a CVD technique (FIG. 176 and FIG. 187). At this time, the tunnel oxide film is not limited to a CVD oxide film but may be a thermal oxide film or a nitrogen oxide film. The thickness of the silicon oxide film 452 increases as the silicon oxide film 420 is formed, and the silicon oxide film 452 is always thicker than the silicon oxide film 420.

Figure 177:
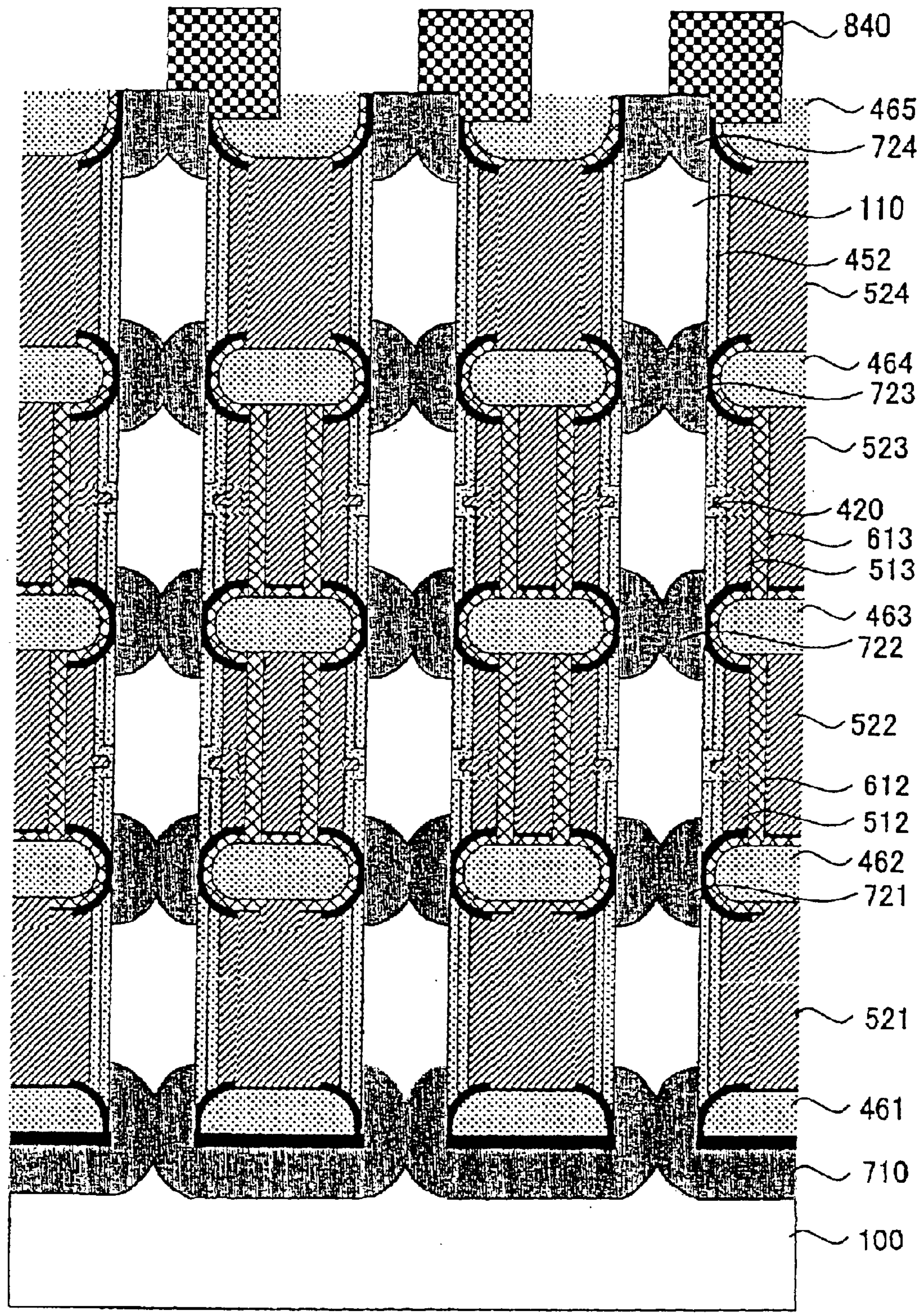
Figure 178:
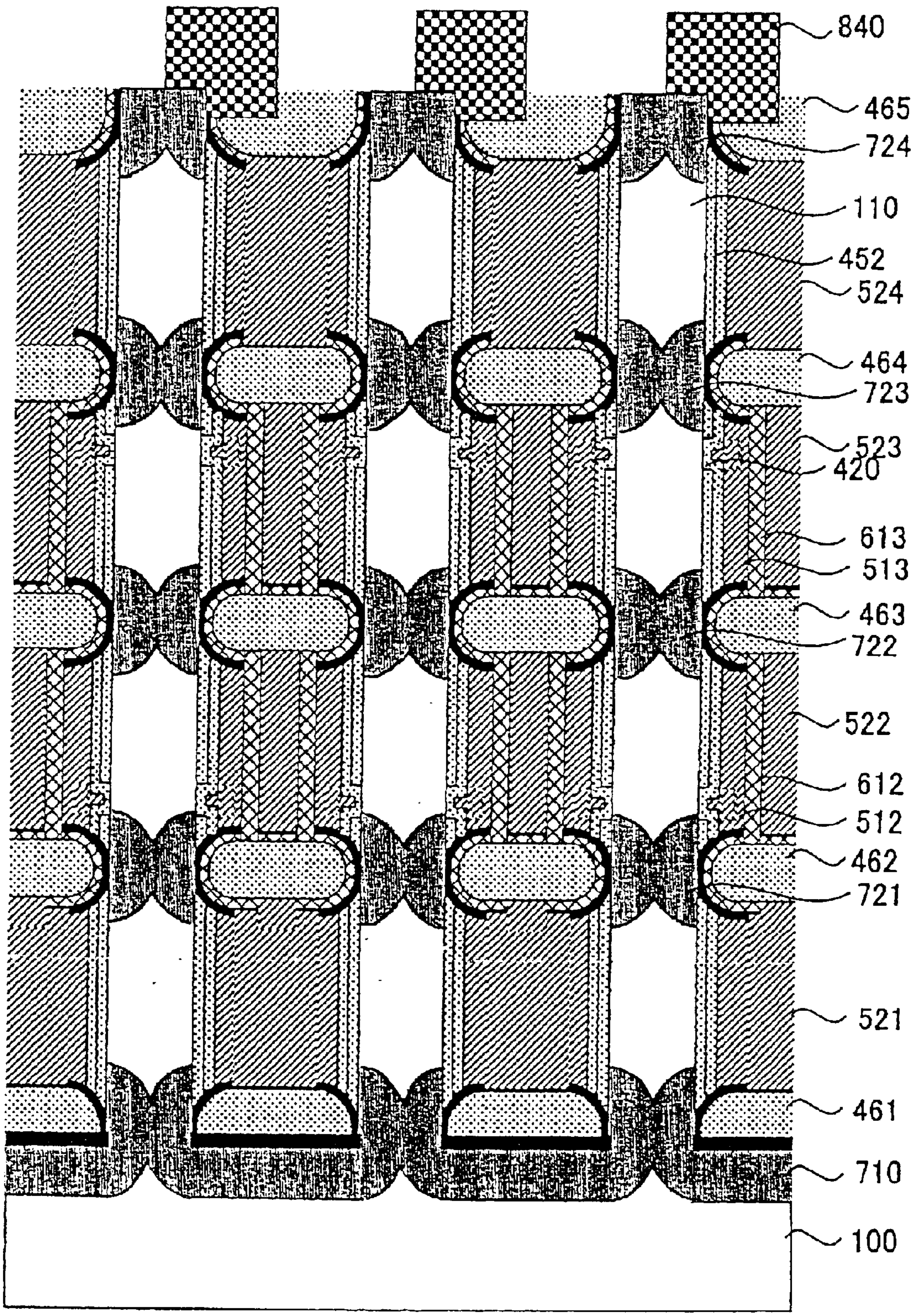
Figure 179:
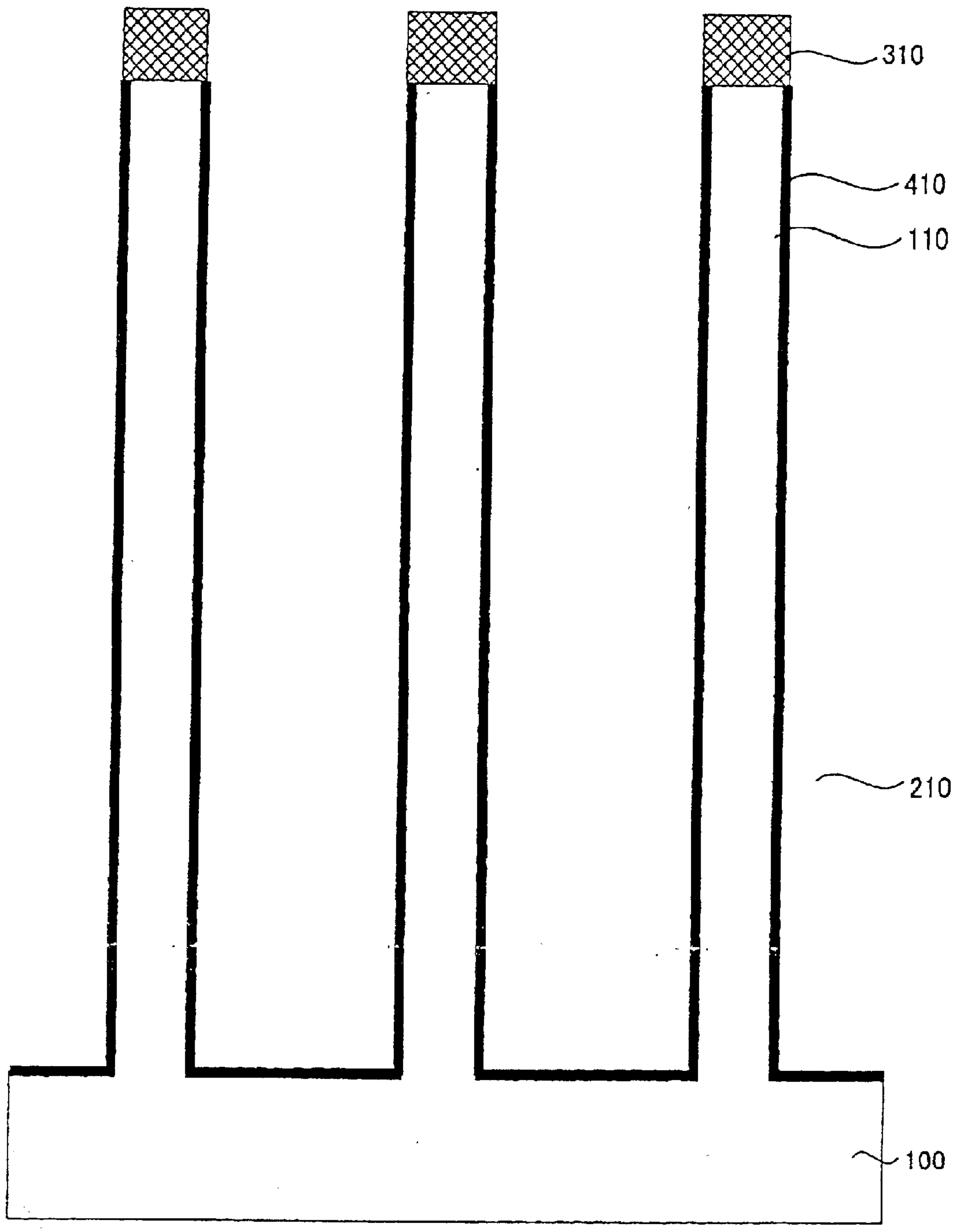
Figure 188:
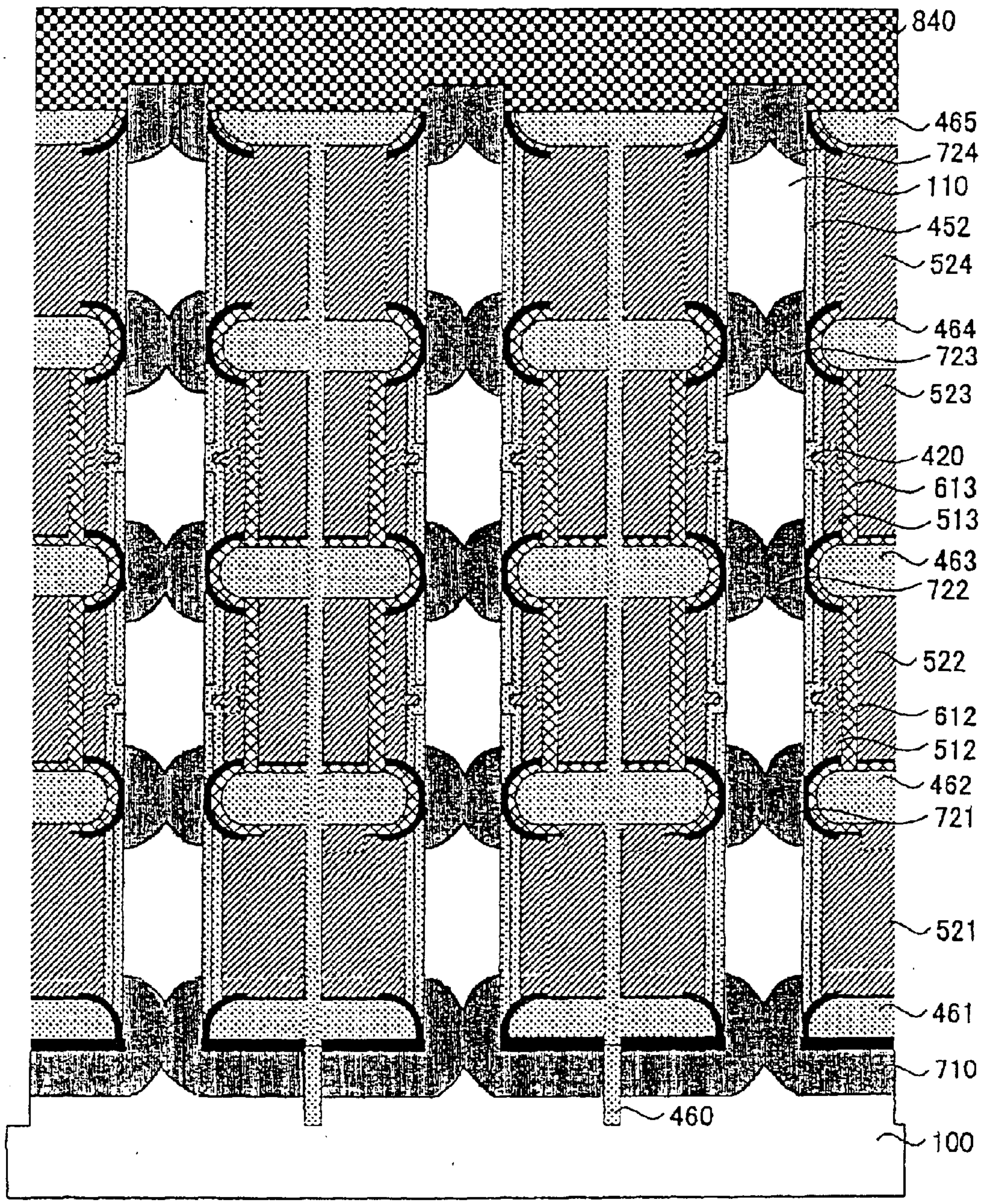
Figure 189:
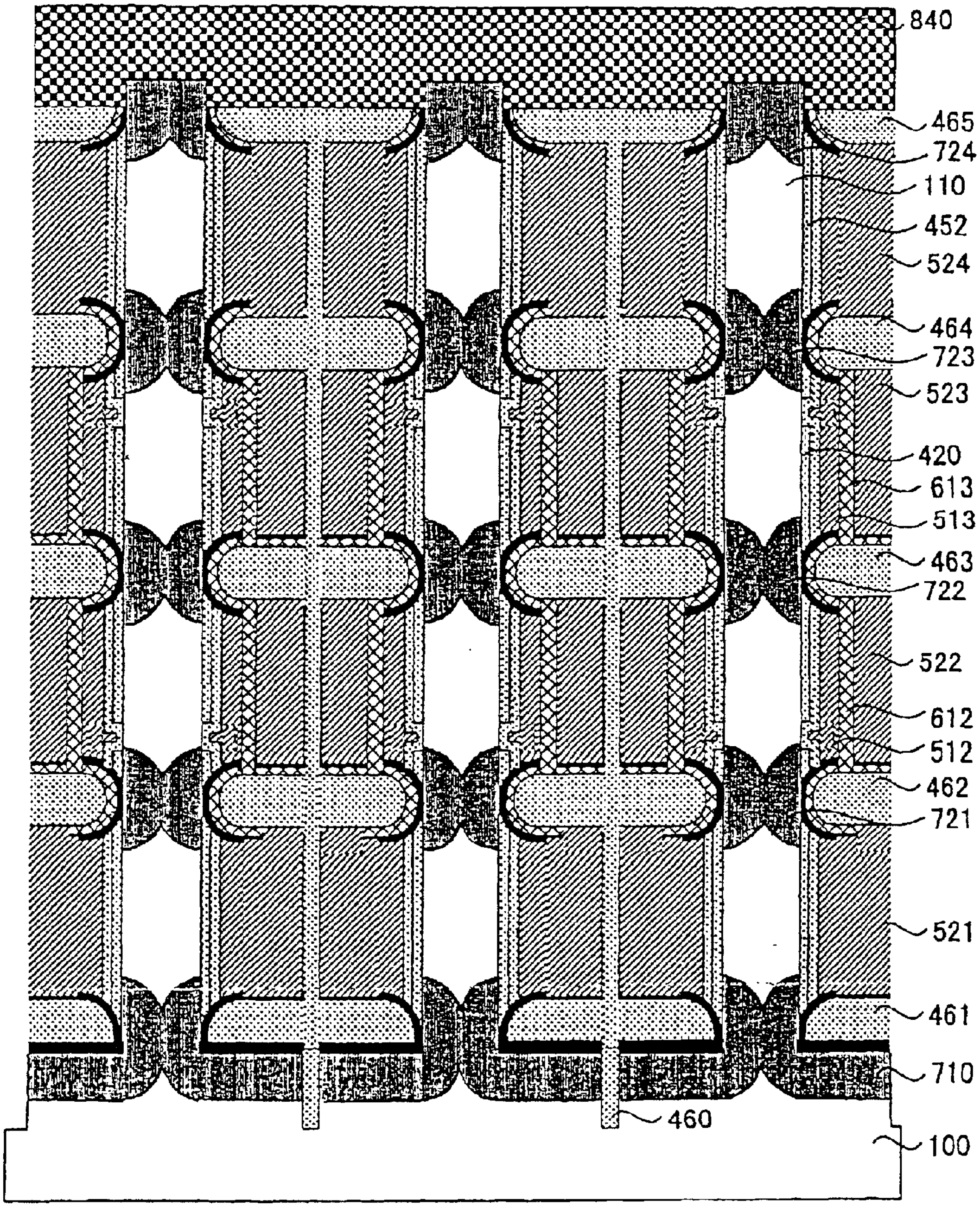
Figure 190:
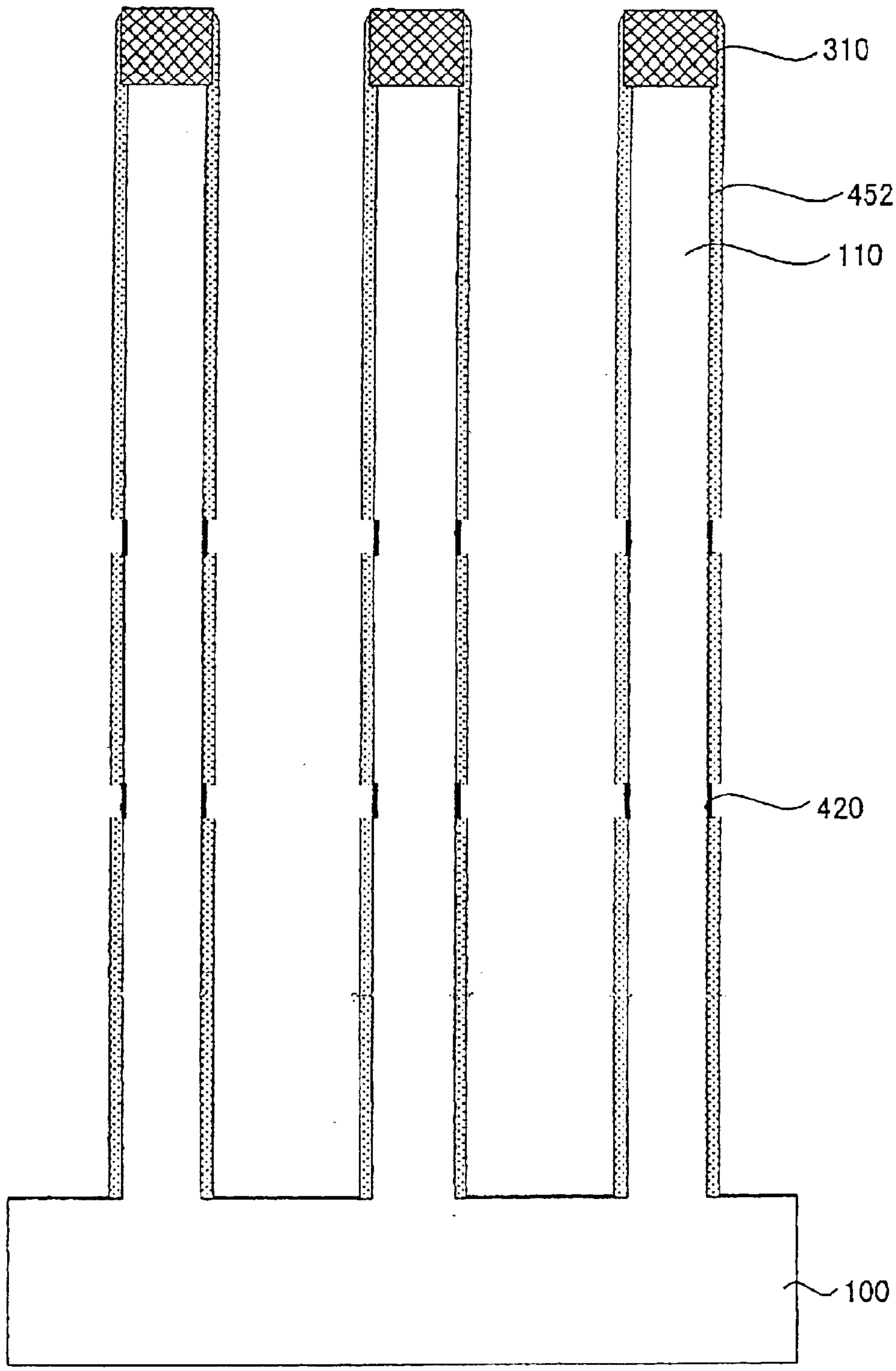
Figure 191:
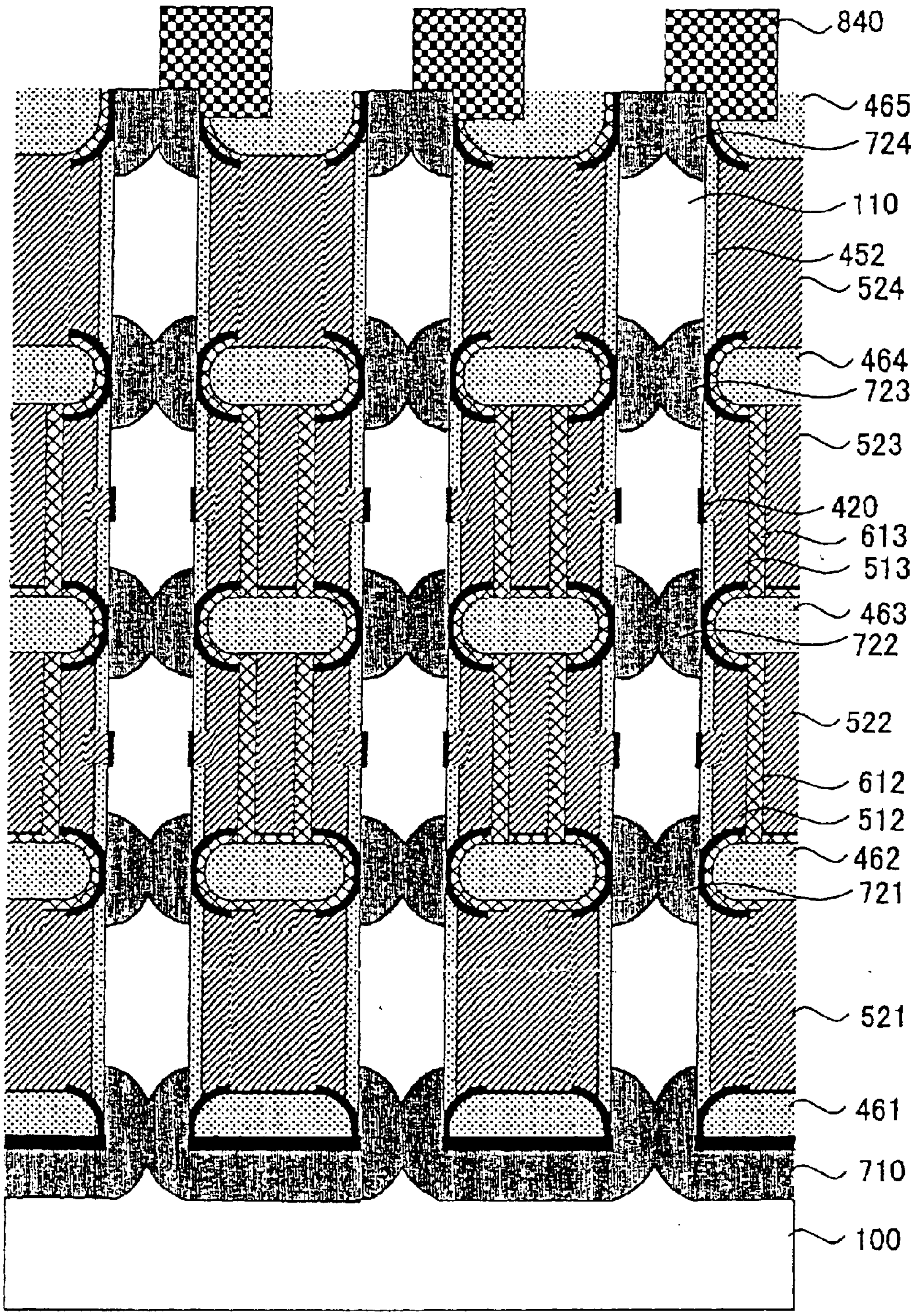
Figure 192:
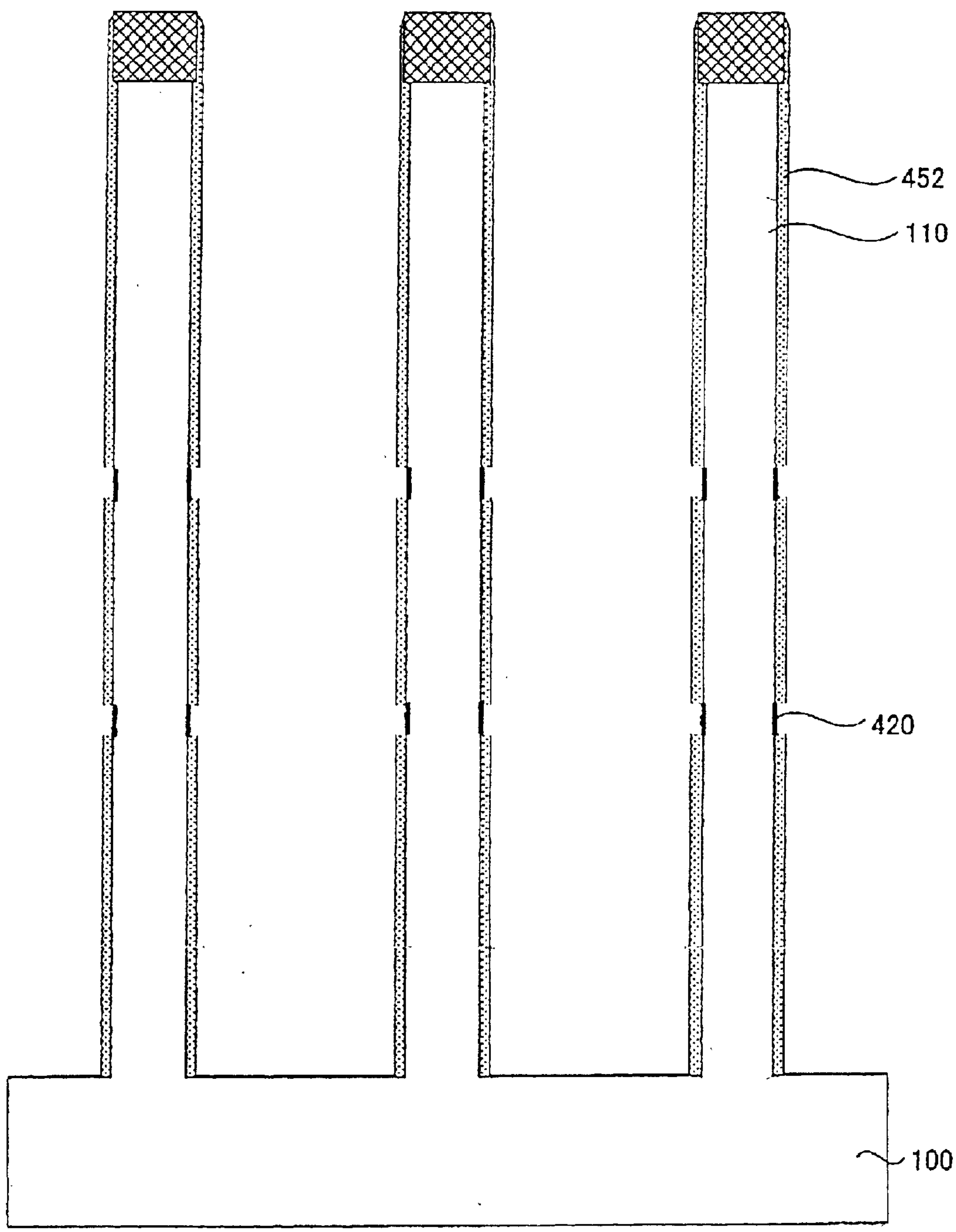
Figure 193:
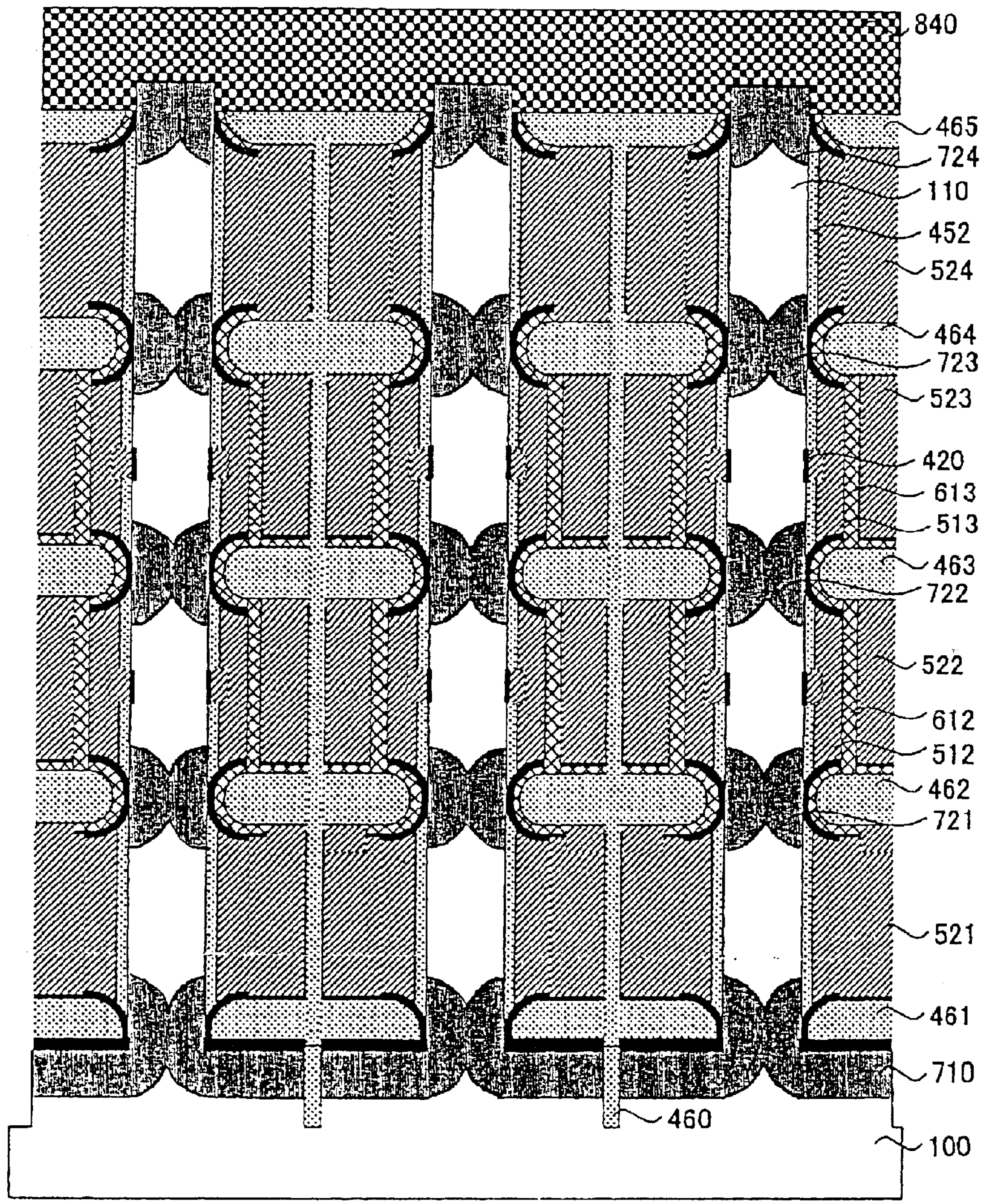

Thereafter, production steps are in accordance with those of Production Example 1 after a polysilicon film 510, for example, is deposited to about 50 nm to 200 nm as a first conductive film (FIG. 177 and FIG. 188). It is sufficient that the silicon oxide film 420 which is the third insulating film to be a tunnel oxide film is formed between the desired first conductive film and island-like semiconductor layer 110. For example, the silicon oxide film 420 may be unevenly distributed on the top or at the bottom of the polysilicon film or may be partially overlapped with the impurity diffusion layer. An example of distribution of the silicon oxide film is shown in FIG. 178 and FIG. 189.

Also, an example is shown in which the silicon oxide film 420 is formed by thermal oxidation (FIGS. 190 to 191 and FIGS. 192 to 193).

Further, when the silicon oxide film 420 is formed by thermal oxidation or the like, the formed oxidized film may have or may not have isotropy, as in the above-described Example 1.

By the above-described production method, the semiconductor memory device is produced to have memory cells with a plurality of tunnel oxide films and floating gates as charge storage layers on the sidewalls of the island-like semiconductor layers 110. In the semiconductor memory device, the island-like semiconductor layers are in electrically floated state with respect to the semiconductor substrate and the active region of each of the memory cells is in electrically floated state. The selection gates are disposed on the top and at the bottom of the island-like semiconductor layers. The area of the tunnel oxide film between the floating gate of the memory cell and the island-like semiconductor layer is smaller than the area of the floating gate contacting the island-like semiconductor layer. It is possible to simultaneously form the selection gates and floating gates of the respective transistors.

PRODUCTION EXAMPLE 5

With regard to Production Example 1, this example is particularly shown for forming the tunnel oxide film partially on the periphery of the island-like semiconductor layer 110 in the pillar form.

FIGS. 194 to 195 and FIGS. 196 to 197 are sectional views taken on line A-A' and line B-B', respectively, in FIG. 1 illustrating a memory cell array of EEPROM.

In this example, production steps are the same as those in Production Example 1 until the silicon oxide films 435 and 436 as the twenty-fifth insulating films, the silicon oxide films 445 and 446 as the twenty-sixth insulating films and the silicon oxide film 452 as the twenty-eighth insulating film are remove by isotropic etching using as a mask the silicon nitride films 362, 363 and 364 as the twenty-seventh insulating films.

Figure 194:
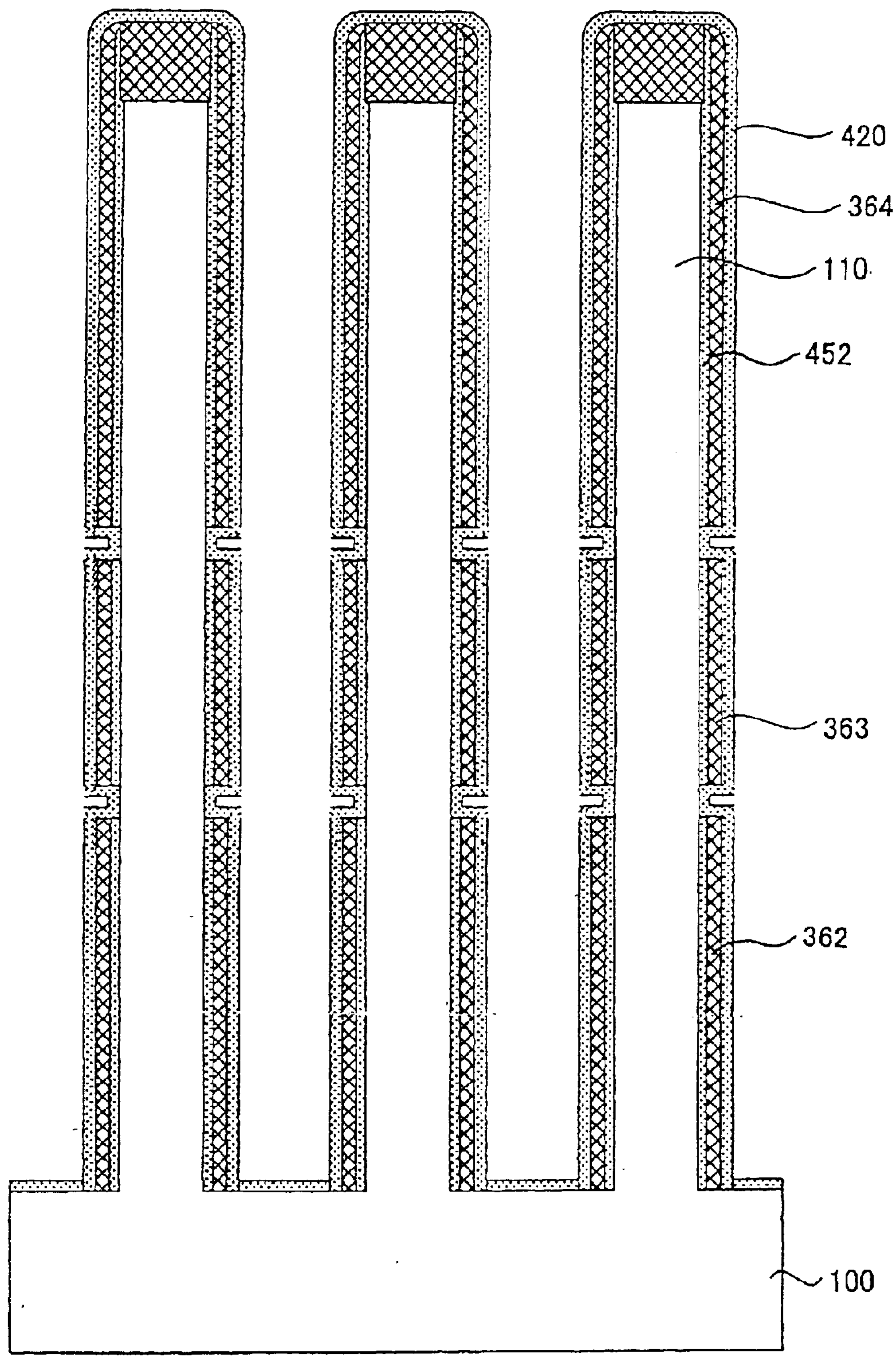
Figure 196:
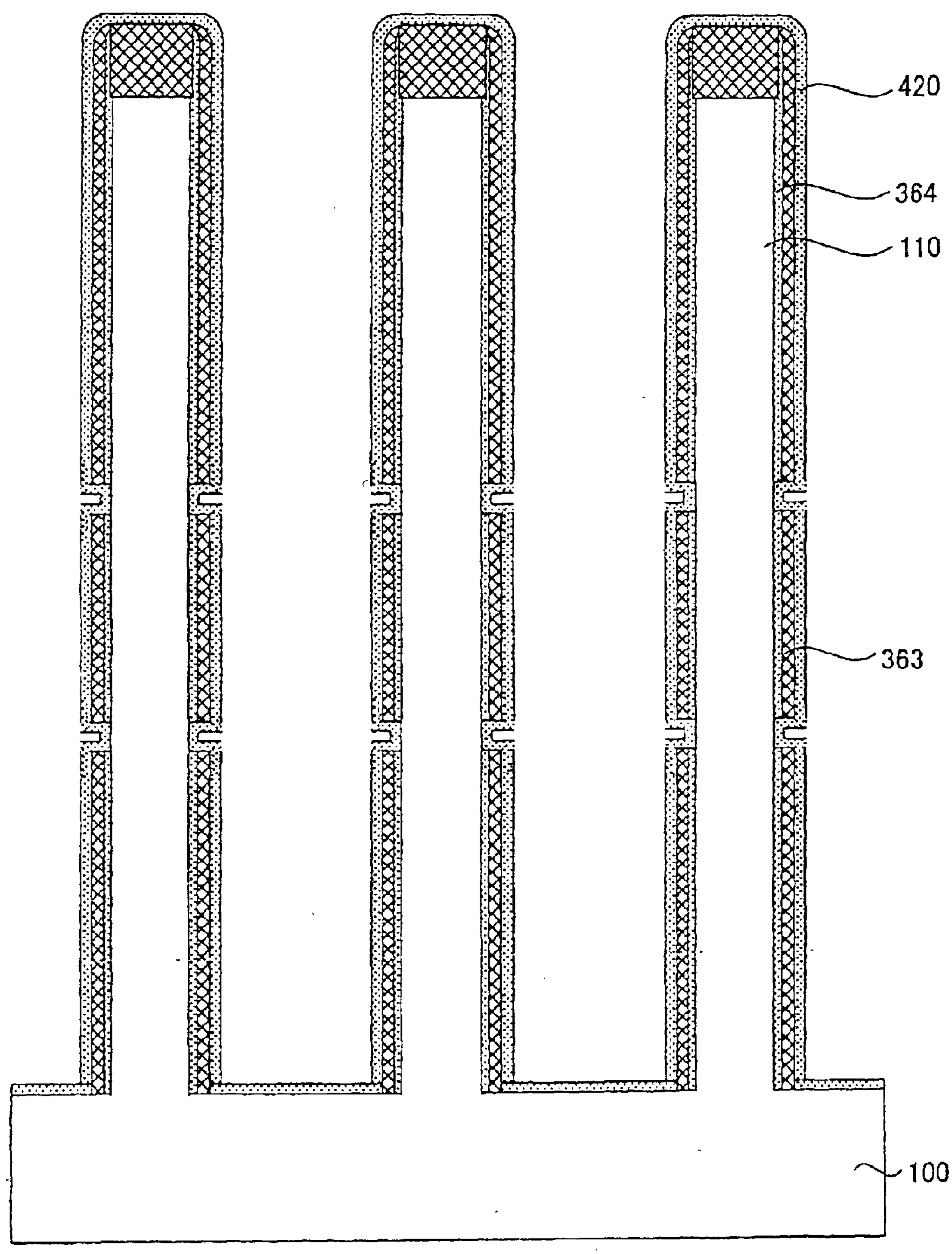

Subsequently, a silicon oxide film 420, for example, is formed as a third insulating film to be a tunnel oxide film of about 10 nm thickness on the periphery of each island-like semiconductor layer 110, for example, using a CVD technique (FIG. 194 and FIG. 196). At this time, the tunnel oxide film is not limited to a CVD film but may be a thermal oxide film or a nitrogen oxide film.

Figure 195:
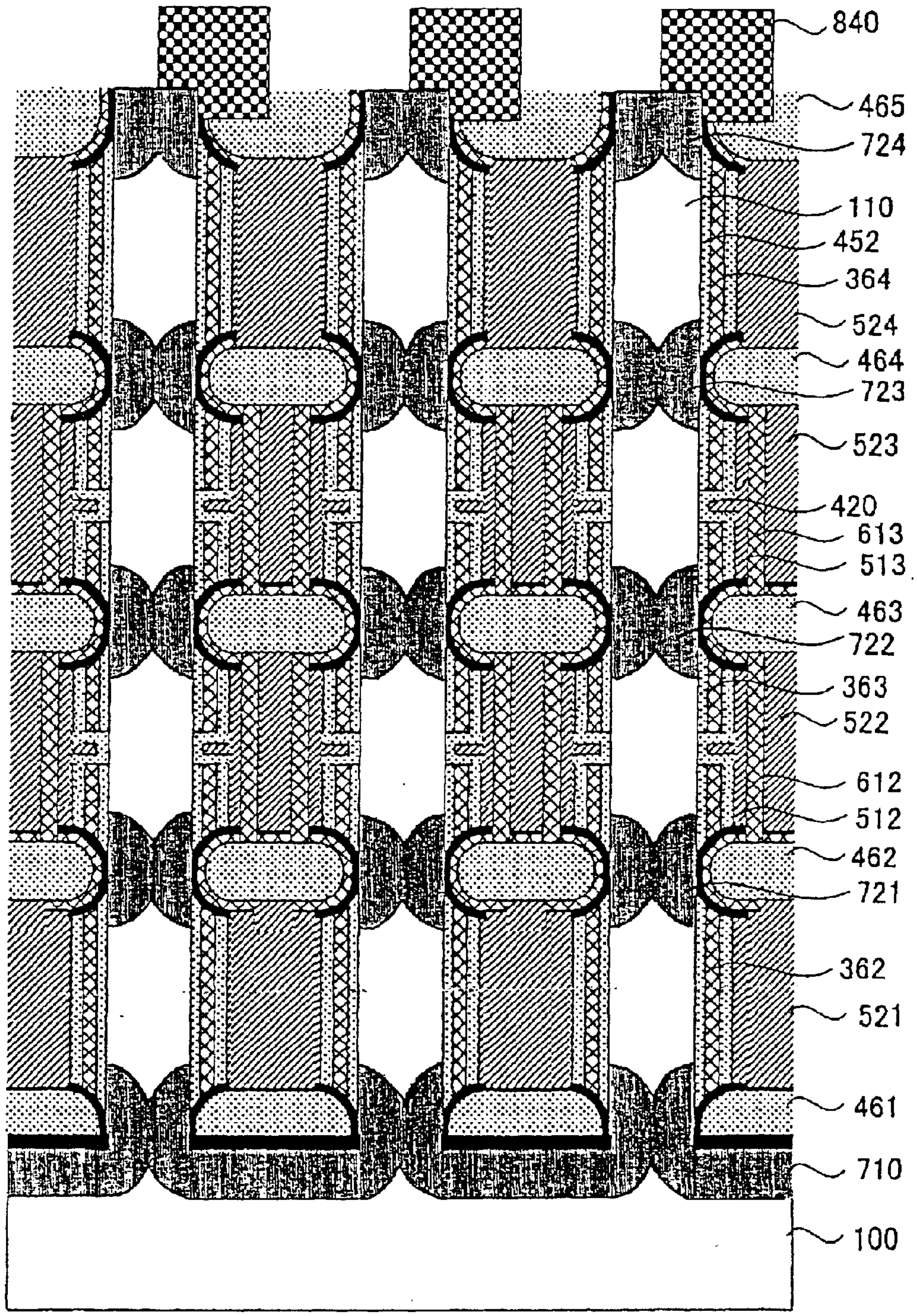
Figure 197:
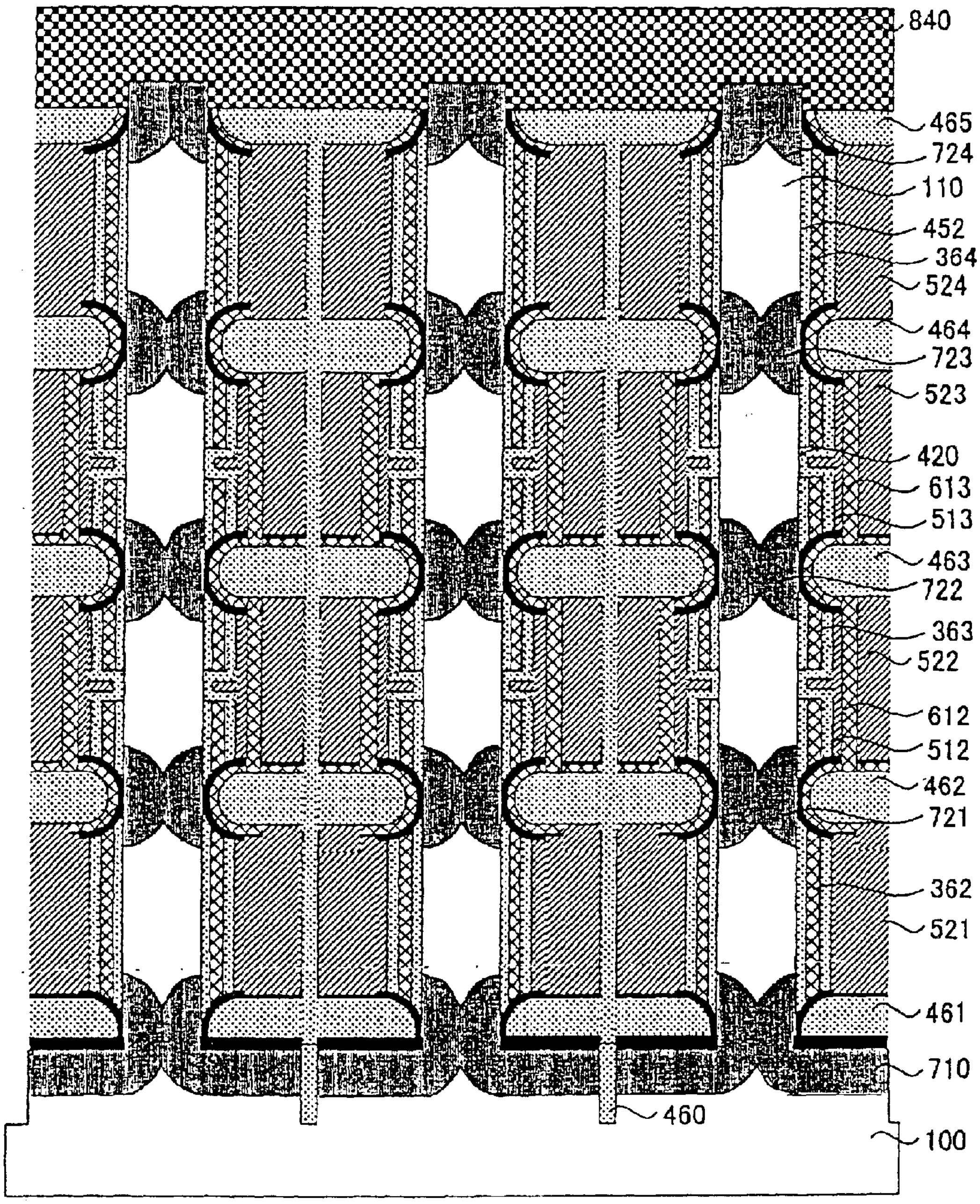

Thereafter, production steps are in accordance with those of Production Example 1 after a polysilicon film 510, for example, is deposited to about 50 nm to 200 nm as a first conductive film (FIG. 195 and FIG. 197).

It is sufficient that the silicon oxide film 420 which is the third insulating film to be a tunnel oxide film between the silicon nitride films 362 and 363 and between the silicon nitride films 363 and 364 is formed between the desired first conductive film and island-like semiconductor layer 110. For example, the silicon oxide film 420 may be unevenly distributed on the top or at the bottom of the polysilicon film or may be partially overlapped with the impurity diffusion layer.

Where the silicon nitride films 362, 363 and 364 remain when the silicon oxide film 420 is formed, the insulating film intervening between the selection gates and floating gates and the island-like semiconductor layers 110 is of MONOS structure by the silicon oxide film 452, the silicon nitride films 362, 363 and 364 and the silicon oxide film 420. However, it is possible to prevent tunnel current to the silicon nitride film of the MONOS structure by controlling the thickness of the selection gates, the floating gates, the island-like semiconductor layers 110, and the silicon oxide film 452.

Further, when the silicon oxide film 420 is formed by thermal oxidation or the like, the formed oxidized film may have or may not have isotropy, as in the above-described Example 1.

By the above-described production method, it is possible to simultaneously form the selection gates and the floating gates of the respective transistors of the semiconductor memory device in which the selection gates are formed on the top and at the bottom of the island-like semiconductor layers and the area of the tunnel oxide films between-the floating gates of the memory cells and the island-like semiconductor layers is smaller than the area of the floating gates contacting the island-like semiconductor layers.

PRODUCTION EXAMPLE 6

With regard to Production Example 1, this example is particularly shown for forming the tunnel oxide film partially on the periphery of the island-like semiconductor layer 110 in the pillar form.

FIGS. 198 to 209 and FIGS. 210 to 221 are sectional views taken on line A-A' and line B-B', respectively, in FIG. 1 illustrating a memory cell array of EEPROM.

Figure 198:
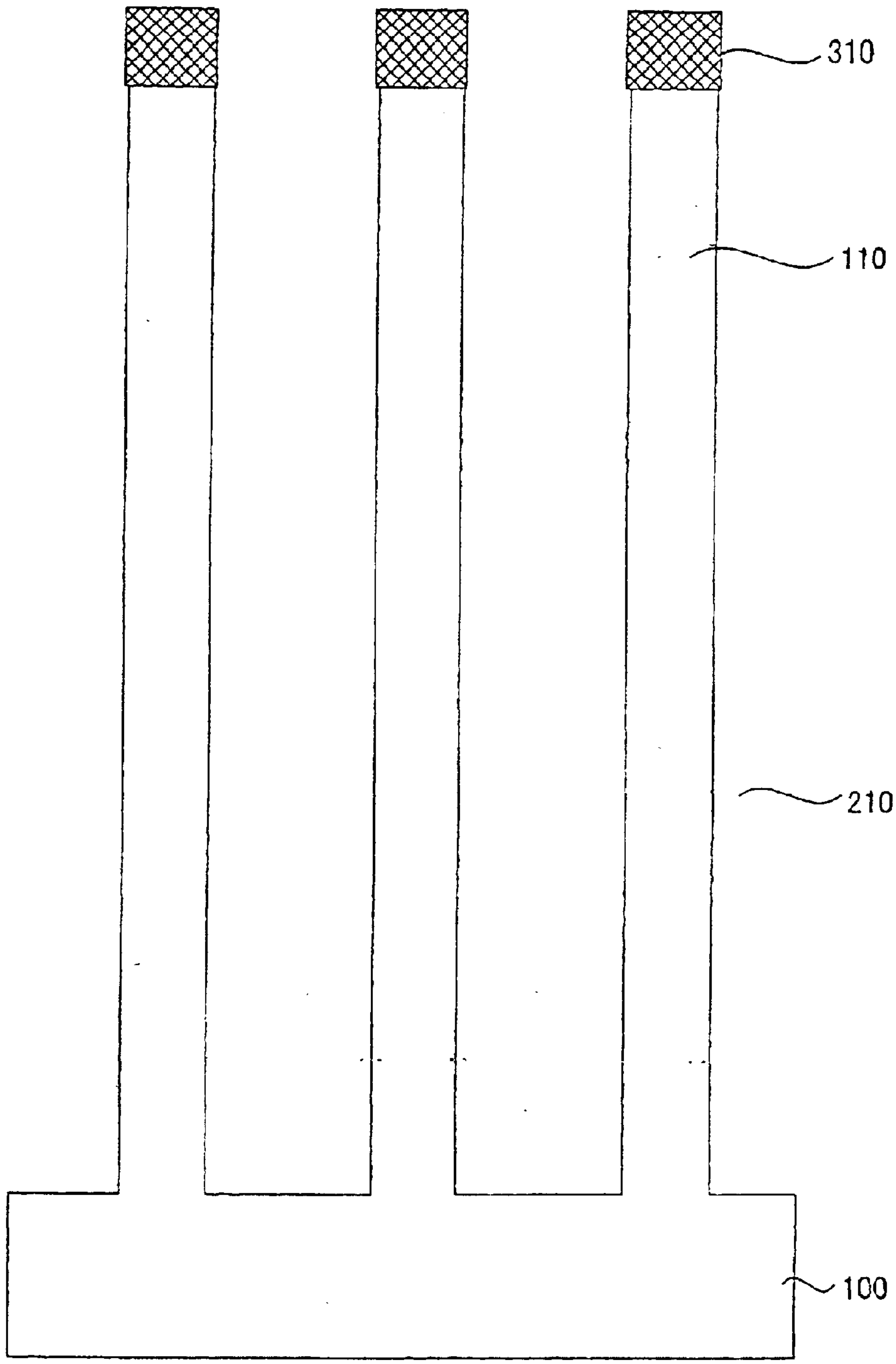
Figure 210:
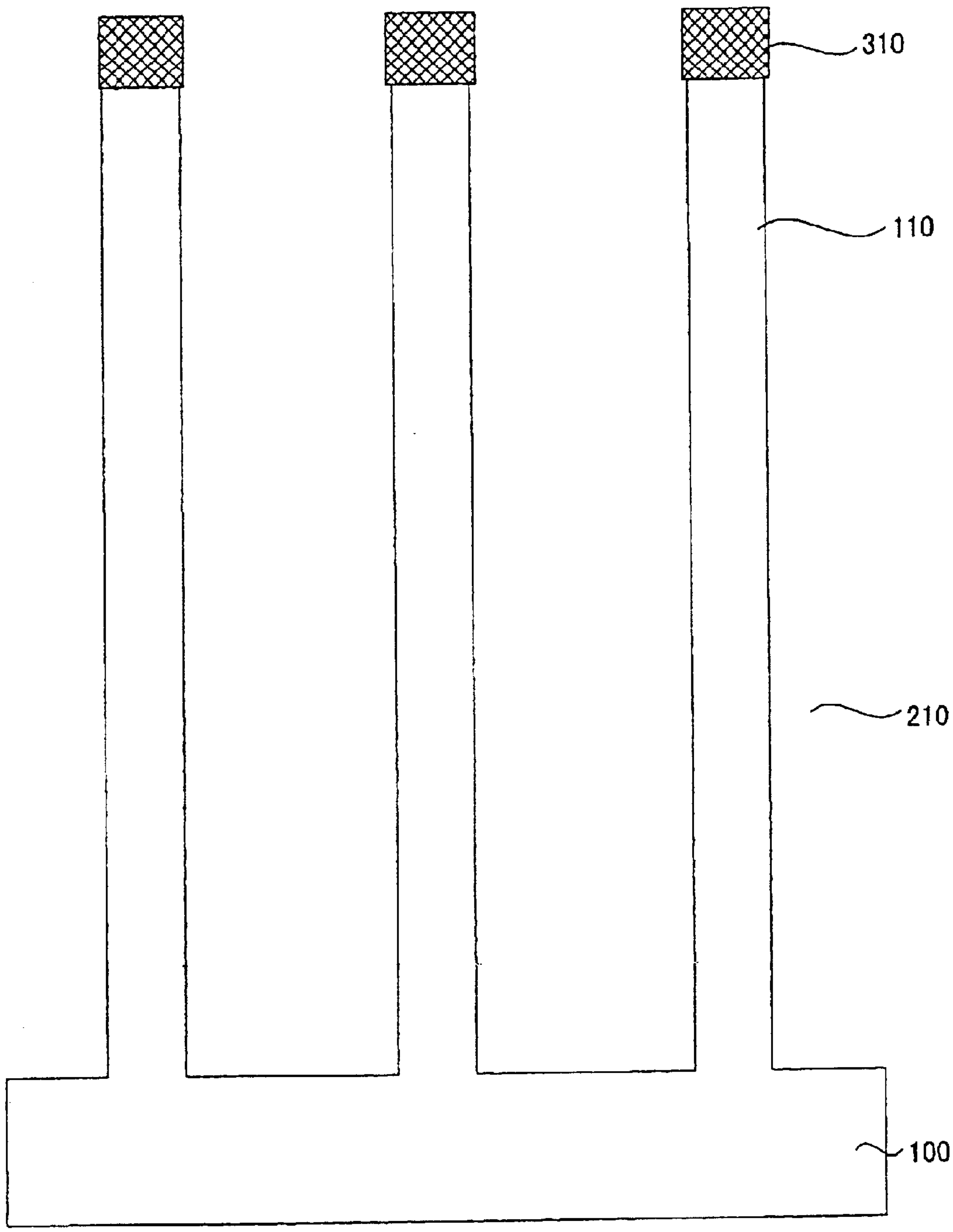

In this example, production steps are the same as those in Production Example 1 until the P-type silicon substrate 100 as the semiconductor substrate is formed into a plurality of island-like semiconductor layers in the pillar form (FIG. 198 and FIG. 210).

Figure 199:
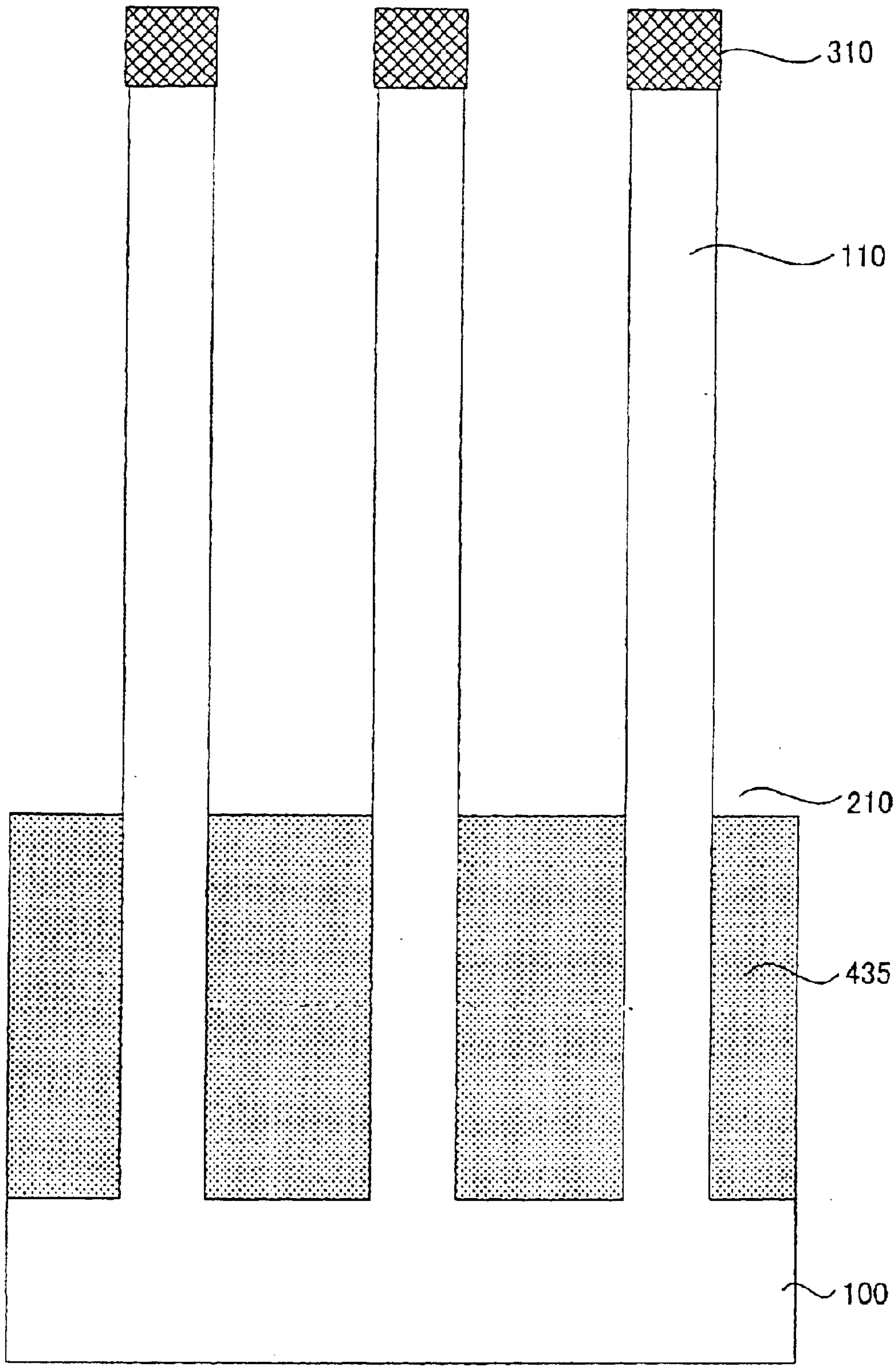
Figure 211:
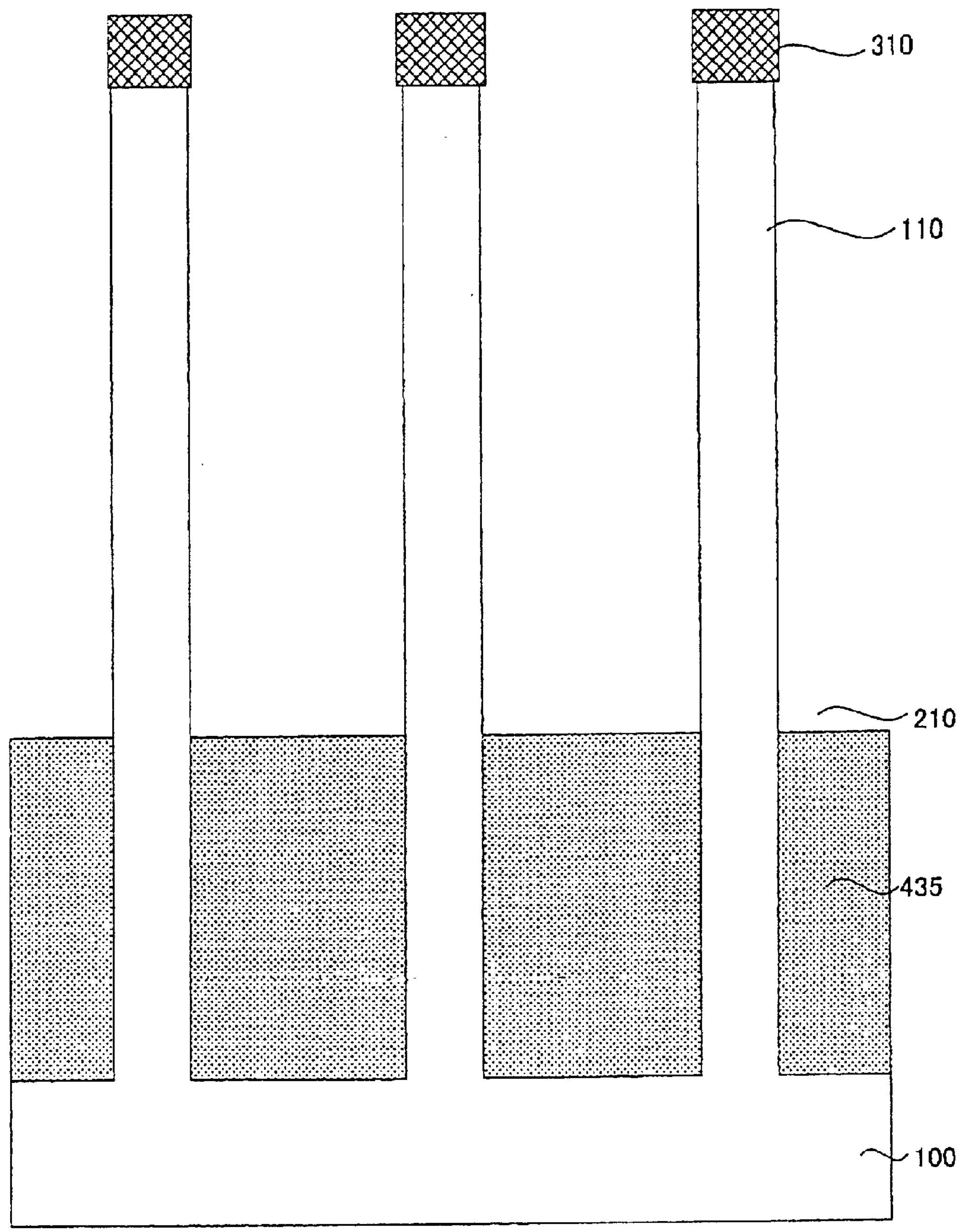

Thereafter, a silicon oxide film 435, for example, is deposited to 50 to 500 nm as a twenty-fifth insulating film and is buried by isotropic etching, for example, to a degree such that the silicon oxide film 435 will not reach the bottom of a first conductive film 512 which is to be formed in a later step (FIG. 199 and FIG. 211).

Subsequently, a silicon oxide film 452, for example, is formed to about 5 to 50 nm as a twenty-eighth insulating film and is anisotropically etched to remain in the form of a sidewall on the sidewall of each island-like semiconductor layer 110.

Figure 200:
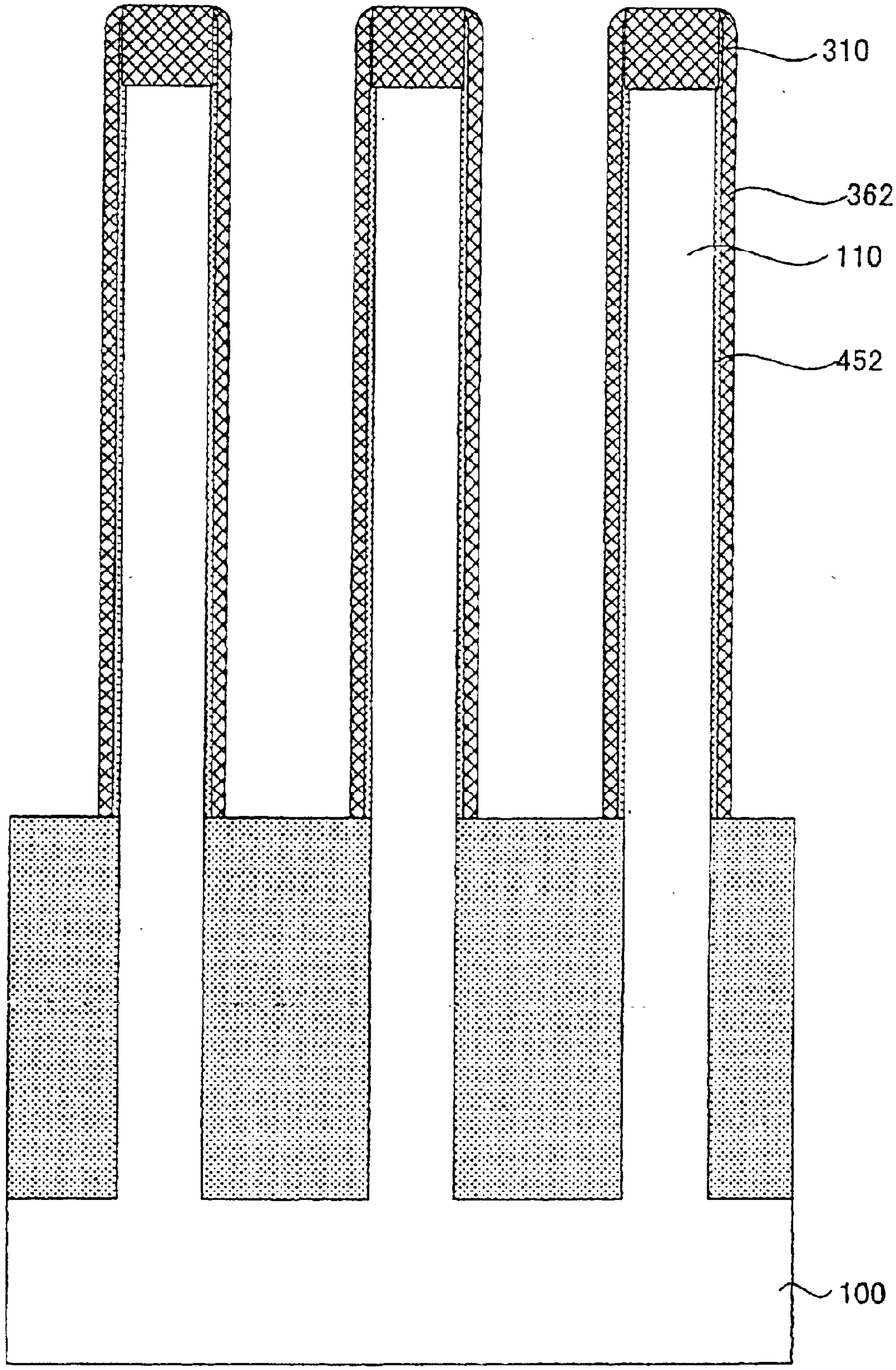
Figure 212:
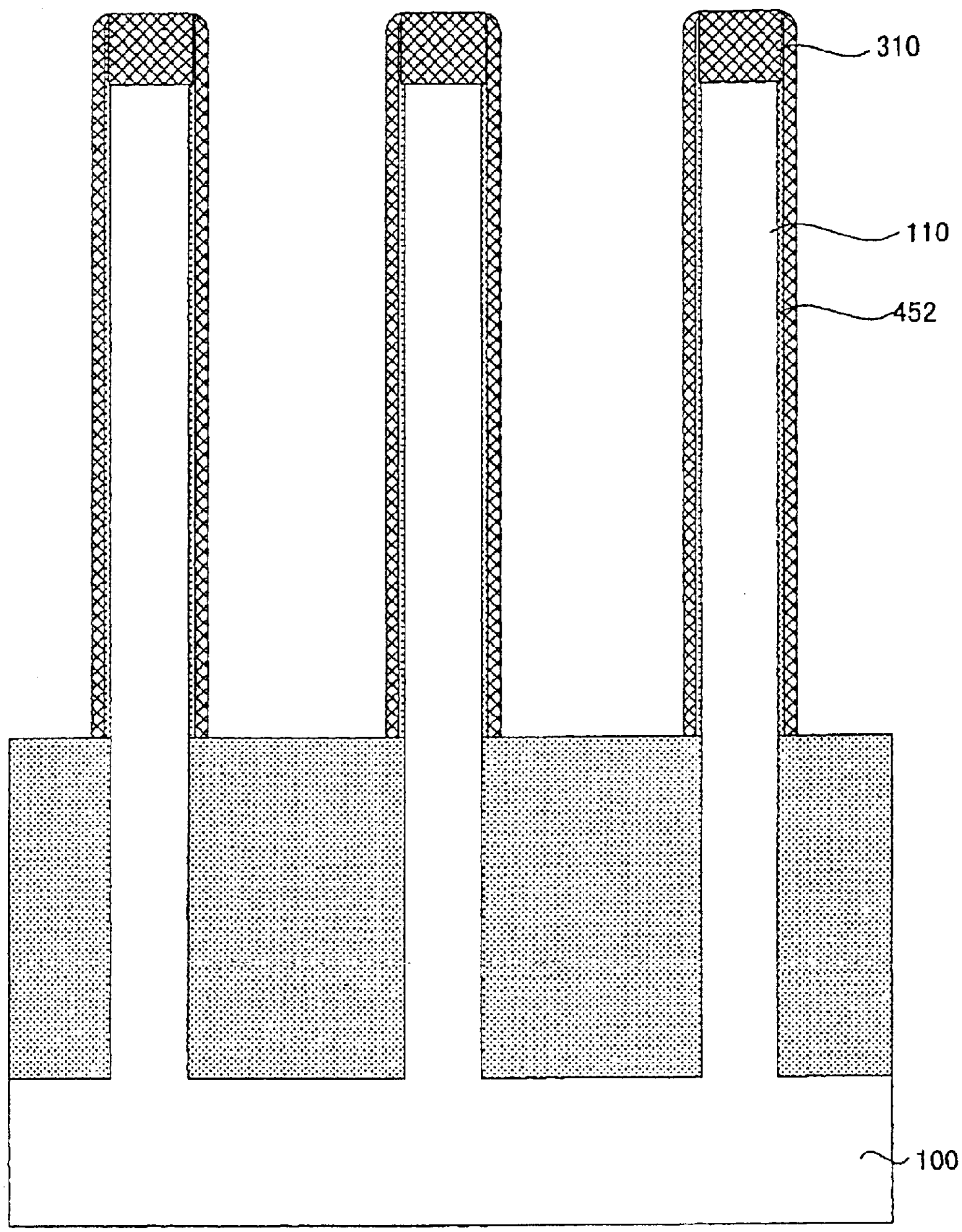

Further, a silicon nitride film 362, for example, is deposited to about 5 to 50 nm as a twenty-seventh insulating film and is anisotropically etched to remain in the form of a sidewall on the sidewall of each island-like semiconductor layer 110 with intervention of the silicon oxide film 452 (FIG. 200 and FIG. 212). The silicon oxide film 452 need not be formed, but is preferably formed. Also the silicon nitride film 362 may be deposited without being formed in the form of a sidewall after the silicon oxide film 452 is deposited.

Figure 201:
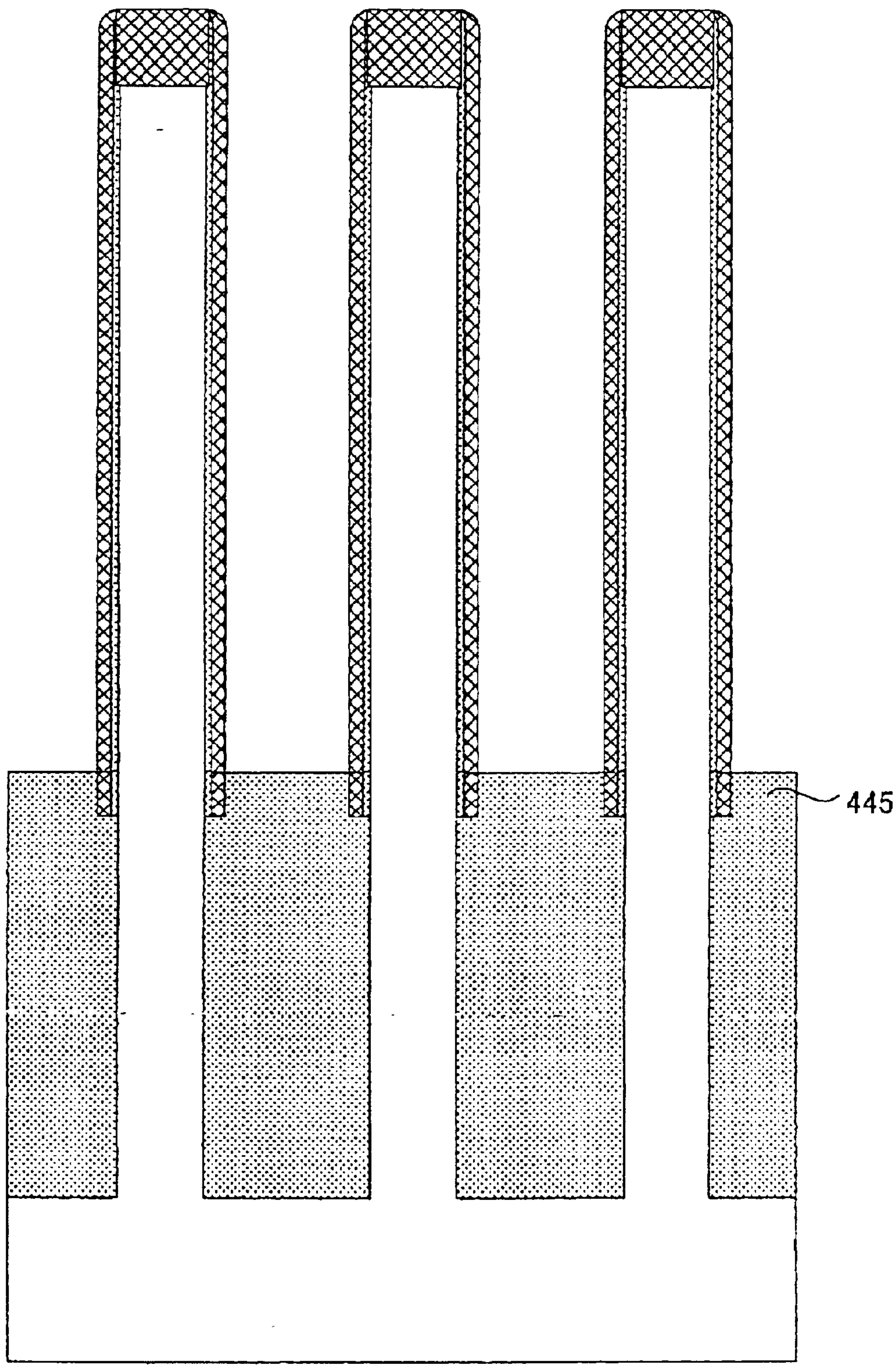
Figure 213:
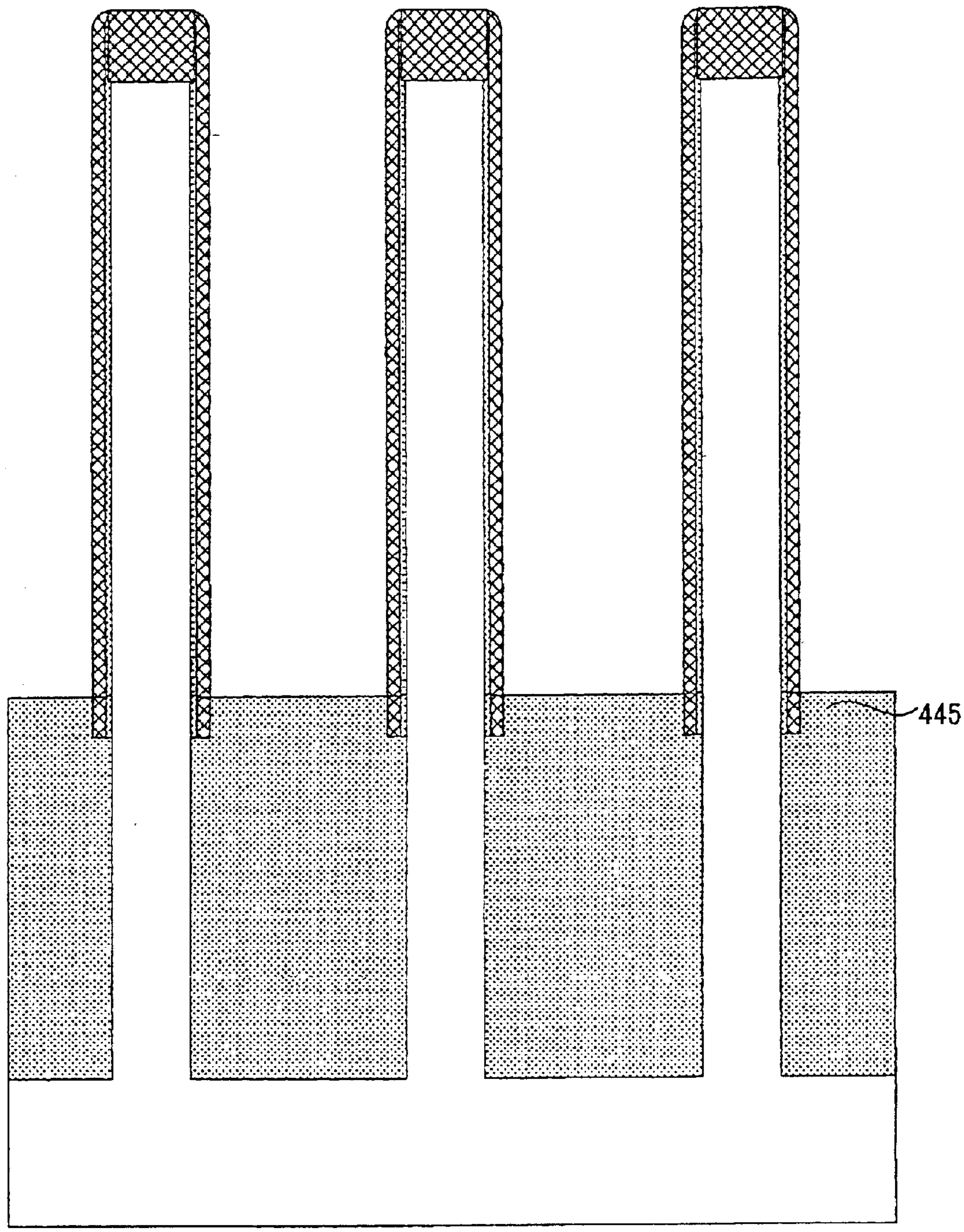

Subsequently, a silicon oxide film 445 is deposited to 50 to 500 nm as a twenty-sixth insulating film and is buried by isotropic etching, for example, to a degree such that the silicon oxide film 445 will reach at least the top end of a first conductive film 512 which is to be formed in a later step (FIG. 201 and FIG. 213).

Figure 202:
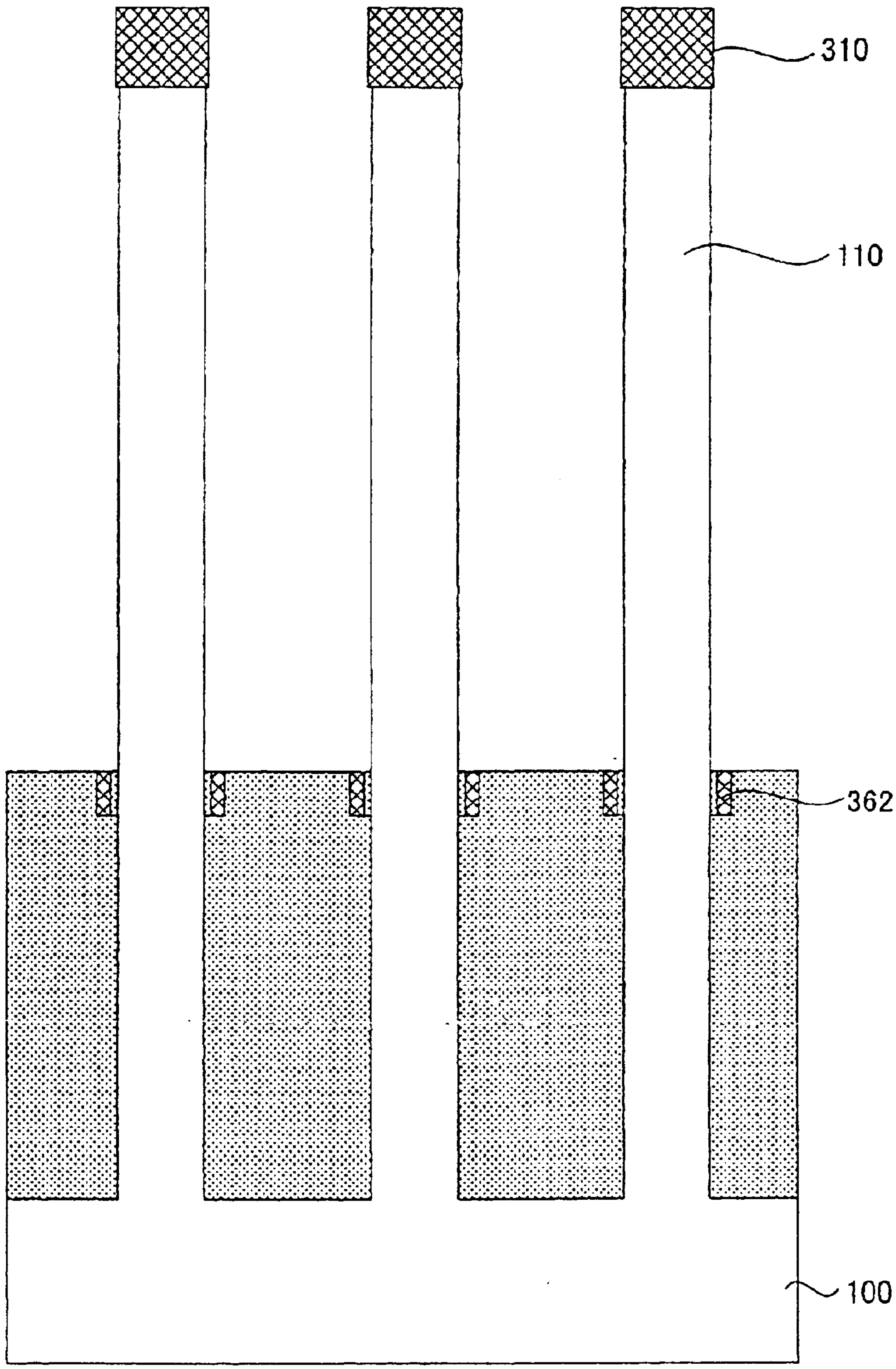
Figure 214:
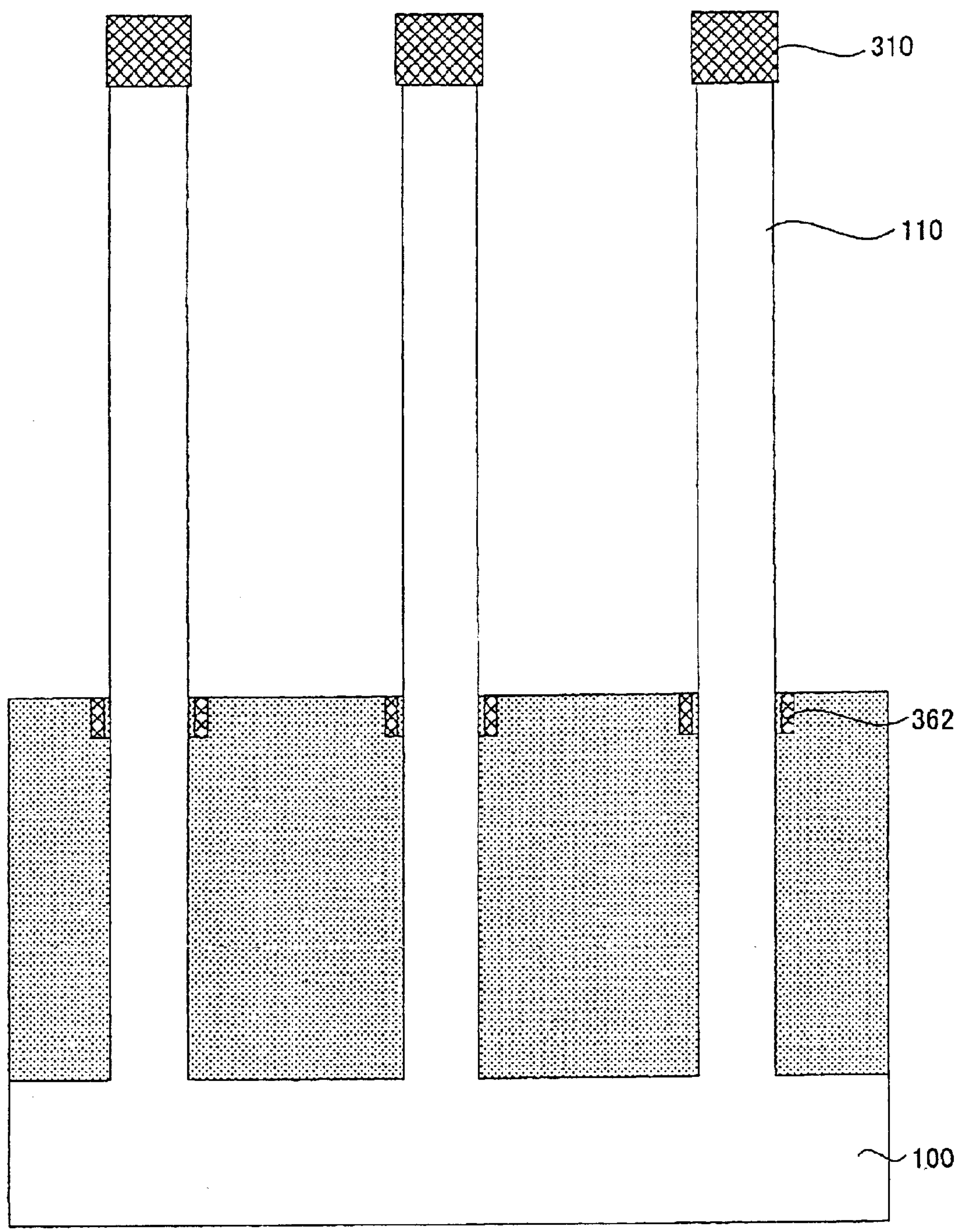

Thereafter, using the silicon oxide film 445 as a mask, the silicon nitride film 362 and the silicon oxide film 435 are isotropically etched so that they remain only between the island-like semiconductor layer 110 and the silicon oxide film 445 (FIG. 202 and FIG. 214). At this time, the silicon oxide film 435 need not be etched.

Next, a silicon oxide film 436, for example, is deposited to 50 to 500 nm as a twenty-fifth insulating film and is buried by isotropic etching, for example, to a degree such that the silicon oxide film 436 will not reach the bottom of a first conductive film 513 which is to be formed in a later step. Subsequently, a silicon oxide film 453, for example, is deposited to about 5 to 50 nm as a twenty-eighth insulating film and then is anisotropically etched to remain in the form of a sidewall spacer on the sidewall of each island-like semiconductor layer 110.

Figure 203:
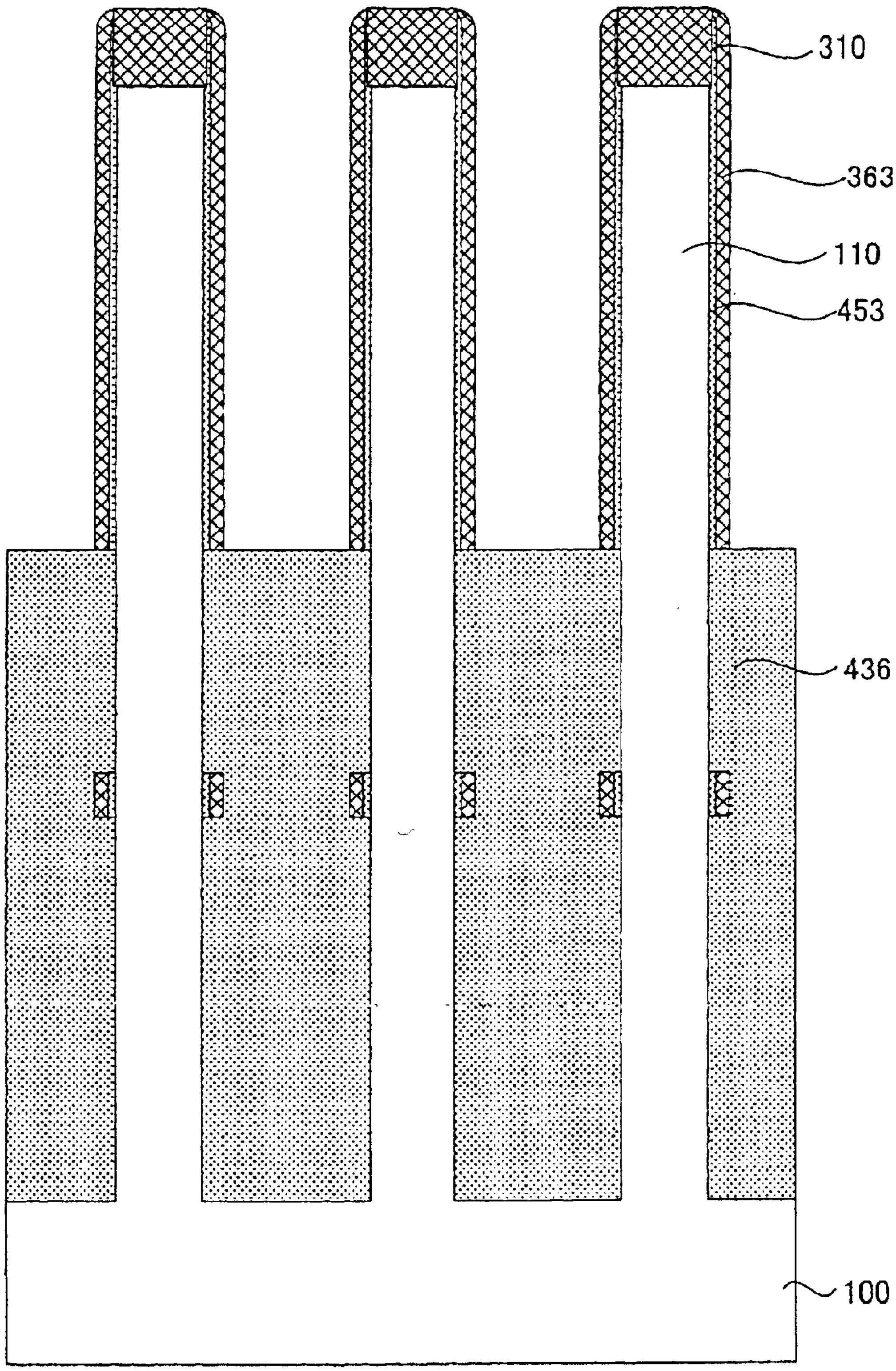
Figure 215:
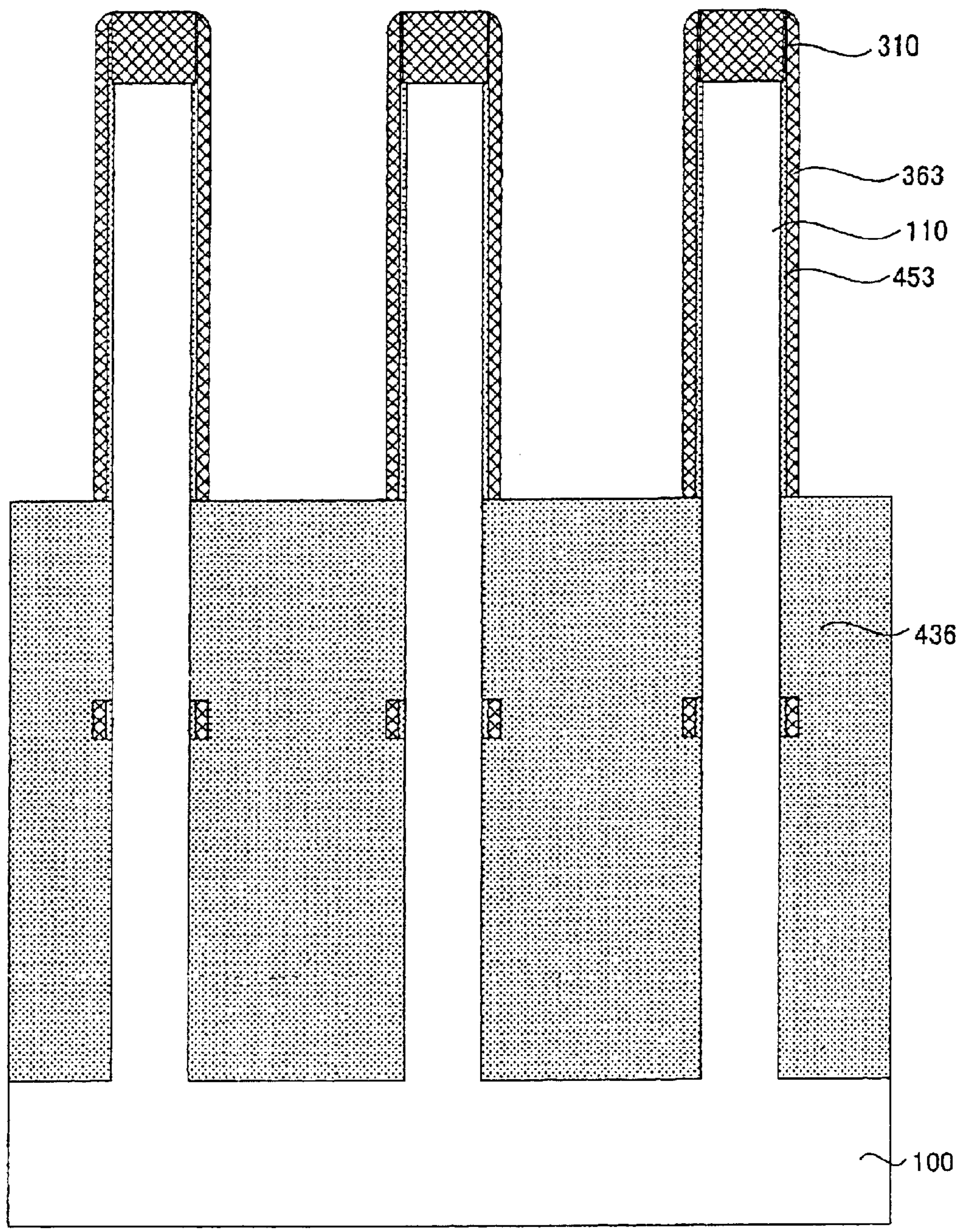

Further, a silicon nitride film 363, for example, is deposited to 5 to 50 nm as a twenty-seventh insulating film and then is anisotropically etched to remain in the form of a sidewall on the sidewall of each island-like semiconductor layer 110 with intervention of the silicon oxide film 453 (FIG. 203 and FIG. 215). At this time, the silicon oxide film 453 need not necessarily be formed, but is preferably formed. The silicon nitride film 363 may be deposited without being formed in the form of a sidewall after the silicon oxide film 453 is deposited.

Subsequently, a silicon oxide film 446, for example, is deposited to 50 to 500 nm as a twenty-sixth insulating film and is buried by isotropic etching, for example, to a degree such that the silicon oxide film 446 will reach at least the top end of a first conductive film 513 which is to be formed in a later step.

Figure 204:
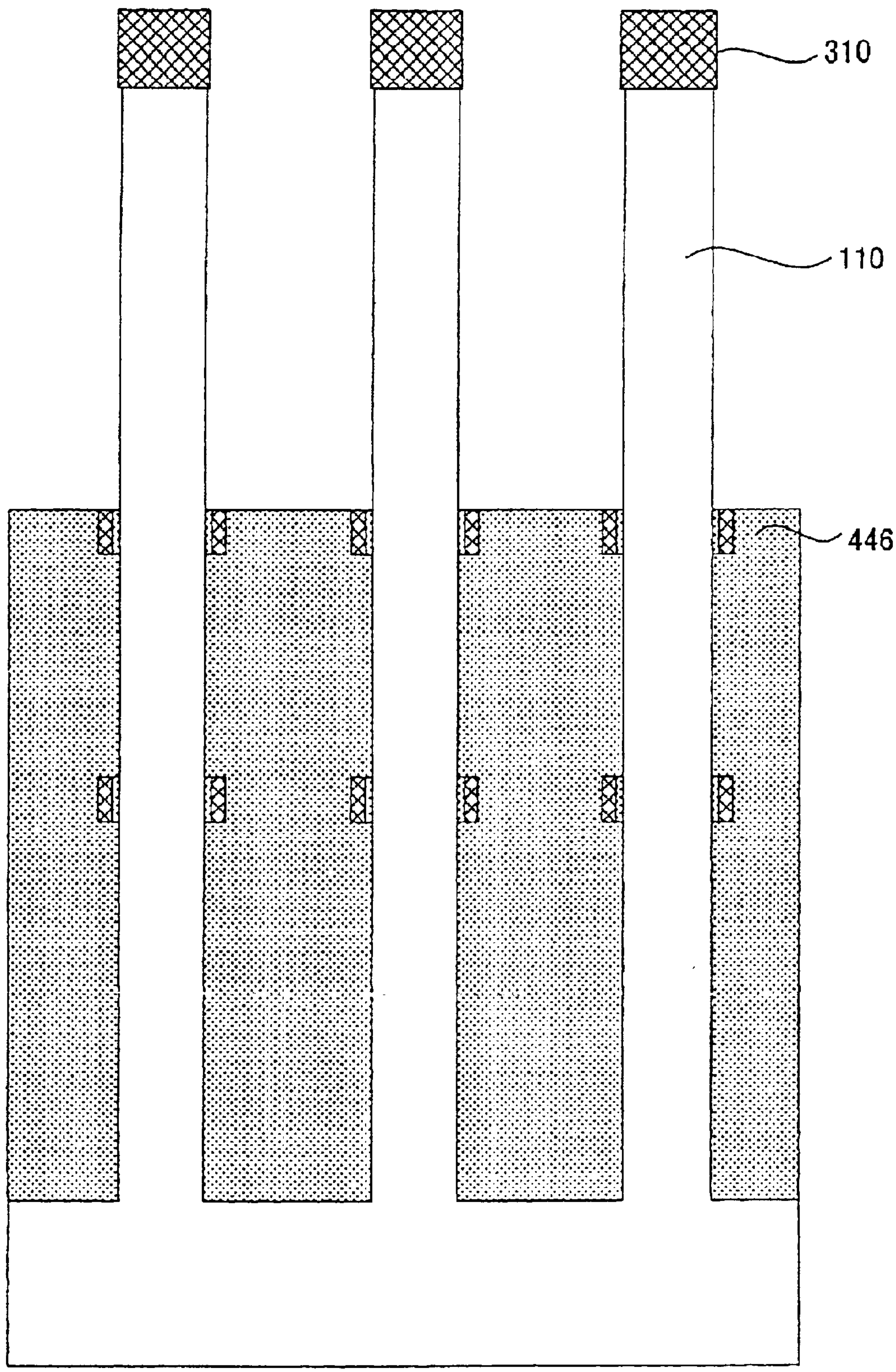
Figure 216:
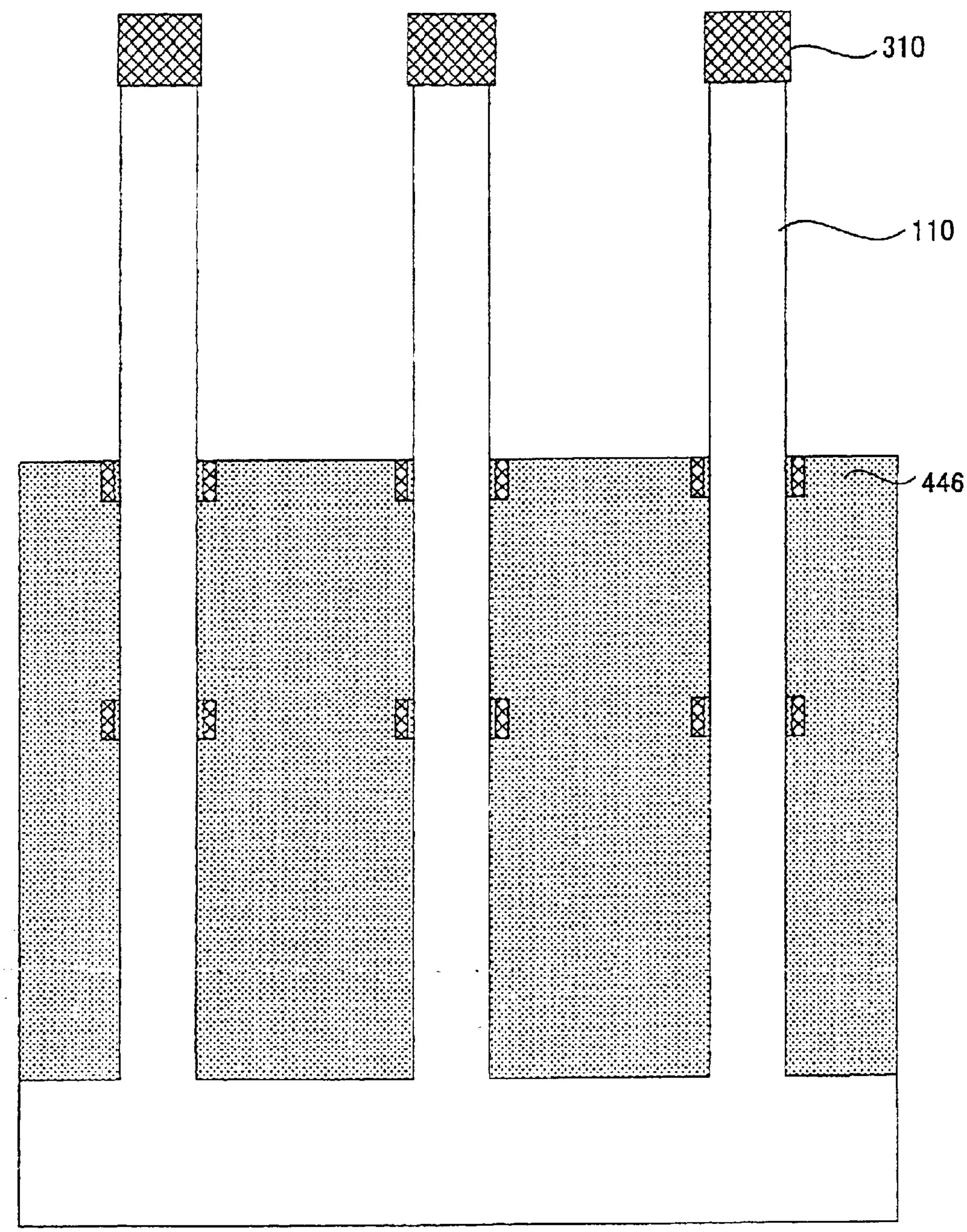

Thereafter, using the silicon oxide 446 as a mask, the silicon nitride film 363 and the silicon oxide film 436 are isotropically etched to remain only between each island-like semiconductor layers 110 and the silicon oxide film 446 (FIG. 204 and FIG. 216).

Figure 205:
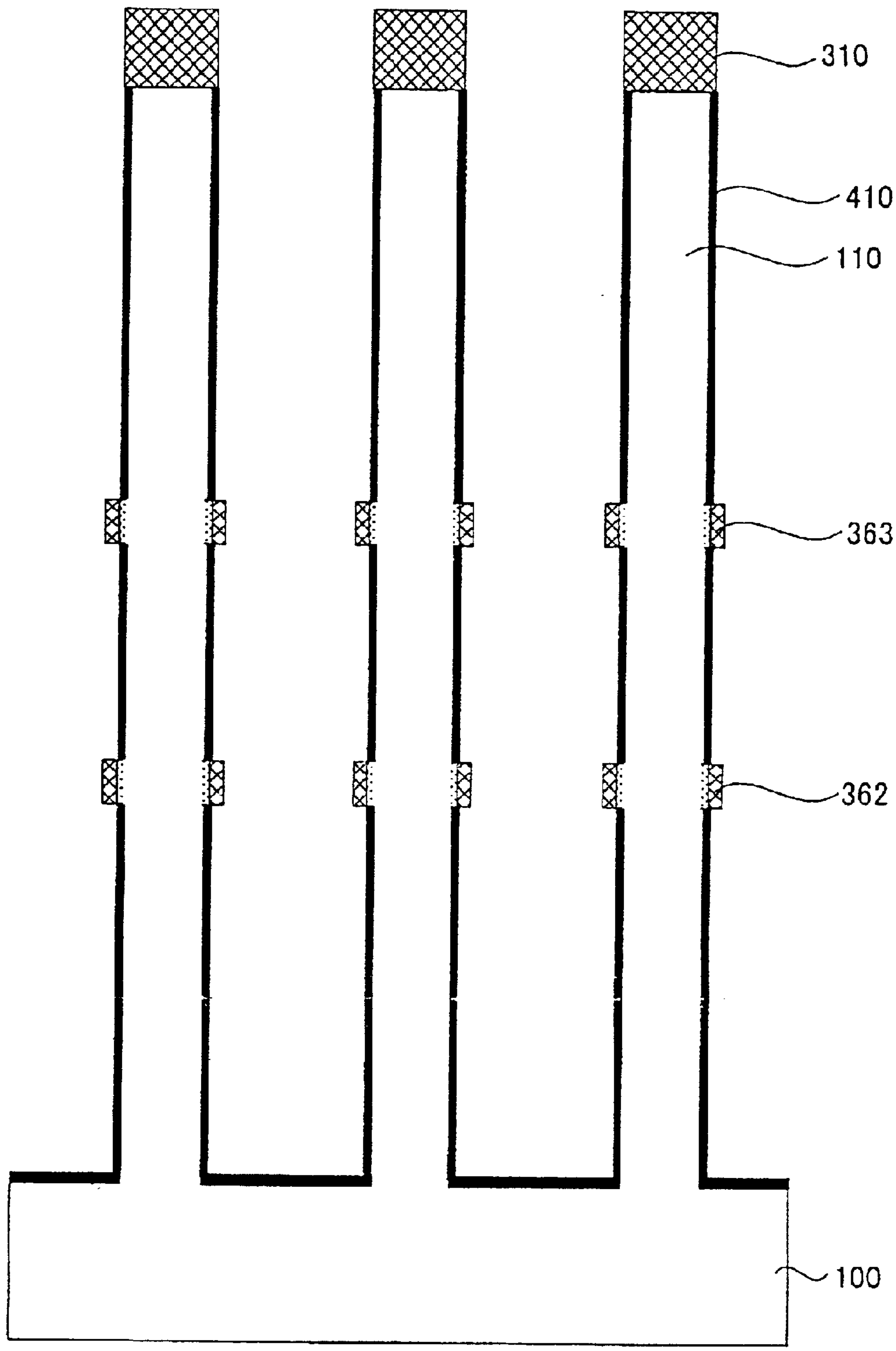
Figure 217:
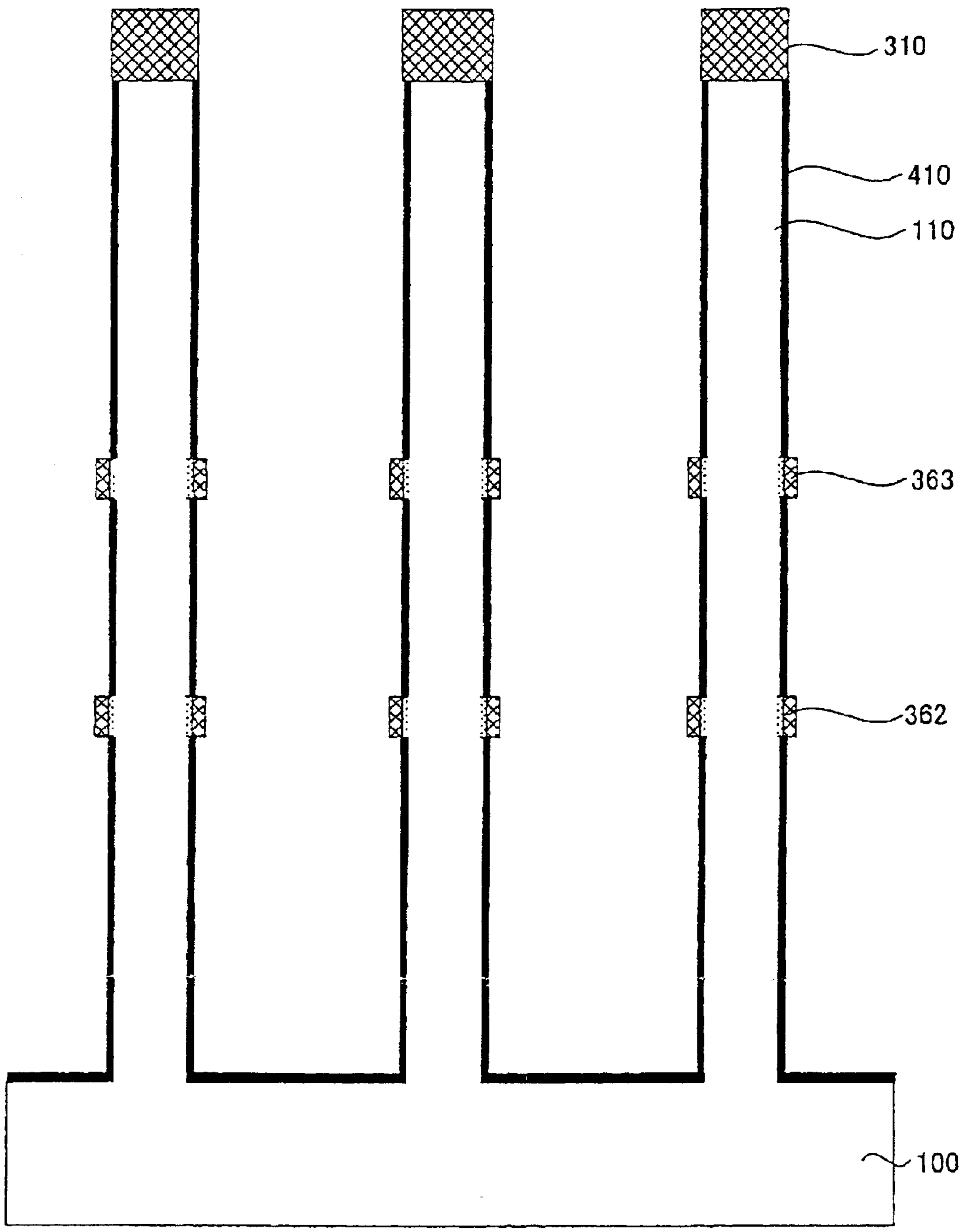

Subsequently, the surface of each island-like semiconductor layer is oxidized using the silicon nitride films 362 and 363 to form a thermally oxidized film 410 to be a second insulating film of a thickness of about 10 to 100 nm (FIG. 205 and FIG. 217).

Figure 206:
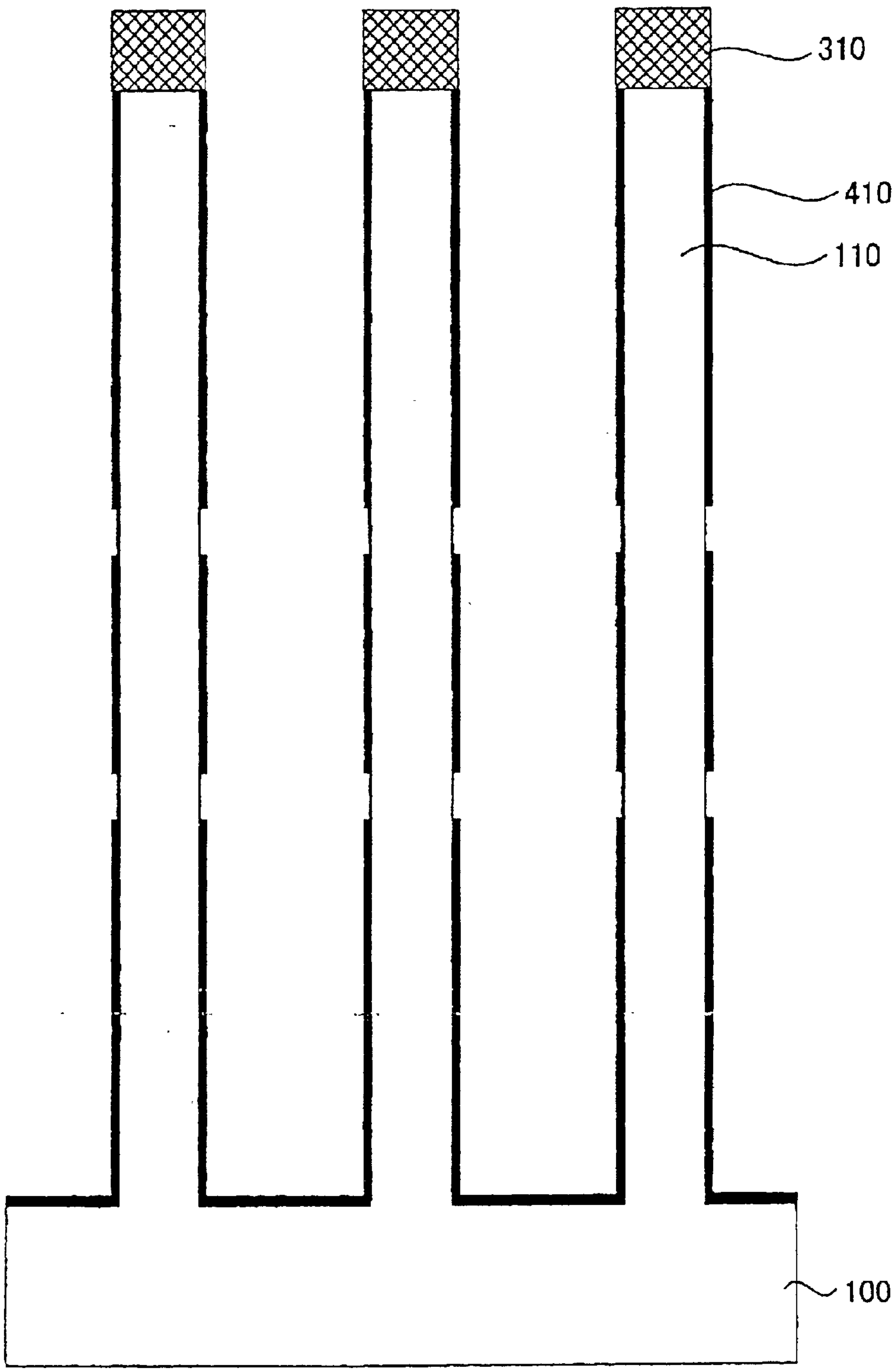
Figure 218:
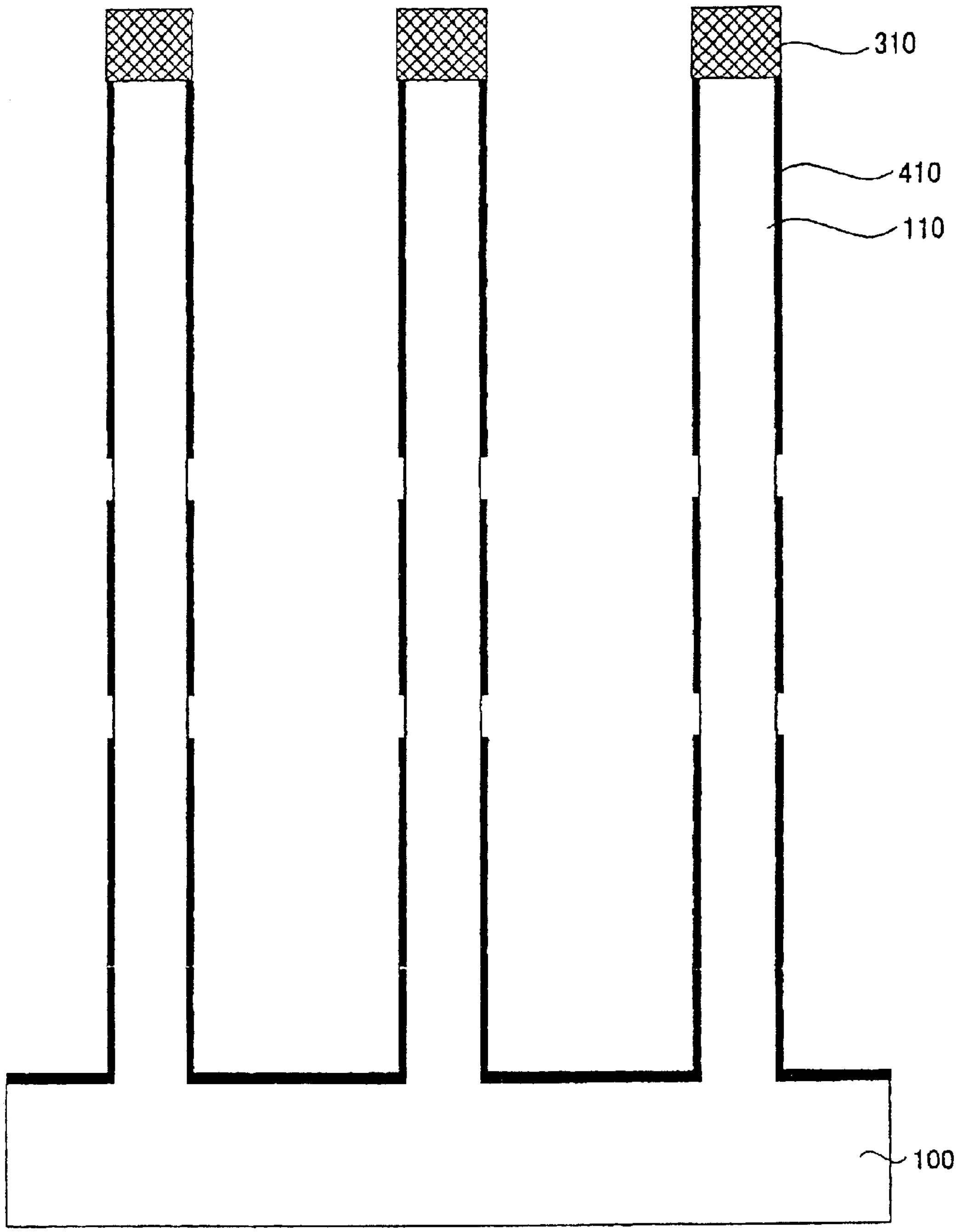

Thereafter, the silicon nitride films 362 and 363 and the silicon oxide films 452 and 453 are removed by isotropic etching to expose the island-like semiconductor layers 110 (FIG. 206 and FIG. 218).

As required, channel ion implantation is carried out on the sidewalls of the island-like semiconductor layers 110 by utilizing slant ion implantation, for example, at an implantation energy of 5 to 100 keV in a direction inclined about 5 to 45° in a boron dose of about $1\times10^{11}$ to $1\times10^{13}/cm^2$. Preferably, the channel ion implantation is performed in a plurality of directions of the island-like semiconductor layers 110 because the impurity concentration on the surface becomes uniform. The ion implantation from the surface of the island-like semiconductor layers 110 may be carried out before the silicon oxide film 435 is deposited or before the island-like semiconductor layers 110 are formed. The means for the ion implantation is not particularly limited so long as the same impurity concentration distribution in the island-like semiconductor layers 110 can be obtained.

Figure 207:
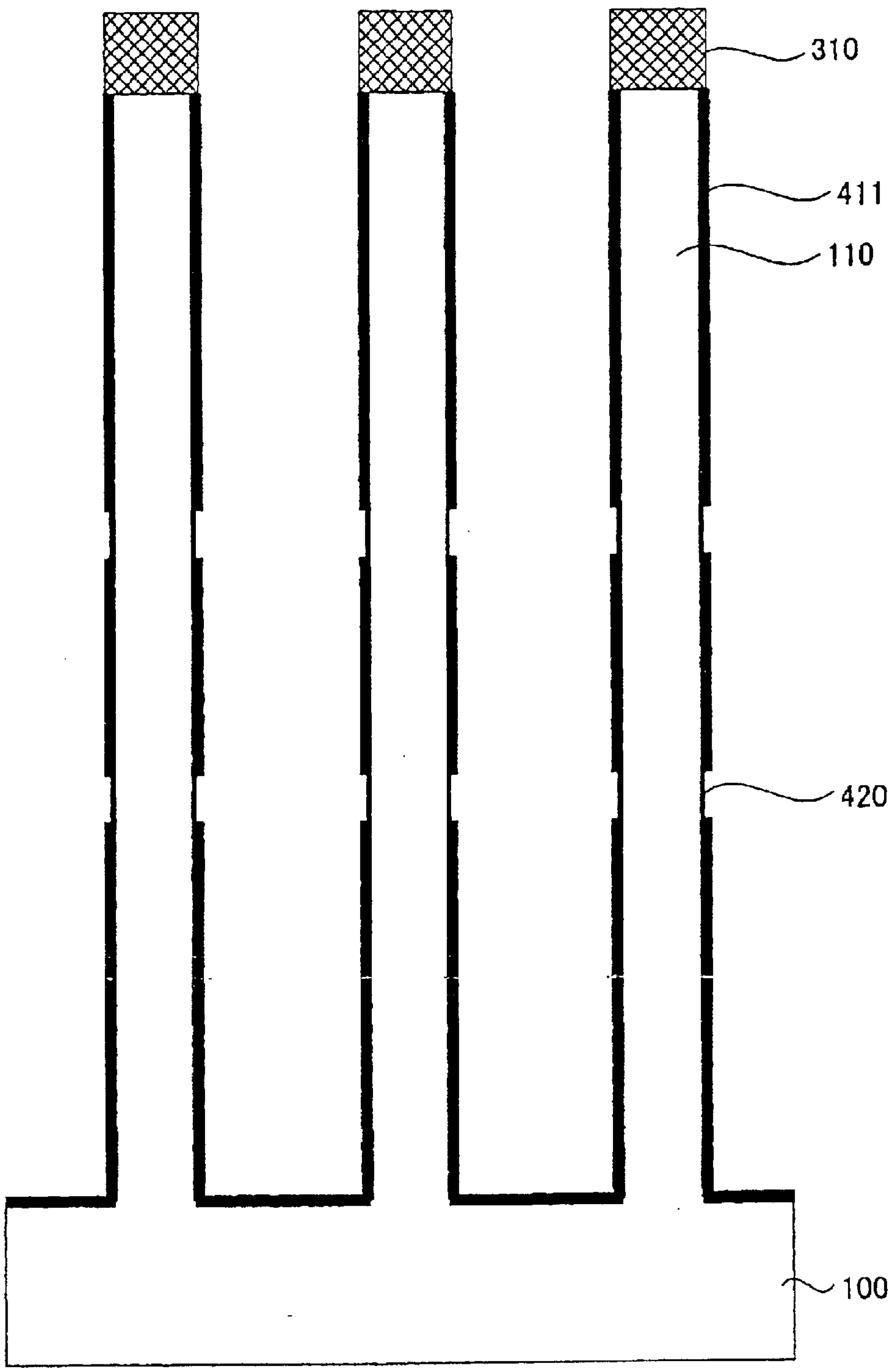
Figure 219:
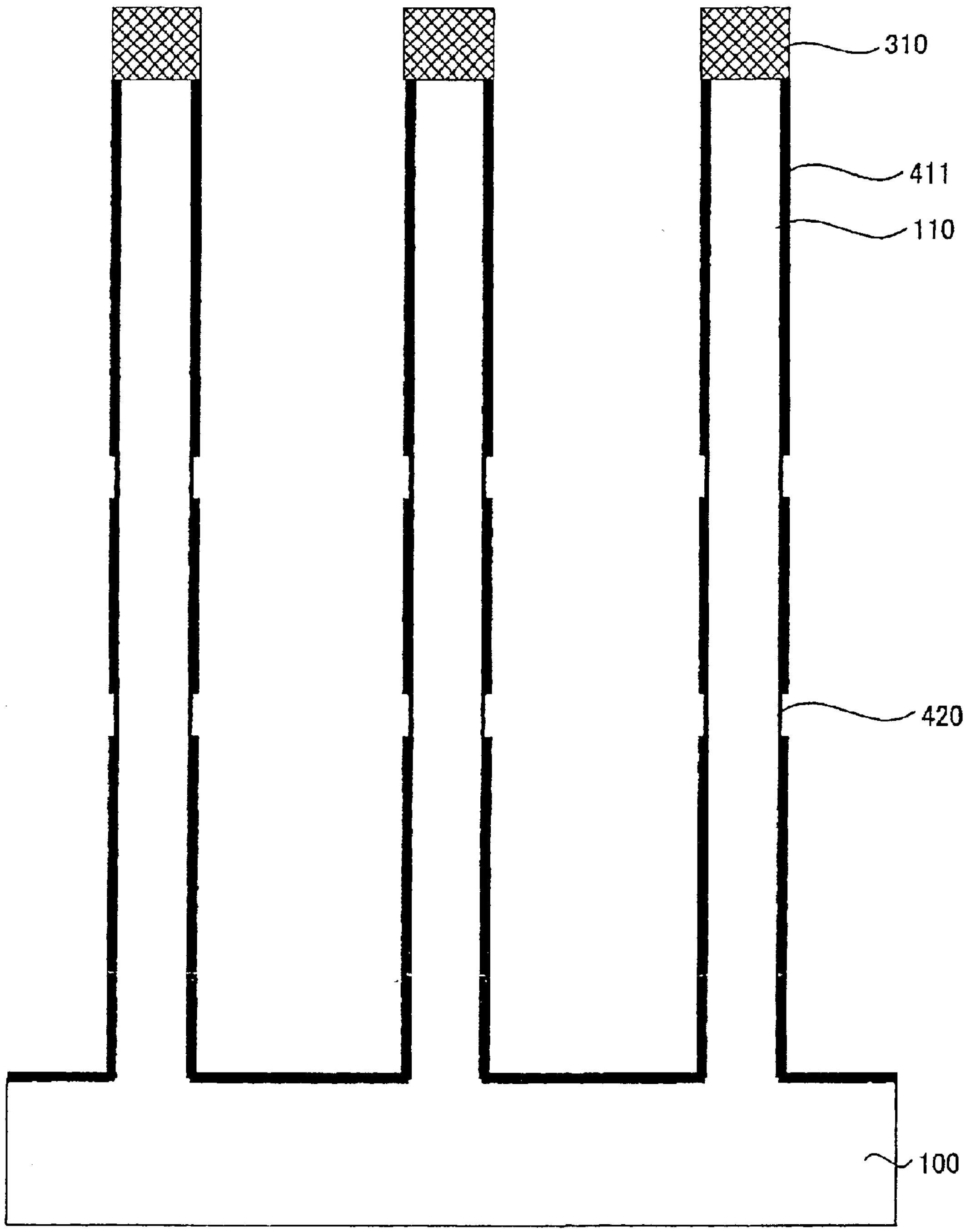

Subsequently, a silicon oxide film 420, for example, is formed as a third insulating film to be a tunnel oxide film of about 10 nm thickness by thermal oxidation on the periphery of each of the exposed island-like semiconductor layers (FIG. 207 and FIG. 219). At this time, a silicon oxide film 411, for example, to be a second insulating film is a thermally oxidized film 410 whose thickness is increased. The tunnel oxide film is not limited to a thermally oxidized film, but may be a CVD oxide film or a nitrogen oxide film.

Figure 208:
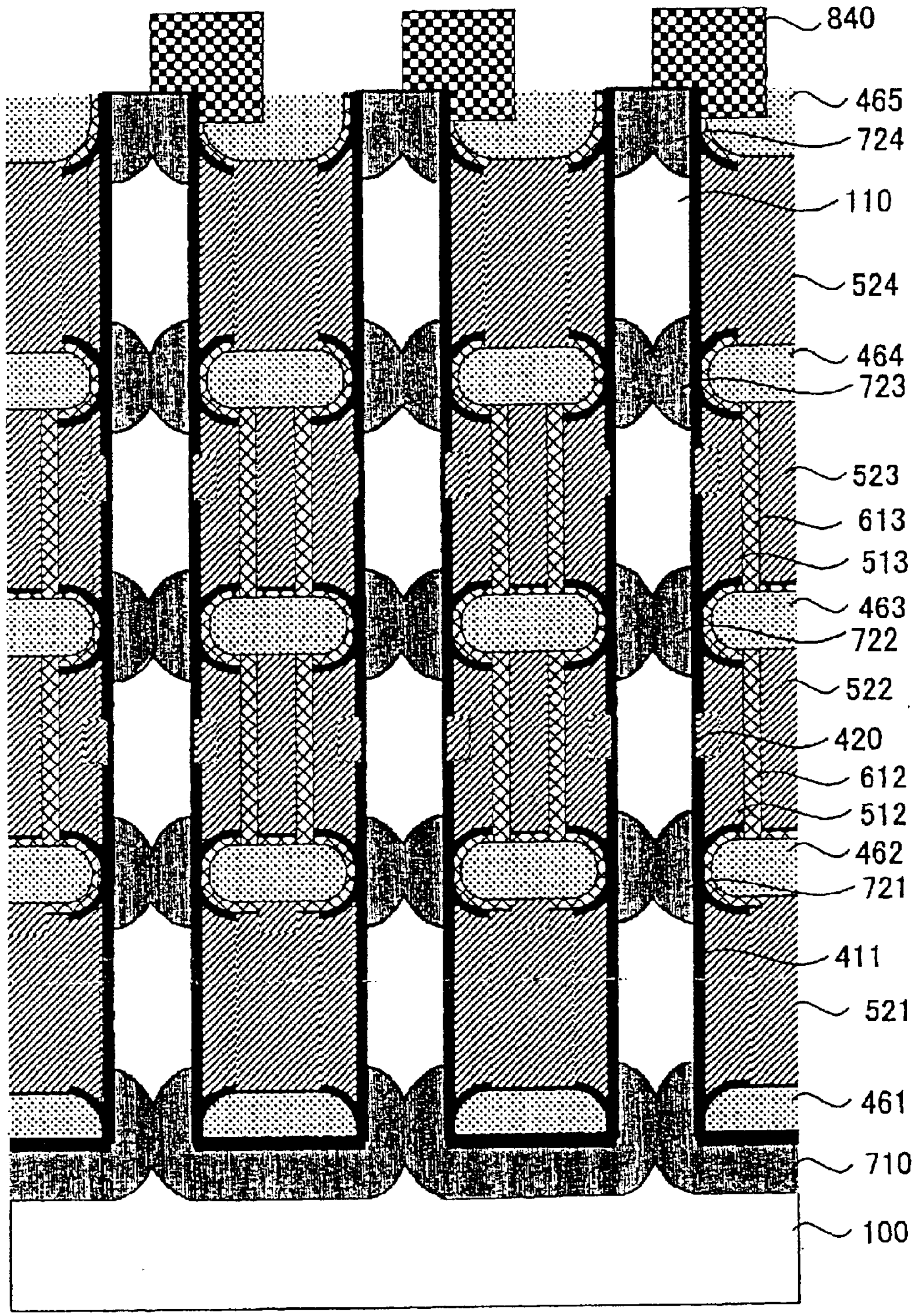
Figure 220:
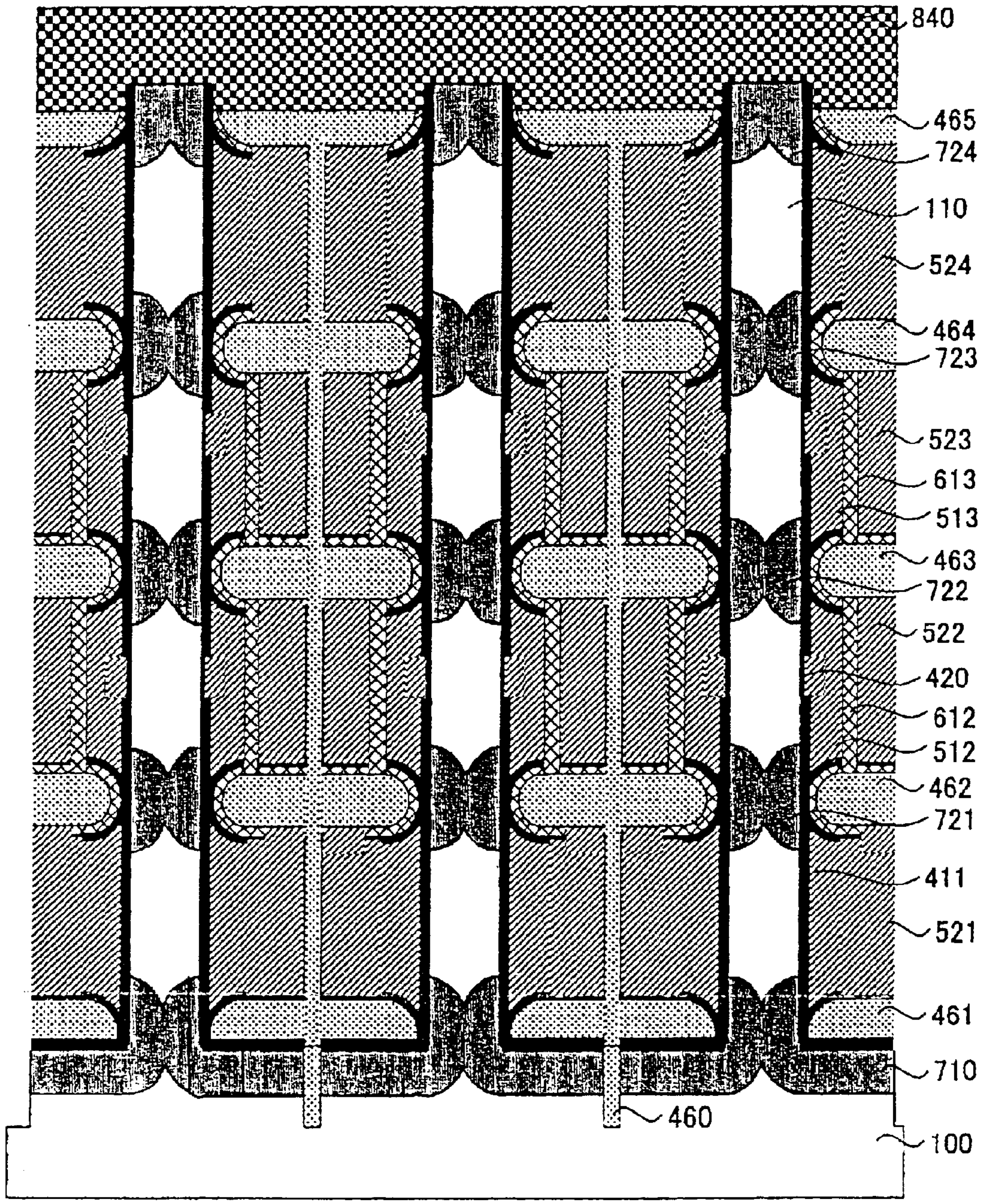

Thereafter, production steps are in accordance with those of Production Example 1 after a polysilicon film 510, for example, to be a first conductive film is deposited to about 50 to 200 nm (FIG. 208 and FIG. 220).

Figure 209:
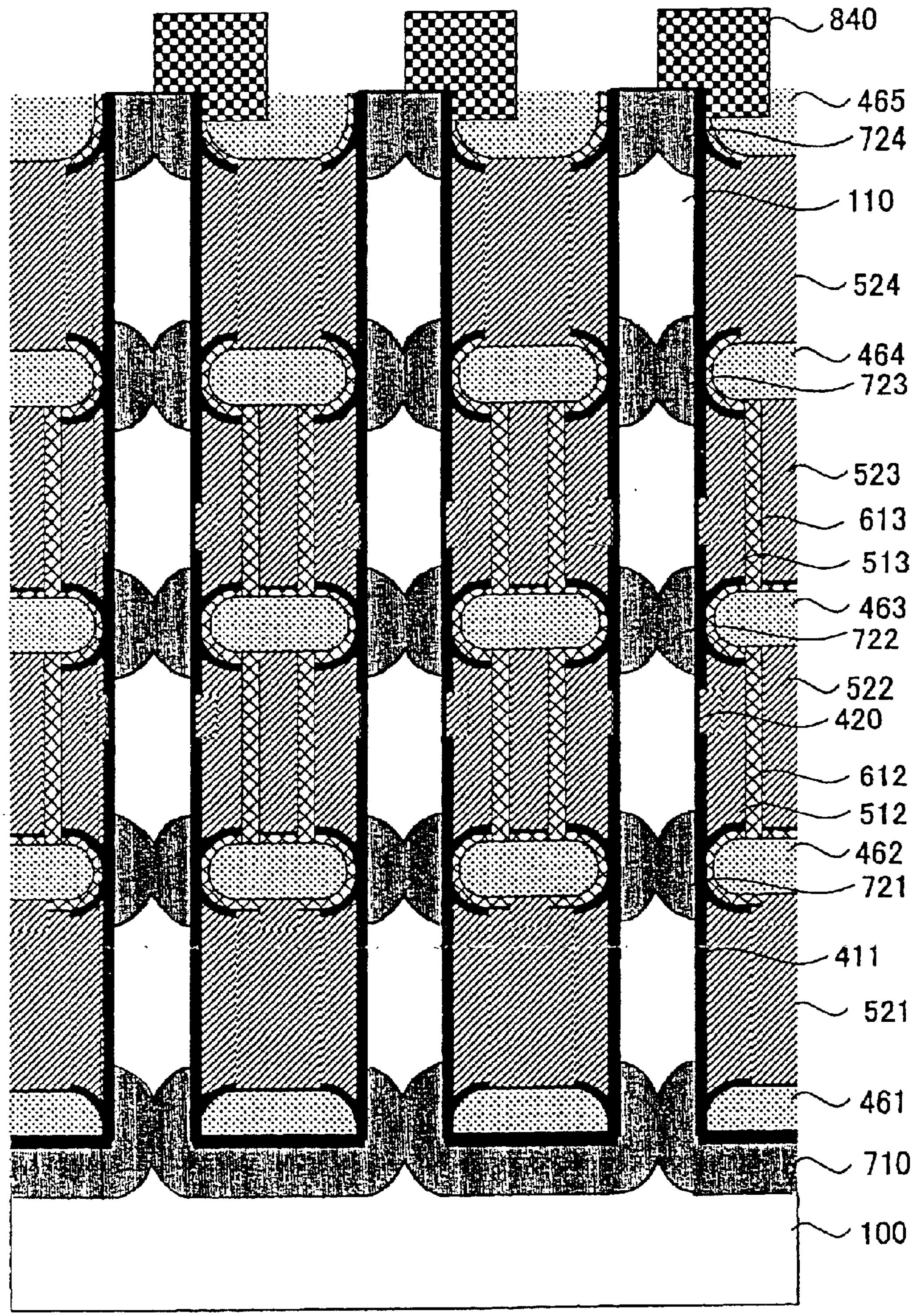
Figure 221:
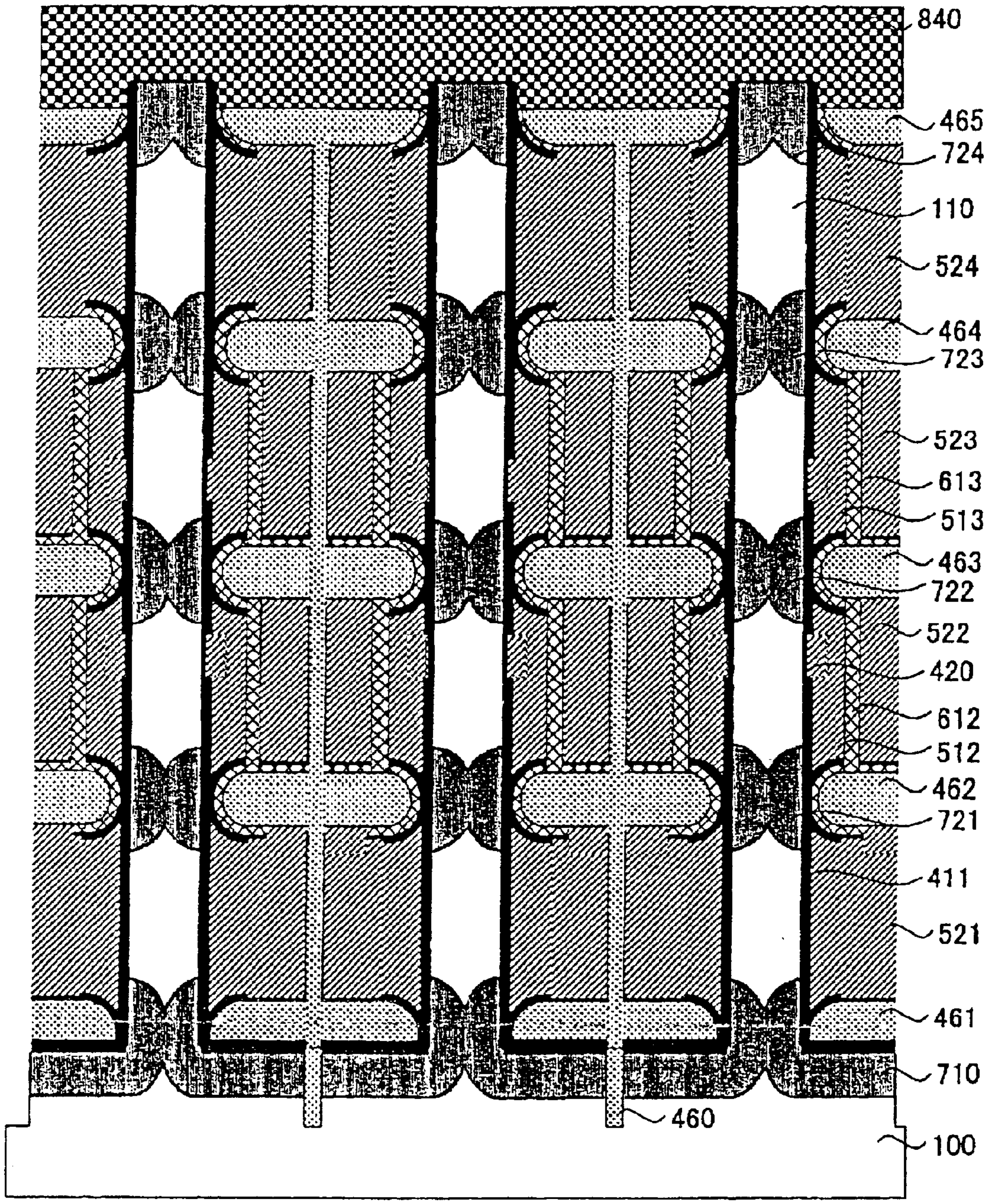

It is sufficient that the silicon oxide film 420 is formed between the desired conductive film and island-like semiconductor layer. For example, the silicon oxide film 420 may be unevenly distributed on the top or at the bottom of the polysilicon film as shown in FIG. 209 and FIG. 221 or may be partially overlapped with the impurity diffusion layer.

When the silicon oxide film 420 is formed by thermal oxidation or the like, the formed oxidized film may have or may not have isotropy, as in the above-described Example 1.

By the above-described production method, it is possible to simultaneously form the selection gates and the floating gates of the respective transistors of the semiconductor memory device in which the selection gates are formed on the top and at the bottom of the island-like semiconductor layers and the area of the tunnel oxide films between the floating gates of the memory cells and the island-like semiconductor layers is smaller than the area of the floating gates contacting the island-like semiconductor layers.

PRODUCTION EXAMPLE 7

With regard to Production Example 1, this example is particularly shown for forming the tunnel oxide film partially on the periphery of the island-like semiconductor layer 110 in the pillar form.

FIGS. 222 to 231 and FIGS. 242 to 244 are sectional views taken on line A-A' and line B-B', respectively, in FIG. 1 illustrating a memory cell array of EEPROM, and FIGS. 232 to 241 and FIGS. 245 to 247 are sectional views taken on line A-A' and line B-B', respectively, in FIG. 1 illustrating a memory cell array of EEPROM.

In this example, production steps are the same as those in Production Example 1 until the thermally oxidized film 410 is formed as the second insulating film, the thermally oxidized film 410 is etched away and, as required, the channel ion implantation is carried out on the sidewalls of the semiconductor layers using slant ion implantation.

Next, a silicon oxide film 434, for example, is deposited to about 50 to 500 nm as a twenty-fifth insulating film, and is buried, for example, by isotropic etching to a position such that the silicon oxide film 434 will overlap a impurity diffusion layer 721 to be formed in a later step as an N-type semiconductor layer.

Thereafter, a silicon oxide film 452, for example, is deposited to about 50 to 500 nm as a twenty-eighth insulating film, and then is anisotropically etched to remain in the form of a sidewall on the sidewall of each island-like semiconductor layer 110. At this time, the silicon oxide film 452 may be formed by thermal oxidation or the thermally oxidized film 410 may be used without being removed. Also the silicon oxide film 452 need not necessarily be formed in the form of a sidewall but may be used as it is deposited.

Figure 222:
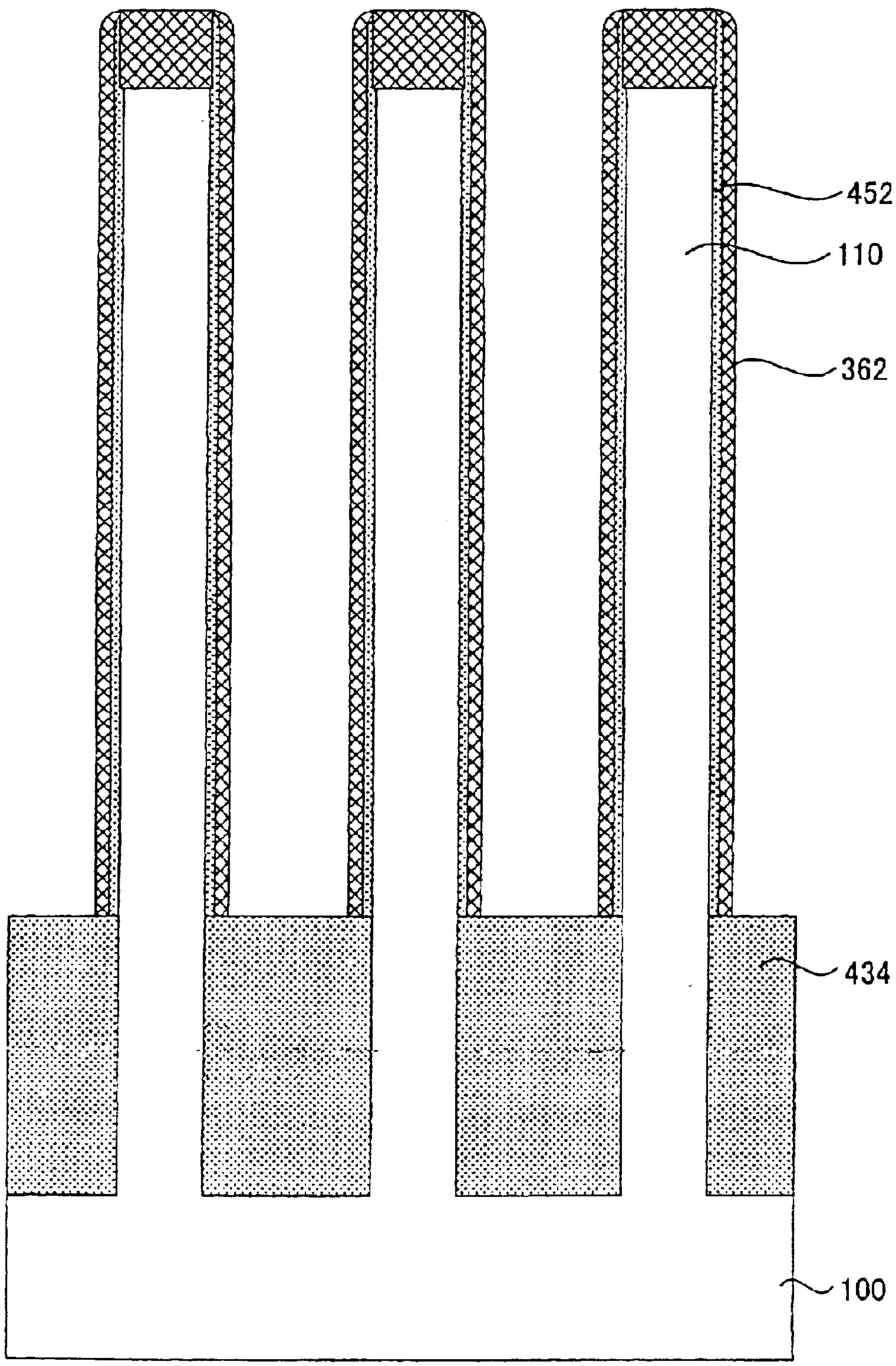
Figure 232:
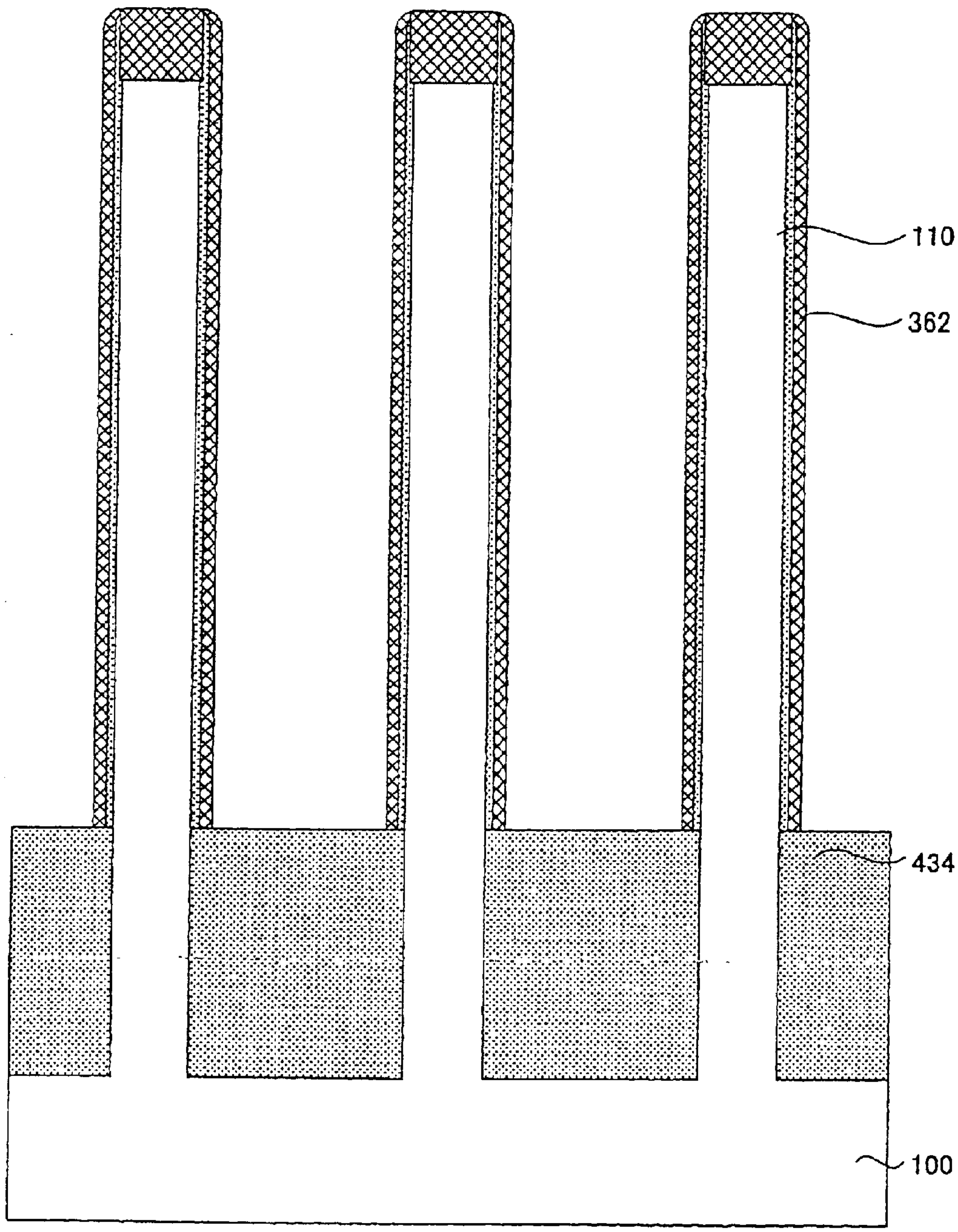

Further, a silicon nitride film 362, for example, is deposited to about 5 to 50 nm as a twenty-seventh insulating film, and then is anisotropically etched to remain in the form of a sidewall on the sidewall of each island-like semiconductor layer 110 with intervention of the silicon oxide film 452 (FIG. 222 and FIG. 232).

Figure 223:
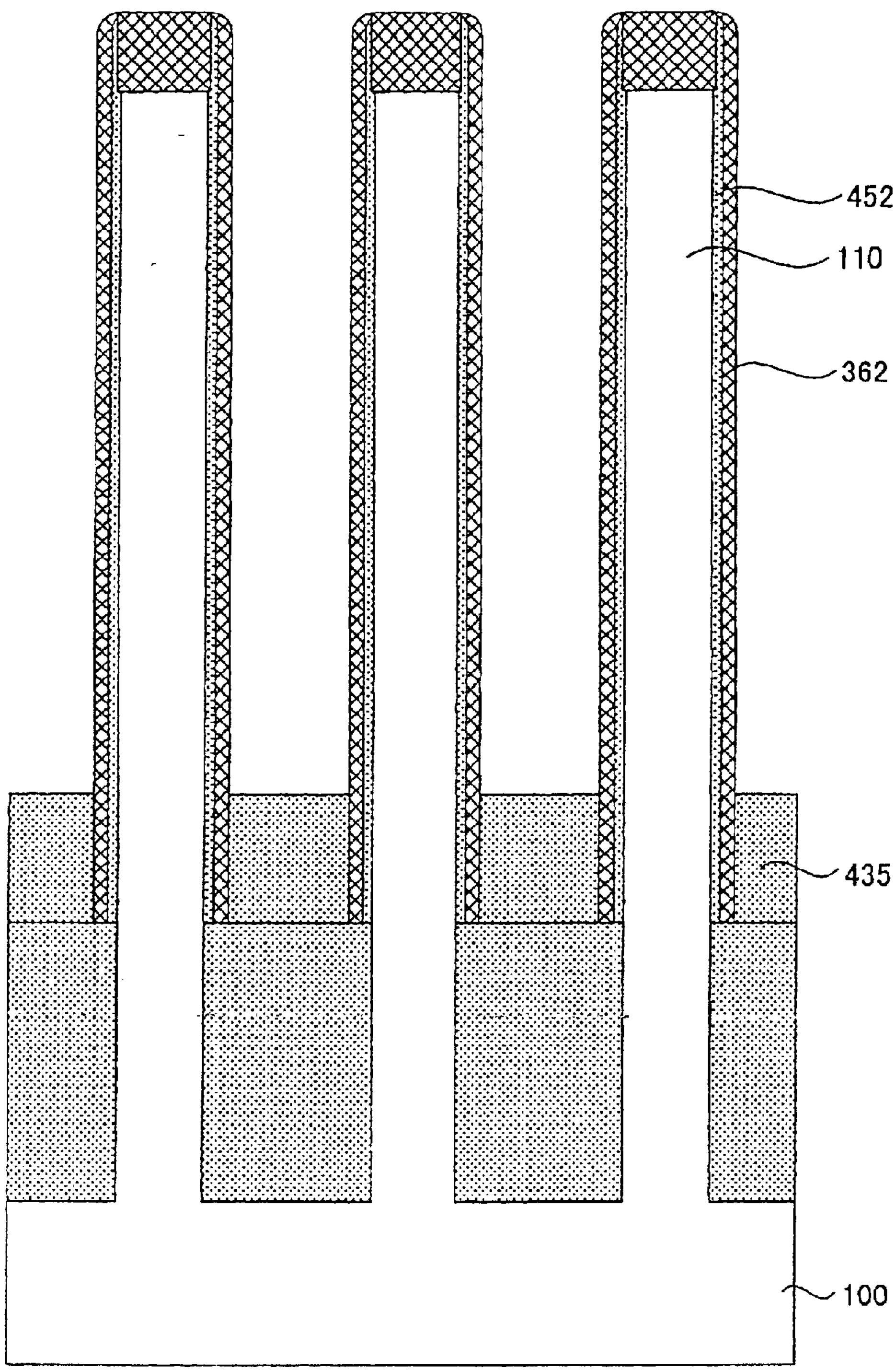
Figure 233:
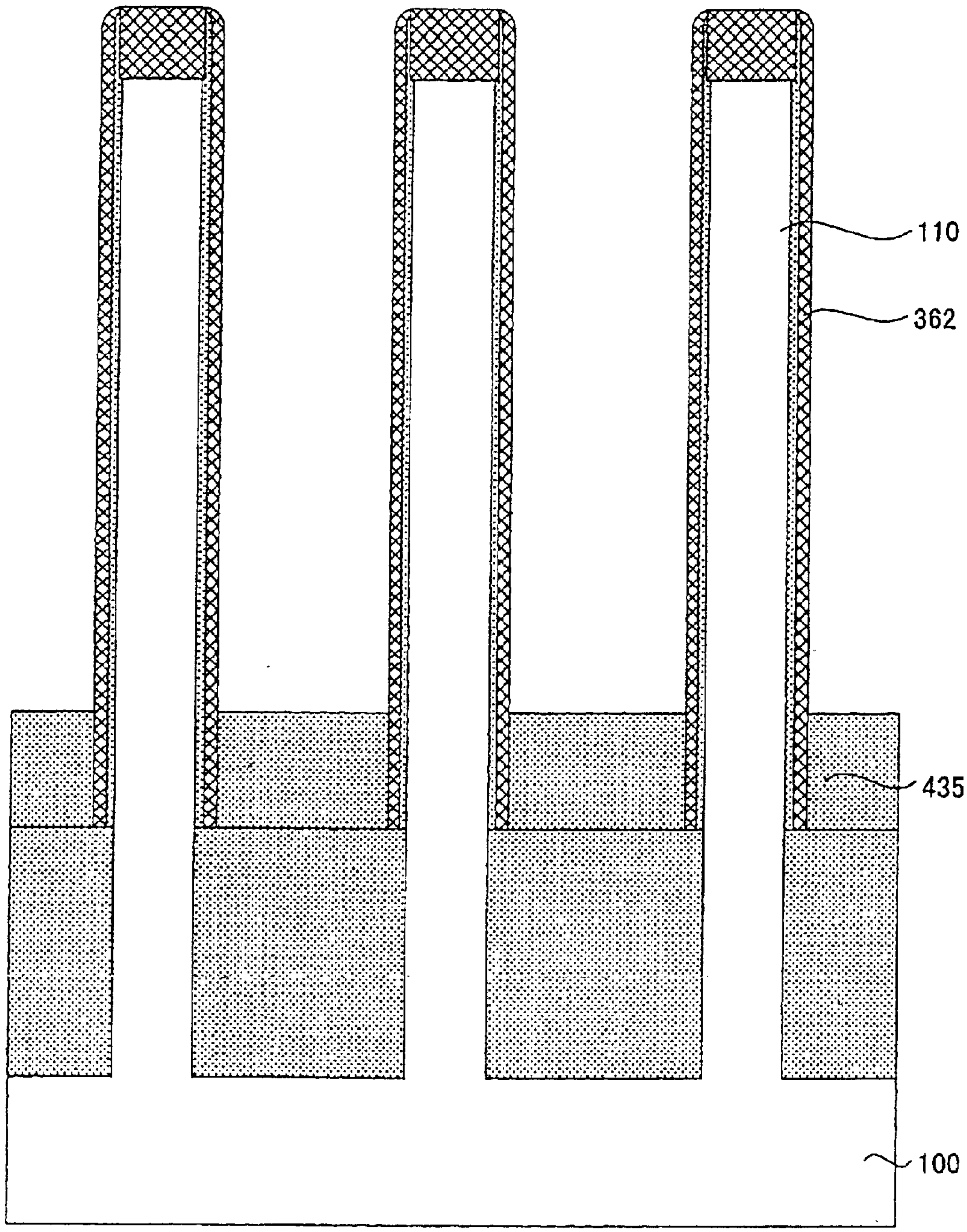

Next, a silicon oxide film 435, for example, is deposited to about 50 to 500 nm as a twenty-fifth insulating film, and is buried, for example, by isotropic etching to a degree such that the silicon oxide film 435 will reach at least the top end of a first conductive film 512 which is to be formed in a later production step (FIG. 223 and FIG. 233).

Figure 224:
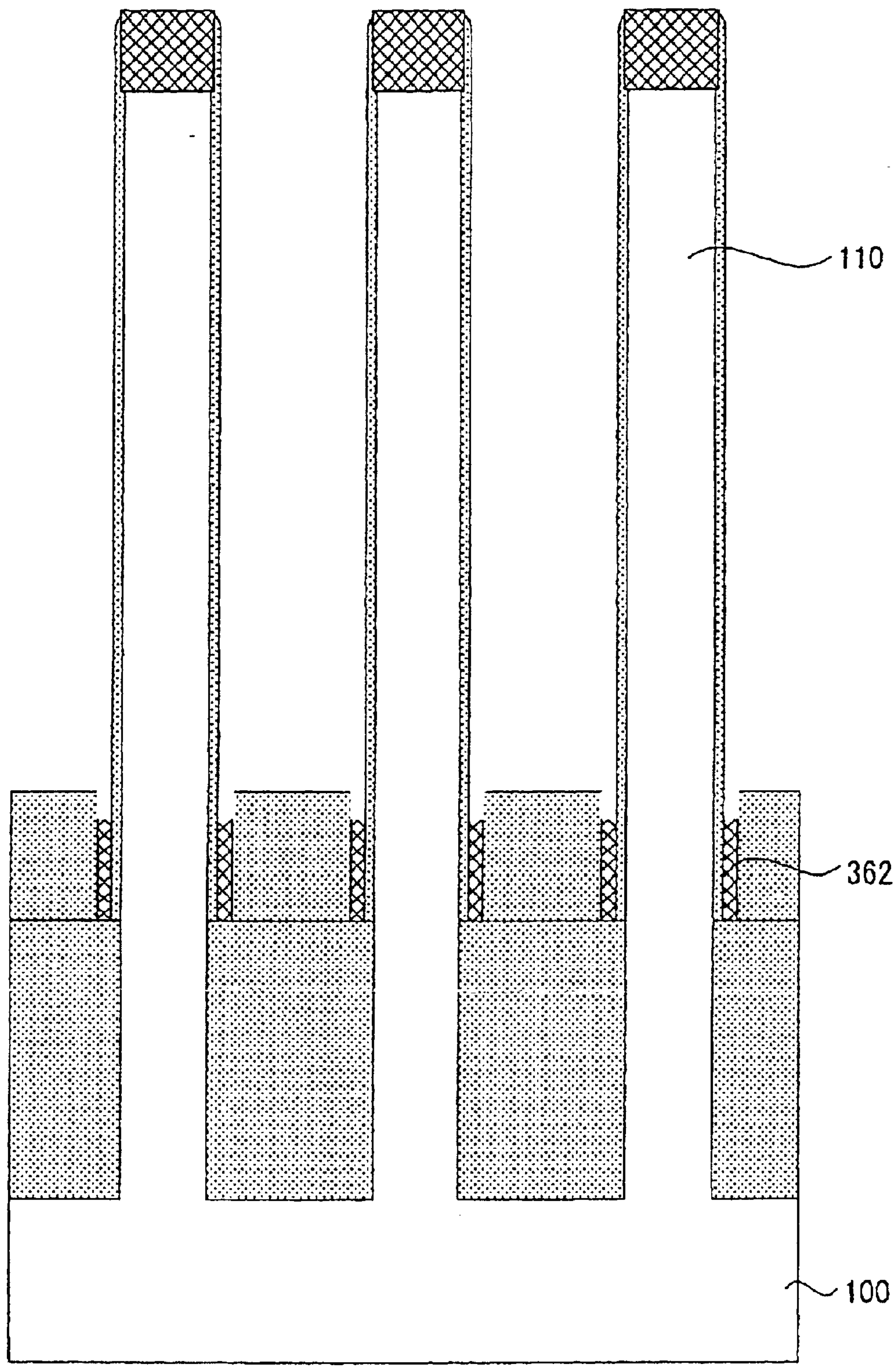
Figure 234:
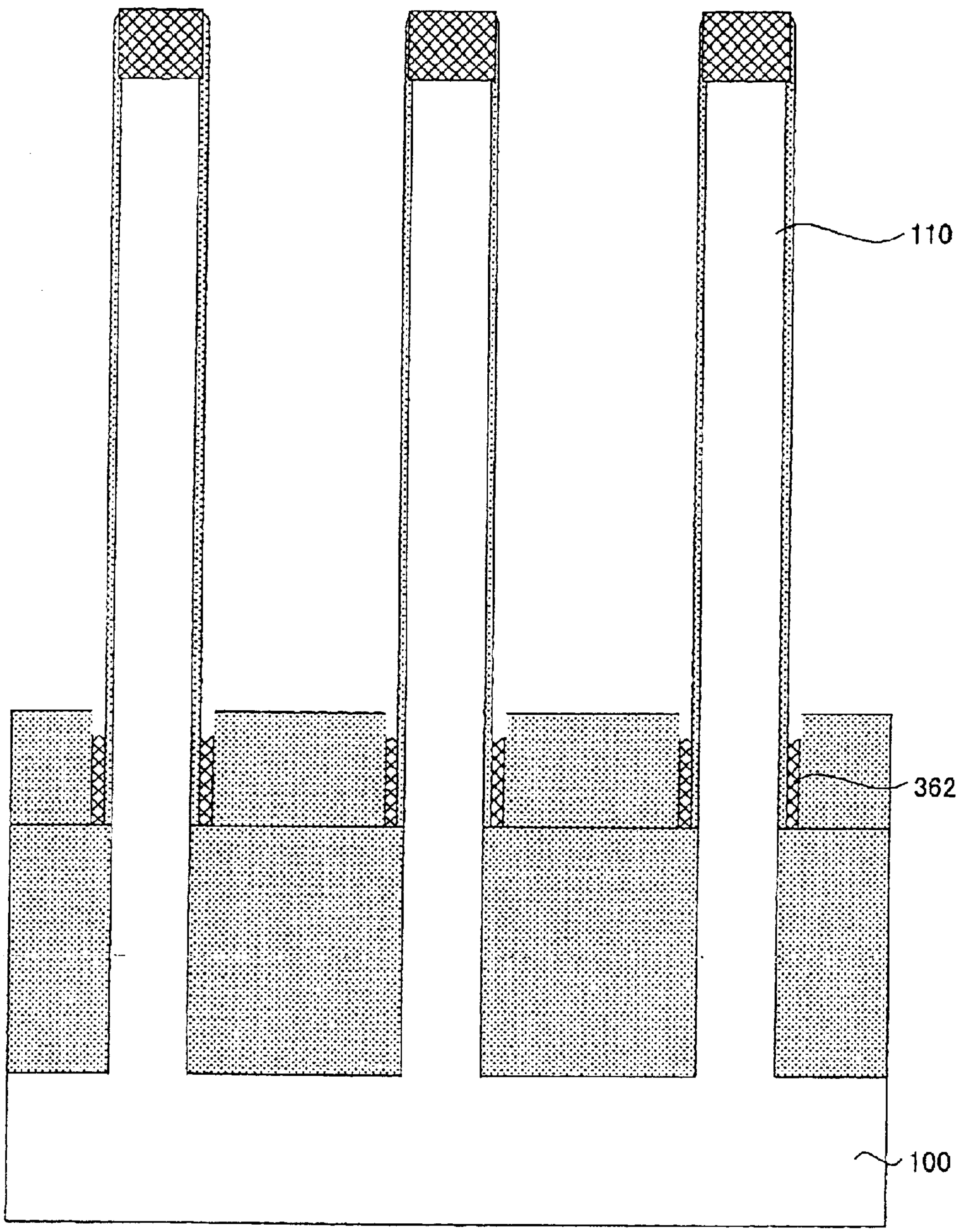

Subsequently, using the silicon oxide film 435 as a mask, the silicon nitride film 362 is isotropically etched to remain only between the silicon oxide film 452 and silicon oxide film 435 (FIG. 224 and FIG. 234). Thereby, the silicon nitride film 362 forms a recess with respect to the top surface of the silicon oxide film 435.

Figure 225:
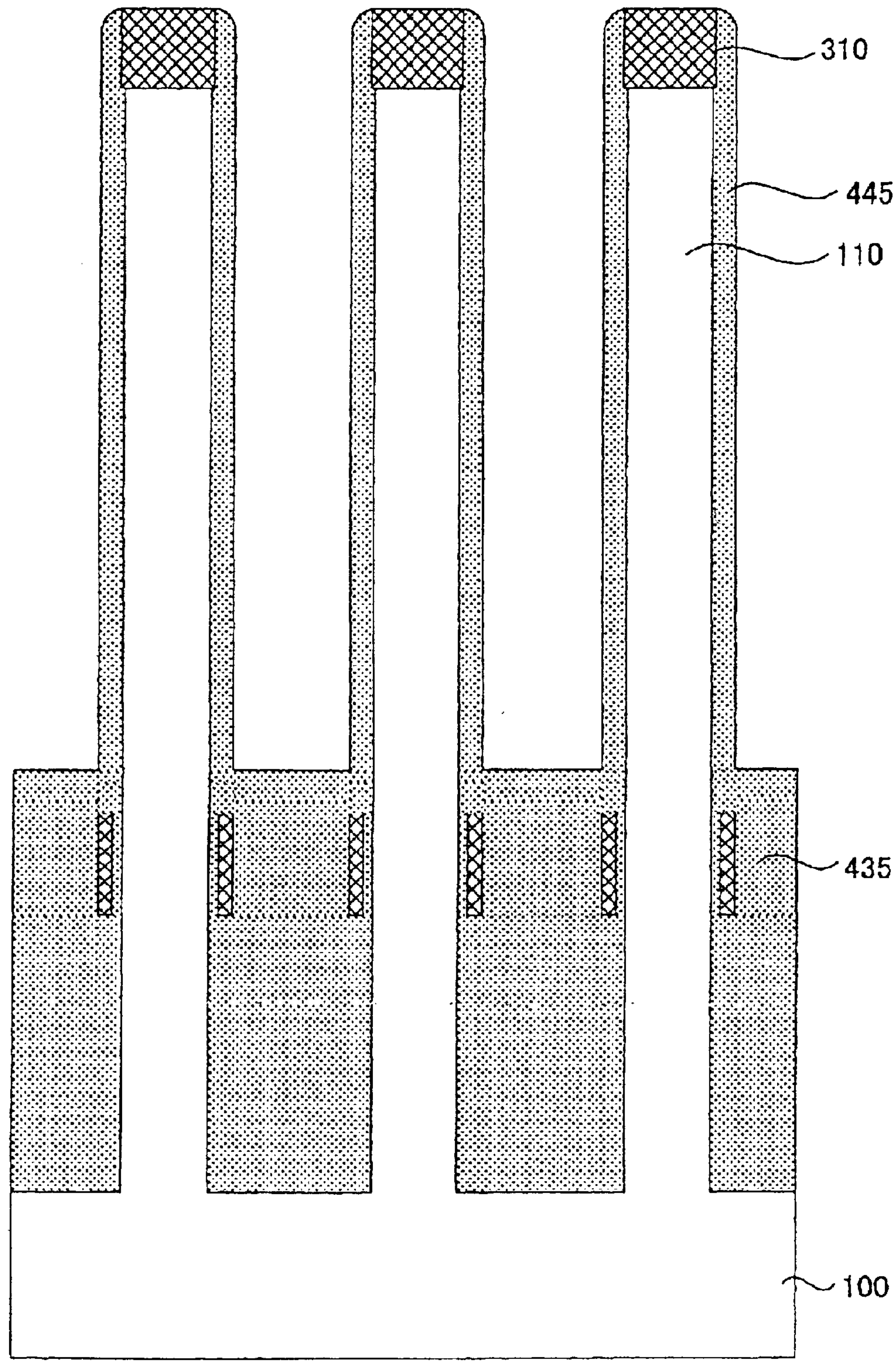
Figure 226:
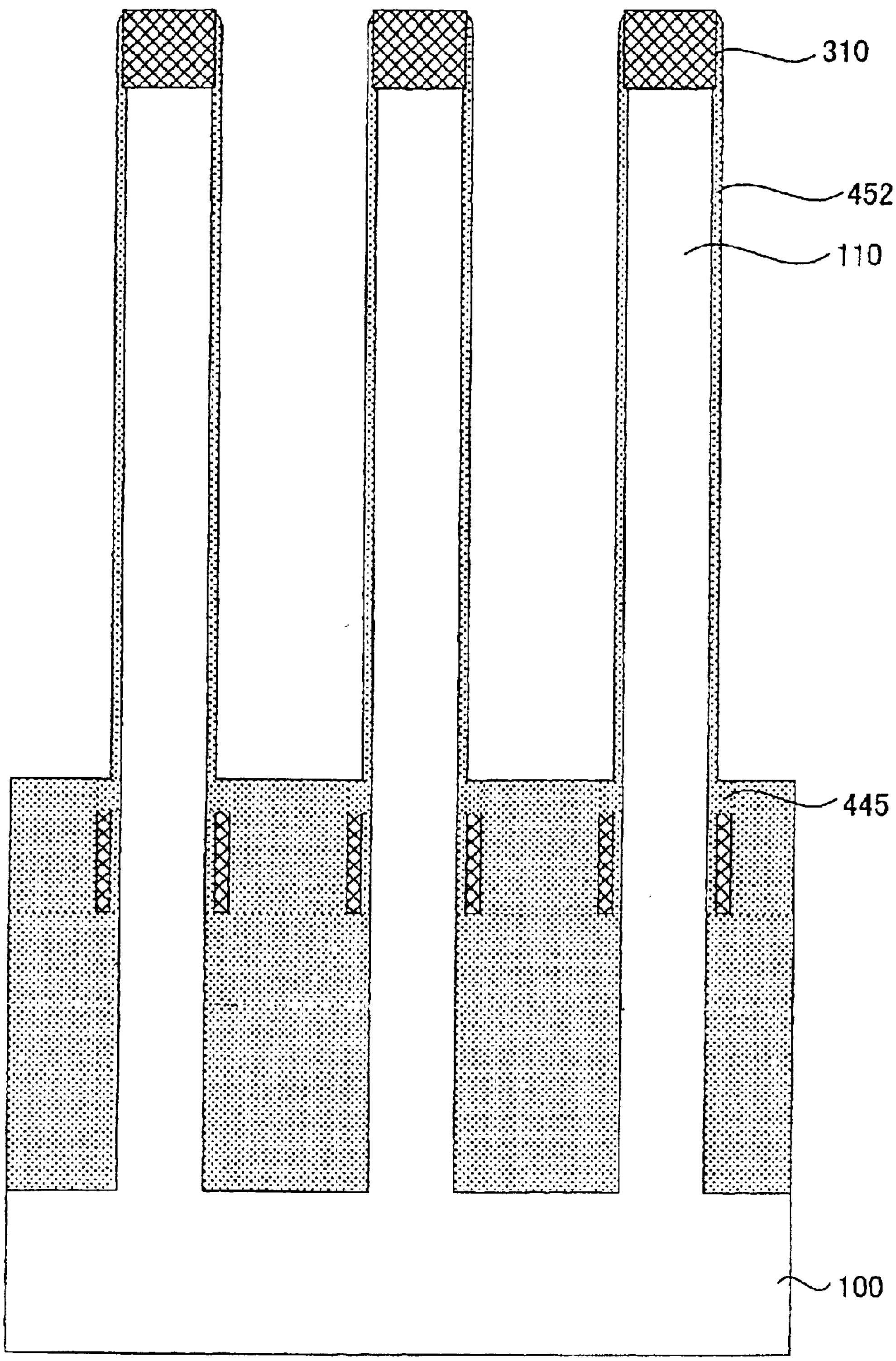
Figure 235:
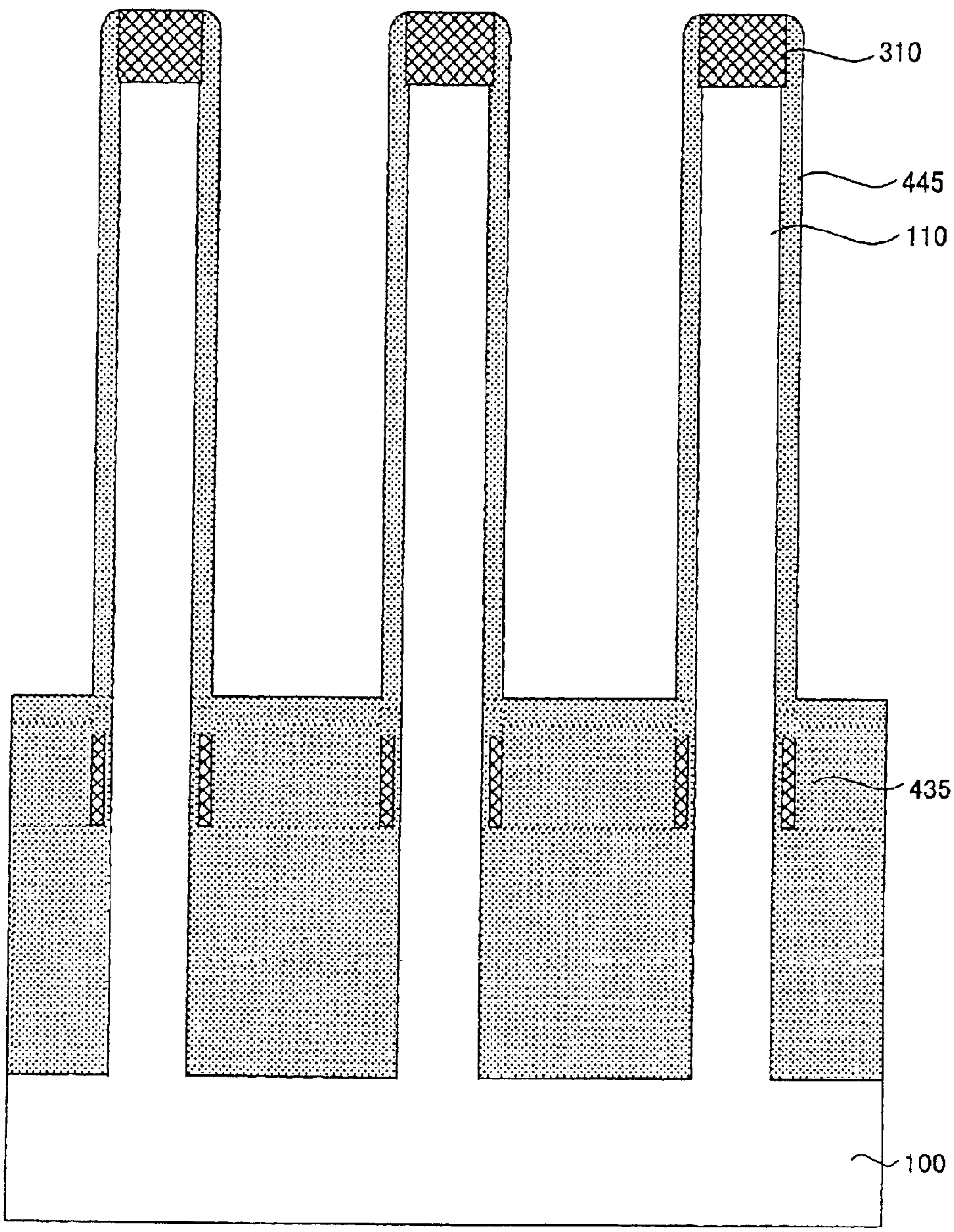
Figure 236:
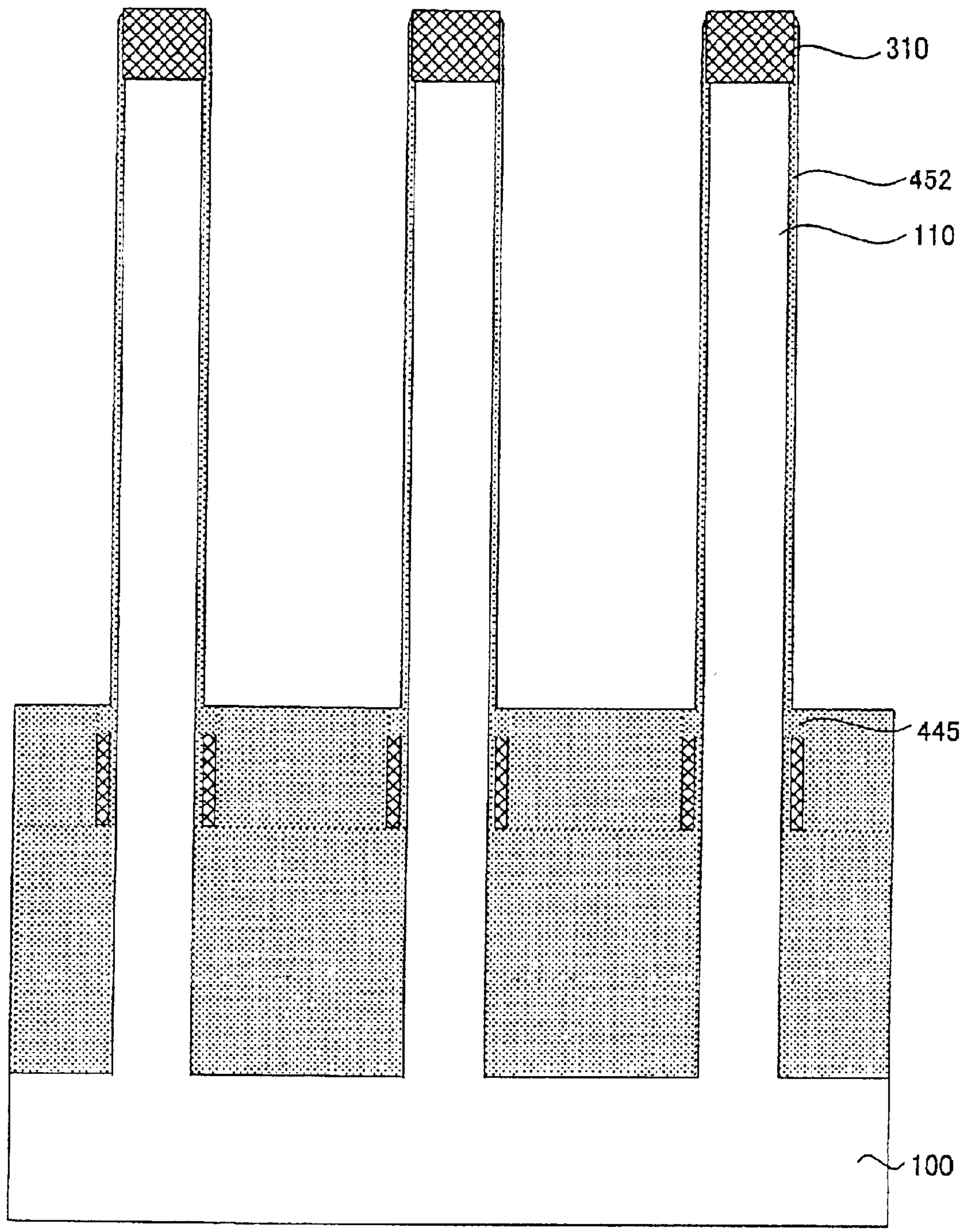

A silicon oxide film 445 is deposited to 3 to 30 nm as a twenty-sixth insulating film in this recess (FIG. 225 and FIG. 235). At this time, if the silicon oxide film 445 has about half or more the thickness of the silicon nitride film 362, the above-mentioned recess is buried with the silicon oxide film 445. Since the oxide film 445 also deposits on the sidewall of the silicon oxide film 452, the silicon oxide film 445 is removed from the sidewall of the silicon oxide film 452, for example, by isotropic etching. The silicon oxide film 452 may be once removed from the top surface of the silicon oxide film 435 and a similar film may be formed again. Thereby, the silicon oxide film 445 remains in the recess and the silicon nitride film 362 is buried with the silicon oxide film 435 and the silicon oxide film 445 (FIG. 226 and FIG. 236).

Figure 227:
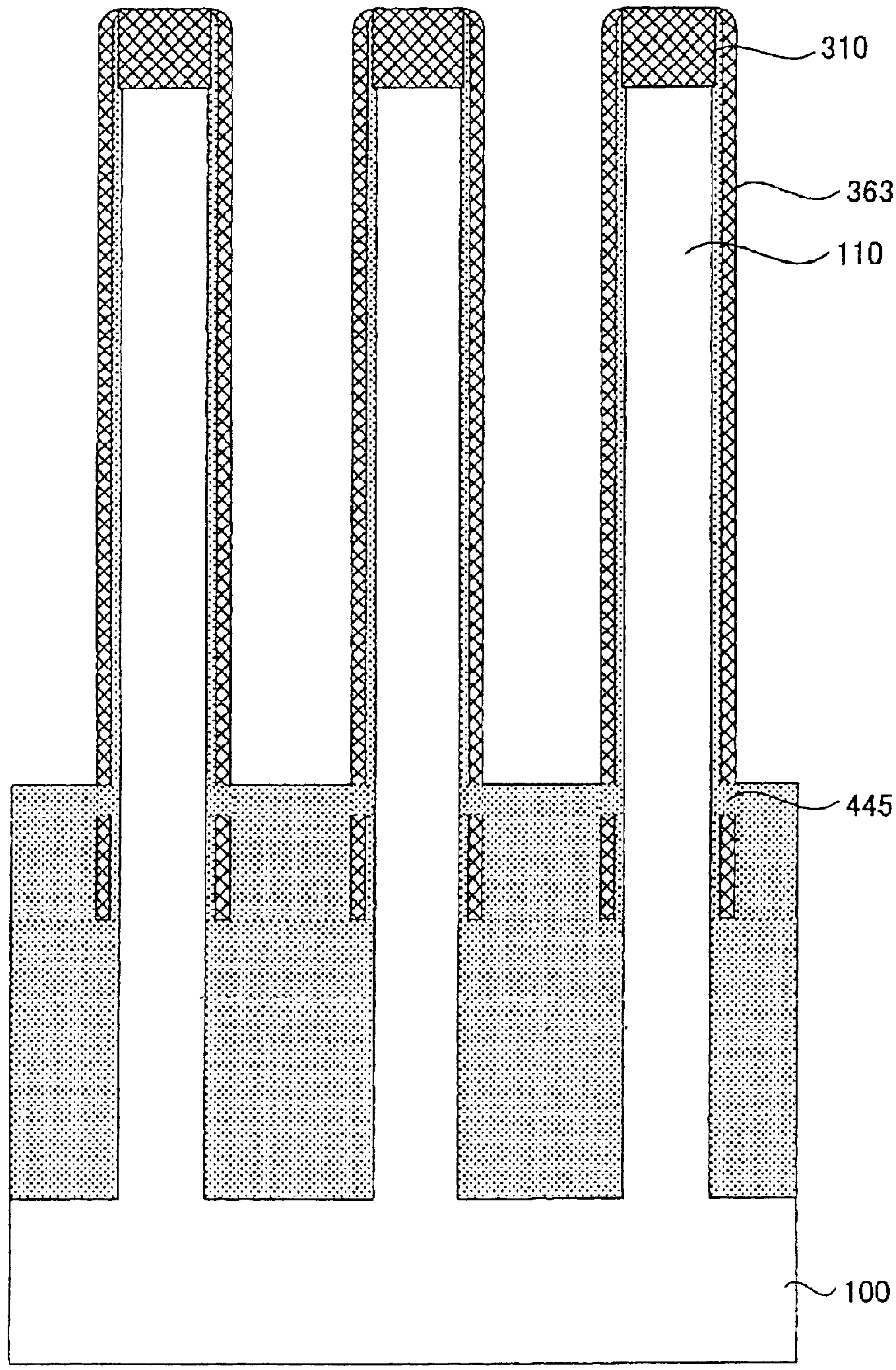
Figure 237:
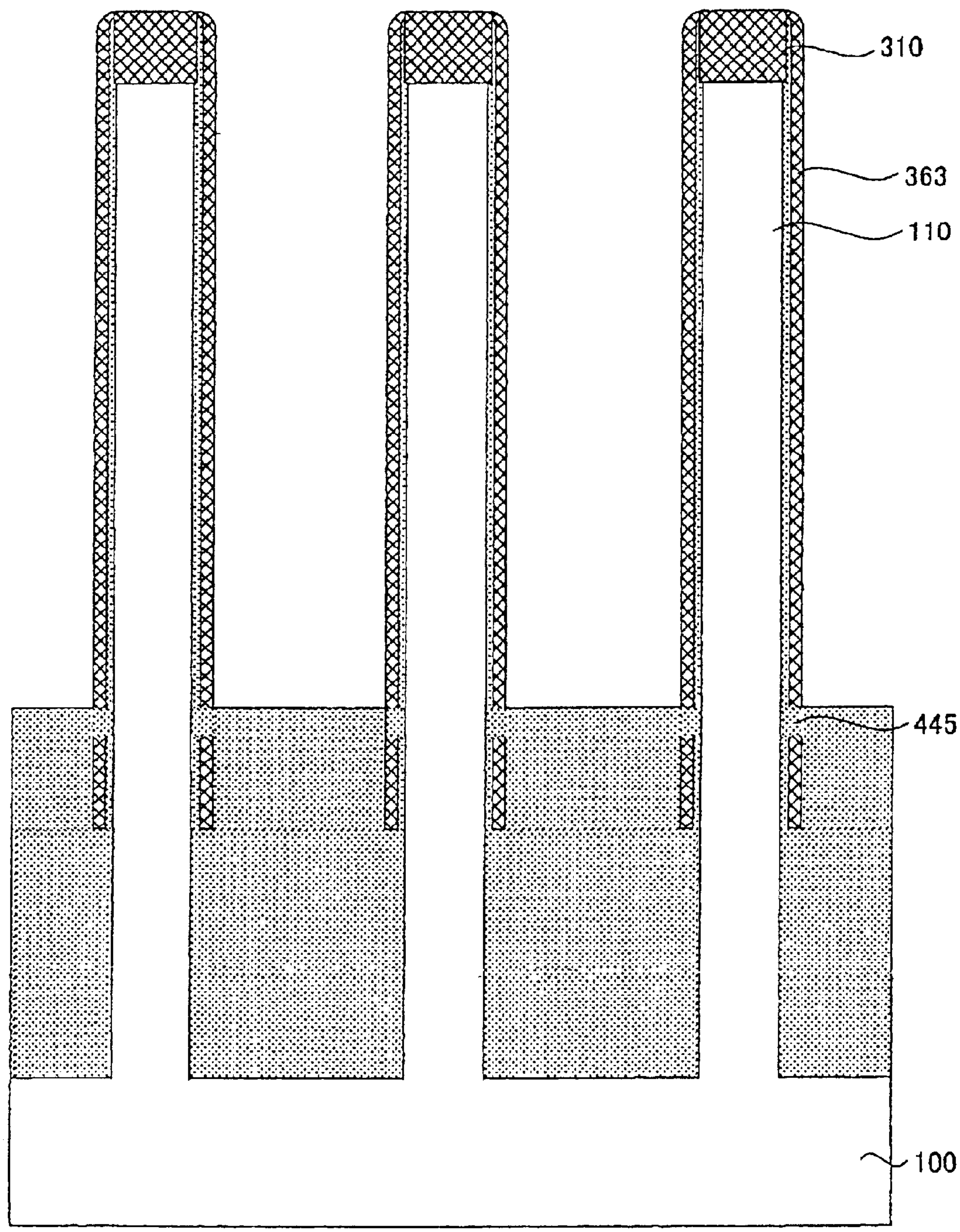

Subsequently, a silicon nitride film 363, for example, is deposited to about 5 to 50 nm as a twenty-seventh insulating film, and then is anisotropically etched to remain in the form of a sidewall on the sidewall of each island-like semiconductor layer 110 with intervention of the silicon oxide film 452 (FIG. 227 and FIG. 237).

Thereafter, a silicon oxide film 436 as a twenty-fifth insulating film is buried in the same manner as described above, and a silicon oxide film 446 as a twenty-sixth insulating film is disposed on the top of the silicon nitride film 363 in the form of a sidewall in the same manner as the silicon oxide film 445 is formed.

Next, in the same manner as described above, a silicon nitride film 364 as a twenty-seventh film is formed to remain in the form of a sidewall on the sidewall of each island-like semiconductor layer 110 with intervention of the silicon oxide film 452.

Figure 228:
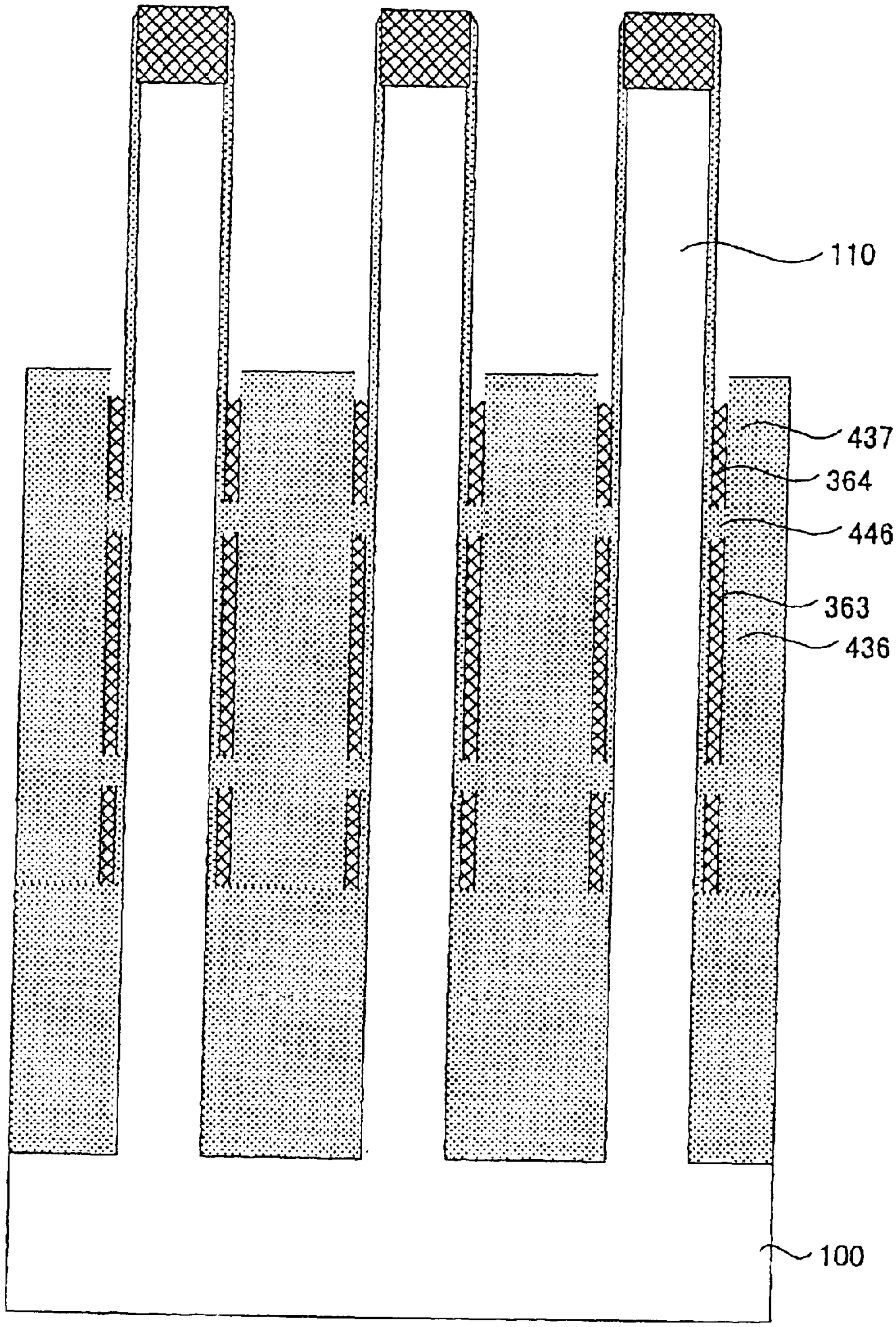
Figure 238:
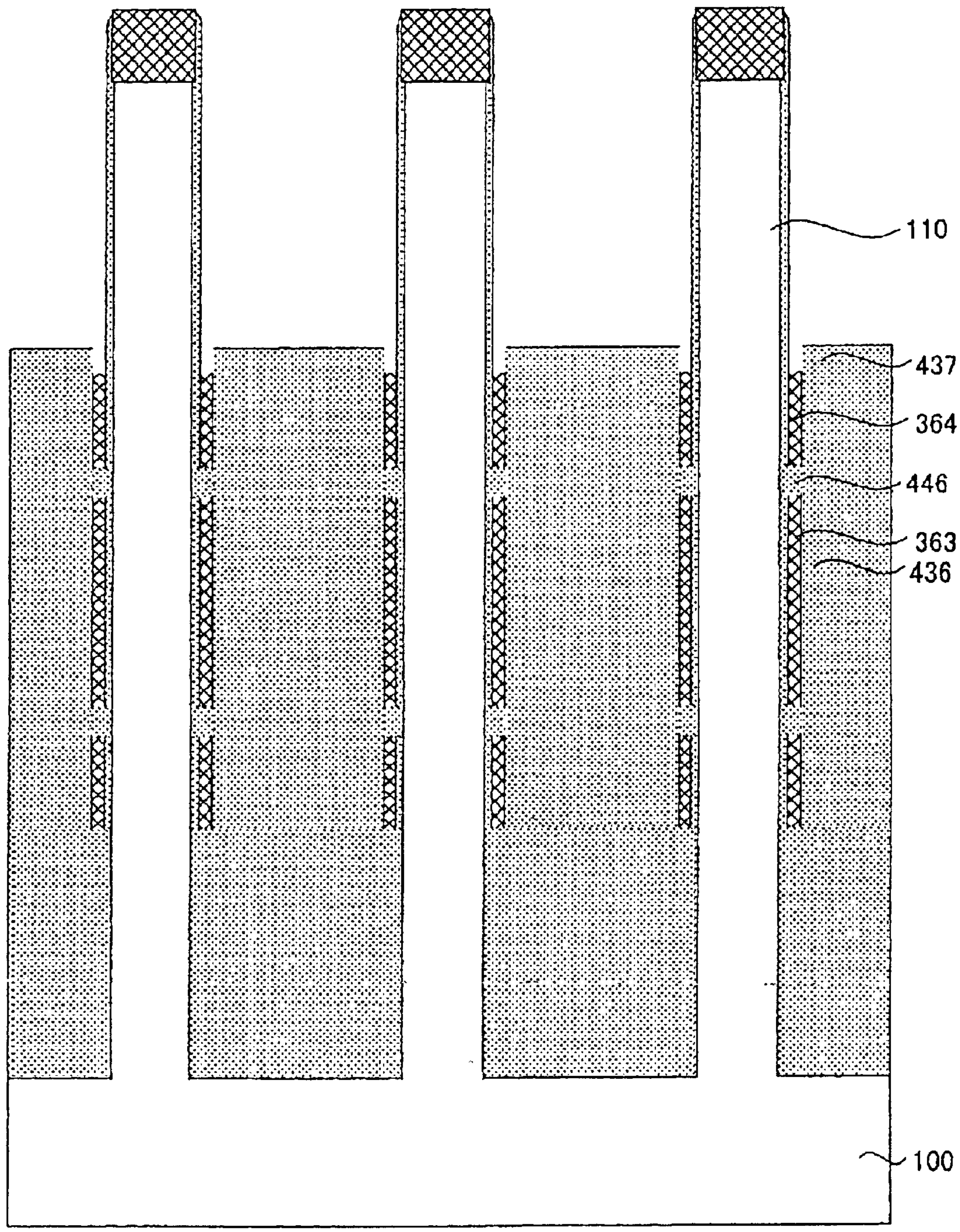

Subsequently, in the same manner as described above, a silicon oxide film 437 as a twenty-fifth insulating film is buried to a position such that the silicon oxide film 437 will overlap an impurity diffusion layer 723 which is to be formed later as an N-type semiconductor layer. The silicon nitride film 364 is etched to remain only between the silicon oxide film 452 and the silicon oxide film 437 in the same manner as the silicon nitride films 362 and 363 are etched (FIG. 228 and FIG. 238).

Figure 229:
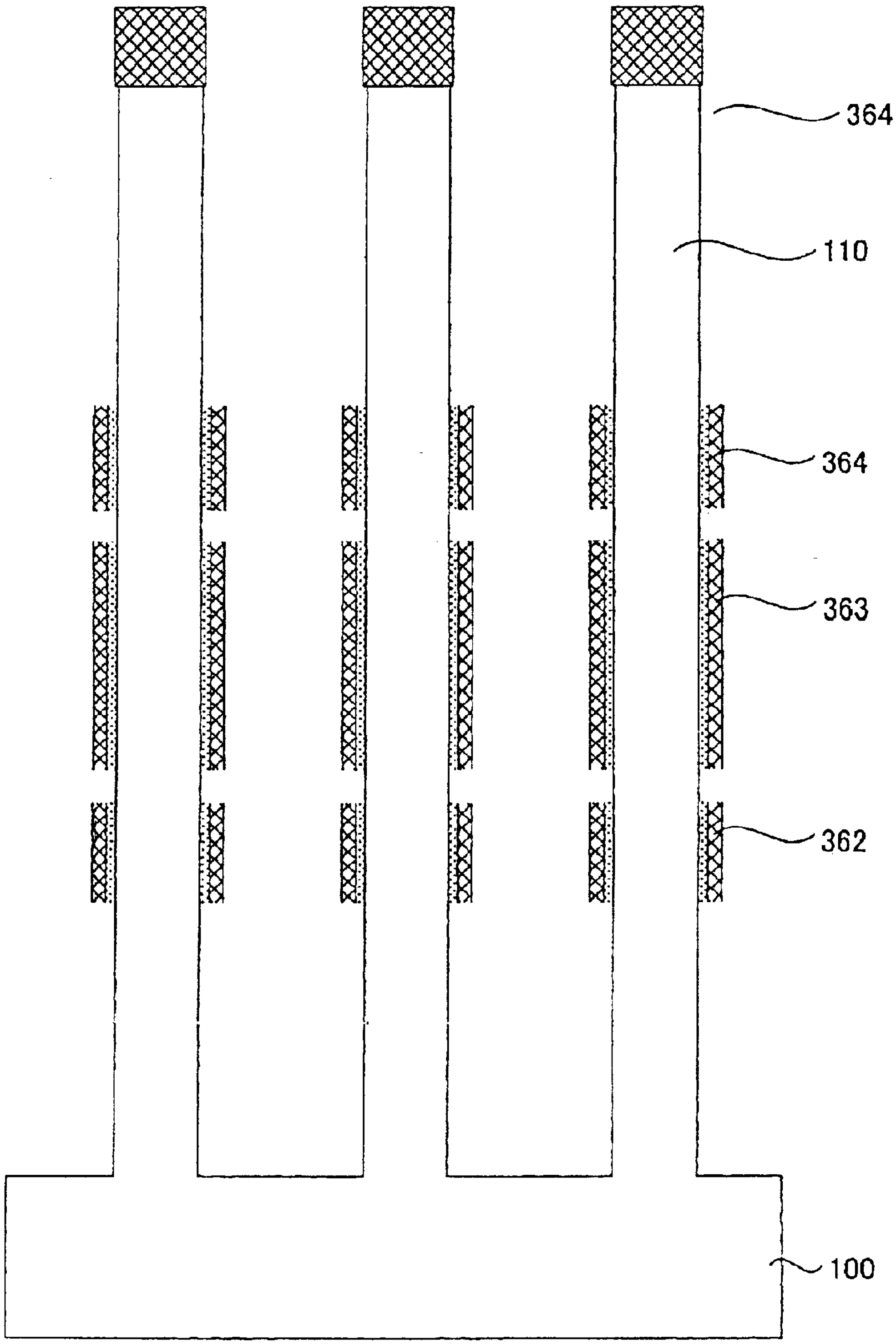
Figure 239:
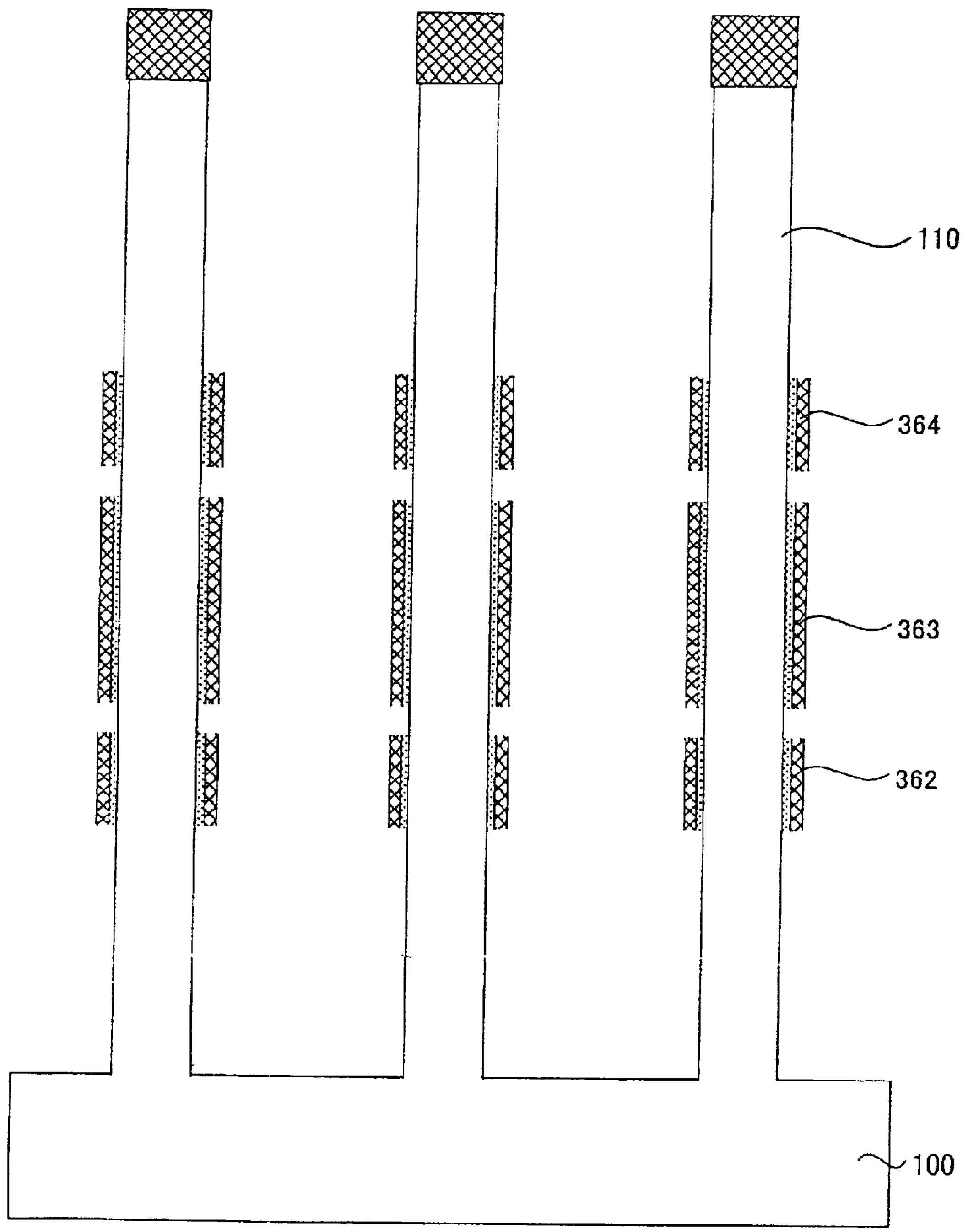

Thereafter, using the silicon nitride films 362, 363 and 364 as a mask, the silicon oxide films 435 and 436, the silicon oxide films 445 and 446 and the silicon oxide film 452 are removed by isotropic etching (FIG. 229 and FIG. 239).

Figure 230:
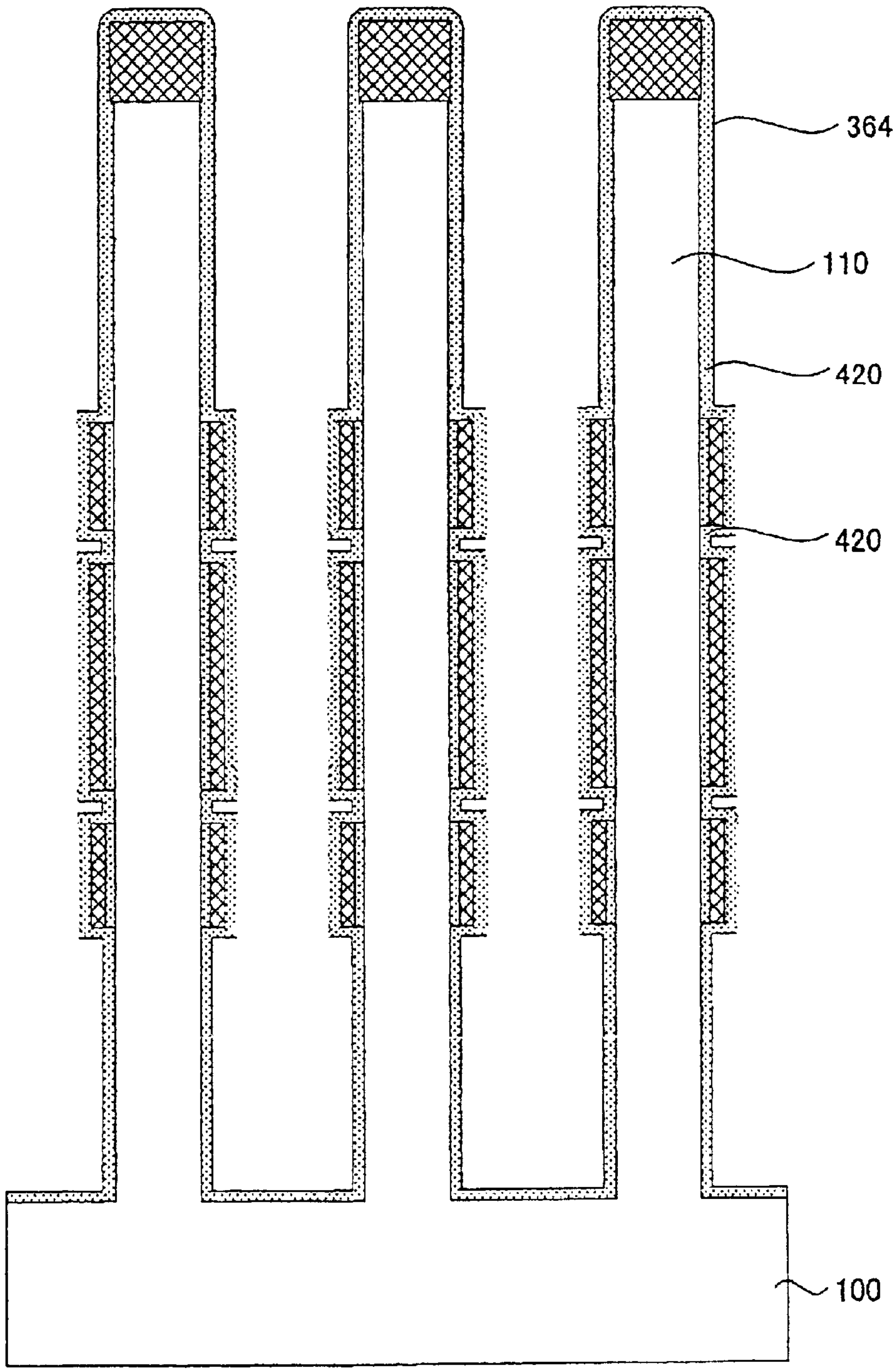
Figure 240:
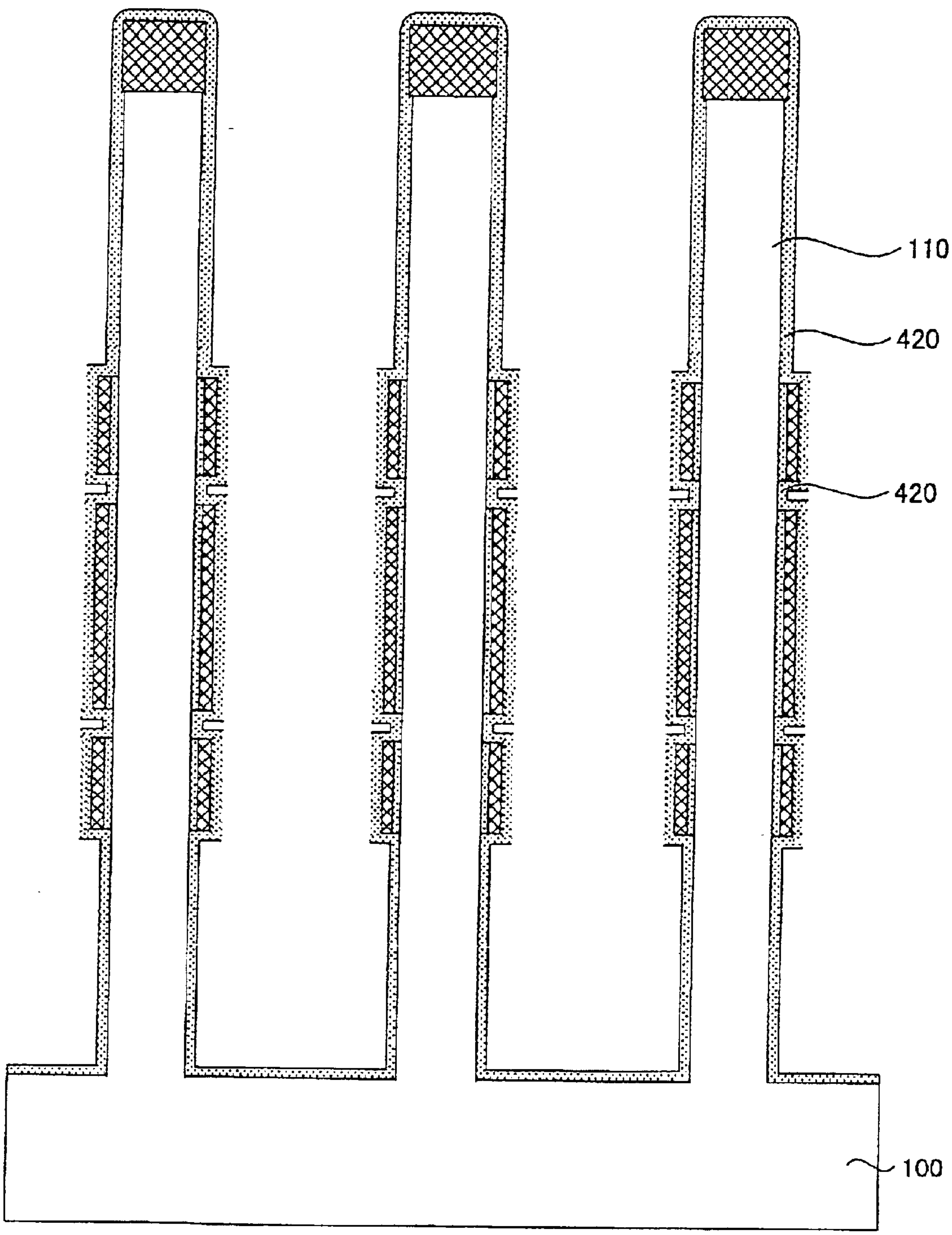

Subsequently, a silicon oxide film 420 is formed as a third insulating film to be a tunnel oxide film of about 10 nm thickness on the periphery of each island-like semiconductor layer 110, for example, by CVD (FIG. 230 and FIG. 240). At this time, the tunnel oxide film is not necessarily limited to a CVD film, but may be a thermally oxidized film or a nitrogen oxide film.

Figure 231:
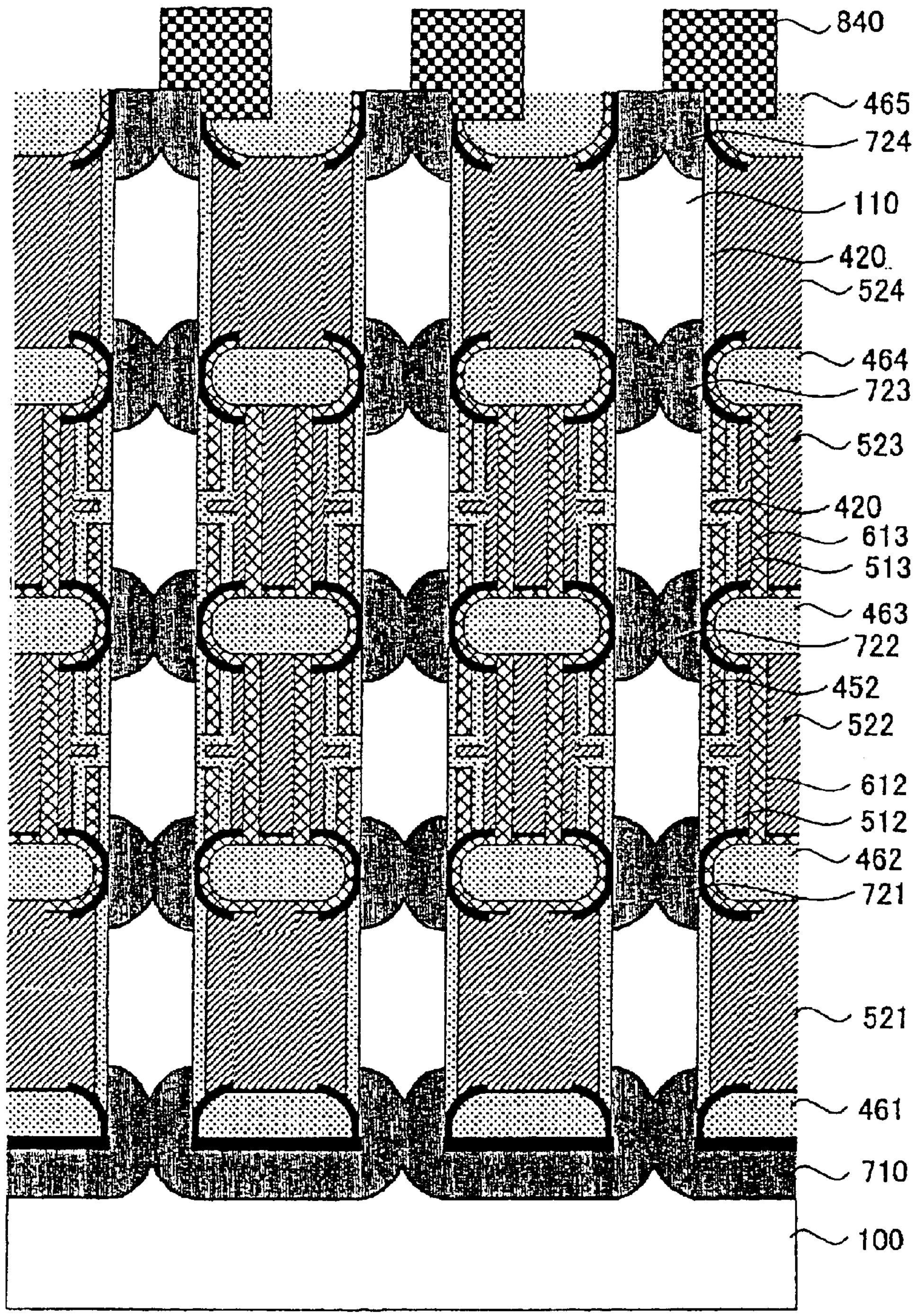
Figure 241:
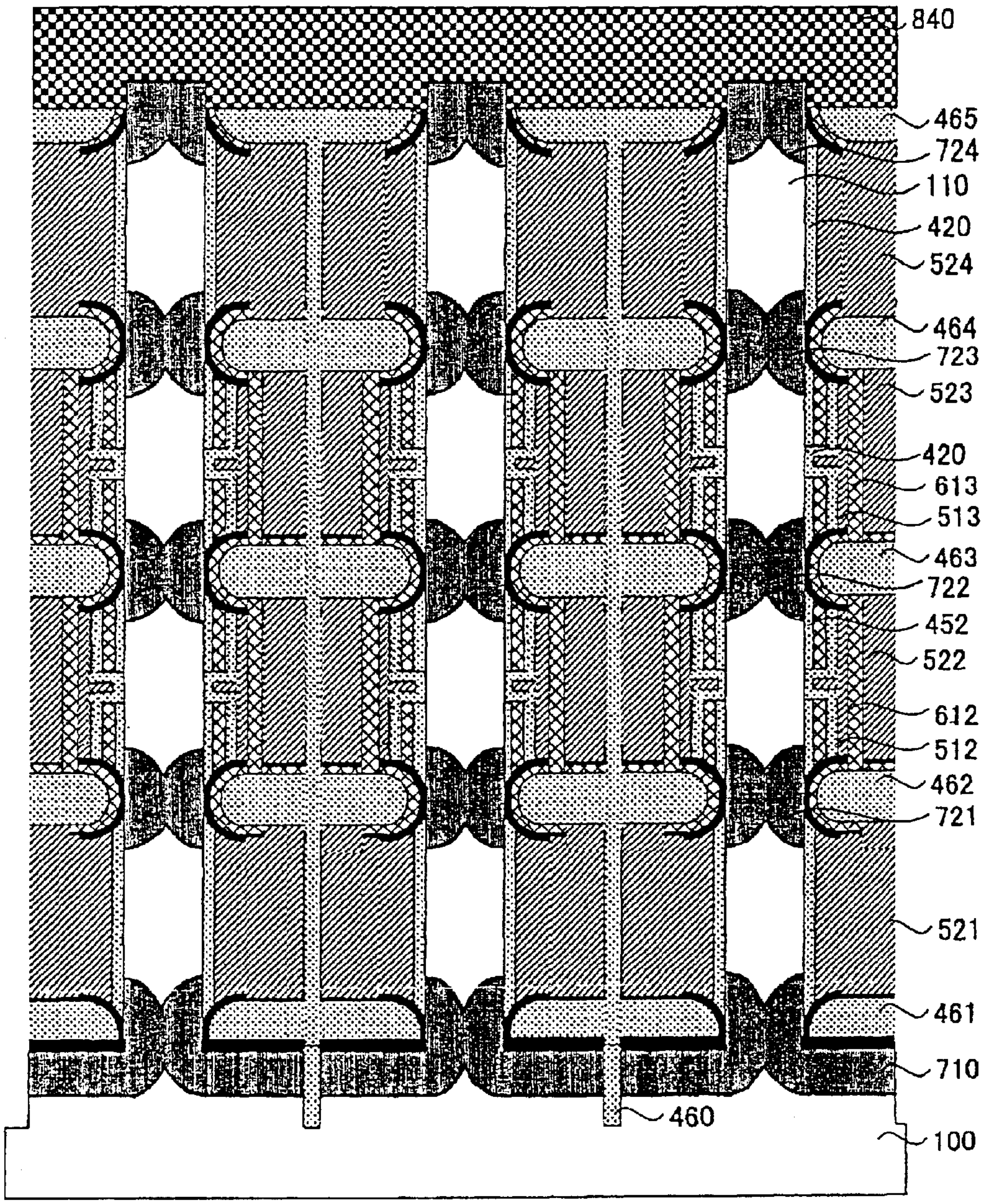

Thereafter, production steps are in accordance with those of Production Example 1 after a polysilicon film 510, for example, to be a first conductive film is deposited to about 50 to 200 nm (FIG. 231 and FIG. 241).

It is sufficient that the silicon oxide film 420 which is the third insulating film to be a tunnel oxide film between the silicon nitride films 362 and 363 and between the silicon nitride films 363 and 364 is formed between the desired first conductive film and island-like semiconductor layer 110. For example, the silicon oxide film 420 may be unevenly distributed on the top or at the bottom of the polysilicon film or may be partially overlapped with the impurity diffusion layer.

Where the silicon nitride films 362, 363 and 364 remain when the silicon oxide film 420 is formed, the insulating film intervening between the floating gates and the island-like semiconductor layers 110 is of MONOS structure by the silicon oxide film 452, the silicon nitride films 362, 363 and 364 and the silicon oxide film 420. However, it is possible to prevent tunnel current to the silicon nitride film of the MONOS structure by controlling the thickness of the selection gates, the floating gates, the island-like semiconductor layers 110 and the silicon oxide film 452.

Further, when the silicon oxide film 420 is formed by thermal oxidation or the like, the formed oxidized film may have or may not have isotropy, as in the above-described Example 1.

Figure 242:
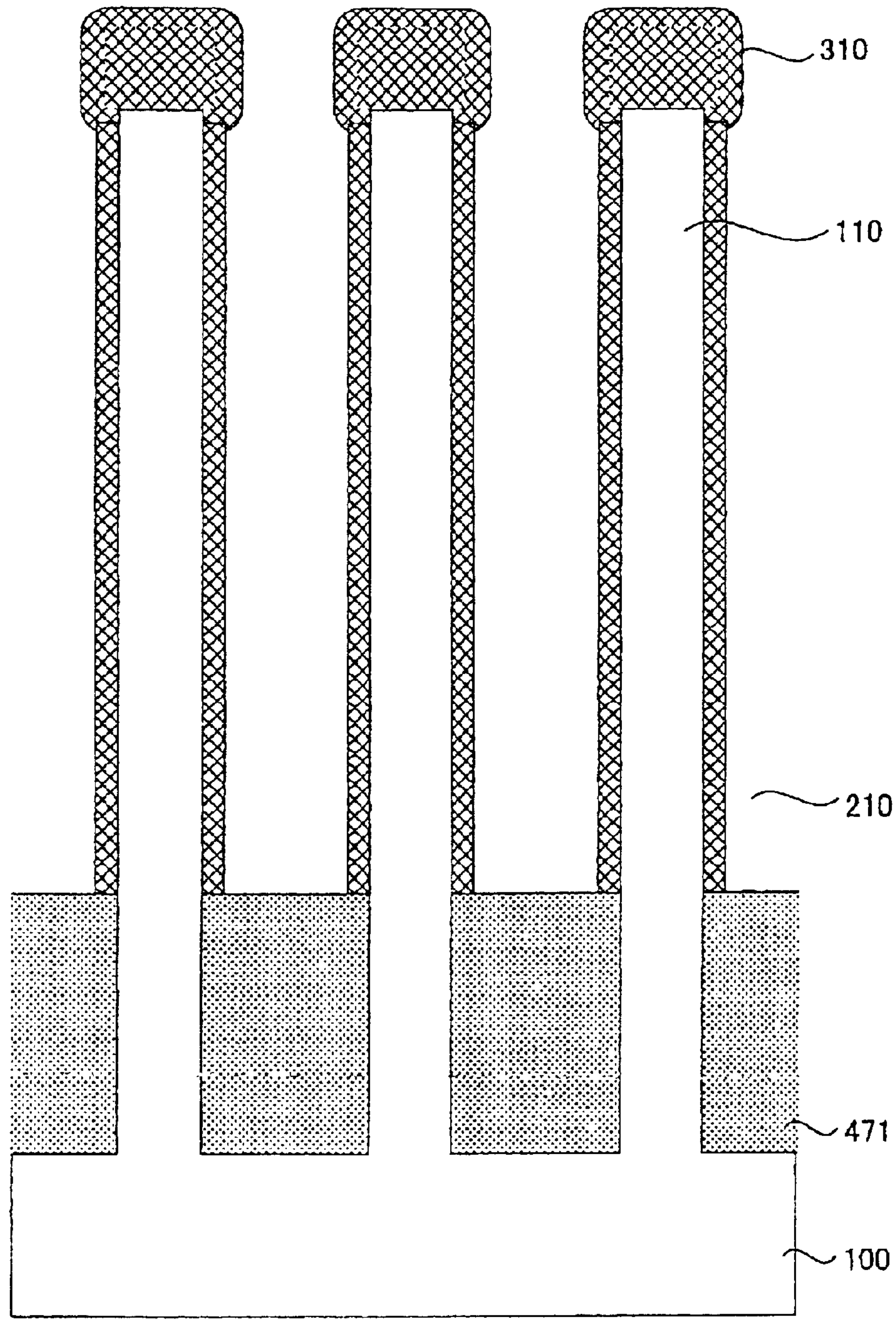
Figure 243:
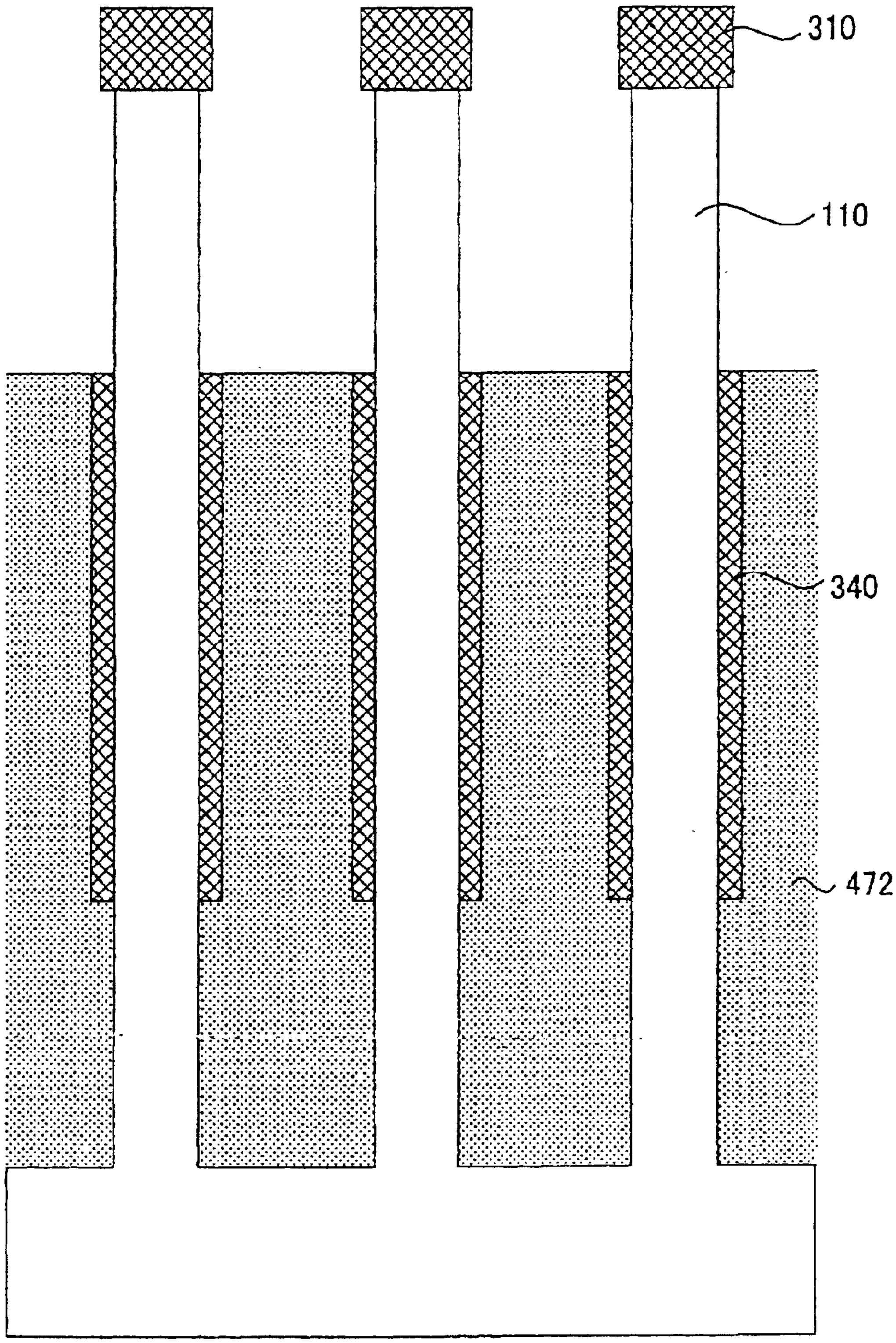
Figure 244:
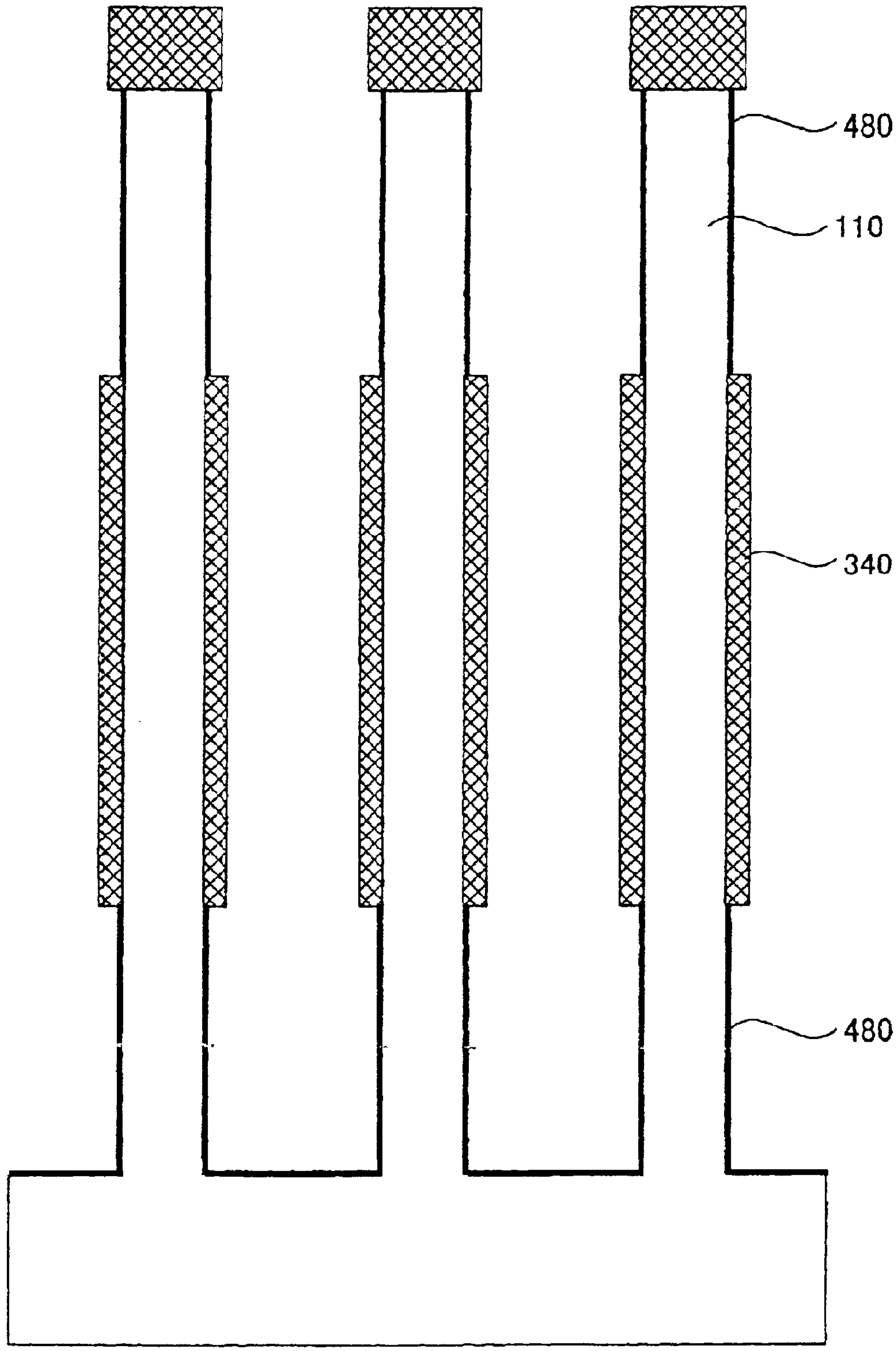
Figure 245:
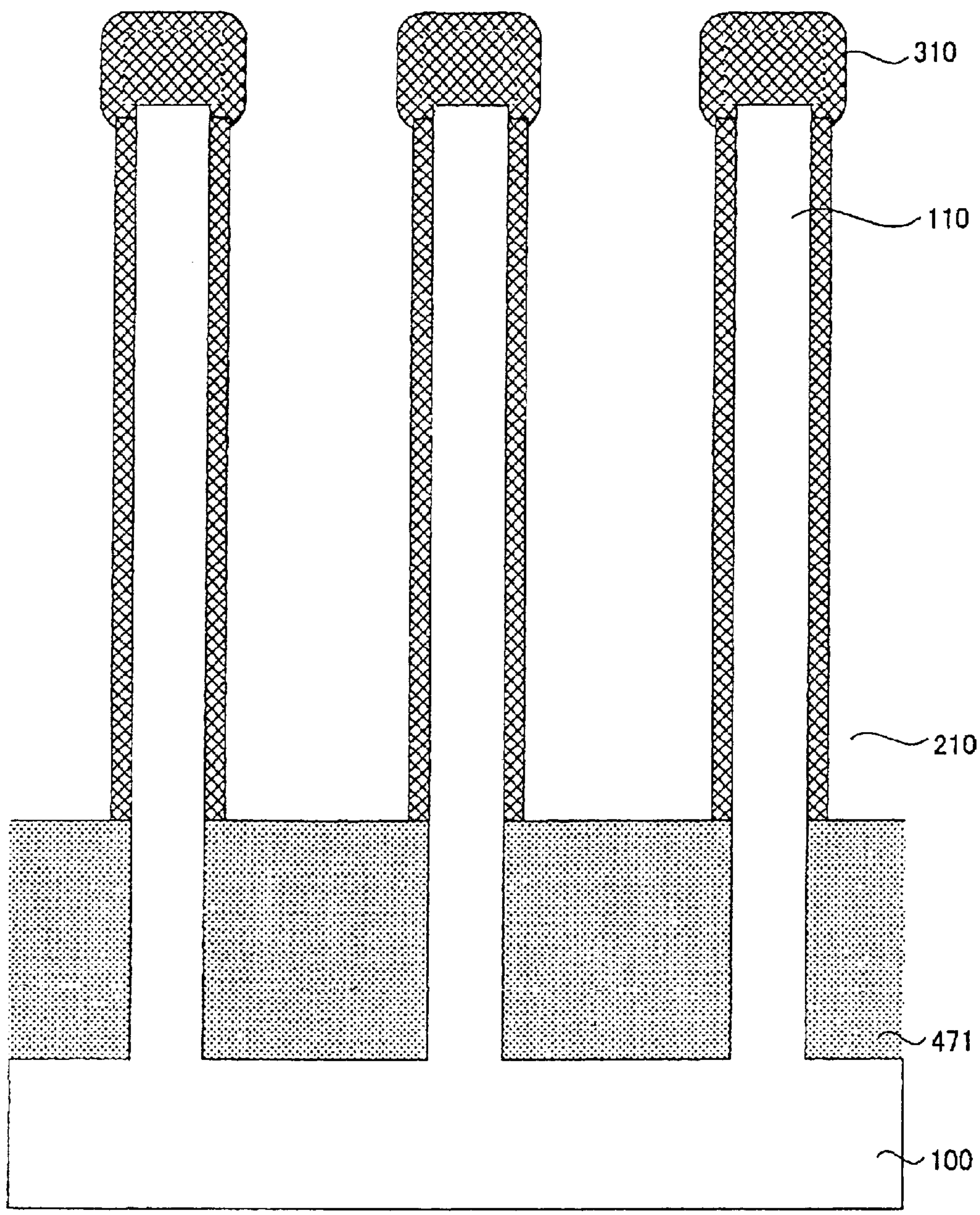
Figure 246:
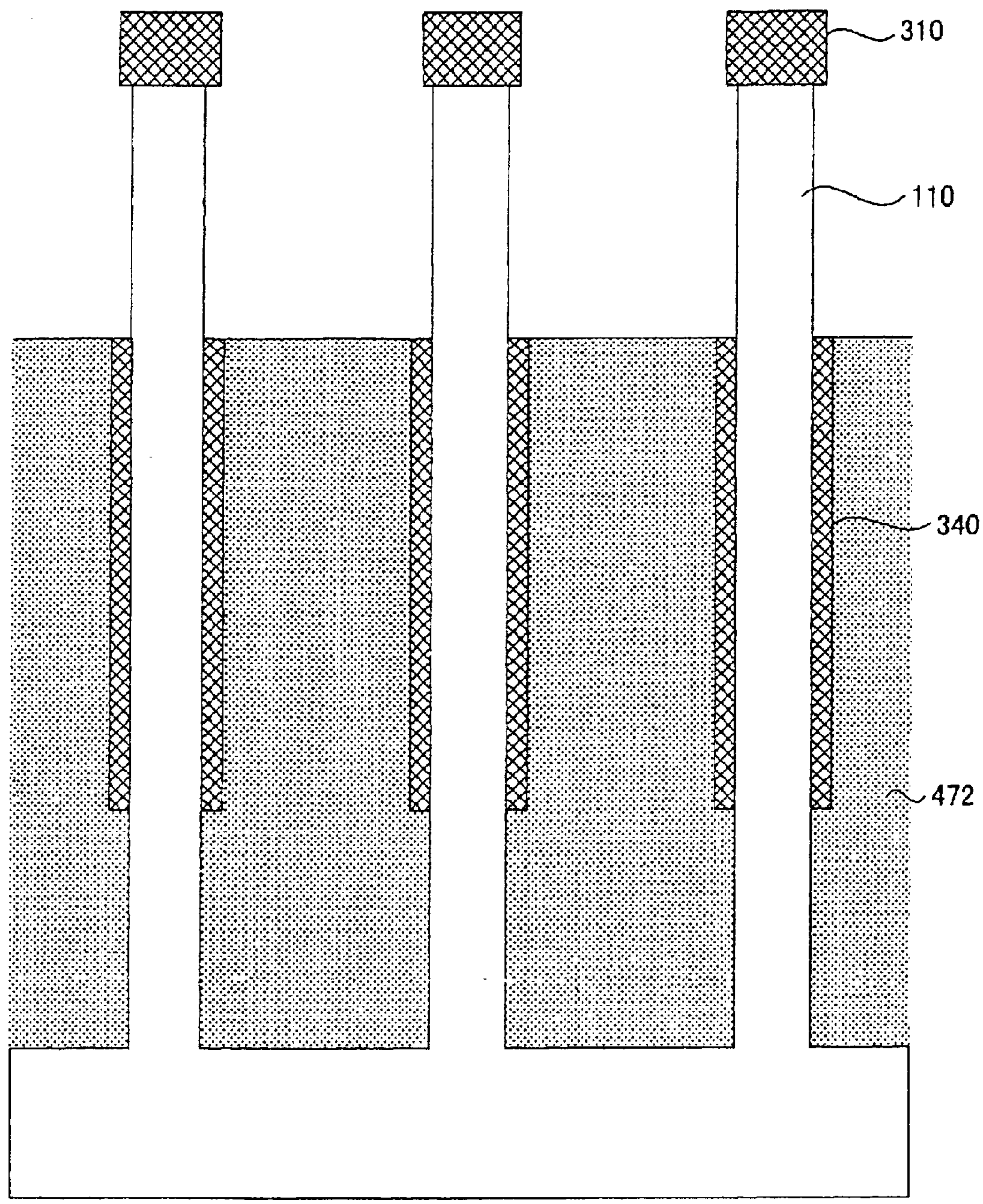
Figure 247:
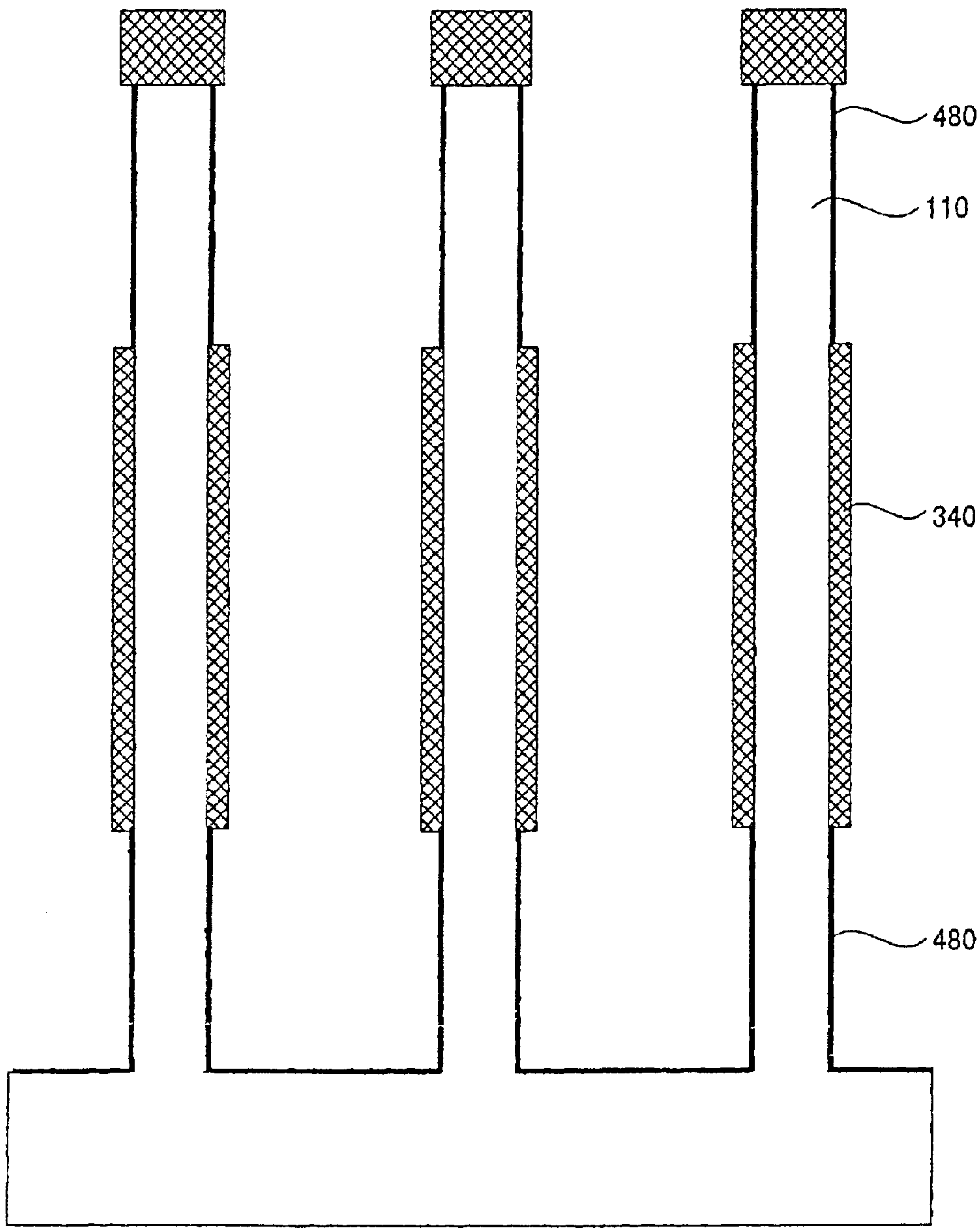

Further, as required, after the channel ion implantation is carried out on the sidewalls of the island-like semiconductor layers 110, for example, by slant ion implantation (FIGS. 85 to 87 and FIGS. 106 to 108), a silicon nitride film 471, for example, may be deposited to 50 to 500 nm as an eleventh insulating film and isotropically or anisotropically etched to be buried in the first trench 210 to about the height of the top end of the lower selection gate. Thereafter, a silicon nitride film 340, for example, may be deposited to 5 to 50 nm as a twelfth insulating film to form a sidewall (FIG. 242 and FIG. 245). Subsequently, a silicon oxide film 472 may be deposited to 50 to 500 nm in the same manner as the eleventh insulating film and isotropically or anisotropically etched to be buried in the first trench 210 to about the height of the bottom end of the upper selection gate. Thereafter, using the silicon oxide film 472 which is an eleventh insulating film as a mask, the sidewall of the silicon nitride film 340 may be partially removed by isotropic etching (FIG. 243 and FIG. 246). Subsequently, an oxide film 480 of about 15 to 25 nm is formed as a thirteenth insulating film on the periphery of each island-like semiconductor layer 110, for example, using thermal oxidation (FIG. 244 and FIG. 247). Then, the sidewall of the silicon nitride film 340 is removed and a silicon nitride film 434, for example, is deposited to 50 to 500 nm as a twenty-fifth insulating film. Thereafter, the same production steps as described above in Production example 1 may be carried out so that the thickness of the gate insulating films of the selection gate transistors is larger than the thickness of the gate insulating films of the memory transistors.

Also, after the sidewall of the silicon nitride film 340 is removed, this production example may be combined with any one of the other production examples.

By the above-described production method, it is possible to simultaneously form the selection gates and the floating gates of the respective transistors of the semiconductor memory device in which the selection gates are formed on the top and at the bottom of the island-like semiconductor layers and the area of the tunnel oxide films between the floating gates of the memory cells and the island-like semiconductor layers is smaller than the area of the floating gates contacting the island-like semiconductor layers.

PRODUCTION EXAMPLE 8

With regard to Production Example 1, this example is particularly shown for forming the tunnel oxide film partially on the periphery of the pillar-form island-like semiconductor layer 110.

FIGS. 248 to 251 and 252 to 255 are sectional views taken on line A-A' and line B-B', respectively, in FIG. 1 illustrating a memory cell array of EEPROM.

In this example, production steps are the same as those in Production Example 1 until the thermally oxidized film 410 is formed as the second insulating film, the thermally oxidized film 410 is etched away and as required the channel ion implantation is carried out on the sidewalls of the island-like semiconductor layers using slant ion implantation.

Subsequently, a silicon oxide film 431, for example, is deposited to 50 to 500 nm as a fifth insulating film in the first trench 210 by CVD, and is buried to a desired depth of the first trench 210 by etching back the silicon oxide film 431. At this time, the silicon oxide film 431 may be deposited without etching away the thermally oxidized film 410 and be etched back to the desired depth.

Thereafter, a silicon oxide film 481, for example, is formed as a thirteenth insulating film to be a tunnel oxide film of about 10 nm thickness on the periphery of each island-like semiconductor layer 110, for example, by CVD. At his time, the tunnel oxide film is not necessarily limited to the CVD film, but may be a thermally oxidized film or a nitrogen oxide film.

Figure 248:
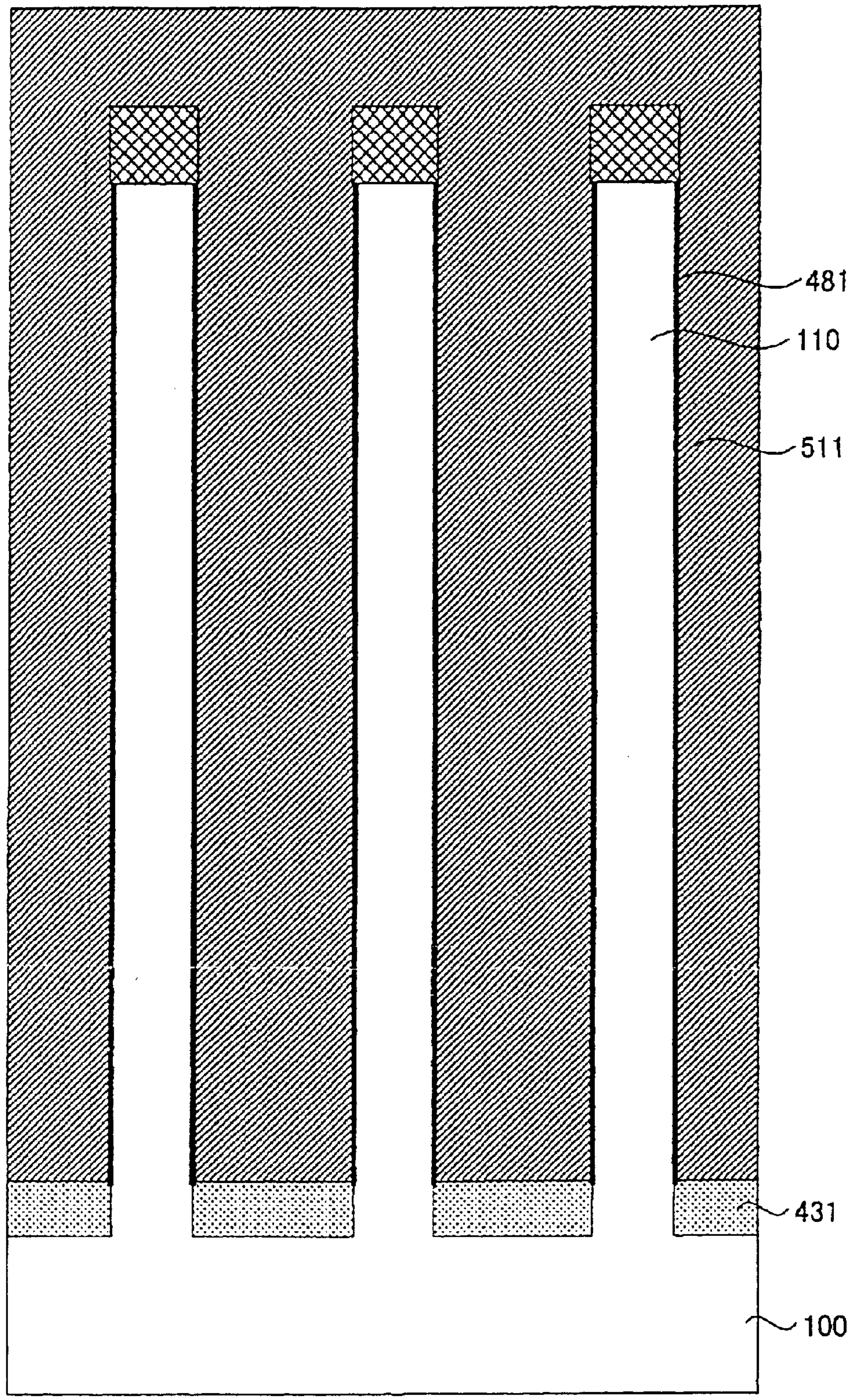
Figure 252:
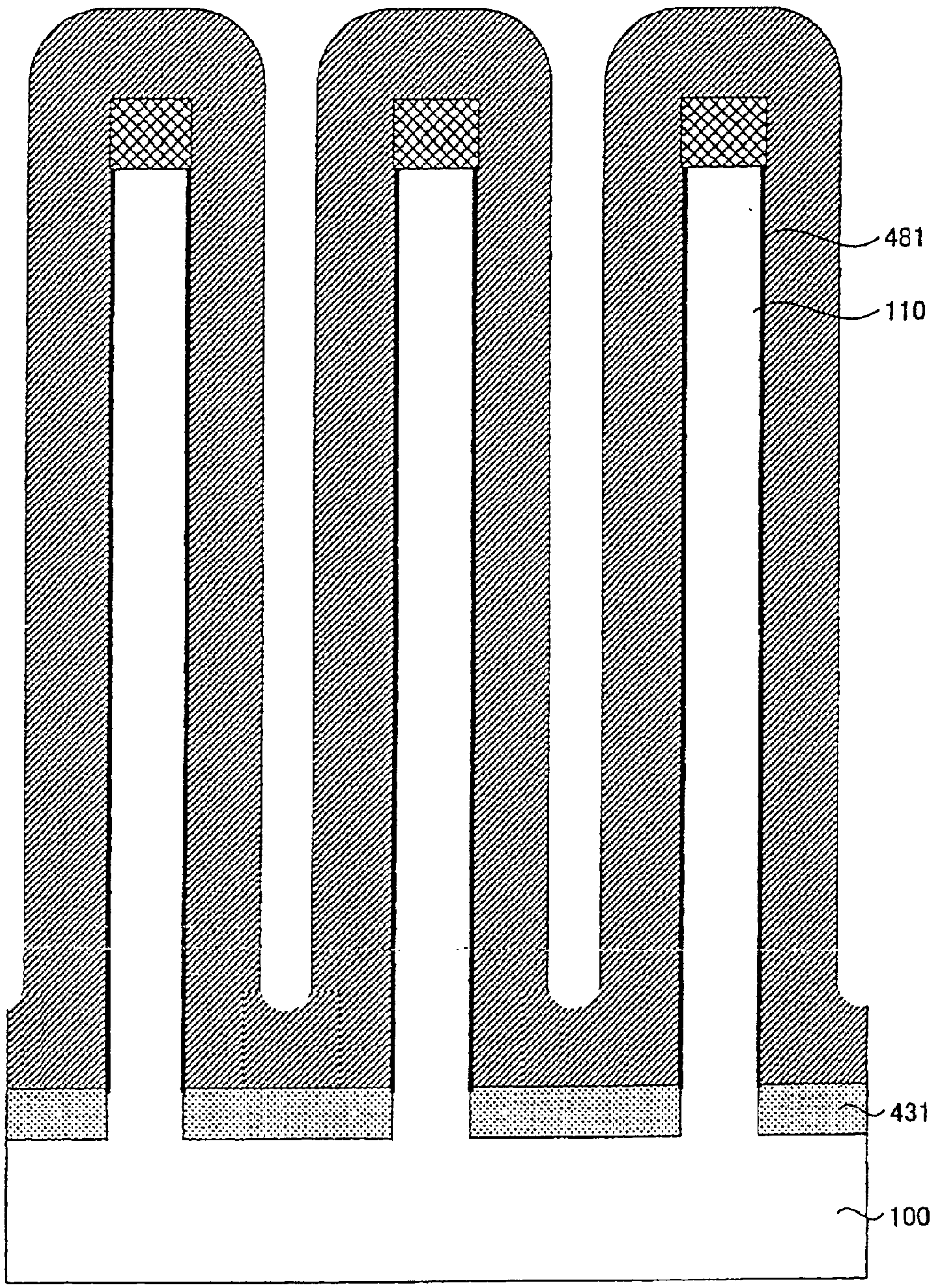

Subsequently, a polysilicon film 511 is deposited to about 50 to 200 nm as a first conductive film (FIG. 248 and FIG. 252).

Figure 249:
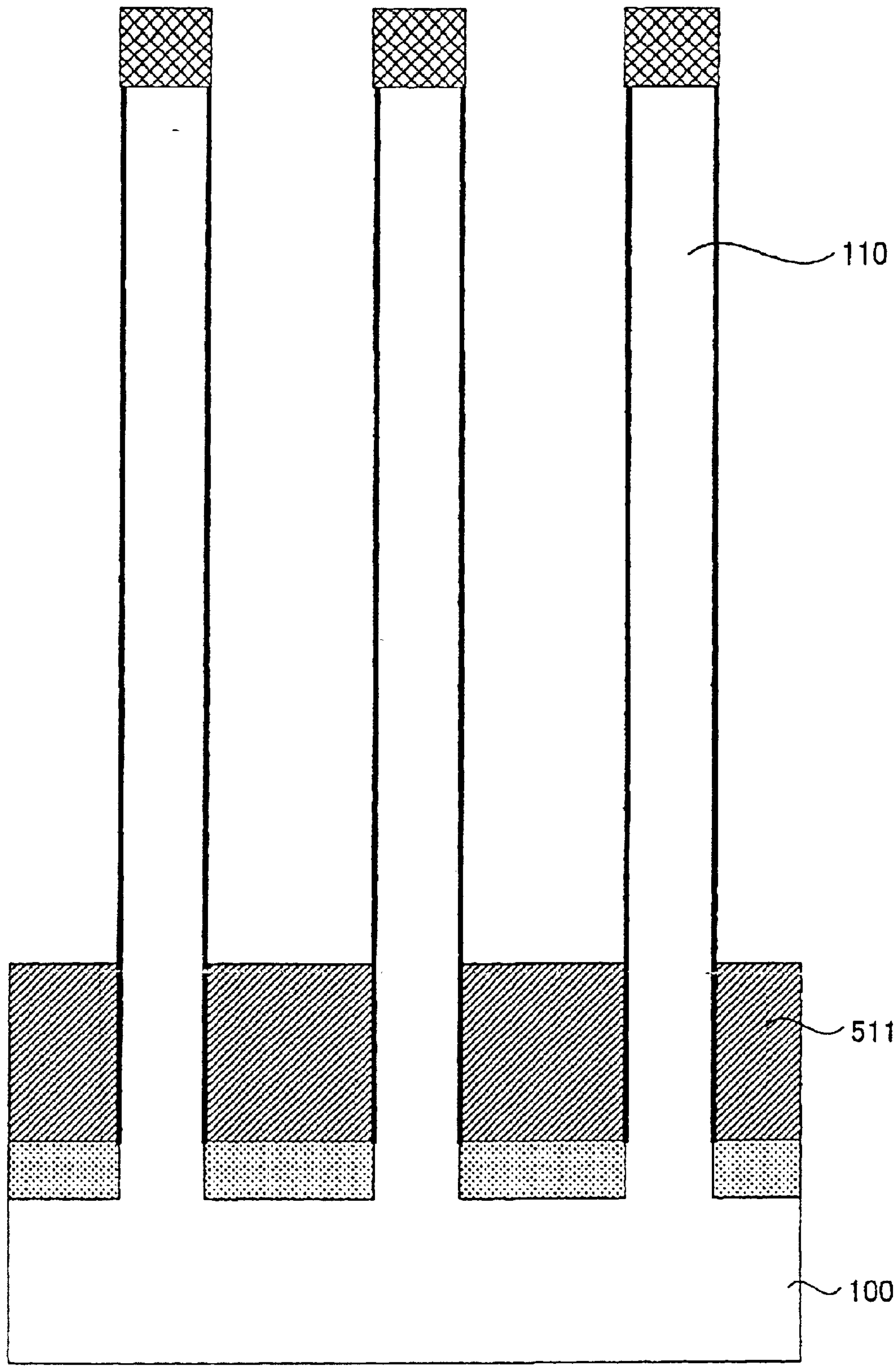
Figure 253:
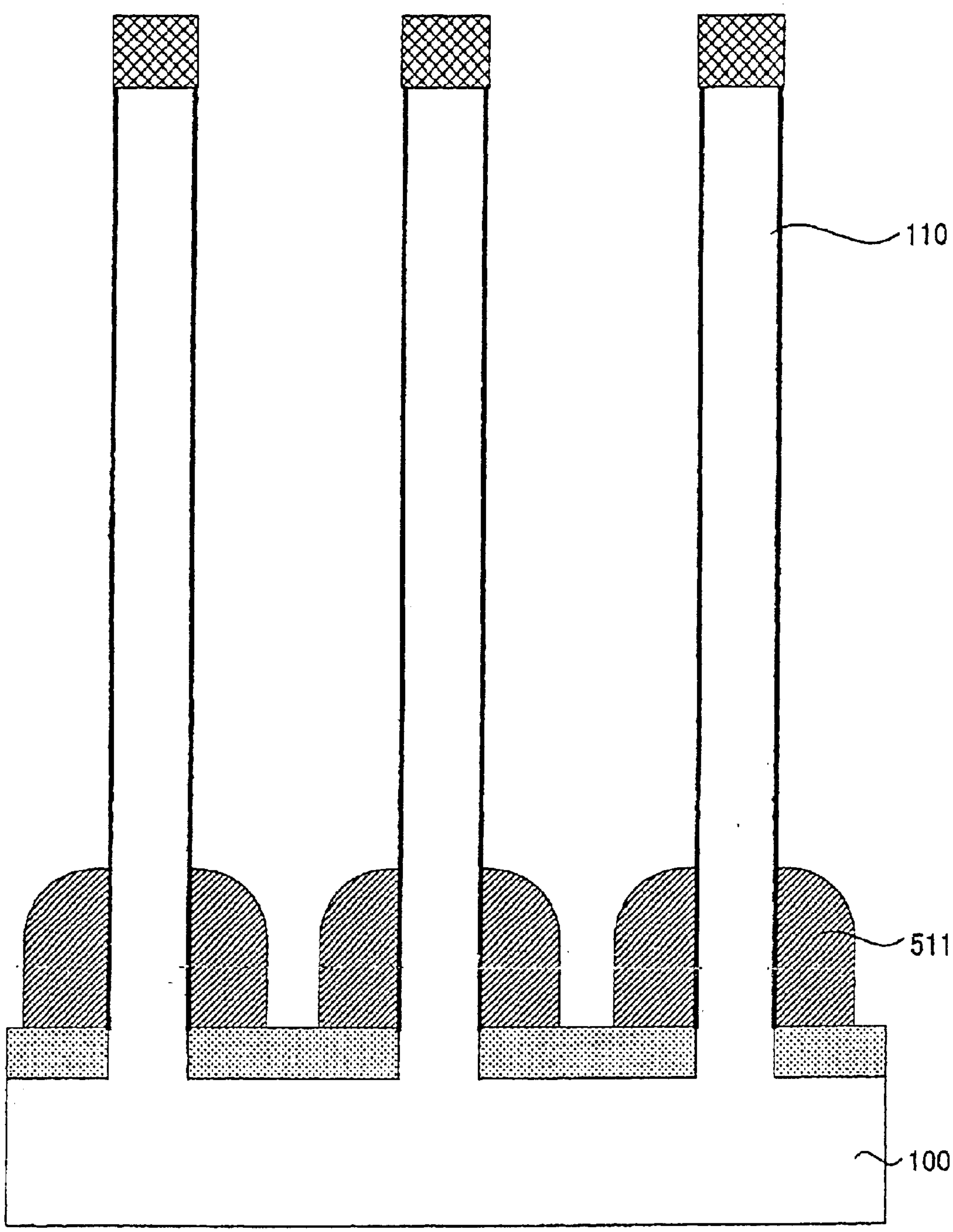

Thereafter, the polysilicon film 511 is etched to remain in the form of sidewall, for example, by RIE (FIG. 249 and FIG. 253).

Subsequently, a silicon oxide film 432, for example, is deposited to 50 to 500 nm as a fifth insulating film and is etched back at least to a degree such that the polysilicon film 511 is not exposed, for example, by isotropic etching, thereby being buried to a desired depth.

Thereafter, a silicon oxide film 452, for example, is deposited to about 5 to 50 nm as a twenty-eighth insulating film and then is anisotropically etched to remain in the form of sidewall on the sidewall of each island-like semiconductor layer 110. At this time, the silicon oxide film 452 may be formed by thermal oxidation or the thermally oxidized film 410 may be used without being removed. Also the silicon oxide film 452 need not necessarily be formed in the sidewall form but may be used as it is deposited.

Further, a silicon nitride film 362, for example, is deposited to about 5 to 50 nm as a twenty-seventh insulating film and is anisotropically etched to remain in the form of sidewall on the sidewall of each island-like semiconductor layer 110 with intervention of the silicon oxide film 452.

Figure 250:
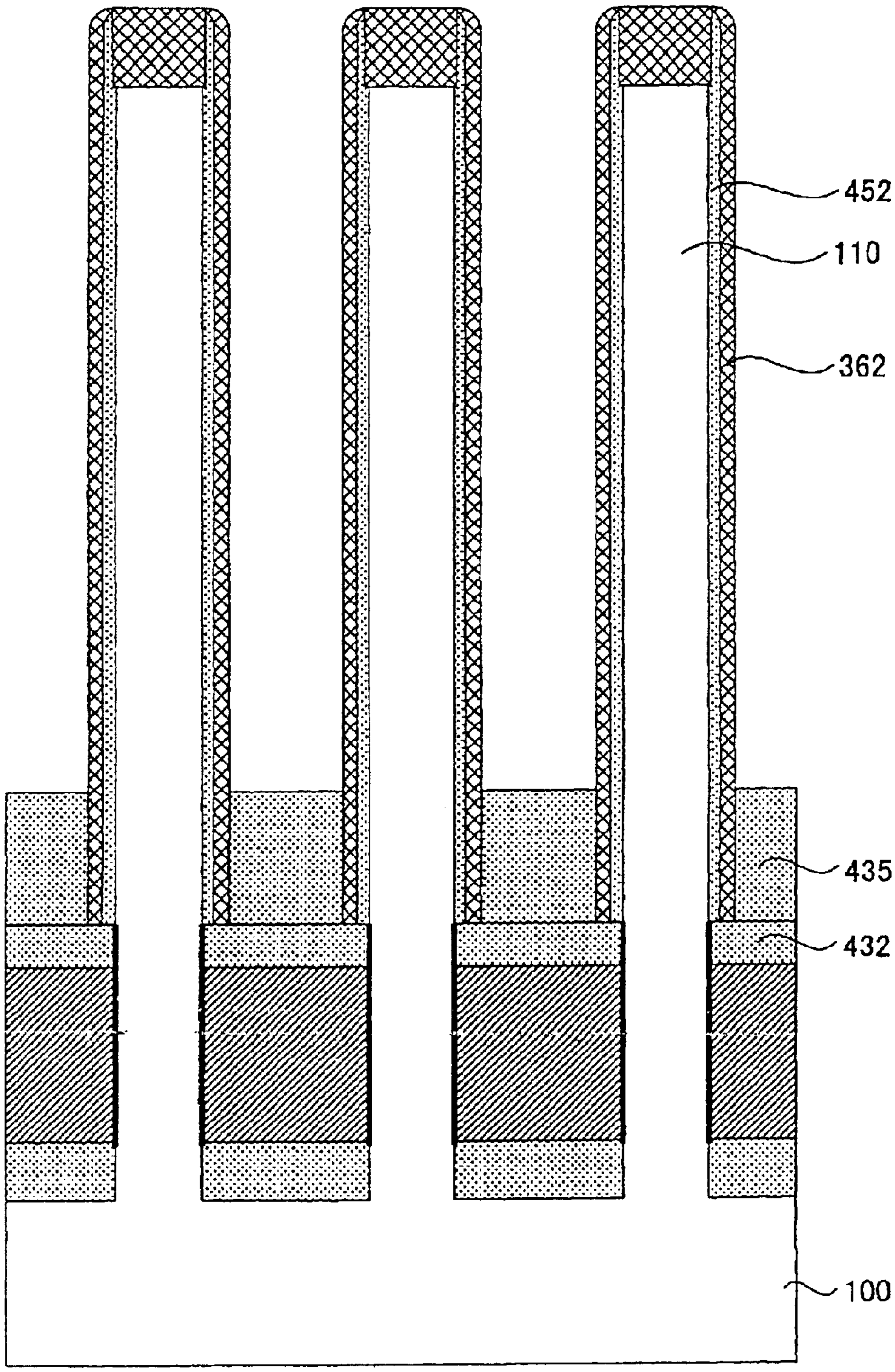
Figure 251:
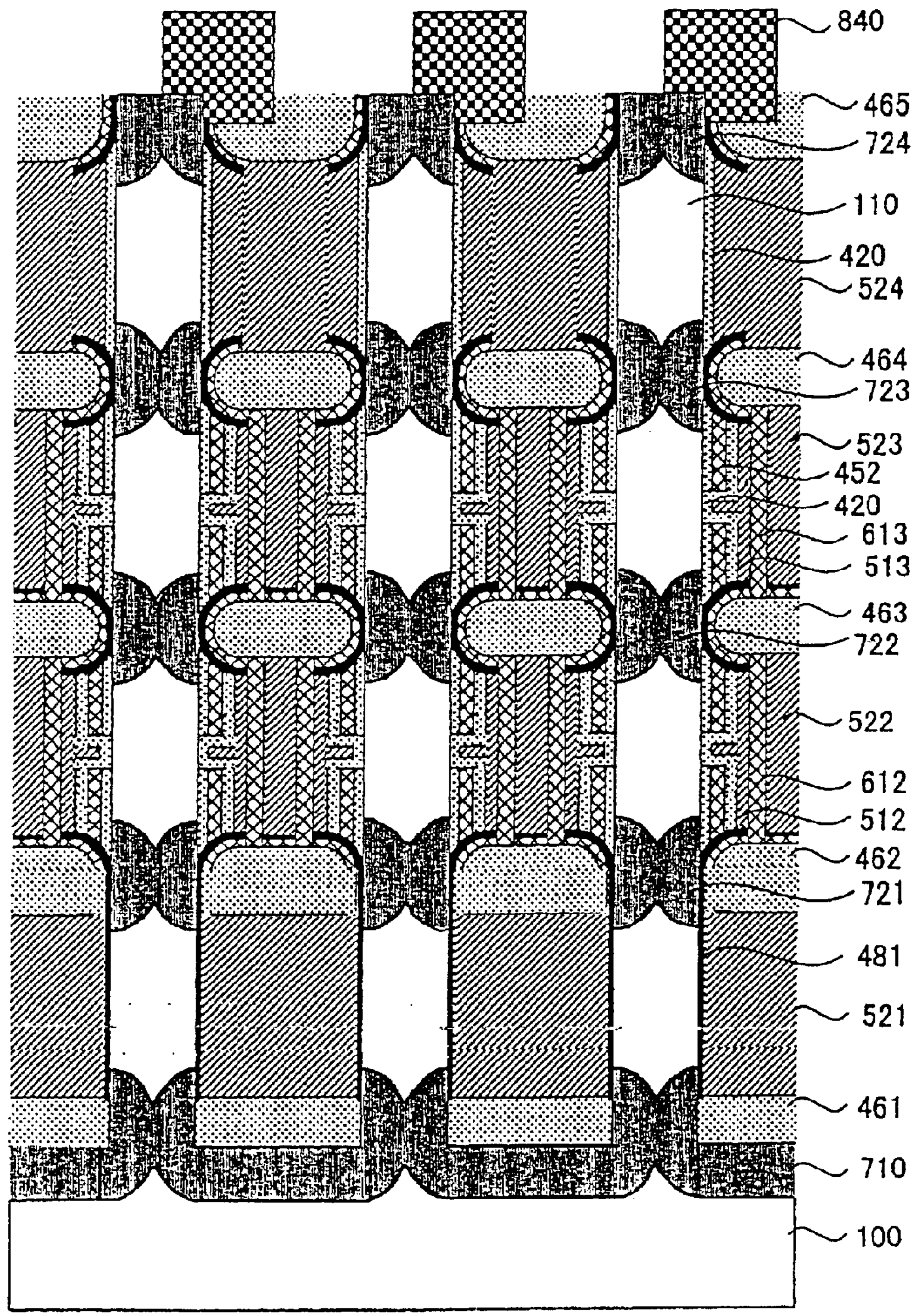
Figure 254:
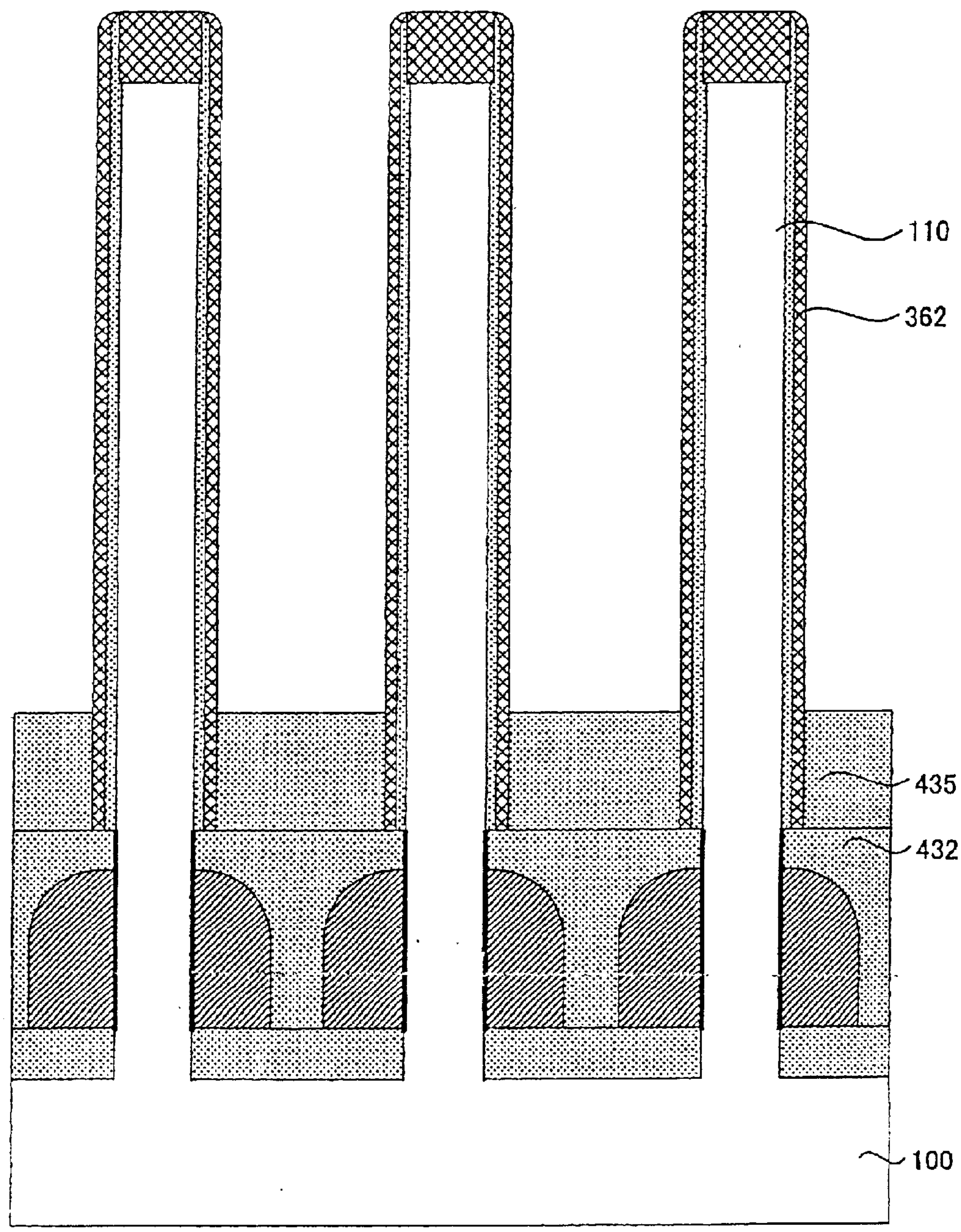
Figure 255:
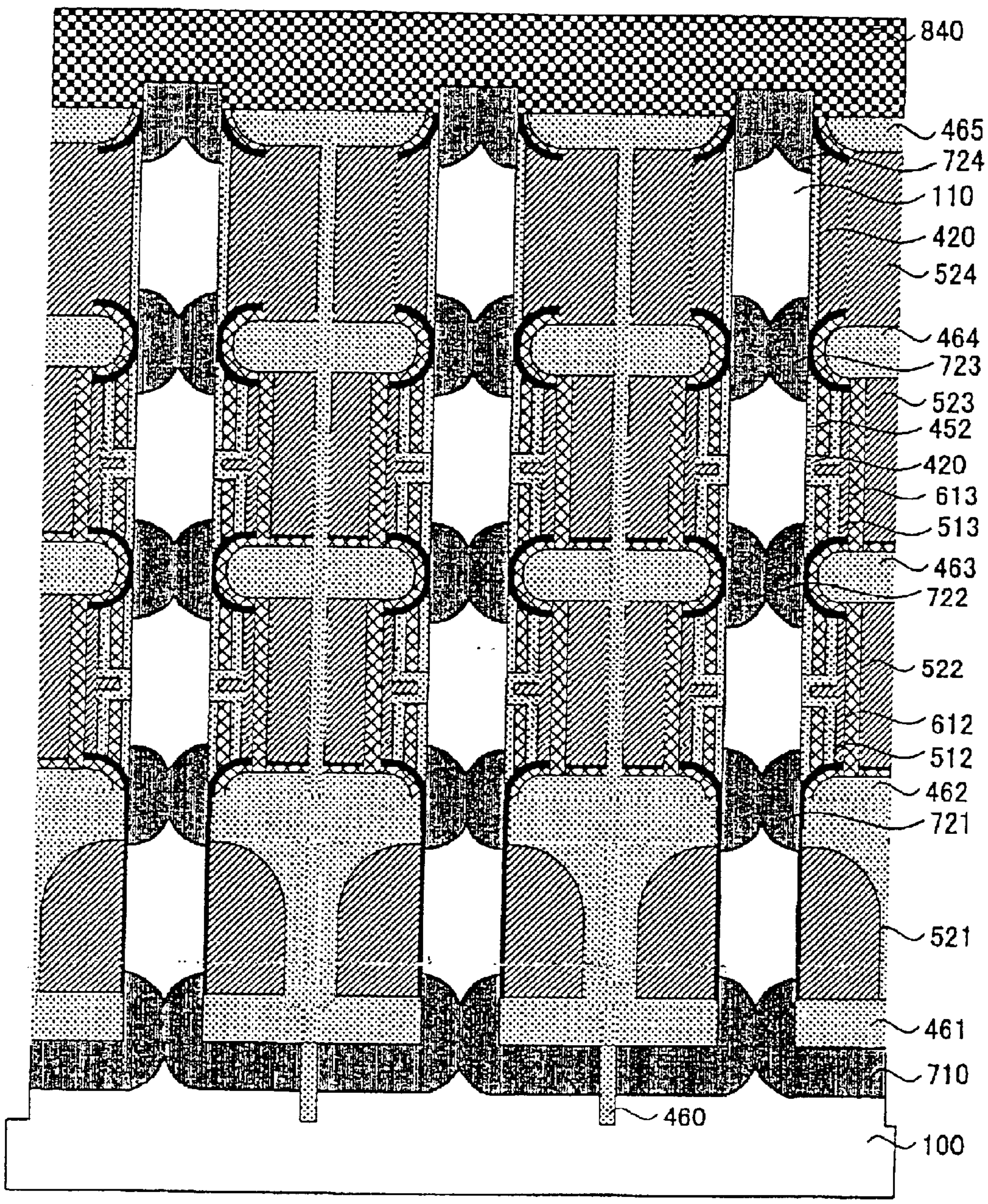

Next, a silicon oxide film 435, for example, is deposited to 50 to 500 nm as a twenty-fifth insulating film and then is buried to a degree such that the silicon oxide film 435 will reach at least the top end of a first conductive film to be formed in a later step, for example, by isotropic etching (FIG. 250 and FIG. 254).

Thereafter, the silicon nitride film 362 is isotropically etched, and the following production steps are in accordance with those of the previous Production Example 7 (FIGS. 224 to 231 and FIG. 234 and FIG. 241. However, the selection gate of the lower gate transistor need not be formed because it has been already formed.

Preferably the silicon oxide film 420 as a third insulating film has almost the same thickness as the silicon oxide film 481 as a thirteenth insulating film.

It is sufficient that the silicon oxide film 420 which is the third insulating film to be a tunnel oxide film between the silicon nitride films 362 and 363 and between the silicon nitride films 363 and 364 is formed between the desired first conductive film and island-like semiconductor layer 110. For example, the silicon oxide film 420 may be unevenly distributed on the top or at the bottom of the polysilicon film or may be partially overlapped with the impurity diffusion layer.

Where the silicon nitride films 362, 363 and 364 remain when the silicon oxide film 420 is formed, the insulating film intervening between the floating gates and the island-like semiconductor layers 110 is of MONOS structure by the silicon oxide film 452, the silicon nitride films 362, 363 and 364 and the silicon oxide film 420. However, it is possible to prevent tunnel current to the silicon nitride film of the MONOS structure by controlling the thickness of the selection gates, the floating gates, the island-like semiconductor layers 110 and the silicon oxide film 452.

Further, when the silicon oxide film 420 is formed by thermal oxidation or the like, the formed oxidized film may have or may not have isotropy, as in the above-described Example 1.

By the above-described method, the area of the tunnel oxide films disposed between the floating gates of the memory transistors and the island-like semiconductor layers can be formed to be smaller than the contact area of the floating gates with the island-like semiconductor layers, and the floating gates of the transistors can be formed at the same.

PRODUCTION EXAMPLE 9

In a semiconductor memory device to be produced in this example, a semiconductor substrate is patterned in the form of pillars to form island-like semiconductor layers. Sides of the island-like semiconductor layers make active regions. A plurality of tunnel oxide films and floating gates as charge storage layers are formed on the active regions. The island-like semiconductor layers are each in an electrically floating state with respect to the semiconductor substrate. The active region of each memory cell is in the electrically floating state. Selection gate transistors are disposed at the top and the bottom of each island-like semiconductor layer. A plurality of memory transistors, for example, two memory transistors, are placed between the selection gate transistors and are connected in series along the island-like semiconductor layer. The thickness of gate insulating films of the selection gate transistors is equal to the thickness of gate insulating films of the memory transistors. In this production example, the selection gates and the floating gates of the transistors are formed at the same time.

FIGS. 256 to 269 and FIGS. 270 to 283 are sectional views taken on line A-A' and line B-B', respectively, in FIG. 1 illustrating a memory cell array of EEPROM.

In this example, production steps are the same as those in Production Example 1 until the thermally oxidized film 410 as a second insulating film is removed, for example, by isotropically etching.

Thereafter, a silicon oxide film 471, for example, is deposited to 50 to 500 nm as an eleventh insulating film and is buried in the first trench 210 by anisotropic etching or isotropic etching so that the top of the silicon oxide film 471 is positioned between the top and the bottom of the charge storage layer of the lower memory cell.

Figure 256:
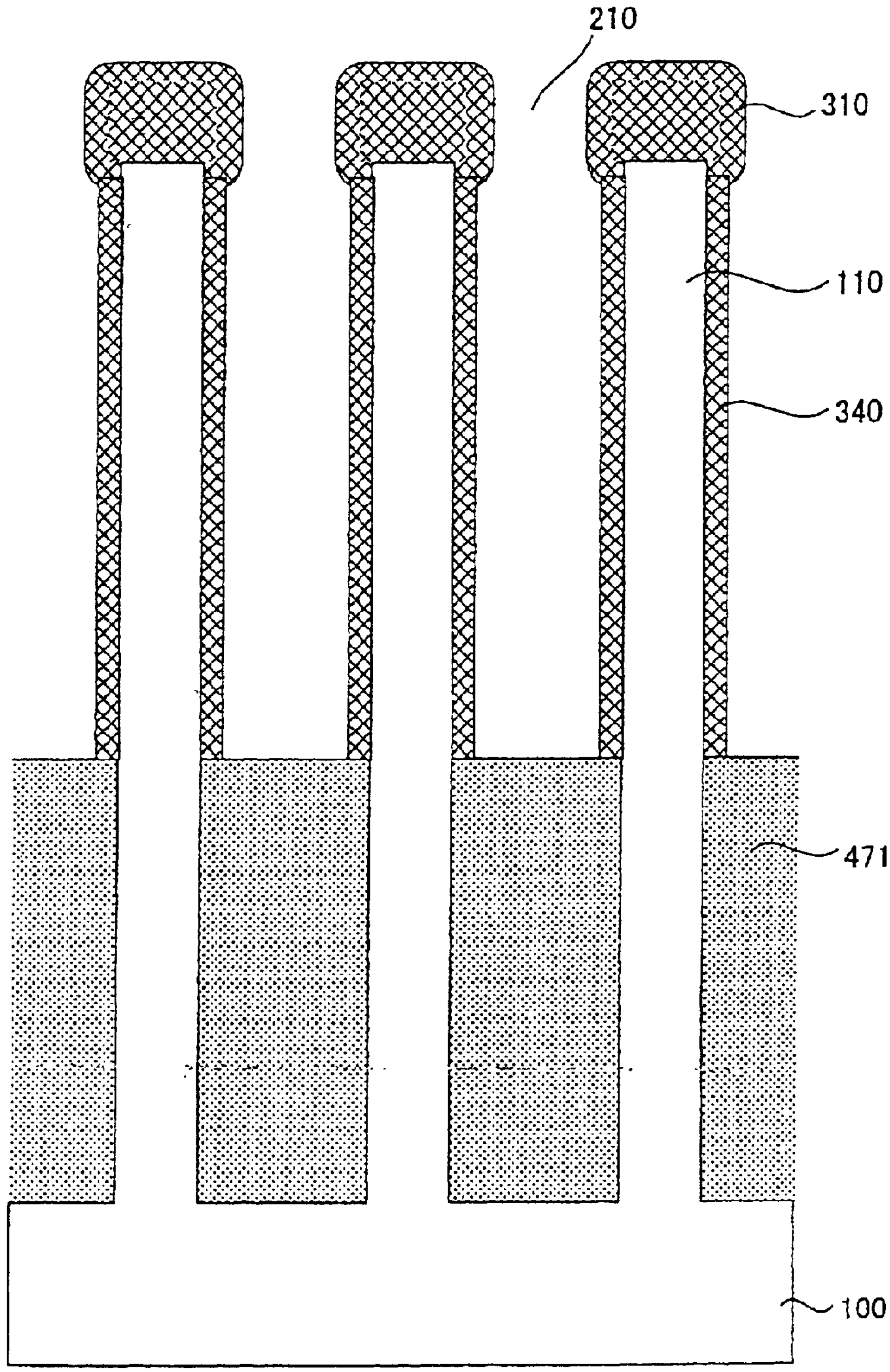
Figure 270:
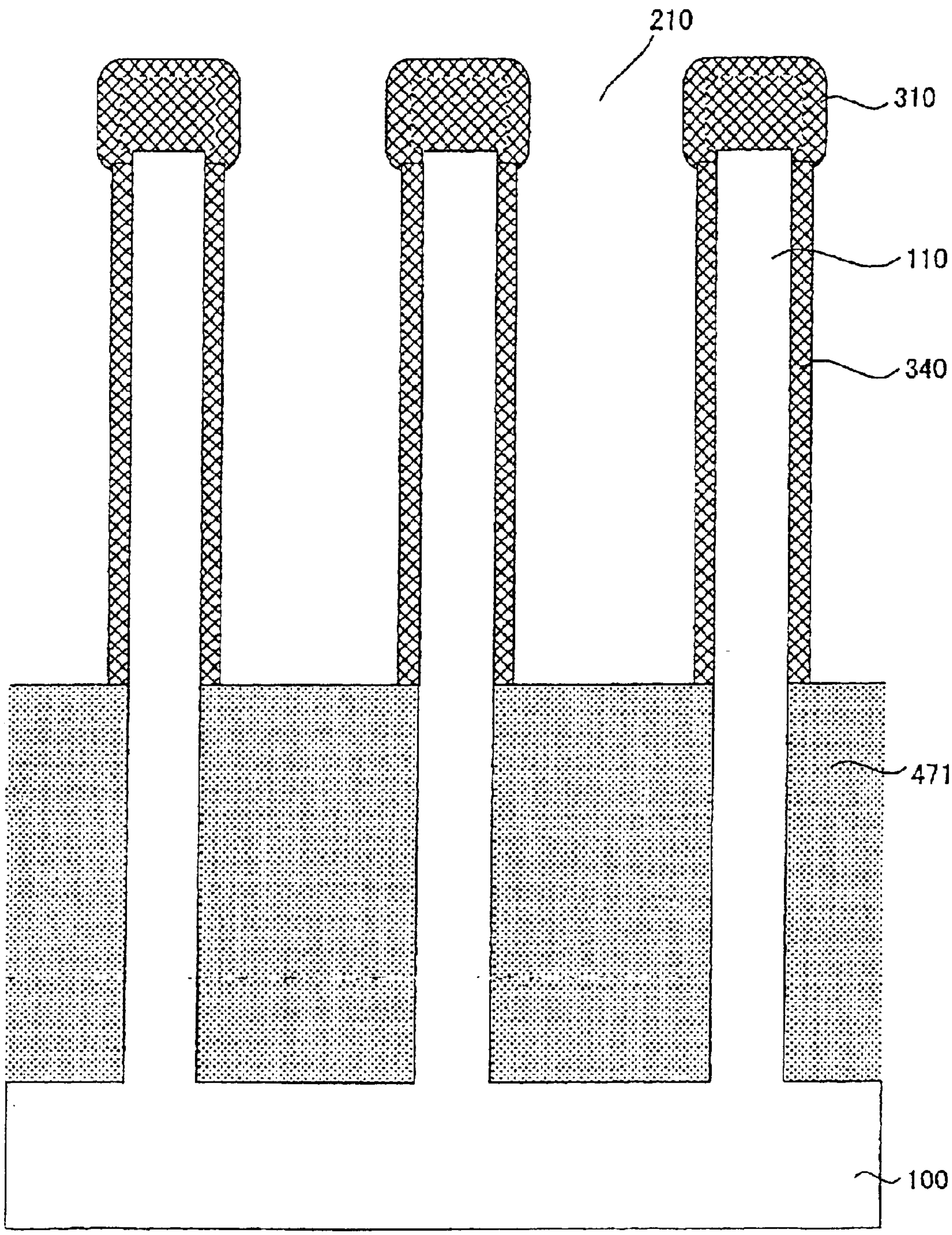

Next, a silicon nitride film 340, for example, is deposited to 5 to 500 nm as a twelfth insulating film and sidewalls are formed of the silicon nitride film 340 (FIG. 256 and FIG. 270).

Subsequently, a silicon oxide film 472 is deposited to 50 to 500 nm in the same manner as the eleventh insulating film and is buried in the first trench 210 by anisotropic etching or isotropic etching so that the top of the silicon oxide film 472 as the eleventh insulating film is positioned between the top and the bottom of the charge storage layer of the upper memory cell.

Figure 257:
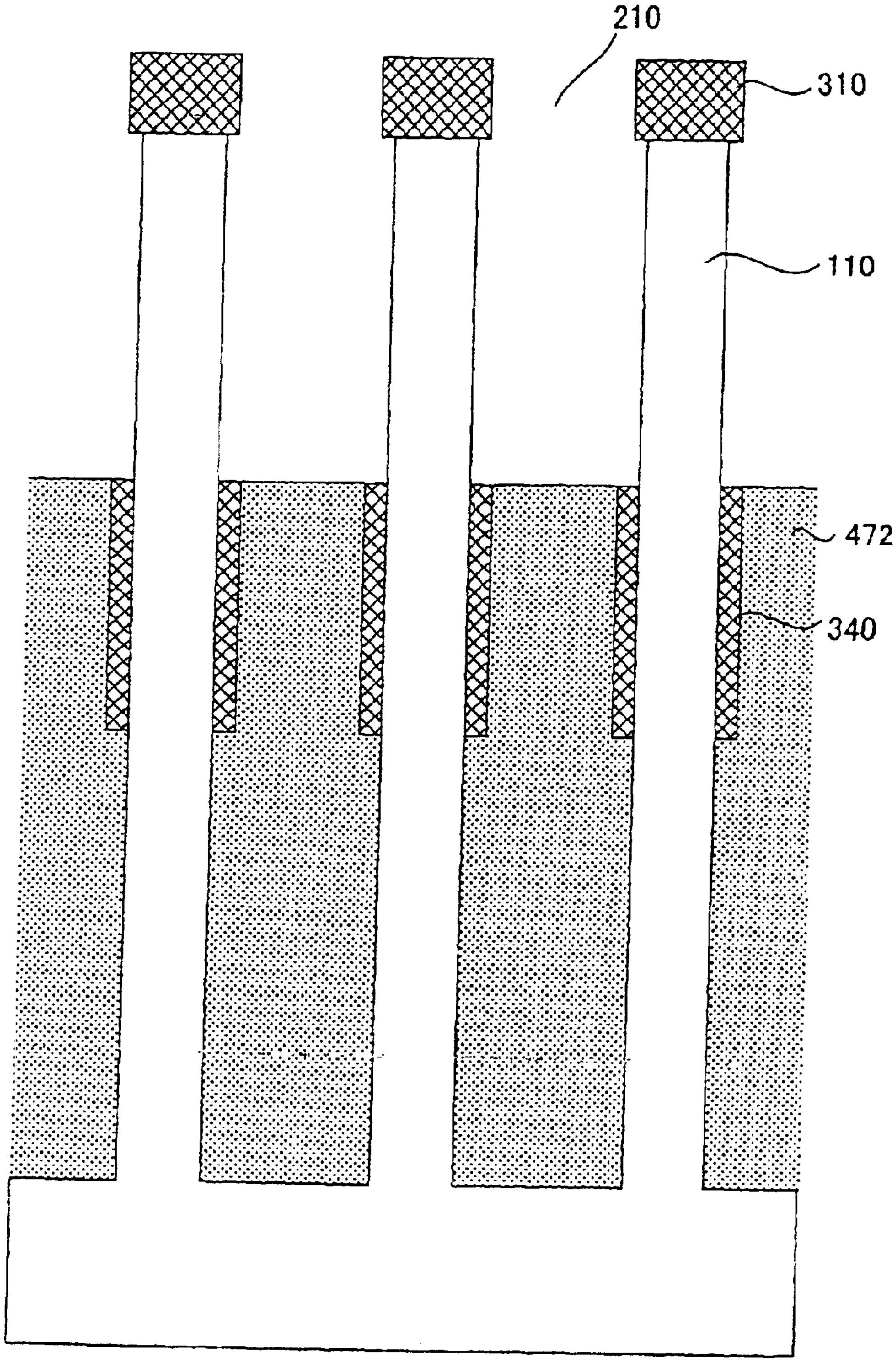
Figure 271:
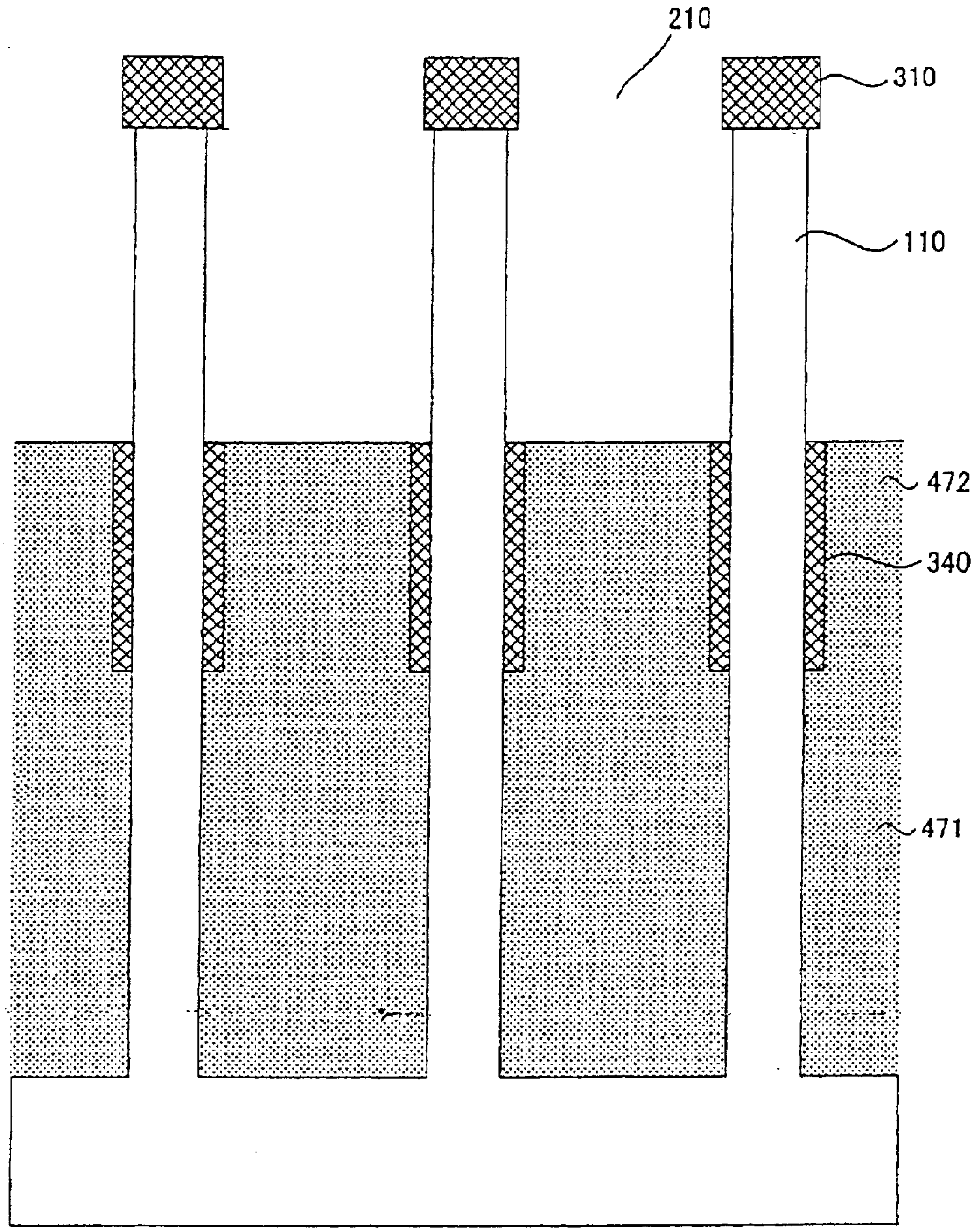

Thereafter, using the silicon oxide film 472 as a mask, the sidewalls of the silicon nitride film 340 are partially removed by isotropic etching (FIG. 257 and FIG. 271).

Figure 258:
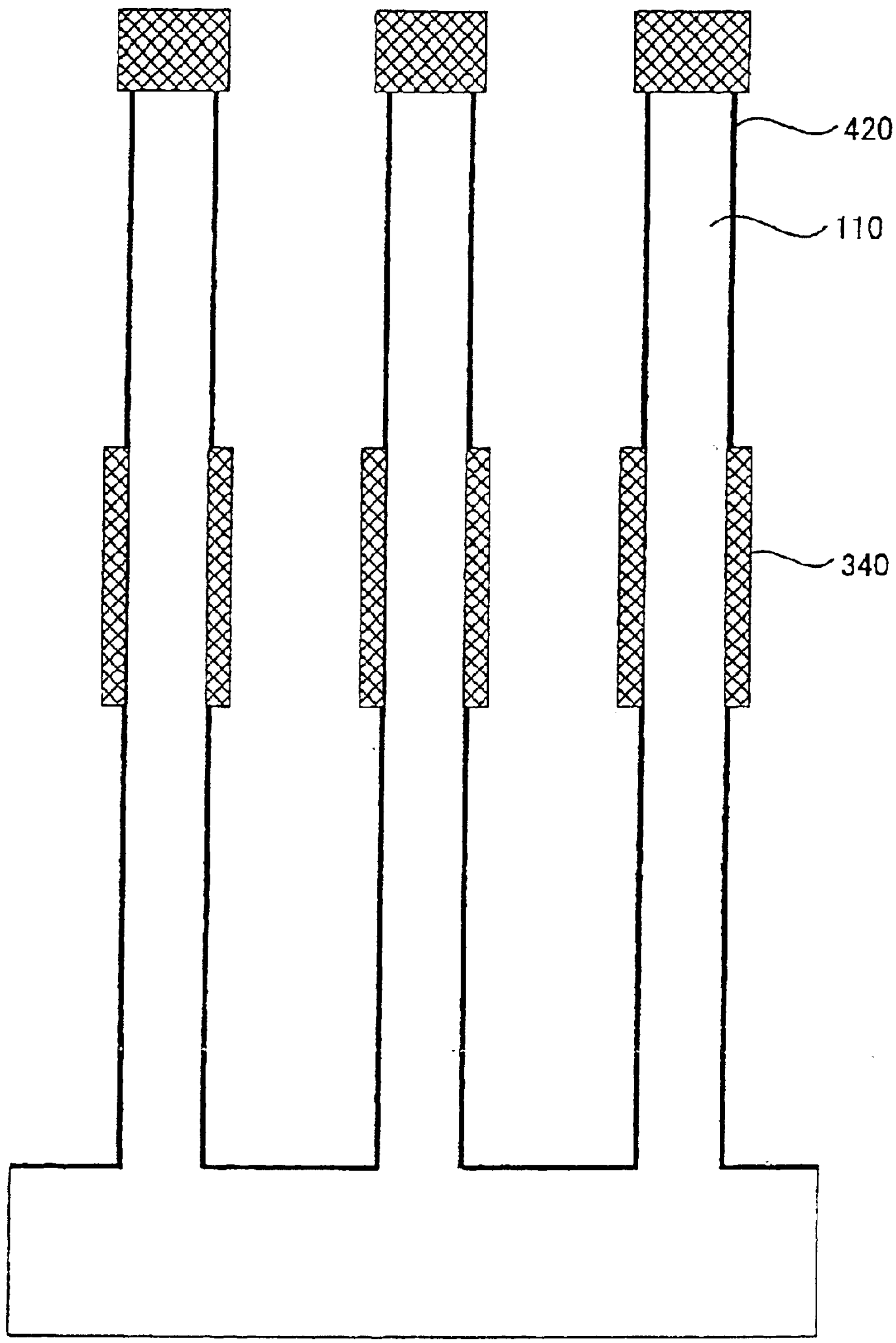
Figure 272:
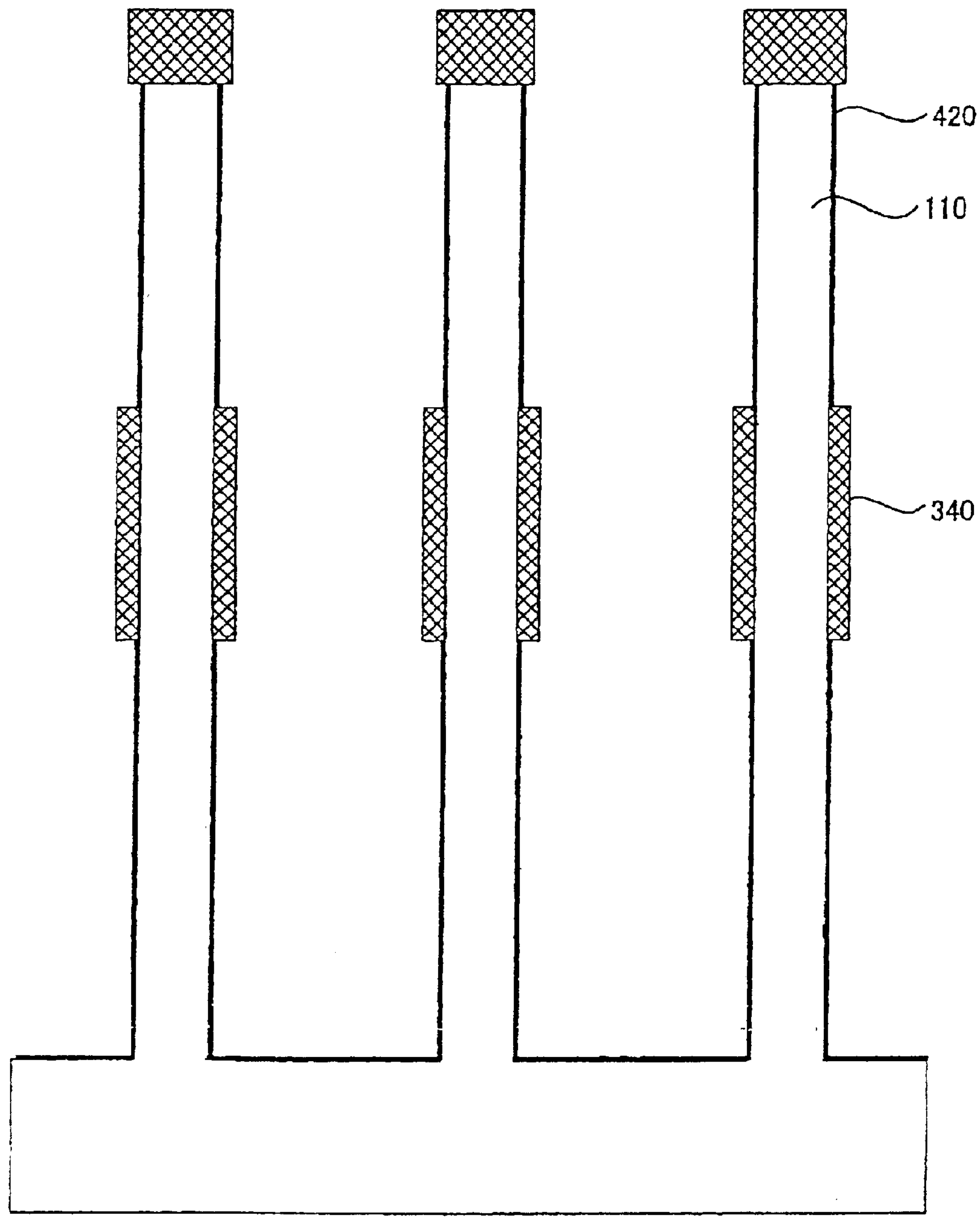

Subsequently, an oxide film 420 is formed as a third insulating film to be a tunnel oxide film of about 10 nm thickness on the periphery of each island-like semiconductor layer 110, for example, by thermal oxidation (FIG. 258 and FIG. 272). The tunnel oxide film is not necessarily limited to a thermally oxidized film, but may be a CVD oxide film or a nitrogen oxide film.

Figure 259:
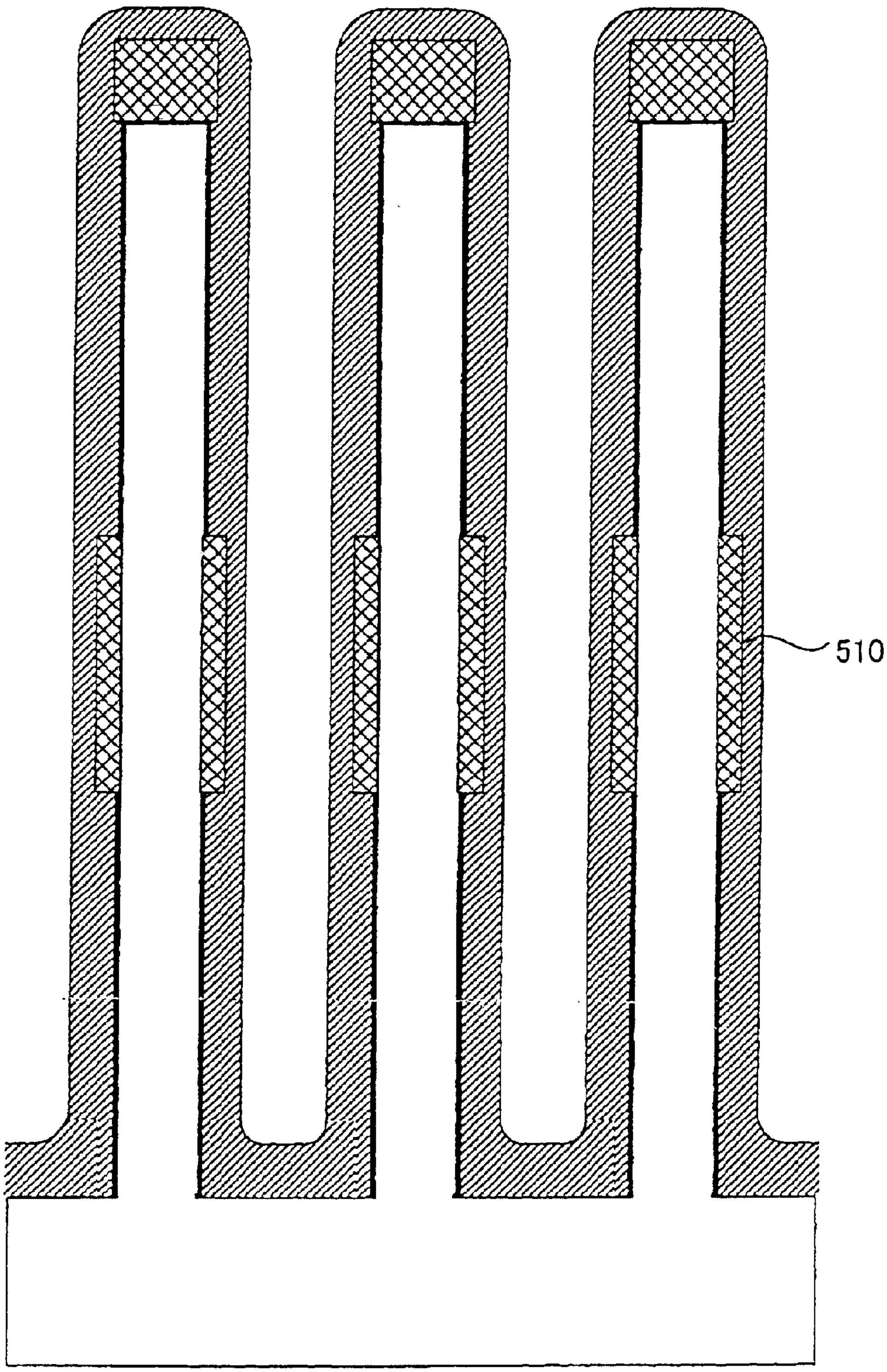
Figure 273:
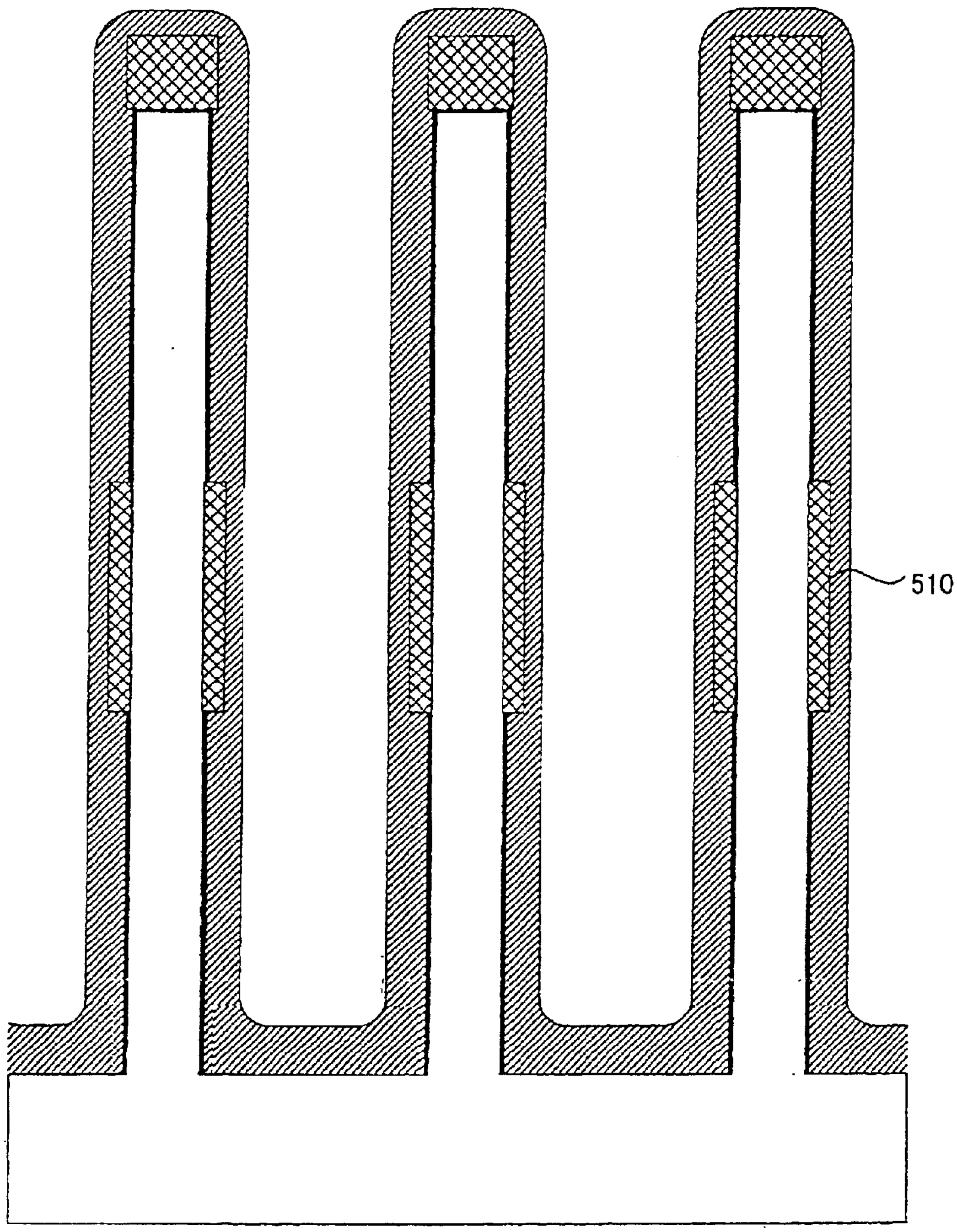

Next, a polysilicon film 510, for example, is deposited to about 50 to 200 nm as a first conductive film (FIG. 259 and FIG. 273).

Thereafter, a silicon nitride film 321, for example, is deposited to 5 to 50 nm as a fourth insulating film by CVD.

Figure 260:
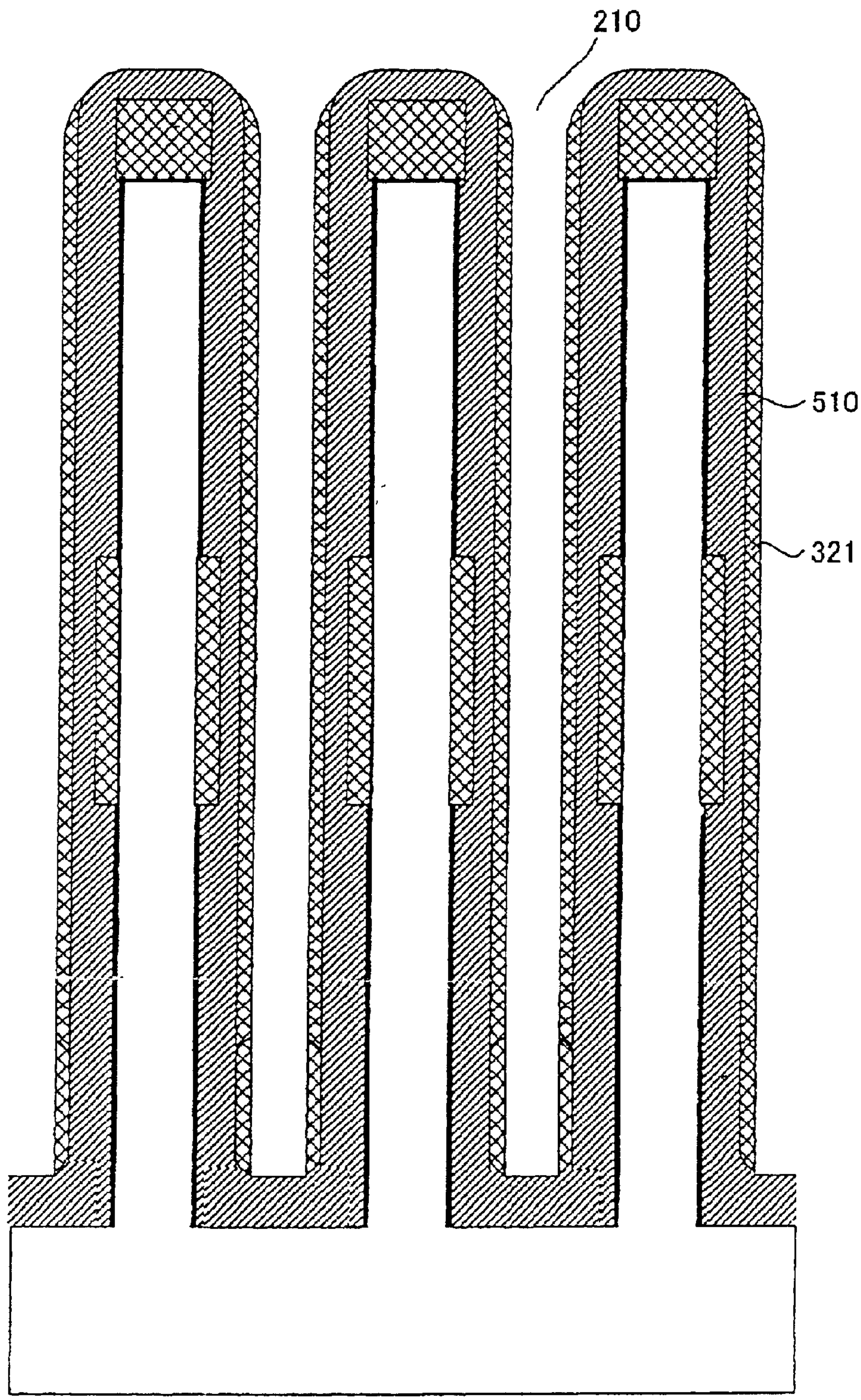
Figure 274:
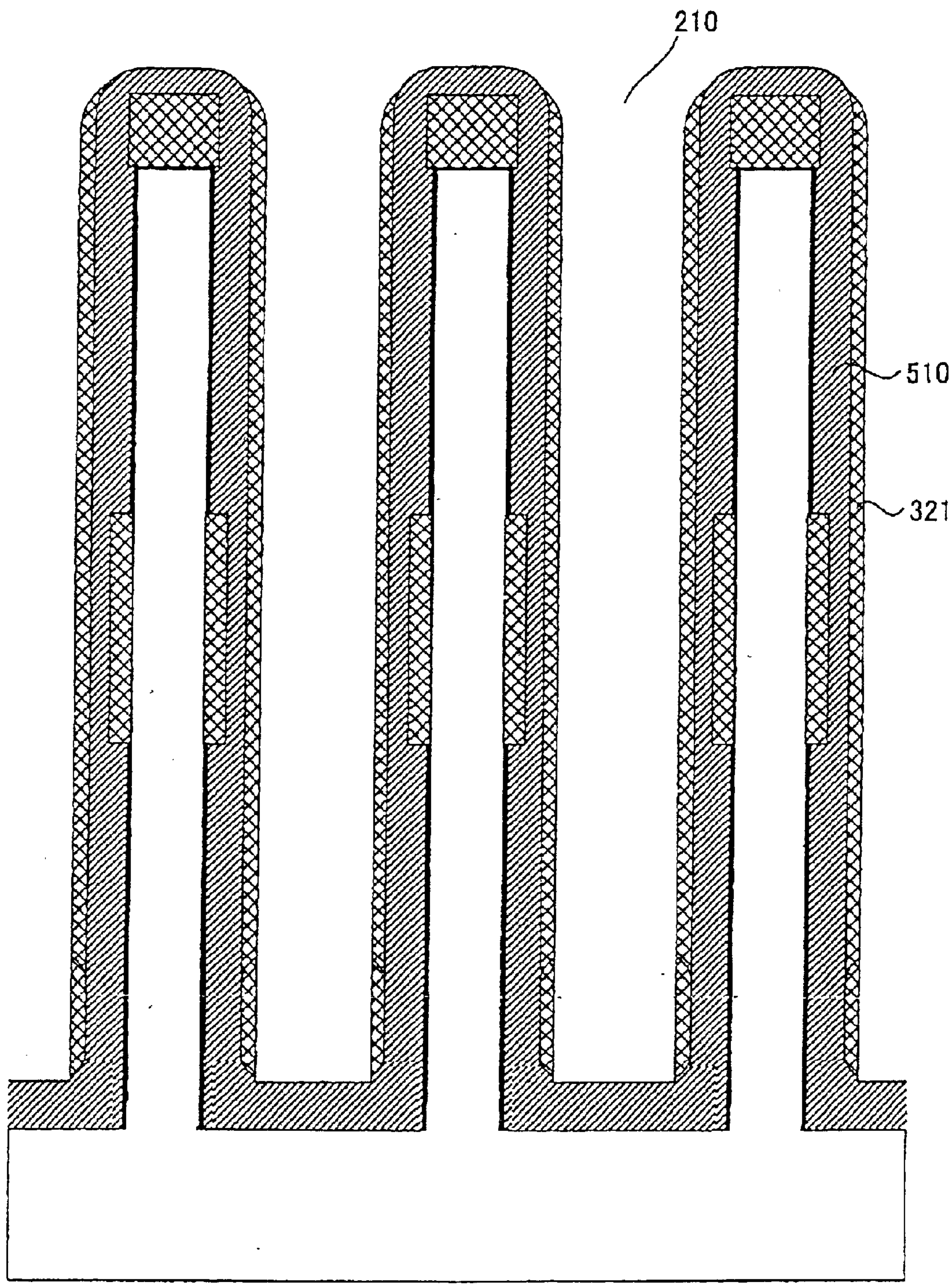

Subsequently, the silicon nitride film 321 is etched to remain in the form of a sidewall on the polysilicon film 510, for example, by RIE (FIG. 260 and FIG. 274).

Figure 261:
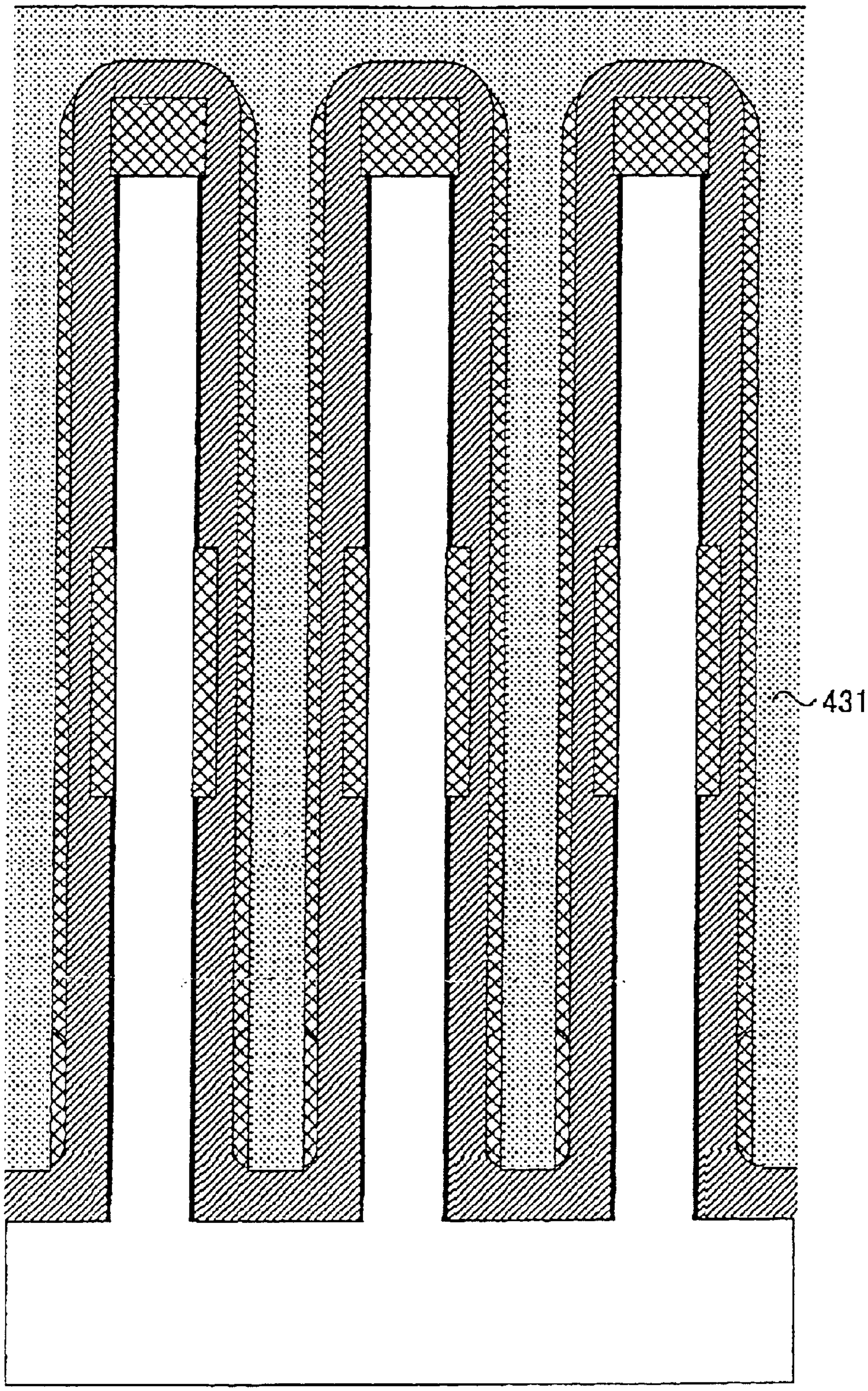
Figure 275:
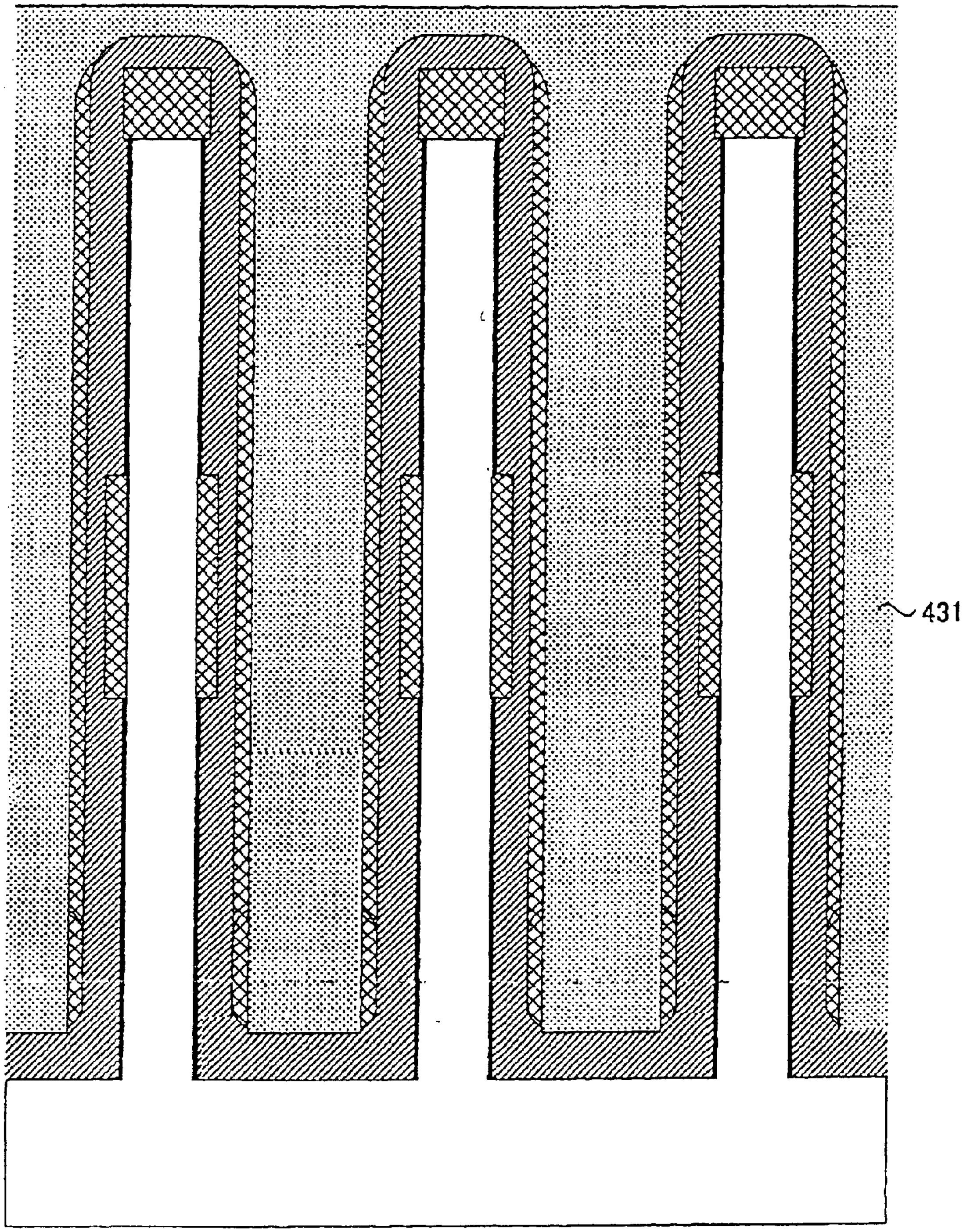

A silicon oxide film 431, for example, is deposited to 50 to 500 nm as a fifth insulating film in the first trench 210 in the lattice form by CVD (FIG. 261 and FIG. 275).

Figure 262:
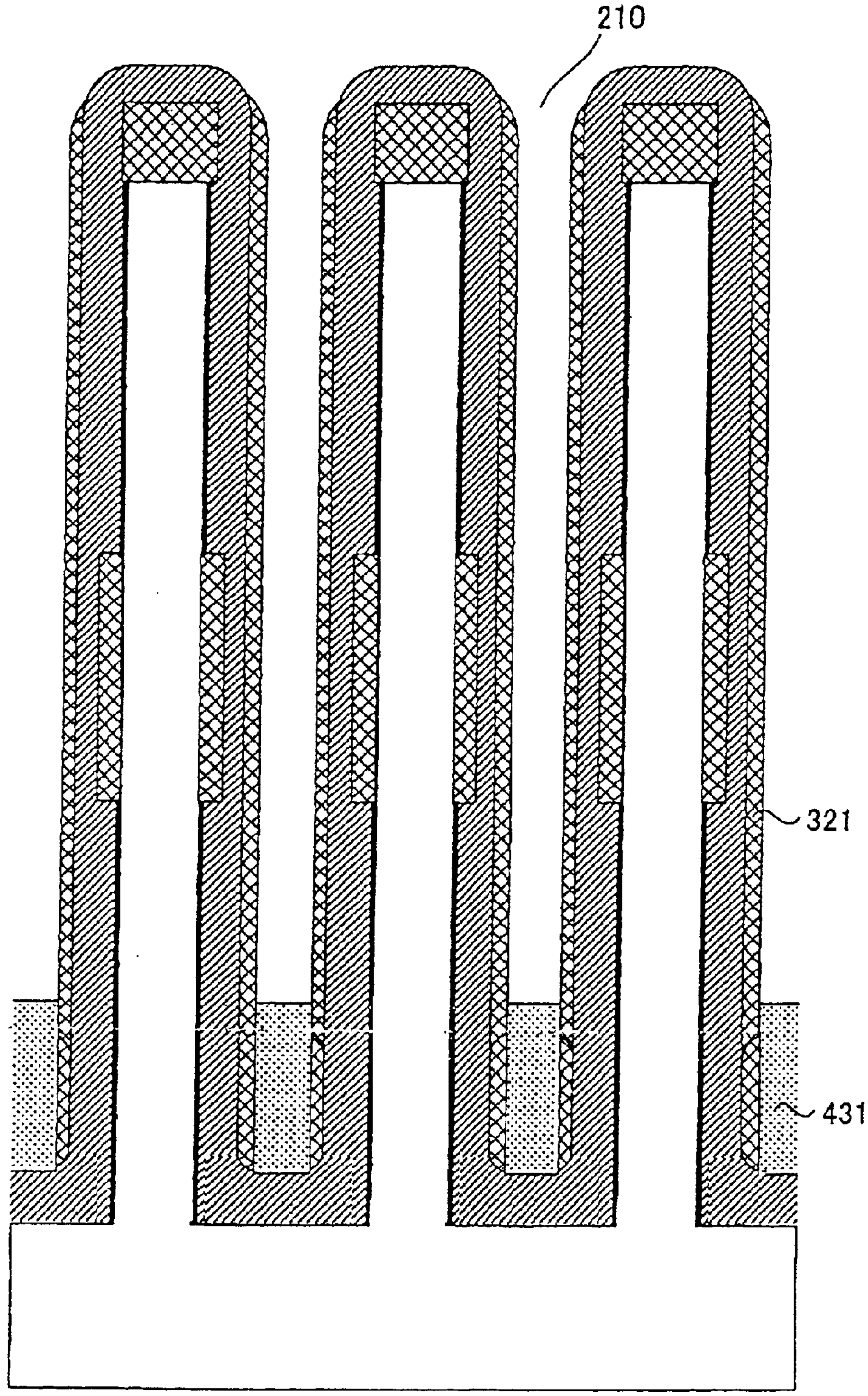
Figure 276:
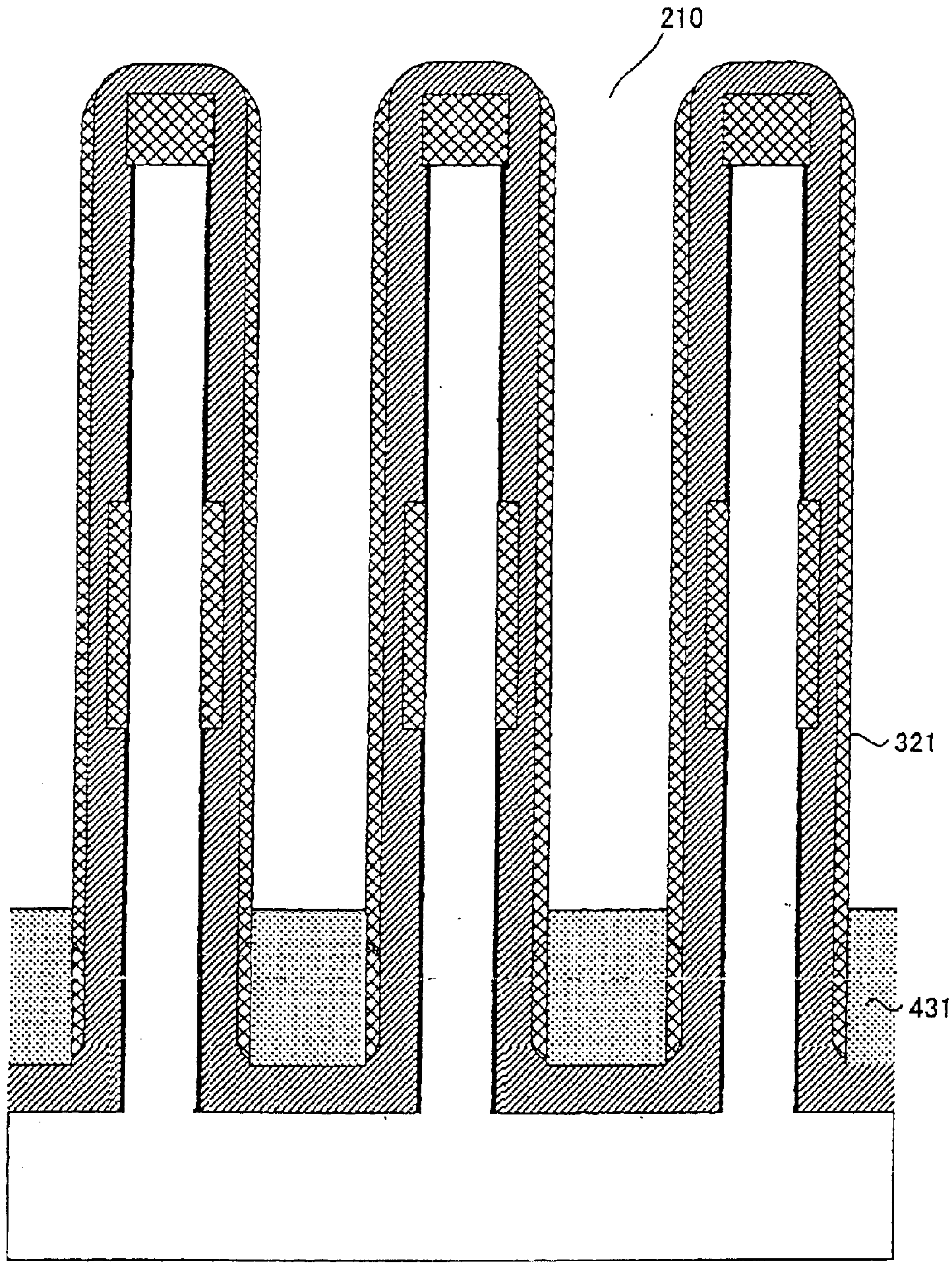

The silicon oxide film 431 is buried to a desired depth in the first trench 210 in the lattice form (FIG. 262 and FIG. 276).

Figure 263:
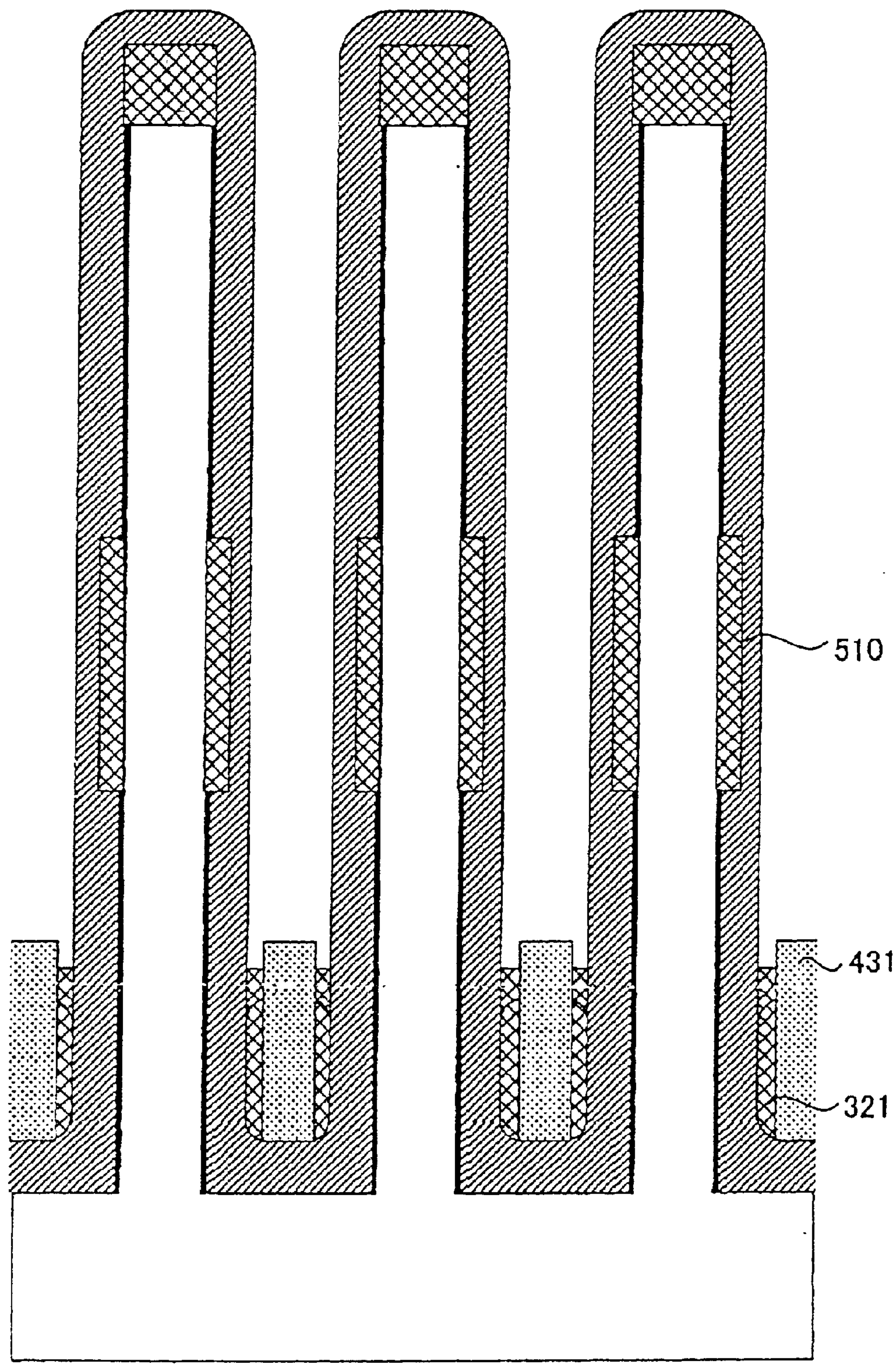
Figure 277:
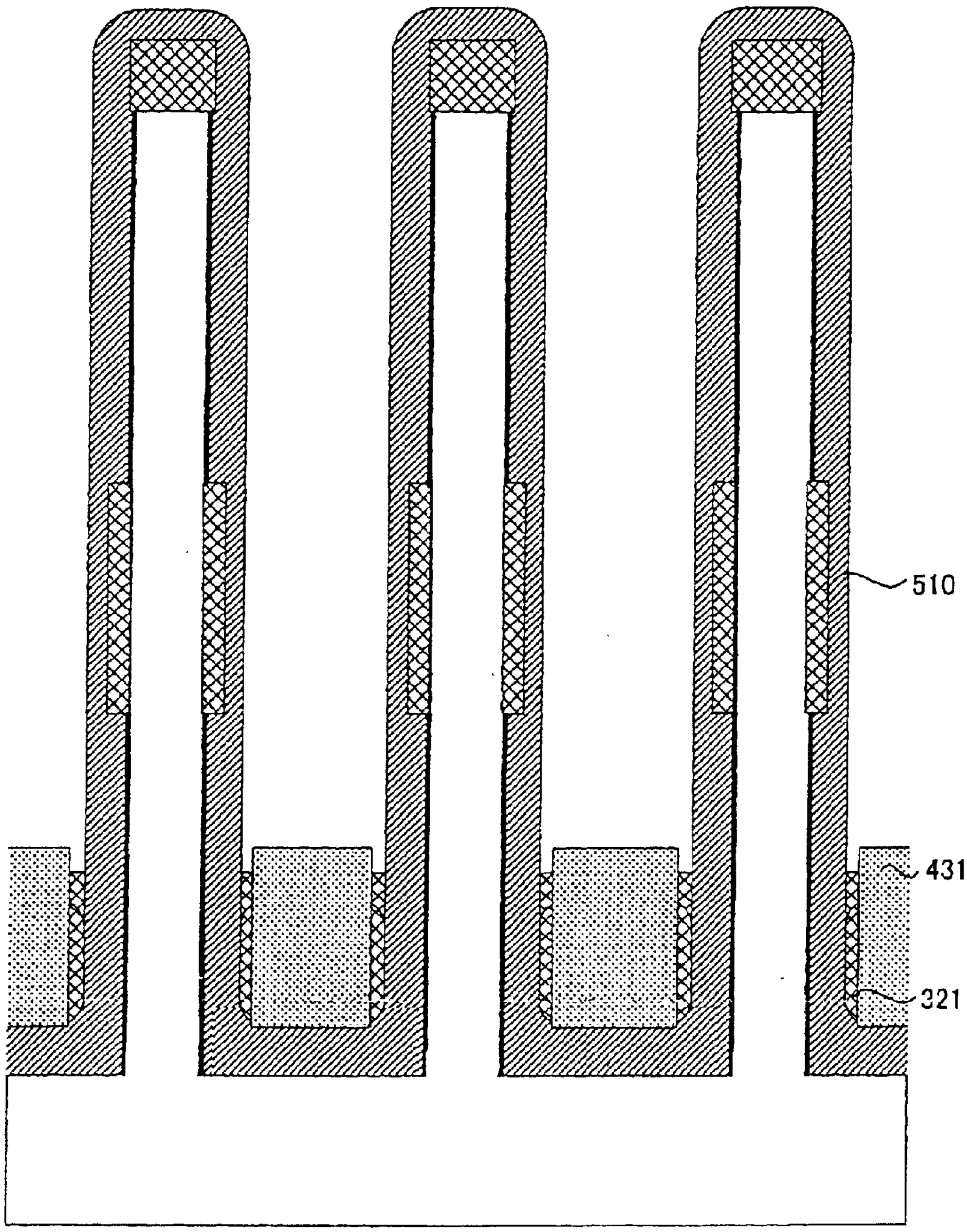

Using the silicon oxide film 431 as a mask, the silicon nitride film 321 is isotropically etched to remain only between the silicon oxide film 431 and the polysilicon film 510 (FIG. 263 and FIG. 277). At this time, the silicon nitride film 321 forms a recess with respect to the top surface of the silicon oxide film 431.

A silicon oxide film 441 is deposited to 3 to 30 nm as a sixth insulating film in this recess. At this time, if the silicon oxide film 441 has about half or more of the thickness of the silicon nitride film 321, the above-mentioned recess is buried with the silicon oxide film 441. Since the oxide film 441 also deposits on the sidewall of the polysilicon film 510, the silicon oxide film 441 is removed from the sidewall of the polysilicon film 510, for example, by isotropic etching. Thereby, the silicon oxide film 441 remains in the recess and the silicon nitride film 321 is buried with the silicon oxide film 431 and the silicon oxide film 441.

Figure 264:
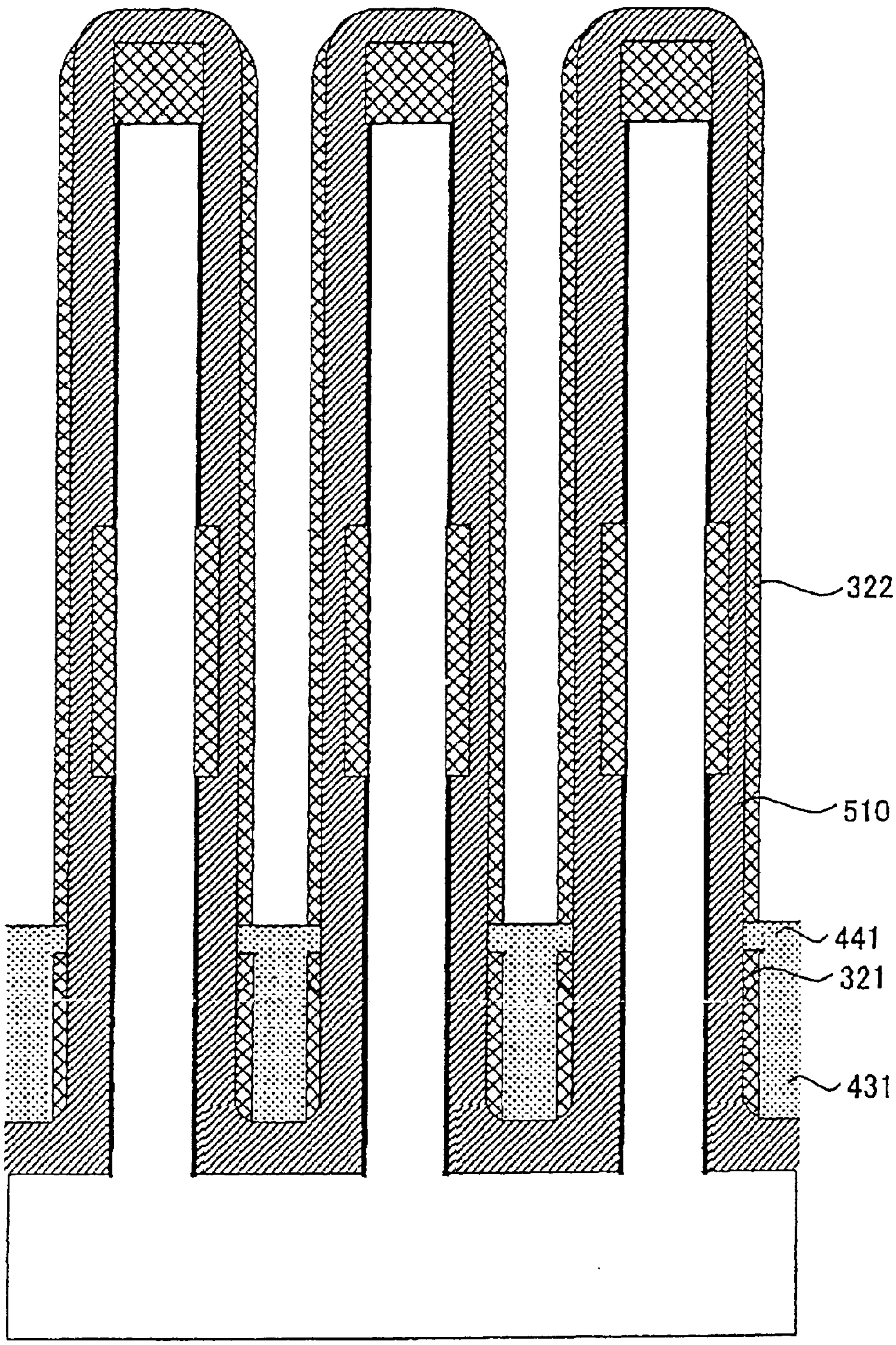
Figure 265:
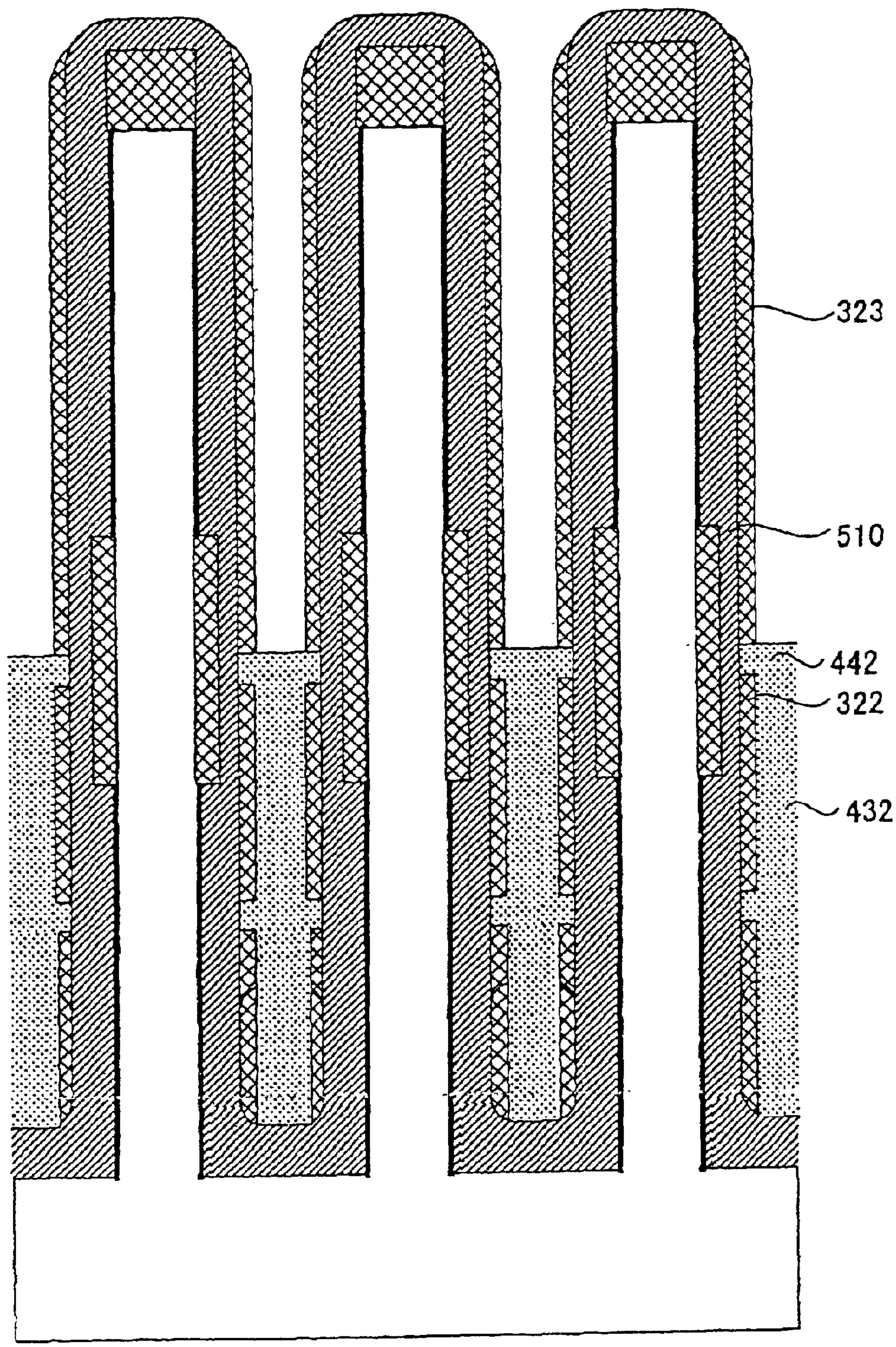
Figure 278:
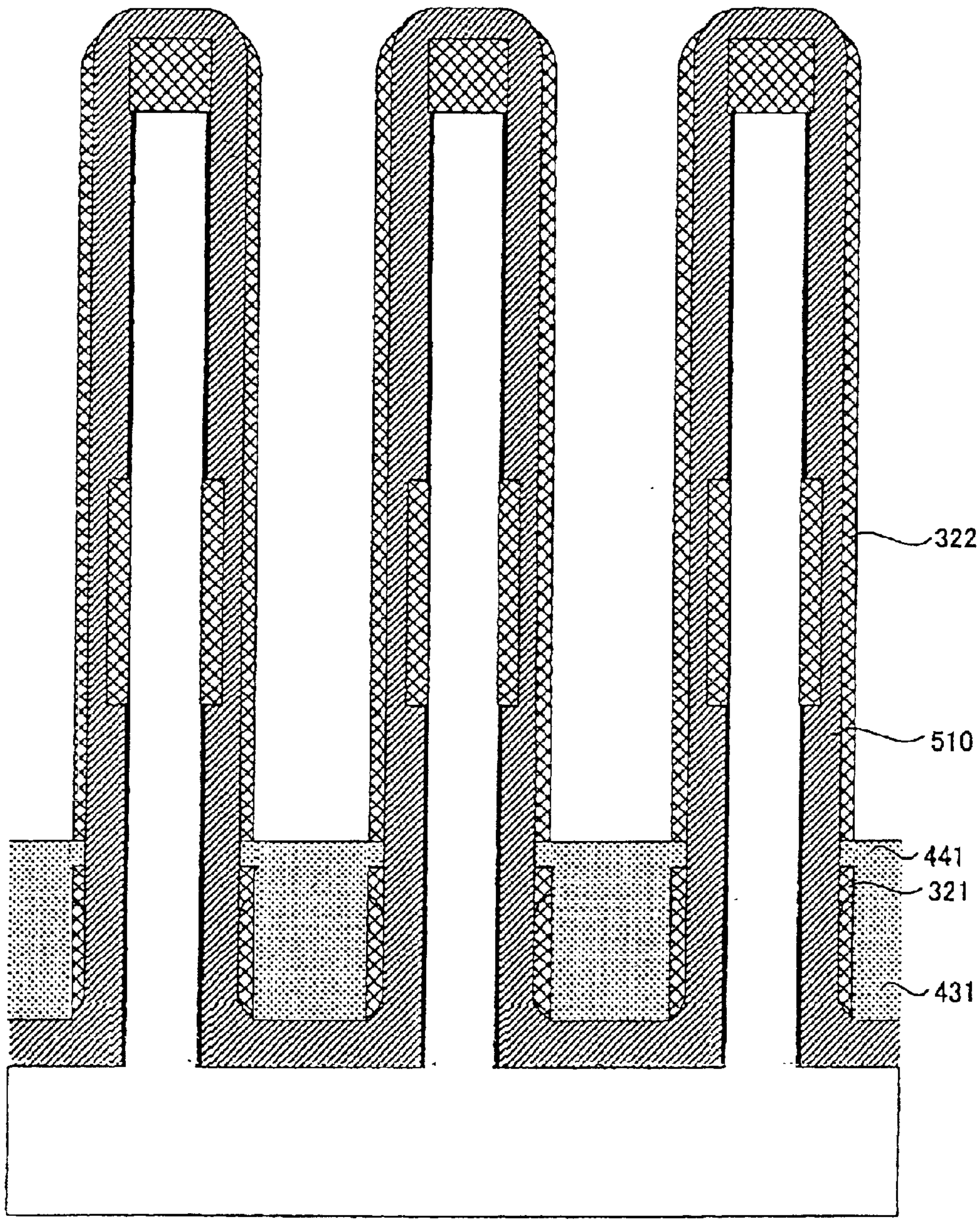
Figure 279:
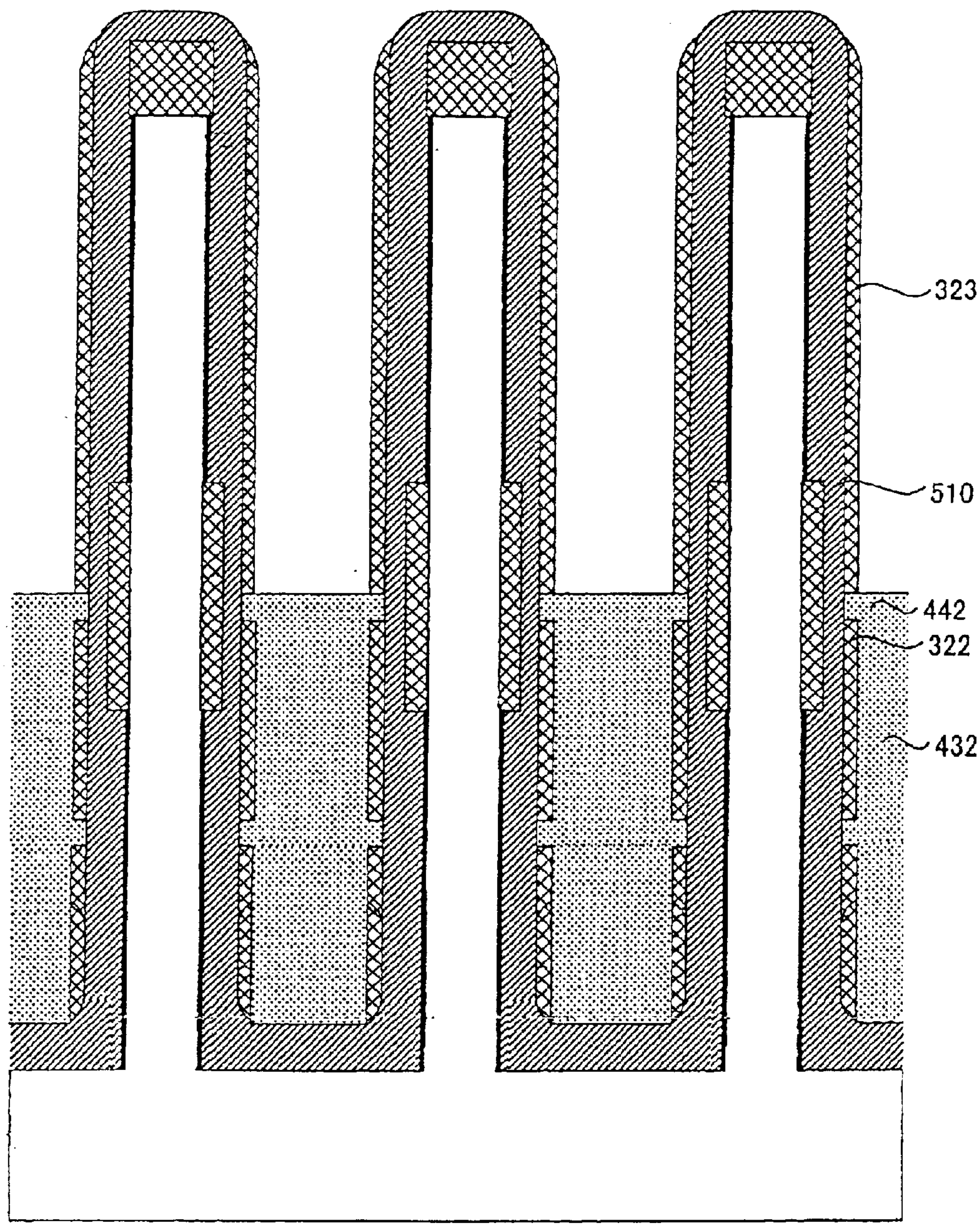
Figure 280:
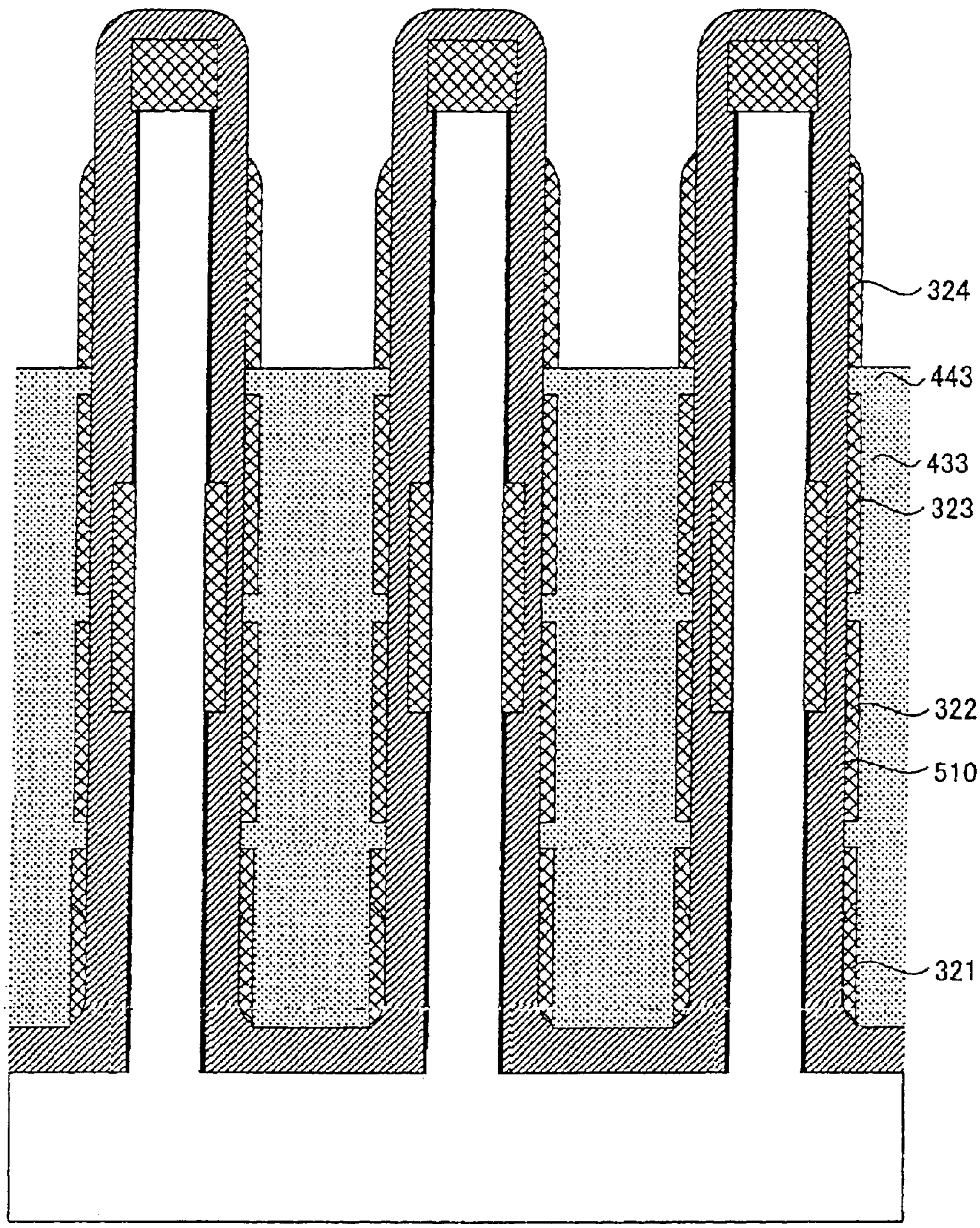

Subsequently, a silicon nitride film 322 is deposited to 5 to 50 nm as a fourth insulating film in the same manner by CVD and is etched by RIE to remain in the form of a sidewall on the sidewall of the polysilicon film 510 as a first conductive film (FIG. 264 and FIG. 278).

Thereafter, a silicon oxide film 432 as a fifth insulating film is buried in the same manner as described above, and then a silicon oxide film 442 as a sixth insulating film is disposed on the top of the silicon nitride film 322 in the form of a sidewall in the same manner as the above-mentioned sixth insulating film.

Subsequently, a sidewall is formed of a silicon nitride film 323 as a fourth insulating film on the sidewall of the polysilicon film 510 in the same manner as described above (FIG. 265 and FIG. 279).

Figure 266:
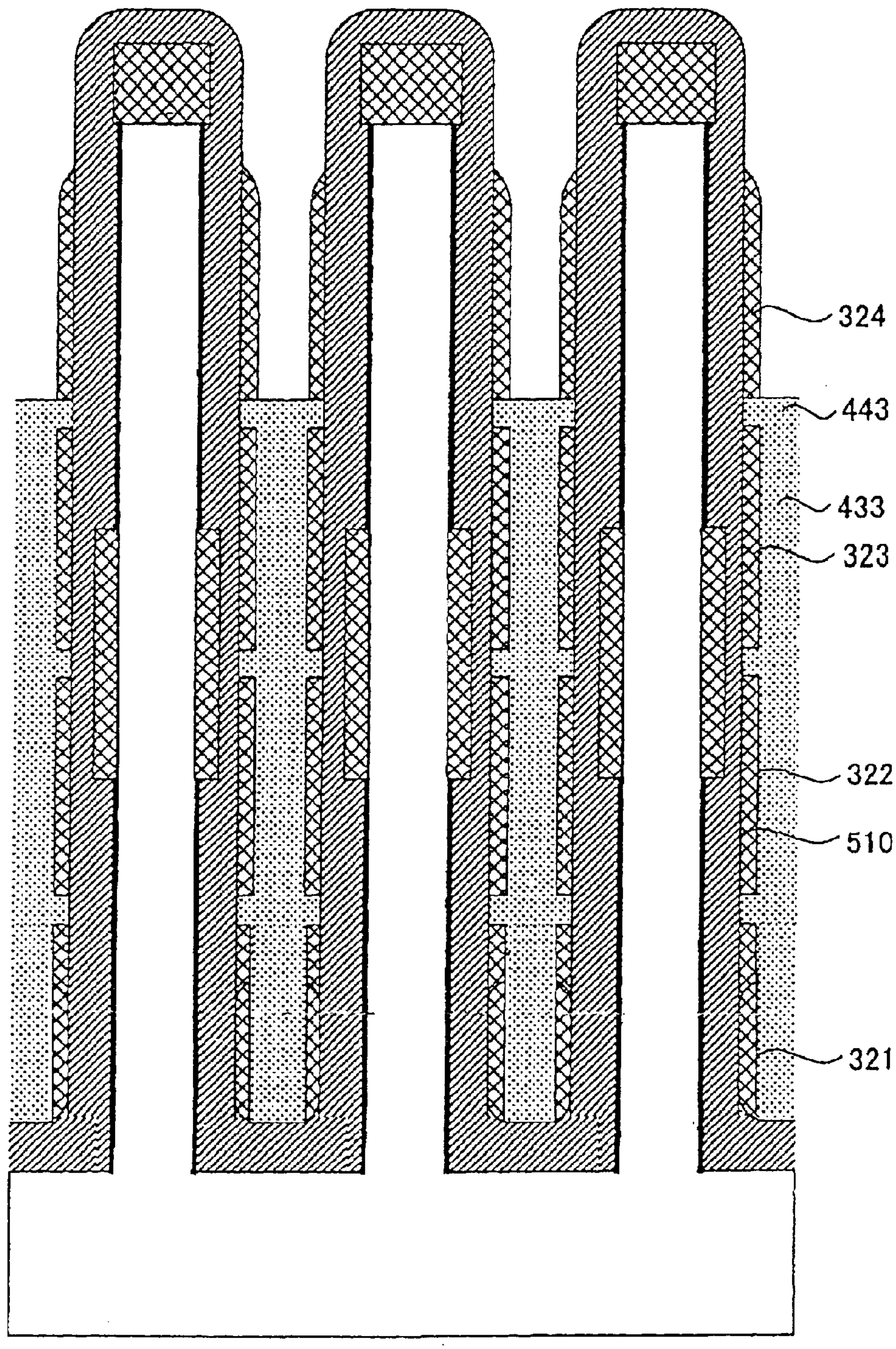
Figure 281:
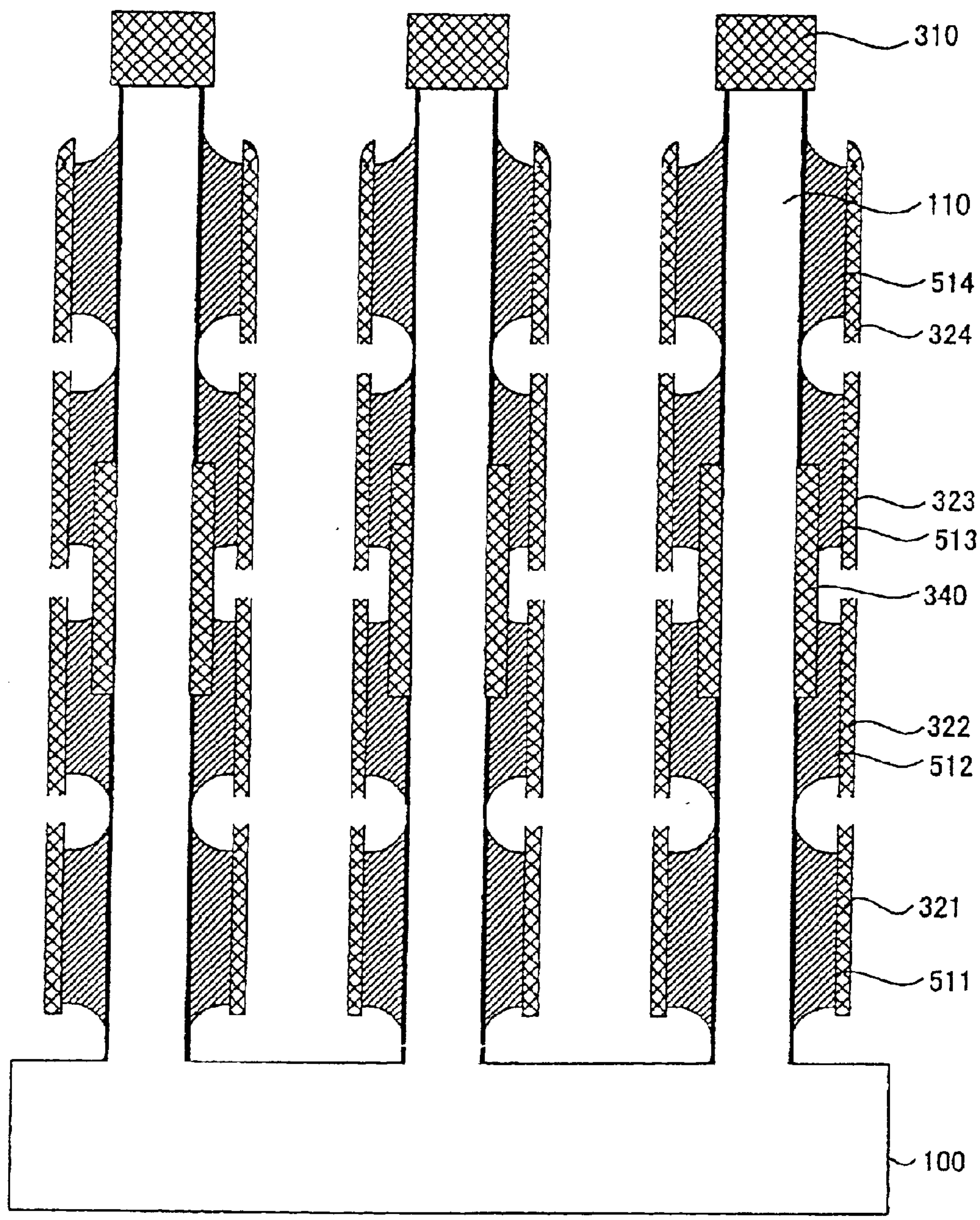

By repeating the above production steps, a plurality of sidewalls are formed of the silicon nitride film on the sidewall of the polysilicon film 510 (FIG. 266 and FIG. 281).

Figure 267:
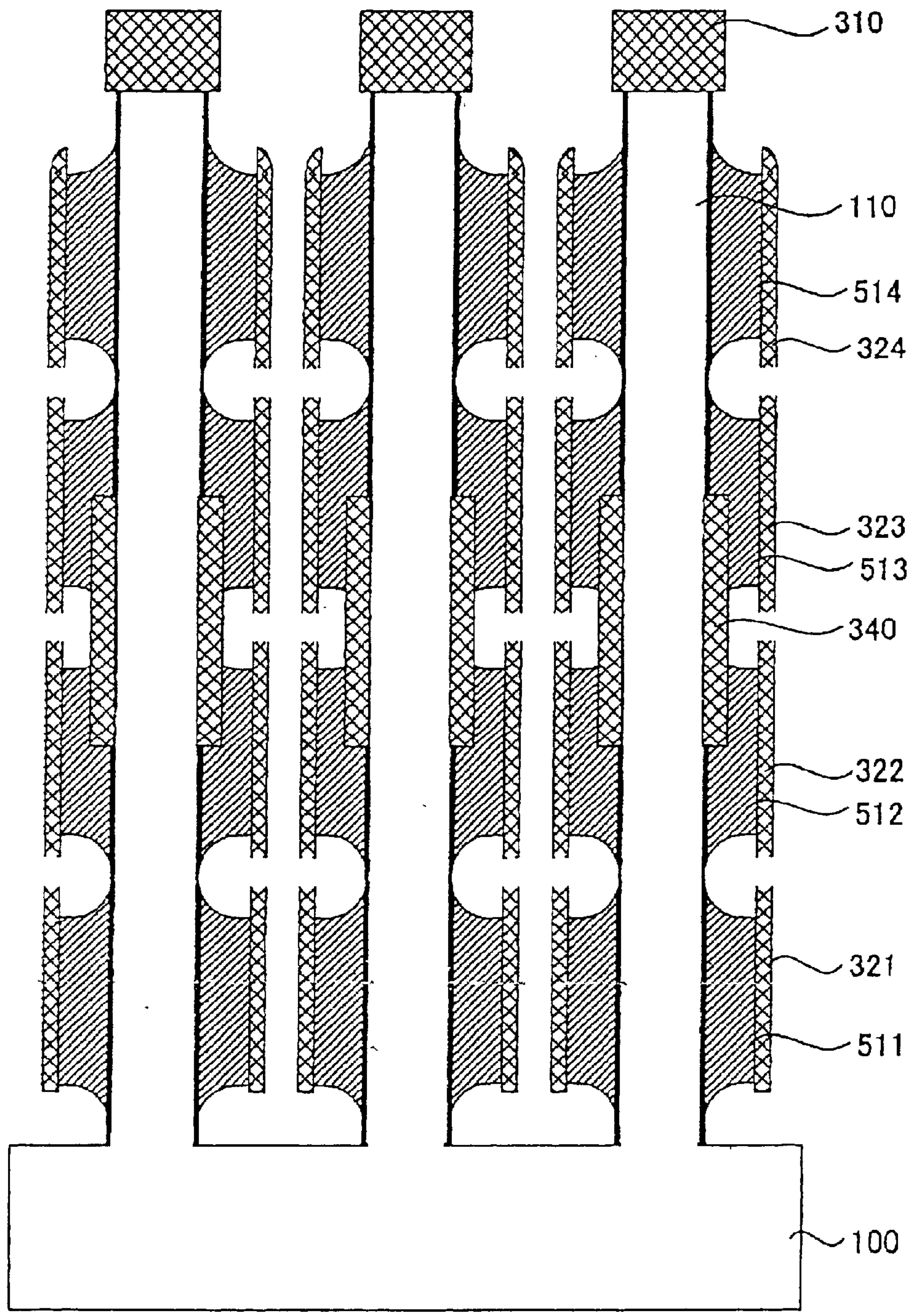

The polysilicon film 510 as a first conductive film is divided by isotropic etching (FIG. 267 and FIG. 281).

Thereafter, the silicon nitride film 310 as a first insulating film, the silicon nitride film 340 as a twelfth insulating film and the sidewalls 321 to 324 of the silicon nitride film as a fourth insulating film are isotropically etched.

Figure 268:
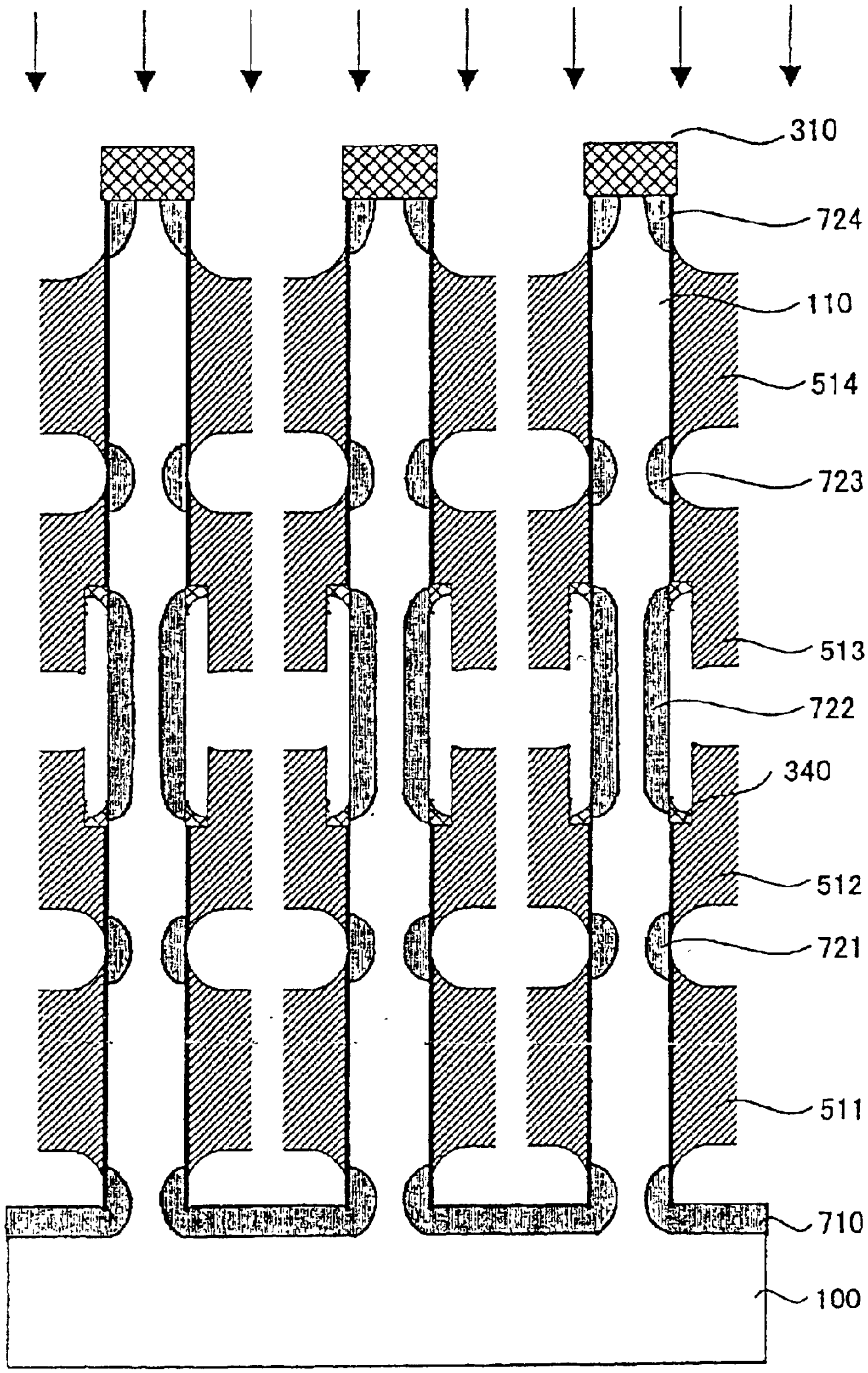
Figure 282:
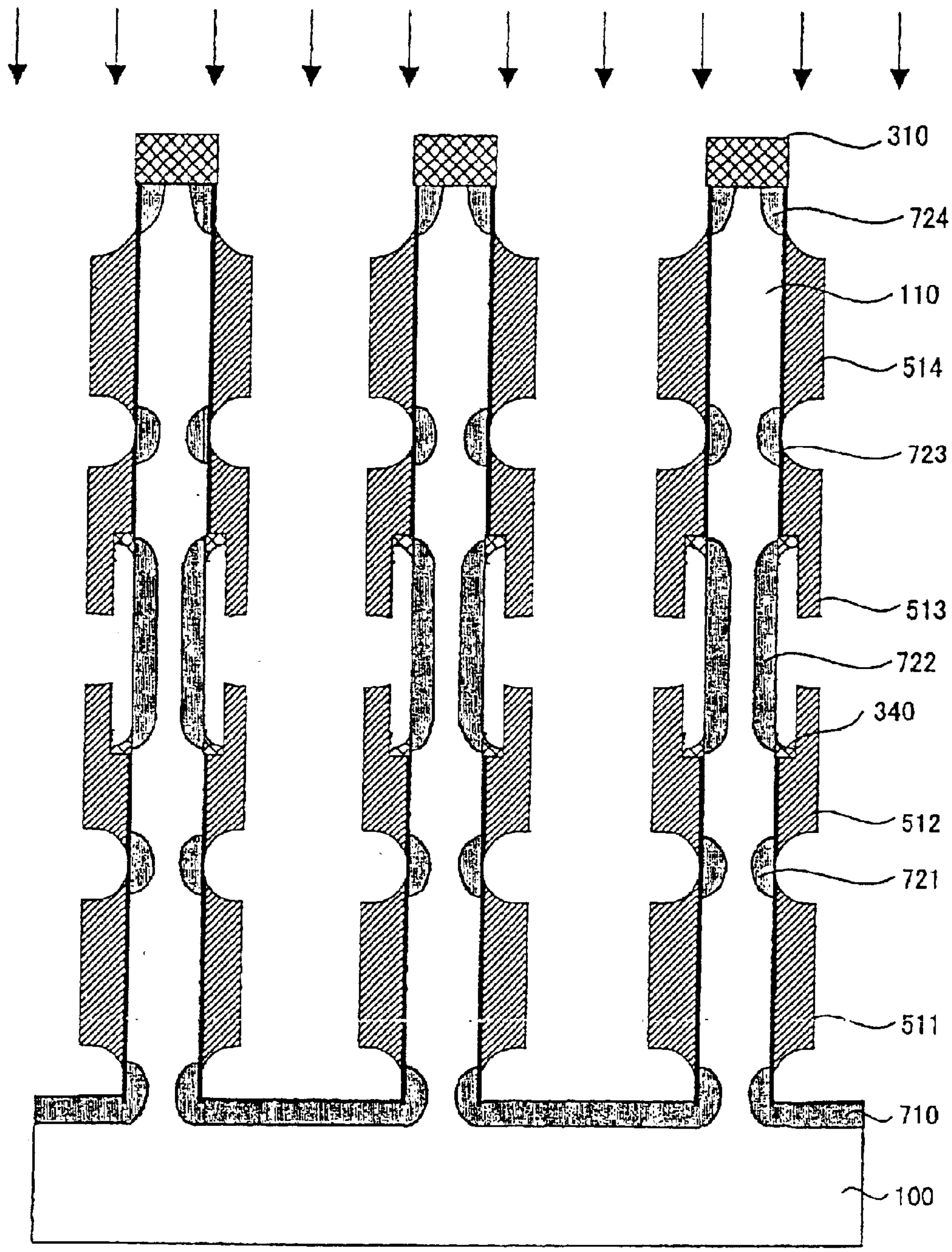

Subsequently, an impurity is introduced into the island-like semiconductor layers 110 and the semiconductor substrate 100 in self-alignment with the divided polysilicon films 511 to 514 as the first conductive films and the silicon nitride film 310 as the first insulating film. For example, N-type impurity diffusion layers 710 to 724 are formed at an arsenic concentration of about $1\times10^{18}$ to $1\times10^{31}/cm^3$ using solid or vapor phase diffusion. At this time, the impurity concentration in the impurity diffusion layer 710 to be a first wiring layer may be adjusted by ion implantation (FIG. 268 and FIG. 282). For example, this ion implantation may be carried out at an implantation energy of 5 to 100 keV at a phosphorus dose of about $1\times10^{13}$ to $1\times10^{15}/cm^2$ in a direction inclined by 0 to 7°.

Figure 269:
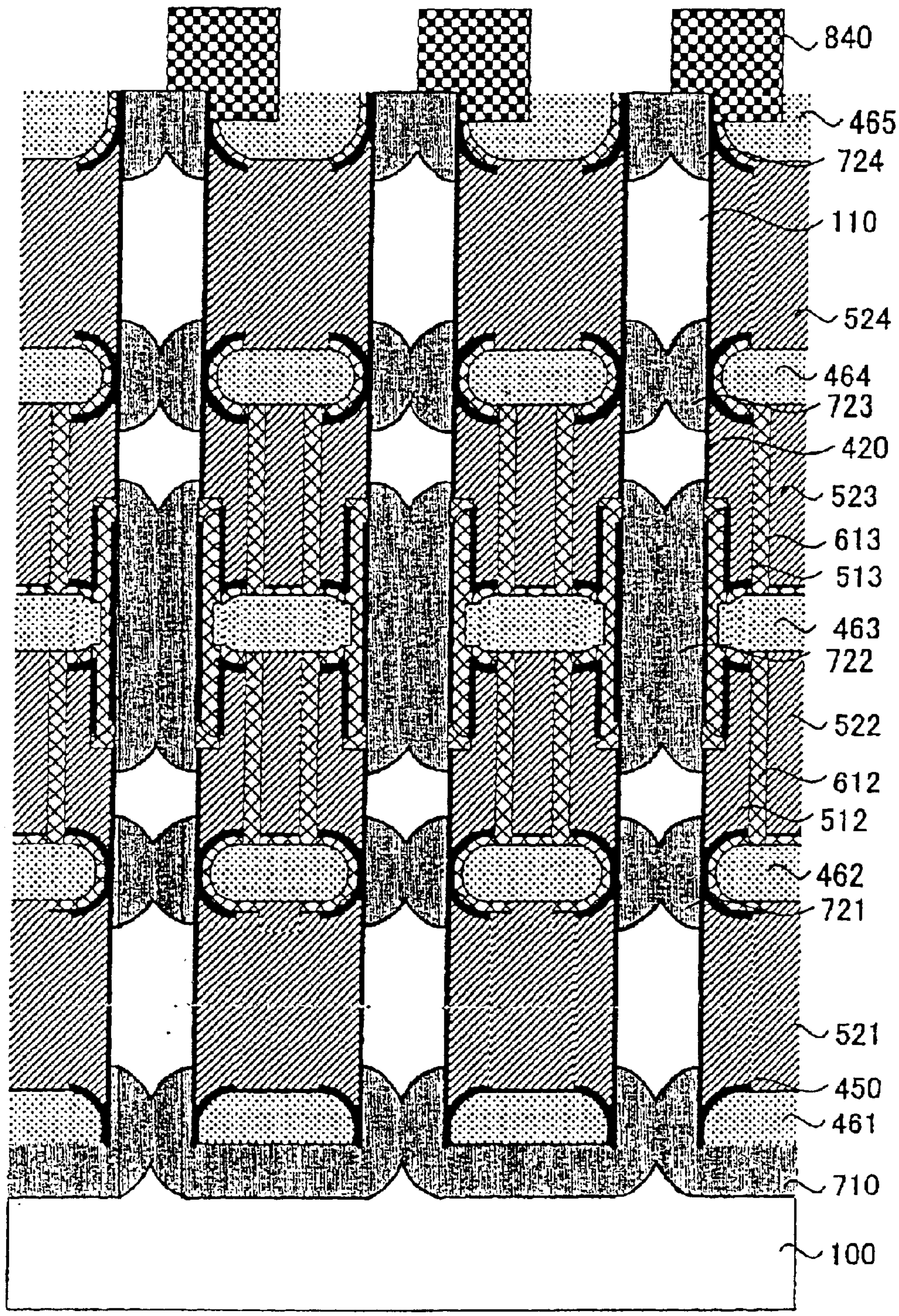
Figure 283:
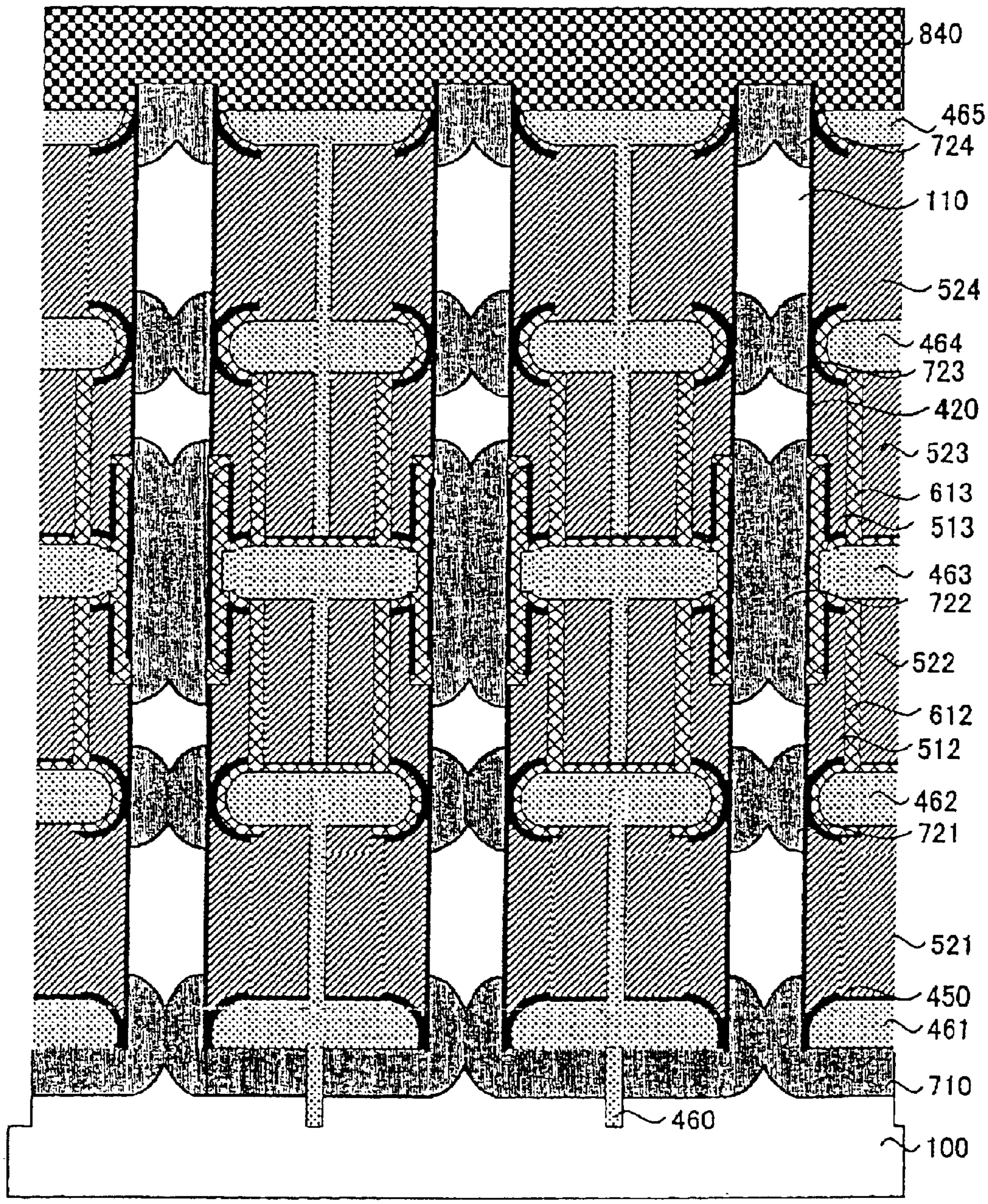
Figure 284:
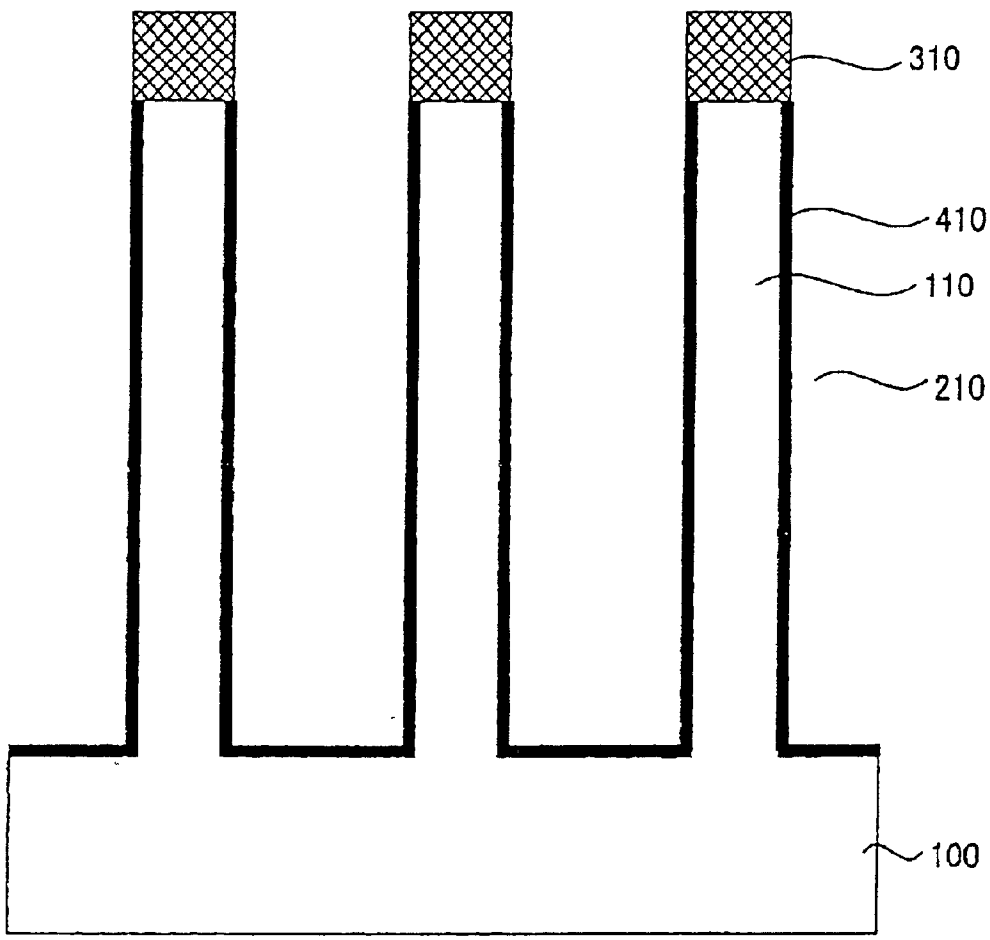

Thereafter, exposed portions of the polysilicon films 511 to 514 are thermally oxidized to selectively form a silicon oxide film 450 as a seventh insulating film, for example. At this time, by thermal oxidization, the impurity in the impurity diffusion layers 710 to 724 are diffused so that the p-type region of the island-like semiconductor layer 110 becomes in a floating state, and further, the impurity diffusion layers 710 to 724 need to reach the nearest ends of the polysilicon films 511 to 514 with intervention of an oxide film 420 as a third insulating film to be a tunnel oxide film (FIG. 269 and FIG. 283). The impurity introduction into the polysilicon layers 511 to 514 may be performed when the polysilicon film 510 is formed or when the impurity is introduced into the island-like semiconductor layer 110. The timing of introducing the impurity is not limited so long as the conductive film is formed.

Thereafter, production steps after the sidewalls 321 to 324 of the silicon nitride film are removed by isotropic etching are in accordance with those of Production Example 1.

In the example, the control gates of the memory cells are formed continuously in one direction without using a mask. However, that is possible only where the island-like semiconductor layers are not disposed symmetrically to a diagonal. More particularly, by setting smaller the intervals between adjacent island-like semiconductor layers in the direction of the second and third wiring layers than those in the direction of the fourth wiring layer, it is possible to automatically obtain the wiring layers which are discontinuous in the direction of the fourth wiring layer and are continuous in the direction of the second and third wiring layers without using a mask. In contrast, if the island-like semiconductor layers are disposed symmetrically to a diagonal, for example, the wiring layers may be separated through patterning with use of resist films by photolithography.

By providing the selection gates in the top and the bottom of a set of memory cells, it is possible to prevent the phenomenon that a memory cell transistor is over-erased, i.e., a reading voltage is 0V and a threshold is negative, and thereby the cell current flows even through a non-selected cell.

PRODUCTION EXAMPLE 10

With regard to Production Example 1, this example is particularly shown for arranging two memory transistors on each island-like semiconductor, the memory transistors being connected in series along the island-like semiconductor layer, and forming the tunnel oxide film partially on the periphery of the pillar-form island-like semiconductor layer 110.

FIGS. 284 to 293 and FIGS. 294 to 303 are sectional views taken on line A-A' and line B-B', respectively, in FIG. 1 illustrating a memory cell array of EEPROM.

In this example, production steps are the same as those in Production Example 1 until the thermally oxidized film 410 is formed as the second insulating film (FIG. 284 and FIG. 294), the thermally oxidized film 410 is etched away and as required the channel ion implantation is carried out on the sidewalls of the island-like semiconductor layers 110, for example, using slant ion implantation.

Thereafter, a silicon oxide film 452, for example, is deposited to about 5 to 50 nm as a twenty-eighth insulating film and is anisotropically etched to remain in the form of sidewall on the sidewall of each island-like semiconductor layer 110. At this time, the silicon oxide film 452 may be formed by thermal oxidation or the thermally oxidized film 410 may be used without being removed. The silicon oxide film 452 may be used as deposited without being formed into the form of sidewall.

Further, a silicon nitride film 362, for example, is deposited to about 5 to 50 nm as a twenty-seventh insulating film and then is anisotropically etched to remain in the form of sidewall on the sidewall of the island-like semiconductor layer 110 with intervention f the silicon oxide film 452.

Figure 285:
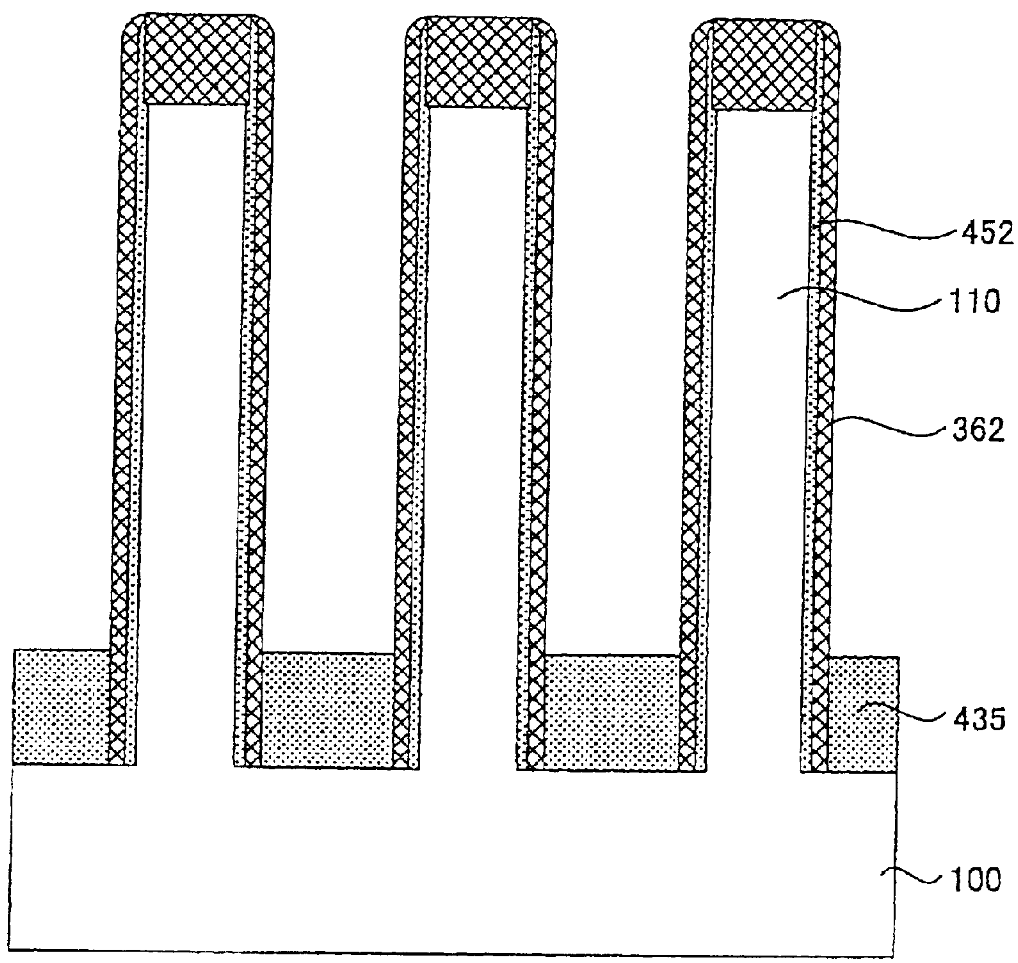
Figure 295:
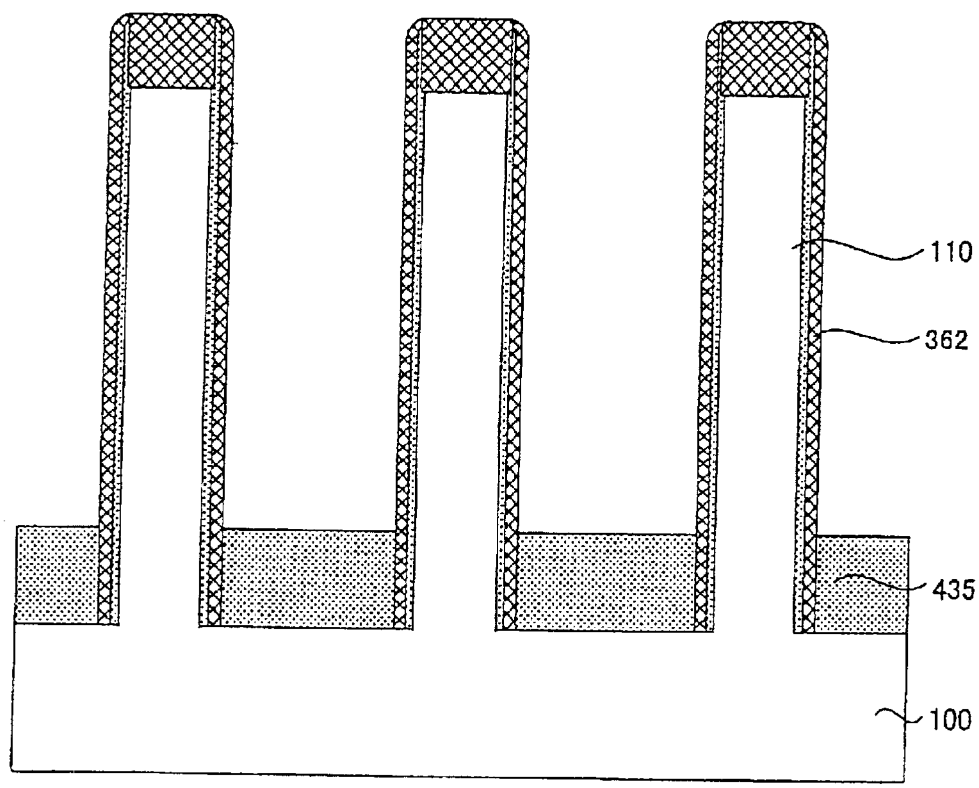

Next, a silicon oxide film 435, for example, is deposited to 50 to 500 nm as a twenty-fifth insulating film and then is buried by isotropic etching to a degree such that the silicon oxide film 435 will reach at least the top of the first conductive film 511 to be formed in a later step (FIG. 285 and FIG. 295).

Figure 286:
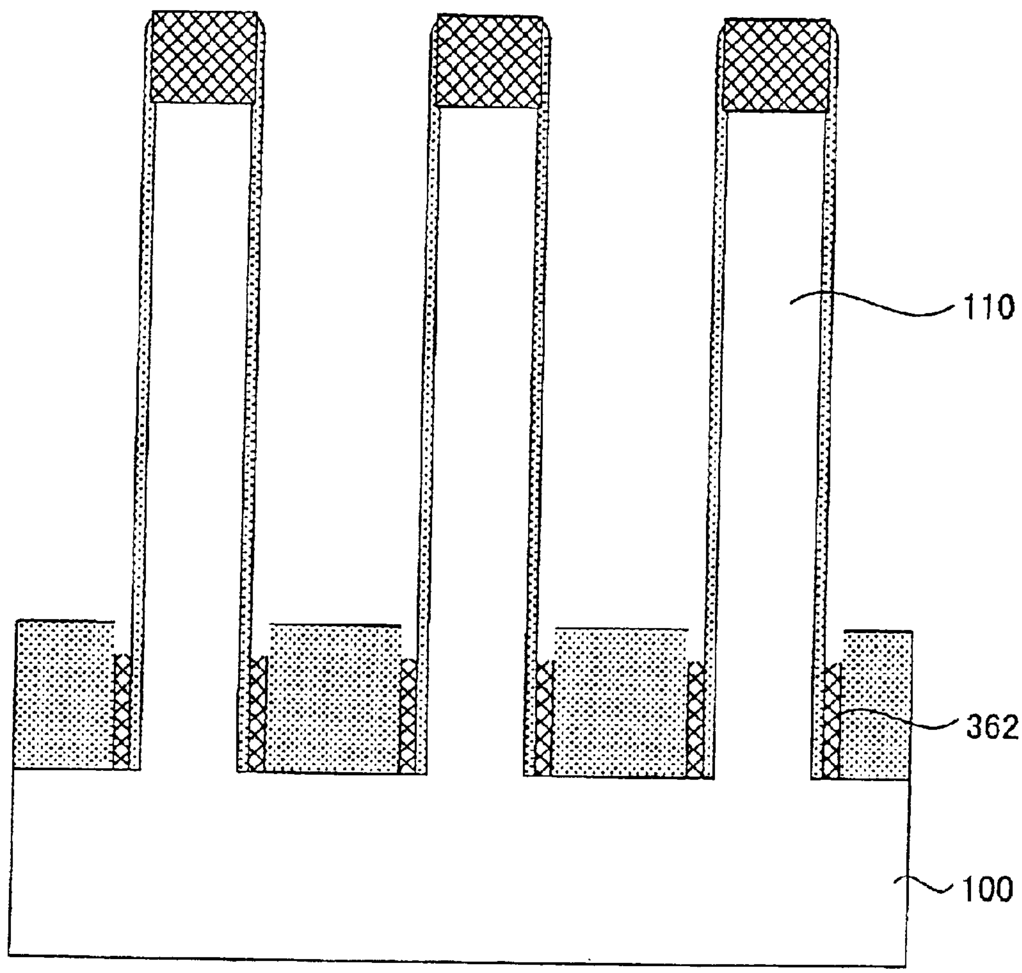
Figure 296:
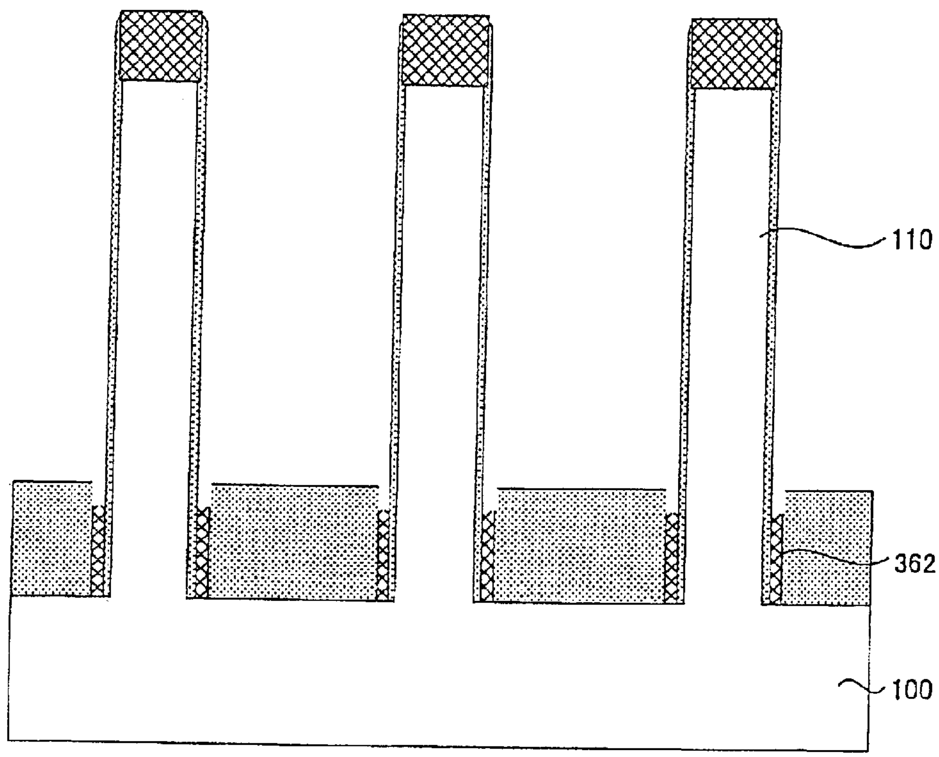

Using the silicon oxide film 435 as a mask, the silicon nitride film 362 is etched by isotropic etching to remain only between the silicon oxide film 452 and the silicon oxide film 435 (FIG. 286 and FIG. 296). At this time, the silicon nitride film 362 forms a recess with respect to the top surface of the silicon oxide film 435.

Figure 287:
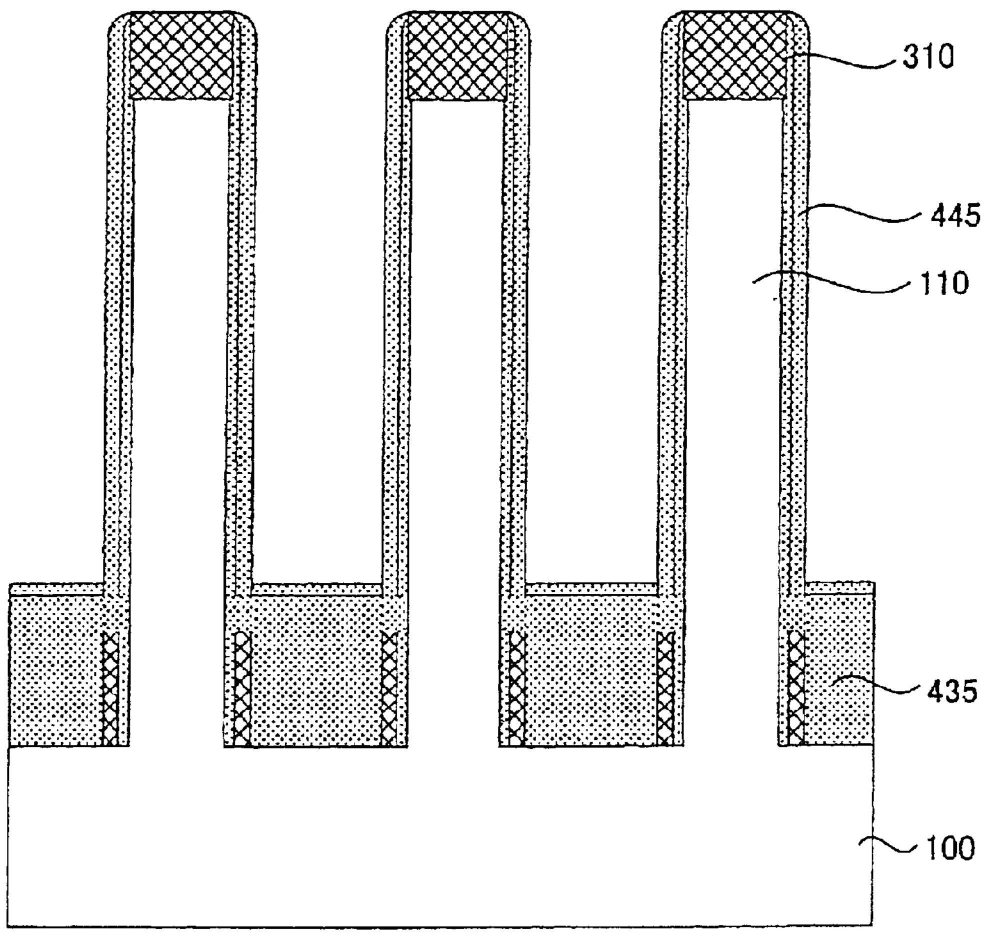
Figure 288:
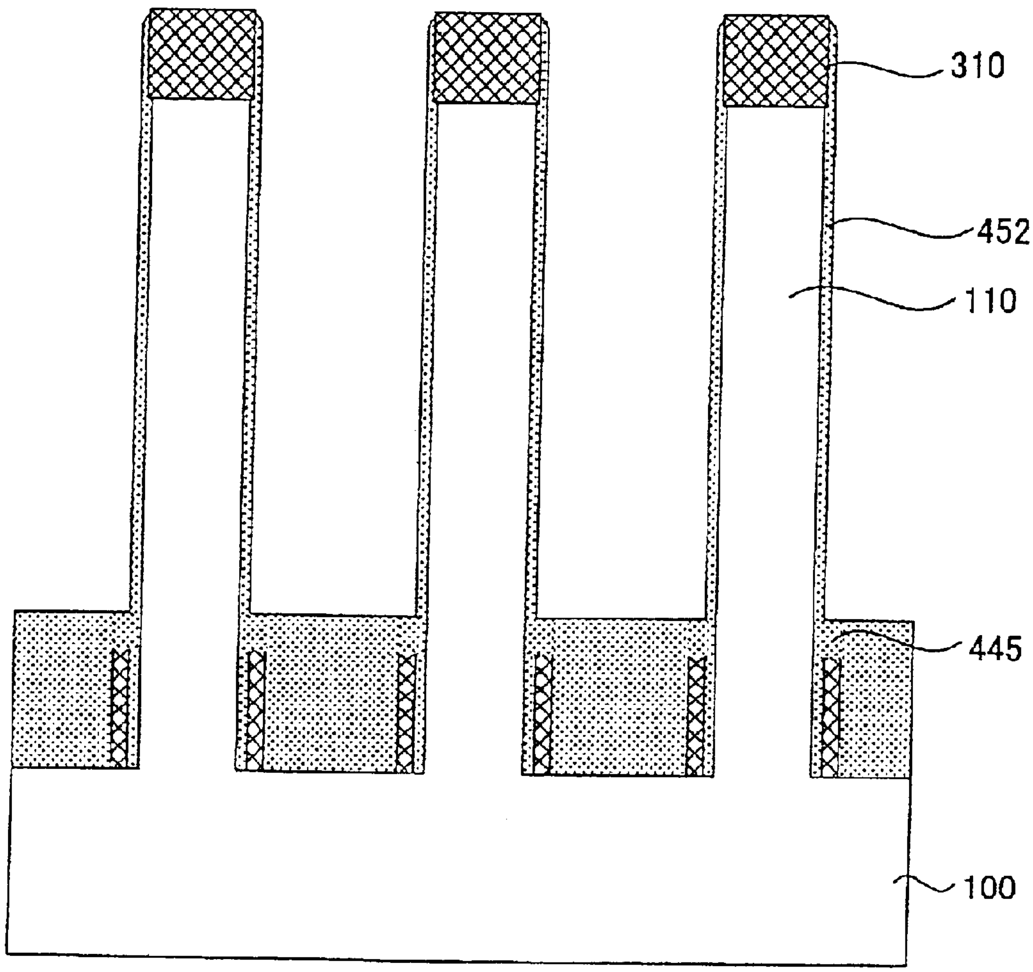
Figure 297:
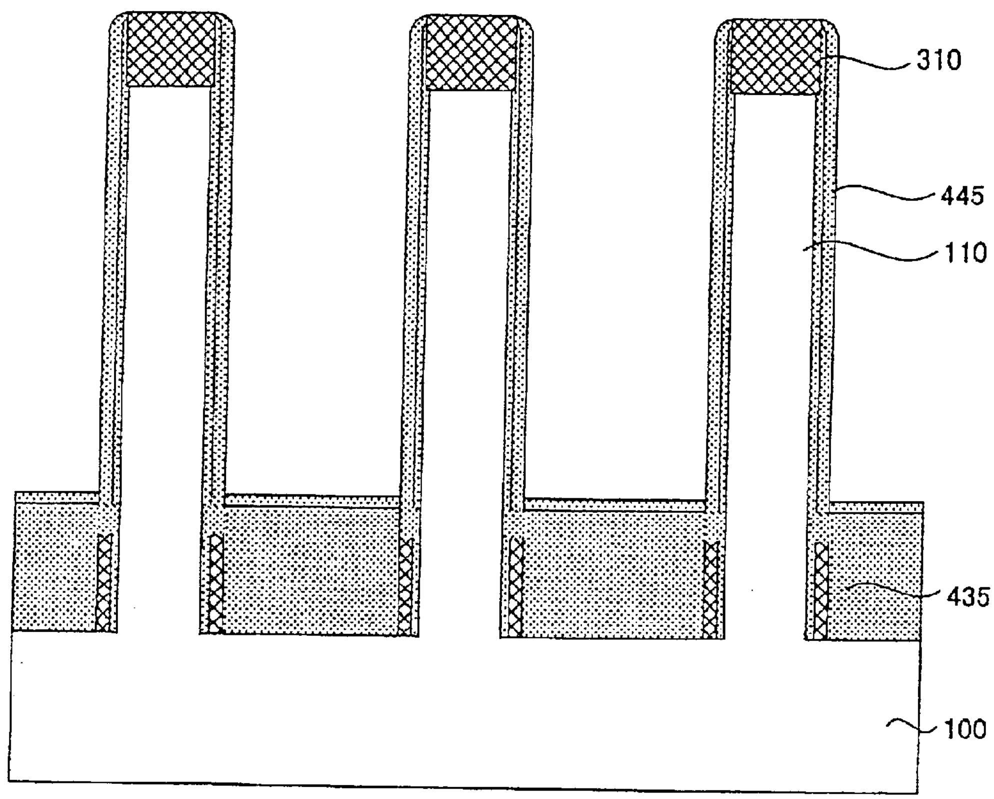
Figure 298:
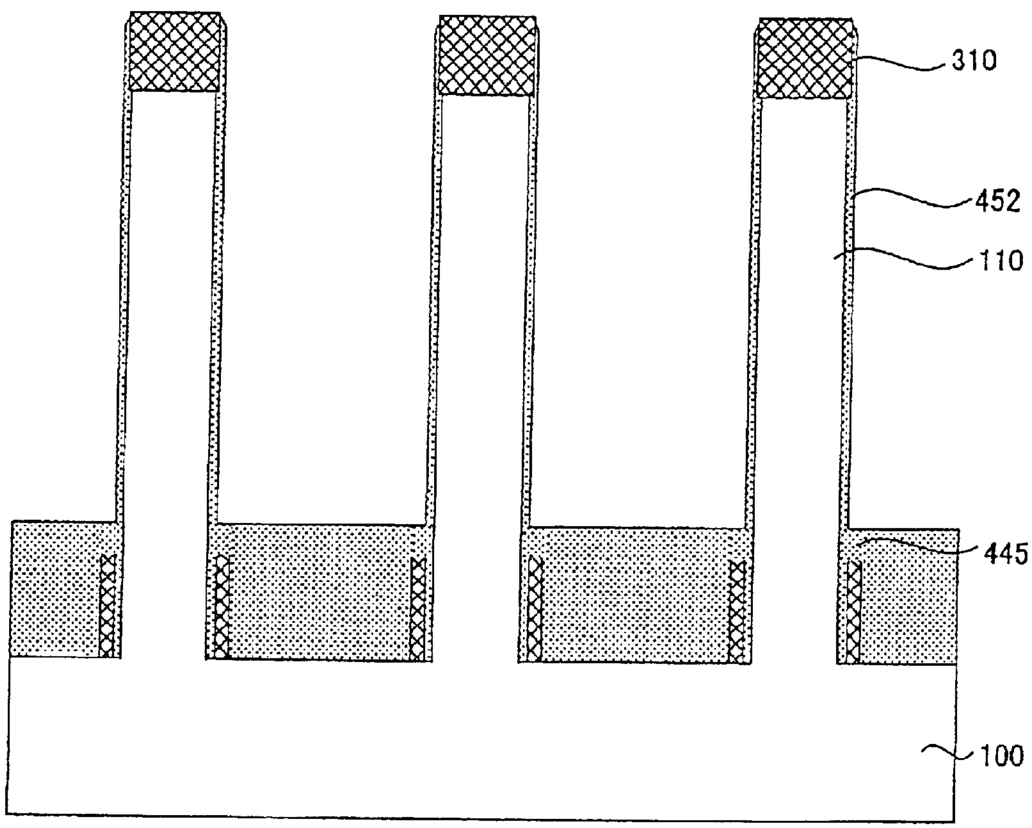

A silicon oxide film 445, for example, is deposited to 3 to 30 nm as a twenty-sixth insulating film in the recess (FIG. 287 and FIG. 297). At this time, the recess can be buried if the silicon oxide film 445 has about half or more the thickness of the silicon nitride film 362. Since the silicon oxide film 445 also deposits on the sidewall of the silicon oxide film 452, the silicon oxide film 445 is removed from the sidewall of the silicon oxide film 452, for example, by isotropic etching. The silicon oxide film 452 may be removed from the top surface of the silicon oxide film 435, and a film of about the same thickness may be formed. Thereby, the silicon oxide film 445 remains in the recess, and the silicon nitride film 362 is buried with the silicon oxide film 435 and the silicon oxide film 445 (FIG. 288 and FIG. 298).

Figure 289:
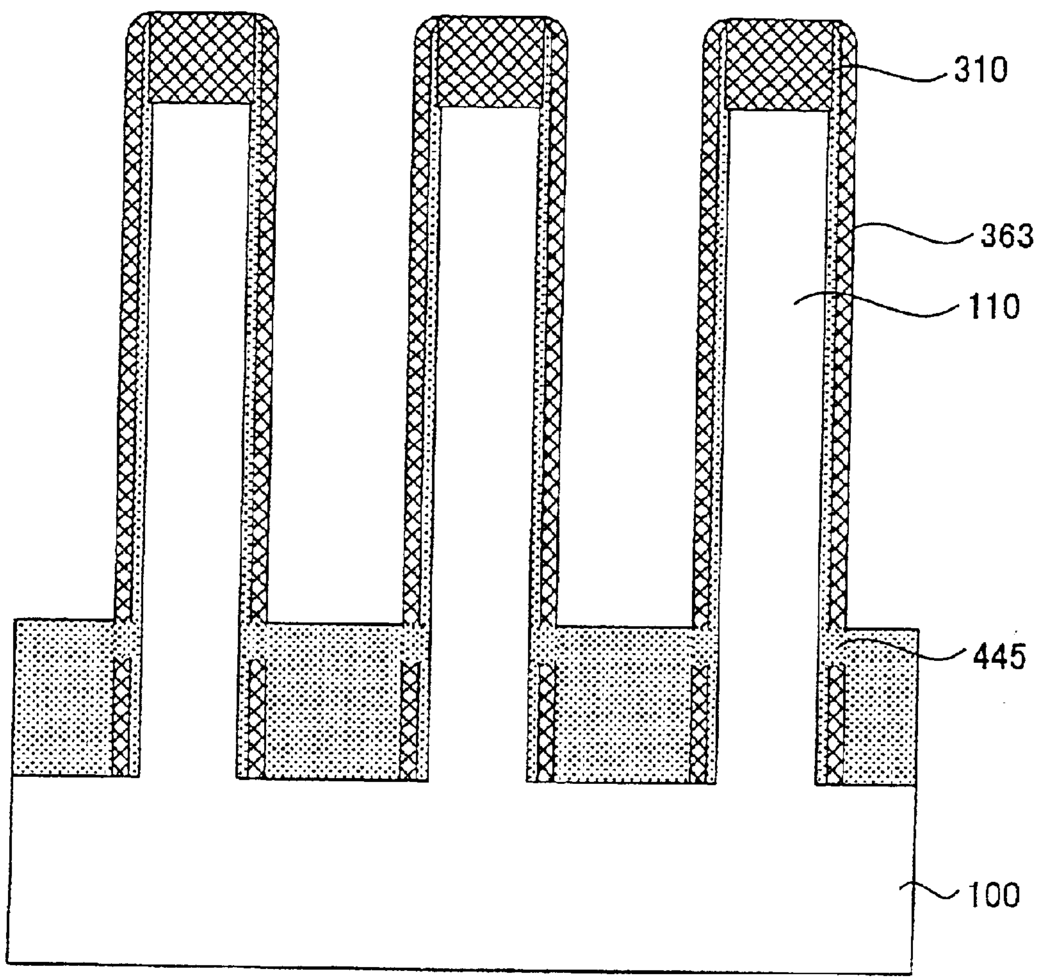
Figure 299:
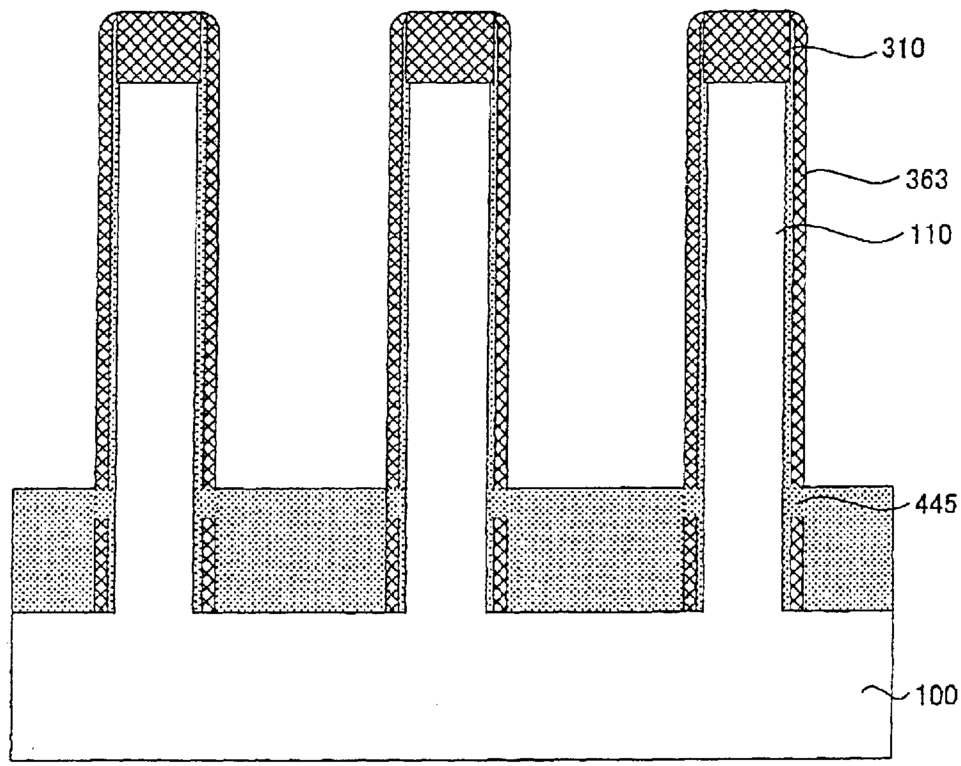

Subsequently, a silicon nitride film 363, for example, is deposited to about 5 to 50 nm as a twenty-seventh insulating film, and then is anisotropically etched to remain in the form of sidewall on the sidewall of the island-like semiconductor layer 110 with intervention of the silicon oxide film 452 (FIG. 289 and FIG. 299).

Thereafter, in the same manner as described above, a silicon oxide film 436 as a twenty-fifth film is buried, and a silicon oxide film 446 is disposed as a twenty-sixth insulating film on a silicon nitride film 363 in the form of sidewall as a twenty-seventh insulating film in the same manner as the silicon oxide film 445 is formed.

Figure 290:
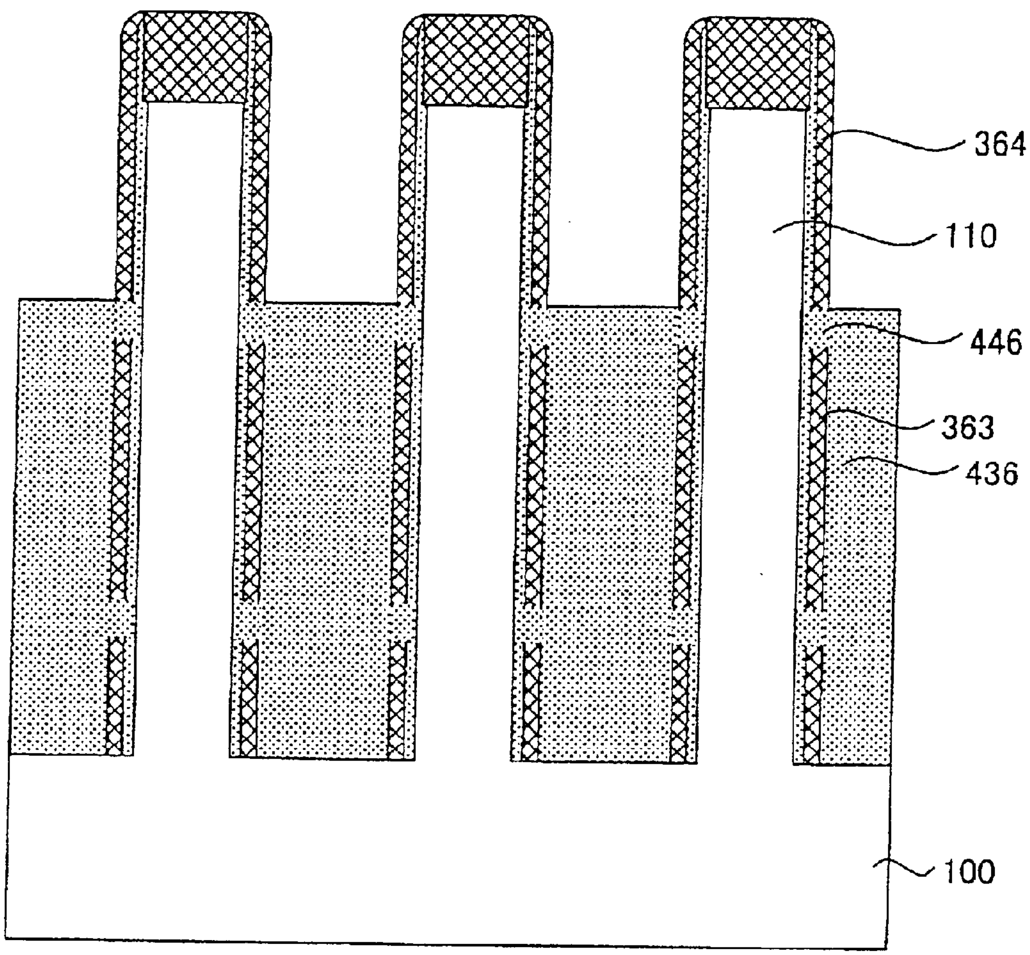
Figure 300:
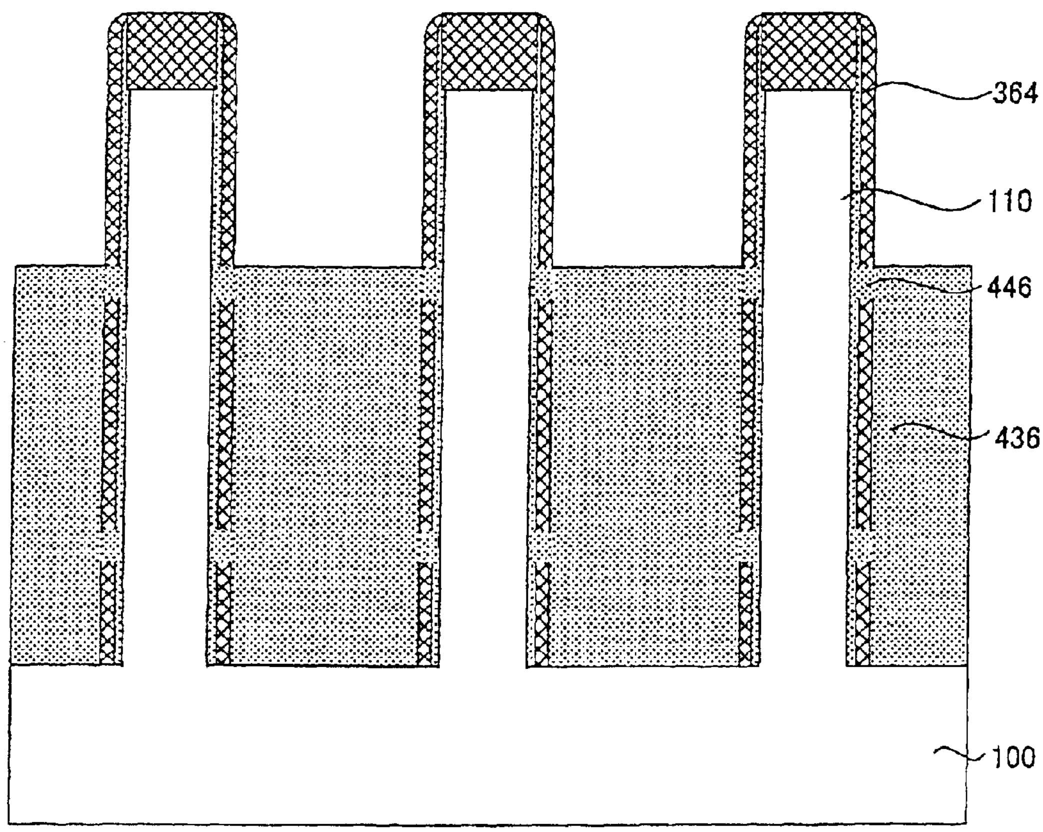

Next, in the same manner as described above, a silicon nitride film 364 as a twenty-seventh insulating film is formed in the form of sidewall on the sidewall of island-like semiconductor layer 110 with intervention of the silicon oxide film 452 (FIG. 290 and FIG. 300).

Figure 291:
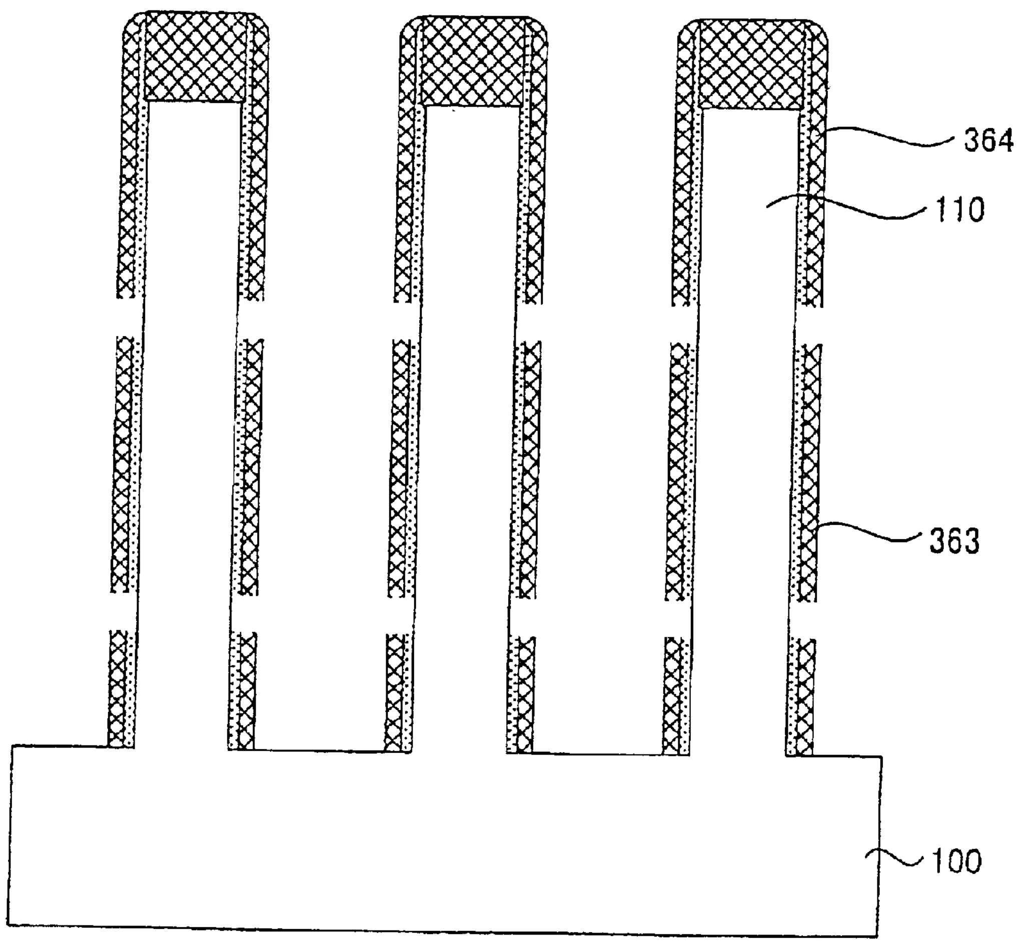
Figure 301:
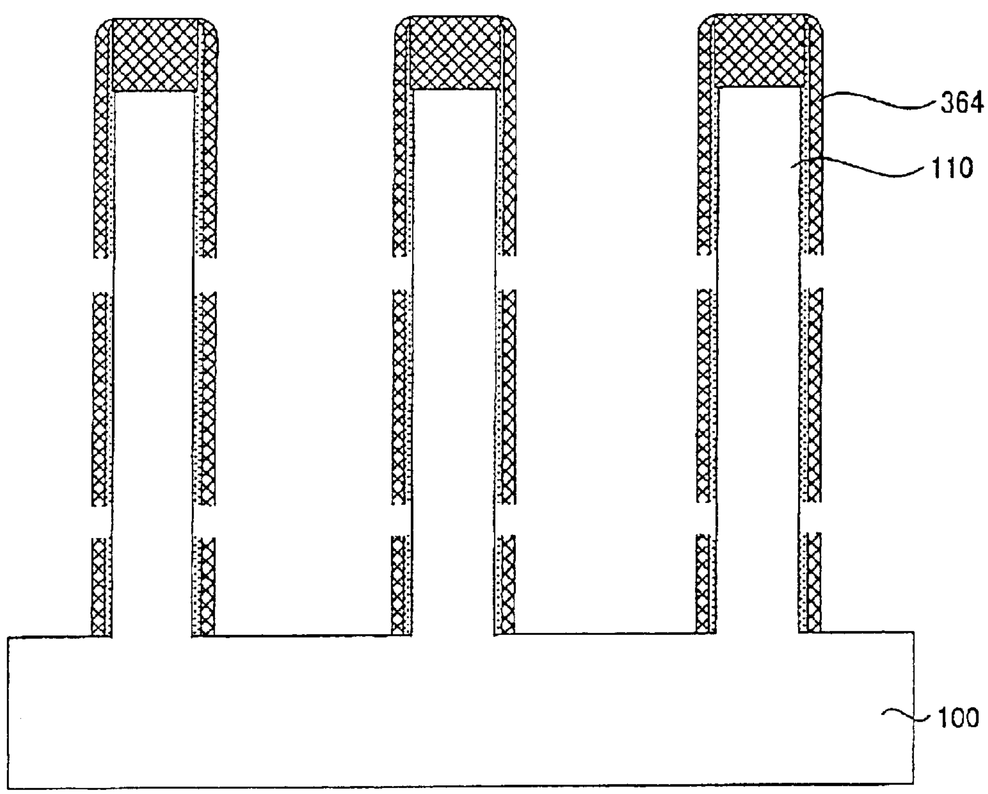

Thereafter, using silicon nitride films 362, 363 and 364 which are twenty-seventh insulating films as a mask, the silicon oxide films 435 and 436, the silicon oxide film 445 and 446 and the silicon oxide film 452 are removed by isotropic etching (FIG. 291 and FIG. 301).

Figure 292:
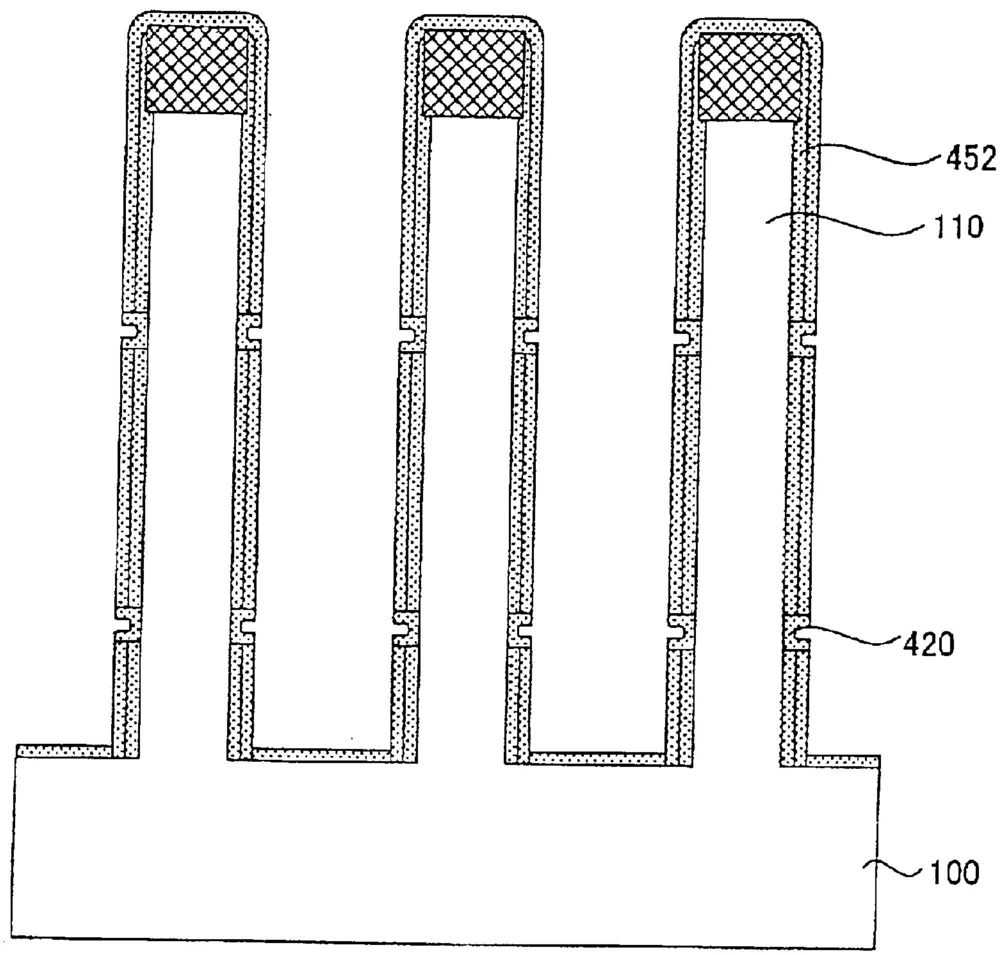
Figure 302:
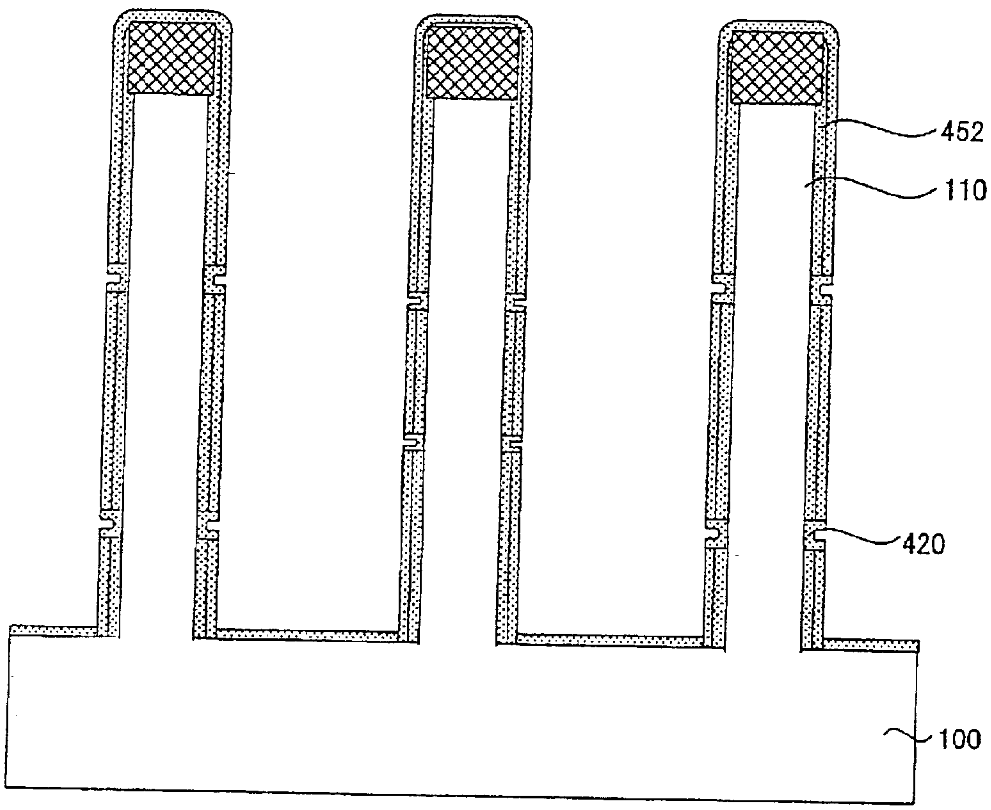

Subsequently, the silicon nitride films 362, 363 and 364 are removed by isotropic etching, and then a silicon oxide film 420, for example, is formed as a third insulating film to be a tunnel oxide film of about 10 nm on the periphery of each island-like semiconductor layer 110, for example, using CVD (FIGS. 292 and 302). At this time, the tunnel oxide film is not limited to a CVD oxide film, but may be a thermally oxidized film or a nitrogen oxide film. The thickness of the silicon oxide film 452 increases to be always thicker than the silicon oxide film 420 as the silicon oxide film 420 is formed.

Figure 293:
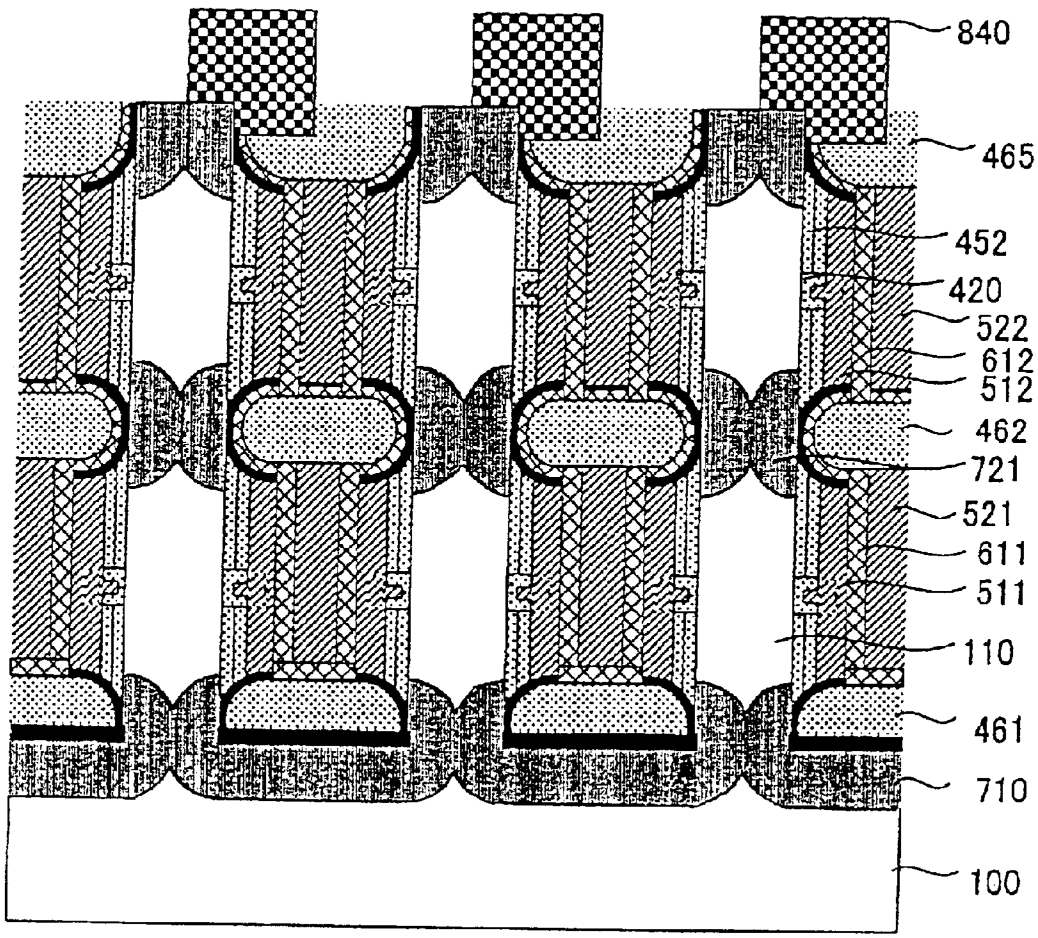
Figure 303:
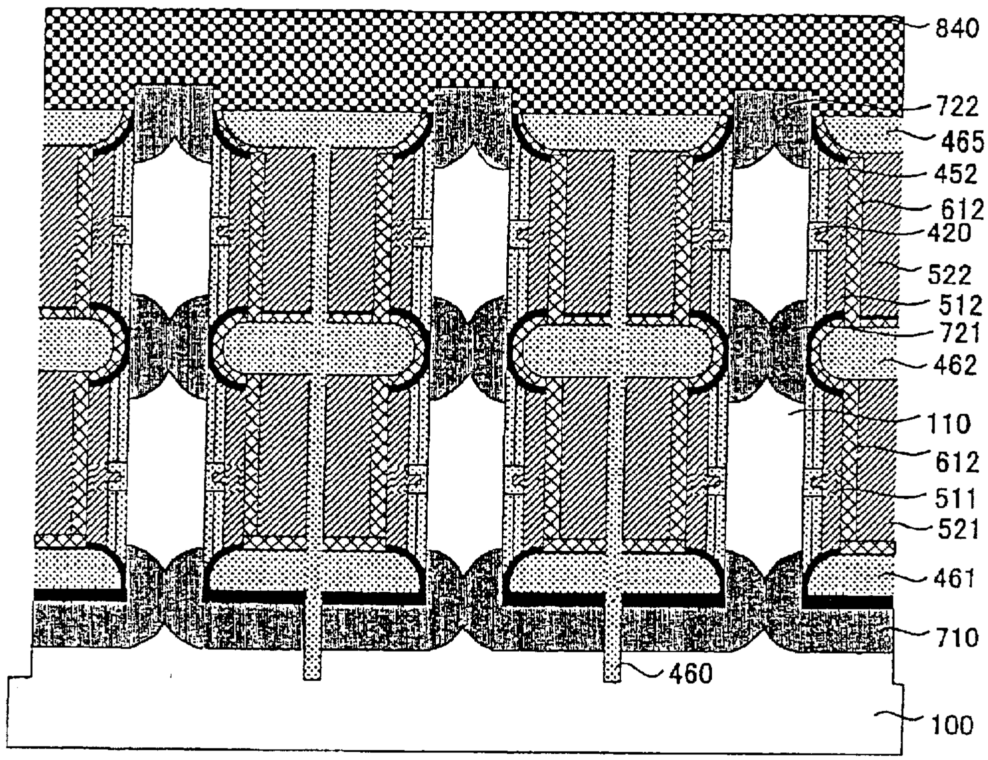

Thereafter, production steps are in accordance with those of Production Example 1 after a polysilicon film 510, for example, to be a first conductive film is deposited to about 50 nm to 200 nm (FIG. 293 and FIG. 303). However, the selection gate transistors are not formed.

It is sufficient that the silicon oxide film 420 which is the third insulating film to be the tunnel oxide film is formed between the desired first conductive film and island-like semiconductor layer 110. For example, the silicon oxide film 420 may be unevenly distributed on the top or at the bottom of the polysilicon film or may be partially overlapped with the impurity diffusion layer.

Further, when the silicon oxide film 420 is formed by thermal oxidation or the like, the formed oxidized film may have or may not have isotropy, as in the above-described Example 1.

In the above-described example, is described the method wherein the charge storage layers are formed at the same time on the sides of the island-like semiconductor layers 110 formed by patterning the semiconductor substrate, but various methods may be combined.

As shown in the above-described production method, a plurality of memory cells having the charge storage layers and the control gates are connected in series in a direction perpendicular to the semiconductor substrate. The memory cells are formed on the sides of the island-like semiconductor layers arranged in matrix and insulated in the lattice form on the semiconductor substrate. The impurity diffusion layers disposed on the island-like semiconductor layers are sources or drains of the memory cells. The semiconductor substrate is electrically insulated from the island-like semiconductor layers by the impurity diffusion layers. The control gates constitute control gate lines which are disposed continuously with regard to a plurality of island-like semiconductor layers in one direction and are formed in a horizontal direction with respect to the semiconductor substrate. The bit lines are electrically connected with the impurity diffusion layers in a direction crossing the control gate lines and are arranged in the horizontal direction with respect to the semiconductor substrate. However, the above-listed features may be combined in various ways.

Are described examples in which, unlike the conventional memory, an impurity diffusion layer is so formed that an active region of each memory cell formed on a semiconductor substrate or semiconductor layer which is patterned in a pillar form is in a floating state with respect to the semiconductor substrate. Further, before the formation of the semiconductor substrate or the semiconductor layer to be the active region, a region for forming a charge storage layer formed of a laminated film comprising plural films is precisely defined in a direction perpendicular to the surface of the semiconductor substrate by controlling the thickness of each film, and then the charge storage layer is formed in this region.

PRODUCTION EXAMPLE 11

In a semiconductor memory to be produced in this example, regions for forming charge storage layers are defined in advance by a laminated film comprising plural films and then island-like semiconductor layers in a pillar form are formed by selective epitaxial silicon growth in trenches opened by using a photoresist mask. Tunnel oxide films and floating gates as charge storage layers are formed on the sides of the island-like semiconductor layers in the regions for forming the charge storage layers. The island-like semiconductor layers are each in an electrically floating state with respect to the semiconductor substrate. The active region of each memory cell is in the electrically floating state.

In the semiconductor memory, selection gate transistors are disposed at the top and the bottom of the island-like semiconductor layer. A plurality of memory transistors, for example, two memory transistors, are placed between the selection gate transistors. The tunnel oxide film and the floating gate of the transistors are formed at the same time. The transistors are connected in series along the island-like semiconductor layer. Further, the thickness of gate insulating films of the selection gate transistors is equal to the thickness of gate insulating films of the memory transistors.

FIGS. 304 to 336 and FIGS. 337 to 368 are sectional views taken on line A-A' and line B-B', respectively, in FIG. 1 which is a plan view illustrating an EEPROM memory cell array.

First, on a surface of a P-type silicon substrate 2100, a silicon oxide film 2411 containing arsenic impurities of about $1\times10^{18}$ to $1\times10^{22}/cm^3$, for example, is deposited as a first insulating film to a thickness of 50 to 500 nm by CVD. At this time, ion implantation may be carried out to introduce the impurities to the insulating film deposited by CVD. For example, to the silicon oxide film 2411 deposited to a thickness of 50 to 500 nm, ion implantation may be carried out at an implantation energy of 5 to 100 keV at an arsenic dose of about $1\times10^{14}$ to $1\times10^{16}/cm^2$ at an angle of about 0 to 45° with respect to the normal line of the surface of the substrate. The impurity introduction to the silicon oxide film 2411 by ion implantation may not necessarily be carried out immediately after the deposition of the silicon oxide film 2411. Regarding the ion implantation to the silicon oxide film 2411, the angle for the implantation is not particularly limited as long as a desired impurity concentration is obtained. Means for the impurity introduction to the silicon oxide film 2411 is not limited to the ion implantation, but any means such as solid or vapor phase diffusion may be used.

Thereafter, a silicon nitride film 2321, for example, is deposited as a fourth insulating film to a thickness of 10 to 100 nm. If the above-mentioned impurity introduction to the silicon oxide film 2411 is carried out by ion implantation, the impurities may be introduced by ion implantation through the silicon nitride film 2321 into the silicon oxide film 2411.

Figure 304:
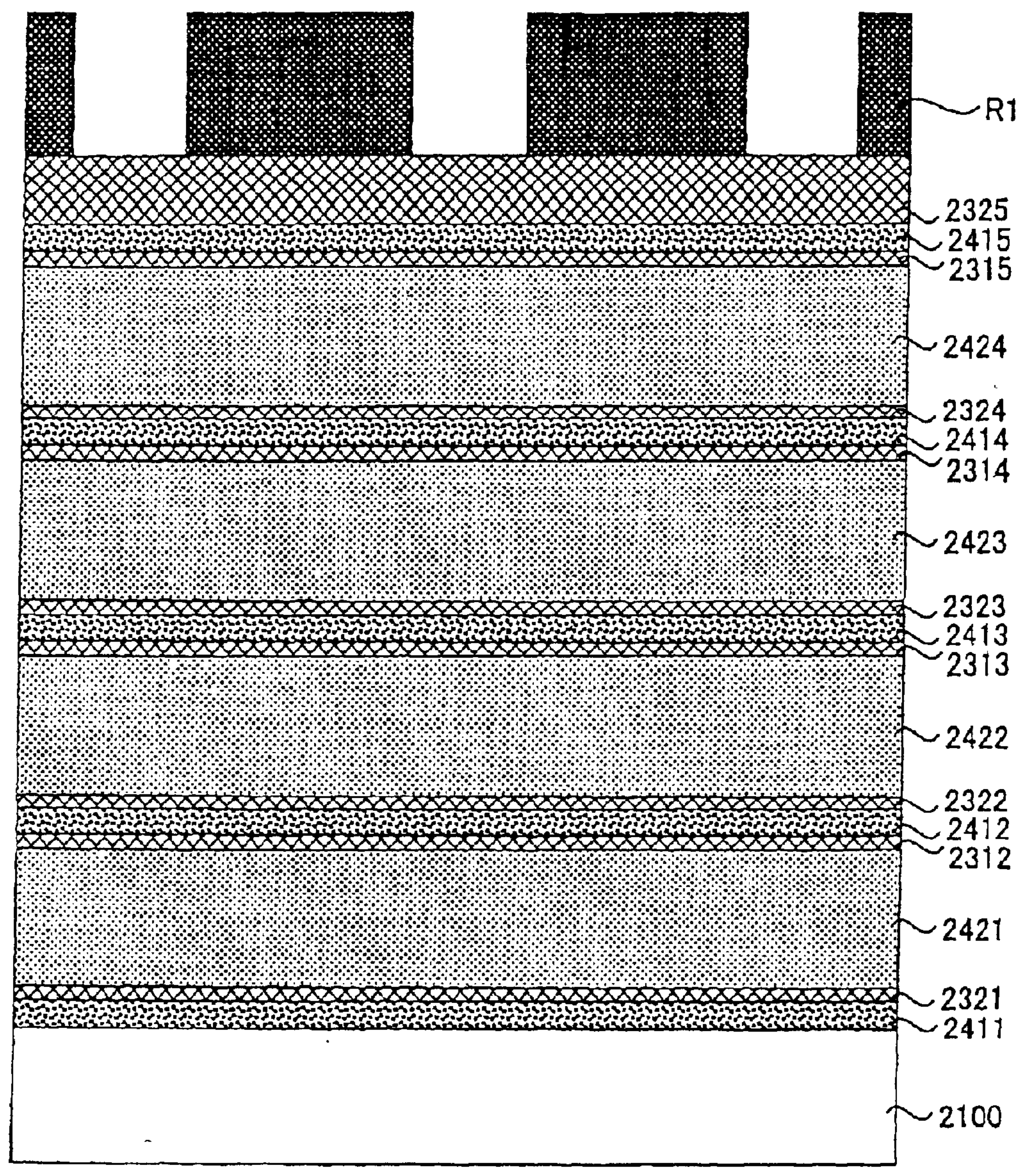
Figure 335:
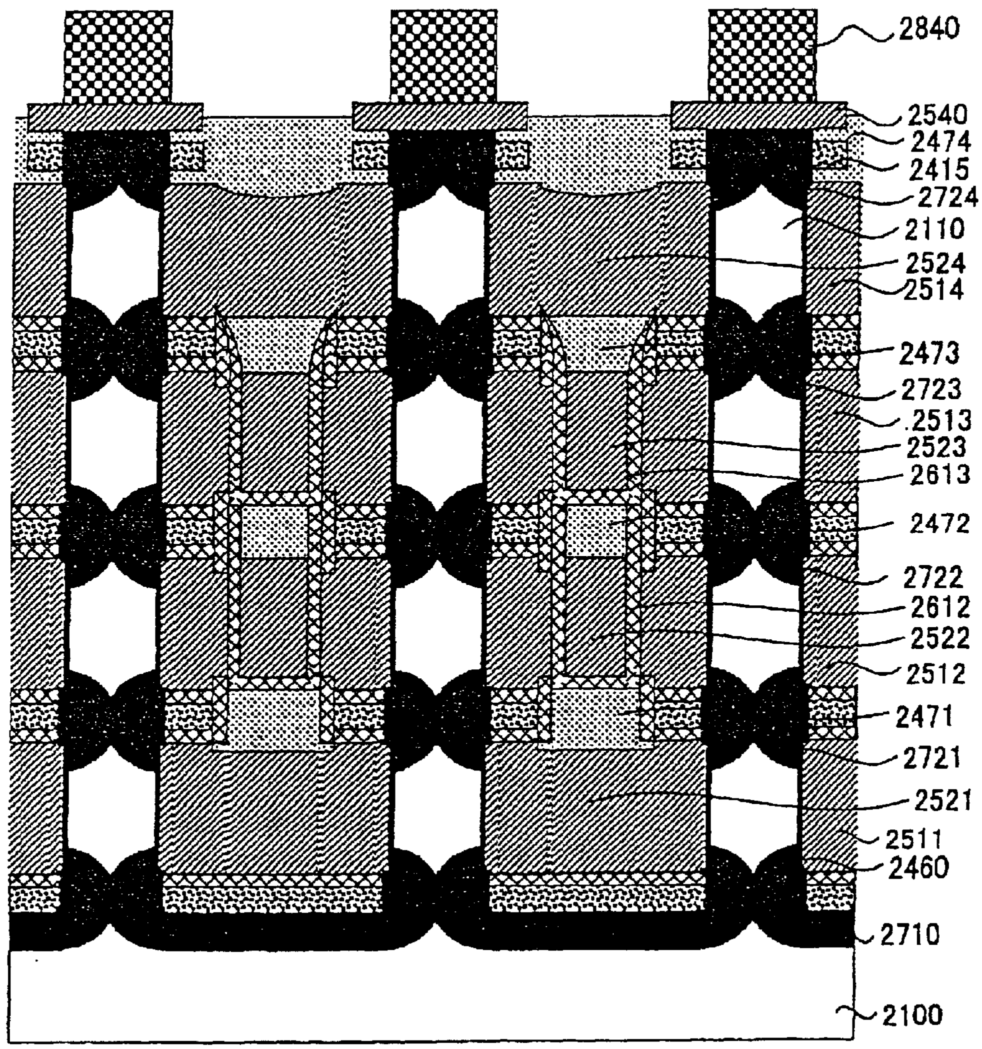

Then, a silicon oxide film 2421, for example, is deposited as a third insulating film to a thickness of 50 to 500 nm and a silicon nitride film 2312 is deposited as a second insulating film to a thickness of 10 to 100 nm. Further, a silicon oxide film 2412 containing impurities is deposited as a first insulating film to a thickness of 50 to 500 nm, a silicon nitride film 2322 is deposited as a fourth insulating film to a thickness of 10 to 100 nm, and a silicon oxide film 2422 is deposited as a third insulating film to a thickness of 50 to 500 nm. Thus, the films are sequentially formed. Then, as shown in FIGS. 304 and 335, a silicon oxide film 2415 containing impurities is deposited as a first insulating film to a thickness of 50 to 500 nm and a silicon nitride film 2325 is deposited as a fourth insulating film to a thickness of 500 to 5,000 nm.

Figure 305:
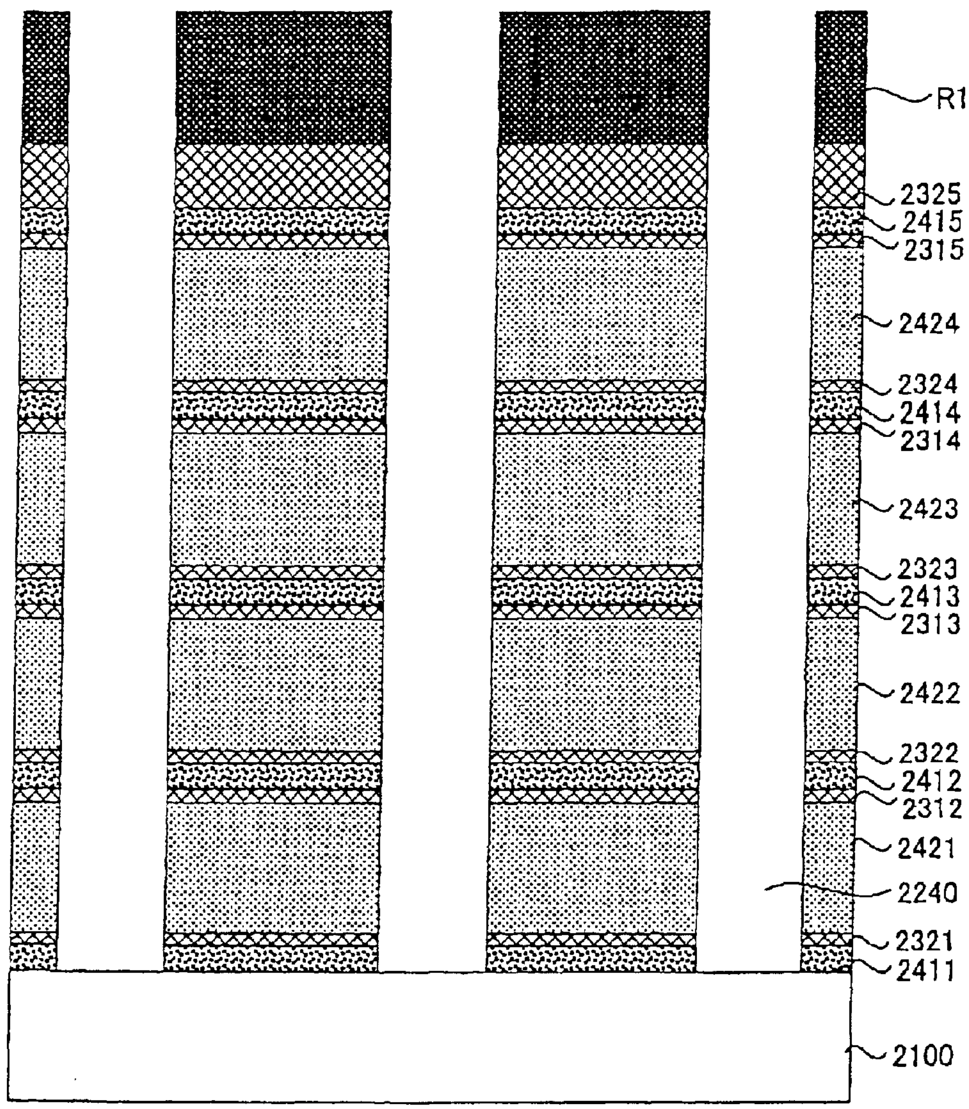
Figure 338:
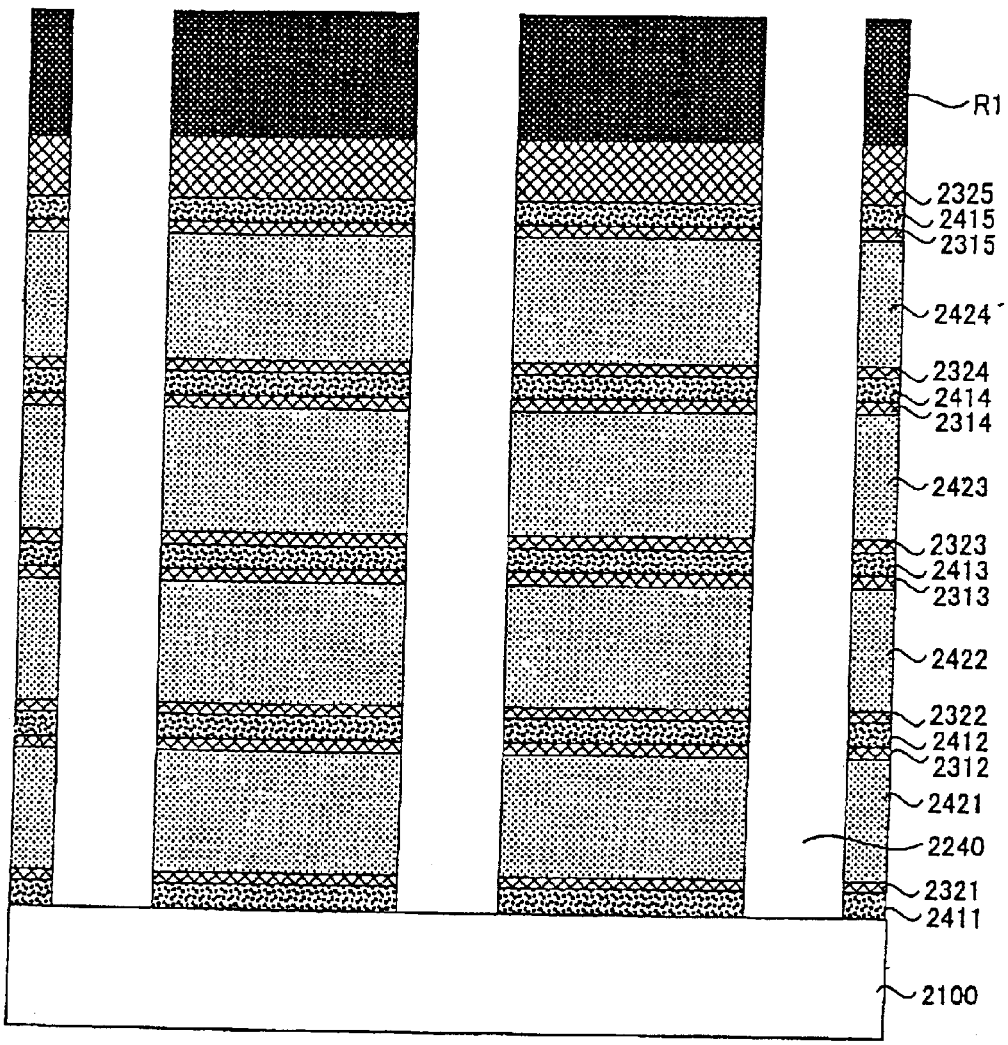

Subsequently, using a resist film R1 patterned by a known photolithographic technique as a mask (FIGS. 304 and 337), reactive ion etching, for example, is performed to sequentially etch the silicon nitride film 2325, the silicon oxide film 2415, the silicon nitride film 2315, the silicon oxide film 2424, the silicon nitride film 2324, the silicon oxide film 2414, the silicon nitride film 2314, the silicon oxide film 2423, the silicon nitride film 2323, the silicon oxide film 2413, the silicon nitride film 2313, the silicon oxide film 2422, the silicon nitride film 2322, the silicon oxide film 2412, the silicon nitride film 2312, the silicon oxide film 2421, the silicon nitride film 2321 and the silicon oxide film 2411, thereby forming a four th trench 2240 (FIGS. 305 and 338).

Figure 306:
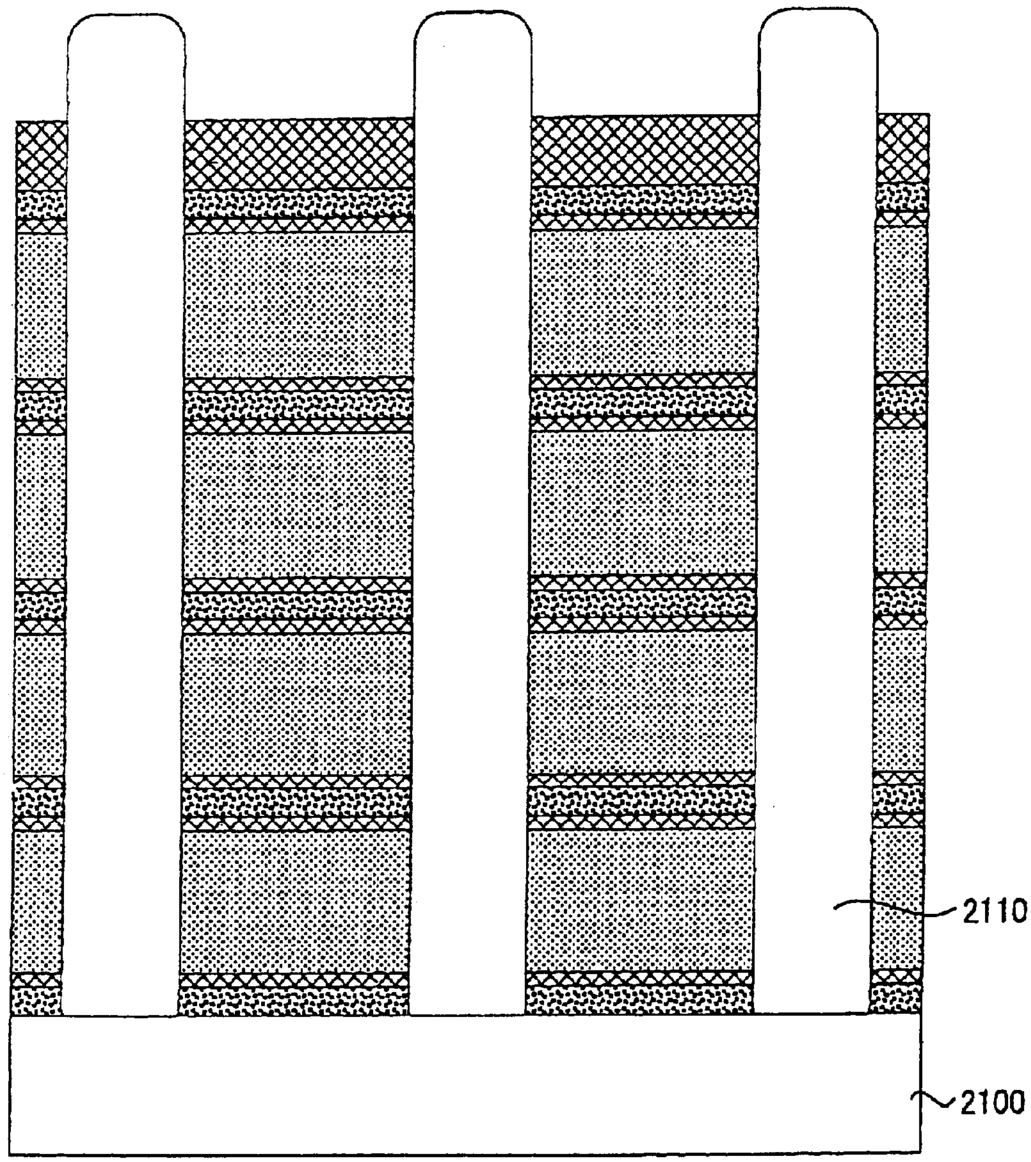
Figure 339:
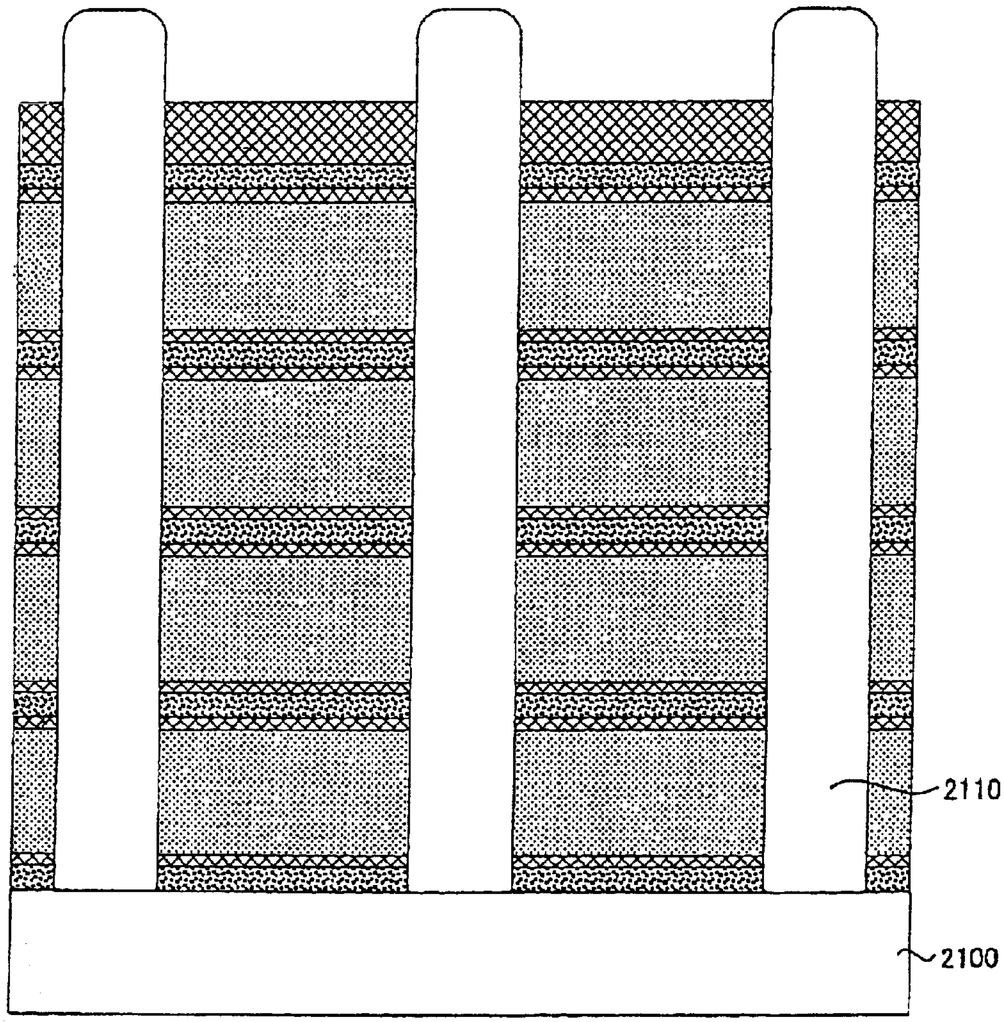

The resist film R1 is removed and then island-like semiconductor layers 2110 are filled in the fourth trench 2240. For example, the island-like semiconductor layers 2110 are formed by selective epitaxial growth from the P-type silicon substrate 2100 located at the bottom of the fourth trench 2240 (FIGS. 306 and 339). The thus formed island-like semiconductor layers 2110 are flattened to be flush with the silicon nitride film 2325. The flattening may be carried out by isotropic or anisotropic etch-back, CMP, or a combination in various ways.

Figure 307:
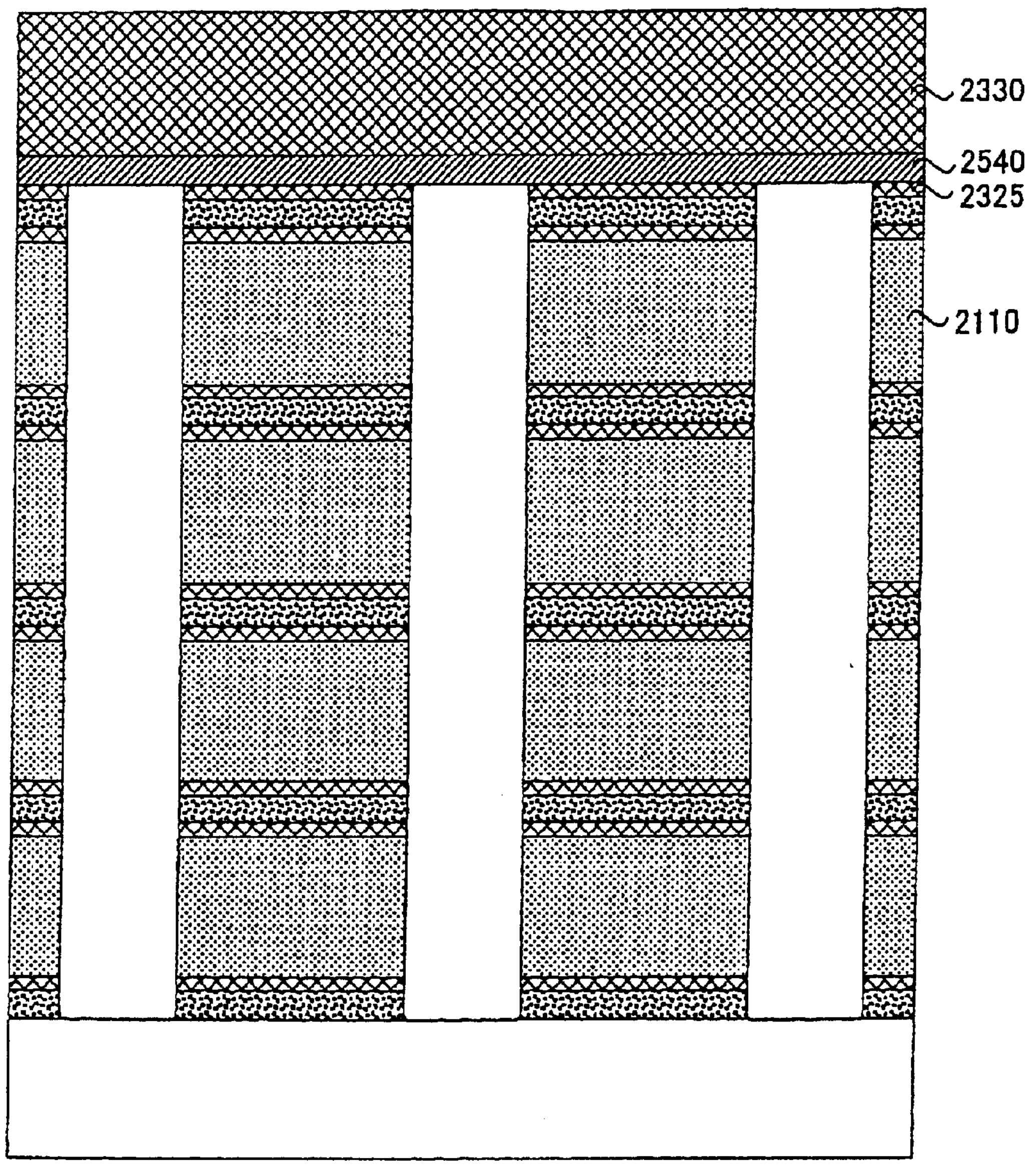
Figure 308:
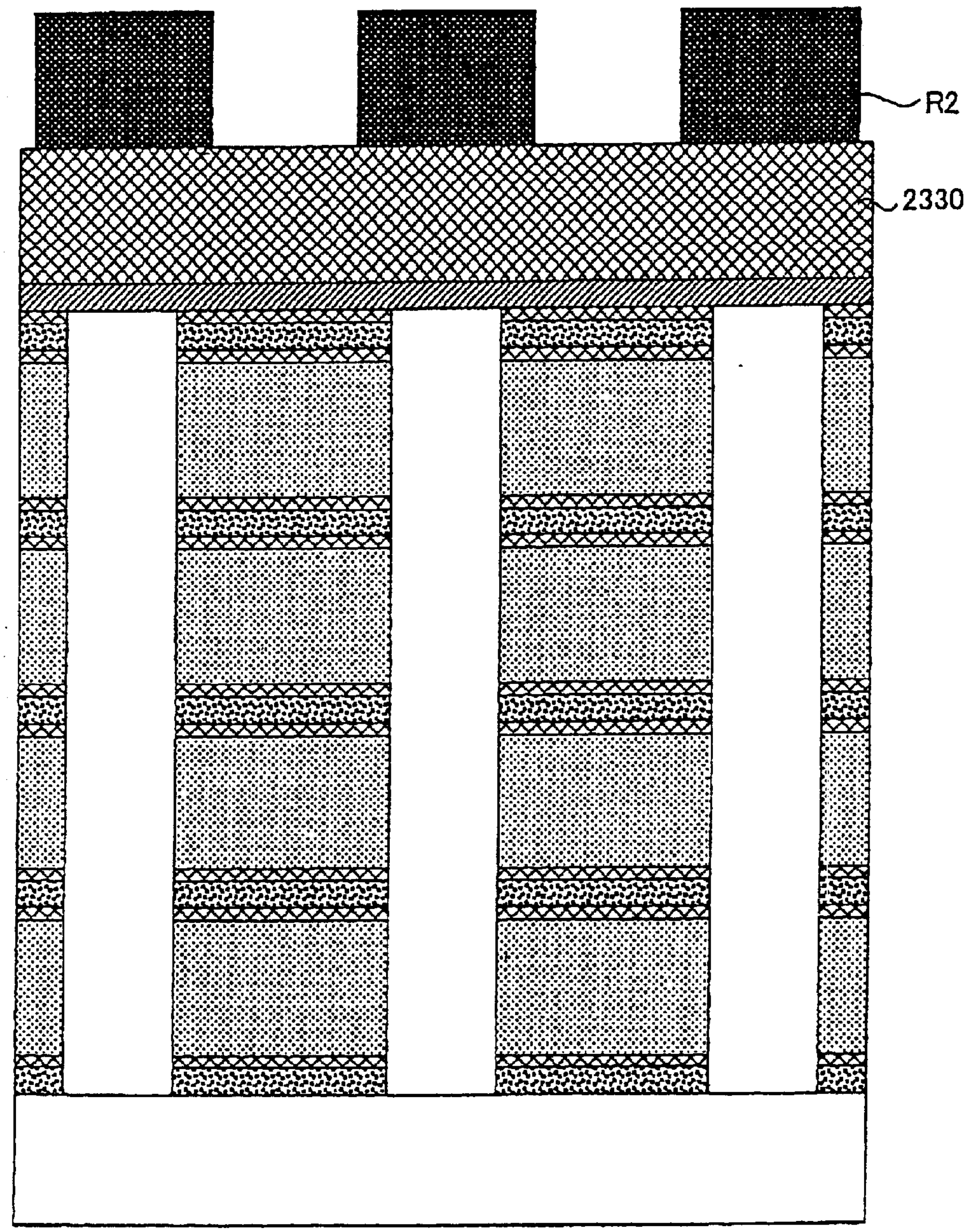
Figure 340:
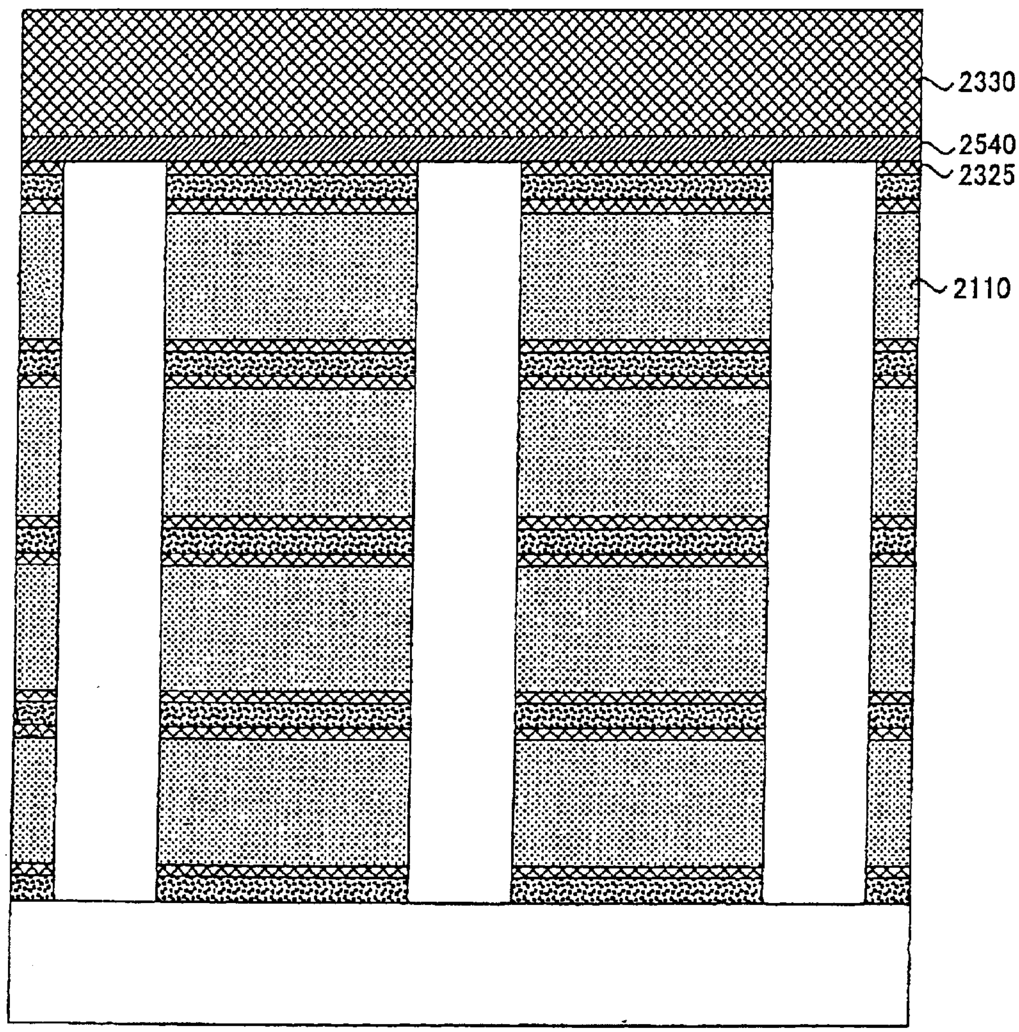
Figure 341:
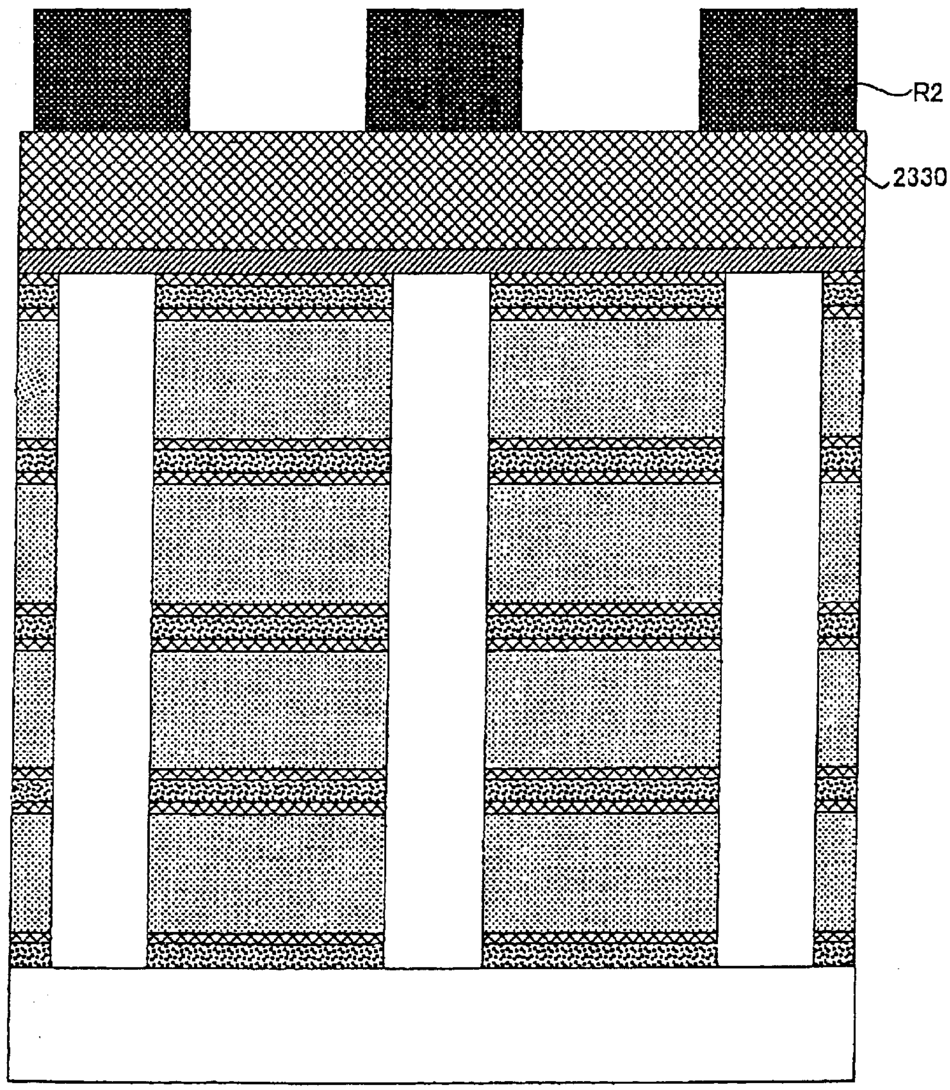
Figure 342:
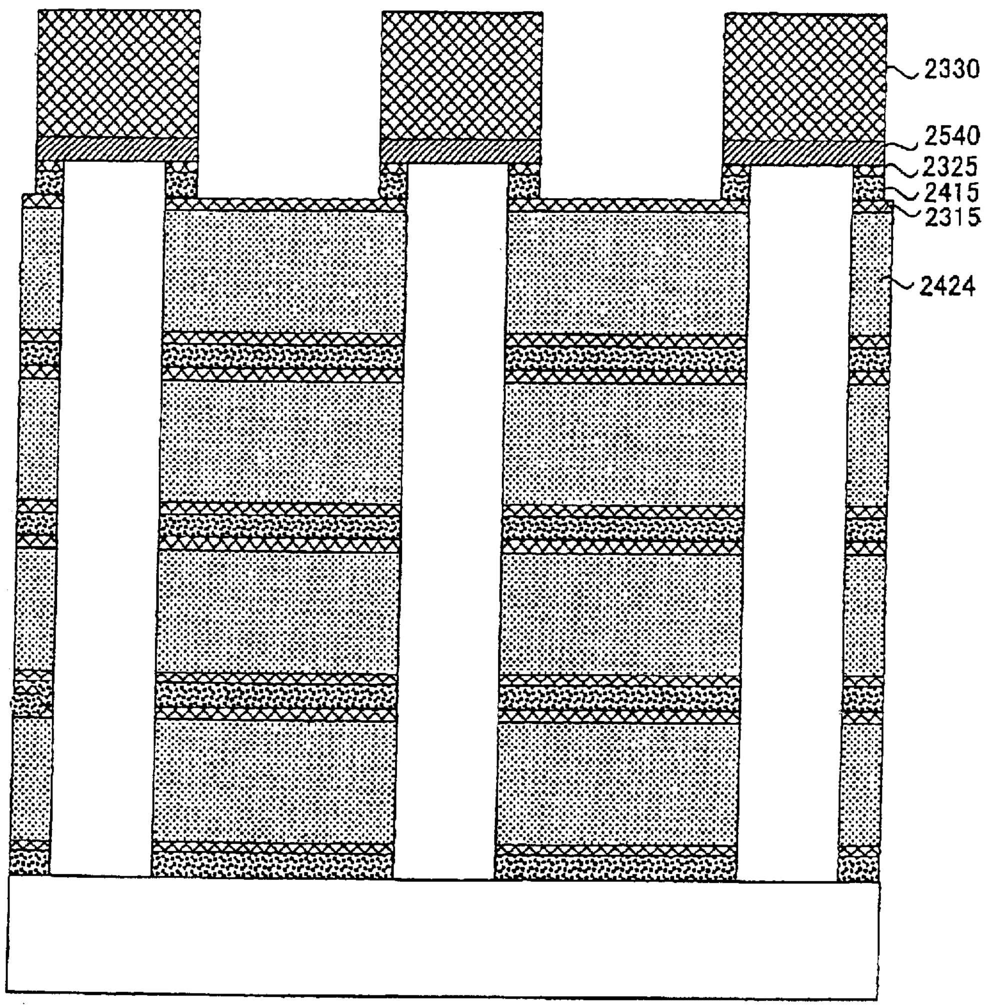

Thereafter, a polysilicon film 2540, for example, is deposited as a fourth conductive film to a thickness of about 100 to 300 nm and a silicon nitride film 2330 is deposited as a fifth insulating film to a thickness of about 200 to 2,000 nm (FIGS. 307 and 340).

Using a resist film R2 patterned by a known photolithographic technique as a mask (FIGS. 308 and 341), reactive ion etching, for example, is performed to successively etch the silicon nitride film 2330, the polysilicon film 2540, the silicon nitride film 2325 and the silicon oxide film 2415, thereby exposing the silicon nitride film 2315 (the second insulating film). At this time, the silicon nitride film 2315 may be etched until the silicon oxide film 2424 (the third insulating film) is exposed.

Figure 309:
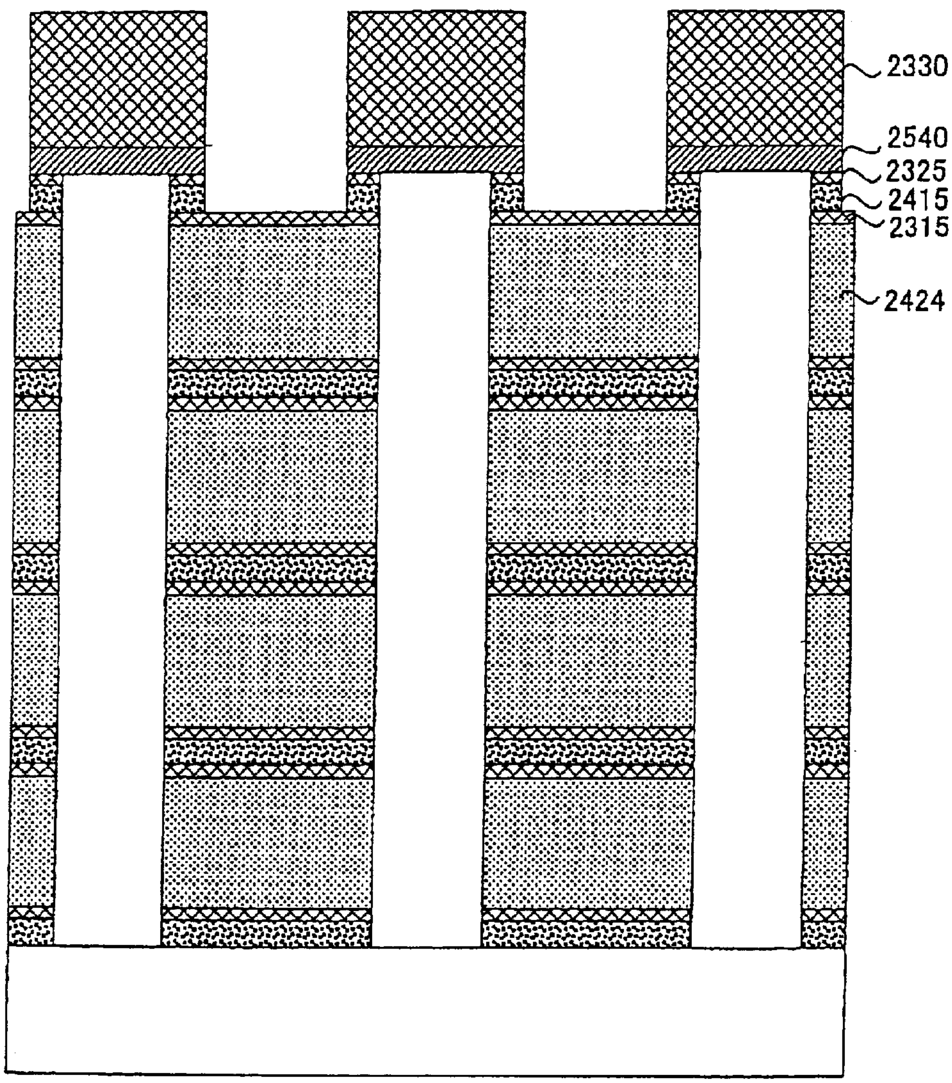
Figure 310:
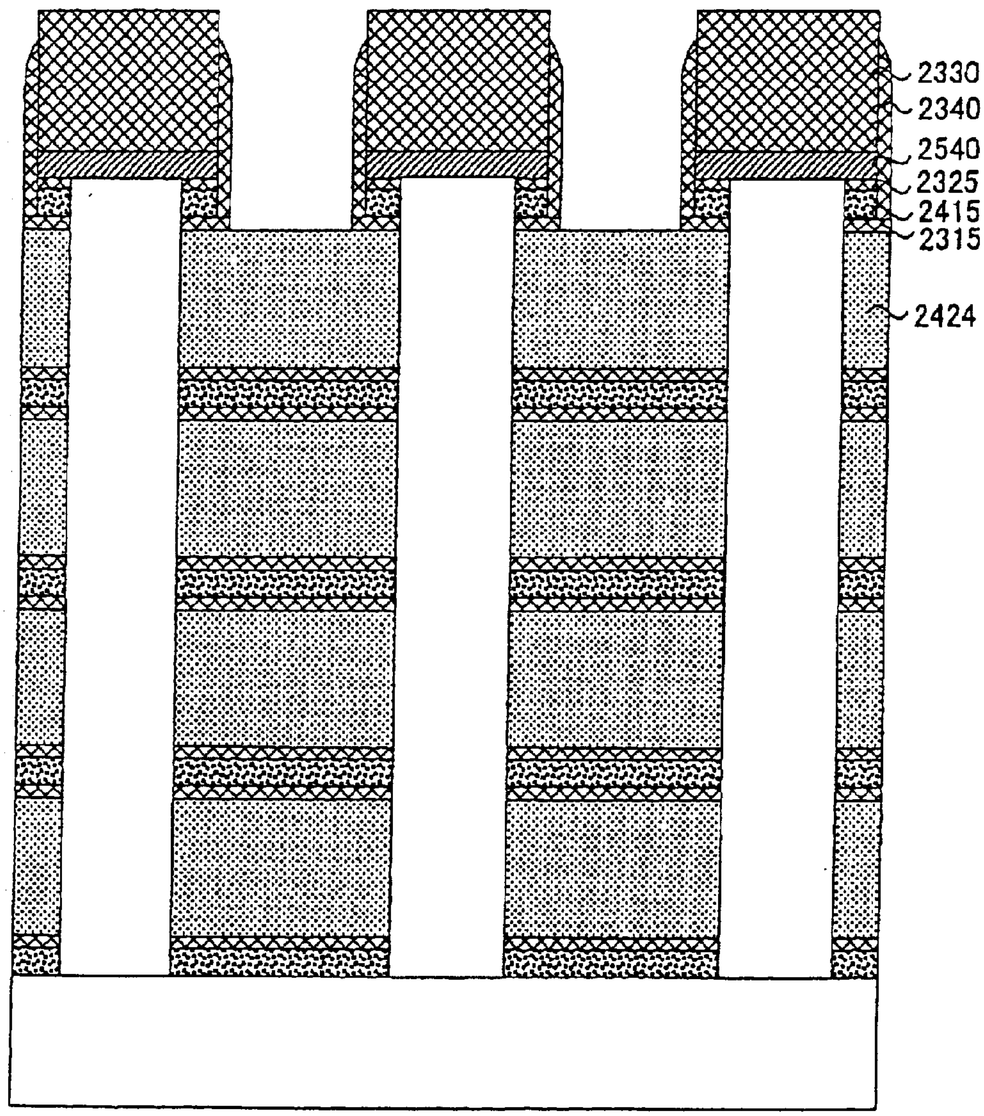
Figure 343:
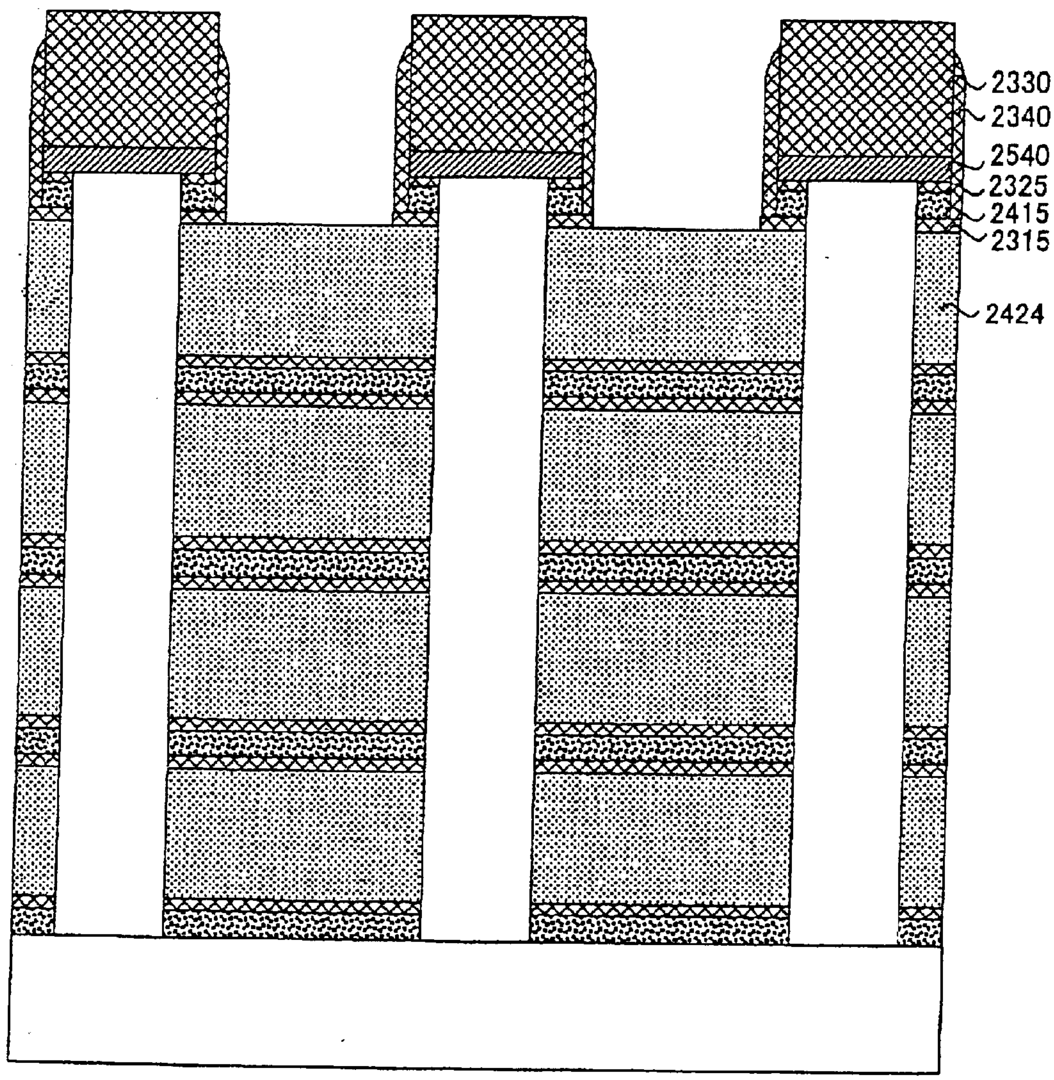

After the resist film R2 is removed (FIGS. 309 and 342), a silicon nitride film 2340 is deposited as a sixth insulating film to a thickness of about 5 to 50 nm. The silicon nitride film 2340 is etched by anisotropic etching, for example, to remain in the form of a sidewall spacer on the sidewalls of the silicon nitride film 2330, the polysilicon film 2540, the silicon nitride film 2325 and the silicon oxide film 2415 (FIGS. 310 and 343). At this time, the silicon oxide film 2415 containing the impurities (the first insulating film) is isolated from other films than the island-like semiconductor layer 2110 by the silicon nitride film 2325 (the fourth insulating film), the silicon nitride film 2315 (the second insulating film) and the silicon nitride film 2340 (the sixth insulating film).

Figure 311:
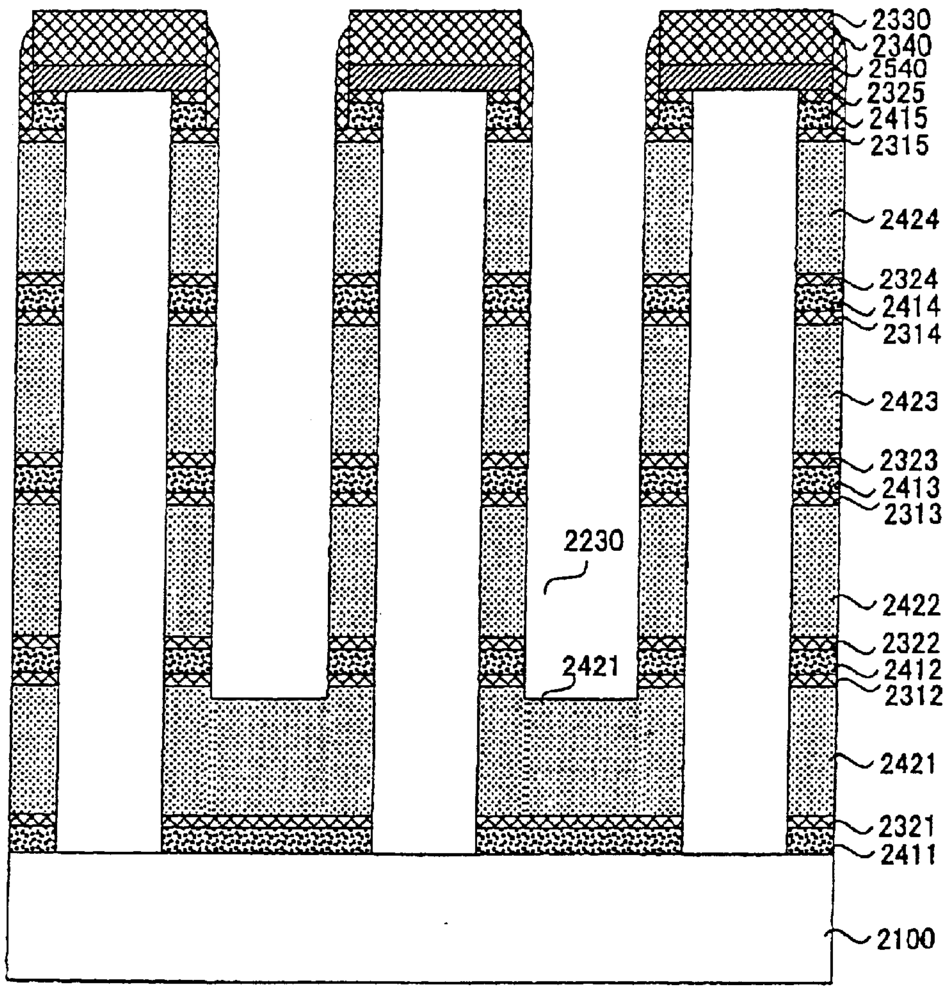
Figure 344:
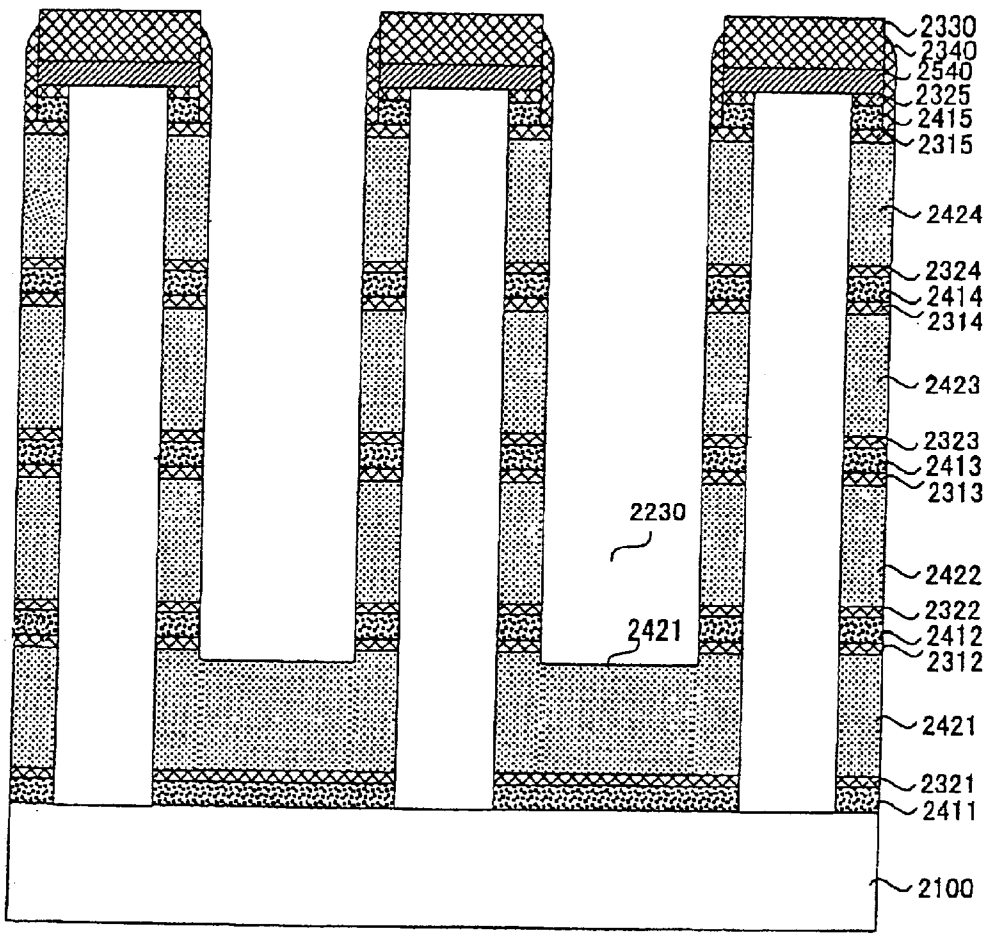

Then, using the silicon nitride films 2330 and 2340 as a mask, successively etched are the silicon nitride film 2315, the silicon oxide film 2424, the silicon nitride film 2324, the silicon oxide film 2414, the silicon nitride film 2314, the silicon oxide film 2423, the silicon nitride film 2323, the silicon oxide film 2413, the silicon nitride film 2313, the silicon oxide film 2422, the silicon nitride film 2322, the silicon oxide film 2412 and the silicon nitride film 2312, thereby exposing the silicon oxide film 2421 (the third insulating film). Thus, a third trench 2230 is formed (FIGS. 311 and 344).

Figure 312:
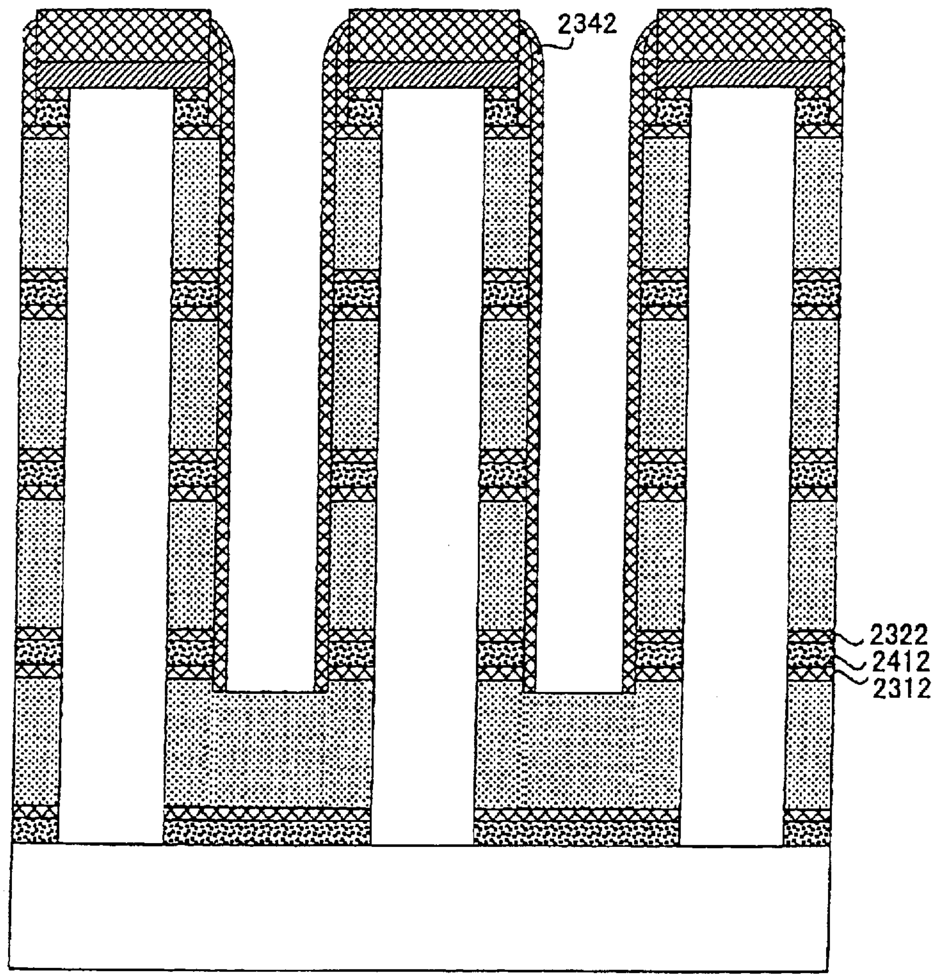

Subsequently, a silicon nitride film 2342 is deposited as a sixth insulating film to a thickness of about 5 to 50 nm. Then, the silicon nitride film 2342 is arranged such that at least the silicon oxide film 2412 containing the impurities is isolated from other films than the island-like semiconductor layer 2110 by the silicon nitride film 2342 (the sixth insulating film), the silicon nitride film 2312 (the second insulating film) and the silicon nitride film 2322 (the fourth insulating film). For example, the silicon nitride film 2342 deposited to a thickness of about 5 to 50 nm is anisotropically etched back to remove the silicon nitride film 2342 located at the bottom of the third trench 2230, thereby exposing the silicon oxide film 2421 (FIGS. 312 and 345).

Figure 313:
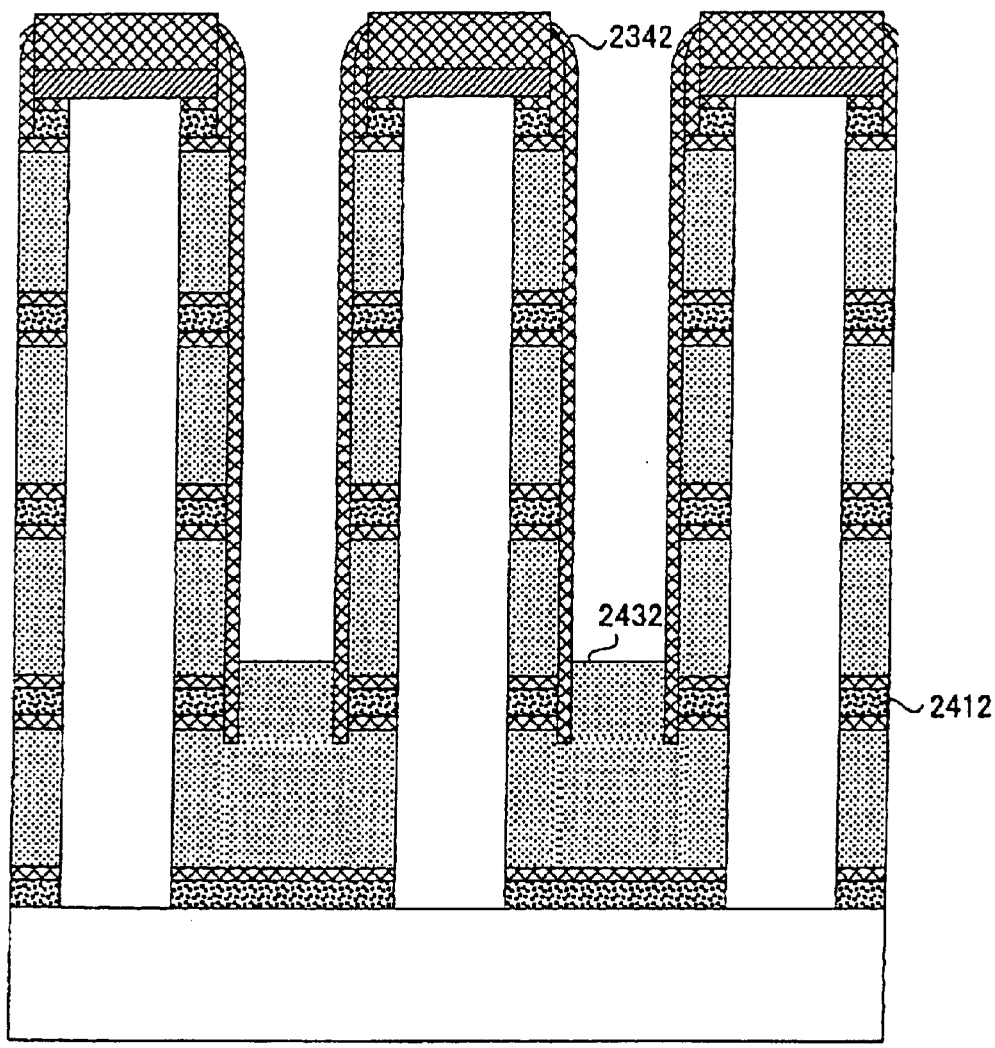
Figure 345:
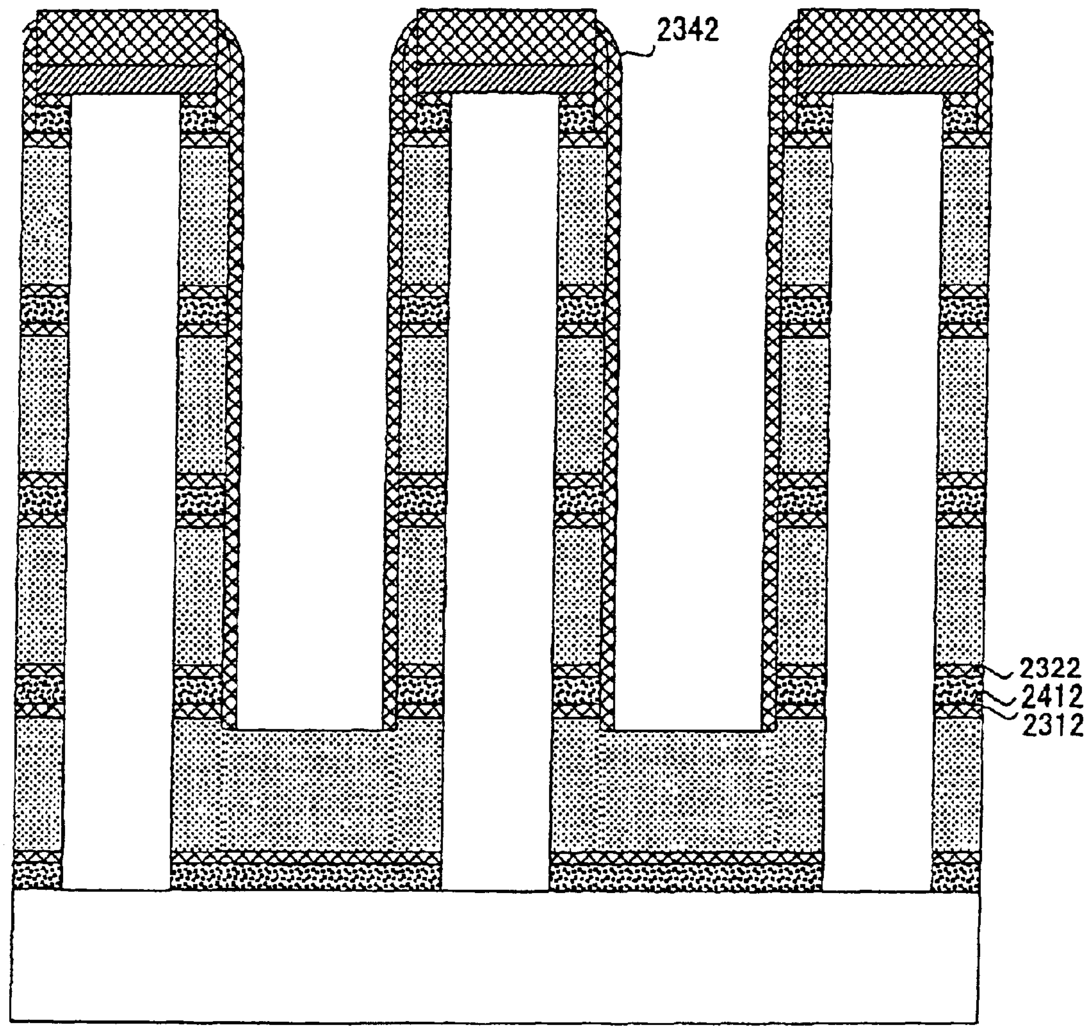
Figure 346:
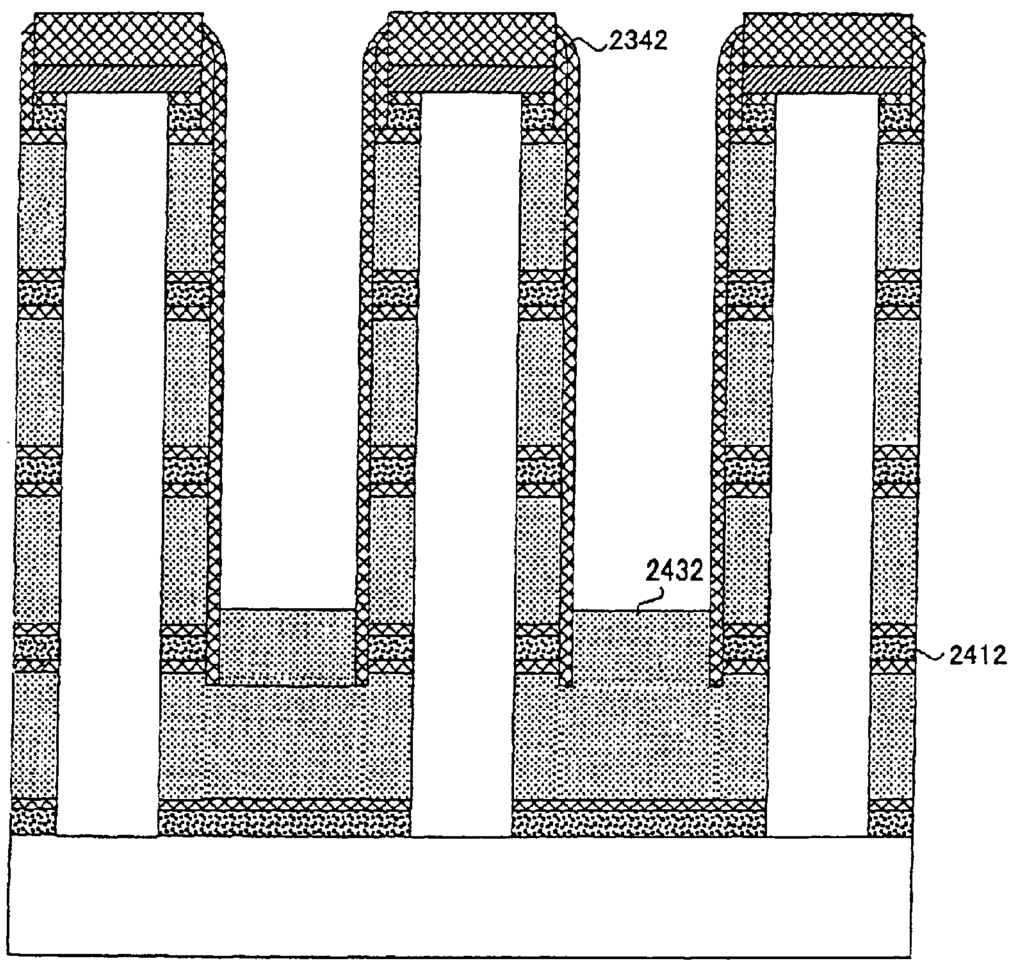

Thereafter, a silicon oxide film 2432, for example, is deposited as a seventh insulating film to a desired thickness and embedded in the third trench 2230 such that the silicon oxide film 2412 containing the impurities is buried with intervention of the silicon nitride film 2342 (FIGS. 313 and 345).

Figure 314:
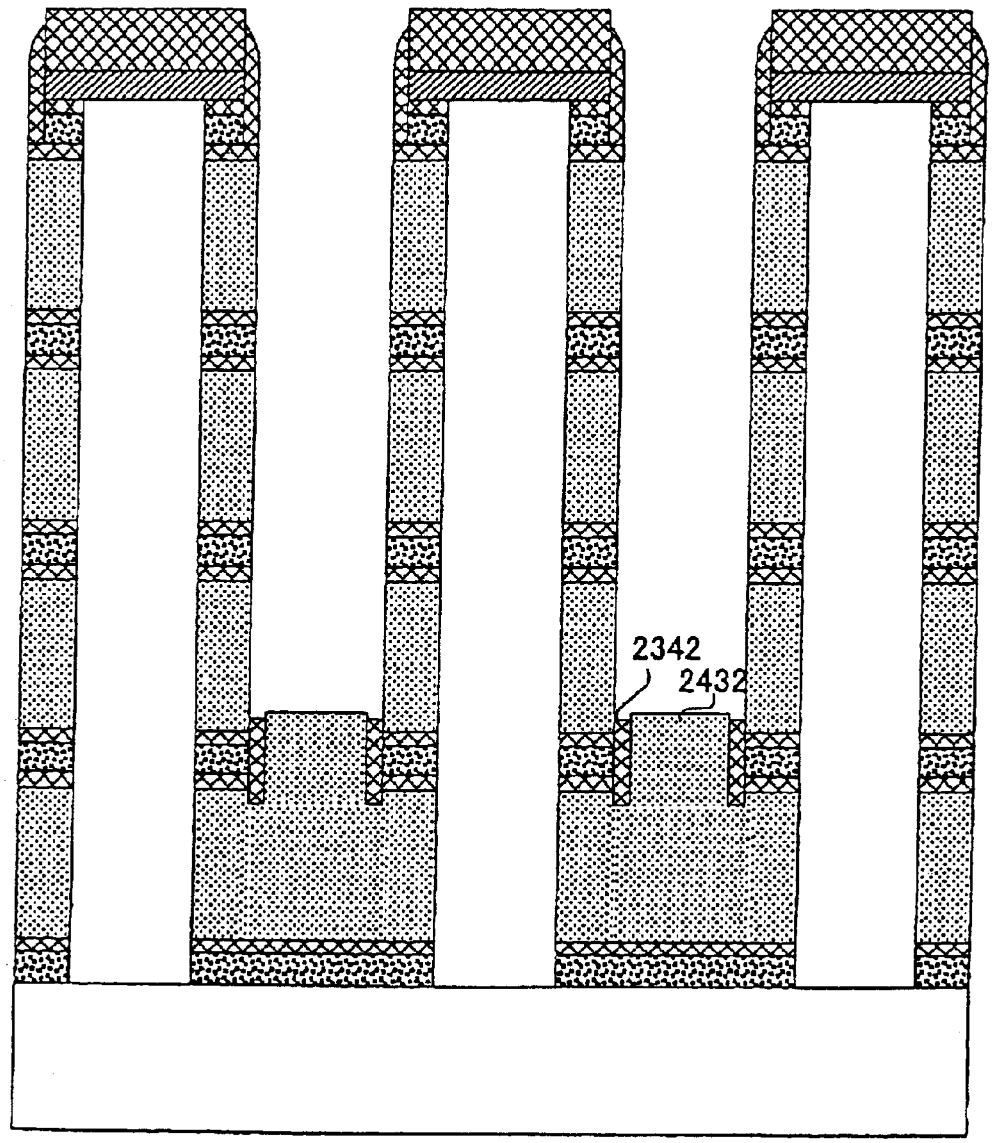
Figure 347:
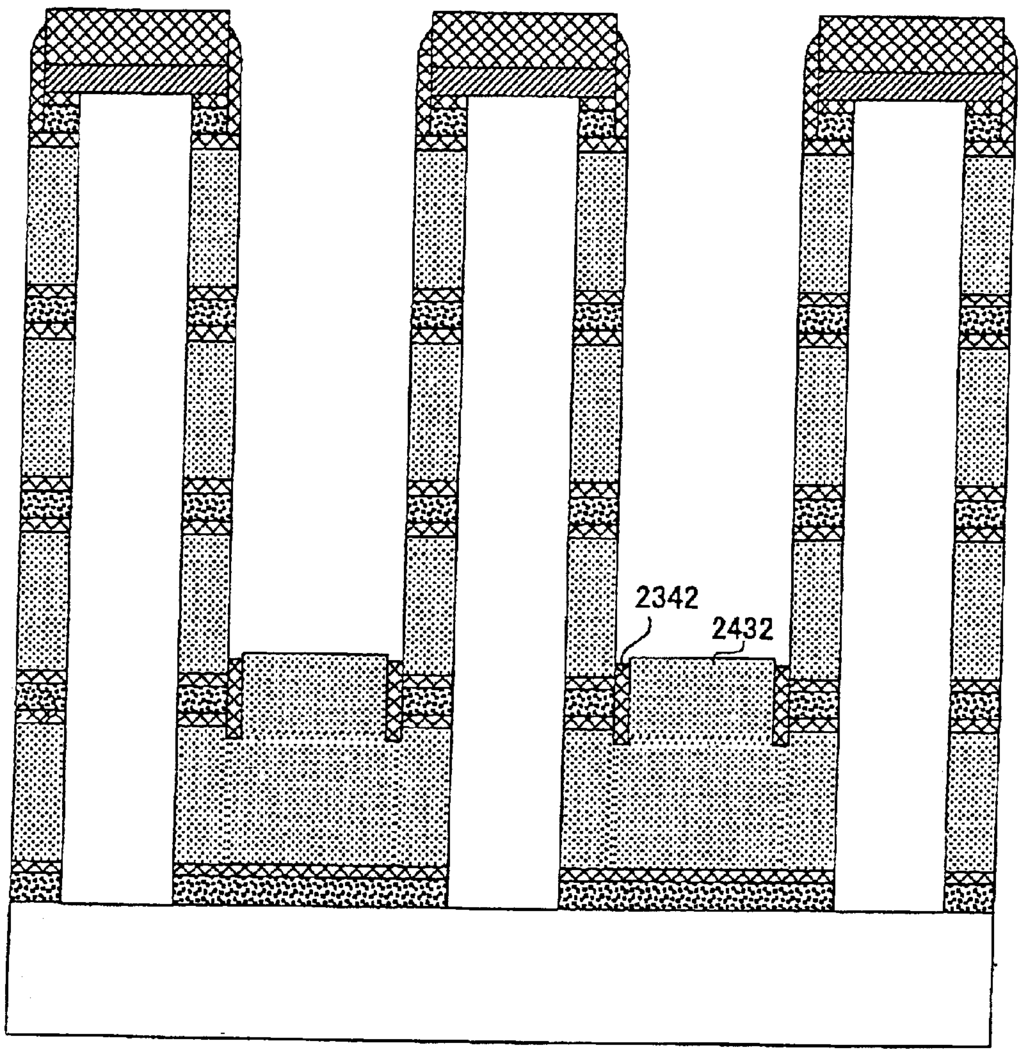

Using the silicon oxide film 2432 as a mask, an exposed portion of the silicon nitride film 2342 is removed by isotropic etching while leaving an unexposed portion thereof (FIGS. 314 and 347).

Figure 315:
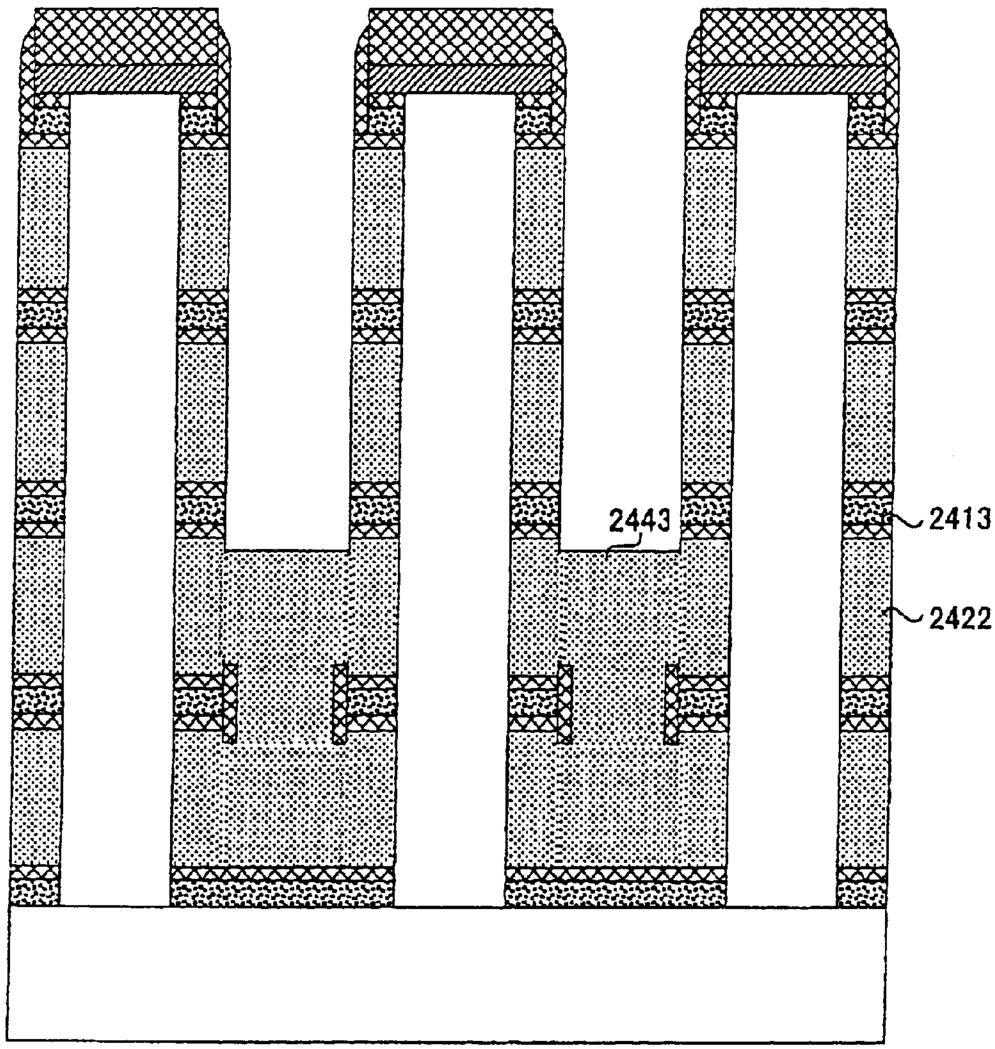
Figure 348:
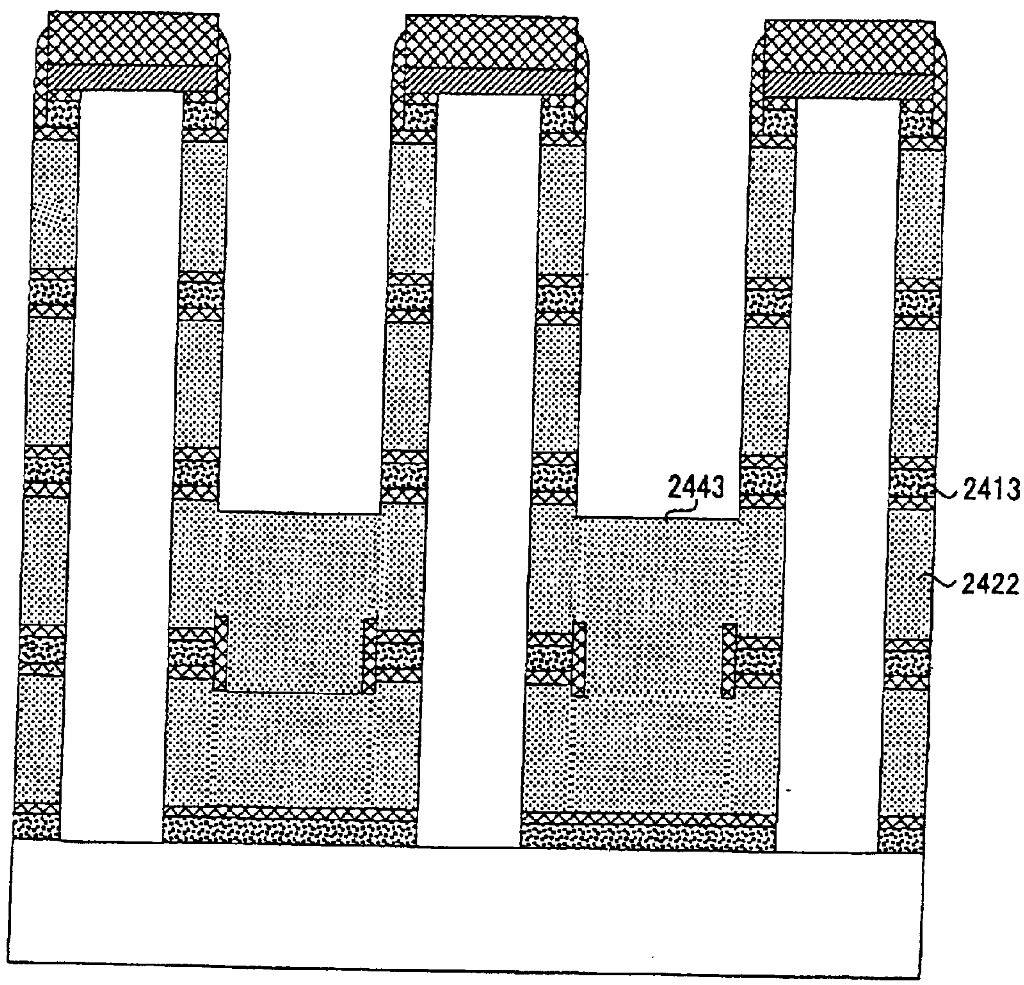

Then, a silicon oxide film 2443, for example, is deposited as an eighth insulating film and buried in the third trench 2230 by anisotropic etching, for example, such that the silicon oxide film 2443 is disposed on the side of the silicon oxide film 2422 (FIGS. 315 and 348). At this time, the depth of the buried silicon oxide film 2443 (the eighth insulating film) is so controlled that the side of the silicon oxide film (the first insulating film) 2413 containing the impurities is exposed.

Figure 316:
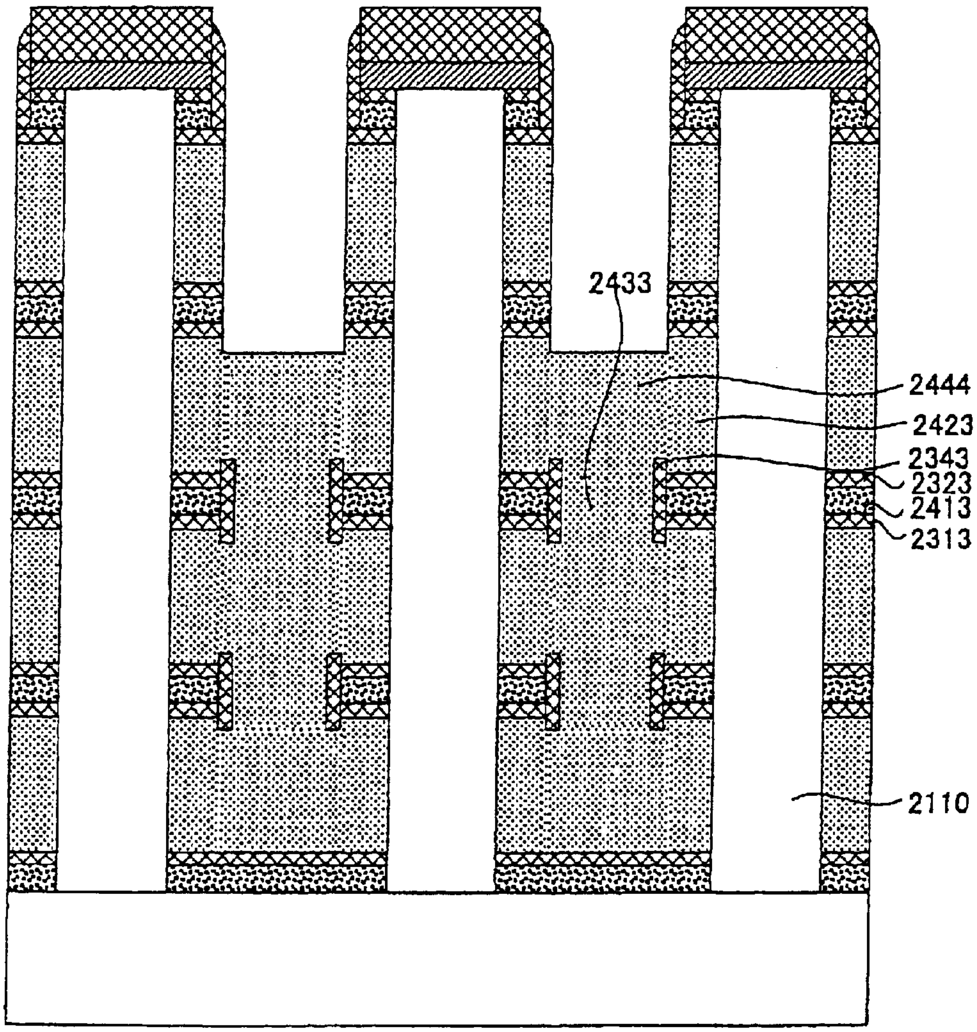
Figure 349:
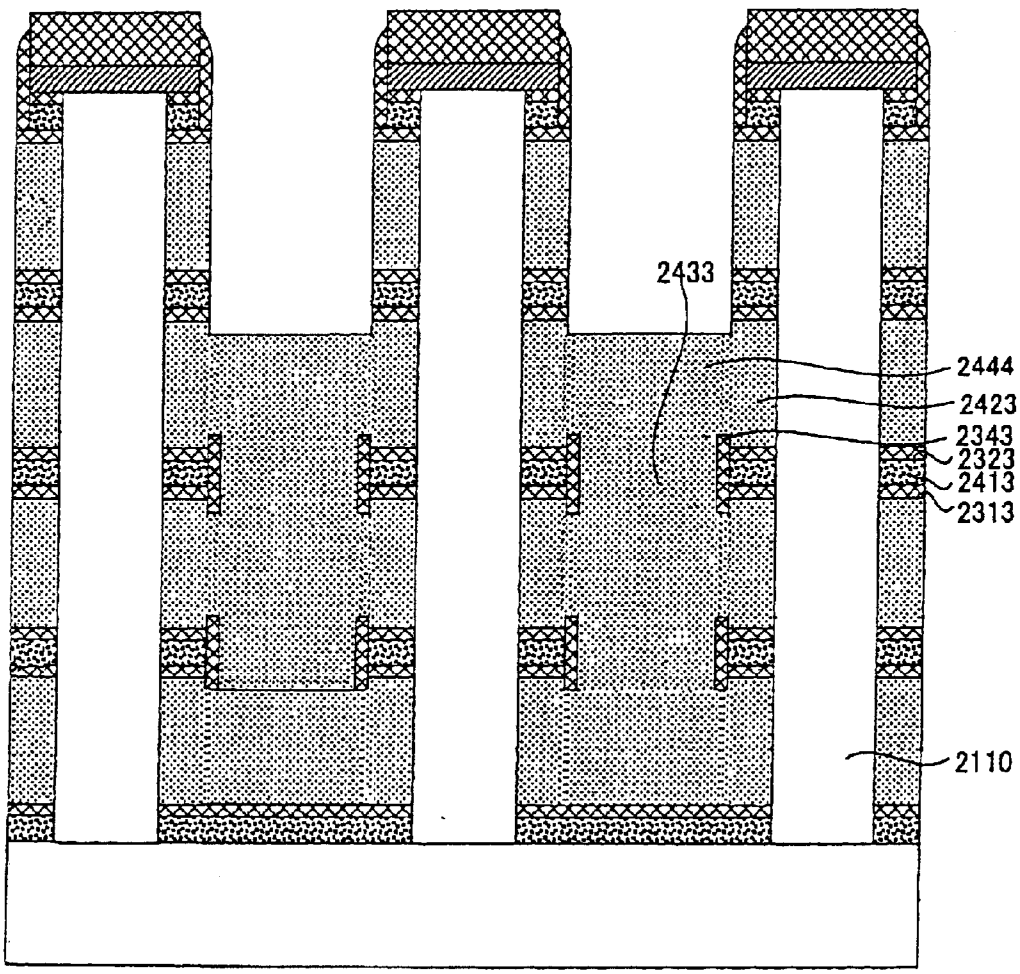

Then, in the same manner as the above, a silicon nitride film 2343 is deposited as a sixth insulating film to a thickness of about 5 to 50 nm and arranged such that at least the silicon oxide film 2413 (the first insulating film) containing the impurities is isolated from other films than the island-like semiconductor layer 2110 by the silicon nitride film 2343 (the sixth insulating film), the silicon nitride film 2313 (the second insulating film) and the silicon nitride film 2323 (the fourth insulating film). Thereafter, in the same manner as the above, a silicon oxide film 2444, for example, is deposited as an eighth insulating film and buried in the third trench 2230, for example, by anisotropic etching such that the silicon oxide film 2444 is disposed on the side of the silicon oxide film 2423 (FIGS. 316 and 349).

Figure 317:
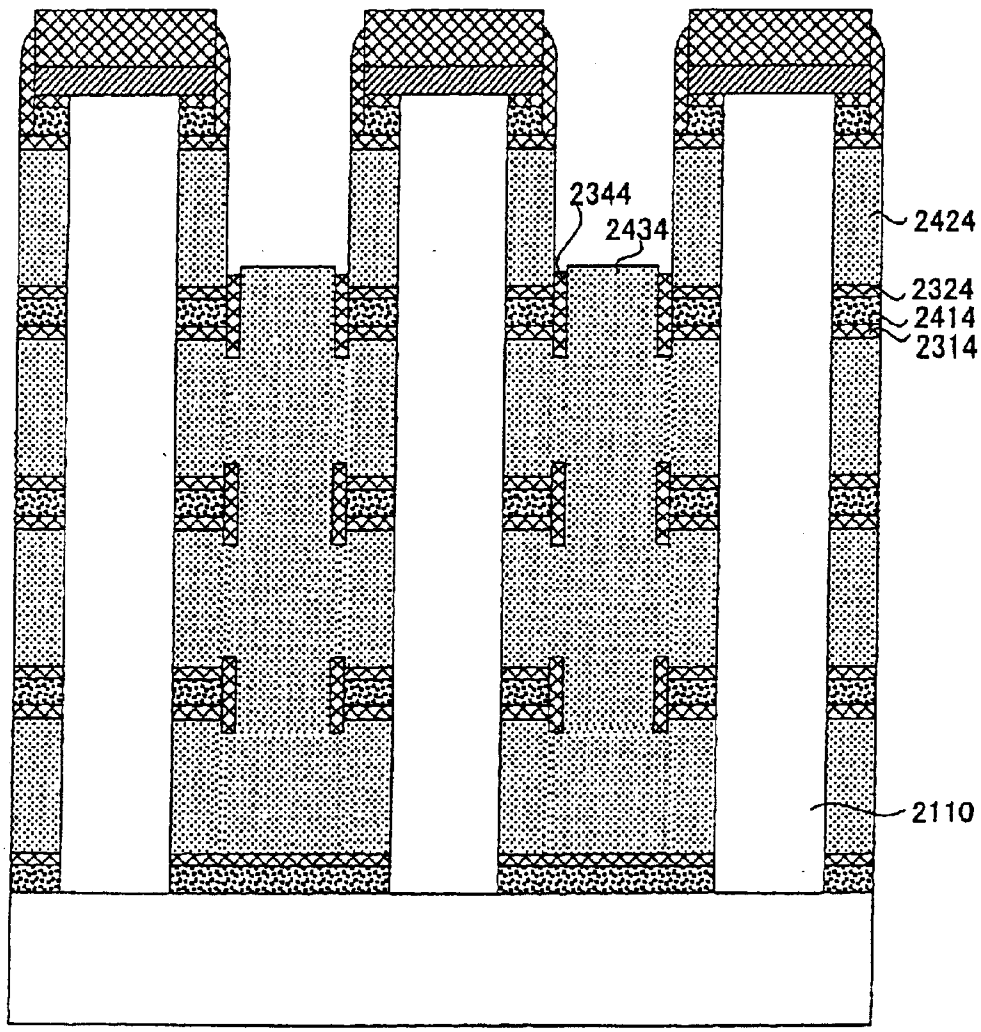
Figure 350:
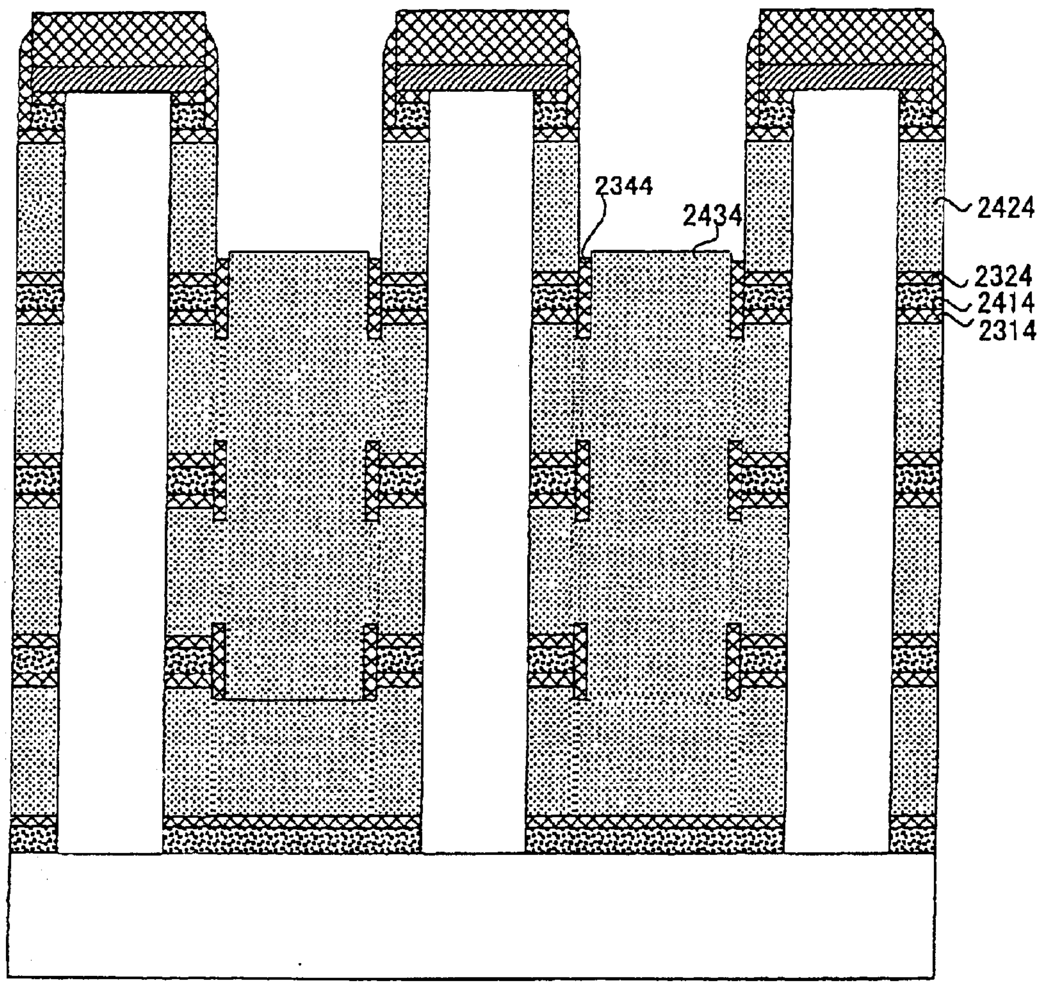

Further, in the same manner as the above, a silicon nitride film 2344 is deposited as a sixth insulating film to a thickness of about 5 to 50 nm and arranged such that at least the silicon oxide film 2414 (the first insulating film) containing the impurities is isolated from other films than the island-like semiconductor layer 2110 by the silicon nitride film 2344 (the sixth insulating film), the silicon nitride film 2314 (the second insulating film) and the silicon nitride film 2324 (the fourth insulating film) (FIGS. 317 and 350).

Figure 318:
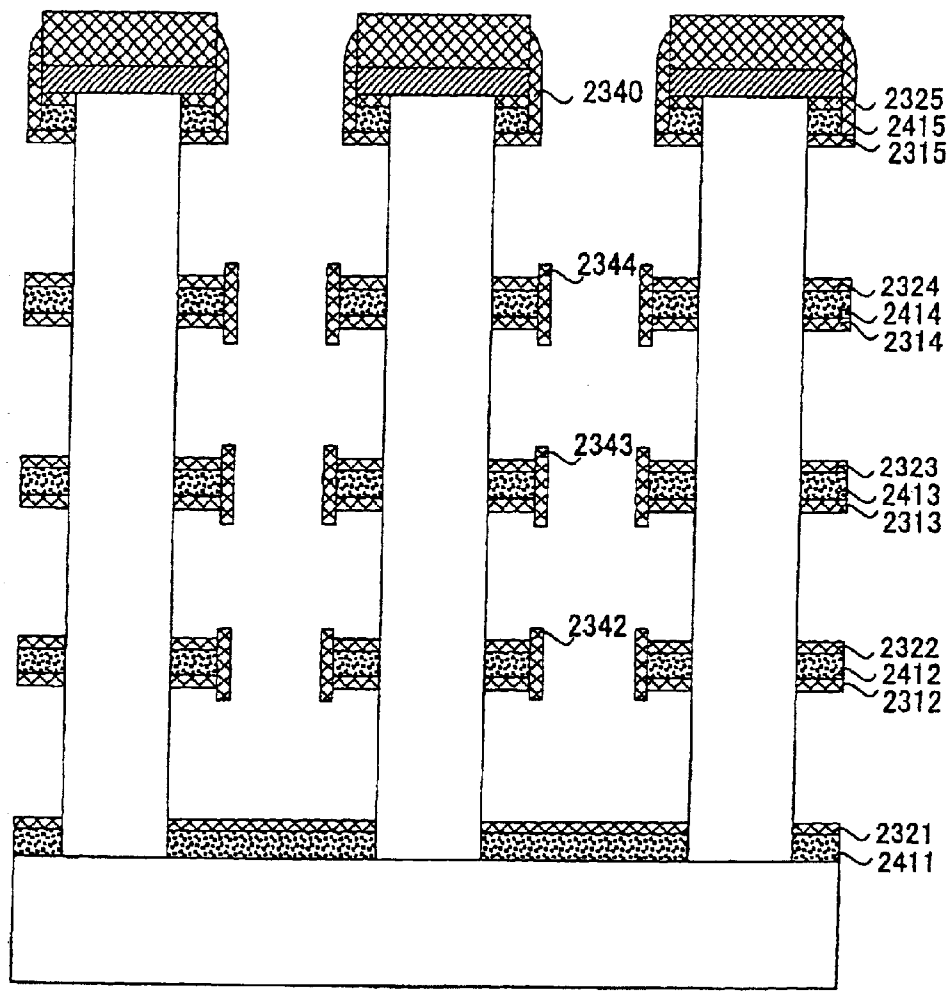
Figure 351:
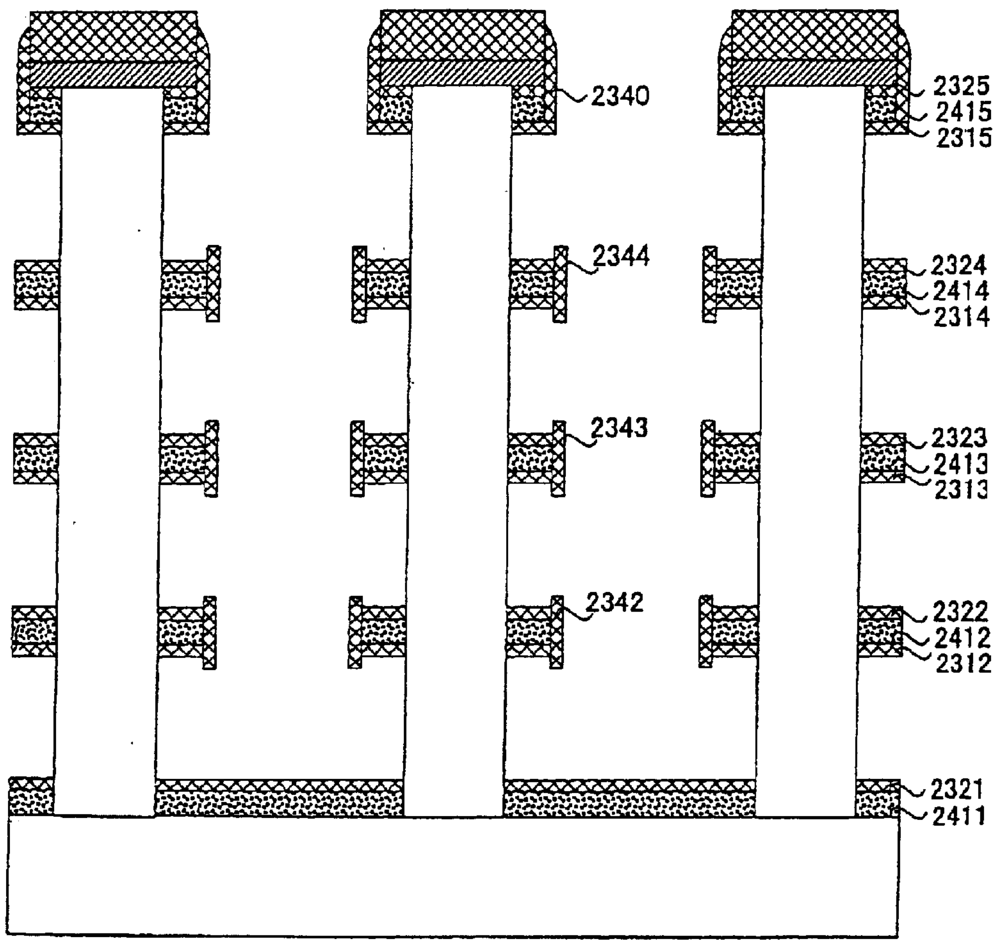

Thereafter, the silicon oxide films 2442, 2443 and 2444 (the eighth insulating films), the silicon oxide films 2421, 2422, 2423 and 2424 (the third insulating films) and the silicon oxide films 2432, 2433 and 2434 (the seventh insulating films) are removed by isotropic etching, for example, thereby exposing the sides of the island-like semiconductor layers 2110 (FIGS. 318 and 351).

Figure 319:
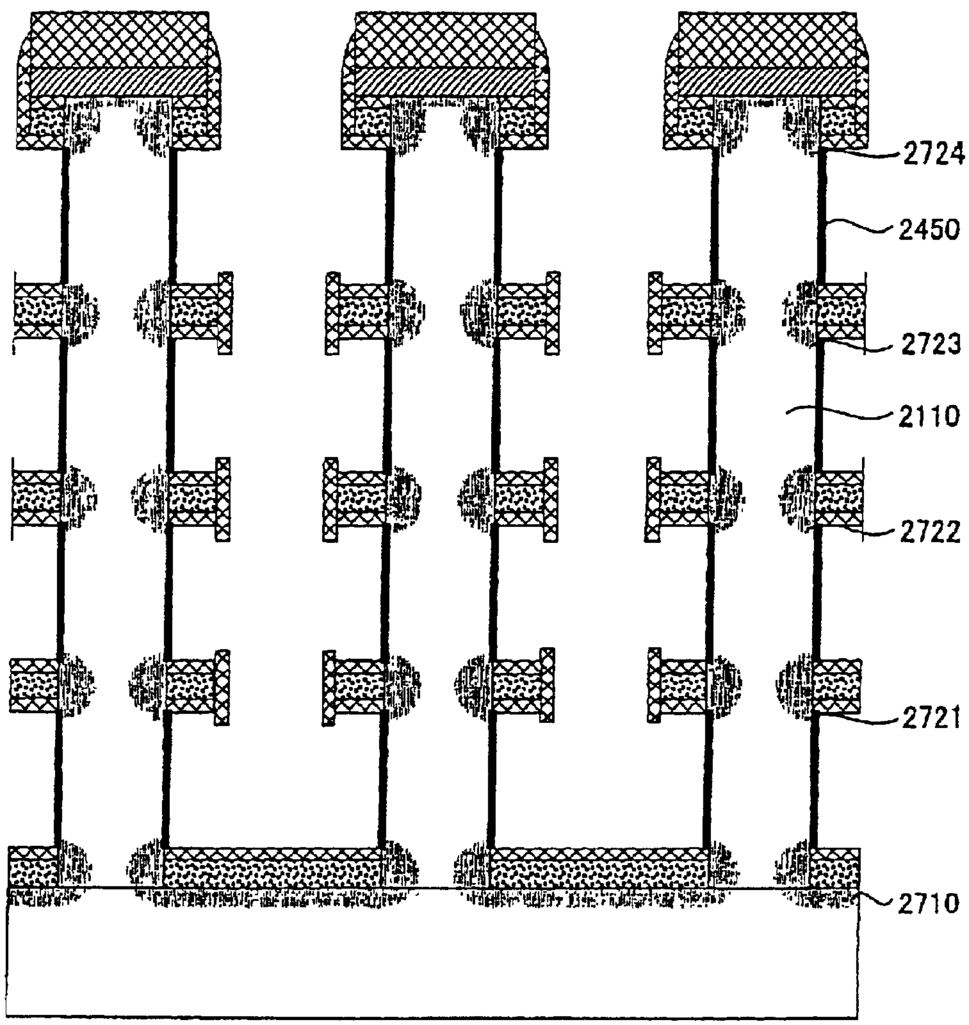
Figure 352:
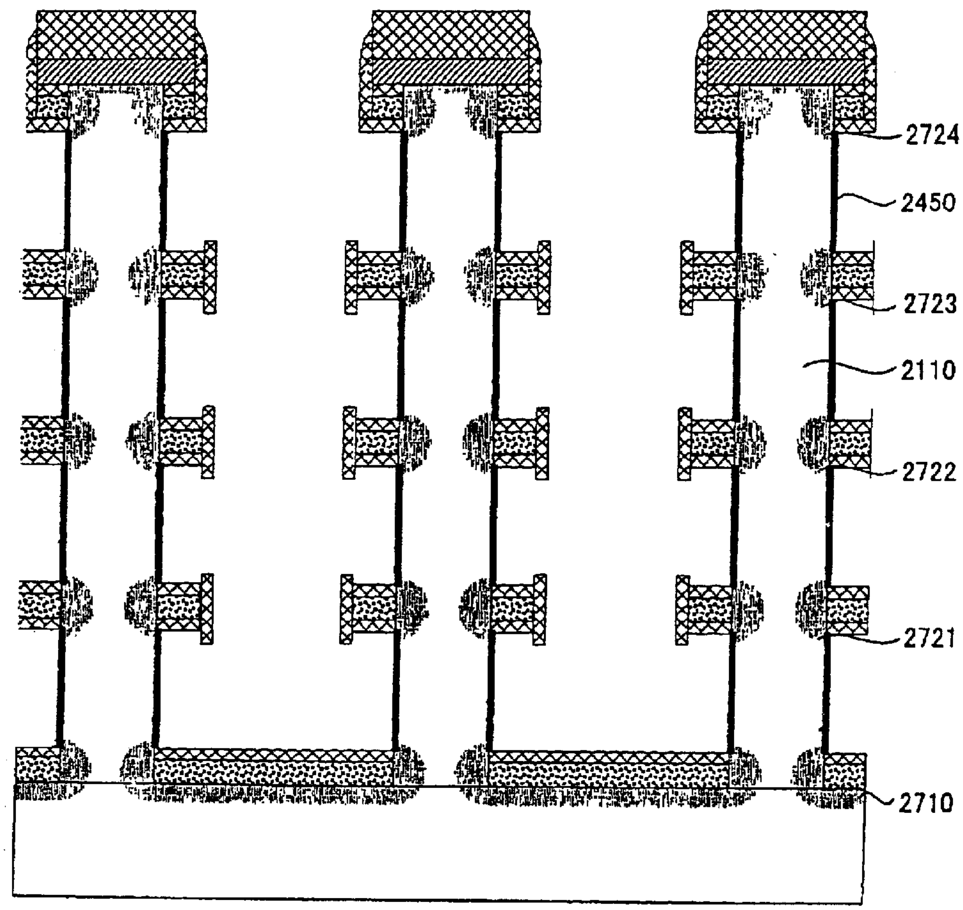

Then, the surface of each island-like semiconductor layer 2110 is oxidized to form, for example, a thermally oxidized film 2450 of about 10 to 100 nm thick as a ninth insulating film (FIGS. 319 and 352).

Figure 320:
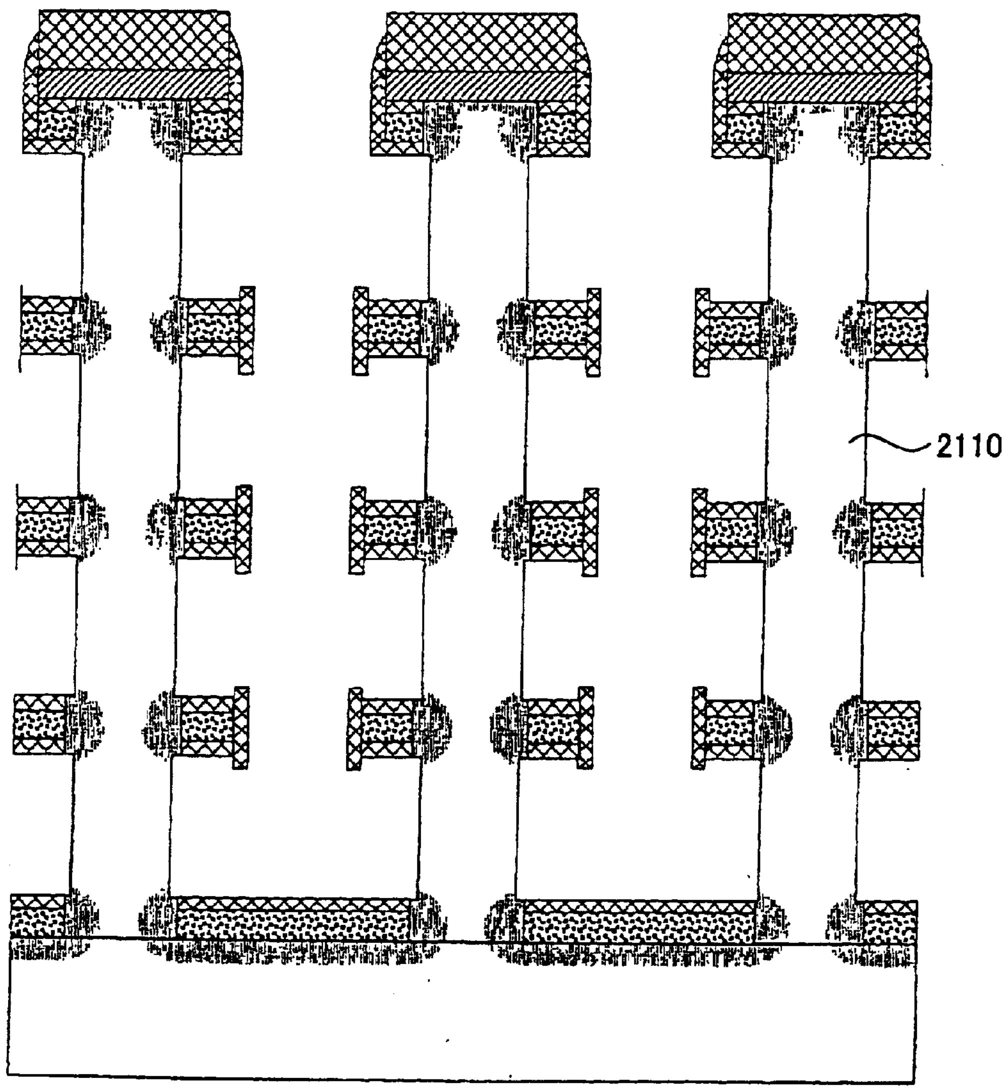
Figure 353:
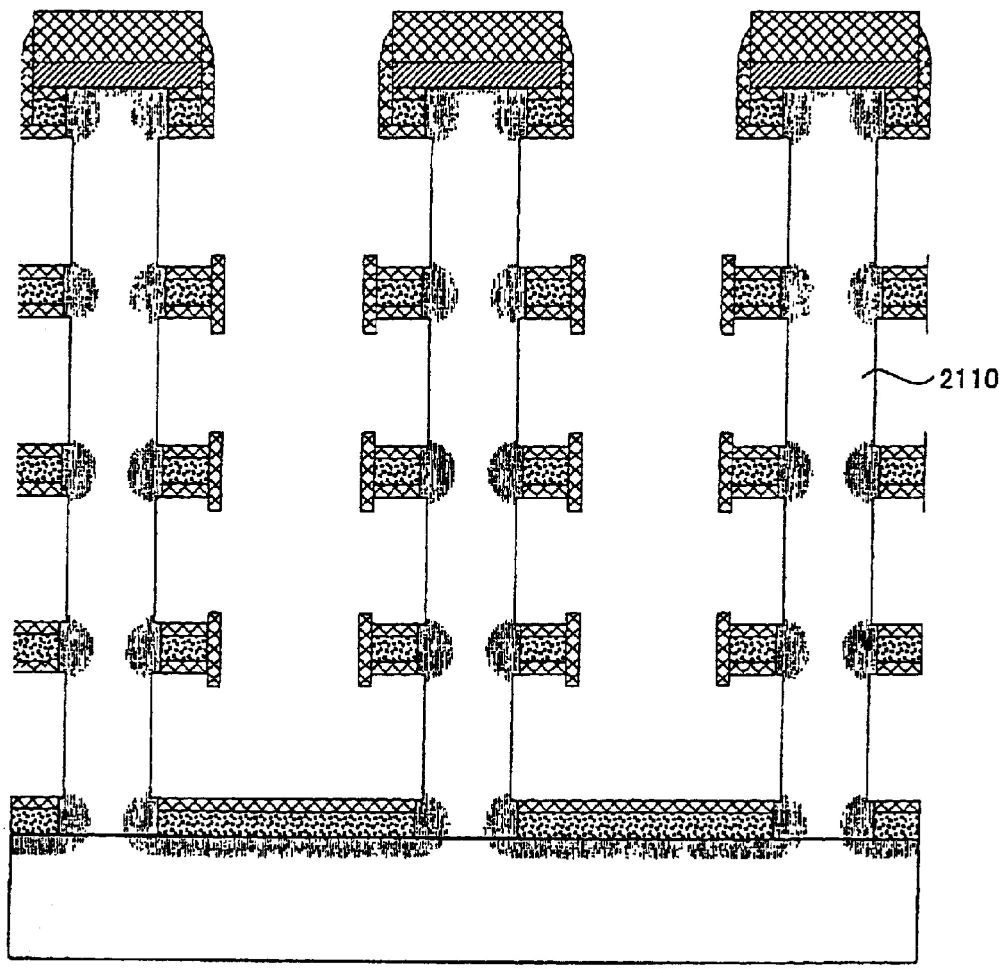

Next, the thermally oxidized film (the ninth insulating film) 2450 is etched away from the periphery of each island-like semiconductor layer 2110, for example, by isotropic etching (FIGS. 320 and 353).

Then, as required, channel ion implantation is carried out into the sidewall of each island semiconductor layer 2110 by slant ion implantation. For example, the ion implantation may be performed at an implantation energy of 5 to 100 keV at a boron dose of about $1\times10^{11}$ to $1\times10^{13}/cm^2$ at an angle of 5 to 45° with respect to the normal line of the surface of the substrate. Preferably the channel ion implantation is performed from various directions to the island-like semiconductor layers 2110 because a surface impurity concentration becomes more uniform. Alternatively, instead of the channel ion implantation, an oxide film containing boron may be deposited by CVD with a view to utilizing diffusion of boron from the oxide film. The impurity implantation from the surface of the island-like semiconductor layers 2110 may be carried out before the island-like semiconductor layers 2110 are covered with the thermally oxidized film 2450, or during the formation of the island-like semiconductor layers 2110. Alternatively, the impurities may be introduced to the silicon oxide films 2421, 2422, 2423 and 2424 in advance with a view to implanting the impurities in the island-like semiconductor layers 2110 by thermal treatment or the like before removing the silicon oxide films 2421, 2422, 2423 and 2424. Means for the implantation are not particularly limited so long as an impurity concentration distribution is almost equal over the island-like semiconductor layers 2110.

Figure 321:
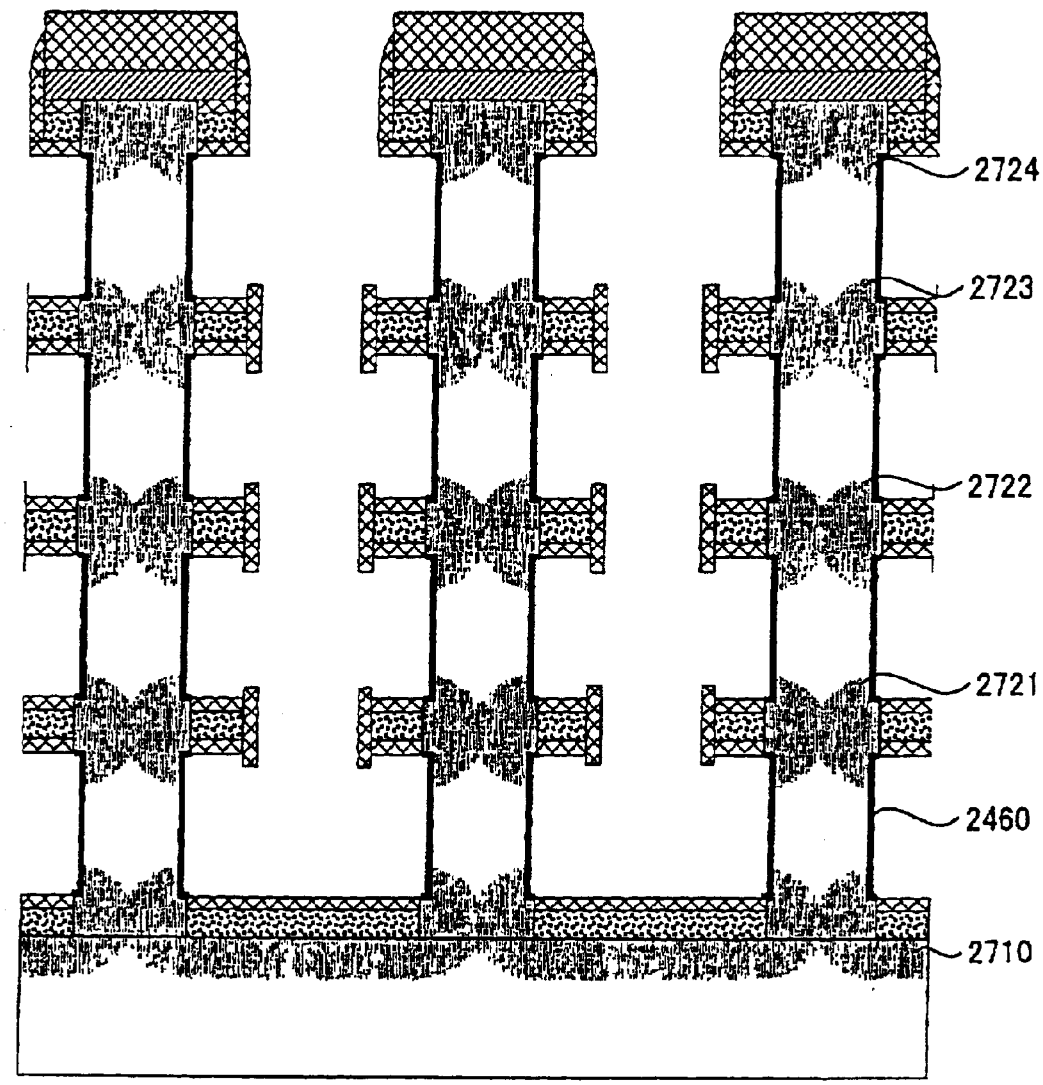
Figure 354:
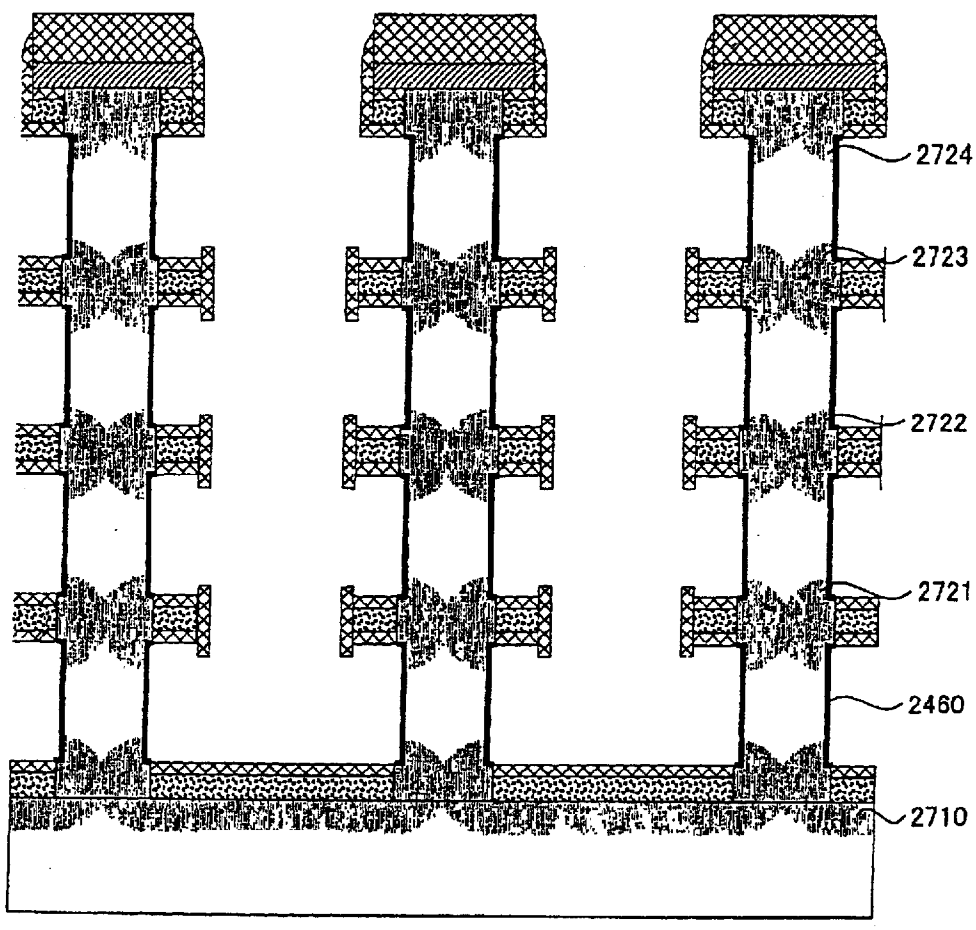

Subsequently, a silicon oxide film 2460, for example, is formed as a tenth insulating film to be a tunnel oxide film to a thickness of about 10 nm around each island-like semiconductor layer 2110, for example, by thermal oxidization (FIG. 321 and FIG. 354). The tunnel oxide film, however, may be formed of not only a thermally oxidized film but also a CVD oxide film or a nitrogen oxide film.

Figure 322:
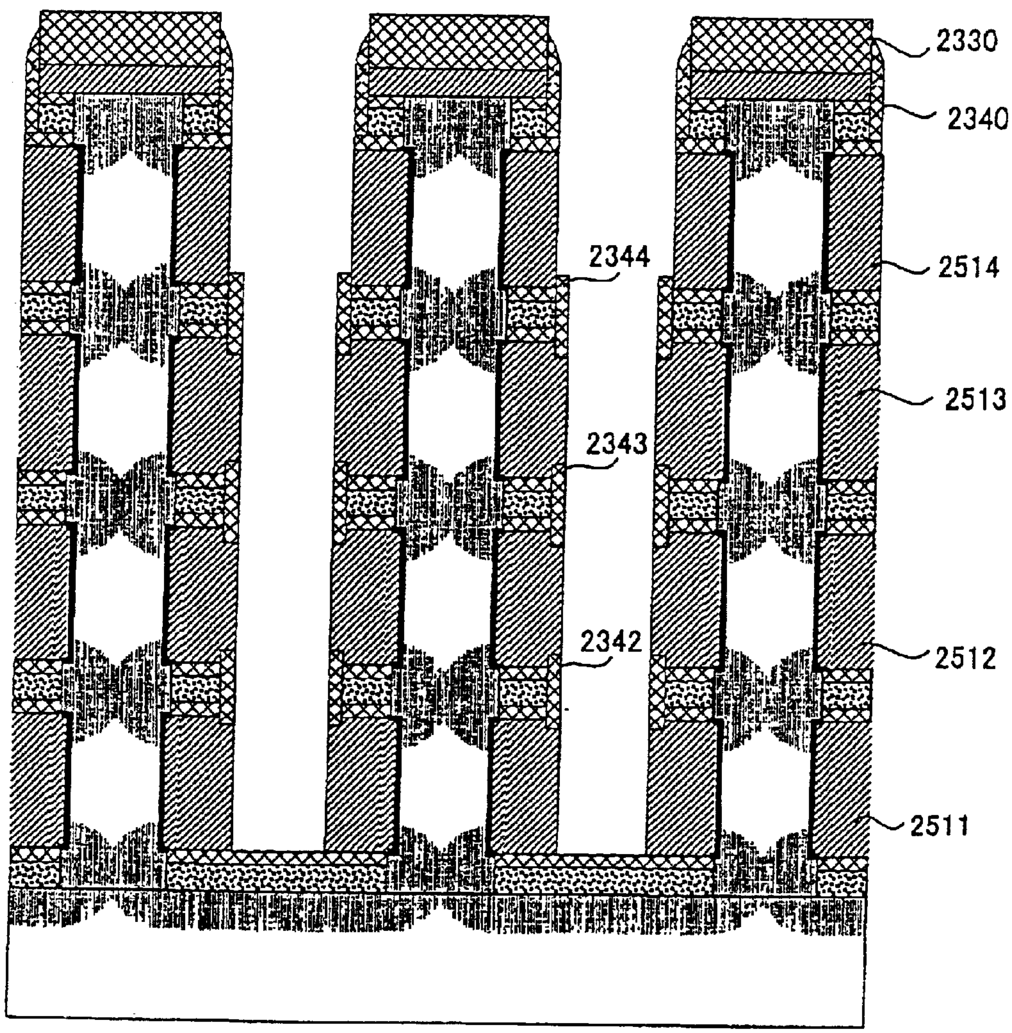
Figure 355:
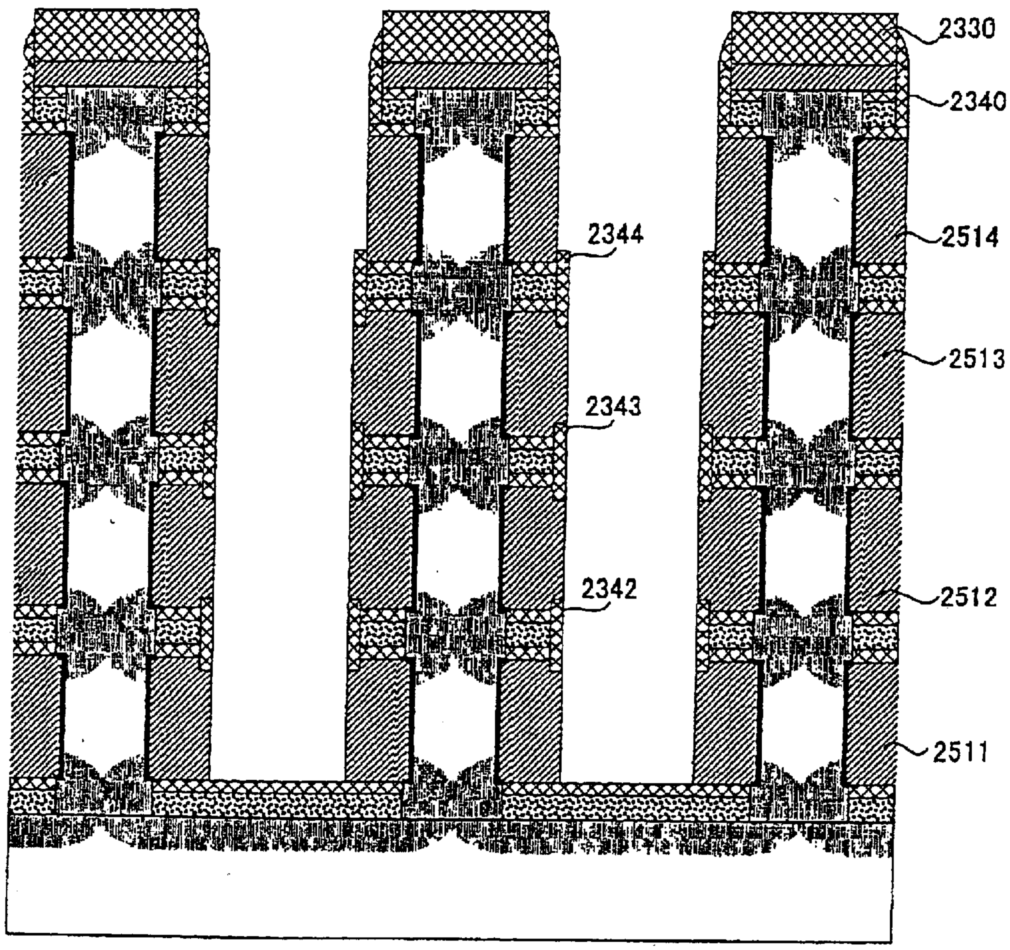

Then, a polysilicon film 2510, for example, is deposited as a first conductive film to a thickness of about 50 to 200 nm. Using the silicon nitride film 2330 (the fifth insulating film) and the silicon nitride films 2340, 2342, 2343 and 2344 (the sixth insulating films) as a mask, the polysilicon film 2510 is divided into polysilicon films 2511, 2512, 2513 and 2514 (first conductive films), for example, by anisotropic etching (FIGS. 322 and 355).

A silicon oxide film 2470, for example, is then deposited to a thickness of about 50 to 500 nm as an eleventh insulating film.

Figure 323:
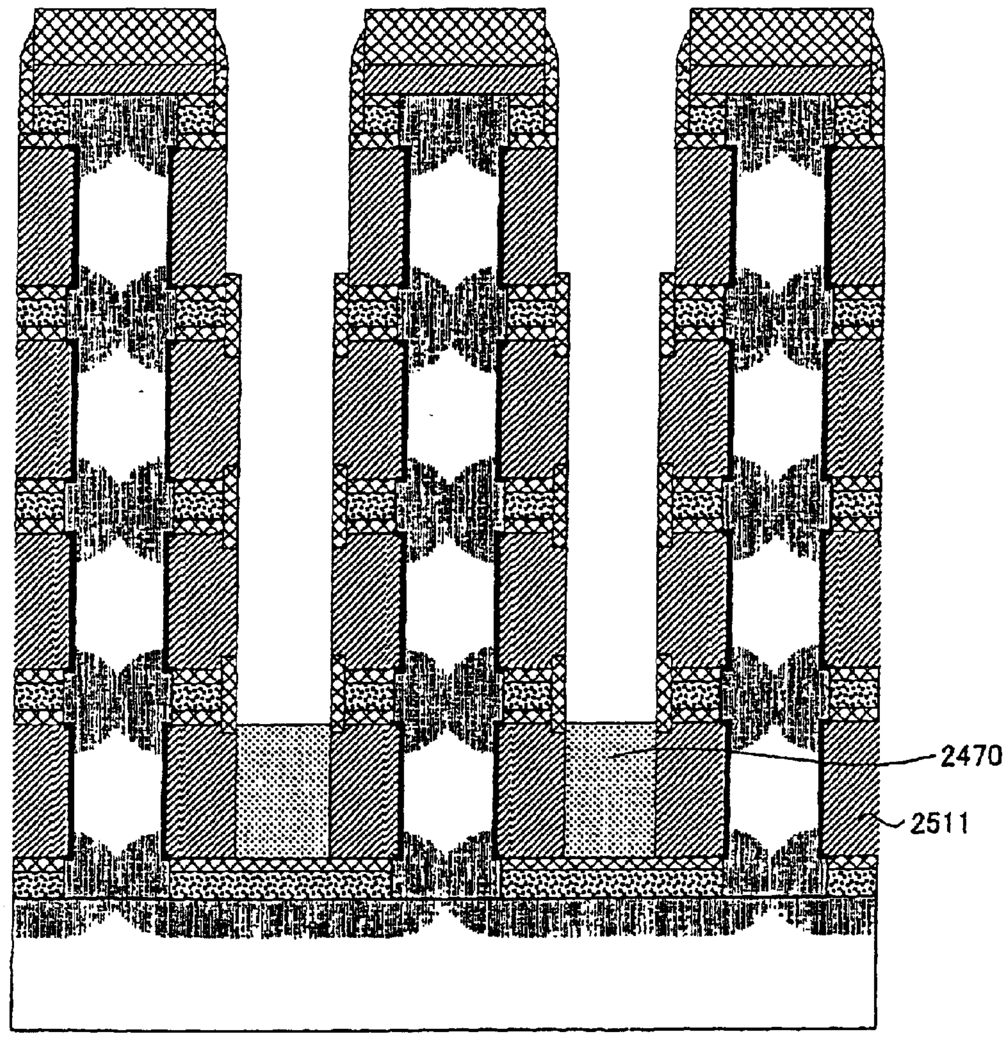
Figure 356:
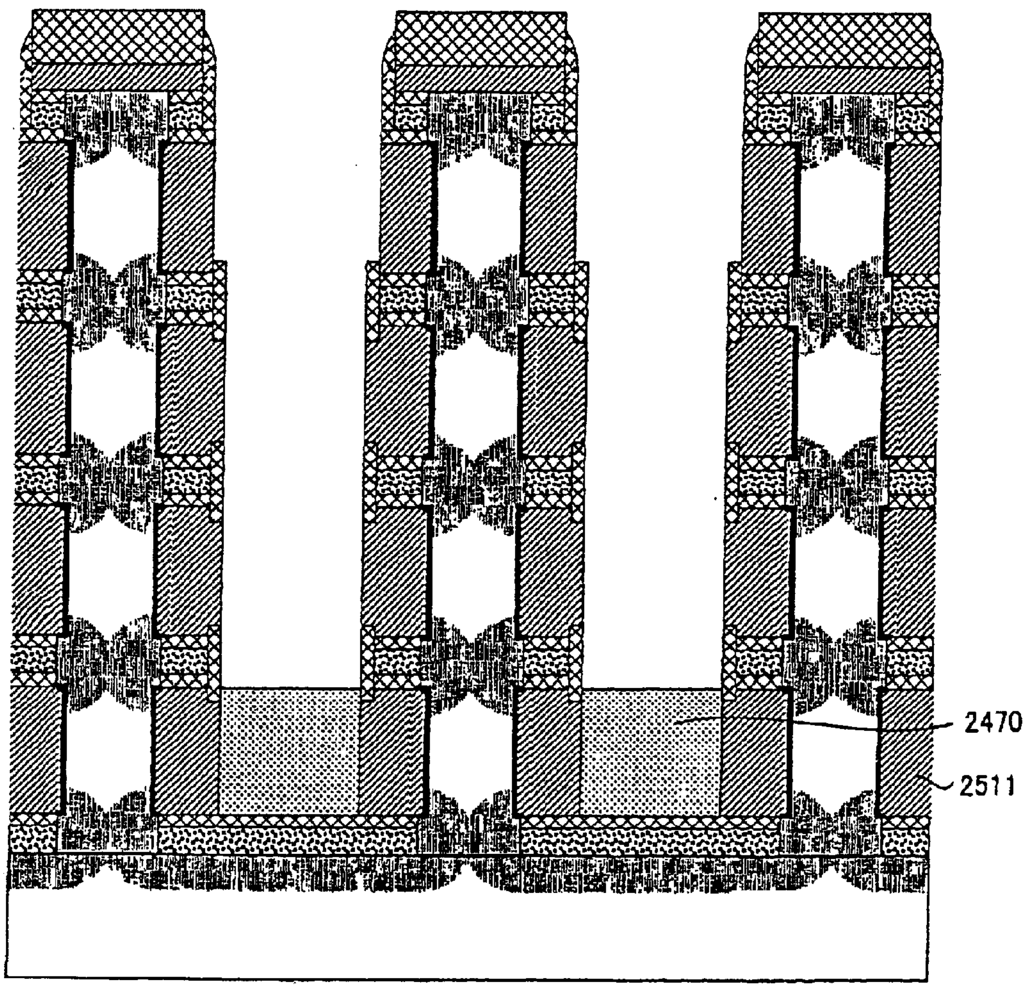

The silicon oxide film 2470 is buried in the third trench 2230, for example, by anisotropic or isotropic etching, such that the polysilicon film 2511 (the first conductive film) is buried (FIGS. 323 and 356). At this time, the depth of the buried silicon oxide film 2470 is so controlled that the silicon nitride film 2342 (the sixth insulating film) is partially exposed.

Figure 324:
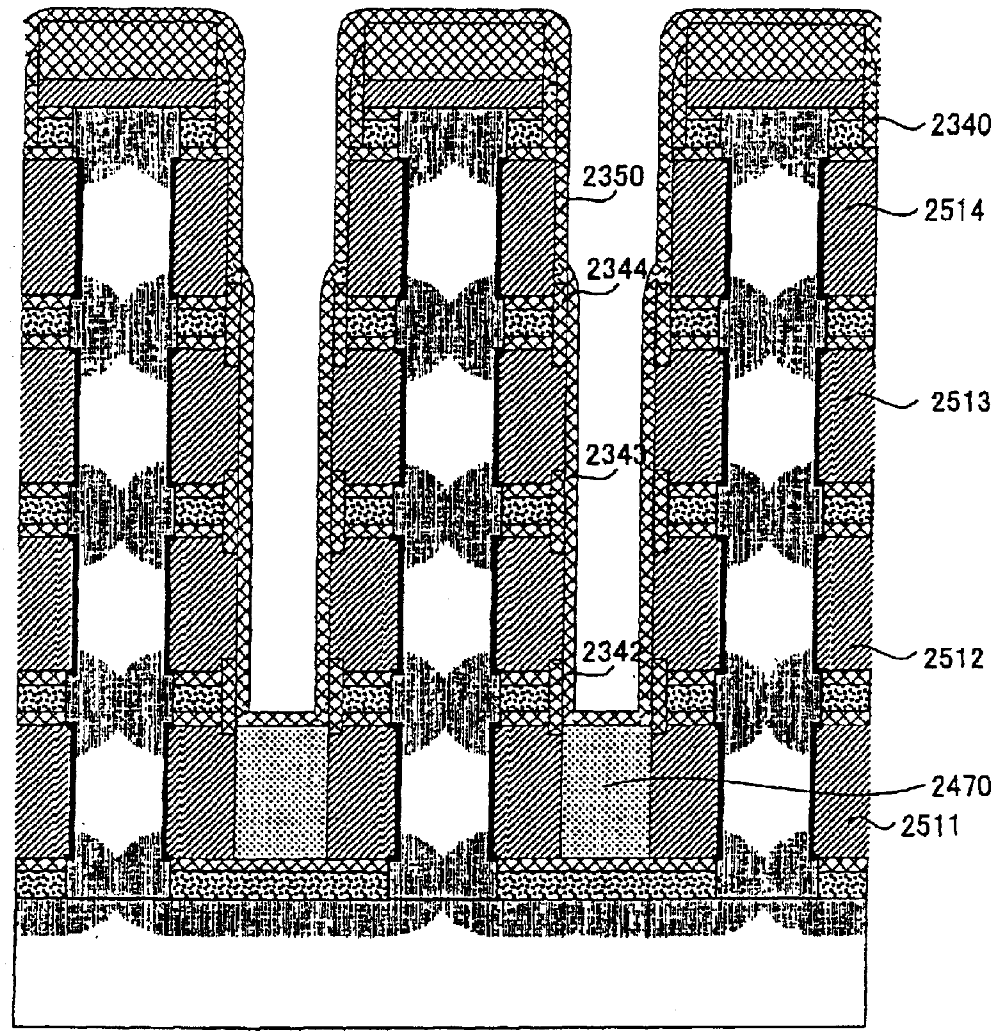
Figure 357:
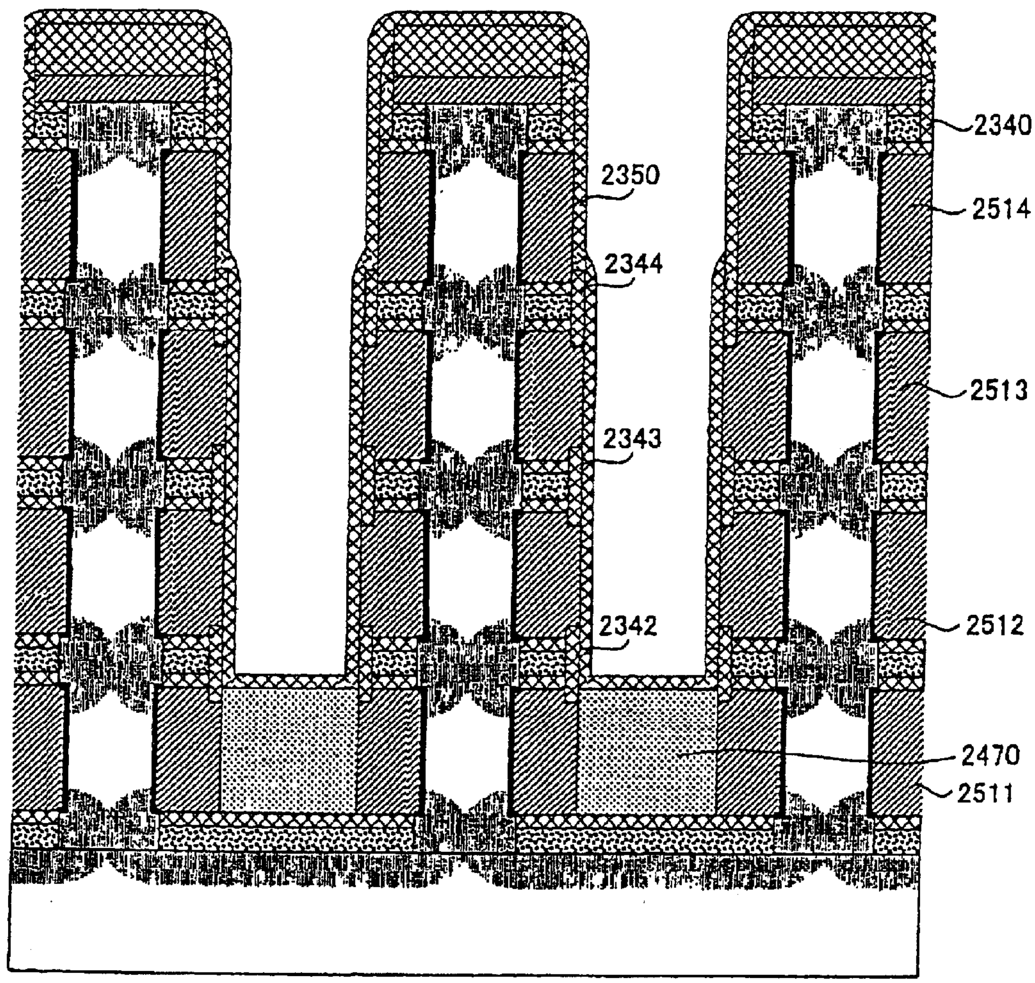

Then, a silicon nitride film 2350, for example, is deposited as a twelfth insulating film to a thickness of 5 to 50 nm on the surfaces the polysilicon films 2512 to 2514 (the first conductive films), the silicon nitride films 2340, 2342, 2343 and 2344 (the sixth insulating films) and the silicon oxide film 2470 (the eleventh insulating film) which are present on the inner wall of the third trench 2230. The silicon nitride film 2350 is then etched back anisotropically, for example, to remain in the form of a sidewall spacer (FIGS. 324 and 357).

Figure 325:
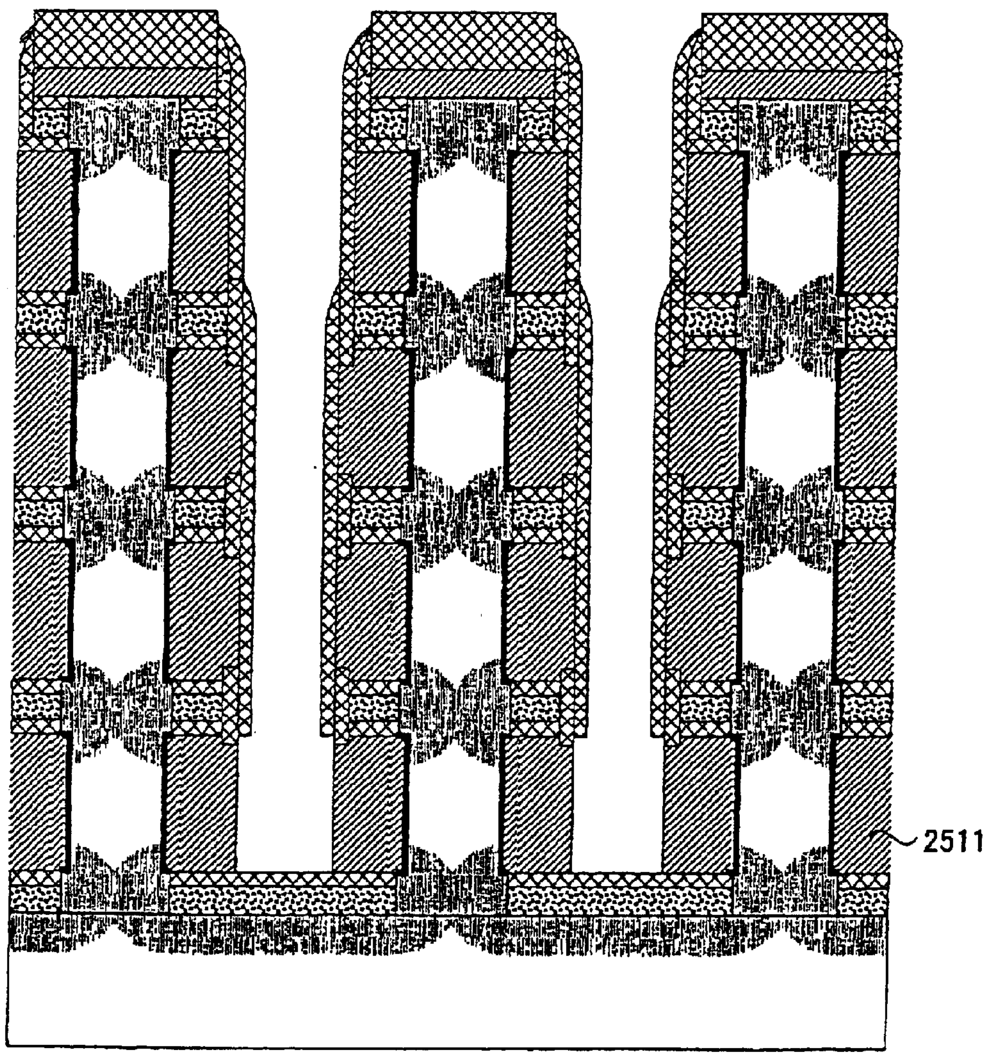
Figure 358:
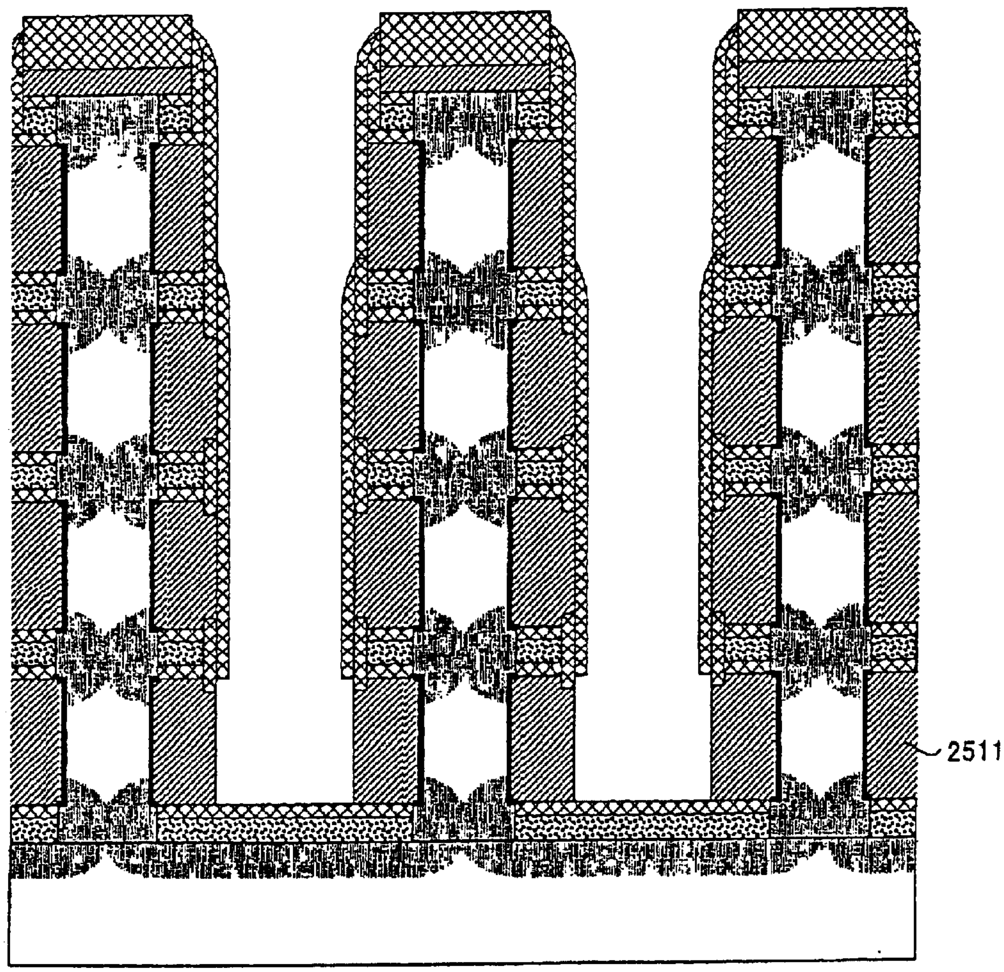

Then, the silicon oxide film 2470 is etched back by isotropic etching, for example, to such a degree that the side of the polysilicon film 2511 (the first conductive film) is exposed (FIGS. 325 and 358).

Figure 326:
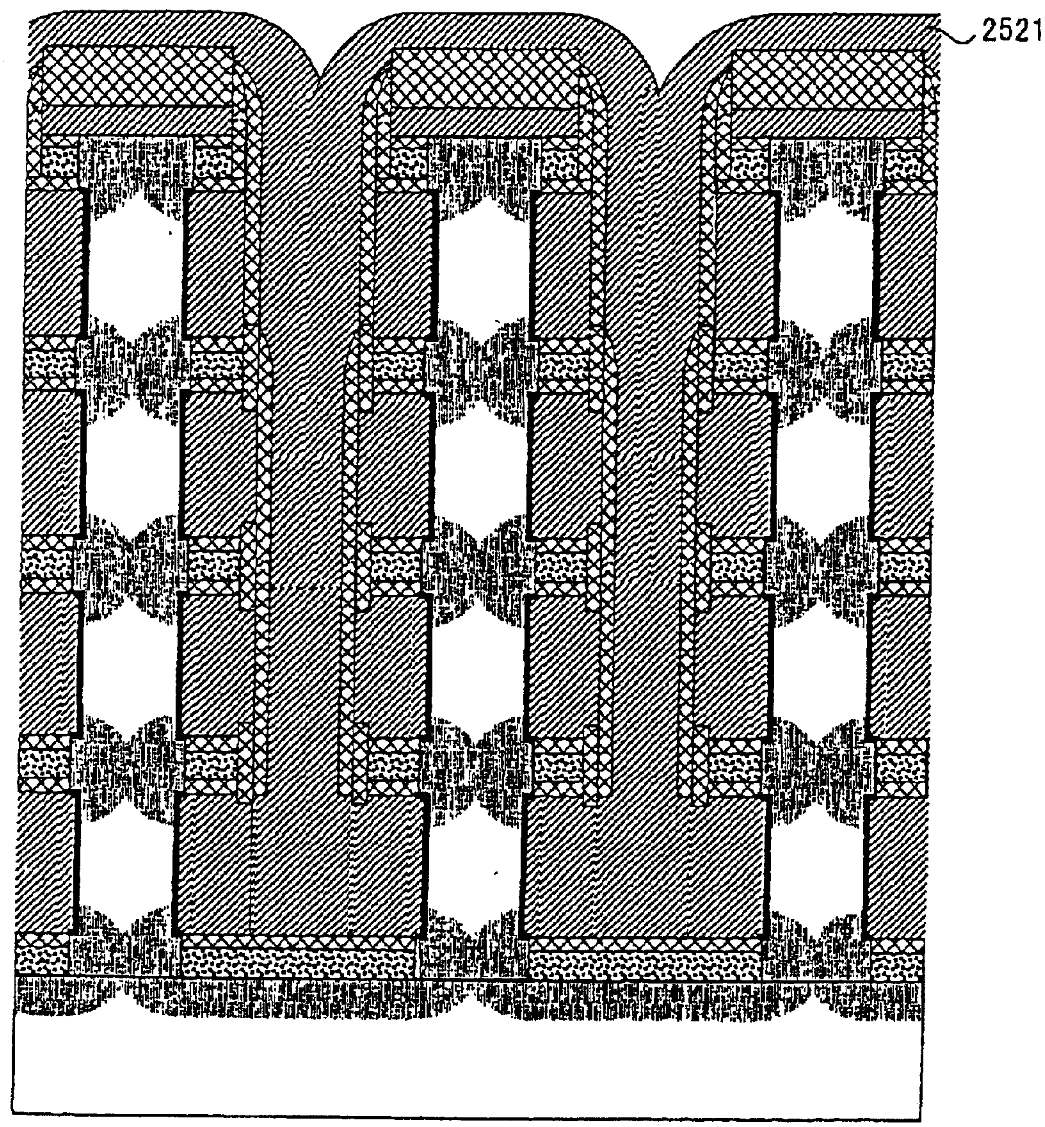
Figure 327:
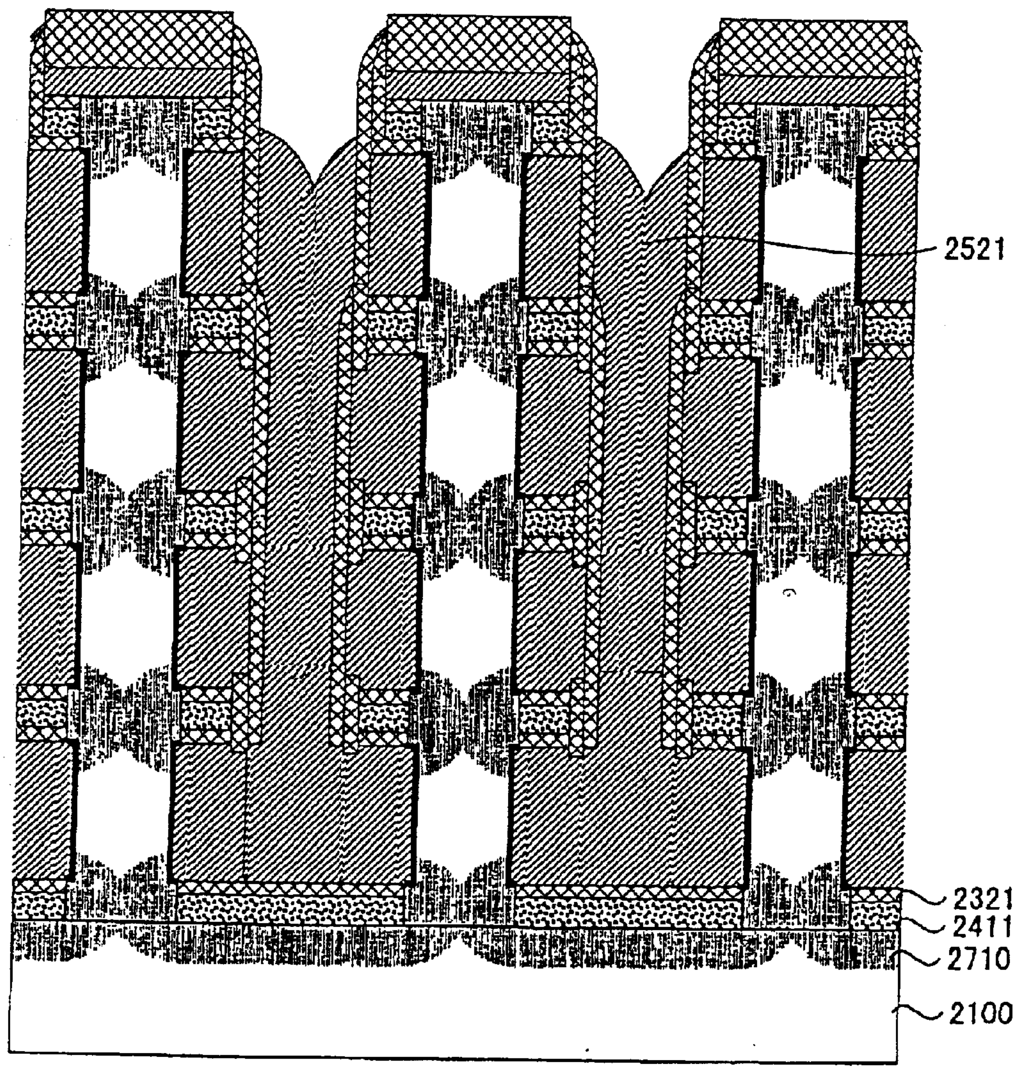
Figure 359:
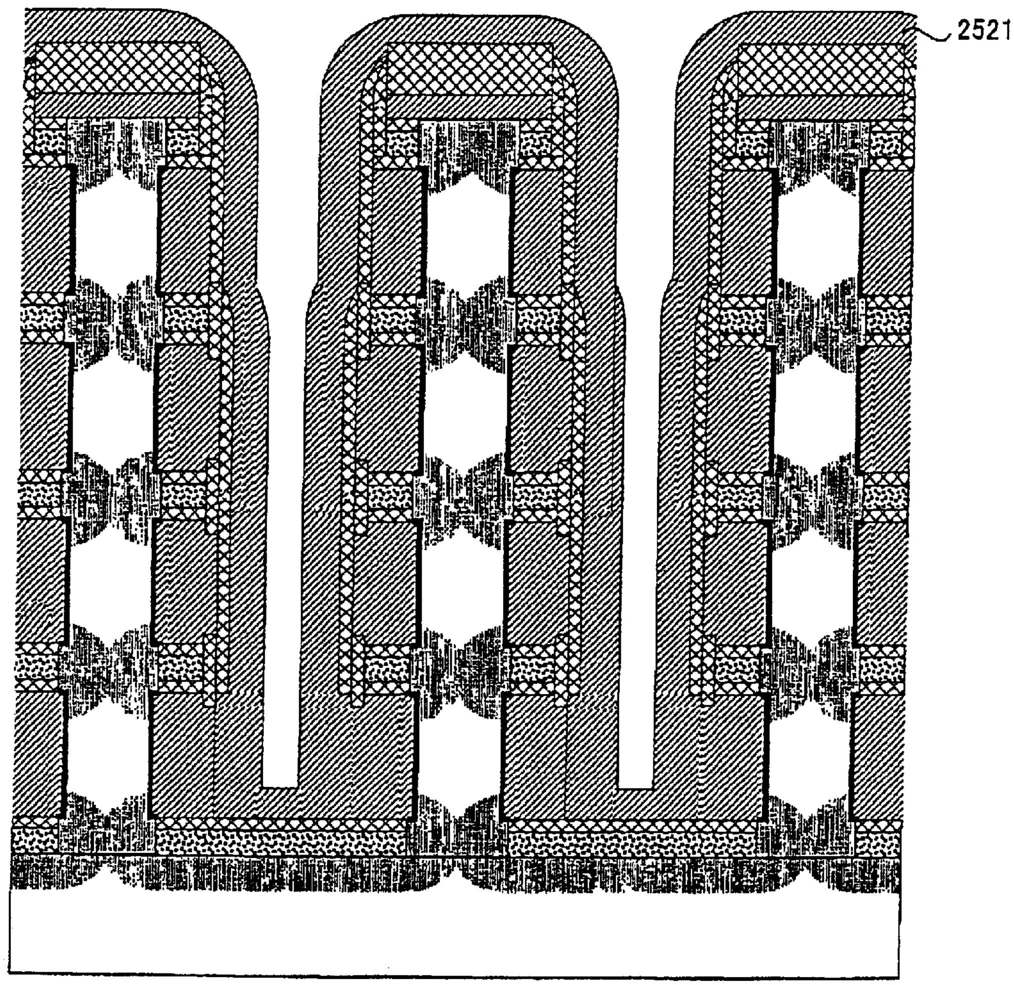
Figure 360:
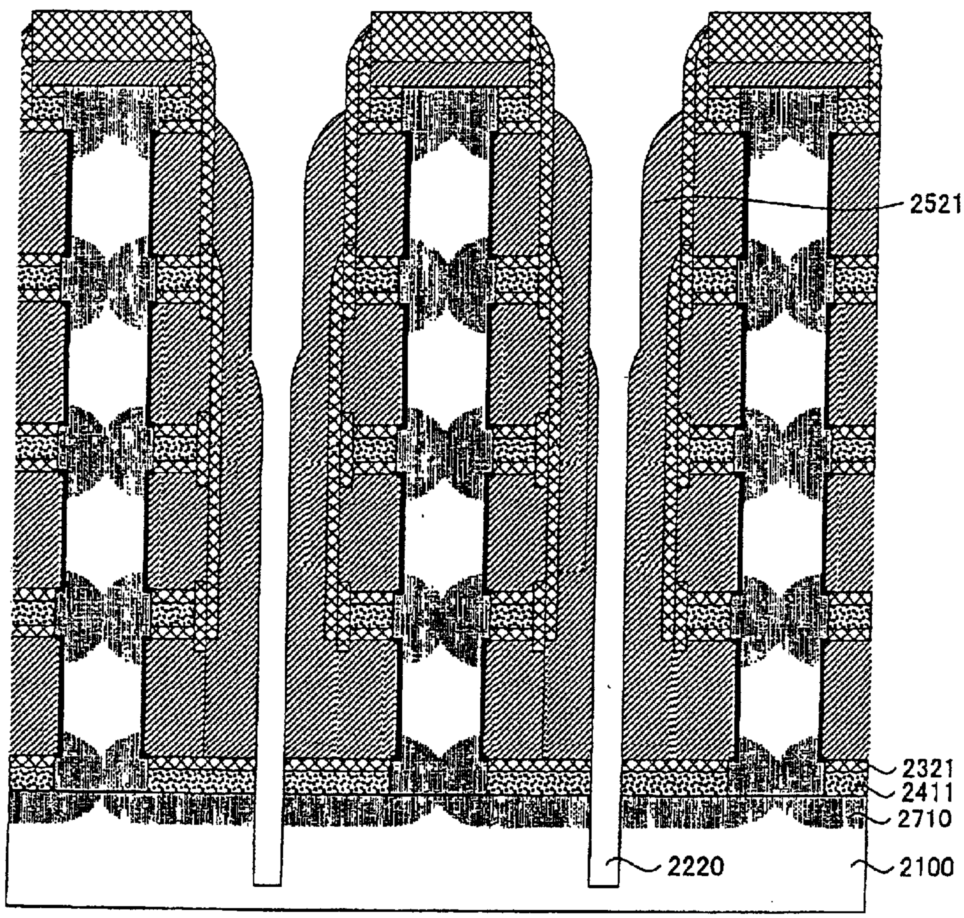

Then, a polysilicon film 2521, for example, is deposited as a second conductive film to a thickness of 15 to 150 nm (FIGS. 326 and 359). The polysilicon film 2521 is then etched back, for example, anisotropically, as shown in FIG. 360. Subsequently, the silicon nitride film 2321 (the fourth insulating film), the silicon oxide film 2411 (the first insulating film) and the P-type silicon substrate 2100 are successively etched to form a second trench 2200 in the P-type silicon substrate 2100 in self-alignment with the polysilicon film 2521 (the second conductive film), thereby separating the impurity diffusion layer 2710. That is, a separation portion of the first wiring layer is formed in self-alignment with a separation portion of the second conductive film (FIG. 327 and FIG. 360).

Figure 328:
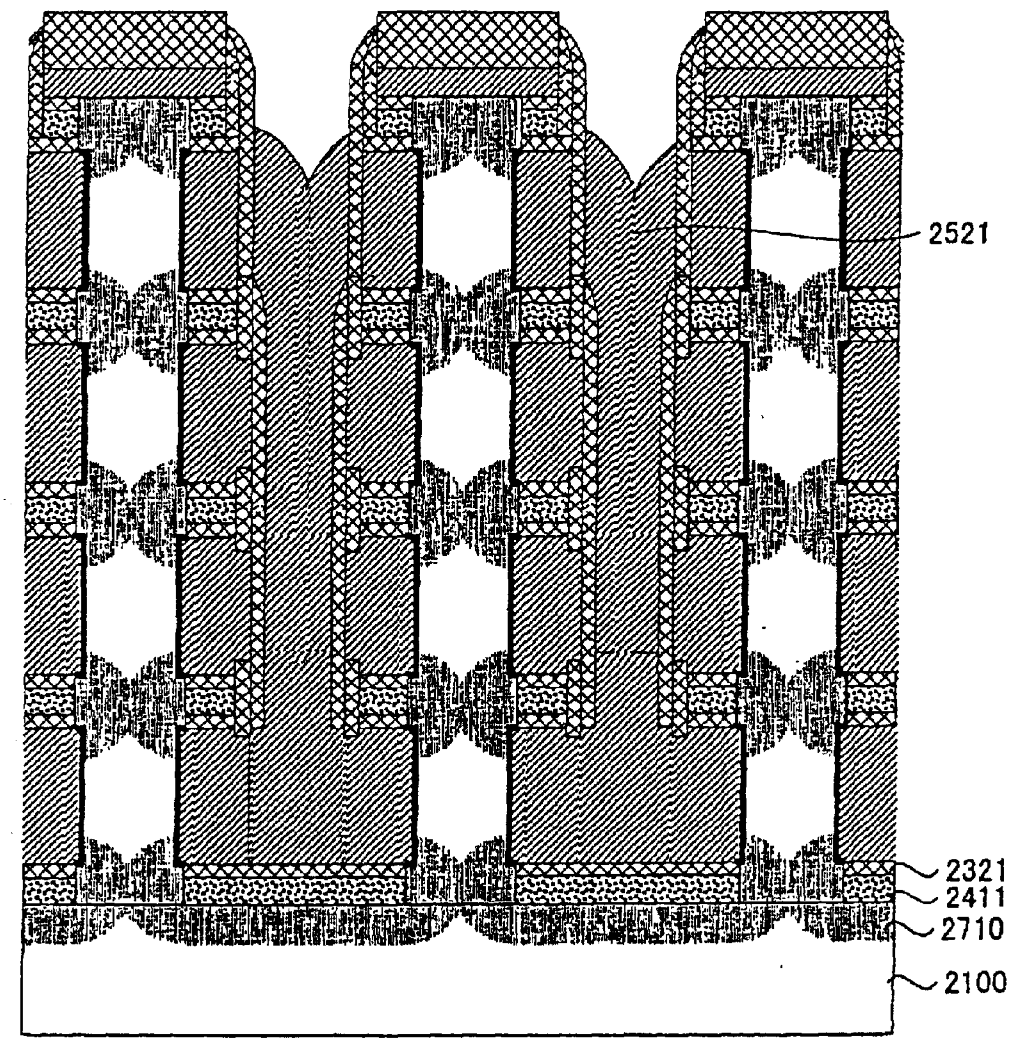
Figure 361:
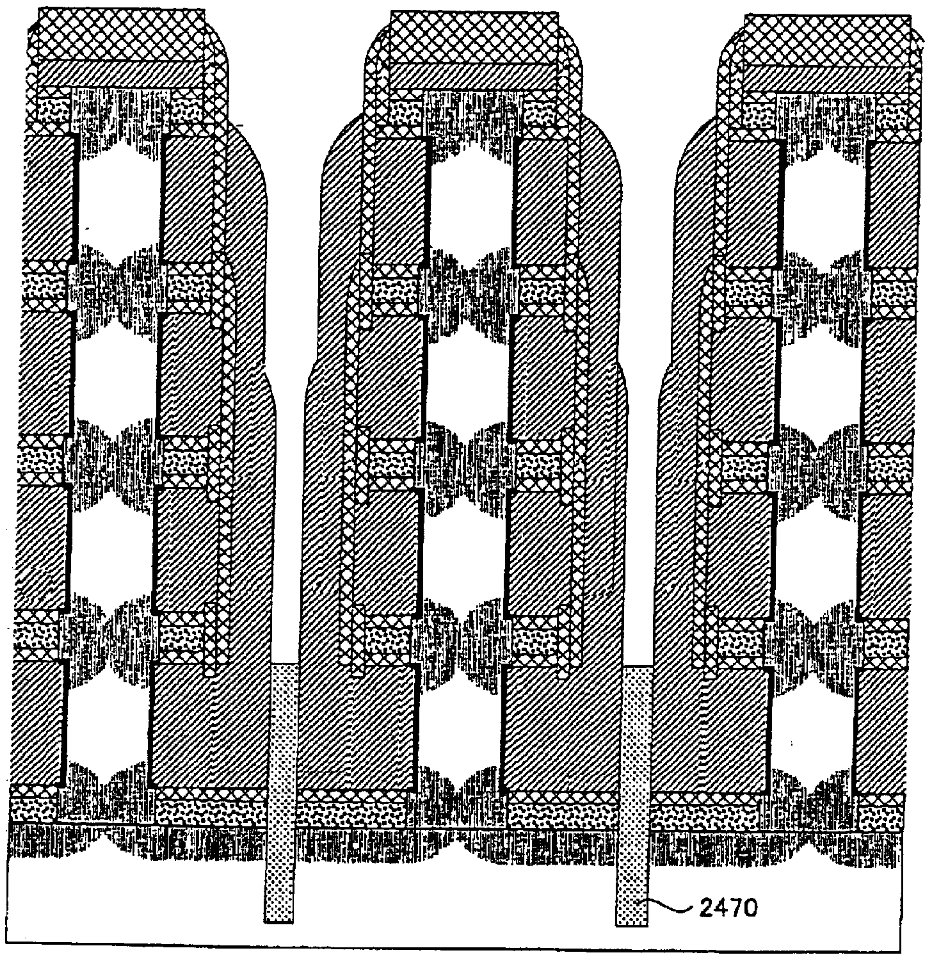

Then, a silicon oxide film 2470, for example, is deposited to a thickness of 30 to 300 nm as an eleventh insulating film and etched back anisotropically to be buried in the second trench 2220. At this time, the height of the silicon oxide film 2470 is so adjusted that the polysilicon film 2511 (the first conductive film) is embedded (FIGS. 328 and 361).

Figure 329:
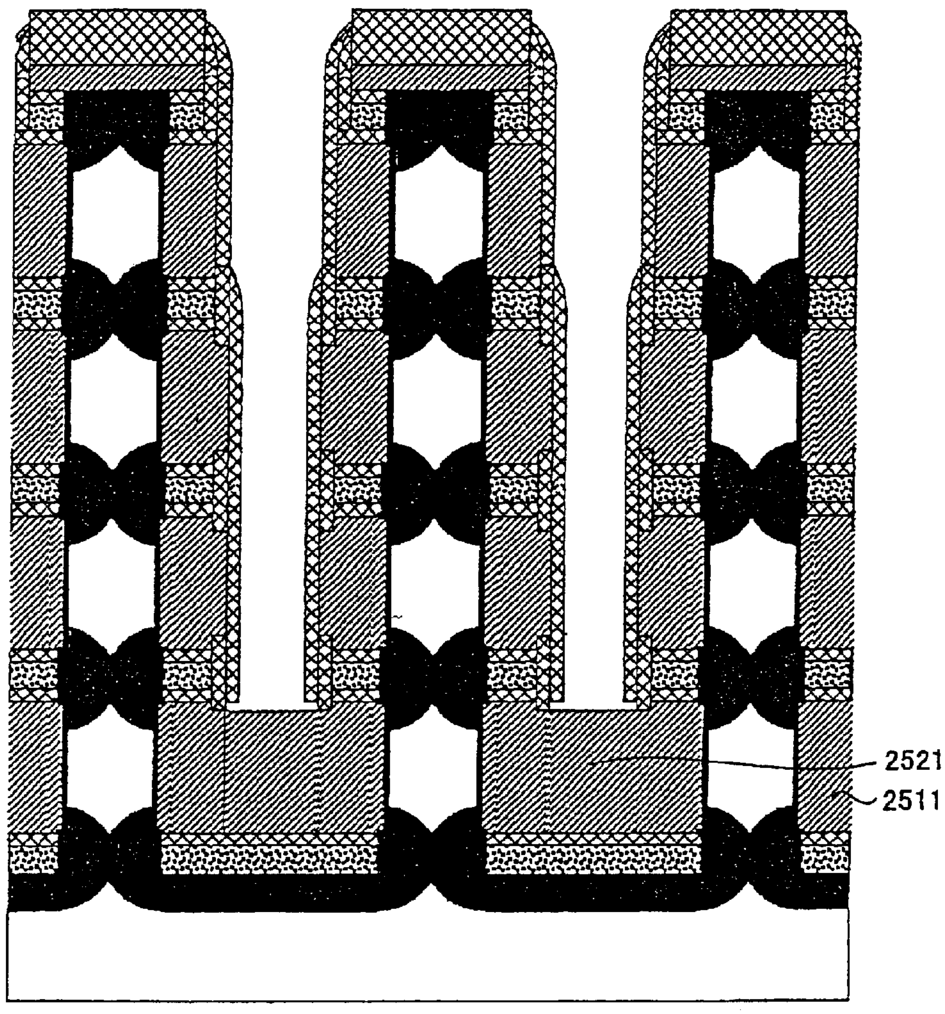
Figure 330:
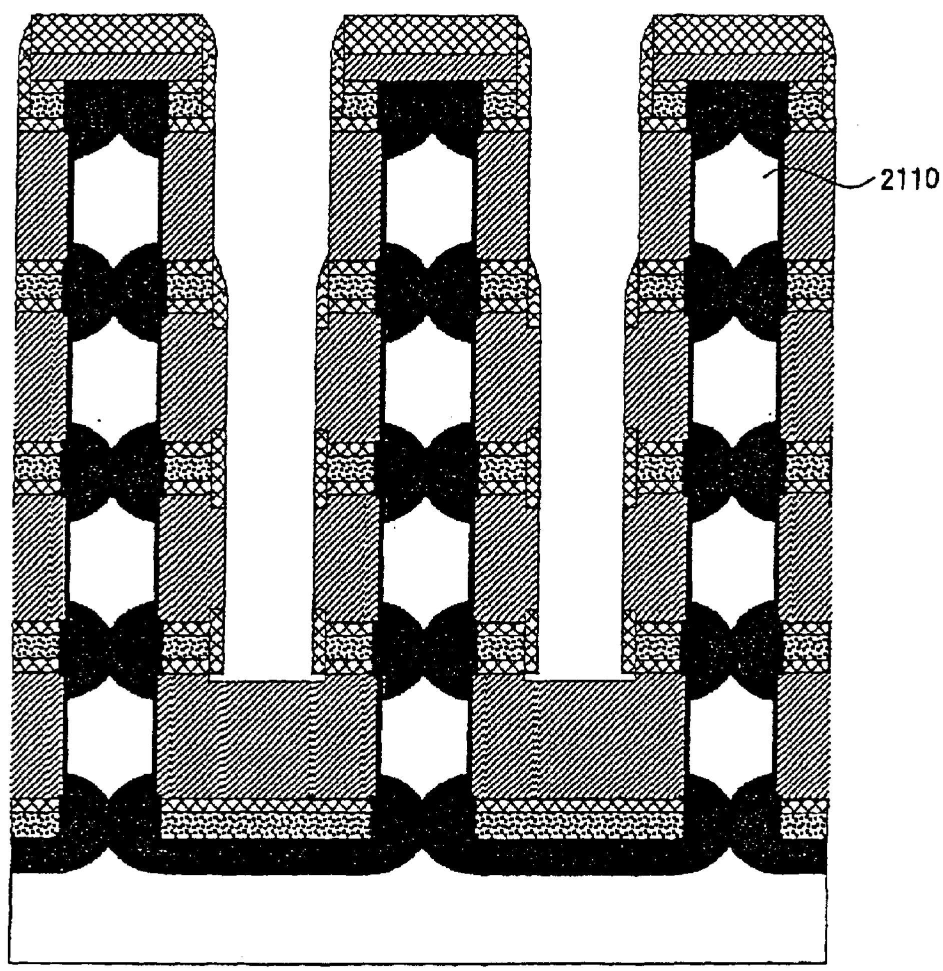
Figure 362:
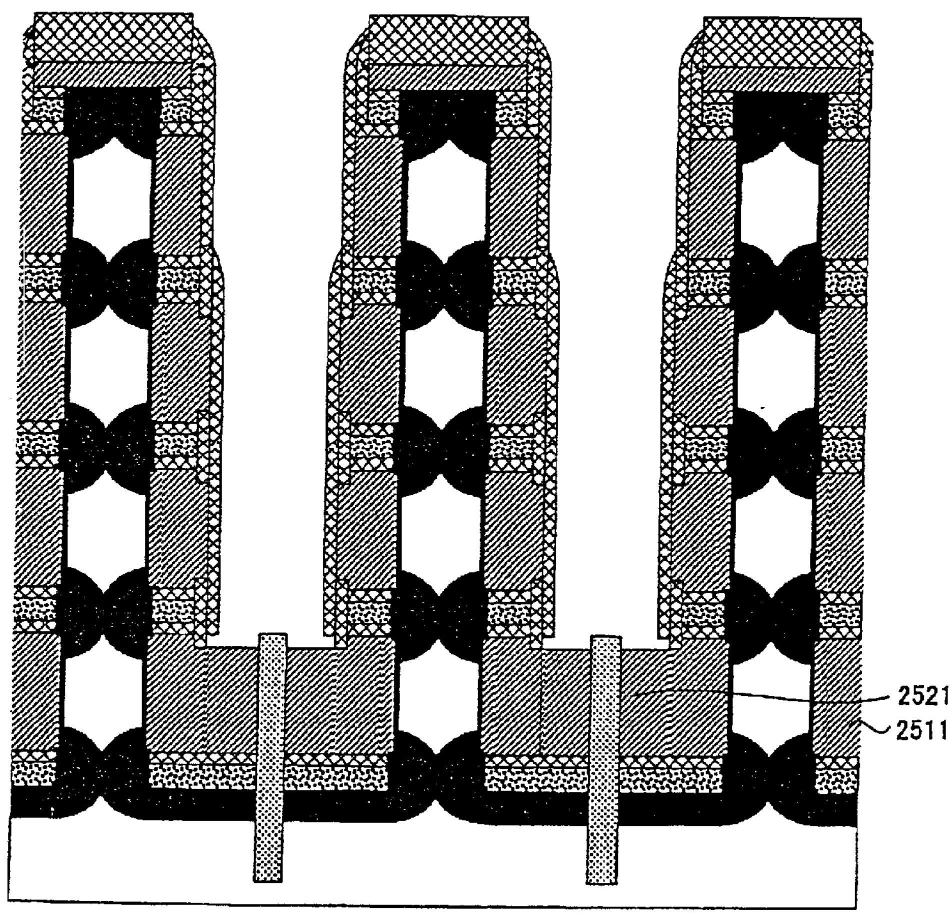
Figure 363:
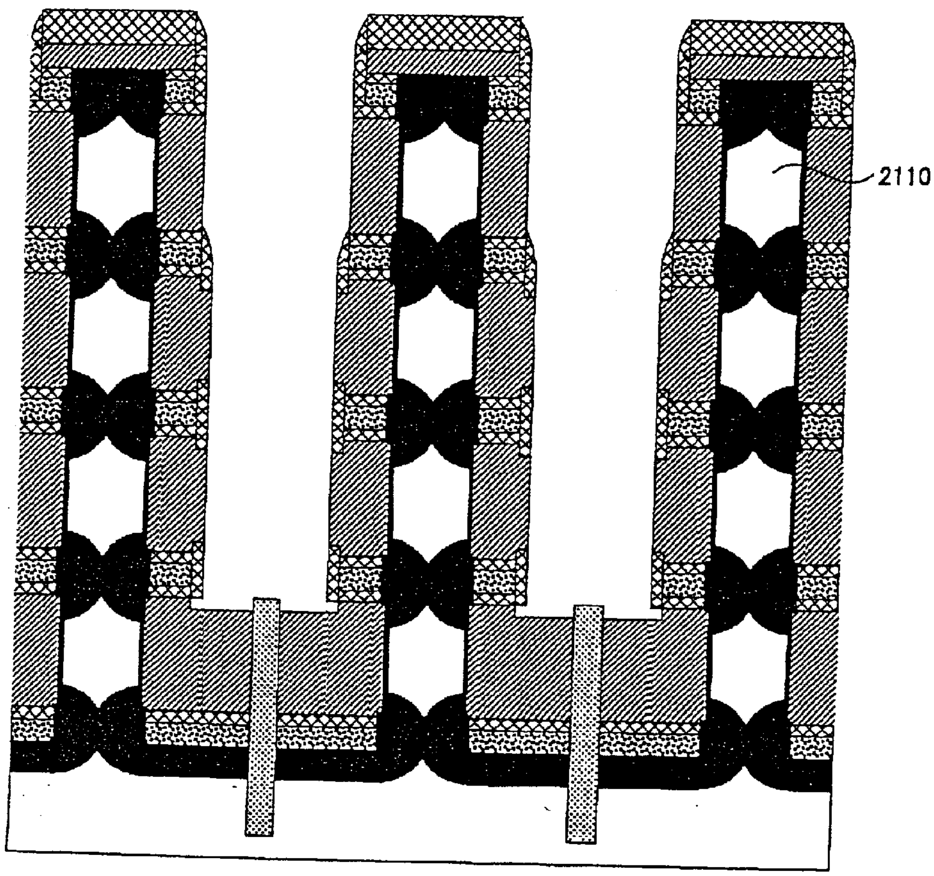

Subsequently, the polysilicon film 2521 is etched back anisotropically or isotropically to such a degree that the polysilicon film 2521 is able to contact the polysilicon film 2511 to form a selection gate (FIGS. 329 and 362). At this time, by setting the intervals between the island-like semiconductor layers 2110 in a direction of A-A' in FIG. 1 to a predetermined value or smaller, the polysilicon film 2521 is formed into a second wiring layer to be a selection gate line continuous in the direction without need to use a masking process.

Then, the sidewall spacer made of the silicon nitride film (the twelfth insulating film) 2350 is removed by isotropic etching (FIGS. 330 and 363) and a silicon oxide film 2471, for example, is deposited as an eleventh insulating film to a thickness of about 50 to 500 nm.

The silicon oxide film 2471 is buried in the third trench 2230 by anisotropic or isotropic etching such that the polysilicon film 2521 is embedded. At this time, the depth of the buried silicon oxide film 2471 is so controlled that the silicon nitride film 2342 is partially exposed.

Figure 331:
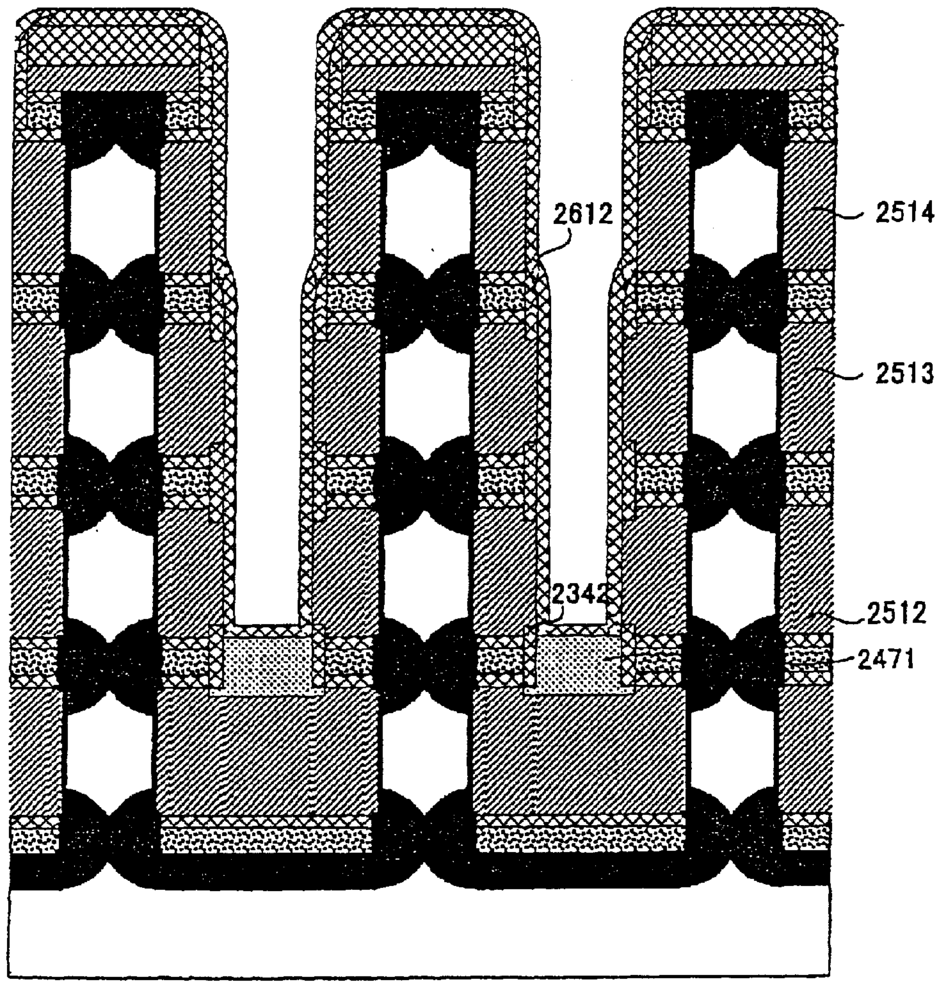
Figure 332:
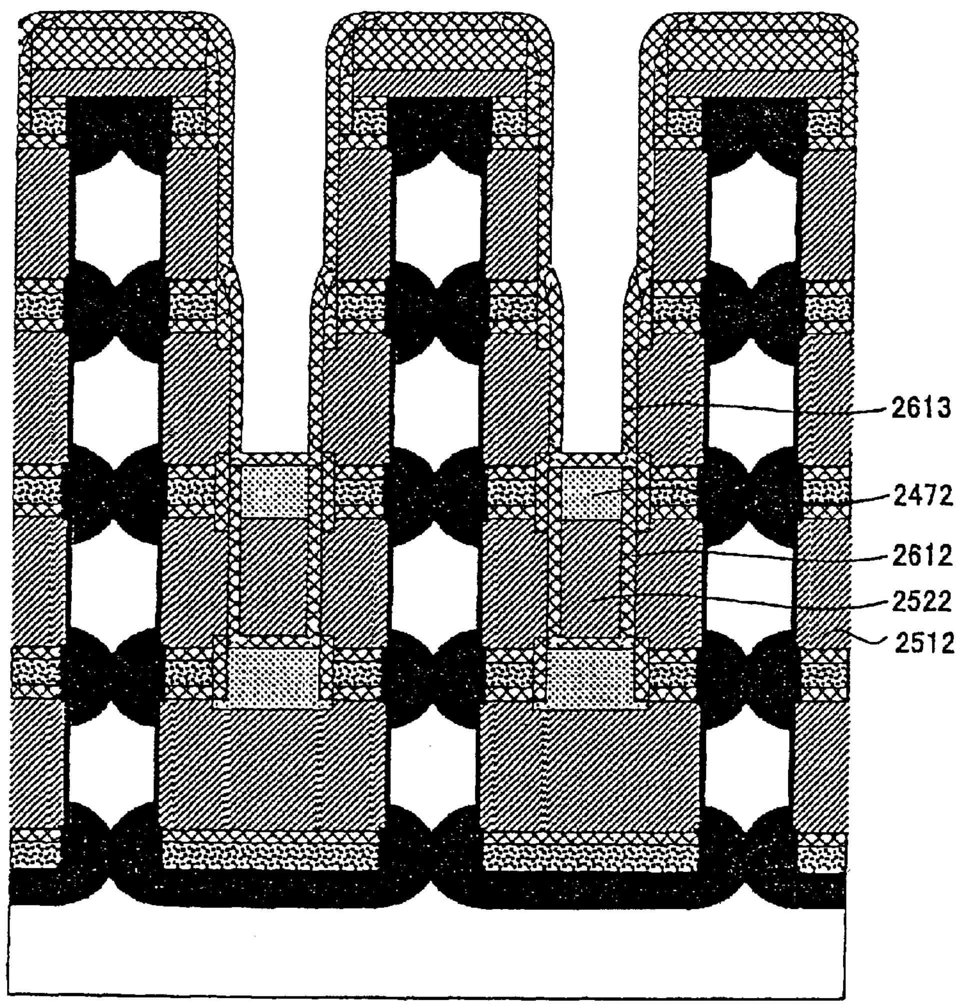
Figure 333:
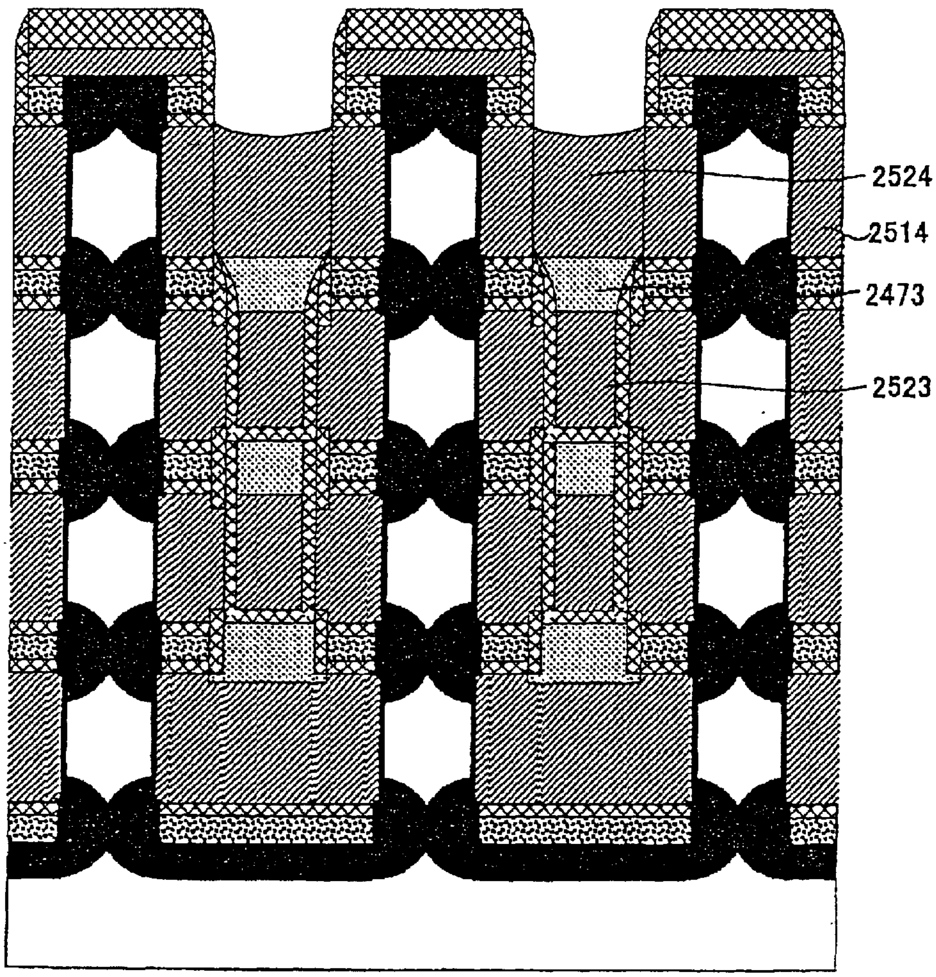
Figure 364:
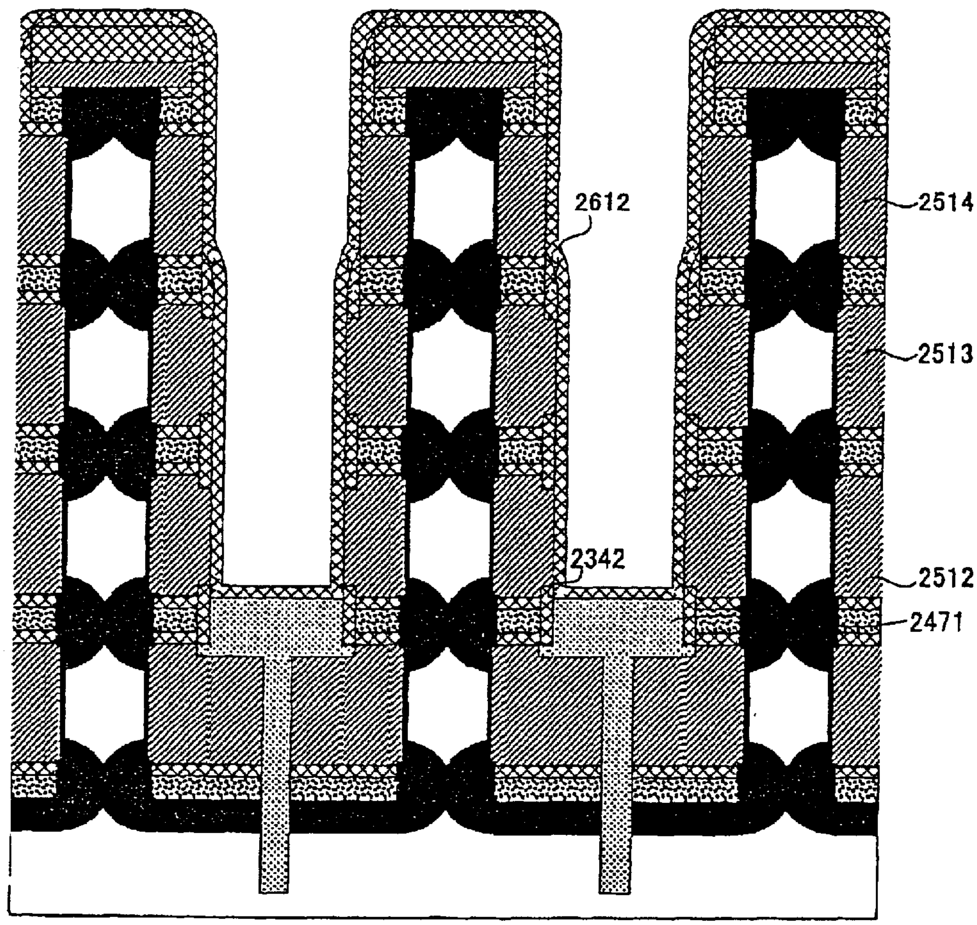
Figure 365:
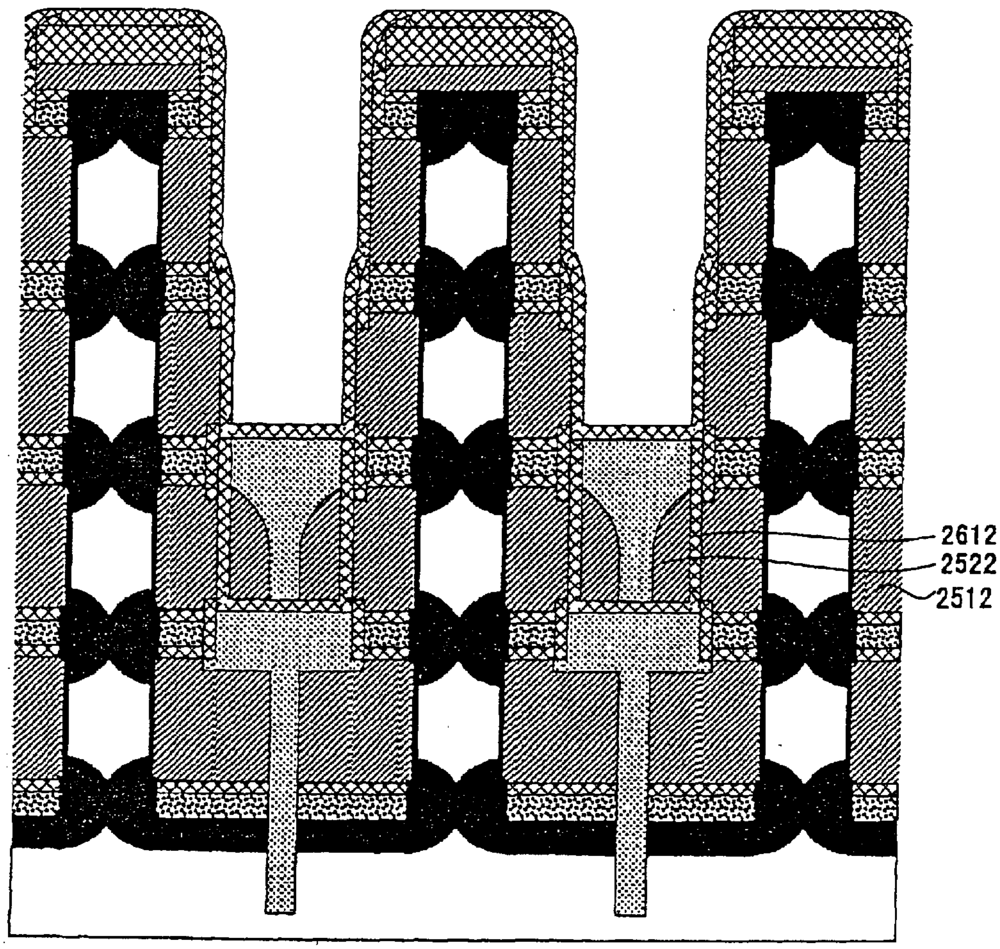
Figure 366:
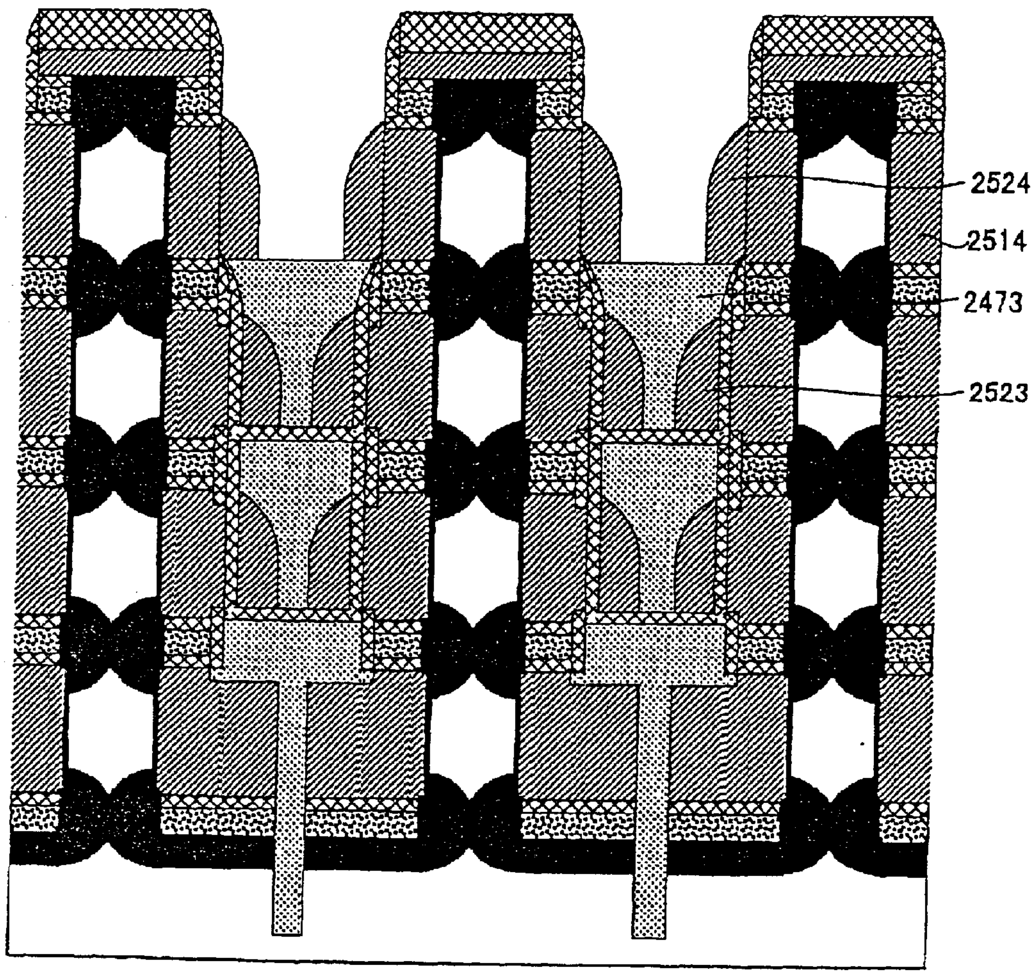

Subsequently, an interlayer insulating film 2612 is formed on exposed surfaces of the polysilicon films 2512 to 2514 (FIG. 331 and FIG. 364). This interlayer insulating film 2612 may be formed of an ONO film. The ONO film can be formed in the same manner as in Production example 1.

Then, in the same manner, a polysilicon film 2522 is deposited as a second conductive film to a thickness of 15 to 150 nm and then etched back such that the polysilicon film 2522 is disposed on the side of the polysilicon film (the first conductive film) 2512 with intervention of the interlayer insulating film 2612. At this time, by setting the intervals between the island-like semiconductor layers 2110 in the direction of A-A' in FIG. 1 to a predetermined value or smaller, the polysilicon film 2522 is formed into a third wiring layer to be a control gate line continuous in the direction of A-A' without need to use a masking process.

Thereafter, a silicon oxide film 2472, for example, is deposited as an eleventh insulating film to a thickness of about 50 to 500 nm. The silicon oxide film 2472 is buried in the third trench 2230, for example, by anisotropic or isotropic etching, such that the polysilicon film (the second conductive film) 2522 is embedded. At this time, the depth of the buried silicon oxide film 2472 is so controlled that the silicon nitride film 2343 is partially exposed.

By repeating likewise, a polysilicon film (a second conductive film) 2523 is disposed on the side of the polysilicon film (a first conductive film) 2513 with intervention of an interlayer insulating film 2613, and then a silicon oxide film 2473 (an eleventh insulating film) is formed to bury the polysilicon film 2523. With regard to the polysilicon film 2514 which is the topmost first conductive film, a polysilicon film (a second conductive film) 2524 is etched back to such a degree that the polysilicon film 2524 is able to contact the polysilicon film (the first conductive film) 2514, in the same manner as the polysilicon film 2511 which is the bottommost first conductive film (FIGS. 329 to 334 and FIGS. 362 to 366).

Figure 334:
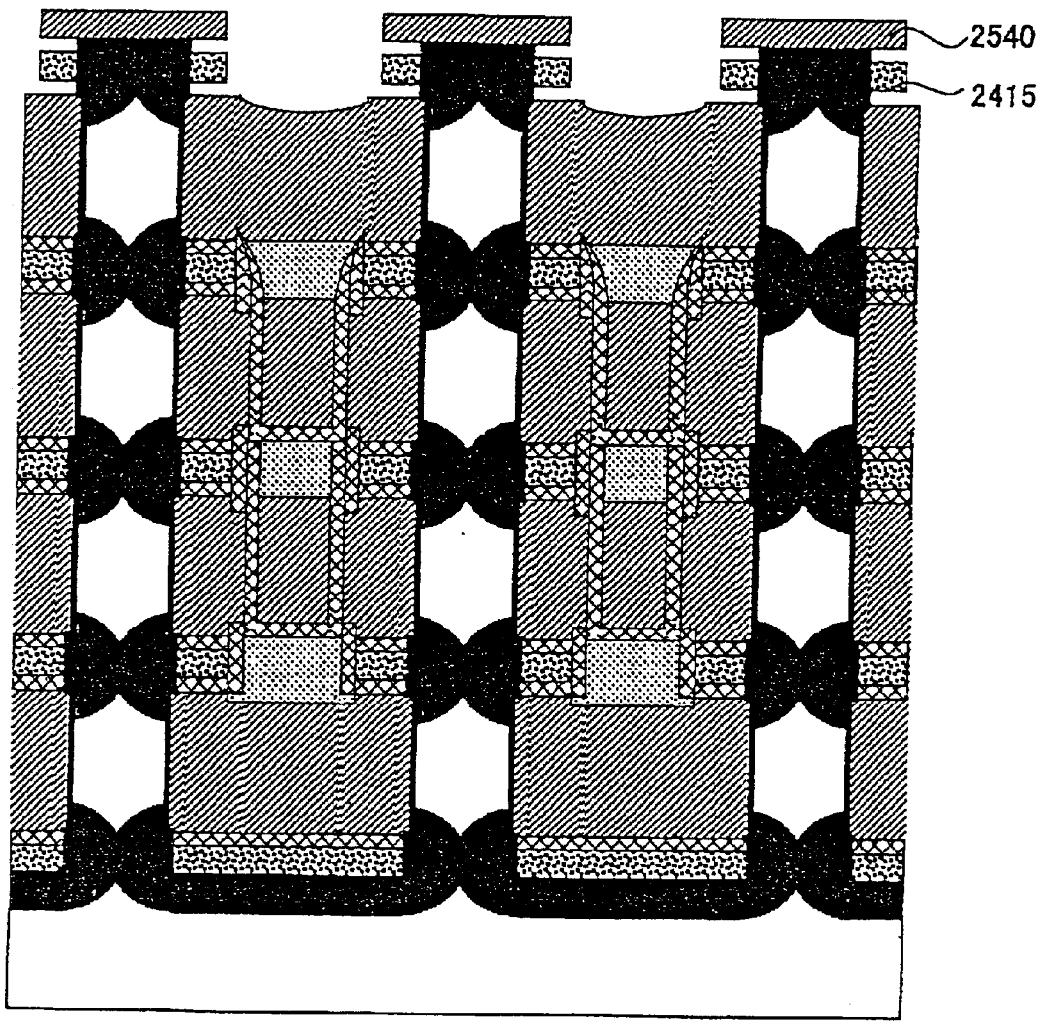
Figure 367:
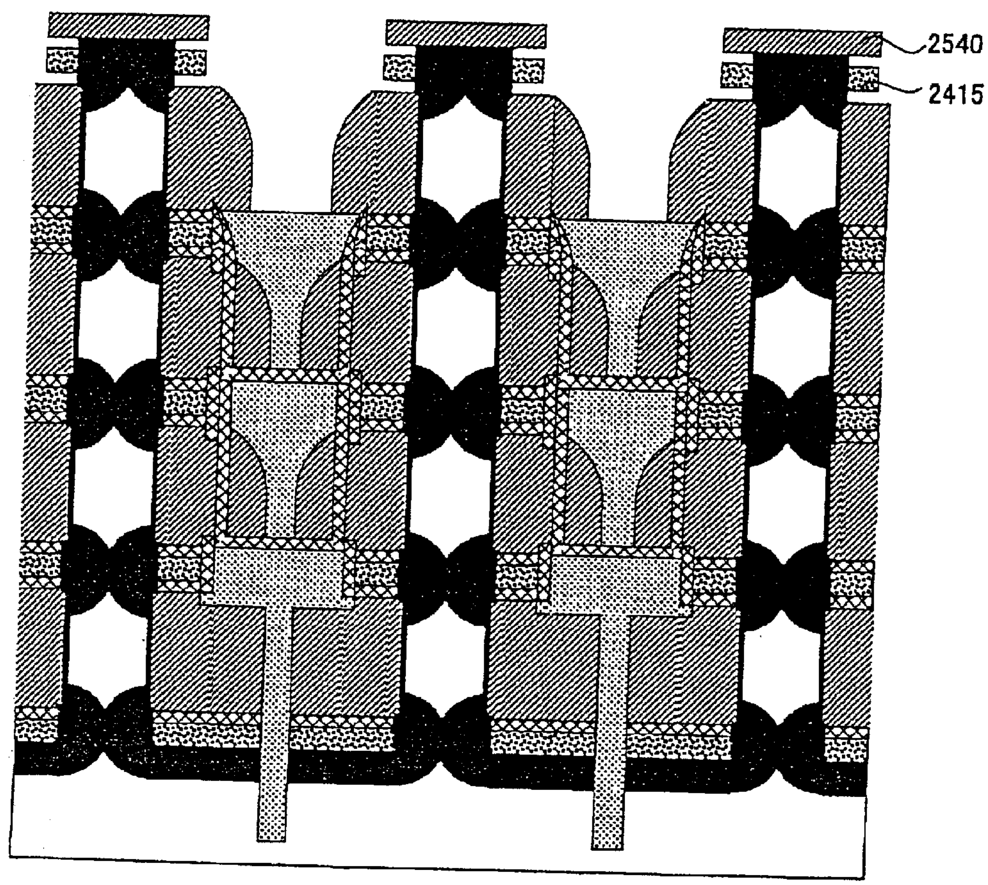
Figure 368:
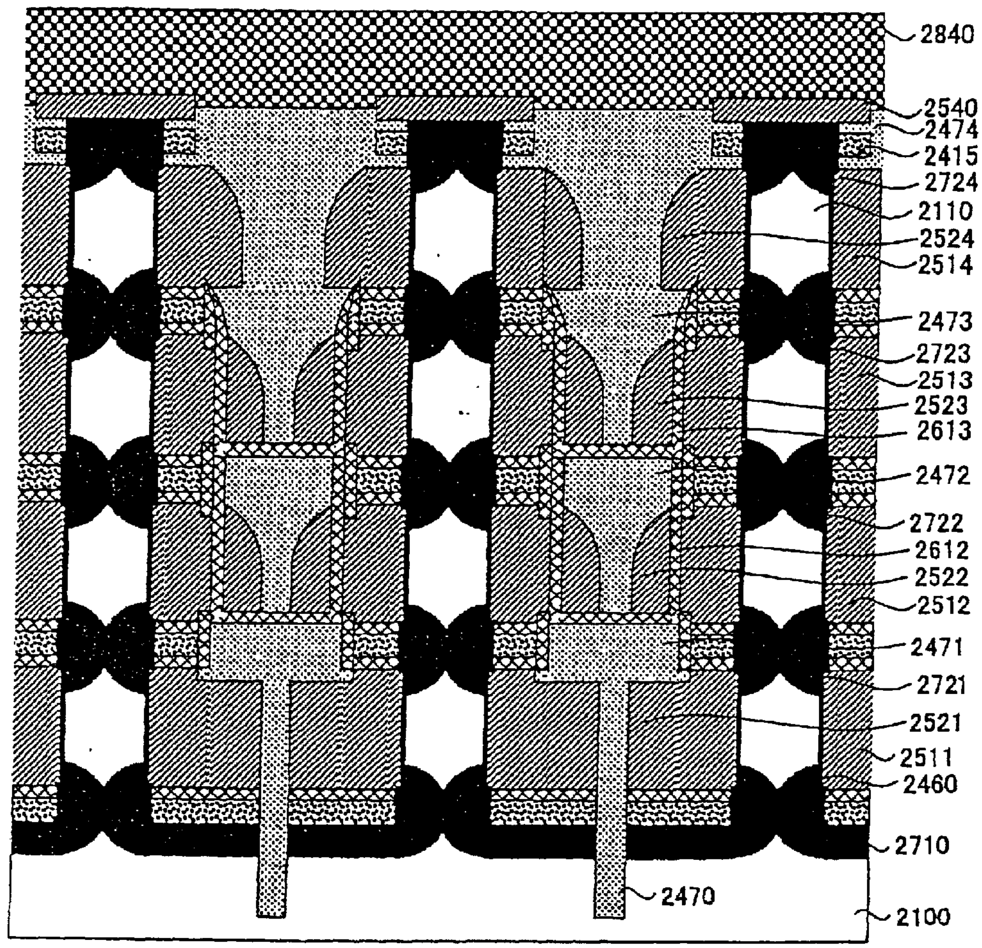
Figure 369:
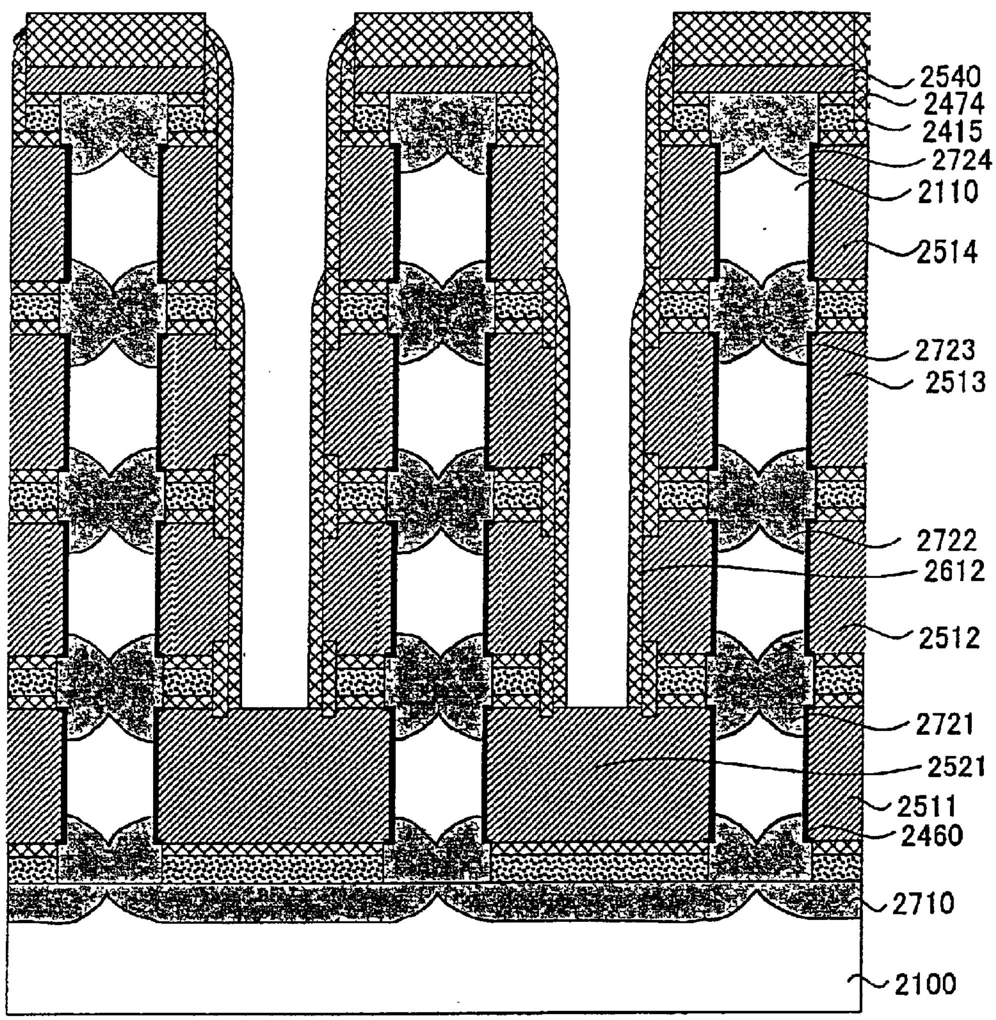
Figure 370:
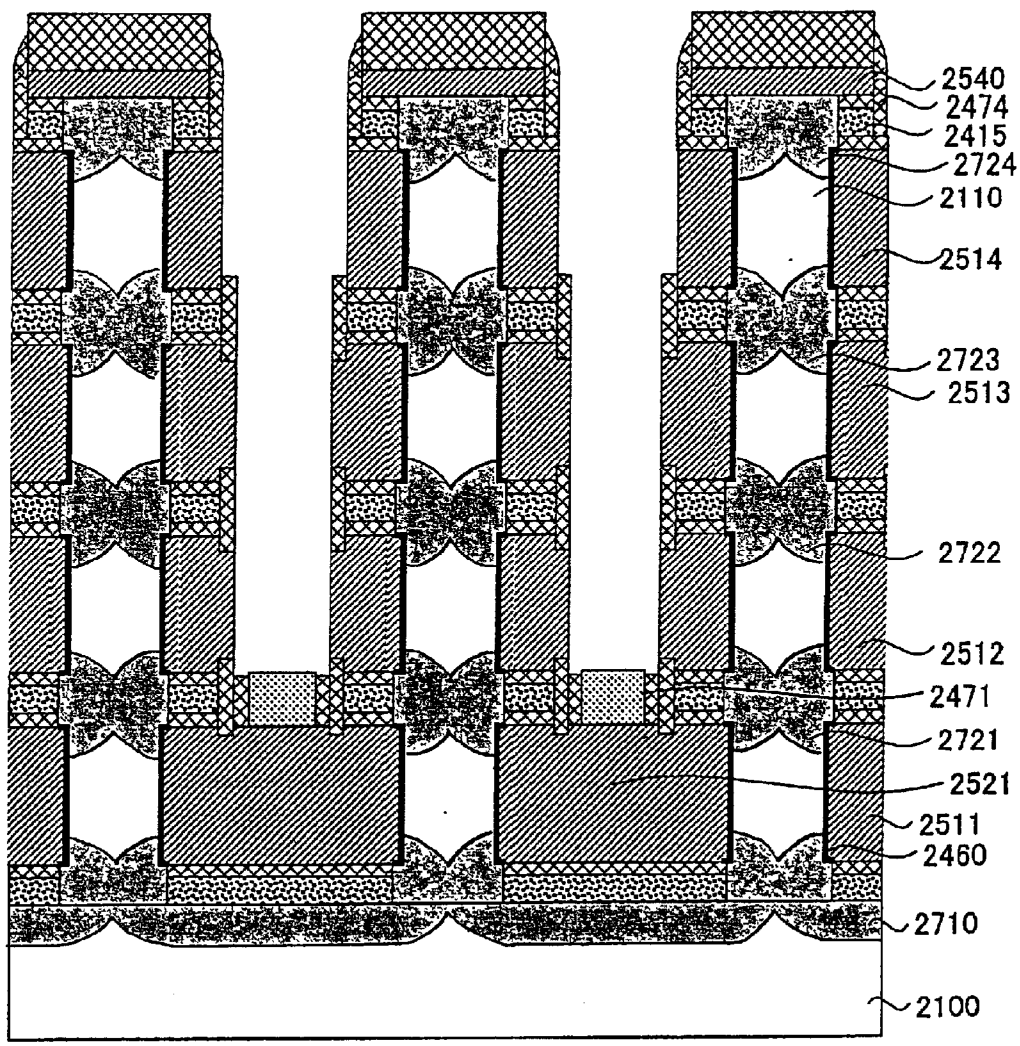
Figure 371:
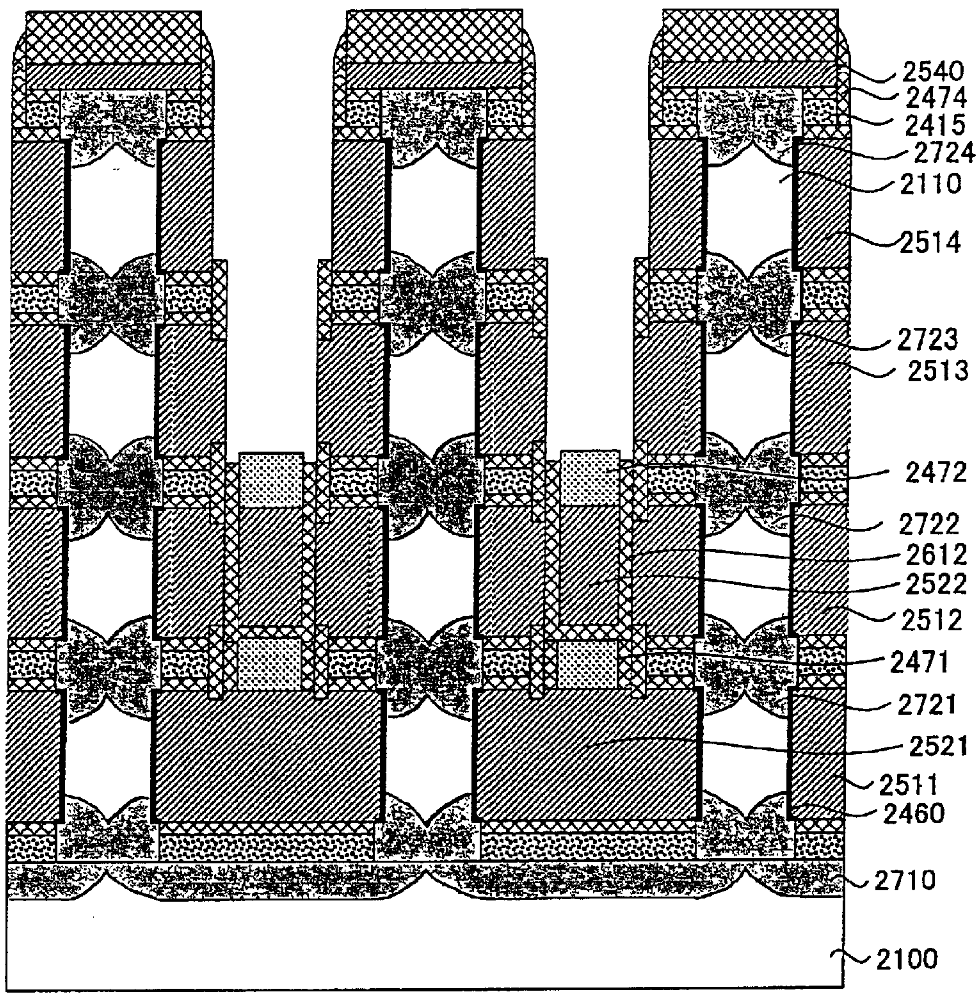
Figure 372:
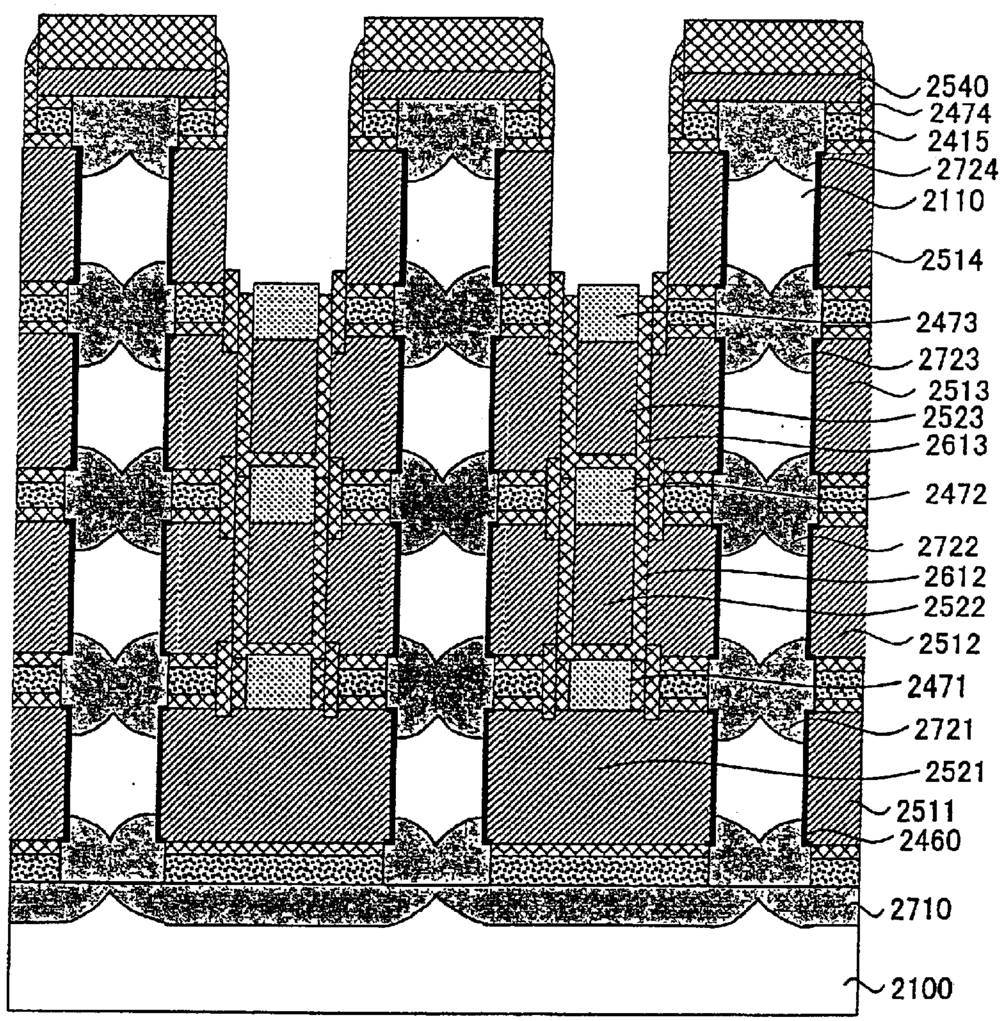
Figure 373:
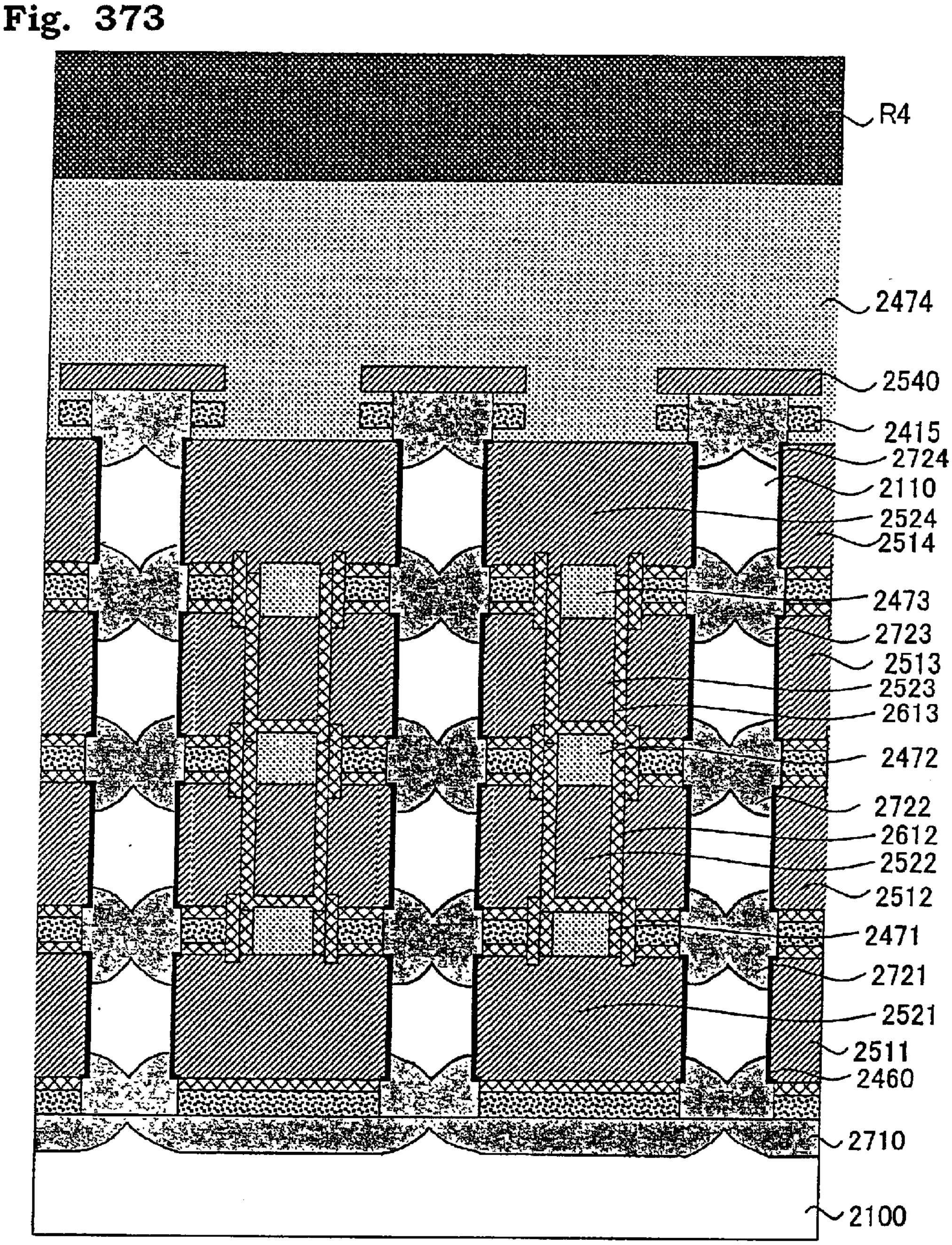
Figure 374:
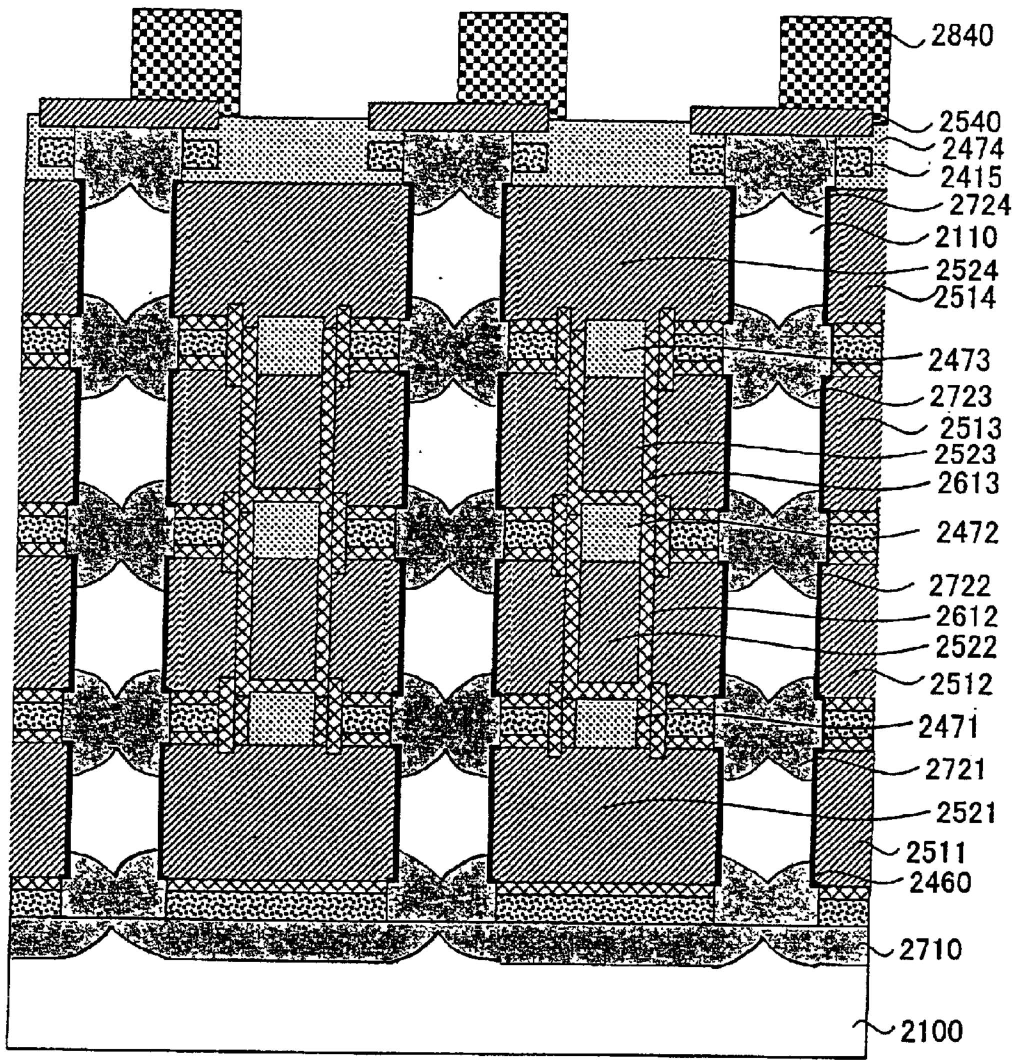
Figure 375:
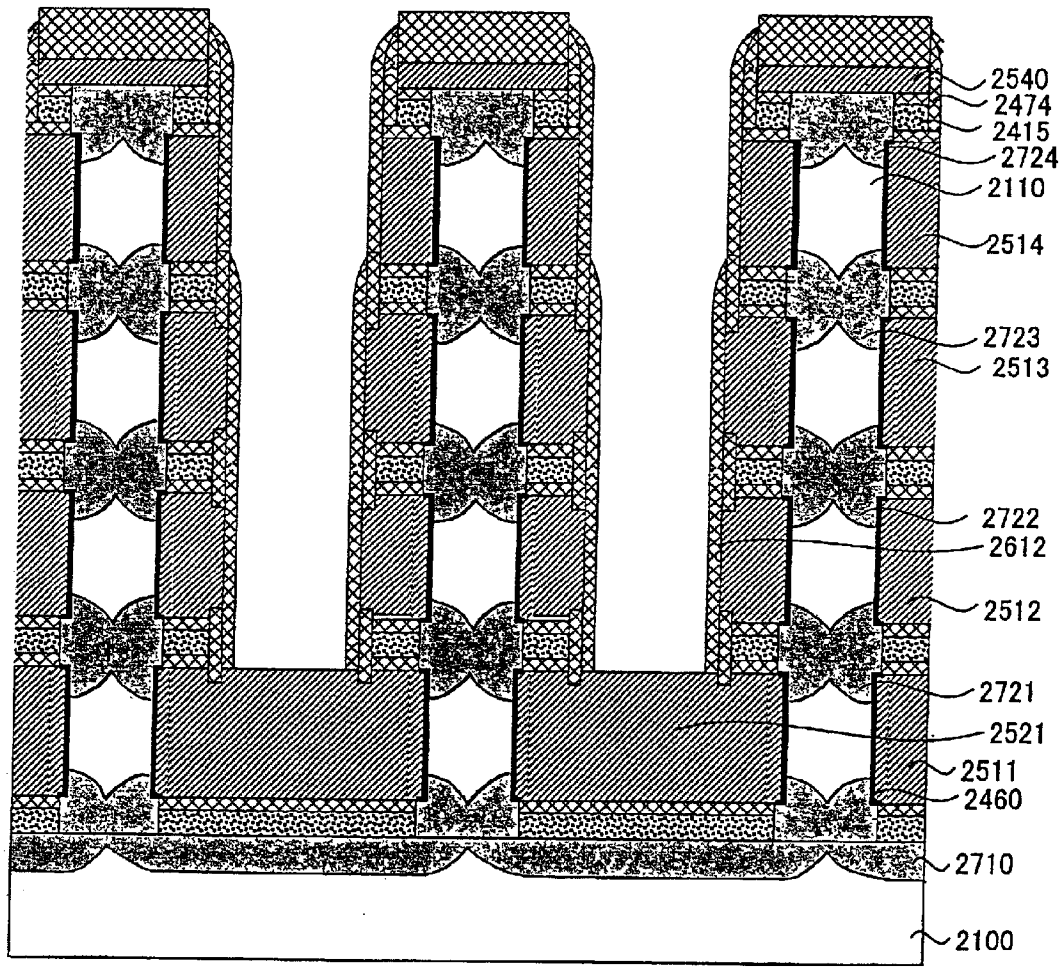
Figure 376:
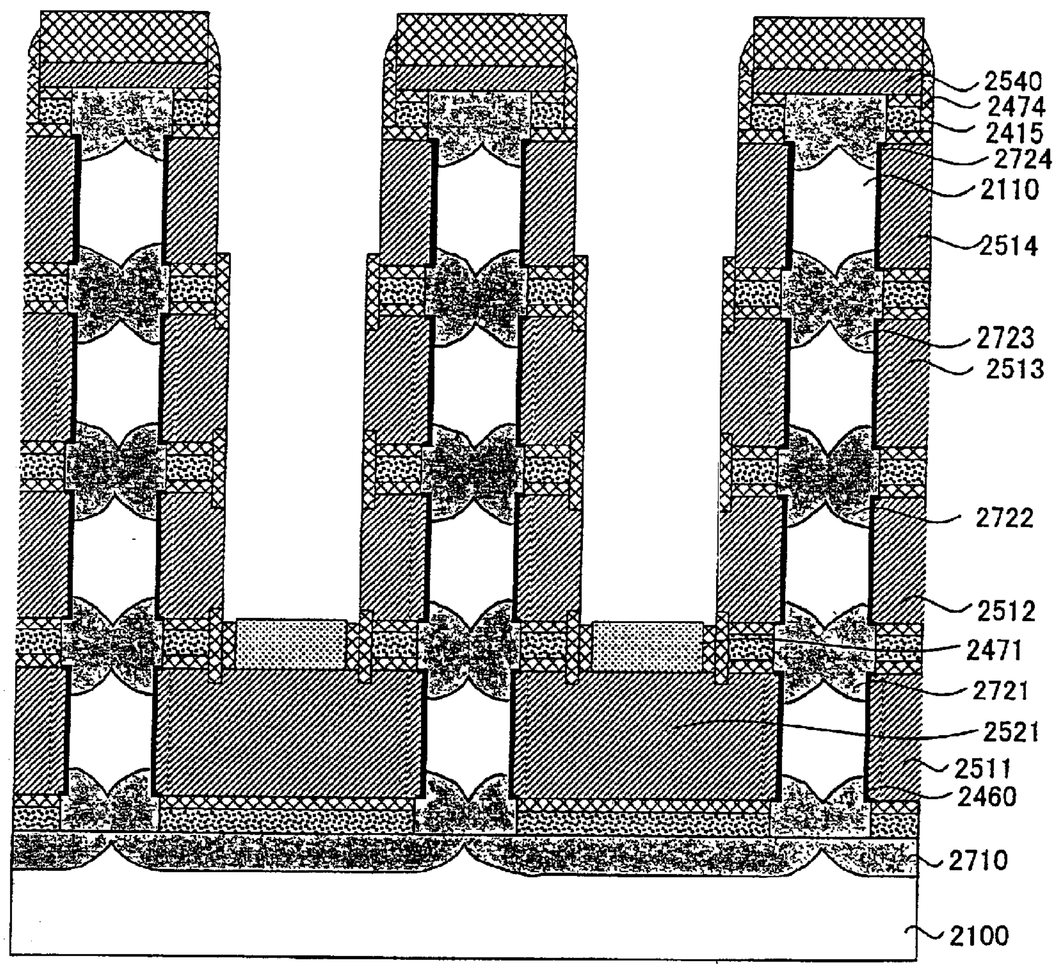
Figure 377:
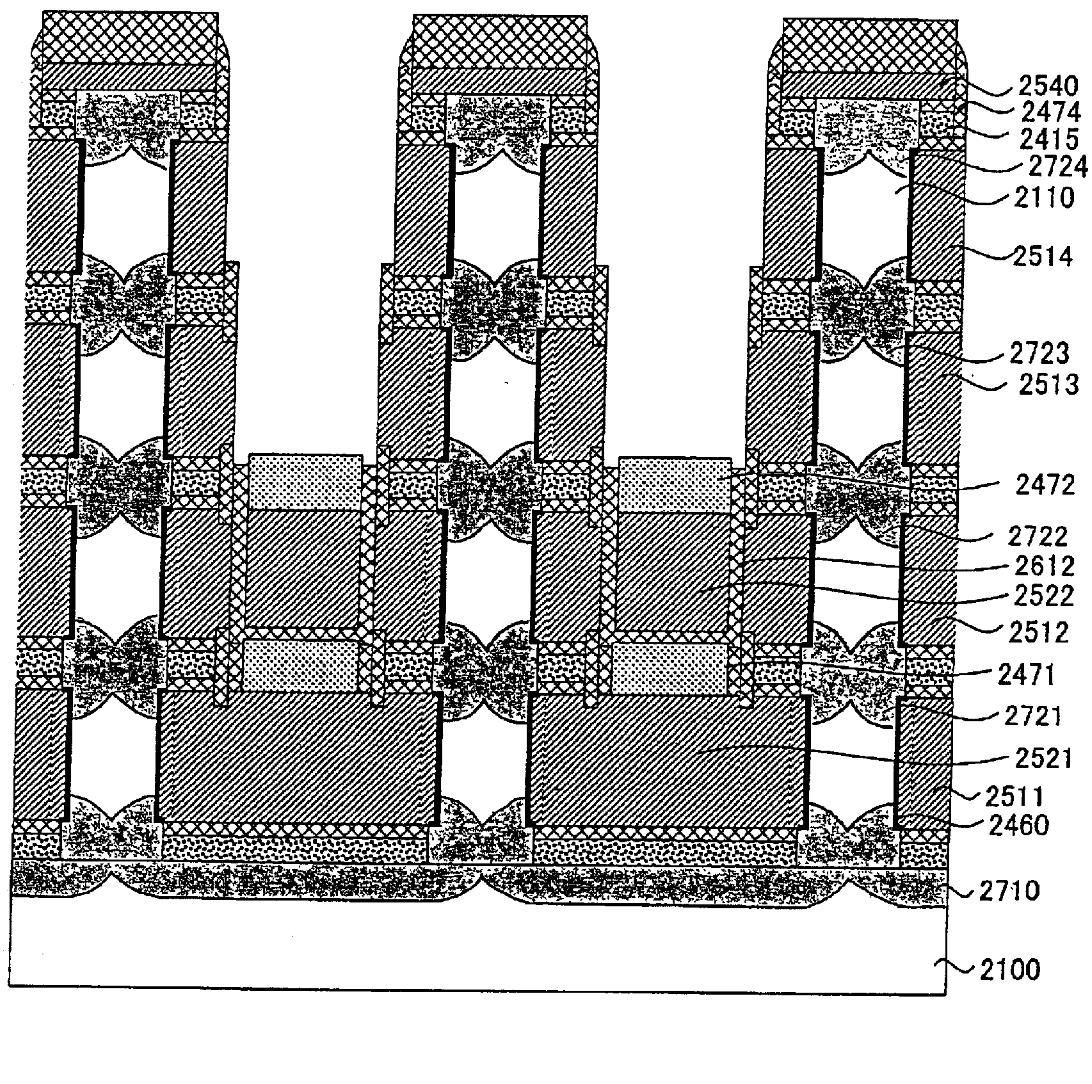
Figure 378:
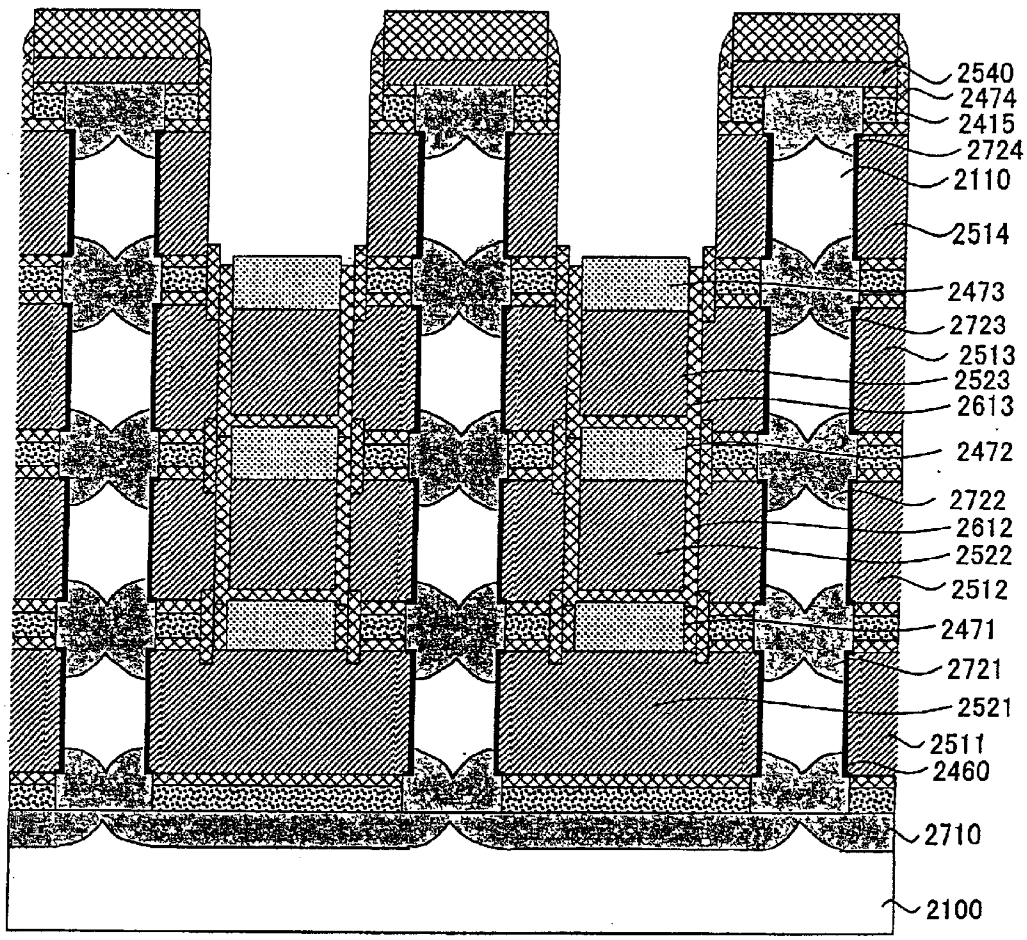

Then, the silicon nitride film 2330 (the fifth insulating film) and the silicon nitride film 2340 (the sixth insulating film) are removed by isotropic etching, for example, to expose the polysilicon film 2540 (FIGS. 334 and 367).

Figure 336:
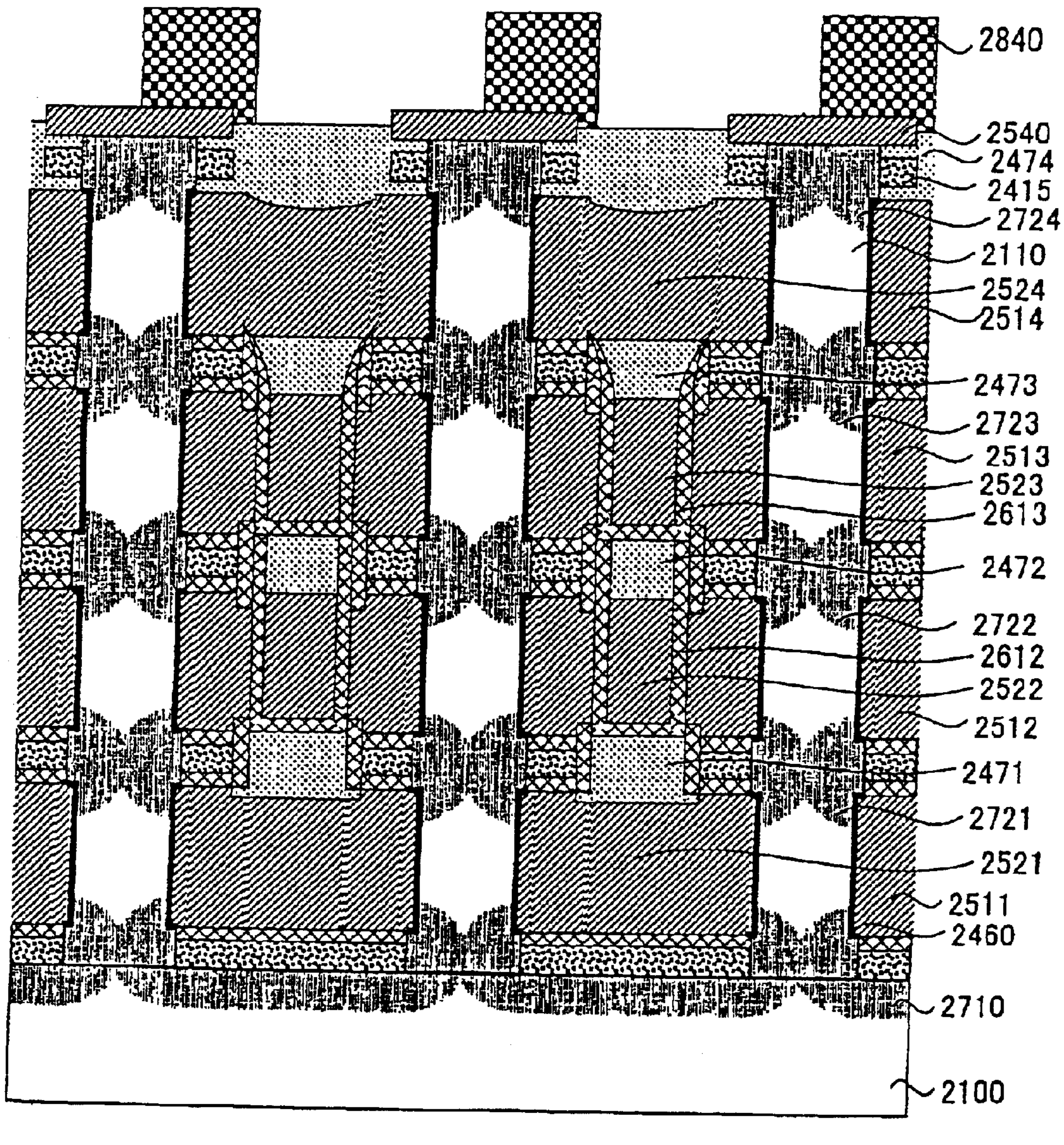
Figure 337:
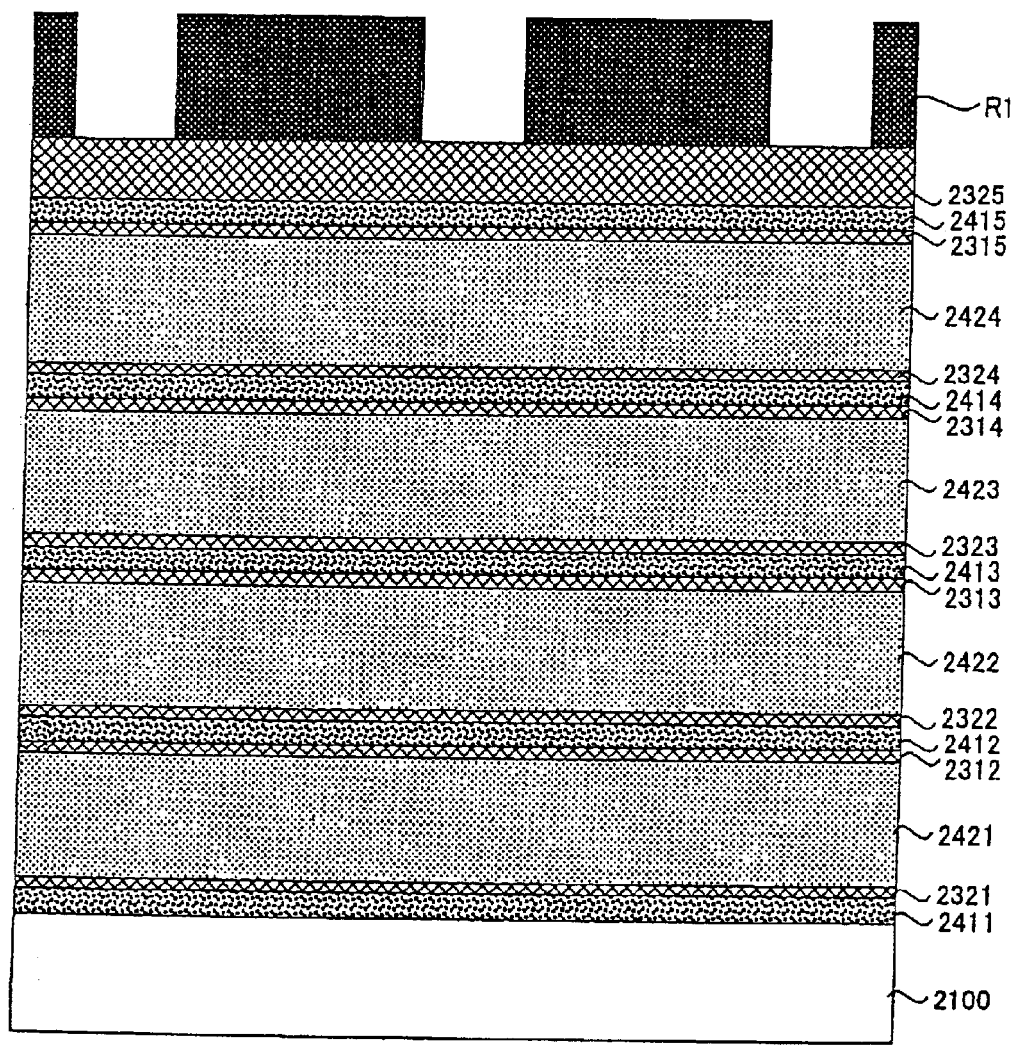

Subsequently, a silicon oxide film 2474 is deposited as an eleventh insulating film to a thickness of 100 to 500 nm on the top of the polysilicon film 2524. The top portion of the polysilicon film 2540 is exposed by etch-back or by CMP. A fourth wiring layer 2840 is formed so that its direction crosses the direction of the second or third wiring layer and is connected to the top portion of the island-like semiconductor layer 2110 (FIG. 335 and FIG. 367). FIG. 335 shows that the fourth wiring layer 2840 is placed on the polysilicon film 2540 without mis-alignment. However, even if mis-alignment occurs, the fourth wiring layer 2840 can be connected to the polysilicon film 2540 as shown in FIG. 336 (This is true of the following production examples).

Thereafter, by known techniques, an interlayer insulating film is formed, and a contact hole and metal wiring are formed. Thereby, a semiconductor memory is realized which has a memory function according to the state of a charge in the charge storage layer which is the floating gate made of the polysilicon film (the first conductive film).

In this example, films formed on the surface of the semiconductor substrate or the polysilicon film such as the silicon nitride film (the fifth insulating film) 2330, the silicon nitride film (the sixth insulating film) 2340 and the silicon nitride film (the twelfth insulating film) 2350 may be formed of a layered film of a silicon oxide film/a silicon nitride film from the silicon surface.

With regard to the polysilicon films 2510 or 2511 to 2514 (the first conductive films), the polysilicon films 2520 or 2521 to 2524 (the second conductive films) and the polysilicon film 2540 (the fourth conductive film), impurity introduction may be carried out during or after the formation of the polysilicon films or after the separation of the polysilicon films. The timing of the impurity introduction to the polysilicon films is not particularly limited so long as these films become conductive films.

In the example, the control gates of the memory cells are formed continuously in one direction without using a mask. That is possible only where the island-like semiconductor layers are not disposed symmetrically to a diagonal. More particularly, by setting smaller the intervals between adjacent island-like semiconductor layers in the direction of the second or third wiring layer than those in the direction of the fourth wiring layer, it is possible to obtain the wiring layers which are discontinuous in the direction of the fourth wiring layer and are continuous in the direction of the second or third wiring layer without using a mask. In contrast, if the island-like semiconductor layers are disposed symmetrically to a diagonal, for example, the wiring layers may be separated through patterning with use of resist films by photolithography.

PRODUCTION EXAMPLE 12

In contrast to Production example 1, this example shows an example of production process of a semiconductor memory in which the first, second and third wiring layers are separated through patterning with use of resist films by photolithography.

FIGS. 369 to 374 and 375 to 380 are sectional views taken on line A-A' and line B-B', respectively, in FIG. 1 which is a plan view illustrating an EEPROM memory cell array.

In this example, a separation portion of the first wiring layer is not formed in self-alignment with a separation portion of the polysilicon film 2521 (the second conductive film) by anisotropic etching. Further, the polysilicon films 2521 to 2524 (the second conductive films) are deposited to have such a thickness that they are spontaneously separated in a direction of B-B' in FIG. 1 and thus etching for the separation is not required.

This example is the same as Production example 11 (FIGS. 369 to 372 and FIGS. 375 to 378) before the silicon oxide film 2474 is deposited to a thickness of 100 to 500 nm on the top of the polysilicon film 2524 (FIGS. 304 to 335 and FIGS. 337 to 378).

Thereafter, using a resist film R4 patterned by a known photolithographic technique as a mask (FIGS. 373 and 379), anisotropic etching is performed to reach the P-type silicon substrate 2100, thereby separating the impurity diffusion layer 2710 and the polysilicon films 2521 to 2524 in a direction of B-B'.

Figure 379:
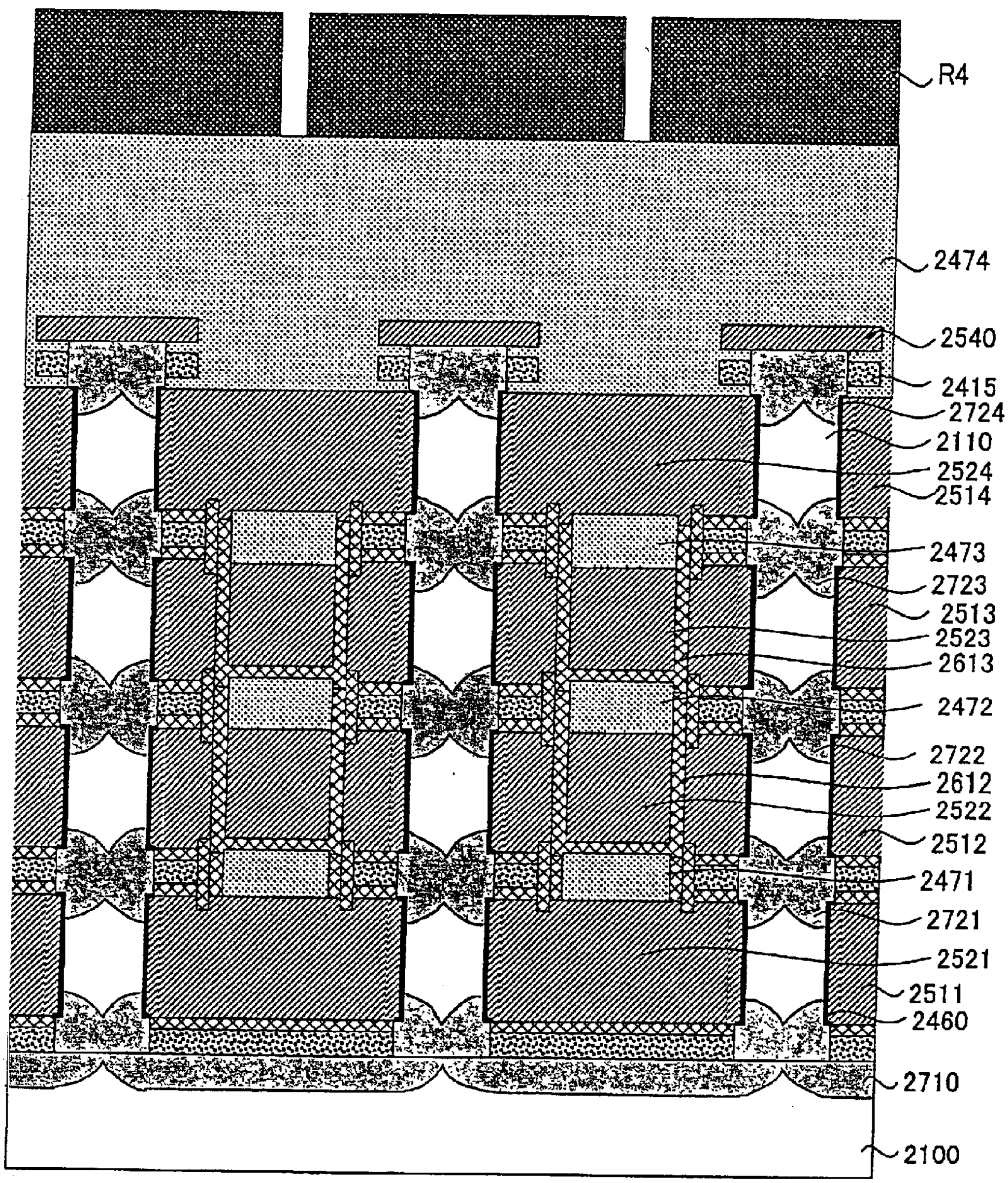
Figure 380:
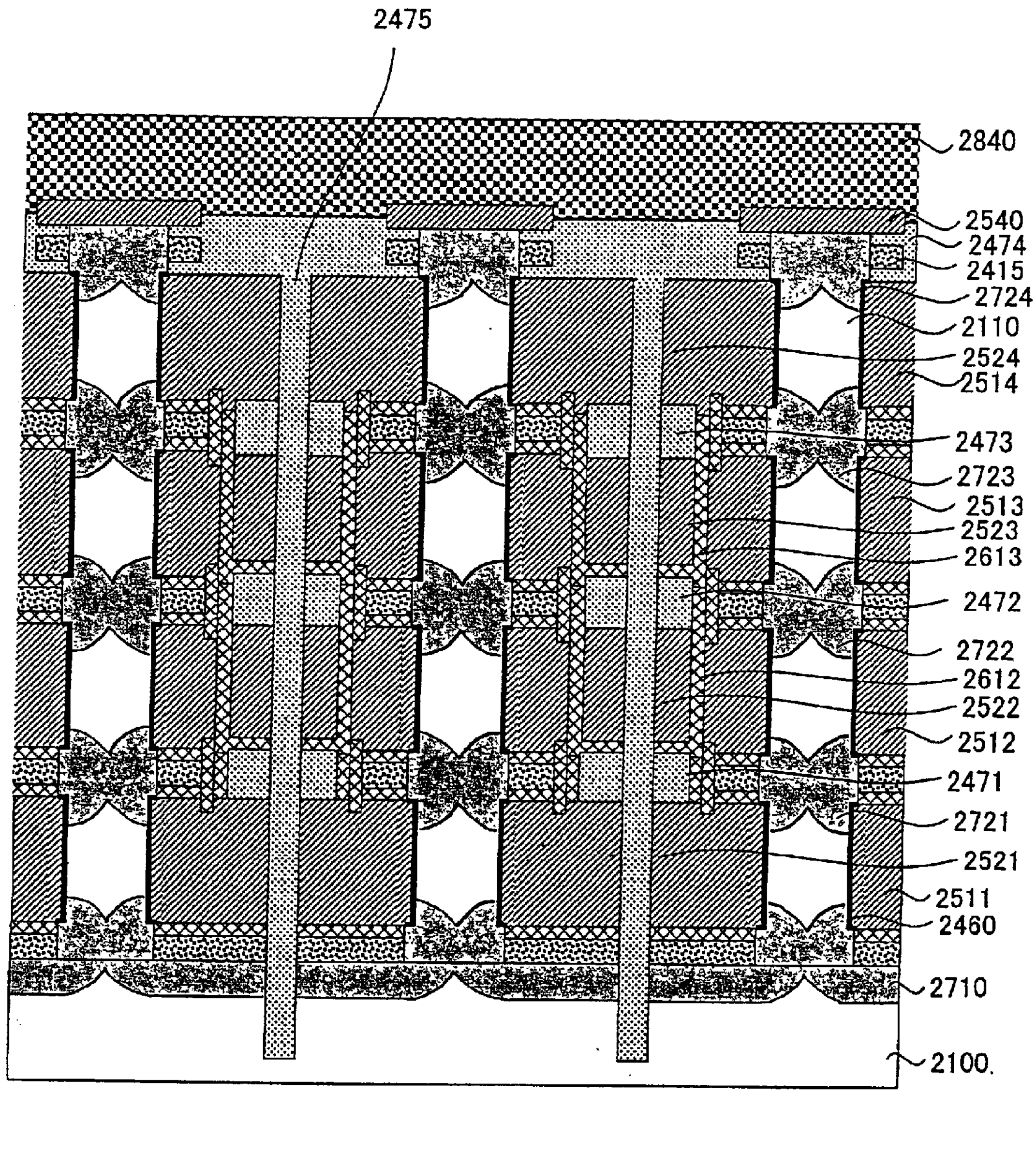

Then, a silicon oxide film 2475 is deposited as an eleventh insulating film and subjected to etch-back or CMP to expose the top portion of the polysilicon film 2540 (fourth conductive film). A fourth wiring layer 2840 is connected to the top of the island-like semiconductor layer 2110 in such a manner that its direction crosses the direction of the second or third wiring layer (FIG. 379 and FIG. 380).

Thereafter, by known techniques, an interlayer insulating film is formed, and a contact hole and metal wiring are formed. Thereby, a semiconductor memory is realized which has the same effect as obtained by Production Example 11.

Thus, by means of patterning with use of the resist films by photolithography, the first, second and third wiring layers are separated even in the case where the island-like semiconductor layers are disposed symmetrically to a diagonal.

By providing the selection gates in the top and the bottom of a set of memory cells, it is possible to prevent the phenomenon that a memory cell transistor is over-erased, i.e., a reading voltage is 0V and a threshold is negative, thereby the cell current flows even through a non-selected cell.

In Production examples 11 and 12, the third lattice-form trench 2230 is formed on the P-type semiconductor substrate. However, the third lattice-form trench 2230 may be formed in a P-type impurity diffusion layer formed in an N-type semiconductor substrate or in a P-type impurity diffusion layer formed in an N-type impurity diffusion layer formed in a P-type semiconductor substrate. The conductivity types of the impurity diffusion layers may be reversed. This production example is applicable to the following various production examples.

PRODUCTION EXAMPLE 13

In a semiconductor memory to be produced in this example, regions for forming charge storage layers are defined in advance by a laminated film comprising plural films, and then island-like semiconductor layers in a pillar form are formed by selective epitaxial silicon growth in trenches opened by using a photoresist mask. Tunnel oxide films and floating gates as charge storage layers are formed on the sides of the island-like semiconductor layers in the regions for forming the charge storage layers. The island-like semiconductor layers are each in an electrically floating state with respect to the semiconductor substrate. The active regions of the memory cells are electrically common.

In the semiconductor memory, selection gate transistors are disposed at the top and the bottom of the island-like semiconductor layer. A plurality of memory transistors, for example, two memory transistors, are placed between the selection gate transistors. The tunnel oxide film and the floating gate of the transistors are formed at the same time. The transistors are connected in series along the island-like semiconductor layer. Further, the thickness of gate insulating films of the selection gate transistors is equal to the thickness of gate insulating films of the memory transistors.

FIGS. 381 to 402 and FIGS. 403 to 424 are sectional views taken on line A-A' and line B-B', respectively, in FIG. 1 which is a plan view illustrating an EEPROM memory cell array.

First, on a surface of a P-type silicon substrate 2100, a silicon oxide film 2411 containing arsenic impurities of about $1\times10^{18}$ to $1\times10^{22}/cm^2$, for example, is deposited as a first insulating film to a thickness of 50 to 500 nm by CVD. At this time, ion implantation may be carried out to introduce the impurities to the insulating film deposited by CVD. For example, to the silicon oxide film 2411 deposited to a thickness of 50 to 500 nm, ion implantation may be carried out at an implantation energy of 5 to 100 keV at an arsenic dose of about $1\times10^{14}$ to $1\times10^{16}/cm^2$ at an angle of about 0 to 45° with respect to the normal line of the surface of the substrate. The impurity introduction to the silicon oxide film 2411 by ion implantation may not necessarily be carried out immediately after the deposition of the silicon oxide film 2411. Regarding the ion implantation to the silicon oxide film 2411, the angle for the implantation is not particularly limited as long as a desired impurity concentration is obtained. Means for the impurity introduction to the silicon oxide film 2411 is not limited to the ion implantation, but any means such as solid vapor phase diffusion may be used. Thereafter, a silicon nitride film 2321, for example, is deposited as a fourth insulating film to a thickness of 10 to 100 nm. If the above-mentioned impurity introduction to the silicon oxide film 2411 is carried out by ion implantation, the impurities may be introduced by ion implantation through the silicon nitride film 2321 into the silicon oxide film 2411.

Figure 381:
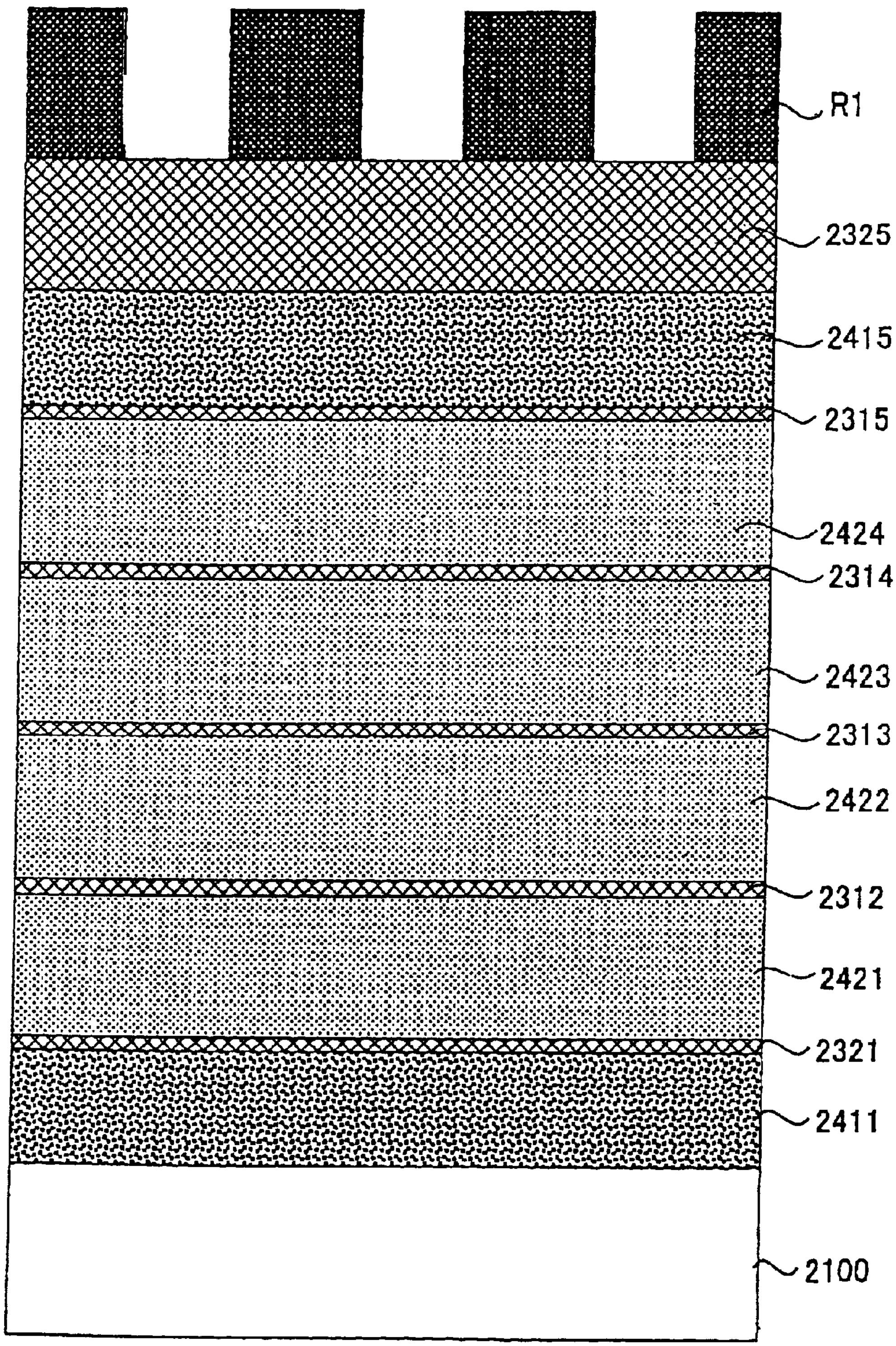
Figure 403:
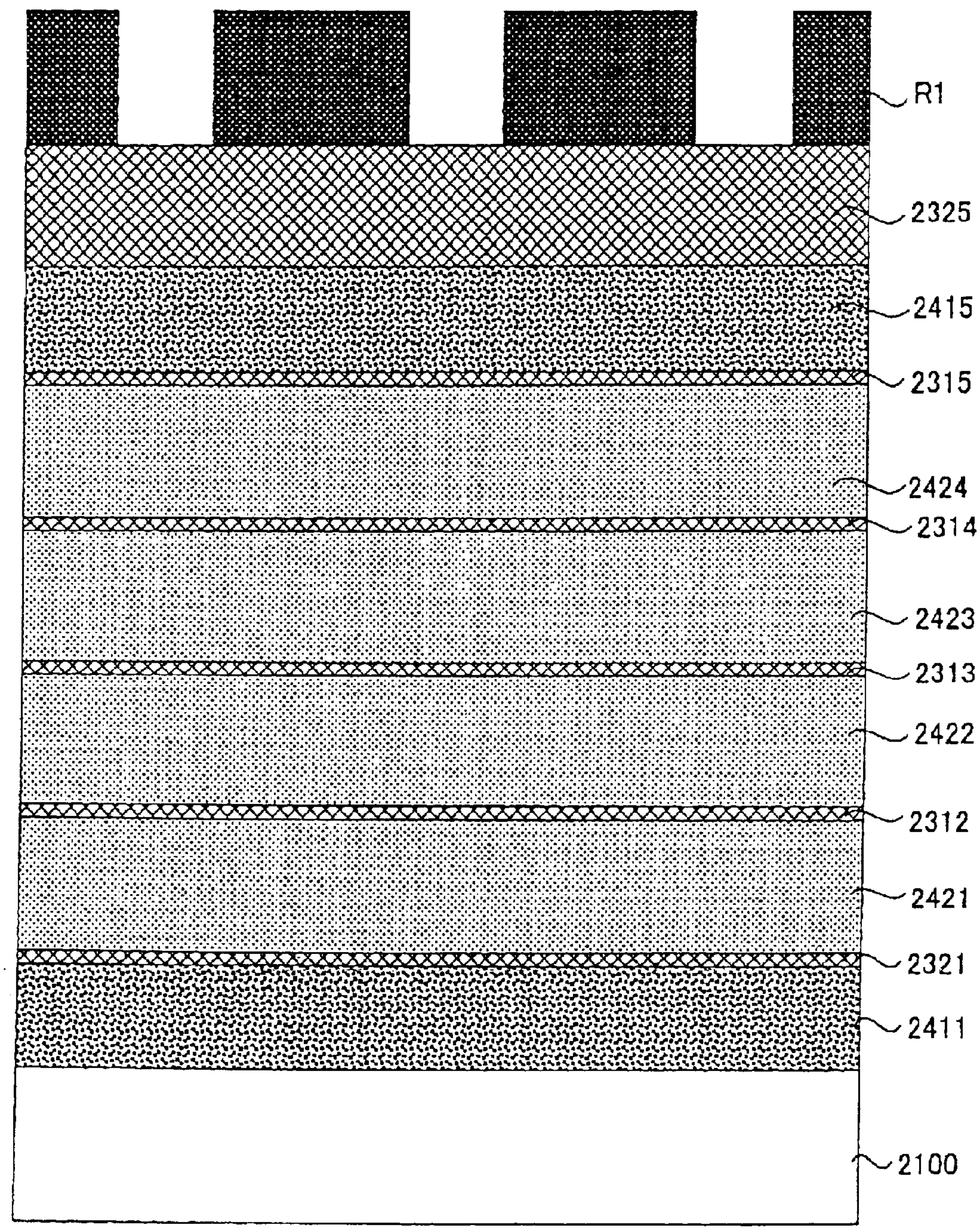

Then, a silicon oxide film 2421, for example, is deposited as a third insulating film to a thickness of 50 to 500 nm, a silicon nitride film 2312, for example, is deposited as a second insulating film to a thickness of 10 to 100 nm and a silicon oxide film 2412 is deposited as a first insulating film to a thickness of 50 to 500 nm. After the films are thus formed sequentially, a silicon oxide film 2415, for example, is deposited as a first insulating film to a thickness of 50 to 500 nm and a silicon nitride film 2325 is deposited as a fourth insulating film to a thickness of 500 to 5,000 nm as shown in FIGS. 381 and 403.

Figure 382:
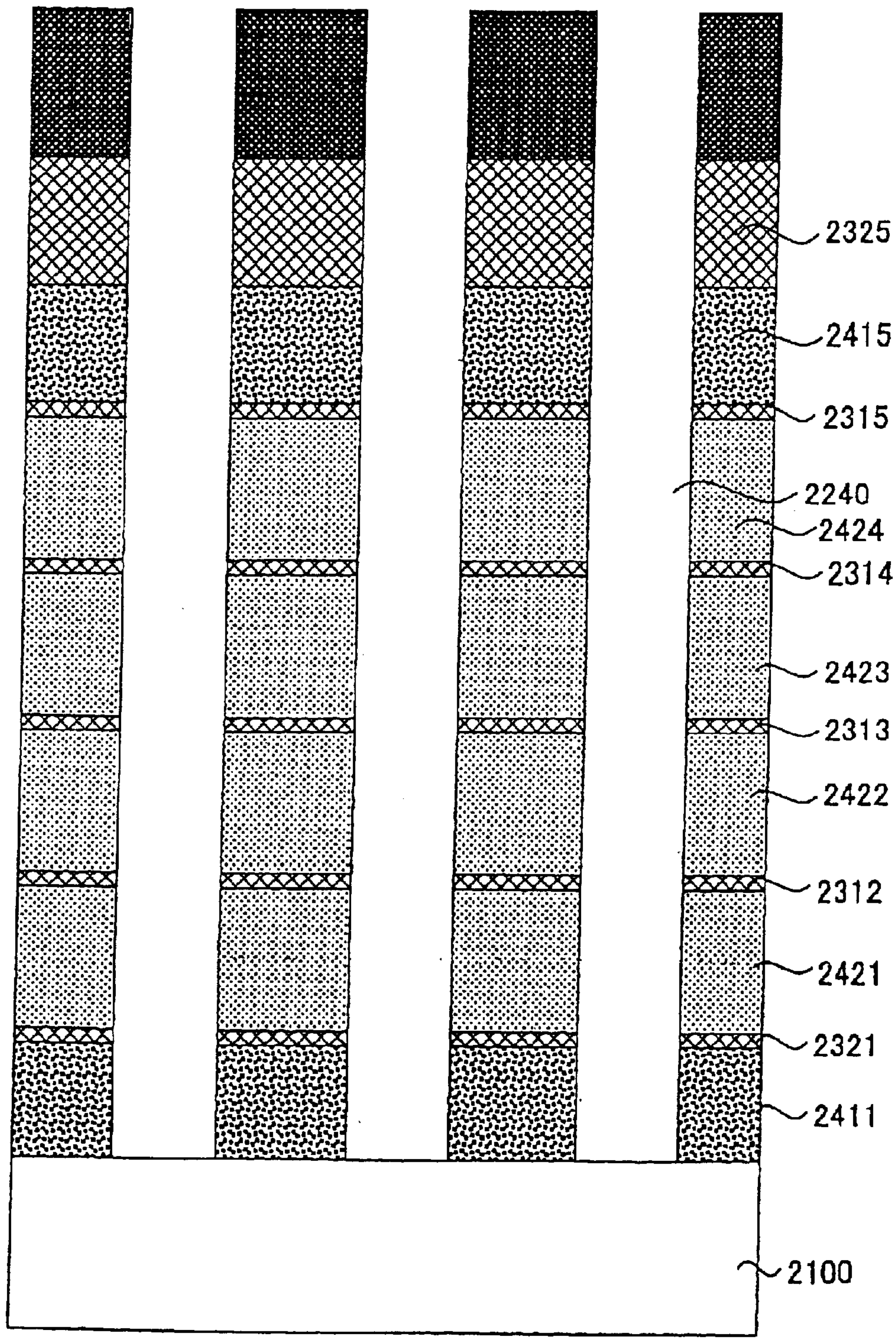
Figure 404:
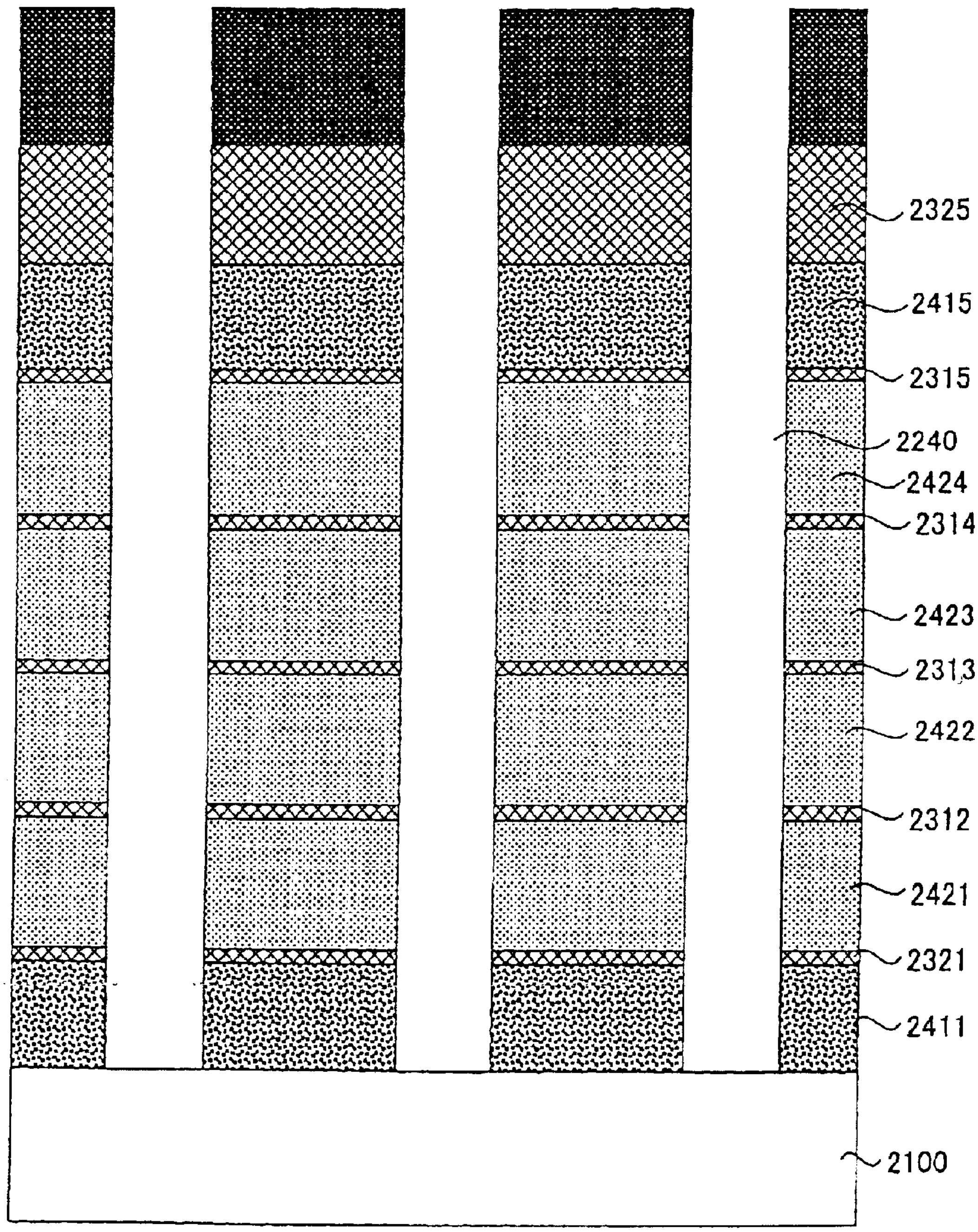

Subsequently, using a resist film R1 patterned by a known photolithographic technique as a mask (FIGS. 381 and 403), reactive ion etching, for example, is performed to successively etch the silicon nitride film 2325, the silicon oxide film 2415, the silicon nitride film 2315, the silicon oxide film 2424, the silicon nitride film 2314, the silicon oxide film 2423, the silicon nitride film 2313, the silicon oxide film 2422, the silicon nitride film 2312, the silicon oxide film 2421, the silicon nitride film 2321 and the silicon oxide film 2411, thereby forming a fourth trench 2240 (FIGS. 382 and 404).

Figure 383:
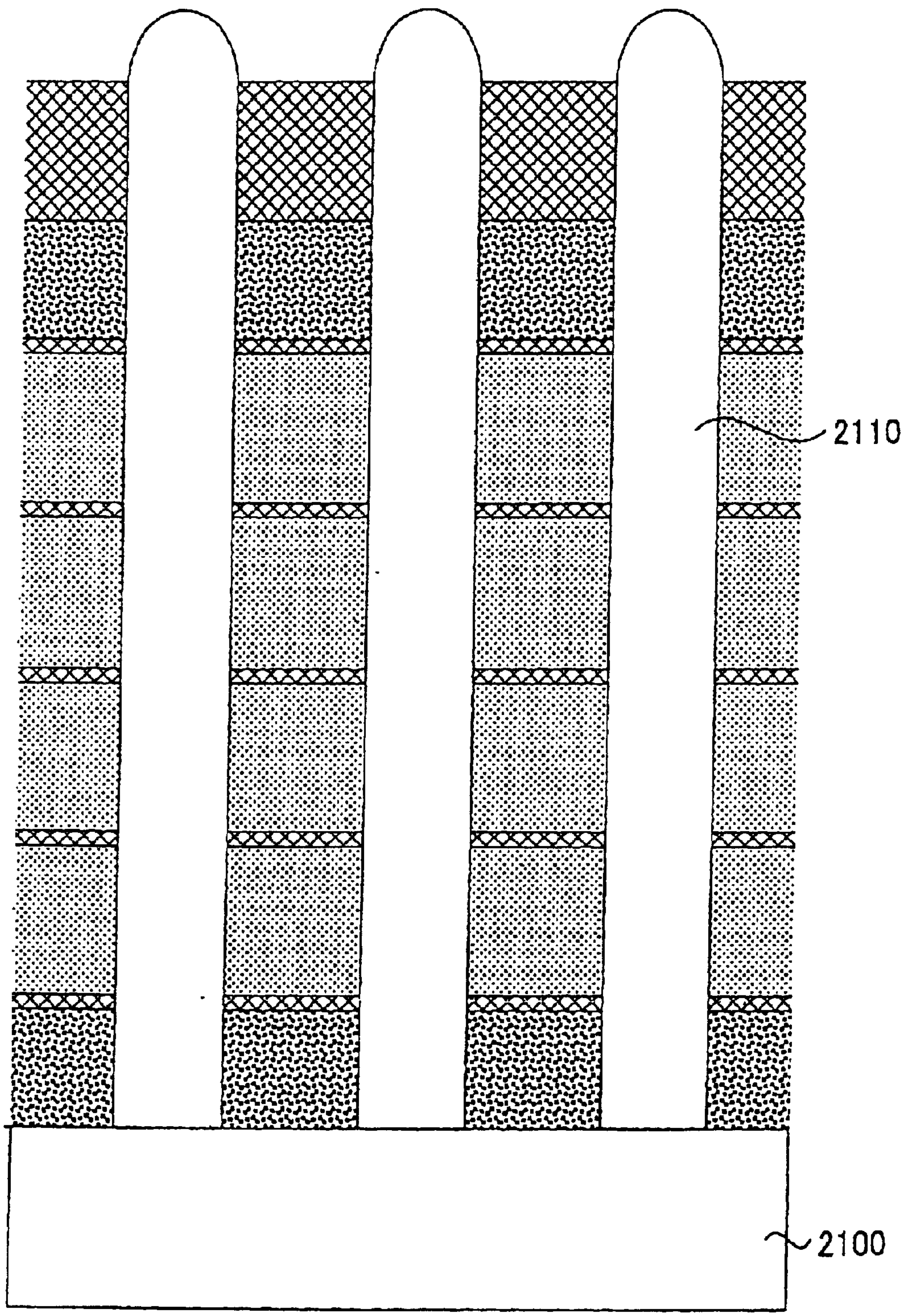
Figure 405:
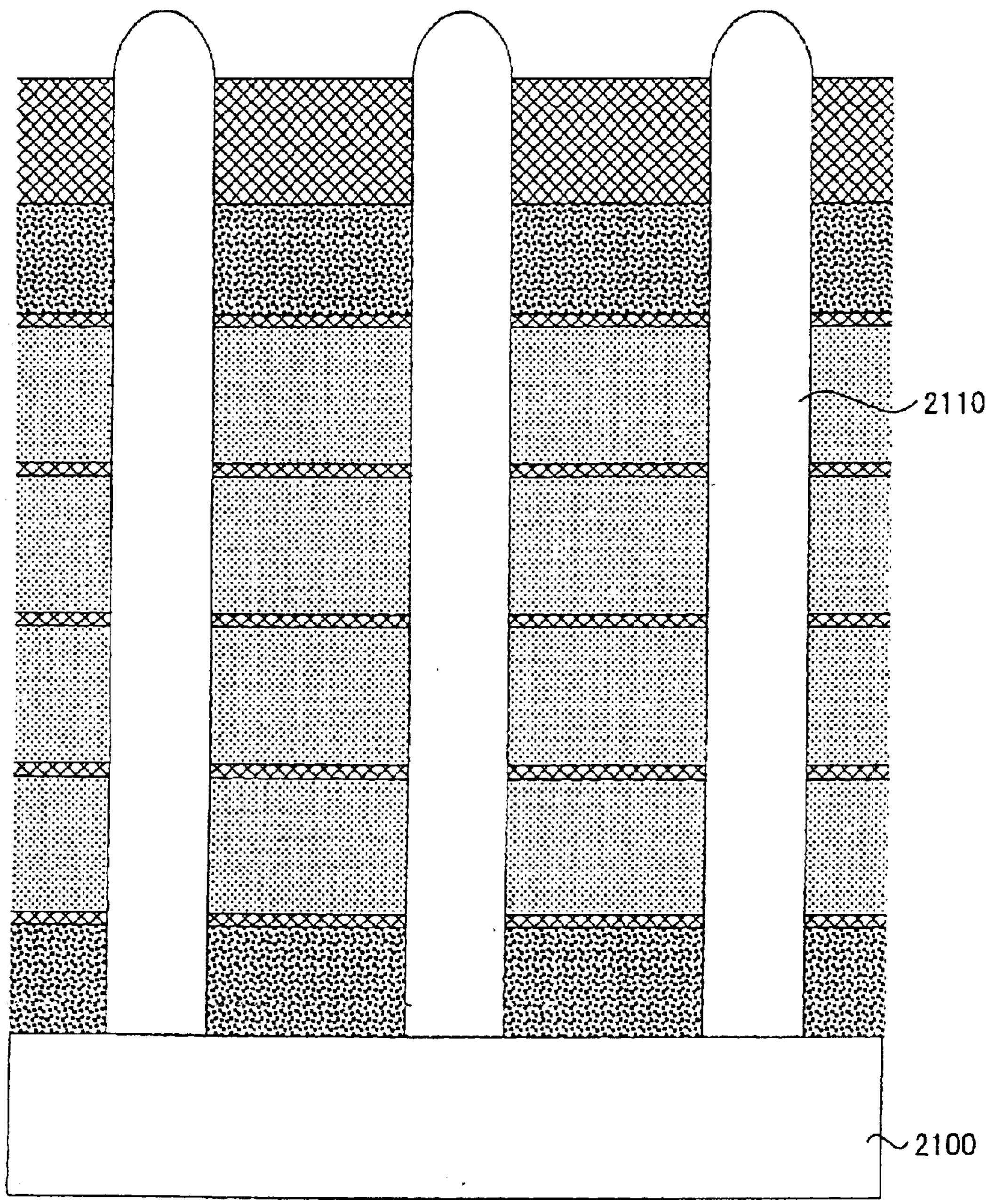

The resist film R1 is removed and then island-like semiconductor layers 2110 are filled in the fourth trench 2240. For example, the island-like semiconductor layers 2110 are formed by selective epitaxial growth from the P-type silicon substrate 2100 located at the bottom of the fourth trench 2240 (FIGS. 383 and 405).

Figure 384:
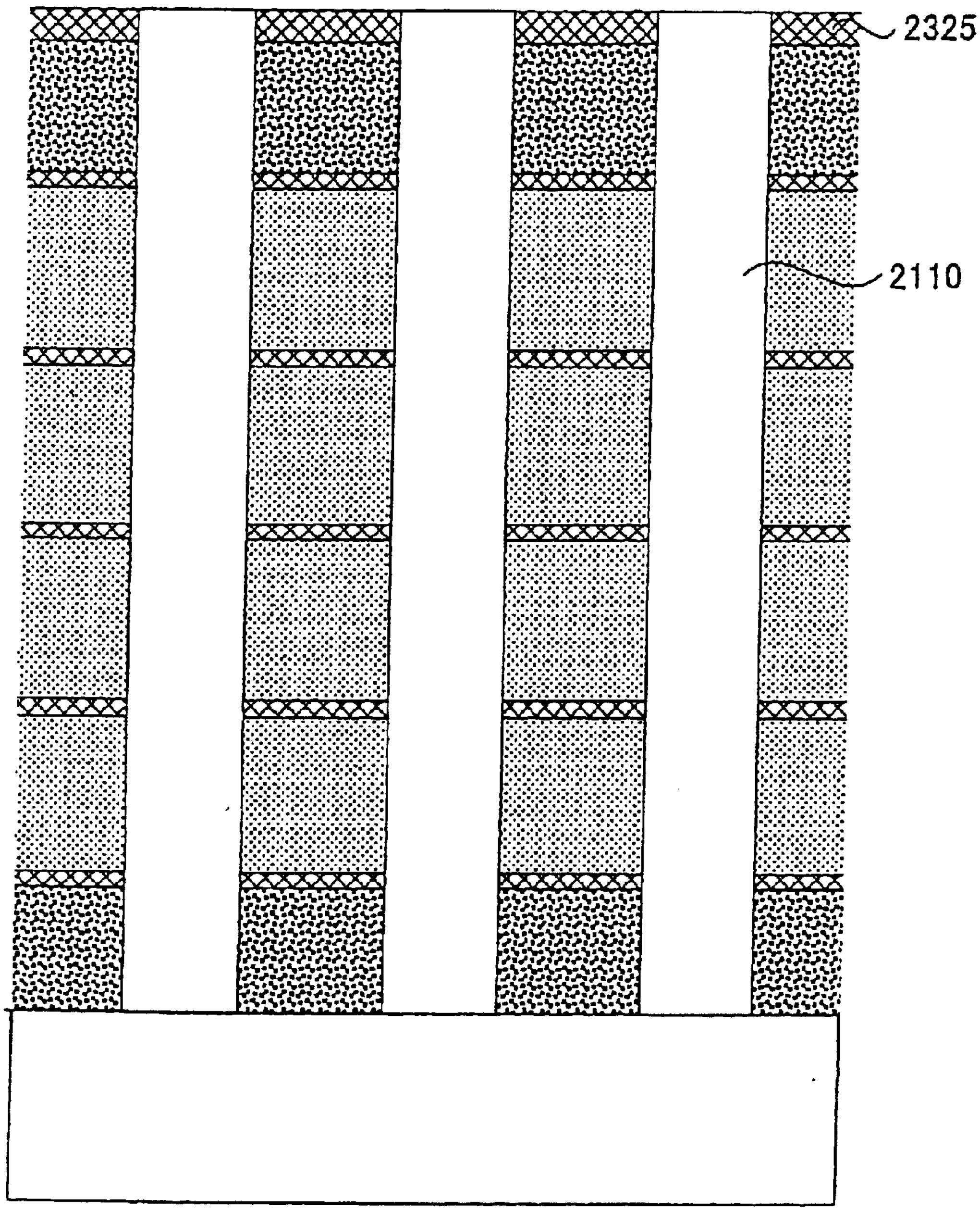
Figure 385:
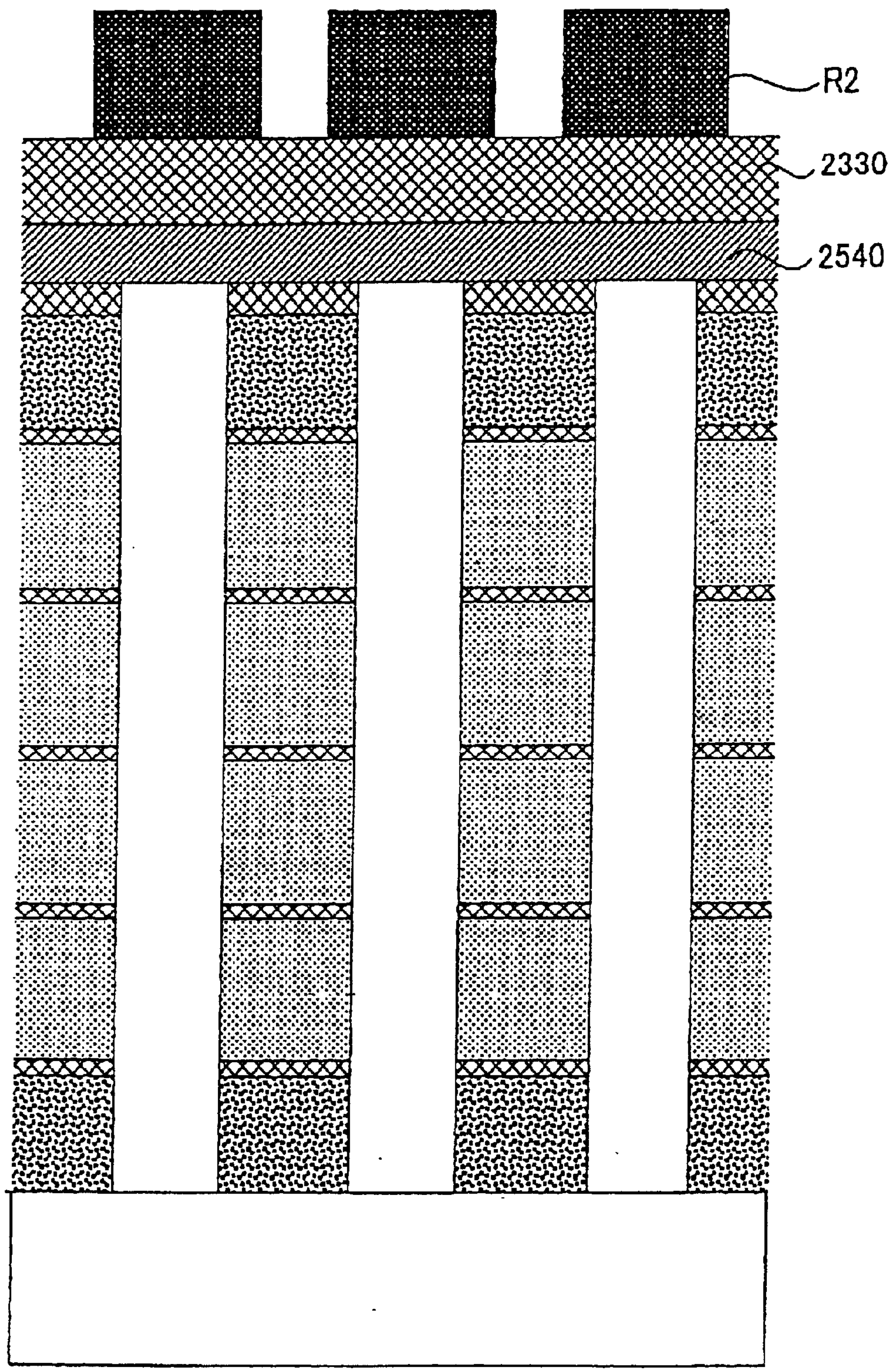
Figure 386:
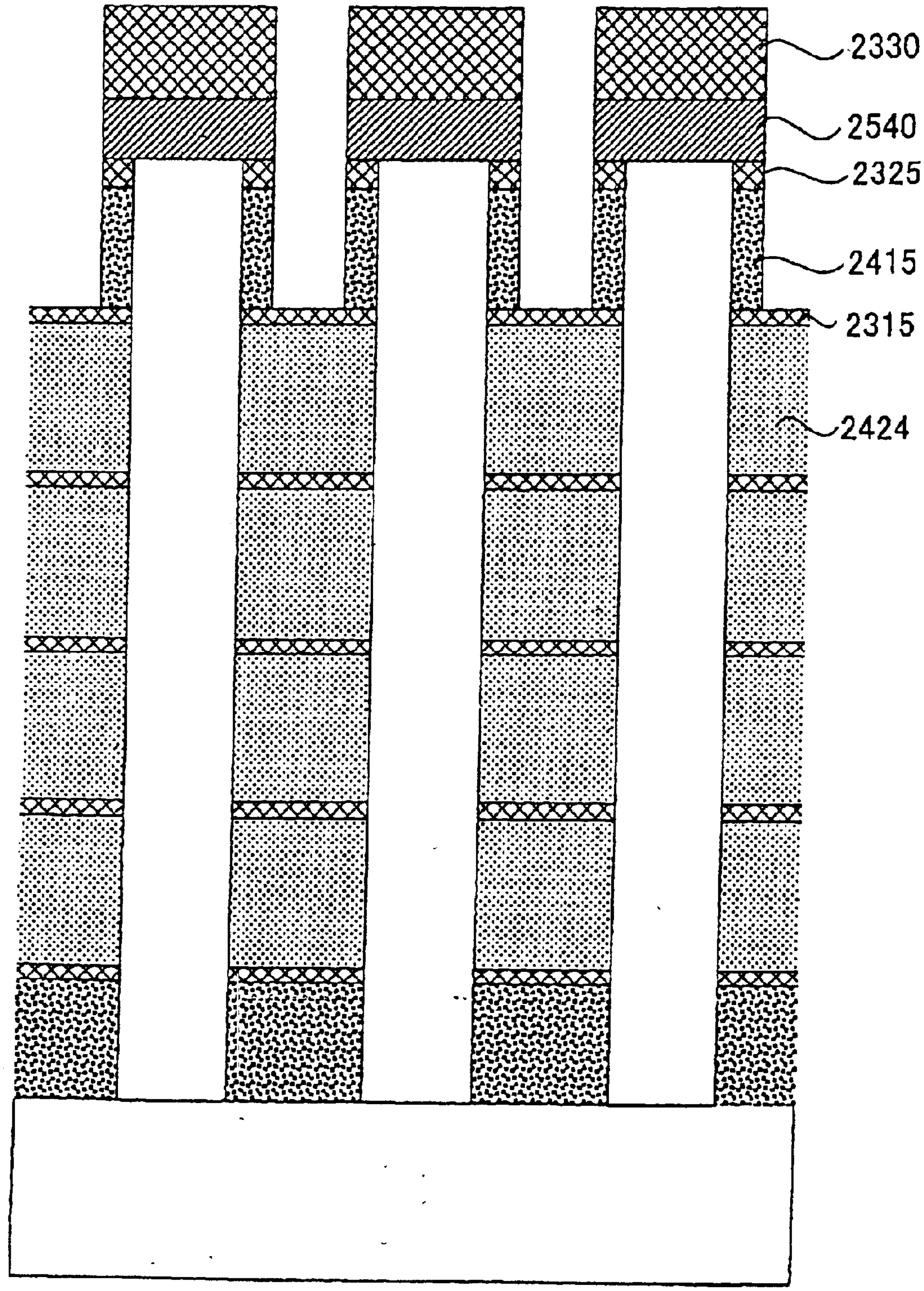
Figure 406:
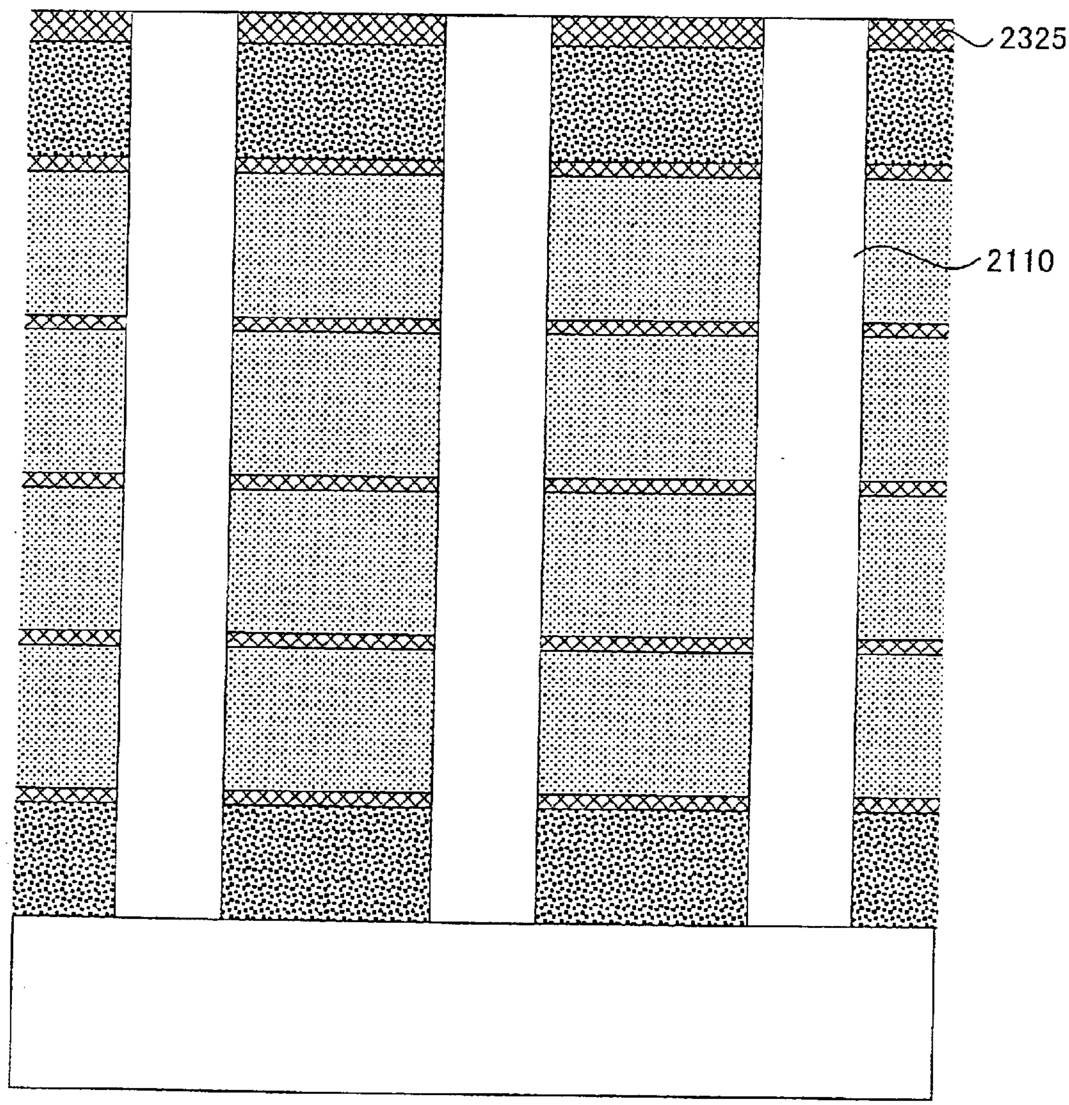
Figure 407:
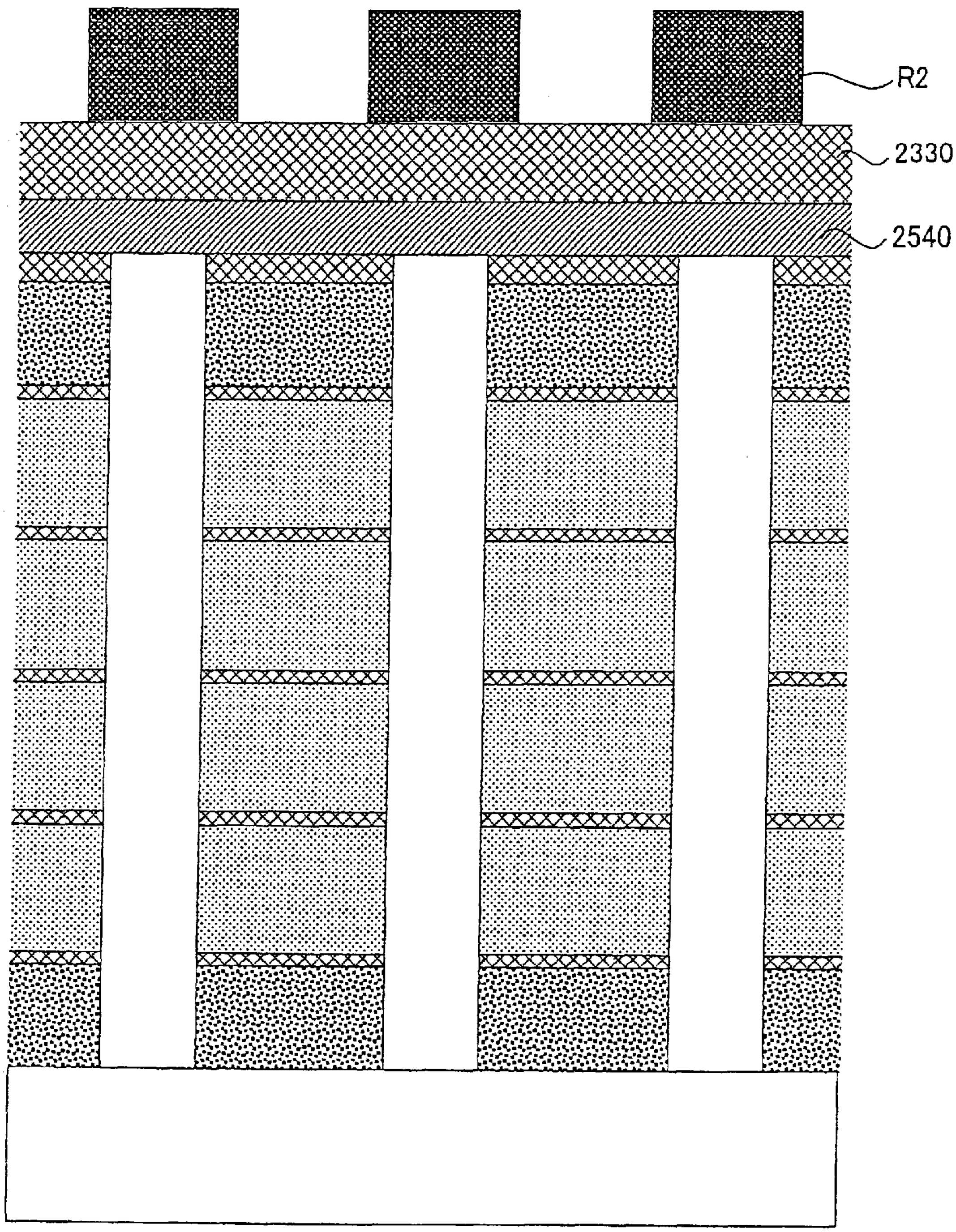
Figure 408:
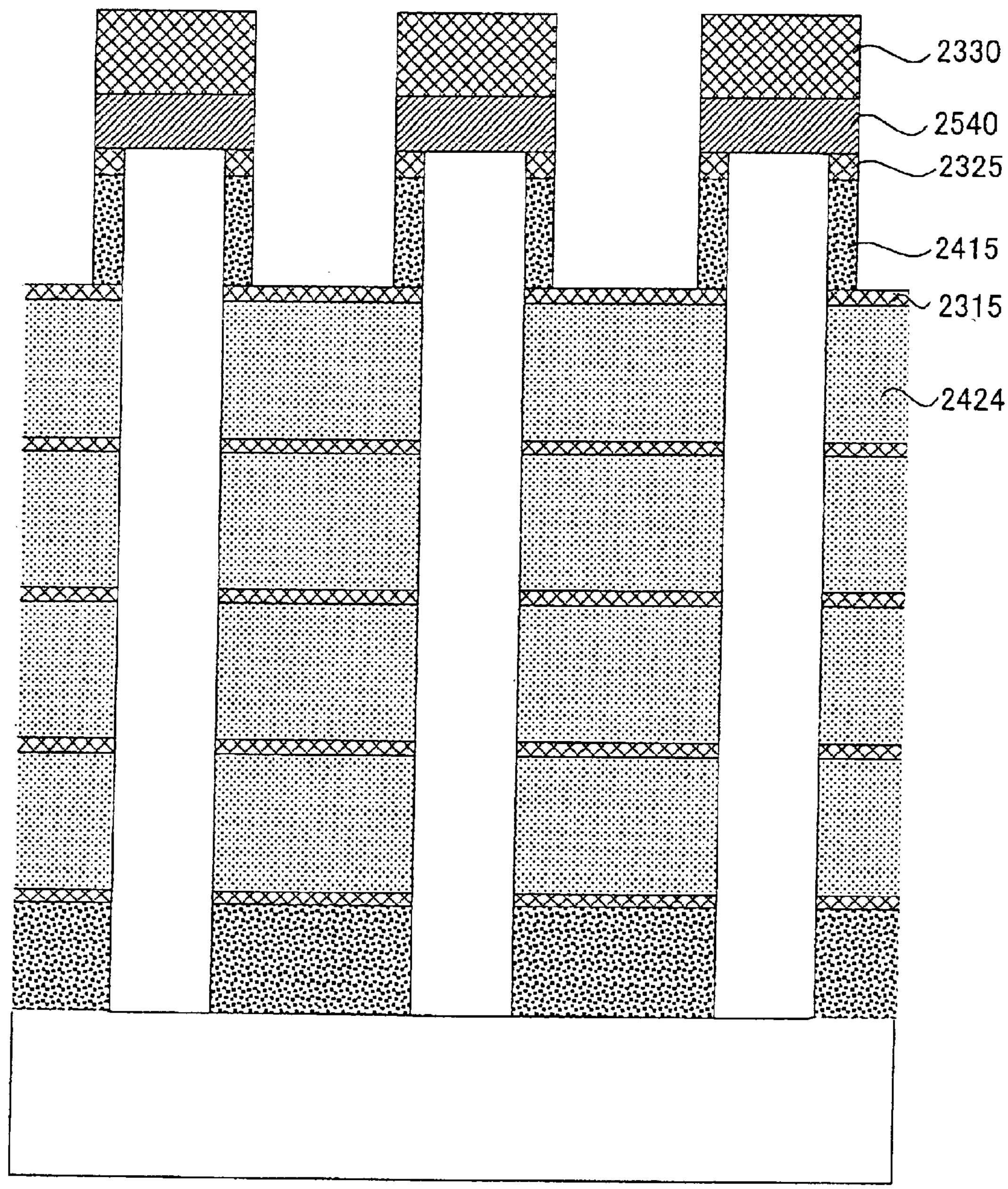
Figure 409:
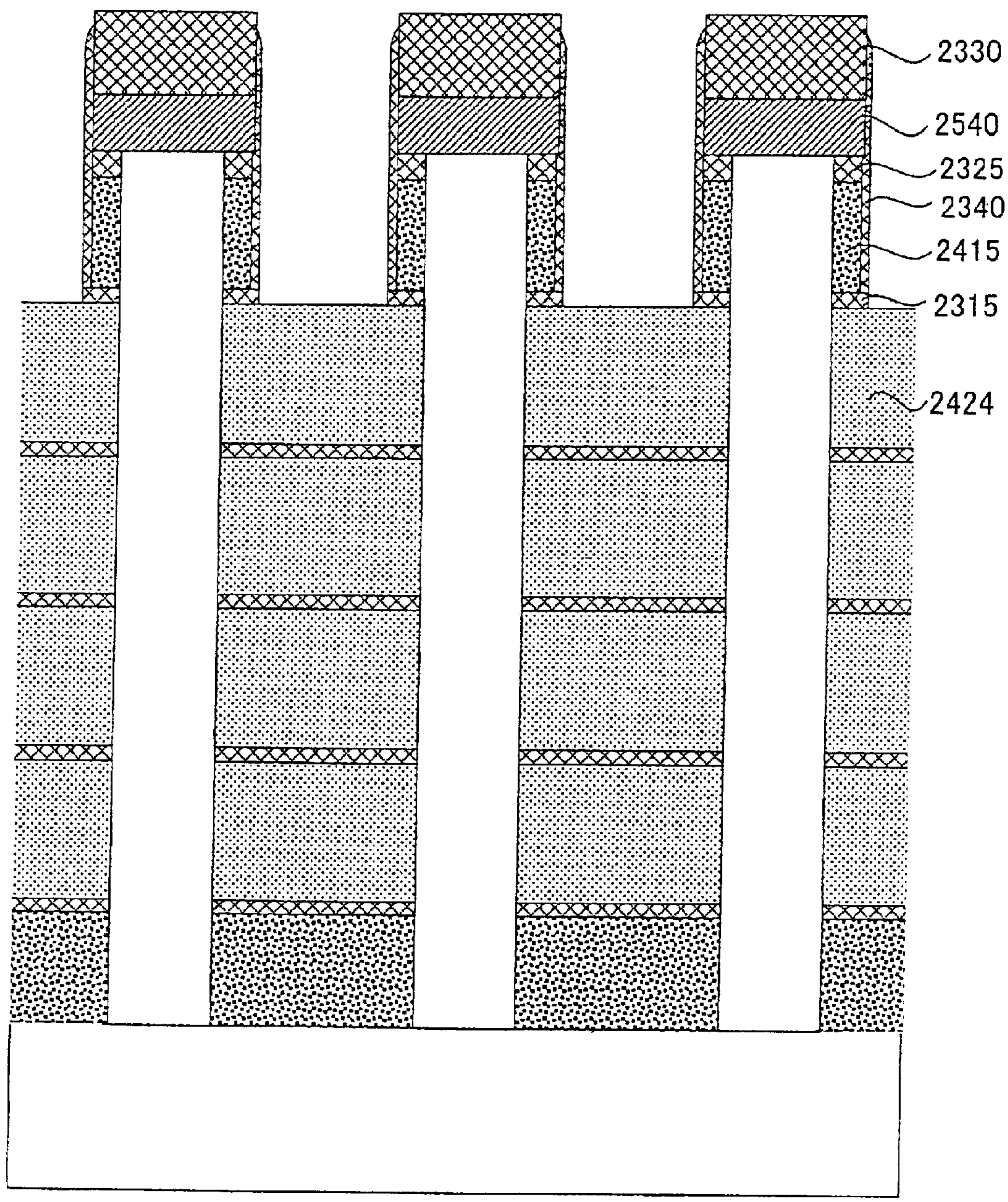

The thus formed island-like semiconductor layers 2110 are flattened to be flush with the silicon nitride film 2325 (FIGS. 384 and 406). The flattening may be carried out by isotropic or anisotropic etch-back, CMP, or a combination in various ways. Thereafter, a polysilicon film 2540, for example, is deposited as a fourth conductive film to a thickness of about 100 to 300 nm and a silicon nitride film 2330 is deposited as a fifth insulating film to a thickness of about 200 to 2,000 nm.

Then, using a resist film R2 patterned by a known photolithographic technique as a mask (FIGS. 385 and 407), reactive ion etching, for example, is performed to successively etch the silicon nitride film 2330, the polysilicon film 2540, the silicon nitride film 2325 and the silicon oxide film 2415, thereby exposing the silicon nitride film 2315 (the second insulating film). At this time, the silicon nitride film 2315 may be etched until the silicon oxide film 2424 (the third insulating film) is exposed.

Figure 387:
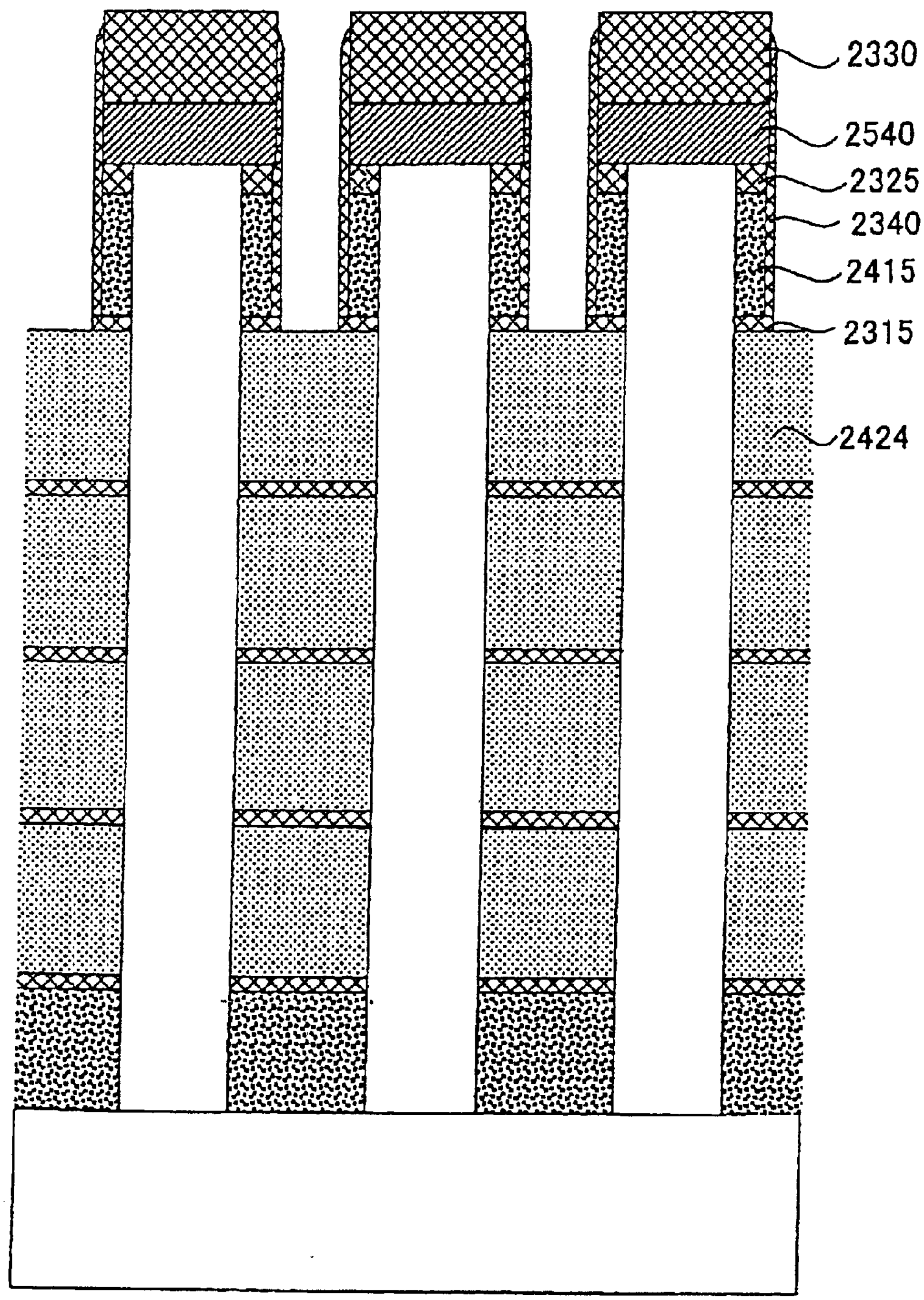

After the resist film R2 is removed (FIGS. 386 and 408), a silicon nitride film 2340 is deposited as a sixth insulating film to a thickness of about 5 to 50 nm. Then, the silicon nitride film 2340 is etched by anisotropic etching, for example, to remain in the form of a sidewall spacer on the sidewalls of the silicon nitride film 2330, the polysilicon film 2540, the silicon nitride film 2325 and the silicon oxide film 2415 (FIGS. 387 and 309). At this time, the silicon oxide film 2415 containing the impurities (the first insulating film) is isolated from other films than the island-like semiconductor layer 2110 by the silicon nitride film 2325 (the fourth insulating film), the silicon nitride film 2315 (the second insulating film) and the silicon nitride film 2340 (the sixth insulating film).

Figure 388:
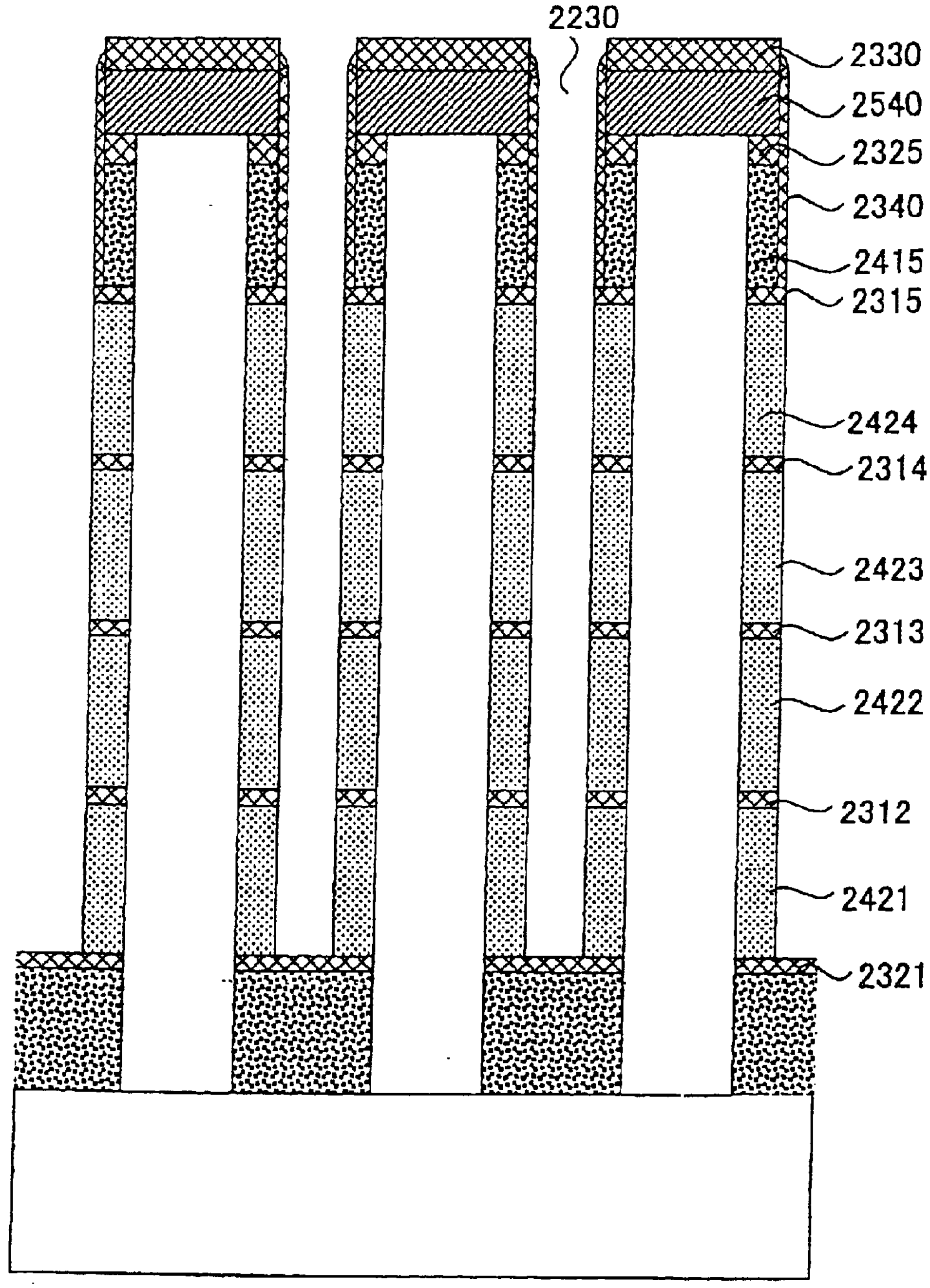
Figure 410:
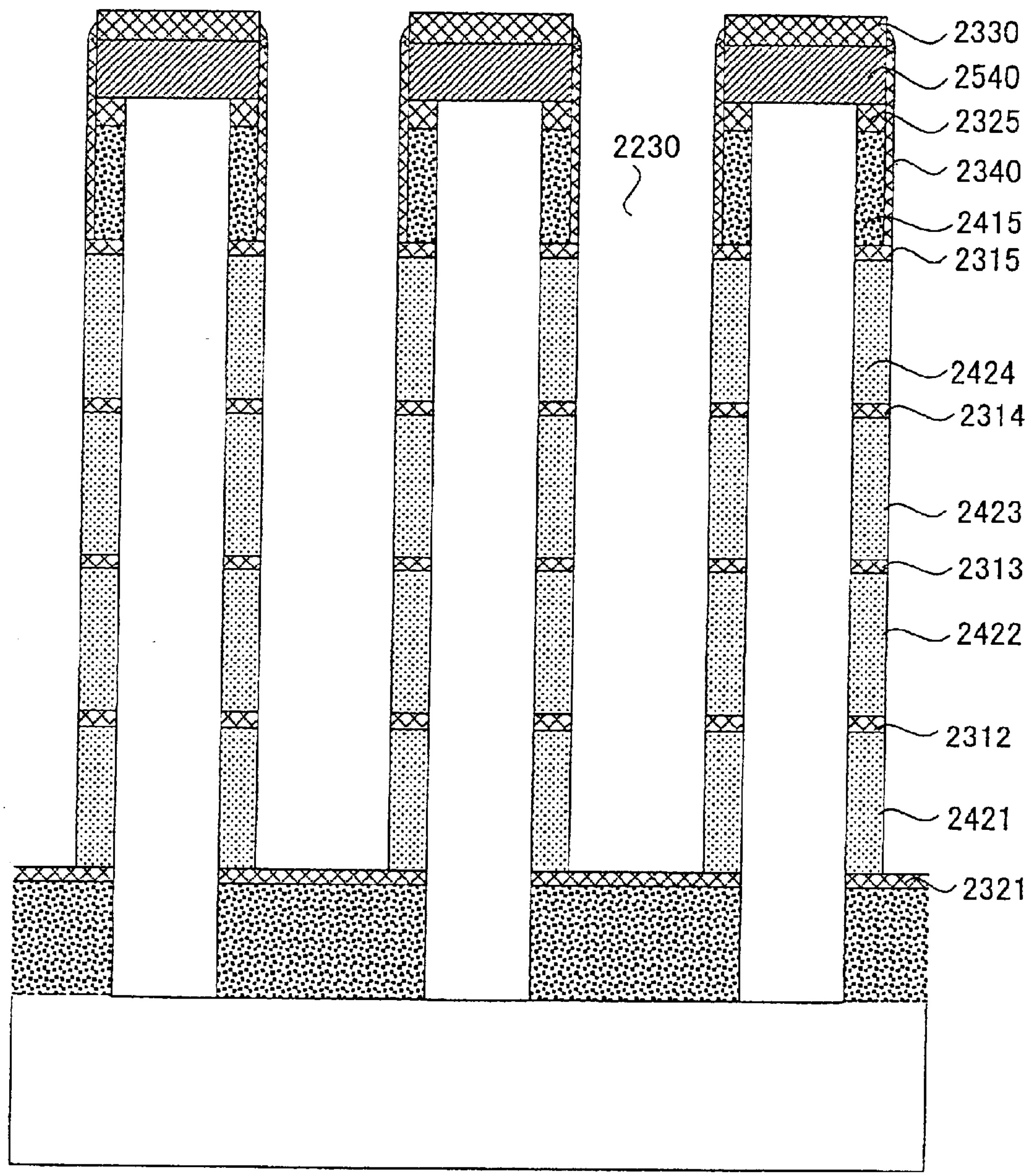

Then, using the silicon nitride films 2330 and 2340 as a mask, successively etched are the silicon nitride film 2315, the silicon oxide film 2424, the silicon nitride film 2314, the silicon oxide film 2423, the silicon nitride film 2313, the silicon oxide film 2422, the silicon nitride film 2312 and the silicon oxide film 2421, thereby exposing the silicon nitride film 2321. Thus, a third trench 2230 is formed (FIGS. 388 and 410).

Figure 389:
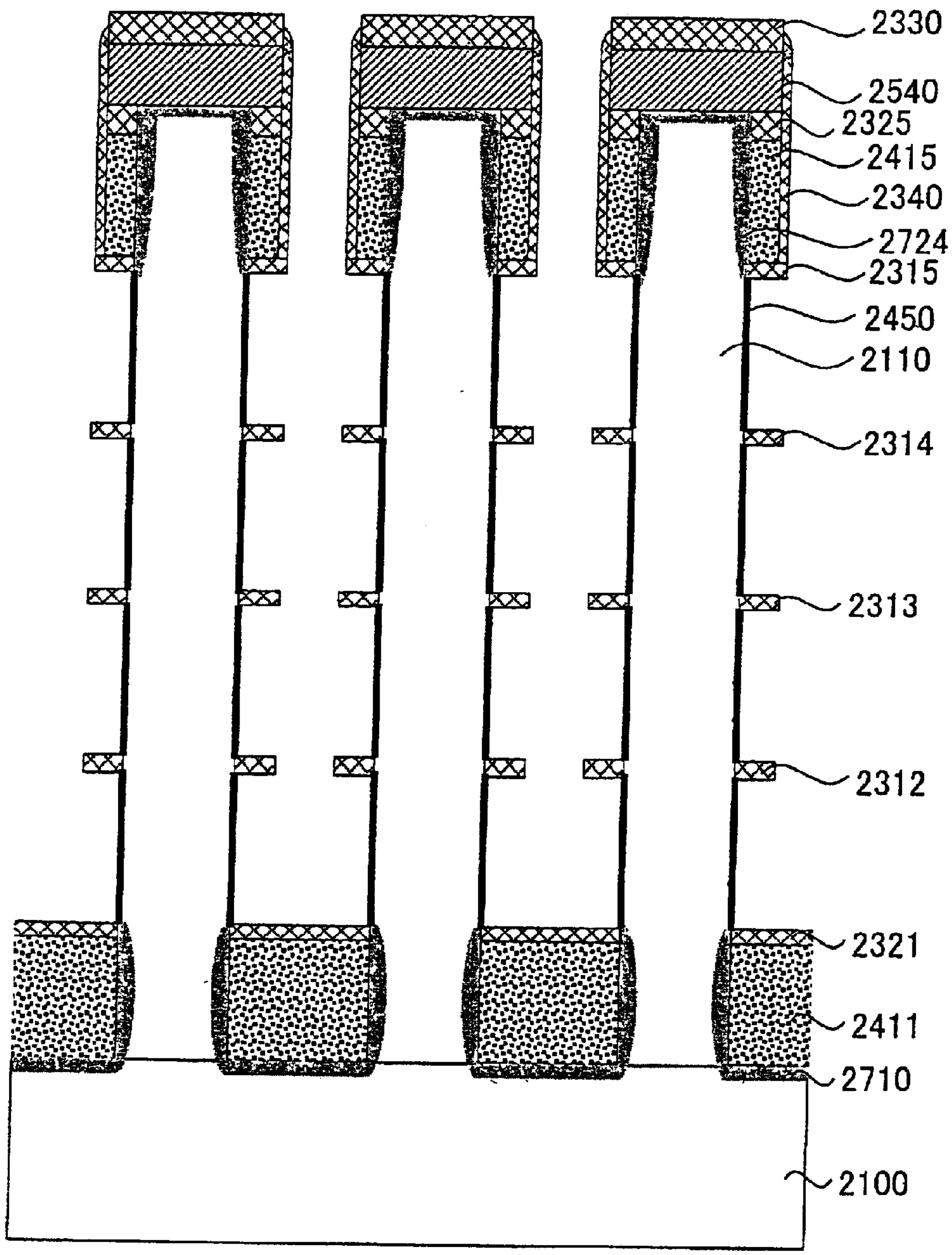
Figure 411:
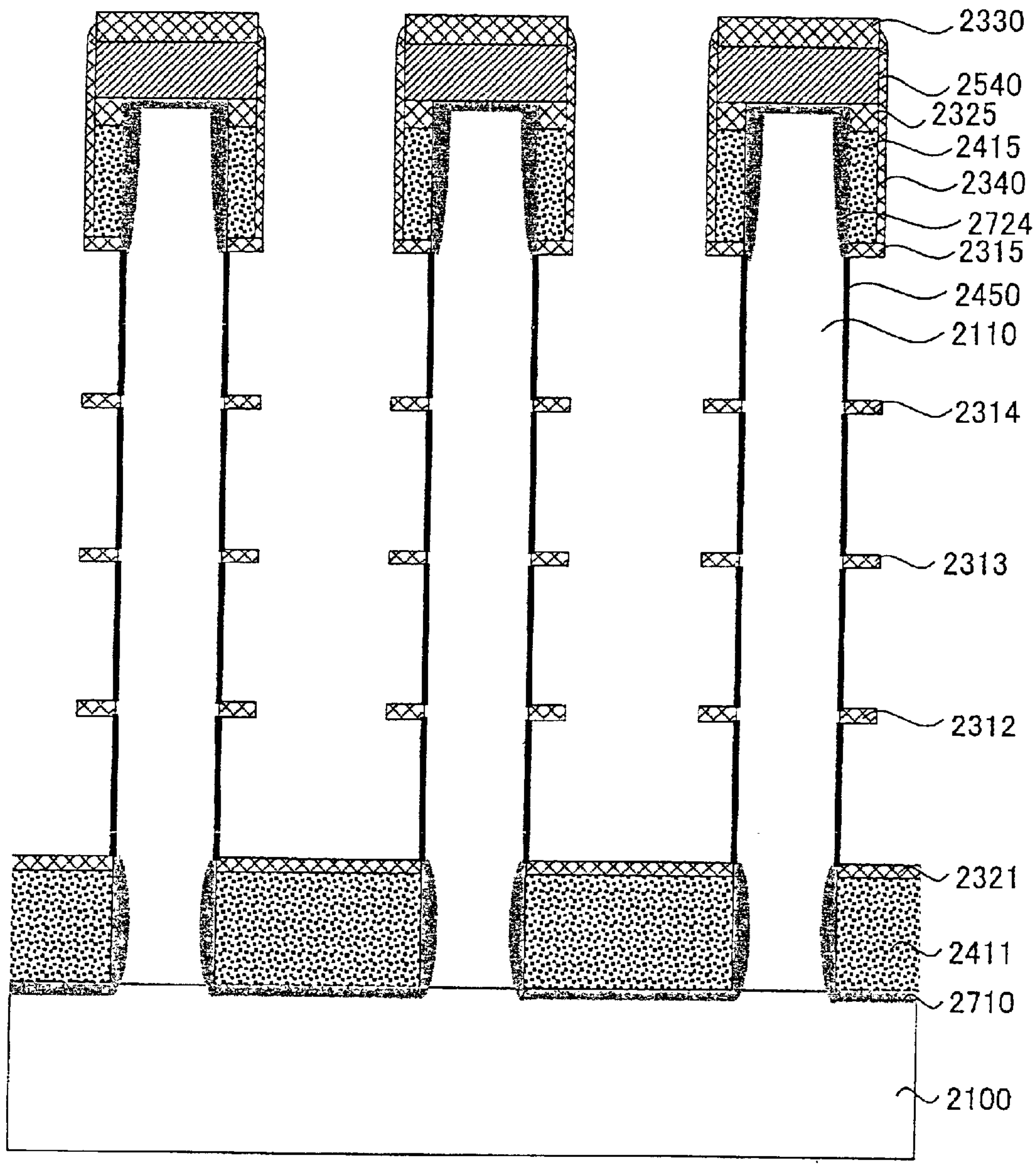

Thereafter, the silicon oxide films 2421, 2422, 2423 and 2424 (the third insulating films) are removed by isotropic etching, for example, to expose the sides of the island-like semiconductor layers 2110. Then, the surface of each island-like semiconductor layer 2110 is oxidized to form, for example, a thermally oxidized film 2450 of about 10 to 100 nm thick as a ninth insulating film (FIGS. 389 and 411).

Figure 390:
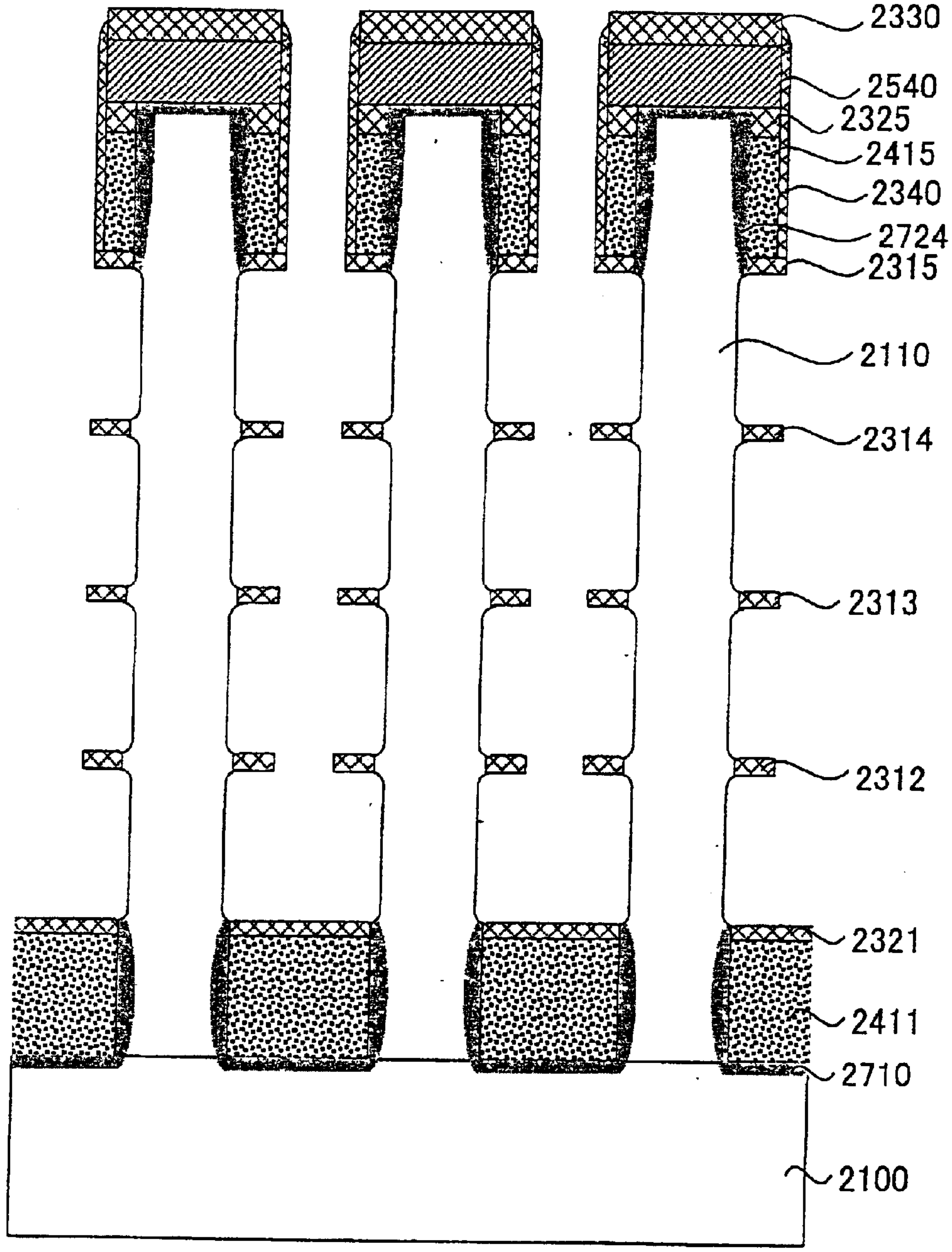
Figure 412:
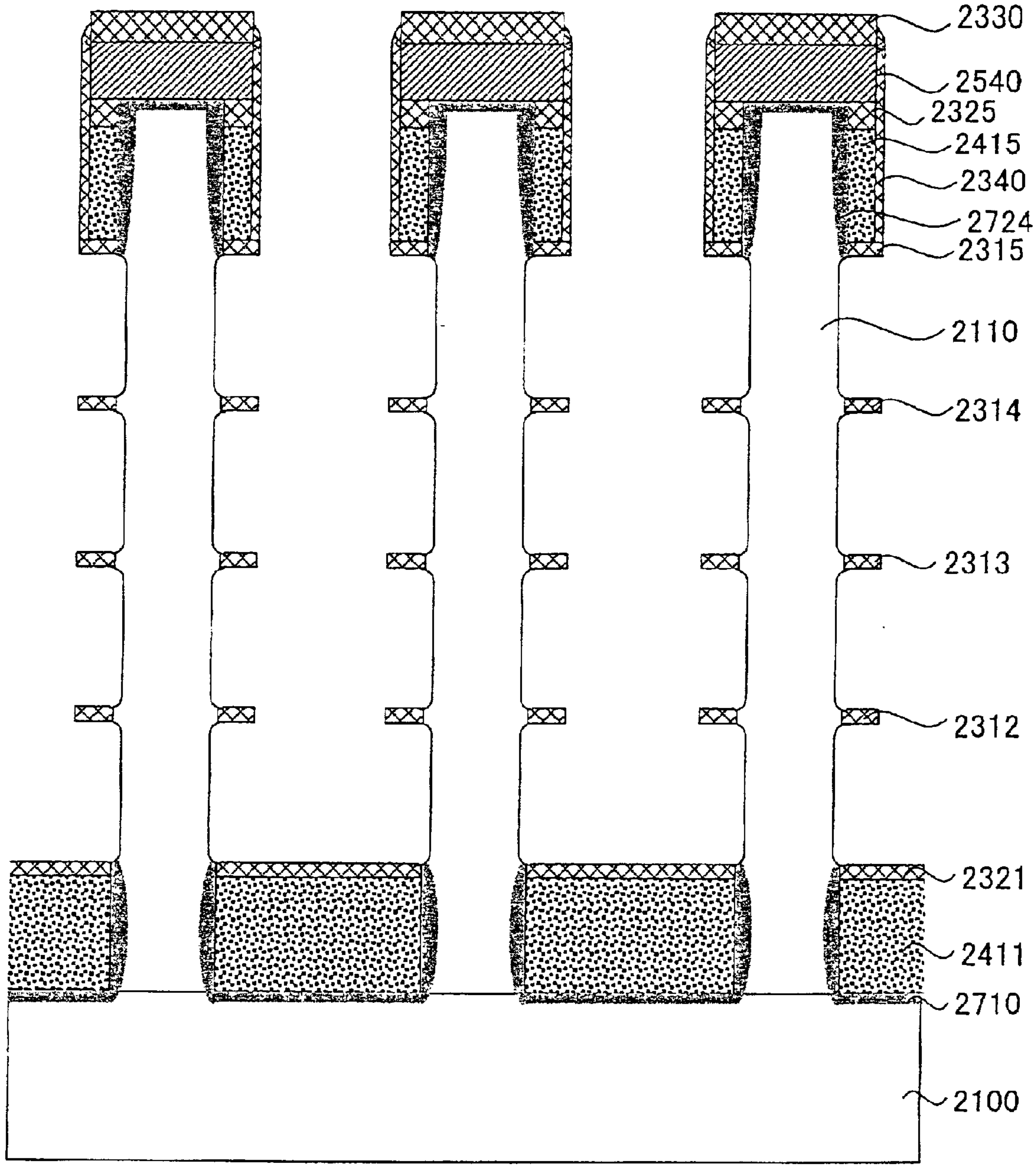

Next, the thermally oxidized film (the ninth insulating film) 2450 is etched away from the periphery of each island-like semiconductor layer 2110, for example, by isotropic etching (FIGS. 390 and 412). Then, as required, channel ion implantation is carried out into the sidewall of each island semiconductor layer 2110 by slant ion implantation. For example, the ion implantation may be performed at an implantation energy of 5 to 100 keV at a boron dose of about $1\times10^{11}$ to $1\times10^{13}/cm^2$ and at an angle of 5 to 45° with respect to the normal line of the surface of the substrate. Preferably the channel ion implantation is performed from various directions to the island-like semiconductor layers 2110 because a surface impurity concentration becomes more uniform. Alternatively, instead of the channel ion implantation, an oxide film containing boron may be deposited by CVD with a view to utilizing diffusion of boron from the oxide film. The impurity implantation from the surface of the island-like semiconductor layers 2110 may be carried out before the island-like semiconductor layers 2110 are covered with the thermally oxidized film 2450, or during the formation of the island-like semiconductor layers 2110. Alternatively, the impurities may be introduced to the silicon oxide films 2421, 2422, 2423 and 2424 in advance with a view to implanting the impurities in the island-like semiconductor layers 2110 by thermal treatment or the like before removing the silicon oxide films 2421, 2422, 2423 and 2424. Means for the implantation are not particularly limited so long as an impurity concentration distribution is almost equal over the island-like semiconductor layers 2110.

Figure 391:
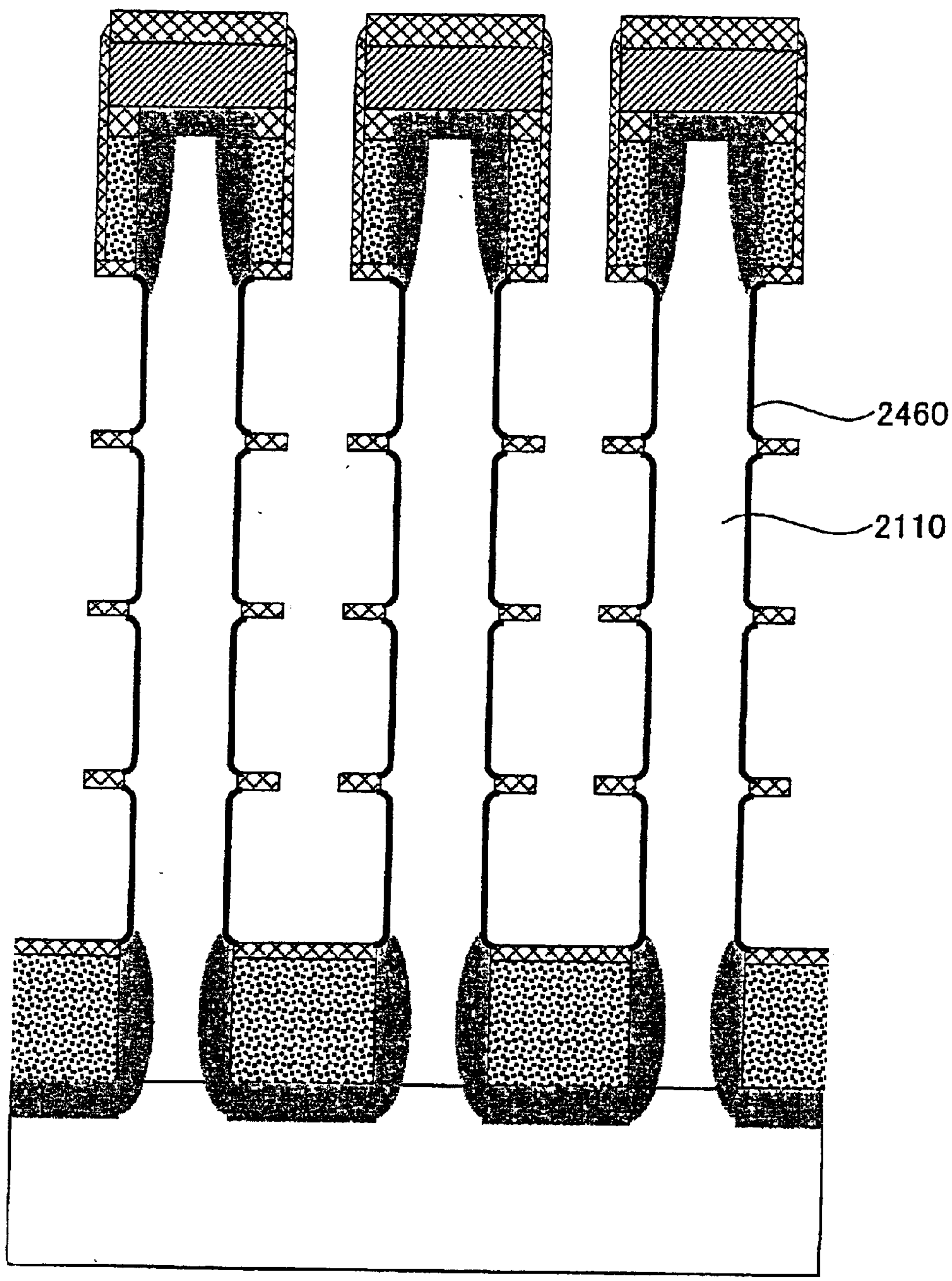
Figure 413:
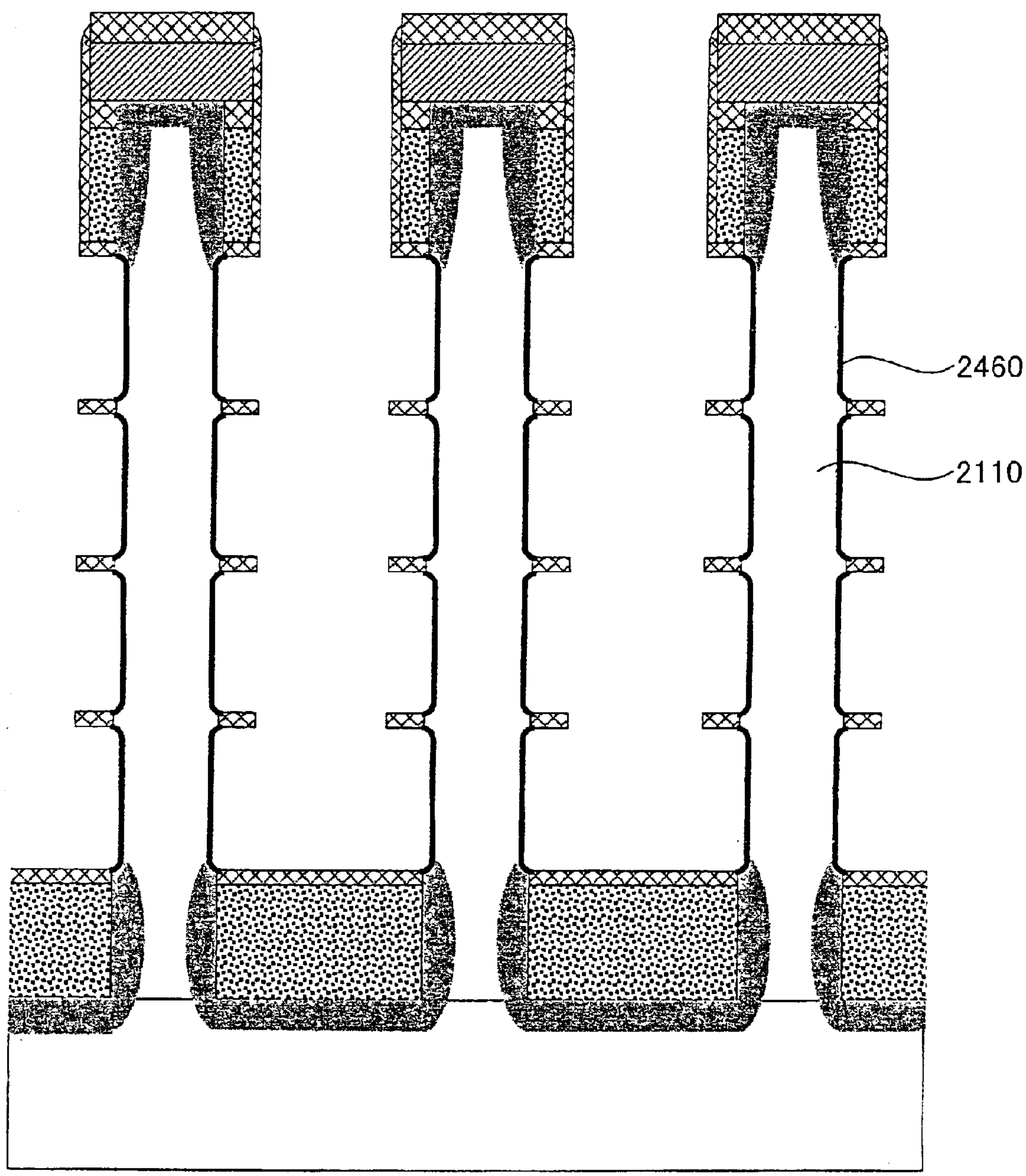

Subsequently, a silicon oxide film 2460, for example, is formed as a tenth insulating film to be a tunnel oxide film to a thickness of about 10 nm around each island-like semiconductor layer 2110, for example, by thermal oxidization (FIG. 391 and FIG. 413). The tunnel oxide film, however, may be formed of not only a thermally oxidized film but also a CVD oxide film or a nitrogen oxide film.

Figure 392:
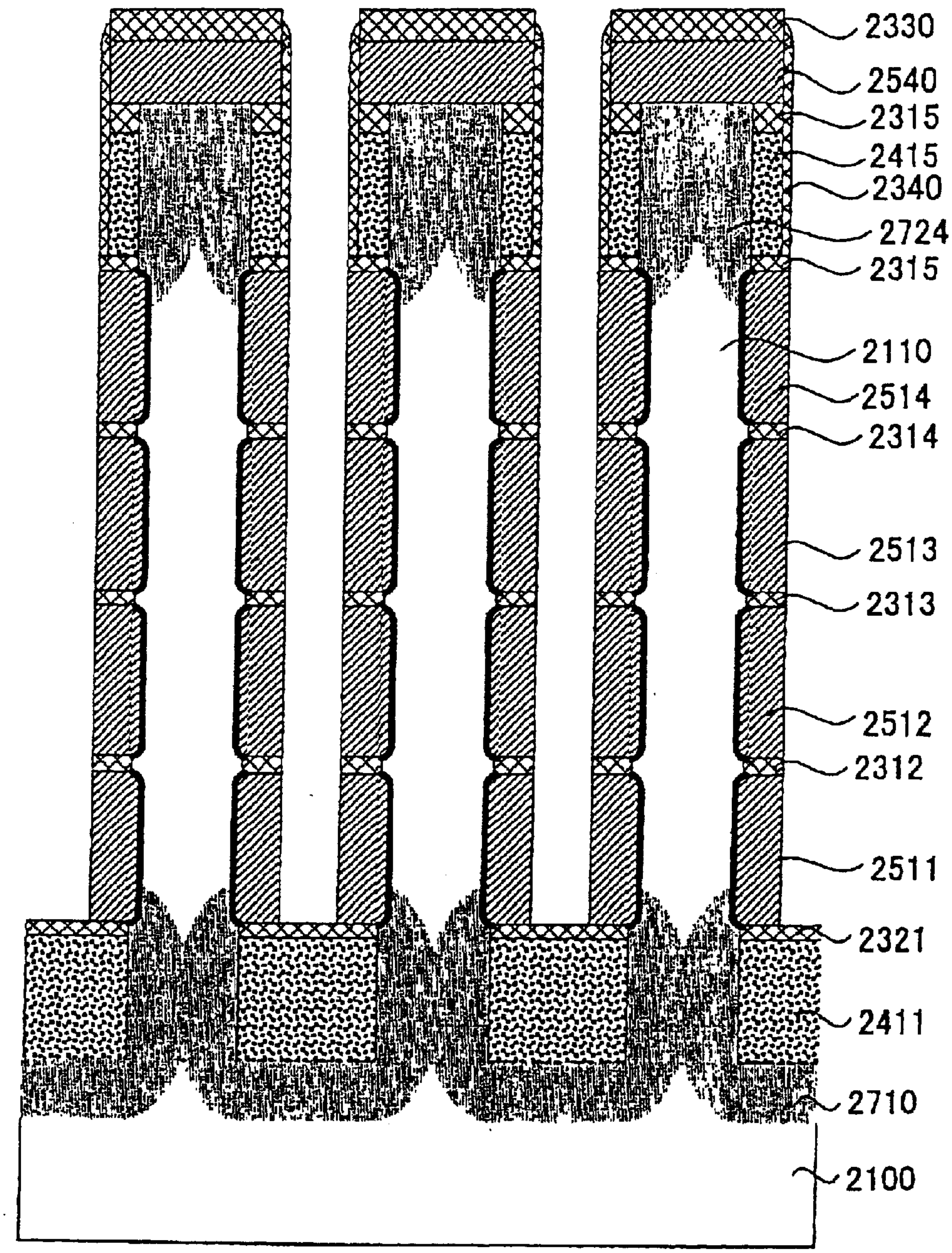
Figure 414:
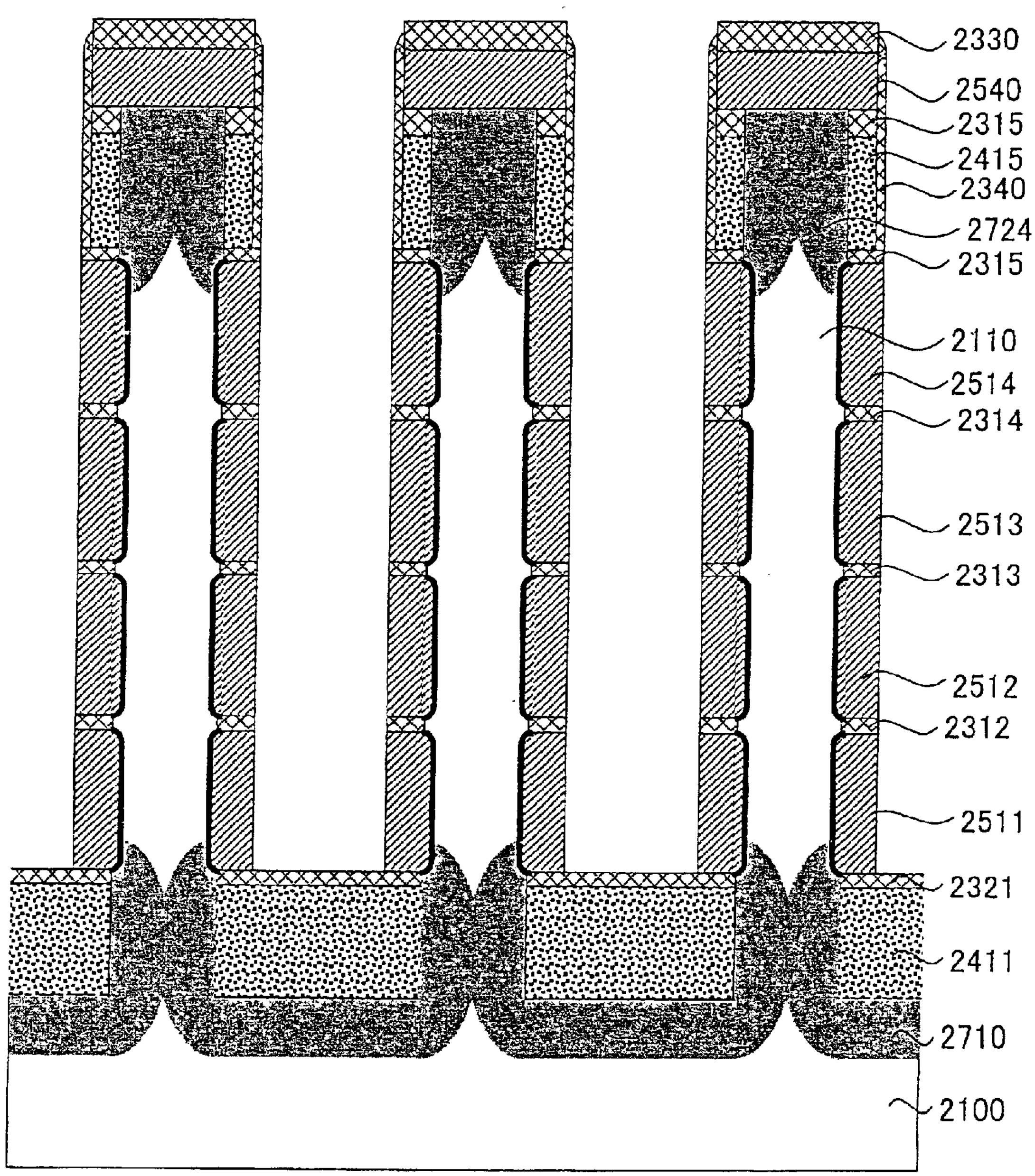

Subsequently, a polysilicon film 2510, for example, is deposited as a first conductive film to a thickness of about 50 to 200 nm. Using the silicon nitride film 2330 (the fifth insulating film) and the silicon nitride films 2340, 2314, 2313 and 2312 (the sixth insulating films) as a mask, the polysilicon film 2510 is divided into polysilicon films 2511, 2512, 2513 and 2514, for example, by anisotropic etching (FIGS. 392 and 414).

Figure 393:
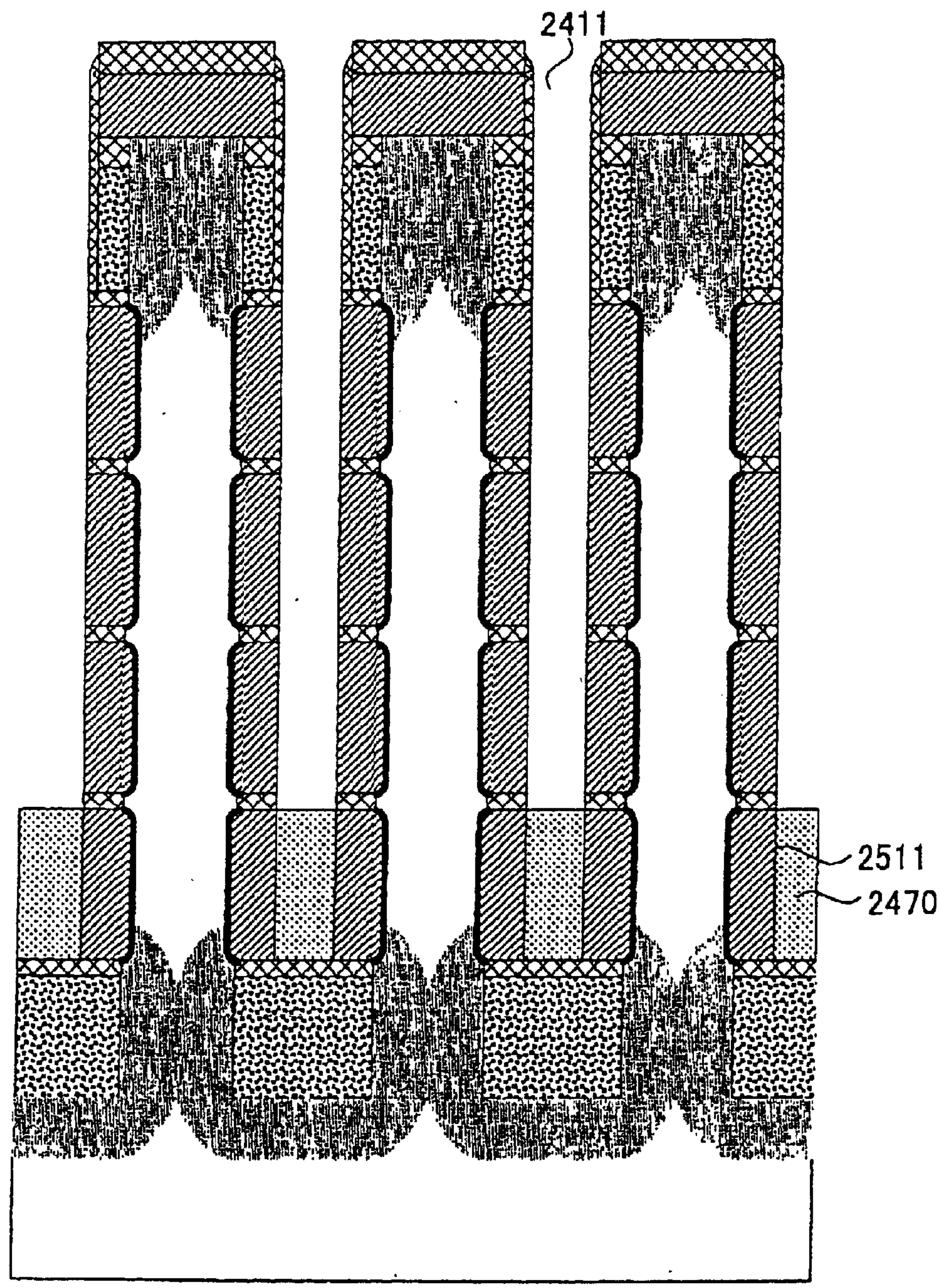
Figure 394:
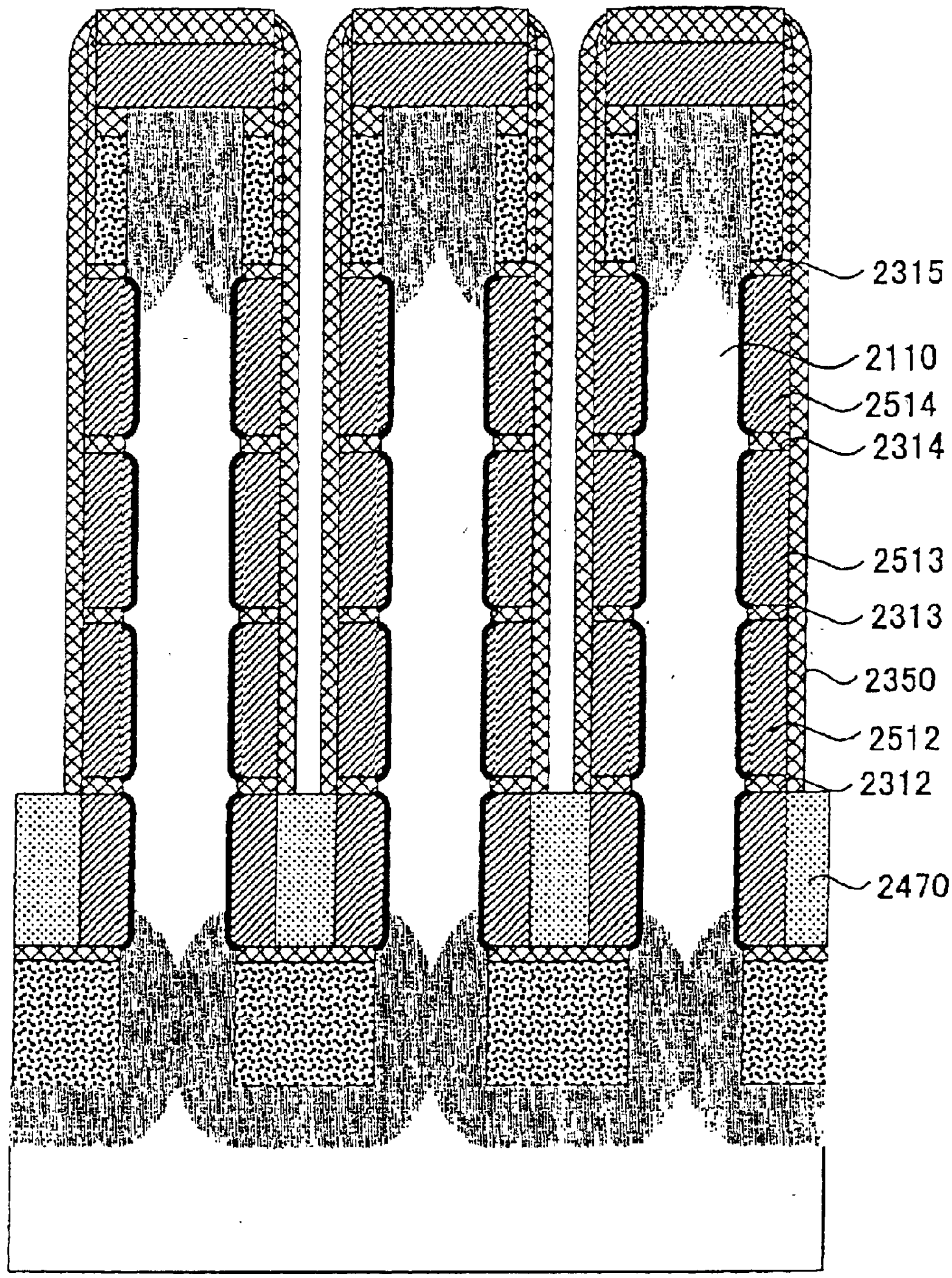
Figure 415:
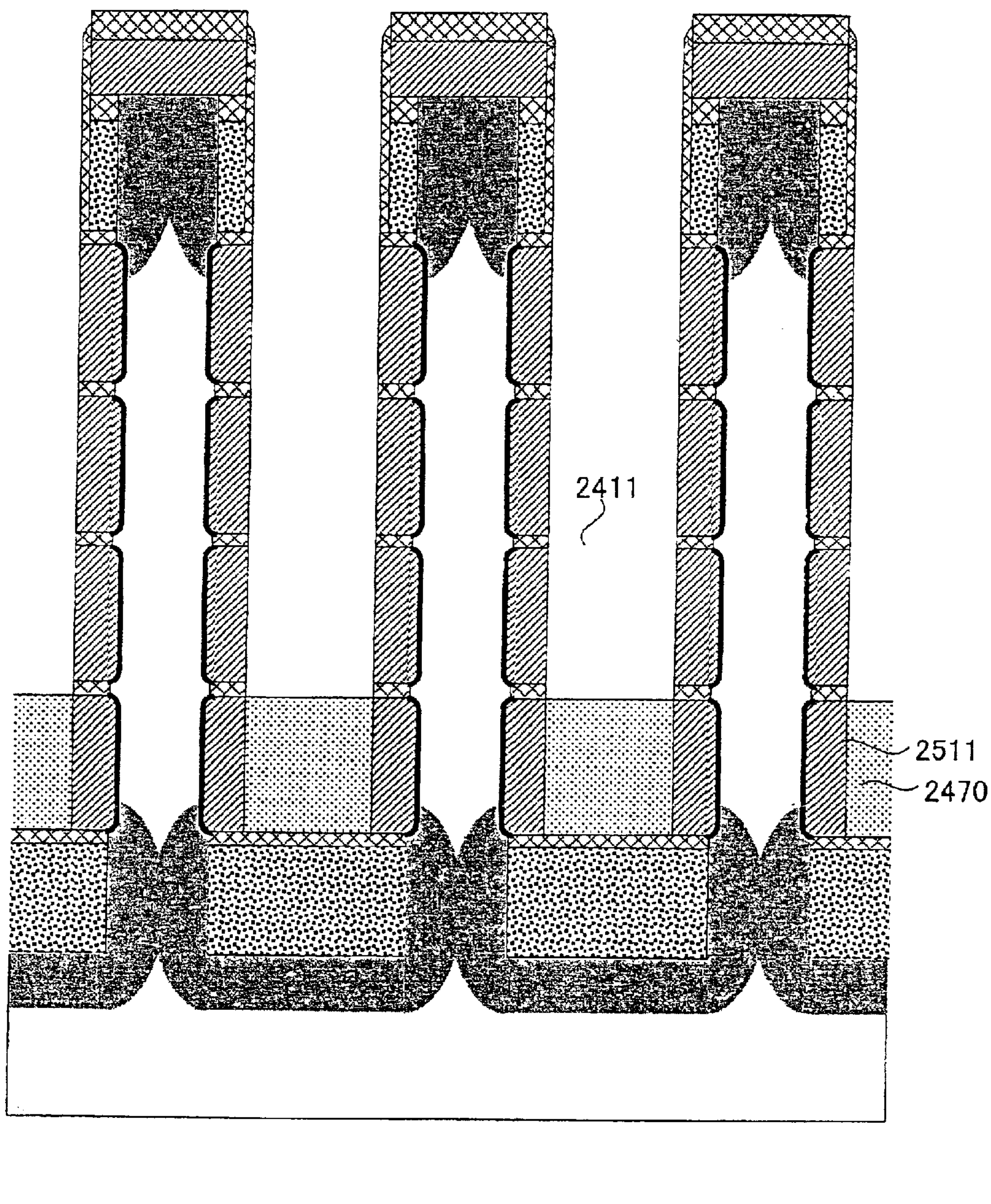
Figure 416:
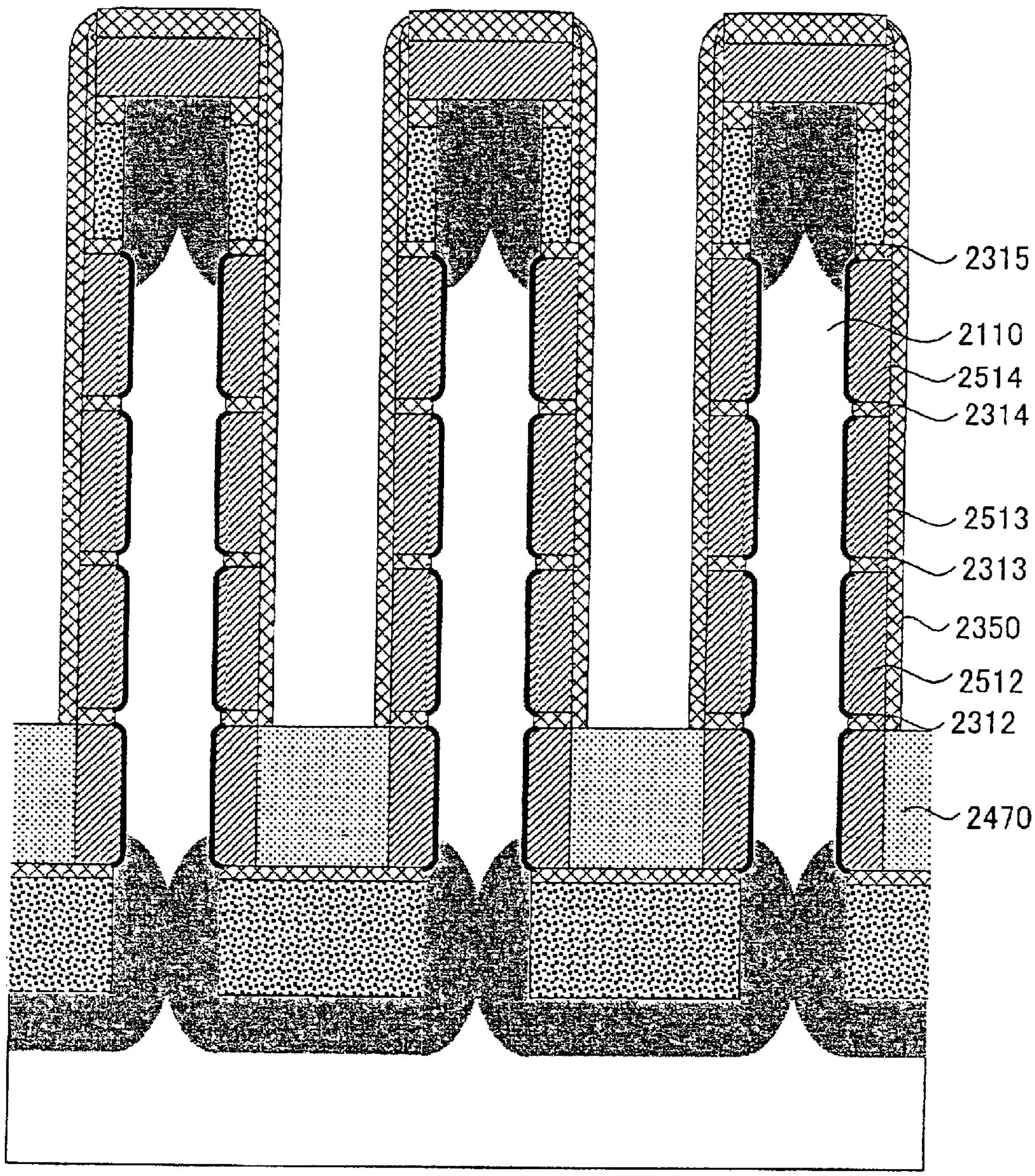

A silicon oxide film 2470, for example, is then deposited as an eleventh insulating film to a thickness of about 50 to 500 nm. The silicon oxide film 2470 is buried in the third trench 2230, for example, by anisotropic and isotropic etching such that the polysilicon film 2511 (the first conductive film) is embedded (FIGS. 393 and 415). At this time, the depth of the buried silicon oxide film 2470 is so controlled that the silicon nitride film 2312 (the second insulating film) is partially exposed. Then, a silicon nitride film 2350, for example, is deposited as a twelfth insulating film to a thickness of 5 to 50 nm on the surfaces of the polysilicon films 2512 to 2514 (the first conductive films), the silicon nitride films 2312, 2313, 2314 and 2315 (the sixth insulating films) and the silicon oxide film 2470 (the eleventh insulating film) which are present on the inner wall of the third trench 2230. For example, the silicon nitride film 2350 is etched back anisotropically, for example, to remain in the form of a sidewall spacer (FIGS. 394 and 416).

Figure 395:
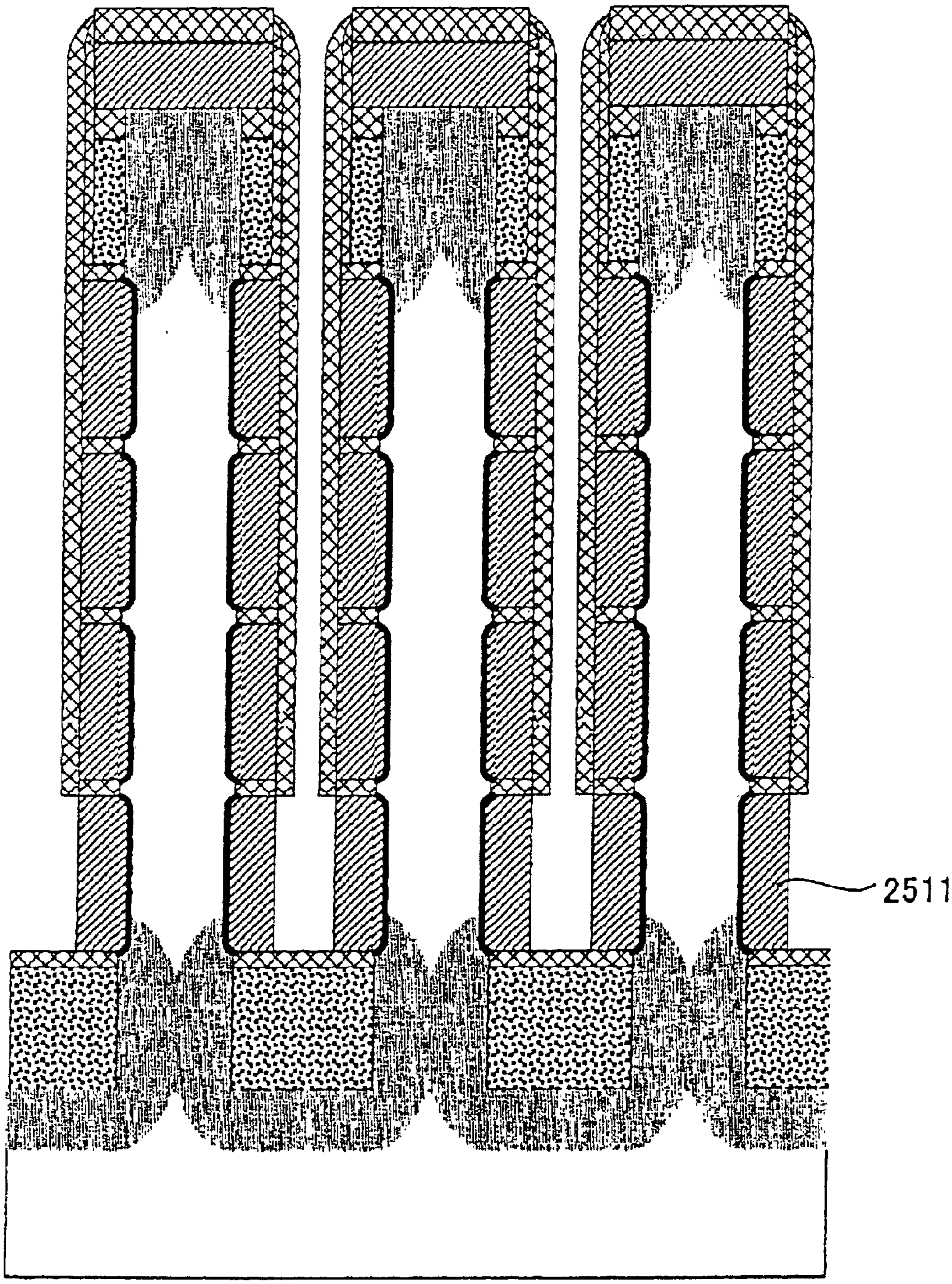
Figure 417:
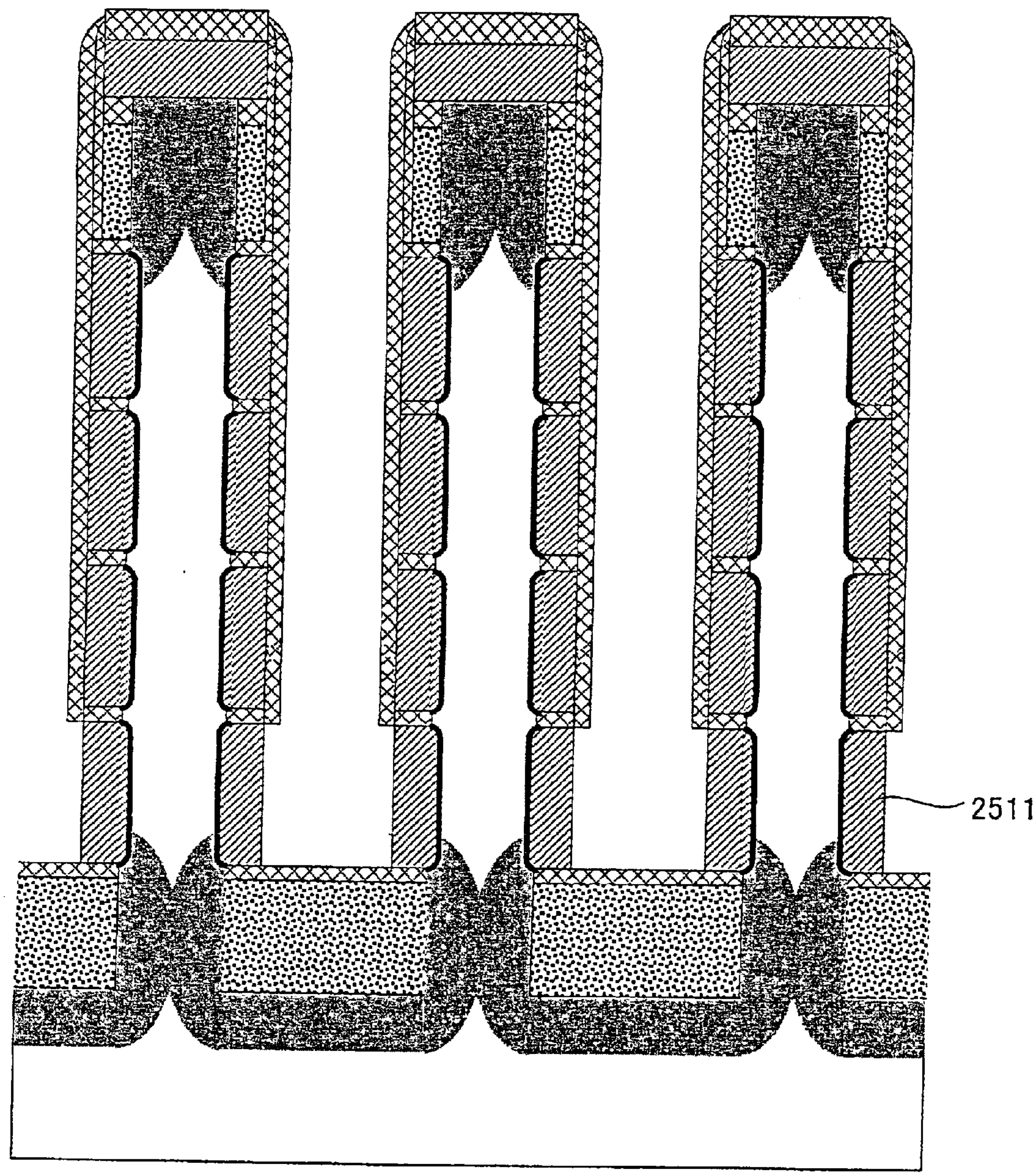

Then, the silicon oxide film 2470 is etched back isotropically, for example, to such a degree that the side of the polysilicon film 2511 is exposed (FIGS. 395 and 417).

Figure 396:
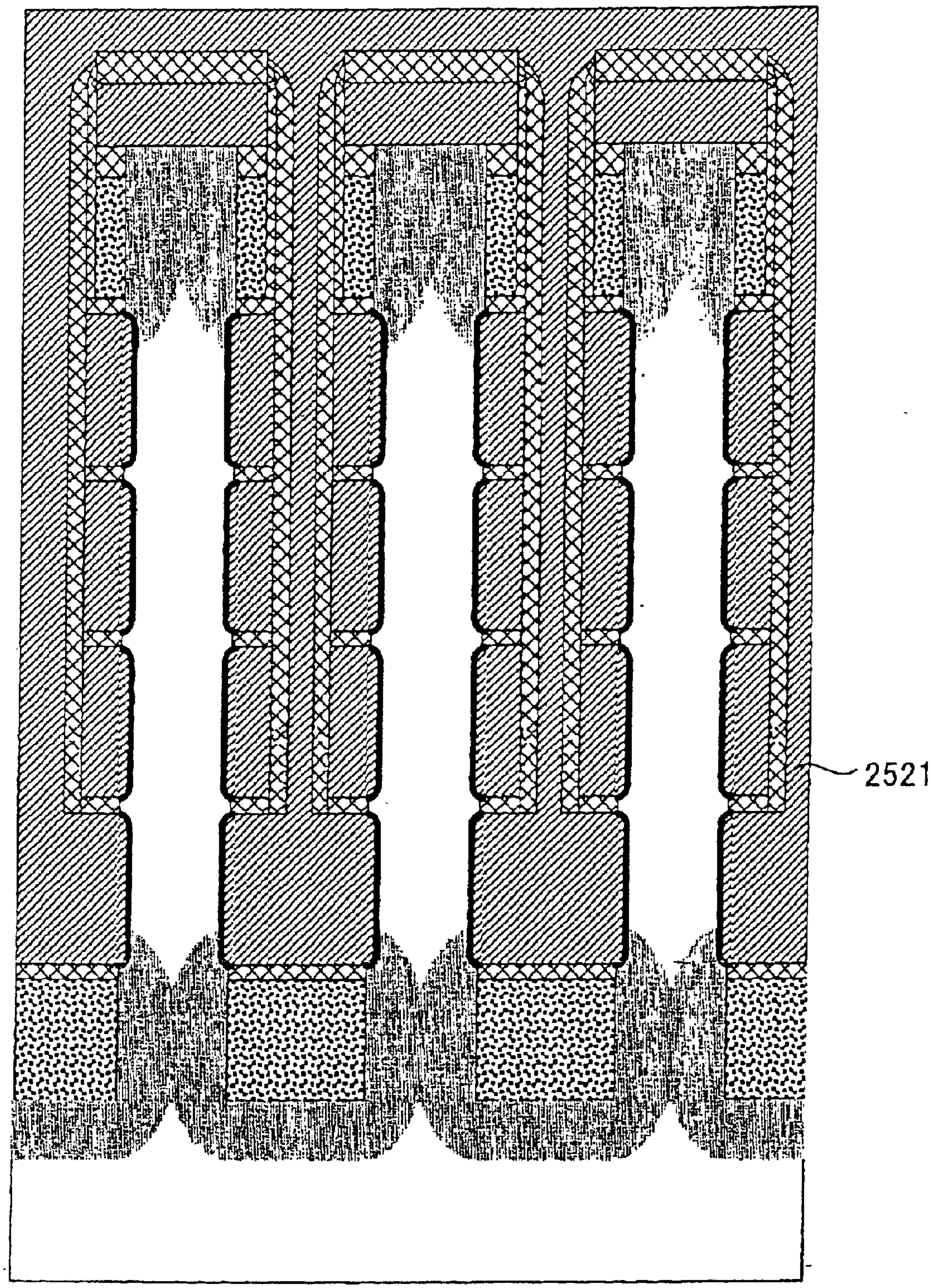
Figure 418:
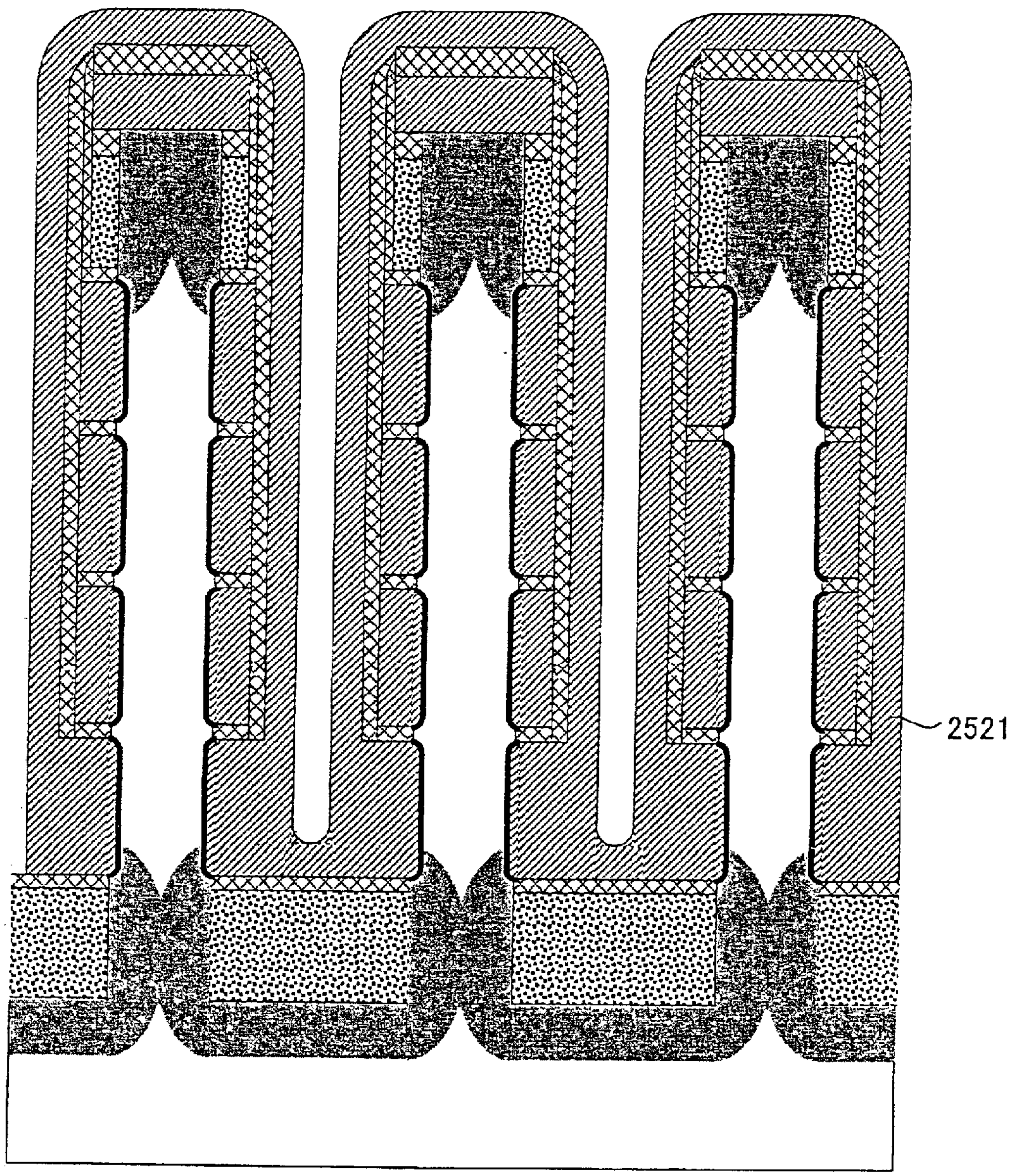

Then, a polysilicon film 2521, for example, is deposited as a second conductive film to a thickness of 15 to 150 nm (FIGS. 396 and 418).

Figure 397:
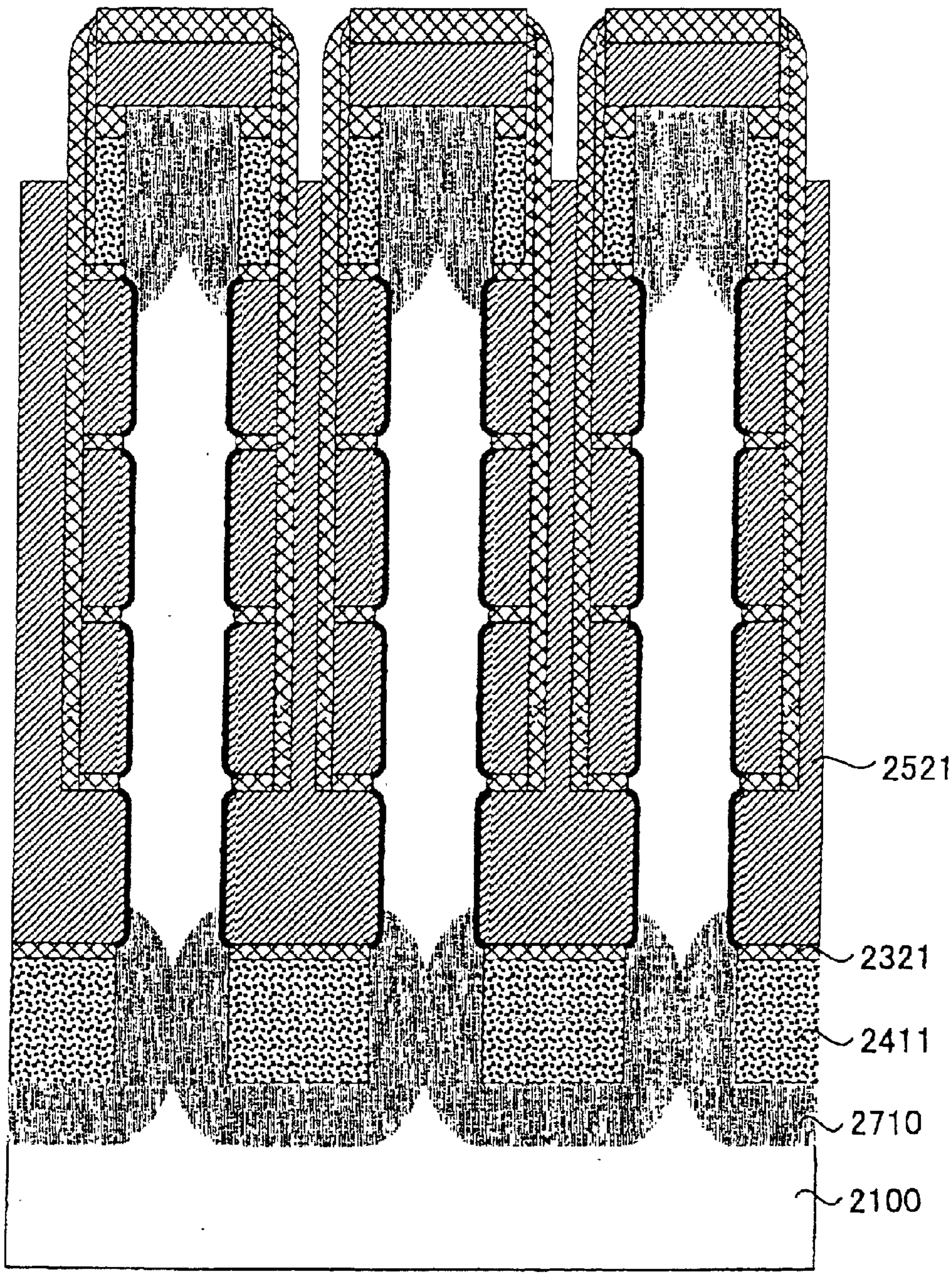
Figure 419:
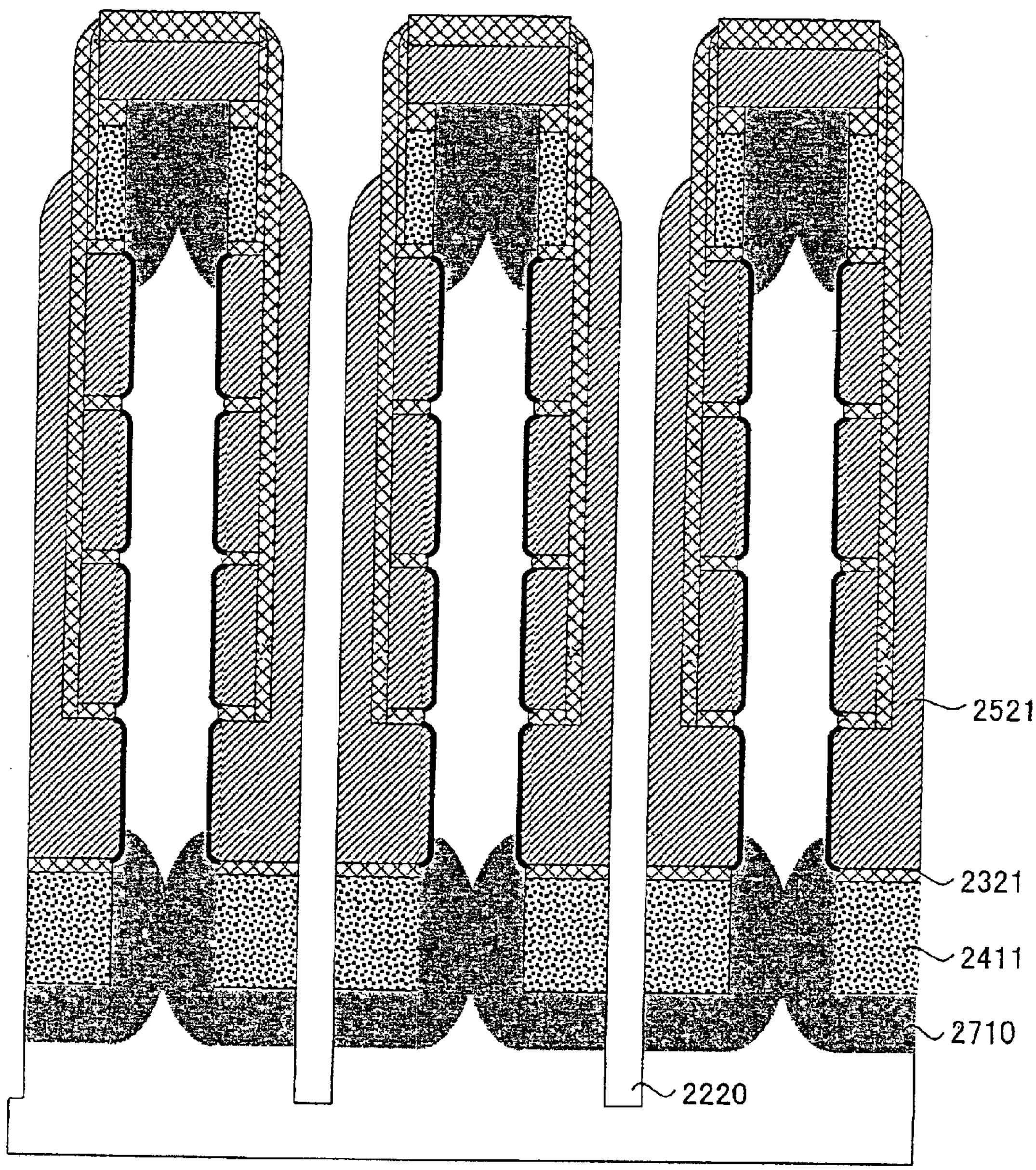
Figure 491:
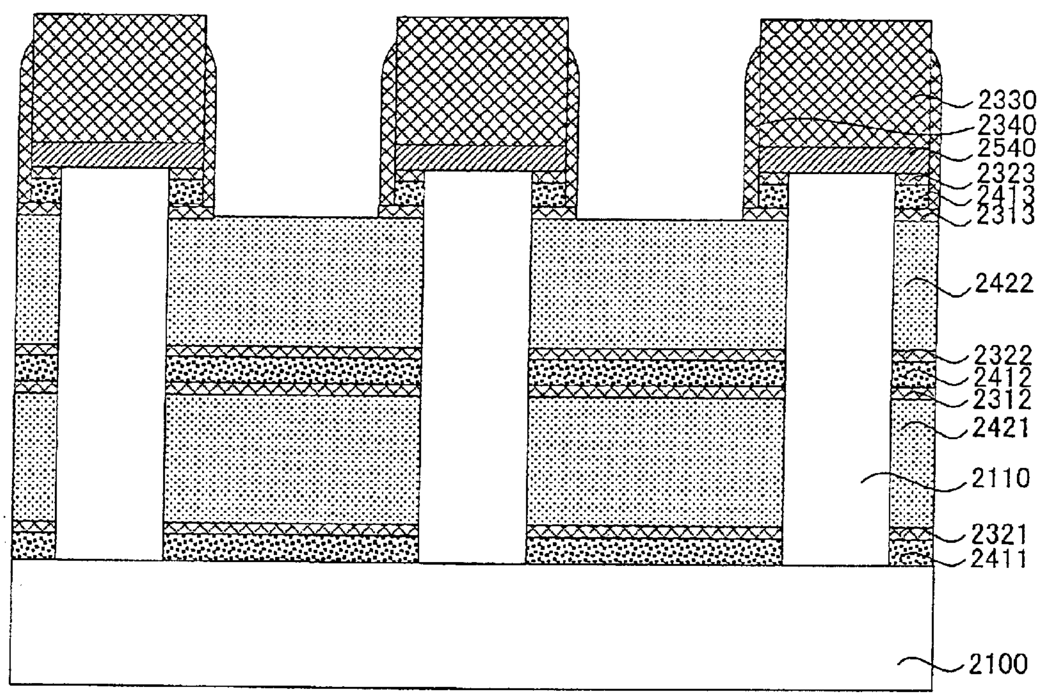

The polysilicon film 2521 is then etched back anisotropically, for example, as shown in FIG. 491. Subsequently, the silicon nitride film 2321 (the fourth insulating film), the silicon oxide film 2411 (the first insulating film) and the P-type silicon substrate 2100 are successively etched to form a second trench 2200 in the P-type silicon substrate 2100 in self-alignment with the polysilicon film 2521 (the second conductive film), thereby separating the impurity diffusion layer 2710. That is, a separation portion of the first wiring layer is formed in self-alignment with a separation portion of the second conductive film (FIG. 397 and FIG. 419).

Then, a silicon oxide film 2470, for example, is deposited to a thickness of 30 to 300 nm as an eleventh insulating film and buried in the second trench 2220 by, for example, anisotropic etching. The height of the silicon oxide film 2470 is so adjusted that the polysilicon film 2511 (the first conductive film) is buried. Subsequently, the polysilicon film 2521 is etched back anisotropically or isotropically to such a degree that the polysilicon film 2521 is able to contact the polysilicon film 2511 to form a selection gate. At this time, by setting the intervals between the island-like semiconductor layers 2110 in a direction of A-A' in FIG. 1 to a predetermined value or smaller, the polysilicon film 2521 is formed into a second wiring layer to be a selection gate line continuous in the direction without need to use a masking process.

Then, the sidewall spacer made of the silicon nitride film (the twelfth insulating film) 2350 is removed by isotropic etching and a silicon oxide film 2471, for example, is deposited as an eleventh insulating film to a thickness of about 50 to 500 nm.

The silicon oxide film 2471 is buried in the third trench 2230 by anisotropic or isotropic etching such that the polysilicon film 2521 is buried. At this time, the depth of the buried silicon oxide film 2471 is so controlled that the silicon nitride film 2342 is partially exposed.

Figure 398:
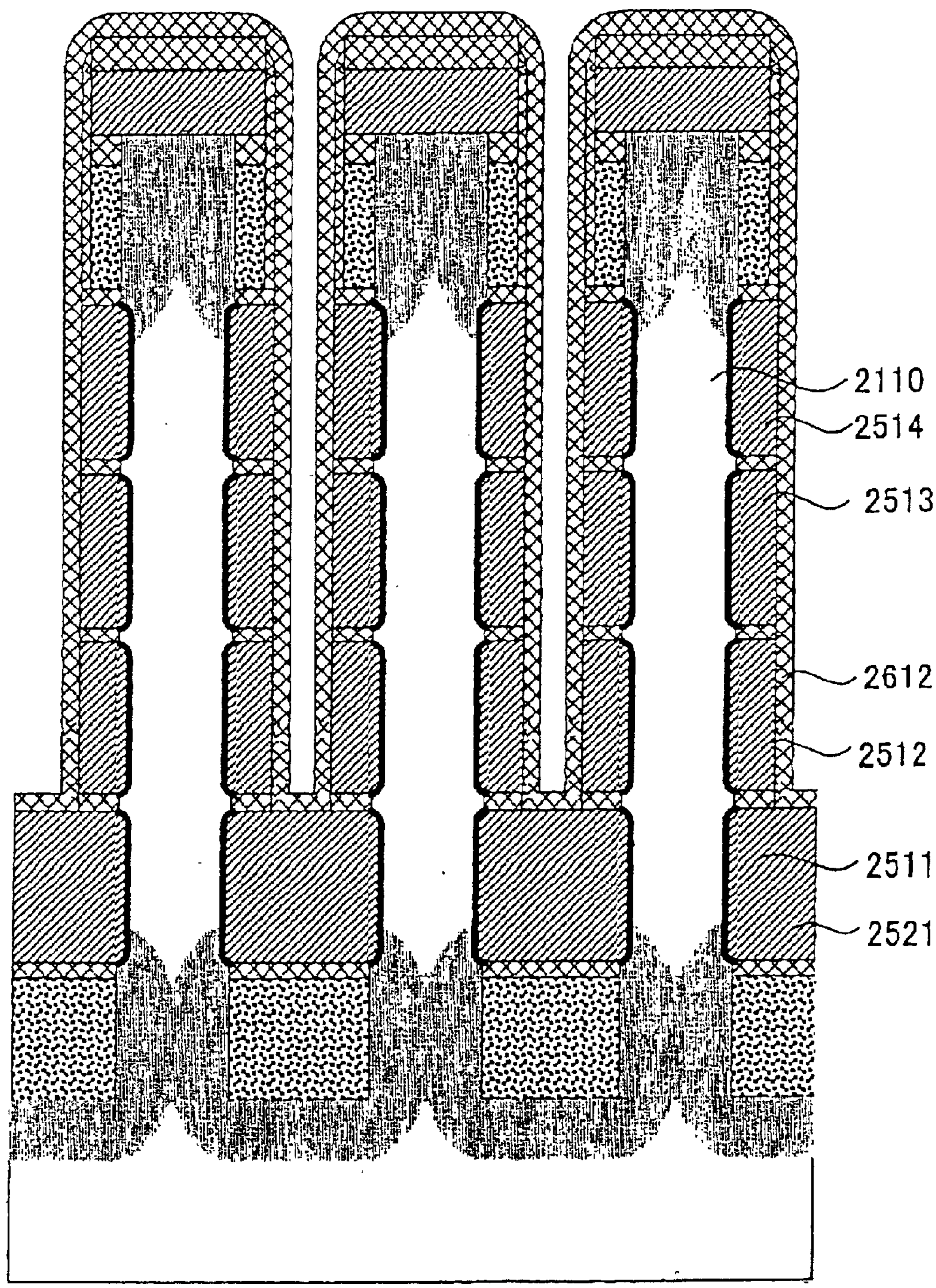
Figure 420:
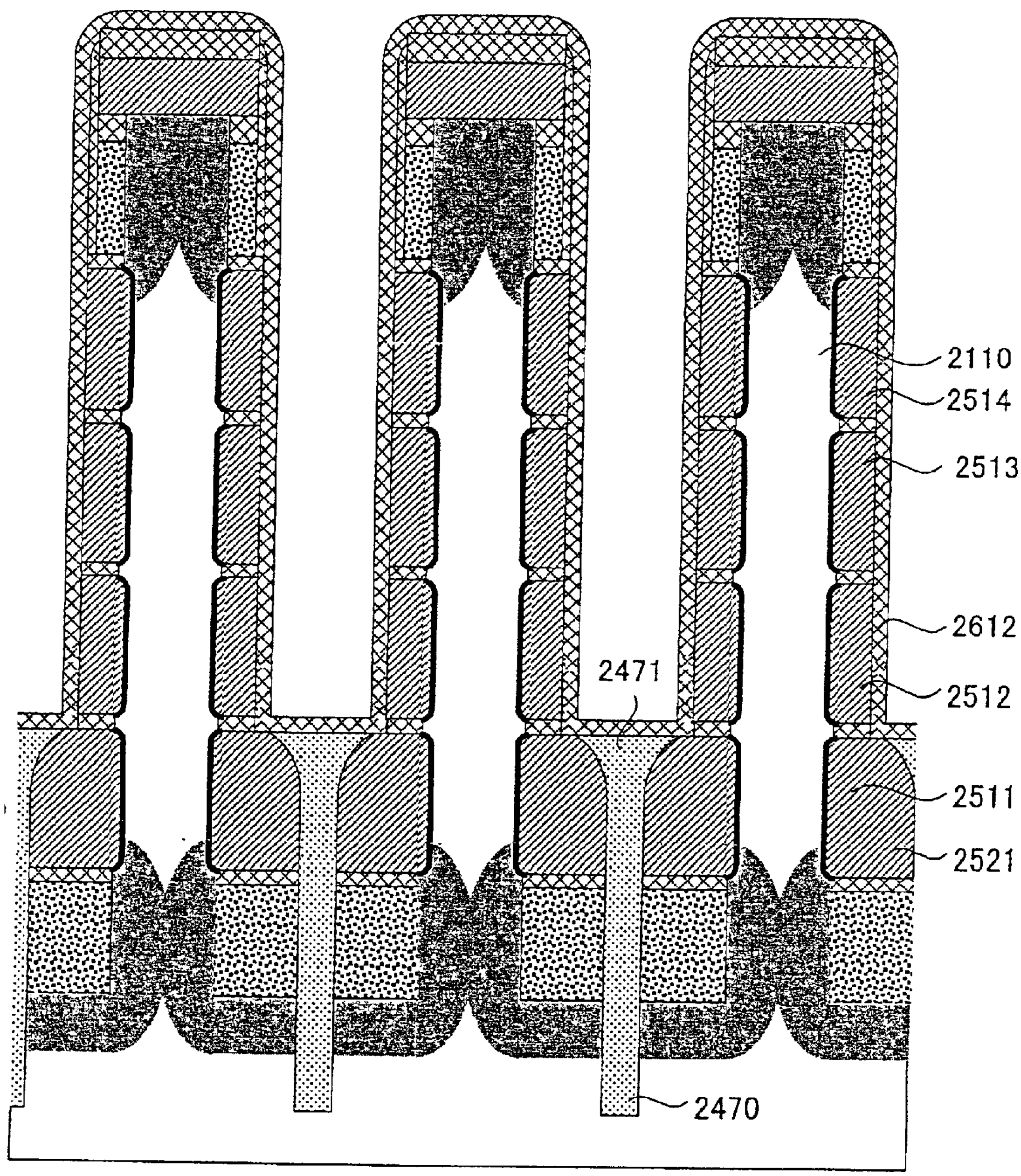

Subsequently, an interlayer insulating film 2612 is formed on exposed surfaces of the polysilicon films 2512 to 2514 (FIG. 398 and FIG. 420). This interlayer insulating film 2612 may be formed of an ONO film, for example. The ONO film may be formed in the same manner as in Production example 11.

Figure 399:
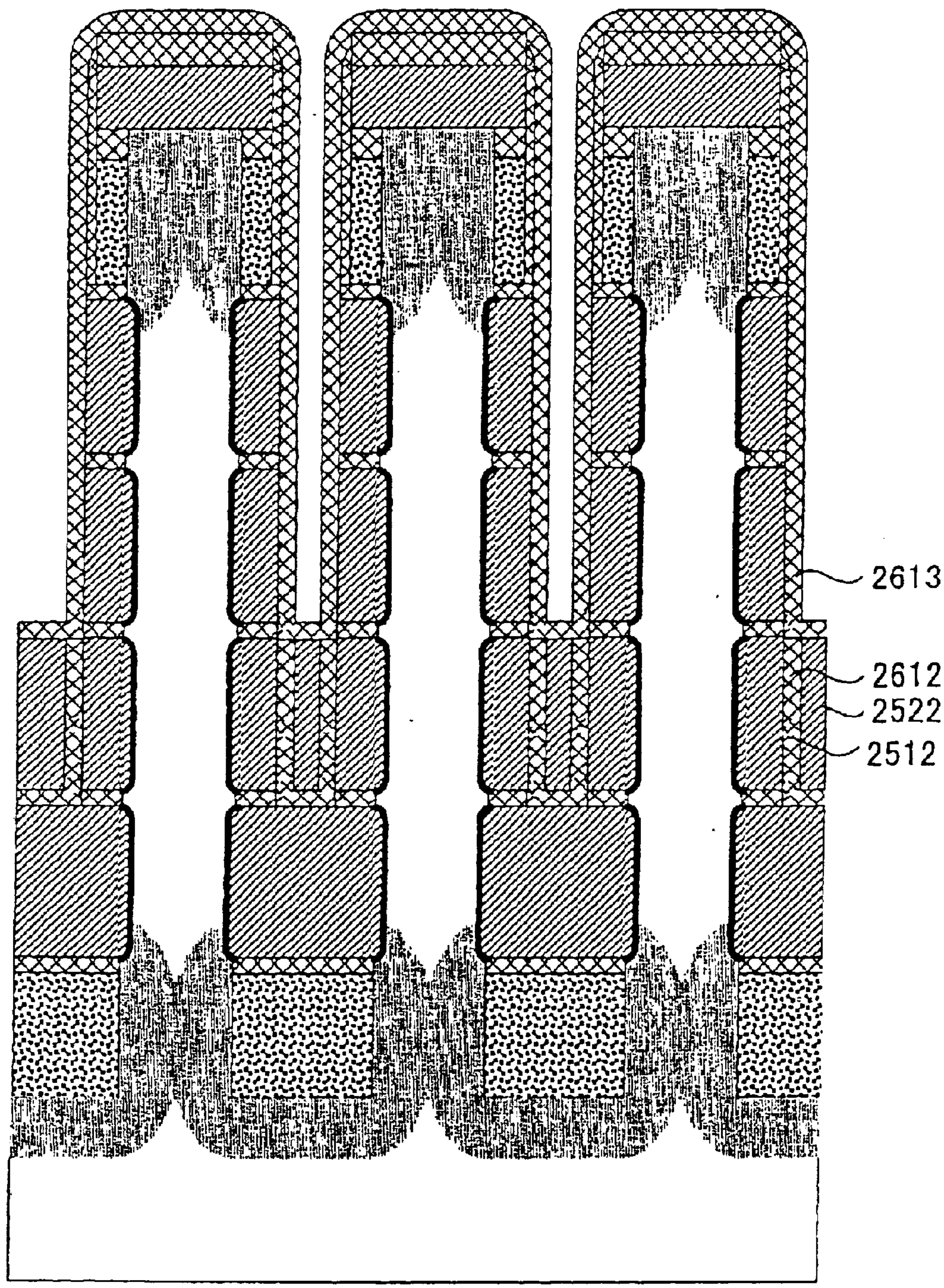
Figure 421:
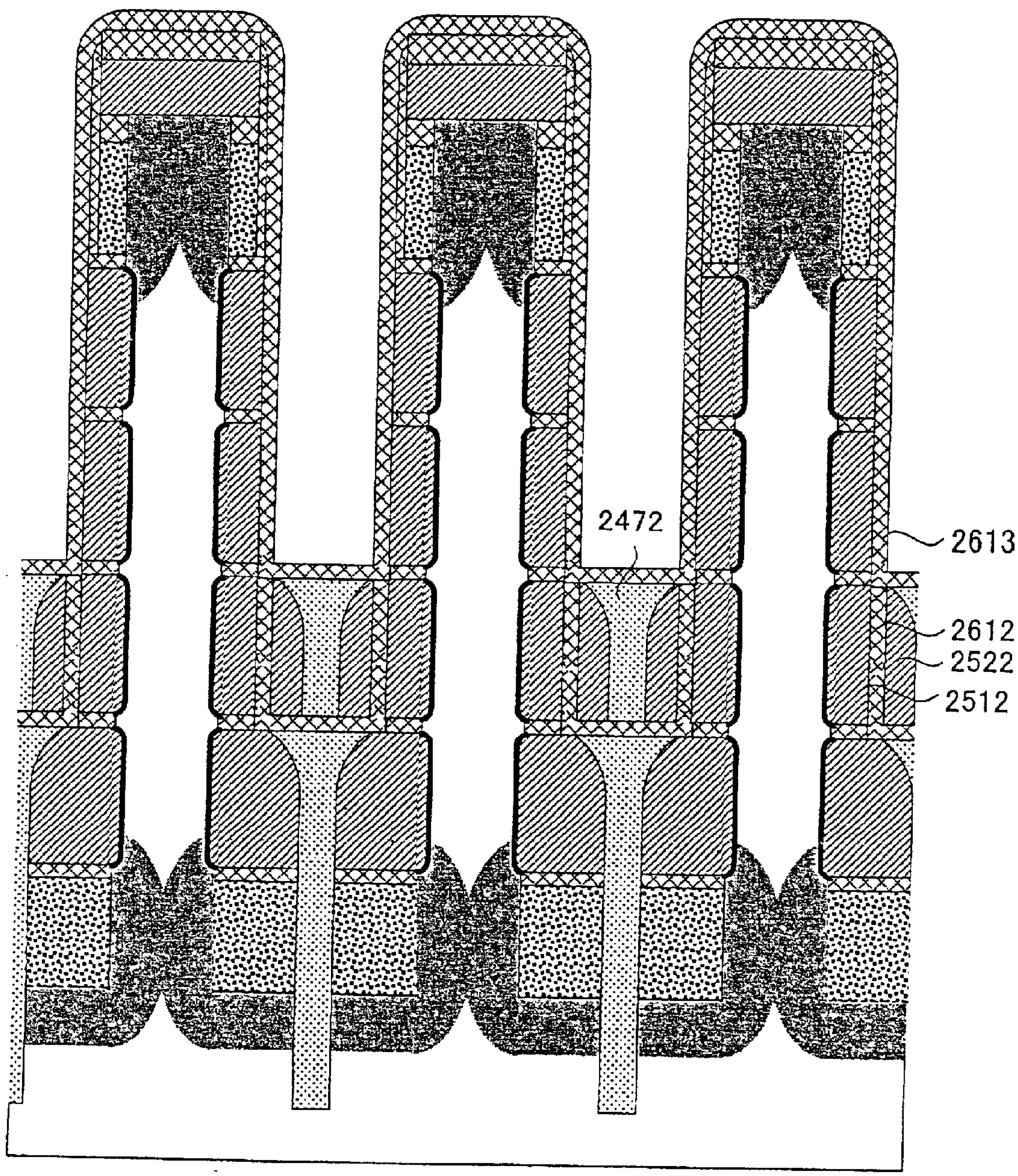

Subsequently, in the same manner, a polysilicon film 2522 is deposited as a second conductive film to a thickness of 15 to 150 nm and then etched back so that the polysilicon film 2522 is disposed on the side of the polysilicon film (the first conductive film) 2512 with intervention of the interlayer insulating film 2612. At this time, by setting the intervals between the island-like semiconductor layers 2110 in the direction of A-A' in FIG. 1 to a predetermined value or smaller, the polysilicon film 2522 is formed into a third wiring layer to be a control gate line continuous in the direction of A-A' without need to use a masking process (FIGS. 399 and 421).

Thereafter, a silicon oxide film 2472, for example, is deposited as an eleventh insulating film to a thickness of about 50 to 500 nm.

The silicon oxide film 2472 is buried in the third trench 2230 by anisotropic or isotropic etching, for example, such that the polysilicon film (the second conductive film) 2522 is embedded. At this time, the depth of the buried silicon oxide film 2472 is so controlled that the silicon nitride film 2343 is partially exposed.

Figure 400:
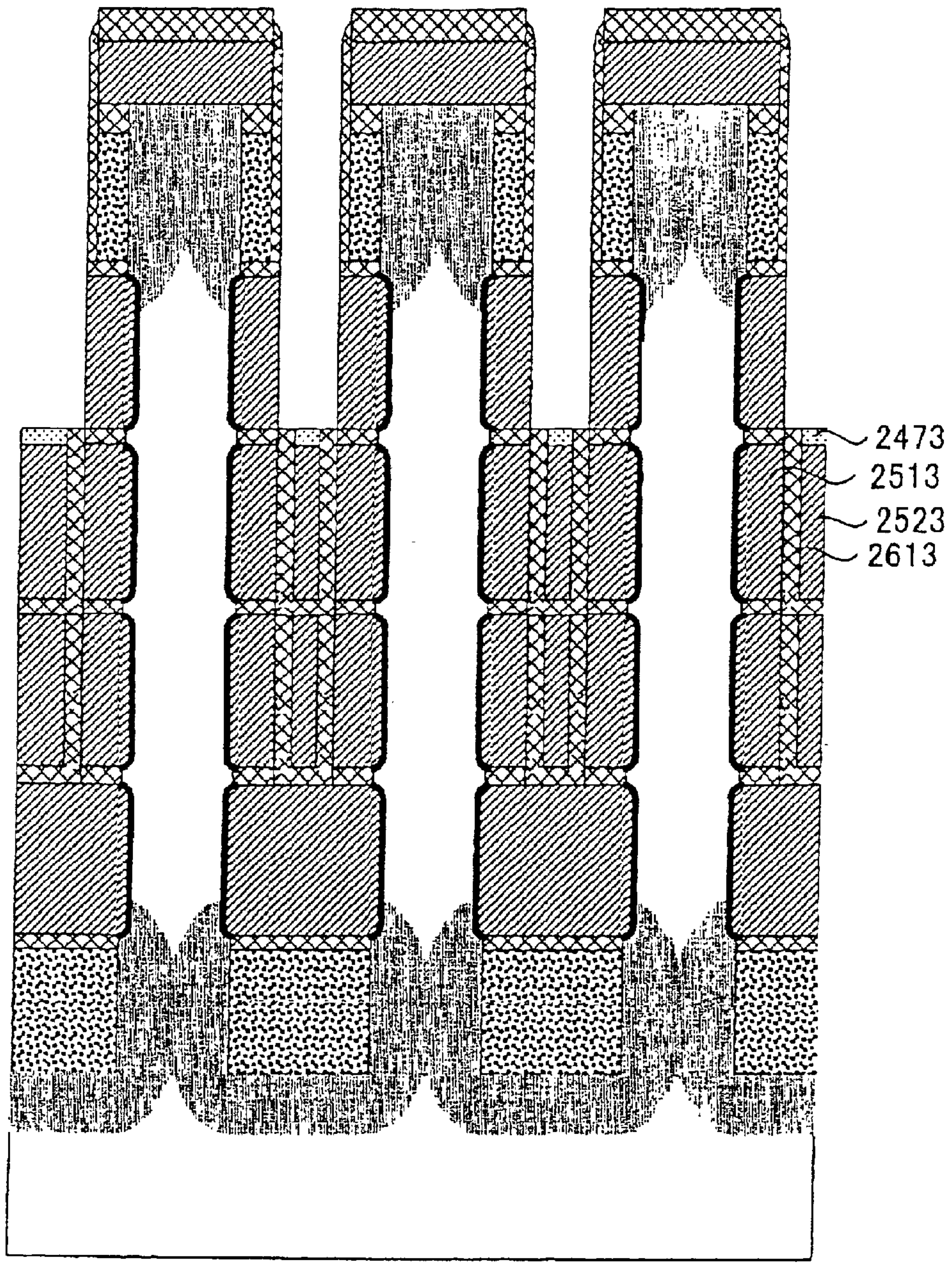
Figure 401:
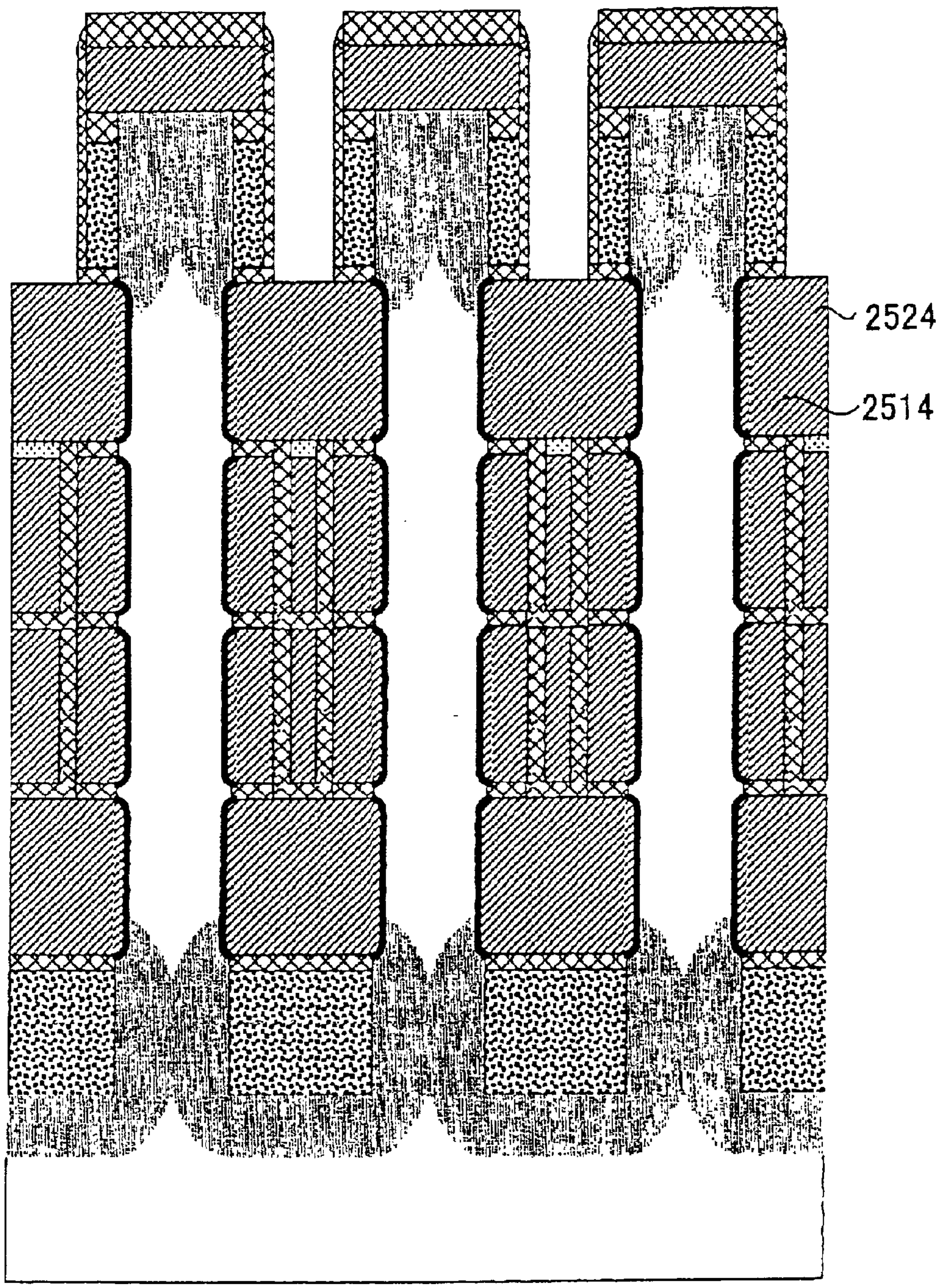
Figure 422:
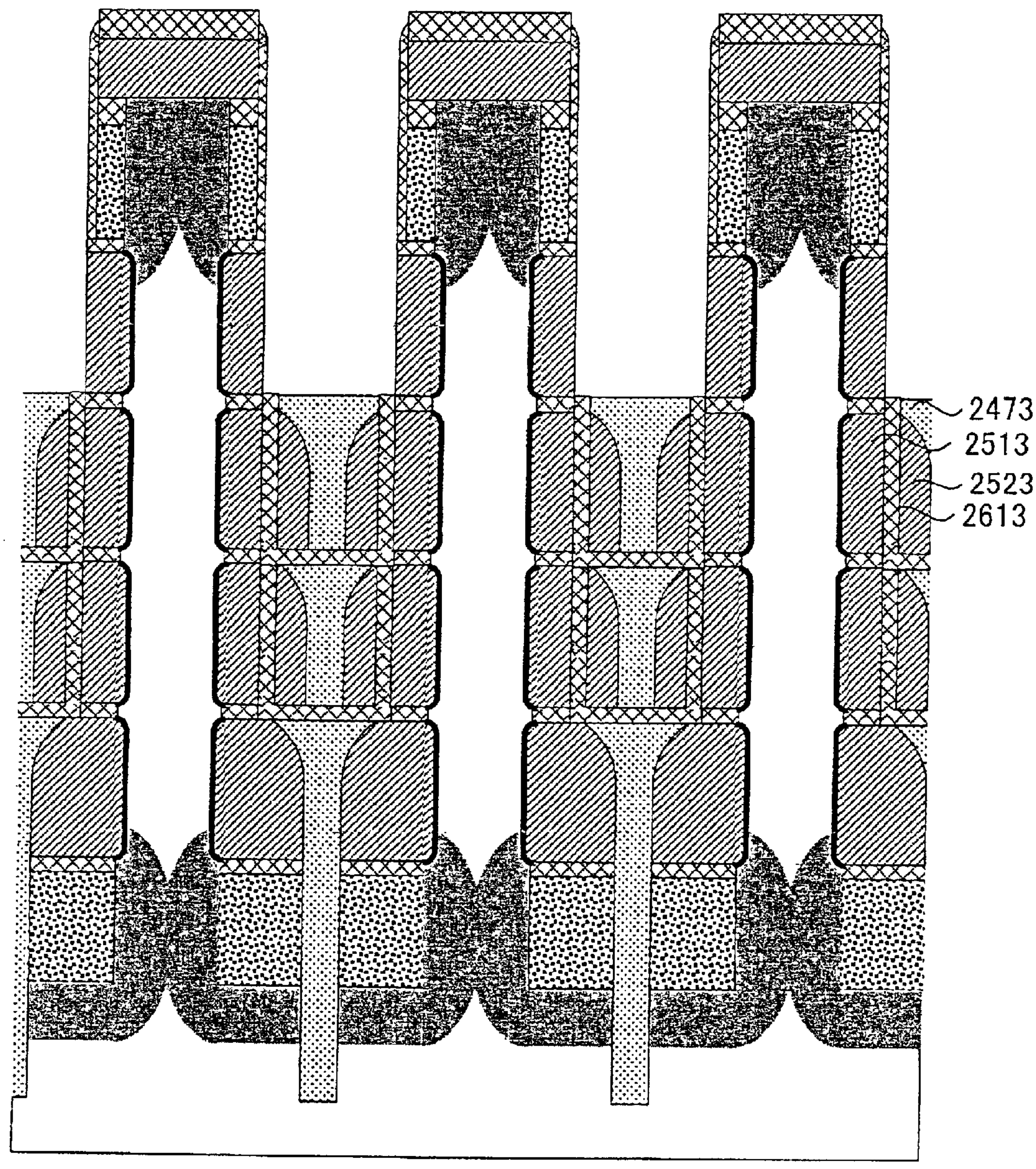

By repeating likewise, a polysilicon film 2523 is disposed as a second conductive film on the side of the polysilicon film (the first conductive film) 2513 with intervention of an interlayer insulating film 2613, and then a silicon oxide film 2473 (an eleventh insulating film) is embedded to bury the polysilicon film 2523 (FIGS. 400 and 422).

With regard to the polysilicon film 2514 which is the topmost first conductive film, a polysilicon film (a second conductive film) 2524 is etched back to such a degree that the polysilicon film 2524 is able to contact the polysilicon film (the first conductive film) 2514, in the same manner as the polysilicon film 2511 which is the bottommost first conductive film (FIGS. 399 to 401 and FIGS. 421 to 423).

Figure 402:
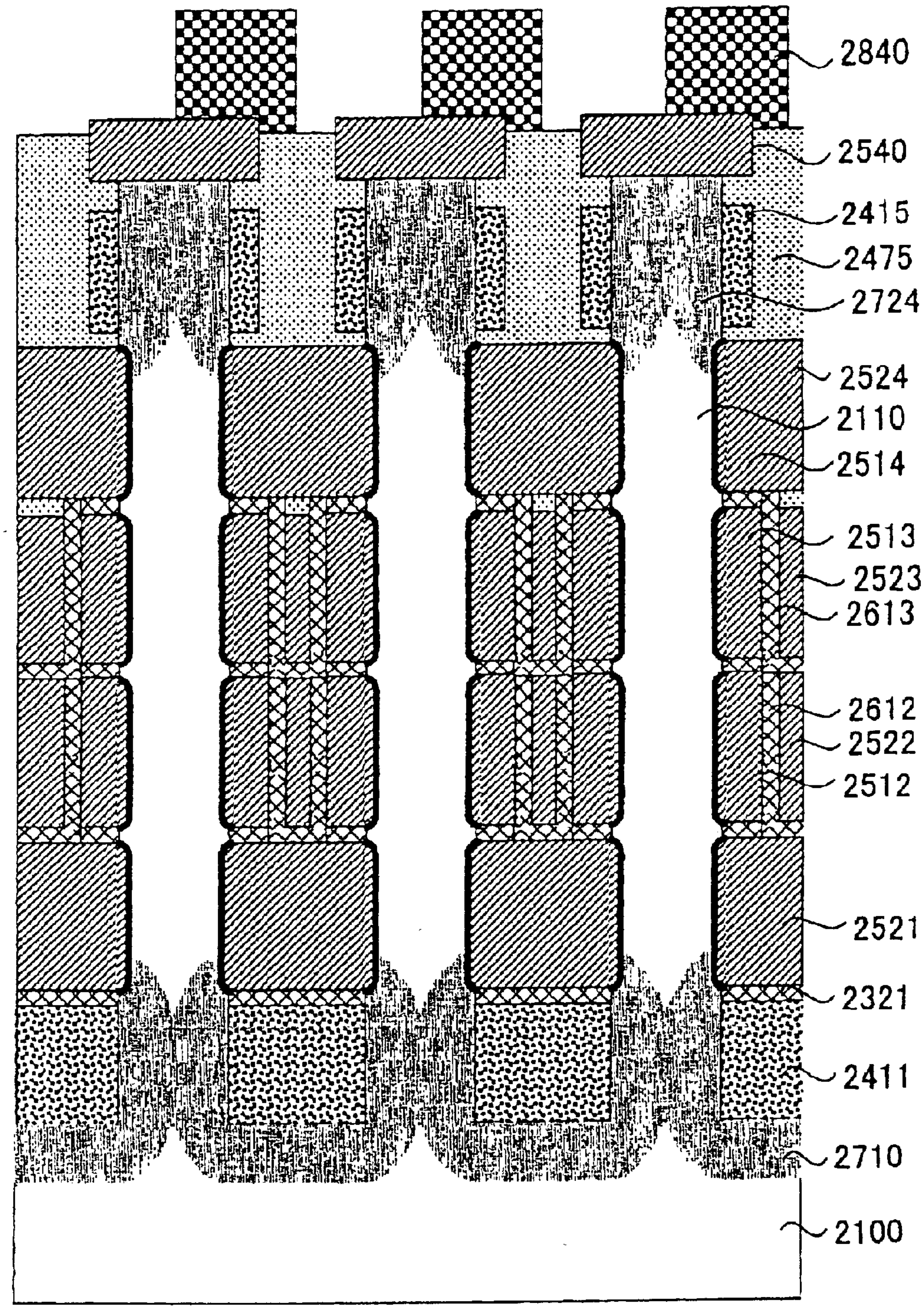
Figure 424:
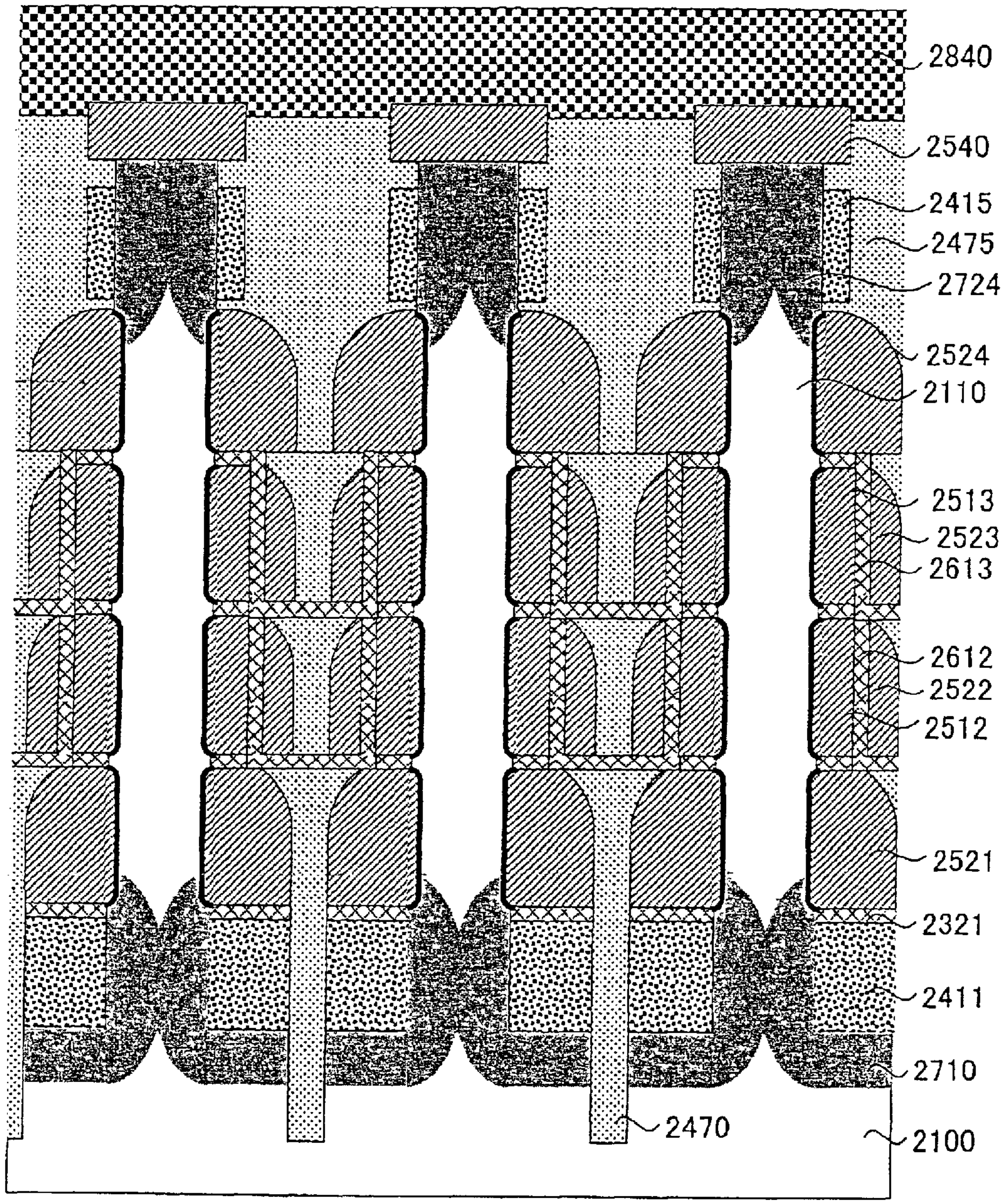

Then, the silicon nitride film 2330 (the fifth insulating film) and the silicon nitride film 2340 (the sixth insulating film) are removed by isotropic etching, for example, to expose the polysilicon film 2540. Subsequently, a silicon oxide film 2475 is deposited as an eleventh insulating film to a thickness of 100 to 500 nm on the top of the polysilicon film 2524. The top portion of the polysilicon film 2540 is exposed by etch-back or by CMP. A fourth wiring layer 2840 is formed so that its direction crosses the direction of the second or third wiring layer and is connected to the top portion of the island-like semiconductor layer 2110 (FIG. 402 and FIG. 424).

Thereafter, by known techniques, an interlayer insulating film is formed, and a contact hole and metal wiring are formed. Thereby, a semiconductor memory is realized which has a memory function according to the state of a charge in the charge storage layer which is the floating gate made of the polysilicon film (the first conductive film).

In this example, films formed on the surface of the semiconductor substrate or the polysilicon film such as the silicon nitride film (the fifth insulating film) 2330, the silicon nitride film (the sixth insulating film) 2340 and the silicon nitride film (the twelfth insulating film) 2350 may be formed of a layered film of a silicon oxide film/a silicon nitride film from the silicon surface.

With regard to the polysilicon films 2510 or 2511 to 2514 (the first conductive films), the polysilicon films 2520 or 2521 to 2524 (the second conductive films) and the polysilicon film 2540 (the fourth conductive film), impurity introduction may be carried out during or after the formation of the polysilicon films or after the separation of the polysilicon films. The timing of the impurity introduction to the polysilicon films is not particularly limited so long as these films become conductive films.

In this example, the control gates of the memory cells are formed continuously in one direction without using a mask. That is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

Further, by providing the selection gates in the top and the bottom of a set of memory cells, it is possible to prevent the phenomenon that a memory cell transistor is over-erased.

PRODUCTION EXAMPLE 14

In a semiconductor memory to be produced in this example, regions for forming charge storage layers are defined in advance by a laminated film comprising plural films, and then island-like semiconductor layers in a pillar form are formed by selective epitaxial silicon growth in trenches opened by using a photoresist mask. Laminated insulating films as charge storage layers are formed on the sides of the island-like semiconductor layers in the regions for forming the charge storage layers. The island-like semiconductor layers are each in an electrically floating state with respect to the semiconductor substrate. The active regions of the memory cells are electrically common.

In the semiconductor memory, selection gate transistors are disposed at the top and the bottom of the island-like semiconductor layer. A plurality of memory transistors, for example, two memory transistors, are placed between the selection gate transistors. The laminated insulating films of the memory transistors are formed at the same time. The transistors are connected in series along the island-like semiconductor layer. Further, the thickness of gate insulating films of the selection gate transistors is equal to the thickness of gate insulating films of the memory transistors.

FIGS. 425 to 437 and FIGS. 438 to 450 are sectional views taken on line A-A' and line B-B', respectively, in FIG. 12 which is a plan view illustrating an EEPROM memory cell array.

Figure 425:
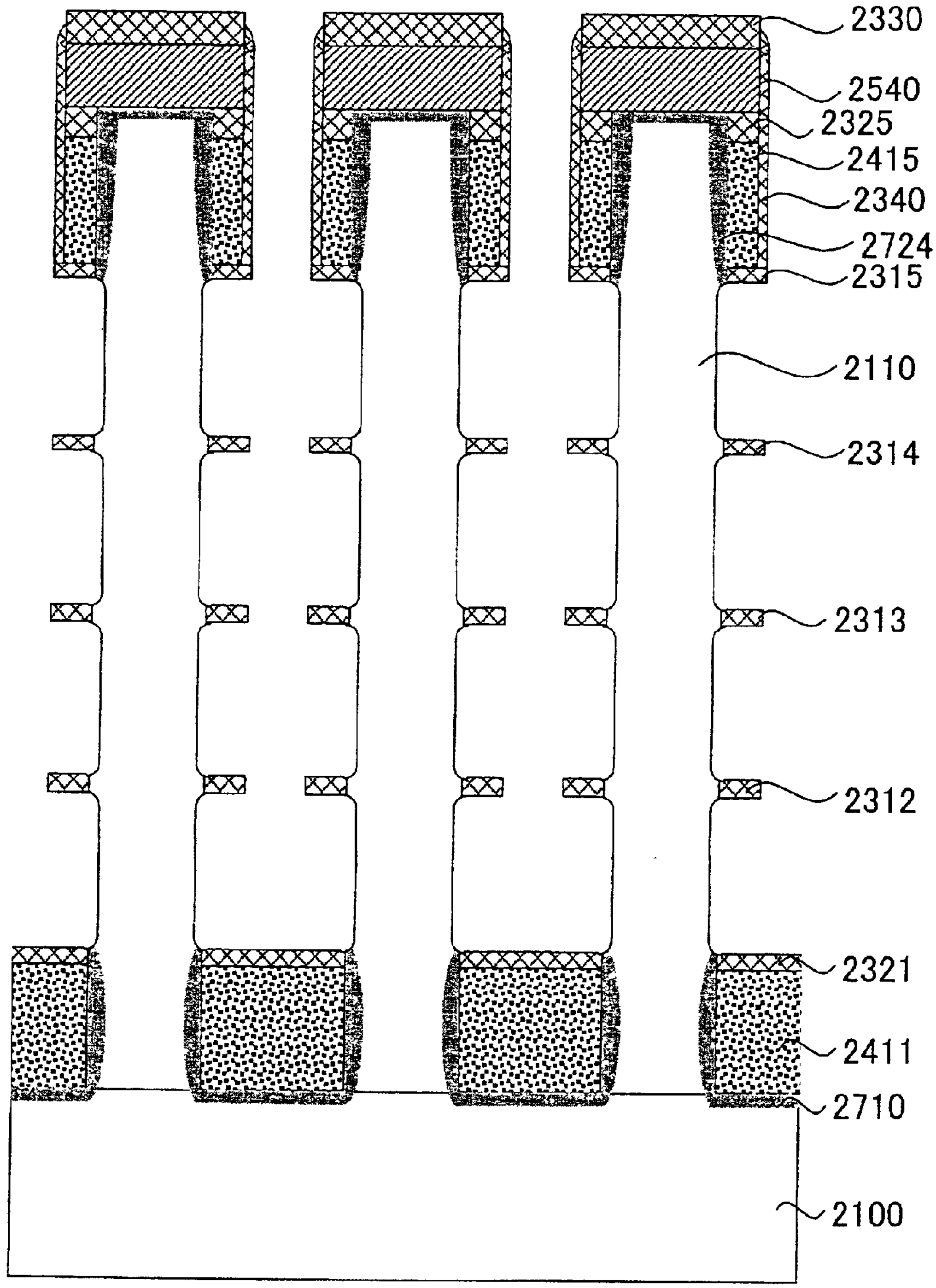
Figure 438:
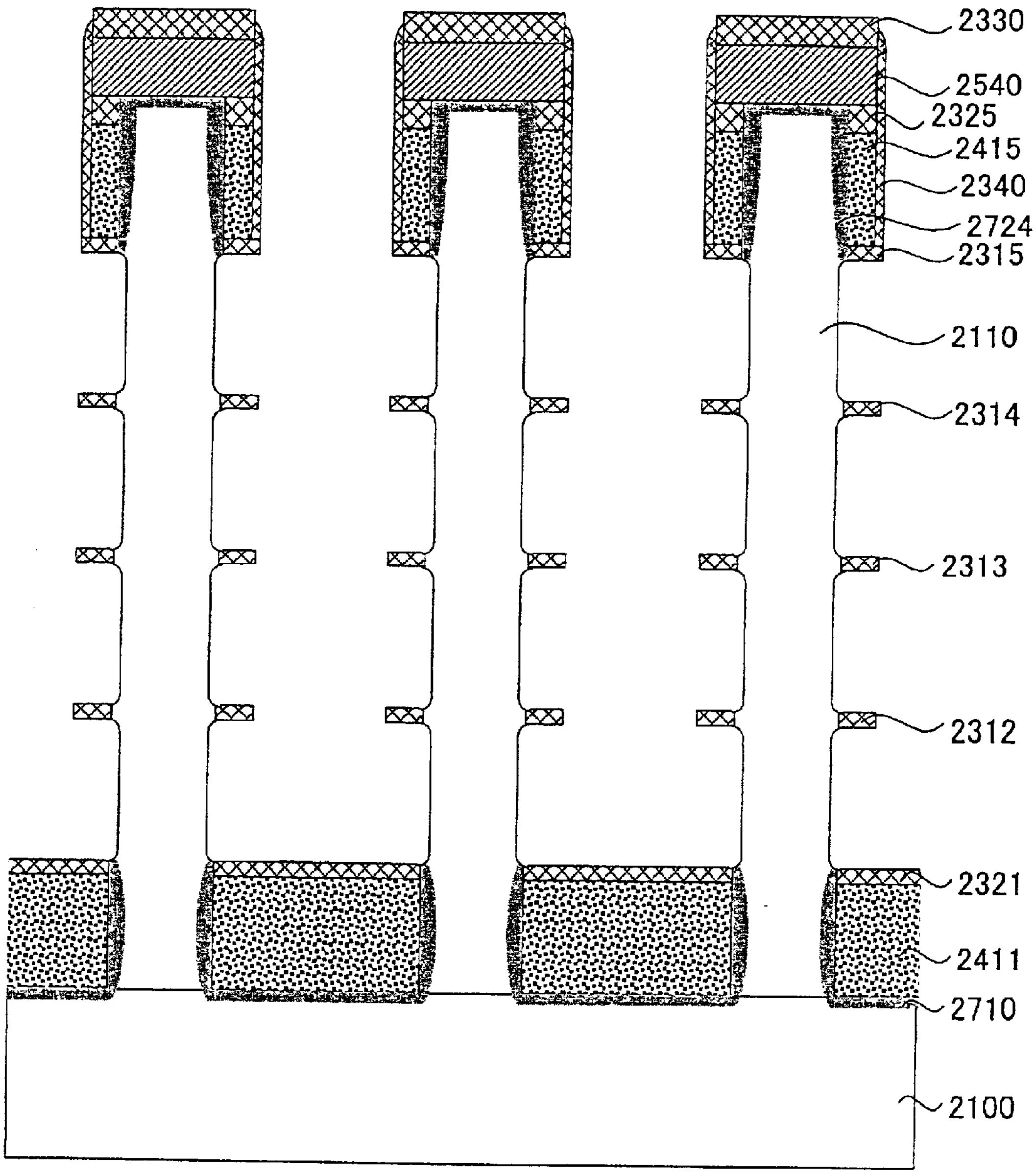

In this example, production steps are the same as those in Production Example 13 (FIGS. 381 to 390 and FIGS. 403 to 412) before the formation of the thermally oxidized film 2450 of 10 to 100 nm thick as the ninth insulating film by the oxidation of the surface of the island-like semiconductor layer 2110 and the removal of the thermally oxidized film 2450 by isotropic etching from the periphery of the island-like semiconductor layer 2110 (FIGS. 425 and 438).

Figure 426:
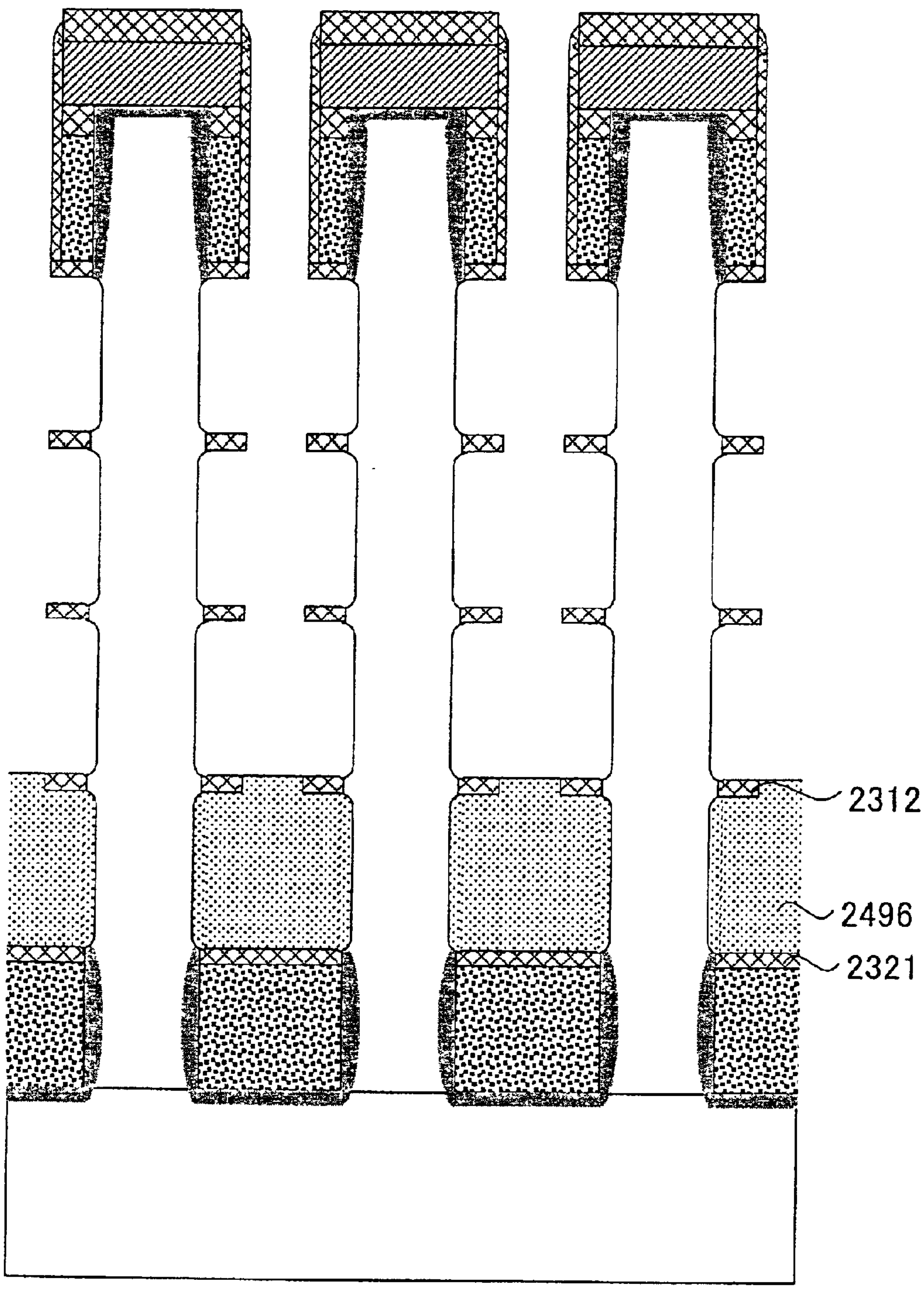
Figure 439:
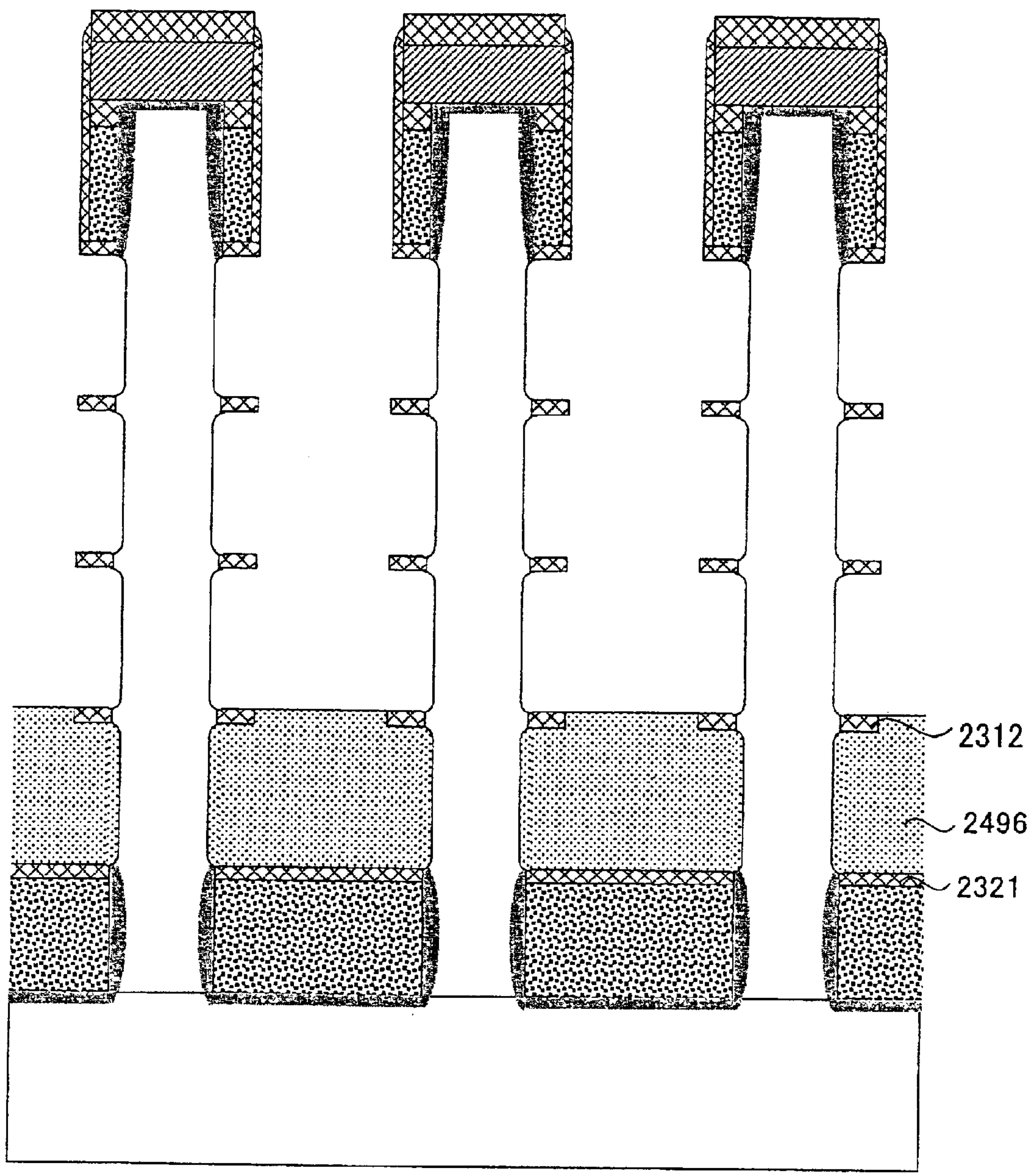

Subsequently, a silicon oxide film 2496, for example, is deposited as a twenty-fourth insulating film to a thickness of 50 to 500 nm by CVD and is etched back to such a degree that the silicon nitride film 2312 (the second insulating film) is exposed, thereby burying the silicon oxide film 2496 (FIGS. 426 and 439).

Figure 427:
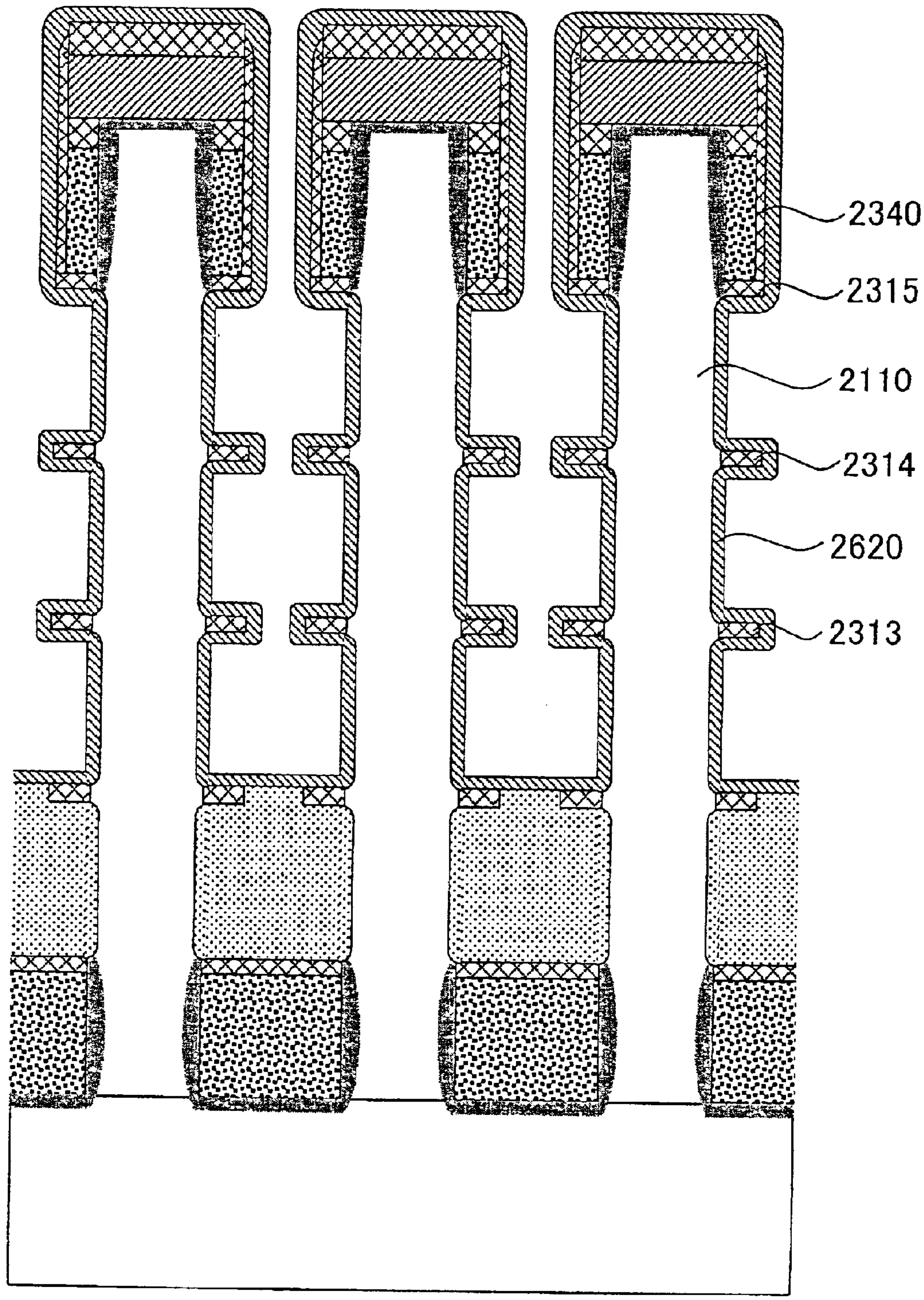
Figure 440:
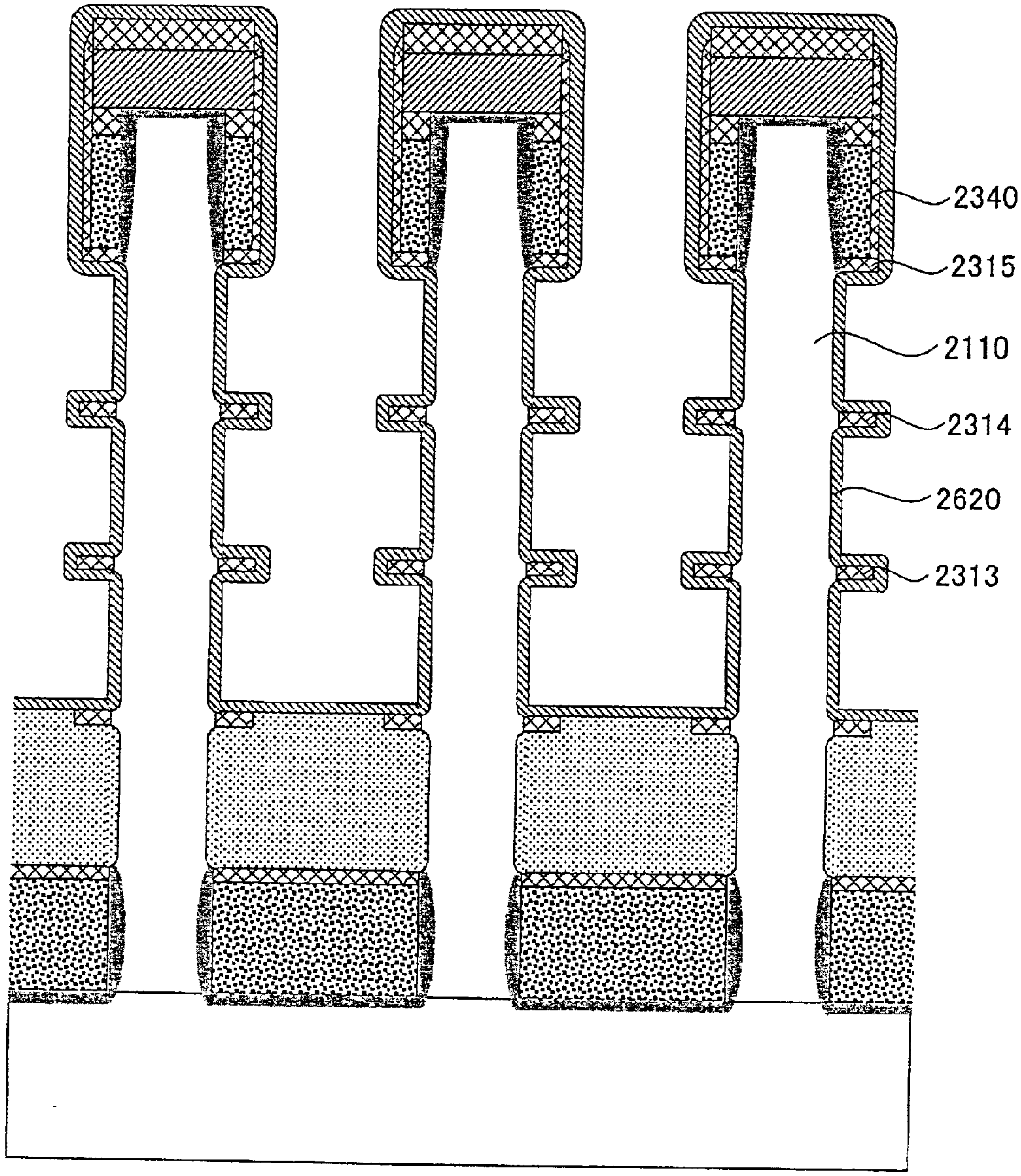

A laminated insulating film 2620 to be a charge storage layer is formed by thermal oxidation on the periphery of each island-like semiconductor layer 2110, the silicon nitride film 2340 (the sixth insulating film) and the silicon nitride films 2313 to 2315 (the second insulating films) (FIGS. 427 and 440). In order to form a laminated insulating film of a MNOS structure, a silicon nitride film of 4 to 10 nm thickness and a silicon oxide film of 2 to 5 nm thickness may be formed sequentially on the surface of the island-like semiconductor layer 2110 by CVD. Alternatively, a silicon nitride film of 4 to 10 nm thickness is deposited on the surface of the island-like semiconductor layer by CVD and the surface of the silicon nitride film may be oxidized to form a silicon oxide film of 2 to 5 nm thickness. Further, in order to form a laminated insulating film of a MONOS structure, a silicon oxide film of 2 to 5 nm thickness, a silicon nitride film of 4 to 8 nm thickness and a silicon oxide film of 2 to 5 nm thickness are sequentially deposited on the surface of the island-like semiconductor layer by CVD. Alternatively, a silicon oxide film of 2 to 5 nm thickness and a silicon nitride film of 4 to 10 nm thickness are sequentially deposited by CVD on the surface of the island-like semiconductor layer 2110, and then the surface of the silicon nitride film may be oxidized to form a silicon oxide film of 2 to 5 nm thickness, or alternatively, the surface of the island-like semiconductor layer may be oxidized to form a silicon oxide film of 2 to 5 nm thickness. These processes may be combined in any way.

Figure 428:
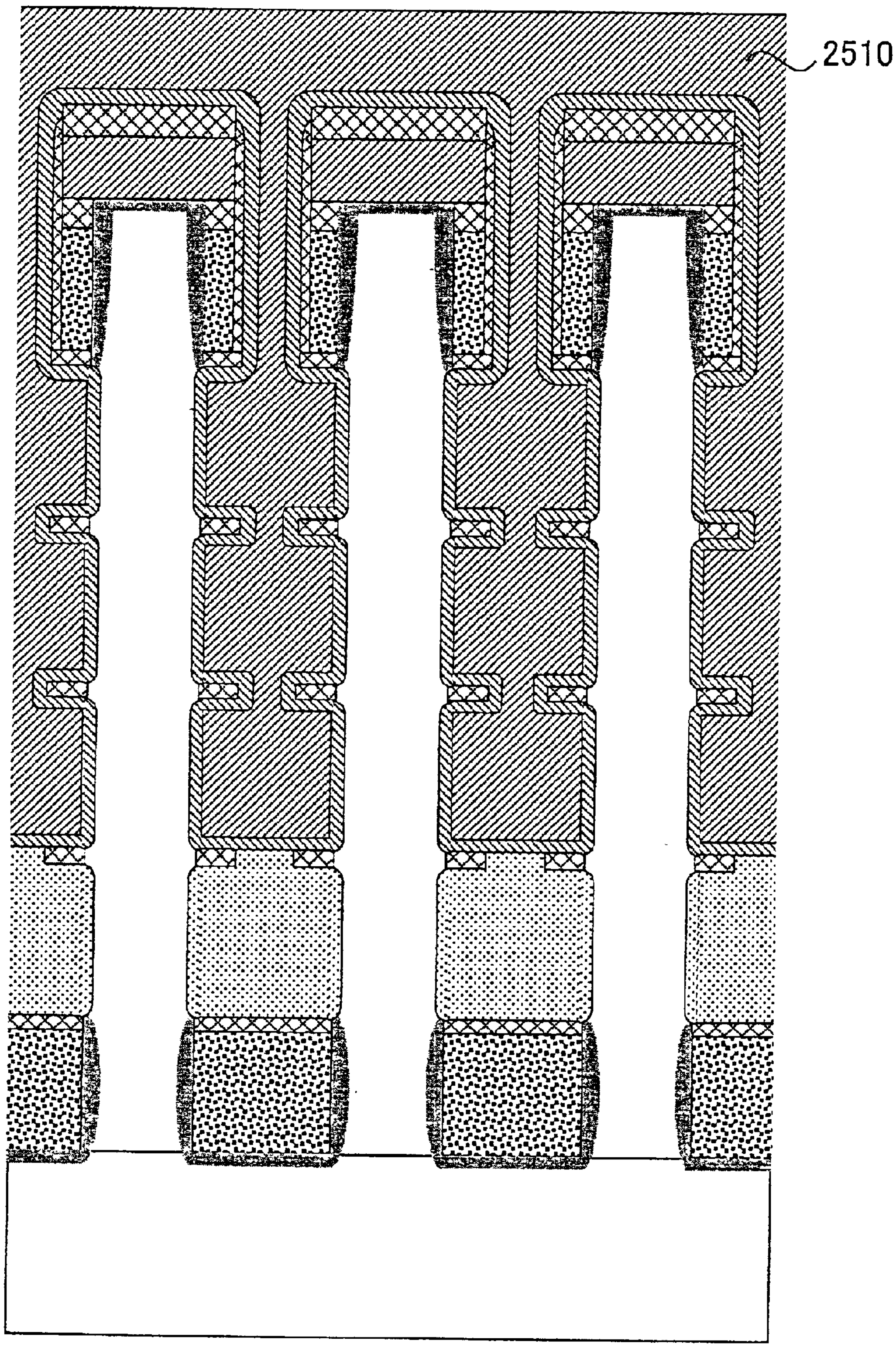
Figure 441:
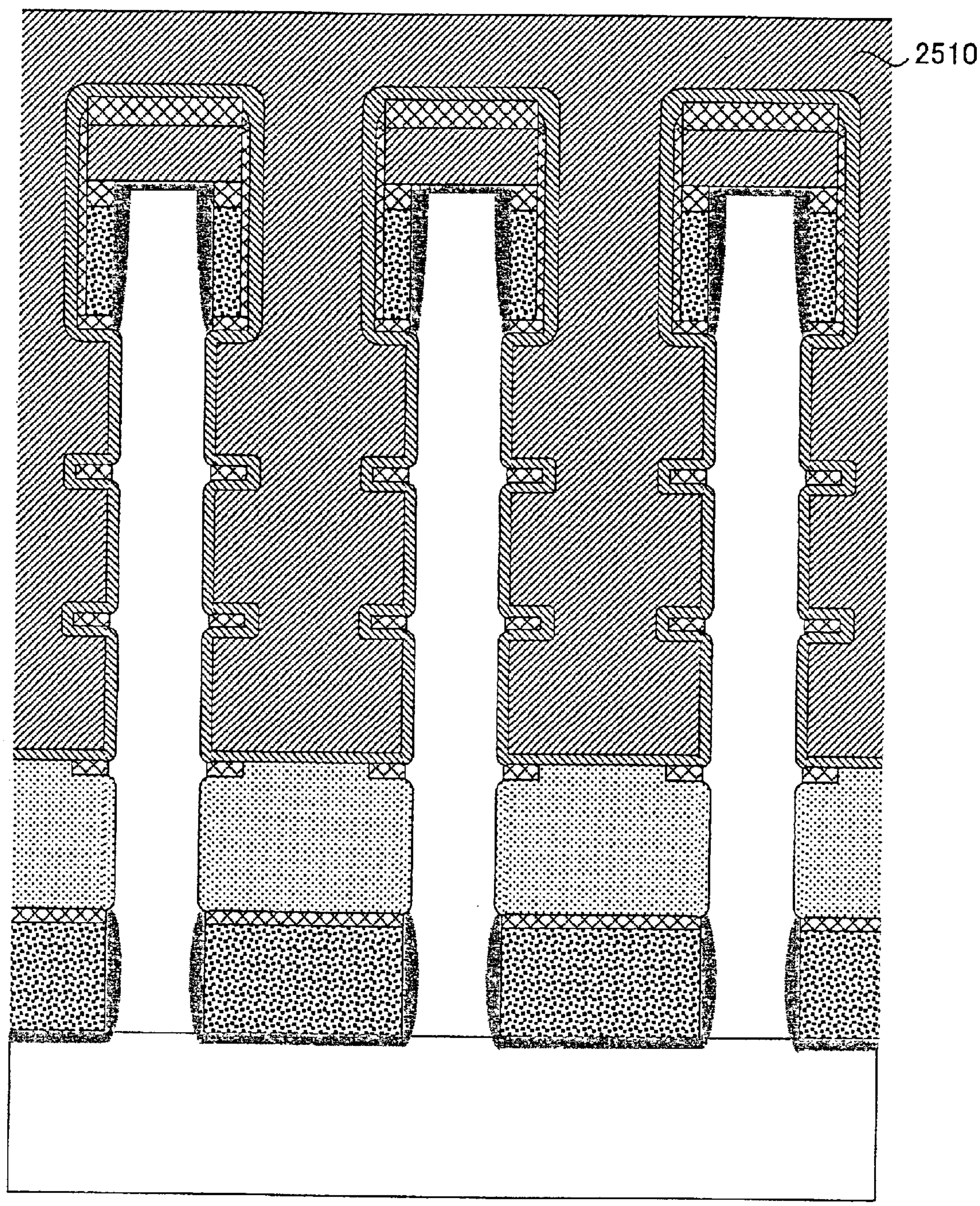

Then, a polysilicon film 2510, for example, is deposited as a first conductive film to a thickness of about 50 to 500 nm (FIGS. 428 and 441).

Figure 429:
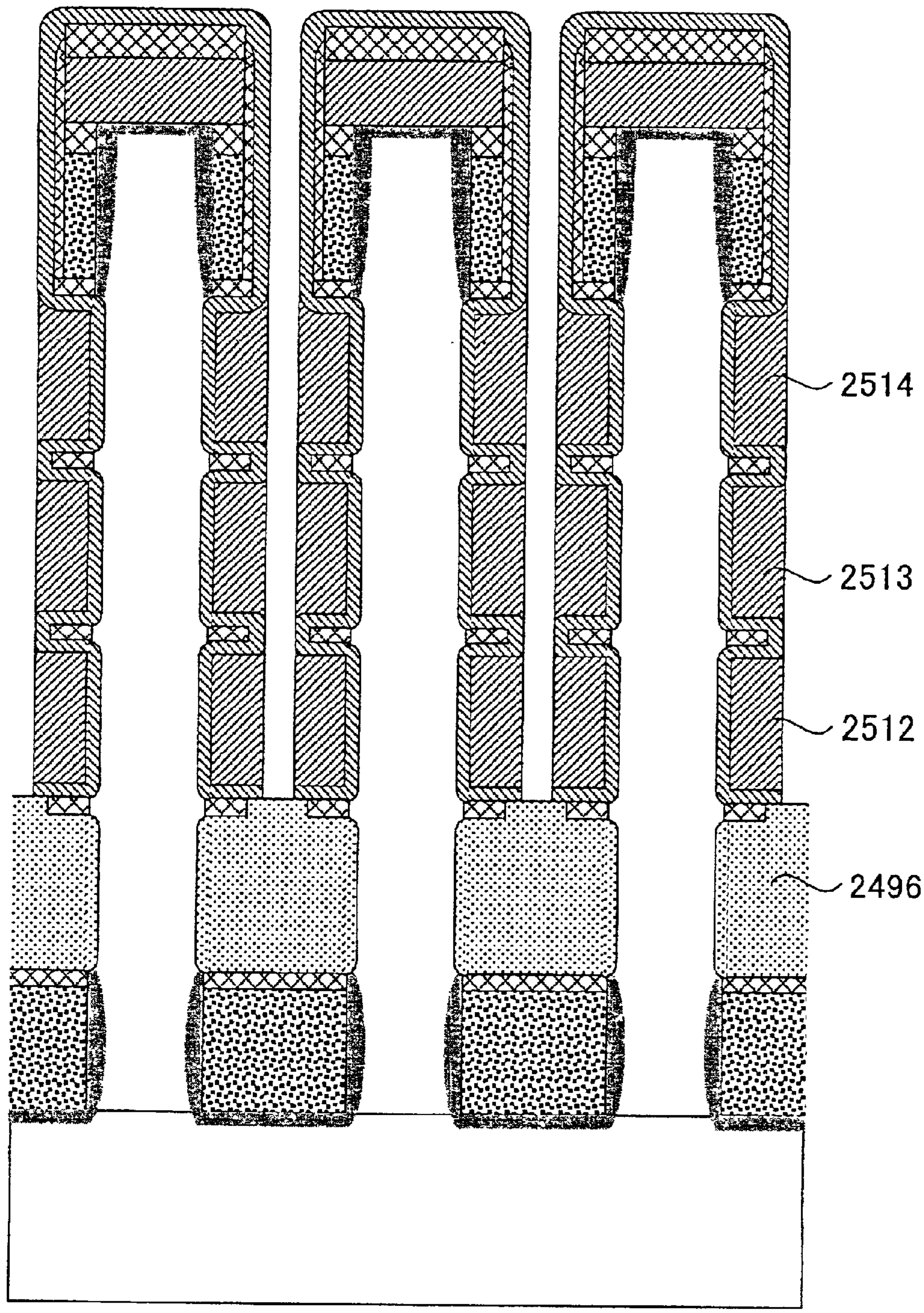
Figure 442:
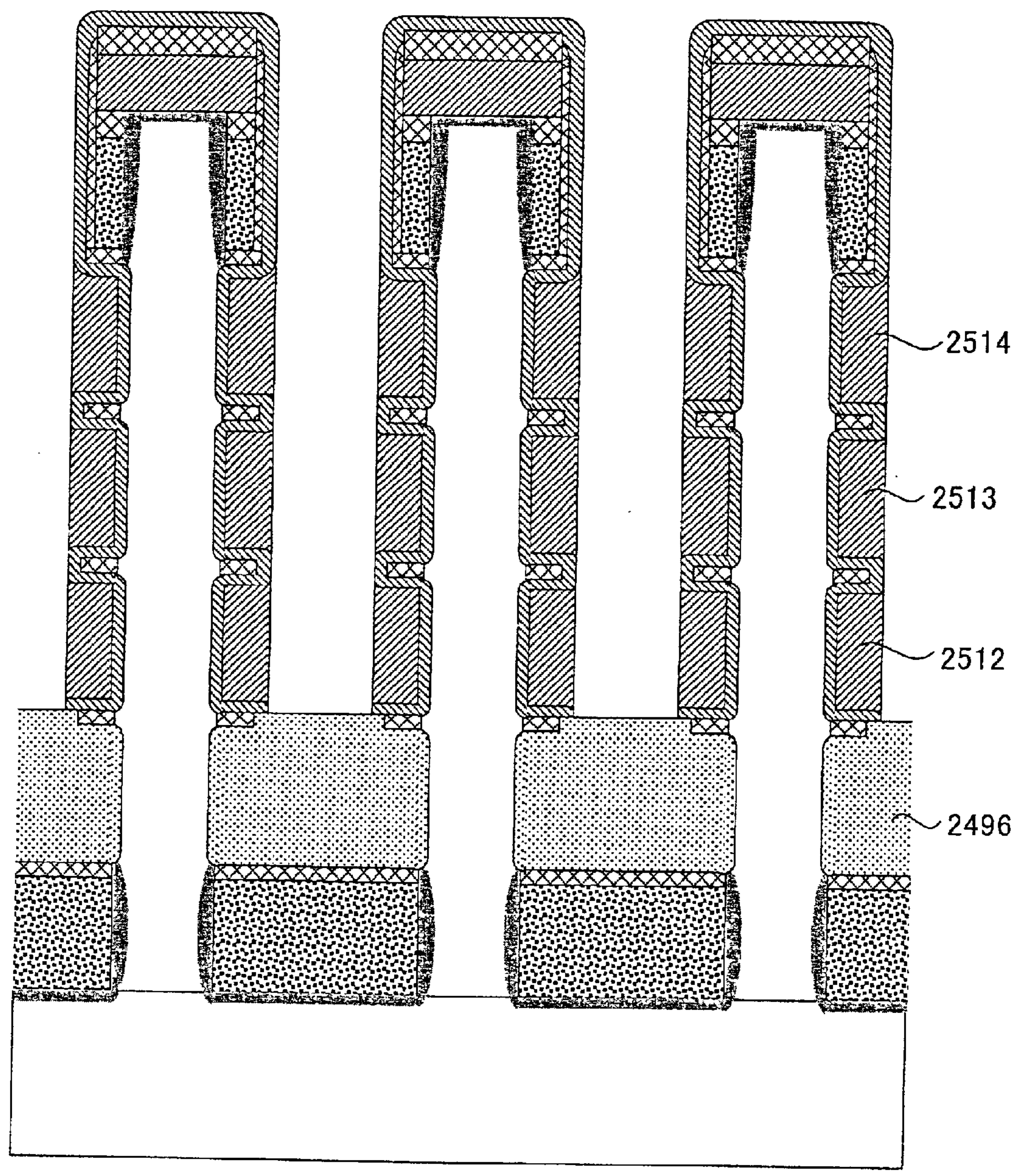

Using the silicon nitride film 2330 (the fifth insulating film), the silicon nitride film 2340 (the sixth insulating film) and the silicon nitride films 2314, 2313 and 2312 (the second insulating films) as a mask, the polysilicon film 2510 (the first conductive film) is divided into polysilicon films 2512, 2513 and 2514 by, for example, anisotropic etching (FIGS. 429 and 442).

Then, the silicon oxide film 2496 is removed to expose the island-like semiconductor layer 2110. Further, a silicon oxide film 2491 is formed as an eighteenth insulating film to be a selection gate oxide film to a thickness of about 10 nm by, for example, thermal oxidization. The eighteenth insulating film, however, may be formed of not only a thermally oxidized film but also a CVD oxide film or a nitrogen oxide film.

Subsequently, a polysilicon film 2521, for example, is deposited as a second conductive film to a thickness of 15 to 150 nm.

Figure 430:
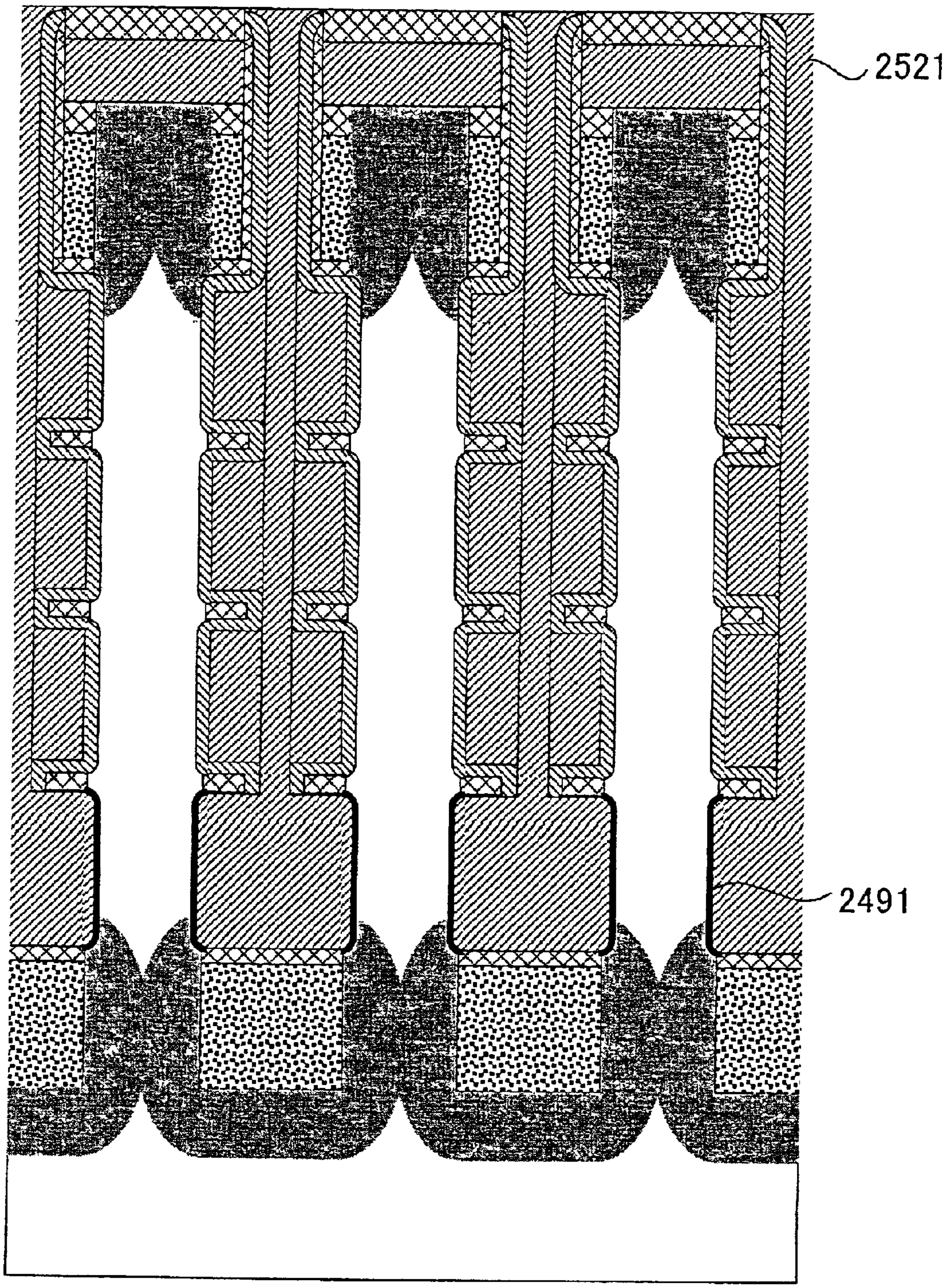
Figure 431:
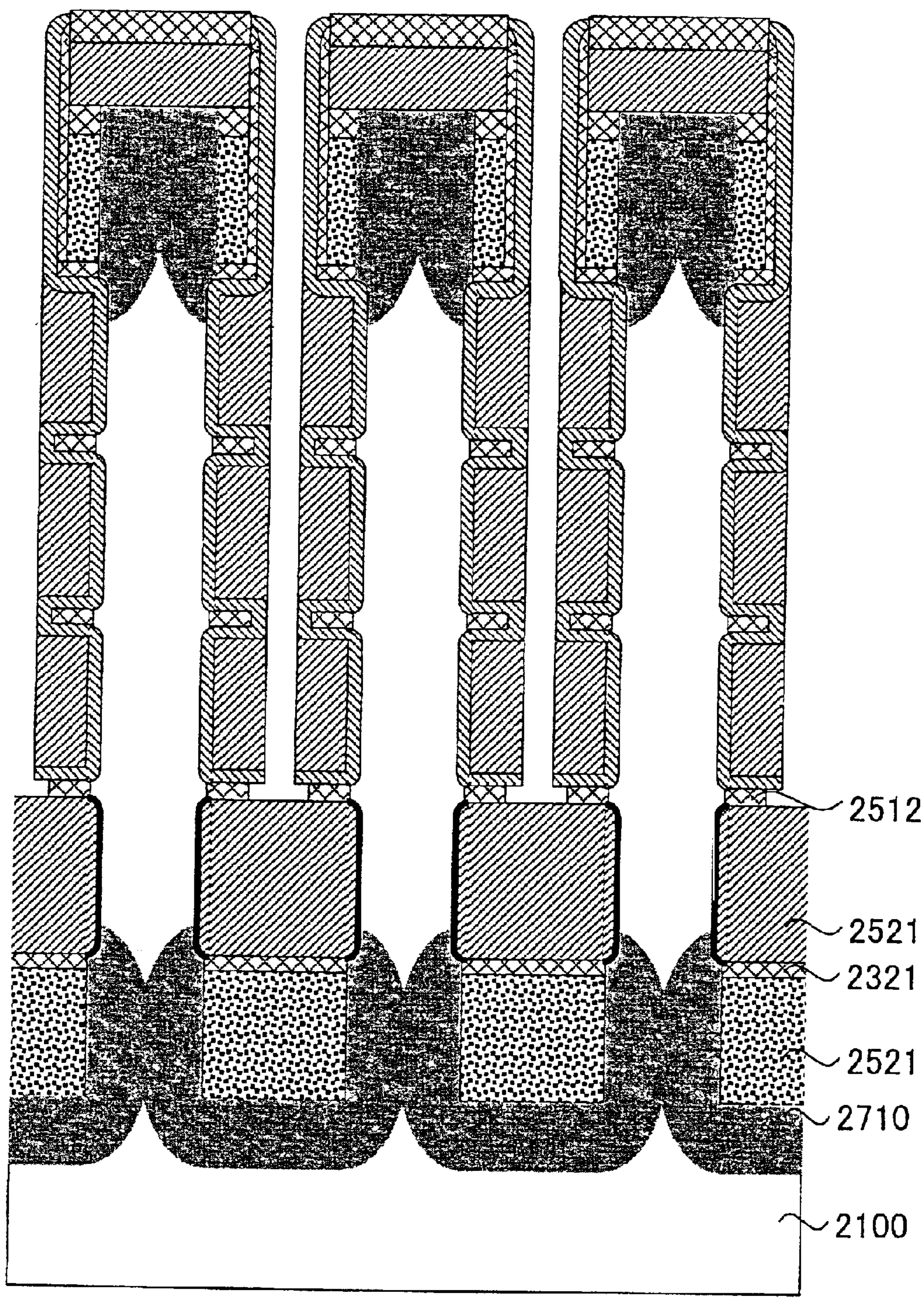
Figure 432:
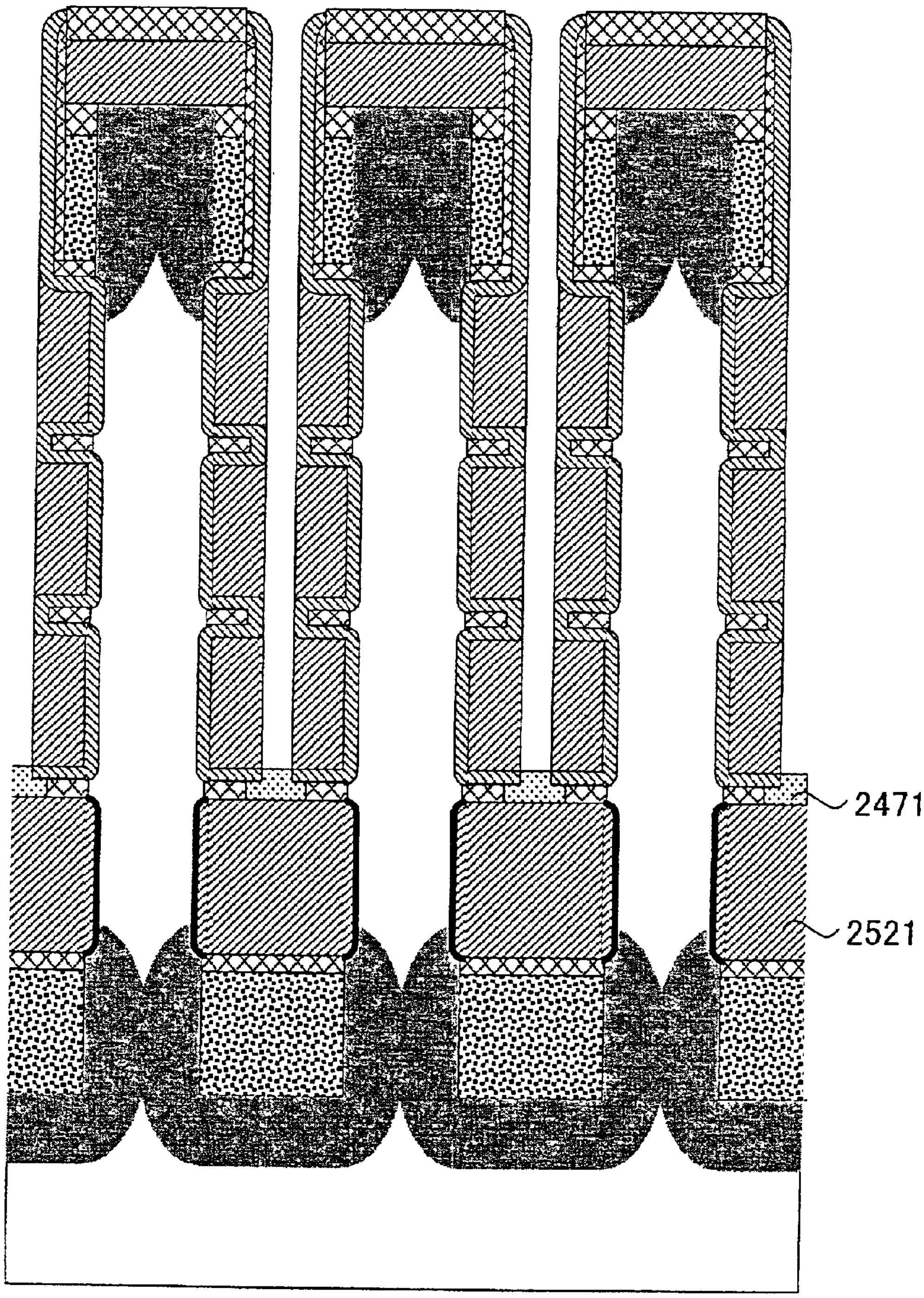
Figure 433:
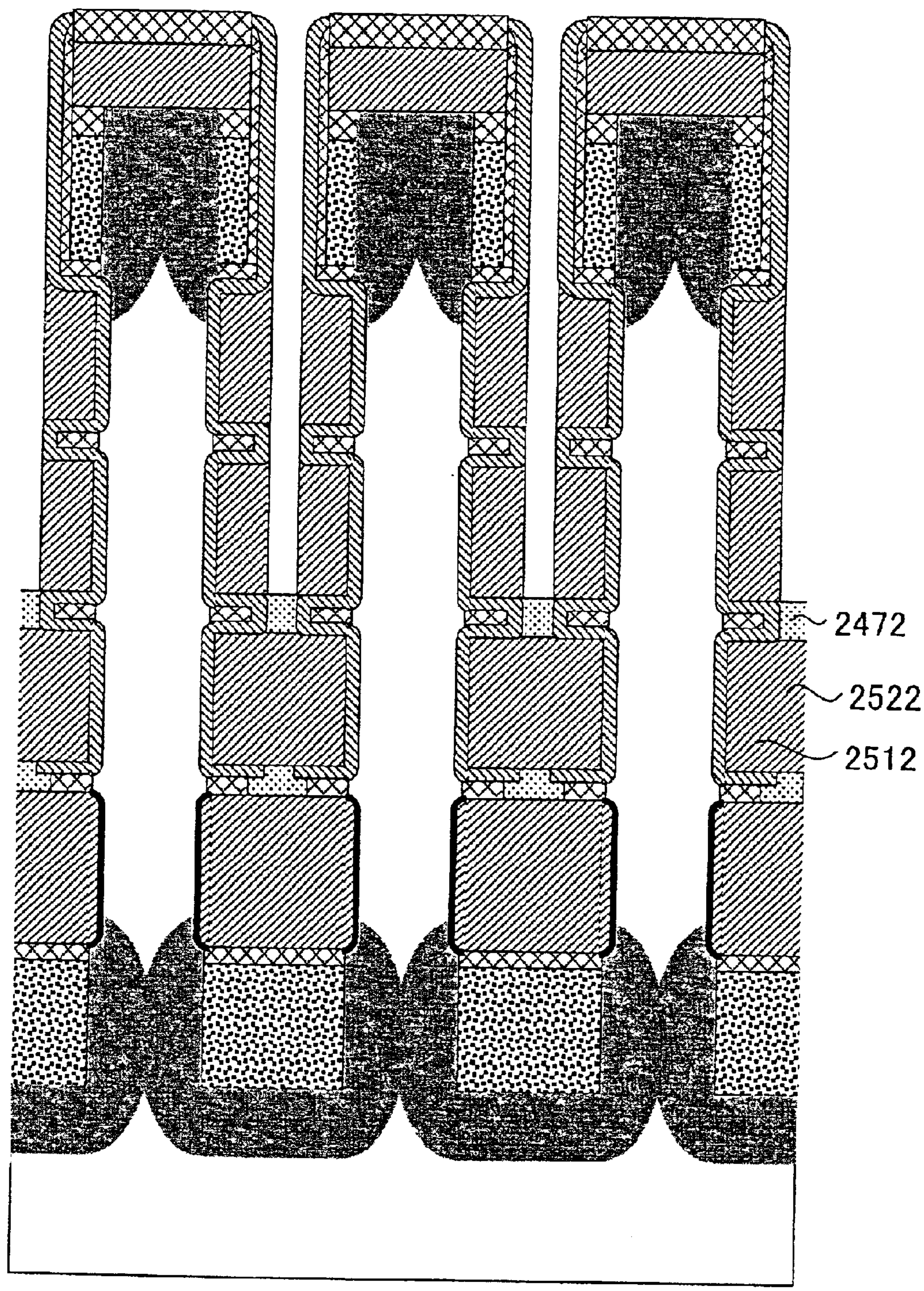
Figure 443:
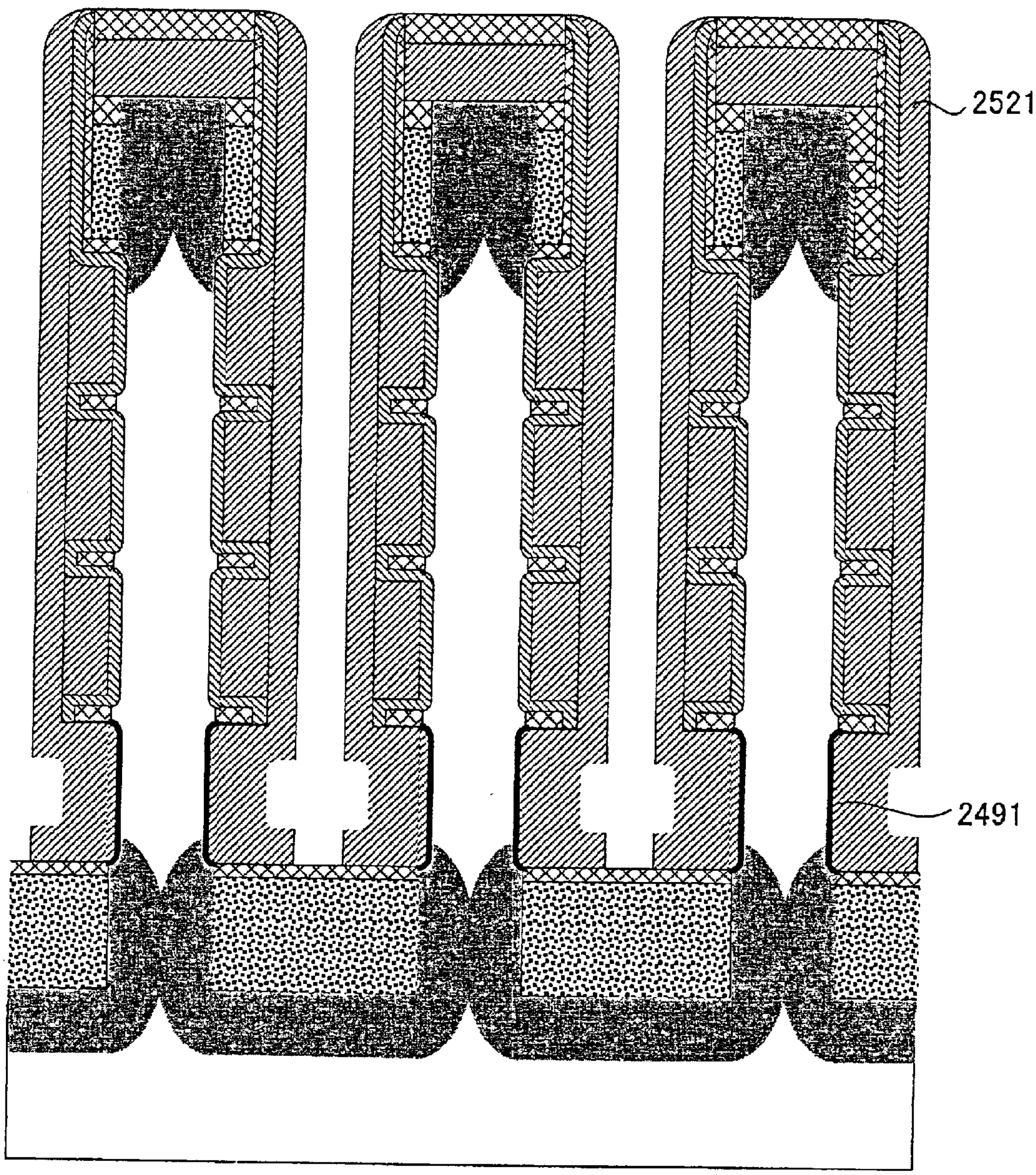
Figure 444:
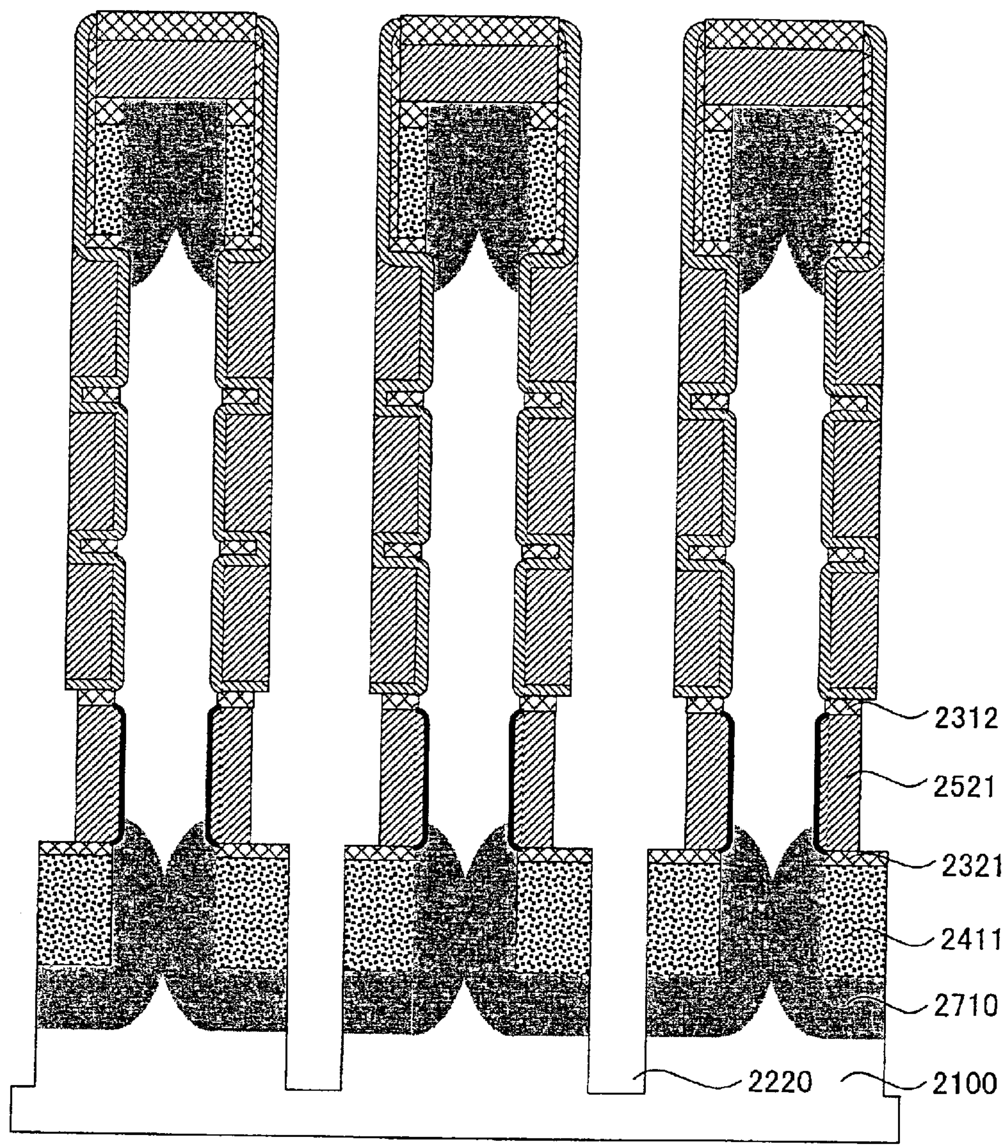

As shown in FIG. 443, the polysilicon film 2521 is then etched back by anisotropic etching (FIGS. 430 and 443).

Then, the silicon nitride film 2321 (the fourth insulating film), the silicon oxide film 2411 (the first insulating film) and the P-type silicon substrate 2100 are successively etched to form a second trench 2200 in the P-type silicon substrate 2100 in self-alignment with the polysilicon film 2521 (the second conductive film), thereby separating the impurity diffusion layer 2710. That is, a separation portion of the first wiring layer is formed in self-alignment with a separation portion of the second conductive film. It is also possible that the polysilicon film 2521 is anisotropically etched back at least from the bottom surface of the first conductive film 2512 and a silicon oxide film is buried therein by CVD only in the direction in which the intervals between the island-like semiconductor layers 2110 are smaller, and then the second trench 2220 may be opened in self-alignment using the silicon oxide film as a mask.

Subsequently, the polysilicon film 2521 is etched back to such a degree that the polysilicon film 2521 is able to contact the polysilicon film 2511 to form a selection gate. At this time, by setting the intervals between the island-like semi conductor layers 2110 in a direction of A-A' in FIG. 12 to a predetermined value or smaller, the polysilicon film 2521 is formed into a second wiring layer to be a selection gate line continuous in the direction without need to use a masking process.

Figure 423:
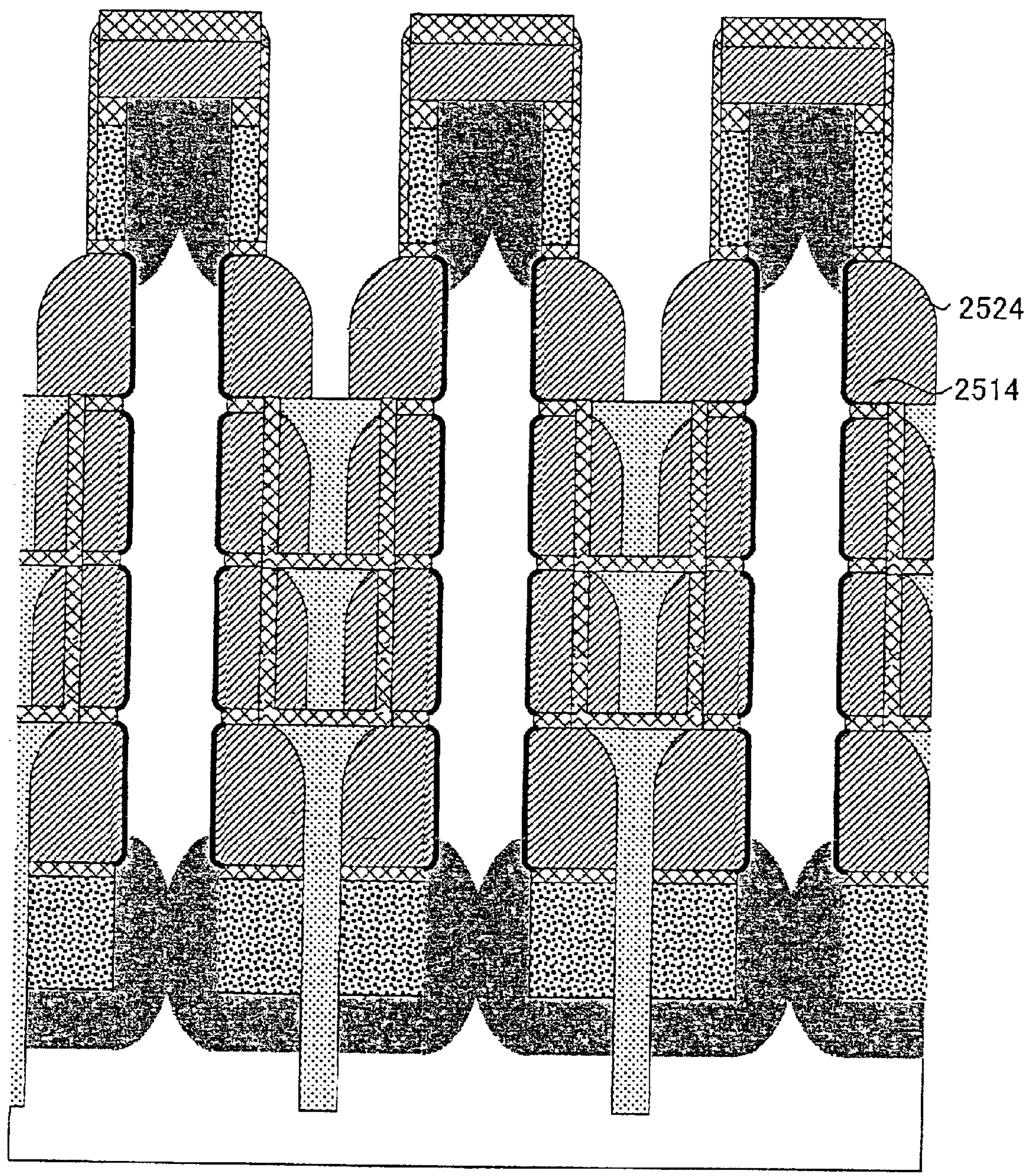
Figure 445:
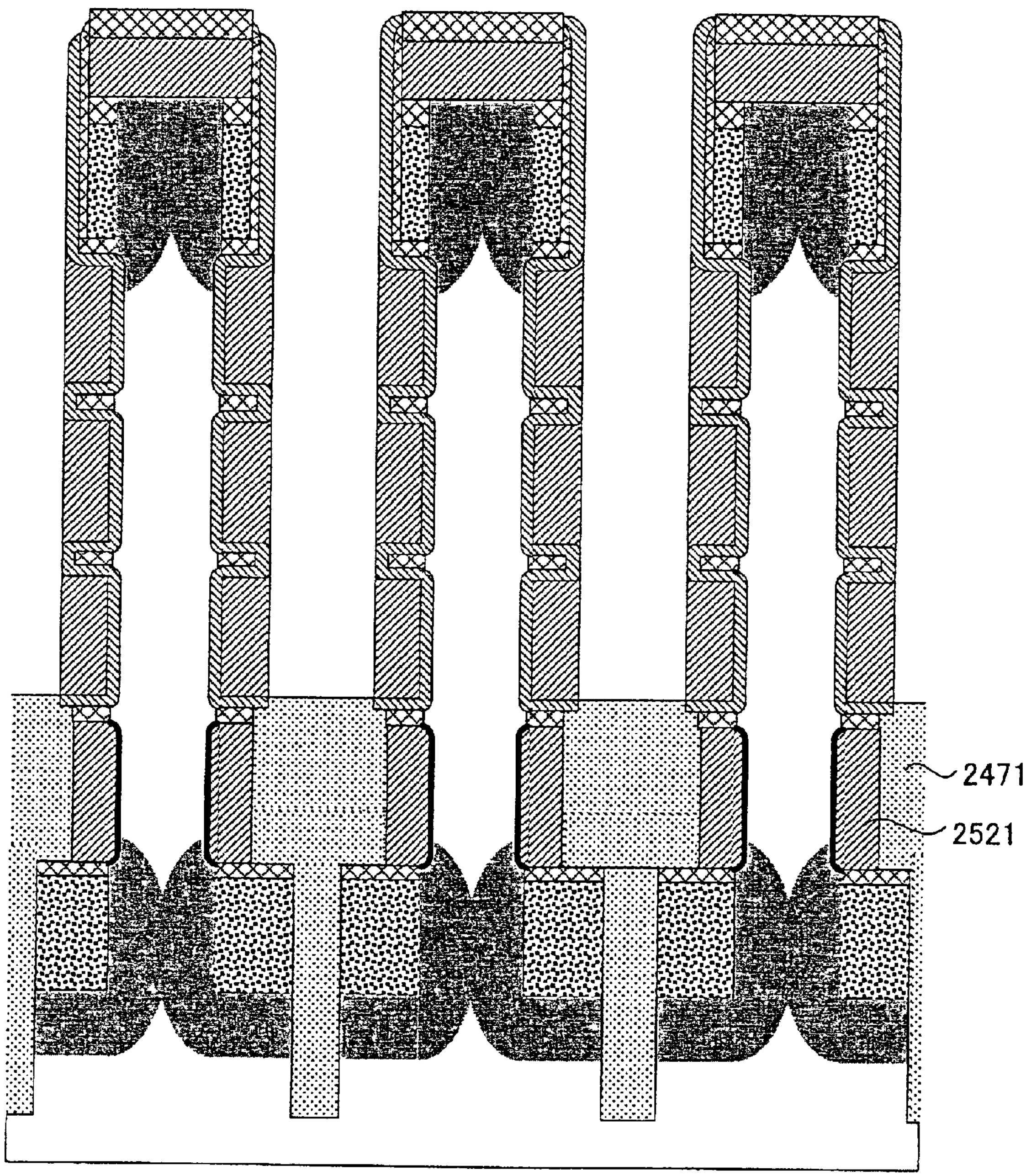
Figure 446:
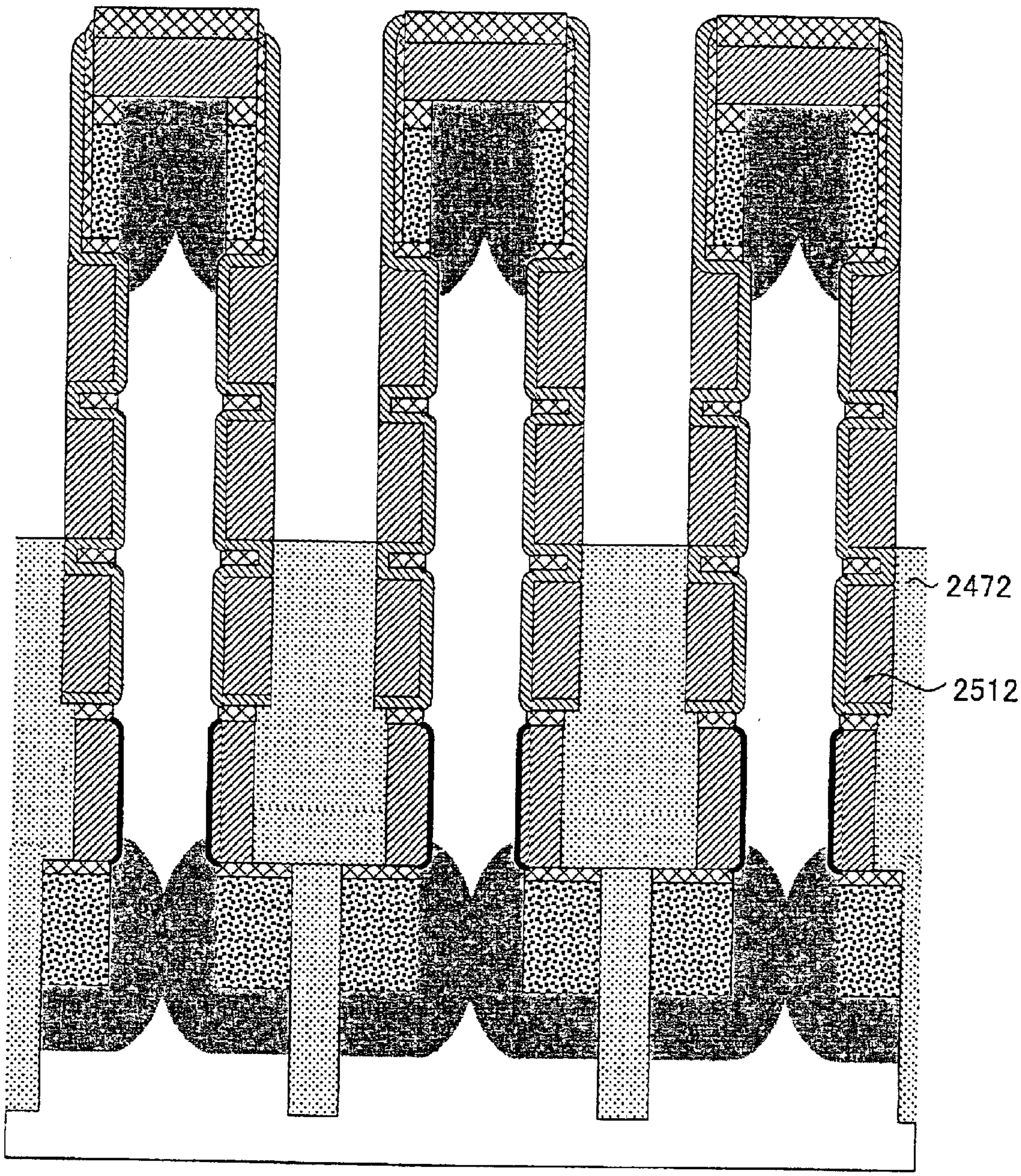

Then, a silicon oxide film 2471, for example, is buried as an eleventh insulating film. At this time, the silicon oxide film 2471 is so buried that at least the polysilicon film 2512 (the first conductive film) is exposed (FIGS. 423 and 445).

Subsequently, in the same manner, a polysilicon film (a second conductive film) 2522 is deposited to a thickness of 15 to 150 nm and etched back so that the polysilicon film 2522 is disposed on the side of the polysilicon film (the first conductive film) 2512. A silicon oxide film 2472 is formed as an eleventh insulating film so that at least the polysilicon film 2513 (the first conductive film) is exposed. By repeating likewise, a polysilicon film 2523 is deposited as a second conductive film to a thickness of 50 to 500 nm and etched back to remain on the side of the polysilicon film 2513.

Figure 434:
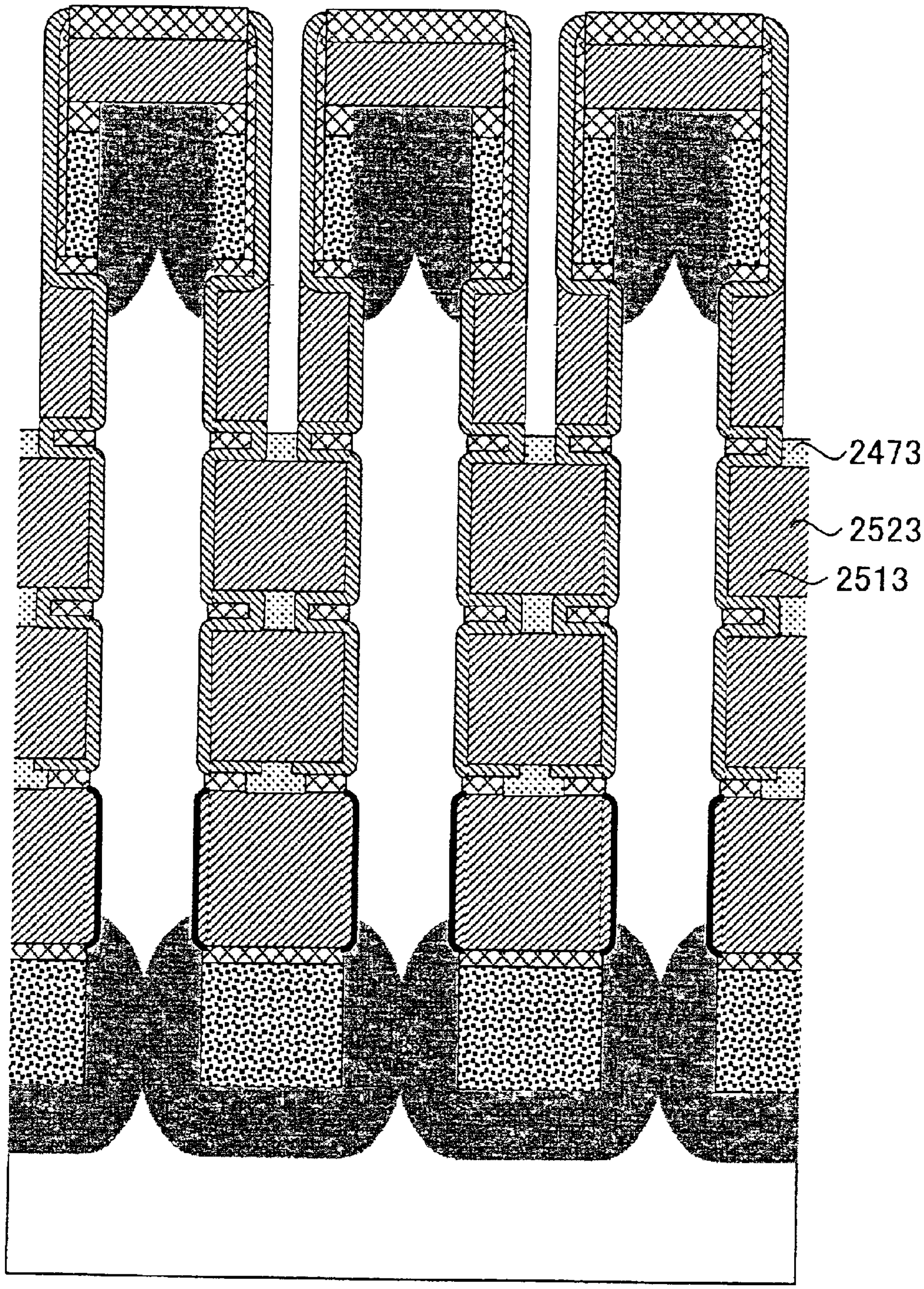
Figure 447:
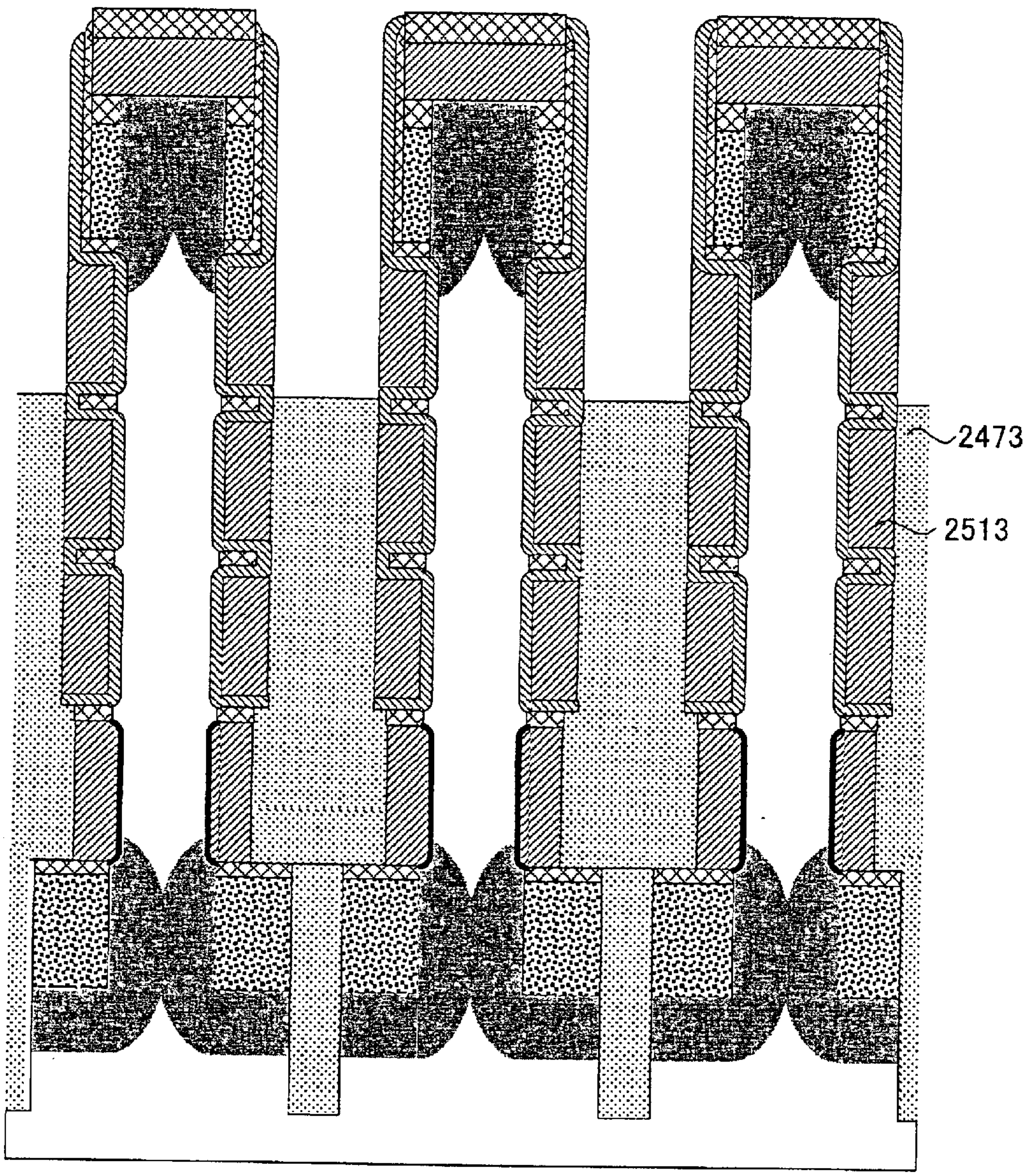

Thereafter, a silicon oxide film 2473, for example, is buried as an eleventh insulating film. At this time, the silicon oxide film 2473 is so buried that at least the polysilicon film 2514 (the first conductive film) is exposed (FIGS. 434 and 447).

Then, the polysilicon film 2514 and the laminated insulating film 2620 which is not covered with the silicon oxide film 2473 are removed, thereby exposing the island-like semiconductor layer 2110.

Figure 435:
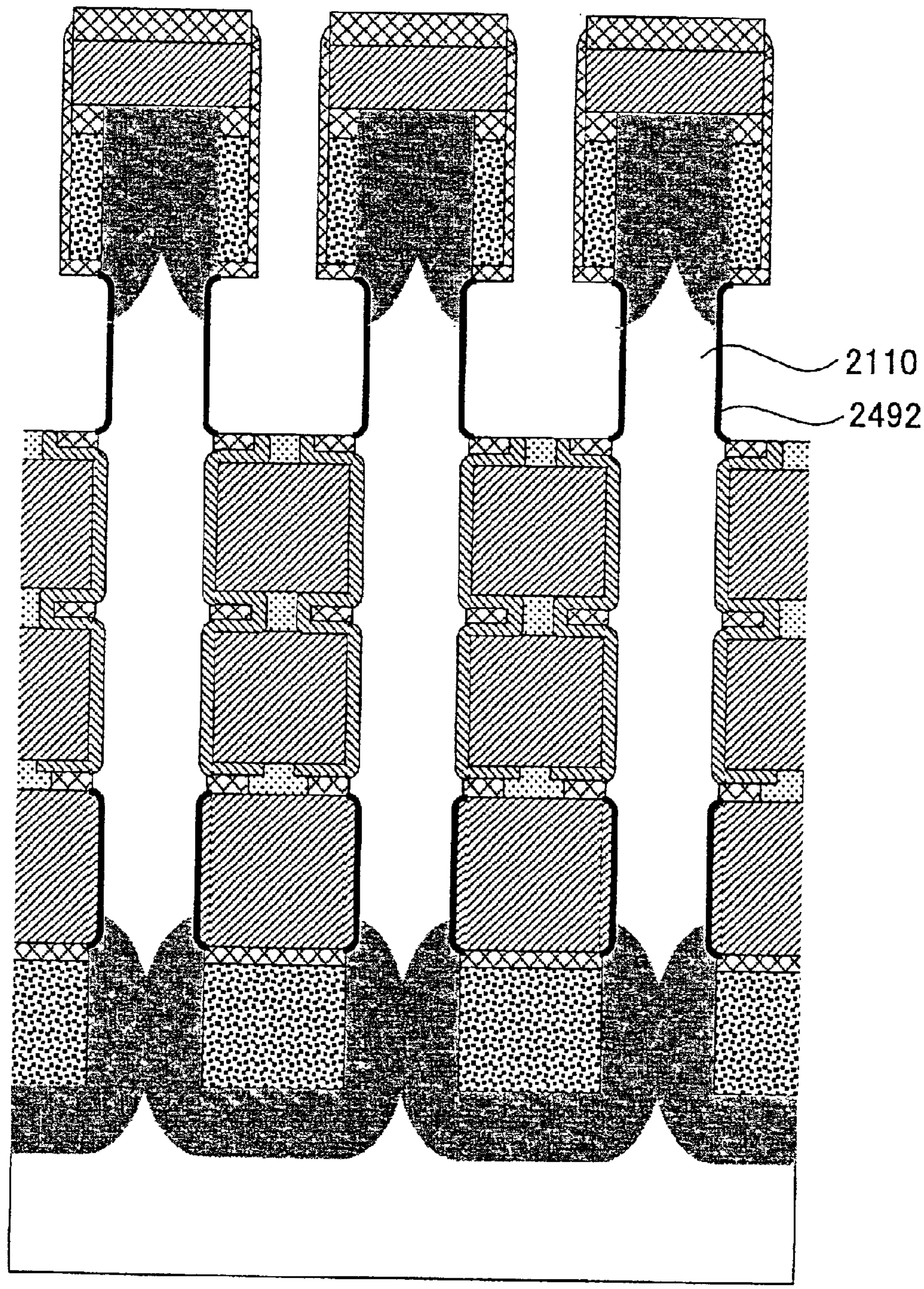
Figure 448:
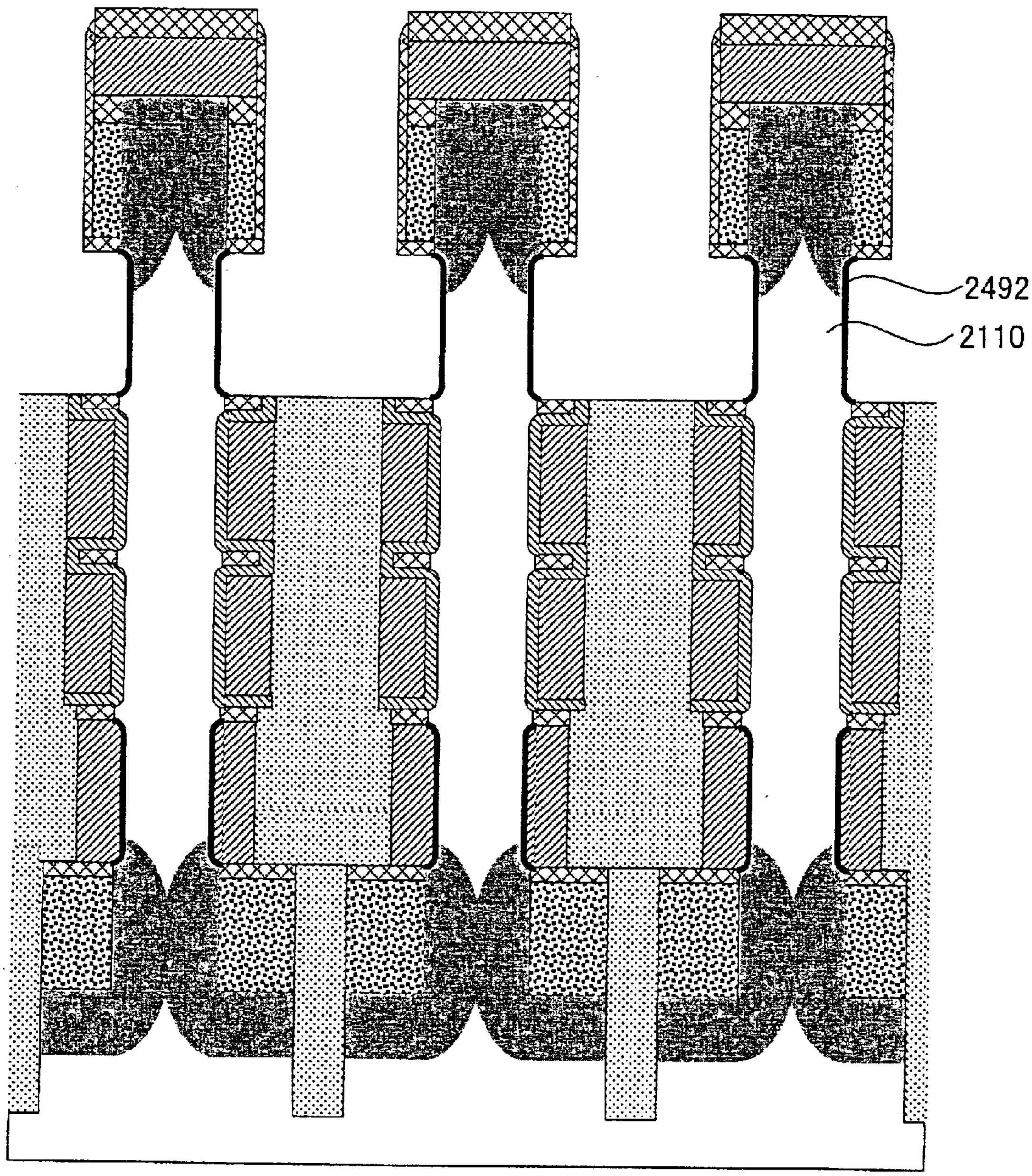

Further, a silicon oxide film 2492, for example, is formed as an eighteenth insulating film to be a selection gate oxide film to a thickness of about 10 nm, for example, by thermal oxidation (FIGS. 435 and 448). The eighteenth insulating film, however, may be formed of not only a thermally oxidized film but also a CVD oxide film or a nitrogen oxide film.

Figure 436:
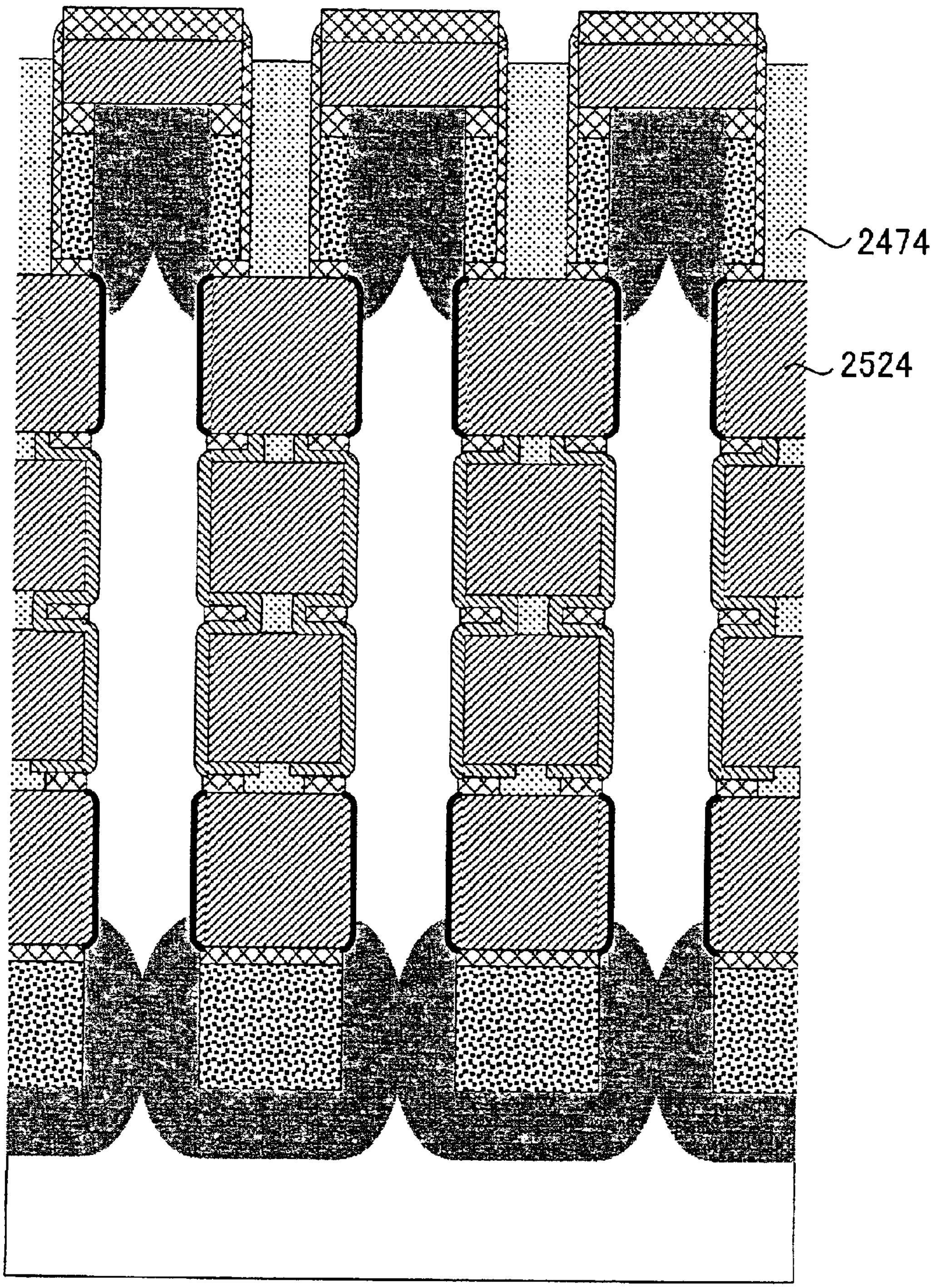
Figure 449:
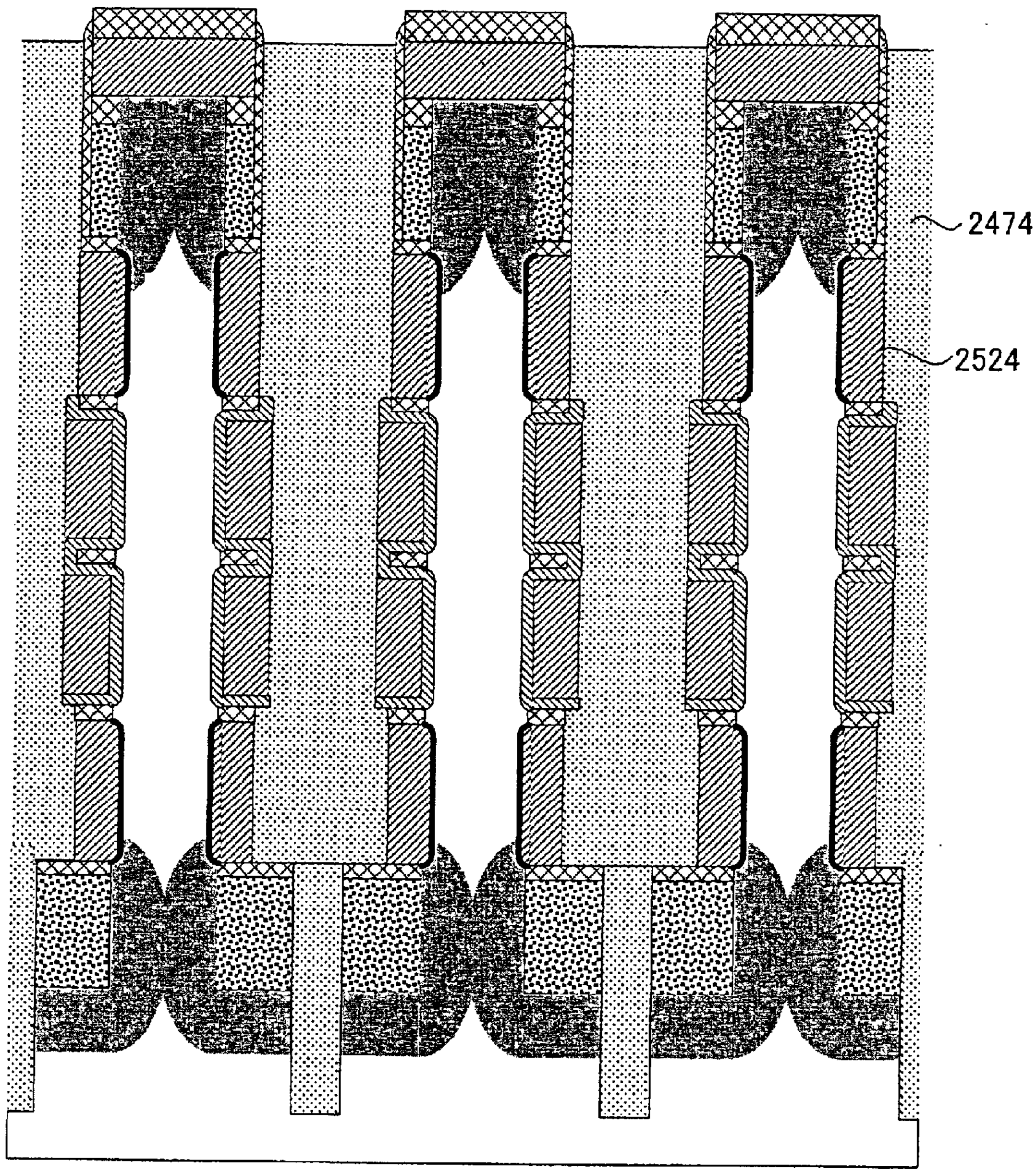

Subsequently, a polysilicon film 2524 is deposited as a second conductive film to a thickness of 50 to 500 nm, and then etched back. A silicon oxide film 2474 is deposited as an eleventh insulating film to a thickness of 100 to 500 nm on the top of the polysilicon film 2524, and then etched back to a level lower than the top surface of the polysilicon film 2540 (FIGS. 436 and 449).

Figure 437:
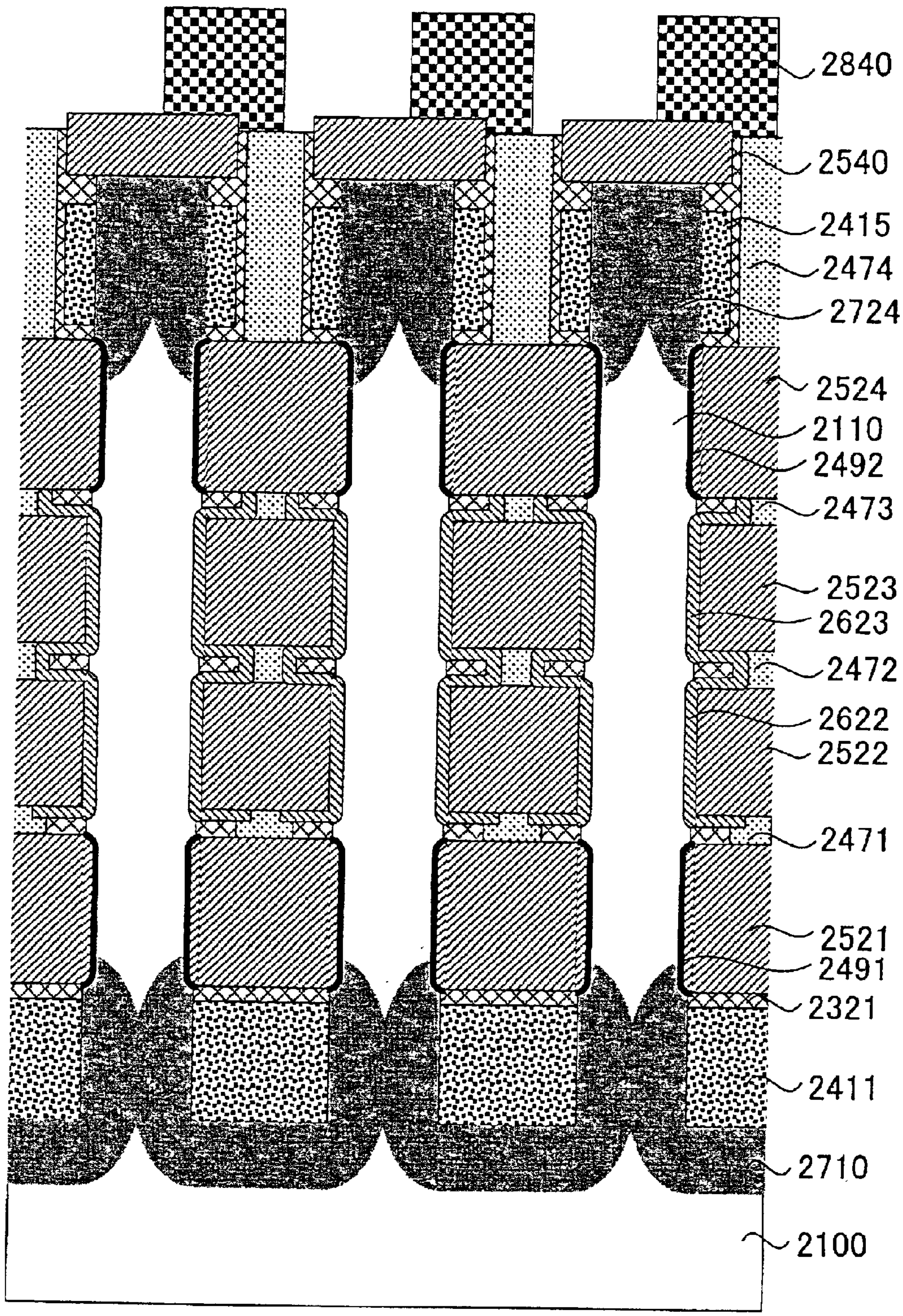
Figure 450:
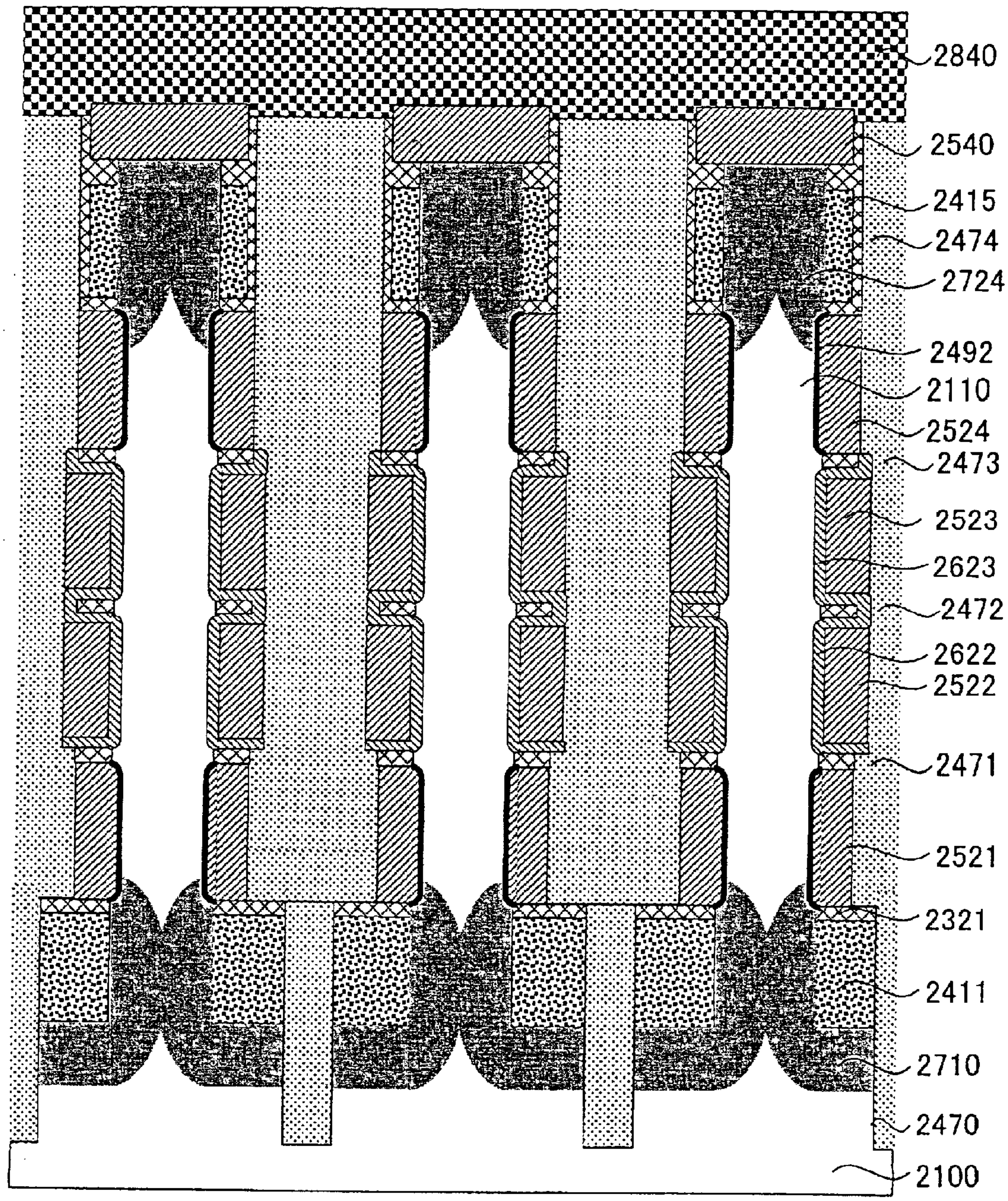
Figure 451:
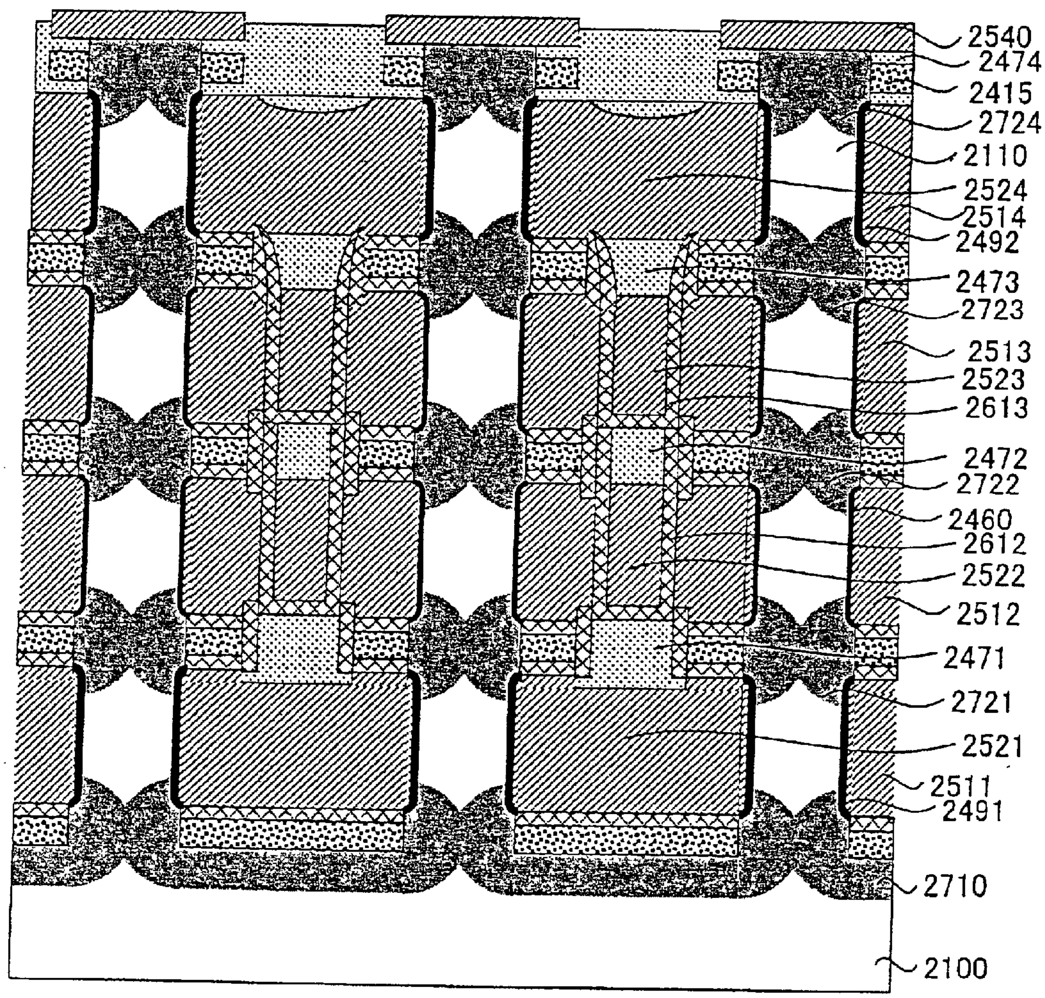

Subsequently, the silicon nitride film 2330 (the fifth insulating film) and the silicon nitride film 2340 (the sixth insulating film) are removed by anisotropic etching, for example, to expose the polysilicon film 2540 (the fourth conductive film). The top portion of the polysilicon film 2540 is exposed by etch-back or by CMP. A fourth wiring layer 2840 is formed so that its direction crosses the direction of the second or third wiring layer and is connected to the top portion of the island-like semiconductor layer 2110 (FIG. 437 and FIG. 450).

Thereafter, by known techniques, an interlayer insulating film is formed, and a contact hole and metal wiring are formed. Thereby, a semiconductor memory is realized which has a memory function according to the state of a charge in the charge storage layer which is the floating gate made of the polysilicon film (the first conductive film).

In this example, films formed on the surface of the semiconductor substrate or the polysilicon film such as the silicon nitride film (the fifth insulating film) 2330, the silicon nitride film (the sixth insulating film) 2340 and the silicon nitride film (the twelfth insulating film) 2350 may be formed of a layered film of a silicon oxide film/a silicon nitride film from the silicon surface.

With regard to the polysilicon films 2510 or 2512 to 2514 (the first conductive films), the polysilicon films 2520 or 2521 to 2524 (the second conductive films) and the polysilicon film 2540 (the fourth conductive film), impurity introduction may be carried out during or after the formation of the polysilicon films or after the separation of the polysilicon films. The timing of the impurity introduction to the polysilicon films is not particularly limited so long as these films become conductive films.

In the example, the control gates of the memory cells are formed continuously in one direction without using a mask. That is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

Further, by providing the selection gates in the top and the bottom of a set of memory cells, it is possible to prevent the phenomenon that a memory cell transistor is over-erased.

PRODUCTION EXAMPLE 15

In a semiconductor memory to be produced in this example, regions for forming charge storage layers are defined in advance by a laminated film comprising plural films, and then island-like semiconductor layers in a pillar form are formed by selective epitaxial silicon growth in trenches opened by using a photoresist mask. Tunnel oxide films and floating gates as charge storage layers are formed on the sides of the island-like semiconductor layers in the regions for forming the charge storage layers. The island-like semiconductor layers are each in an electrically floating state with respect to the semiconductor substrate. The active region of each memory cell is in the electrically floating state.

Selection gate transistors are disposed at the top and the bottom of the island-like semiconductor layer. A plurality of memory transistors, for example, two memory transistors, are placed between the selection gate transistors. The tunnel oxide film and the floating gate of the transistors are formed at the same time. The transistors are connected in series along the island-like semiconductor layer. Further, the thickness of gate insulating films of the selection gate transistors is larger than the thickness of gate insulating films of the memory transistors.

FIGS. 451 to 452 and FIGS. 453 to 454 are sectional views taken on line A-A' and line B-B', respectively, in FIG. 1 which is a plan view illustrating an EEPROM memory cell array.

This example is the same as Production example 11 (FIGS. 304 to 318 and FIGS. 337 to 351) before the channel ion implantation to the sidewall of the island-like semiconductor layer 2110.

Thereafter, a silicon oxide film 2471, for example, is deposited as an eleventh insulating film to a thickness of 50 to 500 nm such that the silicon oxide film 2471 is buried in the third trench 2230 almost to a height where the top of a lower selection gate is positioned.

Then, a silicon nitride film 2351, for example, is deposited as a twelfth insulating film to a thickness of 5 to 50 nm to form a sidewall spacer.

In the same manner, a silicon oxide film 2472 is deposited as an eleventh insulating film to a thickness of 50 to 500 nm and anisotropically or isotropically etched such that the silicon oxide film 2472 is buried in the third trench 2230 almost to a height where the bottom of an upper selection gate is positioned.

Using the silicon oxide film 2472 as a mask, the sidewall spacer made of the silicon nitride film 2351 is partially removed by isotropic etching.

Subsequently, a silicon oxide film 2491 of about 15 to 25 nm thickness is formed as an eighteenth insulating film on the periphery of the island-like semiconductor layer 2110, for example, by thermal oxidation.

The sidewall spacer made of the silicon nitride film 2351 is removed by isotropic etching, and then, a silicon oxide film 2460, for example, is formed as a tenth insulating film to be a tunnel oxide film on the periphery of the island-like semiconductor layer 2110 to a thickness of about 10 nm by, for example, thermal oxidation. At this time, the silicon oxide film 2491 is thickened to be a silicon oxide film 2492, which is thicker than the silicon oxide film 2460. The thickness of the silicon oxide film 2492 may optionally be set in accordance with the thickness of the oxide film 2491 and that of the silicon oxide film 2460. The tunnel oxide film, however, may be formed of not only a thermally oxidized film but also a CVD oxide film or a nitrogen oxide film.

Figure 452:
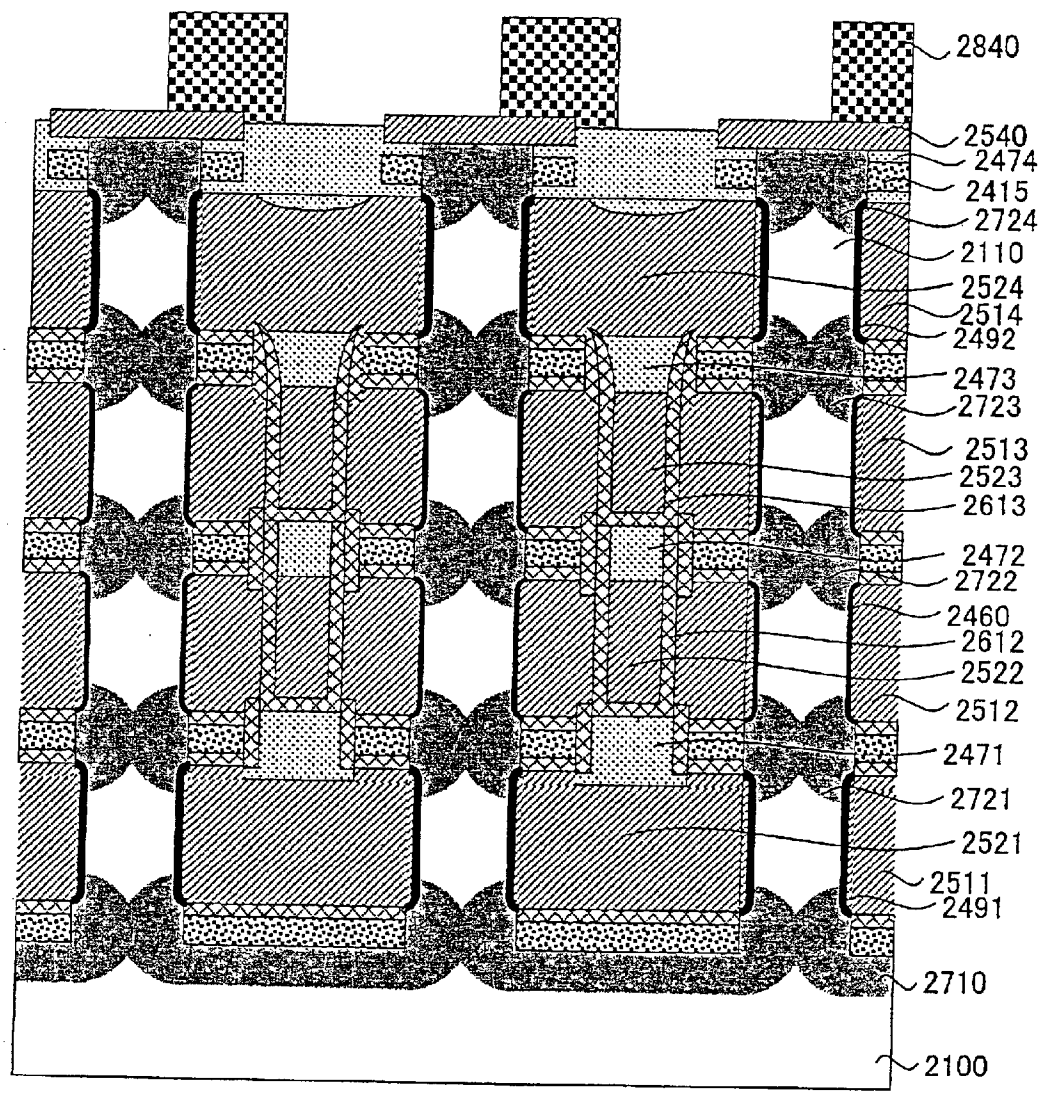
Figure 453:
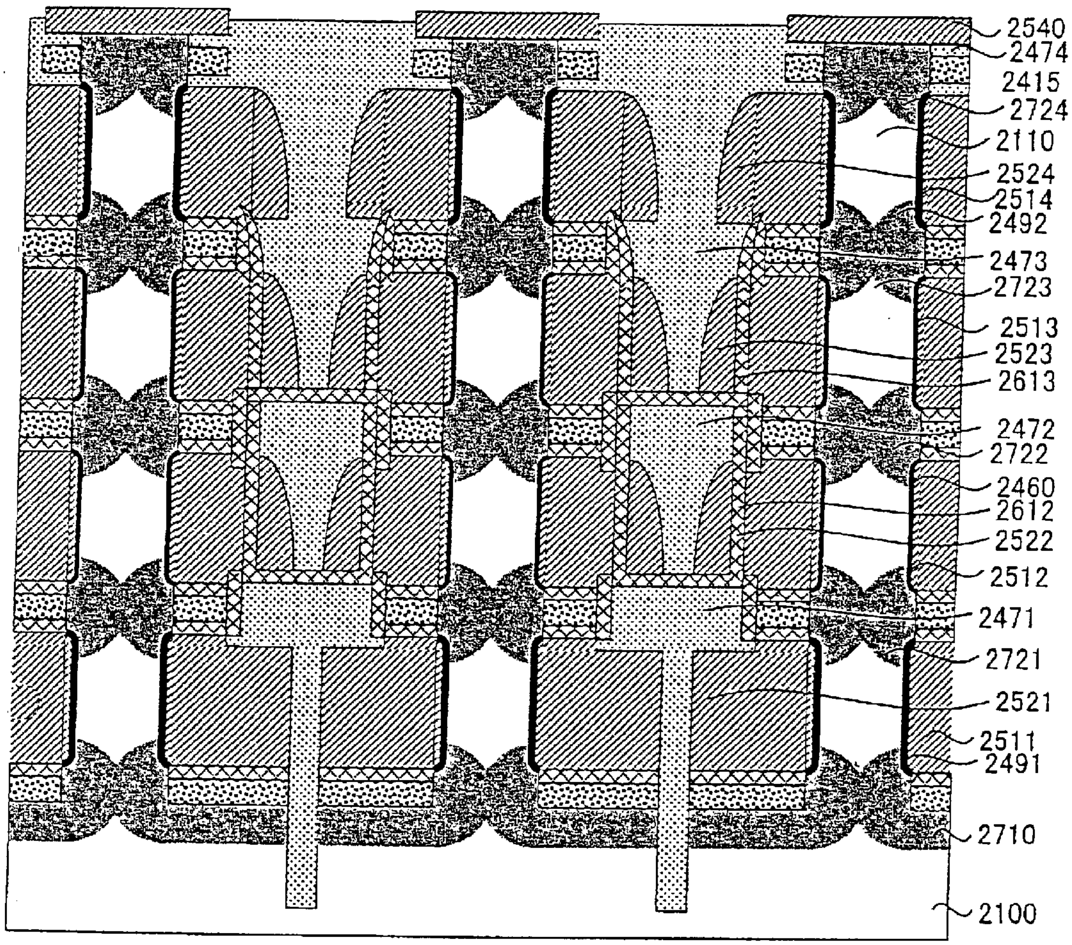
Figure 454:
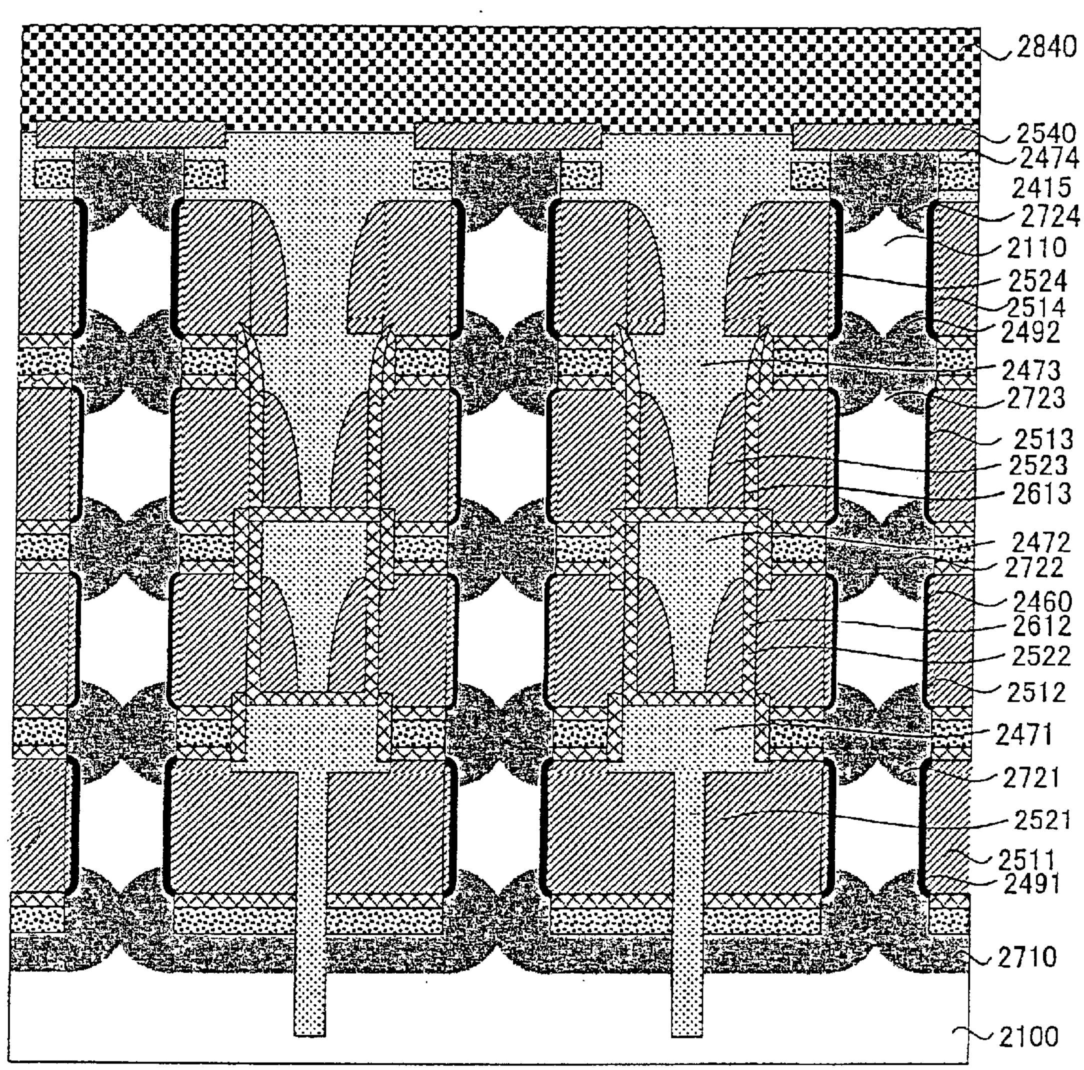
Figure 455:
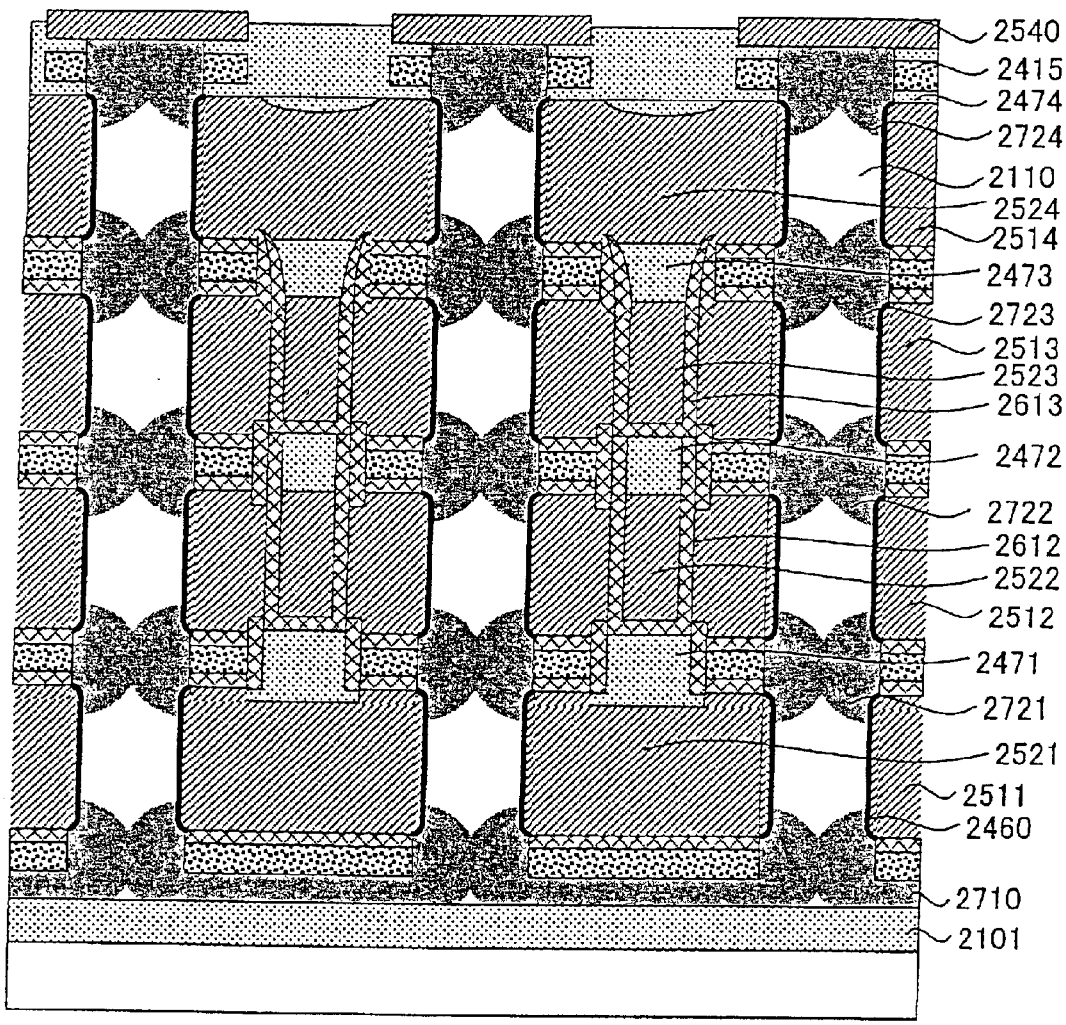

Then, a polysilicon film 2510, for example, is deposited as a first conductive film to a thickness of about 50 to 200 nm. Production steps thereafter (FIGS. 451 and 453) follow Production example 11 (FIGS. 321 to 335 and 355 to 368), thereby a semiconductor memory is completed (FIGS. 452 and 454).

In addition to Production example 11, films formed on the surface of the semiconductor substrate such as the silicon nitride film 2351 (the twelfth insulating film) may be formed of a layered film of a silicon oxide film/a silicon nitride film from the silicon surface.

According to this example, the same effect as obtained by Production Example 11 can be obtained.

PRODUCTION EXAMPLE 6

In a semiconductor memory to be produced in this example, regions for forming charge storage layers are defined in advance by a laminated film comprising plural films on a semiconductor substrate in which an oxide film is inserted, e.g., a semiconductor portion of a SOI substrate, and then island-like semiconductor layers in a pillar form are formed by selective epitaxial silicon growth in trenches opened by using a photoresist mask. Tunnel oxide films and floating gates as charge storage layers are formed on the sides of the island-like semiconductor layers in the regions for forming the charge storage layers. The island-like semiconductor layers are each in an electrically floating state with respect to the semiconductor substrate. The active region of each memory cell is in the electrically floating state.

Selection gate transistors are disposed at the top and the bottom of the island-like semiconductor layer. A plurality of memory transistors, for example, two memory transistors, are placed between the selection gate transistors. The tunnel oxide film and the floating gate of the transistors are formed at the same time. The transistors are connected in series along the island-like semiconductor layer. Further, the thickness of gate insulating films of the selection gate transistors is equal to the thickness of gate insulating films of the memory transistors.

FIGS. 455 to 456 and FIGS. 457 to 458 are sectional views taken on line A-A' and line B-B', respectively, in FIG. 1 which is a plan view illustrating an EEPROM memory cell array.

Figure 456:
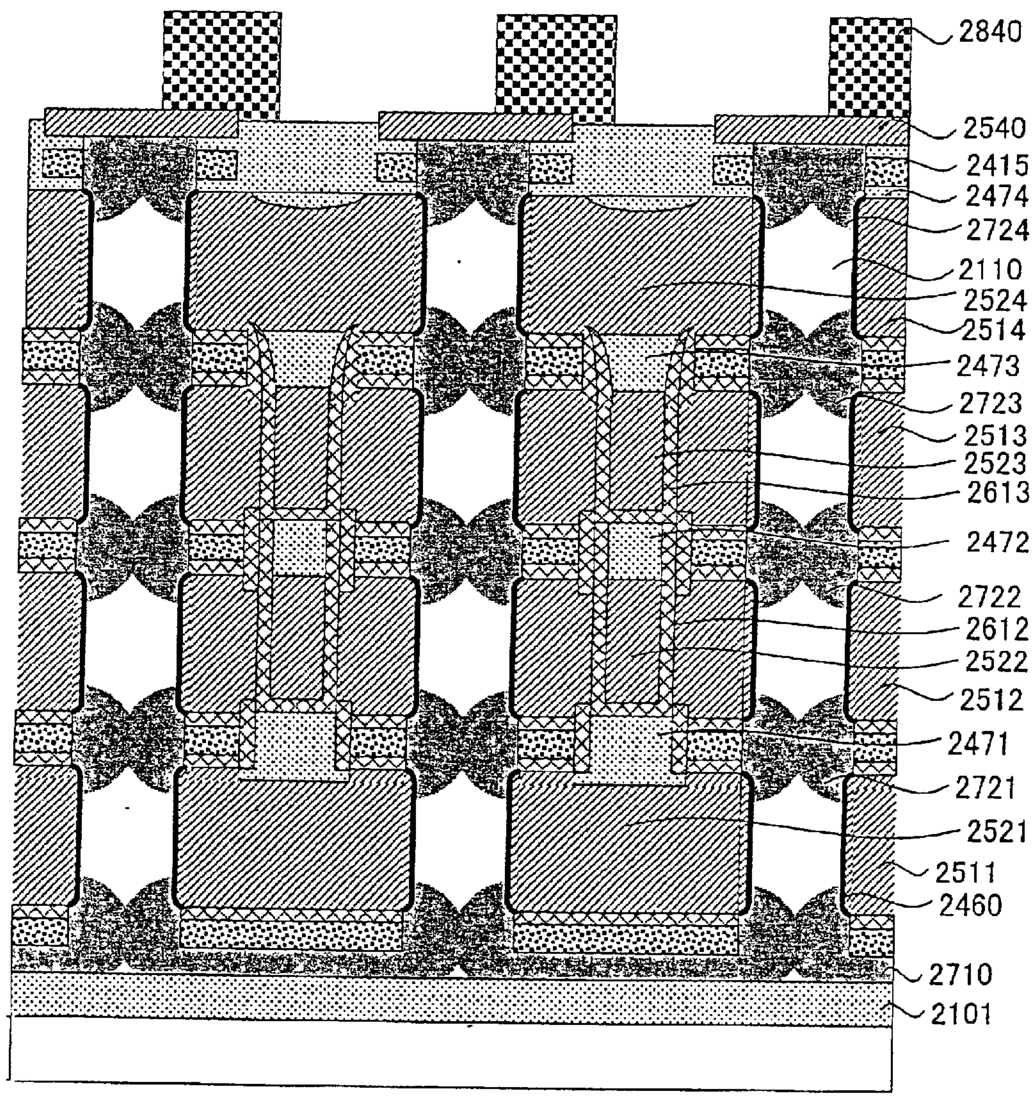
Figure 457:
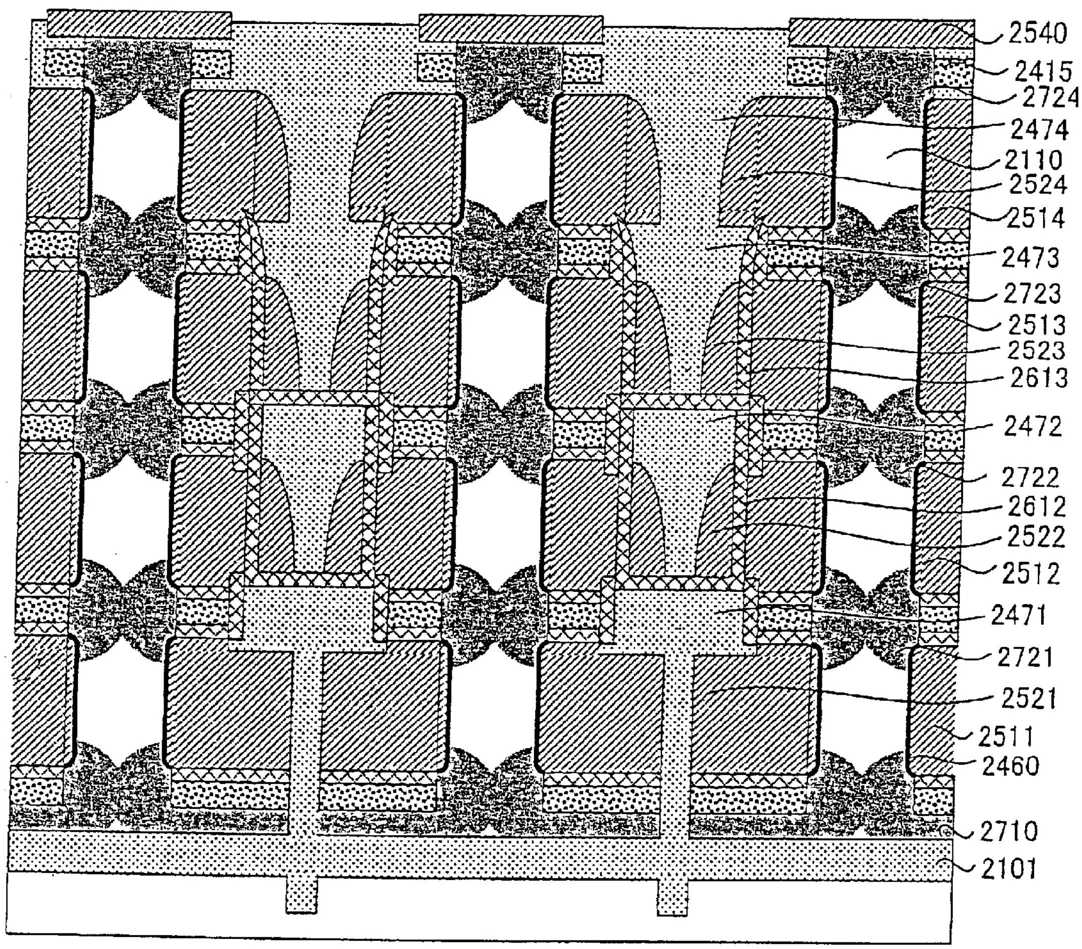
Figure 458:
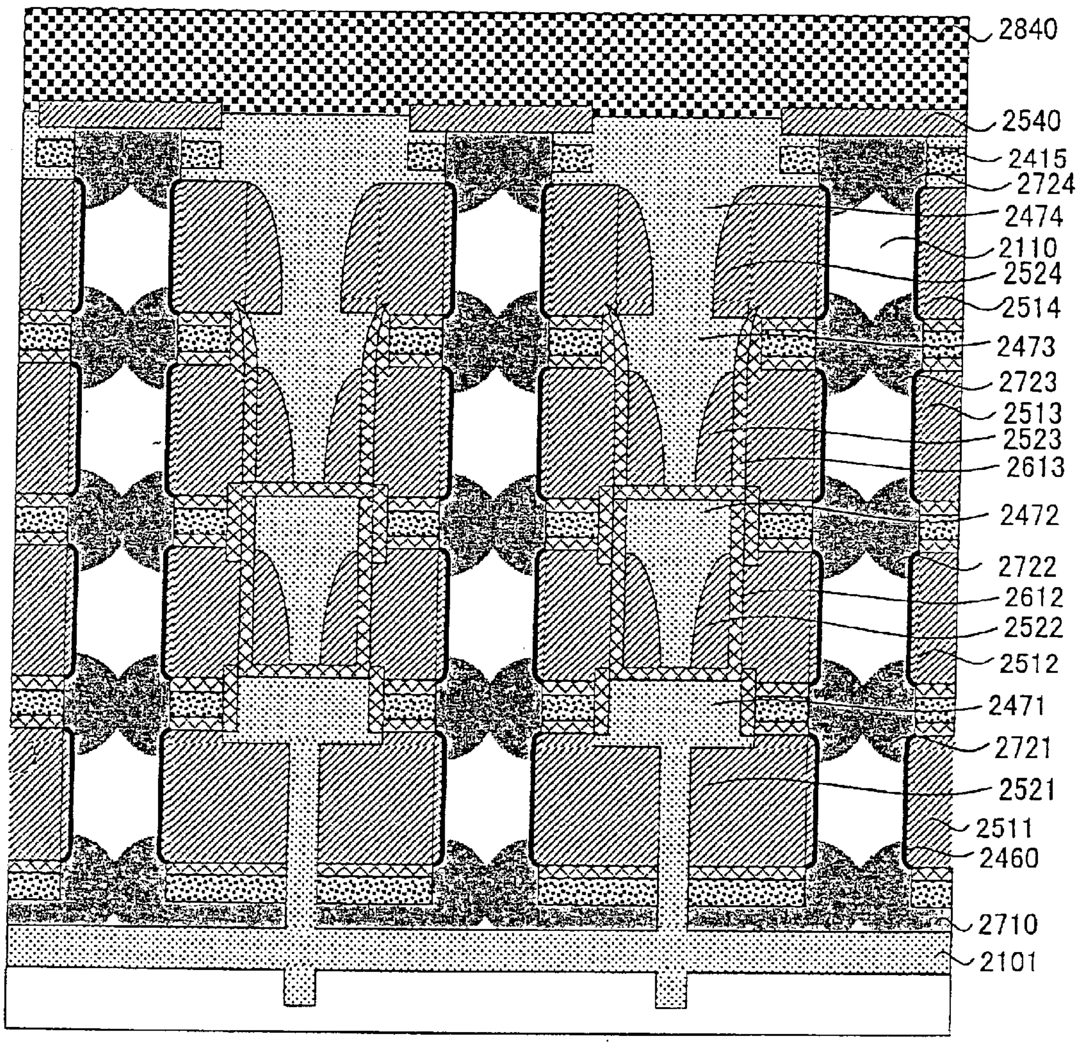
Figure 459:
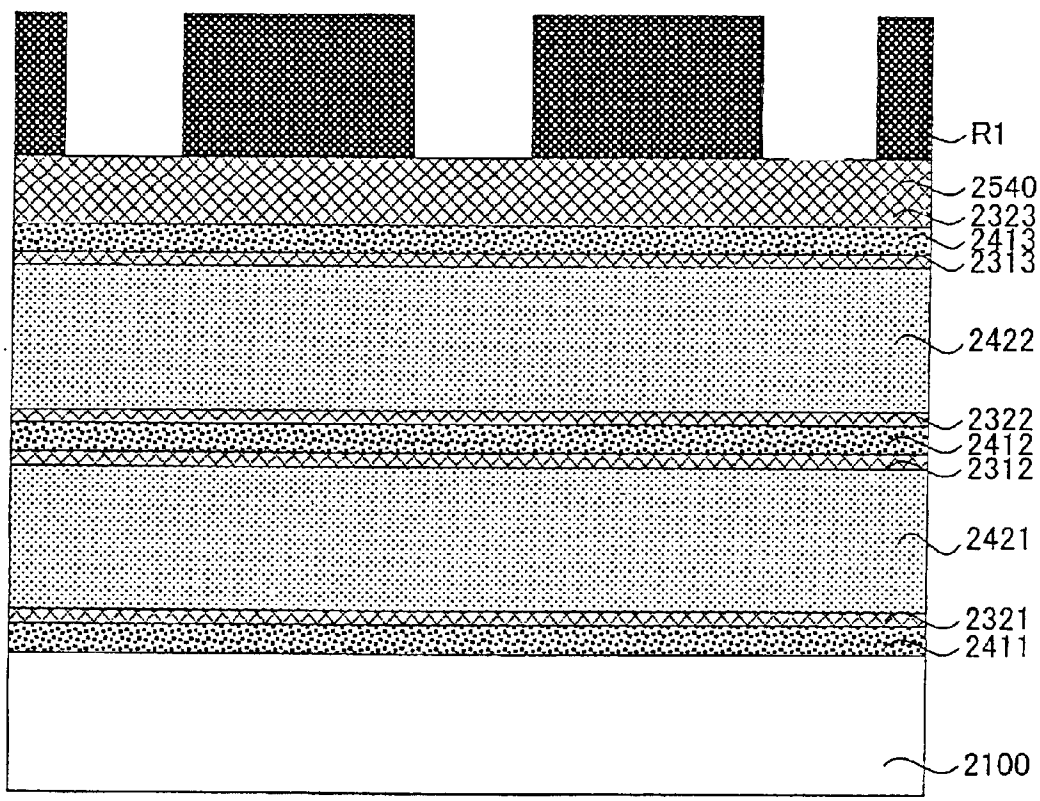

In accordance with Production examples 11 to 15 (FIGS. 455 and 457), a semiconductor memory is produced (FIGS. 456 and 458).

According to this example, the same effect as obtained by Production Example 11 can be obtained, and furthermore, the junction capacitance of the impurity diffusion layer 2710 which functions as the first wiring layer is suppressed or removed.

The use of the SOI substrate as the semiconductor substrate can be applied to all the examples according to the present invention.

PRODUCTION EXAMPLE 17

In a semiconductor memory to be produced in this example, regions for forming charge storage layers are defined in advance by a laminated film comprising plural films, and then island-like semiconductor layers in a pillar form are formed by selective epitaxial silicon growth in trenches opened by using a photoresist mask. Tunnel oxide films and floating gates as charge storage layers are formed on the sides of the island-like semiconductor layers in the regions for forming the charge storage layers. The island-like semiconductor layers are each in an electrically floating state with respect to the semiconductor substrate. The active region of each memory cell is in the electrically floating state.

Two memory transistors are placed on the island-like semiconductor layer. The tunnel oxide film and the floating gate of the transistors are formed at the same time. The transistors are connected in series along the island-like semiconductor layer.

Such a semiconductor memory may be produced by the following production process. FIGS. 459 to 484 and FIGS. 485 to 510 are sectional views taken on line A-A' and line B-B', respectively, in FIG. 1 which is a plan view illustrating an EEPROM memory cell array.

First, on a surface of a P-type silicon substrate 2100, a silicon oxide film 2411 containing arsenic impurities of about $1\times10^{18}$ to $1\times10^{22}/cm^3$, for example, is deposited as a first insulating film to a thickness of 50 to 500 nm by CVD. At this time, ion implantation may be carried out to introduce the impurities to the insulating film deposited by CVD. For example, to the silicon oxide film 2411 deposited to a thickness of 50 to 500 nm, ion implantation may be carried out at an implantation energy of 5 to 100 keV at an arsenic dose of about $1\times10^{14}$ to $1\times10^{16}/cm^2$ at an angle of about 0 to 45° with respect to the normal line of the surface of the substrate. The impurity introduction to the silicon oxide film 2411 by ion implantation may not necessarily be carried out immediately after the deposition of the silicon oxide film 2411. Regarding the ion implantation to the silicon oxide film 2411, the angle for the implantation is not particularly limited as long as a desired impurity concentration is obtained. Means for the impurity introduction to the silicon oxide film 2411 is not limited to the ion implantation, but any means such as solid or vapor phase diffusion may be used.

Thereafter, a silicon nitride film 2321, for example, is deposited as a fourth insulating film to a thickness of 10 to 100 nm. If the above-mentioned impurity introduction to the silicon oxide film 2411 is carried out by ion implantation, the impurities may be introduced by ion implantation through the silicon nitride film 2321 into the silicon oxide film 2411.

Then, a silicon oxide film 2421, for example, is deposited as a third insulating film to a thickness of 50 to 500 nm and a silicon nitride film 2312, for example, is deposited as a second insulating film to a thickness of 10 to 100 nm. Further, a silicon oxide film 2412 containing the impurities is deposited as a first insulating film to a thickness of 50 to 500 nm, a silicon nitride film 2322 is deposited as a fourth insulating film to a thickness of 10 to 100 nm, and a silicon oxide film 2422 is deposited as a third insulating film to a thickness of 50 to 500 nm. Then, a silicon nitride film 2313 is deposited as a second insulating film to a thickness of 10 to 100 nm, a silicon oxide film 2413 containing the impurities is deposited as a first insulating film to a thickness of 50 to 500 nm and a silicon nitride film 2323 is deposited as a fourth insulating film to a thickness of 500 to 5,000 nm.

Figure 460:
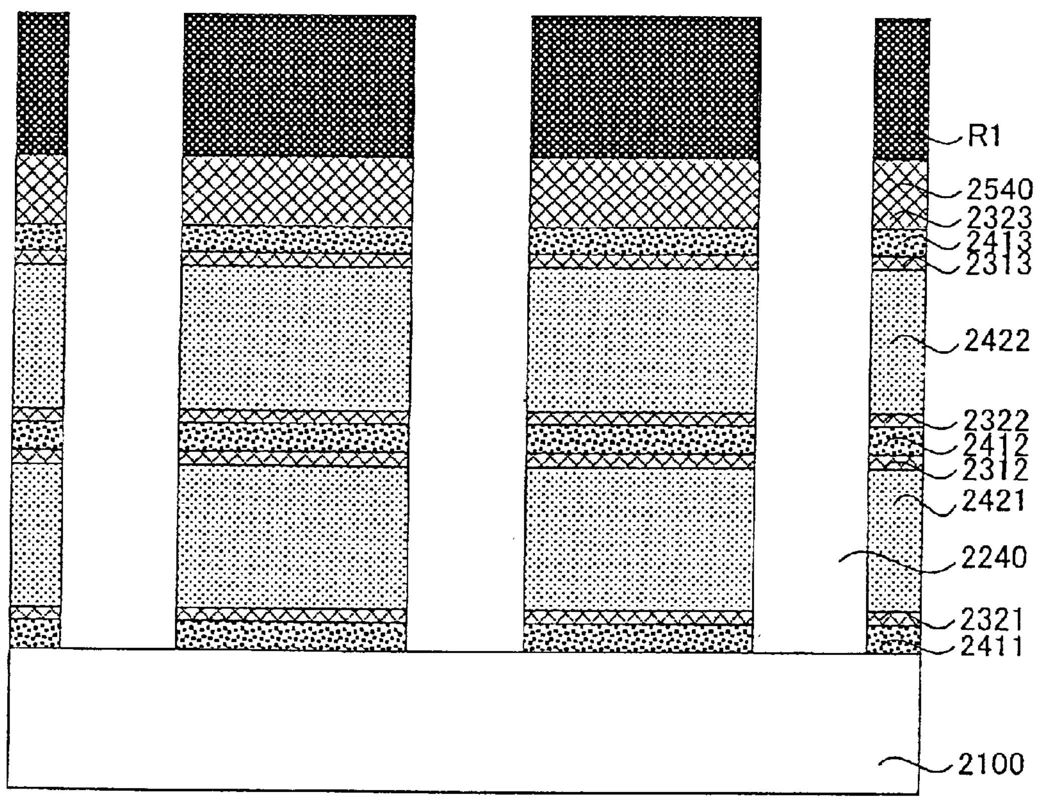
Figure 486:
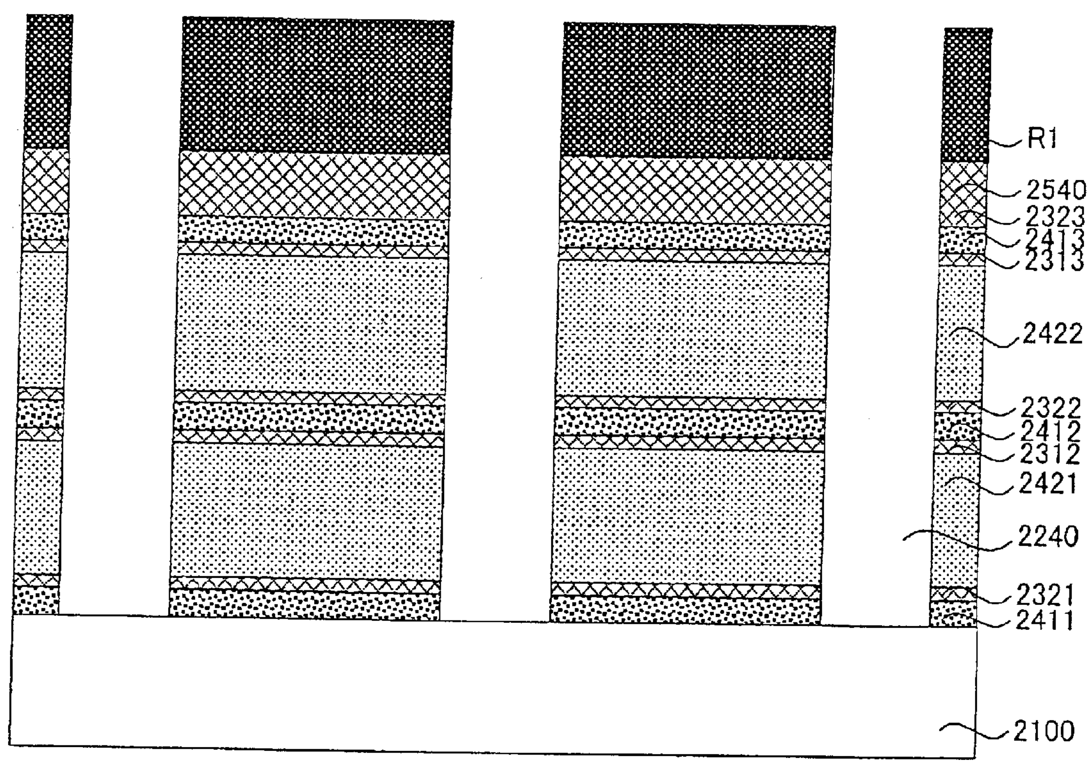

Subsequently, using a resist film R1 patterned by a known photolithographic technique as a mask (FIGS. 459 and 485), reactive ion etching, for example, is performed to successively etch the silicon nitride film 2323, the silicon oxide film 2413, the silicon nitride film 2313, the silicon oxide film 2422, the silicon nitride film 2322, the silicon oxide film 2412, the silicon nitride film 2312, the silicon oxide film 2421, the silicon nitride film 2321 and the silicon oxide film 2411, thereby forming a fourth trench 2240 (FIGS. 460 and 486).

Figure 461:
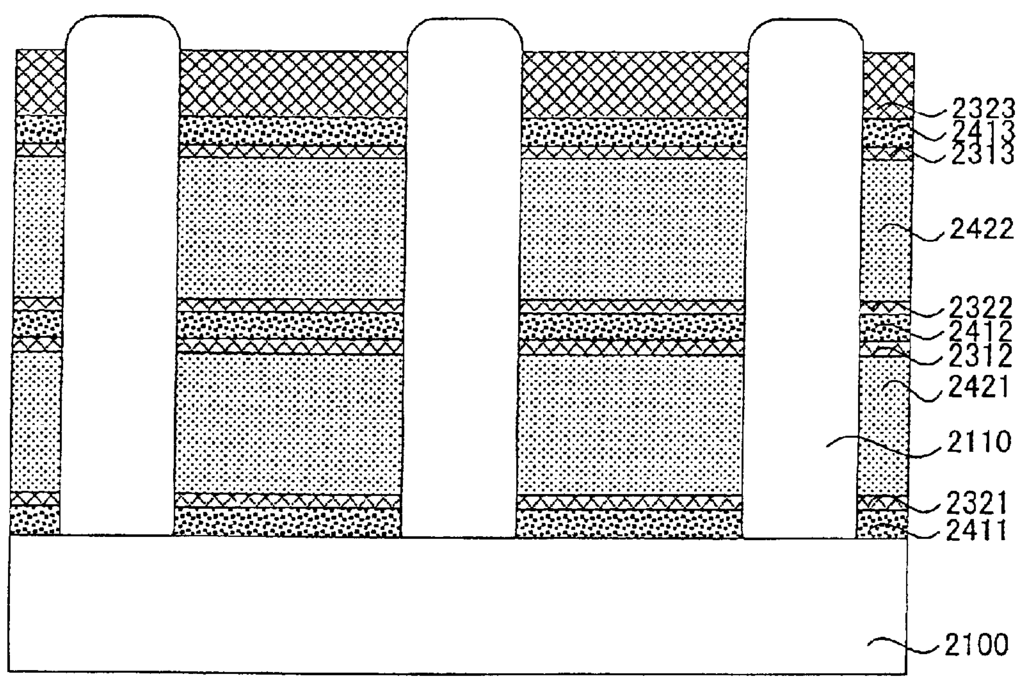
Figure 487:
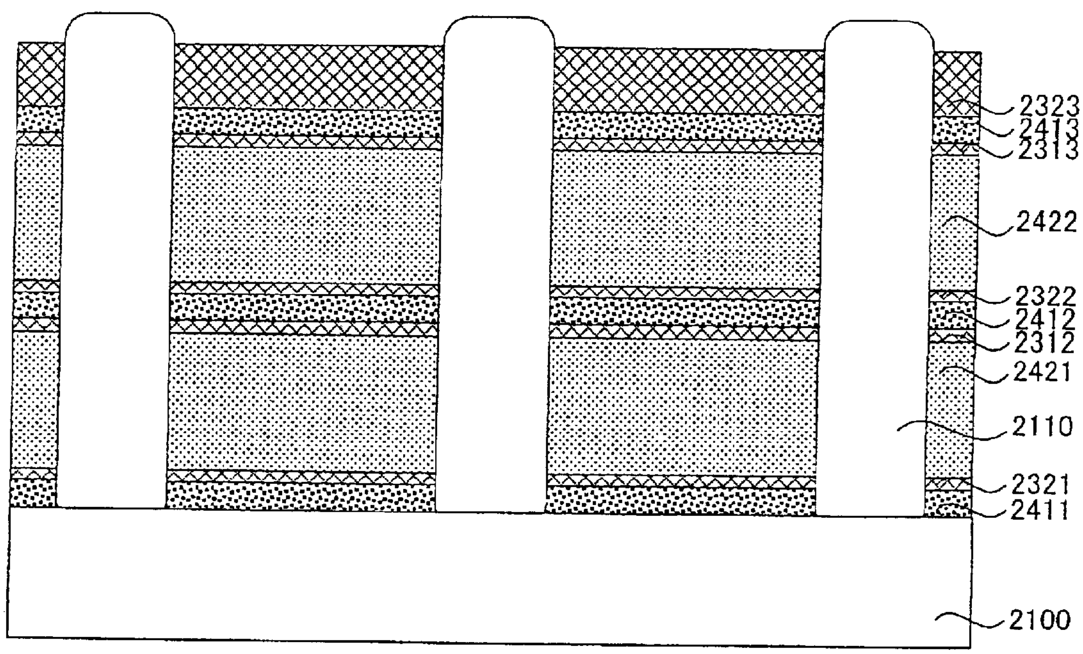

The resist film R1 is removed and then island-like semiconductor layers 2110 are filled in the fourth trench 2240. For example, the island-like semiconductor layers 2110 are formed by selective epitaxial growth from the P-type silicon substrate 2100 located at the bottom of the fourth trench 2240 (FIGS. 461 and 487).

The thus formed island-like semiconductor layers 2110 are flattened to be flush with the silicon nitride film 2323.

Means for the flattening is not limited, and it may be carried out by isotropic or anisotropic etch-back, CMP, or a combination of various techniques.

Figure 462:
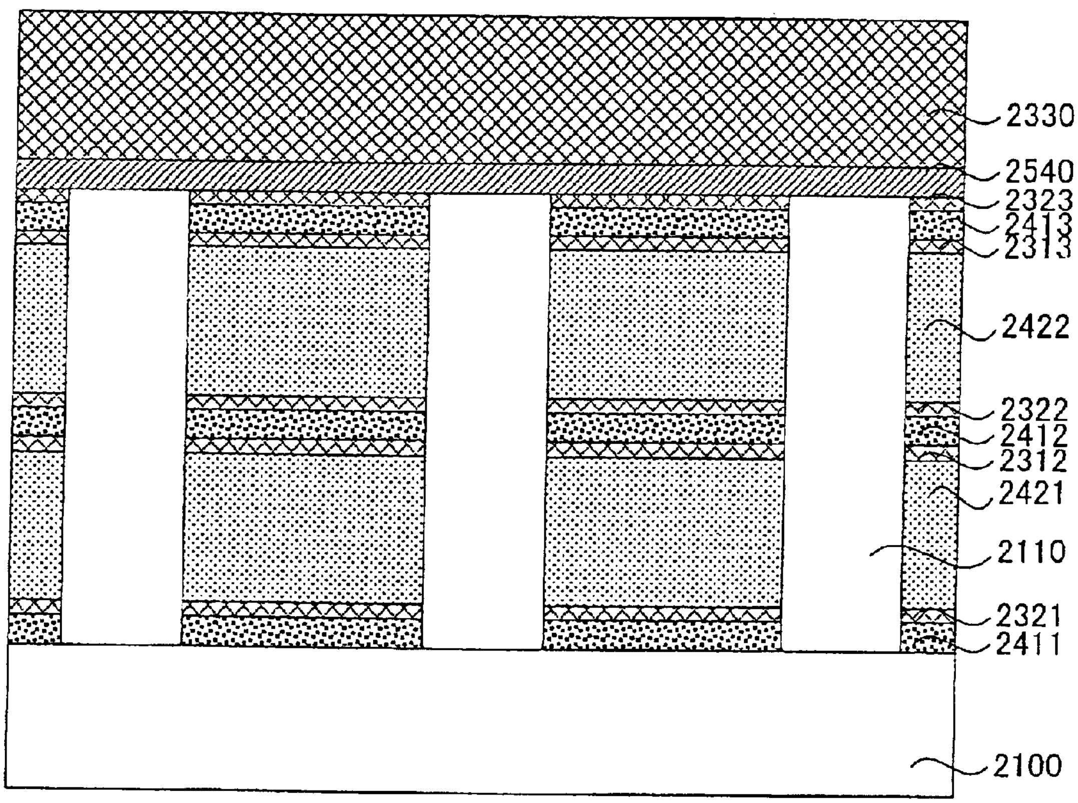
Figure 463:
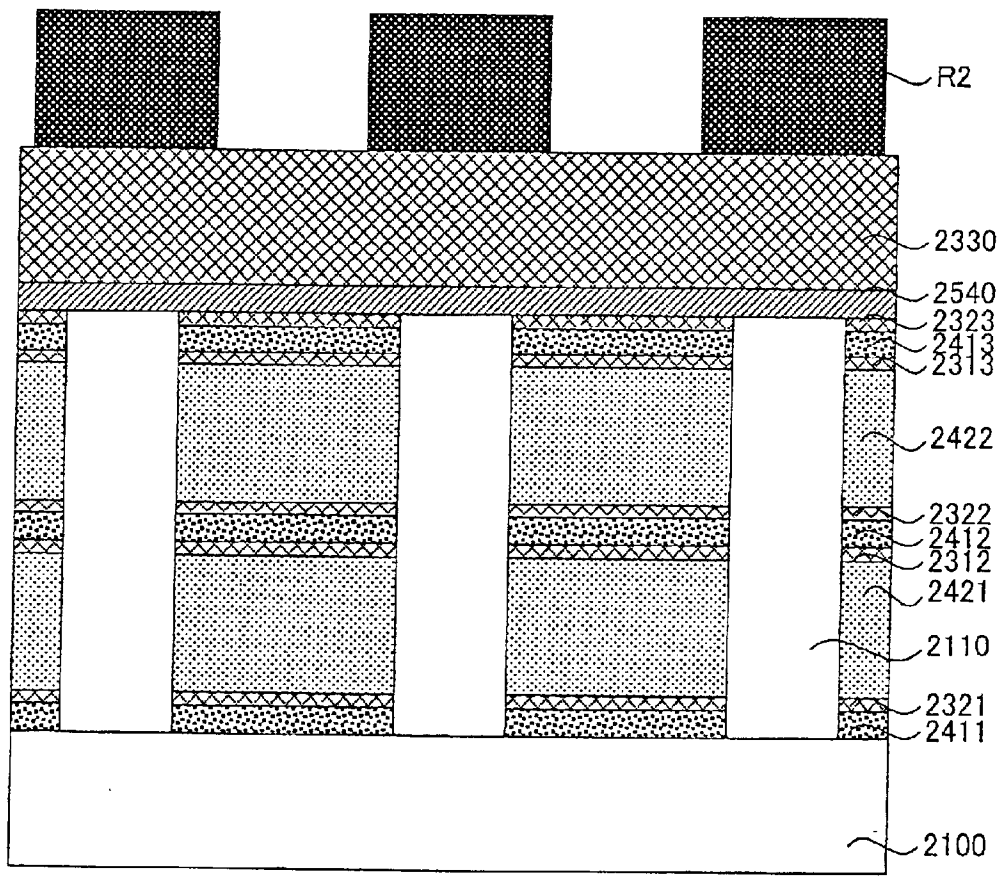
Figure 464:
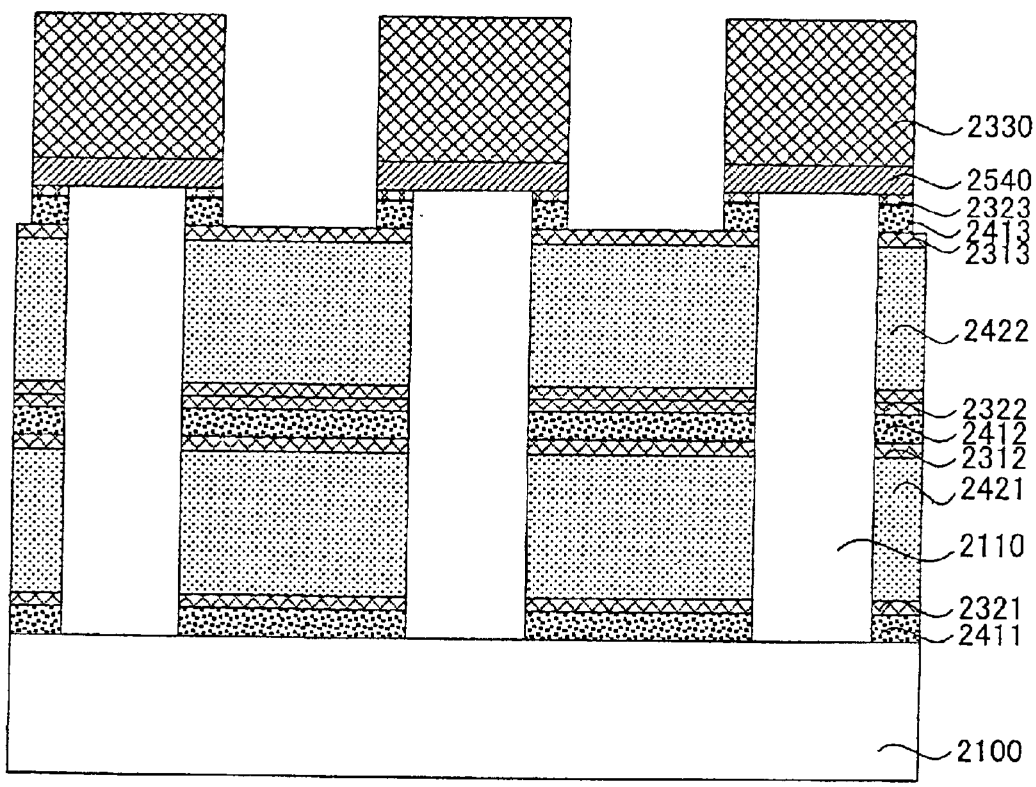
Figure 488:
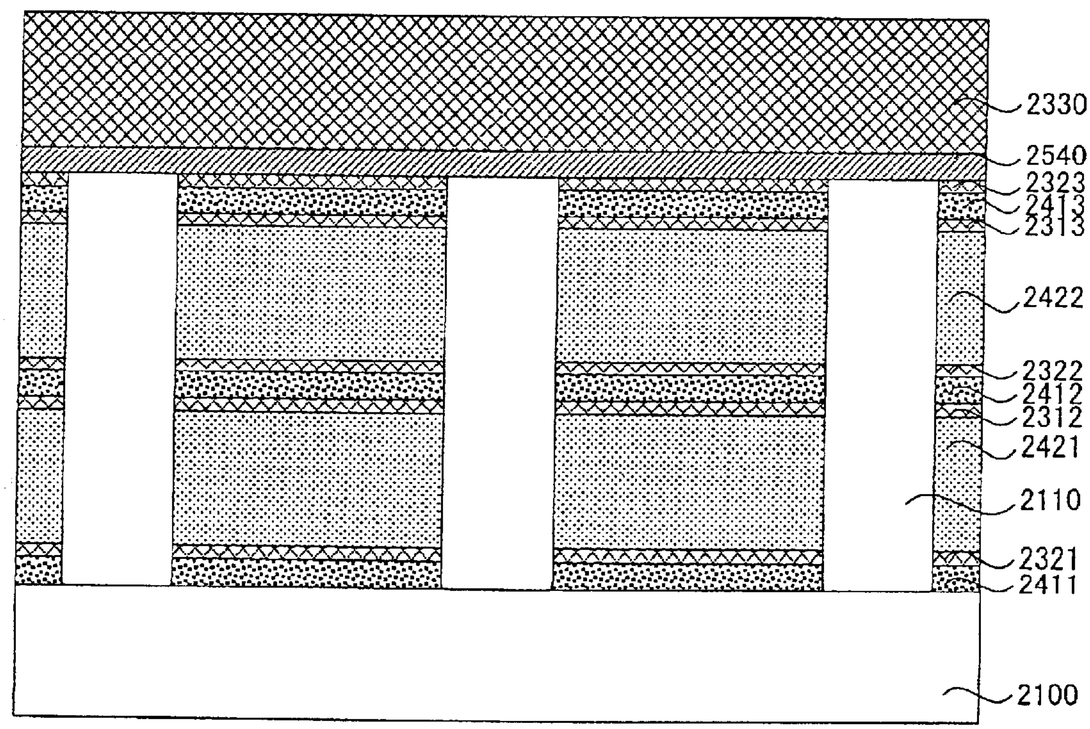
Figure 489:
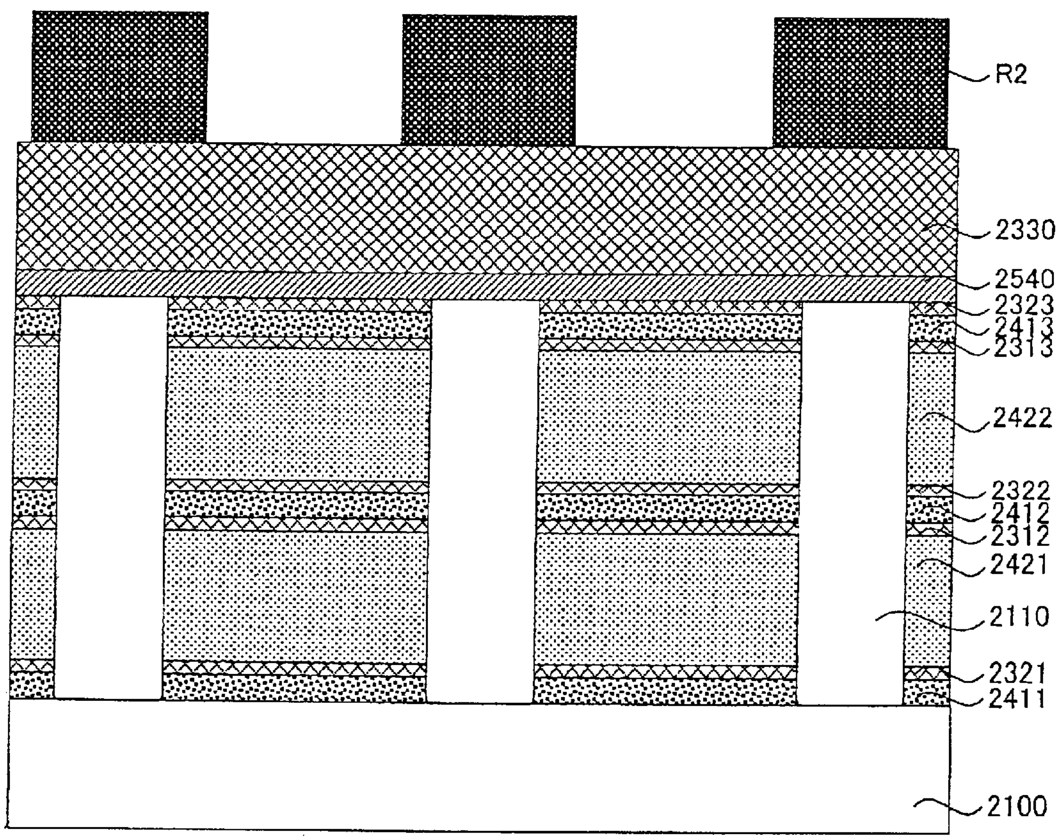
Figure 490:
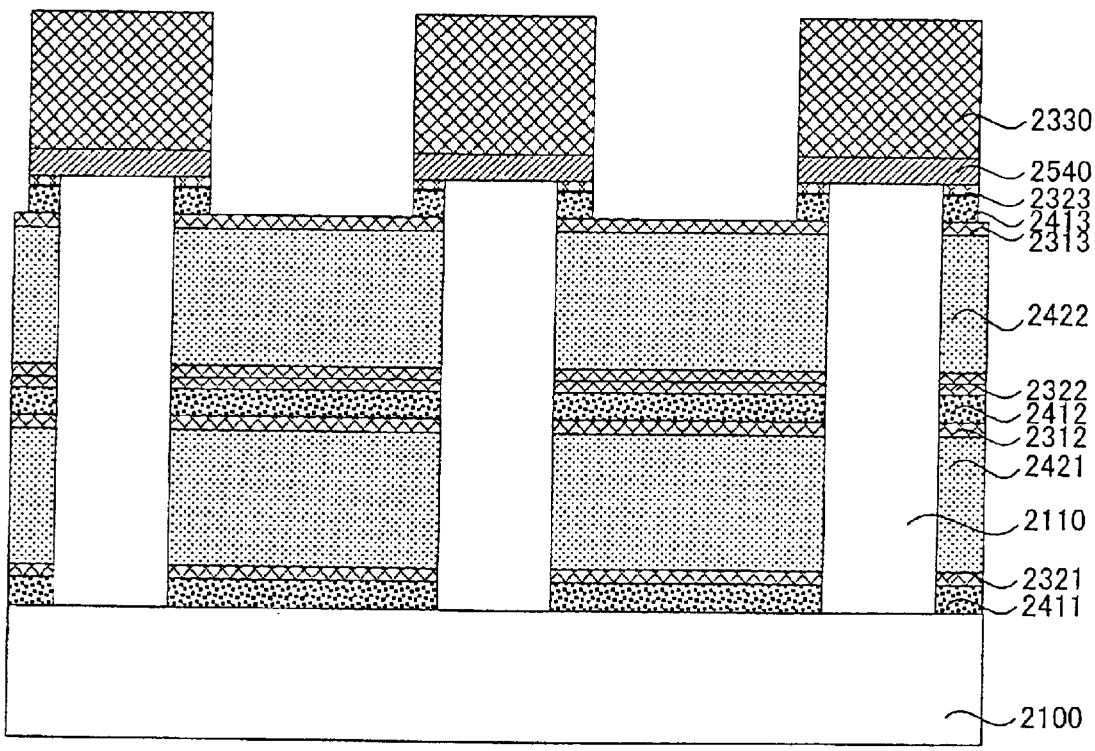

Thereafter, a polysilicon film 2540, for example, is deposited as a fourth conductive film to a thickness of about 100 to 300 nm and a silicon nitride film 2330 is deposited as a fifth insulating film to a thickness of about 200 to 2,000 nm (FIGS. 462 and 488).

Then, using a resist film R2 patterned by a known photolithographic technique as a mask (FIGS. 463 and 489), reactive ion etching, for example, is performed to successively etch the silicon nitride film 2330, the polysilicon film 2540, the silicon nitride film 2323 and the silicon oxide film 2413, thereby exposing the silicon nitride film 2313 (the second insulating film). At this time, the silicon nitride film 2313 may be etched until the silicon oxide film 2422 (the third insulating film) is exposed.

Figure 465:
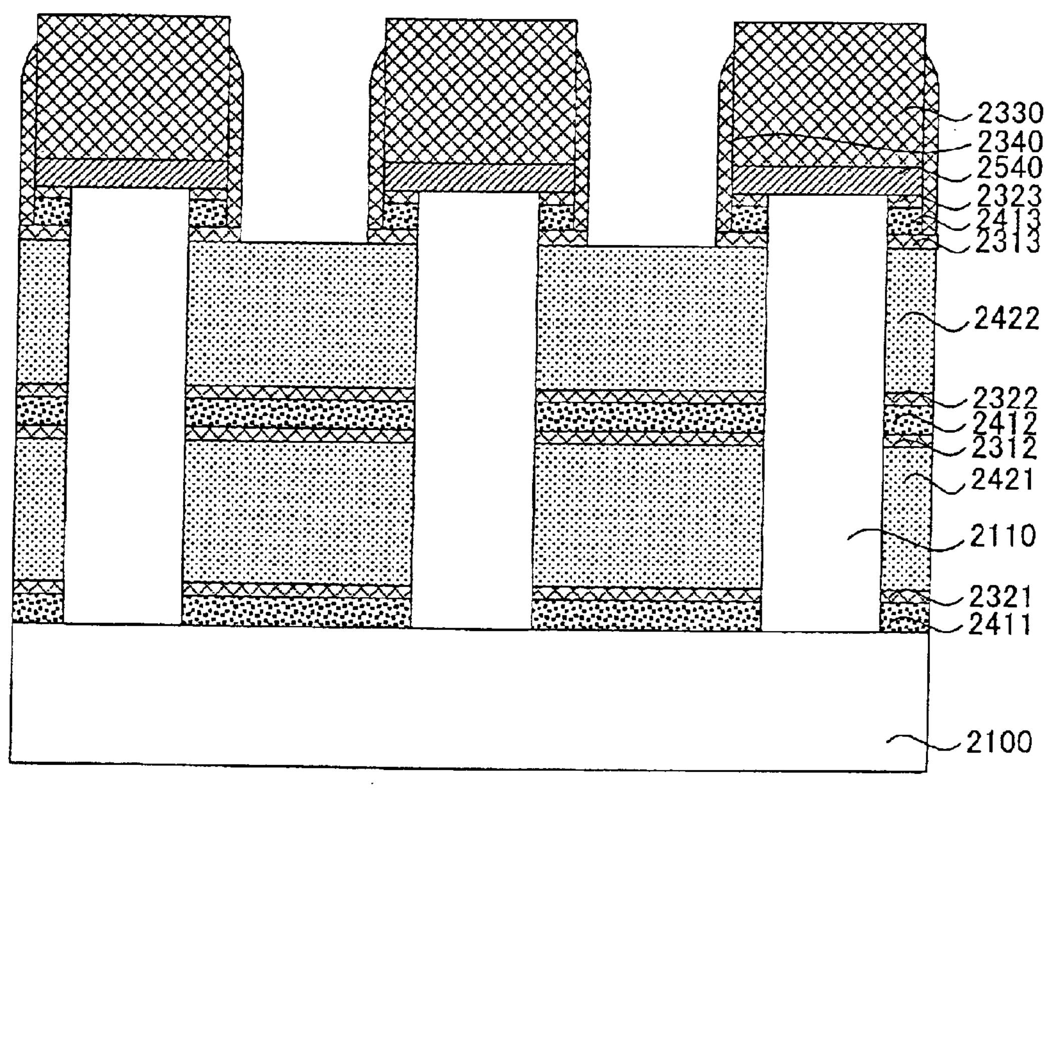

After the resist film R2 is removed (FIGS. 464 and 490), a silicon nitride film 2340 is deposited as a sixth insulating film to a thickness of about 5 to 50 nm. Then, the silicon nitride film 2340 is etched by anisotropic etching, for example, to remain in the form of a sidewall spacer on the sidewalls of the silicon nitride film 2330, the polysilicon film 2540, the silicon nitride film 2323 and the silicon oxide film 2413 (FIGS. 465 and 491). At this time, the silicon oxide film 2413 containing the impurities (the first insulating film) is isolated from other films than the island-like semiconductor layer 2110 by the silicon nitride film 2323 (the fourth insulating film), the silicon nitride film 2313 (the second insulating film) and the silicon nitride film 2340 (the sixth insulating film).

Figure 466:
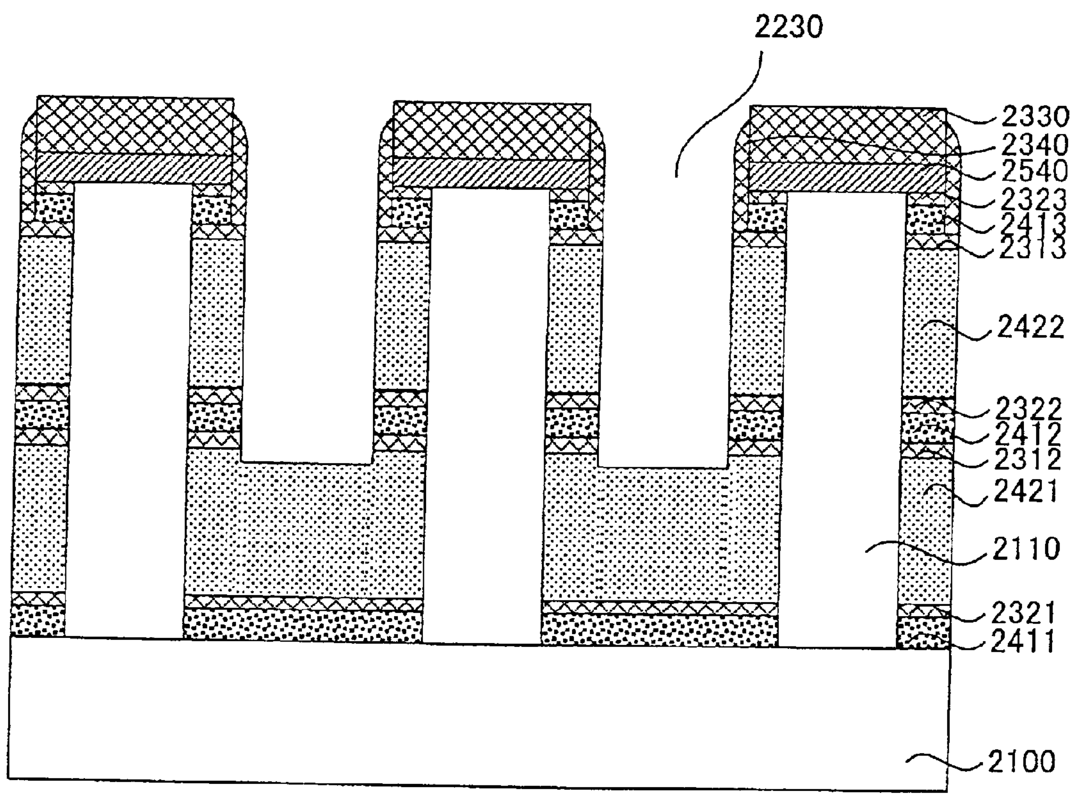
Figure 492:
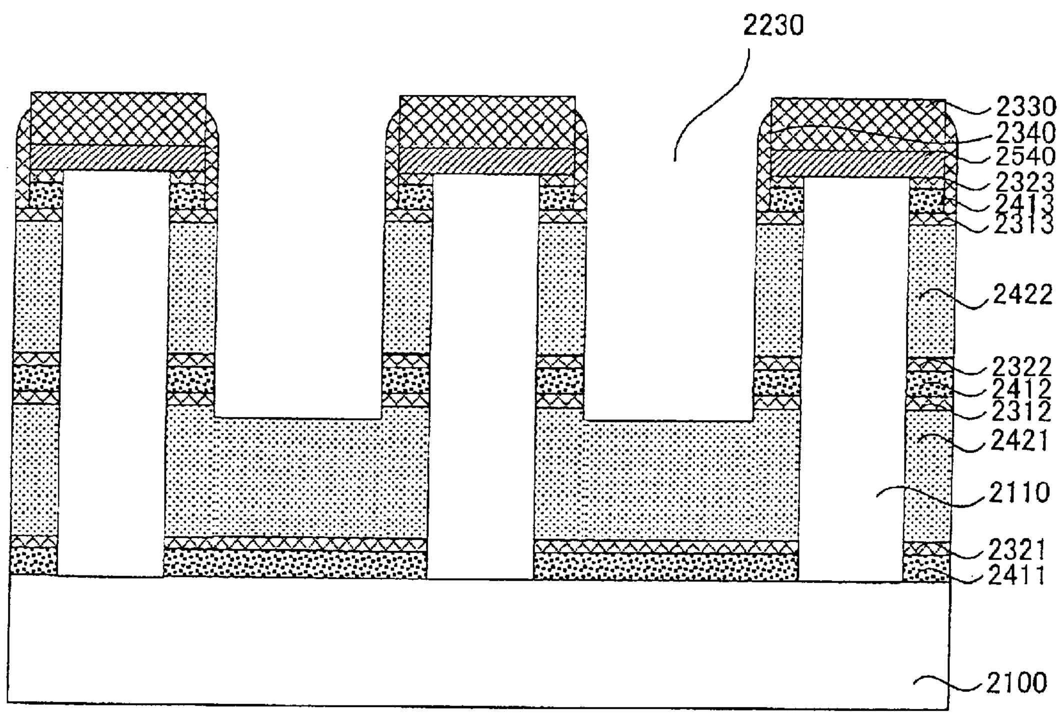

Then, using the silicon nitride films 2330 and 2340 as a mask, successively etched are the silicon nitride film 2313, the silicon oxide film 2422, the silicon nitride film 2322, the silicon oxide film 2412 and the silicon nitride film 2312, thereby exposing the silicon oxide film 2421. Thus, a third trench 2230 is formed (FIGS. 466 and 492).

Figure 467:
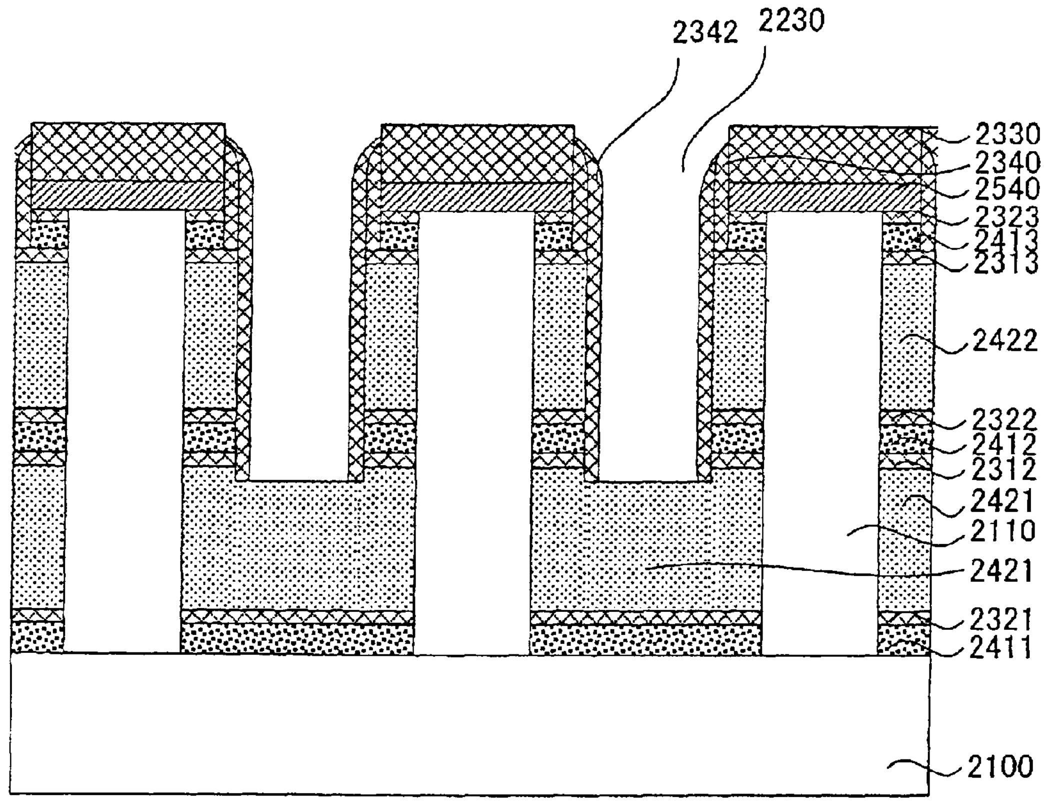
Figure 493:
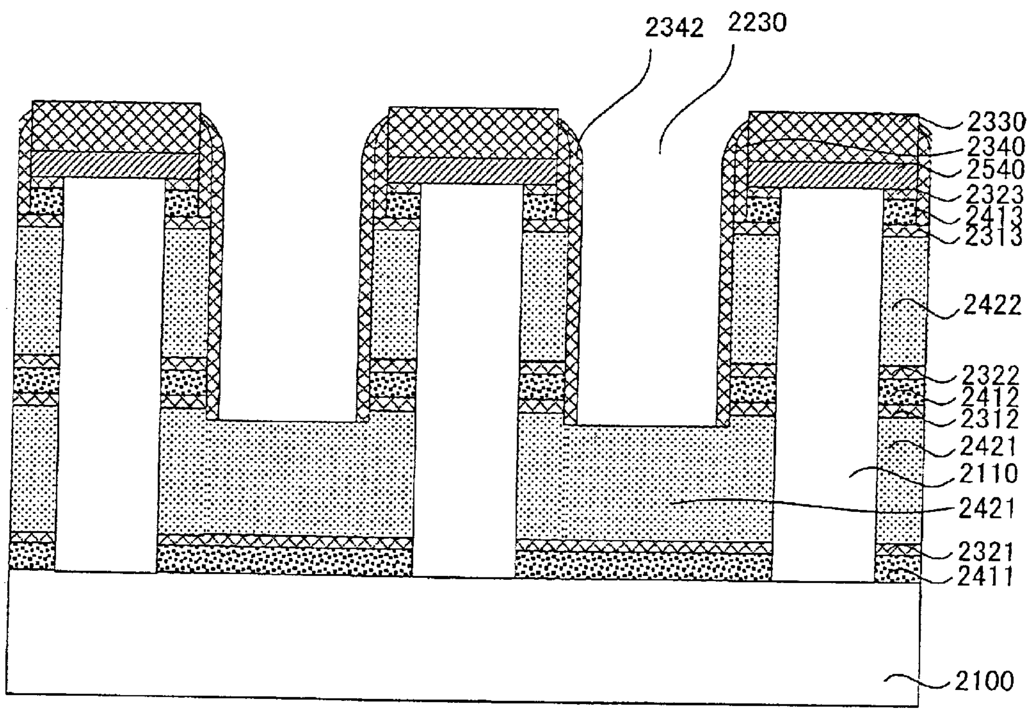

Subsequently, a silicon nitride film 2342 is deposited as a sixth insulating film to a thickness of about 5 to 50 nm. Then, the silicon nitride film 2342 is arranged such that at least the silicon oxide film 2412 containing the impurities is isolated from other films than the island-like semiconductor layer 2110 by the silicon nitride film 2342 (the sixth insulating film), the silicon nitride film 2312 (the second insulating film) and the silicon nitride film 2322 (the fourth insulating film). For example, the silicon nitride film 2342 deposited to a thickness of about 5 to 50 nm is removed from the bottom of the third trench 2230 by anisotropic etching, thereby exposing the silicon oxide film 2421 (FIGS. 467 and 493).

Figure 468:
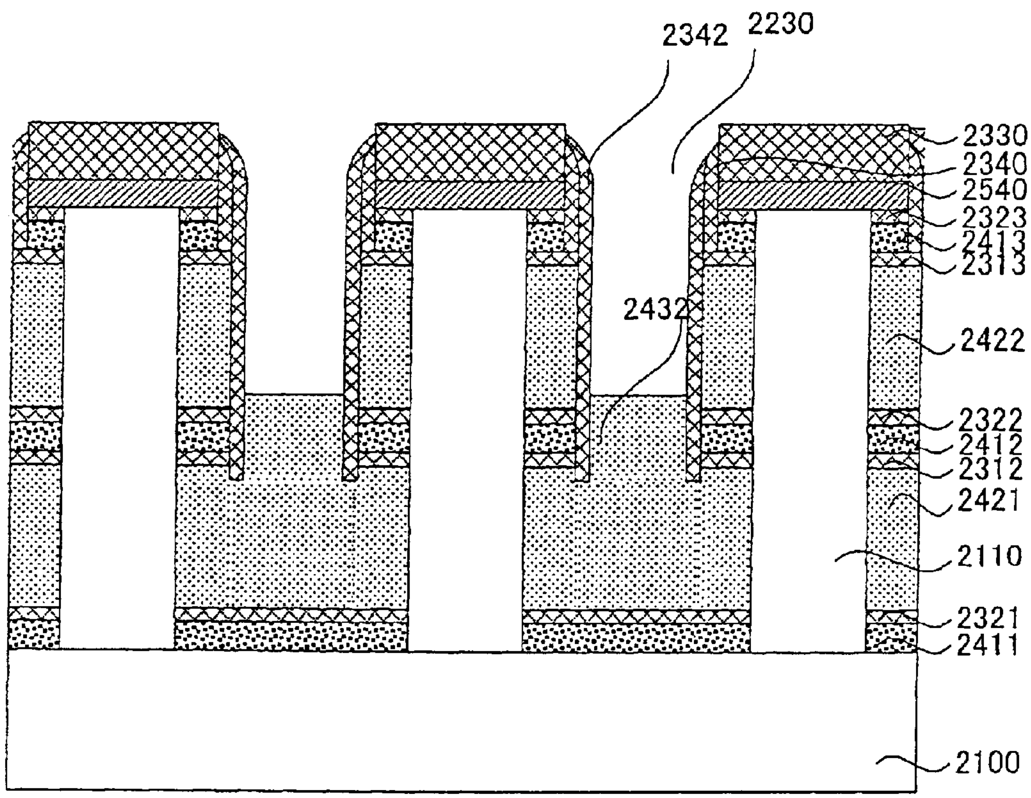
Figure 494:
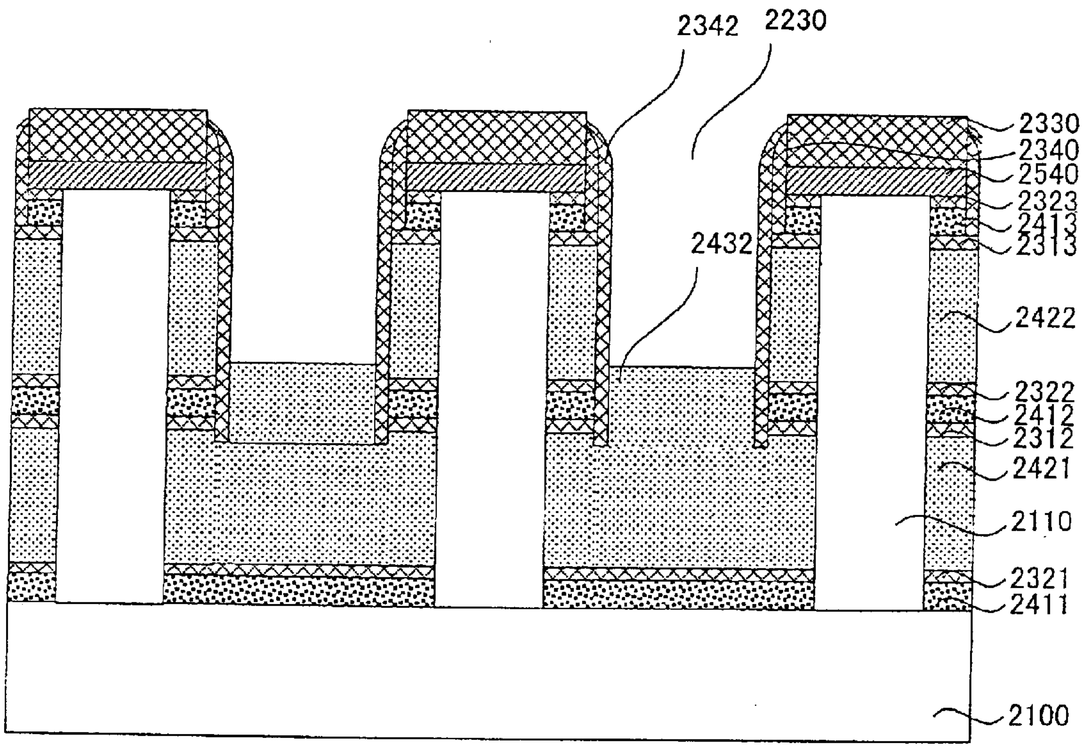

Thereafter, a silicon oxide film 2432, for example, is deposited as a seventh insulating film to a desired thickness and buried in the third trench 2230 such that the silicon oxide film 2412 containing the impurities is buried with intervention of the silicon nitride film 2342 (FIGS. 468 and 494).

Figure 469:
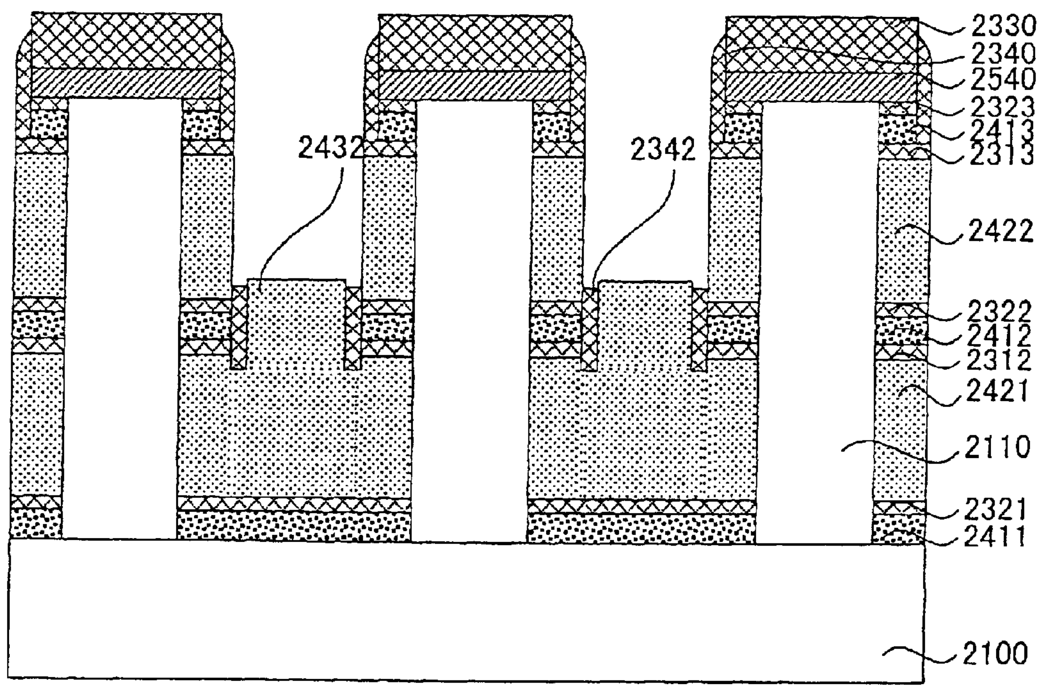
Figure 495:
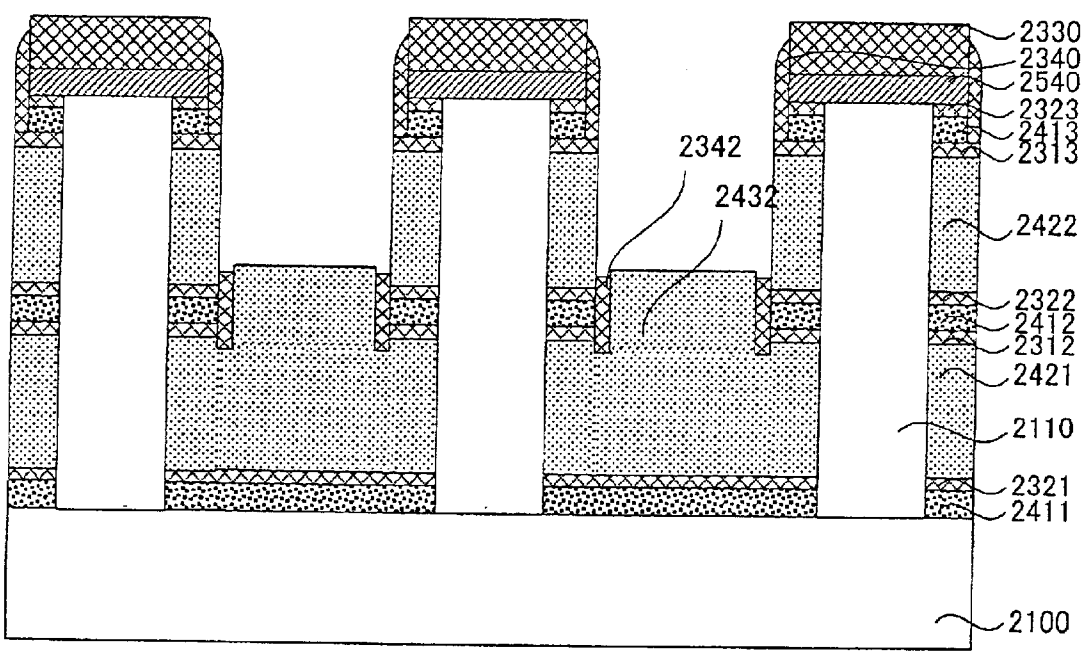

Using the silicon oxide film 2432 as a mask, an exposed portion of the silicon nitride film 2342 is removed by isotropic etching, while leaving an unexposed portion thereof (FIGS. 469 and 495).

Figure 470:
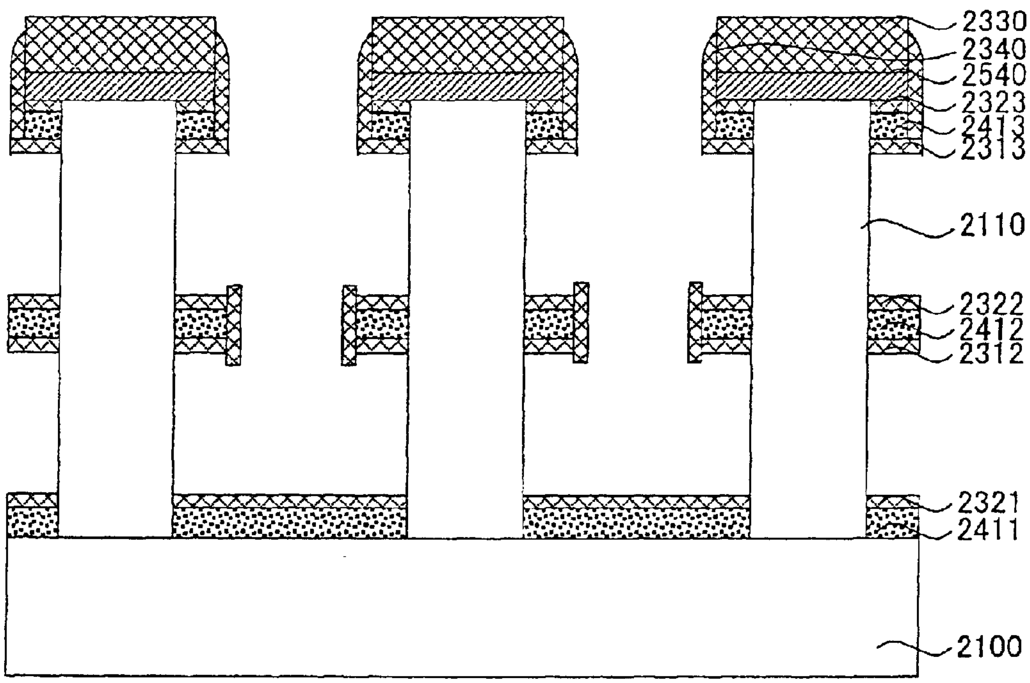
Figure 496:
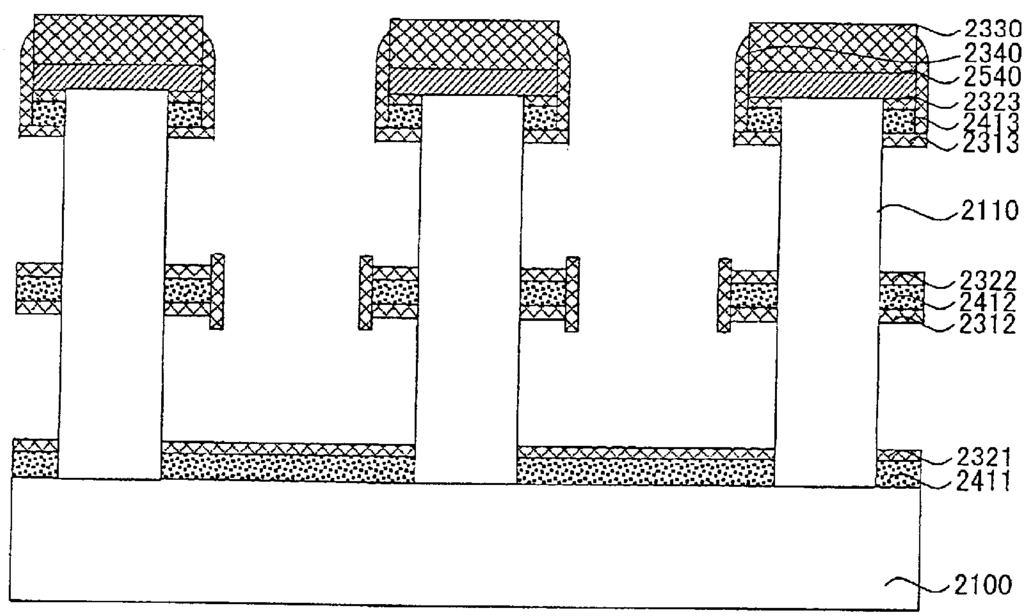

Thereafter, the silicon oxide films 2421 and 2422 (the third insulating films) and the silicon oxide film 2432 (the seventh insulating film) are removed by isotropic etching, for example, to expose the sides of the island-like semiconductor layers 2110 (FIGS. 470 and 496).

Figure 471:
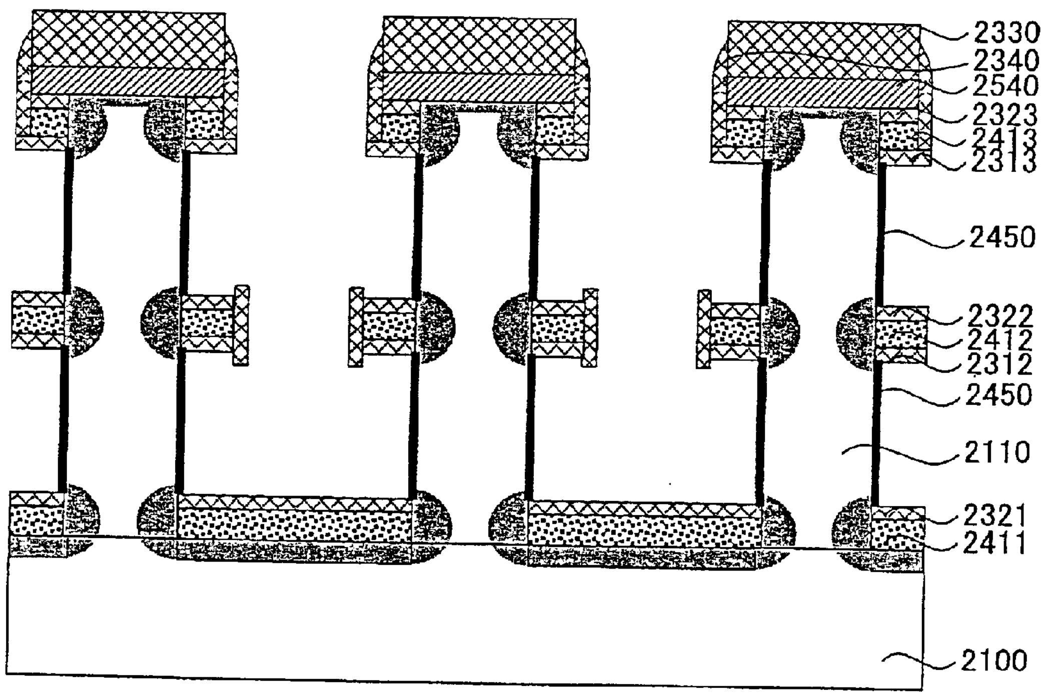
Figure 497:
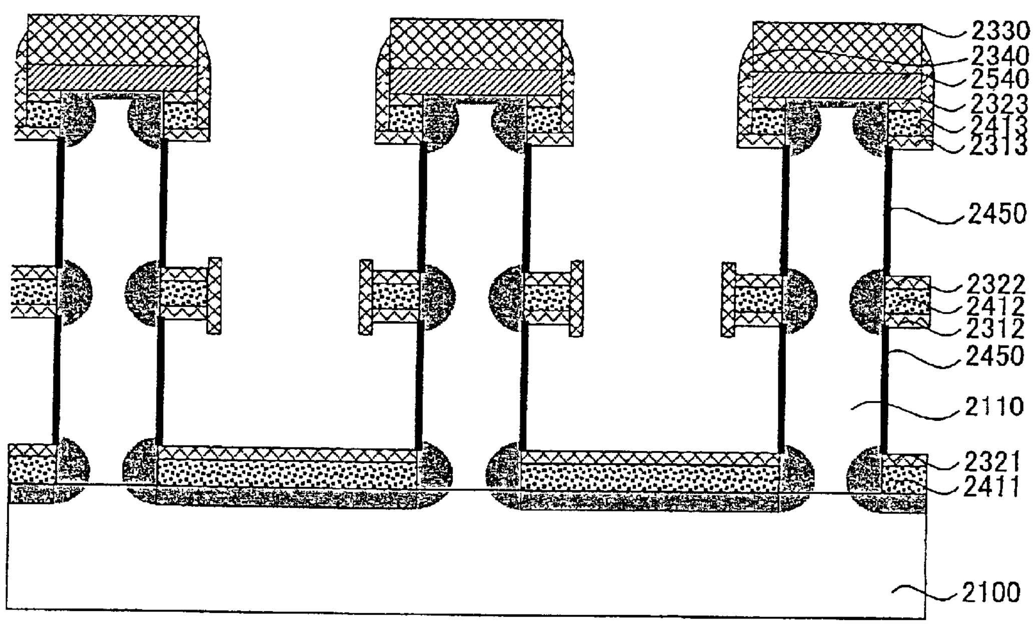

Then, the periphery of each island-like semiconductor layer 2110 is oxidized to form, for example, a thermally oxidized film 2450 of about 10 to 100 nm thick as a ninth insulating film (FIGS. 471 and 497).

Figure 472:
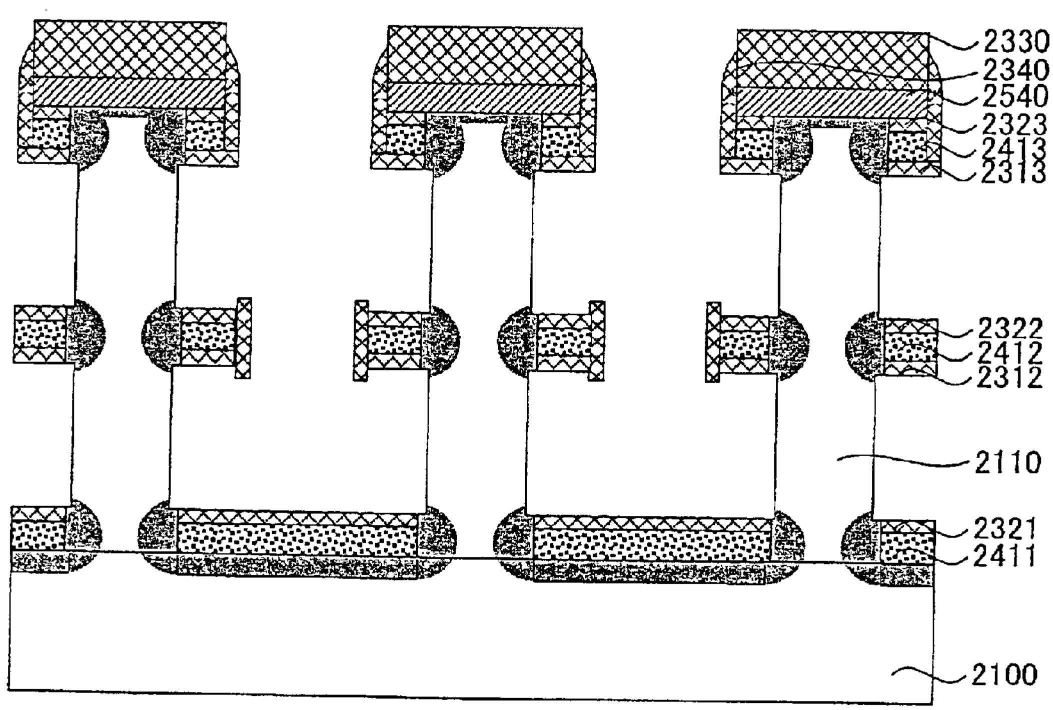
Figure 498:
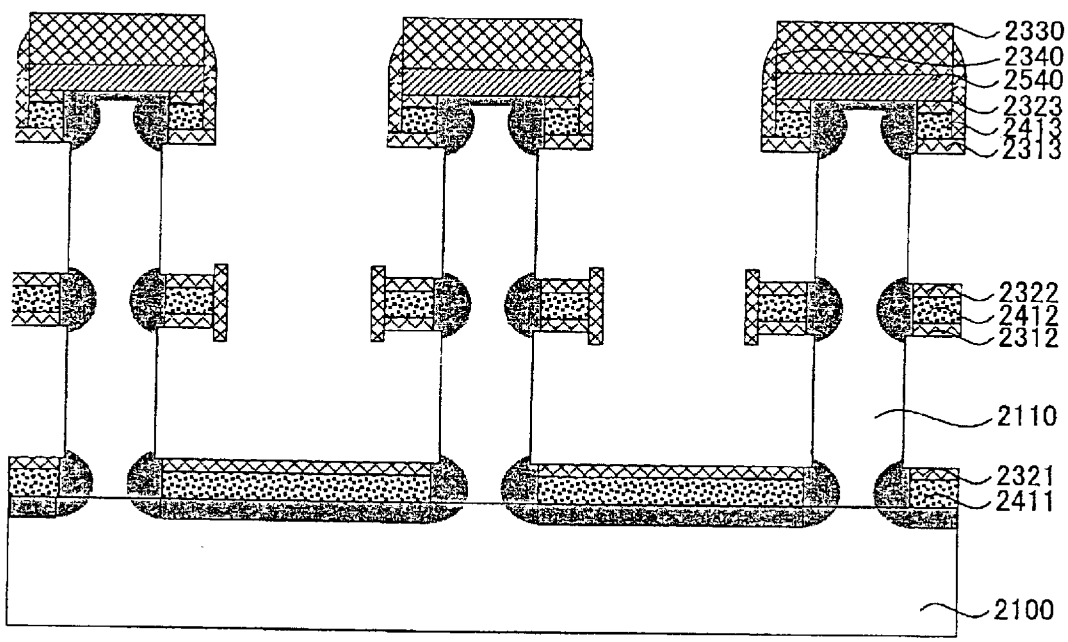

Next, the thermally oxidized film (the ninth insulating film) 2450 is etched away from the periphery of each island-like semiconductor layer 2110, for example, by isotropic etching (FIGS. 472 and 498). Then, as required, channel ion implantation is carried out into the sidewall of the island semiconductor layer 2110 by slant ion implantation. For example, the ion implantation may be performed at an implantation energy of 5 to 100 keV at a boron dose of about $1\times10^{11}$ to $1\times10^{13}$/cm$^2$ at an angle of 5 to 45° with respect to the normal line of the surface of the substrate. Preferably the channel ion implantation is performed from various directions to the island-like semiconductor layers 2110 because a surface impurity concentration becomes more uniform. Alternatively, instead of the channel ion implantation, an oxide film containing boron may be deposited by CVD with a view to utilizing diffusion of boron from the oxide film. The impurity implantation from the surface of the island-like semiconductor layers 2110 may be carried out before the island-like semiconductor layers 2110 are covered with the thermally oxidized film 2450, or during the formation of the island-like semiconductor layers 2110. Alternatively, the impurities may be introduced to the silicon oxide films 2421 and 2422 in advance with a view to implanting the impurities in the island-like semiconductor layers 2110 by thermal treatment or the like before removing the silicon oxide films 2421 and 2422. Means for the implantation are not particularly limited so long as an impurity concentration distribution is almost equal over the island-like semiconductor layers 2110.

Figure 473:
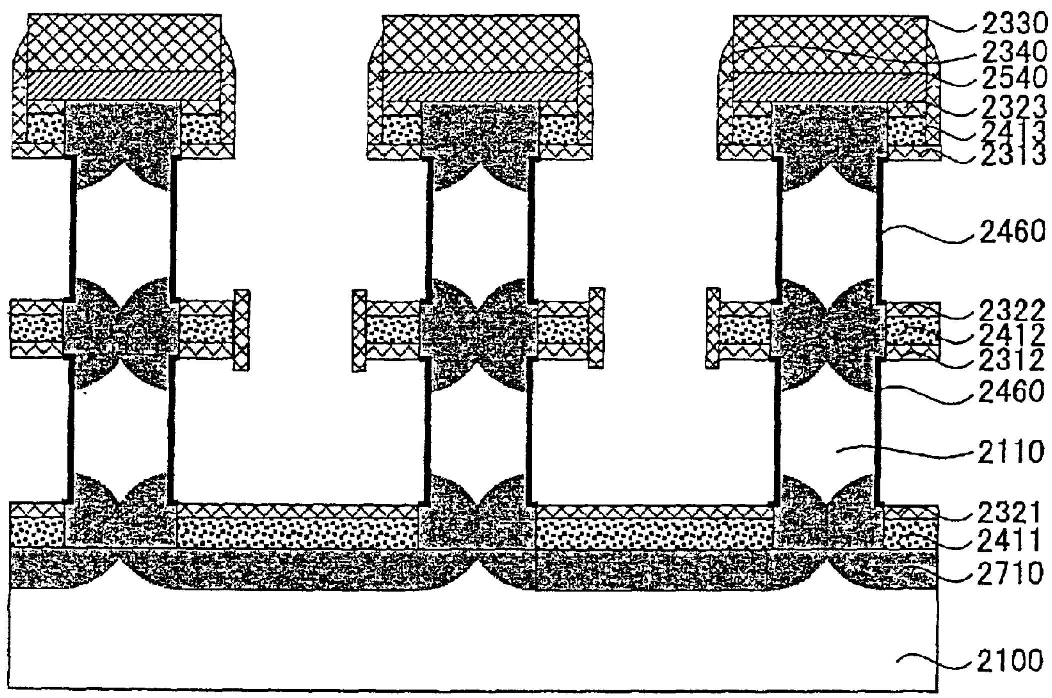
Figure 499:
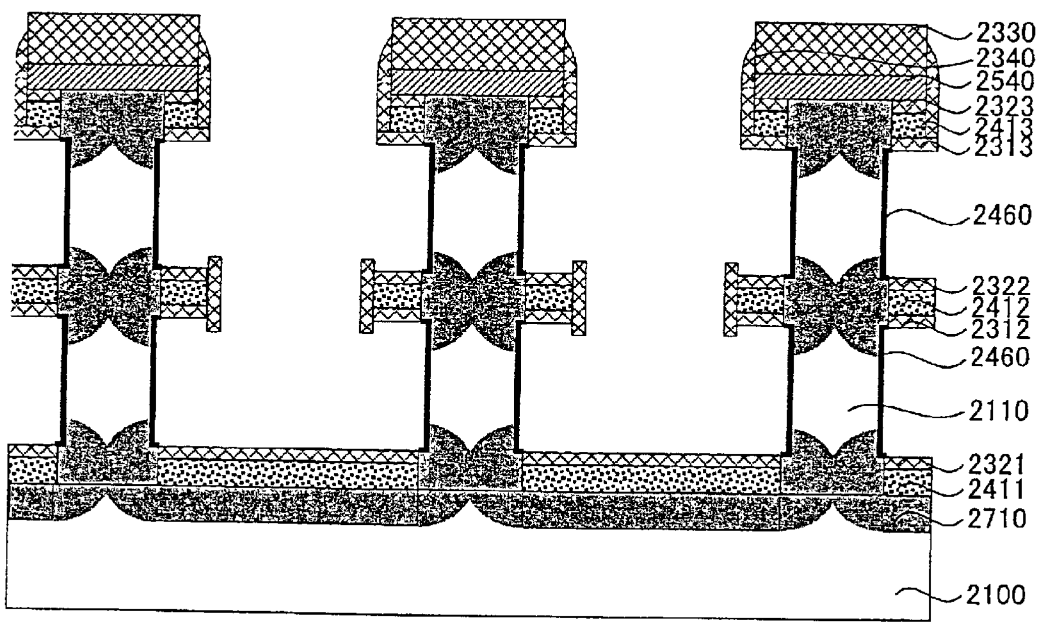

Subsequently, a silicon oxide film 2460, for example, is formed as a tenth insulating film to be a tunnel oxide film to a thickness of about 10 nm around each island-like semiconductor layer 2110, for example, by thermal oxidization (FIG. 473 and FIG. 499). The tunnel oxide film, however, may be formed of not only a thermally oxidized film but also a CVD oxide film or a nitrogen oxide film.

Figure 474:
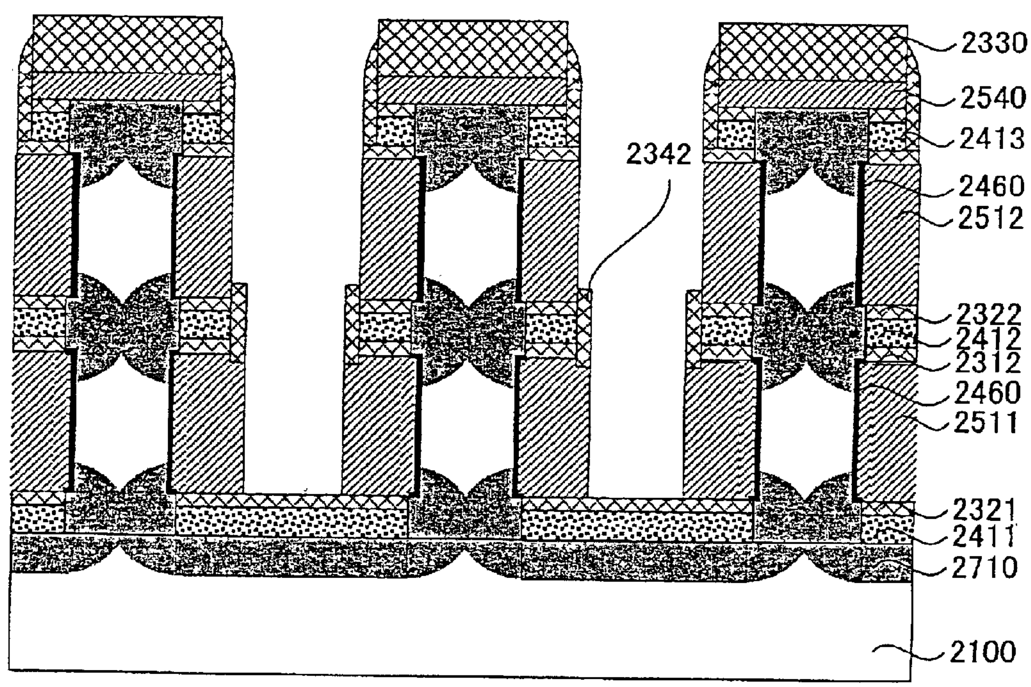
Figure 500:
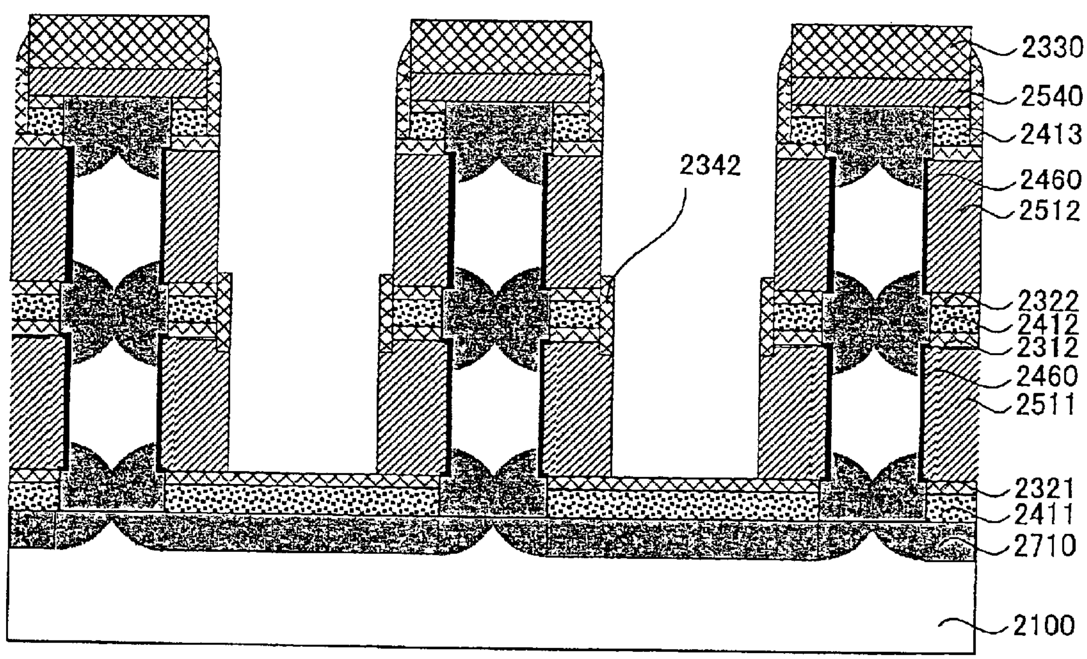

Subsequently, a polysilicon film 2510, for example, is deposited as a first conductive film to a thickness of about 50 to 200 nm. Using the silicon nitride film 2330 (the fifth insulating film) and the silicon nitride films 2340 and 2342 (the sixth insulating films) as a mask, the polysilicon film 2510 is divided into polysilicon films 2511 and 2512, for example, by anisotropic etching (FIGS. 474 and 500).

Figure 475:
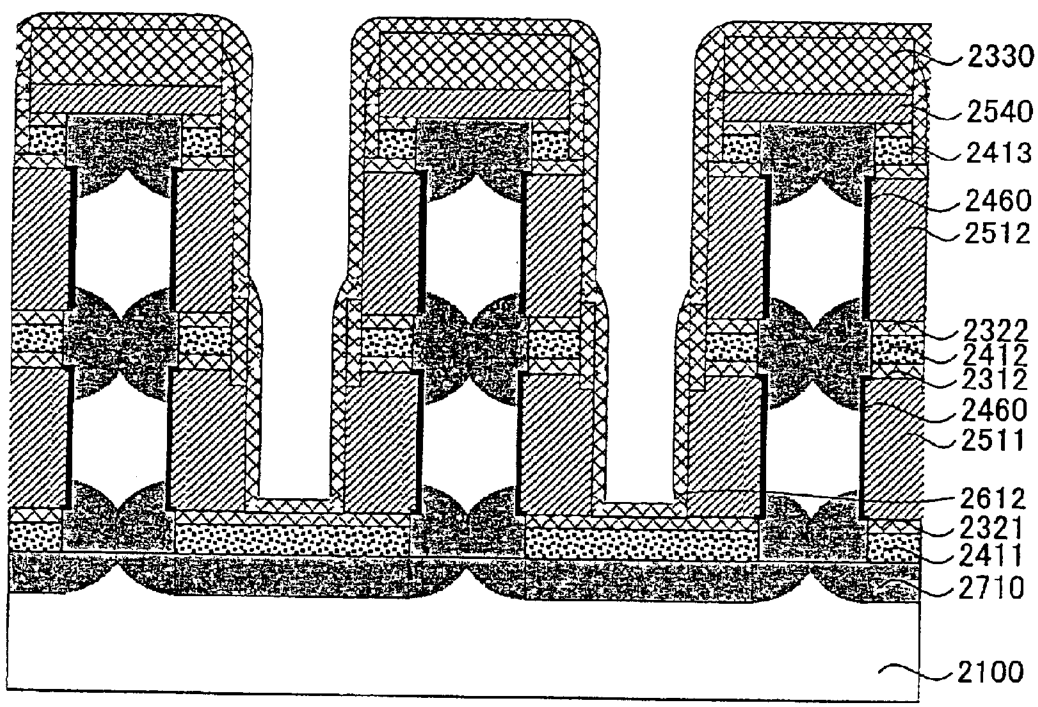
Figure 476:
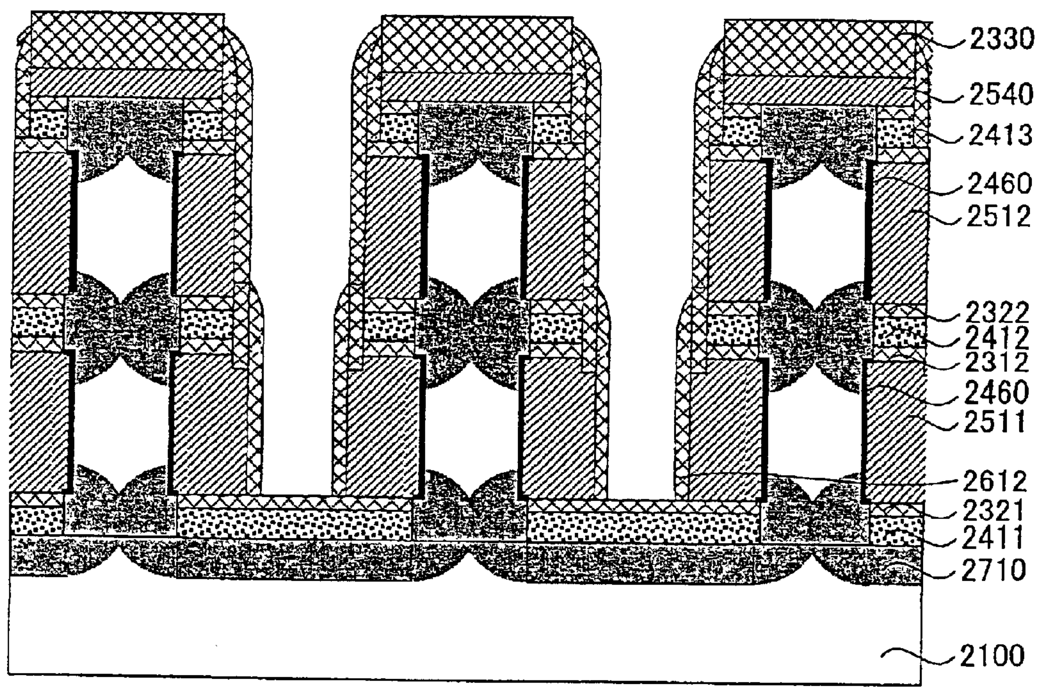
Figure 501:
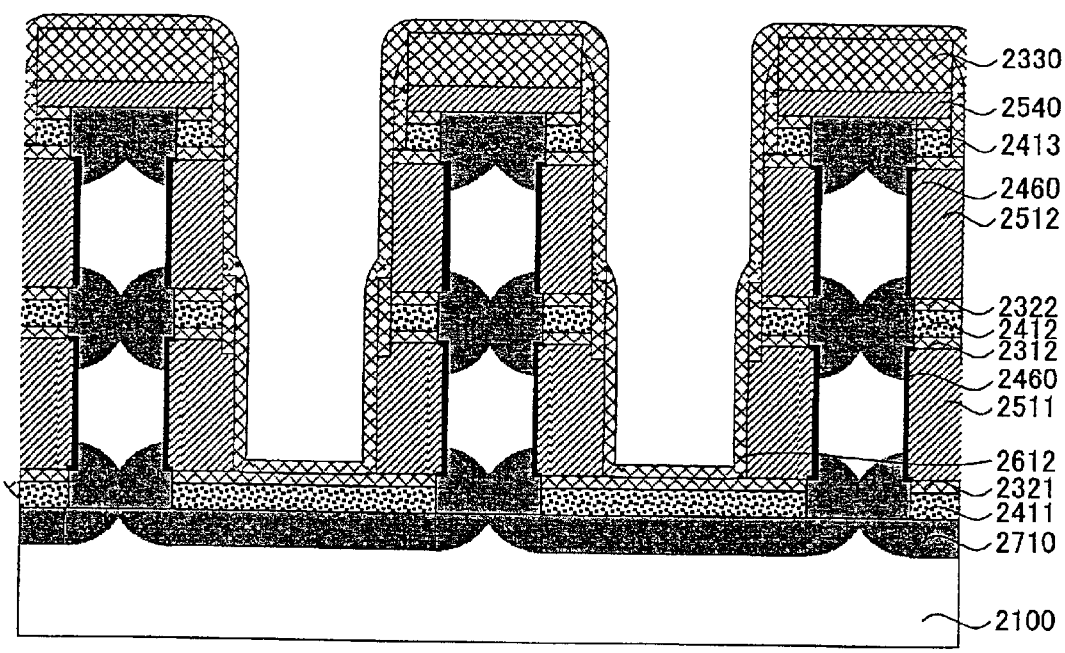
Figure 502:
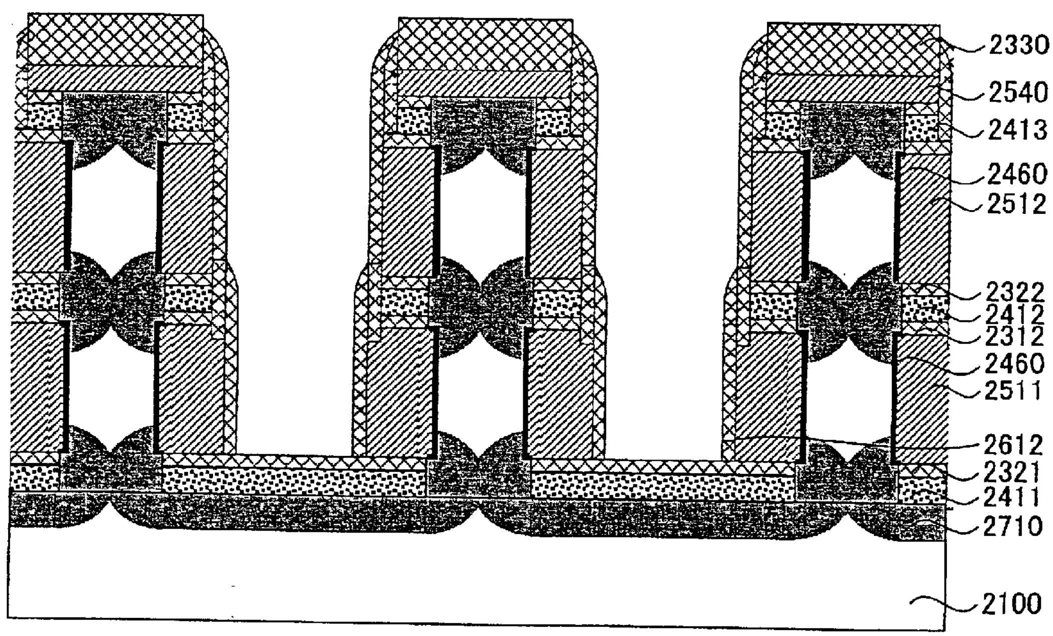

Subsequently, an interlayer insulating film 2612 is formed on exposed surfaces of the polysilicon films 2511 to 2512 (FIG. 475 and FIG. 501). This interlayer insulating film 2612 may be formed of an ONO film, for example. The ONO film may be formed in the same manner as in Production example 1.

The interlayer insulating film 2612 is anisotropically etched to expose the silicon nitride film 2321 (FIGS. 476 and 502), and then a polysilicon film (a second conductive film) 2521, for example, is deposited to a thickness of 15 to 150 nm. The polysilicon film 2521 may be deposited without performing the etch-back of the interlayer insulating film 2612.

Figure 477:
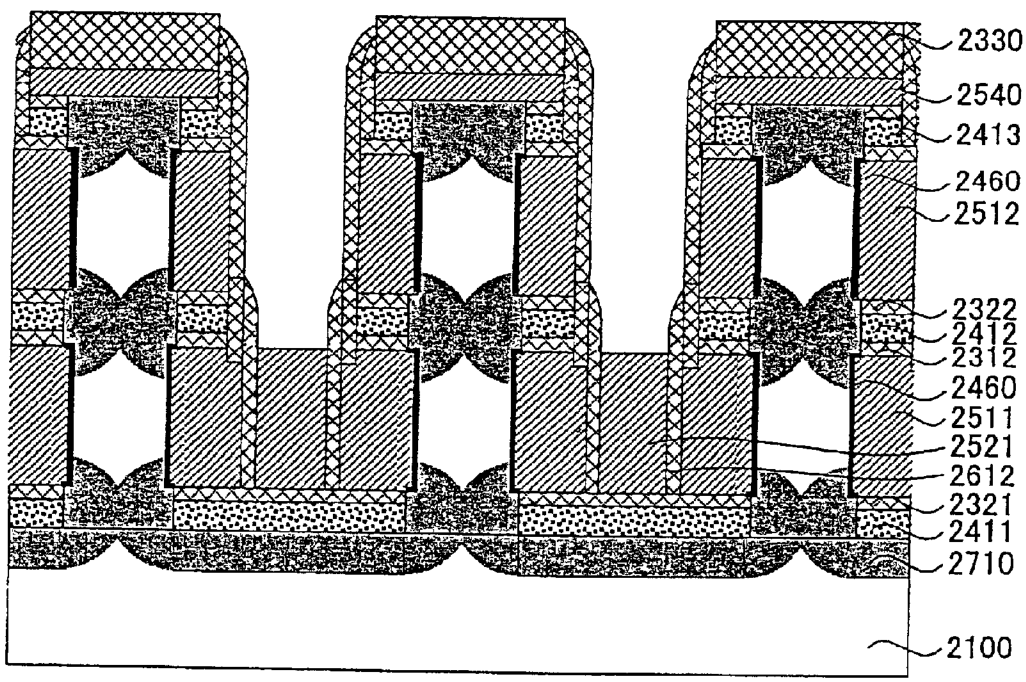
Figure 503:
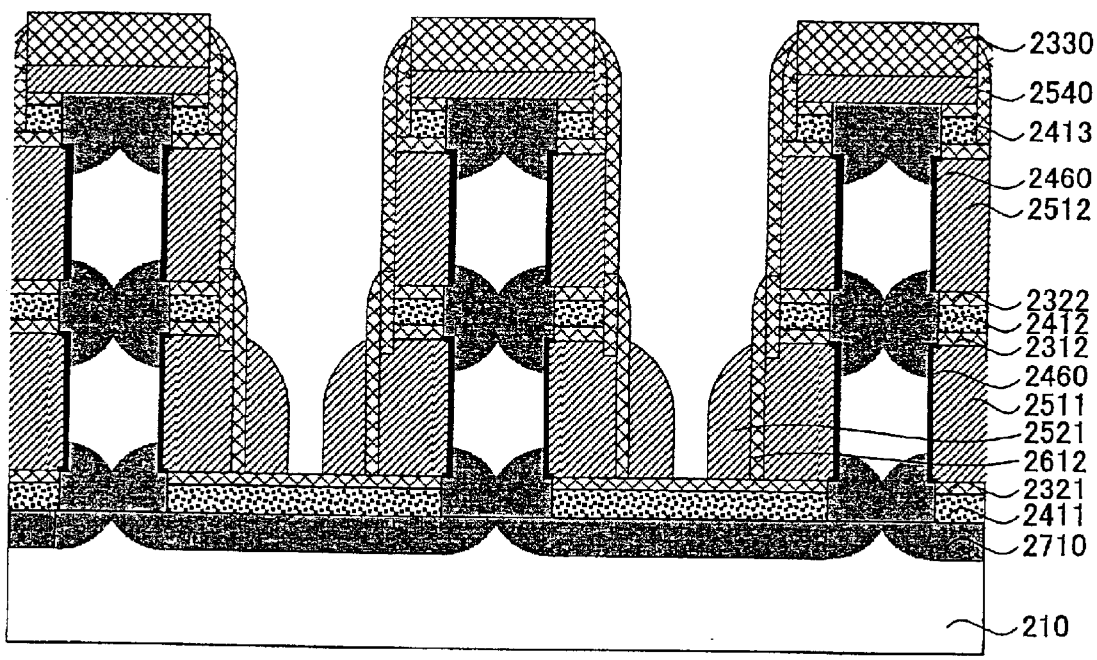

Thereafter, as shown in FIG. 503, the polysilicon film 2521 (the second conductive film) is etched back, for example, by anisotropic etching (FIGS. 477 and 503).

Figure 478:
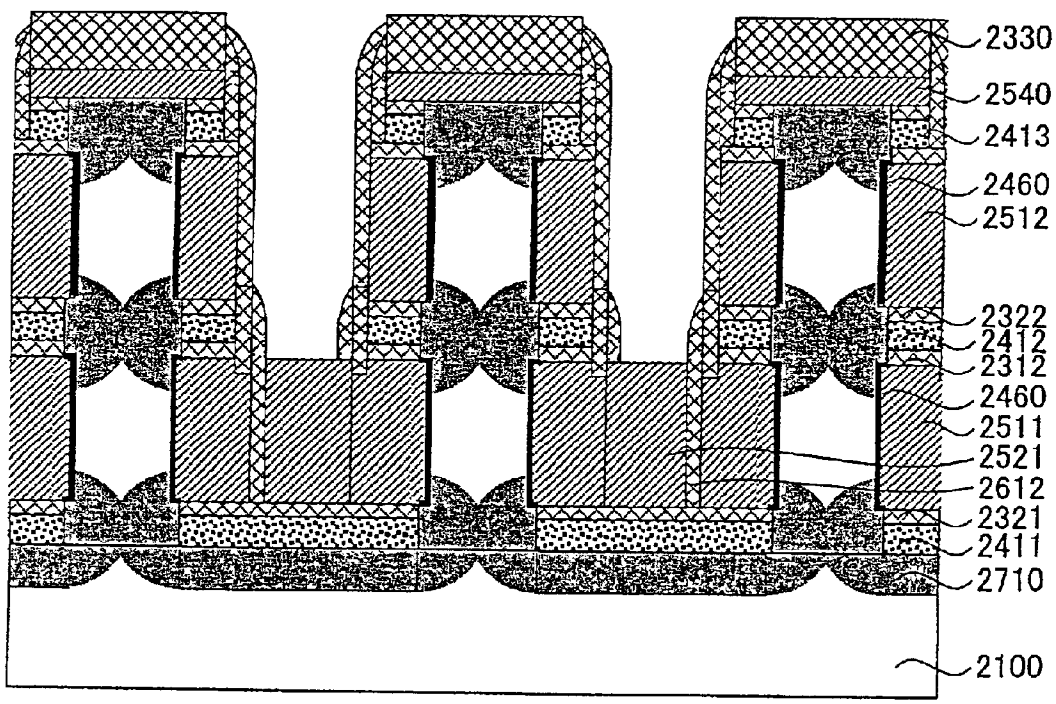
Figure 479:
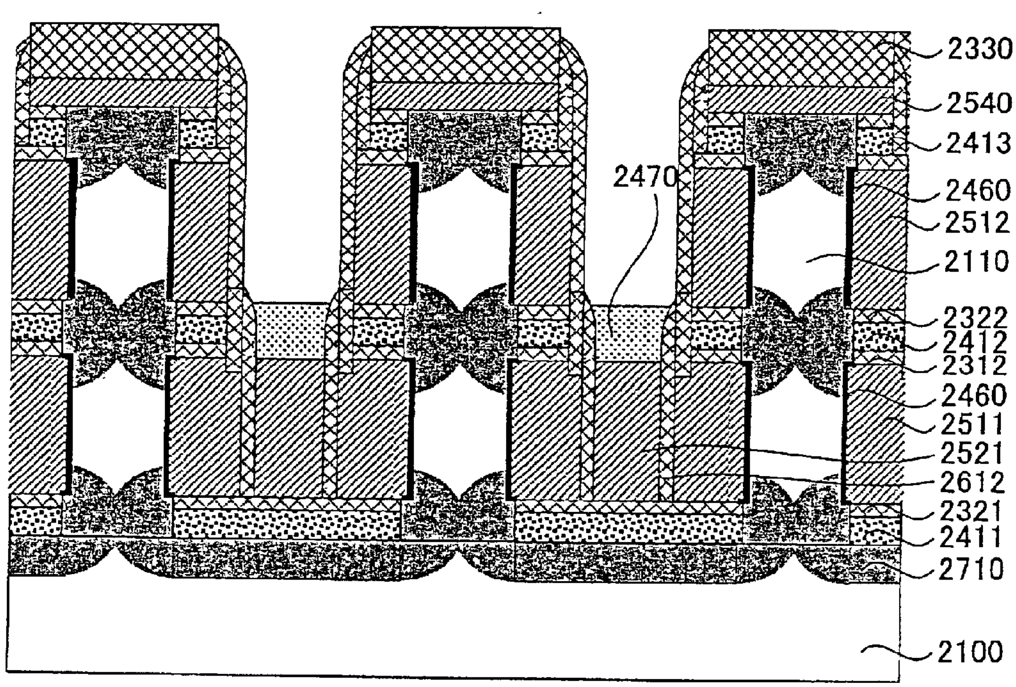
Figure 504:
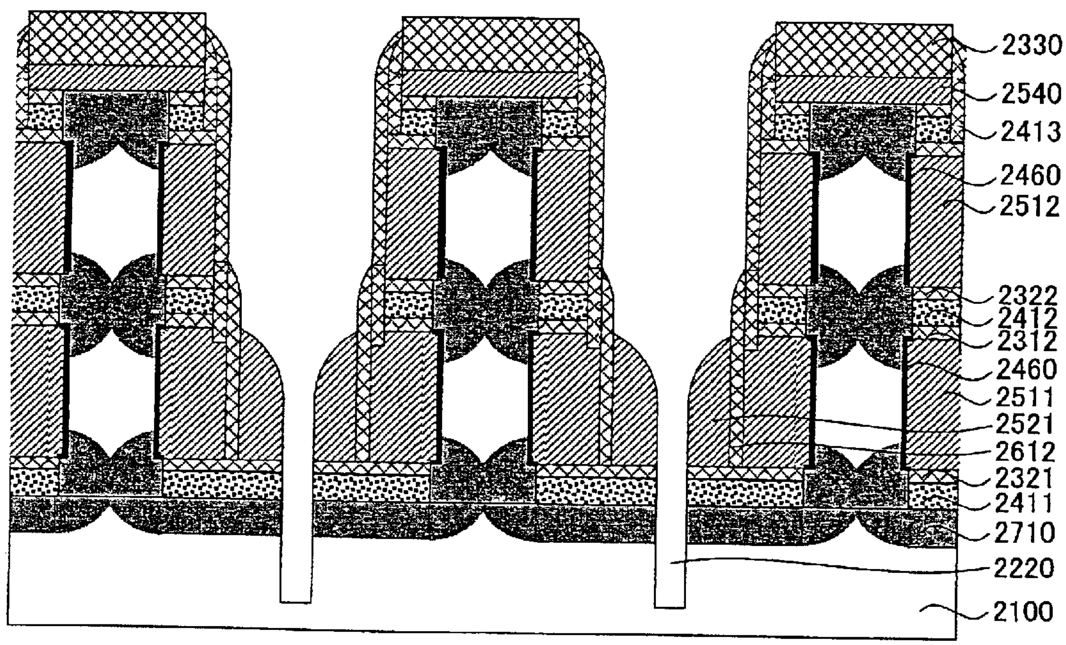
Figure 505:
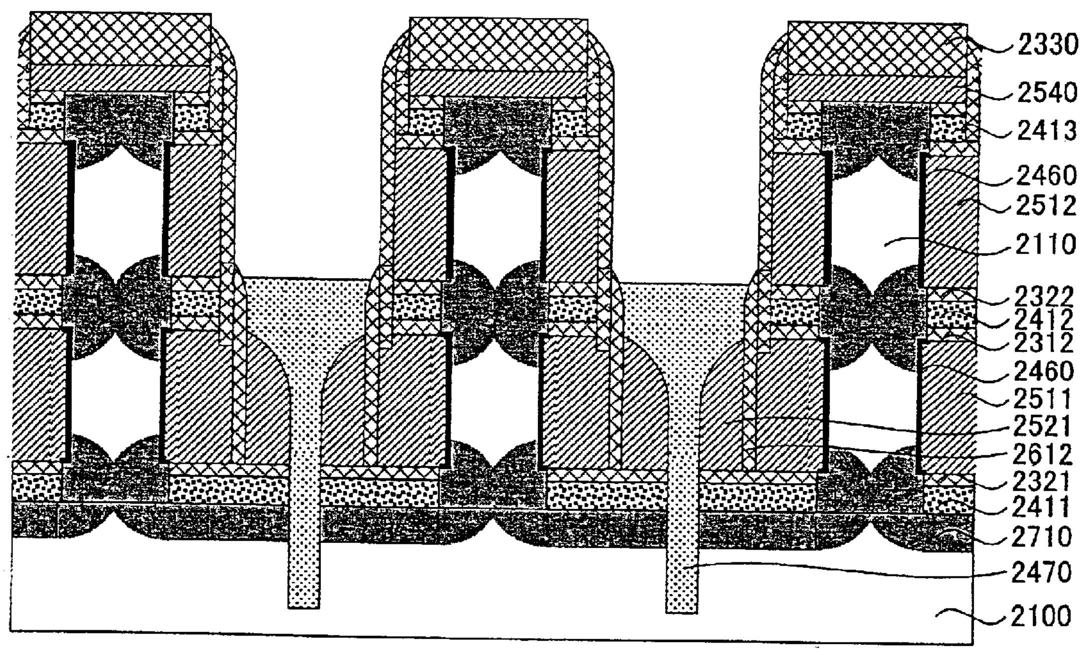

Subsequently, the silicon nitride film 2321 (the fourth insulating film), the silicon oxide film 2411 (the first insulating film) and the P-type silicon substrate 2100 are successively etched to form a second trench 2200 in the P-type silicon substrate 2100 in self-alignment with the polysilicon film 2521 (the second conductive film), thereby separating the impurity diffusion layer 2710. That is, a separation portion of the first wiring layer is formed in self-alignment with a separation portion of the second conductive film (FIG. 478 and FIG. 504).

Then, a silicon oxide film 2470, for example, is deposited to a thickness of 30 to 300 nm as an eleventh insulating film and buried in the second trench 2220 by anisotropic etch-back (FIGS. 479 and 505) such that the polysilicon film 2521 (the second conductive film) is embedded by the silicon oxide film 2470. At this time, by setting the intervals between the island-like semiconductor layers 2110 in a direction of A-A' in FIG. 1 to a predetermined value or smaller, the polysilicon film 2521 is formed into a third wiring layer to be a control gate line continuous in the direction without need to use a masking process.

Figure 480:
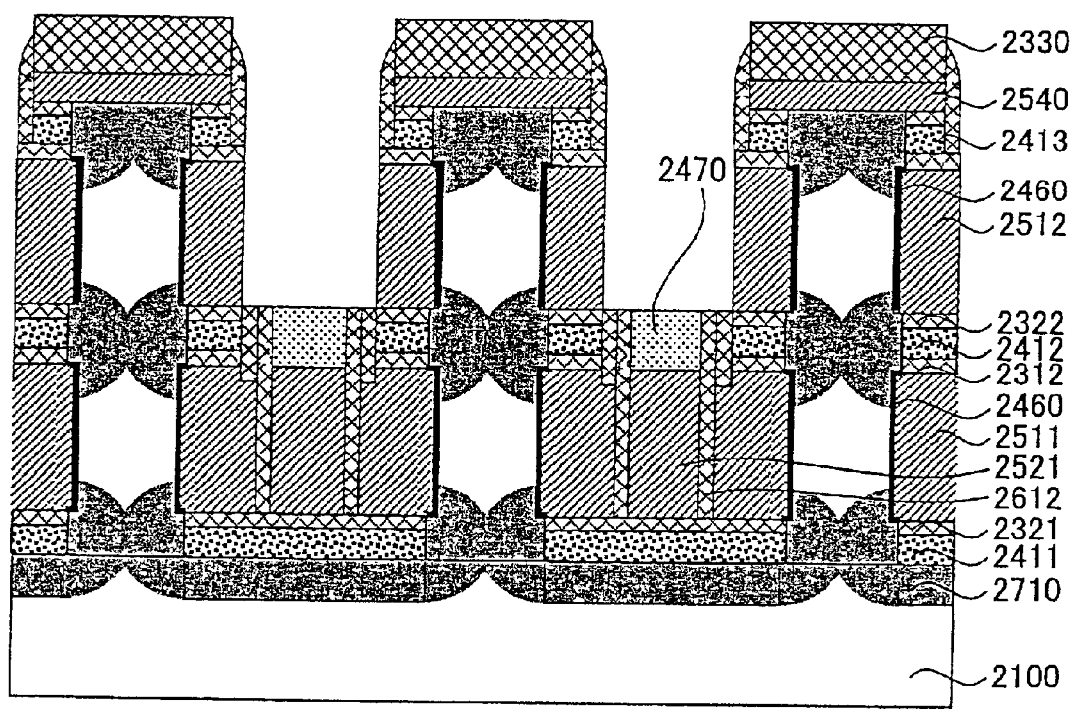
Figure 506:
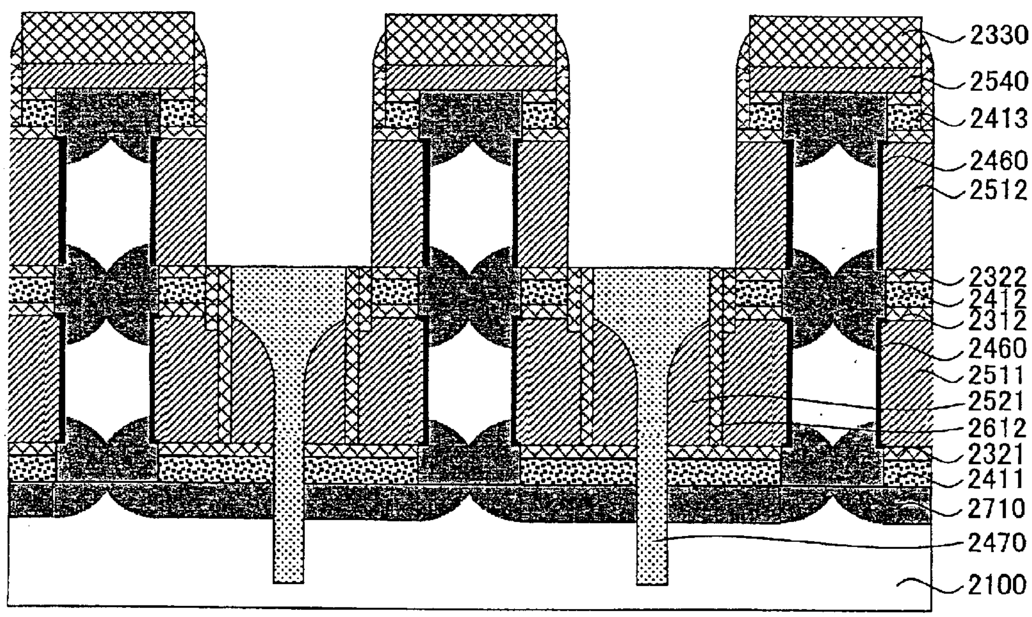

Thereafter, the interlayer insulating film 2610 which is not embedded by the silicon oxide film 2470 is etched away (FIGS. 480 and 506).

Figure 481:
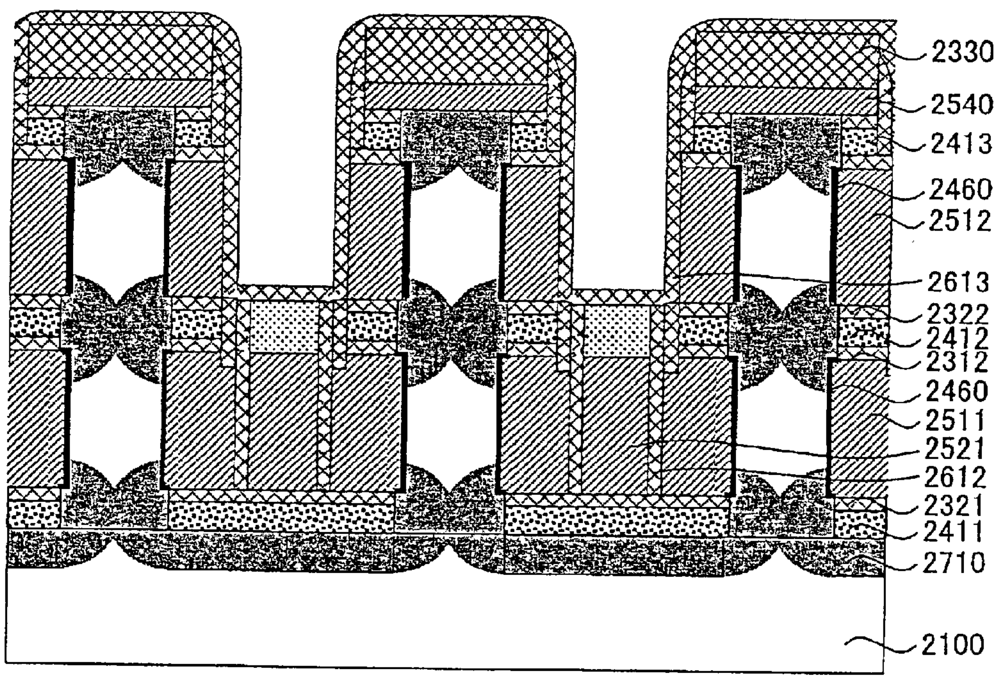
Figure 482:
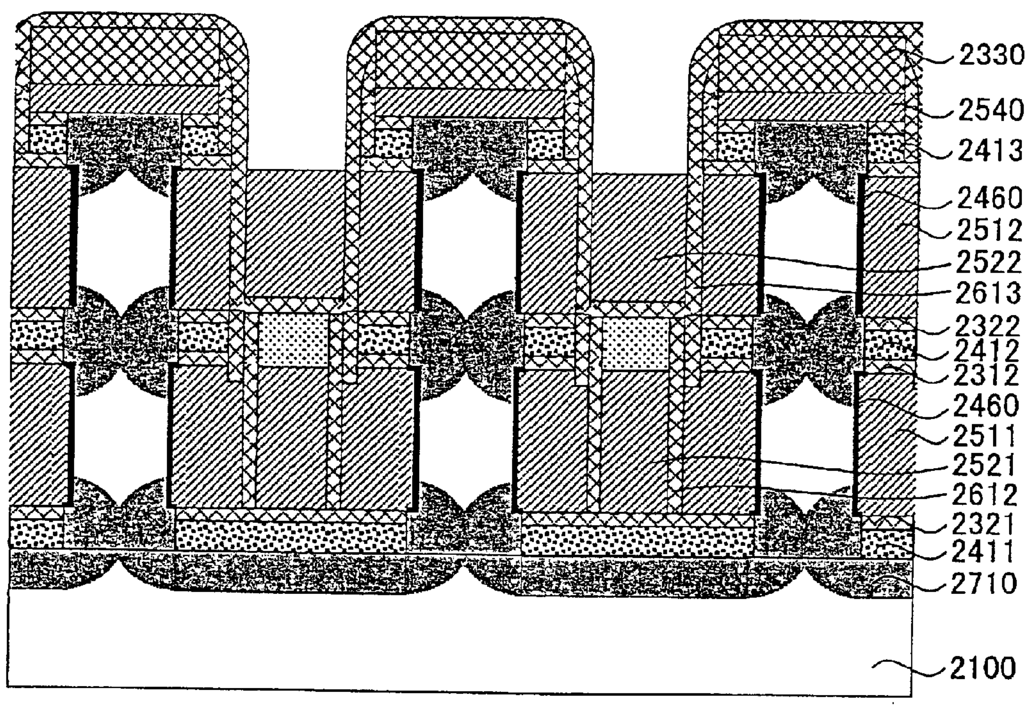
Figure 507:
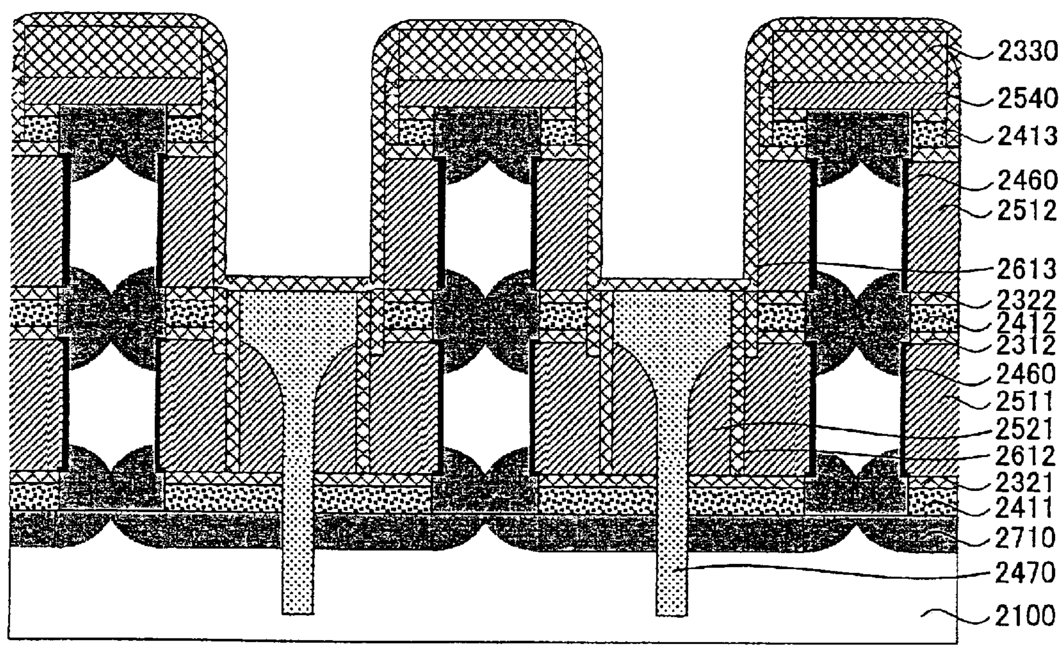
Figure 508:
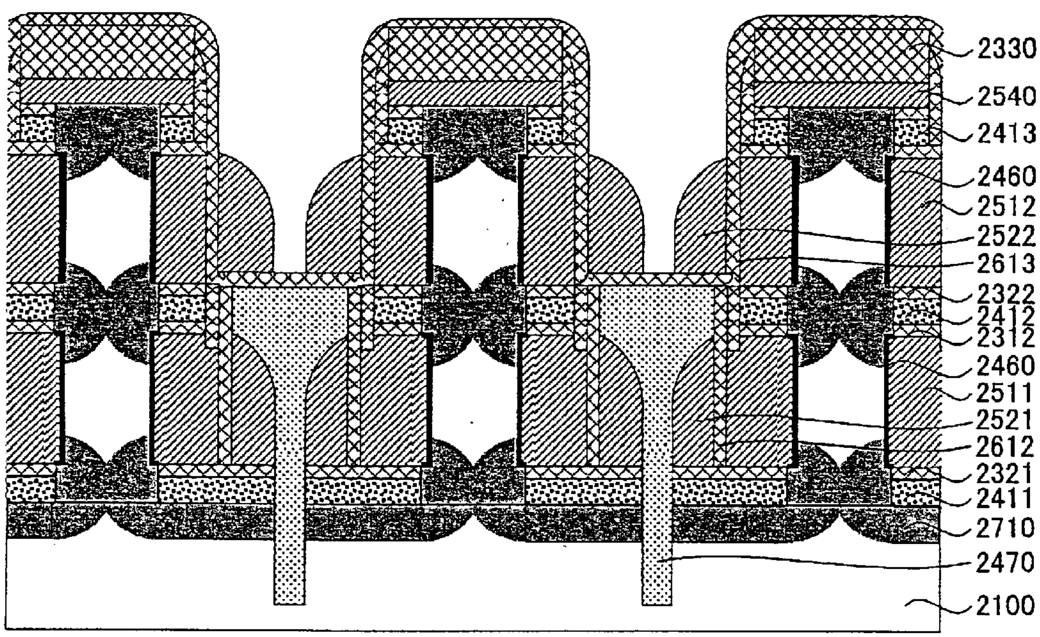

In the same manner, an interlayer insulating film 2613 is formed on the exposed surface of the polysilicon film 2512 (FIGS. 481 and 507). Then a polysilicon film 2522 is deposited as a second conductive film to a thickness of 15 to 150 nm and anisotropically etched back such that the polysilicon film 2522 is disposed on the side of the polysilicon film (the first conductive film) 2512 with intervention of the interlayer insulating film 2613 (FIGS. 482 and 508).

Figure 483:
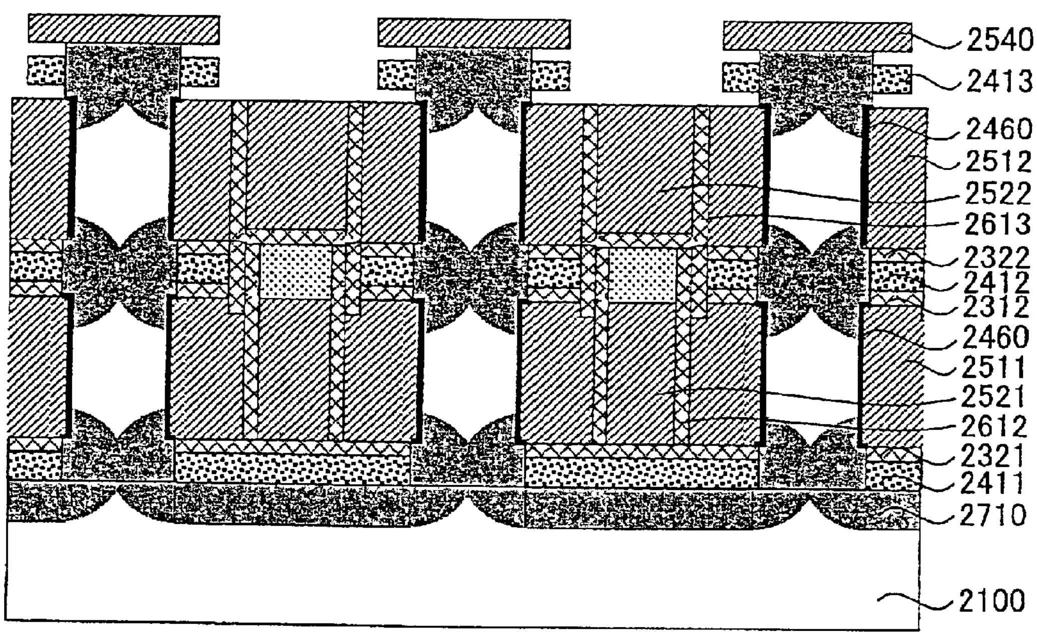
Figure 509:
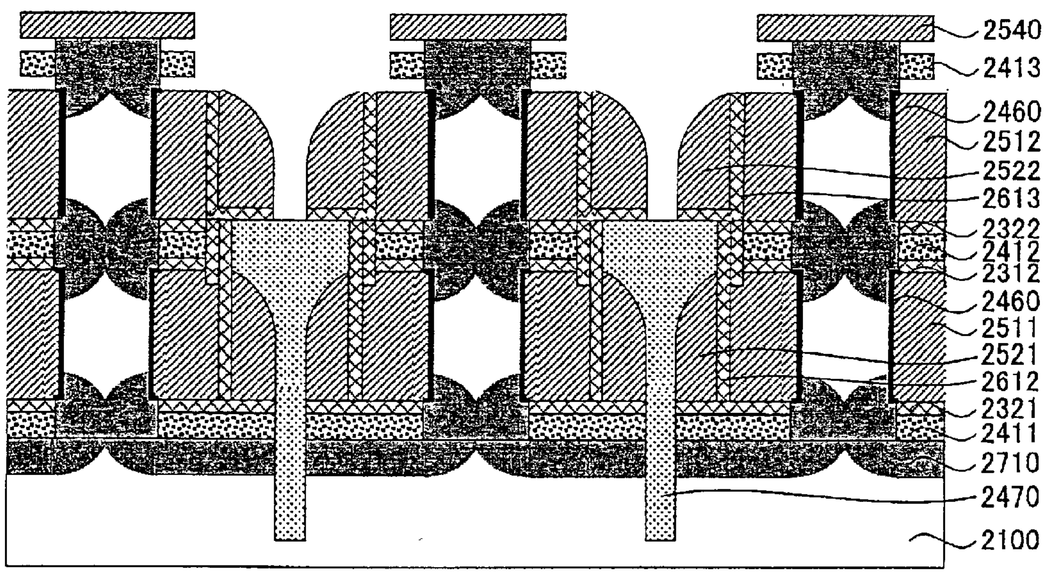

Then, the interlayer insulating film 2613, the silicon nitride film 2330 (the fifth insulating film) and the silicon nitride film 2340 (the sixth insulating film) are removed by, for example, isotropic etching to expose the polysilicon film 2540 (FIGS. 483 and 509).

Subsequently, a silicon oxide film 2472 is deposited as an eleventh insulating film to a thickness of 100 to 500 nm on the top of the polysilicon film 2522. The top portion of the polysilicon film 2540 is exposed by etch-back or by CMP. A fourth wiring layer 2840 is formed so that its direction crosses the direction of the second or third wiring layer and is connected to the top portion of the island-like semiconductor layer 2110.

Figure 484:
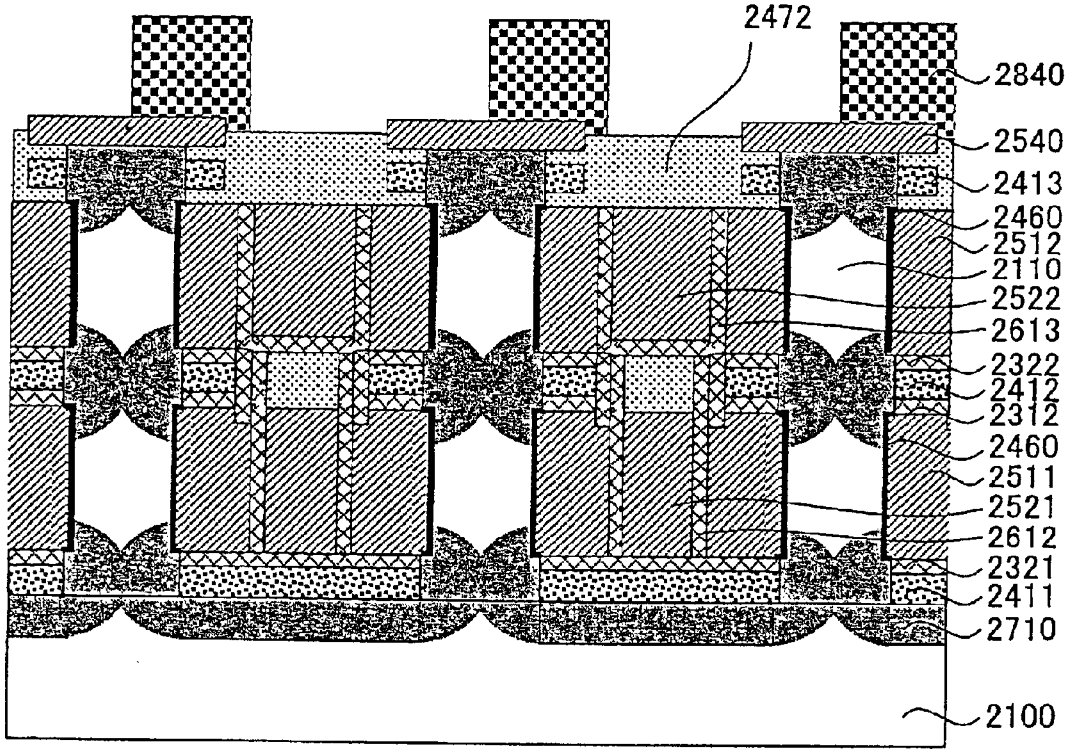
Figure 485:
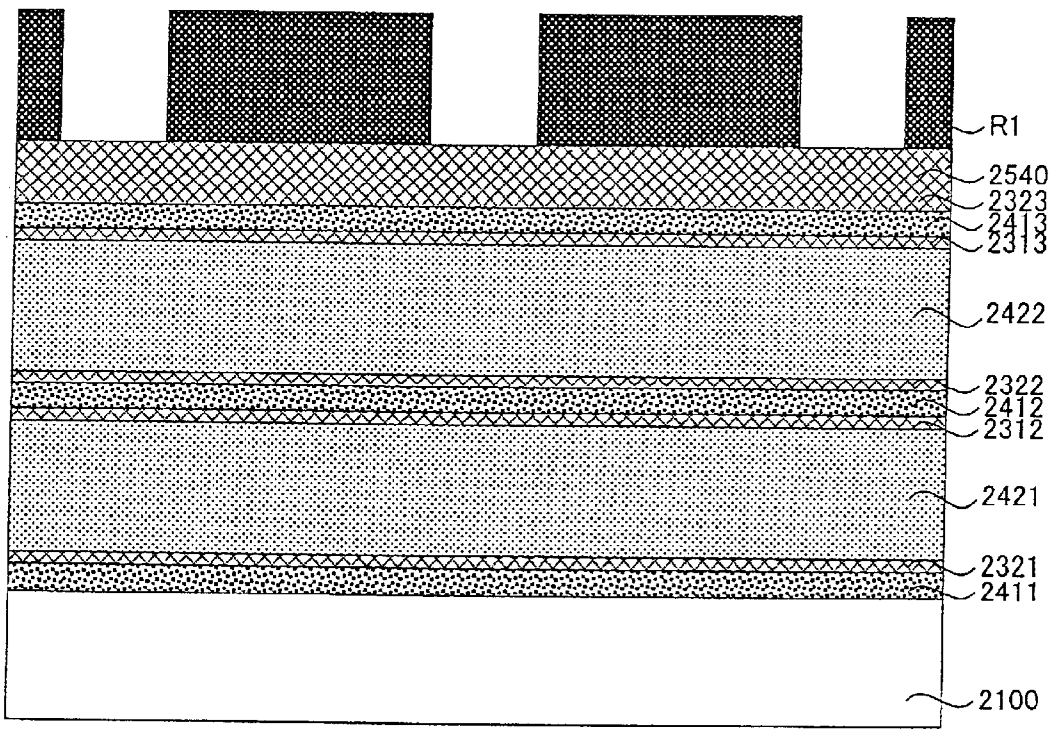
Figure 510:
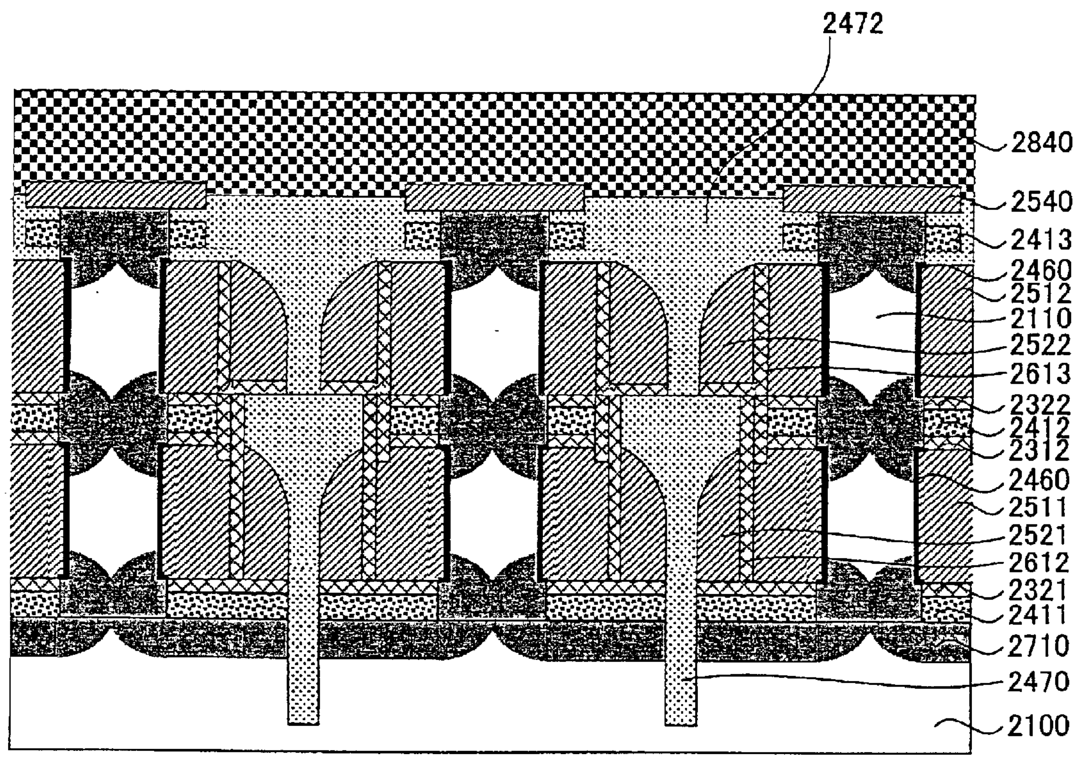

Thereafter, by known techniques, an interlayer insulating film is formed, and a contact hole and metal wiring are formed (FIGS. 484 and 510). Thereby, a semiconductor memory is realized which has a memory function according to the state of a charge in the charge storage layer which is the floating gate made of the polysilicon film (the first conductive film).

In this example, films formed on the surface of the semiconductor substrate or the polysilicon film such as the silicon nitride film (the fifth insulating film) 2330 and the silicon nitride film (the sixth insulating film) 2340 may be formed of a layered film of a silicon oxide film/a silicon nitride film from the silicon surface.

With regard to the polysilicon films 2510 or 2511 to 2512 (the first conductive films), the polysilicon films 2521 to 2522 (the second conductive films) and the polysilicon film 2540 (the fourth conductive film), impurity introduction may be carried out during or after the formation of the polysilicon films or after the separation of the polysilicon films. The timing of the impurity introduction to the polysilicon films is not particularly limited so long as these films become conductive films.

In the example, the control gates of the memory cells are formed continuously in one direction without using a mask. However, that is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

Further, by providing the selection gates in the top and the bottom of a set of memory cells, it is possible to prevent the phenomenon that a memory cell transistor is over-erased.

PRODUCTION EXAMPLE 18

In a semiconductor memory to be produced in this example, regions for forming charge storage layers are defined in advance by a laminated film comprising plural films, and then island-like semiconductor layers in a pillar form are formed by selective epitaxial silicon growth in trenches opened by using a photoresist mask. Tunnel oxide films and floating gates as charge storage layers are formed on the sides of the island-like semiconductor layers in the regions for forming the charge storage layers. The island-like semiconductor layers are each in an electrically floating state with respect to the semiconductor substrate. The active regions of the memory cells are electrically common. Selection gate transistors are disposed at the top and the bottom of the island-like semiconductor layer. A plurality of memory transistors, for example, two memory transistors, are placed between the selection gate transistors. The tunnel oxide film and the floating gate of the transistors are formed at the same time. The transistors are connected in series along the island-like semiconductor layer. The thickness of gate insulating films of the selection gate transistors is equal to the thickness of gate insulating films of the memory transistors. Further, transmission gates are disposed between the transistors for transmitting potentials to the active regions of the memory cell transistors.

Figure 511:
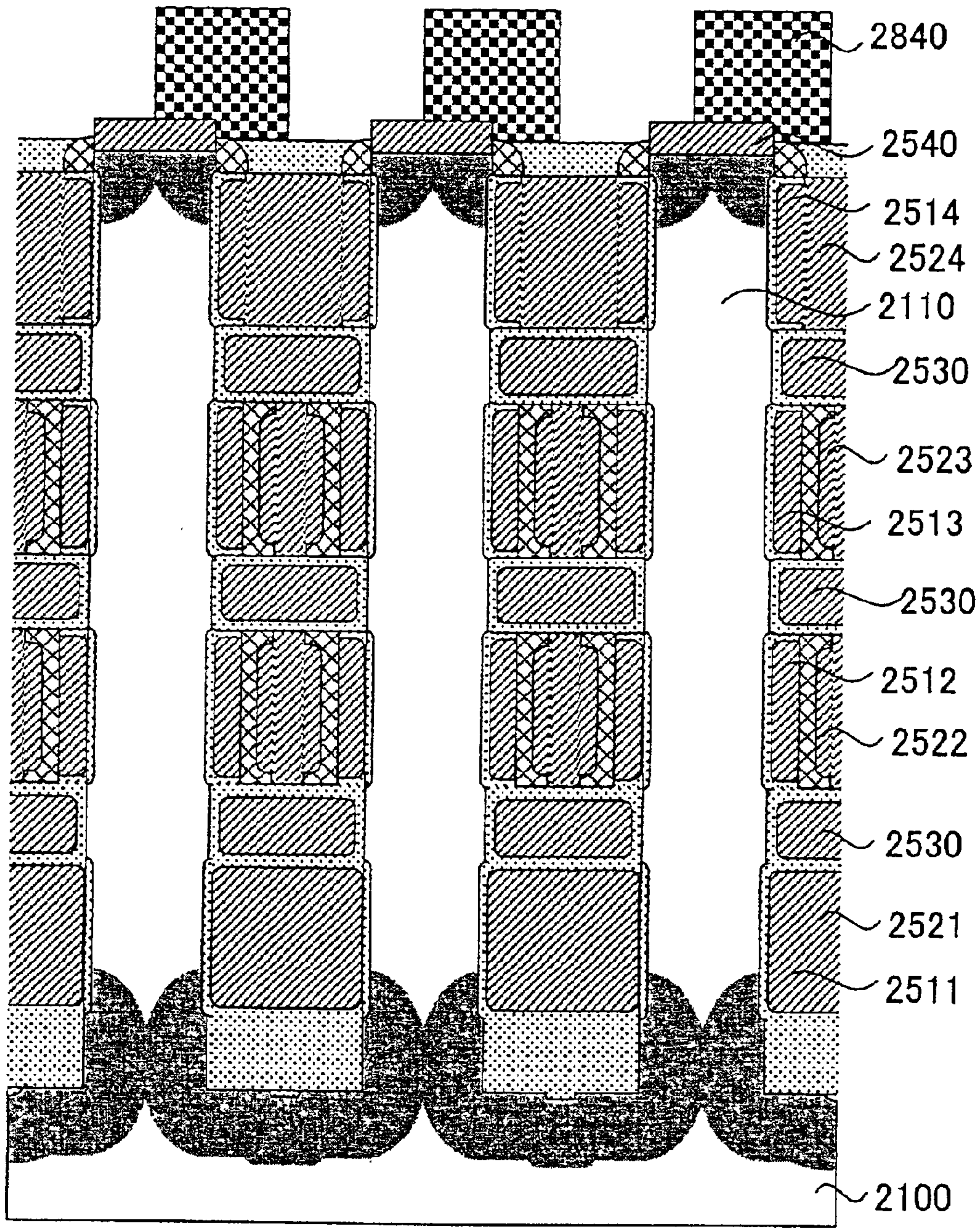
Figure 512:
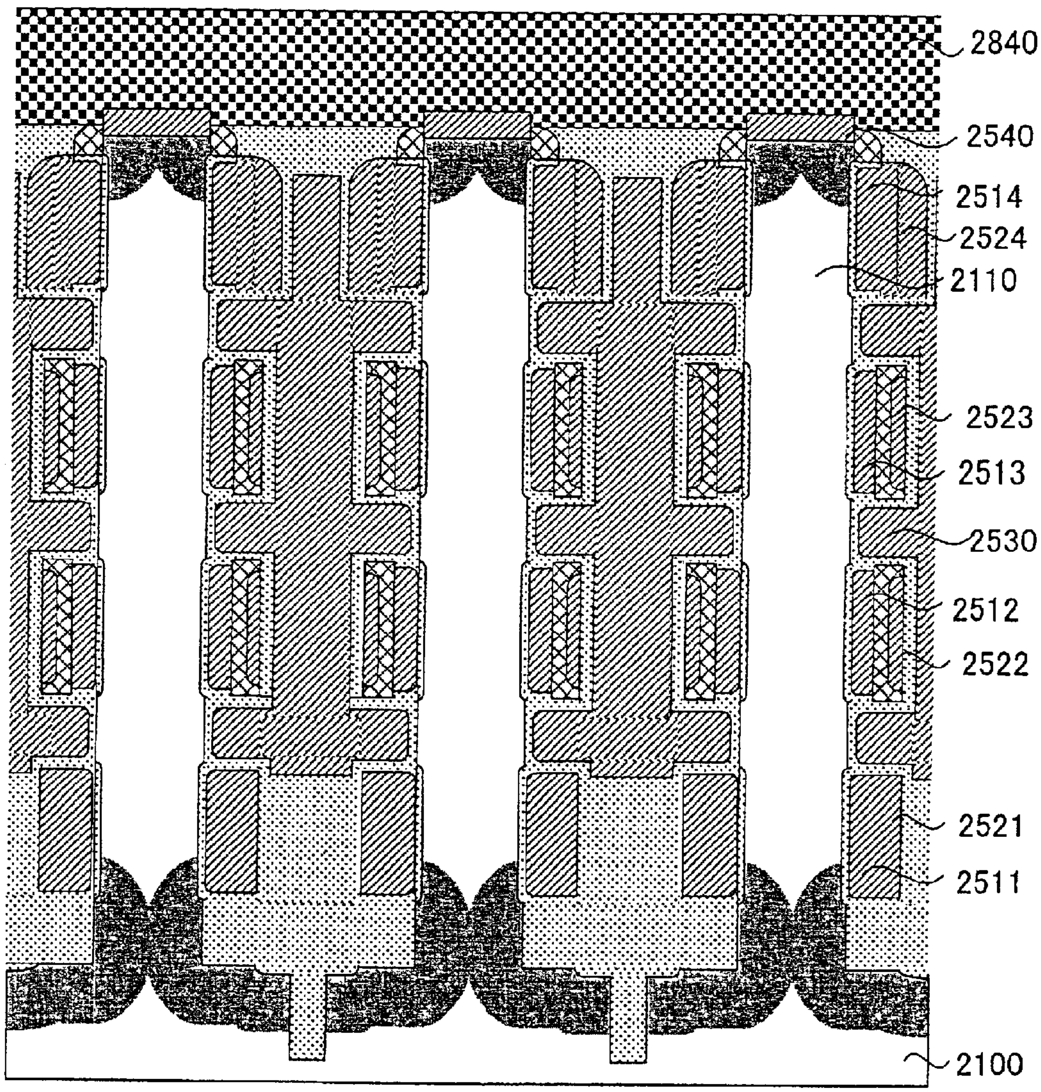

Such a semiconductor memory may be produced by the following production process. FIG. 511 and FIG. 512 are sectional views taken on line A-A' and line B-B', respectively, in FIG. 1 which is a plan view illustrating an EEPROM memory cell array.

In this example, production steps are the same as those of Production Example 11 except that the step of forming gate electrodes made of a polysilicon film 2530 (a third conductive film) is added after the polysilicon films (second conductive films) 2521, 2522, 2523 and 2524 are formed.

That is, after the formation of the polysilicon films 2521, 2522, 2523 and 2524, the silicon oxide films (the first insulating films) 2412 to 2415 and the interlayer insulating films 2612 and 2613 are removed by isotropic etching to such an extent that the island-like semiconductor layer 2110 is exposed between the polysilicon films 2521 and 2522. Then, a silicon oxide film 2494 is formed as a twenty-second insulating film by thermal oxidization on the surface of island-like semiconductor layer 2110 between the selection gates and the memory cells and exposed portions of polysilicon films 2511, 2512, 2513, 2514, 2521, 2522, 2523 and 2524. Thereafter, a polysilicon film 2530 which is a third conductive film is formed on the entire surface.

The polysilicon film 2530 is anisotropically etched back to such an extent that a space between the polysilicon films 2523 and 2524 is not exposed.

Production steps thereafter follow Production Example 11 (FIGS. 304 to 335 and FIGS. 337 to 368). Thus, a semiconductor memory shown in FIGS. 511 and 512 is formed.

PRODUCTION EXAMPLE 19

In an example of production process for producing a semiconductor memory in which regions for forming charge storage layers are defined in advance by a laminated film comprising plural films, a tunnel oxide film and an interlayer capacitance film between a floating gate and a selection gate are formed at the same time.

Such a semiconductor memory may be produced by the following production process. FIGS. 513 to 522 and FIGS. 523 to 532 are sectional views taken on line A-A' and line B-B', respectively, in FIG. 1 which is a plan view illustrating an EEPROM memory cell array.

Figure 513:
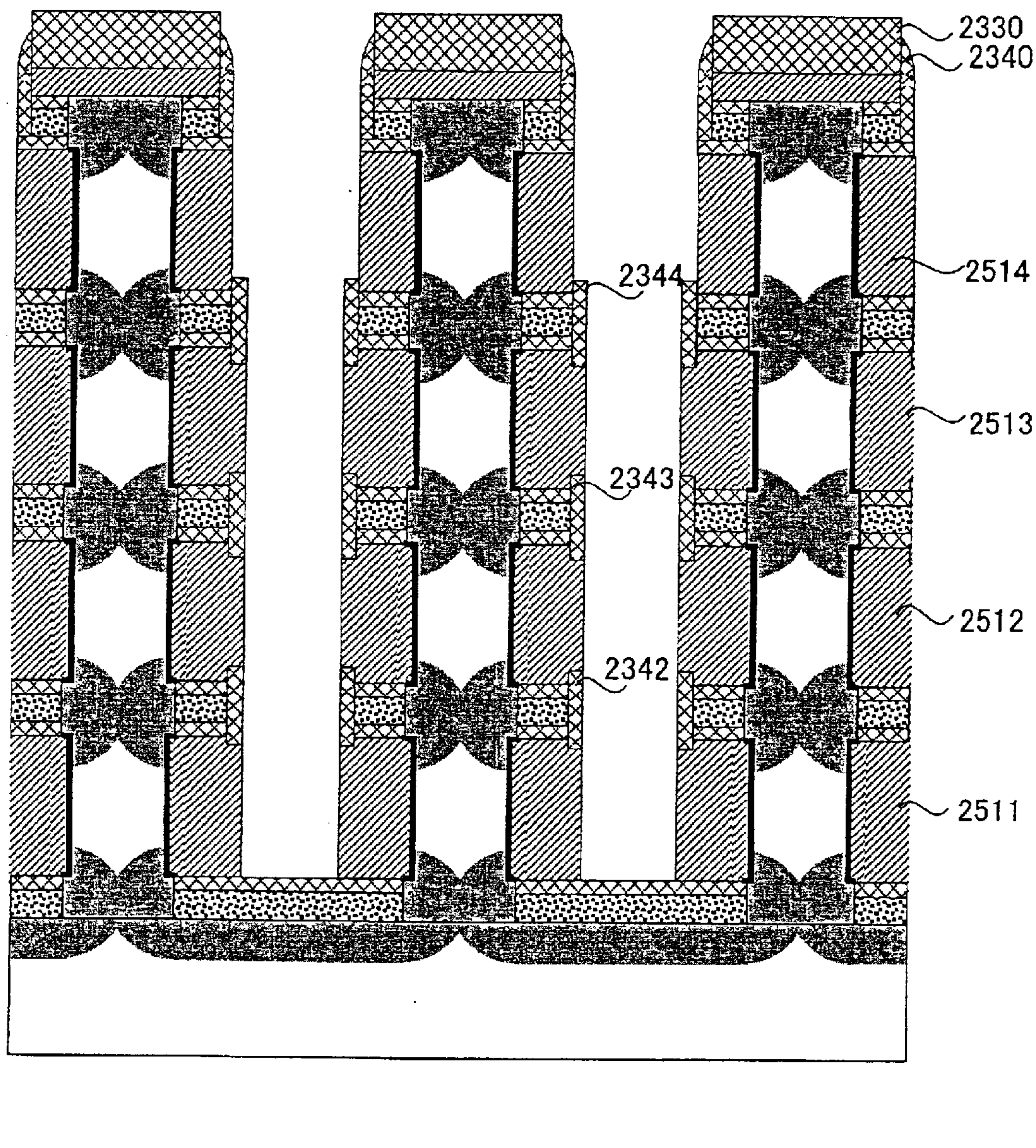
Figure 523:
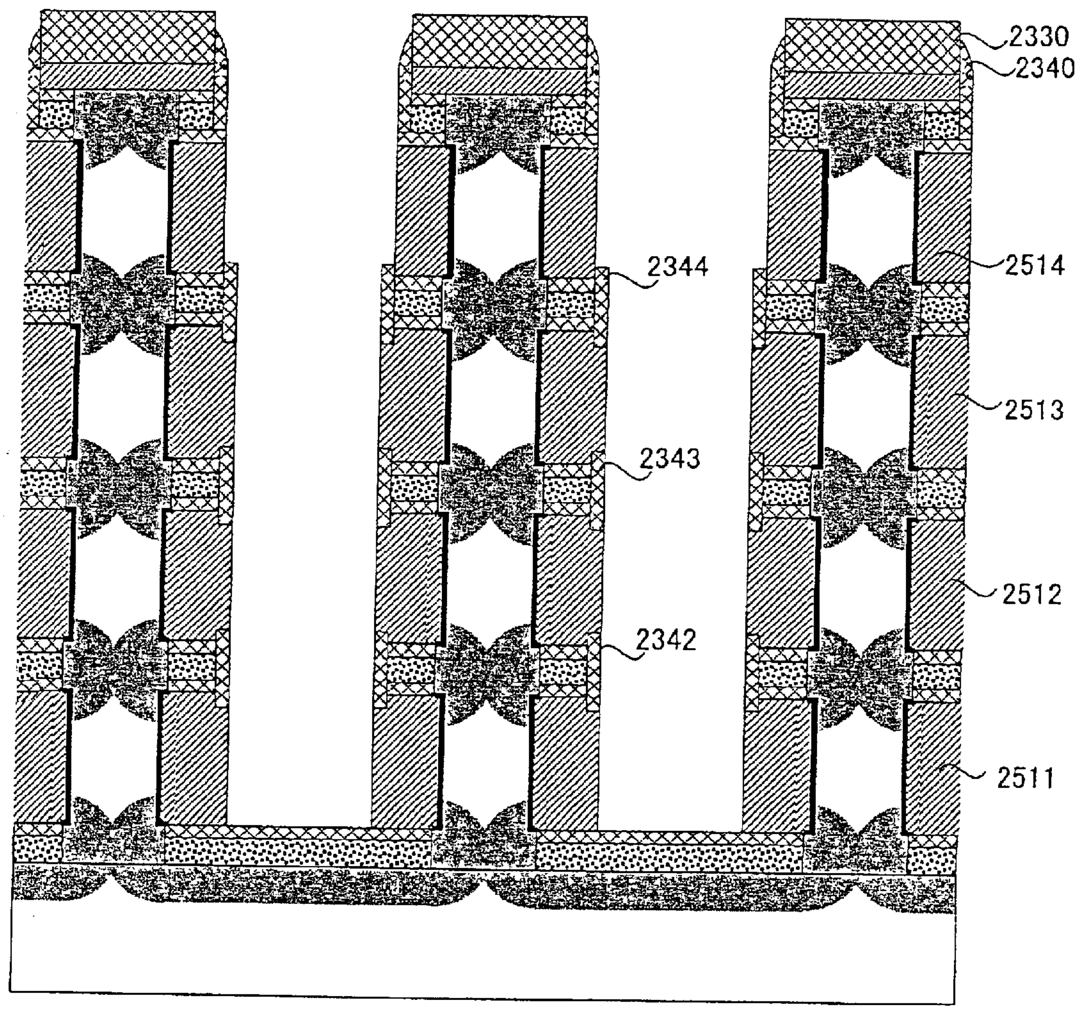

In this production example, production steps are the same as those of Production example 11 until the polysilicon film 2510 (the first conductive films) deposited to a thickness of about 50 to 200 nm is divided into the polysilicon films 2511, 2512, 2513 and 2514 (the first conductive films) by anisotropic etching using the silicon nitride films 2330, 2340, 2342, 2343 and 2344 as a mask (FIGS. 513 and 523).

Figure 514:
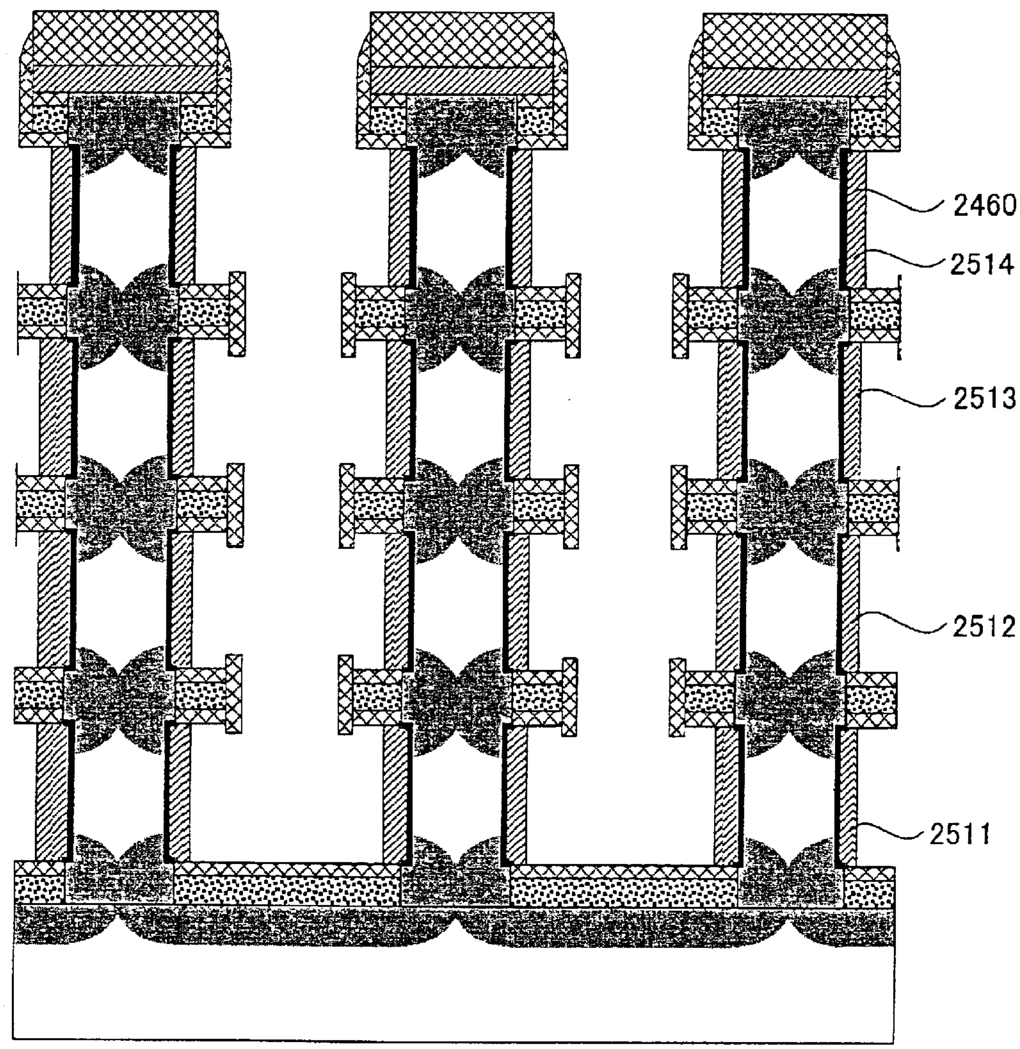
Figure 515:
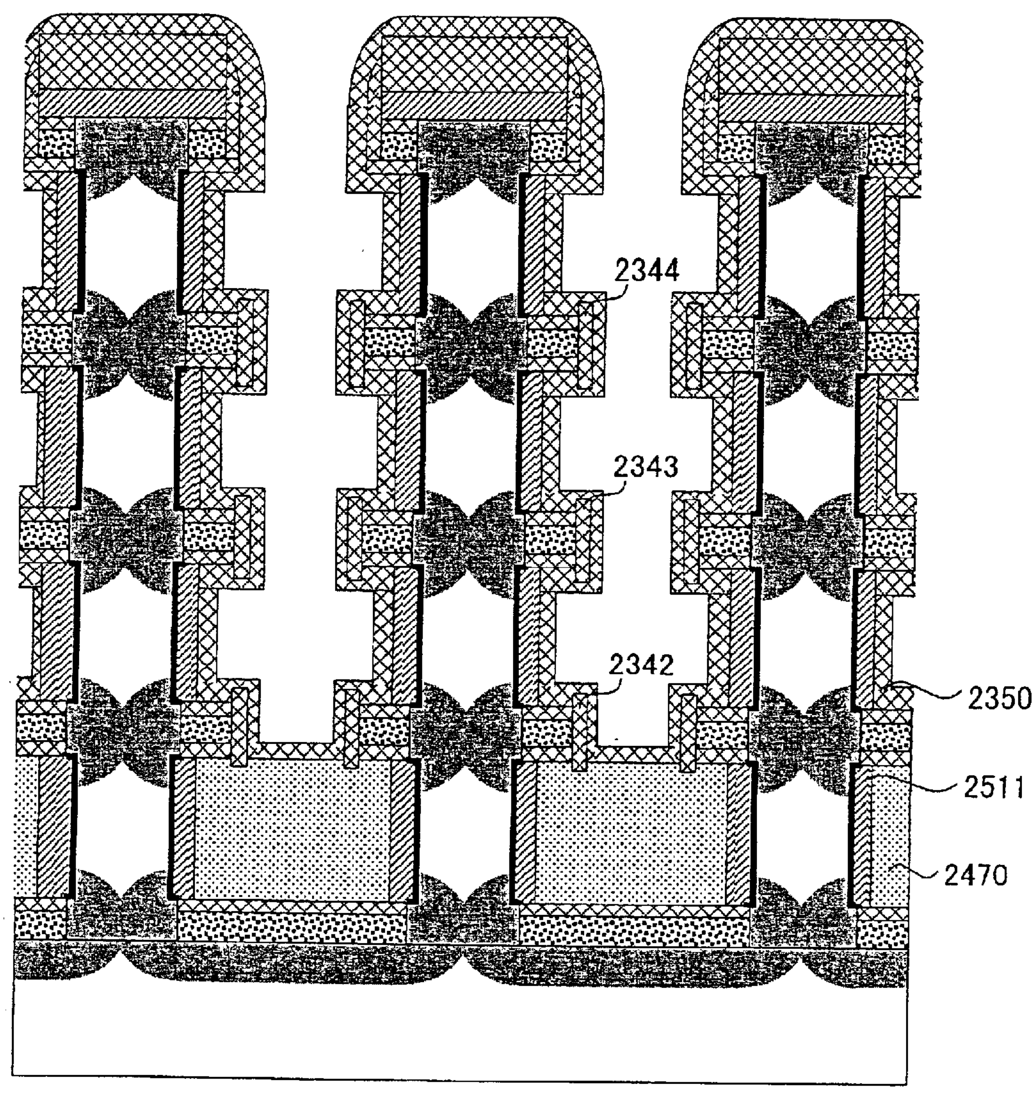
Figure 524:
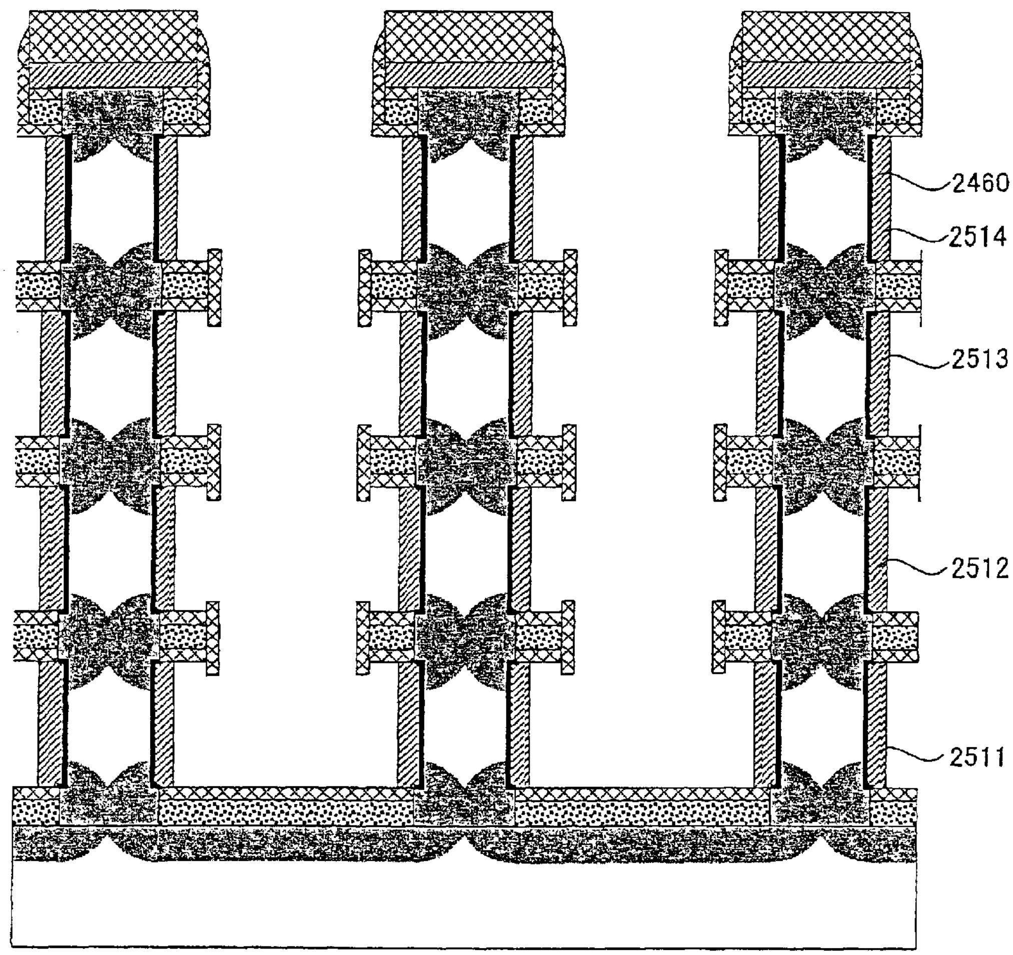
Figure 525:
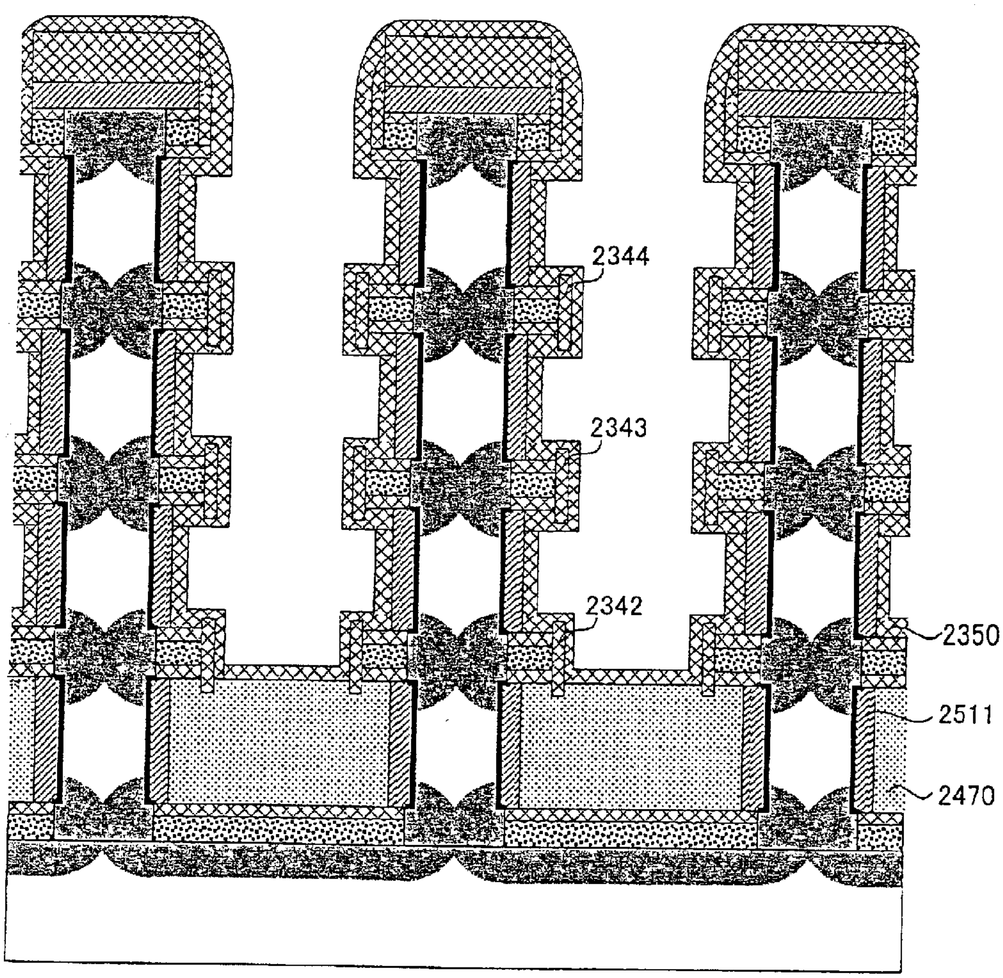

Thereafter, the divided polysilicon films 2511, 2512, 2513 and 2514 are reduced by about 25 to 100 nm in a horizontal direction by, for example, isotropic etching. At this time, the polysilicon films are so etched that the silicon oxide film 2460 (the tenth insulating film) is not exposed (FIGS. 514 and 524).

Then, a silicon oxide film 2470, for example, is deposited as an eleventh insulating film to a thickness of about 50 to 500 nm.

The silicon oxide film 2470 is buried in the third trench 2230 by anisotropic and isotropic etching such that the polysilicon film 2511 is buried. At this time, the depth of the buried silicon oxide film 2470 is so controlled that the silicon nitride film 2342 (the sixth insulating film) is partially exposed.

Figure 294:
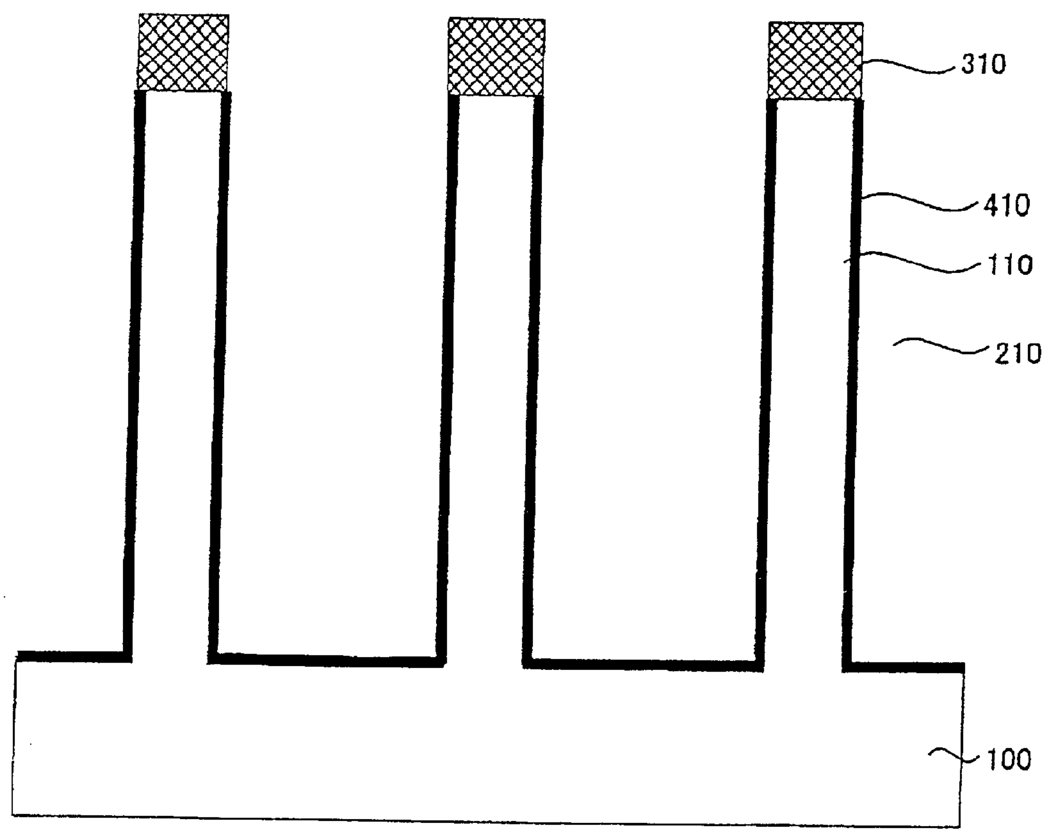

Then, a silicon nitride film 2350, for example, is deposited as a twelfth insulating film to a thickness of 5 to 50 nm on the surfaces of the polysilicon films 2512 to 2514 (the first conductive films), the silicon nitride films 2340, 2342, 2343 and 2344 (the sixth insulating films) and the silicon oxide film 2470 (the eleventh insulating film) which are present on the inner wall of the third trench 2230 (FIGS. 294 and 304). The silicon nitride film 2350 is then etched back anisotropically, for example, to expose the silicon oxide film 2470.

Then, the silicon oxide film 2470 is etched back by, for example, isotropic etching to such a degree that the side of the polysilicon film 2511 (the first conductive film) is exposed. Then, a polysilicon film 2521, for example, is deposited to a thickness of 15 to 150 nm as a second conductive film.

The polysilicon film 2521 is then etched back by, for example, anisotropic etching. Subsequently, the silicon nitride film 2321 (the fourth insulating film), the silicon oxide film 2411 (the first insulating film) and the P-type silicon substrate 2100 are successively etched to form a second trench 2220 in the P-type silicon substrate 2100 in self-alignment with the polysilicon film 2521 (the second conductive film), thereby separating the impurity diffusion layer 2710. That is, a separation portion of the first wiring layer is formed in self-alignment with a separation portion of the second conductive film.

Subsequently, the polysilicon film 2521 is etched back to such a degree that the polysilicon film 2521 is able to contact the polysilicon film 2511 to form a selection gate. At this time, by setting the intervals between the island-like semiconductor layers 2110 in a direction of A-A' in FIG. 1 to a predetermined value or smaller, the polysilicon film 2521 is formed into a second wiring layer to be a selection gate line continuous in the direction without need to use a masking process. Then, the polysilicon film 2521 is etched back such that the silicon nitride film 2350 located at the sides of the polysilicon films 2512 to 2524 is exposed.

Then, the sidewall spacer made of the silicon nitride film (the twelfth insulating film) 2350 is removed by isotropic etching and a silicon oxide film 2471, for example, is deposited as an eleventh insulating film to a thickness of about 50 to 500 nm.

The silicon oxide film 2471 is buried in the third trench 2230 by anisotropic or isotropic etching such that the polysilicon film 2521 is buried. At this time, the depth of the buried silicon oxide film 2471 is so controlled that the silicon nitride film 2342 is partially exposed or the sides of the polysilicon films 2512 to 2514 is exposed.

Figure 516:
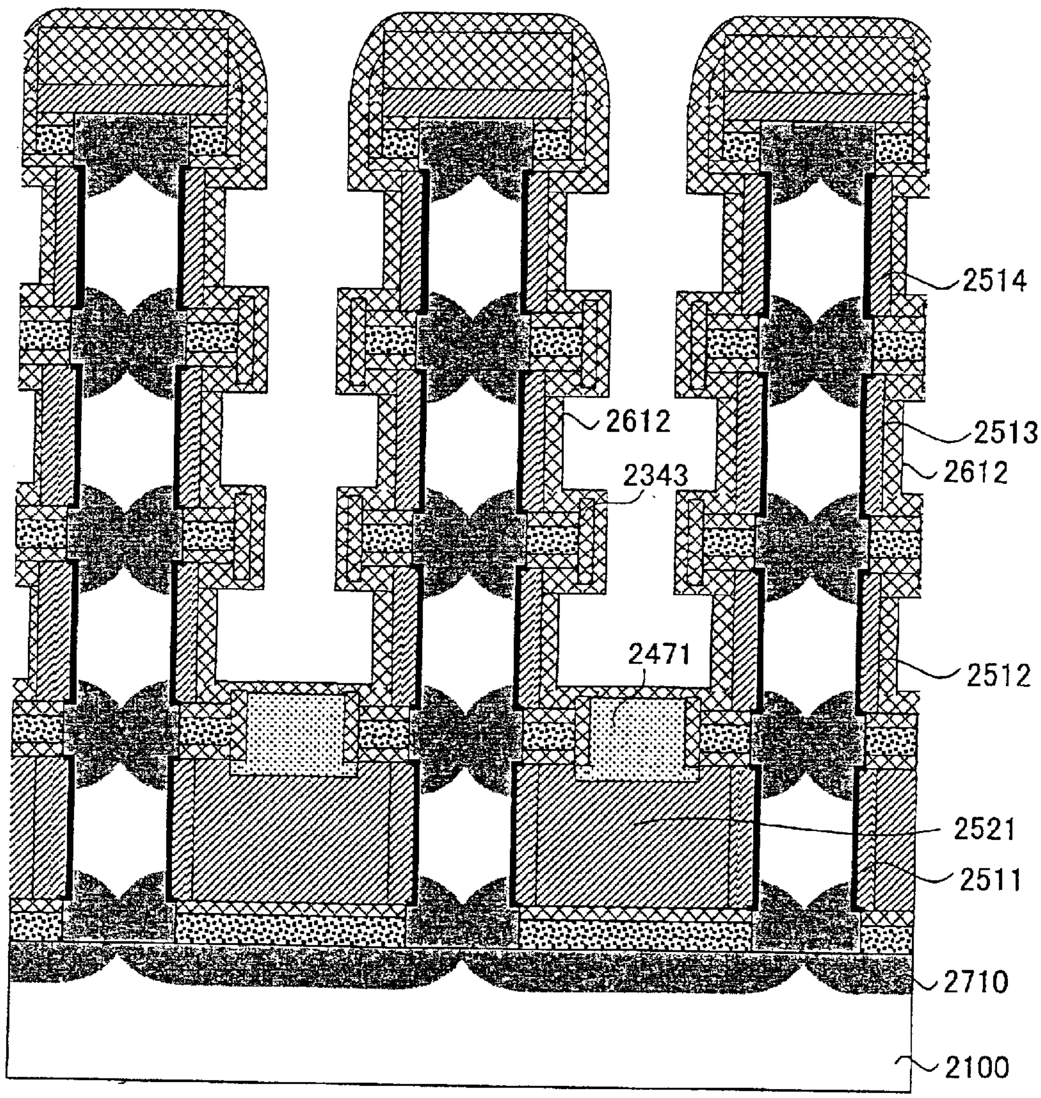
Figure 517:
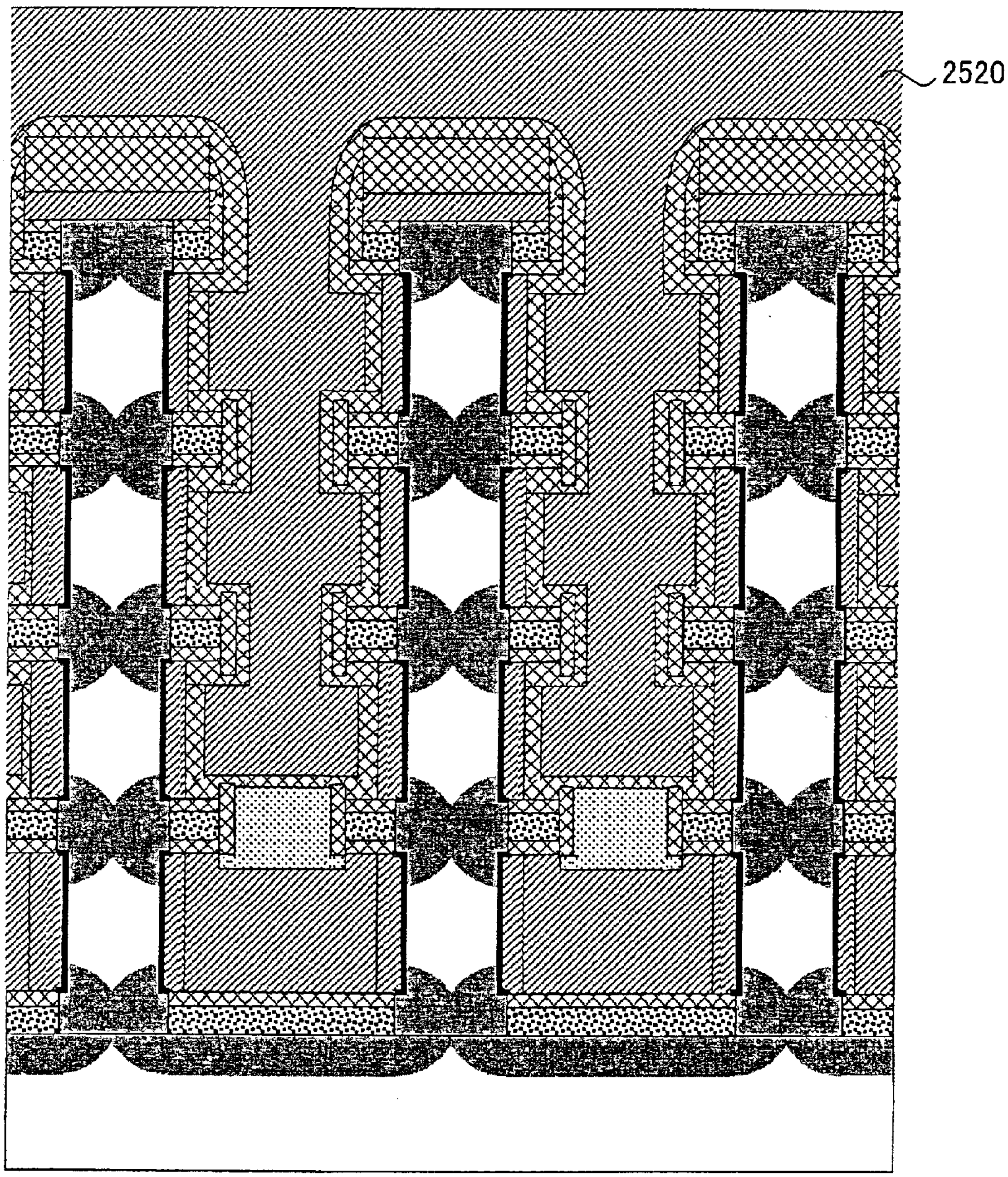
Figure 526:
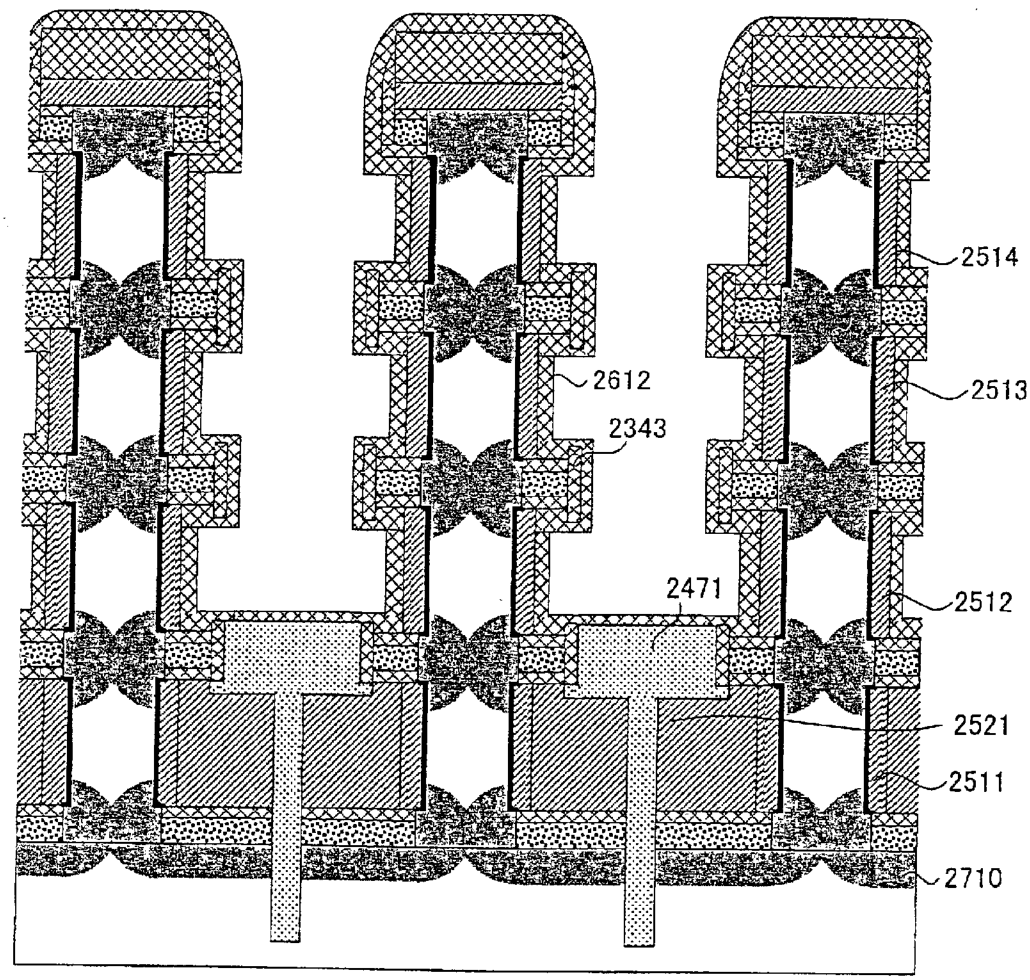
Figure 527:
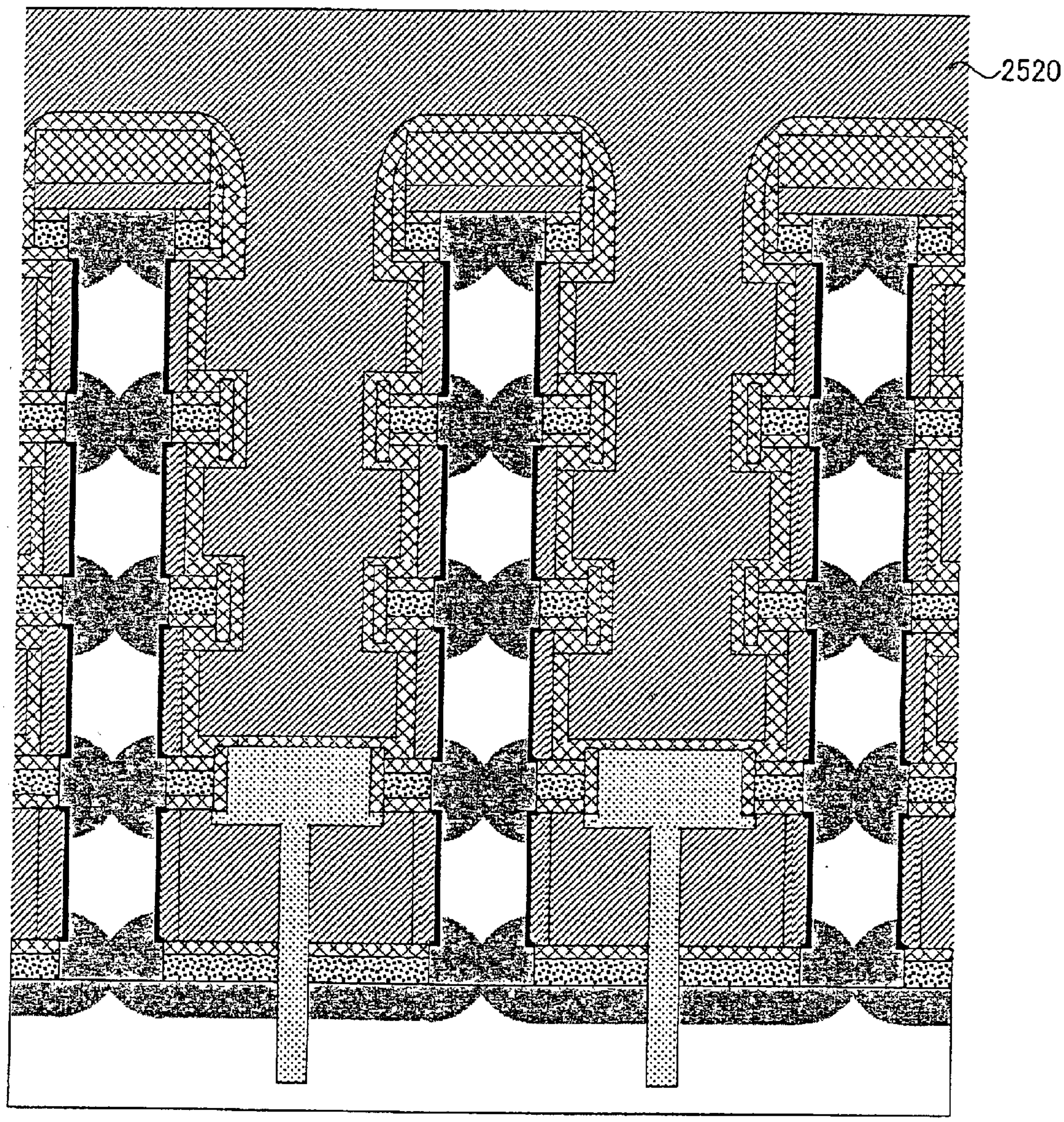

Subsequently, an interlayer insulating film 2612 is formed on exposed surfaces of the polysilicon films 2512 to 2514 (FIG. 516 and FIG. 526). This interlayer insulating film 2612 may be formed of an ONO film, for example. The ONO film may be formed in the same manner as in Production example 1.

Figure 518:
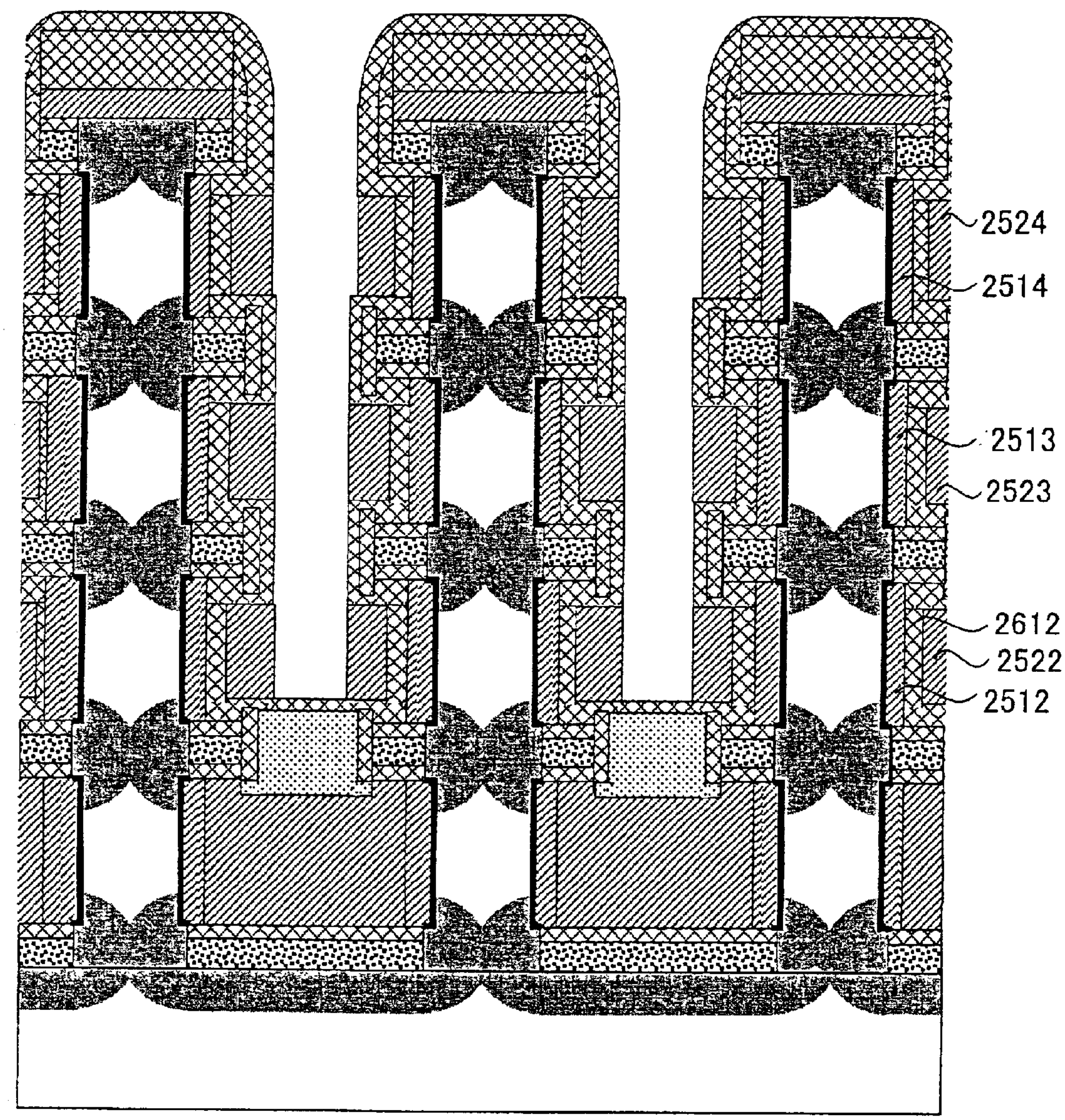
Figure 519:
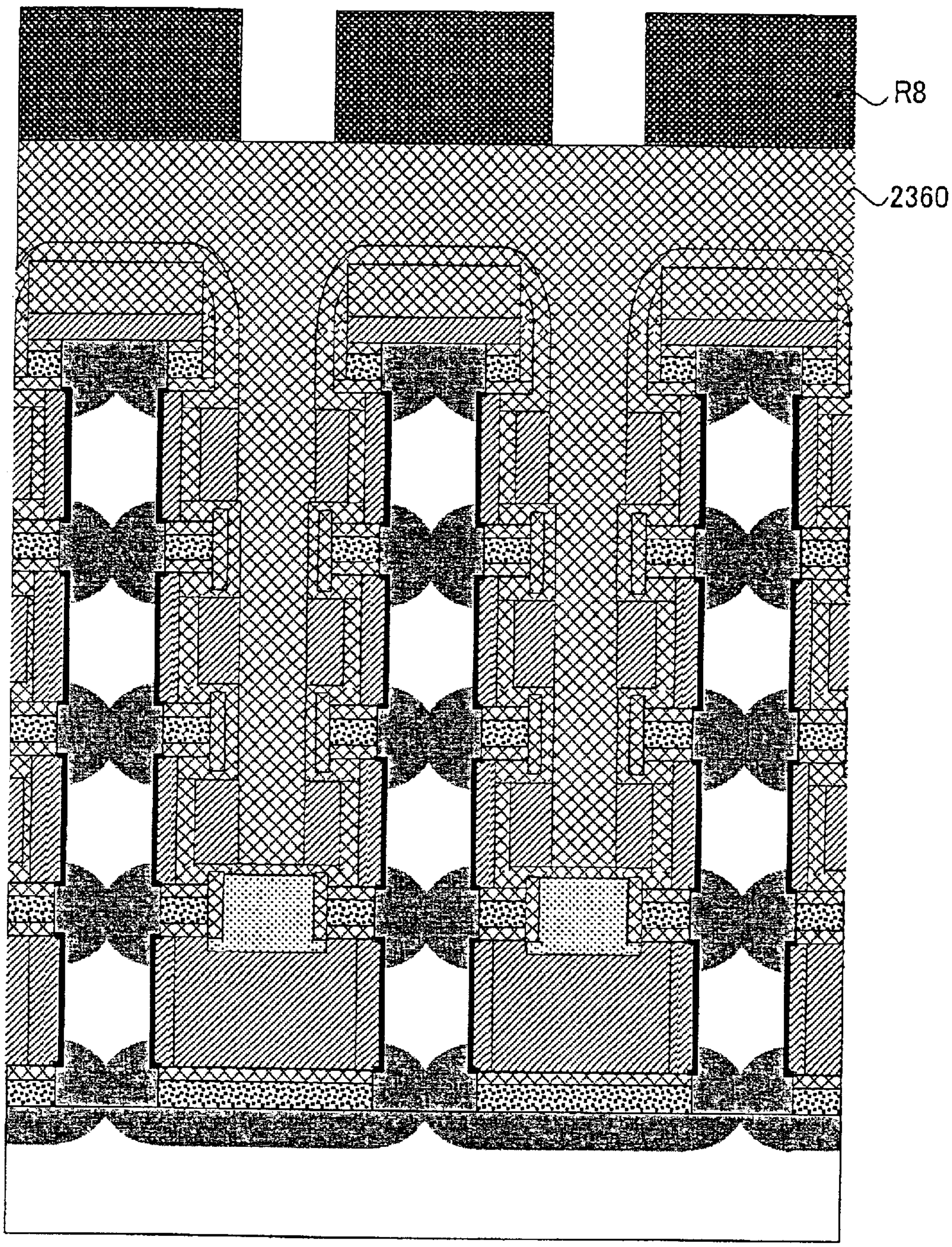
Figure 528:
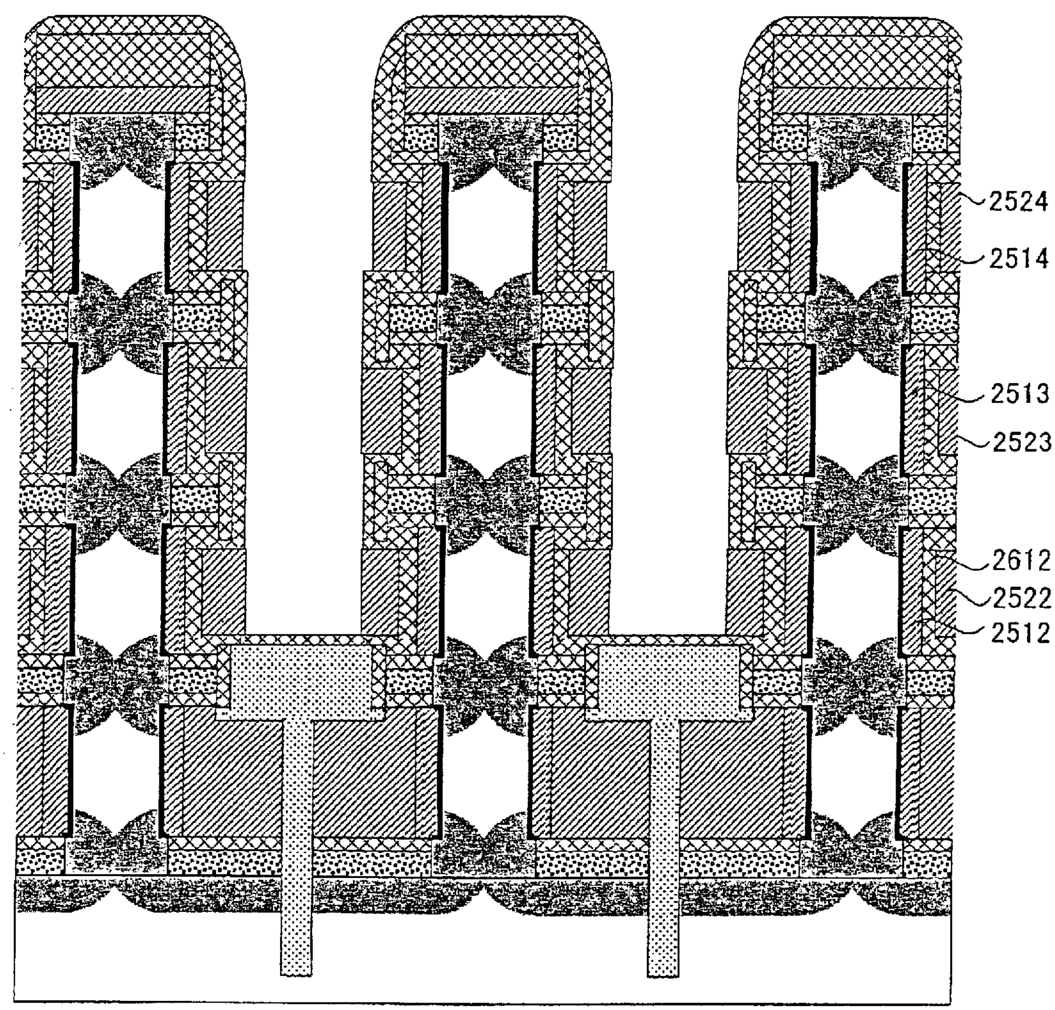
Figure 529:
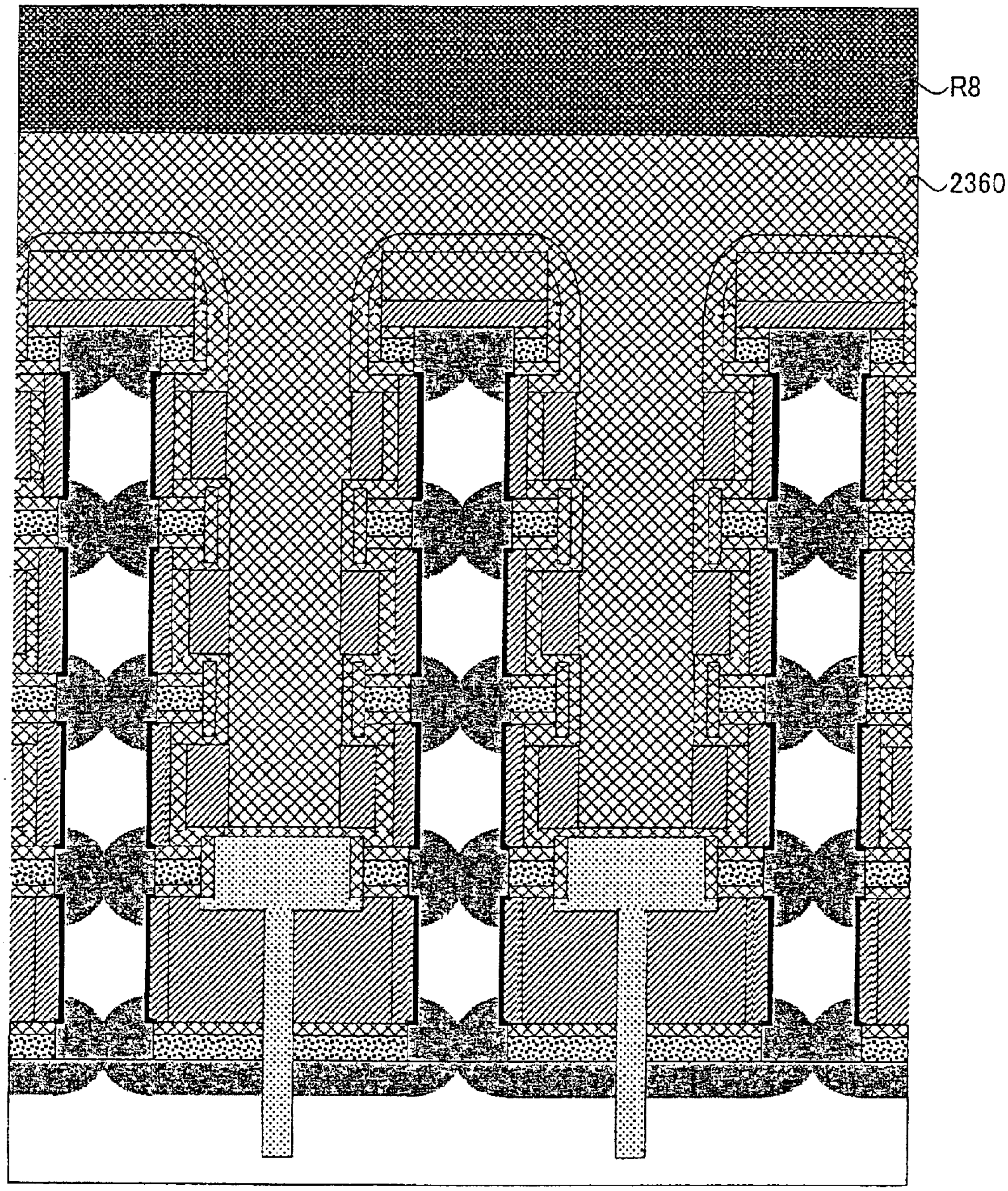

Subsequently, in the same manner, a polysilicon film (a second conductive film) 2520 is deposited to a thickness of 15 to 150 nm (FIGS. 517 and 527) and etched back. Thereby the polysilicon film 2520 is divided into polysilicon films 2522, 2523 and 2524 to be located on the sides of the polysilicon films 2512, 2513 and 2514 with intervention of the interlayer insulating film 2612 (FIGS. 518 and 528).

A silicon nitride film 2360, for example, is deposited as a thirteenth insulating film to a thickness of 50 to 500 nm and partially removed by reactive ion etching using a resist film R8 patterned by a known photolithography as a mask (FIGS. 519 and 529), thereby forming a fifth trench 2250. At this time, the resist film R8 is patterned such that the silicon nitride film 2360 is formed into a third wiring layer to be a control gate line continuous in the direction of A-A'.

Figure 520:
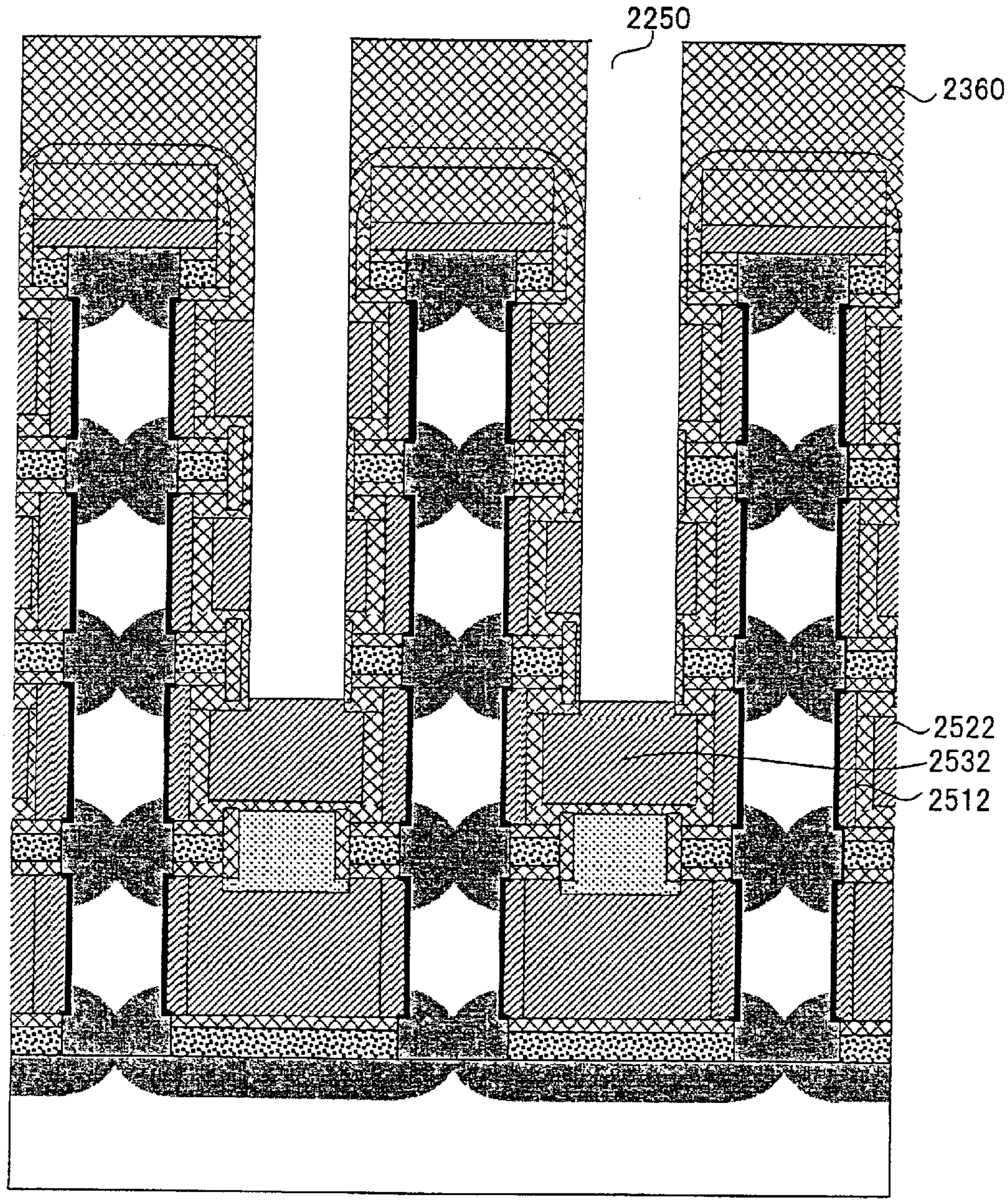
Figure 530:
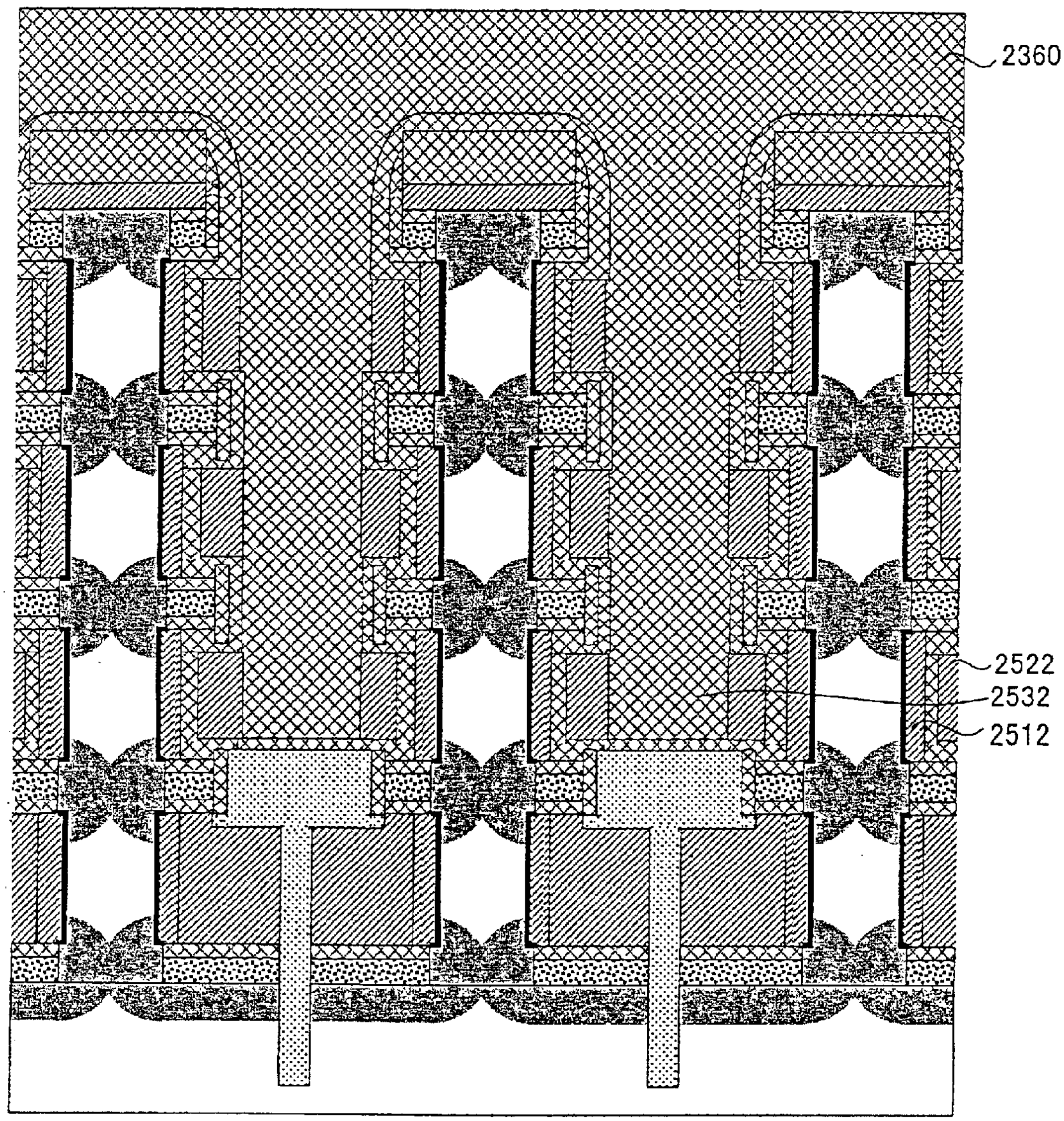

Thereafter, a polysilicon film 2532 is deposited as a third conductive film to a thickness of 15 to 150 nm and etched back, thereby disposing the polysilicon film 2532 on the side of the polysilicon film 2522 (FIGS. 520 and 530).

A silicon oxide film 2472, for example, is then deposited as an eleventh insulating film to a thickness of about 50 to 500 nm and isotropically etched back so that the side of the polysilicon film 2523 is exposed.

By repeating likewise, a polysilicon film 2533 is disposed as a third conductive film on the side of the polysilicon film 2523.

Subsequently, a silicon oxide film 2473, for example, is deposited as an eleventh insulating film to a thickness of about 50 to 500 nm and isotropically etched back such that the side of the polysilicon film 2524 is exposed.

Figure 521:
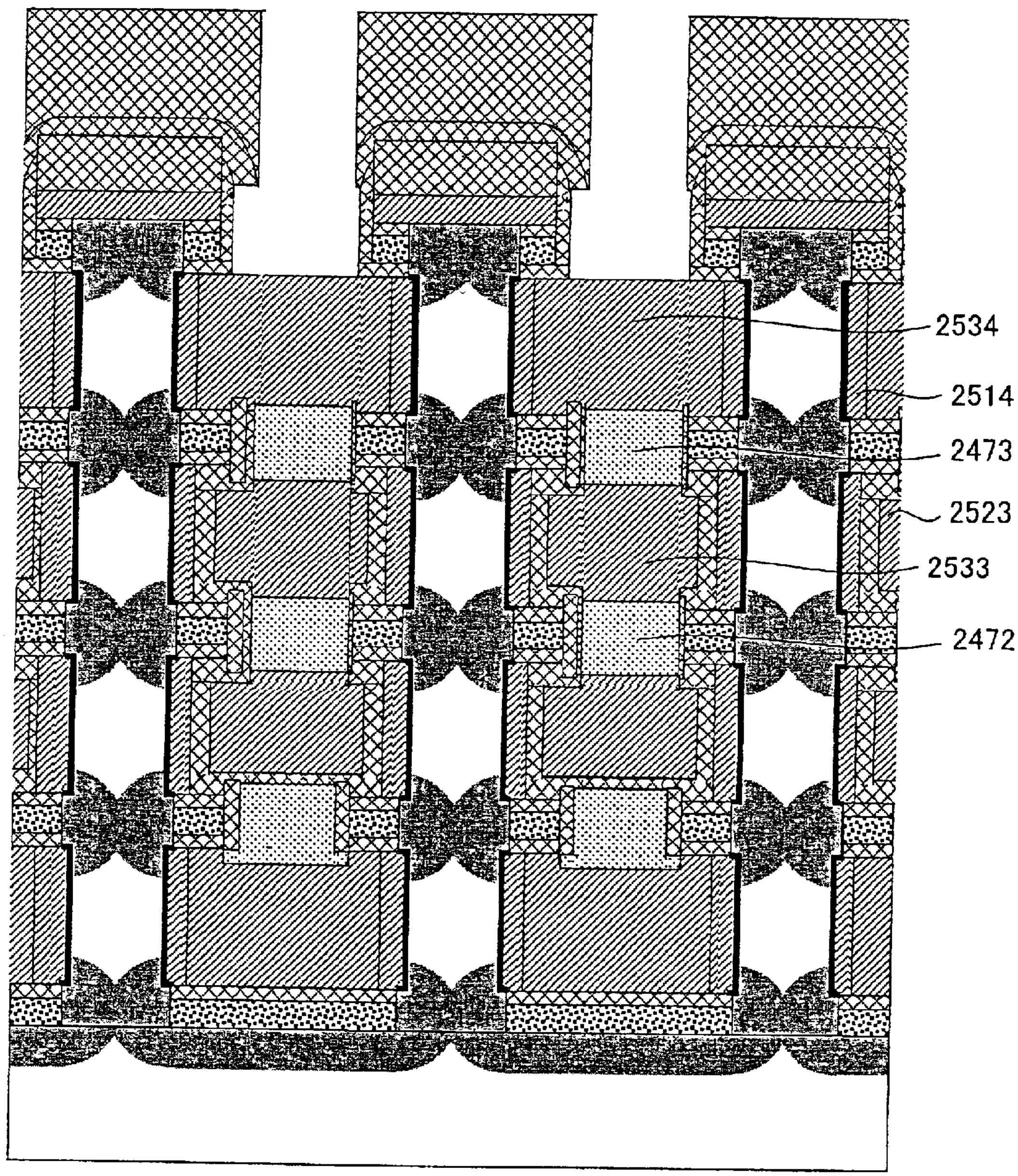
Figure 531:
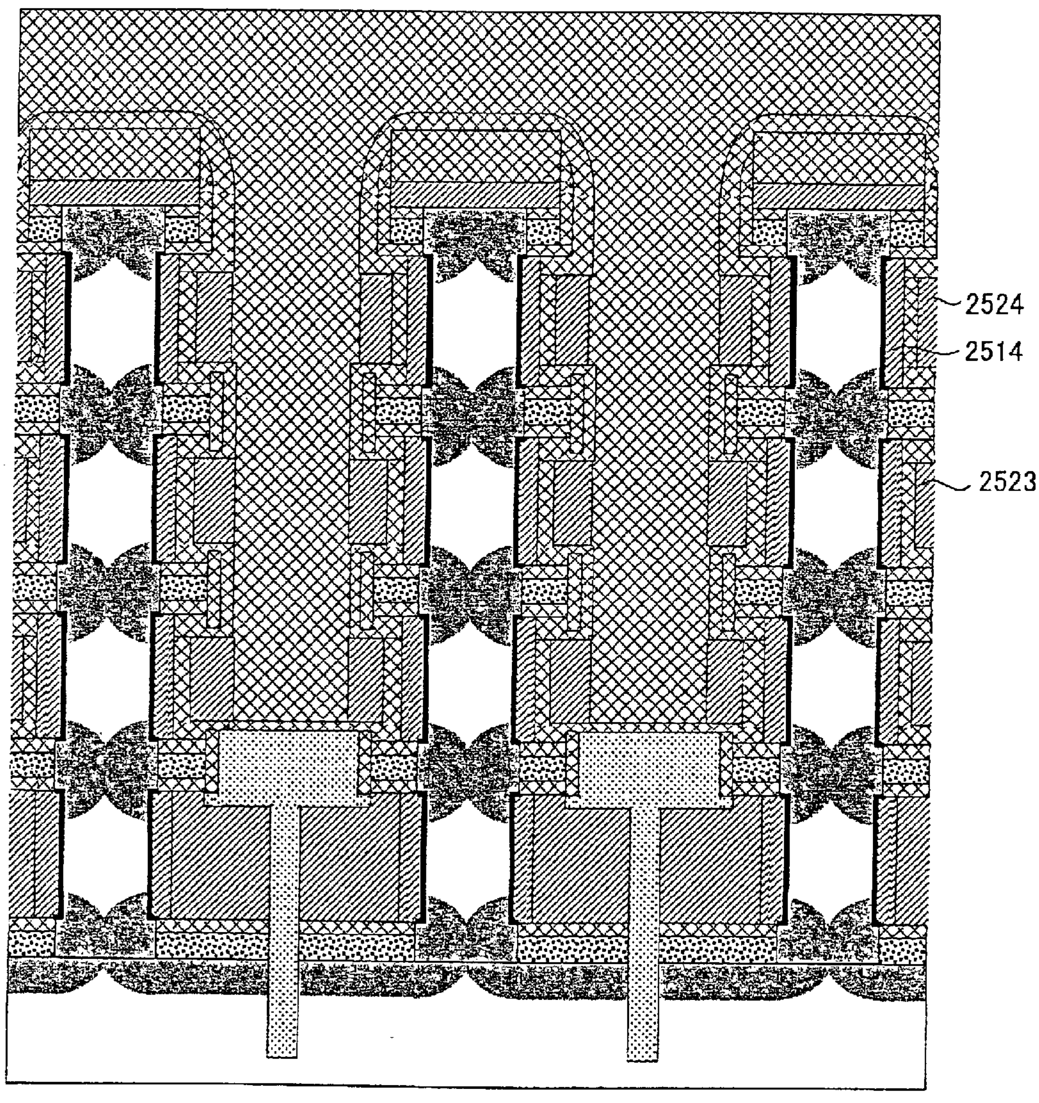

After the polysilicon film 2524 and the interlayer insulating film 2612 are removed by isotropic etching, a polysilicon film 2534 is disposed as a third conductive film on the side of the polysilicon film 2514. For example, the polysilicon film 2534 is deposited to a thickness of 15 to 150 nm and etched back such that the polysilicon film 2534 is able to contact the polysilicon film 2514 (FIGS. 521 and 531). In this example, an explanation is given of a production process in which the resist film R8 is patterned for forming the third wiring layer to be the control gate line. By setting the intervals between the island-like semiconductor layers 2110 in a direction of A-A' in FIG. 1 to a predetermined value or smaller as employed in Production example 1, the polysilicon films 2532 to 2534 are deposited and etched back without need to use a masking process. Thereby, the third wiring layer to be the control gate line continuous in the direction of A-A' in FIG. 1 is provided.

Figure 522:
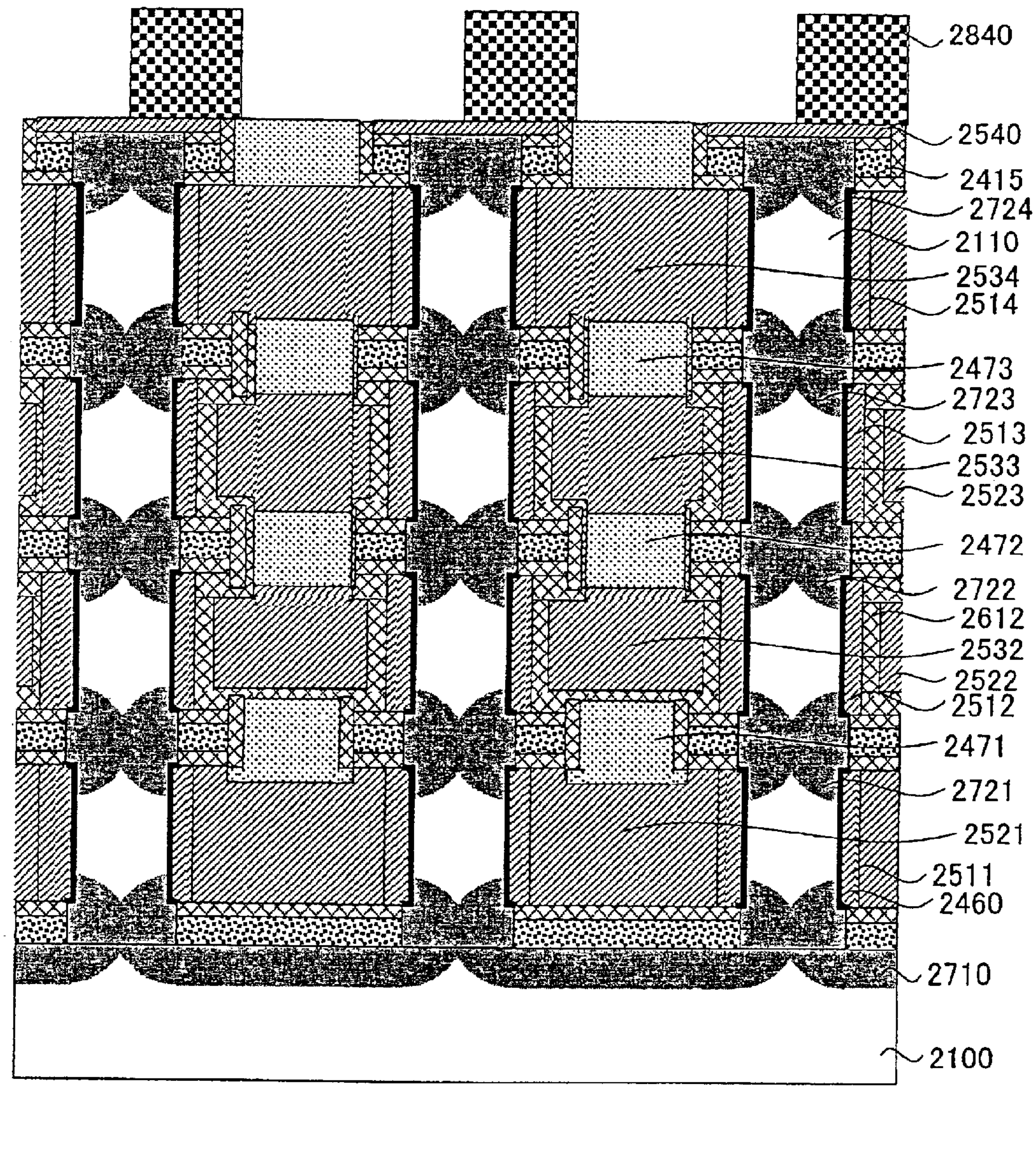
Figure 532:
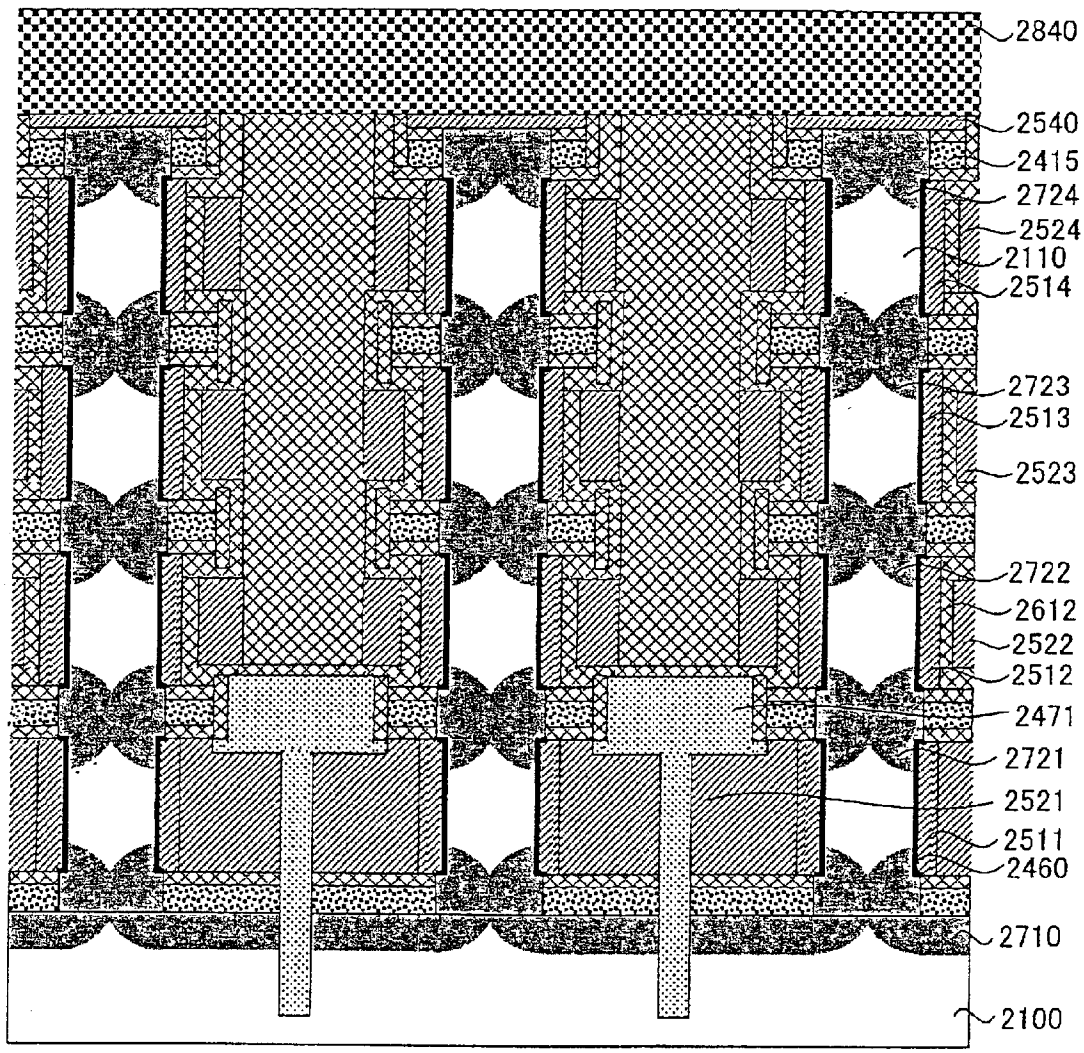

Then, the silicon nitride film 2330 (the fifth insulating film), the silicon nitride film 2340 (the sixth insulating film) and the silicon nitride film 2360 (the thirteenth insulating film) are removed by, for example, isotropic etching to expose the polysilicon film 2540. A silicon oxide film 2474 is deposited as an eleventh insulating film to a thickness of 100 to 500 nm on the top of the polysilicon film 2524. The top portion of the polysilicon film 2540 is exposed by etch-back or by CMP. A fourth wiring layer 2840 is formed so that its direction crosses the direction of the second or third wiring layer and is connected to the top portion of the island-like semiconductor layer 2110 (FIG. 522 and FIG. 532).

Thereafter, by known techniques, an interlayer insulating film is formed, and a contact hole and metal wiring are formed. Thereby, a semiconductor memory is realized which has a memory function according to the state of a charge in the charge storage layer which is the floating gate made of the polysilicon film (the first conductive film).

In this example, films formed on the surface of the semiconductor substrate or the polysilicon film such as the silicon nitride film (the fifth insulating film) 2330, the silicon nitride film (the sixth insulating film) 2340, the silicon nitride film (the twelfth insulating film) 2350 and the silicon oxide film (the thirteenth insulating film) 2360 may be formed of a layered film of a silicon oxide film/a silicon nitride film from the silicon surface.

With regard to the polysilicon films 2510 or 2511 to 2514 (the first conductive films), the polysilicon films 2520 or 2521 to 2524 (the second conductive films) and the polysilicon film 2540 (the fourth conductive film), impurity introduction may be carried out during or after the formation of the polysilicon films or after the separation of the polysilicon films. The timing of the impurity introduction to the polysilicon films is not particularly limited so long as these films become conductive films.

In the example, the control gates of the memory cells are formed continuously in one direction without using a mask. Where the island-like semiconductor layers are not disposed symmetrically to a diagonal, the control gates of the memory cells are thus formed without using a mask. More particularly, by setting smaller the intervals between adjacent island-like semiconductor layers in the direction of the second or third wiring layer than those in the direction of the fourth wiring layer, it is possible to automatically obtain the wiring layers which are discontinuous in the direction of the fourth wiring layer and are continuous in the direction of the second or third wiring layer without using a mask.

Further, by providing the selection gates in the top and the bottom of a set of memory cells, it is possible to prevent the phenomenon that a memory cell transistor is over-erased.

PRODUCTION EXAMPLE 20

In an example of production process for producing a semiconductor memory in which regions for forming charge storage layers are defined in advance by a laminated film comprising plural films, explanation is given of an example of production process for forming a sidewall spacer of a silicon nitride film, which is a protection film of a PSG oxide film, in self-alignment.

Such a semiconductor memory may be produced by the following production process. FIGS. 533 to 542 and FIGS. 543 to 552 are sectional views taken on line A-A' and line B-B', respectively, in FIG. 1 which is a plan view illustrating an EEPROM memory cell array.

Figure 533:
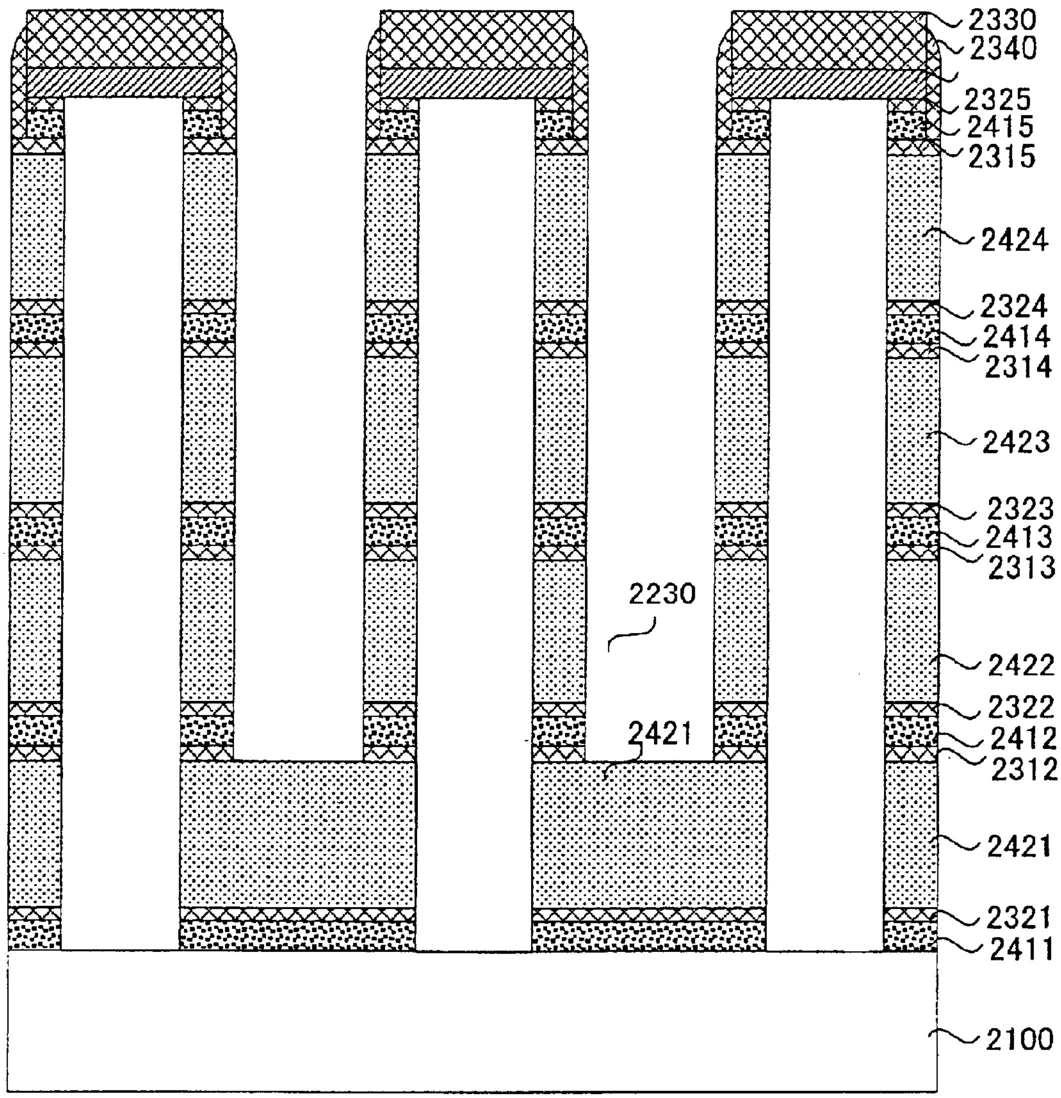

In this example, production steps are the same as those of Production example 11 (FIGS. 304 to 311 and 337 to 344) until the silicon nitride film 2315, the silicon oxide film 2424, the silicon nitride film 2324, the silicon oxide film 2414, the silicon nitride film 2314, the silicon oxide film 2423, the silicon nitride film 2323, the silicon oxide film 2413, the silicon nitride film 2313, the silicon oxide film 2422, the silicon nitride film 2322, the silicon oxide film 2412 and the silicon nitride film 2312 are sequentially etched by using the silicon nitride films 2330 and 2341 as a mask to expose the silicon oxide film 2421, thereby forming the third trench 2230 (FIG. 533). The silicon oxide films 2412, 2413 and 2414 (the first insulating films) are then selectively reduced in a direction horizontal to the semiconductor substrate surface.

Figure 534:
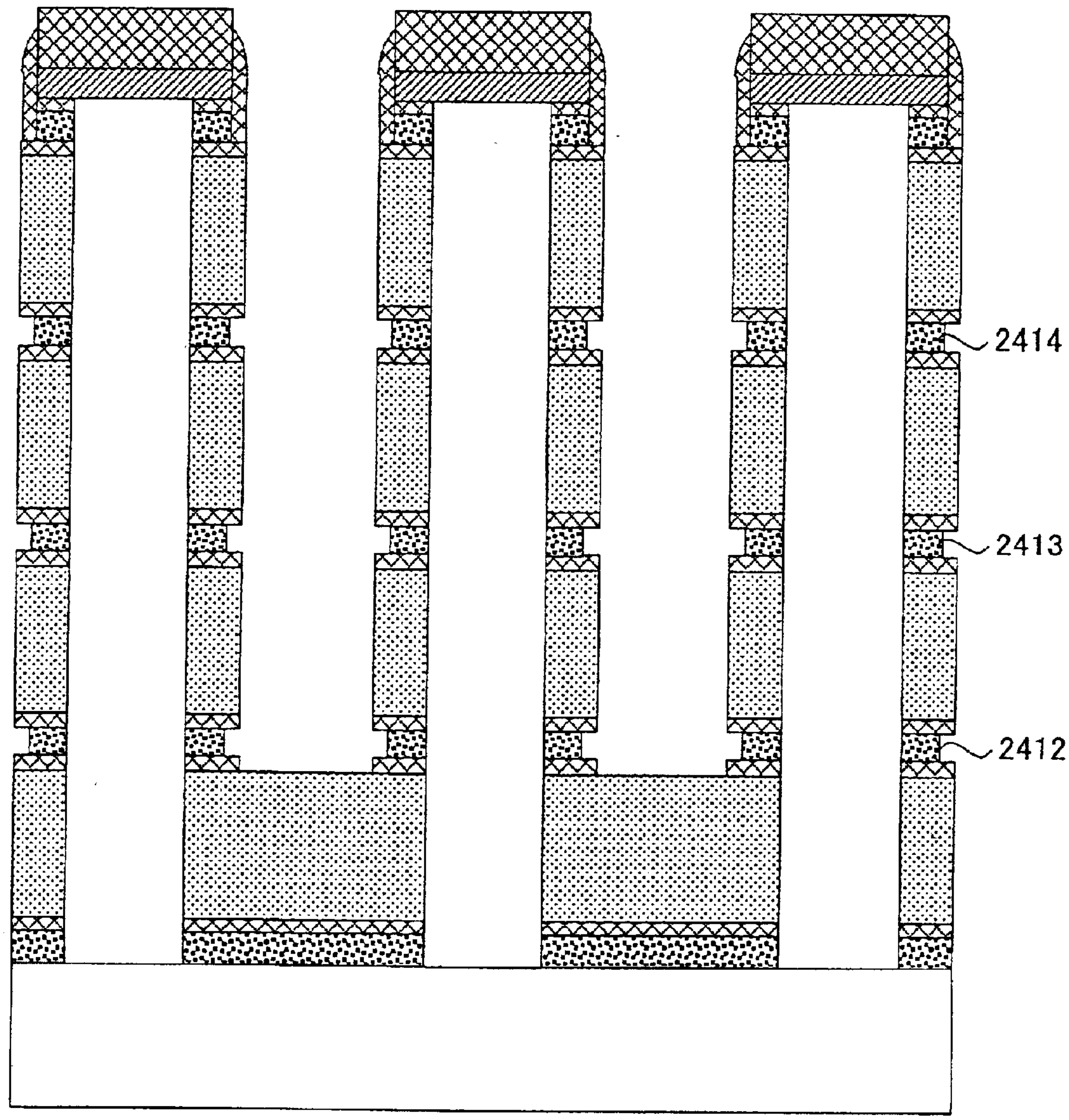
Figure 544:
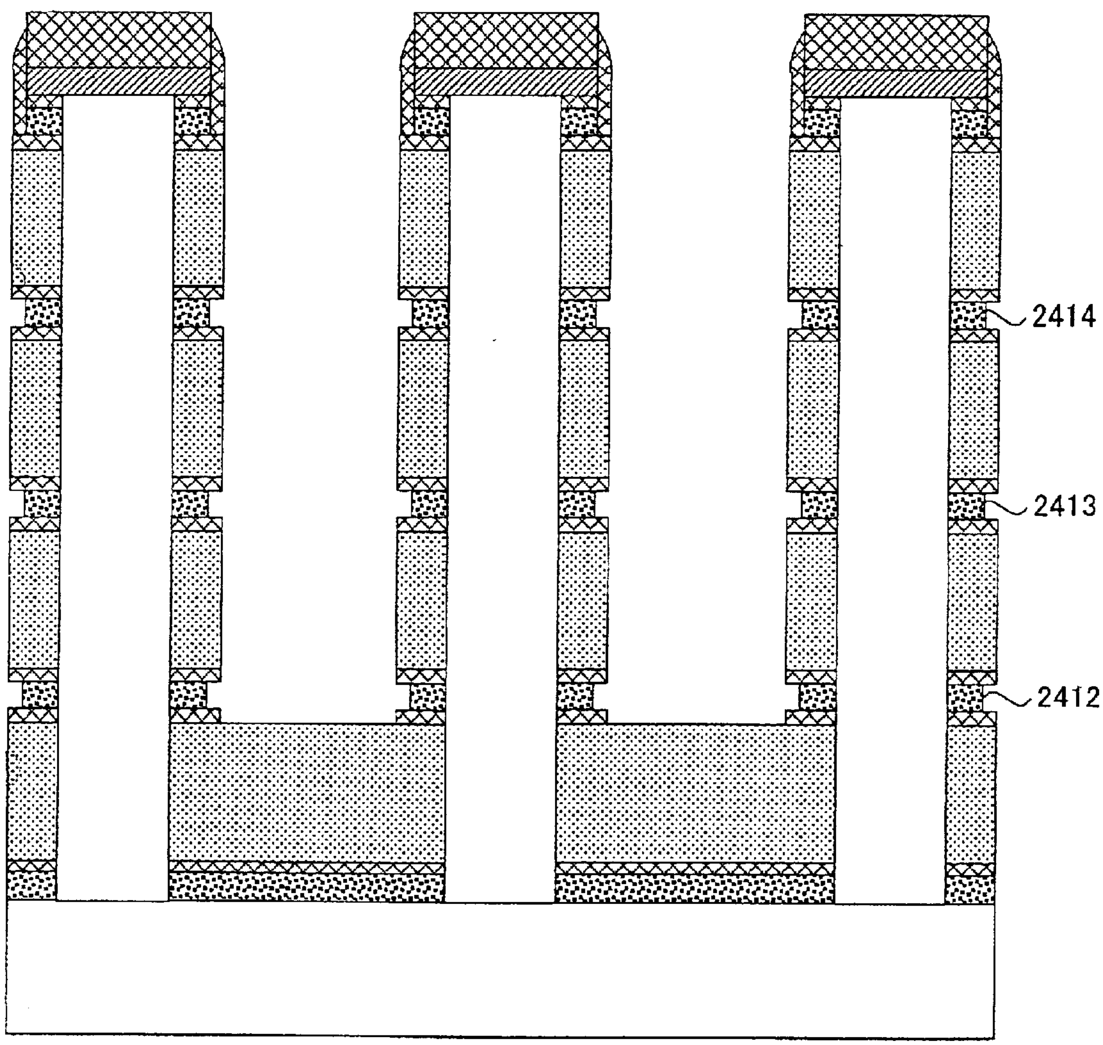

For example, the silicon oxide films 2412, 2413 and 2414 are selectively reduced by isotropic etching, in which the etching proceeds selectively depending on the impurity concentration in the oxide films or at different etching rate (FIGS. 534 and 544).

Figure 535:
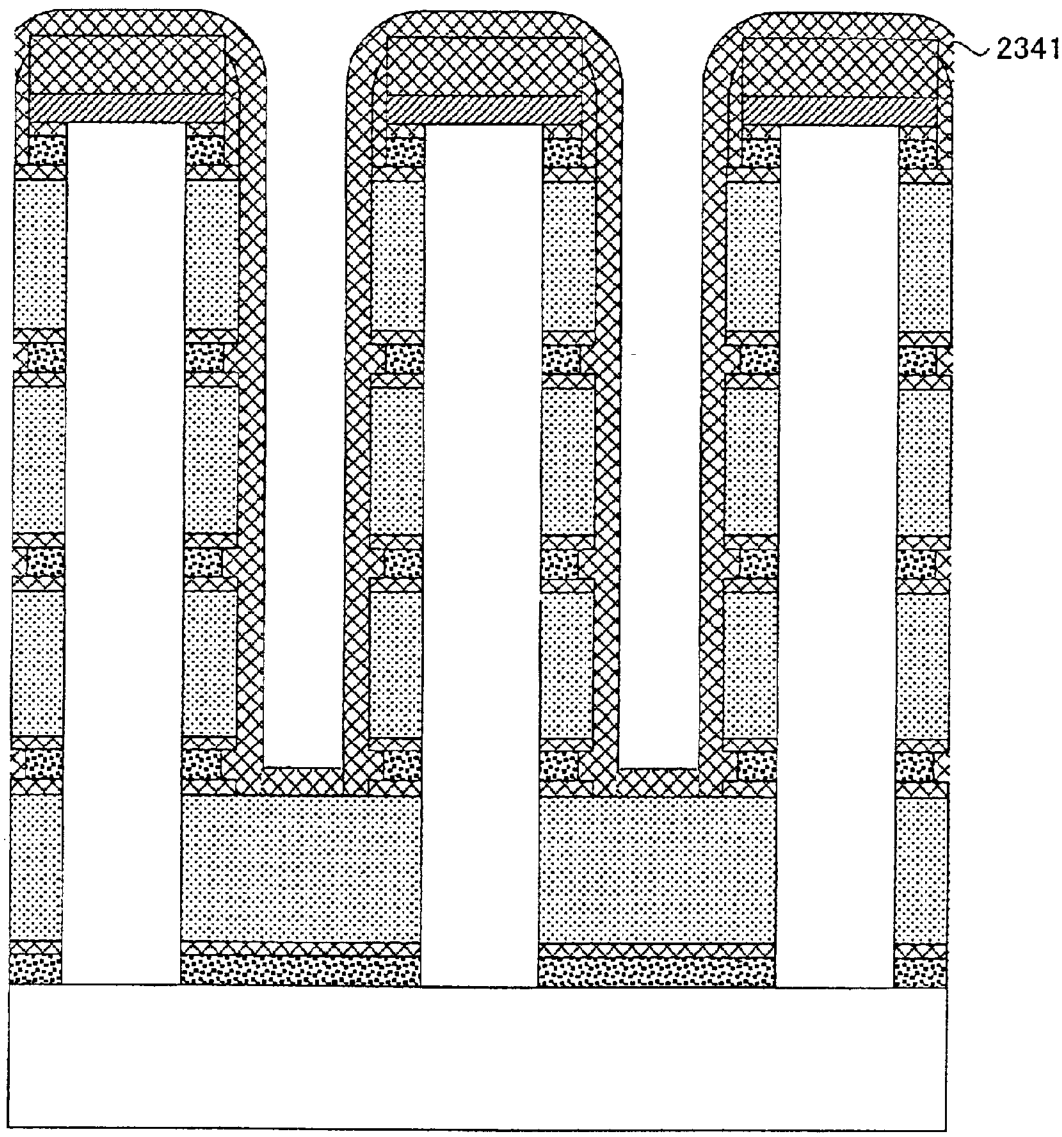
Figure 545:
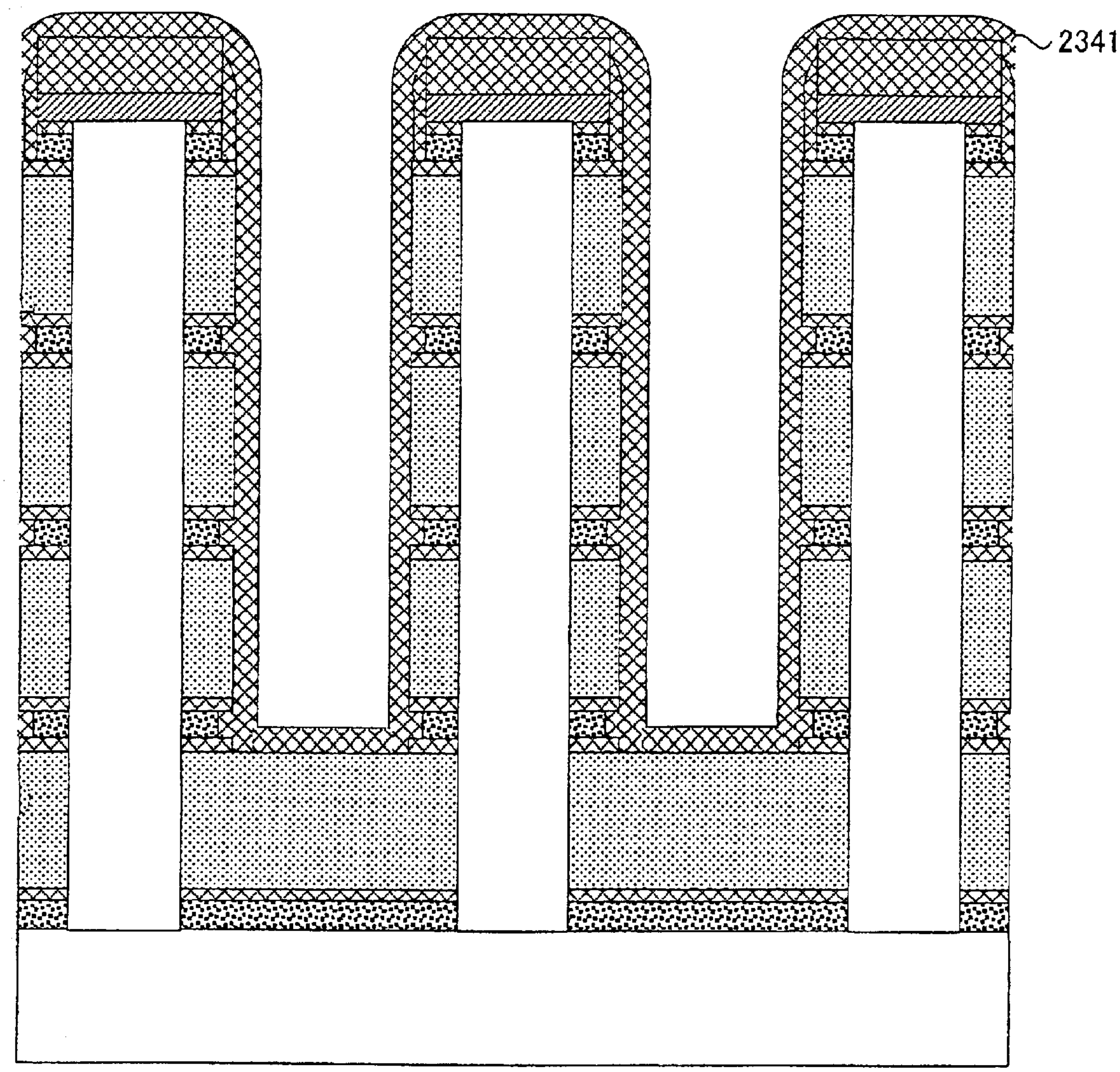

A silicon nitride film 2341 is deposited as a sixth insulating film to a thickness of about 25 to 250 nm (FIGS. 535 and 545).

Figure 536:
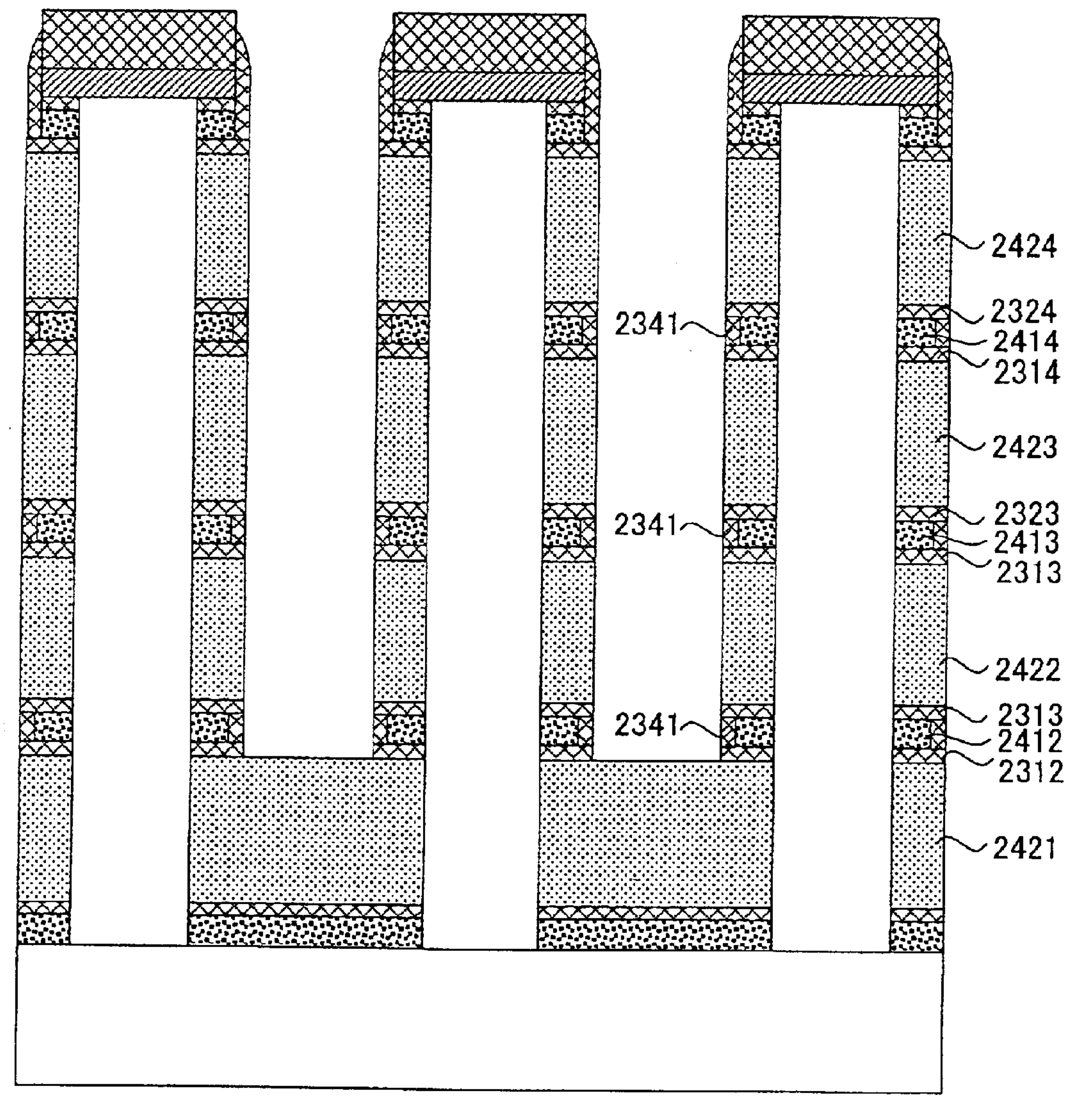
Figure 546:
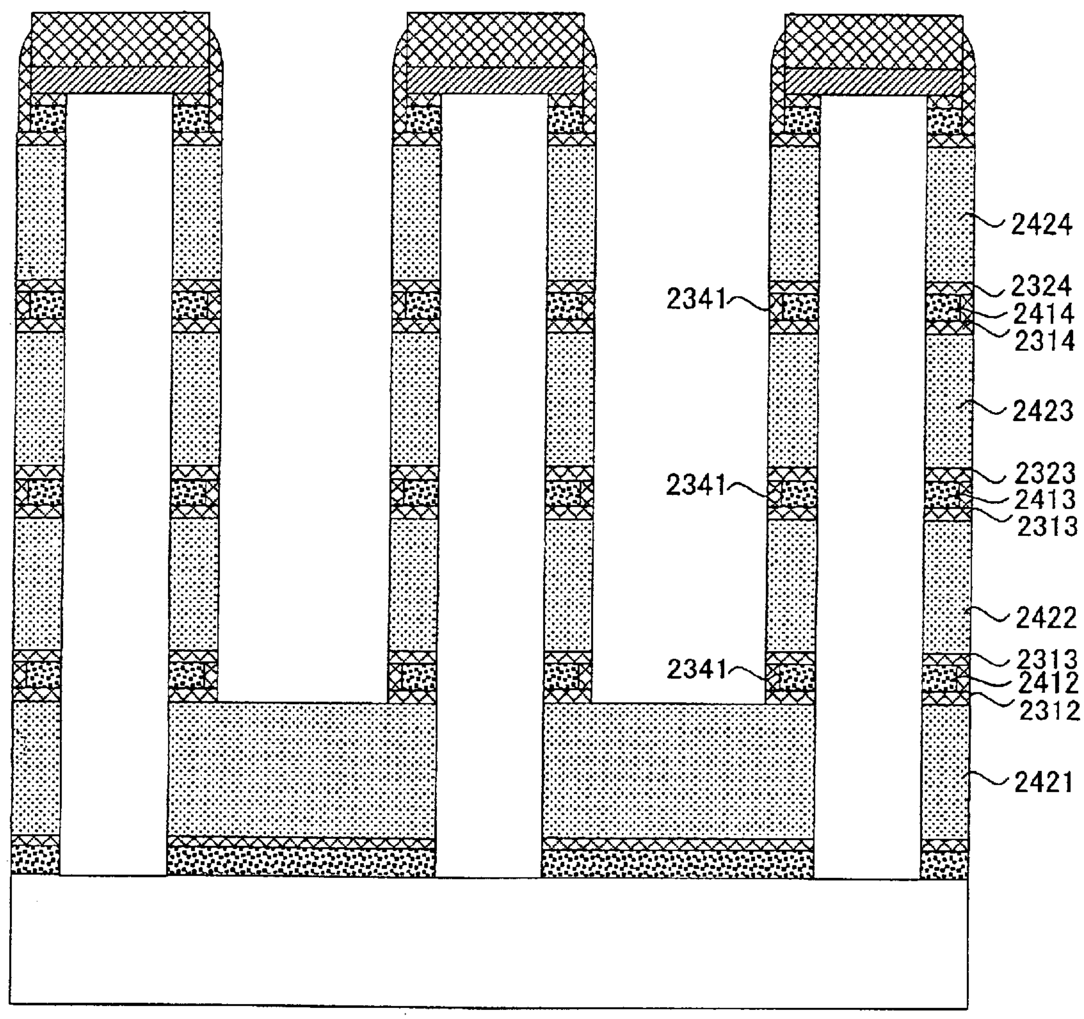

Then, for example, anisotropic etching is carried out by using the silicon nitride films 2330 and 2340 as a mask. This anisotropic etching allows the silicon nitride film 2341 to remain only on the sidewalls of the silicon oxide films 2412, 2413 and 2414. Alternatively, if the silicon nitride film 2341 is deposited to a thickness of half or more of the thickness of the silicon oxide films 2412, 2413 and 2414, isotropic etching is performed to a depth corresponding to the deposit thickness, thereby the silicon nitride film 2341 remains only on the sidewalls of the silicon oxide films 2412, 2413 and 2414 (FIGS. 536 and 546). Thereby, the silicon oxide film 2412 containing the impurities is isolated from other films than the island-like semiconductor layer 2110 by the silicon nitride film 2341 (the sixth insulating film), the silicon nitride film 2312 (the second insulating film) and the silicon nitride film 2322 (the fourth insulating film). This is true of the silicon oxide films 2413 and 2414 each containing the impurities.

As another process of isolating the silicon oxide films 2412, 2413 and 2414, for example, the silicon nitride film 2341 is etched back anisotropically by using the silicon nitride films 2324, 2323 and 2322 as a mask to expose the silicon oxide film 2421 and leave the silicon nitride film 2341 on the sidewalls of the silicon oxide films 2412, 2413 and 2414.

Thereafter, the silicon oxide films 2421, 2422, 2423 and 2424 are removed by, for example, isotropic etching to expose the sides of the island-like semiconductor layers 2110.

Figure 537:
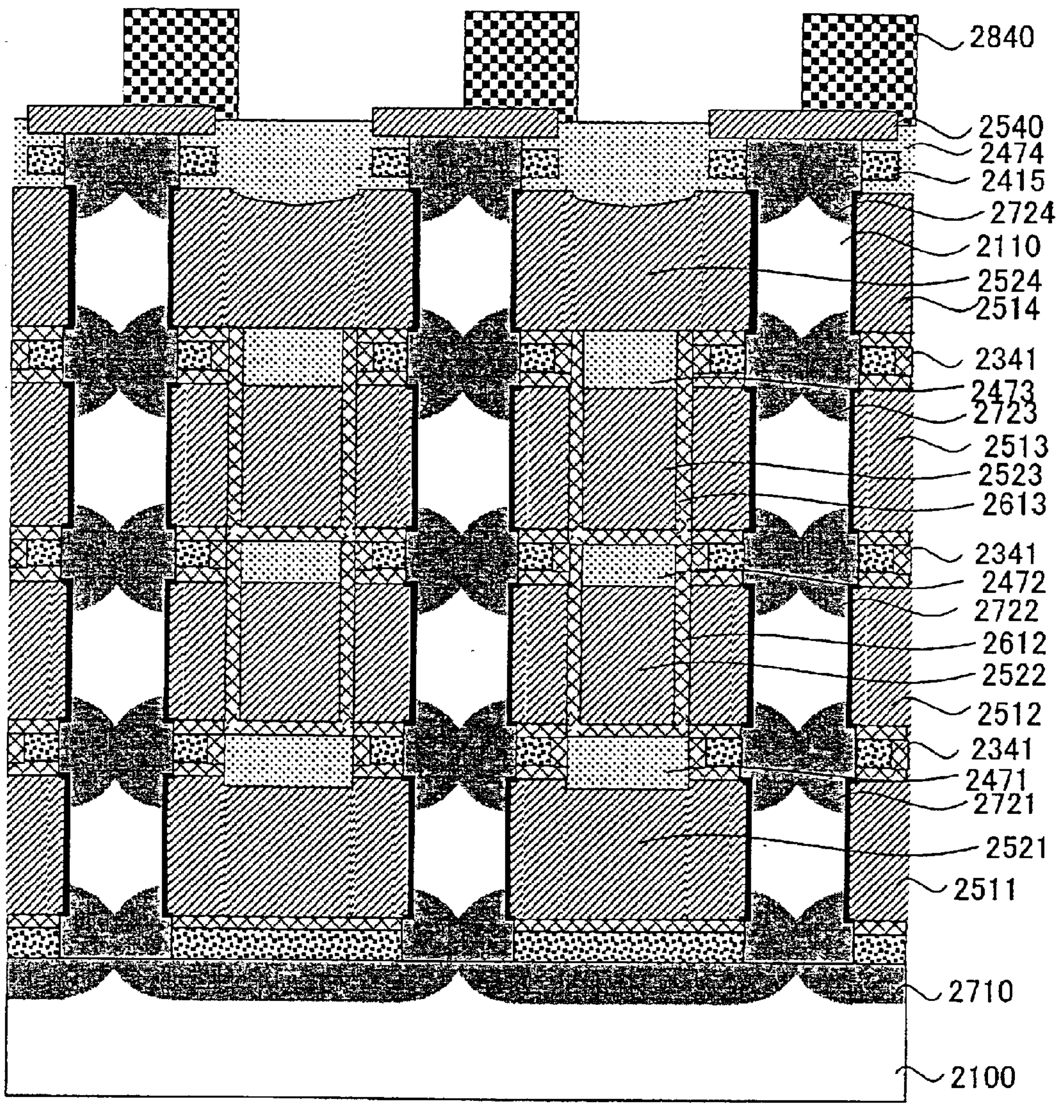
Figure 547:
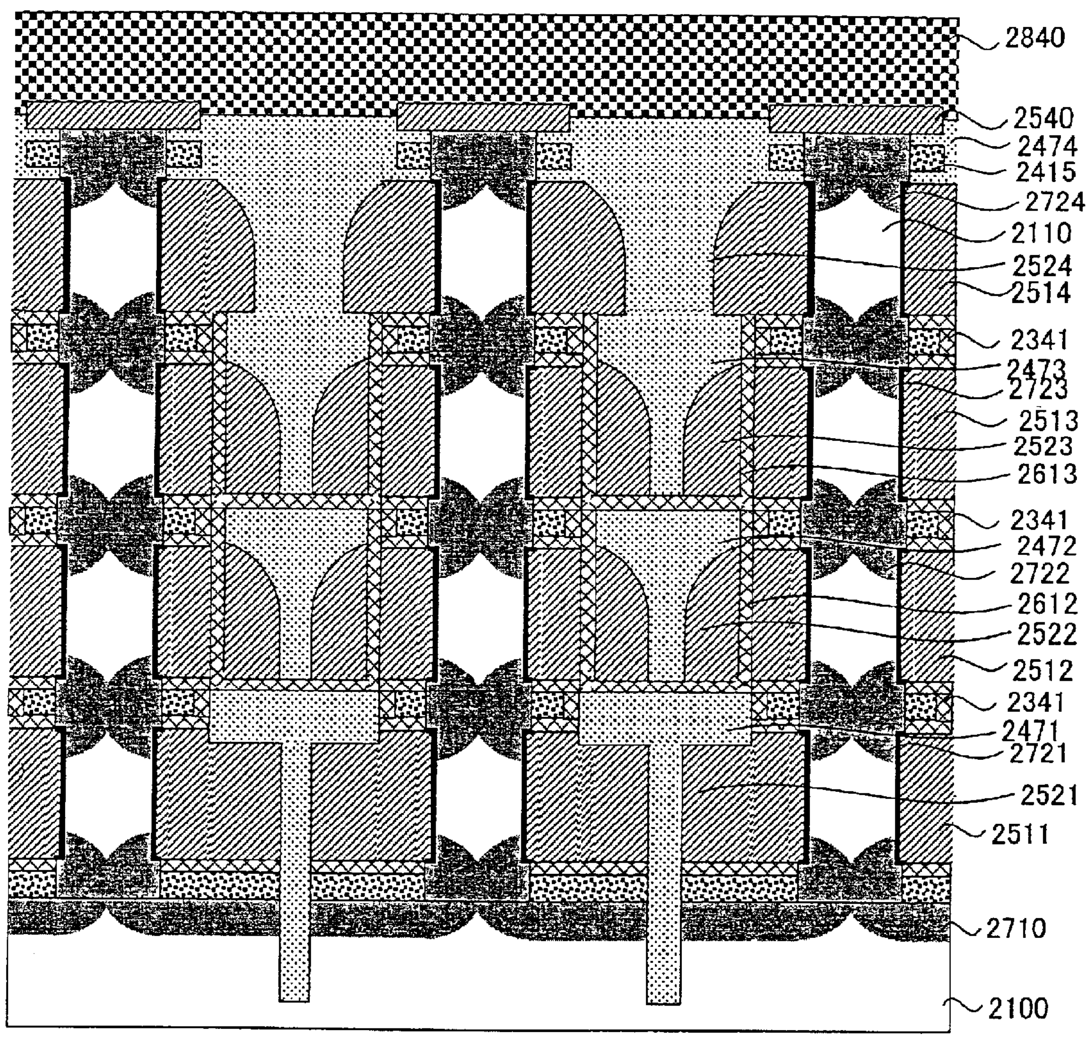

Production steps thereafter follow Production Example 11 (FIGS. 319 to 335 and FIGS. 352 to 368). Thereby, a semiconductor memory is realized which has a memory function according to the state of a charge in the charge storage layer which is the floating gate made of the polysilicon film (the first conductive film) (FIGS. 537 and 547).

Figure 538:
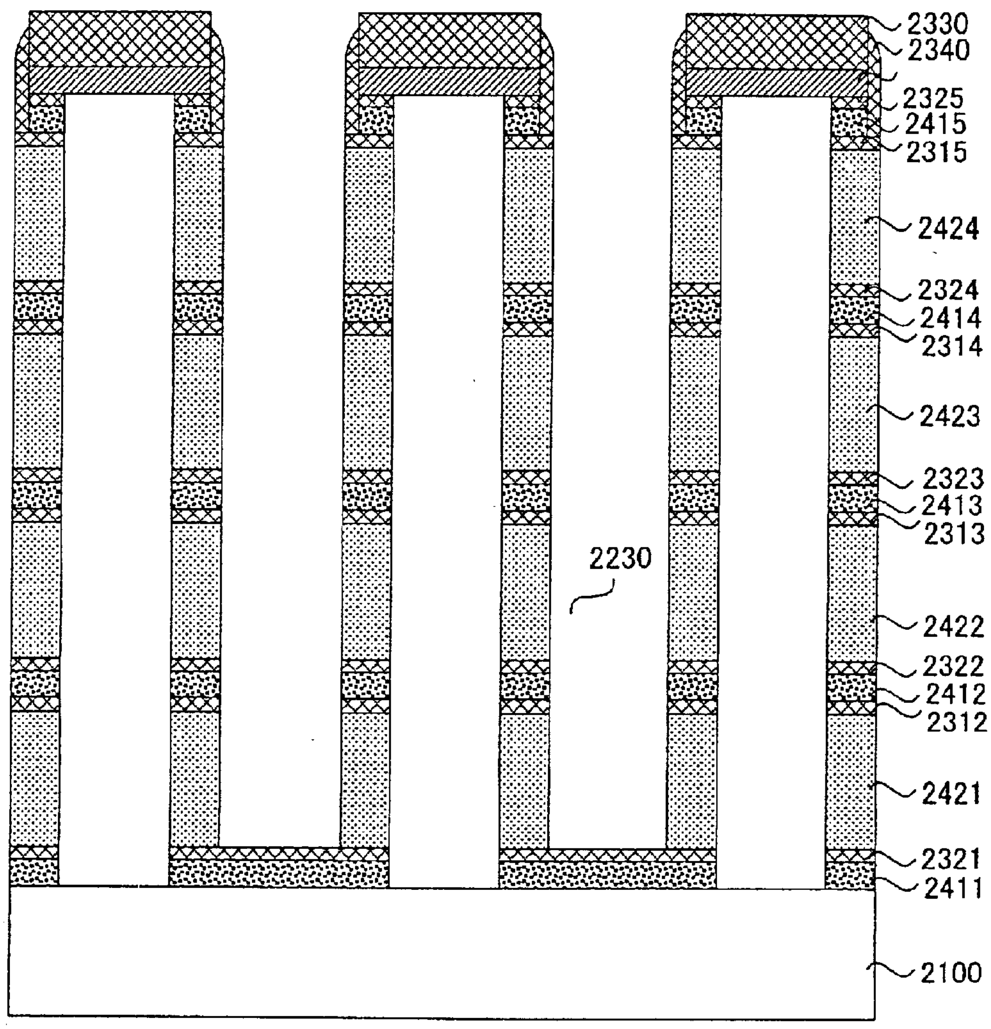
Figure 539:
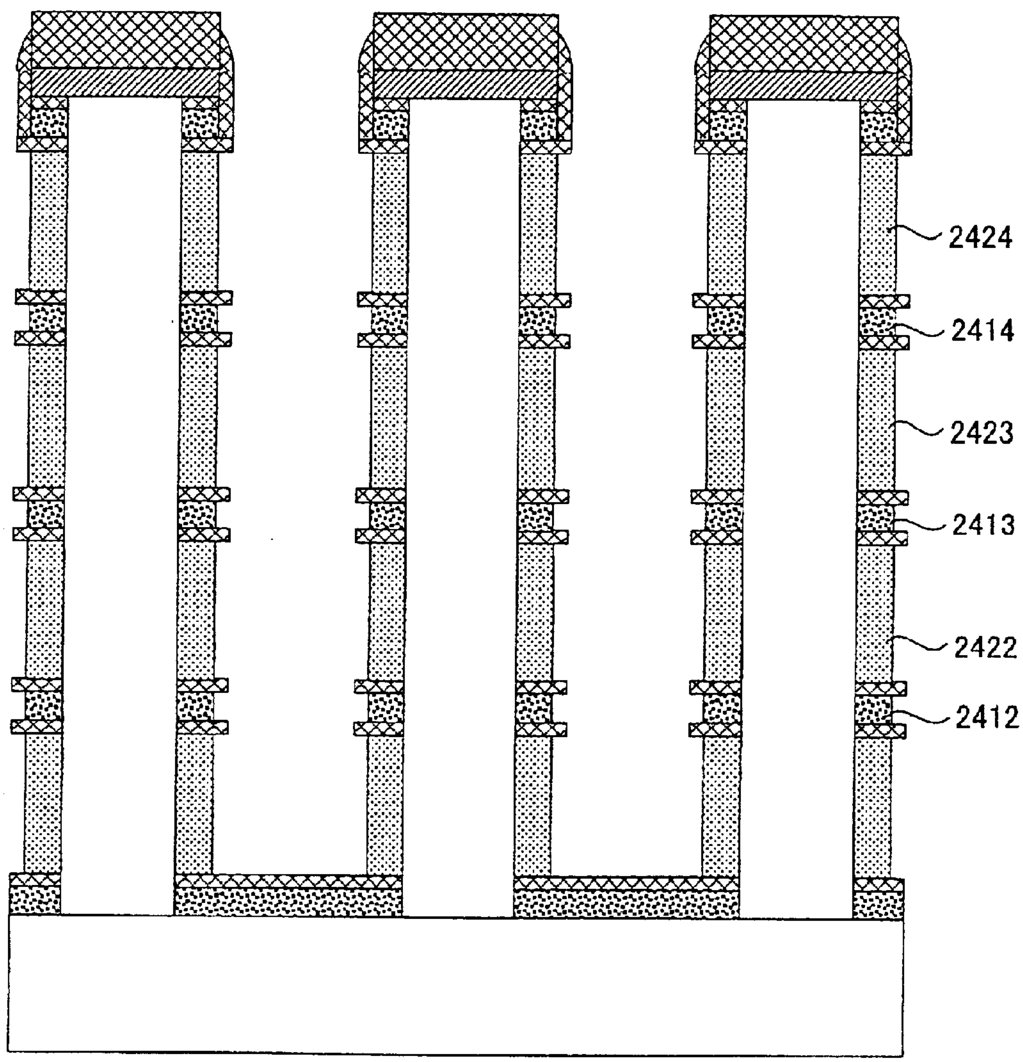
Figure 548:
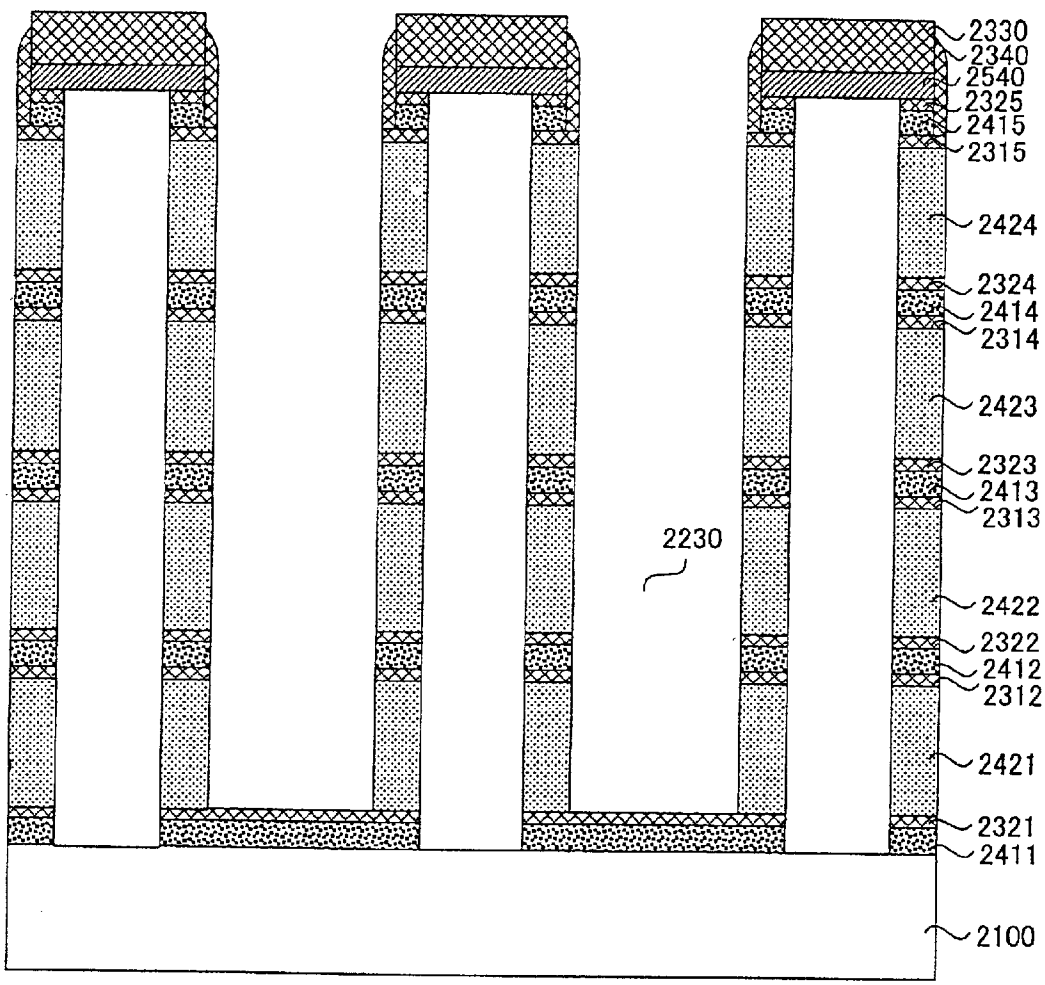
Figure 549:
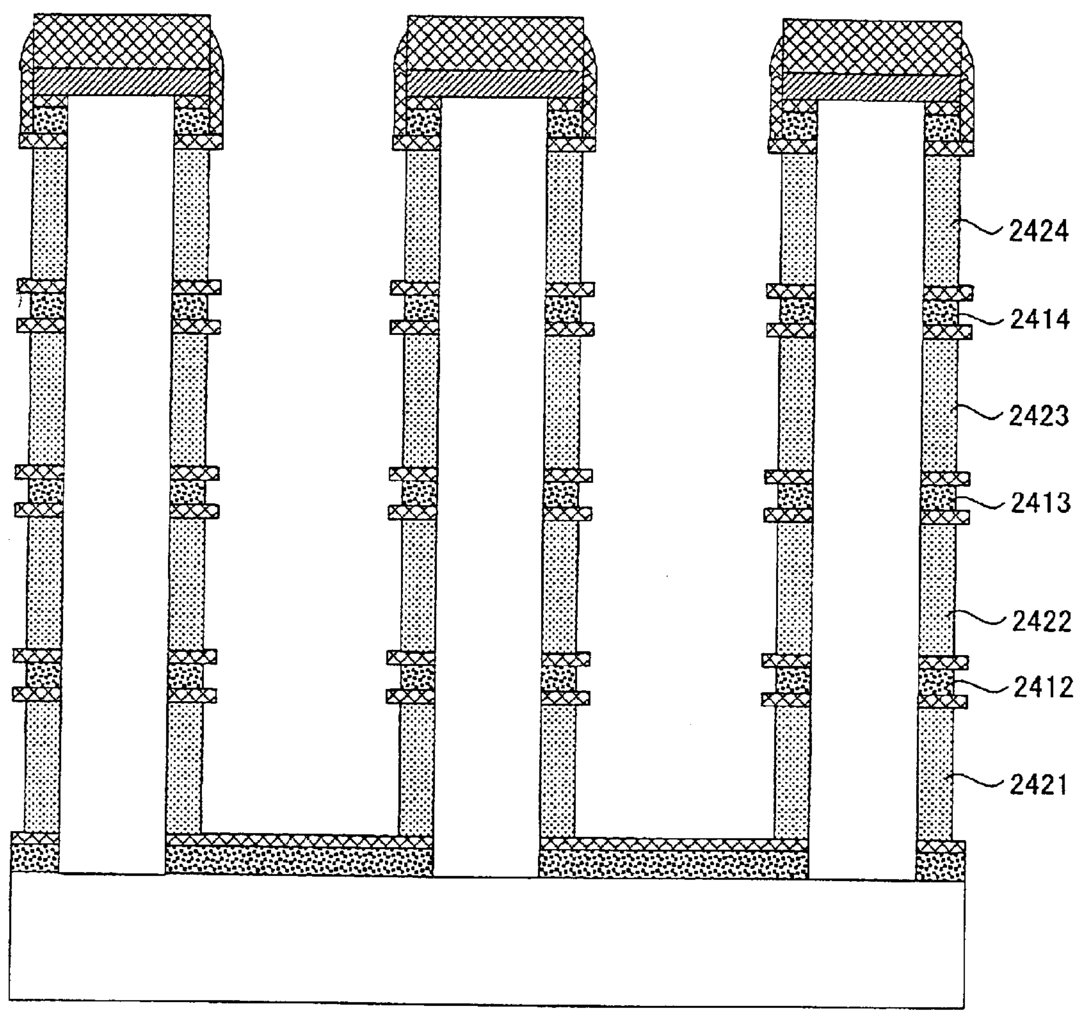

Next, production steps are carried out in the same manner as Production example 11 (FIGS. 304 to 311 and 337 to 344) until the silicon nitride film 2315, the silicon oxide film 2424, the silicon nitride film 2324, the silicon oxide film 2414, the silicon nitride film 2314, the silicon oxide film 2423, the silicon nitride film 2323, the silicon oxide film 2413, the silicon nitride film 2313, the silicon oxide film 2422, the silicon nitride film 2322, the silicon oxide film 2412 and the silicon nitride film 2312 are sequentially etched by using the silicon nitride films 2330 and 2341 as a mask to expose the silicon oxide film 2421, thereby forming the third trench 2230 (FIGS. 538 and 548). The silicon oxide films 2412, 2413 and 2414 (the first insulating films) and the silicon oxide films 2421, 2422, 2423 and 2424 (the third insulating films) are then selectively reduced in a direction horizontal to the semiconductor substrate surface (FIGS. 539 and 549).

Figure 540:
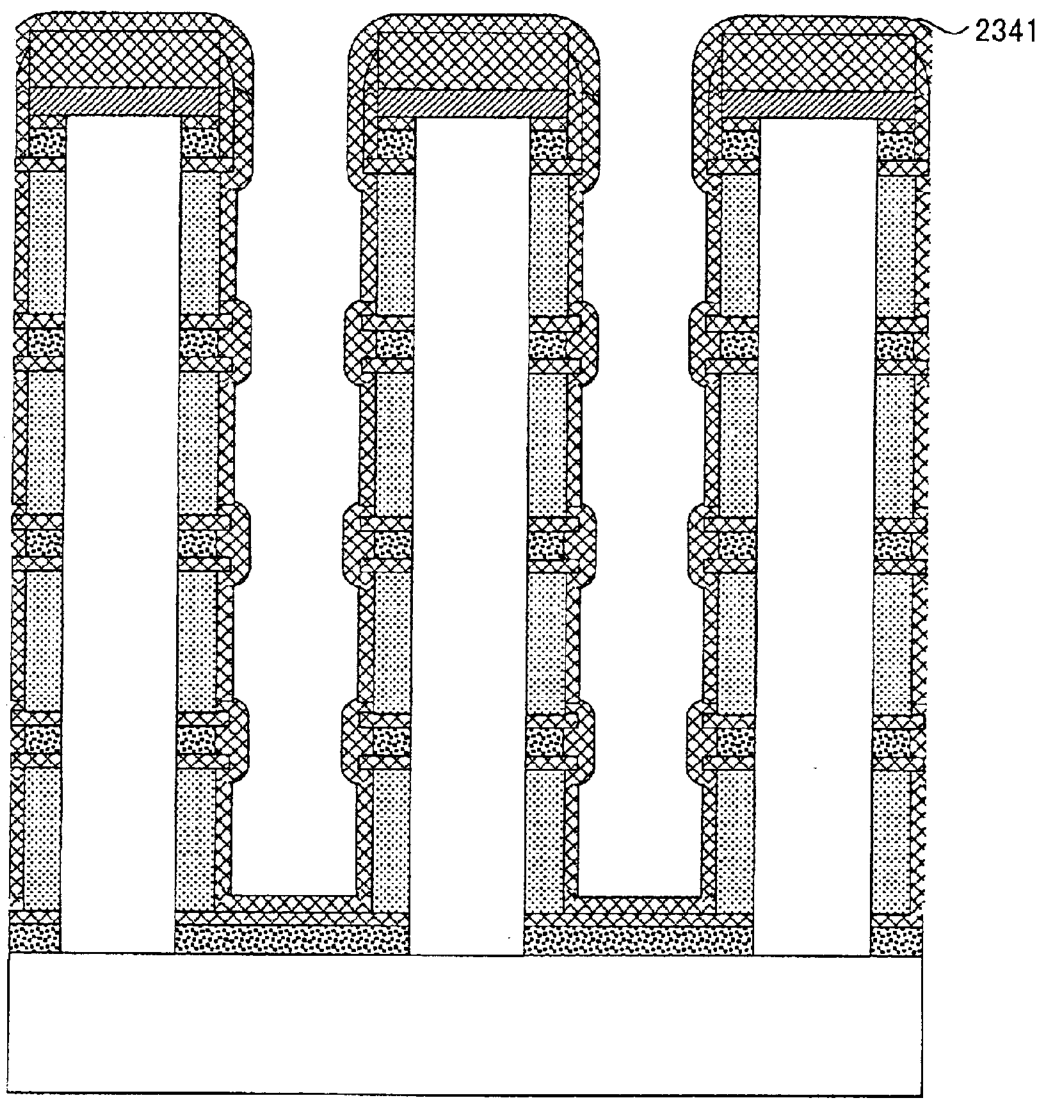
Figure 550:
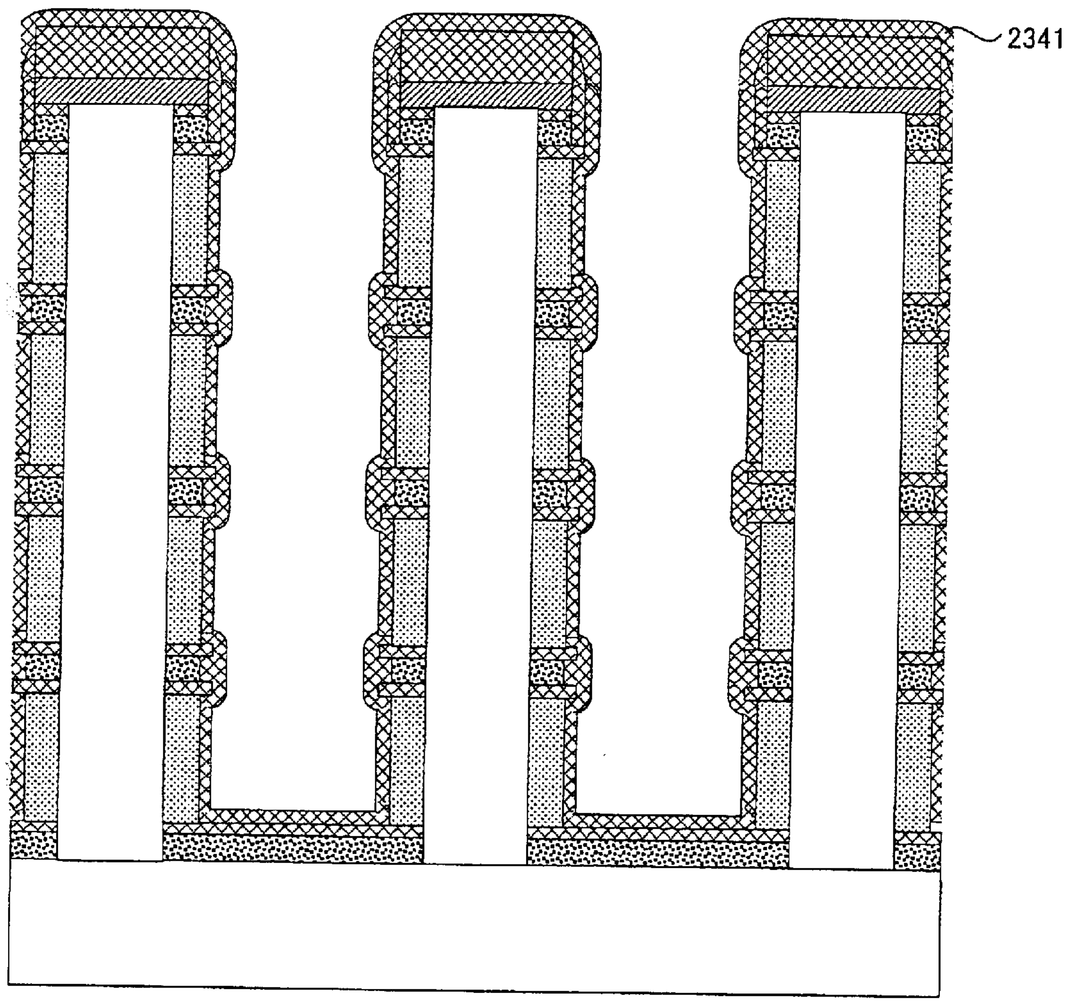

A silicon nitride film 2341 is deposited as a sixth insulating film to a thickness of about 25 to 250 nm (FIGS. 540 and 550). The thickness of the silicon nitride film 2341 is preferably set to be half or more of the thickness of the silicon oxide films 2412, 2413 and 2414, and to be half or less of the thickness of the silicon oxide films 2421, 2422, 2423 and 2424. That is, it is preferred that the silicon oxide films 2412, 2413 and 2414 are formed to have a thickness smaller than that of the silicon oxide films 2421, 2422, 2423 and 2424, and the silicon nitride film 2341 is formed to have a thickness larger than the half of the thickness of the silicon oxide films 2412, 2413, 2414 and smaller than the half of the thickness of the silicon oxide films 2421, 2422, 2423 and 2424.

Figure 541:
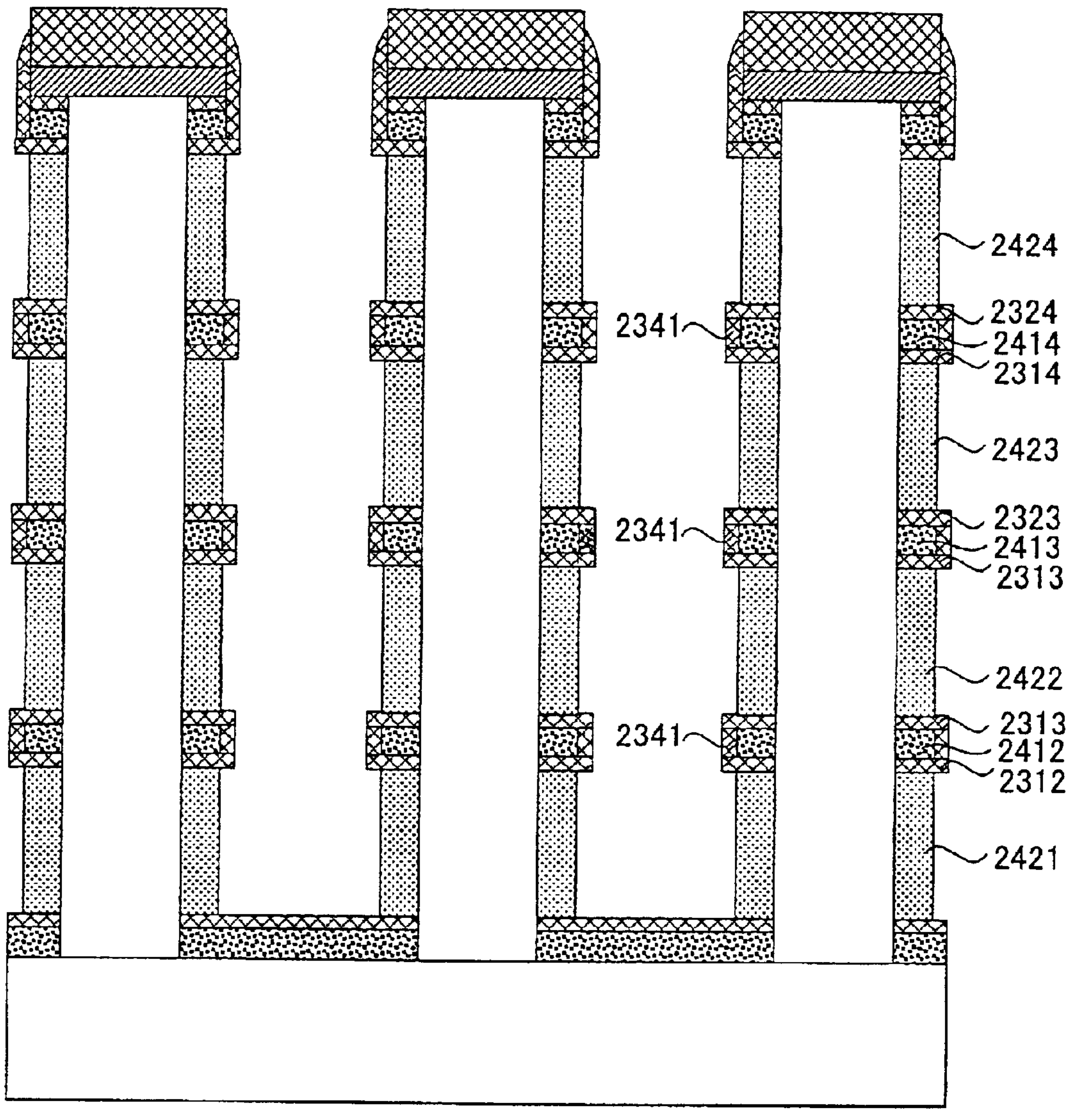
Figure 542:
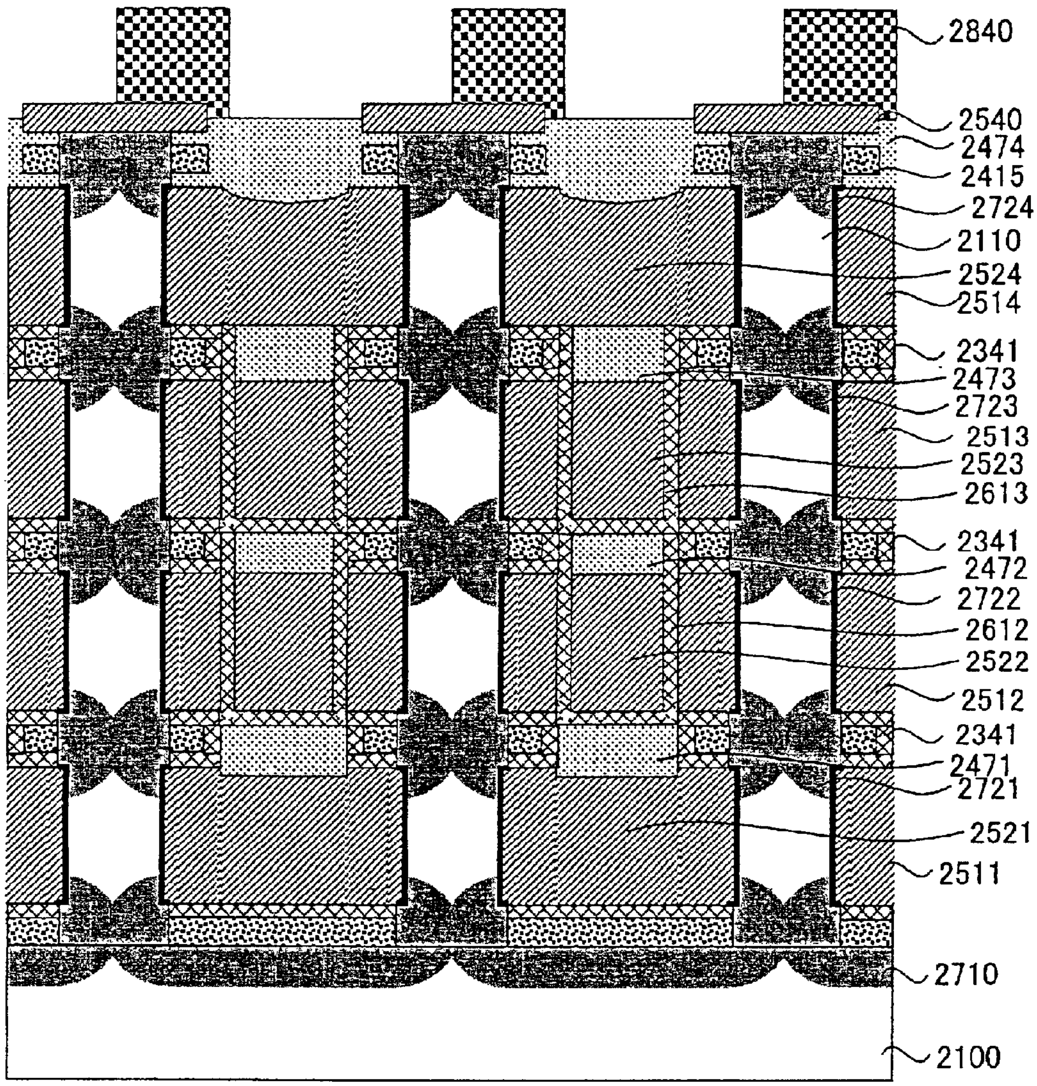
Figure 543:
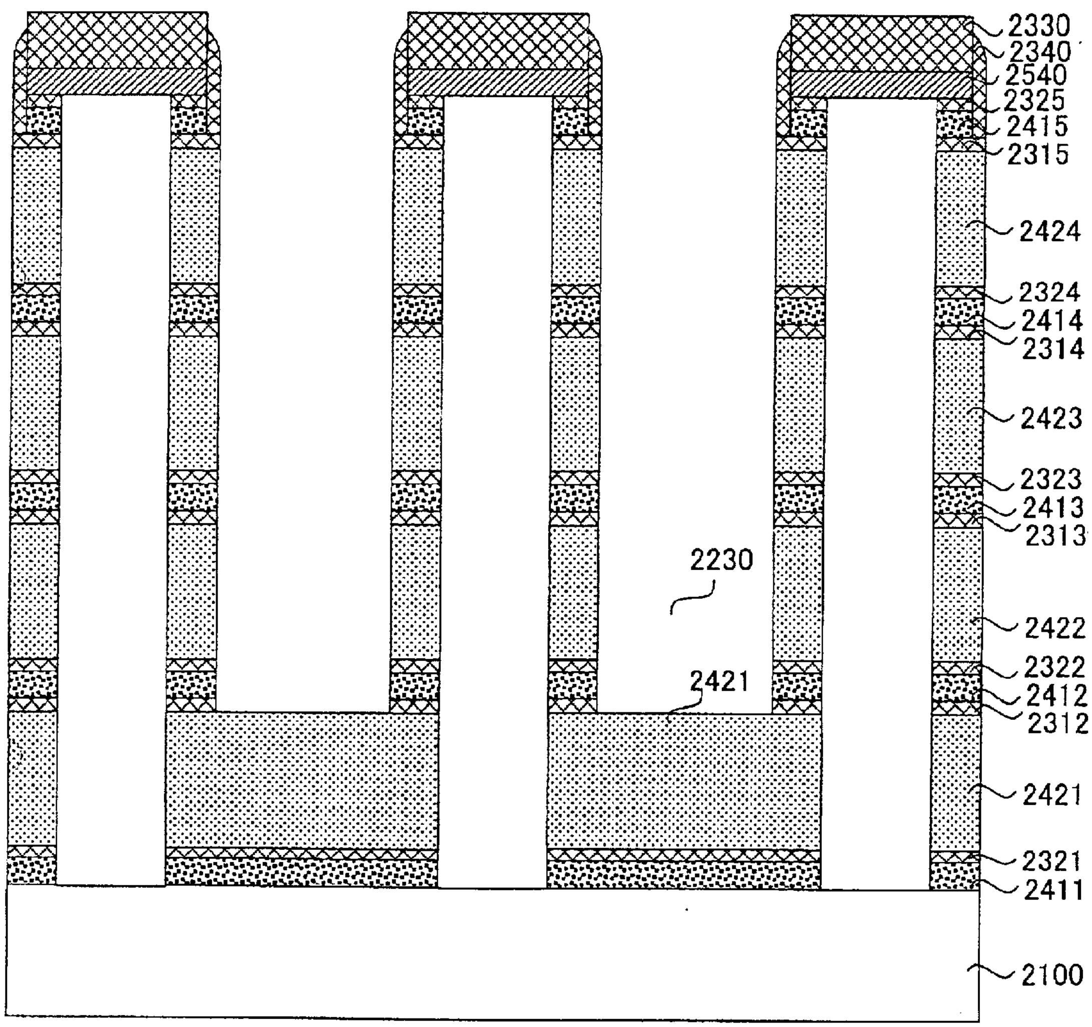
Figure 551:
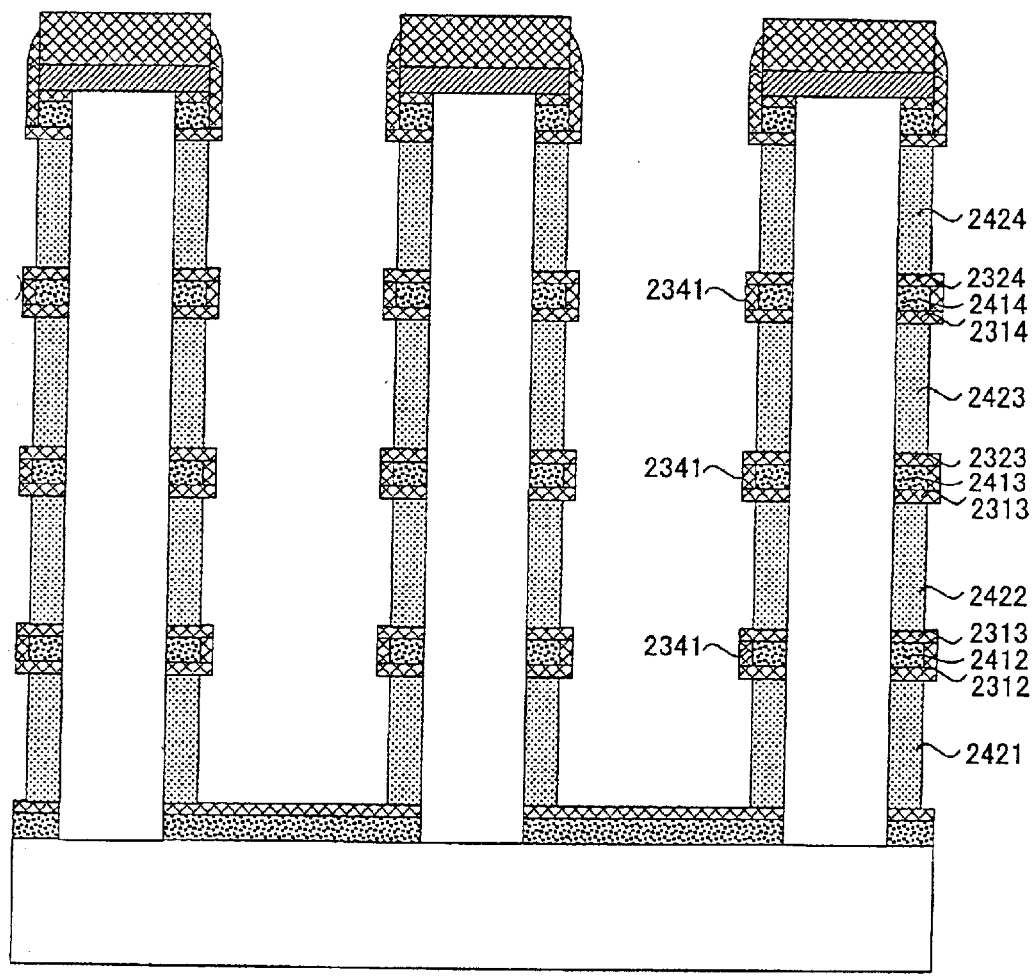
Figure 552:
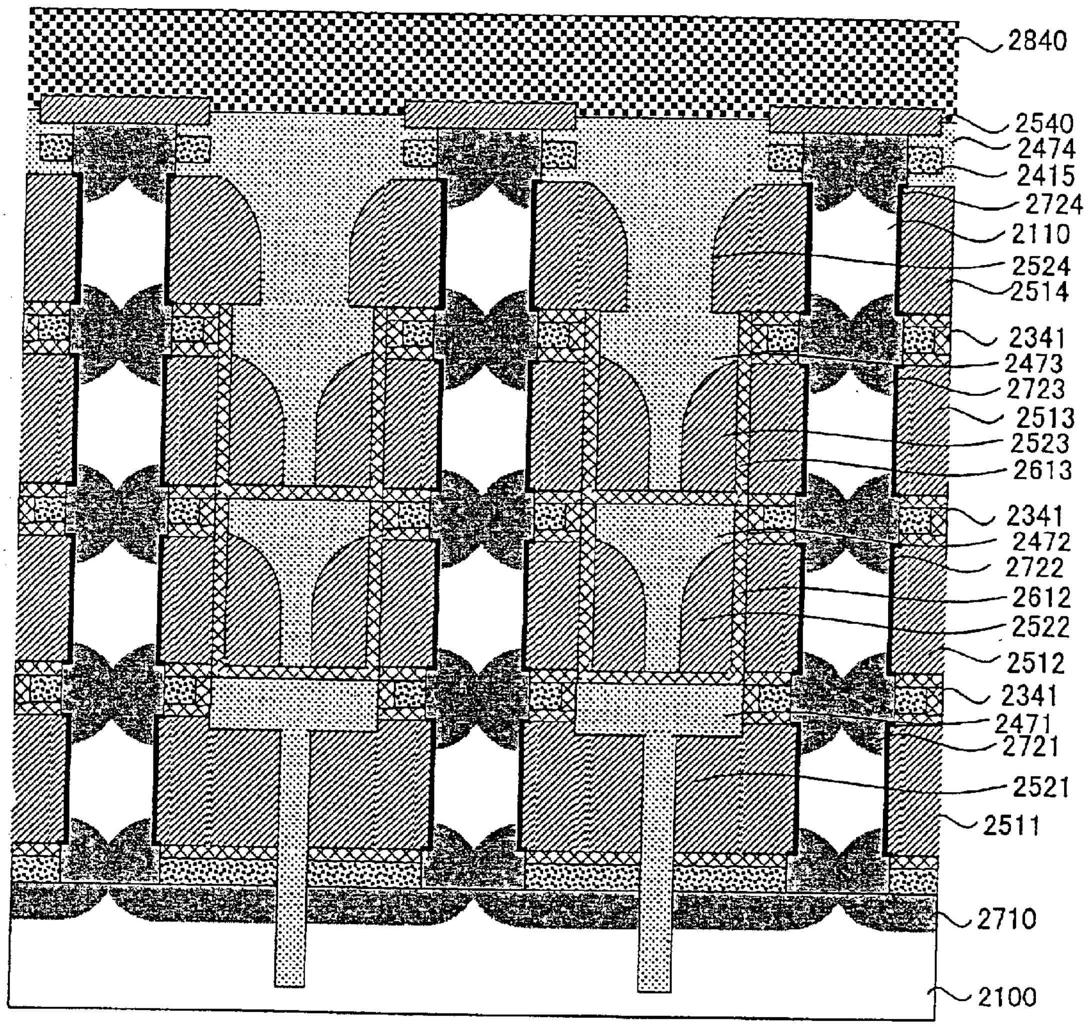

Thereafter, the silicon nitride film 2341 is etched back to a depth corresponding to the deposit thickness by isotropic etching, thereby leaving the silicon nitride film 2341 only on the sides of the silicon oxide films 2412, 2413 and 2414 (FIGS. 541 and 551). Thus, the silicon oxide film 2412 containing the impurities is isolated from other films than the island-like semiconductor layer 2110 by the silicon nitride film 2341 (the sixth insulating film), the silicon nitride film 2312 (the second insulating film) and the silicon nitride film 2322 (the fourth insulating film). This is true of the silicon oxide films 2413 and 2414 each containing the impurities.

As another process of isolating the silicon oxide films 2412, 2413 and 2414, for example, the silicon nitride film 2341 is etched back anisotropically by using the silicon nitride films 2324, 2323 and 2322 as a mask to expose the silicon oxide film 2421 and leave the silicon nitride film 2341 on the sidewalls of the silicon oxide films 2412, 2413 and 2414.

Thereafter, the silicon oxide films 2421, 2422, 2423 and 2424 are removed by isotropic etching to expose the sides of the island-like semiconductor layers 2110.

Production steps thereafter follow Production Example 11 (FIGS. 318 to 335 and FIGS. 351 to 368). Thereby, a semiconductor memory is realized which has a memory function according to the state of a charge in the charge storage layer which is the floating gate made of the polysilicon film (the first conductive film).

In this example, films formed on the surface of the semiconductor substrate or the polysilicon film such as the silicon nitride film (the fifth insulating film) 2330, the silicon nitride film (the sixth insulating film) 2341 and the silicon nitride film (the twelfth insulating film) 2350 may be formed of a layered film of a silicon oxide film/a silicon nitride film from the silicon surface.

With regard to the polysilicon films 2510 or 2511 to 2514 (the first conductive films), the polysilicon films 2520 or 2521 to 2524 (the second conductive films) and the polysilicon film 2540 (the fourth conductive film), impurity introduction may be carried out during or after the formation of the polysilicon films or after the separation of the polysilicon films. The timing of the impurity introduction to the polysilicon films is not particularly limited so long as these films become conductive films.

In this example, the control gates of the memory cells are formed continuously in one direction without using a mask. However, that is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

Further, by providing the selection gates in the top and the bottom of a set of memory cells, it is possible to prevent the phenomenon that a memory cell transistor is over-erased.

PRODUCTION EXAMPLE 21

In an example of production process for forming a semiconductor memory in which regions for forming charge storage layers are defined in advance by a laminated film comprising plural films, explanation is given of an example of production process in which vapor or solid phase diffusion is utilized for the impurity introduction to the island-like semiconductor layers.

Such a semiconductor memory may be produced by the following production process. FIGS. 553 to 573 and FIGS. 574 to 594 are sectional views taken on line A-A' and line B-B', respectively, in FIG. 1 which is a plan view illustrating an EEPROM memory cell array.

First, on a surface of a P-type silicon substrate 2100, a silicon nitride film 2321, for example, is deposited as a fourth insulating film to a thickness of 10 to 100 nm.

A silicon oxide film 2421, for example, is then deposited as a third insulating film to a thickness of 50 to 500 nm, a silicon nitride film 2312 is deposited as a second insulating film to a thickness of 10 to 100 nm and a silicon oxide film 2422 is deposited as a third insulating film to a thickness of 50 to 500 nm.

Figure 553:
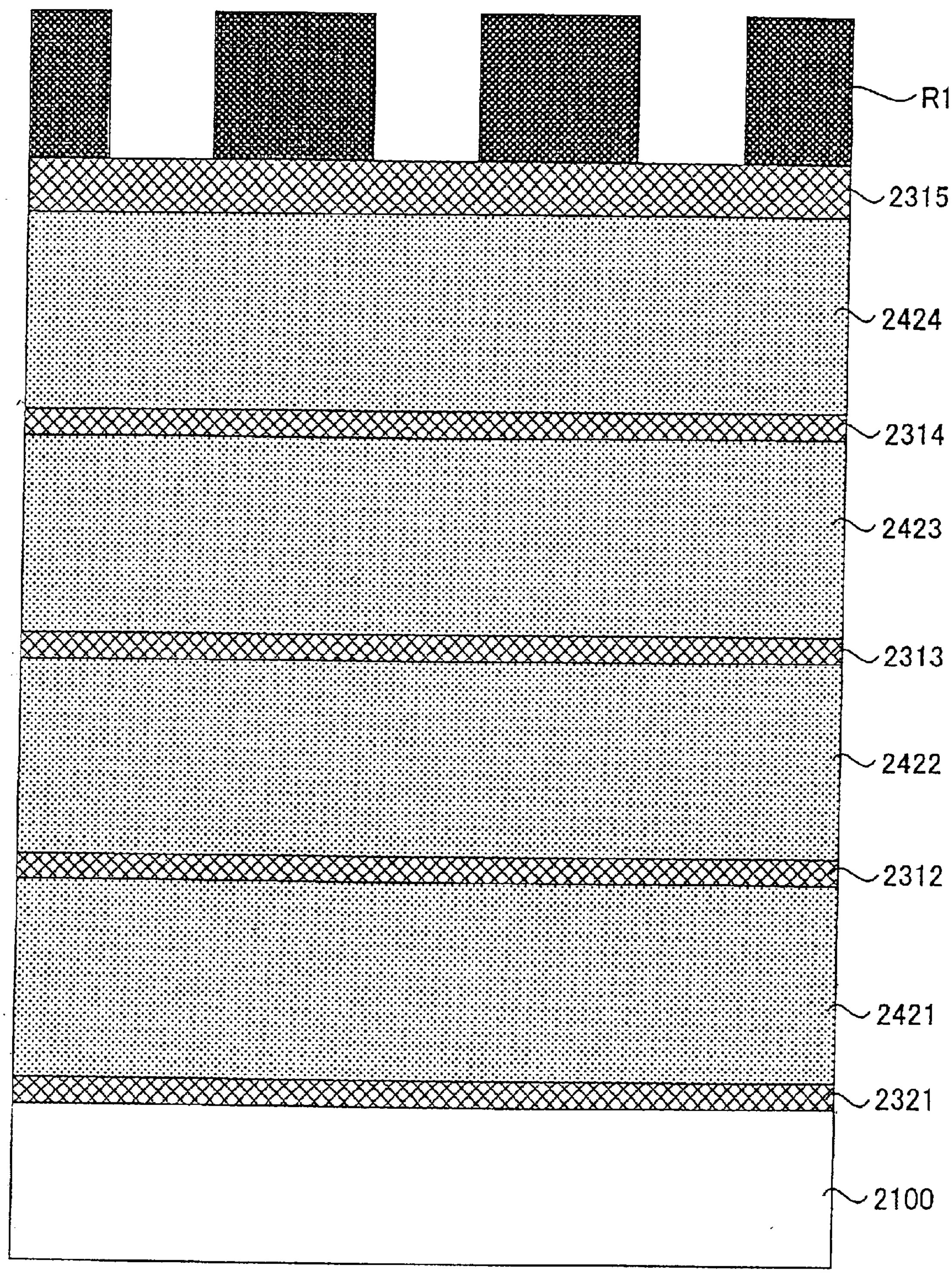
Figure 574:
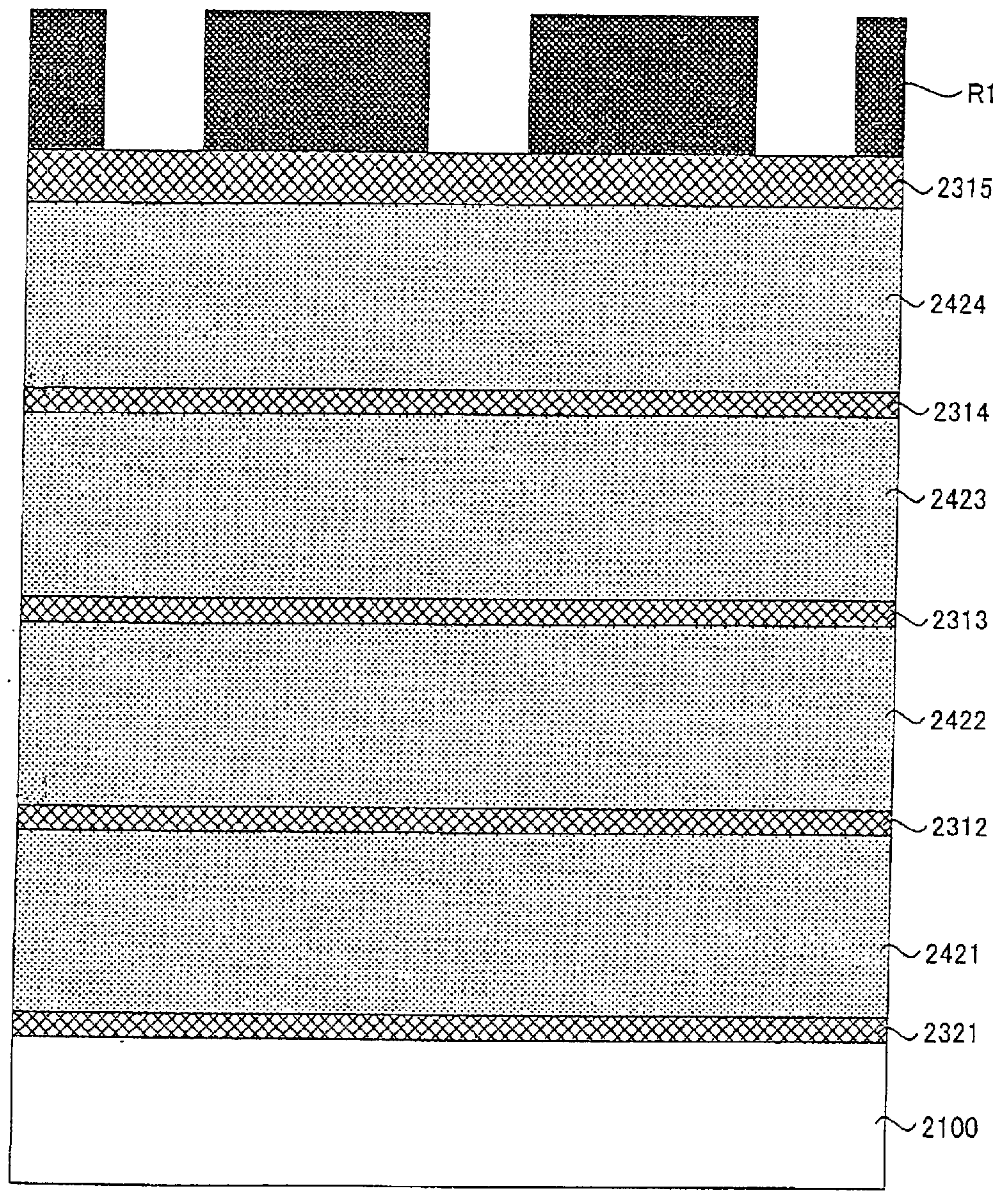

After the films are sequentially formed, a silicon oxide film 2424 is deposited to a thickness of 50 to 500 nm as a third insulating film and a silicon nitride film 2315 is deposited to a thickness of 20 to 200 nm as a second insulating film as shown in FIGS. 553 and 574.

Figure 554:
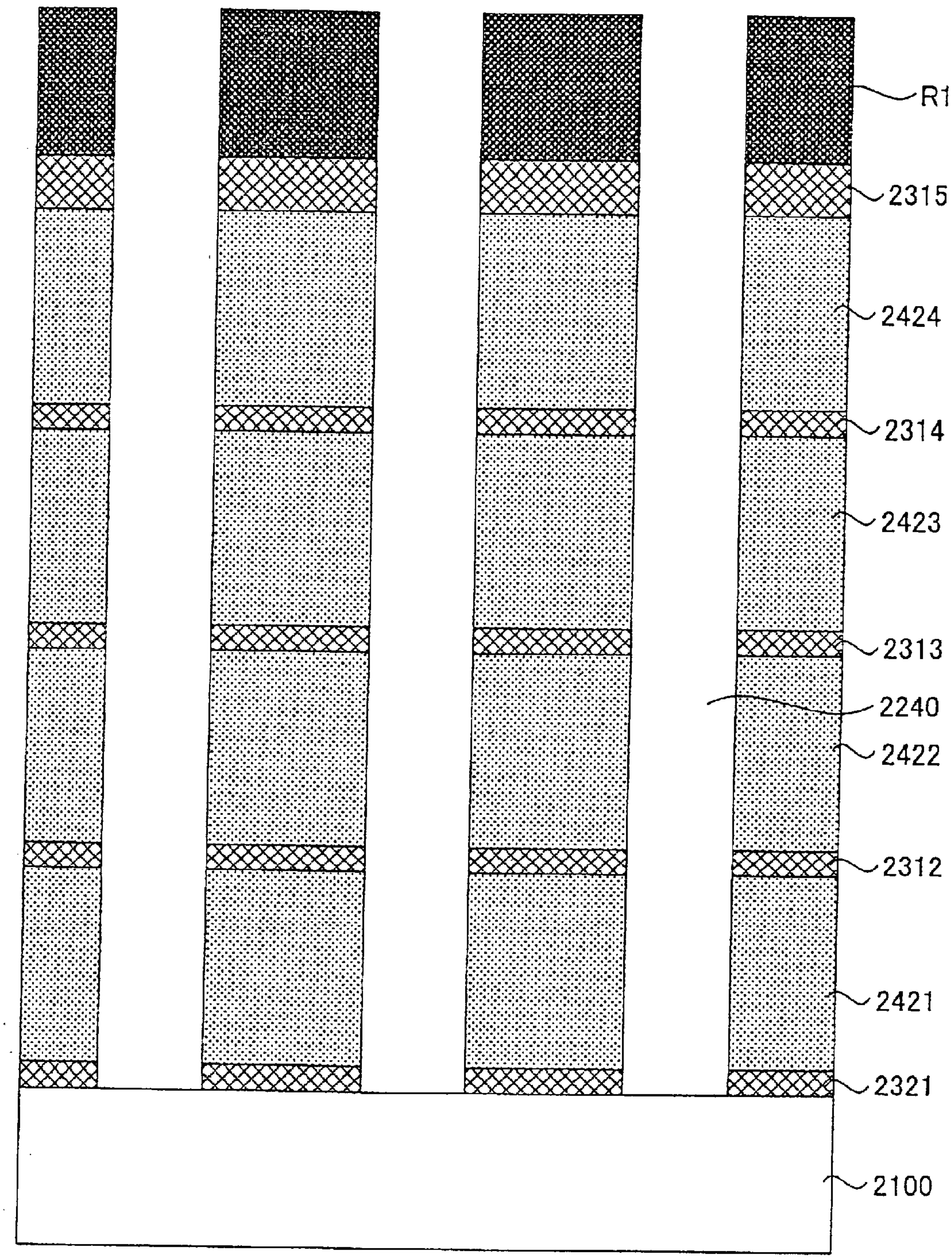
Figure 575:
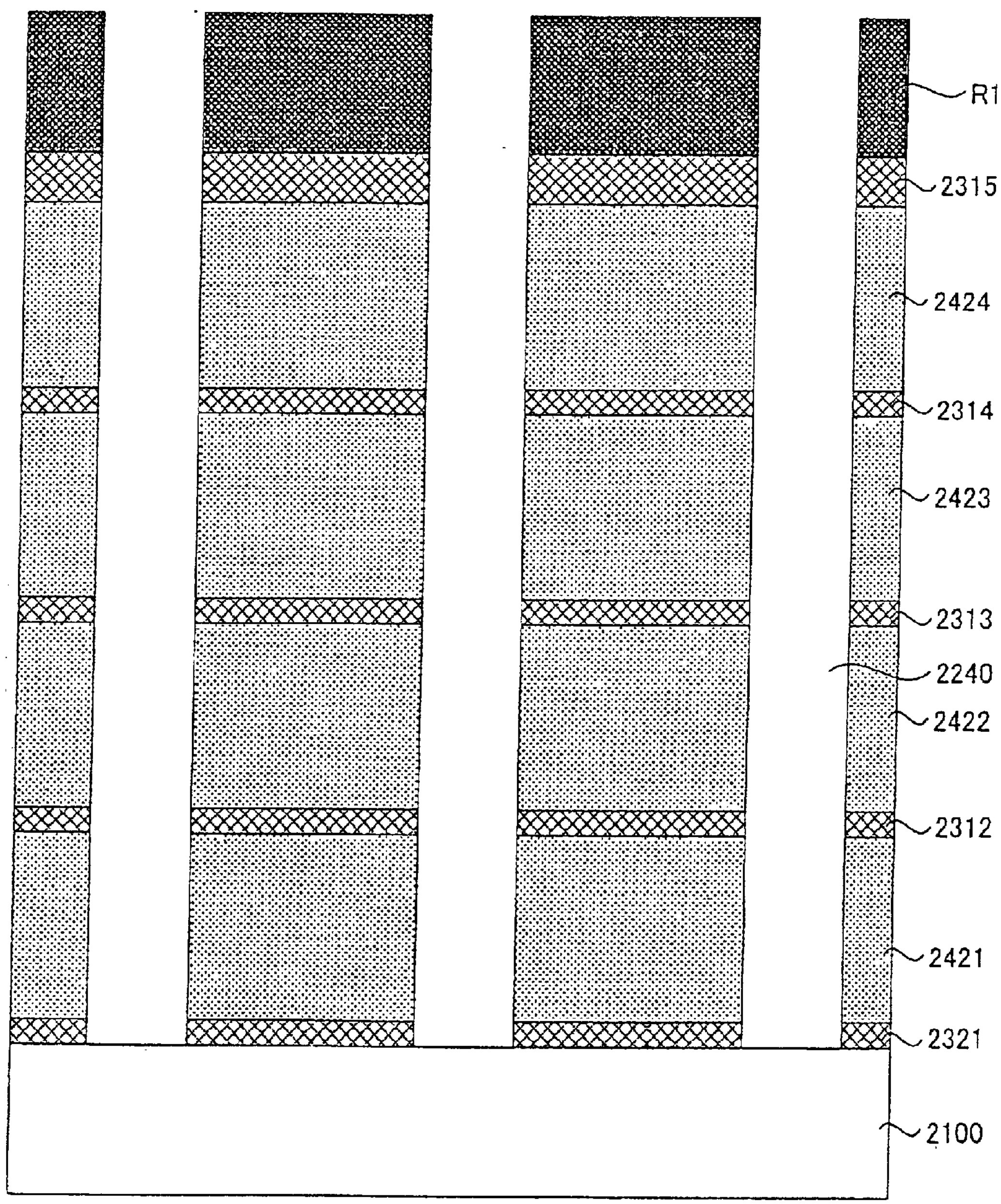

Subsequently, using a resist film R1 patterned by a known photolithographic technique as a mask (FIGS. 553 and 574), reactive ion etching, for example, is performed to successively etch the silicon nitride film 2315, the silicon oxide film 2424, the silicon nitride film 2314, the silicon oxide film 2423, the silicon nitride film 2313, the silicon oxide film 2422, the silicon nitride film 2312, the silicon oxide film 2421 and the silicon nitride film 2321, thereby forming a fourth trench 2240 (FIGS. 554 and 575).

Figure 555:
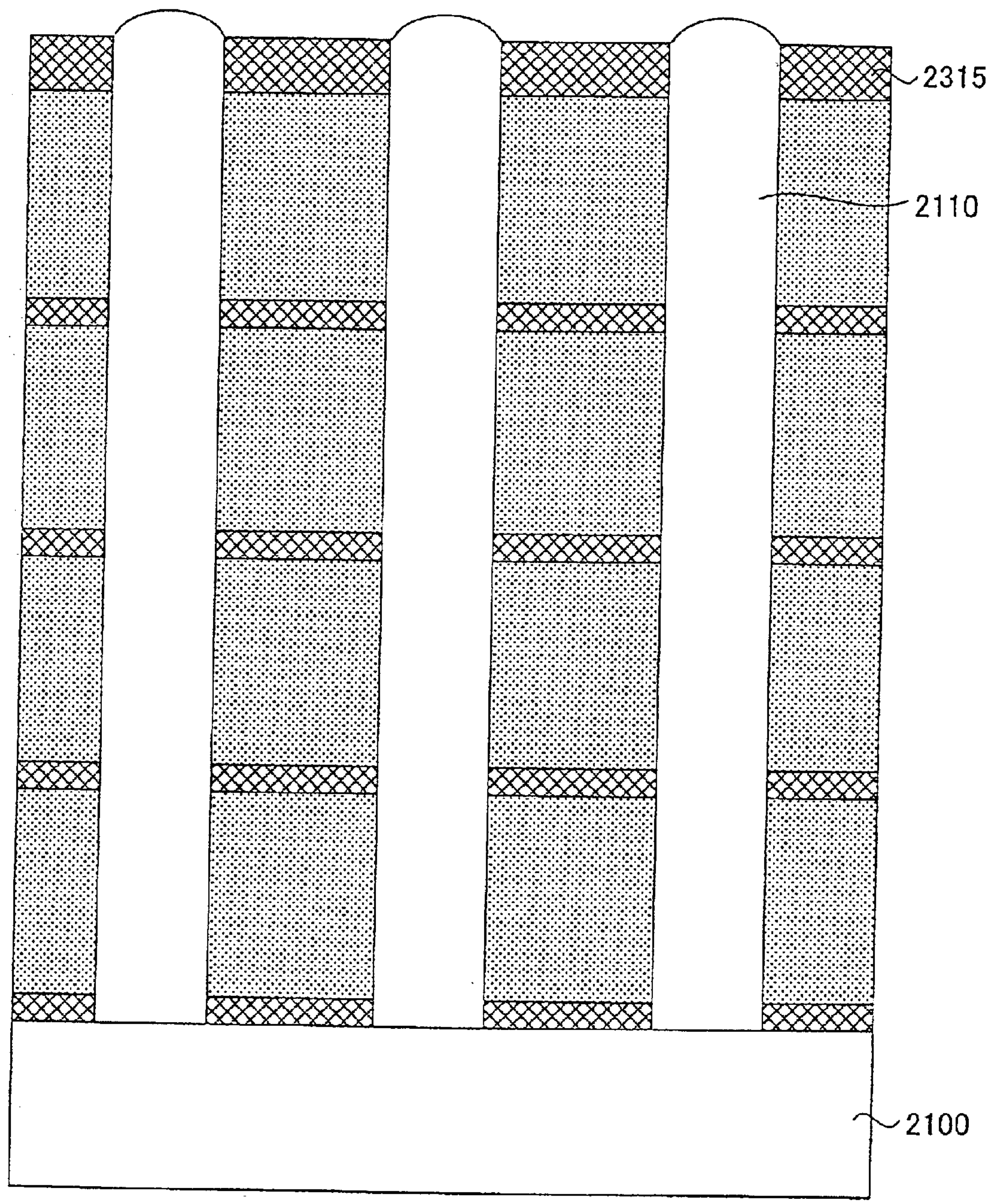
Figure 576:
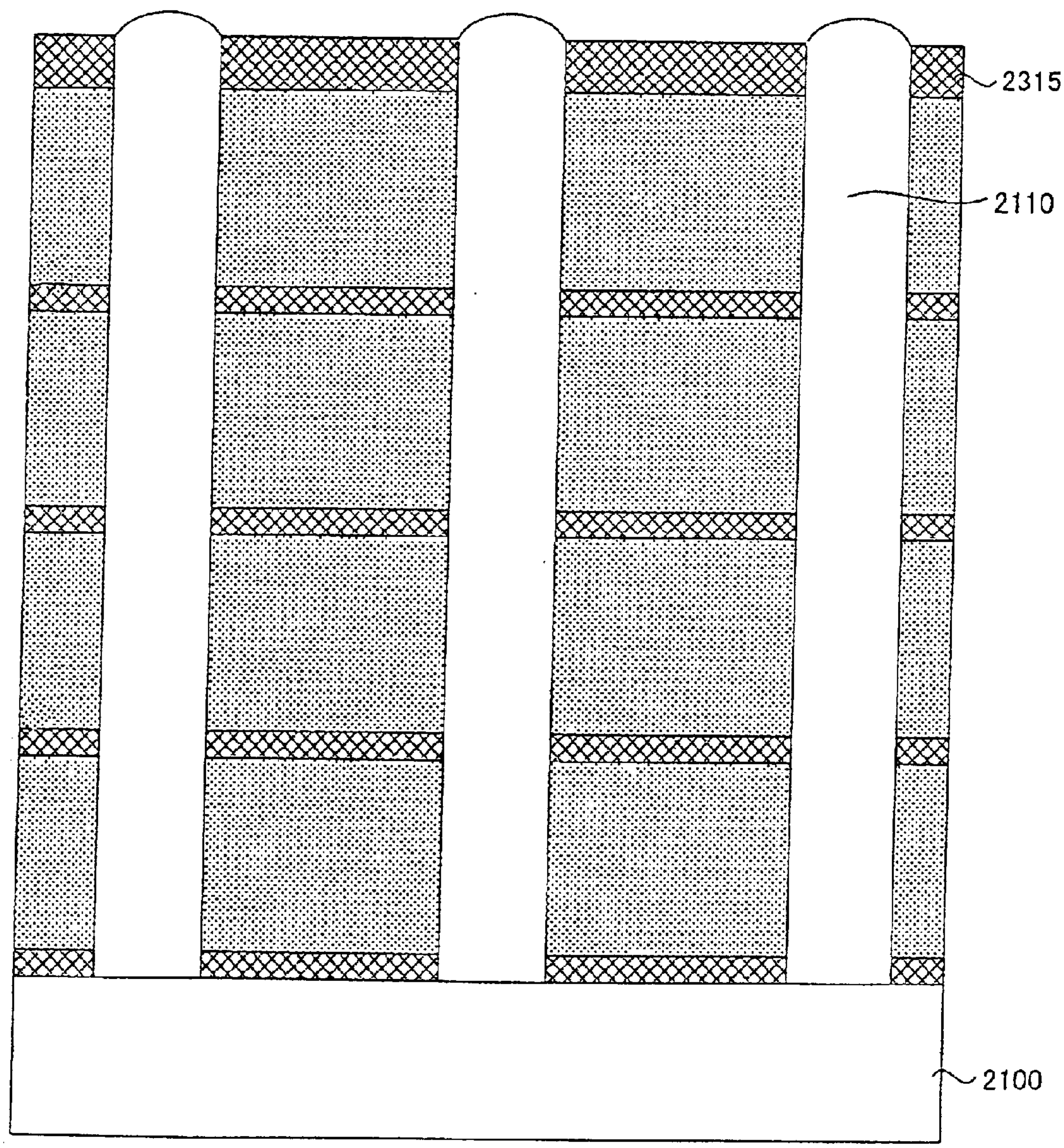

The resist film R1 is removed and then island-like semiconductor layers 2110 are filled in the fourth trench 2240. For example, the island-like semiconductor layers 2110 are formed by selective epitaxial growth from the P-type silicon substrate 2100 located at the bottom of the fourth trench 2240 (FIGS. 555 and 576).

Figure 556:
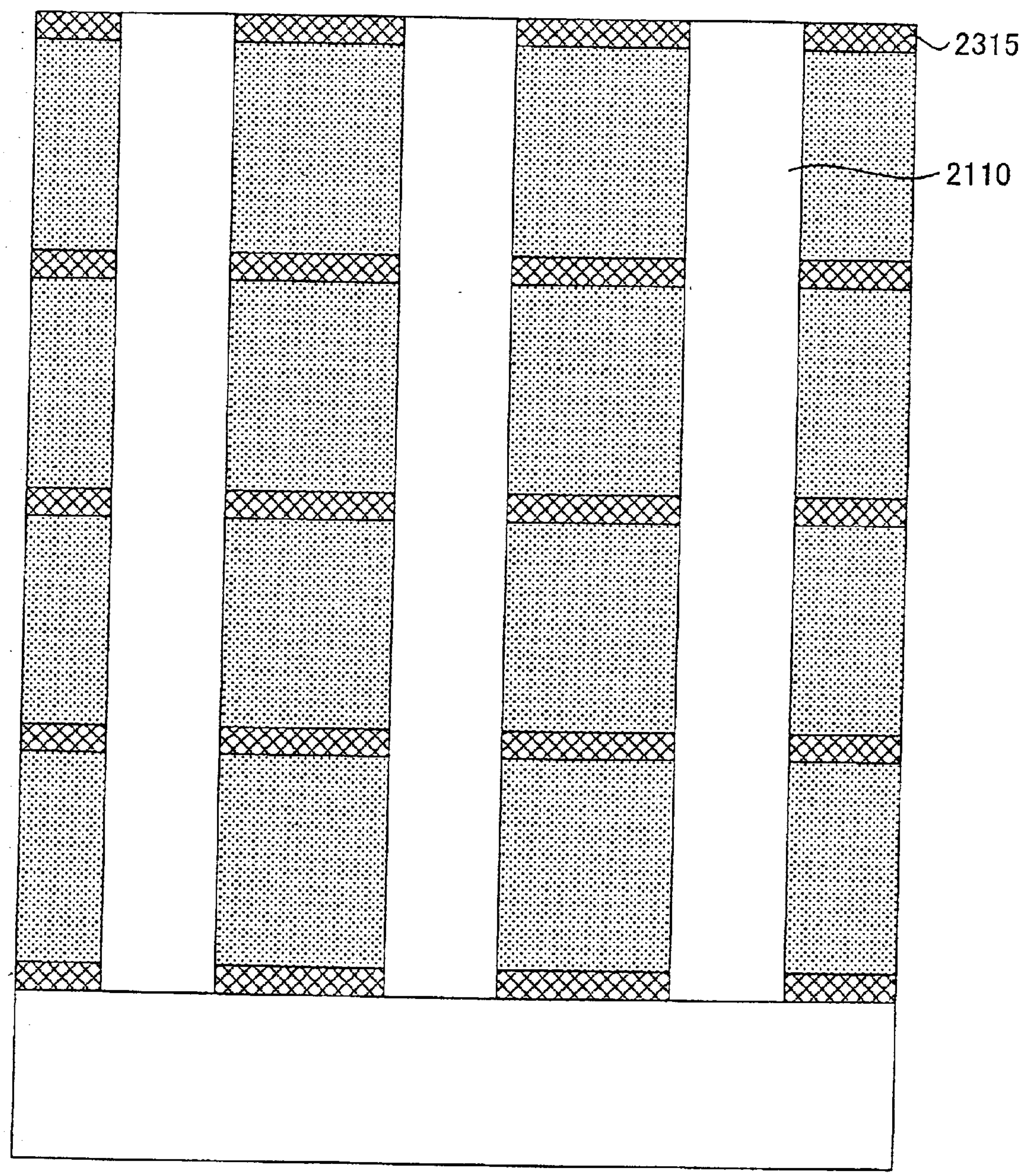
Figure 557:
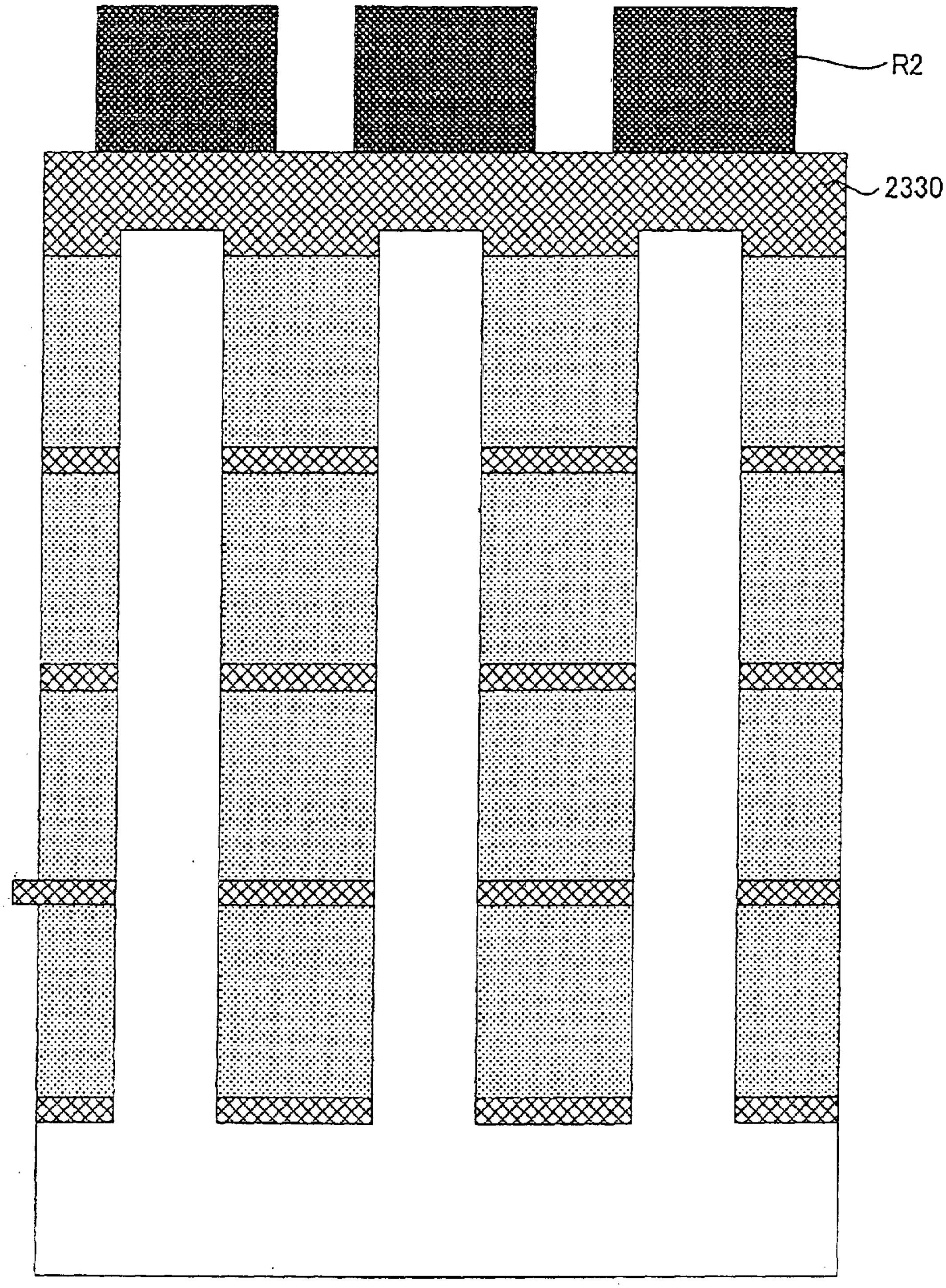
Figure 577:
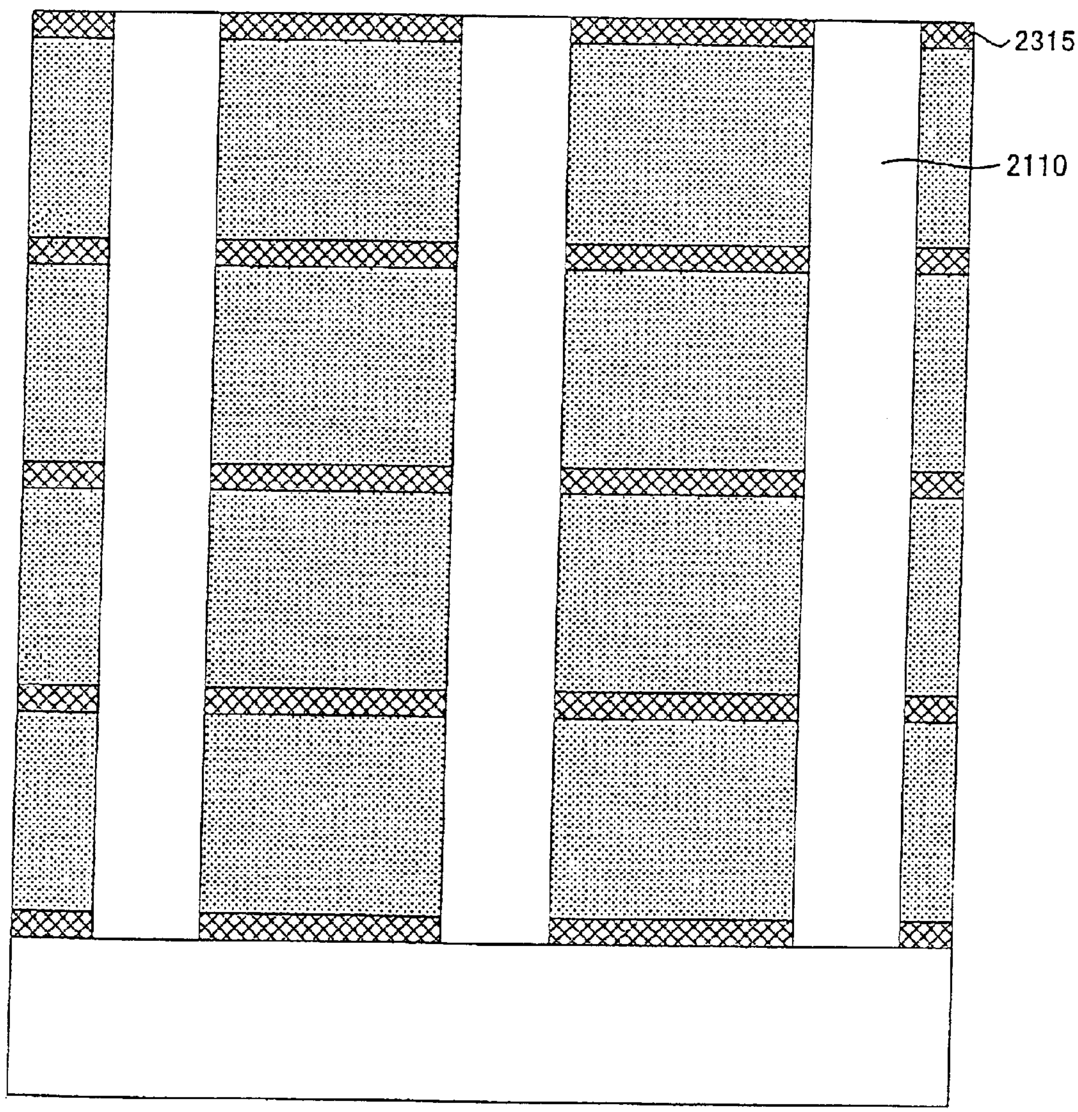
Figure 578:
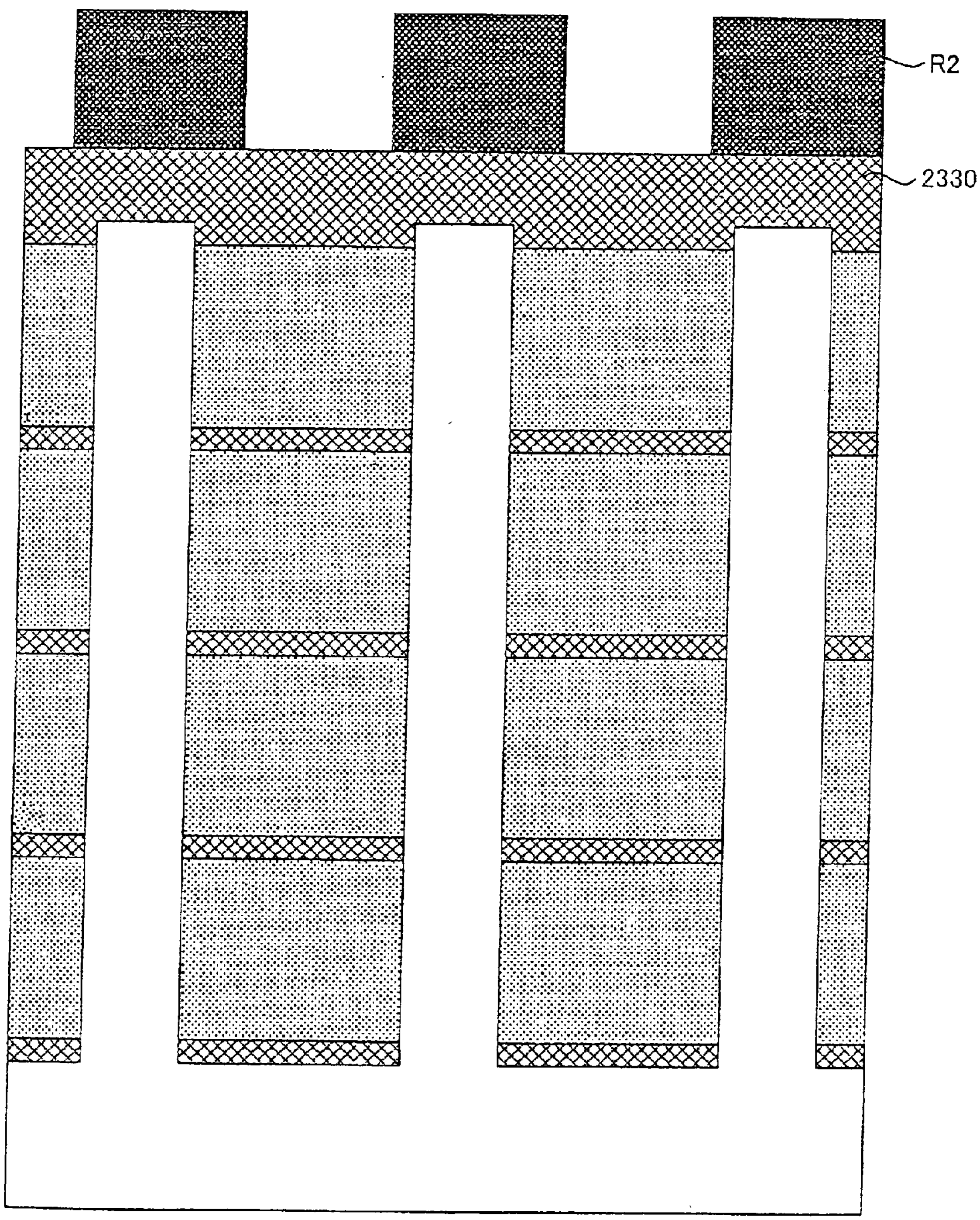

The thus formed island-like semiconductor layers 2110 are flattened to be flush with the silicon nitride film 2315 (FIGS. 556 and 577). The flattening may be carried out by isotropic or anisotropic etch-back, CMP, or a combination of various techniques.

Thereafter, a silicon nitride film 2330 is deposited as a fifth insulating film to a thickness of about 200 to 2,000 nm.

Figure 558:
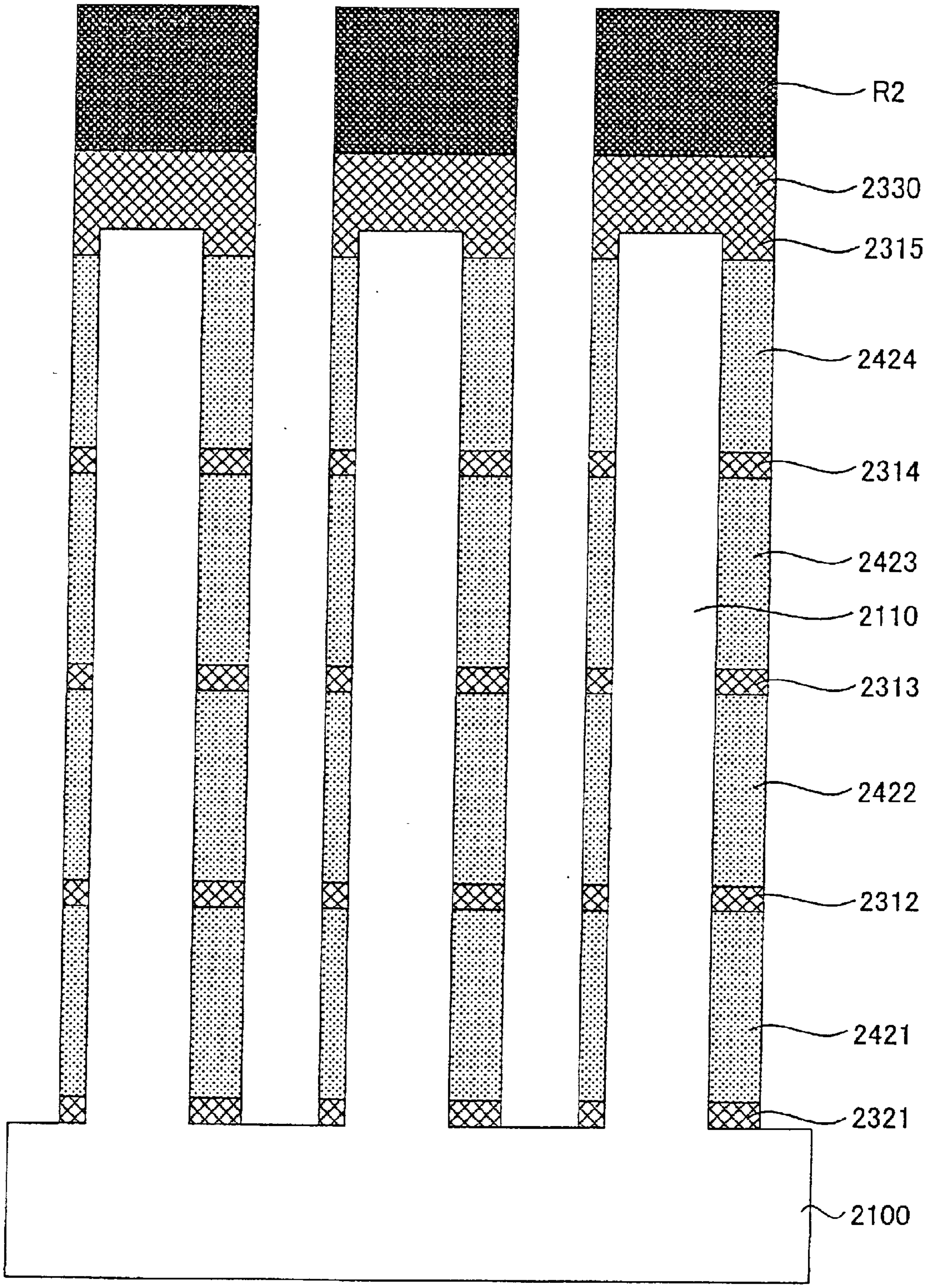
Figure 579:
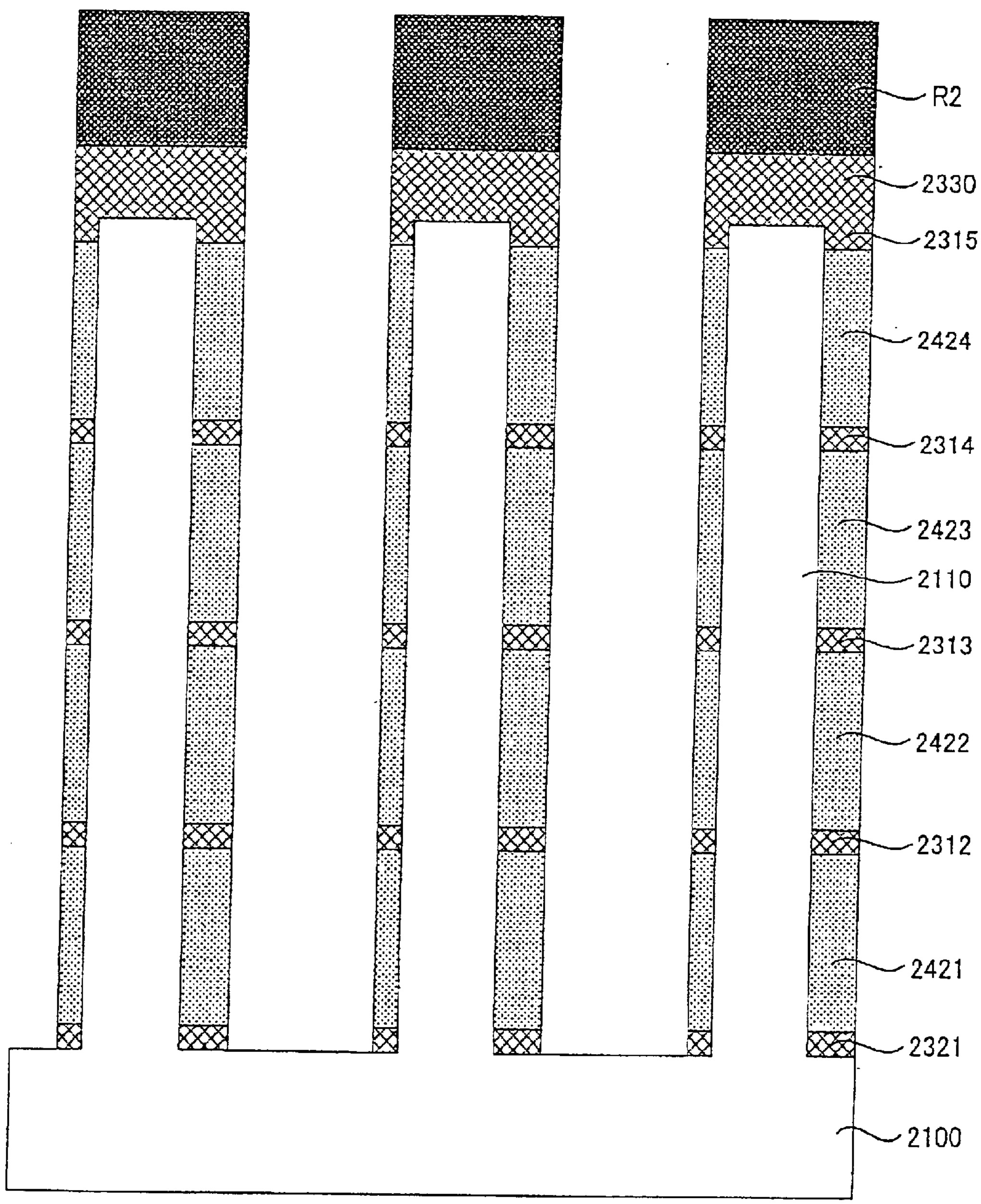

Then, using a resist film R2 patterned by a known photolithographic technique as a mask (FIGS. 557 and 578), reactive ion etching, for example, is performed to successively etch the silicon nitride film 2315, the silicon oxide film 2424, the silicon nitride film 2314, the silicon oxide film 2423, the silicon nitride film 2313, the silicon oxide film 2422, the silicon nitride film 2312, the silicon oxide film 2421 and the silicon nitride film 2321, thereby exposing the P-type silicon substrate 2100 (FIGS. 558 and 579). At this time, the silicon nitride film 2321 may remain.

After the resist film R2 is removed, the silicon oxide films 2421, 2422, 2423 and 2424 (the third insulating films) are removed by, for example, isotropic etching to expose the sides of the island-like semiconductor layers 2110.

Figure 559:
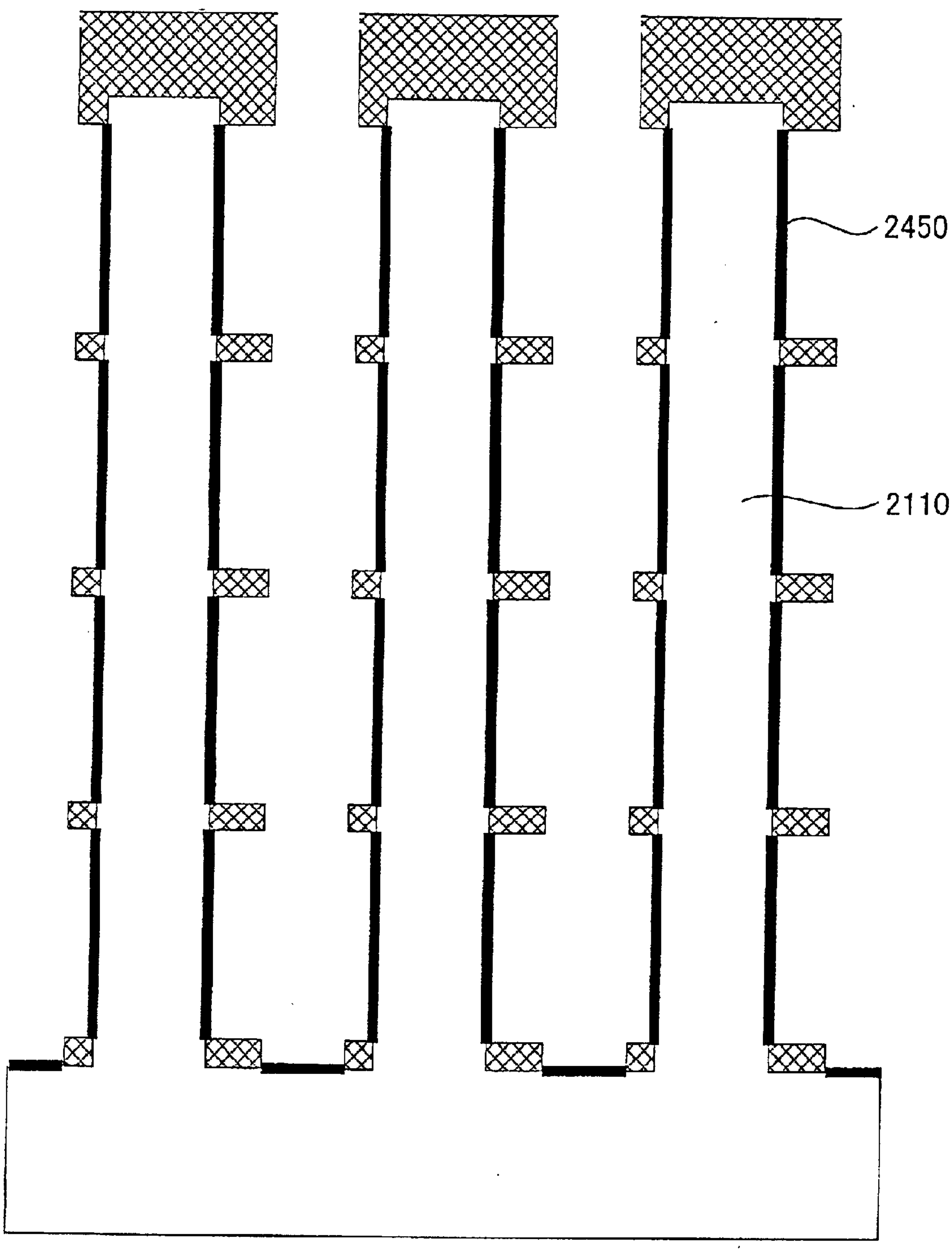
Figure 580:
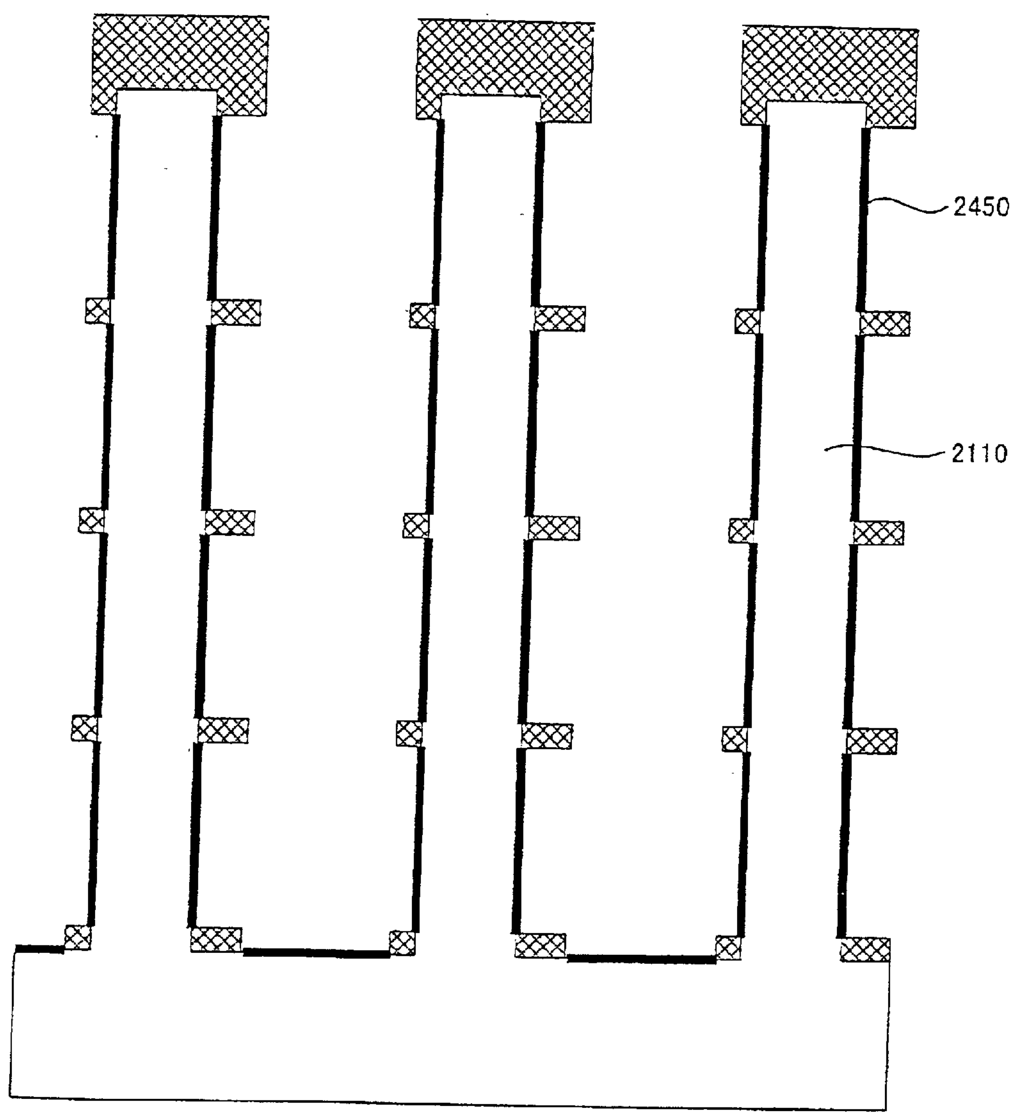

Then, the periphery of each island-like semiconductor layer 2110 is oxidized to form, for example, a thermally oxidized film 2450 of about 10 to 100 nm thick as a ninth insulating film (FIGS. 559 and 580).

Next, the thermally oxidized film (the ninth insulating film) 2450 is etched away from the periphery of each island-like semiconductor layer 2110, for example, by isotropic etching. Then, as required, channel ion implantation is carried out into the sidewall of the island semiconductor layer 2110 by slant ion implantation. For example, the ion implantation may be performed at an implantation energy of 5 to 100 keV at a boron dose of about $1\times10^{11}$ to $1\times10^{13}/cm^2$ at an angle of 5 to 45° with respect to the normal line of the surface of the substrate. Preferably the channel ion implantation is performed from various directions to the island-like semiconductor layers 2110 because a surface impurity concentration becomes more uniform. Alternatively, instead of the channel ion implantation, an oxide film containing boron may be deposited by CVD with a view to utilizing diffusion of boron from the oxide film. The impurity implantation from the surface of the island-like semiconductor layers 2110 may be carried out before the island-like semiconductor layers 2110 are covered with the thermally oxidized film 2450, or during the formation of the island-like semiconductor layers 2110. Alternatively, the impurities may be introduced to the silicon oxide films 2421, 2422, 2423 and 2424 in advance with a view to implanting the impurities in the island-like semiconductor layers 2110 by thermal treatment or the like before removing the silicon oxide films 2421, 2422, 2423 and 2424. Means for the implantation are not particularly limited so long as an impurity concentration distribution is almost equal over the island-like semiconductor layers 2110.

Figure 560:
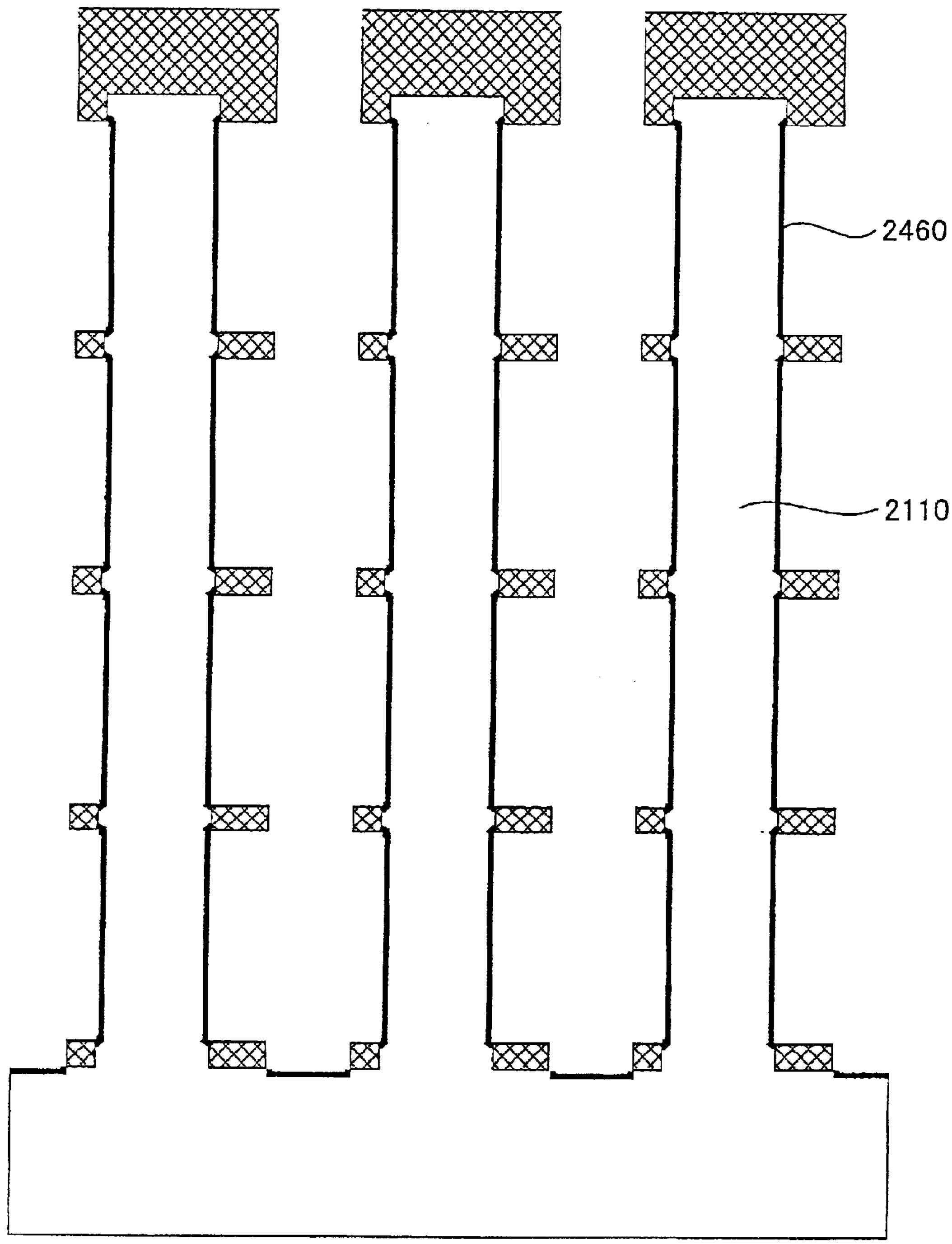
Figure 581:
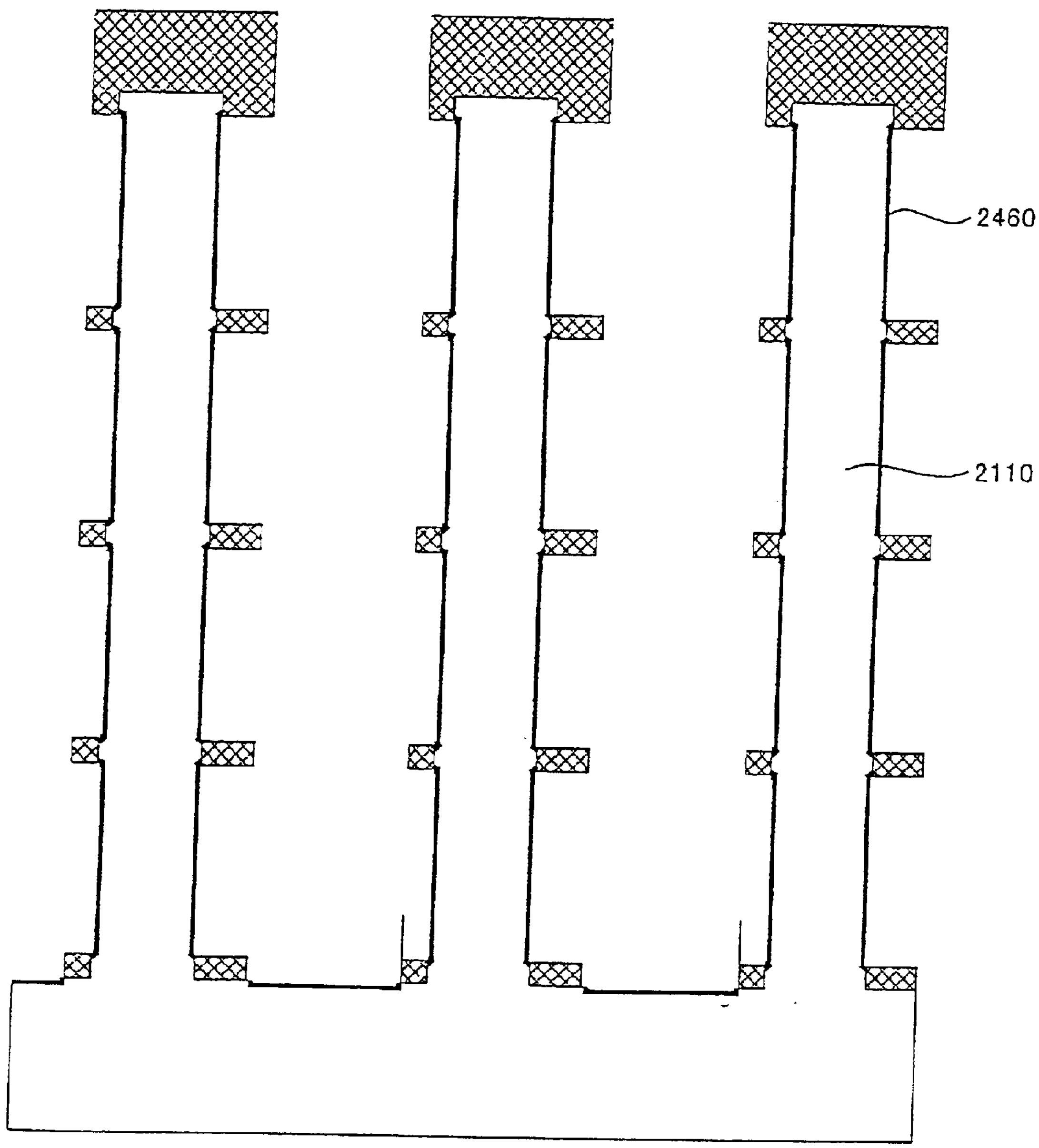

Subsequently, a silicon oxide film 2460, for example, is formed as a tenth insulating film to be a tunnel oxide film to a thickness of about 10 nm around each island-like semiconductor layer 2110, for example, by thermal oxidization (FIG. 560 and FIG. 581). The tunnel oxide film, however, may be formed of not only a thermally oxidized film but also a CVD oxide film or a nitrogen oxide film.

Figure 561:
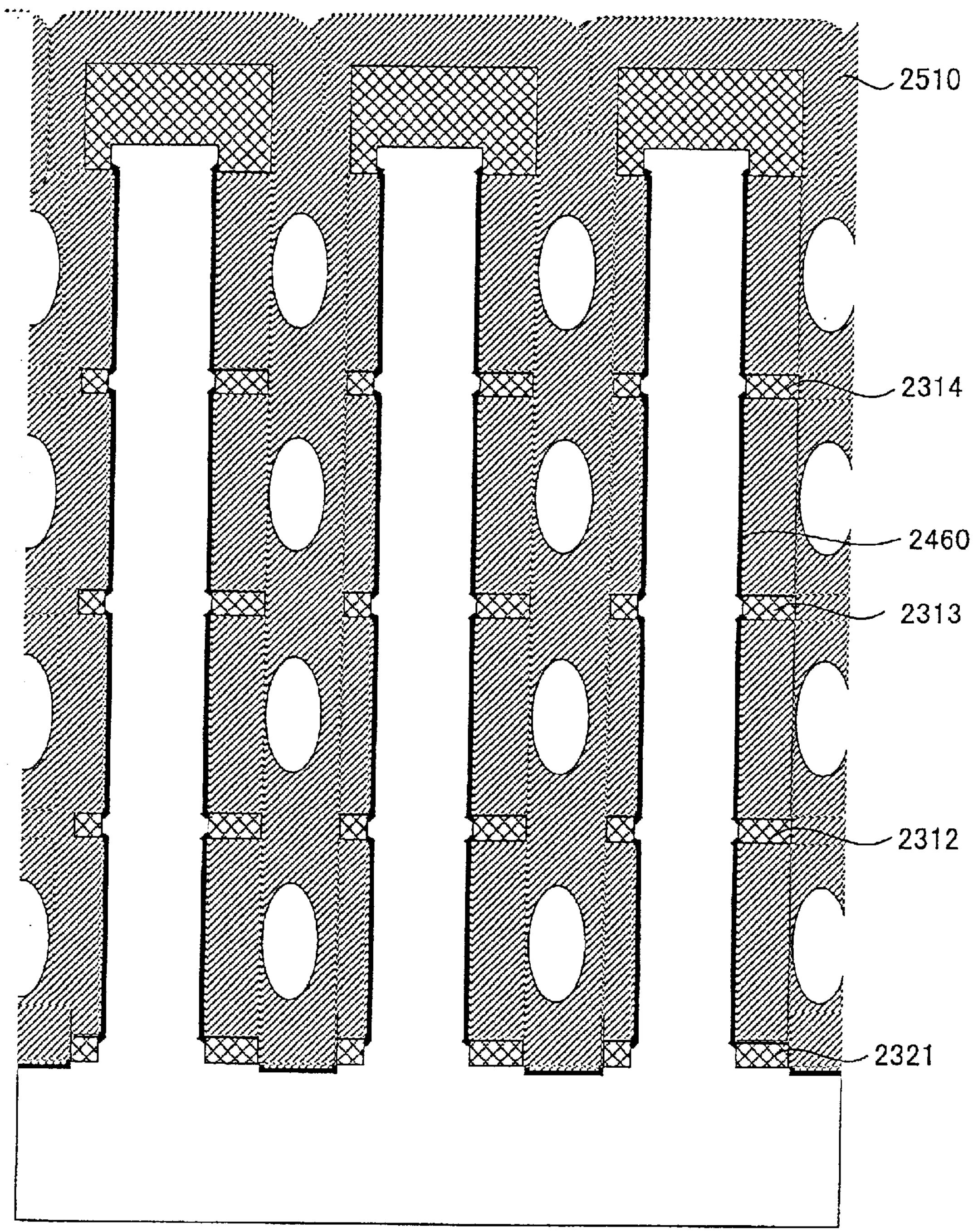
Figure 582:
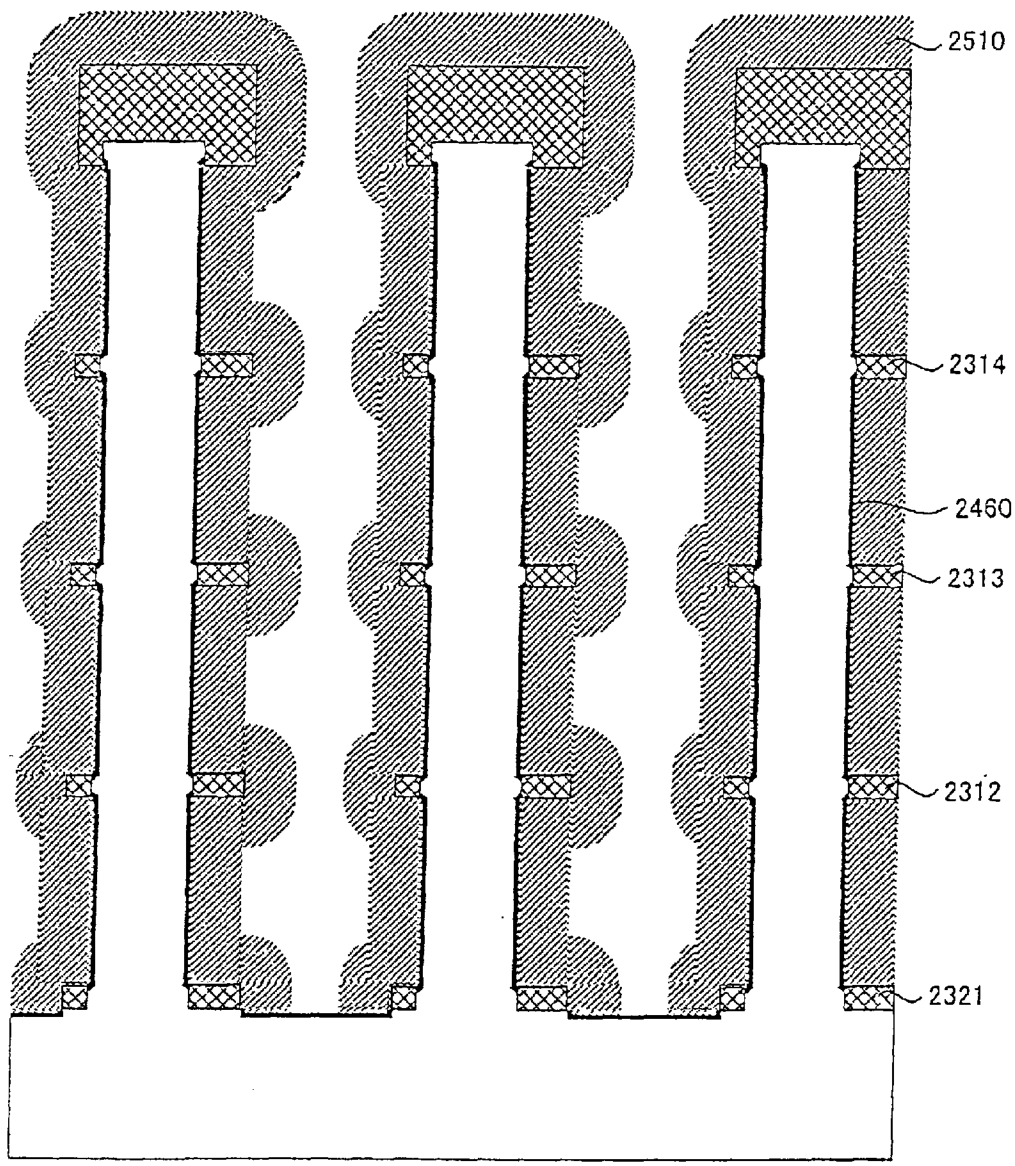

Subsequently, a polysilicon film 2510, for example, is deposited as a first conductive film to a thickness of about 50 to 200 nm (FIGS. 561 and 582).

Figure 562:
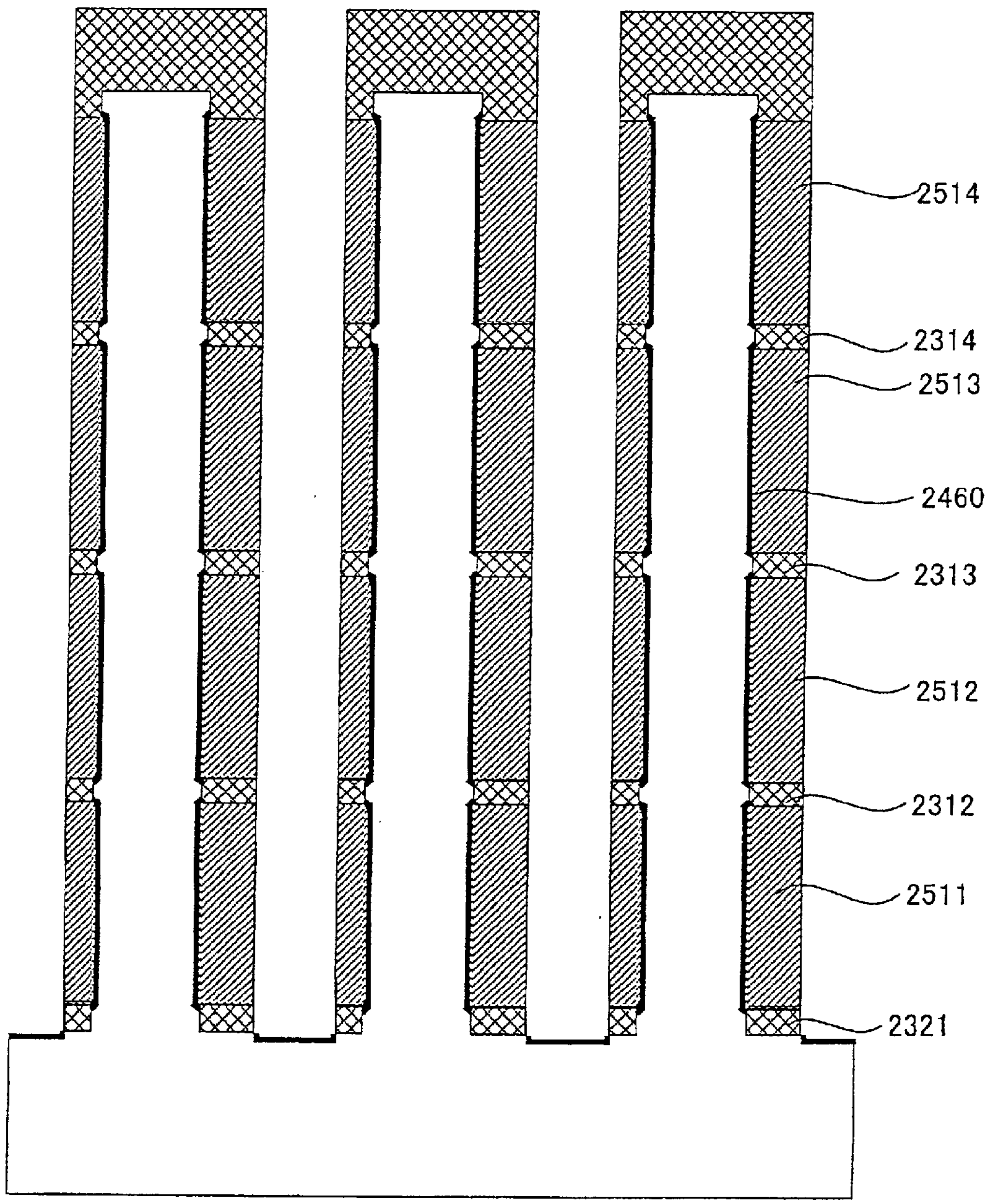
Figure 583:
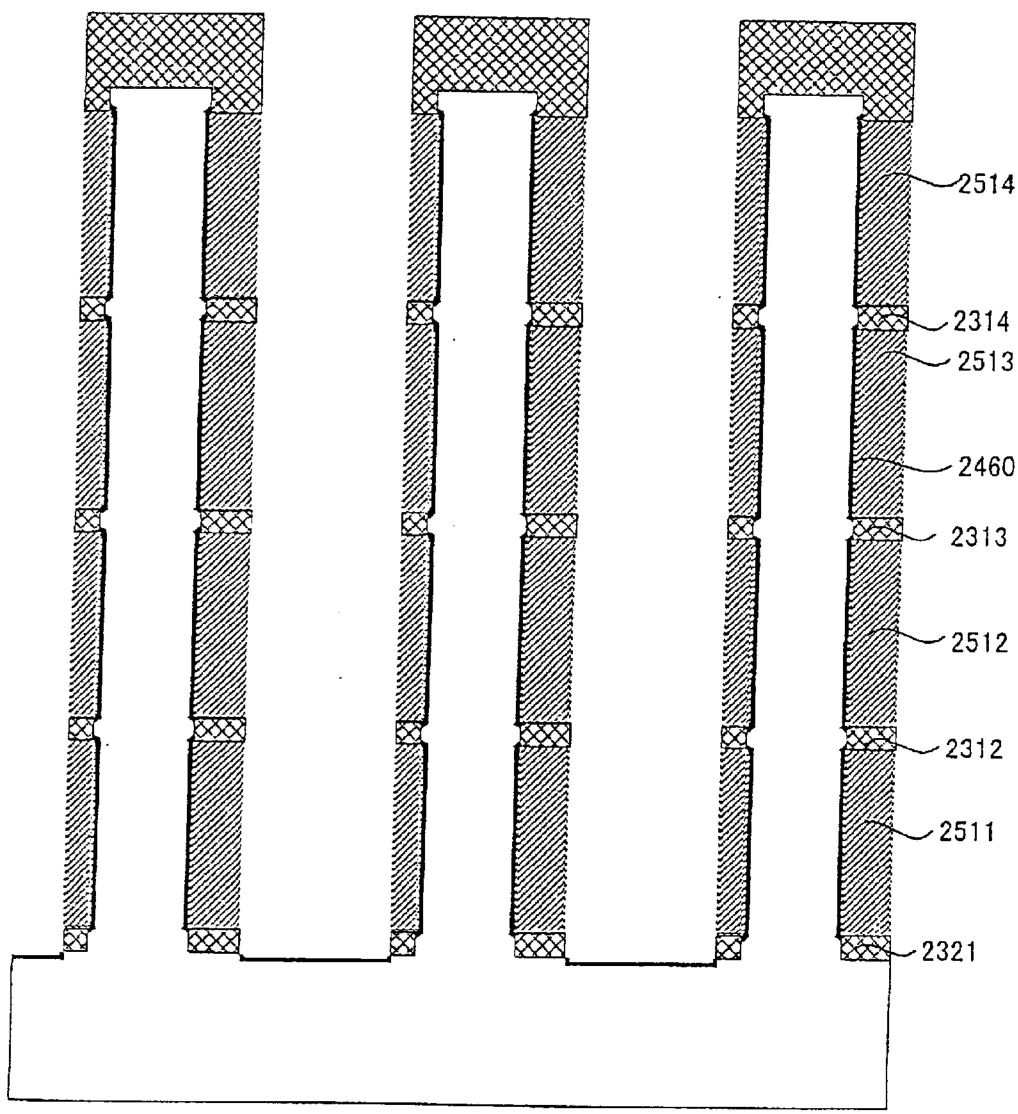

Using the silicon nitride films 2314, 2313 and 2312 (the second insulating films) as a mask, the polysilicon film 2510 is divided into polysilicon films 2511, 2512, 2513 and 2514, for example, by anisotropic etching (FIGS. 562 and 583).

Figure 563:
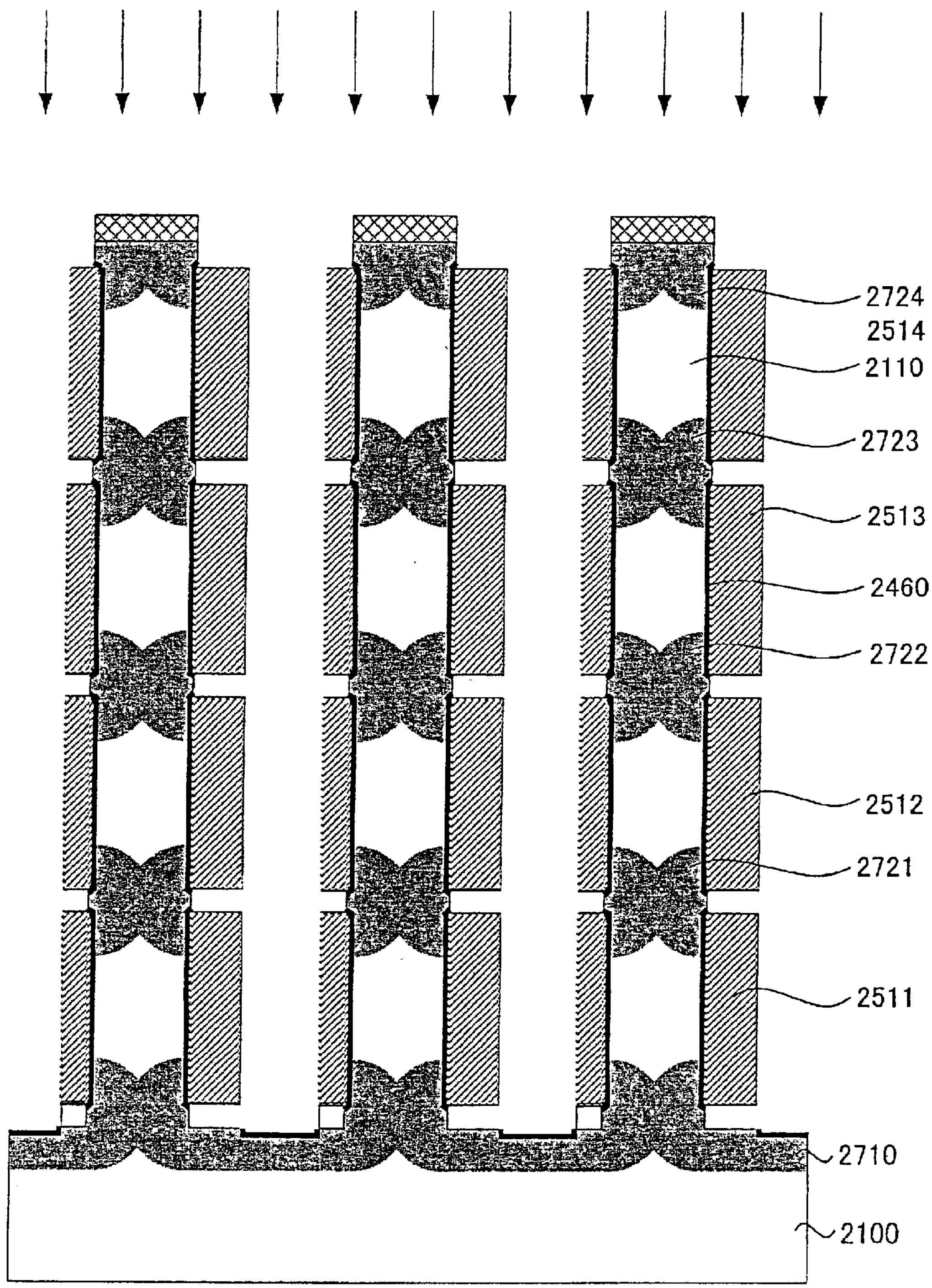
Figure 584:
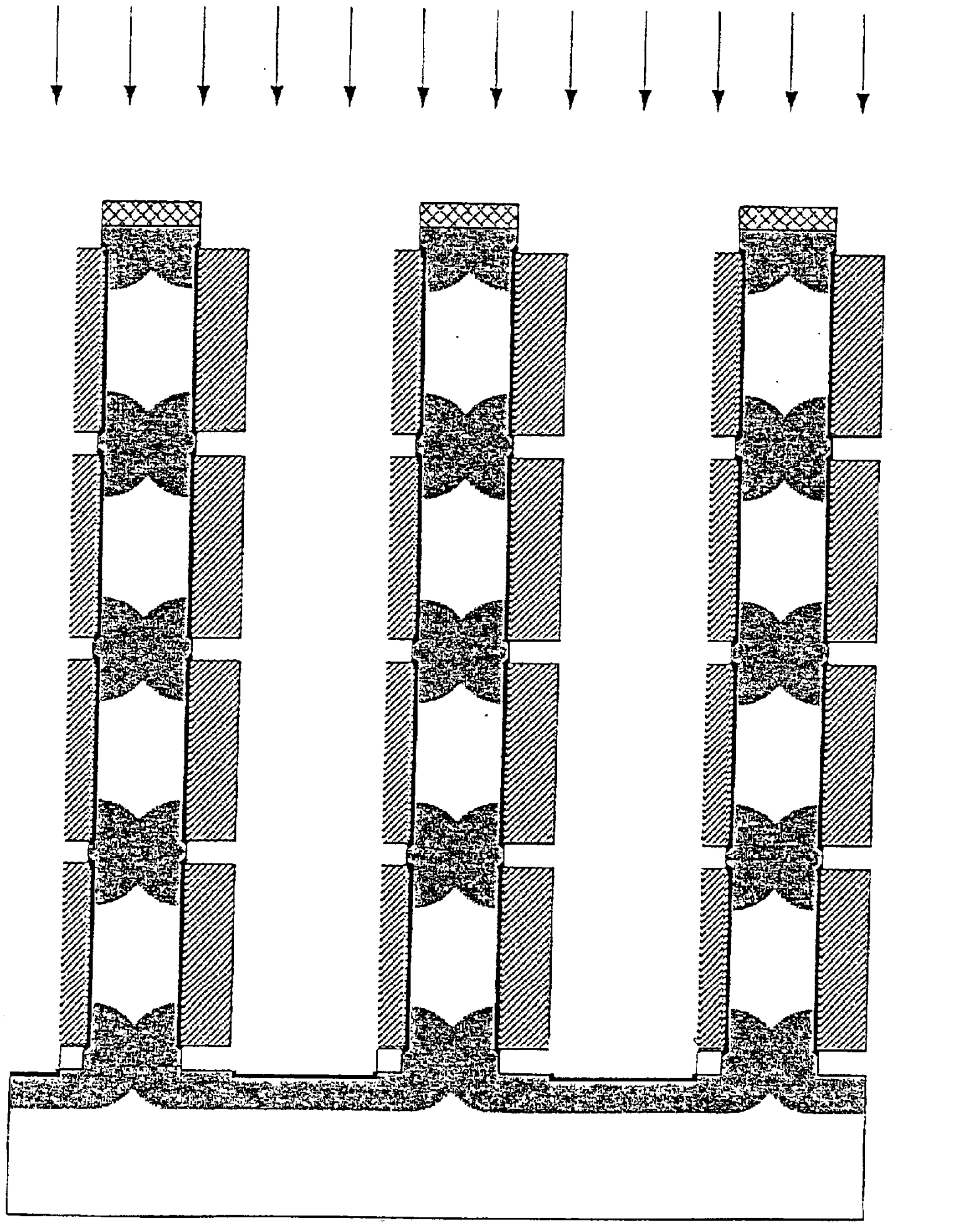

Then, the silicon nitride films 2312, 2313 and 2314 (the second insulating films) and the silicon nitride film 2321 (the fourth insulating film) are selectively removed and impurity introduction is carried out to the island-like semiconductor layer 2110 and the semiconductor substrate 2100 in self-alignment with the polysilicon films 2511, 2512, 2513 and 2514. For example, N-type impurity diffusion layers 2710 to 2724 are formed at an arsenic concentration of about $1\times10^{18}$ to $1\times10^{21}/cm^3$, for example, by solid or vapor phase diffusion process. At this time, the impurity diffusion layer 2710 to be a first wiring layer may be adjusted about its impurity concentration by ion implantation (FIGS. 563 and 584). For example, the ion implantation may be carried out at an implantation energy of 5 to 100 keV at a phosphorus dose of about $1\times10^{13}$ to $1\times10^{15}/cm^2$ and at an angle of about 0 to 7° with respect to the normal line of the surface of the substrate.

Figure 564:
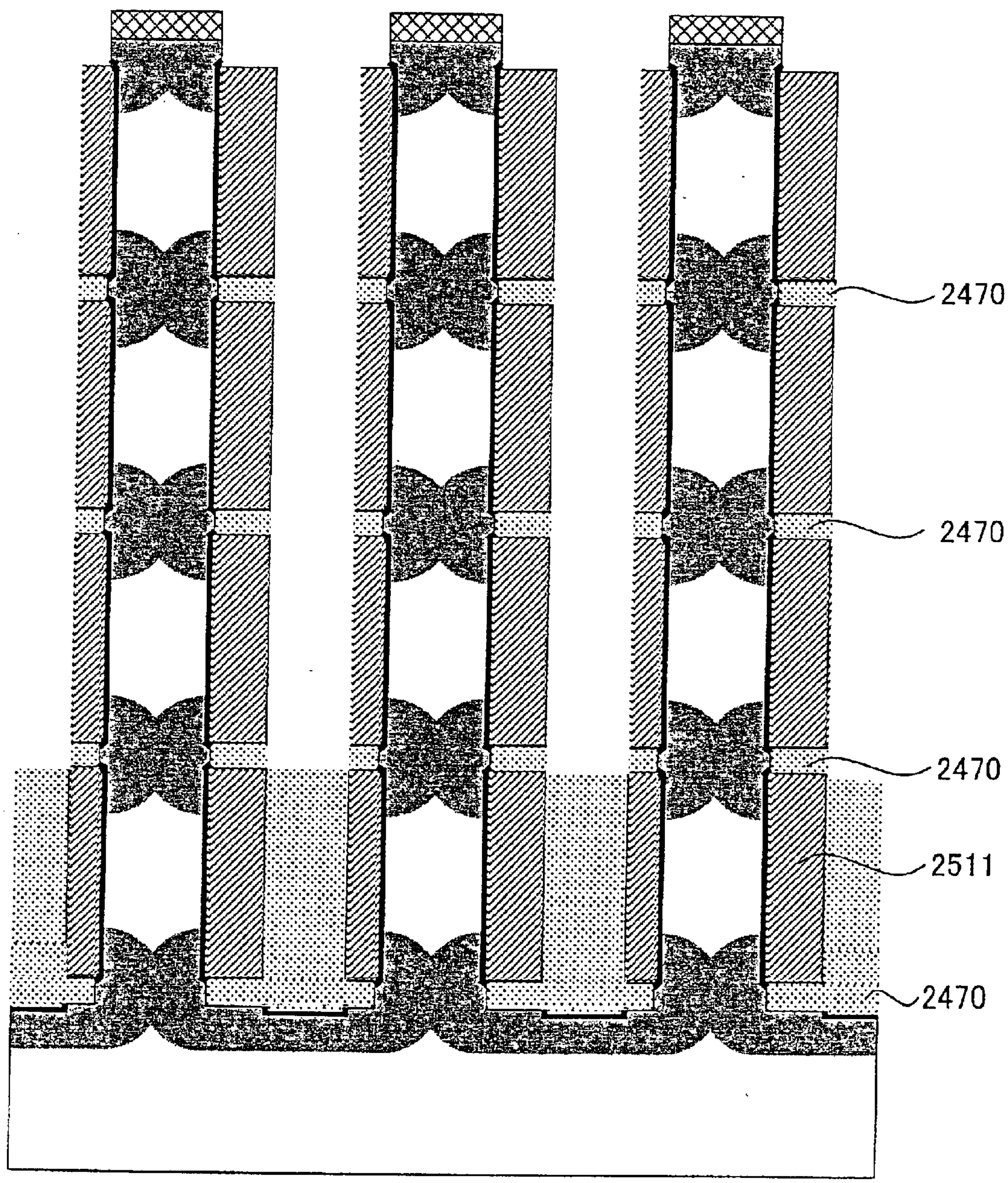
Figure 585:
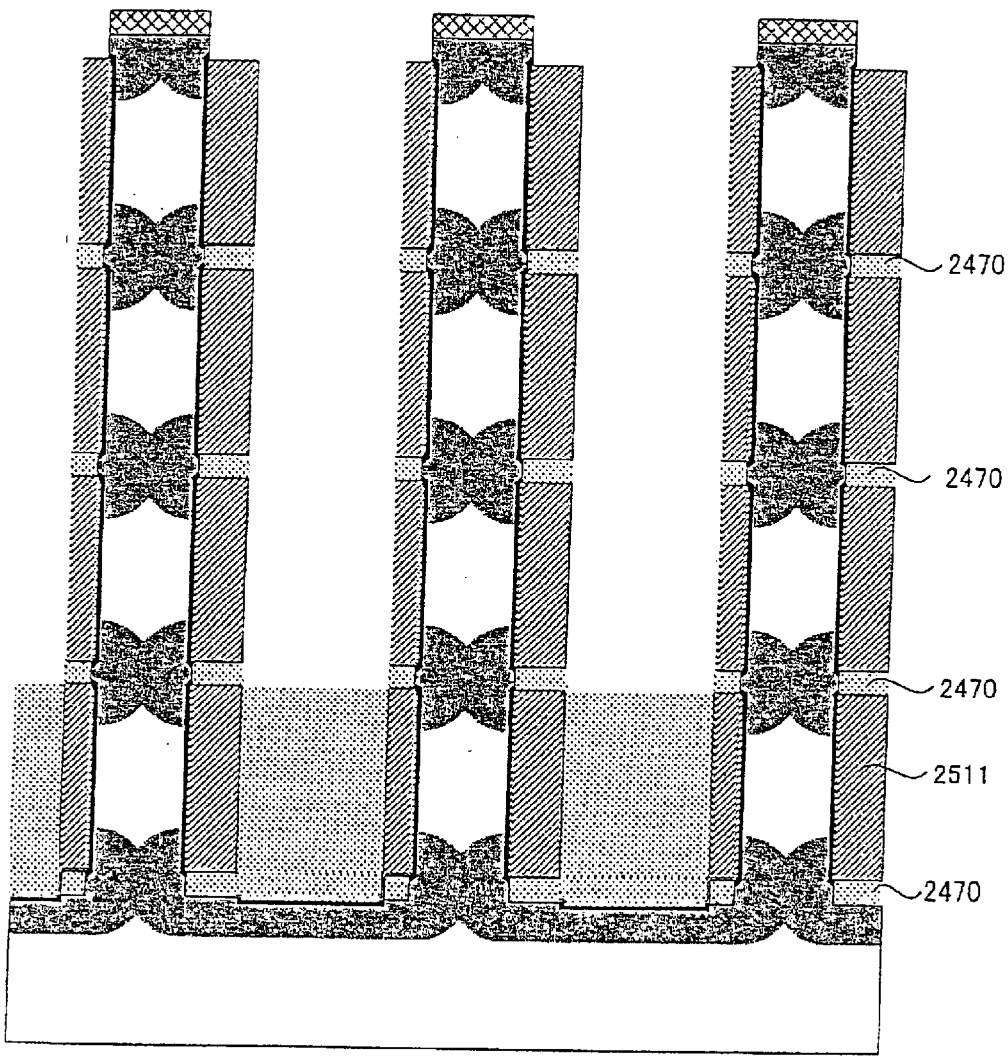

Subsequently, a silicon oxide film 2470, for example, is deposited as an eleventh insulating film to a thickness of about 50 to 500 nm. The silicon oxide film 2470 is buried in the third trench 2230 by anisotropic etching such that the polysilicon film 2511 (the first conductive film) is buried (FIGS. 564 and 585). At this time, the silicon oxide film 2470 is buried in a gap between the polysilicon films 2511 and 2512, a gap between the polysilicon films 2512 and 2513 and a gap between the polysilicon films 2513 and 2514.

Figure 565:
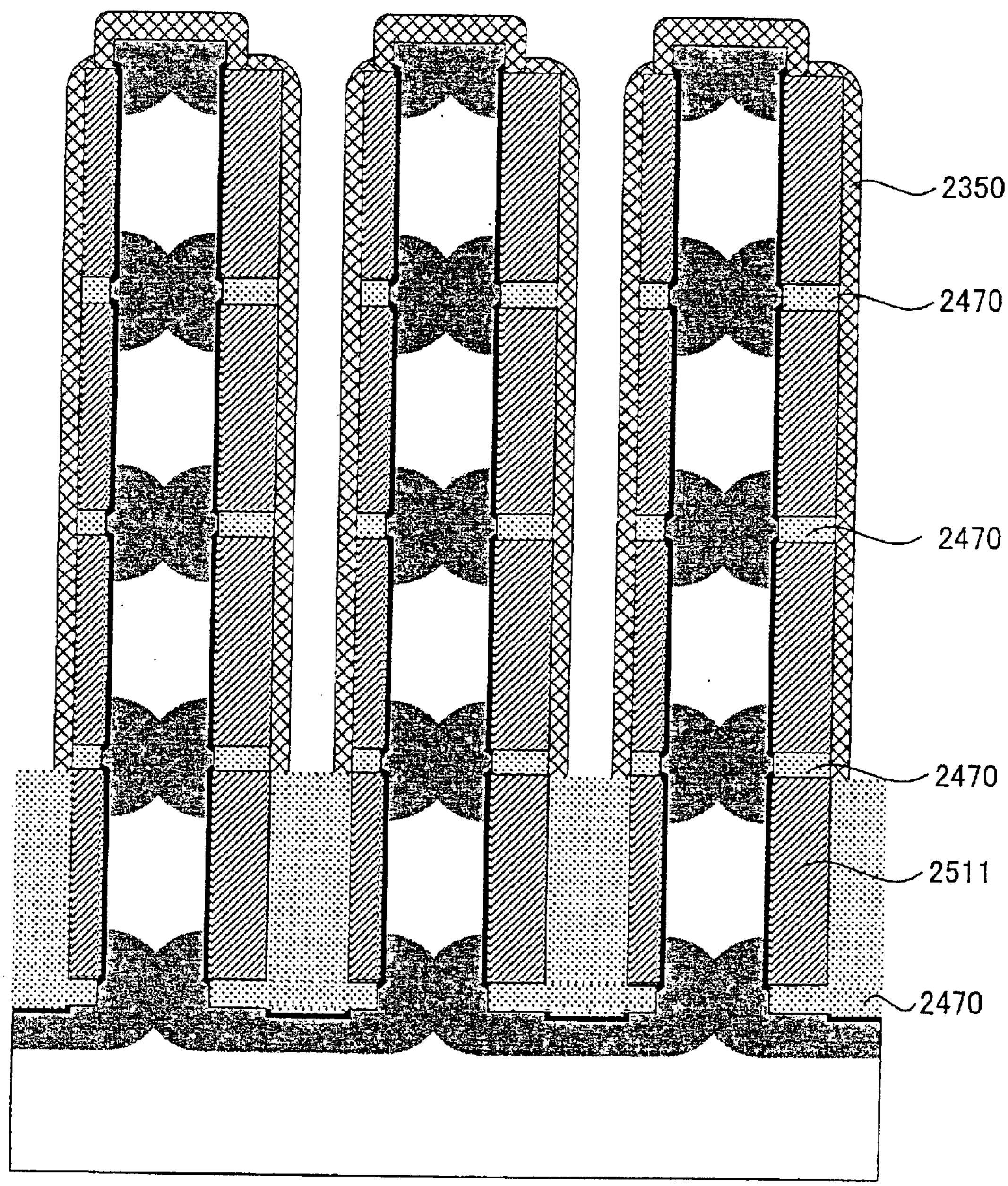
Figure 586:
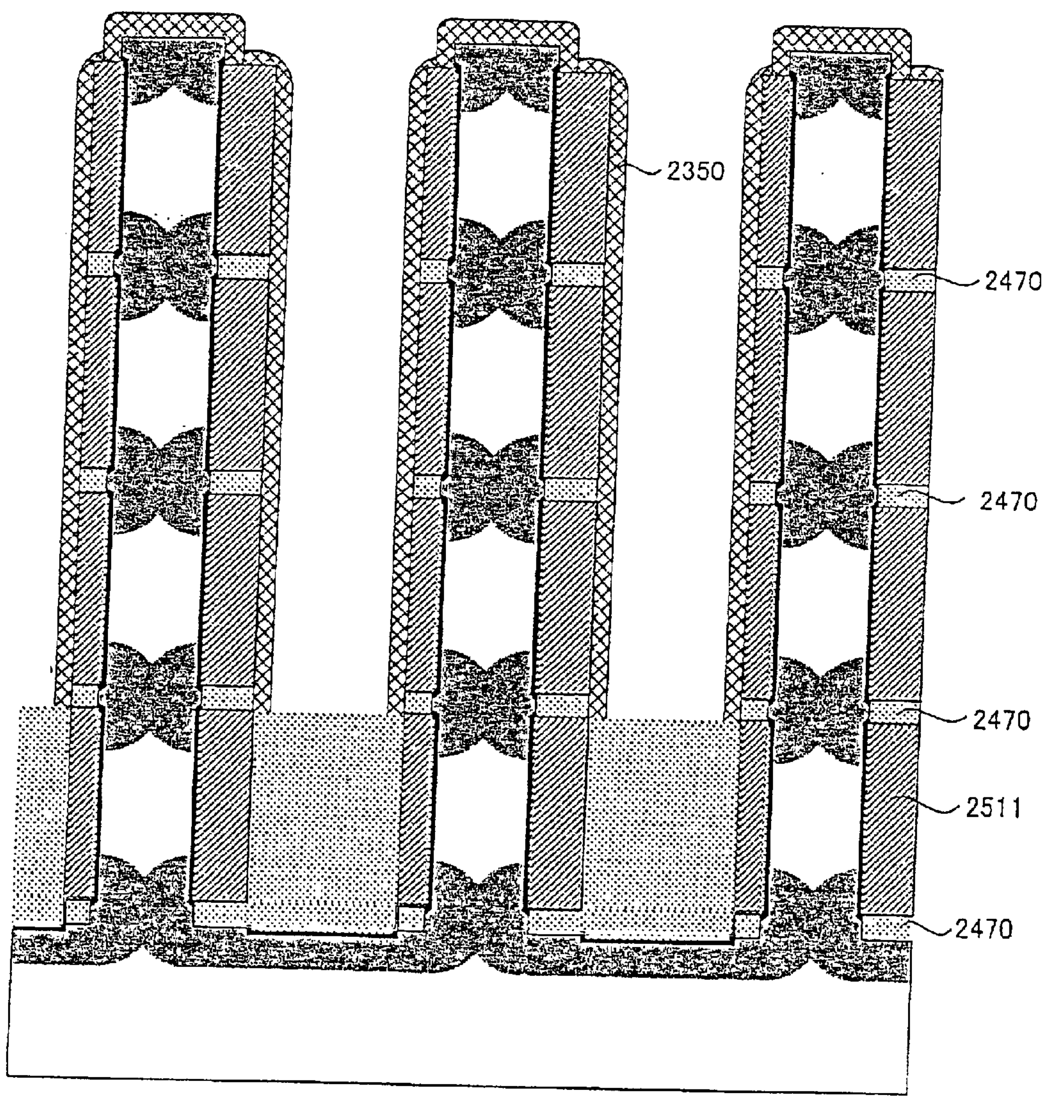

Then, a silicon nitride film 2350, for example, is deposited to a thickness of 5 to 50 nm as a twelfth insulating film on the surfaces of the polysilicon films 2512 to 2514 (the first conductive films) and the silicon oxide film 2470 (the eleventh insulating film) which are located on the inner wall of the third trench 2230. The silicon nitride film 2350 is anisotropically etched back into the form of a sidewall spacer (FIGS. 565 and 586).

Then, the silicon oxide film 2470 is etched back, for example, by isotropic etching to such a degree that the side of the polysilicon film 2511 (the first conductive film) is exposed. Then, a polysilicon film 2521, for example, is deposited to a thickness of 15 to 150 nm as a second conductive film.

The polysilicon film 2521 is etched back, for example, by anisotropic etching. Subsequently, the silicon oxide film 2470 (the eleventh insulating film) and the P-type silicon substrate 2100 are sequentially etched to form a second trench 2200 in the P-type silicon substrate 2100 in self-alignment with the polysilicon film 2521 (the second conductive film), thereby separating the impurity diffusion layer 2710. That is, a separation portion of the first wiring layer is formed in self-alignment with a separation portion of the second conductive film.

Figure 566:
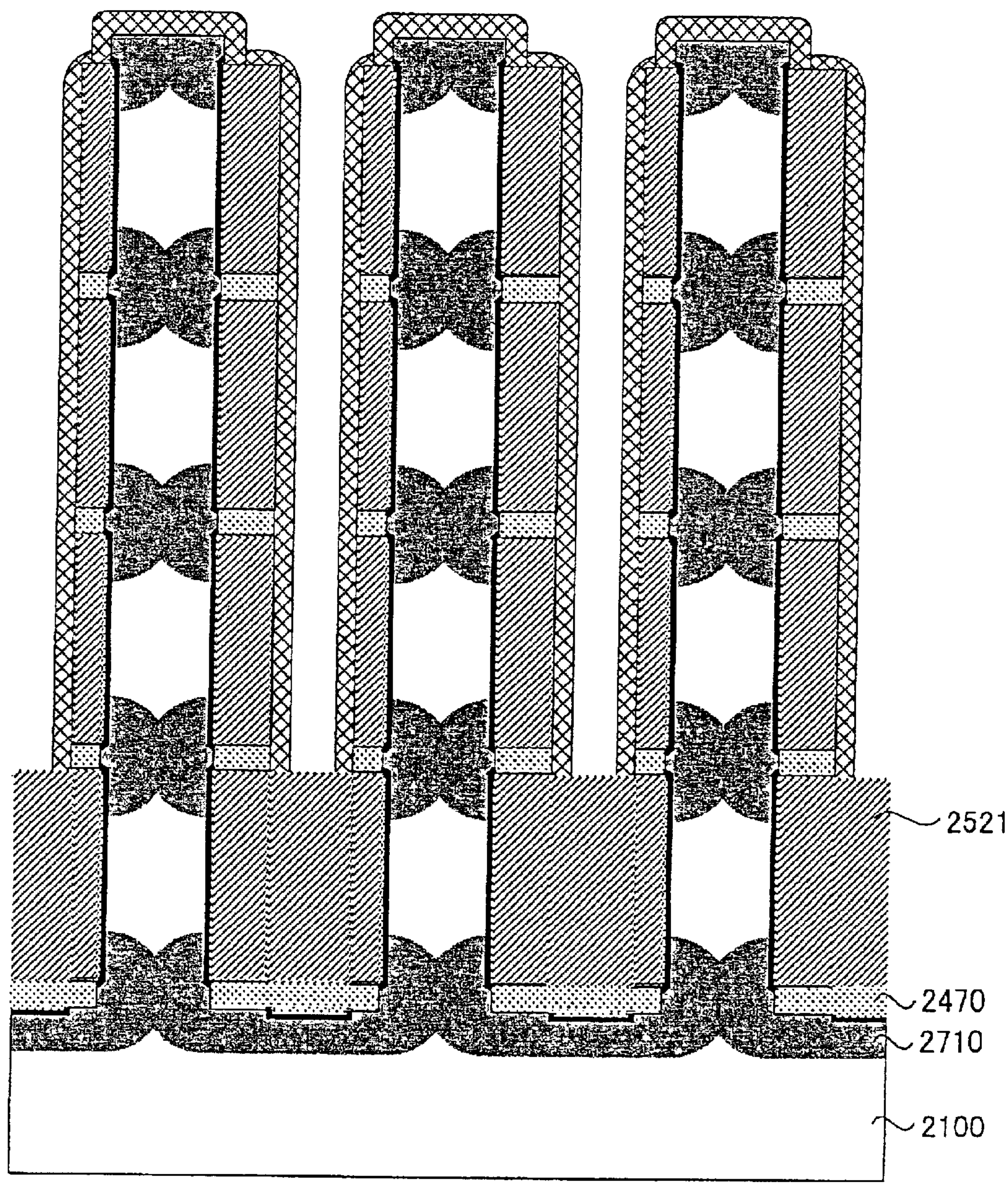
Figure 587:
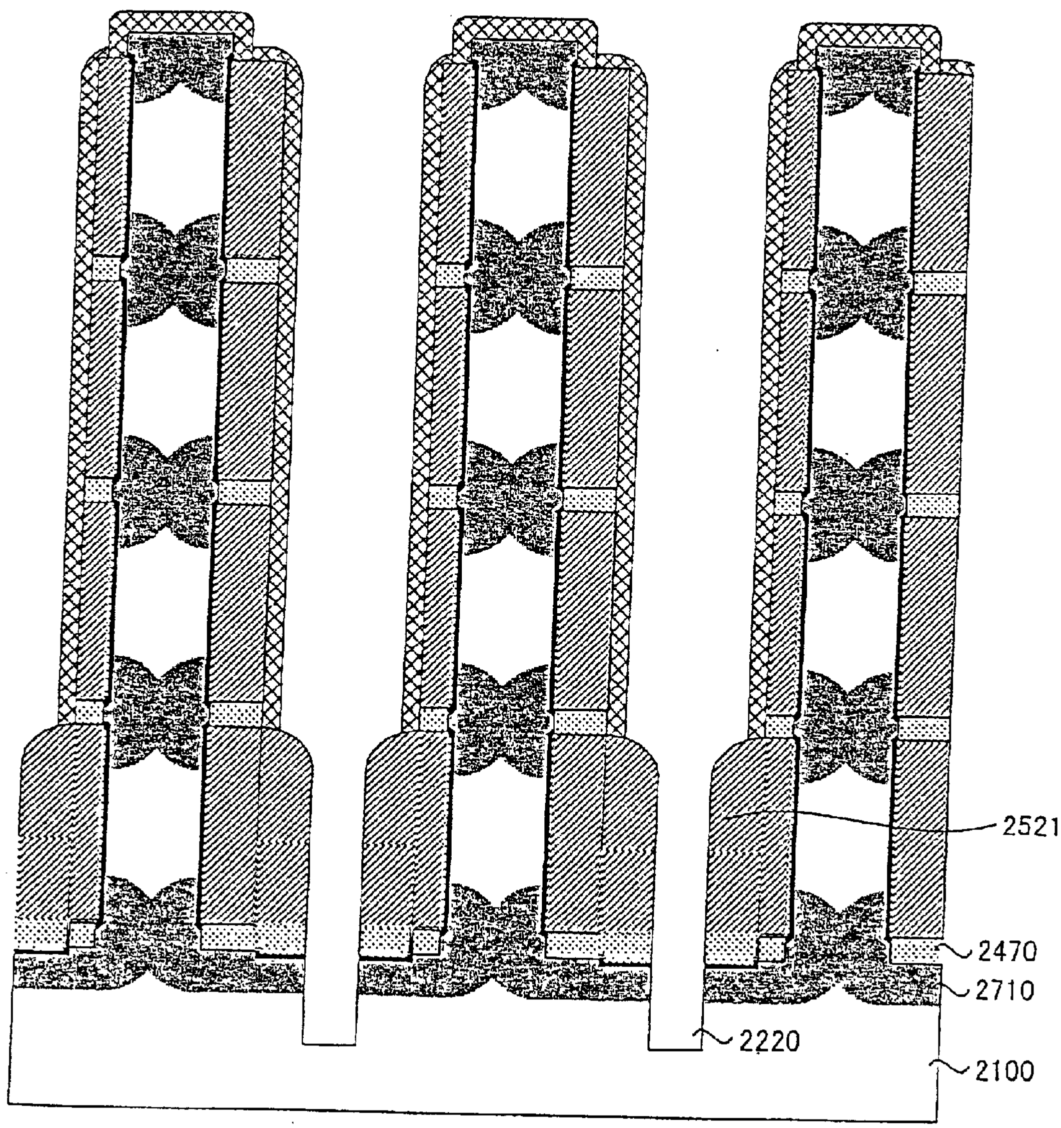

Subsequently, the polysilicon film 2521 is etched back to such a degree that the polysilicon film 2521 is able to contact the polysilicon film 2511 to form a selection gate (FIGS. 566 and 587). At this time, by setting the intervals between the island-like semiconductor layers 2110 in a direction of A-A' in FIG. 1 to a predetermined value or smaller, the polysilicon film 2521 is formed into a second wiring layer to be a selection gate line continuous in the direction A-A' without need to use a masking process.

Then, a silicon oxide film 2471, for example, is deposited as an eleventh insulating film to a thickness of about 50 to 500 nm. The silicon oxide film 2471 is buried in the third trench 2230 by anisotropic or isotropic etching such that the polysilicon film 2521 is embedded. At this time, the depth of the buried silicon oxide film 2471 is so controlled that the polysilicon film 2512 (the second conductive film) can be exposed later.

Subsequently, the sidewall spacer made of the silicon nitride film 2350 is removed by isotropic etching and an interlayer insulating film 2612 is formed on exposed surfaces of the polysilicon films 2512 to 2514 (the first conductive films). This interlayer insulating film 2612 may be formed of an ONO film, for example. The ONO film may be formed in the same manner as in Production example 1.

Figure 567:
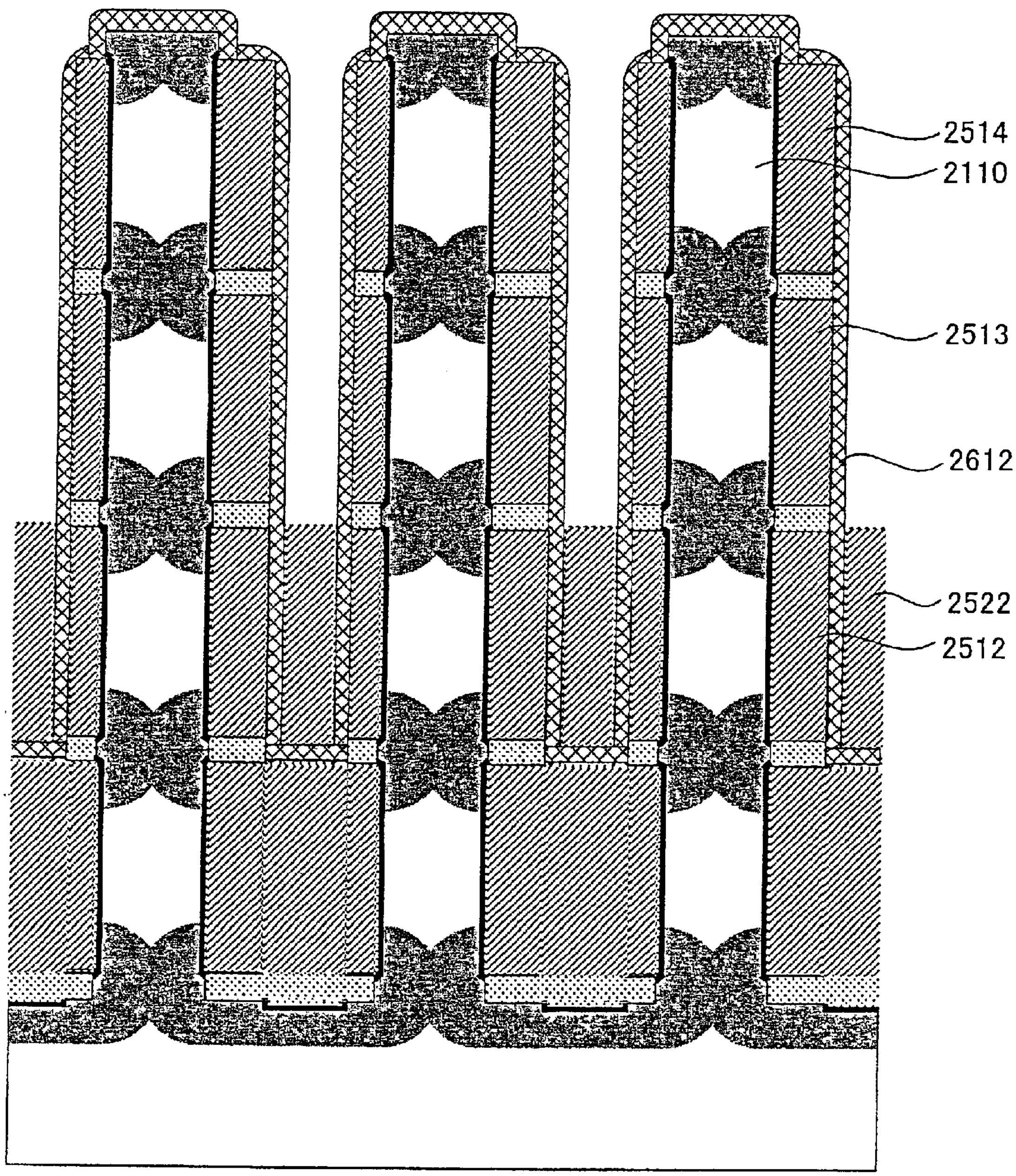
Figure 588:
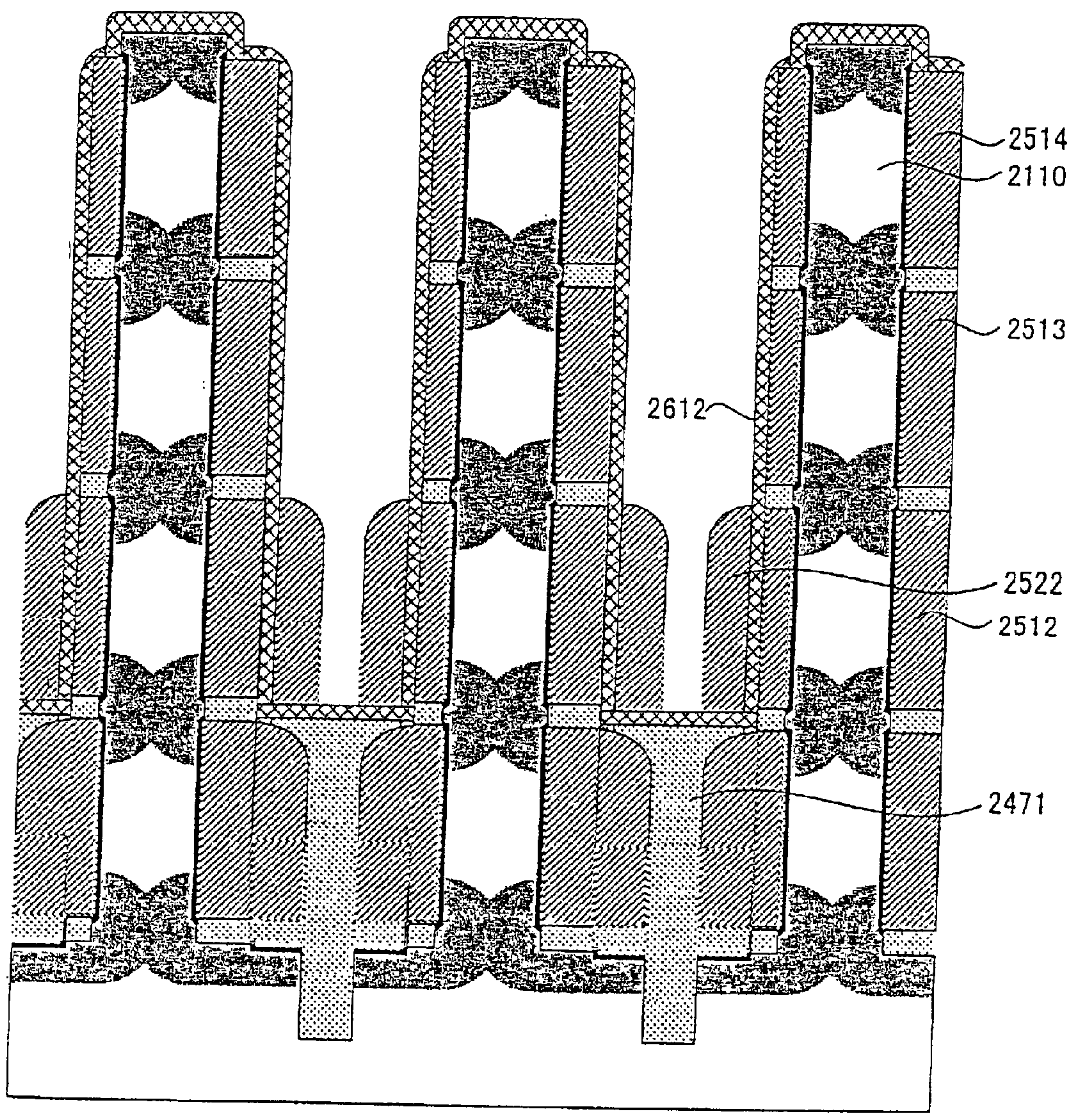

Then, in the same manner, a polysilicon film (a second conductive film) 2522 is deposited to a thickness of 15 to 150 nm and etched back so that the polysilicon film 2522 is disposed on the side of the polysilicon film (the first conductive film) 2512 with intervention of the interlayer insulating film 2612. At this time, by setting the intervals between the island-like semiconductor layers 2110 in the direction of A-A' in FIG. 1 to a predetermined value or smaller, the polysilicon film 2522 is formed into a third wiring layer to be a control gate line continuous in the direction of A-A' without need to use a masking process (FIGS. 567 and 588).

Figure 568:
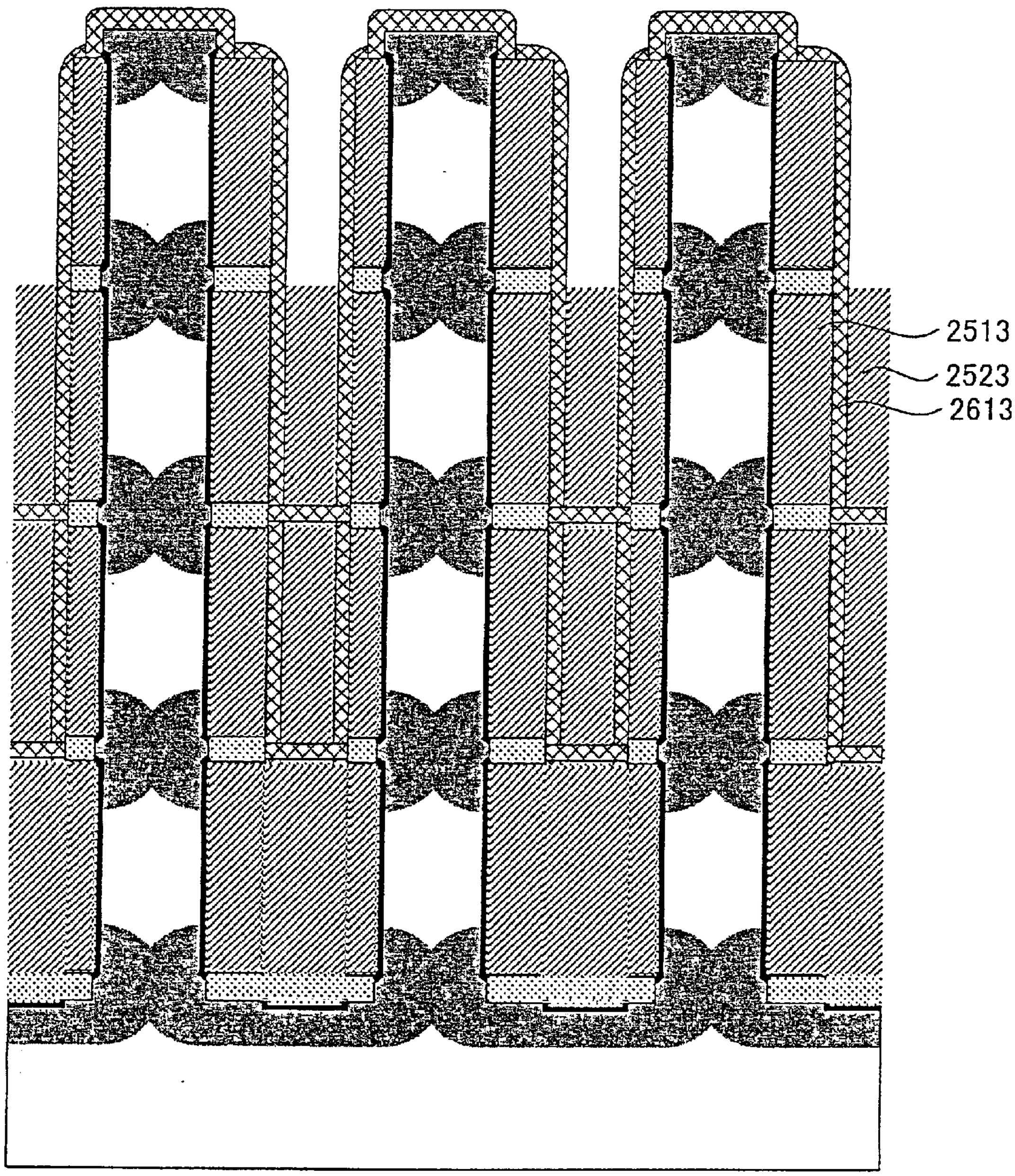
Figure 569:
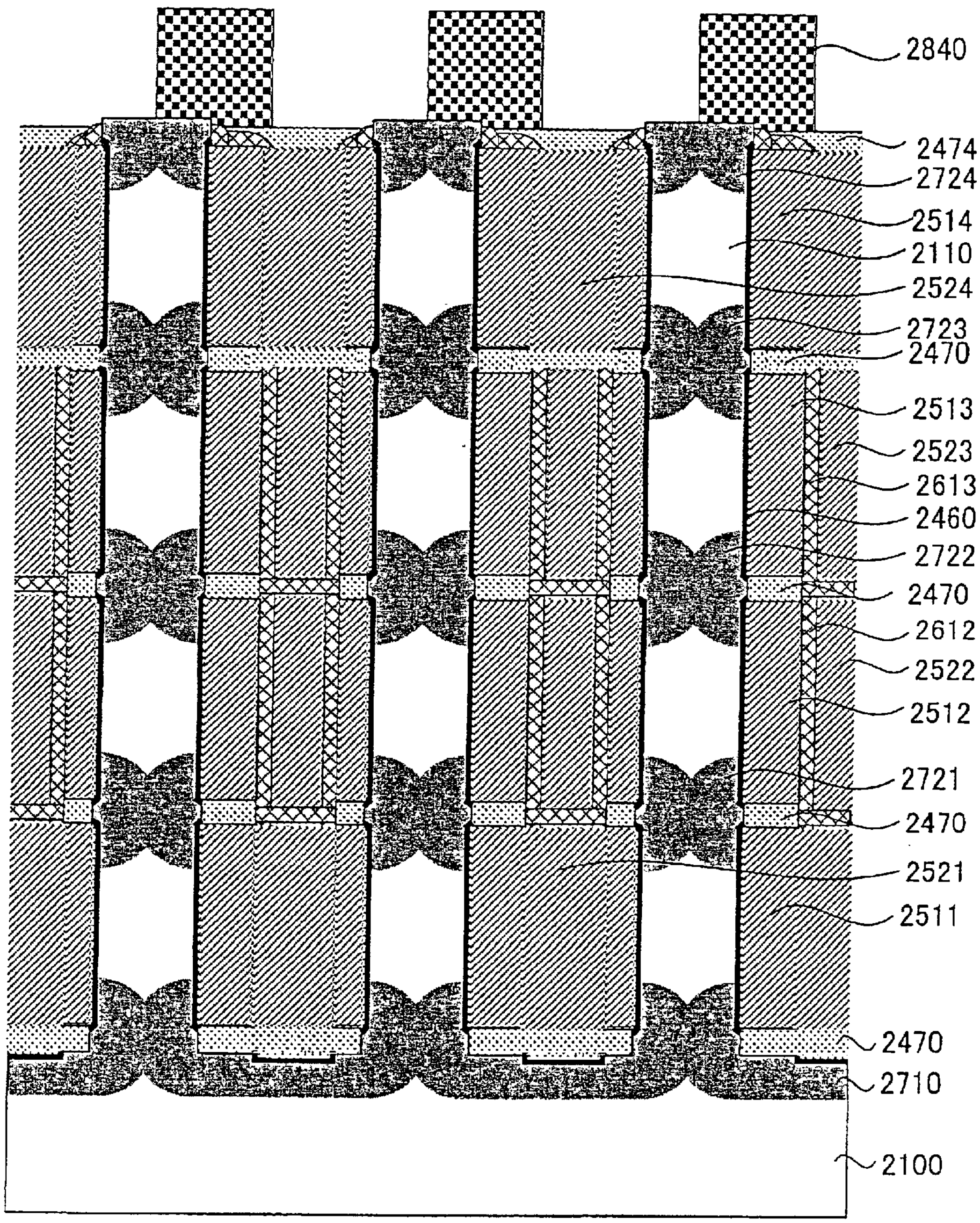
Figure 570:
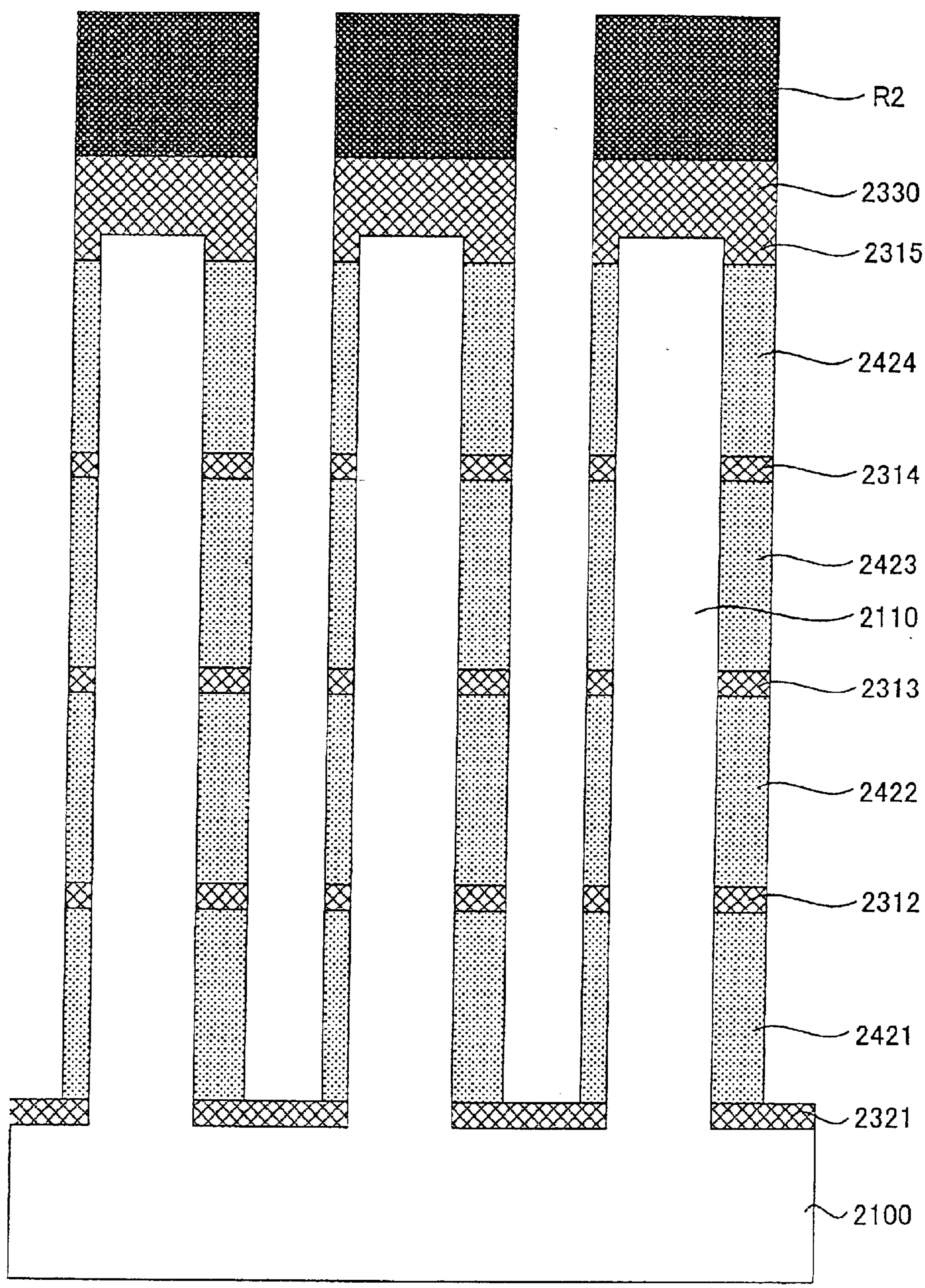
Figure 571:
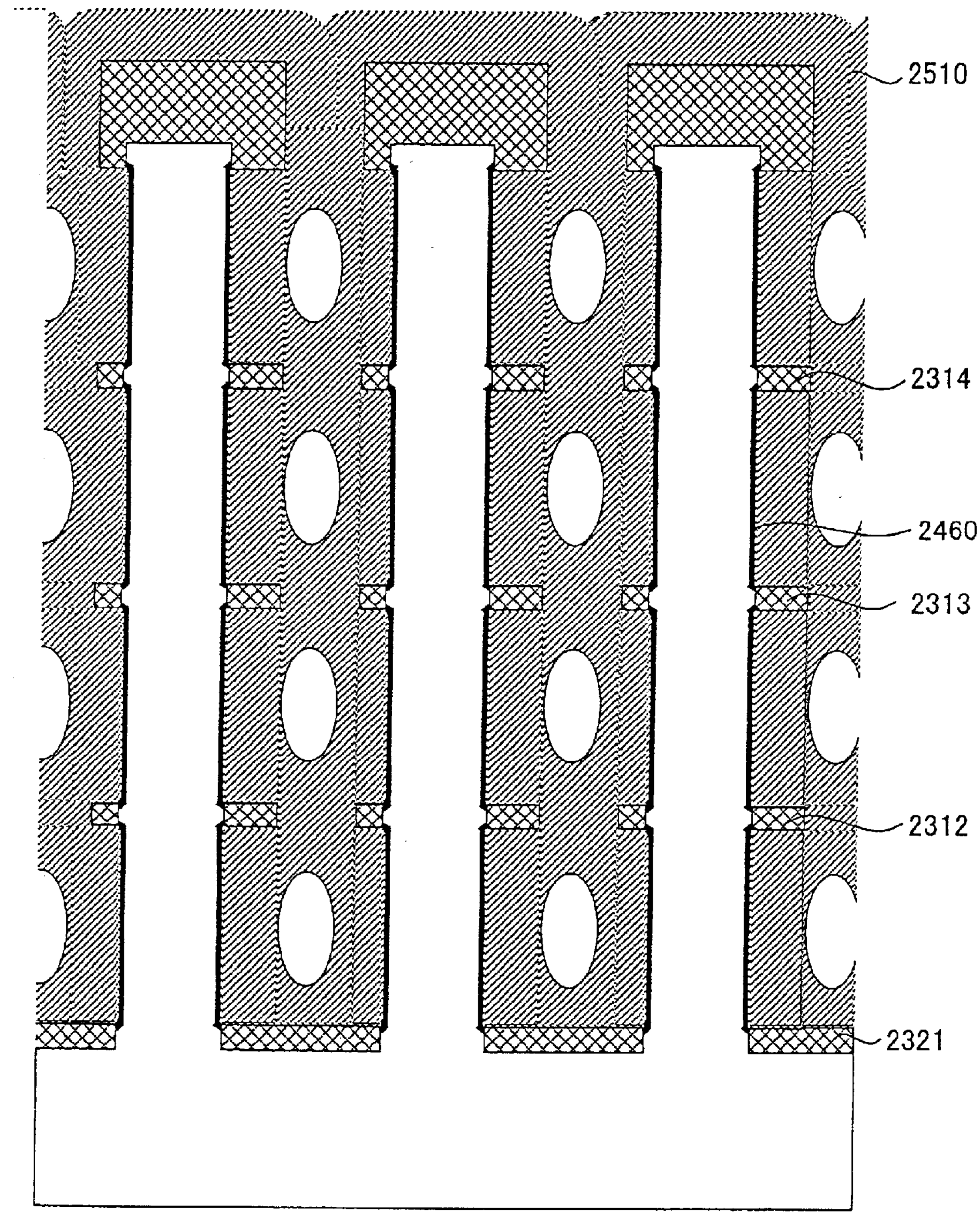
Figure 572:
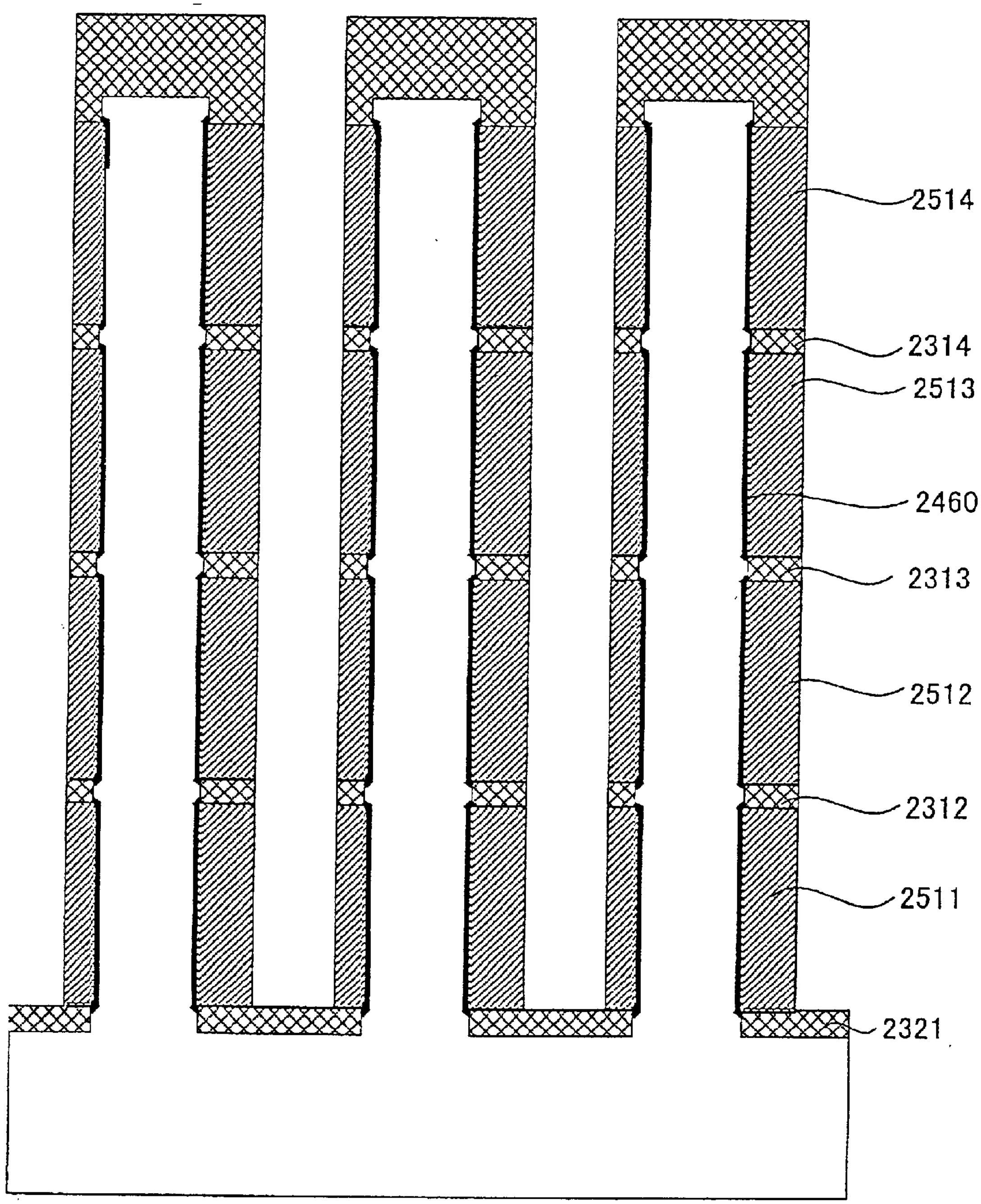
Figure 573:
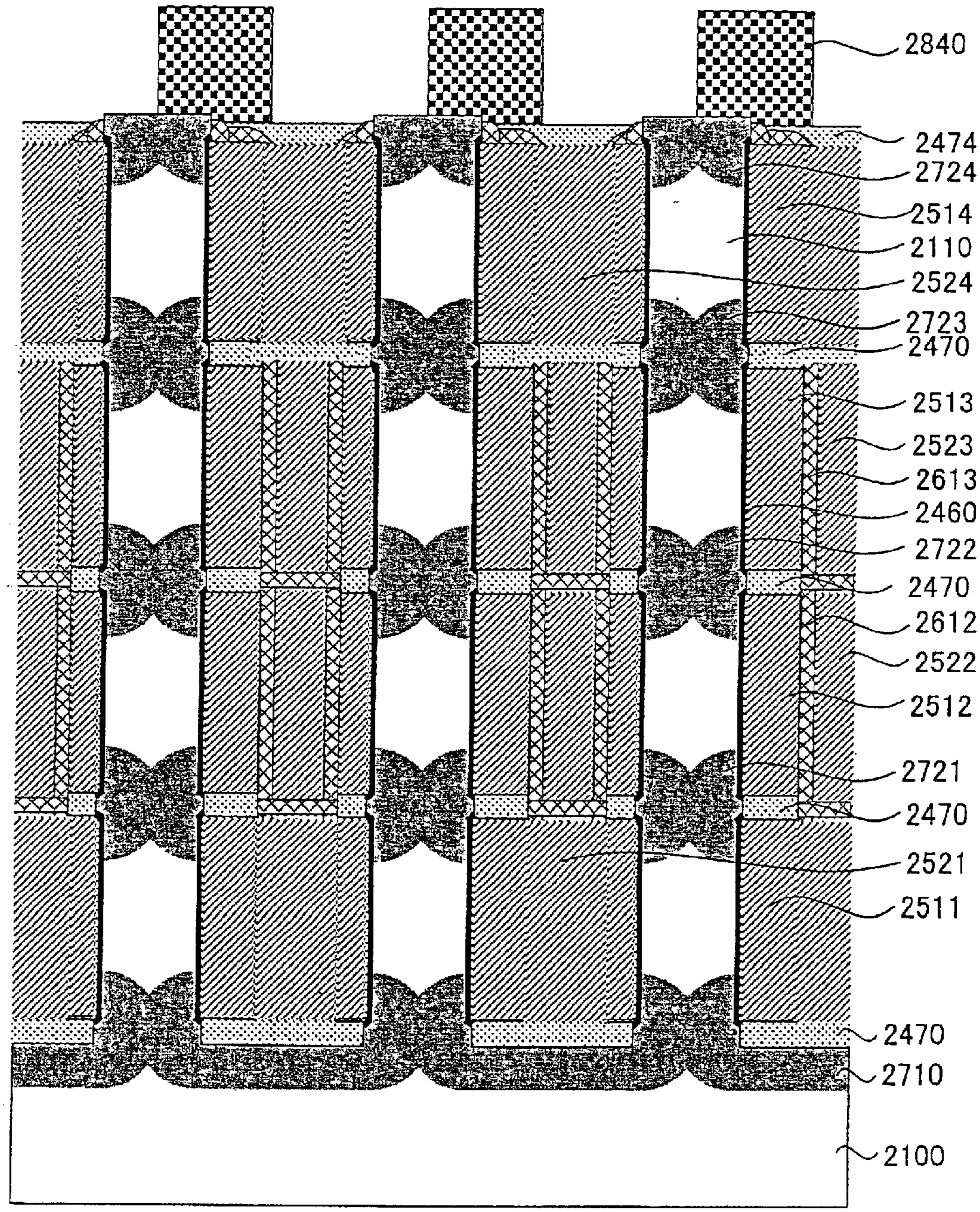
Figure 589:
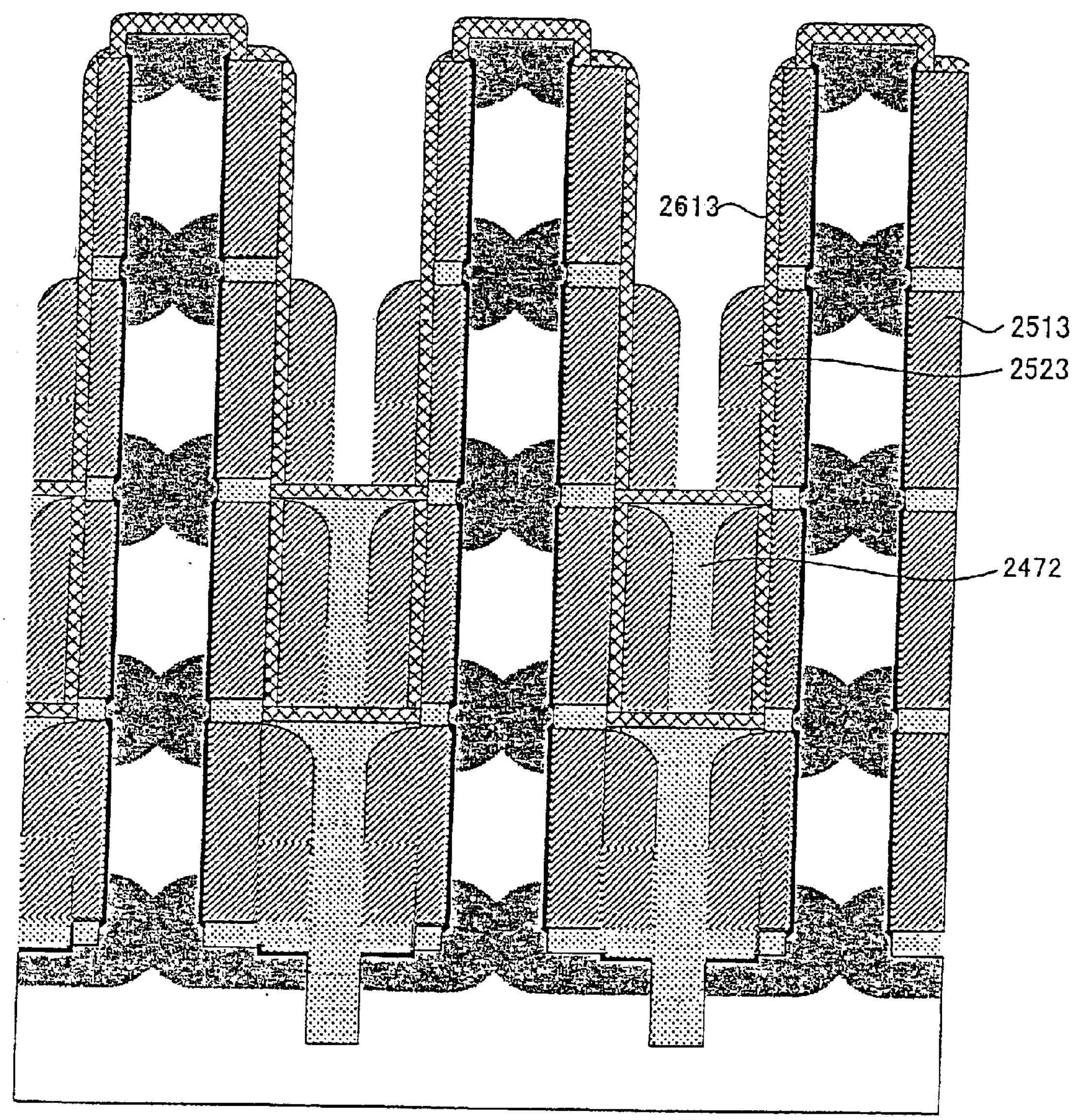
Figure 590:
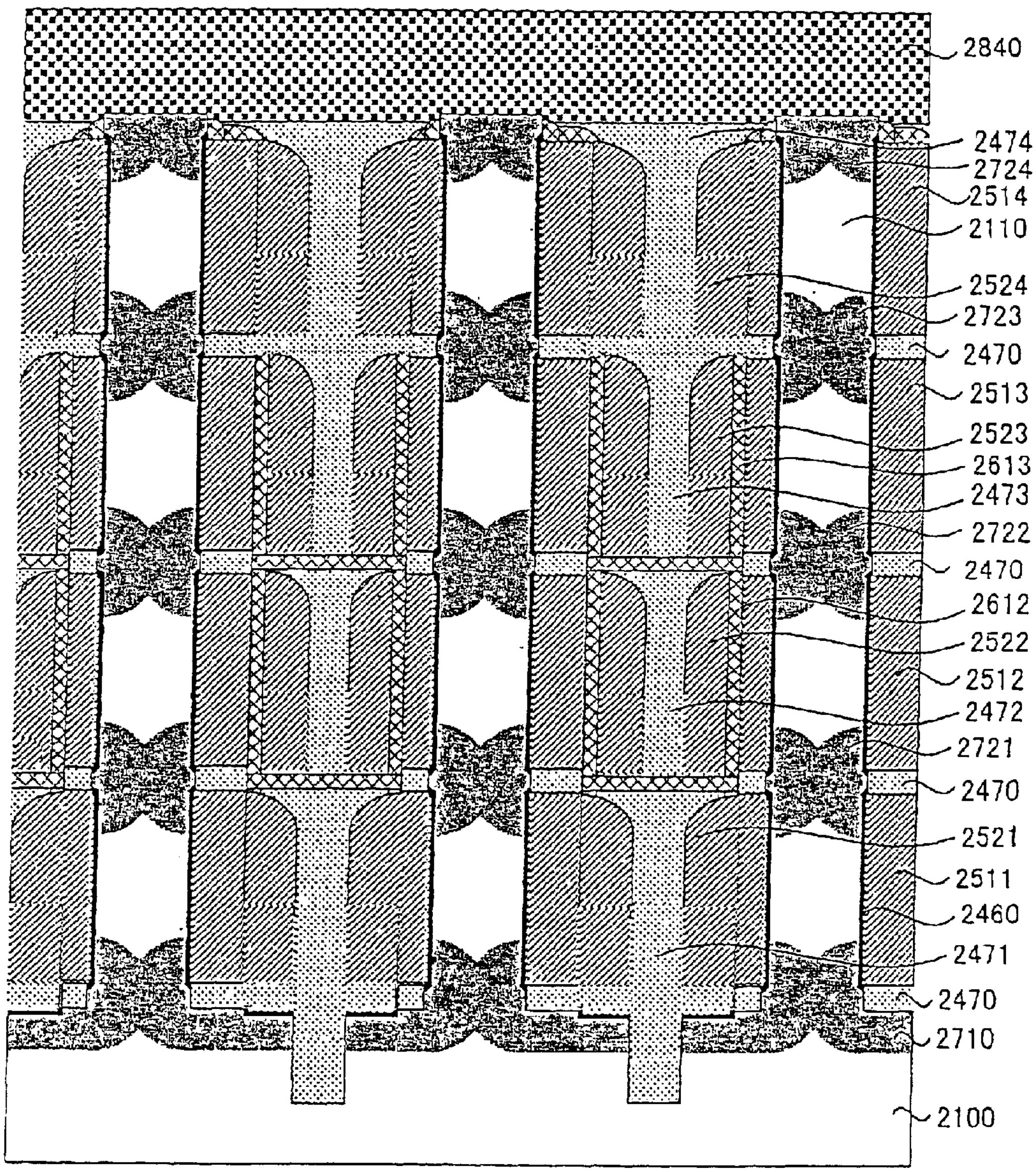
Figure 591:
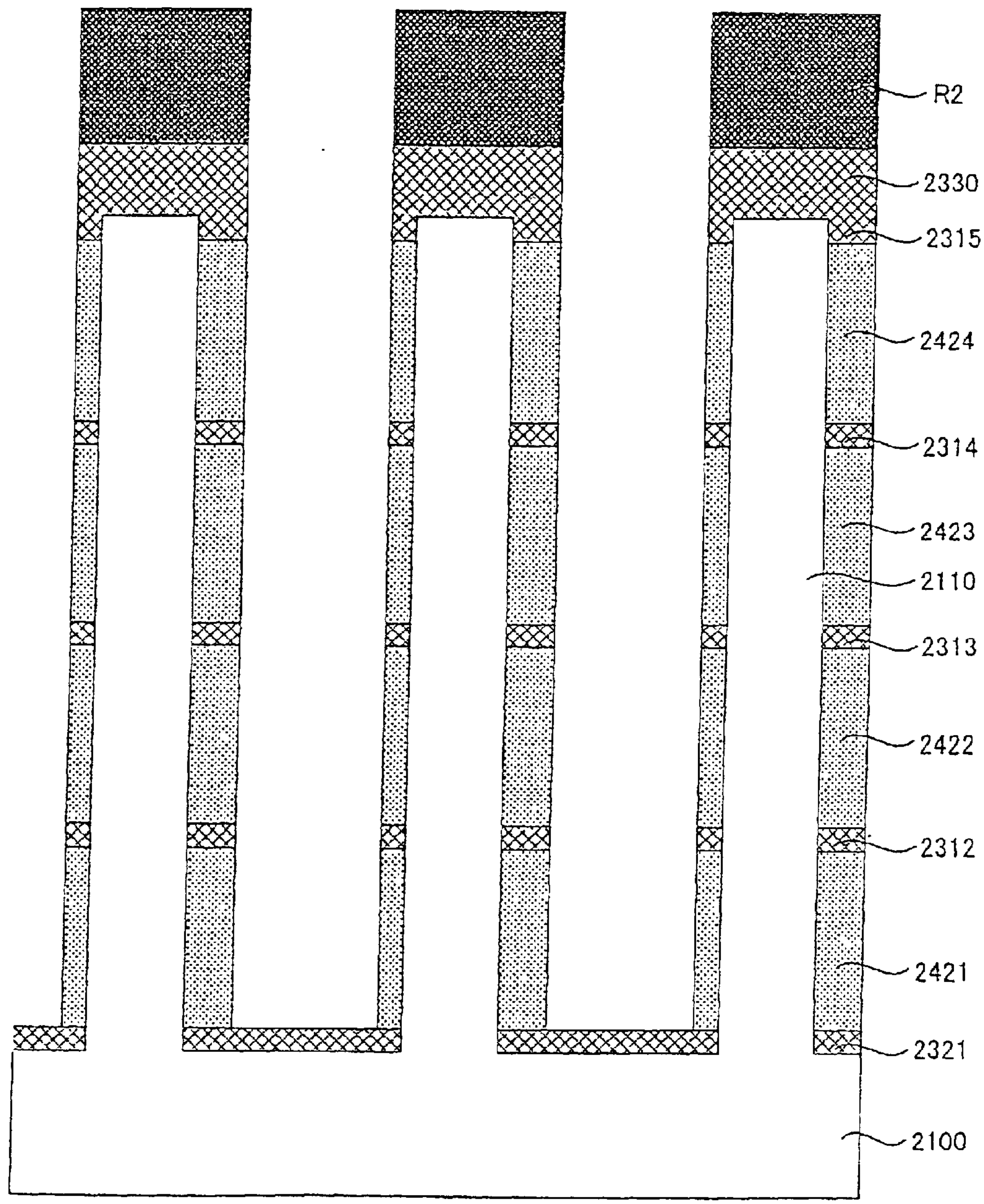
Figure 592:
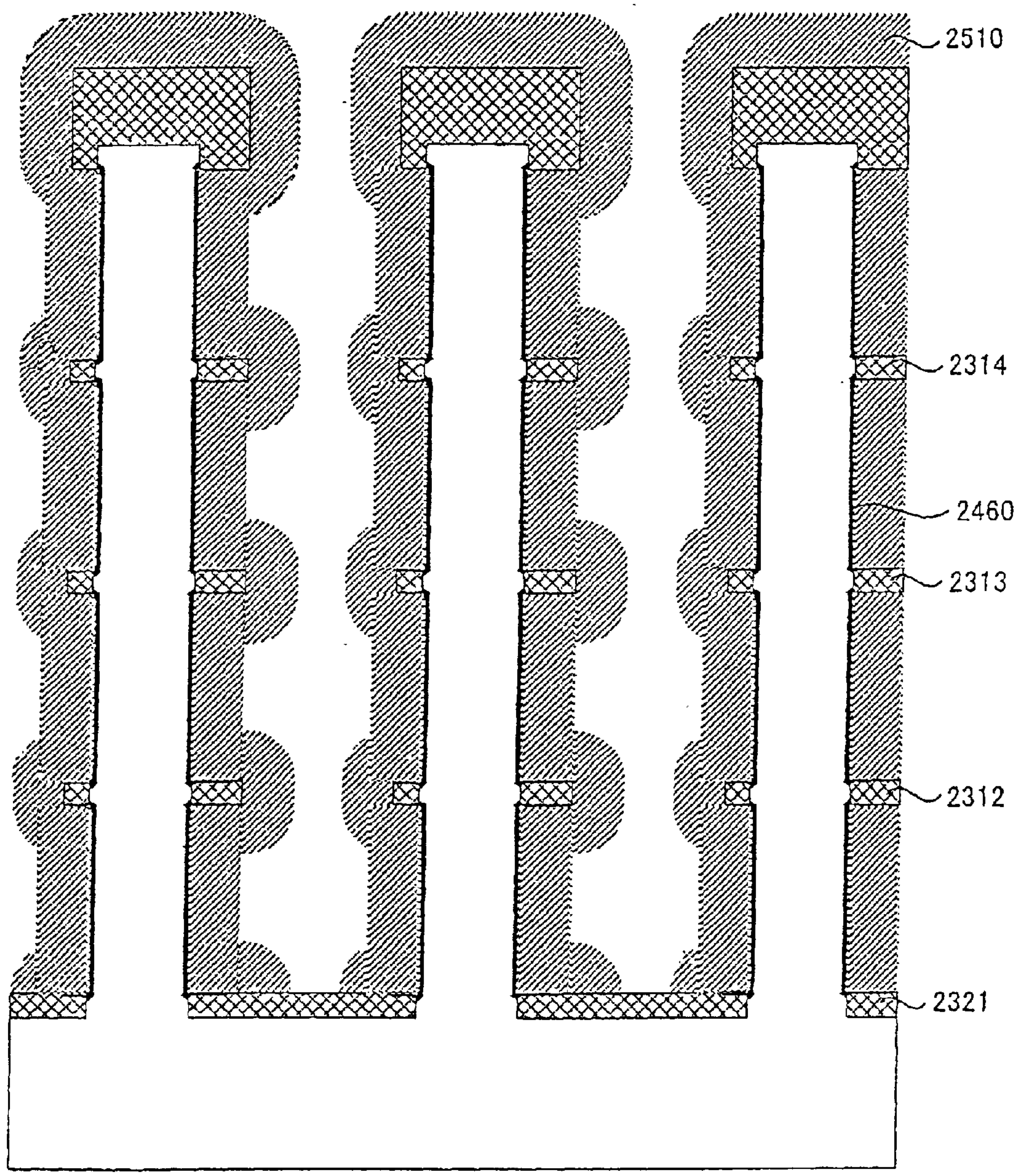
Figure 593:
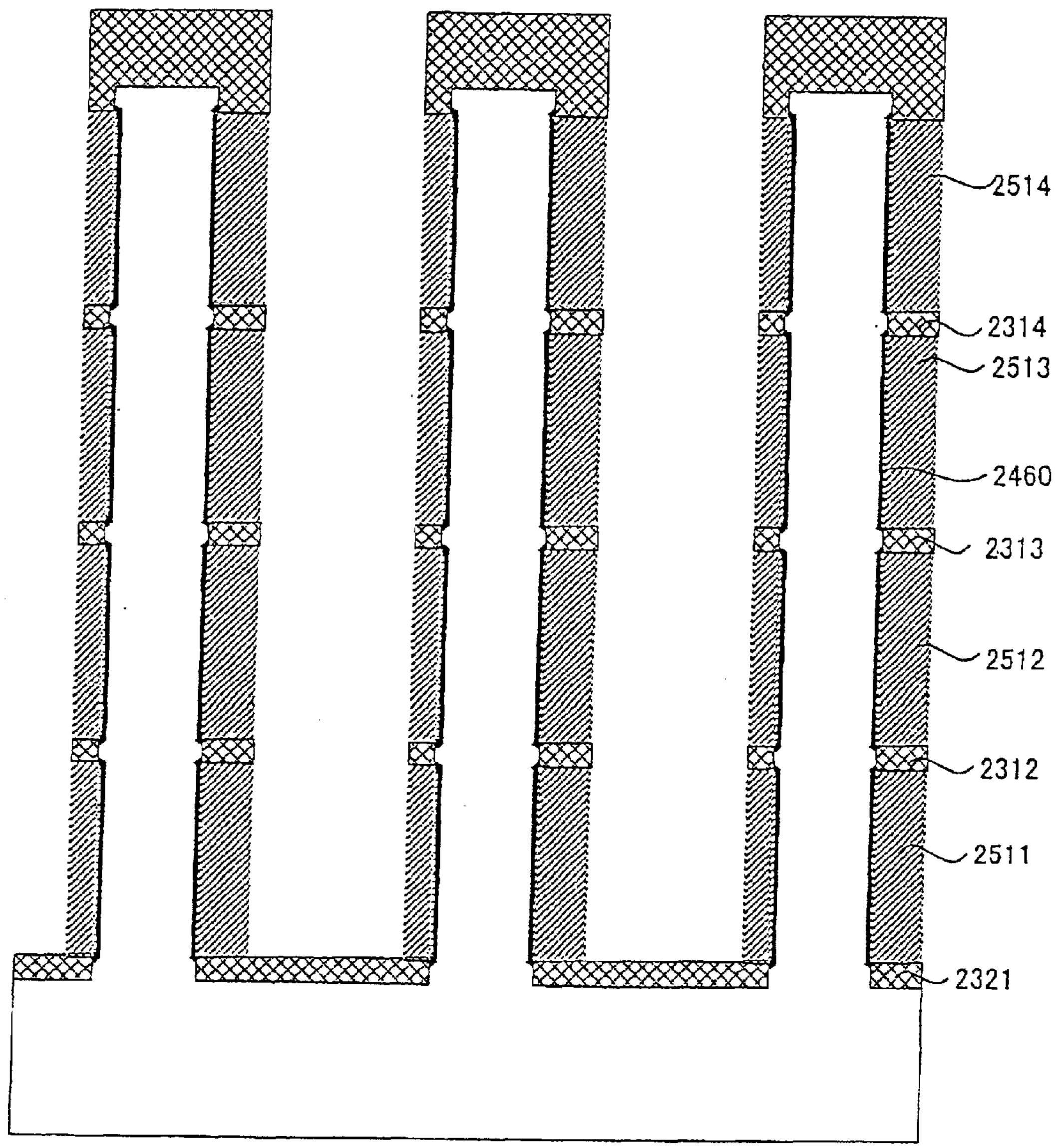
Figure 594:
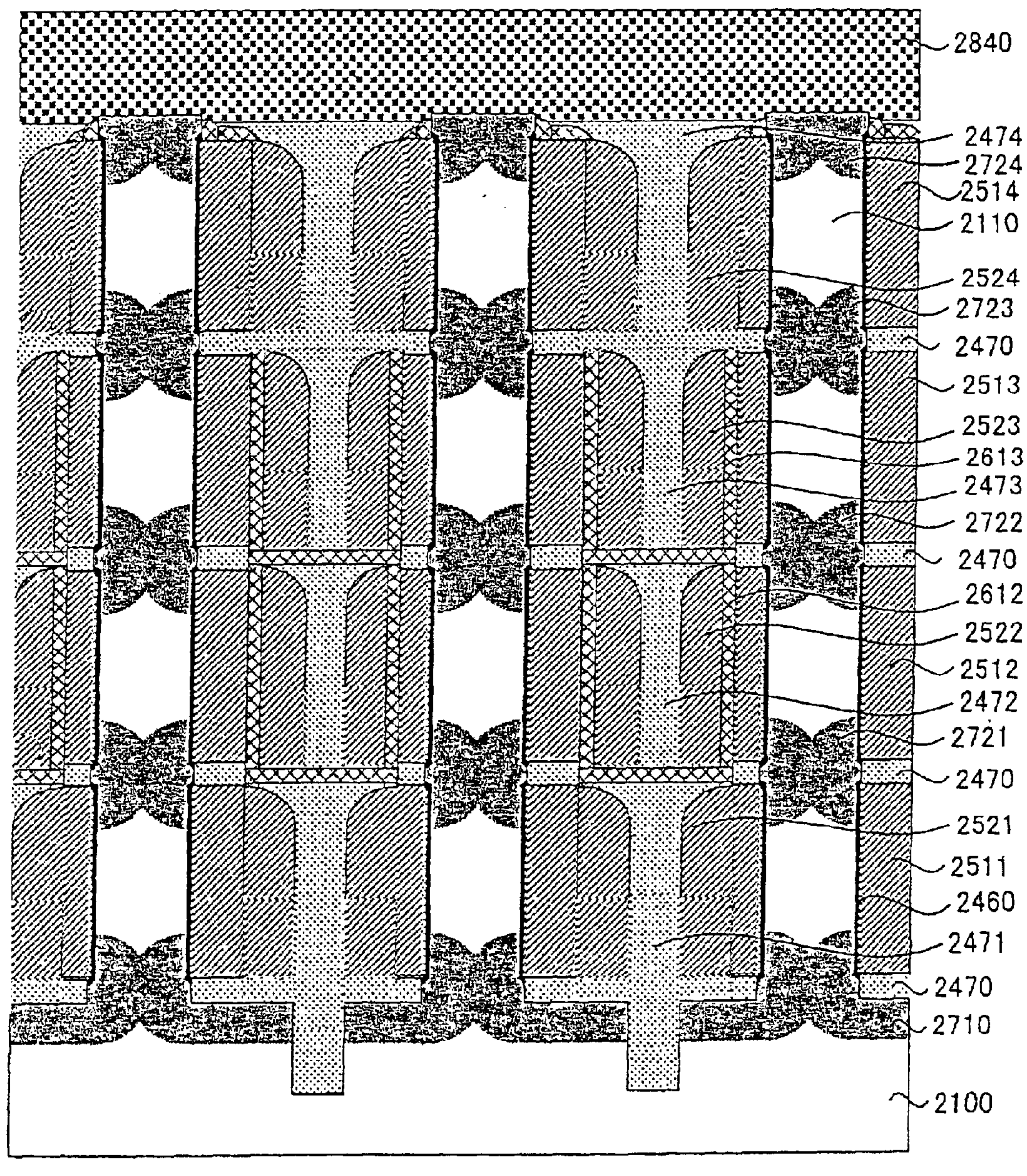

By repeating likewise, a polysilicon film (a second conductive film) 2523 is disposed on the side of the polysilicon film (the first conductive film) 2513 with intervention of an interlayer insulating film 2613 (FIGS. 568 and 589).

Thereafter, a silicon oxide film 2472, for example, is deposited as an eleventh insulating film to a thickness of about 50 to 500 nm. The silicon oxide film 2472 is buried in the third trench 2230 by anisotropic and isotropic etching such that the polysilicon film (the second conductive film) 2522 is buried. At this time, the depth of the buried silicon oxide film 2472 is so controlled that the polysilicon film 2522 can be exposed later. With regard to the polysilicon film 2514 which is the topmost first conductive film, a polysilicon film (a second conductive film) 2524 is etched back to such a degree that the polysilicon film 2524 is able to contact the polysilicon film (the first conductive film) 2514, in the same manner as the polysilicon film 2511 which is the bottommost first conductive film.

Then, the silicon nitride film 2330 (the fifth insulating film) and the silicon nitride film 2340 (the sixth insulating film) are removed, for example, by isotropic etching to expose the polysilicon film 2540. Then, a silicon oxide film 2475 is deposited as an eleventh insulating film to a thickness of 100 to 500 nm on the top of the polysilicon film 2524. The top portion of the polysilicon film 2540 is exposed by etch-back or by CMP. A fourth wiring layer 2840 is formed so that its direction crosses the direction of the second or third wiring layer and is connected to the top portion of the island-like semiconductor layer 2110.

Thereafter, by known techniques, an interlayer insulating film is formed, and a contact hole and metal wiring are formed. Thereby, a semiconductor memory is realized which has a memory function according to the state of a charge in the charge storage layer which is the floating gate made of the polysilicon film (the first conductive film).

In this example, films formed on the surface of the semiconductor substrate or the polysilicon film such as the silicon nitride film (the fourth insulating film) 2321, the silicon nitride film (the fifth insulating film) 2330 and the silicon nitride film (the twelfth insulating film) 2350 may be formed of a layered film of a silicon oxide film/a silicon nitride film from the silicon surface.

With regard to the polysilicon films 2510 or 2511 to 2514 (the first conductive films), the polysilicon films 2520 or 2521 to 2524 (the second conductive films) and the polysilicon film 2540 (the fourth conductive film), impurity introduction may be carried out during or after the formation of the polysilicon films or after the separation of the polysilicon films. The timing of the impurity introduction to the polysilicon films is not particularly limited so long as these films become conductive films.

In this example, the control gates of the memory cells are formed continuously in one direction without using a mask. However, that is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

Further, by providing the selection gates in the top and the bottom of a set of memory cells, it is possible to prevent the phenomenon that a memory cell transistor is over-erased.

PRODUCTION EXAMPLE 22

In an example of production process for producing a semiconductor memory in which regions for forming the charge storage layers are defined in advance by a laminated film comprising plural films, explanation is given of an example of production process for obtaining a structure in which the direction of the first wiring layer is parallel to the direction of the fourth wiring layer.

Such a semiconductor memory may be produced by the following production process. FIGS. 595 to 605 and FIGS. 606 to 616 are sectional views taken on line A-A' and line B-B', respectively, in FIG. 1 which is a plan view illustrating an EEPROM memory cell array.

First, in this example, a silicon nitride film 2250, for example, is deposited as a twelfth insulating film to a thickness of 5 to 50 nm on the surfaces of the polysilicon films 2512 to 2514 (the first conductive films), the silicon nitride films 2340, 2342, 2343 and 2344 (the sixth insulating films) and the silicon oxide film 2470 (the eleventh insulating film) which are present on the inner wall of the third trench 2230. The silicon nitride film 2350 is etched back, for example, anisotropically, into the form of a sidewall spacer.

Production steps thereafter are the same as those of Production example 11 (FIGS. 304 to 325 and 337 to 358) until the silicon oxide film 2470 is etched back isotropically to such a degree that the side of the polysilicon film 2511 is exposed.

Figure 595:
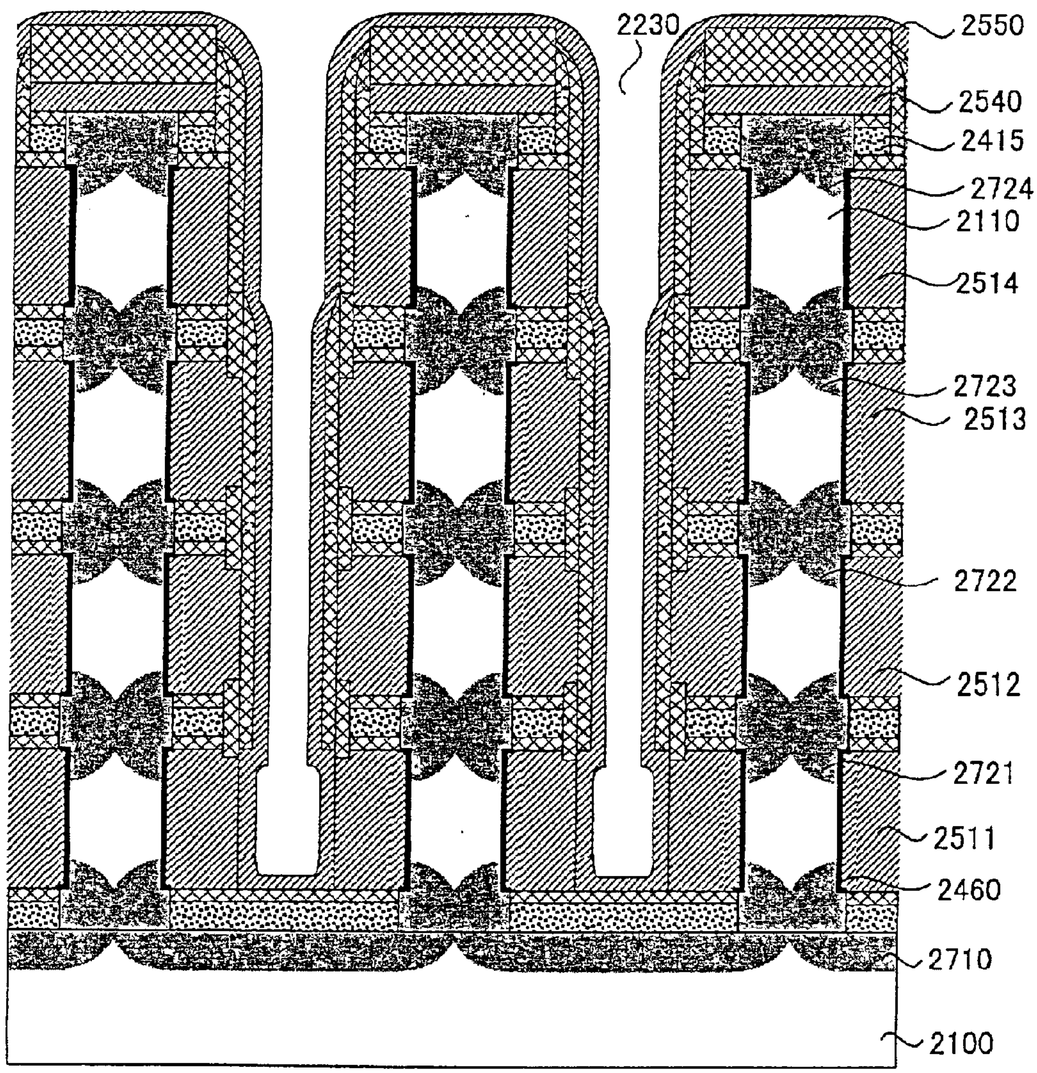
Figure 606:
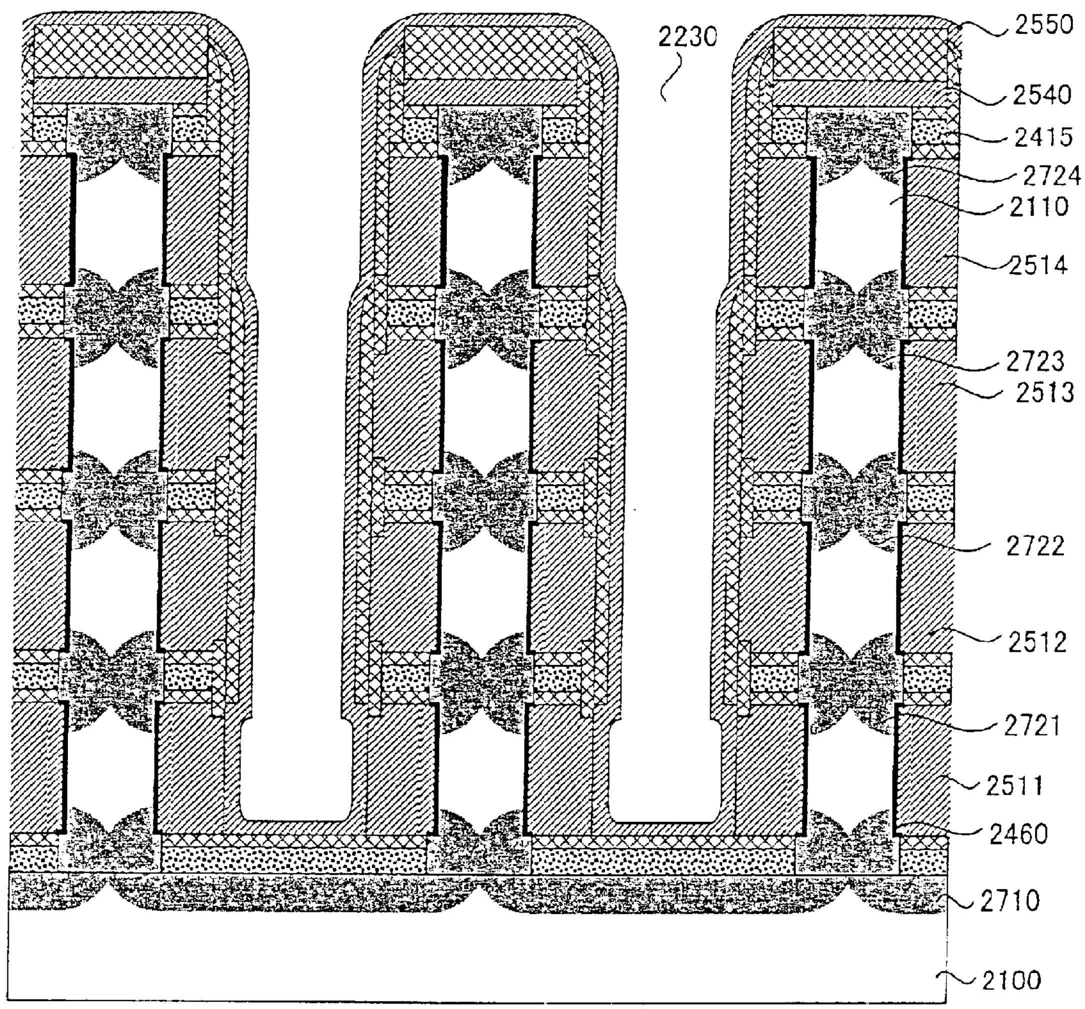

Then, a polysilicon film 2550, for example, is deposited as a fifth conductive film to a thickness of about 50 to 200 nm (FIGS. 595 and 606).

Figure 596:
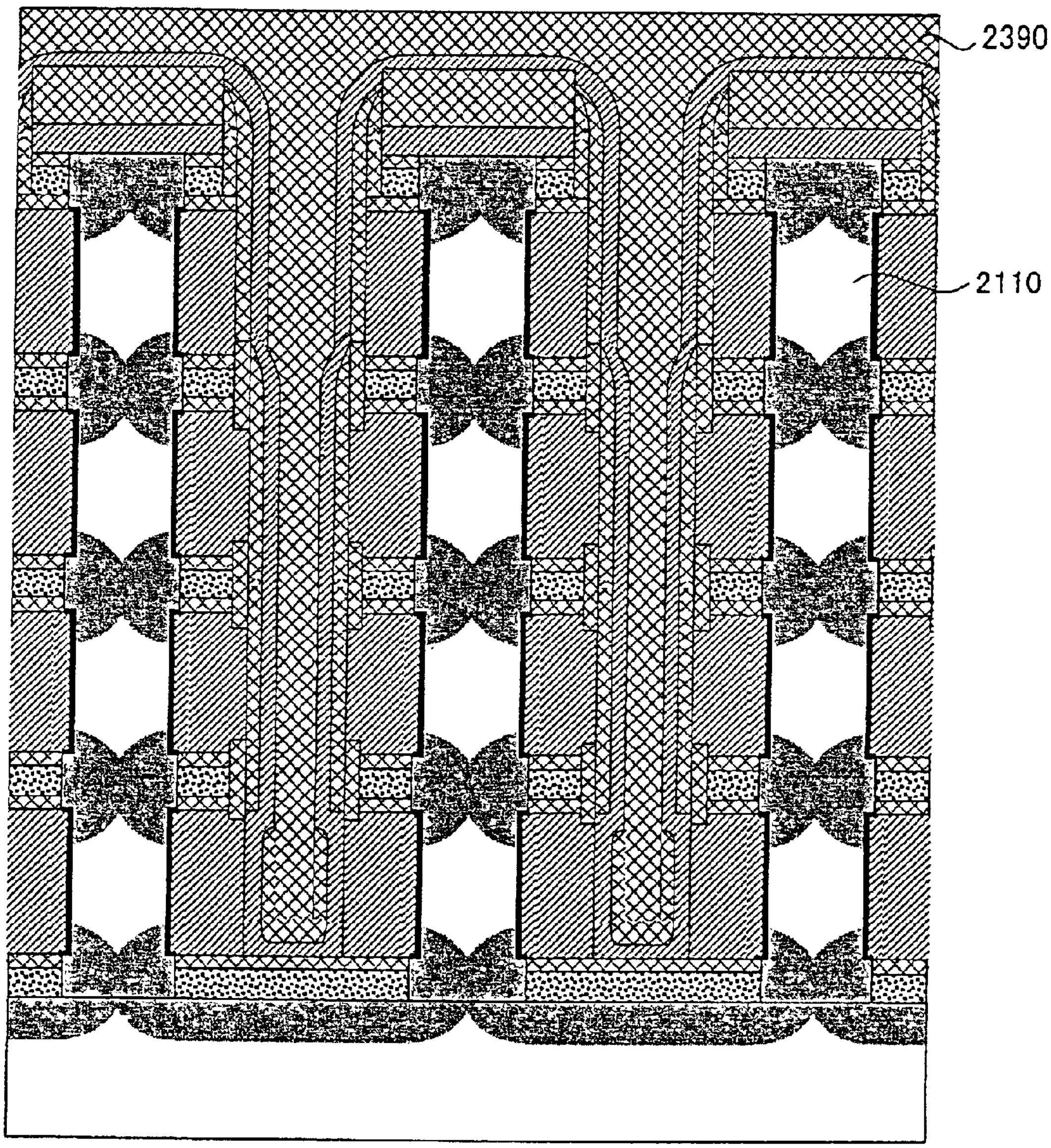
Figure 607:
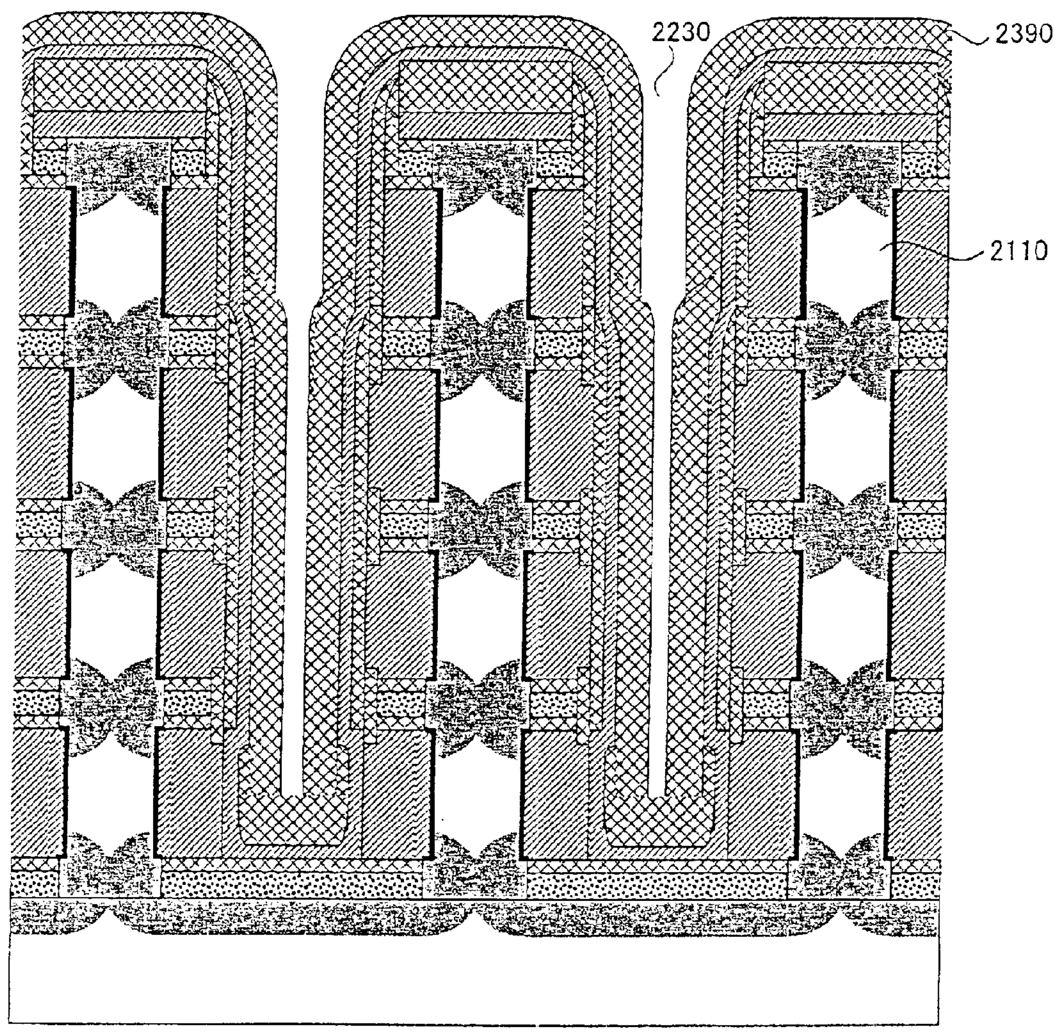

A silicon nitride film 2390, for example, is deposited as a nineteenth insulating film to a thickness of 100 to 300 nm by CVD (FIGS. 596 and 607). At this time, as shown in FIG. 596, the thickness of the silicon nitride film 2390 is so set that the silicon nitride film 2390 fills the third trench 2230 only in a direction in which the intervals between the island-like semiconductor layers 2110 are smaller.

Figure 597:
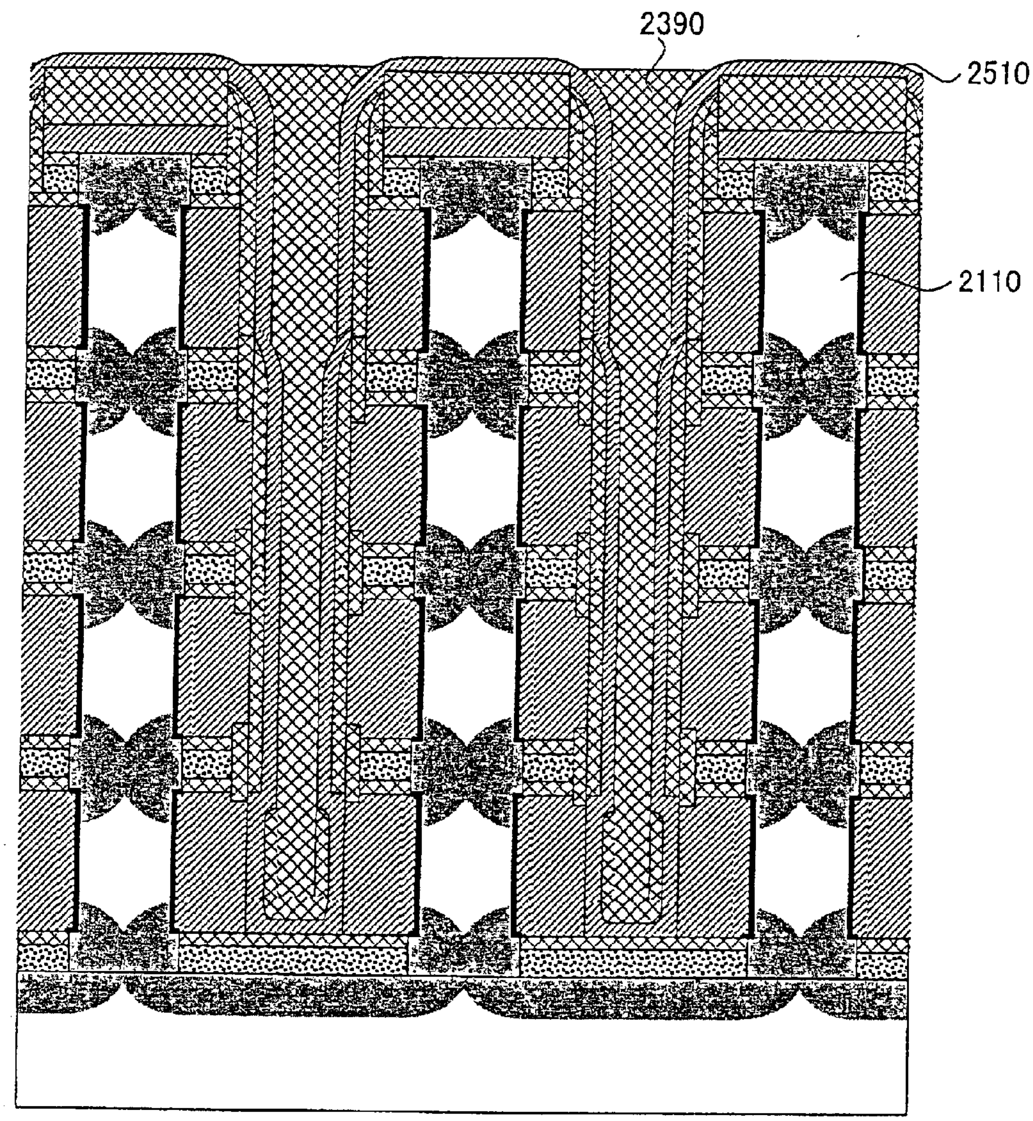
Figure 608:
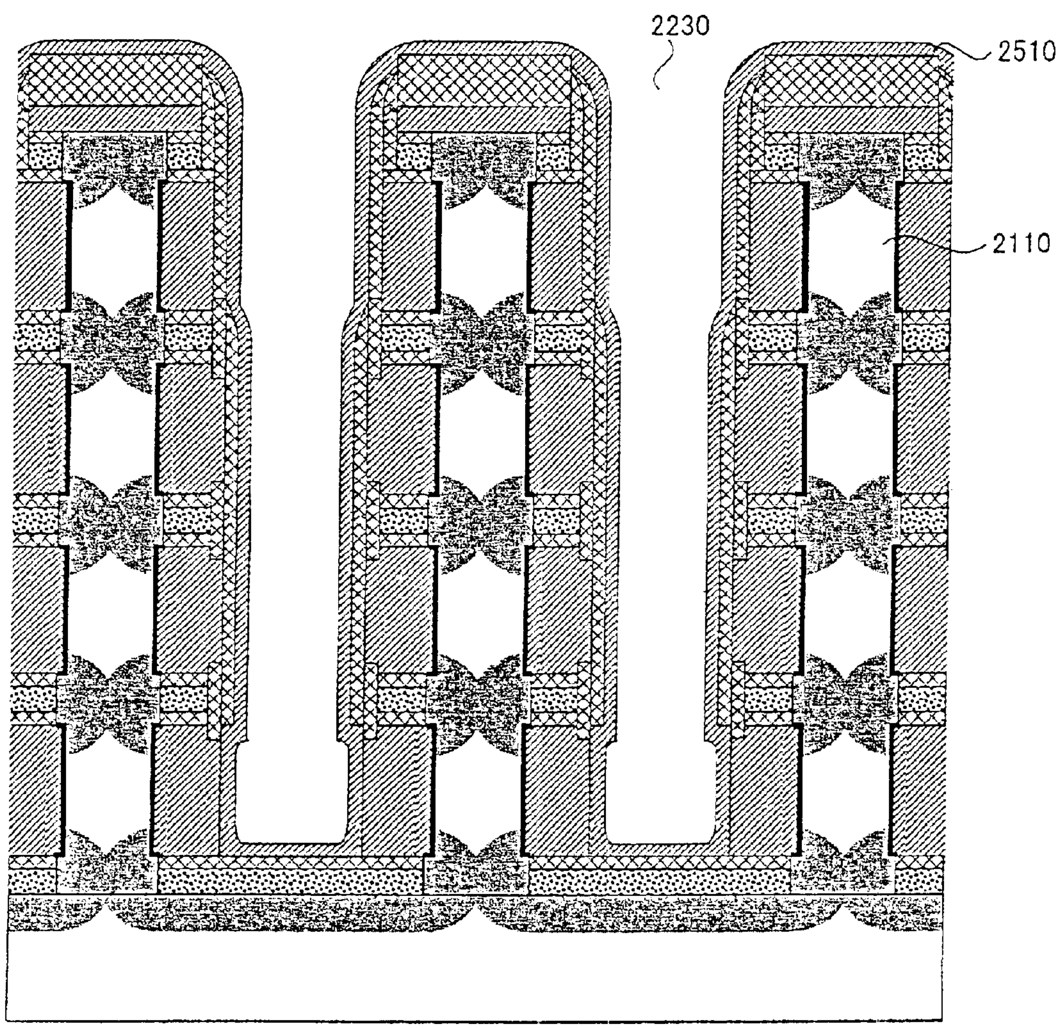

The silicon nitride film 2390 is etched back to a depth corresponding to the deposit thickness by isotropic etching (FIGS. 597 and 608). At this time, as shown in FIG. 597, the top portion of the polysilicon film 2550 (the fifth conductive film) is exposed. However, the silicon nitride film 2390 fills the third trench 2230 only in a direction in which the intervals between the island-like semiconductor layers 2110 are smaller.

Figure 598:
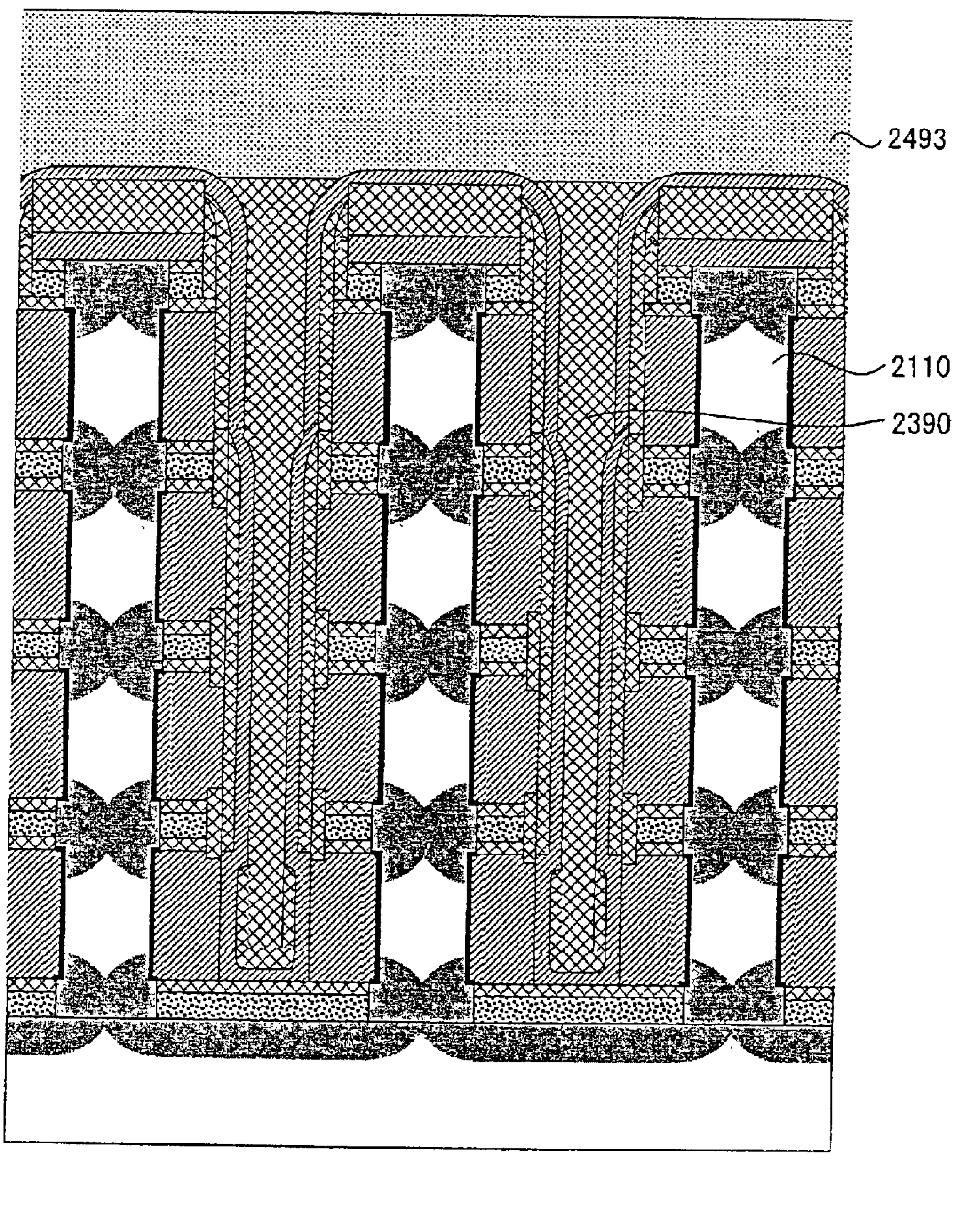
Figure 609:
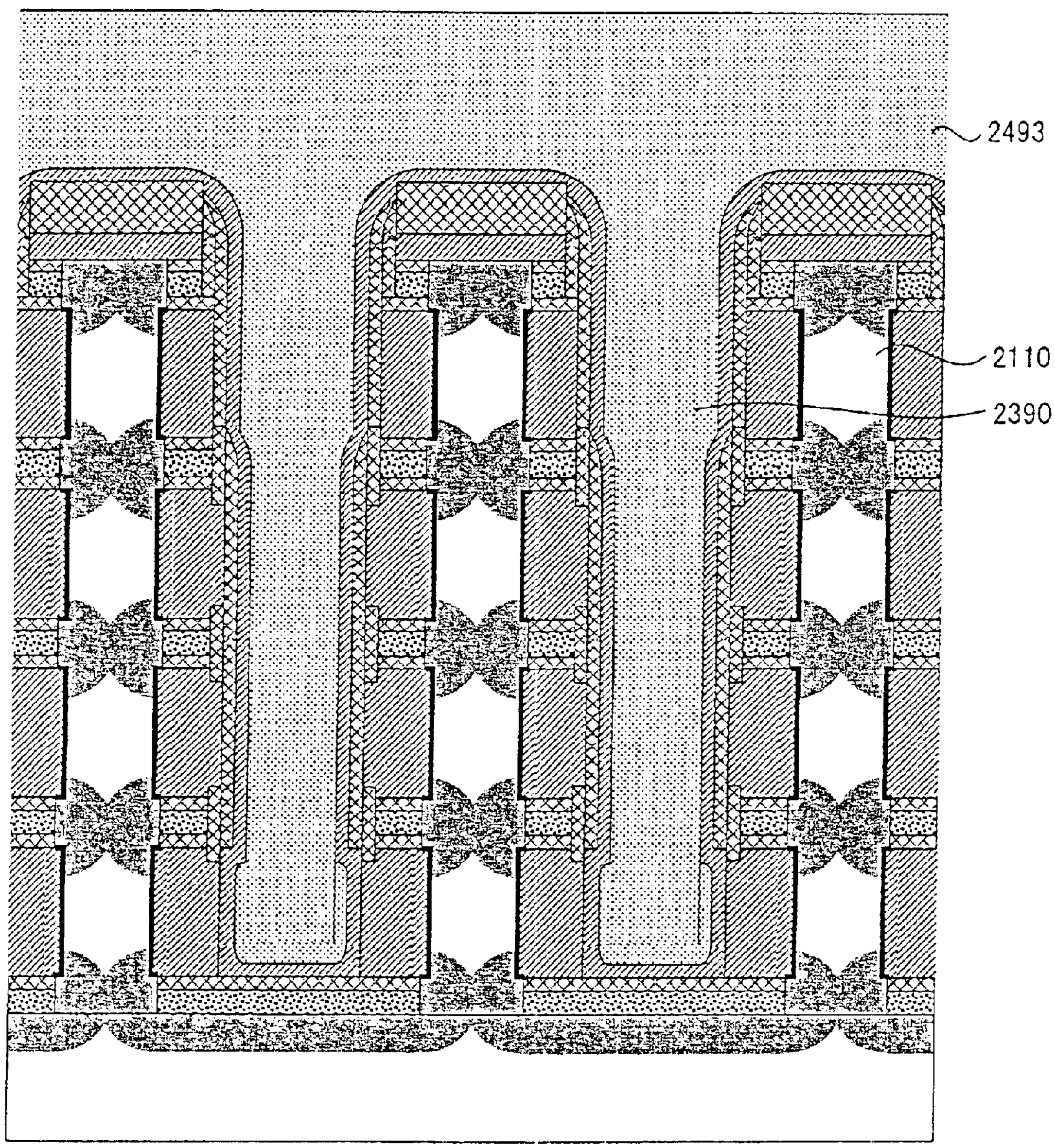

A silicon oxide film 2493 is deposited as a twentieth insulating film to a thickness of about 50 to 200 nm (FIGS. 598 and 609). At this time, as shown in FIG. 609, the thickness of the silicon oxide film 2493 is so set that a silicon nitride film 2490 (a sixteenth insulating film) fills the third trench 2230 only in a direction in which the intervals between the island-like semiconductor layers 2110 are smaller.

Figure 599:
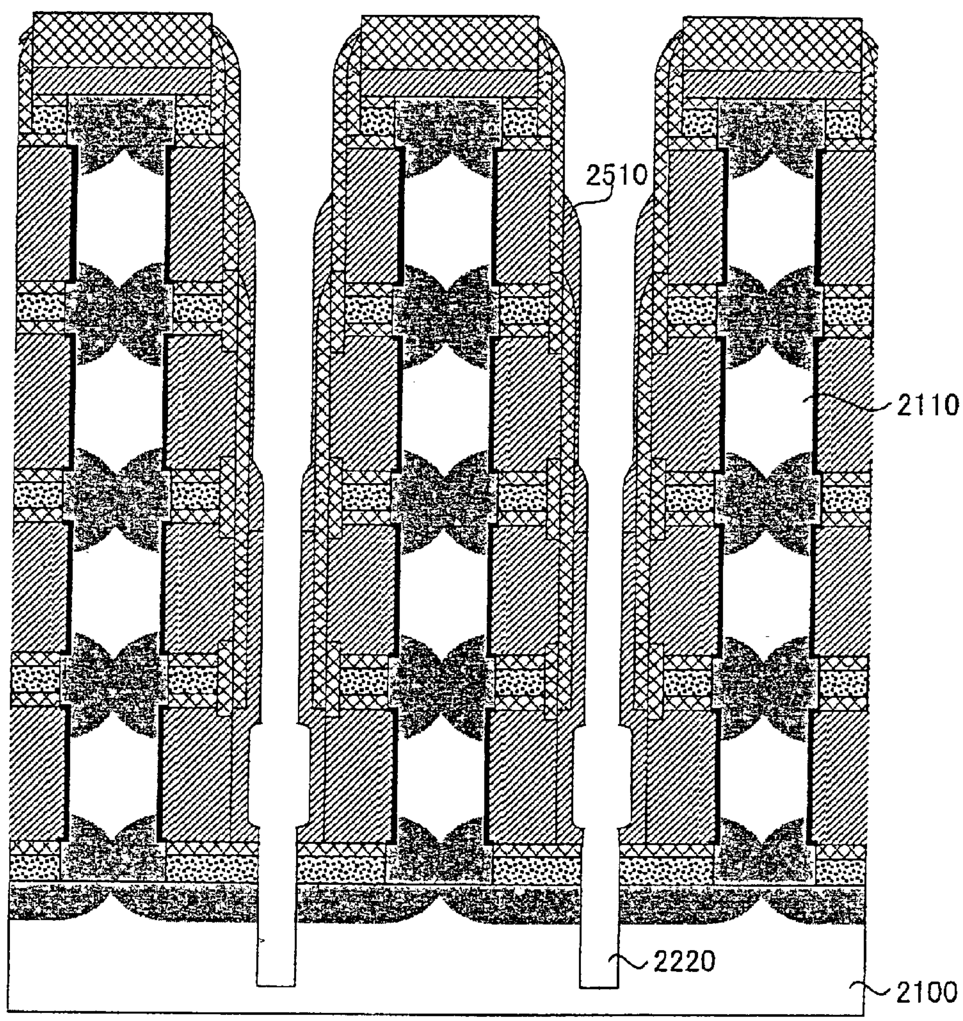
Figure 600:
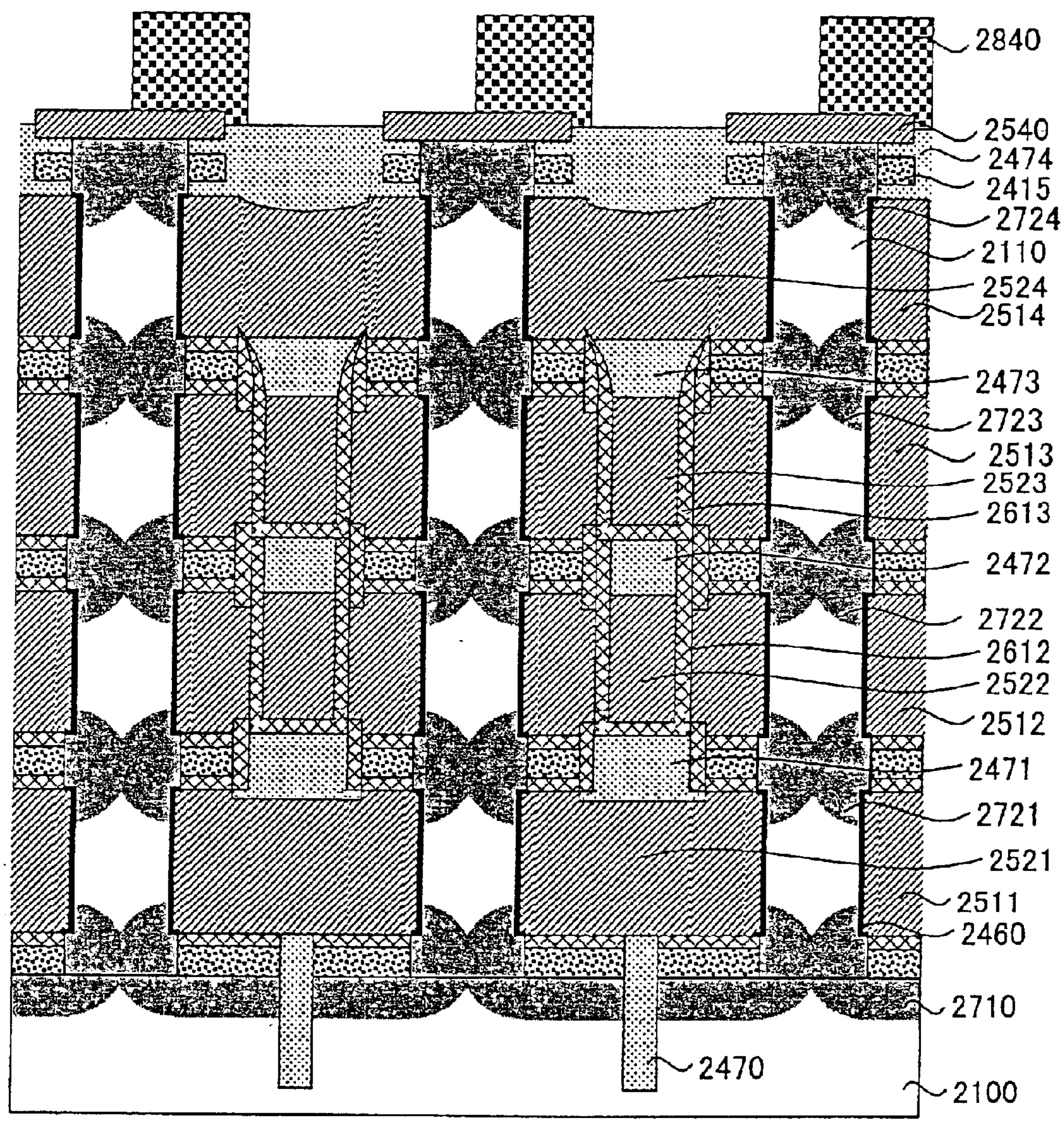
Figure 610:
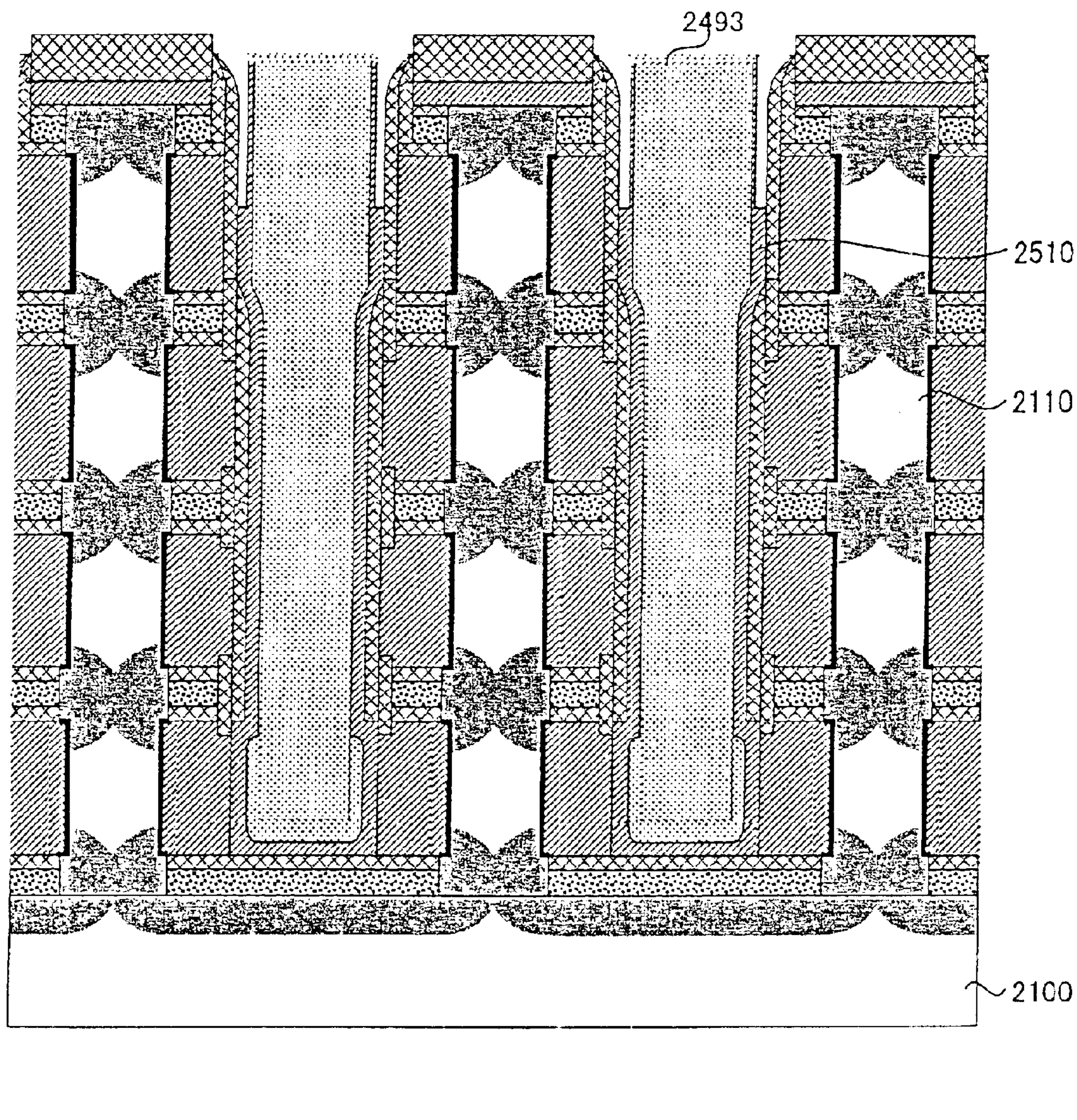
Figure 611:
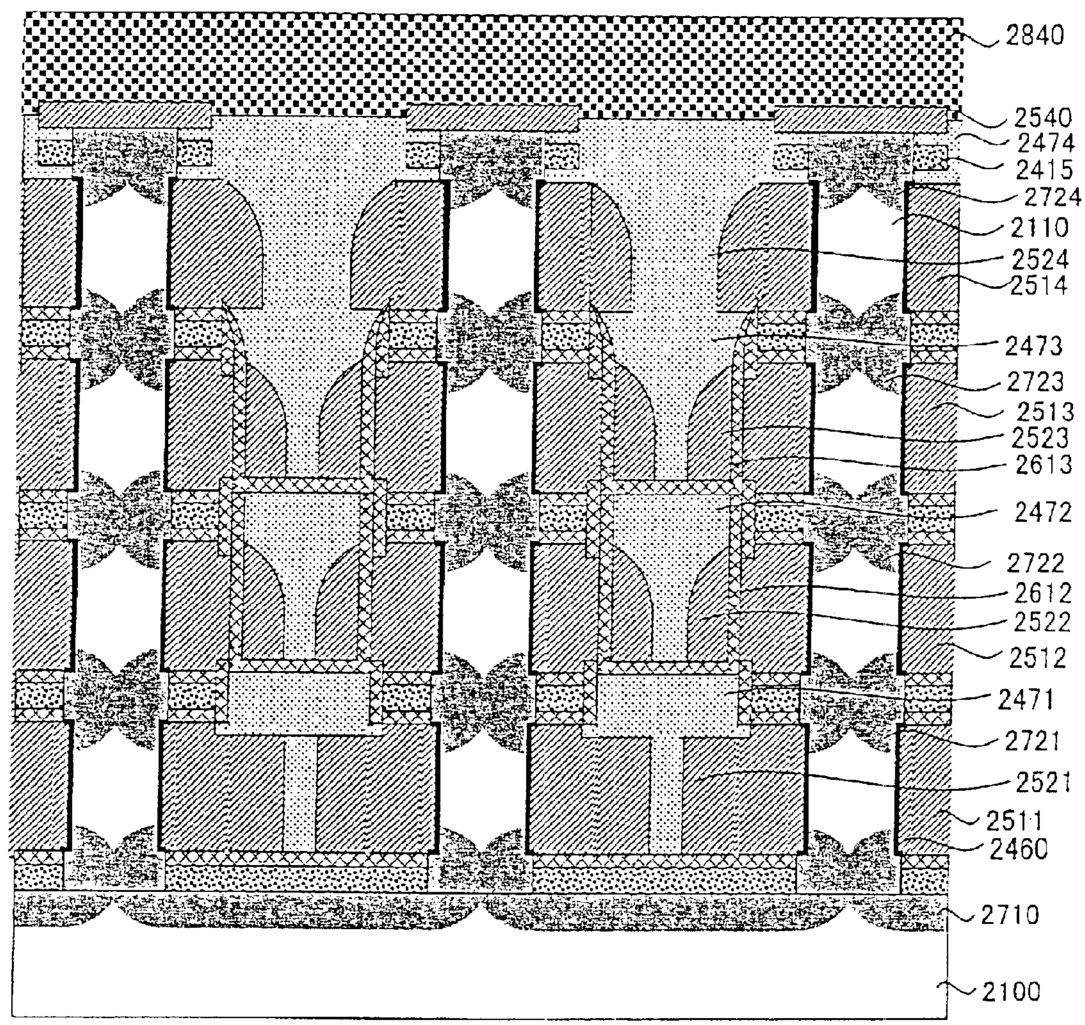

Subsequently, the silicon oxide film 2493 is etched back to a depth corresponding to the deposit thickness. The silicon nitride film 2390 remaining in the third trench 2230 as shown in FIG. 599 is removed by isotropic etching and the polysilicon film 2550 is etched back by anisotropic etching. At this time, as shown in FIG. 610, the top of the polysilicon film 2550 is exposed and removed only in the direction in which the intervals between the island-like semiconductor layers 2110 are larger. However, the bottom of the polysilicon film 2550 is not removed since the third trench 2230 is buried with the silicon oxide film 2493.

Then, using as a mask the polysilicon film 2550 having been formed into the sidewall spacer, a second trench 2220 is formed in the semiconductor substrate 2100 (FIG. 599 and FIG. 610).

A silicon oxide film 2470 which is an eleventh insulating film is buried in the second trench 2220. Production steps thereafter (FIG. 600 and FIG. 611) follow Production Example 11 (FIGS. 331 to 335 and FIGS. 364 to 368). Thereby, a semiconductor memory is realized in which the first wiring layer is parallel to the fourth wiring layer 2840 and which has a memory function according to the state of a charge in the charge storage layer which is the floating gate made of the polysilicon film (the first conductive film).

In this example, films formed on the surface of the semiconductor substrate or the polysilicon film such as the silicon nitride film (the nineteenth insulating film) 2390 may be formed of a layered film of a silicon oxide film/a silicon nitride film from the silicon surface.

In this example, the third trench 2230 is opened only in the direction in which the intervals between the island-like semiconductor layers 2110 are smaller without using a mask, thereby the separation trench of the first wiring layer is formed in the semiconductor substrate 2100.

In contrast, for example, the separation trench of the first wiring layer may be formed through patterning with use of resist films by photolithography. Such an example is explained below.

In this example, production steps are the same as those of Production example 11 (FIGS. 304 to 322 and 337 to 355) until the polysilicon film 2510 deposited to a thickness of 50 to 200 nm as a first conductive film is divided into the polysilicon films 2511, 2512, 2513 and 2514 by anisotropic etching using the silicon nitride films 2330, 2340, 2342, 2343 and 2344 as a mask.

Figure 601:
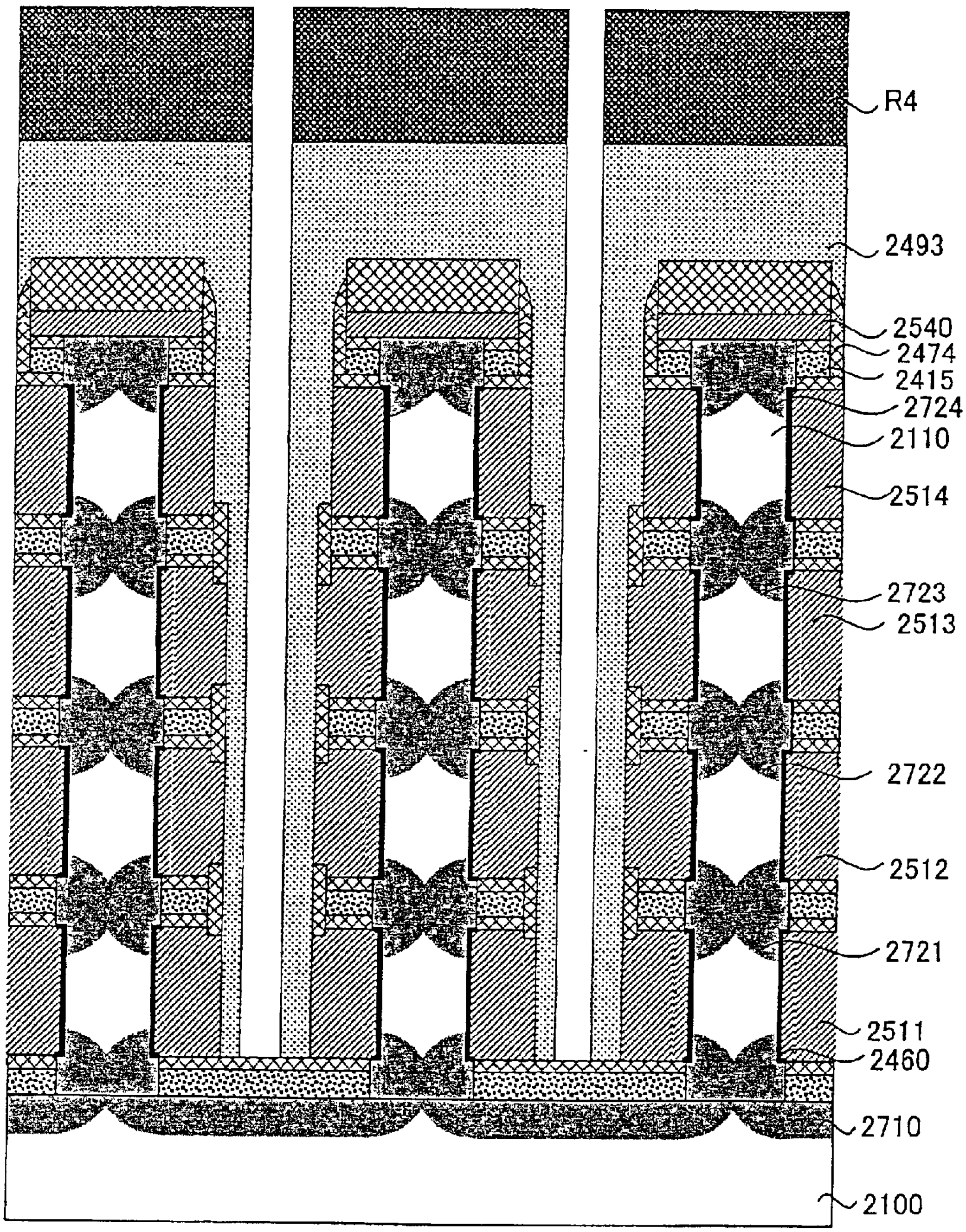
Figure 612:
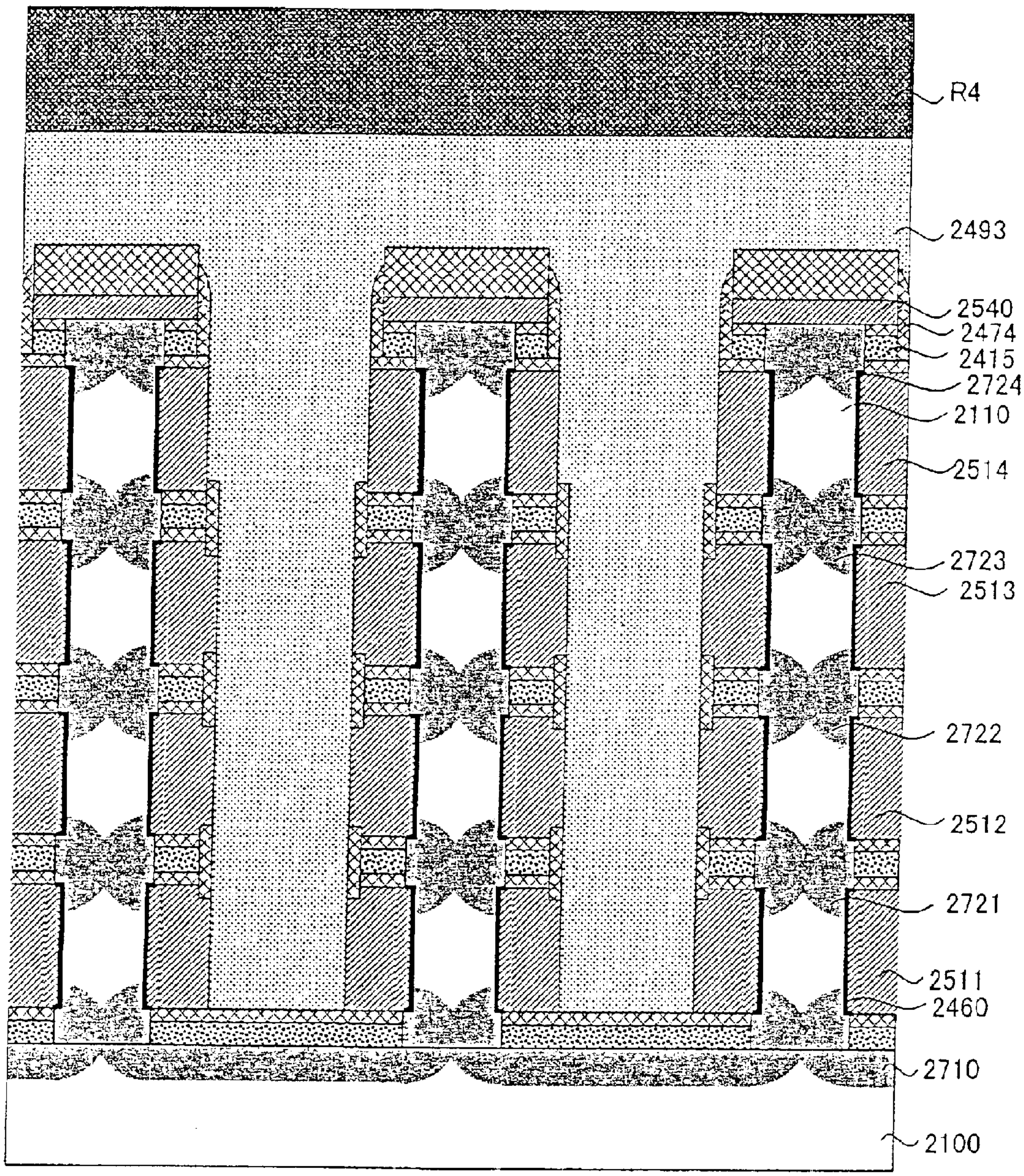

Thereafter, a silicon oxide film 2493, for example, is deposited as a twentieth insulating film to a thickness of about 100 to 300 nm by CVD (FIGS. 601 and 612).

Using a resist film R4 patterned by a known photolithographic technique as a mask, the silicon oxide film 2493 is etched by reactive ion etching.

Figure 602:
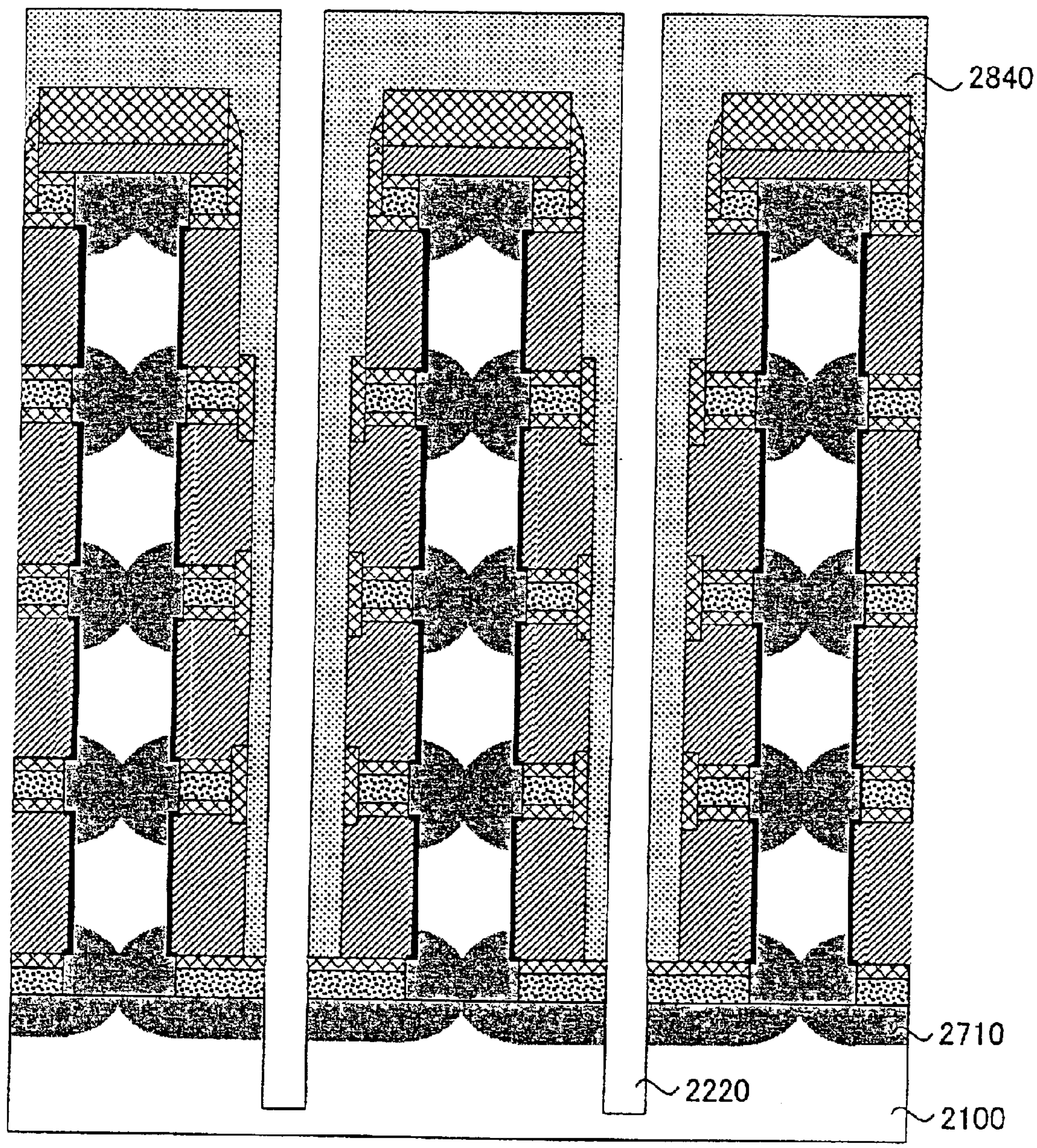
Figure 603:
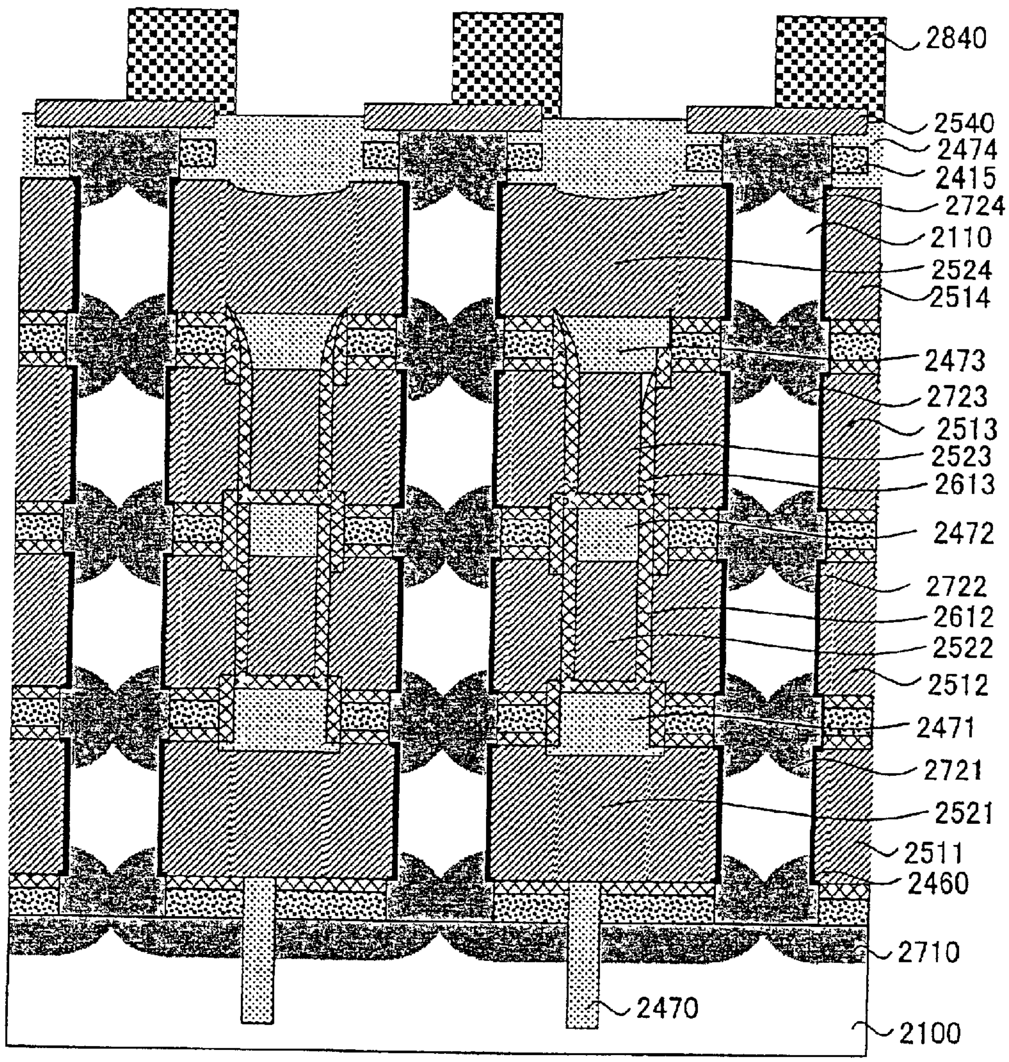
Figure 613:
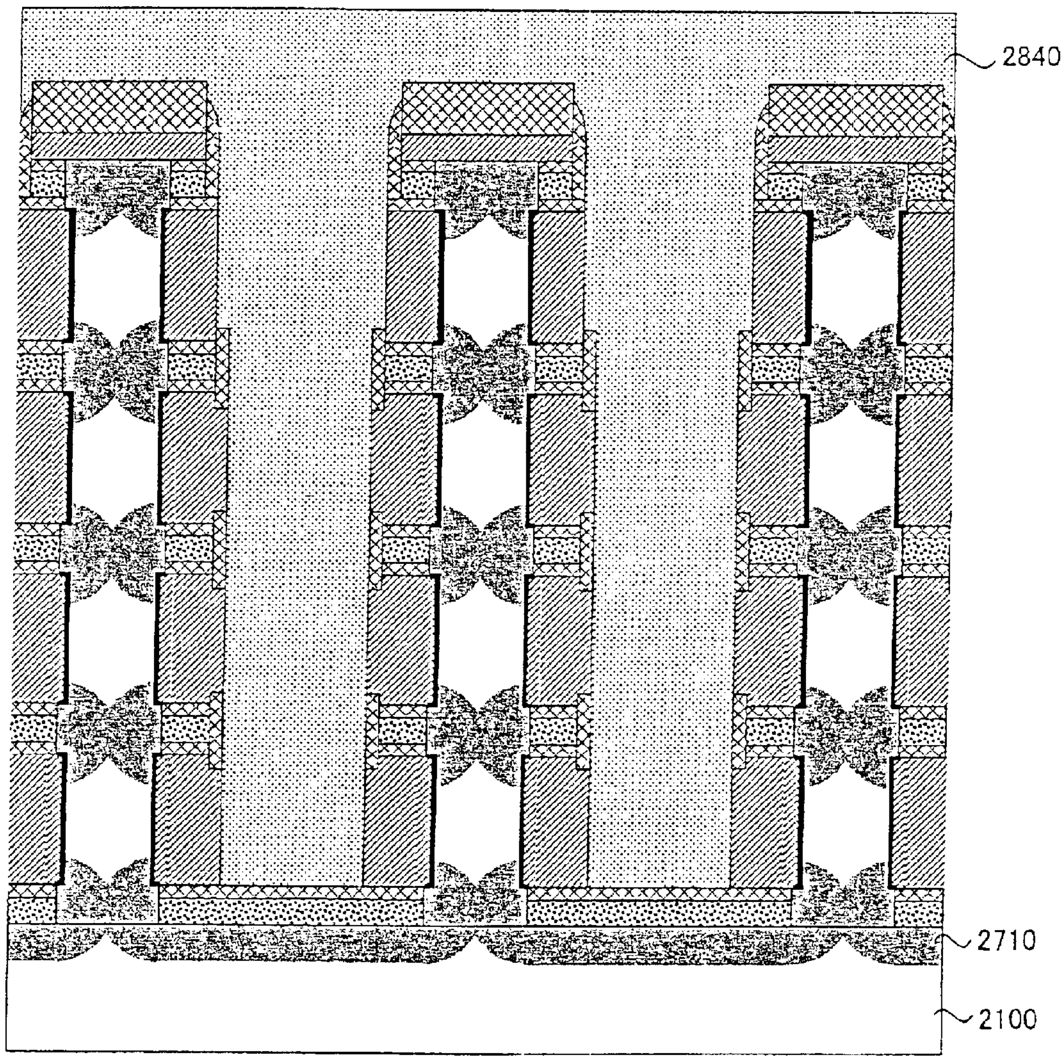
Figure 614:
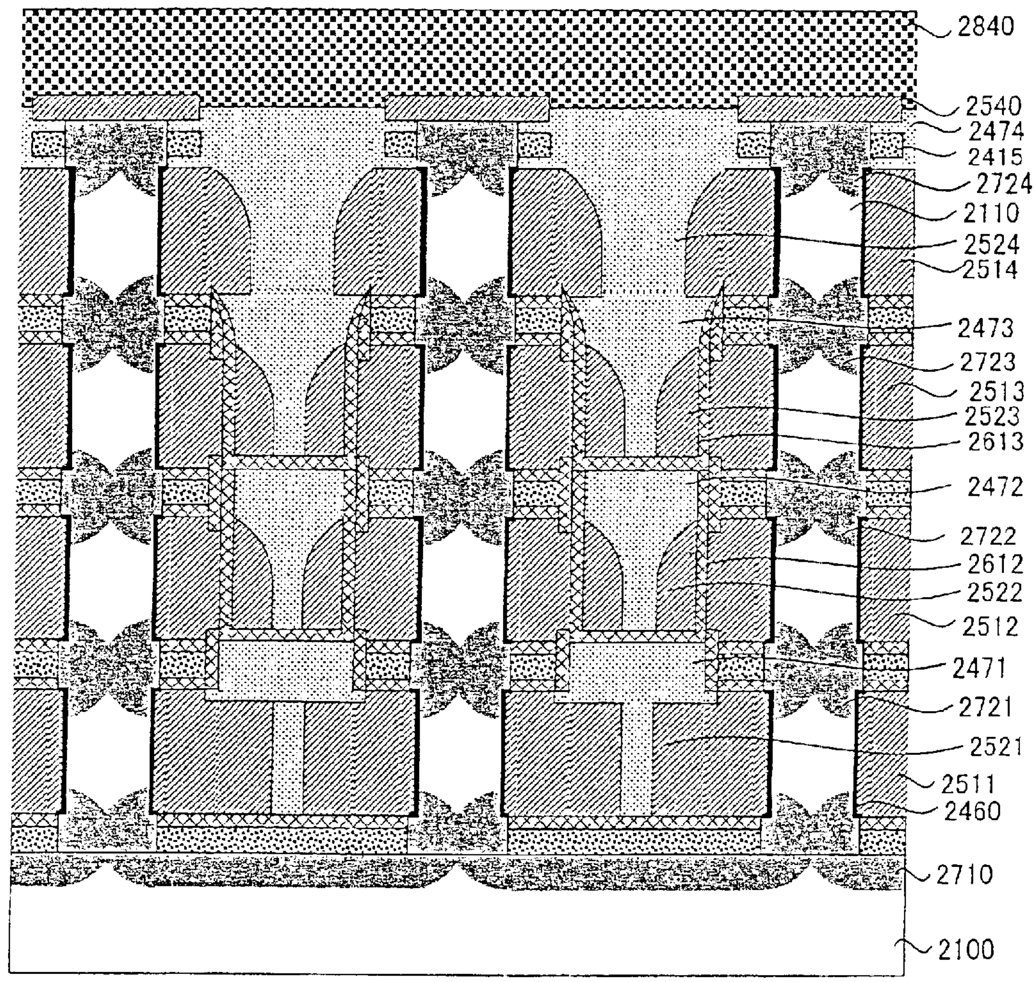

Then, the silicon nitride film 2321, the silicon oxide film 2411 and the semiconductor substrate 2100 are etched anisotropically by using the silicon oxide film 2493 as a mask, thereby forming a second trench 2220 in the semiconductor substrate 2100 (FIGS. 602 and 613).

Subsequently, an oxide film 2470 is buried in the second trench 2220 as an eleventh insulating film.

Production steps thereafter (FIG. 603 and FIG. 614) follow Production Example 11 (FIGS. 331 to 335 and FIGS. 364 to 368). Thereby, a semiconductor memory is realized in which the first wiring layer is parallel to the fourth wiring layer and which has a memory function according to the state of a charge in the charge storage layer which is the floating gate made of the polysilicon film (the first conductive film).

Alternative example is explained below. This example is the same as that shown in FIGS. 601 and 612 until the silicon oxide film 2493 (the twentieth insulating film) is etched by reactive ion etching using the resist film R4 patterned by a known photolithographic technique as a mask.

Figure 604:
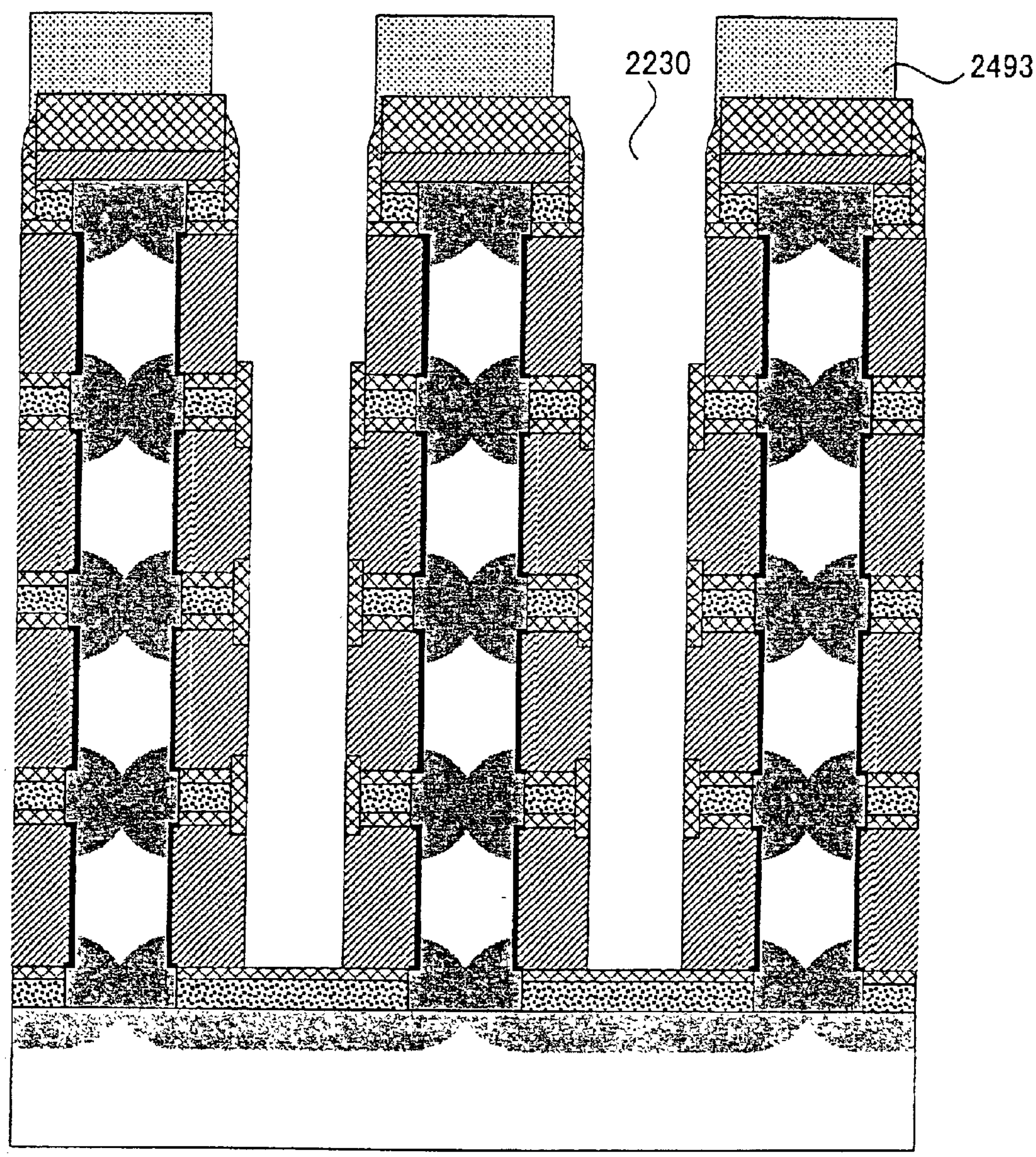
Figure 615:
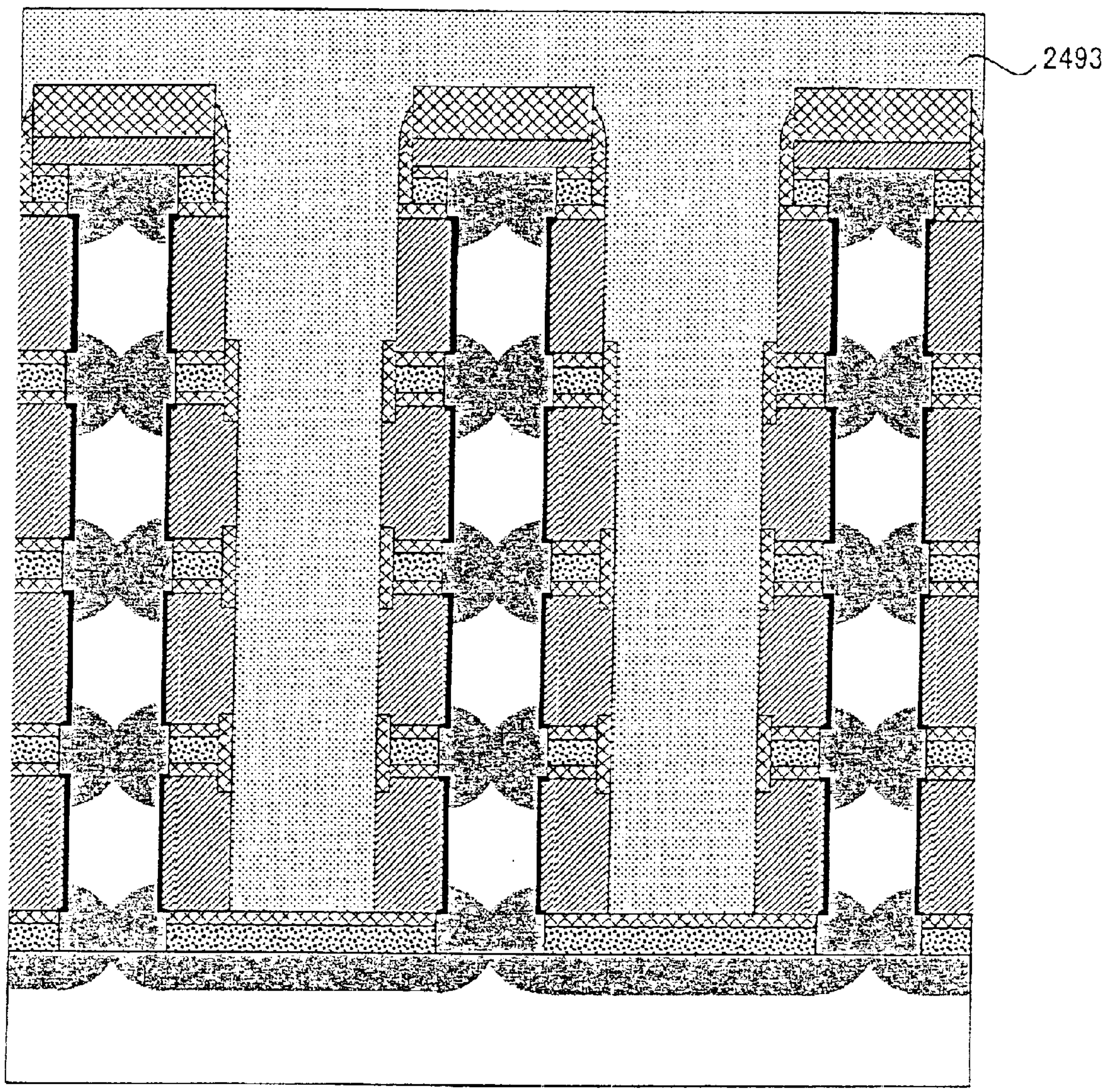

Thereafter, the silicon oxide film 2493 partially remaining in the third trench 2330 is removed by isotropic etching. At this time, the silicon oxide film 2493 is completely removed from the third trench 2230 in the direction shown in FIG. 604, whereas the silicon oxide film 2493 is left in the third trench 2230 in the direction shown FIG. 615 (FIGS. 604 and 615).

Figure 605:
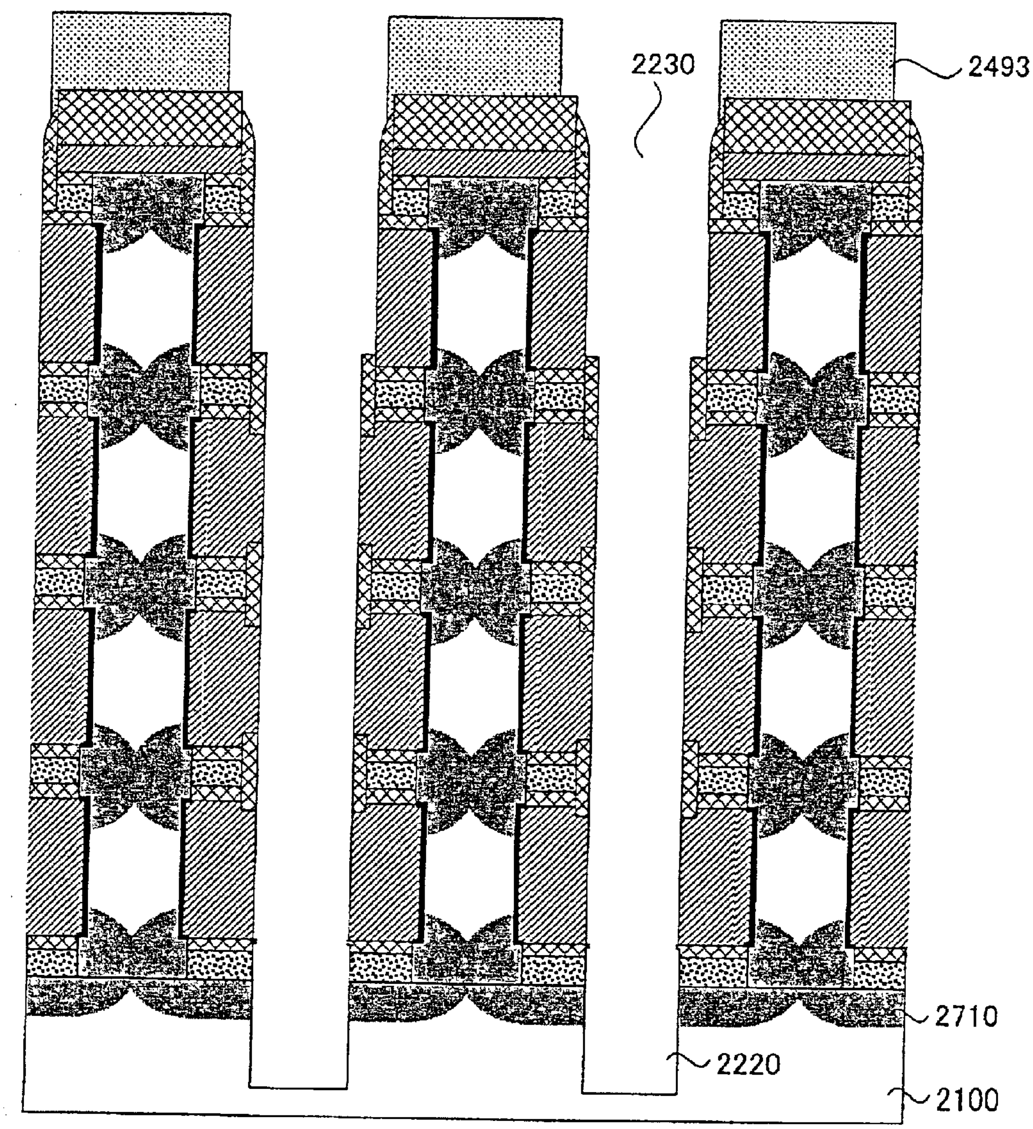
Figure 616:
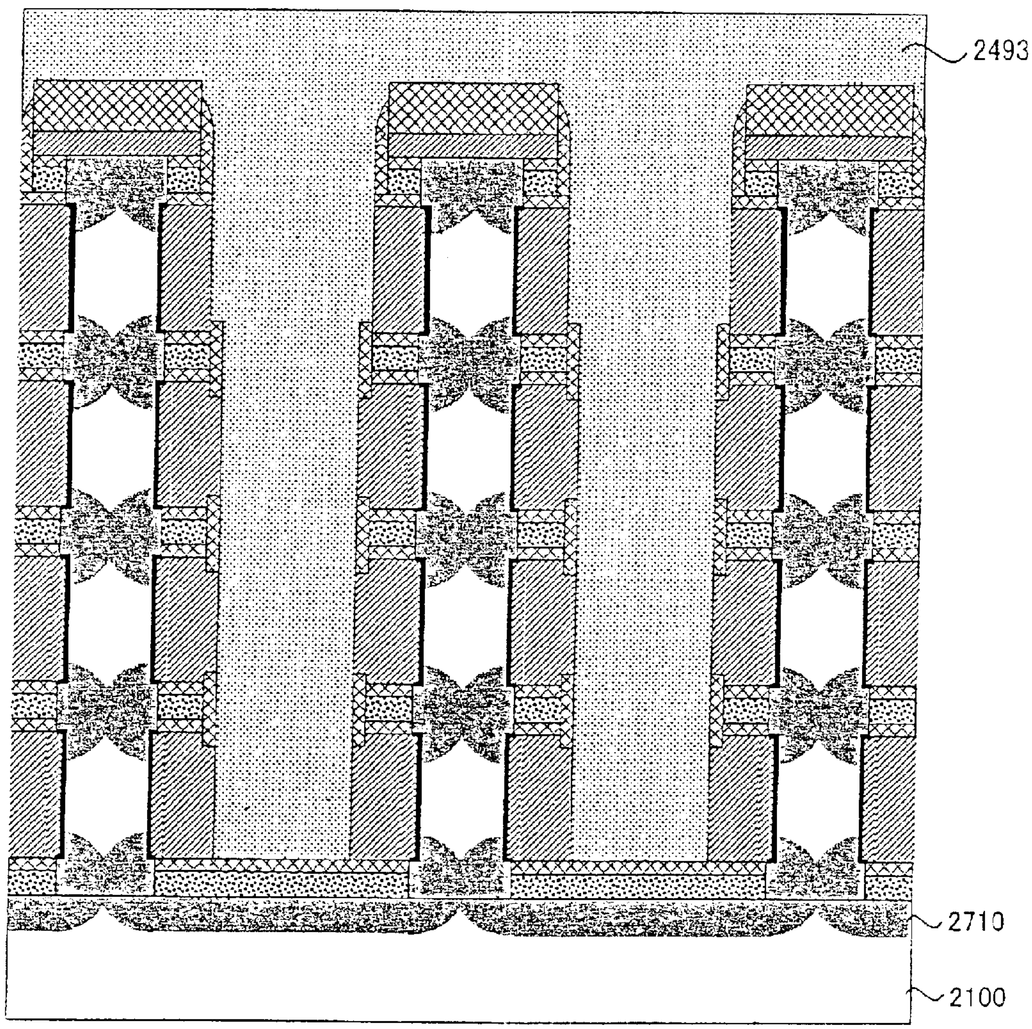
Figure 617:
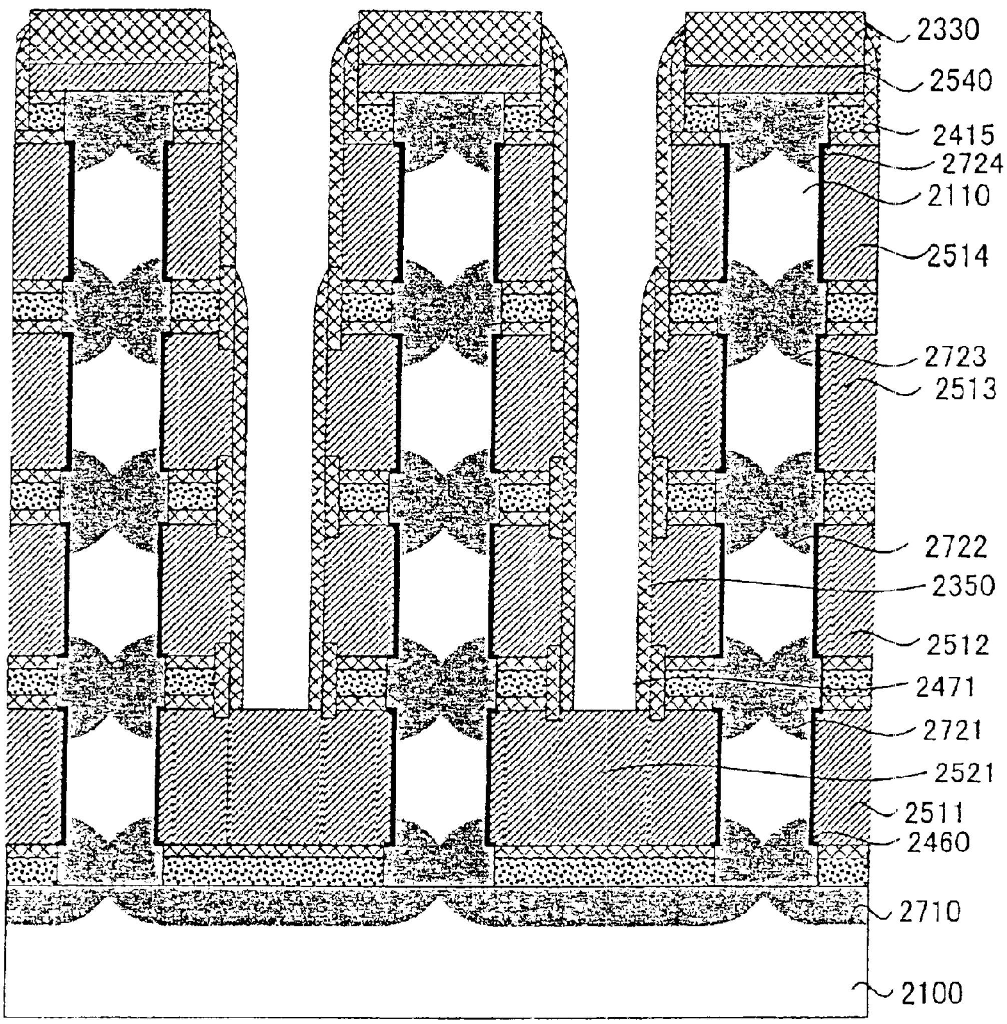
Figure 618:
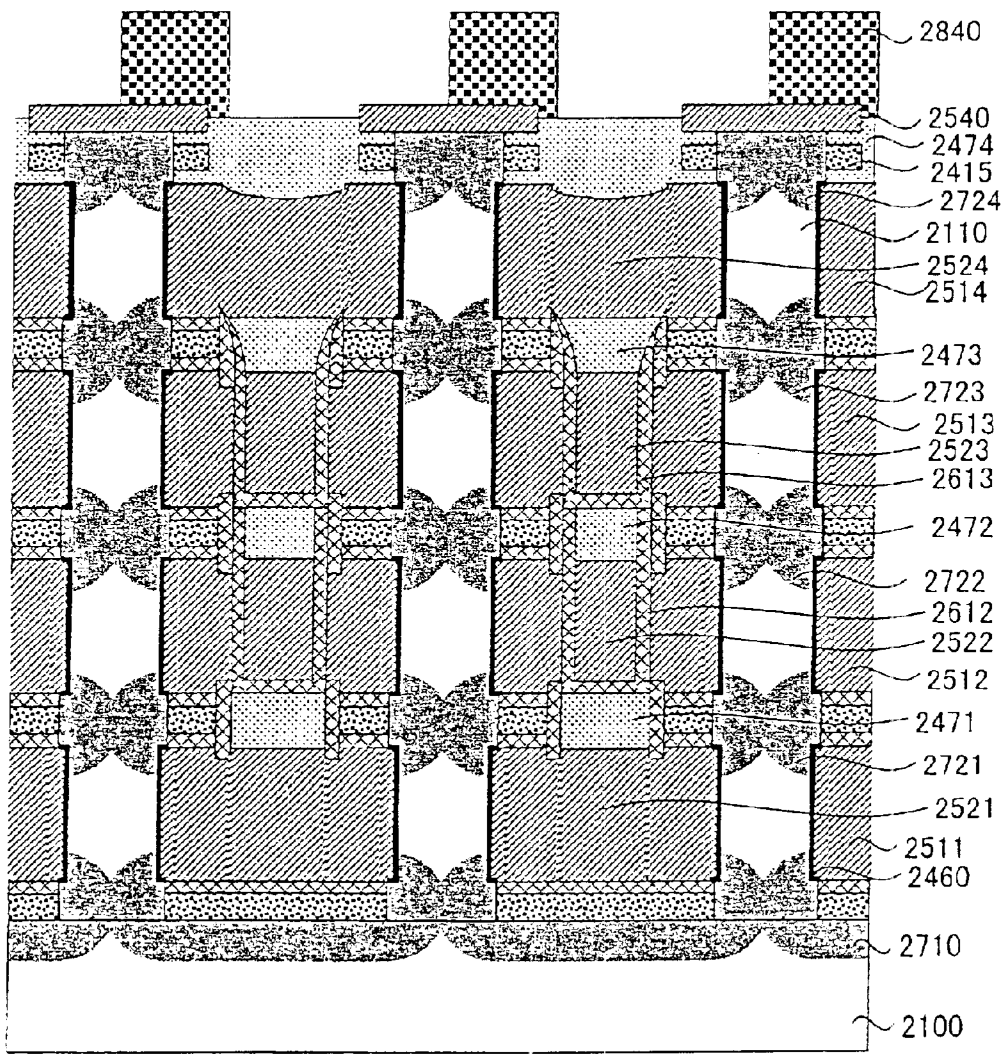
Figure 619:
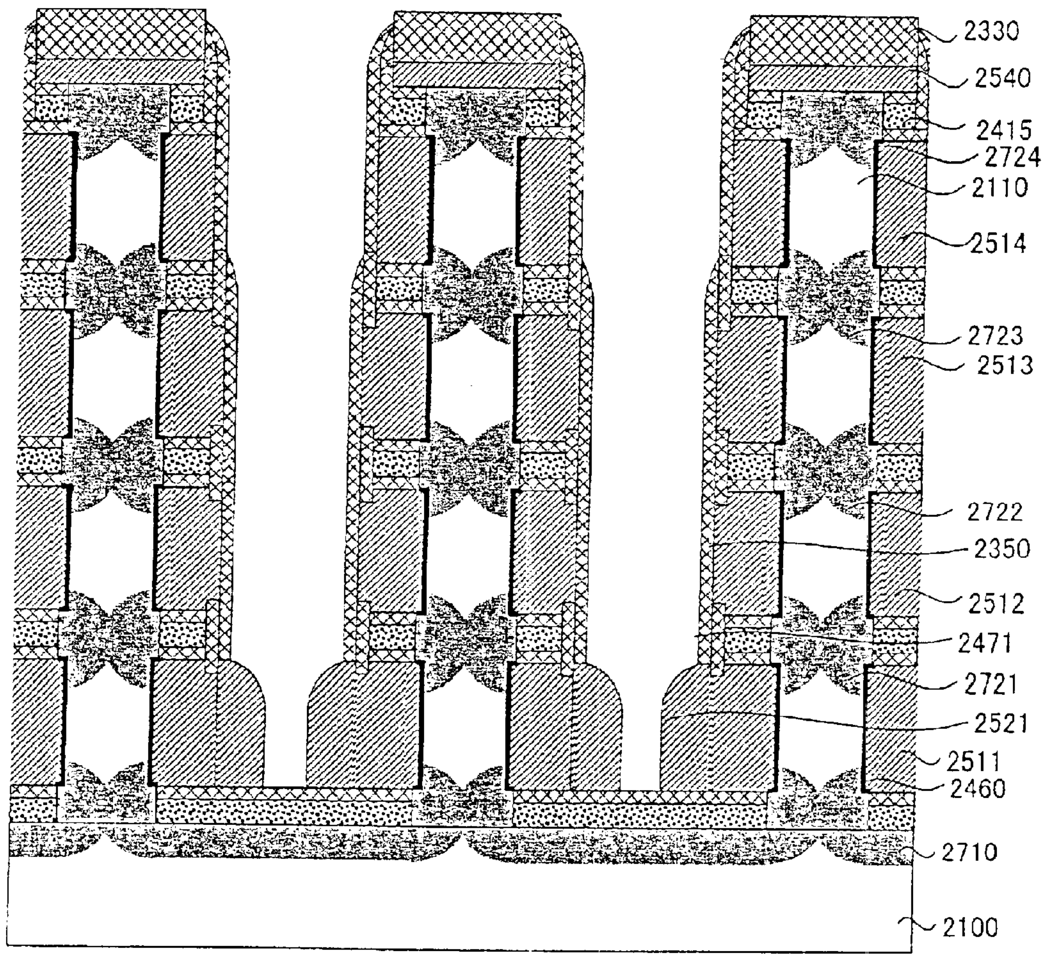
Figure 620:
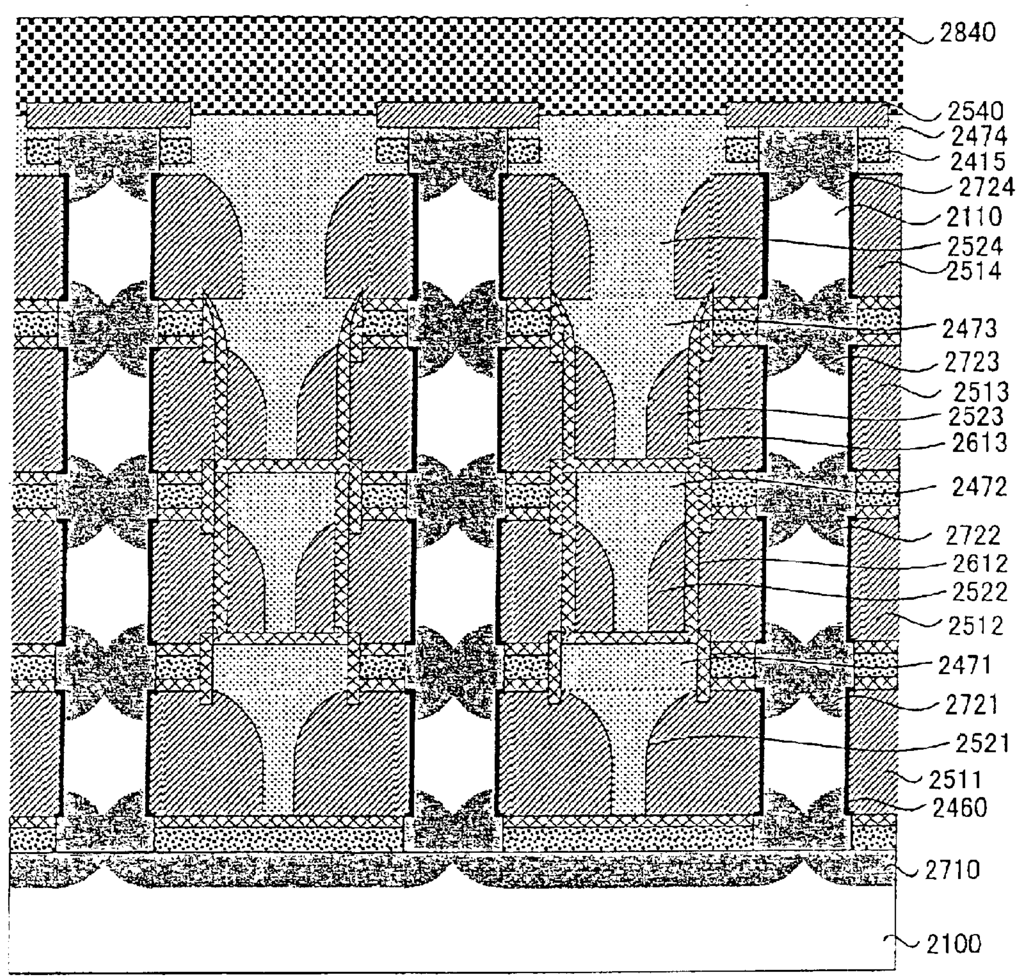
Figure 621:
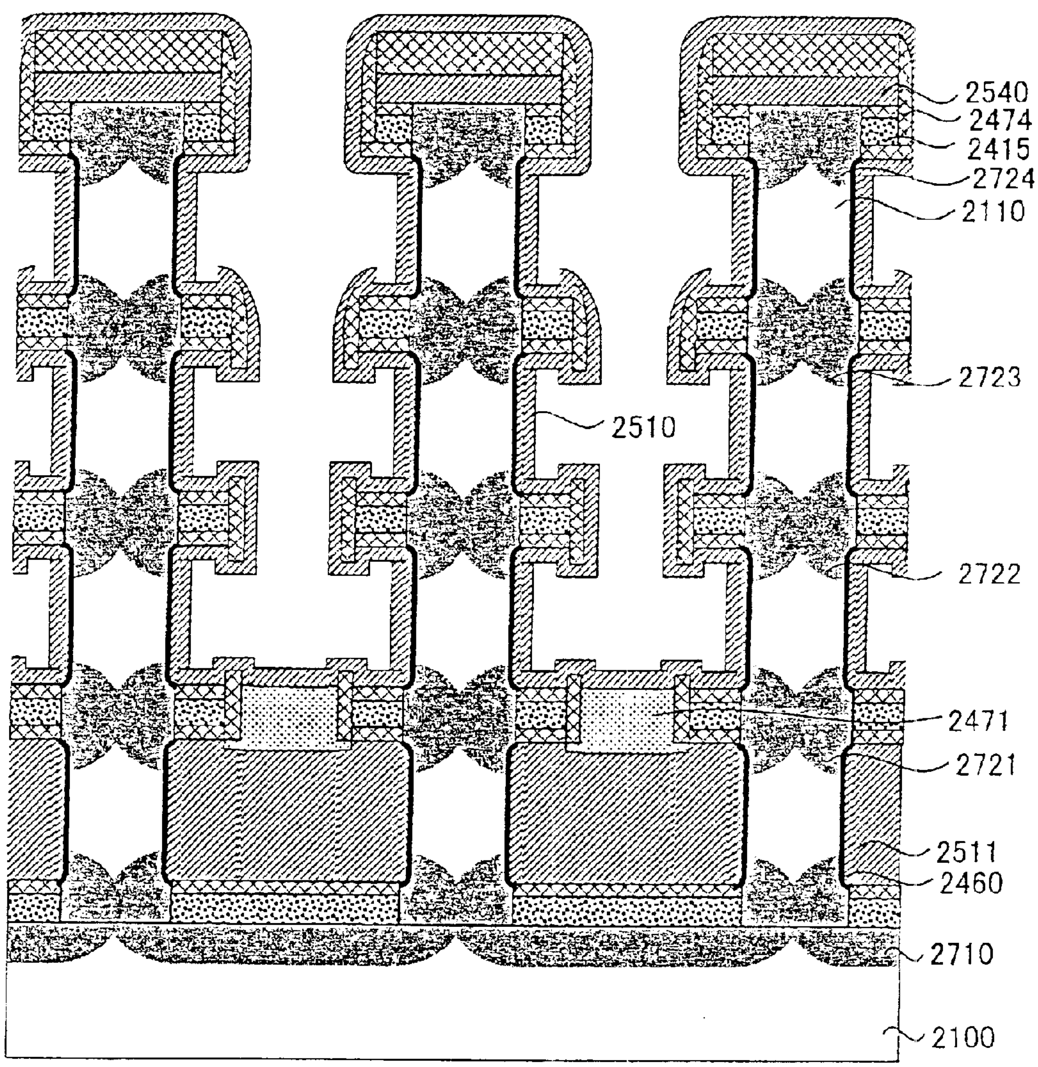
Figure 622:
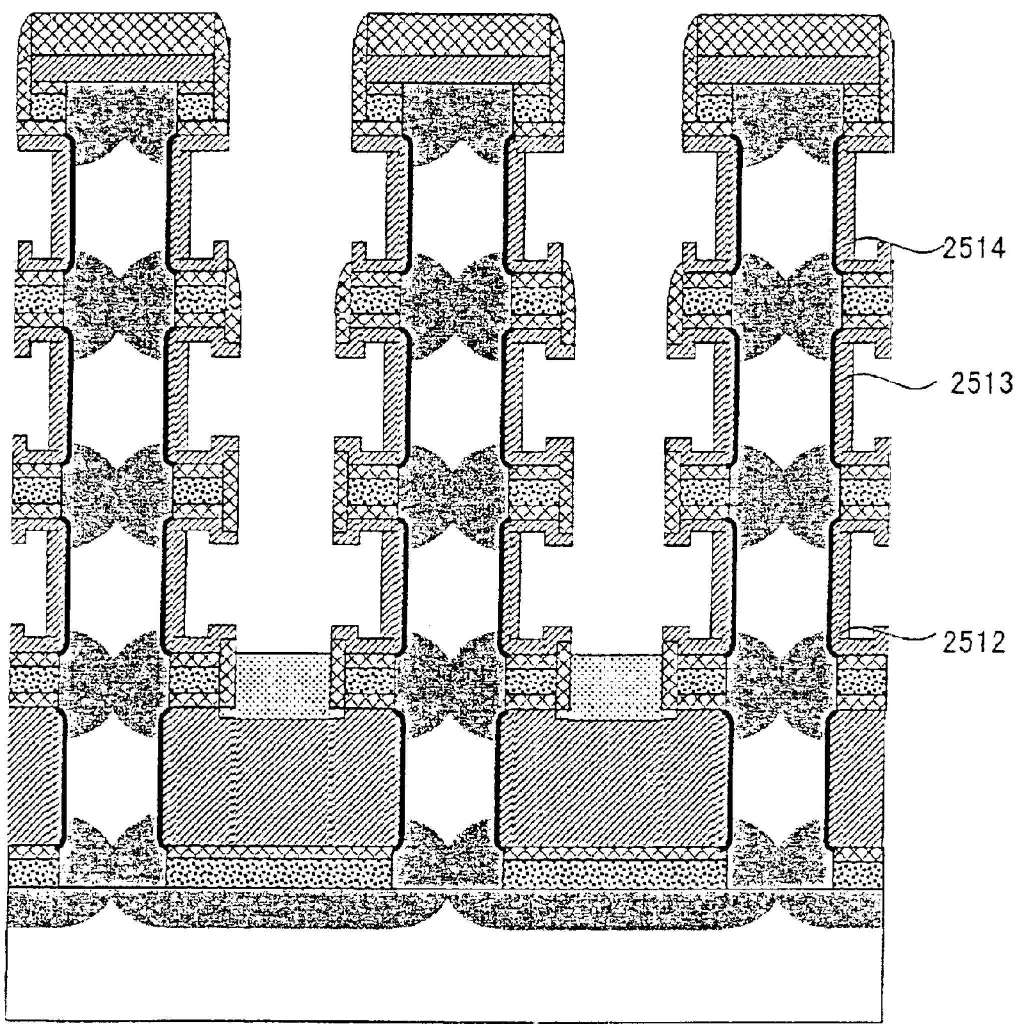
Figure 623:
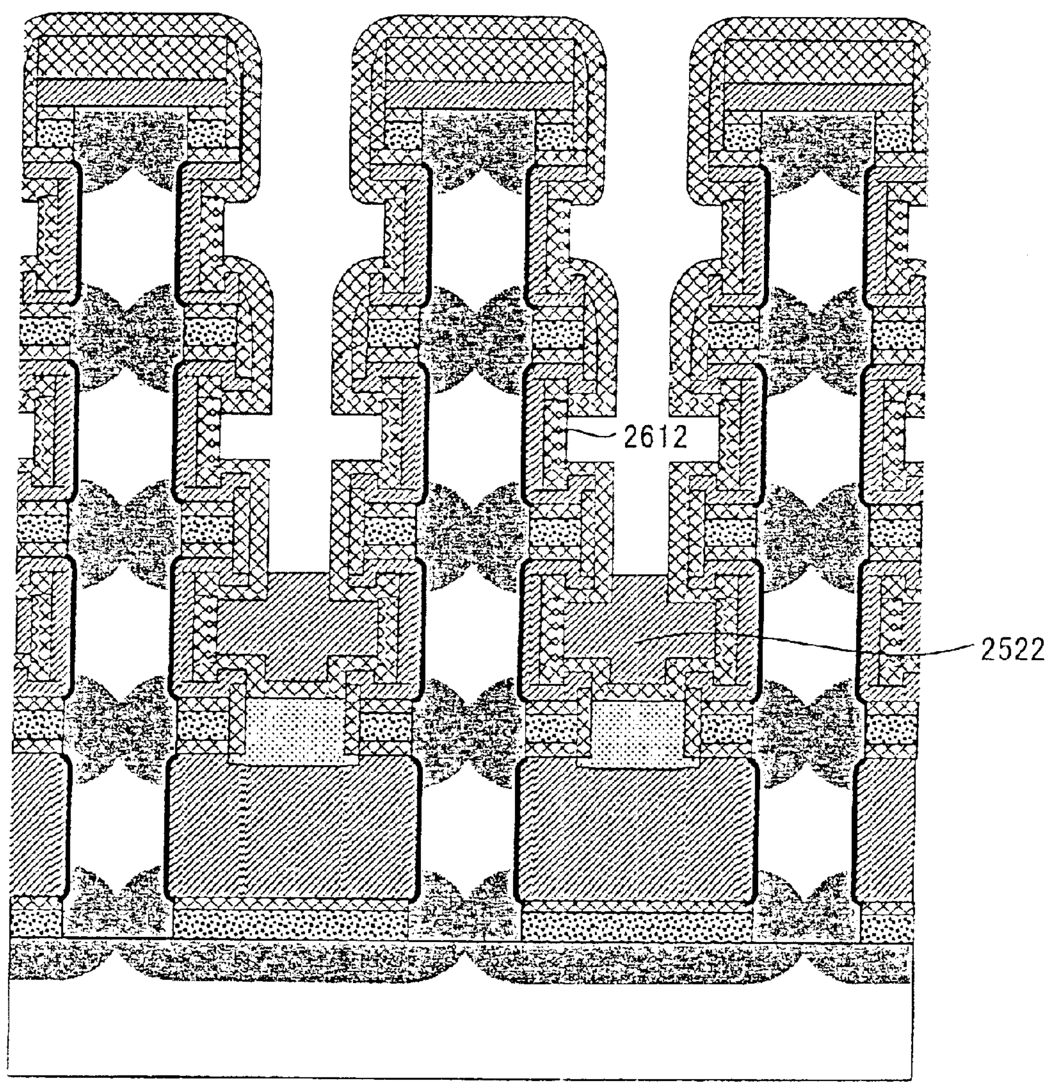
Figure 624:
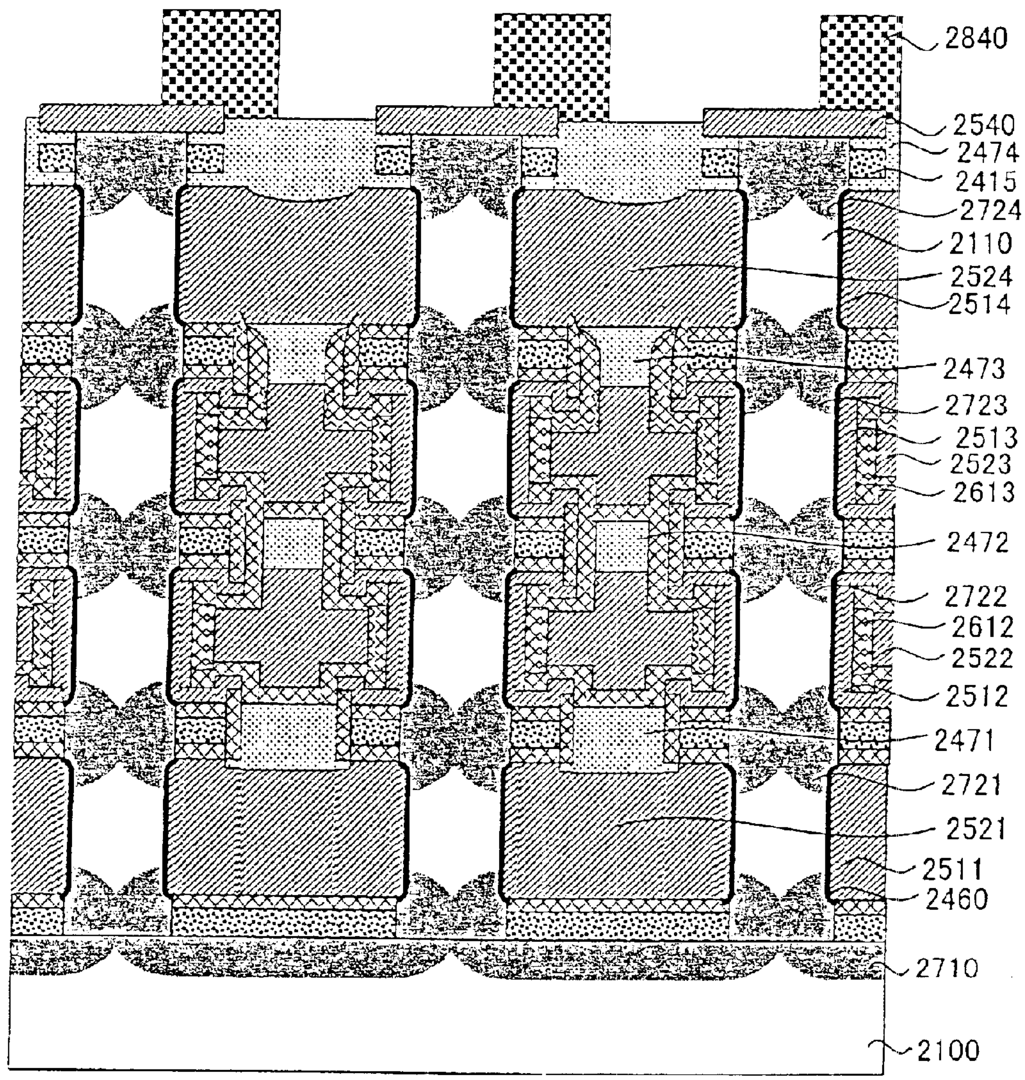
Figure 625:
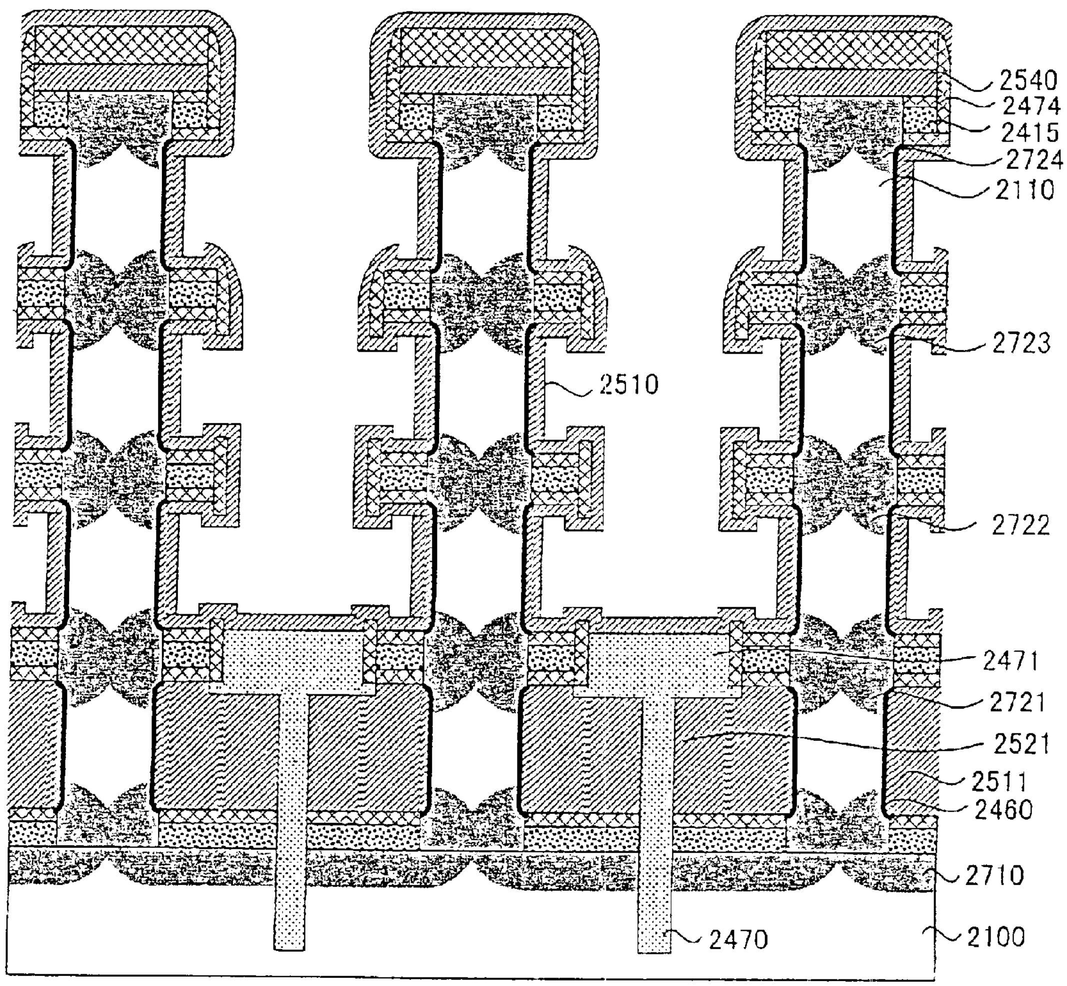
Figure 626:
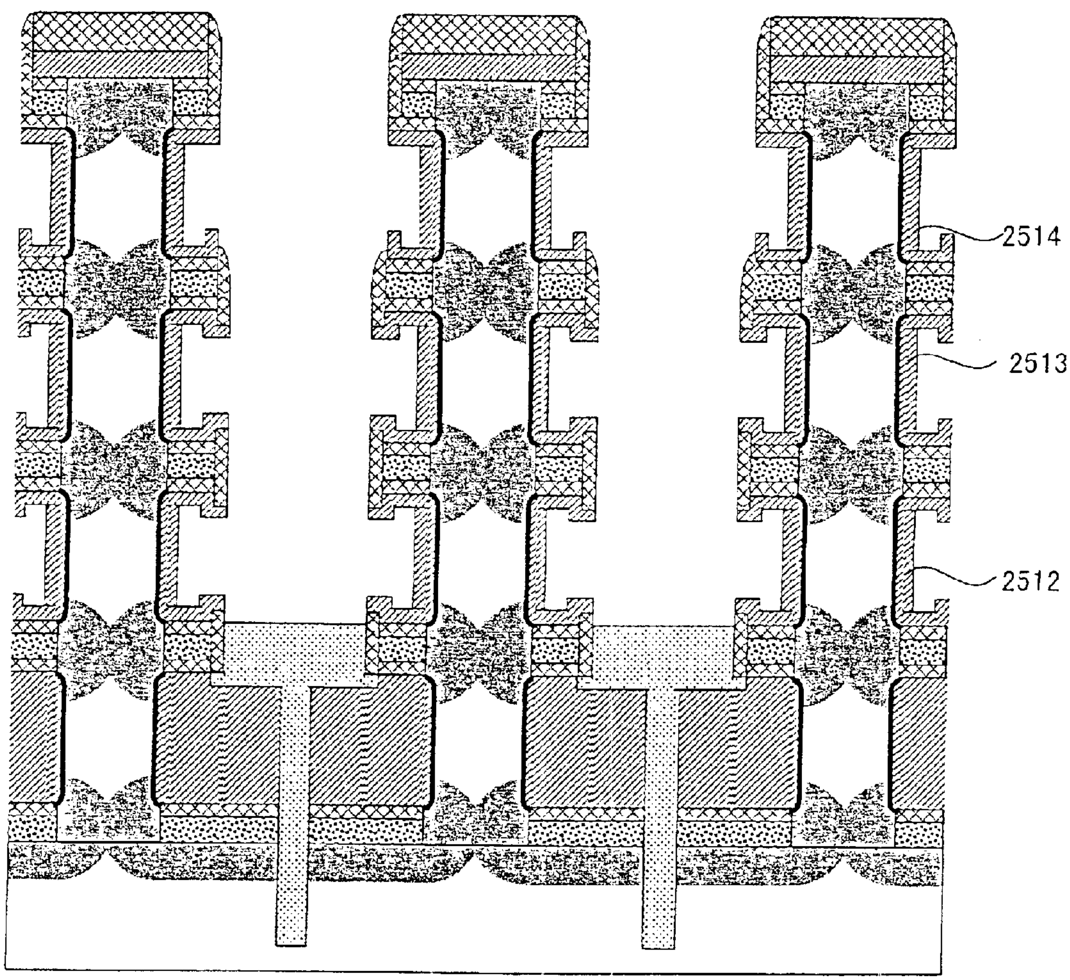
Figure 627:
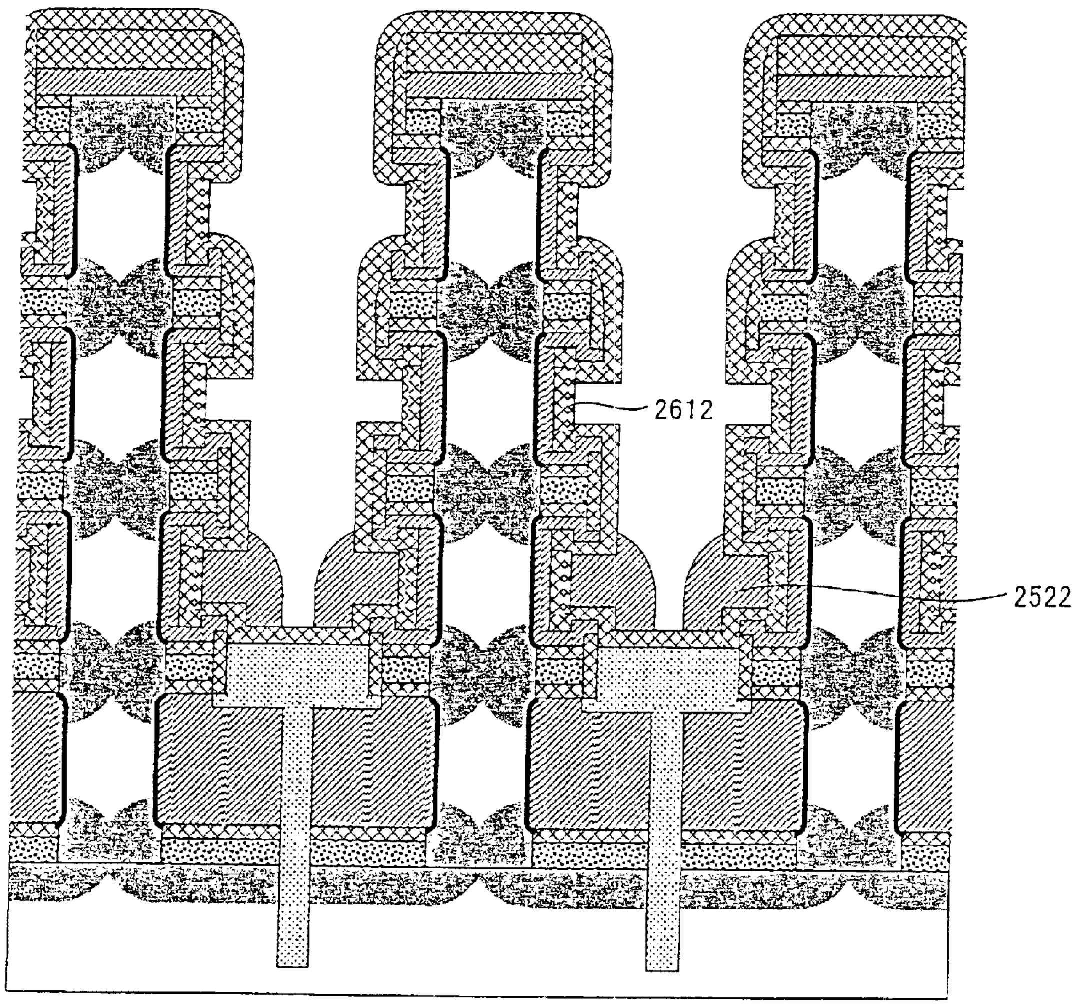
Figure 628:
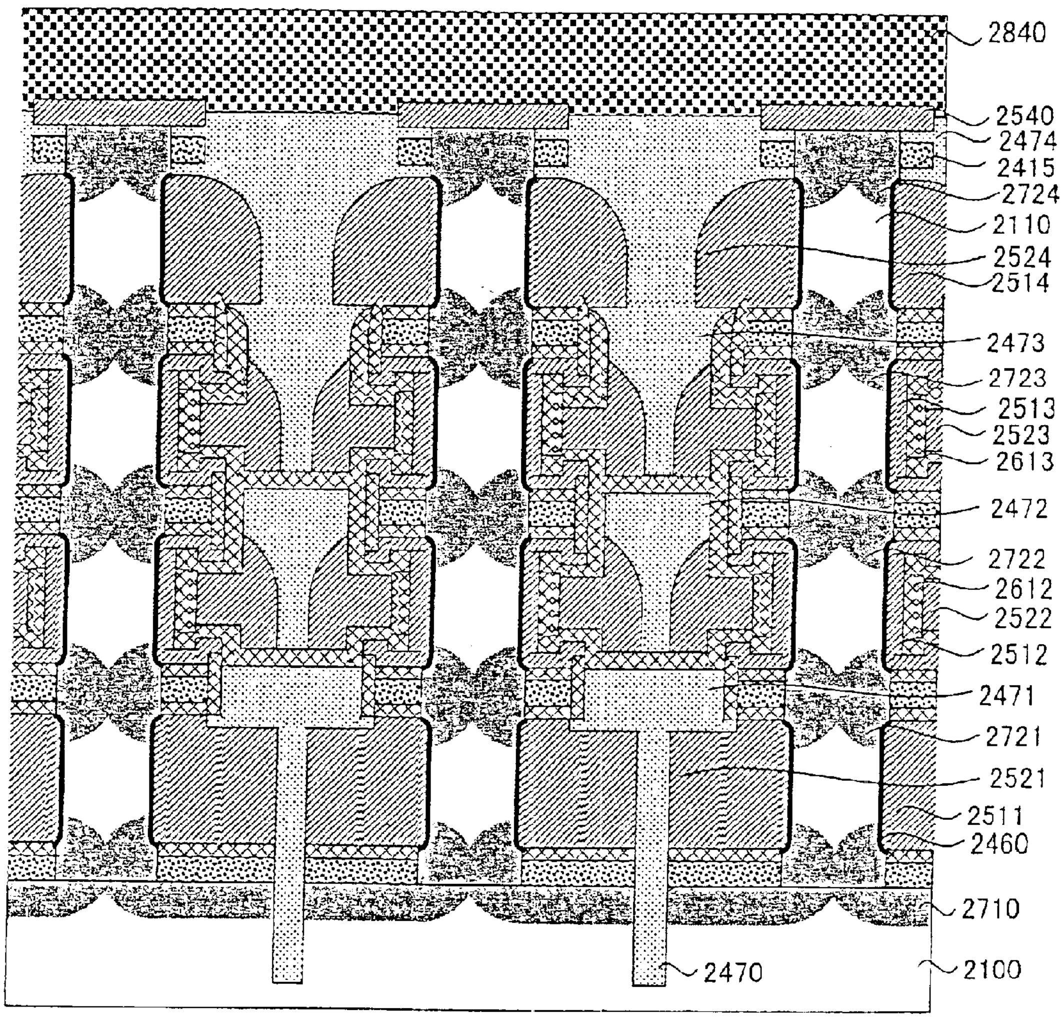
Figure 629:
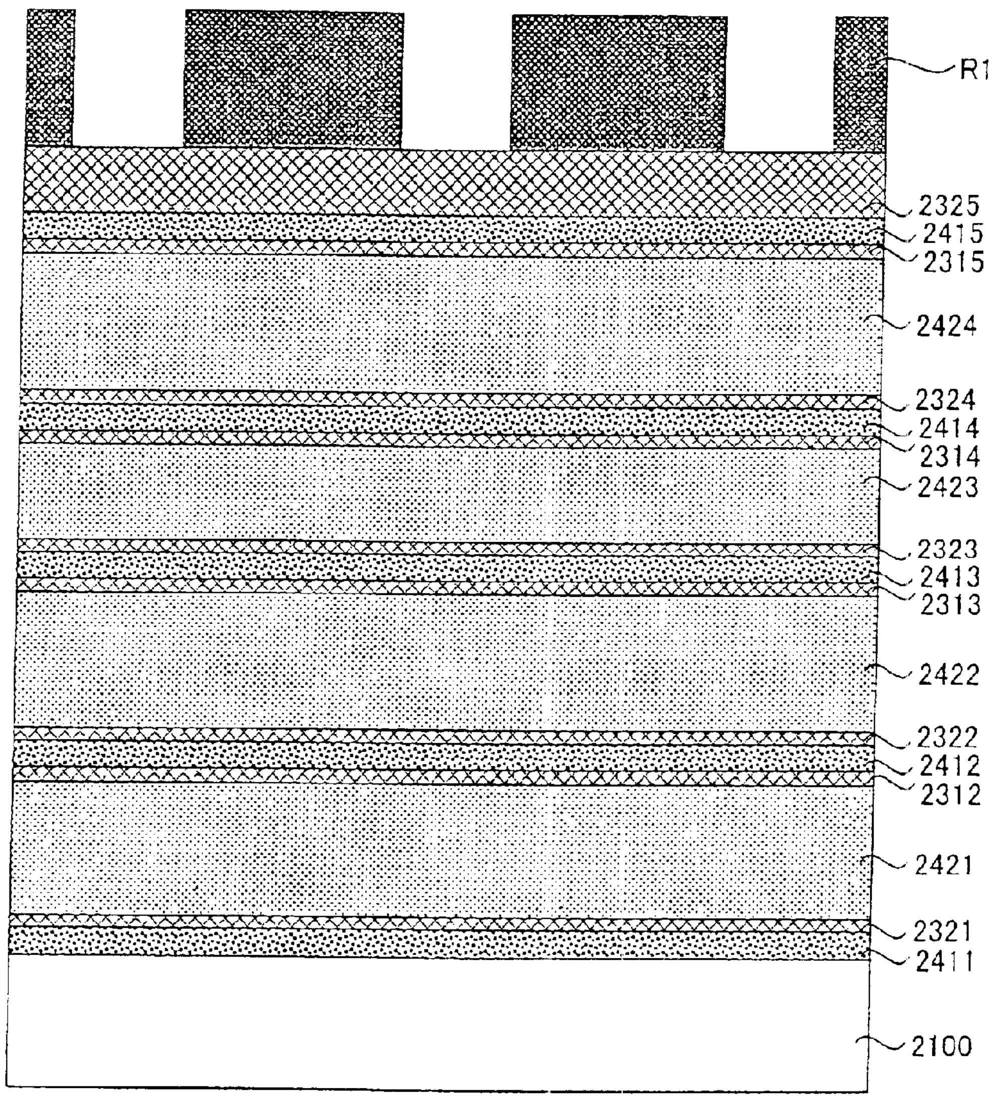
Figure 630:
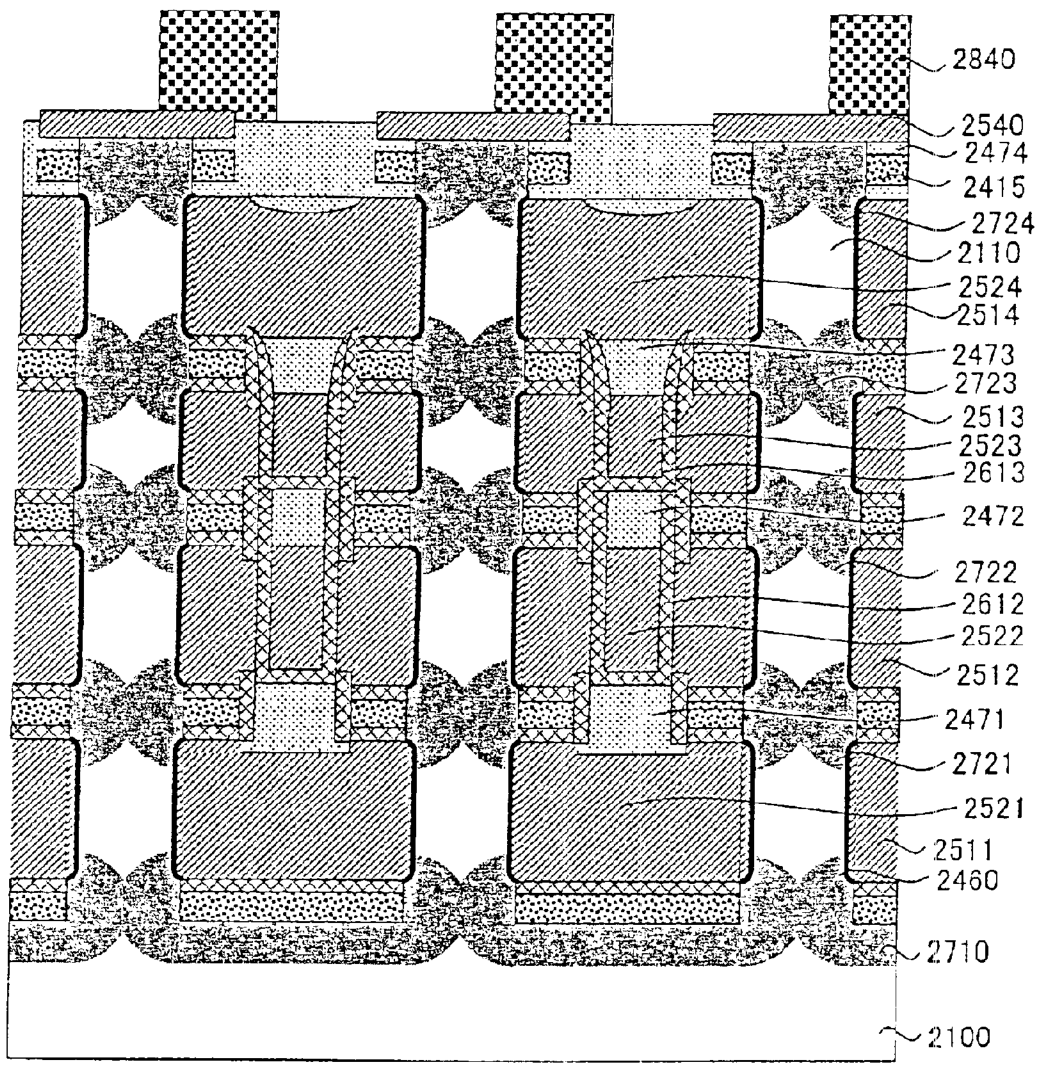
Figure 631:
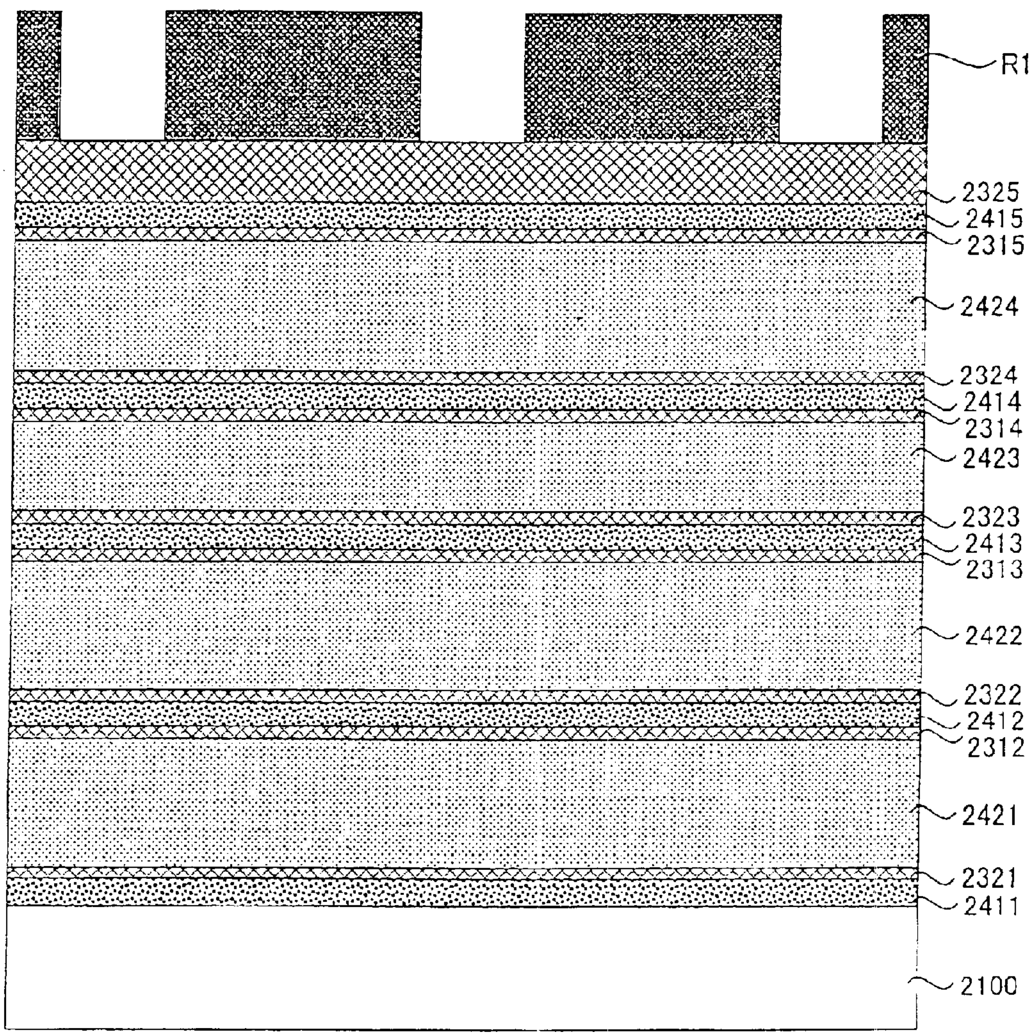
Figure 632:
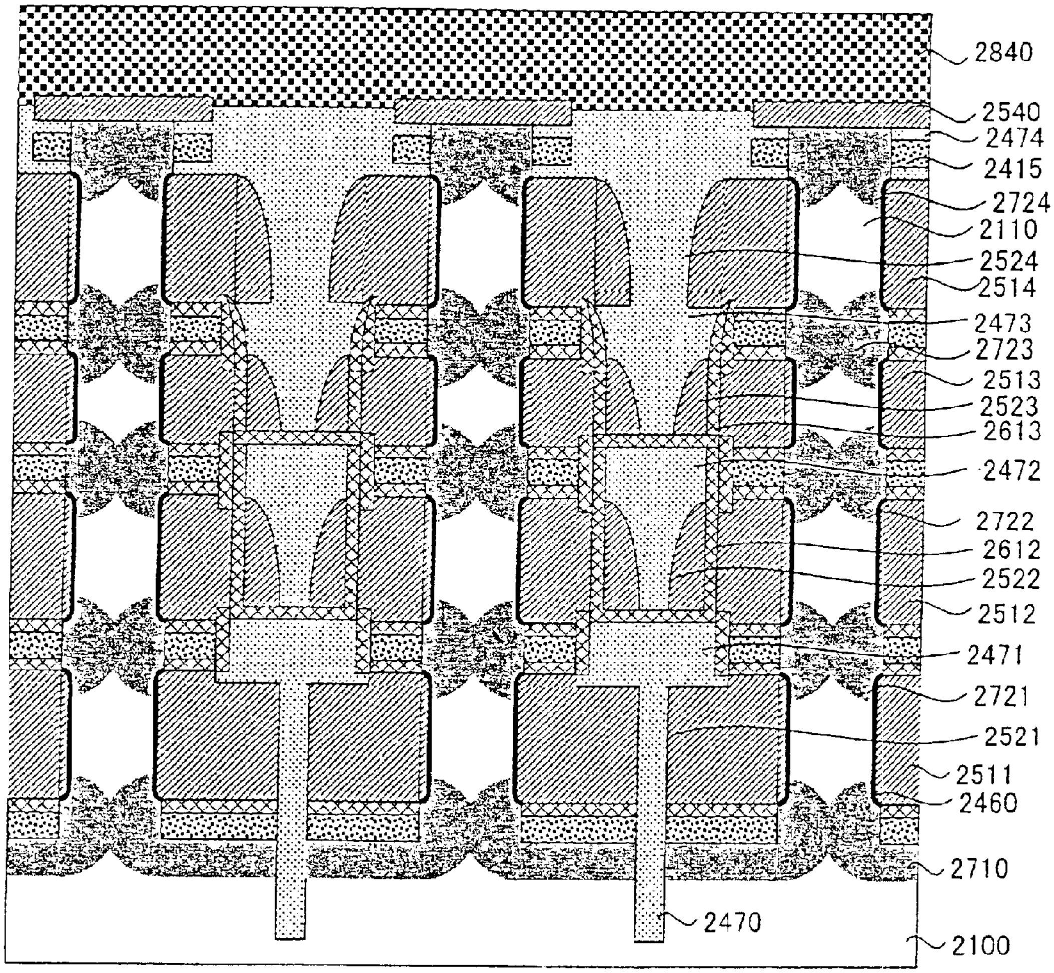
Figure 633:
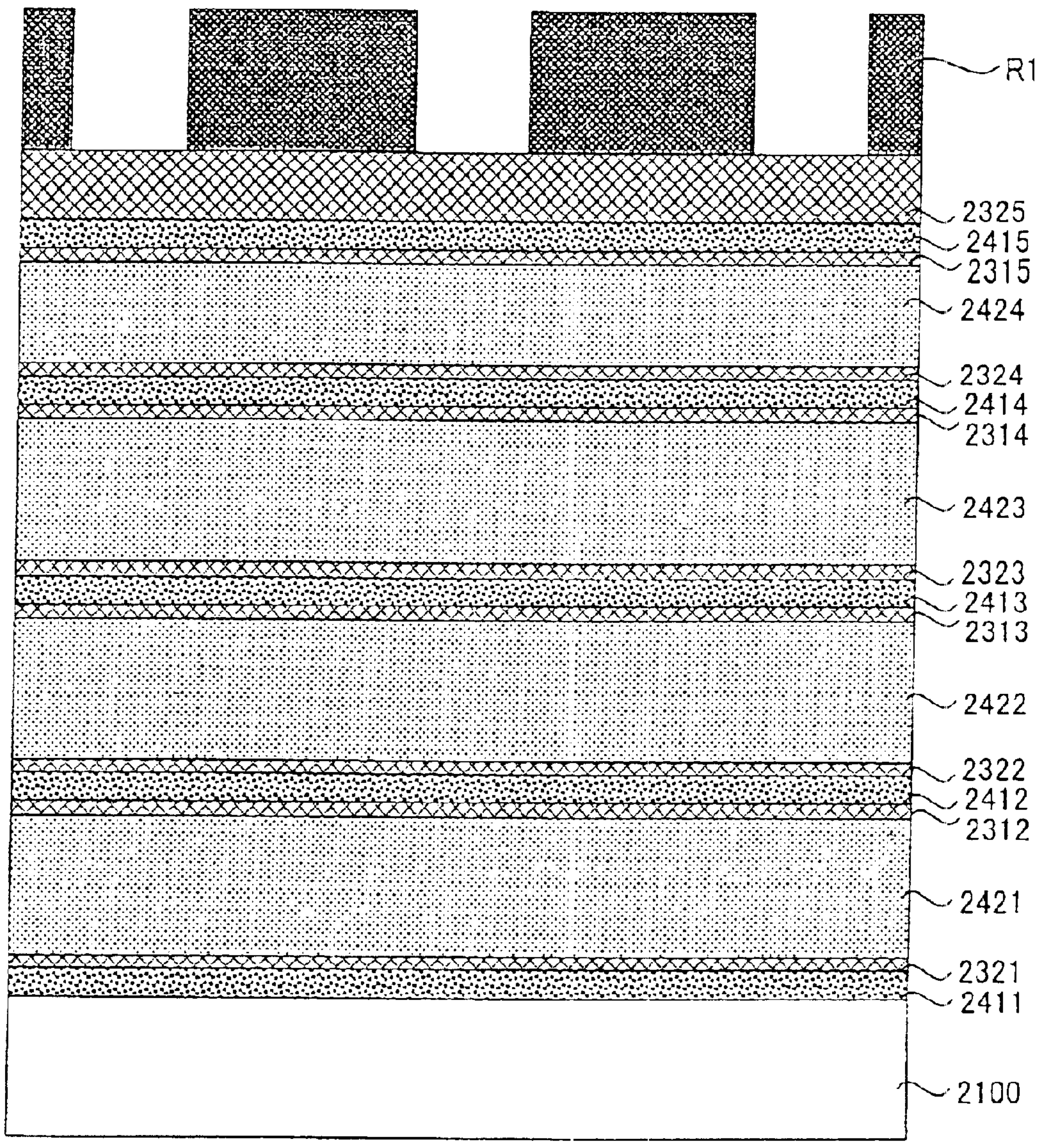
Figure 634:
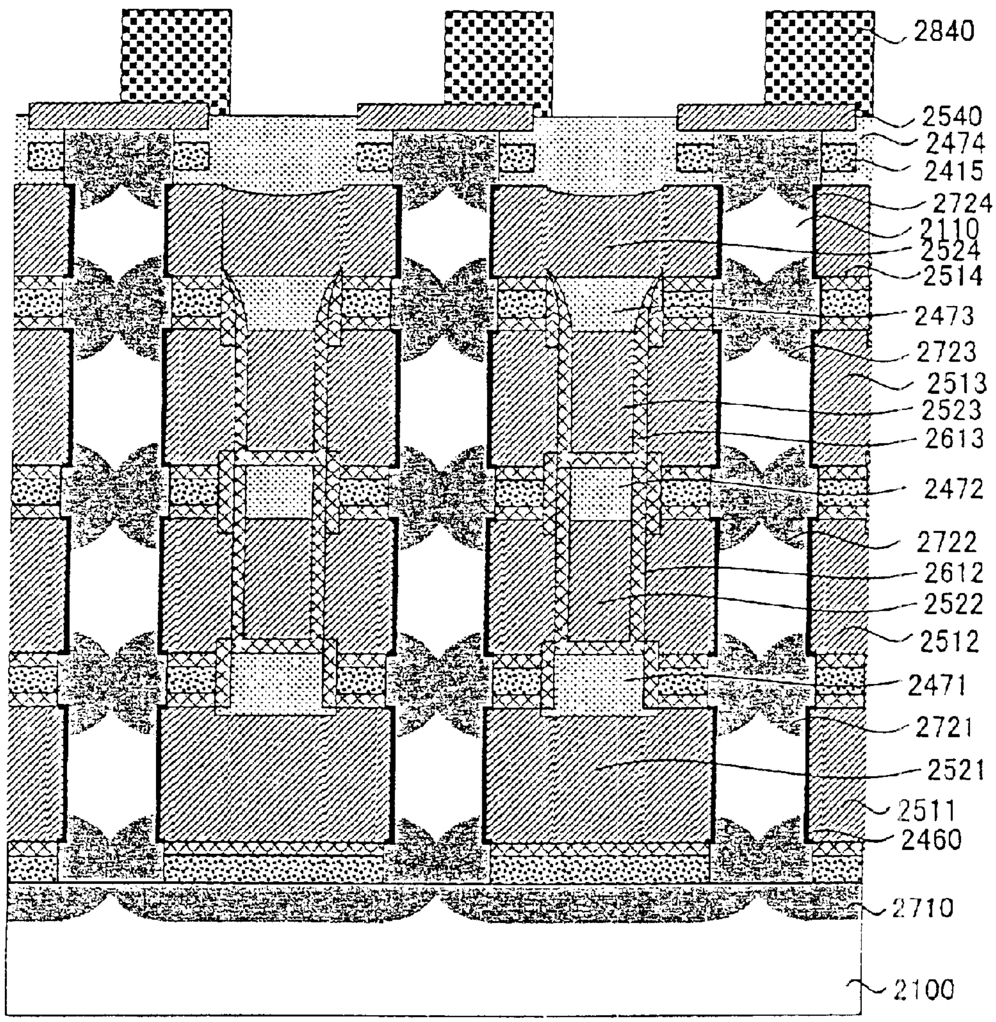
Figure 635:
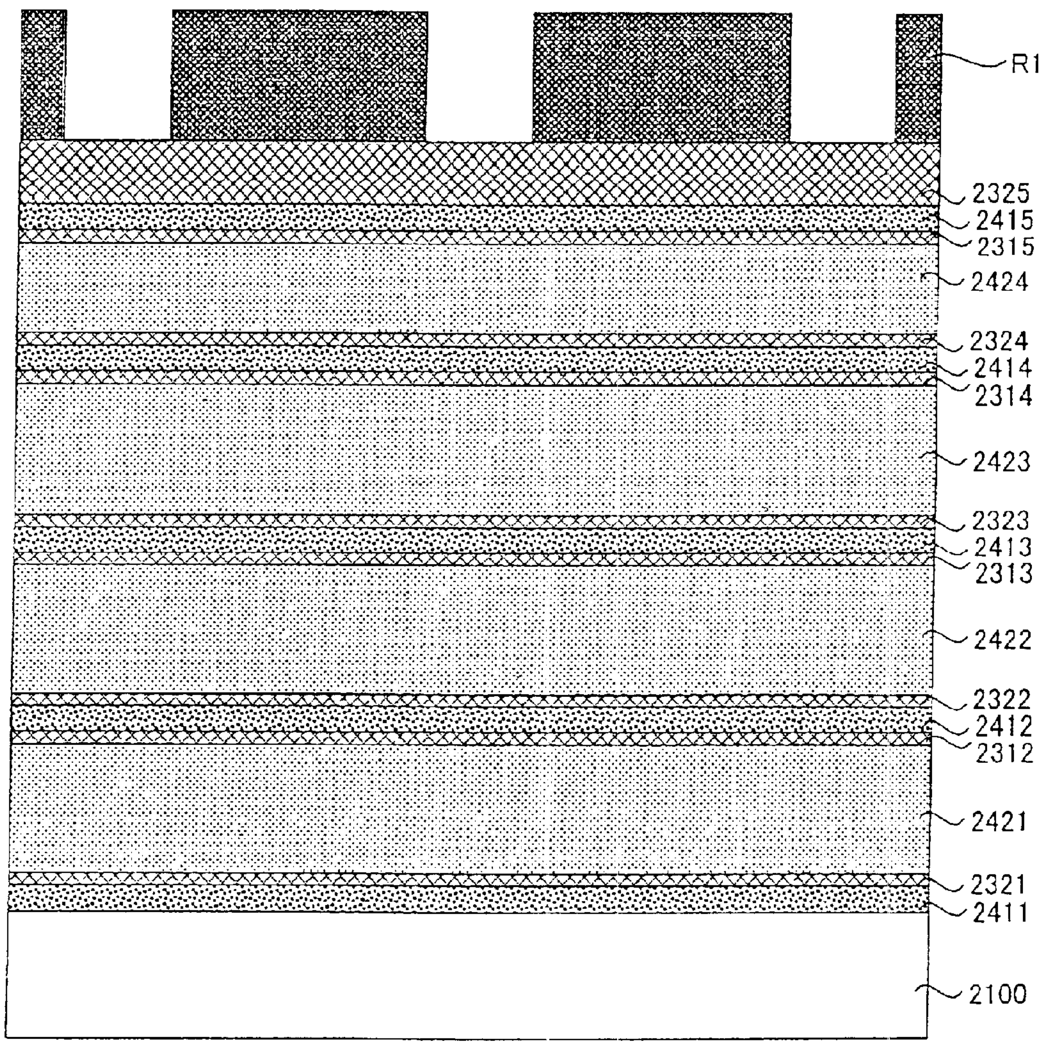
Figure 636:
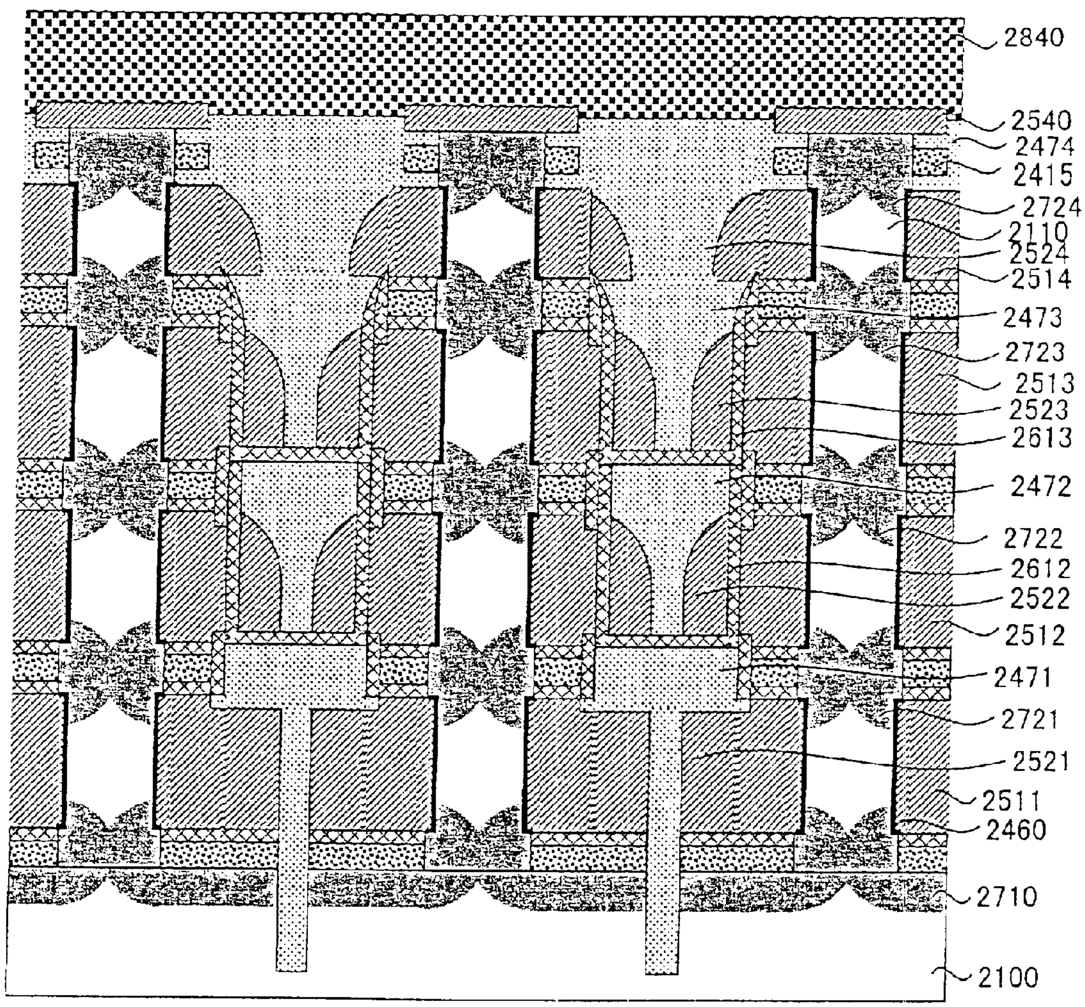

Using the silicon oxide film 2493 as a mask, the silicon nitride film 2321, the silicon oxide film 2411 and the semiconductor substrate 2100 are anisotropically etched to form a second trench 2220 (FIGS. 605 and 616).

Then, a silicon oxide film 2470 is buried as an eleventh insulating film in the second trench 2220.

Production steps thereafter follow Production Example 11 (FIGS. 331 to 335 and FIGS. 365 to 368). Thereby, a semiconductor memory is realized in which the first wiring layer is parallel to the fourth wiring layer and which has a memory function according to the state of a charge in the charge storage layer which is the floating gate made of the polysilicon film (the first conductive film).

PRODUCTION EXAMPLE 23

In an example of production process for producing a semiconductor memory in which regions for forming the charge storage layers are defined in advance by a laminated film comprising plural films, explanation is given of an example of production process for obtaining a structure in which the first wiring layers are connected in common to the memory array.

Such a semiconductor memory may be produced by the following production process. FIGS. 617 to 618 and FIGS. 619 to 620 are sectional views taken on line A-A' and line B-B', respectively, in FIG. 1 which is a plan view illustrating an EEPROM memory cell array.

In this example, the second trench 2220 is not formed in the semiconductor substrate 2100. This example is the same as Production Example 11 (FIGS. 304 to 335 and FIGS. 337 to 368) from which the steps regarding the formation of the second trench 2220 is omitted.

Thereby, a semiconductor memory is realized in which at least the first wiring layer in the array is not divided but is common and which has a memory function according to the state of a charge in the charge storage layer which is the floating gate made of the polysilicon film (the first conductive film).

PRODUCTION EXAMPLE 24

In an example of production process for producing a semiconductor memory in which regions for forming the charge storage layers are defined in advance by a laminated film comprising plural films, explanation is given of an example of production process for obtaining a structure in which a floating gate has a large surface area.

Such a semiconductor memory may be produced by the following production process. FIGS. 621 to 624 and FIGS. 625 to 628 are sectional views taken on line A-A' and line B-B', respectively, in FIG. 1 which is a plan view illustrating an EEPROM memory cell array.

A polysilicon film 2510, which is a first conductive film covering a semiconductor layer 2110, is deposited uniformly along the shape of recesses in which the floating gates are defined. Thereby, the junction capacitance of the control gate increases.

PRODUCTION EXAMPLE 25

In an example of production process for producing a semiconductor memory in which regions for forming the charge storage layers are defined in advance by a laminated film comprising plural films, explanation is given of an example of production process in which the transistor gates have different lengths in a vertical direction.

Such a semiconductor memory may be produced by the following production process. FIGS. 629 to 632 and FIGS. 633 to 636 are sectional views taken on line A-A' and line B-B', respectively, in FIG. 1 which is a plan view illustrating an EEPROM memory cell array.

Regarding the polysilicon films (the first conductive films) 2511 to 2514 to be the memory cell gates or the selection gates, the memory cell gates of the polysilicon films 2512 and 2513 may have different lengths in a direction vertical to the semiconductor substrate 2100 as shown in FIGS. 629 to 630 and 633 to 634, the selection gates of the polysilicon films 2511 and 2514 may have different lengths in a direction vertical to the semiconductor substrate 2100 as shown in FIGS. 631 to 632 and 635 to 636. Further, the polysilicon films 2511 to 2514 may have different vertical lengths.

PRODUCTION EXAMPLE 26

In an example of production process for producing a semiconductor memory in which regions for forming the charge storage layers are defined in advance by a laminated film comprising plural films, explanation is given of an example of production process in which the island-like semiconductor layers have different shapes.

Such a semiconductor memory may be produced by the following production process. FIGS. 637 to 638 and FIGS. 639 to 640 are sectional views taken on line A-A' and line B-B', respectively, in FIG. 1 which is a plan view illustrating an EEPROM memory cell array.

Figure 637:
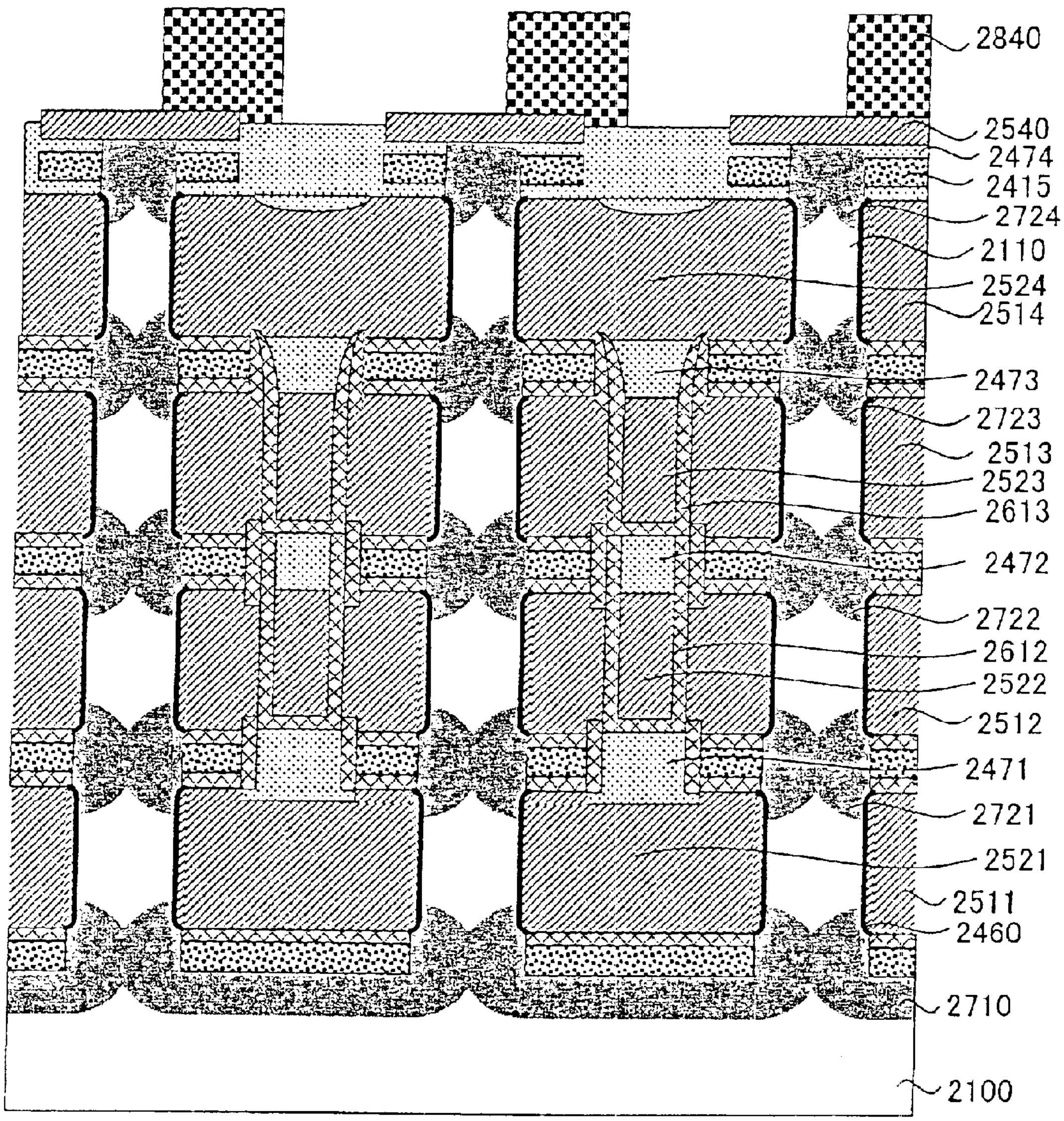
Figure 638:
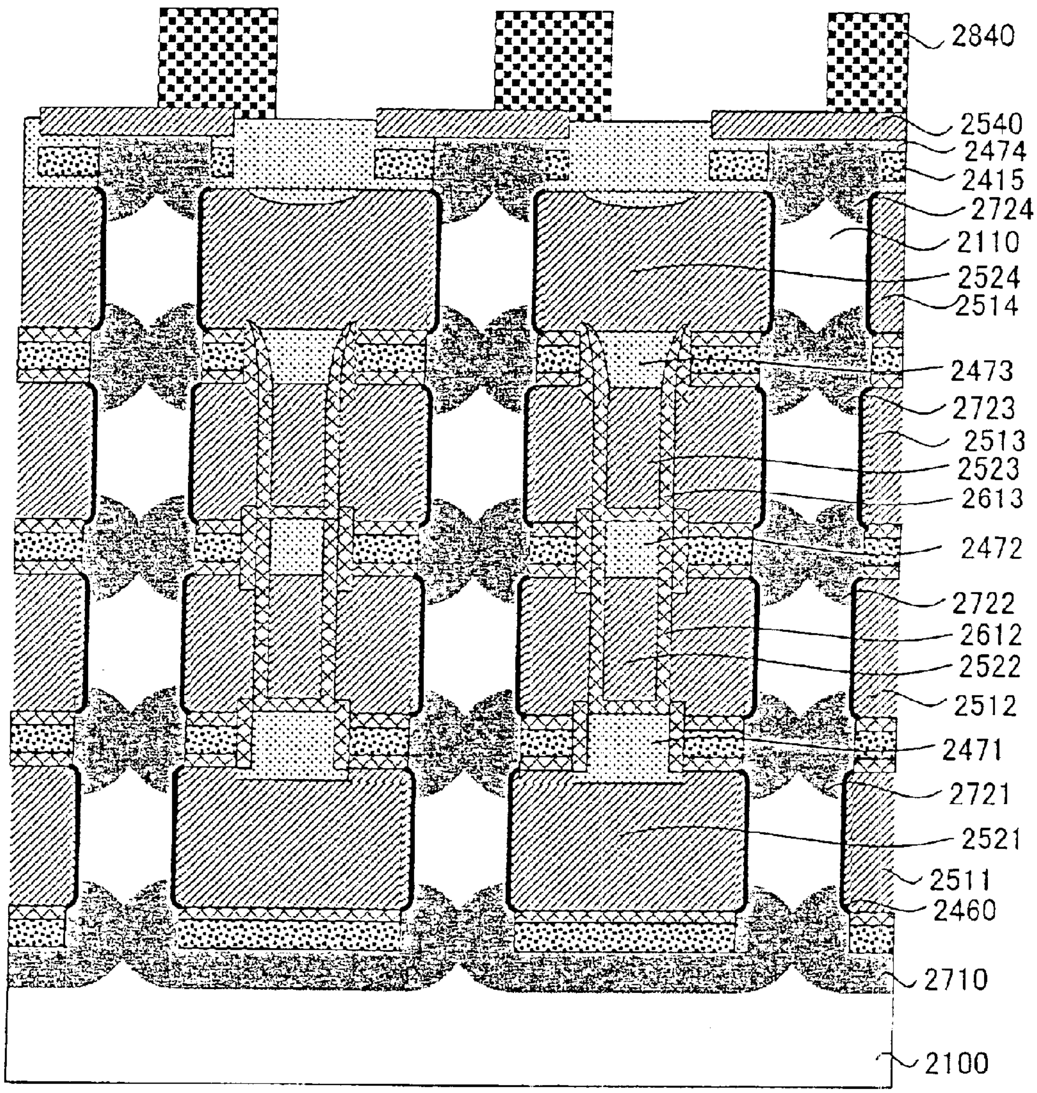
Figure 639:
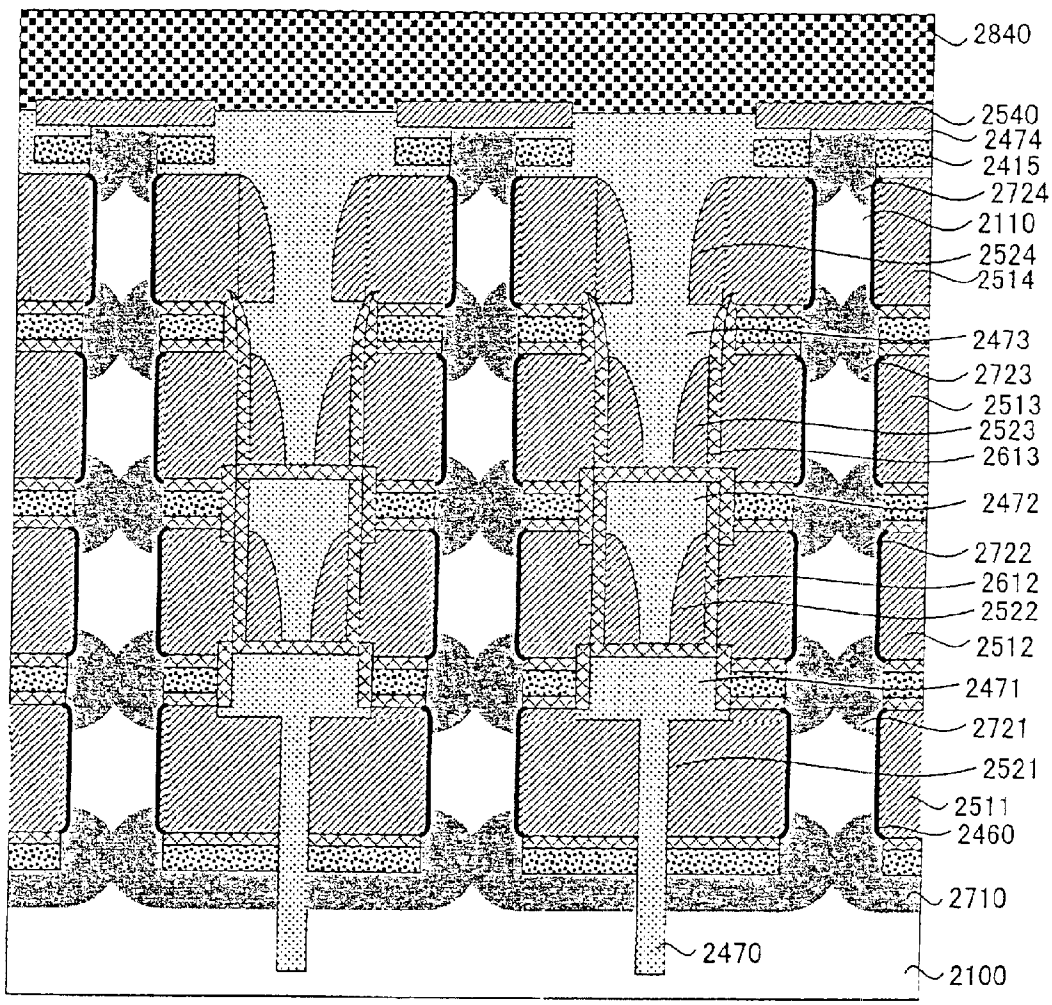

At the formation of the first trench 2210 by reactive ion etching, the island-like semiconductor layer 2110 may have the top and the bottom having different outward shape as shown in FIGS. 637 and 639. Also the top and the bottom of the island-like semiconductor layer 2110 may be shifted in a horizontal direction as shown in FIG. 638 and FIG. 640.

Figure 640:
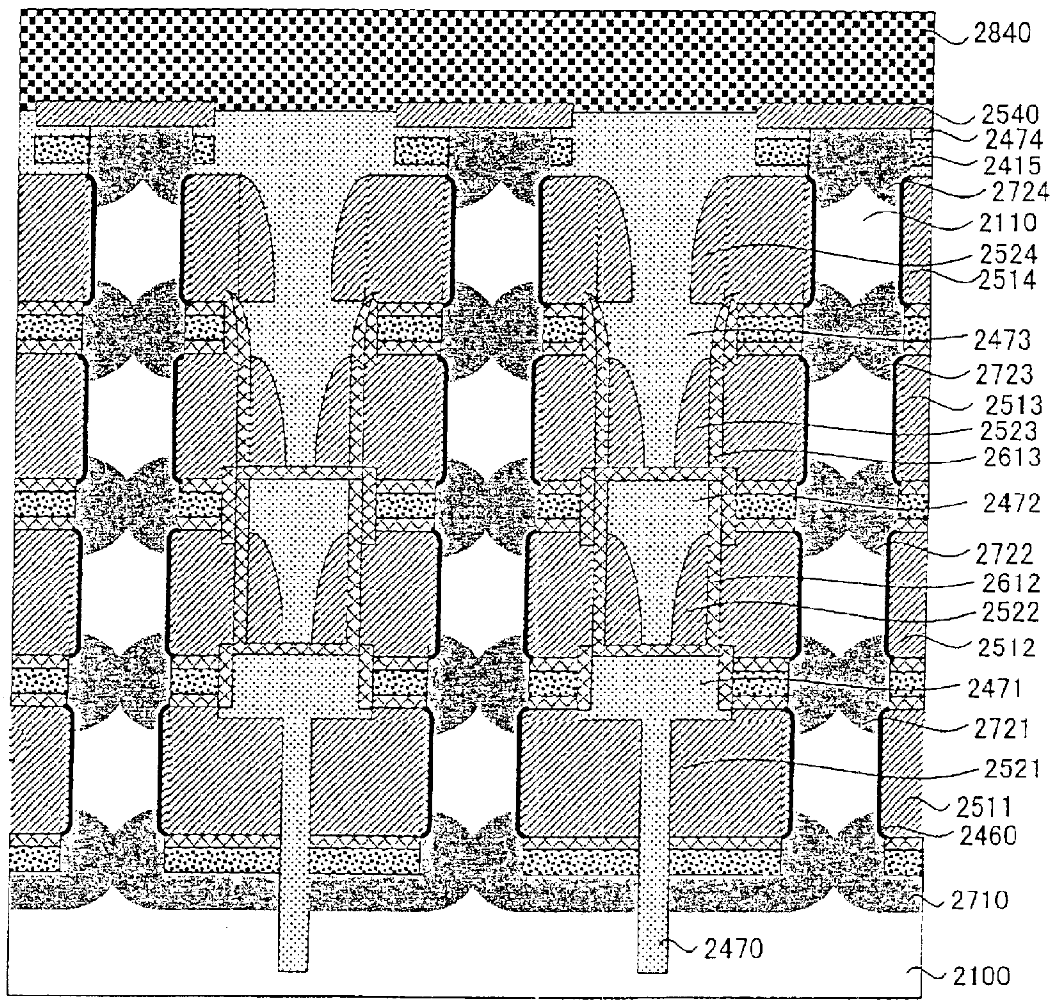
Figure 641:
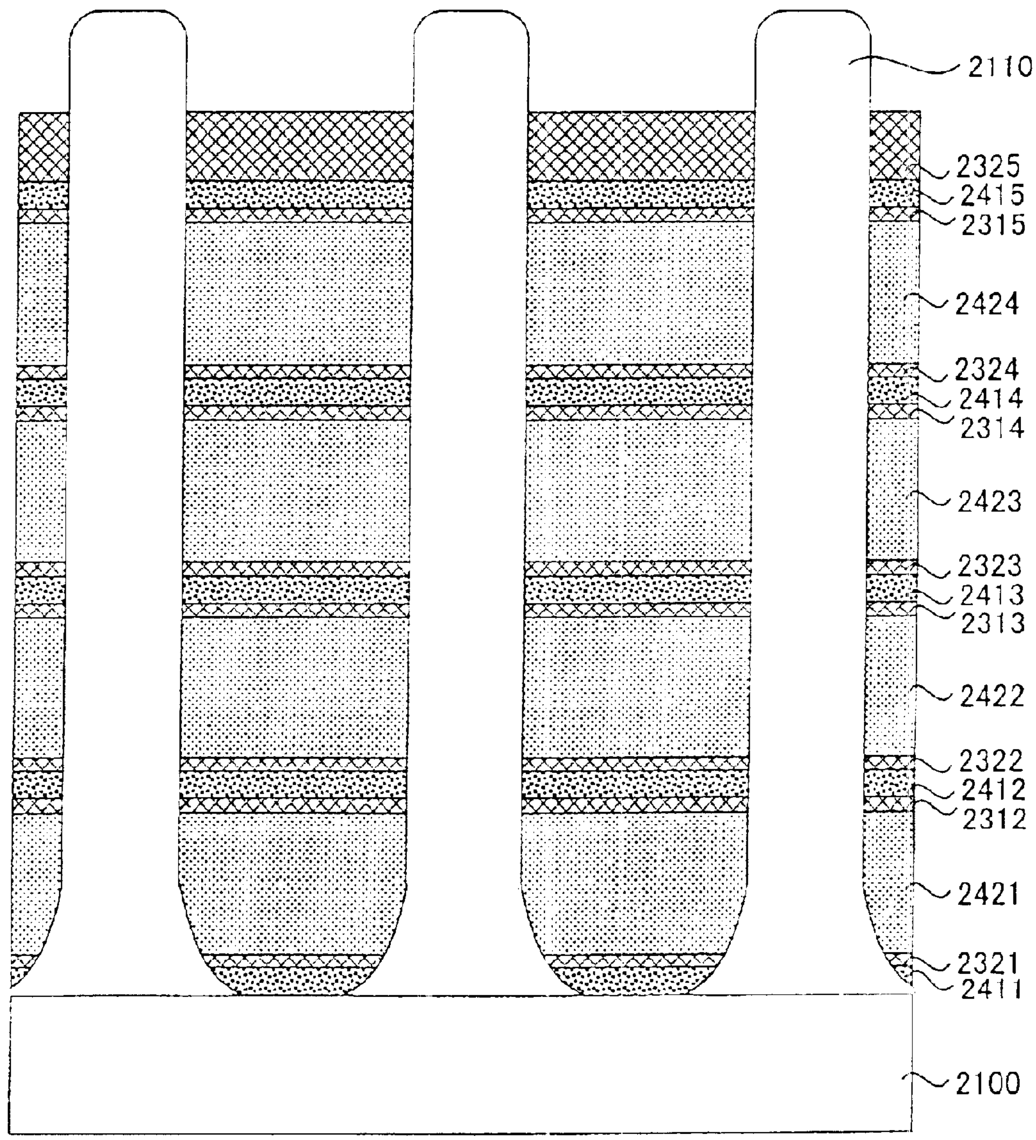
Figure 642:
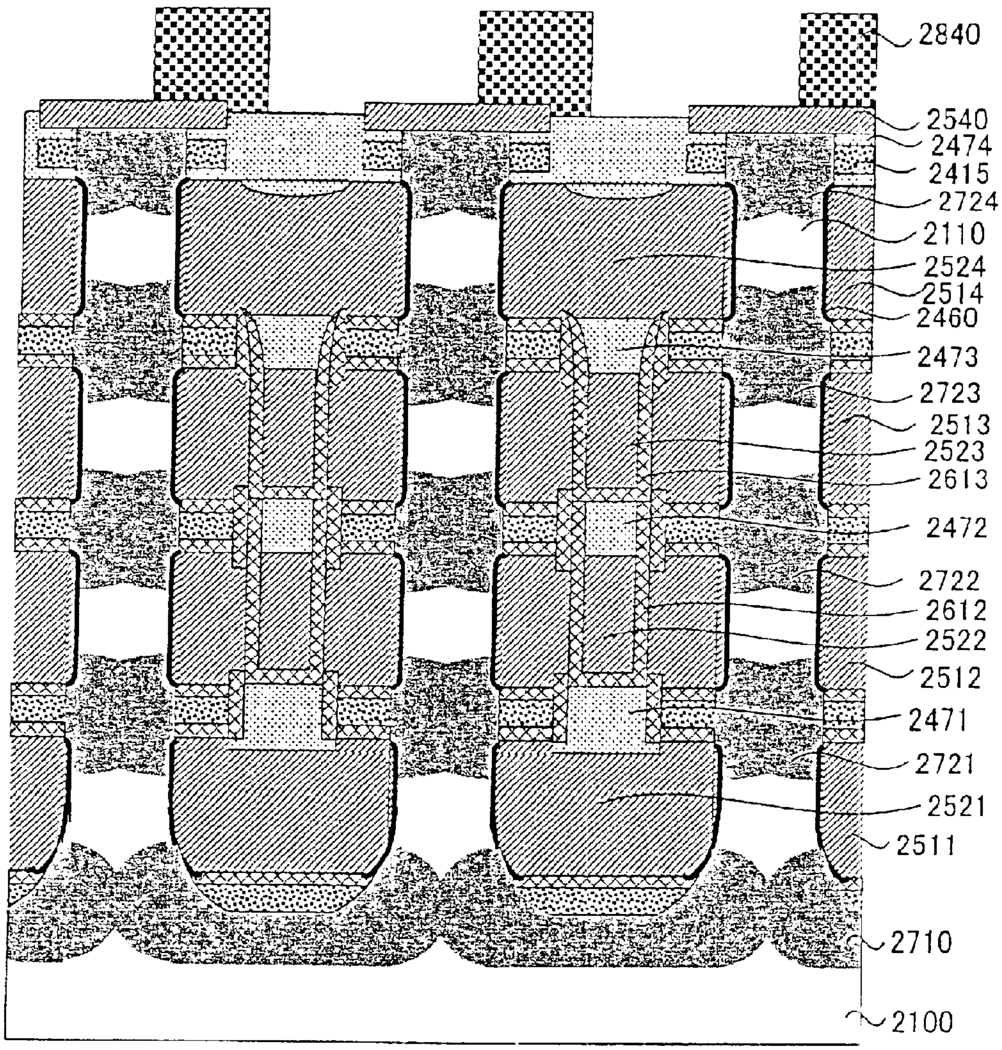
Figure 643:
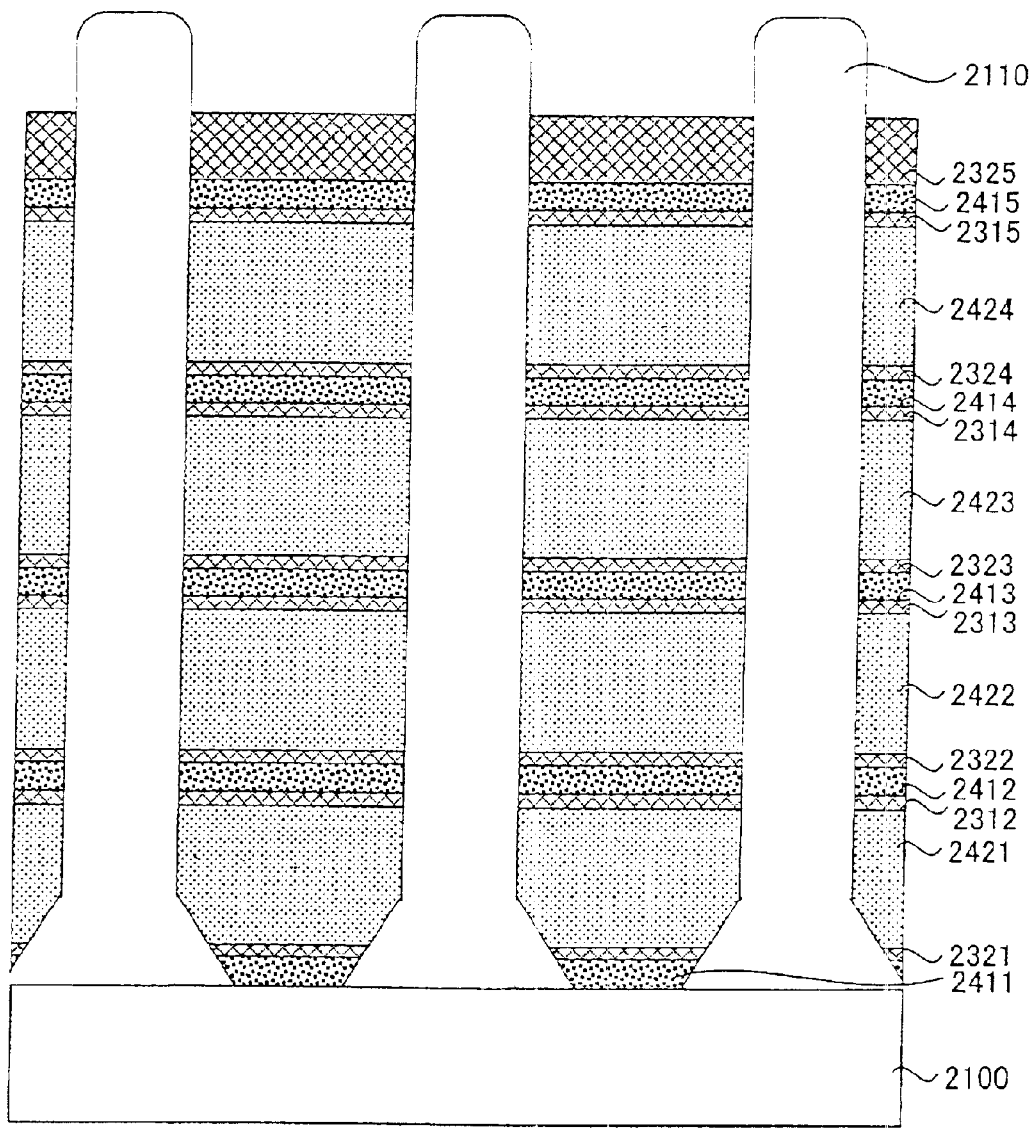
Figure 644:
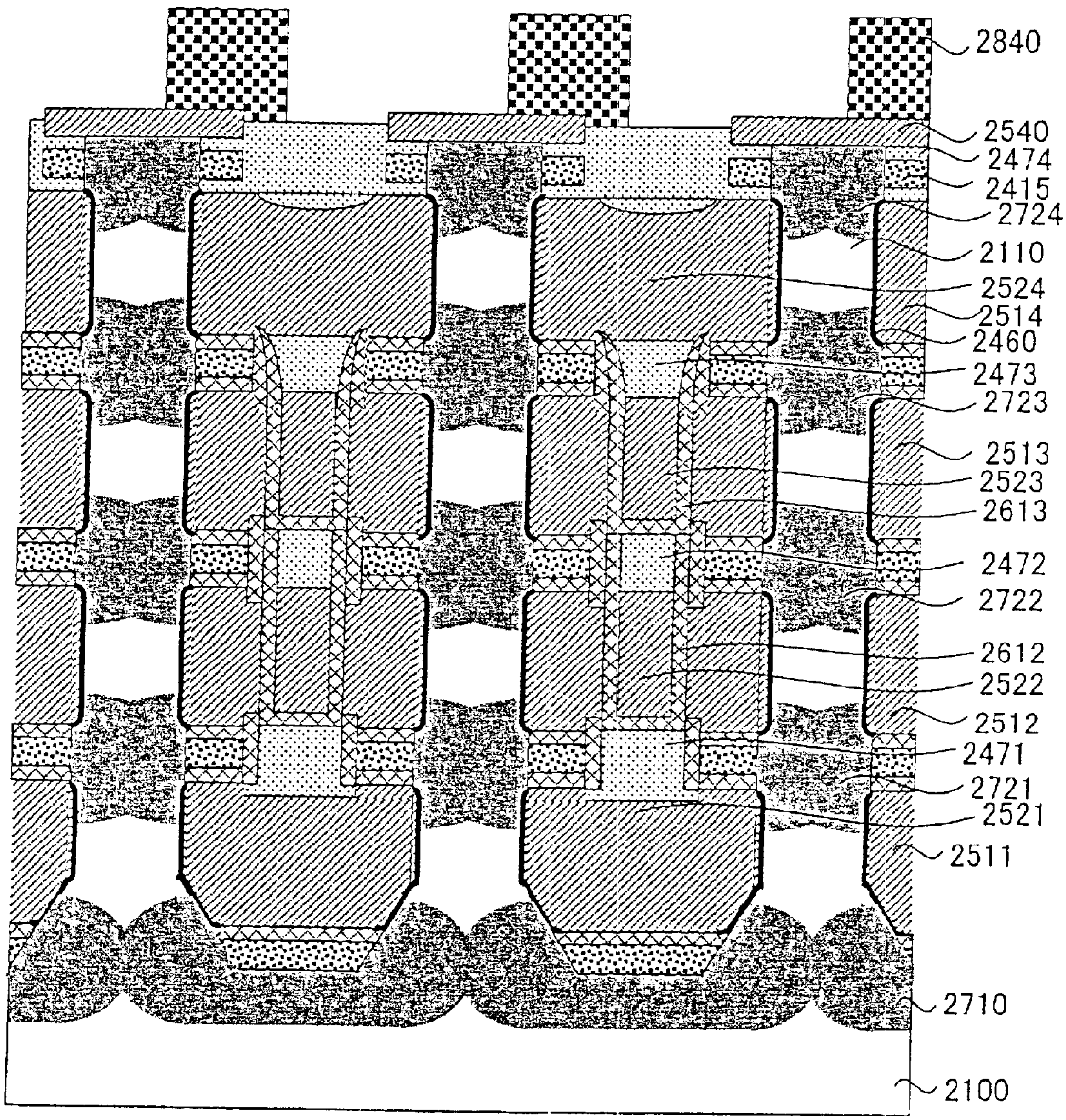
Figure 645:
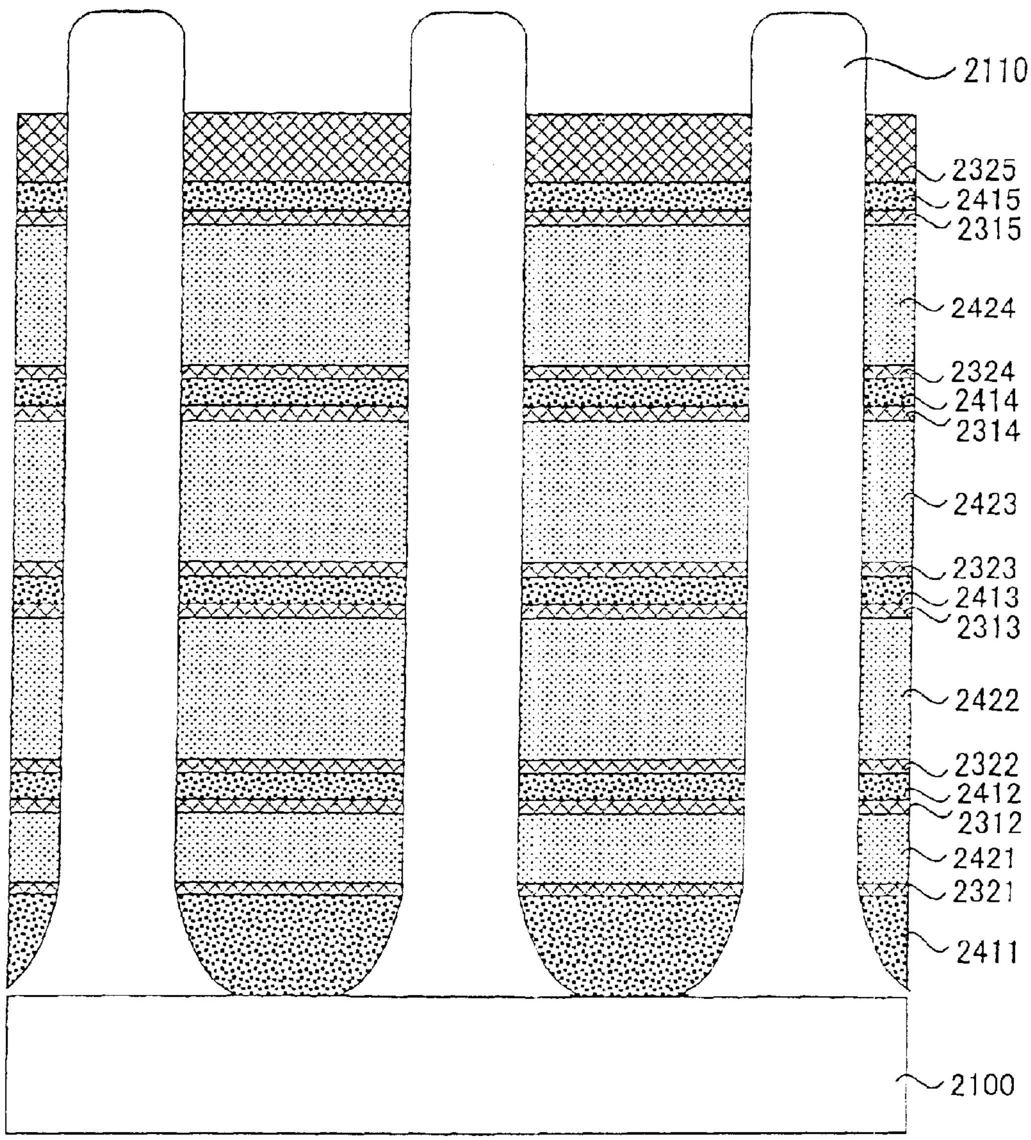
Figure 646:
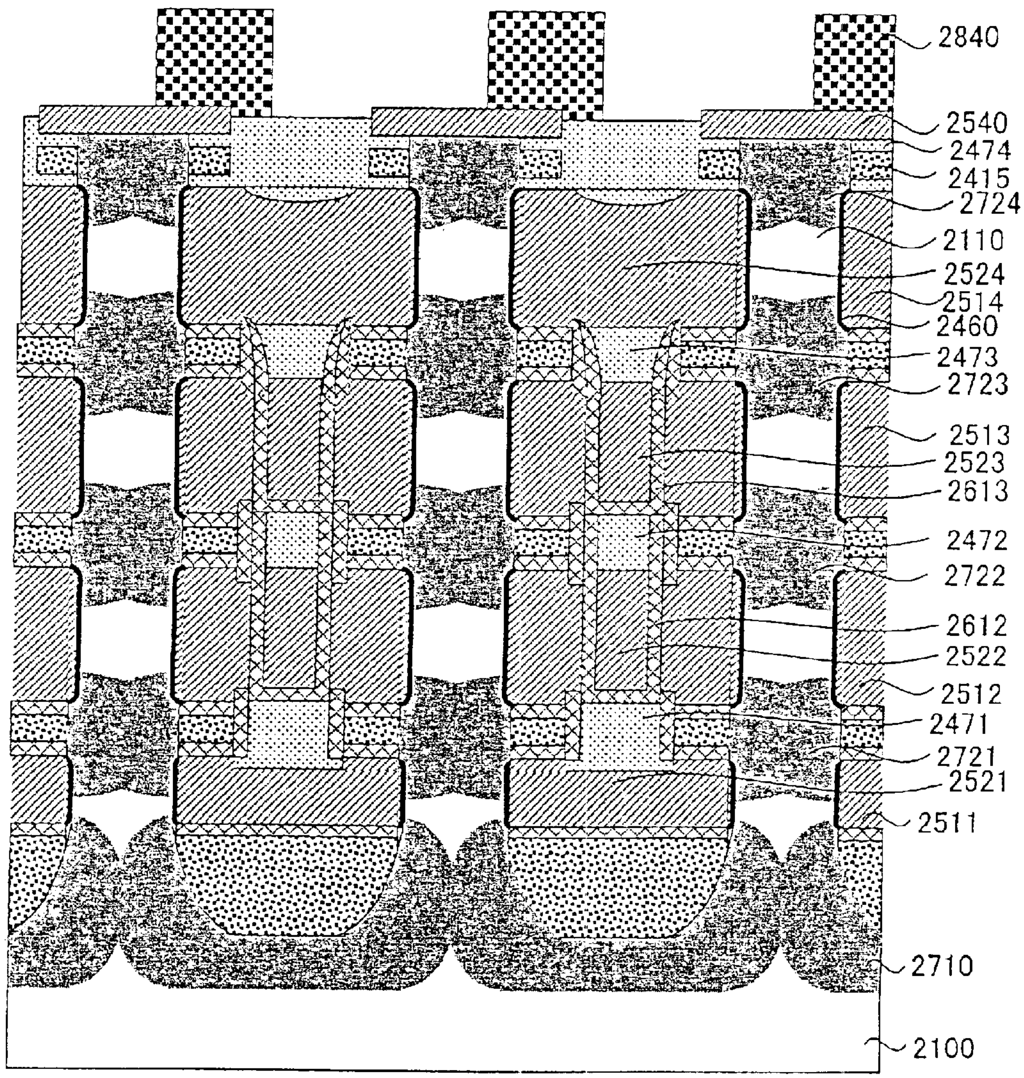
Figure 647:
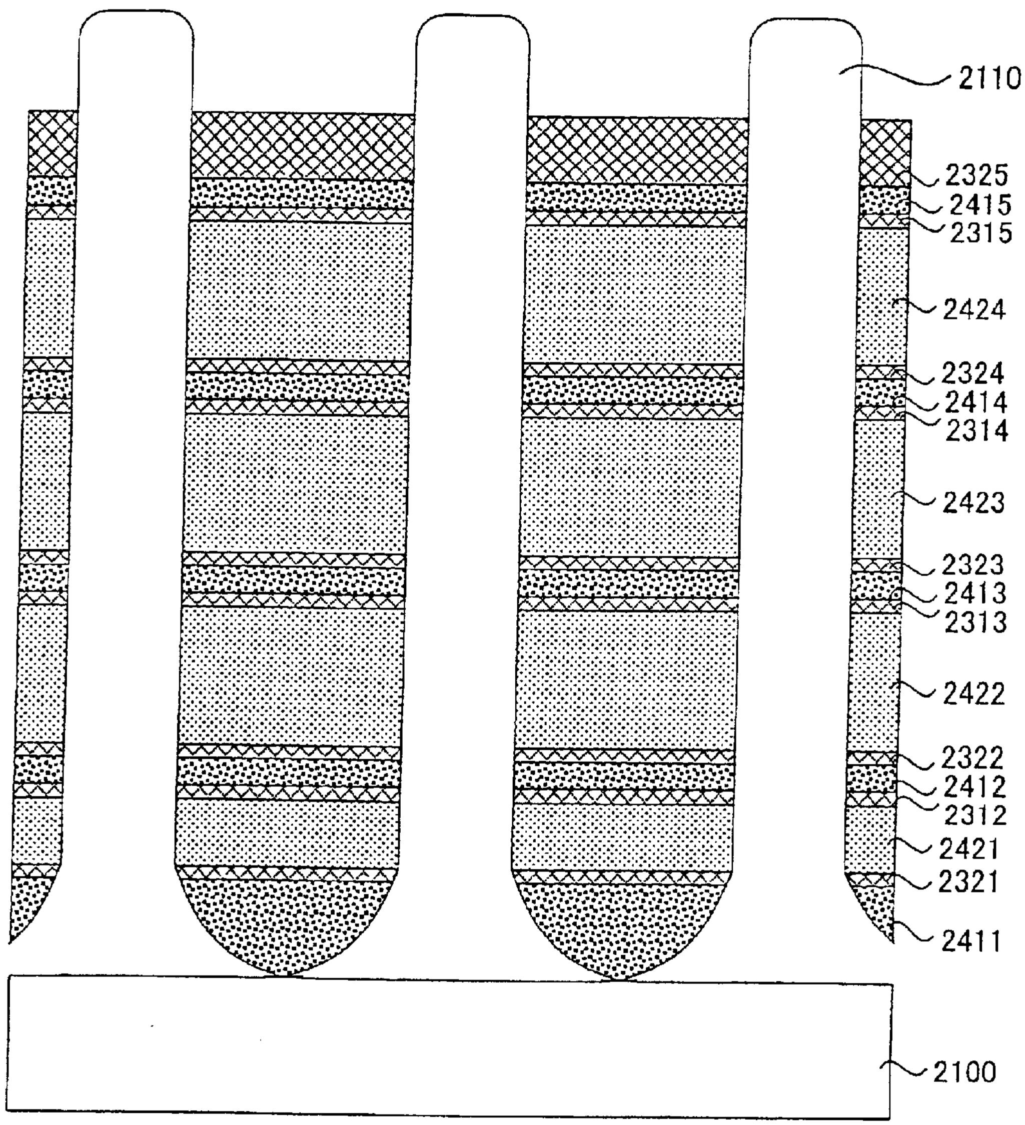
Figure 648:
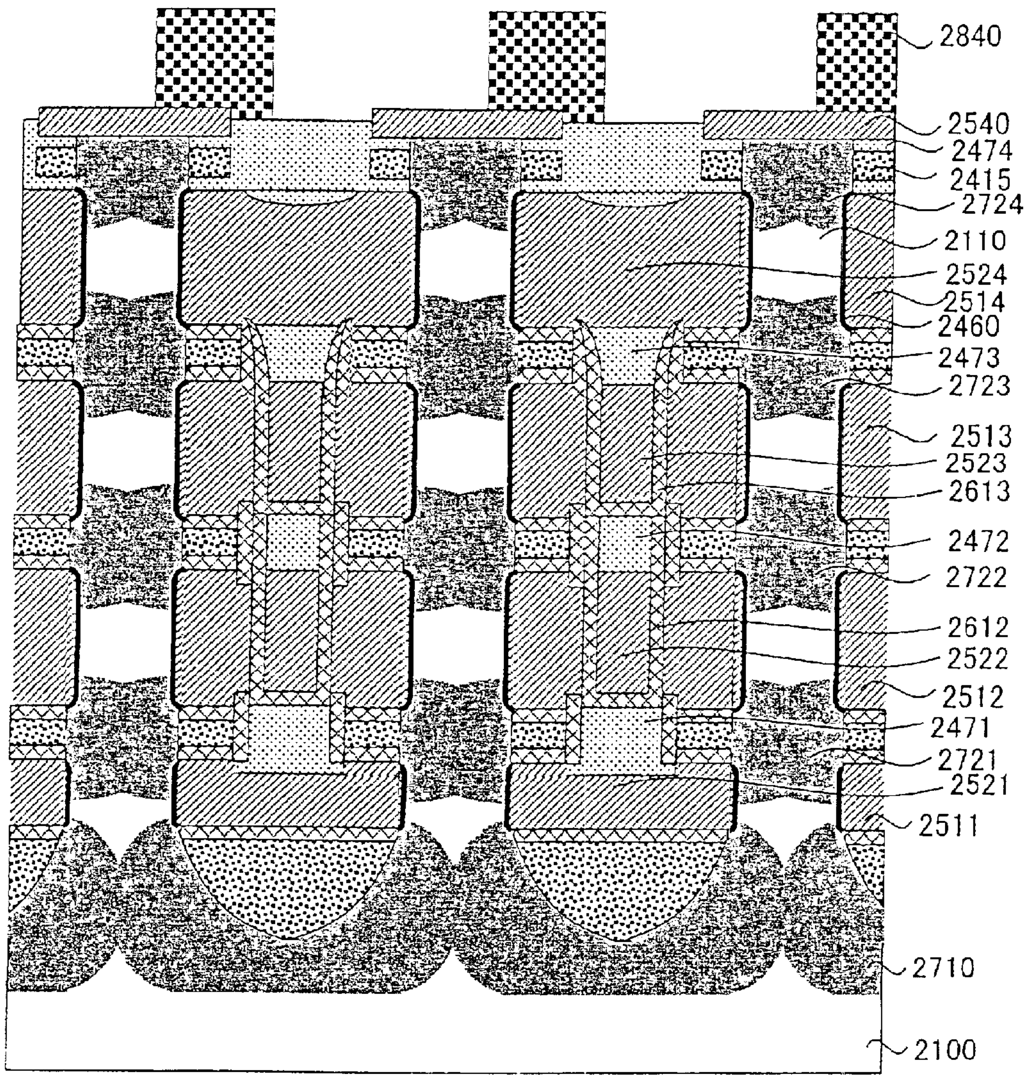
Figure 649:
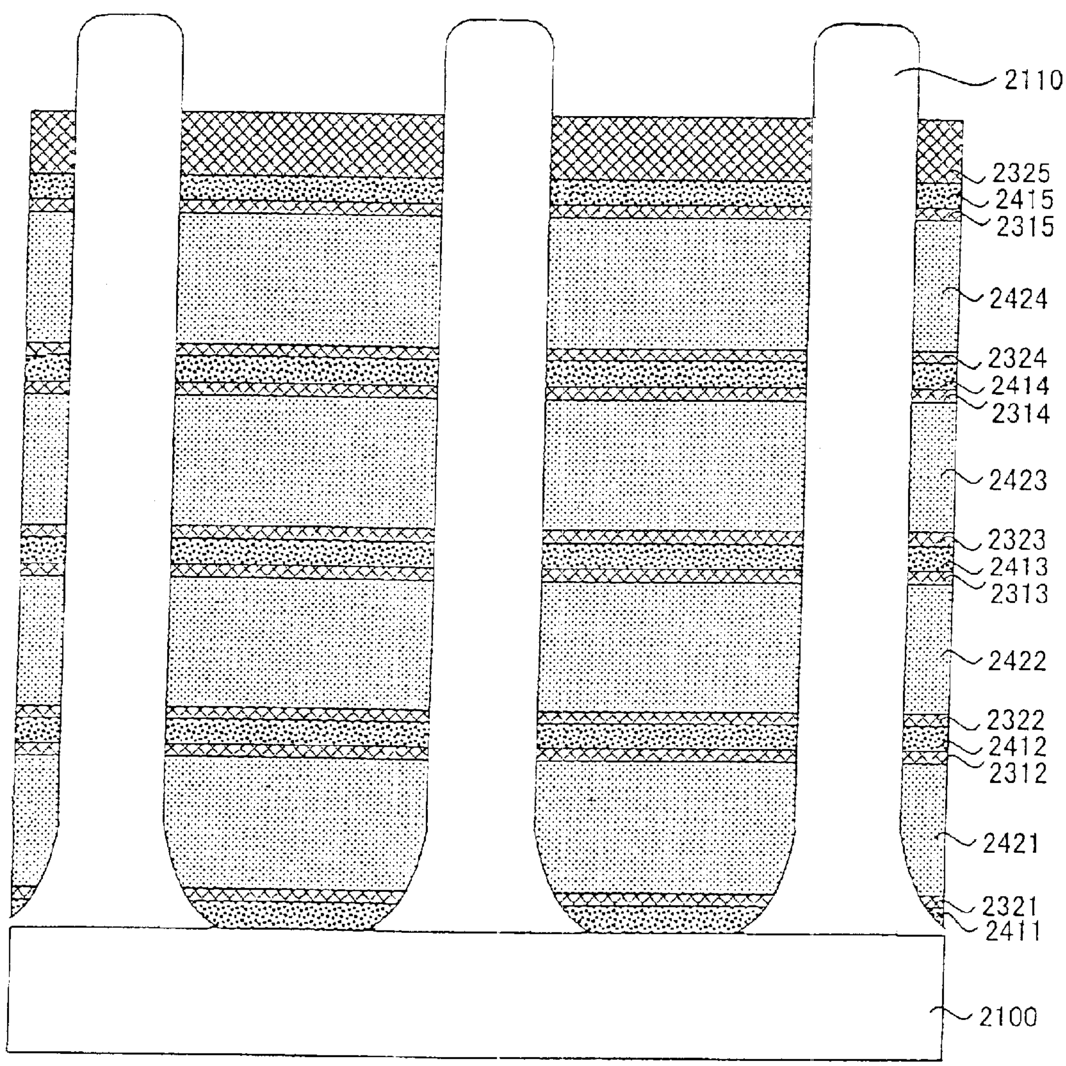
Figure 650:
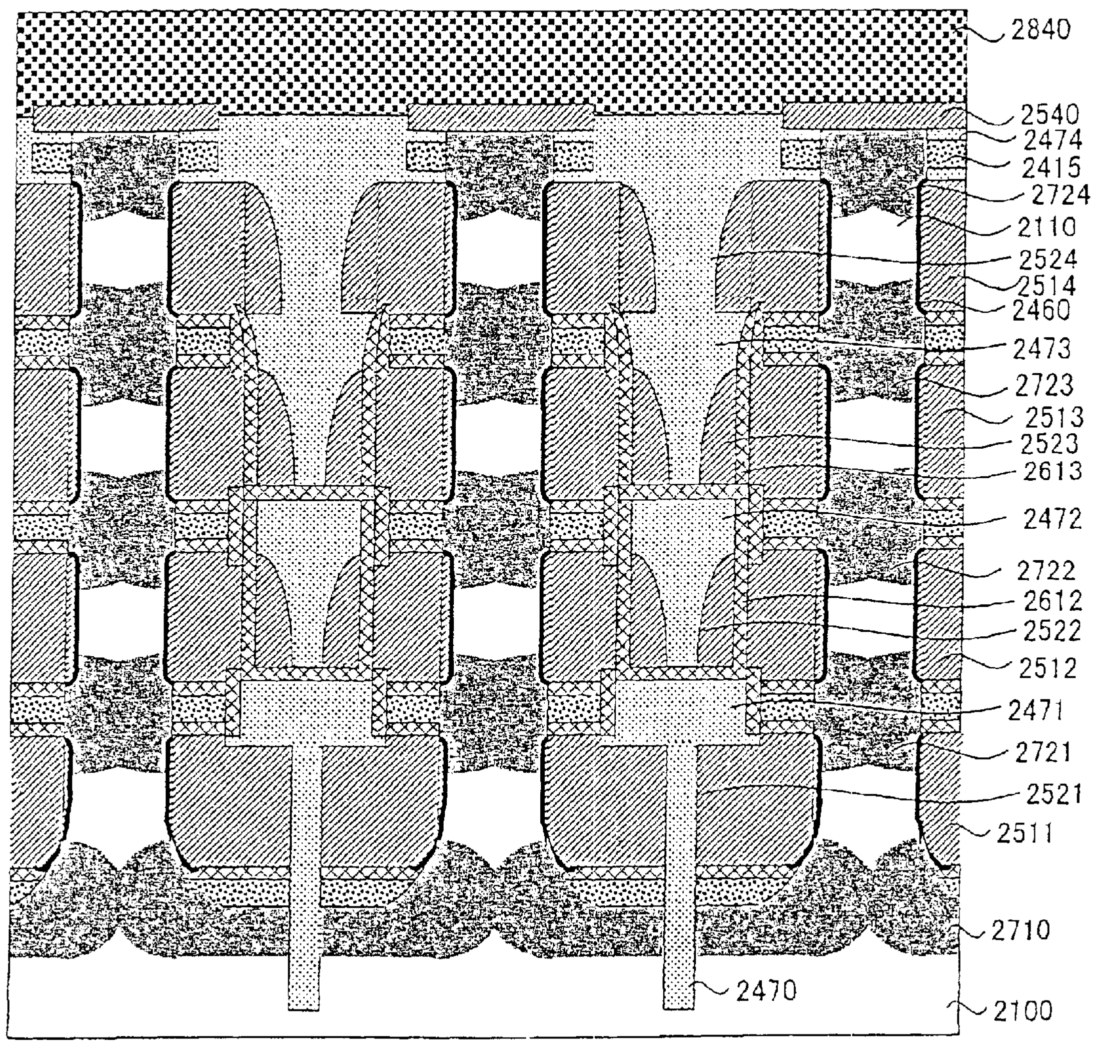
Figure 651:
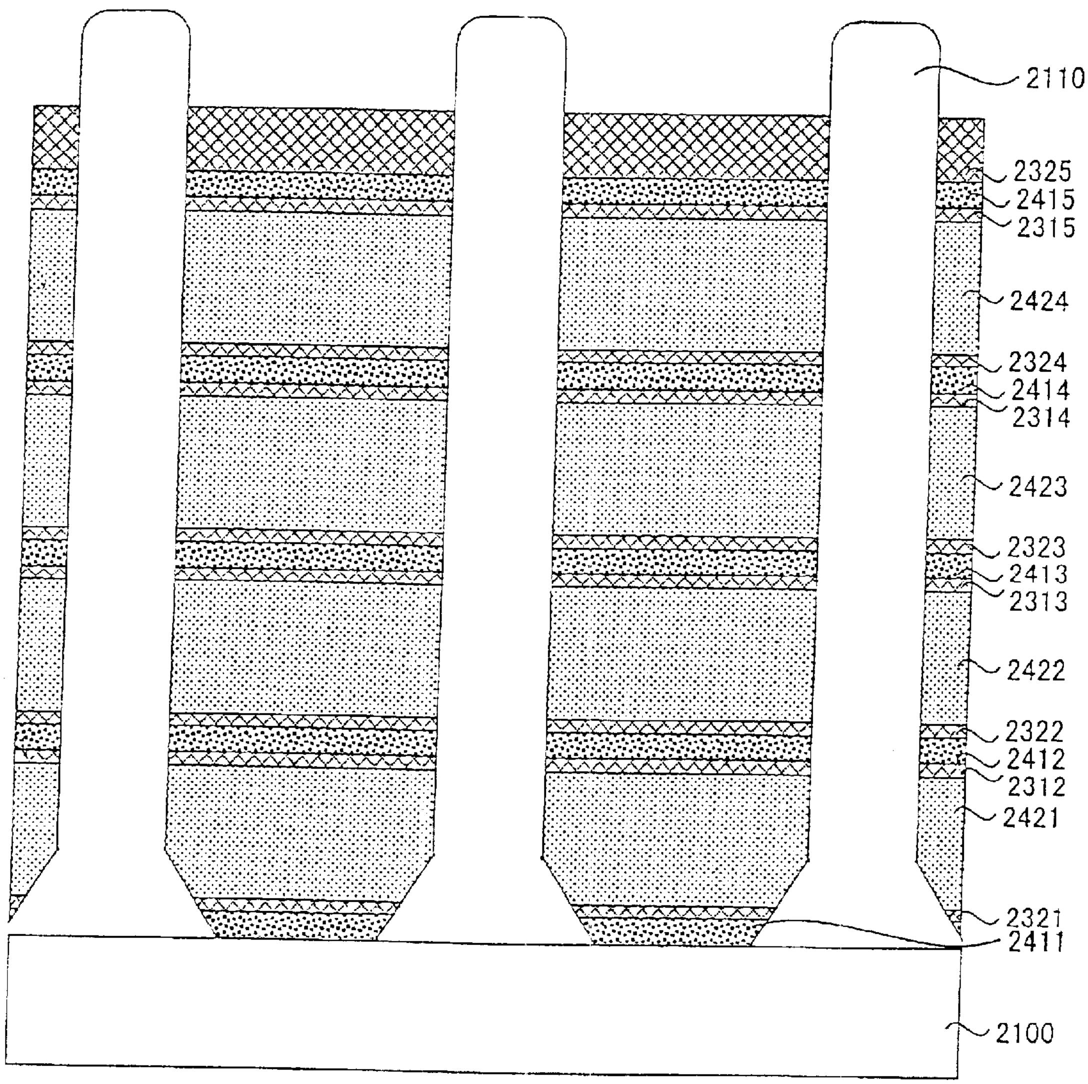
Figure 652:
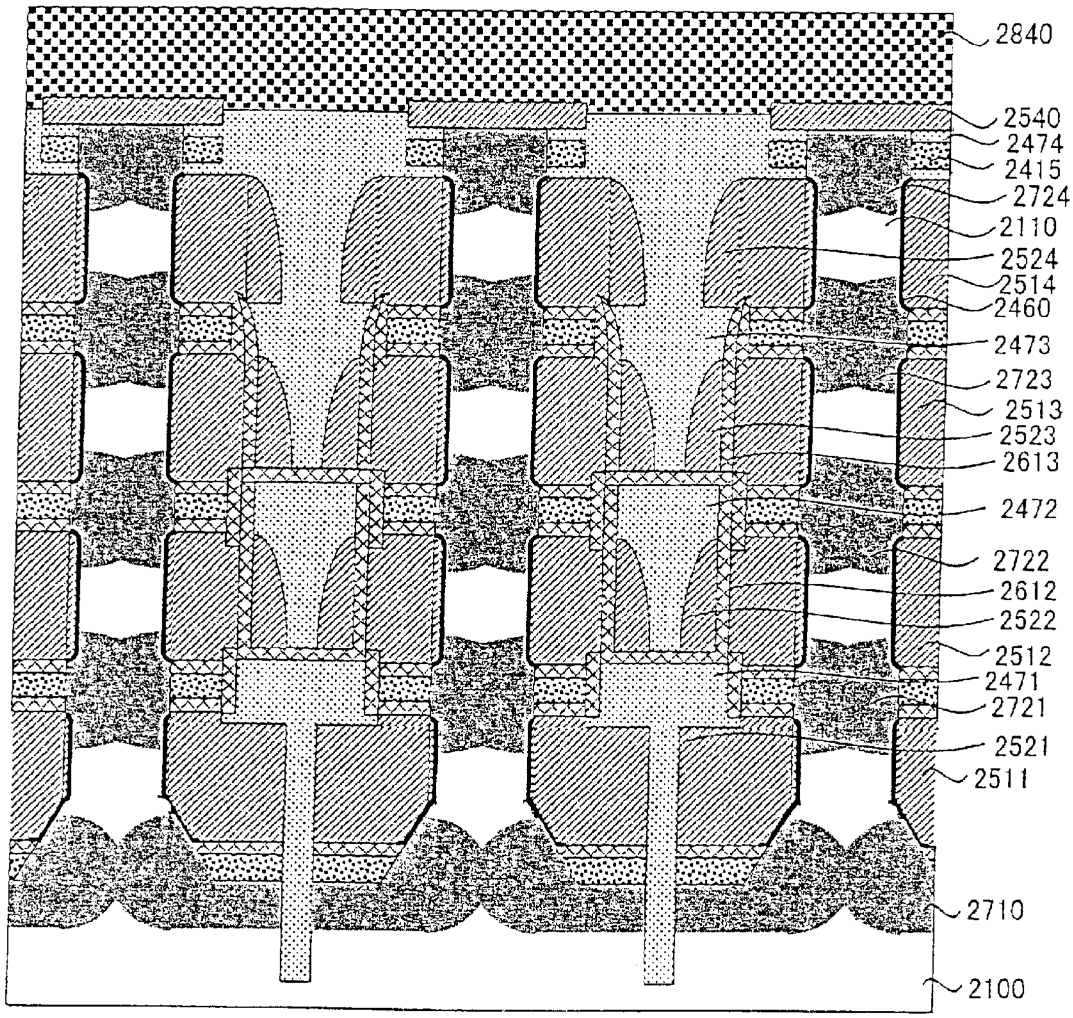
Figure 653:
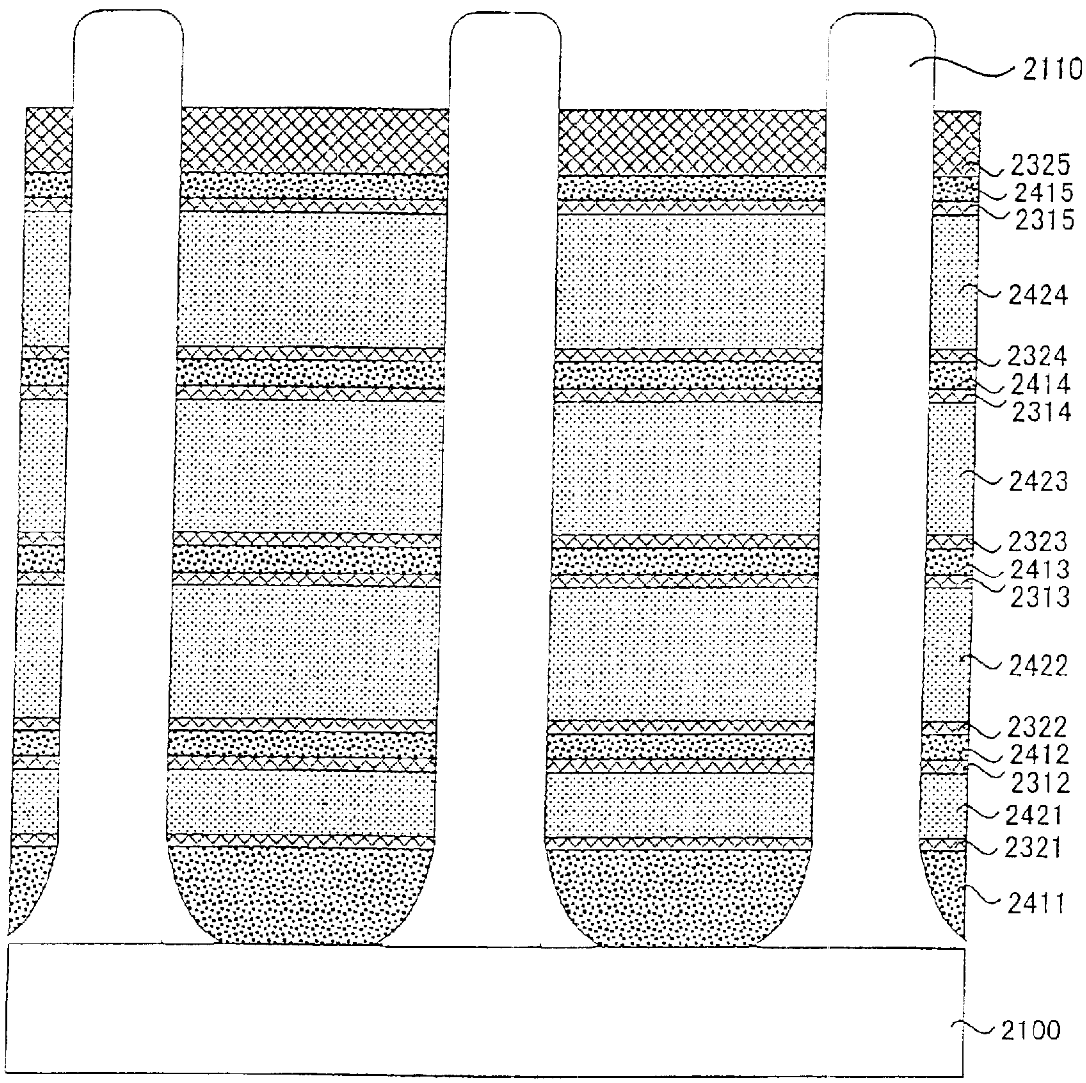
Figure 654:
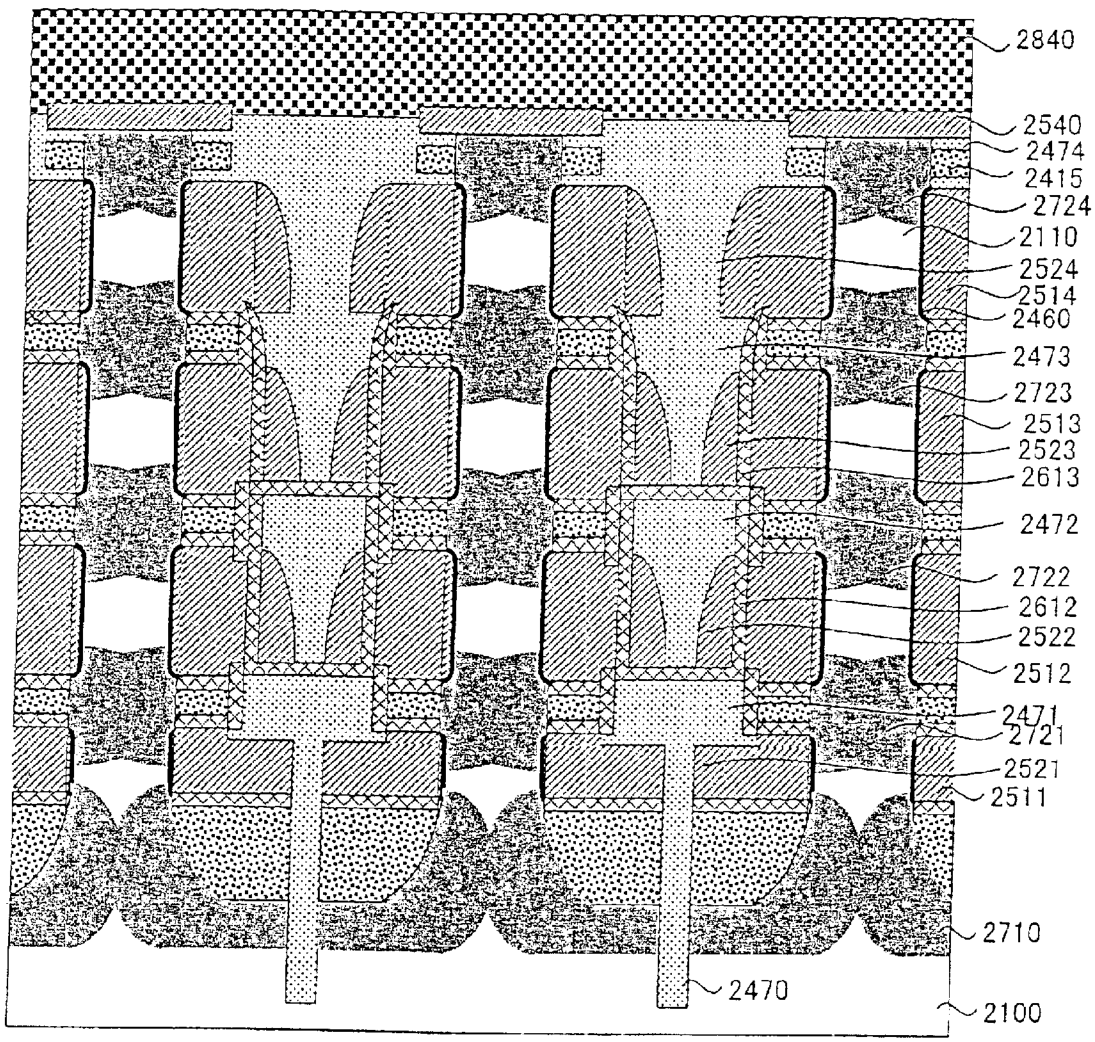
Figure 655:
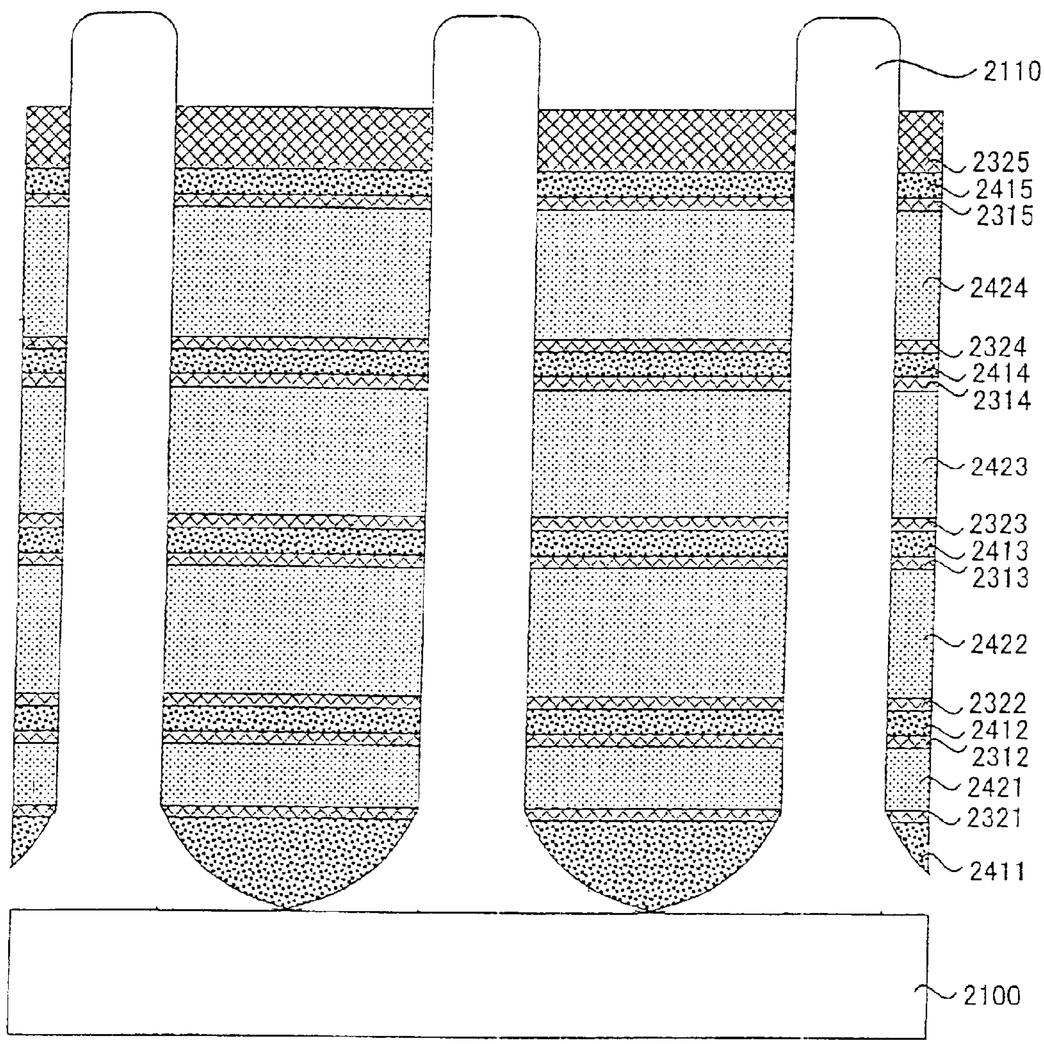
Figure 656:
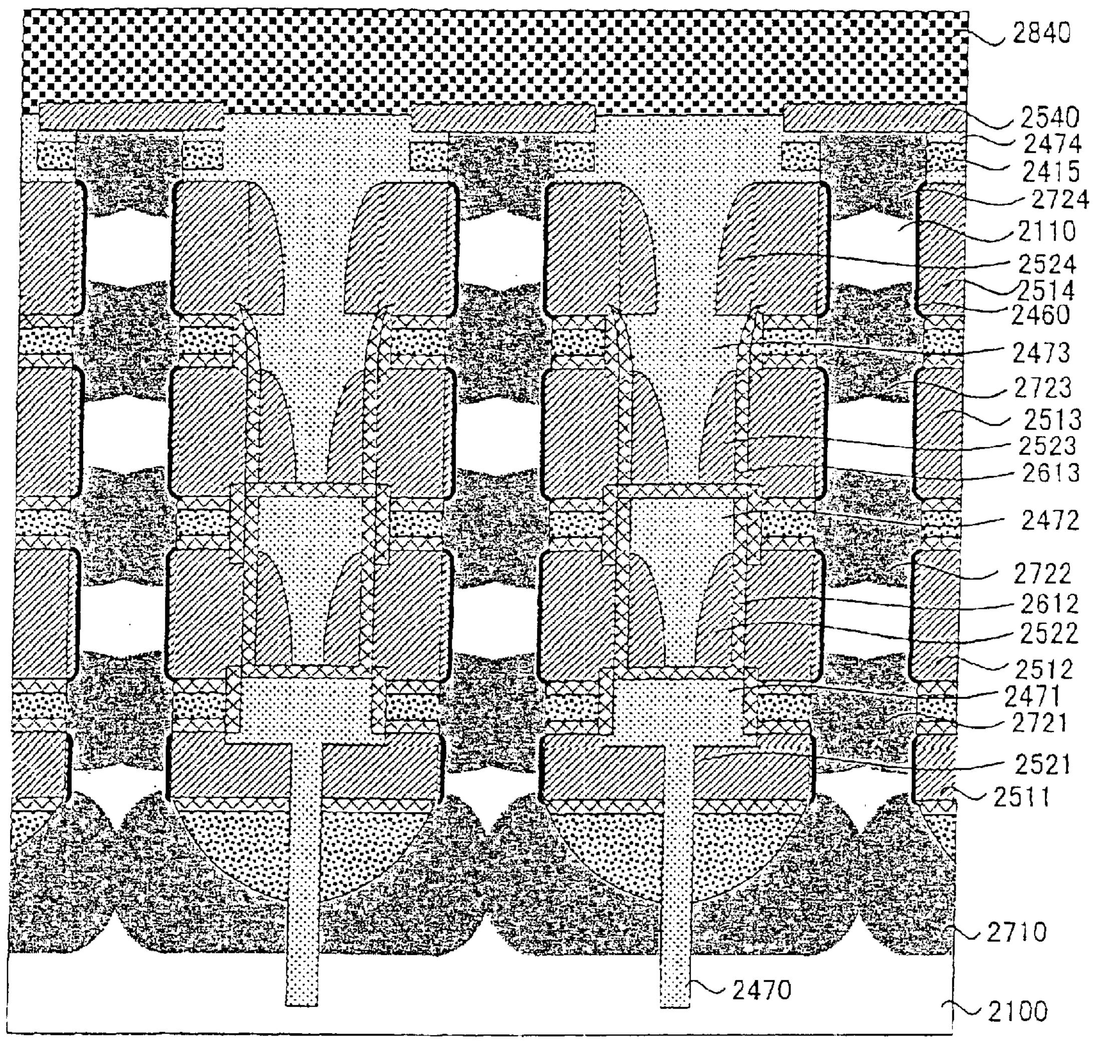

For example, in the case where the island-like semiconductor layer 2110 is circular as seen in FIG. 1, the island-like semiconductor layer 2110 of FIGS. 637 and 639 shows a truncated cone shape, whereas the island-like semiconductor layer 2110 of FIGS. 638 and 640 shows an inclined column shape.

The shape of the island-like semiconductor layer 2110 is not particularly limited so long as the memory cells can be disposed in series in the direction vertical to the semiconductor substrate 2100.

PRODUCTION EXAMPLE 27

In an example of production process for producing a semiconductor memory in which regions for forming the charge storage layers are defined in advance by a laminated film comprising plural films, explanation is given of an example of production process in which the island-like semiconductor layer has an altered shape at its bottom.

Such a semiconductor memory may be produced by the following production process. FIGS. 641 to 648 and FIGS. 649 to 656 are sectional views taken on line A-A' and line B-B', respectively, in FIG. 1 which is a plan view illustrating an EEPROM memory cell array.

The first lattice-form trench 2210 may have a partially or entirely rounded slant shape at its bottom as shown in FIGS. 641 and 649, FIGS. 645 and 653 and FIGS. 647 and 655.

Production steps thereafter follow Production example 11. Thereby, a semiconductor memory shown in FIGS. 642 and 650, FIGS. 646 and 654 and FIGS. 648 and 656 is formed. Here, the bottom of the polysilicon film (the first conductive film) 2511 may or may not reach the slant bottom of the first trench 2210.

Further, the first lattice-form trench 2210 may have a slant shape at its bottom as shown in FIGS. 643 to 644 and FIGS. 651 to 652.

PRODUCTION EXAMPLE 28

In an example of production process for producing a semiconductor memory in which regions for forming the charge storage layers are defined in advance by a laminated film comprising plural films, explanation is given of an example of production process for forming a sidewall spacer made of a silicon oxide film on the sidewall of a trench for forming an island-like semiconductor layer therein.

Such a semiconductor memory may be produced by the following production process. FIGS. 657 to 658 and FIGS. 659 to 660 are sectional views taken on line A-A' and line B-B', respectively, in FIG. 1 which is a plan view illustrating an EEPROM memory cell array.

Figure 657:
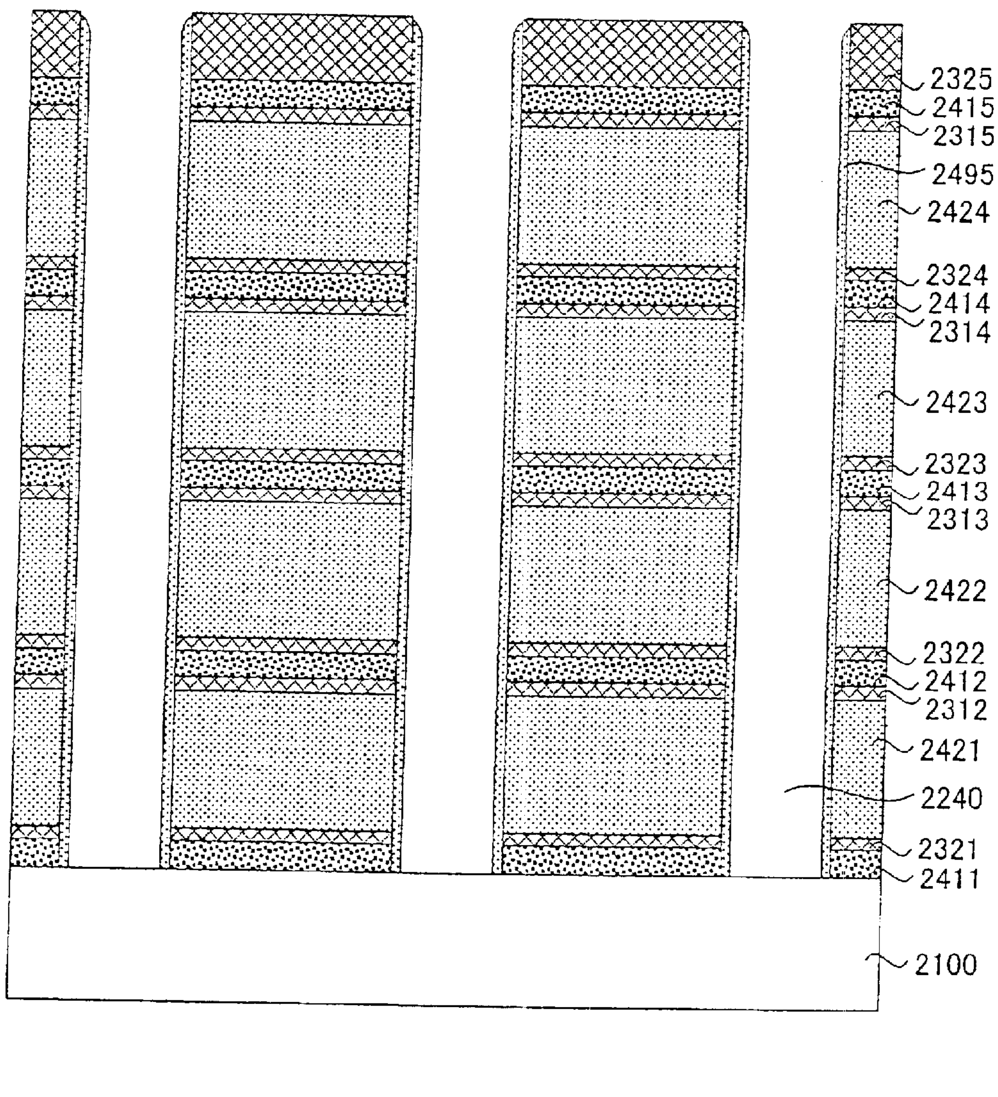
Figure 658:
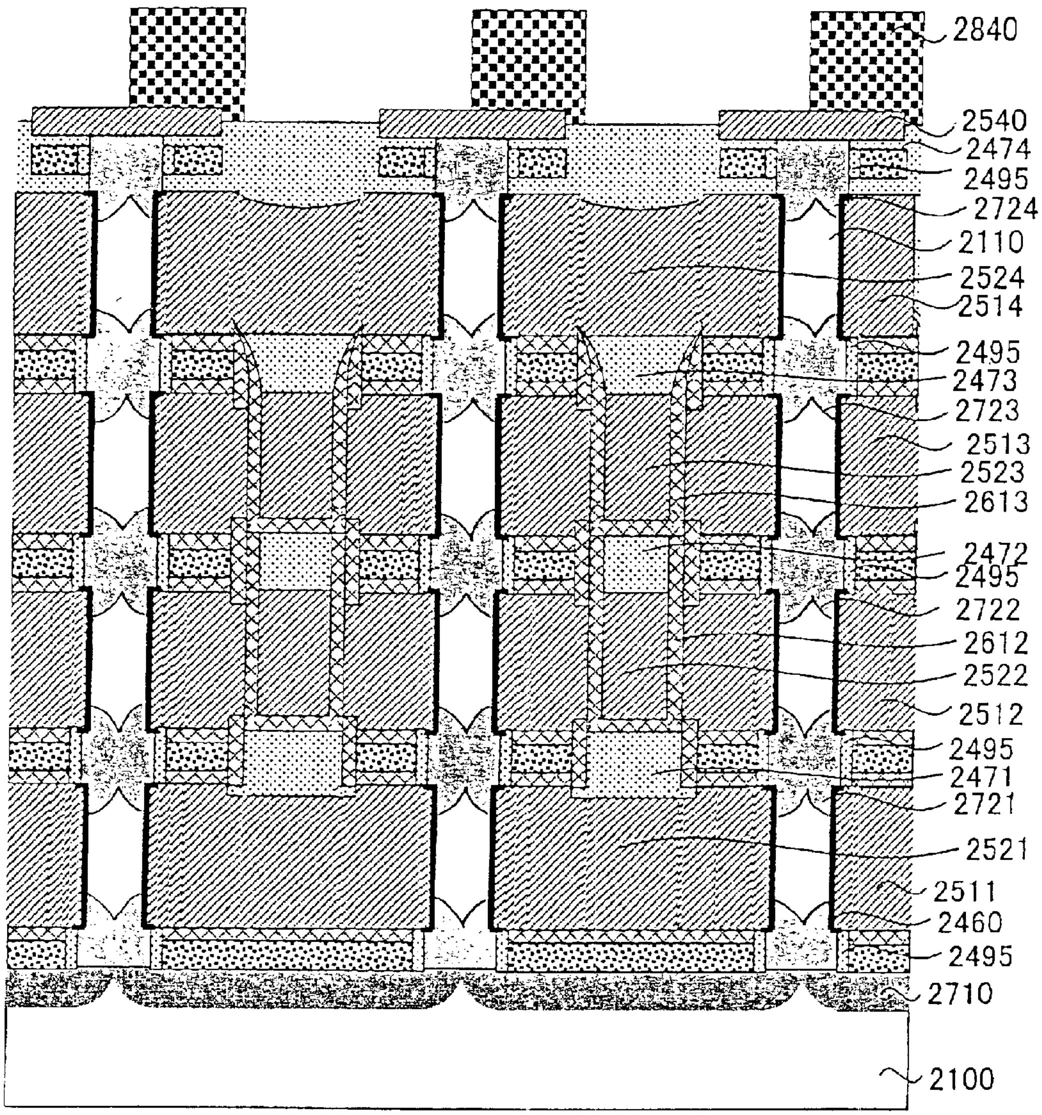
Figure 659:
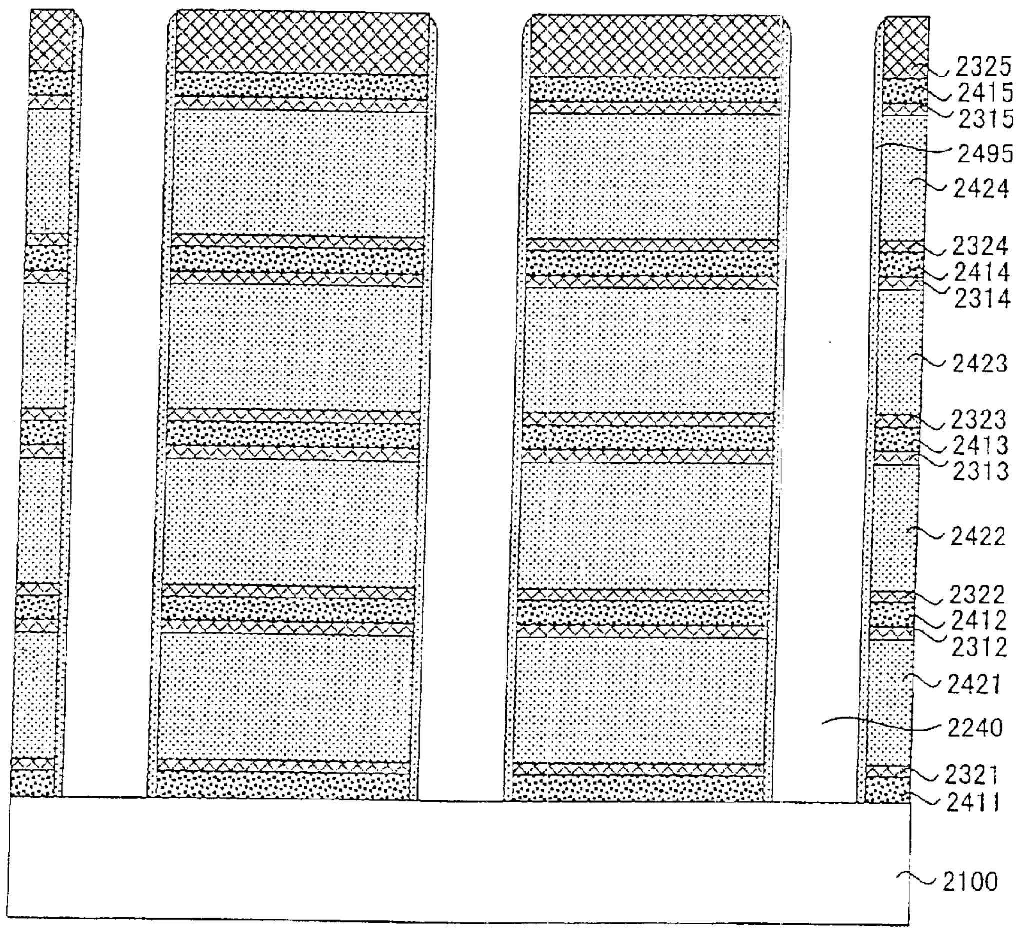
Figure 660:
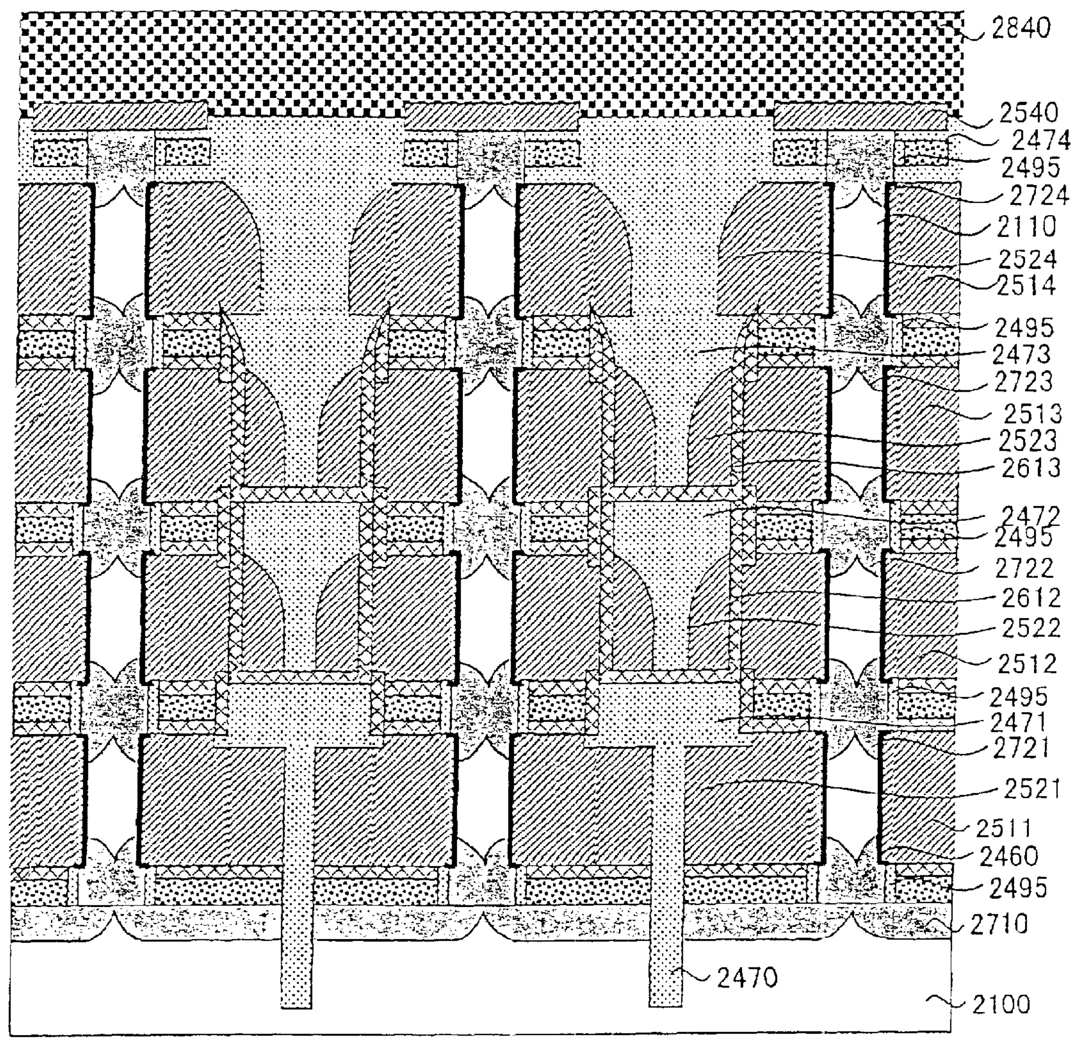
Figure 661:
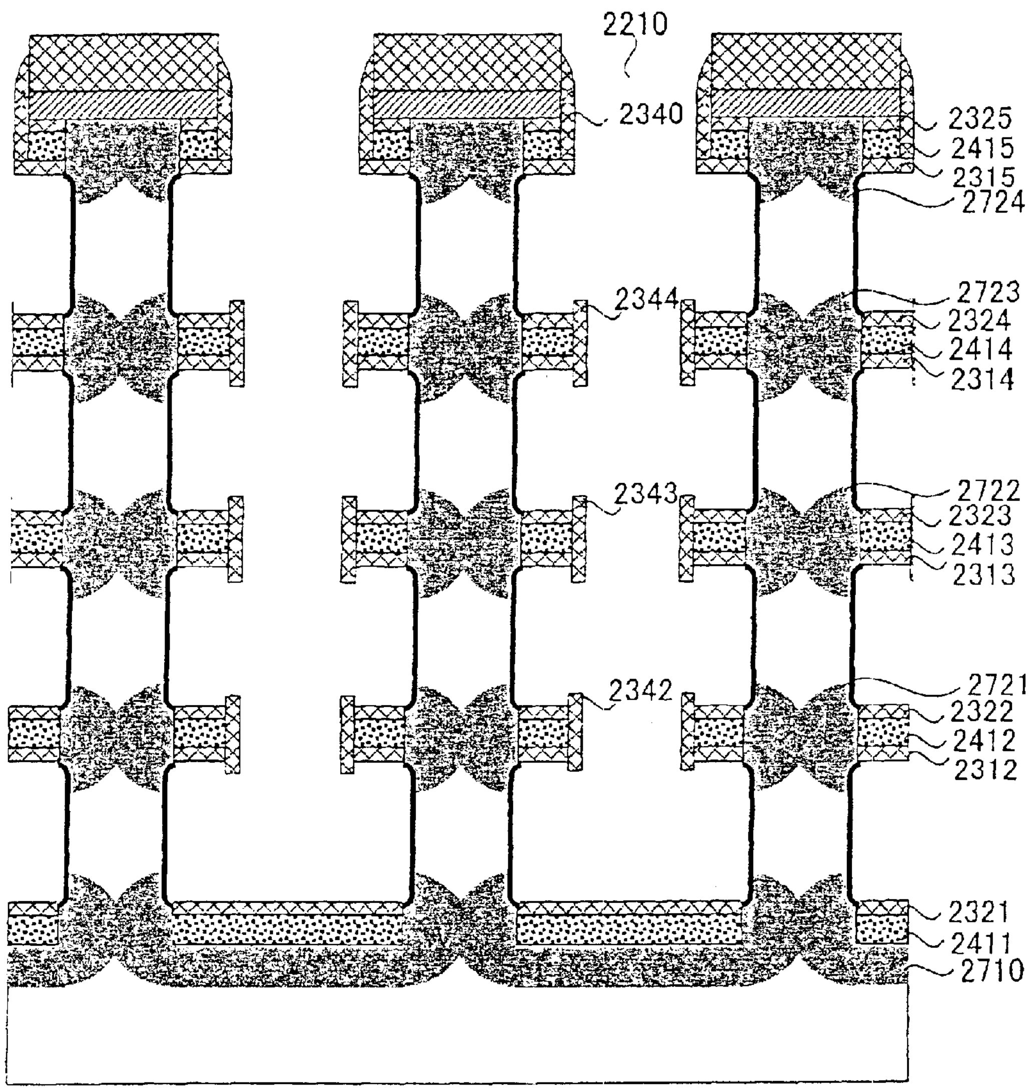
Figure 662:
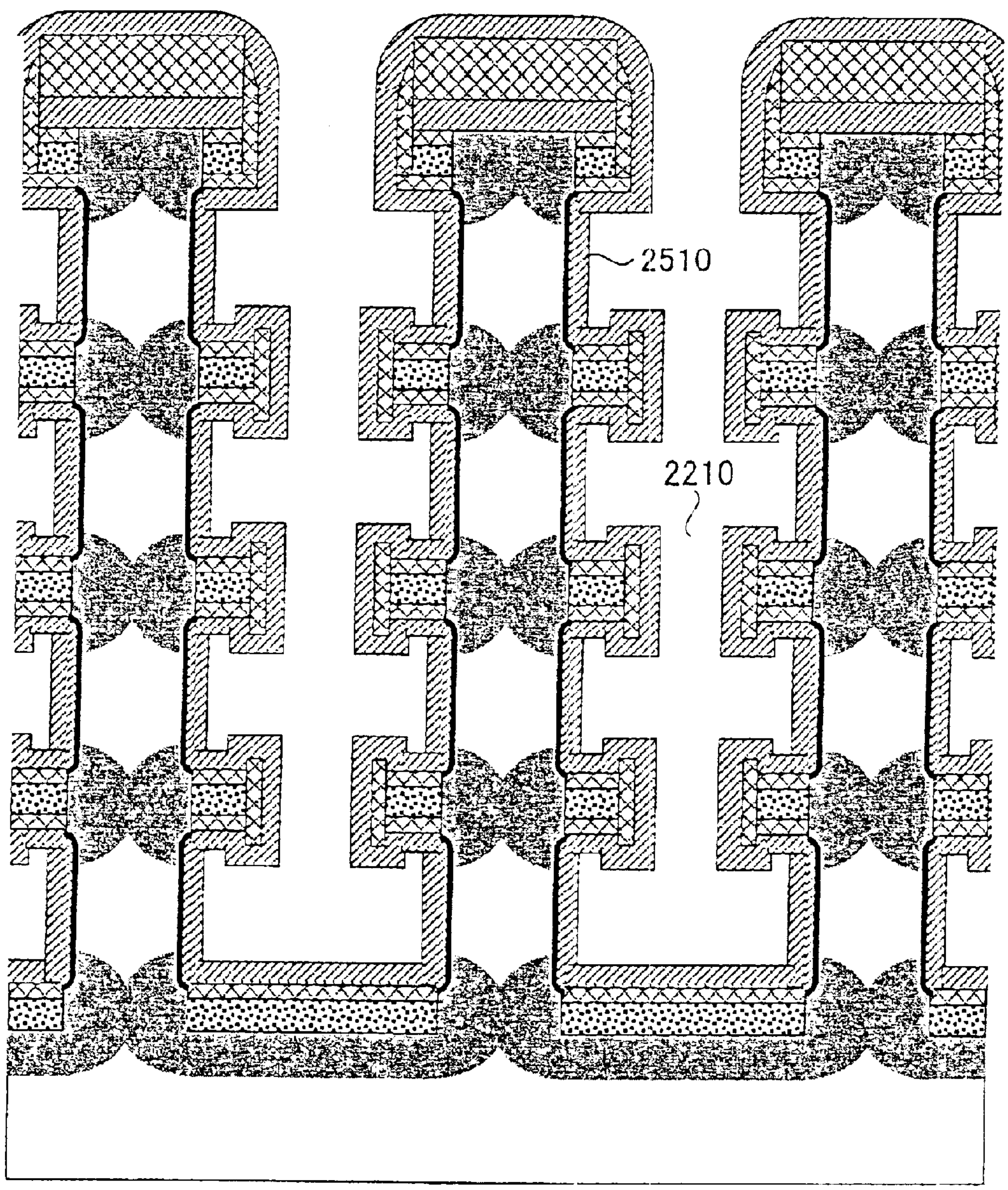
Figure 663:
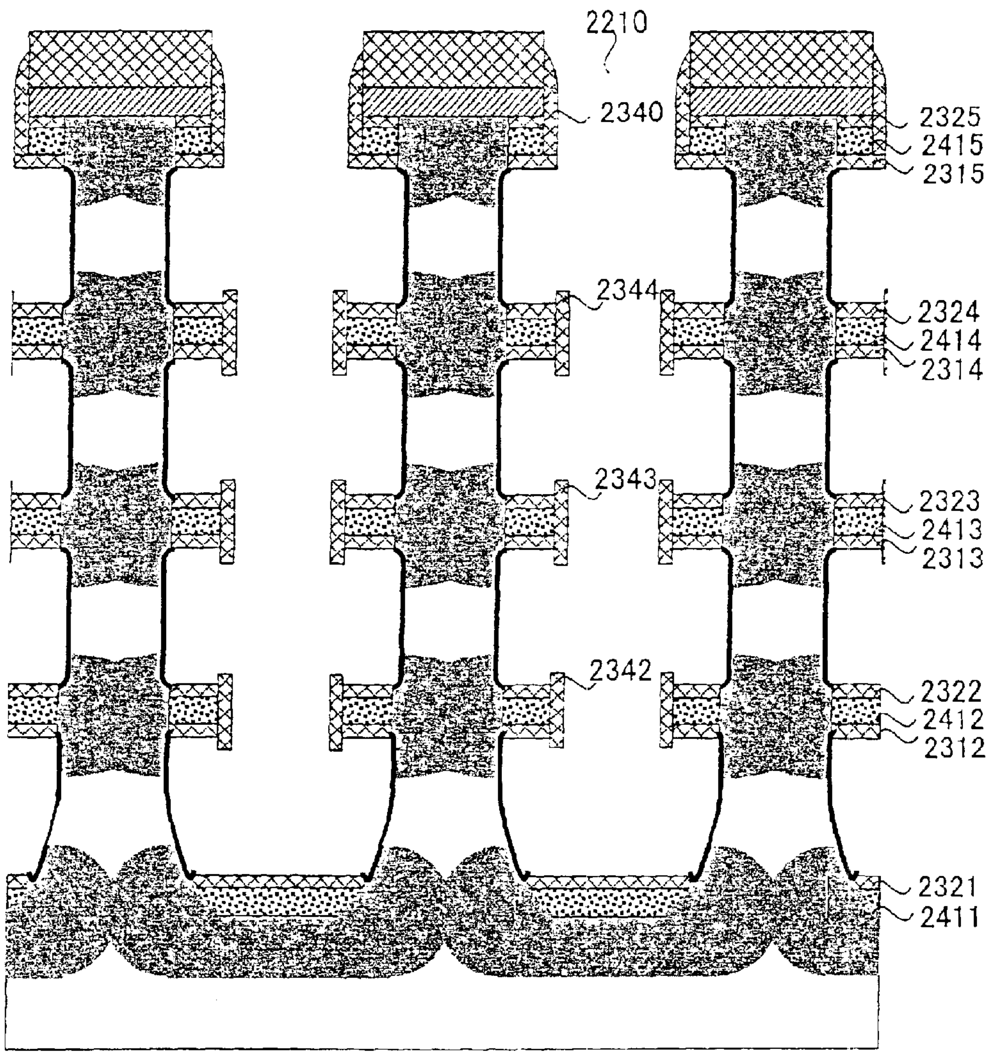
Figure 664:
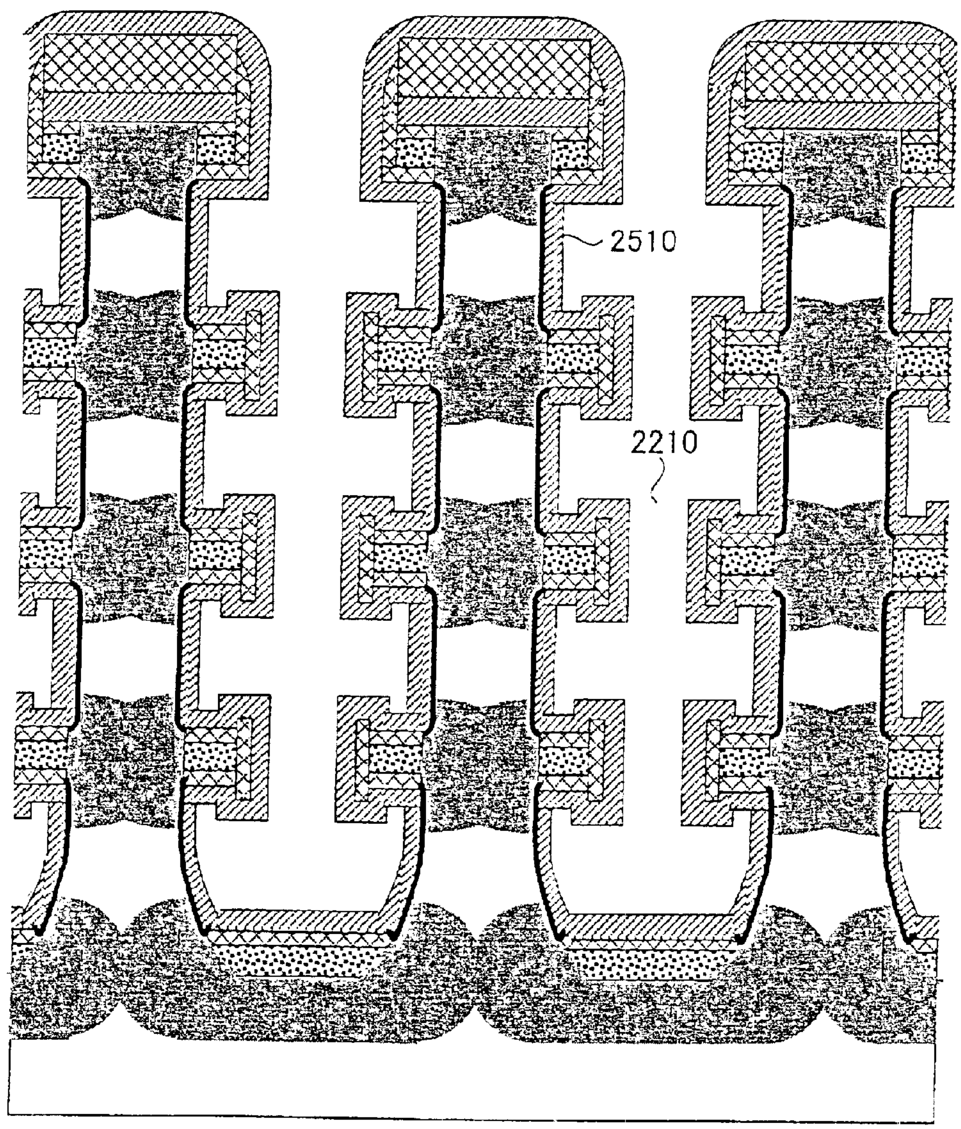
Figure 665:
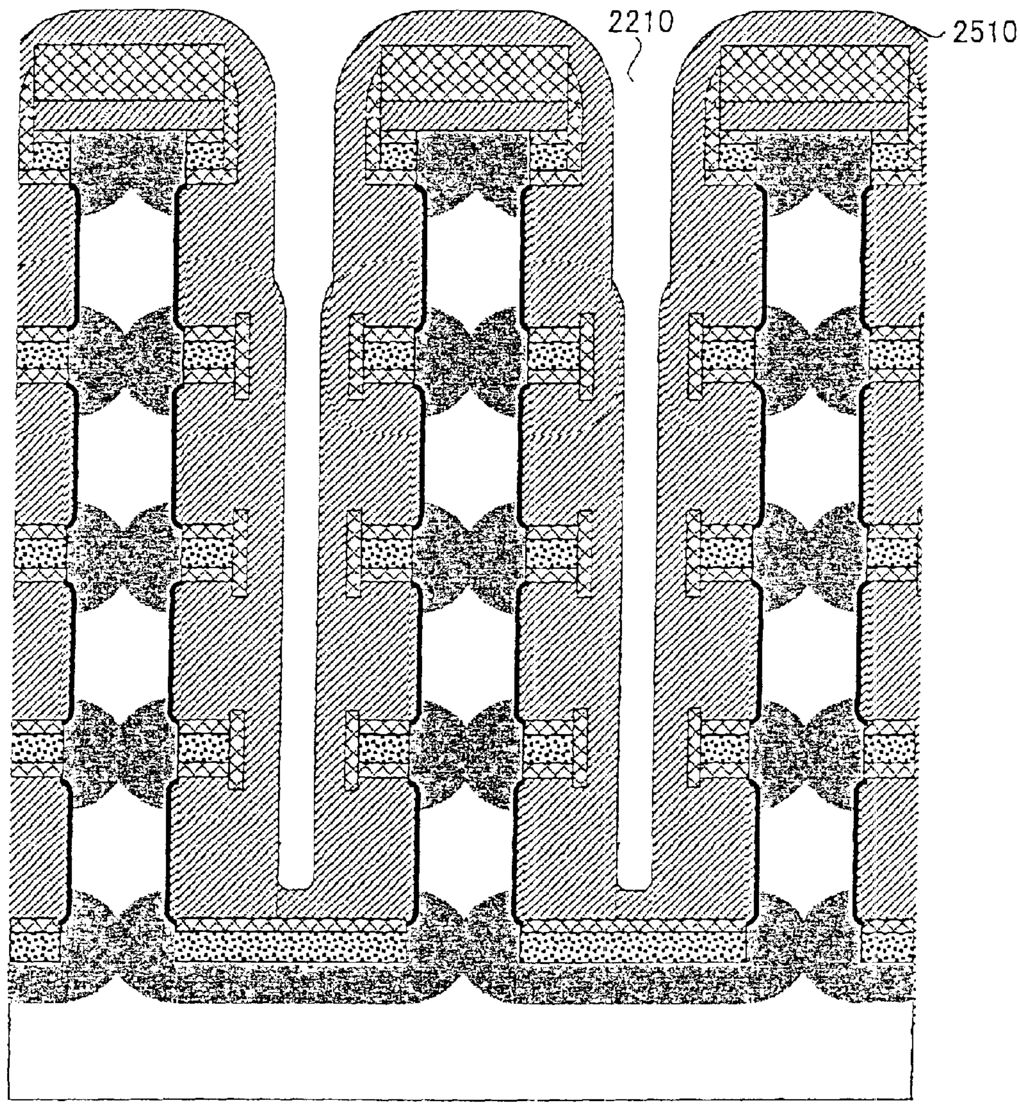
Figure 666:
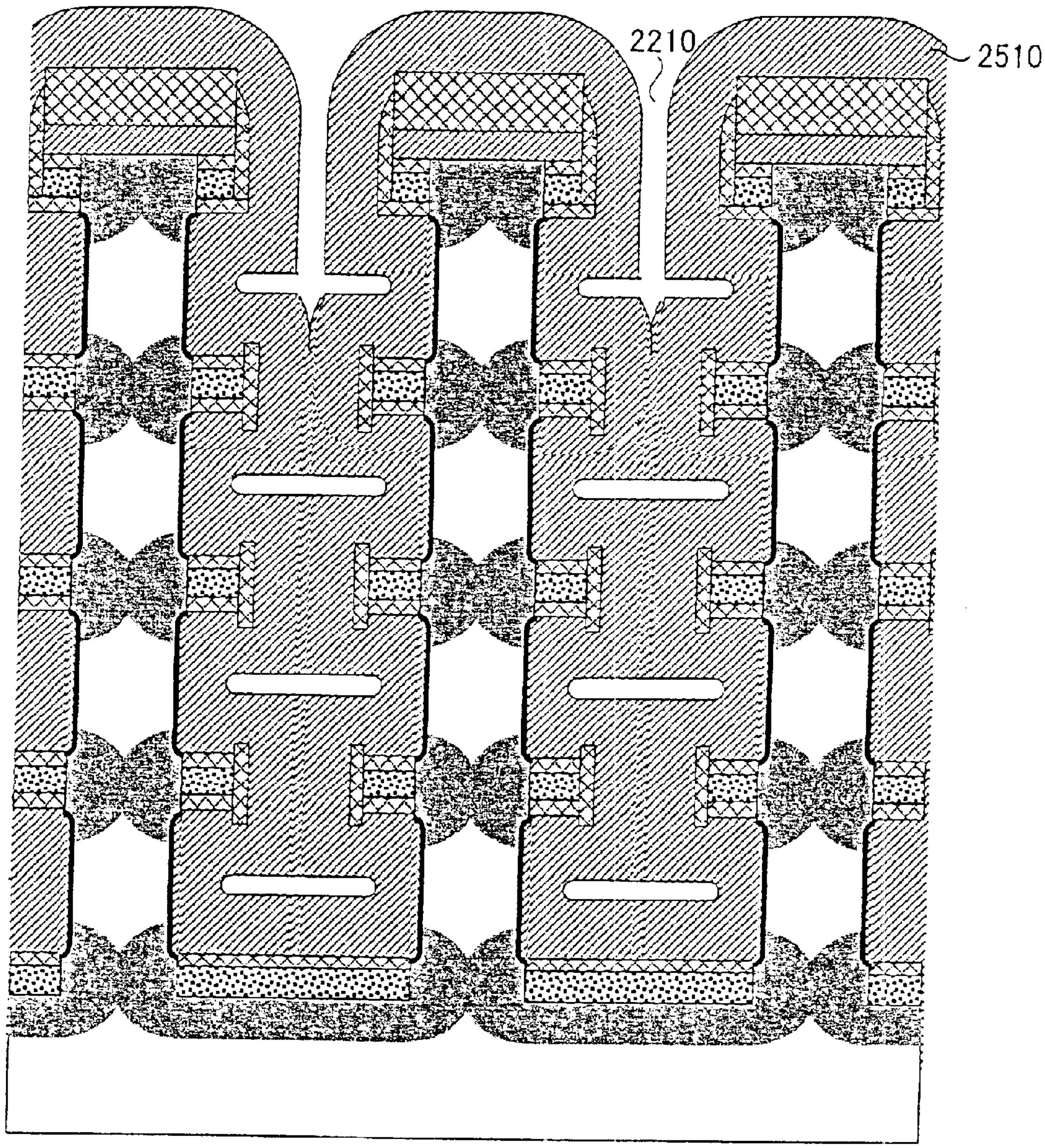
Figure 667:
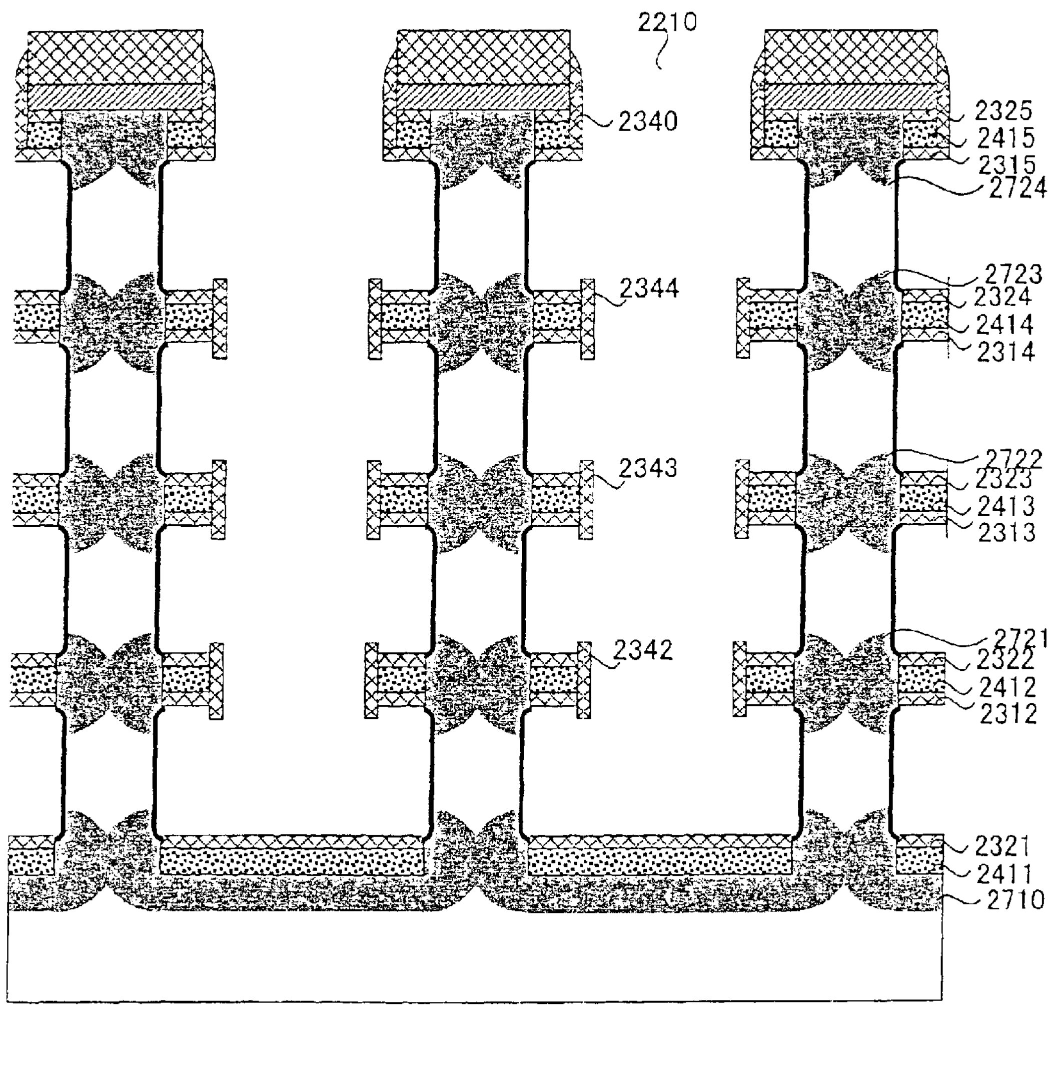
Figure 668:
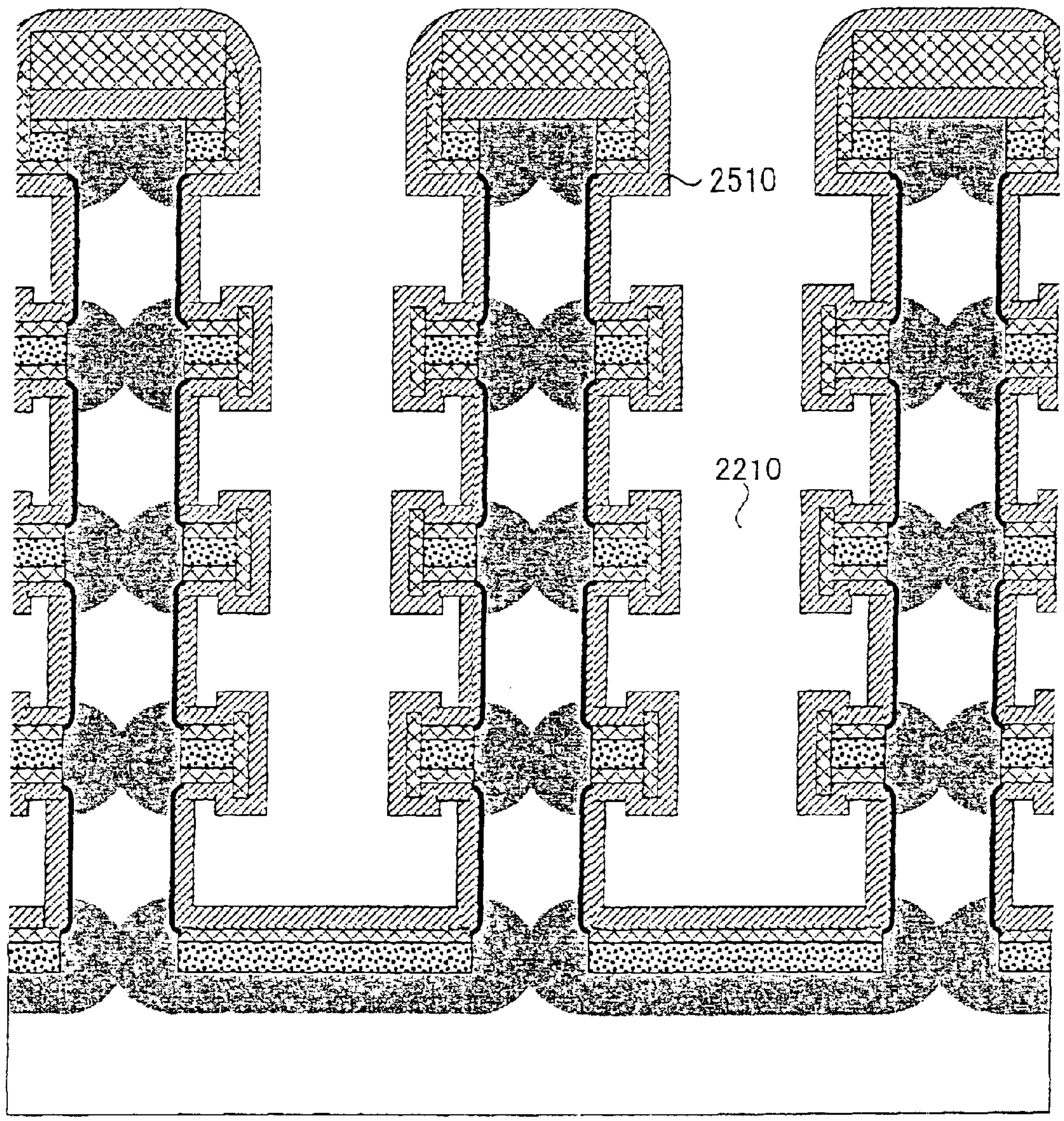
Figure 669:
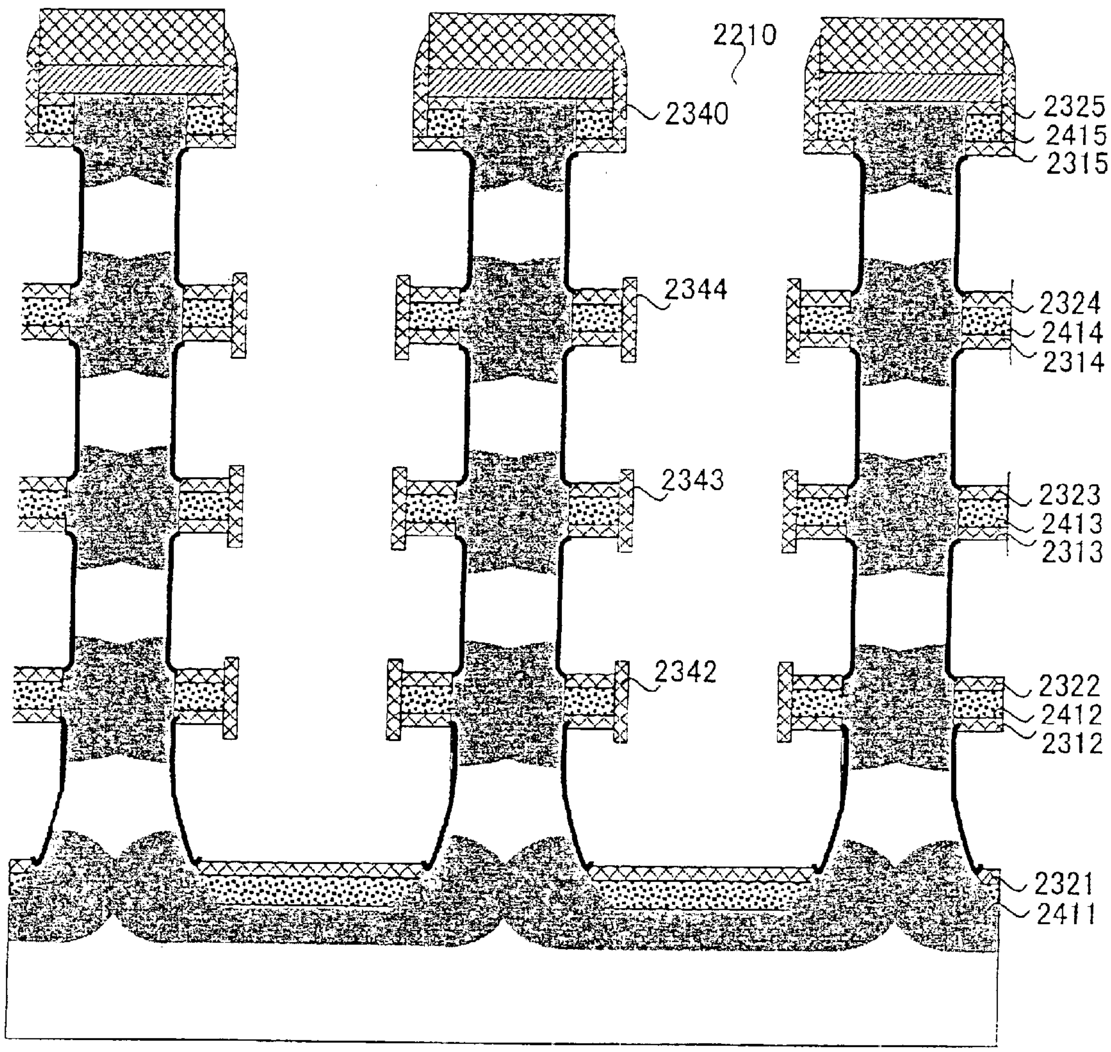
Figure 670:
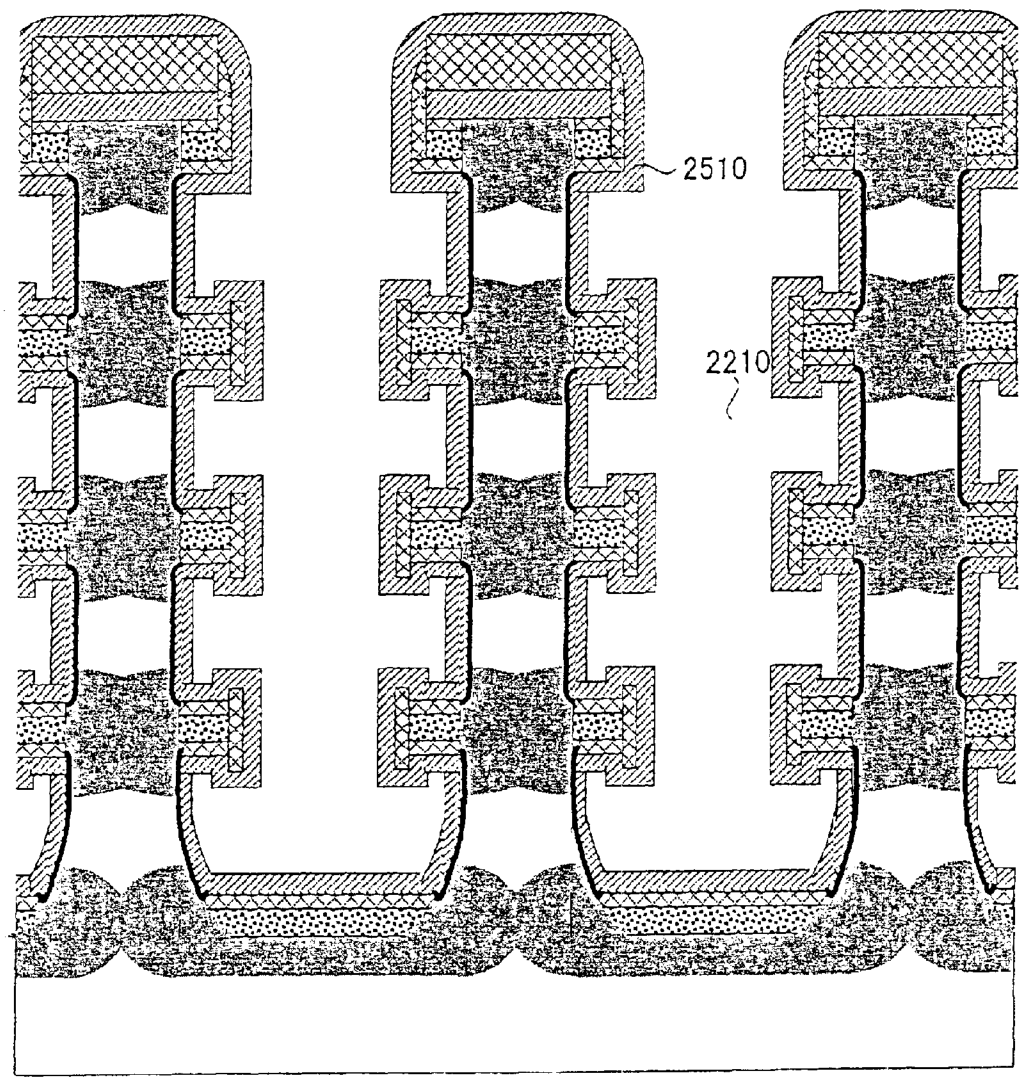
Figure 671:
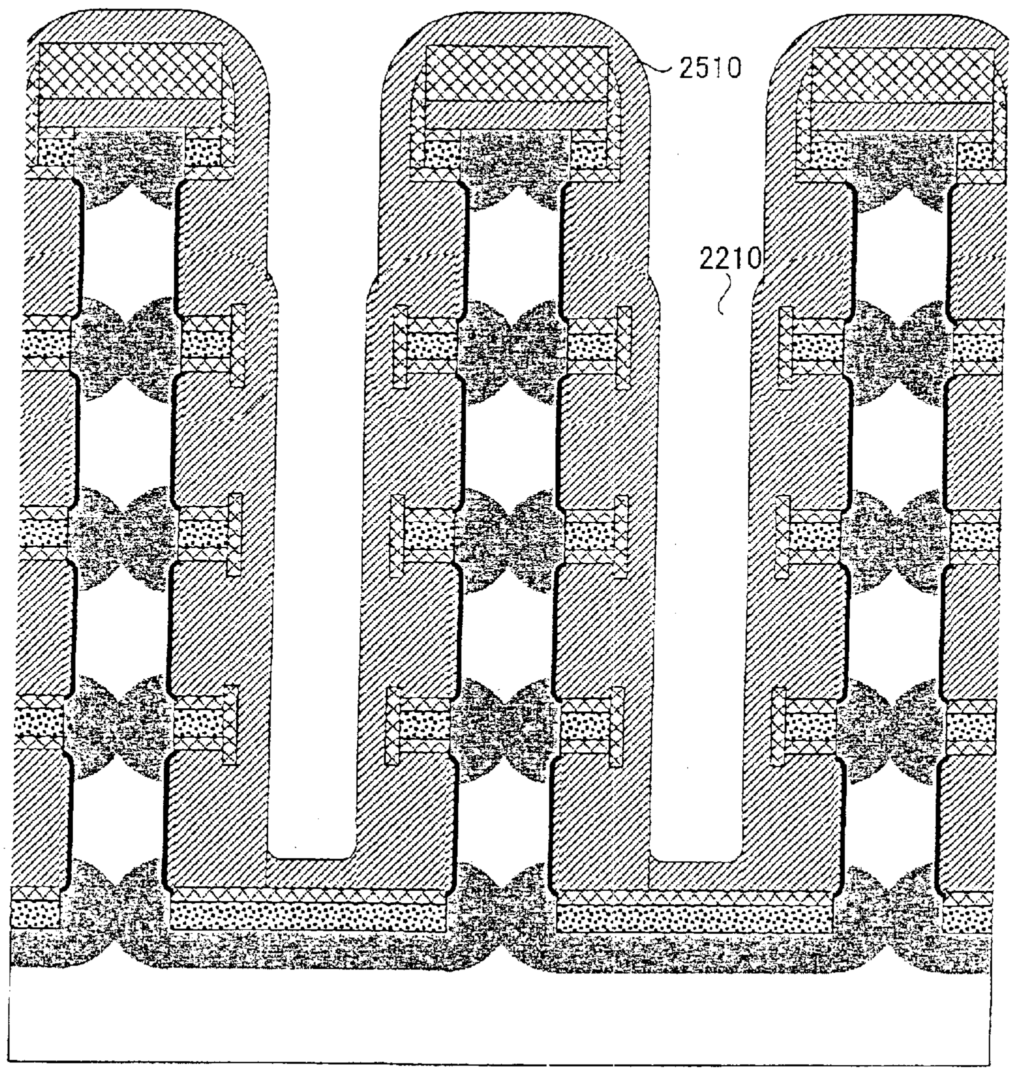
Figure 672:
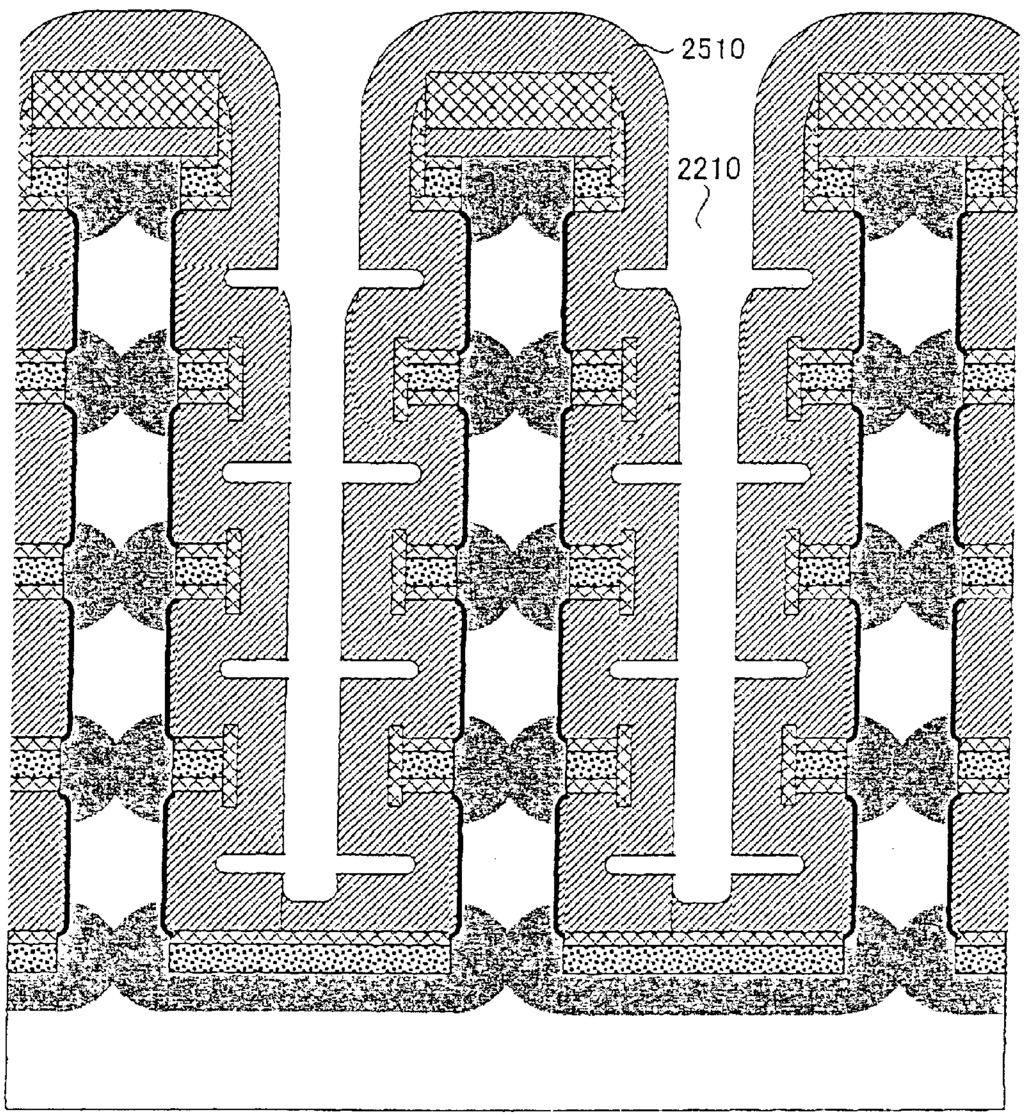
Figure 673:
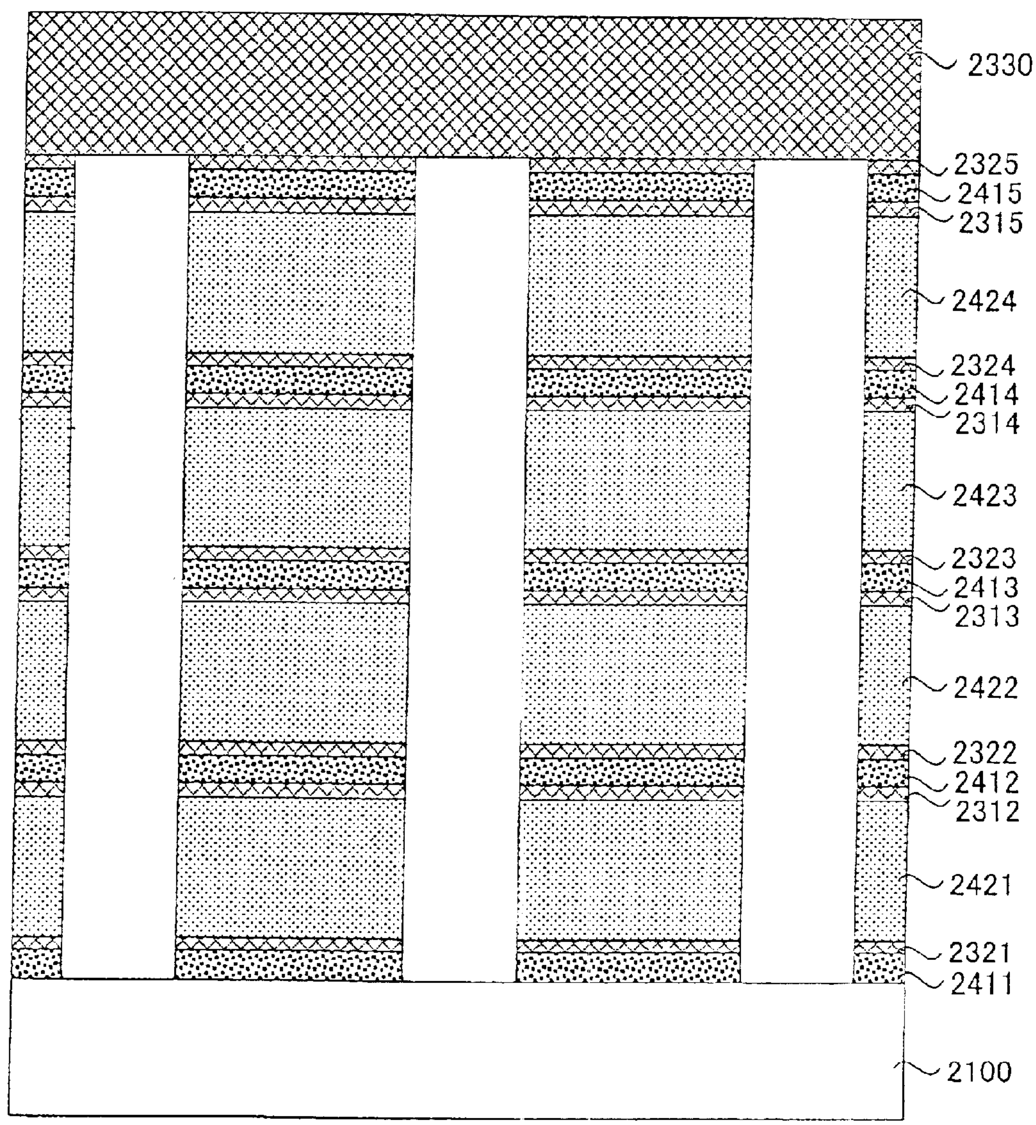
Figure 674:
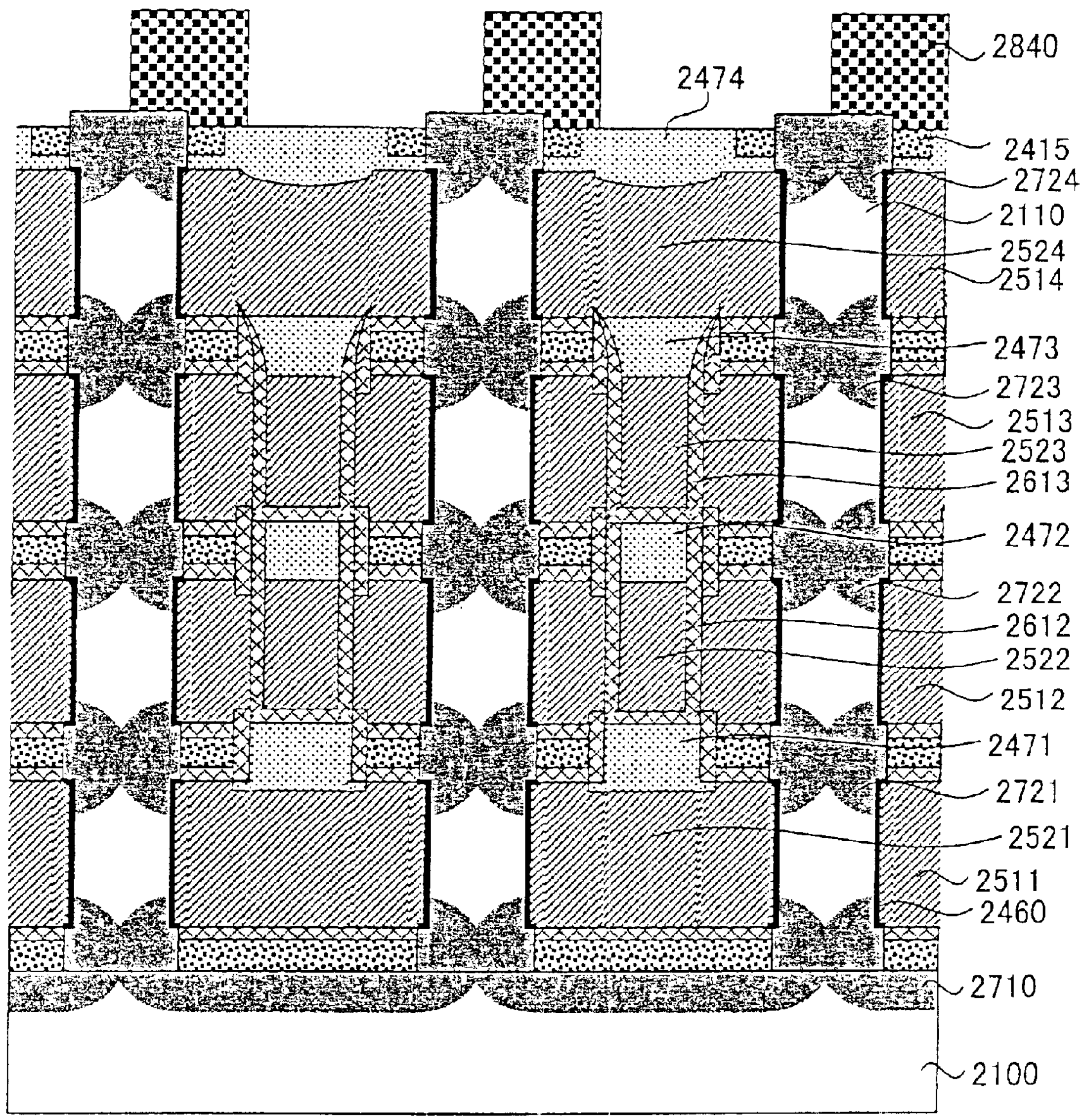
Figure 675:
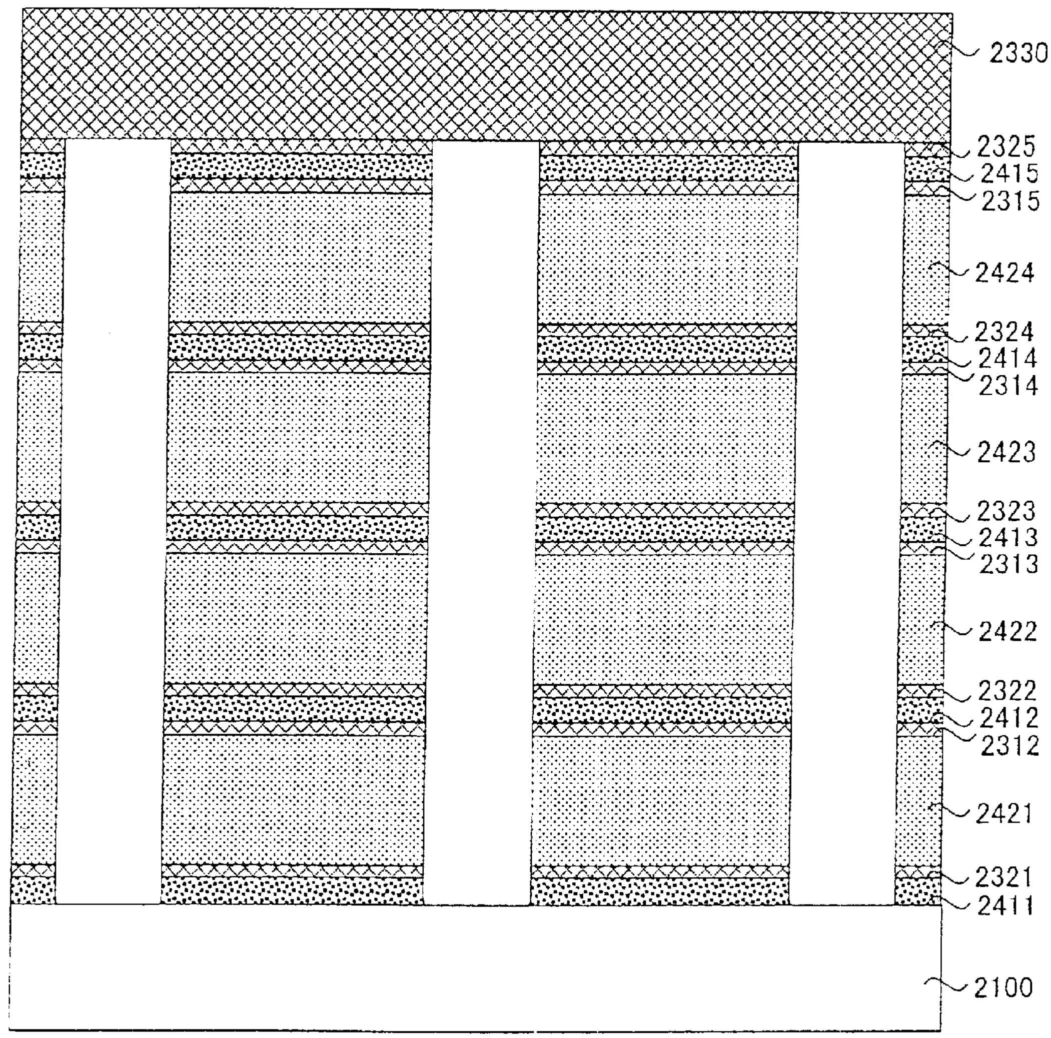
Figure 676:
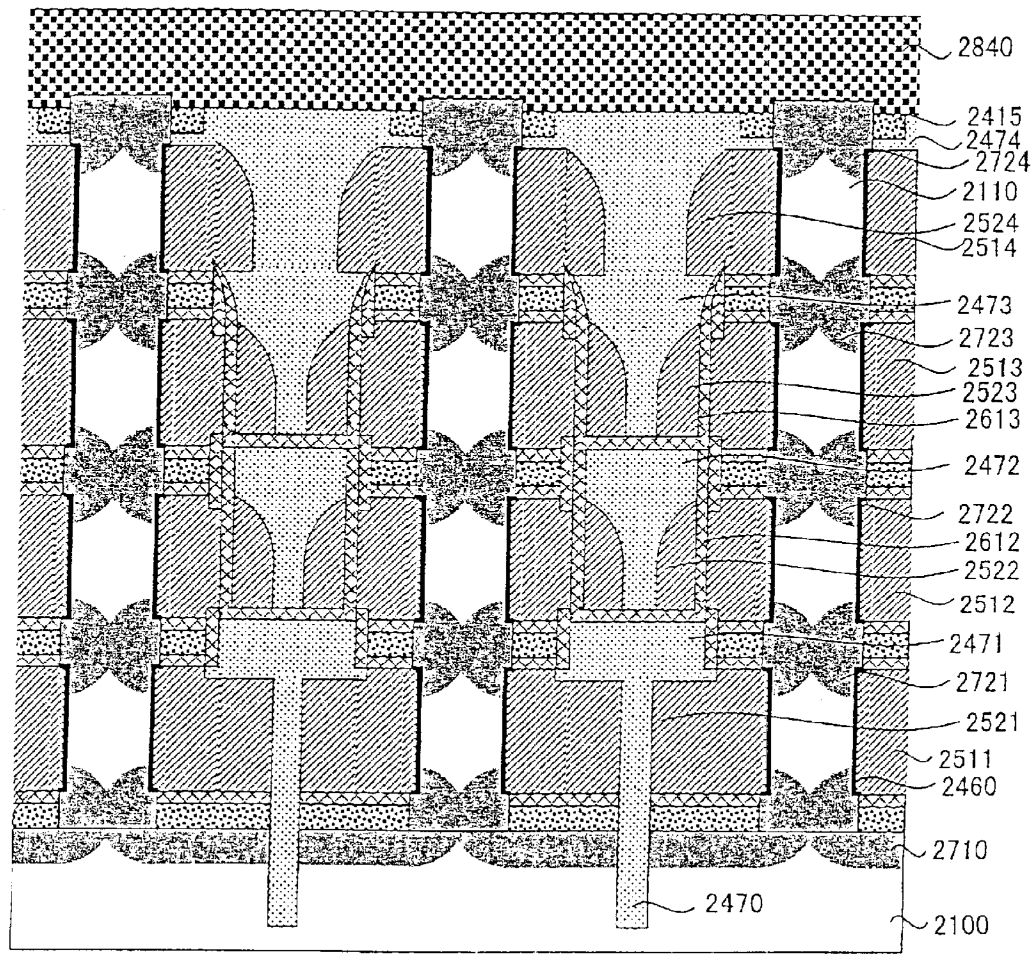
Figure 677:
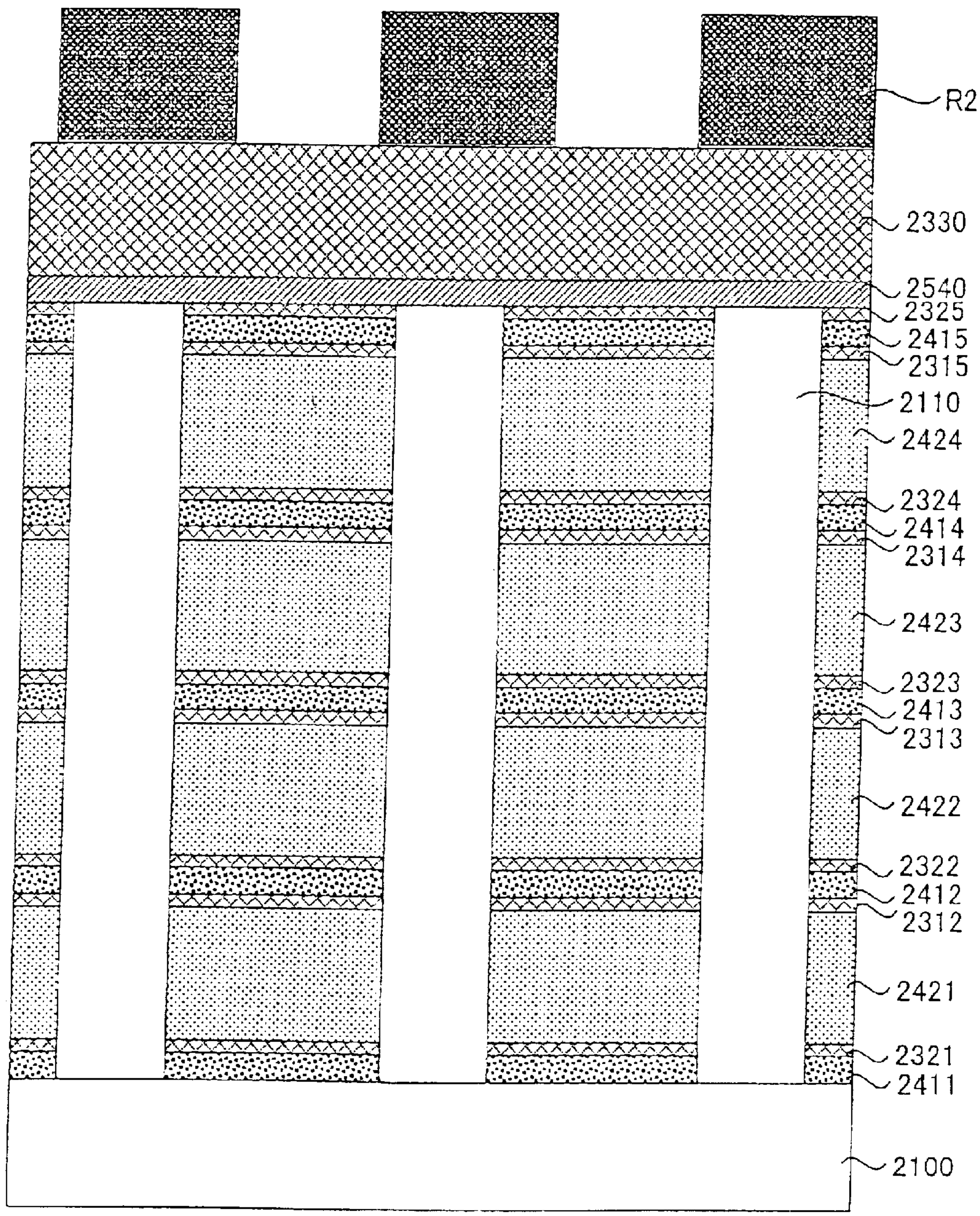
Figure 678:
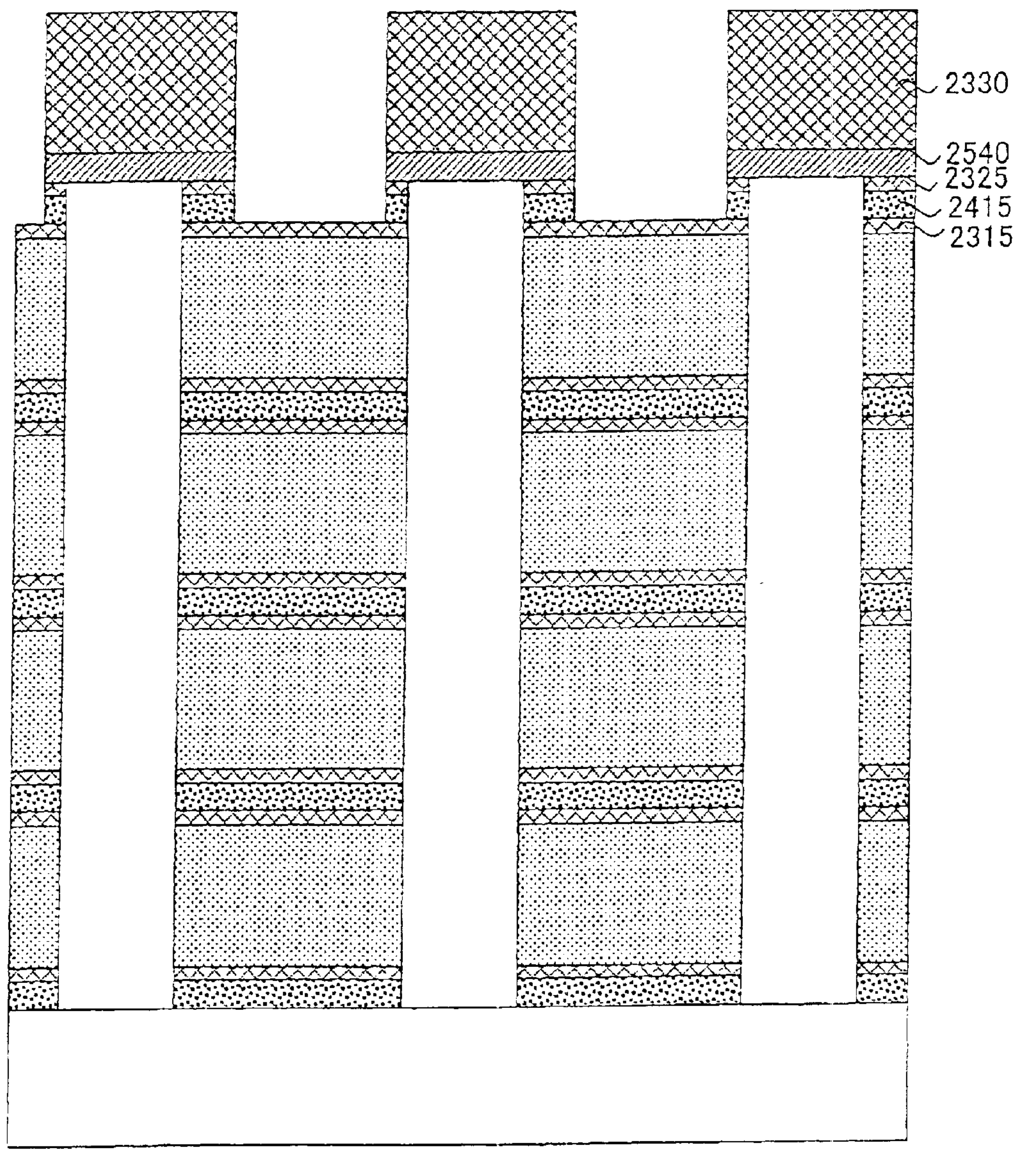
Figure 679:
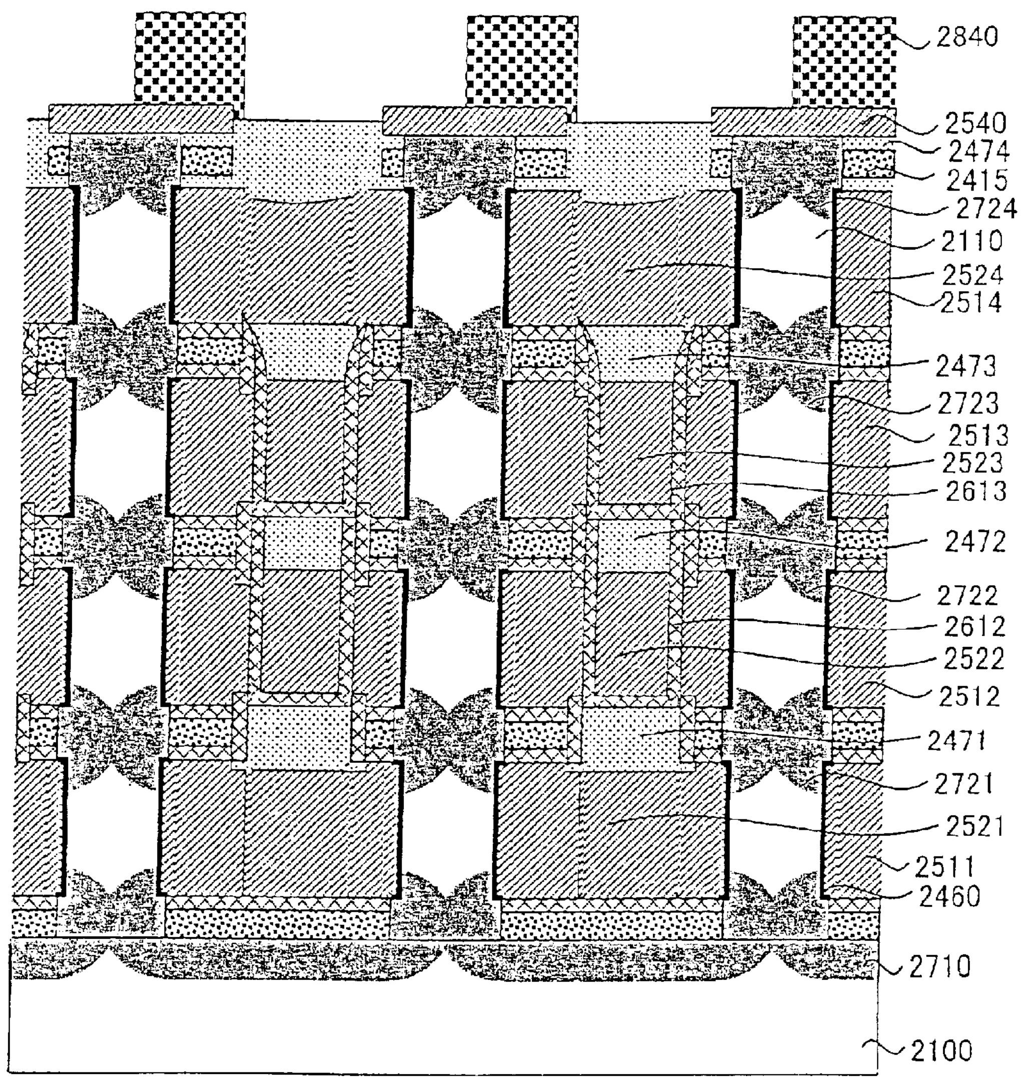
Figure 680:
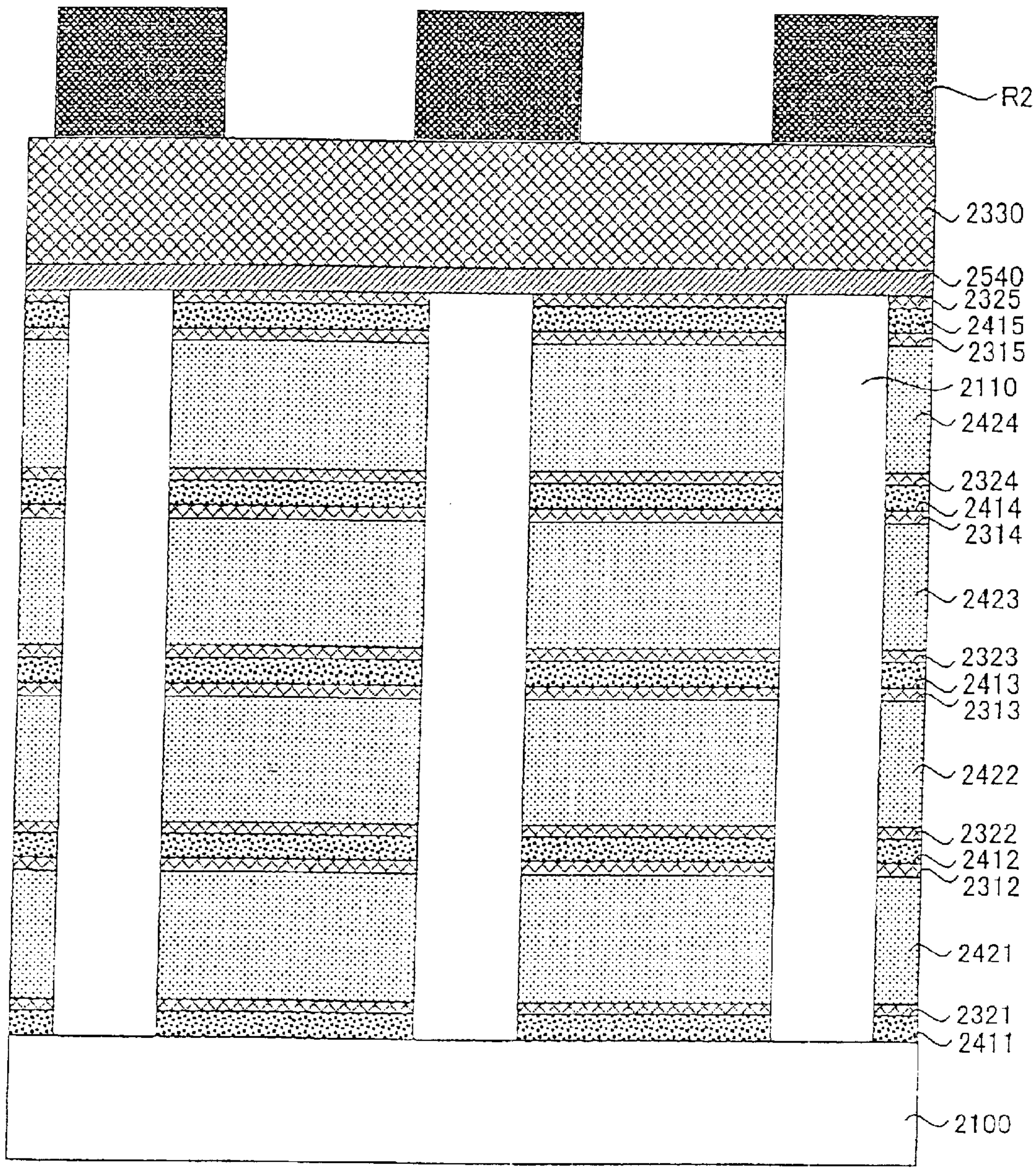
Figure 681:
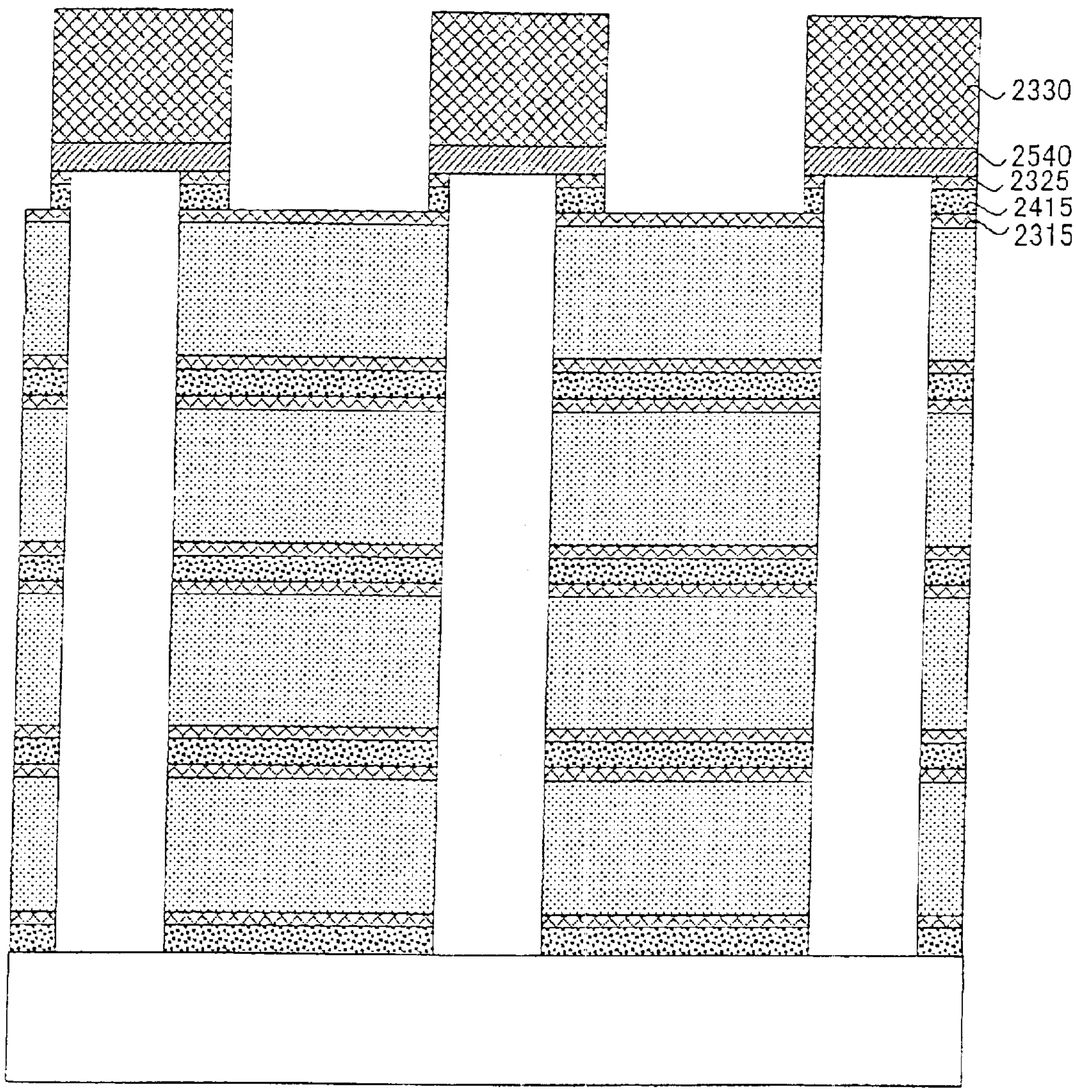
Figure 682:
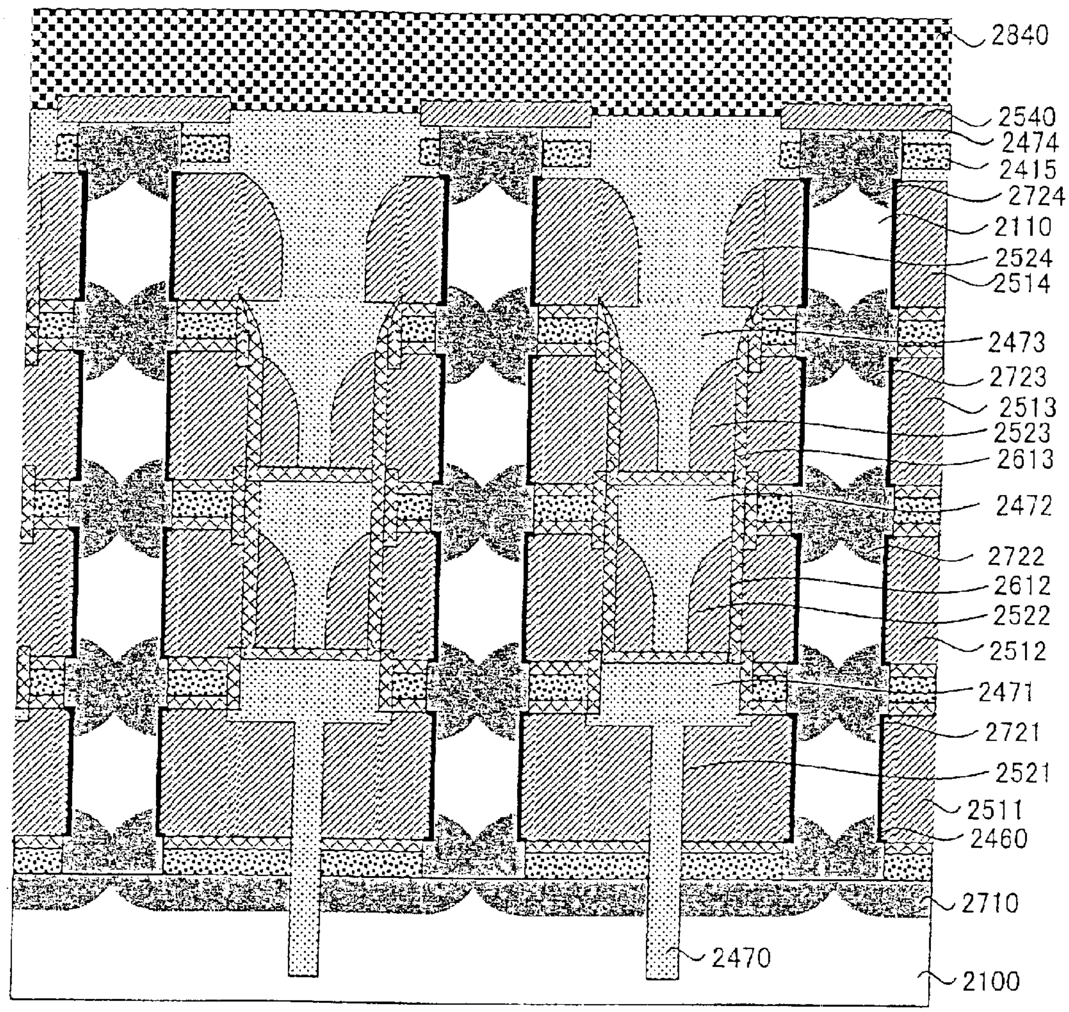

As shown in FIGS. 657 and 659, a trench is formed and then a silicon oxide film 2495, for example, is deposited as a twenty-third insulating film to a thickness of 2 to 20 nm by CVD on the inner wall of the trench. The silicon oxide film 2495 is then anisotropically etched into the form of a sidewall spacer. Thereby, the island-like semiconductor layers are formed by selective epitaxial growth from the semiconductor substrate without contacting the silicon nitride film, which prevents nitrification of the island-like semiconductors (FIGS. 658 and 660).

PRODUCTION EXAMPLE 29

In an example of production process for producing a semiconductor memory in which regions for forming the charge storage layers are defined in advance by a laminated film comprising plural films, explanation is given of an example of production process in which the polysilicon films have different shapes.

Such a semiconductor memory may be produced by the following production process. FIGS. 661 to 666 and FIGS. 667 to 672 are sectional views taken on line A-A' and line B-B', respectively, in FIG. 1 which is a plan view illustrating an EEPROM memory cell array.

A polysilicon film 2510 which is a first conductive film covering the semiconductor layer 2110 may have a shape such that it is uniformly deposited along the bottom shape of the first trench 2210 as shown in FIGS. 661 to 662, 667 to 668, 663 to 664 and 669 to 670. Alternatively, the polysilicon film 2510 may have a shape such that it is deposited partially ununiformly according to the bottom shape of the first trench 2210 as shown in FIGS. 665 to 671 and 666 to 672.

PRODUCTION EXAMPLE 30

In an example of production process for producing a semiconductor memory in which regions for forming the charge storage layers are defined in advance by a laminated film comprising plural films, explanation is given of an example of production process in which the polysilicon film 2540 (fourth conductive film) is not formed.

Such a semiconductor memory may be produced by the following production process. FIGS. 673 to 674 and FIGS. 675 to 676 are sectional views taken on line A-A' and line B-B', respectively, in FIG. 1 which is a plan view illustrating an EEPROM memory cell array.

A semiconductor memory shown in FIGS. 673 to 674 and FIGS. 675 to 676 is formed by production steps according to Production example 11.

PRODUCTION EXAMPLE 31

In an example of production process for producing a semiconductor memory in which regions for forming the charge storage layers are defined in advance by a laminated film comprising plural films, explanation is given of an example of production process in which the trench which is formed by using a photoresist mask and in which the island-like semiconductor layer is formed is mis-aligned with the floating gate.

Such a semiconductor memory may be produced by the following production process. FIGS. 677 to 679 and FIGS. 680 to 682 are sectional views taken on line A-A' and line B-B', respectively, in FIG. 1 which is a plan view illustrating an EEPROM memory cell array.

As shown in FIGS. 677 to 679 and FIGS. 680 to 682, the semiconductor layer 2110 defined by a resist film R1 and the region for the charge storage layer defined by a resist film R2 are not necessarily be symmetrically formed due to misalignment of the resist films R1 and R2. Even if they are asymmetrical, a semiconductor memory is realized which has a memory function according to the state of a charge in the charge storage layer.

PRODUCTION EXAMPLE 32

In a semiconductor memory to be produced in this example, regions for forming charge storage layers are defined in advance by a laminated film comprising plural films. The island-like semiconductor layers are formed in a pillar form by selective epitaxial silicon growth in trenches. Tunnel oxide films and floating gates as charge storage layers are formed on the sides of the island-like semiconductor layers in the regions for forming the charge storage layers. The island-like semiconductor layers are each in an electrically floating state with respect to the semiconductor substrate. The active region of each memory cell is in the electrically floating state. In this production example, selection gate transistors are disposed at the top and the bottom of the island-like semiconductor layer. A plurality of memory transistors, for example, two memory transistors, are placed between the selection gate transistors. The tunnel oxide film and the floating gate of the transistors are formed at the same time. The transistors are connected in series along the island-like semiconductor layer. Further, the thickness of gate insulating films of the selection gate transistors is equal to the thickness of gate insulating films of the memory transistors.

Such a semiconductor memory may be produced by the following production process. FIGS. 683 to 690 and FIGS. 691 to 698 are sectional views taken on line A-A' and line B-B', respectively, in FIG. 1 which is a plan view illustrating an EEPROM memory cell array.

First, on a surface of a P-type silicon substrate 2100, a silicon oxide film 2411 containing arsenic impurities of about $1\times10^{18}$ to $1\times10^{22}/cm^3$, for example, is deposited as a first insulating film to a thickness of 50 to 500 nm by CVD. At this time, ion implantation may be carried out to introduce the impurities to the insulating film deposited by CVD. For example, to the silicon oxide film 2411 deposited to a thickness of 50 to 500 nm, ion implantation may be carried out at an implantation energy of 5 to 100 keV at an arsenic dose of about $1\times10^{14}$ to $1\times10^{16}$/cm$^2$ at an angle of about 0 to 45° with respect to the normal line of the surface of the substrate. The impurity introduction to the silicon oxide film 2411 by ion implantation may not necessarily be carried out immediately after the deposition of the silicon oxide film 2411. Regarding the ion implantation to the silicon oxide film 2411, the angle for the implantation is not particularly limited as long as a desired impurity concentration is obtained. Means for the impurity introduction to the silicon oxide film 2411 is not limited to the ion implantation, but any means such as solid or vapor phase diffusion may be used. Thereafter, a silicon nitride film 2321, for example, is deposited as a fourth insulating film to a thickness of 10 to 100 nm. If the above-mentioned impurity introduction to the silicon oxide film 2411 is carried out by ion implantation, the impurities may be introduced by ion implantation through the silicon nitride film 2321 into the silicon oxide film 2411.

Then, a silicon oxide film 2421, for example, is deposited as a third insulating film to a thickness of 50 to 500 nm, a silicon nitride film 2312, for example, is deposited as a second insulating film to a thickness of 10 to 100 nm and a silicon oxide film 2412 is deposited as a first insulating film to a thickness of 50 to 500 nm.

Figure 683:
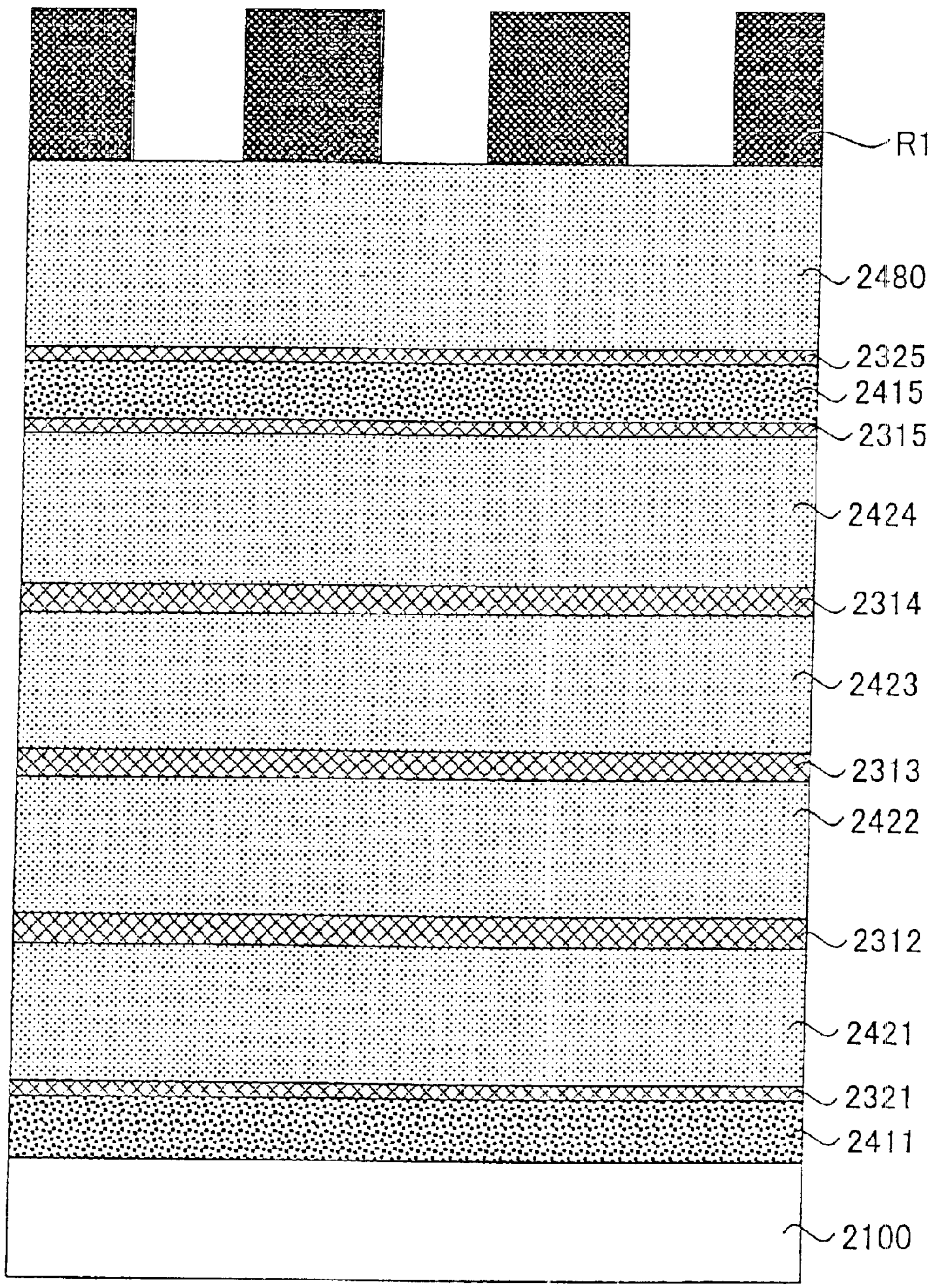
Figure 691:
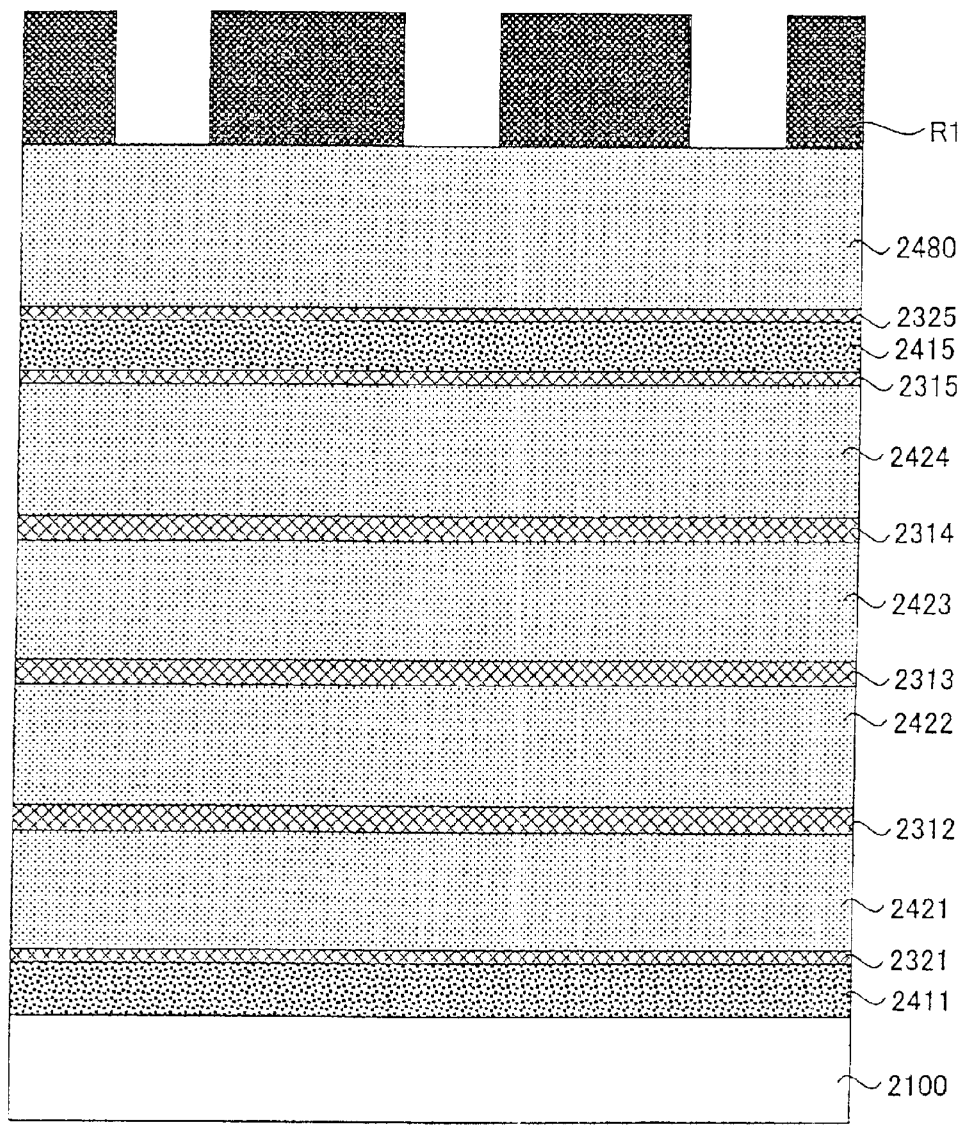

After the films are thus formed in sequence, a silicon oxide film 2415, for example, is deposited as a first insulating film to a thickness of 50 to 500 nm, a silicon nitride film 2325 is deposited as a fourth insulating film to a thickness of 10 to 100 nm, and then a silicon oxide film 2480 is deposited as a fourteenth insulating film to a thickness of 100 to 1,000 nm as shown in FIGS. 683 and 691.

Figure 684:
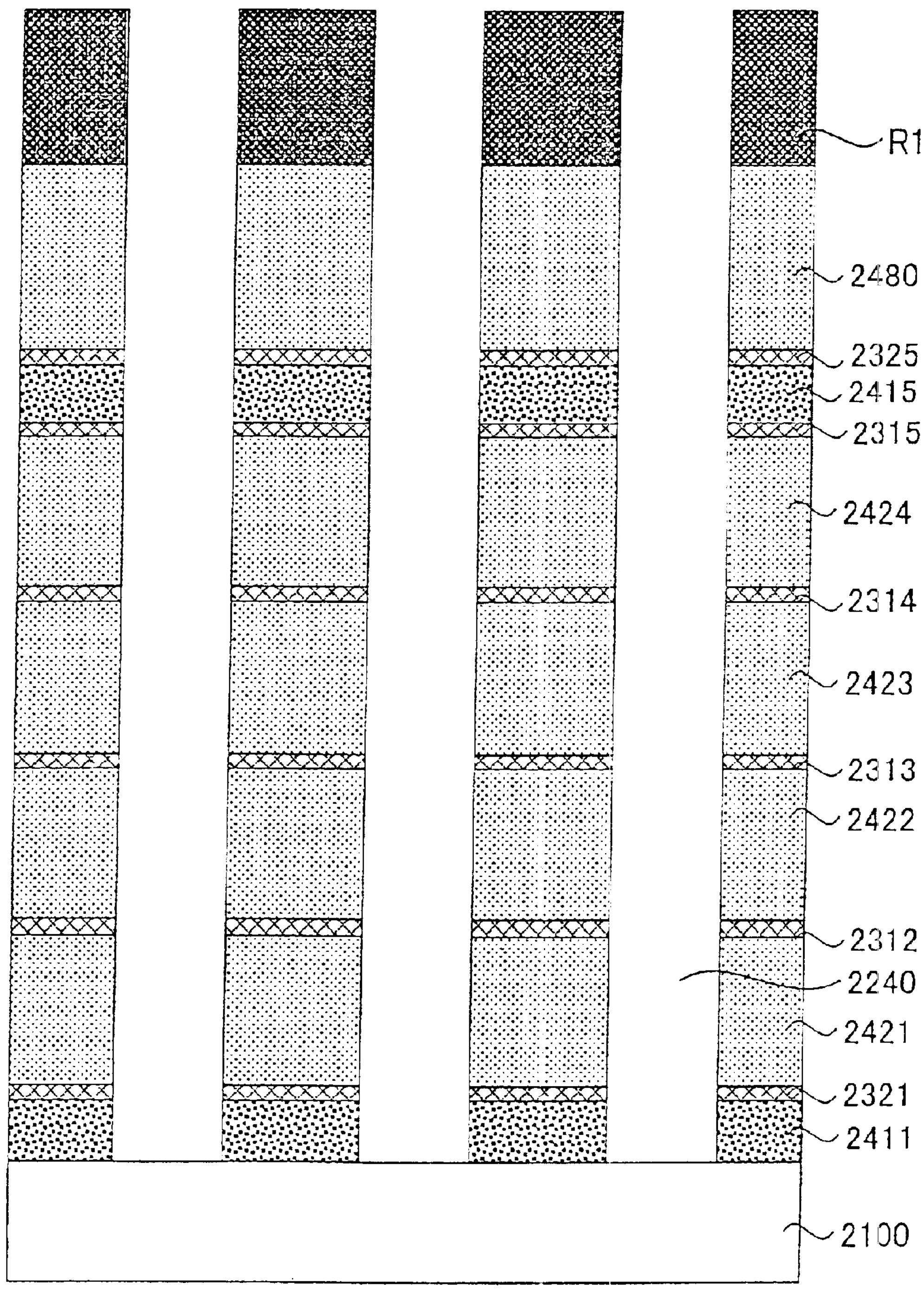
Figure 692:
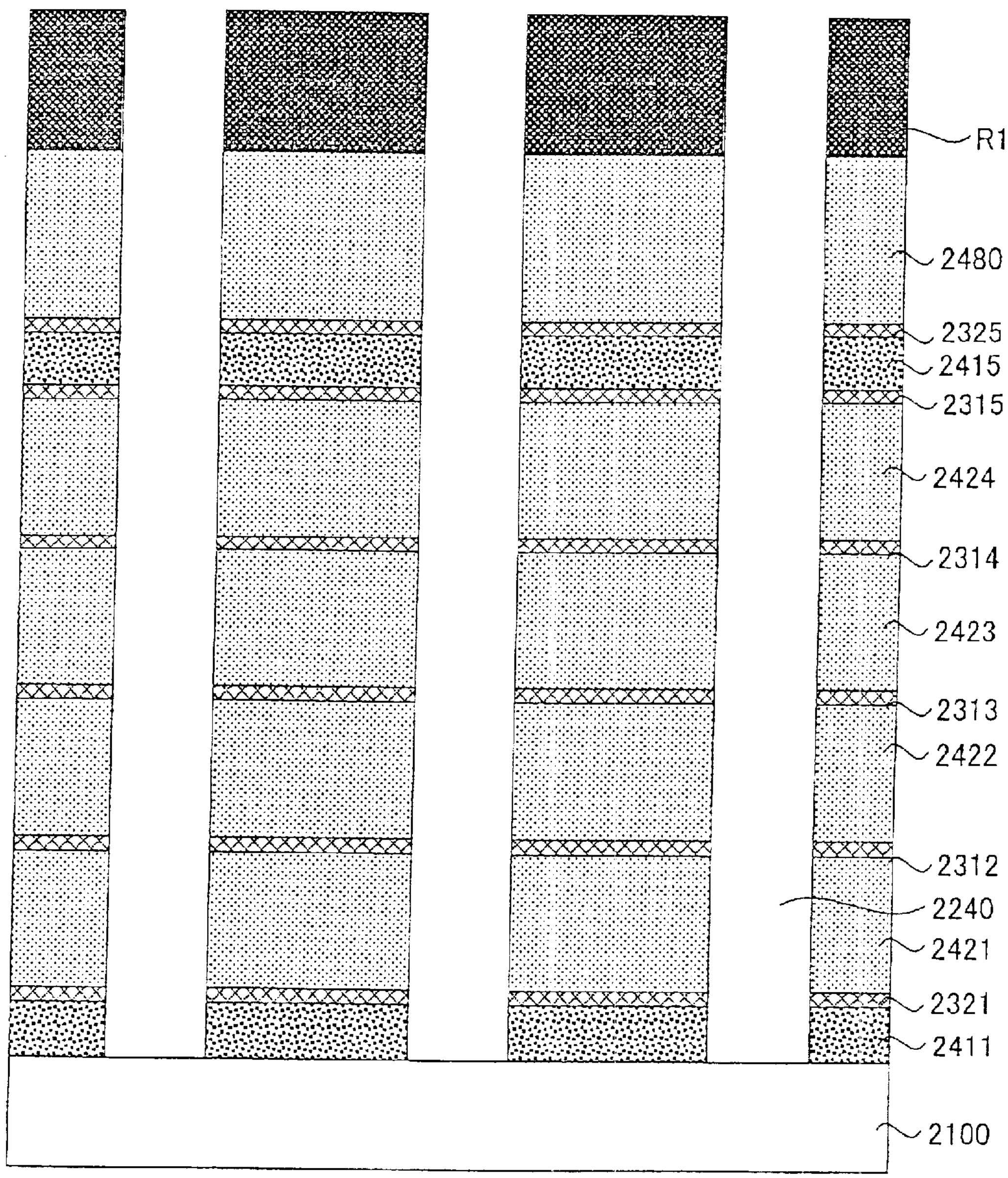

Subsequently, using a resist film R1 patterned by a known photolithographic technique as a mask (FIGS. 683 and 691), reactive ion etching, for example, is performed to successively etch the silicon oxide film 2480, the silicon nitride film 2325, the silicon oxide film 2415, the silicon nitride film 2315, the silicon oxide film 2424, the silicon nitride film 2314, the silicon oxide film 2423, the silicon nitride film 2313, the silicon oxide film 2422, the silicon nitride film 2312, the silicon oxide film 2421, the silicon nitride film 2321 and the silicon oxide film 2411, thereby forming a fourth trench 2240 (FIGS. 684 and 692).

Figure 685:
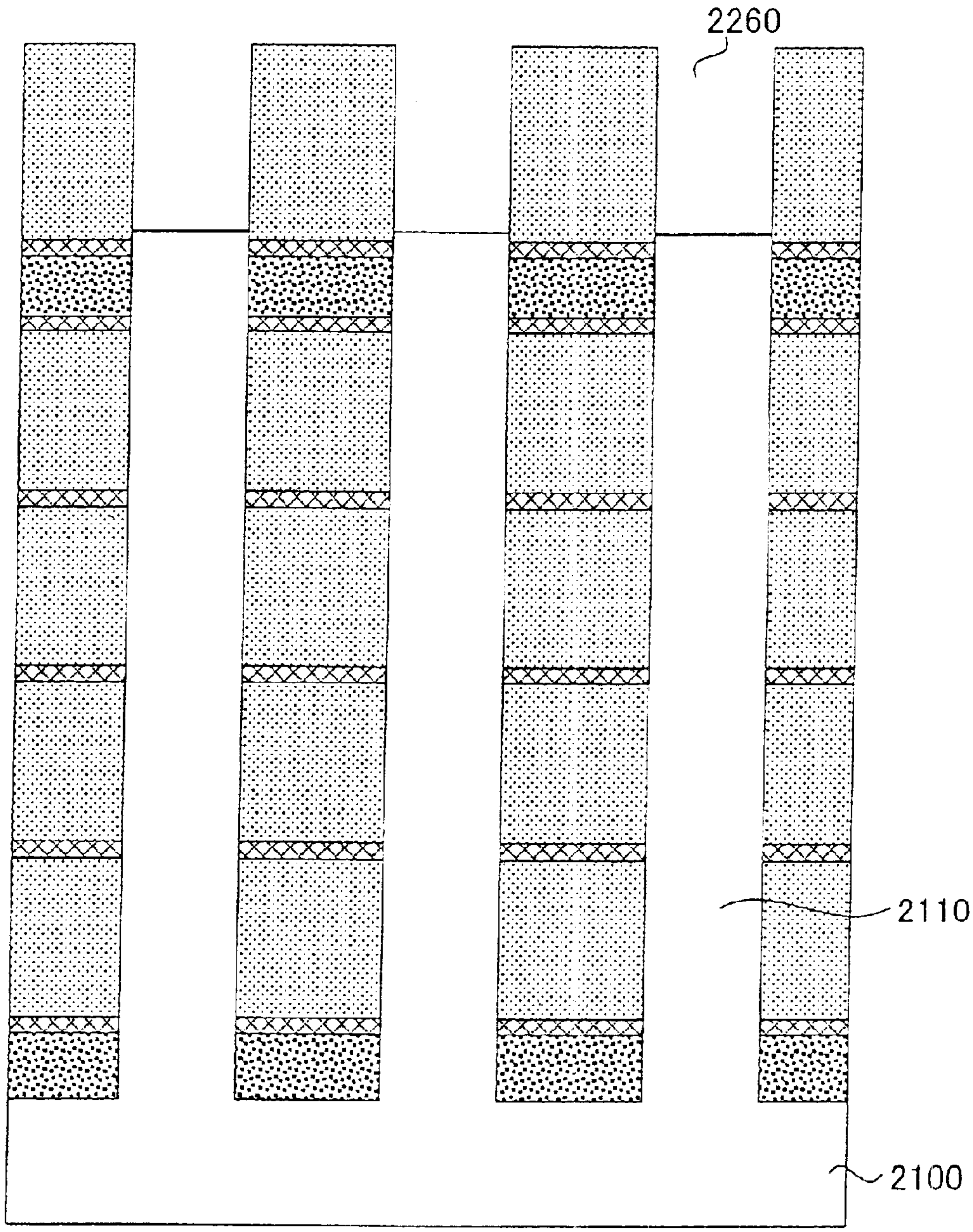
Figure 693:
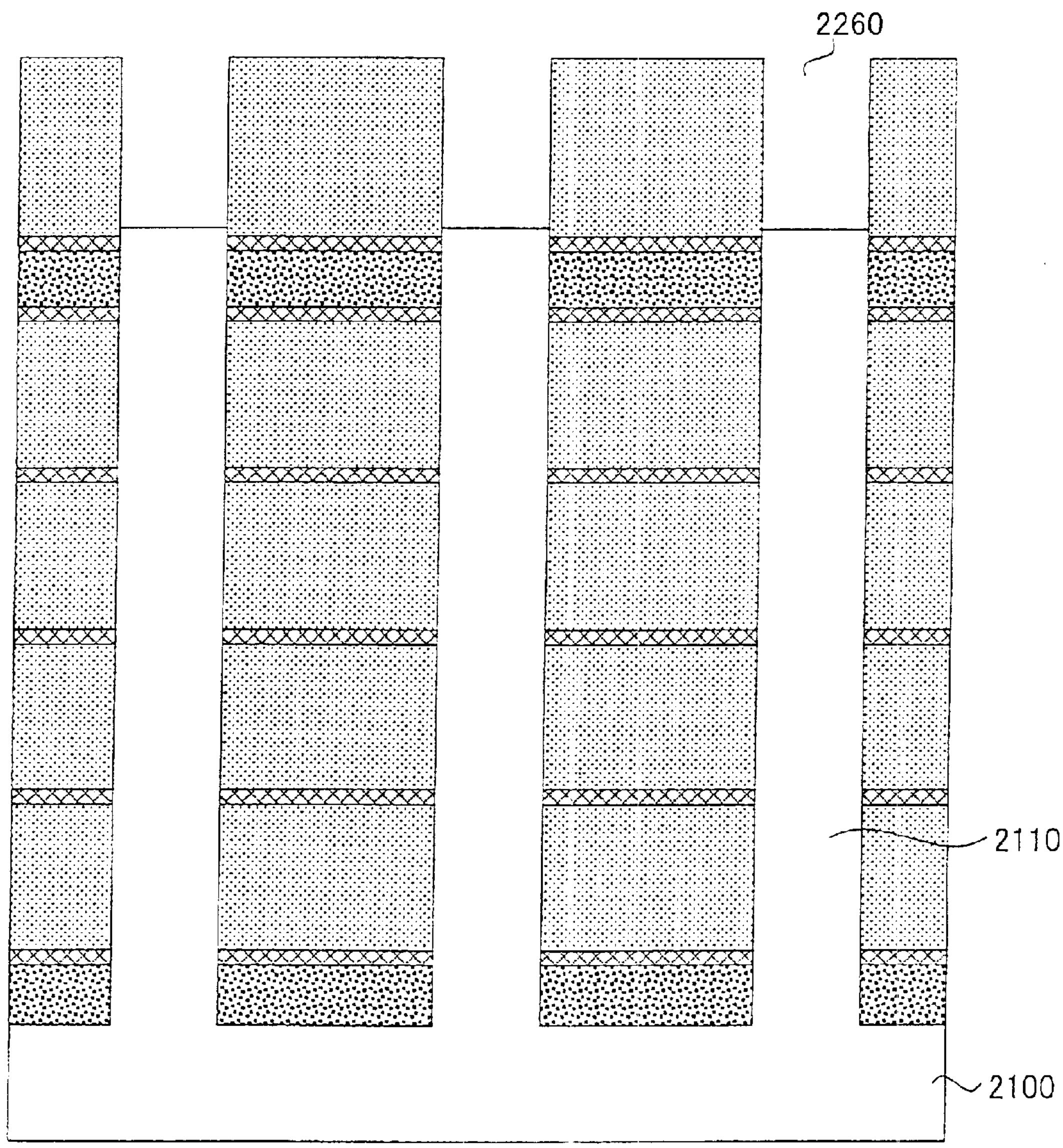

The resist film R1 is removed and then island-like semiconductor layers 2110 are filled in the fourth trench 2240. For example, the island-like semiconductor layers 2110 are formed by selective epitaxial growth from the P-type silicon substrate 2100 located at the bottom of the fourth trench 2240. Thereby, a sixth trench 2260 is formed (FIGS. 685 and 693). At this time, the island-like semiconductor layer 2110 may be grown to a level higher than the silicon nitride film 2325 such that at least the side of the silicon oxide film 2415 is covered. Alternatively, the semiconductor layer 2110 formed by selective epitaxial growth may be etched back isotropically or anisotropically to a level lower than the bottom of the silicon nitride film 2315. Or alternatively, the island-like semiconductor layer 2110 may be formed by a combination of flattening by CMP and etch-back.

Figure 686:
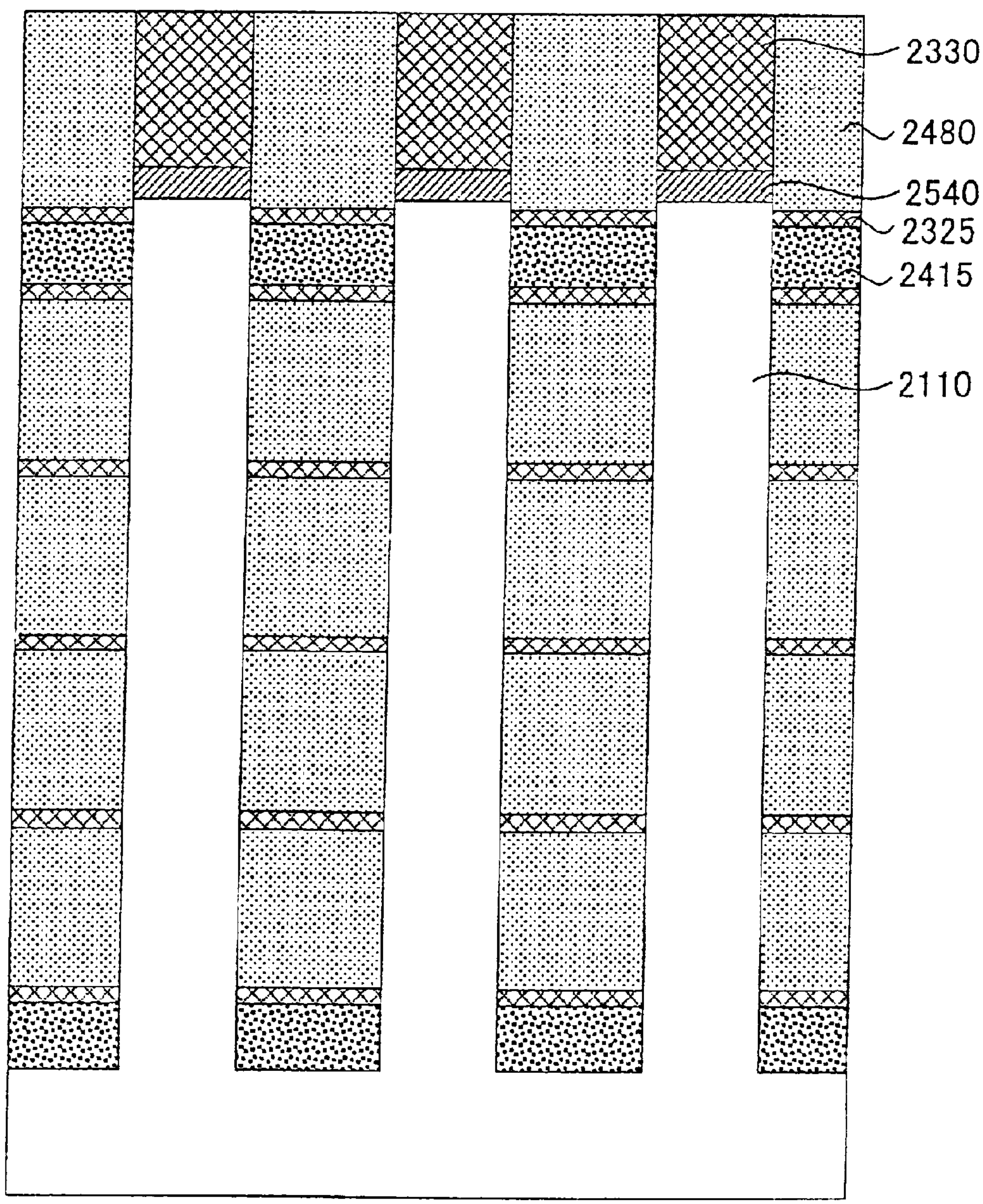
Figure 694:
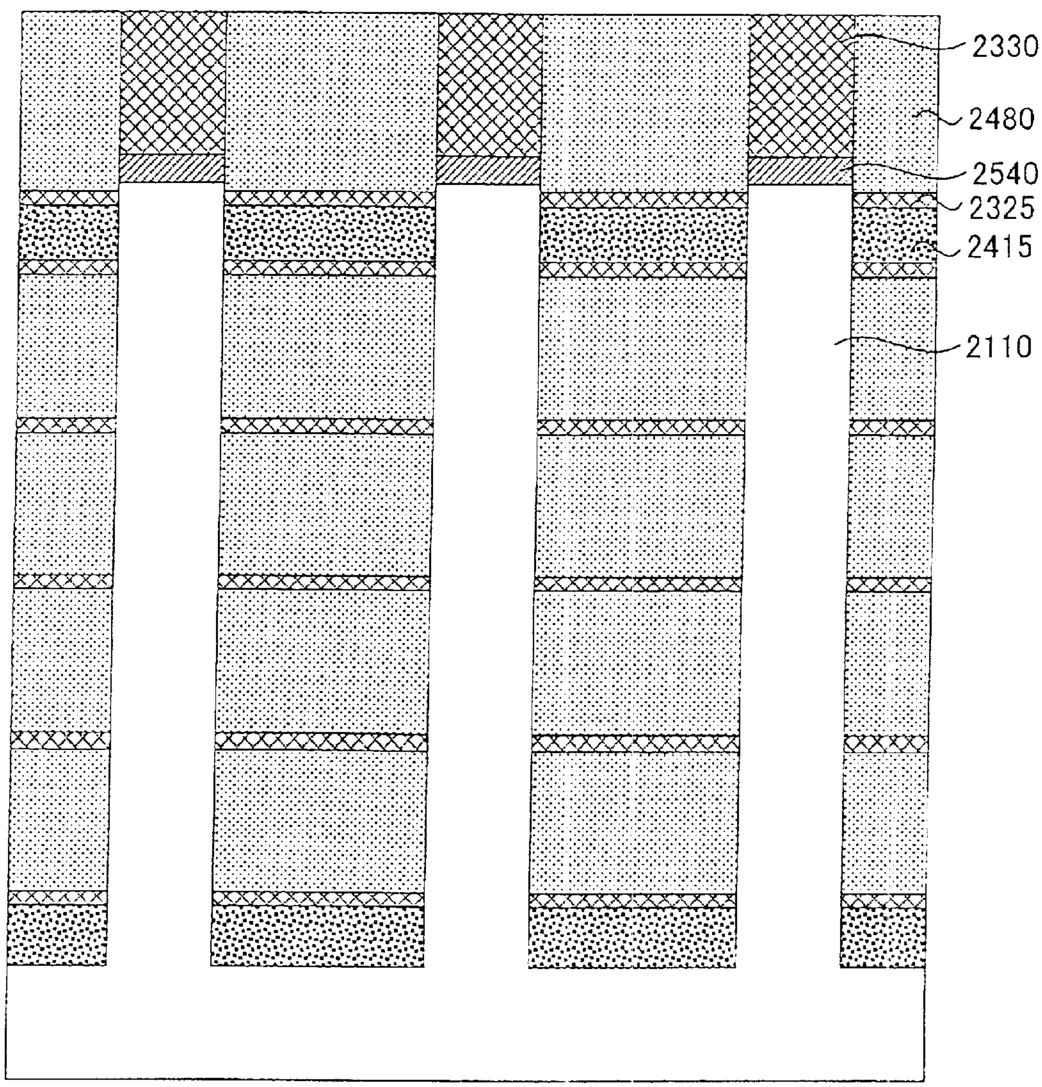

Thereafter, a polysilicon film 2540, for example, is deposited as a fourth conductive film to a thickness of about 100 to 300 nm and then etched back to remain at the bottom of the sixth trench 2260. Further, a silicon nitride film 2330 is deposited as a fifth insulating film to a thickness of about 200 to 2,000 nm in the sixth trench 2260 and then flattened by isotropic or anisotropic etch-back or by CMP to be buried in the sixth trench. At this time, at least the silicon oxide film 2480 (the fourteenth insulating film) is exposed (FIGS. 686 and 694).

Figure 687:
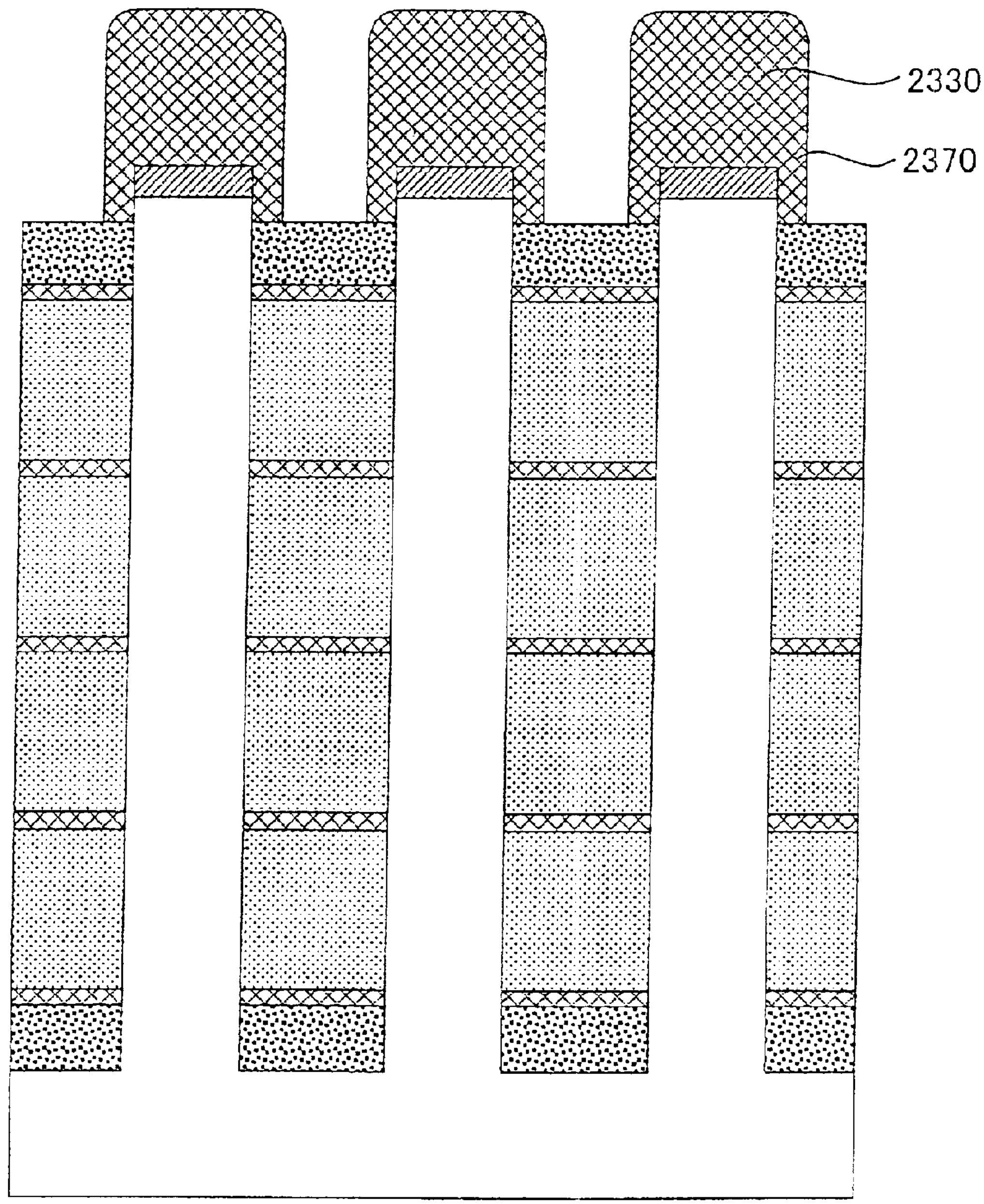
Figure 688:
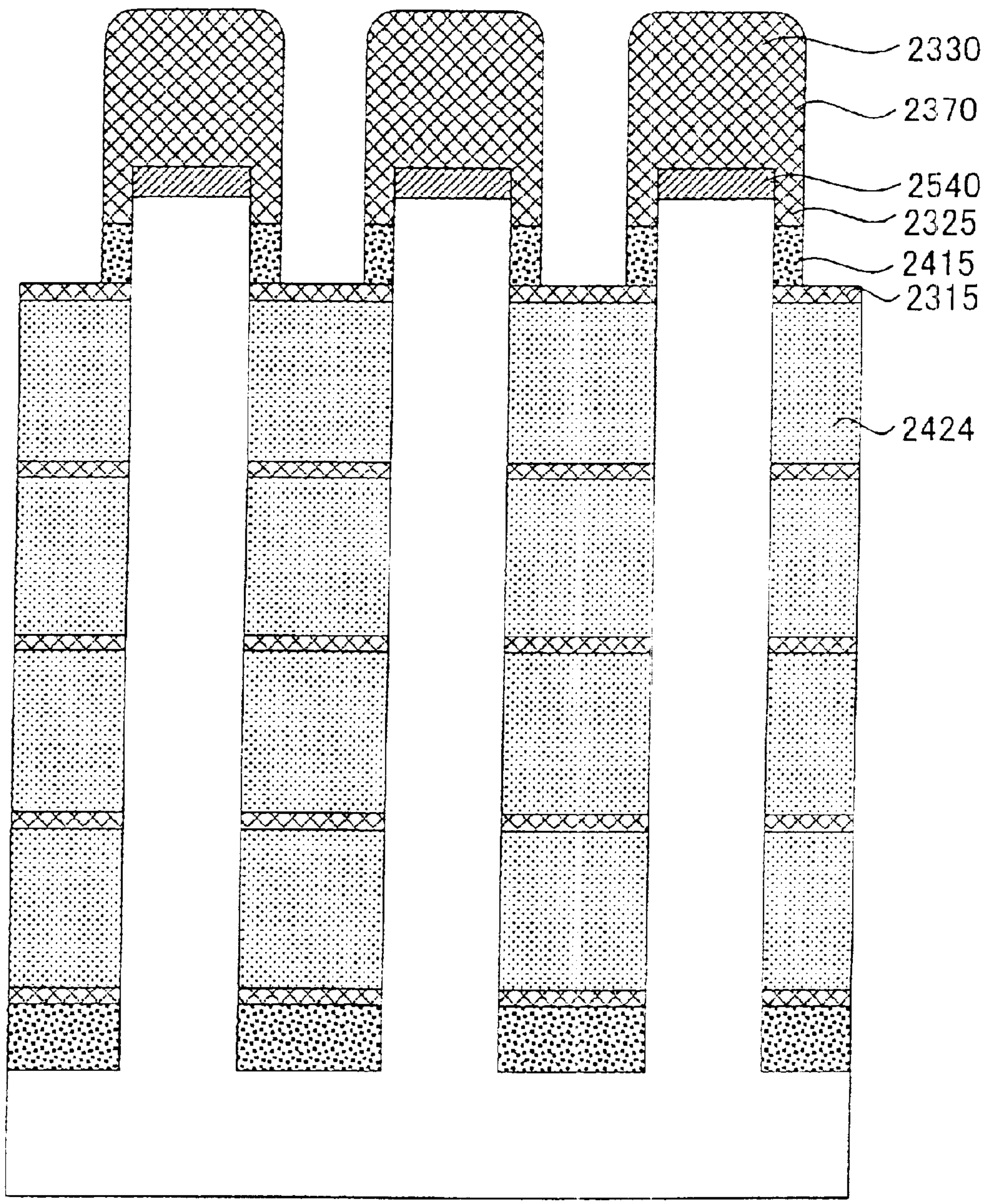
Figure 695:
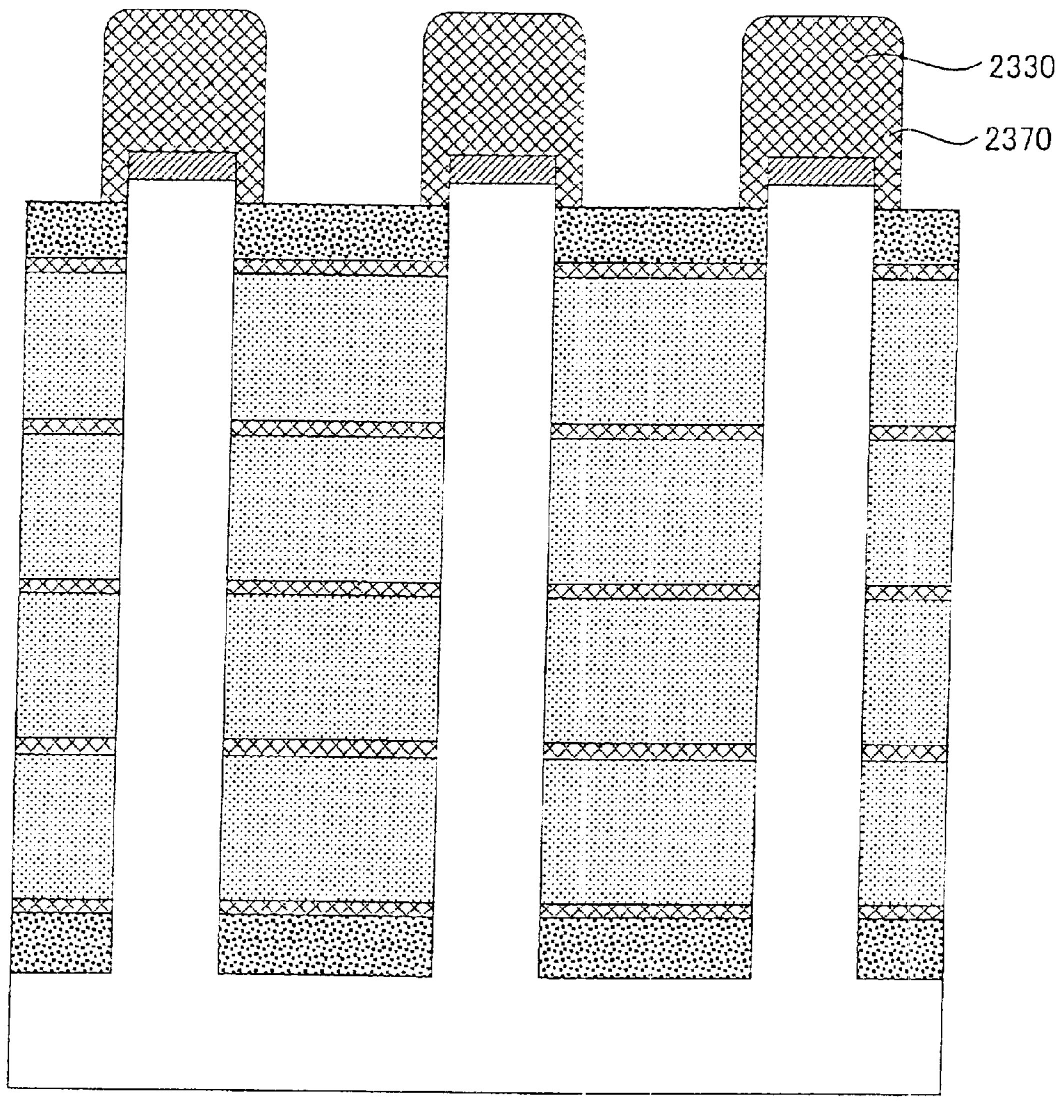
Figure 696:
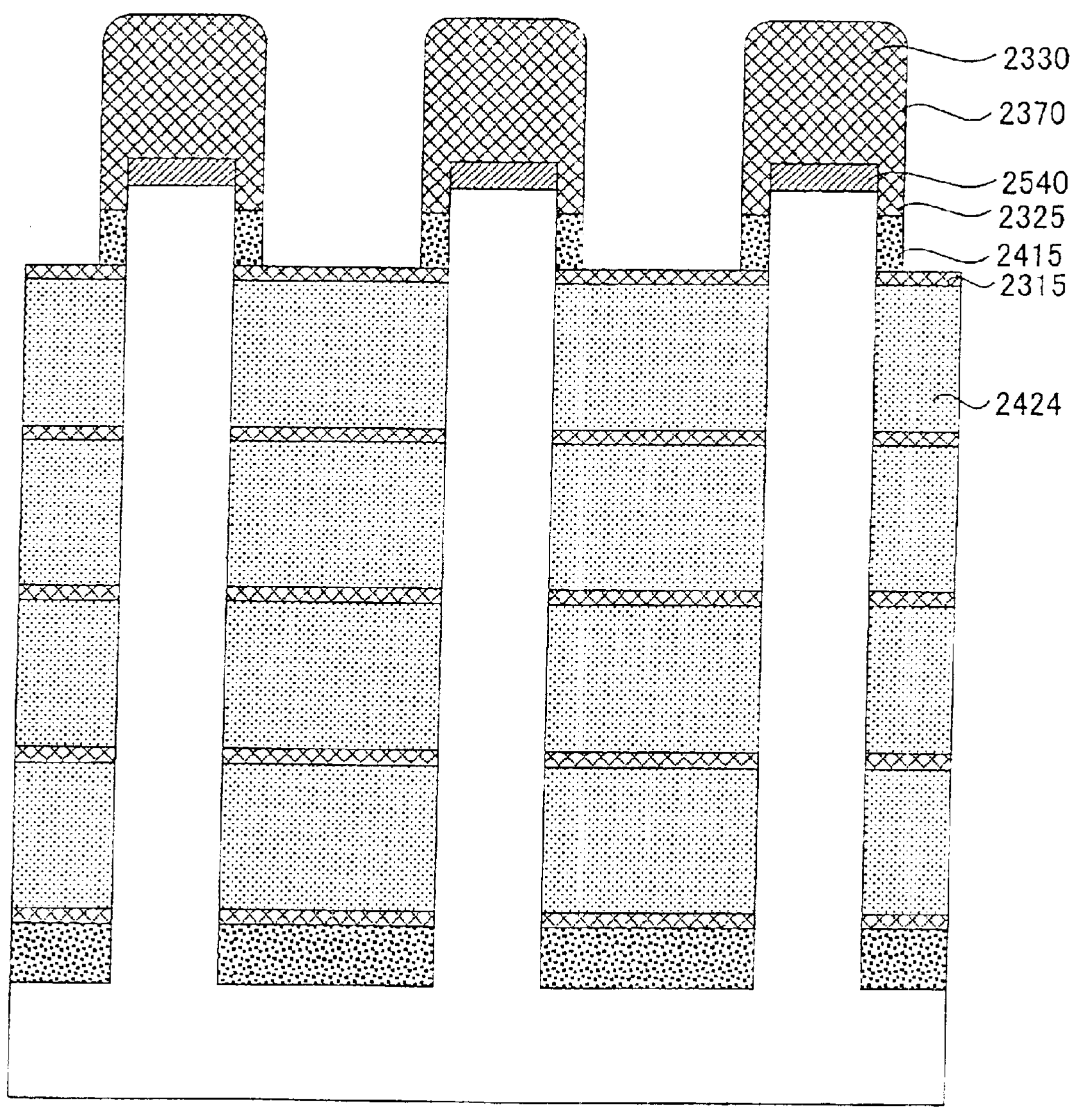

Subsequently, the silicon oxide film 2480 is selectively removed, for example, by isotropic etching. A silicon nitride film 2370 is deposited to a thickness of about 20 to 200 nm as a fifteenth insulating film and anisotropically etched into the form of a sidewall spacer on the sidewall of the silicon nitride film 2330 (FIGS. 687 and 695). Using the silicon nitride film 2330 (the fifth insulating film) and the silicon nitride film 2370 (the fifteenth insulating film) as a mask, the silicon nitride film 2325 and the silicon oxide film 2415 are etched sequentially by reactive ion etching, thereby exposing the silicon nitride film 2315 (FIGS. 688 and 696). At this time, the silicon nitride film 2315 may be etched until the silicon oxide film 2424 is exposed.

Figure 689:
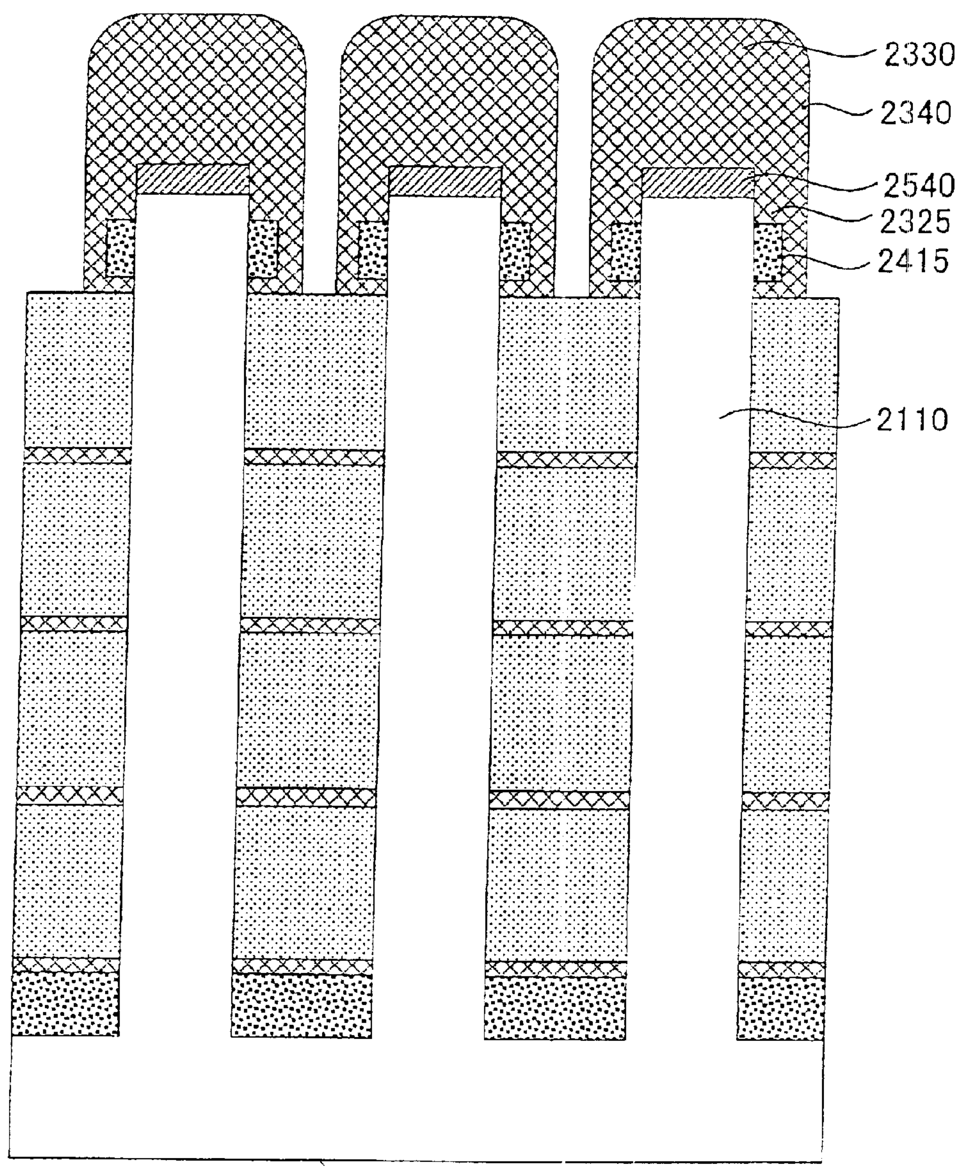
Figure 690:
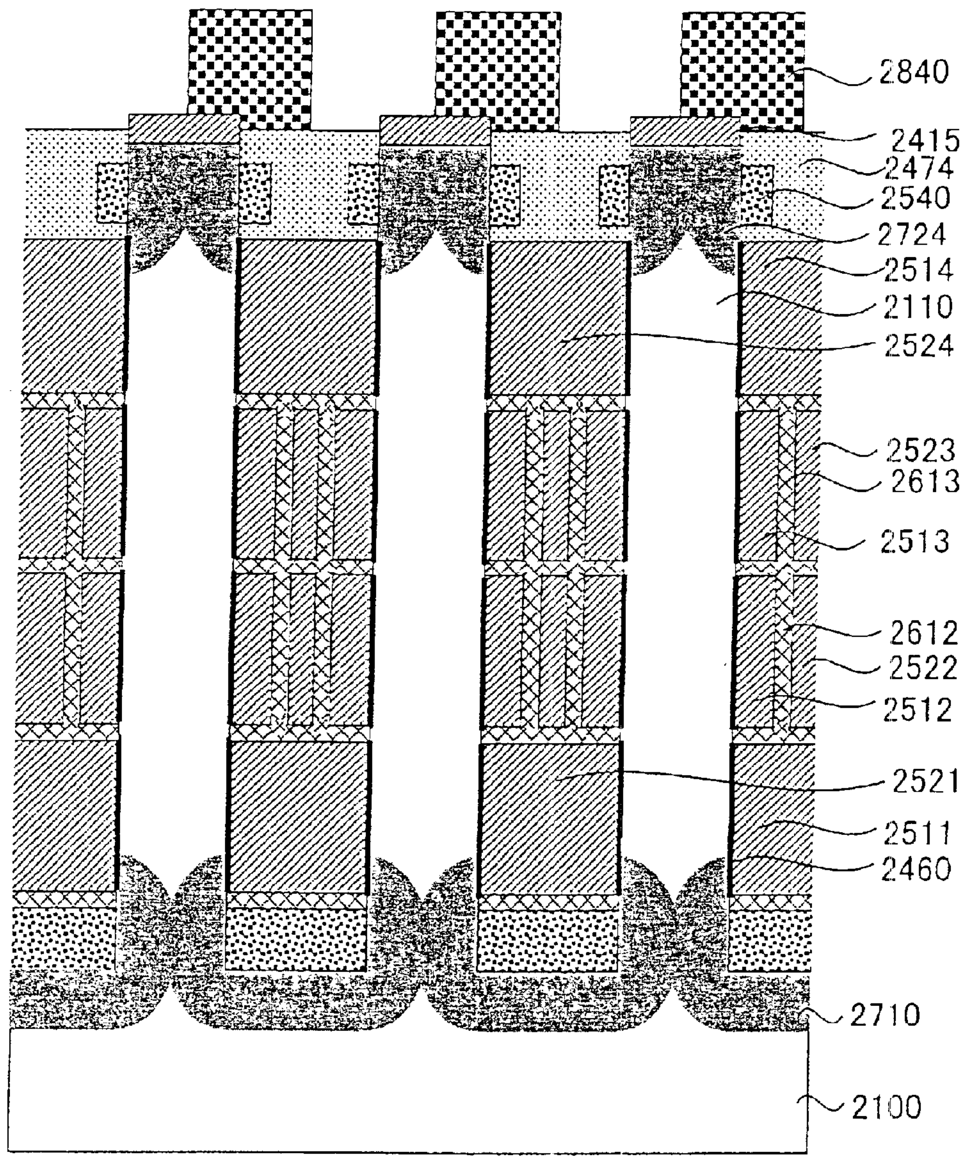
Figure 697:
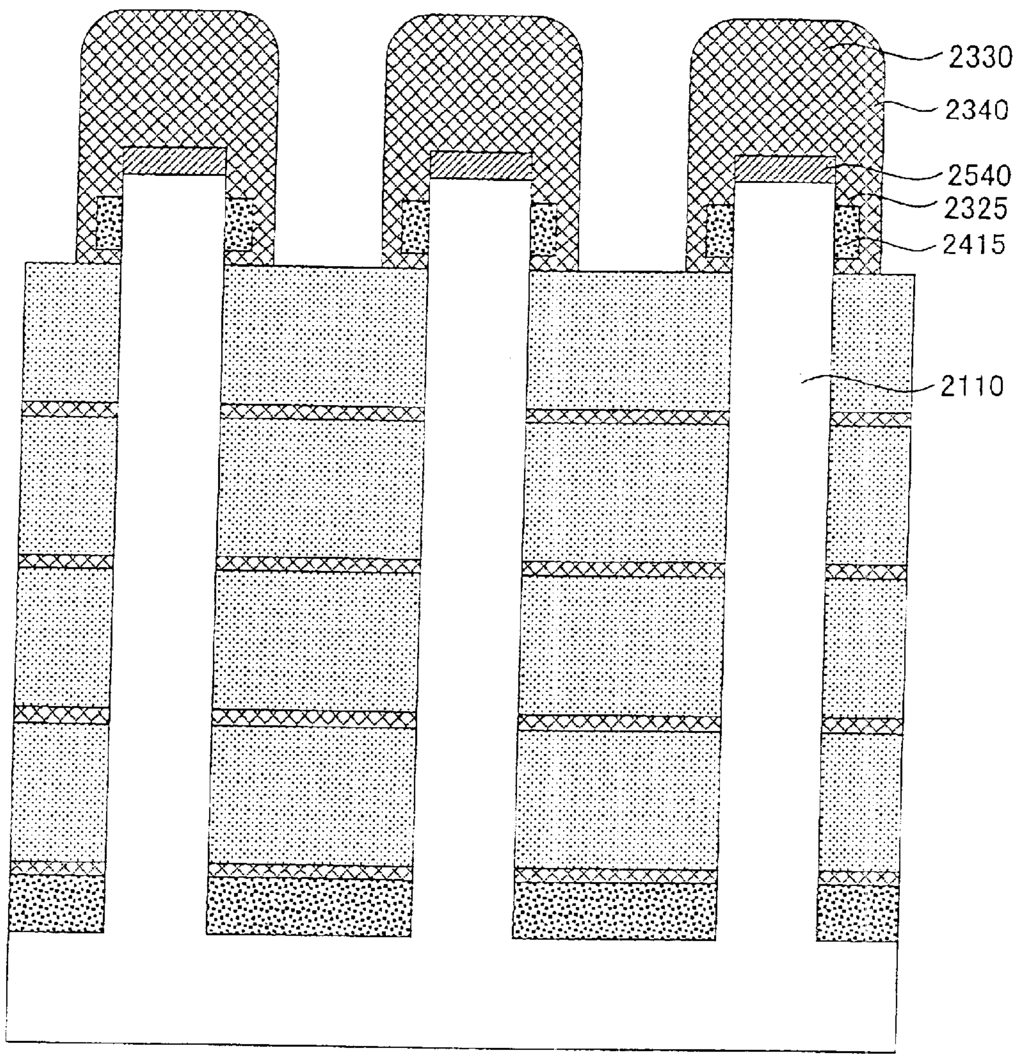
Figure 698:
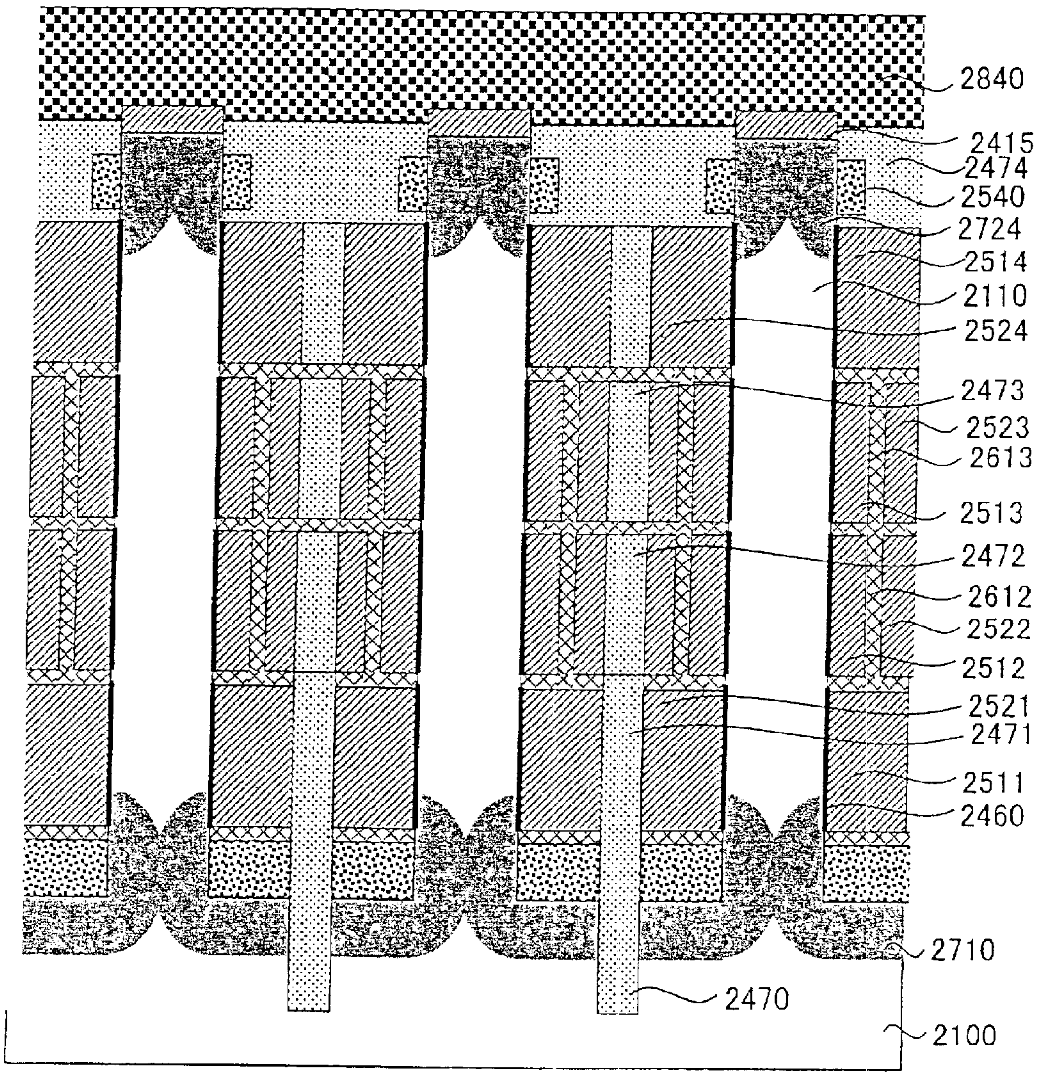

Subsequently, a silicon nitride film 2340 is deposited as a sixth insulating film to a thickness of about 5 to 50 nm. The silicon nitride film 2340 is etched, for example, by anisotropic etching to remain in the form of a sidewall spacer on the sidewalls of the silicon nitride film 2330, the polysilicon film 2540, the silicon nitride film 2325 and the silicon oxide film 2415 (FIGS. 689 and 697). At this time, the silicon oxide film 2415 containing the impurities (the first insulating film) is isolated from other films than the island-like semiconductor layer 2110 by the silicon nitride film 2325 (the fourth insulating film), the silicon nitride film 2315 (the second insulating film) and the silicon nitride film 2340 (the sixth insulating film) (FIGS. 689 and 697).

Production steps thereafter follow Production example 11 (FIGS. 311 to 335 and FIGS. 345 to 368), thereby forming an interlayer insulating film, a contact hole and metal wiring by known techniques.

Thereby, a semiconductor memory is realized which has a memory function according to the state of a charge in the charge storage layer which is the floating gate made of the polysilicon film (the first conductive film).

In this example, films formed on the surface of the semiconductor substrate or the polysilicon film such as the silicon nitride film (the fifth insulating film) 2330, the silicon nitride film (the sixth insulating film) 2340 and the silicon nitride film (the twelfth insulating film) 2350 may be formed of a layered film of a silicon oxide film/a silicon nitride film from the silicon surface.

With regard to the polysilicon films 2510 or 2511 to 2514 (the first conductive films), the polysilicon films 2520 or 2521 to 2524 (the second conductive films) and the polysilicon film 2540 (the fourth conductive film), impurity introduction may be carried out during or after the formation of the polysilicon films or after the separation of the polysilicon films. The timing of the impurity introduction to the polysilicon films is not particularly limited so long as these films become conductive films.

In this example, the control gates of the memory cells are formed continuously in one direction without using a mask. However, that is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

Further, by providing the selection gates in the top and the bottom of a set of memory cells, it is possible to prevent the phenomenon that a memory cell transistor is over-erased.

PRODUCTION EXAMPLE 33

In a semiconductor memory to be produced in this example, regions for forming charge storage layers are defined in advance by a laminated film comprising plural films, and then island-like semiconductor layers are formed in a pillar form by selective epitaxial silicon growth in trenches. Tunnel oxide films and floating gates as charge storage layers are formed on the sides of the island-like semiconductor layers in the regions for forming the charge storage layers. The island-like semiconductor layers are each in an electrically floating state with respect to the semiconductor substrate. The active regions of the memory cells are electrically common. In this production example, selection gate transistors are disposed at the top and the bottom of the island-like semiconductor layer. A plurality of memory transistors, for example, two memory transistors, are placed between the selection gate transistors. The tunnel oxide film and the floating gate of the transistors are formed at the same time. The transistors are connected in series along the island-like semiconductor layer. Further, the thickness of gate insulating films of the selection gate transistors is equal to the thickness of gate insulating films of the memory transistors.

Such a semiconductor memory may be produced by the following production process. FIGS. 699 to 737 and FIGS. 738 to 776 are sectional views taken on line A-A' and line B-B', respectively, in FIG. 1 which is a plan view illustrating an EEPROM memory cell array.

First, on a surface of a P-type silicon substrate 2100, a silicon oxide film 2411 containing arsenic impurities of about $1\times10^{18}$ to $1\times10^{22}/cm^3$, for example, is deposited as a first insulating film to a thickness of 50 to 500 nm by CVD. At this time, ion implantation may be carried out to introduce the impurities to the insulating film deposited by CVD. For example, to the silicon oxide film 2411 deposited to a thickness of 50 to 500 nm, ion implantation may be carried out at an implantation energy of 5 to 100 keV at an arsenic dose of about $1\times10^{14}$ to $1\times10^{16}/cm^2$ at an angle of about 0 to 45° with respect to the normal line of the surface of the substrate. The impurity introduction to the silicon oxide film 2411 by ion implantation may not necessarily be carried out immediately after the deposition of the silicon oxide film 2411. Regarding the ion implantation to the silicon oxide film 2411, the angle for the implantation is not particularly limited as long as a desired impurity concentration is obtained. Means for the impurity introduction to the silicon oxide film 2411 is not limited to the ion implantation, but any means such as solid or vapor phase diffusion may be used.

Thereafter, a silicon nitride film 2321, for example, is deposited as a fourth insulating film to a thickness of 10 to 100 nm. If the above-mentioned impurity introduction to the silicon oxide film 2411 is carried out by ion implantation, the impurities may be introduced by ion implantation through the silicon nitride film 2321 into the silicon oxide film 2411.

Then, a silicon oxide film 2421, for example, is deposited as a third insulating film to a thickness of 50 to 500 nm, a silicon nitride film 2312, for example, is deposited as a second insulating film to a thickness of 10 to 100 nm and a silicon oxide film 2412 is deposited as a first insulating film to a thickness of 50 to 500 nm.

Figure 699:
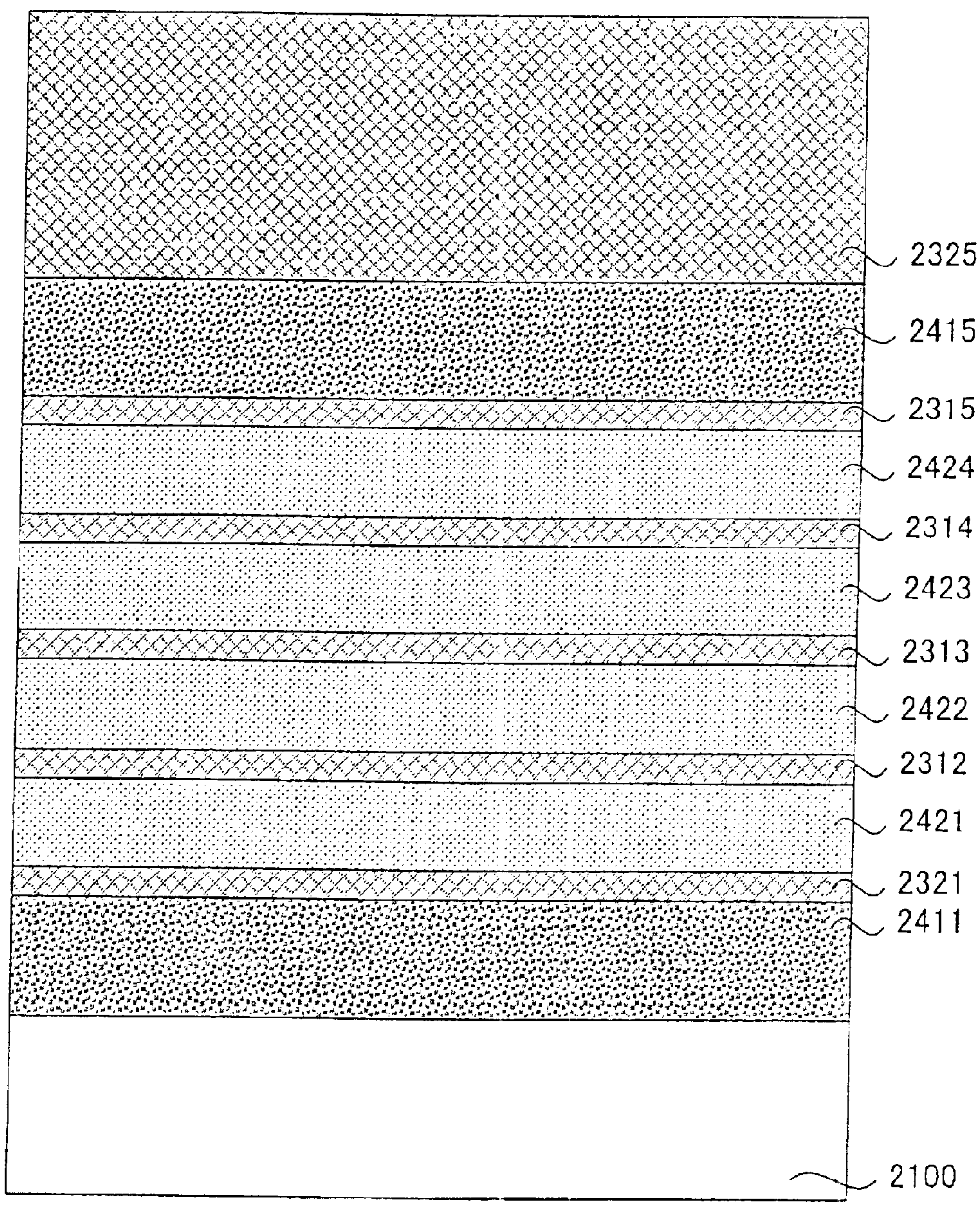
Figure 700:
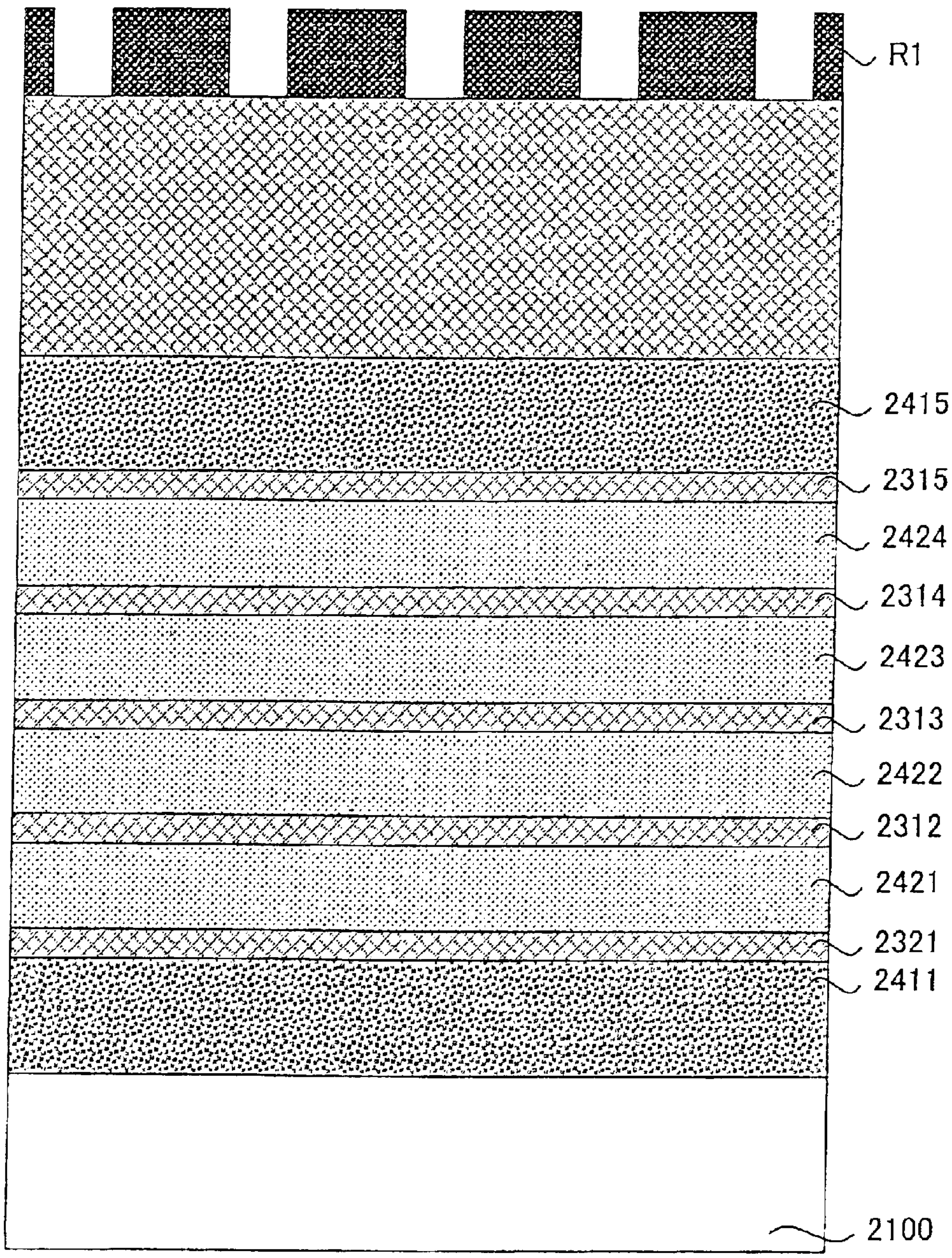
Figure 701:
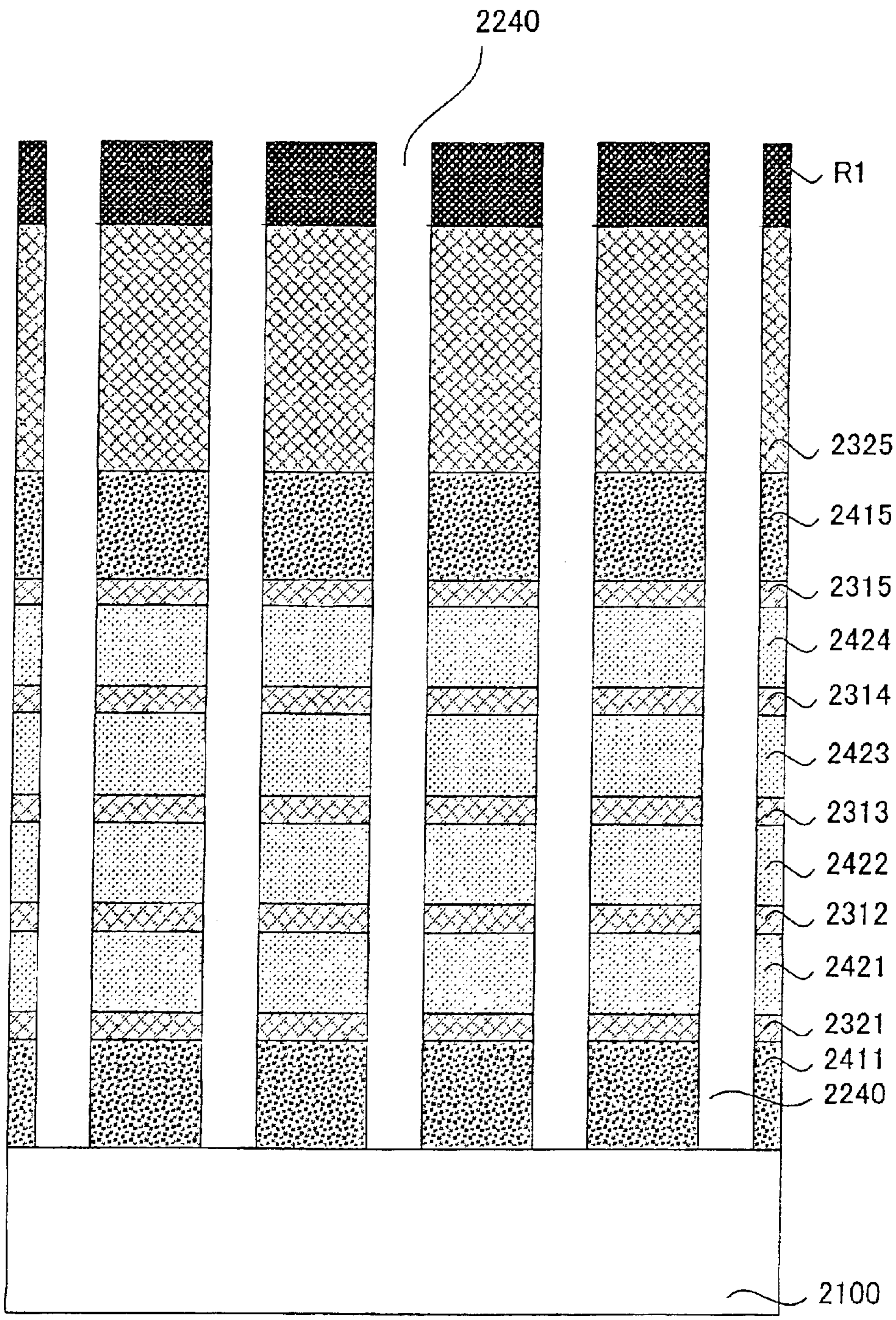
Figure 702:
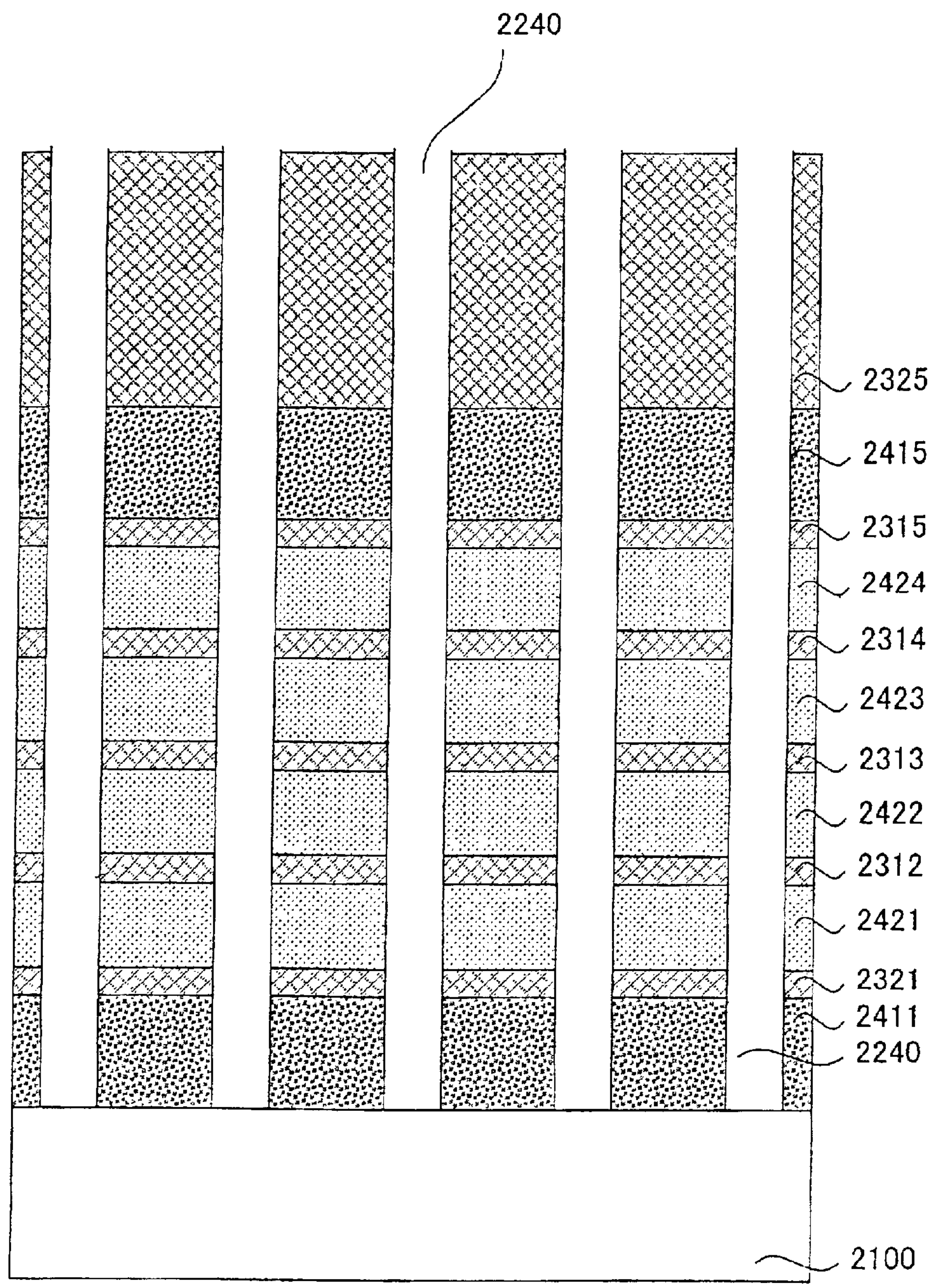
Figure 738:
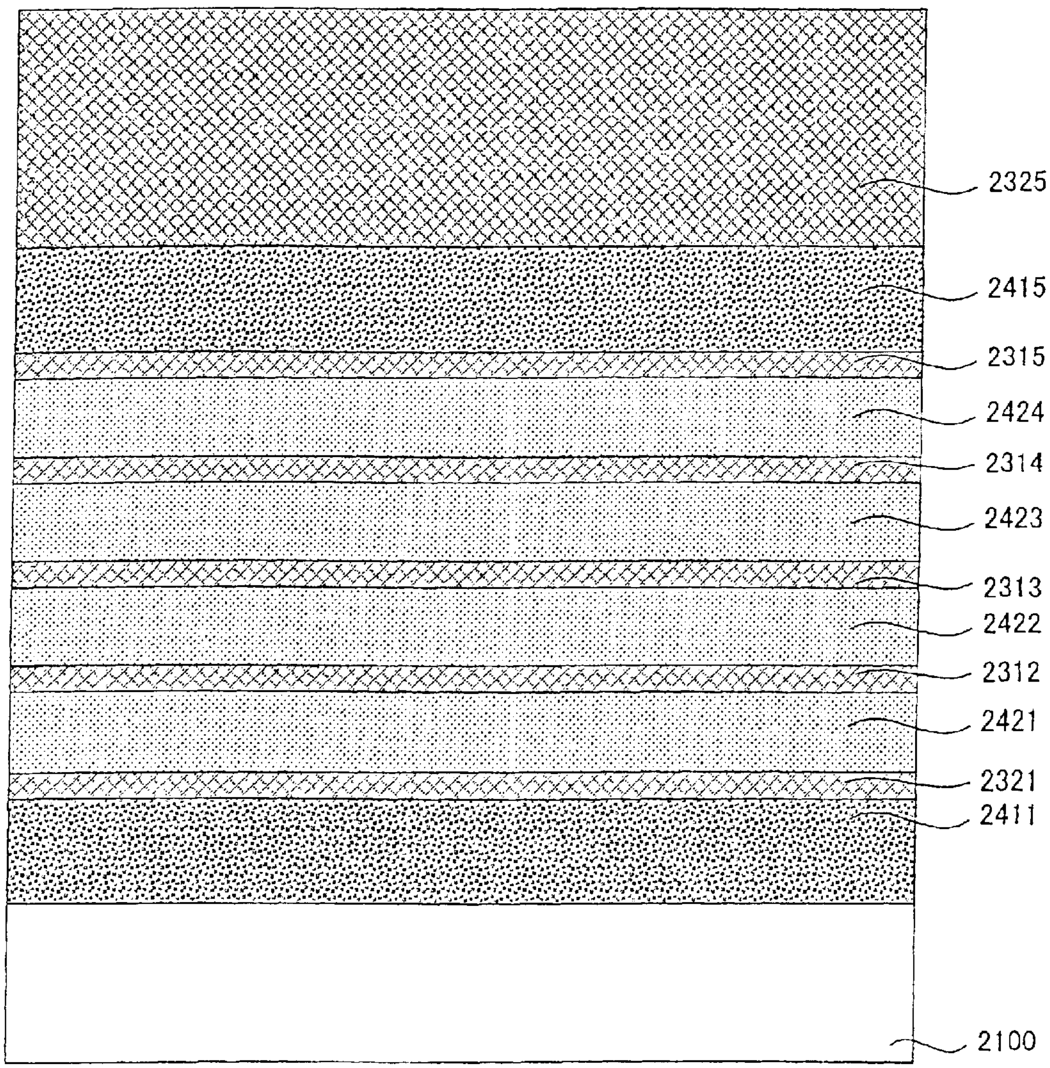
Figure 739:
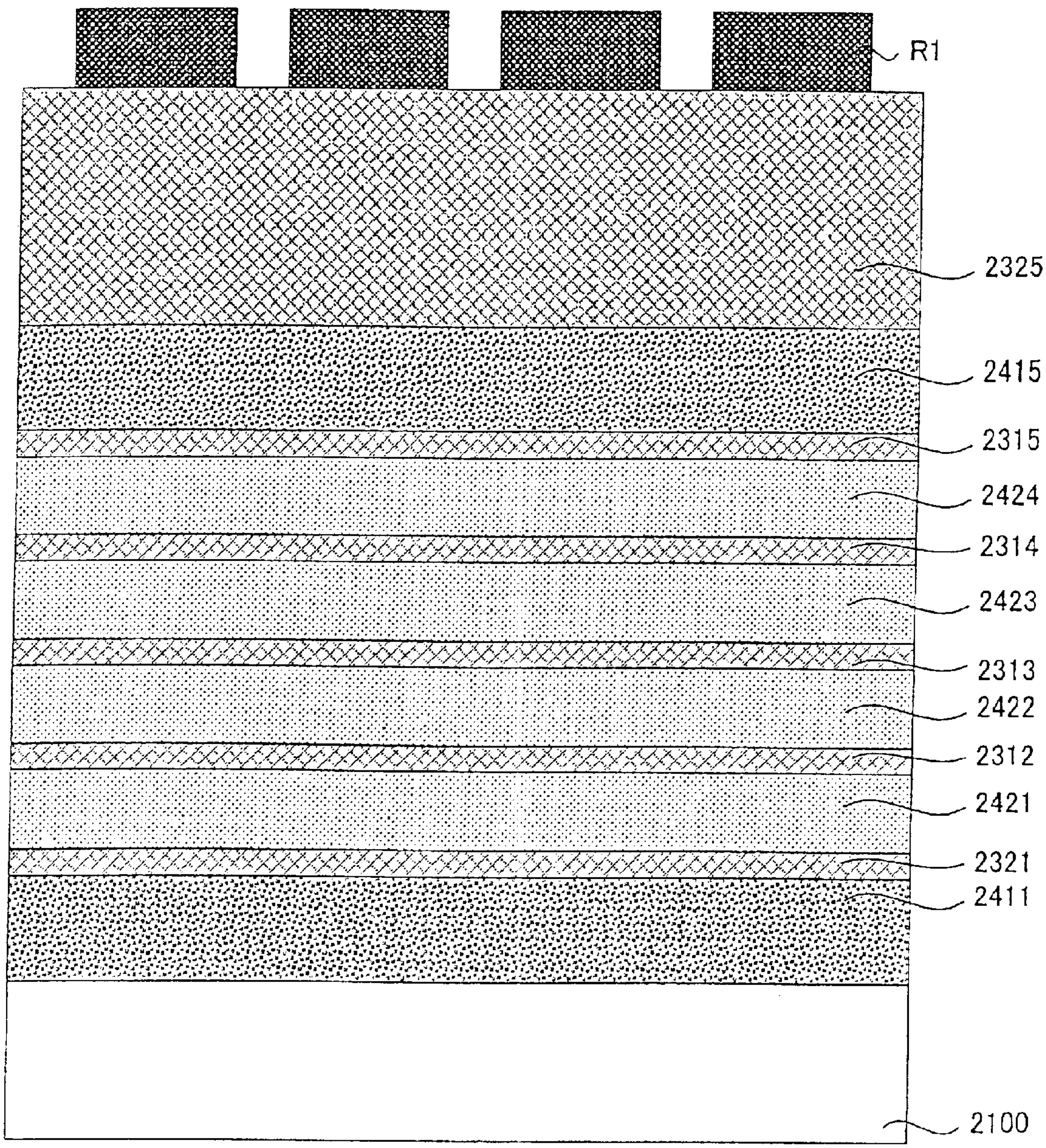
Figure 740:
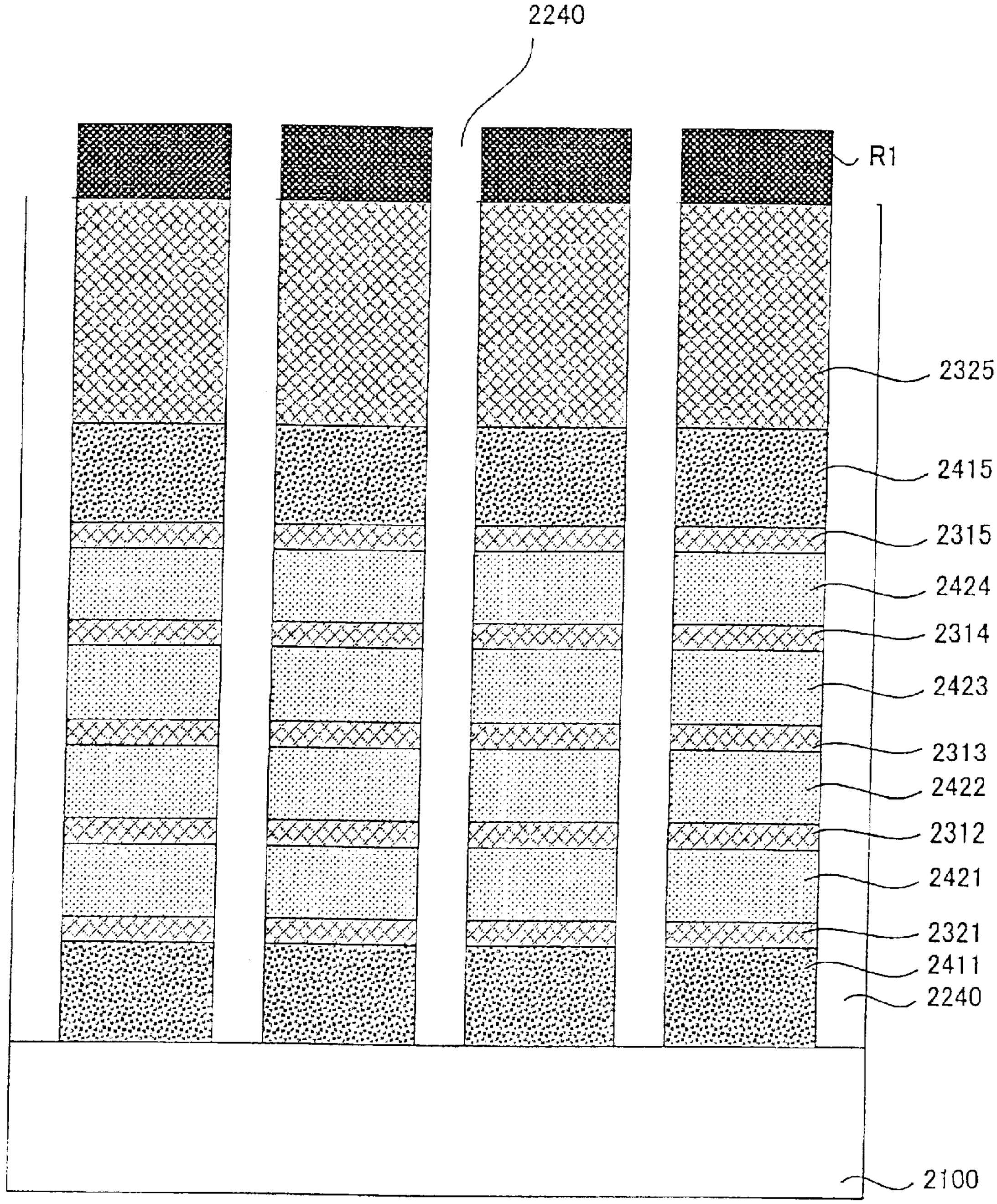
Figure 741:
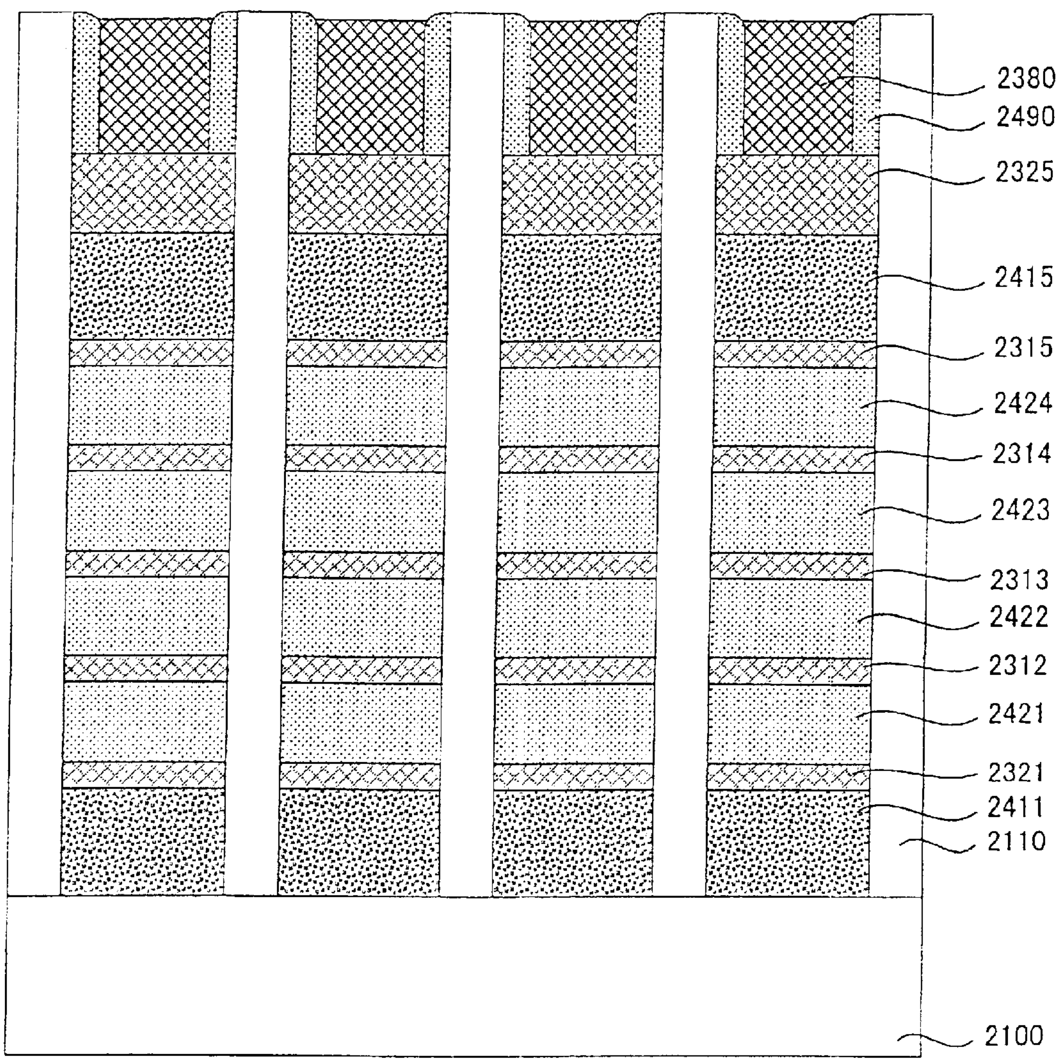

After the films are thus formed in sequence, a silicon oxide film 2415, for example, is deposited as a first insulating film to a thickness of 50 to 500 nm and a silicon nitride film 2325 is deposited as a fourth insulating film to a thickness of 100 to 1,000 nm as shown in FIGS. 699 and 738. Subsequently, using a resist film R1 patterned by a known photolithographic technique as a mask (FIGS. 700 and 739), reactive ion etching, for example, is performed to successively etch the silicon nitride film 2325, the silicon oxide film 2415, the silicon nitride film 2315, the silicon oxide film 2424, the silicon nitride film 2314, the silicon oxide film 2423, the silicon nitride film 2313, the silicon oxide film 2422, the silicon nitride film 2312, the silicon oxide film 2421, the silicon nitride film 2321 and the silicon oxide film 2411, thereby forming a fourth trench 2240 (FIGS. 701 and 740).

Figure 703:
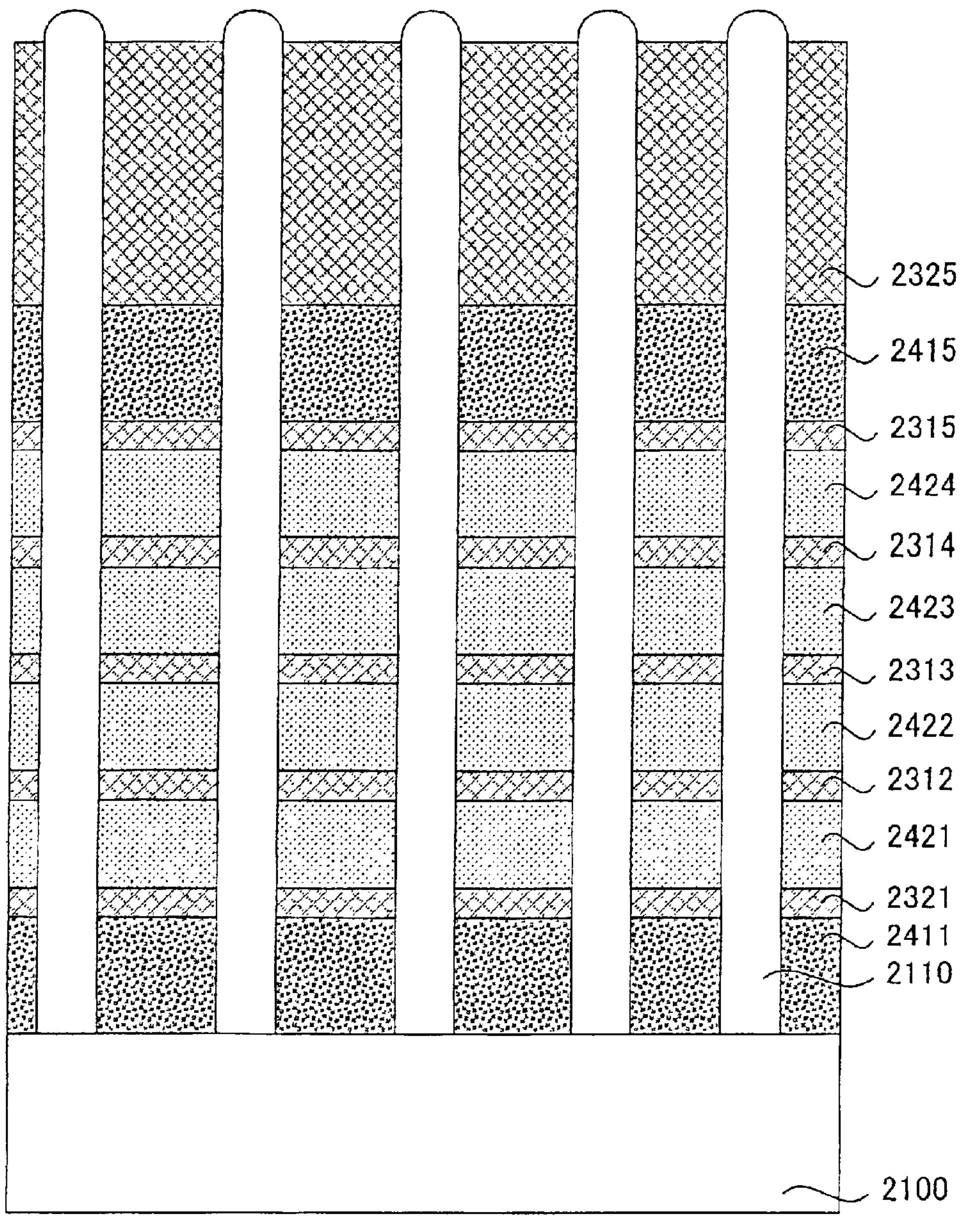
Figure 742:
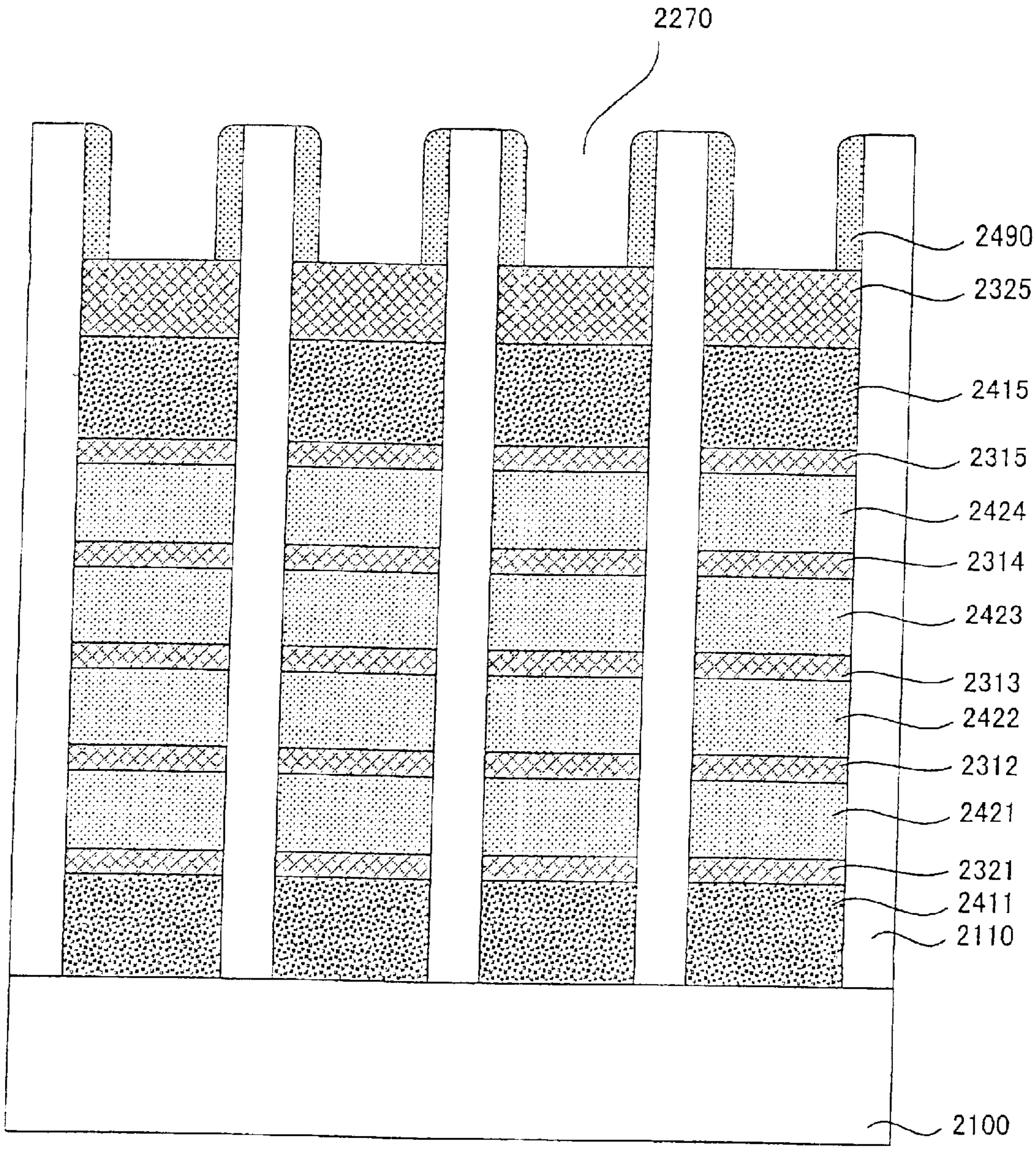

The resist film R1 is removed (FIGS. 702 and 741) and then island-like semiconductor layers 2110 are filled in the fourth trench 2240. For example, the island-like semiconductor layers 2110 are formed by selective epitaxial growth from the P-type silicon substrate 2100 located at the bottom of the fourth trench 2240 (FIGS. 703 and 742).

Figure 704:
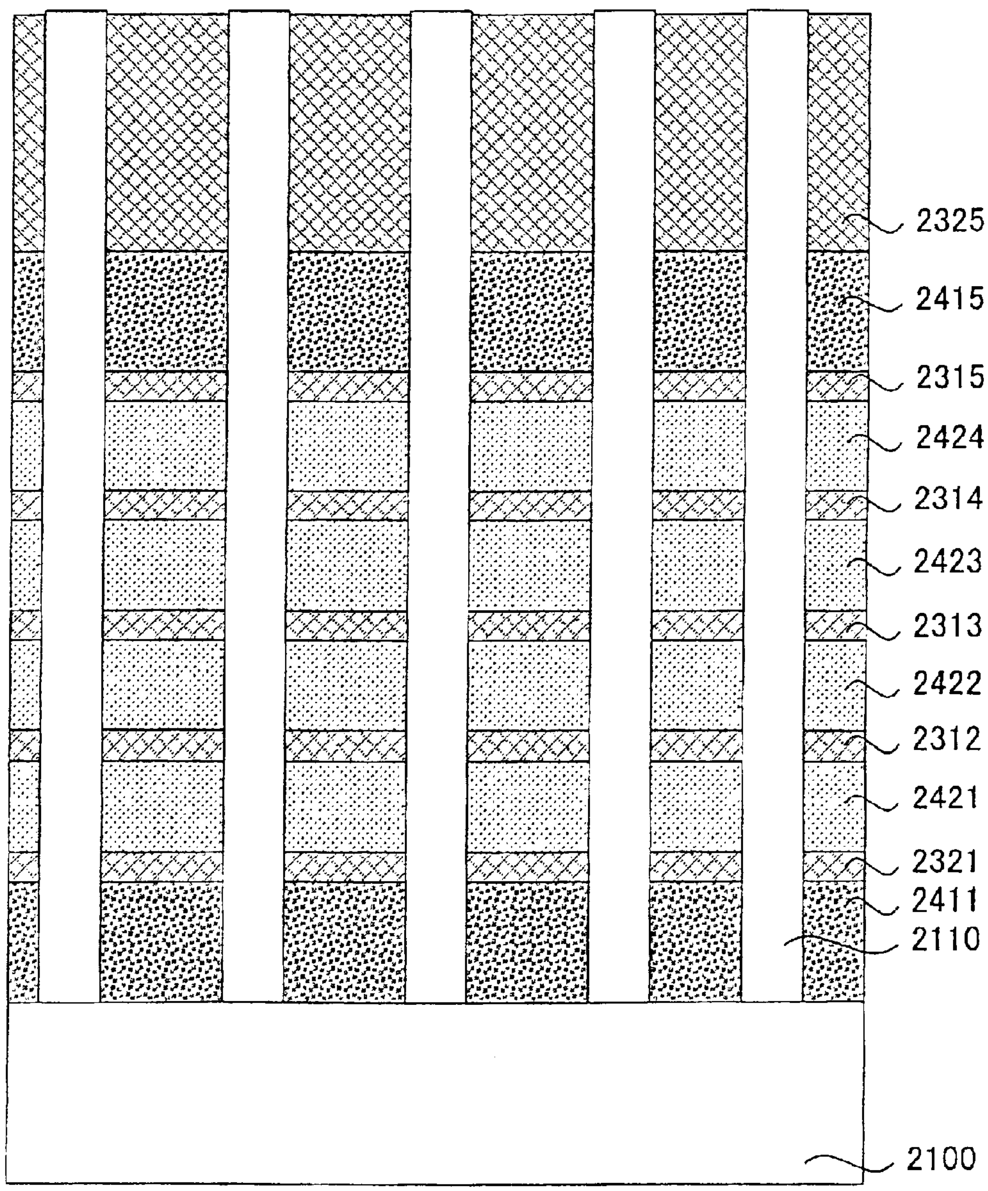
Figure 743:
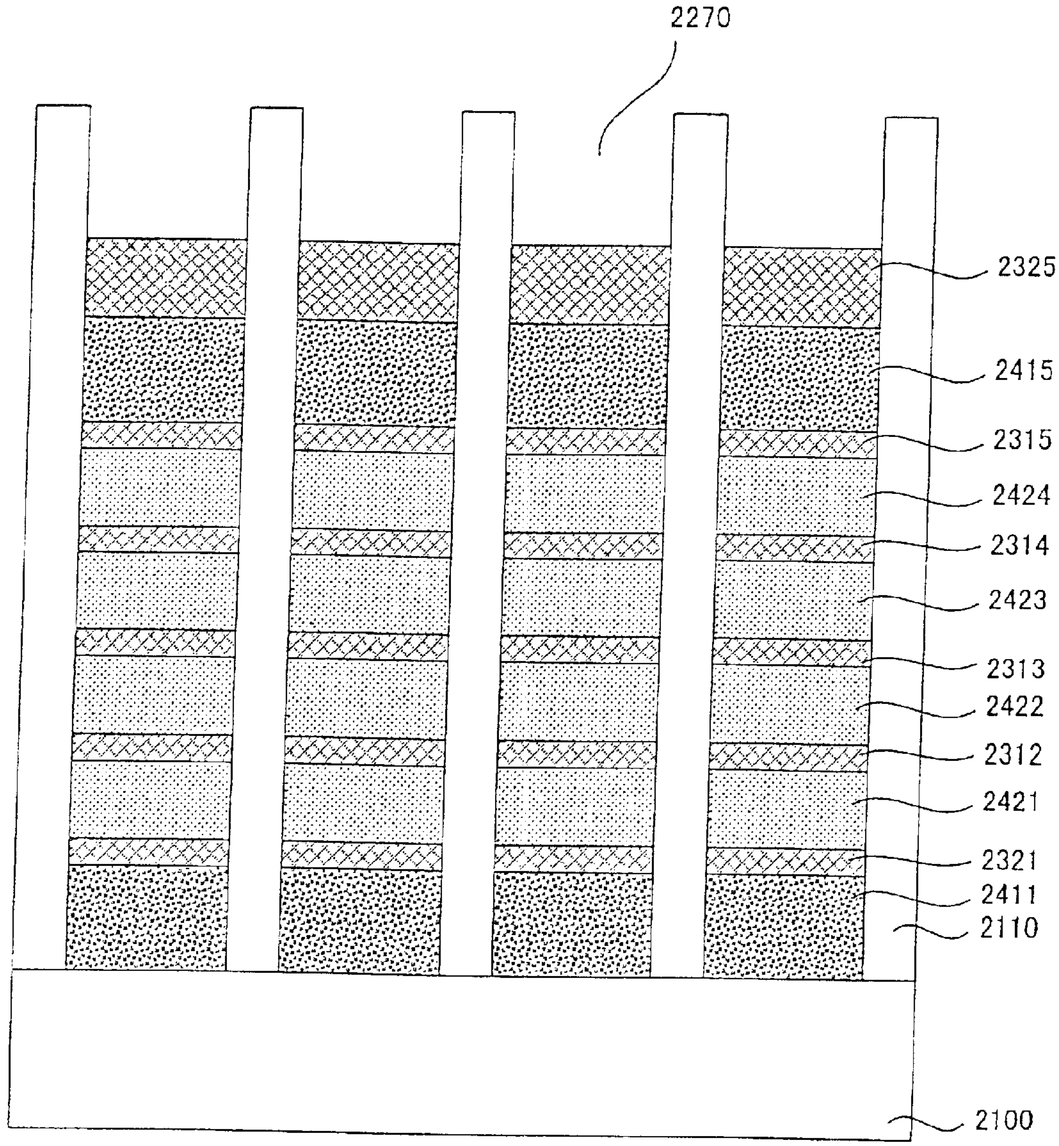

The thus formed island-like semiconductor layers 2110 are flattened to be flush with the silicon nitride film 2325 (FIGS. 704 and 743). The flattening may be carried out by isotropic or anisotropic etch-back, CMP, or a combination of various techniques.

Figure 705:
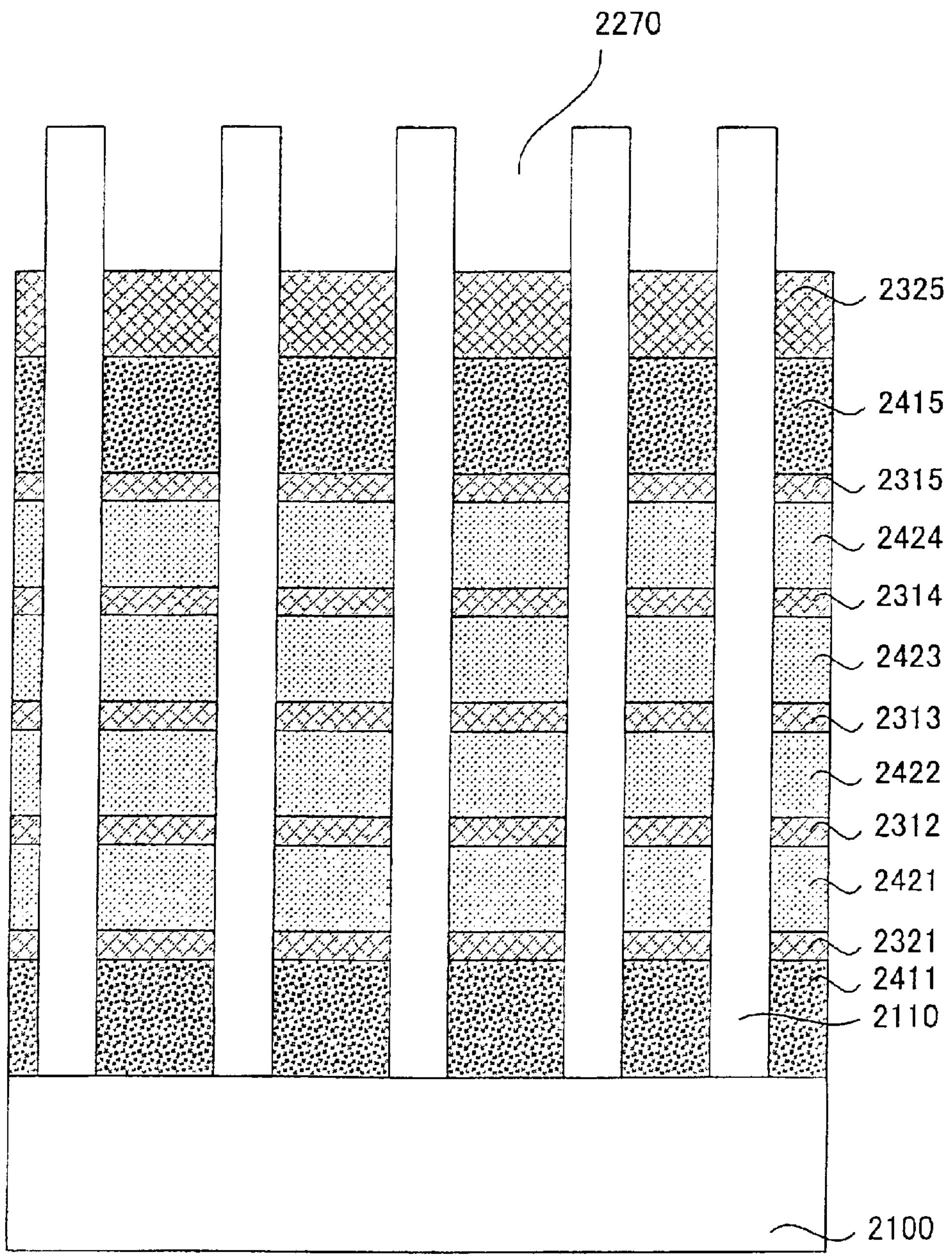
Figure 744:
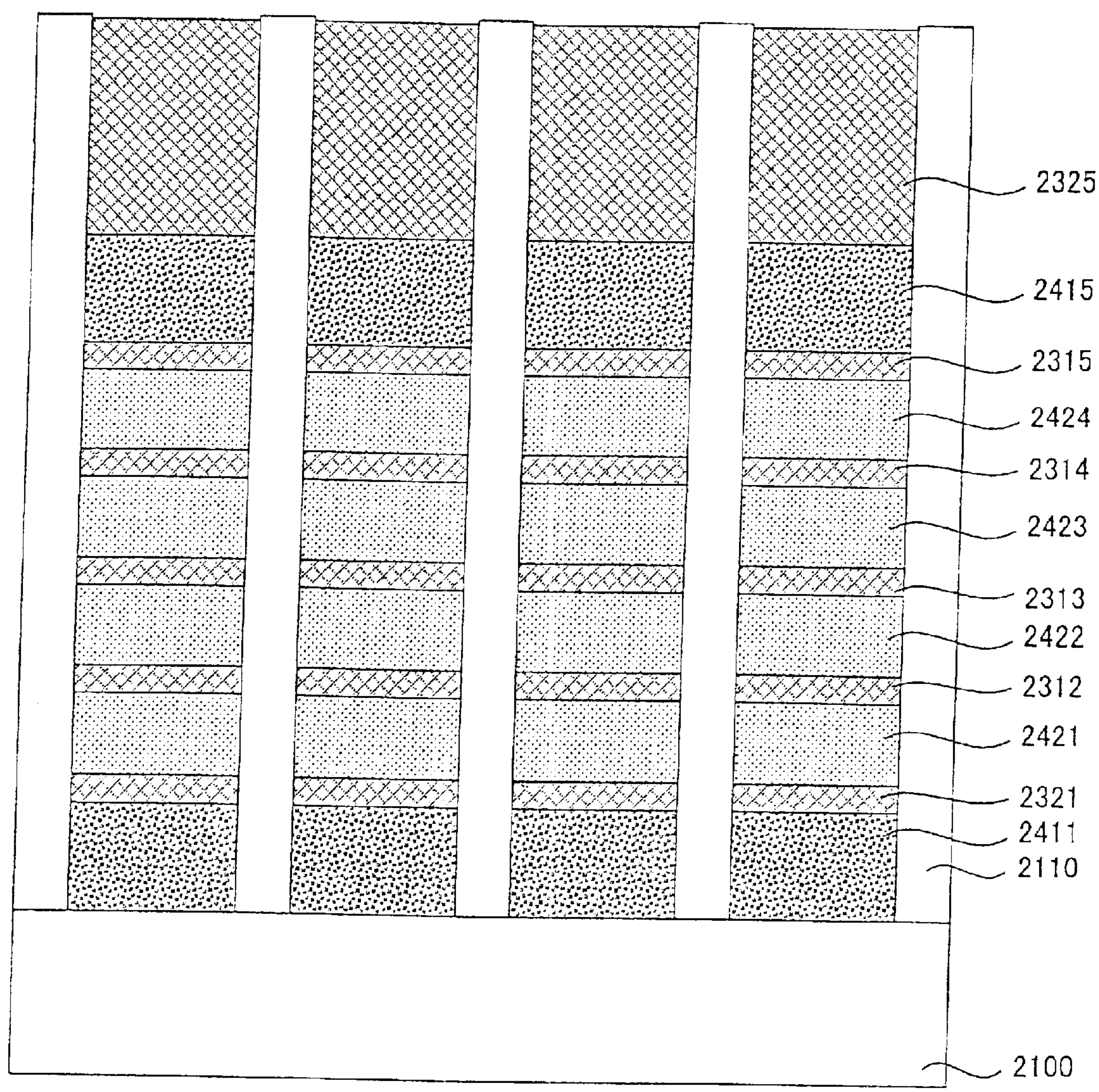

The silicon nitride film 2325 is anisotropically etched back to form a seventh trench 2270 (FIGS. 705 and 744).

Figure 706:
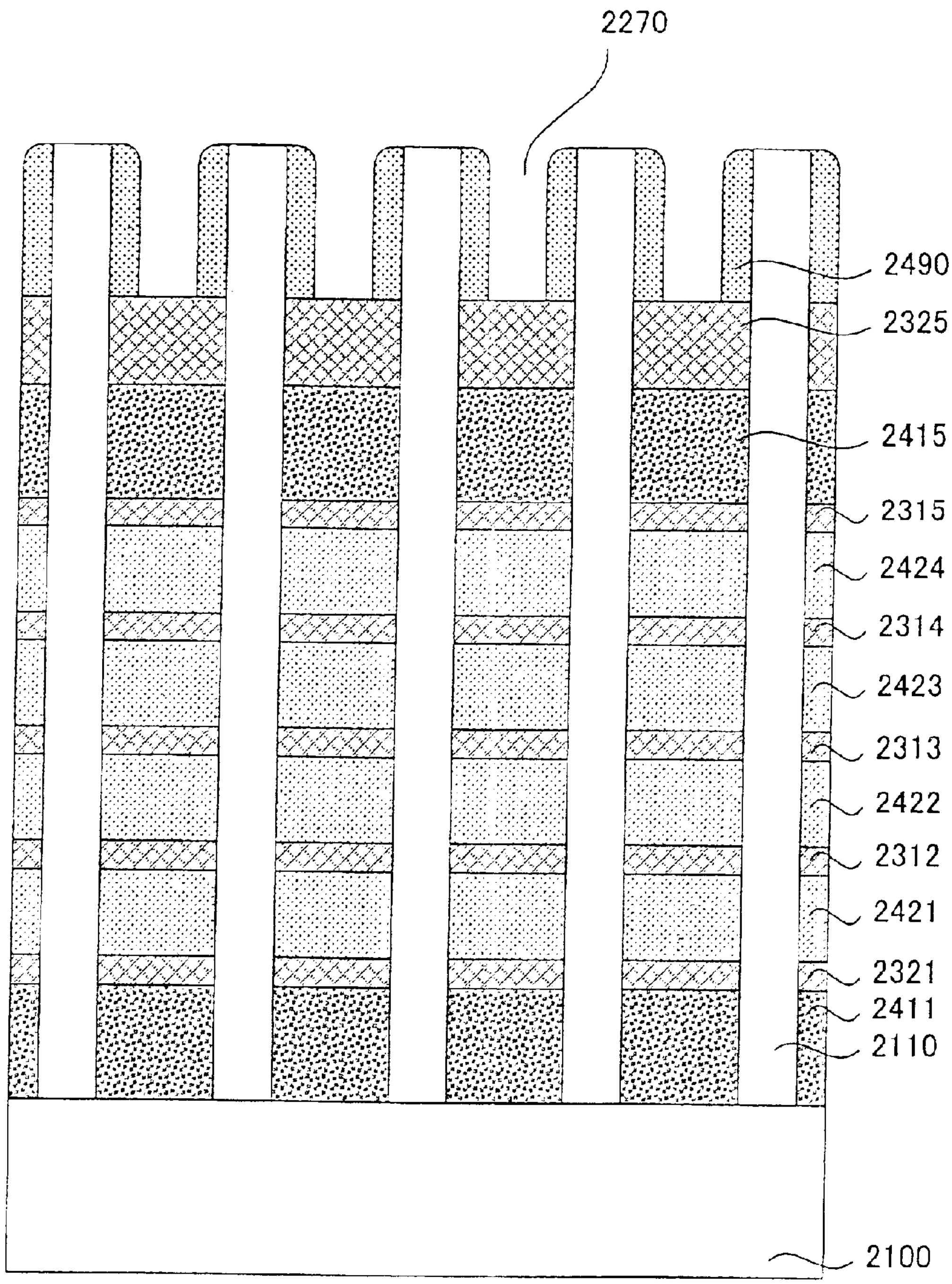
Figure 745:
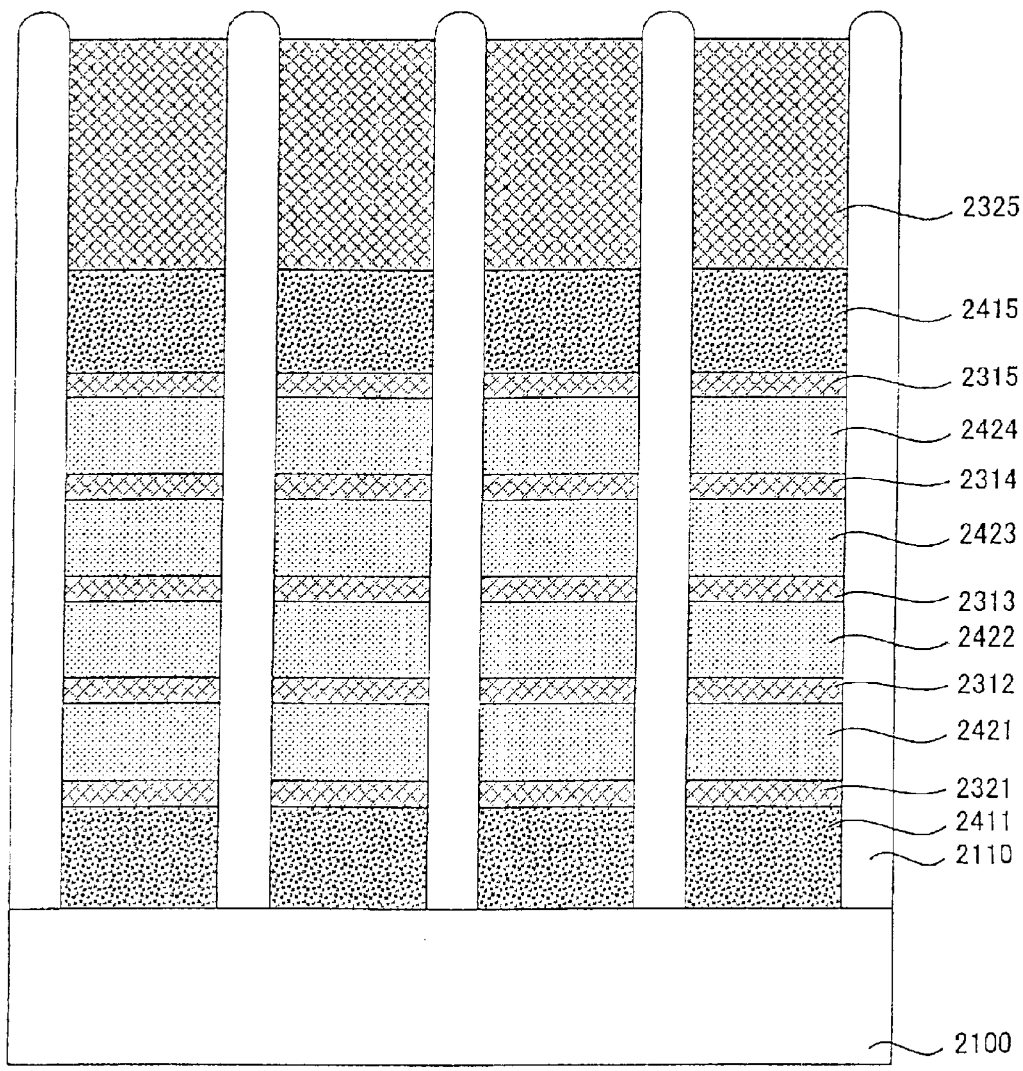

Thereafter, a silicon oxide film 2490 is deposited to a thickness of about 20 to 200 nm as a sixteenth insulating film in the seventh trench 2270 and etched back anisotropically to remain in the form of a sidewall spacer on the sidewalls of the island-like semiconductor layers 2110 (FIGS. 706 and 745).

Figure 707:
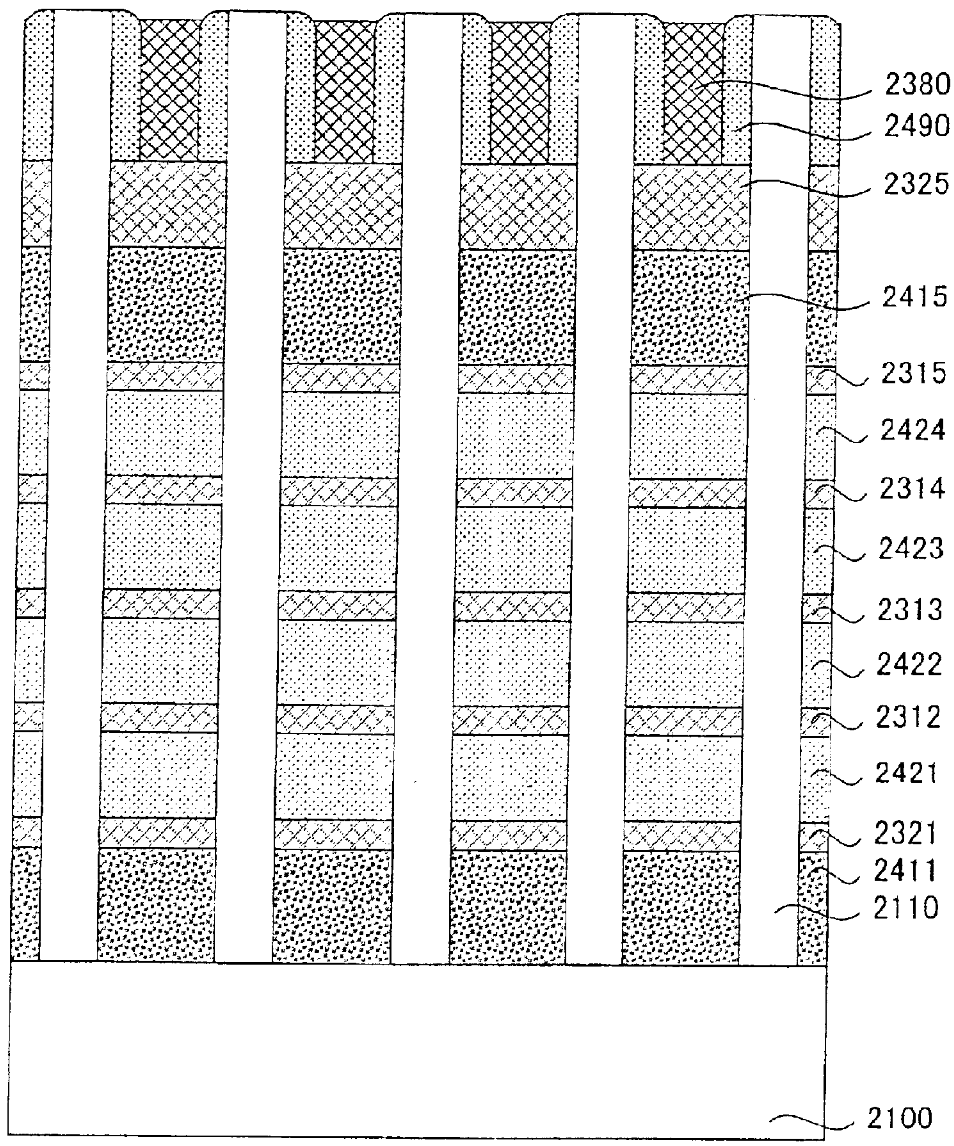
Figure 746:
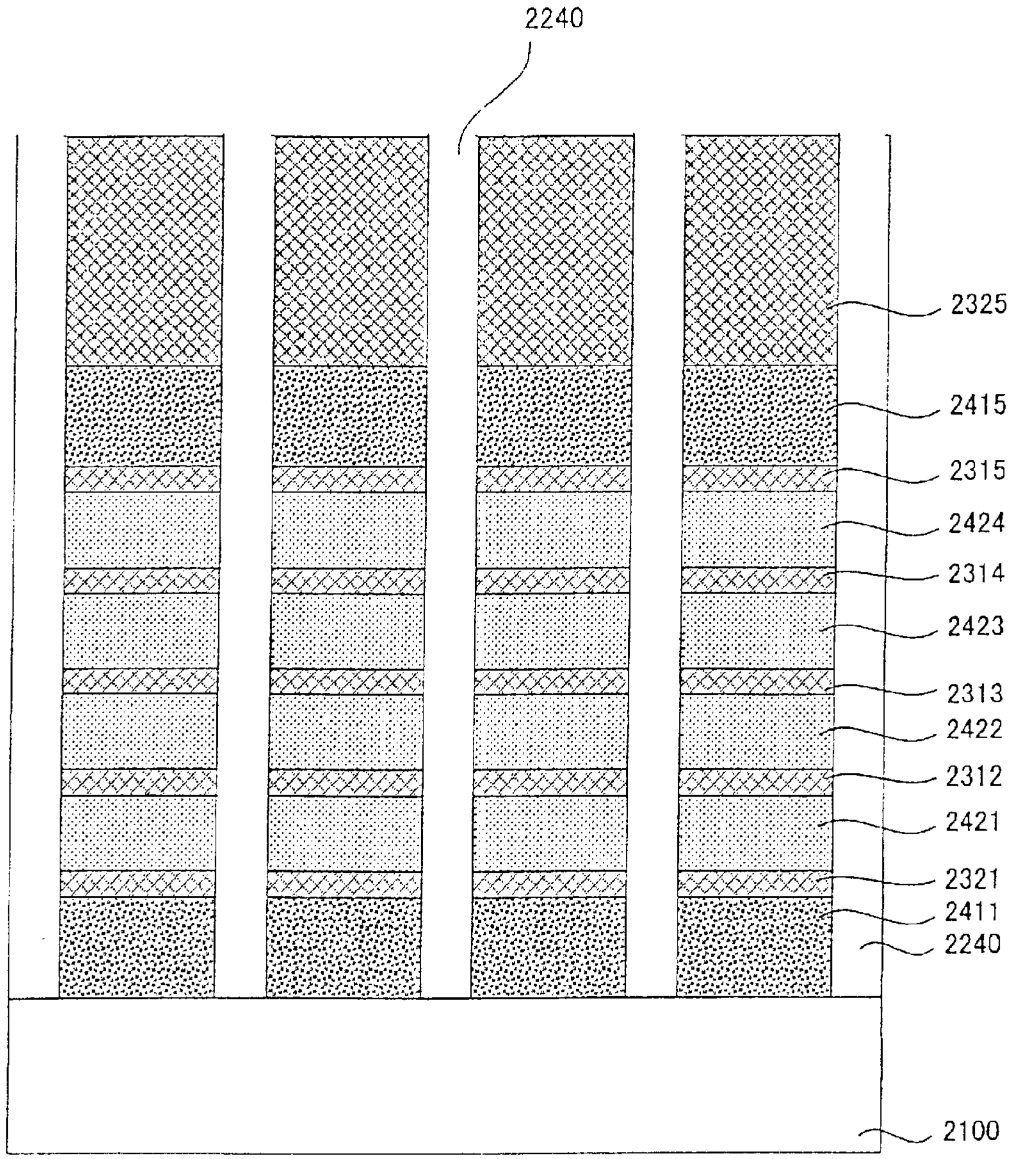

Subsequently, a silicon nitride film 2380, for example, is deposited as a seventeenth insulating film to a thickness of about 20 to 200 nm in the seventh trench 2270 and buried in the seventh trench 2270, for example, by anisotropic etch-back (FIGS. 707 and 746).

Figure 708:
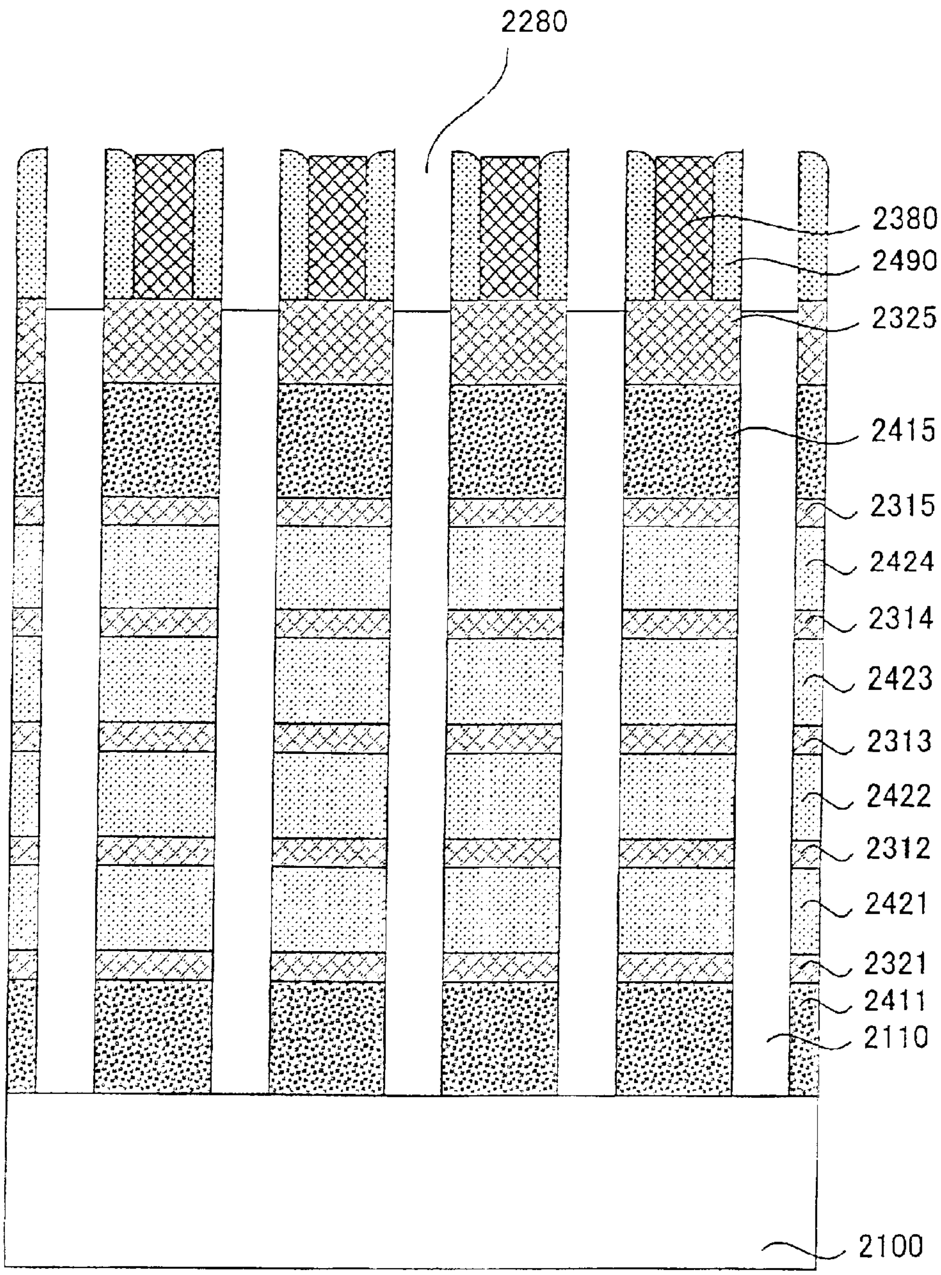
Figure 709:
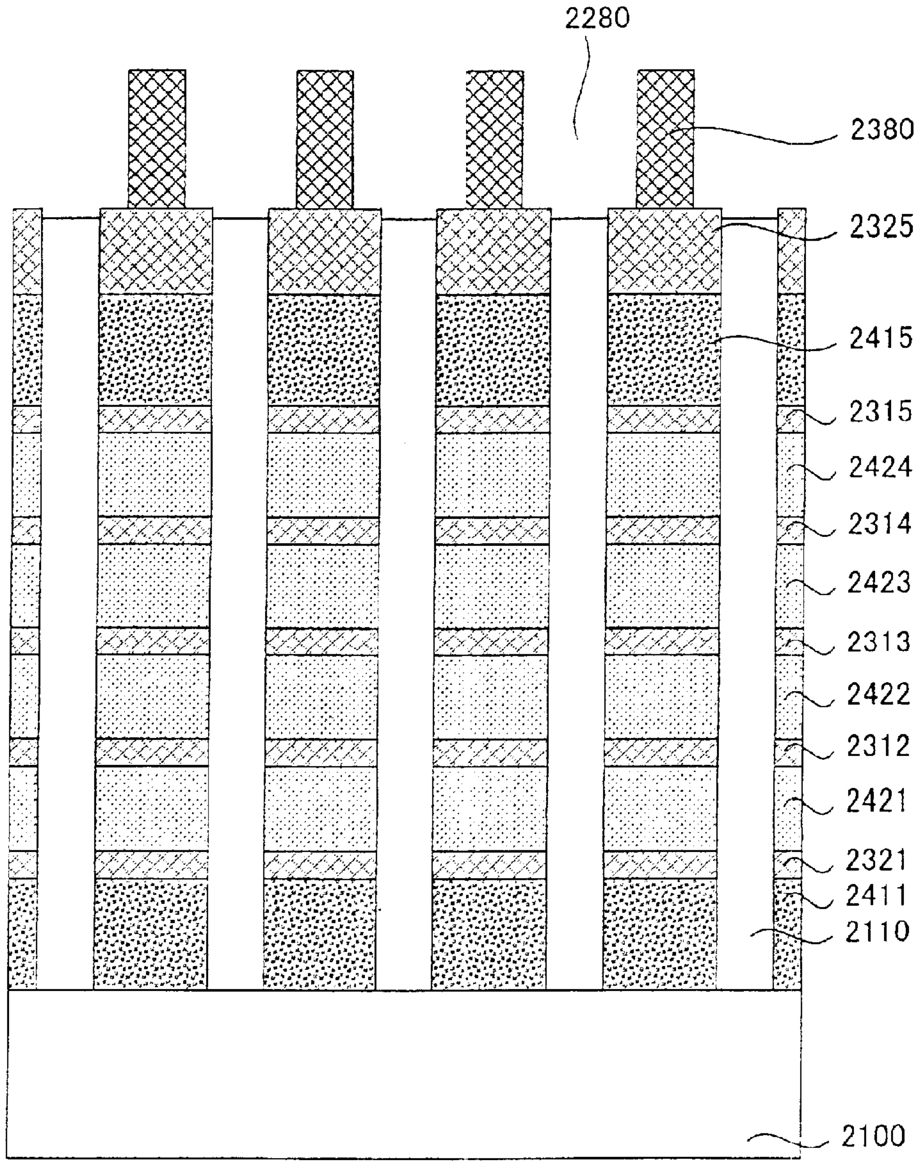
Figure 747:
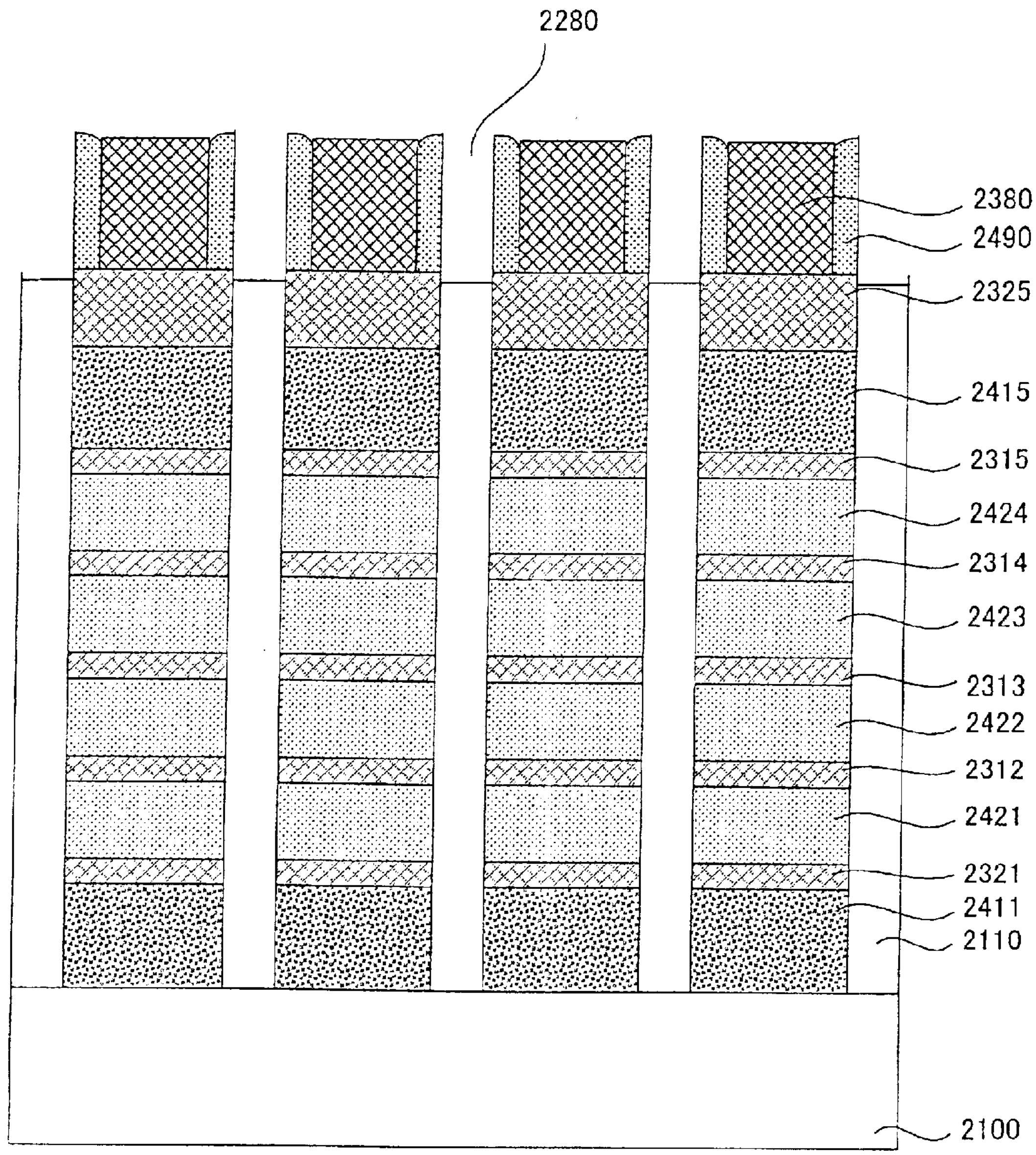
Figure 748:
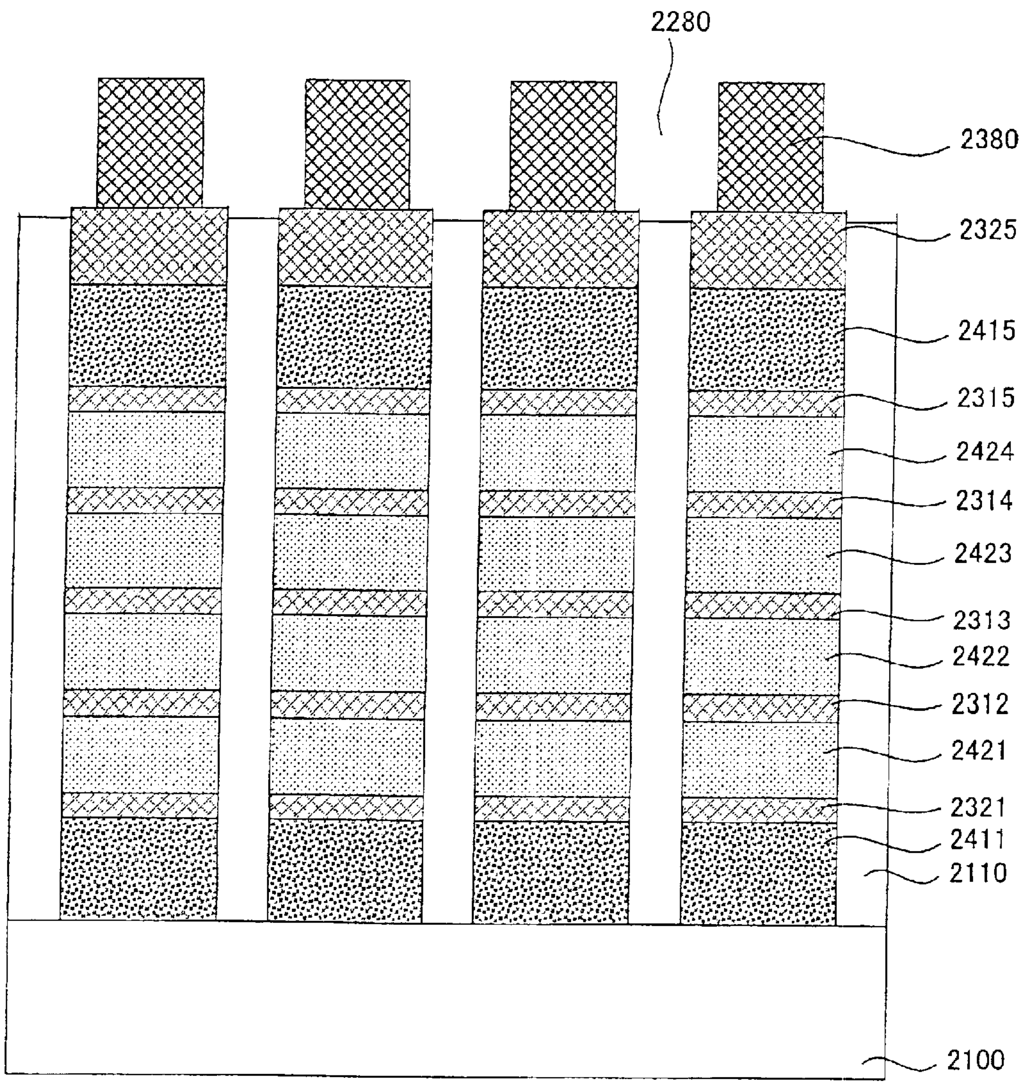

Then, the island-like semiconductor layers 2110 are etched back anisotropically to form an eighth trench 2280. At this time, the etch-back may be performed to such a degree that the silicon nitride film 2325 is partially exposed or not exposed. The etch-back is not limited as long as the island-like semiconductor layer 2110 is left on the side of the silicon oxide film 2415 (FIGS. 708 and 747).

Figure 710:
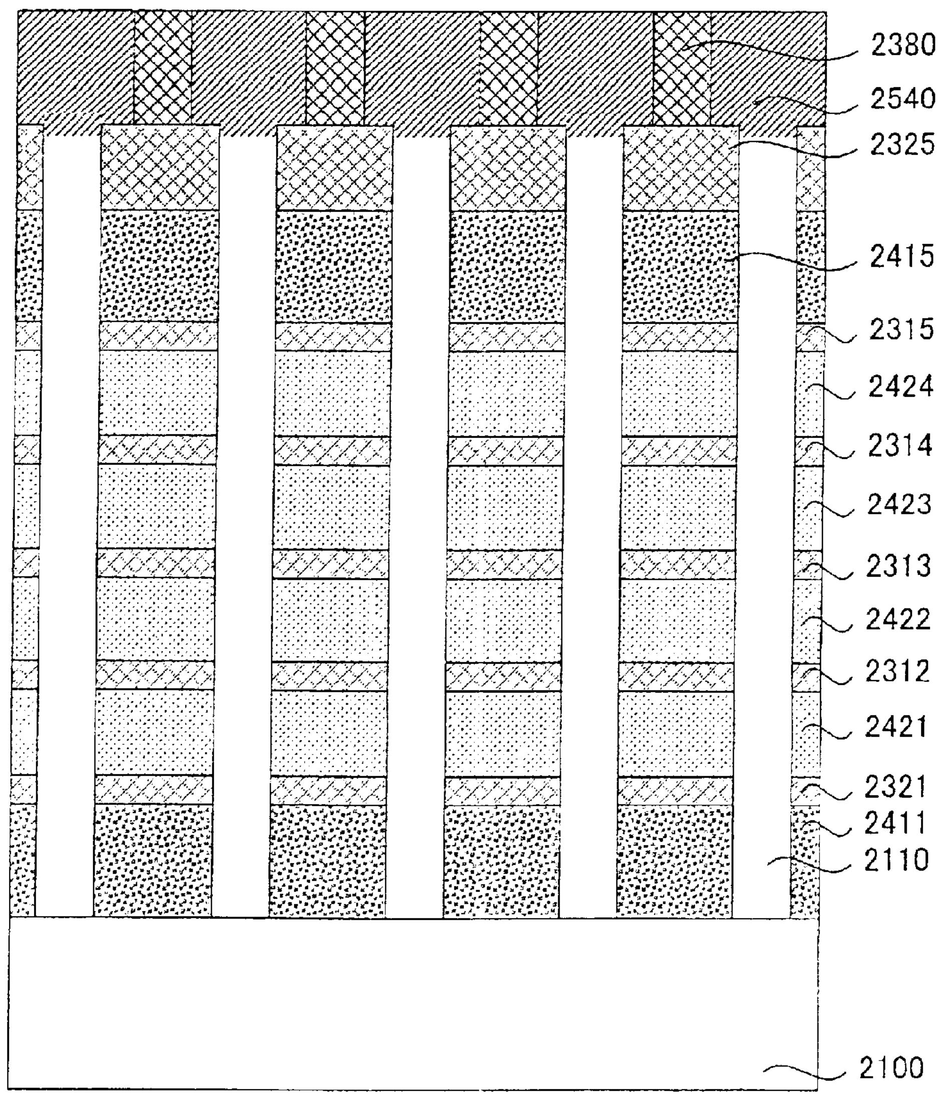
Figure 749:
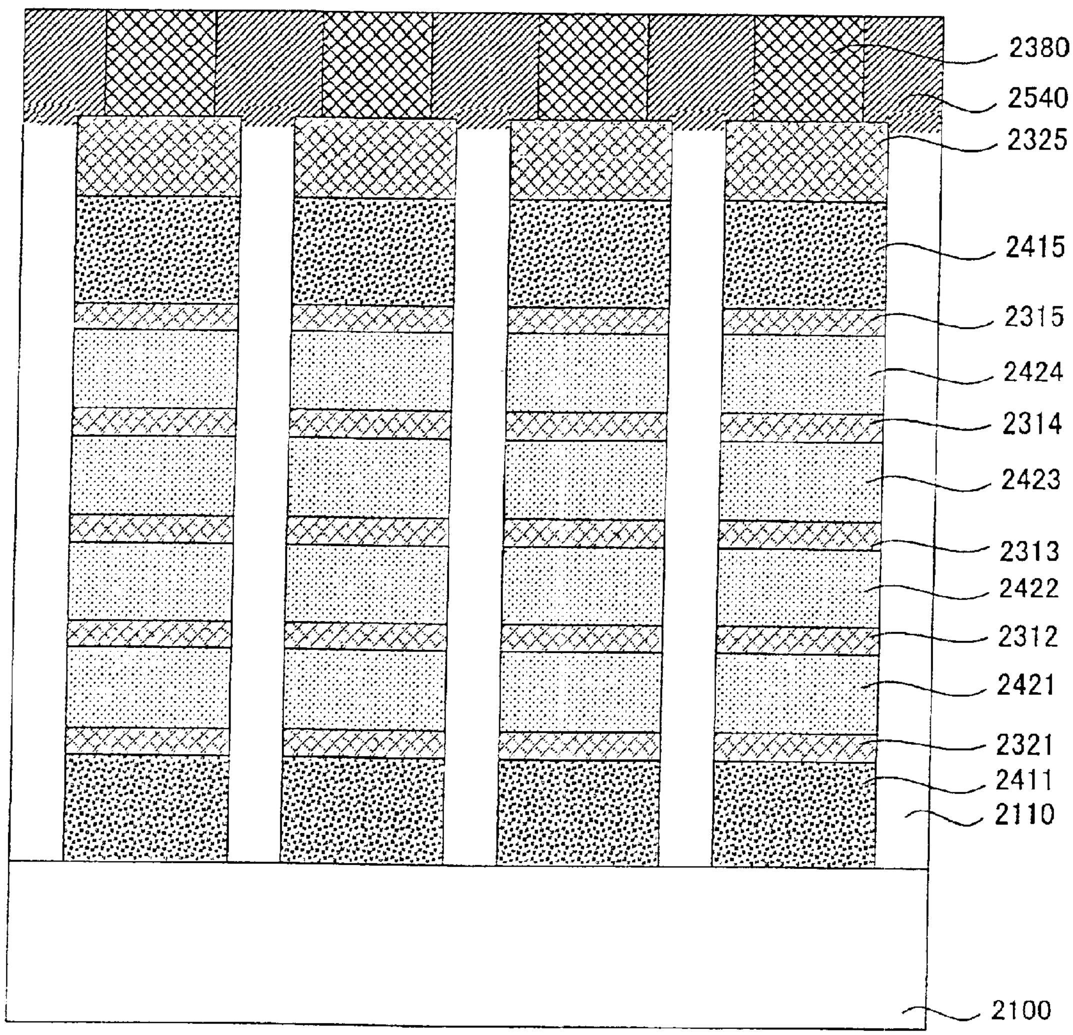

Thereafter, the silicon oxide film 2490 is selectively removed by isotropic etching (FIGS. 709 and 748) and a polysilicon film 2540, for example, is deposited as a fourth conductive film to a thickness of about 100 to 300 nm and buried in the eighth trench 2280 by CMP (FIGS. 710 and 749).

Figure 711:
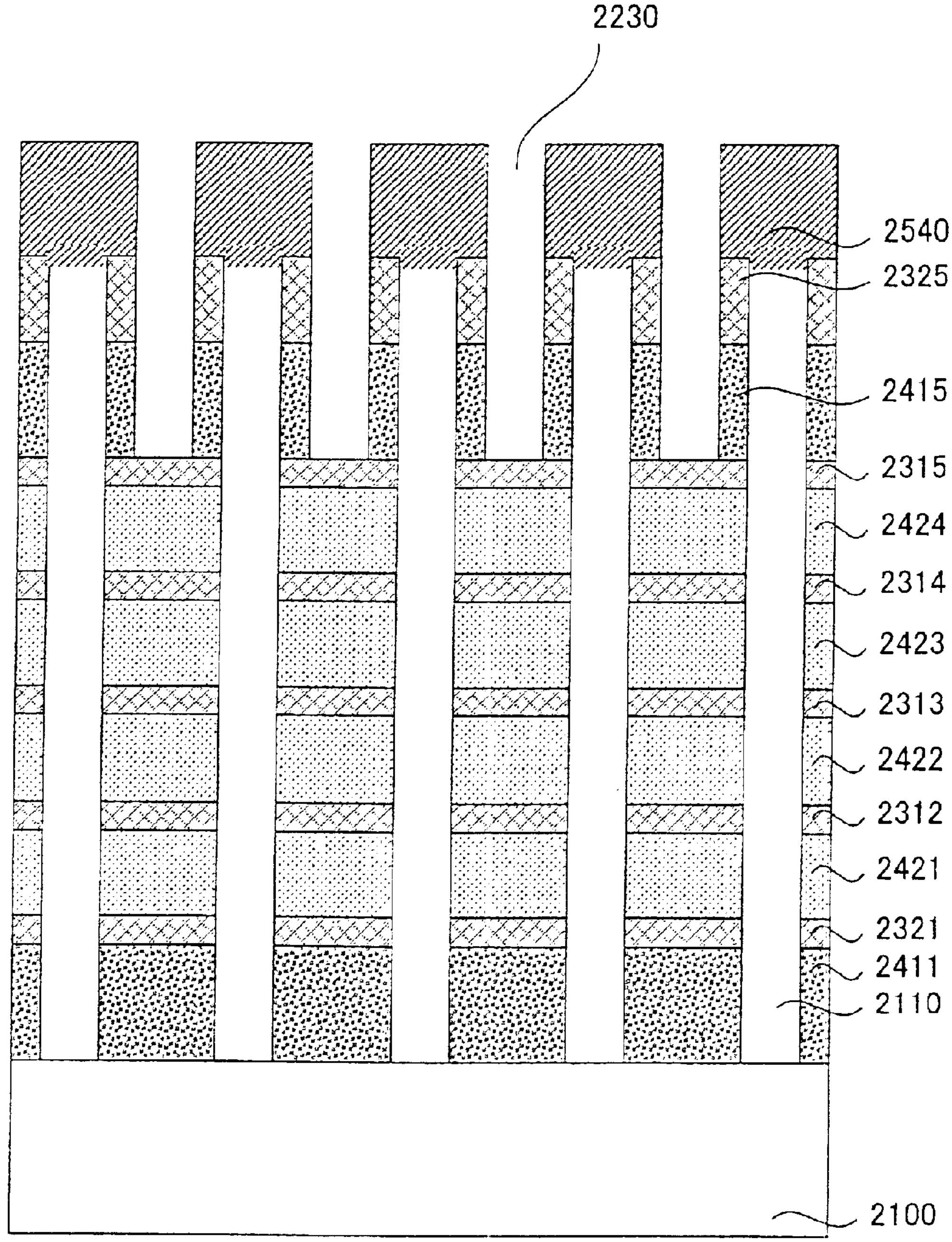
Figure 750:
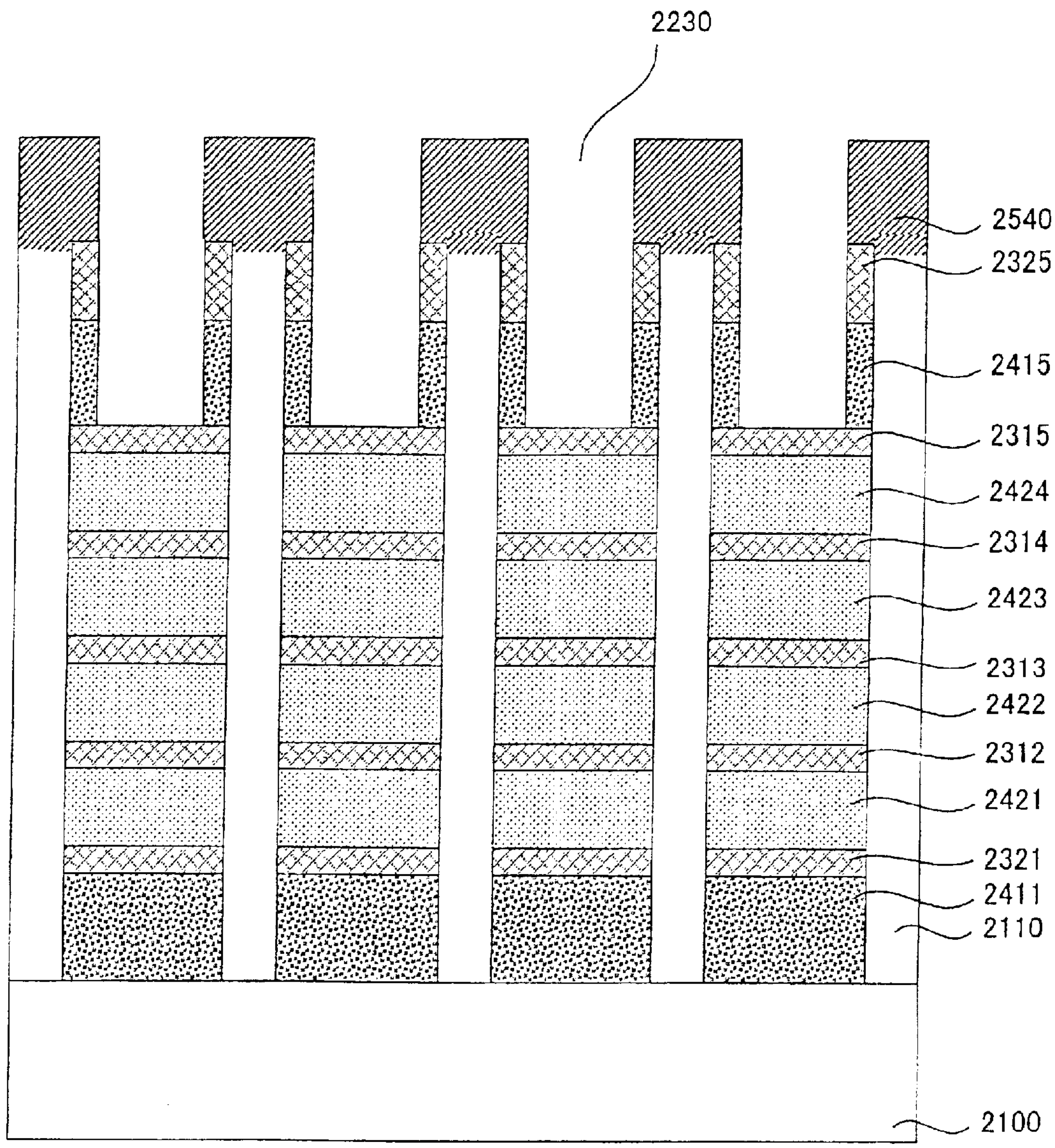

Using the polysilicon film 2540 as a mask, the silicon nitride film 2380, the silicon nitride film 2325 and the silicon oxide film 2415 are removed by anisotropic etching, thereby forming a third trench 2230 (FIGS. 711 and 750).

Figure 712:
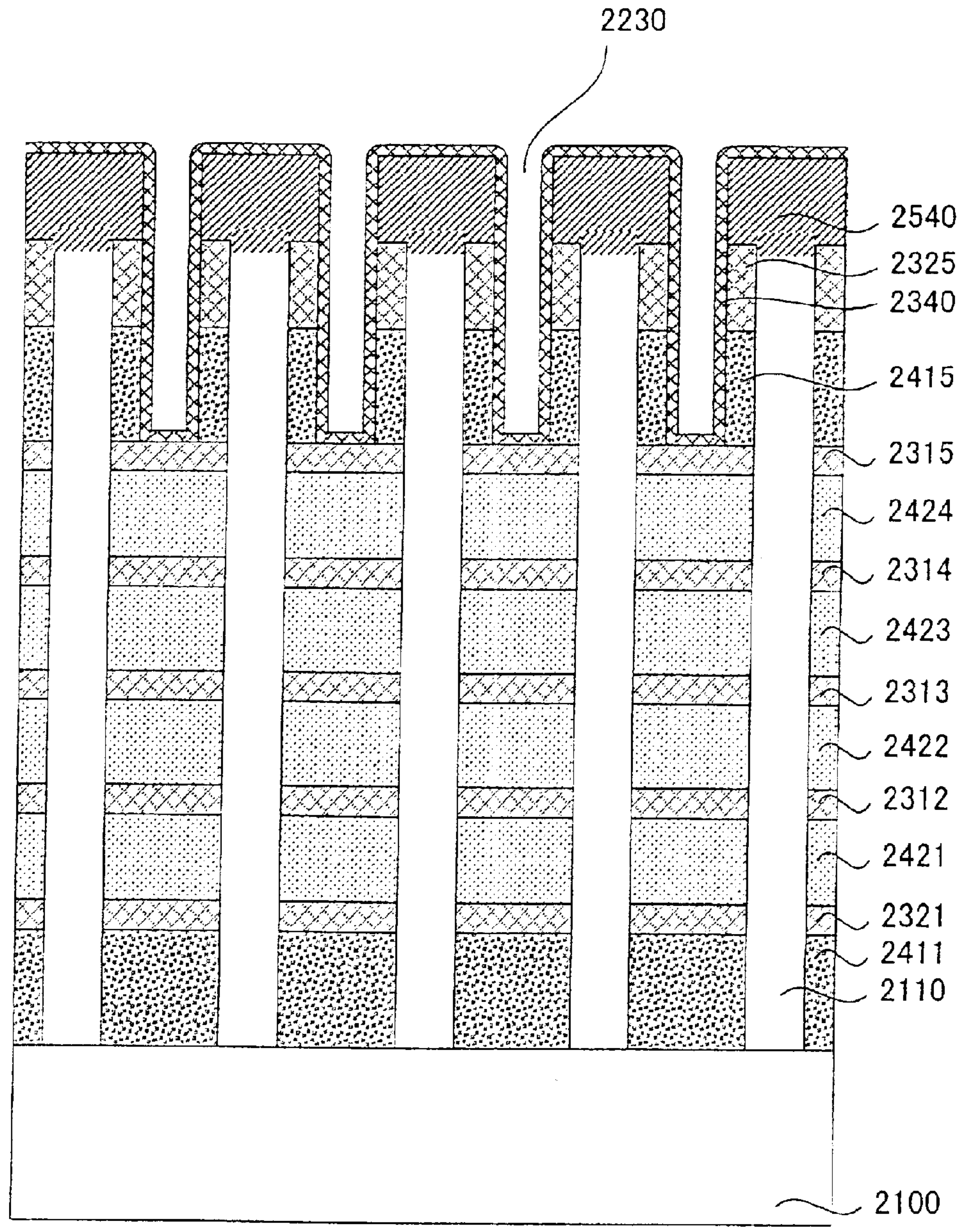
Figure 713:
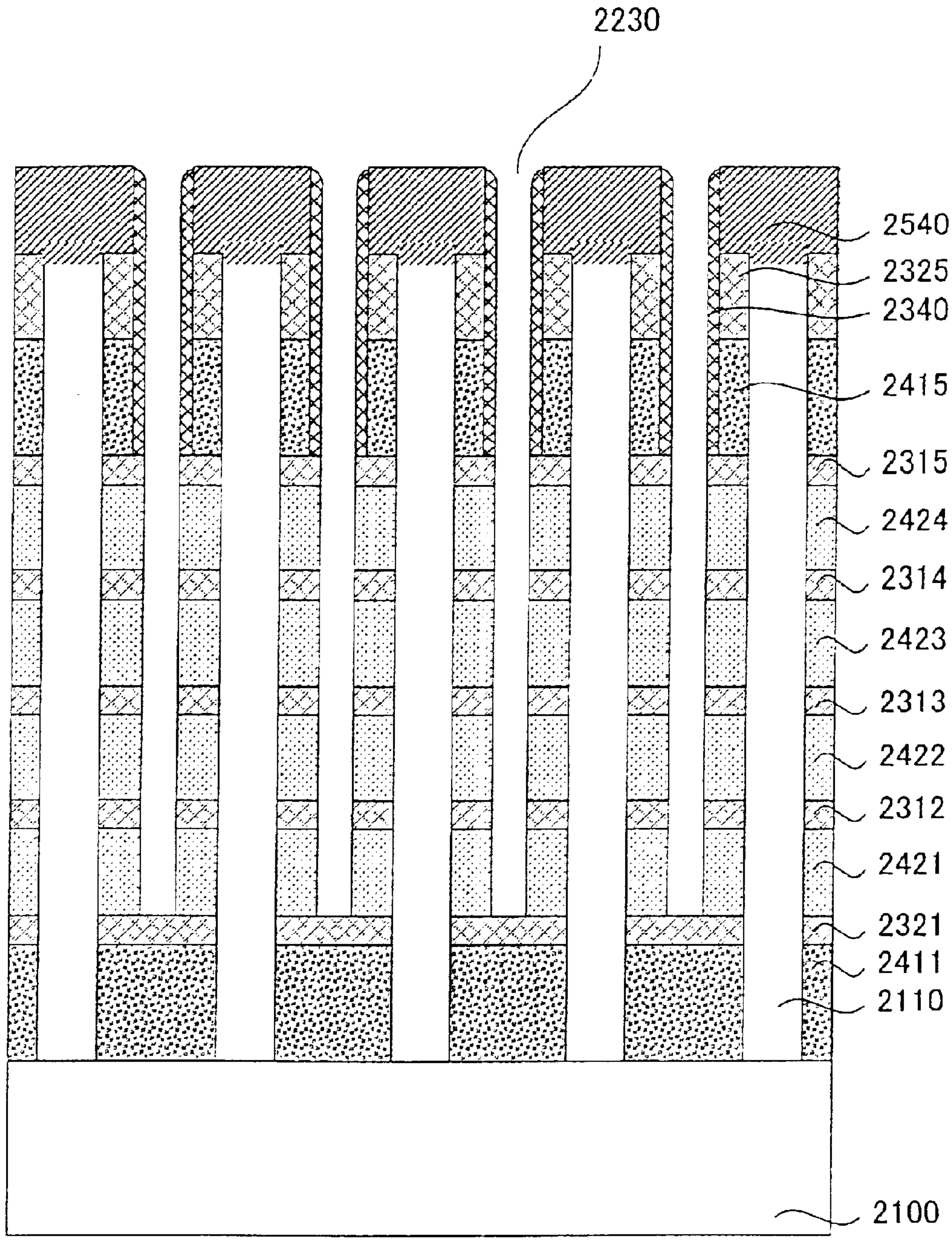
Figure 751:
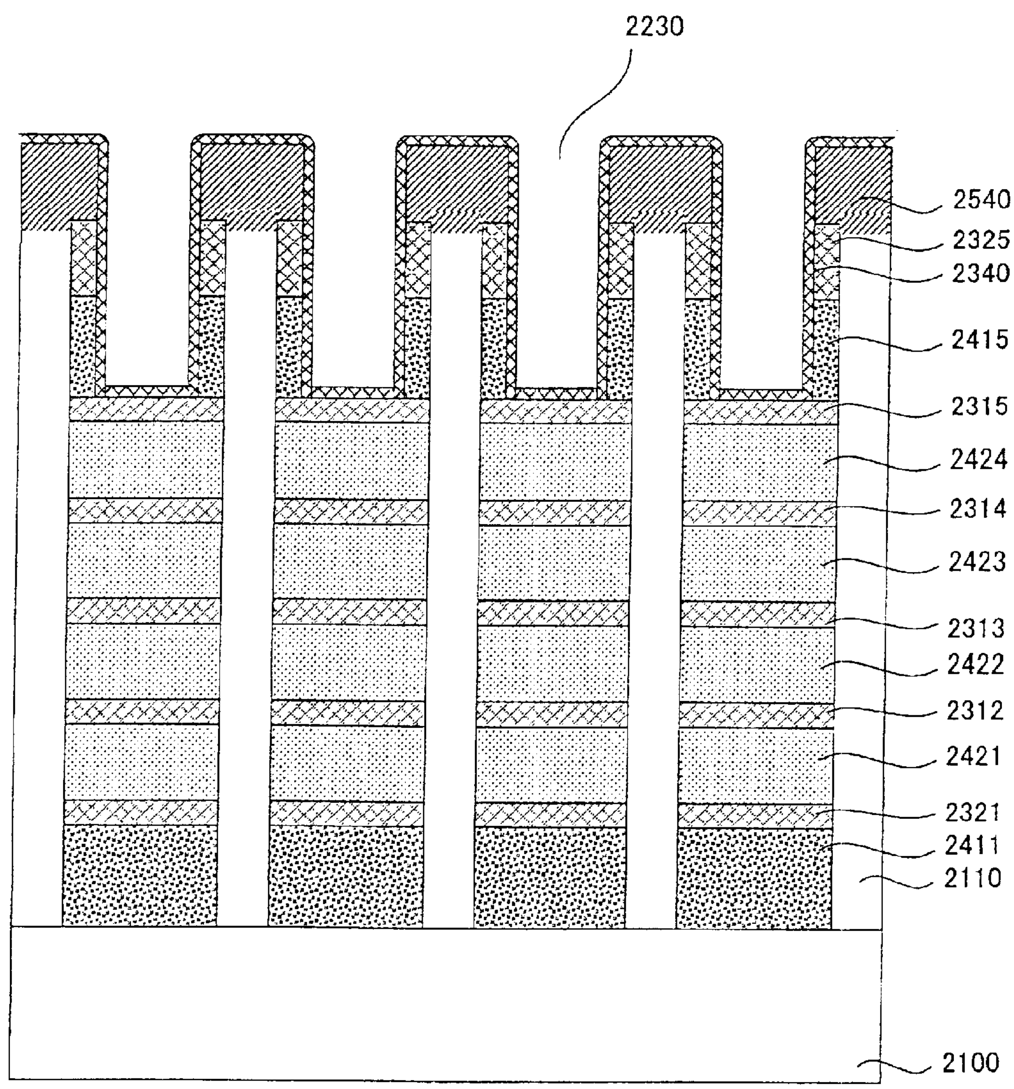
Figure 752:
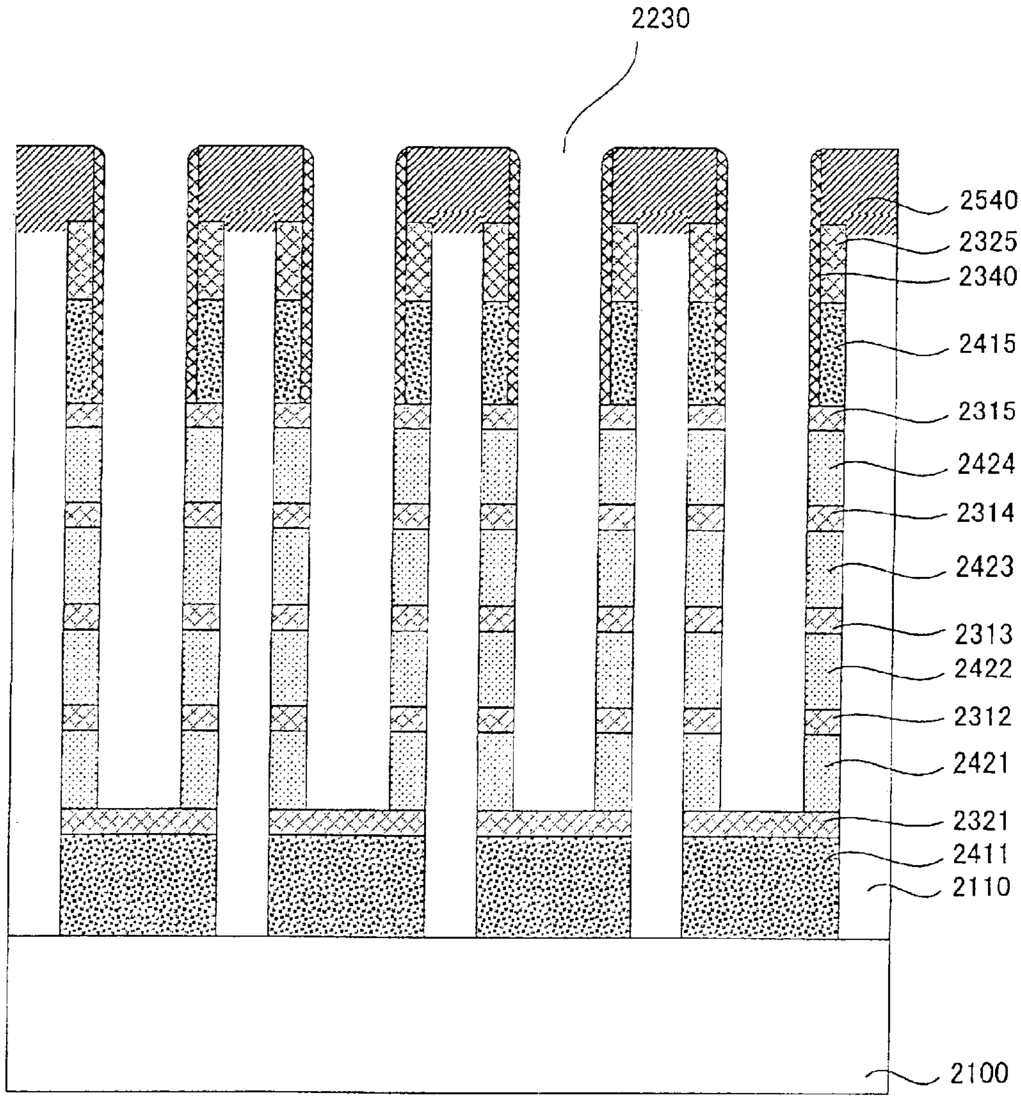

Then, a silicon nitride film 2340 is deposited as a sixth insulating film to a thickness of about 5 to 50 nm. The silicon nitride film 2340 is etched anisotropically to remain in the form of a sidewall spacer on the sidewalls of the polysilicon film 2540, the silicon nitride film 2325 and the silicon oxide film 2415 (FIGS. 712 and 751). At this time, the silicon oxide film 2415 containing the impurities (the first insulating film) is isolated from other films than the island-like semiconductor layer 2110 by the silicon nitride film 2325 (the fourth insulating film), the silicon nitride film 2315 (the second insulating film) and the silicon nitride film 2340 (the sixth insulating film) (FIGS. 713 and 752).

Then, using the silicon nitride films 2540 and 2340 as a mask, the silicon nitride film 2315, the silicon oxide film 2424, the silicon nitride film 2314, the silicon oxide film 2423, the silicon nitride film 2313, the silicon oxide film 2422 and the silicon nitride film 2312 are successively etched, thereby exposing the silicon oxide film 2421. Thus, a third trench 2230 is formed (FIGS. 713 and 752).

Figure 714:
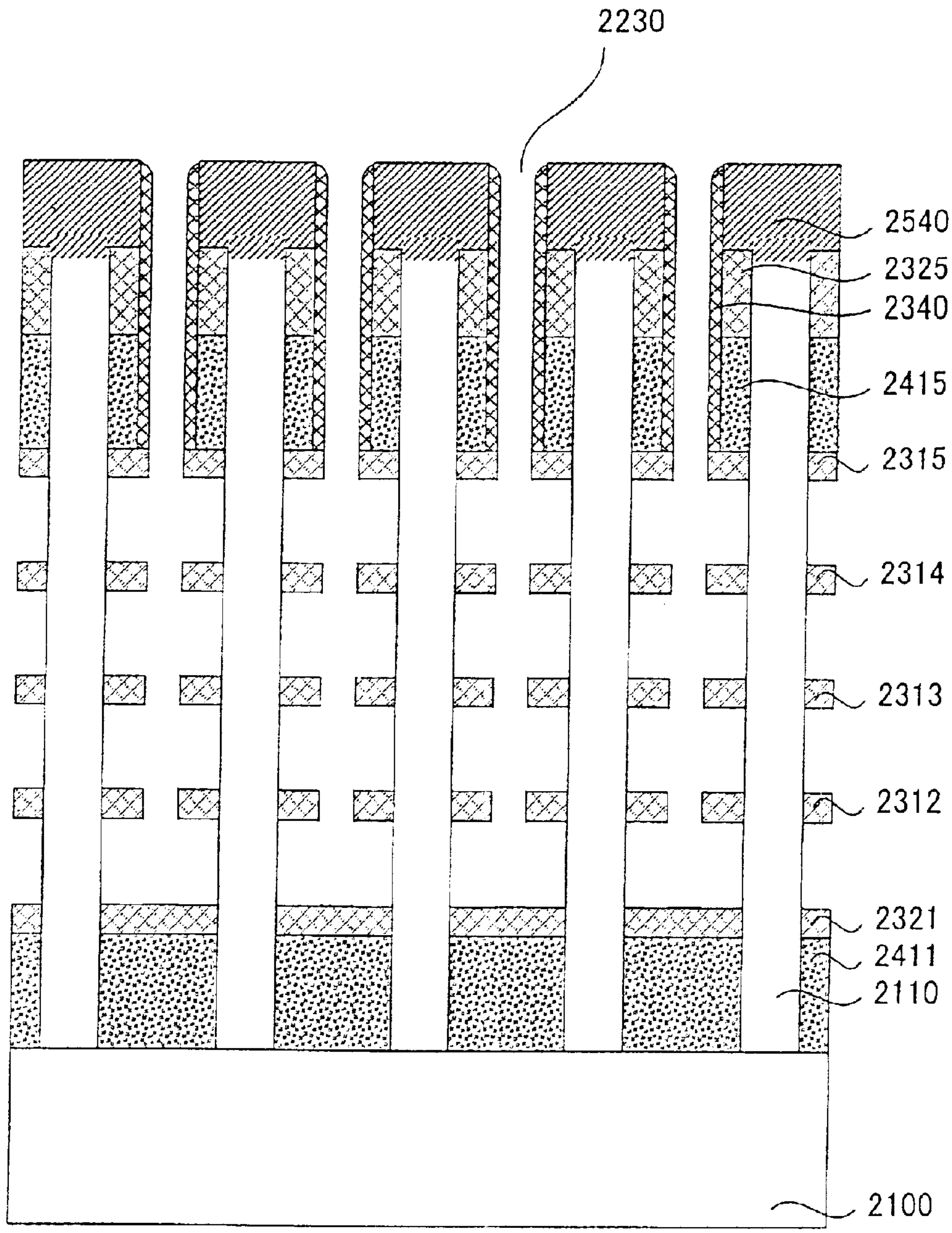
Figure 753:
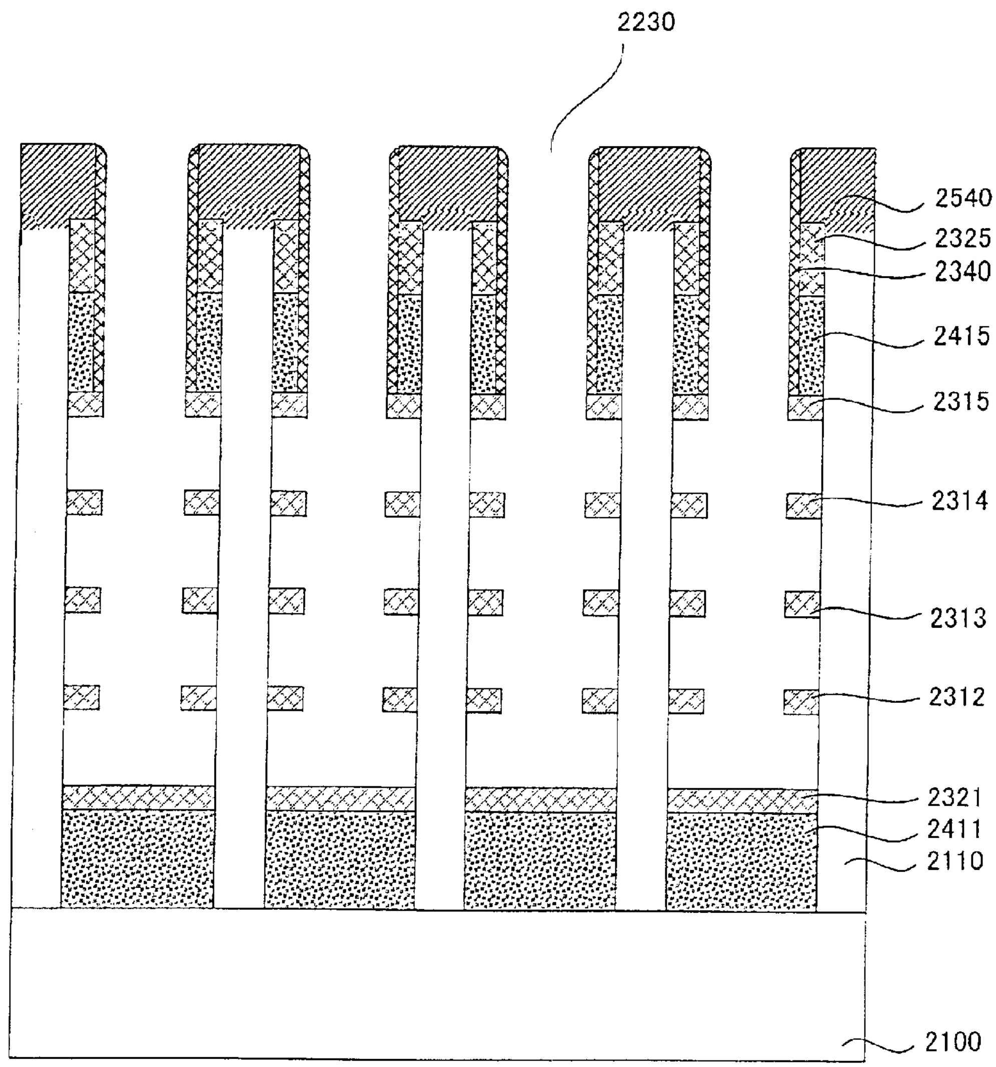

Thereafter, the silicon oxide films 2421, 2422, 2423 and 2424 are removed by isotropic etching to expose the sides of the island-like semiconductor layers 2110 (FIGS. 714 and 753).

Then, the periphery of each island-like semiconductor layer 2110 is oxidized to form, for example, a thermally oxidized film 2450 of about 10 to 100 nm thick as a ninth insulating film.

Next, the thermally oxidized film (the ninth insulating film) 2450 is etched away from the periphery of each island-like semiconductor layer 2110, for example, by isotropic etching. Then, as required, channel ion implantation is carried out into the sidewall of the island semiconductor layer 2110 by slant ion implantation. For example, the ion implantation may be performed at an implantation energy of 5 to 100 keV at a boron dose of about $1\times10^{11}$ to $1\times10^{13}$/cm$^2$ at an angle of 5 to 45° with respect to the normal line of the surface of the substrate. Preferably the channel ion implantation is performed from various directions to the island-like semiconductor layers 2110 because a surface impurity concentration becomes more uniform. Alternatively, instead of the channel ion implantation, an oxide film containing boron may be deposited by CVD with a view to utilizing diffusion of boron from the oxide film. The impurity implantation from the surface of the island-like semiconductor layers 2110 may be carried out before the island-like semiconductor layers 2110 are covered with the thermally oxidized film 2450, or during the formation of the island-like semiconductor layers 2110. Alternatively, the impurities may be introduced to the silicon oxide films 2421, 2422, 2423 and 2424 in advance with a view to implanting the impurities in the island-like semiconductor layers 2110 by thermal treatment or the like before removing the silicon oxide films 2421, 2422, 2423 and 2424. Means for the implantation are not particularly limited so long as an impurity concentration distribution is almost equal over the island-like semiconductor layers 2110.

Subsequently, a silicon oxide film 2460, for example, is formed as a tenth insulating film to be a tunnel oxide film to a thickness of about 10 nm around each island-like semiconductor layer 2110, for example, by thermal oxidization. The tunnel oxide film, however, may be formed of not only a thermally oxidized film but also a CVD oxide film or a nitrogen oxide film.

Figure 715:
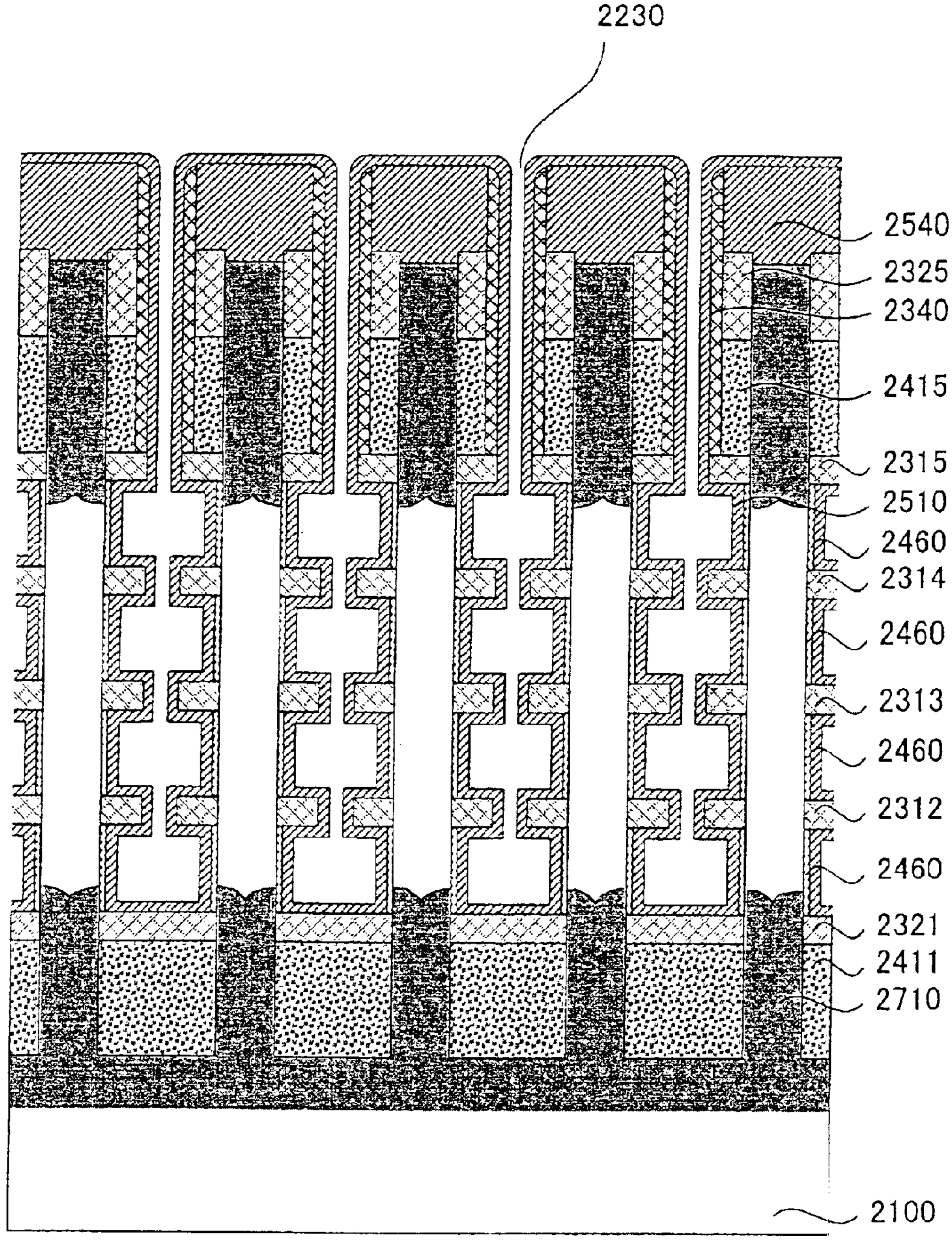
Figure 716:
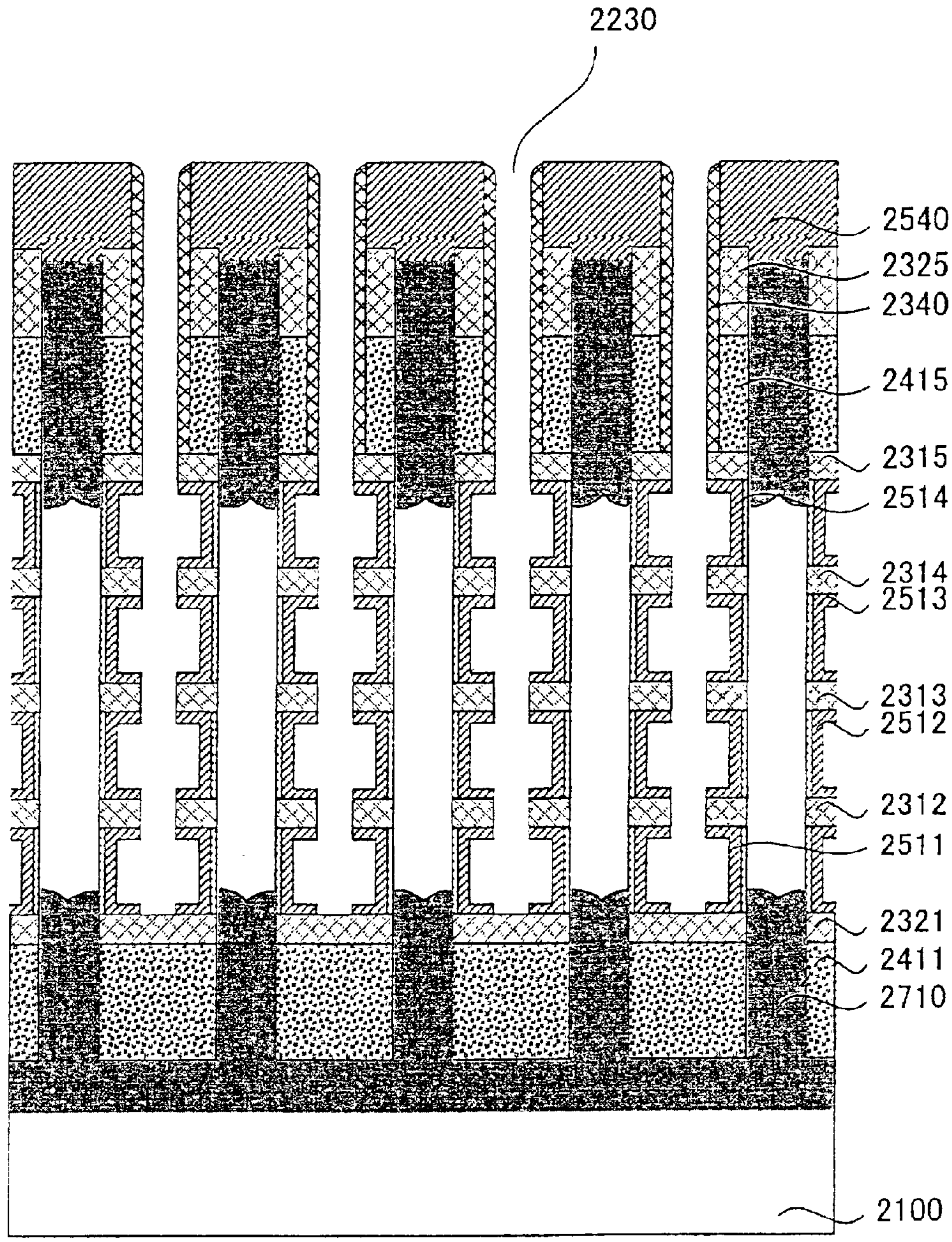
Figure 754:
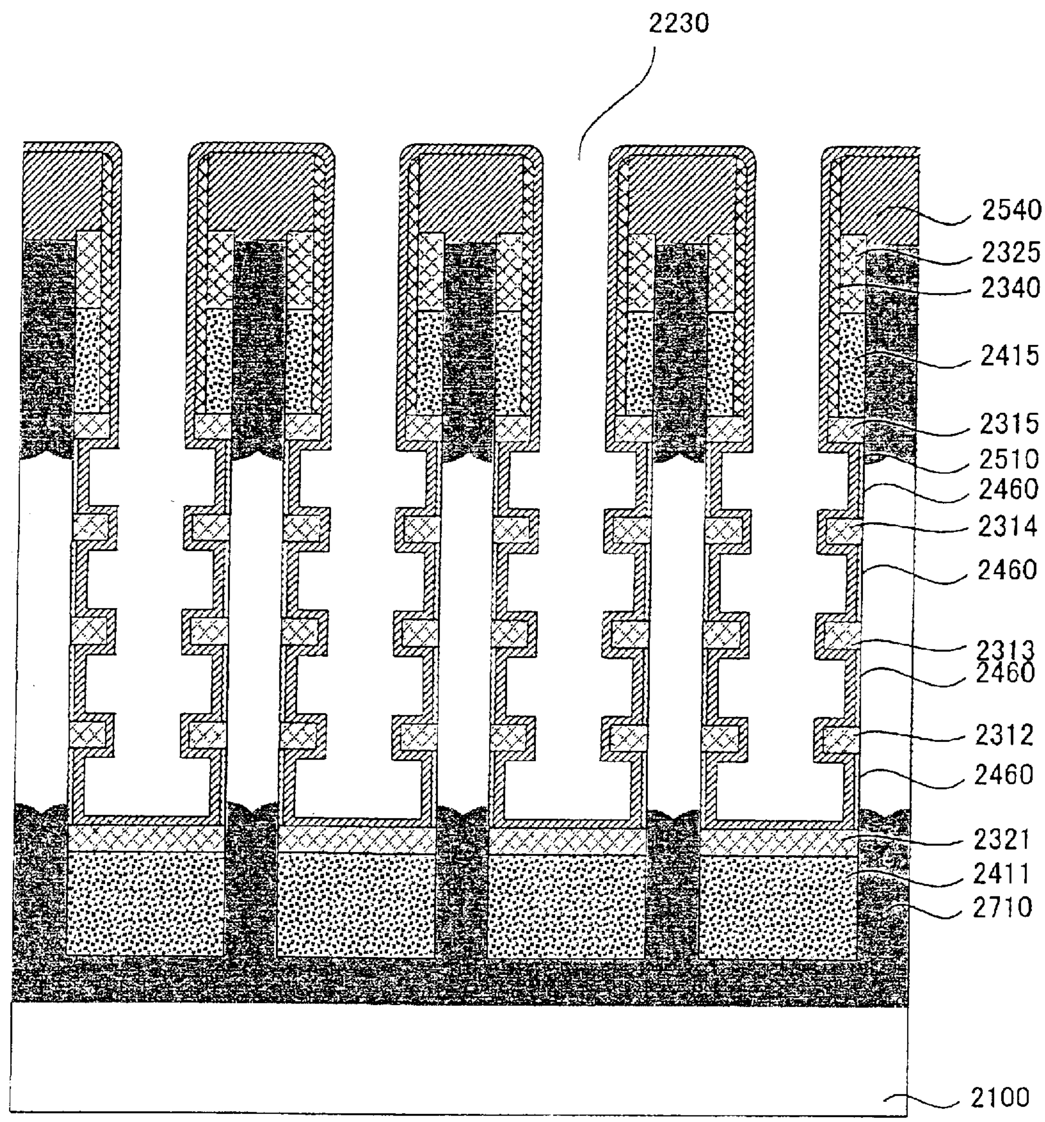
Figure 755:
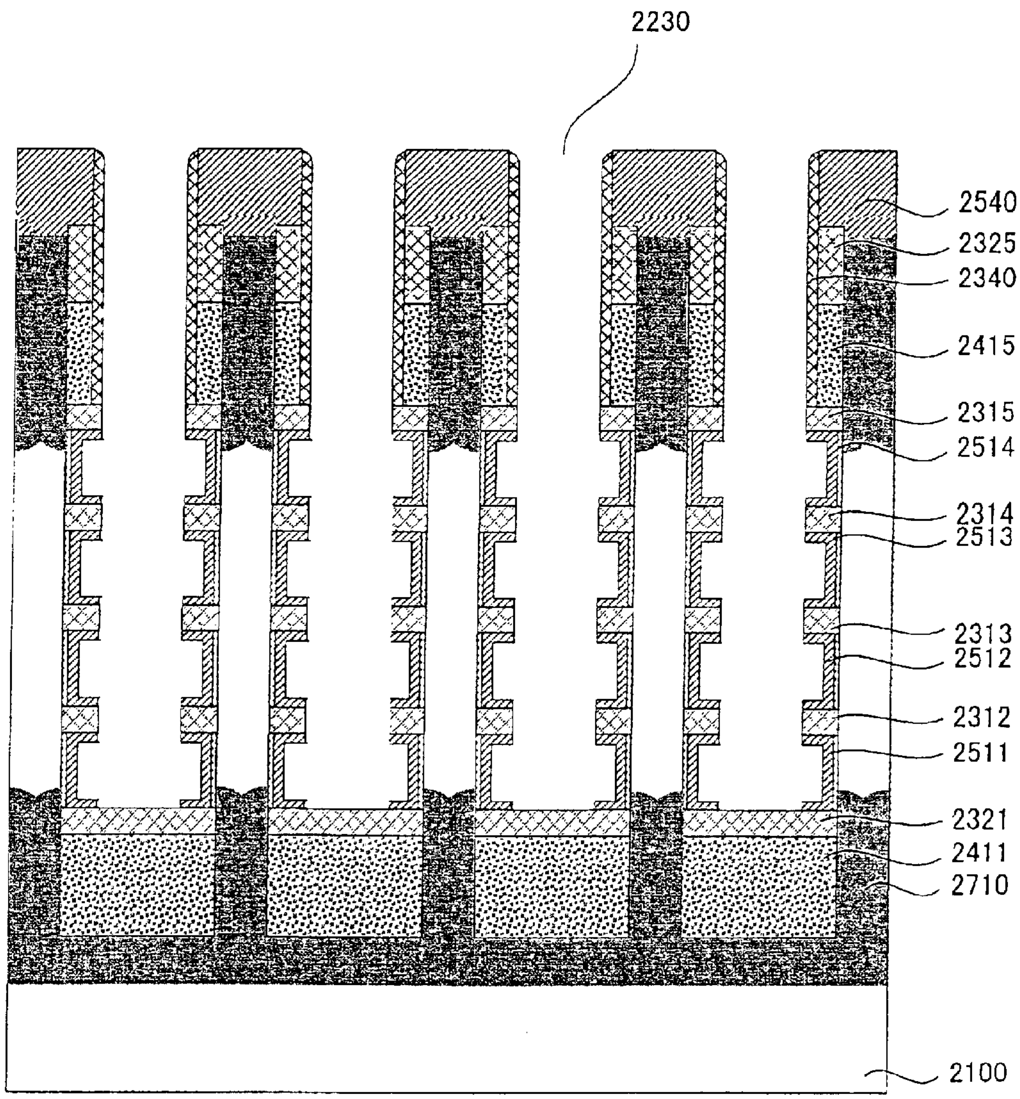

Then, a polysilicon film 2510, for example, is deposited as a first conductive film to a thickness of about 50 to 200 nm (FIGS. 715 and 754). Using the polysilicon film 2540 (the fourth conductive film), the silicon nitride film 2340 (the sixth insulating film) and the silicon nitride films 2342, 2343 and 2344 (the second insulating films) as a mask, the polysilicon film 2510 is divided into polysilicon films 2511, 2512, 2513 and 2514 by anisotropic or isotropic etching (FIGS. 716 and 755).

Figure 717:
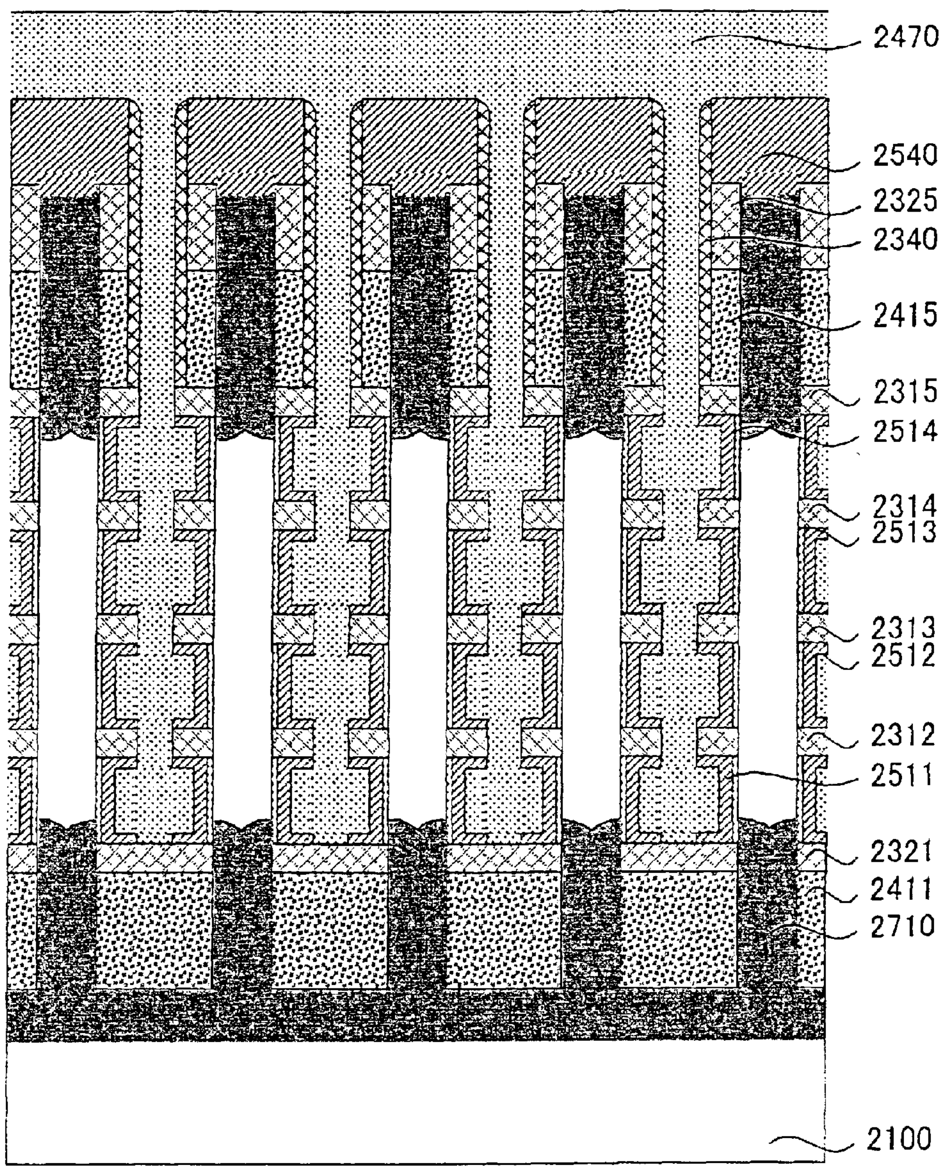
Figure 756:
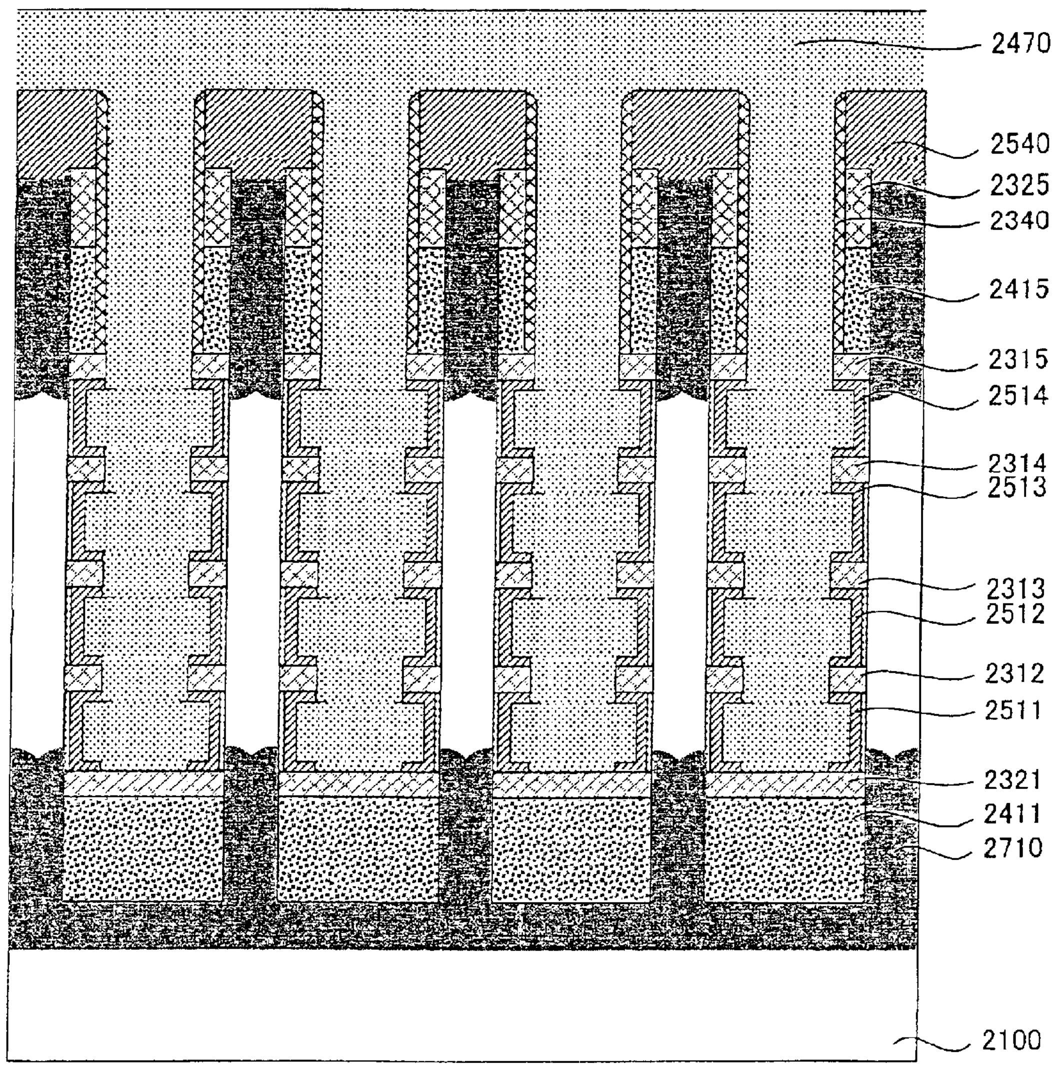

Then, a silicon oxide film 2470, for example, is deposited as an eleventh insulating film to a thickness of about 50 to 500 nm (FIGS. 717 and 756).

Figure 718:
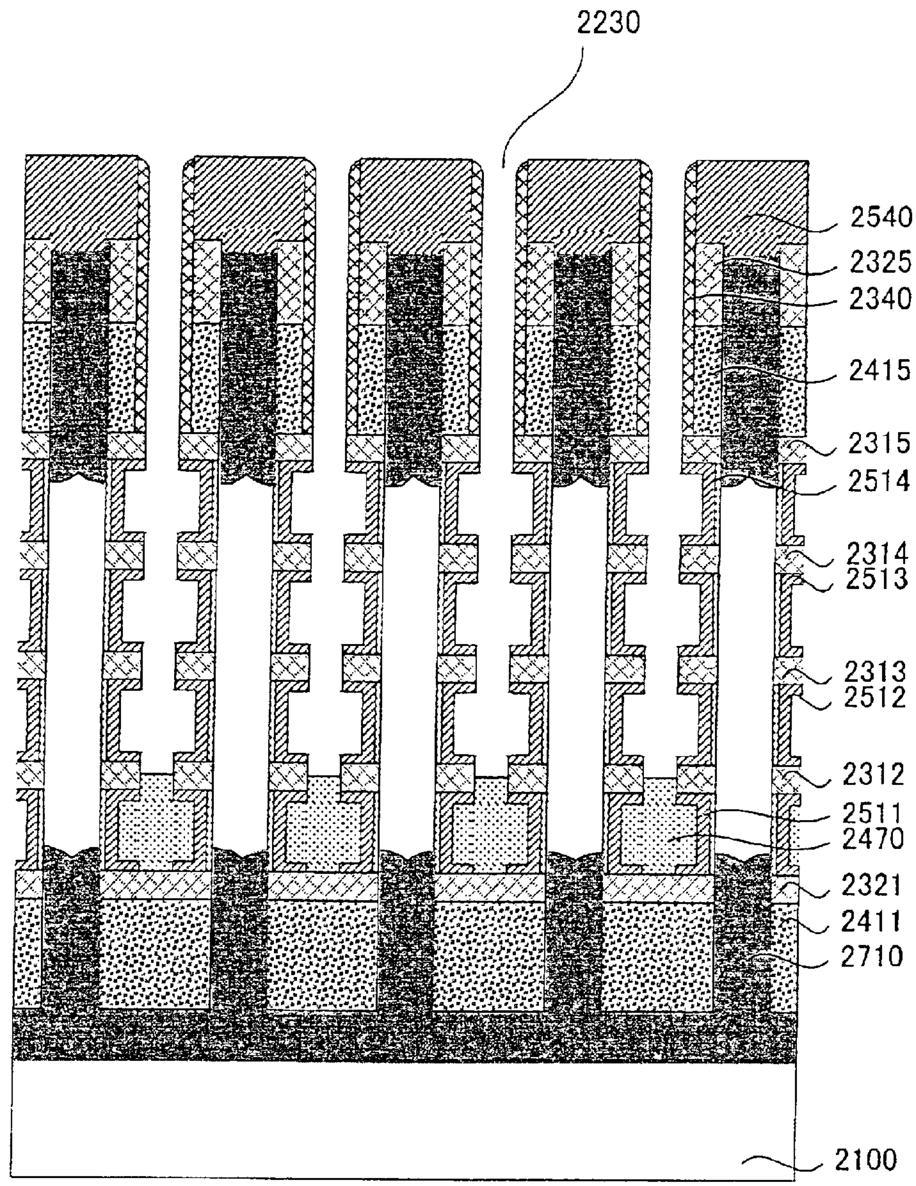
Figure 757:
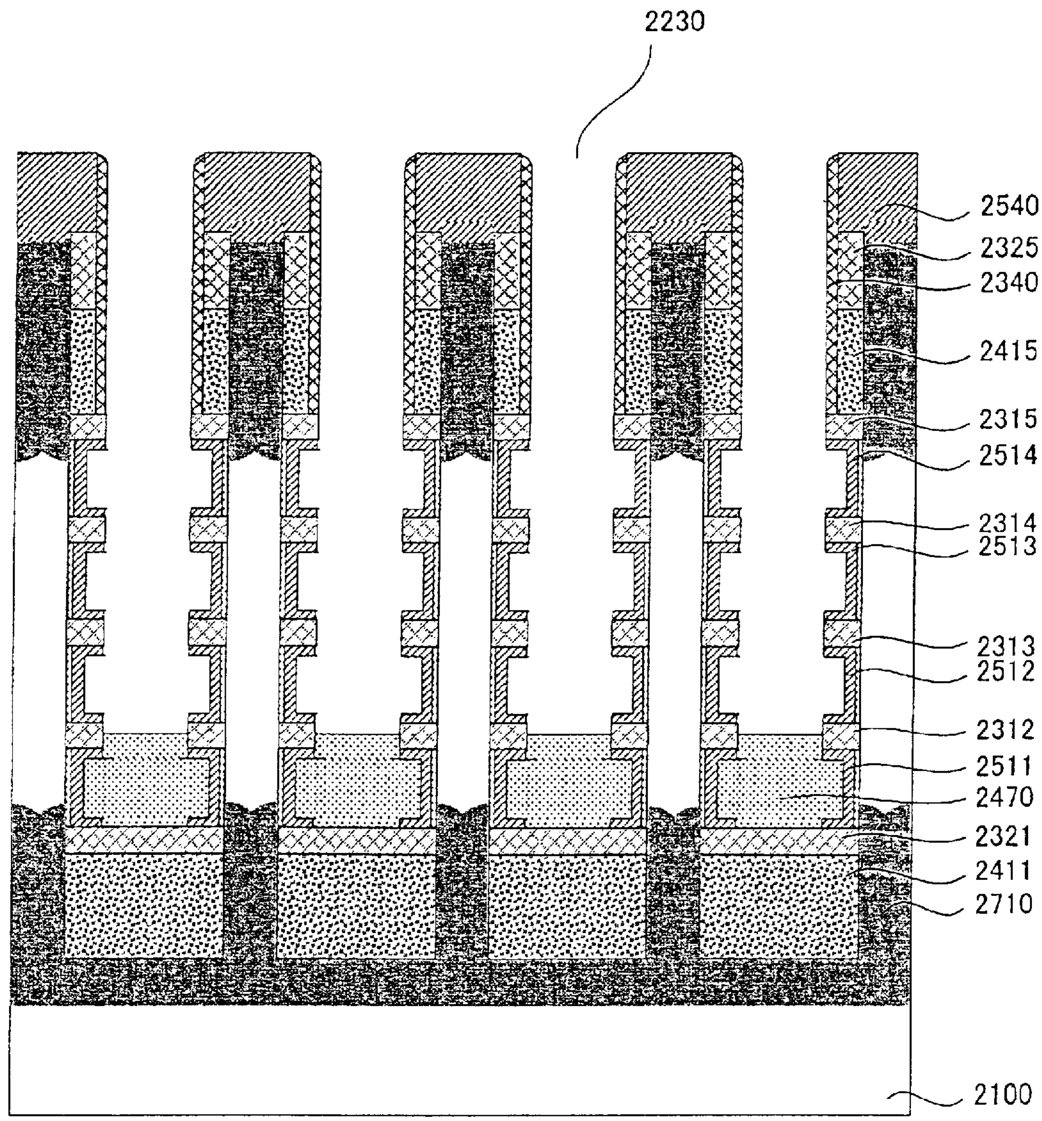

The silicon oxide film 2470 is buried in the third trench 2230, for example, by anisotropic or isotropic etching such that the polysilicon film 2511 (the first conductive film) is embedded (FIGS. 718 and 757). At this time, the depth of the buried silicon oxide film 2470 is so controlled that the silicon nitride film 2312 (the second insulating film) is partially exposed.

Figure 719:
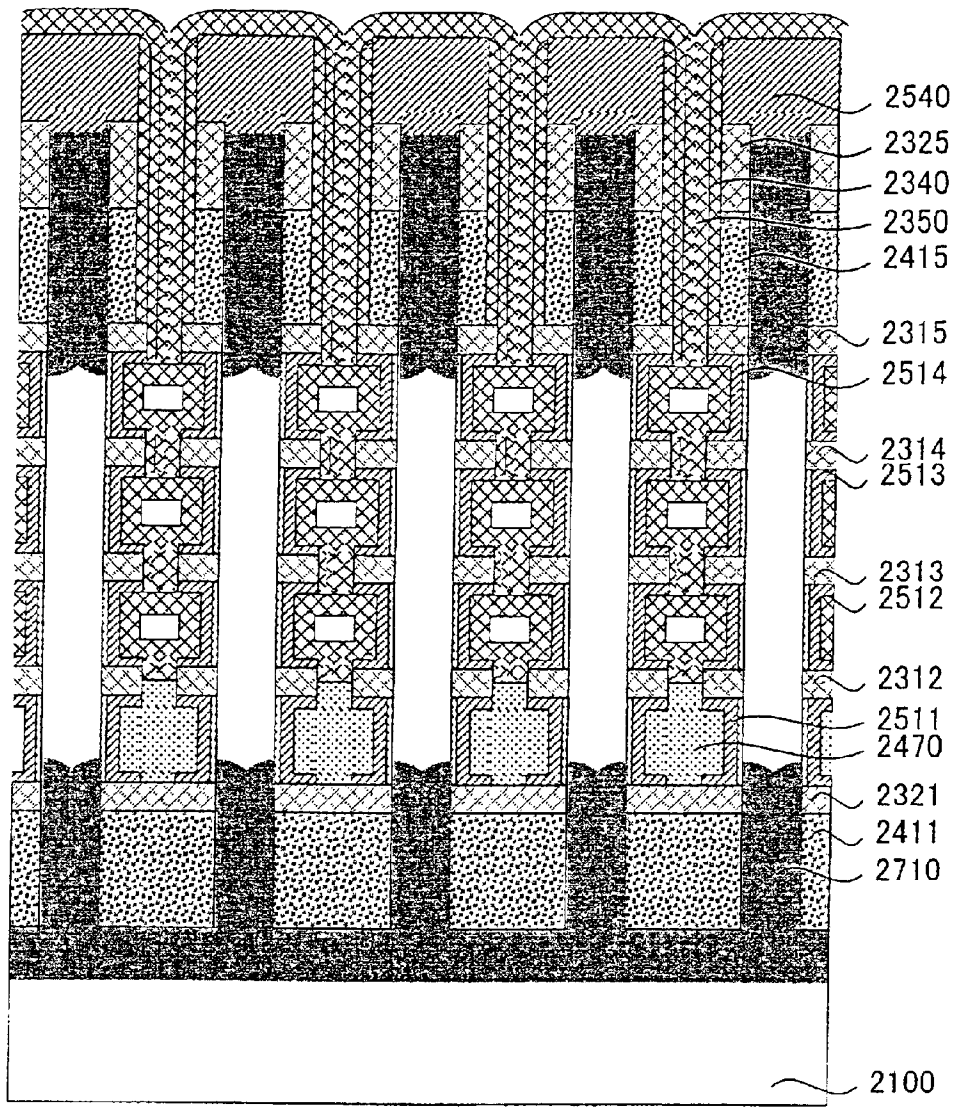
Figure 758:
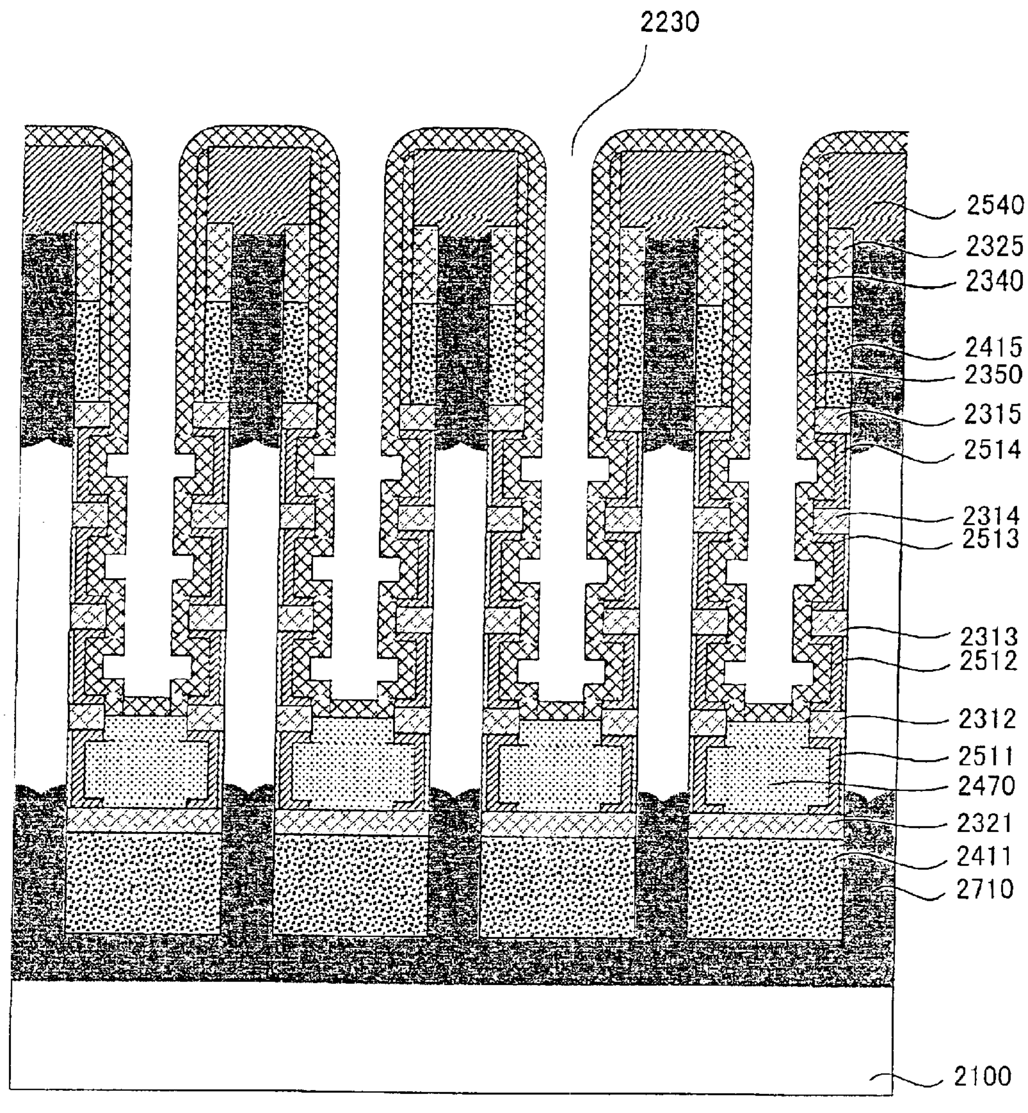

Then, a silicon nitride film 2350, for example, is deposited as a twelfth insulating film to a thickness of 5 to 50 nm on the surfaces of the polysilicon films 2512 to 2514 (the first conductive films), the silicon nitride film 2340 (the sixth insulating film), the silicon nitride films 2342, 2343 and 2344 (the second insulating films) and the silicon oxide film 2470 (the eleventh insulating film) which are present on the inner wall of the third trench 2230. At this time, by setting the intervals between the island-like semiconductor layers 2110 in a direction of A-A' in FIG. 1 to a predetermined value or smaller, a mask for forming a control gate line continuous in the direction is formed in self-alignment without need to use a masking process. That is, if the deposition thickness of the silicon nitride film 2350 is about half or more of the width of the third trench 2230 defined by the silicon nitride film 2340, the silicon nitride film 2350 fills the third trench 2230 only in a direction of A-A' of FIG. 1. The thickness of the silicon nitride film 2350 is so set that concave portions defined by the polysilicon films 2511, 2512, 2513 and 2514 (the first conductive films) are not completely filled with the silicon nitride film 2350 (FIGS. 719 and 758).

Figure 720:
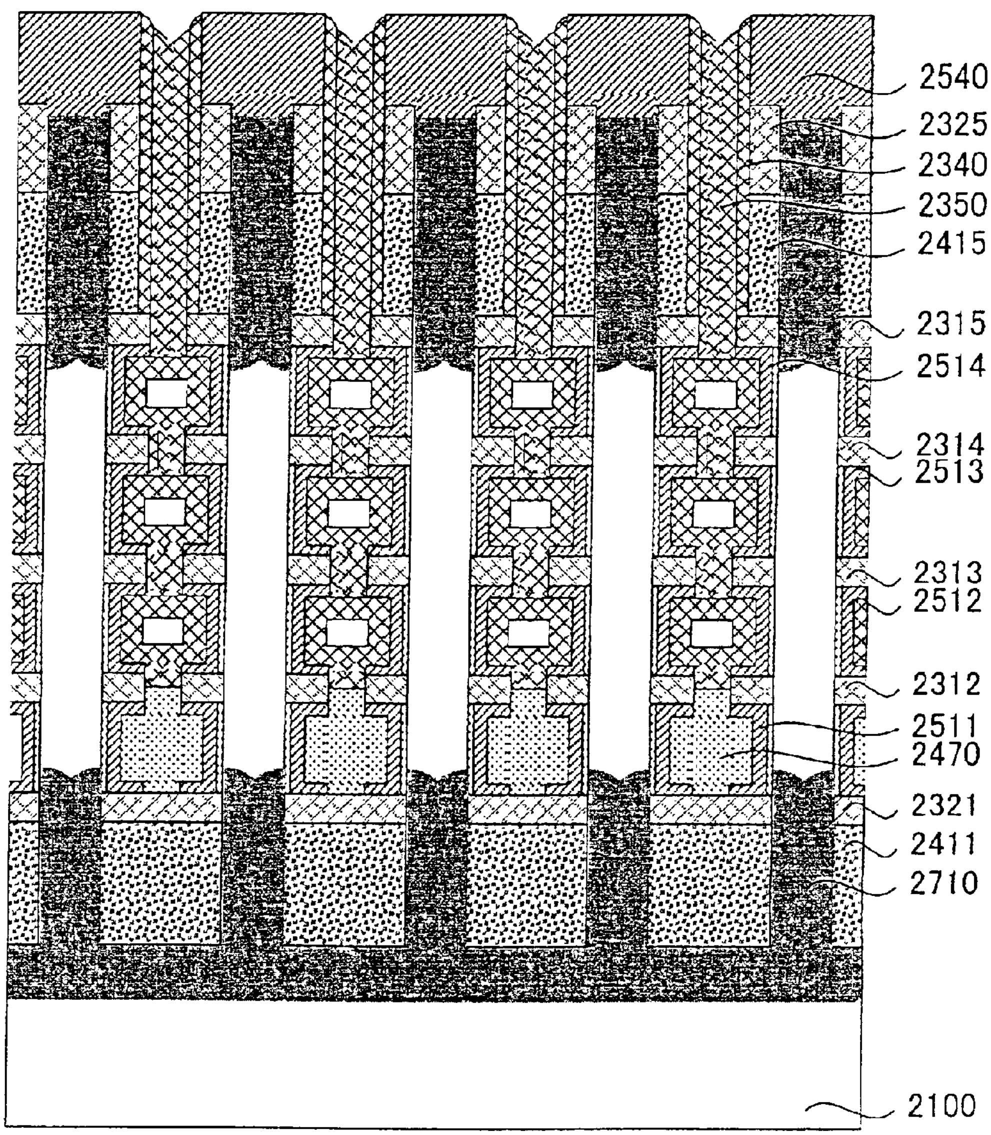
Figure 759:
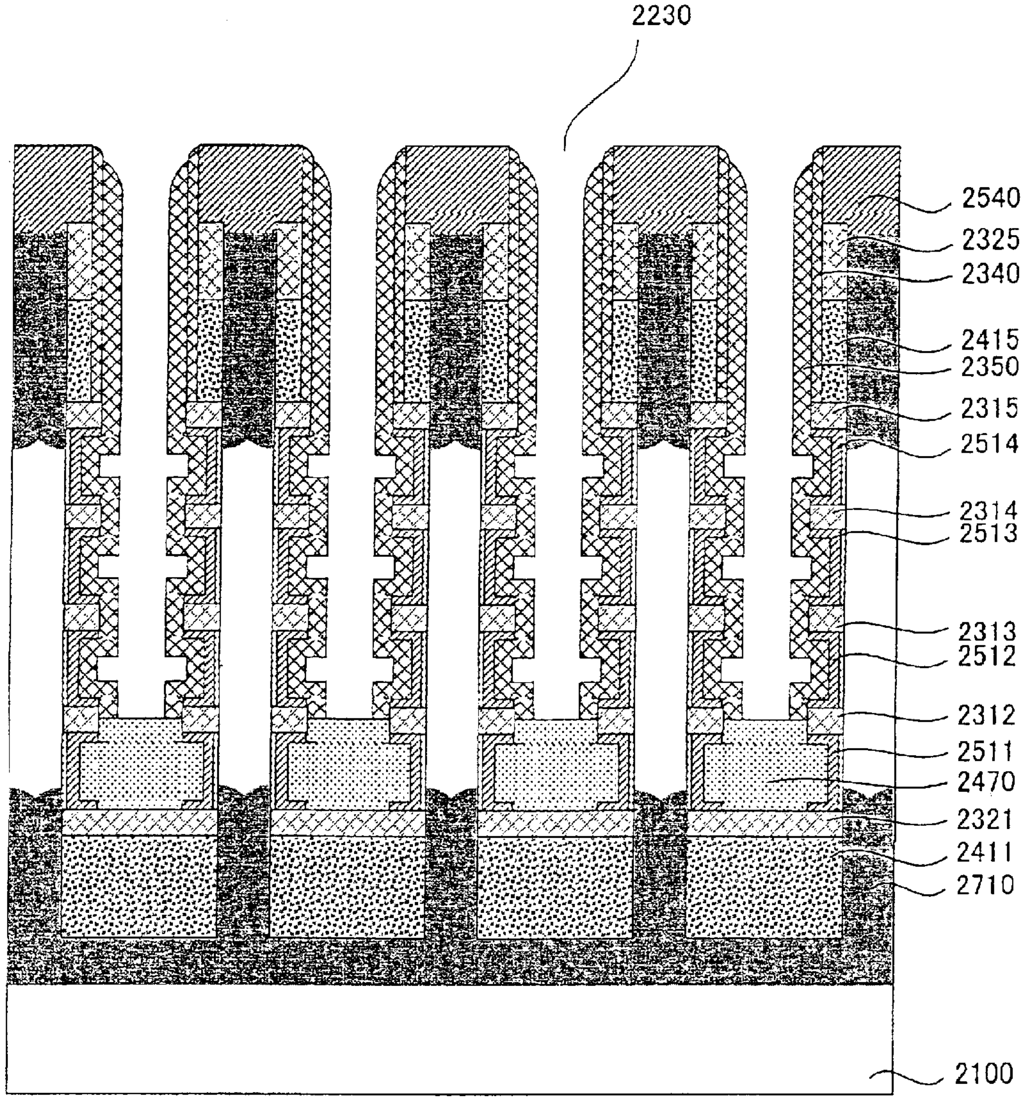

The silicon nitride film 2350 is etched back anisotropically into the form of a sidewall spacer such that the silicon oxide film 2470 is exposed as shown in FIG. 759. At this time, as shown in FIG. 720, the third trench 2230 in a direction of A-A' in FIG. 1 is filled with the silicon nitride film 2350.

Figure 721:
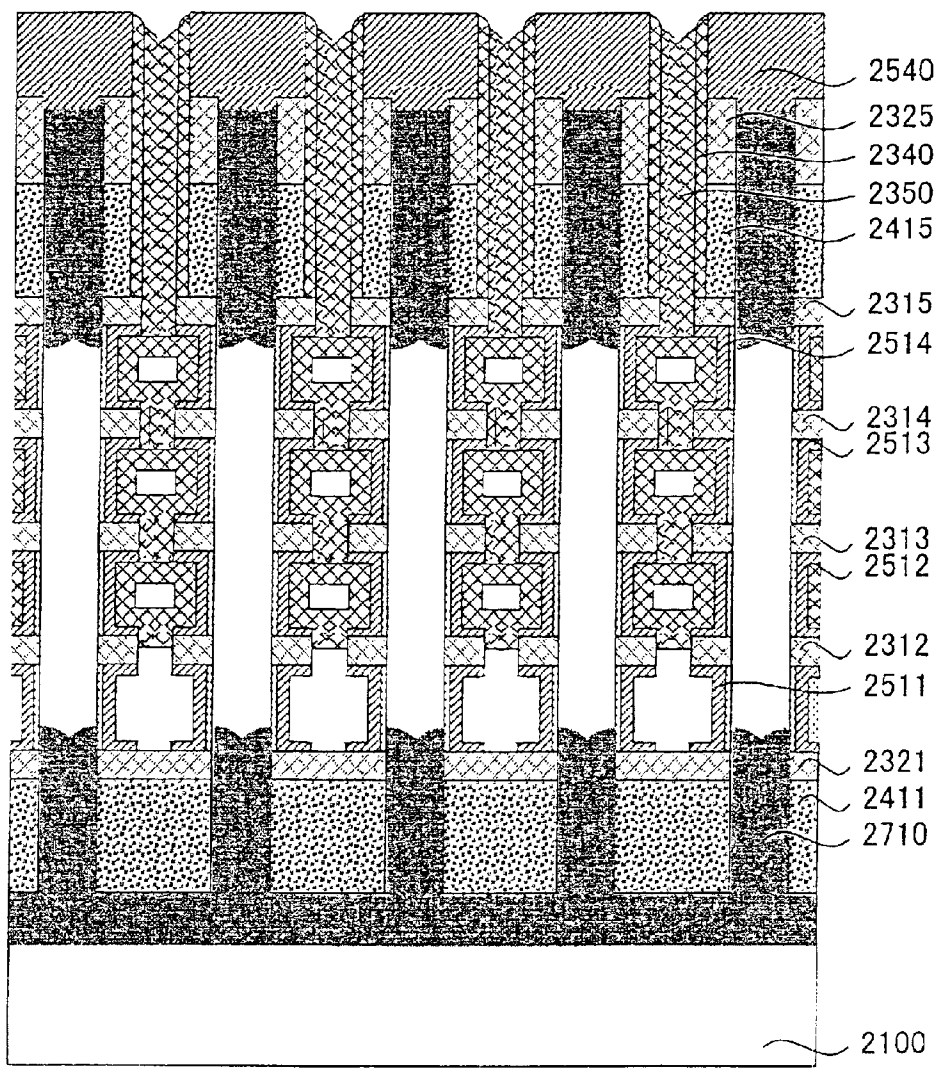
Figure 760:
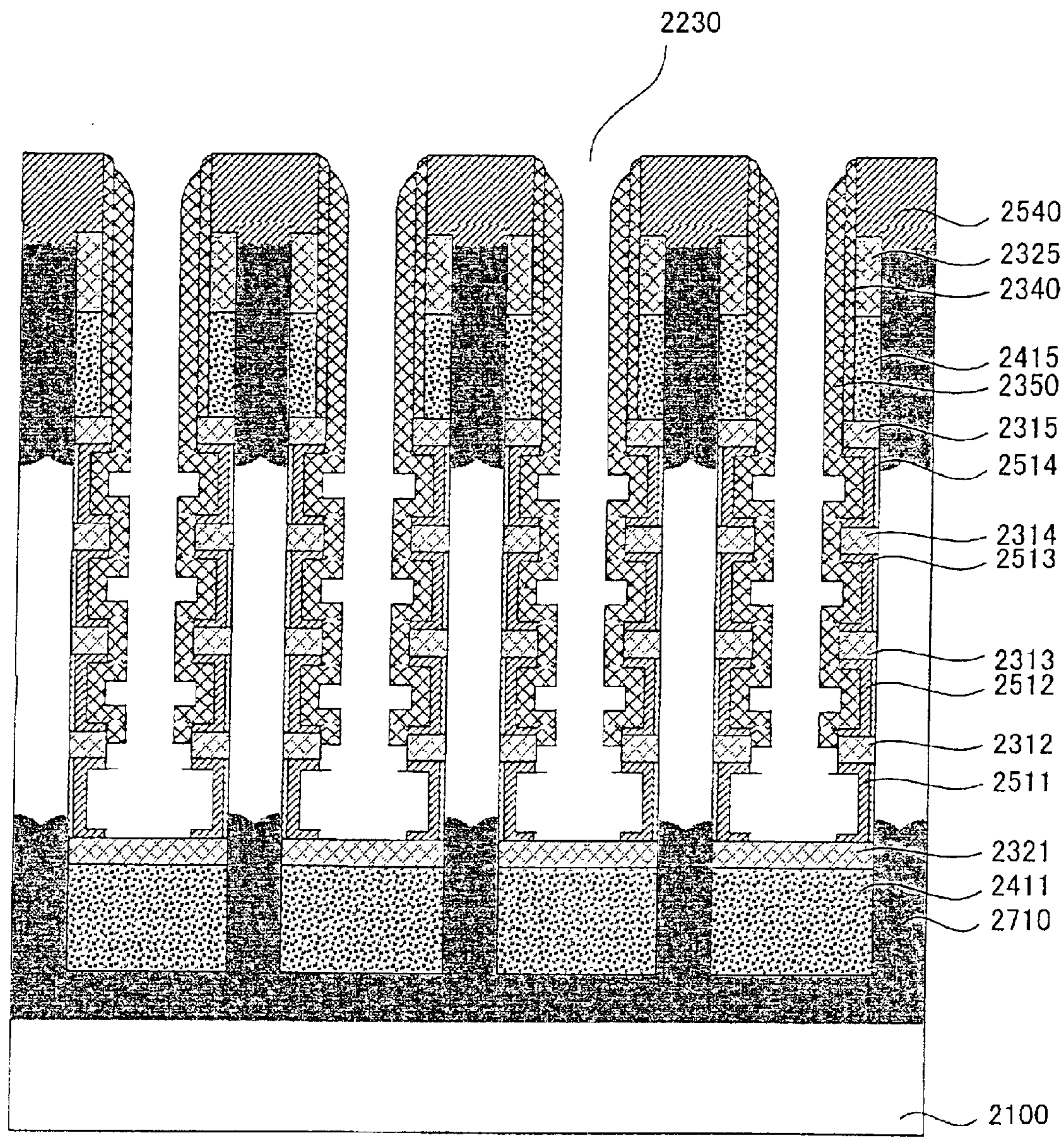

Then, the silicon oxide film 2470 is etched back isotropically to such a degree that the side of the polysilicon film 2511 (the first conductive film) is exposed (FIGS. 721 and 760). Then, a polysilicon film 2521, for example, is deposited as a second conductive film to a thickness of 15 to 150 nm.

Figure 722:
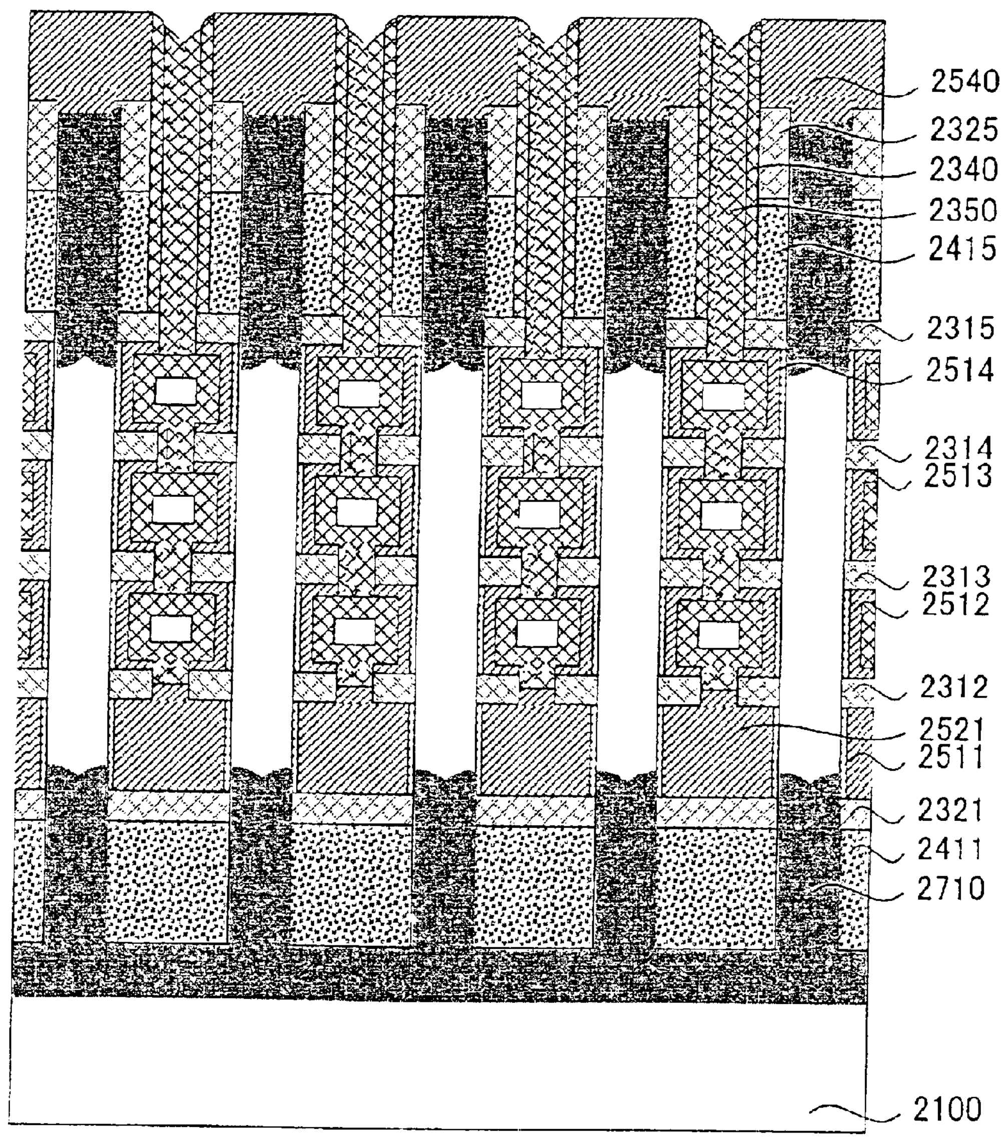
Figure 761:
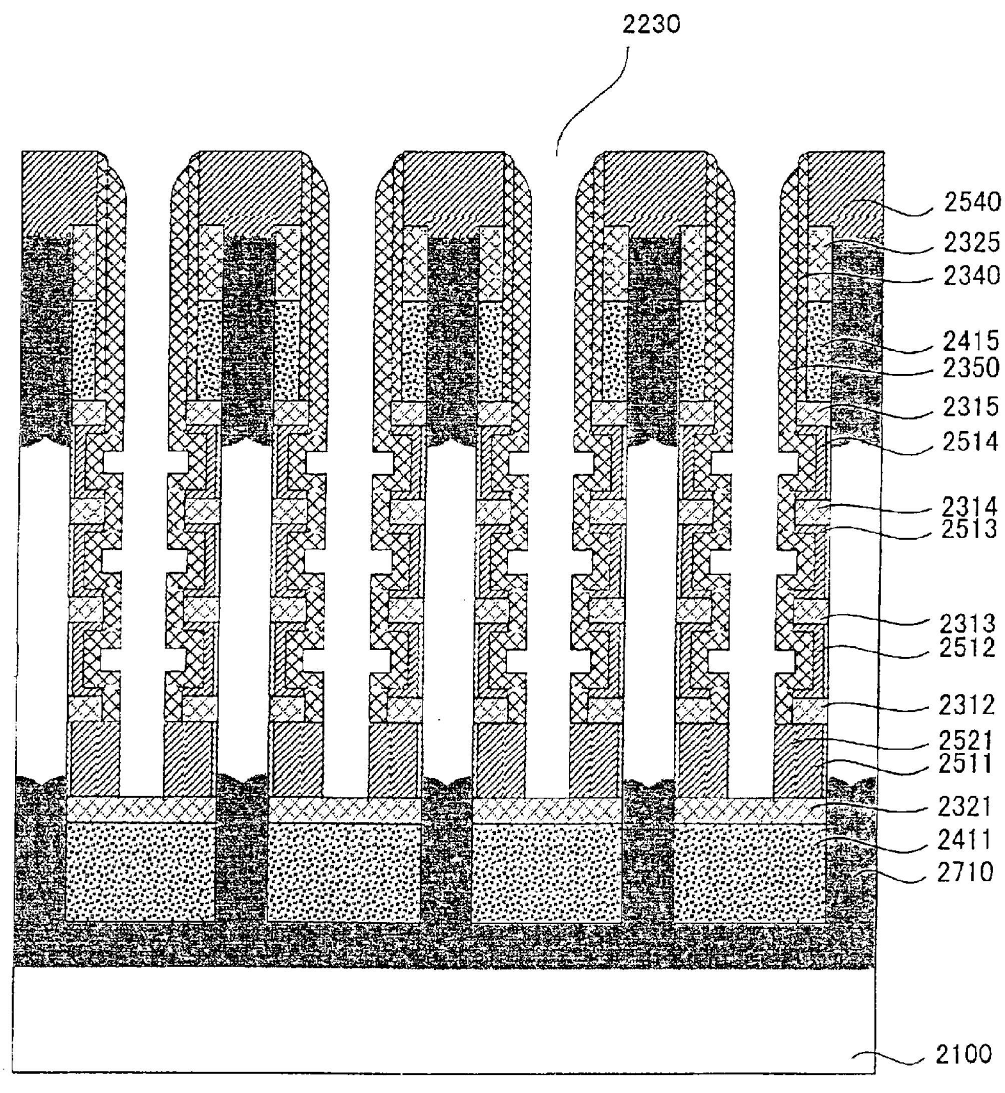

The polysilicon film 2521 is etched back, for example, by anisotropic etching (FIGS. 722 and 761). Subsequently, as shown in FIG. 762, the silicon nitride film 2321 (the fourth insulating film), the silicon oxide film 2411 (the first insulating film) and the P-type silicon substrate 2100 are successively etched to form a second trench 2200 in the P-type silicon substrate 2100 in self-alignment with the polysilicon film 2521 (the second conductive film), thereby separating the impurity diffusion layer 2710.

Figure 723:
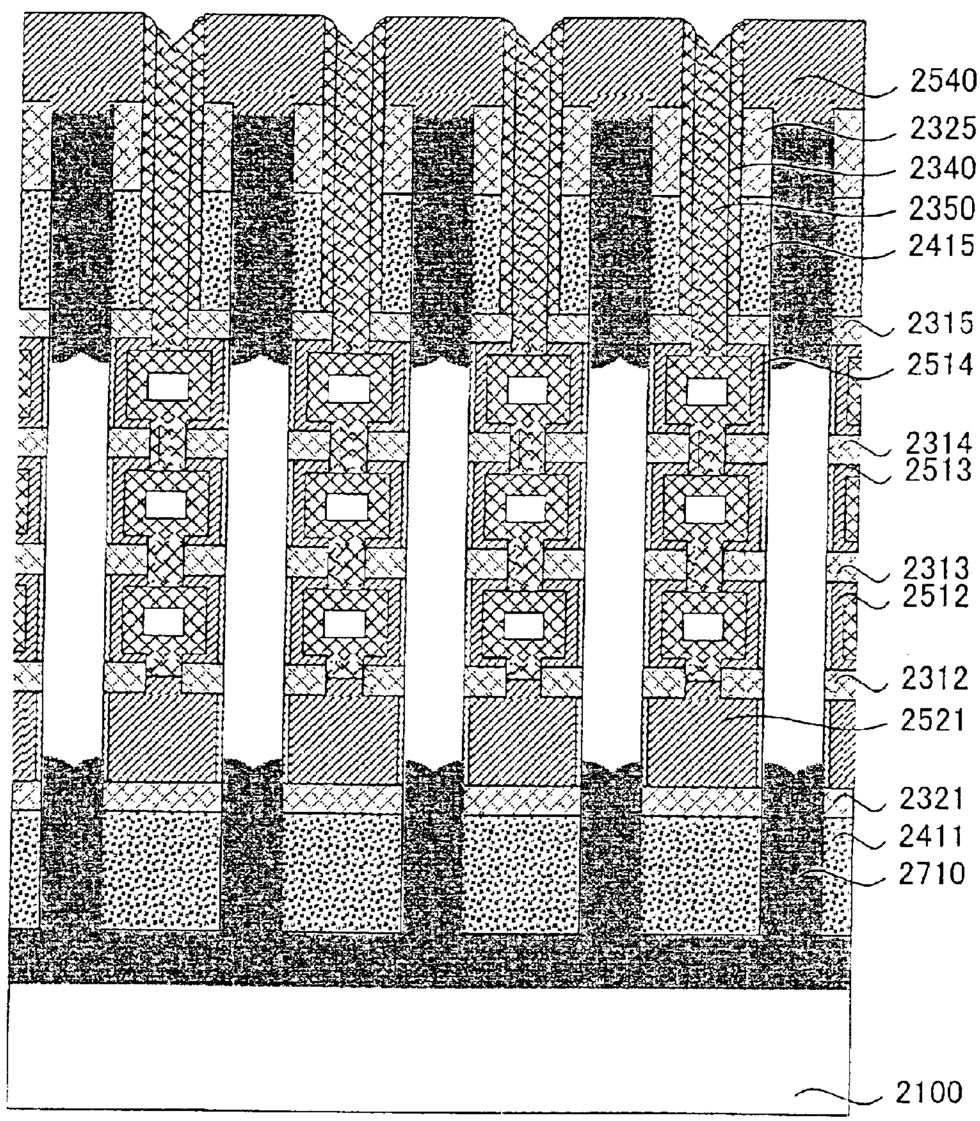
Figure 762:
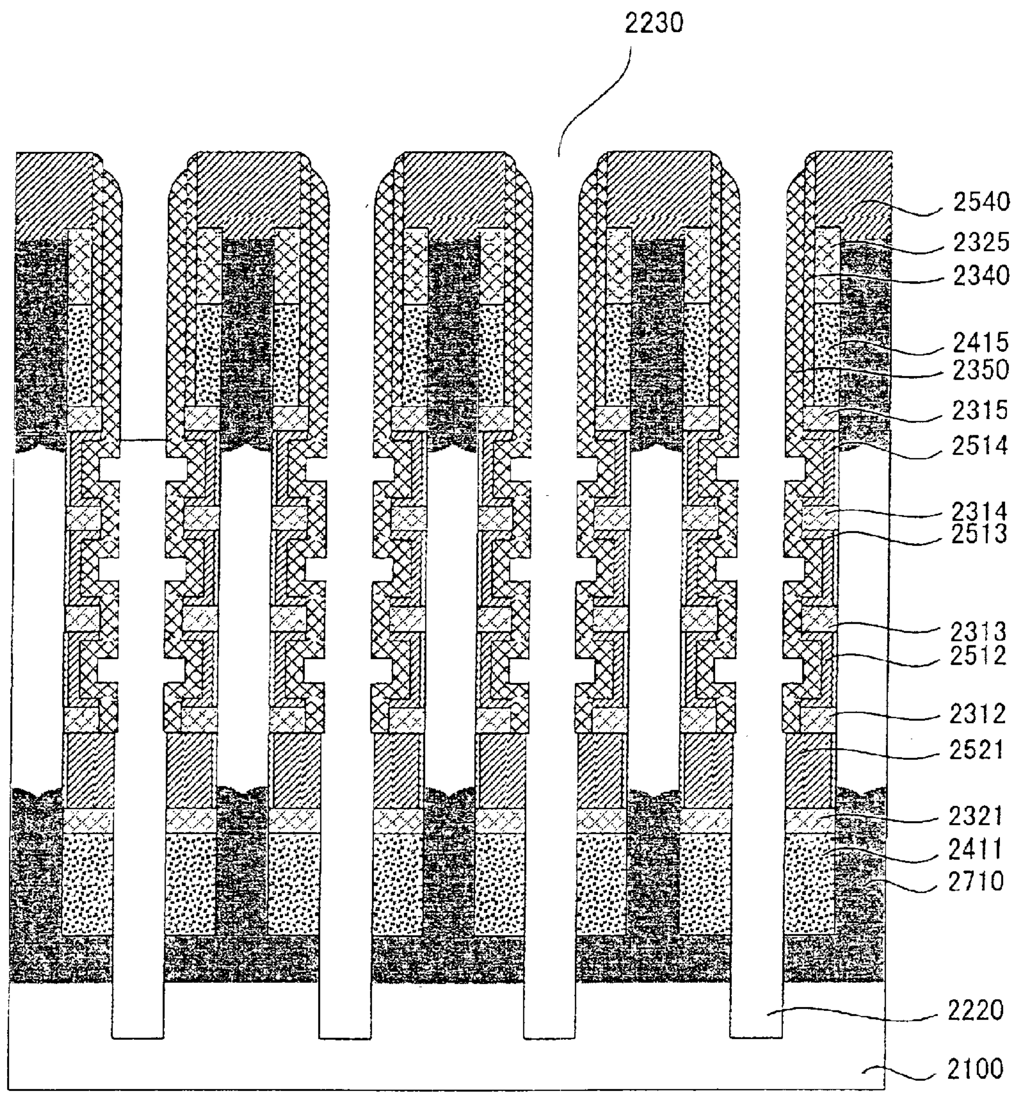

That is, a separation portion of the first wiring layer is formed in self-alignment with a separation portion of the second conductive film (FIG. 723 and FIG. 762). At this time, by setting the intervals between the island-like semiconductor layers 2110 in a direction of A-A' in FIG. 1 to a predetermined value or smaller, the polysilicon film 2521 is formed into a second wiring layer to be a selection gate line continuous in the direction without need to use a masking process.

Figure 724:
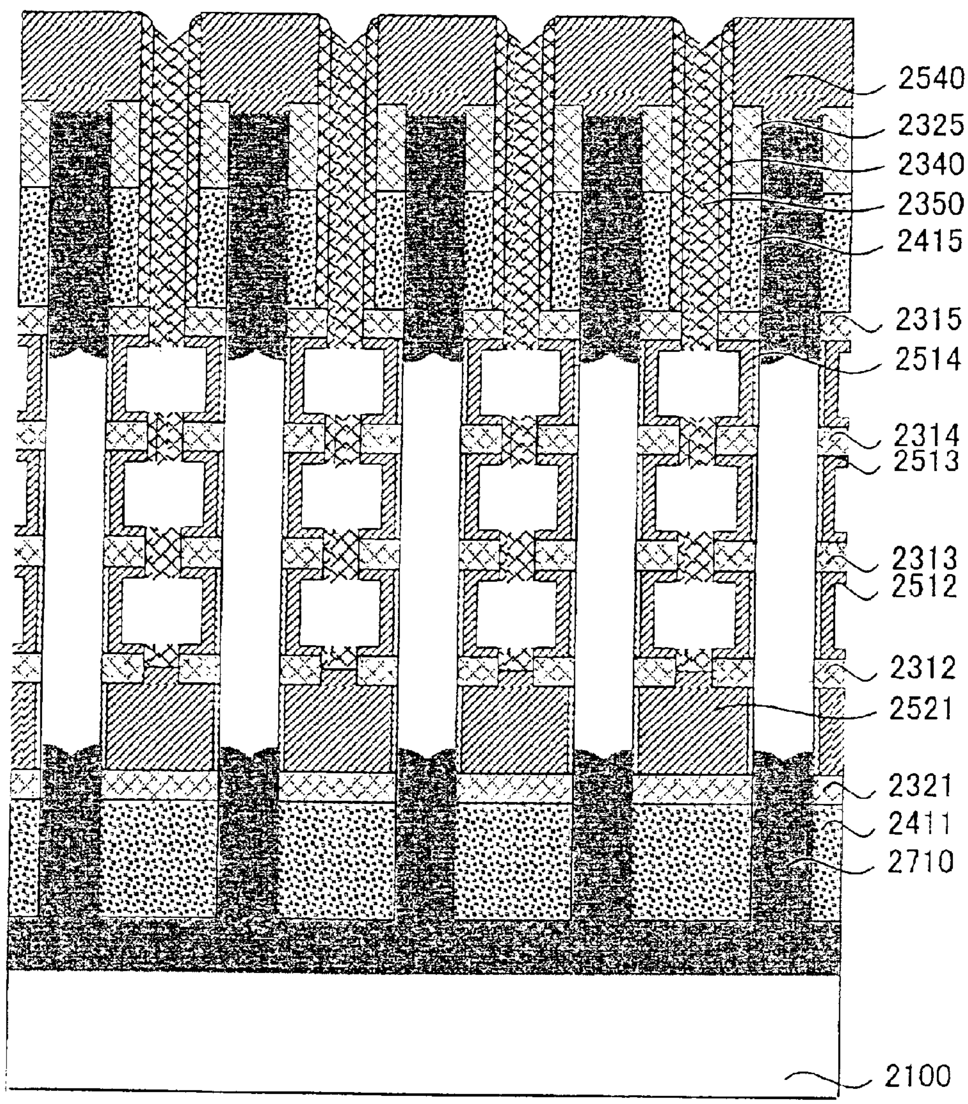
Figure 763:
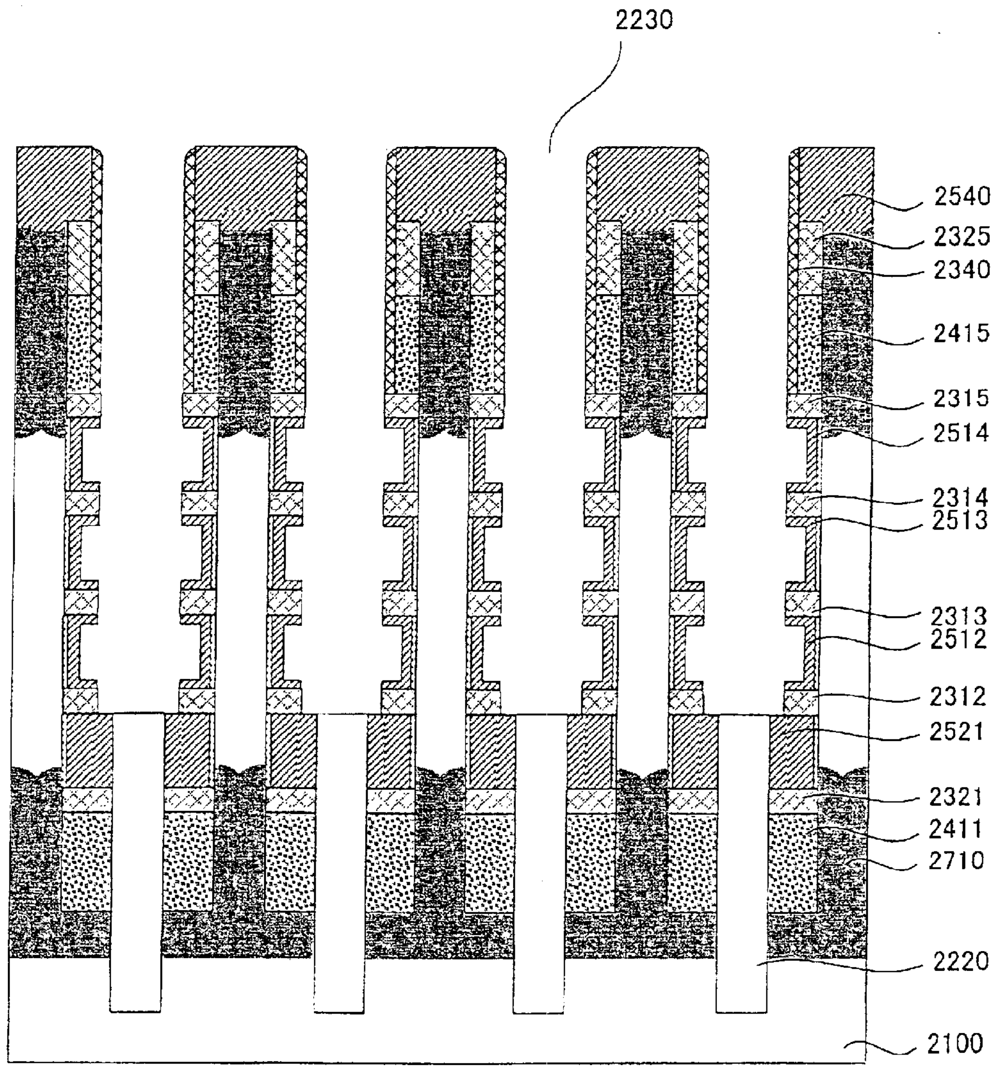

Then, the silicon nitride film (the twelfth insulating film) 2350 is removed by isotropic etching from the surfaces of the polysilicon films 2512, 2513 and 2514 (FIGS. 724 and 763). That is, by isotropically etching the silicon nitride film 2350 to a depth corresponding to the deposit thickness, the surfaces of the polysilicon films 2512, 2513 and 2514 are exposed. At this time, as shown in FIG. 724, the third trench 2230 in a direction of A-A' in FIG. 1 is filled with the silicon nitride film 2350.

Figure 725:
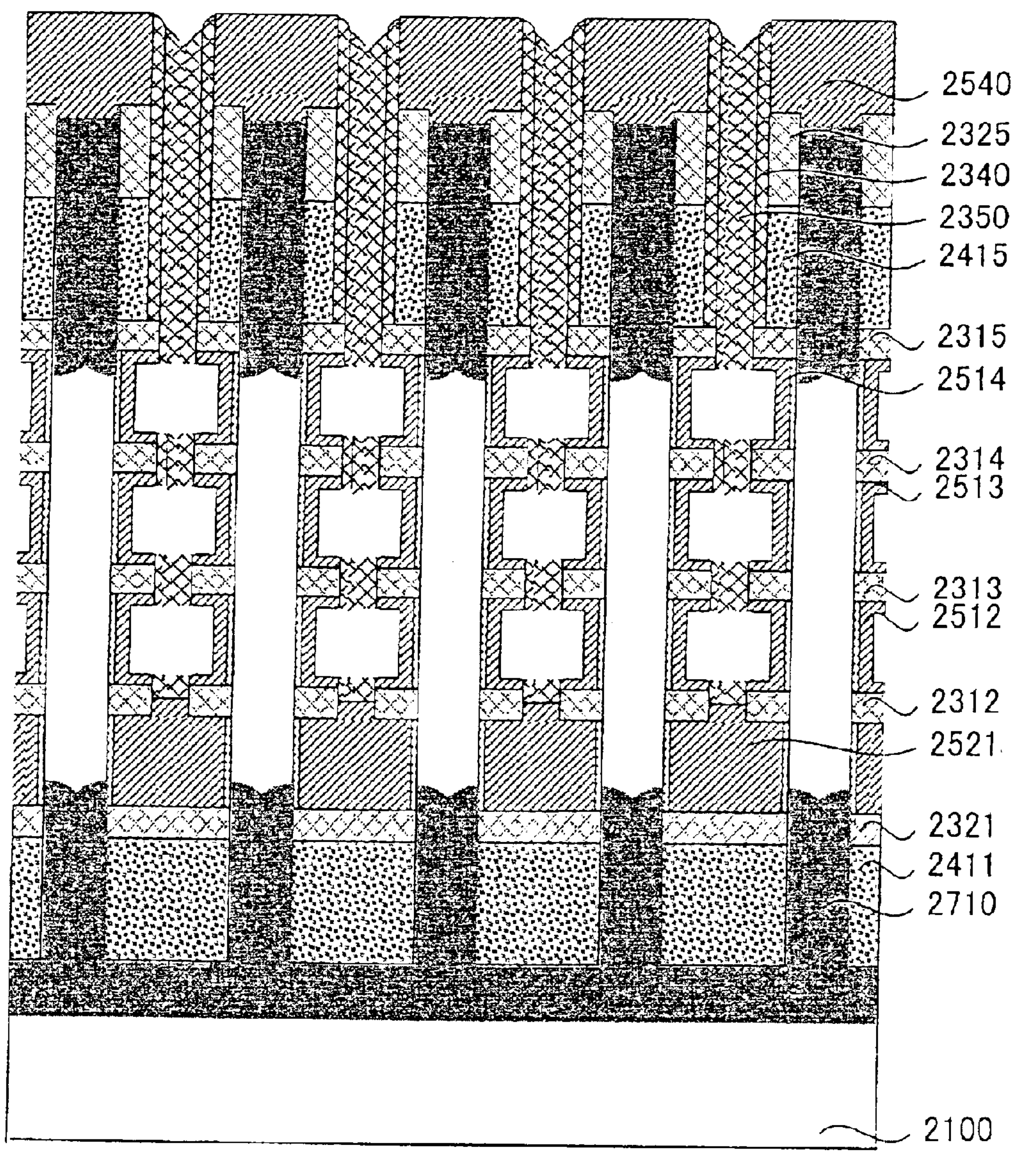
Figure 764:
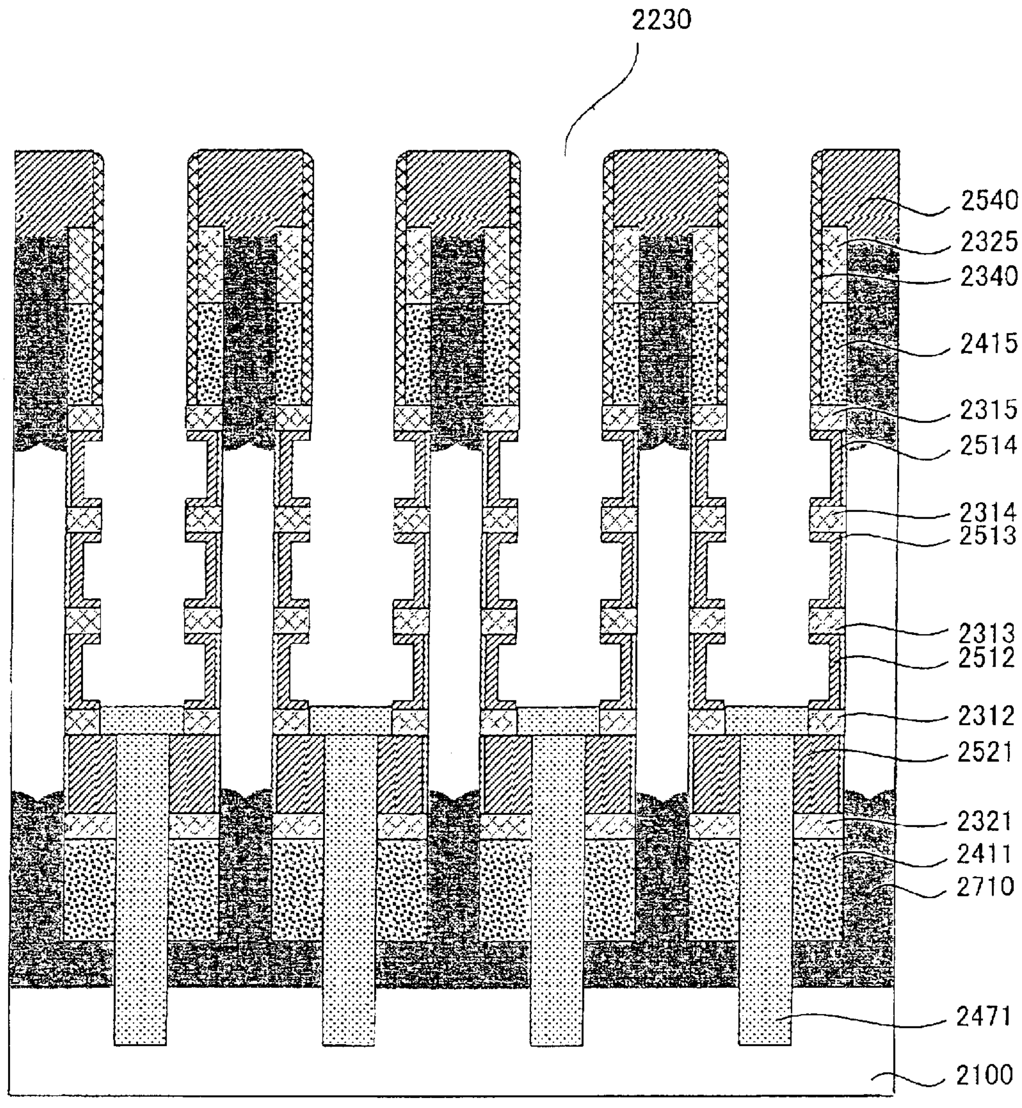

Then, a silicon oxide film 2471, for example, is deposited as an eleventh insulating film to a thickness of about 50 to 500 nm and buried in the second and third trenches 2220 and 2230 by anisotropic or isotropic etching such that the polysilicon film 2521 is embedded (FIGS. 725 and 764). At this time, the depth of the buried silicon oxide film 2471 is so controlled that the silicon nitride film 2312 is partially exposed.

Figure 726:
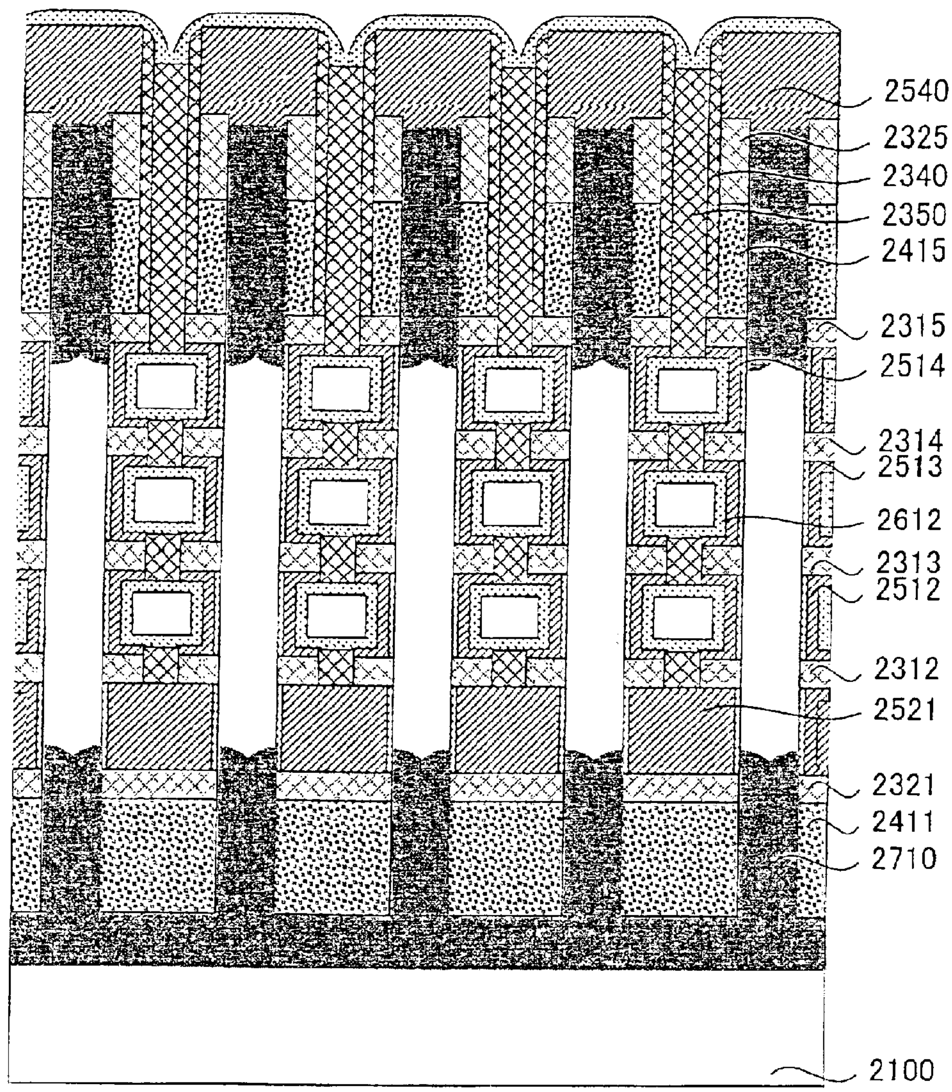
Figure 765:
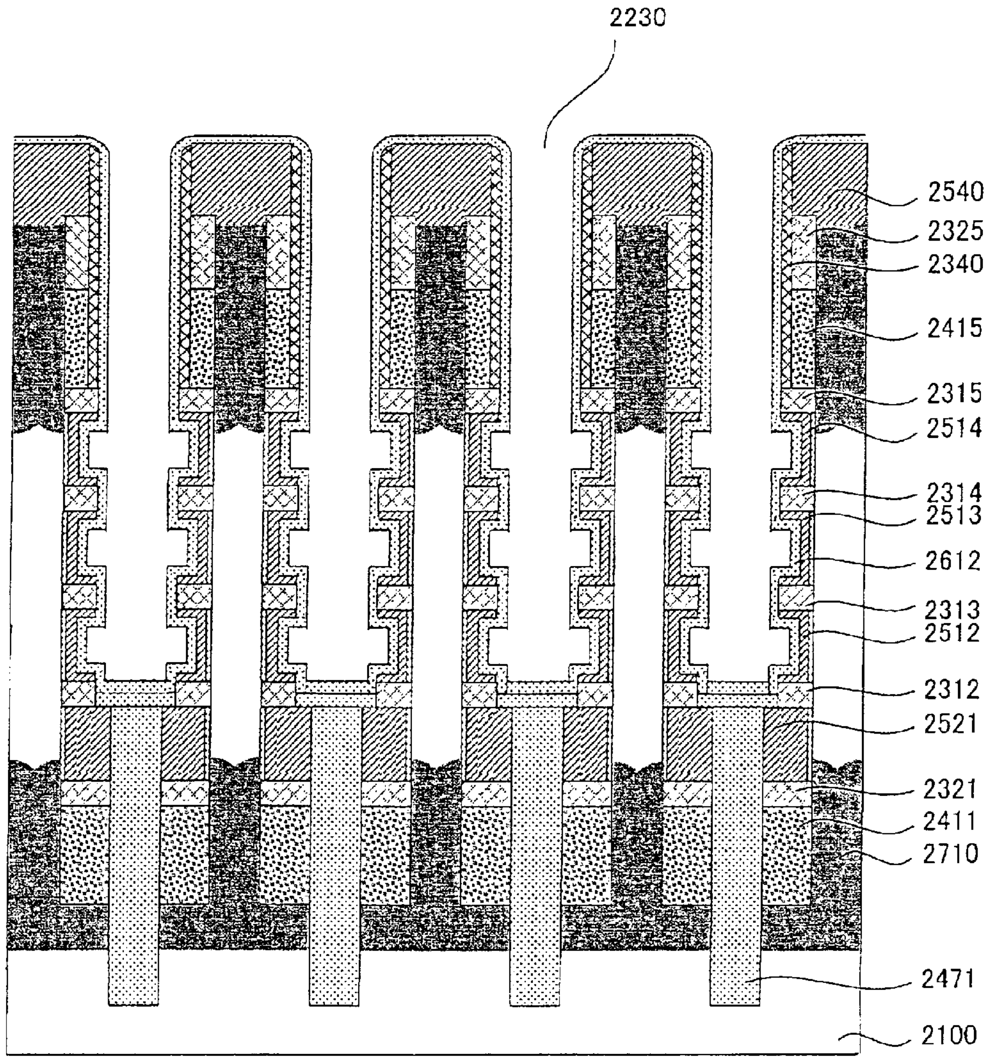

Subsequently, an interlayer insulating film 2612 is formed on exposed surfaces of the polysilicon films 2512 to 2514 (FIG. 726 and FIG. 765). This interlayer insulating film 2612 may be formed of an ONO film, for example. The ONO film may be formed in the same manner as in Production example 1.

Figure 727:
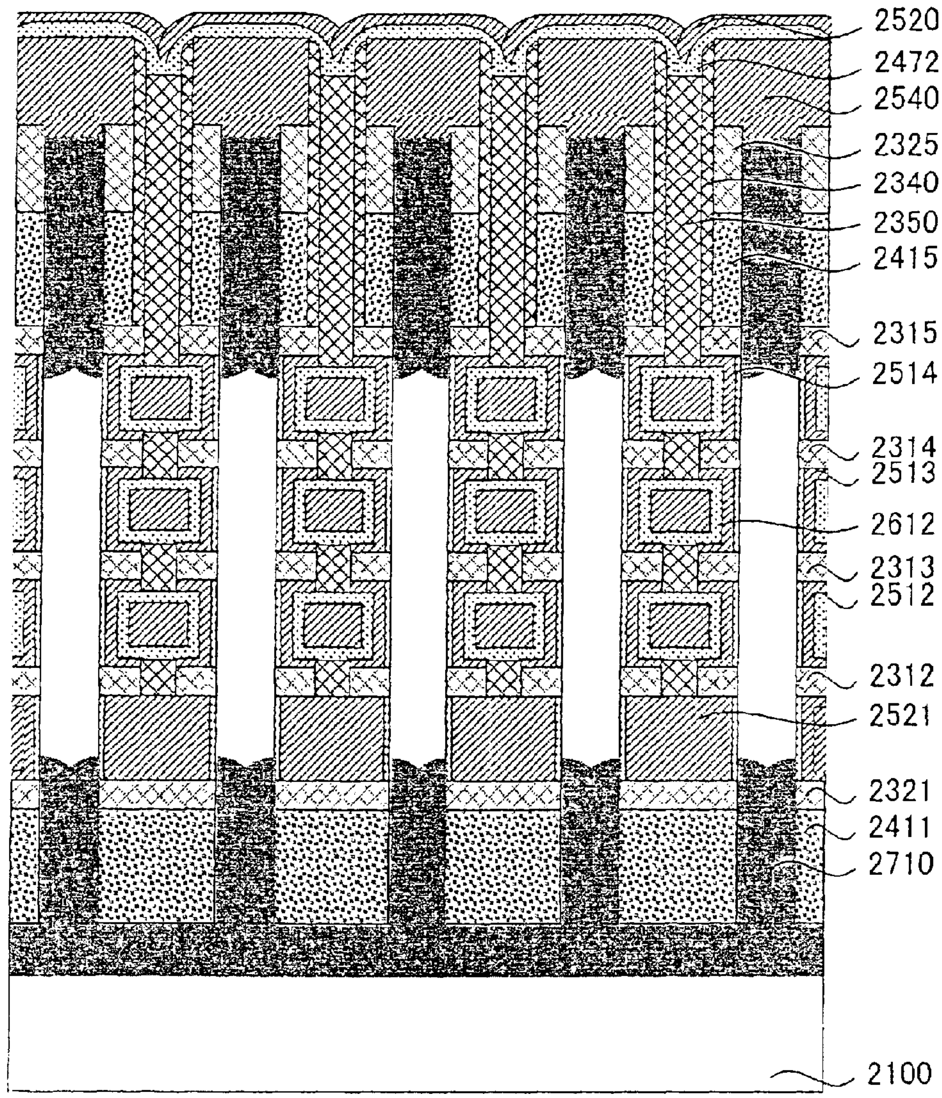
Figure 766:
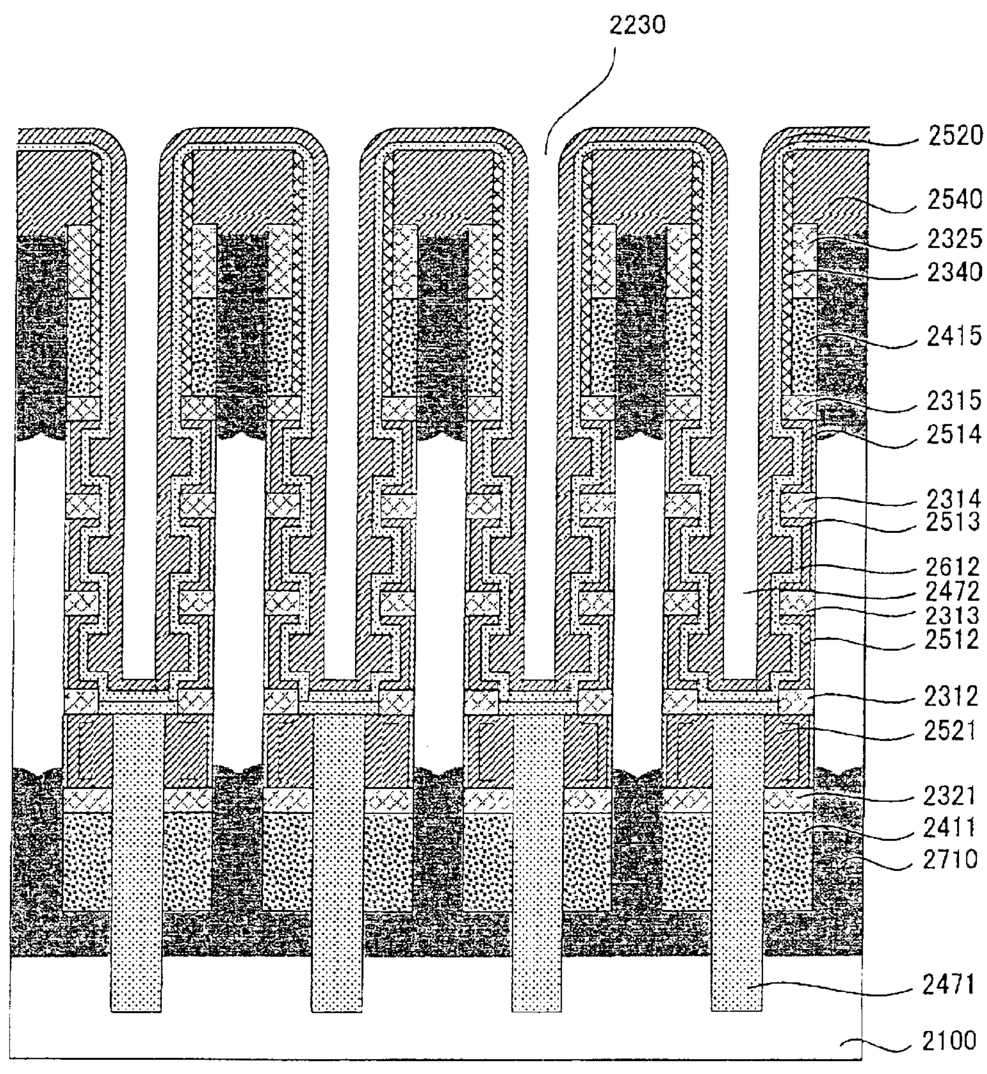

Then, in the same manner, a polysilicon film (a second conductive film) 2520 is deposited to a thickness of 15 to 150 nm (FIGS. 727 and 766).

Figure 728:
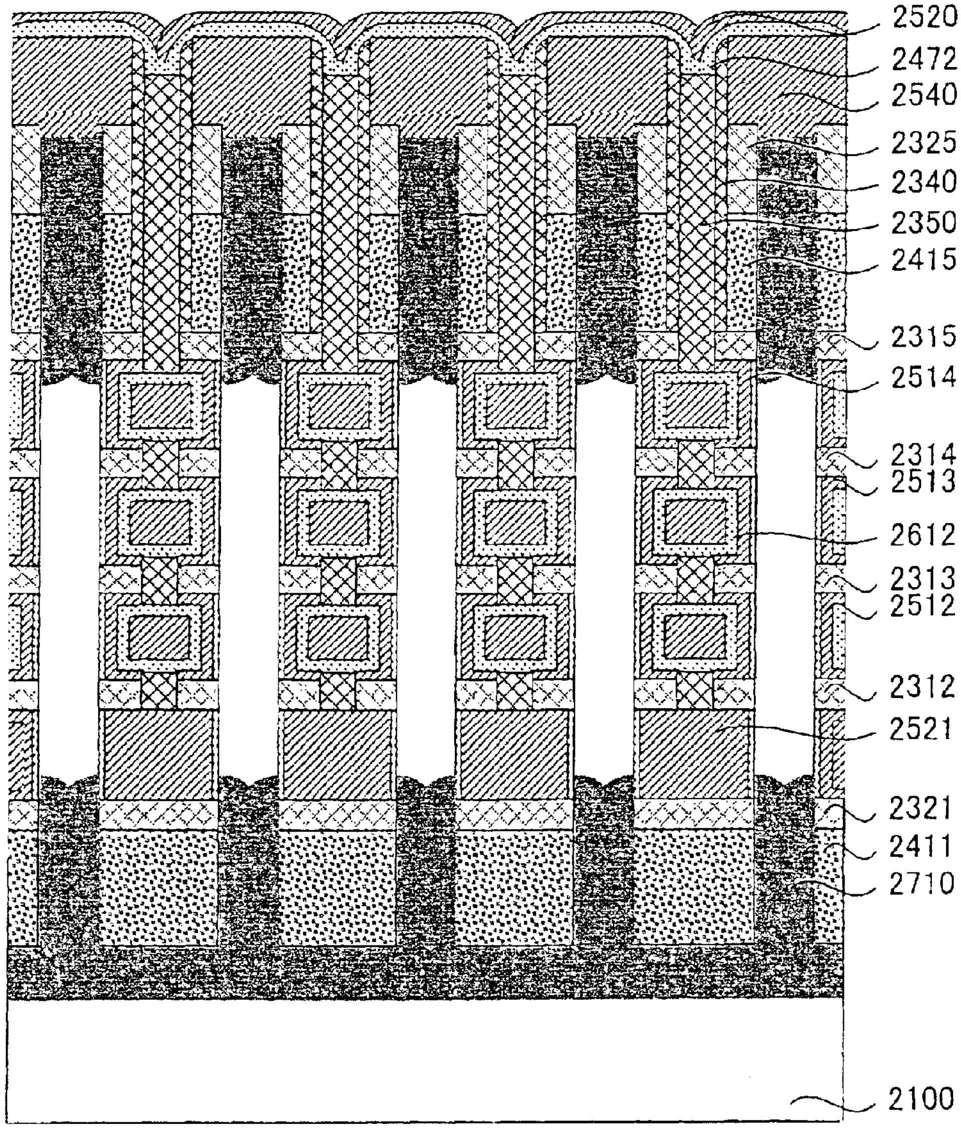
Figure 729:
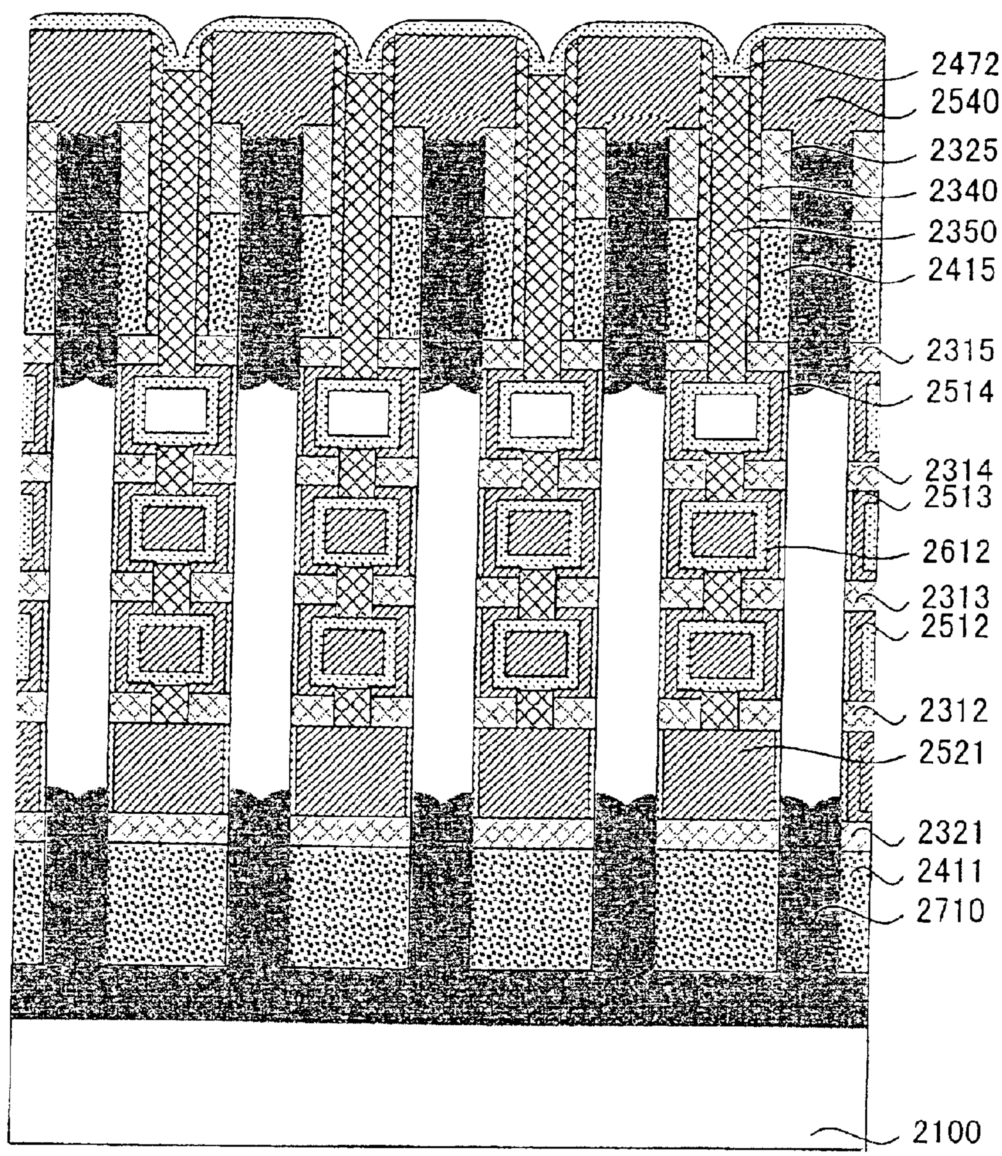
Figure 730:
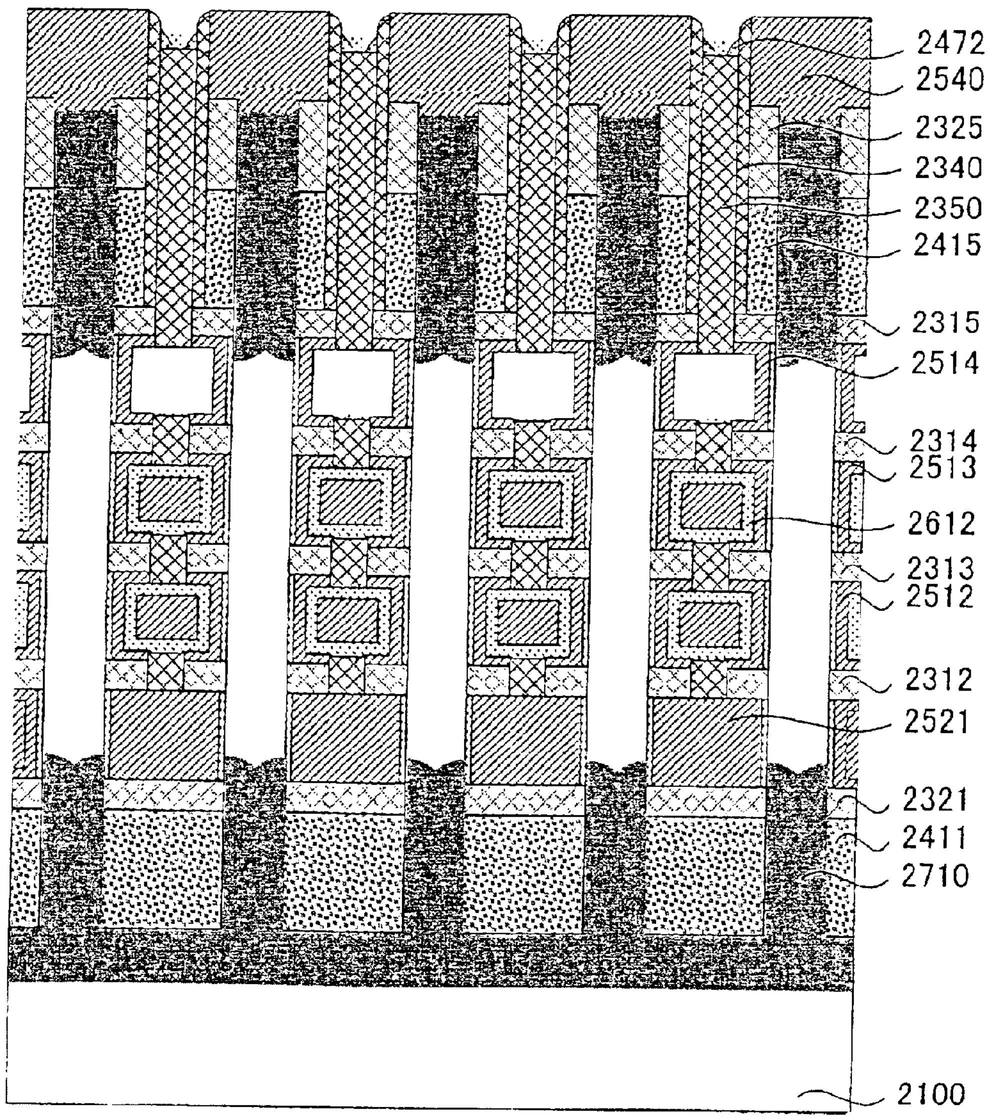
Figure 731:
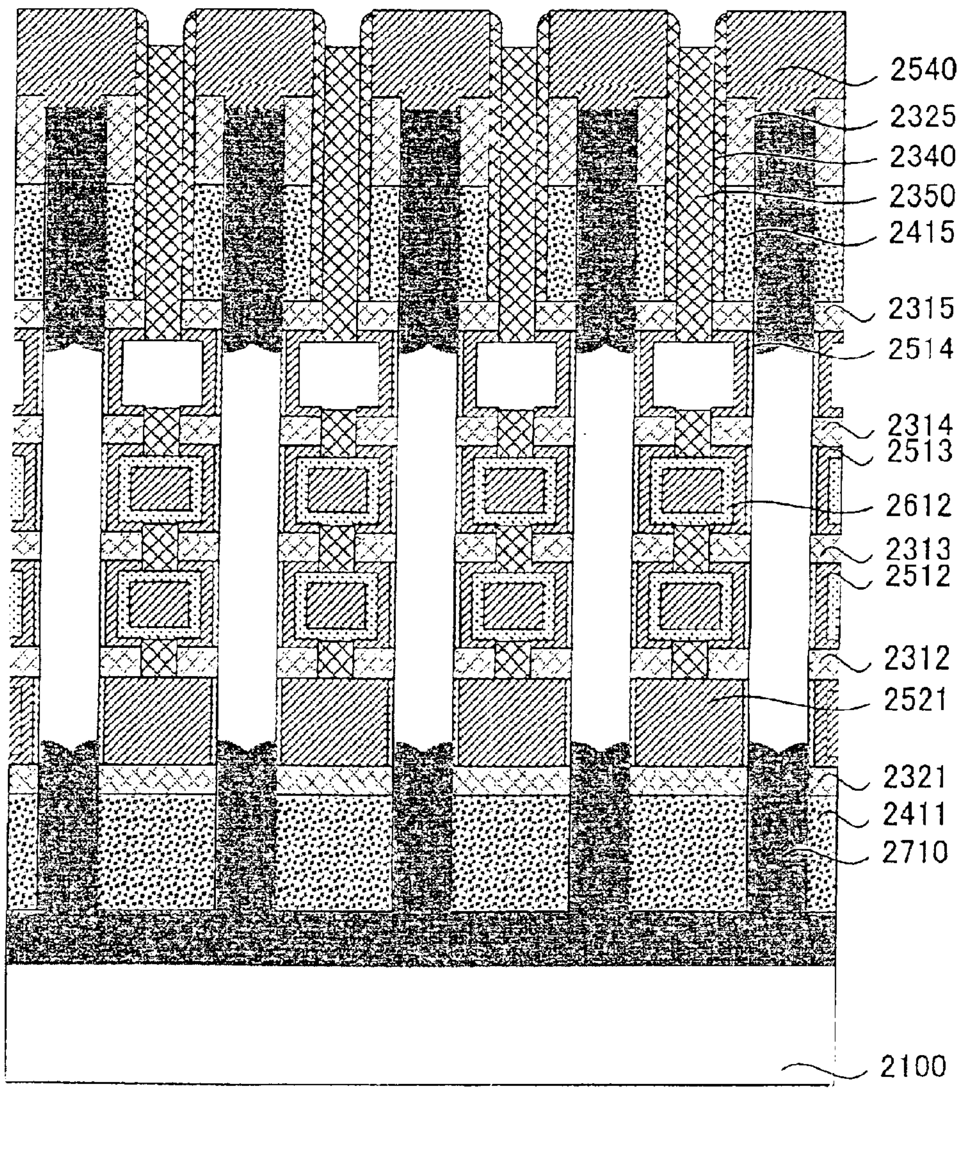
Figure 767:
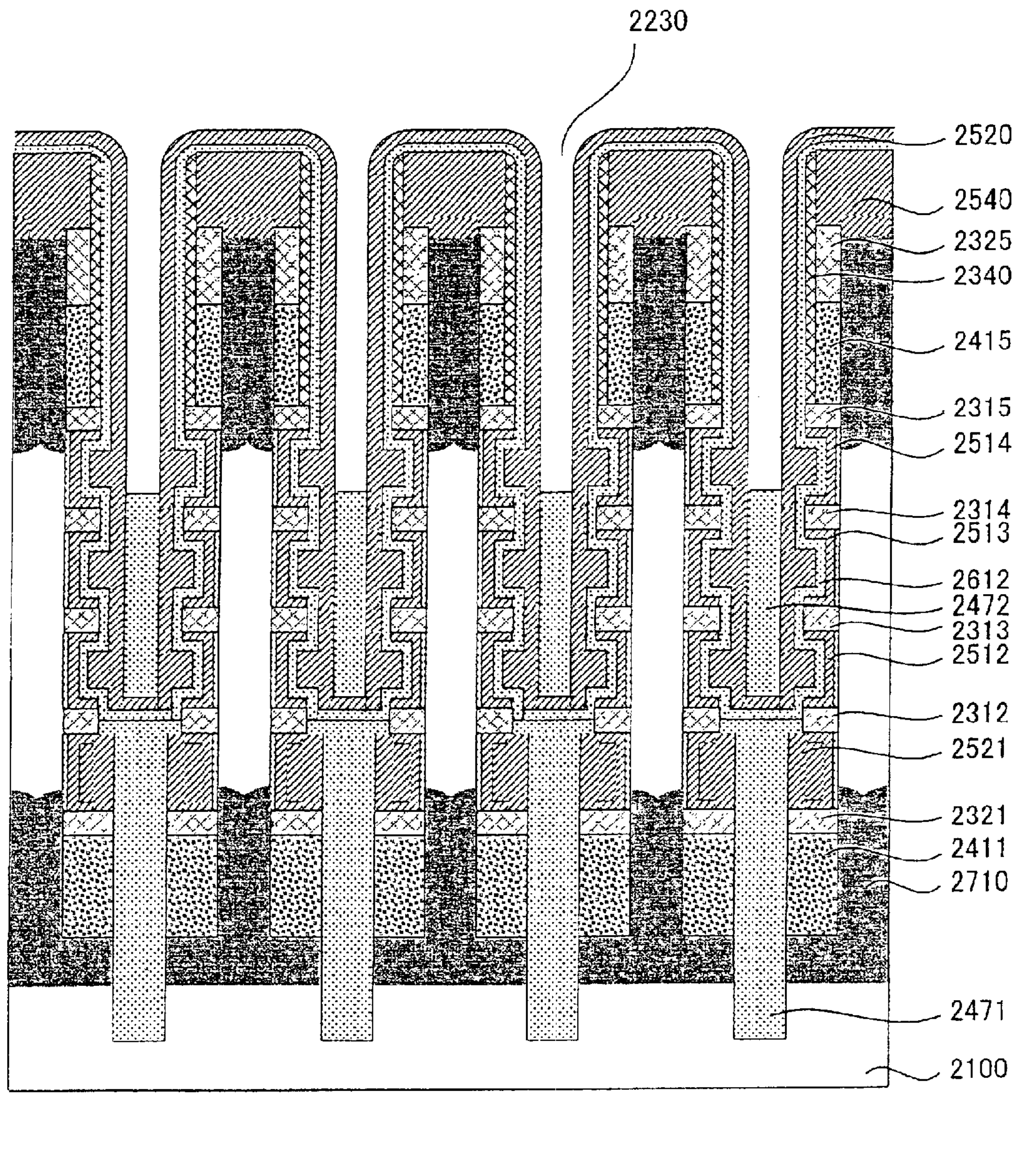
Figure 768:
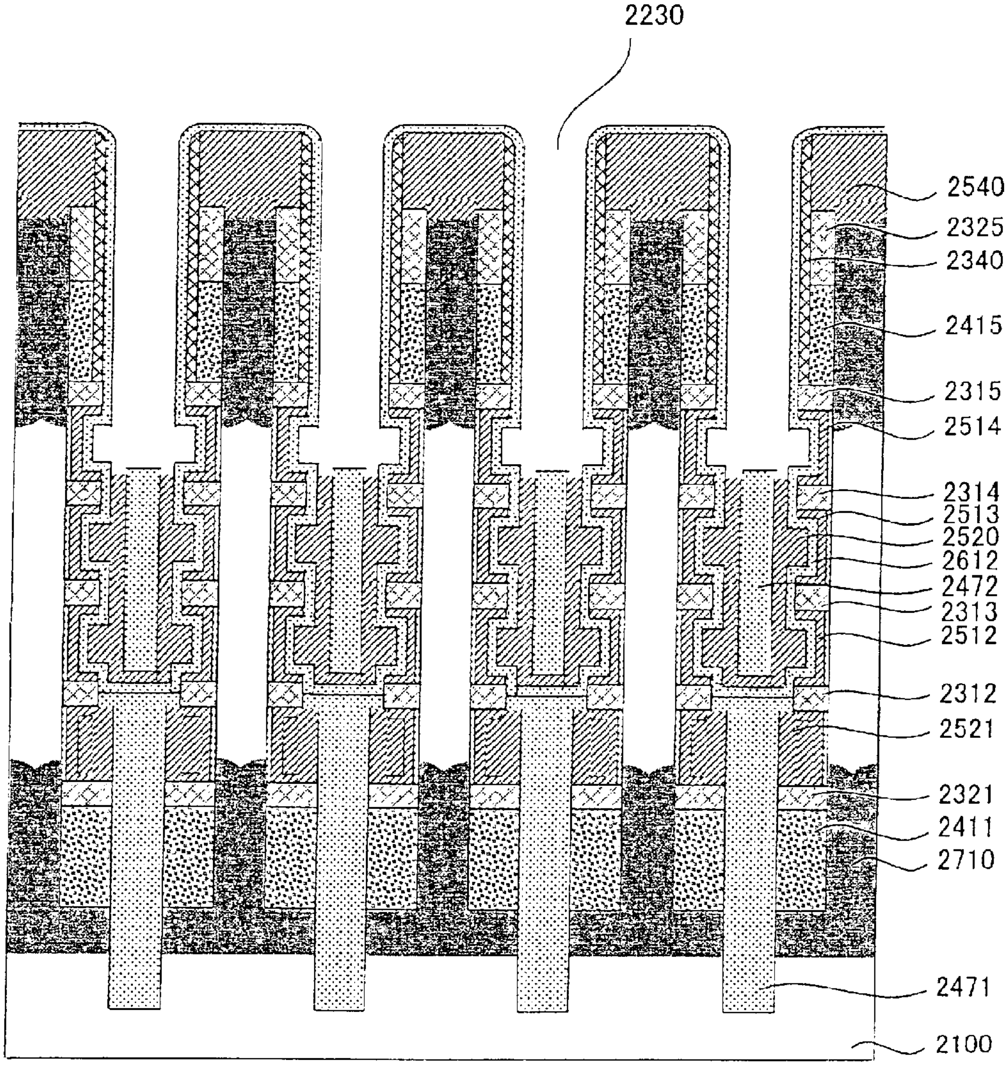
Figure 769:
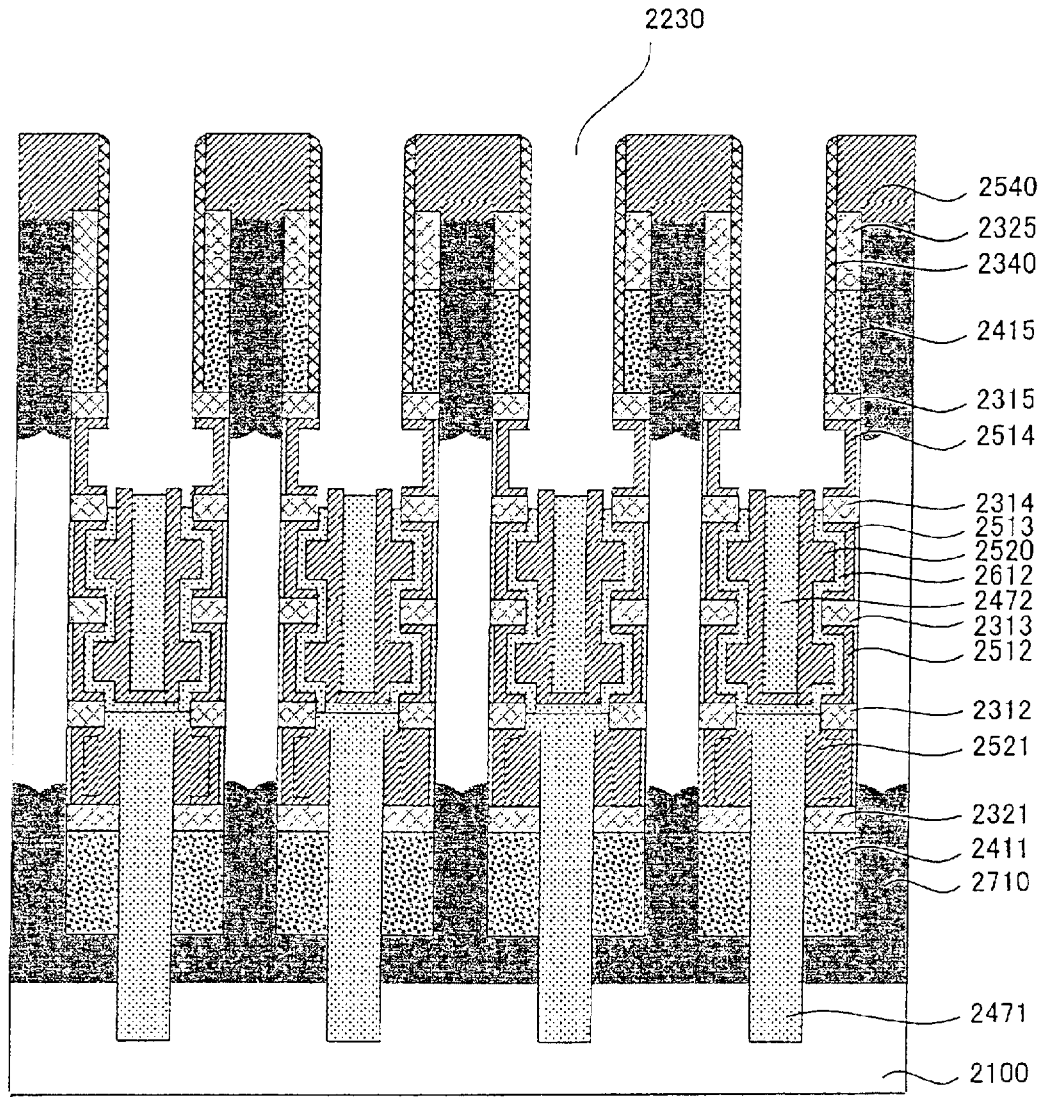
Figure 770:
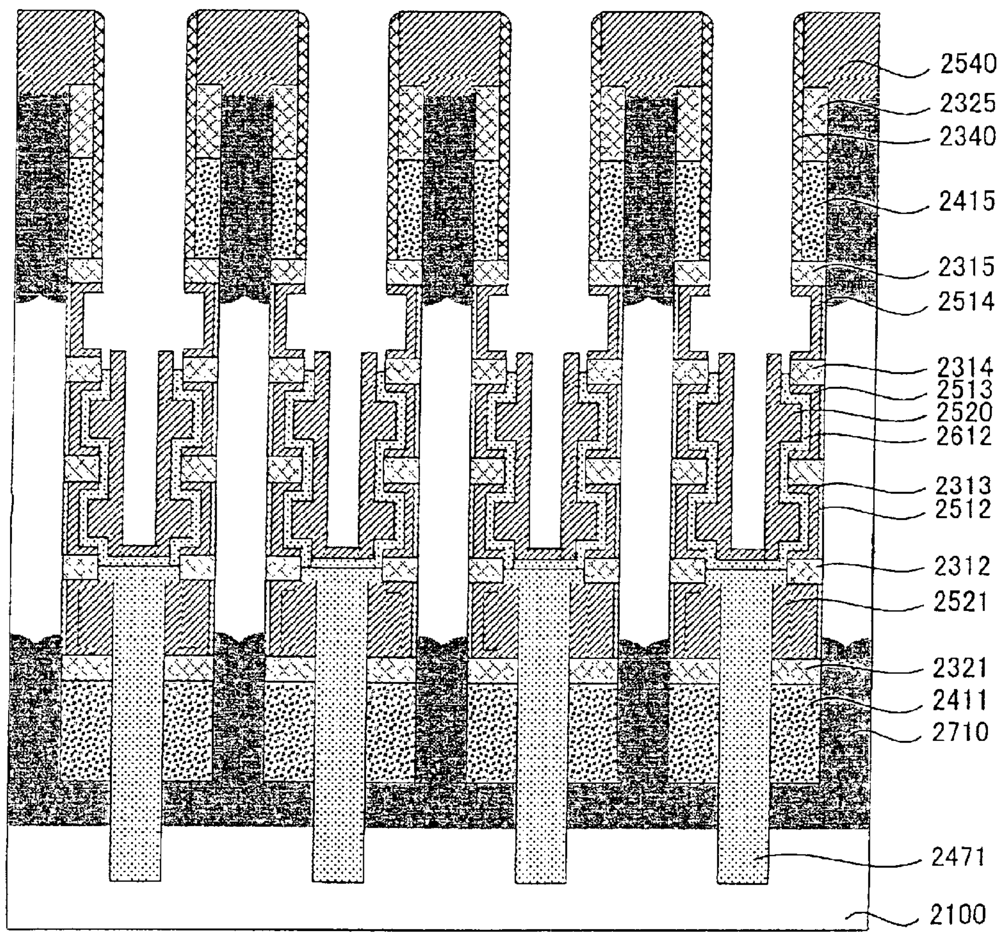

A silicon oxide film 2472 is then deposited as an eleventh insulating film to a thickness of about 50 to 500 nm and buried in the third trench 2230 by anisotropic or isotropic etching such that the polysilicon film 2513 is embedded with intervention of the polysilicon film 2520 and the interlayer insulating film 2612 (FIGS. 728 and 767).

Using the silicon oxide film 2472 as a mask, the polysilicon film 2520 and the interlayer insulating film 2612 are partially removed by isotropic etching to expose the polysilicon film 2514 (FIGS. 729 to 730 and FIGS. 768 to 769).

Figure 732:
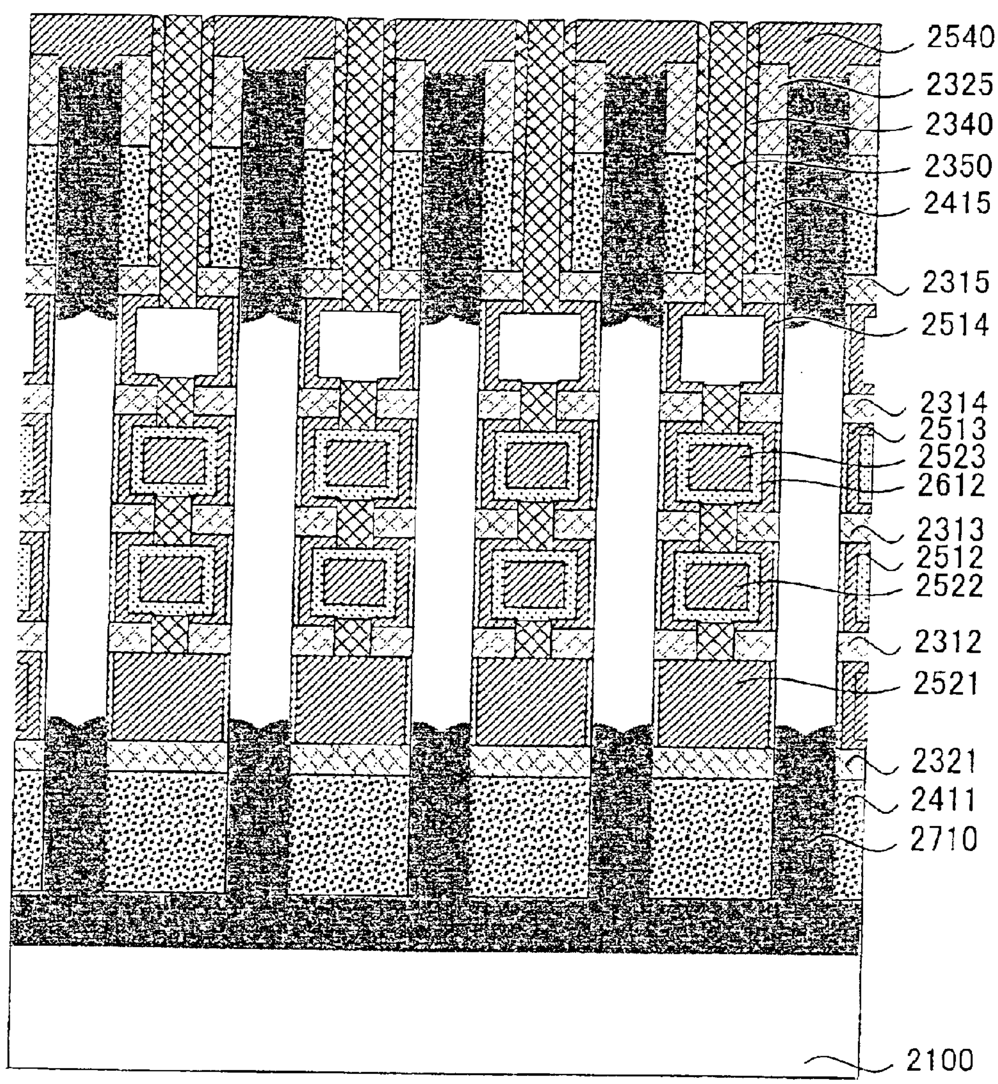
Figure 733:
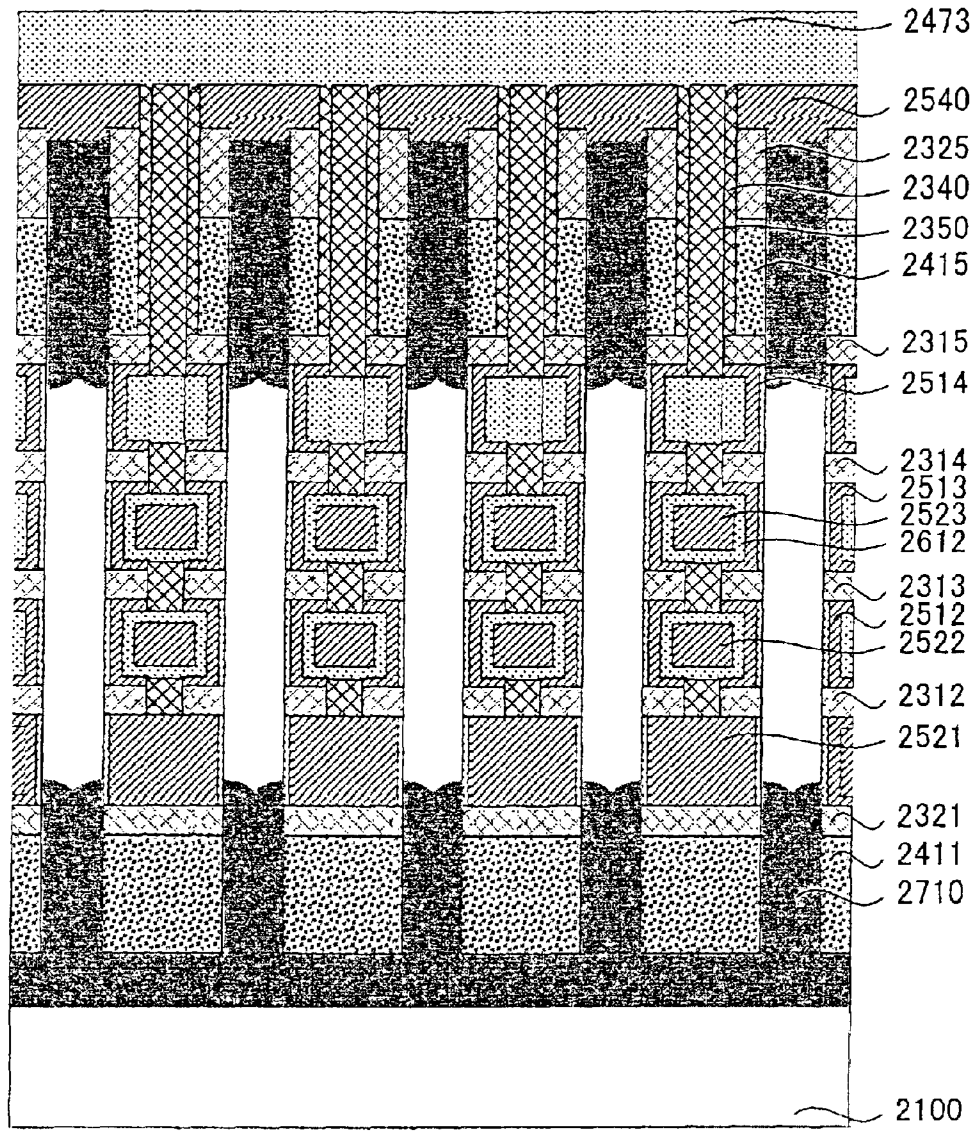
Figure 771:
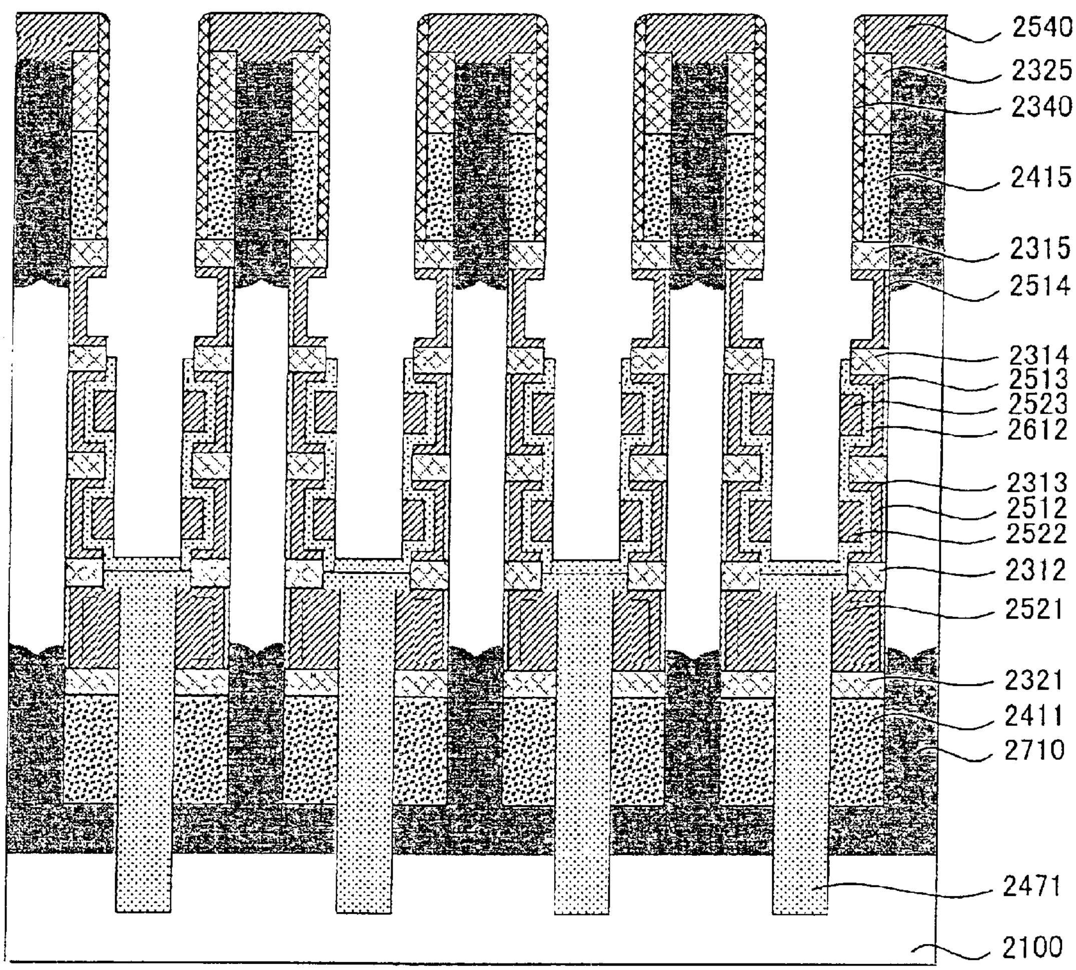
Figure 772:
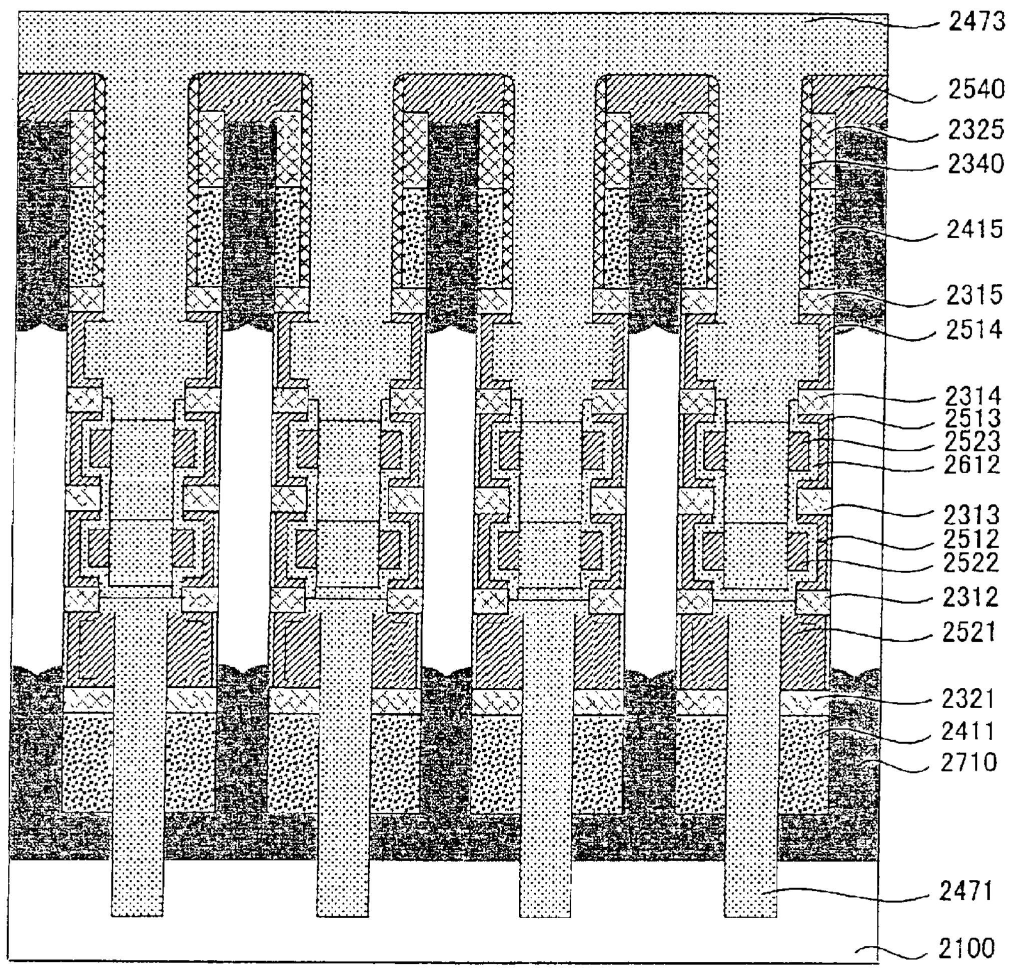

The silicon oxide film 2472 is removed (FIGS. 731 and 770), and then the polysilicon films 2522 and 2523 are divided by anisotropic etching. At this time, since the polysilicon films 2522 and 2523 are defined in advance to be separated by the silicon nitride film 2350, the polysilicon films 2522 and 2523 are simultaneously disposed on the side of the polysilicon film 2512 with intervention of the interlayer insulating film 2612 (FIGS. 732 and 771).

Figure 734:
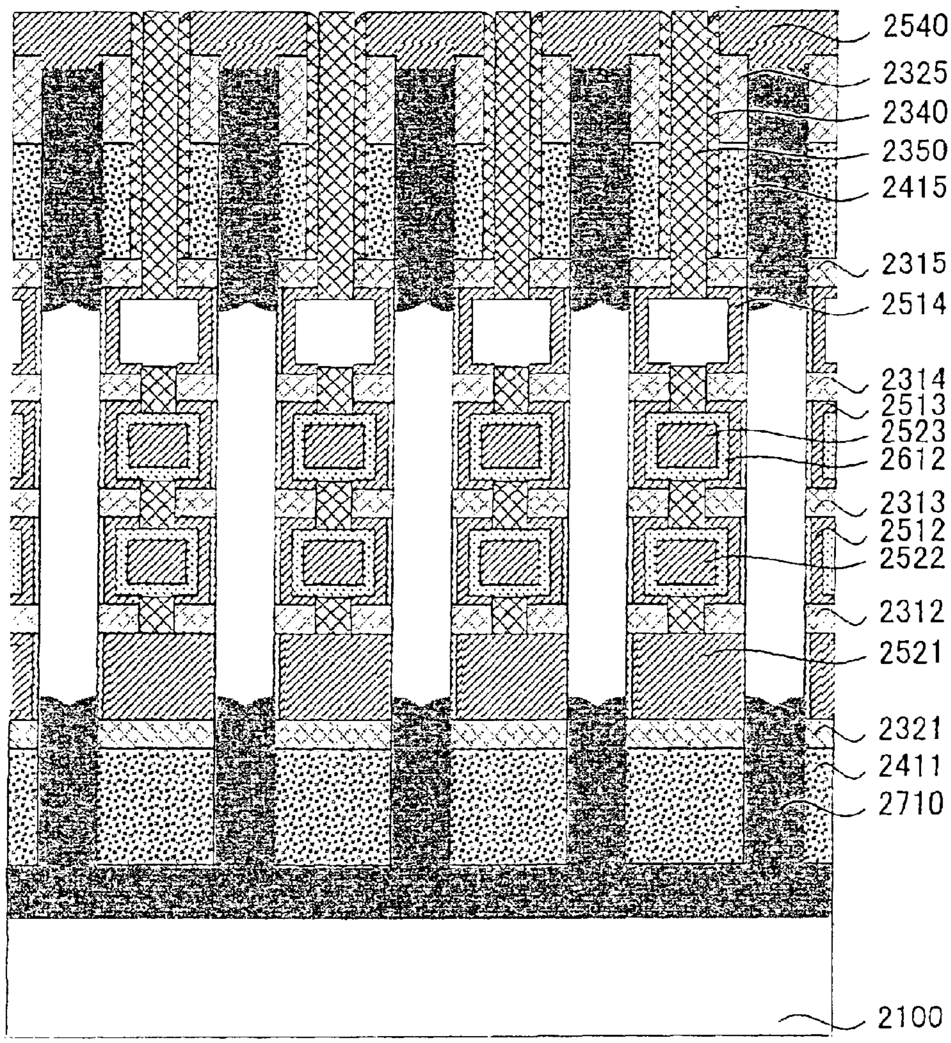
Figure 735:
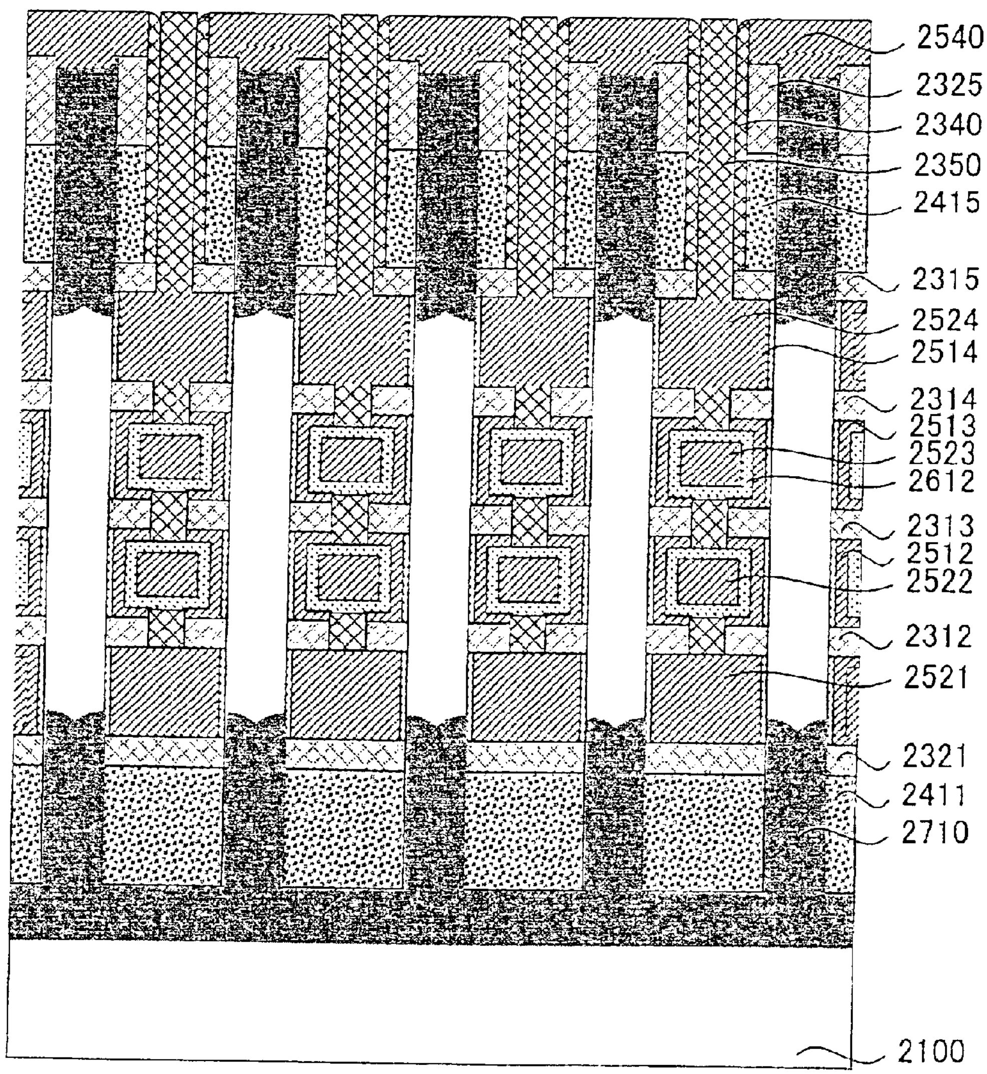
Figure 736:
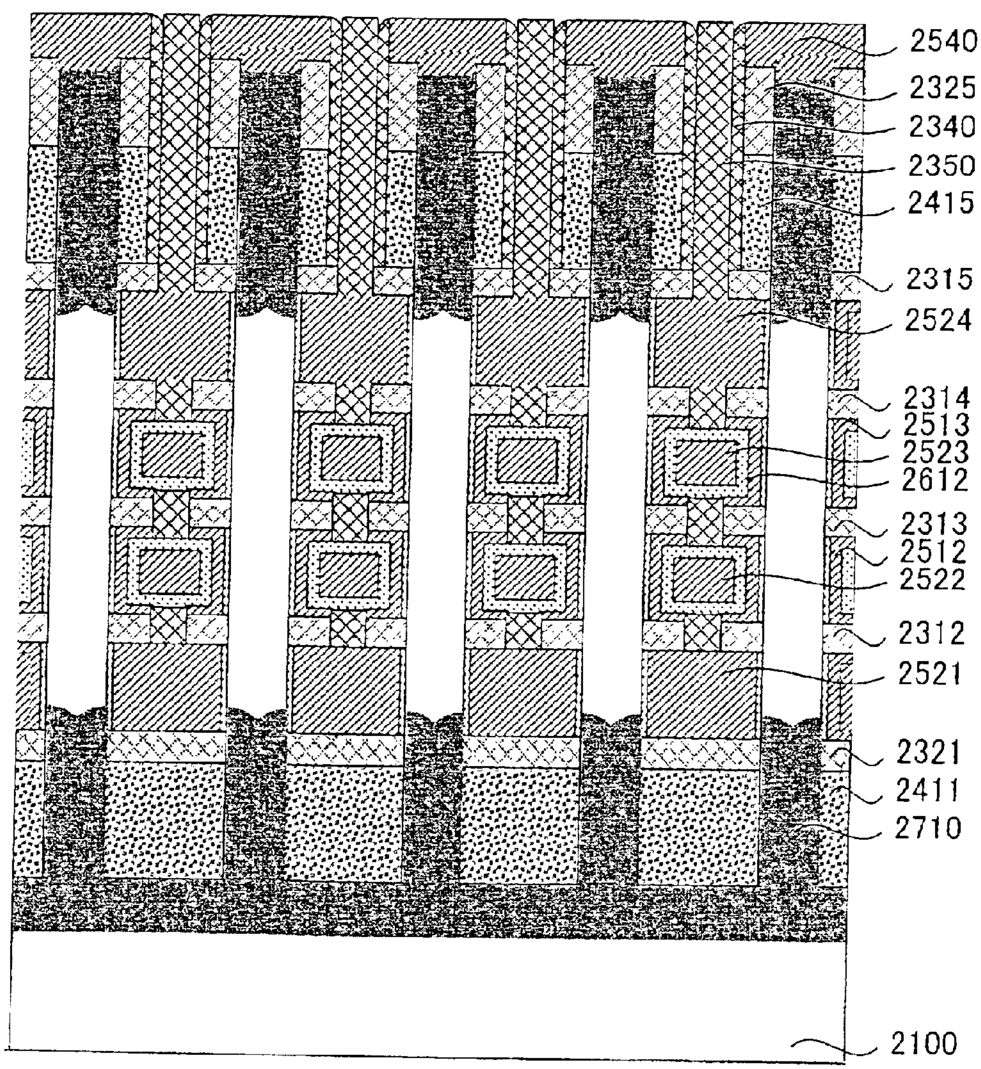
Figure 737:
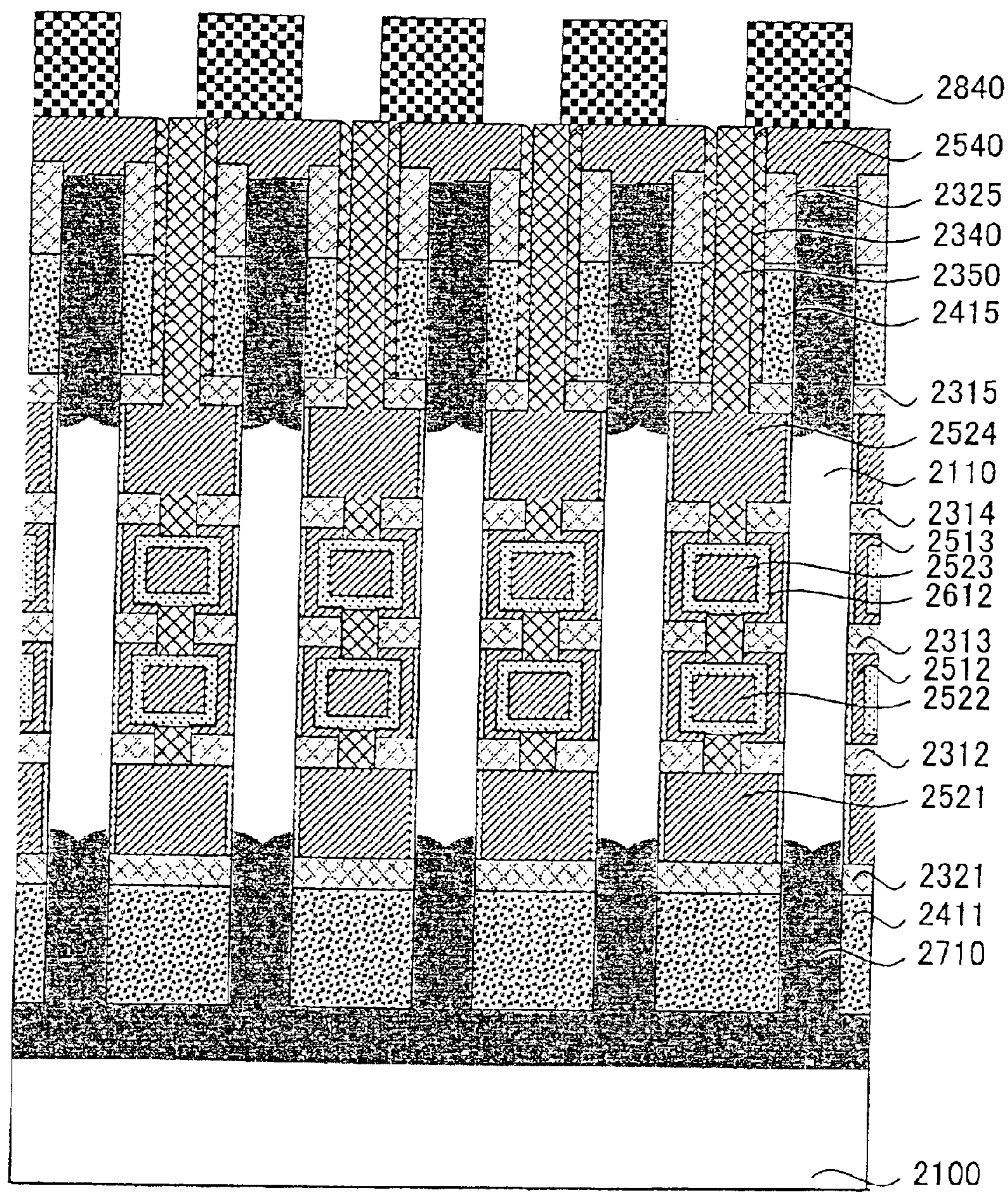
Figure 773:
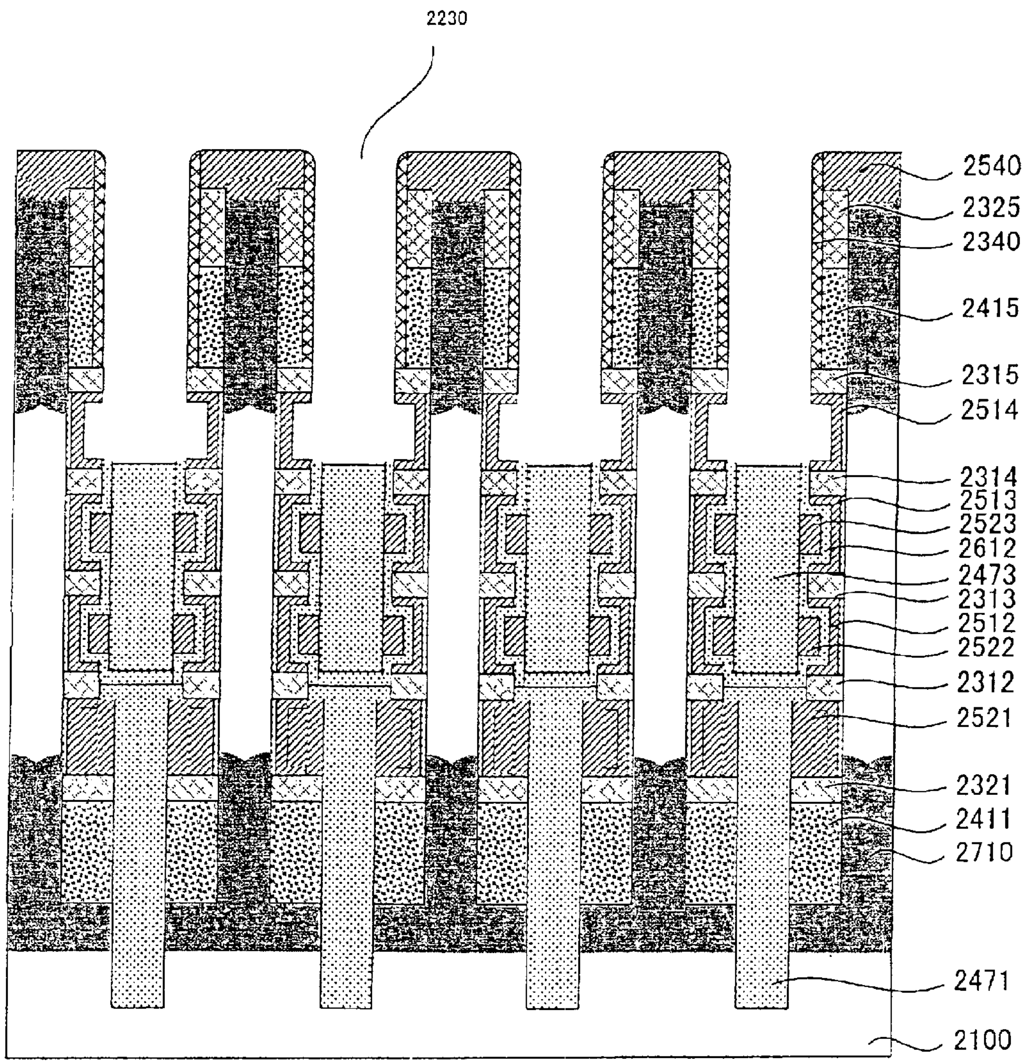
Figure 774:
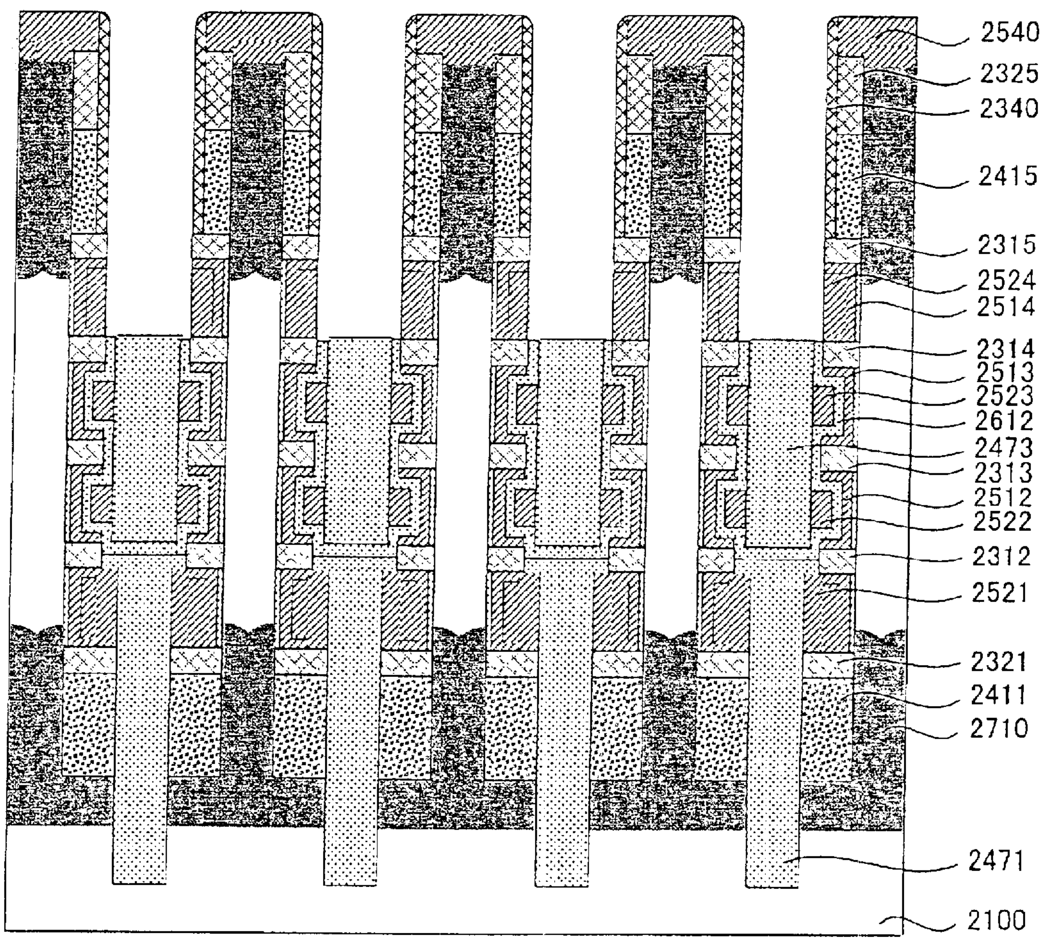
Figure 775:
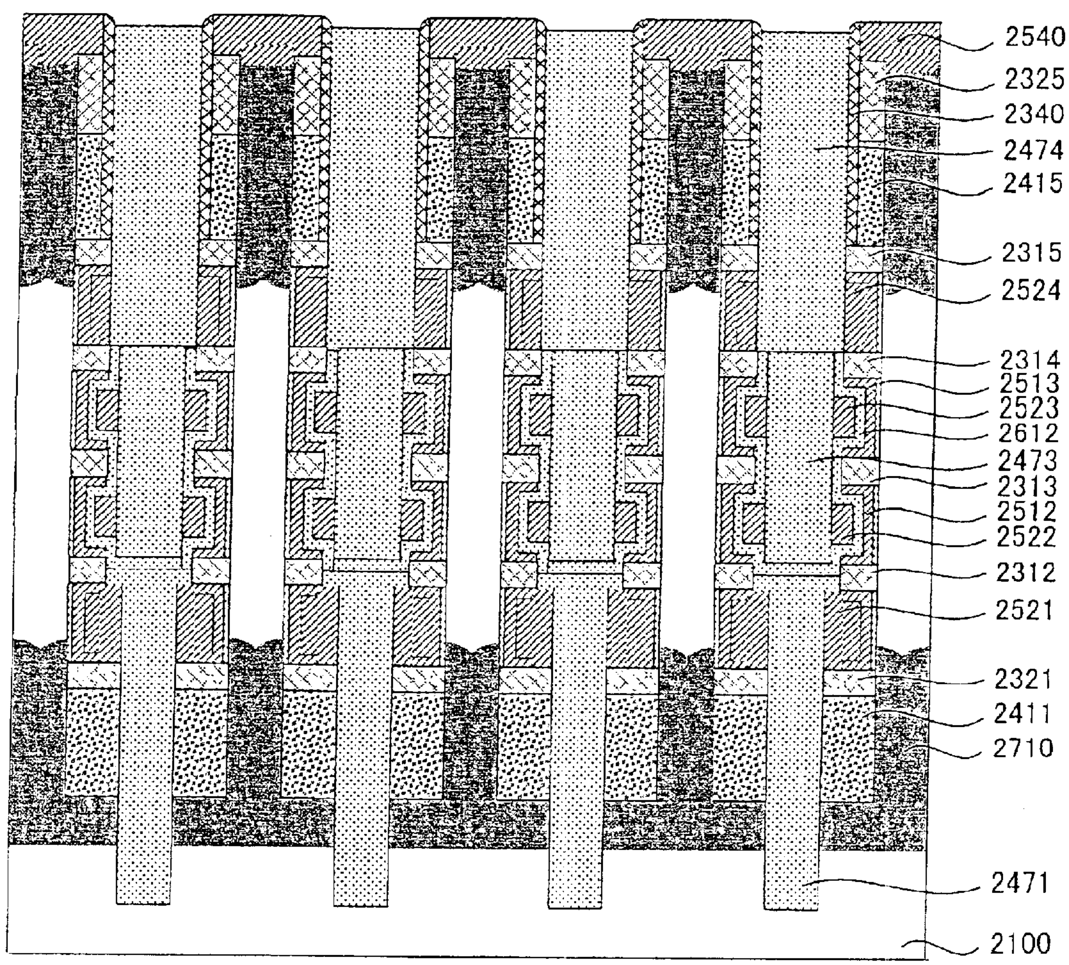
Figure 776:
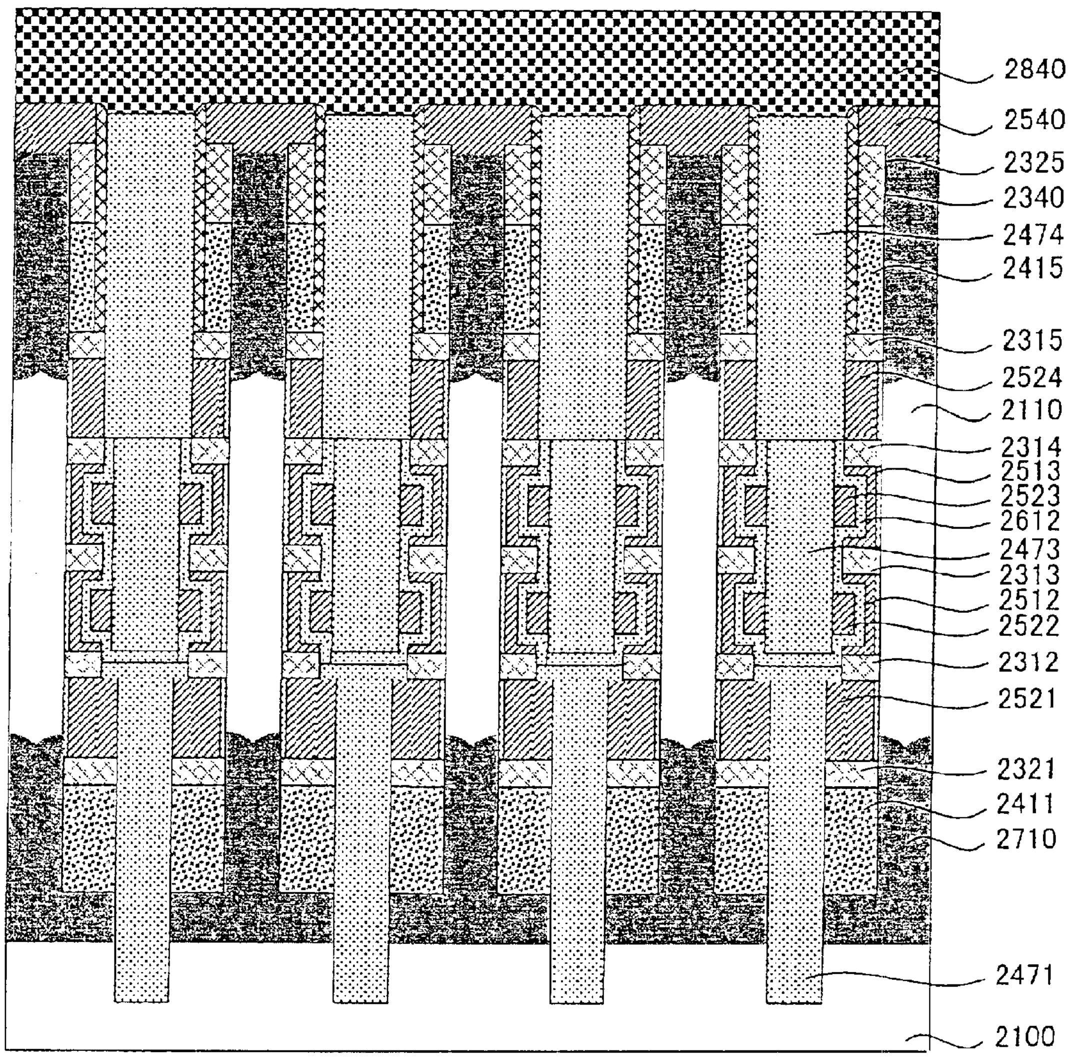

Then, a silicon oxide film 2473 is deposited as an eleventh insulating film to a thickness of about 50 to 500 nm (FIGS. 733 and 772) and buried in the third trench 2230 by anisotropic or isotropic etching such that the polysilicon films 2522 and 2523 are buried (FIGS. 734 and 773). With regard to the polysilicon film 2514 which is the topmost first conductive film, a polysilicon film (a second conductive film) 2524 is etched back to such a degree that the polysilicon film 2524 is able to contact the polysilicon film (the first conductive film) 2514 (FIGS. 735 and 774).

Subsequently, a silicon oxide film 2474 is deposited as an eleventh insulating film to a thickness of 100 to 500 nm on the top of the polysilicon film 2524. The top portion of the polysilicon film 2540 is exposed by etch-back or by CMP. Then a fourth wiring layer is formed so that its direction crosses the direction of the second or third wiring layer and is connected to the top portion of the island-like semiconductor layer 2110.

Thereafter, by known techniques, an interlayer insulating film is formed, and a contact hole and metal wiring are formed.

Thereby, a semiconductor memory is realized which has a memory function according to the state of a charge in the charge storage layer which is the floating gate made of the polysilicon film (the first conductive film).

In this example, films formed on the surface of the semiconductor substrate or the polysilicon film such as the silicon nitride film (the sixth insulating film) 2340 and the silicon nitride film (the twelfth insulating film) 2350 may be formed of a layered film of a silicon oxide film/a silicon nitride film from the silicon surface.

With regard to the polysilicon films 2510 or 2511 to 2514 (the first conductive films), the polysilicon films 2520 or 2521 to 2524 (the second conductive films) and the polysilicon film 2540 (the fourth conductive film), impurity introduction may be carried out during or after the formation of the polysilicon films or after the separation of the polysilicon films. The timing of the impurity introduction to the polysilicon films is not particularly limited so long as these films become conductive films.

In the example, the control gates of the memory cells are formed continuously in one direction without using a mask. Further, by providing the selection gates in the top and the bottom of a set of memory cells, it is possible to prevent the phenomenon that a memory cell transistor is over-erased.

PRODUCTION EXAMPLE 34

In an example of production process for producing a semiconductor memory in which regions for forming the charge storage layers are defined in advance by a laminated film comprising plural films, explanation is given of an example of production process for obtaining a structure in which the wiring layers are separated through patterning with use of resist films by photolithography.

Such a semiconductor memory may be produced by the following production process. FIGS. 777 to 783 and FIGS. 784 to 790 are sectional views taken on line A-A' and line B-B', respectively, in FIG. 1 which is a plan view illustrating an EEPROM memory cell array.

First, a silicon nitride film 2350, for example, is deposited as a twelfth insulating film to a thickness of 5 to 50 nm on the surfaces of the polysilicon films 2512 to 2514 (the first conductive films), the silicon nitride films 2340, 2342, 2343 and 2344 (the sixth insulating films) and the silicon oxide film 2470 (the eleventh insulating film) which are present on the inner wall of the third trench 2230. The silicon nitride film 2350 is etched back, for example, by anisotropic etching into the form of a sidewall spacer.

Production steps thereafter are the same as those in Production example 11 (FIGS. 304 to 325 and FIGS. 337 to 358) until the silicon oxide film 2470 is etched back, for example, by isotropic etching to such a degree that the side of the polysilicon film 2511 (the first conductive film) is exposed.

Figure 777:
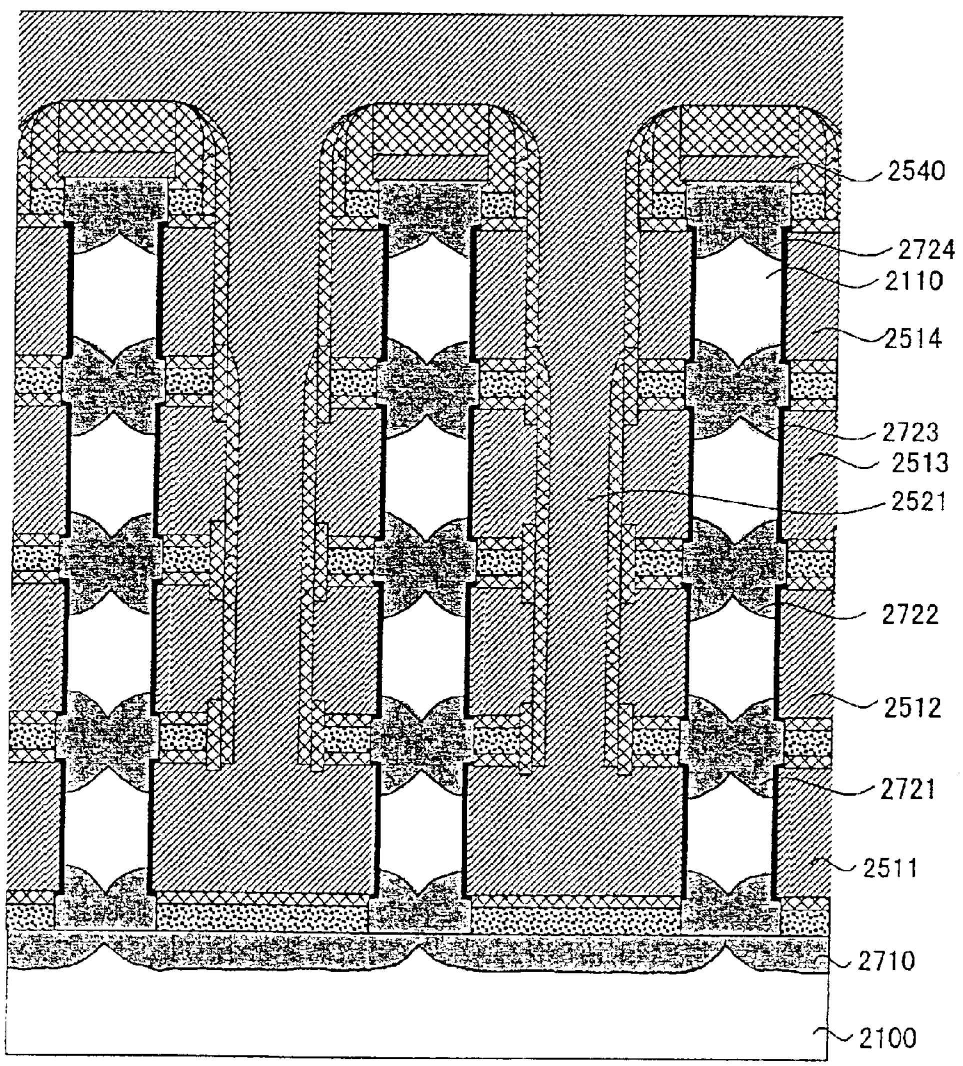
Figure 784:
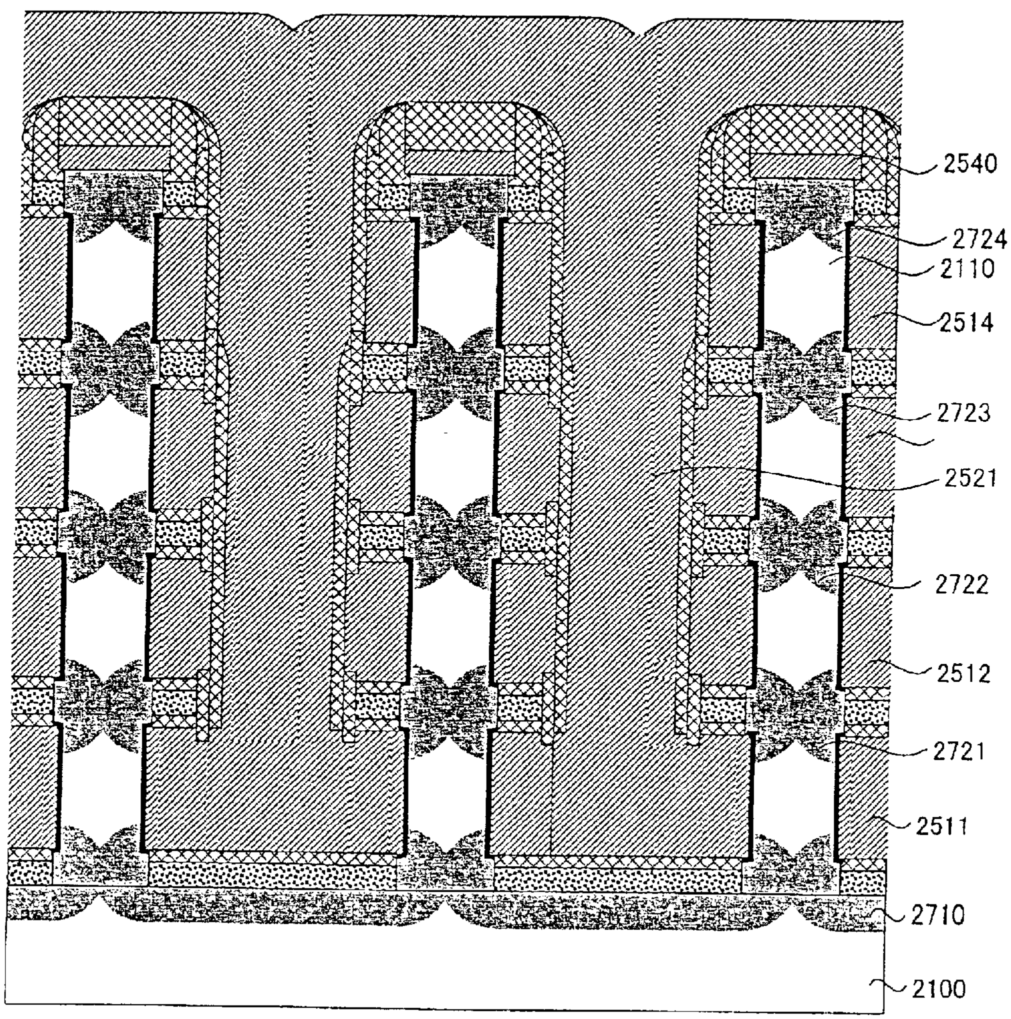

Then, a polysilicon film 2521, for example, is deposited to a thickness of 30 to 300 nm as a second conductive film (FIGS. 777 and 784).

Figure 778:
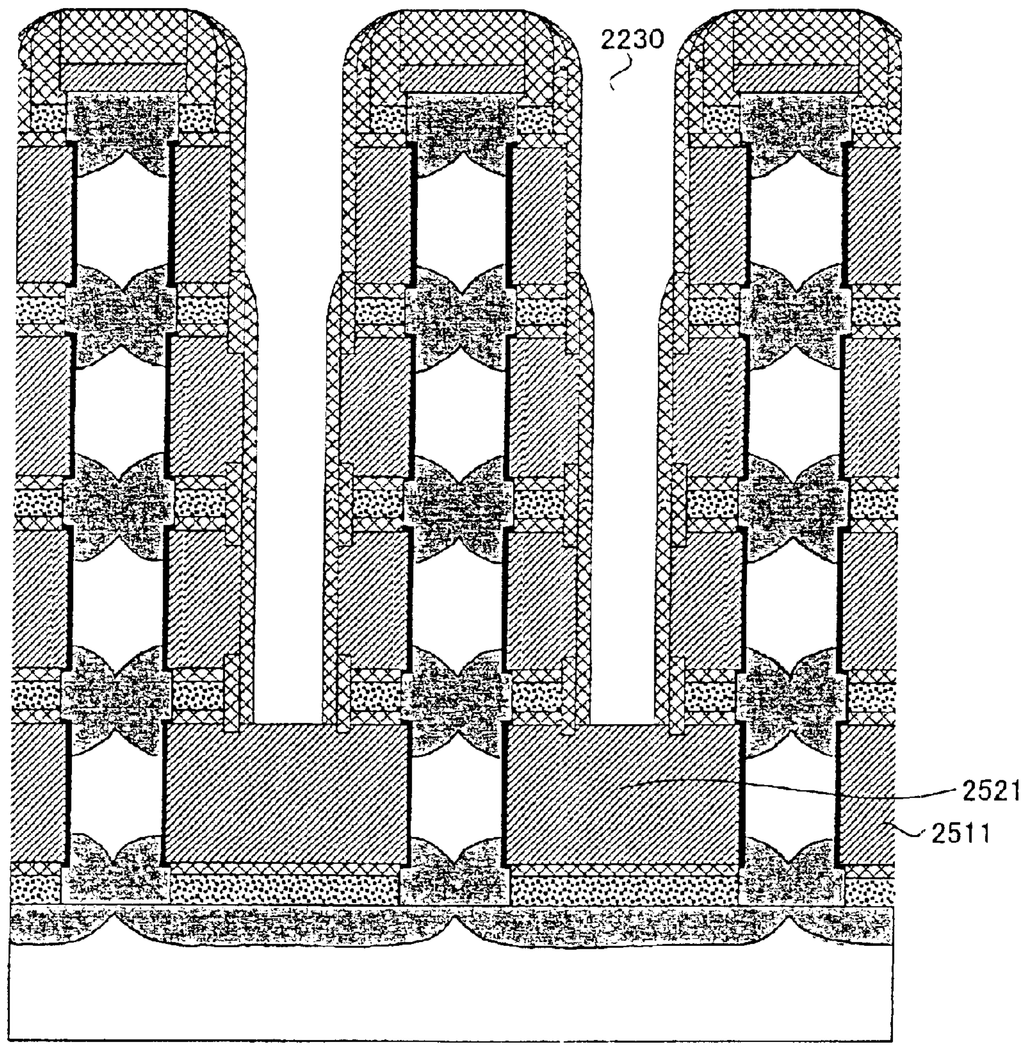
Figure 785:
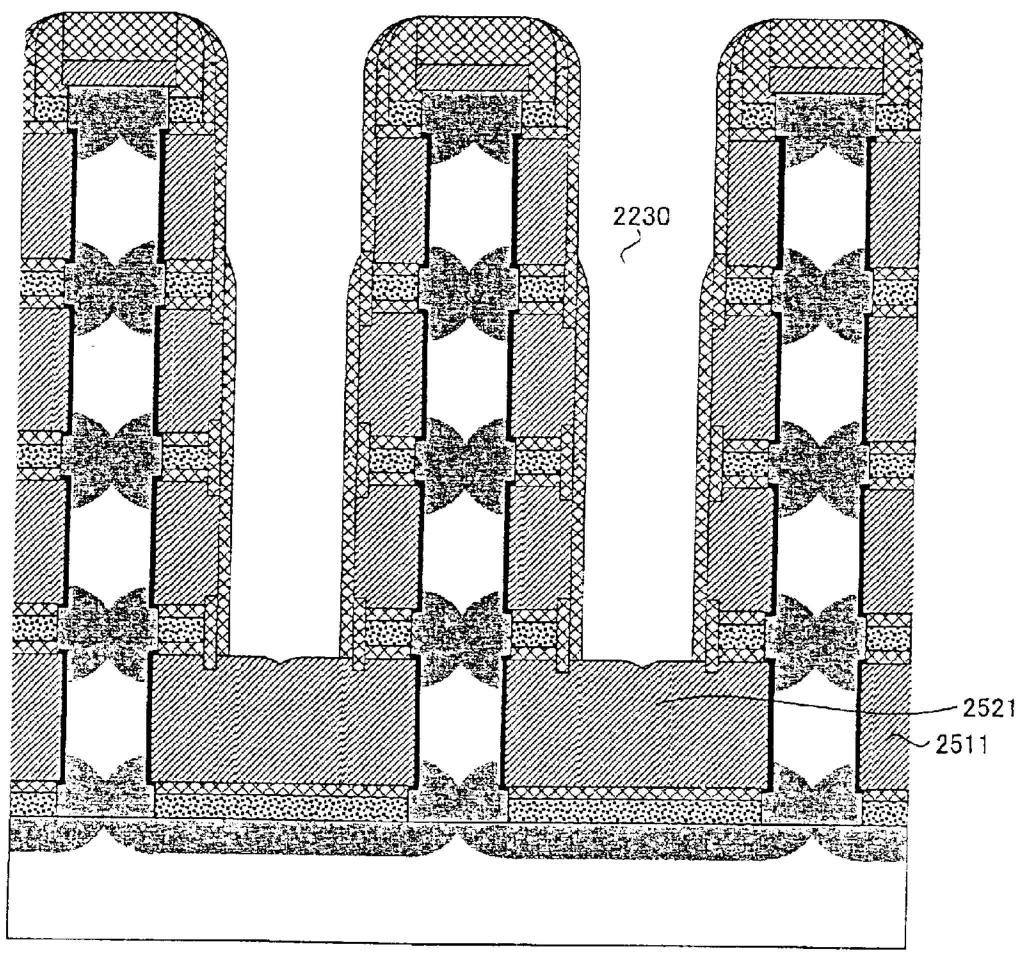

Subsequently, the polysilicon film 2521 is etched back anisotropically to such a degree that the polysilicon film 2521 is able to contact the polysilicon film 2511 to form a selection gate (FIGS. 778 and 785).

Then, the sidewall spacer made of the silicon nitride film (the twelfth insulating film) 2350 is removed by isotropic etching and a silicon oxide film 2471, for example, is deposited to a thickness of about 50 to 500 nm as an eleventh insulating film.

The silicon oxide film 2471 is buried in the third trench 2230 by anisotropic or isotropic etching such that the polysilicon film 2521 (the second conductive film) is buried. At this time, the depth of the buried silicon oxide film 2471 is so controlled that the silicon nitride film 2342 is partially exposed.

Subsequently, an interlayer insulating film 2612 is formed on the exposed surfaces of the polysilicon films 2512 to 2514. This interlayer insulating film 2612 may be formed of an ONO film, for example. The ONO film may be formed in the same manner as in Production example 1.

Figure 779:
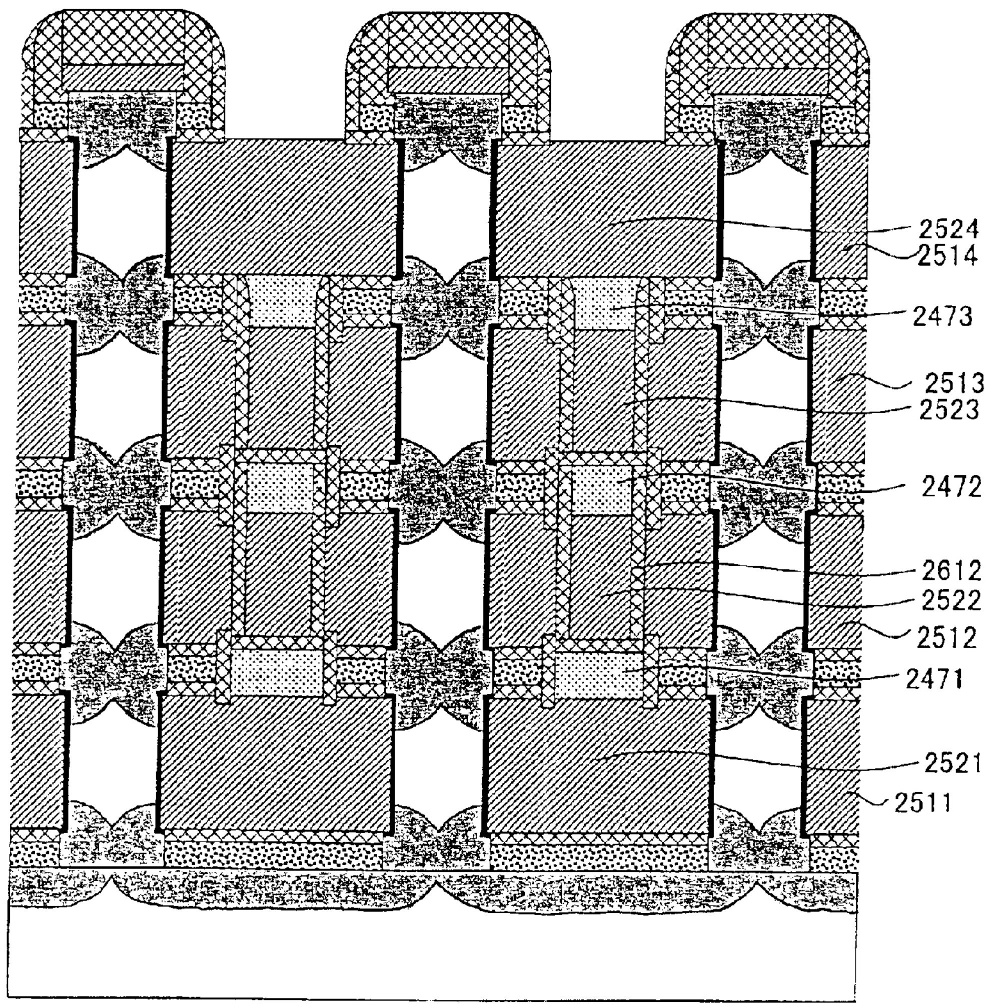
Figure 786:
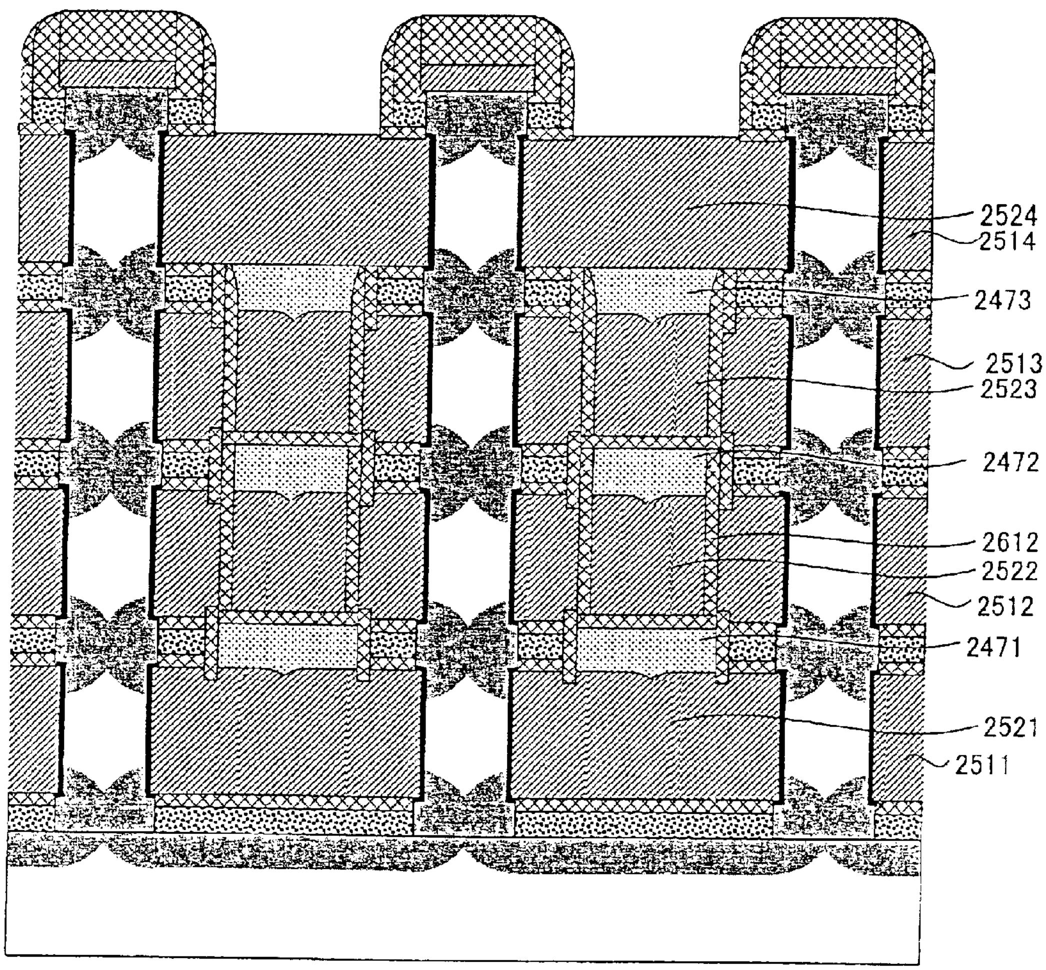

Subsequently, in the same manner, a polysilicon film 2522 is deposited as a second conductive film to a thickness of 30 to 300 nm and etched back so that the polysilicon film 2522 is disposed on the side of the polysilicon film (the first conductive film) 2512 with intervention of the interlayer insulating film 2612. By repeating likewise, a polysilicon film (a second conductive film) 2523 is disposed on the side of the polysilicon film (the first conductive film) 2513 with intervention of an interlayer insulating film 2613. With regard to the polysilicon film 2514 which is the topmost first conductive film, a polysilicon film (a second conductive film) 2524 is etched back to such a degree that the polysilicon film 2524 is able to contact the polysilicon film (the first conductive film) 2514, in the same manner as the polysilicon film 2511 which is the bottommost first conductive film (FIGS. 779 and 786).

Figure 780:
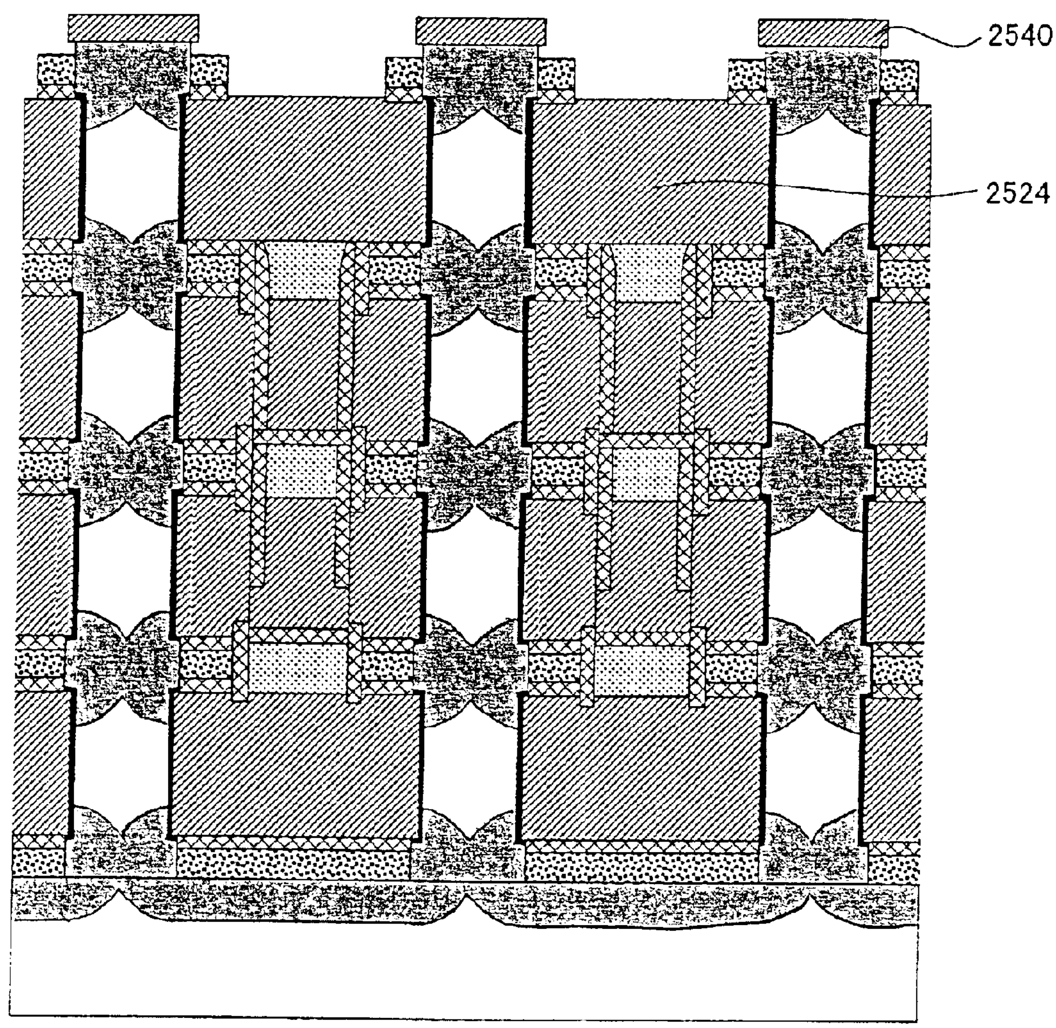
Figure 781:
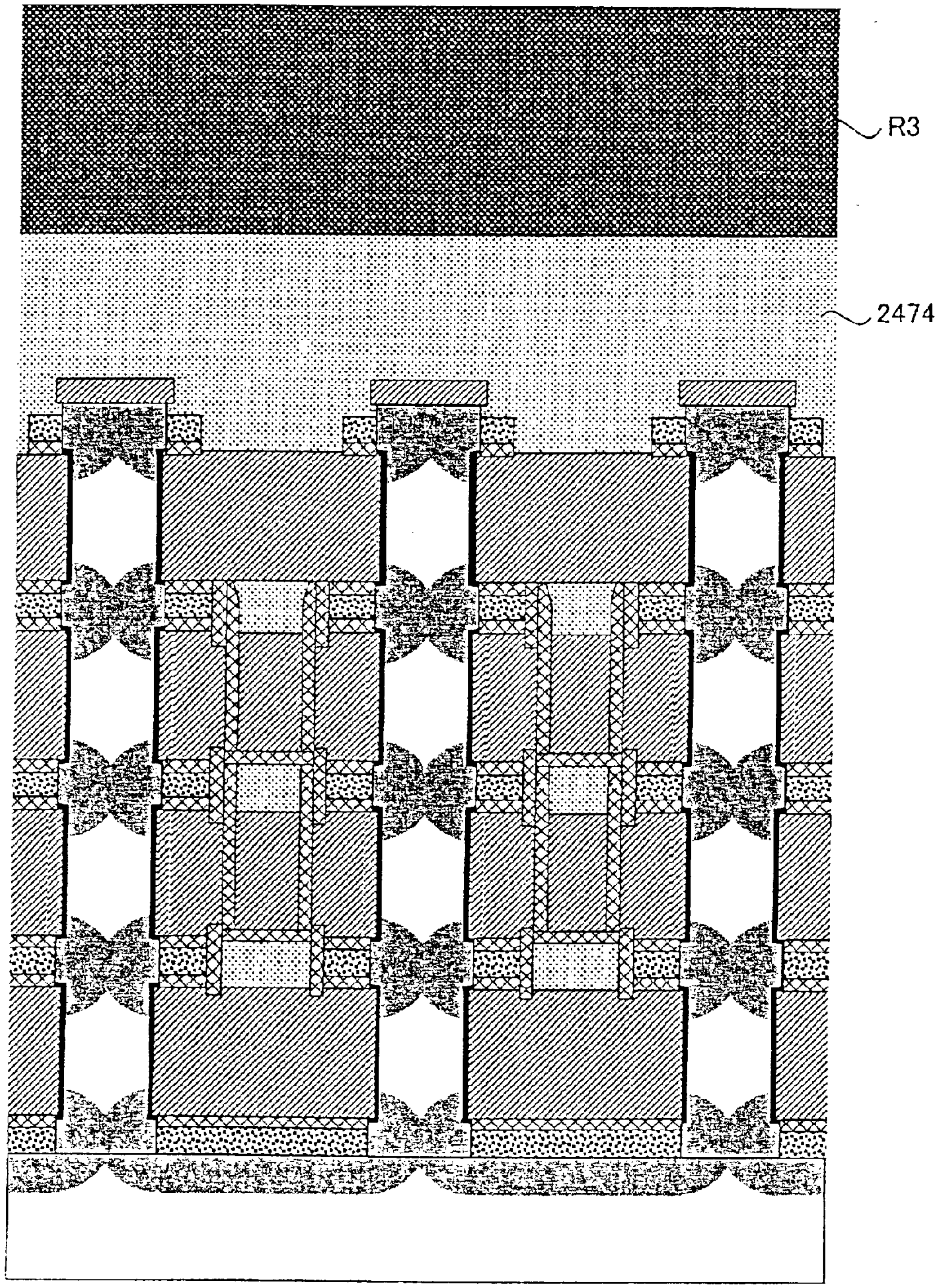
Figure 782:
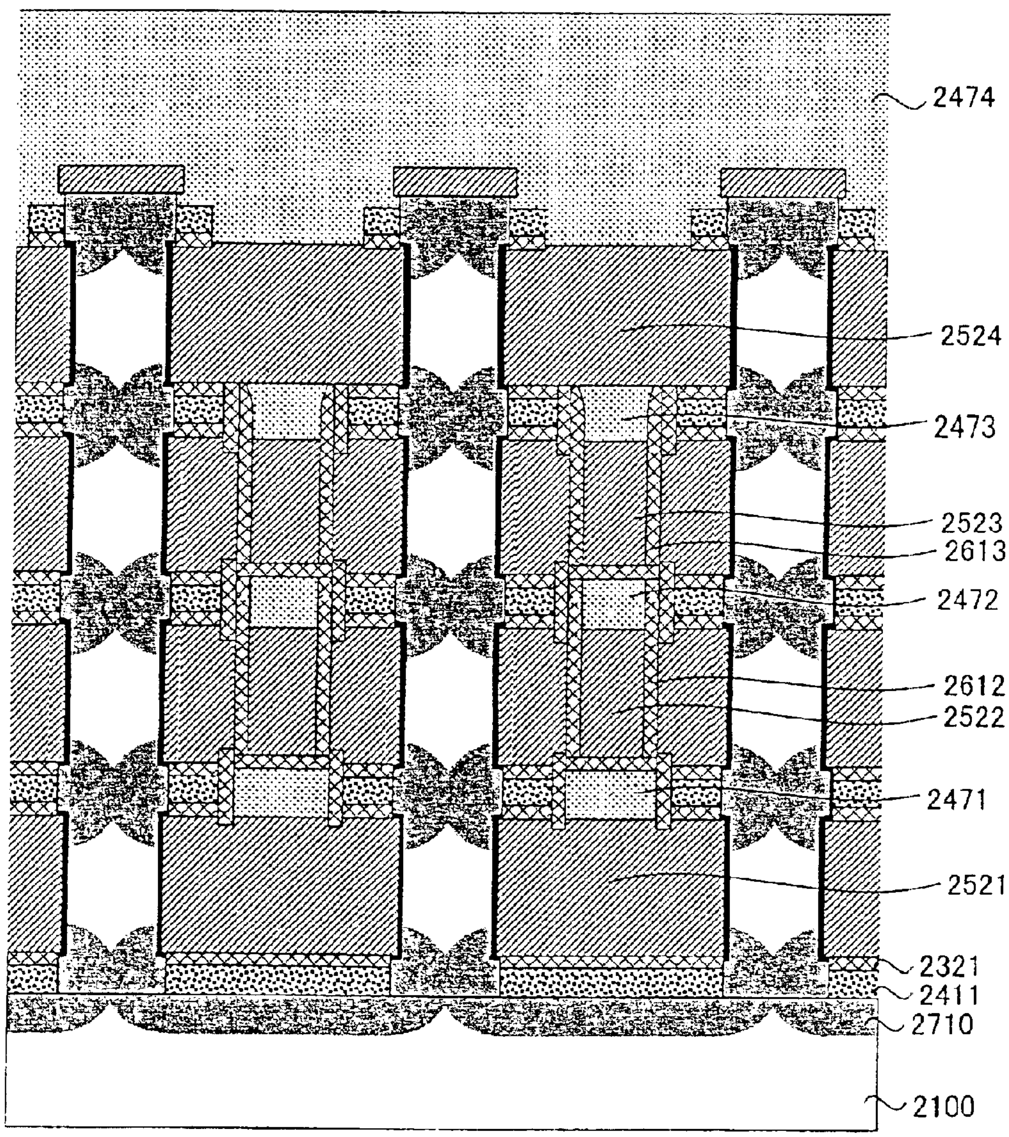
Figure 783:
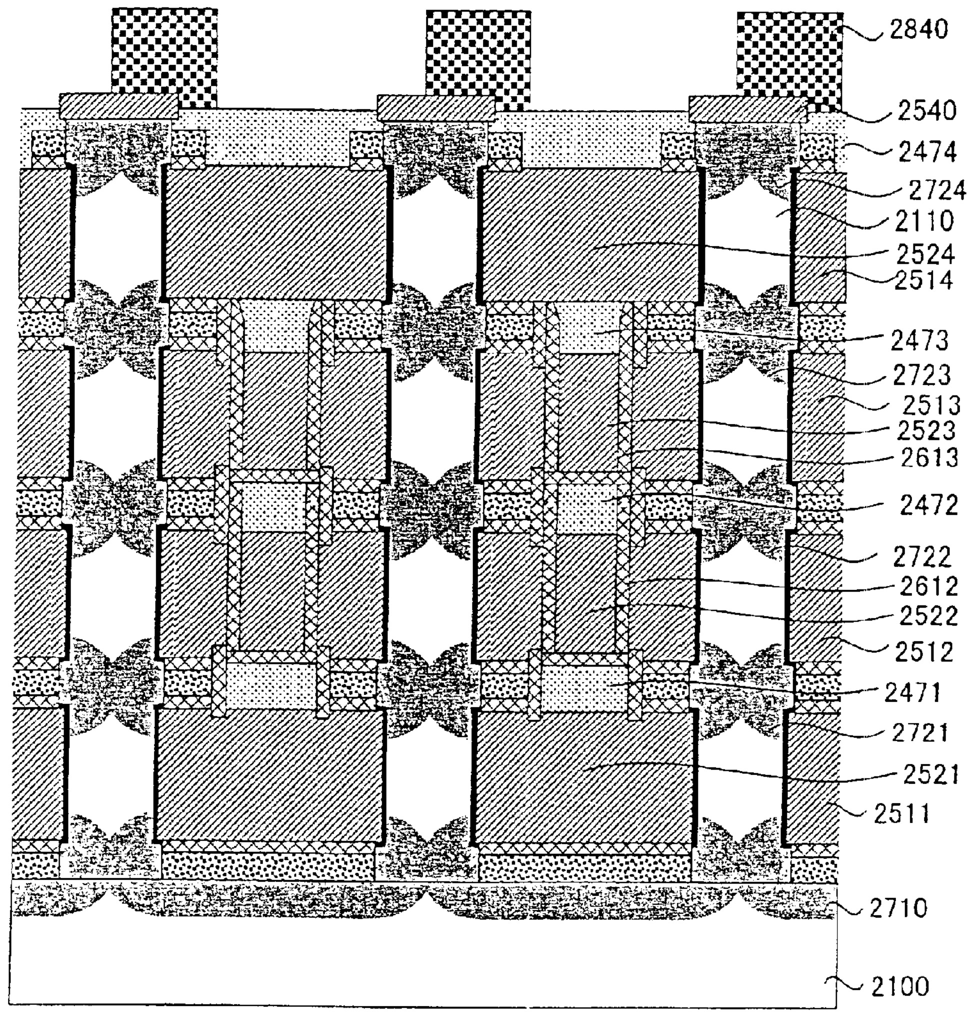
Figure 787:
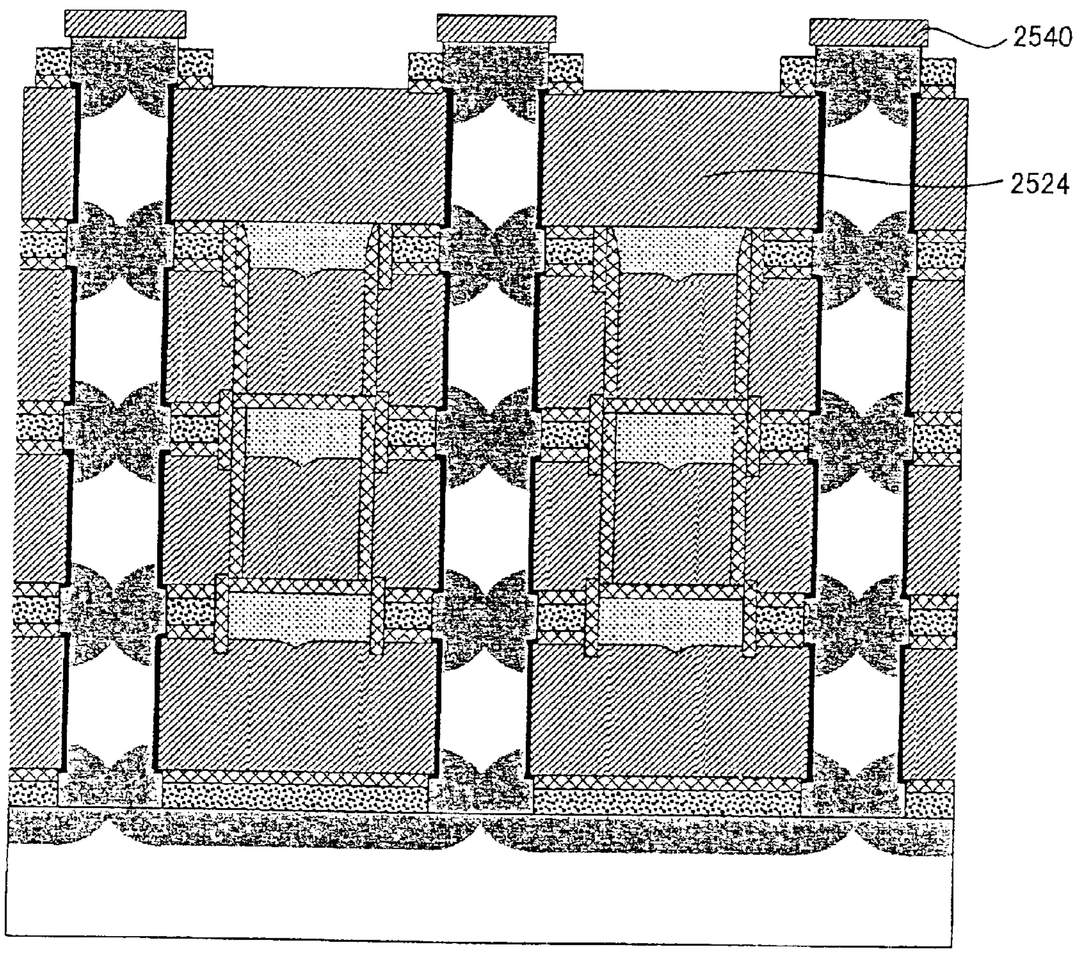
Figure 788:
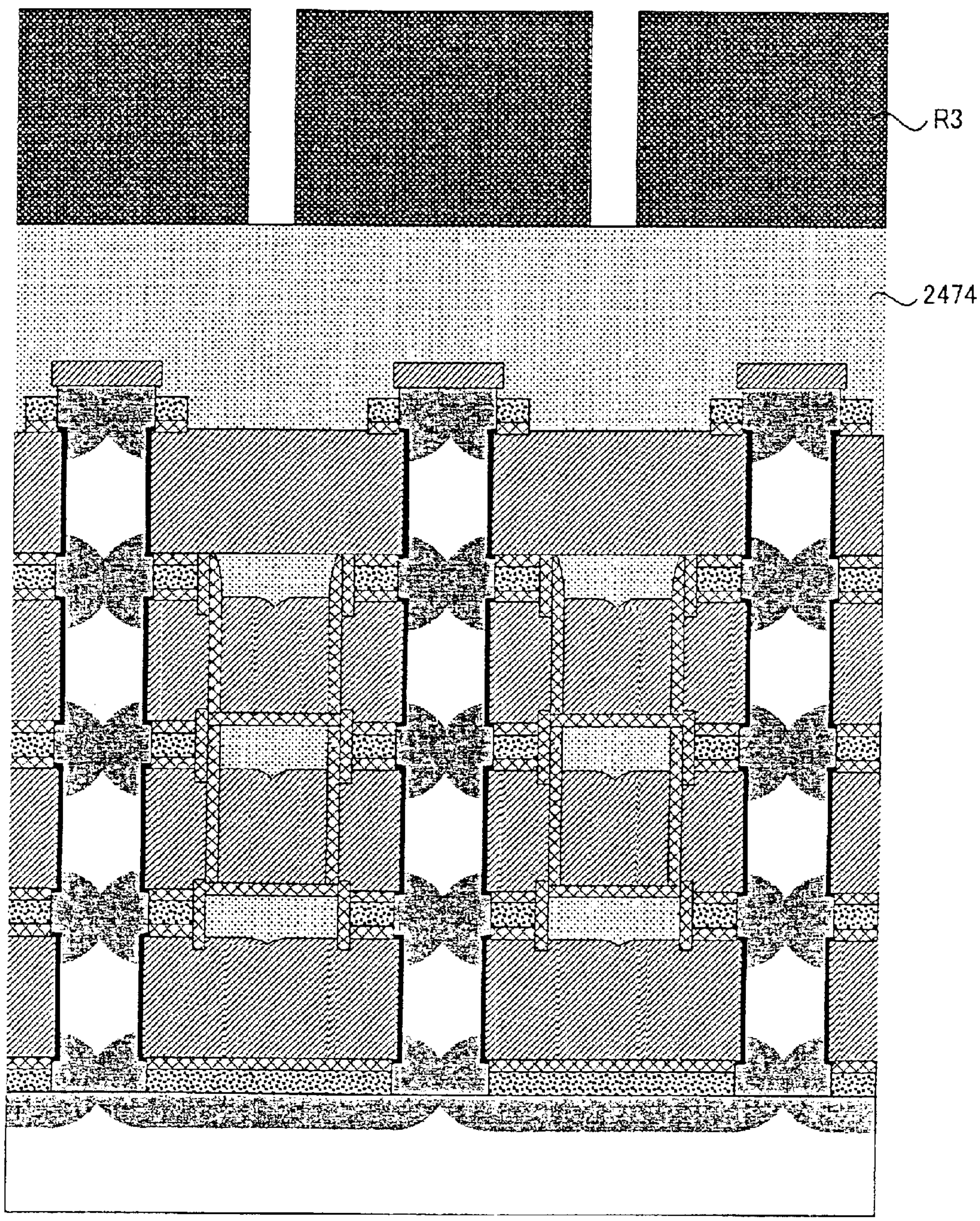
Figure 789:
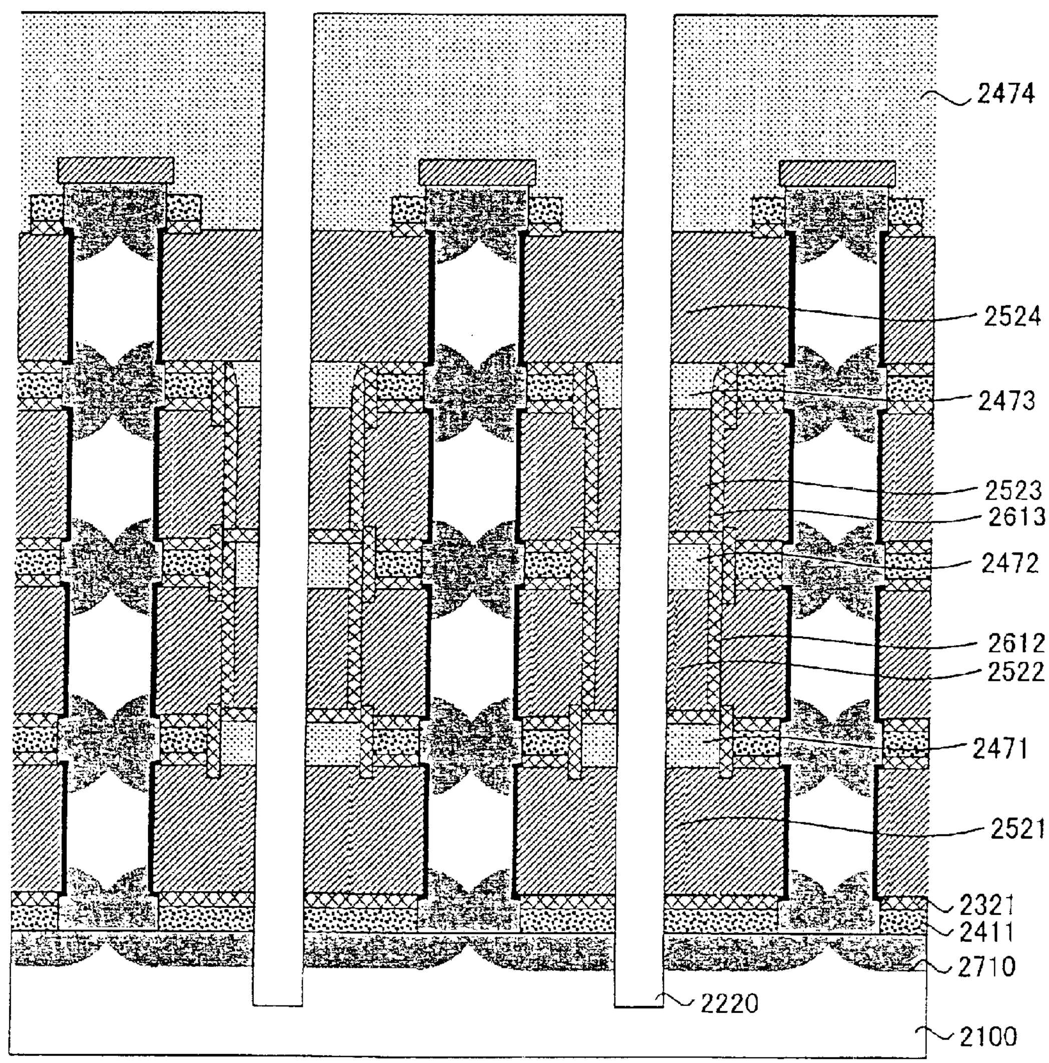
Figure 790:
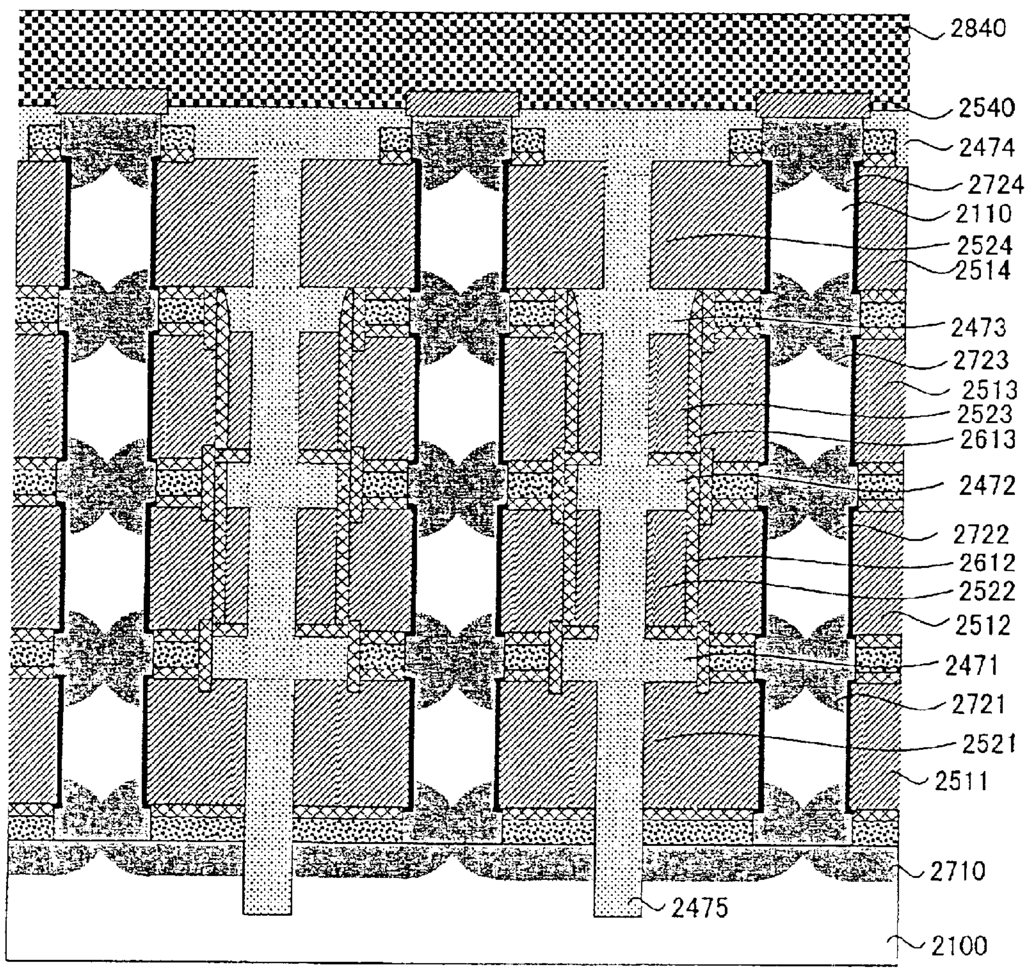

Then, the silicon nitride film 2330 (the fifth insulating film) and the silicon nitride film 2340 (the sixth insulating film) are removed, for example, by isotropic etching to expose the polysilicon film 2540 (FIGS. 780 and 787). A silicon oxide film 2474 is deposited as an eleventh insulating film to a thickness of 100 to 500 nm on the top of the polysilicon film 2524. Subsequently, using a resist film R3 patterned by a known photolithographic technique as a mask (FIGS. 781 and 788), reactive ion etching, for example, is performed to successively etch the silicon oxide film 2474, the polysilicon film 2524, the silicon oxide film 2473, the polysilicon film 2523, the interlayer insulating film 2613, the silicon oxide film 2472, the polysilicon film 2522, the interlayer insulating film 2612, the silicon oxide film 2471, the polysilicon film 2521, the silicon nitride film 2321, the silicon oxide film 2411 and the P-type silicon substrate 2100, thereby forming a second trench 2220 in the P-type silicon substrate 2100 and separating the impurity diffusion layer 2710 (FIGS. 782 and 789).

Subsequently, a silicon oxide film 2475 is deposited as an eleventh insulating film to a thickness of 100 to 500 nm. The top portion of the polysilicon film 2540 (the fourth conductive film) is exposed by etch-back or by CMP. A fourth wiring layer is formed so that its direction crosses the direction of the second or third wiring layer and is connected to the top portion of the island-like semiconductor layer 2110.

Thereafter, by known techniques, an interlayer insulating film is formed, and a contact hole and metal wiring are formed. Thereby, a semiconductor memory is realized which has a memory function according to the state of a charge in the charge storage layer which is the floating gate made of the polysilicon film (the first conductive film).

In this example, films formed on the surface of the semiconductor substrate or the polysilicon film such as the silicon nitride film (the fifth insulating film) 2330, the silicon nitride film (the sixth insulating film) 2340 and the silicon nitride film (the twelfth insulating film) 2350 may be formed of a layered film of a silicon oxide film/a silicon nitride film from the silicon surface.

With regard to the polysilicon films 2510 or 2511 to 2514 (the first conductive films), the polysilicon films 2520 or 2521 to 2524 (the second conductive films) and the polysilicon film 2540 (the fourth conductive film), impurity introduction may be carried out during or after the formation of the polysilicon films or after the separation of the polysilicon films. The timing of the impurity introduction to the polysilicon films is not particularly limited so long as these films become conductive films.

Further, by providing the selection gates in the top and the bottom of a set of memory cells, it is possible to prevent the phenomenon that a memory cell transistor is over-erased.

PRODUCTION EXAMPLE 35

In an example of production process for producing a semiconductor memory in which regions for forming the charge storage layers are defined in advance by a laminated film comprising plural films, explanation is given of an example of production process in which impurities are introduced to the island-like semiconductor layer during epitaxial growth of the island-like semiconductor layer.

Such a semiconductor memory may be produced by the following production process. FIGS. 791 to 793 and FIGS. 794 to 796 are sectional views taken on line A-A' and line B-B', respectively, in FIG. 1 which is a plan view illustrating an EEPROM memory cell array.

Figure 791:
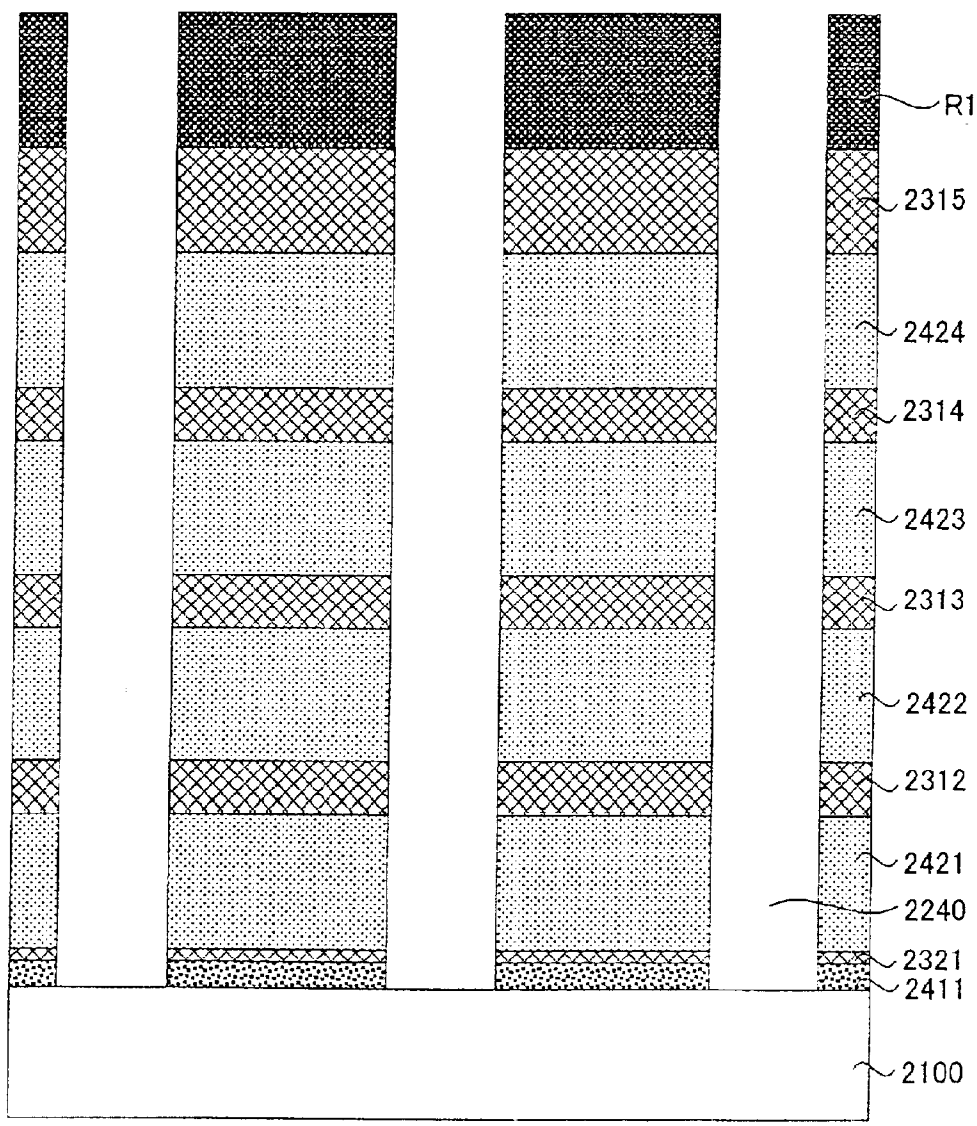
Figure 792:
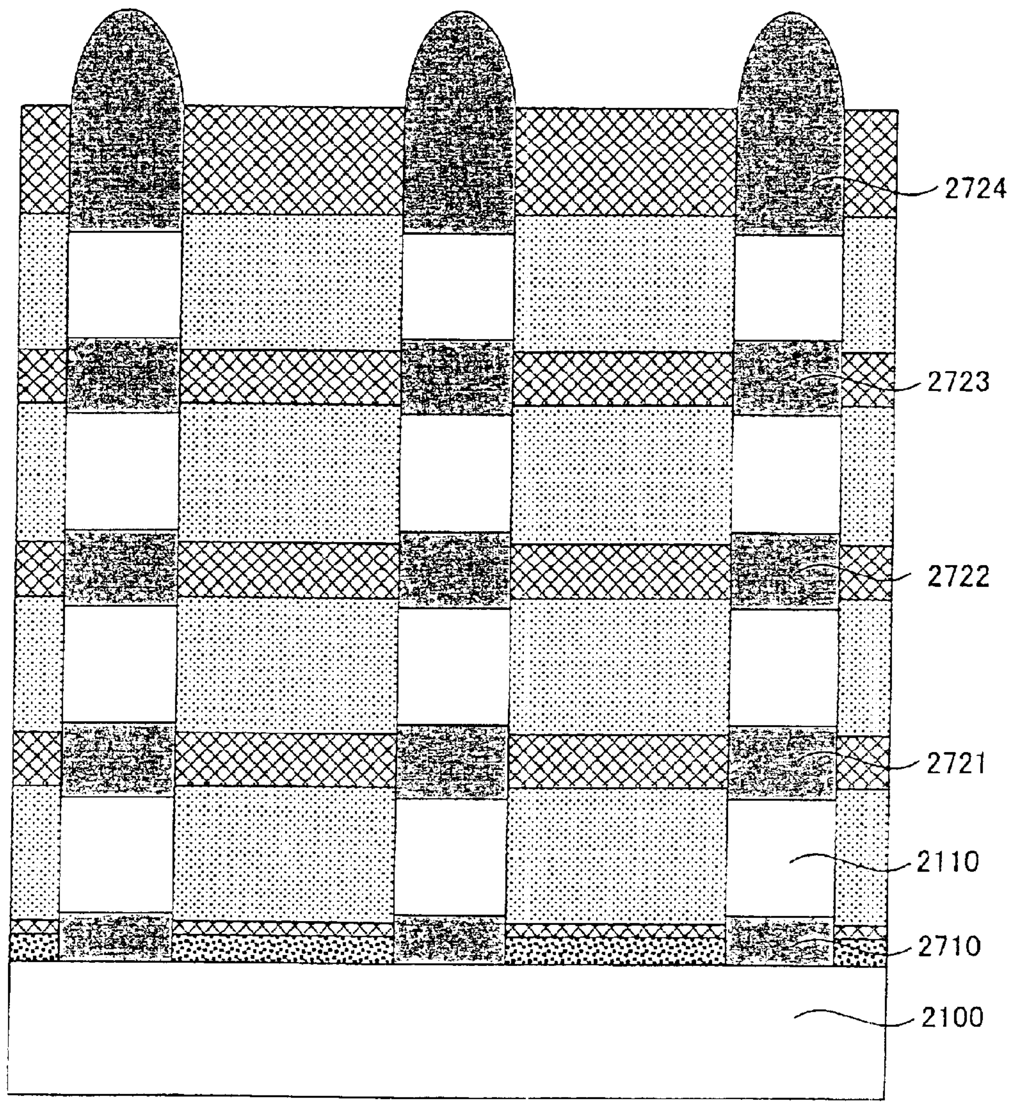
Figure 793:
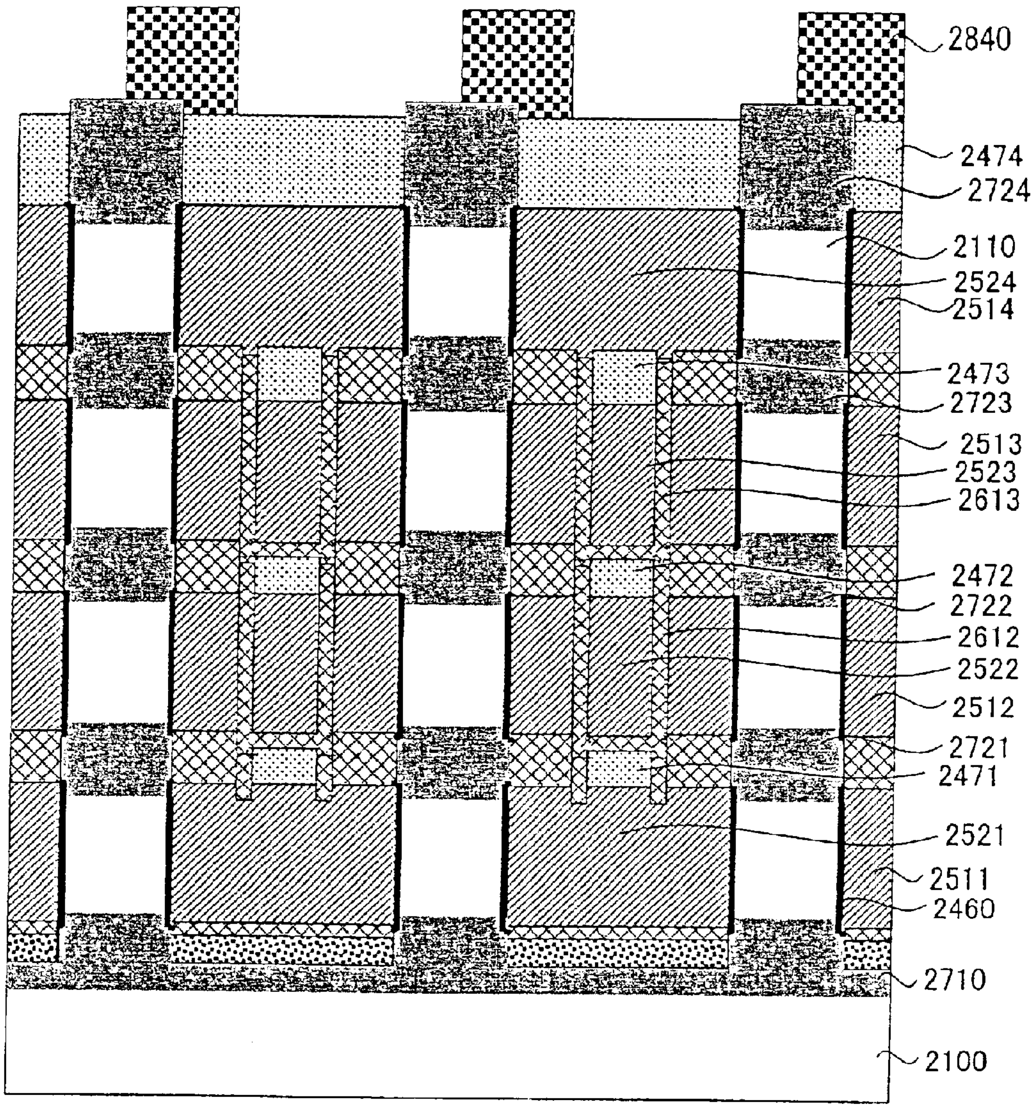
Figure 794:
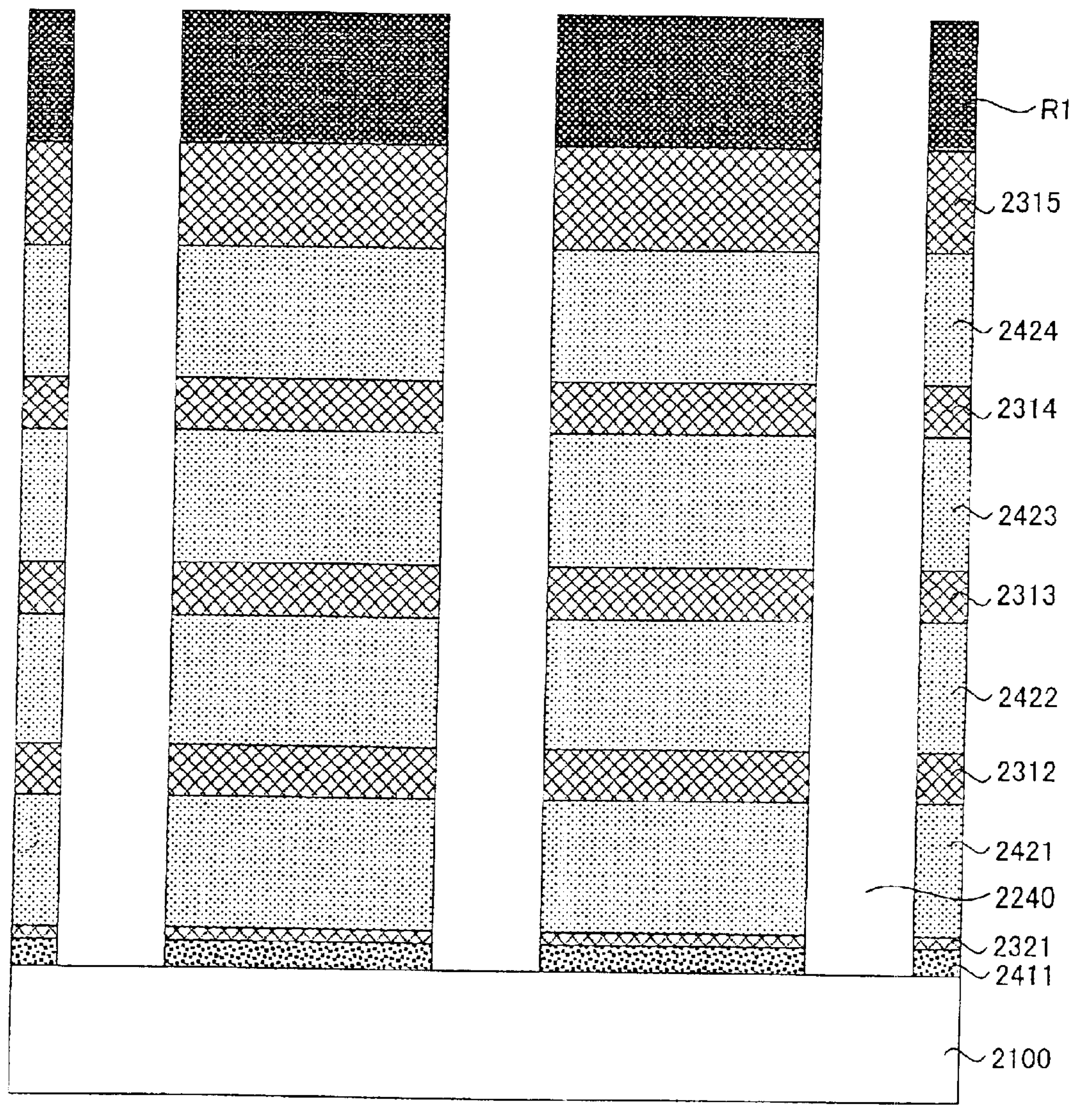
Figure 795:
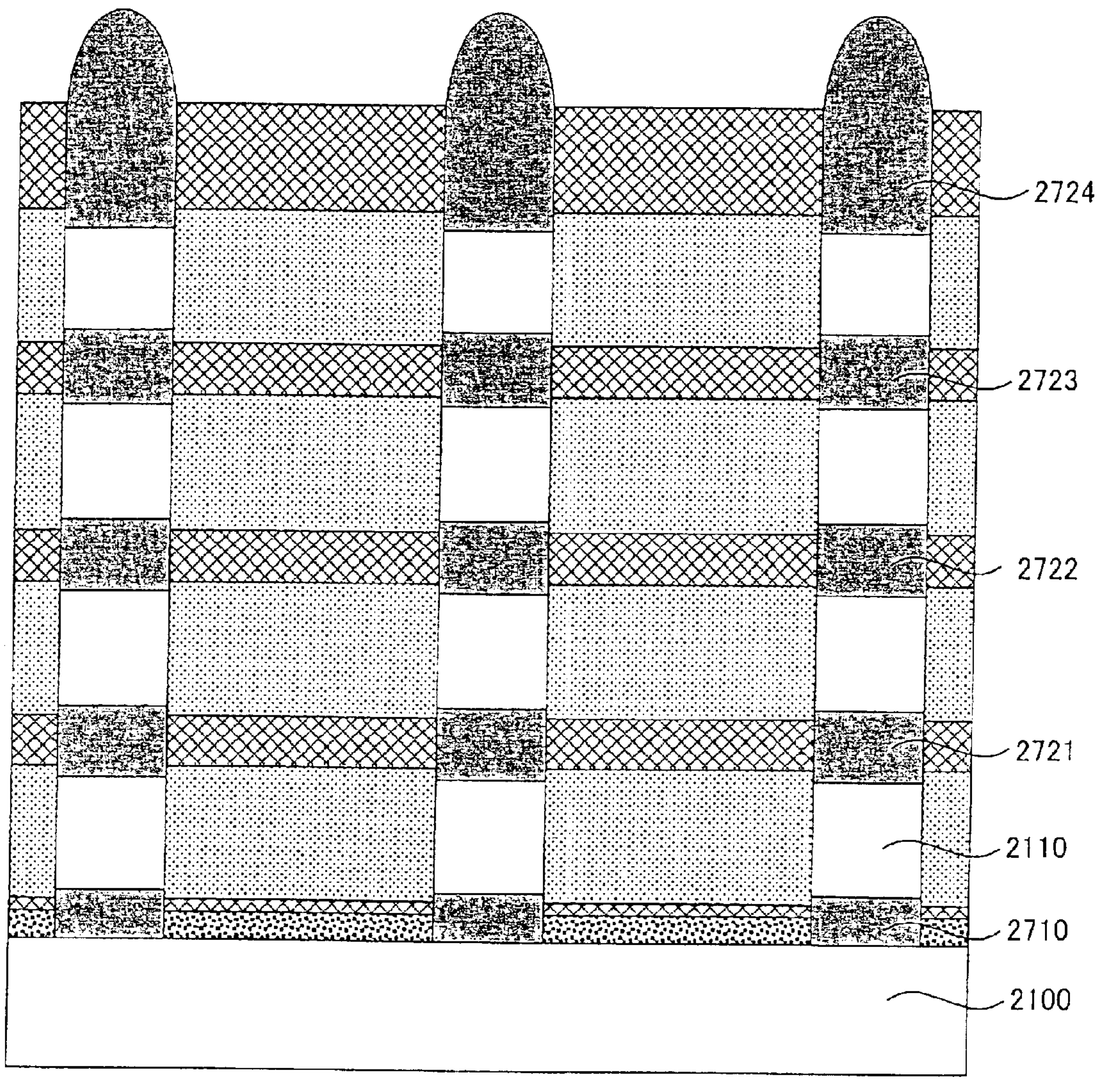
Figure 796:
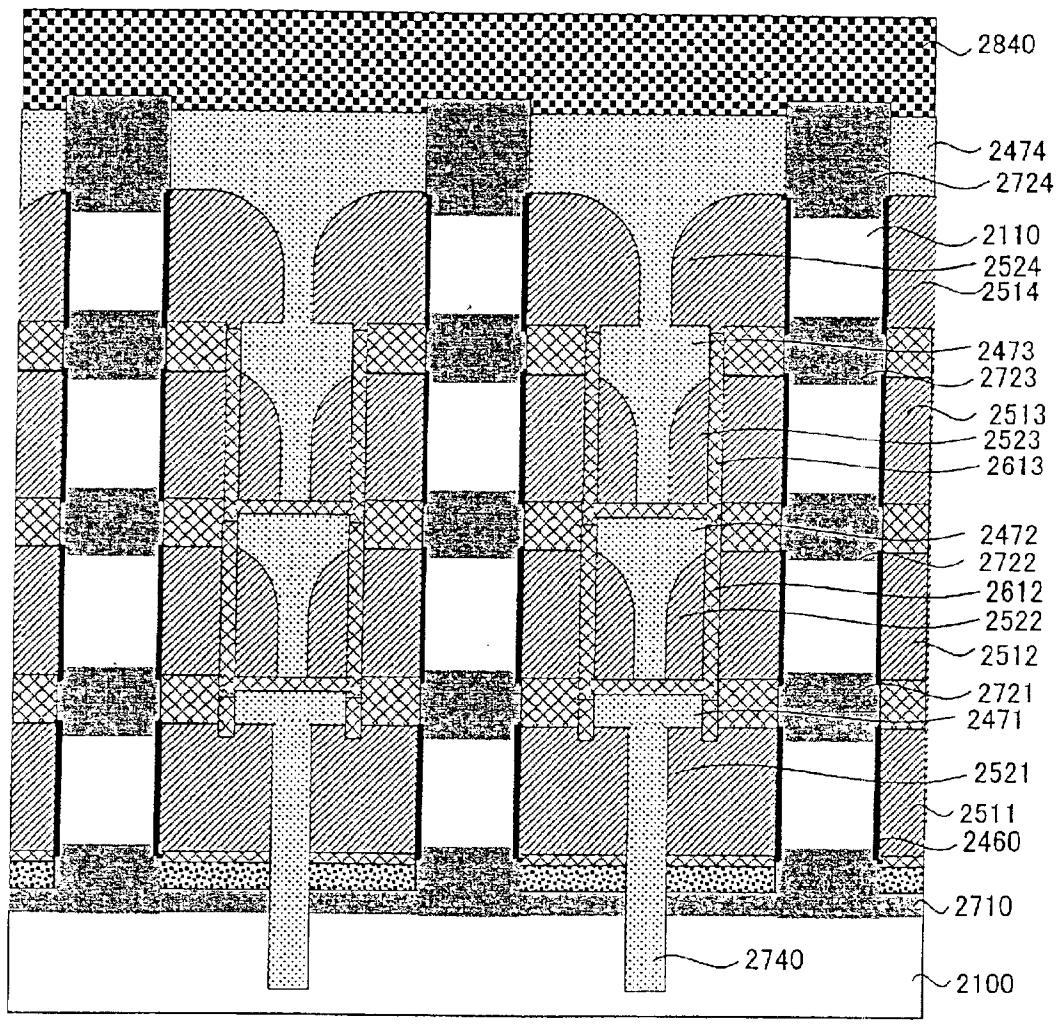
Figure 797:
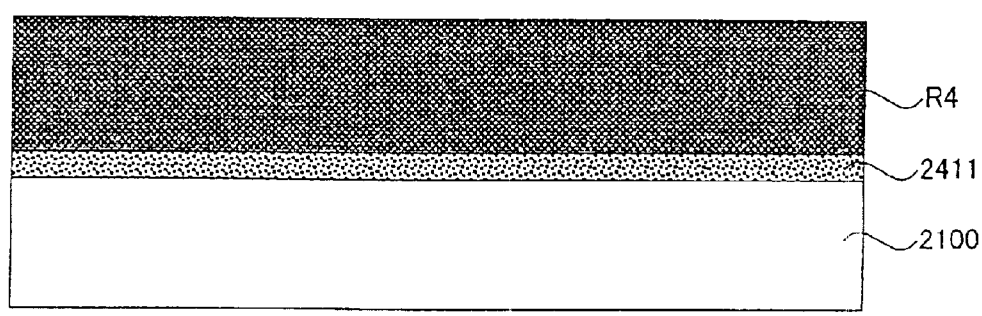

In this example, a trench is formed as shown in FIGS. 791 and 794, and then epitaxial silicon containing high concentration N-type impurities and epitaxial silicon containing low concentration P-type impurities are alternately grown by selective epitaxial growth (FIGS. 792 and 795). Thereby, a semiconductor memory is realized which has a memory function according to the state of a charge in the charge storage layer (FIGS. 793 and 796).

PRODUCTION EXAMPLE 36

Explanation is given of an example of a production process of a semiconductor memory in which sites for separating the first wiring layer are formed, regions for forming the charge storage layers are defined in advance by a laminated film comprising plural films, and then the island-like semiconductor layers are formed.

Such a semiconductor memory may be produced by the following production process. FIGS. 797 to 799 and FIGS. 800 to 802 are sectional views taken on line A-A' and line B-B', respectively, in FIG. 1 which is a plan view illustrating an EEPROM memory cell array.

First, on a surface of a P-type silicon substrate 2100, a silicon oxide film 2411 containing arsenic impurities of about $1\times10^{18}$ to $1\times10^{22}/cm^3$, for example, is deposited as a first insulating film to a thickness of 50 to 500 nm by CVD.

Using a resist film R4 patterned by a known photolithographic technique as a mask (FIGS. 797 and 800), the silicon oxide film 2411 is etched, for example, by reactive ion etching to form a fourth trench 2240.

Figure 798:
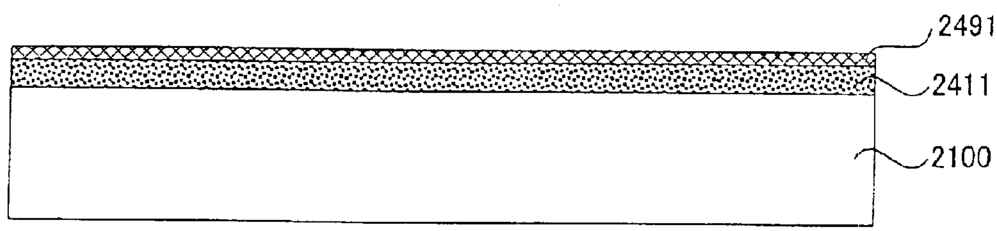
Figure 801:
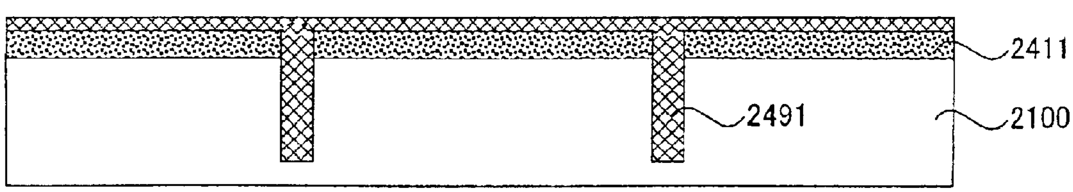

The resist film R4 is removed and then a silicon nitride film 2491 (a twenty-first insulating film) is buried in the fourth trench 2240 (FIGS. 798 and 801). Thereby, a region for forming an impurity diffusion layer 2710 to be a first wiring layer is defined.

Figure 799:
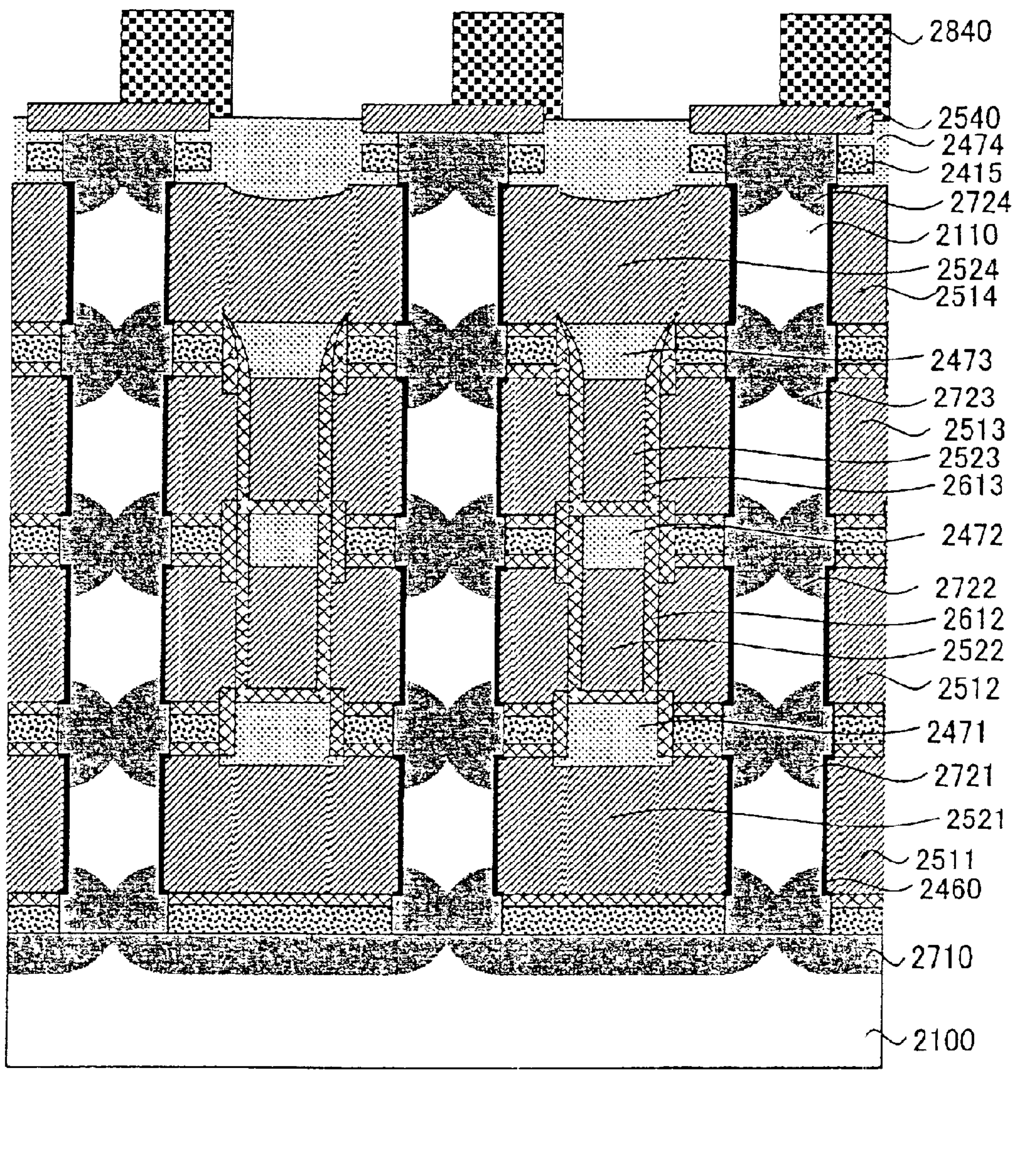
Figure 800:
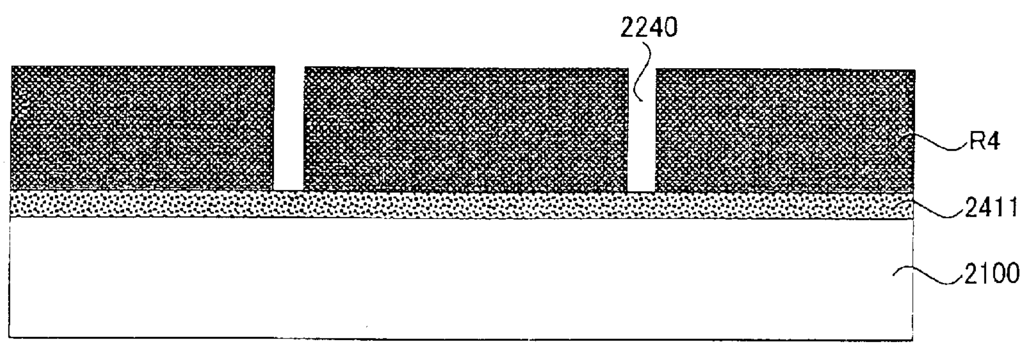
Figure 802:
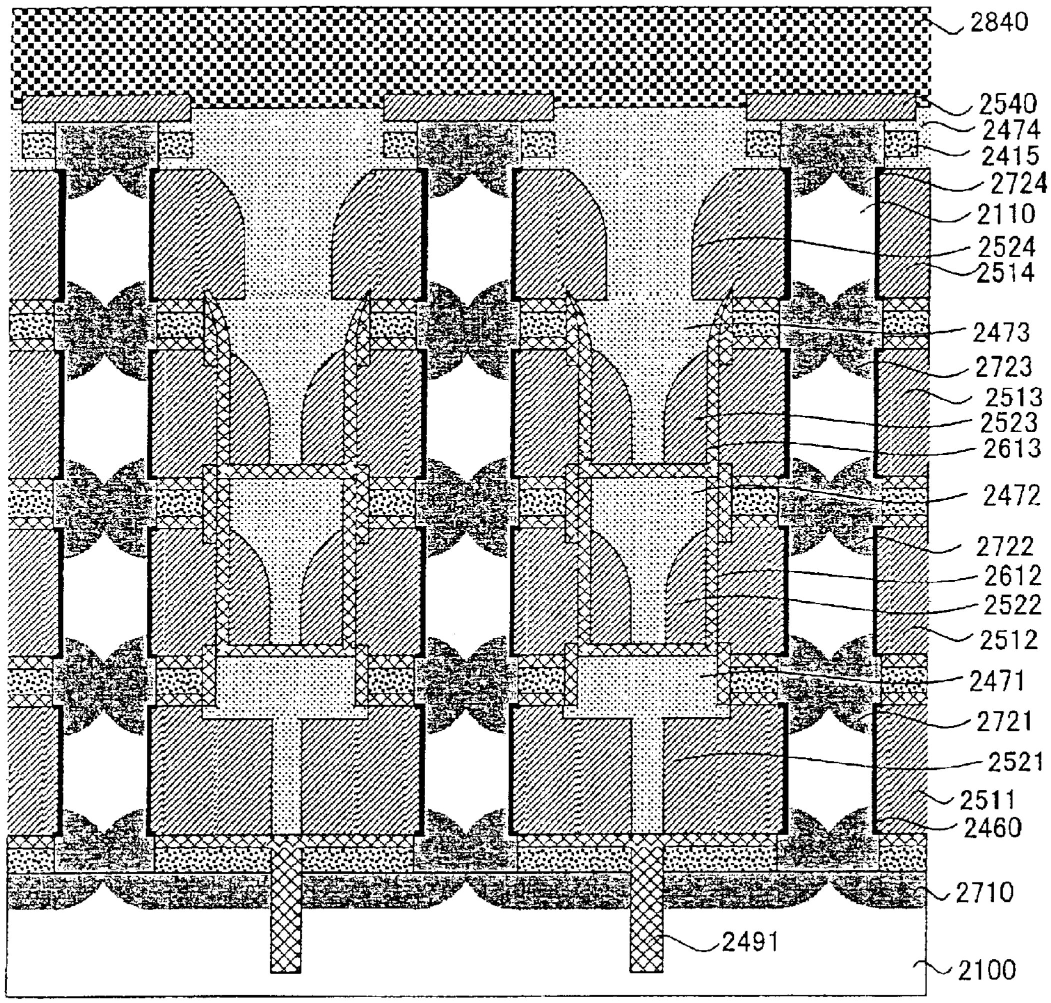

Production steps thereafter follow Production Example 11. Thus, a semiconductor memory is completed (FIGS. 799 and 802).

PRODUCTION EXAMPLE 37

Explanation is given of an example of a production process of a semiconductor memory in which regions for forming the charge storage layers are defined in advance by a laminated film comprising plural films and then the island-like semiconductor layers are formed.

Figure 803:
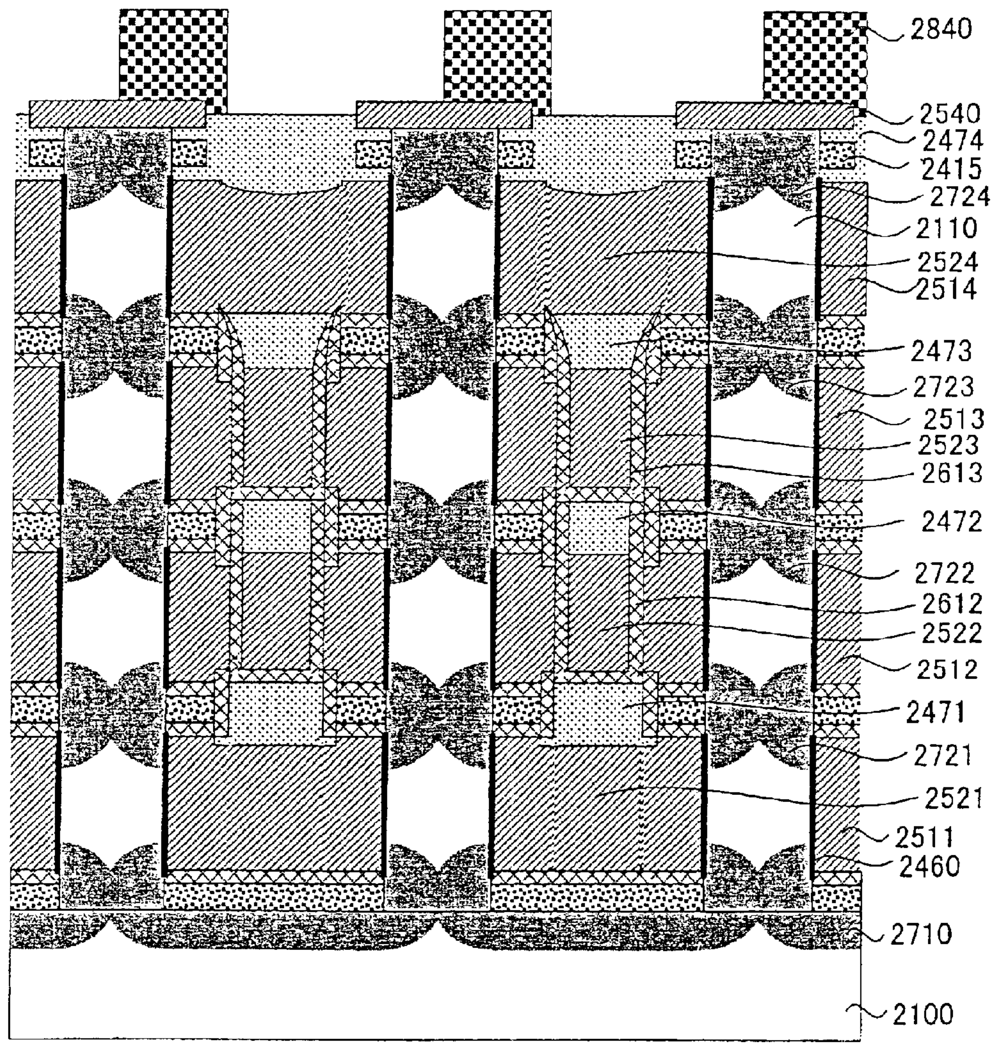
Figure 804:
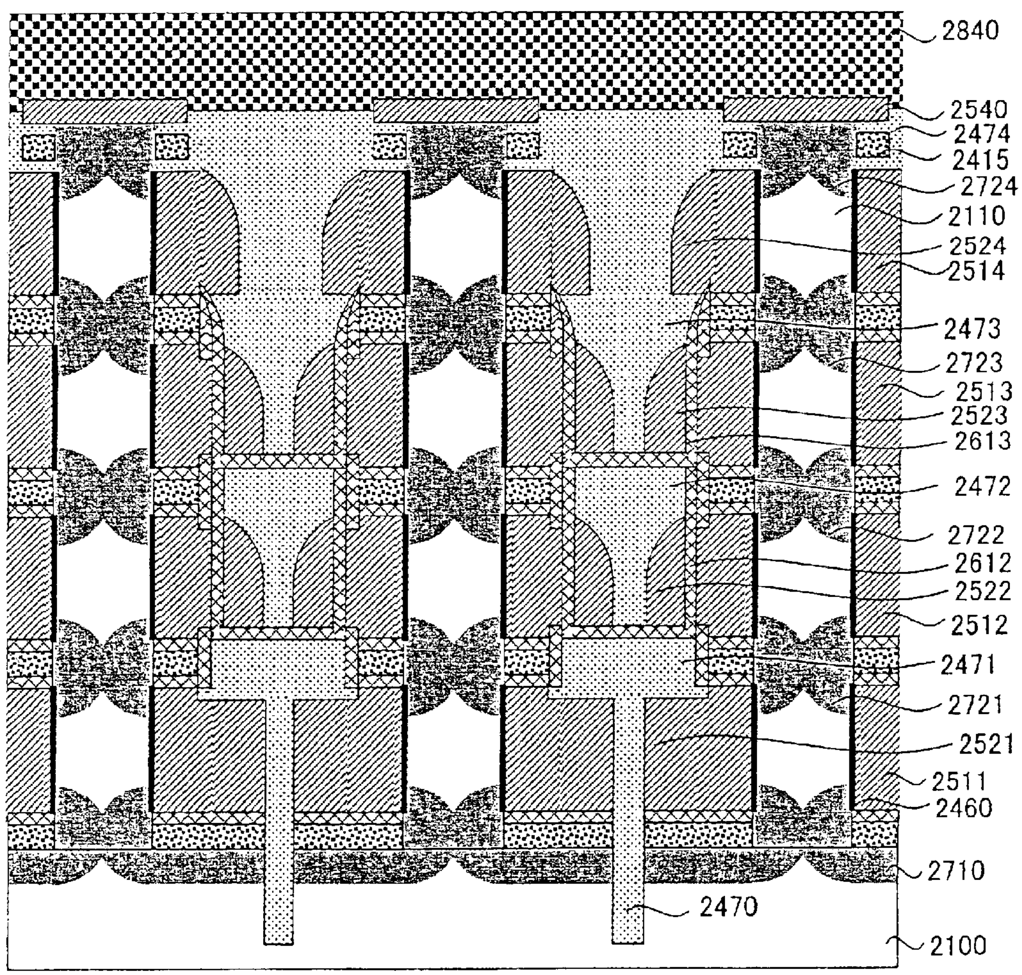
Figure 805:
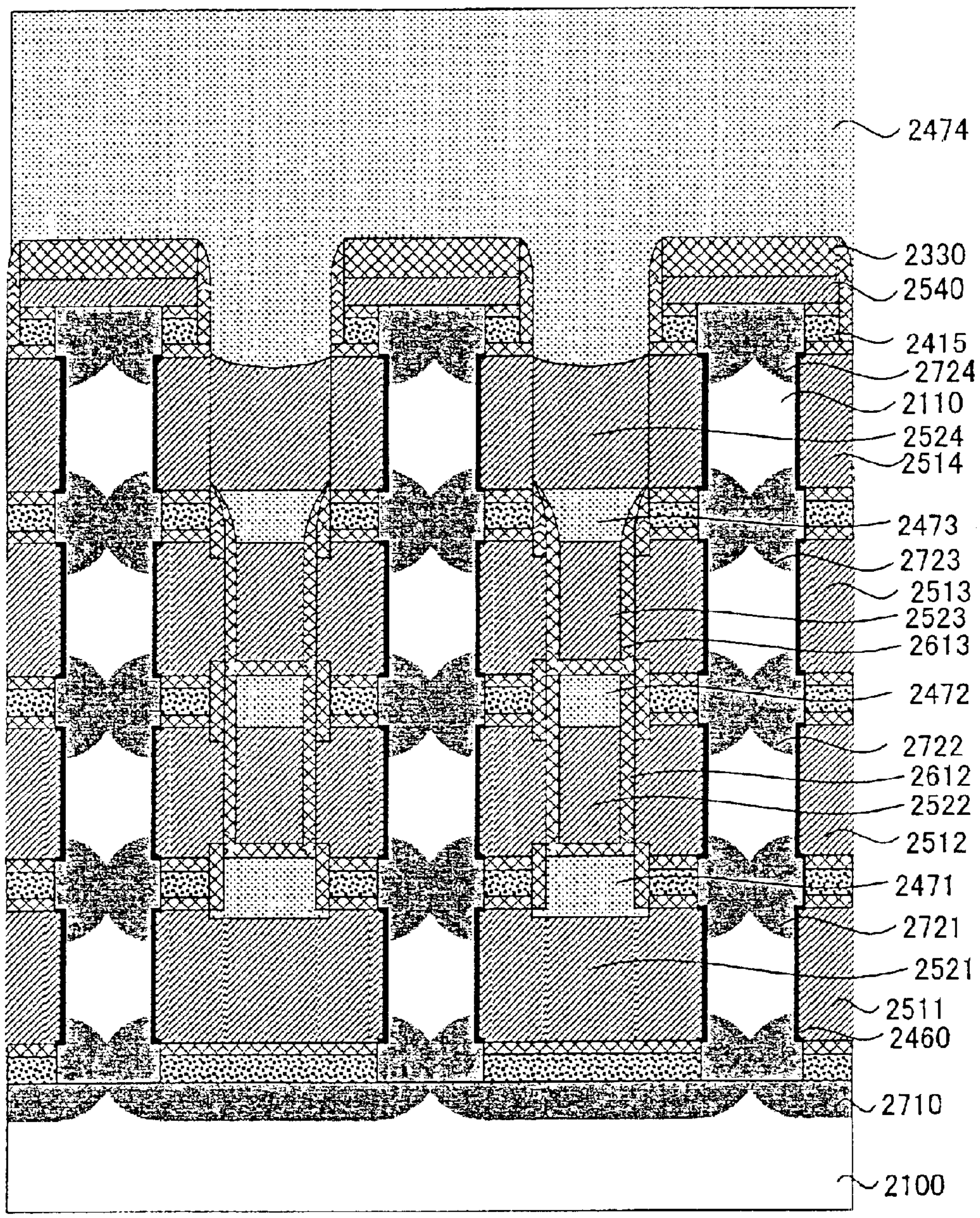
Figure 806:
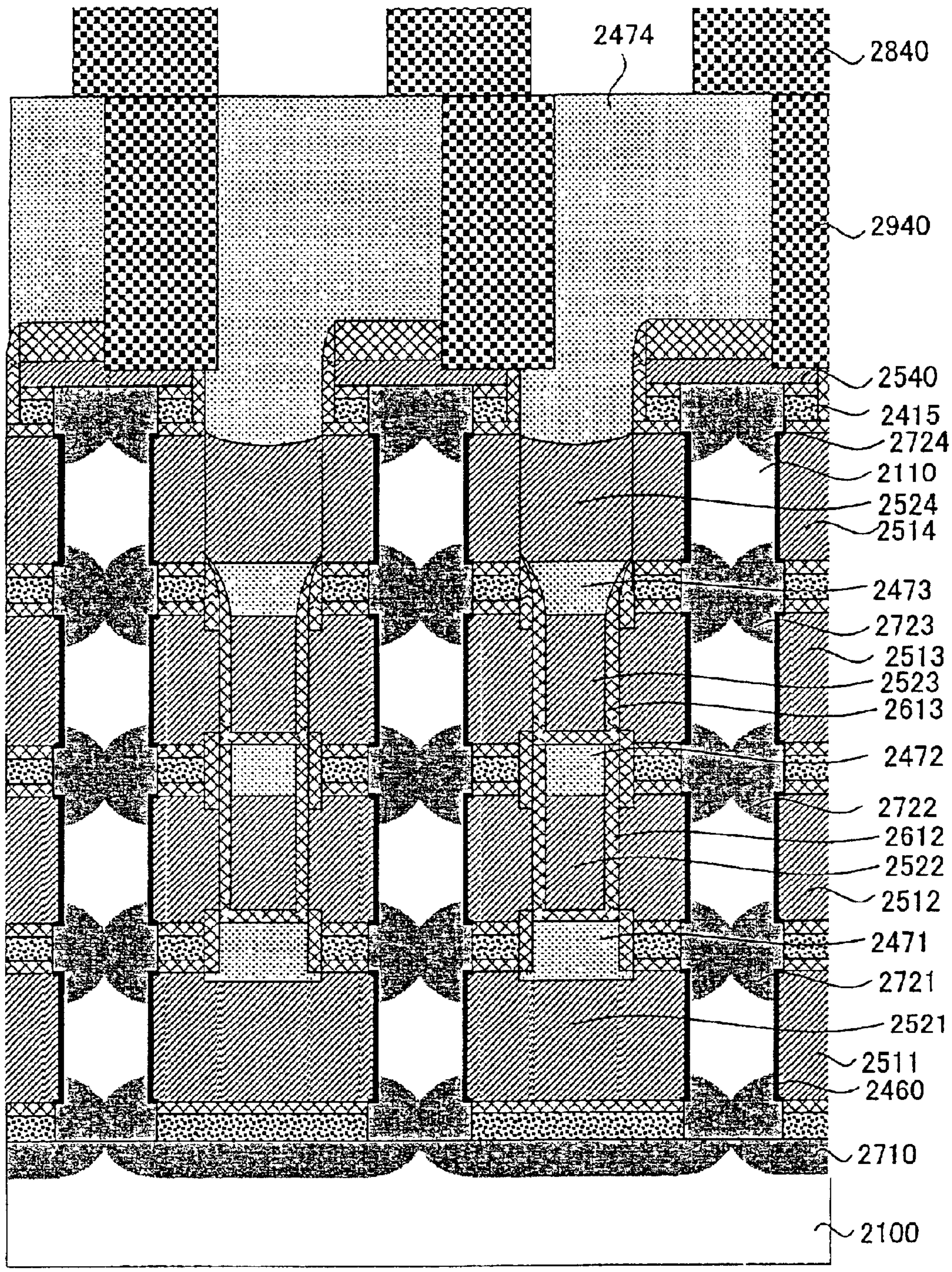
Figure 807:
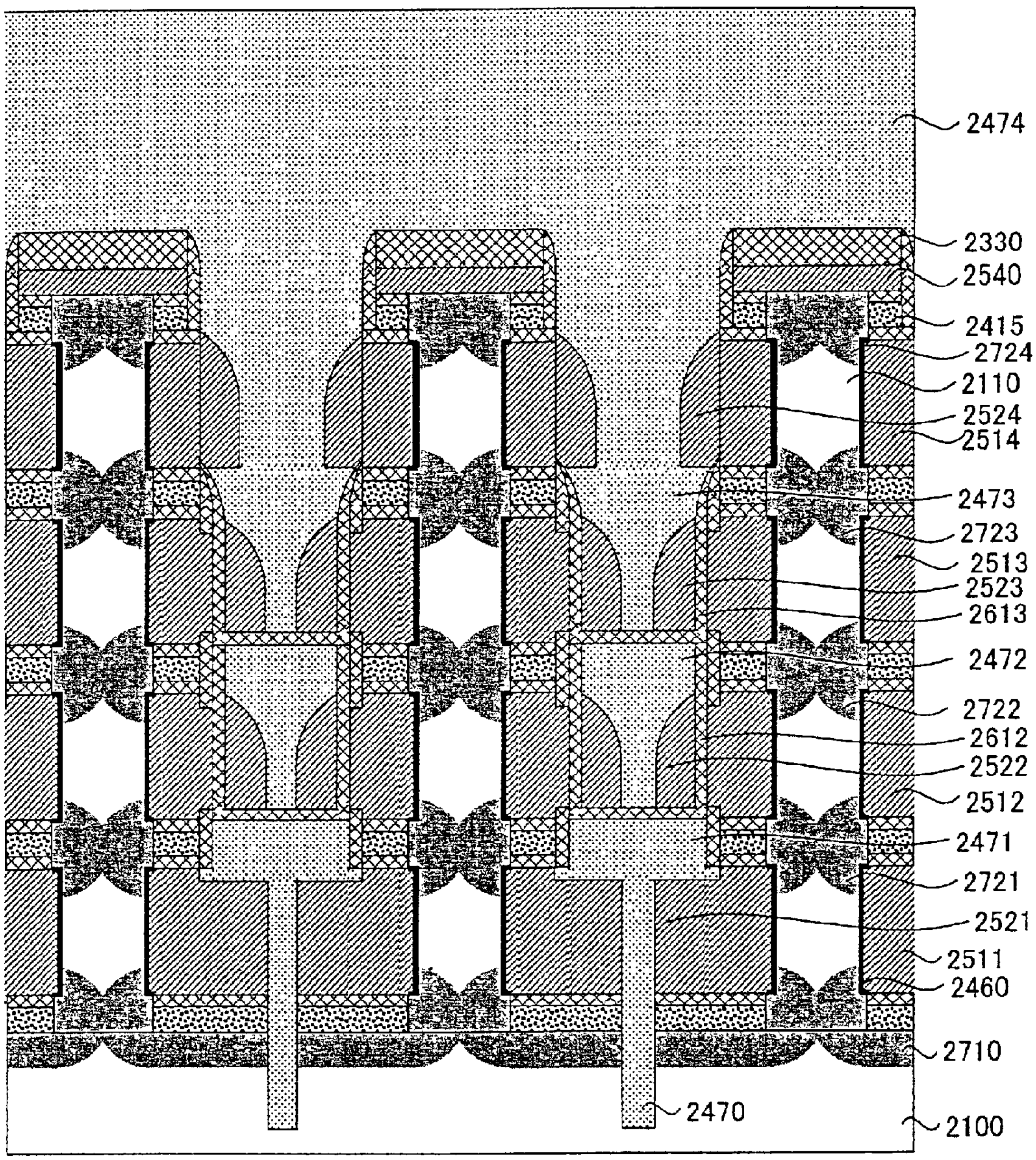
Figure 808:
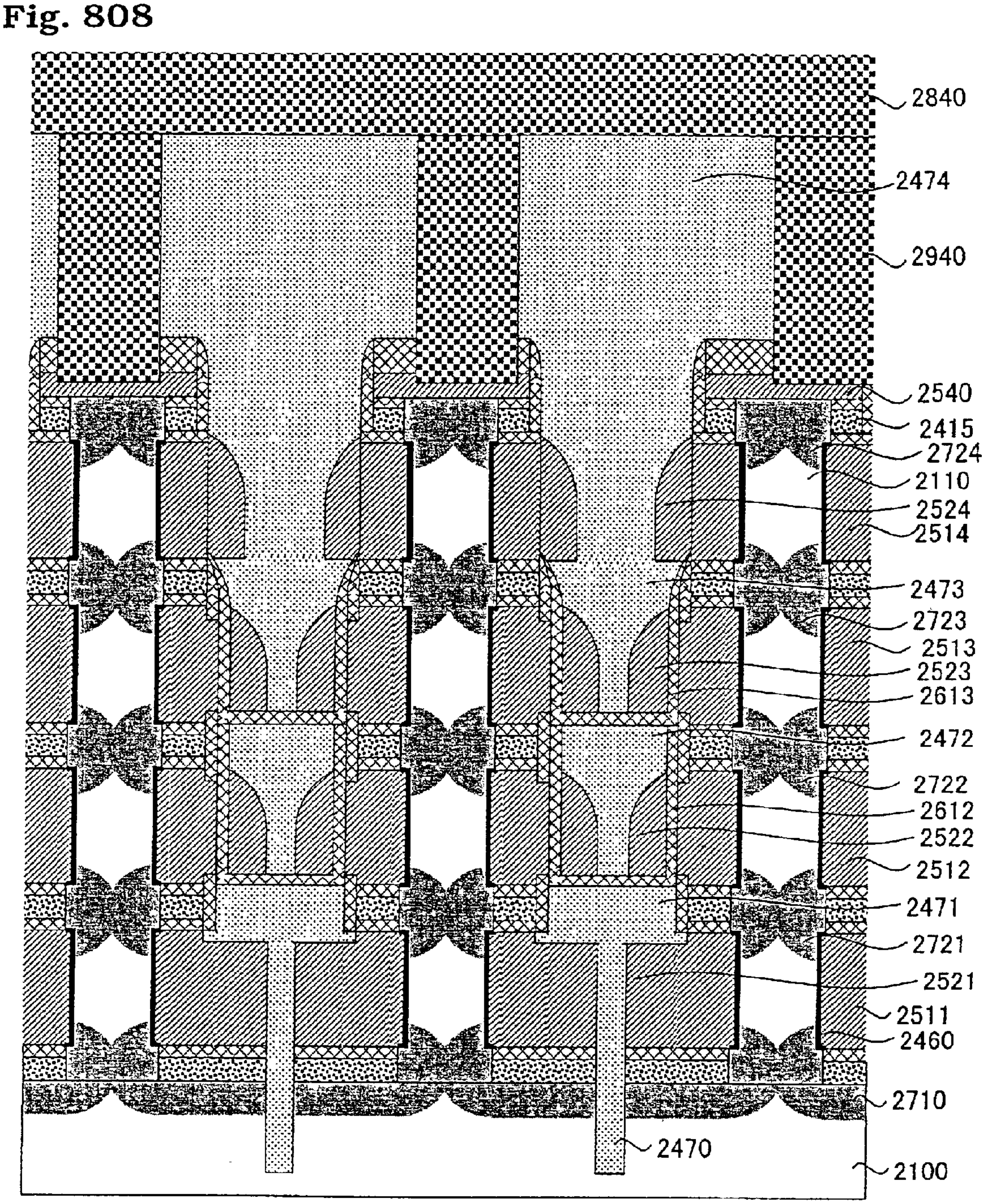

Such a semiconductor memory may be produced by the following production process. FIGS. 803 and 804 are sectional views taken on line A-A' and line B-B', respectively, in FIG. 1 which is a plan view illustrating an EEPROM memory cell array.

Unlike Production example 11 for forming memory cells in which the side of the island-like semiconductor layer 2110 is exposed and thermally oxidized to form a thermally oxidized film 2450 as a ninth insulating film and then the thermally oxidized film 2450 is etched away (FIGS. 304 to 320 and 337 to 353), in this example, the thermally oxidized film 2450 may not be formed as shown in FIGS. 803 and 804.

PRODUCTION EXAMPLE 38

Explanation is given of an example of a production process of a semiconductor memory in which regions for forming charge storage layers are defined in advance by a laminated film comprising plural films.

Such a semiconductor memory may be produced by the following production process. FIGS. 805 to 806 and FIGS. 807 to 808 are sectional views taken on line A-A' and line B-B', respectively, in FIG. 1 which is a plan view an EEPROM memory cell array.

As compared with Production example 11 in which the polysilicon film 2540 (the fourth conductive film) disposed at the end of the island-like semiconductor portion is connected to the fourth wiring layer, the polysilicon film 2540 may be connected to the fourth wiring layer 2840 via a contact portion 2940 as shown in FIGS. 805 to 806 and FIGS. 807 to 808.

PRODUCTION EXAMPLE 39

In an example of production process for producing a semiconductor memory in which regions for forming the charge storage layers are defined in advance by a laminated film comprising plural films, explanation is given of an example of production process in which impurities are introduced to the island-like semiconductor layer by vapor or solid phase diffusion.

Such a semiconductor memory may be produced by the following production process. FIGS. 809 to 826 and FIGS. 827 to 844 are sectional views taken on line A-A' and line B-B', respectively, in FIG. 1 which is a plan view an EEPROM memory cell array.

First, on a surface of a P-type silicon substrate 2100, a silicon nitride film 2321, for example, is deposited as a fourth insulating film to a thickness of 10 to 100 nm.

A silicon oxide film 2421, for example, is deposited as a third insulating film to a thickness of 50 to 500 nm, a silicon nitride film 2312 is deposited as a second insulating film to a thickness of 10 to 100 nm, and a silicon oxide film 2422 is deposited as a third insulating film to a thickness of 50 to 500 nm.

Figure 809:
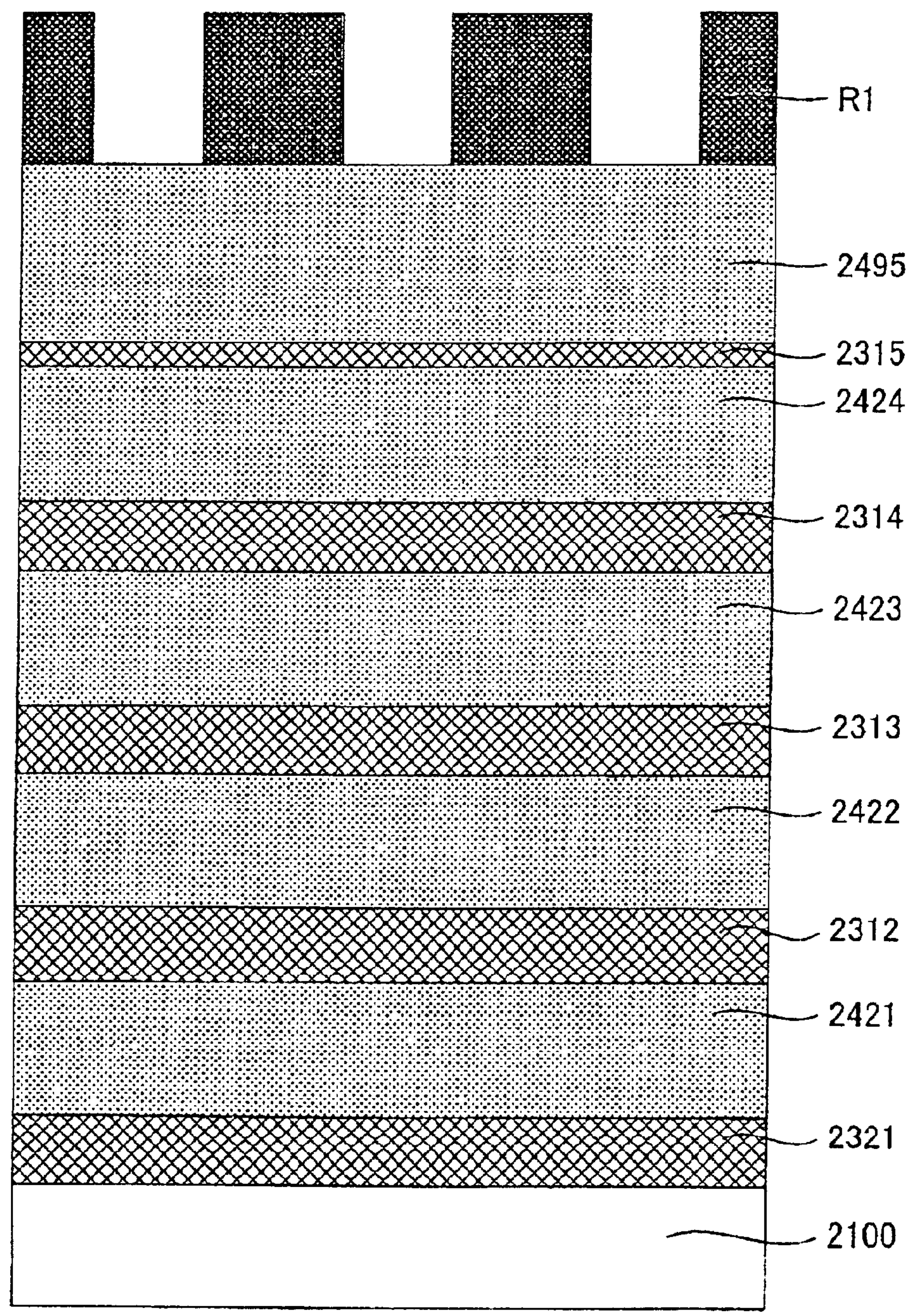
Figure 827:
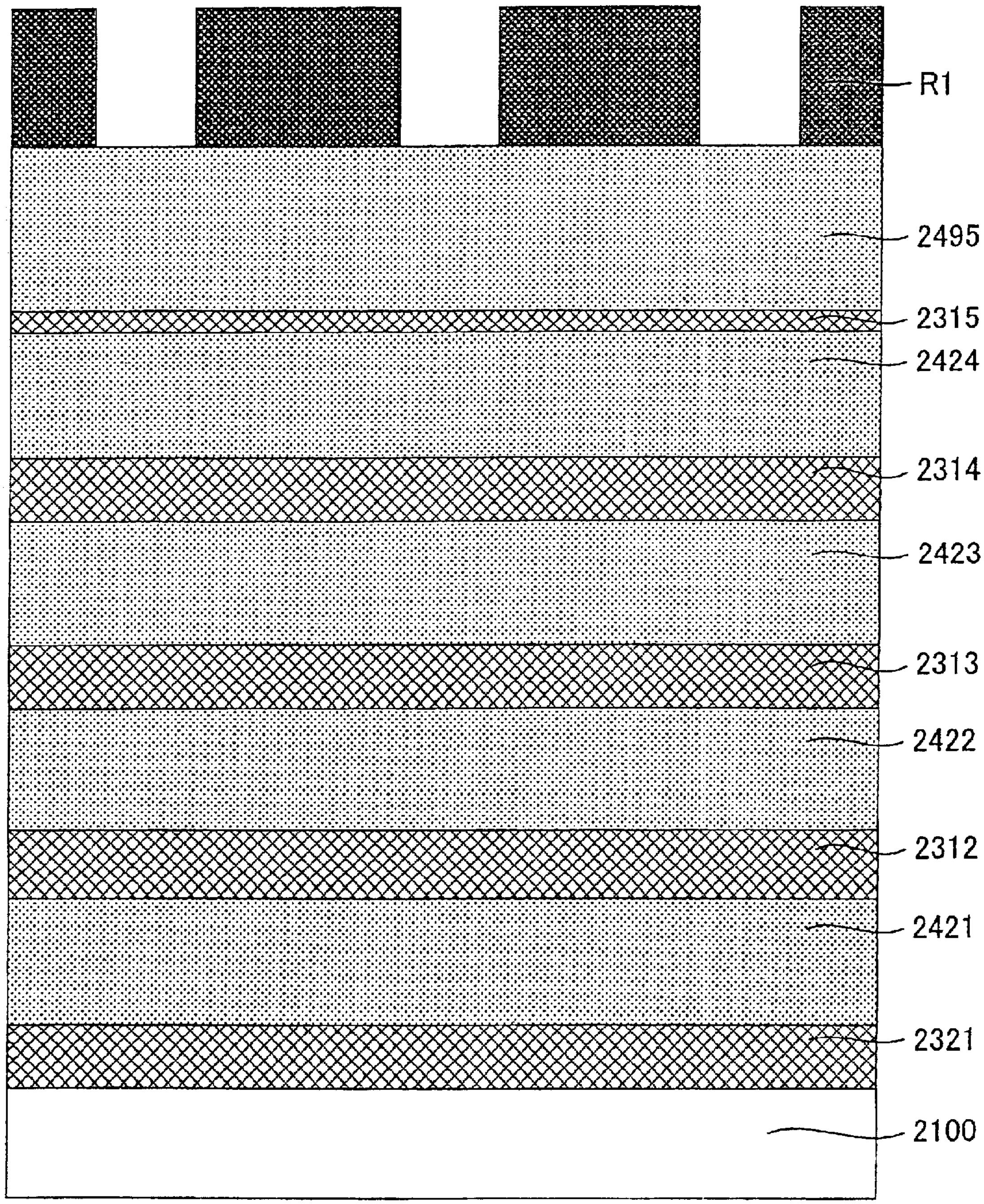

After the films are thus formed sequentially, a silicon oxide film 2424 is deposited as a third insulating film to a thickness of 50 to 500 nm, a silicon nitride film 2315 is deposited as a second insulating film to a thickness of 20 to 200 nm, and a silicon oxide film 2495 is deposited as a twenty-third insulating film to a thickness of 50 to 500 nm as shown in FIGS. 809 and 827.

Figure 810:
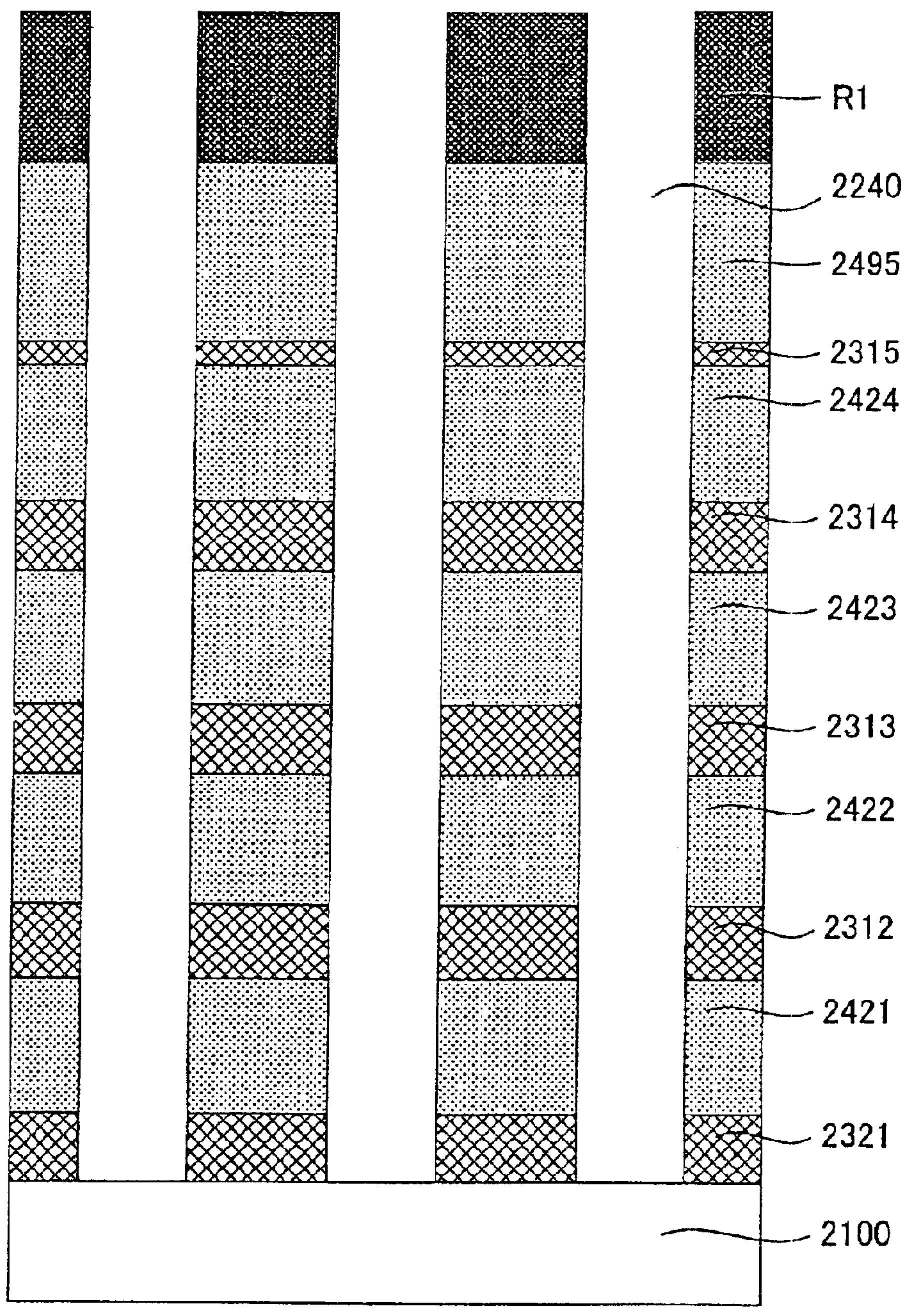
Figure 828:
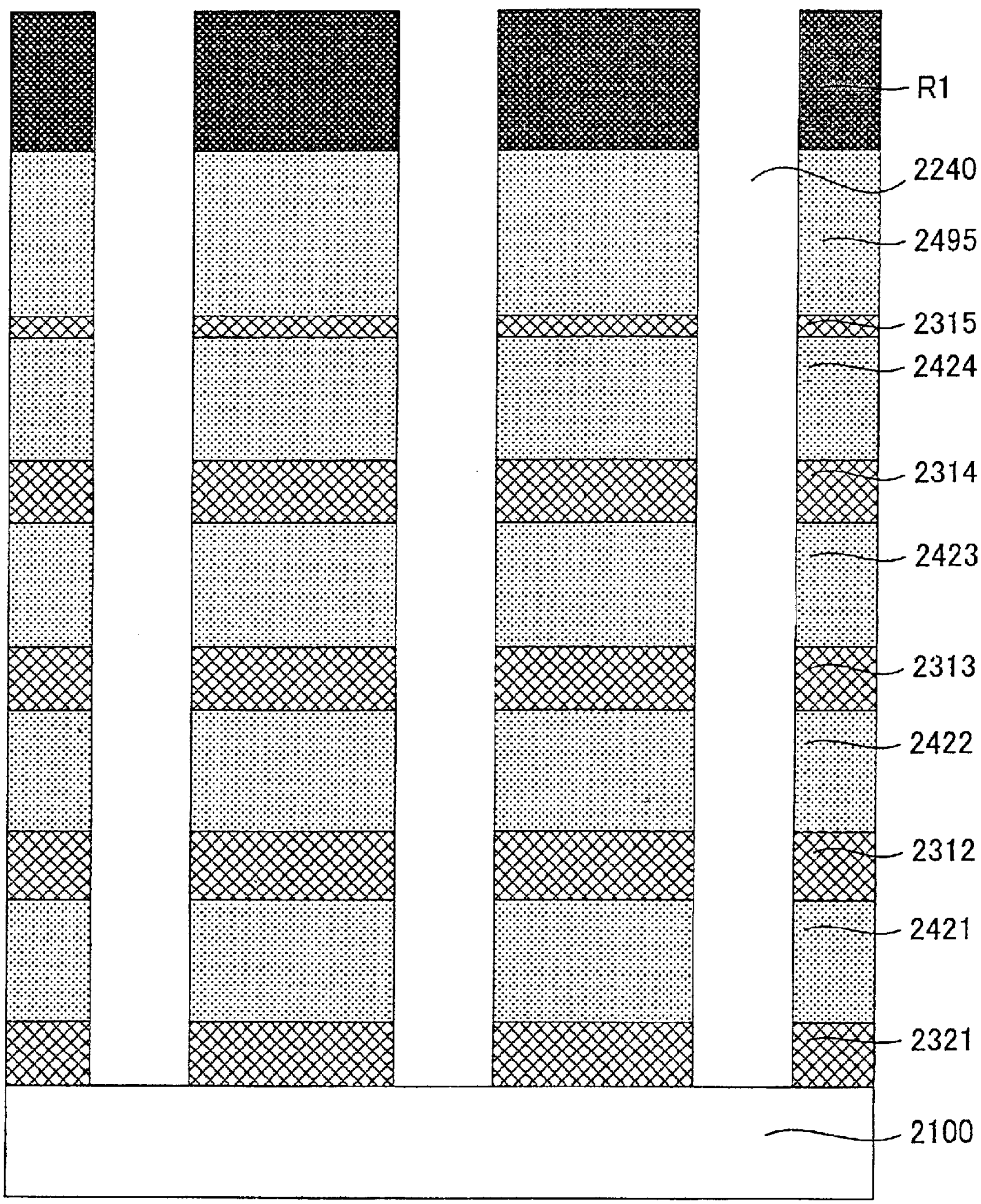

Using a resist film R1 patterned by a known photolithographic technique as a mask (FIGS. 809 and 827), reactive ion etching, for example, is performed to successively etch the silicon oxide film 2495, the silicon nitride film 2315, the silicon oxide film 2424, the silicon nitride film 2314, the silicon oxide film 2423, the silicon nitride film 2313, the silicon oxide film 2422, the silicon nitride film 2313, the silicon oxide film 2421 and the silicon nitride film 2321, thereby forming a fourth trench 2240 (FIGS. 810 and 828).

The resist film R1 is removed and then island-like semiconductor layers 2110 are filled in the fourth trench 2240. For example, the island-like semiconductor layers 2110 are formed by selective epitaxial growth from the P-type silicon substrate 2100 located at the bottom of the fourth trench 2240. The thus formed island-like semiconductor layers 2110 are flattened to be flush with the silicon nitride film 2315. The flattening may be carried out by isotropic or anisotropic etch-back, CMP, or a combination of various techniques.

Figure 811:
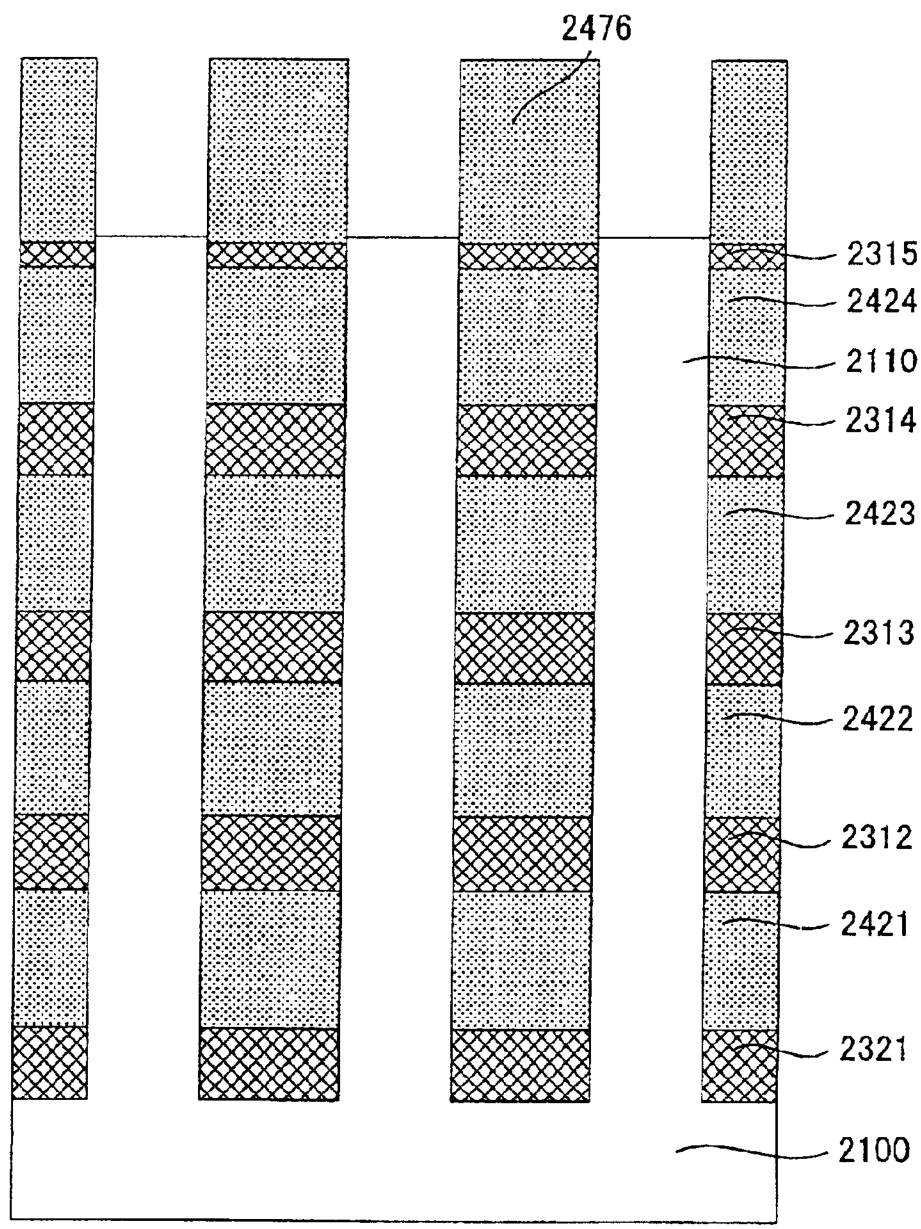
Figure 812:
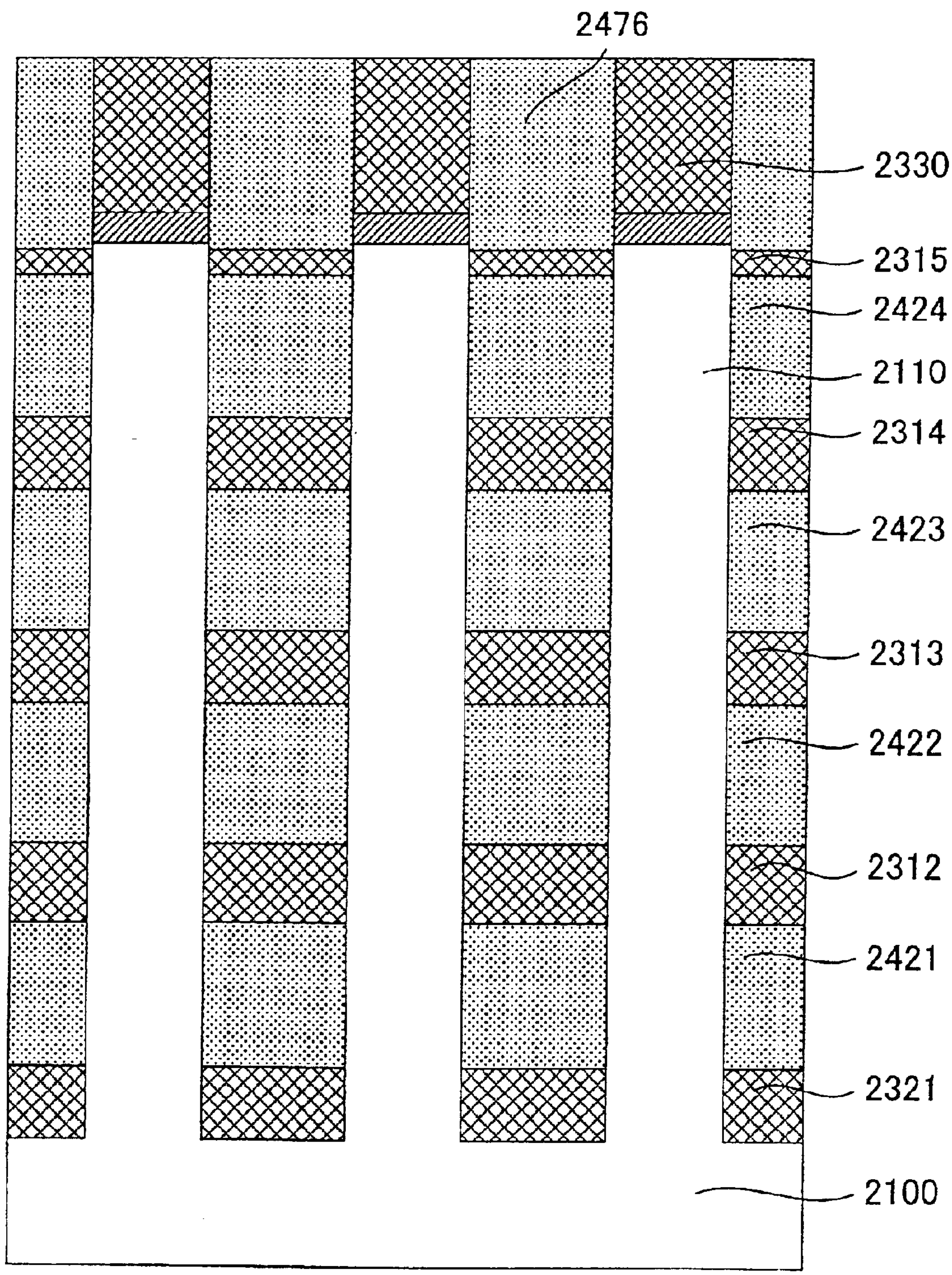
Figure 829:
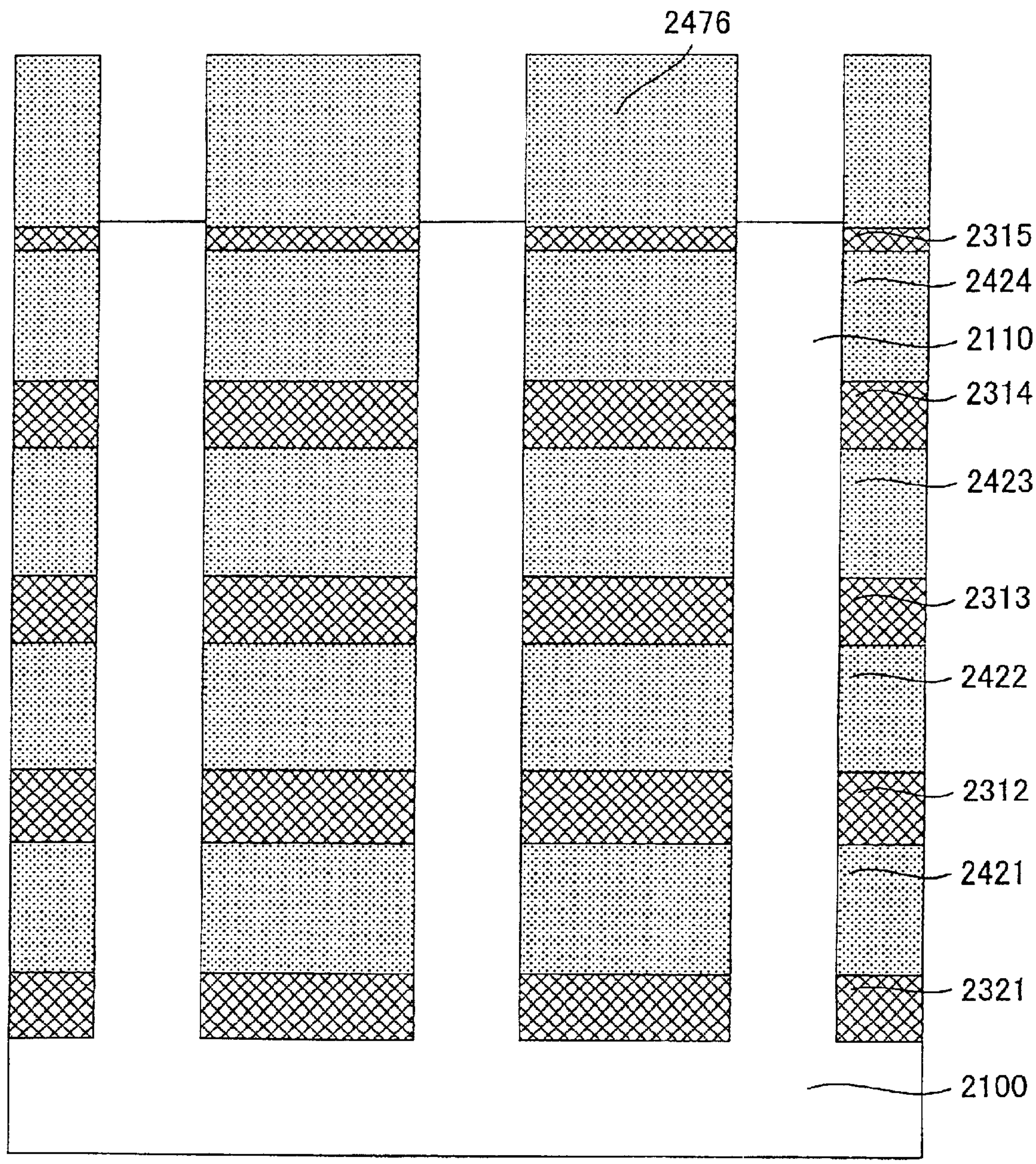
Figure 830:
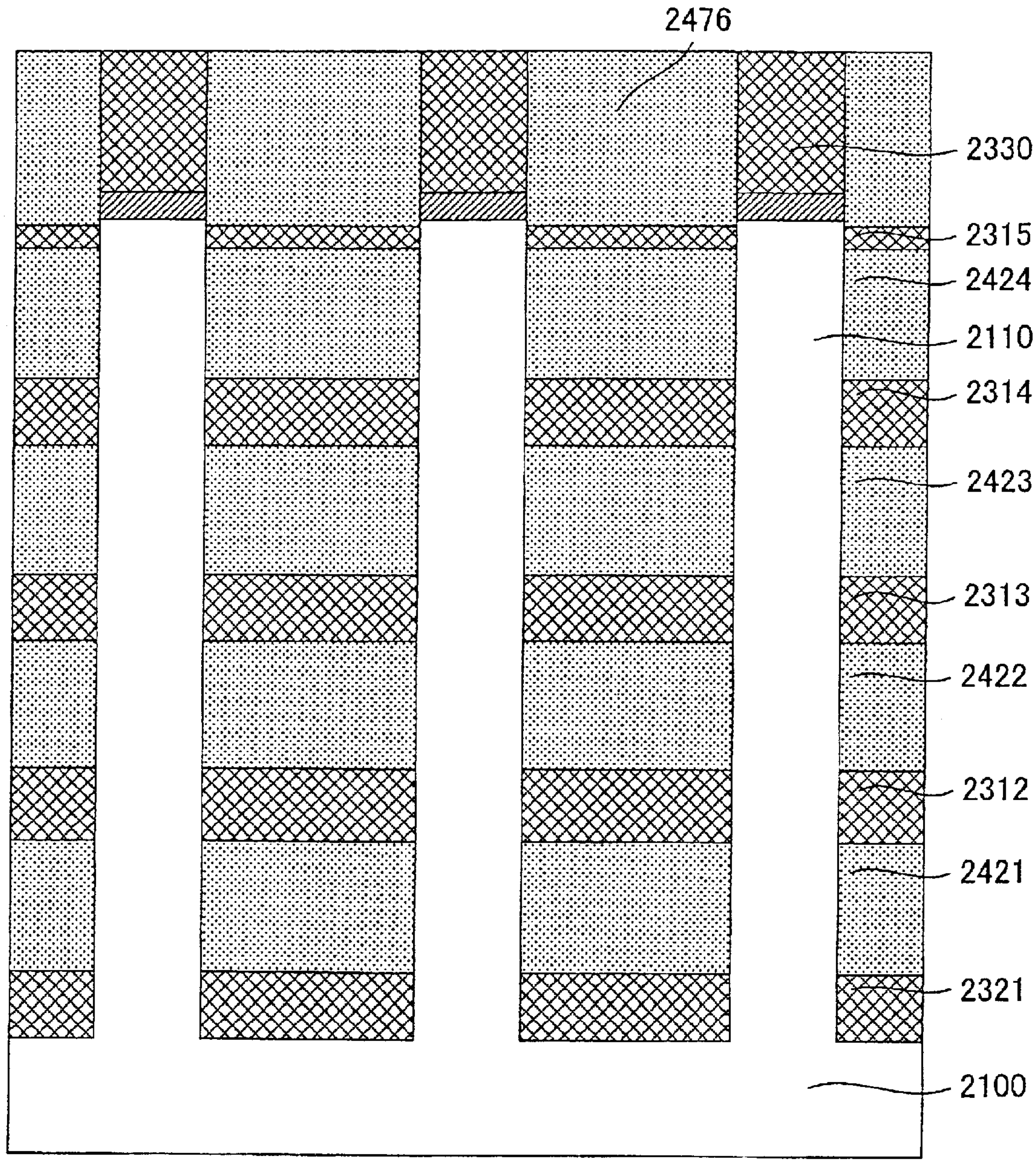

The island-like semiconductor layers 2110 are anisotropically etched back almost to a height where the top of the silicon nitride film 2315 is positioned (FIGS. 811 and 829). Further, a polysilicon film 2540 (a fourth conductive film) and a silicon nitride film 2330 (a fifth insulating film) are buried (FIGS. 812 and 830).

Subsequently, the silicon oxide film 2495 is removed, for example, by isotropic etching. Then, a silicon nitride film 2340, for example, is deposited as a sixth insulating film to a thickness of about 20 to 200 nm and anisotropically etched back into the form of a sidewall spacer. At this time, the silicon nitride film 2315 is etched simultaneously by using the sidewall spacer as a mask. However, the silicon nitride film 2315 may not necessarily be etched simultaneously with the formation of the sidewall spacer.

Figure 813:
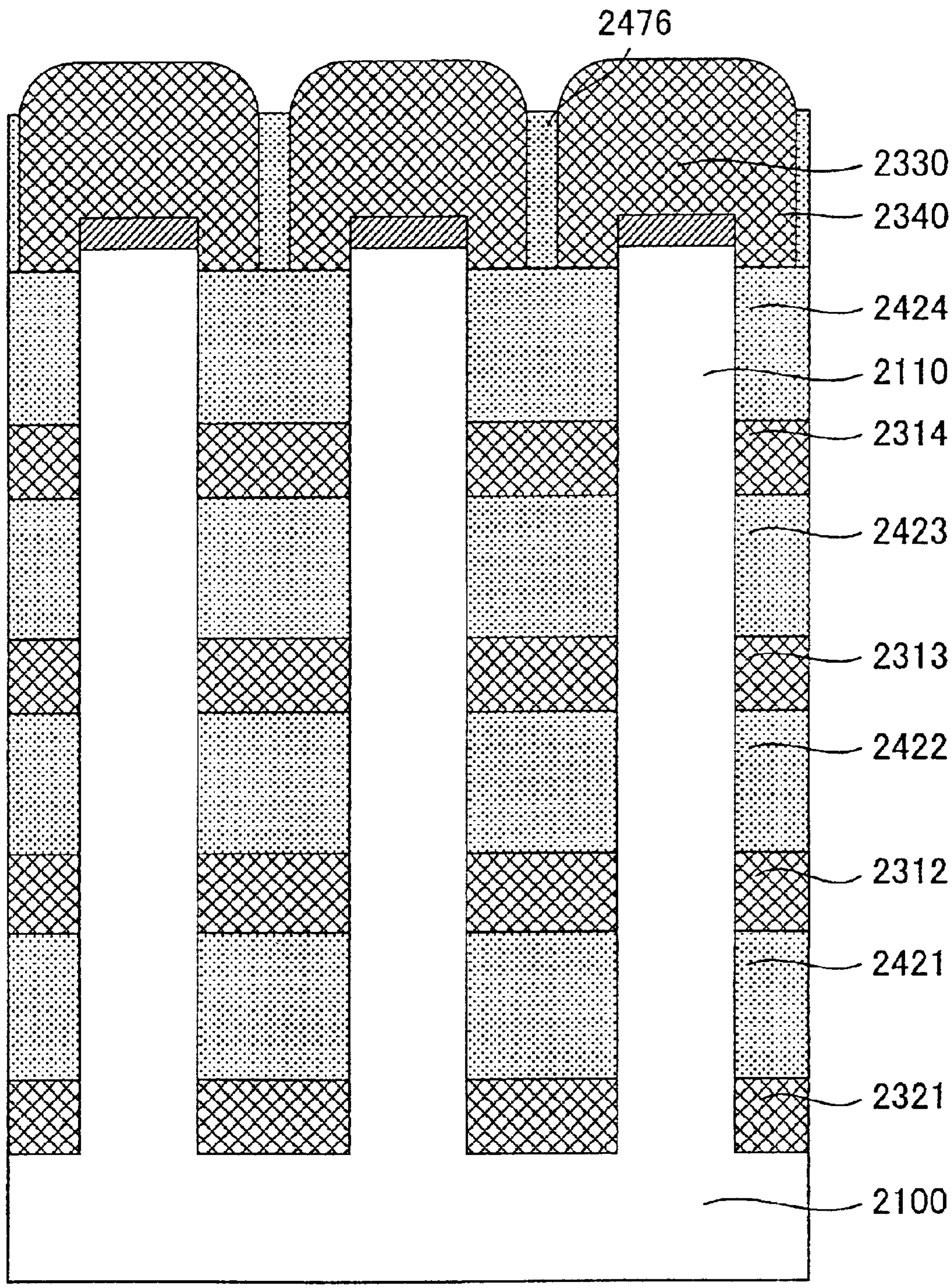
Figure 831:
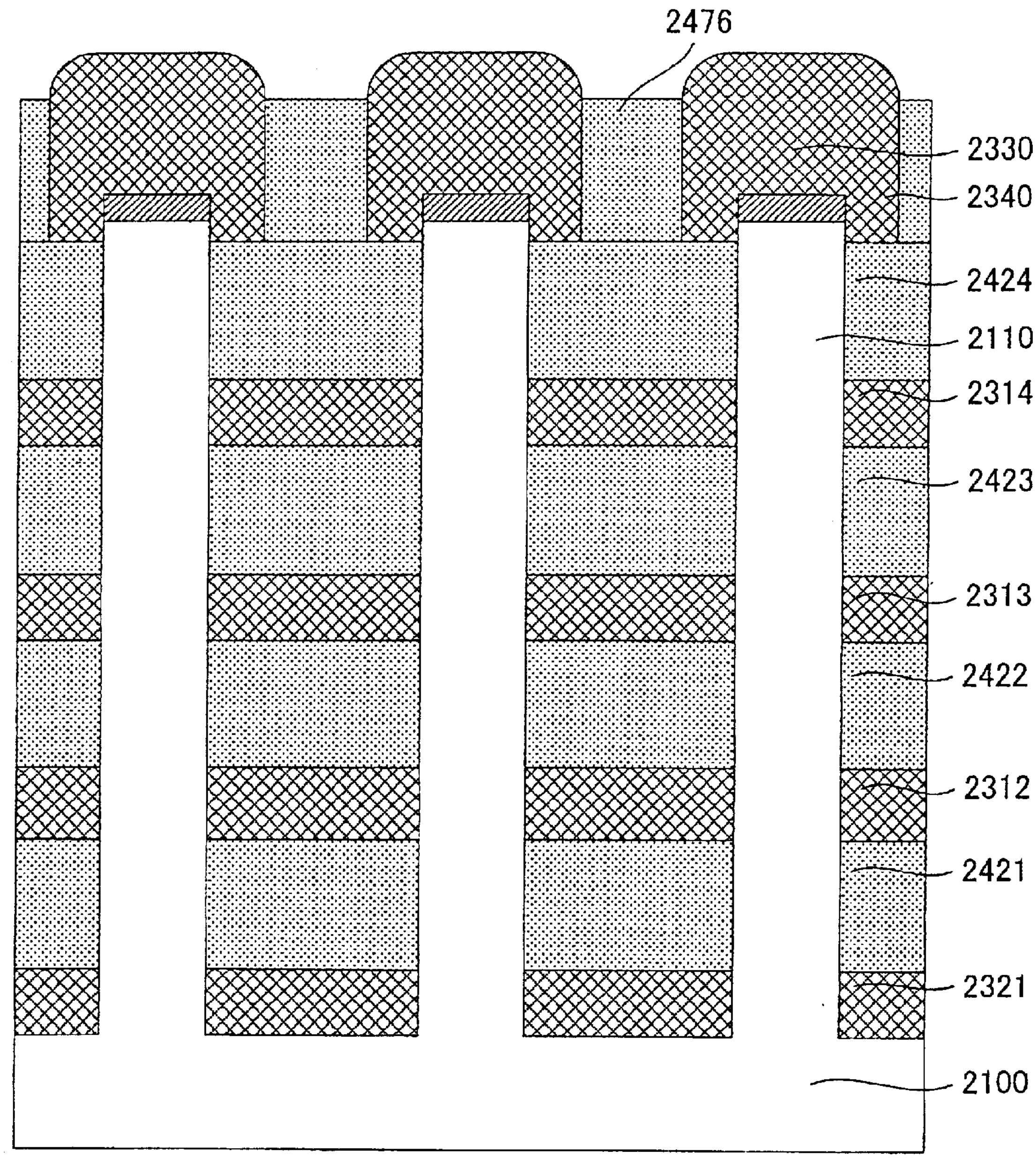

Thereafter, a silicon oxide film 2496, for example, is deposited as a twenty-third insulating film to a thickness of 50 to 500 nm and is etched back to such a degree that the top surfaces of the silicon nitride films 2330 and 2340 are exposed (FIGS. 813 and 831).

Figure 814:
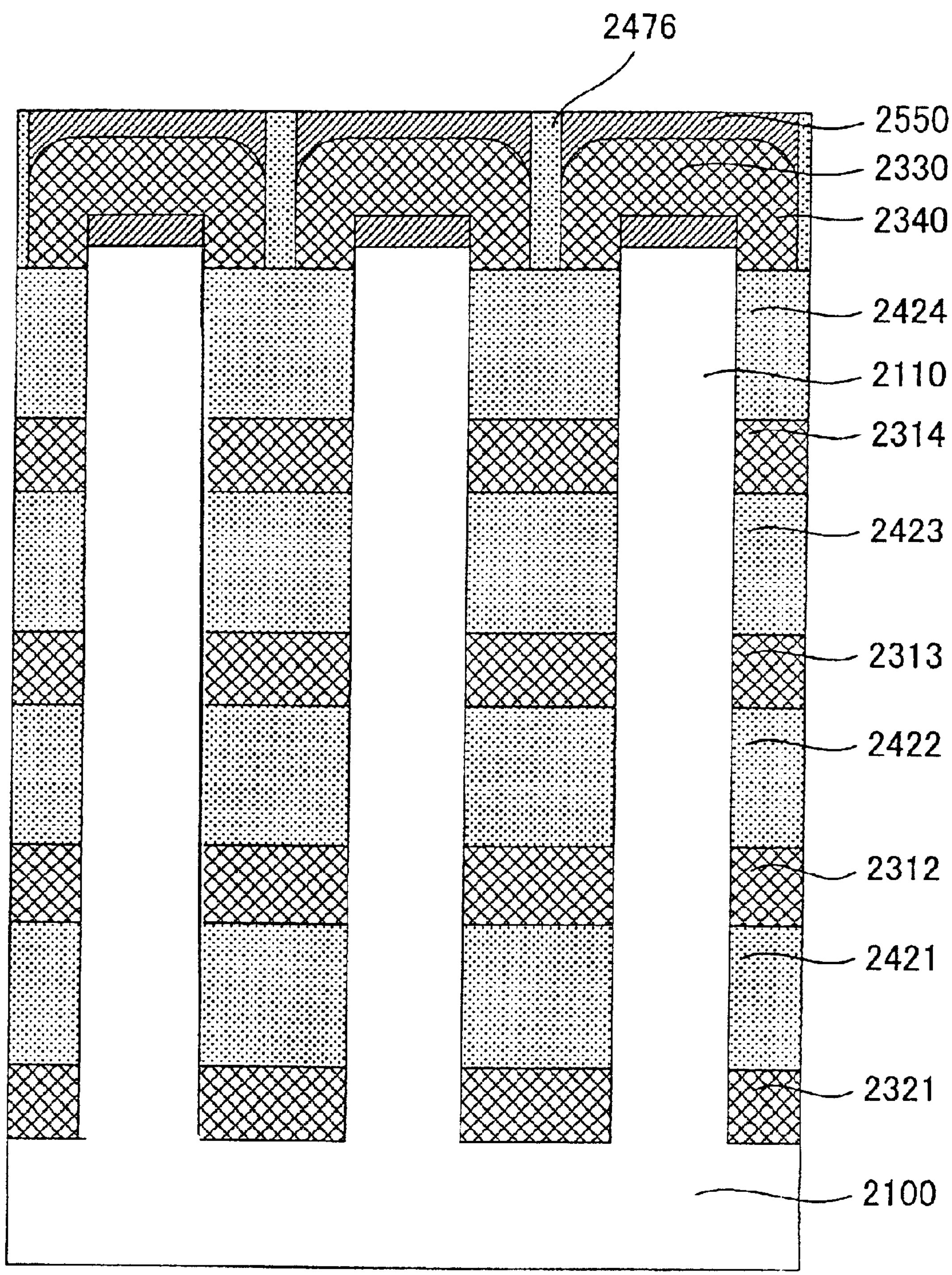
Figure 832:
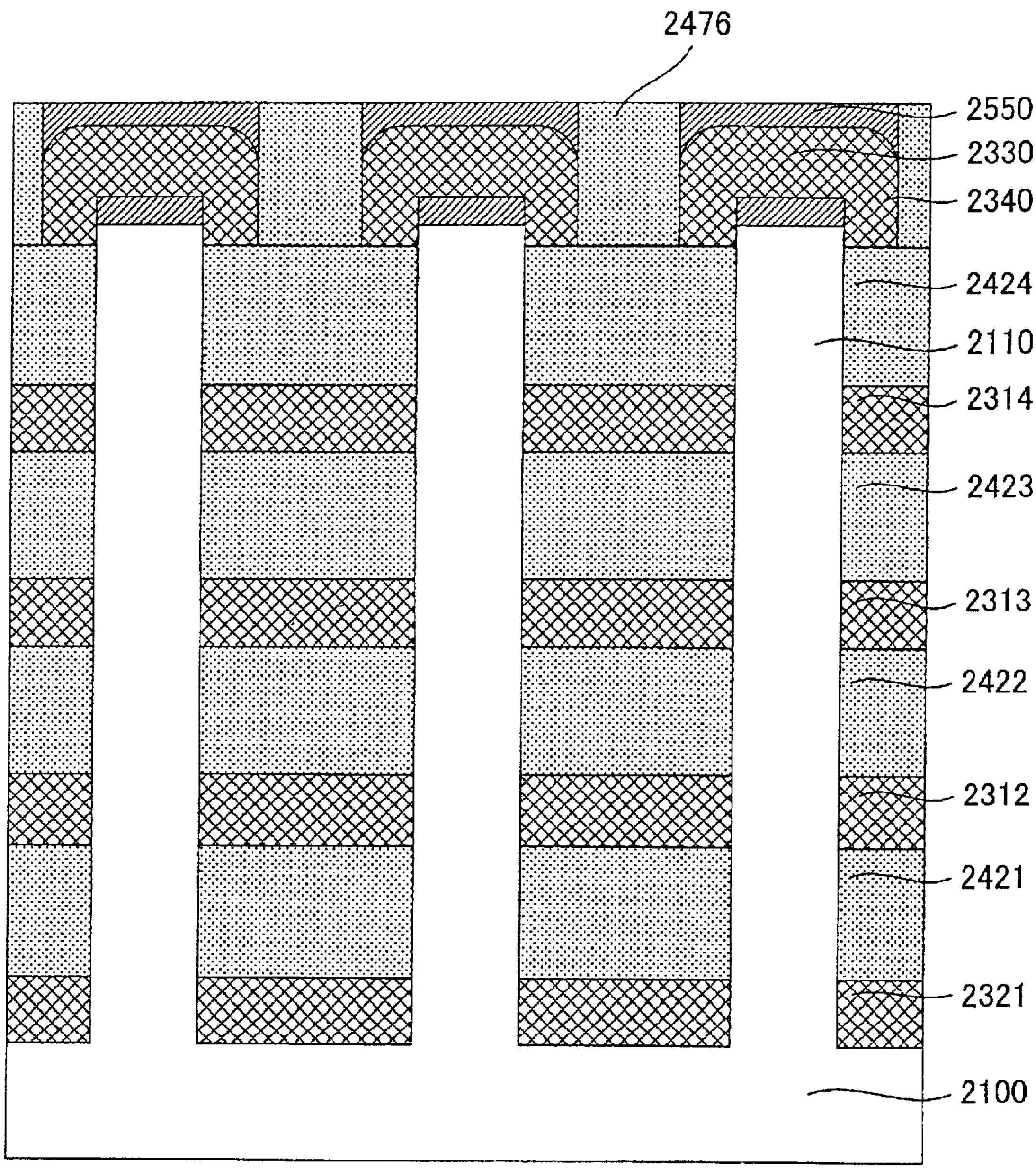

Further, the silicon nitride films 2330 and 2340 are etched back such that at least the top surfaces thereof are disposed at a level lower than the top of the silicon oxide film 2496. Then, a polysilicon film 2550, for example, is deposited as a fifth conductive film to a thickness of about 15 to 150 nm. The polysilicon film 2550 is flattened to be flush with the silicon oxide film 2496 (FIGS. 814 and 832). At this time, the flattening may be carried out by isotropic or anisotropic etch-back, CMP or a combination of various techniques. If the thicknesses of the silicon nitride films 2330 and 2340 are greater than the total thickness of the silicon nitride films 2314, 2313, 2312 and 2321, the polysilicon film 2550 may not be used. Further, the polysilicon film 2550 may not necessarily be a conductive film but may be formed of a material different from the silicon oxide film and the silicon nitride film.

Figure 815:
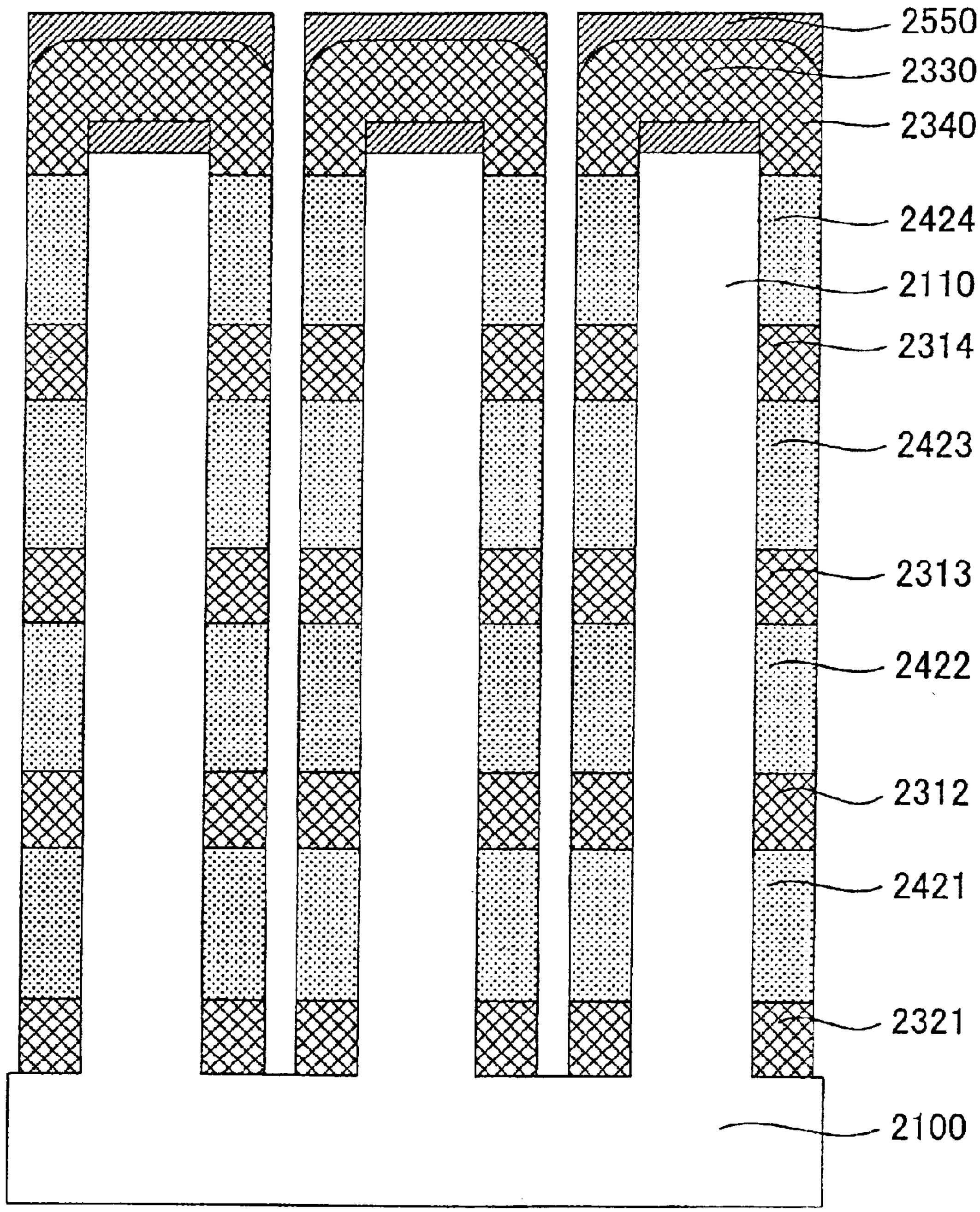
Figure 833:
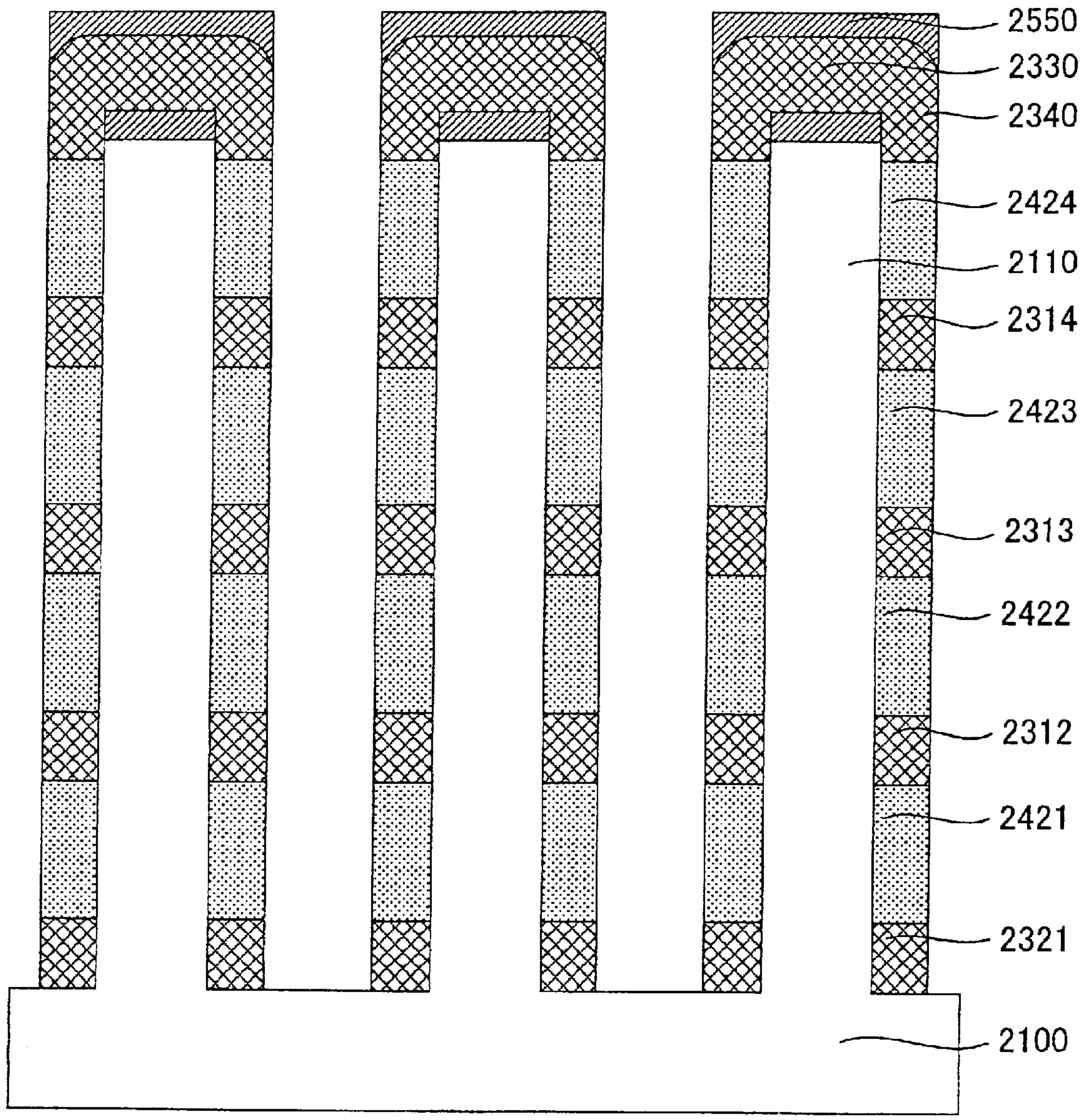

The silicon oxide film 2496 is removed, for example, by isotropic etching. Then, using the polysilicon film 2550 as a mask, reactive ion etching, for example, is performed to successively etch the silicon oxide film 2424, the silicon nitride film 2314, the silicon oxide film 2423, the silicon nitride film 2313, the silicon oxide film 2422, the silicon nitride film 2312, the silicon oxide film 2421 and the silicon nitride film 2321, thereby exposing the P-type silicon substrate 2100 (FIGS. 815 and 833). At this time, the silicon nitride film 2321 may remain.

Figure 816:
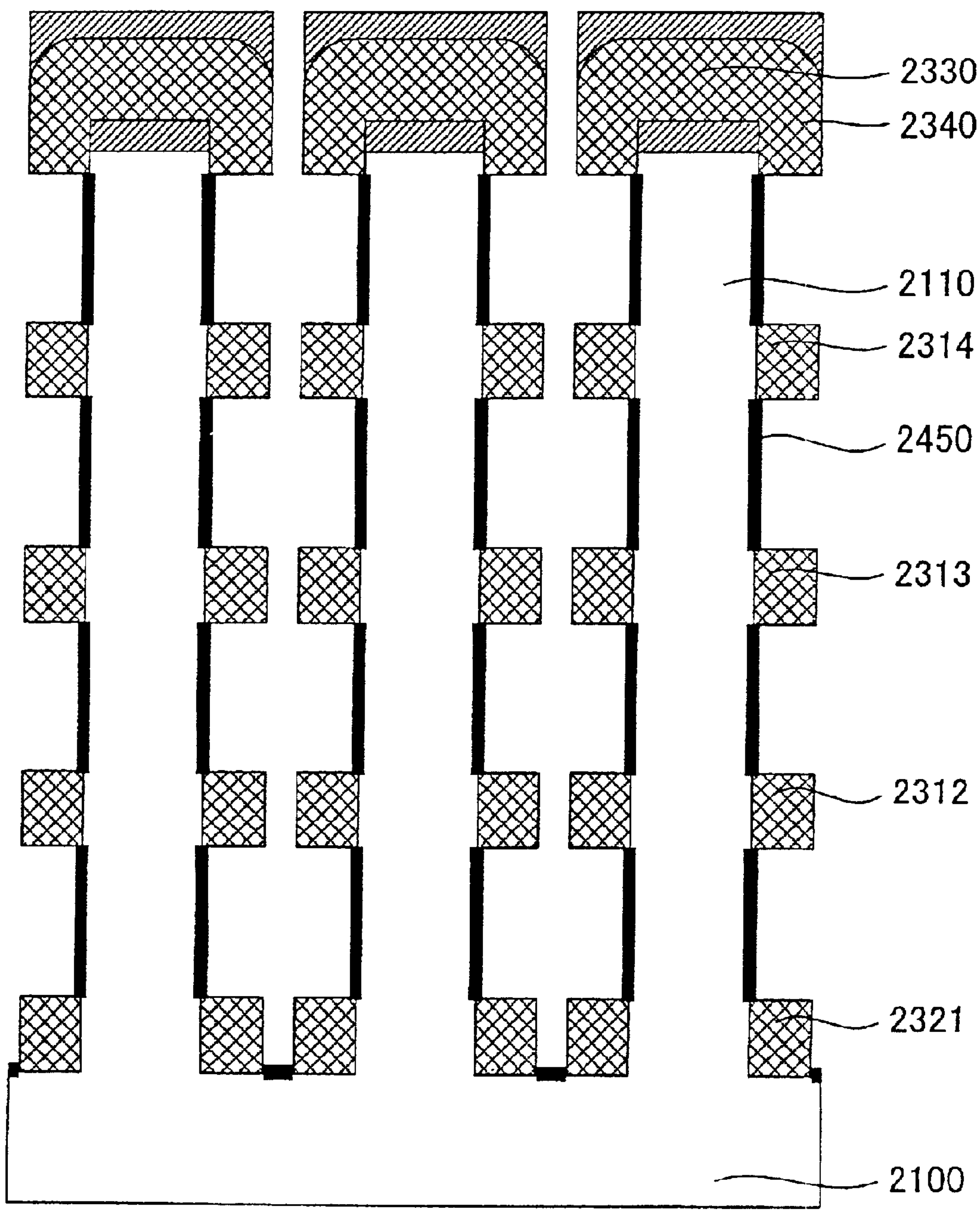
Figure 834:
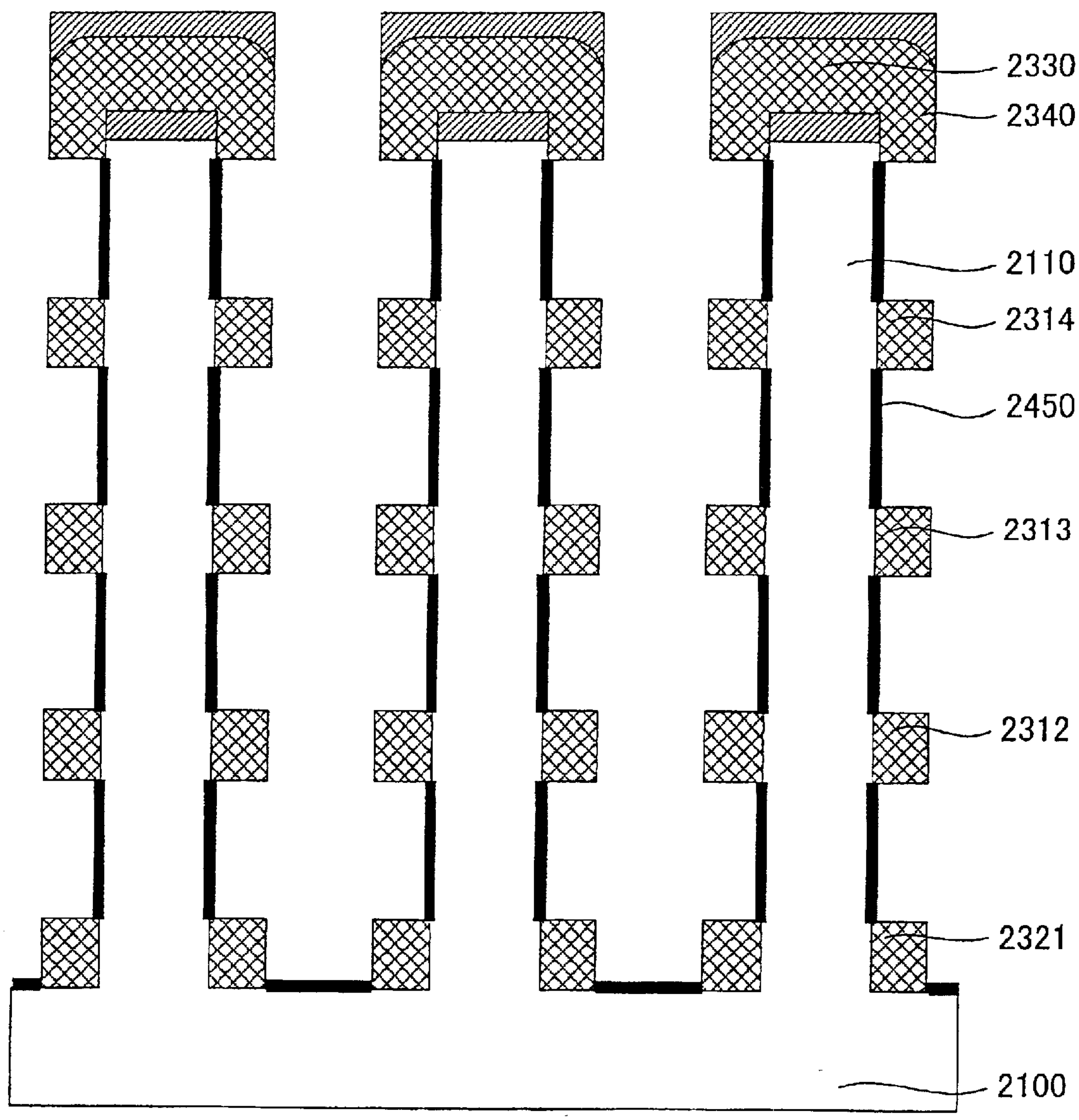

Thereafter, the silicon oxide films 2421, 2422, 2423 and 2424 (the third insulating films) are removed, for example, by isotropic etching to expose the sides of the island-like semiconductor layers 2110. Then, the surface of each island-like semiconductor layer 2110 is oxidized to form, for example, a thermally oxidized film 2450 of about 10 to 100 nm thick as a ninth insulating film (FIGS. 816 and 834).

Next, the thermally oxidized film (the ninth insulating film) 2450 is etched away from the periphery of each island-like semiconductor layer 2110, for example, by isotropic etching. Then, as required, channel ion implantation is carried out into the sidewall of the island semiconductor layer 2110 by slant ion implantation. For example, the ion implantation may be performed at an implantation energy of 5 to 100 keV at a boron dose of about $1\times10^{11}$ to $1\times10^{13}/cm^2$ at an angle of 5 to 45° with respect to the normal line of the surface of the substrate. Preferably the channel ion implantation is performed from various directions to the island-like semiconductor layers 2110 because a surface impurity concentration becomes more uniform. Alternatively, instead of the channel ion implantation, an oxide film containing boron may be deposited by CVD with a view to utilizing diffusion of boron from the oxide film. The impurity implantation from the surface of the island-like semiconductor layers 2110 may be carried out before the island-like semiconductor layers 2110 are covered with the thermally oxidized film 2450, or during the formation of the island-like semiconductor layers 2110. Alternatively, the impurities may be introduced to the silicon oxide films 2421, 2422, 2423 and 2424 in advance with a view to implanting the impurities in the island-like semiconductor layers 2110 by thermal treatment or the like before removing the silicon oxide films 2421, 2422, 2423 and 2424. Means for the implantation are not particularly limited so long as an impurity concentration distribution is almost equal over the island-like semiconductor layers 2110.

Figure 817:
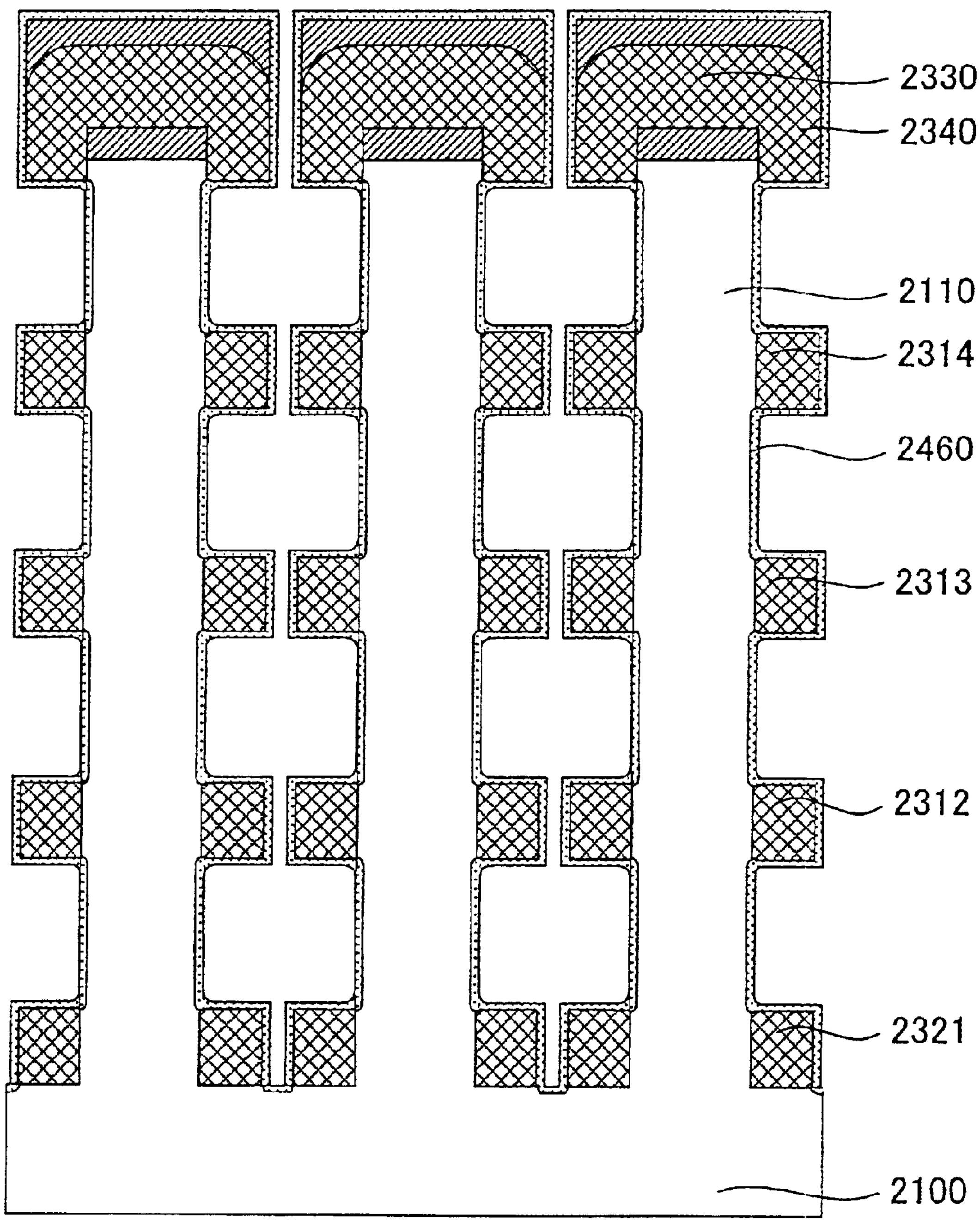
Figure 835:
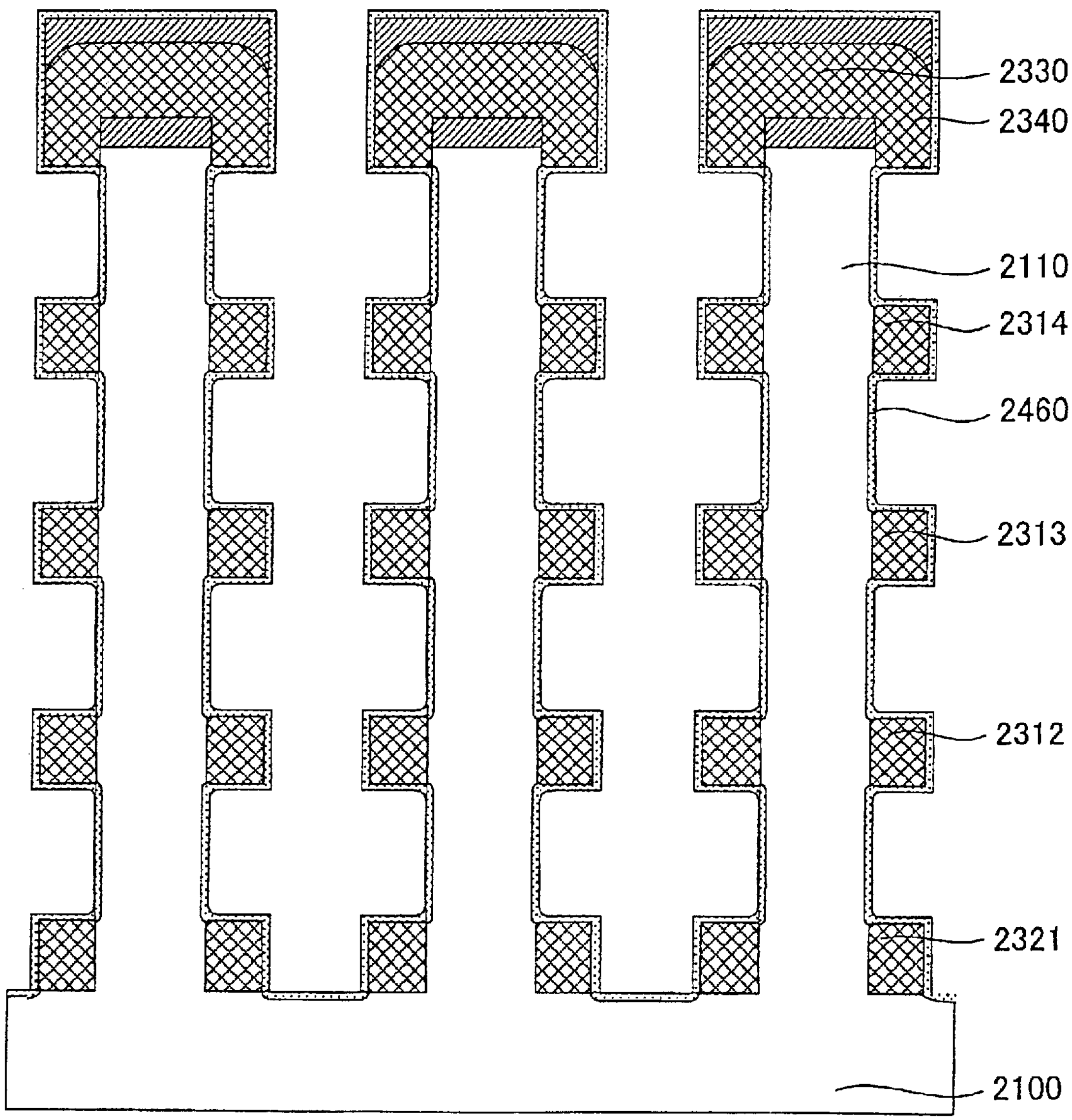

Subsequently, a silicon oxide film 2460, for example, is formed as a tenth insulating film to be a tunnel oxide film to a thickness of about 10 nm around each island-like semiconductor layer 2110, for example, by CVD (FIGS. 817 and 835). The tunnel oxide film, however, may be formed of not only a CVD oxide film but also a thermally oxidized film or a nitrogen oxide film.

Figure 818:
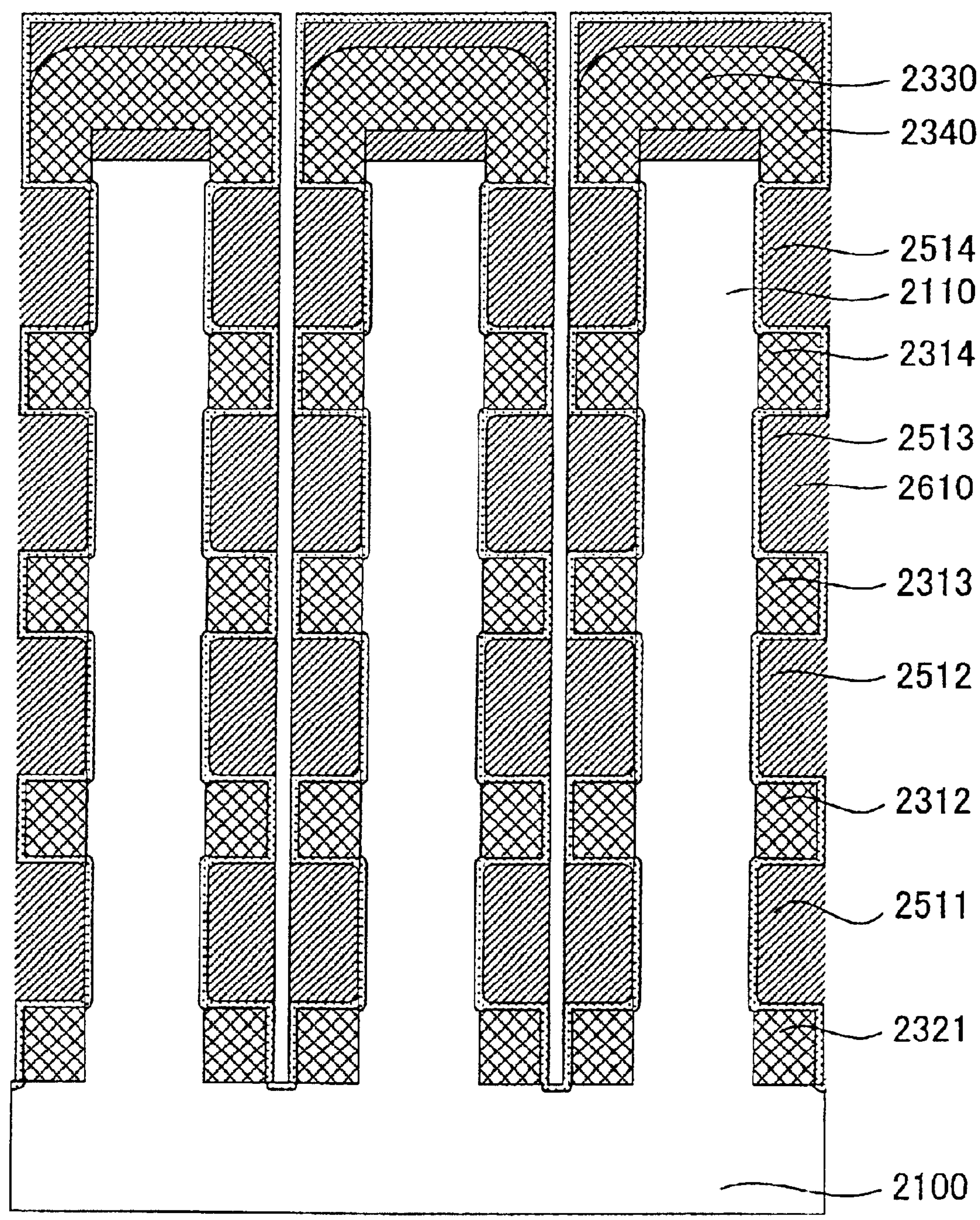
Figure 836:
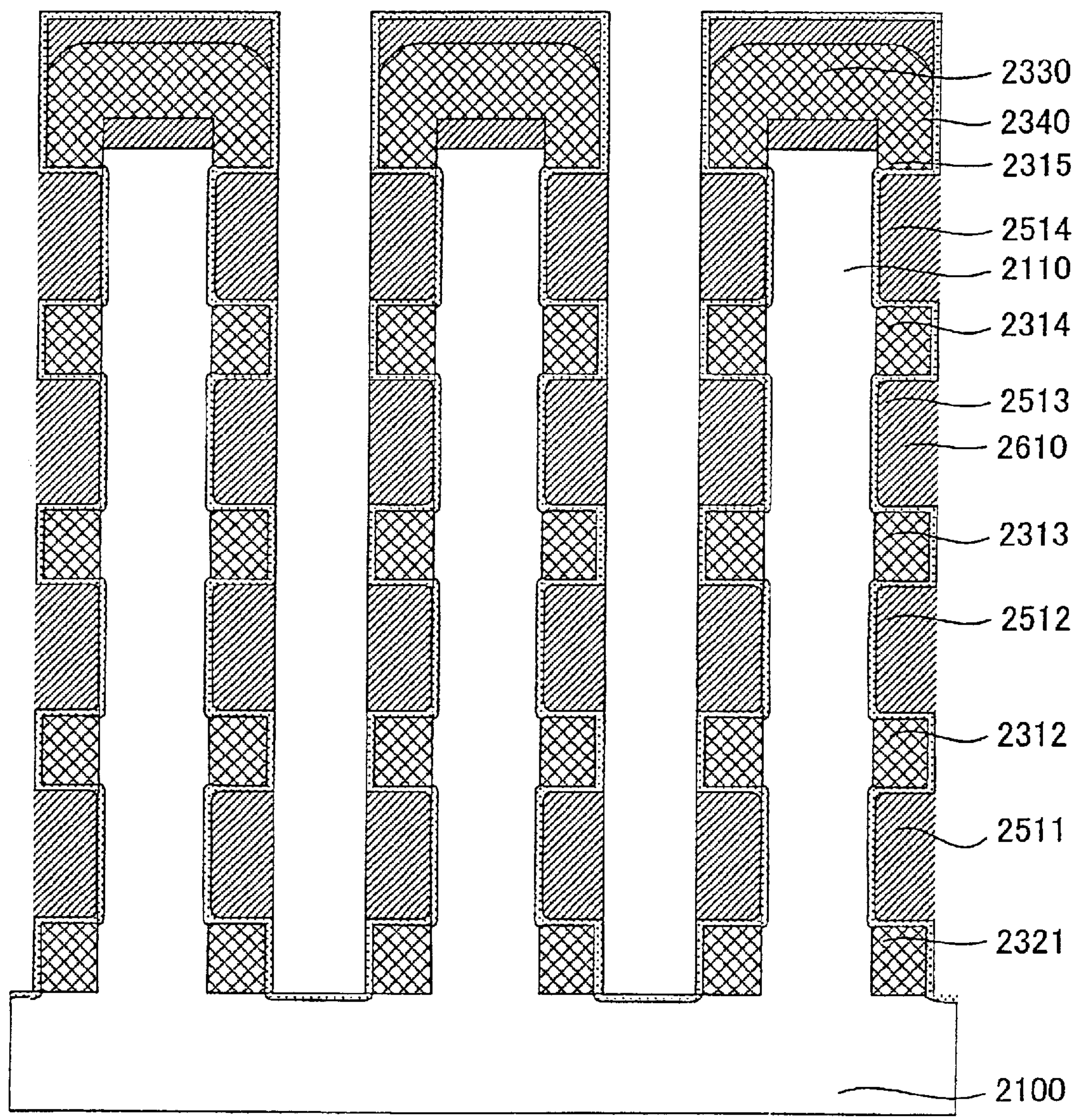

Then, a polysilicon film 2510, for example, is deposited as a first conductive film to a thickness of about 50 to 200 nm. Using the silicon nitride films 2314, 2313 and 2312 (the second insulating films) as a mask, the polysilicon film 2510 is divided into polysilicon films 2511, 2512, 2513 and 2514, for example, by anisotropic etching (FIGS. 818 and 836).

Figure 819:
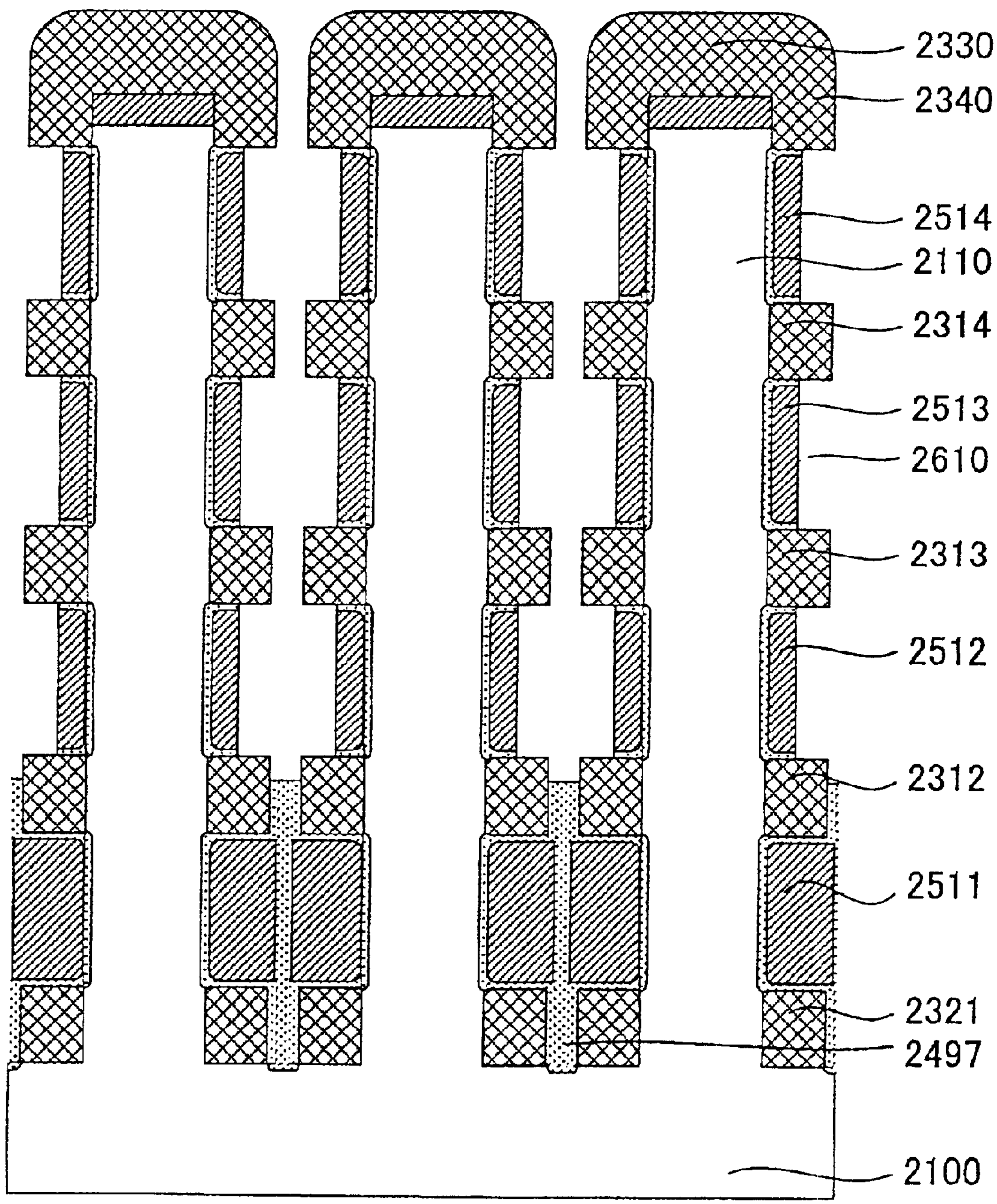
Figure 837:
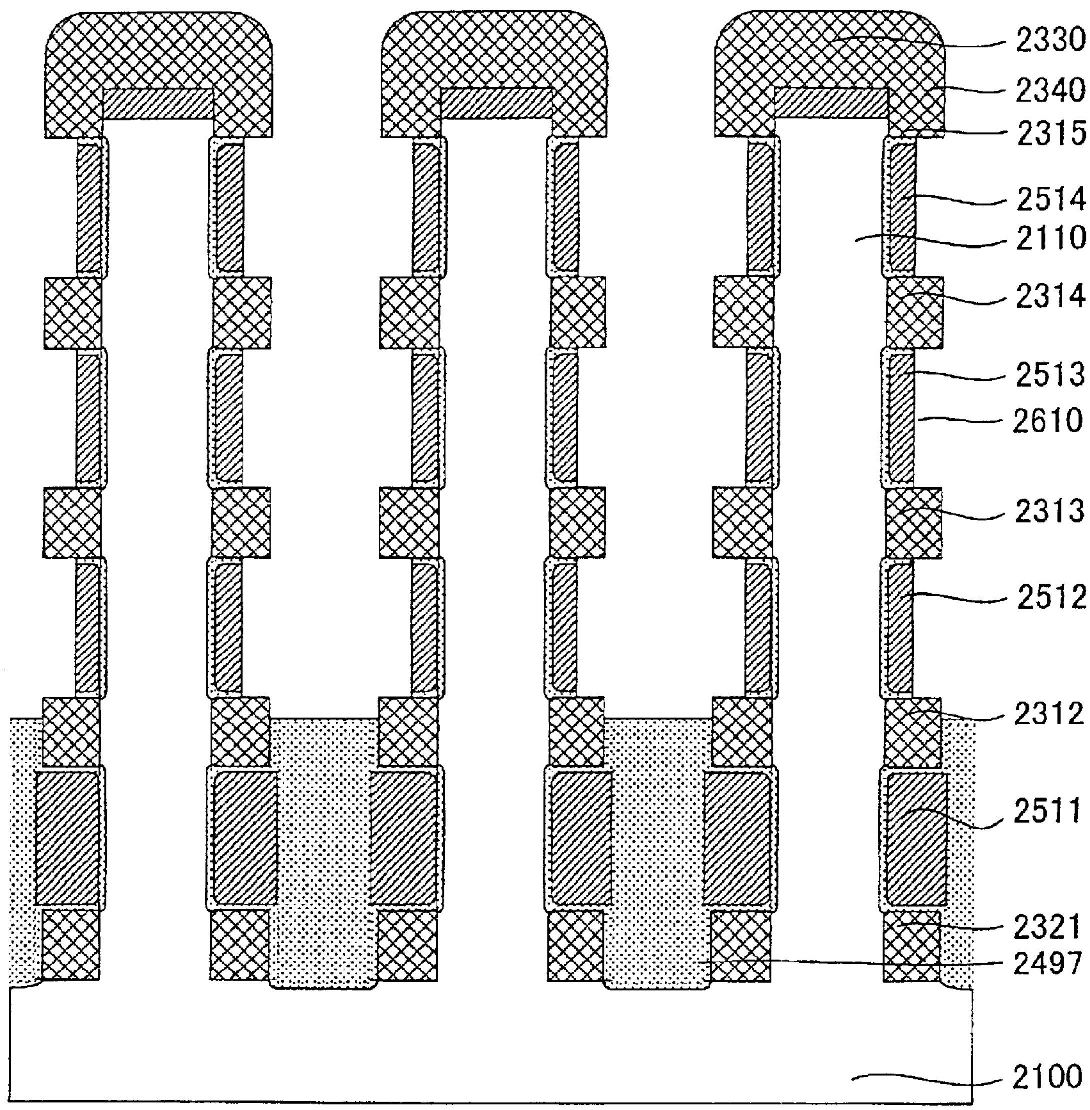

A silicon oxide film 2497, for example, is then deposited to a thickness of 50 to 500 nm as a twenty-third insulating film. The silicon oxide film 2470 is buried by isotropic etching such that at least the polysilicon film 2511 (the first conductive film) is embedded (FIGS. 819 and 837).

Subsequently, the polysilicon films 2512, 2513 and 2514 are reduced in a horizontal direction, for example, by isotropic etching to such a degree that the tunnel oxide film disposed on the side of the island-like semiconductor layer 2110 is not exposed.

Thereafter, an interlayer insulating film 2612 is formed on exposed surfaces of the polysilicon films 2512 to 2514. This interlayer insulating film 2612 may be formed of an ONO film, for example. The ONO film may be formed in the same manner as in Production example 1.

Figure 820:
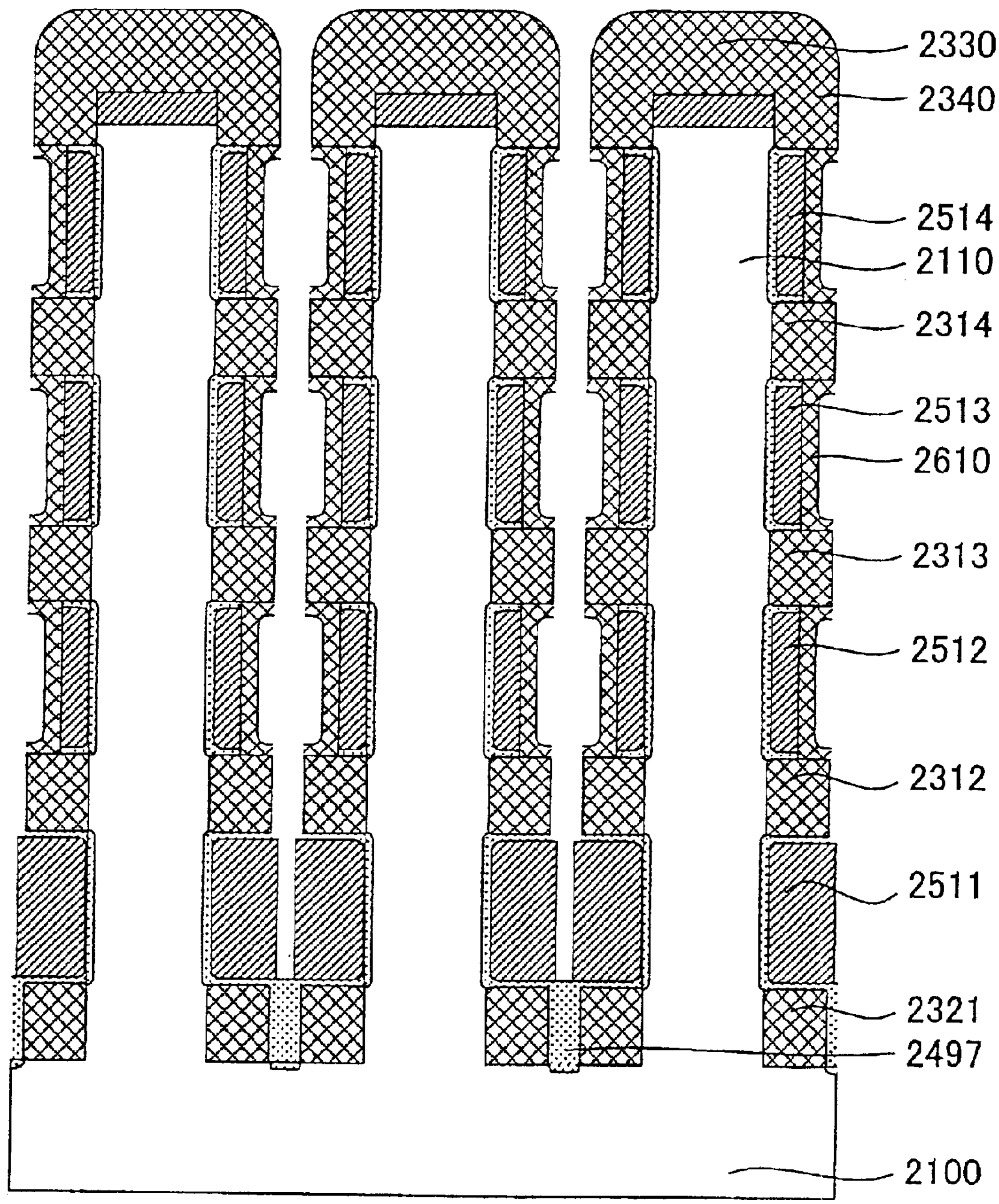
Figure 838:
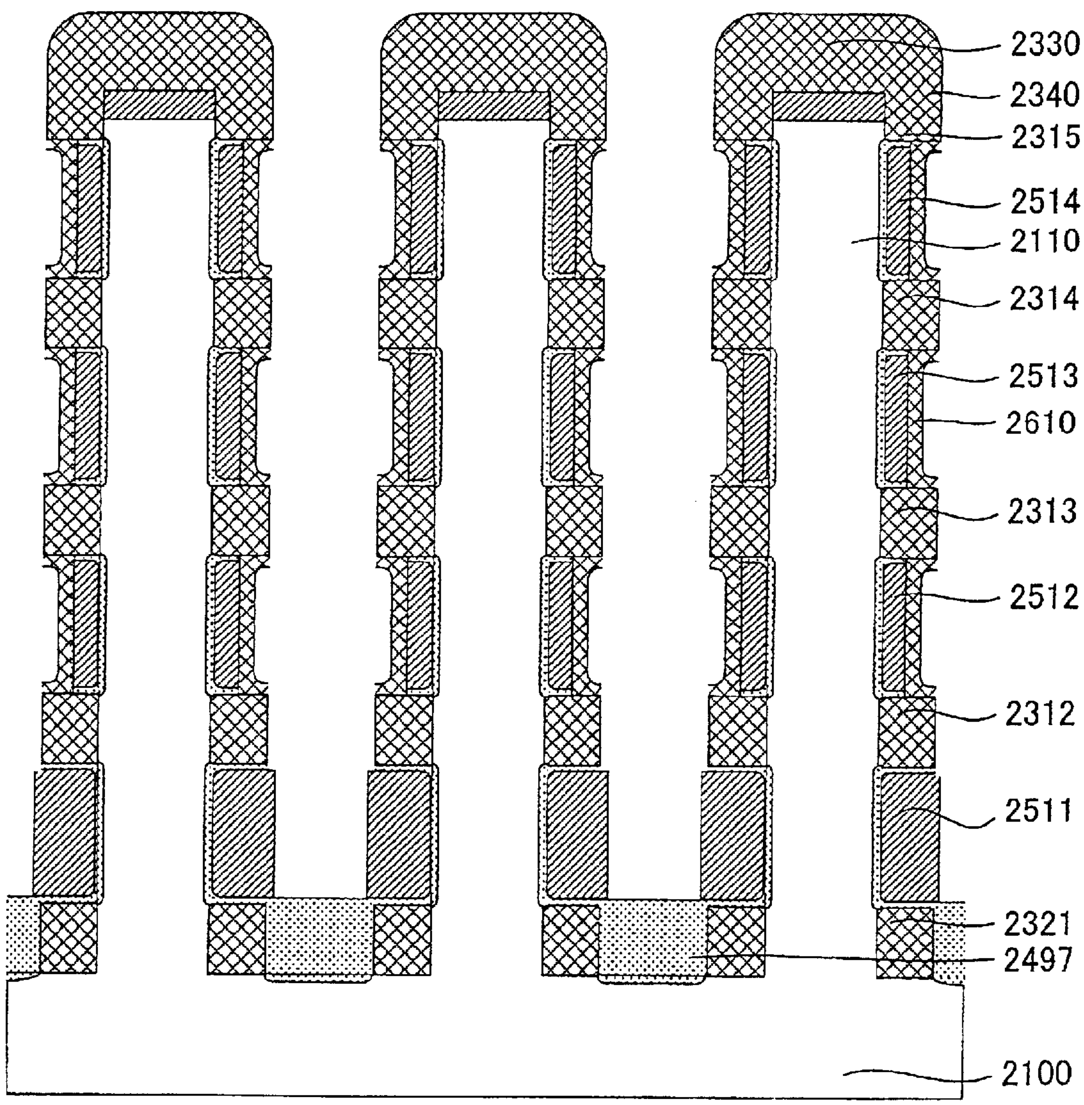

The interlayer insulating film 2612 and the silicon oxide film 2497 are etched back anisotropically by using the silicon nitride films 2330 and 2340 as a mask, thereby exposing the polysilicon film 2511 (the first conductive film) (FIGS. 820 and 838).

Figure 821:
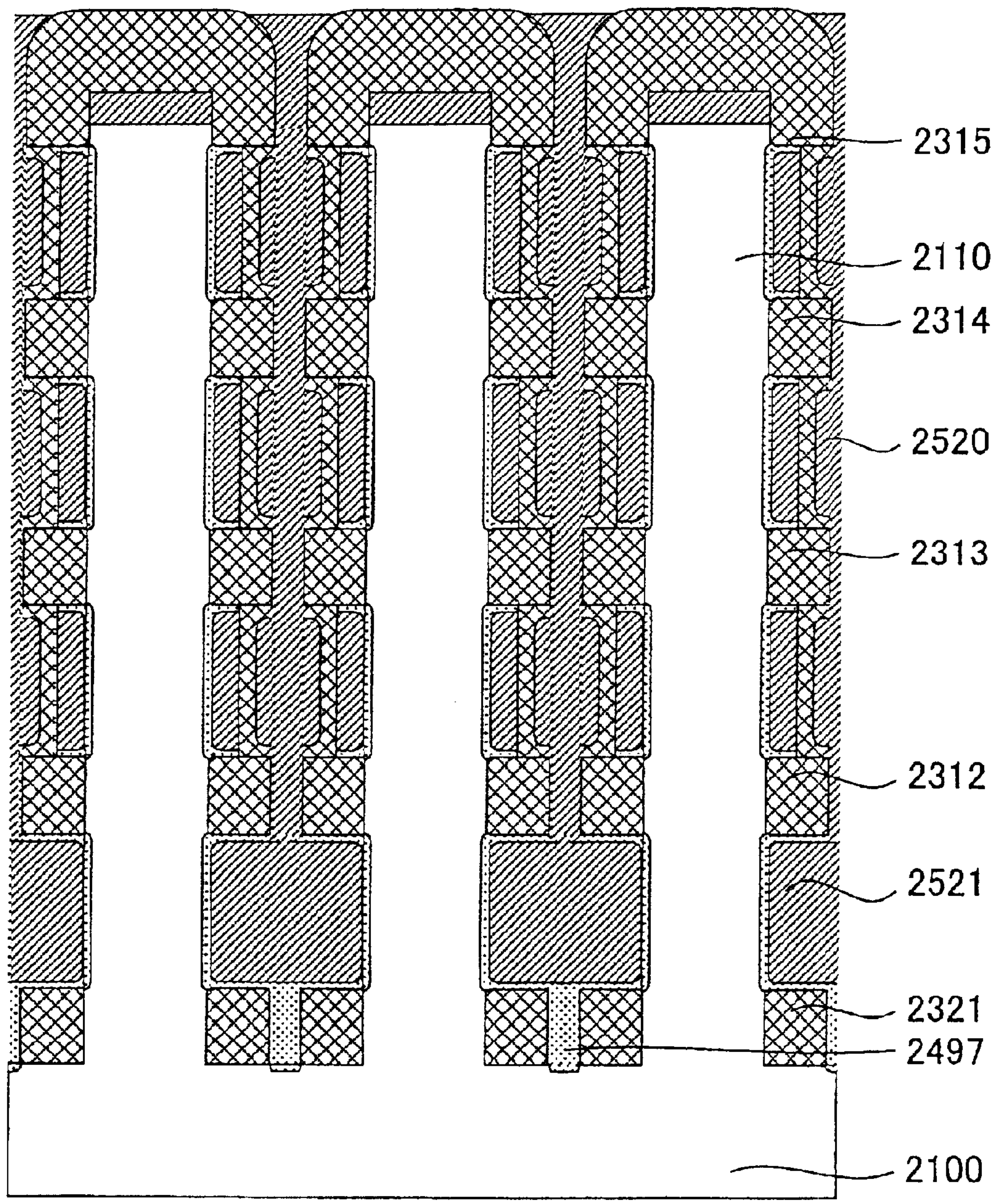
Figure 839:
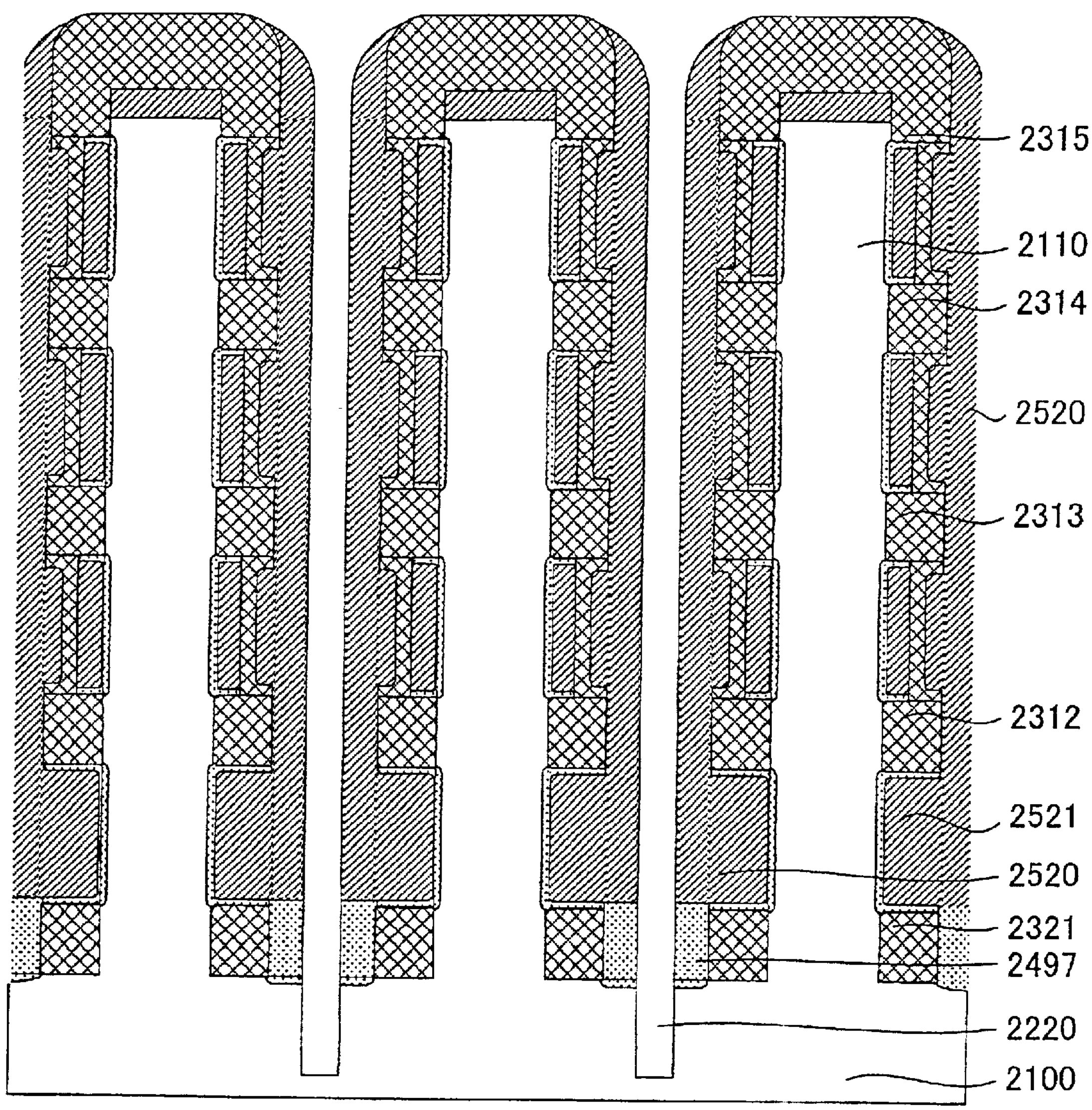

Then, a polysilicon film 2520, for example, is deposited as a second conductive film to a thickness of about 15 to 150 nm and then anisotropically etched back. Subsequently, the silicon oxide film 2470 (the eleventh insulating film) and the P-type silicon substrate 2100 are successively etched to form a second trench 2200 in the P-type silicon substrate 2100 in self-alignment with the polysilicon film 2520 (the second conductive film) (FIGS. 821 and 839).

A silicon oxide film 2470, for example, is buried as an eleventh insulating film in the second trench 2220. Using the silicon nitride films 2330 and 2340 as a mask, the polysilicon film 2520 is etched back to such a degree that the polysilicon film 2520 is able to contact the polysilicon film 2511 to form a selection gate and is divided into polysilicon films 2522, 2523 ad 2524. At this time, by setting the intervals between the island-like semiconductor layers 2110 in a direction of A-A' in FIG. 1 to a predetermined value or smaller, the polysilicon film 2520 is formed into a second wiring layer to be a selection gate line continuous in the direction without need to use a masking process.

Then, the silicon oxide film 2497 is removed by isotropic etching, for example, and the silicon nitride films 2312 to 2315 (the second insulating films) and the silicon nitride film 2321 (the fourth insulating film) are selectively removed.

Figure 822:
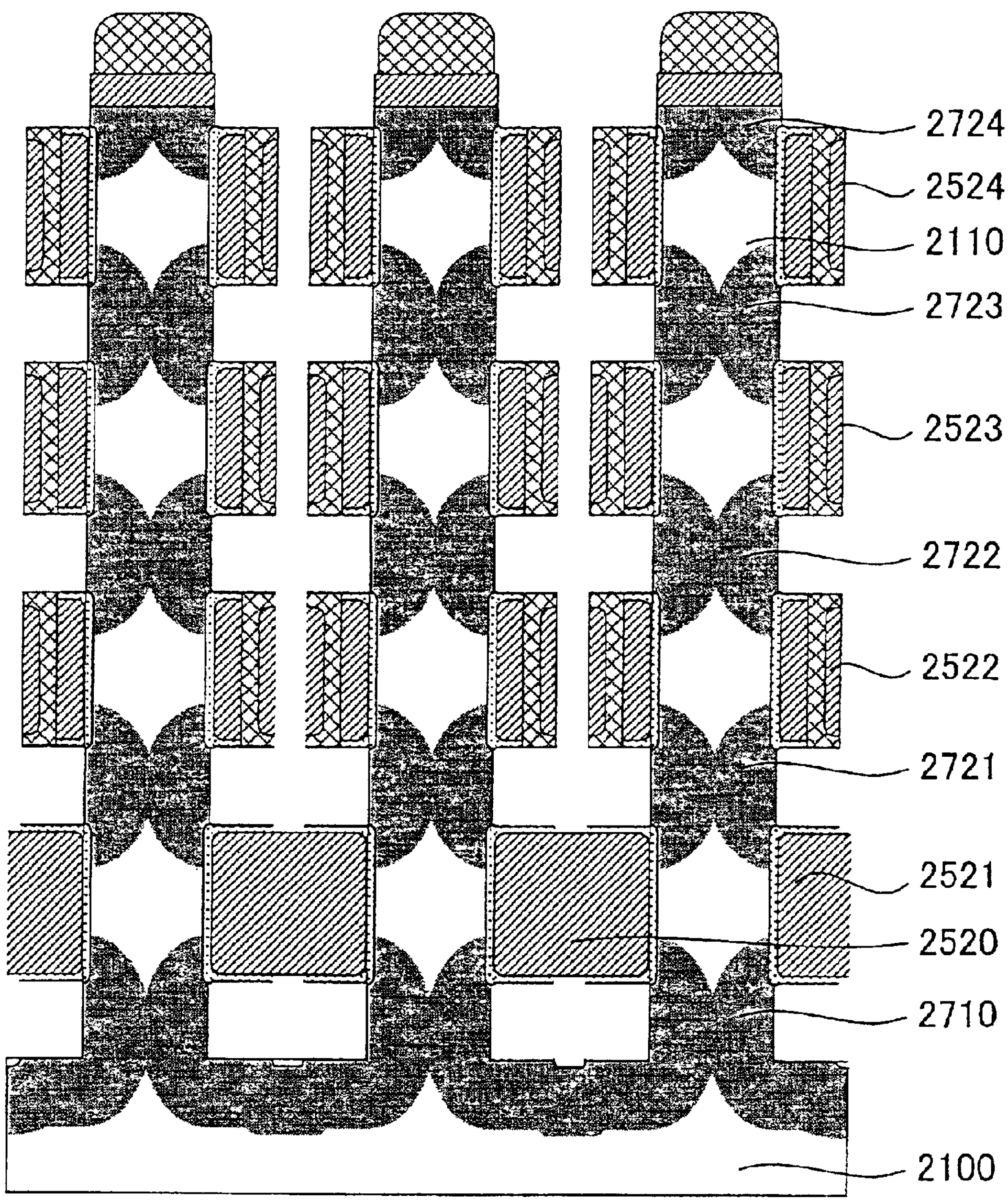
Figure 840:
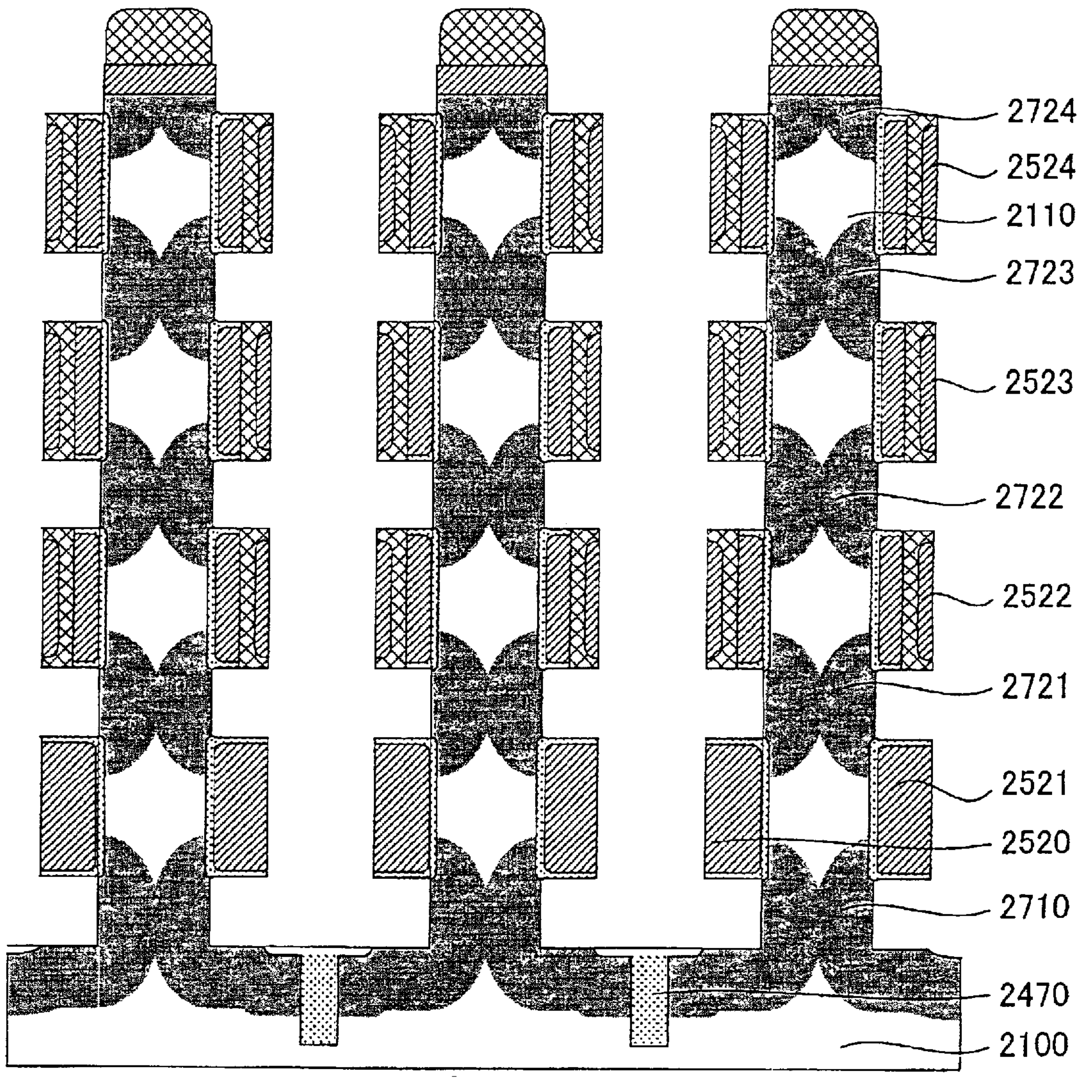

Subsequently, impurities are introduced into the island-like semiconductor layer 2110 and the semiconductor substrate 2100 in self-alignment with the separated polysilicon films 2521, 2522, 2523 and 2524. For example, impurity introduction may be carried out at an arsenic dose of about $1\times10^{18}$ to $1\times10^{21}/cm^3$ by solid or vapor phase diffusion to form N-type impurity diffusion layers 2710 to 2714. At this time, the impurity diffusion layer 2710 to be a first wiring layer may be adjusted about its impurity concentration by ion implantation (FIGS. 822 and 840). For example, the ion implantation may be carried out at an implantation energy of 5 to 100 keV at a phosphorus dose of about $1\times10^{13}$ to $1\times10^{15}/cm^2$ and at an angle of about 0 to 7° with respect to the normal line of the surface of the substrate.

Figure 823:
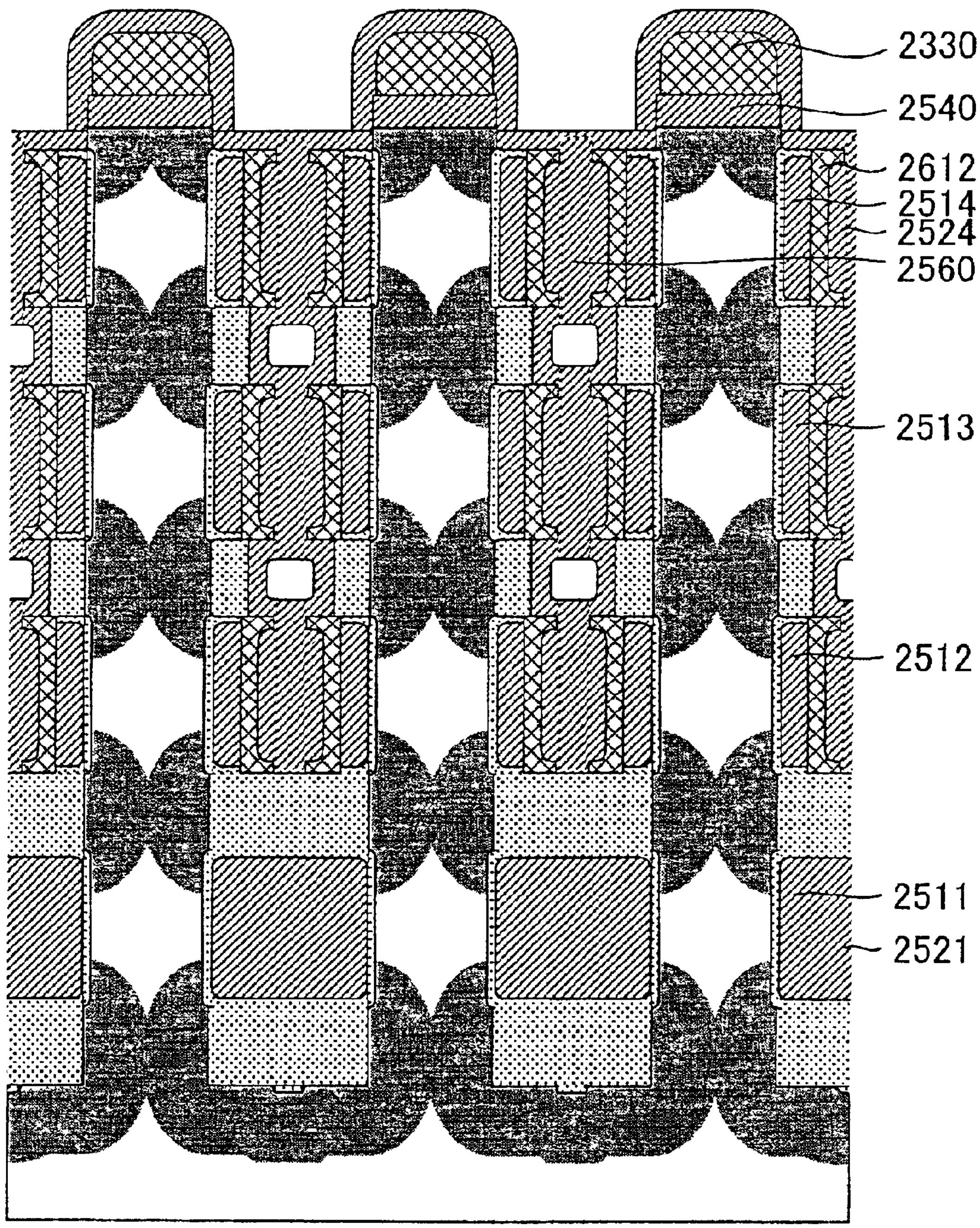
Figure 841:
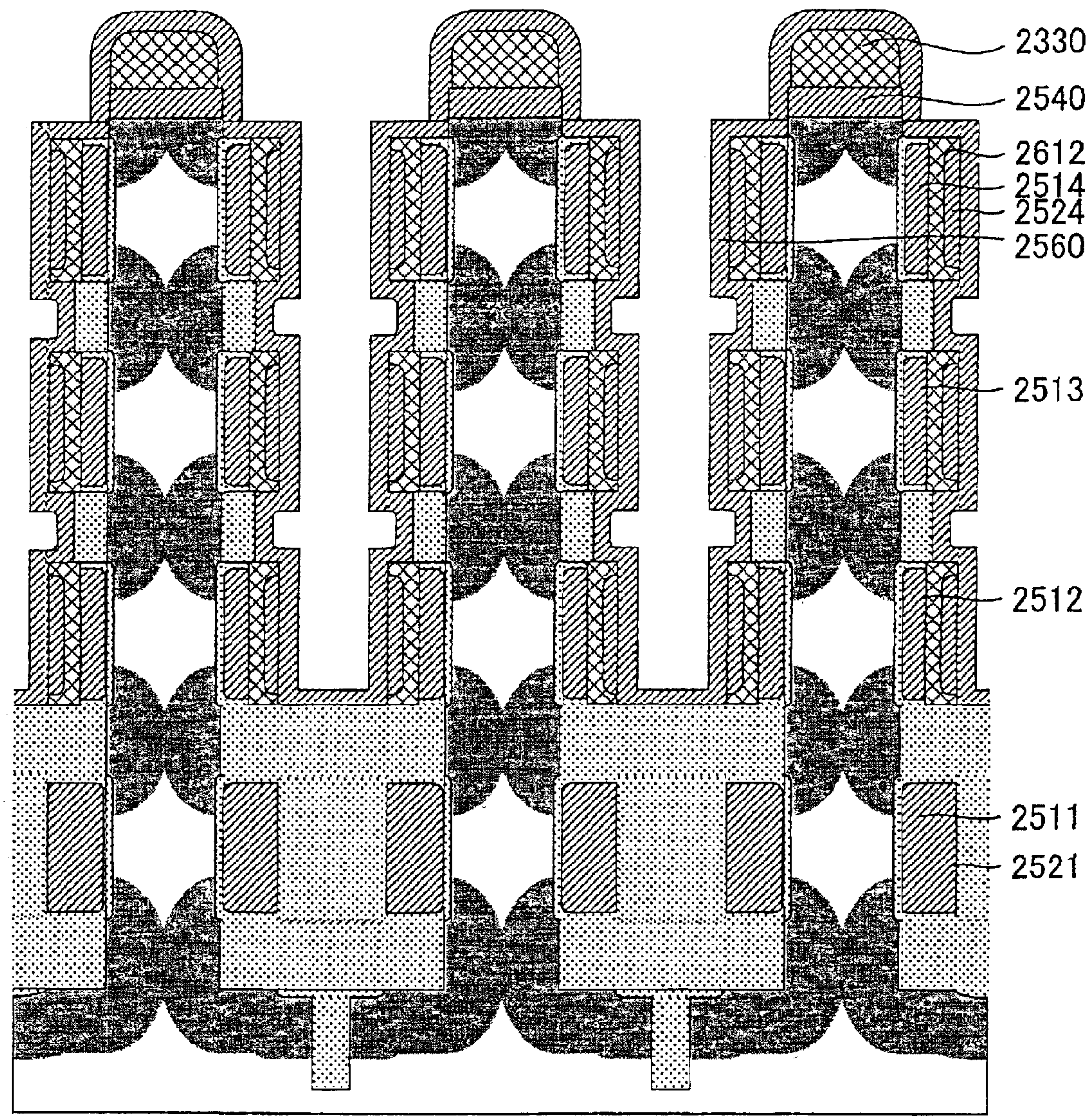

Thereafter, a silicon oxide film 2470, for example, is then deposited as an eleventh insulating film to a thickness of about 50 to 500 nm. The silicon oxide film 2470 is buried in the third trench 2230, for example, by anisotropic or isotropic etching such that the polysilicon film 2511 (the first conductive film) and the polysilicon film 2521 (the second conductive film) are embedded and the polysilicon films 2512 to 1514 are embedded on the side of the island-like semiconductor layer 2110. Further, a polysilicon film 2560, for example, is deposited to a thickness of 15 to 150 nm as a sixth conductive film (FIGS. 823 and 841). At this time, by setting the thicknesses of the silicon nitride films 2313 and 2314 to a predetermined value or greater in advance, spaces are obtained as shown in FIG. 823.

Then, the polysilicon film 2560 is etched back by isotropic etching to a depth corresponding to the deposit thickness to form a control gate line. At this time, by setting the intervals between the island-like semiconductor layers 2110 in a direction of A-A' in FIG. 1 to a predetermined value or smaller, the polysilicon film 2560 is formed into a third wiring layer to be a control gate line continuous in the direction without need to use a masking process.

Subsequently, a silicon oxide film 2472, for example, is buried as an eleventh insulating film to such a degree that the polysilicon film 2564 is embedded. Then, a silicon nitride film 2342, for example, is deposited to a thickness of about 20 to 200 nm as a sixth insulating film and anisotropically etched into the form of a sidewall spacer.

Figure 824:
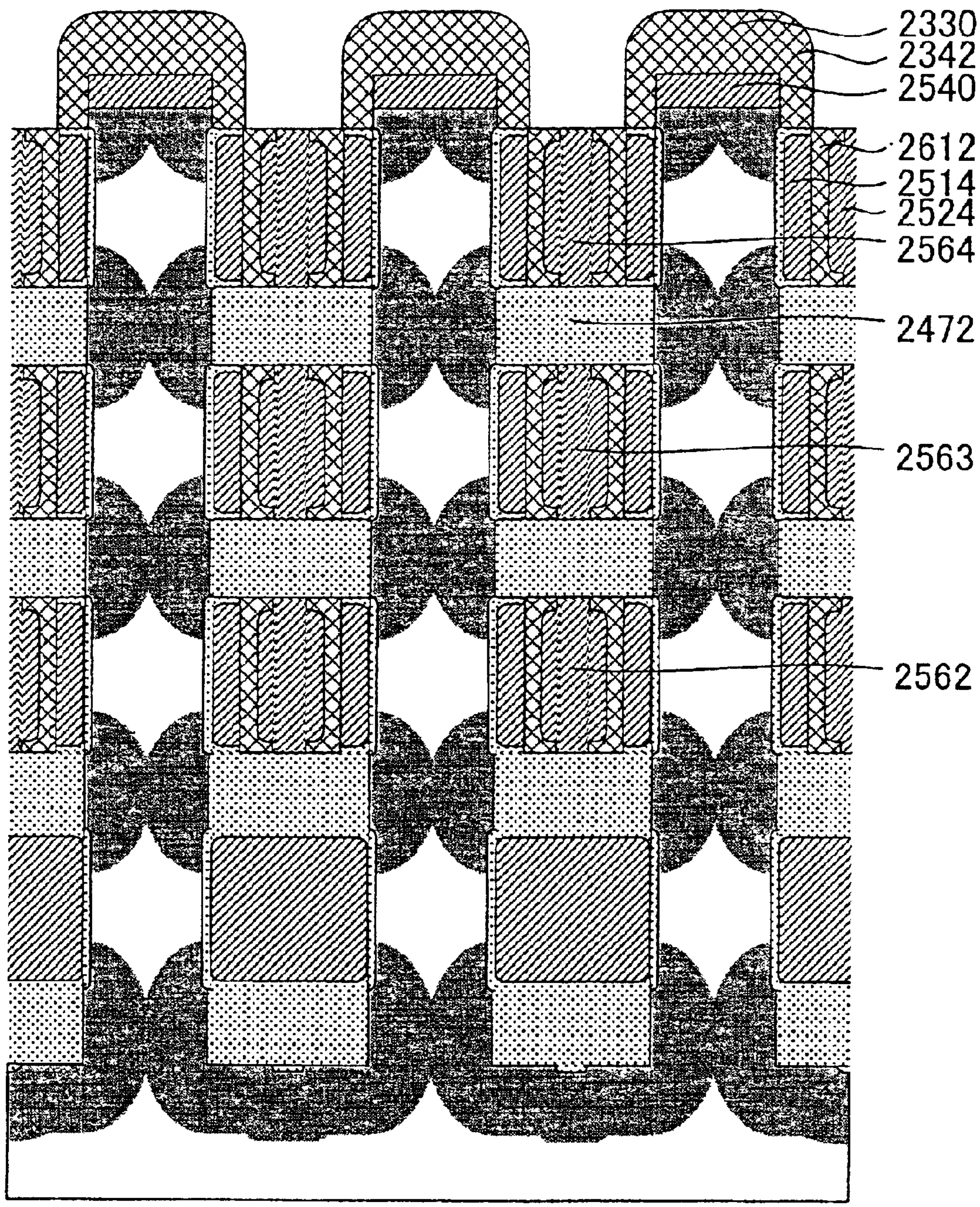
Figure 842:
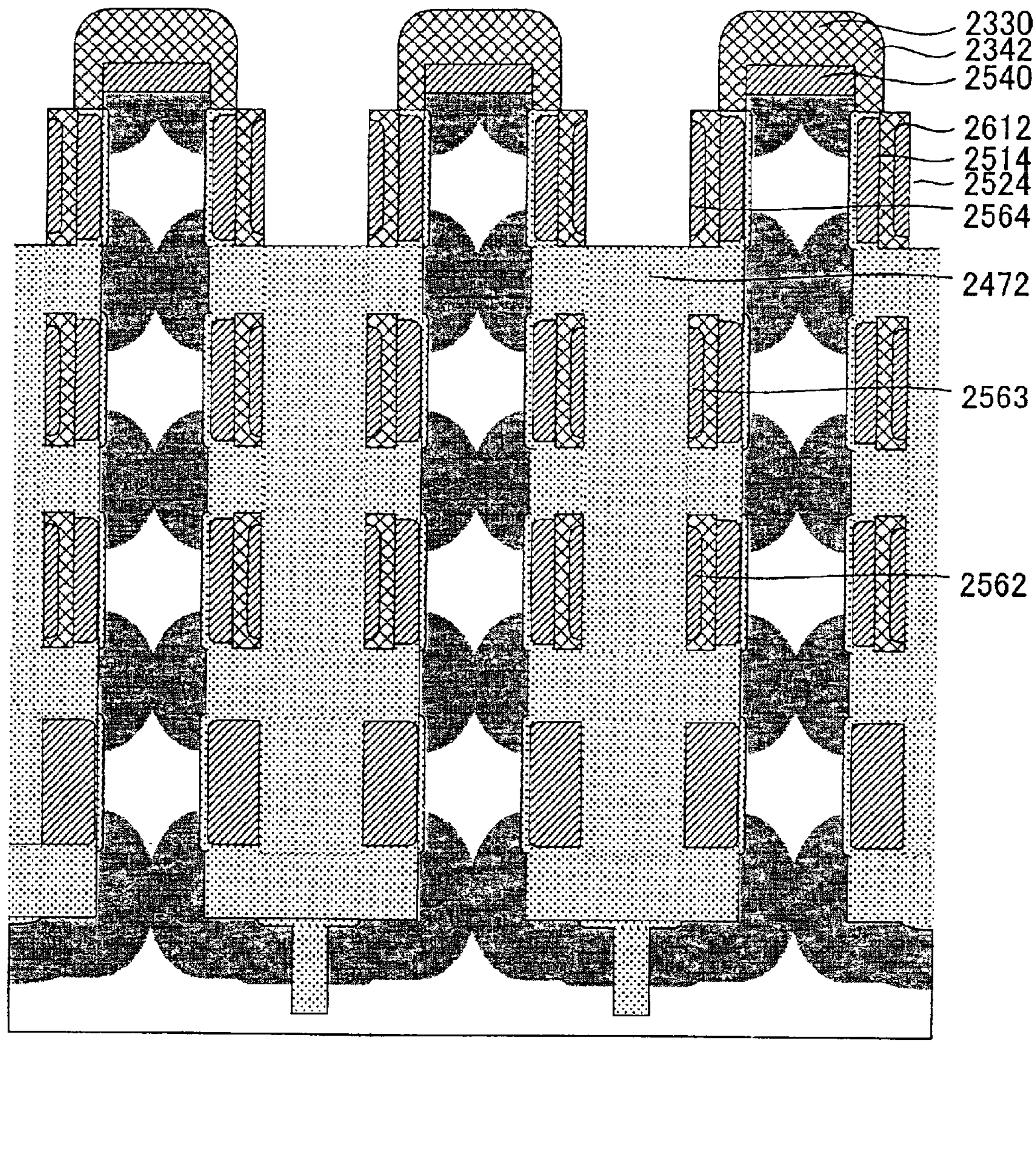

Thereafter, the silicon oxide film 2472 is buried to such a degree that the polysilicon film 2563 is embedded (FIGS. 824 and 842).

Figure 825:
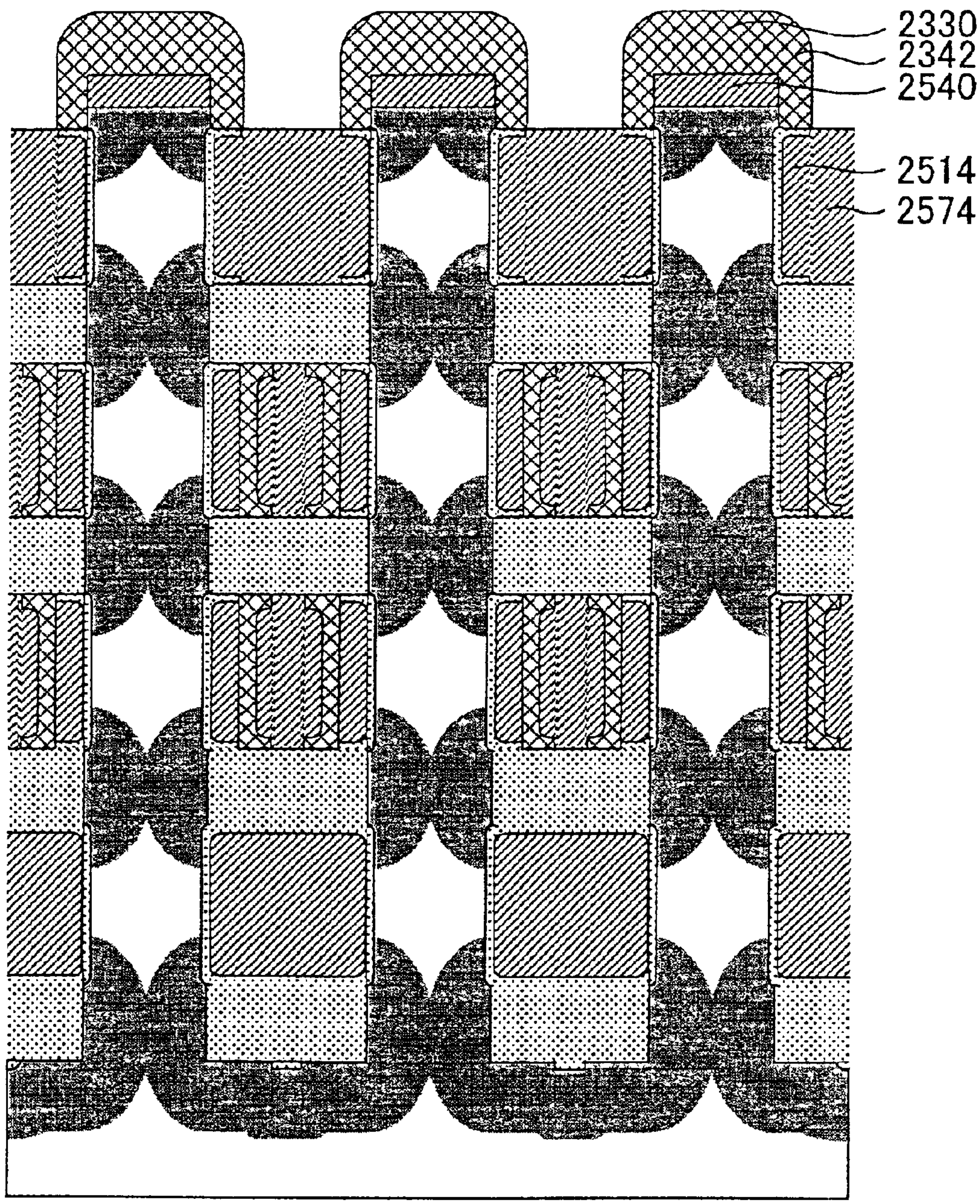
Figure 843:
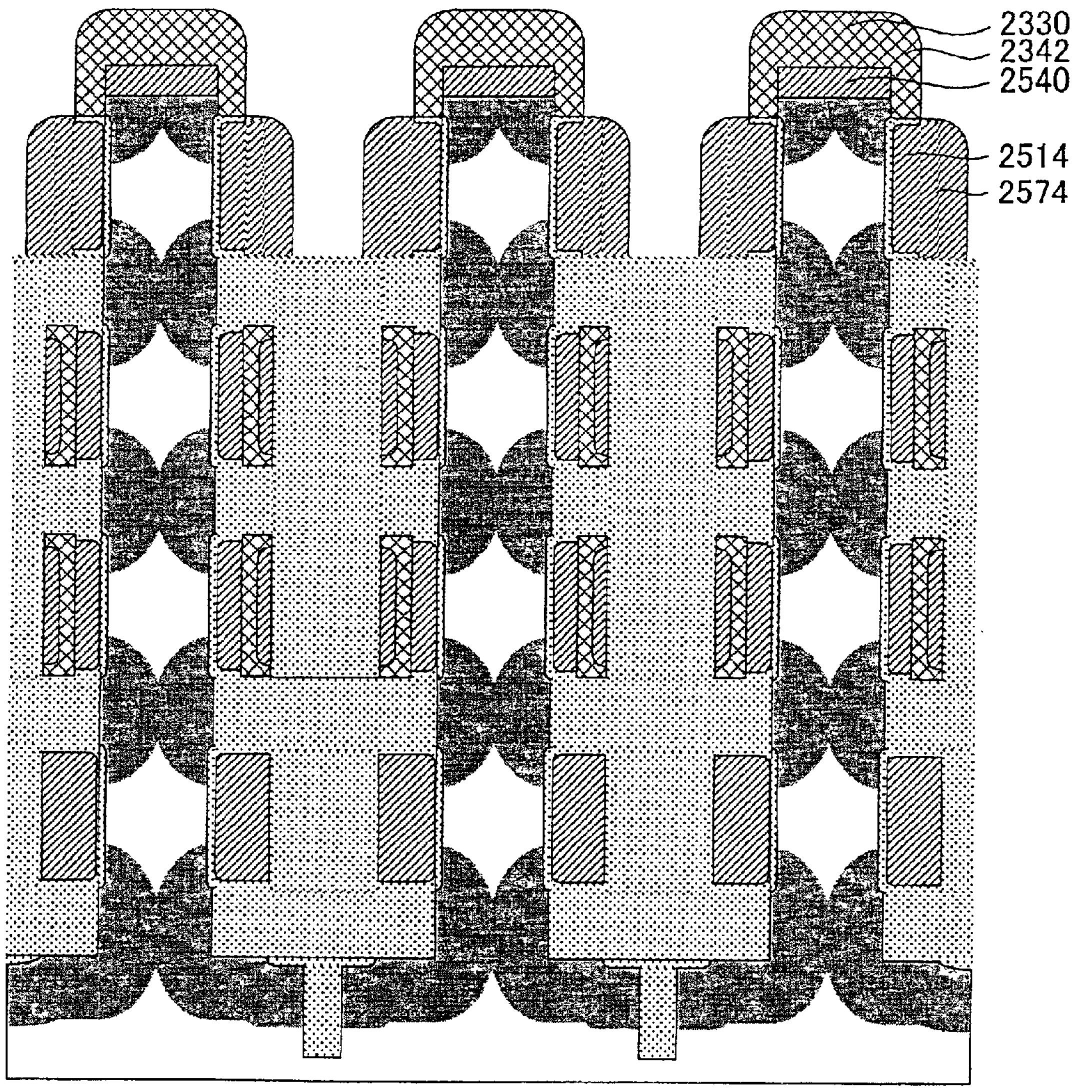

The polysilicon film 2564, the polysilicon film 2524 and the interlayer insulating film 2612 are removed from the side of the polysilicon film 2514. Then, a polysilicon film 2574, for example, is deposited to a thickness of about 15 to 150 nm as a seventh conductive film and etched back to such a degree that the polysilicon film 2574 is able to contact the polysilicon film 2514 (FIGS. 825 and 843).

Then, the silicon nitride films 2330 and 2340 are etched back by anisotropic etching to such a degree that the polysilicon film 2540 is exposed. A silicon oxide film 2475 is deposited as an eleventh insulating film to a thickness of 100 to 500 nm on the top of the polysilicon film 2574. The top portion of the polysilicon film 2540 is exposed by etch-back or by CMP and a fourth wiring layer is formed so that its direction crosses the direction of the second or third wiring layer and is connected to the top portion of the island-like semiconductor layer 2110.

Figure 826:
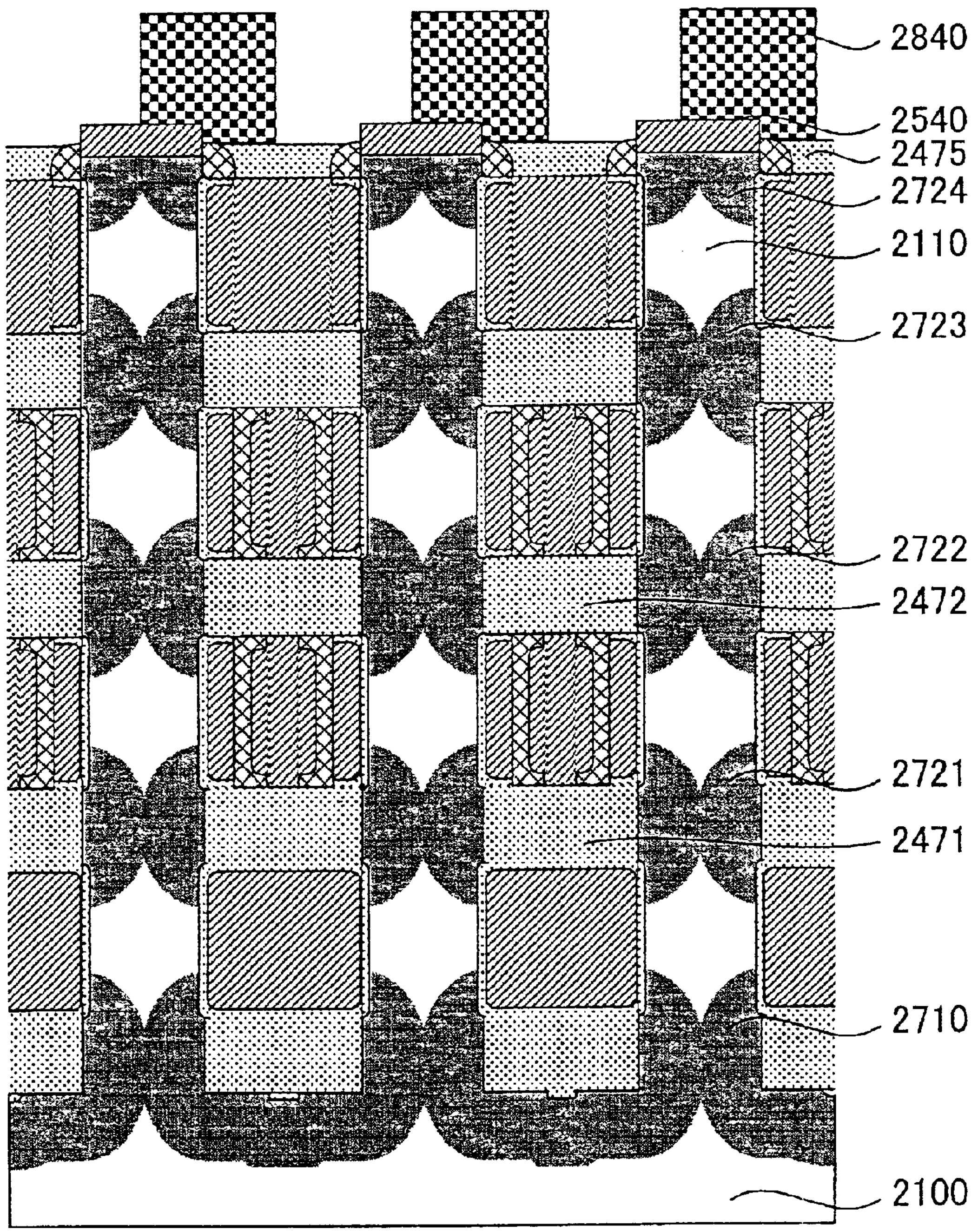
Figure 844:
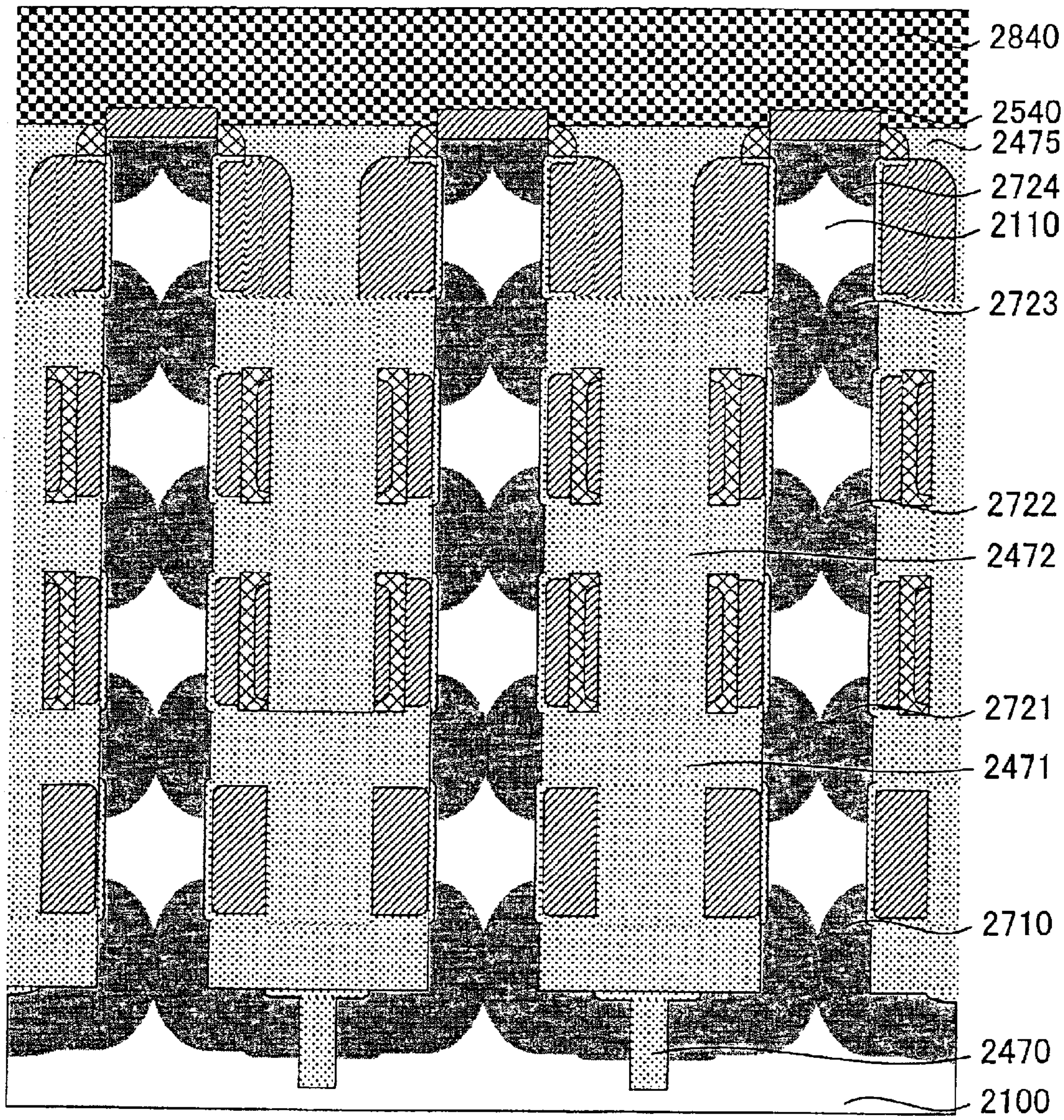
Figure 845:
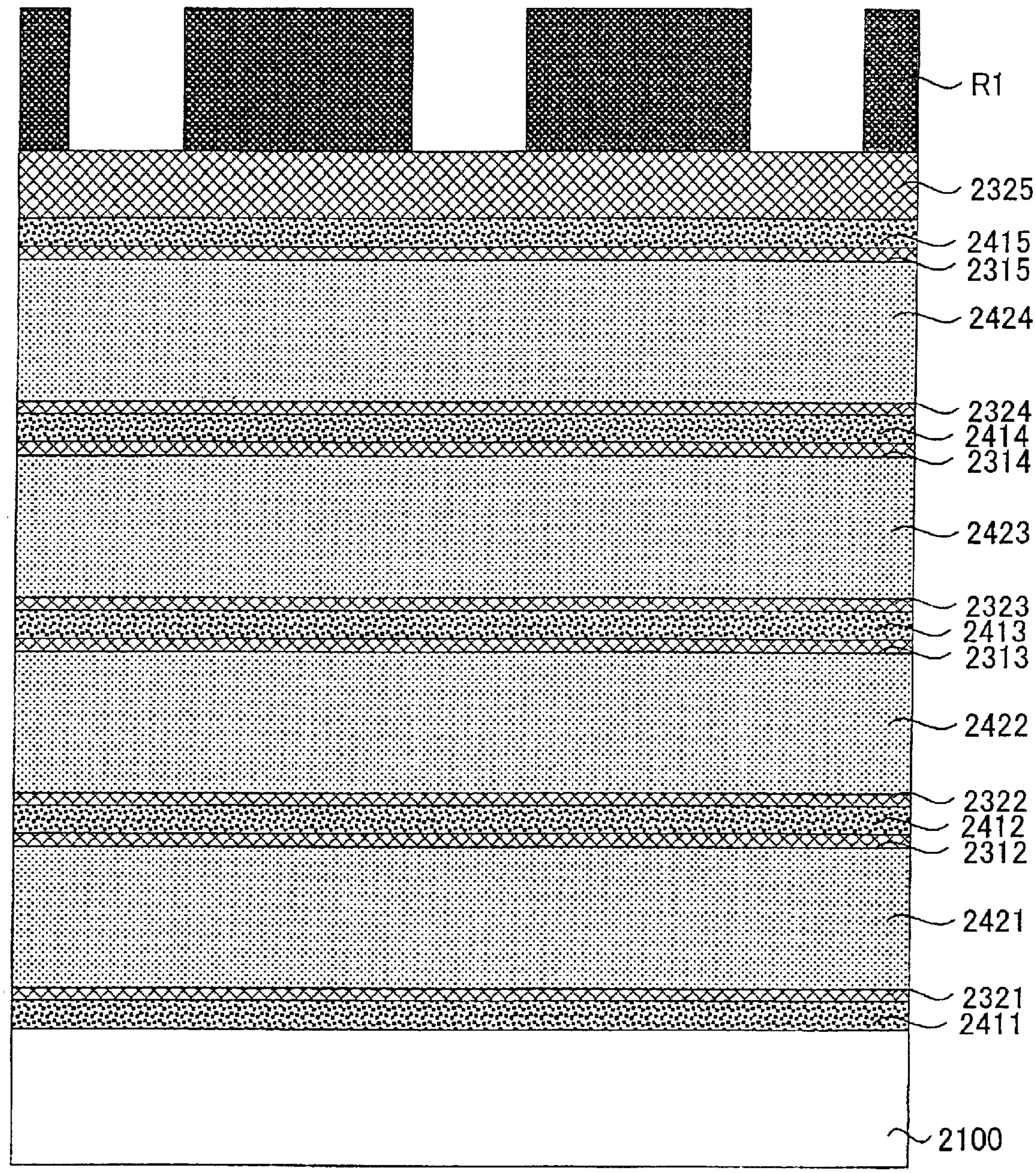
Figure 846:
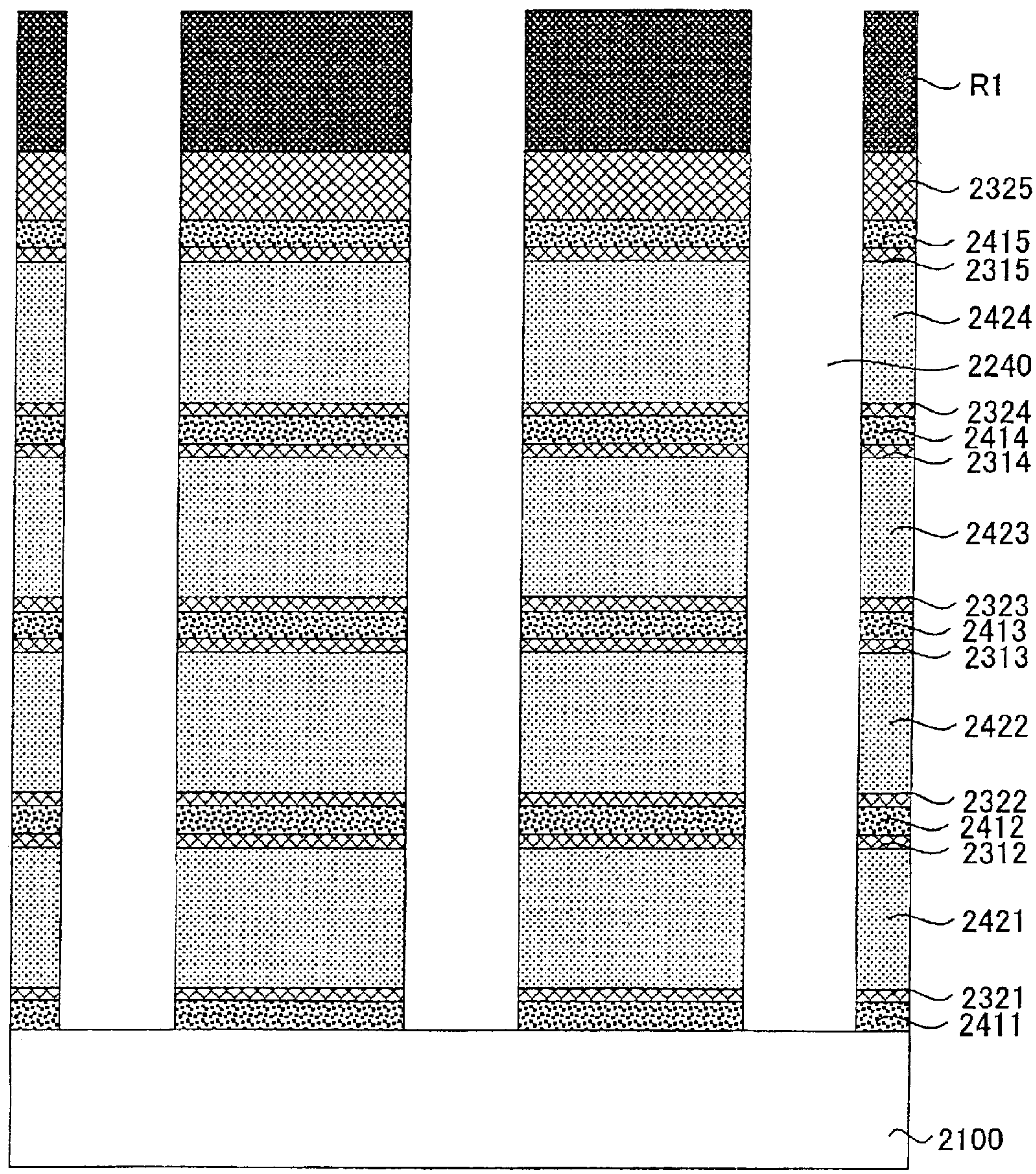
Figure 847:
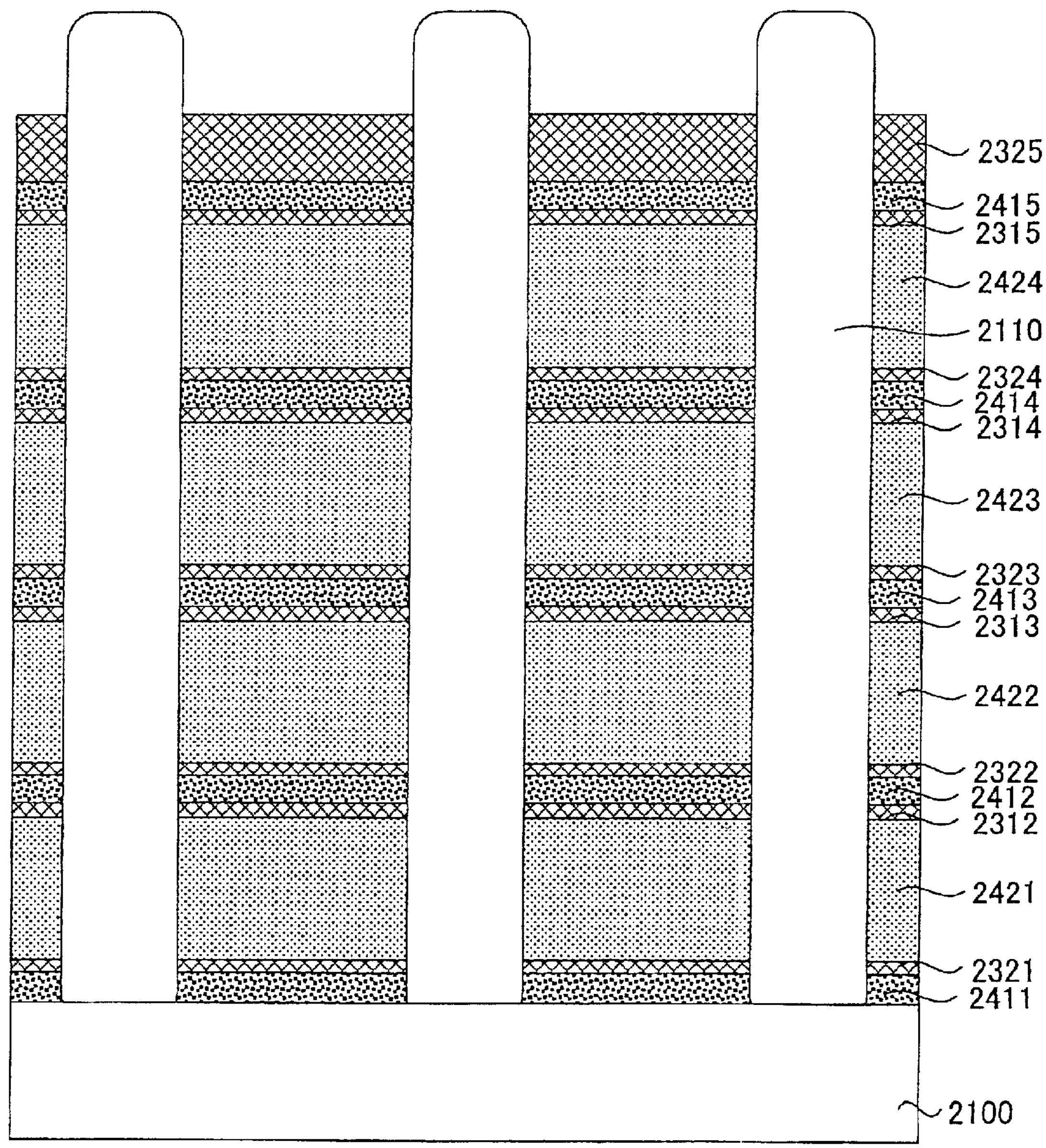
Figure 848:
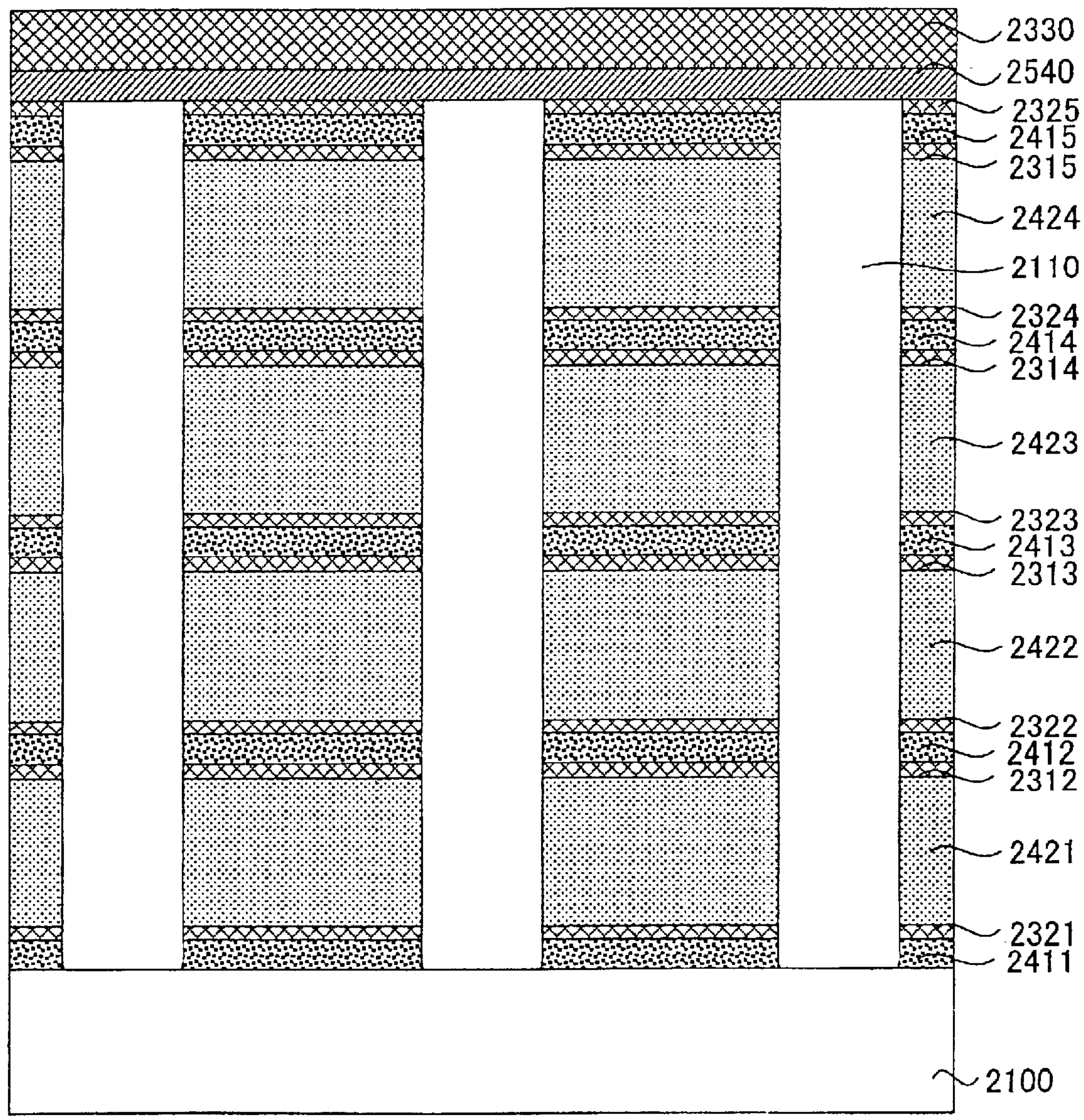
Figure 849:
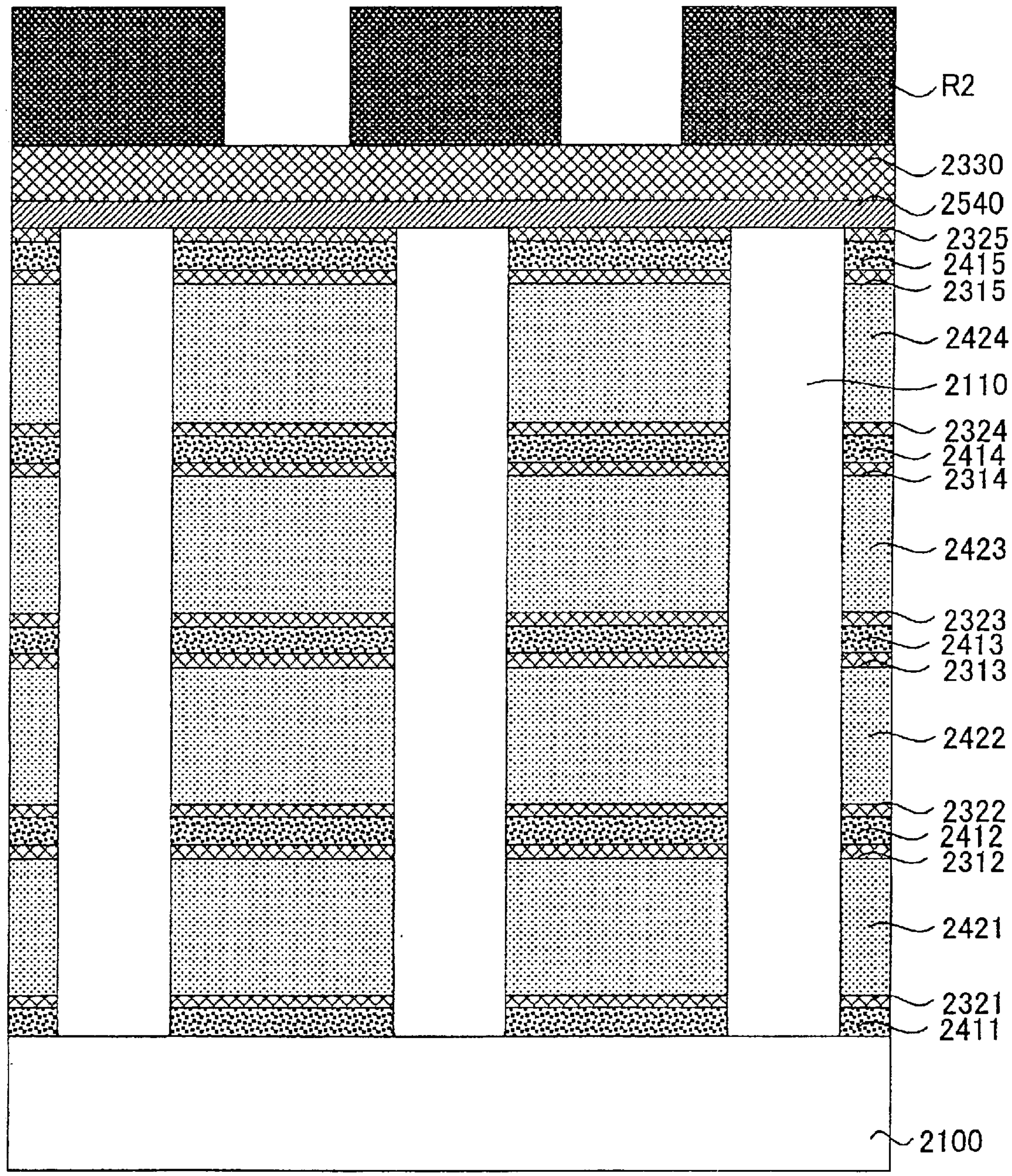

Thereafter, by known techniques, an interlayer insulating film is formed, and a contact hole and metal wiring are formed. Thereby, a semiconductor memory is realized which has a memory function according to the state of a charge in the charge storage layer which is the floating gate made of the polysilicon film (the first conductive film) (FIGS. 826 and 844).

In this example, films formed on the surface of the semiconductor substrate or the polysilicon film such as the silicon nitride film (the fourth insulating film) 2321, the silicon nitride film (the fifth insulating film) 2330 and the silicon nitride film (the twelfth insulating film) 2350 may be formed of a layered film of a silicon oxide film/a silicon nitride film from the silicon surface.

With regard to the polysilicon films 2510 or 2511 to 2514 (the first conductive films), the polysilicon films 2520 or 2521 to 2523 (the second conductive films), the polysilicon films 2560 or 2562 and 2563 (the sixth conductive films), the polysilicon film 2574 (the seventh conductive film) and the polysilicon film 2540 (the fourth conductive film), impurity introduction may be carried out during or after the formation of the polysilicon films or after the separation of the polysilicon films. The timing of the impurity introduction to the polysilicon films is not particularly limited so long as these films become conductive films.

In this example, the control gates of the memory cells are formed continuously in one direction without using a mask. That is possible only where the island-like semiconductor layers are not disposed symmetrically to a diagonal In contrast, if the island-like semiconductor layers are disposed symmetrically to a diagonal, for example, the wiring layers may be separated through patterning with use of resist films by photolithography.

Further, by providing the selection gates in the top and the bottom of a set of memory cells, it is possible to prevent the phenomenon that a memory cell transistor is over-erased.

PRODUCTION EXAMPLE 40

In contrast to Production example 11, explanation is given of an example of production process in which the silicon nitride film 2340 which is a sixth insulating film to be a sidewall mask is not formed and the third trench 2230 is formed by patterning with use of resist films by photolithography.

Such a semiconductor memory may be produced by the following production process. FIGS. 845 to 873 and FIGS. 874 to 902 are sectional views taken on line A-A' and line B-B', respectively, in FIG. 1 which is a plan view illustrating an EEPROM memory cell array.

The production steps are the same as those of Production example 11 until a resist film R2 patterned by a known photolithographic technique is disposed on the silicon nitride film (the fifth insulating film) 2330 (FIGS. 845 to 848 and FIGS. 874 to 877).

Figure 850:
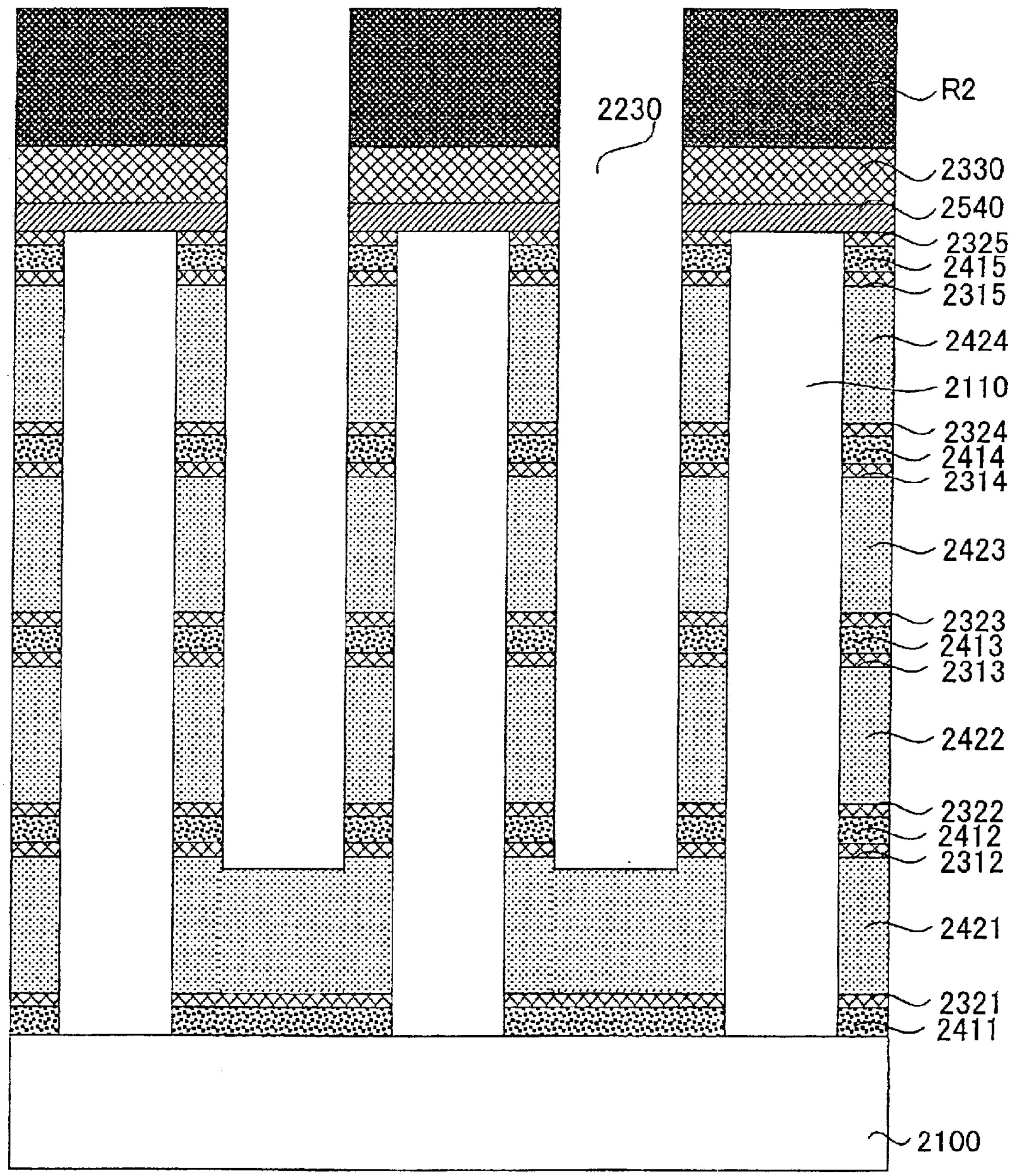
Figure 879:
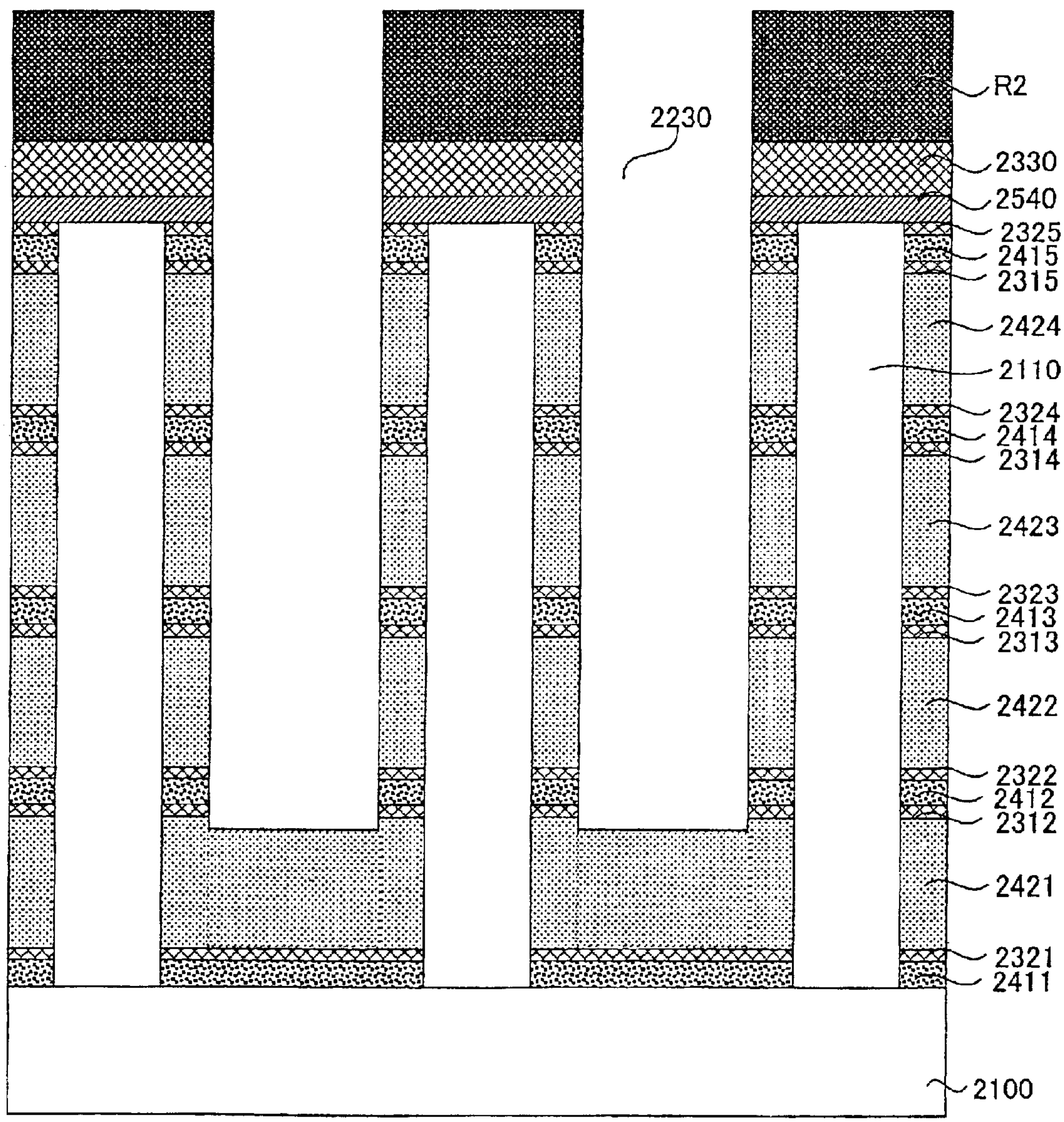

Thereafter, using the resist film R2 as a mask (FIGS. 849 and 878), reactive ion etching, for example, is performed to successively etch the silicon nitride film 2330, the polysilicon film 2540, the silicon nitride film 2325, the silicon oxide film 2415, the silicon nitride film 2315, the silicon oxide film 2424, the silicon nitride film 2324, the silicon oxide film 2414, the silicon nitride film 2314, the silicon oxide film 2423, the silicon nitride film 2323, the silicon oxide film 2413, the silicon nitride film 2313, the silicon oxide film 2422, the silicon nitride film 2322, the silicon oxide film 2412 and the silicon nitride film 2312, thereby exposing the silicon oxide film 2421 (the third insulating film). Thus, a third trench 2230 is formed (FIGS. 850 and 879).

Figure 851:
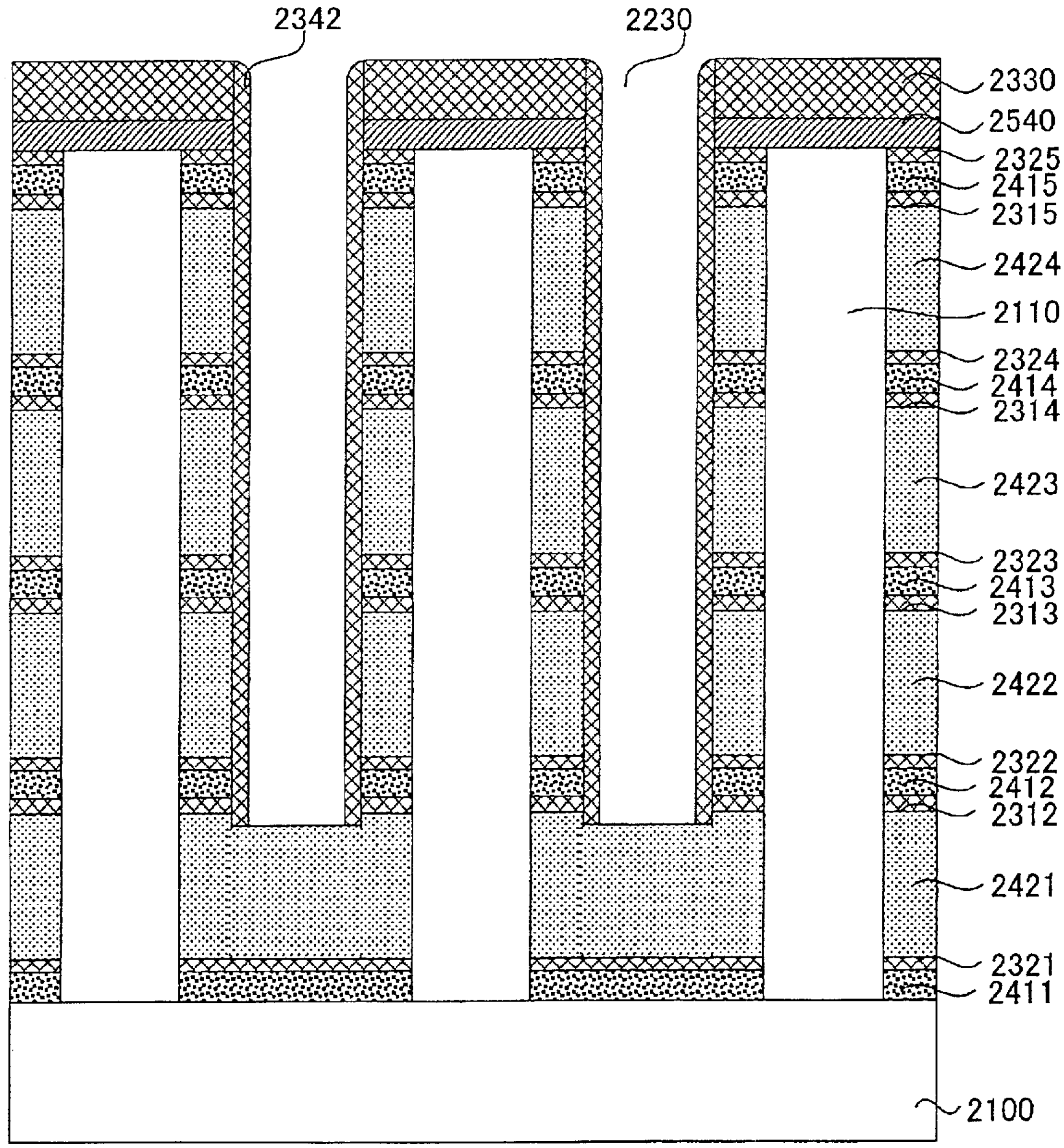
Figure 880:
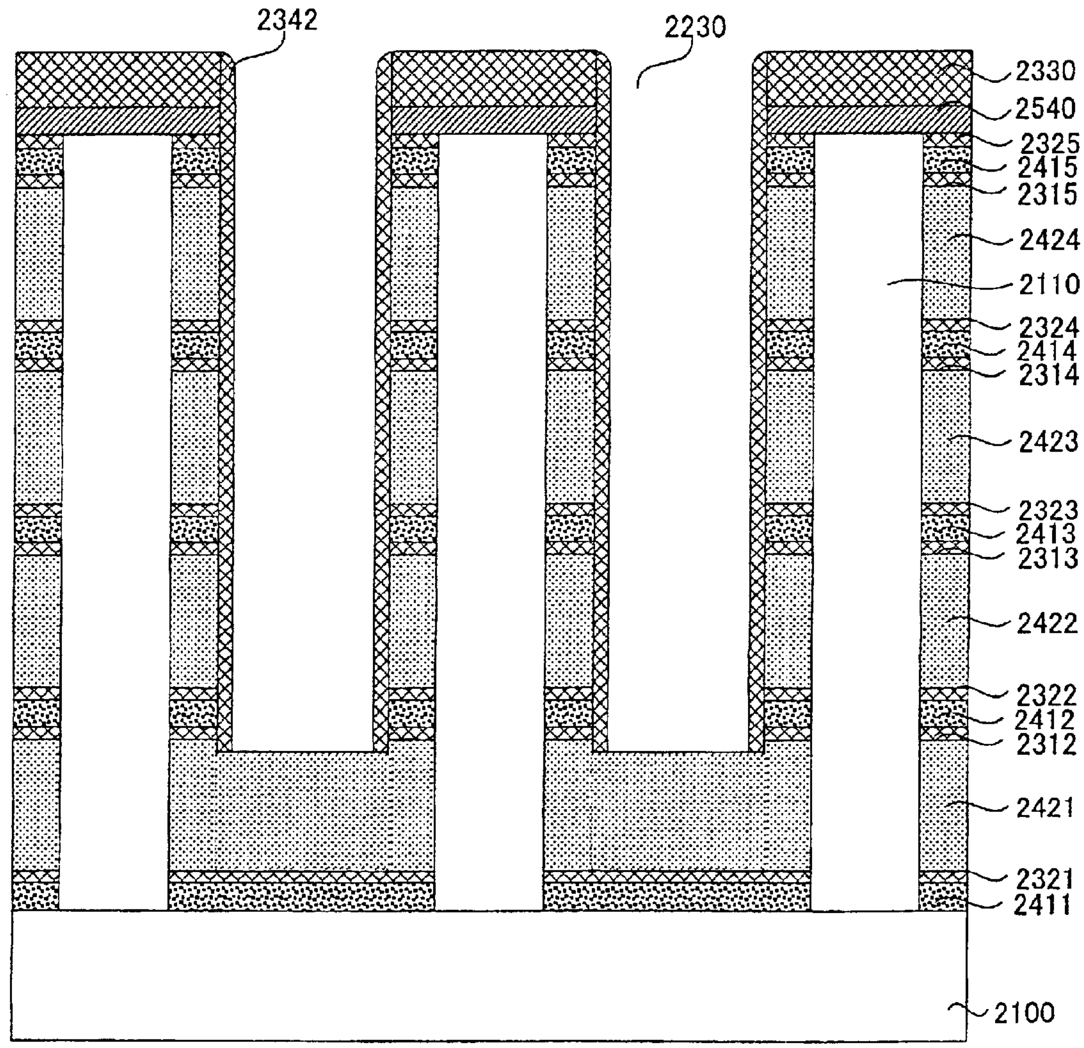

Subsequently, a silicon nitride film 2342 is deposited as a sixth insulating film to a thickness of about 5 to 50 nm. Then, the silicon nitride film 2342 is arranged such that at least the silicon oxide film (the first conductive film) 2412 containing the impurities is isolated from other films than the island-like semiconductor layer 2110 by the silicon nitride film 2342 (the sixth insulating film), the silicon nitride film 2312 (the second insulating film) and the silicon nitride film 2322 (the fourth insulating film). For example, the silicon nitride film 2342 deposited to a thickness of about 5 to 50 nm is removed from the bottom of the third trench 2230 by anisotropic etching, thereby exposing the silicon oxide film 2421 (FIGS. 851 and 880).

Figure 852:
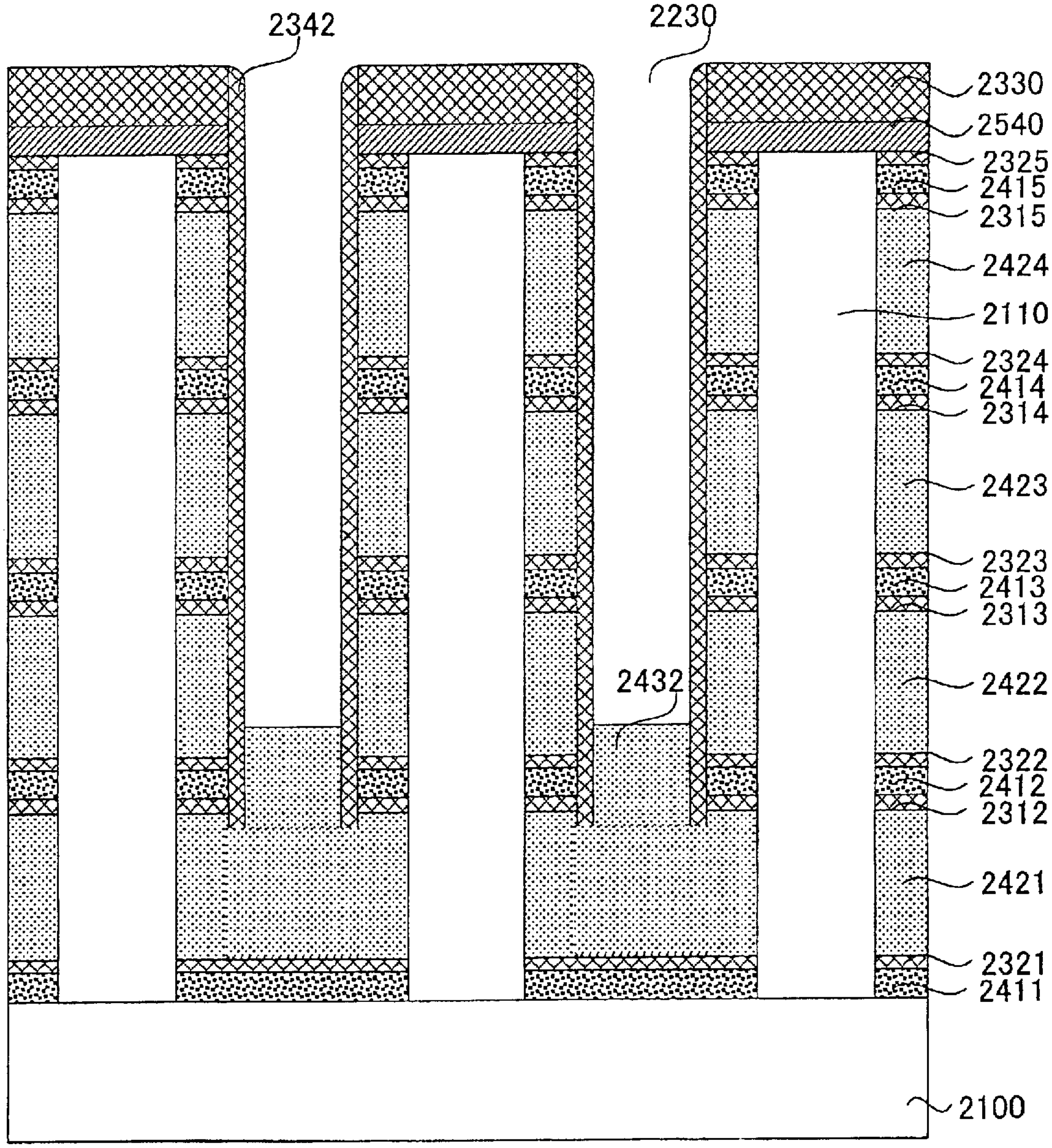
Figure 881:
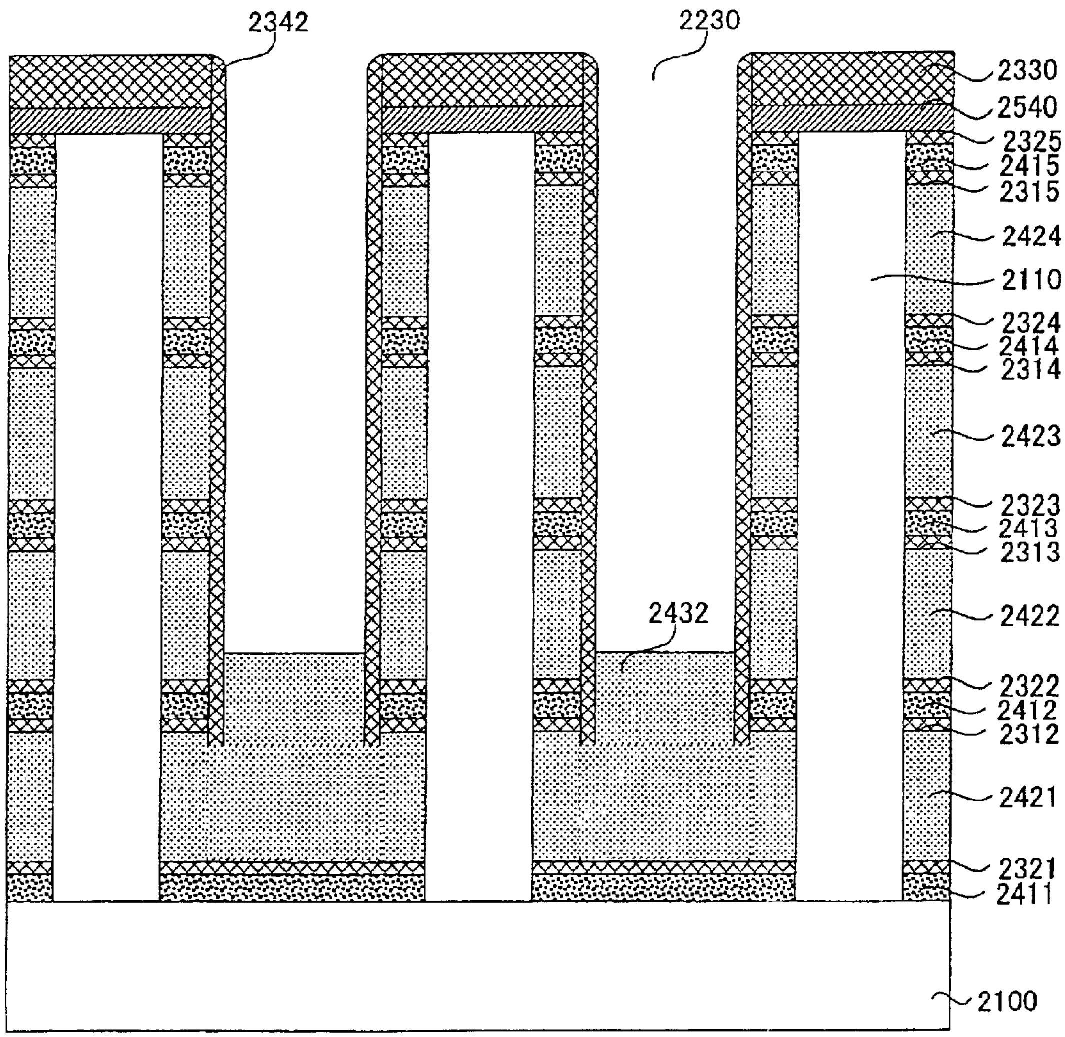

Thereafter, a silicon oxide film 2432, for example, is deposited as a seventh insulating film to a desired thickness and buried in the third trench 2230 such that the silicon oxide film 2412 containing the impurities is embedded with intervention of the silicon nitride film 2342 (FIGS. 852 and 881).

Figure 853:
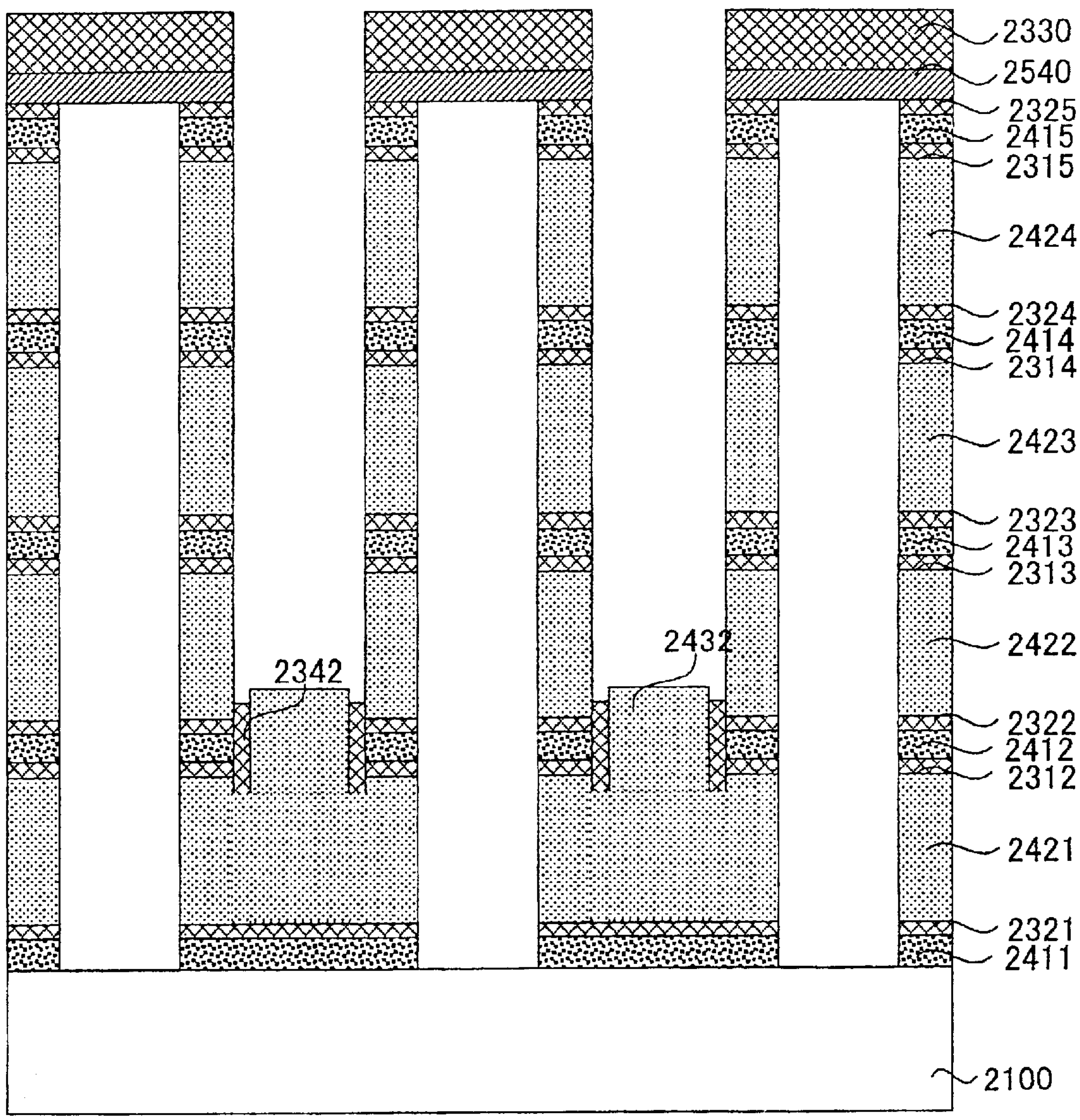
Figure 854:
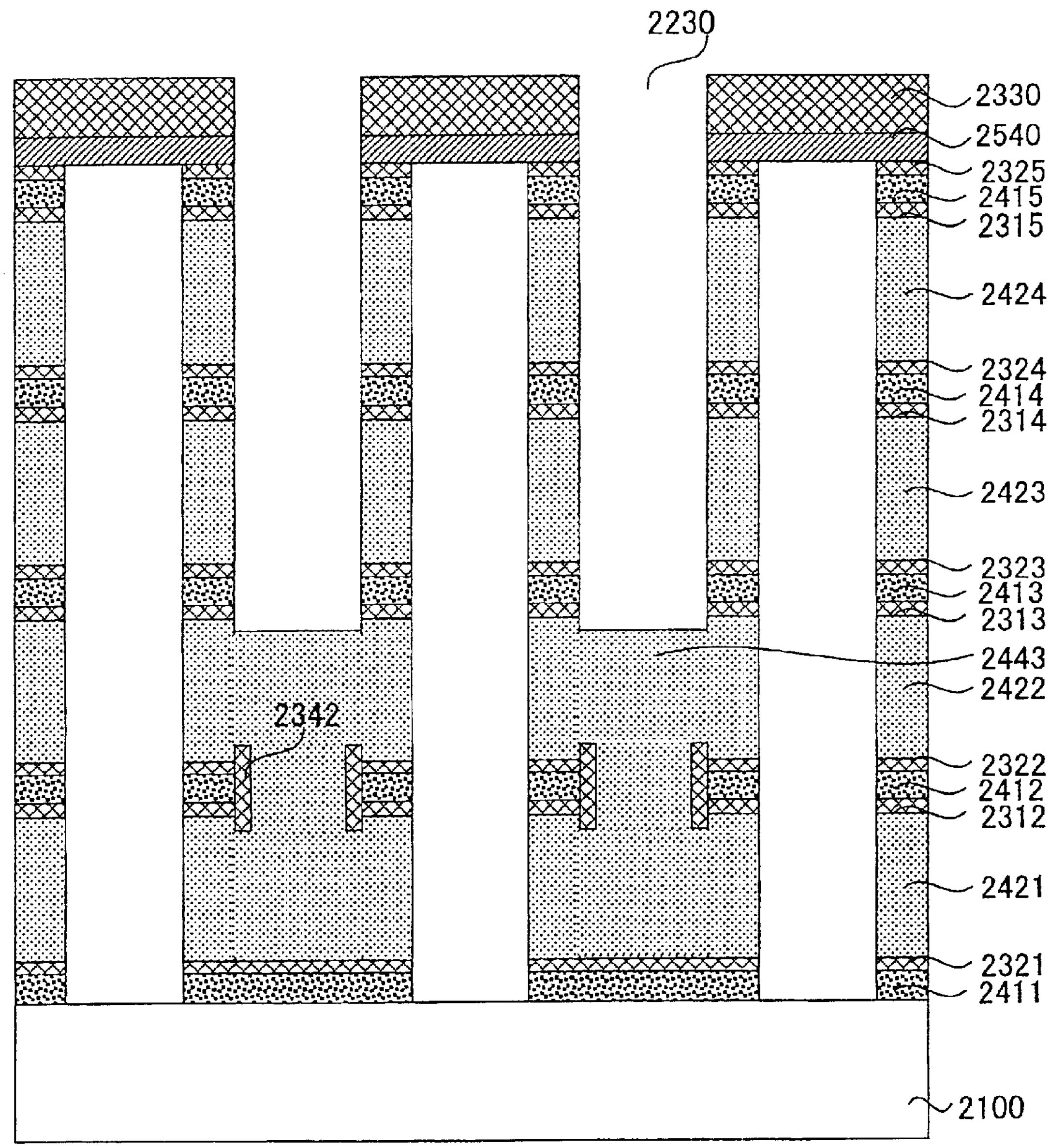
Figure 882:
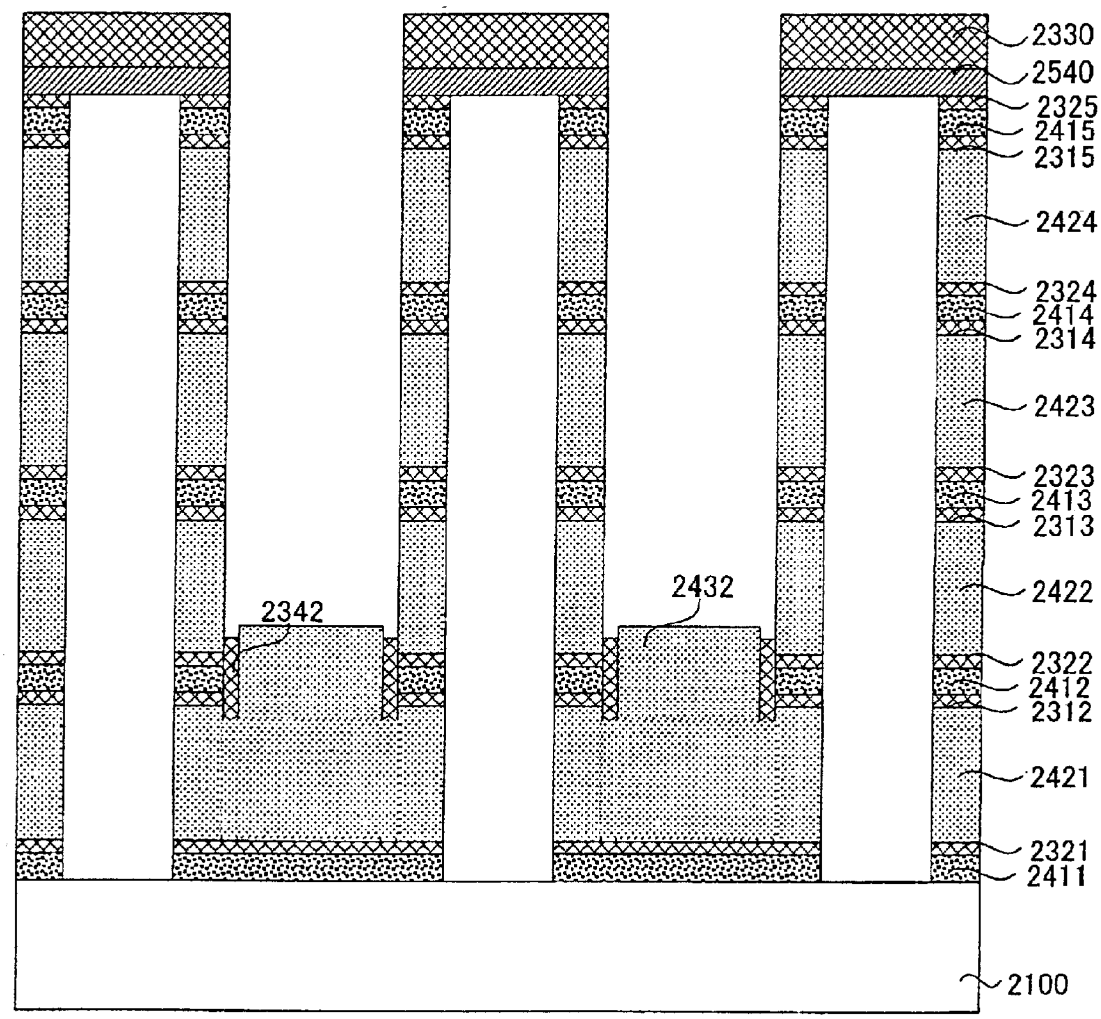
Figure 883:
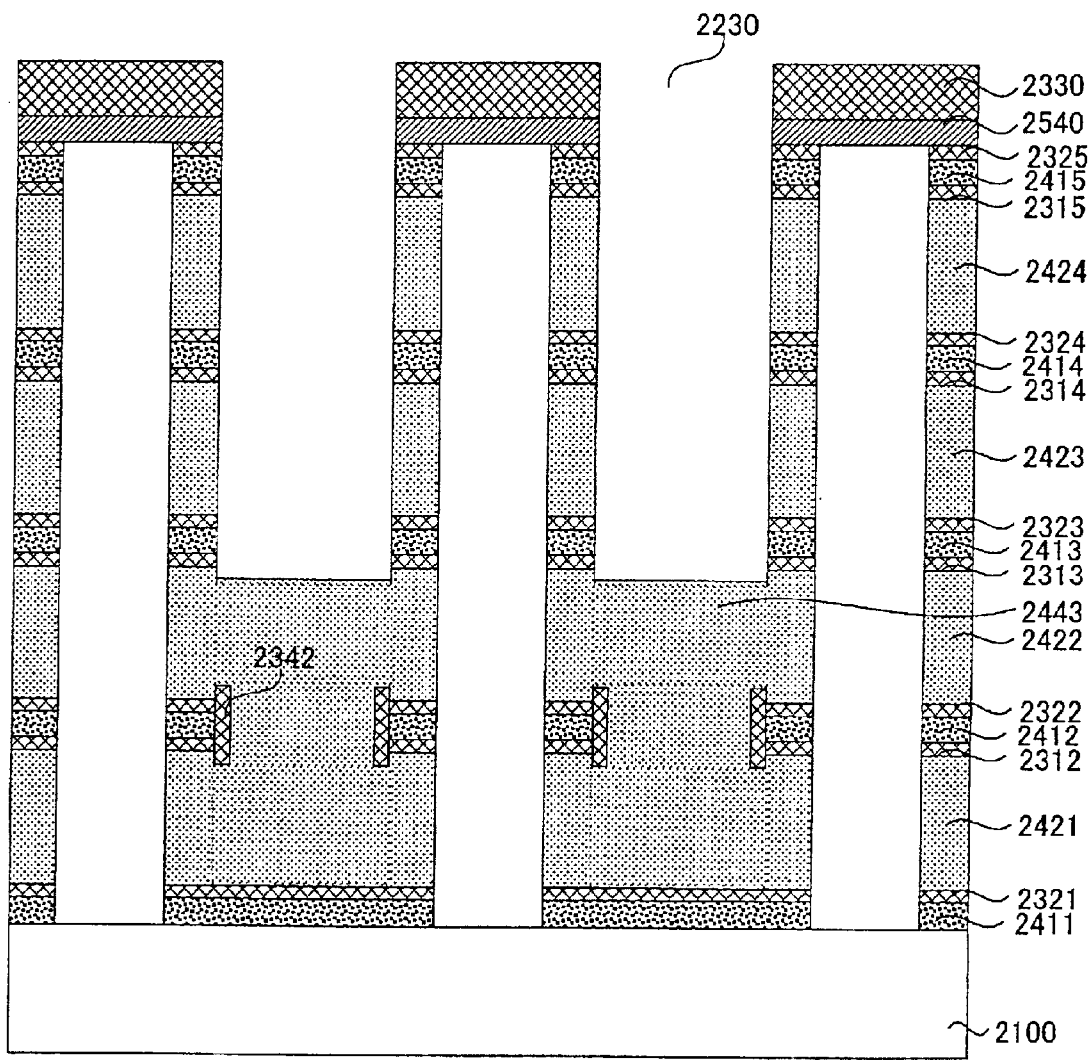

Using the silicon oxide film 2432 as a mask, an exposed portion of the silicon nitride film 2342 is removed by isotropic etching, while leaving an unexposed portion thereof (FIGS. 853 and 882). Then, a silicon oxide film 2443, for example, is deposited as an eighth insulating film and buried in the third trench 2230, for example, by anisotropic etching such that the silicon oxide film 2443 is disposed on the side of the silicon oxide film 2422 (FIGS. 854 and 883). At this time, the depth of the buried silicon oxide film 2443 (the eighth insulating film) is so controlled that the side of the silicon oxide film (the first insulating film) 2413 containing the impurities is exposed.

Then, in the same manner as the above, a silicon nitride film 2343 is deposited as a sixth insulating film to a thickness of about 5 to 50 nm and arranged such that at least the silicon oxide film 2413 (the first insulating film) containing the impurities is isolated from other films than the island-like semiconductor layer 2110 by the silicon nitride film 2343 (the sixth insulating film), the silicon nitride film 2313 (the second insulating film) and the silicon nitride film 2323 (the fourth insulating film).

Thereafter, in the same manner as the above, a silicon oxide film 2433, for example, is deposited as a seventh insulating film to a desired thickness and buried in the third trench 2230 such that the silicon oxide film (the first conductive film) 2413 containing the impurities is embedded with intervention of the silicon nitride film 2343.

Using the silicon oxide film 2433 as a mask, an exposed portion of the silicon nitride film 2343 is removed by isotropic etching, while leaving an unexposed portion thereof.

Then, a silicon oxide film 2444, for example, is deposited as an eighth insulating film and buried in the third trench 2230 by anisotropic etching such that the silicon oxide film 2444 is disposed on the side of the silicon oxide film 2423.

Subsequently, in the same manner as the above, a silicon nitride film 2344 is deposited as a sixth insulating film to a thickness of about 5 to 50 nm. Then, the silicon nitride film 2344 is arranged such that at least the silicon oxide film 2414 containing the impurities is isolated from other films than the island-like semiconductor layer 2110 by the silicon nitride film 2344, the silicon nitride film 2314 and the silicon nitride film 2324.

Thereafter, in the same manner as the above, a silicon oxide film 2434, for example, is deposited as a seventh insulating film to a desired thickness and buried in the third trench 2230 such that the silicon oxide film (the first conductive film) 2414 containing the impurities is embedded with intervention of the silicon nitride film 2344.

Using the silicon oxide film 2434 as a mask, an exposed portion of the silicon nitride film 2344 is removed by isotropic etching, while leaving an unexposed portion thereof.

Then, a silicon oxide film 2445, for example, is deposited as an eighth insulating film and buried in the third trench 2230 by anisotropic etching such that the silicon oxide film 2445 is disposed on the side of the silicon oxide film 2424.

Figure 855:
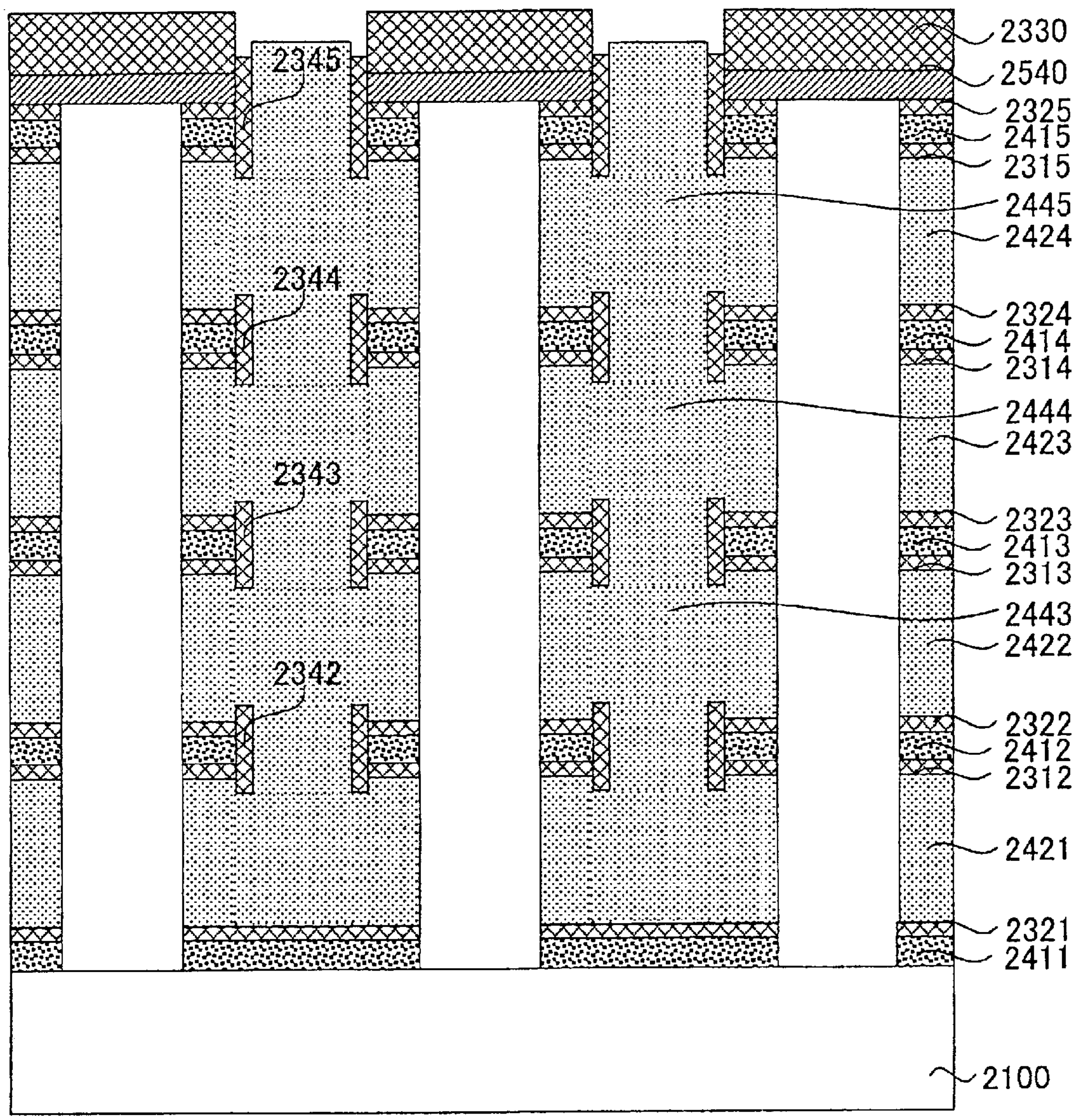
Figure 856:
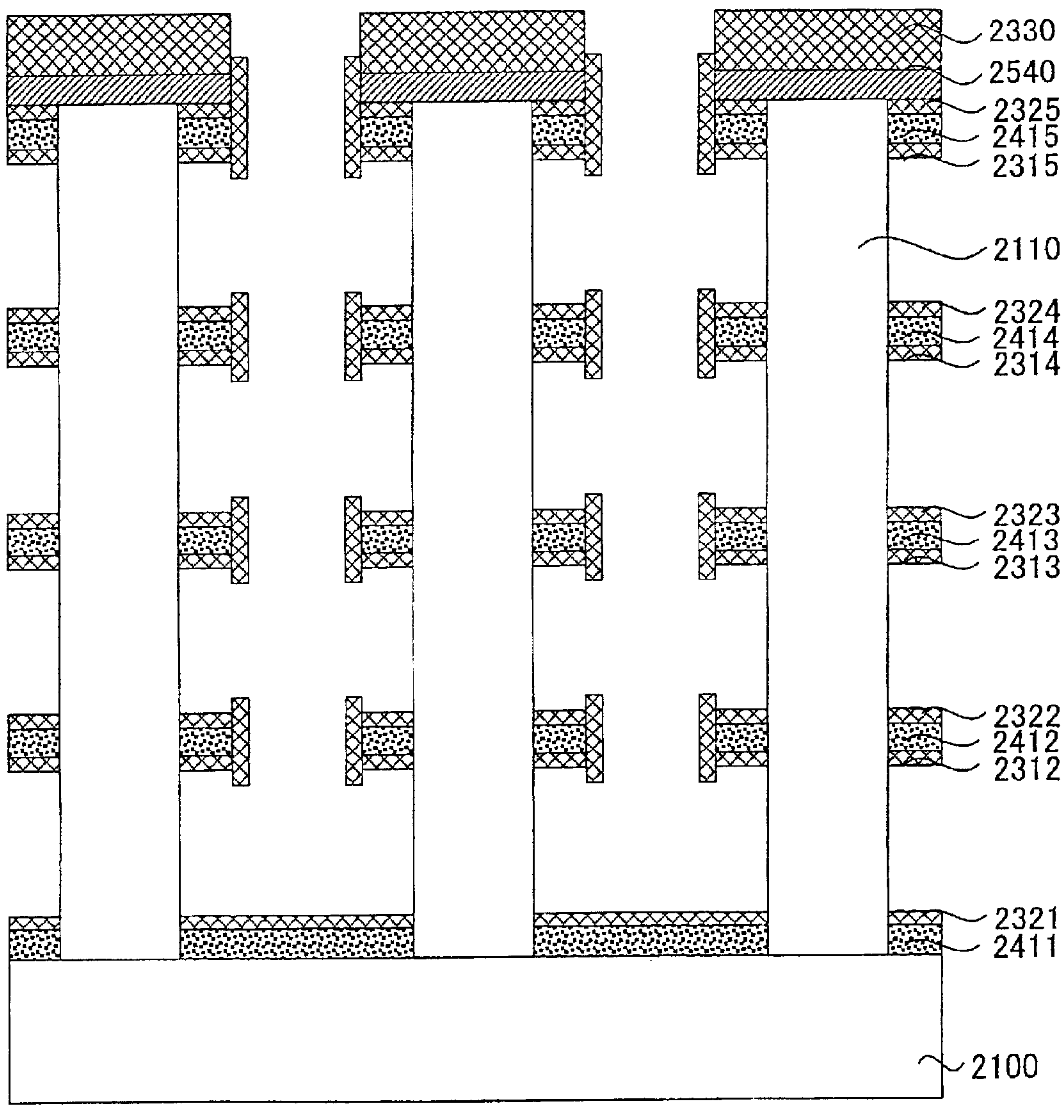
Figure 857:
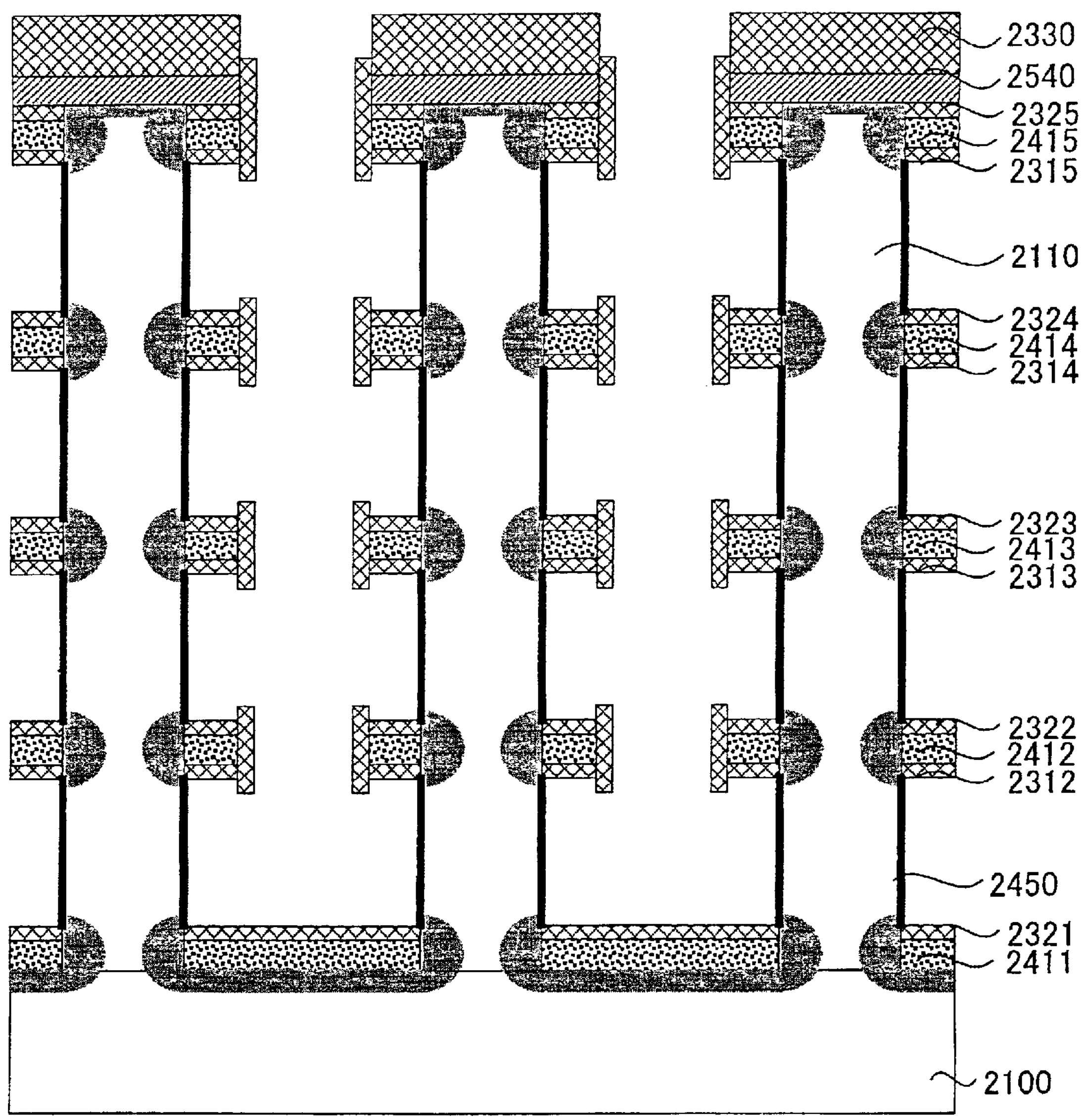
Figure 858:
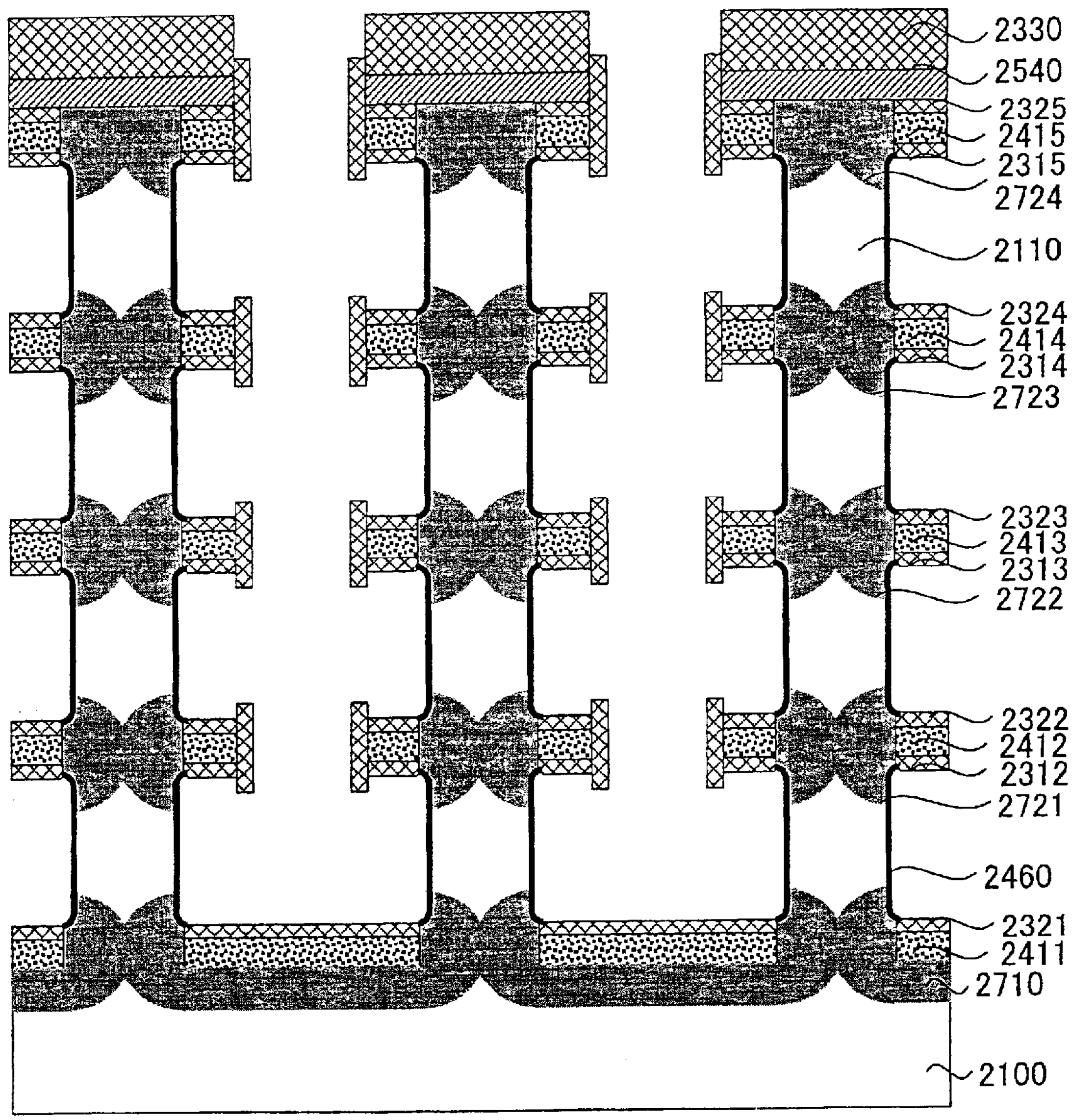
Figure 859:
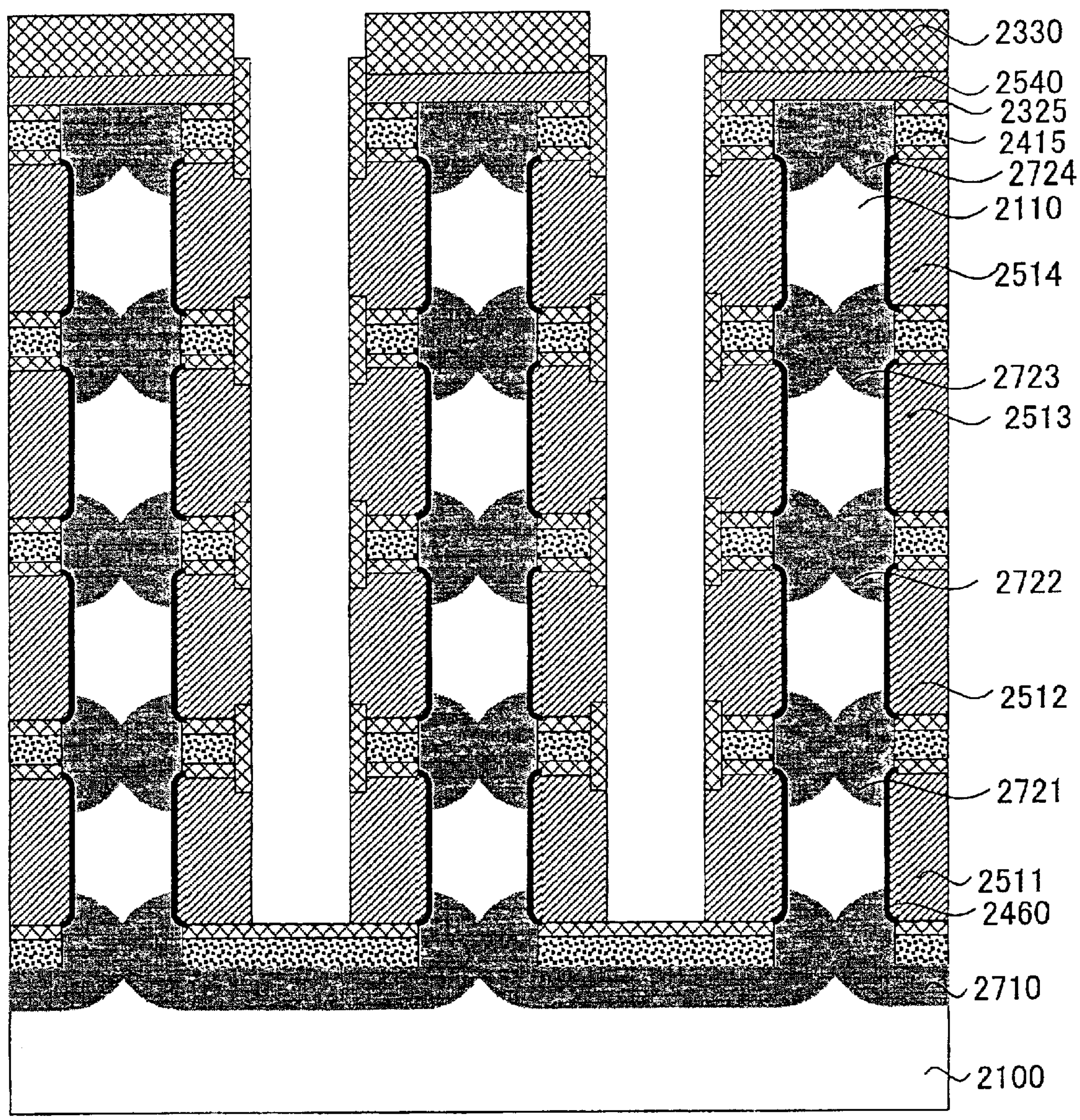
Figure 860:
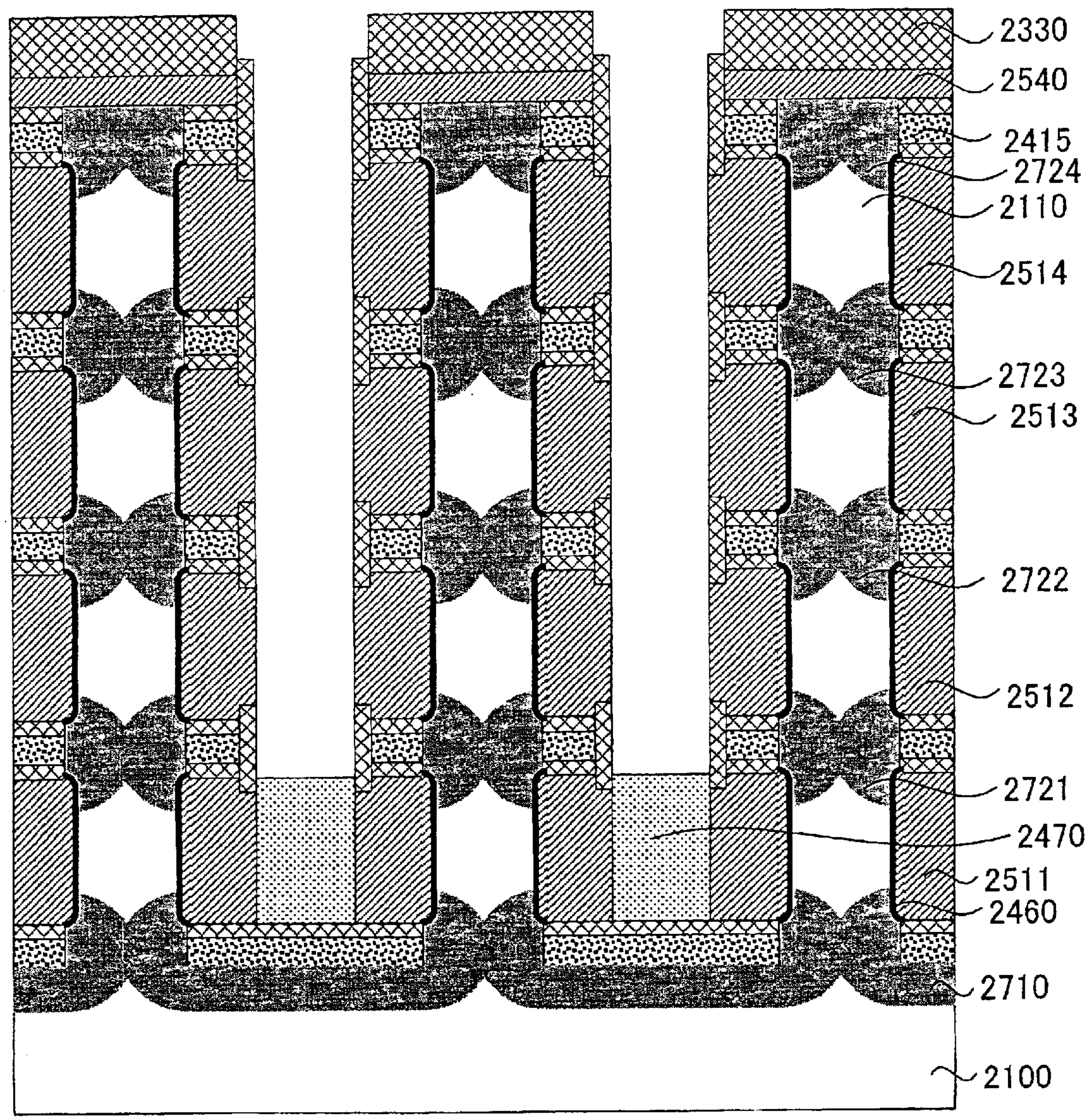
Figure 861:
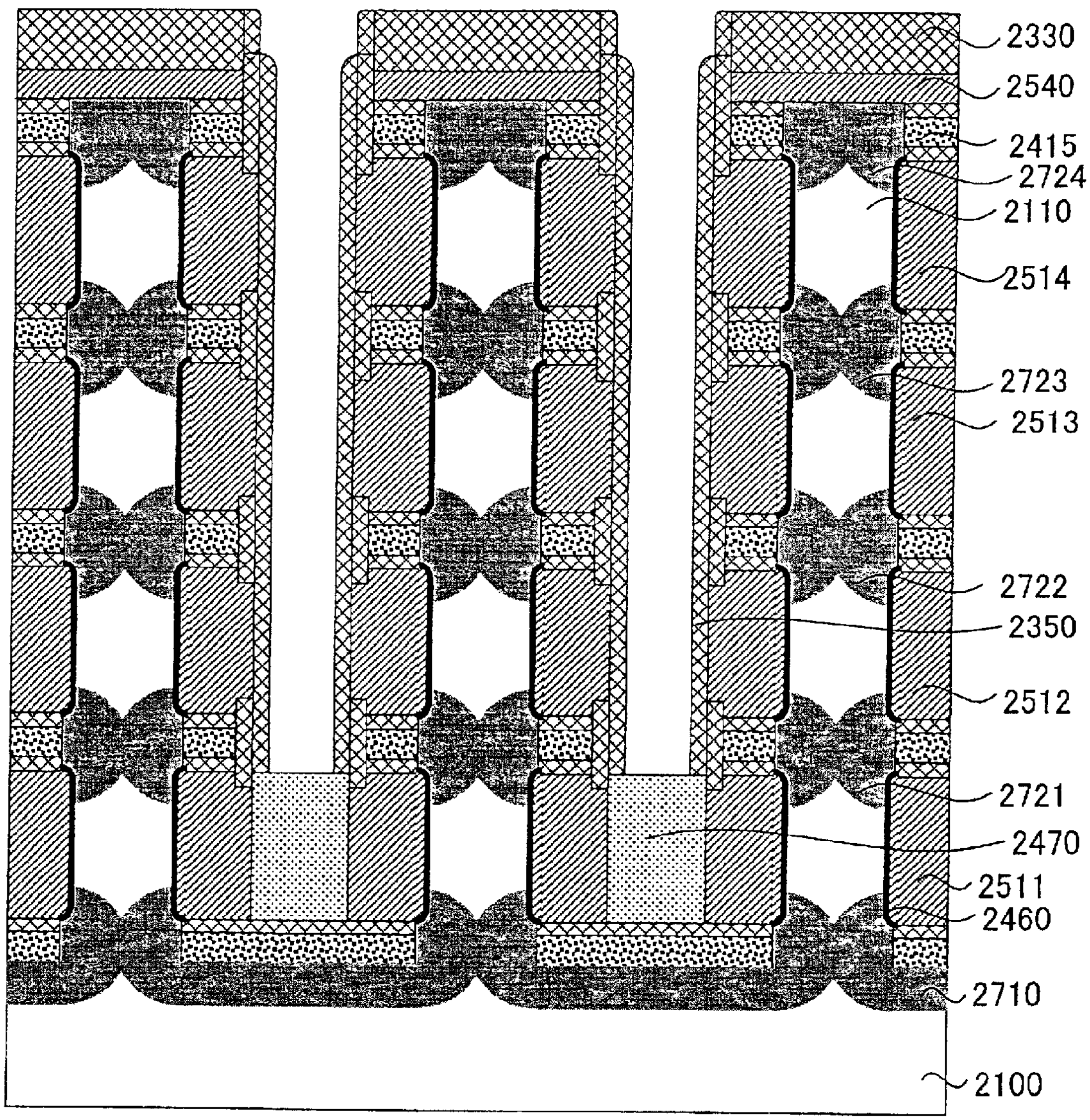
Figure 862:
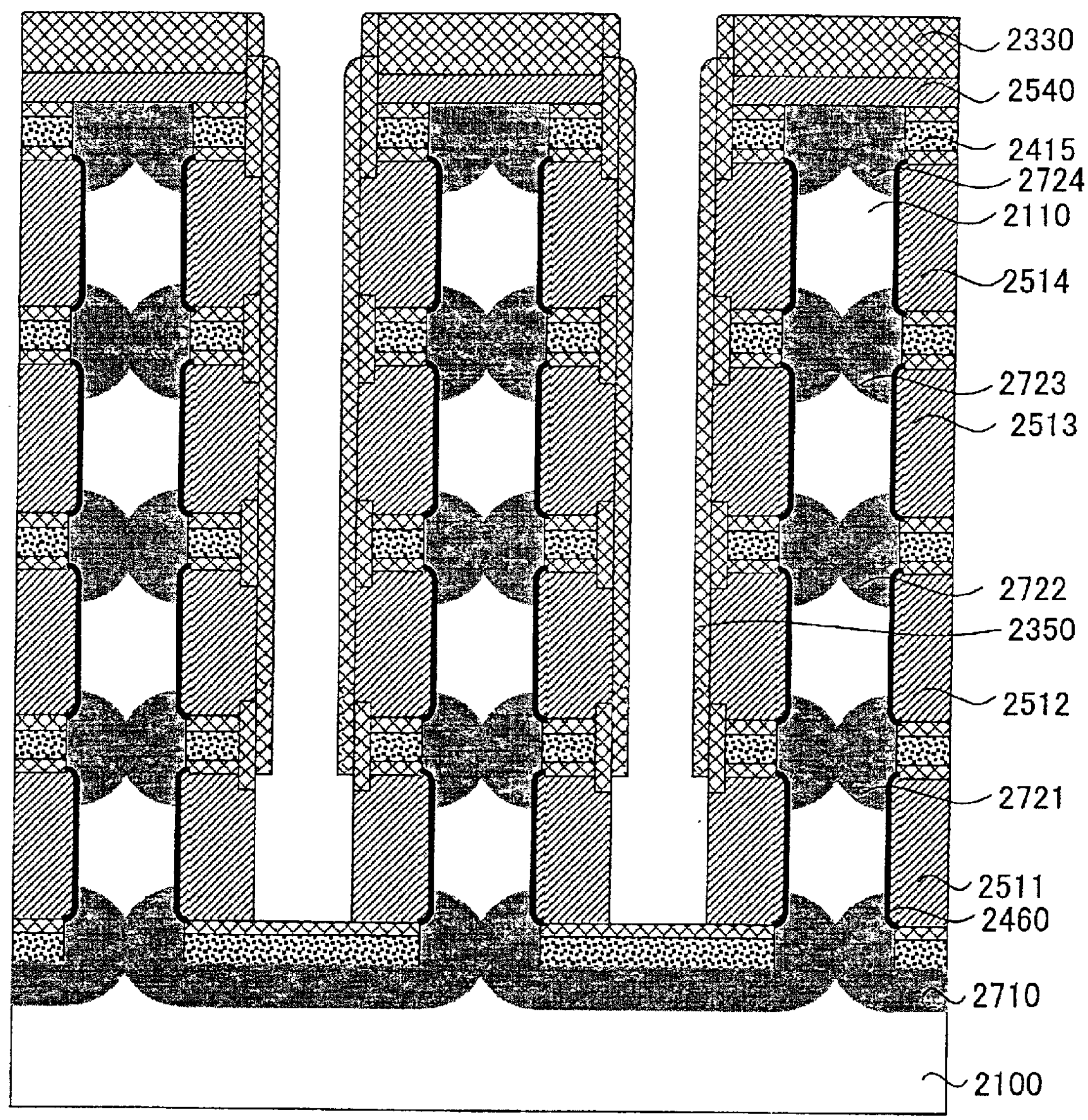
Figure 863:
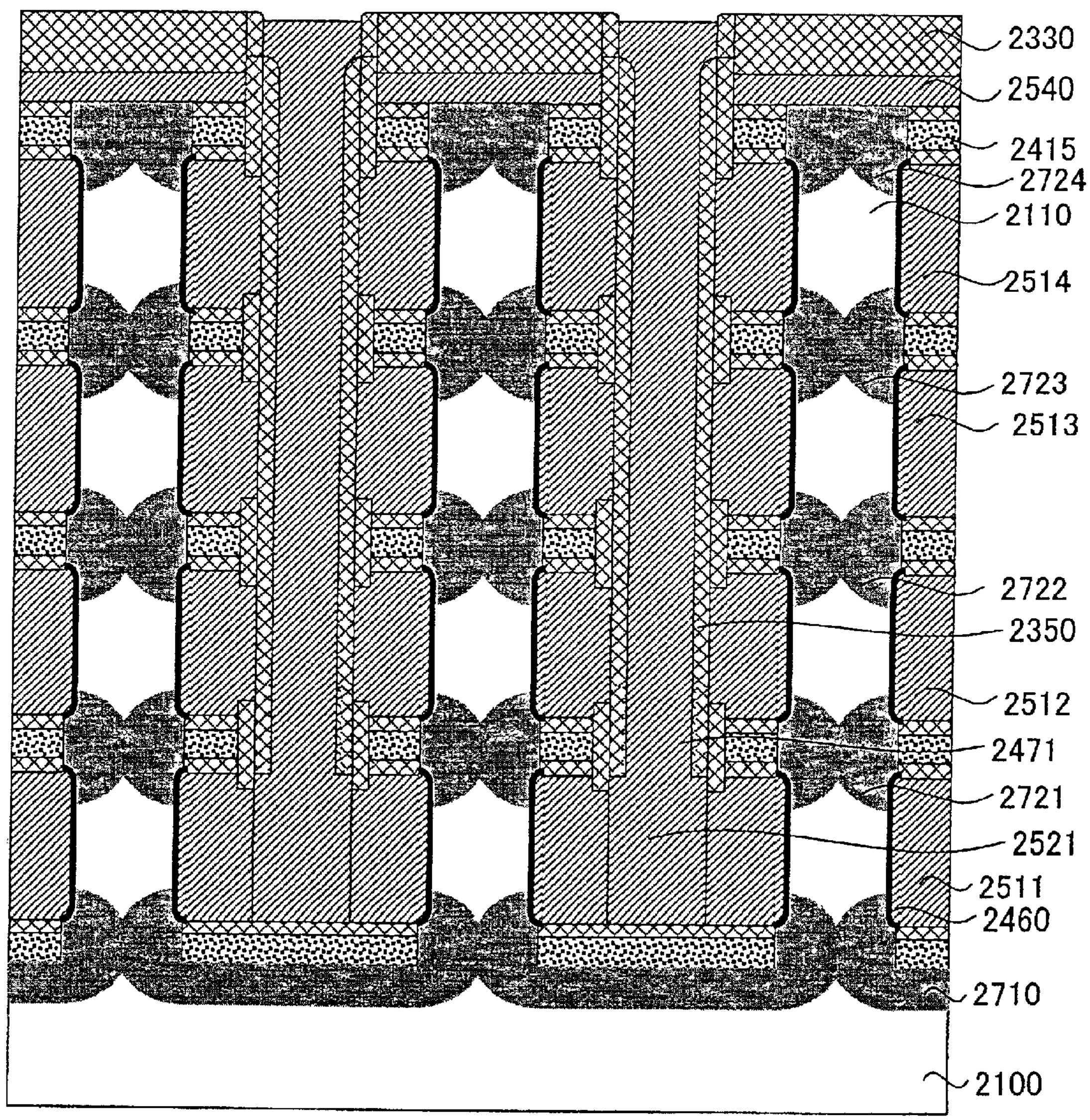
Figure 864:
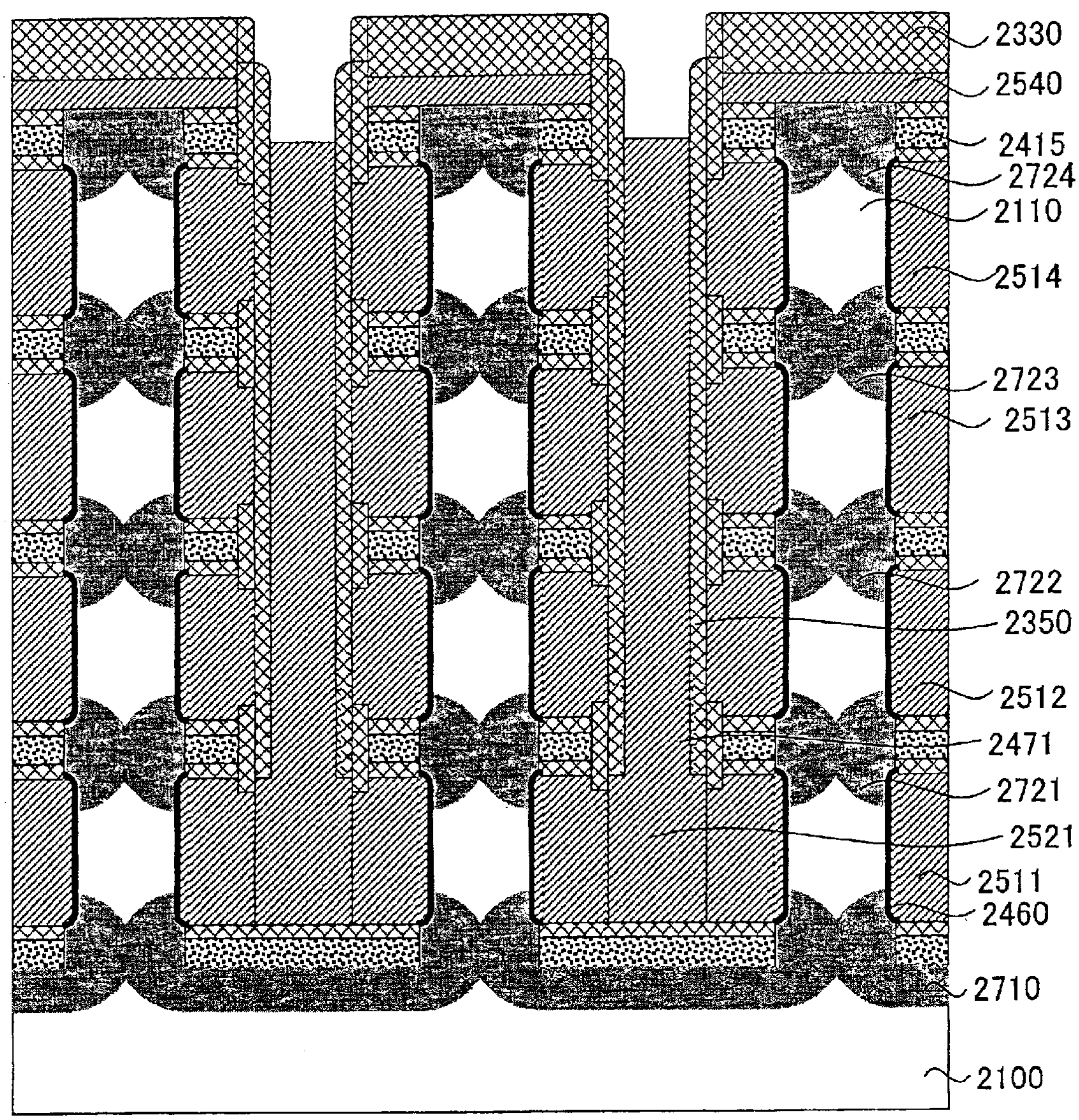
Figure 865:
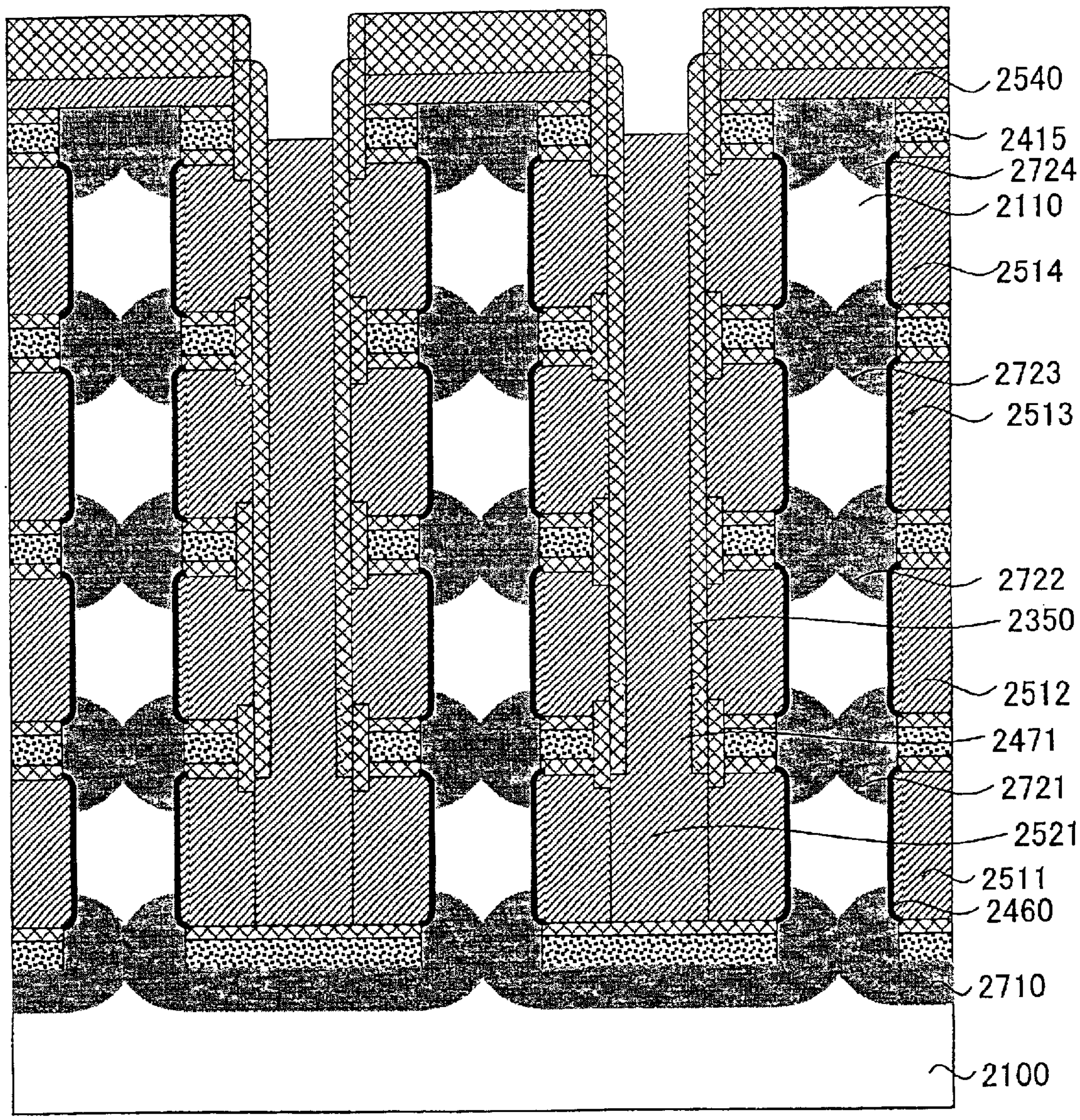
Figure 866:
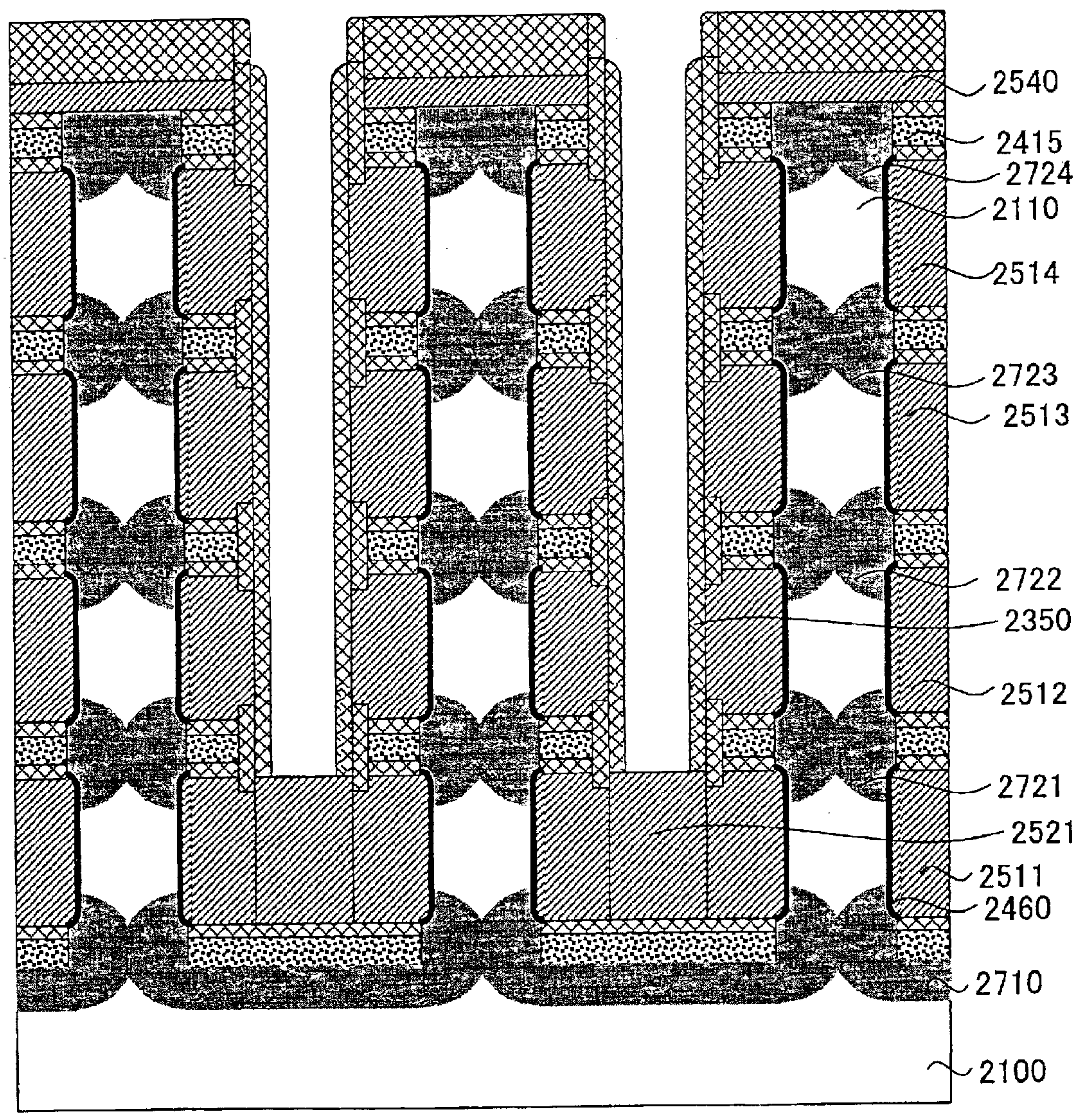
Figure 867:
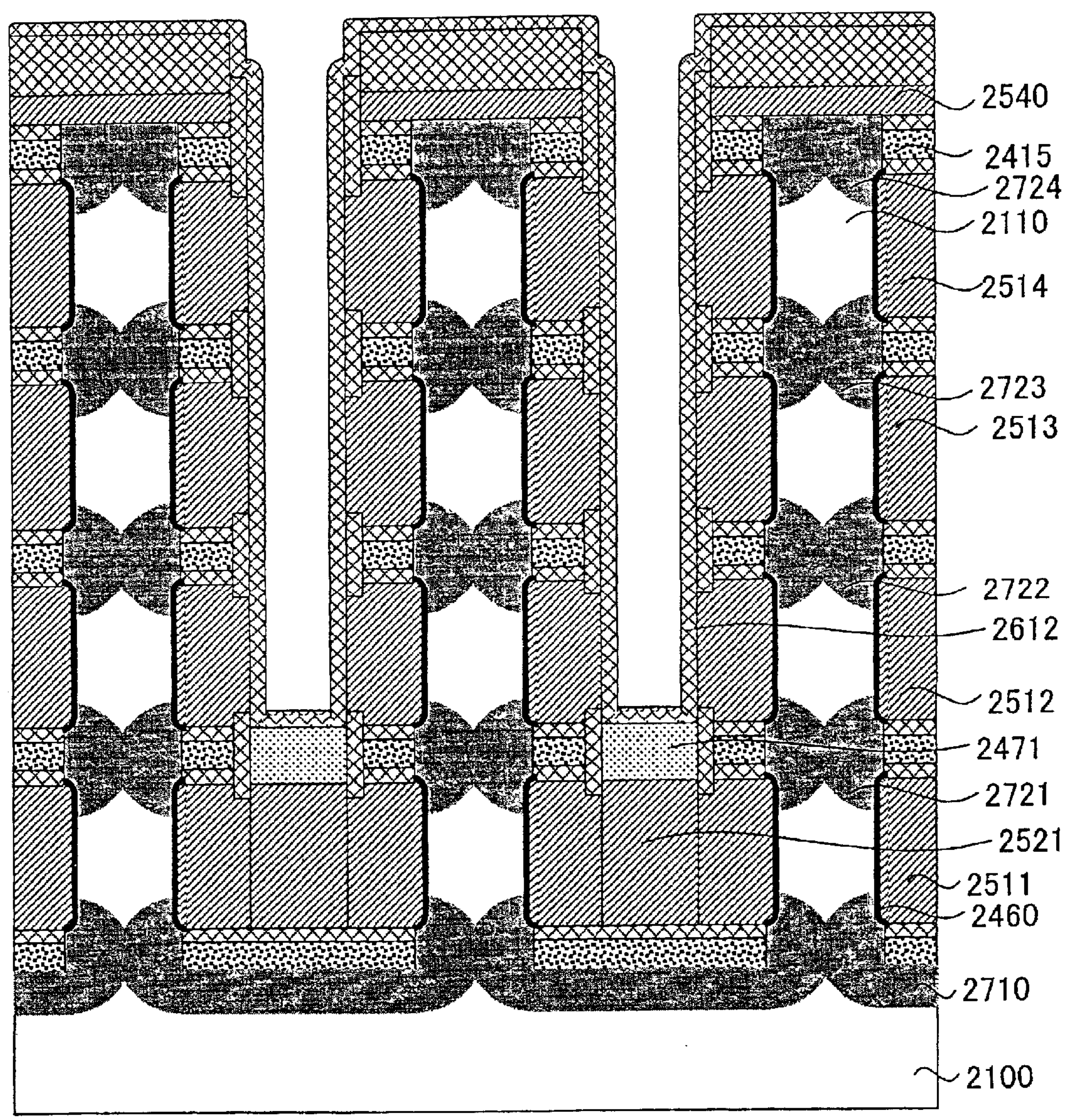
Figure 868:
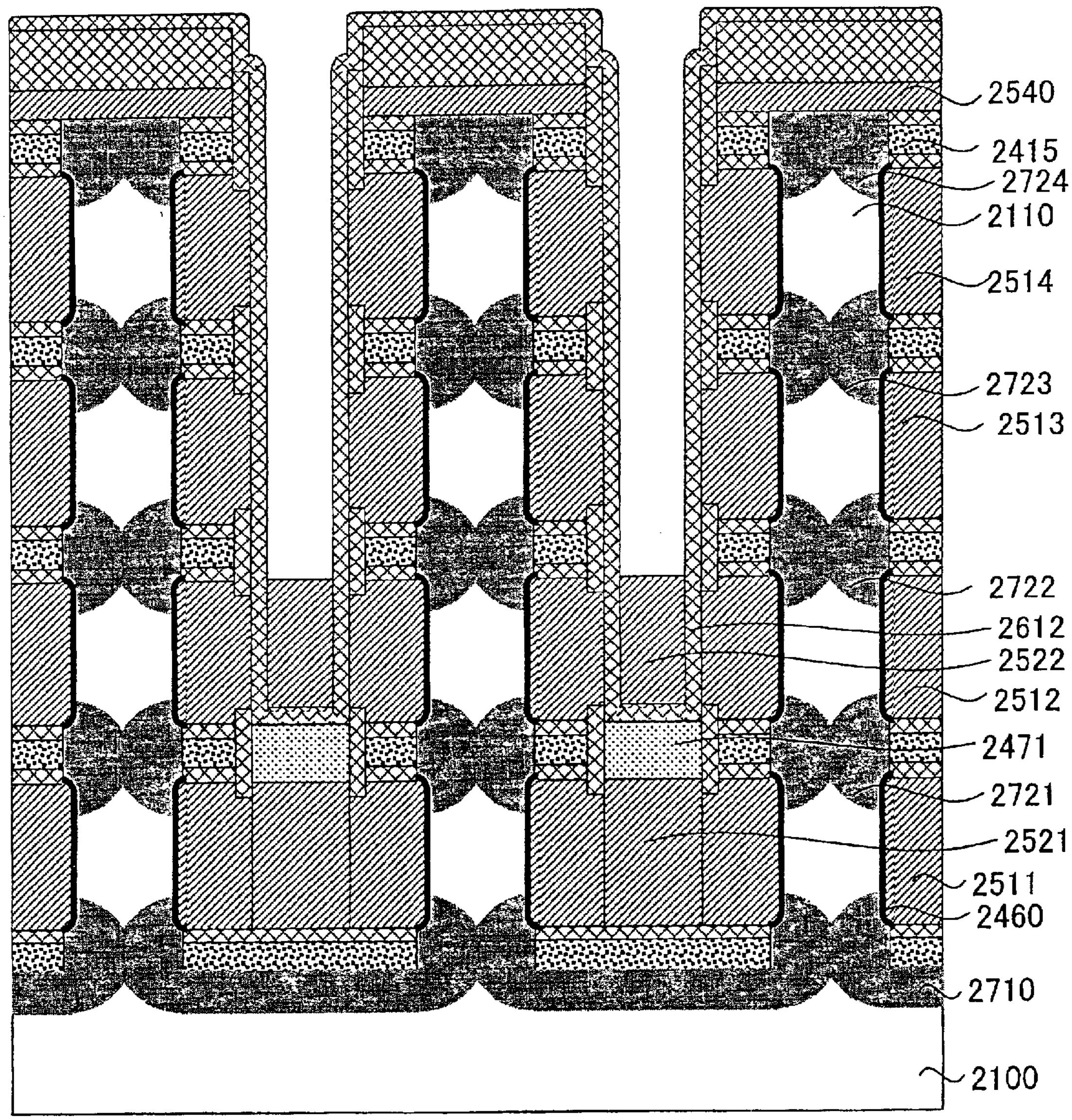
Figure 869:
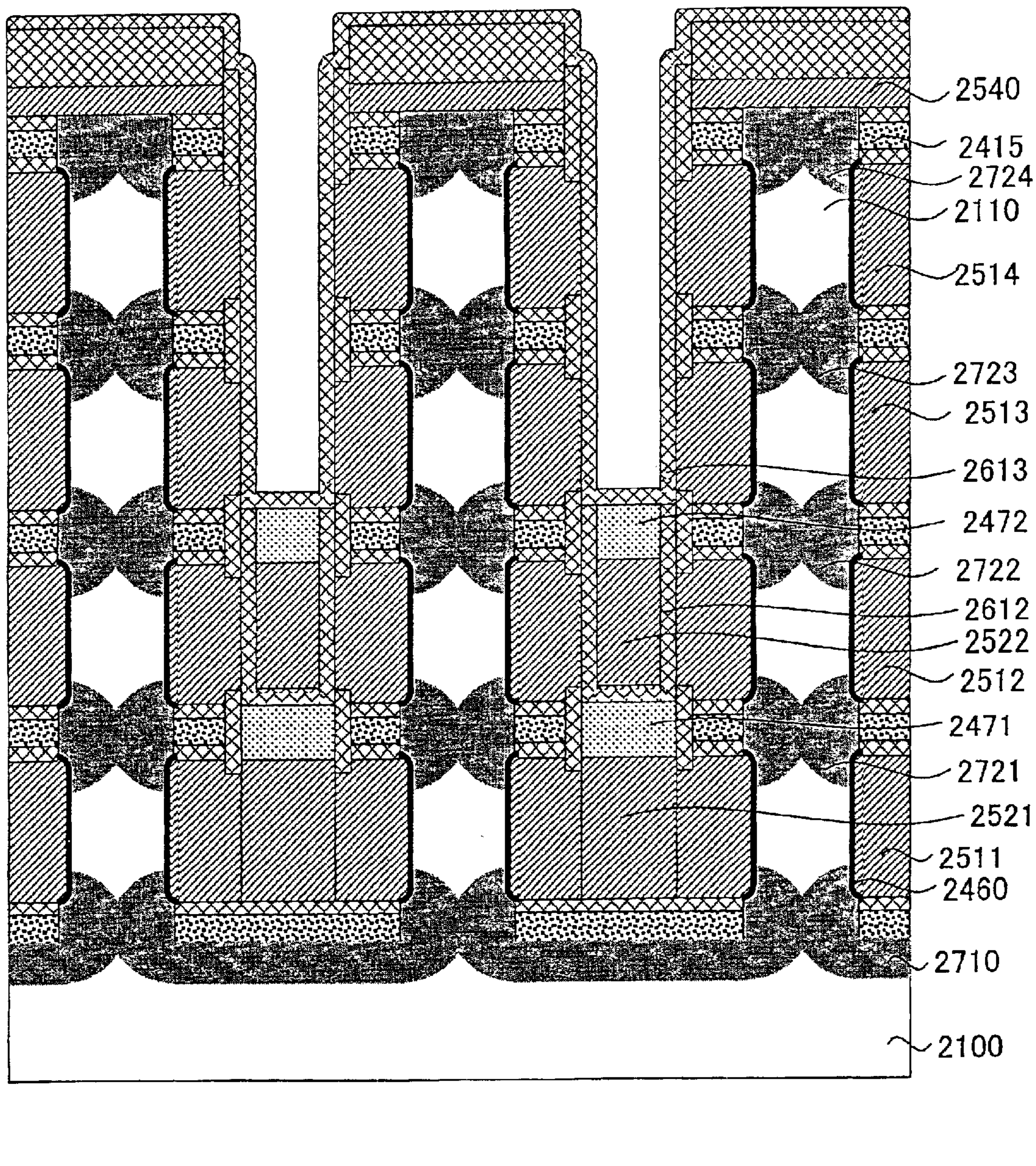
Figure 870:
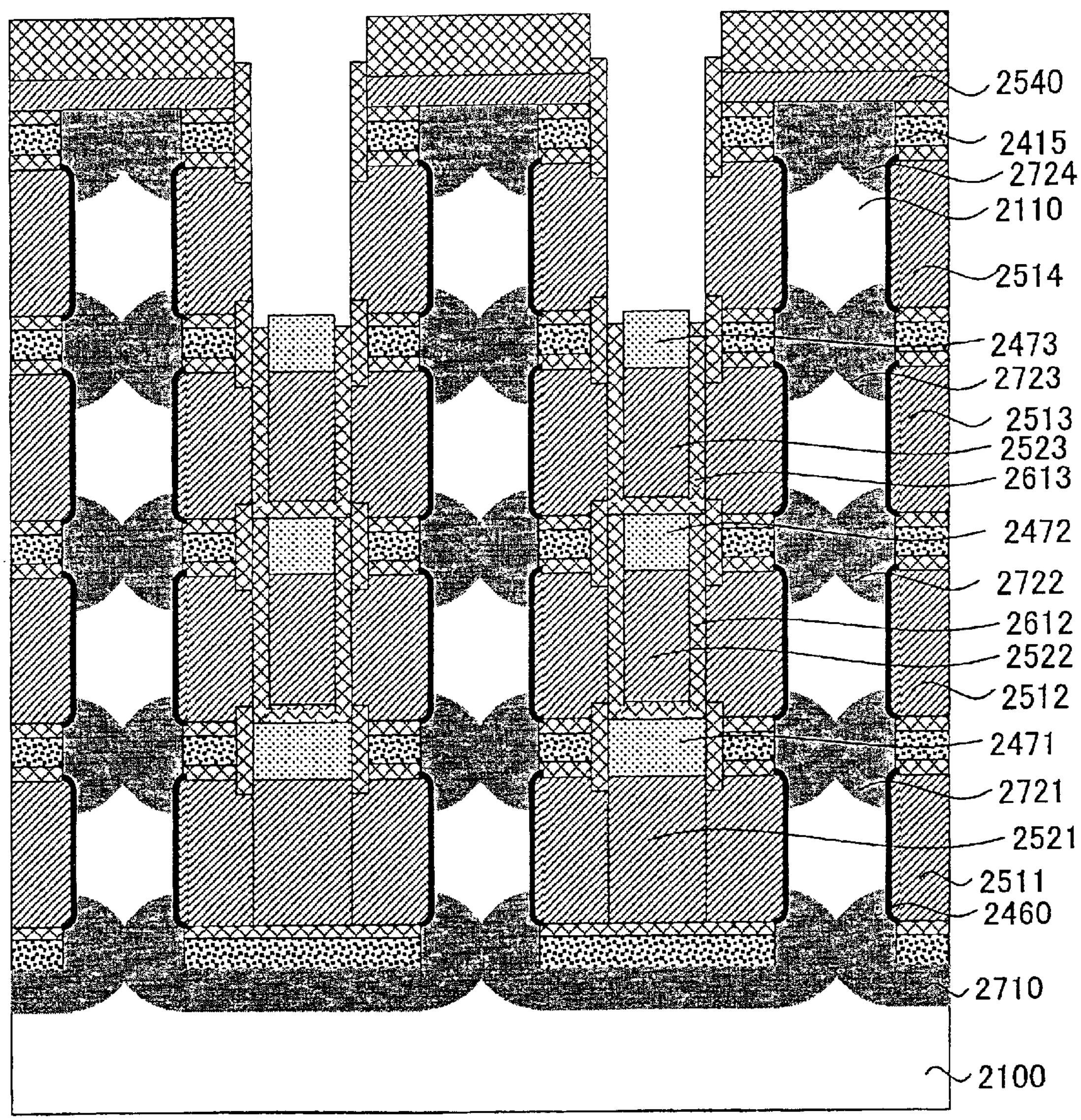
Figure 871:
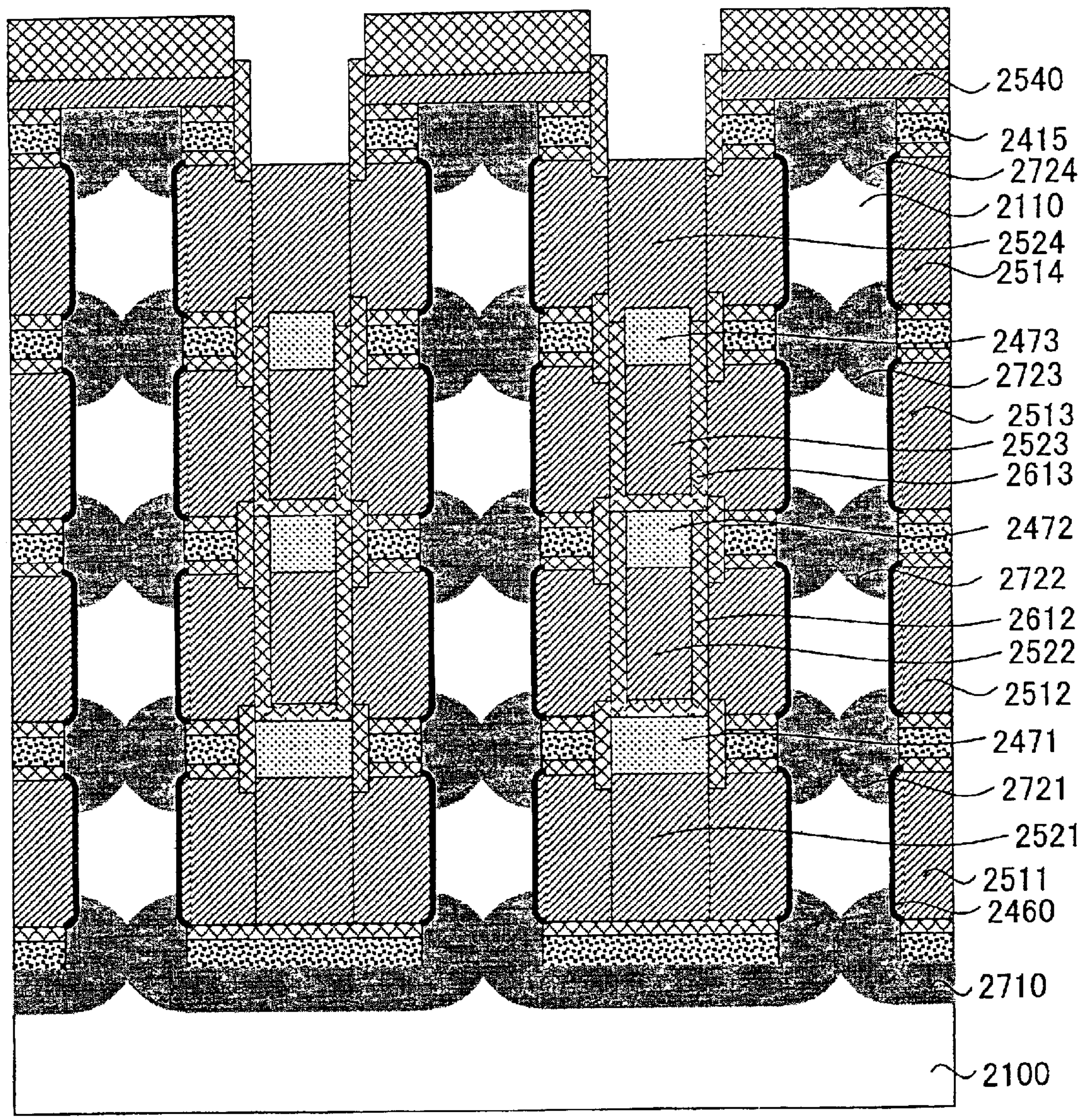
Figure 872:
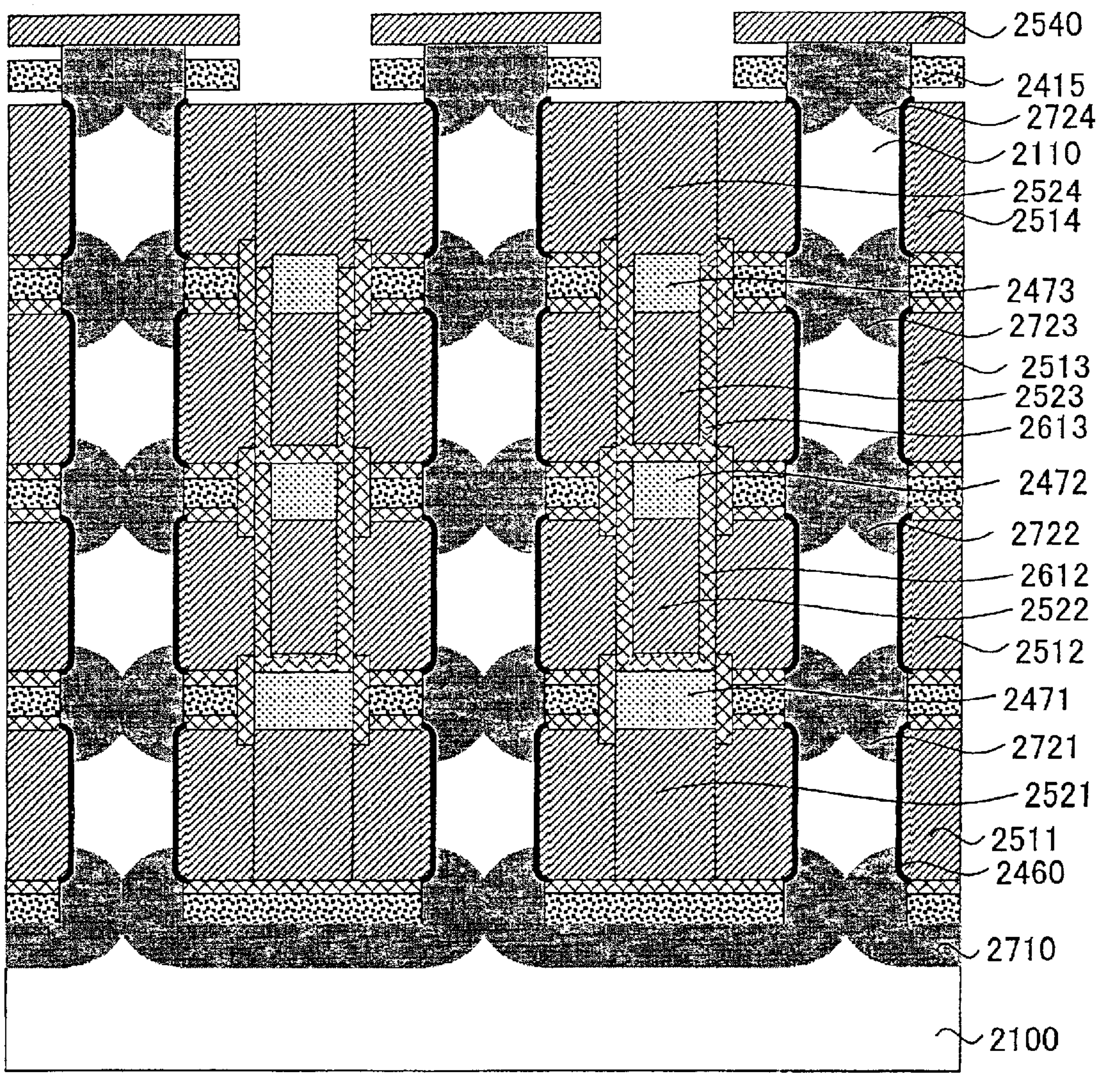
Figure 873:
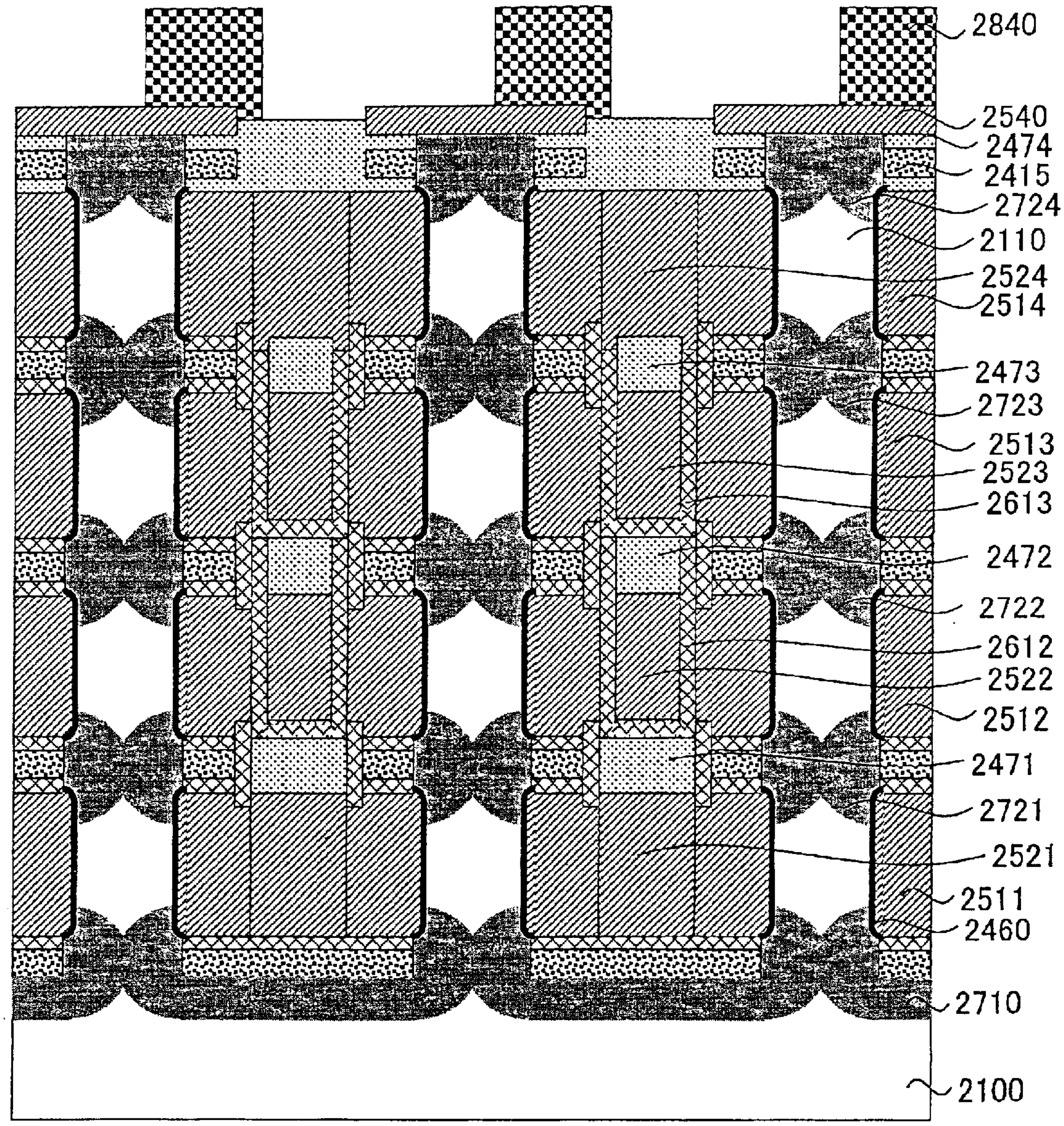
Figure 874:
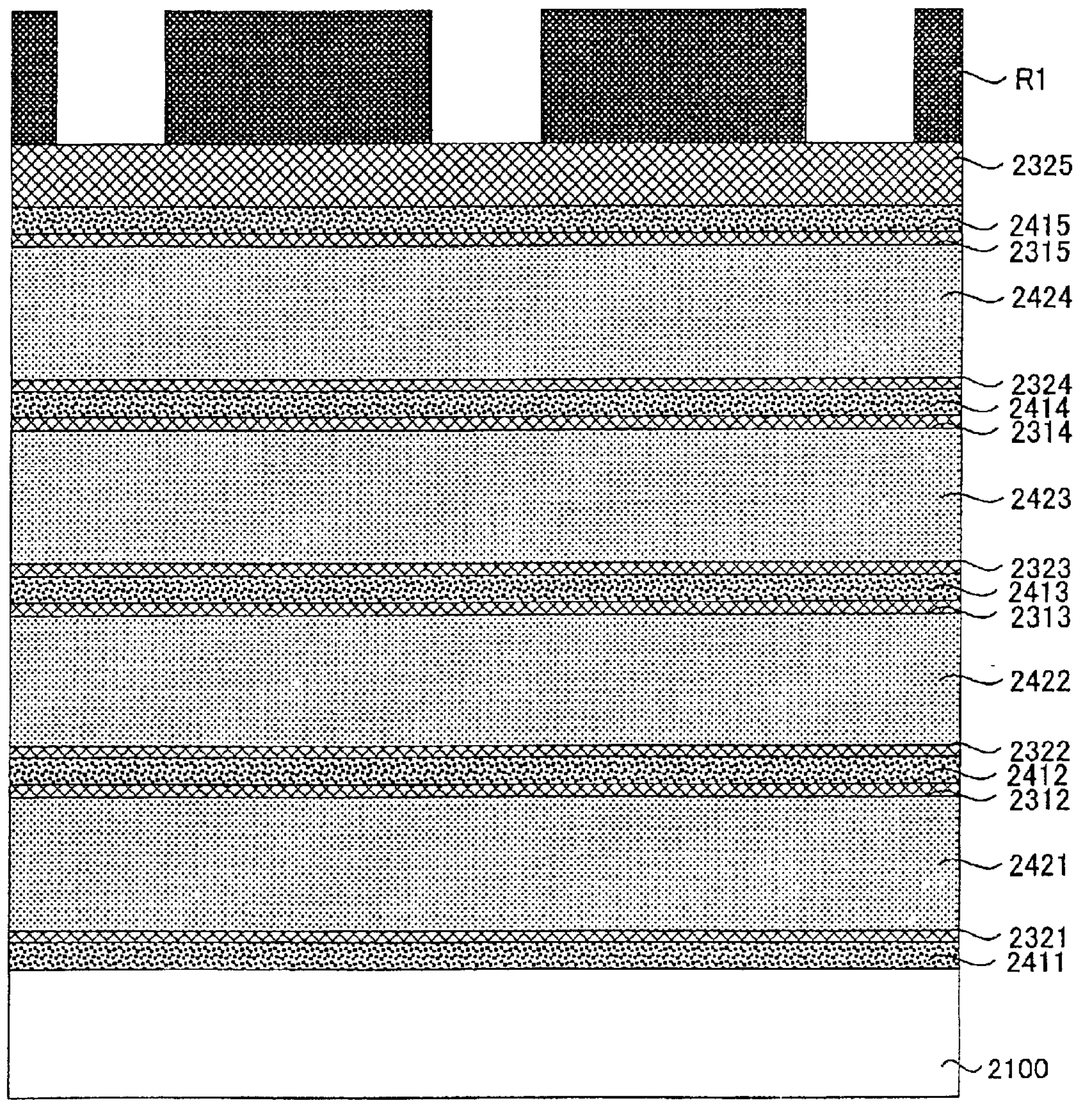
Figure 875:
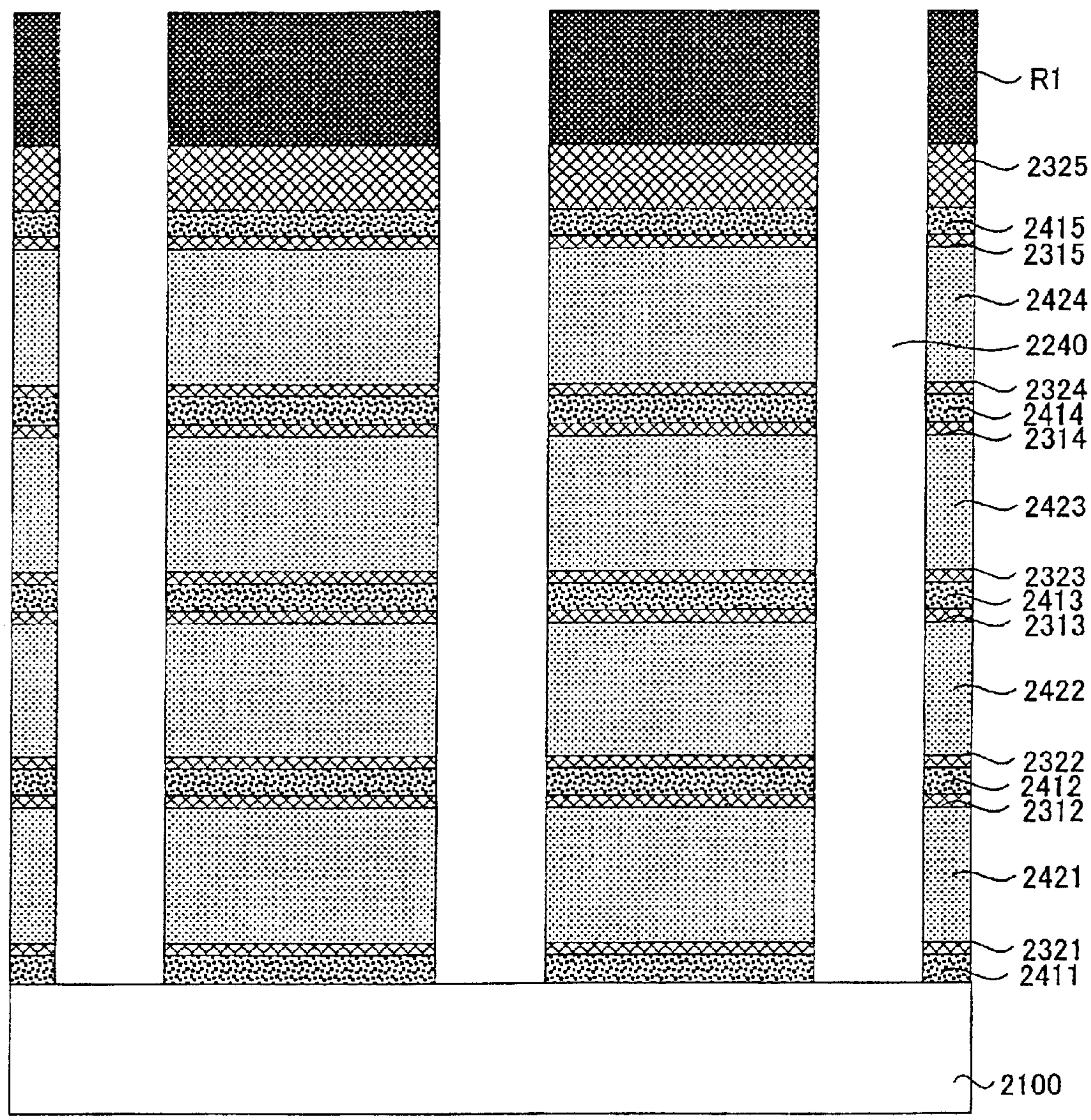
Figure 876:
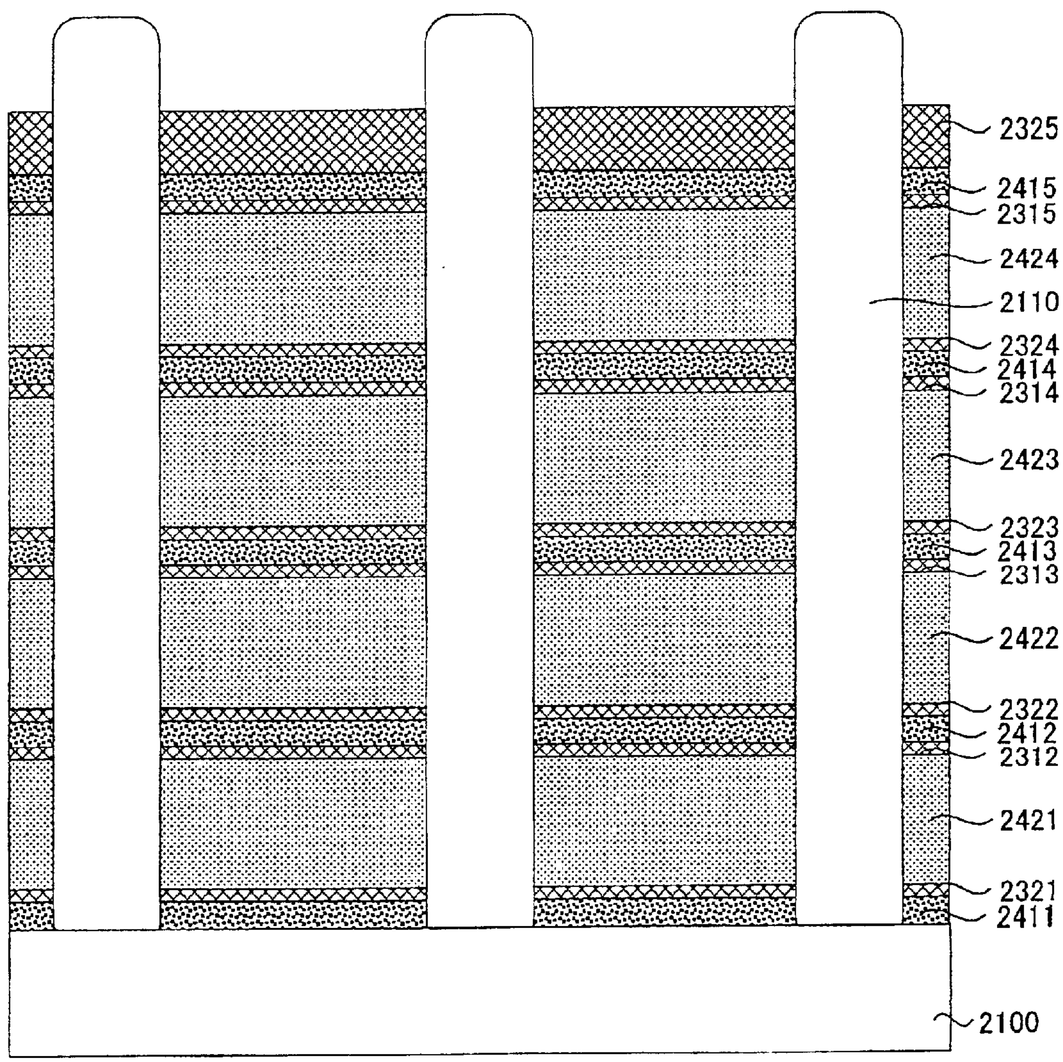
Figure 877:
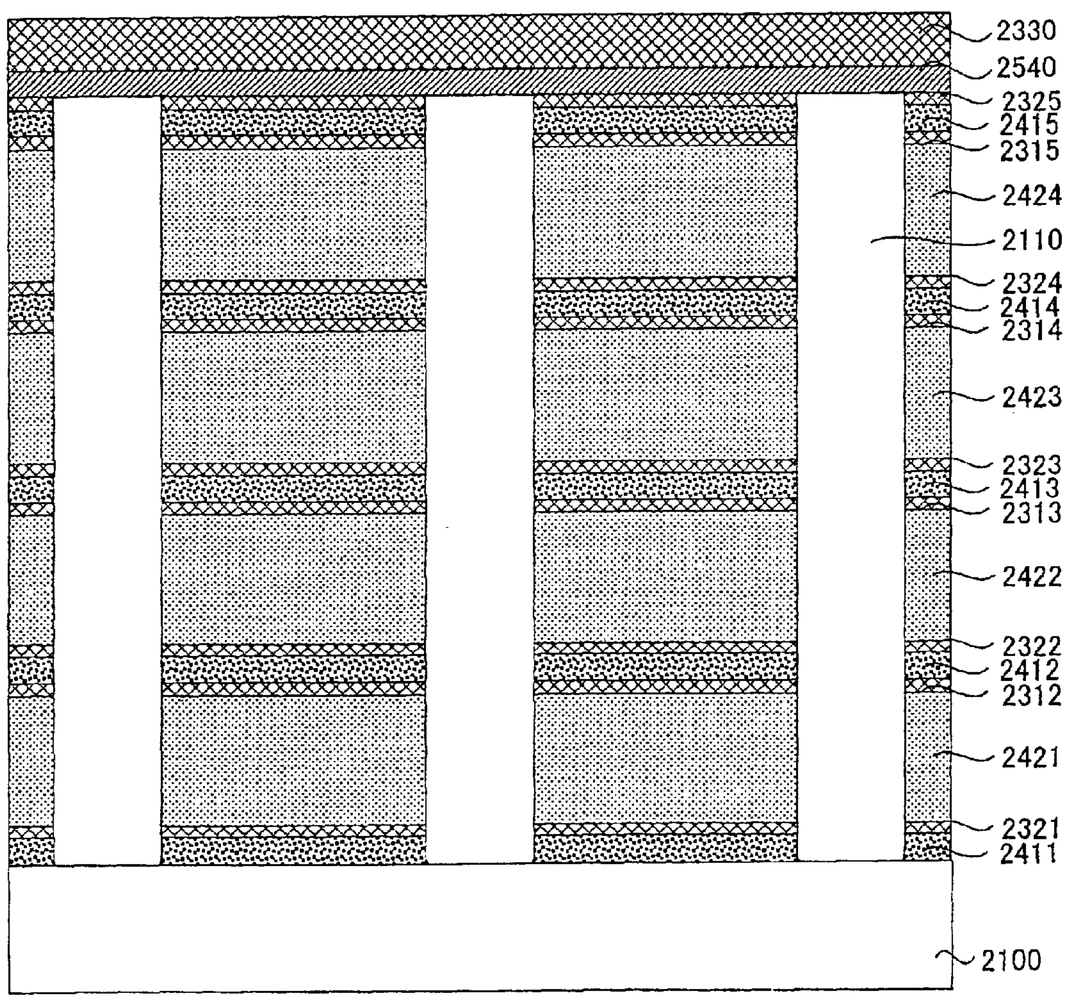
Figure 878:
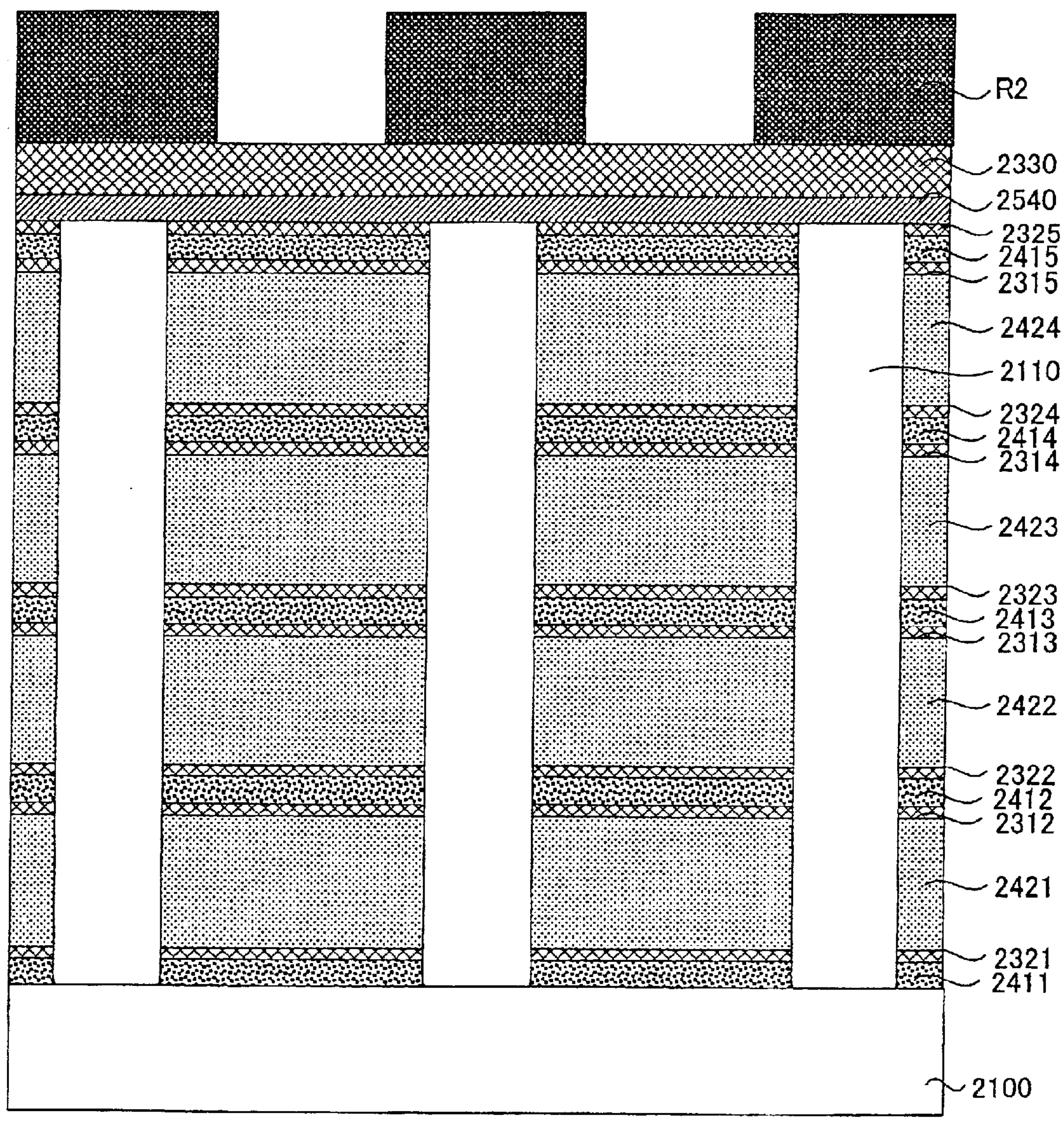
Figure 884:
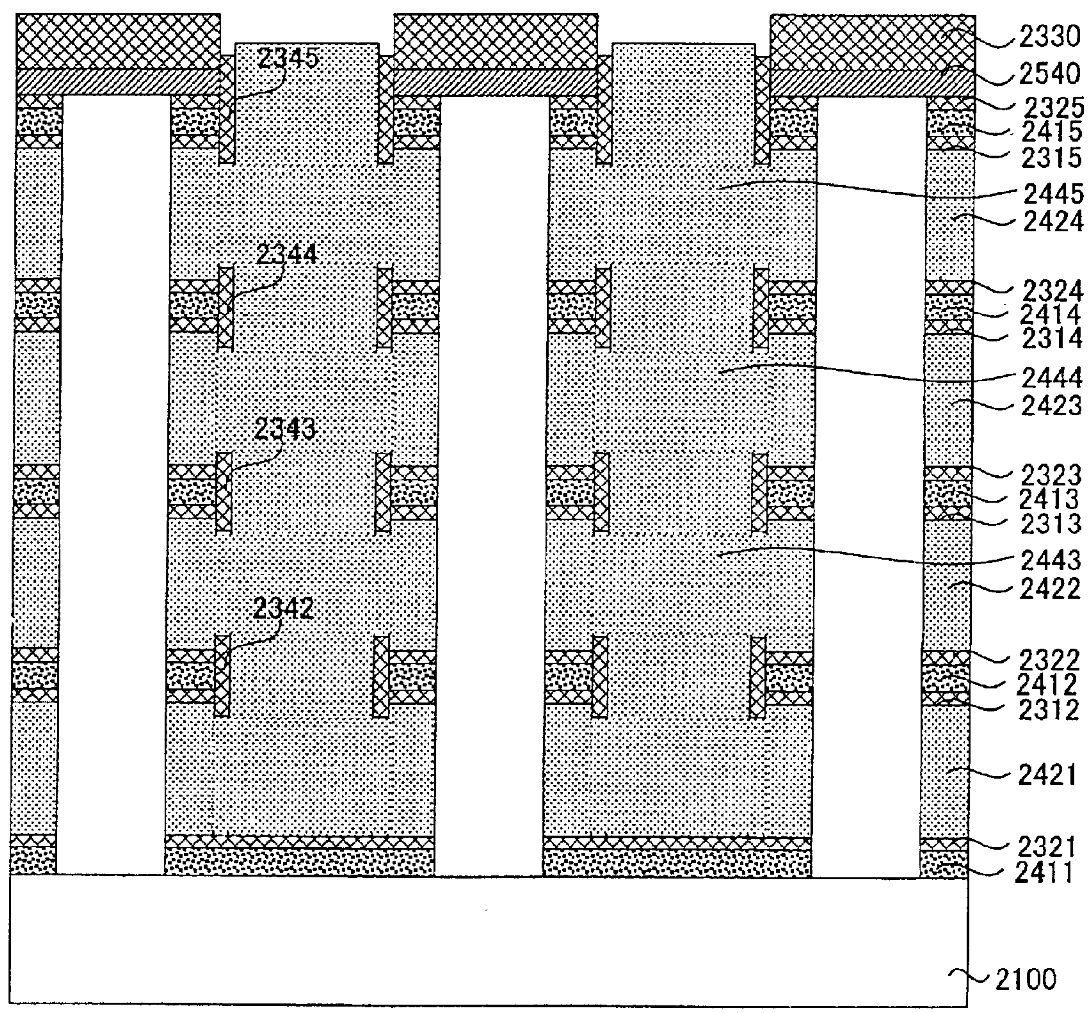
Figure 885:
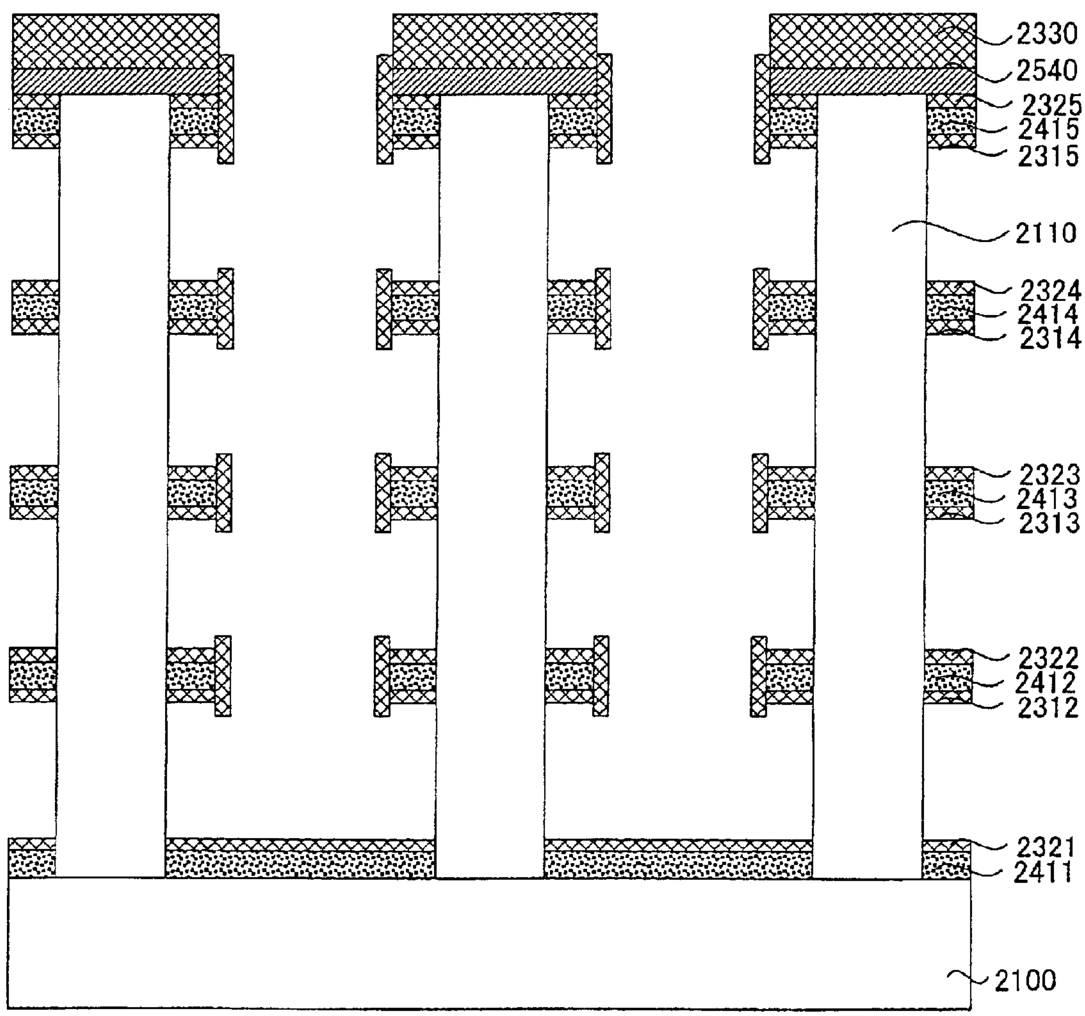
Figure 886:
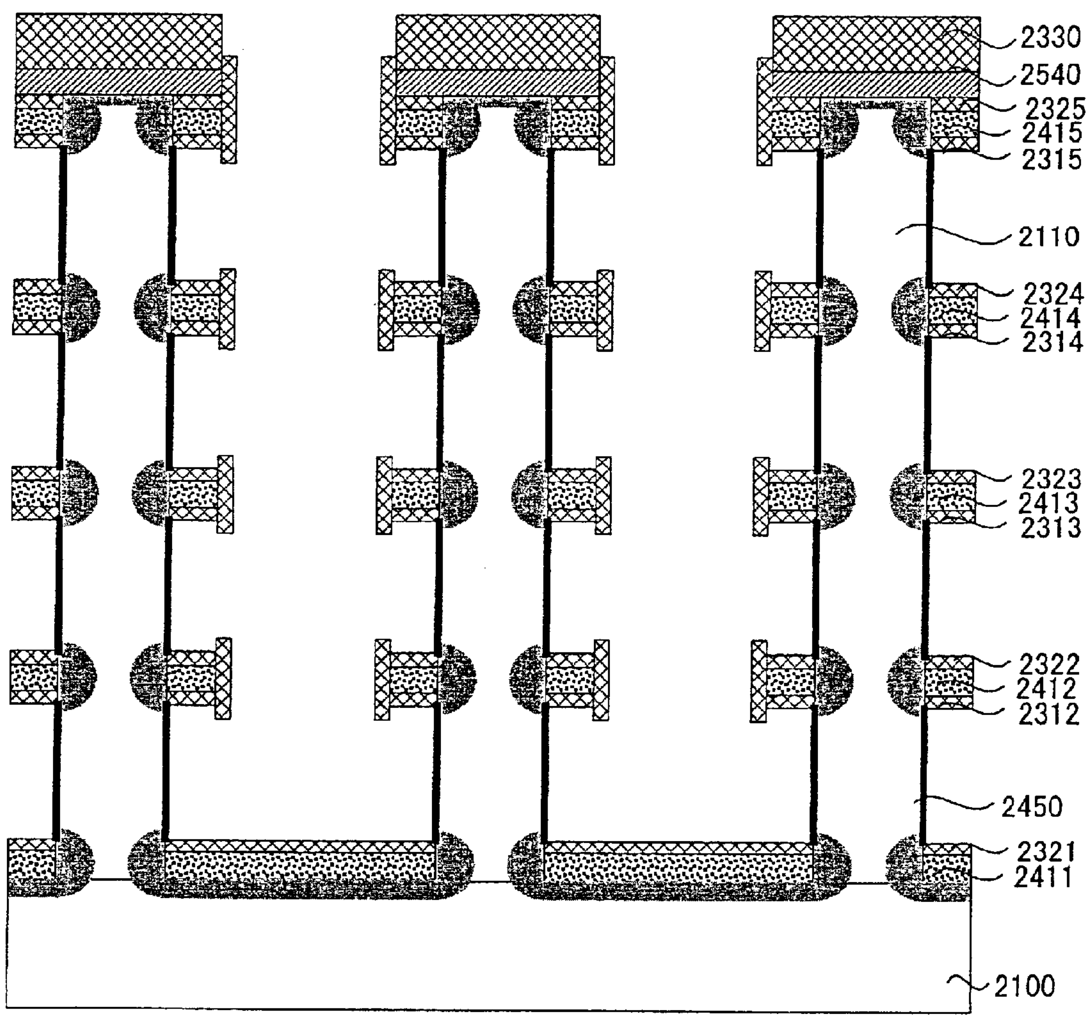
Figure 887:
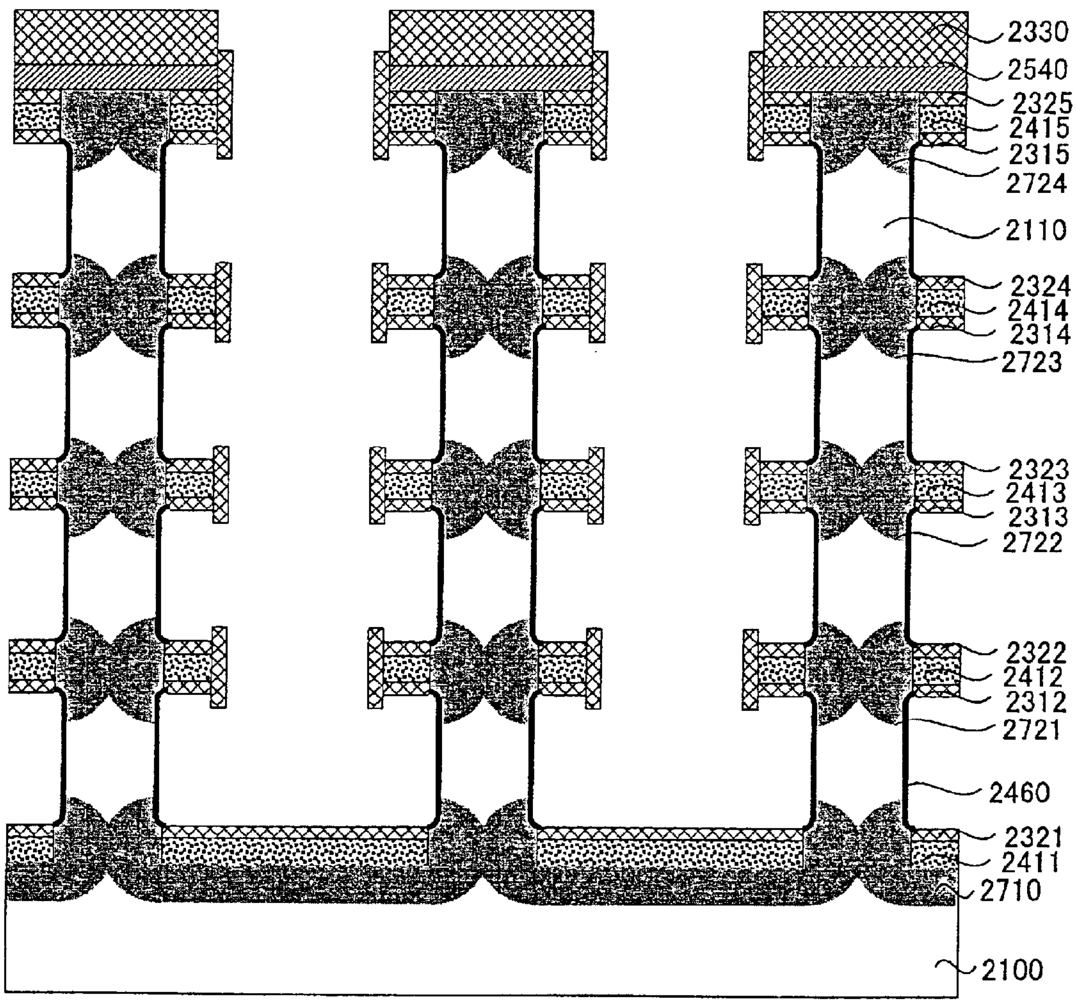
Figure 888:
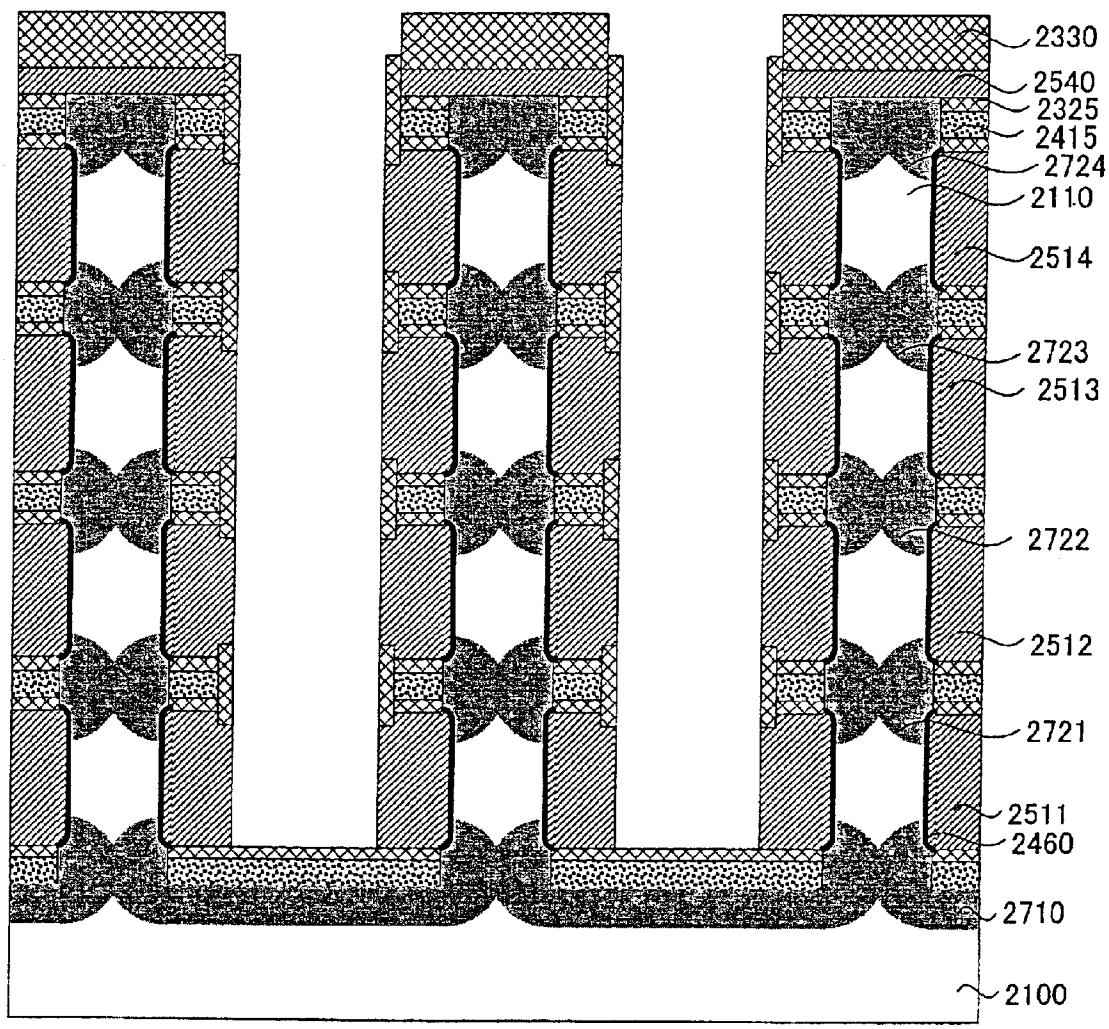
Figure 889:
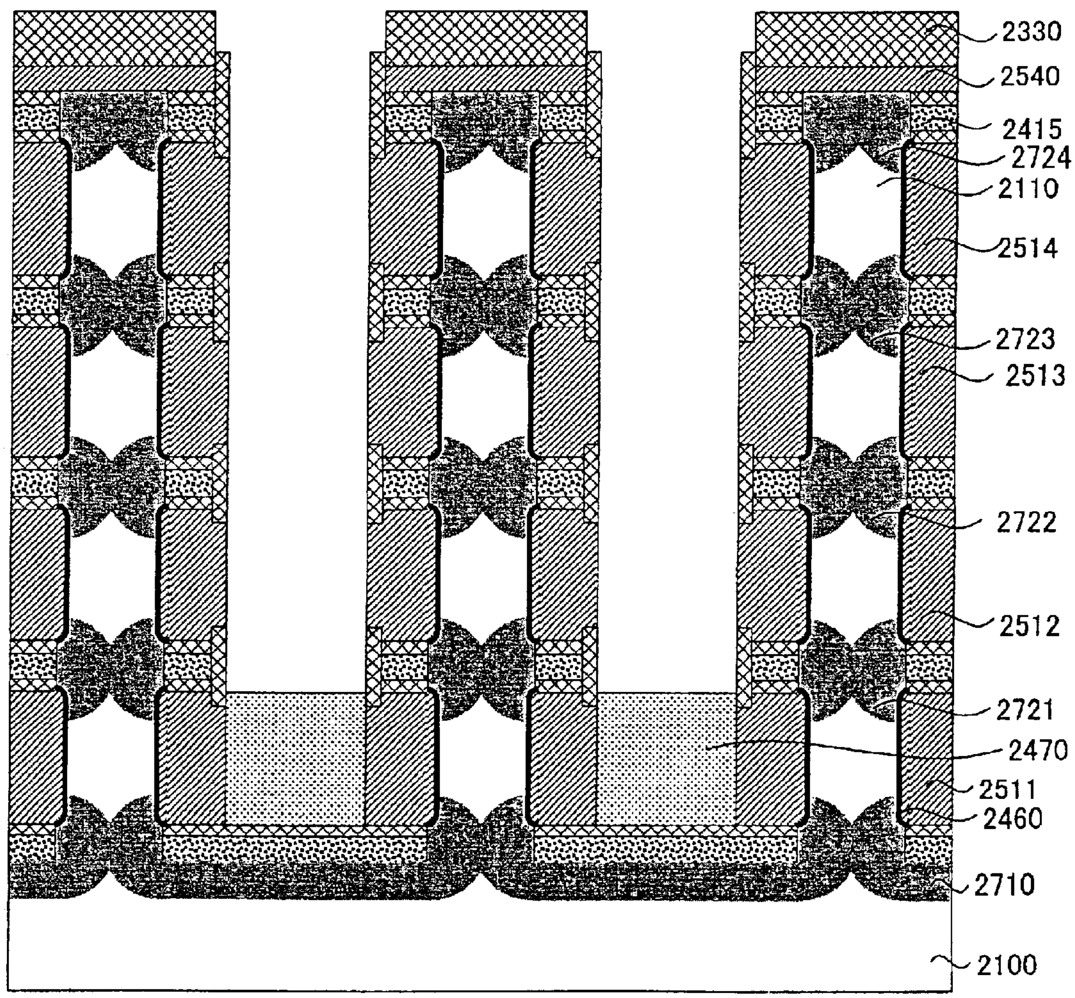
Figure 890:
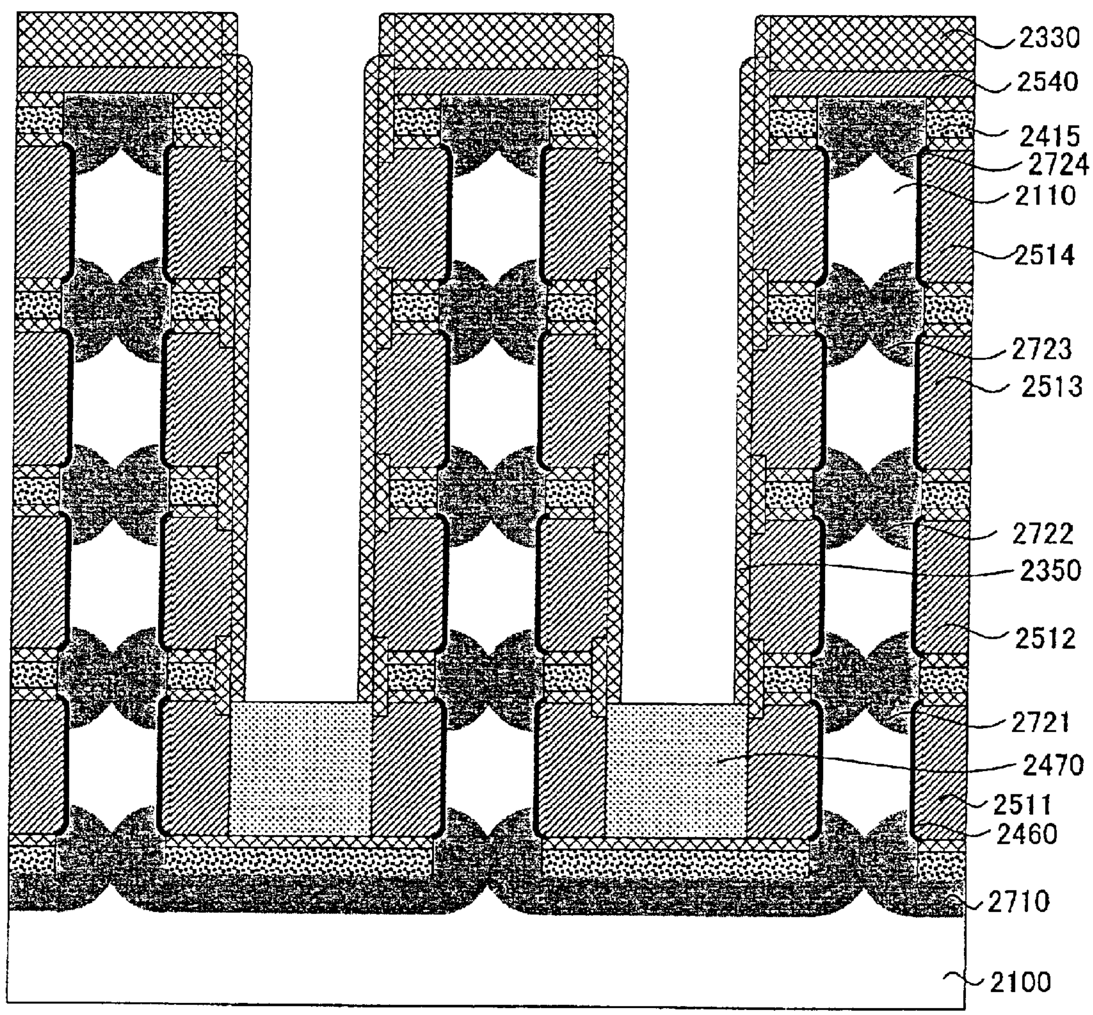
Figure 891:
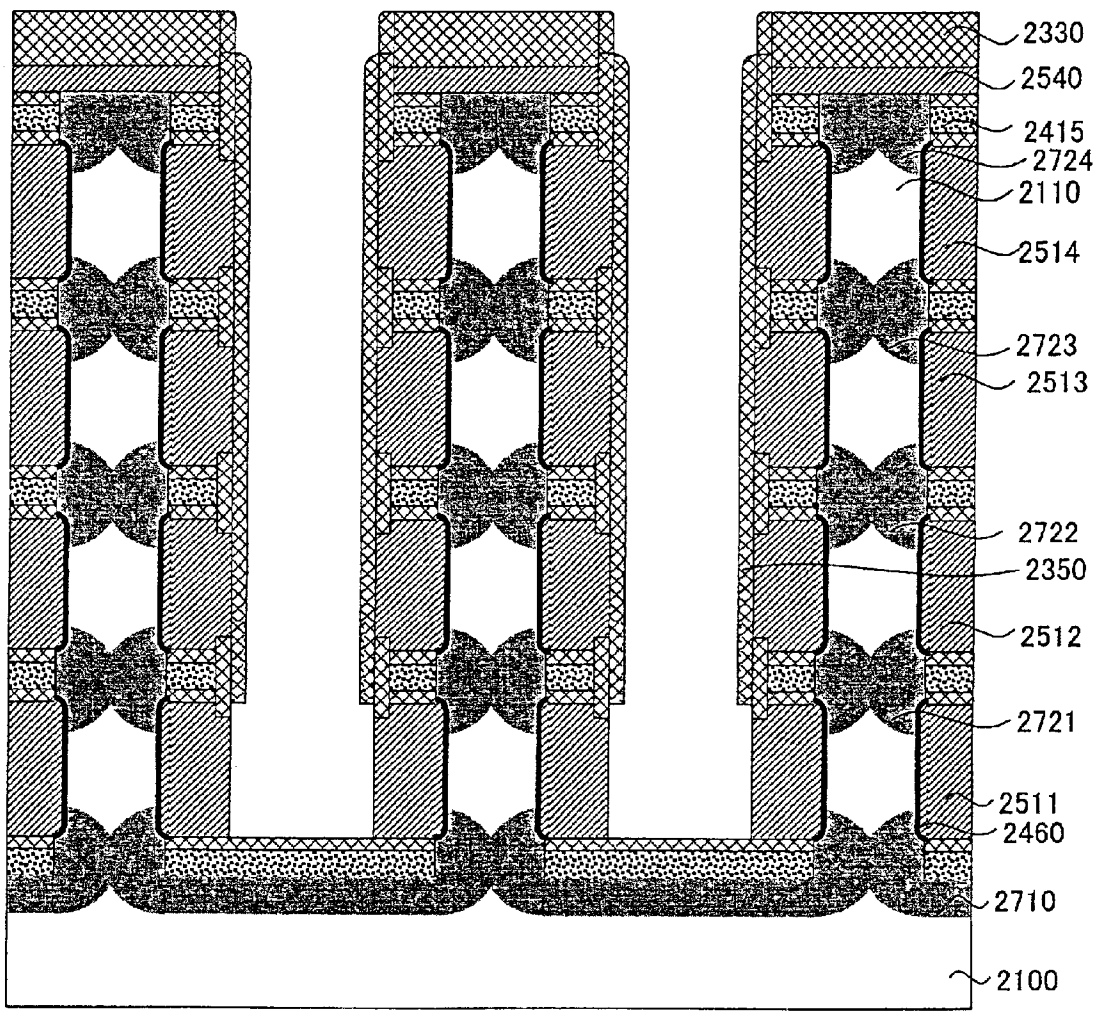
Figure 892:
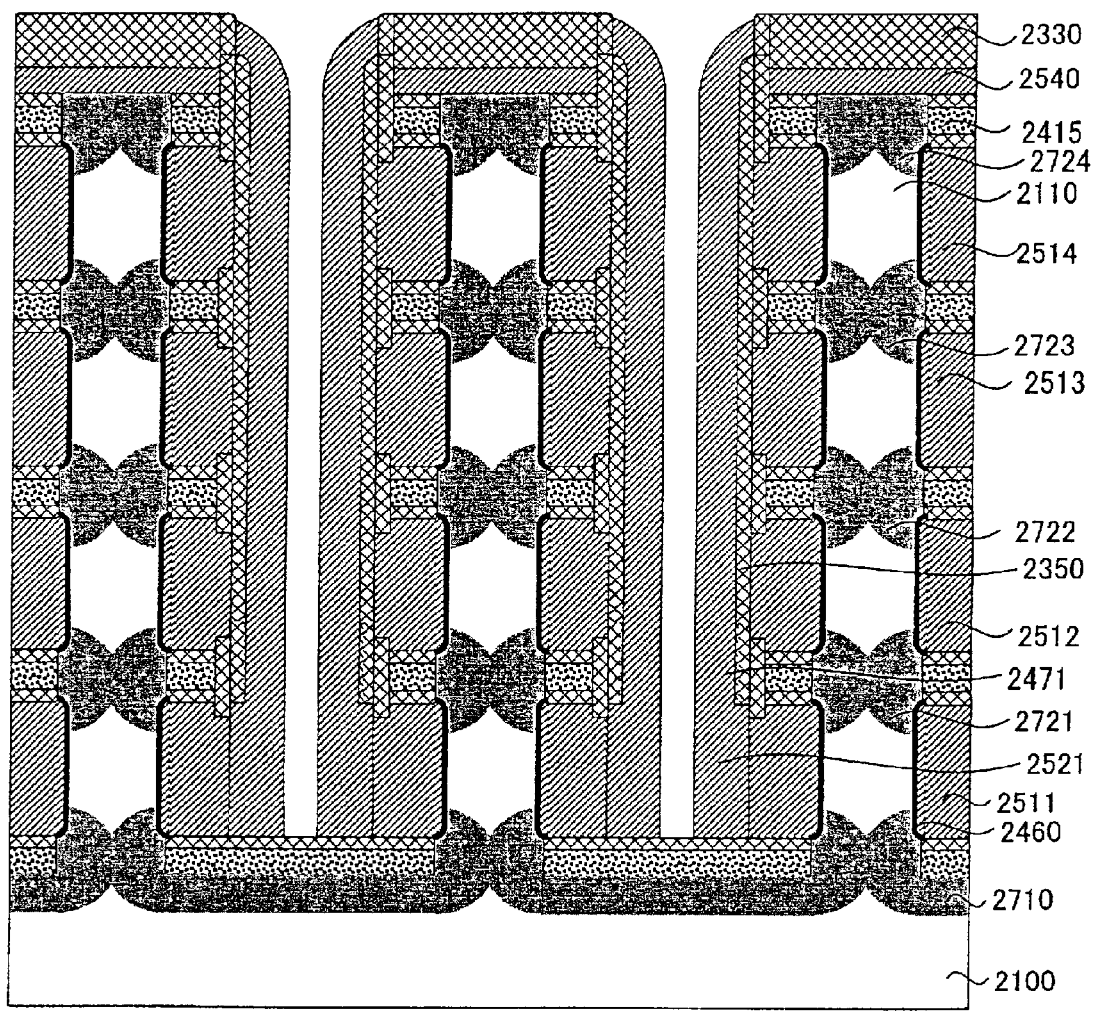
Figure 893:
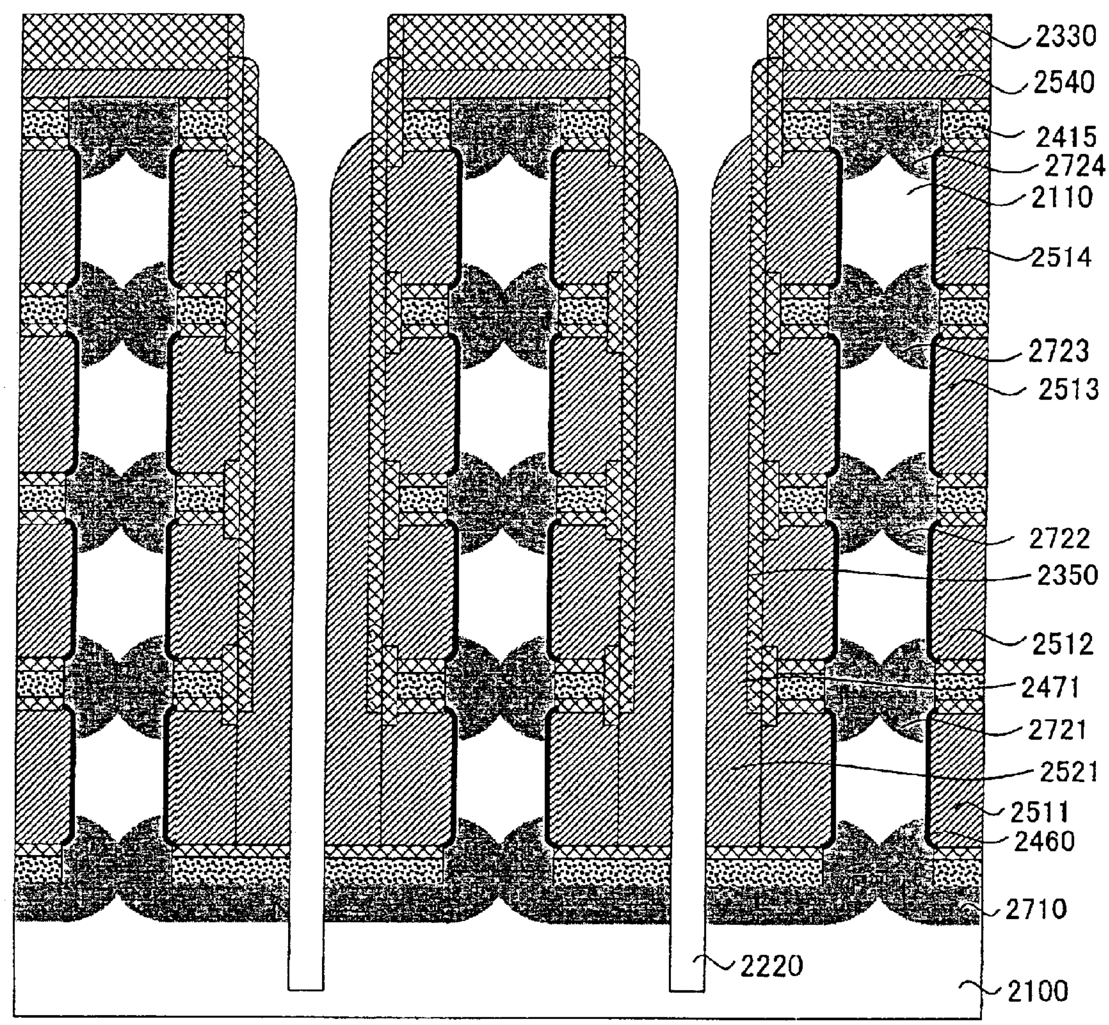
Figure 894:
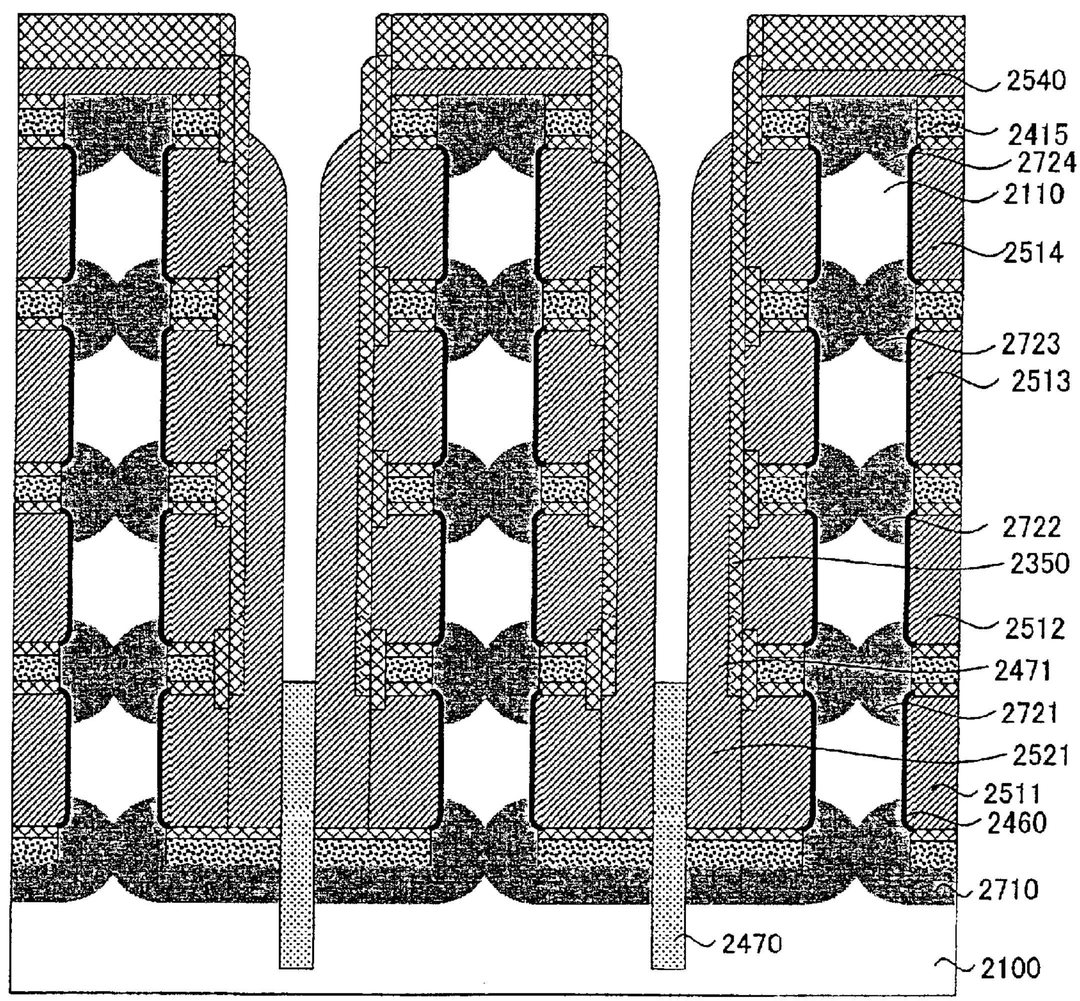
Figure 895:
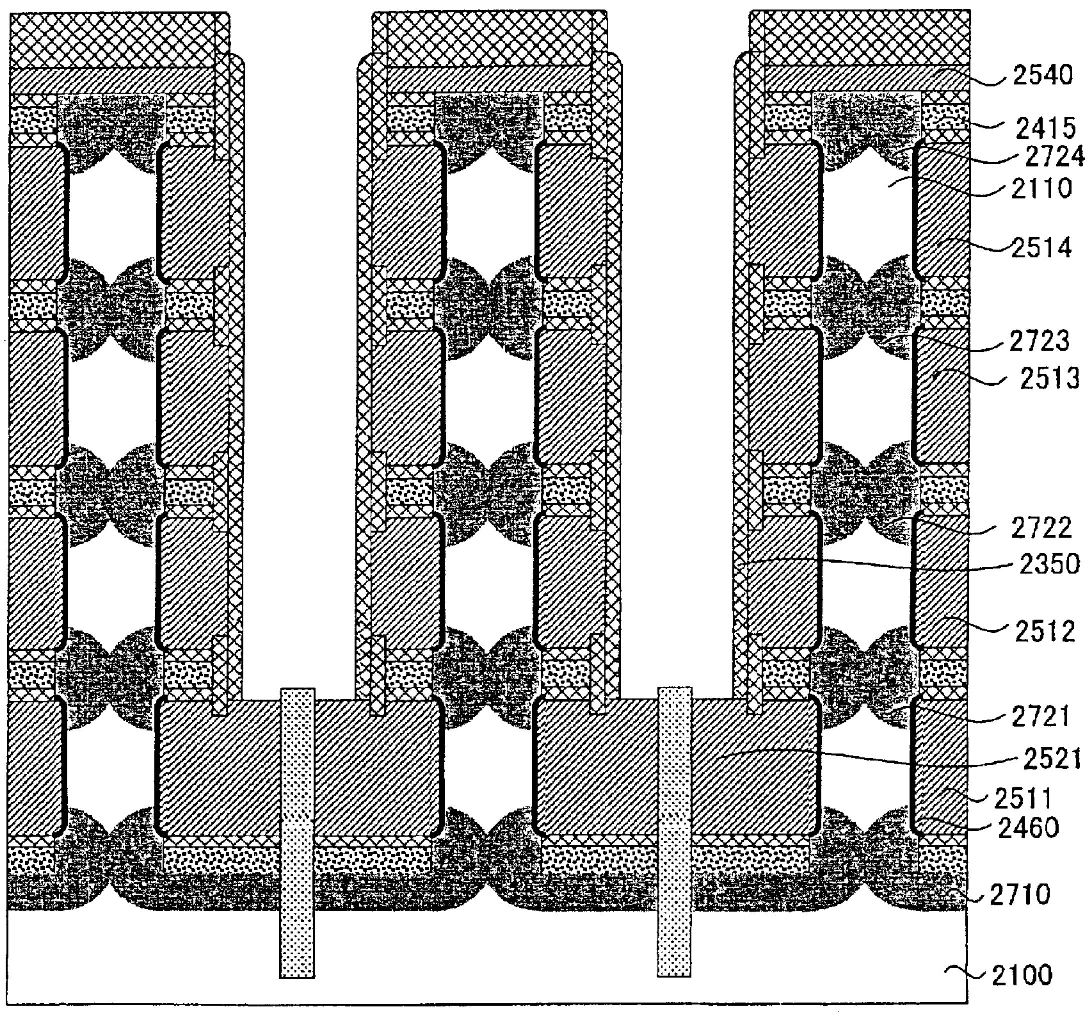
Figure 896:
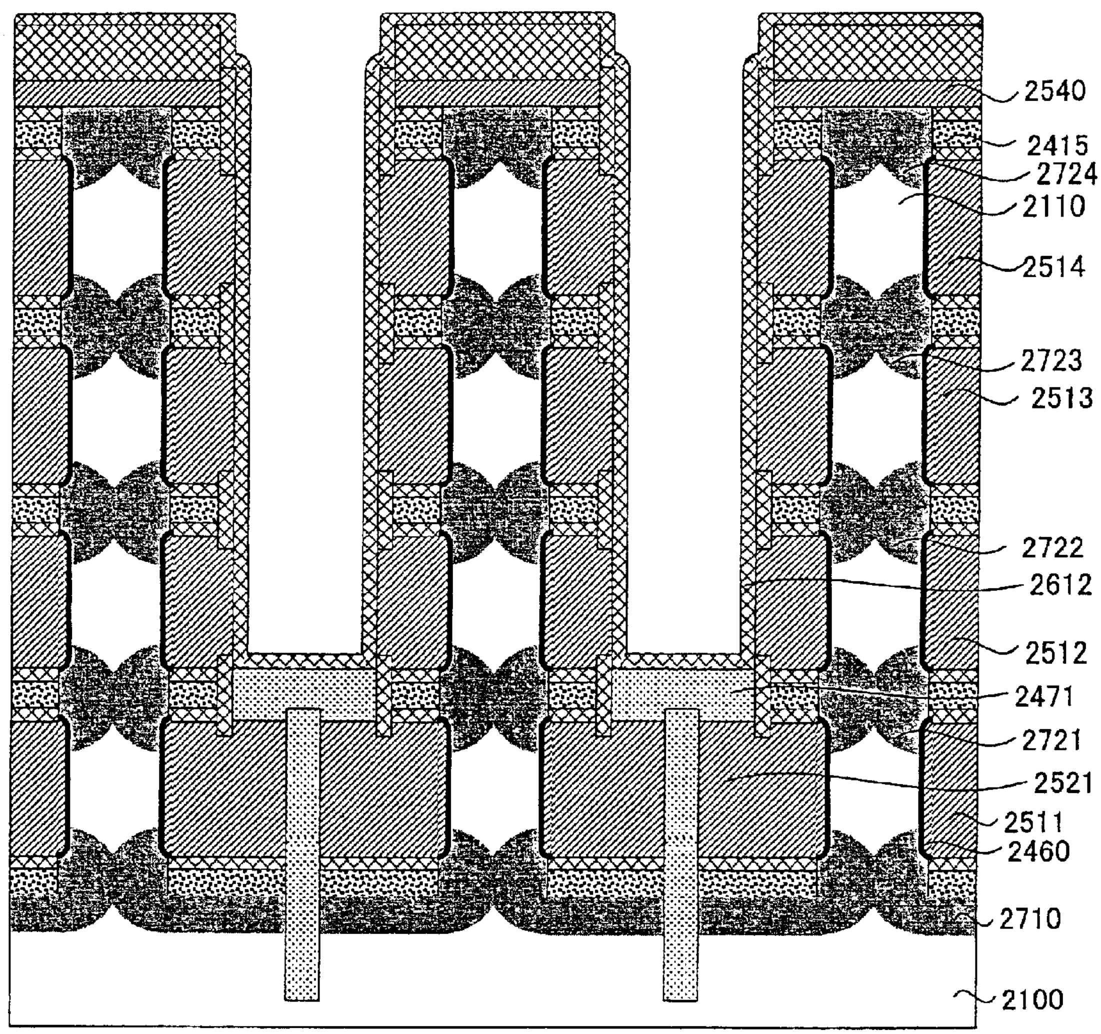
Figure 897:
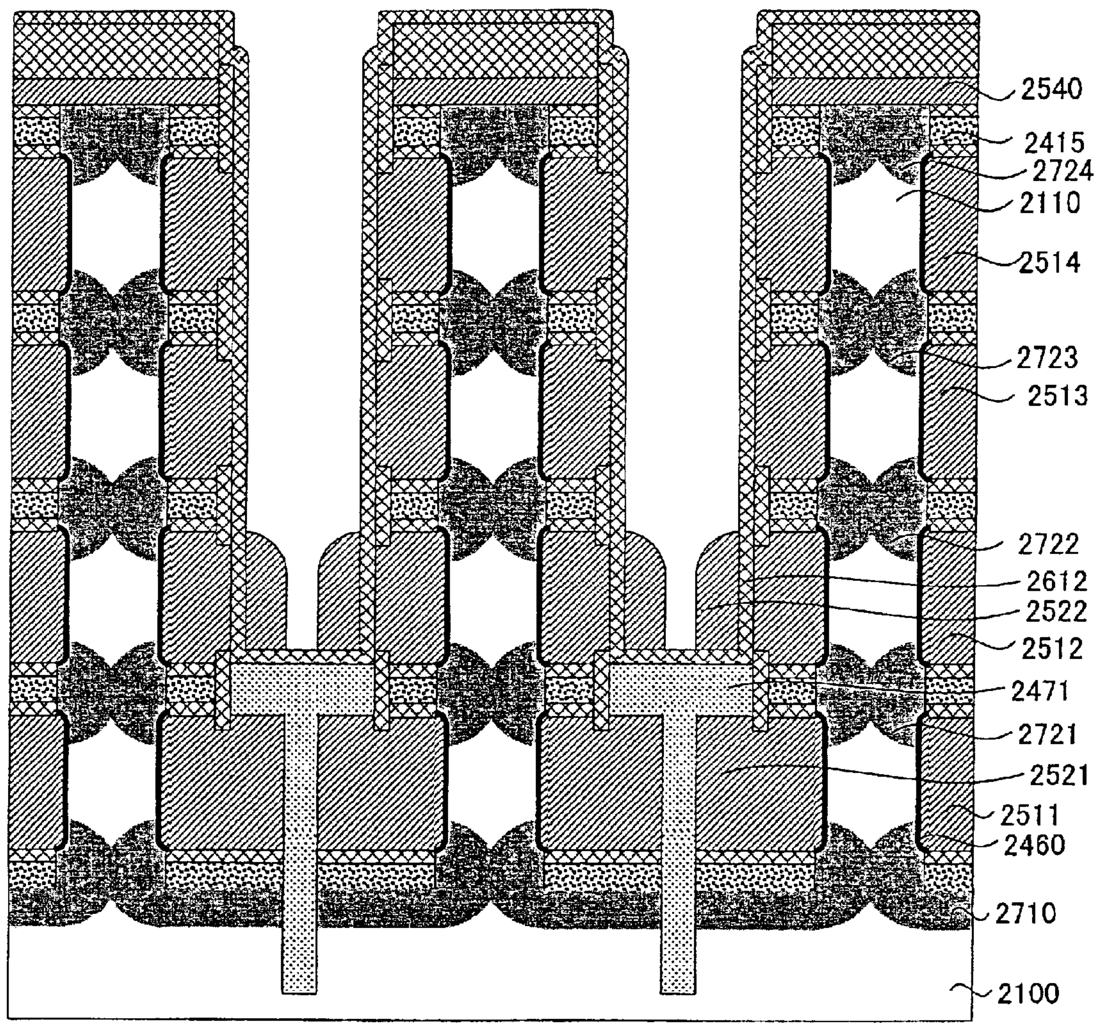
Figure 898:
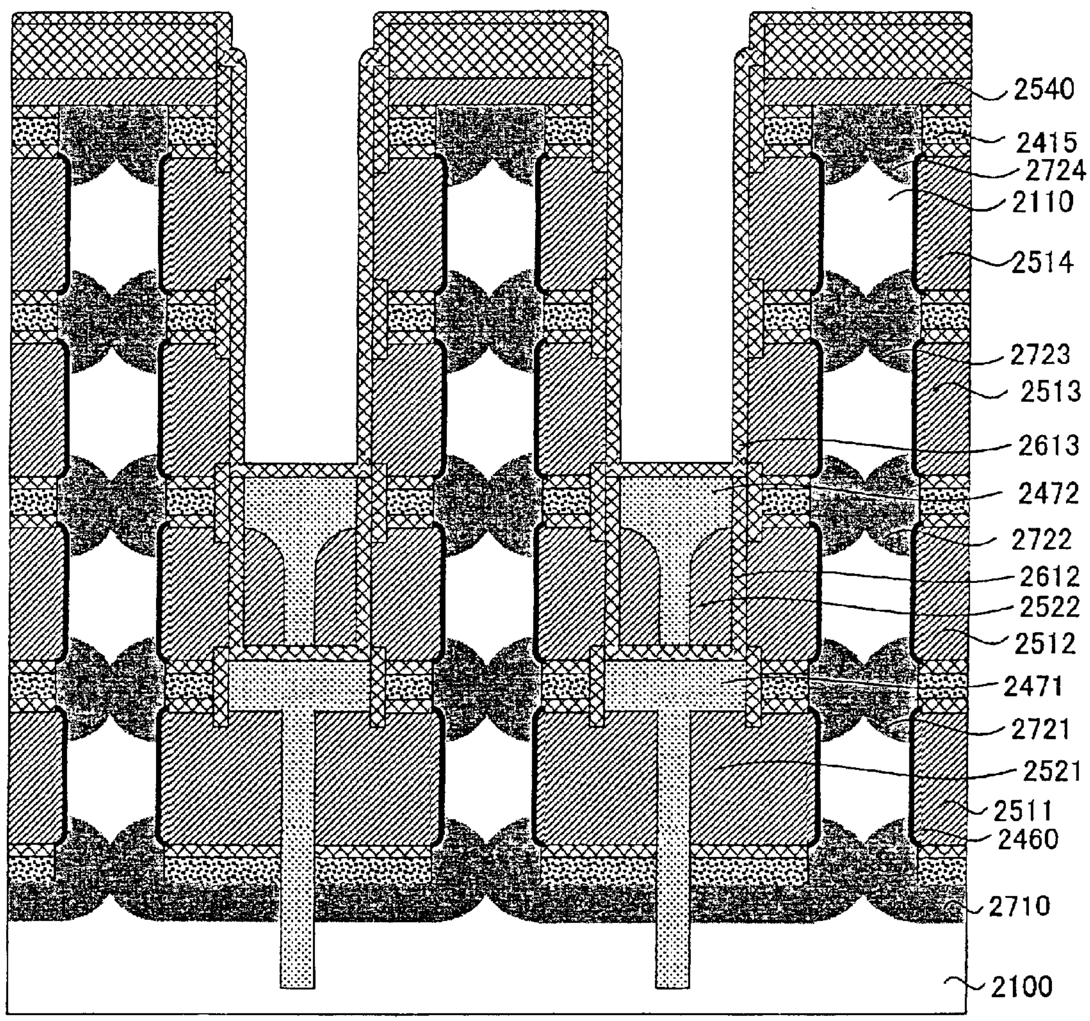
Figure 899:
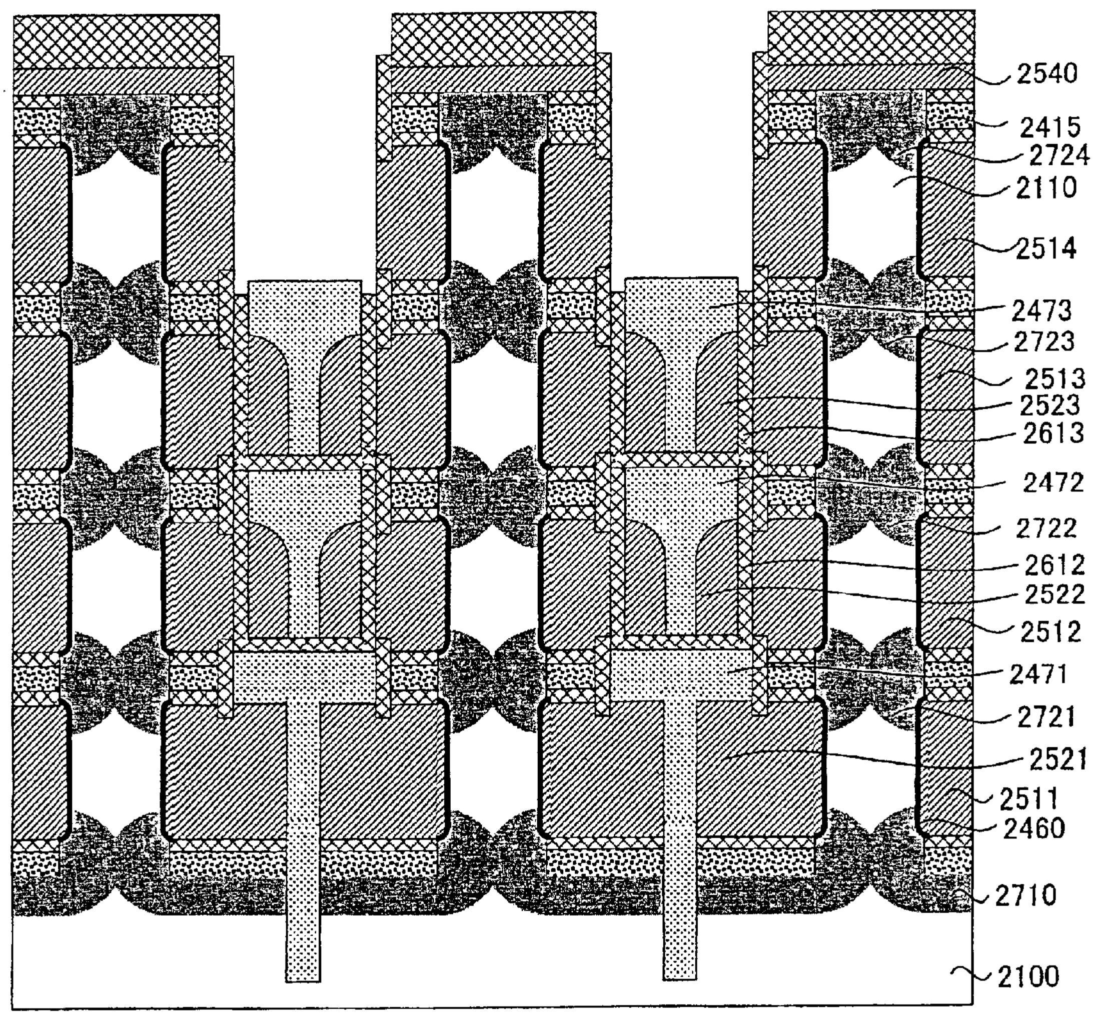
Figure 900:
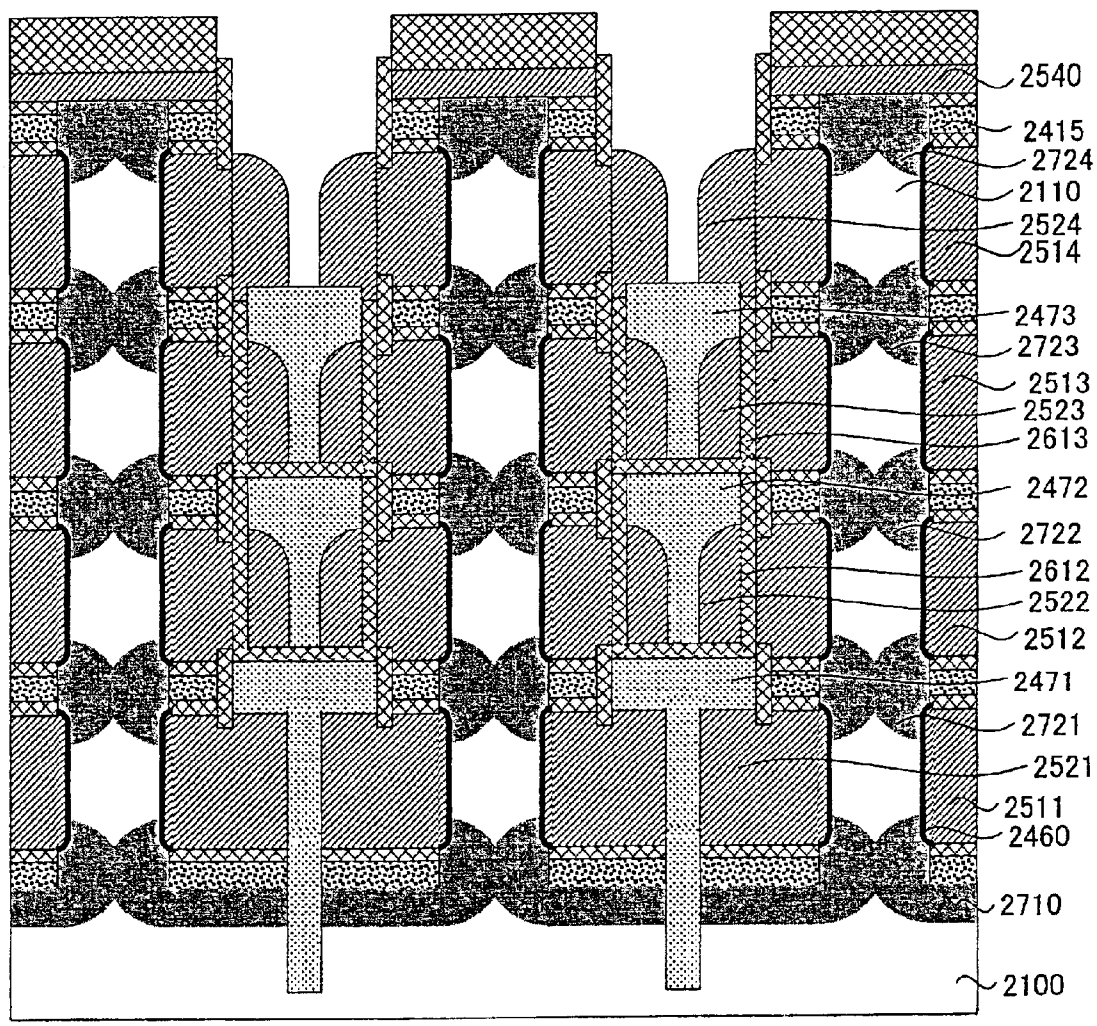
Figure 901:
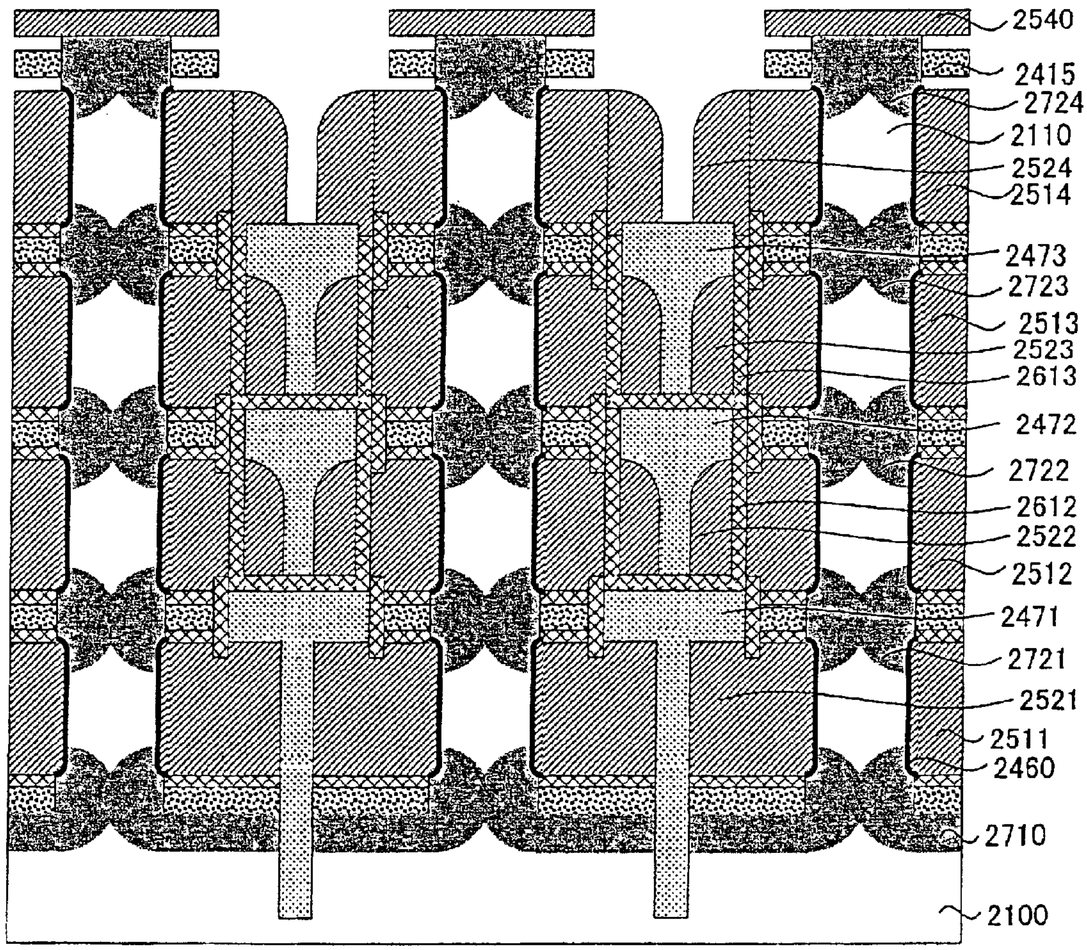
Figure 902:
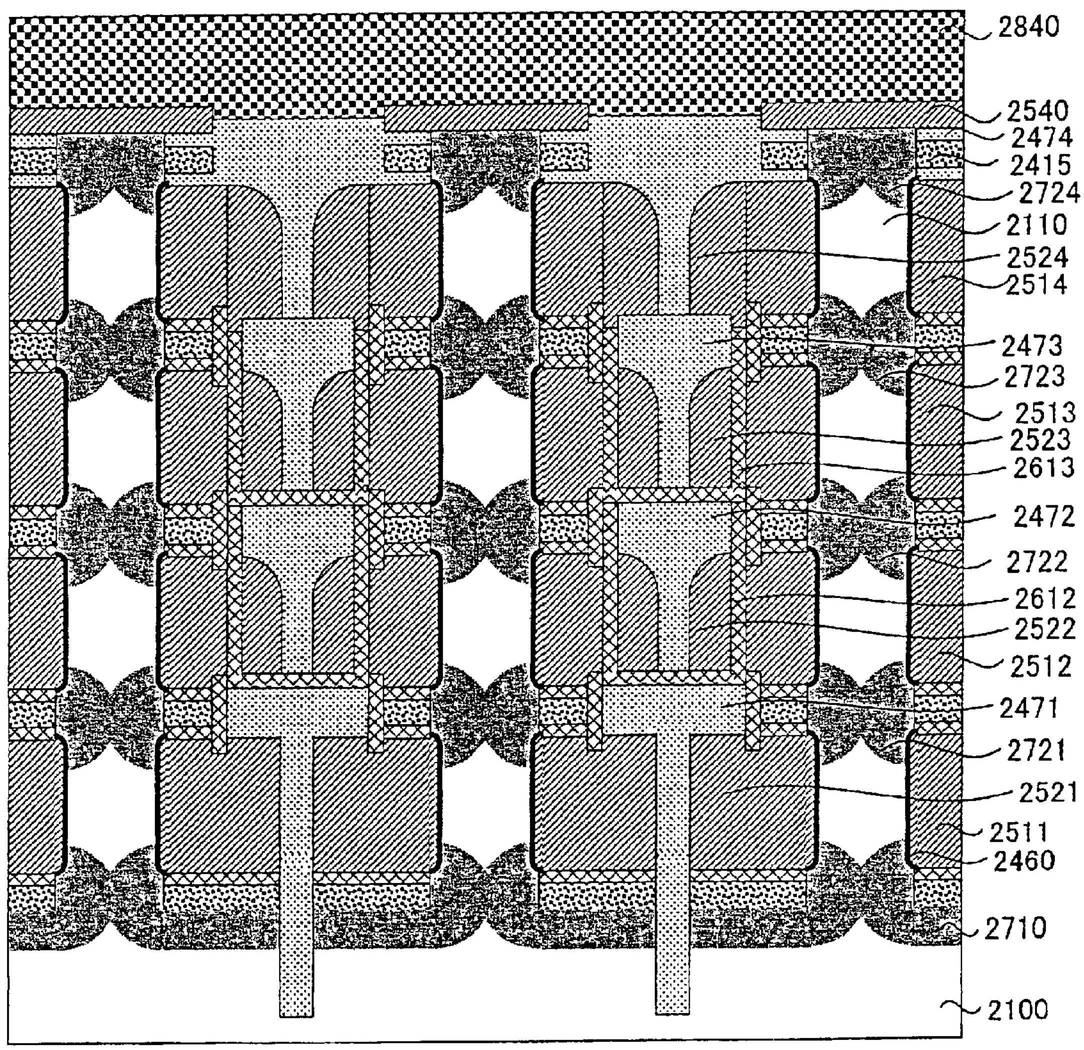

Subsequently, in the same manner as the above, a silicon nitride film 2345 is deposited as a sixth insulating film to a thickness of about 5 to 50 nm. Then, the silicon nitride film 2345 is arranged such that at least the silicon oxide film 2415 containing the impurities and the polysilicon film 2540 are isolated from other films than the island-like semiconductor layer 2110 by the silicon nitride film 2345, the silicon nitride film 2315 and the silicon nitride film 2330 (FIGS. 855 and 884).

The silicon nitride film 2345 may be arranged to cover only the exposed portion of the silicon oxide film 2415 containing the impurities. The exposed portion of the polysilicon film 2540 may not be covered completely. At this time, the exposed polysilicon film 2540 is oxidized through sacrificial oxidation and the formation of the tunnel oxide film and the oxidized portion is eroded through isotropic etching of the silicon oxide film. However, the eroded portion is filled through the deposition of the polysilicon film 2510 (the first conductive film), which allows to obtain the same effect as obtained by Production Example 11.

Then, the silicon oxide films 2442, 2443 and 2444 (the eighth insulating films), the silicon oxide films 2421, 2422, 2423 and 2424 (the third insulating films) and the silicon oxide films 2432, 2433 and 2434 (the seventh insulating films) are removed, for example, by isotropic etching to expose the side of the island-like semiconductor layer 2110. Production steps thereafter follow Production example 11 (FIGS. 856 to 873 and 885 to 902).

According to this example, the same effect as obtained by Production Example 11 can be obtained. Further, since a step of forming the sidewall spacer made of the silicon nitride film is omitted from the production steps of Production example 11, the structure of the semiconductor memory is simplified as compared with that of Production example 11. Therefore, the semiconductor memory of this example is advantageous in easy formation, i.e., improvement in device reliability.

PRODUCTION EXAMPLE 41

In a semiconductor memory to be produced in this example, regions for forming charge storage layers are defined in advance by a laminated film comprising plural films, and then island-like semiconductor layers in a pillar form are formed by selective epitaxial silicon growth in trenches opened by using a photoresist mask. Laminated insulating films as charge storage layers are formed on the sides of the island-like semiconductor layers in the regions for forming the charge storage layers. The island-like semiconductor layers are each in an electrically floating state with respect to the semiconductor substrate. The active regions of the memory cells are electrically common. In this production example, selection gate transistors are disposed at the top and the bottom of the island-like semiconductor layer. A plurality of memory transistors, for example, two memory transistors, are placed between the selection gate transistors. The laminated insulating films of the transistors are formed at the same time. The transistors are connected in series along the island-like semiconductor layer. Further, the thickness of gate insulating films of the selection gate transistors is equal to the thickness of gate insulating films of the memory transistors.

Such a semiconductor memory may be produced by the following production process. FIGS. 903 to 907 and FIGS. 908 to 912 are sectional views taken on line A-A' and line B-B', respectively, in FIG. 12 which is a plan view illustrating an EEPROM memory cell array.

Figure 903:
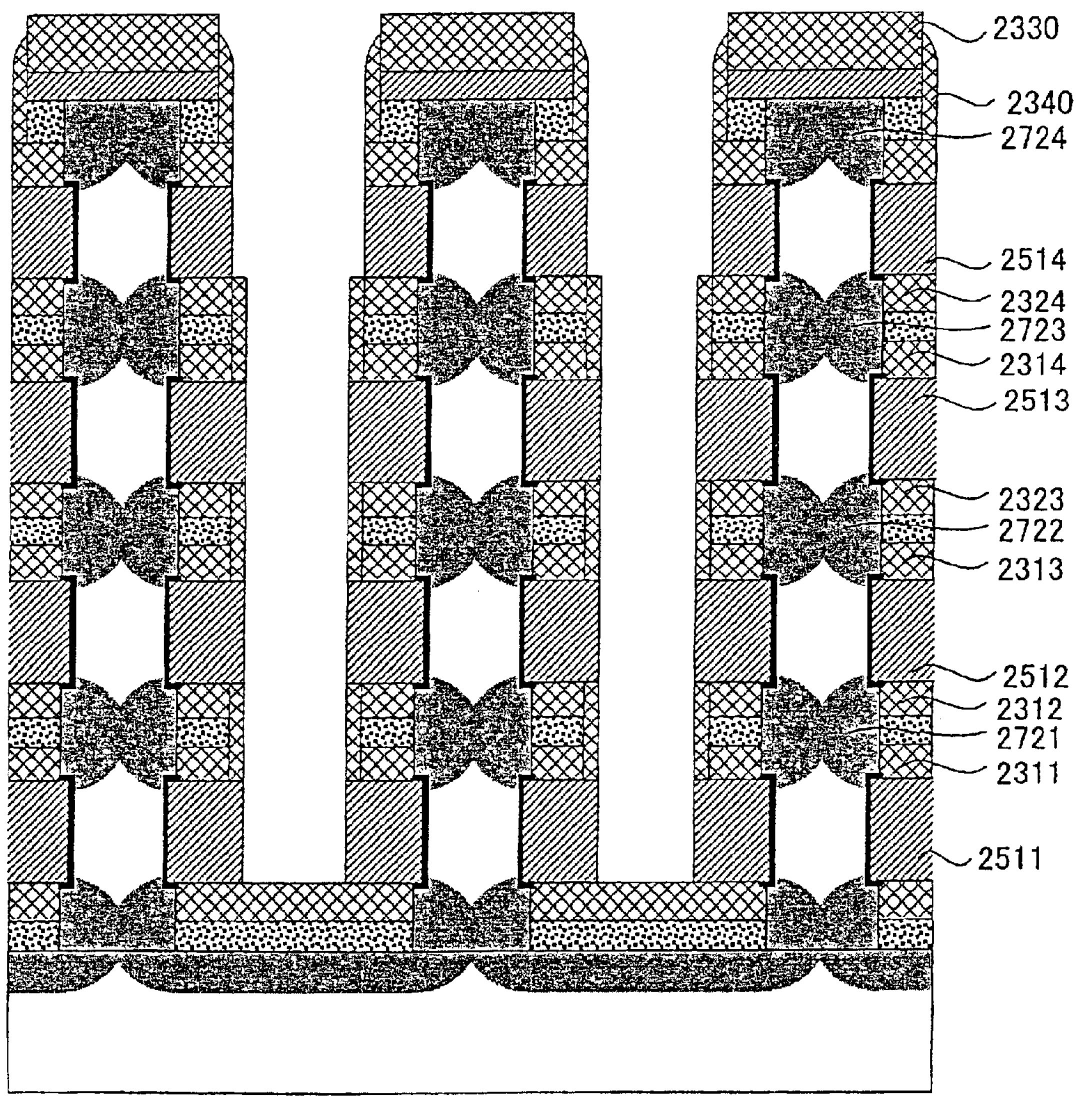
Figure 908:
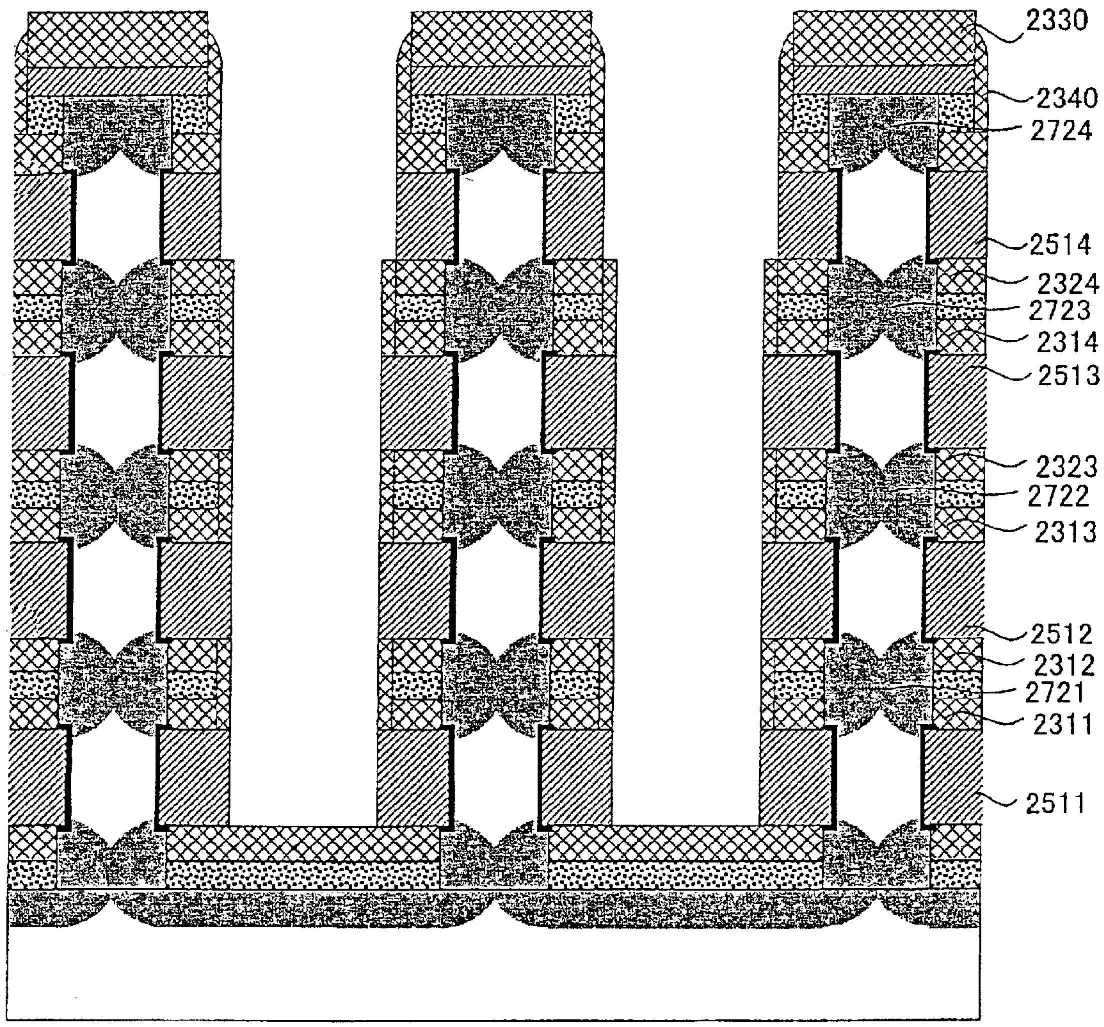

Production steps are the same as those of Production example 11 (FIGS. 304 to 322 and FIGS. 337 to 355) until the polysilicon films 2511 to 2514 are formed as the first conductive films (FIGS. 903 and 908). At this time, the silicon nitride films 2313, 2314 (second insulating films), 2322 and 2323 (fourth insulating films) are formed to have such a thickness that they do not completely cover the impurity diffusion layers 2721, 2722, 2723 and 2724 which are N-type semiconductor layers located adjacent to the silicon nitride films, respectively.

Figure 904:
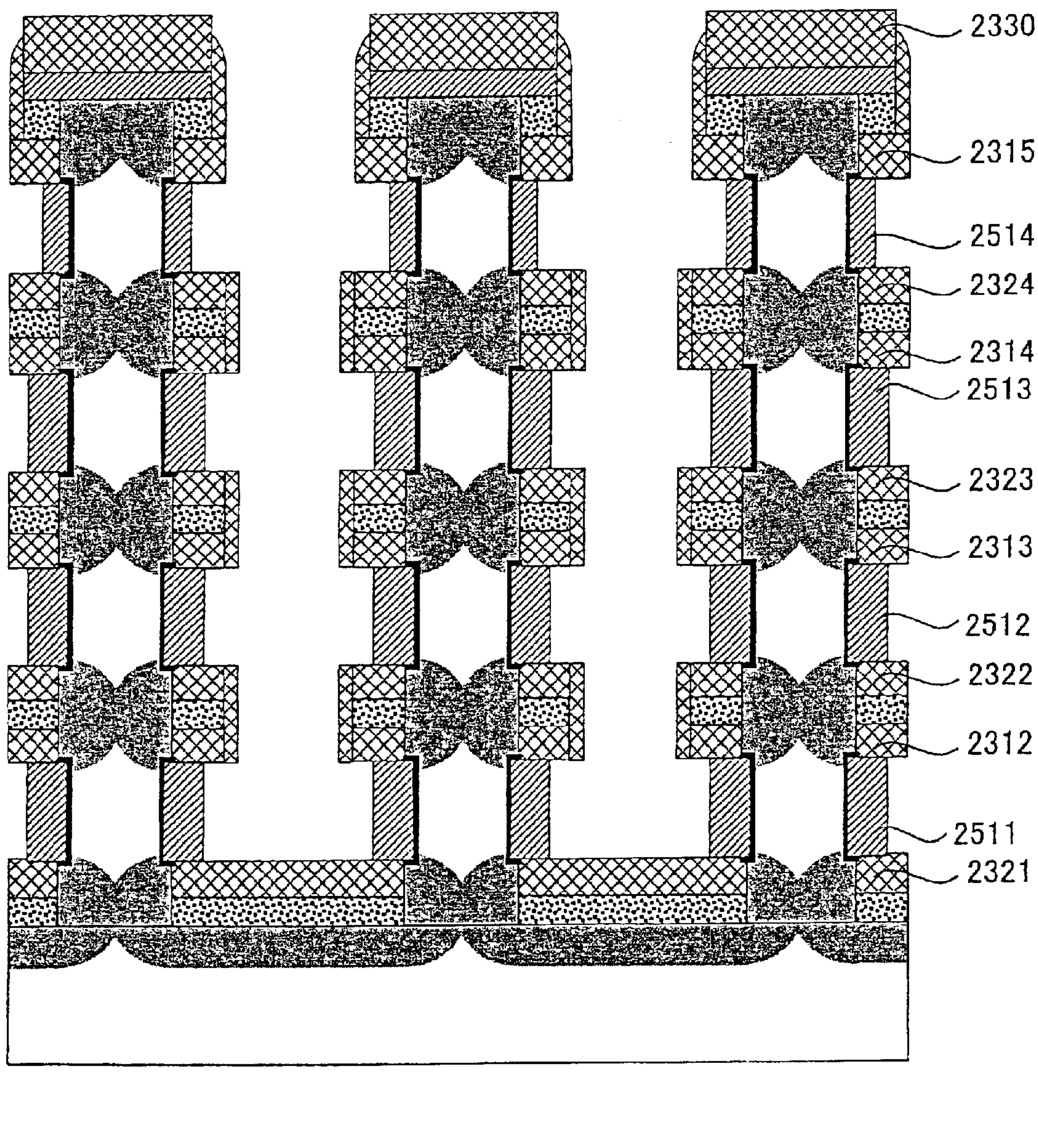
Figure 909:
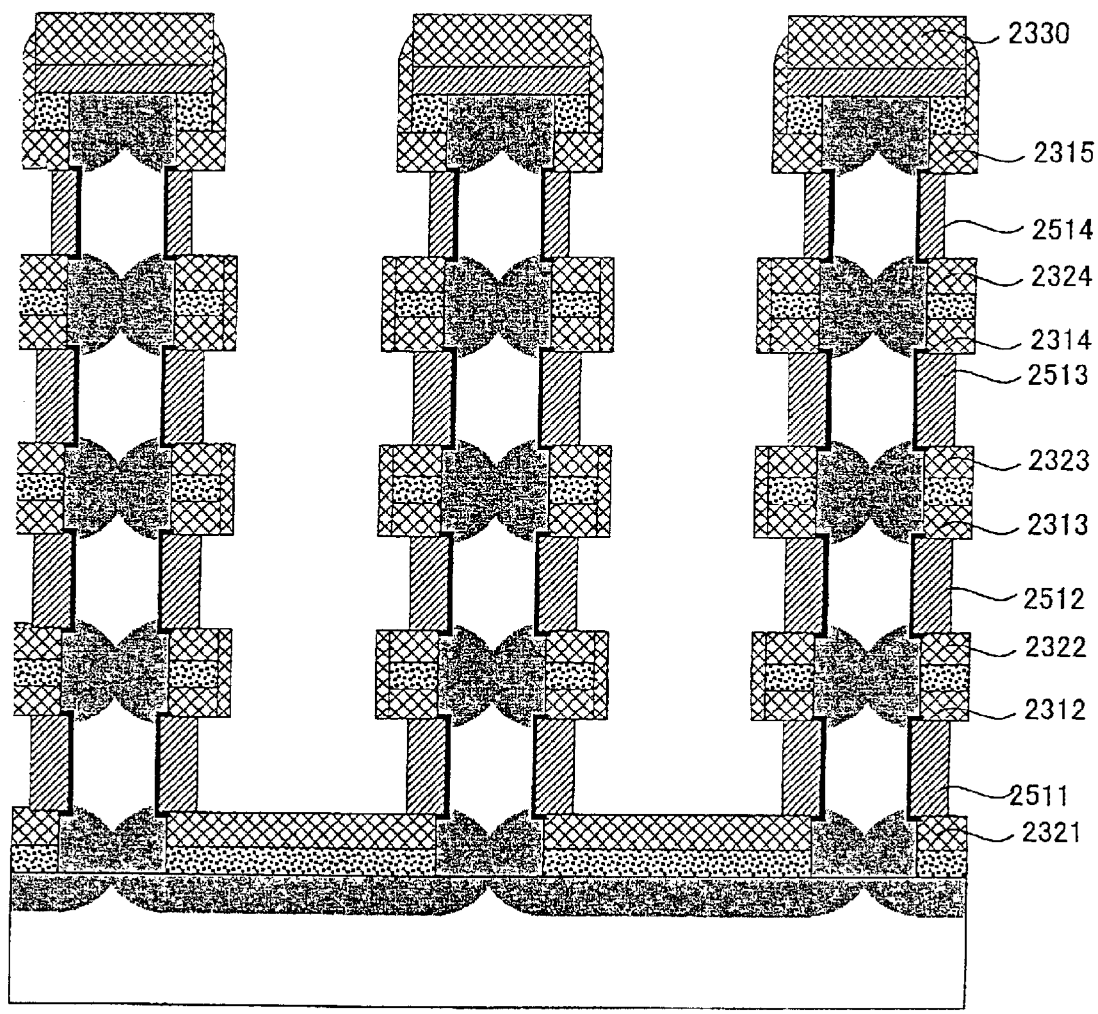

Then, the polysilicon films 2511 to 2514 are isotropically etched back (FIGS. 904 and 909).

Figure 905:
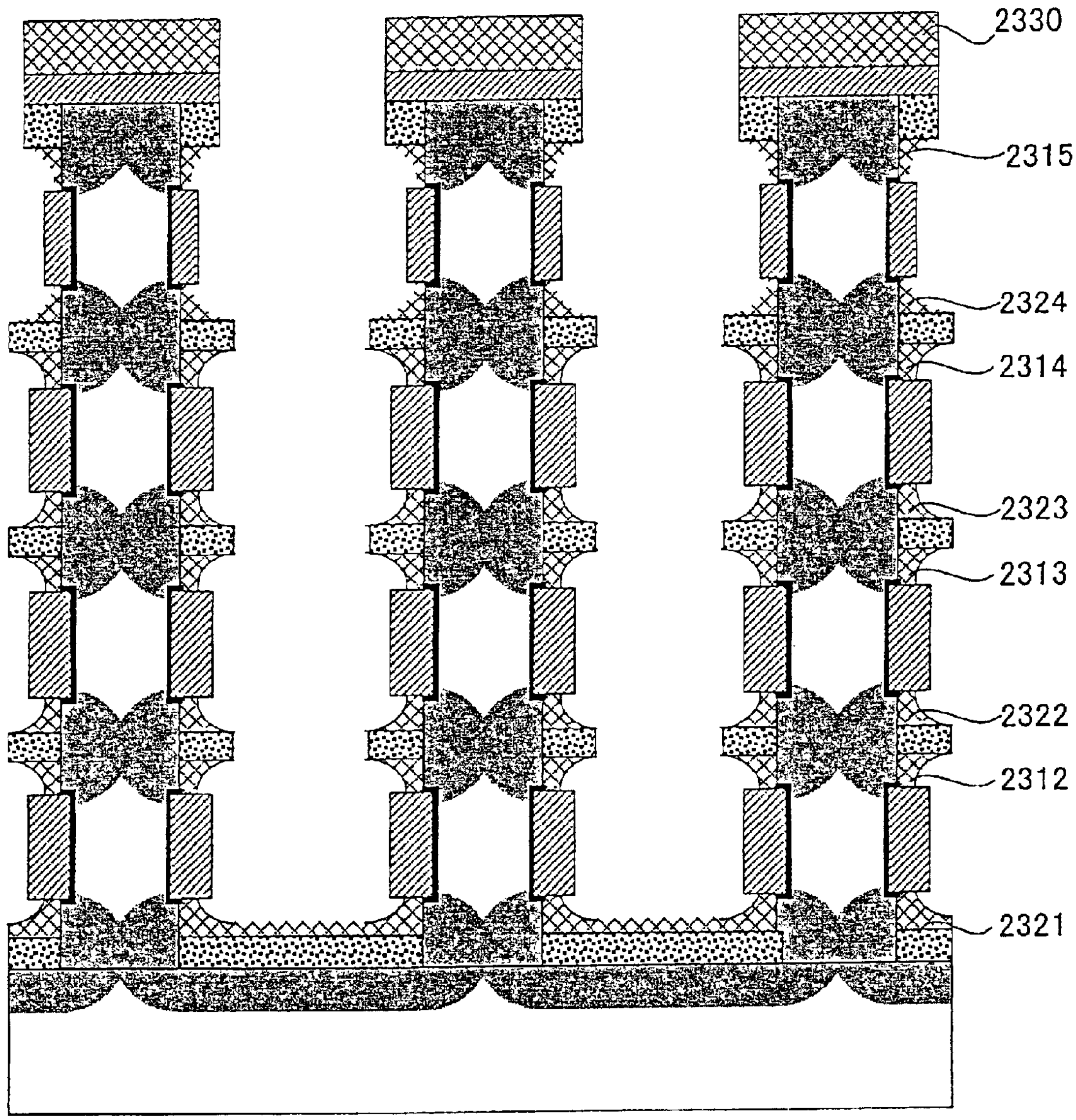
Figure 910:
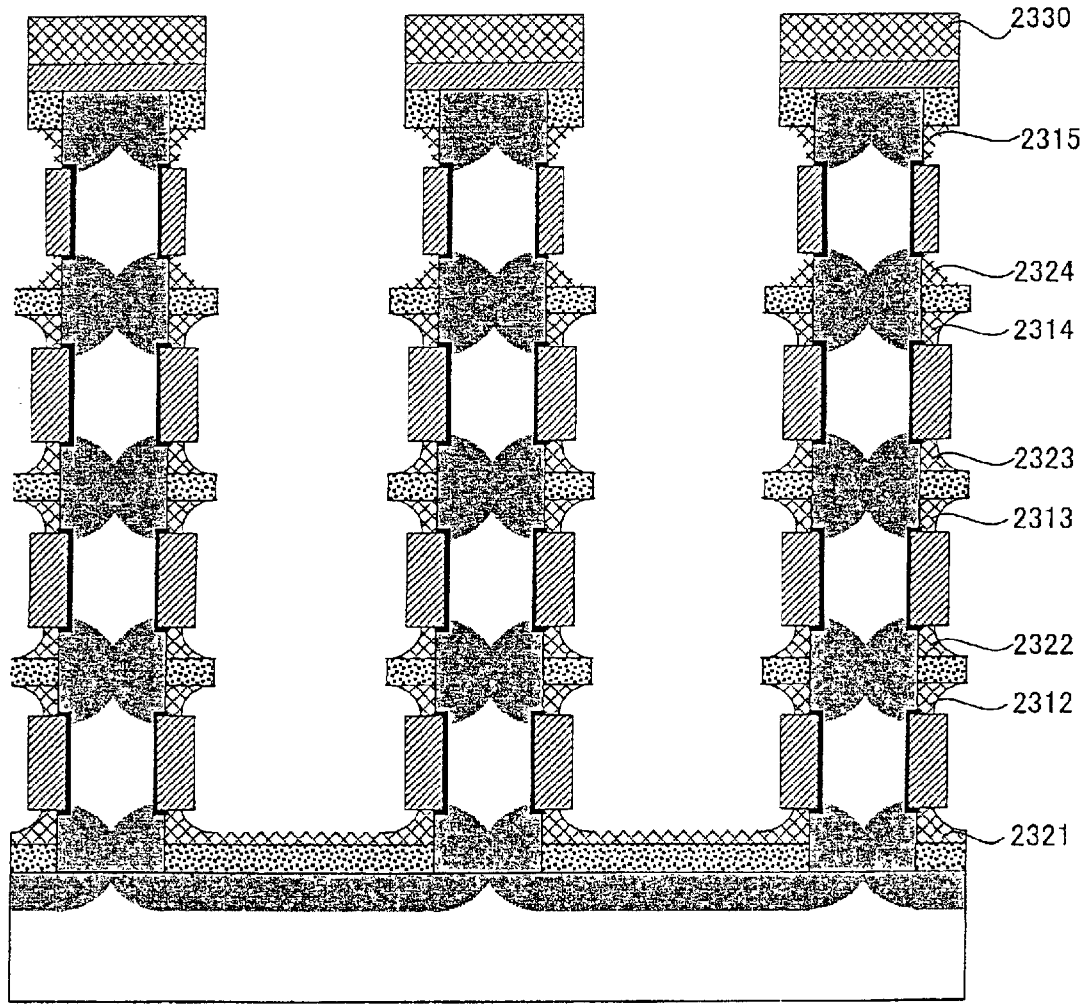

The silicon nitride films 2312 to 2315 (the second insulating films), the silicon nitride films 2321 to 2324 (the fourth insulating films) and the silicon nitride film 2330 (the fifth insulating film) are isotropically etched to such a degree that the island-like semiconductor layer is not exposed (FIGS. 905 and 910).

Figure 906:
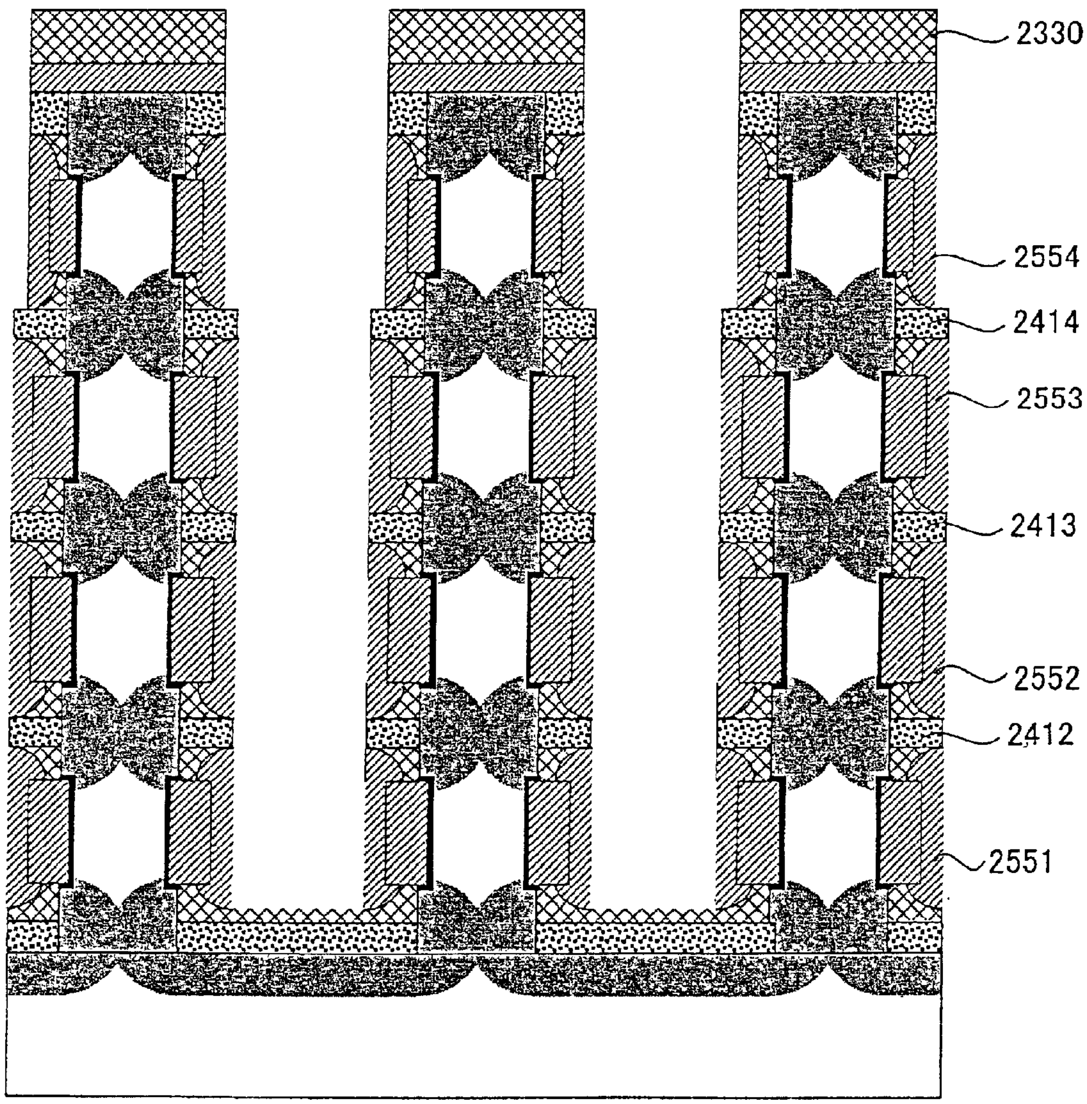
Figure 911:
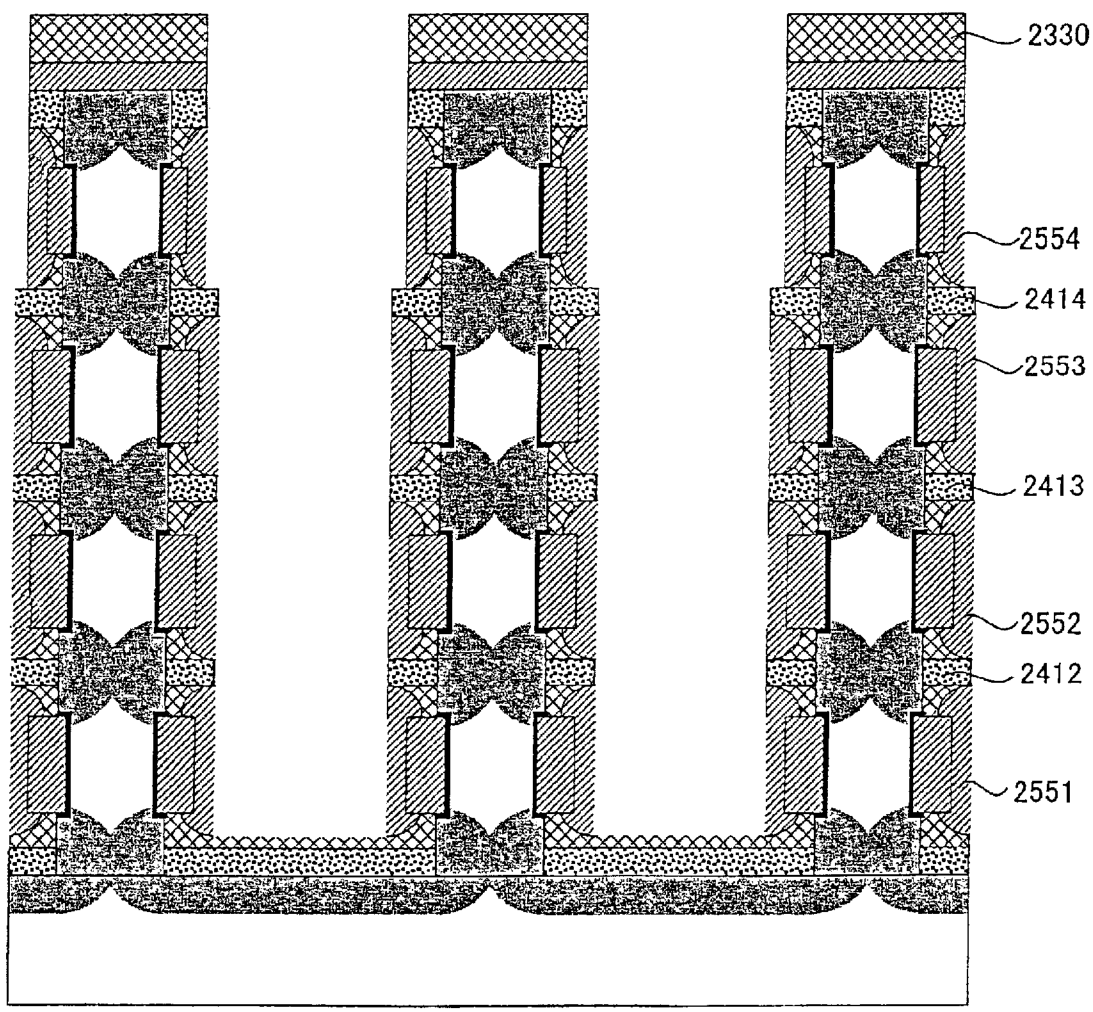

Subsequently, a polysilicon film 2550, for example, is deposited as a fifth conductive film to a thickness of about 50 to 200 nm. Using the silicon nitride film (the fifth insulating film) 2330 and the silicon oxide films (the first conductive films) 2412 to 2414 containing impurities as a mask, the polysilicon film 2550 is divided into polysilicon films 2551, 2552, 2553 and 2554 (the fifth conductive films), for example, by anisotropic etching (FIGS. 906 and 911).

Figure 907:
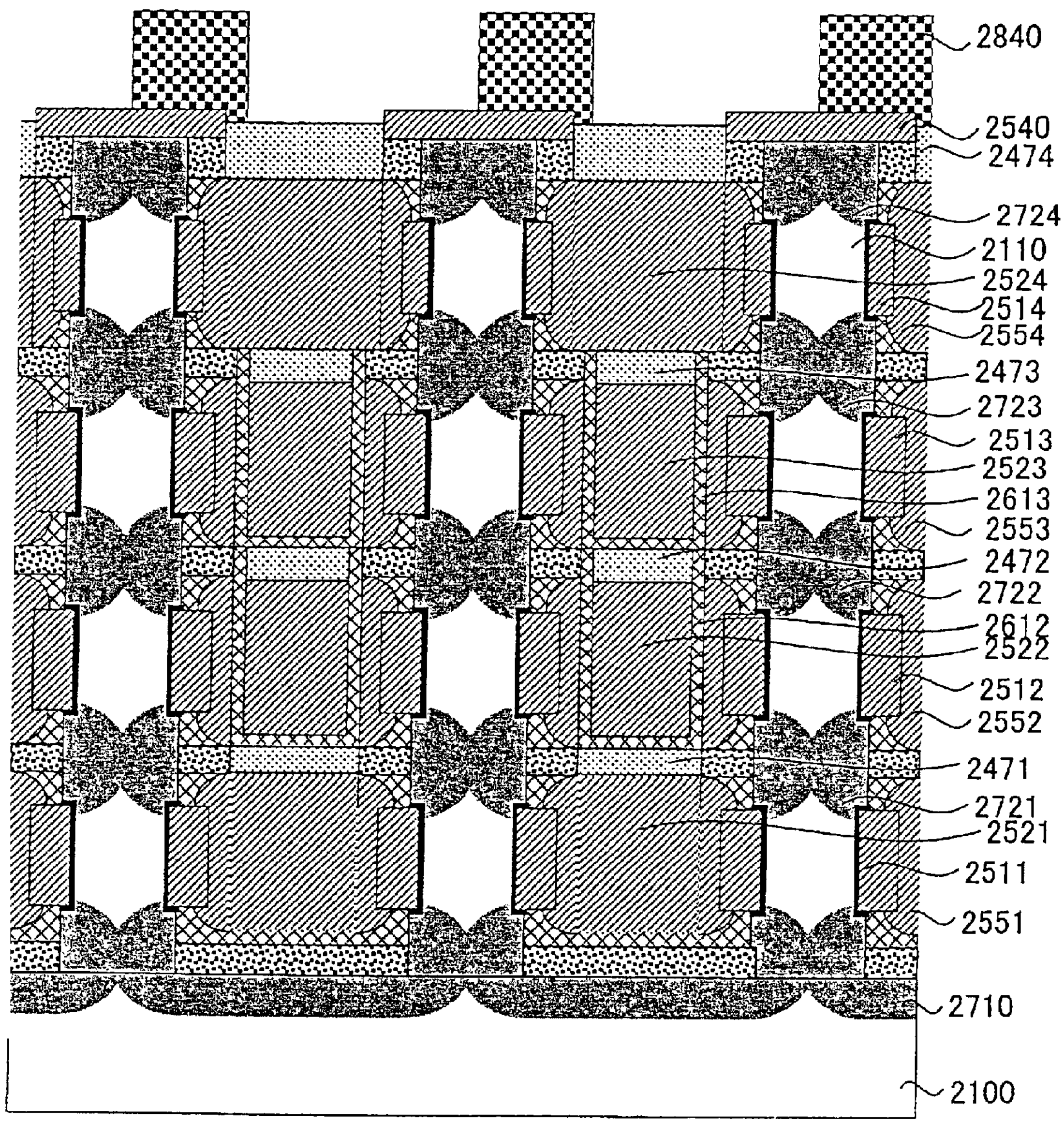
Figure 912:
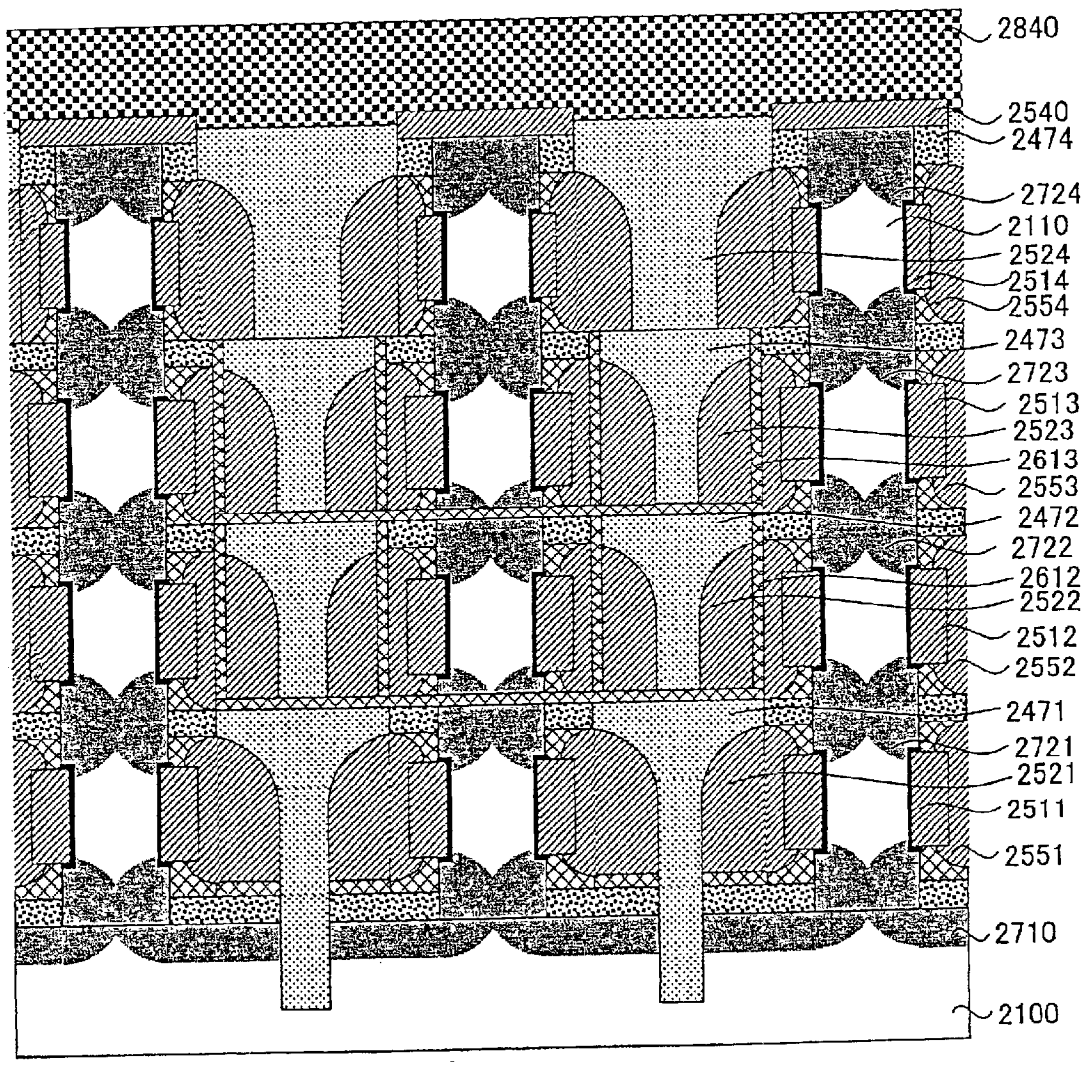

Then, a silicon oxide film 2470 is deposited as an eleventh insulating film. Production steps thereafter follow Production example 11 (FIGS. 323 to 335 and FIGS. 356 to 368). Thereby, a semiconductor memory is realized which has a memory function according to the state of a charge in the charge storage layer which is the floating gate made of the polysilicon film (the first conductive film) (FIGS. 907 and 912).

In this example, the silicon nitride films 2312 and 2315 (the second insulating films) and the silicon nitride films 2321 and 2324 (the fourth insulating films) have a thickness almost equal to that of the silicon nitride films 2313 and 2314 (the second conductive films) and the silicon nitride films 2322 and 2323 (the fourth insulating films). However, they may have a thickness smaller than that of the silicon nitride films 2313, 2314, 2322 and 2323.

Films formed on the surface of the semiconductor substrate or the polysilicon film such as the silicon nitride film (the fifth insulating film) 2330, the silicon nitride film (the sixth insulating film) 2340 and the silicon nitride film (the twelfth insulating film) 2350 may be formed of a layered film of a silicon oxide film/a silicon nitride film from the silicon surface.

With regard to the polysilicon films 2510 or 2512 to 2514 (the first conductive films), the polysilicon films 2520 or 2521 to 2524 (the second conductive films) and the polysilicon film 2540 (the fourth conductive film), impurity introduction may be carried out during or after the formation of the polysilicon films or after the separation of the polysilicon films. The timing of the impurity introduction to the polysilicon films is not particularly limited so long as these films become conductive films.

In this example, the control gates of the memory cells are formed continuously in one direction without using a mask. That is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

Further, by providing the selection gates in the top and the bottom of a set of memory cells, it is possible to prevent the phenomenon that a memory cell transistor is over-erased.

PRODUCTION EXAMPLE 42

In an example of production process for producing a semiconductor memory in which in which the selection gates and the floating gates of the transistors are formed at the same time, explanation is given of an example of production process in which terminals are formed which electrically connect the first, the second and the third wiring layers to a peripheral circuit, respectively.

Figure 913:
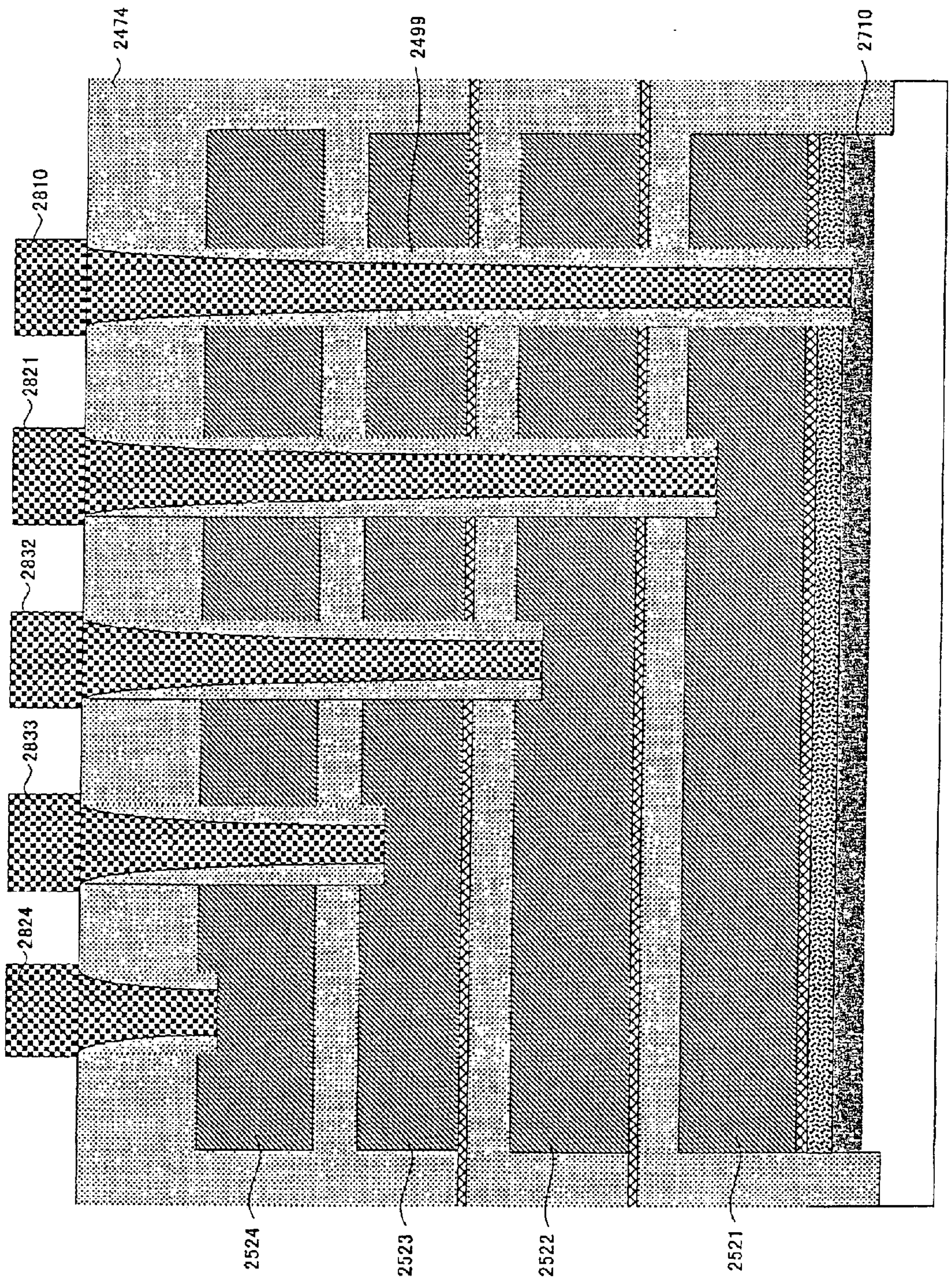
Figure 914:
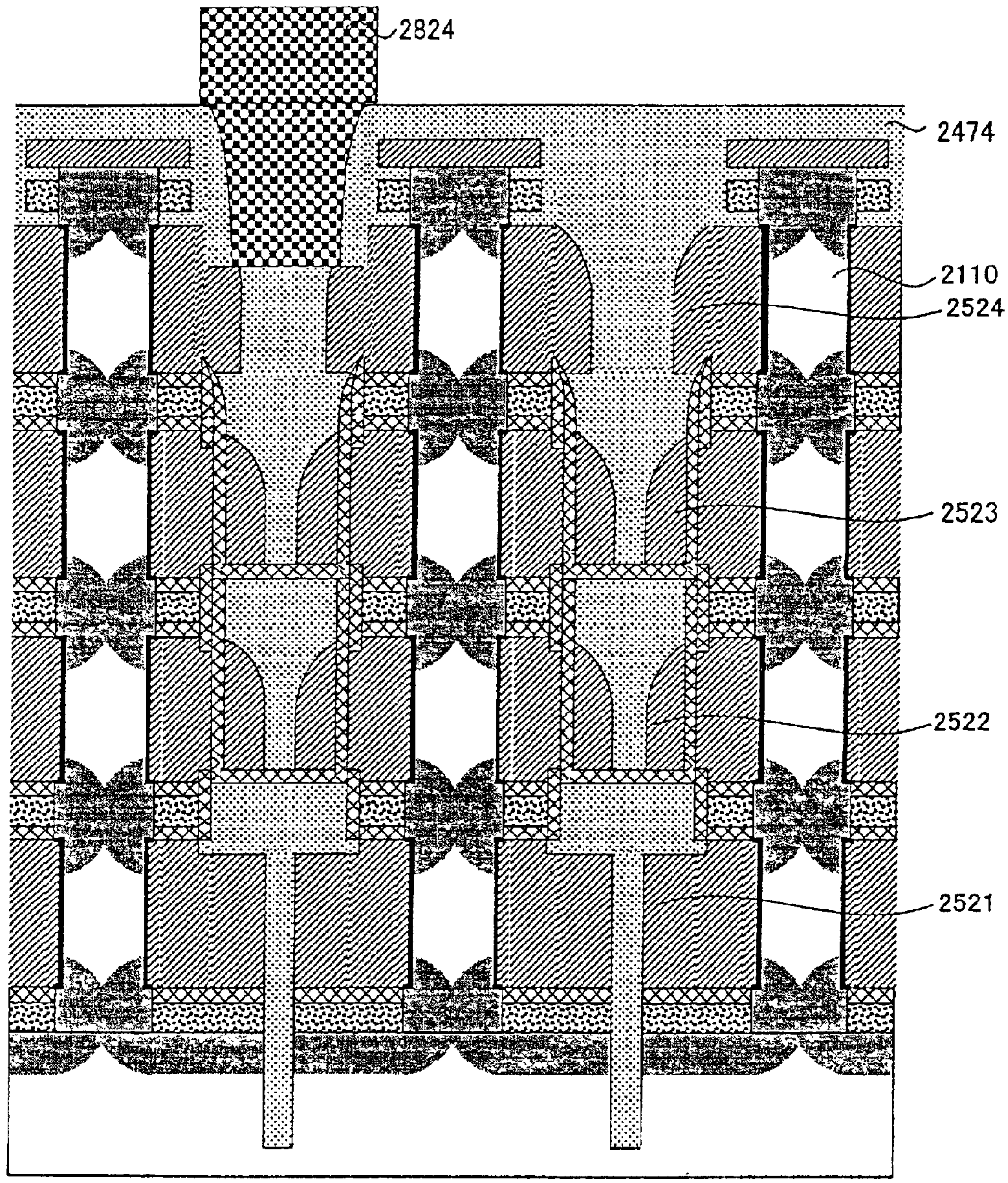
Figure 915:
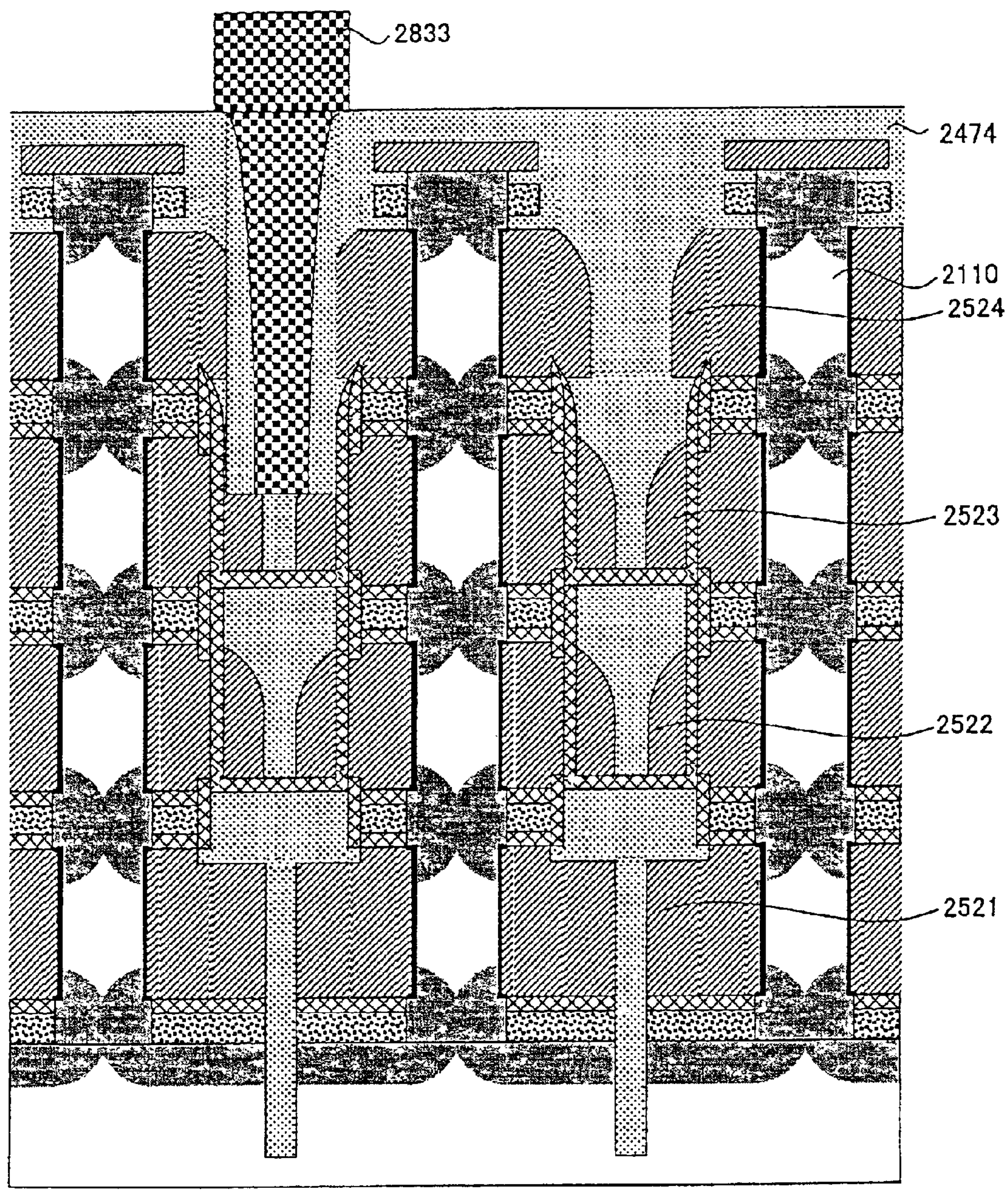
Figure 916:
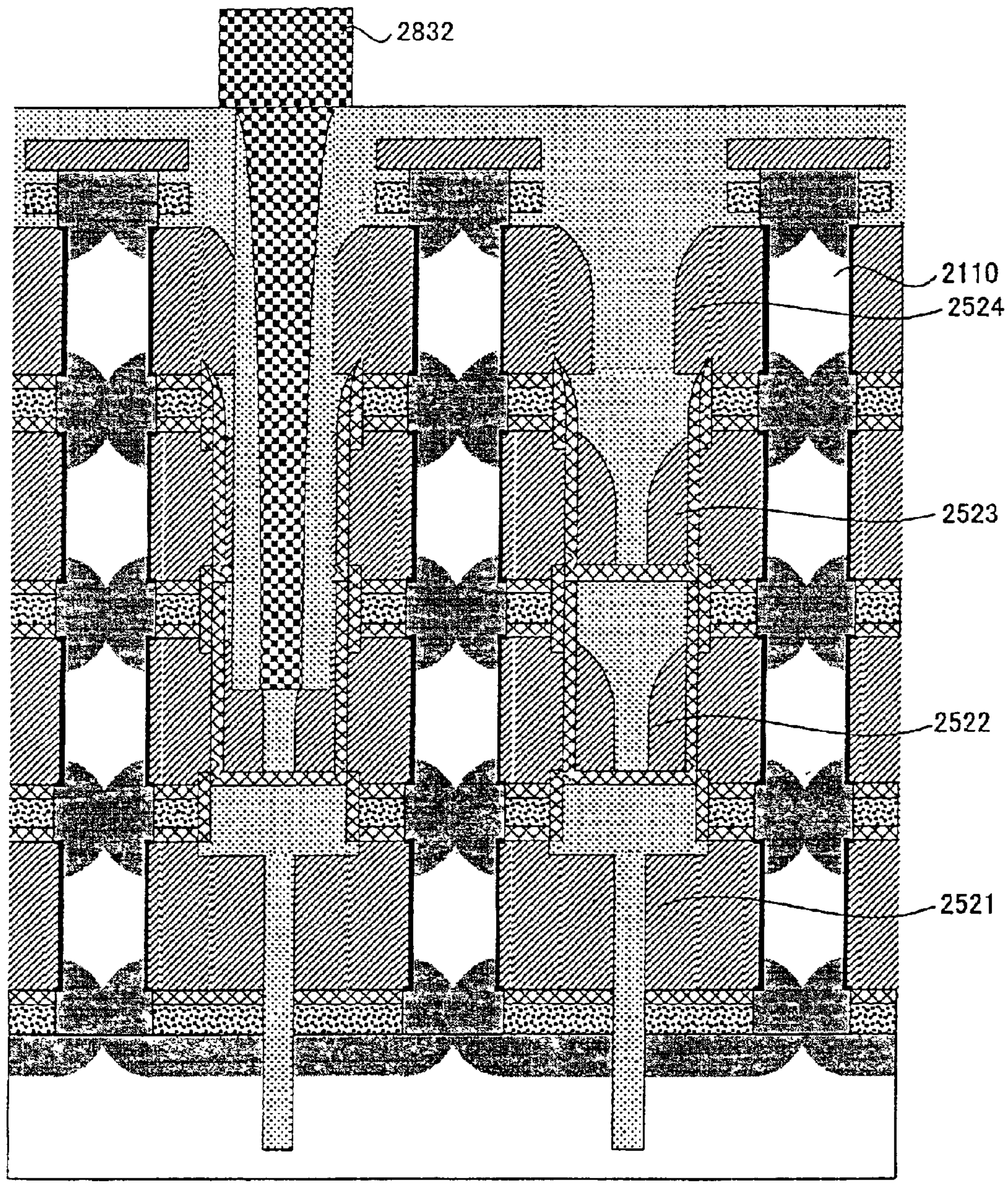
Figure 917:
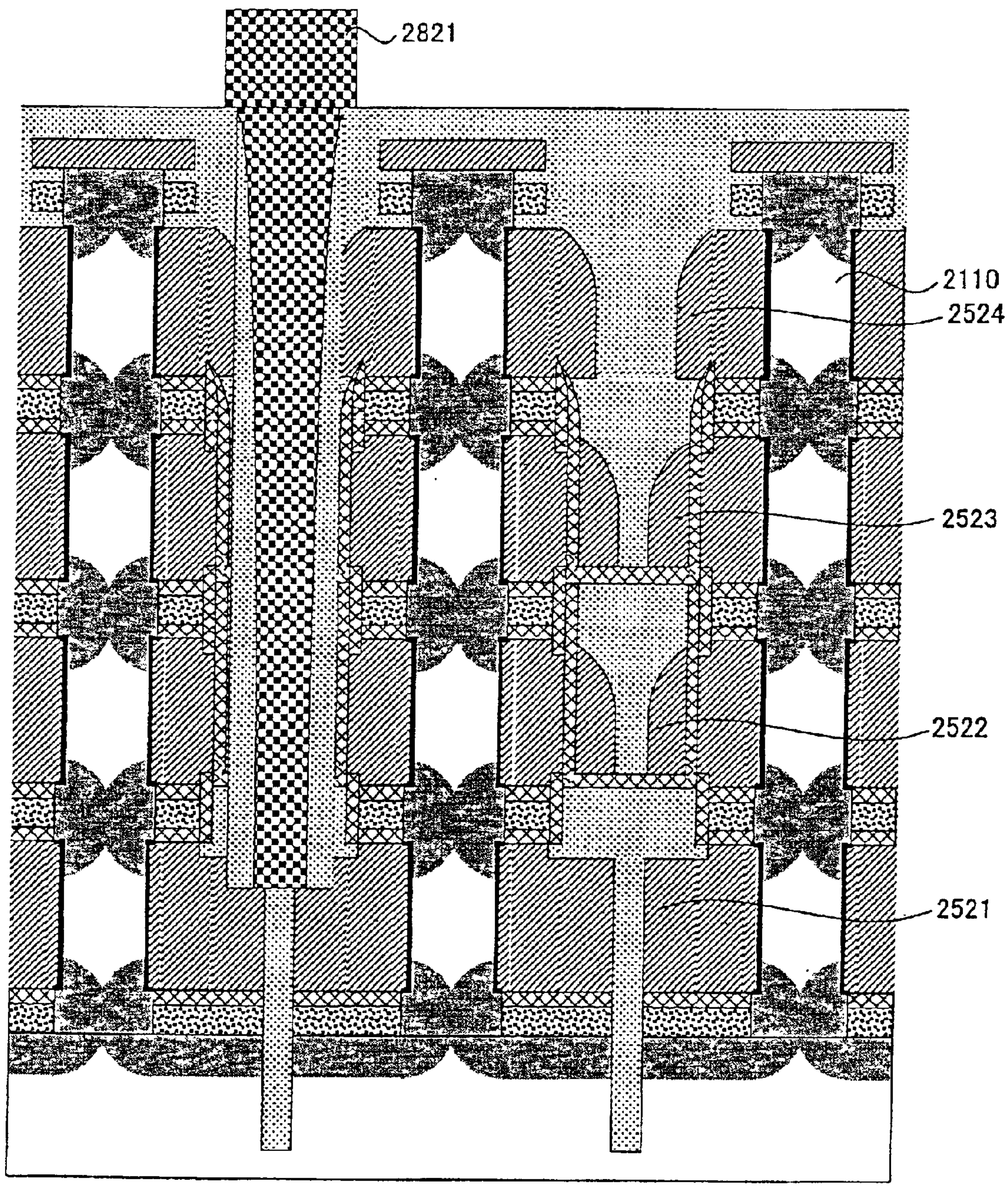
Figure 918:
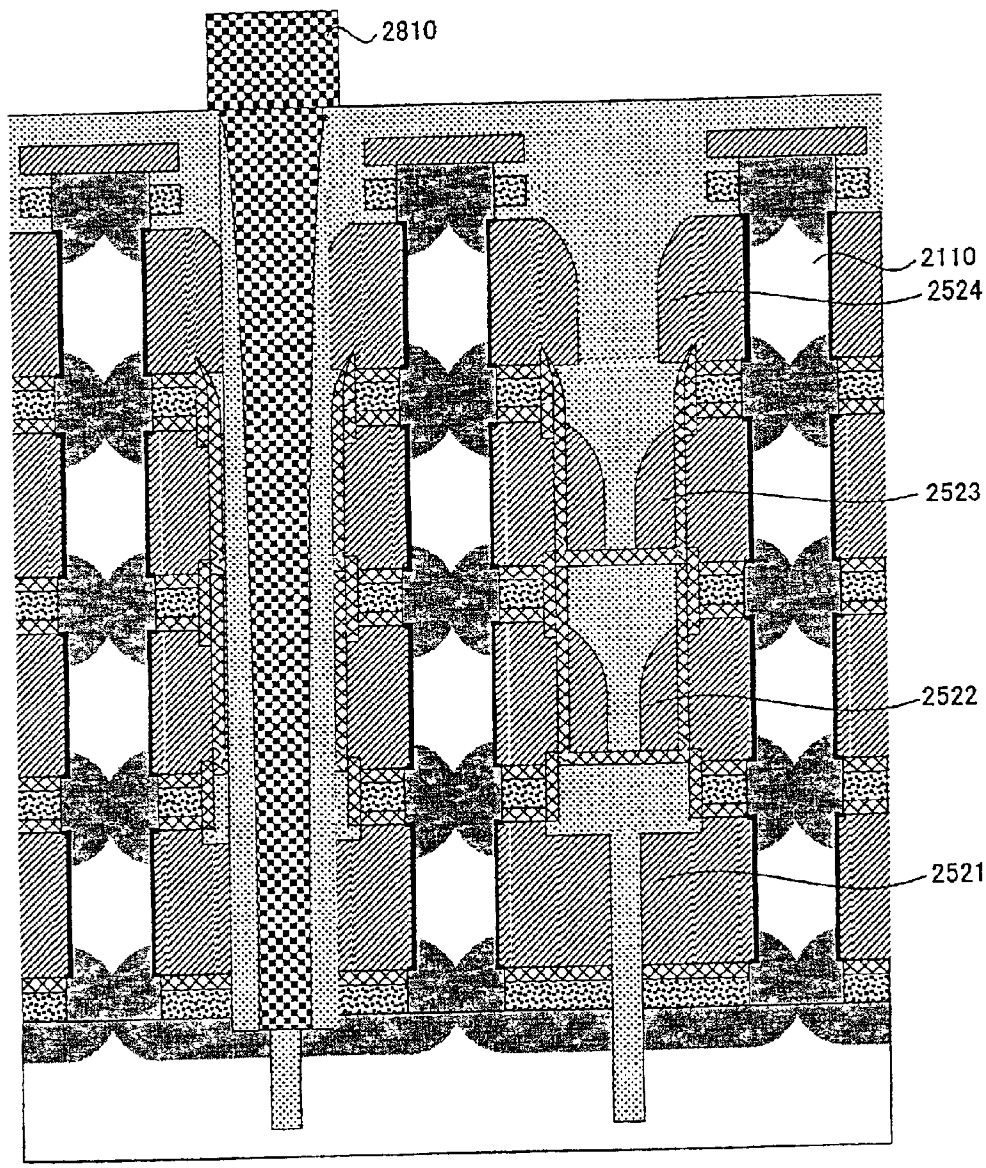
Figure 919:
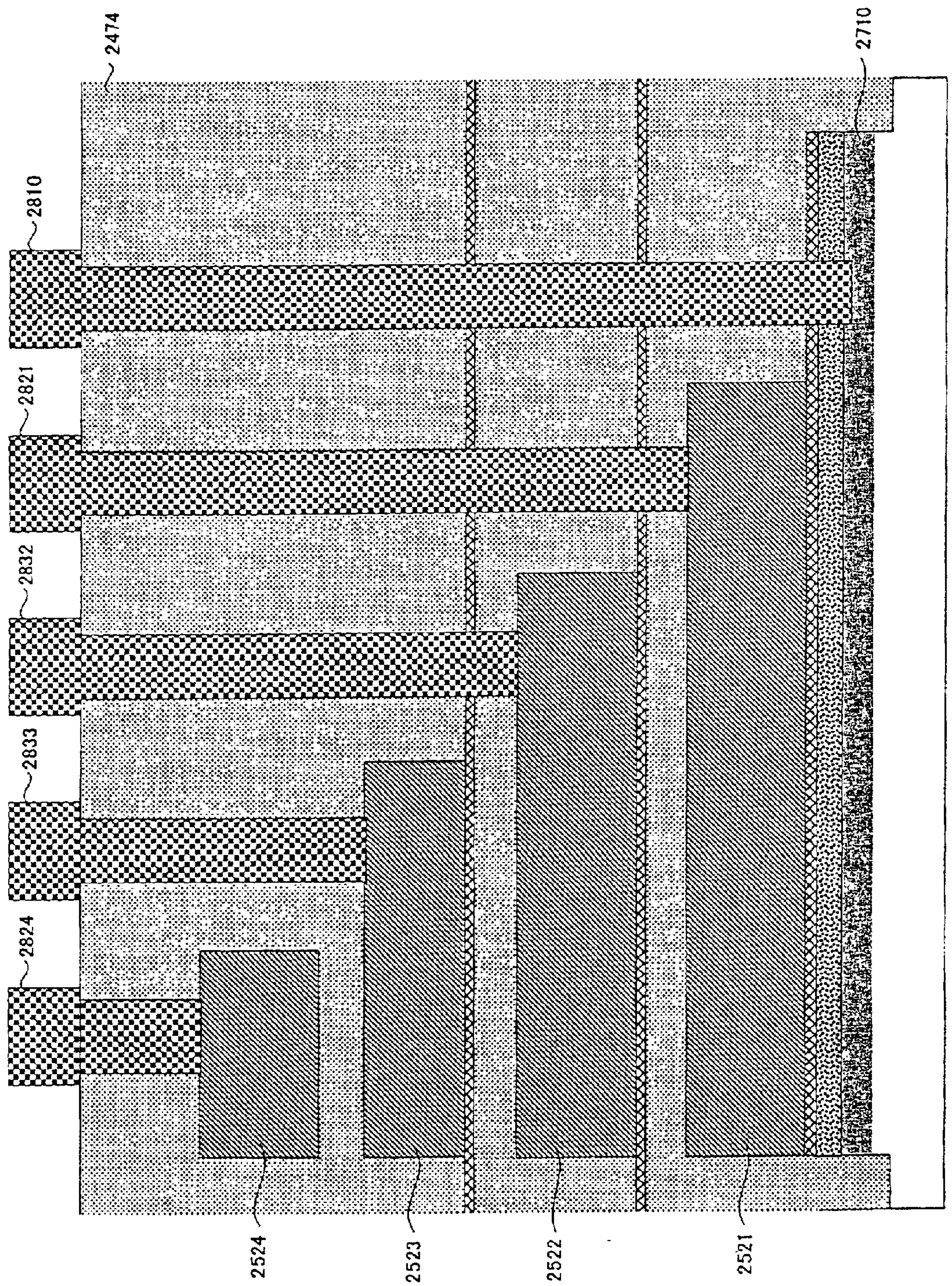
Figure 920:
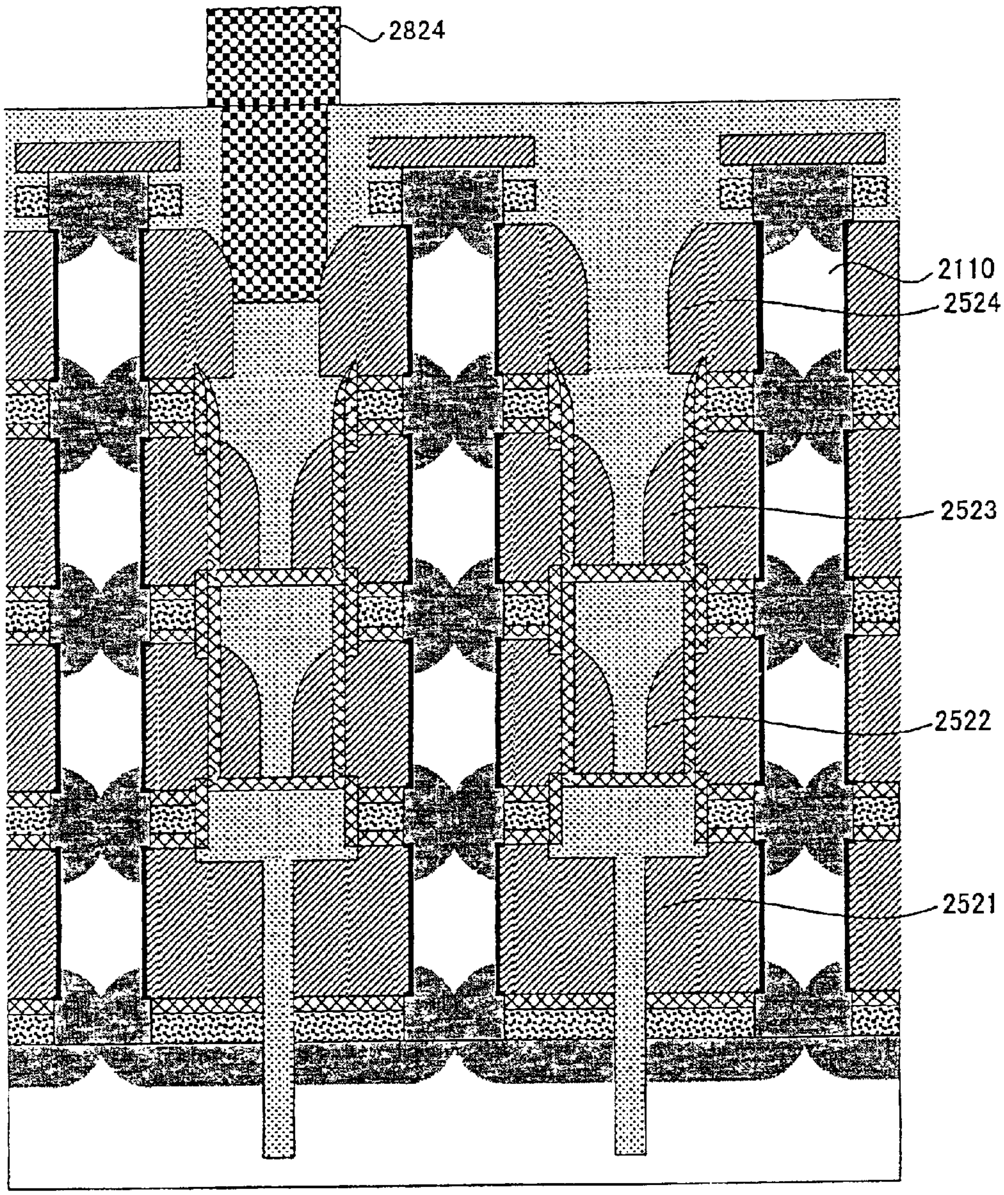
Figure 921:
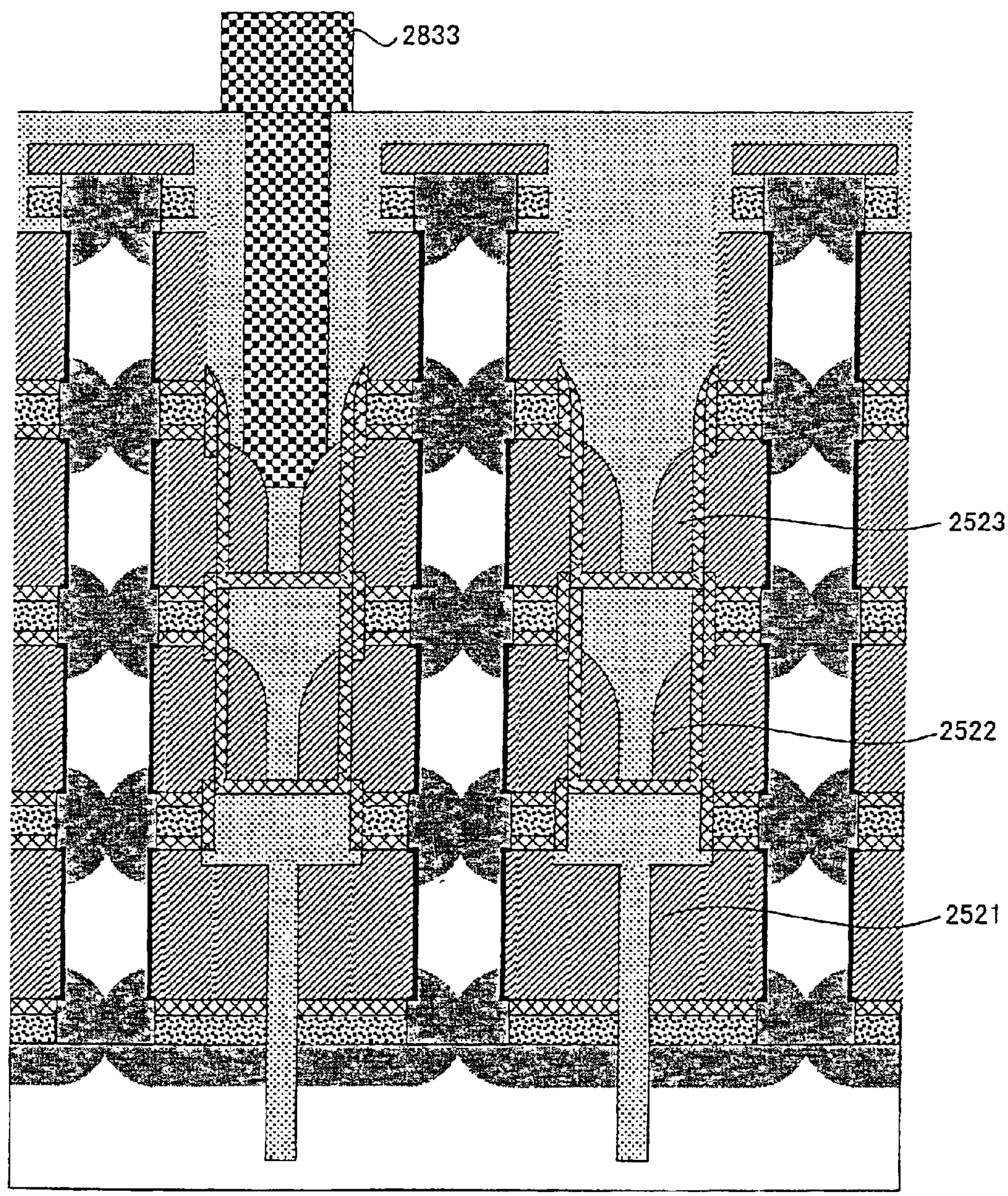
Figure 922:
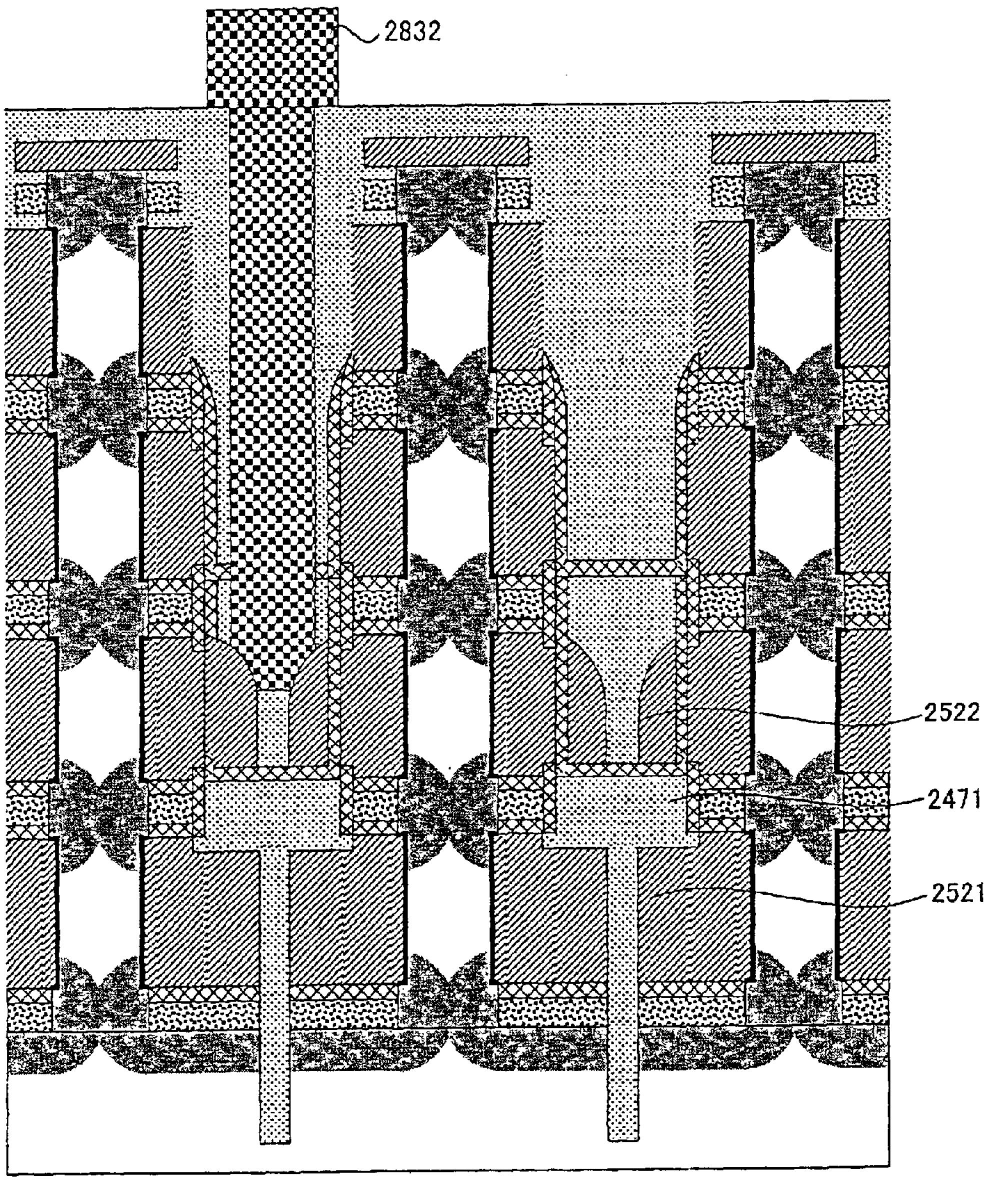
Figure 923:
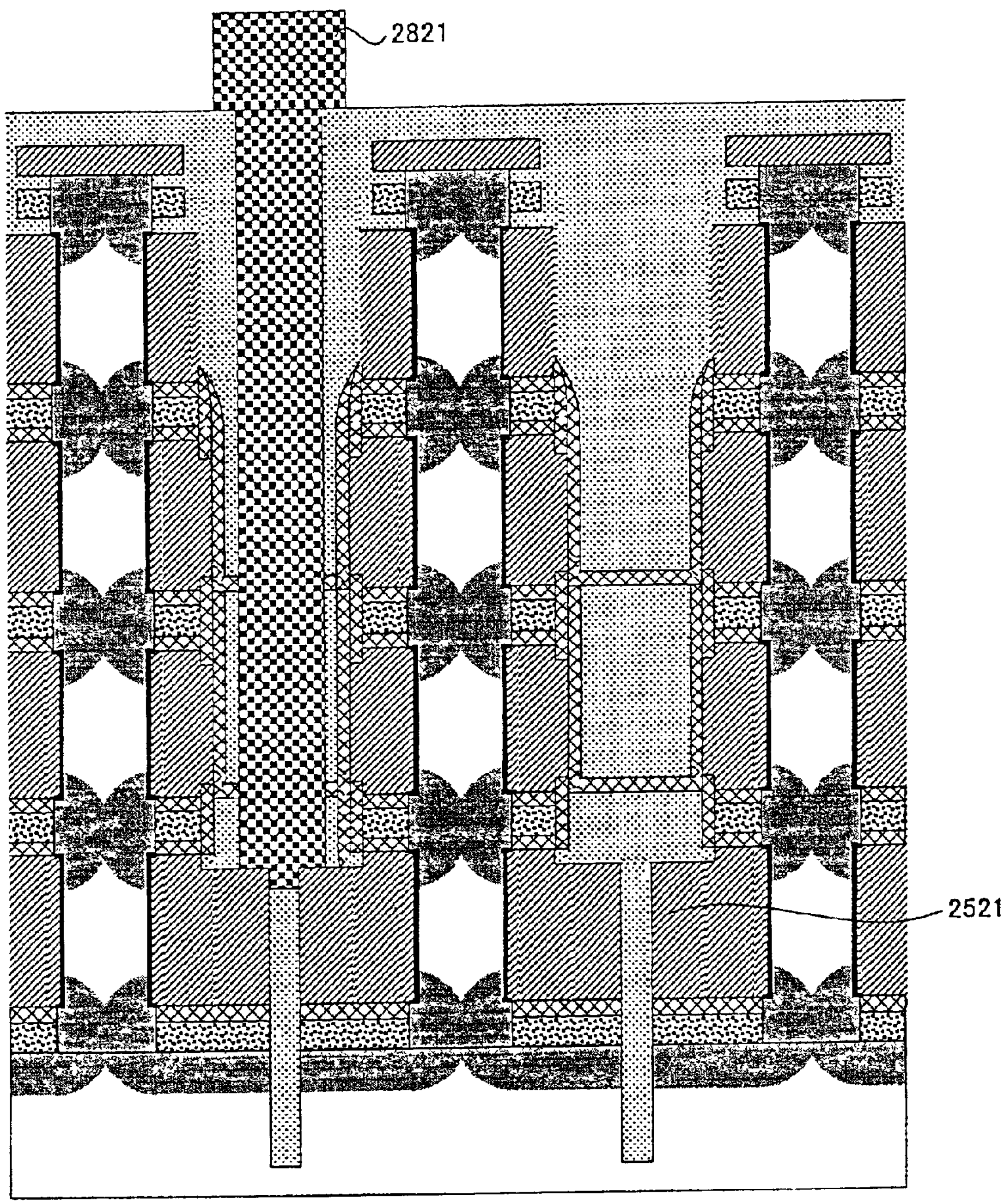
Figure 924:
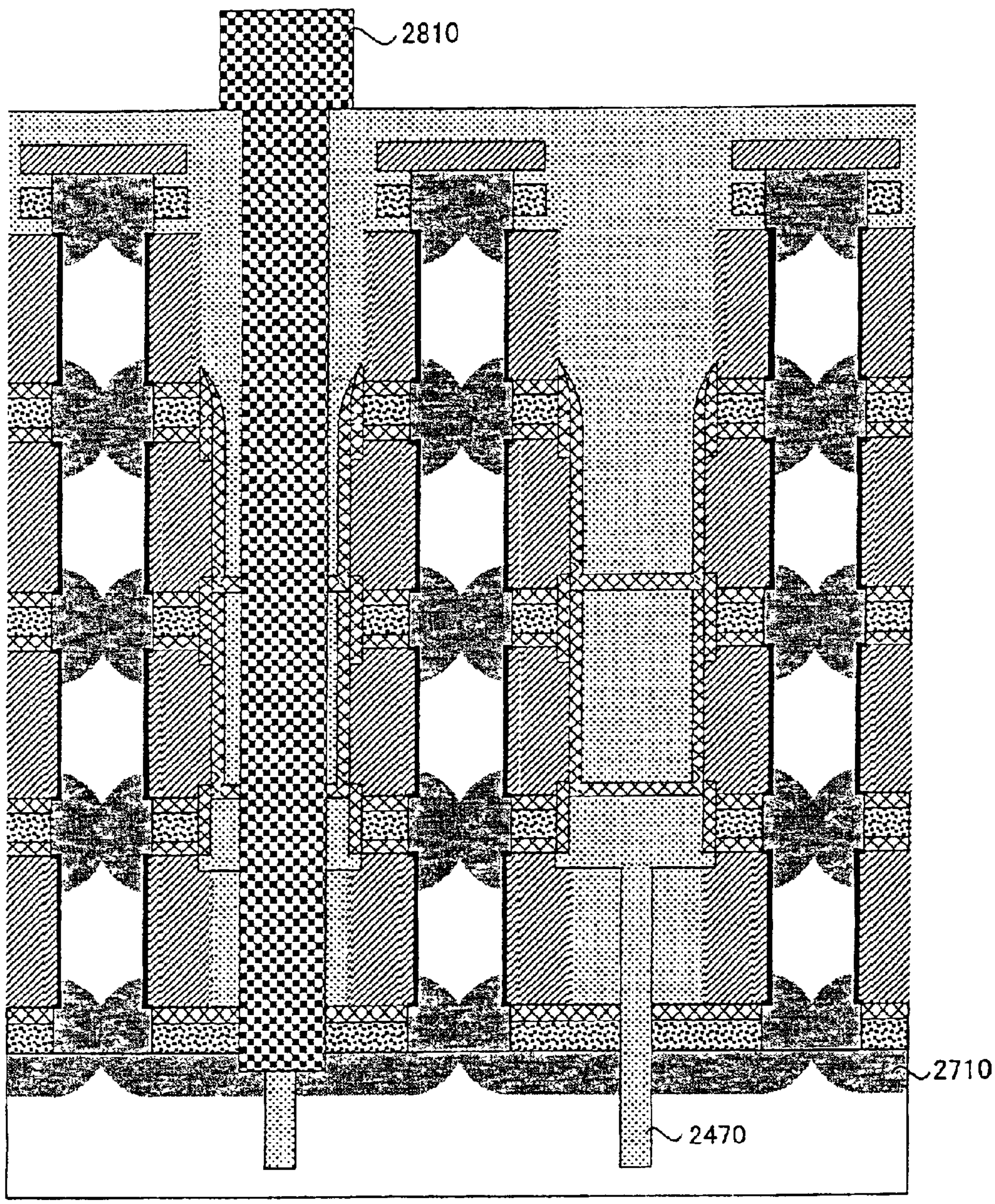

Such a semiconductor memory may be produced by the following production process. FIGS. 913 and 919 are sectional views taken on line H-H' of FIG. 1 illustrating a memory cell array of EEPROM, FIGS. 914 to 918 are sectional views taken on lines shifted parallel to line I-I' of FIG. 10 in a direction of H-H', respectively, and FIGS. 920 to 924 are sectional views taken on lines shifted parallel to line I-I' of FIG. 11 in a direction of H-H', respectively. These sectional views are taken at locations showing sites (contact portions) 2921, 2932, 2933, 2934 and 2910 where terminals mounted on the top face of the semiconductor device are electrically connected to the buried wiring layers 2521, 2522, 2523, 2524 and 2710 for the application of voltage to the buried wiring layers from outside.

Production steps until the silicon oxide film (the tenth insulating film) 2474 is deposited to a thickness of 100 to 500 nm are the same as those in Production Example 11.

Thereafter, the surface of the silicon nitride film 2474 is flattened by etch-back or CMP as required. Using a resist film patterned by a known photolithographic technique as a mask, the silicon nitride film 2474 is etched by reactive ion etching to reach a wiring layer intended to be lead out. This step is repeated as many times as the number of wiring layers to be lead out.

More particularly, for leading out the first wiring layer, using a resist film patterned by a known photolithographic technique as a mask, reactive ion etching is performed from the top surface of the silicon oxide film (the tenth insulating film) 2474 to reach the impurity diffusion layer 2710 only in a region where the lead-out portion of the wiring layer exists.

Subsequently, for leading out a wiring layer which is the second from the bottom, for example, using a resist film patterned by a known photolithographic technique as a mask, reactive ion etching is performed from the top surface of the silicon oxide film 2474 to reach the polysilicon film (the second conductive film) 2521 in a region of the lead-out portion of the wiring layer other than the region where the etching has been performed previously.

The order of etching for leading out the wiring layers is not particularly limited. For example, two trenches may be simultaneously formed to reach a wiring layer in the lead-out portion of the wiring layers. One of the trenches may be masked by a resist film and the other may be further etched to reach a lower wiring layer. Means for forming trenches for leading out the wiring layers are not particularly limited so long as the trenches are separately formed in the lead-out portion of the wiring layers to reach the wiring layers in a number equal to the number of the wiring layers to be lead out. The positions of the sites (contact portions) 2921, 2932, 2933, 2924 and 2910 are not particularly limited so long as the terminals disposed on the top face of the semiconductor device are electrically connected to the buried wiring layers 2521, 2522, 2523, 2524 and 2710.

Thereafter, a silicon oxide film 2499, for example, is deposited as a twenty-sixth insulating film to a thickness of 10 to 100 nm and is etched back by about a thickness deposited so that a sidewall spacer made of the silicon oxide film 2499 is formed on an inner wall of the trenches formed in the lead-out portion of the wiring layers.

The twenty-sixth insulating film is not particularly limited to a silicon oxide film but may be formed of a silicon nitride film or any other insulating film.

Production steps thereafter follow Production Example 11. When the fourth wiring layer is formed, a metal or a conductive film is buried in the trenches formed in the lead-out portion of the wiring layers with intervention of the sidewall spacer made of the silicon oxide film 2499. Thereby the first, second, third wiring layers are lead out to the top face of the semiconductor (FIG. 913 to FIG. 918).

Alternatively, the second and third wiring layers may be arranged in the lead-out portion of the wiring layers as shown in FIGS. 919 to 924, and the trench formed in the lead-out portion may have some distance from other wiring layers unintended to be lead out with intervention of an insulating film. In this case, by omitting the formation of the sidewall spacer of the silicon oxide film 2499, reduction in resistance at the contact portions is expected. As a further effect, parasitic capacity between the wiring layers is expected to decrease because unrelated wiring layers do not exist around the trench.

The lead-out of the first, second and third wiring layers to the top face of the semiconductor by the above-described process is applicable to all examples of the present invention.

PRODUCTION EXAMPLE 43

Explanation is given of an example of production process of a semiconductor memory in which the semiconductor substrate 2100 is electrically insulated from the island-like semiconductor layers 2110 not by the impurity diffusion layer but by a depletion layer existing at junction of the impurity diffusion layer with the semiconductor substrate 2100 or the island-like semiconductor layers 2110.

Figure 925:
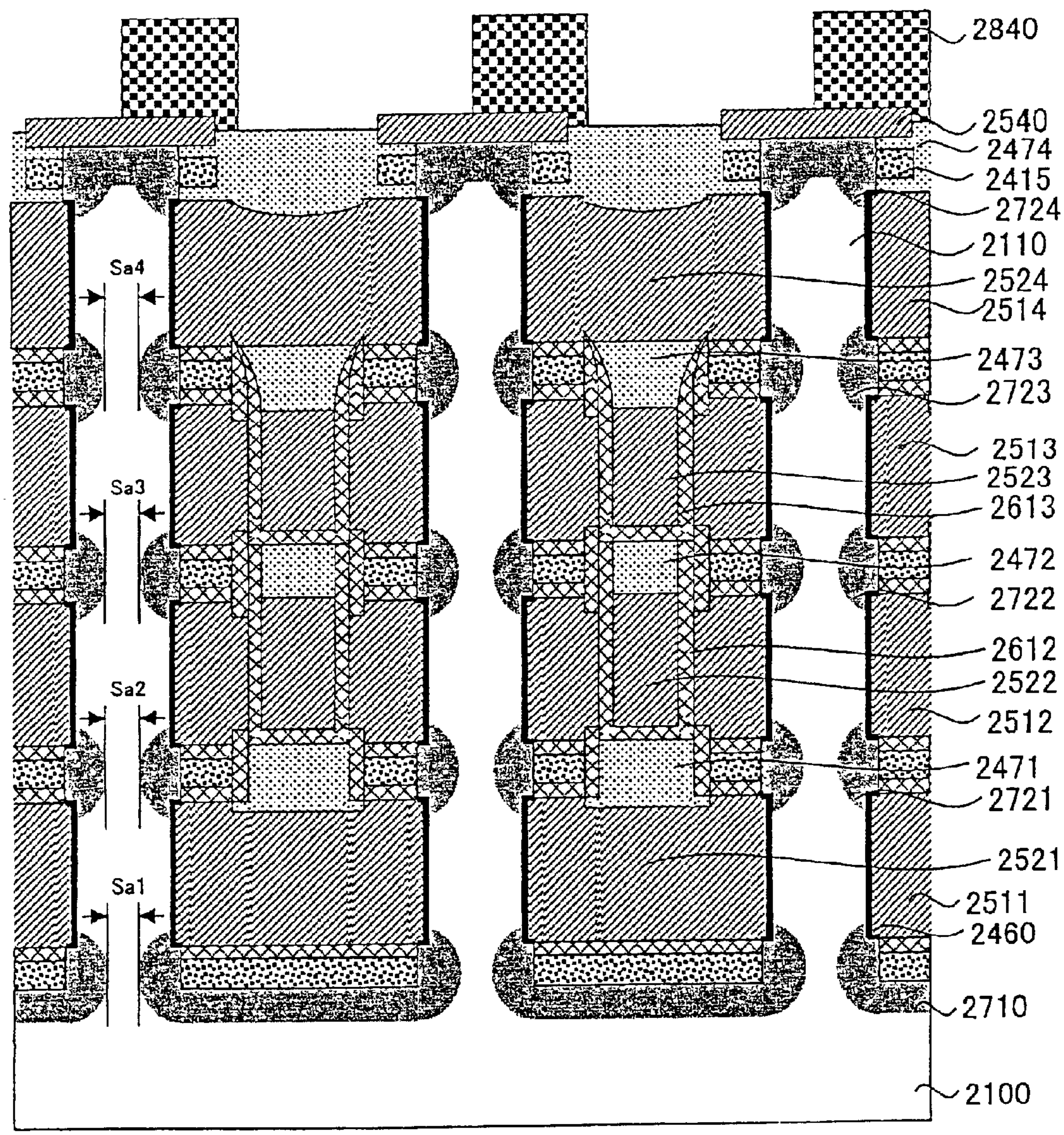
Figure 926:
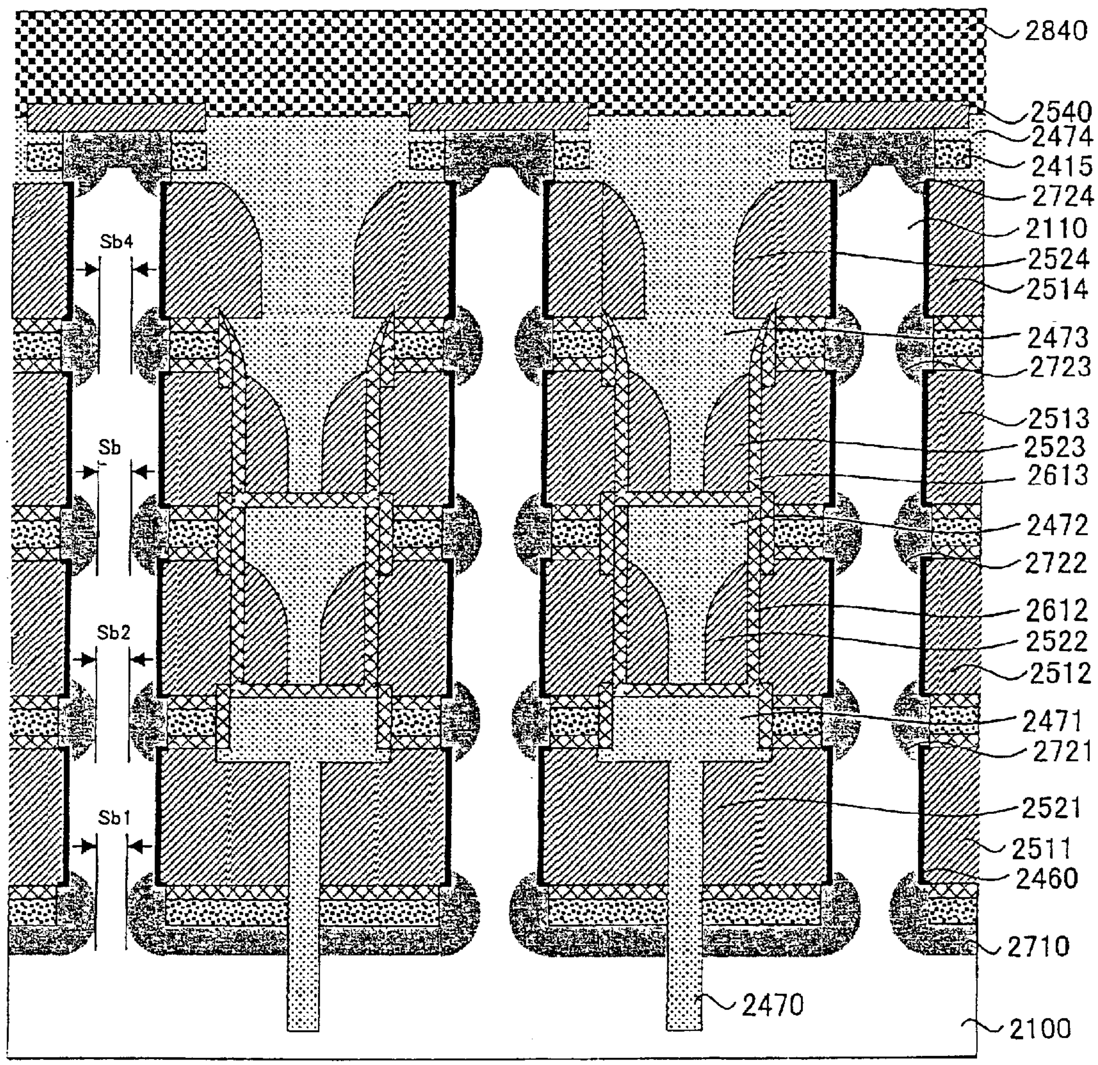

Such a semiconductor memory may be produced by the following production process. FIGS. 925 and 926 are sectional views taken on line A-A' and line B-B', respectively, in FIG. 1 illustrating a memory cell array of an EEPROM.

In FIGS. 925 and 926, the island-like semiconductor layer 2110 and the semiconductor substrate 2100 are structurally connected. In this example, the island-like semiconductor layer 2110 and the semiconductor substrate 2100 are electrically insulated by a depletion layer formed on an island-like semiconductor layer 2110 side or a semiconductor substrate 2100 side of a PN junction between the impurity diffusion layer 2710 as the first wiring layer and the island-like semiconductor layer 2110 or the semiconductor substrate 2100 owing to a potential difference between a potential given to the impurity diffusion layer 2710 and a potential given to the island-like semiconductor layer 2110 or the semiconductor substrate 2100 at reading or at erasing.

More particularly, supposing that the depletion layer formed on the island-like semiconductor layer 2110 side or the semiconductor substrate 2100 side has a width W, the electrical insulation can be produced if at least either a space Sa1 or Sb1 of the impurity diffusion layer 2710 shown in FIG. 925 and FIG. 926 is two or less times as large as W. Also, as regards the N-type impurity diffusion layers 2721 to 2723, like the impurity diffusion layer 2710, the active region of each transistor is electrically insulated if at least either one of Sa2 and Sb2, Sa3 and Sb3, or Sa4 and Sb4 is two or less times as large as W.

The above described state may be produced both at reading and at erasing, only at erasing or only at reading. The above dimensional relationships may be combined in any way so long as the electrical insulation can be obtained.

PRODUCTION EXAMPLE 44

In a semiconductor memory to be produced in this example, regions for forming charge storage layers are defined in advance by a laminated film comprising plural films, and then island-like semiconductor layers in a pillar form are formed by selective epitaxial silicon growth in trenches opened by using a photoresist mask. MIS capacitors are formed as charge storage layers on the sides of the island-like semiconductor layers in the regions for forming the charge storage layers. The island-like semiconductor layers are each in an electrically floating state with respect to the semiconductor substrate. The active region of each memory cell is in the electrically floating state. One memory cell is constituted of one transistor and one capacitor. In this production example, a plurality of memory cells, for example, two memory cells, are placed on the island-like semiconductor layer and are connected in series along the island-like semiconductor layer. The MIS capacitor and the transistor of the memory cell are formed at the same time. The thickness of the gate insulating film of the transistor of the memory cell is equal to the thickness of the capacitor insulating film of the capacitor of the memory cell.

Such a semiconductor memory may be produced by the following production process. FIGS. 927 to 930 and FIGS. 931 to 934 are sectional views taken on line A-A' and line B-B', respectively, in FIG. 13 which is a plan view illustrating a memory cell array of a DRAM.

Production steps are the same as those of Production example until the silicon oxide films 2415, 2416 and 2417 containing arsenic impurities of about $1\times10^{18}$ to $1\times10^{22}/cm^3$ are disposed by CVD on the sides of the semiconductor layers 2110 in the regions for forming an impurity diffusion layer, and the third trench 2230 is formed. At this time, the silicon oxide film 2416 as the third insulating film may be etched back to such a degree that the silicon nitride film 2321 as the fourth insulating film is exposed.

Figure 927:
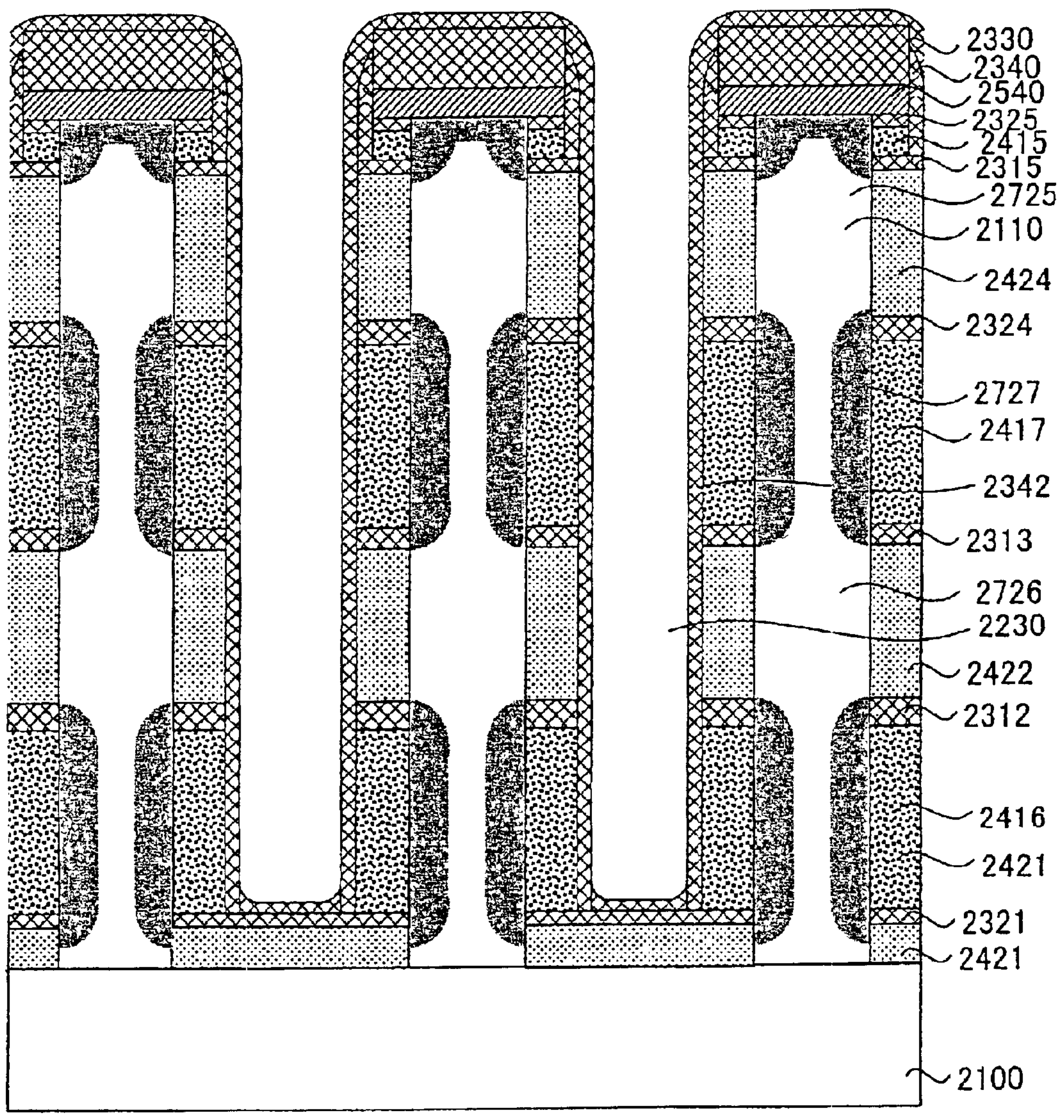
Figure 931:
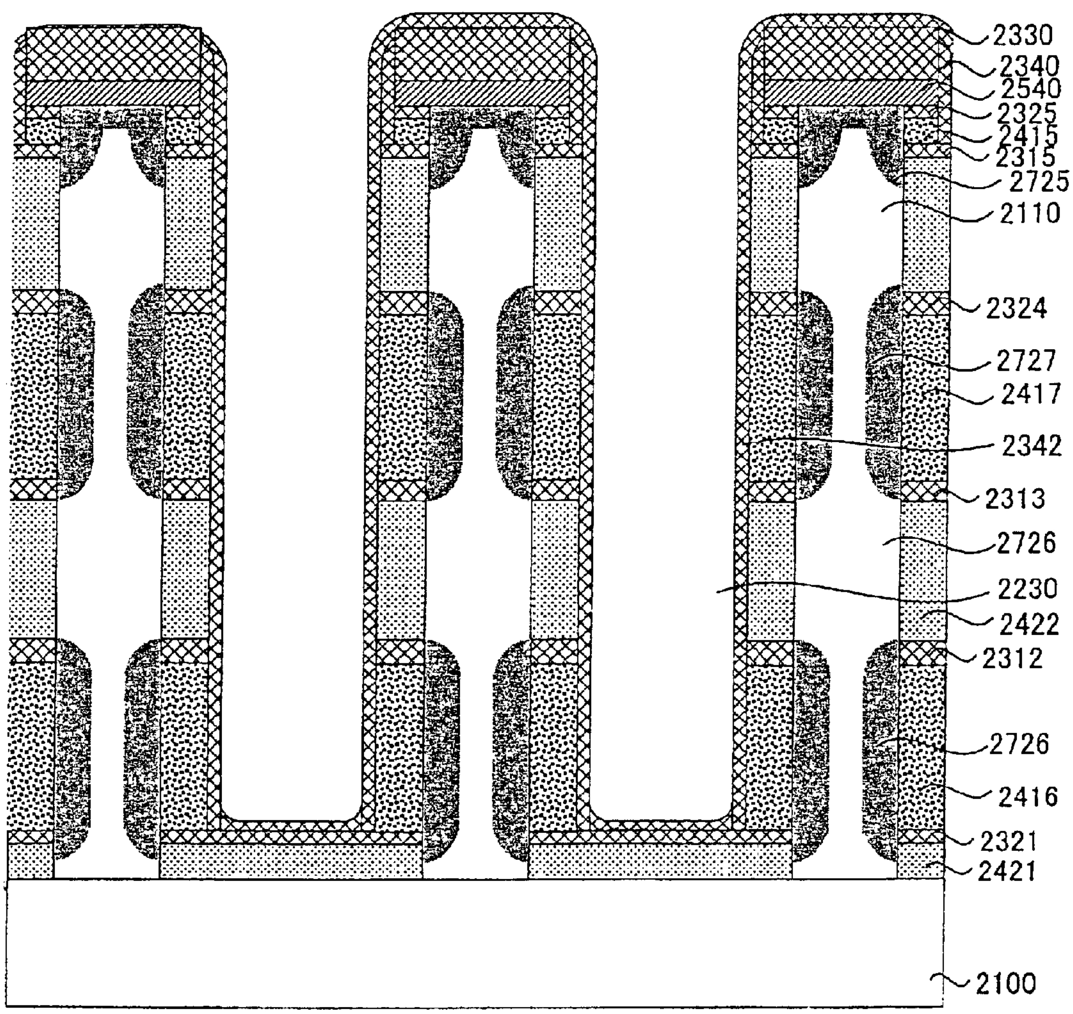

Subsequently, a silicon nitride film 2342, for example, is deposited as a sixth insulating film to a thickness of about 5 to 50 nm and is thermally treated to diffuse the impurities contained in the silicon oxide films 2415, 2416 and 2417 into the island-like semiconductor layers 2110 (FIGS. 927 and 931). The impurity introduction from the surface of the island-like semiconductor layer 2110 may be carried out during the formation of the island-like semiconductor layer 2110. Means for the implantation are not particularly limited so long as an impurity concentration distribution is almost equal over the island-like semiconductor layers 2110.

Then, the silicon nitride film 2342 (the sixth insulating film) is removed by isotropic etching, and the silicon oxide films 2416 and 2417 as well as the silicon oxide films 2422 and 2424 are removed by isotropic etching.

Figure 928:
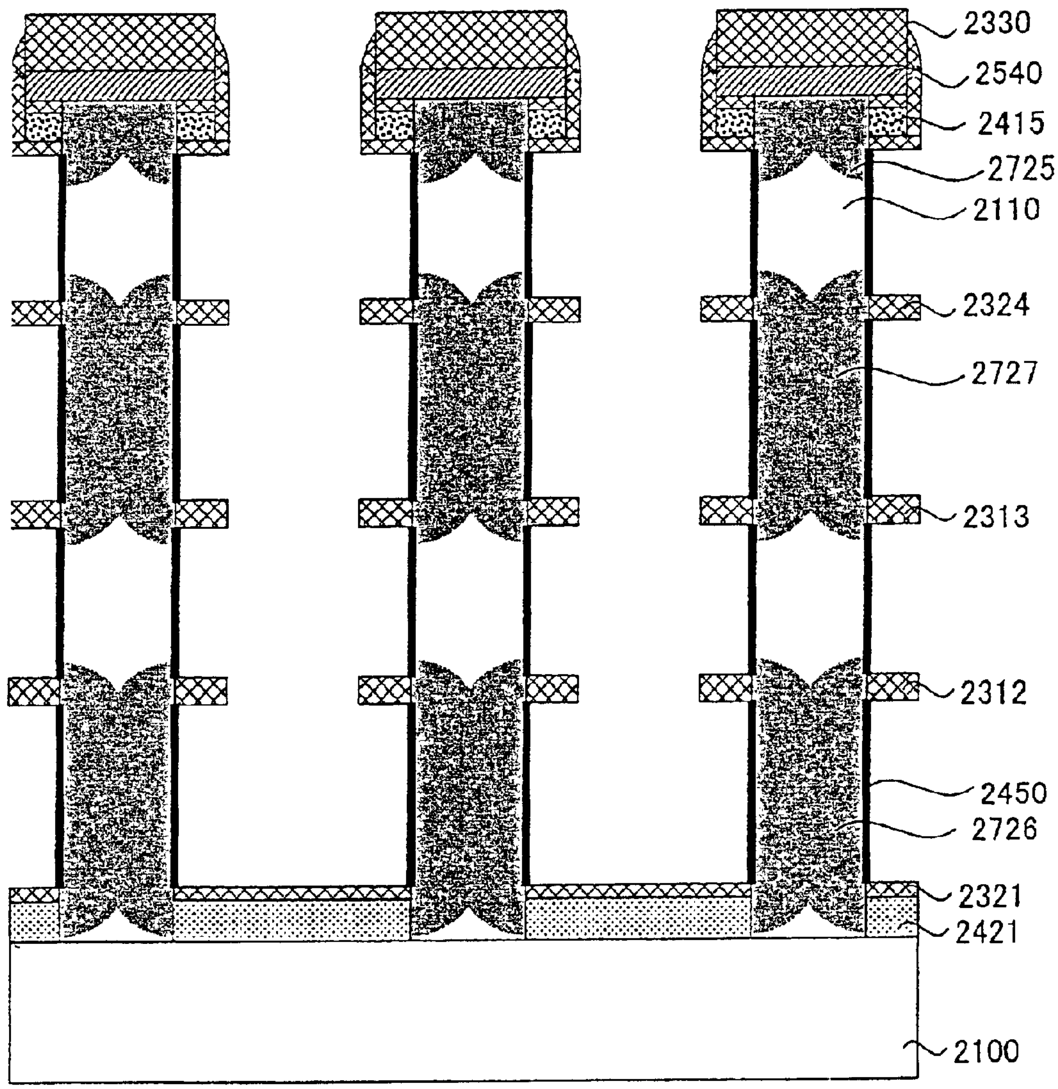
Figure 932:
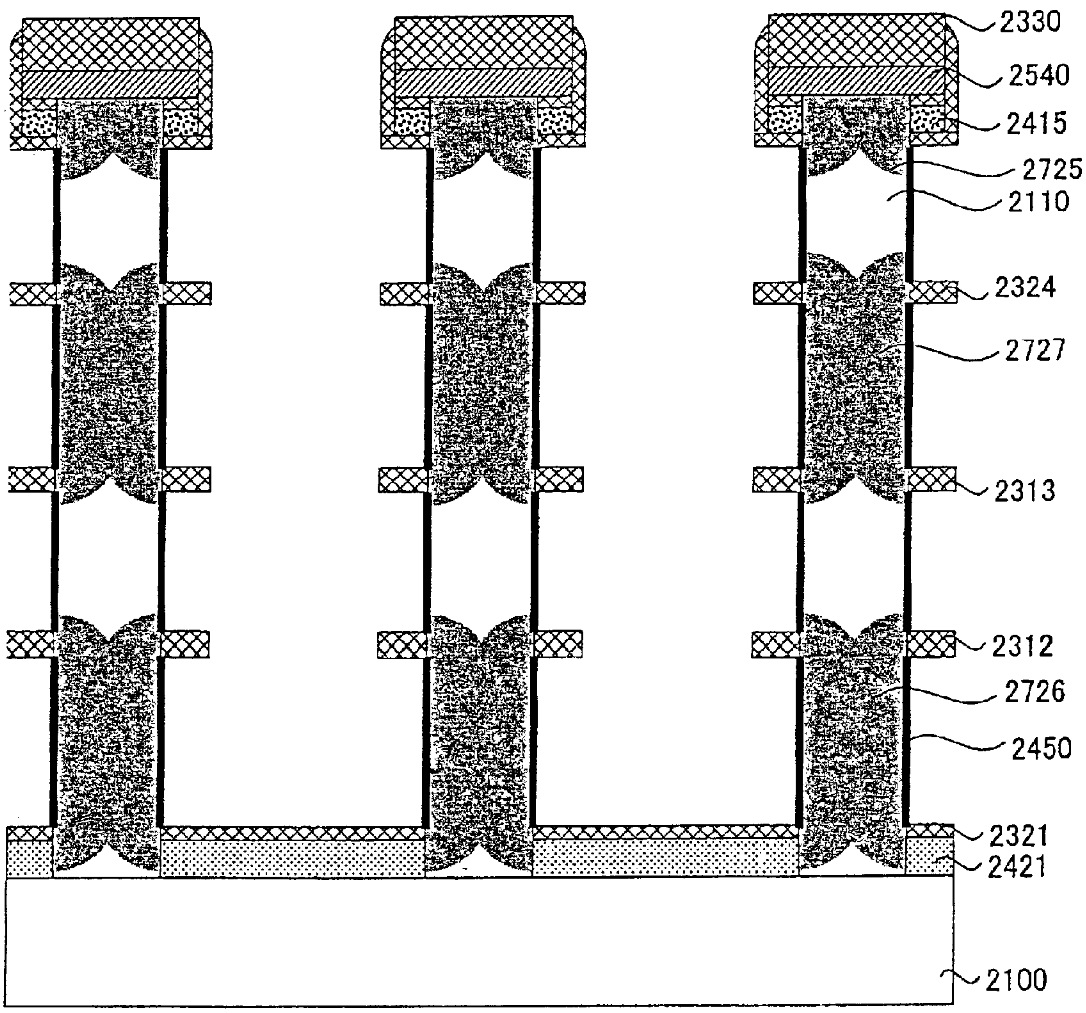

Then, the surface of each island-like semiconductor layer 2110 is oxidized to form, for example, a thermally oxidized film 2450 of about 10 to 100 nm thick as a ninth insulating film (FIGS. 928 and 932). The thermally oxidized film 2450 is etched away from the periphery of each island-like semiconductor layer 2110, for example, by isotropic etching.

Then, as required, channel ion implantation is carried out into the sidewall of each island semiconductor layer 2110 by slant ion implantation. For example, the ion implantation may be performed at an implantation energy of 5 to 100 keV at an boron dose of about $1\times10^{11}$ to $1\times10^{13}/cm^2$ at an angle of 5 to 45° with respect to the normal line of the surface of the substrate. Preferably the channel ion implantation is performed from various directions to the island-like semiconductor layers 2110 because a surface impurity concentration becomes more uniform. Alternatively, instead of the channel ion implantation, an oxide film containing boron may be deposited by CVD with a view to utilizing diffusion of boron from the oxide film. The impurity implantation from the surface of the island-like semiconductor layers 2110 may be carried out before the island-like semiconductor layers 2110 are covered with the thermally oxidized film 2450, or during the formation of the island-like semiconductor layers 2110. Alternatively, the impurities may be introduced to the silicon oxide films 2422 and 2424 in advance with a view to implanting the impurities in the island-like semiconductor layers 2110 by thermal treatment or the like before removing the silicon oxide films 2422 and 2424. Means for the implantation are not particularly limited so long as an impurity concentration distribution is almost equal over the island-like semiconductor layers 2110.

Subsequently, a silicon oxide film 2460, for example, is formed as a tenth insulating film to be a tunnel oxide film to a thickness of about 10 nm around each island-like semiconductor layer 2110, for example, by thermal oxidization. The tunnel oxide film, however, may be formed of not only a thermally oxidized film but also a CVD oxide film or a nitrogen oxide film.

Figure 929:
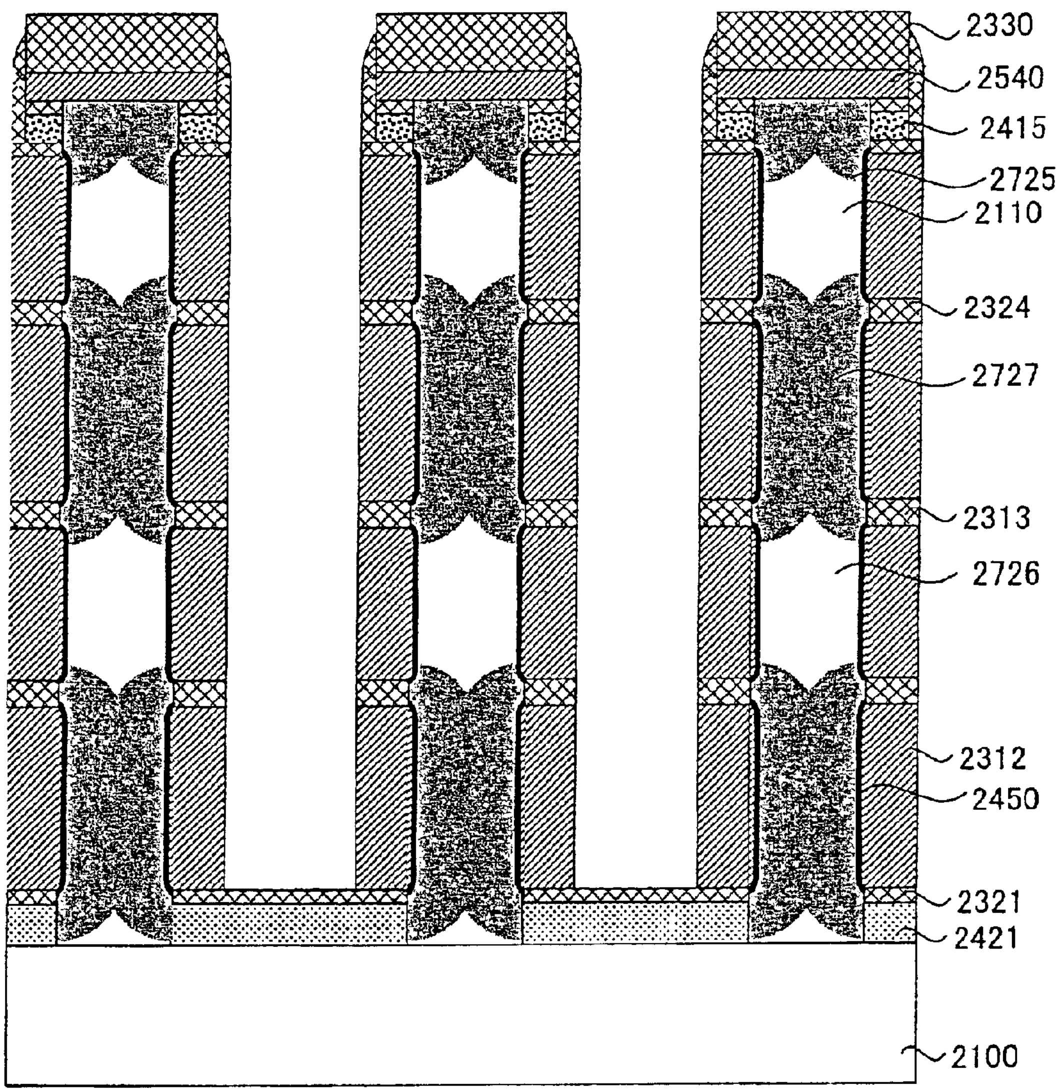
Figure 930:
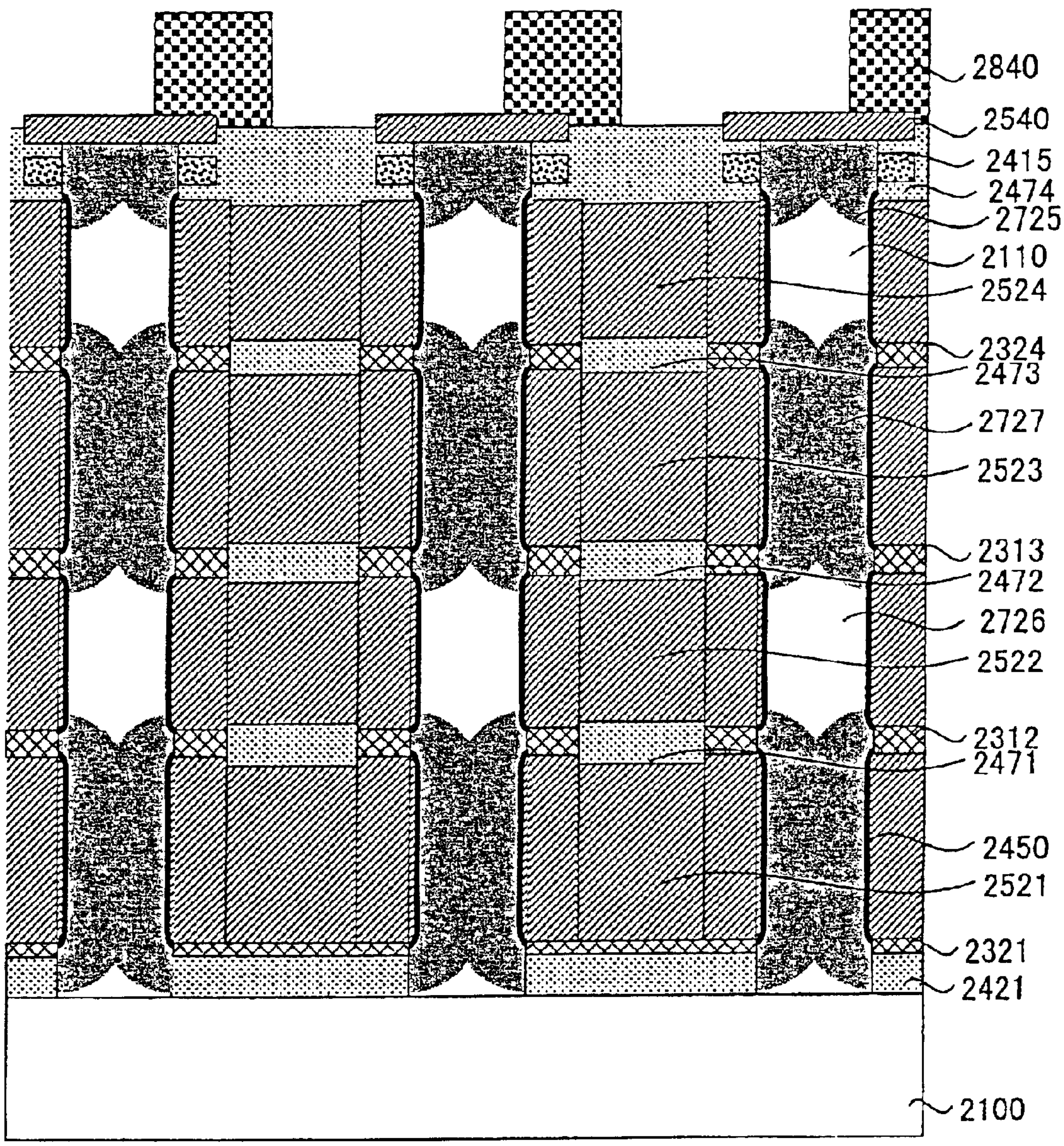
Figure 933:
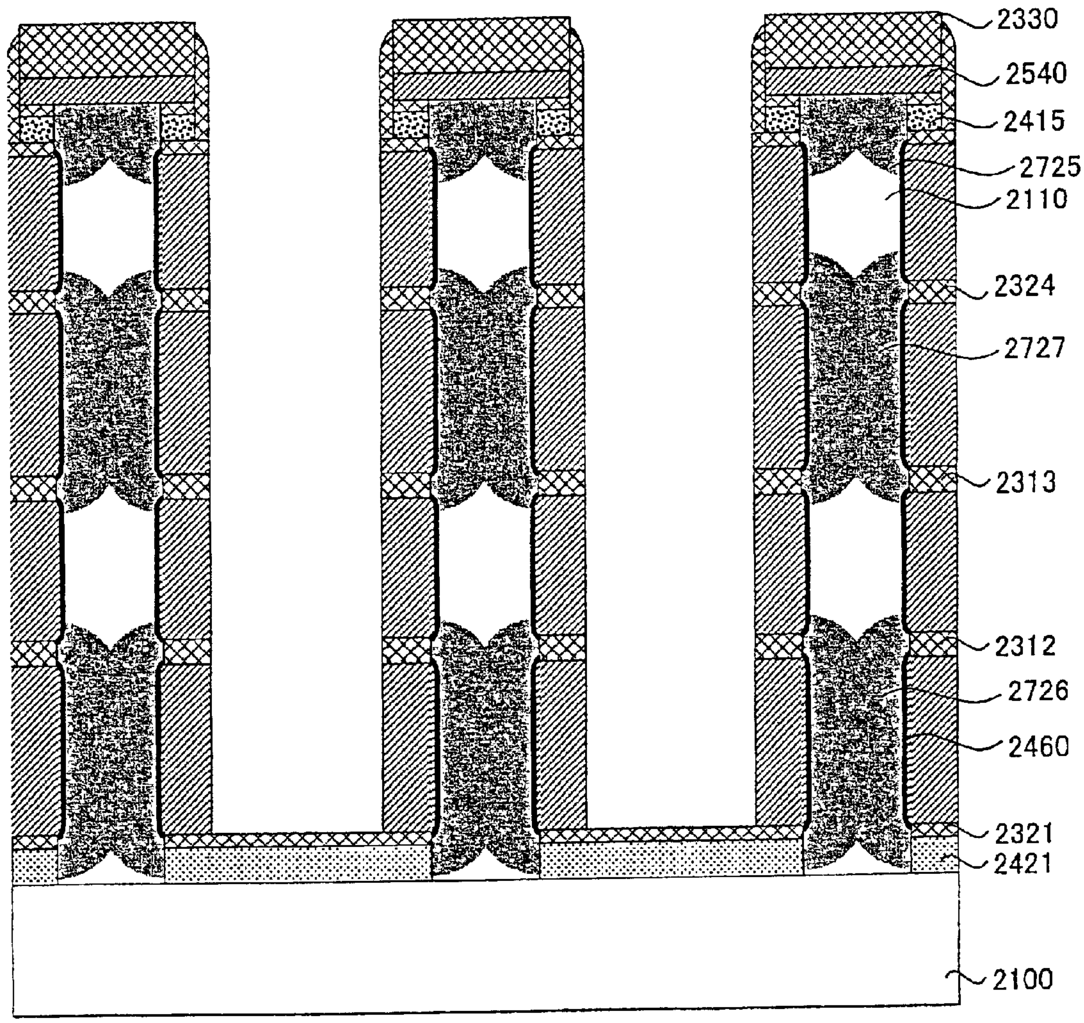
Figure 934:
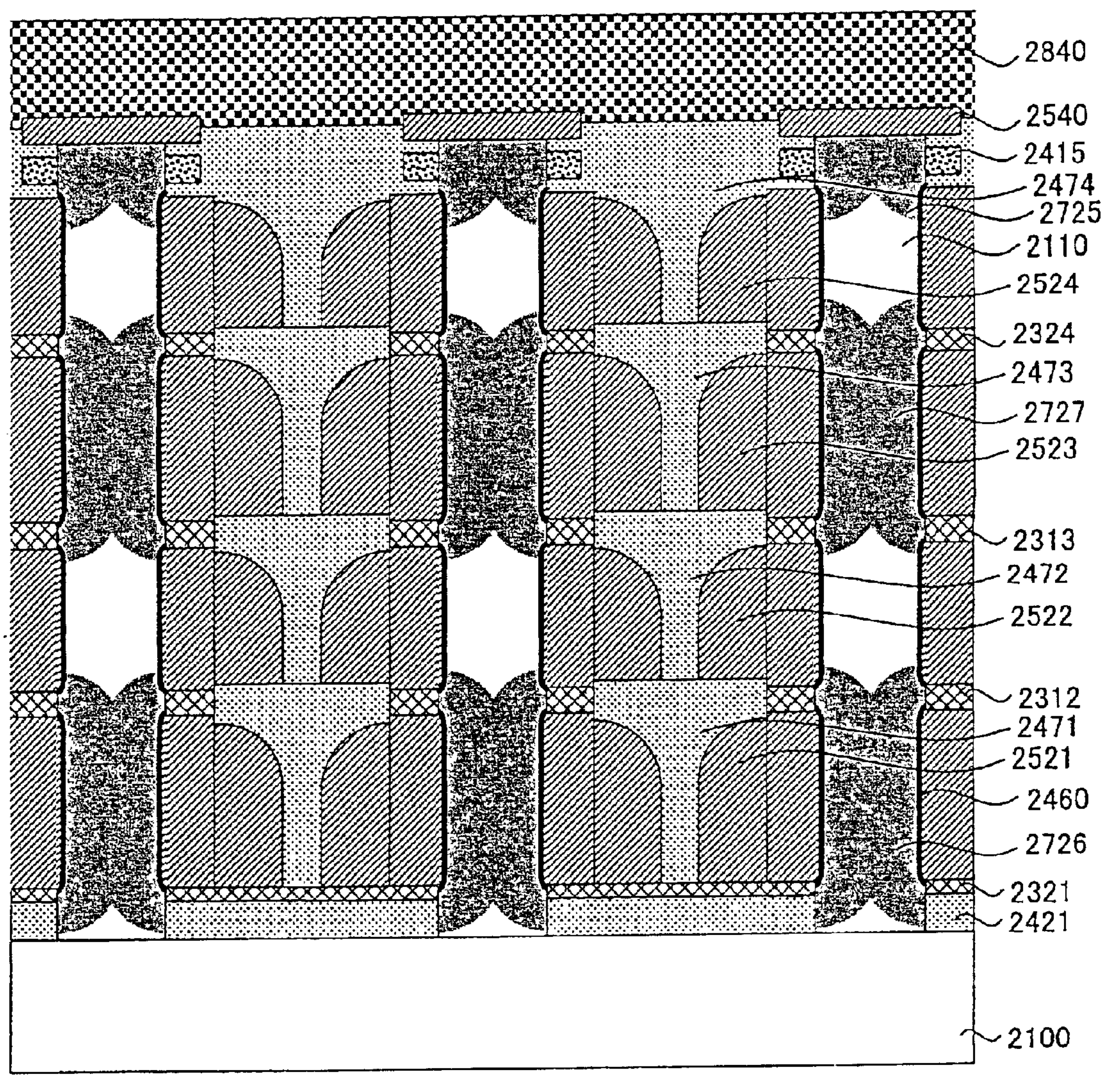

Subsequently, a polysilicon film 2510, for example, is deposited as a first conductive film to a thickness of about 50 to 200 nm. Using the silicon nitride film 2330 (the fifth insulating film) and the silicon nitride film 2340 (the sixth insulating film) as a mask, the polysilicon film 2510 is divided into polysilicon films 2511, 2512, 2513 and 2514, for example, by anisotropic etching (FIGS. 929 and 933).

Production steps thereafter (FIGS. 930 and 934) follow Production example 23 (FIGS. 617 to 618 and FIGS. 619 to 620). However, the interlayer capacitance film is not formed.

Figure 935:
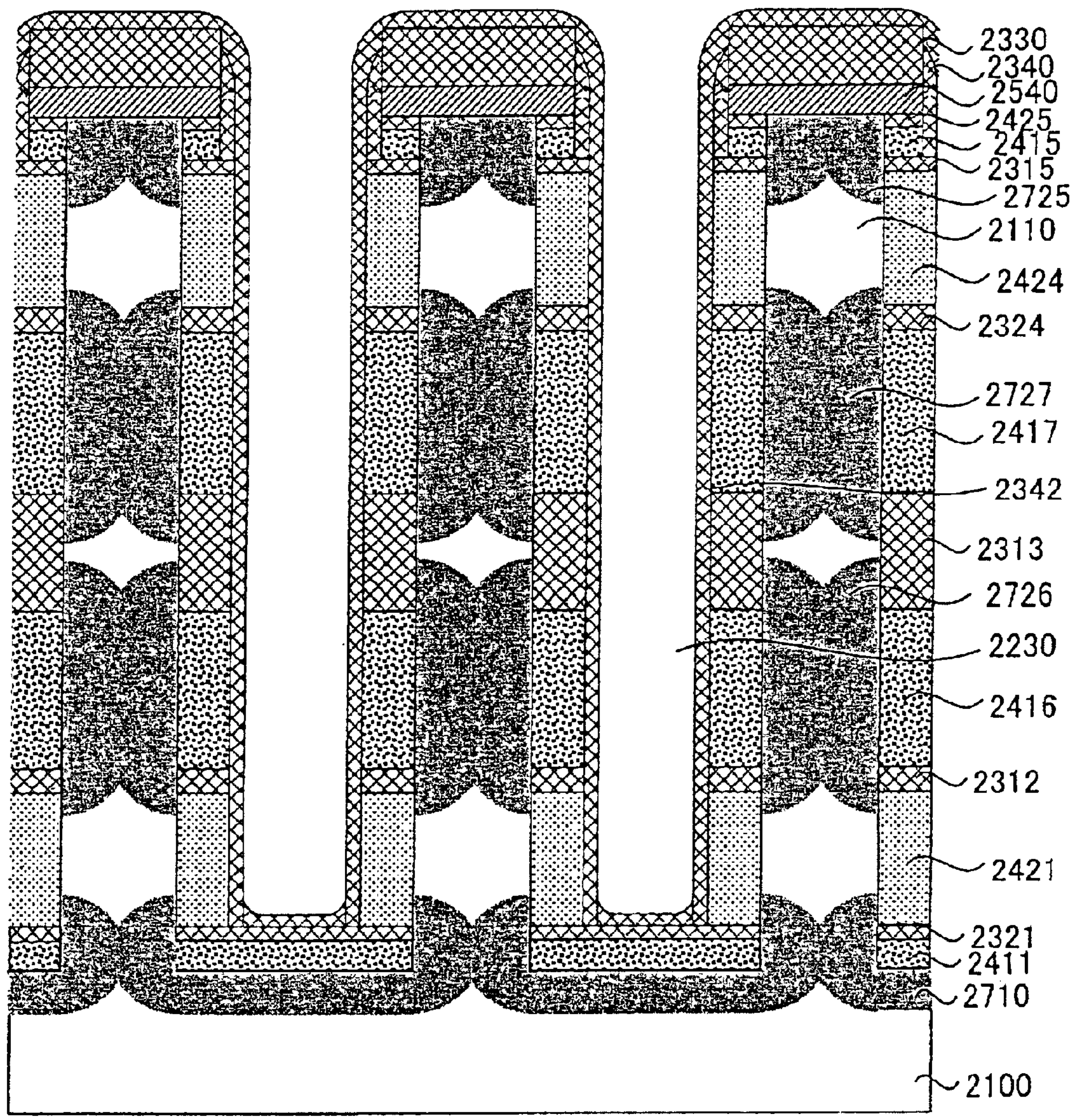
Figure 936:
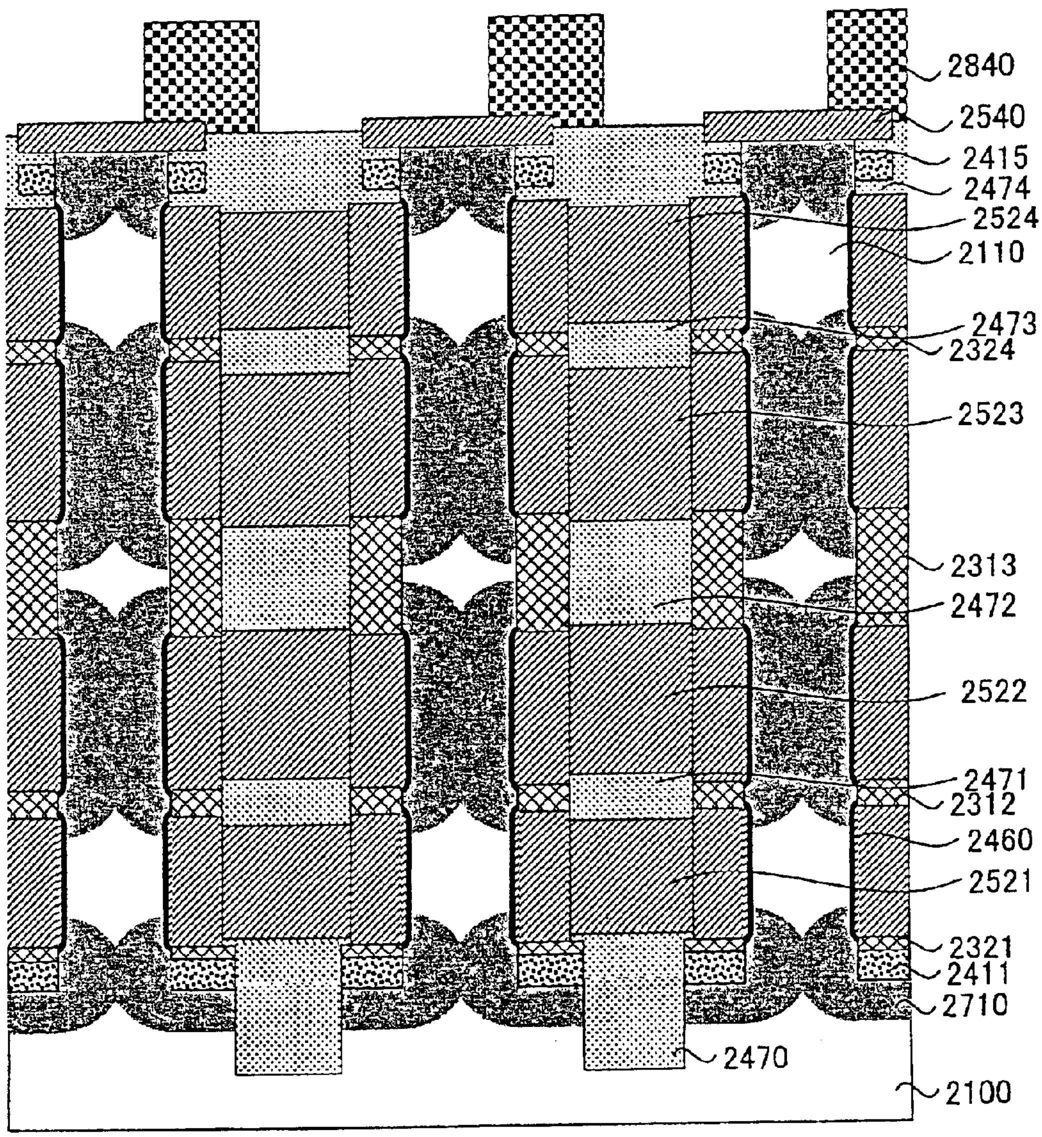
Figure 937:
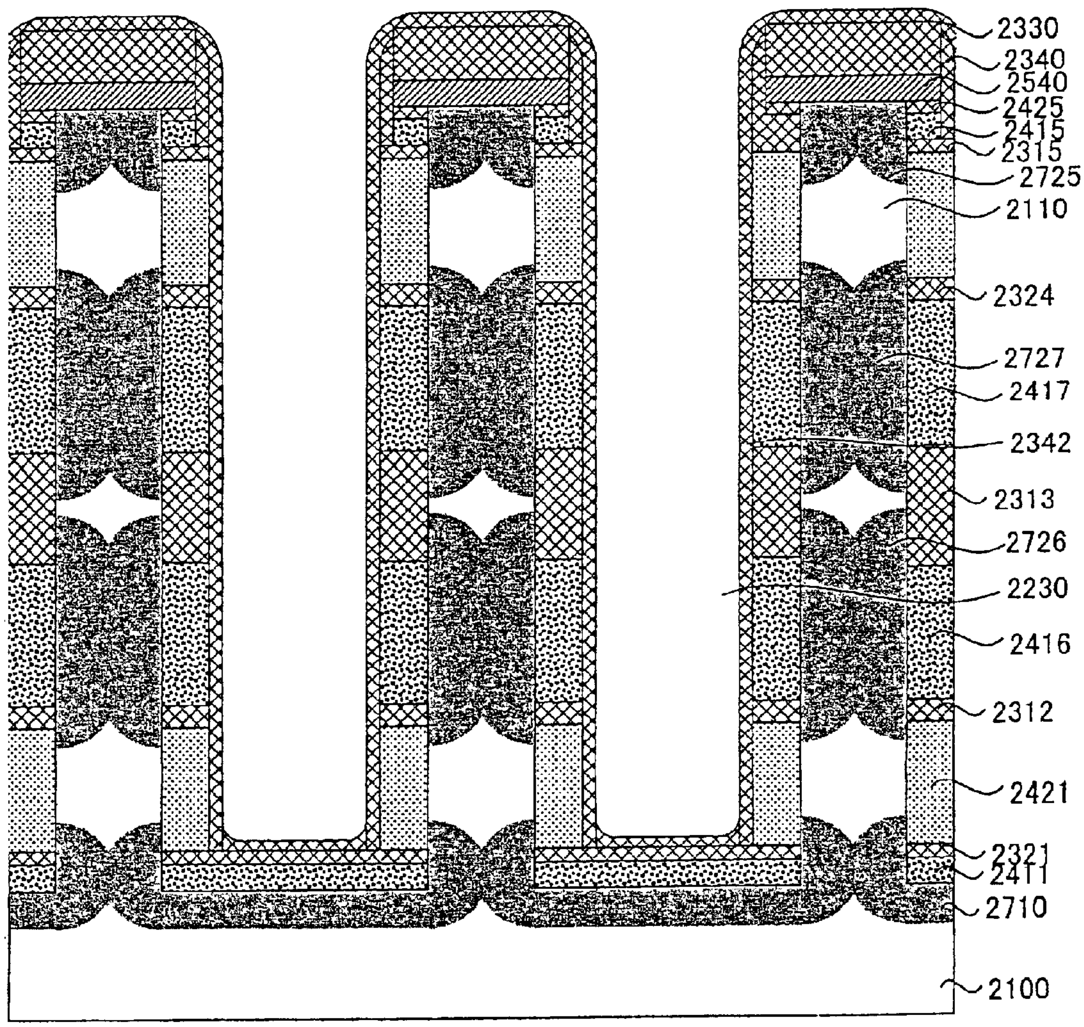
Figure 938:
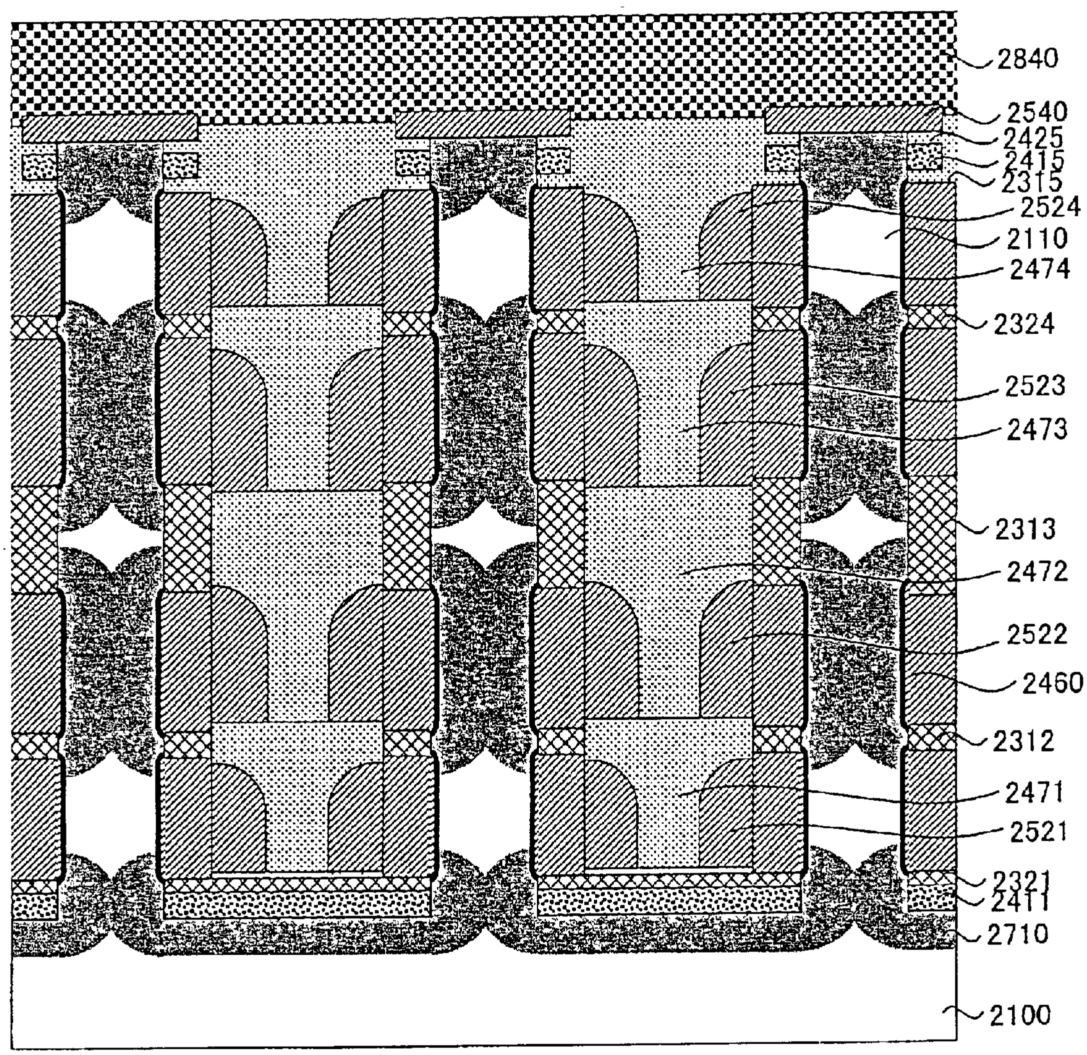

Alternatively, the silicon oxide films 2411, 2416, 2417 and 2415 may be disposed as shown in FIGS. 935 and 937 and the polysilicon film 2510 may be divided into the polysilicon films 2511, 2512, 2513 and 2514. Then, as shown in FIGS. 936 and 938, a semiconductor memory having a plurality of memory cells in which the MIS capacitors formed on the island-like semiconductor layer 2110 as the charge storage layers may be formed in accordance with Production example 1 (FIGS. 595 to 600 and FIGS. 606 to 611).

PRODUCTION EXAMPLE 45

In a semiconductor memory device to be formed in this example, after regions where charge storage layers and selection gates are formed are to be pre-defined by laminated films including floating gates as charge storage layer, tunnel oxide films are formed in hole-form trenches opened using a photoresist mask. Island-like semiconductor layer are formed in the form of pillars by selective epitaxial silicon growth and are electrically floated with respect to a semiconductor substrate. Active regions of memory cells are electrically floated. In this semiconductor memory device, selection gate transistors are disposed at the top and at the bottom of each island-like semiconductor layer. A plurality of, for example, two memory cells are disposed between the selection gate transistors. The tunnel oxide films of the memory cells are formed at the same time. The memory cells are connected in series along the island-like semiconductor layer. The gate insulating films of the selection gate transistors have the same thickness of the gate insulating films of the memory transistors.

This semiconductor memory device can be formed by the following production process. FIGS. 939 to 966 and FIGS. 967 to 994 are sectional views taken on line A-A' and line B-B', respectively, in FIG. 1 which illustrates a memory cell array of an EEPROM.

Figure 939:
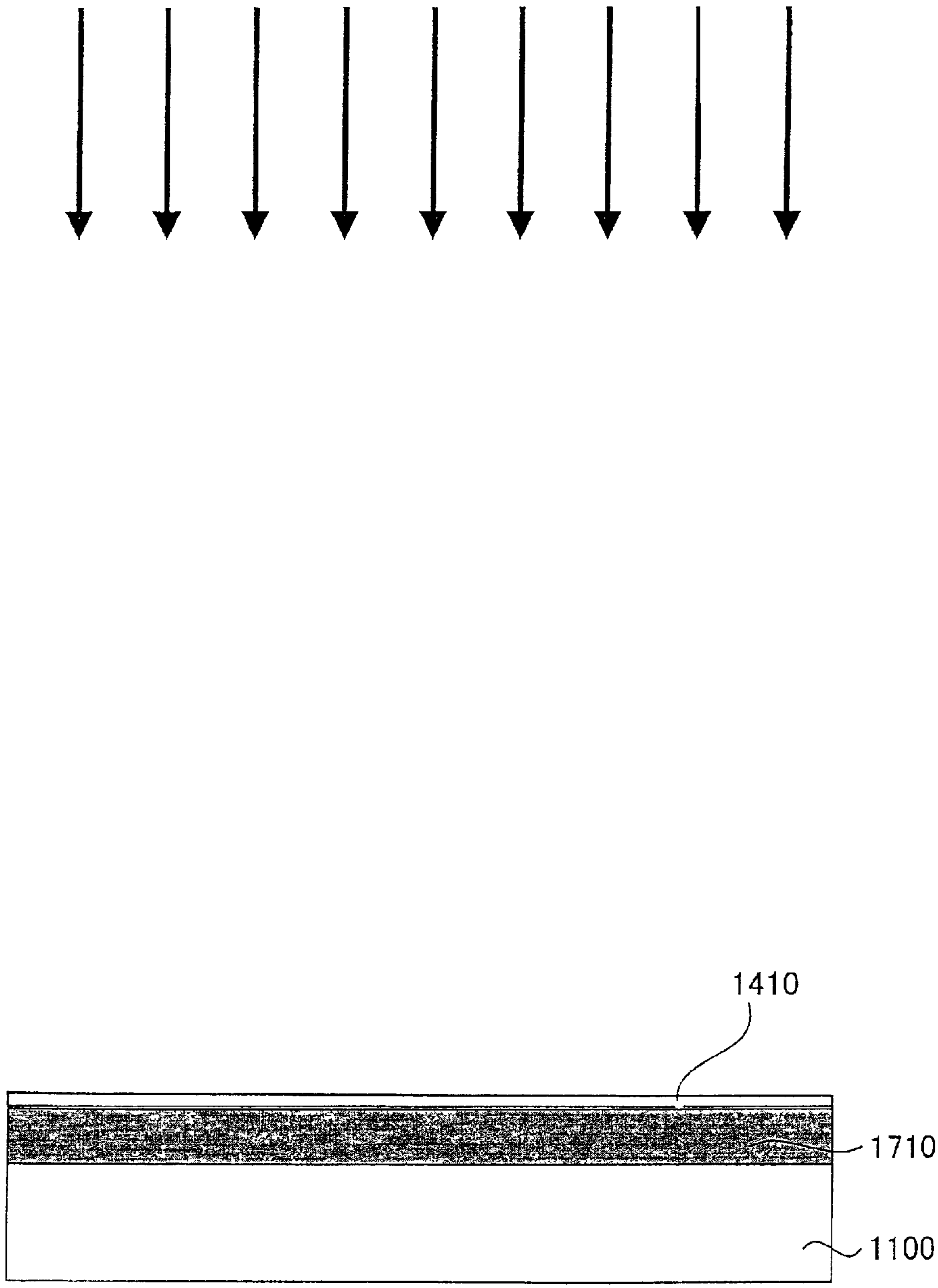
Figure 940:
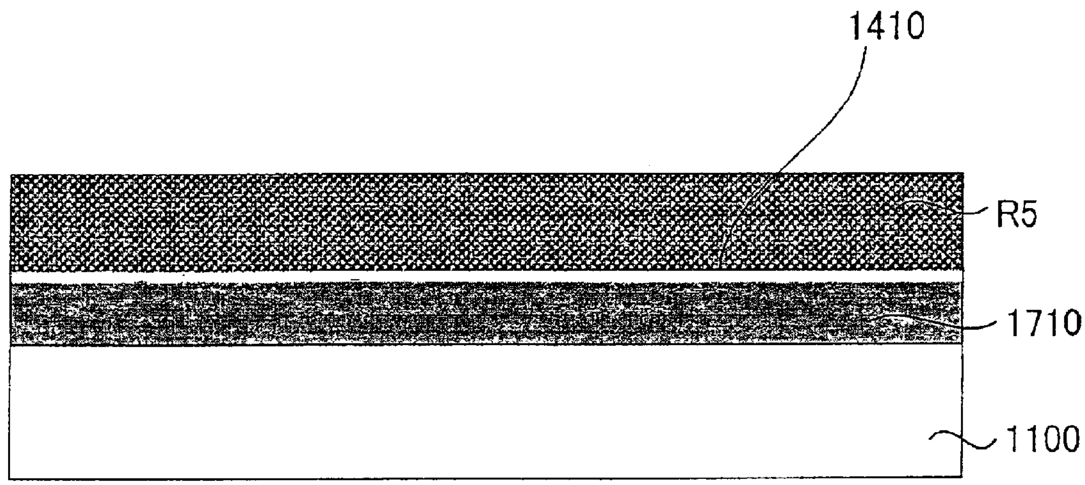
Figure 941:
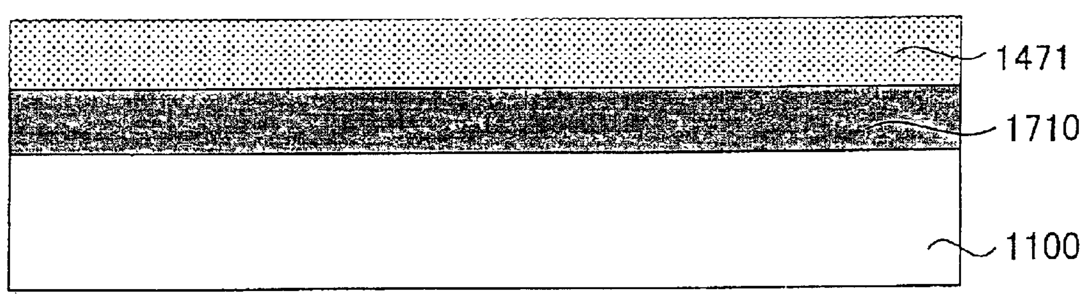
Figure 967:
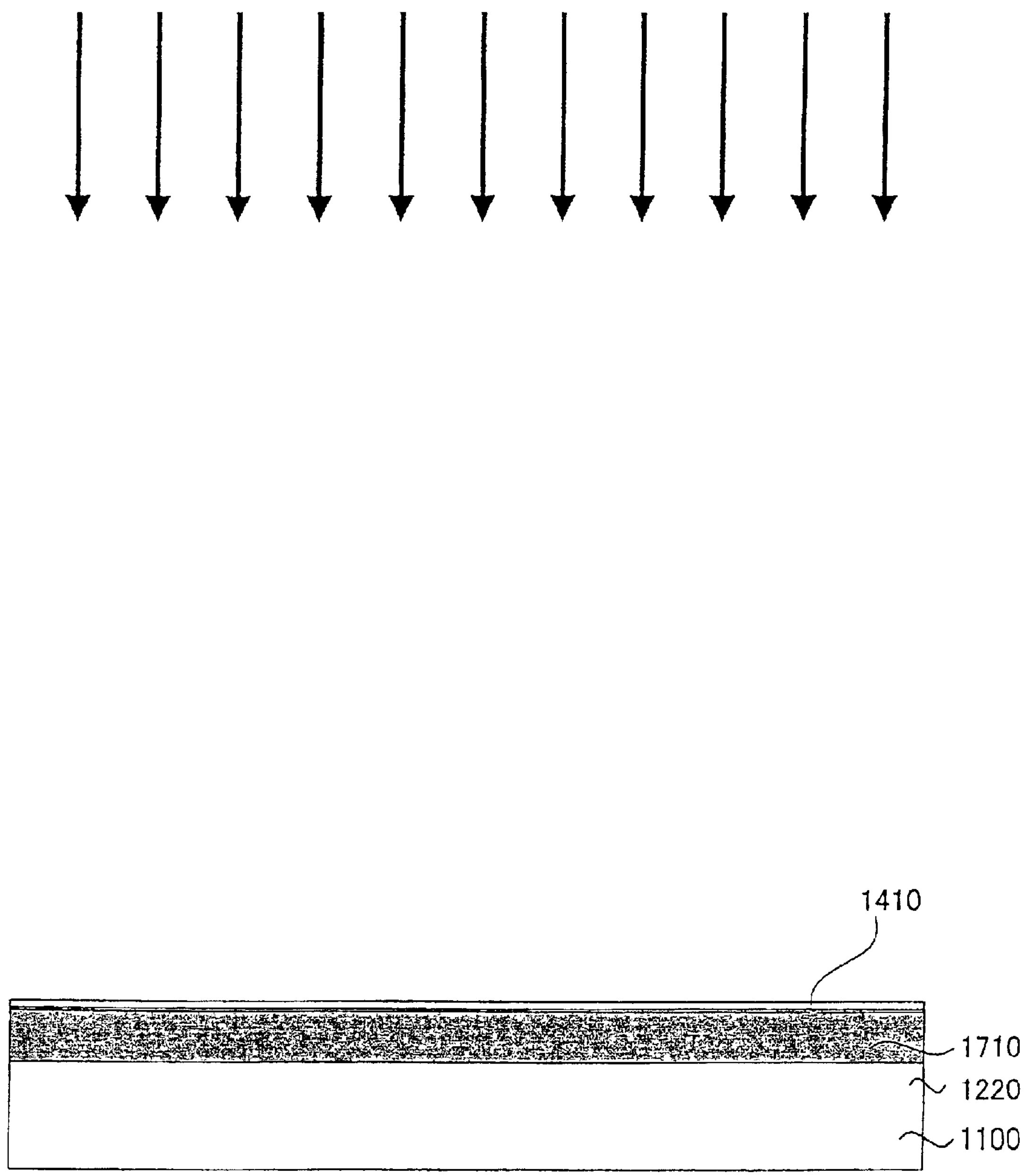
Figure 968:
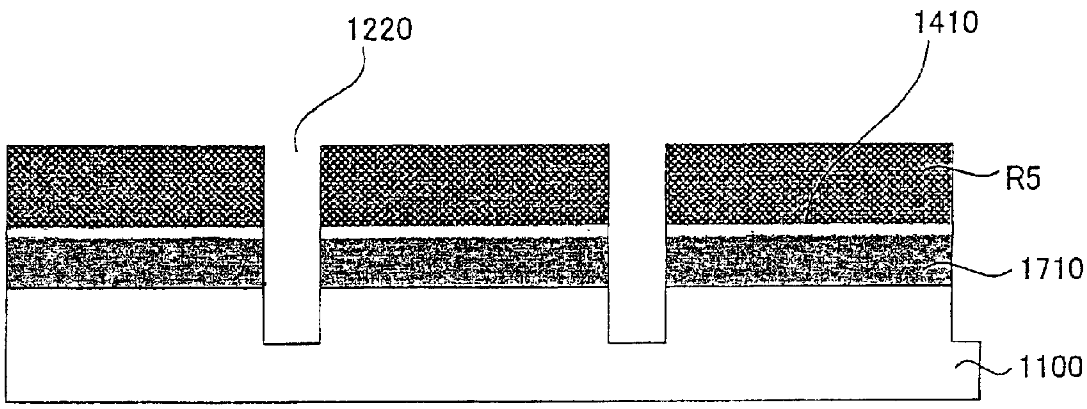
Figure 969:
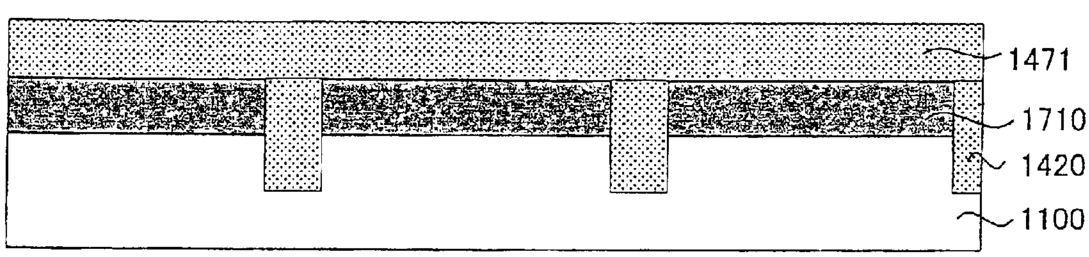

First, on the surface of a P-type silicon substrate 1100, a silicon oxide film 1410, for example, is deposited to 2 to 20 nm as a first insulating film to be an implantation protection film, and a first impurity diffusion layer 1710 is introduced into the p-type silicon substrate 1100 using ion implantation (FIG. 939 and FIG. 967). For example, the ion implantation may be performed at an implantation energy of 5 to 100 keV at an arsenic dose of about $1\times10^{14}$ to $1\times10^{16}/cm^2$ in a direction inclined about 0 to 7°. Instead of the ion implantation, an oxide film containing arsenic may be deposited by CVD, and arsenic diffusion from the oxide film may be utilized. The first impurity diffusion layer 1710 need not necessarily be introduced on the topmost surface of the P-type silicon substrate 1100.

Subsequently, using as a mask a resist film R5 patterned by a known photolithography technique (FIG. 940 and FIG. 968), the first insulating film 1410 and the P-type silicon substrate 1100 are etched 200 to 2000 nm, for example, by RIE so as to divide the first impurity diffusion layer 1710 to form a second trench 1220.

After the resist film R5 is removed (FIG. 941 and FIG. 969), a silicon oxide film 1420, for example, is deposited to 100 to 300 nm as a fifth insulating film in the second trench 1220 and etched back to be buried. Means for burying the silicon oxide film 1420 is not particularly limited, and the silicon oxide film 1420 may be etched back using isotropic etching, etched back using anisotropic etching, buried by flattening using CMP or by a combination of these means. The silicon oxide film 1420 may be a silicon nitride film. The silicon oxide film 1410 may be removed or may be retained.

Figure 942:
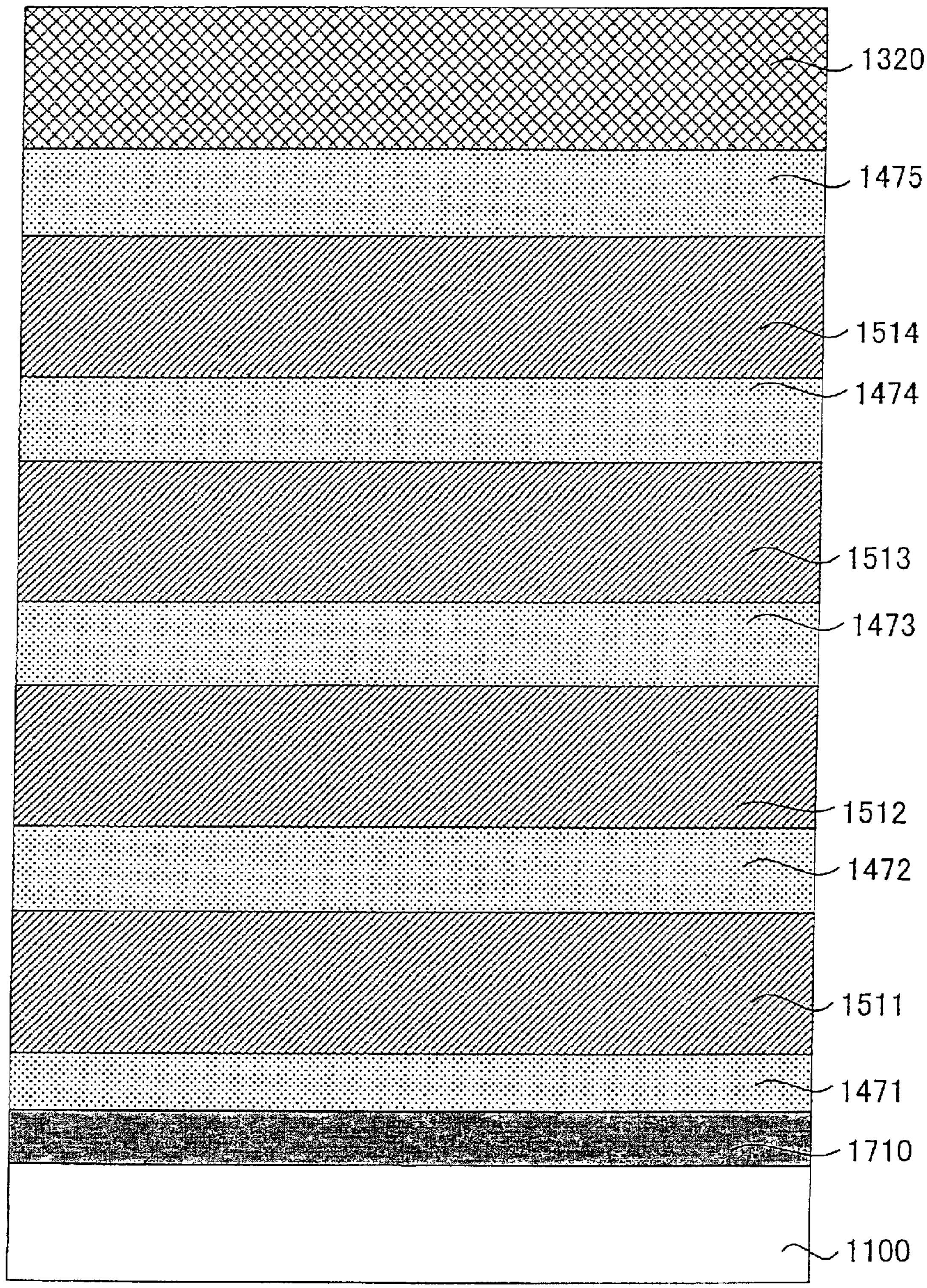
Figure 943:
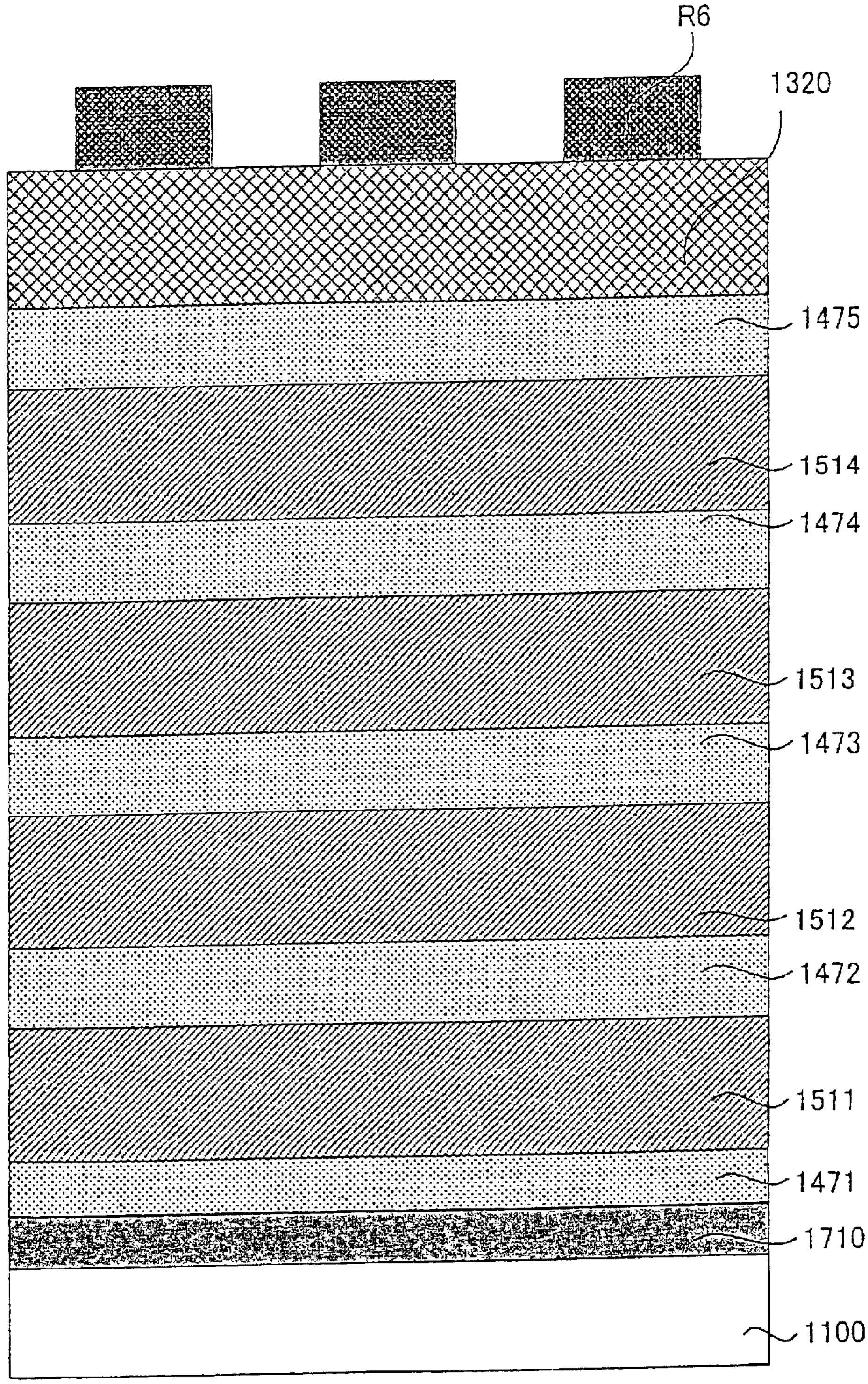
Figure 970:
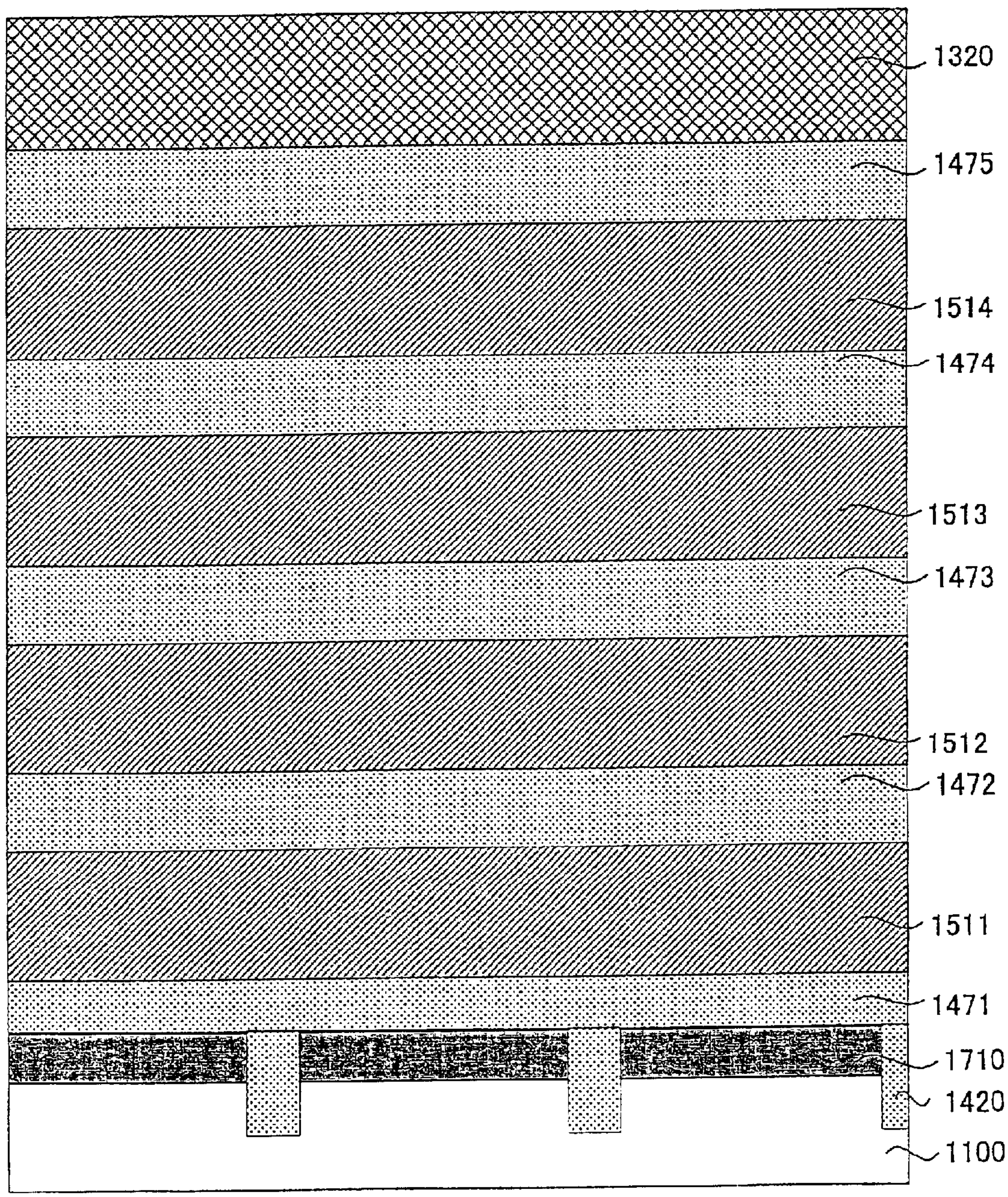
Figure 971:
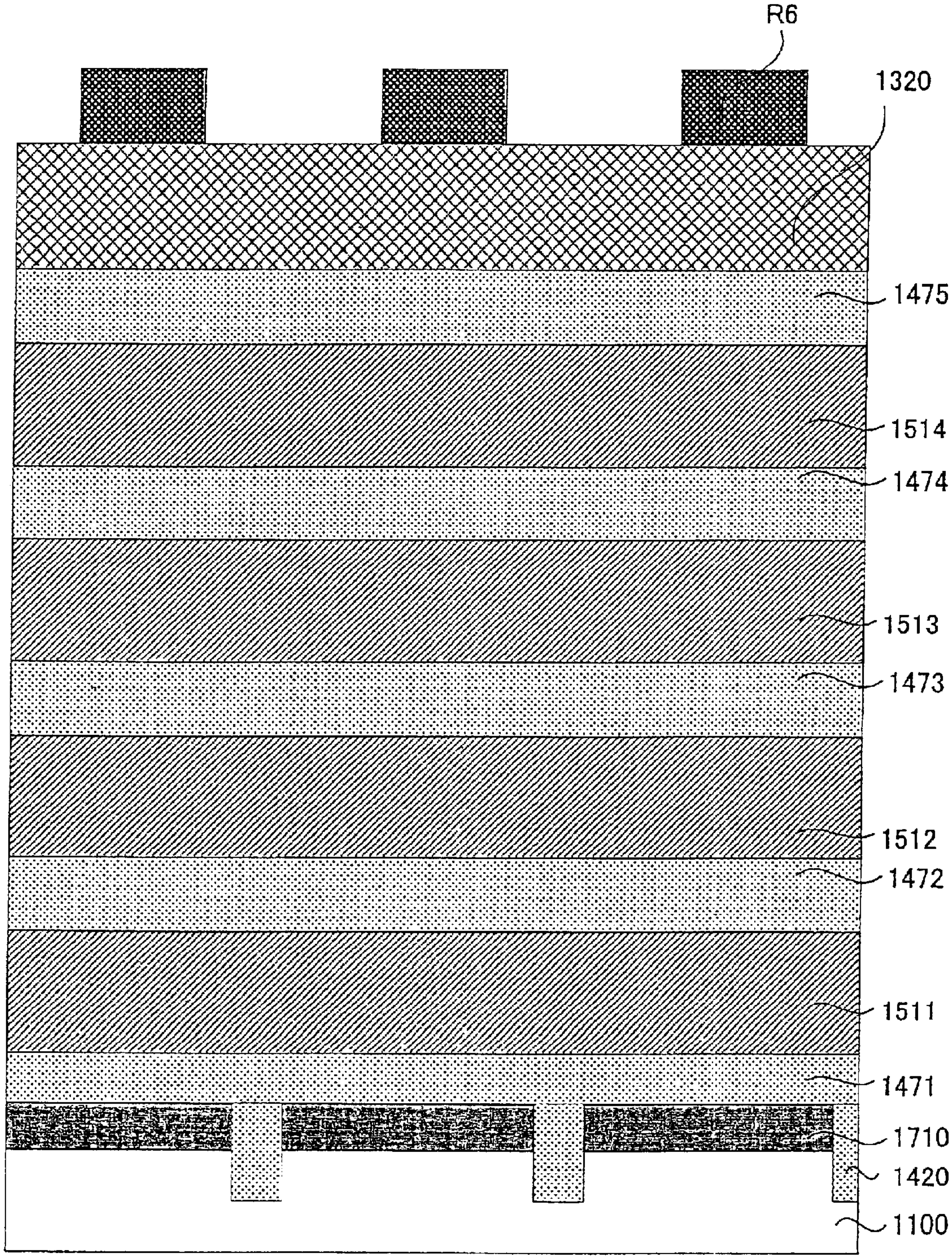

For example, in the case where the silicon oxide film 1410 is removed, a silicon oxide film 1471 is formed to 50 to 500 nm as a ninth insulating film on the P-type silicon substrate 1100 or on the first impurity diffusion layer 1710. Subsequently, a polysilicon film 1511 is deposited to 100 to 1000 nm as a first conductive film. Thus silicon oxide films 1471 to 1475 as ninth insulating films and polysilicon films 1511 to 1514 as first conductive films are formed sequentially and alternately. On the silicon oxide film 1475, a silicon nitride film 1320 is deposited to 100 to 1000 nm as a tenth insulating film (FIG. 942 and FIG. 970). At this time, the silicon oxide films 1471 to 1475 may have different thicknesses or may have the same thickness. The first conductive films 1511 to 1514 may have different thicknesses or may have the same thickness.

Figure 944:
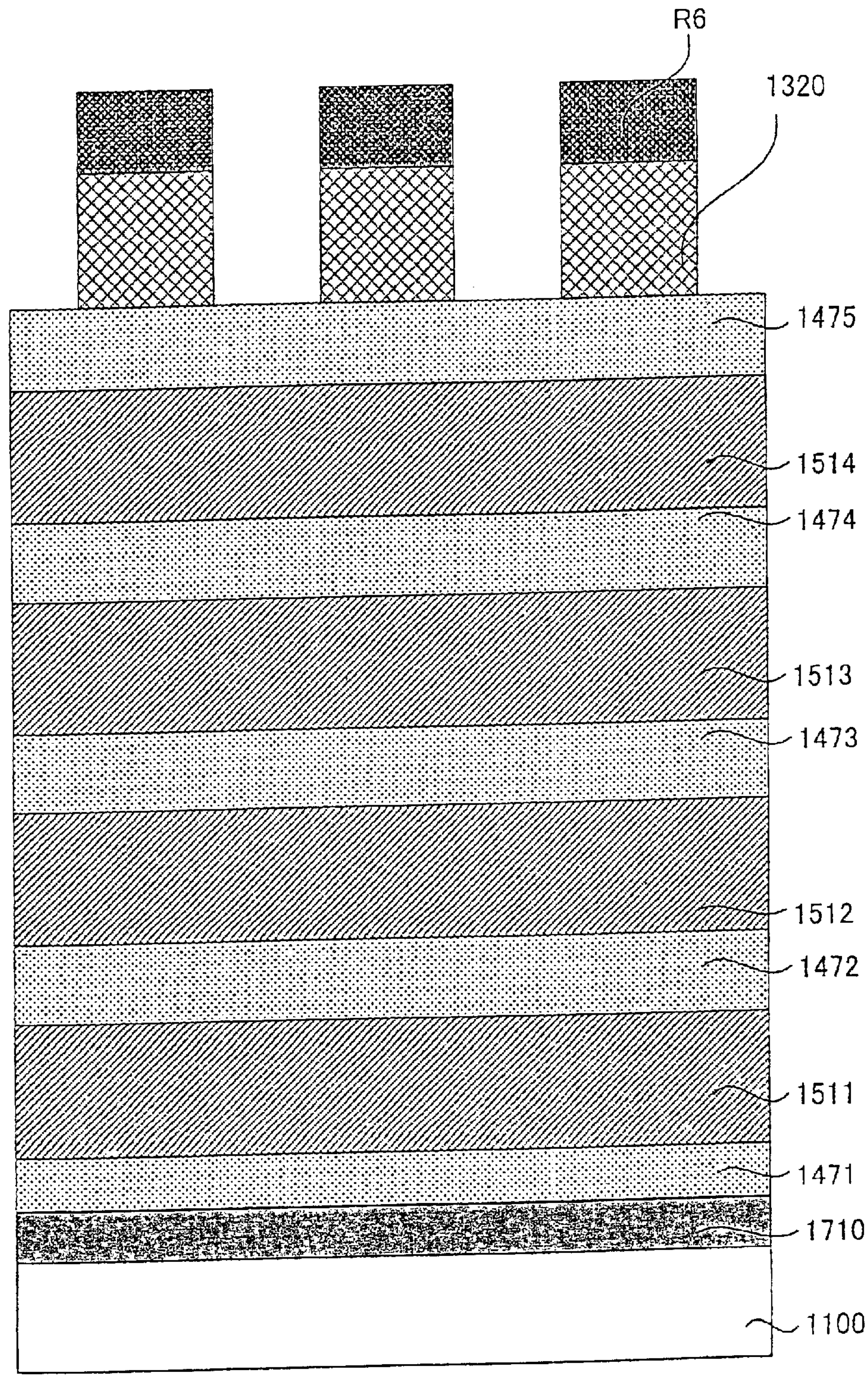
Figure 972:
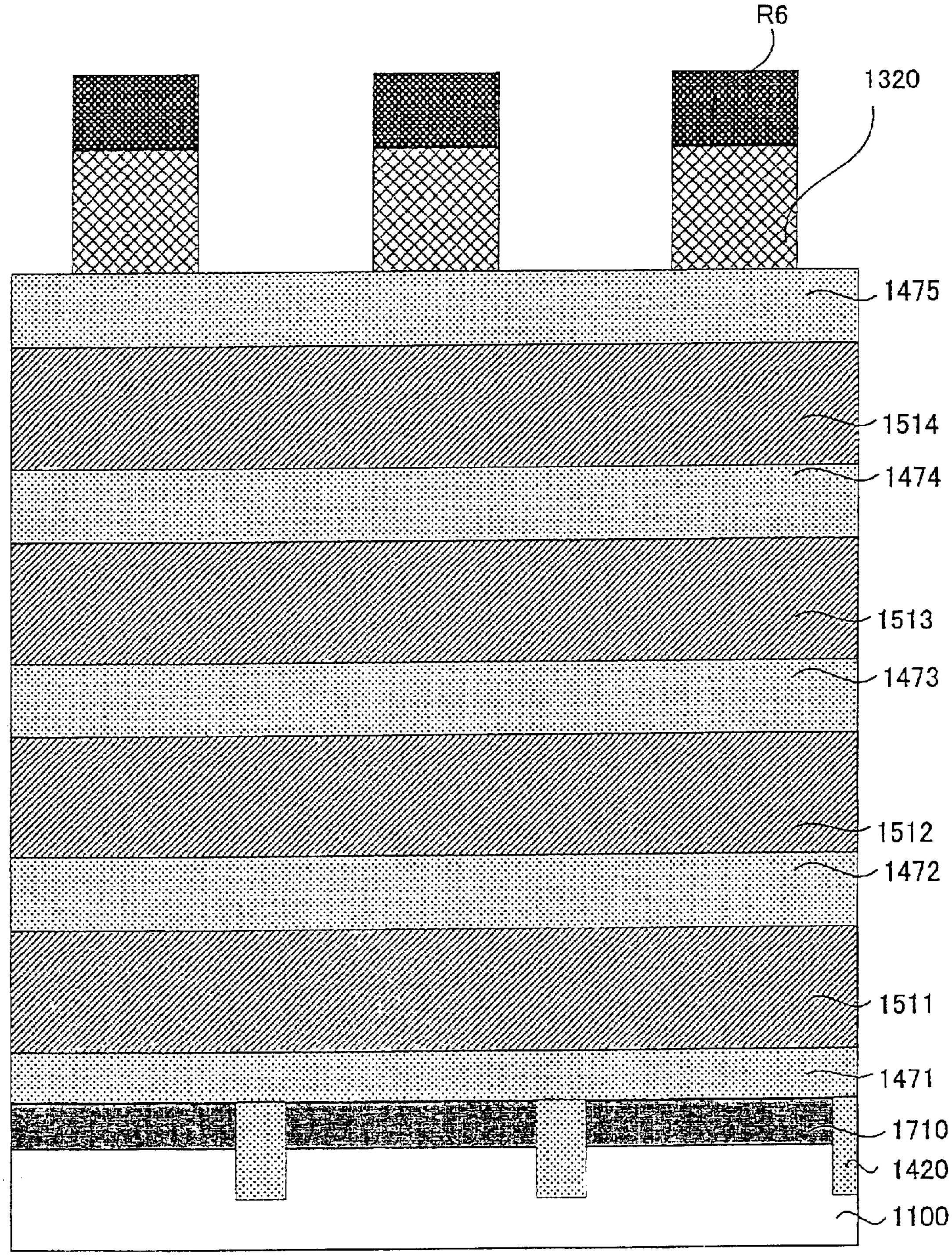

Thereafter, using as a mask a resist film R6 patterned by a known photolithography technique (FIG. 943 and FIG. 971), the silicon nitride film 1320 is patterned, for example, by RIE (FIG. 944 and FIG. 972).

Figure 945:
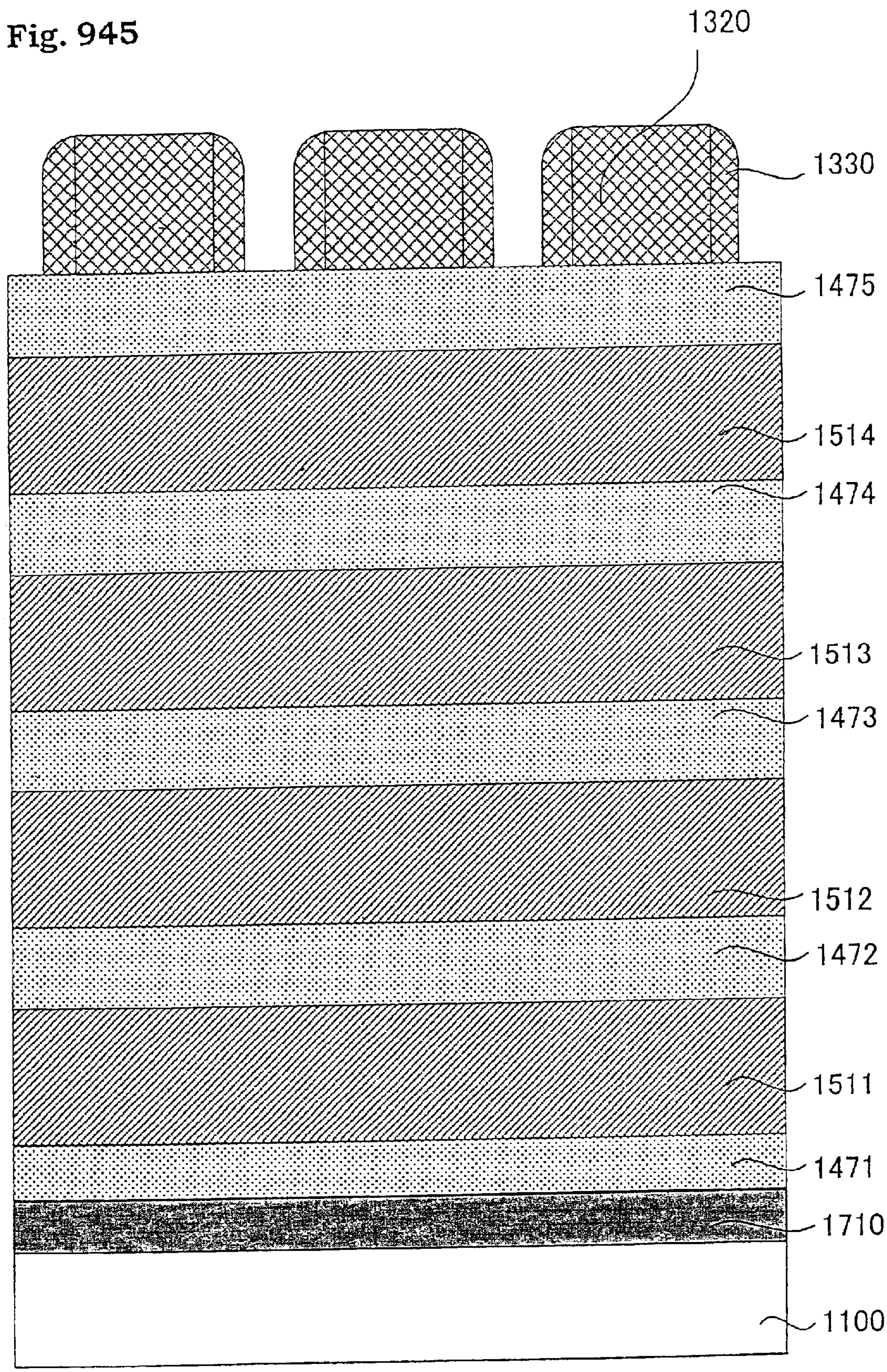
Figure 946:
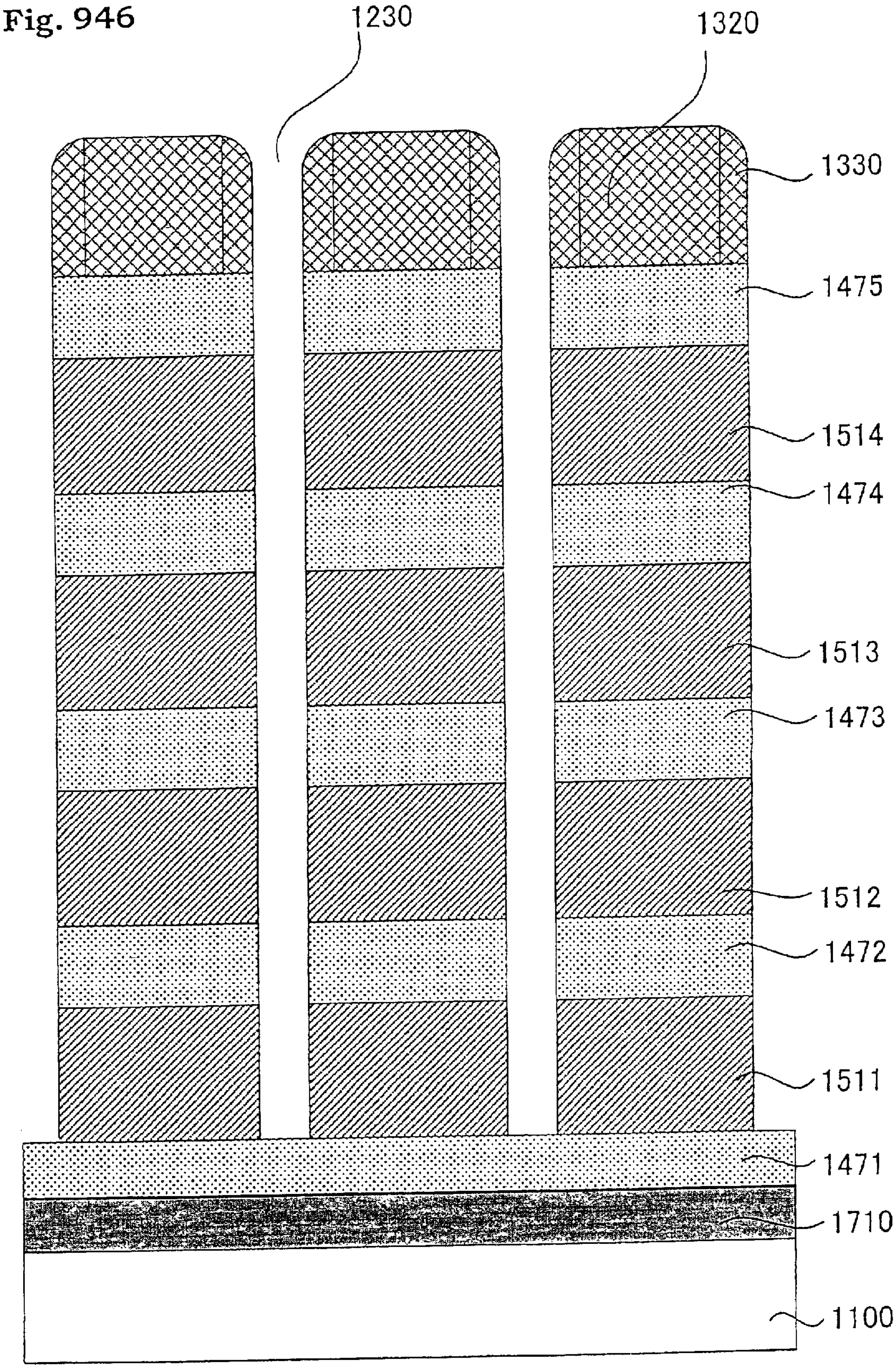
Figure 973:
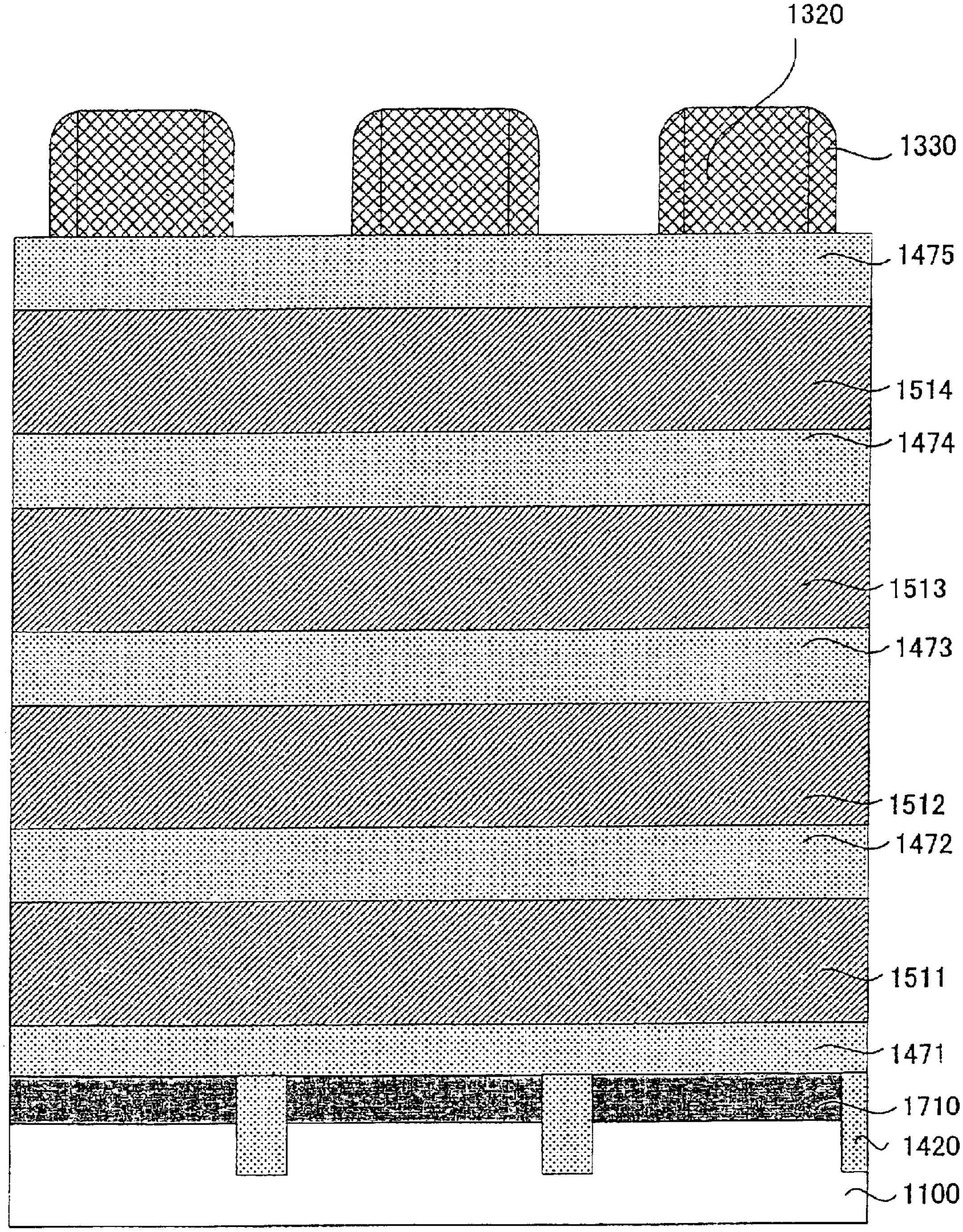
Figure 974:
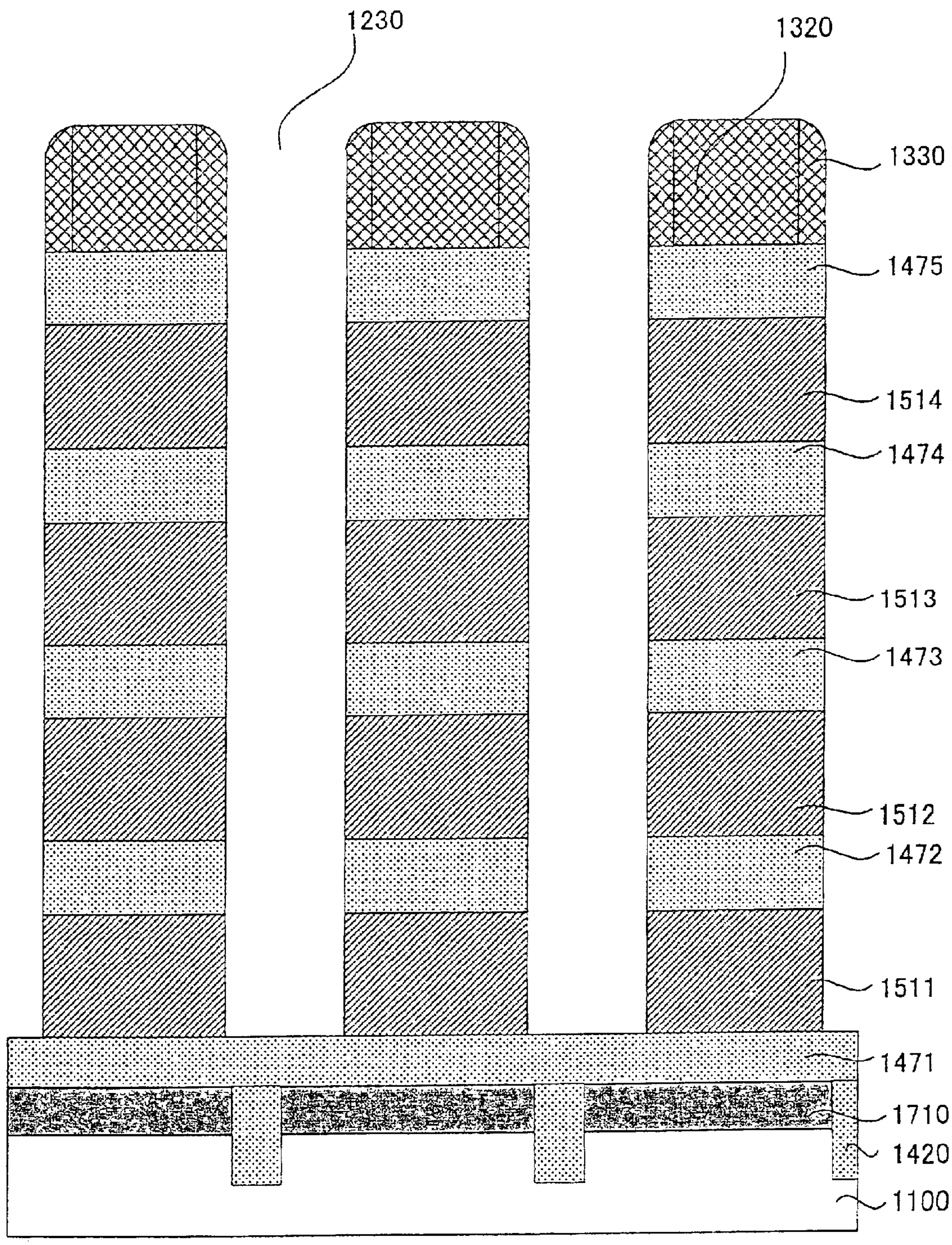

Subsequently, a silicon nitride film 1330, for example, is formed in the form of a sidewall as an eleventh insulating film on the sidewall of the silicon nitride film 1320 (FIG. 945 and FIG. 973). Using the silicon nitride film 1320 and the silicon nitride film 1330 as a mask, the silicon oxide films 1472 to 1475 and the polysilicon films 1511 to 1514 are anisotropically etched sequentially (FIG. 946 and FIG. 974) until the time when the first conductive film 1511 is removed, i.e., until the ninth insulating film 1472 is exposed, to form a third trench 1230.

Figure 947:
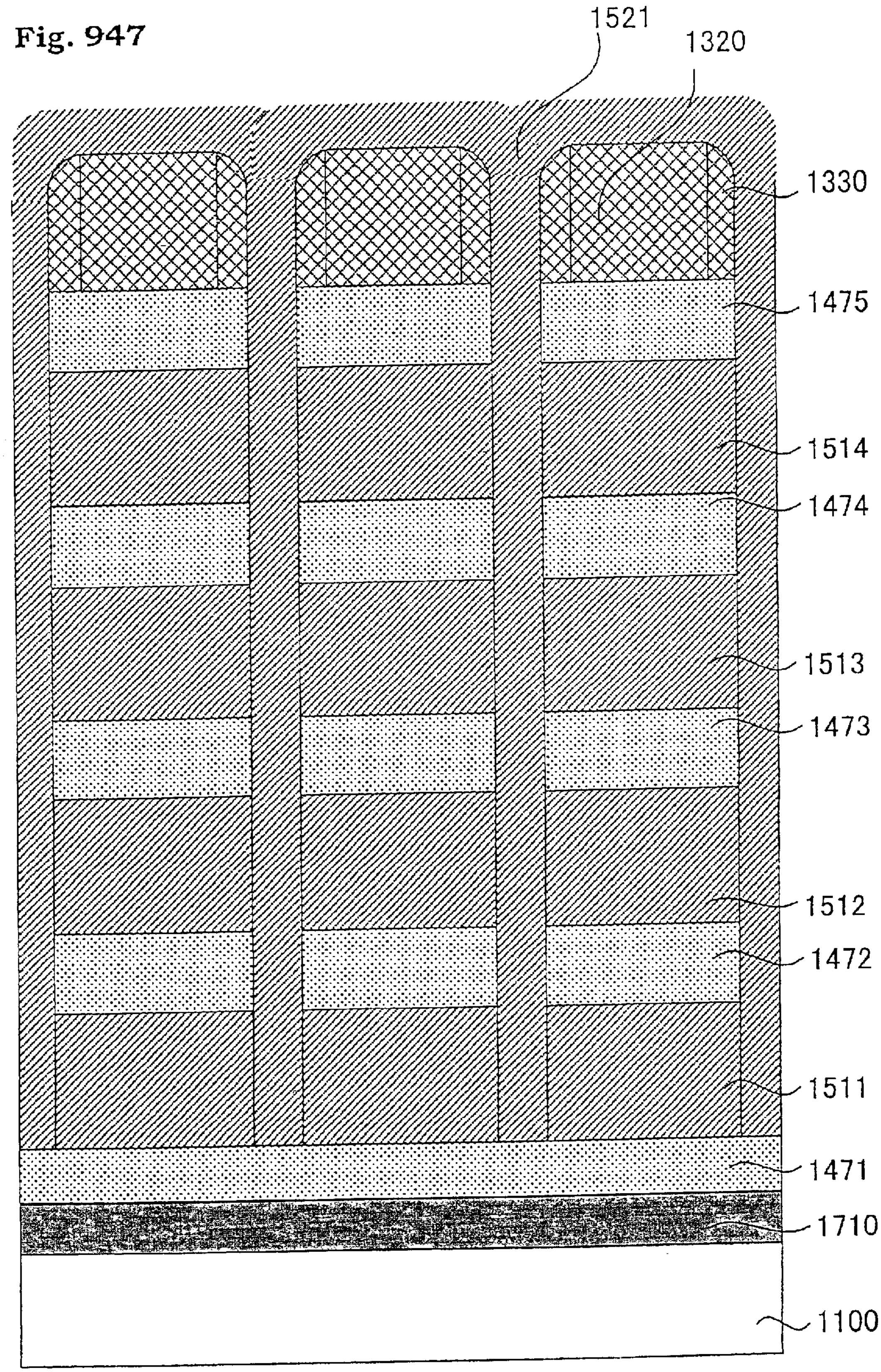
Figure 975:
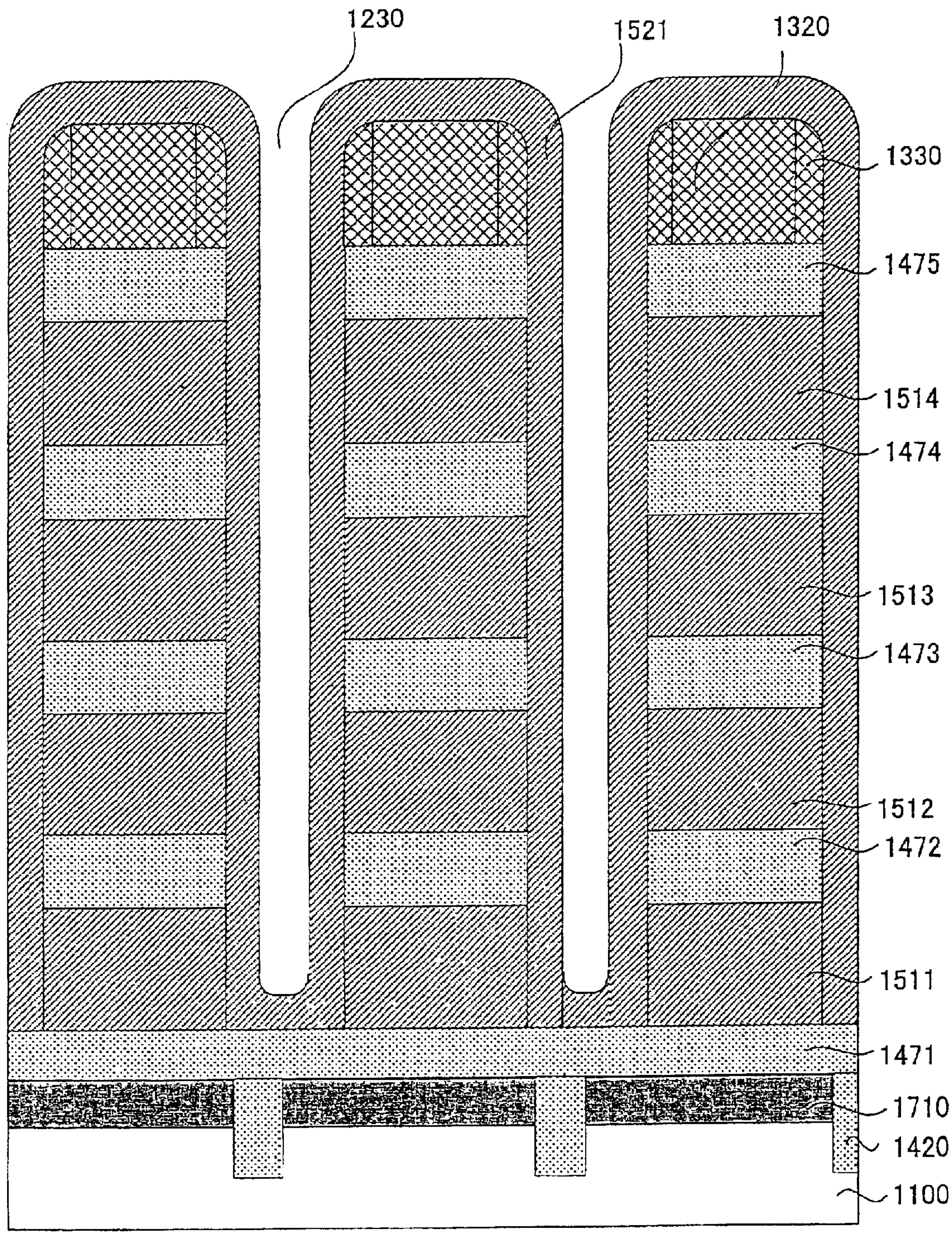

Subsequently, a polysilicon film 1521, for example, is deposited to 20 to 200 nm as a second conductive film (FIG. 947 and FIG. 975).

Figure 948:
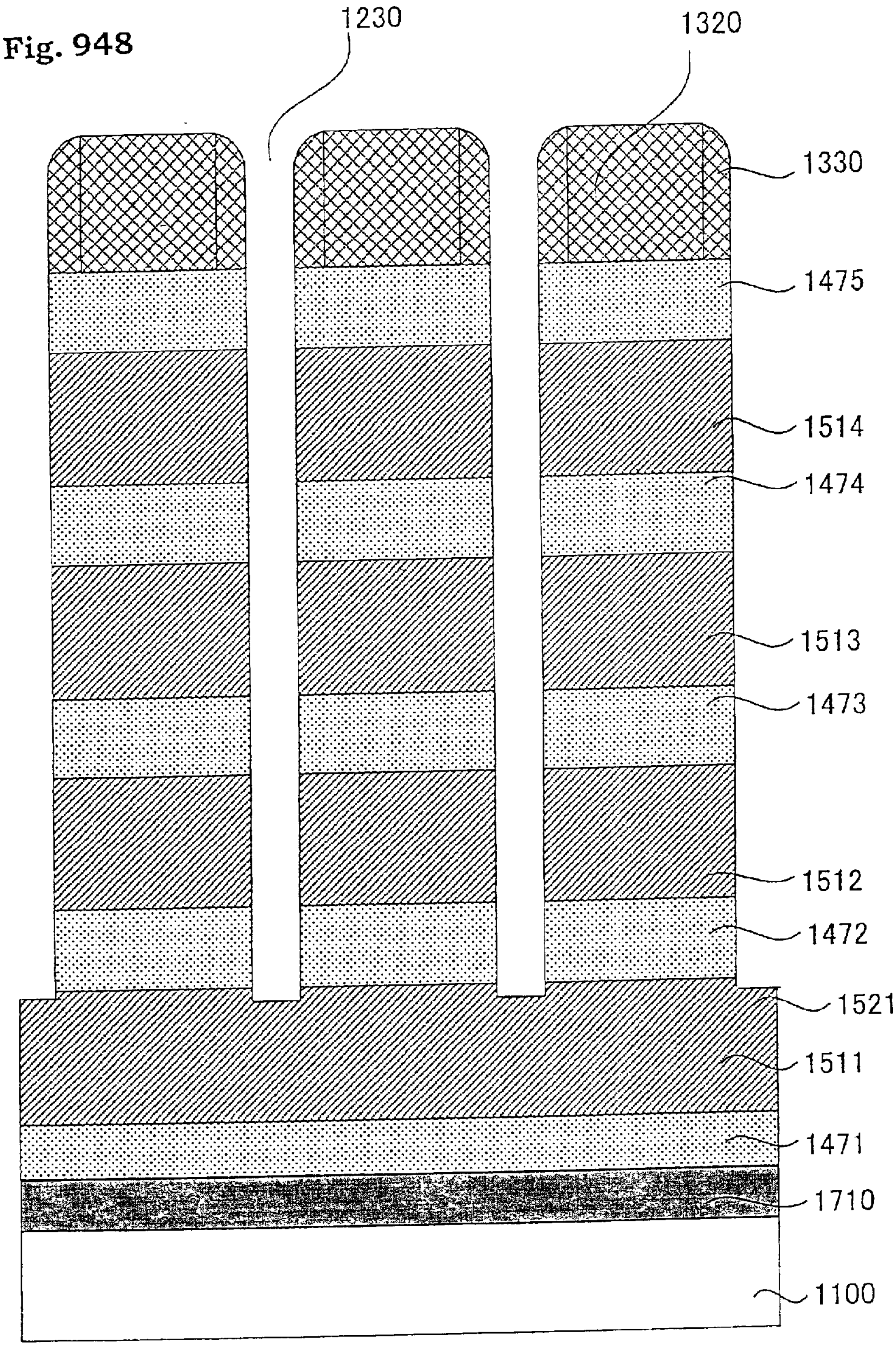
Figure 976:
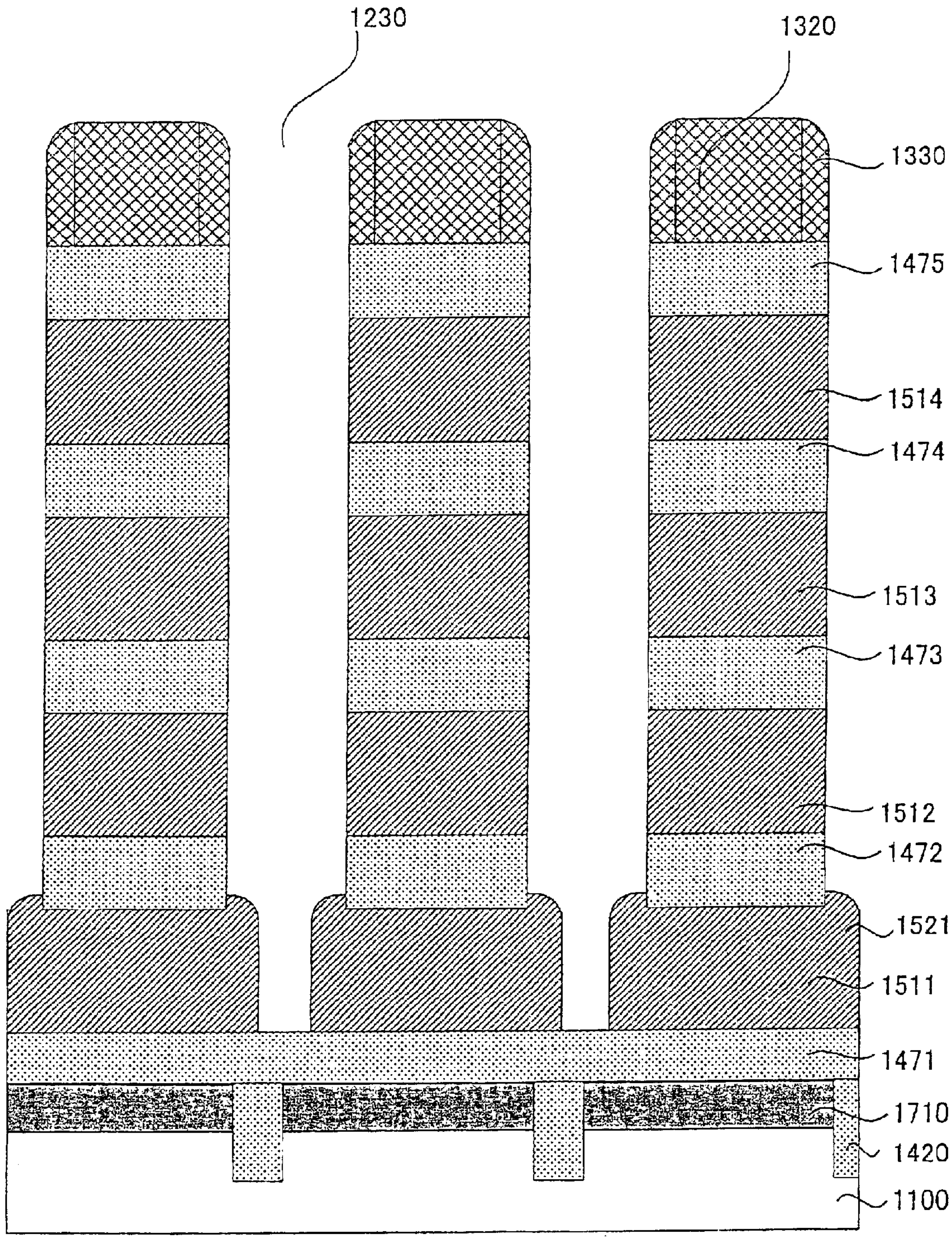

Next, the polysilicon film 1521 is etched back to form a sidewall on the sidewall of the polysilicon film 1511 (FIG. 948 and FIG. 976). At this time, the polysilicon film 1521 is formed as a second wiring layer to be a selection gate line continuous in the direction without using a masking process.

Figure 949:
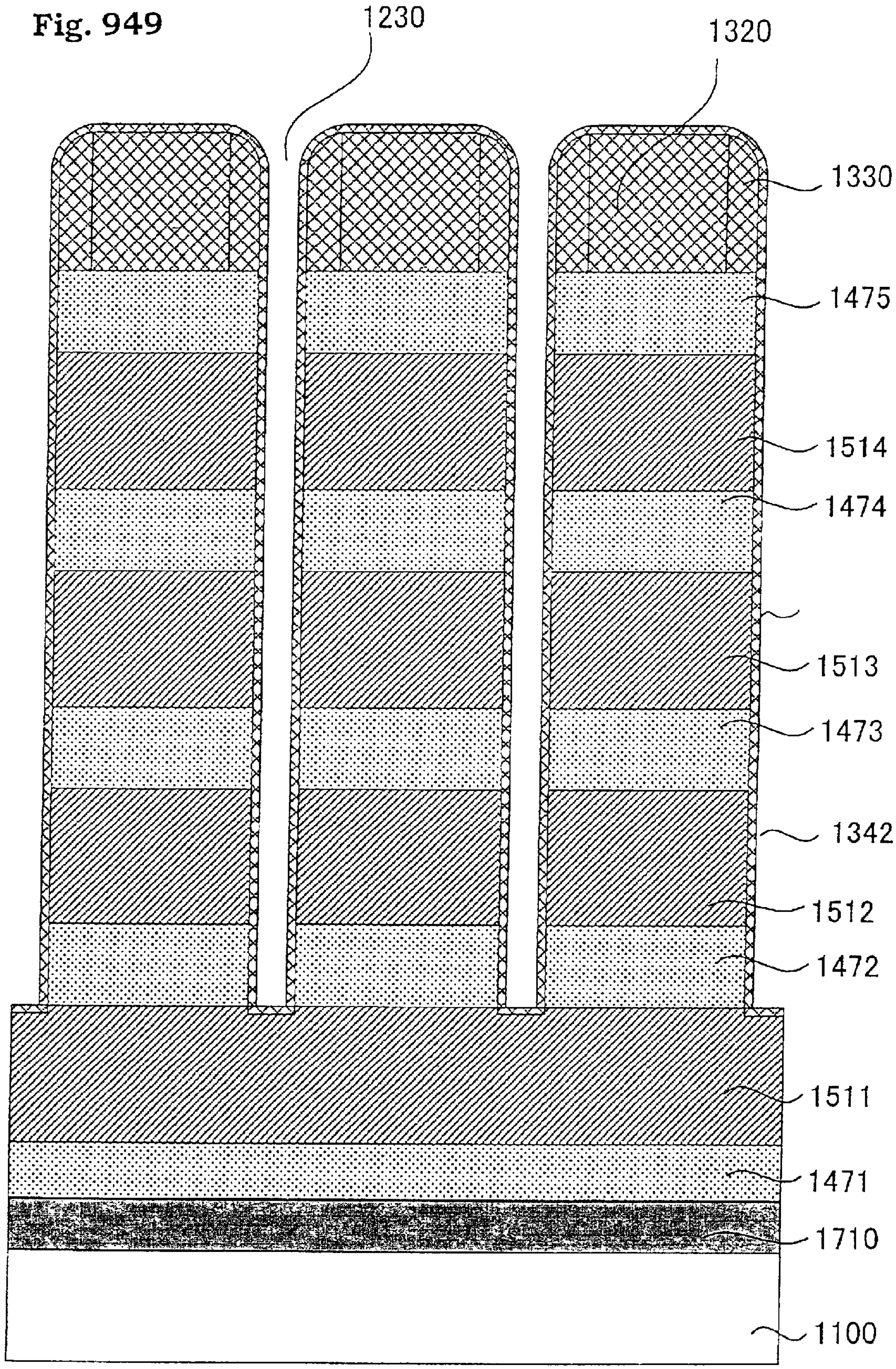
Figure 950:
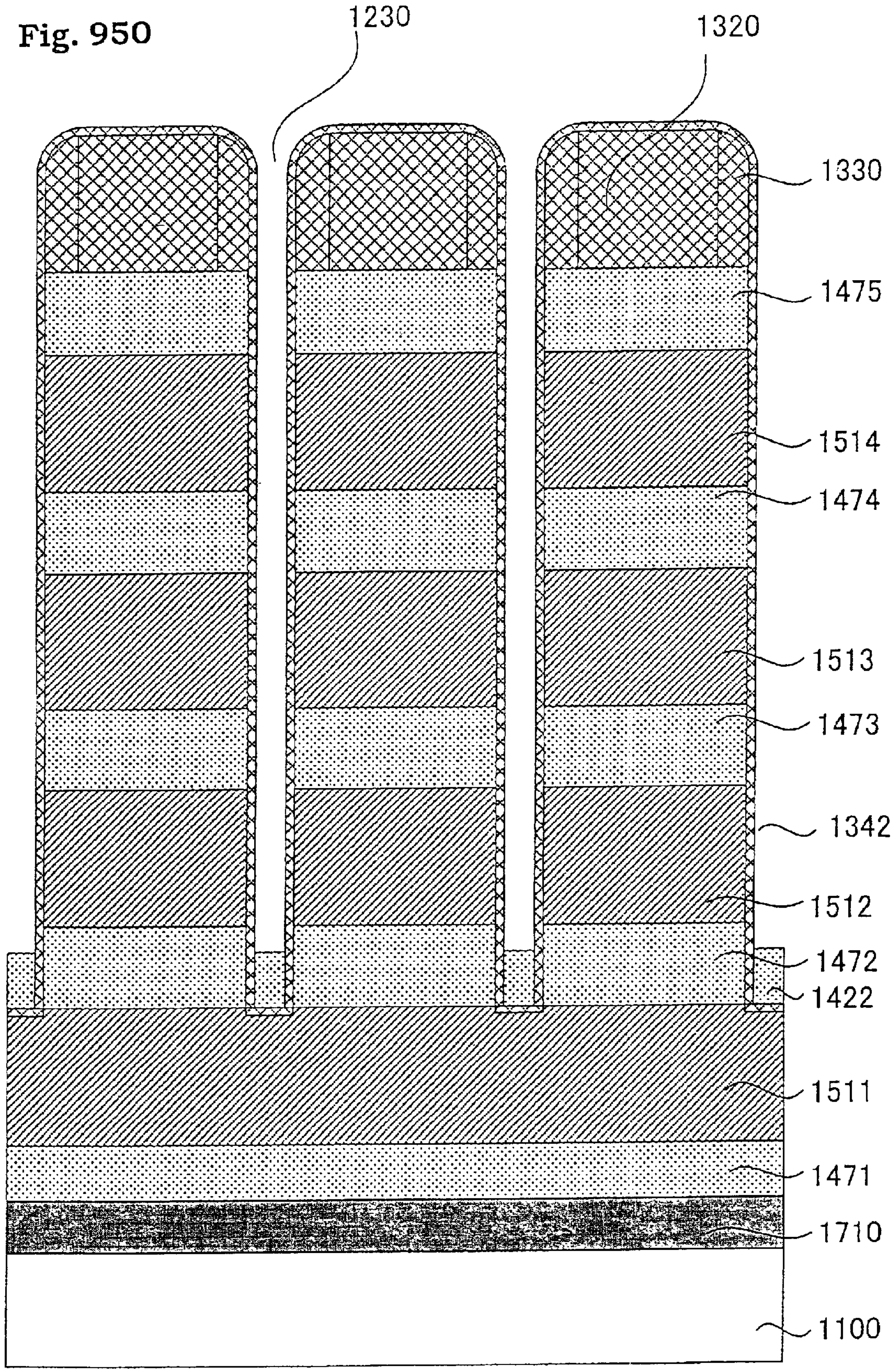
Figure 977:
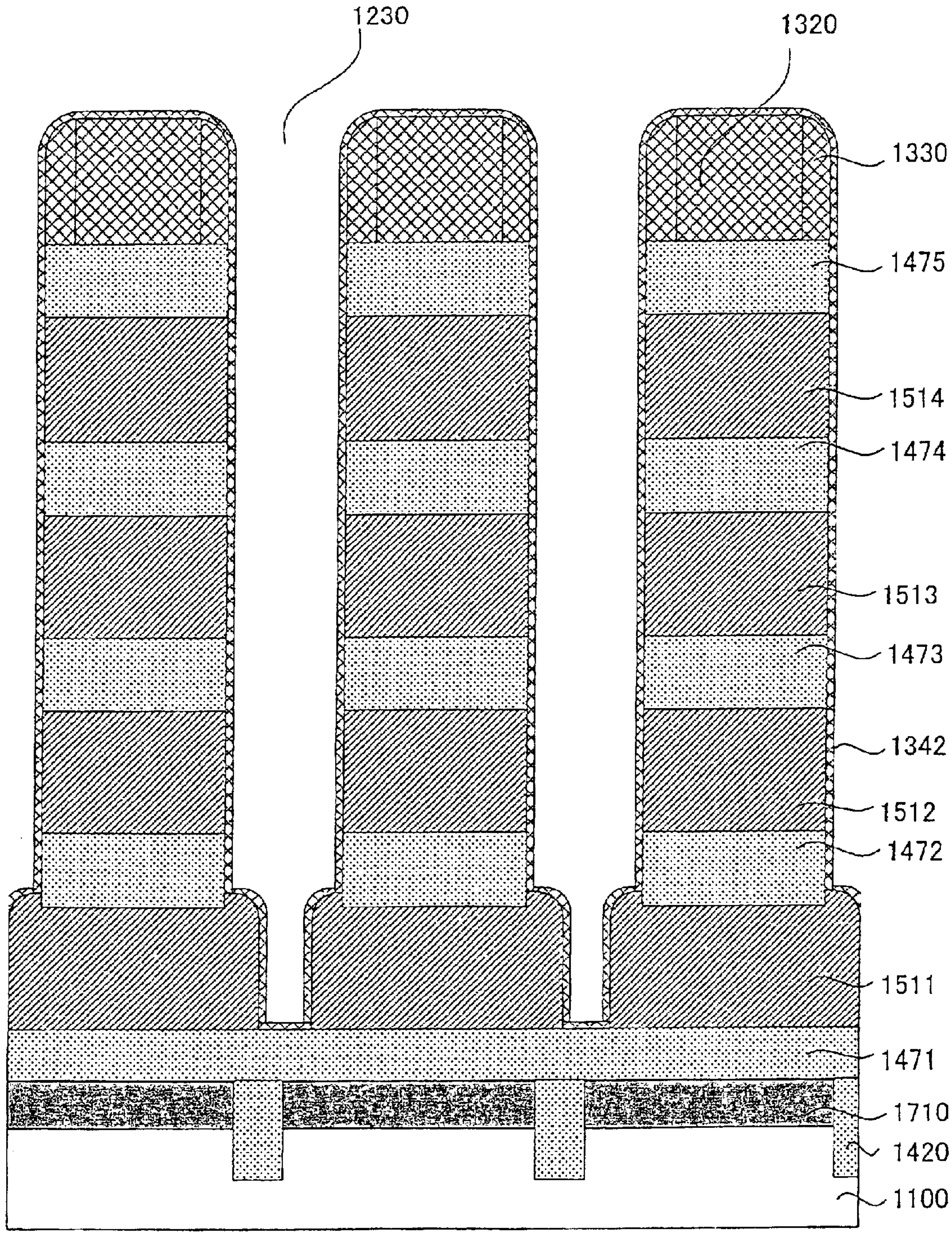
Figure 978:
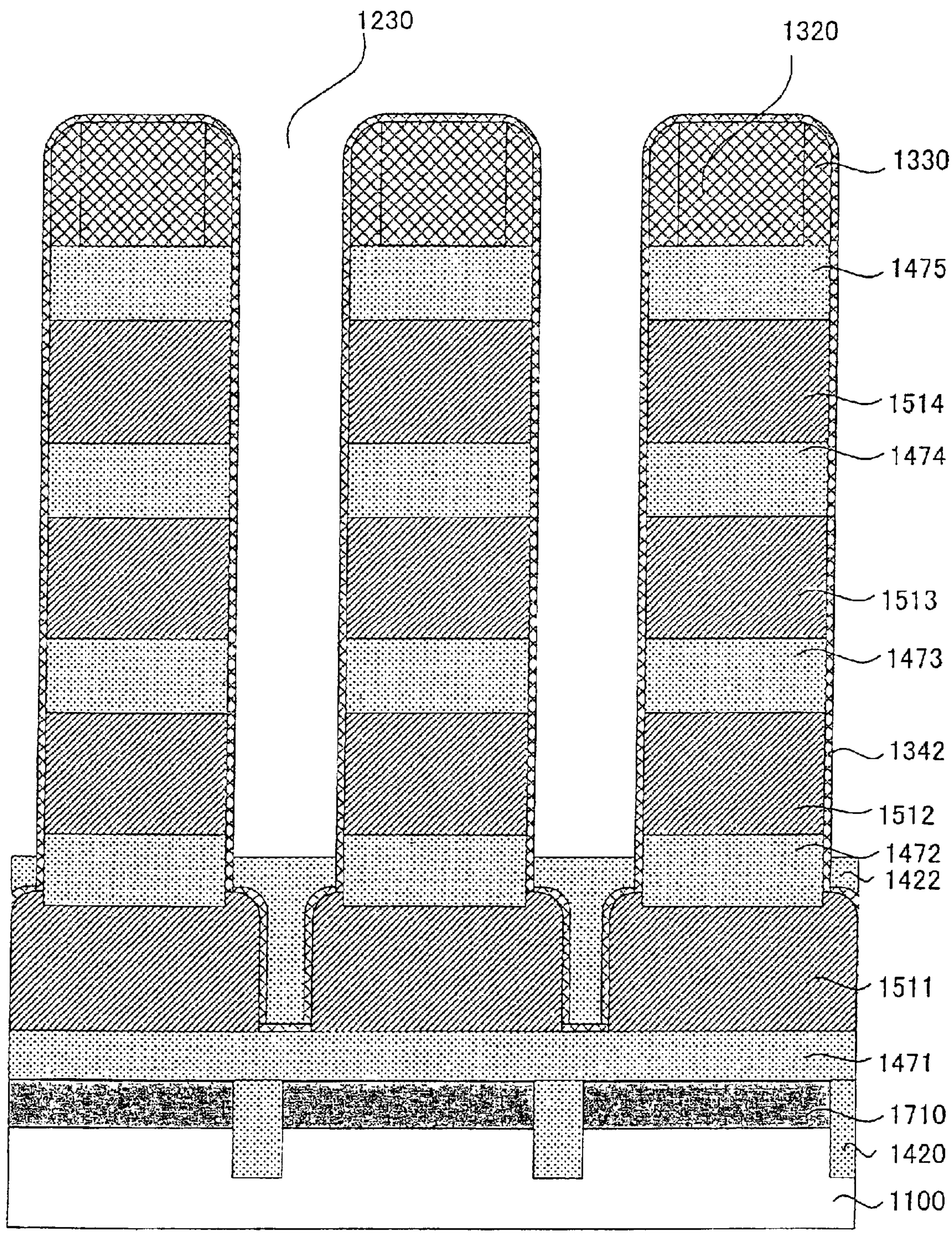

Thereafter, a silicon nitride film 1342, for example, is deposited to 2 to 20 nm as a twelfth insulating film on the sidewall of the third trench 1230(FIG. 949 and FIG. 977).

Subsequently, a silicon oxide film 1422, for example, is deposited to 50 to 500 nm as a fifth insulating film in the third trench 1230. Next, the silicon oxide film 1422 is buried by isotropic etching so as to remain only on the sidewall of the silicon oxide film 1472 in the third trench 1230 (FIG. 950 and FIG. 978), and then, the silicon nitride film 1342 is selectively removed, for example, by isotropic etching.

Figure 951:
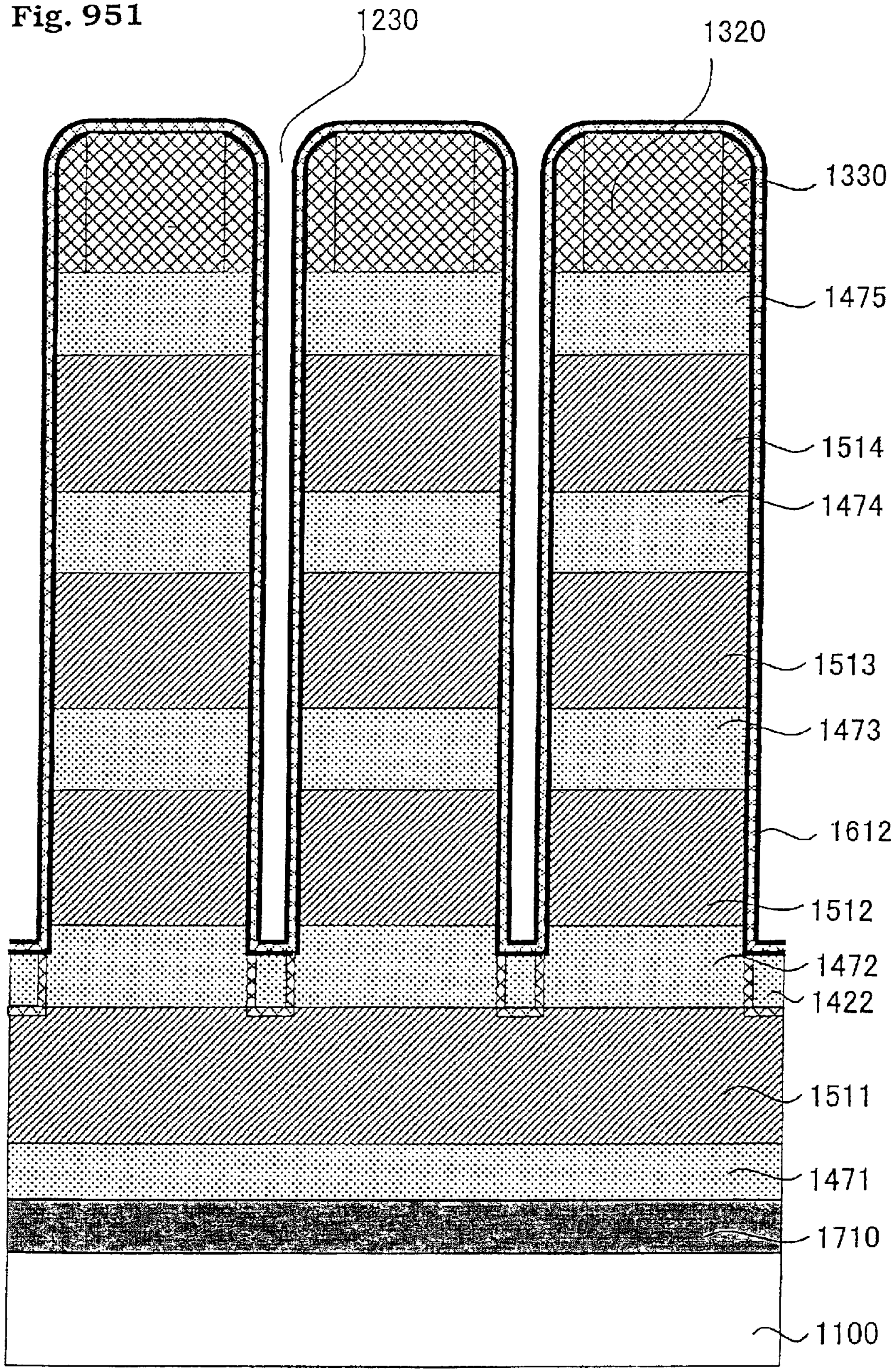
Figure 952:
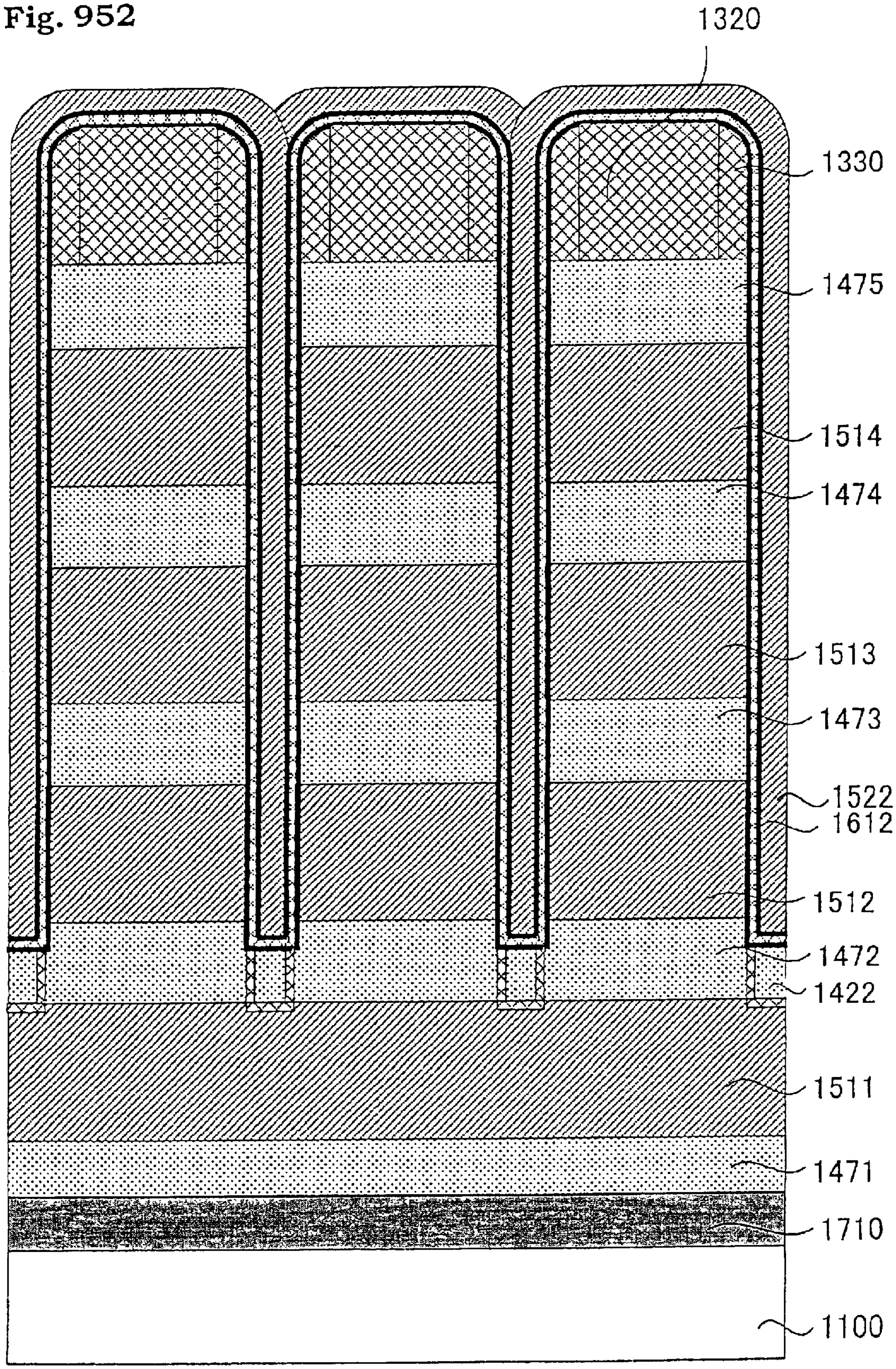
Figure 979:
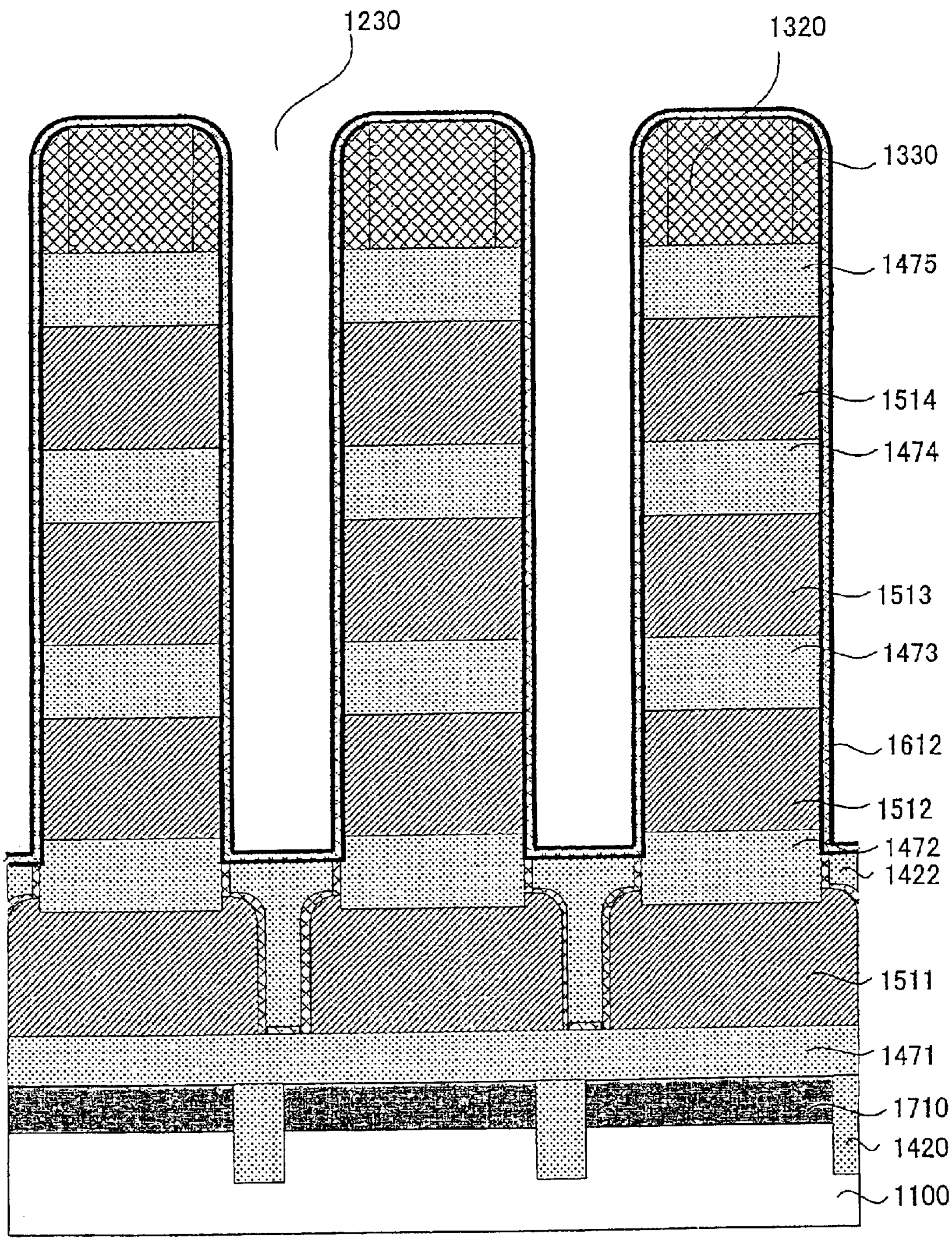
Figure 980:
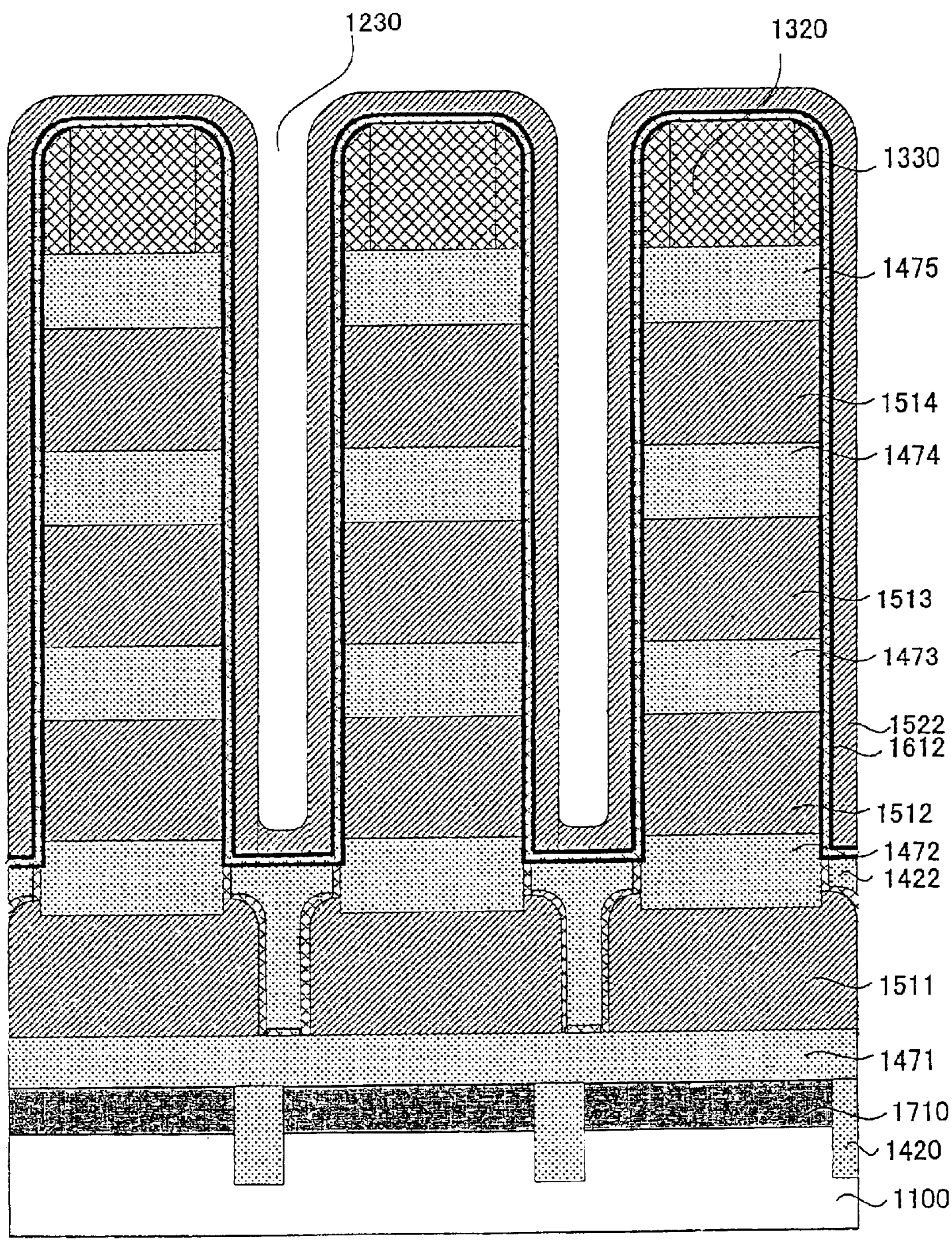

Further, an interlayer insulating film 1612 is formed on the surface of the third trench 1230 and the polysilicon films 1512 to 1514 (FIG. 951 and FIG. 979). This interlayer insulating film 1612 is formed of an ONO film. The ONO film can be formed in the same manner as Production example 1.

Figure 953:
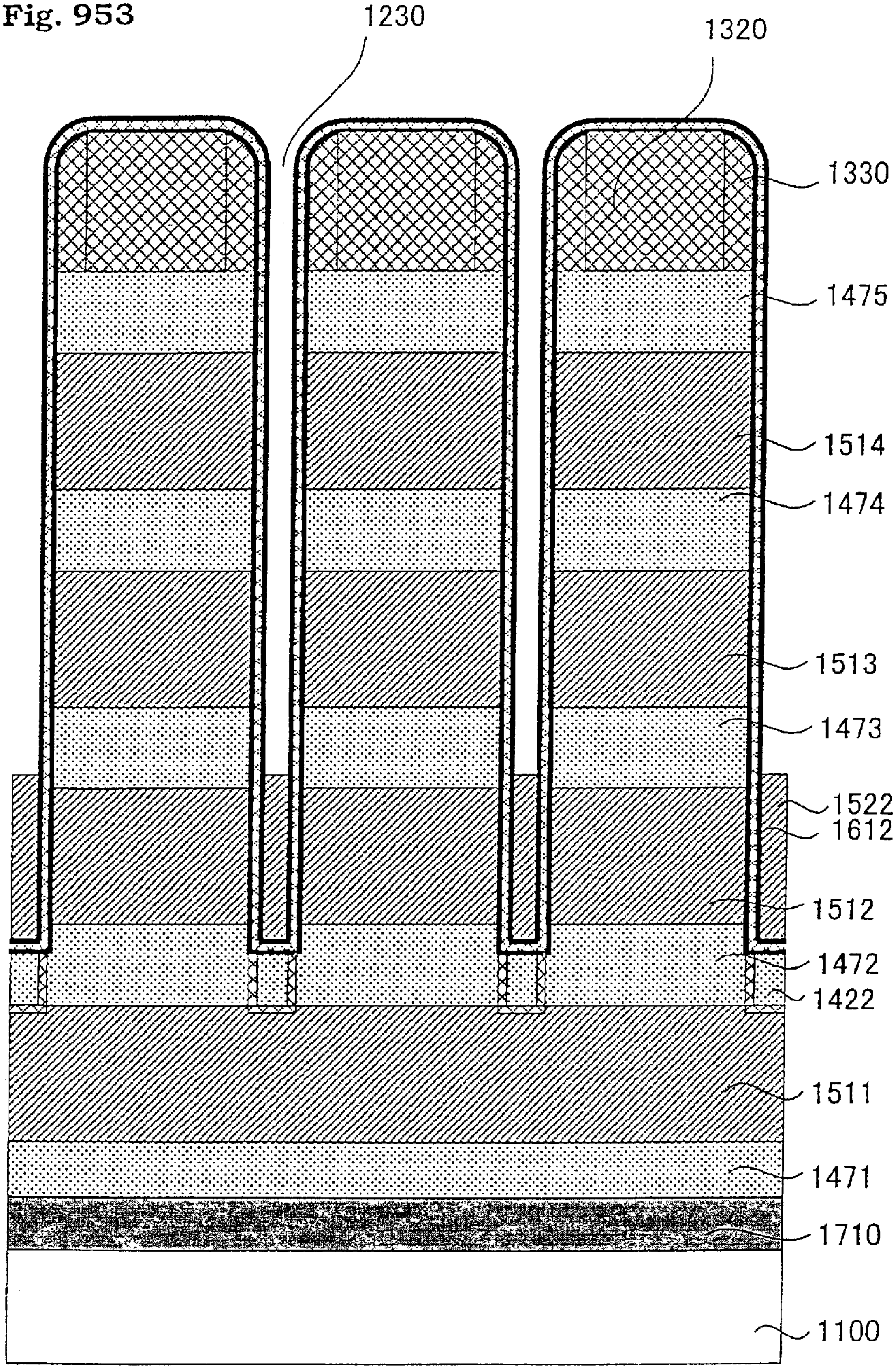
Figure 954:
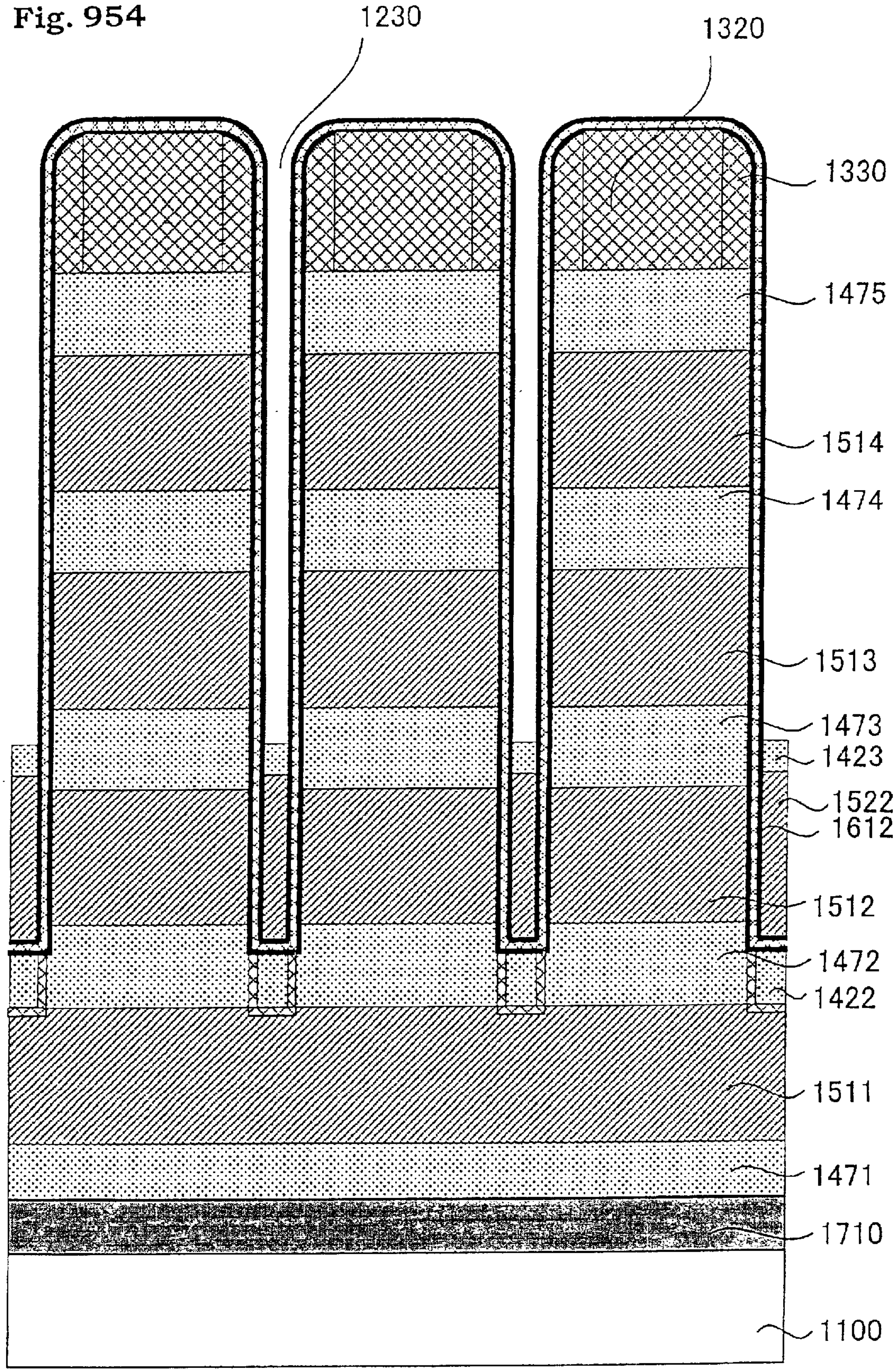
Figure 981:
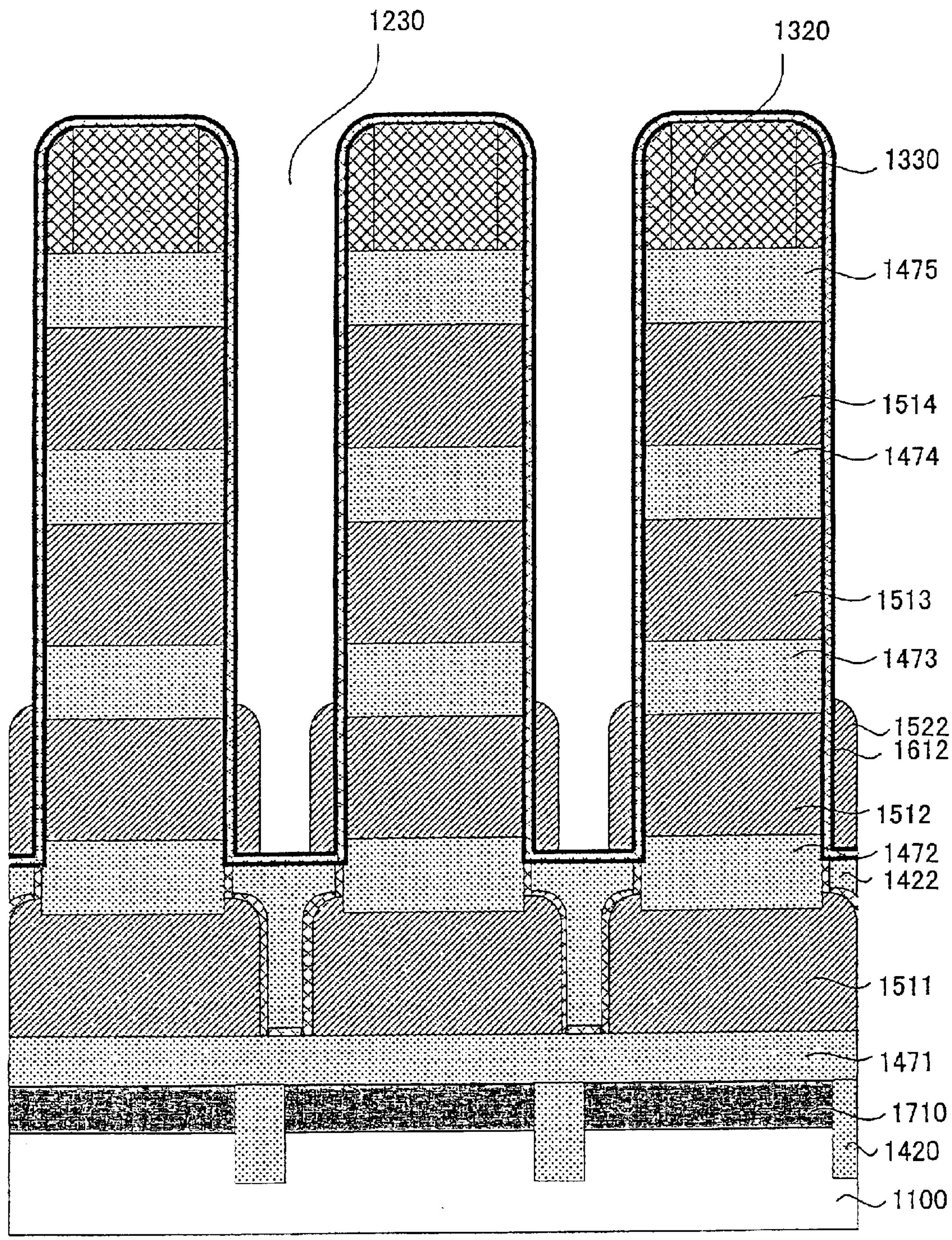
Figure 982:
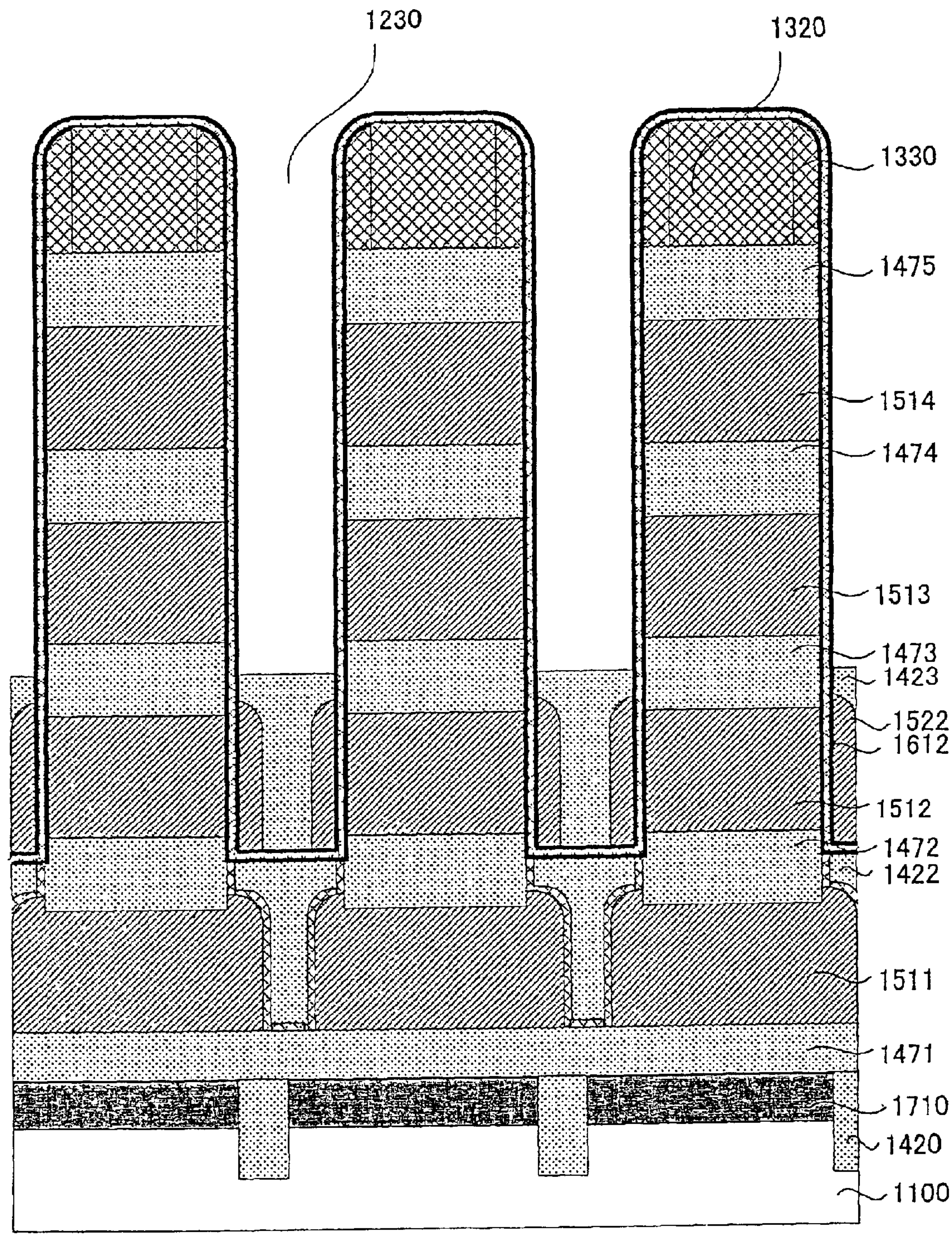

Subsequently, in the same manner as described above, a polysilicon film 1522 is deposited to 15 to 150 nm as a second conductive film (FIG. 952 and FIG. 980) and etched back to form a sidewall on the sidewall of the polysilicon film 1512 (FIG. 953 and FIG. 981). At this time, by setting the intervals between the third trenches 1230 to a predetermined value or smaller in the A-A' direction in FIG. 1, the polysilicon film 1522 is formed as a third wiring layer to be a control gate line continuous in the direction without using a masking process.

Thereafter, by repeating the above production steps, a silicon oxide film 1423, for example, is buried as fifth insulating film in the third trench 1230 so as to remain only on the side of a silicon oxide film 1473 as a ninth insulating film (FIG. 954 and FIG. 982), and then, the interlayer insulating film 1612 is selectively removed by isotropic etching.

Subsequently, an interlayer insulating film 1613 is formed on the surface of the third trench 1230 and the polysilicon films 1513 and 1514.

Figure 955:
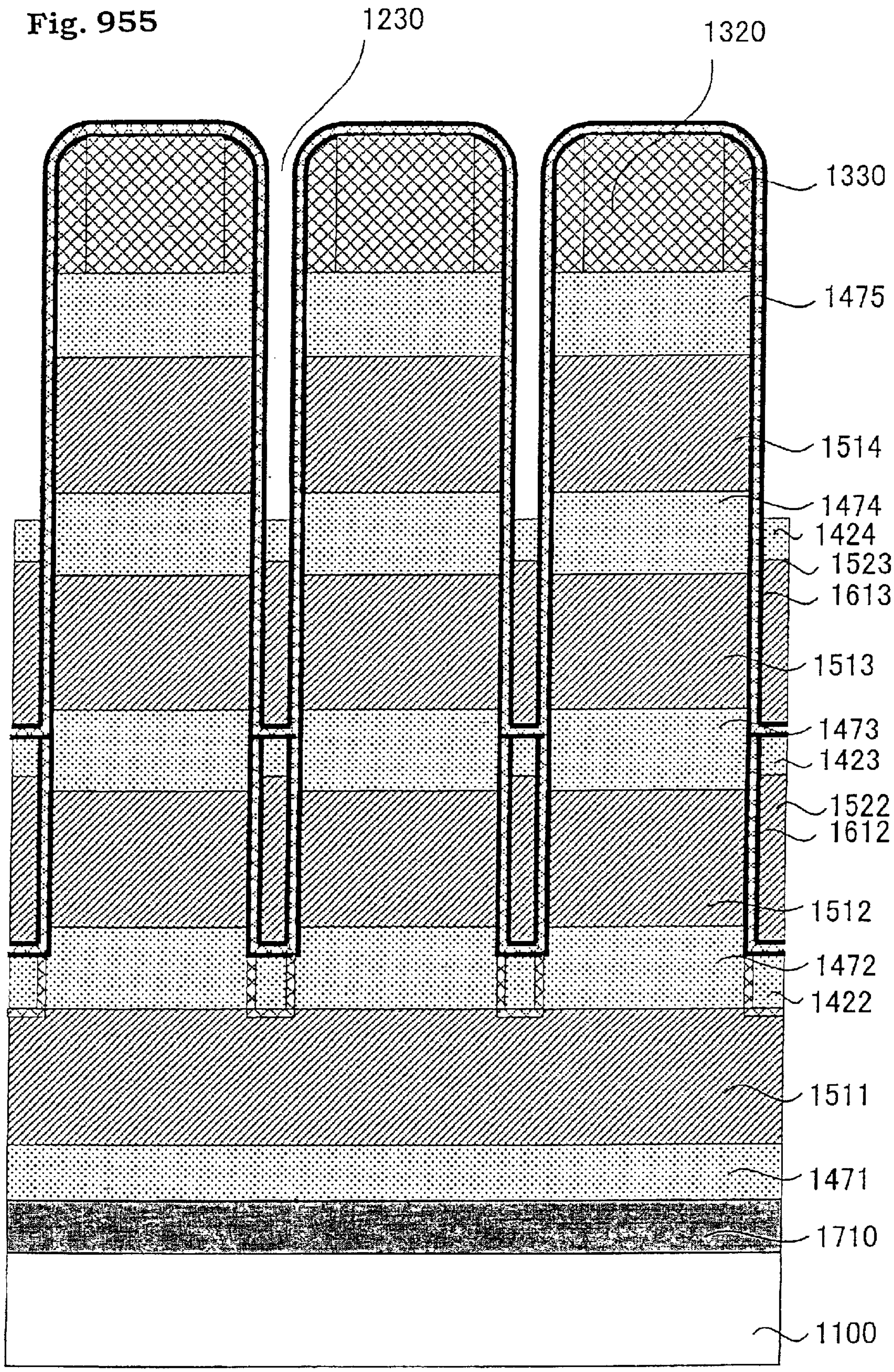
Figure 956:
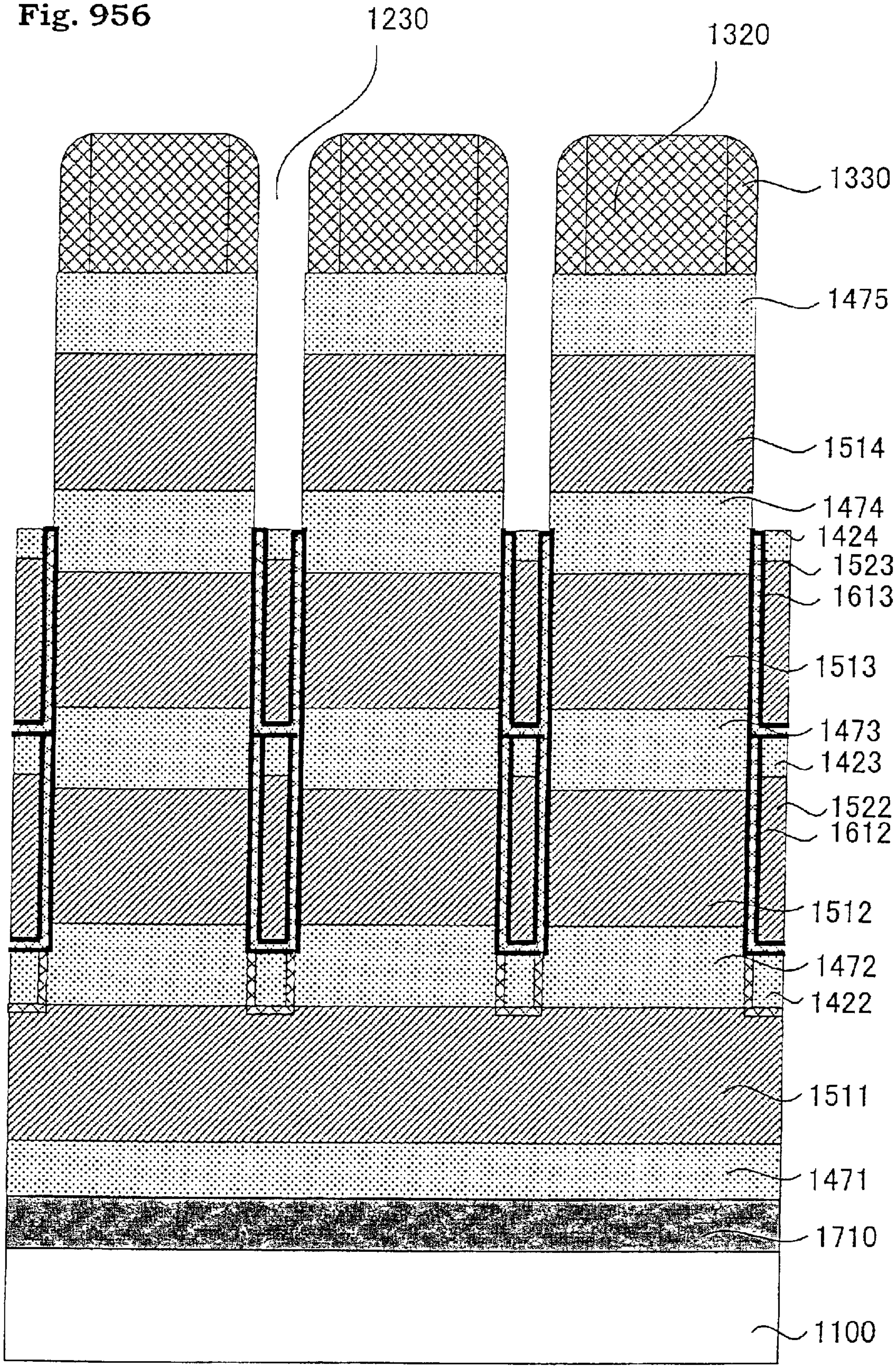
Figure 983:
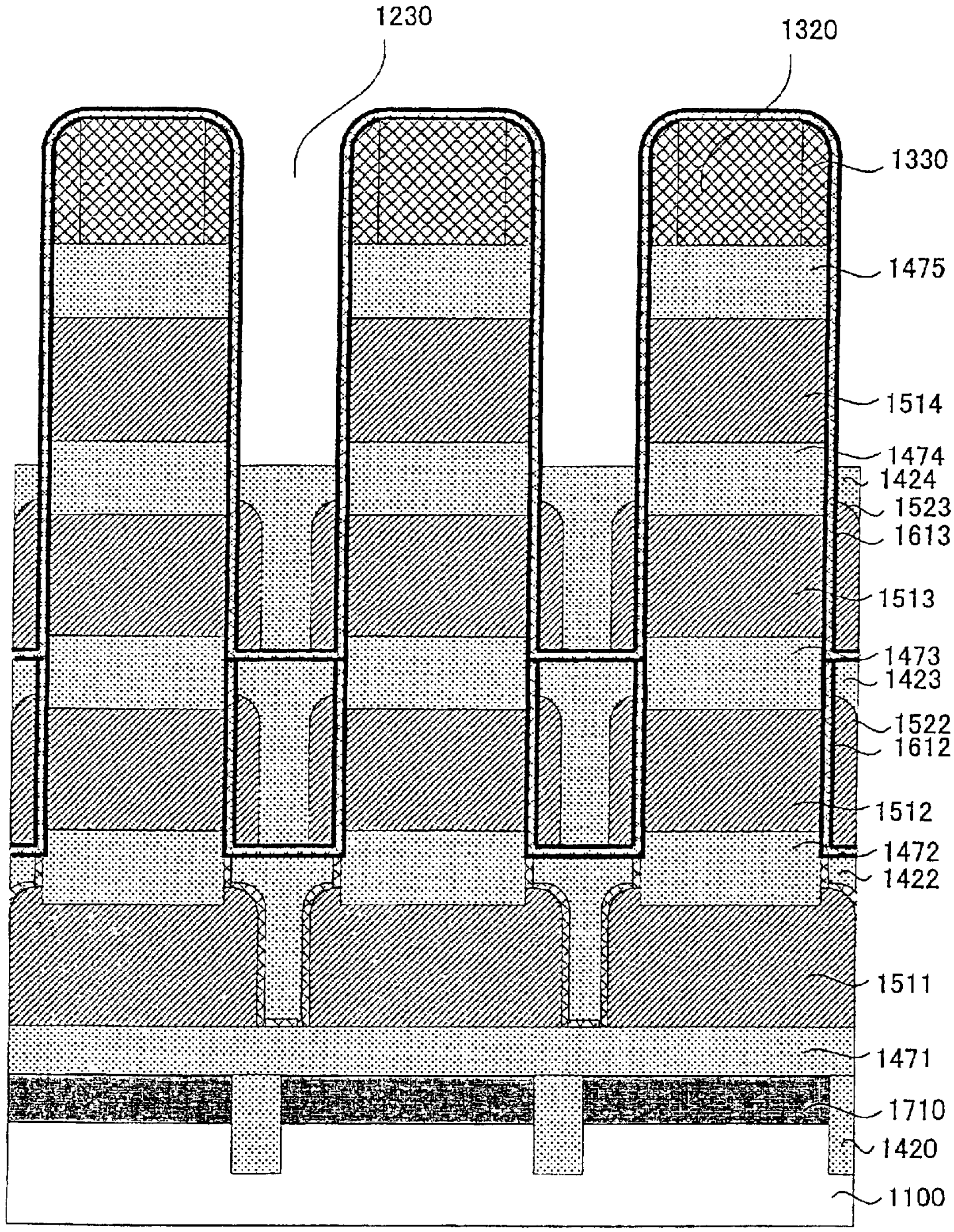
Figure 984:
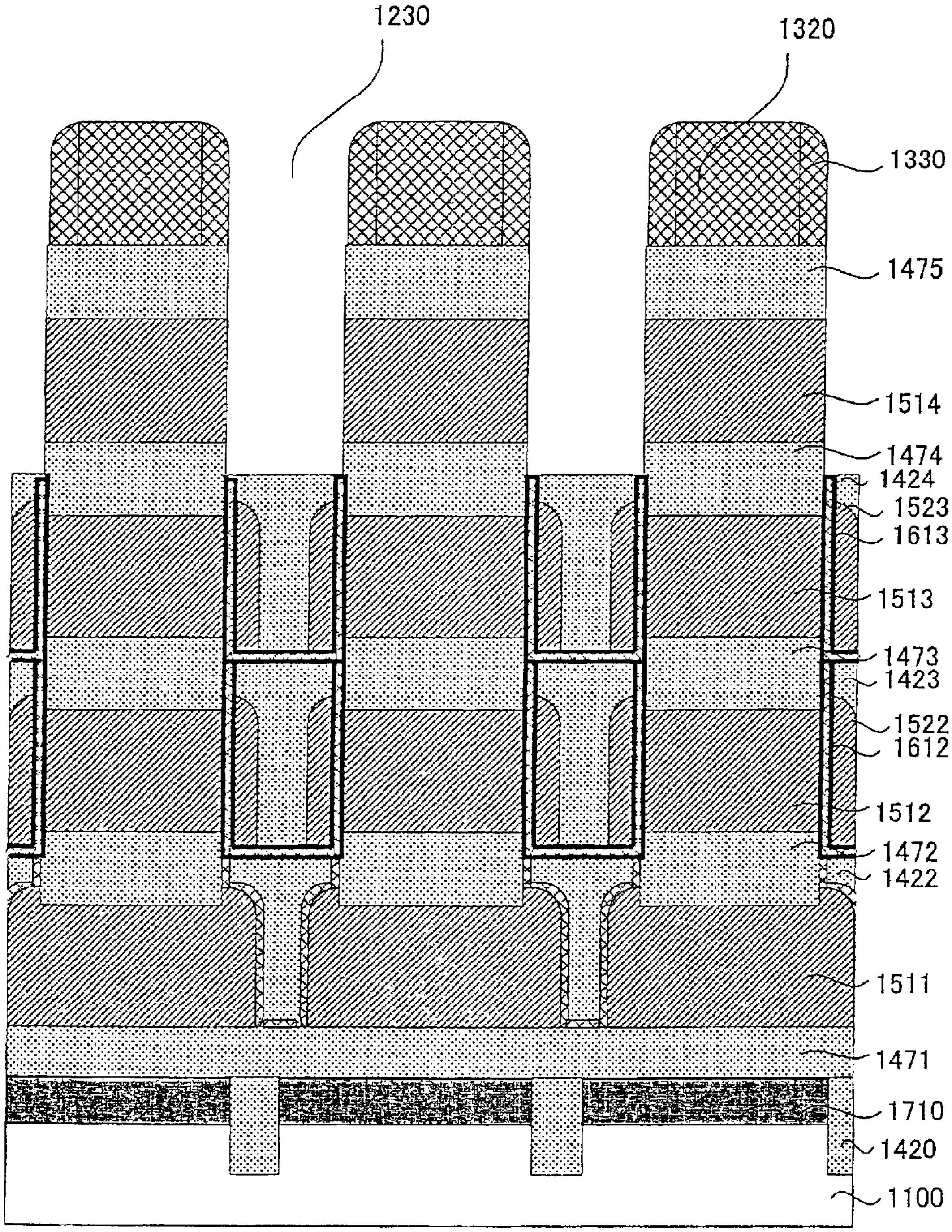

Next, a polysilicon film 1523, for example, is deposited to 15 to 150 nm as a second conductive film and etched back to form a sidewall on the sidewall of the polysilicon film 1513. Further, by repeating in the same manner, a silicon oxide film 1424 is buried as a fifth insulating film in the third trench 1230 so as to remain only on the side of a silicon oxide film 1474 as a ninth insulating film (FIG. 955 and FIG. 983).

Figure 957:
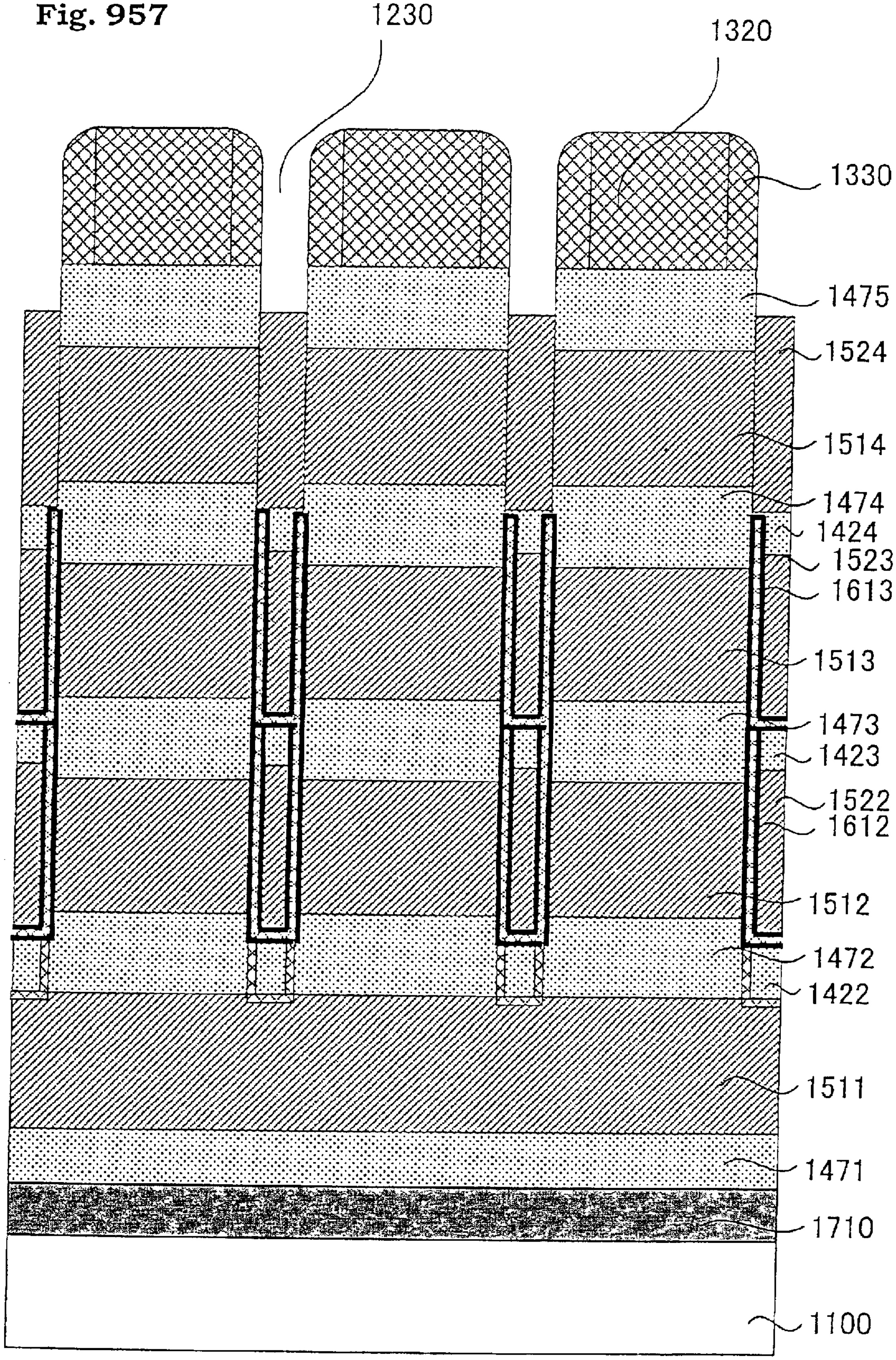
Figure 958:
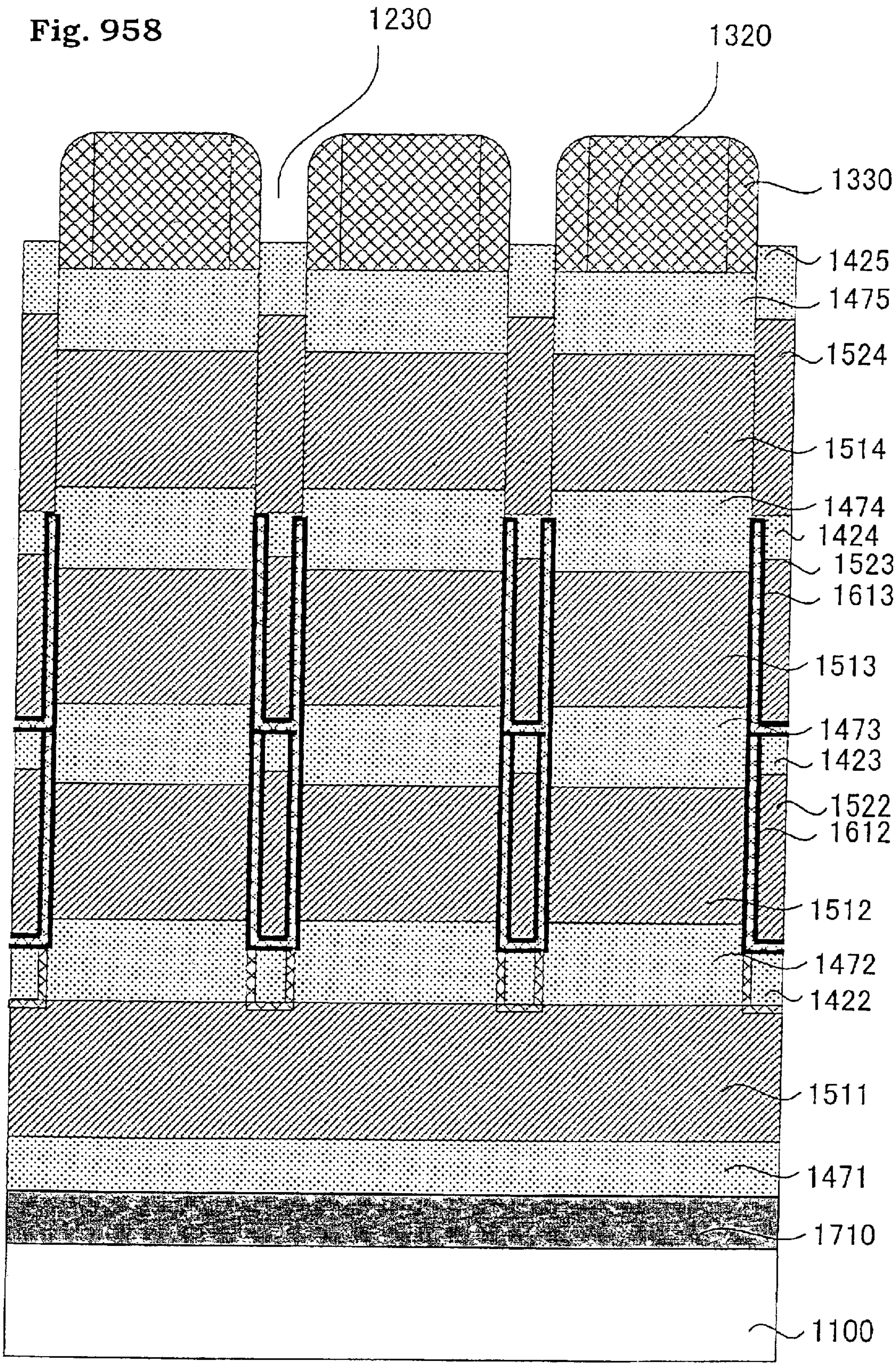
Figure 985:
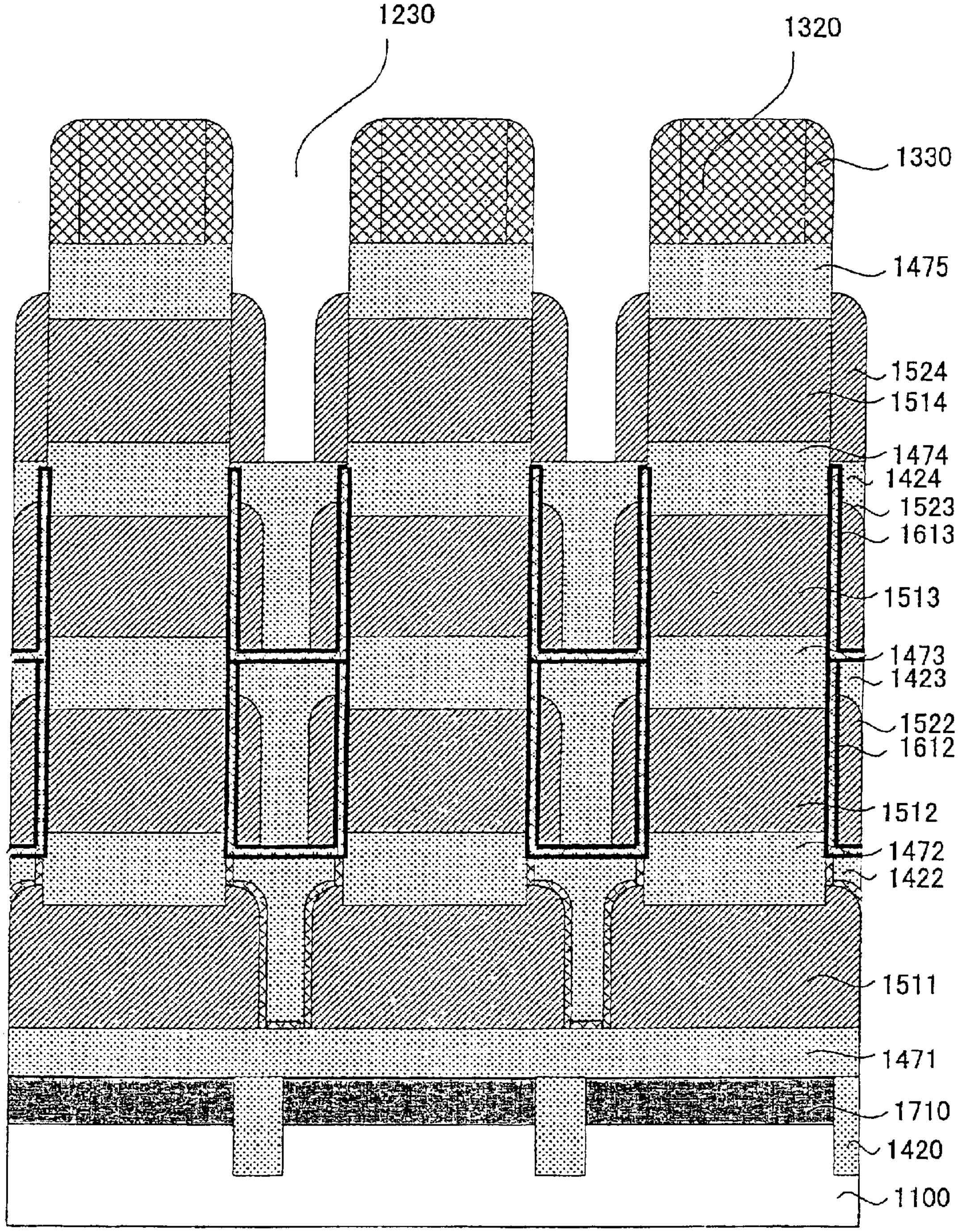
Figure 986:
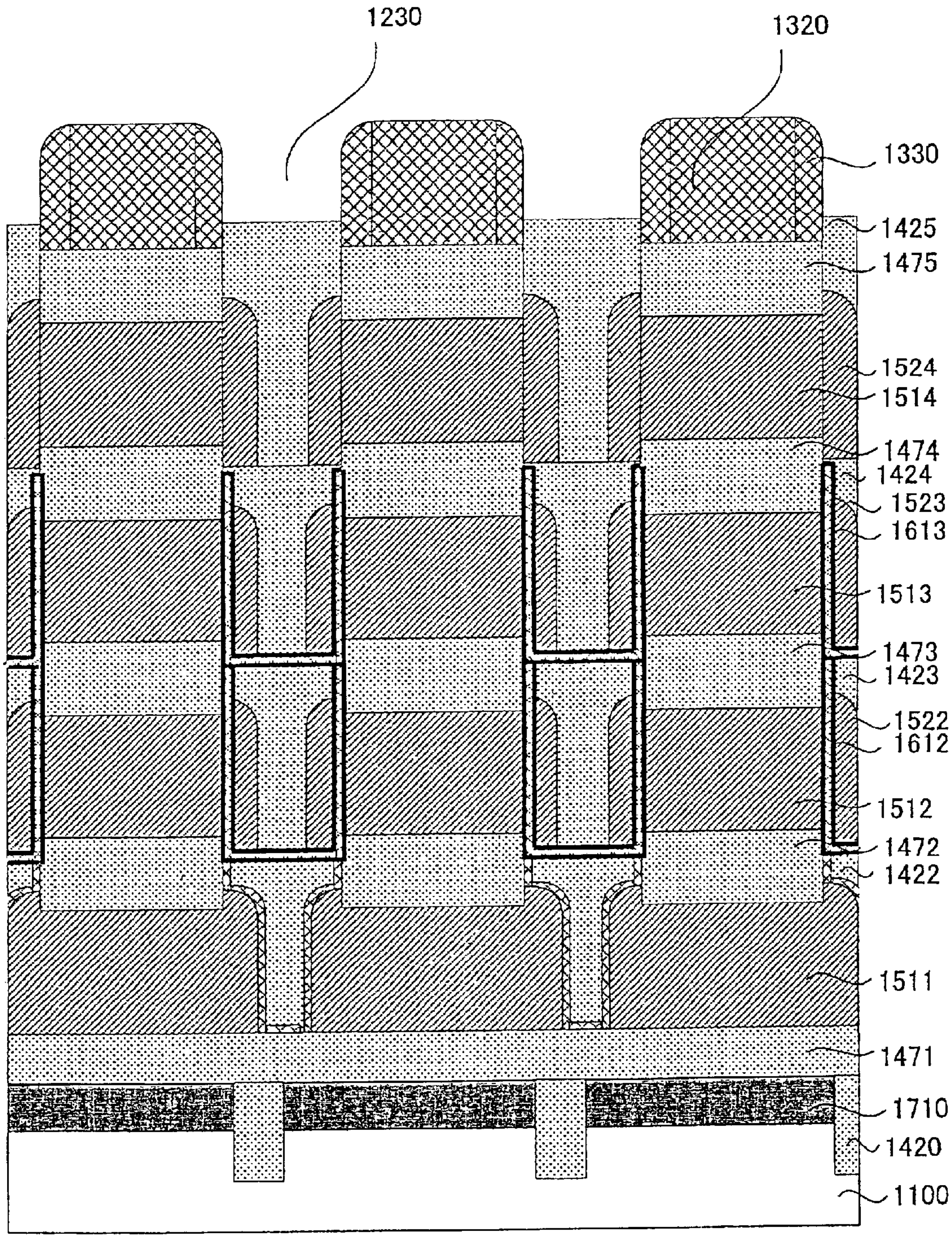

The interlayer insulating film 1613 is selectively removed, for example, by isotropic etching. Thereafter, in the state in which the surface of the third trench 1230 and the polysilicon film 1514 is exposed (FIG. 956 and FIG. 984), a polysilicon film 1524 is deposited to 15 to 150 nm as a second conductive film and etched back to form a sidewall on the sidewall of the polysilicon film 1514 (FIG. 957 and FIG. 985).

Figure 959:
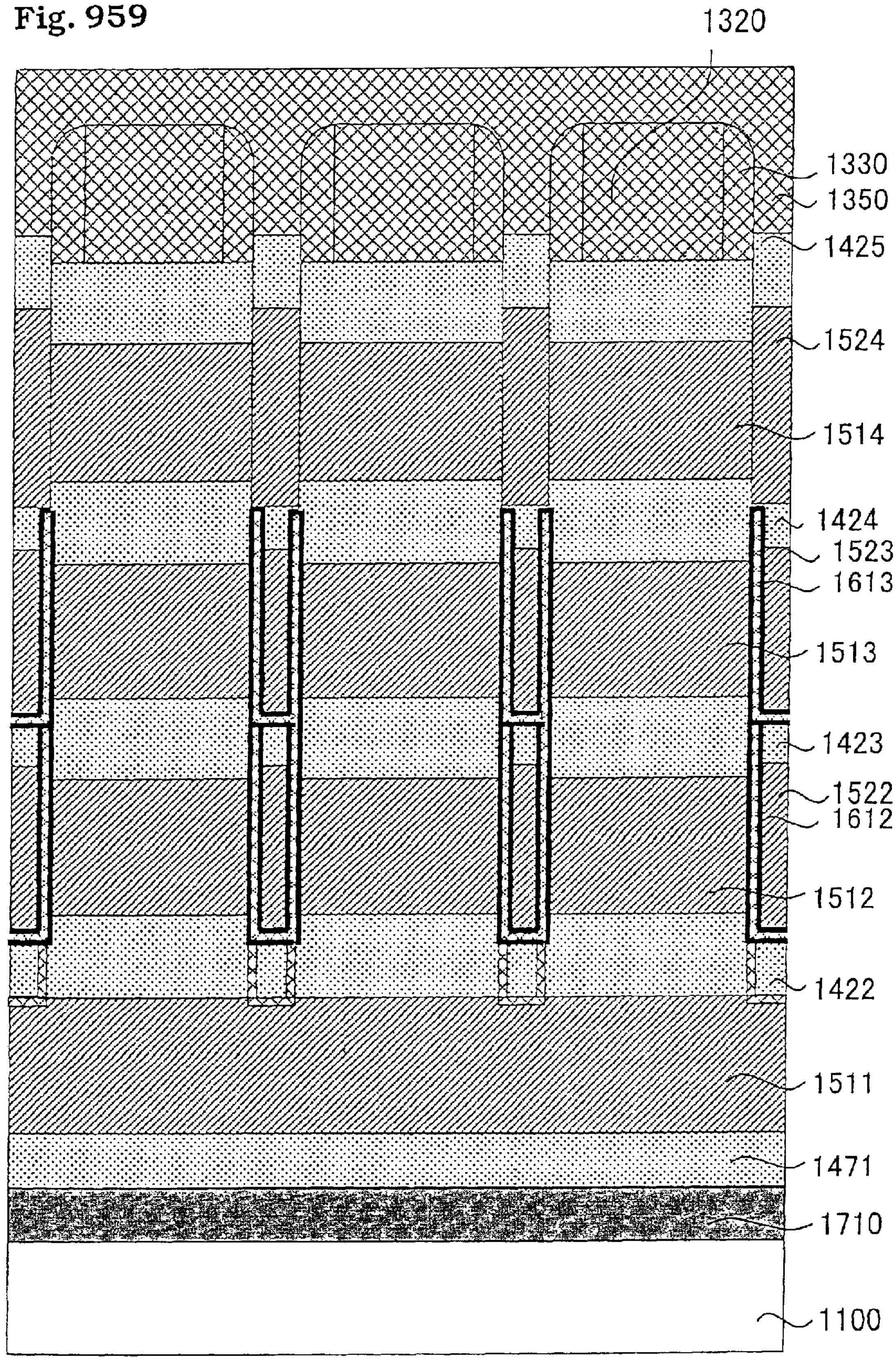
Figure 960:
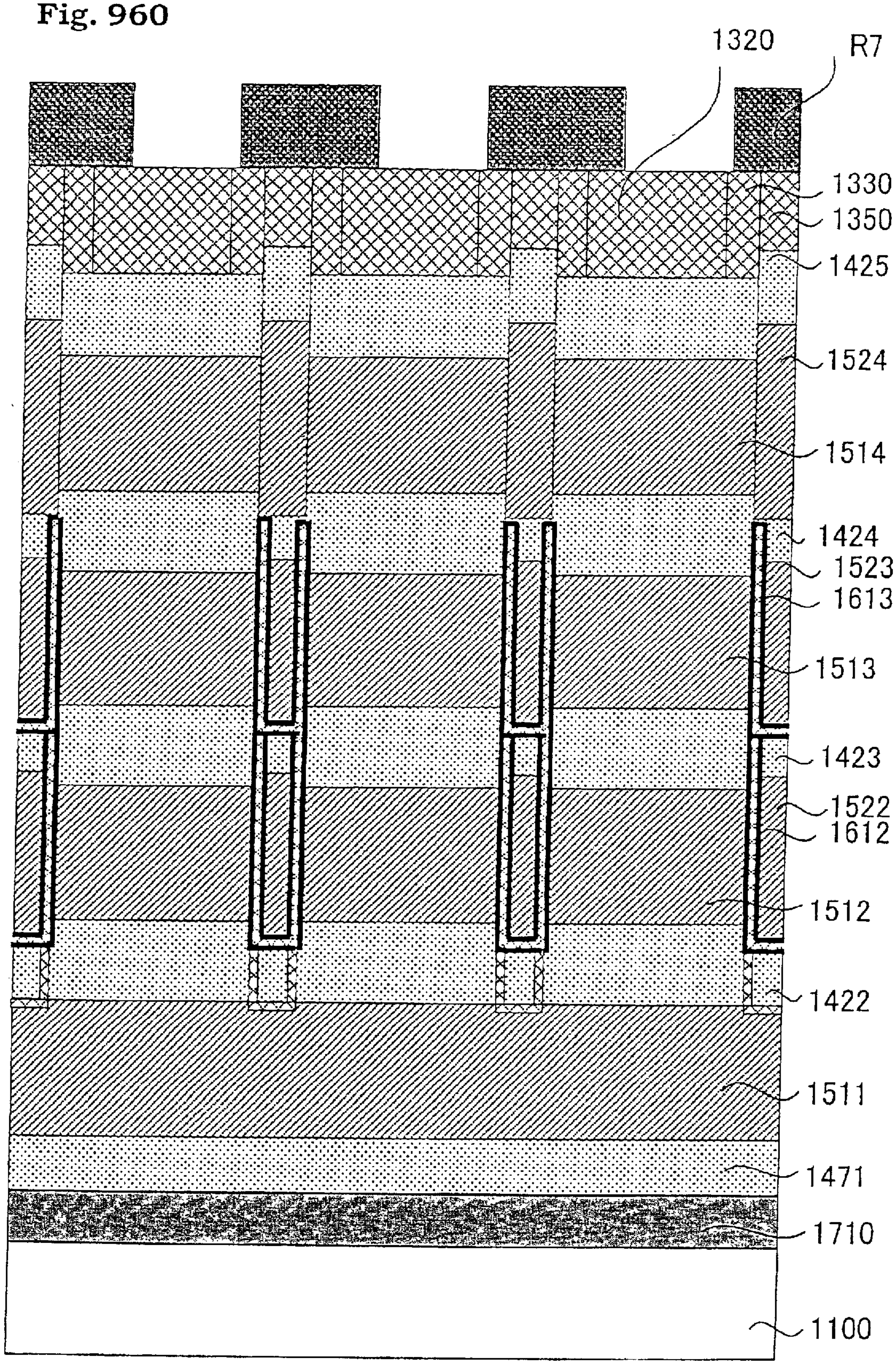
Figure 987:
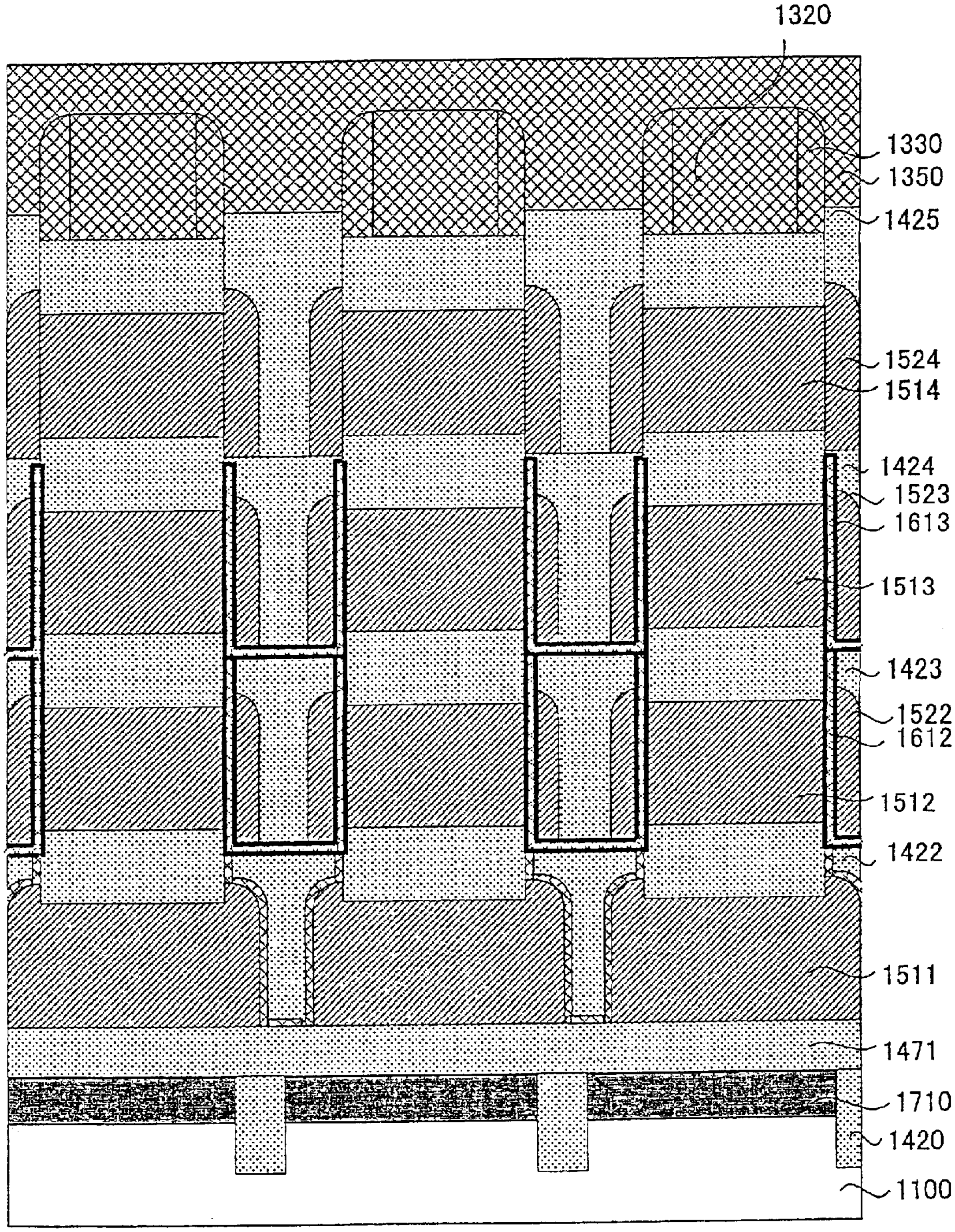
Figure 988:
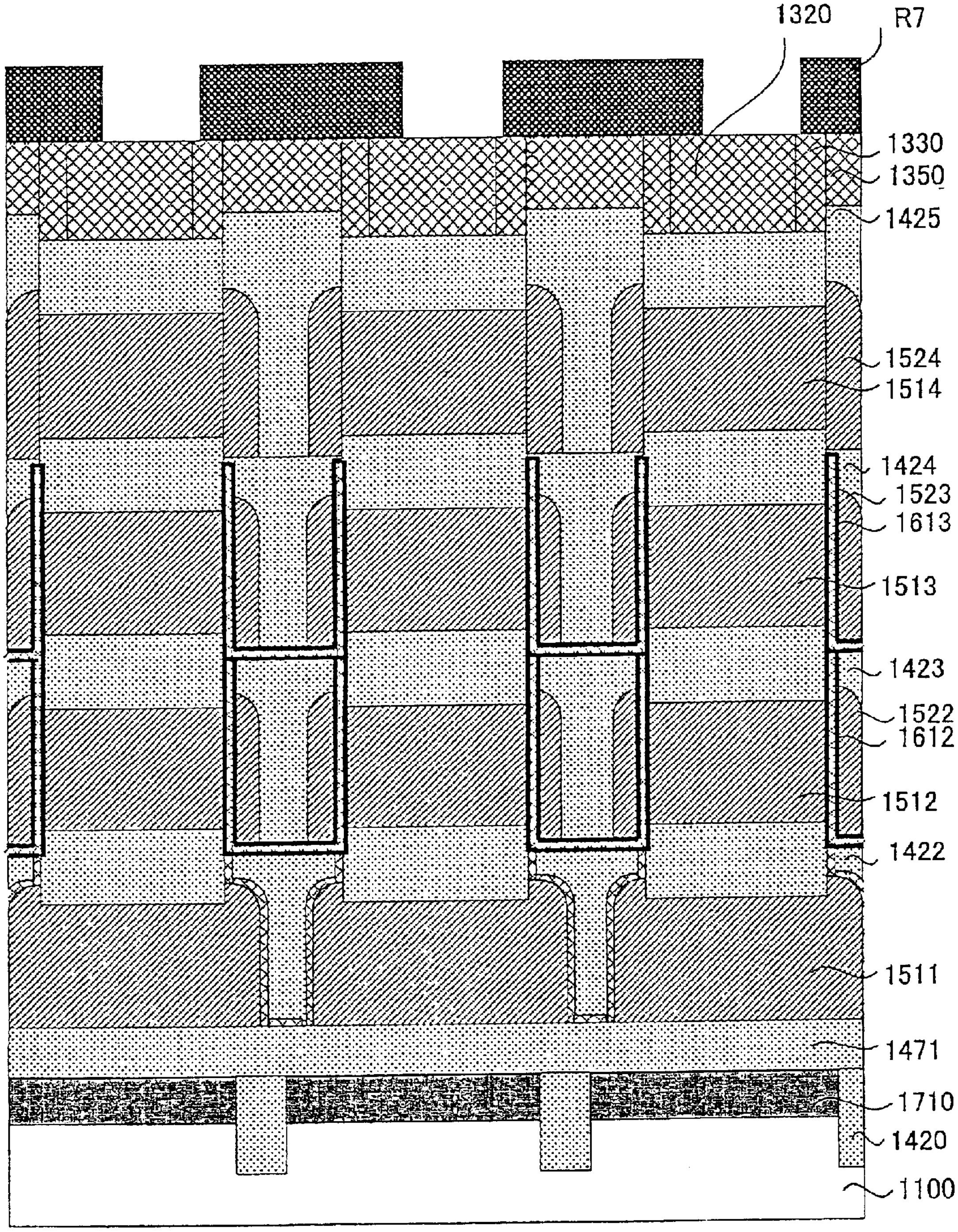

Further in the same manner, a silicon oxide film 1425 is buried as a fifth insulating film in the third trench 1230 on the side of a silicon oxide film 1475 as a ninth insulating film or on the side of a silicon nitride film 1330 as an eleventh insulating film (FIG. 958 and FIG. 986), and a silicon nitride film 1350, for example, is deposited as a fourteenth insulating film. Thereafter, the surface of the silicon nitride film 1350 is flattened, for example, by CMP (FIG. 959 and FIG. 987). Using as a mask a resist film R7 patterned by a known photolithography (FIG. 960 and FIG. 988), the silicon nitride film 1350, the silicon nitride film 1330 or the silicon nitride film 1320 is patterned, for example, by RIE.

Figure 961:
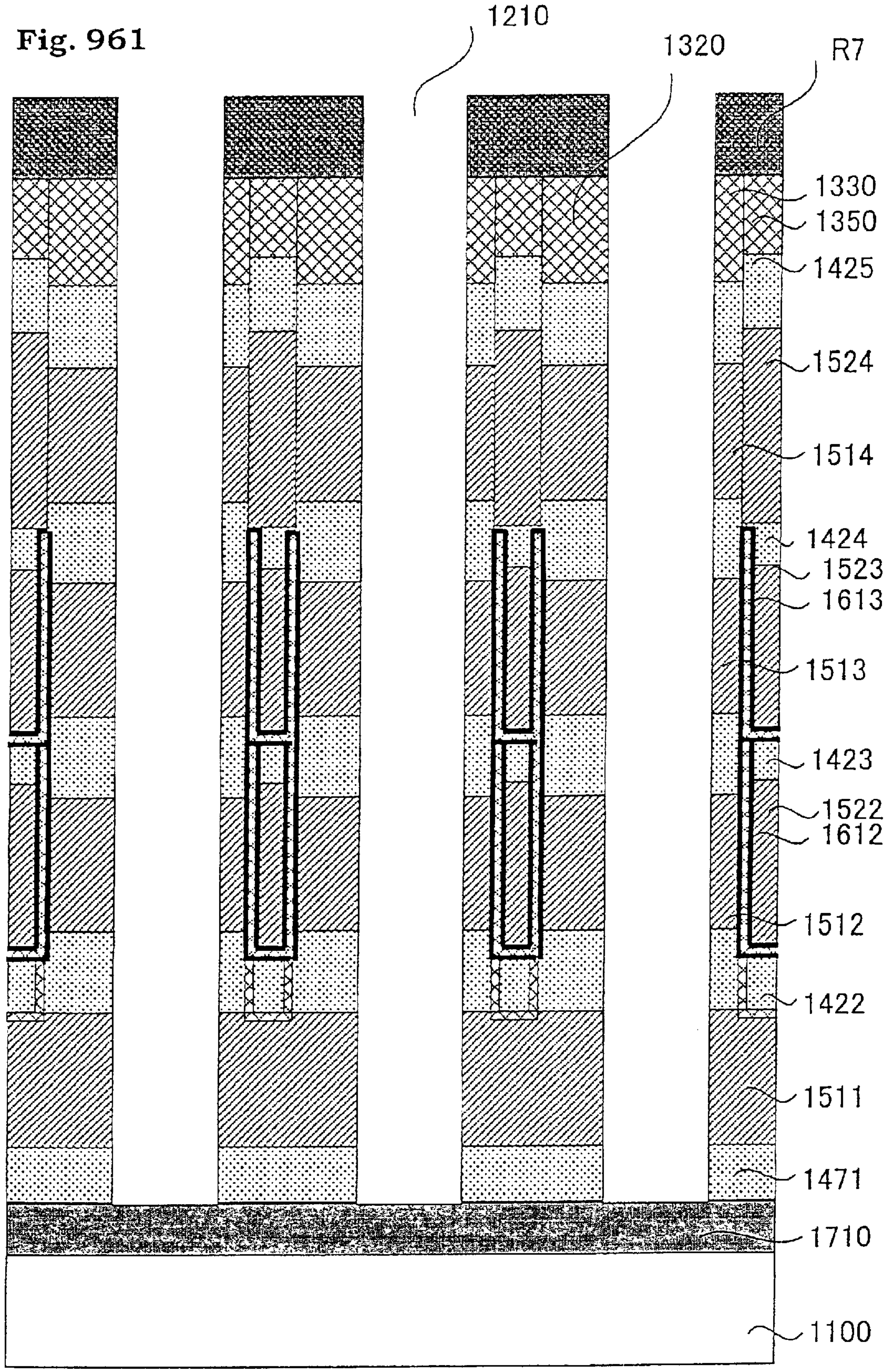
Figure 989:
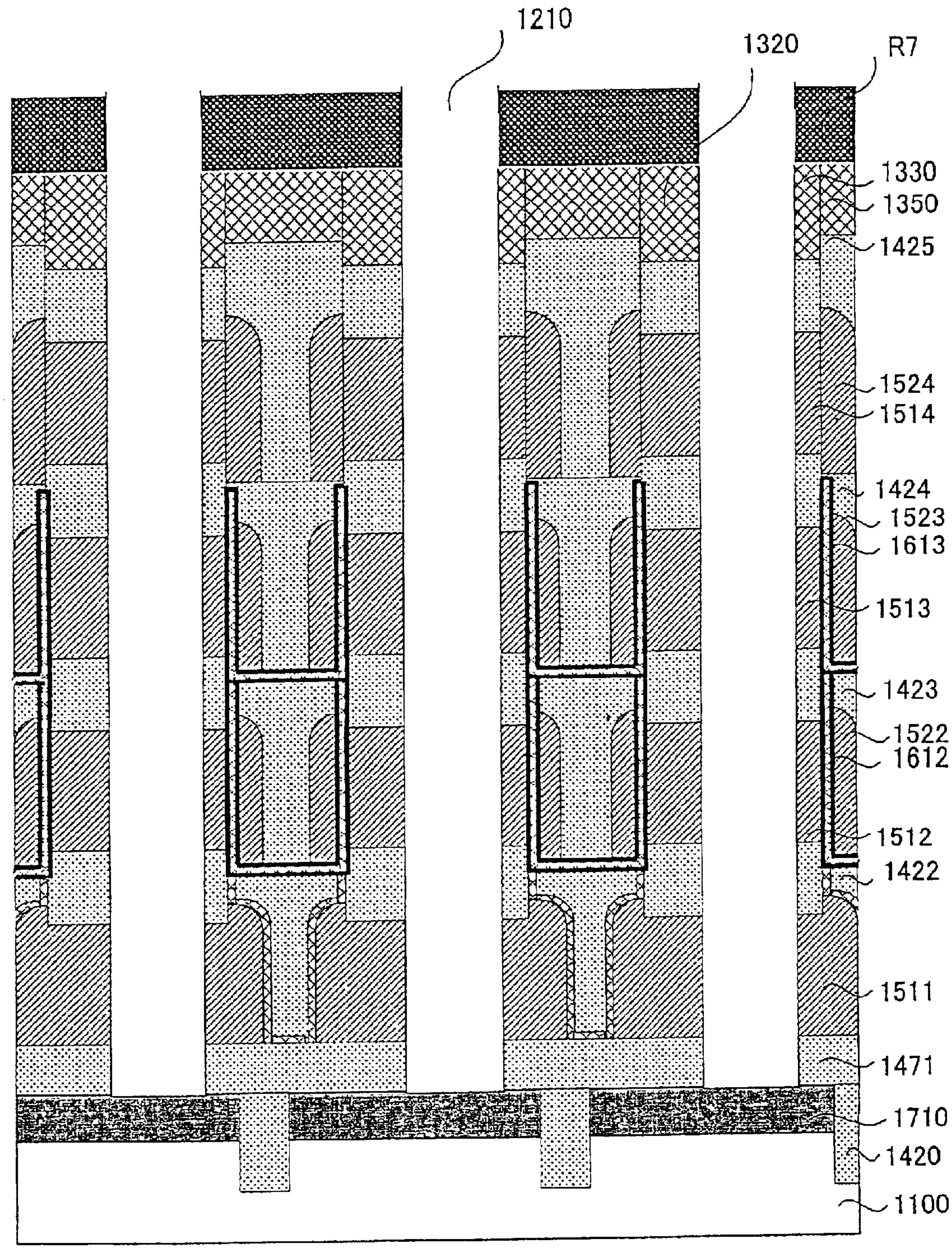

Subsequently, the silicon oxide films 1471 to 1475 and the polysilicon films 1511 to 1514 are sequentially etched, for example, by anisotropic etching until the time when the silicon oxide film 1471 is removed, i.e., until the surface of the P-type silicon substrate 1100 is exposed, to form a first trench 1210 (FIG. 961 and FIG. 989).

Figure 962:
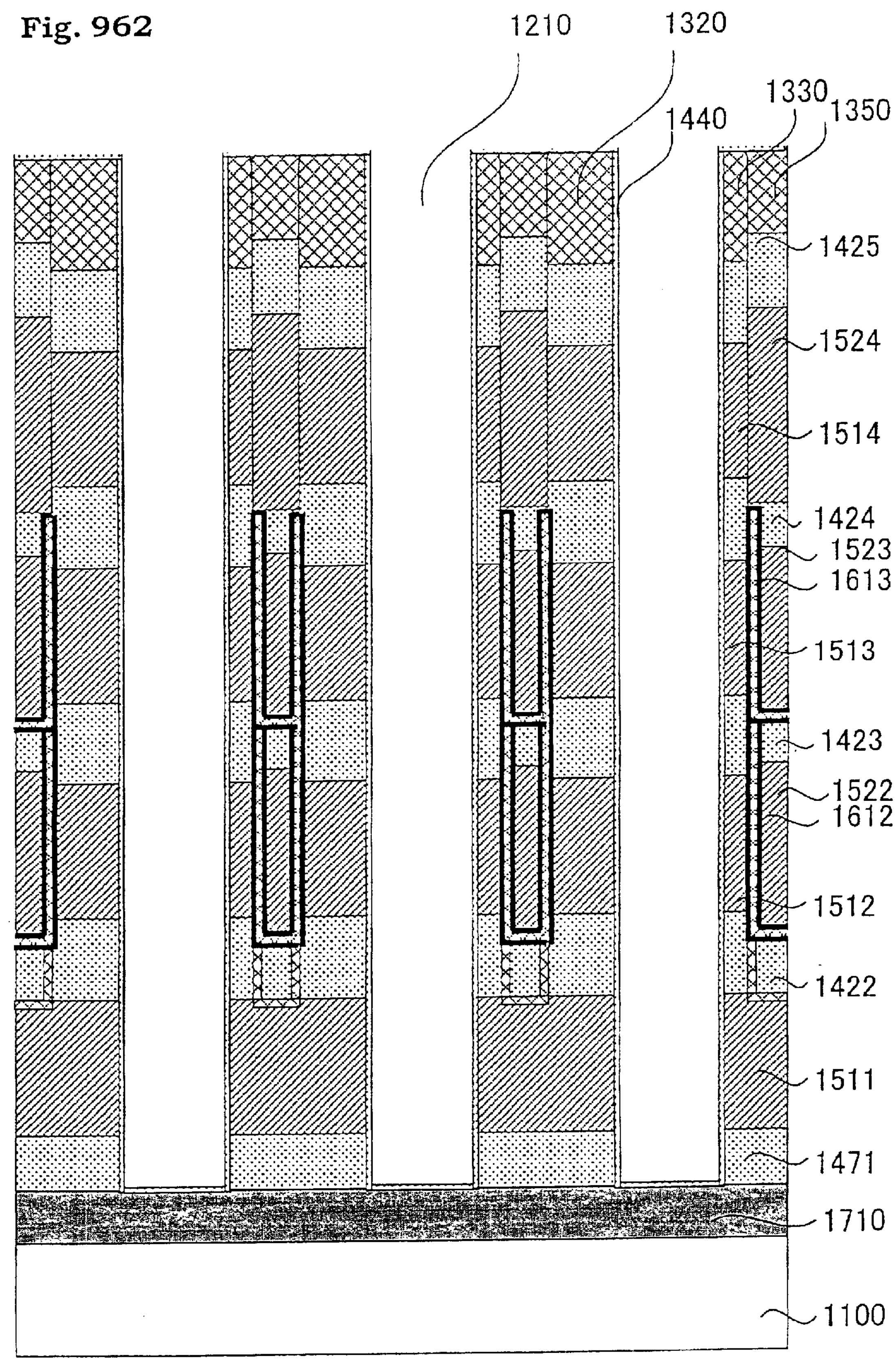
Figure 990:
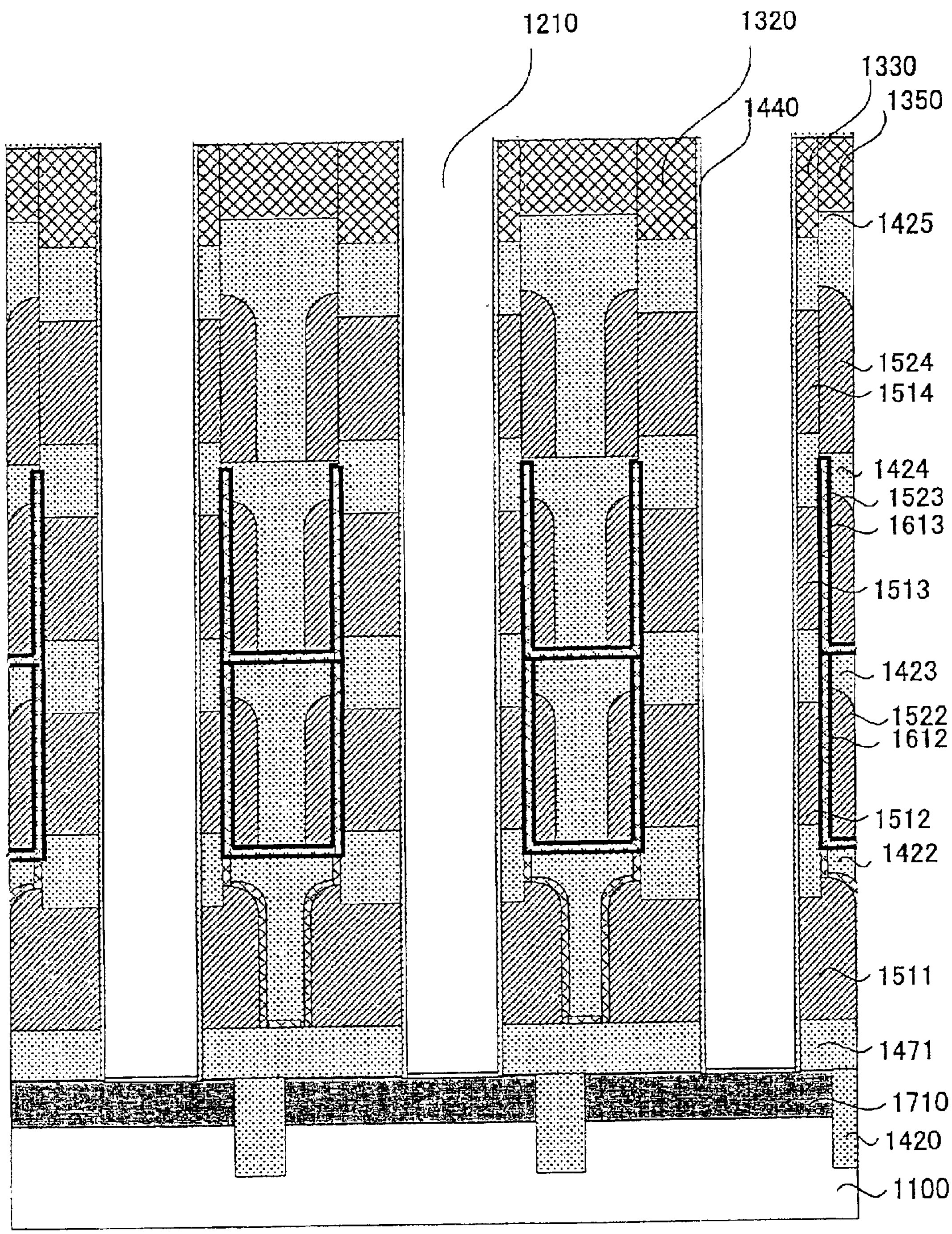

Subsequently, a silicon oxide film 1440, for example, is formed as a third insulating film to be a tunnel oxide film of about 10 nm on the inner wall of the first trench 1210, for example, using CVD (FIG. 962 and FIG. 990). Here, the silicon oxide film 1440 is not particularly limited to a CVD oxide film, but may be a thermally oxidized film or a nitrogen oxide film.

Figure 963:
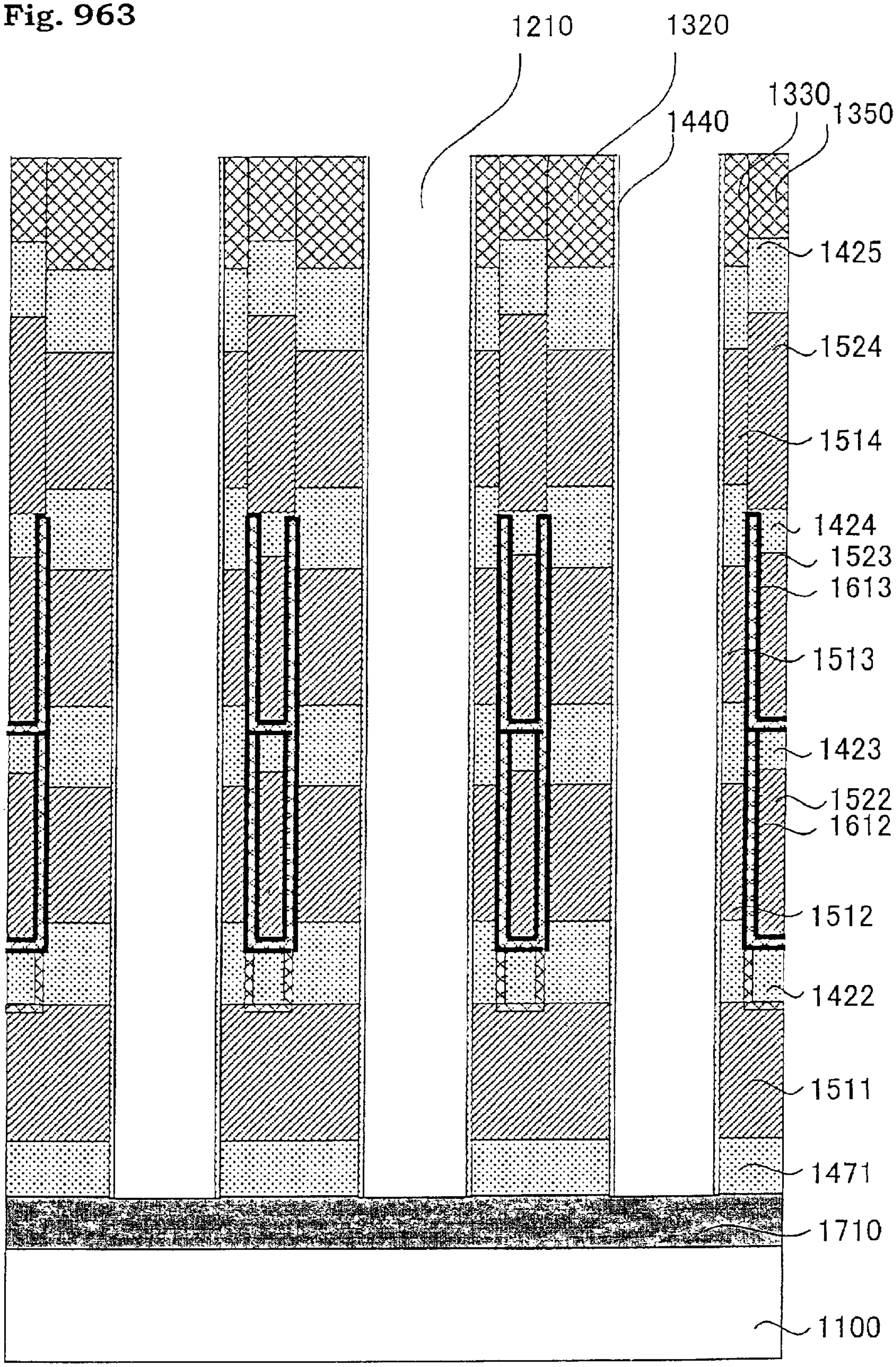
Figure 991:
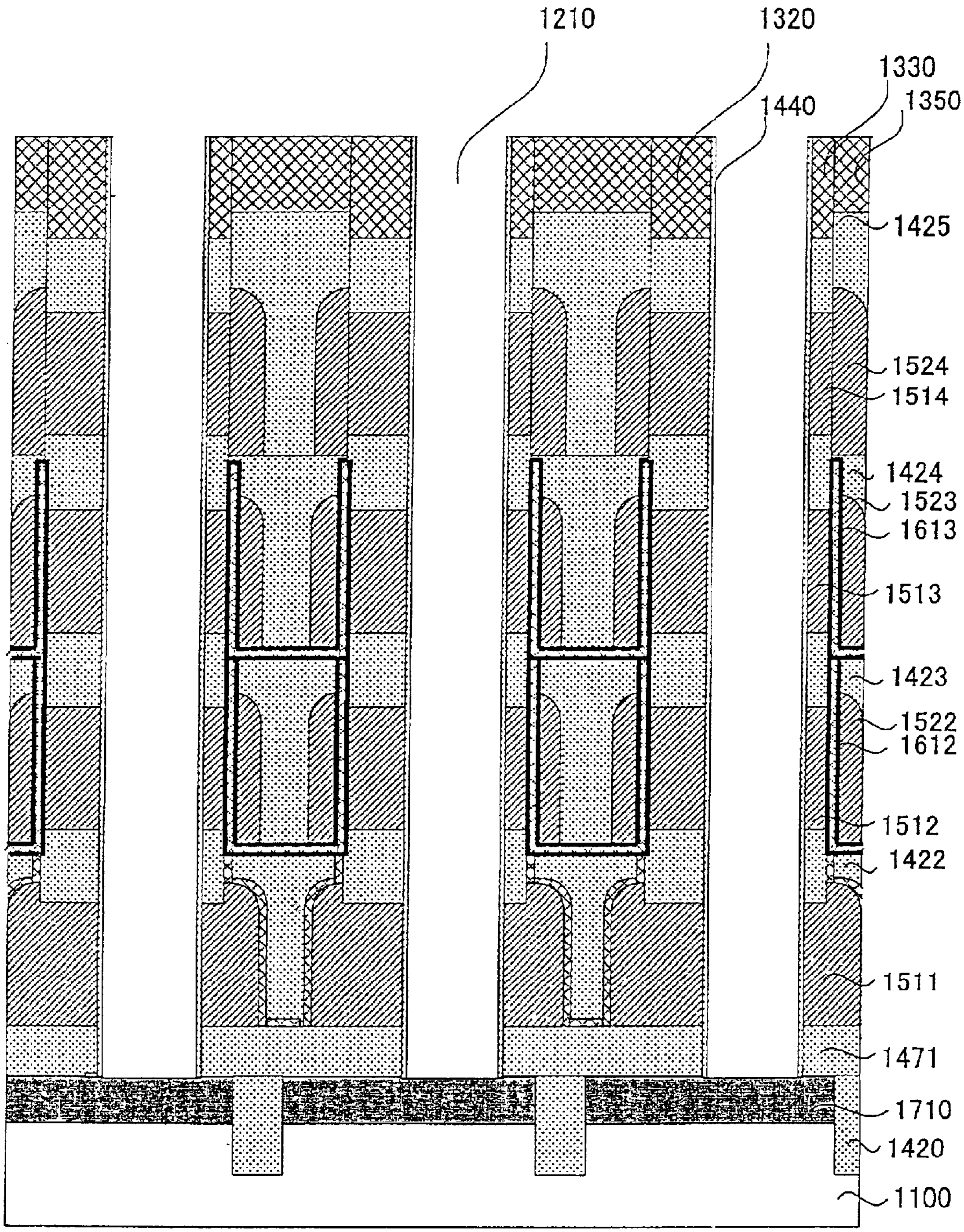

Subsequently, the silicon oxide film 1440 on the first diffusion layer 1710 or on the P-type silicon substrate 1100 is selectively removed. For example, by anisotropic etching, the silicon oxide film 1440 is left in the form of a sidewall only on the sidewall of the first trench 1210 (FIG. 963 and FIG. 991).

Thereafter, the silicon oxide film 1440 is, for example, annealed in a nitrogen atmosphere at 800 to 1000° C. for 10 to 100 minutes. At this time, a gas other then nitrogen, for example, oxygen may be added. Preferably the silicon oxide film 1440 becomes about 10 nm thick after the thermal treatment.

Figure 964:
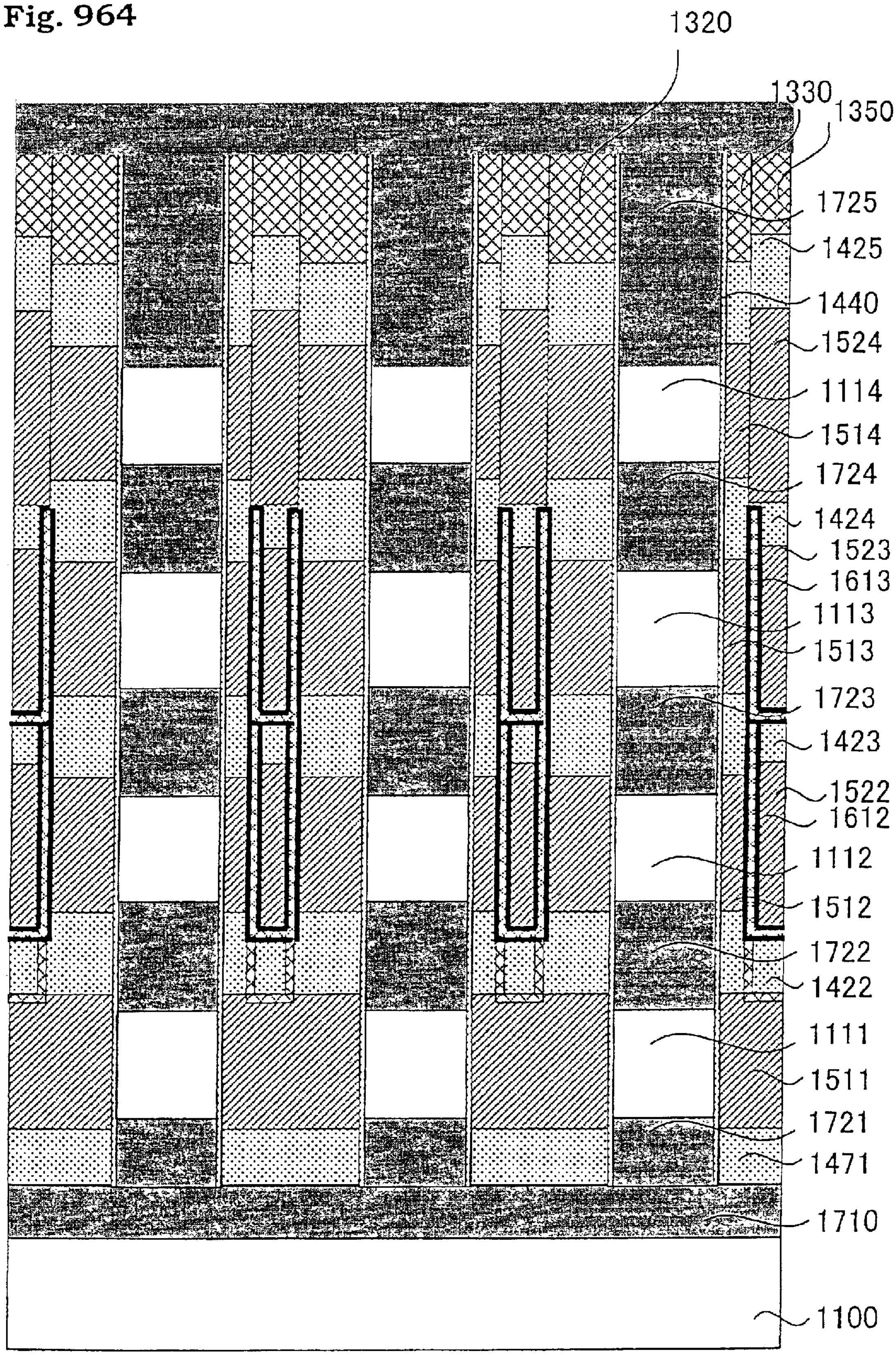
Figure 965:
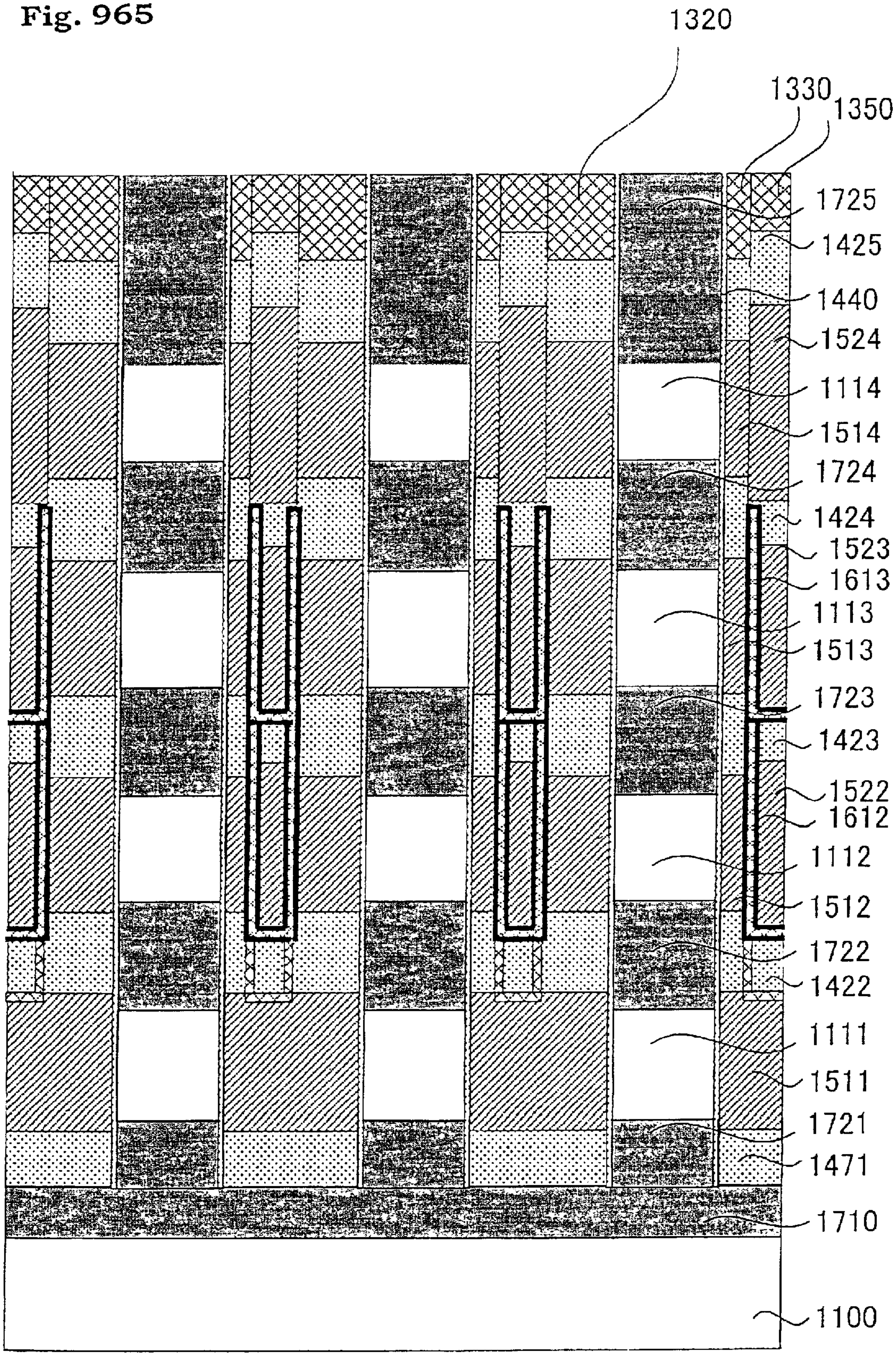
Figure 966:
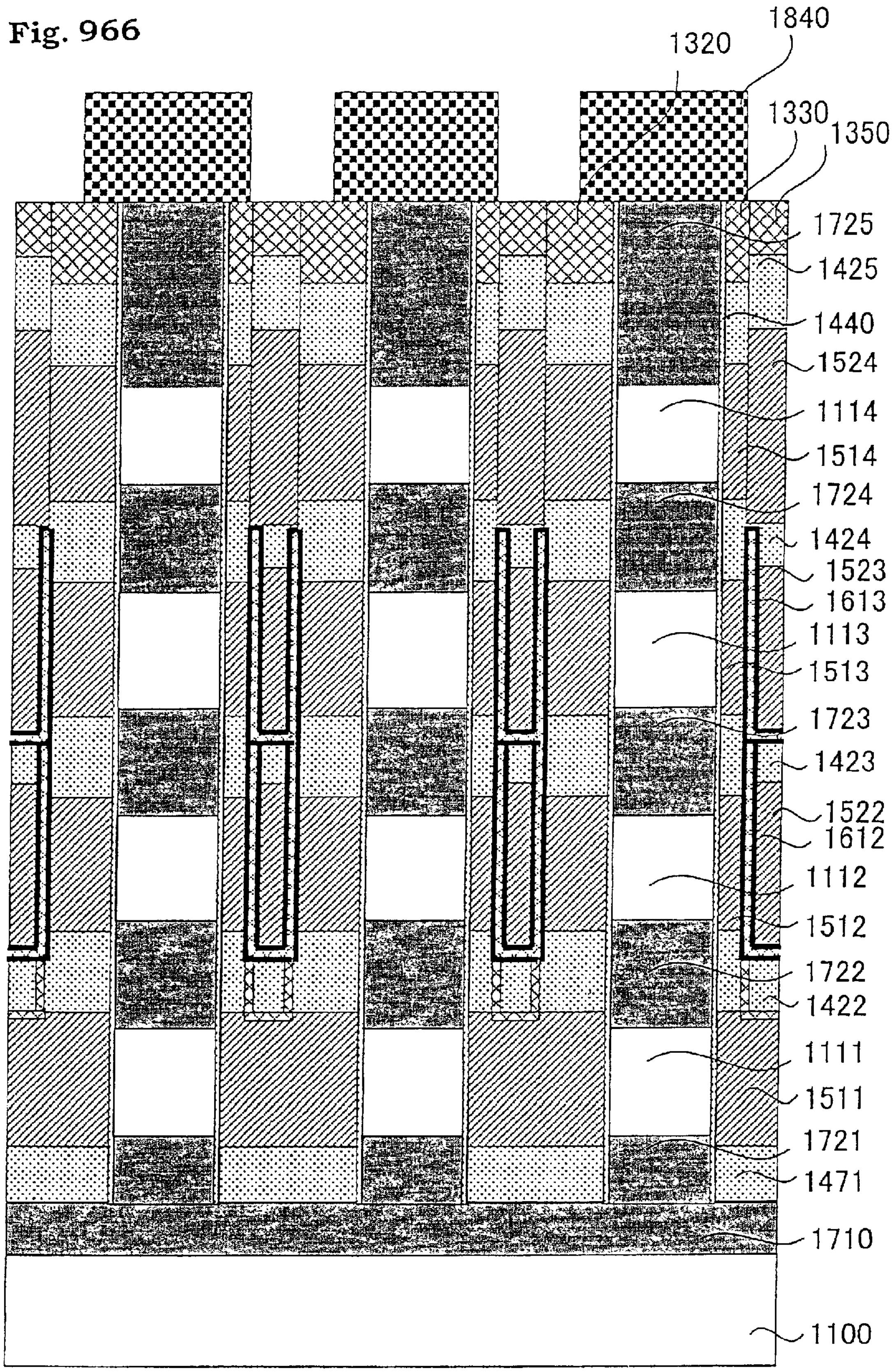
Figure 992:
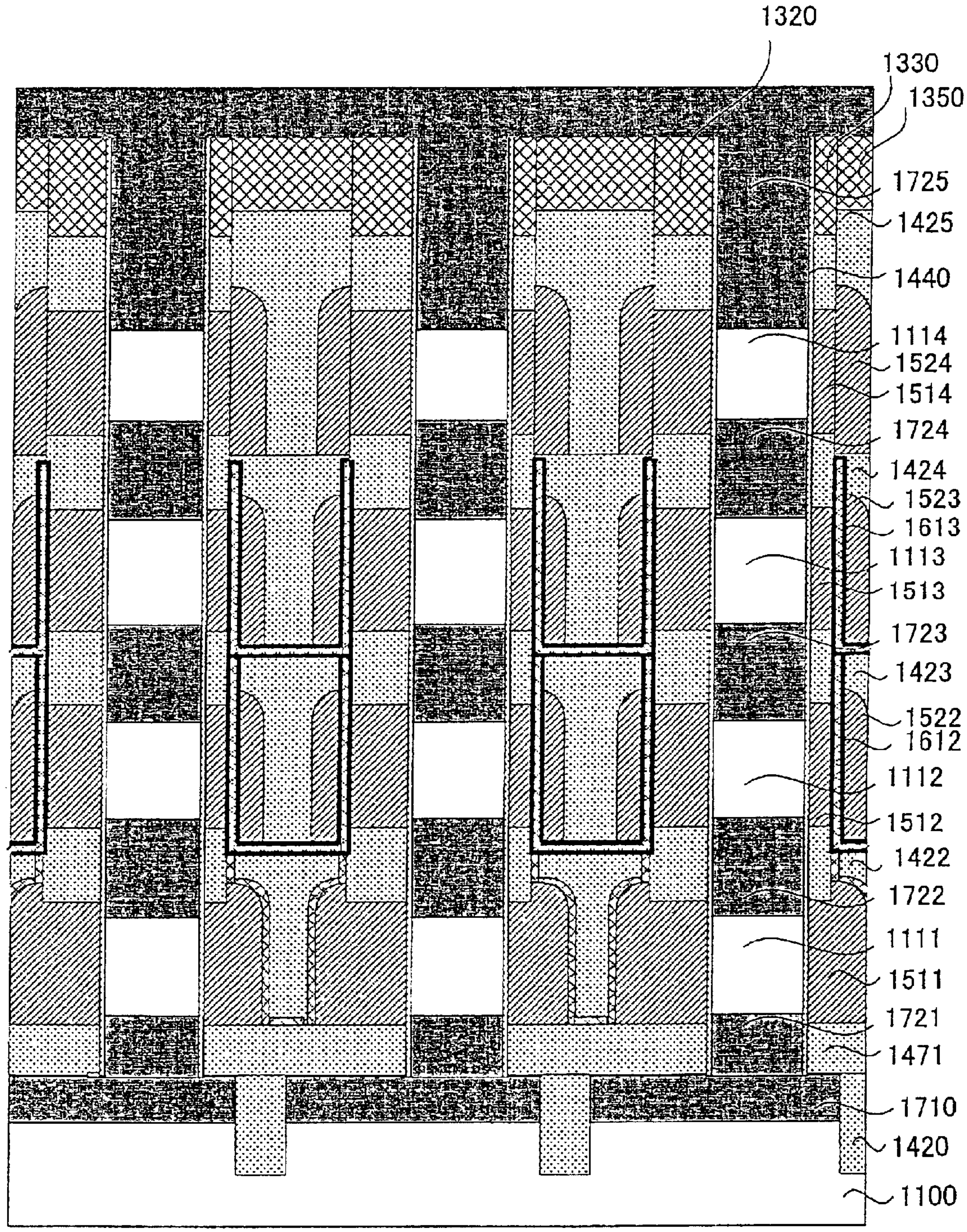
Figure 993:
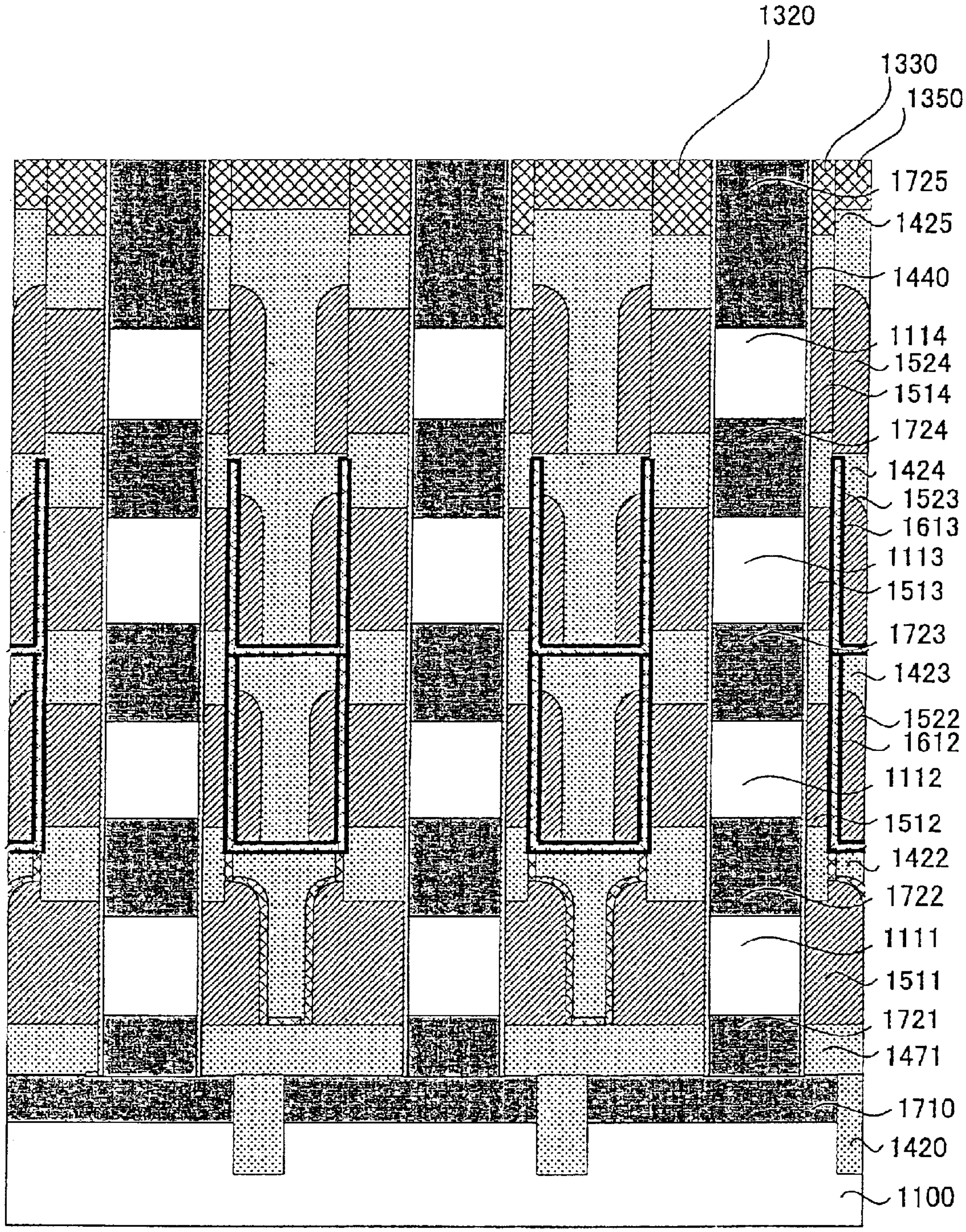
Figure 994:
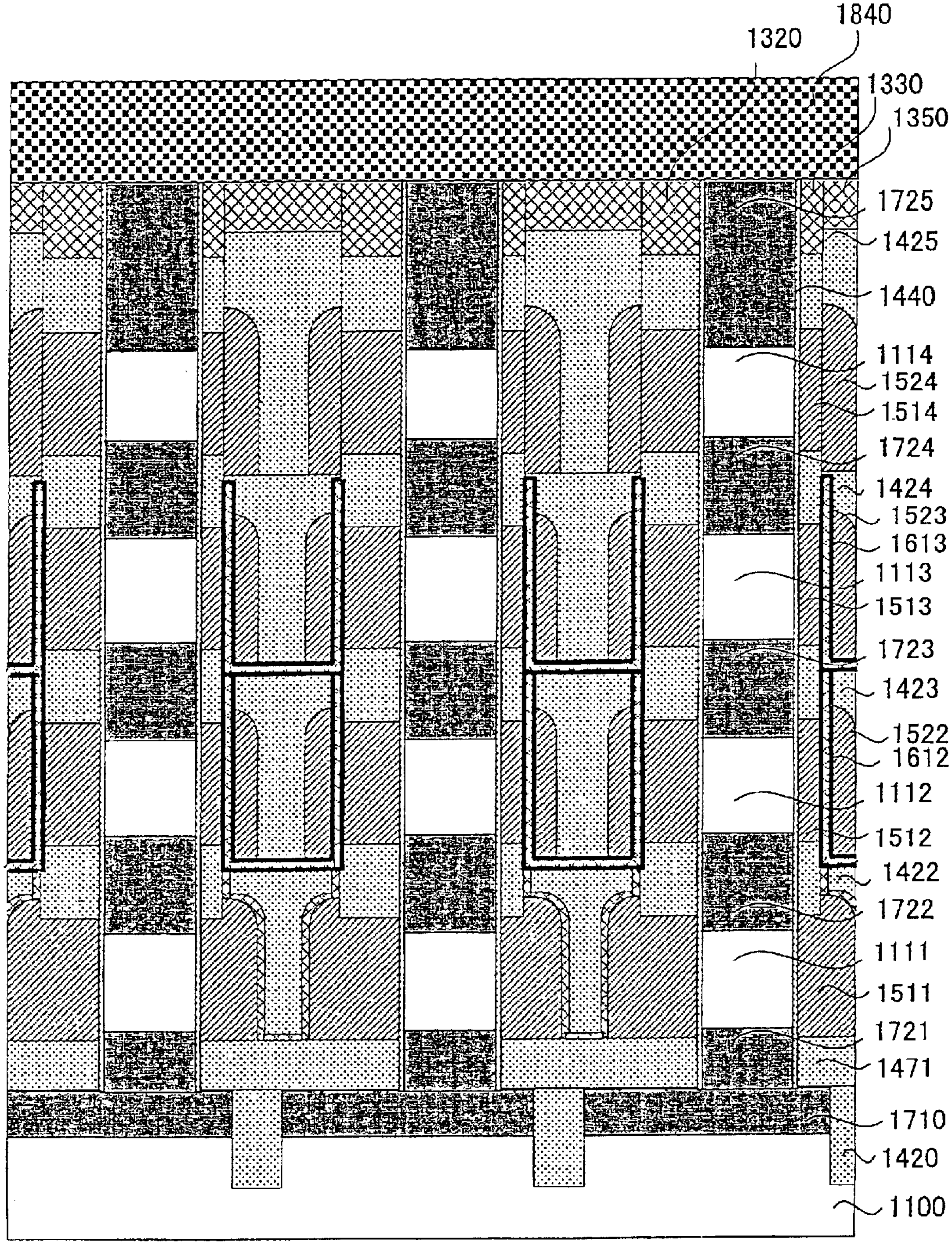
Figure 995:
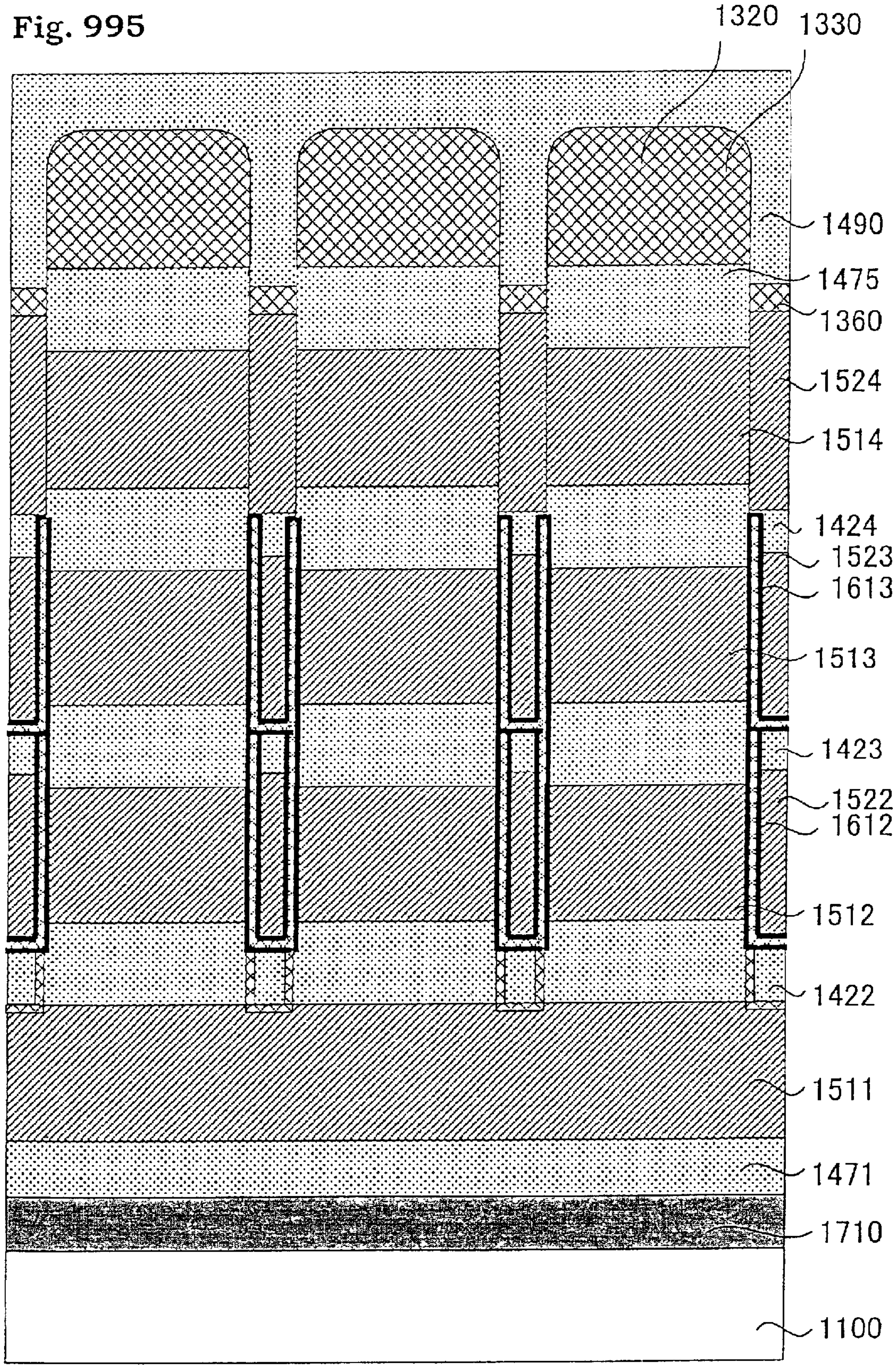
Figure 996:
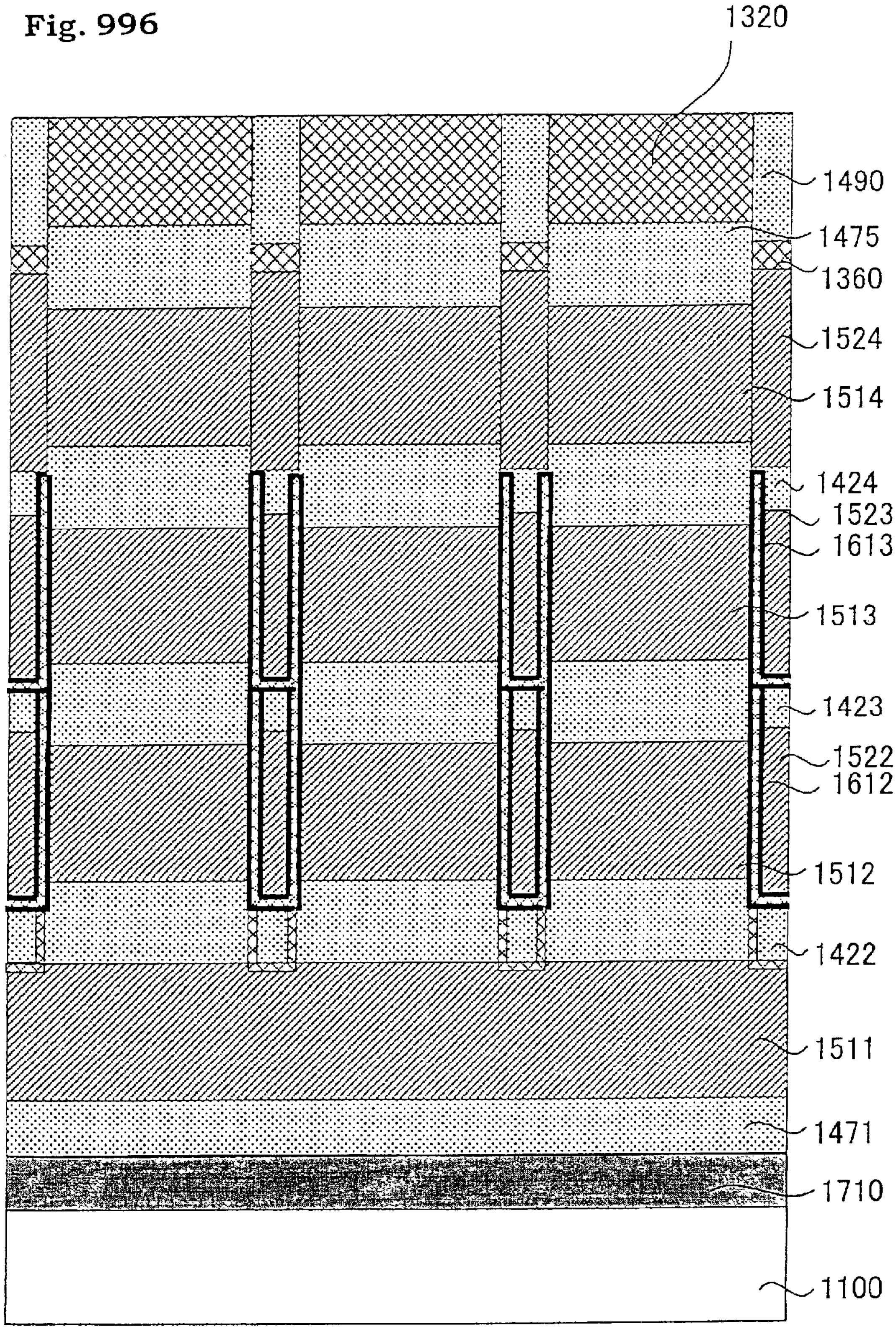

Thereafter, the oxide film formed on the surface of the first impurity diffusion layer 1710 or on the P-type silicon substrate 1100 is optionally removed, for example, with diluted HF, and the first trench 1210 is filled with island-like semiconductor layers 1721 to 1725 and 1111 to 1114. For example, the semiconductor layers are selectively grown epitaxially from the first impurity diffusion layer 1710 or the P-type silicon substrate 1100 positioned at the bottom of the first trench 1210. At this time, from the bottom, an N-type semiconductor layer 1721, a P-type semiconductor layer 1111, an N-type semiconductor layer 1722, a P-type semiconductor layer 1112, an N-type semiconductor layer 1723, a P-type semiconductor layer 1113, an N-type semiconductor layer 1724, a P-type semiconductor layer 1114 and an N-type semiconductor layer 1725 are sequentially formed (FIG. 964 and FIG. 992). The concentration of the N-type semiconductor layers 1721 to 1725 is formed at an arsenic dose of about $1\times10^{18}$ to $1\times10^{21}/cm^3$, and the concentration of the P-type semiconductor layers 1111 to 1114 is formed at a boron dose of about $1\times10^{15}$ to $1\times10^{17}/cm^3$. Preferably, the N-type semiconductor layers 1721 and 1722 overlap each other with intervention of the polysilicon layer 1511 and the silicon oxide film 1440; the N-type semiconductor layers 1722 and 1723 overlap each other with intervention of the polysilicon layer 1512 and the silicon oxide film 1440; the N-type semiconductor layers 1723 and 1724 overlap each other with intervention of the polysilicon layer 1513 and the silicon oxide film 1440; and the N-type semiconductor layers 1724 and 1725 overlap each other with intervention of the polysilicon layer 1514 and the silicon oxide film 1440.

Thereafter, the N-type semiconductor layer 1725 is reduced, for example, by etch back or by CMP to expose the silicon oxide film 1425 and divide the N-type semiconductor layer.

Subsequently, a fourth wiring layer 1840 is connected to the top of the N-type semiconductor layer 1725 so as to cross the direction of the second and third wiring layers.

Thereafter, an interlayer insulating film is formed by a known technique, and contact holes and metal wiring are formed. Thereby a semiconductor memory device is realized which has a memory function according to the state of a charge in the charge storage layer which is the floating gate made of the polysilicon film as the first conductive film.

For forming the buried silicon oxide films, the silicon oxide films may be formed not only by CVD but also by rotational coating.

Films formed on the surface of the polysilicon film such as the silicon nitride film (the second insulating film) 1342 may be formed of a layered film of a silicon oxide film/a silicon nitride film from the silicon surface. The impurity introduction into the polysilicon films 1511 to 1514 as the first conductive films and the polysilicon films 1521 to 1524 as the second conductive films may be performed when the polysilicon films are formed, after the polysilicon films are formed or after the sidewalls are formed. The timing of introducing the impurity is not limited so long as the conductive film is formed.

In this production example, the control gates of the memory cells are formed continuously in one direction without using a mask. However, that is possible only in the case where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

By providing the selection gates in the top and the bottom of a set of memory cells, it is possible to prevent the phenomenon that a memory cell transistor is over-erased.

PRODUCTION EXAMPLE 46

In a semiconductor memory device to be formed in this example, after regions where charge storage layers and selection gates are formed are to be pre-defined by layered films including floating gates as charge storage layer, tunnel oxide films are formed in hole-form trenches opened in self-alignment with the floating gates. Island-like semiconductor layer are formed in the form of pillars by selective epitaxial silicon growth and are electrically floated with respect to a semiconductor substrate. Active regions of memory cells are electrically floated. In this semiconductor memory device, selection gate transistors are disposed at the top and at the bottom of each island-like semiconductor layer. A plurality of, for example, two memory cells are disposed between the selection gate transistors. The tunnel oxide films of the memory cells are formed at the same time. The memory cells are connected in series along the island-like semiconductor layer. The gate insulating films of the selection gate transistors have the same thickness of the gate insulating films of the memory transistors.

This semiconductor memory device can be formed by the following production process. FIGS. 995 to 1004 and FIGS. 1005 to 1014 are sectional views taken on line A-A' and line B-B', respectively, in FIG. 1 which illustrates a memory cell array of an EEPROM.

Production steps of this example are the same as those of Production Example 45 (FIGS. 939 to 957 and FIGS. 967 to 985) until a polysilicon film 1524, for example, is deposited to 15 to 150 nm as a second conductive film and etched back to form a sidewall on the sidewall of the polysilicon film 1514 as the first conductive film.

Thereafter, a silicon nitride film 1360, for example, is buried as a sixteenth insulating film on the side of the silicon oxide film 1475 as the ninth insulating film or on the side of the silicon nitride film 1330 as the eleventh insulating film in the third trench 1230. Thereafter, a silicon oxide film 1490, for example, is deposited 100 to 500 nm as a fifteenth insulating film. Subsequently, the surface of the silicon oxide film 1490 is flattened, for example, by CMP (FIG. 995 to FIG. 1005) to expose the silicon nitride film 1320 as the tenth insulating film (FIG. 996 to FIG. 1006).

Figure 997:
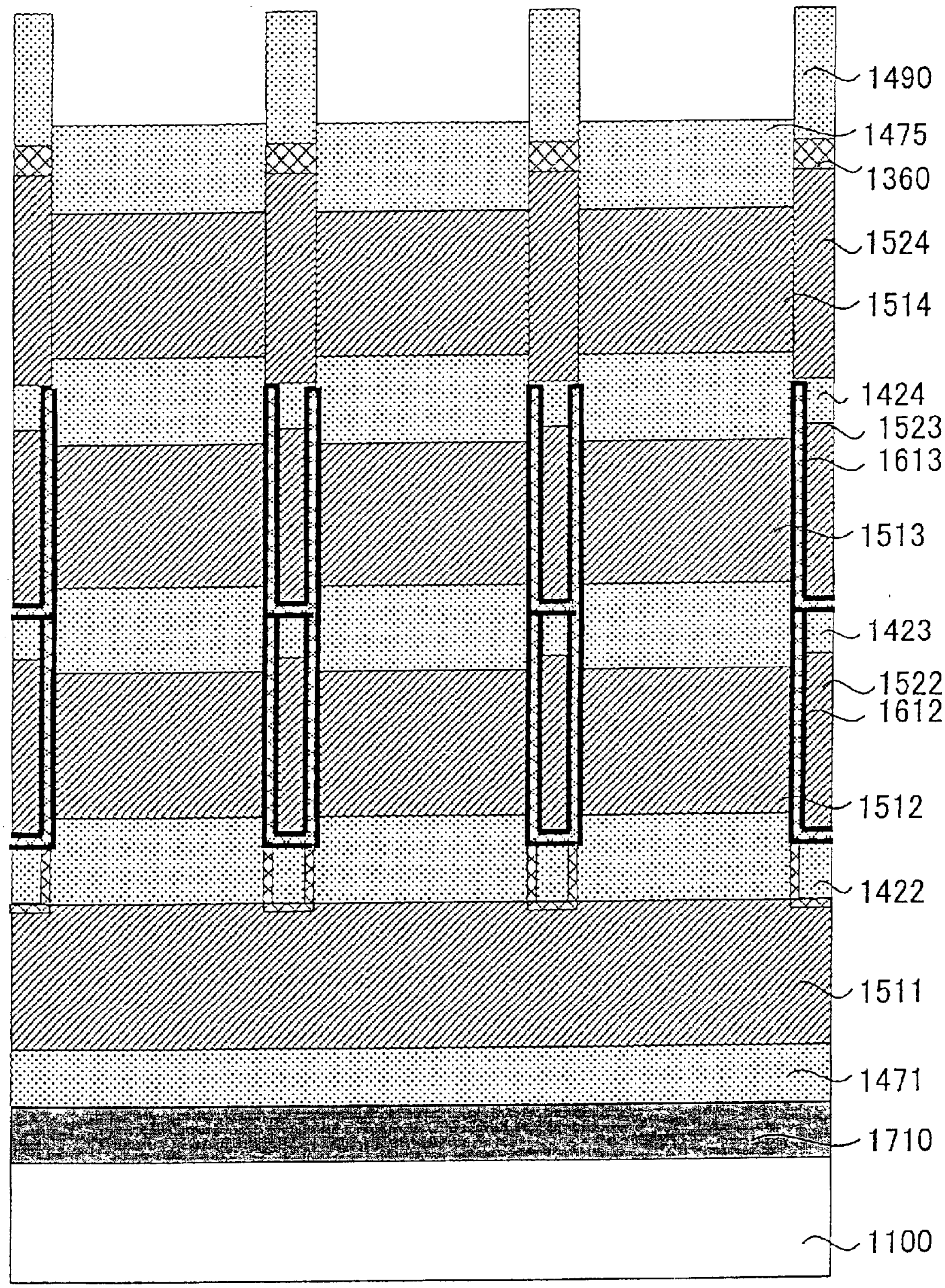

Subsequently, the silicon nitride film 1320 is selectively removed, for example, by anisotropic etching, to form a recess formed of the silicon oxide film 1490 and the silicon oxide film 1475 or the silicon nitride film 1360 (FIG. 997 and FIG. 1007).

Figure 998:
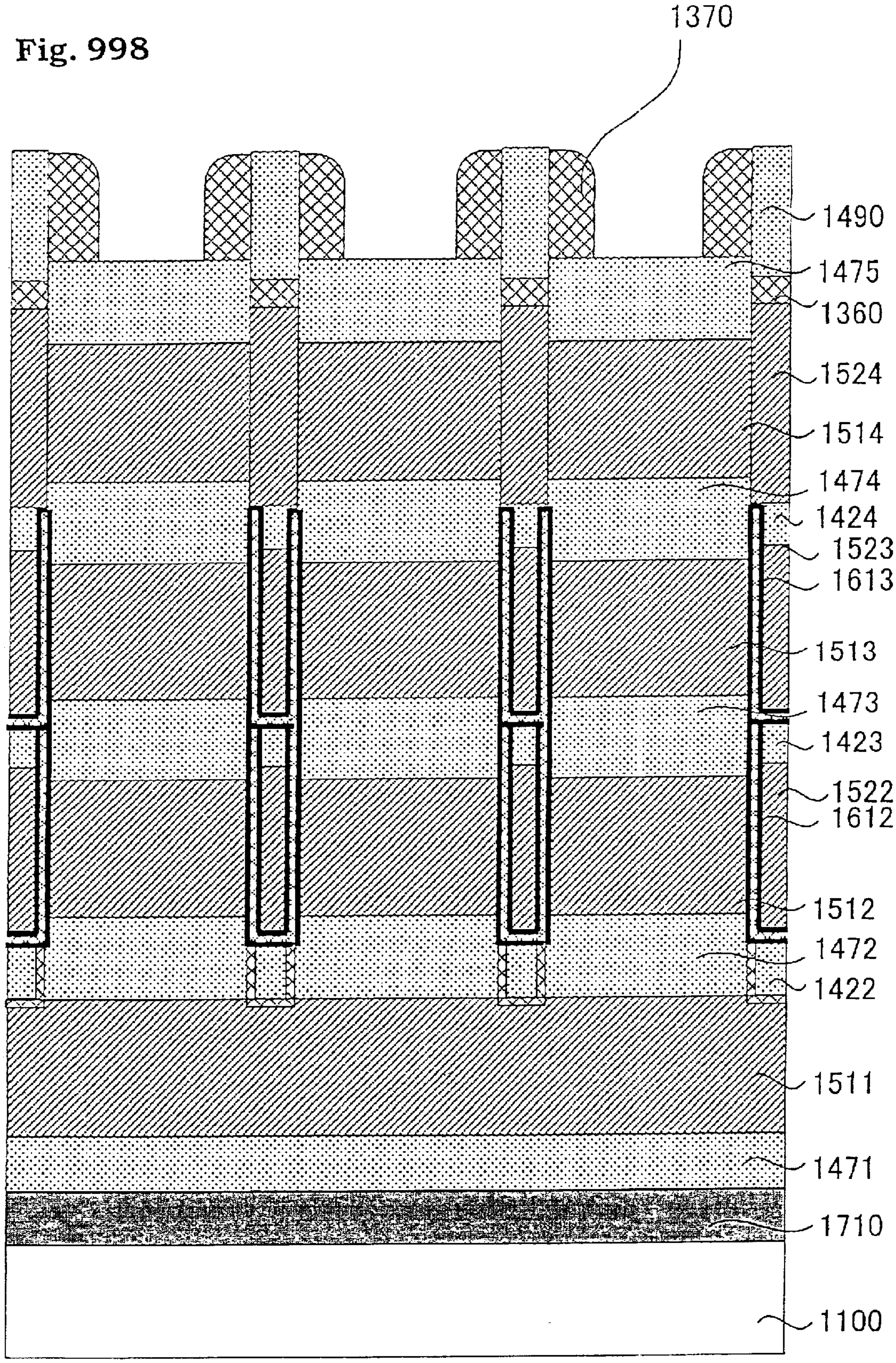
Figure 999:
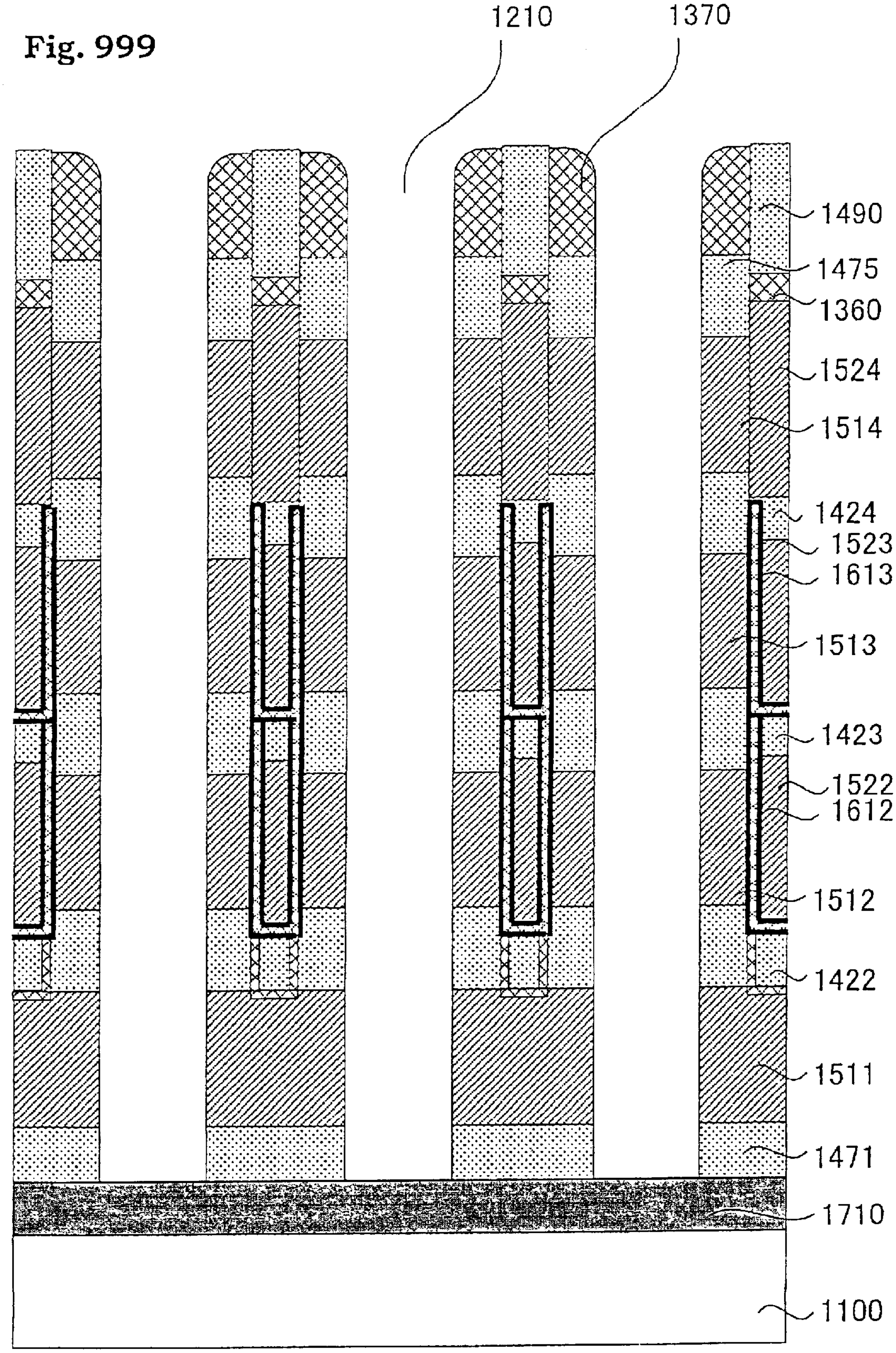

Next, a silicon nitride film 1370 is formed as a seventeenth insulating film in the form of a sidewall on the sidewall of the silicon oxide film 1490 (FIG. 998 and FIG. 1008). Using as a mask the silicon oxide film 1490 and the silicon nitride film 1370, the silicon oxide films 1472 to 1475 and the polysilicon films 1511 to 1514 are sequentially etched by anisotropic etching until the silicon oxide film 1471 is removed, i.e., until the surface of the P-type silicon substrate 1100 is exposed, to form a first trench 1210 (FIG. 999 and FIG. 1009).

When the silicon oxide films 1472 to 1475 are etched, the silicon oxide film 1490 is also removed. However, after the silicon nitride film 1360 is exposed, the sequential etching is performed using the silicon nitride film 1360 and the silicon nitride film 1370 as a mask.

Subsequently, a silicon oxide film 1440, for example, is formed as a third insulating film to be a tunnel oxide film of about 10 nm on the inner wall of the first trench 1210, for example, using CVD (FIG. 1000 and FIG. 1010). Here, the third insulating film 1440 is not particularly limited to a CVD oxide film, but may be a thermally oxidized film or a nitrogen oxide film.

Subsequently, the silicon oxide film 1440 located on the first impurity diffusion layer 1710 or on the P-type silicon substrate 1100 is selectively removed, for example, by anisotropic etching so that the silicon oxide film 1440 remains in the form of a sidewall only on the sidewall of the first trench 1210 (FIG. 1001 and FIG. 1011).

Thereafter, the silicon oxide film 1440 is treated, for example, by thermal treatment. This treatment can be conducted in the same manner as in Production Example 45.

Thereafter, the oxide film formed on the surface of the first impurity diffusion layer 1710 or on the P-type silicon substrate 1100 is optionally removed, for example, with diluted HF, and the first trench is filled with island-like semiconductor layers 1721 to 1725 and 1111 to 1114. For example, the semiconductor layers are selectively grown epitaxially from the first impurity diffusion layer 1710 or the P-type silicon substrate 1100 positioned at the bottom of the first trench 1210. At this time, from the bottom, an N-type semiconductor layer 1721, a P-type semiconductor layer 1111, an N-type semiconductor layer 1722, a P-type semiconductor layer 1112, an N-type semiconductor layer 1723, a P-type semiconductor layer 1113, an N-type semiconductor layer 1724, a P-type semiconductor layer 1114 and an N-type semiconductor layer 1725 are sequentially formed (FIG. 1002 and FIG. 1012). The concentration of the N-type semiconductor layers 1721 to 1725 is formed at an arsenic dose of about $1\times10^{18}$ to $1\times10^{21}/cm^3$, and the concentration of the P-type semiconductor layers 1111 to 1114 is formed at a boron dose of about $1\times10^{15}$ to $1\times10^{17}/cm^3$. Preferably, the N-type semiconductor layers 1721 and 1722 overlap each other with intervention of the polysilicon layer 1511 and the silicon oxide film 1440; the N-type semiconductor layers 1722 and 1723 overlap each other with intervention of the polysilicon layer 1512 and the silicon oxide film 1440; the N-type semiconductor layers 1723 and 1724 overlap each other with intervention of the polysilicon layer 1513 and the silicon oxide film 1440; and the N-type semiconductor layers 1724 and 1725 overlap each other with intervention of the polysilicon layer 1514 and the silicon oxide film 1440.

Thereafter, the N-type semiconductor layer 1725 is reduced, for example, by etch back or by CMP to expose the silicon nitride film 1360 and divide the N-type semiconductor layer. Thereafter, a fourth wiring layer is connected to the top of the N-type semiconductor layer 1725 so as to cross the direction of the second and third wiring layers.

Thereafter, an interlayer insulating film is formed by a known technique, and contact holes and metal wiring are formed. Thereby a semiconductor memory device is realized which has a memory function according to the state of a charge in the charge storage layer which is the floating gate made of the polysilicon film as the first conductive film.

In this production example, films formed on the surface of the polysilicon film such as the silicon nitride film (the second insulating film) 1342 may be formed of a layered film of a silicon oxide film/a silicon nitride film from the silicon surface. The impurity introduction into the polysilicon films 1511 to 1514 as the first conductive films and the polysilicon films 1521 to 1524 as the second conductive films may be performed when the polysilicon films are formed, after the polysilicon films are formed or after the sidewalls are formed. The timing of introducing the impurity is not limited so long as the conductive film is formed.

In this production example, the control gates of the memory cells are formed continuously in one direction without using a mask. However, that is possible only in the case where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

By providing the selection gates in the top and the bottom of a set of memory cells, it is possible to prevent the phenomenon that a memory cell transistor is over-erased.

PRODUCTION EXAMPLE 47

In a semiconductor memory device to be formed in this example, after regions where charge storage layers and selection gates are formed are to be pre-defined by laminated films including floating gates as charge storage layer, tunnel oxide films are formed in hole-form trenches opened using a photoresist mask. Island-like semiconductor layer are formed in the form of pillars by selective epitaxial silicon growth and are electrically floated with respect to a semiconductor substrate. Active regions of memory cells are electrically floated. In this semiconductor memory device, selection gate transistors are disposed at the top and at the bottom of each island-like semiconductor layer. A plurality of, for example, two memory cells are disposed between the selection gate transistors. The tunnel oxide films and interlayer insulating films of the memory cells are formed at the same time. The memory cells are connected in series along the island-like semiconductor layer. The gate insulating films of the selection gate transistors have the same thickness of the gate insulating films of the memory transistors.

This semiconductor memory device can be formed by the following production process. FIGS. 1015 to 1037 and FIGS. 1038 to 1060 are sectional views taken on line A-A' and line B-B', respectively, in FIG. 1 which illustrates a memory cell array of an EEPROM.

First, a first impurity diffusion layer 1710 is introduced into the P-type silicon substrate 1100 using ion implantation. For example, the ion implantation is performed at an implantation energy of 5 to 100 keV at an arsenic dose of about $1\times10^{14}$ to $1\times10^{16}/cm^2$ in a direction inclined about 0 to 7°. Alternatively, instead of ion implantation, an oxide film containing arsenic may be deposed by CVD and diffusion of arsenic from the oxide film may be utilized. Also the first impurity diffusion layer 1710 need not necessarily be introduced in the topmost surface of the P-type silicon substrate 1100.

Subsequently, using as a mask a resist film R4 patterned by a known photolithography technique (FIG. 1015 and FIG. 1038), the P-type silicon substrate 1100 are etched 200 to 2000 nm, for example, by RIE so as to divide the first impurity diffusion layer 1710 to form a second trench 1220.

After the resist film R4 is removed, a silicon oxide film 1420, for example, is deposited to 100 to 300 nm as a fifth insulating film in the second trench 1220 and etched back to be buried (FIG. 1016 and FIG. 1039). Means for burying the silicon oxide film 1420 is not particularly limited, and the silicon oxide film 1420 may be etched back using isotropic etching, etched back using anisotropic etching, buried by flattening using CMP or by a combination of these means. The silicon oxide film 1420 may be a silicon nitride film.

Subsequently, on the P-type silicon substrate 1100 or on the first impurity diffusion layer 1710, are sequentially formed a silicon nitride film 1381 as an eighteenth insulating film, a polysilicon film 1511 as a first conductive film, a silicon nitride film 1382 as an eighteenth insulating film, a polysilicon film 1512 as a first conductive film, a silicon nitride film 1383 as an eighteenth insulating film, a polysilicon film 1513 as a first conductive film, a silicon nitride film 1384 as an eighteenth insulating film, a polysilicon film 1514 as a first conductive film, and a silicon nitride film 1385 as an eighteenth insulating film, for example.

Subsequently, using as a mask a resist film R2 patterned by a known photolithography technique (FIG. 1017 and FIG. 1040), etching is performed, for example, by RIE until the silicon nitride film 1381 is reached, so as to form a third trench (FIG. 1018 and FIG. 1041).

Thereafter, the polysilicon films 1511 to 1514 are isotropically etched (FIG. 1019 and FIG. 1042) to reduce the diameter of the polysilicon films 1511 to 1514 as compared with the diameter of the silicon nitride films 1382 to 1385.

Subsequently, a silicon oxide film 1421 is deposited to 50 to 500 nm as a fifth insulating film by CVD in the third trench 1230. Thereafter, the silicon oxide film 1421 is buried almost to the height of the top of the polysilicon film 1511, for example, by isotropic etching (FIG. 1020 and FIG. 1043). A silicon nitride film 1390, for example, is deposited to about 10 to 200 nm as a nineteenth insulating film on the surface of the polysilicon films 1512 to 1514 and the silicon nitride films 1382 to 1385.

The silicon nitride film 1390 is anisotropically etched to form a sidewall (FIG. 1021 and FIG. 1004), and then, the silicon oxide film 1421 is removed by isotropic etching (FIG. 1022 and FIG. 1045).

Subsequently, a polysilicon film 1521, for example, is deposited to 100 to 500 nm as a second conductive film and is etched back to form a sidewall on the sidewall of the polysilicon film 1511 (FIG. 1023 and FIG. 1046). At this time, by setting the intervals between the third trenches 1230 to a predetermined value or smaller in the A-A' direction in FIG. 1, the polysilicon film 1521 is formed as a second wiring layer to be a selection gate line continuous in the direction without using a masking process.

Subsequently, a silicon oxide film 1421 is deposited 50 to 500 nm as a fifth insulating film in the third trench. The silicon oxide film 1421 is buried almost to the height of the top of the silicon nitride film 1382, for example, by isotropic etching (FIG. 1024 and FIG. 1047), and then, an interlayer insulating film 1612 is formed on the surface of the polysilicon films 1512 to 1514 and the silicon nitride films 1383 to 1385 (FIG. 1025 and FIG. 1048). This interlayer insulating film is formed of an ONO film, for example. The ONO film can be formed in the same manner as in Production Example 1.

Subsequently, a polysilicon film 1522 is deposited to about 100 to 500 nm as a second conductive film and is buried almost to the height of the top of the silicon nitride film 1384, for example, by isotropic etching (FIG. 1026 and FIG. 1049). Thereafter, the interlayer insulating film 1612 deposited on the surface of the polysilicon film 1514 and on the surface of the silicon nitride film 1385 is removed, for example, by isotropic etching (FIG. 1027 and FIG. 1050). Next, a polysilicon film 1524, for example, is deposited to about 100 to 500 nm as a second conductive film (FIG. 1028 and FIG. 1051).

Thereafter, the polysilicon films 1524 and 1522 are anisotropically etched in self-alignment with the interlayer insulating film 1612 deposited on the sidewalls of the silicon nitride film 1385 and the silicon nitride film 1384 (FIG. 1029 and FIG. 1052) so that the polysilicon film 1522 is buried in the recesses of the polysilicon films 1512 to 1513 sandwiched between the silicon nitride films 1382 to 1384, with intervention of the interlayer insulating film 1612.

Thereby, the polysilicon film 1522 is arranged on the side of the polysilicon film 1512 with intervention of the interlayer insulating film 1612, and the polysilicon film 1523 is arranged on the side of the polysilicon film 1513 with intervention of the interlayer insulating film 1612. The polysilicon film 1524 as the second conductive film need not necessarily be formed.

Subsequently, a polysilicon film 1532, for example, is deposited to about 50 to 200 nm as third conductive film and is etched back to form a sidewall on the side of the polysilicon film 1512 with intervention of the interlayer insulating film 1612 (FIG. 1030 and FIG. 1053). At this time, by setting the intervals between the third trenches 1230 to a predetermined value or smaller in the A-A' direction in FIG. 1, the polysilicon film 1532 is formed as a second wiring layer to be a selection gate line continuous in the direction without using a masking process.

Thereafter, a silicon oxide film 1422, for example, is deposited to 50 o 500 nm as a fifth insulting film, and then, is buried almost to the height of the top of the silicon nitride film 1383, for example, by isotropic etching. Thereafter, by repeating the above-described steps, a sidewall is formed of a polysilicon film 1533 as a third conductive film on the side of the polysilicon film 1513 with intervention of the interlayer insulating film 1513 (FIG. 1031 and FIG. 1054).

Next, a silicon oxide film 1423, for example, is deposited to 50 to 500 nm as a fifth insulating film. Subsequently, the silicon oxide film 1423 is buried almost to the height of the top of the silicon nitride film 1384, for example, by isotropic etching. Then a polysilicon film 1534, for example, is deposited to about 50 to 200 nm as a third conductive film, and then etched back to form a sidewall of the polysilicon film 1534 on the side of the polysilicon film 1513 (FIG. 1032 and FIG. 1055).

Thereafter, the silicon nitride film 1385 is removed by isotropic etching. A silicon oxide film 1491, for example, is deposited to about 50 to 500 nm as a twentieth insulating film. Using as a mask a resist film R1 patterned by a known photolithography technique (FIG. 1033 and FIG. 1056), etching is performed by RIE until reached the first impurity diffusion layer 1710, thereby to form a first trench 1210 (FIG. 1034 and FIG. 1057).

Subsequently, a silicon oxide film 1440, for example, is formed as a third insulating film to be a tunnel oxide film of about 10 nm in the inner wall of the first trench, for example, using CVD. Here, the third insulating film is not particularly limited to a CVD oxide film, but may be a thermally oxidized film or a nitrogen oxide film.

Thereafter, the silicon oxide film 1440 positioned on the first impurity diffusion layer 1710 is selectively removed, for example, by anisotropic etching so that the silicon oxide film 1440 remains in the form of a sidewall only on the sidewall of the first trench 1210 (FIG. 1035 and FIG. 1058).

Thereafter, the silicon oxide film 1440 is treated, for example, by thermal treatment. This treatment can be conducted in the same manner as in Production Example 45.

Thereafter, the oxide film formed on the surface of the first impurity diffusion layer 1710 is optionally removed, for example, with diluted HF, and the first trench 1210 is filled with island-like semiconductor layers 1721 to 1725 and 1111 to 1114. For example, the semiconductor layers are selectively grown epitaxially from the first impurity diffusion layer 1710 positioned at the bottom of the first trench 1210. At this time, from the bottom, an N-type semiconductor layer 1721, a P-type semiconductor layer 1111, an N-type semiconductor layer 1722, a P-type semiconductor layer 1112, an N-type semiconductor layer 1723, a P-type semiconductor layer 1113, an N-type semiconductor layer 1724, a P-type semiconductor layer 1114 and an N-type semiconductor layer 1725 are sequentially formed. The concentration of the N-type semiconductor layers 1721 to 1725 is formed at an arsenic dose of about $1\times10^{18}$ to $1\times10^{21}/cm^3$, and the concentration of the P-type semiconductor layers 1111 to 1114 is formed at a boron dose of about $1\times10^{15}$ to $1\times10^{17}/cm^3$. Preferably, the N-type semiconductor layers 1721 and 1722 overlap each other with intervention of the polysilicon layer 1511 and the silicon oxide film 1440; the N-type semiconductor layers 1722 and 1723 overlap each other with intervention of the polysilicon layer 1512 and the silicon oxide film 1440; the N-type semiconductor layers 1723 and 1724 overlap each other with intervention of the polysilicon layer 1513 and the silicon oxide film 1440; and the N-type semiconductor layers 1724 and 1725 overlap each other with intervention of the polysilicon layer 1514 and the silicon oxide film 1440.

Thereafter, the N-type semiconductor layer 1725 is reduced, for example, by etch back or by CMP to expose the silicon oxide film 1425 and divide the N-type semiconductor layer (FIG. 1036 and FIG. 1059).

Subsequently, a fourth wiring layer is connected to the top of the N-type semiconductor layer 1725 so as to cross the direction of the second and third wiring layers.

Thereafter, an interlayer insulating film is formed by a known technique, and contact holes and metal wiring are formed (FIG. 1037 and FIG. 1060).

Thereby a semiconductor memory device is realized which has a memory function according to the state of a charge in the charge storage layer which is the floating gate made of the polysilicon film as the first conductive film.

The impurity introduction into the polysilicon films 1511 to 1514 as the first conductive films, the polysilicon films 1521 to 1524 as the second conductive films and the polysilicon films 1532 to 1534 as the third conductive films may be performed when the polysilicon films are formed, after the polysilicon films are formed or after the sidewalls are formed. The timing of introducing the impurity is not limited so long as the conductive film is formed.

In this production example, the control gates of the memory cells are formed continuously in one direction without using a mask. However, that is possible only in the case where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

By providing the selection gates in the top and the bottom of a set of memory cells, it is possible to prevent the phenomenon that a memory cell transistor is over-erased.

PRODUCTION EXAMPLE 48

In a semiconductor memory device to be formed in this example, after regions where charge storage layers and selection gates are formed are to be pre-defined by laminated films including floating gates as charge storage layer, tunnel oxide films are formed in hole-form trenches opened using a photoresist mask. Island-like semiconductor layer are formed in the form of pillars by selective epitaxial silicon growth and are electrically floated with respect to a semiconductor substrate. Active regions of memory cells are electrically in common. In this semiconductor memory device, selection gate transistors are disposed at the top and at the bottom of each island-like semiconductor layer. A plurality of, for example, two memory cells are disposed between the selection gate transistors. The tunnel oxide films of the memory cells are formed at the same time. The memory cells are connected in series along the island-like semiconductor layer. The gate insulating films of the selection gate transistors have the same thickness of the gate insulating films of the memory transistors. Transfer gates are formed between the transistors for transferring potential to the active regions of the memory transistors.

This semiconductor memory device can be formed by the following production process. FIGS. 1061 to 1063 and FIGS. 1064 to 1066 are sectional views taken on line A-A' and line B-B', respectively, in FIG. 1 which illustrates a memory cell array of an EEPROM.

In this example, production steps are the same as those in Production Example 45 until the silicon nitride film 1320 as the tenth insulating film, the silicon nitride film 1330 as the eleventh insulating film, the silicon nitride film 1342 as the twelfth insulating film and the silicon nitride film 1350 as the fourteenth insulating film are exposed to divide the N-type semiconductor layer 1725 (FIG. 1061 and FIG. 1064).

Thereafter, isotropically etched are the silicon nitride film 1320 as the tenth insulating film, the silicon nitride film 1330 as the eleventh insulating film, the silicon nitride film 1342 as the twelfth insulating film, the silicon nitride film 1350 as the fourteenth insulating film, the silicon nitride films 1422, 1423, 1424 and 1425 as the fifth insulating films, and the silicon oxide films 1472, 1473, 1474 and 1475 as the ninth insulating film. At this time, the silicon oxide films 1472, 1473, 1474 and 1475 are removed, and further, the silicon oxide film 1440 as the third insulating film between the silicon oxide films 1472, 1473, 1474, 1475 and the island-like semiconductor layer 111 or the impurity diffusion layer 1721 or 1725 as the N-type semiconductor layer is removed (FIG. 1062 and FIG. 1065). Or the silicon oxide film 1440 as the third insulating film between the silicon oxide films 1472, 1473, 1474, 1475 and the island-like semiconductor layer 111 or the impurity diffusion layer 1721 or 1725 as the N-type semiconductor layer is removed. After the silicon oxide films 1472, 1473, 1474, 1475 are removed, and further, portions of the interlayer insulating film 1612 and 1613 exposed by the etching of the silicon oxide films 1472, 1473, 1474, 1475 are etched.

Subsequently, a silicon oxide film 1400, for example, is deposited to about 5 to 50 nm as a twenty-first insulating film, and then, a polysilicon film 1530, for example, is deposited to about 30 to 300 nm as a third conductive film. Thereafter, the polysilicon film 1530 is etched back to a degree such that at least the top surface of the impurity diffusion layer 1725 is exposed.

Next, a silicon oxide film 1426, for example, is deposited to about 50 to 500 nm as a twenty-second insulating film. Thereafter, the silicon oxide film 1426 is reduced by etch back or by CMP to expose the N-type semiconductor layer 1725.

Thereafter, a semiconductor memory device can be realized in accordance with Production Example 45 (FIG. 1063 and FIG. 1066).

PRODUCTION EXAMPLE 49

In this production example, a layered insulating film is used as the charge storage layer to realize charge storage by trapping in the layered insulating film, as shown in FIGS. 1067 to 1093 and FIGS. 1094 to 1120. FIGS. 1067 to 1093 and FIGS. 1094 to 1120 are sectional views taken on line A-A' and line B-B', respectively, in FIG. 12 which illustrates a memory cell array of an EEPROM.

First, on the surface of a P-type silicon substrate 1100, a silicon oxide film 1410, for example, is deposited to 2 to 20 nm as a first insulating film to be an implantation protection film, and a first impurity diffusion layer 1710 is introduced into the p-type silicon substrate 1100 using ion implantation (FIG. 1067 and FIG. 1094). For example, the ion implantation may be performed at an implantation energy of 5 to 100 keV at an arsenic dose of about $1\times10^{14}$ to $1\times10^{16}/cm^2$ in a direction inclined about 0 to 7°. Instead of the ion implantation, an oxide film containing arsenic may be deposited by CVD, and arsenic diffusion from the oxide film may be utilized. The first impurity diffusion layer 1710 need not necessarily be introduced on the topmost surface of the P-type silicon substrate 1100.

Subsequently, using as a mask a resist film R5 patterned by a known photolithography technique, the P-type silicon substrate 1100 are etched 200 to 2000 nm, for example, by RIE so as to divide the first impurity diffusion layer 1710 to form a second trench 1220 (FIG. 1068 and FIG. 1095).

After the resist film R5 is removed, a silicon oxide film 1420, for example, is deposited to 100 to 300 nm as a fifth insulating film in the second trench 1220 and etched back to be buried. Means for burying the silicon oxide film 1420 is not particularly limited, and the silicon oxide film 1420 may be etched back using isotropic etching, etched back using anisotropic etching, buried by flattening using CMP or by a combination of these means. The silicon oxide film 1420 may be a silicon nitride film. The silicon oxide film 1410 may be removed or may be retained. For example, in the case where the silicon oxide film 1410 is removed, a silicon oxide film 1471 is formed as a ninth insulating film on the P-type silicon substrate 1100 or on the first impurity diffusion layer 1710 (FIG. 1069 and FIG. 1096).

Thereafter, sequentially deposited are a polysilicon film 1511 as a first conductive film, a silicon oxide film 1472 as a ninth insulating film, a polysilicon film 1512 as a first conductive film, a silicon oxide film 1473 as a ninth insulating film, a polysilicon film 1513 as a first conductive film, a silicon oxide film 1474 as a ninth insulating film, a polysilicon film 1514 as a first conductive film, a silicon oxide film 1475 as a ninth insulating film, and a silicon nitride film 1320 as a tenth insulating film, for example (FIG. 1070 and FIG. 1097). At this time, the silicon oxide films 1471 to 1475 may have different thicknesses or may have the same thickness. The first conductive films 1511 to 1514 may have different thicknesses or may have the same thickness.

Thereafter, using as a mask a resist film R6 patterned by a known photolithography technique (FIG. 1071 and FIG. 1098), etching is performed to a degree such that the silicon oxide film 1475 is exposed, for example, by RIE (FIG. 1072 and FIG. 1099).

Next, a silicon nitride film 1330, for example, is formed in the form of a sidewall as an eleventh insulating film on the sidewall of the patterned silicon nitride film 1320 as the tenth insulating film (FIG. 1073 and FIG. 1100). Using the silicon nitride film 1320 and the silicon nitride film 1330 as a mask, the silicon oxide films 1472 to 1475 and the polysilicon films 1511 to 1514 are anisotropically etched sequentially (FIG. 1074 and FIG. 1101) until the time when the first conductive film 1511 is removed, i.e., until the silicon oxide film 1471 is exposed, to form a third trench 1230.

Subsequently, a polysilicon film 1521, for example, is deposited to 20 to 200 nm as a second conductive film (FIG. 1075 and FIG. 1102).

Next, the polysilicon film 1521 is etched back to form a sidewall on the sidewall of the polysilicon film 1511 (FIG. 1076 and FIG. 1103). At this time, by setting the intervals between the third trenches 1230 to a predetermined value or smaller in the A-A' direction in FIG. 12, the polysilicon film 1521 is formed as a second wiring layer to be a selection gate line continuous in the direction without using a masking process.

Thereafter, a silicon nitride film 1342, for example, is deposited to 10 to 100 nm as a twelfth insulating film (FIG. 1077 and FIG. 1104), and a silicon oxide film 1422, for example, is deposited to 50 to 500 nm as a fifth insulating film by CVD. Thereafter, the silicon oxide film 1422 is buried almost to the height of the sidewall of the silicon oxide film 1472, for example, by isotropic etching (FIG. 0178 and FIG. 1105). The exposed silicon nitride film 1342 as the twelfth insulating film is removed, and then, a polysilicon film 1522, for example, is deposited 20 to 200 nm as a second conductive film.

Subsequently, the polysilicon film 1522 is etched back to form a sidewall on the sidewall of the polysilicon film 1512 (FIG. 1079 and FIG. 1106). At this time, by setting the intervals between the third trenches 1230 to a predetermined value or smaller in the A-A' direction in FIG. 10, the polysilicon film 1522 is formed as a third wiring layer to be a control gate line continuous in the direction without using a masking process.

Thereafter, a silicon nitride film 1343, for example, is deposited to 10 to 100 nm as a twelfth insulating film, and a silicon oxide film 1423, for example, is deposited to 50 to 500 nm as a fifth insulating film by CVD. Subsequently, the silicon oxide film 1423 is buried almost to the height of the sidewall of the silicon oxide film 1473, for example, by isotropic etching. The exposed silicon nitride film 1343 as the twelfth insulating film is removed (FIG. 1080 and FIG. 1107).

Subsequently, in the same manner, a polysilicon film 1523, for example, is deposited to 20 to 200 nm as a second conductive film and is etched back to form a sidewall on the sidewall of the polysilicon film 1513.

Further, a silicon nitride film 1344, for example, is deposited to 10 to 100 nm as a twelfth insulating film, and a silicon oxide film 1424, for example, is deposited to 50 to 500 nm as a fifth insulating film by CVD.

Thereafter, the silicon oxide film 1424 is buried almost to the height of the sidewall of the silicon oxide film 1474, for example, by isotropic etching. The exposed silicon nitride film 1344 as the twelfth insulating film is removed. A polysilicon film 1524, for example, is deposited to 20 to 200 nm as a second conductive film and is etched back to form a sidewall on the sidewall of the polysilicon film 1514.

Next, a silicon nitride film 1345, for example, is deposited to 10 to 100 nm as a twelfth insulating film, and a silicon oxide film 1425, for example, is deposited to 50 to 500 nm as a fifth insulating film by CVD. Thereafter, the oxide film 1425 is buried almost to the height of the sidewall of the silicon oxide film 1475, for example, by isotropic etching. The exposed silicon nitride film 1345 as the twelfth insulating film is removed (FIG. 1081 and FIG. 1108).

Subsequently, a silicon nitride film 1350, for example, is deposited to 50 to 500 nm as a fourteenth insulating film. Thereafter, the surface of the silicon nitride film 1350 is flattened by CMP (FIG. 1082 and FIG. 1109). Using as a mask a resist film R7 patterned by a known photolithography (FIG. 1083 and FIG. 1110), the silicon nitride film 1350, the silicon nitride film 1330 or the silicon nitride film 1310 is patterned by etching, for example, by RIE.

Further, the silicon oxide films 1471 to 1475 and the polysilicon films 1511 to 1514 are sequentially etched, for example, by anisotropic etching until the silicon oxide film 1471 is removed, i.e., until the surface of the P-type silicon substrate 1100 is exposed, to form a first trench 1210 (FIG. 1084 and FIG. 1111).

Subsequently, a silicon oxide film 1441, for example, is formed as a third insulting film to be a tunnel oxide film of about 10 nm on the inner wall of the first trench 1210, for example, using CVD (FIG. 1085 and FIG. 1112). Here, the third insulating film 1441 is not particularly limited to a CVD oxide film, but may be a thermally oxidized film or a nitrogen oxide film.

Next, the silicon oxide film 1441 positioned on the first impurity diffusion layer 1710 or the P-type silicon substrate 1100 is selectively removed, for example, by anisotropic etching, so that the silicon oxide film 1441 remains in the form of a sidewall only on the sidewall of the first trench 1210 (FIG. 1086 and FIG. 1113).

Subsequently, the silicon oxide film 1441 is treated, for example, by thermal treatment. This treatment can be conducted in the same manner as in Production Example 45.

Thereafter, the oxide film formed on the surface of the first impurity diffusion layer 1710 or on the P-type silicon substrate 1100 is optionally removed, for example, with diluted HF, and the first trench 1210 is filled with island-like semiconductor layers 1721, 1722-1 and 1111. For example, the semiconductor layers are selectively grown epitaxially from the first impurity diffusion layer 1710 or the P-type silicon substrate 1100 positioned at the bottom of the first trench 1210. At this time, from the bottom, an N-type silicon layer 1721, a P-type silicon layer 1111 and an N-type silicon layer 1722-1 are sequentially formed (FIG. 1087 and FIG. 1114). The concentration of the N-type silicon layers 1721 to 1722-1 is formed at an arsenic dose of about $1\times10^{18}$ to $1\times10^{21}/cm^3$, and the concentration of the P-type silicon layer 1111 is formed at a boron dose of about $1\times10^{15}$ to $1\times10^{17}/cm^3$. Preferably, the N-type silicon layers 1721 and 1722-1 overlap the polysilicon layer 1511 as the first conductive film with intervention of the silicon oxide film 1441 as the third insulating film.

Subsequently, using the N-type semiconductor layer 1722-1 as a mask, the exposed silicon oxide film 1441 is removed, for example, by isotropic etching (FIG. 1088 and FIG. 1115), and then, a layered insulating film 1620 to be a charge storage layer is formed on the inner wall of the first trench 1210 (FIG. 229 and FIG. 256). Here, in the case where the layered insulating film is of MNOS structure, a silicon nitride film of 4 to 10 nm and a silicon oxide film of 2 to 5 nm may be sequentially formed on the surface of the polysilicon film by CVD, for example. Alternatively, a silicon nitride film of 4 to 10 nm may be deposited on the surface of the polysilicon film by CVD, and then the surface of the silicon nitride film may be oxidized to form a silicon oxide film of 2 to 5 nm. In the case where the layered insulating film is of MONOS structure, a silicon oxide film of 2 to 5 nm by CVD, a silicon nitride film of 4 to 8 nm by CVD and a silicon oxide film of 2 to 5 nm may be sequentially formed on the surface of the polysilicon film. Or a silicon oxide film of 2 to 5 nm and a silicon nitride film of 4 to 8 nm by CVD may be sequentially formed on the surface of the polysilicon film, and then the surface of the silicon nitride film may be oxidized to form a silicon oxide film of 2 to 5 nm. Or the surface of the polysilicon film may be oxidized to form a silicon oxide film of 2 to 5 nm. The above-described techniques may be combined in various way.

Subsequently, the layered insulating film 1620 positioned on the N-type semiconductor layer is selectively removed, for example, by isotropic etching so that the layered insulating film 1620 remains in the form of a sidewall only on the sidewall of the first trench 1210 (FIG. 1090 and FIG. 1117)

Thereafter, the layered insulating film 1620 may be treated, for example, by thermal treatment.

Subsequently, in the same manner as described above, the first trench 1210 is filled with island-like semiconductor layers 1722-2 to 1724-1 and 1112 to 1113. For example, the semiconductor layers are selectively grown epitaxially from the island-like semiconductor layer 1722-1 positioned at the bottom of the first trench 1210. At this time, from the bottom, an N-type semiconductor layer 1722-1, a P-type semiconductor layer 1112, an N-type semiconductor layer 1723, a P-type semiconductor layer 1113 and an N-type semiconductor layer 1724-1 are sequentially formed. As previously described, the concentration of the N-type semiconductor layers 1722-2 to 1724-1 is formed at an arsenic dose of about $1\times10^{18}$ to $1\times10^{21}/cm^3$, and the concentration of the P-type semiconductor layers 1112 to 1113 is formed at a boron dose of about $1\times10^{15}$ to $1\times10^{17}/cm^3$. Preferably, the N-type semiconductor layers 1722-2 and 1723 overlap the polysilicon layer 1512 as the first conductive film with intervention of the layered insulating film 1620. Likewise the N-type semiconductor layers 1723 and 1724-1 preferably overlap the polysilicon layer 1513 as the first conductive film with intervention of the layered insulating film 1620. Further, preferably the N-type semiconductor layer 1724-1 is so formed not to overlap the polysilicon film 1514 as the first conductive layer. Thereafter, the layered insulating film 1620 is partially removed using the N-type semiconductor film 1724-1 as a mask.

Subsequently, a silicon oxide film 1444, for example, is formed as a third insulating film to be a gate oxide film of about 10 nm on the inner wall of the first trench 1210, for example, using CVD. Here, the third insulating film 1444 is not particularly limited to a CVD oxide film, but may be a thermally oxidized film or a nitrogen oxide film.

Subsequently, the silicon oxide film 1444 positioned on the island-like semiconductor layer 1724-1 is selectively removed, for example, by anisotropic etching so that the silicon oxide film 1444 remains in the form of a sidewall on the sidewall of the first trench 1210. Thereafter, the silicon oxide film 1444 is treated, for example, by thermal treatment.

Subsequently, in the same manner as described above, the first trench 1210 is filled with island-like semiconductor layers 1724-2 to 1725 and 1114. For example, the semiconductor layers are selectively grown epitaxially from the island-like semiconductor layer 1724-1 positioned at the bottom of the first trench 1210. At this time, from the bottom, an N-type semiconductor layer 1724-2, a P-type semiconductor layer 1114 and an N-type semiconductor layer 1725 are sequentially formed (FIG. 1091 and FIG. 1118). As previously described, the concentration of the N-type semiconductor layers 1724-2 to 1725 is formed at an arsenic dose of about $1\times10^{18}$ to $1\times10^{21}/cm^3$, and the concentration of the P-type semiconductor layer 1114 is formed at a boron dose of about $1\times10^{15}$ to $1\times10^{17}/cm^3$. Preferably, the N-type semiconductor layers 1724-2 and 1725 overlap the polysilicon layer 1514 as the first conductive film with intervention of the silicon oxide film 1444 as the third insulating film.

Subsequently, the N-type semiconductor layer 1725 is reduced, for example, by etch back or by CMP to expose the silicon oxide film 1425 as the fifth insulating film and divide the N-type semiconductor layer 1725.

Thereafter, a fourth wiring layer is connected to the top of the N-type semiconductor layer 1725 so that the fourth wiring layer crosses the direction of the second wiring layer or the third wiring layer.

Further, by a known technique, an interlayer insulating film is formed, and contact holes and metal wiring are formed.

Thereby, a semiconductor memory device is realized which has a memory function according to the state of a charge in the charge storage layer which is formed of the layered insulating film.

The impurity introduction into the polysilicon films 1511 to 1514 as the first conductive films and the polysilicon films 1522 to 1523 as the second conductive films may be performed when the polysilicon films are formed, after the polysilicon films are formed or after the sidewalls are formed. The timing of introducing the impurity is not limited so long as the conductive film is formed.

In this production example, the control gates of the memory cells are formed continuously in one direction without using a mask. However, that is possible only in the case where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

By providing the selection gates in the top and the bottom of a set of memory cells, it is possible to prevent the phenomenon that a memory cell transistor is over-erased.

PRODUCTION EXAMPLE 50

In this production example, a semiconductor memory device has a plurality of memory cells using MIS capacitors as the charge storage layers, as shown in FIGS. 1121 to 1143 and FIGS. 1144 to 1166. FIGS. 1121 to 1143 and FIGS. 1144 to 1166 are sectional views taken on line A-A' and line B-B', respectively, in FIG. 13 which illustrates a memory cell array of an EEPROM.

First, on the surface of a P-type silicon substrate 1100, a silicon oxide film 1410, for example, is deposited to 2 to 20 nm as a first insulating film to be an implantation protection film, and a first impurity diffusion layer 1710 is introduced into the p-type silicon substrate 1100 using ion implantation (FIG. 1121 and FIG. 1144). For example, the ion implantation may be performed at an implantation energy of 5 to 100 keV at an arsenic dose of about $1\times10^{14}$ to $1\times10^{16}/cm^2$ in a direction inclined about 0 to 7°. Instead of the ion implantation, an oxide film containing arsenic may be deposited by CVD, and arsenic diffusion from the oxide film may be utilized. The first impurity diffusion layer 1710 need not necessarily be introduced on the topmost surface of the P-type silicon substrate 1100.

Subsequently, using as a mask a resist film R5 patterned by a known photolithography technique, the P-type silicon substrate 1100 are etched 200 to 2000 nm, for example, by RIE so as to divide the first impurity diffusion layer 1710 to form a second trench 1220 (FIG. 1122 and FIG. 1145).

After the resist film R5 is removed, a silicon oxide film 1420, for example, is deposited to 100 to 300 nm as a fifth insulating film in the second trench 1220 and etched back to be buried. Means for burying the silicon oxide film 1420 is not particularly limited, and the silicon oxide film 1420 may be etched back using isotropic etching, etched back using anisotropic etching, buried by flattening using CMP or by a combination of these means. The silicon oxide film 1420 may be a silicon nitride film. The silicon oxide film 1410 may be removed or may be retained. For example, in the case where the silicon oxide film 1410 is removed, a silicon oxide film 1471 is formed as a ninth insulating film on the P-type silicon substrate 1100 or on the first impurity diffusion layer 1710 (FIG. 1123 and FIG. 1146).

Thereafter, sequentially deposited are a polysilicon film 1511 as a first conductive film, a silicon oxide film 1472 as a ninth insulating film, a polysilicon film 1512 as a first conductive film, a silicon oxide film 1473 as a ninth insulating film, a polysilicon film 1513 as a first conductive film, a silicon oxide film 1474 as a ninth insulating film, a polysilicon film 1514 as a first conductive film, a silicon oxide film 1475 as a ninth insulating film, and a silicon nitride film 1320 as a tenth insulating film, for example (FIG. 1124 and FIG. 1147). At this time, the silicon oxide films 1471 to 1475 may have different thicknesses or may have the same thickness. The first conductive films 1511 to 1514 may have different thicknesses or may have the same thickness.

Thereafter, using as a mask a resist film R6 patterned by a known photolithography technique (FIG. 1125 and FIG. 1148), etching is performed to a degree such that the silicon oxide film 1475 is exposed, for example, by RIE (FIG. 1126 and FIG. 1149).

Next, a silicon nitride film 1330, for example, is formed in the form of a sidewall as an eleventh insulating film on the sidewall of the patterned silicon nitride film 1320 as the tenth insulating film (FIG. 1127 and FIG. 1150). Using the silicon nitride film 1320 and the silicon nitride film 1330 as a mask, the silicon oxide films 1472 to 1475 and the polysilicon films 1511 to 1514 are anisotropically etched sequentially (FIG. 1128 and FIG. 1151) until the first conductive film 1511 is removed, i.e., until the silicon oxide film 1472 is exposed, to form a third trench 1230.

Subsequently, a polysilicon film 1521, for example, is deposited to 20 to 200 nm as a second conductive film (FIG. 1129 and FIG. 1152).

Next, the polysilicon film 1521 is etched back to form a sidewall on the sidewall of the polysilicon film 1511 (FIG. 1130 and FIG. 1153). At this time, by setting the intervals between the third trenches 1230 to a predetermined value or smaller in the A-A' direction in FIG. 13, the polysilicon film 1521 is formed as a second wiring layer to be a selection gate line continuous in the direction without using a masking process.

Thereafter, a silicon nitride film 1342, for example, is deposited to 10 to 100 nm as a twelfth insulating film (FIG. 1131 and FIG. 1154), and a silicon oxide film 1422, for example, is deposited to 50 to 500 nm as a fifth insulating film by CVD. Thereafter, the silicon oxide film 1422 is buried almost to the height of the sidewall of the silicon oxide film 1472, for example, by isotropic etching (FIG. 1132 and FIG. 1155). The exposed silicon nitride film 1342 as the twelfth insulating film is removed, and then, a polysilicon film 1522, for example, is deposited 20 to 200 nm as a second conductive film.

Subsequently, the polysilicon film 1522 is etched back to form a sidewall on the sidewall of the polysilicon film 1512 (FIG. 1133 and FIG. 1156). At this time, by setting the intervals between the third trenches 1230 to a predetermined value or smaller in the A-A' direction in FIG. 13, the polysilicon film 1522 is formed as a third wiring layer to be a control gate line continuous in the direction without using a masking process.

Thereafter, a silicon nitride film 1343, for example, is deposited to 10 to 100 nm as a twelfth insulating film, and a silicon oxide film 1423, for example, is deposited to 50 to 500 nm as a fifth insulating film by CVD. Subsequently, the silicon oxide film 1423 is buried almost to the height of the sidewall of the silicon oxide film 1473, for example, by isotropic etching. The exposed silicon nitride film 1343 as the twelfth insulating film is removed (FIG. 1134 and FIG. 1157).

Further, in the same manner, a polysilicon film 1523, for example, is deposited to 20 to 200 nm as a second conductive film and is etched back to form a sidewall on the sidewall of the polysilicon film 1513. Next, a silicon nitride film 1344, for example, is deposited to 10 to 100 nm as a twelfth insulating film, and a silicon oxide film 1424, for example, is deposited to 50 to 500 nm as a fifth insulating film by CVD. Thereafter, the silicon oxide film 1424 is buried almost to the height of the sidewall of the silicon oxide film 1474, for example, by isotropic etching. The exposed silicon nitride film 1344 as the twelfth insulating film is removed.

A polysilicon film 1524, for example, is deposited to 20 to 200 nm as a second conductive film and is etched back to form a sidewall on the sidewall of the polysilicon film 1514. Next, a silicon nitride film 1345, for example, is deposited to 10 to 100 nm as a twelfth insulating film, and a silicon oxide film 1425, for example, is deposited to 50 to 500 nm as a fifth insulating film by CVD. Thereafter, the oxide film 1425 is buried almost to the height of the sidewall of the silicon oxide film 1475, for example, by isotropic etching. The exposed silicon nitride film 1345 as the twelfth insulating film is removed (FIG. 1135 and FIG. 1158).

Subsequently, a silicon nitride film 1350, for example, is deposited to 50 to 500 nm as a fourteenth insulating film. Thereafter, the surface of the silicon nitride film 1350 is flattened by CMP (FIG. 1136 and FIG. 1159). Using as a mask a resist film R7 patterned by a known photolithography technique (FIG. 1137 and FIG. 1160), the silicon nitride film 1350, the silicon nitride film 1330 or the silicon nitride film 1310 is patterned by etching, for example, by RIE.

Further, the silicon oxide films 1471 to 1475 and the polysilicon films 1511 to 1514 are sequentially etched, for example, by anisotropic etching until the silicon oxide film 1471 is removed, i.e., until the surface of the P-type silicon substrate 1100 is exposed, to form a first trench 1210 (FIG. 1138 and FIG. 1161).

Subsequently, a silicon oxide film 1440, for example, is formed as a third insulting film to be a tunnel oxide film of about 10 nm on the inner wall of the first trench 1210, for example, using CVD (FIG. 1139 and FIG. 1162). Here, the third insulating film 1440 is not particularly limited to a CVD oxide film, but may be a thermally oxidized film or a nitrogen oxide film.

Next, the silicon oxide film 1440 positioned on the first impurity diffusion layer 1710 or the P-type silicon substrate 1100 is selectively removed, for example, by anisotropic etching, so that the silicon oxide film 1440 remains in the form of a sidewall only on the sidewall of the first trench 1210 (FIG. 1140 and FIG. 1163).

Thereafter, the silicon oxide film 1440 is treated, for example, by thermal treatment. This treatment can be conducted in the same manner as in Production Example 1.

Subsequently, the oxide film formed on the surface of the first impurity diffusion layer 1710 or on the P-type silicon substrate 1100 is optionally removed, for example, with diluted HF, and the first trench 1210 is filled with island-like semiconductor layers 1721, 1725, 1726, 1727 and 1111 to 1113. For example, the semiconductor layers are selectively grown epitaxially from the first impurity diffusion layer 1710 or the P-type silicon substrate 1100 positioned at the bottom of the first trench 1210. At this time, from the bottom, an N-type silicon layer 1721, a P-type silicon layer 1111, an N-type silicon layer 1726, a P-type silicon layer 1112, an N-type silicon layer 1727, a P-type silicon layer 1113 and an N-type silicon layer 1725 are sequentially formed (FIG. 1141 and FIG. 1164). The concentration of the N-type silicon layers 1721, 1725, 1726 and 1727 is formed at an arsenic dose of about $1\times10^{18}$ to $1\times10^{21}/cm^3$, and the concentration of the P-type silicon layers 1111 to 1113 is formed at a boron dose of about $1\times10^{15}$ to $1\times10^{17}/cm^3$. Preferably, the N-type silicon layers 1721 and 1726 overlap the polysilicon layer 1511 as the first conductive film with intervention of the silicon oxide film 1440 as the third insulating film, and the N-type silicon layers 1725 and 1727 overlap the polysilicon layer 1514 as the first conductive film with intervention of the silicon oxide film 1440 as the third insulating film. Preferably the P-type silicon layer 1112 does not overlap either the polysilicon film 1512 as the first conductive film or the polysilicon film 1513 as the first conductive film.

Thereafter, the N-type semiconductor layer 1725 is reduced, for example, by etch back or by CMP to expose the silicon oxide film 1425 as the fifth insulating film and divide the N-type semiconductor layer 1725 (FIG. 1142 and FIG. 1165).

Further, a fourth wiring layer is connected to the top of the N-type semiconductor layer 1725 so that the fourth wiring layer crosses the direction of the second wiring layer or the third wiring layer.

Thereafter, by a known technique, an interlayer insulating film is formed, and contact holes and metal wiring are formed (FIG. 1143 and FIG. 1166).

Thereby, two pairs of DRAM elements can be formed in the island-like semiconductor layer, the DRAM element having a one-transistor/one-capacitor structure using an MIS capacitor as the charge storage layer.

The impurity introduction into the polysilicon films 1511 to 1514 as the first conductive films and the polysilicon films 1522 to 1523 as the second conductive films may be performed when the polysilicon films are formed, after the polysilicon films are formed or after the sidewalls are formed. The timing of introducing the impurity is not limited so long as the conductive film is formed.

In this production example, the control gates of the memory cells are formed continuously in one direction without using a mask. However, that is possible only in the case where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

PRODUCTION EXAMPLE 51

In this production example, a semiconductor memory device has a structure in which a plurality of memory cells uses floating gates as the charge storage layers; selection gate transistors arranged at the top and the bottom of each island-like semiconductor layer; a plurality of, for example, two memory transistors are arranged between the selection gate transistor; tunnel oxide films of memory transistors are formed at the same time and are connected along the island-like semiconductor layer; gate insulating films of the selection gate transistors have the same thickness as gate insulation films of the memory transistors, as shown in FIGS. 1167 to 1168 and FIGS. 1169 to 1170. FIGS. 1167 to 1168 and FIGS. 1169 to 1170 are sectional views taken on line A-A' and line B-B', respectively, in FIG. 1 which illustrates a memory cell array of an EEPROM.

In this production example, production steps are the same as those in Production Example 45 (FIGS. 939 to 966 and FIGS. 967 to 994) until the N-type semiconductor layer 1721, the P-type semiconductor 1111 and the N-type semiconductor 1722 are arranged from the first trench 1210. However, the silicon oxide film 1473 as the ninth insulating film is controlled to have a thickness of about 20 to 40 nm when deposited, or after a polysilicon film 1512 is deposited as the first conductive film, a thermally oxidized film is formed in a thickness of about 20 to 40 nm. At this time, by setting, at 20 to 30 nm, the interval between the polysilicon films 1512 and 1513 as the first conductive films which are the floating gates of the memory cells, it becomes unnecessary to form, among the island-like semiconductor layers 1721 to 1725 to be formed in the first trench 1210 in a later step, an N-type semiconductor layer 1723 between the memory cells (FIG. 1167 and FIG. 1169).

As another production example, production steps are conducted in the same manner as in Production Example 45 until the N-type semiconductor layer 1721 is arranged from the first trench 1210, but the silicon oxide films 1472 to 1474 are controlled to have a thickness of about 20 to 40 nm when deposited, or every time after the polysilicon films 1511 to 1513 are deposited, thermally oxidized films are formed in a thickness of about 20 to 40 nm. At this time, by setting, at 20 to 30 nm, the intervals between the polysilicon films 1511 and 1512, 1512 and 1513, and 1513 and 1514 as the first conductive films which are the floating gates of the memory cells, it becomes unnecessary to form, among the island-like semiconductor layers 1721 to 1725 to be formed in the first trench 1210 in a later step, impurity diffusion layers 1722, 1723, 1724 between the selection gates and the memory cells (FIG. 1168 and FIG. 1170).

PRODUCTION EXAMPLE 52

In this production example, a semiconductor memory device has a structure in which a plurality of floating gates are formed as the charge storage layers; selection gate transistors are formed, and then tunnel oxide films are formed; island-like semiconductor layers are formed in the form of pillars by selective epitaxial silicon growth and are electrically floated with respect to the semiconductor substrate; active regions of the memory cells are electrically floated; two memory cells are arranged on each island-like semiconductor layer; the tunnel oxide films of the memory transistors are formed at the same time; and the transistors are connected in series along the island-like semiconductor layer, as shown in FIG. 1171 and FIG. 1172. FIG. 1171 and FIG. 1172 are sectional views taken on line A-A' and line B-B', respectively, in FIG. 1 which illustrates a memory cell array of an EEPROM.

In this example, production step are the same as those of Production Example 45, except that, after the silicon oxide film 1473 is deposited as the ninth insulating film, without depositing the silicon oxide films 1474 and 1475 as the ninth insulating films and the polysilicon films 1513 and 1514 as the first conductive films, the silicon nitride film 1320 is deposited as the tenth insulating film and the polysilicon films 1521 and 1522 are arranged as the second conductive films on the sidewalls of the polysilicon films 1511 and 1522 as the first conductive films with intervention of interlayer insulating films 1612 and 1613. Thereby two memory transistors are arranged on the island-like semiconductor layer. A semiconductor memory device is realized which has a memory function according to the state of a charge in the charge storage layer which is the floating gate made of the polysilicon film as the first conductive film (FIG. 1171 and FIG. 117).

PRODUCTION EXAMPLE 53

In this production example, a semiconductor memory device has a structure in which a plurality of floating gates are formed as the charge storage layers on a semiconductor of a semiconductor substrate into which an oxide film is inserted, e.g., a SOI substrate; selection gates and control gates are formed, and then, tunnel oxide films are formed; island-like semiconductor layers are formed in the form of pillars by selective epitaxial silicon growth and are electrically floated with respect to the semiconductor substrate; active regions of the memory cells are electrically floated; selection gate transistors are arranged at the top and the bottom of each island-like semiconductor layer; a plurality of, for example, two memory transistors are arranged between the selection gate transistors; the tunnel oxide films of the transistors are formed at the same time; the transistors are connected in series along the island-like semiconductor layer; and the gate insulating films of the selection gate transistors have the same thickness as the gate insulating films of the memory transistors, as shown in FIG. 1173 and FIG. 1174. FIG. 1173 and FIG. 1174 are sectional views taken on line A-A' and line B-B', respectively, in FIG. 1 which illustrates a memory cell array of an EEPROM.

This production example is substantially the same as Production Example 45 except that the SOI substrate is used.

Also by this production example, the same effect as of Production Example 45 can be obtained. Further the junction capacity of the impurity diffusion layer 1710 and the first wiring layer is suppressed or eliminated. The use of a SOI substrate as the substrate is applicable to all the examples of the present invention.

PRODUCTION EXAMPLE 54

In this production example, a semiconductor memory device has a structure in which a plurality of floating gates are formed as the charge storage layers; selection gates and control gates are formed, and then, tunnel oxide films are formed; island-like semiconductor layers are formed in the form of pillars by selective epitaxial silicon growth and are electrically floated with respect to the semiconductor substrate; active regions of the memory cells are electrically floated; selection gate transistors are arranged at the top and the bottom of each island-like semiconductor layer; a plurality of, for example, two memory transistors are arranged between the selection gate transistors; the tunnel oxide films of the transistors are formed at the same film; the transistors are connected in series along the island-like semiconductor layer; and the gate insulating films of the selection gate transistors have larger than the thickness as the gate insulating films of the memory transistors, as shown in FIG. 1175 and FIG. 1176. FIG. 1175 and FIG. 1176 are sectional views taken on line A-A' and line B-B', respectively, in FIG. 1 which illustrates a memory cell array of an EEPROM.

This production example is substantially the same as Production Example 1 except that the tunnel oxide film as the third insulating film, which is formed on the inner wall of the first trench 1210, is arranged to contact the polysilicon films 1512 and 1513 as the first conductive films as shown in FIG. 1175 and FIG. 1176, except that the silicon oxide film 1451 as the thirteenth insulating is arranged to contact the polysilicon film 1511 as the first conductive film, and except that the silicon oxide film 1454 as the thirteenth insulating film is arranged to contact the polysilicon film 1514 as the first conductive film.

Thereby, a structure is realized in which the gate insulating films of the selection gate transistors have a larger thickness than the gate insulating films of the memory transistors, and the same effect as of the Production Example 45 is obtained.

PRODUCTION EXAMPLE 55

FIGS. 1177 to 1179 and FIGS. 1180 to 1182 show a production example for obtained a structure in which the direction of the first wiring layer is parallel to the direction of the fourth wiring layer. FIGS. 1177 to 1179 and FIGS. 1180 to 1182 are sectional views taken on line A-A' and line B-B', respectively, in FIG. 1 which illustrates a memory cell array of an EEPROM.

This production example is substantially the same as Production Example 45 except that first, using as a mask a resist film R5 patterned by a known photolithography technique (FIG. 1177 and FIG. 1180), the first insulating film 1410 and the P-type silicon substrate 1100 is etched by 200 to 2000 nm, for example, by RIE so that the first impurity diffusion layer 1710 is divided and the second trench 1220 is formed in a direction crossing the second wiring layer which is to be a continuous gate line later (FIGS. 1178 to 1179 and FIGS. 1181 to 1182).

Thereby, a semiconductor memory device is realized in which the first wiring layer is parallel to the fourth wiring layer and which has memory function according to the state of a charge accumulated in the charge storage layer which is the floating gate made of the polysilicon film as the first conductive layer.

Films formed on the surface of the semiconductor substrate or the polysilicon film such as the silicon nitride film (the second insulating film) 1310 may be formed of a layered film of a silicon oxide film/a silicon nitride film from the silicon surface. The impurity introduction into the polysilicon films 1511 to 1514 as the first conductive films and the polysilicon films 1522 and 1523 as the second conductive films may be performed when the polysilicon films are formed, after the polysilicon films are formed or after the sidewalls are formed. The timing of introducing the impurity is not limited so long as the conductive film is formed.

In this production example, the control gates of the memory cells are formed continuously in one direction without using a mask. However, that is possible only in the case where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

By providing the selection gates in the top and the bottom of a set of memory cells, it is possible to prevent the phenomenon that a memory cell transistor is over-erased.

PRODUCTION EXAMPLE 56

FIG. 1183 and FIG. 1184 show a production example for obtaining a structure in which the first wiring is electrically common to a memory array. FIG. 1183 and FIG. 1184 are sectional views taken on line A-A' and line B-B', respectively, in FIG. 1 which illustrates a memory cell array of an EEPROM.

The second trench 1220 is not formed in the semiconductor substrate 1100. This production example is substantially the same as Production Example 45 except that the step of forming the second trench 1220 is omitted (FIG. 1183 and FIG. 1184).

Thereby, the first wiring layer is not divided and is common at least in an array. A semiconductor memory device is realized which has a memory function according to the state of a charge accumulated in the charge storage layer which is the floating gate made of the polysilicon film as the first conductive film.

PRODUCTION EXAMPLE 57

Production Example 49 (FIGS. 1067 to 1087 and FIGS. 1094 to 1114) shows a production process for using a layered insulating film as the charge storage layer and realizing charge storage by trapping into the layered insulating film in contrast to Production Example 45. This production example shows another production process for obtained an equivalent effect to the effect of Production Example 49, as shown in FIGS. 1185 to 1195 and FIGS. 1196 to 1206. FIGS. 1185 to 1195 and FIGS. 1196 to 1206 are sectional views taken on line A-A' and line B-B', respectively, in FIG. 12 which illustrates a memory cell array of an EEPROM.

In this example, production steps are the same as those of Production Example 49 until the silicon nitride film 1320 is deposited as the tenth insulating film (FIGS. 1185 to 1188 and FIGS. 1196 to 1199).

Subsequently, using as a mask a resist film R6 patterned by a known photolithography technique (FIG. 1189 and FIG. 1200), etching is performed to a degree such that the silicon oxide film 1475 as the ninth insulating film, for example, by RIE. At this time, the silicon oxide film 1475 is not divided in the A-A' direction (FIG. 1190 and FIG. 1201).

Next, a silicon nitride film 1330 is formed as an eleventh insulating film in the form of a sidewall on the sidewall of the patterned silicon nitride film 1320 as the tenth insulating film (FIG. 1191 and FIG. 1202). Using the silicon nitride film 1320 and the silicon nitride film 1330 as a mask, the silicon oxide films 1472 to 1475 as the ninth insulating films and the polysilicon films 1511 to 1514 as the first conductive films are sequentially etched (FIG. 1192 and FIG. 1203, for example, by anisotropic etching until the first conductive film 1511 is etched, i.e., until the ninth insulating film 1471 is exposed, to form a third trench 1230.

Subsequently, a silicon oxide film 1421 is deposited as a fifth insulating film and buried in the third trench 1230 (FIG. 1193 and FIG. 1204). Using as a mask a resist film R7 patterned by a known photolithography technique, the silicon nitride film 1330 and the silicon nitride film 1320 are patterned, for example, by RIE.

Further, the silicon oxide films 1471 to 1475 and the polysilicon films 1511 to 1514 are sequentially etched, for example, by anisotropic etching until the silicon oxide film 1471 is removed, i.e., until the P-type silicon substrate 1100 is exposed, thereby to form the first trench 1210 (FIG. 1194 and FIG. 1205).

Thereafter, production steps are in accordance with Production Example 49 (FIGS. 1067 to 1087 and FIGS. 1094 to 1114). Thereby, a semiconductor memory device is realized which has a memory function according to the state of a charge accumulated in the charge storage layer made of the layered insulating film (FIG. 1195 and FIG. 1206).

In this production example, the impurity introduction into the polysilicon films 1511 to 1514 as the first conductive films may be performed when the polysilicon films are formed or after the polysilicon films are formed. The timing of introducing the impurity is not limited so long as the conductive film is formed.

By providing the selection gates in the top and the bottom of a set of memory cells, it is possible to prevent the phenomenon that a memory cell transistor is over-erased.

PRODUCTION EXAMPLE 58

FIG. 1207 and FIG. 1208 show a production example for a semiconductor memory device in which the transistor, the capacitor, the transistor and the capacitor are disposed in this order in contrast to the semiconductor memory device formed in Production Example 50. FIG. 1207 and FIG. 1208 are sectional views taken on line A-A' and line B-B', respectively, in FIG. 13 which illustrates a memory cell array of a DRAM.

This production example is in accordance with Production Example 50 (FIGS. 1121 to 1143 and FIGS. 1144 to 1166) except that the impurity diffusion layer 1710 is not formed and the step of dividing the impurity layer id not introduced. The structure shown in FIG. 1207 and FIG. 1208 is obtained.

Thereby, a plurality of capacitors formed on the semiconductor layer disposed in the first trench can be divided. Since the impurity diffusion layer 1710 is not used as a wiring layer, the wiring capacity decreases.

PRODUCTION EXAMPLE 59

FIGS. 1209 to FIG. 1210 and FIG. 1211 to FIG. 1212 show a production example for a semiconductor memory device in which a region where charge storage layers and selection gates are formed is pre-defined by a layered film including the floating gates as the charge storage layers; the tunnel oxide films are formed in a hole-form trench opened using a photoresist mask; island-like semiconductor layers are formed in the pillar form by selective epitaxial silicon growth; the island-like semiconductor layers are electrically floated with respect to the semiconductor substrate; the active regions of memory cells are electrically in common; selection gate transistors are arranged at the top and the bottom of each island-like semiconductor layer; a plurality of, for example, two memory transistors are arranged between the selection gate transistors: the tunnel oxide films of the memory transistors are formed at the same time; the transistors are connected in series along the island-like semiconductor layer; the gate insulating films of the selection gate transistors have the same thickness as the gate insulating films of the memory transistors; and the surface area of the floating gate is increased. FIG. 1209 to FIG. 1210 and FIG. 1211 to FIG. 1212 are sectional views taken on line A-A' and line B-B', respectively, in FIG. 1 which illustrates a memory cell array of an EEPROM.

This production example is carried out in accordance with Production Example 45 (FIGS. 939 to 966 and FIGS. 967 to 994) until the polysilicon film 1521 as the second conductive film is etched back to form a sidewall on the sidewall of the polysilicon film 1511 as the first conductive film.

Subsequently, the silicon oxide films 1471 to 1475 as the ninth insulating films are etched in a horizontal direction with respect to the semiconductor substrate 1100, for example, by isotropic etching (FIG. 1209 and FIG. 1211).

Thereafter, a silicon nitride film 1342, for example, is deposited to 2 to 20 nm as a twelfth insulating film on the sidewall of the third trench 1230. Thereafter the semiconductor memory device is formed in accordance with Production Example 1 (FIG. 1210 and FIG. 1212).

Thereby, the area of the second conductive films 1512 and 1513 which are to be floating gates connecting the third conductive film to be control gates with intervention of the interlayer insulating films 1612 and 1613 increases, and thereby the capacitance between the floating gates and the control gates increases.

PRODUCTION EXAMPLE 60

FIGS. 1213 and 1215 and FIGS. 1214 and 1216 show a production example for obtaining a structure in which the gates of the transistors have different lengths in the vertical direction. FIGS. 1213 to 1214 and FIG. 1215 to FIG. 1216 are sectional views taken on line A-A' and line B-B', respectively, in FIG. 1 which illustrates a memory cell array of an EEPROM.

In this production example, as to the lengths of the polysilicon layers 1511 to 1514 to be the gates of the memory cells and the selection gate in the direction perpendicular to the semiconductor substrate 1110, the selection gate lengths of the polysilicon layers 1511 and 1514 are different as shown in FIG. 1213 and FIG. 1215.

The gate lengths of the memory cells of the polysilicon films 1512 and 1513 as the first conductive films may be different as shown in FIGS. 1214 and 1216.

Further the polysilicon films 1512 and 1513 may also have different lengths in the vertical direction.

PRODUCTION EXAMPLE 61

FIG. 1217 and FIG. 1218 show a production example for obtaining a structure in which the activated regions of the transistors have different lengths in the vertical direction. FIG. 1217 and FIG. 1218 are sectional views taken on line A-A' and line B-B', respectively, in FIG. 1 which illustrates a memory cell array of an EEPROM.

In this production example, as to the lengths of the semiconductor layers 1111 to 1114 to be the channels of the memory cells and the channels of the selection transistors in the direction perpendicular to the semiconductor substrate 1110, the channel lengths of the selection transistors of the semiconductor layers 1111 and 1114 are different as shown in FIG. 1217 and FIG. 1218.

The channel lengths of the memory cells of the semiconductor layers 1112 and 1113 may also be different.

PRODUCTION EXAMPLE 62

FIG. 359 and FIG. 360 show a production example for obtaining a structure in which a large height is given to the impurity diffusion layer 1725 which is positioned on the top of the semiconductor layer 1110 and connected to the fourth wiring layer 1840. FIG. 1219 and FIG. 1220 are sectional views taken on line A-A' and line B-B', respectively, in FIG. 1 which illustrates a memory cell array of an EEPROM.

In this production example, the semiconductor layer 1725 connected to the fourth wiring layer 1840 is high as shown in FIG. 1219 and FIG. 1220.

The thickness of the silicon oxide film 1425 can be set large to improve insulation between the polysilicon film 1514 as the first conductive film and the fourth wiring layer 1840. Or when the impurity diffusion layer 1725 is exposed, exposed area can be set large, and thereby, the connection between the impurity diffusion layer 1725 and the fourth wiring layer 1840 is improved.

PRODUCTION EXAMPLE 63

This production example shows a modification of the shape of the island-like semiconductor layers as shown in FIGS. 1221 to 1222 and FIGS. 1223 to 1224. FIGS. 1221 to 1222 and FIGS. 1223 to 1224 are sectional views taken on line A-A' and line B-B', respectively, in FIG. 1 which illustrates a memory cell array of an EEPROM.

FIG. 1221 and FIG. 1223 show the case where, when the first trench 1210 is formed by RIE, the first trench 1210 has different outside shapes at its top and at its bottom. For example, if the first trench 1210 has a circular plan view from the top, the trench has a conic shape.

FIG. 1222 and FIG. 1224 show the case where the top and the bottom of the first trench 1210 are shifted in the horizontal direction. For example, if the first trench 1210 has a circular plan view from the top, the trench has an inclined conic shape.

The shape of the first trench 1210 is not particularly limited so long as the memory cells can be arranged in series in the direction perpendicular to the semiconductor substrate 1110.

PRODUCTION EXAMPLE 64

This production example shows further modification of the shape of the island-like semiconductor layers as shown in FIGS. 1225 to 1228 and FIGS. 1229 to 1232. FIGS. 1225 to 1228 and FIGS. 1229 to 1232 are sectional views taken on line A-A' and line B-B', respectively, in FIG. 1 which illustrates a memory cell array of an EEPROM.

FIGS. 1225 to 1226 and FIGS. 1229 to 1230 show the case where, when the first trench 1210 is formed by RIE, the outside shape of the first trench 1210 in the silicon oxide films 1422 to 1425 as the fifth insulating films and the silicon oxide film 1471 as the ninth insulating film is larger than the outside shape of the first trench 1210 in the polysilicon films 1511 to 1514 as the first conductive films.

On the other hand, FIGS. 1227 to 1228 and FIGS. 1231 to 1232 show the case where the outside shape of the first trench 1210 in the silicon oxide films 1422 to 1425 as the fifth insulating films and the silicon oxide film 1471 as the ninth insulating film is smaller than the outside shape of the first trench 1210 n the polysilicon films 1511 to 1514 as the first conductive films.

As to the size relationship between the outside shape of the first trench 1210 in the above-mentioned insulating films and the outside shape of the first trench 1210 in the silicon nitride film 1330 as the eleventh insulating film, it does not matter, and the shape of the first trench 1210 is not particularly limited so long as the memory cells can be arranged in series in the direction perpendicular to the semiconductor substrate 1100.

PRODUCTION EXAMPLE 65

This production example shows a modified shape at the bottom of the island-like semiconductor layers as shown in FIGS. 1233 to 1236 and FIGS. 1237 to 1240. FIGS. 1233 to 1236 and FIGS. 1237 to 1240 are sectional views taken on line A-A' and line B-B', respectively, in FIG. 1 which illustrates a memory cell array of an EEPROM.

The bottom shape of the first trench 1210 in the lattice form has a linearly inclined structure as shown in FIGS. 1233 to 1234 and FIGS. 1237 to 1238.

Alternatively, the bottom shape of the first trench 1210 in the lattice form has a roundedly inclined structure as shown in FIGS. 1235 to 1236 and FIGS. 1239 to 1240.

The bottom end of the polysilicon film 1511 as the first conductive film may reach or may not reach the inclined bottom of the first trench 1210.

PRODUCTION EXAMPLE 66

This production example shows a modified shape for a polysilicon film deposited on an underlying step as shown in FIG. 1241 and FIG. 1242. FIG. 1241 and FIG. 1242 are sectional views taken on line A-A' and line B-B', respectively, in FIG. 1 which illustrates a memory cell array of an EEPROM.

The second polysilicon films 1521 to 1524 covering the silicon oxide films 1471 to 1475 as the ninth insulating films, the silicon nitride film 1320 as the tenth insulating film, the silicon nitride film 1330 as the eleventh insulating film and the polysilicon films 1511 to 1514 as the first conductive films has a uniformly deposited structure according to the bottom shape of the first trench 1210.

However, the second polysilicon films 1521 to 1524 may have a non-uniformly deposited structure in part depending upon the bottom shape as shown in Production Example 45.

PRODUCTION EXAMPLE 67

This production example shows the formation of fourth wiring layer 1840 by patterning the impurity diffusion layer 1725 positioned on the top end of the semiconductor layers 1110 as shown in FIGS. 1243 to 1244 and FIGS. 1245 to 1246. FIGS. 1243 to 1244 and FIGS. 1245 to 1246 are sectional views taken on line A-A' and line B-B', respectively, in FIG. 1 which illustrates a memory cell array of an EEPROM.

The semiconductor layer 1725 is patterned by RIE using as a mask a resist film R8 patterned by a known photolithography (FIG. 1243 and FIG. 1245) to form the fourth wiring layer which crosses the direction of the second or third wiring layer (FIG. 1244 and FIG. 1246).

PRODUCTION EXAMPLE 68

This production example shows the formation of terminals for electrically connecting the first, second and third wiring layers and peripheral circuits as shown in FIGS. 1247 to 1242 and FIGS. 1253 to 1258. FIGS. 1247 to 1252 and FIGS. 1253 to 1258 are sectional views taken on line H-H', I1-I1', I2-I2', I3-I3', I4-I4' and line I5-I5' in FIGS. 11 and 10 which illustrate a memory cell array of an EEPROM. These sectional views are taken at locations showing sites 1921, 1932, 1933, 1924 and 1910 where terminals mounted on the top face of the semiconductor memory device are electrically connected to the buried wiring layers 1521, 1522, 1523, 1524 and 1710 for the application of voltage to the buried wiring layers from outside.

The first, second and third wiring layers buried in wiring layer lead-out portions are stepwise arranged. First, second and third contacts 1921, 1932, 1933, 1924 and 1910 are formed from end portions of the wiring layers so that the contacts are contacted only with desired wiring layers, and thereby the first, second and third wiring layers are lead out onto the top of the semiconductor memory device (FIGS. 1247 to 1252).

Alternatively, conductive films may be taken out onto the semiconductor memory device instead of forming the first, second and third contacts 1921, 1932, 1933, 1924 and 1910. With this construction, the same effect as described above can be obtained.

Further the first, second and third wiring layers buried in the wiring layer lead-out portions may be lead out onto the top of the semiconductor memory device in the following process. The wiring layers are arranged as shown in FIG. 1247 to FIG. 1252. The first, second and third contacts 1921, 1932, 1933, 1934 and 1910 are opened, and then, a silicon oxide film 1499, for example, is deposited to 10 to 100 nm as a twenty-third insulating film and etched back by a deposited thickness. Thereby sidewalls are formed of the silicon oxide film 1499 on the inner walls of the contacts formed in the wiring layer lead-out portions. At this time, the twenty-third insulating film is not particularly limited to a silicon oxide film, but may be an insulating film such as a silicon nitride film. Thereafter, a metallic or conductive film is filled in the contacts, and thereby, the first, second and third wiring layers are lead out onto the top of the semiconductor memory device (FIG. 1253 and FIG. 1258).

The contacts for leading out the wiring layers may be formed in common to wiring layers of adjacent memory cells that are continuous in the A-A' direction as shown in FIGS. 1253 to 1258 or may be formed in each wiring layer lead-out portion as shown in FIGS. 1247 to 1252.

Leading the first, second and third wiring layers out onto the top of the semiconductor memory device is applicable to all the examples of the present invention.

In the above-described production examples, after a plurality of charge storage layers are formed, island-like semiconductor layers 1110 are formed in the form of pillars by selective epitaxial silicon growth; before the active regions are formed of the semiconductor substrate or semiconductor layers, regions to be the charge storage layers are defined by multi-layered film and the charge storage layers are formed in these regions; a plurality of memory cells having charge storage layers and control gates are connected in series in the direction perpendicular to the surface of the semiconductor substrate and these memory cells are formed on the semiconductor substrate and the sidewalls of the island-like semiconductor layers which are arranged in matrix and separated in the lattice form on the semiconductor substrate; impurity diffusion layers disposed on the island-like semiconductor layers form sources or drains of the memory cells and the impurity diffusion layers electrically separate the substrate from the island-like semiconductor layers; control gates have control gate lines which are formed continuously with respect to a plurality of island-like semiconductor layers in one direction and horizontally with respect to the surface of the semiconductor substrate; and bit lines are electrically connected with the impurity diffusion layers in a direction crossing the control gate lines and are arranged horizontally with respect to the surface of the semiconductor substrate. However the production steps and the constructions of the semiconductor memory device shown in the examples may be optionally combined.

Hereinafter, described is a production process for producing a semiconductor memory in which, charge storage layers or control gates are formed, insulating films are formed between the charge storage layers and a semiconductor substrate or a semiconductor layer at the same time, and then semiconductor layers in the form of pillars to be active regions are formed on the sides of the insulating films. For forming gate electrodes in the form of sidewall spacers, an insulating film is buried in advance in an adjacent trench and etching is carried out in a horizontal direction using the insulating film as a mask. Thereby the gate electrodes are formed accurately by etching to a depth corresponding to the deposit thickness of a material for the gate electrodes.

PRODUCTION EXAMPLE 69

In a semiconductor memory to be produced in this example, a plurality of floating gates are formed as charge storage layers and selection gates and control gates are formed. Then, tunnel oxide films are formed and island-like semiconductor layers in a pillar form are formed by selective epitaxial silicon growth. The island-like semiconductor layers are each in an electrically floating state with respect to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors. Tunnel oxide films of the transistors are formed at the same time. The transistors are connected in series along the island-like semiconductor layer. Further, the thickness of gate insulating films of the selection gate transistors is equal to the thickness of gate insulating films of the memory transistors.

Such a semiconductor memory may be produced by the following process. FIGS. 1259 to 1283 and FIGS. 1284 to 1308 are sectional views taken on line A-A' and line B-B', respectively, in FIG. 1 illustrating an EEPROM memory cell array.

First, on a surface of a p-type silicon substrate 1100, a silicon oxide film 1410 is deposited as a first insulating film to be an implantation protective film to a thickness of 2 to 20 nm and a first impurity layer 1710 is formed on the p-type silicon substrate 1100 by ion implantation (FIGS. 1259 and 1284). For example, the ion implantation may be performed at an implantation energy of 5 to 100 keV at an arsenic dose of about $1\times10^{14}$ to $1\times10^{16}/cm^2$ in a direction inclined by about 0 to 7° with respect to the normal line of the surface of the substrate. Alternatively, instead of the channel ion implantation, an oxide film containing arsenic may be deposited by CVD with a view to utilizing diffusion of arsenic from the oxide film. The first impurity layer 1710 may not be formed on the topmost surface of the p-type silicon substrate 1100.

Using a resist film R5 patterned by a known photolithographic technique as a mask (FIGS. 1260 and 1285), the first insulating film 1410 and the p-type silicon substrate 1100 are etched by 200 to 2,000 nm by reactive ion etching so that the first impurity layer 1710 is separated, thereby forming a second trench 1220.

After the resist film R5 is removed (FIGS. 1261 and 1286), a silicon oxide film 1420, for example, is deposited as a fifth insulating film to a thickness of 100 to 300 nm and buried in the second trench 1220 by etch-back. The silicon oxide film 1420 may be buried by isotropic or anisotropic etch-back, CMP, or a combination in various ways. At this time, the silicon oxide film 1420 may be a silicon nitride film. The silicon oxide film 1410 may be removed or may remain.

For example, if the silicon oxide film 1410 is removed, a silicon nitride film 1310, for example, is formed as a second insulating film to a thickness of 2,000 to 20,000 nm on the p-type silicon substrate 1100 or the first impurity layer 1710 (FIGS. 1262 and 1287).

Subsequently, using a resist film R6 patterned by a known photolithographic technique as a mask (FIGS. 1263 and 1288), the silicon nitride film 1310 is etched by reactive ion etching, for example, to form a fourth trench 1240 in a lattice form. Then, a silicon oxide film 1421, for example, is deposited as a fifth insulating film to a thickness of 50 to 500 nm by CVD in the lattice-form fourth trench 1240.

Thereafter, the silicon oxide film 1421 is buried in the fourth trench 1240 to a desired depth, for example, by isotropic etching (FIGS. 1264 and 1289). On the surface of the silicon nitride film 1310, a silicon oxide film 1431, for example, is deposited as a fourth insulating film to a thickness of 1 to 10 nm and a polysilicon film 1511, for example, is deposited as a first conductive film to a thickness of about 100 to 500 nm (FIGS. 1265 and 1290).

The polysilicon film 1511 is then etched back into the form of a sidewall spacer of a desired height (FIGS. 1266 and 1291). At this time, by setting the intervals between the fourth trenches 1240 in a direction of A-A' in FIG. 1 to a predetermined value or smaller, the polysilicon film 1511 is formed into a second wiring layer to be a selection gate line continuous in the direction without need to use a masking process.

Thereafter, a silicon oxide film 1422, for example, is deposited as a fifth insulating film to a thickness of 50 to 500 nm in the fourth trench 1240 and buried in the fourth trench 1240 to a desired depth by isotropic etching. Then, on the surface of the silicon nitride film 1310, a silicon oxide film 1432, for example, is deposited as a fourth insulating film to a thickness of 1 to 10 nm (FIGS. 1267 and 1292) and a polysilicon film 1512, for example, is deposited as a first conductive film to a thickness of about 50 to 200 nm (FIGS. 1268 and 1293).

In the same manner, the polysilicon film 1512 is etched back into the form of a sidewall spacer of a desired height (FIGS. 1269 and 1294). At this time, the polysilicon films 1512 (the first conductive films) are formed to surround the silicon nitride film 1310, respectively, and isolated from each other.

Subsequently, an interlayer insulating film 1612 is formed on the surface of the polysilicon film 1512 (FIG. 1270 and FIG. 1295). This interlayer insulating film 1612 may be formed of an ONO film. The ONO film can be formed in the same manner as Production example 1.

Then, in the same manner, a polysilicon film 1522, for example, is deposited as a second conductive film to a thickness of 15 to 150 nm (FIGS. 1271 and 1296) and etched back to a depth corresponding to the deposit thickness, thereby the interlayer insulating film 1612 on the silicon oxide film 1422 is exposed and the polysilicon film 1522 is disposed on the side of the polysilicon film 1512 (the first conductive film) with intervention of the interlayer insulating film 1612. At this time, a polysilicon film 1526 (a second conductive film) remains around the silicon nitride film 1310. Preferably the polysilicon film 1522 and the polysilicon film 1526 are separated (FIGS. 1272 and 1297). At this time, by setting the intervals between the fourth trenches 1240 in a direction of A-A' in FIG. 1 to a predetermined value or smaller, the polysilicon film 1522 is formed into a third wiring layer to be a control gate line continuous in the direction without need to use a masking process.

Thereafter, a silicon oxide film 1423, for example, is deposited as a fifth insulating film in the fourth trench 1240 to a thickness of 50 to 500 nm, and then buried in the fourth trench 1240 to a desired depth by isotropic etching (FIGS. 1273 and 1298). Using the silicon oxide film 1423 as a mask, the exposed polysilicon film 1526 is removed by isotropic etching (FIGS. 1274 and 1299). At this time, the etching is performed in an etching amount corresponding to the thickness of the polysilicon film 1526. Thereby, variations in the production process can be reduced.

Subsequently, the polysilicon film 1526 remaining between the silicon nitride film 1310 and the silicon oxide film 1423 is removed by isotropic or anisotropic etching (FIGS. 1275 and 1300).

Then, a silicon oxide film 1483, for example, is deposited as a sixth insulating film to a thickness of 8 to 80 nm such that it is buried in a space between the silicon nitride film 1310 and the silicon oxide film 1423. At this time, it is preferred that the thickness of the silicon oxide film 1483 is about half or more of the thickness of the polysilicon film 1522 (FIGS. 1276 and 1301).

Then, isotropic etching is performed to a depth corresponding to the deposit thickness of the silicon oxide film 1483, thereby the interlayer insulating film 1612 present on the side of the silicon nitride film 1310 is exposed and the silicon oxide film 1483 is buried in the fourth trench 1240.

Here, explanation is given of the formation of the polysilicon film 1522 as the second conductive film. However, the polysilicon film 1522 may be formed into the form of a sidewall spacer merely by a combination of deposition and anisotropic etching. Thereafter, using the silicon oxide film 1423 as a mask, the interlayer insulating film 1612 is partially removed by isotropic etching (FIGS. 1277 and 1302).

By repeating likewise, a polysilicon film 1523 is disposed as a second conductive film on the side of a polysilicon film 1513 with intervention of an interlayer insulating film 1613, and then the polysilicon film 1523 is buried by forming thereon a silicon oxide film 1424 (a fifth insulating film) and a silicon oxide film 1484 (a sixth insulating film) (FIGS. 1278 and 1303). With regard to a polysilicon film 1514 which is the topmost first conductive film, the polysilicon film 1514 is etched back in the same manner as the polysilicon film 1511 which is the bottommost first conductive film.

Thereafter, a silicon oxide film 1425, for example, is deposited as a fifth insulating film to a thickness of 50 to 500 nm and the top of the silicon nitride film 1310 is exposed by etch-back or by CMP (FIGS. 1279 and 1304). At this time, the silicon oxide film 1425 may be a silicon nitride film.

Then, the silicon nitride film 1310 is selectively removed by isotropic etching to form a first trench 1210. Then, a silicon oxide film 1440 is formed as a third insulating film to be a tunnel oxide film to a thickness of about 10 nm by CVD on the inner wall of the first trench 1210 (FIGS. 1280 and 1305). The silicon oxide film 1440, however, may be formed of not only a CVD oxide film but also a thermally oxidized film or a nitrogen oxide film.

Subsequently, the silicon oxide film 1440 formed on the first impurity diffusion layer 1710 or the p-type silicon substrate 1100 is selectively removed. For example, the silicon oxide film 1440 is anisotropically etched to remain in the form of a sidewall spacer only on the sidewall of the first trench 1210 (FIGS. 1281 and 1306).

Thereafter, the silicon oxide film 1440 is subjected to thermal treatment or the like in a nitrogen atmosphere at 800 to 1,000° C. for 10 to 100 minutes. At this time, gases other than nitrogen, e.g., oxygen, may be added. After the thermal treatment, the thickness of the silicon oxide film 1440 is preferably about 10 nm.

Then, an oxide film generated on the surface of the first impurity diffusion layer 1710 or the p-type silicon substrate 1100 is optionally removed by using diluted HF, for example, and island-like semiconductor layers 1721 to 1725 and 1111 to 1114 are buried in the first trench 1210. For example, from the first impurity diffusion layer 1710 or the p-type silicon substrate 1100 located at the bottom of the first trench 1210, the semiconductor layers are formed selectively by epitaxial growth. At this time, from the bottom, an N-type semiconductor layer 1721, a P-type semiconductor layer 1111, an N-type semiconductor layer 1722, a P-type semiconductor layer 1112, an N-type semiconductor layer 1723, a P-type semiconductor layer 1113, an N-type semiconductor layer 1724, a P-type semiconductor layer 1114, and an N-type semiconductor layer 1725 are formed sequentially (FIGS. 1282 and 1307). The N-type semiconductor layers 1721 to 1725 are formed at an arsenic concentration of about $1\times10^{18}$ to $1\times10^{21}/cm^3$ and the P-type semiconductor layers 1111 to 1114 are formed at a boron concentration of about $1\times10^{15}$ to $1\times10^{17}/cm^3$. Further, it is preferable that the N-type semiconductor layers 1721 and 1722 are overlapped with the polysilicon film 1511 (the first conductive film) with intervention of the silicon oxide film 1440 (the third insulating film), respectively. In the same manner, it is preferred that the N-type semiconductor layers 1722 and 1723 are overlapped with the polysilicon film 1512, the N-type semiconductor layers 1723 and 1724 are overlapped with the polysilicon film 1513, and the N-type semiconductor layers 1724 and 1725 are overlapped with the polysilicon film 1514, with intervention of the silicon oxide film 1440, respectively.

Thereafter, the N-type semiconductor layer 1725 is reduced by etch-back or CMP, for example, to expose the silicon oxide film 1425 (the fifth insulating film). Thereby the N-type semiconductor layer 1725 is separated. Then, a fourth wiring layer is formed so that its direction crosses the direction of the second or third wiring layer and is connected to the top portion of the N-type semiconductor layer 1725.

Thereafter, by known techniques, an interlayer insulating film is formed, and a contact hole and metal wiring are formed. Thereby, a semiconductor memory is realized which has a memory function according to the state of a charge in the charge storage layer which is the floating gate made of the polysilicon film (the first conductive film).

In this example, films formed on the surface of the semiconductor substrate or the polysilicon film such as the silicon nitride film (the second insulating film) 1310 may be formed of a layered film of a silicon oxide film/a silicon nitride film from the silicon surface. With regard to the polysilicon films 1511 to 1514 (the first conductive films) and the polysilicon films 1522 and 1523 (the second conductive films), impurity introduction may be carried out during or after the formation of the polysilicon films or after the formation of the sidewall spacer. The timing of the impurity introduction to the polysilicon films is not particularly limited so long as these films become conductive films.

In this example, the control gates of the memory cells are formed continuously in one direction without using a mask. However, that is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

Further, by providing the selection gates in the top and the bottom of a set of memory cells, it is possible to prevent the phenomenon that a memory cell transistor is over-erased.

The charge storage layer may be formed of not only the floating gate structure but also a laminated insulating film. This example is also applicable even if MNOS or MONOS structure is employed. The laminated insulating film mentioned herein signifies a laminated structure of a tunnel oxide film and a silicon nitride film, or a structure including a tunnel oxide film, a silicon nitride film and a silicon oxide film.

PRODUCTION EXAMPLE 70

In a semiconductor memory to be produced in this example, selection gates and control gates are formed, and laminated insulating films are formed as charge storage layers. Then, island-like semiconductor layers in a pillar form are formed by selective epitaxial silicon growth. The island-like semiconductor layers are each in an electrically floating state with respect to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors. Tunnel oxide films of the transistors are formed at the same time. The transistors are connected in series along the island-like semiconductor layer. Further, the thickness of gate insulating films of the selection gate transistors is equal to the thickness of gate insulating films of the memory transistors.

Such a semiconductor memory may be produced by the following process. FIGS. 1309 to 1326 and FIGS. 1327 to 1344 are sectional views taken on line A-A' and line B-B', respectively, in FIG. 12 illustrating an NMOS or MONOS memory cell array.

This example is same as Production example 69 (FIGS. 1259 to 1283 and 1284 to 1308) until the silicon nitride film 1310 is etched by reactive ion etching by using the resist film R6 as a mask to form the lattice-form fourth trench 1240 (FIGS. 1309 to 1313 and 1327 to 1331).

Then, a silicon oxide film 1421, for example, is deposited as a fifth insulating film to a thickness of 50 to 500 nm by CVD in the lattice-form fourth trench 1240.

Thereafter, the silicon oxide film 1421 is buried in the fourth trench 1240 to a desired depth, for example, by isotropic etching (FIGS. 1314 and 1332). On the surface of the silicon nitride film 1310, a silicon oxide film 1431, for example, is deposited as a fourth insulating film to a thickness of 1 to 10 nm and a polysilicon film 1511, for example, is deposited as a first conductive film to a thickness of about 100 to 500 nm (FIGS. 1315 and 1333).

The polysilicon film 1511 is etched back in the form of a sidewall spacer of a desired height (FIGS. 1316 and 1334). At this time, by setting the intervals between the fourth trenches 1240 in a direction of A-A' in FIG. 12 to a predetermined value or smaller, the polysilicon film 1511 is formed into a second wiring layer to be a selection gate line continuous in the direction without need to use a masking process.

Thereafter, a silicon oxide film 1422, for example, is deposited as a fifth insulating film to a thickness of 50 to 500 nm in the fourth trench 1240 and buried in the fourth trench 1240 to a desired depth by isotropic etching (FIGS. 1317 and 1335).

By repeating likewise, a polysilicon film (a first conductive film) 1512, a silicon oxide film (a fifth insulating film) 1423, a polysilicon film (a first conductive film) 1513, a silicon oxide film (a fifth insulating film) 1424, a polysilicon film (a first conductive film) 1514 and a silicon oxide film (a fifth insulating film) 1425 are formed sequentially (FIGS. 1318 and 1336).

Thereafter, the top of the silicon nitride film 1310 is exposed by etch-back or CMP (FIGS. 1319 and 1337). At this time, the silicon oxide film 1425 may be a silicon nitride film.

Then, the silicon nitride film 1310 is selectively removed by isotropic etching to form a first trench 1210.

Then, a silicon oxide film 1440 is formed as a third insulating film to be a gate oxide film to a thickness of about 10 nm by CVD on the inner wall of the first trench 1210. The silicon oxide film 1440, however, may be formed of not only a CVD oxide film but also a thermally oxidized film or a nitrogen oxide film.

Subsequently, the silicon oxide film 1440 formed on the first impurity diffusion layer 1710 or the p-type silicon substrate 1100 is selectively removed. For example, the silicon oxide film 1440 anisotropically etched to remain in the form of a sidewall spacer only on the sidewall of the first trench 1210 (FIGS. 1320 and 1338).

Thereafter, the silicon oxide film 1440 is subjected to thermal treatment or the like in a nitrogen atmosphere at 800 to 1,000° C. for 10 to 100 minutes. At this time, gases other than nitrogen, e.g., oxygen, may be added. After the thermal treatment, the thickness of the silicon oxide film 1440 is preferably about 10 nm.

An oxide film generated on the surface of the first impurity diffusion layer 1710 or the p-type silicon substrate 1100 is optionally removed by using diluted HF, for example, and island-like semiconductor layers 1721, 1722-1 and 1111 are buried in the first trench 1210. For example, from the first impurity diffusion layer 1710 or the p-type silicon substrate 1100 located at the bottom of the first trench 1210, the semiconductor layers are formed selectively by epitaxial growth. At this time, from the bottom, an N-type semiconductor layer 1721, a P-type semiconductor layer 1111 and an N-type semiconductor layer 1722-1 are formed sequentially (FIGS. 1321 and 1339). The N-type semiconductor layers 1721 and 1722-1 are formed at an arsenic concentration of about $1\times10^{18}$ to $1\times10^{21}/cm^3$ and the P-type semiconductor layer 1111 is formed at a boron concentration of about $1\times10^{15}$ to $1\times10^{17}/cm^3$. Further, it is preferable that the N-type semiconductor layers 1721 and 1722-1 are overlapped with the polysilicon film 1511 (the first conductive film) with intervention of the silicon oxide film 1440 (the third insulating film), respectively. Further, it is preferred that the N-type semiconductor layer 1722-1 is formed such that it is not overlapped with the polysilicon film 1512 (the first conductive film).

Then, using the N-type semiconductor layer 1722-1 as a mask, the silicon oxide film 1440 is partially removed.

Subsequently, a laminated insulating film 1620 to be charge storage layer is formed on the inner wall of the first trench 1210 (FIGS. 1322 and 1340). In the case of forming a laminated insulating film of MNOS structure, a silicon nitride film of 4 to 10 nm thickness and a silicon oxide film of 2 to 5 nm thickness may be formed sequentially on the surface of the polysilicon film by CVD. Alternatively, a silicon nitride film of 4 to 10 nm thickness is deposited on the surface of the polysilicon film by CVD and the surface of the silicon nitride film is oxidized to form a silicon oxide film of 2 to 5 nm thickness. In order to form a laminated insulating film of MONOS structure, a silicon oxide film of 2 to 5 nm thickness, a silicon nitride film of 4 to 8 nm thickness and a silicon oxide film of 2 to 5 nm thickness are deposited sequentially on the surface of the polysilicon film by CVD. Alternatively, a silicon oxide film of 2 to 5 nm thickness and a silicon nitride film of 4 to 10 nm thickness are sequentially deposited on the surface of the polysilicon film by CVD, and then the surface of the silicon nitride film is oxidized to form a silicon oxide film of 2 to 5 nm thickness, or alternatively, the surface of the polysilicon film may be oxidized to form a silicon oxide film of 2 to 5 nm thickness. These processes may be combined in any way.

Then, the laminated insulating film 1620 formed on the N-type semiconductor layer 1722-1 is selectively removed. For example, the laminated insulating film 1620 is anisotropically etched to remain in the form of a sidewall spacer only on the sidewall of the first trench 1210 (FIGS. 1323 and 1341). Thereafter, the laminated insulating film 1620 may be subjected to thermal treatment or the like.

In the same manner as the above, island-like semiconductor layers 1722-2 to 1724-1, 1112 and 1113 are buried in the first trench 1210. For example, from the island-like semiconductor layer 1722-1 located at the bottom of the first trench 1210, the semiconductor layers are formed selectively by epitaxial growth. At this time, from the bottom, an N-type semiconductor layer 1722-2, a P-type semiconductor layer 1112, an N-type semiconductor layer 1723, a P-type semiconductor layer 1113 and an N-type semiconductor layer 1724-1 are formed sequentially. The N-type semiconductor layers 1722-2 to 1724-1 are formed in the same manner as the above, i.e., at an arsenic concentration of about $1\times10^{18}$ to $1\times10^{21}/cm^3$ and the P-type semiconductor layers 1112 and 1113 are formed at a boron concentration of about $1\times10^{15}$ to $1\times10^{17}/cm^3$. It is preferable that the N-type semiconductor layers 1722-2 and 1723 are overlapped with the polysilicon film 1512 (the first conductive film) with intervention of the laminated insulating film 1620, respectively. It is also preferable that the N-type semiconductor layers 1723 and 1724-1 are overlapped with the polysilicon film 1513 (the first conductive film) with intervention of the laminated insulating film 1620, respectively. Further, it is preferred that the N-type semiconductor layer 1724-1 is formed such that it is not overlapped with the polysilicon film 1514 (the first conductive film).

Then, using the N-type semiconductor layer 1724-1 as a mask, the laminated insulating film 1620 is partially removed. A silicon oxide film 1444 is formed as a third insulating film to be a gate oxide film to a thickness of about 10 nm by CVD on the inner wall of the first trench 1210. The silicon oxide film 1444, however, may be formed of not only a CVD oxide film but also a thermally oxidized film or a nitrogen oxide film.

Subsequently, the silicon oxide film 1444 formed on the island-like semiconductor layer 1724-1 is selectively removed. For example, the silicon oxide film 1444 is anisotropically etched to remain in the form of a sidewall spacer only on the sidewall of the first trench 1210 (FIGS. 1324 and 1342).

Thereafter, the silicon oxide film 1444 is subjected to thermal treatment or the like. Further, in the same manner as the above, island-like semiconductor layers 1724-2, 1725 and 1114 are buried in the first trench 1210. For example, from the island-like semiconductor layer 1724-1 located at the bottom of the first trench 1210, the semiconductor layers are formed selectively by epitaxial growth. At this time, from the bottom, an N-type semiconductor layer 1724-2, a P-type semiconductor layer 1114 and an N-type semiconductor layer 1725 are formed sequentially (FIGS. 1325 and 1343). The N-type semiconductor layers 1724-2 and 1725 are formed in the same manner as the above, i.e., at an arsenic concentration of about $1\times10^{18}$ to $1\times10^{21}/cm^3$ and the P-type semiconductor layer 1114 is formed at a boron concentration of about $1\times10^{15}$ to $1\times10^{17}/cm^3$. It is preferable that the N-type semiconductor layers 1724-2 and 1725 are overlapped with the polysilicon film 1514 (the first conductive film) with intervention of the silicon oxide film 1444 (the third insulating film), respectively. Thereafter, the N-type semiconductor layer 1725 is reduced by etch-back or CMP, for example, to expose the silicon oxide film 1425 (the fifth insulating film). Thereby the N-type semiconductor layer 1725 is separated. Then, a fourth wiring layer is formed so that its direction crosses the direction of the second or third wiring layer and is connected to the top portion of the N-type semiconductor layer 1725.

Thereafter, by known techniques, an interlayer insulating film is formed, and a contact hole and metal wiring are formed. Thereby, a semiconductor memory is realized which has a memory function according to the state of a charge in the charge storage layer formed of the laminated insulating film.

In this example, the silicon nitride film (the second insulating film) 1310 formed on the surface of the semiconductor substrate or the polysilicon film may be formed of a layered film of a silicon oxide film/a silicon nitride film from the silicon surface. With regard to the polysilicon films 1511 to 1514 (the first conductive films) and the polysilicon films 1522 and 1523 (the second conductive films), impurity introduction may be carried out during or after the formation of the polysilicon films or after the formation of the sidewall spacer. The timing of the impurity introduction to the polysilicon films is not particularly limited so long as these films become conductive films.

In this example, the control gates of the memory cells are formed continuously in one direction without using a mask. However, that is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

Further, by providing the selection gates in the top and the bottom of a set of memory cells, it is possible to prevent the phenomenon that a memory cell transistor is over-erased.

PRODUCTION EXAMPLE 71

In a semiconductor memory to be produced in this example, gates to be MIS capacitors as charge storage layers and selection gates are formed, and then gate oxide films are formed. Then, island-like semiconductor layers in a pillar form are formed by selective epitaxial silicon growth. The island-like semiconductor layers are each in an electrically floating state with respect to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors. The gate oxide films of the transistors are formed at the same time. The transistors are connected in series along the island-like semiconductor layer. Further, the thickness of gate insulating films of the selection gate transistors is equal to the thickness of gate insulating films of the memory transistors.

Such a semiconductor memory may be produced by the following process. FIGS. 1345 to 1358 and FIGS. 1359 to 1372 are sectional views taken on line A-A' and line B-B', respectively, in FIG. 13 illustrating a DRAM memory cell array.

This example is the same as Production example 70 (FIGS. 1309 to 1320 and 1327 to 1338) except that the first insulating film 1410 and the p-type silicon substrate 1100 are etched by reactive ion etching to a depth of 200 to 2,000 nm by using a resist film R5 patterned by a known photolithographic technique as a mask (FIGS. 1260 and 1285) such that the first impurity layer 1710 is separated, thereby forming a second trench 1220 in a direction crossing the second wiring layer to be a continuous gate line (FIGS. 1345 to 1356 and 1359 to 1370).

Thereafter, an oxide film generated on the surface of the first impurity diffusion layer 1710 or the p-type silicon substrate 1100 is optionally removed by using diluted HF, for example, and island-like semiconductor layers 1721, 1726, 1727, 1725, 1111, 1120 and 1114 are buried in the first trench 1210. For example, from the first impurity diffusion layer 1710 or the p-type silicon substrate 1100 located at the bottom of the first trench 1210, the semiconductor layers are formed selectively by epitaxial growth. At this time, from the bottom, an N-type semiconductor layer 1721, a P-type semiconductor layer 1111, an N-type semiconductor layer 1726, a P-type semiconductor layer 1120, an N-type semiconductor layer 1727, a P-type semiconductor layer 1114 and an N-type semiconductor layer 1725 are formed sequentially (FIGS. 1357 and 1371). The N-type semiconductor layers 1721, 1726, 1727 and 1725 are formed at an arsenic concentration of about $1\times10^{18}$ to $1\times10^{21}/cm^3$ and the P-type semiconductor layers 1111, 1120 and 1114 are formed at a boron concentration of about $1\times10^{15}$ to $1\times10^{17}/cm^3$. It is preferable that the N-type semiconductor layers 1721 and 1726 are overlapped with the polysilicon film 1511 (the first conductive film) with intervention of the silicon oxide film 1440 (the third insulating film), respectively. The N-type semiconductor layer 1726 is preferably overlapped with the polysilicon film 1512 (the first conductive film) with intervention of the silicon oxide film 1440 and in the same manner, the N-type semiconductor layer 1727 is preferably overlapped with the polysilicon film 1513 with intervention of the silicon oxide film 1440. Further, the N-type semiconductor layers 1727 and 1725 are preferably overlapped with the polysilicon film 1514 (the first conductive film) with intervention of the silicon oxide film 1444 (the third insulating film), respectively.

Subsequently, the N-type semiconductor layer 1725 is reduced by etch-back or CMP, for example, to expose the silicon oxide film 1425 (the fifth insulating film). Thereby the N-type semiconductor layer 1725 is separated.

Then, a fourth wiring layer is formed so that its direction crosses the direction of the second or third wiring layer and is connected to the top portion of the N-type semiconductor layer 1725.

Further, by known techniques, an interlayer insulating film is formed, and a contact hole and metal wiring are formed.

Thereby, a semiconductor memory is realized which has a memory function according to the state of a charge in the charge storage layer formed of the MIS capacitors.

In this example, films formed on the surface of the semiconductor substrate or the polysilicon film such as the silicon nitride film (the second insulating film) 1310 may be formed of a layered film of a silicon oxide film/a silicon nitride film from the silicon surface. With regard to the polysilicon films 1511 to 1514 (the first conductive films) and the polysilicon films 1522 and 1523 (the second conductive films), impurity introduction may be carried out during or after the formation of the polysilicon films or after the formation of the sidewall spacer. The timing of the impurity introduction to the polysilicon films is not particularly limited so long as these films become conductive films.

In this example, the control gates of the memory cells are formed continuously in one direction without using a mask. However, that is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

PRODUCTION EXAMPLE 72

In a semiconductor memory to be produced in this example, a plurality of floating gates are formed as charge storage layers and selection gates and control gates are formed. Then, tunnel oxide films are formed and island-like semiconductor layers in a pillar form are formed by selective epitaxial silicon growth. The island-like semiconductor layers are each in an electrically floating state with respect to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors. The tunnel oxide films of the transistors are formed at the same time. The transistors are connected in series along the island-like semiconductor layer. Further, the thickness of gate insulating films of the selection gate transistors is larger than the thickness of gate insulating films of the memory transistors.

Such a semiconductor memory may be produced by the following process. FIGS. 1373 to 1382 and FIGS. 1383 to 1392 are sectional views taken on line A-A' and line B-B', respectively, in FIG. 1 illustrating an EEPROM memory cell array.

In this example, production steps are the same as those of Production example 69 (FIGS. 1259 to 1279 and 1284 to 1304) before the polysilicon films 1511 to 1514 are formed as the first insulating films, the polysilicon films 1522 and 1523 are formed as the second conductive films with intervention of the interlayer insulating films 1612 and 1613, the silicon oxide film 1425 is deposited as the fifth insulating film to a thickness of 50 to 500 nm, and the top of the silicon nitride film 1310 is exposed by etch-back or CMP (FIGS. 1373 and 1383).

Thereafter, the silicon nitride film 1310 is selectively removed by isotropic etching, for example, to form a first trench 1210.

Then, a silicon oxide film 1451 is formed as a thirteenth insulating film to be a gate oxide film to a thickness of about 20 nm by CVD on the inner wall of the first trench 1210 (FIGS. 1374 and 1384). The silicon oxide film 1451, however, may be formed of not only a CVD oxide film but also a thermally oxidized film or a nitrogen oxide film.

Subsequently, the silicon oxide film 1451 formed on the first impurity diffusion layer 1710 or the p-type semiconductor layer 1100 is removed selectively. For example, the silicon oxide film 1451 is anisotropically etched to remain in the form of a sidewall spacer only on the sidewall of the first trench 1210 (FIGS. 1325 and 1385).

Thereafter, the silicon oxide film 1451 is subjected to a thermal treatment or the like in the same manner as in Production example 69.

Then, if required, an oxide film generated on the surface of the first impurity diffusion layer 1710 or the p-type silicon substrate 1100 is optionally removed by using diluted HF, for example, and island-like semiconductor layers 1721, 1722-1 and 1111 are buried in the first trench 1210. For example, from the first impurity diffusion layer 1710 or the p-type silicon substrate 1100 located at the bottom of the first trench 1210, the semiconductor layers are formed selectively by epitaxial growth. At this time, from the bottom, an N-type semiconductor layer 1721, a P-type semiconductor layer 1111 and an N-type semiconductor layer 1722-1 are formed sequentially (FIGS. 1376 and 1386). The N-type semiconductor layers 1721 to 1722-1 are formed at an arsenic concentration of about $1\times10^{18}$ to $1\times10^{21}/cm^3$ and the P-type semiconductor layer 1111 is formed at a boron concentration of about $1\times10^{15}$ to $1\times10^{17}/cm^3$. It is preferable that the N-type semiconductor layers 1721 and 1722-1 are overlapped with the polysilicon film 1511 (the first conductive film) with intervention of the silicon oxide film 1451 (the thirteenth insulating film), respectively. Further, it is preferred that the N-type semiconductor layer 1722-1 is formed such that it is not overlapped with the polysilicon film 1512 (the first conductive film).

Then, using the N-type semiconductor layer 1722-1 as a mask, the silicon oxide film 1451 is partially removed (FIGS. 1377 and 1387). A silicon oxide film 1440, for example, is formed as a third insulating film to be a tunnel oxide film to a thickness of about 10 nm by CVD on the inner wall of the first trench 1210 (FIGS. 1378 and 1388).

Subsequently, the silicon oxide film 1440 formed on the N-type semiconductor layer 1722-1 is selectively removed. For example, the silicon oxide film 1440 is anisotropically etched to remain in the form of a sidewall spacer only on the sidewall of the first trench 1210 (FIGS. 1379 and 1389).

Thereafter, the silicon oxide film 1440 may be subjected to thermal treatment or the like.

In the same manner as the above, island-like semiconductor layers 1722-2 to 1724-1, 1112 and 1113 are buried in the first trench 1210. For example, from the island-like semiconductor layer 1722-1 located at the bottom of the first trench 1210, the semiconductor layers are formed selectively by epitaxial growth. At this time, from the bottom, an N-type semiconductor layer 1722-2, a P-type semiconductor layer 1112, an N-type semiconductor layer 1723, a P-type semiconductor layer 1113 and an N-type semiconductor layer 1724-1 are formed sequentially (FIGS. 1380 and 1390). The N-type semiconductor layers 1722-2 to 1724-1 are formed in the same manner as the above, i.e., at an arsenic concentration of about $1\times10^{18}$ to $1\times10^{21}/cm^3$ and the P-type semiconductor layers 1112 and 1113 are formed at a boron concentration of about $1\times10^{15}$ to $1\times10^{17}/cm^3$. Further, it is preferable that the N-type semiconductor layers 1722-2 and 1723 are overlapped with the polysilicon film 1512 (the first conductive film) with intervention of the silicon oxide film 1440 (the third insulating film), respectively. In the same manner, the N-type semiconductor layers 1723 and 1724-1 are preferably overlapped with the polysilicon film 1513 (the first conductive film) with intervention of the silicon oxide film 1440, respectively. Further, it is preferred that the N-type semiconductor layer 1724-1 is formed such that it is not overlapped with the polysilicon film 1514 (the first conductive film).

Using the N-type semiconductor layer 1724-1 as a mask, the silicon oxide film 1440 is partially removed.

Then, a silicon oxide film 1454 is formed as a thirteenth insulating film to be a gate oxide film to a thickness of about 20 nm by CVD on the inner wall of the first trench 1210. The silicon oxide film 1454, however, may be formed of not only a CVD oxide film but also a thermally oxidized film or a nitrogen oxide film.

Subsequently, the silicon oxide film 1454 formed on the island-like semiconductor layer 1724-1 is selectively removed. For example, the silicon oxide film 1454 is anisotropically etched to remain in the form of a sidewall spacer only on the sidewall of the first trench 1210.

Thereafter, the silicon oxide film 1454 is subjected to a thermal treatment or the like.

In the same manner as the above, island-like semiconductor layers 1724-2, 1725 and 1114 are buried in the first trench 1210. For example, from the island-like semiconductor layer 1724-1 located at the bottom of the first trench 1210, the semiconductor layers are formed selectively by epitaxial growth. At this time, from the bottom, an N-type semiconductor layer 1724-2, a P-type semiconductor layer 1114 and an N-type semiconductor layer 1725 are formed sequentially (FIGS. 1381 and 1391). The N-type semiconductor layers 1724-2 and 1725 are formed in the same manner as the above at an arsenic concentration of about $1\times10^{18}$ to $1\times10^{21}/cm^3$ and the P-type semiconductor layer 1114 is formed at a boron concentration of about $1\times10^{15}$ to $1\times10^{17}/cm^3$. It is preferable that the N-type semiconductor layers 1724-2 and 1725 are overlapped with the polysilicon film 1514 (the first conductive film) with intervention of the silicon oxide film 1454 (the third insulating film), respectively.

Thereafter, the N-type semiconductor layer 1725 is reduced by etch-back or CMP, for example, to expose the silicon oxide film 1425 (the fifth insulating film). Thereby the N-type semiconductor layer 1725 is separated.

Then, a fourth wiring layer is formed so that its direction crosses the direction of the second or third wiring layer and is connected to the top portion of the N-type semiconductor layer 1725.

Thereafter, by known techniques, an interlayer insulating film is formed, and a contact hole and metal wiring are formed.

According to this example, the same effect as obtained-by Production Example 69 can be obtained (FIGS. 1259 to 1283 and 1284 to 1308).

PRODUCTION EXAMPLE 73

In a semiconductor memory to be produced in this example, a plurality of floating gates are formed as charge storage layers on a semiconductor substrate to which an oxide film is inserted, for example, a semiconductor portion on an oxide film of an SOI substrate, selection gates and control gates are formed, and then tunnel oxide films are formed. Then, island-like semiconductor layers in a pillar form are formed by selective epitaxial silicon growth. The island-like semiconductor layers are each in an electrically floating state with respect to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors. The tunnel oxide films of the transistors are formed at the same time. The transistors are connected in series along the island-like semiconductor layer. Further, the thickness of gate insulating films of the selection gate transistors is equal to the thickness of gate insulating films of the memory transistors.

Such a semiconductor memory may be produced by the following process. FIGS. 1393 and 1394 are sectional views taken on line A-A' and line B-B', respectively, in FIG. 1 illustrating an EEPROM memory cell array.

In this example, production steps are substantially the same as those of Production example 1 except that the SOI substrate is used as a semiconductor substrate (FIGS. 1393 and 1394) and the same effect as obtained by Production Example 69 can be obtained. Further, the junction capacitance of the impurity diffusion layer 1710 which functions as the first wiring layer is suppressed or removed. The use of the SOI substrate as the semiconductor substrate is applicable to all the examples of the present invention.

PRODUCTION EXAMPLE 74

In a semiconductor memory to be produced in this example, a plurality of floating gates are formed as charge storage layers and control gates are formed. Then, tunnel oxide films are formed and island-like semiconductor layers in a pillar form are formed by selective epitaxial silicon growth. The island-like semiconductor layers are each in an electrically floating state with respect to the semiconductor substrate. The active region of each memory cell is in the electrically floating state. Two memory transistors are placed in the island-like semiconductor layer. The tunnel oxide films of the transistors are formed at the same time. The transistors are connected in series along the island-like semiconductor layer.

Such a semiconductor memory may be produced by the following process. FIGS. 1395 to 1415 and 1416 to 1436 are sectional views taken on line A-A' and line B-B', respectively, in FIG. 5 illustrating an EEPROM memory cell array.

In this example, a silicon oxide film 1410, for example, is deposited as a first insulating film to be an injection protective film to a thickness of 2 to 20 nm on a surface of a p-type silicon substrate 1100, and a first impurity layer 1710 is formed on the p-type silicon substrate 1100 by ion implantation (FIGS. 1395 and 1416). For example, the ion implantation may be performed at implantation energy of 5 to 100 keV at an arsenic dose of about $1\times10^{14}$ to $1\times10^{16}/cm^2$ in a direction inclined by about 0 to 7° with respect to the normal line of the surface of the substrate. Alternatively, instead of the channel ion implantation, an oxide film containing arsenic may be deposited by CVD with a view to utilizing diffusion of arsenic from the oxide film. The first impurity layer 1710 may not be formed on the topmost surface of the p-type silicon substrate 1100.

Using a resist film R5 patterned by a known photolithographic technique as a mask, the first insulating film 1410 and the P-type silicon substrate 1100 are etched by 200 to 2,000 nm by reactive ion etching so that the first impurity layer 1710 is separated, thereby forming a second trench 1220 (FIGS. 1396 and 1417).

After the resist film R5 is removed, a silicon oxide film 1420, for example, is deposited as a fifth insulating film to a thickness of 100 to 300 nm and buried in the second trench 1220 by etch-back (FIGS. 1397 and 1418). The silicon oxide film 1420 may be buried by isotropic or anisotropic etch-back, CMP, or a combination in various ways. At this time, the silicon oxide film 1420 may be a silicon nitride film. The silicon oxide film 1410 may be removed or may remain. For example, if the silicon oxide film 1410 is removed, a silicon nitride film 1310, for example, is formed as a second insulating film to a thickness of 1,000 to 10,000 nm on the p-type silicon substrate 1100 or the first impurity layer 1710 (FIGS. 1398 and 1419).

Subsequently, using a resist film R6 patterned by a known photolithographic technique as a mask, the silicon nitride film 1310 is etched by reactive ion etching, for example, to form a fourth trench 1240 in a lattice form (FIGS. 1399 and 1420).

Then, a silicon oxide film 1421, for example, is deposited as a fifth insulating film to a thickness of 50 to 500 nm by CVD in the lattice-form fourth trench 1240.

The silicon oxide film 1421 is buried in the fourth trench 1240 to a desired depth, for example, by isotropic etching (FIGS. 1400 and 1421). Then, on the surface of the silicon nitride film 1310, a silicon oxide film 1431, for example, is deposited as a fourth insulating film to a thickness of 1 to 10 nm and a polysilicon film 1511, for example, is deposited as a first conductive film to a thickness of about 50 to 200 nm (FIGS. 1401 and 1422).

In the same manner, the polysilicon film 1511 is etched back in the form of a sidewall spacer of a desired height (FIGS. 1402 and 1422). At this time, the polysilicon films 1511 (the first conductive films) are formed to surround the silicon nitride films 1310, respectively, and isolated from each other.

Subsequently, an interlayer insulating film 1611 is formed on the surface of the polysilicon film 1511 (FIG. 1403 and FIG. 1424). This interlayer insulating film 1611 may be formed of an ONO film. The ONO film may be formed in the same manner as in Production example 1.

Then, in the same manner, a polysilicon film 1521, for example, is deposited as a second conductive film to a thickness of 15 to 150 nm (FIGS. 1404 and 1425) and etched back to a depth corresponding to the deposit thickness, thereby the interlayer insulating film 1611 on the silicon oxide film 1421 is exposed and the polysilicon film 1521 is disposed on the side of the polysilicon film 1511 (the first conductive film) with intervention of the interlayer insulating film 1611. At this time, a polysilicon film 1525 (a second conductive film) remains around the silicon nitride film 1310. It is preferable that the polysilicon film 1521 and the polysilicon film 1525 are separated (FIGS. 1405 and 1426). At this time, by setting the intervals between the fourth trenches 1240 in a direction of A-A' in FIG. 5 to a predetermined value or smaller, the polysilicon film 1521 is formed into a third wiring layer to be a control gate line continuous in the direction without need to use a masking process.

Thereafter, a silicon oxide film 1422, for example, is deposited as a fifth insulating film to a thickness of 50 to 500 nm.

Then, a silicon oxide film 1422, for example, is buried as a fifth insulating film in the fourth trench 1240 to a desired depth by isotropic etching (FIGS. 1406 and 1427). Using the silicon oxide film 1422 as a mask, the exposed polysilicon film 1525 is removed by isotropic etching (FIGS. 1407 and 1428). At this time, the etching is performed in an etching amount corresponding to the thickness of the polysilicon film 1525. Thereby, variations in the production process can be reduced.

Subsequently, the polysilicon film 1525 remaining between the silicon nitride film 1310 and the silicon oxide film 1422 is removed by isotropic or anisotropic etching (FIGS. 1408 and 1429).

Then, a silicon oxide film 1482, for example, is deposited as a sixth insulating film to a thickness of 8 to 80 nm such that it is buried in a space between the silicon nitride film 1310 and the silicon oxide film 1422. At this time, it is preferred that the thickness of the silicon oxide film 1482 is about half or more of the thickness of the polysilicon film 1521 (FIGS. 1409 and 1430).

Then, isotropic etching is performed to a depth corresponding to the deposit thickness of the silicon oxide film 1482, thereby the interlayer insulating film 1611 present on the side of the silicon nitride film 1310 is exposed and the silicon oxide film 1482 is buried in the fourth trench 1240 (FIGS. 1410 and 1431). Here, explanation is given of the formation of the polysilicon film 1521 as the second conductive film. However, the polysilicon film 1521 may be formed into the form of a sidewall spacer merely by a combination of deposition and anisotropic etching.

Thereafter, using the silicon oxide film 1422 as a mask, the interlayer insulating film 1611 is partially removed by isotropic etching, for example (FIGS. 1411 and 1423).

By repeating likewise, a polysilicon film 1522 is disposed as a second conductive film on the side of a polysilicon film 1512 with intervention of an interlayer insulating film 1612, and then the polysilicon film 1522 is buried by forming thereon a silicon oxide film 1423 (a fifth insulating film) and a silicon oxide film 1483 (a sixth insulating film).

The top of the silicon nitride film 1310 is exposed by etch-back or by CMP (FIGS. 1412 and 1433). At this time, the silicon oxide film 1423 may be a silicon nitride film.

The silicon nitride film 1310 is selectively removed by isotropic etching to form a first trench 1210.

Then, a silicon oxide film 1440 is formed as a third insulating film to be a tunnel oxide film to a thickness of about 10 nm by CVD on the inner wall of the first trench 1210 (FIGS. 1413 and 1434). The silicon oxide film 1440, however, may be formed of not only a CVD oxide film but also a thermally oxidized film or a nitrogen oxide film.

Subsequently, the silicon oxide film 1440 formed on the first impurity diffusion layer 1710 or the p-type silicon substrate 1100 is selectively removed. For example, the silicon oxide film 1440 is anisotropically etched to remain in the form of a sidewall spacer only on the sidewall of the first trench 1210.

The silicon oxide film 1440 is subjected to thermal treatment or the like in the same manner as in Production example 69.

Then, if required, an oxide film generated on the surface of the first impurity diffusion layer 1710 or the p-type silicon substrate 1100 is optionally removed by using diluted HF, for example, and island-like semiconductor layers 1721 to 1723, 1111 and 1112 are buried in the first trench 1210. For example, from the first impurity diffusion layer 1710 or the p-type silicon substrate 1100 located at the bottom of the first trench 1210, the semiconductor layers are formed selectively by epitaxial growth. At this time, from the bottom, an N-type semiconductor layer 1721, a P-type semiconductor layer 1111, an N-type semiconductor layer 1722, a P-type semiconductor layer 1112 and an N-type semiconductor layer 1723 are sequentially formed (FIGS. 1414 and 1435). The N-type semiconductor layers 1721 to 1723 are formed at an arsenic concentration of about $1\times10^{18}$ to $1\times10^{21}/cm^3$ and the P-type semiconductor layers 1111 and 1112 are formed at a boron concentration of about $1\times10^{15}$ to $1\times10^{17}/cm^3$. It is preferable that the N-type semiconductor layers 1721 and 1722 are overlapped with the polysilicon film 1511 (the first conductive film) with intervention of the silicon oxide film 1440 (the third insulating film), respectively. It is also preferred that the N-type semiconductor layers 1722 and 1723 are overlapped with the polysilicon film 1512 (the first conductive film) with intervention of the silicon oxide film 1440 (the third insulating film), respectively.

Thereafter, the N-type semiconductor layer 1723 is reduced by etch-back or CMP, for example, to expose the silicon oxide film 1423 (the fifth insulating film). Thereby the N-type semiconductor layer 1723 is separated.

Then, a fourth wiring layer is formed so that its direction crosses the direction of the second or third wiring layer and is connected to the top portion of the N-type semiconductor layer 1723.

Thereafter, by known techniques, an interlayer insulating film is formed, and a contact hole and metal wiring are formed. Thereby, a semiconductor memory is realized which has a memory function according to the state of a charge in the charge storage layer which is the floating gate made of the polysilicon film (the first conductive film) (FIGS. 1415 and 1436).

In this example, films formed on the surface of the semiconductor substrate or the polysilicon film such as the silicon nitride film (the second insulating film) 1310 may be formed of a layered film of a silicon oxide film/a silicon nitride film from the silicon surface. With regard to the polysilicon films 1511 and 1512 (the first conductive films) and the polysilicon films 1521 and 1522 (the second conductive films), impurity introduction may be carried out during or after the formation of the polysilicon films or after the formation of the sidewall spacer. The timing of the impurity introduction to the polysilicon films is not particularly limited so long as these films become conductive films.

In this example, the control gates of the memory cells are formed continuously in one direction without using a mask. However, that is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

PRODUCTION EXAMPLE 75

In a semiconductor memory to be produced in this example, a plurality of floating gates are formed as charge storage layers and selection gates and control gates are formed. Then, tunnel oxide films are formed and island-like semiconductor layers in a pillar form are formed by selective epitaxial silicon growth. The island-like semiconductor layers are each in an electrically floating state with respect to the semiconductor substrate. The active regions of memory cells are electrically in common. Selection gate transistors are disposed at the top and the bottom of the island-like semiconductor layer. A plurality of memory transistors, for example, two memory transistors, are placed between the selection gate transistors. The tunnel oxide films of the transistors are formed at the same time. The transistors are connected in series along the island-like semiconductor layer. Further, the thickness of gate insulating films of the selection gate transistors is equal to the thickness of gate insulating films of the memory transistors.

Such a semiconductor memory may be produced by the following process. FIGS. 1437 to 1439 and FIGS. 1440 to 1442 are sectional views taken on line A-A' and line B-B', respectively, in FIG. 1 illustrating an EEPROM memory cell array. FIGS. 1443 to 1445 and FIGS. 1446 to 1448 are sectional views taken on line A-A' and line B-B', respectively, in FIG. 1 illustrating an EEPROM memory cell array.

In this example, production steps are the same as those of Production example 69 (FIGS. 1259 to 1277 and 1284 to 1302) until the polysilicon film 1522 (the second conductive film) is disposed on the side of the polysilicon film 1512 (the first conductive film) with intervention of the interlayer insulating film 1612. However, in the step of burying the silicon oxide film 1423 (the fifth insulating film) in the fourth trench 1240, the silicon oxide film 1423 is formed on the polysilicon film 1522 to a controlled thickness of about 20 to 40 nm. Alternatively, the polysilicon film 1522 is exposed to form a thermally oxidized film of about 20 to 40 nm thick (FIGS. 1437 and 1440). At this time, by setting the interval between the polysilicon films 1512 and 1513 which are formed as first conductive films to be floating gates of memory cells to 20 to 30 nm (FIGS. 1438 and 1441), an impurity diffusion layer 1723, which is one of the island-like semiconductor layers 1721 to 1725 to be formed in the first trench 1210 in a later step, need not to be formed between the memory cells (FIGS. 1439 and 1442).

In another example, production steps are the same as those of Production example 69 (FIGS. 1259 to 1266 and 1284 to 1291) until the polysilicon film (the first conductive film) 1511 is formed. However, between the selection gate and the memory cell, the silicon oxide film 1422 (the fifth insulating film) to be buried in the fourth trench 1240 is formed on the polysilicon film 1521 (the first conductive film) to a controlled thickness of about 20 to 40 nm.

Alternatively, the polysilicon film 1521 is exposed to form a thermally oxidized film of about 20 to 40 nm thick (FIGS. 1443 and 1446).

Further, between the memory cells, the silicon oxide film 1423 (the fifth insulating film) to be buried in the fourth trench 1240 is formed on the polysilicon film 1522 (the second conductive film) to a controlled thickness of about 20 to 40 nm. Alternatively, the polysilicon film 1522 is exposed to form a thermally oxidized film of about 20 to 40 nm thick (FIGS. 1444 and 1447). At this time, by setting the interval between the polysilicon films 1512 and 1513 which are formed as first conductive films to be floating gates of memory cells to 20 to 30 nm, impurity diffusion layers 1722, 1723 and 1724, which are the island-like semiconductor layers to be formed in the first trench 1210 in a later step, need not to be formed between the selection gate and the memory cell (FIGS. 1445 and 1448).

PRODUCTION EXAMPLE 76

In a semiconductor memory to be produced in this example, a plurality of floating gates are formed as charge storage layers and selection gates and control gates are formed. Then, tunnel oxide films are formed and island-like semiconductor layers in a pillar form are formed by selective epitaxial silicon growth. The island-like semiconductor layers are each in an electrically floating state with respect to the semiconductor substrate. The active regions of memory cells are electrically in common. Selection gate transistors are disposed at the top and the bottom of the island-like semiconductor layer. A plurality of memory transistors, for example, two memory transistors, are placed between the selection gate transistors. The tunnel oxide films of the transistors are formed at the same time. The transistors are connected in series along the island-like semiconductor layer. The thickness of gate insulating films of the selection gate transistors is equal to the thickness of gate insulating films of the memory transistors. Transmission gates are disposed between the transistors for transmitting potentials to the active regions of the memory cell transistors.

Such a semiconductor memory may be produced by the following process. FIGS. 1449 and 1450 are sectional views taken on line A-A' and line B-B', respectively, in FIG. 1 illustrating an EEPROM memory cell array.

In this example, production steps are the same as those of Production example 69 except that the step of forming gate electrodes of the polysilicon film 1530 (the third conductive film) is added after the polysilicon films 1521, 1522, 1523 and 1524 are formed.

That is, after the formation of the polysilicon films 1521, 1522, 1523 and 1524, the silicon oxide films 1424 to 1422 (the fifth insulating films) and the interlayer insulating films 1612 and 1613 are removed by isotropic etching such that the island-like semiconductor layer 1110 is exposed between the polysilicon films 1521 and 1522 (the first conductive films).

Then, an oxide film 1400 is formed as a twenty-first insulating film on the surface of the island-like semiconductor layer 1110 between the selection gate and the memory cell and exposed surfaces of the polysilicon films 1511, 1512, 1513, 1514, 1521, 1522, 1523 and 1524 (the second conductive films), for example, by thermal oxidization, and then a polysilicon film 1530 is deposited as a third conductive film on the entire surface.

The polysilicon film 1530 is anisotropically etched back to such a degree that a space between the polysilicon films 1523 and 1524 is not exposed.

Then, a semiconductor memory is completed in the same manner as in Production example 69 (FIGS. 1449 and 1450).

PRODUCTION EXAMPLE 77

In this example, explanation is given of an example of production process for obtaining a structure in which the direction of the first wiring layer is parallel to the direction of the fourth wiring layer. FIGS. 1451 to 1453 and 1454 to 1456 are sectional views taken on line A-A' and line B-B', respectively, in FIG. 1 illustrating an EEPROM memory cell array.

In this example, production steps are the same as those of Production example 69 except that the first insulating film 1410 and the p-type silicon substrate 1100 are etched by 200 to 2,000 nm by reactive ion etching using a resist film R5 patterned by a known photolithographic technique as a mask (FIGS. 1260 and 1285) such that the first impurity layer 1710 is separated, thereby forming a second trench 1220 in a direction crossing a second wiring layer to be a continuous gate line (FIGS. 1451 to 1453 and 1454 to 1456).

Thereby, a semiconductor memory is realized in which the first wiring layer is parallel to the fourth wiring layer and which has a memory function according to the state of a charge in the charge storage layer which is the floating gate made of the polysilicon film (the first conductive film).

In this example, films formed on the surface of the semiconductor substrate or the polysilicon film such as the silicon nitride film (the second insulating film) 1310 may be formed of a layered film of a silicon oxide film/a silicon nitride film from the silicon surface. With regard to the polysilicon films 1511 to 1514 (the first conductive films) and the polysilicon films 1522 and 1523 (the second conductive films), impurity introduction may be carried out during or after the formation of the polysilicon films or after the formation of the sidewall spacer. The timing of the impurity introduction to the polysilicon films is not particularly limited so long as these films become conductive films.

In this example, the control gates of the memory cells are formed continuously in one direction without using a mask. However, that is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

Further, by providing the selection gates in the top and the bottom of a set of memory cells, it is possible to prevent the phenomenon that a memory cell transistor is over-erased.

PRODUCTION EXAMPLE 78

In this example, explanation is given of an example of production process for obtaining a structure in which the first wiring layer is electrically common to the memory array. FIGS. 1457 to 1458 and FIGS. 1459 to 1460 are sectional views taken on line A-A' and line B-B', respectively, in FIG. 1 illustrating an EEPROM memory cell array.

In this example, the second trench 1220 is not formed in the semiconductor substrate 1100. This example is the same as Production Example 69 from which the steps regarding the formation of the second trench 1220 is omitted.

Thereby, a semiconductor memory is realized in which at least the first wiring layer in the array is not divided but is common and which has a memory function according to the state of a charge in the charge storage layer which is the floating gate made of the polysilicon film (the first conductive film) (the first conductive film) (FIGS. 1457 to 1458 and FIGS. 1459 to 1460).

PRODUCTION EXAMPLE 79

This example shows an example of production process for producing a semiconductor memory in which floating gates are formed as charge storage layers and then island-like semiconductor layers are formed. Explanation is given of an example of production process for forming rectangular floating gates. FIGS. 1461 to 1466 and FIGS. 1467 to 1472 are sectional views taken on line A-A' and line B-B', respectively, in FIG. 1 illustrating an EEPROM memory cell array.

In this example, for forming polysilicon films 1511 to 1514 as first conductive films, a polysilicon film 1512 (a first conductive film) covering a silicon nitride film 1310 (a second insulating film) is anisotropically etched in the form of a sidewall spacer. Then, a silicon oxide film 1462 is buried as an eighth insulating film in a space formed by the polysilicon film 1512 to a desired depth. Using the silicon oxide film 1462 as-a mask, the polysilicon film 1512 is partially removed by isotropic or anisotropic etching (FIGS. 1461 to 1464 and 1467 to 1470).

Then, the silicon oxide film 1462 is removed and the polysilicon film 1512 is arranged in the form of a rectangle. A polysilicon film 1522 (a second conductive film) may be arranged in the same manner. Further, the polysilicon films 1511 to 1514 which are selection gates may be arranged in the same manner (FIGS. 1465 to 1466 and 1471 to 1472).

PRODUCTION EXAMPLE 80

This example shows an example of production process for producing a semiconductor memory in which floating gates are formed as charge storage layers and then island-like semiconductor layers are formed. Explanation is given of an example of production process of forming a structure in which the side and the top of the floating gate are covered with the control gate with intervention of an interlayer insulating film. FIGS. 1473 to 1476 and FIGS. 1477 to 1480 are sectional views taken on line A-A' and line B-B', respectively, in FIG. 1 illustrating an EEPROM memory cell array.

In this example, production steps are the same as those of Production example 69 until the polysilicon film 1522, for example, is deposited as the second conductive film to a thickness of 15 to 150 nm.

Then, the polysilicon film 1522 is etched back to a depth corresponding to the deposit thickness, thereby the interlayer insulating film 1612 present on the silicon oxide film 1422 (the fifth insulating film) is exposed and the polysilicon film 1522 is disposed on the side of the polysilicon film 1512 (the first conductive film) with intervention of the interlayer insulating film 1612. At this time, a polysilicon film 1522 (a second conductive film) remains around the silicon nitride film 1310 (FIGS. 1473 and 1477).

Subsequently, a silicon oxide film 1423, for example, is deposited as a fifth insulating film in the fourth trench 1240 to a thickness of 50 to 500 nm.

The silicon oxide film 1423 is buried in the fourth trench 1240 to a desired depth, for example, by isotropic etching (FIGS. 1474 and 1478). Using the silicon oxide film 1423 as a mask, the exposed polysilicon film 1522 is removed by isotropic or anisotropic etching (FIGS. 1475 and 1479). At this time, the etching is performed in an etching amount corresponding to the thickness of the polysilicon film 1522. Thereby, variations in the production process can be reduced.

Subsequently, the polysilicon film 1522 is arranged such that it remains between the silicon nitride film 1310 and the silicon oxide film 1423 (FIGS. 1476 and 1480). Thereby, an area increases in which the polysilicon film 1512 contacts the polysilicon film 1522 with intervention of the interlayer insulating film 1612, which improves the coupling ratio.

PRODUCTION EXAMPLE 81

This example shows an example of production process for producing a semiconductor memory in which floating gates are formed as charge storage layers and then island-like semiconductor layers are formed. Explanation is given of an example of production process in which the transistor gates have different lengths in a vertical direction. FIGS. 1481 to 1482 and FIGS. 1483 to 1484 are sectional views taken on line A-A' and line B-B', respectively, in FIG. 1 illustrating an EEPROM memory cell array.

In this example, regarding the polysilicon films (the first conductive films) 1511 to 1514 to be the memory cell gates or the selection gates, the selection gates of the polysilicon films 1511 and 1514 may have different lengths in a direction vertical to the semiconductor substrate 1100 as shown in FIGS. 1481 and 1483.

Further, as shown in FIGS. 1482 and 1484, the memory cell gates of the polysilicon films 1512 and 1513 may have different lengths in a direction vertical to the semiconductor substrate 1100, and the polysilicon films 1511 to 1514 may have different vertical lengths.

PRODUCTION EXAMPLE 82

This example shows an example of production process for producing a semiconductor memory in which floating gates are formed as charge storage layers and then island-like semiconductor layers are formed. Explanation is given of an example of production process in which the active regions of the transistors have different lengths in a vertical direction. FIGS. 1485 and 1486 are sectional views taken on line A-A' and line B-B', respectively, in FIG. 1 illustrating an EEPROM memory cell array.

In this example, regarding the semiconductor layers 1111 to 1114 to be channel regions of the memory cells or the selection transistors, the selection gates of the semiconductor layers 1111 and 1114 may have different channel lengths in a direction vertical to the semiconductor substrate 1100, or alternatively, the memory cells of the semiconductor layers 1112 and 1113 may have different channel lengths in a direction vertical to the semiconductor substrate 1100 as shown in FIGS. 1485 and 1486.

PRODUCTION EXAMPLE 83

This example shows an example of production process for producing a semiconductor memory in which floating gates are formed as charge storage layers and then island-like semiconductor layers are formed. Explanation is given of an example of production process in which the impurity diffusion layer 1725 formed on the top of the island-like semiconductor layer 1110 and connected to the fourth wiring layer 1840 has a large height. FIGS. 1487 and 1488 are sectional views taken on line A-A' and line B-B', respectively, in FIG. 1 illustrating an EEPROM memory cell array.

In this example, the impurity diffusion layer 1725 connected to the fourth wiring layer 1840 may have a large height. (FIGS. 1487 and 1488). At this time, a silicon oxide film 1425 (a fifth insulating film) may be designed to have a large thickness and the insulating properties improve between the polysilicon film (the first conductive film) 1514 and the fourth wiring layer 1840. Or, since an increased area of the impurity diffusion layer 1725 can be exposed, better connection is obtained between the impurity diffusion layer 1725 and the fourth wiring layer 1840.

PRODUCTION EXAMPLE 84

This example shows an example of production process for producing a semiconductor memory in which floating gates are formed as charge storage layers and then island-like semiconductor layers are formed. Explanation is given of an example of production process in which the impurity diffusion layer 1725 located on the top of the semiconductor layer 1110 is arranged to form the fourth wiring layer 1840. FIGS. 1489 to 1490 and 1491 to 1492 are sectional views taken on line A-A' and line B-B', respectively, in FIG. 1 illustrating an EEPROM memory cell array.

In this example, the semiconductor layer 1725 is arranged by reactive ion etching by using a resist film R8 patterned by a known photolithographic technique as a mask (FIGS. 1489 and 1491) to form a fourth wiring layer so that its direction crosses the direction of the second or third wiring layer (FIGS. 1490 and 1492).

PRODUCTION EXAMPLE 85

This example shows an example of production process for producing a semiconductor memory in which floating gates are formed as charge storage layers and then island-like semiconductor layers are formed. FIGS. 1493 to 1494 and 1495 to 1496 are sectional views taken on line A-A' and line B-B', respectively, in FIG. 1 illustrating an EEPROM memory cell array.

In this example, the silicon nitride film 1310 may have the top and the bottom having different outward shape as shown in FIGS. 1493 and 1495 through the formation of the first trench 1210 by reactive ion etching.

Also the top and the bottom of the island-like semiconductor layer 110 may be shifted in a horizontal direction as shown in FIG. 1494 and FIG. 1495.

For example, in the case where the silicon nitride film 1310 is circular in plan view, the former silicon nitride film 1310 shows a truncated cone shape and the latter silicon nitride film 1310 shows an inclined column shape. The shape of the silicon nitride film 1310 is not particularly limited so long as the memory cells can be disposed in series in the direction vertical to the semiconductor substrate 1100.

PRODUCTION EXAMPLE 86

This example shows an example of production process for producing a semiconductor memory in which floating gates are formed as charge storage layers and then island-like semiconductor layers are formed. Explanation is given of an example of production process in which the island-like semiconductor layer 1100 has an altered shape at its bottom. FIGS. 1497 to 1500 and 1501 to 1504 are sectional views taken on line A-A' and line B-B', respectively, in FIG. 1 illustrating an EEPROM memory cell array.

In this example, the first lattice-form trench 1210 may have a linear slant shape at its bottom as shown in FIGS. 1497 and 1501 and FIGS. 1498 and 1502.

Alternatively, the first lattice-form trench 1210 may have a rounded slant shape at its bottom as shown in FIGS. 1499 and 1503 and FIGS. 1500 and 1504.

Here, the bottom of the polysilicon film (the first conductive film) 1511 may or may not reach the slant bottom of the first trench 1210.

PRODUCTION EXAMPLE 87

This example shows an example of production process for producing a semiconductor memory in which floating gates are formed as charge storage layers and then island-like semiconductor layers are formed. Explanation is given of the shape of the deposited polysilicon film. FIGS. 1505 to 1510 and 1511 to 1516 are sectional views taken on line A-A' and line B-B', respectively, in FIG. 1 illustrating an EEPROM memory cell array.

The first polysilicon films 1511 to 1514 and the second polysilicon films 1521 to 1524 covering the silicon nitride film 1310 (the second insulating film) may have a shape such that it is uniformly deposited along the bottom shape of the first trench 1210 as shown in FIGS. 1505 to 1510 and 1511 to 1516. Alternatively, the polysilicon films may have a shape such that it is deposited partially ununiformly according to the bottom shape of the first trench 1210 as in the same manner as in Production example 69.

PRODUCTION EXAMPLE 88

This example shows an example of production process for producing a semiconductor memory in which the selection gates and the floating gates of the transistors are formed at the same time. Explanation is given of a production process for forming terminals which electrically connect first, second and third wiring layers to a peripheral circuit, respectively. FIGS. 1517 to 1522 are sectional views taken on line H-H', line I1-I1', line I2-I2', line I3-I3', line I4-I4', and line I5-I5', respectively, of FIGS. 10 and 11 illustrating a memory cell array of EEPROM. FIGS. 336 to 341 are also the same. These sectional views are taken at locations showing sites 1921, 1932, 1933, 1934 and 1910 where terminals mounted on the top face of the semiconductor device are electrically connected to the wiring layers 1511, 1522, 1523, 1514 and 1710 for the application of voltage to the buried wiring layers from outside.

In this example, the buried first, second and third wiring layers in a region of a lead-out portion may be arranged into steps as shown in FIGS. 1517 to 1522 and first, second and third contact portions 1921, 1932, 1933, 1934 and 1910 are formed to reach the edges of the wiring layers, respectively, so that they do not contact other wiring layers than the intended one. Thereby, the first, second and third wiring layers may be lead out to the top face of the semiconductor memory.

Instead of forming the first, second and third contact portions 1921, 1932, 1933, 1934 and 1910, the conductive films may be arranged such that they are lead out to the top face of the semiconductor memory to obtain the same effect as the above.

Alternatively, the buried first, second and third wiring layers in a region of a lead-out portion may be arranged as shown in FIGS. 1523 to 1528 and first, second and third contact portions 1921, 1932, 1933, 1934 and 1910 are opened. Then, a silicon oxide film 1499, for example, is deposited as a twenty-third insulating film to a thickness of 10 to 100 nm and etched back to a depth corresponding to the deposit thickness in the form of a sidewall spacer on the inner wall of each contact portion formed in the leading out portion. Thereafter, the first, second and third wiring layers may be lead out to the top face of the semiconductor memory by burying metal or a conductive film in the contact portions (FIGS. 1523 to 1528). At this time, the twenty-third insulating film may be made of not only a silicon oxide film but also a silicon nitride film as long as it is an insulating film.

For leading out the wiring layers, a common contact portion may be formed in the region of the lead-out portion of the memory cells continuous in a direction of A-A' as shown in FIGS. 1526 to 1528, or alternatively, the contact portions may be formed in the lead out portions of the memory cells, respectively as shown in FIGS. 1517 to 1522.

The lead-out of the first, second and third wiring layers to the top face of the semiconductor by the above-described process is applicable to all examples of the present invention.

PRODUCTION EXAMPLE 89

This example shows an example of production process for producing a semiconductor memory in which the transistor, the capacitor, the capacitor and the transistor are arranged in this order from the top of the island-like semiconductor layer 1110 to form a DRAM. FIGS. 1529 and 1530 are sectional views taken on line A-A' and line B-B', respectively, in FIG. 13 illustrating an EEPROM memory cell array.

In this example, production steps are according to those of Production example 71 except that the impurity diffusion layer 1710 is not formed and thus the step of separating the impurity diffusion layer 1710 is not carried out. FIGS. 1529 and 1530 show a structure of the semiconductor memory of this example.

Thereby, a plurality of capacitors formed on the island-like semiconductor layers 1110 are separated by the transistors. Further, since the impurity diffusion layer 1710 is not used as a wiring layer, wiring capacitance is reduced.

The above-described examples in which the island-like semiconductor layers 1110 are formed in a pillar-form by selective epitaxial silicon growth after a plurality of charge storage layers are formed may be combined in any way.

PRODUCTION EXAMPLE 90

In a semiconductor memory to be produced in this example, a semiconductor substrate is patterned in the form of pillars to form island-like semiconductor layers. Sides of the island-like semiconductor layers make active regions. A plurality of tunnel oxide films and floating gates as charge storage layers are formed on the active regions. The island-like semiconductor layers are each in an electrically floating state with respect to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The transistors are formed from the bottom to the top.

Such a semiconductor memory may be produced by the following process. FIGS. 1531 to 1540 and FIGS. 1541 to 1550 are sectional views taken on line A-A' and line B-B', respectively, in FIG. 1 illustrating a memory cell array of an EEPROM.

First, a silicon nitride film 310, for example, is deposited to a thickness of 200 to 2,000 nm as a first insulating film to be a mask layer on a surface of a P-type silicon substrate 100. Using a resist film R11 patterned by a known photolithographic technique as a mask (FIG. 1531 and FIG. 1541), the silicon nitride film 310 is etched by reactive ion etching.

The P-type silicon substrate 100 is etched to a depth of about 2,000 to 20,000 nm by reactive ion etching using the silicon nitride film 310 as a mask to form a first trench 210 in a lattice form. Thereby the P-type silicon substrate 100 is separated into a plurality of island-like pillar-form semiconductor layers 110.

The surface of the island-like semiconductor layer 110 is oxidized to form a second insulating film, for example, a thermally oxidized film 410, to a thickness of 10 nm to 100 nm (FIGS. 1532 and 1542). At this time, if the island-like semiconductor layer 110 has been formed in the minimum photoetching dimension, the dimension of the island-like semiconductor layer 110 is decreased by the formation of the thermally oxidized film 410, that is, the island-like semiconductor layer 110 is formed to have a dimension not larger than the minimum photoetching dimension.

Next, the thermally oxidized film 410 is etched away from the periphery of each island-like semiconductor layer 110, for example, by isotropic etching (FIGS. 1533 and 1543). Then, as required, channel ion implantation is carried out into the sidewall of the island semiconductor layers 110 by slant ion implantation. For example, the ion implantation may be performed at an implantation energy of 5 to 100 keV at a boron dose of about $1\times10^{11}$ to $1\times10^{13}/cm^2$ at an angle of 5 to 45° with respect to the normal line of the surface of the substrate. Preferably the channel ion implantation is performed from various directions to the island-like semiconductor layers 110 because a surface impurity concentration becomes more uniform. Alternatively, instead of the channel ion implantation, an oxide film containing boron may be deposited by CVD with a view to utilizing diffusion of boron from the oxide film. The impurity implantation from the surface of the island-like semiconductor layers 110 may be carried out before the island-like semiconductor layers 110 are covered with the thermally oxidized film 410, or the impurity implantation may be finished before the island-like semiconductor layers 110 are formed. Means for the implantation are not particularly limited so long as an impurity concentration distribution is almost equal over the island-like semiconductor layers 110.

Subsequently, a silicon oxide film 431, for example, is deposited as a fifth insulating film in the lattice-form first trench 210 to a thickness of 50 to 500 nm by CVD and etched back to a desired depth so that the silicon oxide film 431 is buried in the first trench 210. The deposition and the etch-back of the silicon oxide film 431 may be carried out without removing the thermally oxidized film 410 by etching.

Then, a silicon oxide film 481, for example, is formed as a thirteenth insulating film to be a tunnel oxide film to a thickness of about 10 nm around each island-like semiconductor layer 110, for example, by CVD. The tunnel oxide film, however, may be formed of not only a CVD oxide film but also a thermally oxidized film or a nitrogen oxide film.

Subsequently, a polysilicon film 511, for example, is deposited as a first conductive film to a thickness of about 50 to 200 nm. The polysilicon film 511 is then etched by reactive ion etching, for example, to remain in the form of a sidewall spacer of a desired height (FIGS. 1534 and 1544).

Then, a silicon oxide film 432, for example, is deposited as a fifth insulating film to a thickness of 50 to 500 nm by CVD. The silicon oxide film 432 is then etched back by isotropic etching, for example, such that the polysilicon film 511 remaining in the form of the sidewall spacer is completely buried.

Thereafter, a silicon oxide film 422, for example, is formed as a third insulating film to be a tunnel oxide film to a thickness of about 10 nm, for example, by thermal oxidation. The silicon oxide film 422, similar to the silicon oxide film 481 (the thirteenth insulating film), may be formed of not only a thermally oxidized film but also a CVD oxide film or a nitrogen oxide film. The silicon oxide film 422 may not be formed of the same material as that of the silicon oxide film 481. The silicon oxide films 422 and 481 may be formed to have an optionally determined thickness, and the thickness of the silicon oxide film 422 may be smaller or larger than or equal to the thickness of the silicon oxide film 481.

Subsequently, a polysilicon film 512, for example, is deposited as a first conductive film to a thickness of about 50 to 200 nm. The polysilicon film 512 is then etched by reactive ion etching, for example, to remain in the form of a sidewall spacer of a desired height (FIGS. 1535 and 1545). By repeating likewise, a silicon oxide film 433 (a fifth insulating film) is embedded such that the polysilicon film 512 is buried, a silicon oxide film 423 is formed as a third insulating film to be a tunnel oxide film to a thickness of about 10 nm around each island-like semiconductor layer 110, and then a polysilicon film 513 is disposed as a first conductive film on the side of the silicon oxide film 423. In the same manner, a silicon oxide film 434 (a fifth insulating film) is embedded such that the polysilicon film 513 is buried, a silicon oxide film 484 is formed as a thirteenth insulating film to be a tunnel oxide film to a thickness of about 10 nm around each island-like semiconductor layer 110, and then a polysilicon film 514 is disposed as a first conductive film on the side of the silicon oxide film 484 (FIGS. 1536 and 1546).

Next, the silicon oxide films 434, 433, 432 and 431 (the fifth insulating films) are removed by isotropic etching, and then impurity introduction is carried out into the island-like semiconductor layers 110 and the semiconductor substrate 100 in self-alignment with the polysilicon films 511 to 514, which are separated first conductive films, and the silicon nitride film 310. For example, N-type impurity diffusion layers 710 to 724 are formed in an arsenic concentration of about $1\times10^{18}$ to $1\times10^{21}/cm^3$ by, for example, solid or vapor phase diffusion process. At this time, the impurity diffusion layer 710 to be a first wiring layer may be adjusted about its impurity concentration by ion implantation (FIG. 1537 and FIG. 1547). For example, the ion implantation may be performed at an implantation energy of 5 to 100 keV at a phosphorus dose of about $1\times10^{13}$ to $1\times10^{15}/cm^2$ in a direction inclined by about 0 to 7°. Thereafter, thermal treatment is carried out to form the impurity diffusion layers 710 to 724, thereby bringing P-type regions of the island-like semiconductor layers 110 to an electrically floating state (FIGS. 1538 and 1548). Preferably the impurity concentration distribution in the impurity diffusion layer 710 to be a first wiring layer keeps a gentle gradient towards the P-type silicon substrate 110. The impurity introduction to the polysilicon films 511 to 514 may be performed during the formation of the polysilicon film 510 or during the impurity introduction into the island-like semiconductor layers 110. The timing of the impurity introduction is not particularly limited so long as these films become conductive films.

Then, a silicon oxide film 471, for example, is deposited as an eleventh insulating film to a thickness of 50 to 500 nm by CVD and embedded by anisotropic or isotropic etching to bury the side of the polysilicon film 511.

Then, a silicon nitride film 340, for example, is deposited as a twelfth insulating film to a thickness of 5 to 50 nm to form a sidewall spacer (FIGS. 1539 and 1549).

Subsequently, the silicon oxide film 471 is etched back to such a degree that the side of the polysilicon film 511 is exposed, and a polysilicon film 521, for example, is deposited as a second conductive film to a thickness of 15 to 150 nm.

Then, the polysilicon film 521 is etched back, and the silicon oxide film 471 and the P-type silicon substrate 100 are etched by anisotropic etching, for example, to form a second trench 220 in self-alignment with the polysilicon film 521, thereby separating the impurity diffusion layer 710. That is, a separation portion of the first wiring layer is formed in self-alignment with a separation portion of the second conductive film.

Subsequently, the polysilicon film 521 is etched back to such a degree that the polysilicon film 521 is able to contact the polysilicon film 511 to form a selection gate. At this time, by setting the intervals between the island-like semiconductor layers 110 in a direction of A-A' in FIG. 1 to a predetermined value or smaller, the polysilicon film 521 is formed into a second wiring layer to be a selection gate line continuous in the direction without need to use a masking process.

Thereafter, a silicon oxide film 462, for example, is deposited as an eighth insulating film to a thickness of 50 to 500 nm by CVD and anisotropically or isotropically etched so that the silicon oxide film 462 is embedded at least to bury the polysilicon film (the second conductive film) 521. Then the sidewall spacer of the silicon nitride film (the twelfth insulating film) 340 is removed by isotropic etching and an interlayer insulating film 612 is formed on exposed surfaces of the polysilicon films 512 to 514. This interlayer insulating film 612 may be formed of an ONO film, for example. The ONO film can be formed in the same manner as Production example 1.

Subsequently, in the same manner, a polysilicon film 522 is deposited as a second conductive film to a thickness of 15 to 150 nm and etched back so that the polysilicon film 522 is disposed on the side of the polysilicon film (the first conductive film) 512 with intervention of the interlayer insulating film 612. At this time, by setting the intervals between the island-like semiconductor layers 110 in the direction of A-A' in FIG. 1 to a predetermined value or smaller, the polysilicon film 522 is formed into a third wiring layer to be a control gate line continuous in the direction of A-A' without need to use a masking process.

Thereafter, a silicon oxide film 463, for example, is deposited as an eighth insulating film to a thickness of 50 to 500 nm by CVD and anisotropically or isotropically etched so that the silicon oxide film 463 is embedded at least to bury the polysilicon film (the second conductive film) 522. By repeating likewise, a polysilicon film (a second conductive film) 523 is disposed on the side of the polysilicon film (the first conductive film) 513 with intervention of an interlayer insulating film 613. With regard to the polysilicon film 514 which is the topmost first conductive film, a polysilicon film (a second conductive film) 524 is etched back to such a degree that the polysilicon film 524 is able to contact the polysilicon film (the first conductive film) 514, in the same manner as the polysilicon film 511 which is the bottommost first conductive film. A silicon oxide film 465, for example, is deposited as a tenth insulating film to a thickness of 100 to 500 nm on the top of the polysilicon film 524. The top portion of the island-like semiconductor layer 110 provided with the impurity diffusion layer 724 is exposed by etch-back or by CMP. A fourth wiring layer is then formed so that its direction crosses the direction of the second or third wiring layer and is connected to the top portion of the island-like semiconductor layer 110.

Thereafter, by known techniques, an interlayer insulating film is formed, and a contact hole and metal wiring are formed (FIGS. 1540 and 1550).

Thereby, a semiconductor memory is realized which has a memory function according to the state of a charge in the charge storage layer which is the floating gate made of the polysilicon film (the first conductive film).

By bringing an active region of each memory cell into a floating state with respect to the semiconductor substrate, the back-bias effect from the substrate is eliminated and variations in threshold between the memory cells located at the top and the bottom of a set of memory cells connected in series are avoided at reading data.

In this example, the side of the island-like semiconductor layer 110, which makes an active region, is oxidized and the oxide film 410 is removed to form the pillar-form island-like semiconductor layer 110 having a dimension smaller than the minimum photoetching dimension. This allows increase in the ratio of the capacity between the floating gates and the control gates to the capacity between the floating gates and the pillar-form semiconductor layers without increasing the area occupied by the memory cells. Thereby, data writing and erasing in and from the memory cells can be carried out without difficulty.

Further, by providing the selection gates in the top and the bottom of a set of memory cells, it is possible to prevent the phenomenon that a memory cell transistor is over-erased.

In this example, films formed on the surface of the semiconductor substrate or the polysilicon film such as the silicon nitride film 310 and the silicon nitride film 340 may be formed of a layered film of a silicon oxide film/a silicon nitride film from the silicon surface.

The insulating films used in the present invention are not limited to an oxide film and a nitride film. Similar to the insulating film to be buried in the second trench 220, the oxide film may be replaced with the nitride film and vice versa as long as it causes no inconvenience.

In this example, the control gates of the memory cells are formed continuously in one direction without using a mask. That is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

PRODUCTION EXAMPLE 91

In a semiconductor memory to be produced in this example, a semiconductor substrate is patterned in the form of pillars to form island-like semiconductor layers. Sides of the island-like semiconductor layers make active regions. A plurality of tunnel oxide films and floating gates as charge storage layers are formed on the active regions. The island-like semiconductor layers are each in an electrically floating state with respect to the semiconductor substrate. The active region of each memory cell is in the electrically floating state. The active regions of the memory cells are electrically common. Selection gate transistors are disposed at the top and the bottom of the island-like semiconductor layer. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The transistors are formed from the bottom to the top.

Such a semiconductor memory may be produced by the following process. FIGS. 1551 to 1564 and FIGS. 1565 to 1578 are sectional views taken on line A-A' and line B-B', respectively, in FIG. 1 illustrating a memory cell array of an EEPROM.

First, a silicon nitride film 310, for example, is deposited to a thickness of 200 to 2,000 nm as a first insulating film to be a mask layer on a surface of a P-type silicon substrate 100. Using a resist film R11 patterned by a known photolithographic technique as a mask, the silicon nitride film 310 is etched by reactive ion etching. The P-type silicon substrate 100 is then etched to a depth of about 100 to 5,000 nm by reactive ion etching to form a first trench 210 in a lattice form in a direction of B-B' (FIGS. 1551 and 1565). At the etching of the P-type silicon substrate 100, the resist film R11 may be removed and the silicon nitride film 310 may be used as a mask.

Then, using a resist film R12 patterned by a known photolithographic technique as a mask, the silicon nitride film 310 is etched by reactive ion etching to form a trench 211 in a lattice form in a direction of A-A' (FIGS. 1552 and 1566).

The P-type silicon substrate 100 is etched by reactive ion etching to a depth of about 2,000 to 20,000 nm to form a trench 212 in a lattice form (FIGS. 1553 and 1567). Thereby the P-type silicon substrate 100 is separated into a plurality of island-like pillar-form semiconductor layers 110. At this time, the lattice-form trench 212 in the direction of B-B' is formed to have a larger depth than that of the trench 212 in the direction of A-A'.

Subsequently, in the same manner as Production example 90, channel ion implantation is carried out into the sidewall of the island semiconductor layers 110. Means and timing for the implantation are not particularly limited as in the same manner as Production example 90.

The surface of the island-like semiconductor layer 110 is oxidized to form a second insulating film, for example, a thermally oxidized film 410, to a thickness of 10 nm to 100 nm. If the island-like semiconductor layer 110 has been formed in the minimum photoetching dimension, the dimension of the island-like semiconductor layer 110 is decreased by the formation of the thermally oxidized film 410, that is, the island-like semiconductor layer 110 is formed to have a dimension not larger than the minimum photoetching dimension. Thereafter, a silicon oxide film 431, for example, is deposited as a fifth insulating film to a thickness of 50 to 500 nm by CVD in the lattice-form trench 212. The silicon oxide film 431 is buried in the lattice-form trench 212 in the direction of B-B' to a depth equal to or lower than the bottom of the lattice-form trench 212 in the direction of A-A', and then impurity introduction is carried out into the bottom of the separation portions between the island-like semiconductor layers 110 (FIGS. 1554 and 1568). For example, ion implantation may be performed at an implantation energy of 5 to 100 keV at an arsenic dose of about $1\times10^{13}$ to $1\times10^{16}/cm^2$ in a direction inclined by about 0 to 7°. Then, thermal treatment is carried out to diffuse impurities that have been introduced in advance to form an impurity diffusion layer 710. The impurity diffusion layer 710 does not require any additional separation process and is ready to be formed as a first wiring layer.

Then, a silicon oxide film 481, for example, is formed as a thirteenth insulating film to be a tunnel oxide film to a thickness of about 10 nm around each island-like semiconductor layer 110, for example, by thermal oxidation (FIGS. 1555 and 1569). The tunnel oxide film, however, may be formed of not only a thermally oxidized film but also a CVD oxide film or a nitrogen oxide film.

Subsequently, a polysilicon film 511, for example, is deposited as a first conductive film to a thickness of about 50 to 200 nm. The polysilicon film 511 is then etched by reactive ion etching, for example, to remain in the form of a sidewall spacer of a desired height (FIGS. 1556 and 1570). At this time, by setting the intervals between the island-like semiconductor layers 110 in a direction of A-A' in FIG. 1 to a predetermined value or smaller, the polysilicon film 511 is formed into a second wiring layer to be a selection gate line continuous in the direction without need to use a masking process.

Then, a silicon oxide film 451, for example, is deposited as a seventh insulating film to a thickness of about 10 to 30 nm around each island-like semiconductor layer 110 and the polysilicon film 511, for example, by thermal oxidation. Thereafter, a silicon oxide film 432, for example, is deposited as a fifth insulating film to a thickness of 50 to 500 nm by CVD (FIGS. 1557 and 1571) and embedded such that the polysilicon film 511 remaining in the form of the sidewall spacer is completely buried (FIGS. 1558 and 1572). At this time, the thickness of the silicon oxide film 432 is set to be 20 to 30 nm or smaller on the top portion of the polysilicon film 511.

Thereafter, a silicon oxide film 422, for example, is formed as a third insulating film to be a tunnel oxide film to a thickness of about 10 nm, for example, by thermal oxidation. The silicon oxide film 422, similar to the silicon oxide film 481 (the thirteenth insulating film), may be formed of not only a thermally oxidized film but also a CVD oxide film or a nitrogen oxide film. The silicon oxide film 422 may not be formed of the same material as that of the silicon oxide film 481. The silicon oxide films 422 and 481 may be formed to have an optionally determined thickness, and the thickness of the silicon oxide film 422 may be smaller or larger than or equal to the thickness of the silicon oxide film 481. The silicon oxide film 451 may not necessarily be formed. However, in that case, the thickness of the silicon oxide film (the third insulating film) 422 might possibly be uneven at a portion contacting the silicon nitride film (the fourth insulating film) 432. Therefore it is preferred to form the silicon oxide film 451 in advance.

Subsequently, a polysilicon film 512, for example, is deposited as a first conductive film to a thickness of about 50 to 200 nm. The polysilicon film 512 is then etched by reactive ion etching, for example, to remain in the form of a sidewall spacer of a desired height.

Then, an interlayer insulating film 612 is formed (FIGS. 1559 and 1573). This interlayer insulating film 612 may be formed of an ONO film, for example. The ONO film may be formed in the same manner as described in Production example 1.

Subsequently, a polysilicon film 522, for example, is deposited as a second conductive film to a thickness of 15 to 150 nm and etched back so that the polysilicon film 522 is disposed on the side of the polysilicon film (the first conductive film) 512 with intervention of the interlayer insulating film 612 (FIGS. 1560 and 1574). At this time, by setting the intervals between the island-like semiconductor layers 110 in the direction of A-A' in FIG. 1 to a predetermined value or smaller, the polysilicon film 522 is formed into a third wiring layer to be a control gate line continuous in the direction of A-A' without need to use a masking process.

Then, a silicon oxide film 452, for example, is deposited as a seventh insulating film to a thickness of about 10 to 30 nm around each island-like semiconductor layer 110 and the polysilicon film 522, for example, by thermal oxidation. Thereafter, a silicon oxide film 433, for example, is deposited as a fifth insulating film to a thickness of 50 to 500 nm by CVD (FIGS. 1561 and 1575). By repeating likewise, a position within 20 to 30 nm or smaller above the third wiring layer, a silicon oxide film 423 is formed as a third insulating film to be a tunnel oxide film on the surface of the island-like semiconductor layer 110. A polysilicon film 513 is disposed as a first conductive film on the side of the silicon oxide film 423 and a polysilicon film 523 is disposed as a second conductive film on the side of the polysilicon film 513 with intervention of an interlayer insulating film 613.

Then, a silicon oxide film 453, for example, is deposited as a seventh insulating film to a thickness of about 10 to 30 nm around each island-like semiconductor layer 110 and the polysilicon film 523, for example, by thermal oxidation. Thereafter, a silicon oxide film 434, for example, is deposited as a fifth insulating film to a thickness of 50 to 500 nm by CVD (FIGS. 1562 and 1576) and etched back. At this time, the thickness of the silicon oxide film 434 is set to be 20 to 30 nm or smaller on the top portion of the polysilicon film 523.

Thereafter, a silicon oxide film 484 is formed as a thirteenth insulating film to be a tunnel oxide film on the surface of the island-like semiconductor layer 110. A polysilicon film 514 (a first conductive film) is formed on the side of the silicon oxide film 484. On the polysilicon film 514, a silicon oxide film 435, for example, is deposited as a fifth insulating film to a thickness of 50 to 500 nm by CVD (FIGS. 1563 and 1577). The top portion of the island-like semiconductor layer 110 is exposed by etch-back or CMP and impurities are introduced therein. Thermal treatment is carried out to form an impurity diffusion layer 724. The impurity introduction may be realized by doping arsenic by ion implantation, or an oxide film containing arsenic may be deposited by CVD with a view to utilizing diffusion of arsenic from the oxide film.

Then, a fourth wiring layer is formed so that its direction crosses the direction of the second or third wiring layer and is connected to the top portion of the island-like semiconductor layer 110 (FIGS. 1564 and 1578).

Thereafter, by known techniques, an interlayer insulating film is formed, and a contact hole and metal wiring are formed.

The same effect as obtained by Production Example 90 can be obtained in this example. According to this example, the number of production steps is decreased, the necessary height of the island-like semiconductor layers can be reduced and variations in the production process can be reduced. Thereby, a semiconductor memory is realized which has a memory function according to the state of a charge in the charge storage layer which is the floating gate made of the polysilicon film (the first conductive film).

By bringing an active region of each memory cell into a floating state with respect to the semiconductor substrate, the back-bias effect from the substrate is eliminated and variations in threshold between the memory cells located at the top and the bottom of a set of memory cells connected in series are avoided at reading data.

In this example, the side of the island-like semiconductor layer 110, which makes an active region, is oxidized and the oxide film 410 is removed to form the pillar-form island-like semiconductor layer 110 having a dimension smaller than the minimum photoetching dimension. This allows increase in the ratio of the capacity between the floating gates and the control gates to the capacity between the floating gates and the pillar-form semiconductor layers without increasing the area occupied by the memory cells. Thereby, data writing and erasing in and from the memory cells can be carried out without difficulty.

Further, by providing the selection gates in the top and the bottom of a set of memory cells, it is possible to prevent the phenomenon that a memory cell transistor is over-erased.

In this example, films formed on the surface of the semiconductor substrate or the polysilicon film such as the silicon nitride film 310 and the silicon nitride film 340 may be formed of a layered film of a silicon oxide film/a silicon nitride film from the silicon surface.

The insulating films used in the present invention are not limited to an oxide film and a nitride film. Similar to the insulating film to be buried in the second trench 220, the oxide film may be replaced with the nitride film and vice versa as long as it causes no inconvenience.

In this example, the control gates of the memory cells are formed continuously in one direction without using a mask. However, that is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

The silicon oxide films 452 and 453 (the seventh insulating films) may not be formed for the same reason mentioned above with respect to the silicon oxide film 451. However, it is preferred to form the silicon oxide films 452 and 453 with a view to improving uniformity in thickness of the silicon oxide films 423 and 484.

In this example, memory cells or control gates are formed stage by stage, i.e., until a memory cell or a control gate at a certain stage is completed, a memory cell or a control gate at a stage thereabove is not formed. However, in the same manner as in Production example 90, the tunnel oxide films and the floating gates of every stage may be formed in advance and then a second wiring layer or an interlayer insulating film and a third wiring layer may be formed stage by stage. More particularly, this example is the same as Production example 90 except the step of forming the polysilicon films 511 to 514 (FIGS. 1534 to 1536 and 1544 to 1546), in which the polysilicon films 511 to 514 are arranged such that intervals therebetween are set to 20 to 30 nm or smaller and the impurity diffusion layers 721, 722, 723 and 724 are not formed (FIGS. 1537 and 1547).

The first wiring layer may also be formed in the same manner as in Production example 90, that is, a second trench 220 is formed in the P-type silicon substrate 110 in self-alignment with a polysilicon film 521 (FIG. 1550) and then a separation portion of the first wiring layer is formed.

PRODUCTION EXAMPLE 92

In a semiconductor memory to be produced in this example, a semiconductor substrate to which an oxide film is inserted, for example, a semiconductor portion on an oxide film of an SOI substrate, is patterned in the form of pillars to form island-like semiconductor layers. Sides of the island-like semiconductor layers make active regions. A plurality of tunnel oxide films and floating gates as charge storage layers are formed on the active regions. The island-like semiconductor layers are each electrically common to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The transistors are formed from the bottom to the top.

Such a semiconductor memory may be produced by the following process. FIGS. 1579 to 1585 and FIGS. 1586 to 1592 are sectional views taken on line A-A' and line B-B', respectively, in FIG. 1 illustrating a memory cell array of an EEPROM.

First, a silicon nitride film 310, for example, is deposited to a thickness of 200 to 2,000 nm as a first insulating film to be a mask layer on a surface of a SOI substrate 101 which is used as a substrate. Using a resist film R11 patterned by a known photolithographic technique as a mask, the silicon nitride film 310 is etched by reactive ion etching. The SOI substrate 101 is then etched to a depth of about 10 to 5,000 nm by reactive ion etching to form a first trench 210 in a lattice form in a direction of B-B' (FIGS. 1579 and 1586). At the etching of the SOI substrate 101, the resist film R11 may be removed and the silicon nitride film 310 may be used as a mask.

Then, using a resist film R12 patterned by a known photolithographic technique as a mask, the silicon nitride film 310 is etched by reactive ion etching to form a trench 211 in a lattice form in a direction of A-A' (FIGS. 1580 and 1587).

The SOI substrate 101 is etched by reactive ion etching to a depth of about 2,000 to 20,000 nm to form a trench 212 in a lattice form (FIGS. 1581 and 1588). Thereby the P-type silicon portion on the surface of the SOI substrate 101 is separated into a plurality of island-like pillar-form semiconductor layers 110. At this time, an insulating layer portion of the SOI substrate 101 is exposed in a separation portion extending in the direction of B-B' between the island-like semiconductor layers 110 and the P-type silicon portion on the surface of the SOI substrate 101 is left in a separation portion extending in the direction of A-A' between the island-like semiconductor layers 110.

Subsequently, in the same manner as Production example 90, channel ion implantation is carried out into the sidewall of the island semiconductor layers 110. Means and timing for the implantation are not particularly limited as in the same manner as Production example 90.

The surface of the island-like semiconductor layer 110 is oxidized to form a second insulating film, for example, a thermally oxidized film 410, to a thickness of 10 nm to 100 nm. If the island-like semiconductor layer 110 has been formed in the minimum photoetching dimension, the dimension of the island-like semiconductor layer 110 is decreased by the formation of the thermally oxidized film 410, that is, the island-like semiconductor layer 110 is formed to have a dimension not larger than the minimum photoetching dimension. After the thermally oxidized film 410 is thus formed, impurity introduction is carried out through the thermally oxidized film 410 into the P-type silicon portion of the surface of the SOI substrate 101 remaining in the separation portion extending in the direction of A-A' between the island-like semiconductor layers 110 (FIGS. 1582 and 1589). For example, ion implantation may be performed at an implantation energy of 5 to 100 keV at an arsenic dose of about $1\times10^{13}$ to $1\times10^{16}/cm^2$ in a direction inclined by about 0 to 7° Then, thermal treatment is carried out to diffuse impurities that have been introduced in advance to form an impurity diffusion layer 710 (FIGS. 1583 and 1590). The impurity diffusion layer 710 does not require any additional separation process and is ready to be formed as a first wiring layer.

Subsequently, a silicon oxide film 431, for example, is deposited as a fifth insulating film in the lattice-form trench 212 to a thickness of 50 to 500 nm by CVD and buried in the lattice-form trench 212 to a desired depth. Then, a silicon oxide film 481, for example, is formed as a thirteenth insulating film to be a tunnel oxide film to a thickness of about 10 nm around each island-like semiconductor layer 110, for example, by CVD (FIGS. 1584 and 1591). The tunnel oxide film, however, may be formed of not only a CVD oxide film but also a thermally oxidized film or a nitrogen oxide film.

Production steps thereafter follow Production example 91 (FIGS. 1556 to 1564 and 1570 to 1578).

According to this example, the same effect as obtained by Production Example 91 can be obtained, and furthermore, the junction capacitance of the impurity diffusion layer 710 which functions as the first wiring layer is suppressed or removed. Thereby, a semiconductor memory is realized which has a memory function according to the state of a charge in the charge storage layer which is the floating gate made of the polysilicon film (the first conductive film).

By bringing an active region of each memory cell into a floating state with respect to the semiconductor substrate, the back-bias effect from the substrate is eliminated and variations in threshold between the memory cells located at the top and the bottom of a set of memory cells connected in series are avoided at reading data.

In this example, the side of the island-like semiconductor layer 110, which makes an active region, is oxidized and the oxide film 410 is removed to form the pillar-form island-like semiconductor layer 110 having a dimension smaller than the minimum photoetching dimension. This allows increase in the ratio of the capacity between the floating gates and the control gates to the capacity between the floating gates and the pillar-form semiconductor layers without increasing the area occupied by the memory cells. Thereby, data writing and erasing in and from the memory cells can be carried out without difficulty.

Further, by providing the selection gates in the top and the bottom of a set of memory cells, it is possible to prevent the phenomenon that a memory cell transistor is over-erased.

In this example, films formed on the surface of the semiconductor substrate or the polysilicon film such as the silicon nitride film 310 and the silicon nitride film 340 may be formed of a layered film of a silicon oxide film/a silicon nitride film from the silicon surface.

The insulating films used in the present invention are not limited to an oxide film and a nitride film. Similar to the insulating film to be buried in the second trench 220, the oxide film may be replaced with the nitride film and vice versa as long as it causes no inconvenience.

In this example, the control gates of the memory cells are formed continuously in one direction without using a mask. That is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

PRODUCTION EXAMPLE 93

In a semiconductor memory to be produced in this example, gate oxide films 481 and 484 and tunnel oxide films 422 and 423 are formed by thermal oxidation of the island-like semiconductor layer 110 in the same manner as Production example 90. However, as shown in FIGS. 1594 and 1596, a diameter of the island-like semiconductor layer 110 decreases stage by stage from the bottom to the top.

For example, if the gate oxide film (the thirteenth insulating film) 481 is formed through thermal oxidation of the island-like semiconductor layer 110, the side of the island-like semiconductor layer 110 is consumed to form the silicon oxide film 481. Then, at the removal of the silicon oxide film (the fifth insulating film), the silicon oxide film 481 is removed together from a portion where the polysilicon film (the first conductive film) 511 is not formed to cover the silicon oxide film 481. Thereby, as shown in FIGS. 1593 and 1595, the diameter of the island-like semiconductor layer 110 is reduced. A memory cell and a selection gate to be formed at an upper stage are formed on the island-like semiconductor layer 110 whose diameter has been reduced. Therefore, in the memory cells and the selection gates at every stage, the diameter of the island-like semiconductor layer 110 decreases with height.

The shape of the island-like semiconductor layer 110 is not particularly limited as long as the memory cells are arranged in series in a direction perpendicular to the semiconductor substrate 100 as shown in FIGS. 1594 and 1596.

PRODUCTION EXAMPLE 94

In a semiconductor memory to be produced in this example, a semiconductor substrate is patterned in the form of pillars to form island-like semiconductor layers. Sides of the island-like semiconductor layers make active regions. A plurality of tunnel oxide films and laminated insulating films as charge storage layers are formed on the active regions. The island-like semiconductor layers are each in an electrically floating state with respect to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The transistors are formed from the bottom to the top.

Such a semiconductor memory may be produced by the following process. FIGS. 1597 and 1598 are sectional views taken on line A-A' and line B-B', respectively, in FIG. 11 illustrating a memory cell array of an EEPROM.

In this example, in contrast to Production example 90, interlayer insulating films 622 and 623 are formed instead of forming the silicon oxide films (the third insulating films) 422 and 423, respectively. Further, instead of forming the polysilicon films (the second conductive films) 521 to 524, the polysilicon films (the first conductive films) 511 to 514 are formed to be continuous in a direction of line A-A' in FIG. 11 by controlling the deposit thickness and the etching amount, and the second trench 220 for separating the first wiring layer is formed by anisotropic etching in self-alignment with the polysilicon film 511 (FIGS. 1597 and 1598).

The impurity introduction to the polysilicon films 511 to 514 may be performed during or after the formation of the polysilicon films or after the formation of the sidewall spacer. The timing of the impurity introduction is not particularly limited so long as these films become conductive films.

In this example, the control gates of the memory cells are formed continuously in one direction without using a mask. That is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

Further, by providing the selection gates in the top and the bottom of a set of memory cells, it is possible to prevent the phenomenon that a memory cell transistor is over-erased.

PRODUCTION EXAMPLE 95

In a semiconductor memory to be produced in this example, a semiconductor substrate is patterned in the form of pillars to form island-like semiconductor layers. Sides of the island-like semiconductor layers make active regions. On the active regions, a plurality of gate oxide films are formed and gates to be MIS capacitors as charge storage layers and selection gates are formed. The island-like semiconductor layers are each in an electrically floating state with respect to the semiconductor substrate. The active region of each memory cell is in the electrically floating state. The transistors and the MIS capacitors are arranged alternately from the top of the island-like semiconductor layer. The thickness of gate insulating films of the transistors is equal to the thickness of gate insulating films of the MIS capacitors.

Such a semiconductor memory may be produced by the following process. FIGS. 1599 to 1600 and FIGS. 1601 to 1602 are sectional views taken on line A-A' and line B-B', respectively, in FIG. 12 illustrating a memory cell array of a DRAM.

In this example, in contrast to Production example 90, the impurity diffusion layer 710 is not formed. Further, instead of forming the polysilicon films (the second conductive films) 521 to 524, the polysilicon films (the first conductive films) 511 to 514 are formed to be continuous in a direction of line A-A' in FIG. 12 and impurity diffusion layers 726 and 727 formed in the island-like semiconductor layer 110 are distributed as shown in FIGS. 1599 and 1601.

In contrast to the structure shown in FIGS. 1599 and 1601, in the case of arranging the transistor, the MIS capacitor, the MIS capacitor and the transistor in this order from the top of the island-like semiconductor layer 110, the impurity diffusion layer 710 is formed. Further, a second trench 220 is formed in a direction of line B-B' in FIG. 12 to separate the impurity diffusion layer, and the impurity diffusion layers 726 and 727 formed in the island-like semiconductor layer 110 are distributed as shown in FIGS. 1600 and 1602.

In this example, explanation is given of a semiconductor memory in which two memory cells, each comprising one transistor and one MIS capacitor, are arranged in the island-like semiconductor layer 110. However, one memory cell, or three or more memory cells may be arranged in the island-like semiconductor layer 110. The impurity introduction to the polysilicon films 511 to 514 may be performed during or after the formation of the polysilicon films or after the formation of the sidewall spacer. The timing of the impurity introduction is not particularly limited so long as these films become conductive films.

In this example, the control gates of the memory cells are formed continuously in one direction without using a mask. That is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

PRODUCTION EXAMPLE 96

In a semiconductor memory to be produced in this example, a semiconductor substrate is patterned in the form of pillars to form island-like semiconductor layers. Sides of the island-like semiconductor layers make active regions. A plurality of tunnel oxide films and floating gates as charge storage layers are formed on the active regions. The island-like semiconductor layers are each in an electrically floating state with respect to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors and are connected in series along the island-like semiconductor layer. The thickness of gate insulating films of the selection gate transistors is equal to the thickness of gate insulating films of the memory transistors. The transistors are formed from the bottom to the top.

Such a semiconductor memory may be produced by the following process. FIGS. 1603 and 1604 are sectional views taken on line A-A' and line B-B', respectively, in FIG. 1 illustrating a memory cell array of an EEPROM.

In this example, in contrast to Production example 90, the silicon oxide films (the thirteenth insulating films) 481 and 484 are not formed. Instead of them, the silicon oxide films (the third insulating films) 421 and 424 are formed to have an equal thickness to that of the silicon oxide films (the third insulating films) 422 and 423 (FIGS. 1603 and 1604).

In this example, the control gates of the memory cells are formed continuously in one direction without using a mask. That is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

PRODUCTION EXAMPLE 97

In a semiconductor memory to be produced in this example, island-like semiconductor layers are formed on a semiconductor substrate to which an oxide film is inserted, for example, a semiconductor portion on an oxide film of an SOI substrate. Sides of the island-like semiconductor layers make active regions. A plurality of tunnel oxide films and floating gates as charge storage layers are formed on the active regions. The island-like semiconductor layers are each in an electrically floating state with respect to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The transistors are formed from the bottom to the top.

Such a semiconductor memory may be produced by the following process. FIGS. 1605 and 1606 are sectional views taken on line A-A' and line B-B', respectively, in FIG. 1 illustrating a memory cell array of an EEPROM.

In this example, in contrast to Production example 90, a semiconductor substrate to which an oxide film is inserted, e.g., a SOI substrate, is used instead of the semiconductor substrate 100 (FIGS. 1605 and 1606).

According to this example, the same effect as obtained by Production Example 90 can be obtained, and furthermore, the junction capacitance of the impurity diffusion layer 710 which functions as the first wiring layer is suppressed or removed.

The use of the SOI substrate as the substrate is applicable to all examples of the present invention.

PRODUCTION EXAMPLE 98

Explanation is given of a production process of a semiconductor memory in which the semiconductor substrate 100 is electrically insulated from the island-like semiconductor layers 110 not by the impurity diffusion layer but by a depletion layer existing at junction of the impurity diffusion layer with the semiconductor substrate 100 or the island-like semiconductor layer 110. FIG. 1607 and FIG. 1608 are sectional views taken on line A-A' and line B-B', respectively, in FIG. 1 illustrating a memory cell array of an EEPROM.

In FIG. 1607 and FIG. 1608, the island-like semiconductor layer 110 and the semiconductor substrate 100 are structurally connected. In this example, the island-like semiconductor layer 110 and the semiconductor substrate 100 are electrically insulated by a depletion layer formed on an island-like semiconductor layer 110 side or a semiconductor substrate 100 side of a PN junction between the impurity diffusion layer 710 as the first wiring layer and the island-like semiconductor layer 110 or the semiconductor substrate 100 owing to a potential difference between a potential given to the impurity diffusion layer 710 and a potential given to the island-like semiconductor layer 110 or the semiconductor substrate 100 at reading or at erasing.

More particularly, supposing that the depletion layer formed on the island-like semiconductor layer 110 side or the semiconductor substrate 100 side has a width W, the electrical insulation can be produced if at least either a space Sa1 or Sb1 of the impurity diffusion layer 710 shown in FIG. 1607 and FIG. 1608 is two or less times as large as W. Also, as regards the N-type impurity diffusion layers 721 to 723, like the impurity diffusion layer 710, the active region of each transistor is electrically insulated if at least either one of Sa2 and Sb2, Sa3 and Sb3, or Sa4 and Sb4 is two or less times as large as W.

The above described state may be produced both at reading and at erasing, only at erasing or only at reading. The above dimensional relationships may be combined in any way so long as the electrical insulation can be obtained.

This example may apply to any example of the semiconductor memory of the present invention.

PRODUCTION EXAMPLE 99

In a semiconductor memory to be produced in this example, a semiconductor substrate is patterned in the form of pillars to form island-like semiconductor layers. Sides of the island-like semiconductor layers make active regions. A plurality of tunnel oxide films and floating gates as charge storage layers are formed on the active regions. The island-like semiconductor layers are each in an electrically floating state with respect to the semiconductor substrate. The active region of each memory cell is in the electrically floating state. A plurality of memory transistors, for example, two memory transistors, are placed and the transistors are connected in series along the island-like semiconductor layer. The transistors are formed from the bottom to the top.

Such a semiconductor memory may be produced by the following process. FIGS. 1609 and 1610 are sectional views taken on line A-A' and line B-B', respectively, in FIG. 1 illustrating a memory cell array of an EEPROM.

In this example, production steps are the same as those of Production example 90 except that the polysilicon films 513 and 514 (the first conductive films), the silicon oxide film 423 (the third insulating film) and the silicon oxide film 484 (the thirteenth insulating film) are not formed, and that the polysilicon film 521 is disposed on the side of the polysilicon film 511 with intervention of the interlayer insulating film 612 after the separation of the impurity diffusion layer 710 and in the same manner, the polysilicon film 522 is disposed on the side of the polysilicon film 512 with intervention of the interlayer insulating film 613. Thereby, a semiconductor memory is realized which has two memory transistors in the island-like semiconductor layer and which has a memory function according to the state of a charge in the charge storage layer which is the floating gate made of the polysilicon film (the first conductive film) (FIGS. 1609 and 1610).

PRODUCTION EXAMPLE 100

In a semiconductor memory to be produced in this example, a semiconductor substrate is patterned in the form of pillars to form island-like semiconductor layers. Sides of the island-like semiconductor layers make active regions. A plurality of tunnel oxide films and floating gates as charge storage layers are formed on the active regions. The island-like semiconductor layers are each in an electrically floating state with respect to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. Transmission gates are disposed between the transistors for transmitting potentials to the active regions of the memory cell transistors.

Such a semiconductor memory may be produced by the following process. FIGS. 1611 and 1612 are sectional views taken on line A-A' and line B-B', respectively, in FIG. 1 illustrating a memory cell array of an EEPROM.

This example is the same as Production Example 90 except that the step of forming gate electrodes of a polysilicon film 530 (a third conductive film) is added after the polysilicon films (second conductive films) 521, 522, 523 and 524 are formed.

That is, after the formation of the polysilicon films 521, 522, 523 and 524, the silicon oxide films (the fifth insulating films) 424 to 422 and the interlayer insulating films 612 and 613 are removed by isotropic etching to such an extent that the island-like semiconductor layer 110 is exposed between the polysilicon films 521 and 522. A silicon oxide film 400 is formed as a sixteenth insulating film by thermal oxidization on the surface of island-like semiconductor layer 110 between the selection gates and the memory cells and in exposed portions of polysilicon films 511, 512, 513, 514, 521, 522, 523 and 524. A polysilicon film 530 which is a third conductive film is deposited on the entire surface.

The polysilicon film 530 is anisotropically etched back to such an extent that a space between the polysilicon films 523 and 524 is not exposed.

Production steps thereafter follow Production Example 90 (FIGS. 1611 and 1612). Thereby the semiconductor memory is completed.

PRODUCTION EXAMPLE 101

Explanation is given of an example of production process for obtaining a structure in which the direction of the first wiring layer is parallel to the direction of the fourth wiring layer. FIGS. 1613 and 1614 are sectional views taken on line A-A' and line B-B', respectively, in FIG. 1 illustrating a memory cell array of an EEPROM.

This example is the same as Production Example 90 except that, instead of forming the second trench 220 for separating the impurity diffusion layer 710 in self-alignment with the polysilicon film 511, the second trench 220 is formed in a direction of line A-A' in FIG. 1 by reactive ion etching using a resist film patterned by a known photolithographic technique such that the impurity diffusion layer 710 is separated. Thereby, a semiconductor memory is realized in which the first wiring layer is parallel to the fourth wiring layer and which has a memory function according to the state of a charge in the charge storage layer which is the floating gate made of the polysilicon film (the first conductive film) (FIGS. 1613 and 1614).

The impurity introduction to the polysilicon films 511 to 514 (the first conductive films) and the polysilicon films 521 to 524 (the second conductive films) may be performed during or after the formation of the polysilicon films or after the formation of the sidewall spacer. The timing of the impurity introduction is not particularly limited so long as these films become conductive films.

In this example, the control gates of the memory cells are formed continuously in one direction without using a mask. That is possible only where the island-like semiconductor layers are not disposed symmetrically to a diagonal. In contrast, if the island-like semiconductor layers are disposed symmetrically to a diagonal, for example, the wiring layers may be separated through patterning with use of resist films by photolithography.

Further, by providing the selection gates in the top and the bottom of a set of memory cells, it is possible to prevent the phenomenon that a memory cell transistor is over-erased.

PRODUCTION EXAMPLE 102

Explanation is given of an example of production process for obtaining a structure in which the first wiring layer is electrically common to the memory array. FIG. 1615 and FIG. 1616 are sectional views taken on line A-A' and line B-B', respectively, in FIG. 1 illustrating a memory cell array of an EEPROM.

In this example, the second trench 220 is not formed in the semiconductor substrate 100. This example is the same as Production Example 90 from which the steps regarding the formation of the second trench 220 is omitted.

Thereby, a semiconductor memory is realized in which at least the first wiring layer in the array is not divided but is common and which has a memory function according to the state of a charge in the charge storage layer which is the floating gate made of the polysilicon film (the first conductive film) (FIGS. 1615 and 1616).

PRODUCTION EXAMPLE 103

This example shows an example of production process for producing a semiconductor memory in which the impurity diffusion layer 724 formed in the top of the island-like semiconductor layer 110 and connected to the fourth wiring layer 840 is distributed greater in a direction perpendicular to the semiconductor substrate while avoiding reduction in gate length of the selection gate transistor disposed on the top of the island-like semiconductor layer 110. FIG. 1617 and FIG. 1618 are sectional views taken on line A-A' and line B-B', respectively, in FIG. 1 illustrating a memory cell array of an EEPROM.

In this example, in contrast to Production example 90, the impurity diffusion layer 724 which is connected to the fourth wiring layer 840 is formed to have a large height (FIGS. 1617 and 1618). At this time, the silicon oxide film (the tenth insulating film) 465 may be designed to have a large thickness and the insulating properties improve between the polysilicon film (the second conductive film) 524 and the fourth wiring layer 840. Or, since an increased area of the impurity diffusion layer 724 can be exposed, contact resistance is reduced between the impurity diffusion layer 724 and the fourth wiring layer 840.

PRODUCTION EXAMPLE 104

This example shows an example of production process for producing a semiconductor memory in which the transistor gates have different lengths in a vertical direction. FIGS. 1619 and 1620 and FIGS. 1621 and 1622 are sectional views taken on line A-A' and line B-B', respectively, in FIG. 1 illustrating a memory cell array of an EEPROM.

As shown in FIGS. 1619 and 1621, the polysilicon films (the first conductive films) 511 to 514 to be the memory cell gates or the selection gates may have different lengths in a direction vertical to the semiconductor substrate 100.

Further, as shown in FIGS. 1620 and 1622, the memory cell gates of the polysilicon films 512 and 513 may have different lengths, and the polysilicon films 511 to 514 may have different vertical lengths.

PRODUCTION EXAMPLE 105

In a semiconductor memory to be produced in this example, island-like semiconductor layers are formed by patterning a semiconductor substrate. Sides of the island like semiconductor layers make active regions. A plurality of tunnel oxide films and floating gates as charge storage layers are formed on the active regions. The island-like semiconductor layers are each in an electrically floating state with respect to the semiconductor substrate. The active region of each memory cell is in the electrically floating state. Selection gate transistors are disposed at the top and the bottom of the island-like semiconductor layer. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The island-like semiconductor layers are not cylindrical. The transistors are formed from the bottom to the top.

Such a semiconductor memory may be produced by the following process. FIGS. 1623 to 1624 and FIGS. 1625 to 1626 are sectional views taken on line A-A' and line B-B', respectively, in FIG. 1 illustrating a memory cell array of an EEPROM.

The island-like semiconductor layer 110 formed by reactive ion etching may have the top and the bottom having different outward shape as shown in FIGS. 1623 and 1625.

Also the top and the bottom of the island-like semiconductor layer 110 may be shifted in a horizontal direction as shown in FIG. 1624 and FIG. 1625.

For example, in the case where the island-like semiconductor layer 110 is circular in plan view, the former island-like semiconductor layer 110 shows a truncated cone shape and the latter island-like semiconductor layer 110 shows an inclined column shape. The-shape of the island-like semiconductor layer 110 is not particularly limited so long as the memory cells can be disposed in series in the direction vertical to the semiconductor substrate 100.

PRODUCTION EXAMPLE 106

This example shows an example of production process for producing a semiconductor memory in which the island-like semiconductor layer 100 has an altered shape at its bottom. FIGS. 1627 to 1630 and FIGS. 1631 to 1634 are sectional views taken on line A-A' and line B-B', respectively, in FIG. 1 illustrating a memory cell array of an EEPROM.

As shown in FIGS. 1629 and 1633 and FIGS. 1630 and 1634, the first lattice-form trench 210 may have a linear slant shape at its bottom.

Alternatively, the first lattice-form trench 210 may have a rounded slant shape at its bottom as shown in FIGS. 1627 and 1631 and FIGS. 1628 and 1632.

Here, the bottom of the polysilicon film (the first conductive film) 511 may or may not reach the slant bottom of the first trench 210.

PRODUCTION EXAMPLE 107

This example shows an example of production process for producing a semiconductor memory in which the transistors are formed from the bottom to the top after the formation of the island-like semiconductor layers. Explanation is given of an example of production process for obtaining a structure in which the side and the top of the floating gate are covered with the control gate with intervention of an interlayer insulating film. FIGS. 1635 and 1636 are sectional views taken on line A-A' and line B-B', respectively, in FIG. 1 illustrating an EEPROM memory cell array.

In this example, in contrast to Production example 90, the polysilicon film 522 and 523 are deposited as second conductive films and then etched back to a depth of the top portion of the polysilicon films 512 and 513, respectively, by isotropic etching (FIGS. 1635 and 1636).

Thereby, an area increases in which the polysilicon film 512 contacts the polysilicon film 522 with intervention of the interlayer insulating film 612, and an area increases in which the polysilicon film 513 contacts the polysilicon film 523 with intervention of the interlayer insulating film 613. Thereby, the memory cells improve the coupling ratio, respectively.

PRODUCTION EXAMPLE 108

This example shows an example of production process for producing a semiconductor memory in which the transistors are formed from the bottom to the top after the formation of the island-like semiconductor layers. Explanation is given of a production process for forming terminals which electrically connect first, second and third wiring layers to a peripheral circuit, respectively. FIGS. 1637 to 1642 are sectional views taken on line H-H', line I1-I1', line I2-I2', line I3-I3', line I4-I4', and line I5-I5', respectively, of FIG. 8 illustrating a memory cell array of EEPROM. These sectional views are taken at locations showing sites 921, 932, 933, 934 and 910 where terminals mounted on the top face of the semiconductor device are electrically connected to the wiring layers 521, 522, 523, 524 and 710 for the application of voltage to the buried wiring layers from outside.

The buried first, second and third wiring layers in a region of a lead-out portion are arranged into steps as shown in FIGS. 1637 to 1642 and first, second and third contact portions 921, 932, 933, 934 and 910 are opened to reach the edges of the wiring layers, respectively, so that they do not contact other wiring layers than the intended one. Then, a silicon oxide film 492, for example, is deposited as a fifteenth insulating film to a thickness of 10 to 100 nm and etched back to a depth corresponding to the deposit thickness to form a sidewall spacer on the inner wall of each contact portion formed in the leading out portion. Thereafter, the first, second and third wiring layers may be lead out to the top face of the semiconductor memory by burying metal or a conductive film in the contact portions.

Instead of forming the first, second and third contact portions 921, 932, 933, 934 and 910, the conductive films may be arranged such that they are lead out to the top face of the semiconductor memory to obtain the same effect as the above.

Alternatively, the sidewall spacer of the silicon oxide film 492 may not be formed in the inner wall of each contact portion formed in the lead-out portion. In the case of forming the sidewall spacer of the silicon oxide film 492 (the fifteenth insulating film), the fifteenth insulating film may be formed of not only a silicon oxide film but also a silicon nitride film as long as it is an insulating film.

For leading out the wiring layers, a common contact portion may be formed in the region of the lead-out portion of the memory cells continuous in a direction of A-A' as shown in FIGS. 1637 to 1642, or alternatively, the contact portions may be formed in the lead out portions of the memory cells, respectively.

The lead-out of the first, second and third wiring layers to the top face of the semiconductor by the above-described process is applicable to all examples of the present invention.

PRODUCTION EXAMPLE 109

This example shows an example of production process for producing a semiconductor memory in which the transistors are formed from the bottom to the top after the formation of the island-like semiconductor layers. Explanation is given of a production process in which the polysilicon film covering the island-like semiconductor layer 110 has an altered shape. FIGS. 1643 and 1644 and FIGS. 1645 and 1646 are sectional views taken on line A-A' and line B-B', respectively, in FIG. 1 illustrating a memory cell array of an EEPROM.

As shown in FIGS. 1643 and 1645 and FIGS. 1644 and 1646, the polysilicon film (the first conductive film) 510 covering the island-like semiconductor layer 110 may have a shape such that it is uniformly deposited along the bottom shape of the first trench 210. Alternatively, the polysilicon film 510 may have a shape such that it is deposited partially ununiformly according to the bottom shape of the first trench 210.

PRODUCTION EXAMPLE 110

This example shows an example of production process for producing a semiconductor memory in which the transistors are formed from the bottom to the top after the formation of the island-like semiconductor layer. Explanation is given of a production process in which the silicon nitride film 310 has an altered shape. FIGS. 1647 and 1648 and FIGS. 1649 and 1650 are sectional views taken on line A-A' and line B-B', respectively, in FIG. 1 illustrating a memory cell array of an EEPROM.

According Production example 90 (FIGS. 1531 and 1541), the mask layer 310 is etched by reactive ion etching using a resist film R1 patterned by a known photolithographic technique as a mask, and then the P-type semiconductor substrate 100 is etched to a depth of 2,000 to 20,000 nm by reactive ion etching by using the mask layer 310 as a mask to form a first trench 210. At this time, the mask layer 310 may be smaller (FIGS. 1647 and 1649) or larger (FIGS. 1648 and 1650) than the outward shape of the island-like semiconductor layer 110. The shape of the mask layer 310 is not particularly limited.

The above-described examples are formed may be combined in any way.

According to the present invention, it is possible to avoid the back-bias effect of the substrate in the direction vertical to the island semiconductor layer or prevent variations of the back-bias effect, and it is also possible to avoid increase of drive voltage. Thus a plurality of memory cells can be formed which are connected in series between bit lines and source lines. Thereby, it is possible to prevent variations in the characteristics of the memory cells which are caused by decline of the threshold in the memory cells at reading, the decline resulting from the back-bias effect from the substrate.

In the case where the island-like semiconductor layers are formed by epitaxial growth, it is possible to avoid damage caused by etching process since the island-like semiconductor layers can be formed without etching the semiconductor layer.

Further, in the case where semiconductor substrate pillars provided with memory transistors are formed in the minimum etching dimension and the smallest distance between the semiconductor substrate pillars is the minimum etching dimension, double the capacity of the prior-art memory device can be obtained if memory transistors in two tiers are formed per semiconductor substrate pillar. That is, the capacity of the device can be multiplied by the number of tiers of transistors per semiconductor substrate pillar. Generally, the larger the number of tiers, the more capacity can be obtained. Thereby, the cell area per bit decreases, the size of chips can be decreased and the production costs can be reduced.

Furthermore, since the vertical direction which determines the device performance does not depend upon the minimum etching dimension, the device performance can be maintained.

Further, since the memory cells are arranged to surround the respective island-like semiconductor layers, the drive current can be improved and the S value can be increased.

According to the production method for the semiconductor memory device of the present invention, the semiconductor substrate is patterned into the pillar form using a circular pattern, and then the side of the semiconductor substrate is sacrificially oxidized for eliminating damage, defects and unevenness on the surface of the substrate. Thus the surface of the substrate can be used as good active regions. The diameter of the pillar can be controlled by controlling the thickness of the oxide film formed by this sacrificial oxidization, and therefore, it is possible to easily increase the capacity between the floating gate and the control gate. This capacity depends upon the surface area of the tunnel oxide film and the surface area of the interlayer capacity film between the floating gate and the control gate.

Further, by using a circular pattern, it is possible to avoid local concentration of the electric field in the active region, and therefore, electric control can be easily done. The arrangement of the gate electrodes around the pillar-form semiconductor substrate improves the drive current and increase the S value. The formation of impurity diffusion layers such that the active regions of the memory cells are in the floating state with respect to the substrate eliminates the back-bias effect and variations in the characteristics of the memory cells caused by the decline of the threshold of the memory cells at reading.

By forming a plurality of sidewalls of an insulating film in the vertical direction on the sidewalls of floating gates after the tunnel oxide films and the floating gates are deposited, the floating gate can be patterned at the same time. That is, the tunnel oxide films of the same nature can be obtained with the respective memory cells. Or, by forming the tunnel oxide film after the floating gates and the control gates are formed, the tunnel oxide films of the same nature can be obtained with the respective memory cells. The region where the floating gates and the control gates are formed is pre-defined by the thickness of the deposited films, and then, the floating gates or the control gates are formed. Therefore, it is possible to reduce patterning variations in the gate length of the memory cell transistors to process variations in the thickness of the deposited film. By using these techniques, the variations in the characteristics of the memory cells are suppressed and the variations in the device performance are suppressed. Thus the memory device can be more easily controlled and produced at low costs.

What is claimed is:

1. A semiconductor memory comprising:

a semiconductor substrate;

one or more memory cells comprising at least one island-like semiconductor layer, a charge storage layer and a control gate, the charge storage layer and the control gate being formed to entirely or partially encircle a sidewall of the island-like semiconductor layer, wherein at least one of said one or more memory cells is electrically insulated from the semiconductor substrate and has an insulating film allowing an electric charge to pass at least in a part of a region between the charge storage layer and the island-like semiconductor layer, and a plurality of island-like semiconductor layers are formed in matrix, and a distance between the island-like semiconductor layers in one direction is smaller than a distance between the island-like semiconductor layers in another direction.

2. A semiconductor memory comprising:

a semiconductor substrate; and one or more memory cells comprising at least one island-like semiconductor layer formed by epitaxial growth, a charge storage layer and a control gate, the charge storage layer and the control gate being formed to entirely or partially encircle a sidewall of the island-like semiconductor layer, wherein at least one of said one or more memory cells is electrically insulated from the semiconductor substrate, wherein a plurality of island-like semiconductor layers are formed in matrix, and a distance between the island-like semiconductor layers in one direction is smaller than a distance between the island-like semiconductor layers in another direction.

3. A semiconductor memory comprising:

a semiconductor substrate;

one or more memory cells comprising at least one island-like semiconductor layer, a charge storage layer and a control gate, the charge storage layer and the control gate being formed to entirely or partially encircle a sidewall of the island-like semiconductor layer, wherein at least one of said one or more memory cells is electrically insulated from the semiconductor substrate and the charge storage layer and the control gate are formed of different materials, and a plurality of such island-like semiconductor layers are formed in matrix, and a distance between the island-like semiconductor layers in one direction is smaller than a distance between the island-like semiconductor layers in another direction.

4. A semiconductor memory according to claim 2, wherein the charge storage layer and the control gate electrode are arranged entirely or partially in alignment.

5. A semiconductor memory according to claim 1 or 2, wherein the charge storage layer and the control gate electrode are formed of different materials.

6. A semiconductor memory according to any one of claims 1 to 3, wherein said one or more memory cells are electrically insulated from the semiconductor substrate by an impurity diffusion layer of a conductivity type opposite to the conductivity type of the semiconductor substrate, the impurity diffusion layer being formed in the semiconductor substrate or in the island-like semiconductor, or by a first impurity diffusion layer of a conductivity type opposite to the conductivity type of the semiconductor substrate, the first impurity diffusion layer being formed in the island-like semiconductor, and a second impurity diffusion layer of the same conductivity type as that of the semiconductor substrate, the second impurity diffusion layer being formed in the first diffusion layer.

7. A semiconductor memory according to any one of claims 1 to 3, wherein at least one of the memory cells is electrically insulated from the semiconductor substrate by a depletion layer formed at a junction between an impurity diffusion layer and the semiconductor or the island-like semiconductor.

8. A semiconductor memory according to claim 6, wherein a plurality of memory cells are formed and at least one of the memory cells is electrically insulated from another memory cell by an impurity diffusion layer of a conductivity type opposite to the conductivity type of the semiconductor substrate, the impurity diffusion layer being formed in the island-like semiconductor layer, or by a first impurity diffusion layer of a conductivity type opposite to the conductivity type of the semiconductor substrate, the first impurity diffusion layer being formed in the island-like semiconductor, and a second impurity diffusion layer of the same conductivity type as that of the semiconductor substrate, the second impurity diffusion layer being formed in the first diffusion layer.

9. A semiconductor memory according to claim 6, wherein a plurality of memory cells are formed and at least one of the memory cells is electrically insulated from another memory cell by an impurity diffusion layer of a conductivity type opposite to the conductivity type of the semiconductor substrate, the impurity diffusion layer being formed in the island-like semiconductor and a depletion layer formed at a junction between the impurity diffusion layer and the semiconductor substrate or the island-like semiconductor layer.

10. A semiconductor memory according to claim 1, wherein the insulating film is formed as a tunnel insulating film immediately under the charge storage layer.

11. A semiconductor memory according to any one of claims 1 to 3, wherein a impurity diffusion layer is formed on the semiconductor substrate, the impurity diffusion layer functions as common wiring for at least one memory cell.

12. A semiconductor memory according to any one of claims 1 to 3, wherein a plurality of memory cells are formed with regard to one island-like semiconductor layer and the memory cells are arranged in series.

13. A semiconductor memory according to any one of claims 1 to 3, wherein a plurality of island-like semiconductor layers are formed in matrix, wiring layers for reading a state of a charge stored in the memory cells are formed in the island-like semiconductor layers, a plurality of control gates are arranged continuously in a direction to form a control gate line, and a plurality of the wiring layers are connected in a direction crossing the control gate line to form a bit line.

14. A semiconductor memory according to any one of claims 1 to 3, wherein a gate electrode for selecting a memory cell is formed at least at an end of the memory cell formed on the island-like semiconductor layer so as to partially or entirely encircle the sidewall of the island-like semiconductor layer and the gate electrode is arranged in series with the memory cell.

15. A semiconductor memory according to claim 14, wherein a part of the island-like semiconductor layer opposed to the gate electrode is electrically insulated from the semiconductor substrate or the memory cell by an impurity diffusion layer of a conductivity type opposite to the conductivity type of the semiconductor substrate, the impurity diffusion layer being formed in the semiconductor substrate or in the island-like semiconductor layer.

16. A semiconductor memory according to any one of claims 1 to 3, wherein the control gates of the memory cells are arranged adjacently so that channel layers of the memory cells are electrically connected.

17. A semiconductor memory according to claim 14, wherein the control gate and the gate electrode are adjacently arranged so that a channel layer formed in a part of the island-like semiconductor layer opposed to the gate electrode and the channel layer of the memory cell are electrically connected.

18. A semiconductor memory according to any one of claims 1 to 3, further comprising electrodes for electrically connecting channel layers of the memory cells between the control gates.

19. A semiconductor memory according to claim 14, further comprising an electrode for electrically connecting a channel layer formed in a part of the island-like semiconductor layer opposed to the gate electrode with a channel layer of the memory cell, between the control gate and the gate electrode.

20. A semiconductor memory according to claim 14, wherein the control gate is formed of the same material as the gate electrode.

21. A semiconductor memory according to claim 14, wherein the charge storage layer and the gate electrode are formed of the same material.

22. A semiconductor memory comprising:

a semiconductor substrate;

one or more memory cells comprising at least one island-like semiconductor layer, a charge storage layer and a control gate, the charge storage layer and the control gate being formed to entirely or partially encircle a sidewall of the island-like semiconductor layer, wherein at least one of said one or more memory cells is electrically insulated from the semiconductor substrate and has an insulating film allowing an electric charge to pass at least in a part of a region between the charge storage layer and the island-like semiconductor layer, and a plurality of island-like semiconductor layers are formed in matrix, and the width of the island-like semiconductor layers in one direction is smaller than a distance between adjacent island-like semiconductor layers in the same direction.

23. A semiconductor memory according to any one of claims 1 to 3, wherein said at least one island-like semiconductor layer has at least two plane orientations.

24. A semiconductor memory comprising:

a semiconductor substrate;

one or more memory cells comprising at least one island-like semiconductor layer formed by epitaxial growth, a charge storage layer and a control gate, the charge storage layer and the control gate being formed to entirely or partially encircle a sidewall of the island-like semiconductor layer, wherein at least one of said one or more memory cells is electrically insulated from the semiconductor substrate, and a plurality of island-like semiconductor layers are formed in matrix, and the width of the island-like semiconductor layers in one direction is smaller than a distance between adjacent island-like semiconductor layers in the same direction.

25. A semiconductor memory comprising:

a semiconductor substrate; and one or more memory cells comprising at least one island-like semiconductor layer, a charge storage layer and a control gate, the charge storage layer and the control gate being formed to entirely or partially laterally surround a sidewall of the island-like semiconductor layer, wherein at least one of said one or more memory cells is electrically insulated from the semiconductor substrate via at least one diffusion layer, wherein said diffusion layer has an impurity concentration distribution such that in at least part of the diffusion layer the impurity concentration gradually decreases moving away from the island-like semiconductor layer.

26. A semiconductor memory comprising:

a semiconductor substrate; and one or more memory cells comprising at least one island-like semiconductor layer, a charge storage layer and a control gate, the charge storage layer and the control gate being formed to entirely or partially laterally surround a sidewall of the island-like semiconductor layer, wherein at least one of said one or more memory cells is electrically insulated from the semiconductor substrate via at least one diffusion layer, wherein a portion of said diffusion layer closer to the island-like semiconductor layer has an impurity concentration higher than does a portion of said diffusion layer farther from the island-like semiconductor layer.

27. A semiconductor memory comprising:

a semiconductor substrate; and one or more memory cells comprising at least one island-like semiconductor layer, a charge storage layer and a control gate, the charge storage layer and the control gate being formed to entirely or partially laterally surround a sidewall of the island-like semiconductor layer, wherein at least one of said one or more memory cells is electrically insulated from the semiconductor substrate by at least a first impurity diffusion layer of a conductivity type opposite to a conductivity type of the semiconductor substrate and a second impurity diffusion layer of the same conductivity type as that of the semiconductor substrate, wherein the first impurity diffusion layer is formed in the island-like semiconductor layer and the second impurity diffusion layer being formed in the first impurity diffusion layer.

28. The semiconductor memory of claim 27, wherein the island-like semiconductor layer and the semiconductor substrate become in an electrically floating state due to a depletion layer formed proximate a PN junction formed between one of the diffusion layers and the semiconductor substrate or the island-like semiconductor layer.

29. A semiconductor memory comprising:

a semiconductor substrate;

one or more memory cells comprising at least one island-like semiconductor layer, a charge storage layer and a control gate, the charge storage layer and the control gate being formed to entirely or partially laterally surround a sidewall of the island-like semiconductor layer, wherein at least one of said one or more memory cells is electrically insulated from the semiconductor substrate and has an insulating film allowing an electric charge to pass at least in a part of a region between the charge storage layer and the island-like semiconductor layer, and a plurality of island-like semiconductor layers are formed in matrix, and a distance between the island-like semiconductor layers in one direction is smaller than a distance between the island-like semiconductor layers in another direction.

30. A semiconductor memory comprising:

a semiconductor substrate; and one or more memory cells comprising at least one island-like semiconductor layer, a charge storage layer and a control gate, the charge storage layer and the control gate being formed to entirely or partially laterally surround a sidewall of the island-like semiconductor layer, wherein at least one of said one or more memory cells is electrically insulated from the semiconductor substrate and has an insulating film allowing an electric charge to pass at least in a part of a region between the charge storage layer and the island-like semiconductor layer, wherein at least one of the memory cells is electrically insulated from the semiconductor substrate by a depletion layer formed at a junction between an impurity diffusion layer and the semiconductor substrate and/or the island-like semiconductor layer.

31. A semiconductor memory comprising:

a semiconductor substrate; and one or more memory cells comprising at least one island-like semiconductor layer formed by epitaxial growth, a charge storage layer and a control gate, the charge storage layer and the control gate being formed to entirely or partially encircle a sidewall of the island-like semiconductor layer, wherein at least one of said one or more memory cells is electrically insulated from the semiconductor substrate, wherein at least one of the memory cells is electrically insulated from the semiconductor substrate by a depletion layer formed at a junction between an impurity diffusion layer and the semiconductor substrate and/or the island-like semiconductor layer.

32. A semiconductor memory comprising:

a semiconductor substrate; and one or more memory cells comprising at least one island-like semiconductor layer, a charge storage layer and a control gate, the charge storage layer and the control gate being formed to entirely or partially encircle a sidewall of the island-like semiconductor layer, wherein at least one of said one or more memory cells is electrically insulated from the semiconductor substrate, and a part of the charge storage layer and a part of the control gate electrode are formed of different materials, wherein at least one of the memory cells is electrically insulated from the semiconductor substrate by a depletion layer formed at a junction between an impurity diffusion layer and the semiconductor substrate and/or the island-like semiconductor layer.

* * * * *